US011955732B2

(12) United States Patent
Alpman et al.

(10) Patent No.: US 11,955,732 B2
(45) Date of Patent: Apr. 9, 2024

(54) WIRELESS COMMUNICATION TECHNOLOGY, APPARATUSES, AND METHODS

(71) Applicant: Intel Corporation, Santa Clara, CA (US)

(72) Inventors: Erkan Alpman, Portland, OR (US); Arnaud Lucres Amadjikpe, Beaverton, OR (US);

(Continued)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/089,220

(22) Filed: Dec. 27, 2022

(65) Prior Publication Data

US 2023/0145401 A1 May 11, 2023

Related U.S. Application Data

(60) Continuation of application No. 17/734,529, filed on May 2, 2022, which is a division of application No.

(Continued)

(51) Int. Cl.
*H01Q 9/04* (2006.01)
*H01Q 1/24* (2006.01)

(Continued)

(52) U.S. Cl.
CPC ........... *H01Q 9/0414* (2013.01); *H01Q 1/243* (2013.01); *H01Q 1/38* (2013.01); *H01Q 1/48* (2013.01);

(Continued)

(58) Field of Classification Search
CPC ............ H01Q 21/24; H01Q 3/24; H01Q 1/48; H01Q 1/38; H01Q 1/243; H01Q 5/47; H01Q 9/0414

See application file for complete search history.

(56) References Cited

U.S. PATENT DOCUMENTS

| | | | |
|---|---|---|---|
| 4,838,475 | A | 6/1989 | Mullins et al. |
| 5,382,959 | A | 1/1995 | Pett et al. |

(Continued)

FOREIGN PATENT DOCUMENTS

| | | |
|---|---|---|
| CN | 203617426 | 5/2014 |
| CN | 105356051 | 2/2016 |

(Continued)

OTHER PUBLICATIONS

U.S. Appl. No. 16/472,830 U.S. Pat. No. 11,424,539, filed Jun. 21, 2019, Wireless Communication Technology, Apparatuses, and Methods.

(Continued)

*Primary Examiner* — Graham P Smith
(74) *Attorney, Agent, or Firm* — Schwegman Lundberg & Woessner, P.A.

(57) ABSTRACT

Millimeter wave (mmWave) technology, apparatuses, and methods that relate to transceivers, receivers, and antenna structures for wireless communications are described. The various aspects include co-located millimeter wave (mmWave) and near-field communication (NFC) antennas, scalable phased array radio transceiver architecture (SPARTA), phased array distributed communication system with MIMO support and phase noise synchronization over a single coax cable, communicating RF signals over cable (RFoC) in a distributed phased array communication system, clock noise leakage reduction, IF-to-RF companion chip for backwards and forwards compatibility and modularity, on-package (Continued)

matching networks, 5G scalable receiver (Rx) architecture, among others.

23 Claims, 520 Drawing Sheets

(72) Inventors: Omer Asaf, Oranit (IL); Kameran Azadet, San Ramon, CA (US); Rotem Banin, Even-Yehuda (IL); Miroslav Baryakh, Petach Tikva (IL); Anat Bazov, Petach-Tikva (IL); Stefano Brenna, Hillsboro, OR (US); Bryan K. Casper, Portland, OR (US); Anandaroop Chakrabarti, Beaverton, OR (US); Gregory Chance, Chandler, AZ (US); Debabani Choudhury, Thousand Oaks, CA (US); Emanuel Cohen, Zichron Yaacov (IL); Claudio Da Silva, Portland, OR (US); Sidharth Dalmia, Fair Oaks, CA (US); Saeid Daneshgar Asl, Portland, OR (US); Kaushik Dasgupta, Hillsboro, OR (US); Kunal Datta, Los Angeles, CA (US); Brandon Davis, Phoenix, AZ (US); Ofir Degani, Haifa (IL); Amr M. Fahim, Portland, OR (US); Amit Freiman, Haifa (IL); Michael Genossar, Modiin (IL); Eran Gerson, Pardes Hana (IL); Eyal Goldberger, Moshav Beherotaim (IL); Eshel Gordon, Aloney Aba (IL); Meir Gordon, Holon (IL); Josef Hagn, Neubiberg (DE); Shinwon Kang, San Francisco, CA (US); Te Yu Kao, San Jose, CA (US); Noam Kogan, Tel-Aviv (IL); Mikko S. Komulainen, Oulu (FI); Igal Yehuda Kushnir, Hod-Hasharon (IL); Saku Lahti, Tampere (FI); Mikko M. Lampinen, Nokia (FI); Naftali Landsberg, Ramat Gan (IL); Wook Bong Lee, San Jose, CA (US); Run Levinger, Tel Aviv (IL); Albert Molina, Alcobendas (ES); Resti Montoya Moreno, Helsinki (FI); Tawfiq Musah, Hillsboro, OR (US); Nathan G. Narevsky, Portland, OR (US); Hosein Nikopour, San Jose, CA (US); Oner Orhan, San Jose, CA (US); Georgios Palaskas, Portland, OR (US); Stefano Pellerano, Beaverton, OR (US); Ron Pongratz, Tel Aviv (IL); Ashoke Ravi, Portland, OR (US); Shmuel Ravid, Haifa (IL); Peter Andrew Sagazio, Portland, OR (US); Eren Sasoglu, Mountain View, CA (US); Lior Shakedd, Kfar Bilu (IL); Gadi Shor, Tel Aviv (IL); Baljit Singh, San Jose, CA (US); Menashe Soffer, Katzir (IL); Ra'anan Sover, Haifa (IL); Shilpa Talwar, Cupertino, CA (US); Nebil Tanzi, Hoffman Estates, IL (US); Moshe Teplitsky, Tel-Aviv (IL); Chintan S. Thakkar, Portland, OR (US); Jayprakash Thakur, Bangalore (IN); Avi Tsarfati, Rishon le Zion (IL); Yossi Tsfati, Rishon le Zion (IL); Marian Verhelst, Portland, OR (US); Nir Weisman, Hod Hasharon (IL); Shuhei Yamada, Hillsboro, OR (US); Ana M. Yepes, Portland, OR (US); Duncan Kitchin, Beaverton, OR (US)

Related U.S. Application Data

16/472,830, filed as application No. PCT/US2017/067739 on Dec. 20, 2017, now Pat. No. 11,424,539.

(60) Provisional application No. 62/570,680, filed on Oct. 11, 2017, provisional application No. 62/527,818, filed on Jun. 30, 2017, provisional application No. 62/511,398, filed on May 26, 2017, provisional application No. 62/437,385, filed on Dec. 21, 2016.

(51) Int. Cl.

| | |
|---|---|
| ***H01Q 1/38*** | (2006.01) |
| ***H01Q 1/48*** | (2006.01) |
| ***H01Q 3/24*** | (2006.01) |
| ***H01Q 5/47*** | (2015.01) |
| ***H01Q 21/24*** | (2006.01) |
| ***H03L 7/14*** | (2006.01) |
| ***H04B 1/3827*** | (2015.01) |
| ***H04B 7/0456*** | (2017.01) |
| ***H04B 7/06*** | (2006.01) |
| ***H04B 15/04*** | (2006.01) |

(52) U.S. Cl.

CPC ................. *H01Q 3/24* (2013.01); *H01Q 5/47* (2015.01); *H01Q 21/24* (2013.01); *H03L 7/145* (2013.01); *H04B 1/3827* (2013.01); *H04B 7/0482* (2013.01); *H04B 7/0639* (2013.01); *H04B 15/04* (2013.01)

(56) References Cited

U.S. PATENT DOCUMENTS

| | | | |
|---|---|---|---|
| 5,828,344 | A | 10/1998 | Alder et al. |
| 6,867,746 | B2 | 3/2005 | Mendolia et al. |
| 7,994,879 | B2 | 8/2011 | Kim et al. |
| 8,970,444 | B2 | 3/2015 | Gustafsson et al. |
| 9,461,001 | B1 | 10/2016 | Tsai et al. |
| 9,917,707 | B2 | 3/2018 | Pan et al. |
| 11,424,539 | B2 | 8/2022 | Alpman et al. |
| 2006/0099354 | A1 | 5/2006 | Aichholzer et al. |
| 2008/0048921 | A1 | 2/2008 | Rebeiz et al. |
| 2010/0117916 | A1 | 5/2010 | Gustafsson et al. |
| 2012/0280366 | A1 | 11/2012 | Kamgaing et al. |
| 2012/0306698 | A1 | 12/2012 | Warnick et al. |
| 2013/0072136 | A1 | 3/2013 | Besoli et al. |
| 2013/0293420 | A1 | 11/2013 | Yehezkely |
| 2014/0070999 | A1 | 3/2014 | Kaneda et al. |
| 2015/0123864 | A1 | 5/2015 | Boryssenko |
| 2016/0049723 | A1* | 2/2016 | Baks ...................... H01L 23/66 343/848 |
| 2017/0229769 | A1 | 8/2017 | Yokoyama et al. |
| 2020/0091608 | A1 | 3/2020 | Alpman et al. |
| 2022/0384956 | A1 | 12/2022 | Alpman et al. |

FOREIGN PATENT DOCUMENTS

| | | | |
|---|---|---|---|
| CN | 110447146 | A | 11/2019 |
| EP | 2109183 | A1 | 10/2009 |
| JP | H072591 | | 1/1995 |
| JP | 2000307322 | | 11/2000 |
| JP | 2002033419 | A | 1/2002 |
| JP | 2003309423 | A | 10/2003 |
| JP | 2013046291 | A | 3/2013 |

(56) References Cited

FOREIGN PATENT DOCUMENTS

| | | | |
|---|---|---|---|
| JP | 2015530055 | | 10/2015 |
| JP | 2016528794 | A | 9/2016 |
| JP | 7089519 | B2 | 6/2022 |
| KR | 20010020144 | A | 3/2001 |
| KR | 20140005339 | | 1/2014 |
| TW | 201314859 | | 4/2013 |
| TW | 201838352 | A | 10/2018 |
| TW | 202345532 | | 11/2023 |
| WO | WO-02065578 | A2 | 8/2002 |
| WO | 2016067969 | | 5/2016 |
| WO | WO-2017080349 | A1 | 5/2017 |
| WO | WO-2018119153 | A2 | 6/2018 |
| WO | WO-2018119153 | A3 | 3/2019 |

OTHER PUBLICATIONS

U.S. Appl. No. 17/734,529, filed May 2, 2022, Wireless Communication Technology, Apparatuses, and Methods.
"10 MHz to 3 GHz VGA with 60 dB Gain Control Range—ADL5330", Analog Devices Data Sheet, (2017), 24 pgs.
"2-10 GHz 2-way Wilkinson Power Divider", Knowles Capacitors, (Feb. 2015), 2 pgs.
"5G Service-Guaranteed Network Slicing White Paper", Issue V1.0, China Mobile Communications Corporation, Huawei Technologies Co., Ltd., Deutsche Telekom AG, Volkswagen, (Feb. 28, 2017), 26 pgs.
"A 28GHz 32-Element Phased-Array Transceiver IC with Concurrent Dual Polarized Beams and 1.4 Degree Beam-Steering Resolution for 5G Communication", ISSCC 2017 / SESSION 7 / Wireless Transceivers / 7.2 Digest of Technical Papers, (2017), 3 pgs.
"Analog Devices 24 GHz to 44 GHZ, Wideband, Microwave Upconverter ADMV1013 Rev. B", (2019), 39 pgs.
"Analog Devices ADL5330", (2017), 24 pg.
"Analog Devices Datasheet and Product Information ADMV1013", (2020), 9 pgs.
"Anokiwave Third Generation mmW 5G IC Family", [Online] Retrieved from the Internet: <URL: https://www.anokiwave.com/company/company-news/releases/awmf-0151.html>, (2019), 2 pgs.
"Apix Fir Set up Rev 1.0 Application Note", Fujitsu Semiconductor Europe GmbH, (Jun. 6, 2013), 10 pgs.
"U.S. Appl. No. 16/472,830, 312 Amendment filed Jul. 22, 2022", 4 pgs.
"U.S. Appl. No. 16/472,830, Corrected Notice of Allowability dated May 11, 2022", 2 pgs.
"U.S. Appl. No. 16/472,830, Non Final Office Action dated Sep. 30, 2021", 7 pgs.
"U.S. Appl. No. 16/472,830, Notice of Allowance dated Feb. 2, 2022", 7 pgs.
"U.S. Appl. No. 16/472,830, PTO Response to Rule 312 Communication dated Jul. 27, 2022", 2 pgs.
"U.S. Appl. No. 16/472,830, Response filed Jun. 25, 2021 to Restriction Requirement dated Jun. 14, 2021", 7 pgs.
"U.S. Appl. No. 16/472,830, Response filed Dec. 30, 2021 to Non Final Office Action dated Sep. 30, 2021", 8 pgs.
"U.S. Appl. No. 16/472,830, Restriction Requirement dated Jun. 14, 2021", 6 pgs.
"U.S. Appl. No. 17/734,529, Preliminary Amendment filed Jul. 12, 2022", 8 pgs.
"Artik 530s Development Kit Overview", V1.0 Samsung Semiconductor, Inc., (Nov. 30, 2017), 33 pgs.
"Bi Directional Splitter Combiner", Solid Signal, (2020), 2 pgs.
"BLE Antenna Design Guide", Rev 2.0 Application note, (May 2018), 43 pgs.
"Board Level Shielding (BLS) in Passive Components", TE Connectivity, [Online]. Retrieved from the Internet: <URL: https://www.te.com/usa-en/products/emi-filters/board-level-shielding-bls.html?tab=pgp-story>, (Accessed Aug. 12, 2020), 11 pgs.
"Case Study—Au Flip Chip and TSV Interposer for Phased-Array Antenna Systems", Aspen Microsystems, (1999), 2 pgs.
"Cellular Antennas—Indoor & Outdoor Cellular Antenna Solutions", Laird Connectivity, [Online]. Retrieved from the Internet: <URL: https://www.lairdconnect.com/rf-antennas/cellular-antennas>, (Accessed Aug. 12, 2020), 4 pgs.
"Chinese Application Serial No. 201780079484.5, Voluntary Amendment filed Apr. 14, 2020", w/ English Claims, 1670 pgs.
"Custom Antennas", TE Connectivity (TE), [Online] Retrieved from the Internet: <URL: https://www.te.com/usa-en/products/antennas/custom-antennas.html>, (Retrieved on Aug. 13, 2020), 9 pgs.
"DAC38RF93 Dual-Channel, 14-Bit, 9-GSPS, 12x-24x Interpolating, 6 & 9 GHz PLL Digital-to-Analog Converter (DAC)", Texas Instruments, Inc., [Online] Retrieved from the Internet: <URL: http://www.ti.com/product/DAC38RF93>, (Retrieved on Sep. 12, 2019), 4 pgs.
"Description: 2.4-2.5/5.15-5.85GHZ Dual band Ceramic 10x3.2x1.5mm", Technical Data Sheet, 12 pgs.
"Design and Simulation of 28 GHz Beamforming System and Antenna Array for 5G Network Base Stations", Remcom Electromagnetic Simulation Software, (2019), 11 pgs.
"Design, Accuracy, and Calibration of Analog to Digital Converters on the MPC5500 Family", Freescale Semiconductor Application Note AN2989, Rev. 2, (Feb. 2010), 26 pgs.
"Dual-Band 5G Power Amplifier Design Example", Keysight Blogs http://www.keysight.com/us/en/home.html, (Accessed on Aug. 18, 2020), 7 pgs.
"Enterprise IoT gateway for OEM zigbee & bluetooth gateway solution", Volansys: Trusted Technology Partner, [Online]. Retrieved from the Internet: <URL: https://volansys.com/modular-iot-gateway/>, (Accessed Aug. 12, 2020), 16 pgs.
"Ericsson—Network Slicing can be a piece of cake", Ericsson AB, (May 2018), 12 pgs.
"European Application Serial No. 17884259.7, Extended European Search Report dated Nov. 2, 2020", 18 pgs.
"European Application Serial No. 17884259.7, Partial Supplementary European Search Report dated Jul. 30, 2020", 18 pgs.
"European Application Serial No. 17884259.7, Response to Communication pursuant to Rules 161(2) and 162 EPC filed Jan. 17, 2020", 2047 pgs.
"Find Electronic Components", Mouser Electronics, [Online]. Retrieved from the Internet: <URL: https://www.mouser.com/Electronic-Components/>, (Accessed Aug. 12, 2020), 4 pgs.
"First 5G mmWave Antenna Module for Smartphones", Microwave Journal, [Online] Retrieved from the Internet: <URL: https://microwavejournal.com/articles/31448-first-5g-mmwave-antenna-module-for-smartphones>, (Dec. 12, 2018), 10 pgs.
"First 5G mmWave Antenna Module for Smartphones", Microwave Journal, (Dec. 5, 2018), 10 pgs.
"FMC210 ADC 10-bit at 2.6 GSPS Module", Vadatech, [Online] Retrieved from the Internet: <URL: https://www.vadatech.com/product.php?product=291&catid_prev=0&catid_now=0>, (Retrieved on Sep. 12, 2019), 1 pg.
"FMC219 High-speed Dual DAC 14-bit at 2.5 GSPS with Wideband PLL on board", Vadatech, [Online] Retrieved from the Internet: <URL: https://www.vadatech.com/product.php?product=455>, (Retrieved on Sep. 12, 2019), 1 pg.
"Fujitsu Develops Low Power Consumption Technology for 5G Small Cell Base Stations", Fujitsu Laboratories Ltd., (Oct. 10, 2017), 5 pgs.
"Get FirstNet Ready with Cisco Industrial IoT Gateways (White Paper)", Cisco and/or its affiliates, (2020), 8 pgs.
"Get the most life from your Android device's battery—Android Help", [Online]. Retrieved from the Internet: <URL: https://support.google.com/android/answer/7664692?hl=en&visit_id=637328526293753453-2943685891&rd=1>, (Accessed Aug. 12, 2020), 2 pgs.
"HMC1105", 6 pgs.
"Indian Application Serial No. 201947029134, First Examination Report dated Nov. 10, 2021", 10 pgs.
"Indian Application Serial No. 201947029134, Voluntary Amendment filed Dec. 17, 2019", 521 pgs.
"Indian Application Serial No. 201947029134, Voluntary Amendment filed Dec. 26, 2019", 428 pgs.

(56) References Cited

OTHER PUBLICATIONS

"International Application Serial No. PCT/US2017/067739, International Preliminary Report on Patentability dated Jul. 4, 2019", 16 pgs.
"International Application Serial No. PCT/US2017/067739, International Search Report dated Feb. 7, 2019", 7 pgs.
"International Application Serial No. PCT/US2017/067739, Invitation to Pay Additional Fees and Partial Search Report dated Oct. 25, 2018", 7 pgs.
"International Application Serial No. PCT/US2017/067739, Written Opinion dated Feb. 7, 2019", 14 pgs.
"Japanese Application Serial No. 2019-532769, Notification of Reasons for Refusal dated Dec. 21, 2021", w/ English translation, 11 pgs.
"Japanese Application Serial No. 2019-532769, Response filed Mar. 18, 2022 to Notification of Reasons for Refusal dated Dec. 21, 2021", w/English translation, 42 pgs.
"Japanese Application Serial No. 2019-532769, Voluntary Amendment filed Aug. 29, 2019", w/English Claims, 92 pgs.
"Korean Application Serial No. 10-2019-7018815, Voluntary Amendment filed Dec. 18, 2020", w/English Claims, 19 pgs.
"Leading the LTE IoT evolution to connect the massive Internet of Things", Qualcomm Technologies, (Jul. 2017), 17 pgs.
"Linear Technology Demo Manual DC 2310A", LTC5549 2GHz to 14GHz Passive Bidirectional Mixer, (2015), 6 pgs.
"Microchip Technology MCP1633 PWM Controllers with Dimming", https://www.mouser.com/new/microchip/microchip-mcp1633-pwm-controllers/?utm_source=supplyframeipo&utm_medium=display&utm_campaign=mi%E2%80%A6, (Accessed on Aug. 13, 2020), 2 pgs.
"MID Technology—Customized Solutions. Continued Innovation", TE Connectivity, [Online]. Retrieved from the Internet: <URL: www.te.com/antennas>, (2018), 4 pgs.
"Modular IoT Gateway Connected to IBM Watson IoT Platform—IBM Developer Recipes", Volansys, [Online]. Retrieved from the Internet: <URL: https://developer.ibm.com/recipes/tutorials/modular-iot-gateway-connected-to-ibm-watson-iot-platform/>, (May 23, 2017), 26 pgs.
"Molex View List", [Online]. Retrieved from the Internet: <URL: https://www.molex.com/molex, (Accessed Aug. 12, 2020), 4 pgs.
"Movani Unveils BeamX 5G RF Front-End 28 GHZ and 39GHZ Millimeter Wave Solutions", [Online]. Retrieved from the Internet: <URL: https://movandi.com/beam/>, (Accessed Aug. 19, 2020), 4 pgs.
"OTA Test for Milimeter-Wave 5G NR Devices and Systems (White Paper)", Keysight Technologies, [Online]. Retrieved from the Internet: <URL: www.keysight.com/find/5G>, (2017), 20 pgs.
"PCI-DAS4020/12", Measurement Computing, (2009), 28 pgs.
"QTM052 mmWave antenna modules", Qualcomm Technologies, Inc., [Online]. Retrieved from the Internet: <URL: https://www.qualcomm.com/products/qtm052-mmwave-antenna-modules>, (Accessed Aug. 12, 2020), 3 pgs.
"Qualcomm 60GHz WiGig/WiFi 802.11ad Chipset World's First Smartphone Edition", SYSTEMPlus Consulting, [Online] Retrieved from the Internet: <URL: https://www.systemplus.fr/reverse-costing-reports/qualcomm-60ghz-wigigwifi-802-11ad-chipset-worlds-first-smartphone-edition/>, (Retrieved on Sep. 12, 2019), 6 pgs.
"RF amplifier testing—from wafer to design-in", Rohde & Schwarz, 7 pgs.
"Single-Chip System-In-Package Achieves 60 GHz WiGig Certification", Everything RF Newsletter, [Online] Retrieved from the Internet: <URL: https://www.everythingrf.com/News/details/4208-Single-Chip-System-In-Package-Achieves-60-GHz-WiGig-Certification>, (May 29, 2017), 8 pgs.
"Smart Power-Saving Management for a longer battery life", Huawei Technologies Co., [Online]. Retrieved from the Internet: <URL: https://consumer.huawei.com/uk/support/faq/smart-power-saving-management-for-a-longer-battery-life/>, 8 pgs.
"SX1280/SX1281: Long Range, Low Power, 2.4 GHz Transceiver with Ranging Capability", Semtech Data Sheet, (May 2018), 137 pgs.
"Taiwanese Application Serial No. 106145129, First Office Action dated Jul. 19, 2021", With English translation, 42 pages.
"Taiwanese Application Serial No. 106145129, Response Filed Jan. 21, 2022 to First Office Action dated Jul. 19, 2021", w/English Claims, 2478 pgs.
"Taiwanese Application Serial No. 106145129, Voluntary Amendment filed Sep. 25, 2019", w/English Claims, 4128 pgs.
"The Affirmed Virtual Slice Selection Function (vSSF) A More Profitable Network, Any Way You Slice It", Affirmed Networks., (2017), 4 pgs.
"The World's First 5G RF Front-End Module", Microwave Journal, (Dec. 13, 2017), 9 pgs.
"They said it couldn't be done, so we did it: Introducing the QTM052 mmWave antenna module family [Update]", Qualcomm Technologies, Inc., [Online] Retrieved from the Internet: <URL: https://www.qualcomm.com/news/onq/2018/07/31/they-said-it-couldnt-be-done-so-we-did-it-introducing-qtm052-mmwave-antenna>, (Jul. 31, 2018), 10 pgs.
"W Series Products", Peraso Technologies Inc., [Online]. Retrieved from the Internet: <URL: https://perasotech.com/w-series-products/, (Accessed Aug. 12, 2020), 10 pgs.
"Who & How Making 5G NR Standards—Understanding Key Features of 5G NR Standards and Samsung's Contribution", Samsung, (Accessed Aug. 12, 2020), 16 pgs.
"Wi-Fi HaLow Transmitter For IoT", https://chipsnwafers.electronicsforu.com/2016/02/05/wi-fi-halow-transmitter-for-iot/, (Feb. 5, 2016), 1 pg.
"World's First Dual Polarization AiP Package Solution for 5G mm-Wave Applications", Everything RF Newsletter, [Online] Retrieved from the Internet: <URL: https://www.everythingrf.com/News/details/7917-World-s-First-Dual-Polarization-AiP-Package-Solution-for-5G-mm-Wave-Applications>, (Mar. 26, 2019), 3 pgs.
"Zero Bias Schottky Detectors", https://krytar.com/products/detectors/zero-bias-schottky-detectors/, (Accessed on Aug. 13, 2020), 6 pgs.
Ahmed, Irfan, et al., "A Survey of Hybrid Beamforming Techniques in 5G: Architecture and System Model Perspectives", Journal of Latex Class Files, vol. XX, No. X,, (Aug. 2018), 1-40.
Akkermans, J.A.G., et al., "Antennas and packaging for millimeter-wave phased-array transceivers", 34 pgs.
Alkhateeb, Ahmed, et al., "Channel Estimation and Hybrid Precoding for Millimeter Wave Cellular Systems", IEEE Journal of Selected Topics in Signal Processing, 8(5), (Oct. 2014), 831-846.
Anderson, Jason, "How To Get The Benefit of Industrial IoT Gateways While Managing The Risk", IoT Evolution, [Online]. Retrieved from the Internet: <URL: https://www.iotevolutionworld.com/m2m/articles/438150-how-get-benefit-industrial-iot-gateways-while-managing.htm>, (May 16, 2018), 4 pgs.
Baek, Kwang-Hyun, "Highly Miniaturized Vertical End-fire Antenna Array for mmWave Wireless Communication", IEEE, (2013), 992-993.
Bashir, Imran, et al., "A Digitally Controlled Injection-Locked Oscillator With Fine Frequency Resolution", IEEE Journal of Solid-State Circuits, 51(6), (Jun. 2016), 1347-1359.
Buckel, Tobias, et al., "A Novel Digital-Intensive Hybrid Polar-I/Q RF Transmitter Architecture", IEEE Transactions On Circuits and Systems 1: Regular Papers, vol. 65, No. 12, (Dec. 1, 2018), 4390-4403.
Buckwalter, James F, et al., "An Integrated Subharmonic Coupled-Oscillator Scheme for a 60-GHz Phased-Array Transmitter", IEEE Transactions on Microwave Theory and Techniques, 54(12), (Dec. 2006), 4271-4280.
Cameron, Thomas, "5G—The Microwave Perspective", Analog Devices, Inc., (2015), 4 pgs.
Chiu, Chinq-Shiun, et al., "A 40nm Low-Power Transceiver for LTE—A Carrier Aggregation", IEEE International Solid-State Circuits Conference, (Feb. 7, 2017), 3 pgs.
Choi, Jinseok, et al., "Resolution-Adaptive Hybrid MIMO Architectures for Millimeter Wave Communications", IEEE Transactions on Signal Processing, 65(23), (Dec. 1, 2017), 6201-6216.

(56) References Cited

OTHER PUBLICATIONS

Choi, Yong-Chang, et al., "A Fully Digital Polar Transmitter Using a Digital-to-Time Converter for High Data Rate System", IEEE International Symposium on Radio-Frequency Integration Technology, (2009), 56-59.
Djerafi, Tarek, et al., "Substrate Integrated Waveguide Antennas", Handbook of Antenna Technologies, Springer Science Plus Business Media, Singapore, (2015), 60 pgs.
Dong, Jun, et al., "Broadband Rectangular Waveguide to GCPW Transition", Progress In Electromagnetics Research Letters vol. 46, (2014), 107-112.
Donovan, John, "Selecting Antennas for Embedded Designs", Digi-Key Electronics, [Online]. Retrieved from the Internet: <URL: https://www.digikey.in/en/articles/selecting-antennas-for-embedded-designs>, (Nov. 8, 2012), 10 pgs.
El-Chammas, Manar, "Background Calibration of Timing Skew in Time-Interleaved A/D Converters", aA Dissertation Submitted to the Department of Electrical Engineering and the Committee on Graduate Studies of Stanford University in Partial Fulfillment of the Requirements for the Degree of Doctor of Philosophy, (Aug. 2010), 155 pgs.
Frounchi, Milad, et al., "Dual-Band Millimeter-Wave Quadrature LO Generation With a Common-Centroid Floorplan", IEEE Transactions on Circuits and Systems II: Express Briefs, vol. 67, No. 2, (Feb. 2020), 260-264.
Gasior, Geoff, "Announcing the ROG Phone: Changing the Game for Mobile", ROG—Republic of Gamers Global, [Online]. Retrieved from the Internet: <URL: https://rog.asus.com/articles/smartphones/announcing-the-rog-phone-changing>, (Jun. 4, 2018), 14 pgs.
Ginsburg, Brian, et al., "Fluid-level sensing using 77-GHz millimeter wave", (May 2017), 9 pgs.
Gu, Xiaoxiong, et al., "A Multilayer Organic Package with 64 Dual-Polarized Antennas for 28GHz 5G Communication", IEEE, (2017), 3 pgs.
Gu, Xiaoxiong, et al., "A Multilayer Organic Package with 64 Dual-Polarized Antennas for 28GHz 5G Communication", IEEE MTT-S International Microwave Symposium (IMS) (pp. 1899-1901), (2017), 3 pgs.
Gu, Xiaoxiong, et al., "Enhanced Multilayer Organic Packages with Embedded Phased-Array Antennas for 60-GHz Wireless Communications", Electronic Components & Technology Conference, (2013), 1650-1655.
Guha, Debatosh, et al., "Printed Antenna Designs Using Defected Ground Structures: A Review of Fundamentals and State-of-the-Art Developments", Forum for Electromagnetic Research Methods and Application Technologies (FERMAT), 1-13.
Hakala, Ikka, et al., "A 2.14-GHz Chireix Outphasing Transmitter", IEEE Transactions on Microwave Theory and Techniques, vol. 53, No. 6, (Jun. 2005), 2129-2138.
Hegarty, Timothy, "Improving RF power amplifier efficiency in 5G radio systems using an adjustable DC/DC buck regulator", (2019), 3 pgs.
Hetting, Claus, "World's first WiGig (802.11ad) phone launched by ASUS | Wi-Fi NOW Events", [Online]. Retrieved from the Internet: <URL: https://wifinowglobal.com/back-page/worlds-first-wigig-802-11ad-phone-launched-asus/>, (Sep. 23, 2017), 5 pgs.
Hung, Tsai-Pi, et al., "CMOS Outphasing Class-D Ampli?er With Chireix Combiner", IEEE Microwave and Wireless Components Letters, vol. 17, No. 8, (Aug. 2007), 619-621.
Huo, Yiming, "5G Cellular User Equipment From Theory to Practical Hardware Design", arXiv:1704.02540v3 [cs.IT], (Jul. 19, 2017), 1-18.
Ibrahim, Mohamed Abolfadl, "The Polar Transmitter: Analysis and Algorithms", Dissertation (Dr.-Ing), Stuttgart University, DE, (2015), 175 pgs.
Jridi, M, et al., "An offset and gain calibration method for time-interleaved analog to digital converters", (2006), 4 pgs.
Karim, M K, et al., "SiP-based 60GHz 4×4 Antenna Array with 90nm CMOS OOK Modulator in LTCC", (2010), 4 pgs.
Kauffman, John G, et al., "A 72 dB DR, CT Delta Sigma Modulator Using Digitally Estimated, Auxiliary DAC Linearization Achieving 88 fJ/conv-step in a 25 MHz BW", IEEE Journal of Solid-State Circuits, 49(2), (Feb. 2014), 392-404.
La Duc, Han, et al., "All-Digital Calibration of Timing Skews for TIADCs Using the Polyphase Decomposition", IEEE Transactions on Circuits and Systems—II: Express Briefs, 63(1), (Jan. 2016), 99-103.
Lawrence, Nicholas P, et al., "Planar Tri-Orthogonal Diversity Slot Antenna", IEEE Transactions on Antennas and Propagation, 65(3), (Mar. 2017), 8 pgs.
Lawson, Jon, "IO radio gateway designed for IoT applications—Engineer Live", [Online]. Retrieved from the Internet: <URL: https://www.engineerlive.com/content/io-radio-gateway-designed-iot-applications>, (Sep. 7, 2018), 6 pgs.
Lee, MJ, et al., "Packaging Technology and Design Challenge for Fine Pitch Micro-Bump Cu-Pillar and BOT (Direct Bond on Substrate-Trace) Using TCNCP (Thermal Compression with Non-Conductive Paste Underfill) Method", Apex Expo IPC, (Mar. 2014), 27 pgs.
Levy, Cooper S, et al., "A 14-GHz, 22-dBm Series Doherty Power Amplifier in 45-nm CMOS SOI", (2016), 4 pgs.
Li, Chaojiang, et al., "5G mm-Wave Front-End-Module Design with Advanced SOI Process", IEEE, (2017), 1017-1020.
Loy, Matthew, et al., "ISM-Band and Short Range Device Antennas", Texas Instruments, (2005), 38 pgs.
Pandey, Vijay K, et al., "Theoretical analysis of linear array antenna of stacked patches", Indian Journal of Radio and Space Physics, vol. 34, (Apr. 2005), 125-130.
Park, Piljae, et al., "A Fully Integrated Transmitter with Embedded Antenna for On-Wafer Wireless Testing", IEEE Transactions on Microwave Theory and Techniques, vol. 58, No. 5, (May 2010), 1456-1463.
Pereira, Leandro PS, "Synthesis of Antennas for Field Polarization Control", Journal of Electromagnetic Analysis and Applications, 9(7), (2017), 97-112.
Pratt, Patrick, et al., "Ultrawideband Digital Predistortion (DPD): The Rewards (Power and Performance) and Challenges of Implementation in Cable Distribution Systems", Analog Dialogue 51-07,, (Jul. 2017), 7 pgs.
Ray, K P, "Design Aspects of Printed Monopole Antennas for Ultra-Wide Band Applications", International Journal of Antennas and Propagation, Article ID 713858, (2008), 8 pgs.
Reeder, Rob, et al., "Pushing the State of the Art with Multichannel A/D Converters", Analog Dialogue 39-05, (May 2005), 4 pgs.
Sadhu, Bodhisatwa, "Enabling 5G: mmWave Silicon Integration and Packaging", IBM Research, (2015), 31 pgs.
Schoebel, Joerg, et al., "Planar Antenna Technology for mm-Wave Automotive Radar, Sensing, and Communications", Radar Technology, pp. 297-318, [Online]. Retrieved from the Internet: <URL: www.intechopen.com>, (2010), 24 pgs.
Siriburanon, Teerachot, et al., "A 28-GHz Fractional-N Frequency Synthesizer with Reference and Frequency Doublers for 5G Cellular", IEEE 41st European Solid-State Circuits Conference (ESSCIRC), (2015), 76-79.
Song, Ickhyun, et al., "A 2-22 GHz Wideband Active Bi-directional Power Divider/Combiner in 130 nm SiGe BiCMOS Technology", IEEE, (2016), 4 pgs.
Sumetsky, M., "Vertically-stacked multi-ring resonator", Optics Express, 13(17), (Aug. 2005), 6354-6375.
Sun, F, et al., "Extending the scanning angle of a phased array antenna by using a null-space medium", Sci. Rep., (2014), 11 pgs.
Sutorius, Gustaaf, et al., "Cleaning the Rusty Channel Emphasis, Equalization & Embedding", Agilent Technologies, (2011), 132 pgs.
Talepour, Z, et al., "Groove Gap Cavity Slot Array Antenna for mm-Wave Applications", IEEE, (2018), 5 pgs.
Thakkar, Chintan, et al., "Design Techniques for a Mixed-Signal I/Q 32-Coefficient Rx—Feedforward Equalizer, 100-Coefficient Decision Feedback Equalizer in an 8 Gb/s 60 GHz 65 nm LP CMOS Receiver", IEEE Journal of Solid-State Circuits, 49(11), (Nov. 2014), 20 pgs.
Tripathi, Manish, "How do we plan for 5G NR network deployments coming in 2019?", Qualcomm, (Nov. 27, 2018), 33 pgs.

(56) References Cited

OTHER PUBLICATIONS

Tseng, Richard, et al., "A Mixed-Signal MIMO Beamforming Receiver", IEEE, (2008), 327-330.
Uchendu, Lyemeh, et al., "Survey of Beam Steering Techniques Available for Millimeter Wave Applications", Progress In Electromagnetics Research B vol. 68, (2016), 35-54.
Wojnowski, Maciej, et al., "Package Trends for Today's and Future mm-Wave Applications", (2008), 55 pgs.
Xiu, Yue, et al., "A Message Passing Approach to Acquire mm-Wave Channel State Information Based on Out-of-Band Data", IEEE Access, 6, (2018), 45665-45680.
Yingyin, Bybian, et al., "End-to-End Network Slicing Technology and Its Applications", ZTE Corporation No. 4, [Online]. Retrieved from the Internet: <URL: https://www.zte.com.cn/global/about/magazine/zte-technologies/2018/4-en/Special-Topic/3>, (Aug. 20, 2018), 6 pgs.
Yu, Yikun, "A 60 GHz Phase Shifter Integrated With LNA and PA in 65 nm CMOS for Phased Array Systems", IEEE Journal of Solid-State Circuits, vol. 45, No. 9,, (Sep. 2010), 13 pgs.
Zihir, Samet, et al., "A 60 GHz Single-Chip 256-Element Wafer-Scale Phased Array with EIRP of 45 dBm Using Sub-Reticle Stitching", IEEE Radio Frequency Integrated Circuits Symposium, (2015), 23-26.
"European Application Serial No. 17884259.7, Communication Pursuant to Article 94(3) EPC dated Oct. 13, 2022", 10 pgs.
"Korean Application Serial No. 10-2019-7018815, Notice of Preliminary Rejection dated Jan. 10, 2023", w English Translation, 16 pgs.
"Japanese Application Serial No. 2022-094127, Voluntary Amendment Filed Dec. 28, 2022", W English Claims, 6 pgs.
"Korean Application Serial No. 10-2019-7018815, Voluntary Amendment Filed Jan. 3, 2023", W English Claims, 10 pgs.
"European Application Serial No. 17884259.7, Response Filed Feb. 13, 2023 to Communication Pursuant to Article 94(3) EPC dated Oct. 13, 2022", 12 pgs.
"Korean Application Serial No. 10-2019-7018815, Response Filed Mar. 10, 2023 to Notice of Preliminary Rejection dated Jan. 10, 2023", W English Claims, 26 pgs.
"Korean Application Serial No. 10-2019-7018815, Notice of Preliminary Rejection dated Jun. 28, 2023", w/ English Translation, 24 pgs.
"Japanese Application Serial No. 2022-094127, Notification of Reasons for Refusal dated Jul. 11, 2023", w English Translation, 11 pgs.
"Taiwanese Application Serial No. 111139400, Office Action dated Aug. 22, 2023", W English Translation, 6 pgs.
"Taiwanese Application Serial No. 111139400, Response filed Nov. 16, 23 to Office Action dated Aug. 22, 23", With English claims, 28 pgs.
"Japanese Application Serial No. 2022-094127, Response filed Dec. 8, 23 to Notification of Reasons for Refusal dated Jul. 11, 23", w English Claims, 13 pgs.
"Chinese Application Serial No. 201780079484.5, Office Action dated Dec. 22, 23", W English Translation, 15 pgs.

* cited by examiner

BBS

4300

| USERS | APERTURE | COMBINING (OPER. MODE) | PARALLEL ANALOG COEFFICIENT SETS | DATA CONVERTERS | PARALLEL DIGITAL COEFFICIENT SETS |
|---|---|---|---|---|---|
| 1 | FULL | LO | NONE | 1 | NONE |
| M | FULL | DIGITAL | NONE | N | M |
| M | 1/M | LO | 1 | M | UP TO M |
| M | FULL | ANALOG | M | M | UP TO M |

FIG. 43

RADIO FRONT-END MODULE (RFEM)

BASEBAND SUB-SYSTEM (BBS)

RADIO FRONT-END MODULE (RFEM)

RADIO FRONT-END MODULE (RFEM)

BASEBAND SUB-SYSTEM (BBS)

RADIO FRONT-END MODULE (RFEM)

BASEBAND SUB-SYSTEM (BBS)

BBS

RADIATION PATTERN @28.25 GHZ E-PLANE
RADIATION PATTERN E

| NAME | THETA | ANG | MAG |
|---|---|---|---|
| M6 | 90.0000 | 90.0000 | 3.7047 |
| M7 | 105.0000 | 105.0000 | 3.9091 |
| M8 | 165.0000 | 165.0000 | -1.2071 |
| M9 | 46.0000 | 46.0000 | 0.5679 |
| M10 | 90.0000 | 90.0000 | 5.0819 |
| M11 | 105.0000 | 105.0000 | 5.1102 |
| M12 | 165.0000 | 165.0000 | -1.3910 |
| M13 | 45.0000 | 90.0000 | 1.4862 |

14901
14903

| NAME | THETA | ANG | MAG |
|---|---|---|---|
| M6 | 90.0000 | 90.0000 | -36.5084 |
| M7 | 91.0000 | 91.0000 | -42.8534 |

| NAME | PHI | ANG | MAG |
| --- | --- | --- | --- |
| M6 | 360.0000 | -0.0000 | 3.7047 |
| M7 | 360.0000 | -0.0000 | 5.0819 |

| NAME | PHI | ANG | MAG |
|---|---|---|---|
| M6 | 360.0000 | -0.0000 | -36.5084 |
| M7 | 360.0000 | -0.0000 | -42.7449 |

| NAME | THETA | ANG | MAG |
|---|---|---|---|
| M1 | 90.0000 | 90.0000 | 5.7825 |
| M2 | 90.0000 | 90.0000 | 4.7067 |

| NAME | THETA | ANG | MAG |
|---|---|---|---|
| M1 | 90.0000 | 90.0000 | 4.0543 |
| M2 | 90.0000 | 90.0000 | 2.9594 |

| SWITCH MODE | SPLIT MODE | LNA1-A | LNA1-B | LNA2-A | LNA2-B |
|---|---|---|---|---|---|
| ON | OFF | ON | ON | OFF | OFF |
| ON | OFF | OFF | OFF | ON | ON |
| OFF | ON | ON | OFF | ON | OFF |
| OFF | ON | ON | OFF | OFF | ON |

| MODE OF OPERATION | LO1 | LO2 | LO1_Ia LO1_Ixa | LO1_Ib LO1_Ixb | LO1_Qa LO1_Qxa | LO1_Qb LO1_Qxb | LO2_Ia LO2_Ixa | LO2_Ib LO2_Ixb | LO2_Qa LO2_Qxa | LO2_Qb LO2_Qxb |
|---|---|---|---|---|---|---|---|---|---|---|
| SWITCH MODE WITH LO1 | ON | OFF | ON | ON | ON | ON | OFF | OFF | OFF | OFF |
| SWITCH MODE WITH LO2 | OFF | ON | OFF | OFF | OFF | OFF | ON | ON | ON | ON |
| SPLIT MODE WITH LO1 & LO2 | ON | ON | ON | OFF | ON | OFF | ON | OFF | ON | OFF |

20722

B14.100

$$P_{TX} = \sum_{K} \left( P_{TX\_chain_K} + \sum_{n} IM_{n_K} \right)$$

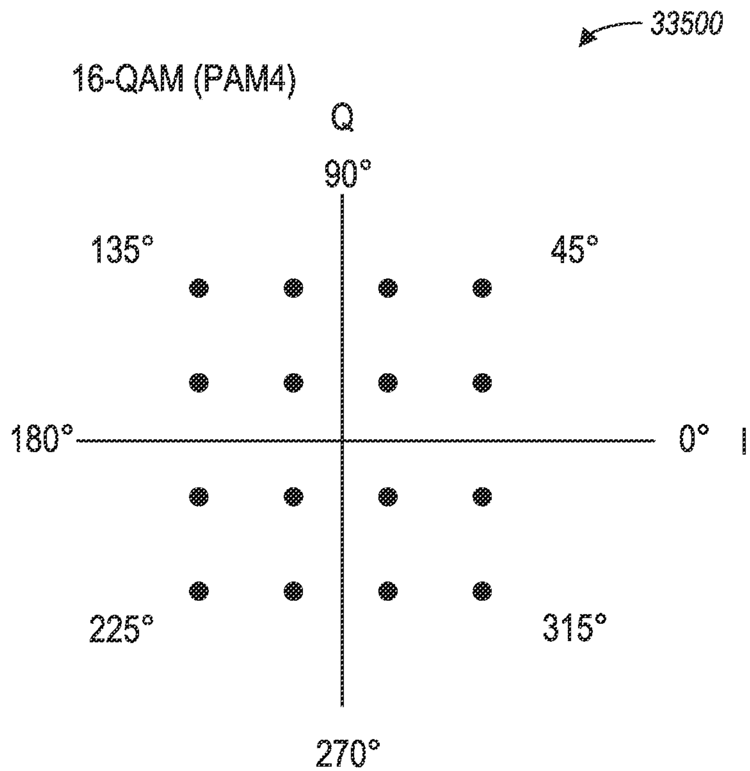
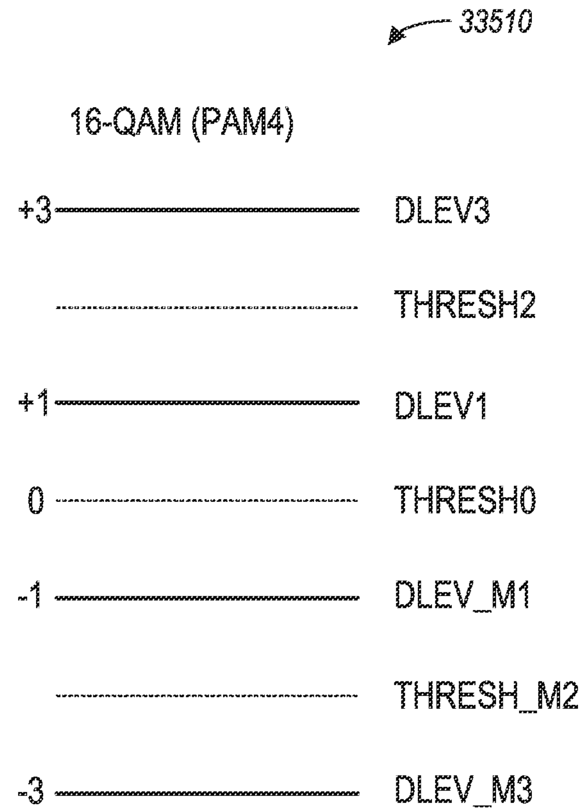
FIG. 335

$Z_K = SIGN(D_K)\ SIGN(D_{K-1})\ (E_K - E_{K-1})$ $Z_K > 0$ EARLY, $Z_K = 0$ HOLD, $Z_K < 0$ LATE $Z_K = SIGN(D_K)\ SIGN(D_{K-1})\ (E_K - E_{K-1})$ $Z_K > 0$ EARLY, $Z_K = 0$ HOLD, $Z_K < 0$ LATE

34300

<table>
<tr><th>MODE</th><th>EARLY OUT</th><th>LATE OUT</th><th>SAMPLE PH. DEC.</th></tr>
<tr><td>0</td><td>0</td><td>0</td><td>NO DECISION</td></tr>
<tr><td>1</td><td>1</td><td>0</td><td>EARLY</td></tr>
<tr><td>2</td><td>0</td><td>1</td><td>LATE</td></tr>
<tr><td>3</td><td>1</td><td>1</td><td>NO DECISION</td></tr>
<tr><td>4</td><td>EARLY I</td><td>LATE I</td><td>BYPASS I</td></tr>
<tr><td>5</td><td>EARLY Q</td><td>LATE Q</td><td>BYPASS Q</td></tr>
<tr><td>6</td><td>EARLY I | EARLY Q</td><td>LATE I | LATE Q</td><td>I OR Q</td></tr>
<tr><td>7</td><td>EARLY I & EARLY Q</td><td>LATE I & LATE Q</td><td>I AND Q</td></tr>
</table>

| ELEMENT | PHASE |
|---|---|
| 1 | 0° |
| 2 | 0° |
| 3 | 0° |
| 4 | 0° |

| ELEMENT | PHASE |
|---|---|
| 1 | 0° |
| 2 | 0° |
| 3 | 0° |
| 4 | 0° |

| ELEMENT | PHASE |
|---|---|
| 1 | 0° |
| 2 | 180° |
| 3 | 0° |
| 4 | 180° |

| ELEMENT | PHASE |
|---|---|
| 1 | 0° |
| 2 | 180° |
| 3 | 0° |
| 4 | 180° |

43500

| NAME | THETA | ANG | MAG |
|---|---|---|---|
| m1 | 90.000 | 90.000 | 90.000 |
| m2 | 75.000 | 75.000 | 75.000 |
| m3 | 36.000 | 36.000 | 36.000 |

| NAME | THETA | ANG | MAG |
|---|---|---|---|
| m2 | -180.0000 | -180.0000 | 4.7599 |

WIRELESS COMMUNICATION TECHNOLOGY, APPARATUSES, AND METHODS

PRIORITY CLAIM

This application is continuation of U.S. patent application Ser. No. 17/734,529, filed May 2, 2022, which is a divisional of U.S. patent application Ser. No. 16/472,830, filed Jun. 21, 2019, which is a U.S. National Stage Filing under 35 U.S.C. 371 from International Application No. PCT/US2017/067739, filed on Dec. 20, 2017, and published in English as WO 2018/119153 on Mar. 14, 2019, each of which claims the benefit of priority to the following provisional patent applications:

U.S. Provisional Patent Application Ser. No. 62/437,385, entitled "MILLIMETER WAVE ANTENNA STRUCTURES" and filed on Dec. 21, 2016;

U.S. Provisional Patent Application Ser. No. 62/511,398, entitled "MILLIMETER WAVE TECHNOLOGY" and filed on May 26, 2017;

U.S. Provisional Patent Application Ser. No. 62/527,818, entitled "ANTENNA CIRCUITS AND TRANSCEIVERS FOR MILLIMETER WAVE (MMWAVE) COMMUNICATIONS" and filed on Jun. 30, 2017; and U.S. Provisional Patent Application Ser. No. 62/570,680, entitled "RADIO FREQUENCY TECHNOLOGIES FOR WIRELESS COMMUNICATIONS" and filed on Oct. 11, 2017.

Each of which is incorporated herein by reference in its entirety.

TECHNICAL FIELD

Some aspects of the present disclosure pertain to antennas and antenna structures. Some aspects of the present disclosure pertain to antennas and antenna structures for millimeter-wave communications. Some aspects of the present disclosure pertain to wireless communication devices (e.g., mobile devices and base stations) that use antennas and antenna structures for communication of wireless signals. Some aspects of the present disclosure relate to devices that operate in accordance with 5th Generation (5G) wireless systems. Some aspects of the present disclosure relate to devices that operate in accordance with the Wireless Gigabit Alliance (WiGig) (e.g., IEEE 802.11ad) protocols. Some aspects of the present disclosure relate to using multi-stage copper pillar etching. Some aspects of the present disclosure relate to co-located millimeter wave (mmWave) and near-field communication (NFC) antennas. Some aspects of the present disclosure relate to a scalable phased array radio transceiver architecture (SPARTA). Some aspects of the present disclosure relate to a phased array distributed communication system with MIMO support and phase noise synchronization over a single coax cable. Some aspects of the present disclosure relate to communicating radio frequency (RF) signals over cable (RFoC) in a distributed phased array communication system. Some aspects of the present disclosure relate to clock noise leakage reduction. Some aspects of the present disclosure relate to intermediate frequency (IF)-to-RF companion chip for backwards and forwards compatibility and modularity. Some aspects of the present disclosure relate to on-package matching networks. Some aspects of the present disclosure relate to 5G scalable receiver (Rx) architecture.

BACKGROUND

Physical space in mobile devices for wireless communication is usually at a premium because of the amount of functionality that is included within the form factor of such devices. Challenging issues arise, among other reasons, because of need for spatial coverage of radiated radio waves, and of maintaining signal strength as the mobile device is moved to different places, or because a user may orient the mobile device differently from time to time. This can lead to the need, in some aspects, for a large number of antennas, varying polarities, directions of radiation, varying spatial diversity of the radiated radio waves at varying time, and related needs. When designing packages that include antennas operating at millimeter wave (mmWave or mmW) frequencies, efficient use of space can help resolve such issues.

The ubiquity of wireless communication has continued to raise a host of challenging issues. In particular, challenges have evolved with the advent of mobile communication systems, such as 5G communications systems due to both the wide variety of devices with different needs and the spectrum to be used. In particular, the ranges of frequency bands used in communications has increased, most recently due to the incorporation of carrier aggregation of licensed and unlicensed bands and the upcoming use of the mmWave bands.

A challenge in mmWave radio front end modules (RFEMs) is providing for complete or near-complete directional coverage. Millimeter Wave systems require high antenna gain to close link budgets, and phased array antennas can be used to provide beam steering. However, the use of phased array antennas (such as an array of planar patch antennas) by themselves provide limited angular coverage. Although beam steering can help to direct energy towards the intended receiver (and reciprocally increase gain at the receiver in the direction of the intended transmitter), a simple array limits the coverage of steering angles. In addition, polarization of radio frequency (RF) signals is a major issue for mmWave. There are significant propagation differences between vertical and horizontal polarization, and in addition, use of both polarizations can be used to provide spatial diversity. Given the expected applications of this technology to mobile devices, it will become important to provide for selectable polarization in the antennas.

Another issue of increasing concern is atmospheric attenuation loss. Due to the high path loss caused by atmospheric absorption and high attenuation through solid materials, massive multiple input, multiple output (MIMO) systems may be used for communication in the mmWave bands. The use of beamforming to search for unblocked directed spatial channels, and the disparity between line of sight (LOS) and non-line of sight (NLOS) communications, may complicate mmWave architecture compared to the architecture used for communication through a wireless personal area network (WPAN) or a wireless local area network (WLAN).

BRIEF DESCRIPTION OF THE DRAWINGS

FIG. 43 illustrates exemplary operation modes of a phased array transceiver architecture with transceiver tiles according to some aspects.

FIG. 82 illustrates a frequency diagram of signals communicated between a RFEM and a BBS using clock noise leakage reduction according to some aspects.

FIG. 83 illustrates an exemplary RF front-end module (RFEM) of a distributed phased array system with IF processing according to some aspects.

FIG. 84 illustrates an exemplary baseband sub-system (BBS) of the distributed phased array system of FIG. 83 according to some aspects.

FIG. 85 illustrates an exemplary multi-band distributed phased array system with IF processing within the RFEMs according to some aspects.

FIG. 86 illustrates an exemplary distributed phased array system with an RFEM coupled to a BBS via a single coax cable for communicating RF signals according to some aspects.

FIG. 87 illustrates a more detailed diagram of the BBS of FIG. 86 according to some aspects.

FIG. 88 illustrates an exemplary distributed phased array system supporting multiple operating frequency bands, using multiple RFEMs coupled to a single BBS according to some aspects.

FIG. 89 illustrates a more detailed diagram of the BBS of FIG. 88 according to some aspects.

FIG. 90 illustrates an exemplary distributed phased array system including RFEM, a companion chip and a BBS, with IF processing offloaded to the companion chip according to some aspects.

FIG. 91 illustrates a more detailed diagram of the companion chip and the BBS of FIG. 90 according to some aspects.

FIG. 92 illustrates an exemplary multi-band distributed phased array system with IF processing within the companion chip according to some aspects.

FIG. 93 illustrates an exemplary on-chip implementation of a two-way power combiner according to some aspects.

Figure 94:
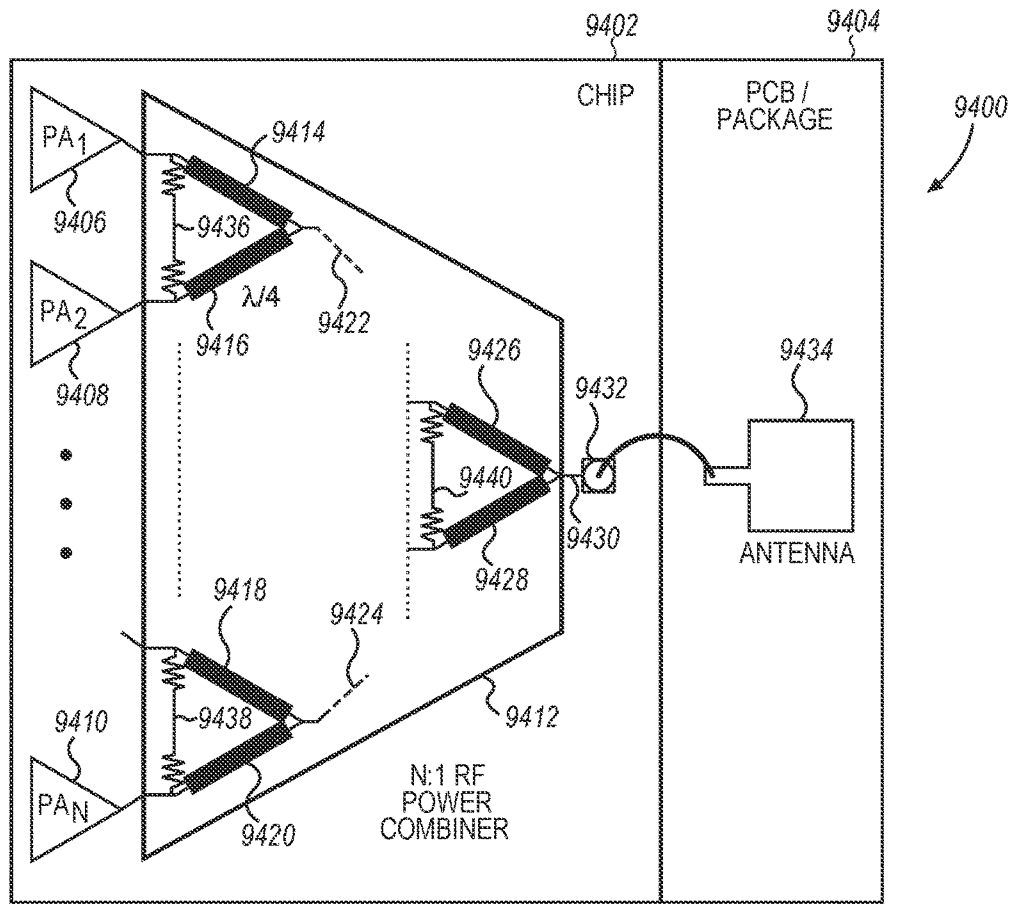

FIG. 94 illustrates an exemplary on-chip implementation of a large scale power combiner according to some aspects.

Figure 95:
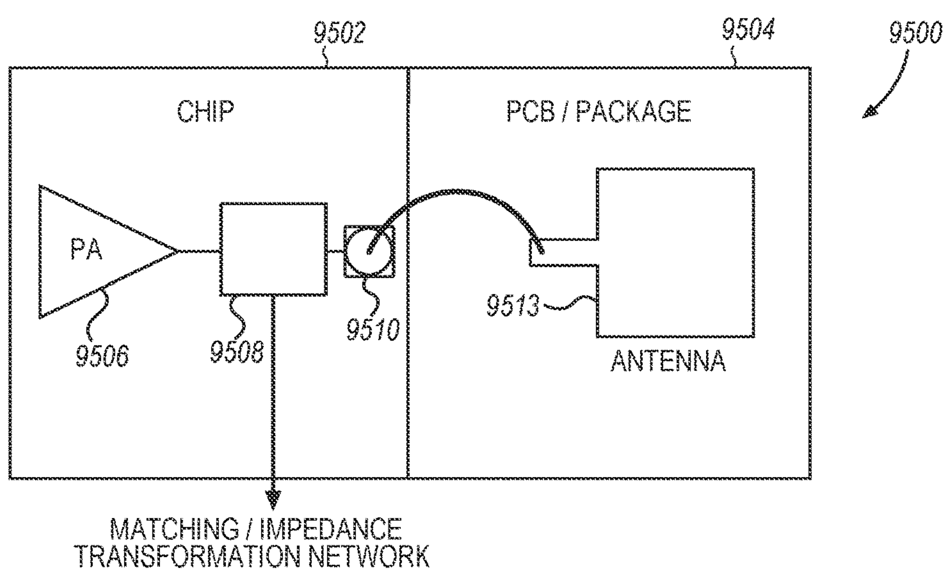

FIG. 95 illustrates an exemplary on-chip implementation of an impedance transformation network according to some aspects.

Figure 96:
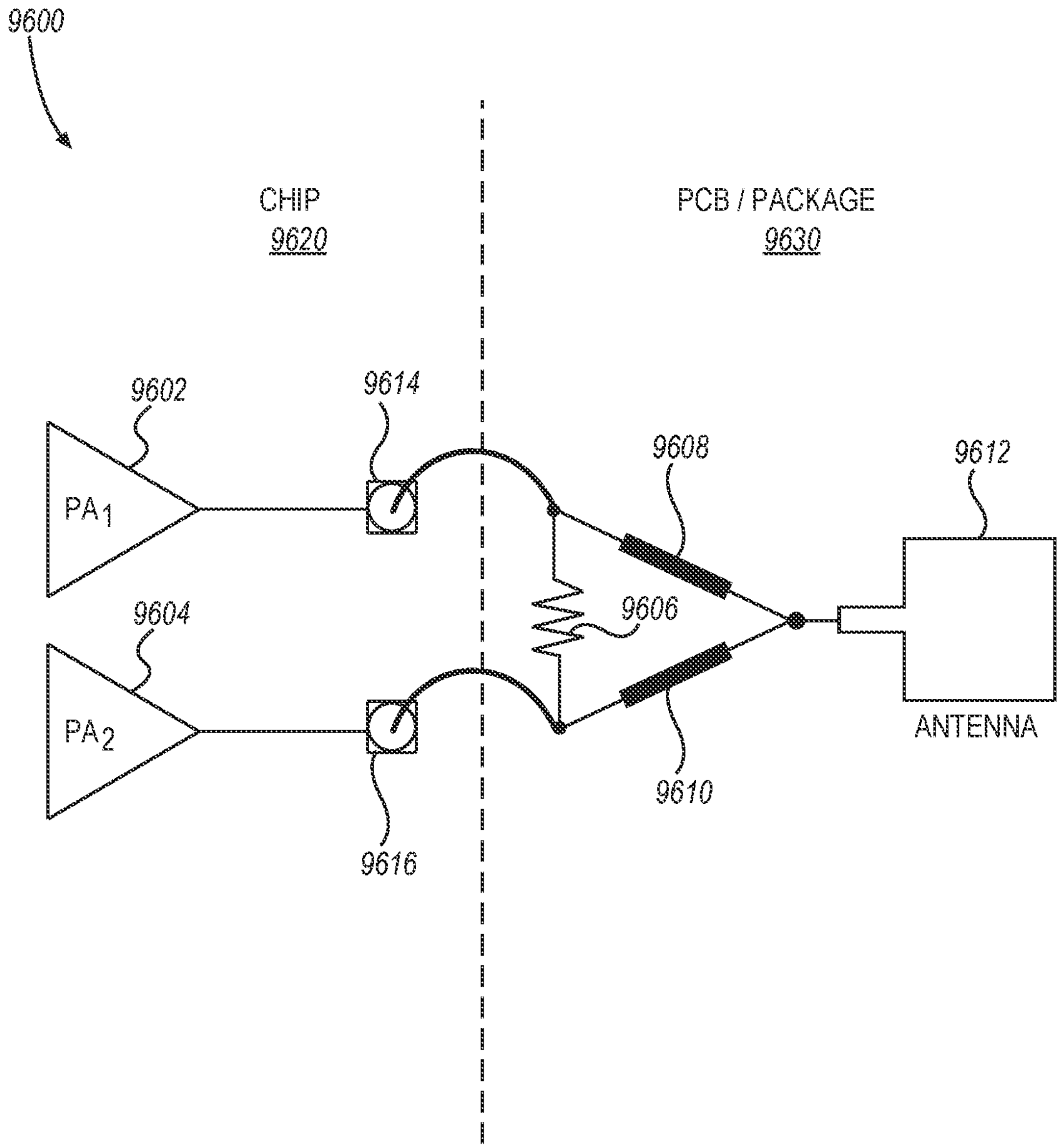

FIG. 96 illustrates an exemplary on-package implementation of a two-way power combiner according to some aspects.

Figure 97:
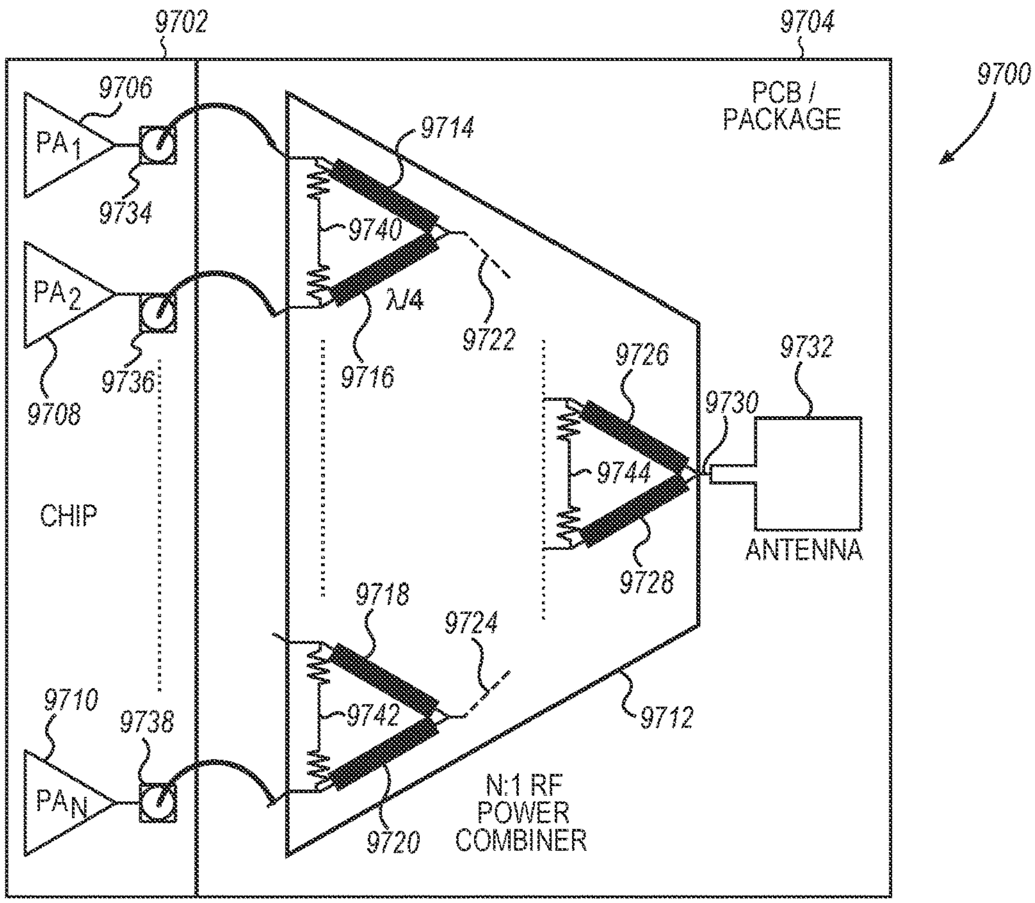

FIG. 97 illustrates an exemplary on-package implementation of a large scale power combiner according to some aspects.

Figure 98:
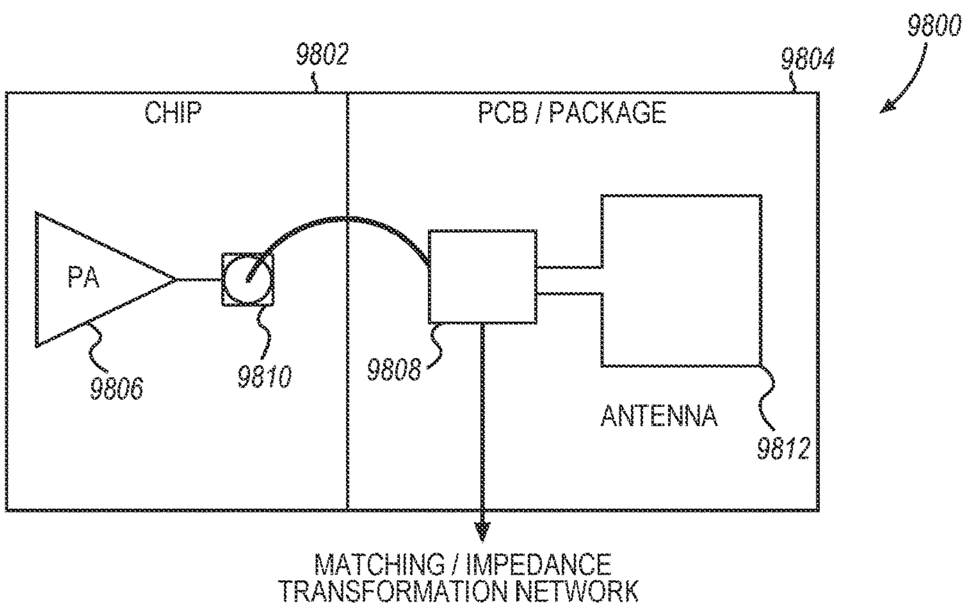

FIG. 98 illustrates an exemplary on-package implementation of an impedance transformation network according to some aspects.

Figure 99:
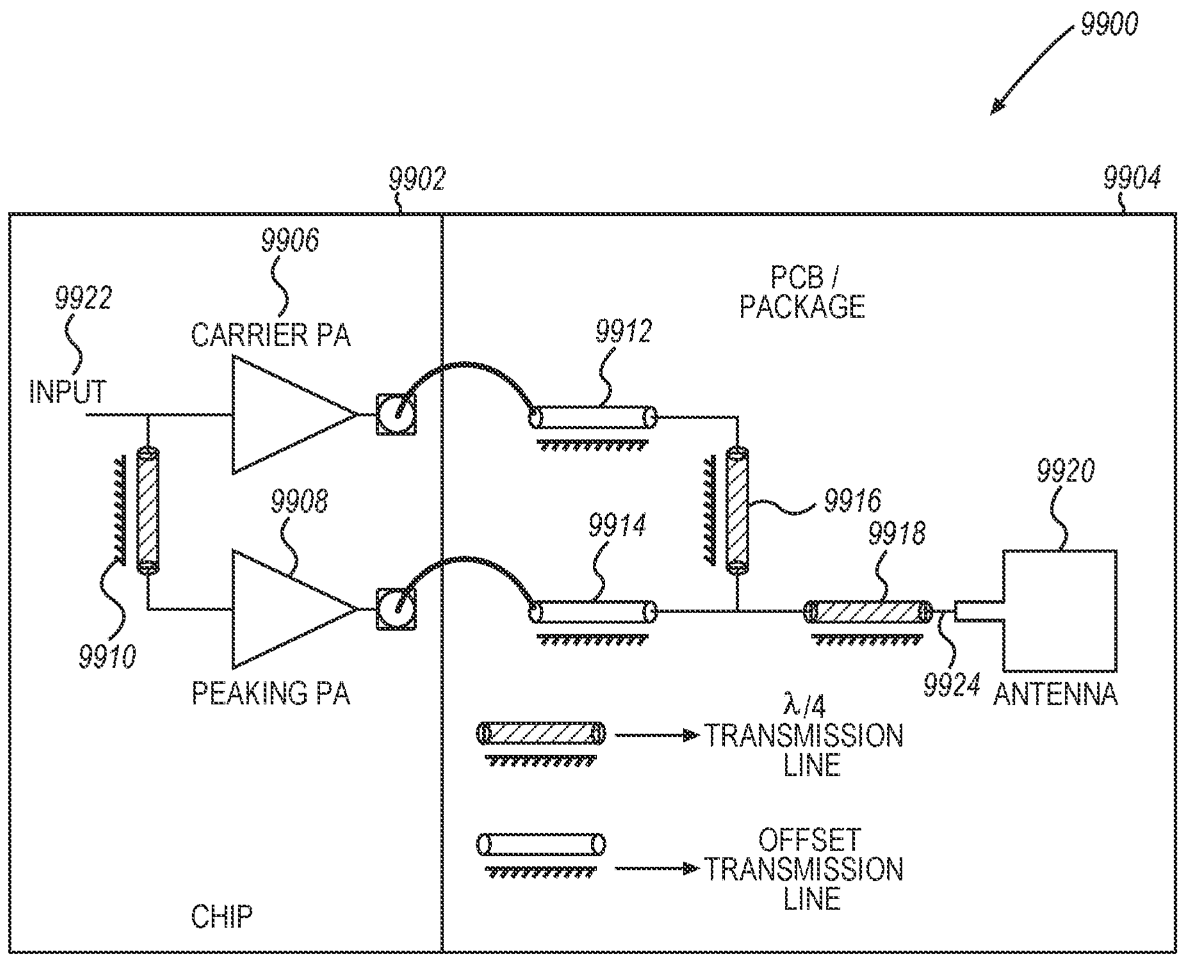

FIG. 99 illustrates an exemplary on-package implementation of a Doherty power amplifier according to some aspects.

Figure 100A:
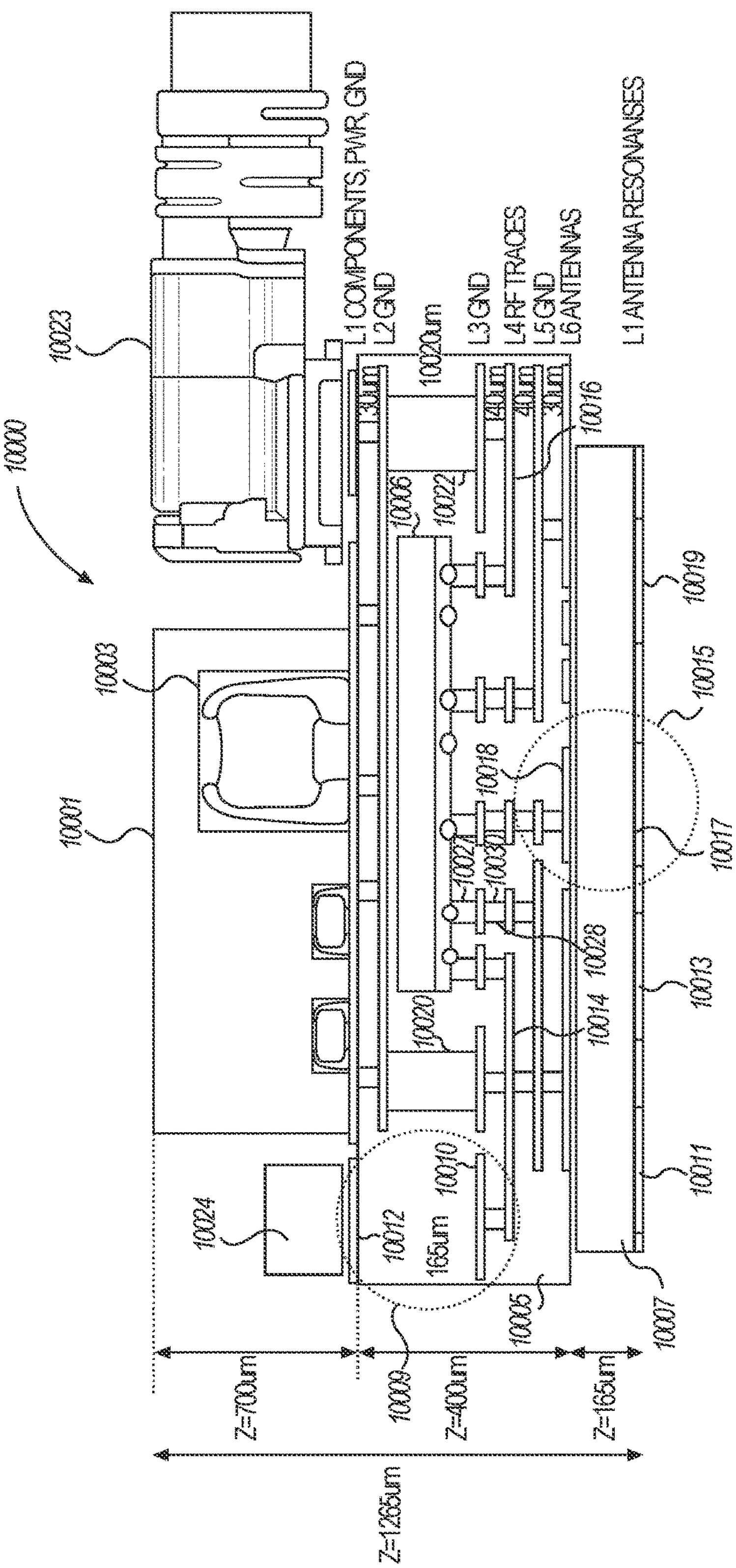

FIG. 100A is a side view of an exemplary unmolded stacked package-on-package embedded die radio system using a connector, according to some aspects.

Figure 100B:
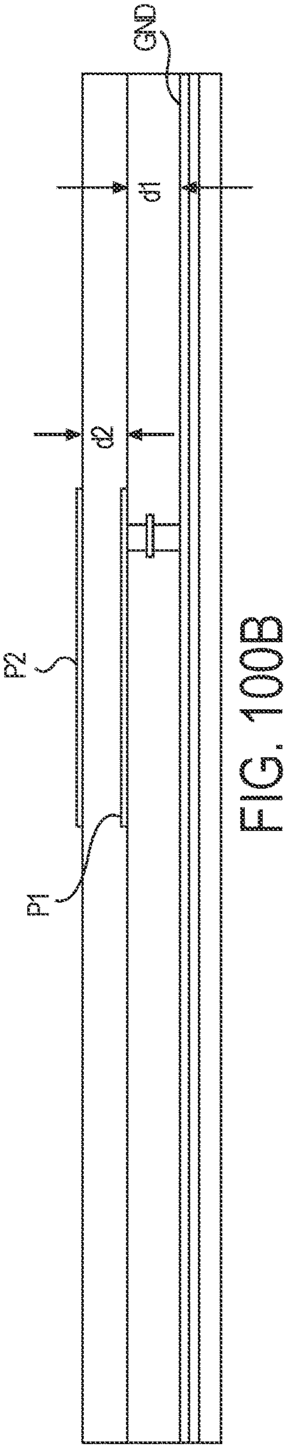
Figure 100C:
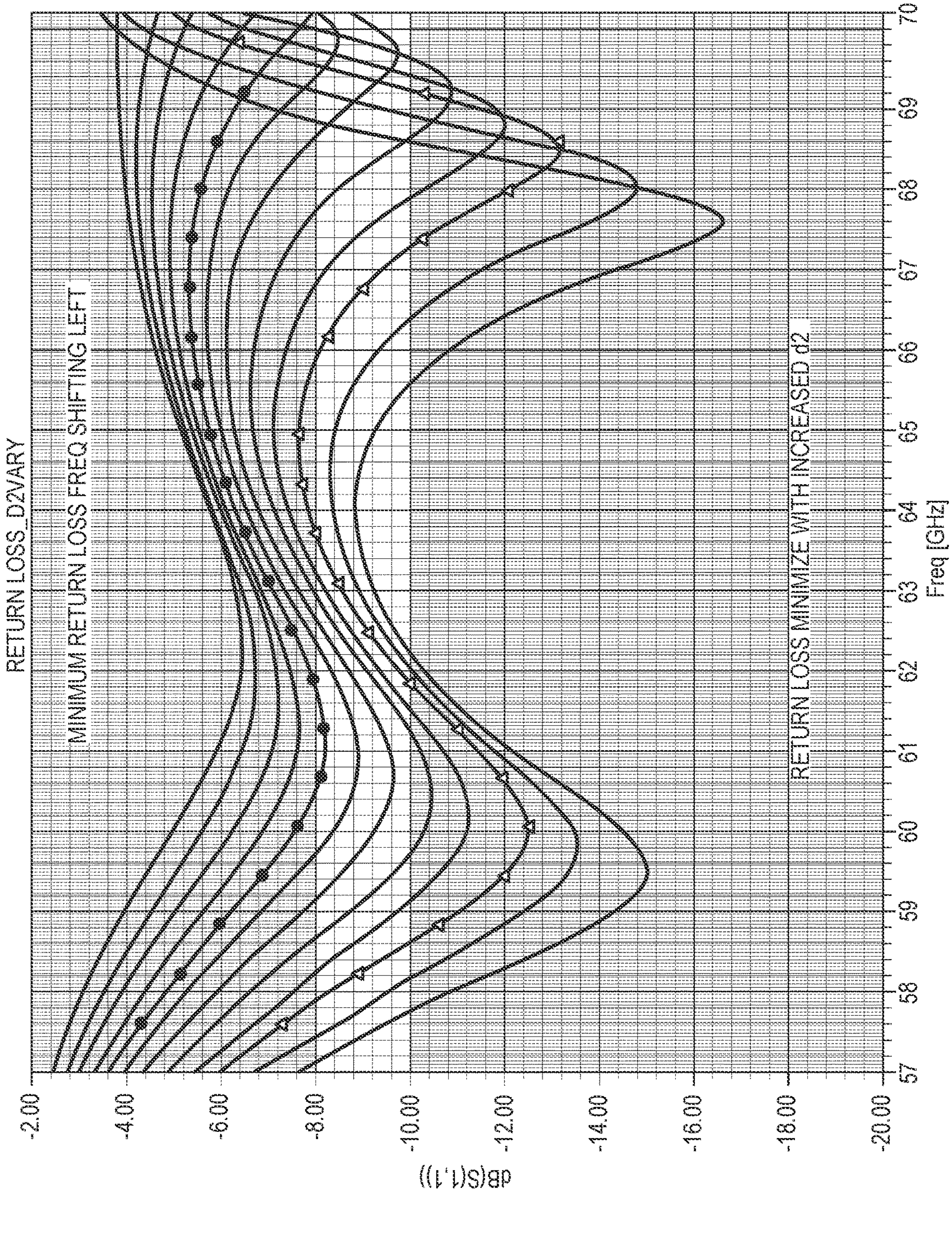

FIG. 100B is a side view of an exemplary dual patch antenna, according to some aspects FIG. 100C is a simulated graph of return loss of the dual patch antenna of FIG. 100B as the volume of the antenna is increased, according to some aspects.

Figure 101A:
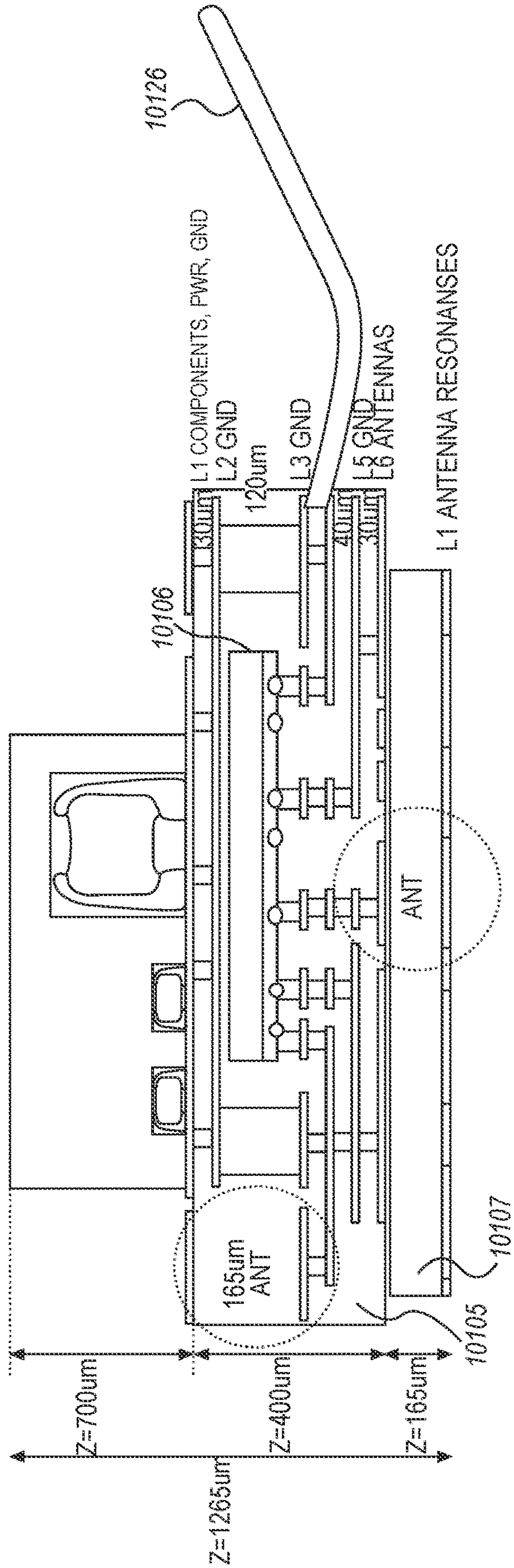

FIG. 101A is a side view of an exemplary unmolded stacked package-on-package embedded die radio system using a flex interconnect, according to some aspects.

Figure 101B:
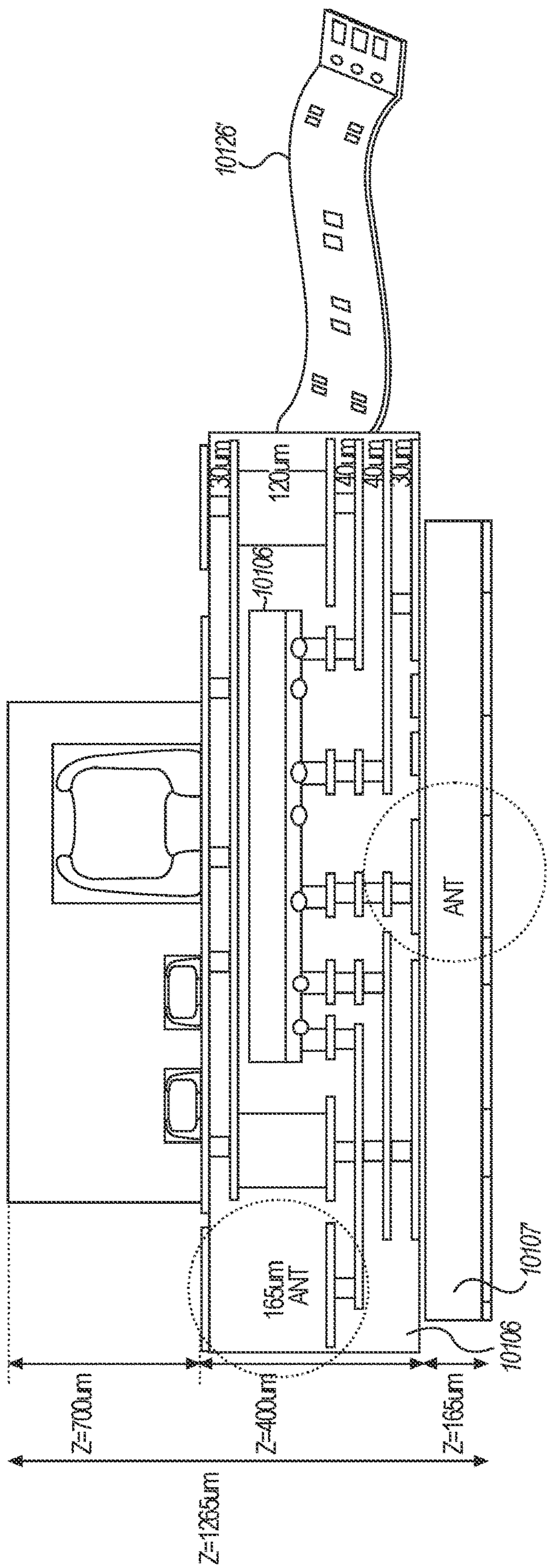

FIG. 101B is a side view of the unmolded stacked package-on-package embedded die radio system using a flex interconnect where the flex interconnect is shown in photographic representation, according to some aspects.

Figure 102:
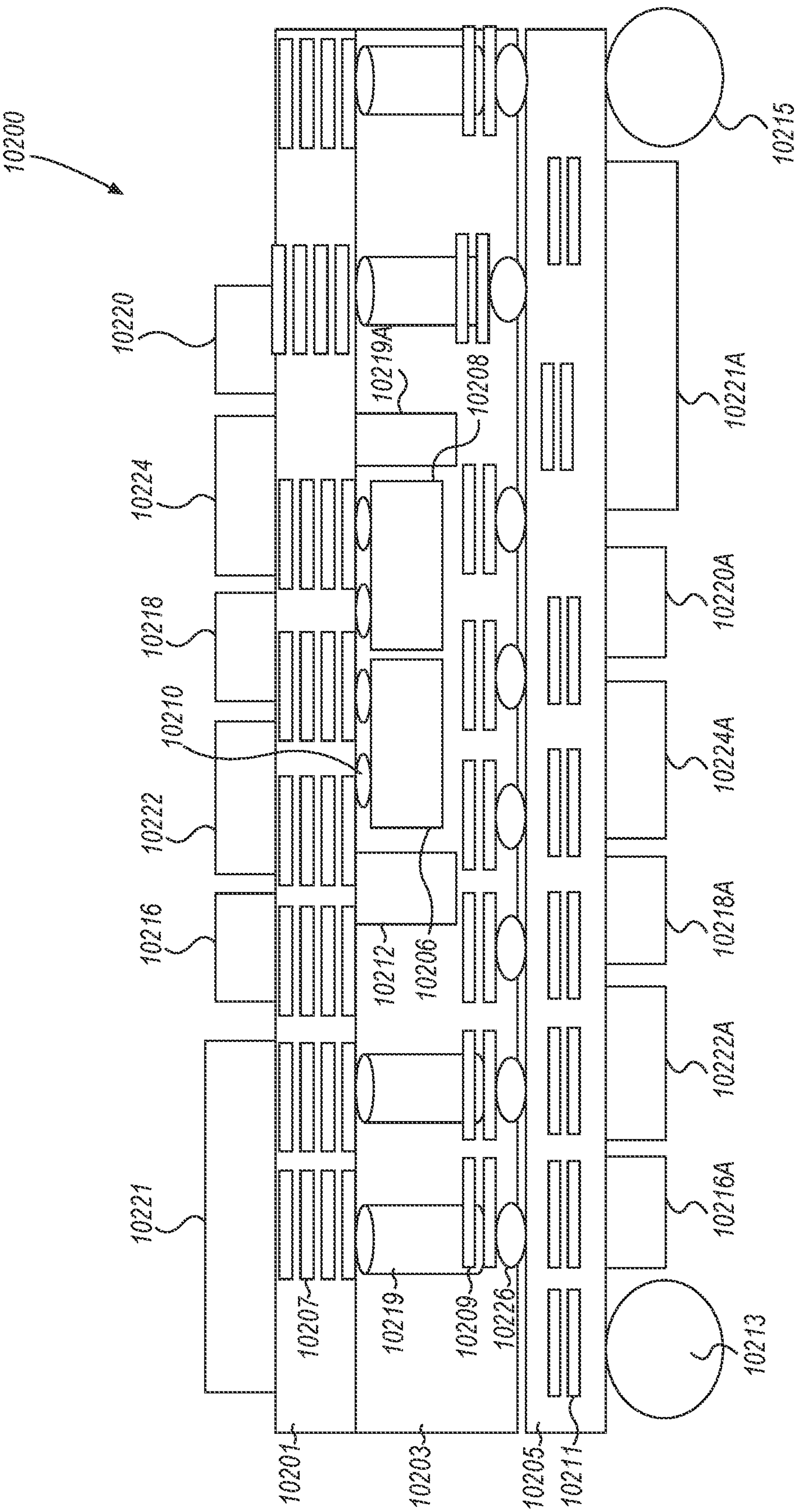

FIG. 102 is a side view of an exemplary molded stacked package-on-package embedded die radio system, according to some aspects.

Figure 103:
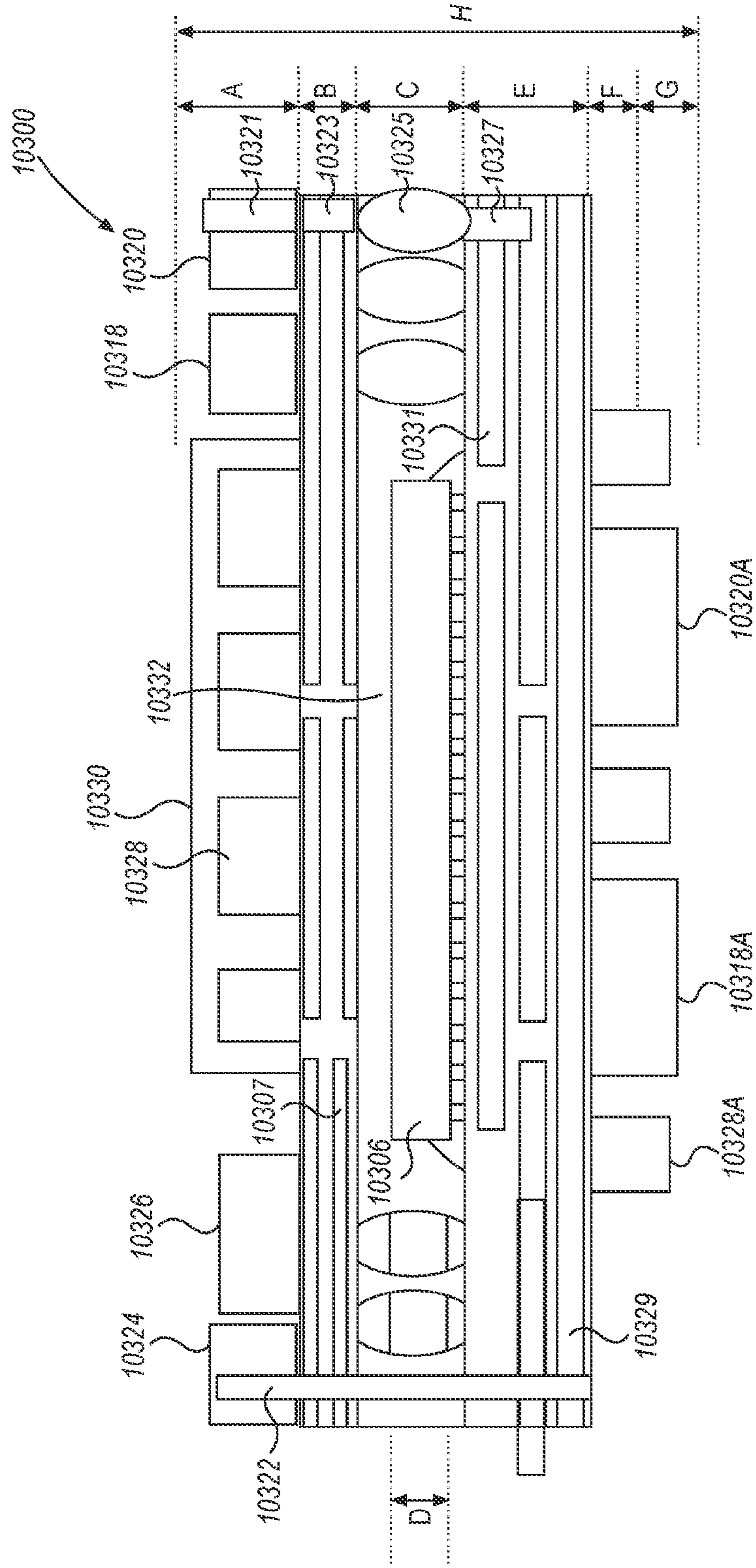

FIG. 103 is a side view of an exemplary molded package-on-package embedded die radio system, according to some aspects.

Figure 104:
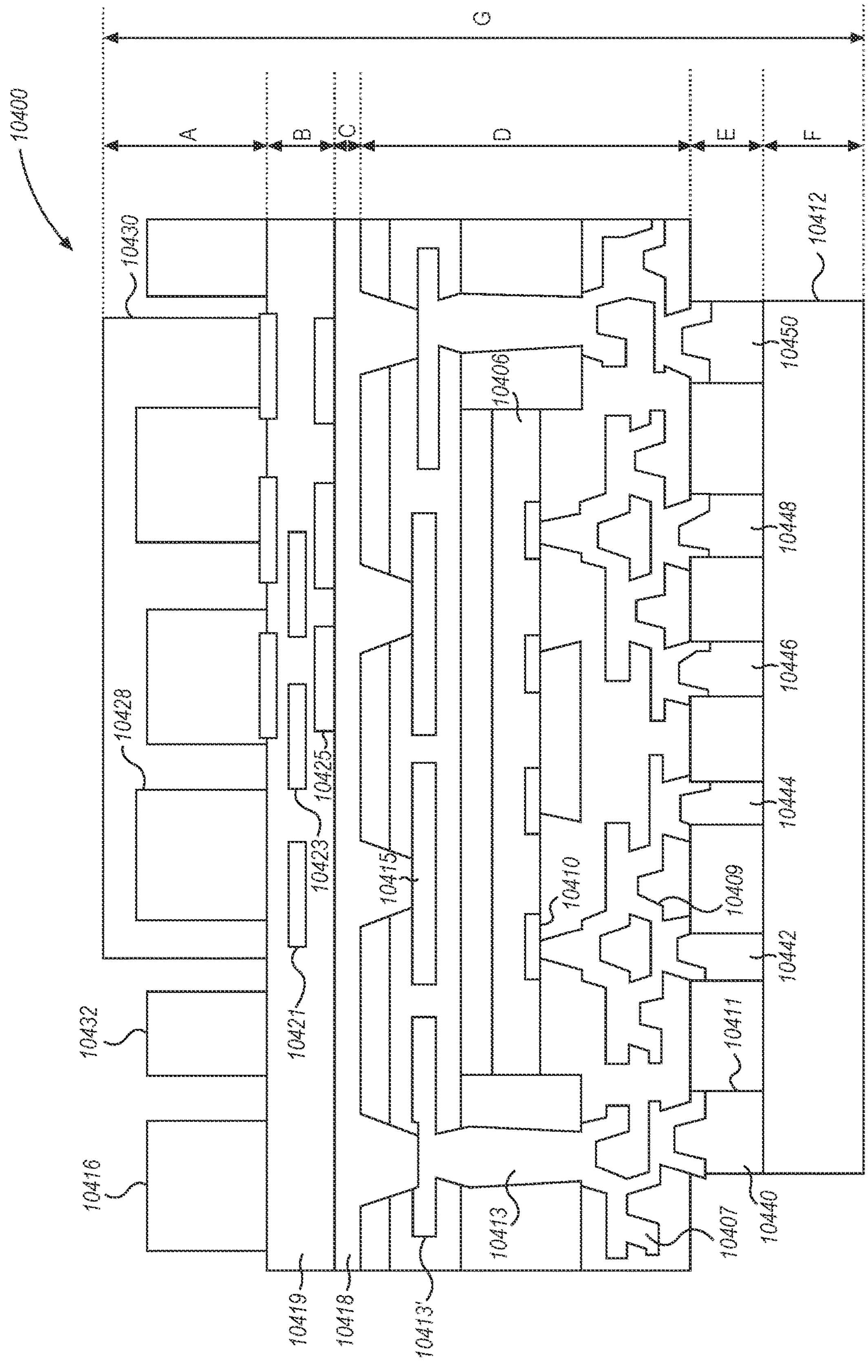

FIG. 104 is a side view of a package-on-package embedded die radio systems using redistribution layers, according to some aspects.

Figure 105:
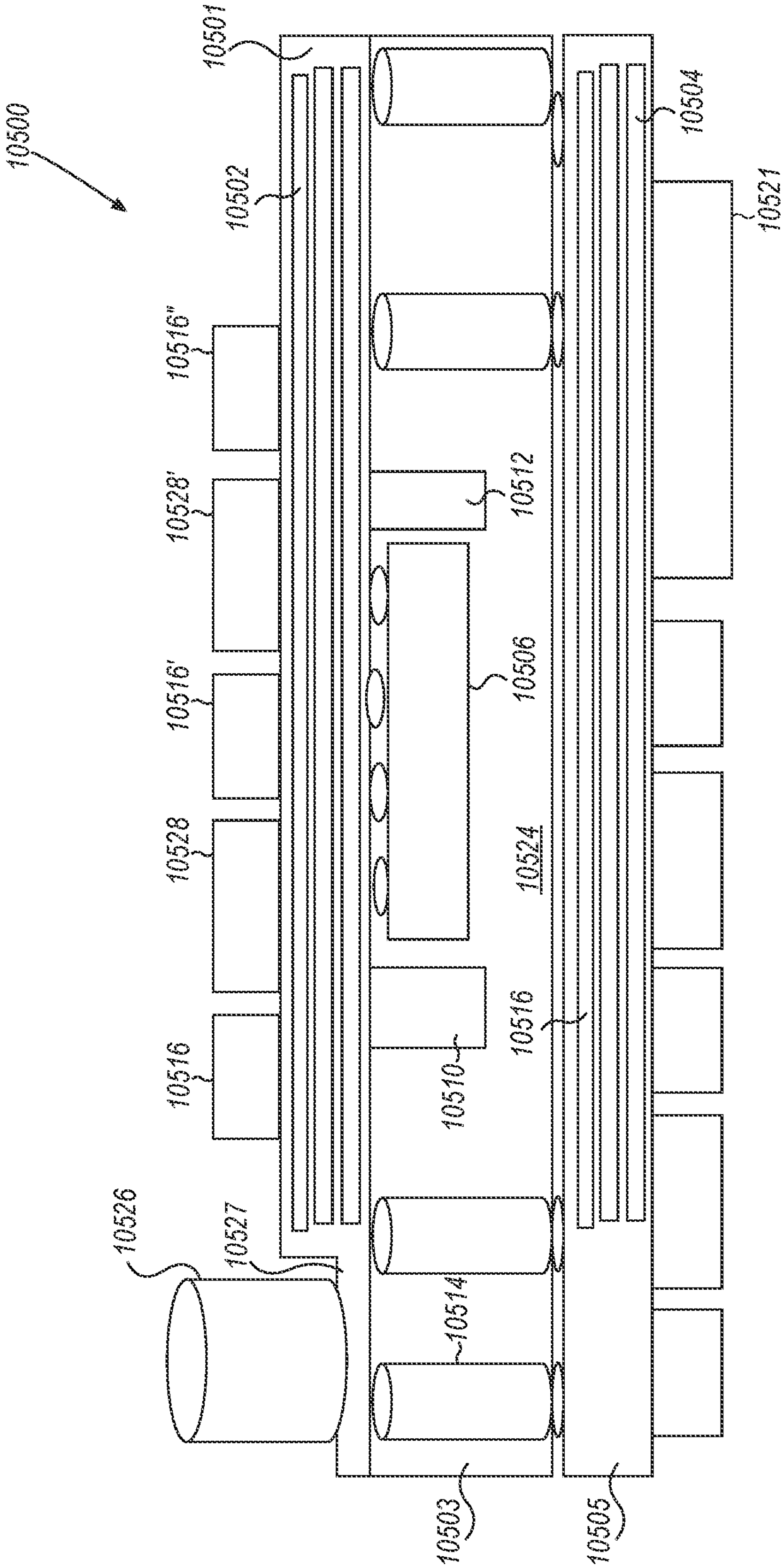

FIG. 105 is a side view of the molded stacked package-on-package embedded die radio system with recesses in the molded layers to gain height in the z-direction, according to some aspects.

Figure 106:
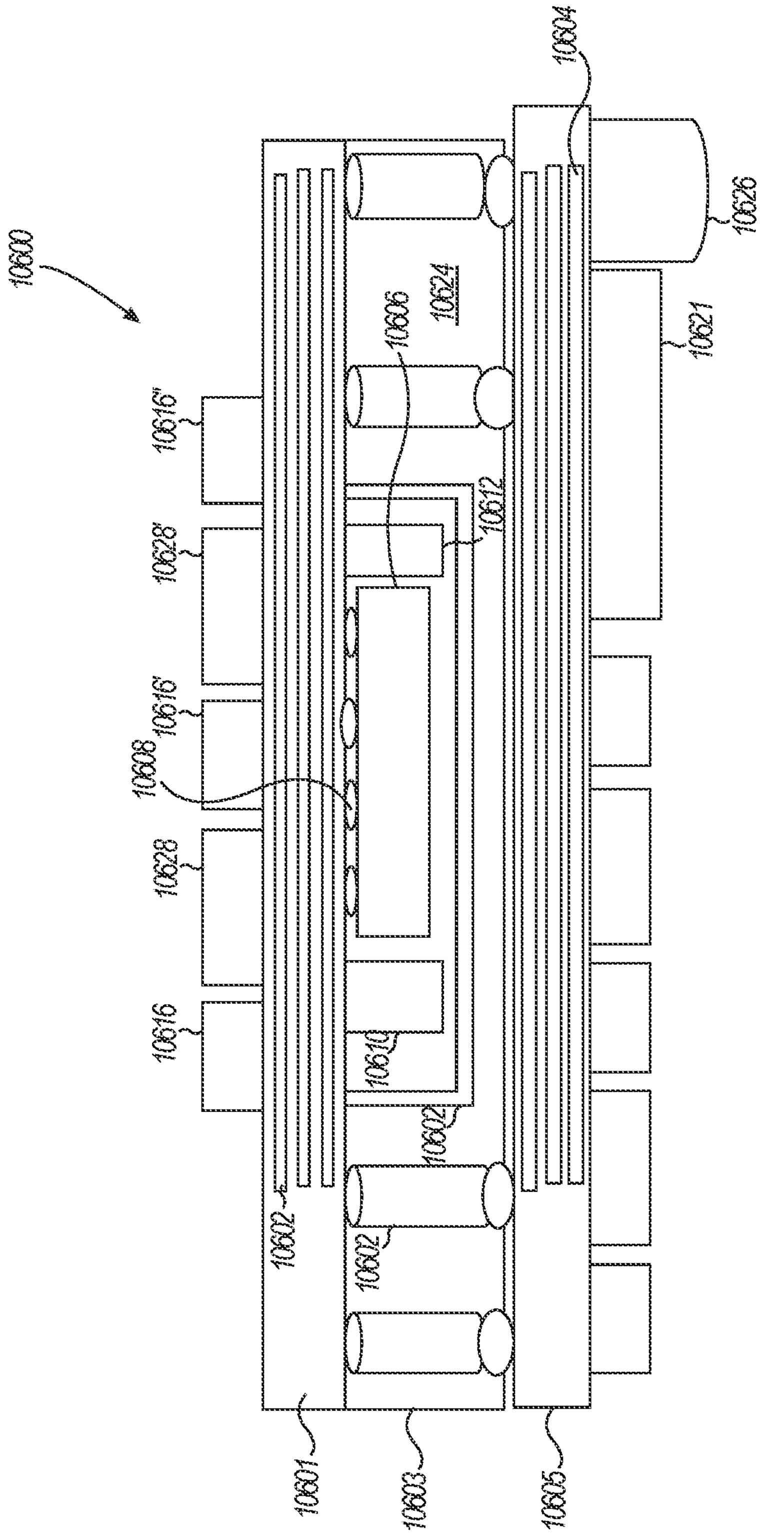

FIG. 106 is a side view of the molded stacked package-on-package embedded die radio system that includes a mechanical shield embedded in the mold for EMI shielding and for heat spreading, according to some aspects.

Figure 107:
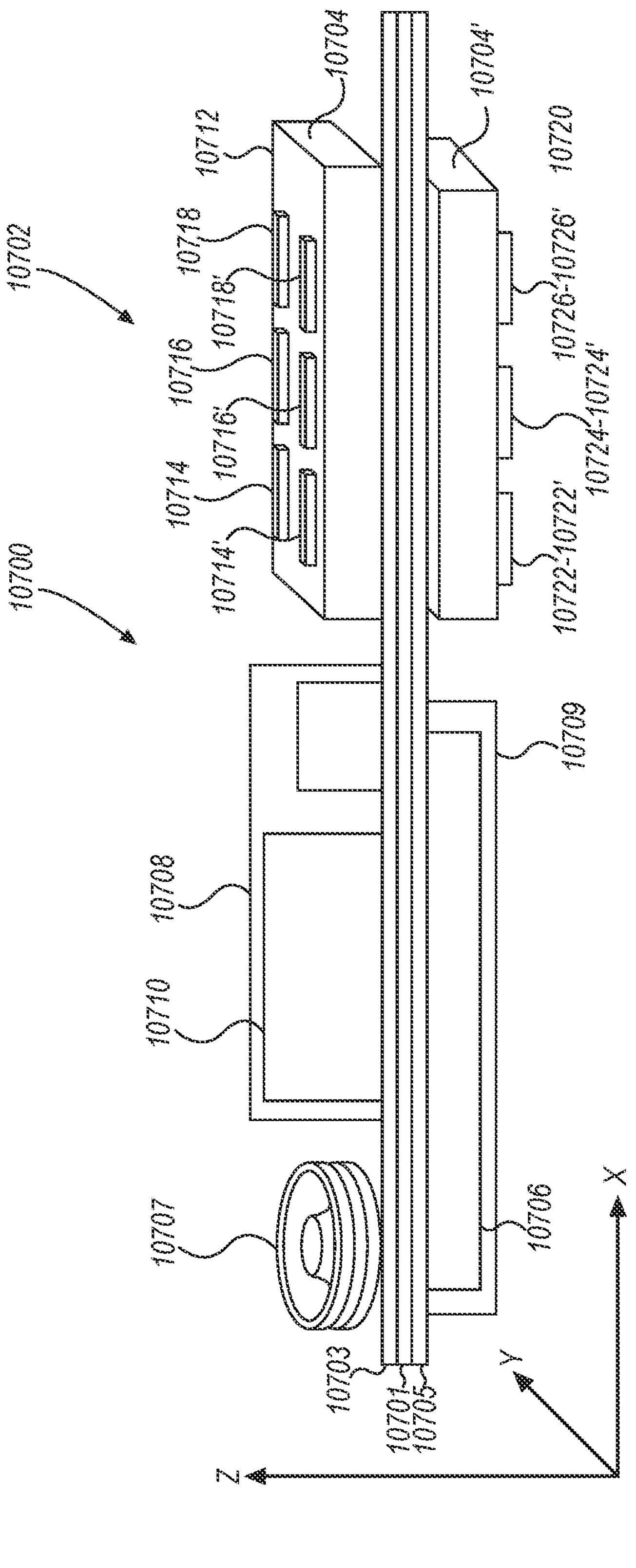

FIG. 107 is a perspective view of an exemplary stacked ultra-thin system in a package radio system with a laterally placed antennas or antenna arrays, according to some aspects.

Figure 108A:
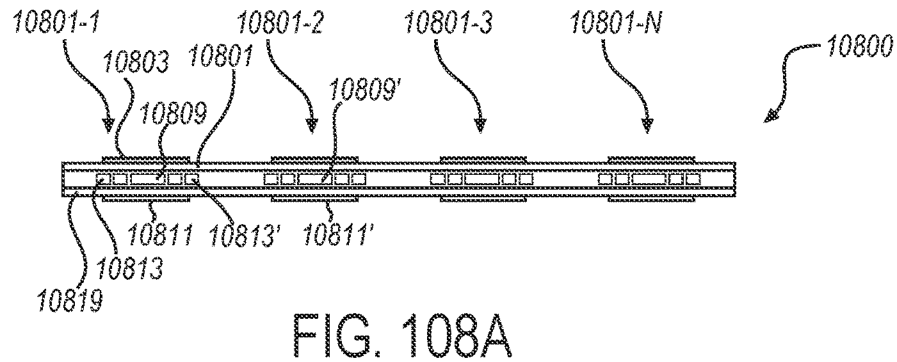
Figure 108B:
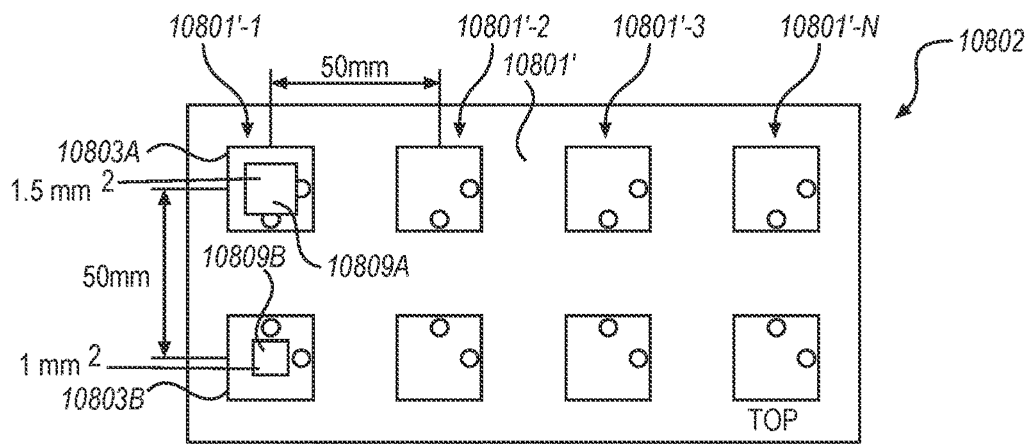
Figure 108C:
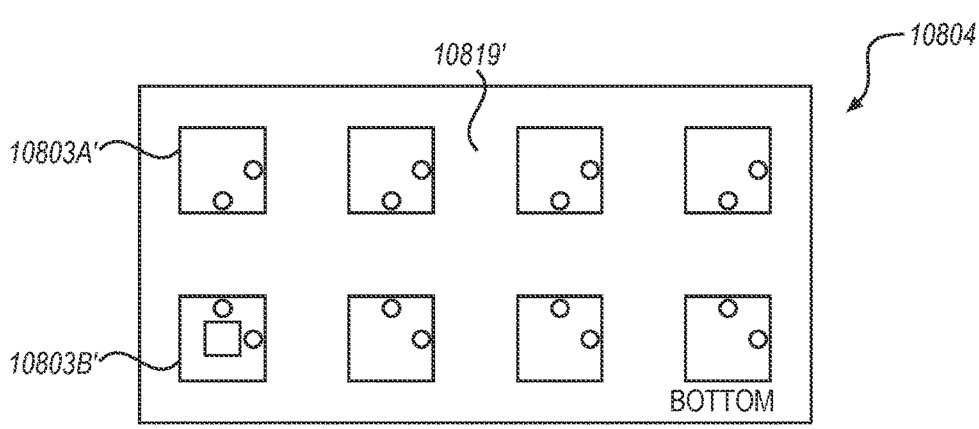

FIGS. 108A through 108C illustrate an exemplary embedded die package according to some aspects.

Figure 109:
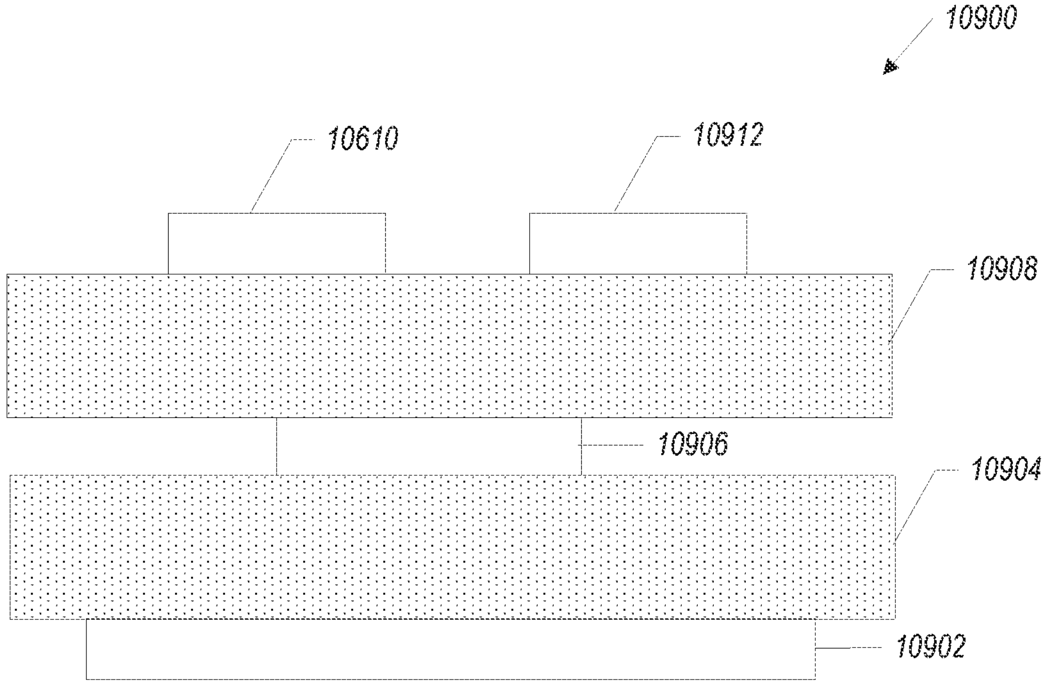

FIG. 109 illustrates a block diagram of a side view of an exemplary stacked ring resonators (SRR) antenna package cell using according to some aspects.

Figure 110:
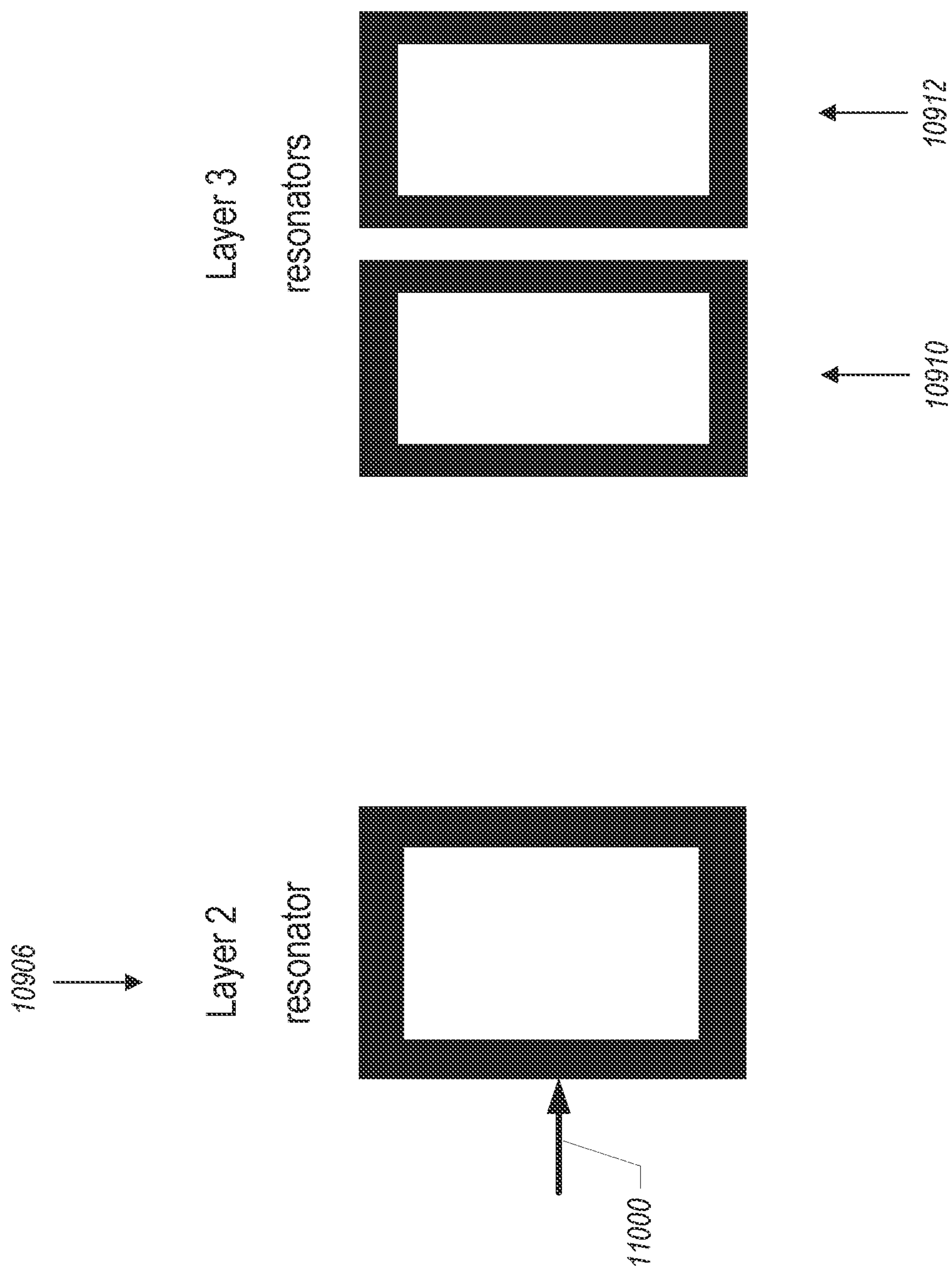

FIG. 110 illustrates exemplary ring resonators, which can be used in one or more layers of the antenna package cell of FIG. 109 according to some aspects.

Figure 111:
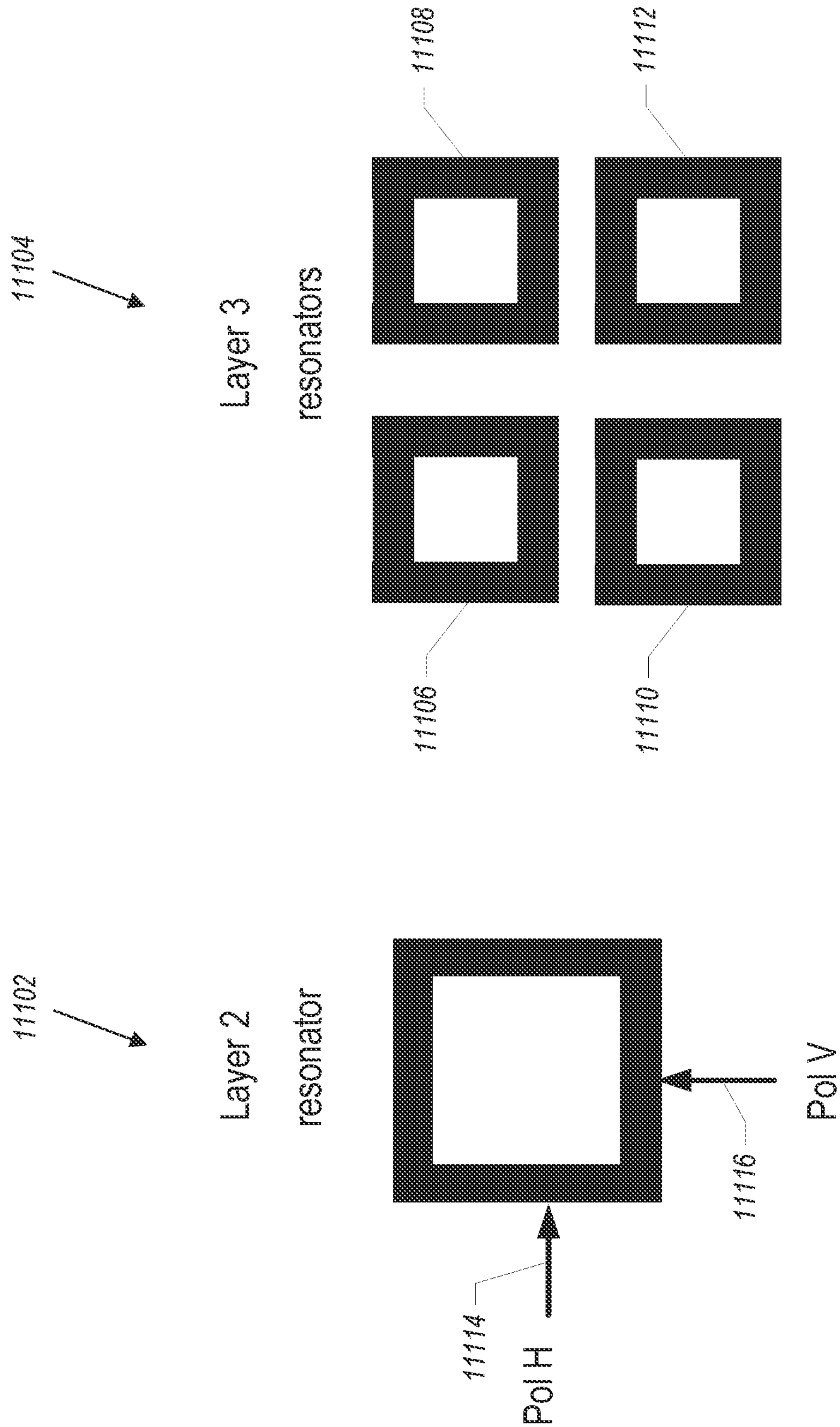

FIG. 111 illustrates exemplary ring resonators with multiple feed lines using different polarization, which can be used in one or more layers of the antenna package cell of FIG. 109 according to some aspects.

Figure 112:
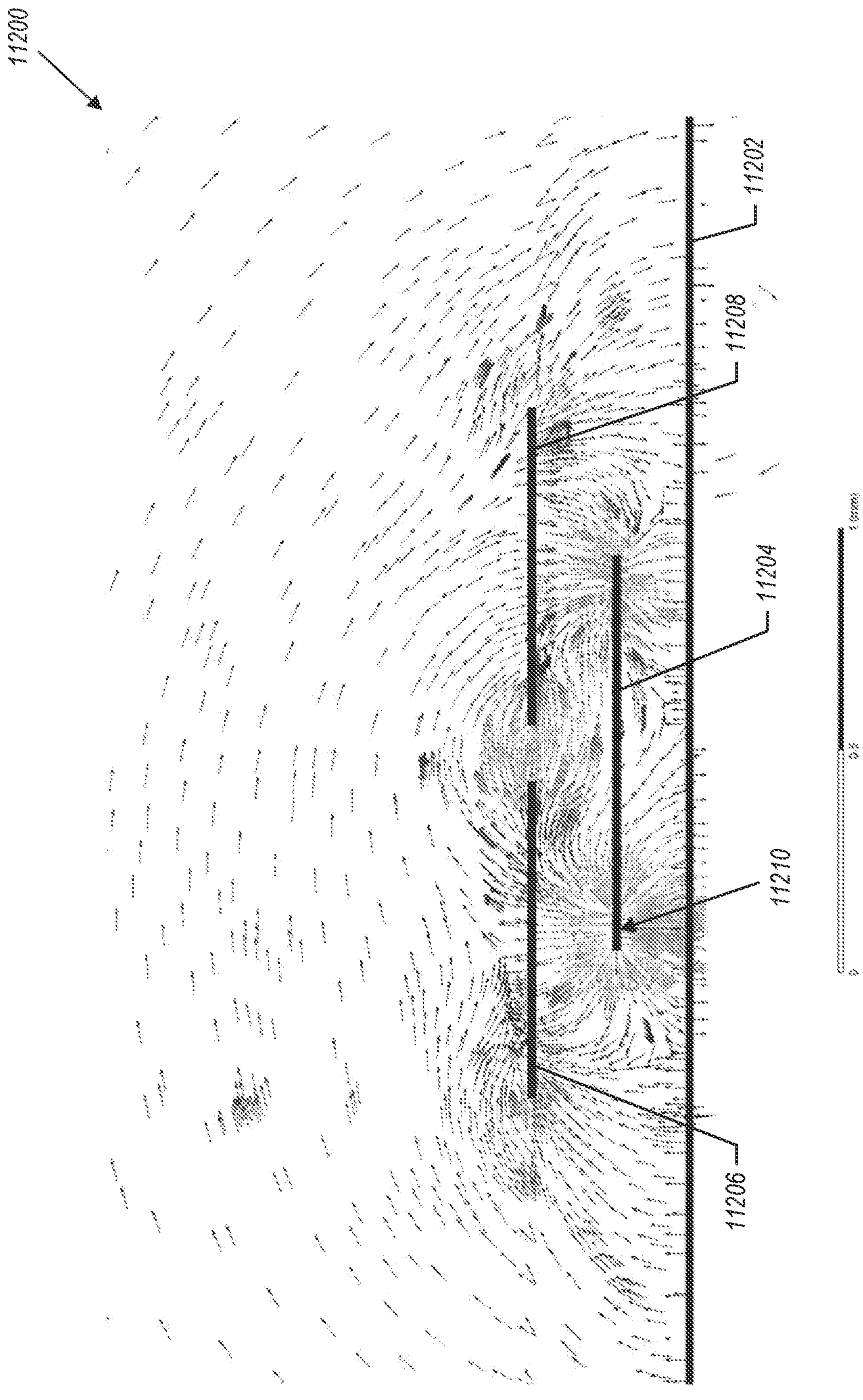

FIG. 112 illustrates exemplary electric field lines in the E plane of the SRR antenna of FIG. 109 according to some aspects.

Figure 113:
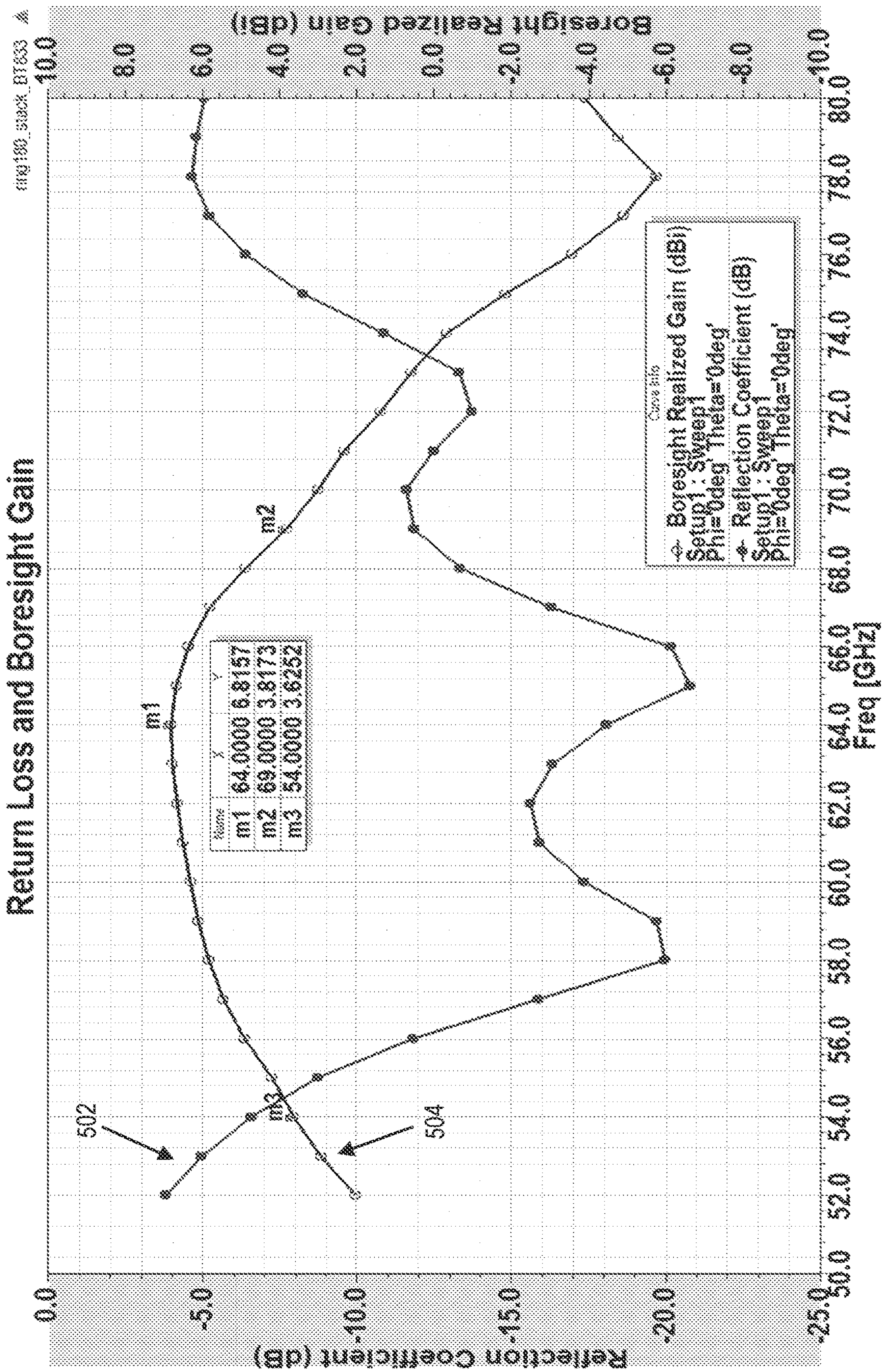

FIG. 113 is an exemplary graphical representation of reflection coefficient and boresight realized gain of the SRR antenna package cell of FIG. 109 according to some aspects.

Figure 114:
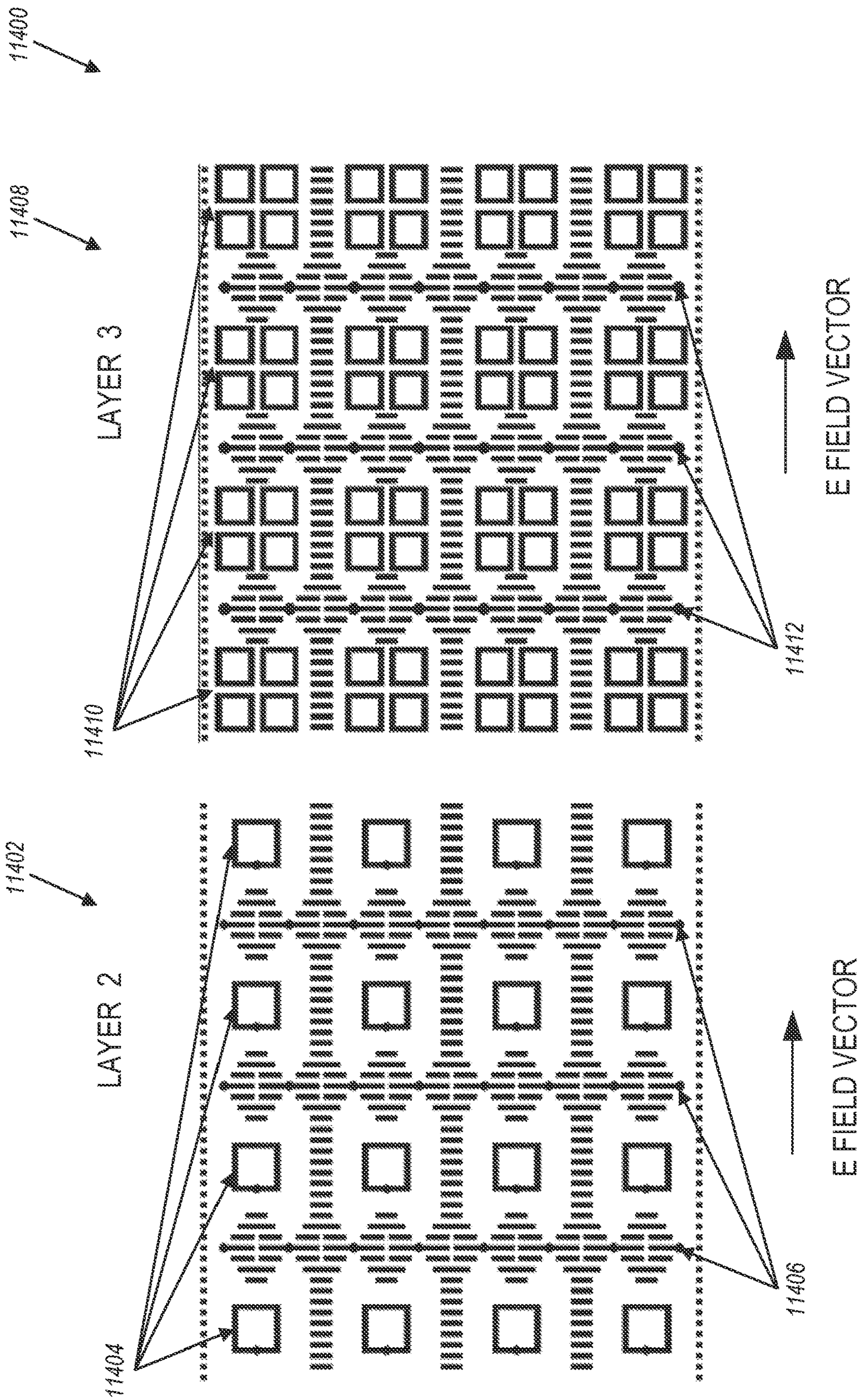

FIG. 114 illustrates a block diagram of an exemplary antenna array using the SRR antenna package cell of FIG. 109 according to some aspects.

Figure 115:
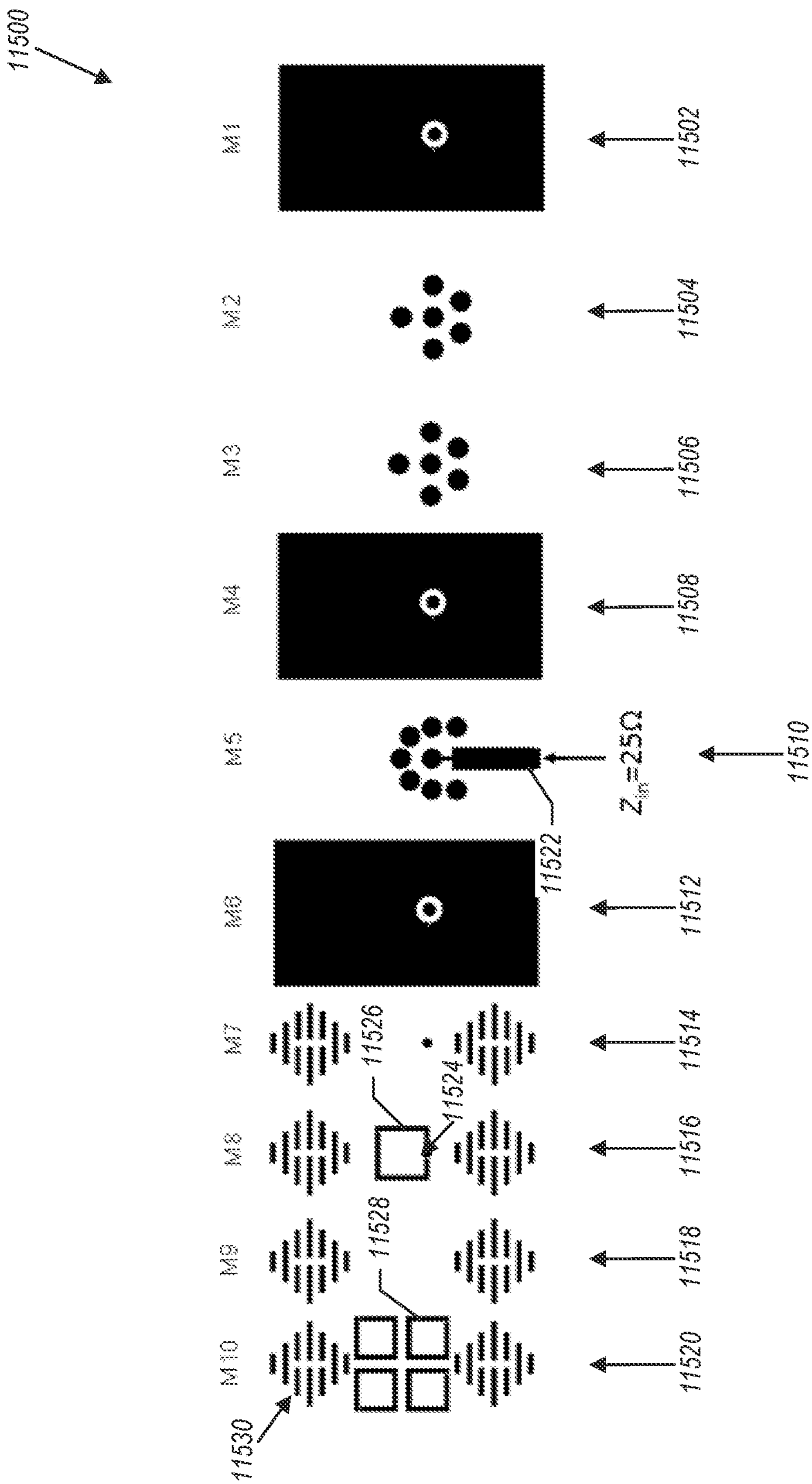

FIG. 115 illustrates a set of exemplary layers that make up an exemplary SRR antenna package cell of FIG. 109 according to some aspects.

Figure 116:
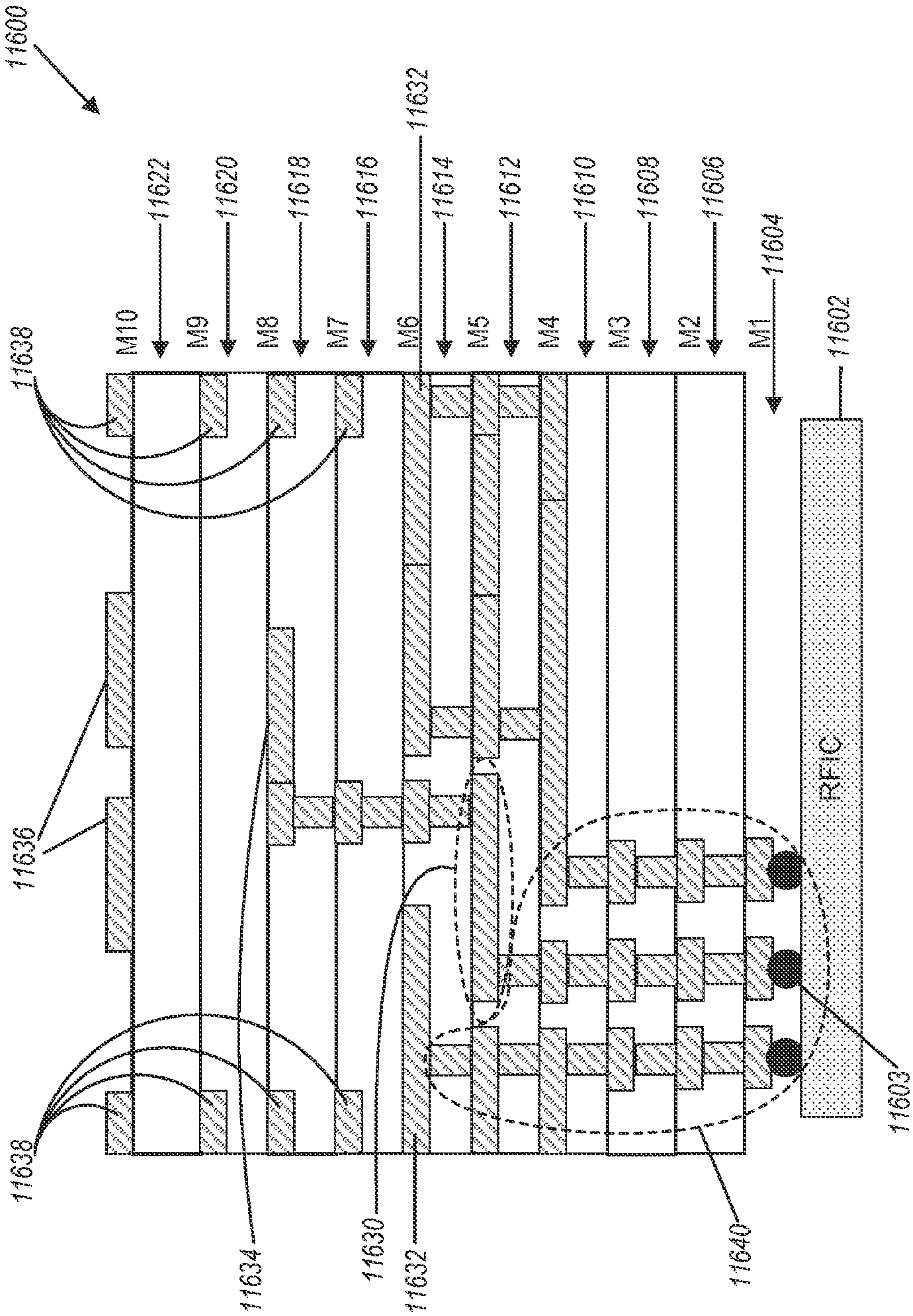

FIG. 116 illustrates a block diagram of an exemplary stack up of the SRR antenna package cell of FIG. 109 according to some aspects.

Figure 117:
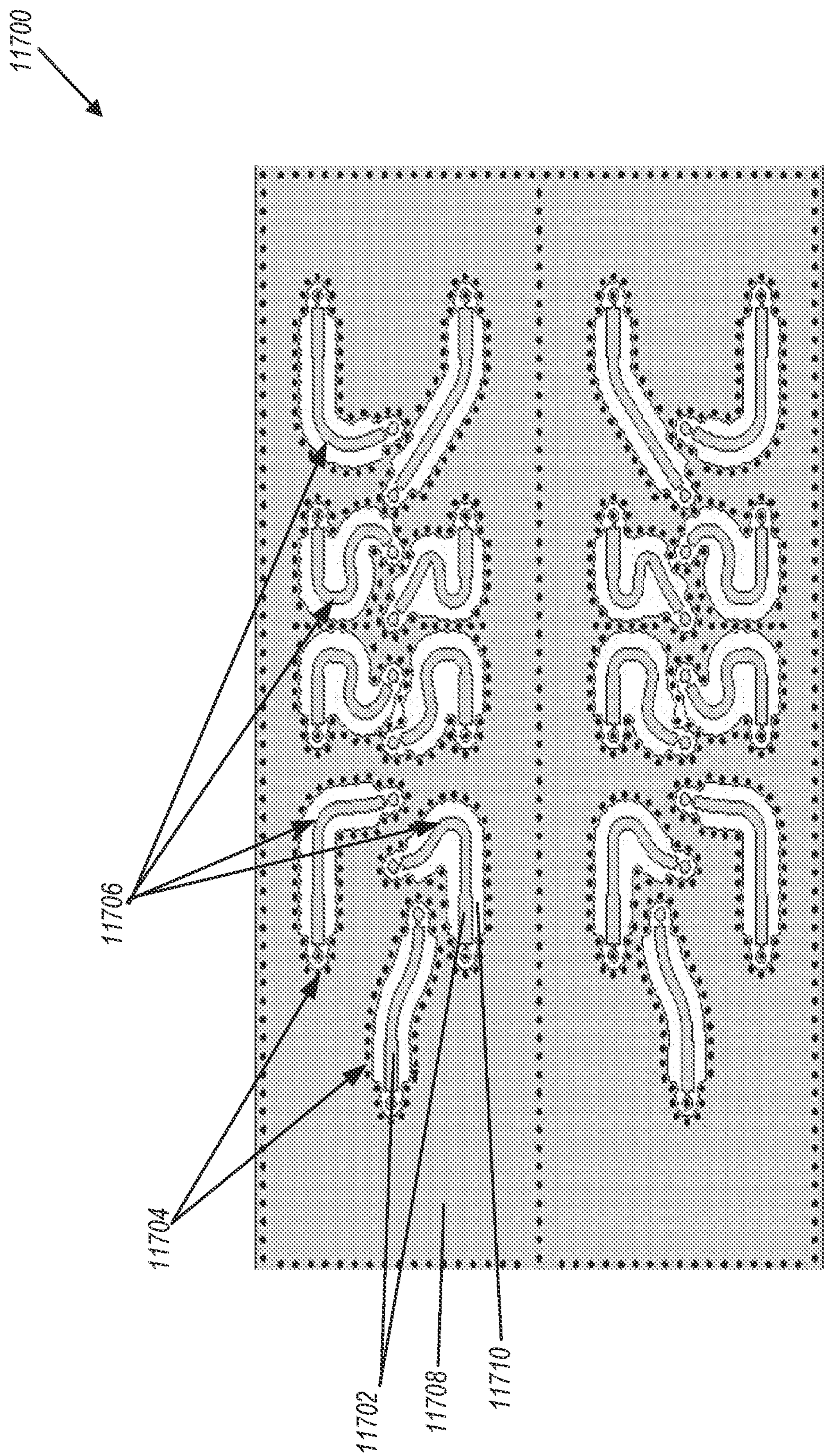

FIG. 117 illustrates a block diagram of a plurality of exemplary striplines, which can be used as feed lines for the SRR antenna package cell of FIG. 109 according to some aspects.

Figure 118A:
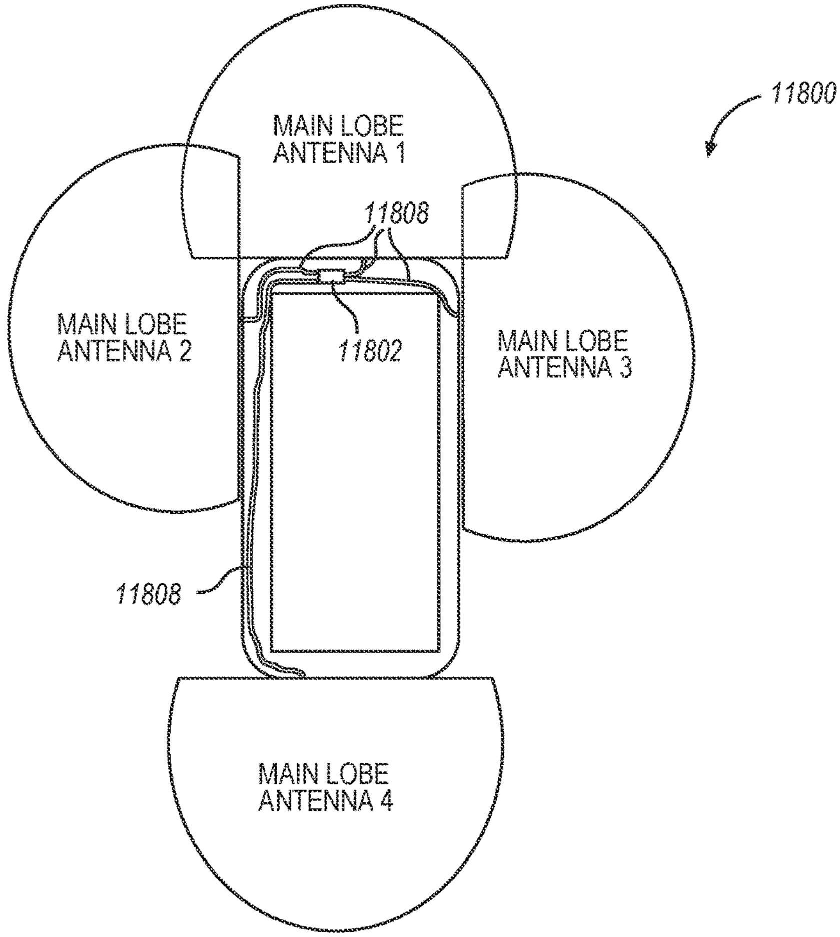

FIG. 118A illustrates an exemplary mobile device using a plurality of waveguide antennas according to some aspects.

Figure 118B:
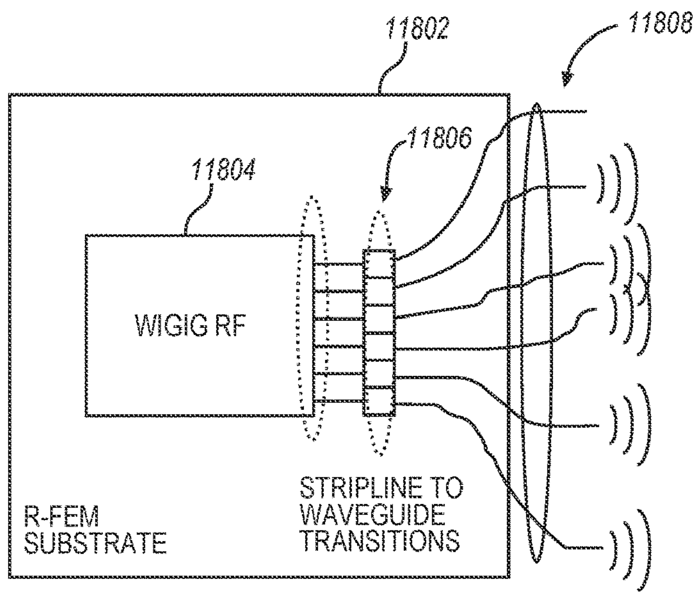

FIG. 118B illustrates an exemplary radio frequency front-end module (RFEM) with waveguide transition elements according to some aspects.

Figure 119A:
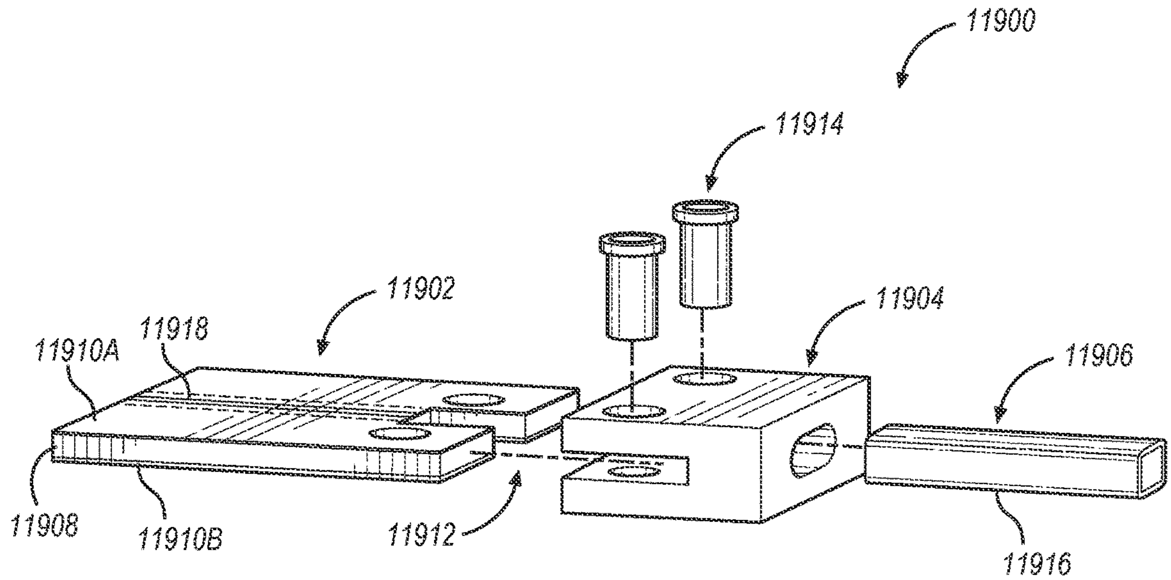
Figure 119B:
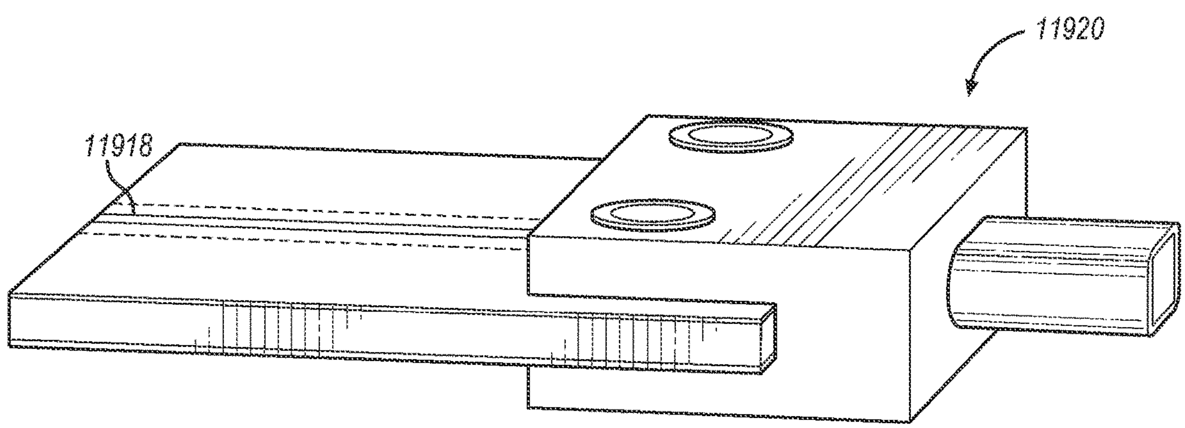

FIG. 119A and FIG. 119B illustrate perspective views of an exemplary waveguide structure for transitioning between a PCB and a waveguide antenna according to some aspects.

Figure 120A:
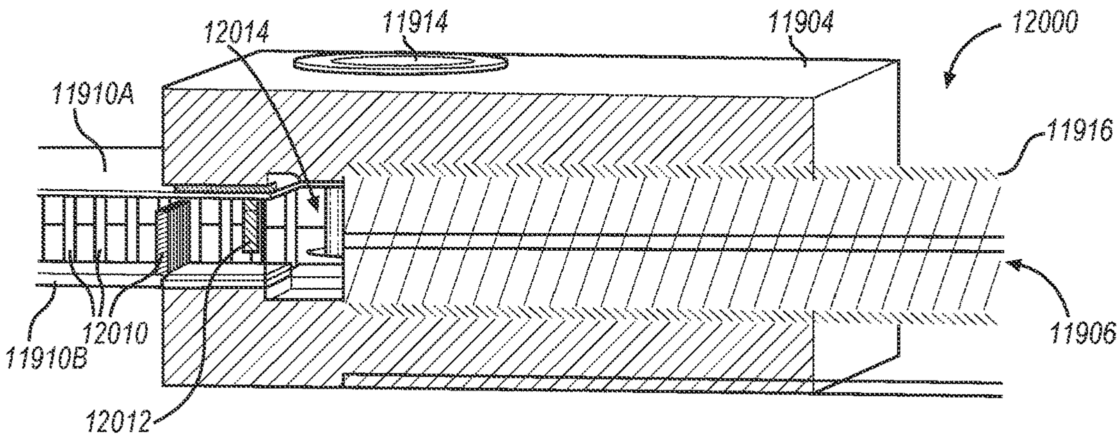
Figure 120B:
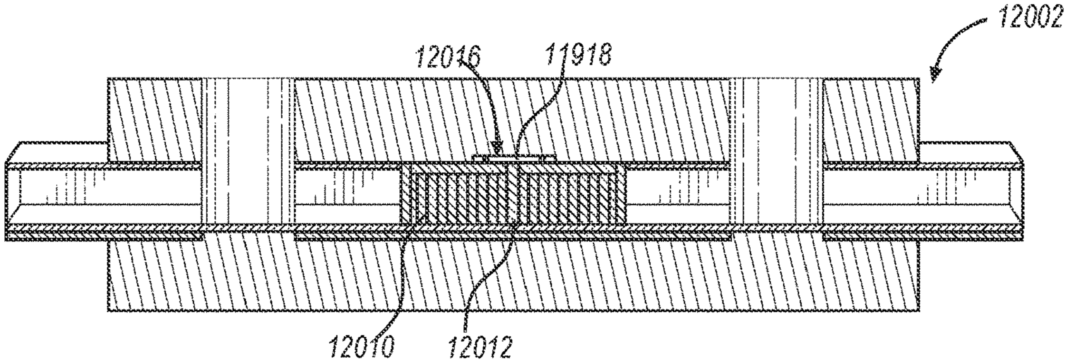
Figure 120C:
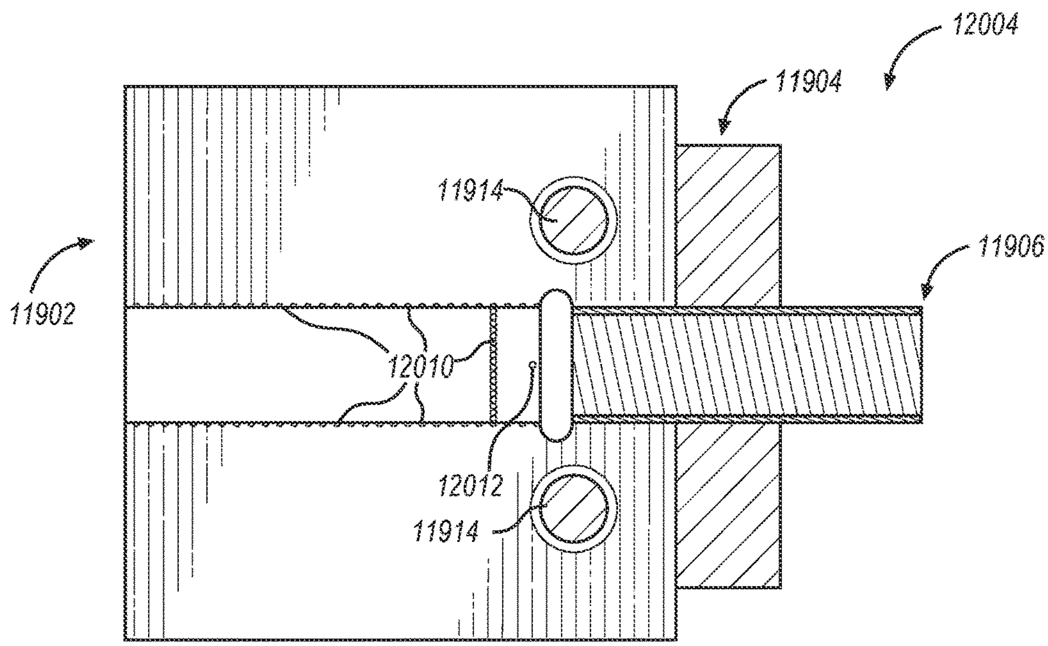

FIG. 120A, FIG. 120B, and FIG. 120C illustrate various cross-sectional views of the waveguide transitioning structure of FIGS. 119A-119B according to some aspects.

Figure 121A:
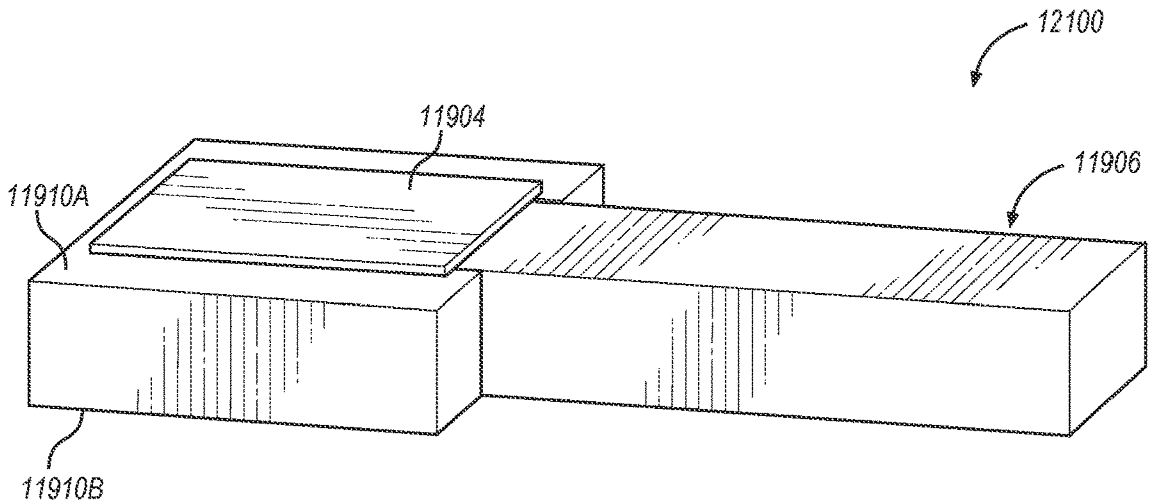
Figure 121B:
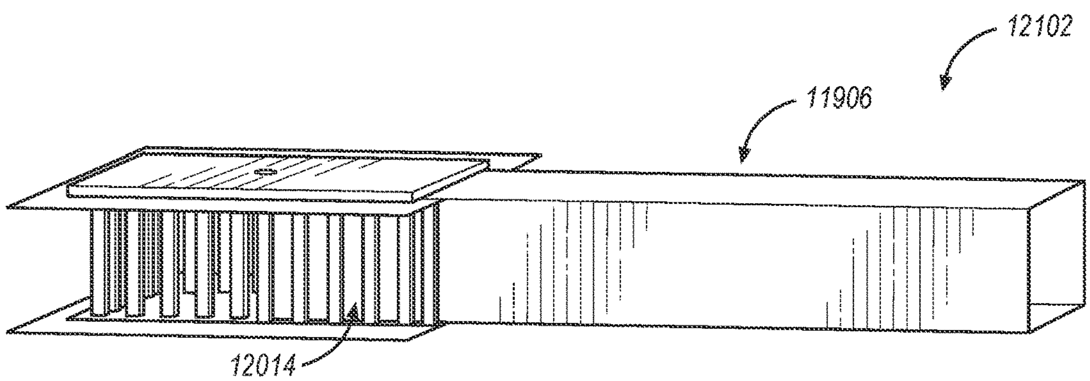
Figure 121C:
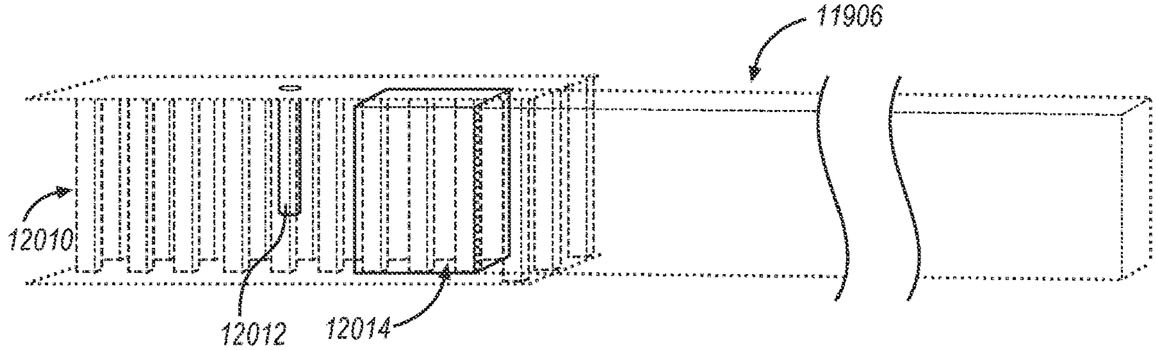

FIG. 121A, FIG. 121B, and FIG. 121C illustrate various perspective views of the waveguide transitioning structure of FIGS. 119A-119B including an exemplary impedance matching air cavity according to some aspects.

Figure 122:
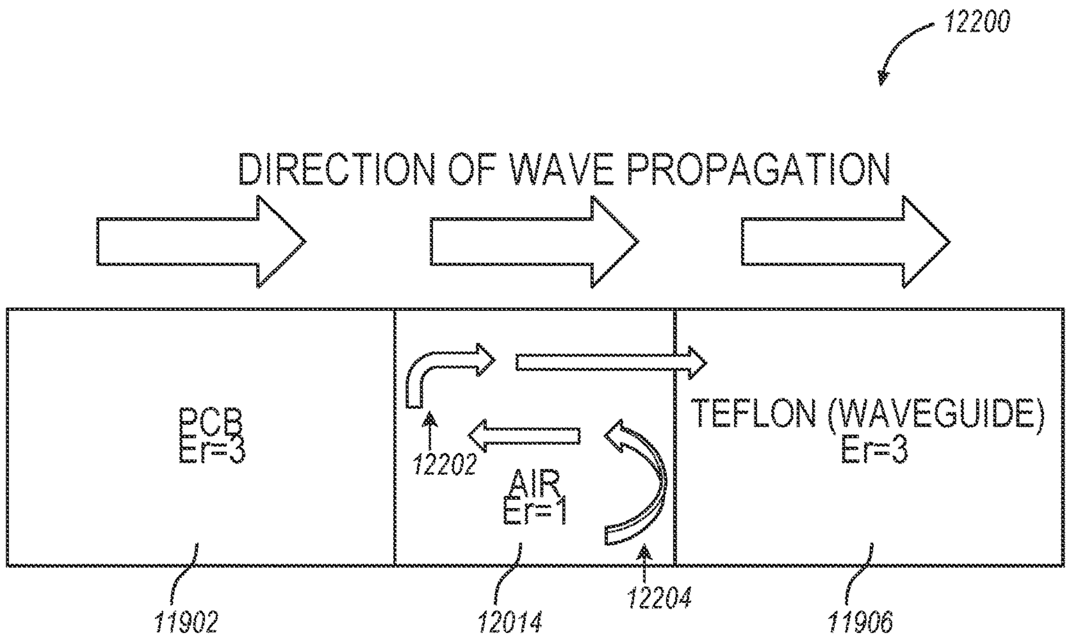

FIG. 122 illustrates another view of the air cavity when the PCB and the waveguide are mounted via the waveguide transitioning structure of FIGS. 119A-119B according to some aspects.

Figure 123:
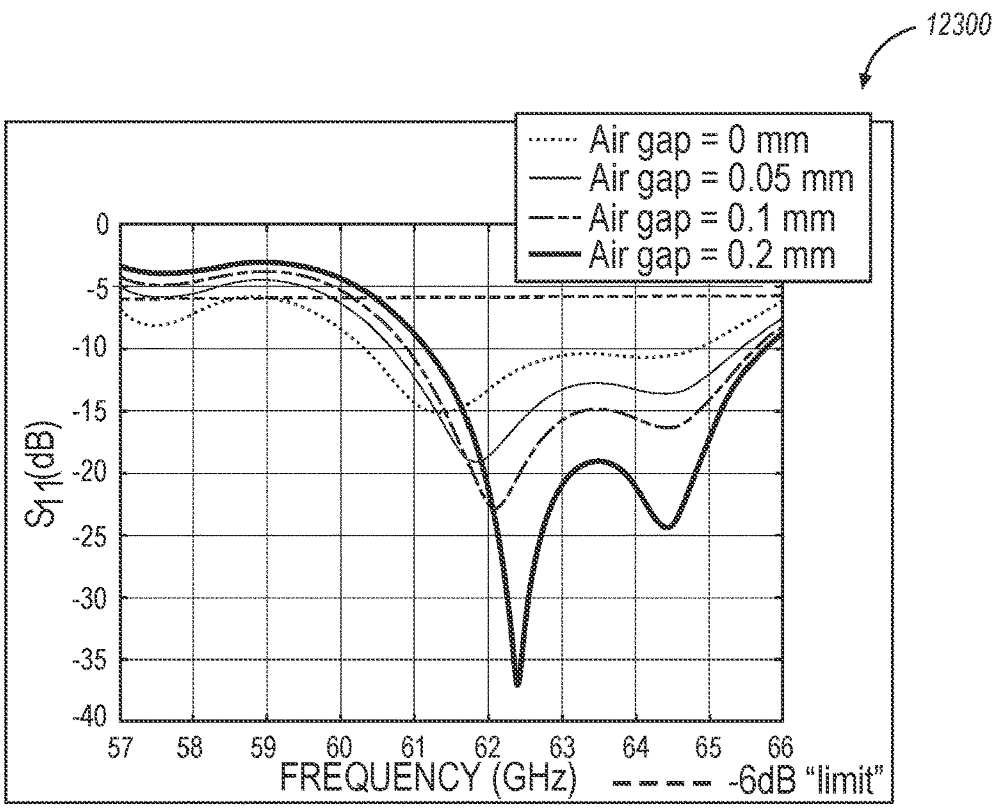

FIG. 123 illustrates a graphical representation of simulation results of reflection coefficient values in relation to air gap width according to some aspects.

Figure 124:
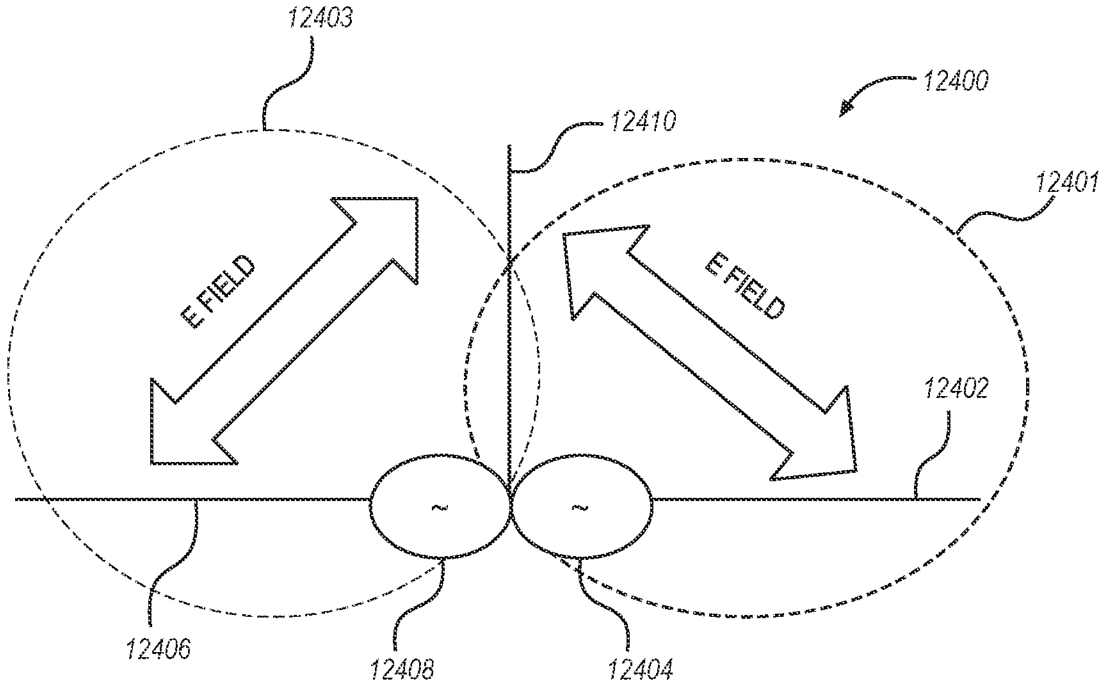

FIG. 124 illustrates an exemplary dual polarized antenna structure, according to some aspects.

Figure 125A:
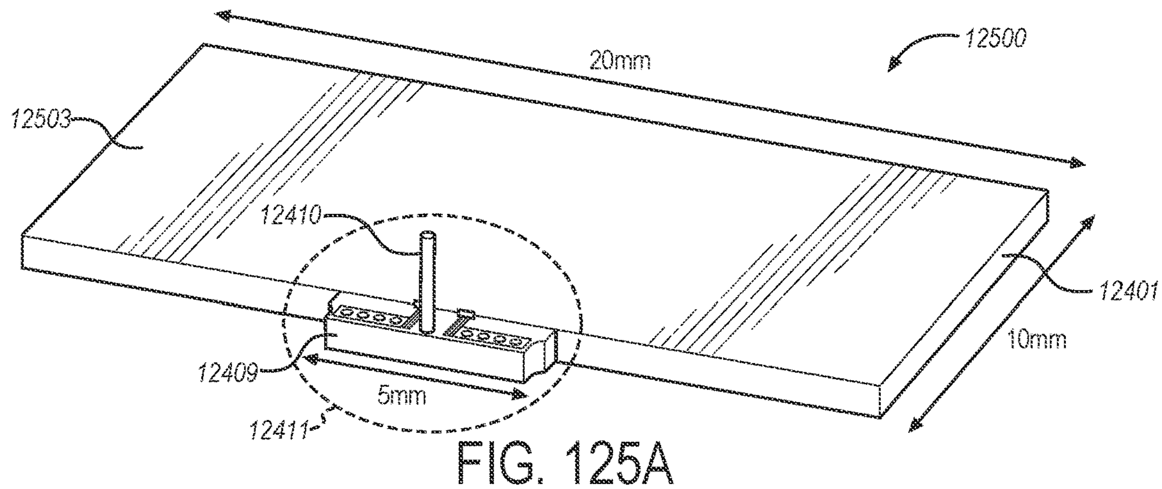
Figure 125B:
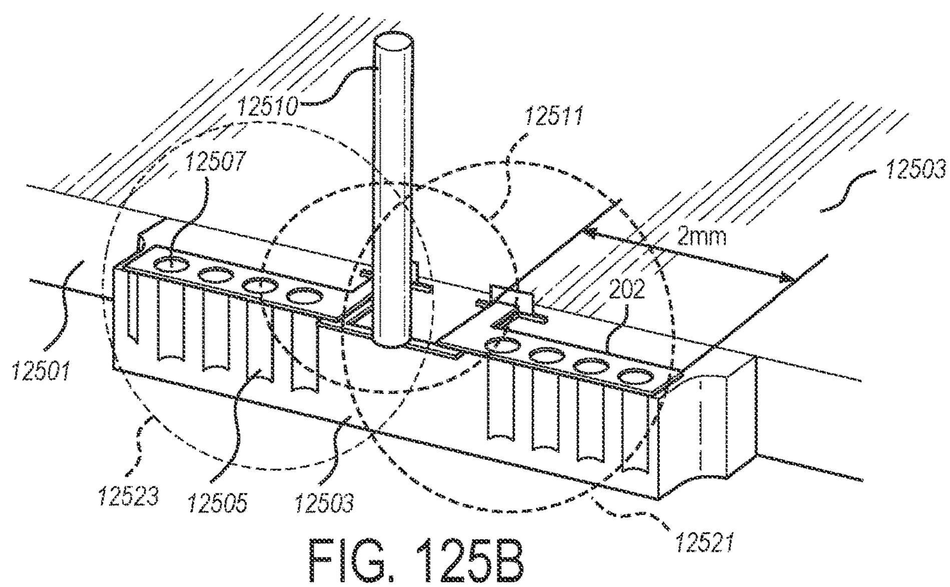
Figure 125C:
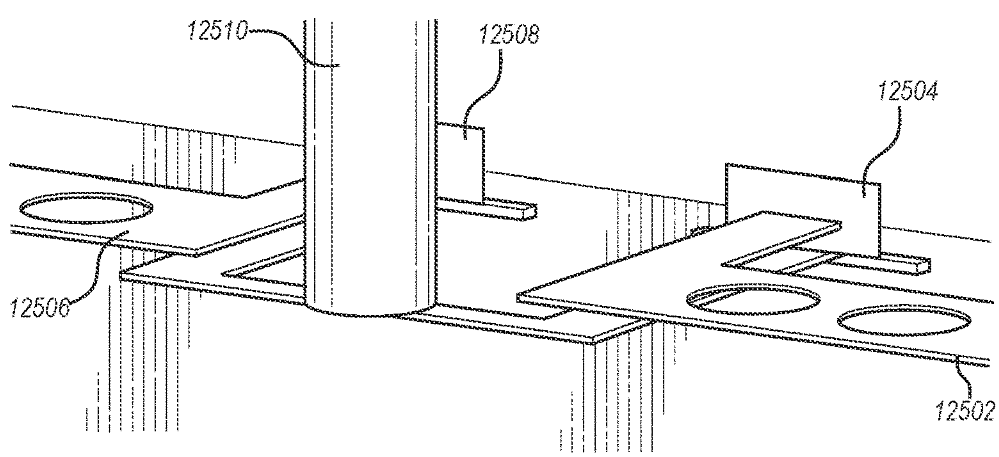

FIGS. 125A through 125C illustrate an exemplary dual polarized antenna structure implemented on a multilayer PCB, according to some aspects.

Figure 126:
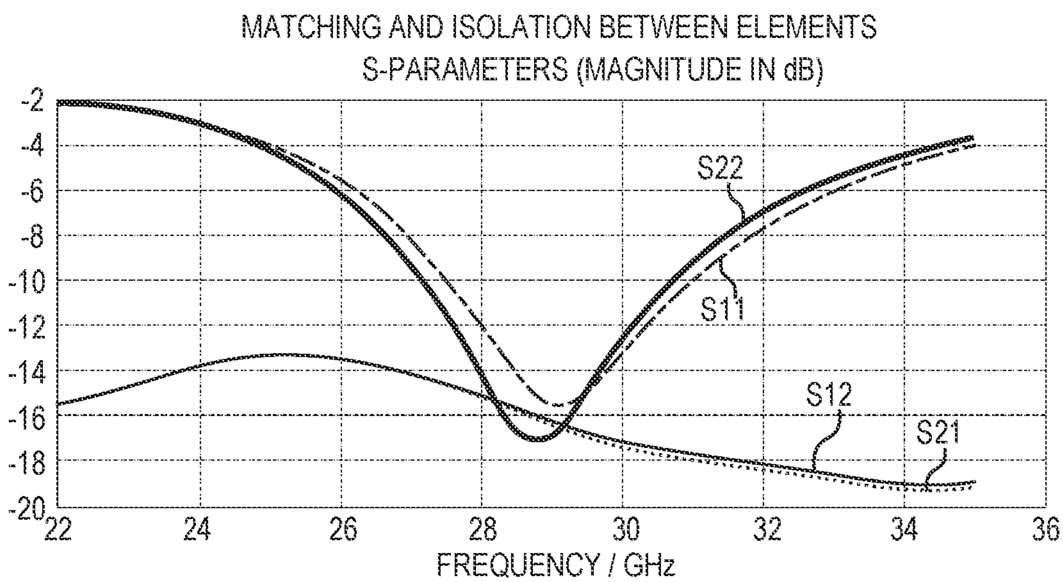

FIG. 126 illustrates Simulated S-parameters of the antenna structure illustrated in FIGS. 125A through 125C, according to some aspects.

Figure 127A:
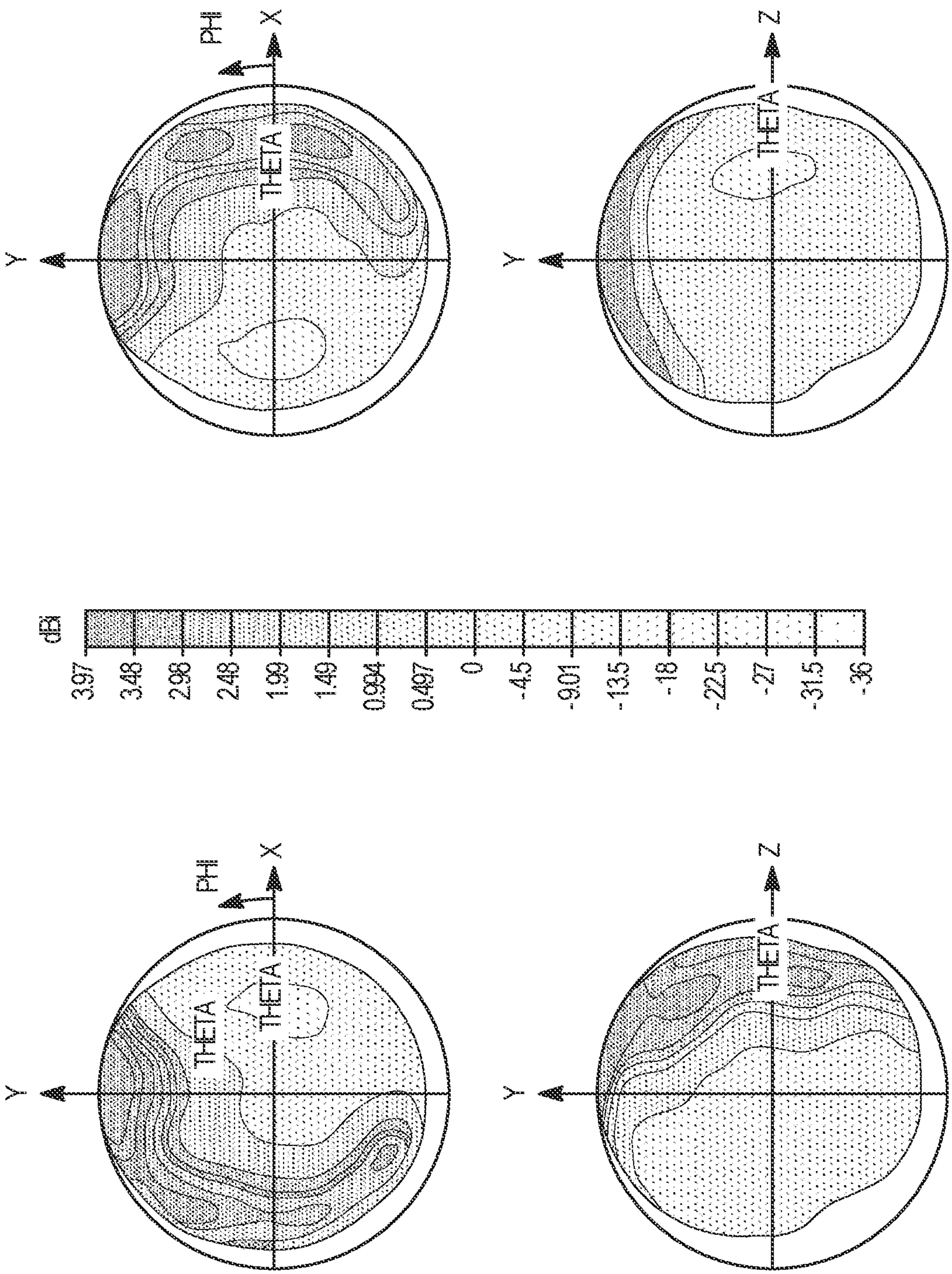
Figure 127B:
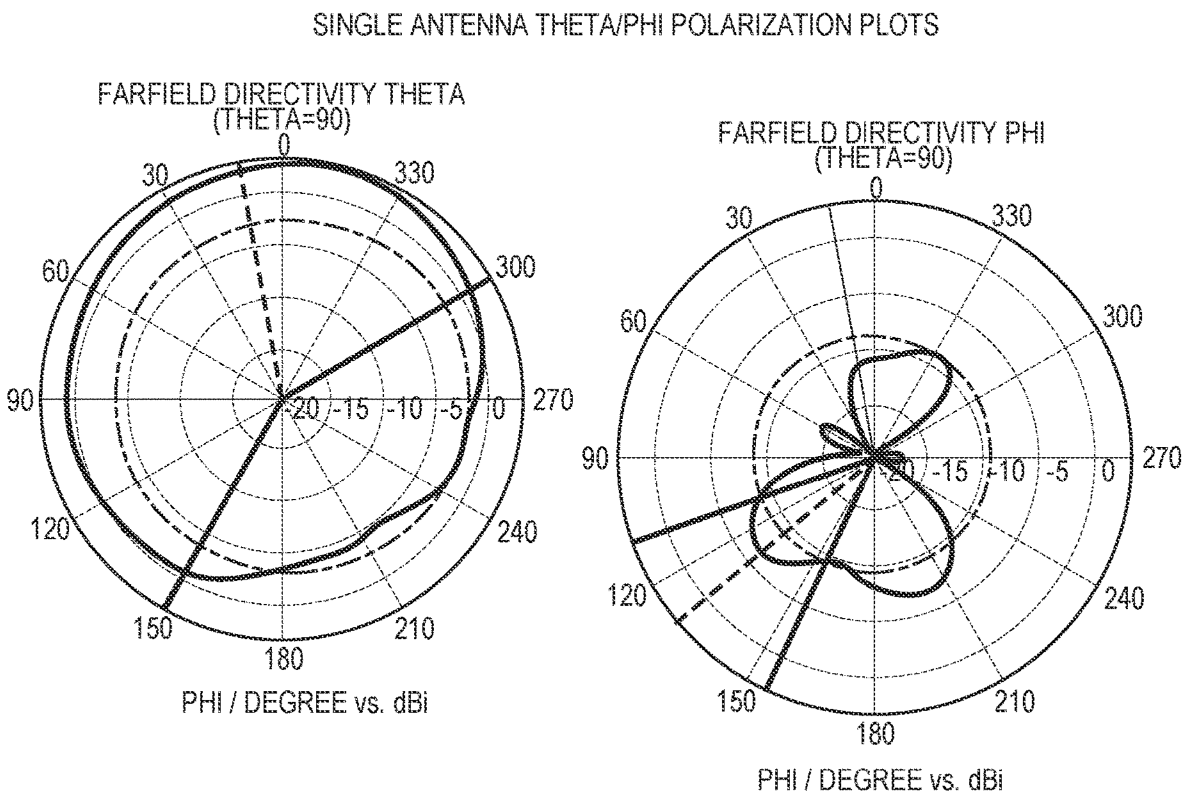

FIGS. 127A and 127B illustrate exemplary simulated far-field radiation patterns of the antenna structure illustrated in FIGS. 125A through 125C, according to some aspects.

Figure 128A:
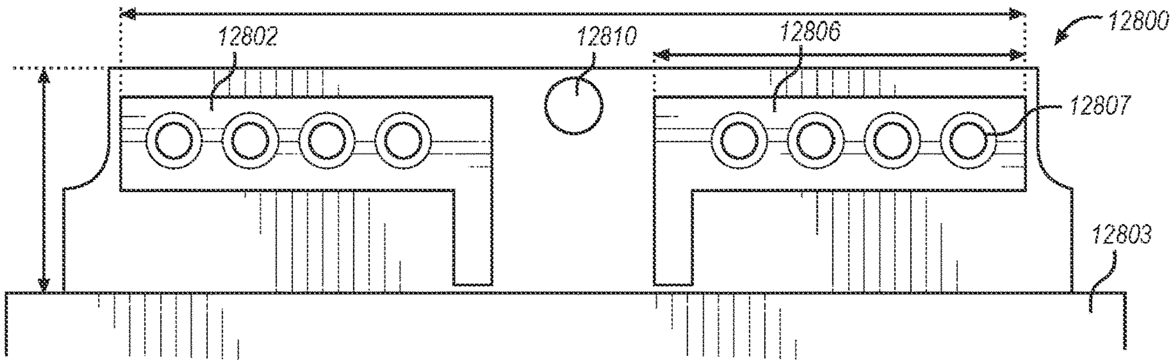

FIG. 128A illustrates a top view of the antenna structure of FIGS. 125A through 125C with surface wave holes drilled in one configuration, according to some aspects.

Figure 128B:
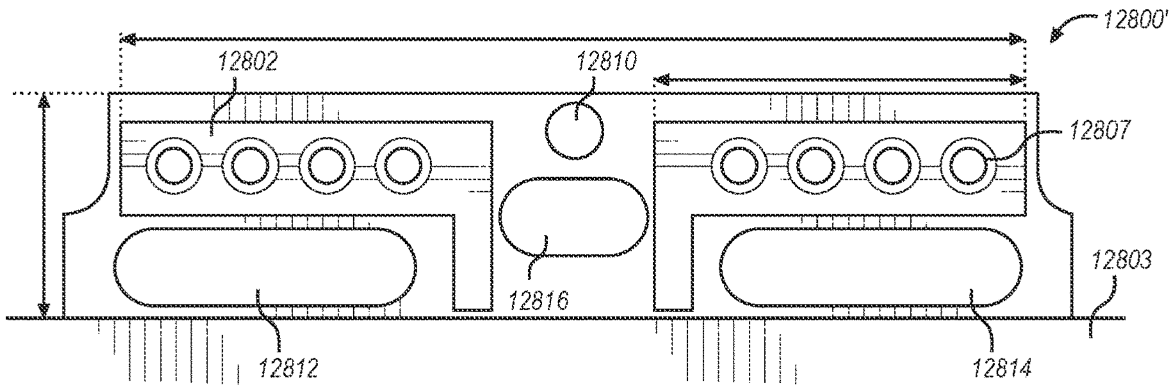

FIG. 128B illustrates a top view of the antenna structure of FIGS. 125A through 125C with surface wave holes drilled in another configuration, according to some aspects.

Figure 129:
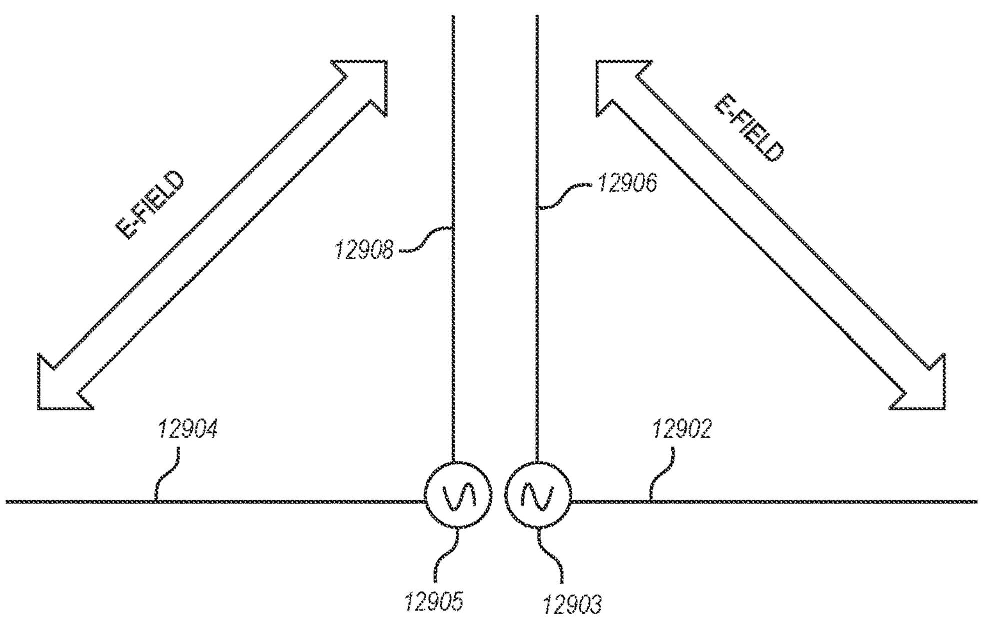

FIG. 129 illustrates an alternative implementation of an exemplary dual polarized antenna structure according to some aspects.

Figure 130A:
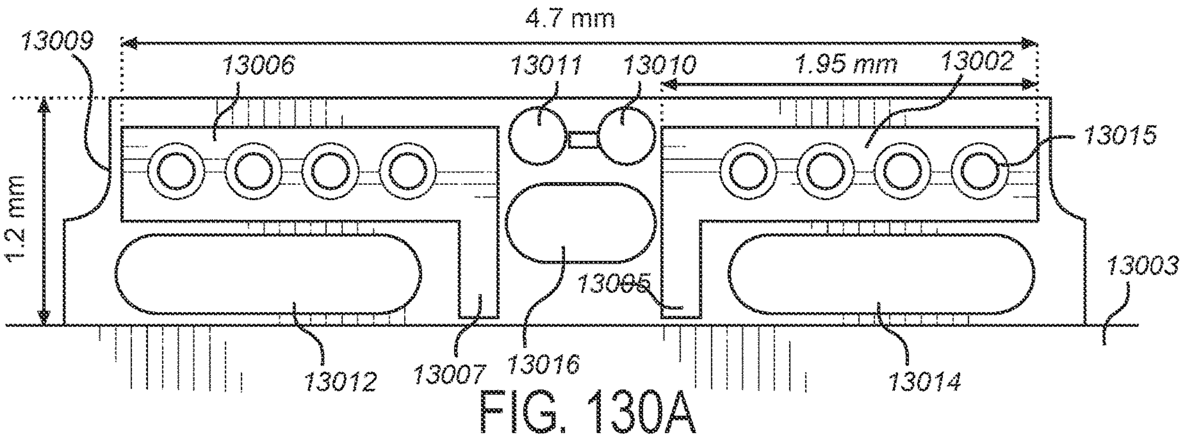

FIG. 130A illustrates a top view of the antenna of FIG. 129, according to some aspects.

Figure 130B:
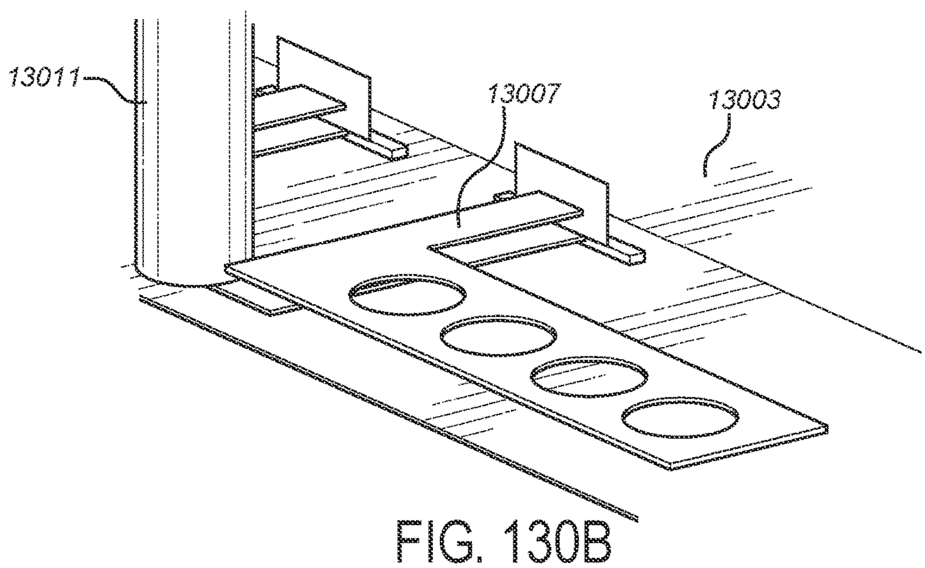
Figure 130C:
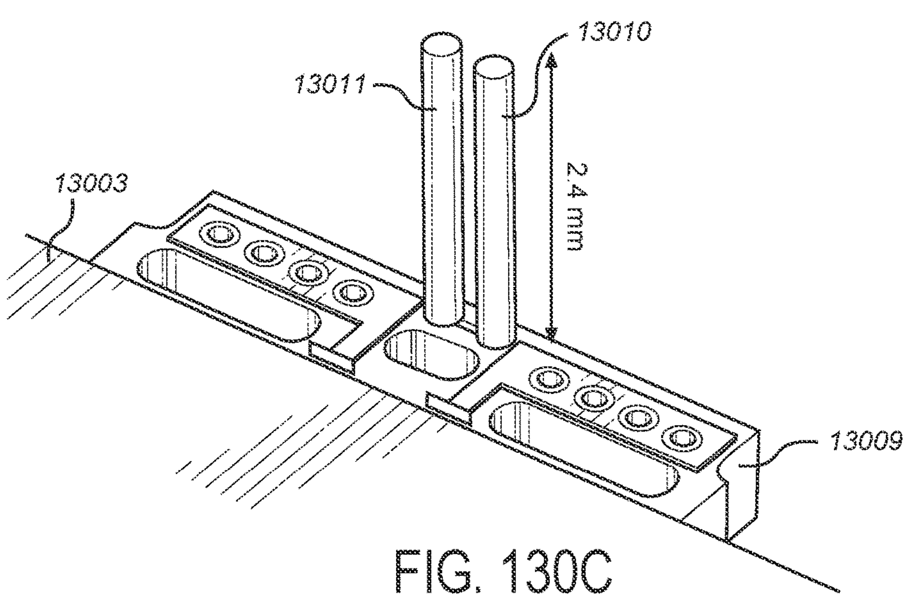

FIGS. 130B and 130C are perspective views of the antenna of FIG. 129, according to some aspects.

Figure 131A:
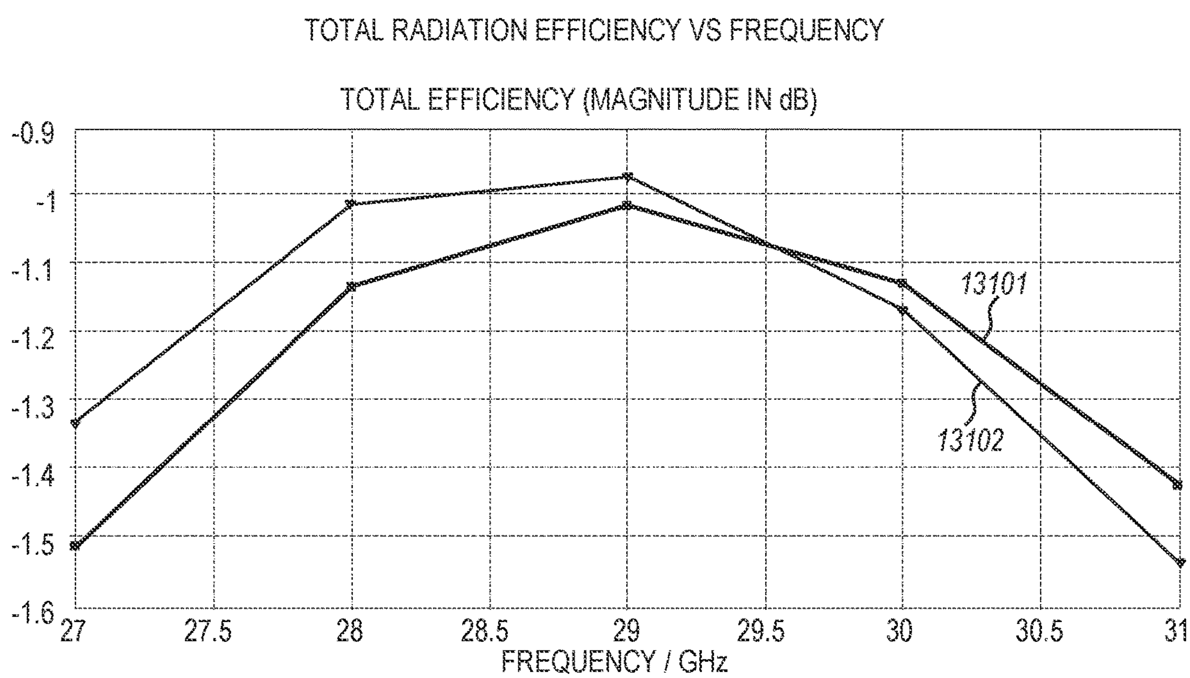

FIG. 131A illustrates a simulation of total radiation efficiency versus frequency for the antenna structures of FIGS. 130A through 130C, according to some aspects.

Figure 131B:
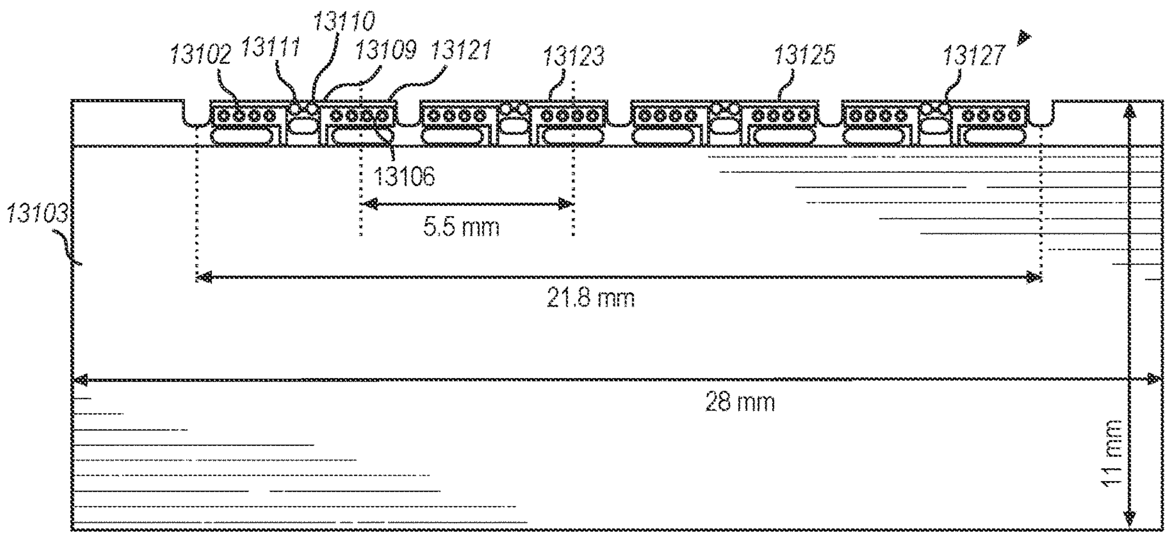

FIG. 131B illustrates a top view of an exemplary 4×1 array of antennas of the type illustrated in FIGS. 130A through 130C, according to some aspects.

Figure 131C:
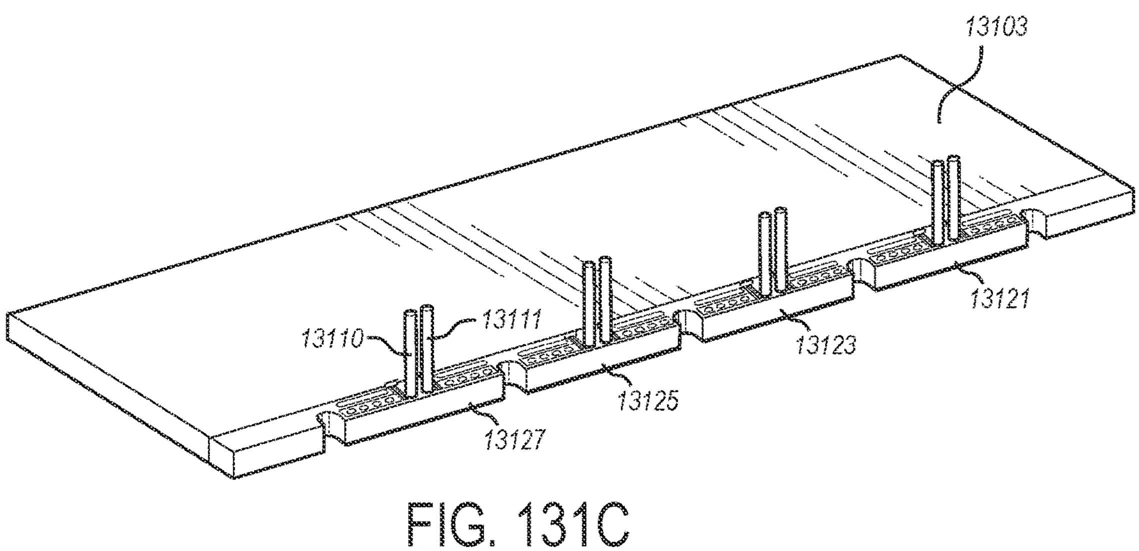

FIG. 131C is a perspective view of the 4×1 array of antennas of the type illustrated in FIG. 131B, according to some aspects.

Figure 131D:
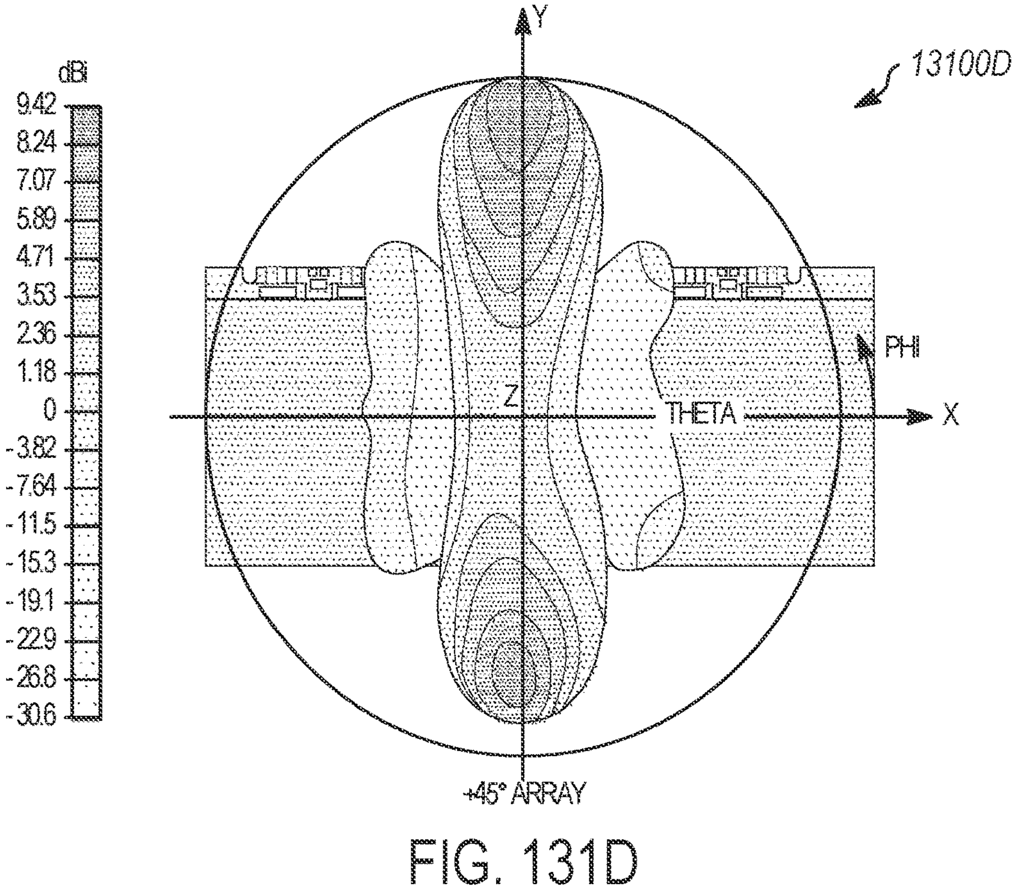
Figure 131E:
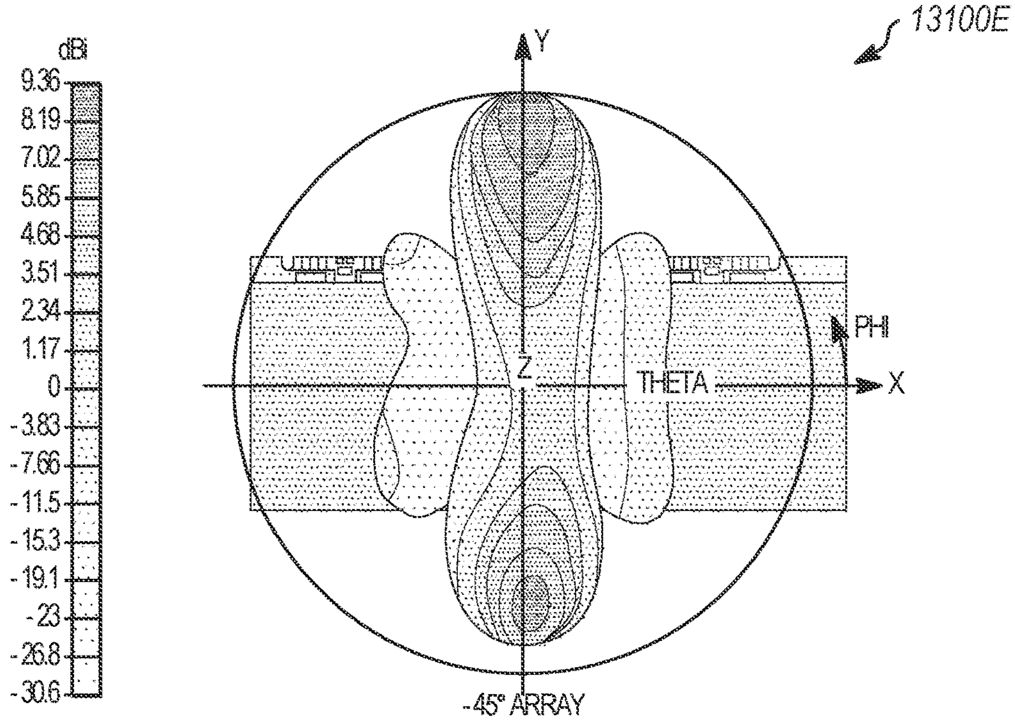

FIGS. 131D and 131E illustrate exemplary simulation radiation patterns of the 4×1 antenna array of FIGS. 131B and 131C, a 0° phasing, according to some aspects.

Figure 131F:
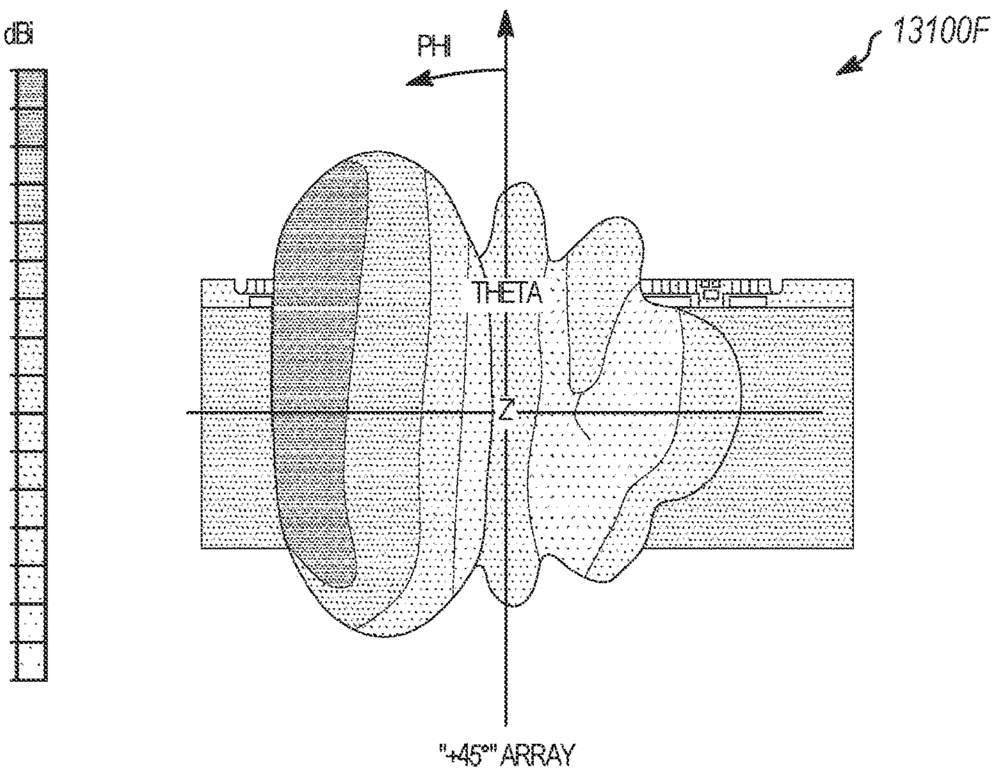
Figure 131G:
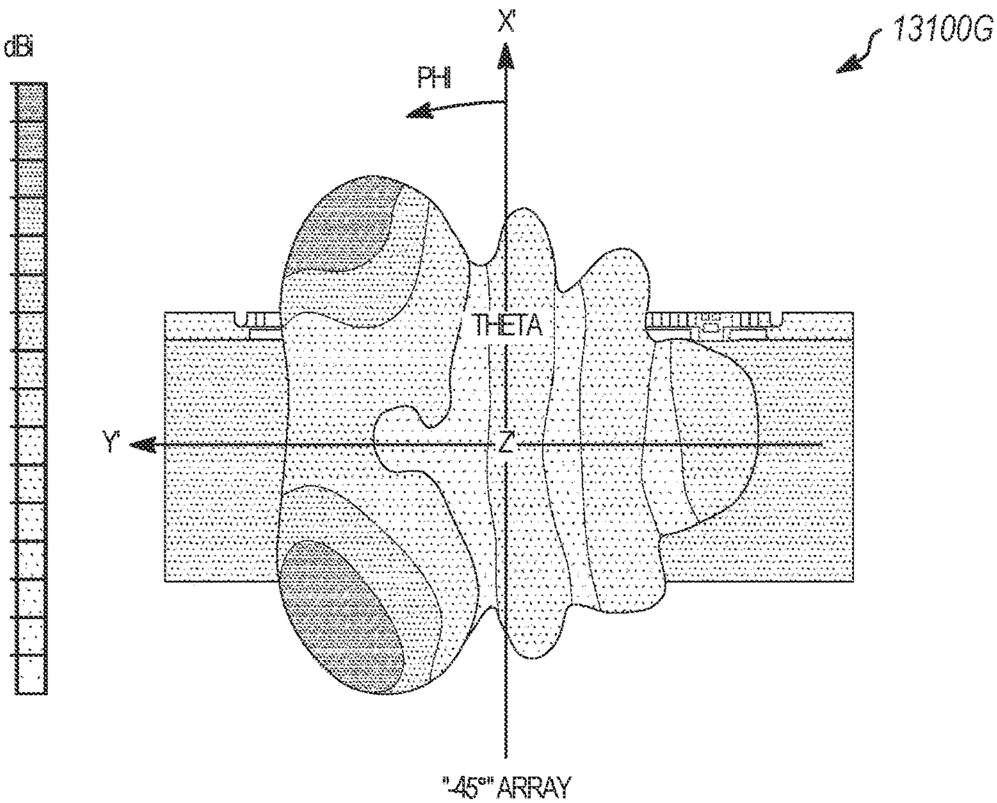

FIGS. 131F and 131G illustrate exemplary simulation radiation patterns of the 4×1 antenna array of FIGS. 131B and 131C, a 120° phasing, according to some aspects.

Figure 132:
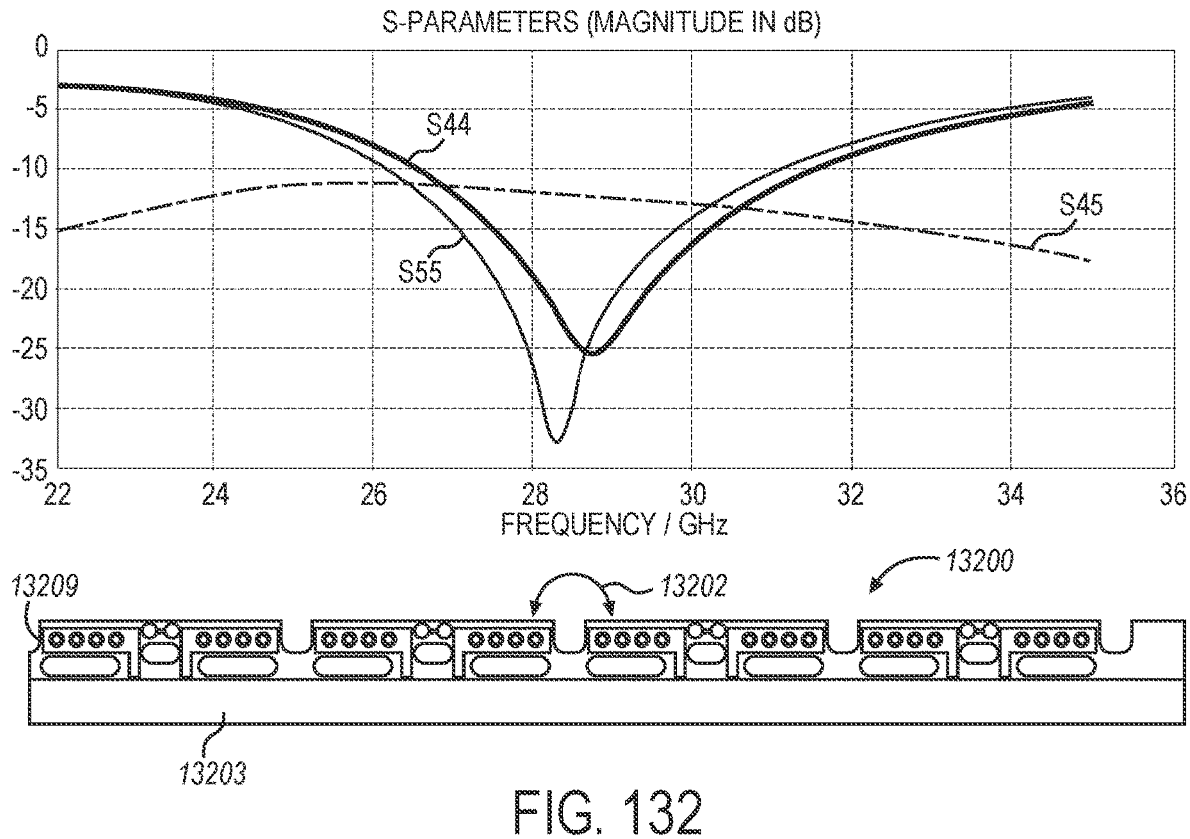

FIG. 132 illustrates an exemplary simulation of worst case coupling between neighboring elements of the antenna array of FIGS. 131B and 131C, according to some aspects.

Figure 133:
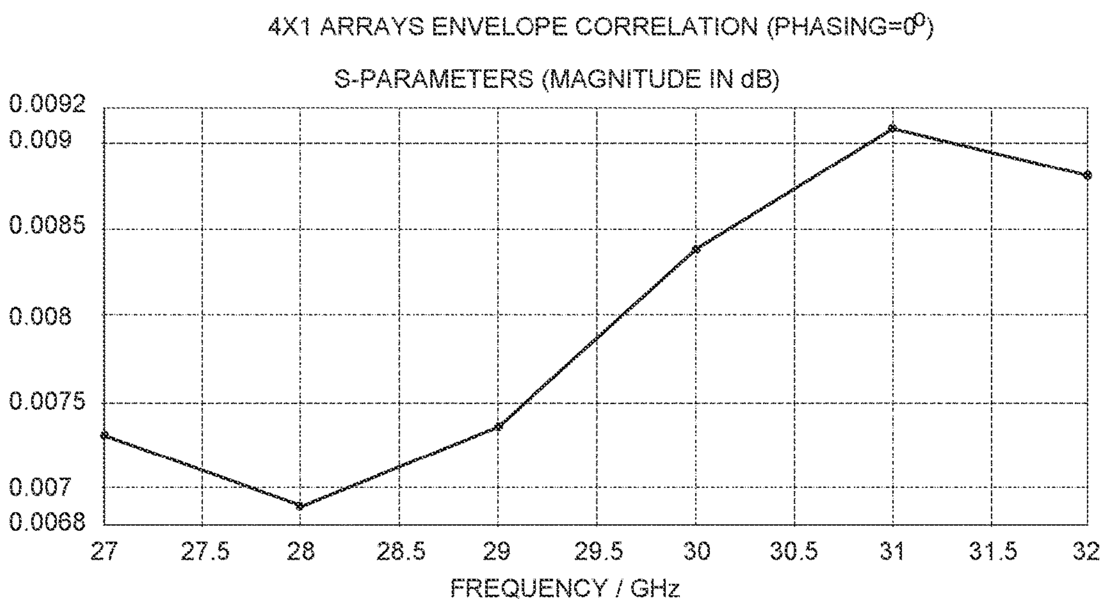

FIG. 133 illustrates envelope correlation for the 4×1 antenna array of FIGS. 131B and 131C at 0° degree phasing, according to some aspects.

Figure 134:
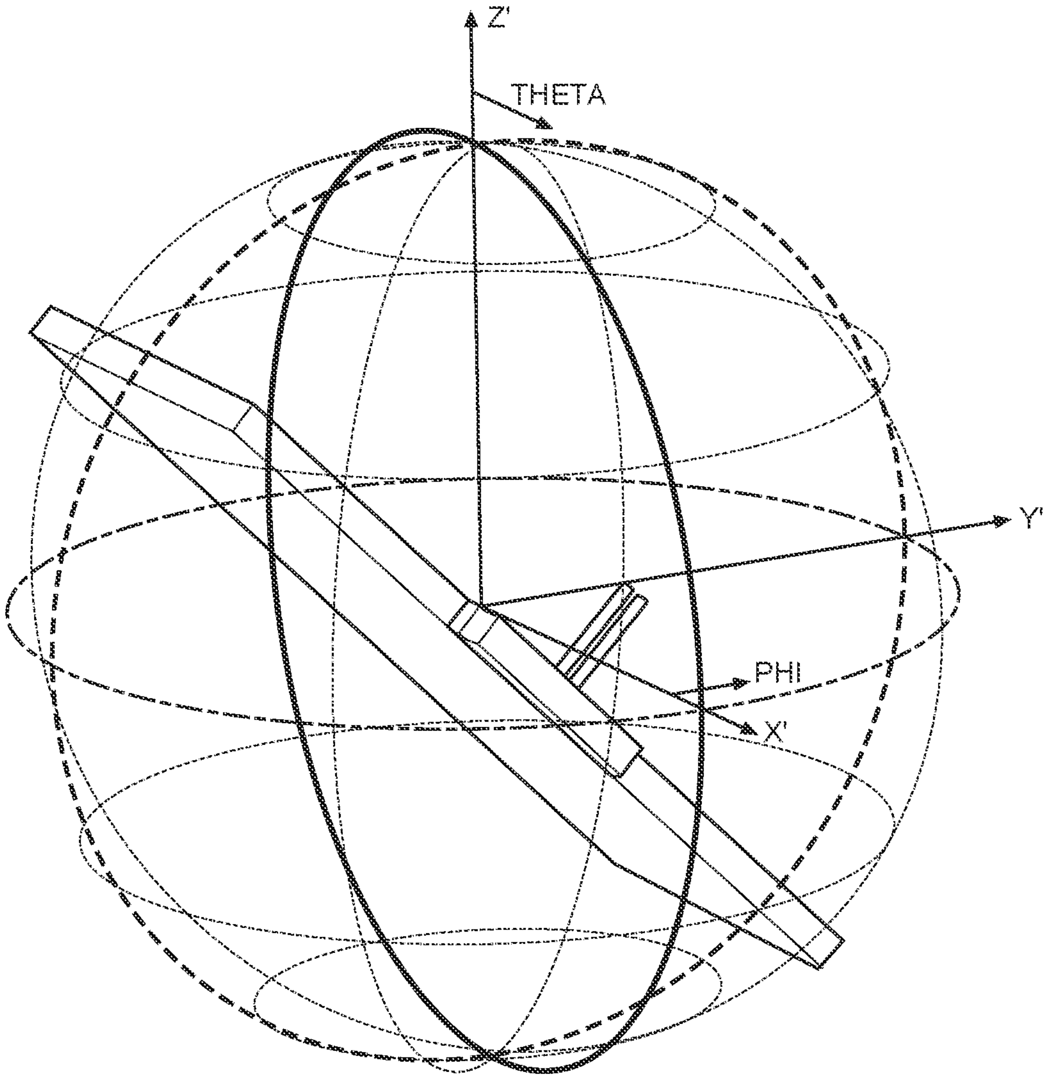

FIG. 134 illustrates the coordinate system for the polar simulation radiation patterns described below, according to some aspects.

Figure 135:
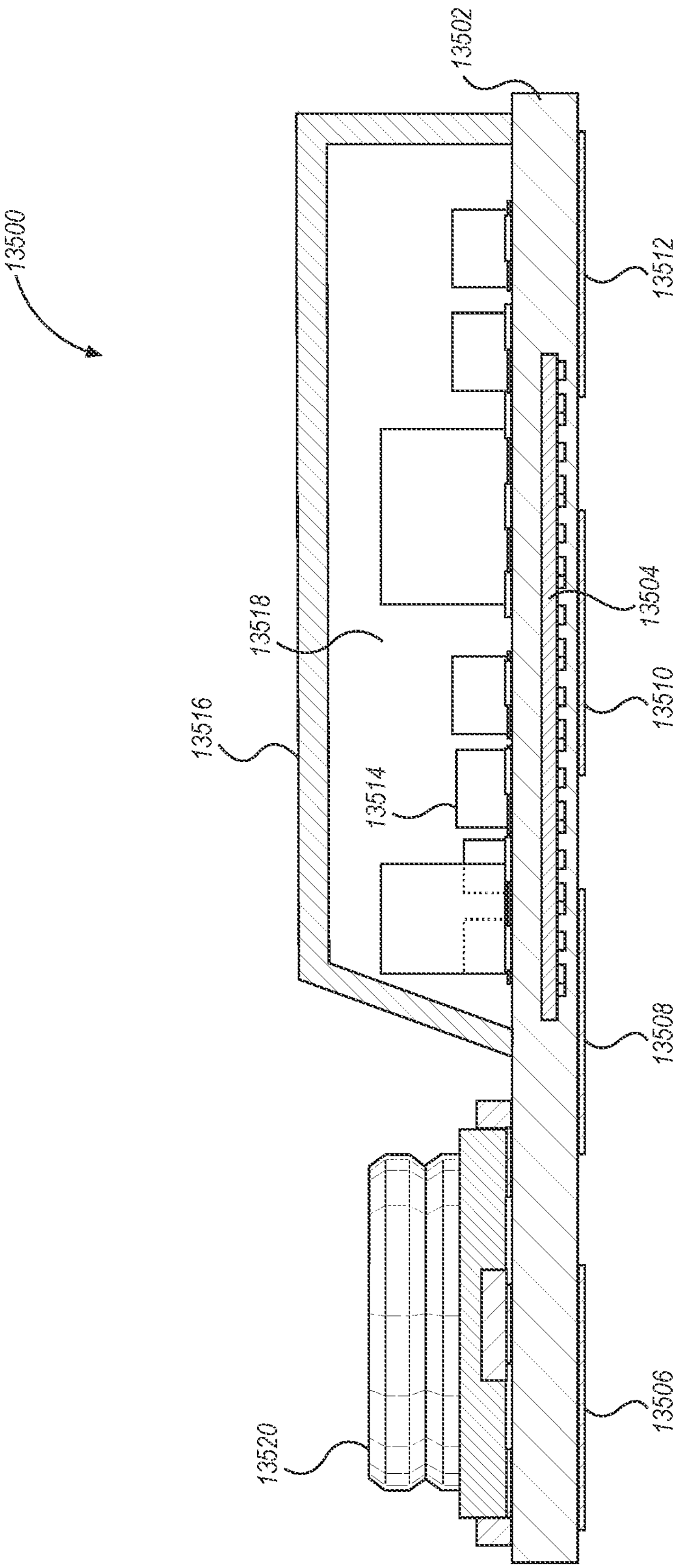

FIG. 135 illustrates an exemplary radio sub-system having a die embedded inside a primary substrate and shielded surface mounted devices above the primary substrate, according to some aspects.

Figure 136:
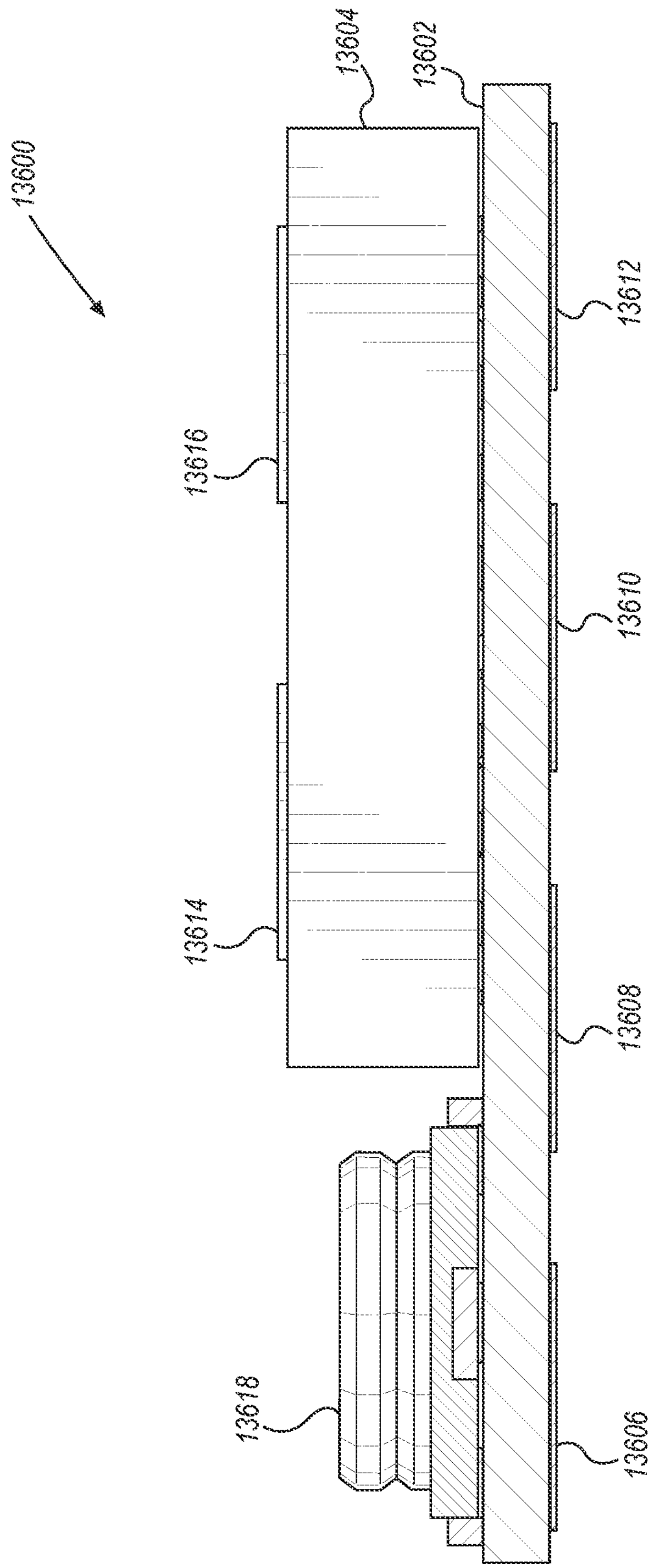

FIG. 136 illustrates an exemplary radio sub-system having a die and surface mounted devices placed above the primary substrate within a cavity in a secondary substrate, according to some aspects.

Figure 137:
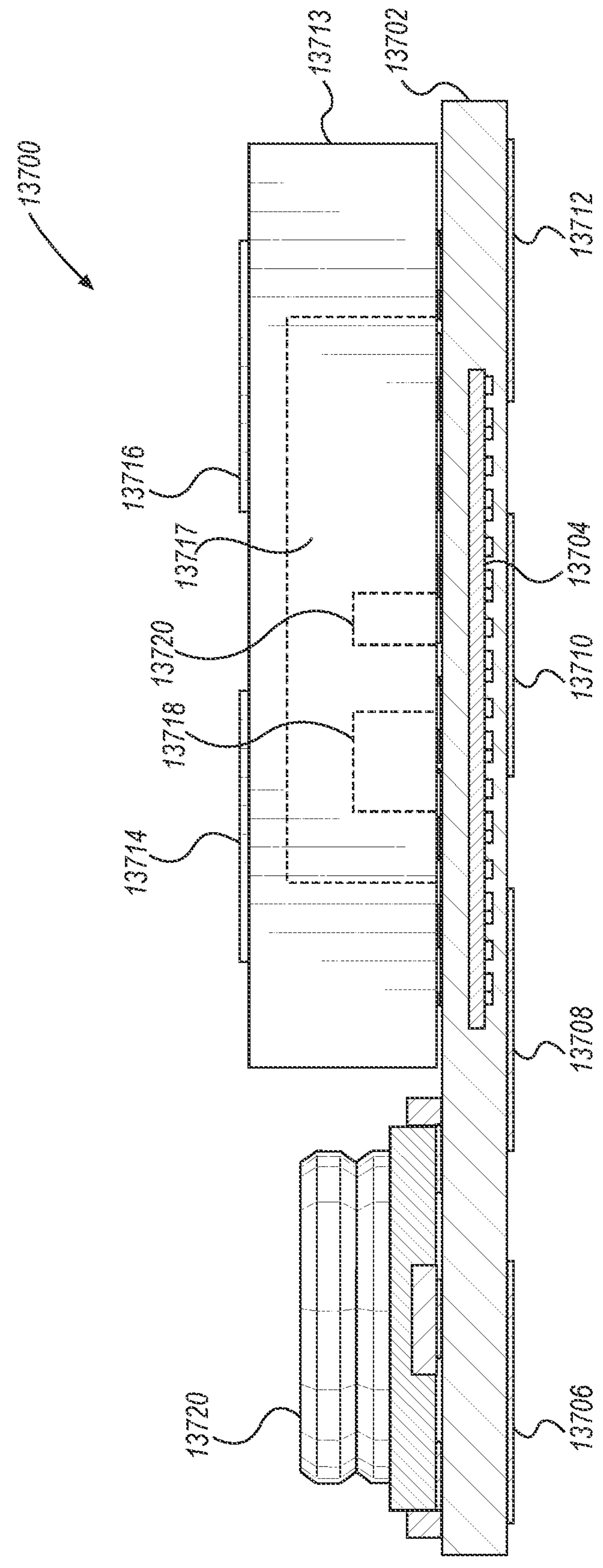

FIG. 137 illustrates an exemplary radio system package having a die embedded inside a primary substrate and surface mounted devices placed above the primary substrate within a cavity in a secondary substrate, according to some aspects.

Figure 138A:
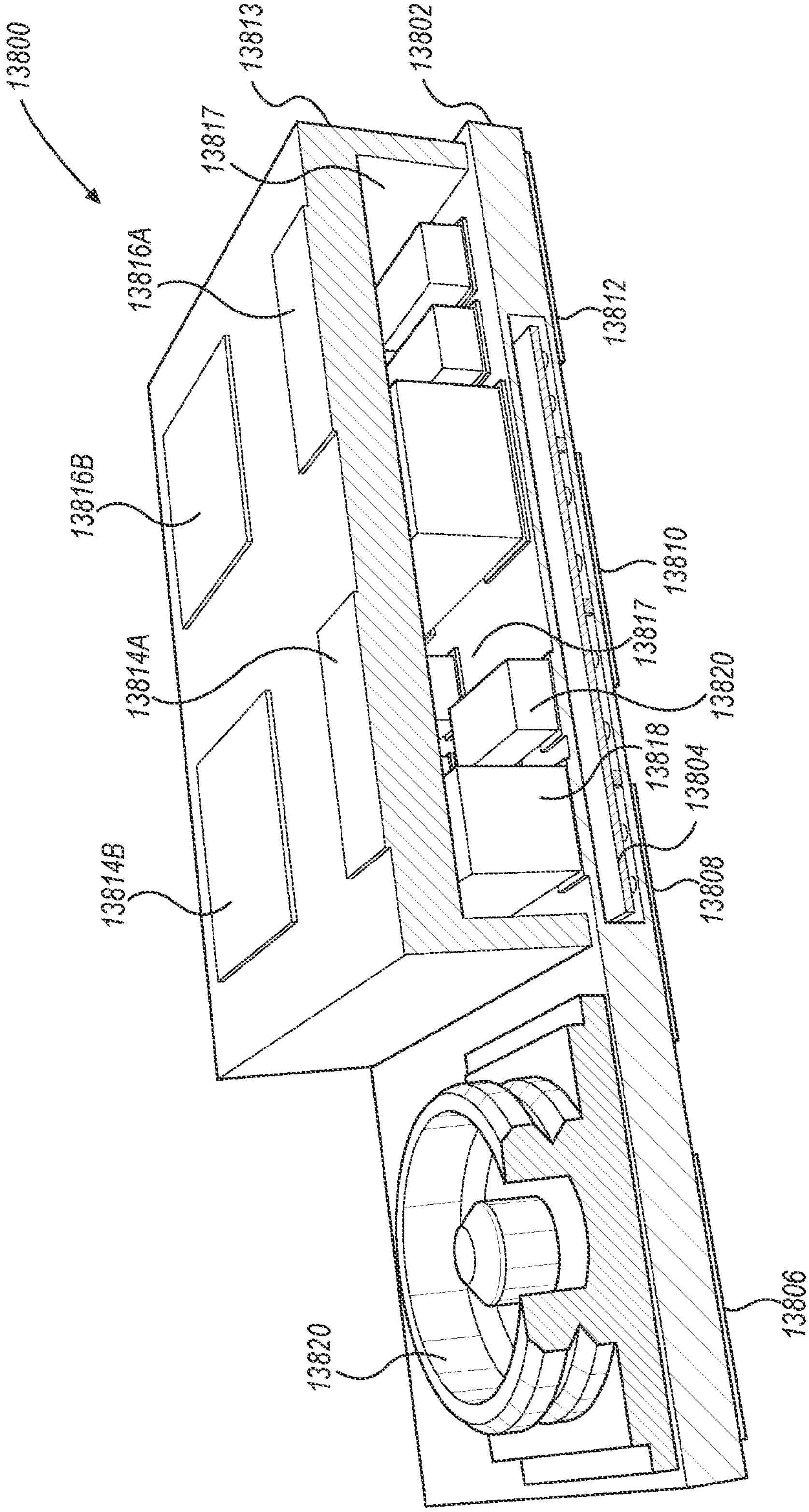

FIG. 138A is a perspective cut-away view of an exemplary radio system package having a die embedded inside a primary substrate and surface mounted devices placed above the primary substrate within a cavity in a secondary substrate, according to some aspects.

Figure 138B:
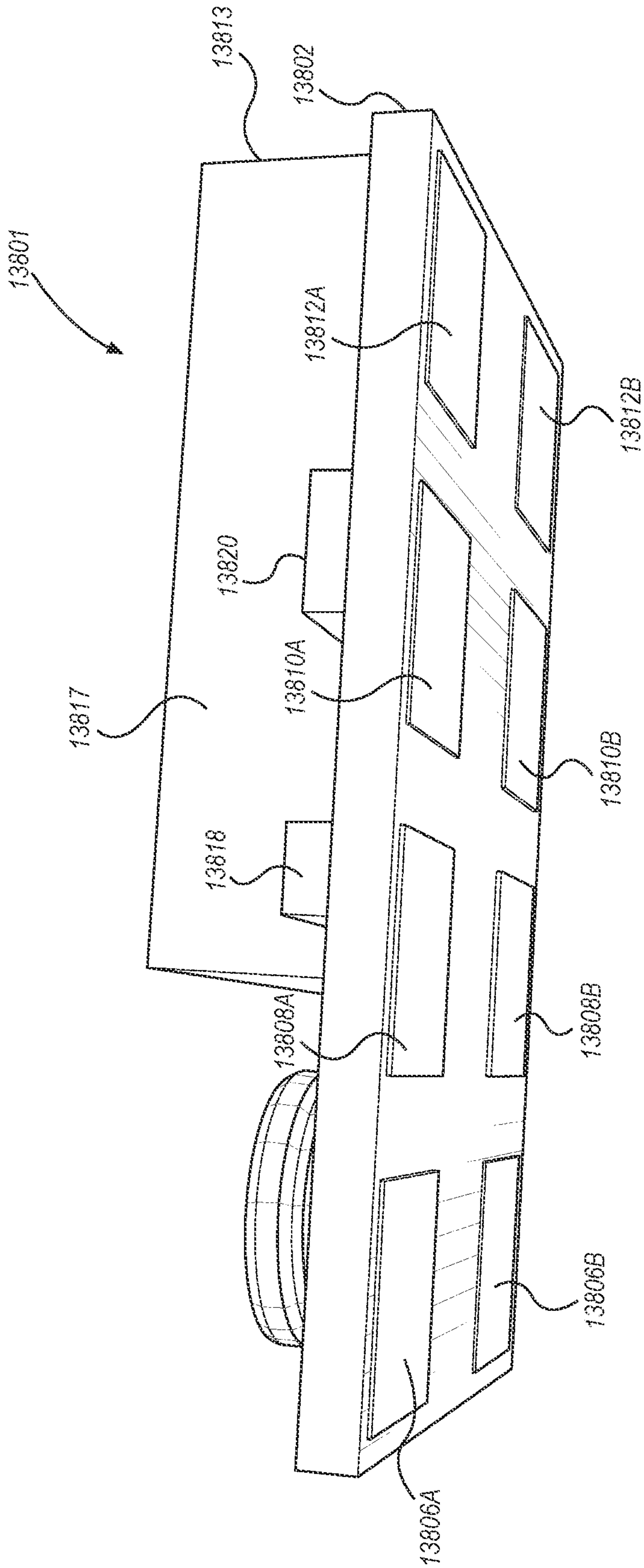

FIG. 138B is a perspective view of the radio system of FIG. 138A illustrating the bottom side of the primary substrate, according to some aspects.

Figure 139:
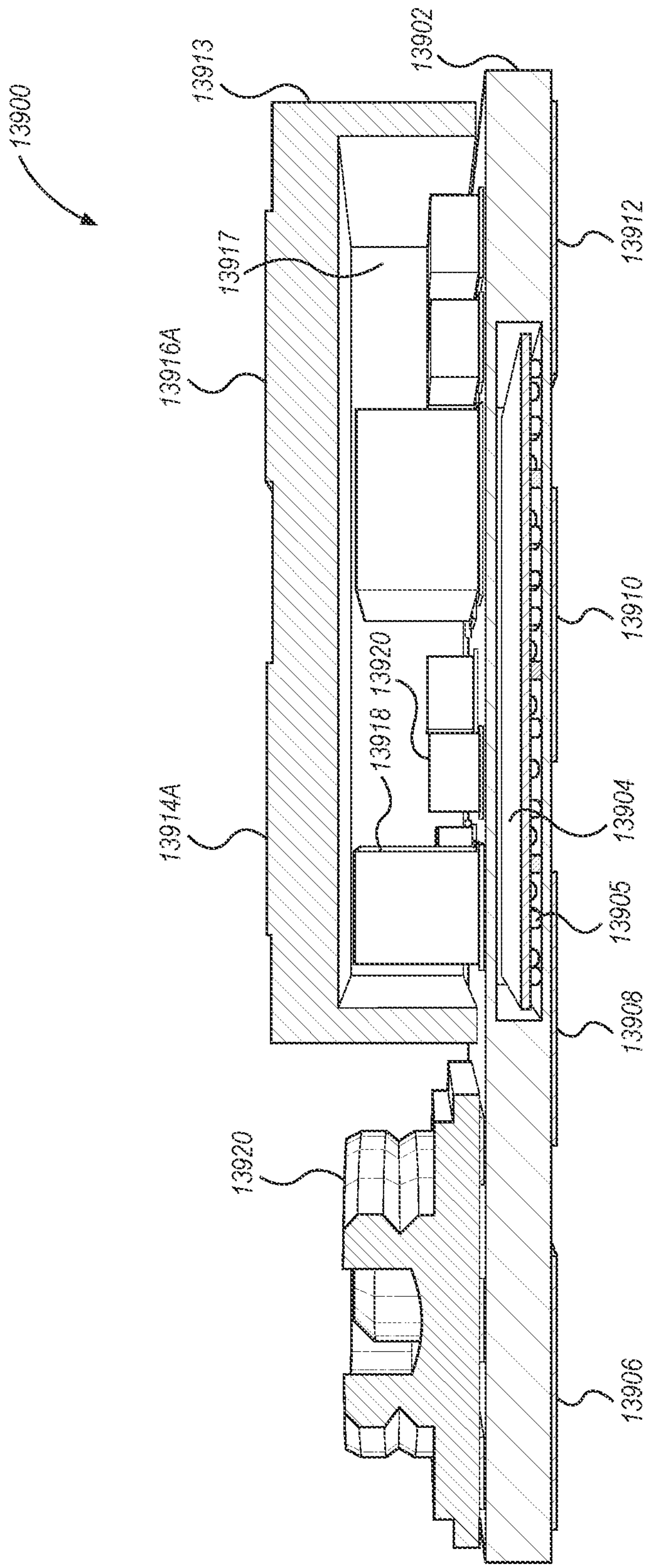

FIG. 139 is a perspective view of the radio system of FIG. 138A illustrating the inside of the secondary substrate, according to some aspects.

Figure 140A:
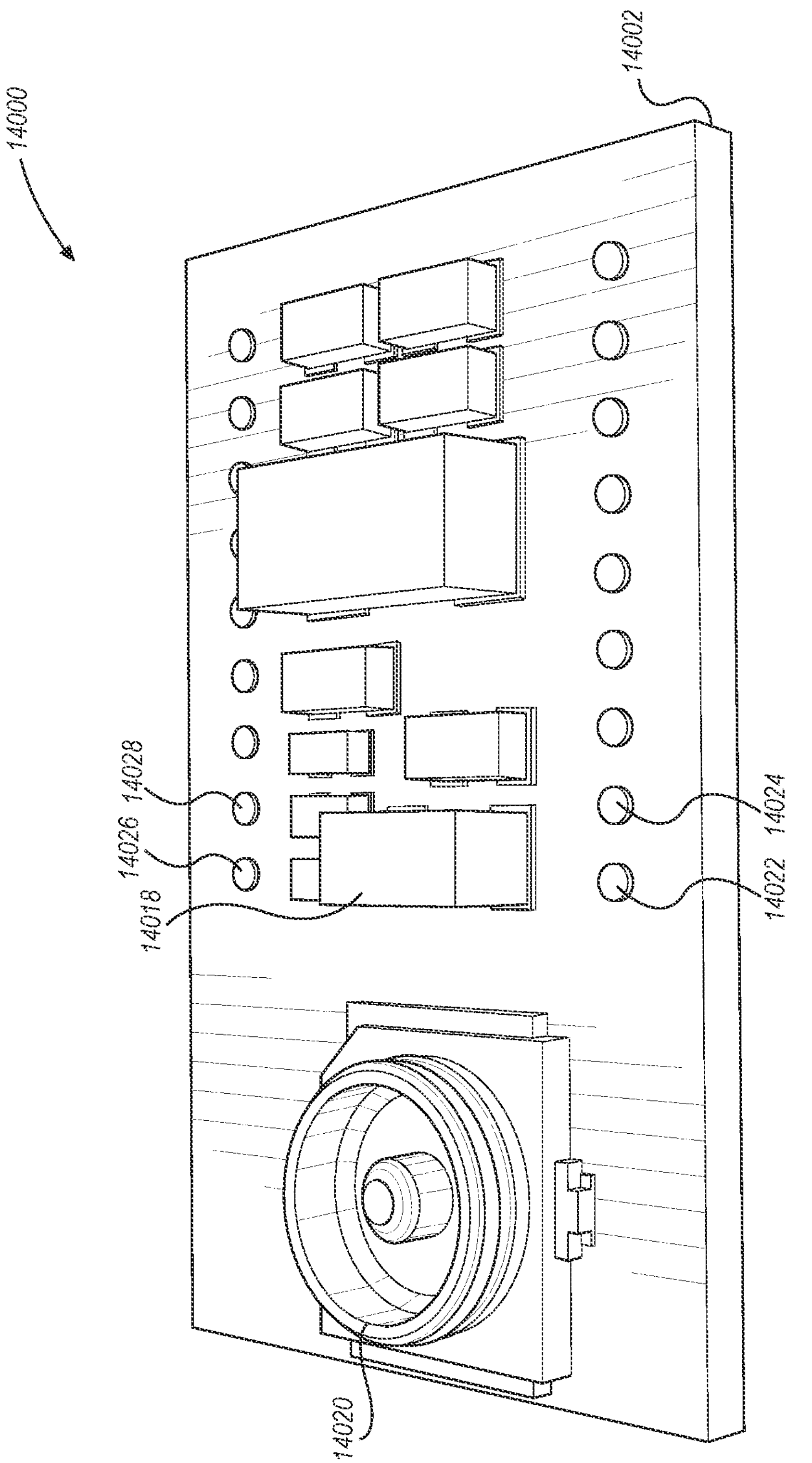

FIG. 140A is a partial perspective top view of the radio system of FIG. 138A illustrating solder contacts for mechanical connection or electrical connection, according to some aspects.

Figure 140B:
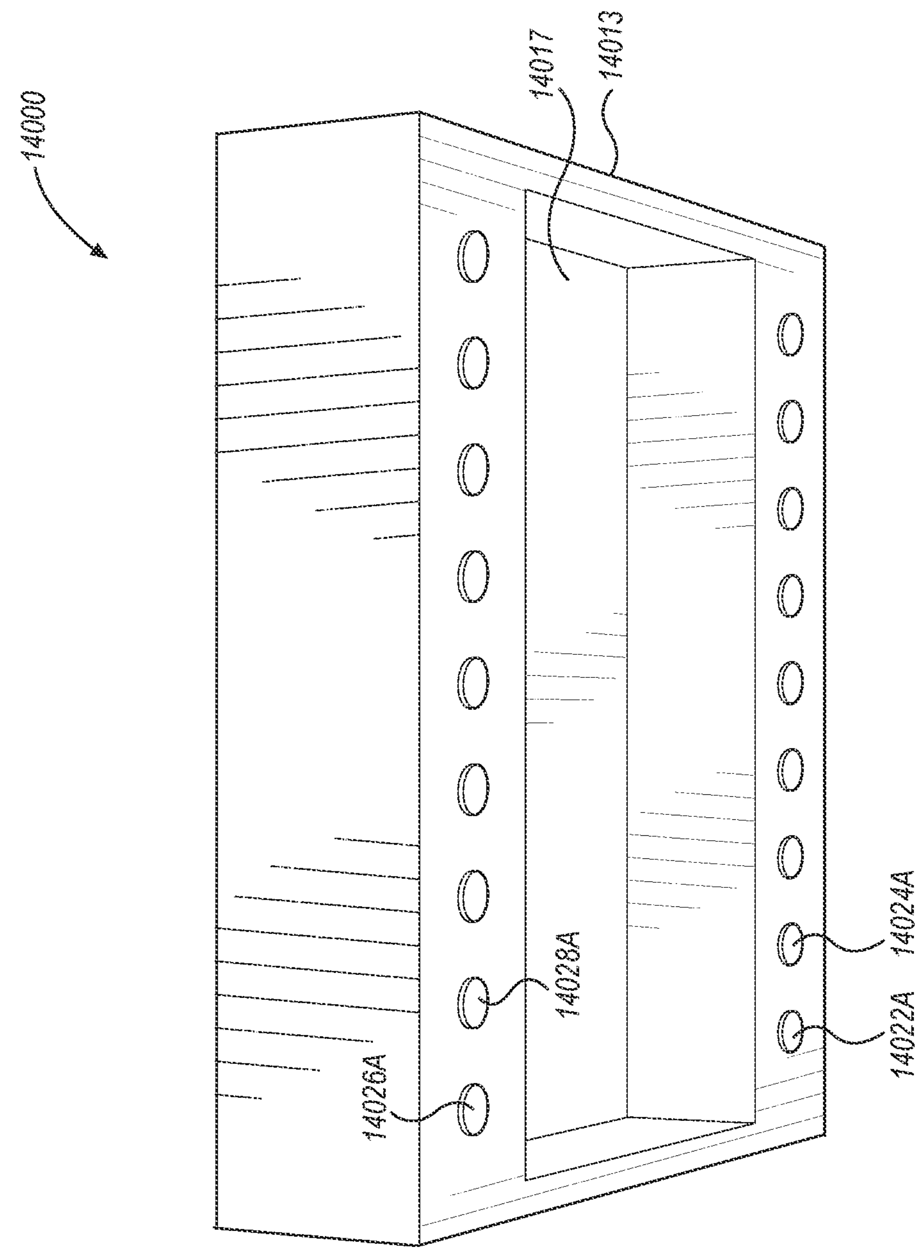

FIG. 140B is a partial perspective view of the radio system of FIG. 138A illustrating solder contacts configured on a secondary substrate to match the solder contacts of FIG. 140A, according to some aspects.

Figure 141A:
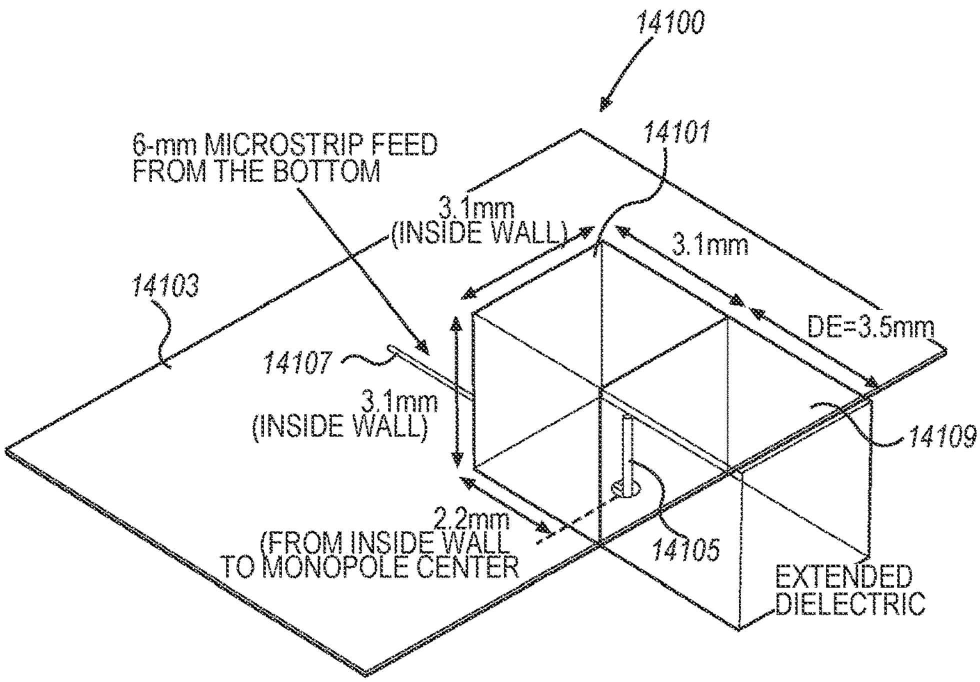

FIG. 141A illustrates an exemplary single element edge-fire antenna including a surface component attached to a PCB, according to an aspect.

Figure 141B:
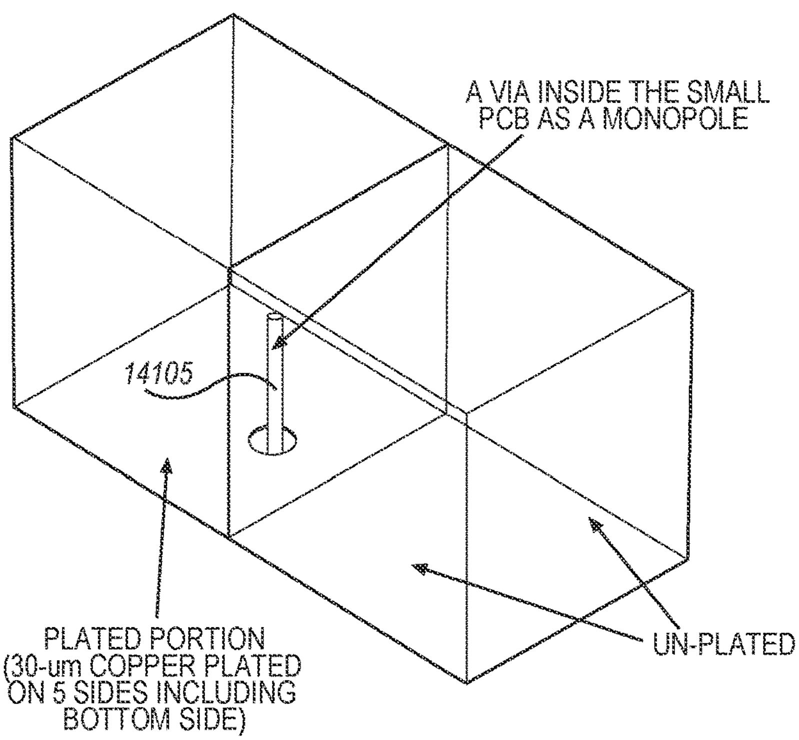

FIG. 141B illustrates placement and material details of the single element antenna of FIG. 141A, according to an aspect.

Figure 141C:
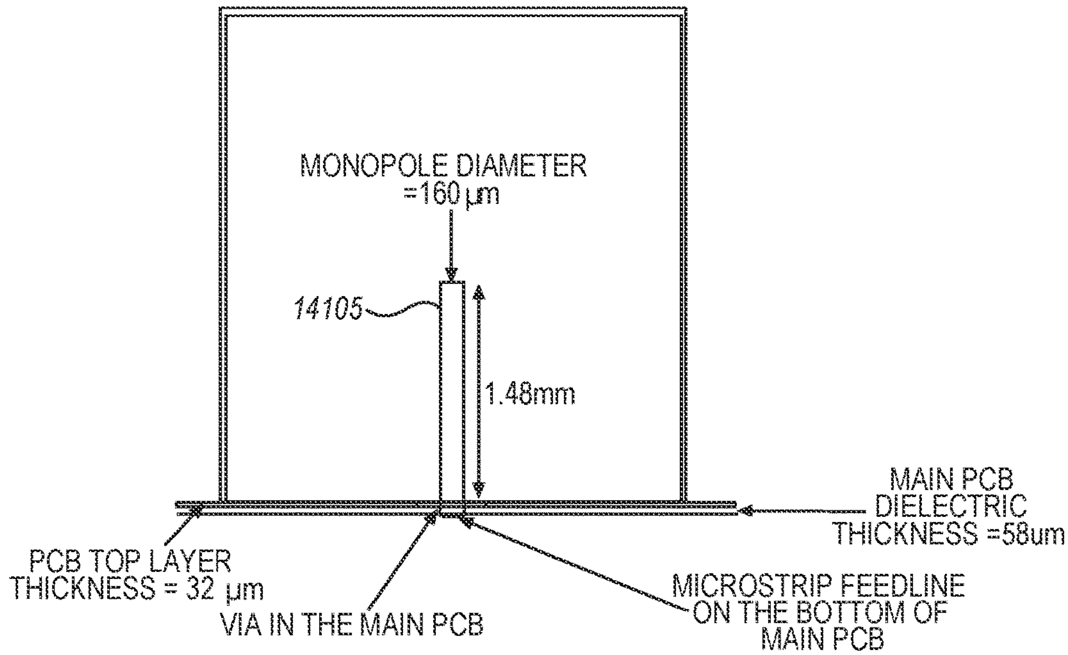

FIG. 141C illustrates an end view of the single element antenna illustrated in FIGS. 141A and 141B, according to an aspect.

Figure 141D:
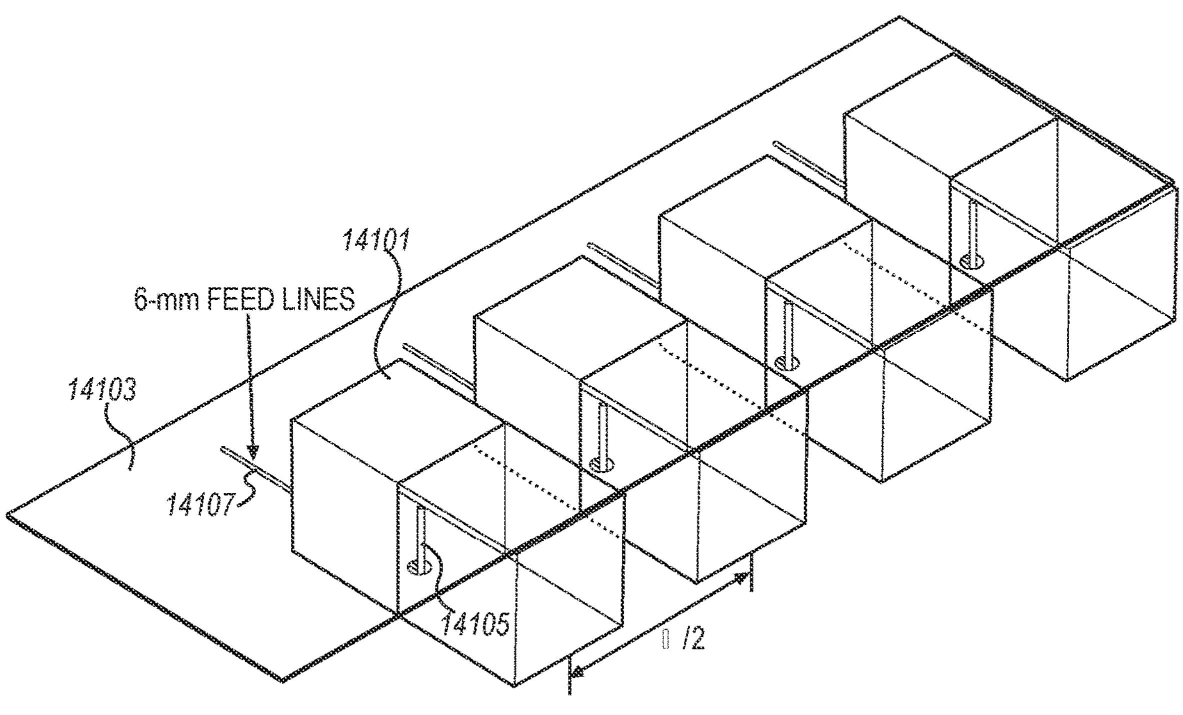

FIG. 141D illustrates an exemplary four-antenna element array including antenna elements of the type illustrated in FIGS. 141A and 141B, according to an aspect.

Figure 142:
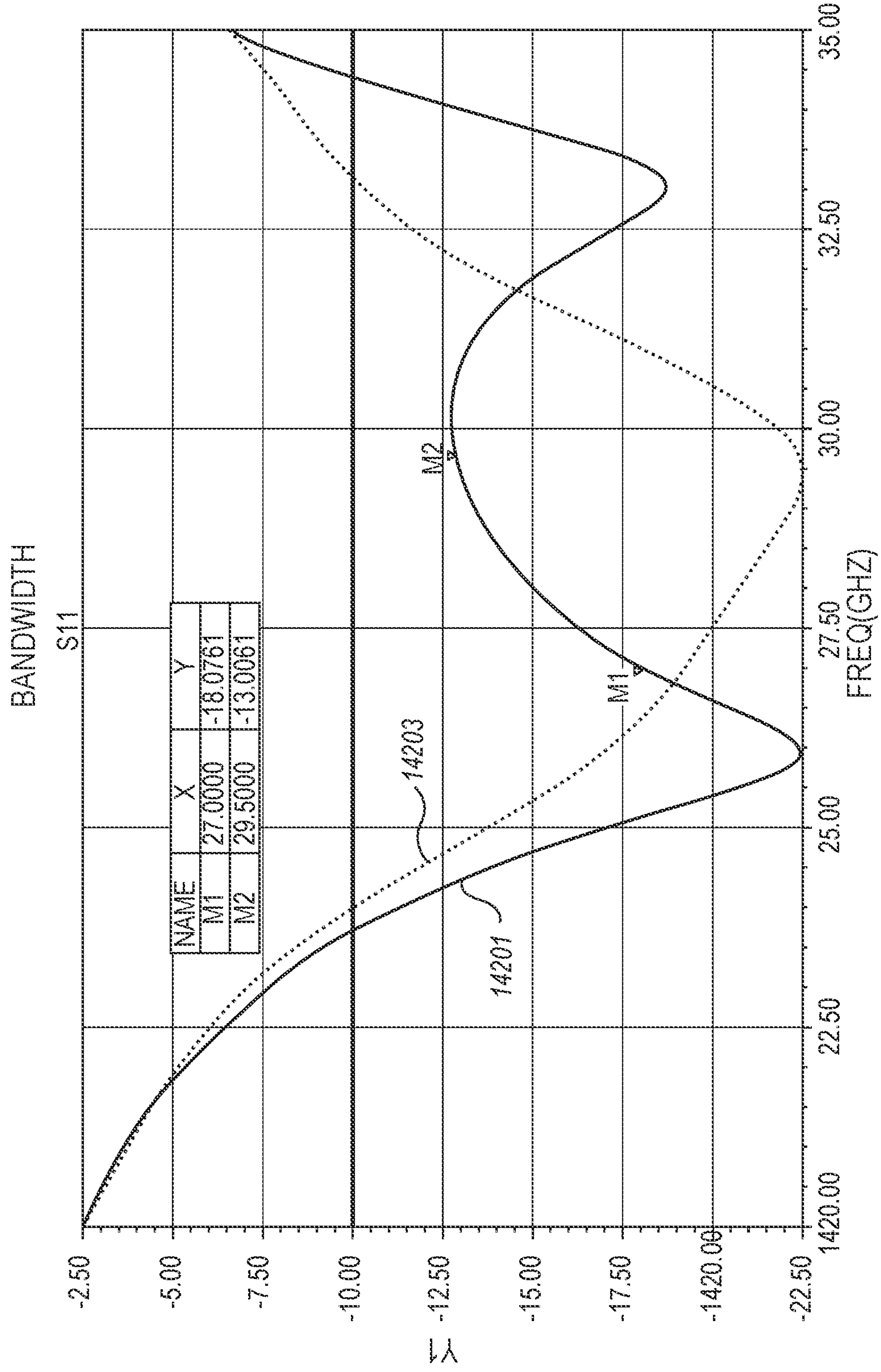

FIG. 142 illustrates the bandwidth of the antenna illustrated in FIGS. 141A and 141B for two different lengths of extended dielectric, according to an aspect.

Figure 143:
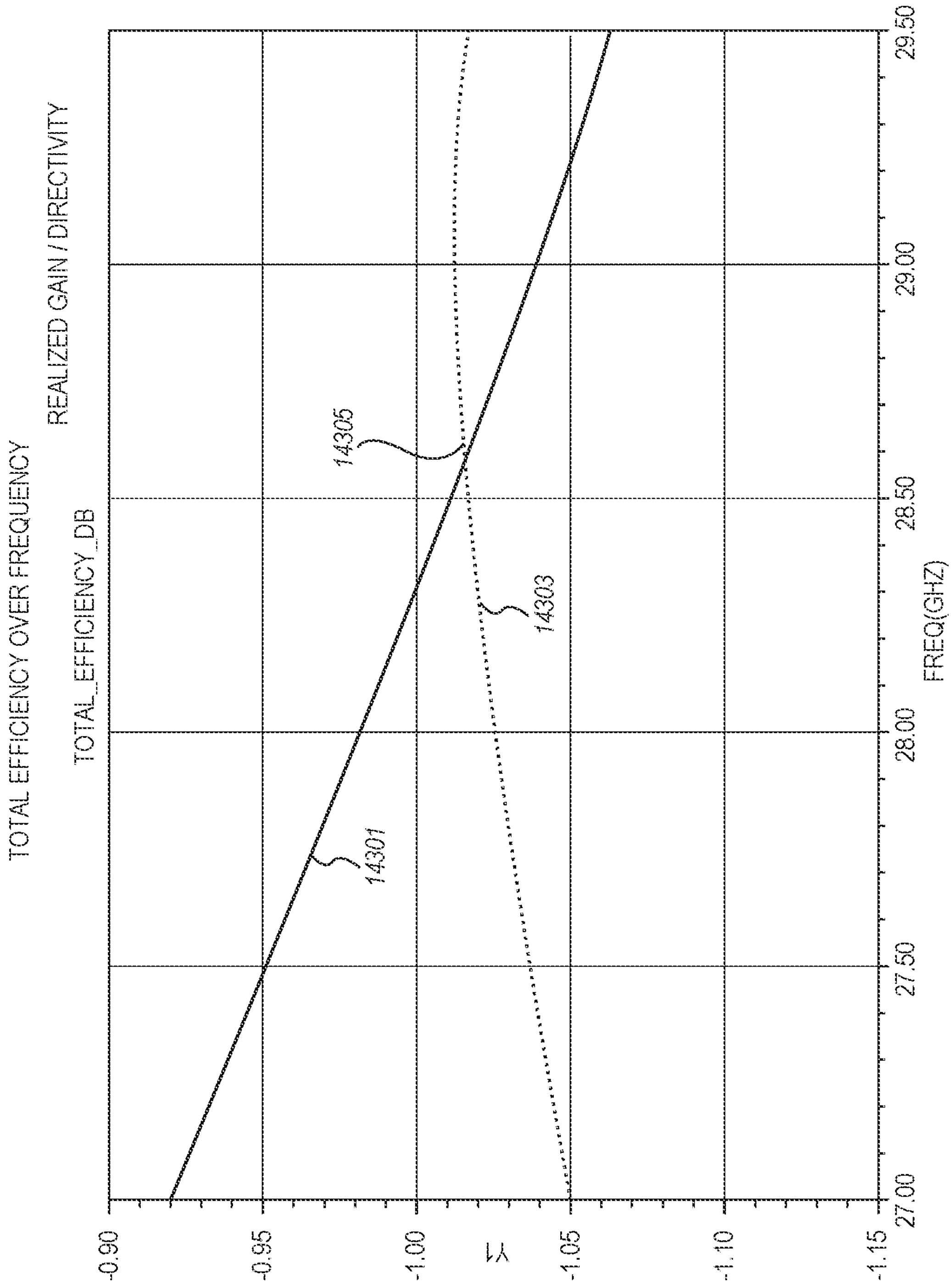

FIG. 143 illustrates the total efficiency over a frequency range of the antenna illustrated in FIGS. 141A and 141B, according to an aspect.

Figure 144:
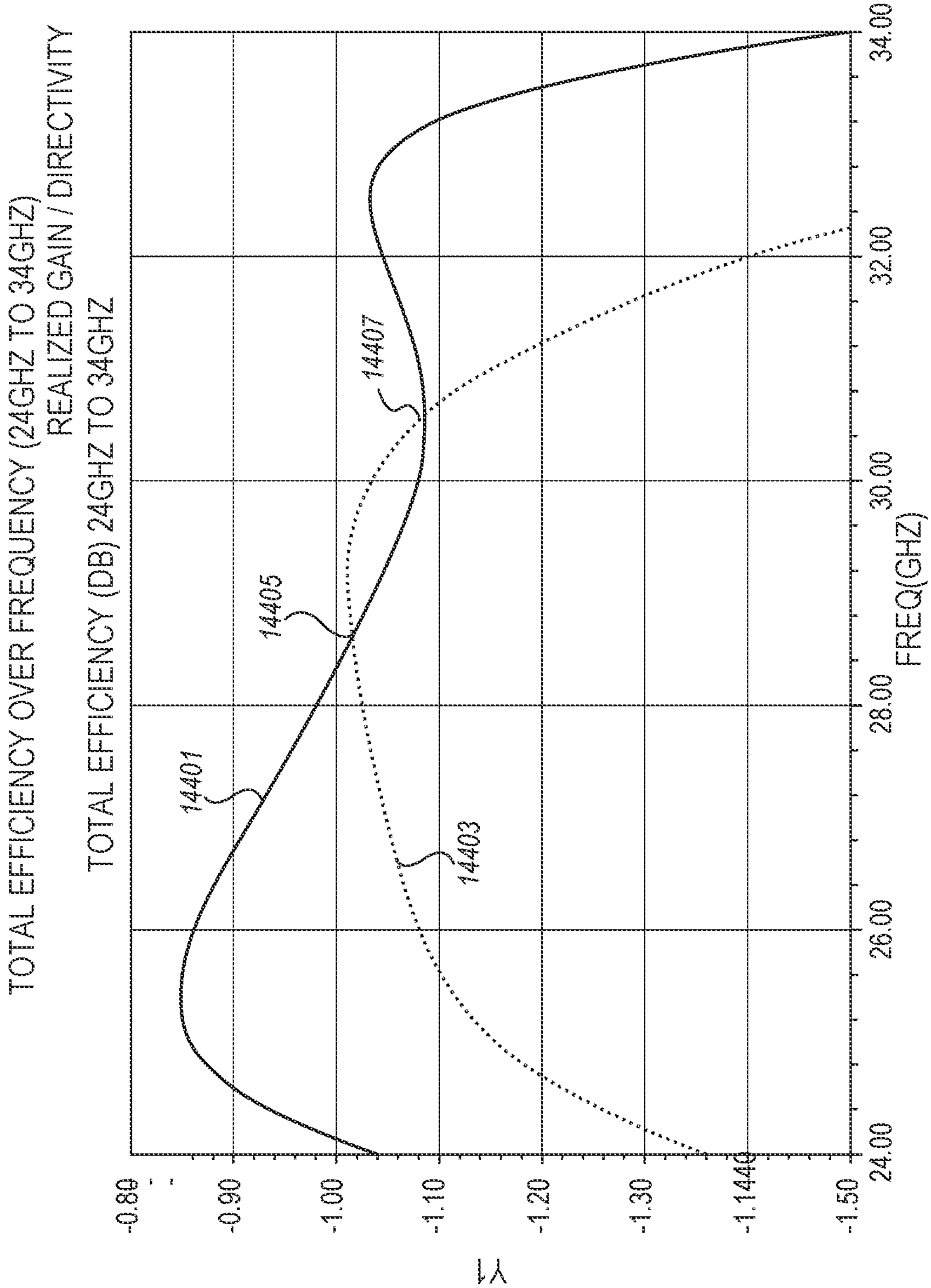

FIG. 144 illustrates total efficiency of the antenna illustrated in FIGS. 141A and 141B over a frequency range greater than the frequency range illustrated in FIG. 143, according to an aspect.

Figure 145:
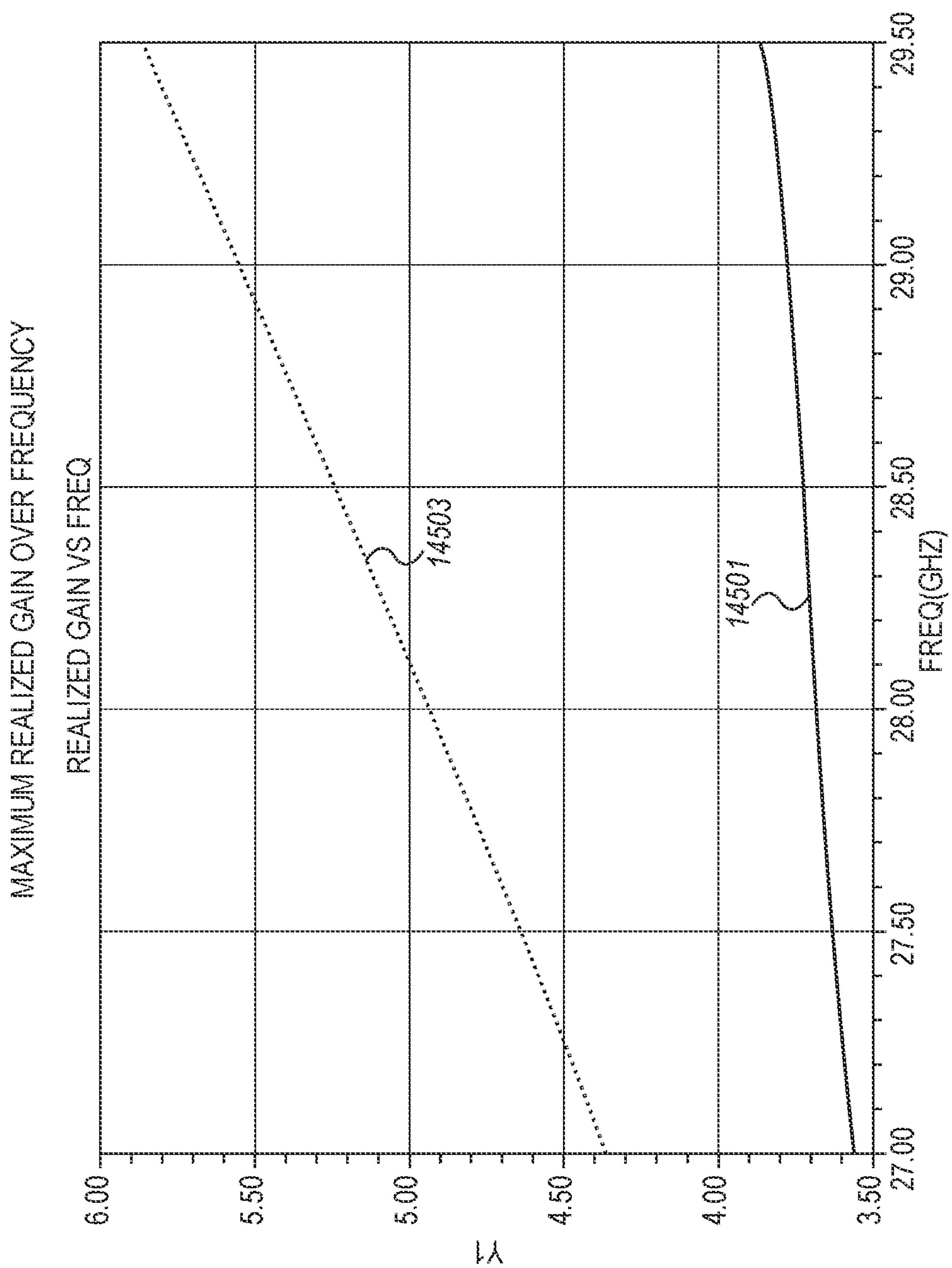

FIG. 145 illustrates maximum realized gain over a frequency range for the antenna illustrated in FIGS. 141A and 141B, according to an aspect.

Figure 146:
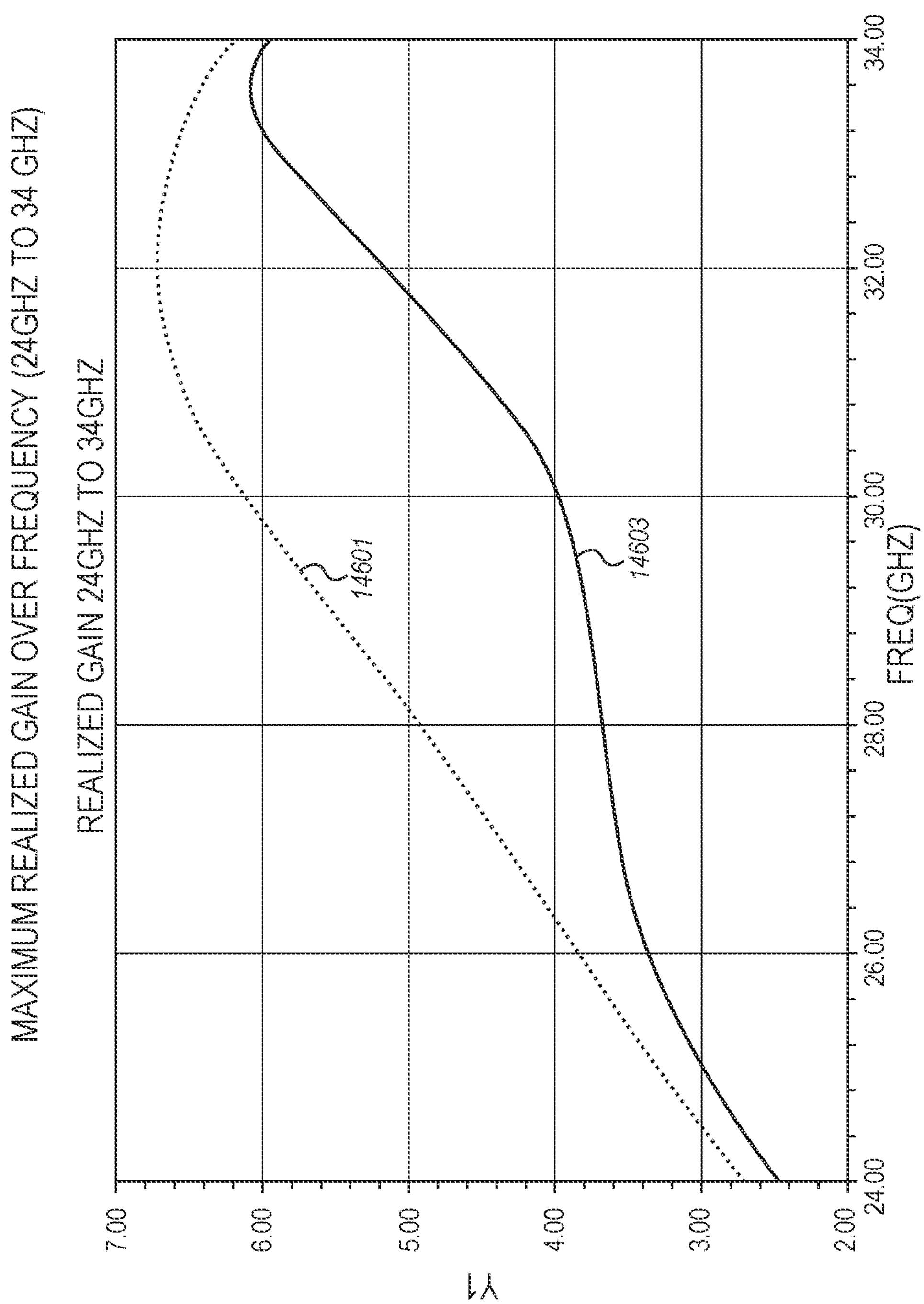

FIG. 146 illustrates the maximum realized gain over another frequency range for the antenna illustrated in FIG. 141A and FIG. 141B, according to an aspect.

Figure 147:
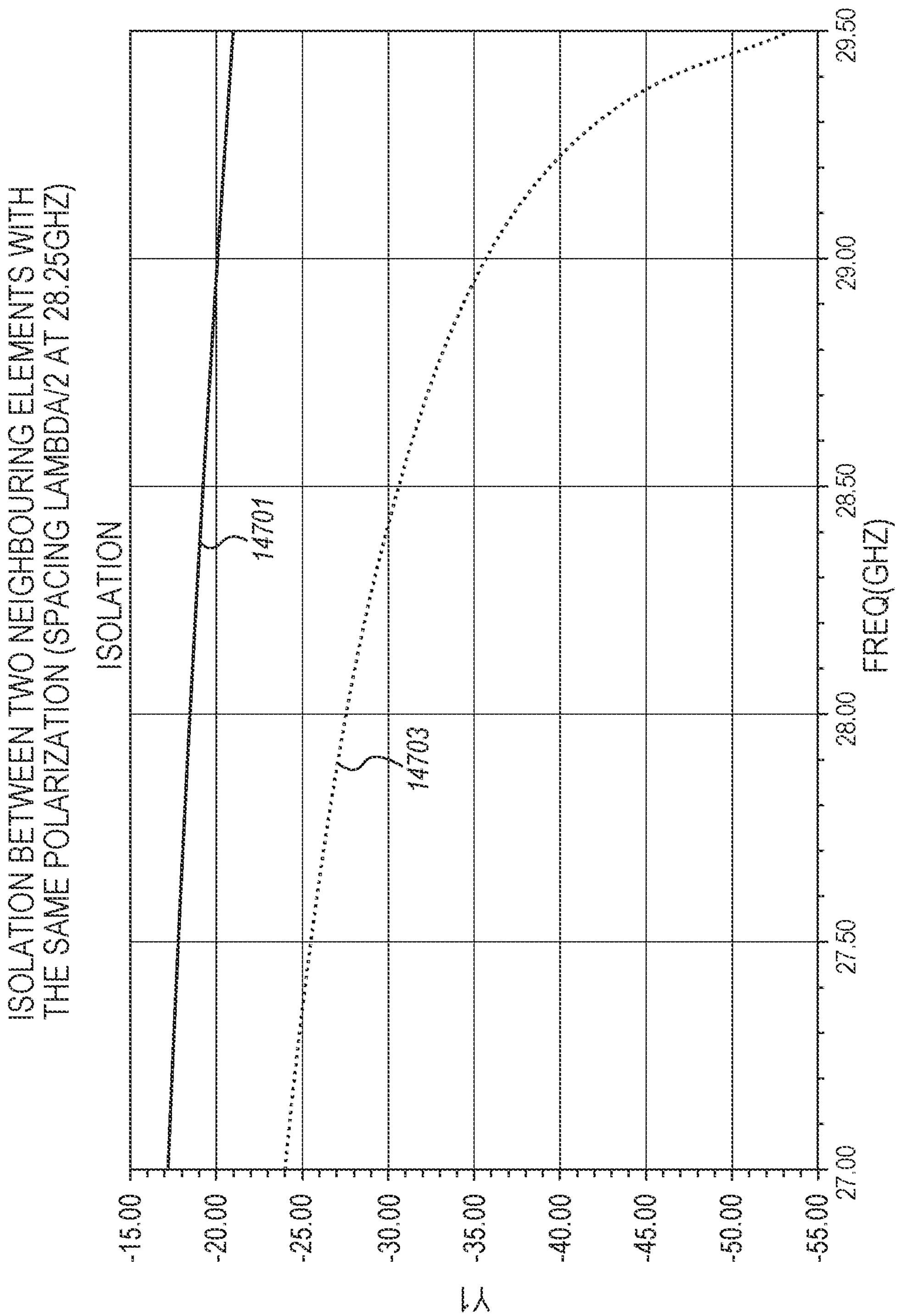

FIG. 147 illustrates exemplary isolation between two neighboring antenna elements of the antenna array illustrated in FIG. 141D, according to an aspect.

Figure 148A:
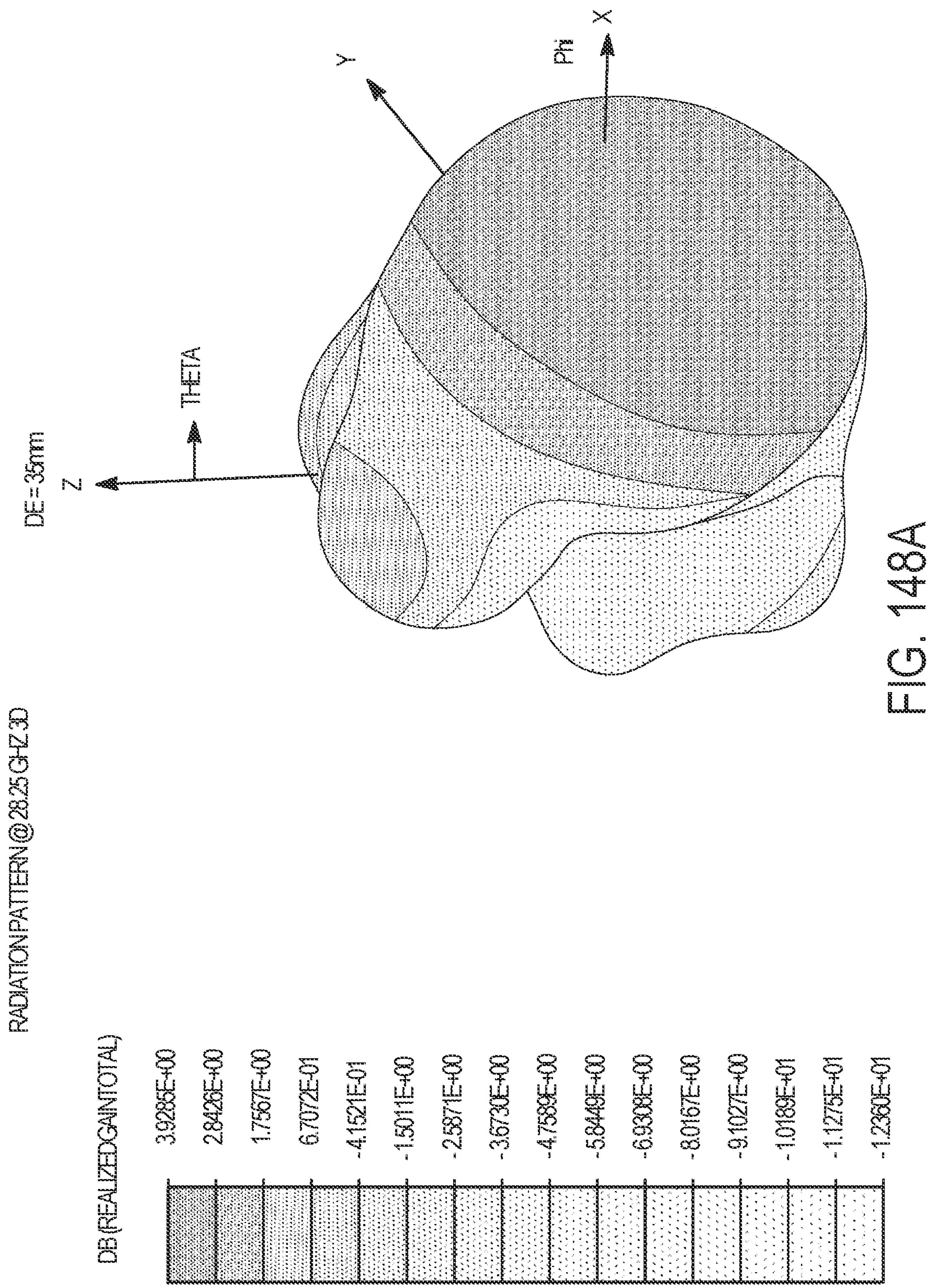

FIG. 148A illustrates an exemplary three-dimensional radiation pattern at a given frequency for the antenna element illustrated in FIGS. 141A and 141B at a first extended dielectric length, according to an aspect.

Figure 148B:
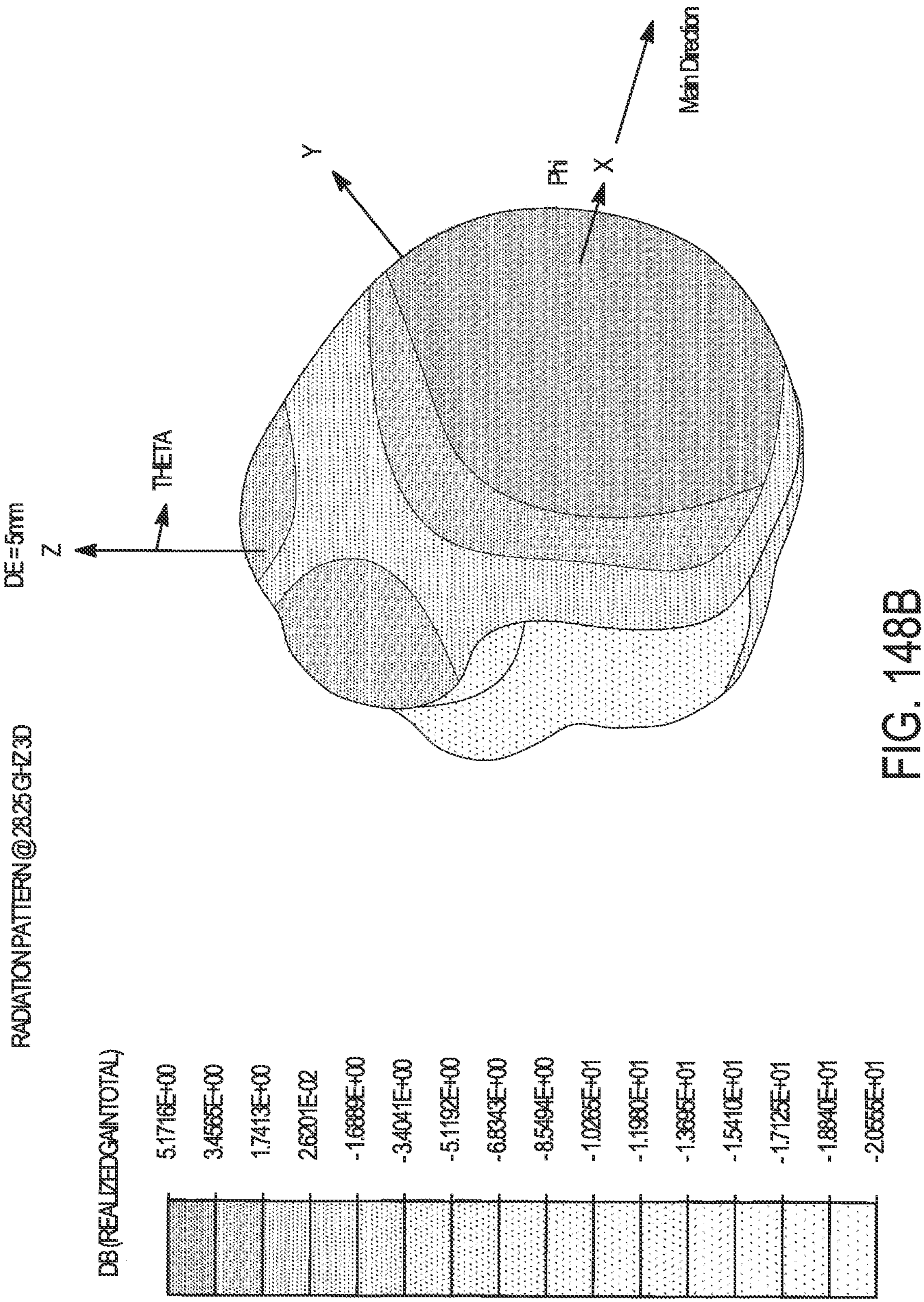

FIG. 148B illustrates an exemplary three-dimensional radiation pattern at a given frequency for the antenna element illustrated in FIGS. 141A and 141B for a second extended dielectric length, according to an aspect.

Figure 148C:
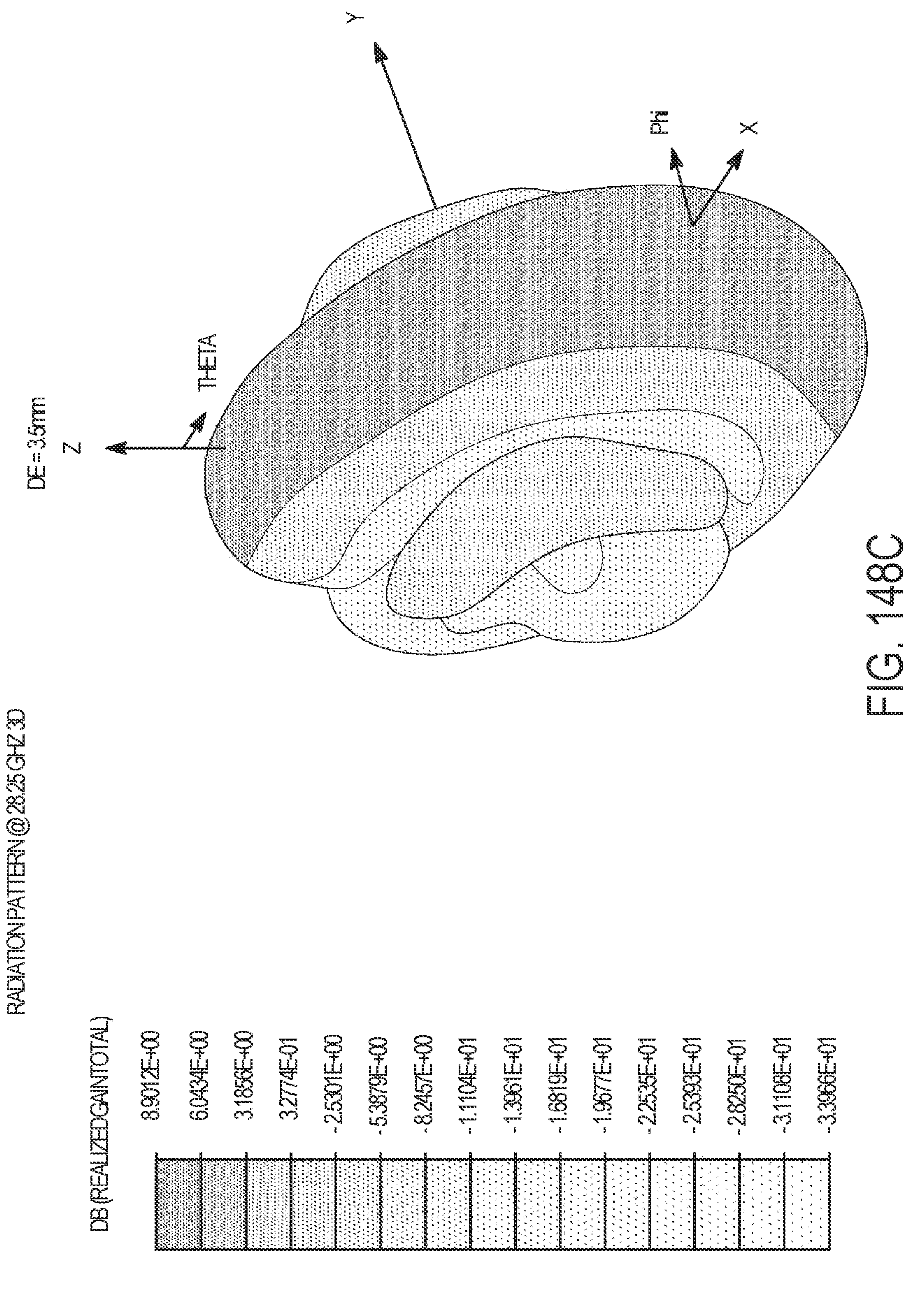

FIG. 148C illustrates an exemplary three-dimensional radiation pattern at a given frequency for the four-element antenna array illustrated in FIG. 141D, where each antenna element has a first extended dielectric length, according to an aspect.

Figure 148D:
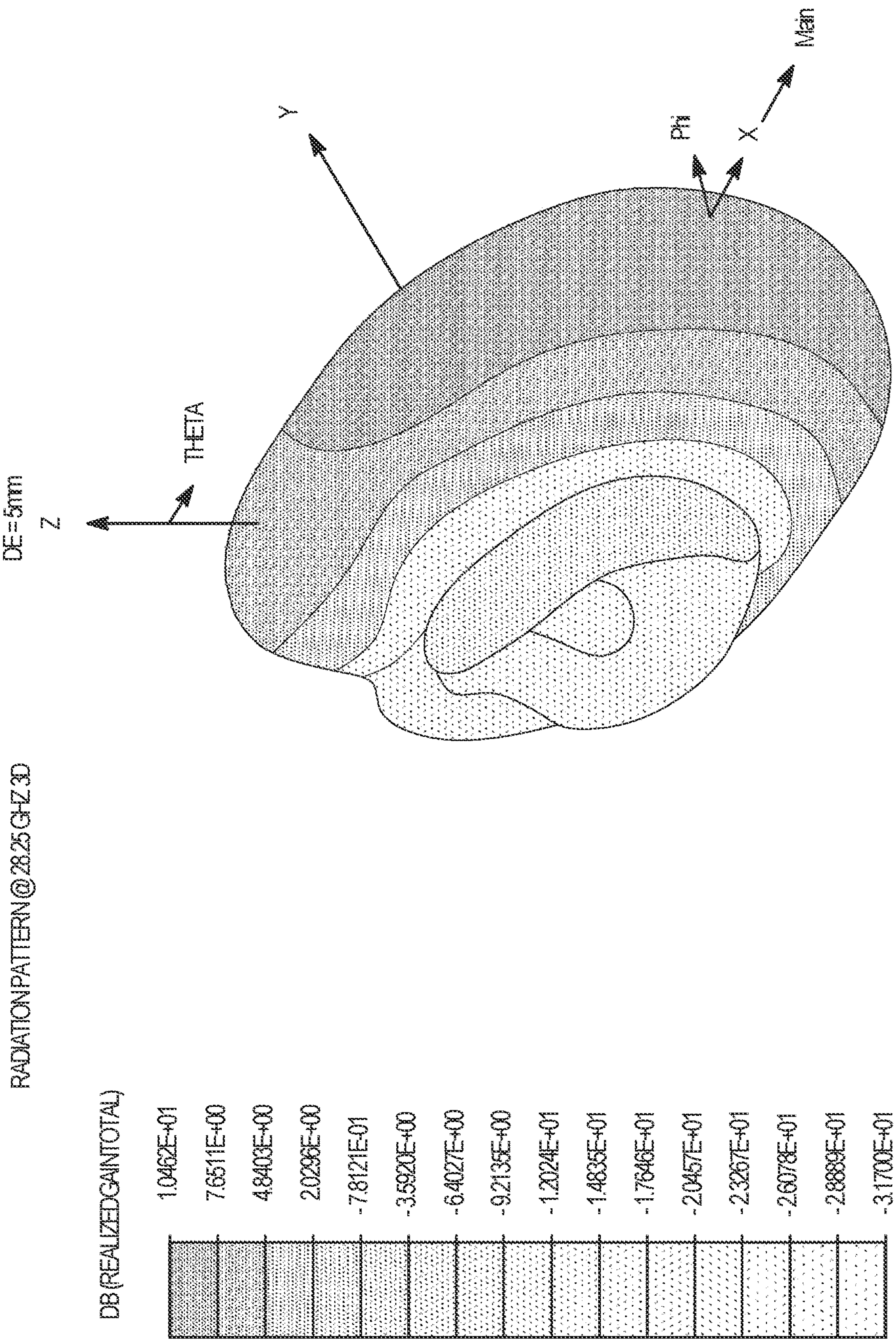

FIG. 148D illustrates an exemplary three-dimensional radiation pattern at a given frequency for the four-array antenna element illustrated in FIG. 141D, where each antenna element has a second extended dielectric length, according to an aspect.

Figure 149:
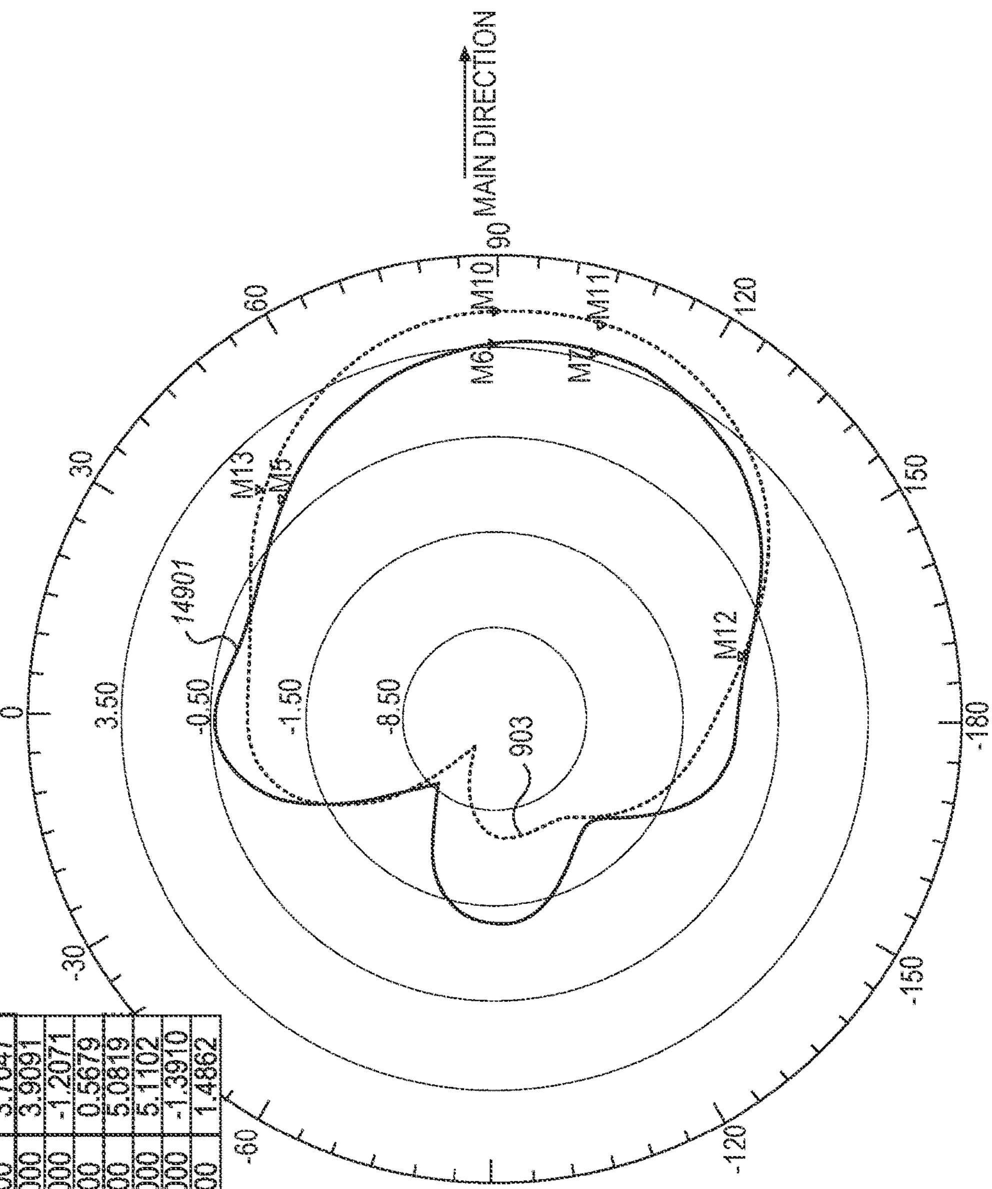

FIG. 149 illustrates an exemplary E-plane co-polarization radiation pattern at a given frequency for the antenna element illustrated in FIGS. 141A and 141B, according to an aspect.

Figure 150:
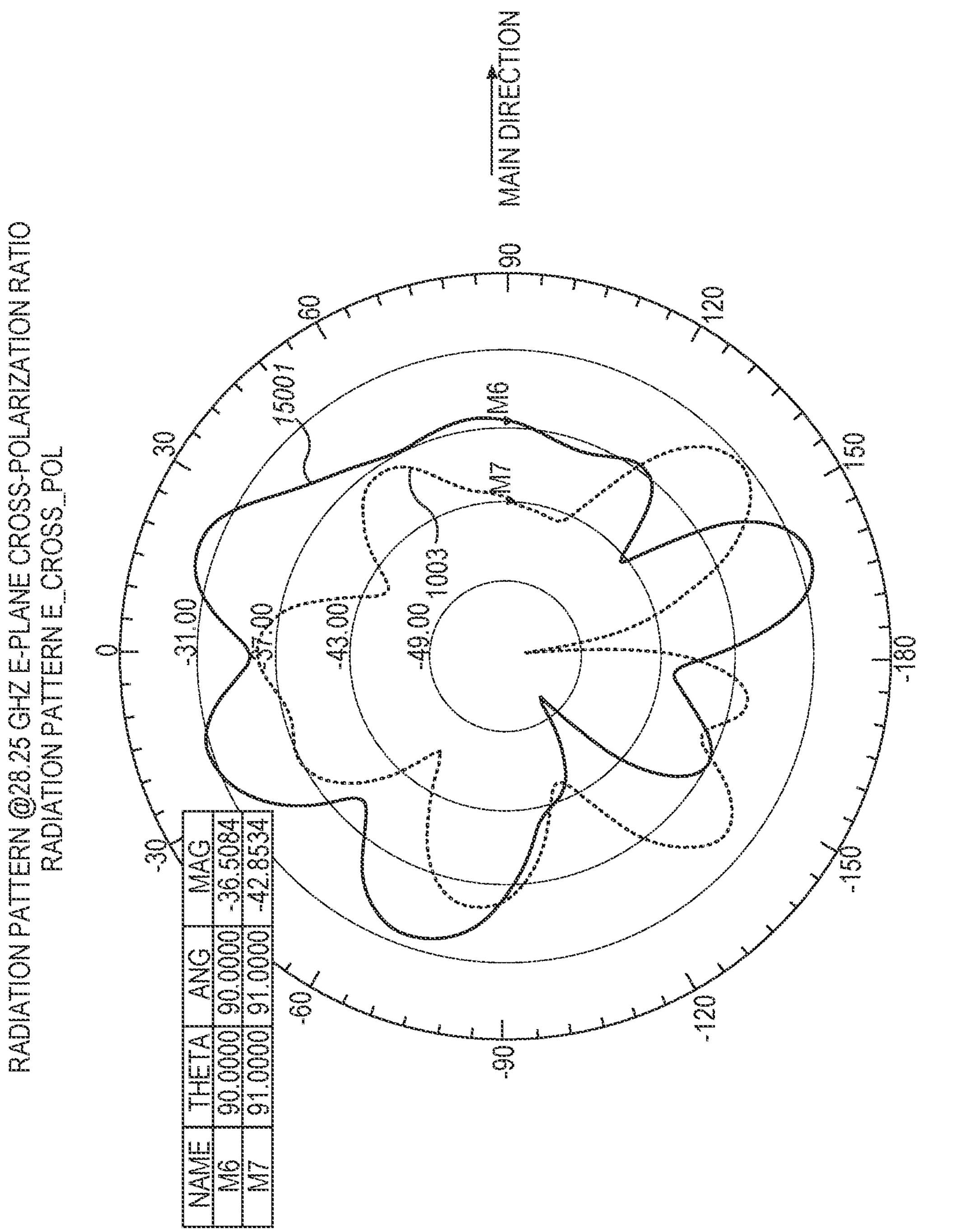

FIG. 150 illustrates an exemplary E-plane cross-polarization radiation pattern at a given frequency for the antenna illustrated at FIG. 141A and FIG. 141B, according to an aspect.

Figure 151:
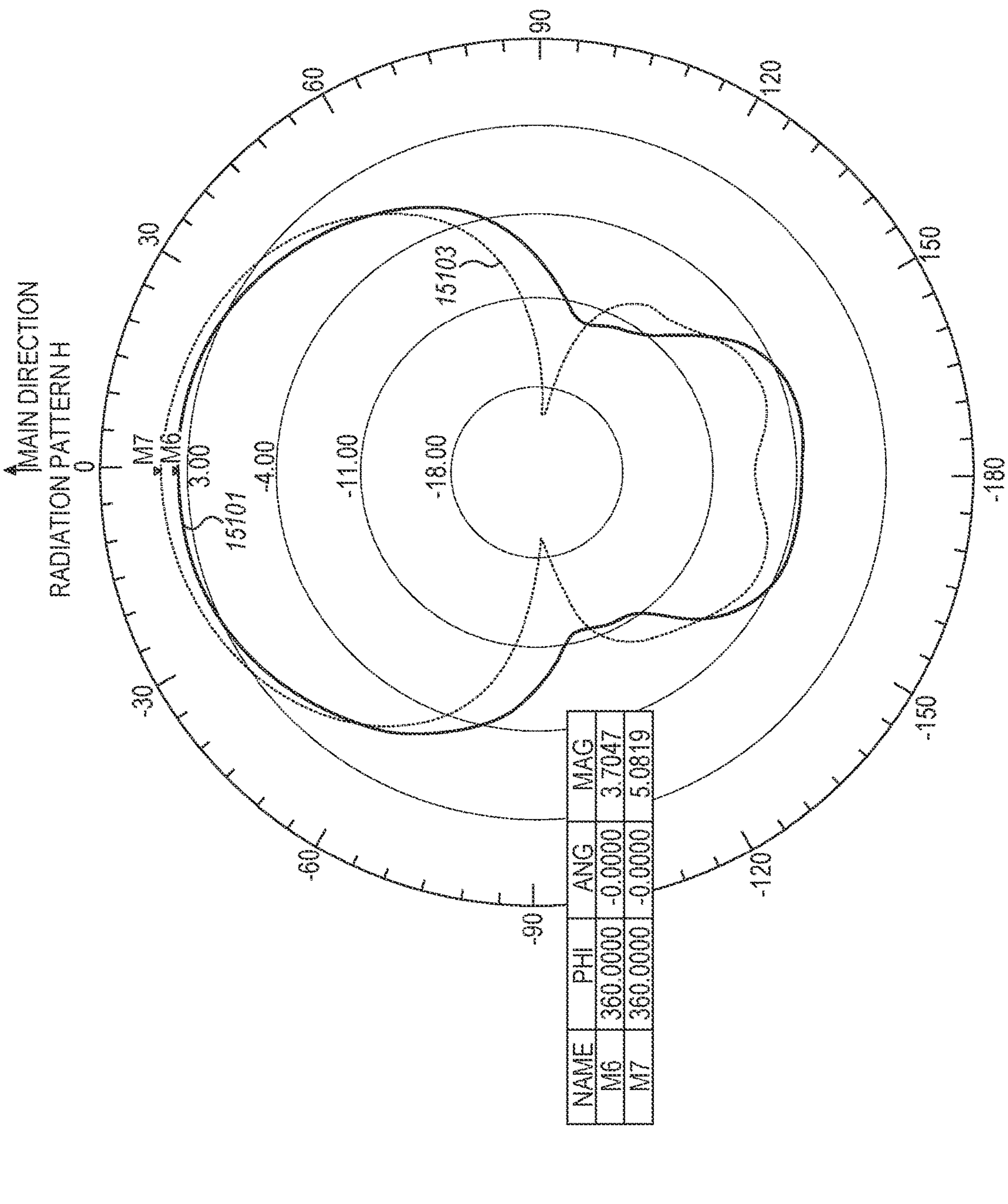

FIG. 151 illustrates an exemplary H-plane co-polarization radiation pattern at a given frequency for the antenna illustrated in FIGS. 141A and 141B, according to an aspect.

Figure 152:
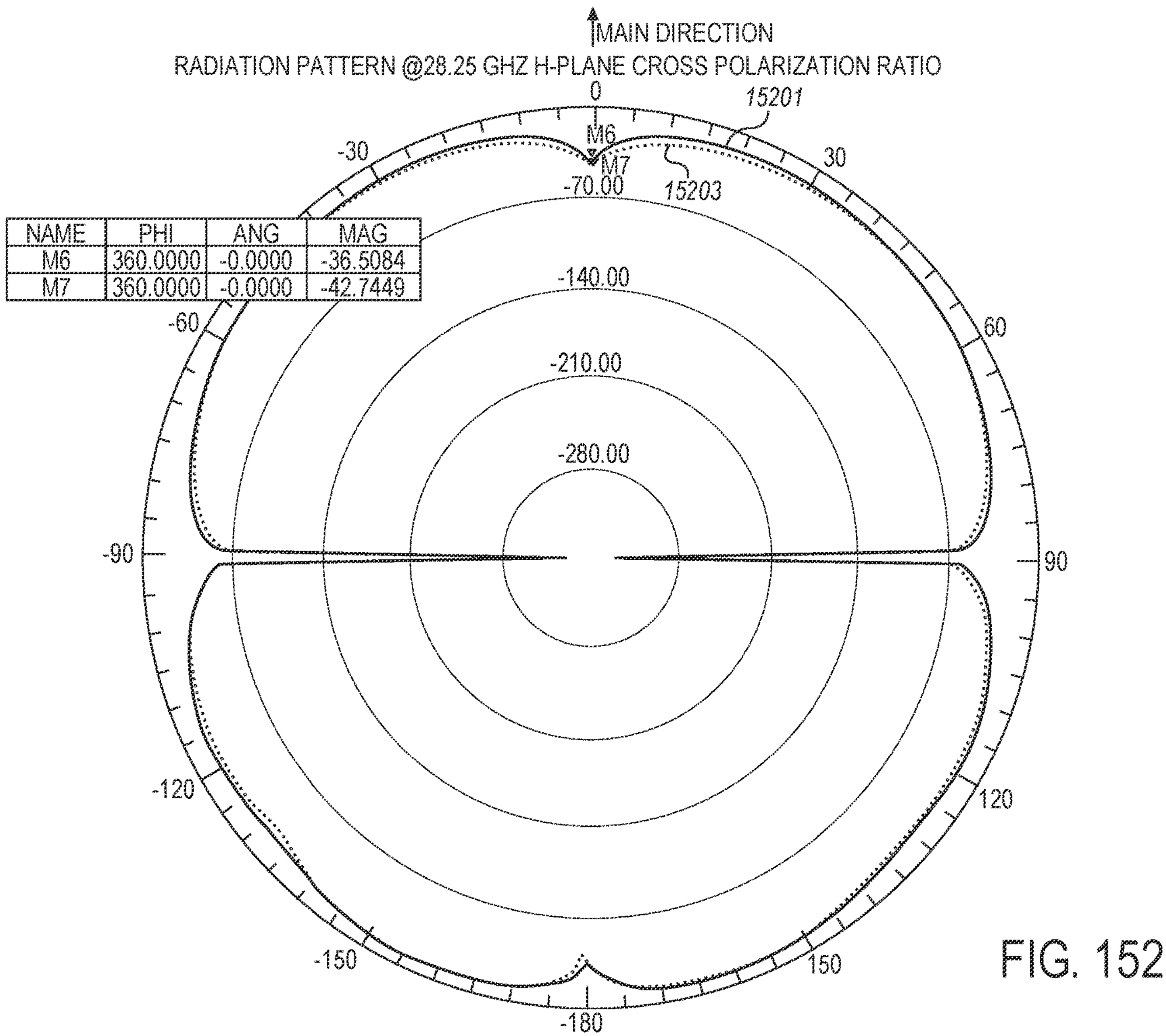

FIG. 152 illustrates an exemplary H-plane cross-polarization radiation pattern at a given frequency for the antenna illustrated in FIGS. 141A and 141B, according to an aspect.

Figure 153A:
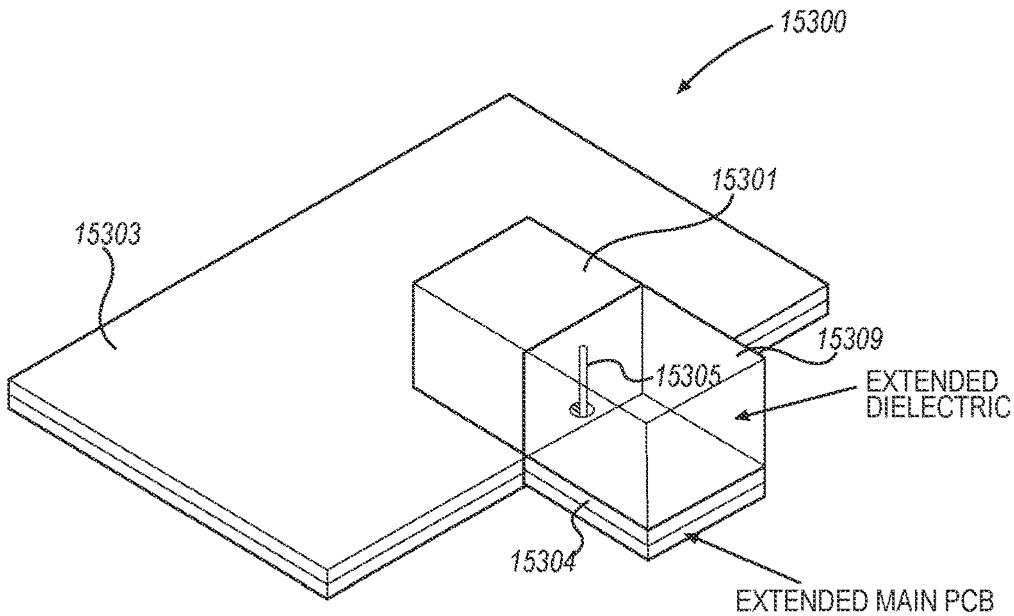

FIG. 153A illustrates an exemplary antenna element similar to the antenna illustrated in FIGS. 141A and 141B with part of the surface component merged with the PCB, according to an aspect.

Figure 153B:
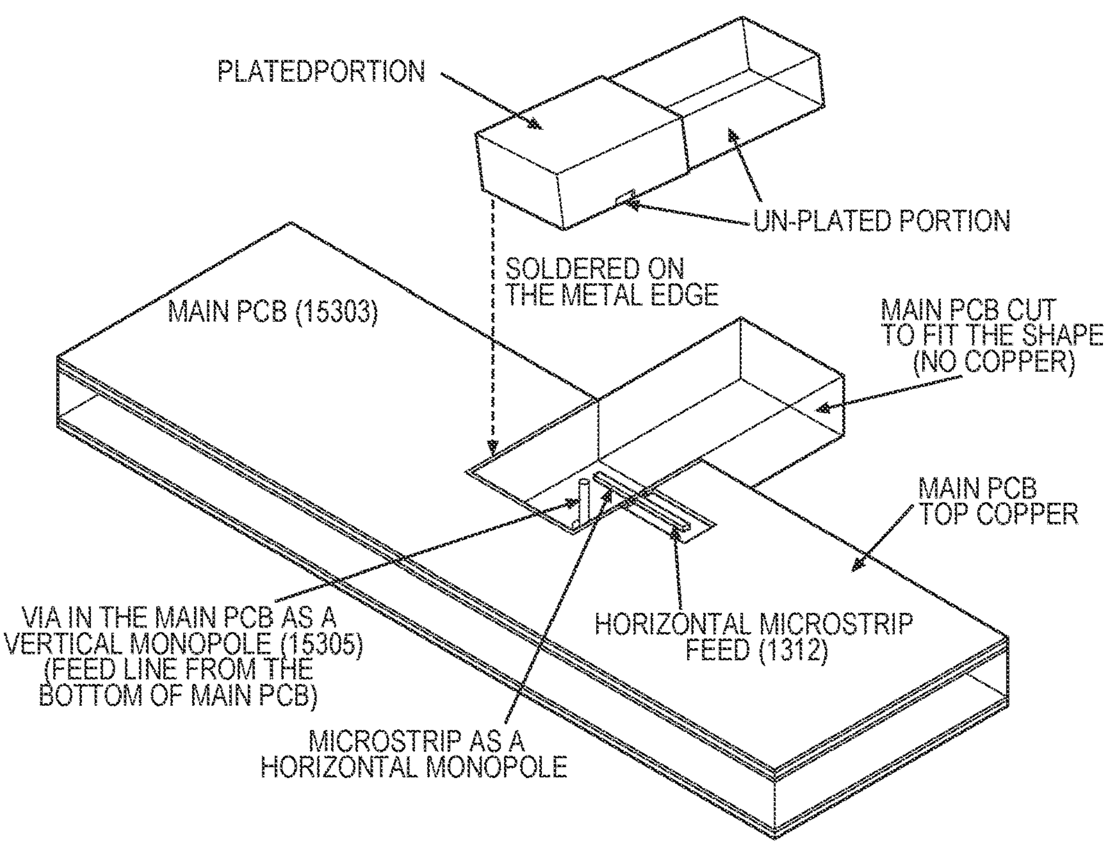

FIG. 153B illustrates the antenna element illustrated in FIG. 153A with additional detail illustrating vertical polarization and horizontal polarization feed points, according to an aspect.

Figure 154A:
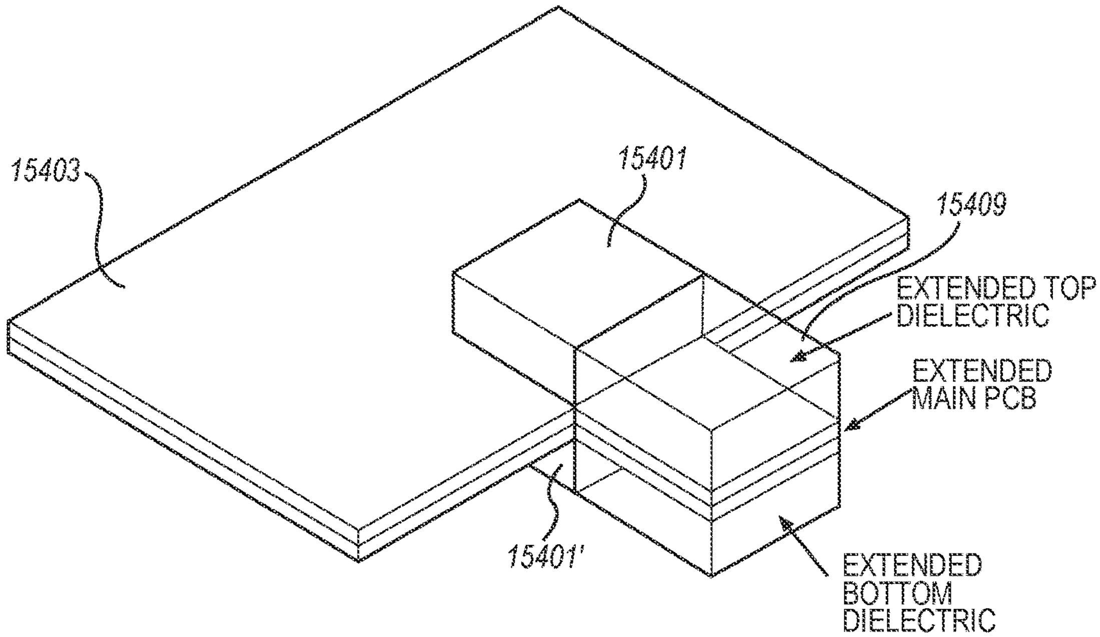

FIG. 154A illustrates an exemplary antenna element similar to that illustrated in FIGS. 141A and 141B, including a two surface components on both sides of a PCB, according to an aspect.

Figure 154B:
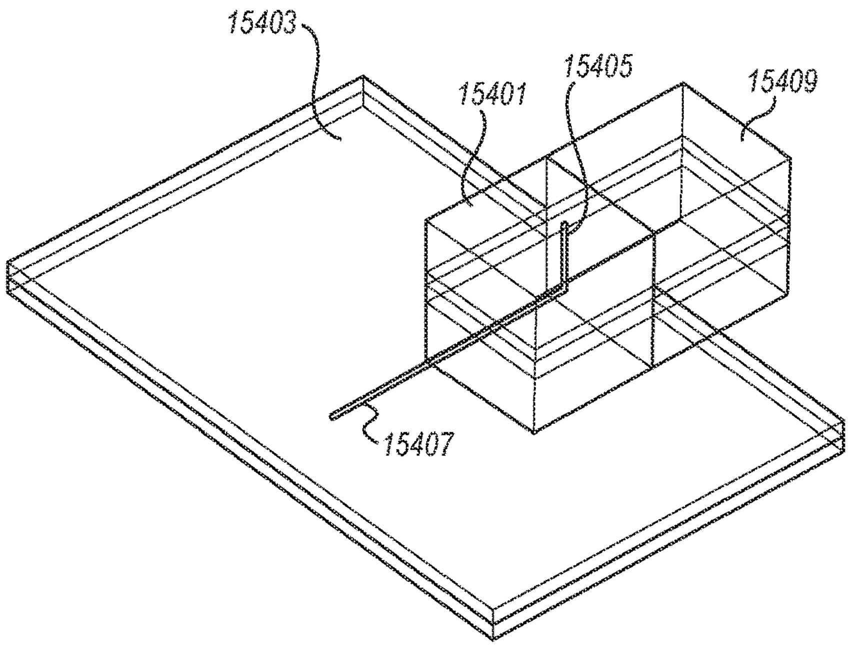

FIG. 154B illustrates the antenna element illustrated in FIG. 154A in additional detail including a close-up view of the feed line, according to an aspect.

Figure 155A:
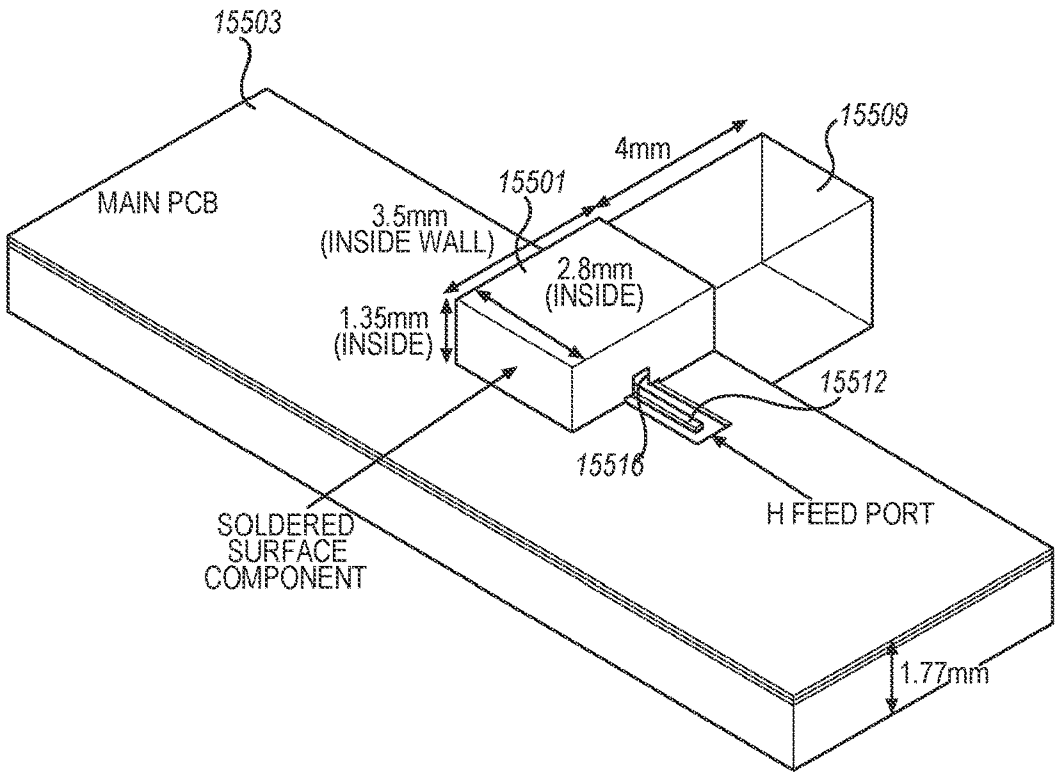

FIG. 155A is a perspective view of the dual polarization antenna of FIG. 153B after soldering the small surface component and main PCB together, according to an aspect.

Figure 155B:
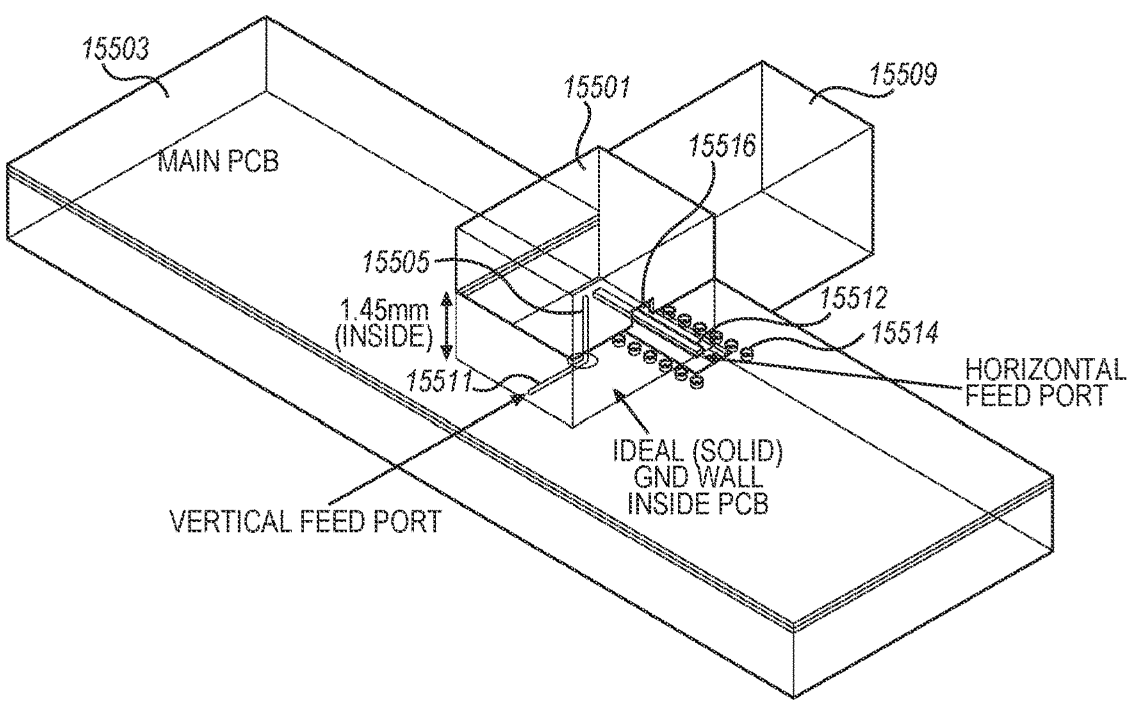

FIG. 155B illustrates a transparent view of the antenna element illustrated in FIG. 155A looking into the surface component that is merged with respect to the main PCB, according to an aspect.

Figure 155C:
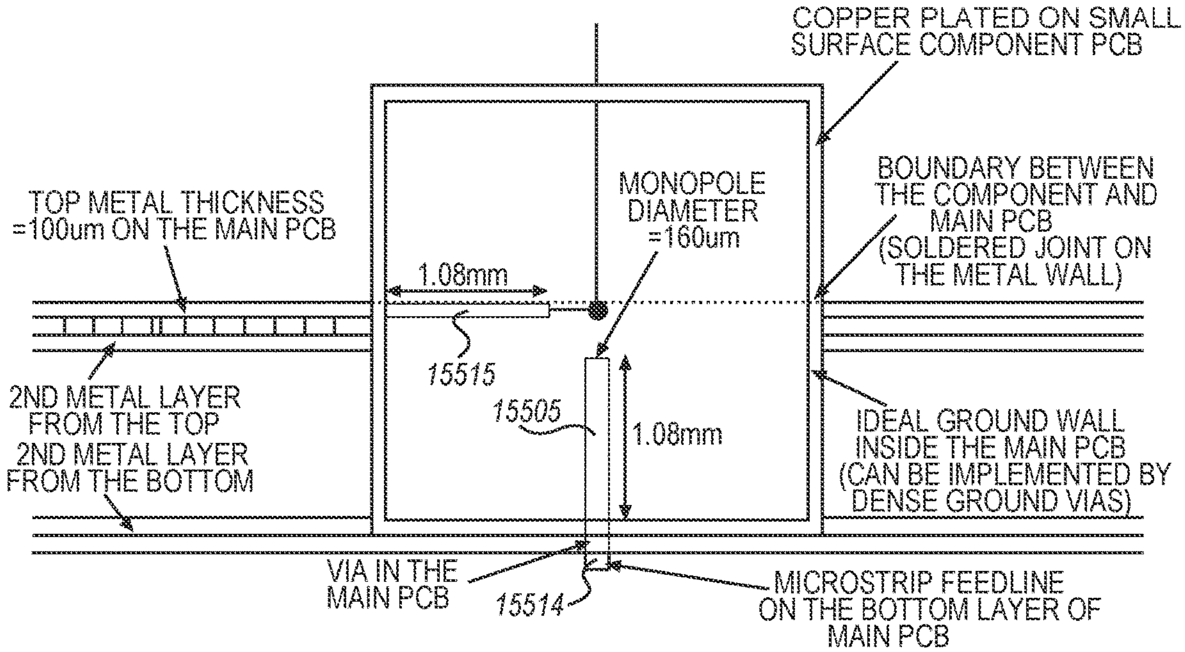

FIG. 155C illustrates a front view of the antenna element illustrated in FIG. 155A in additional detail, according to an aspect.

Figure 155D:
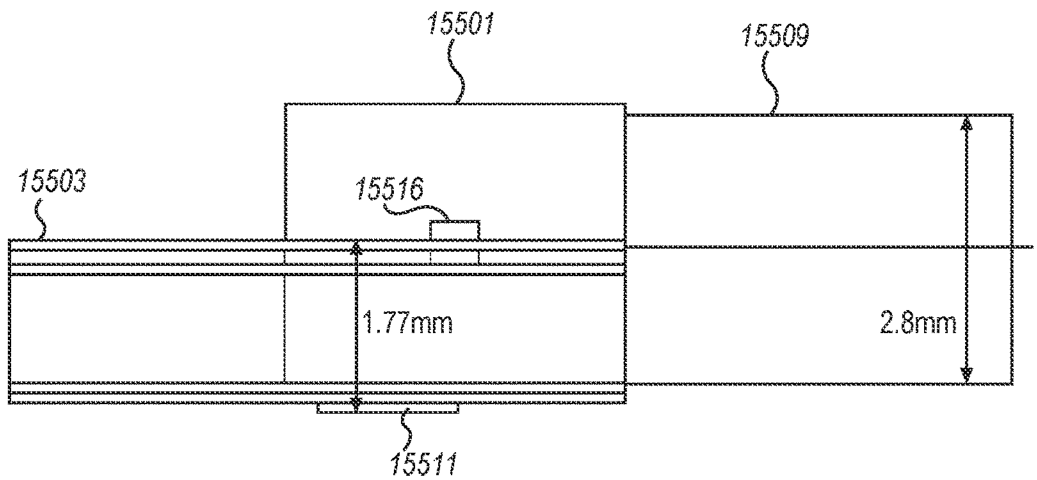

FIG. 155D illustrates a side view of the antenna element illustrated in FIG. 155A, according to an aspect.

Figure 156A:
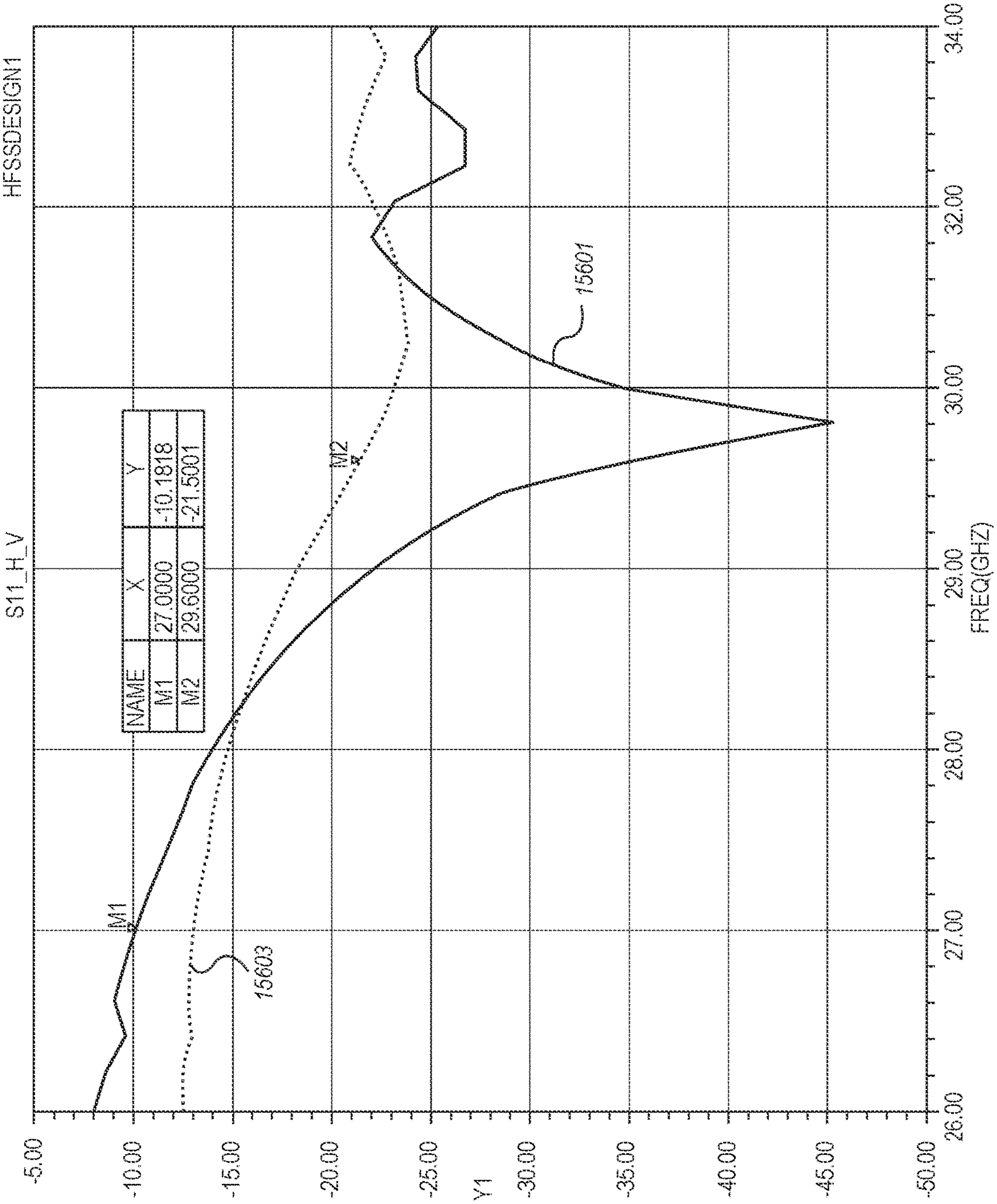

FIG. 156A illustrates the return loss S-parameter for dual polarization for the antenna element illustrated in FIG. 155A, according to an aspect.

Figure 156B:
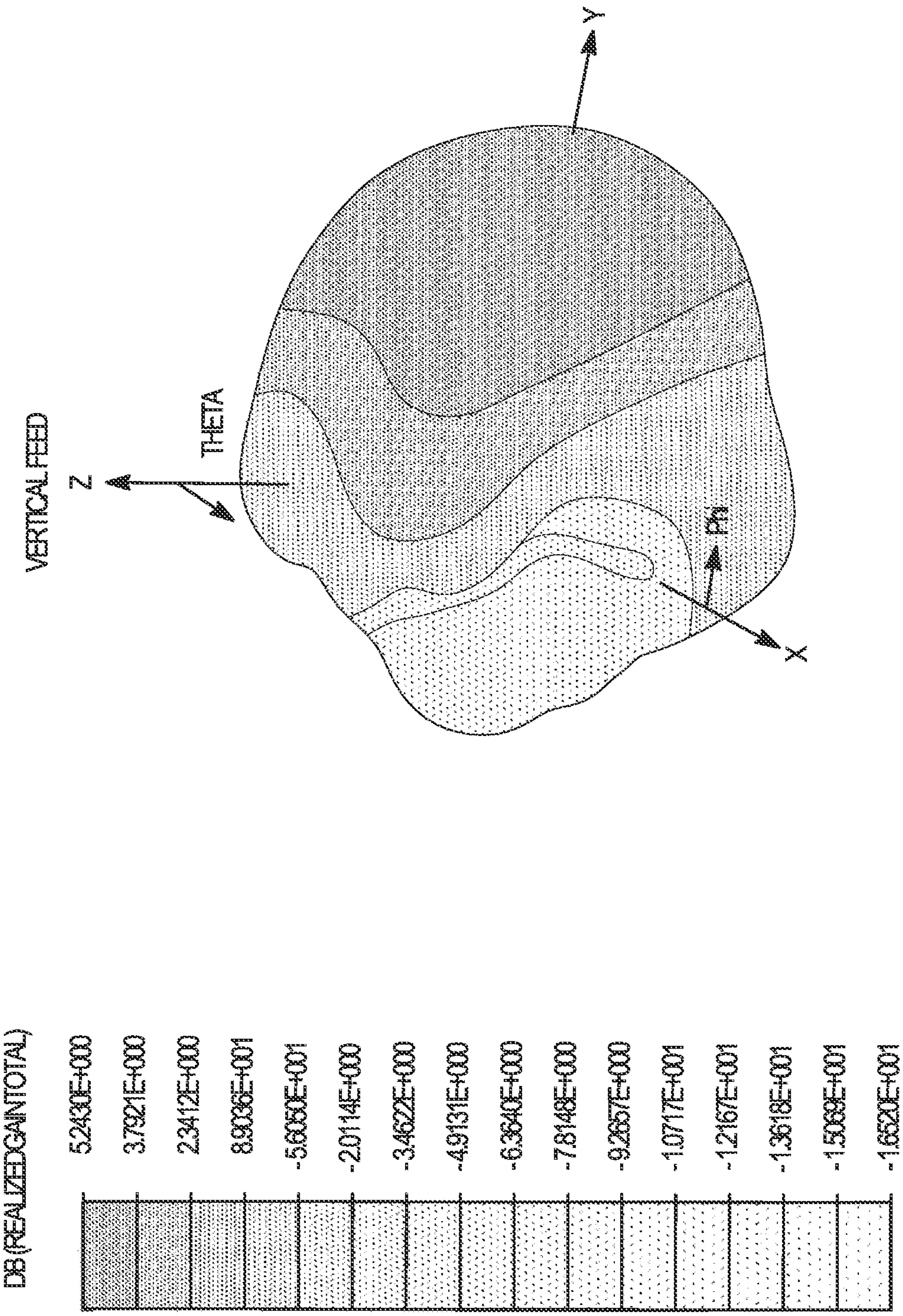

FIG. 156B illustrates an exemplary 3D radiation pattern with vertical feed for the antenna element illustrated in FIG. 155A, according to some aspects.

Figure 156C:
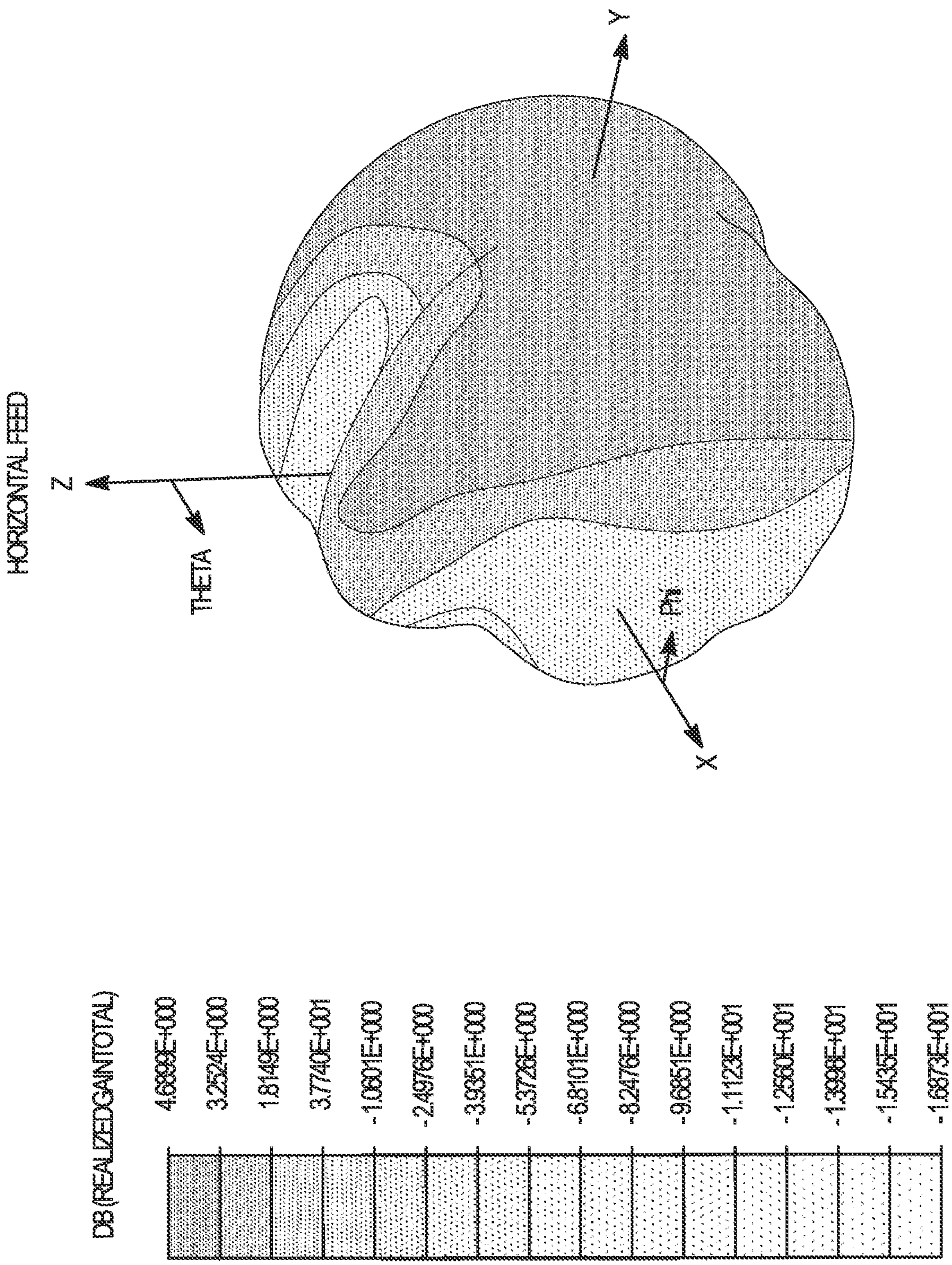

FIG. 156C illustrates a 3D radiation pattern with horizontal feed for the antenna element illustrated in FIG. 155A, according to some aspects.

Figure 157A:
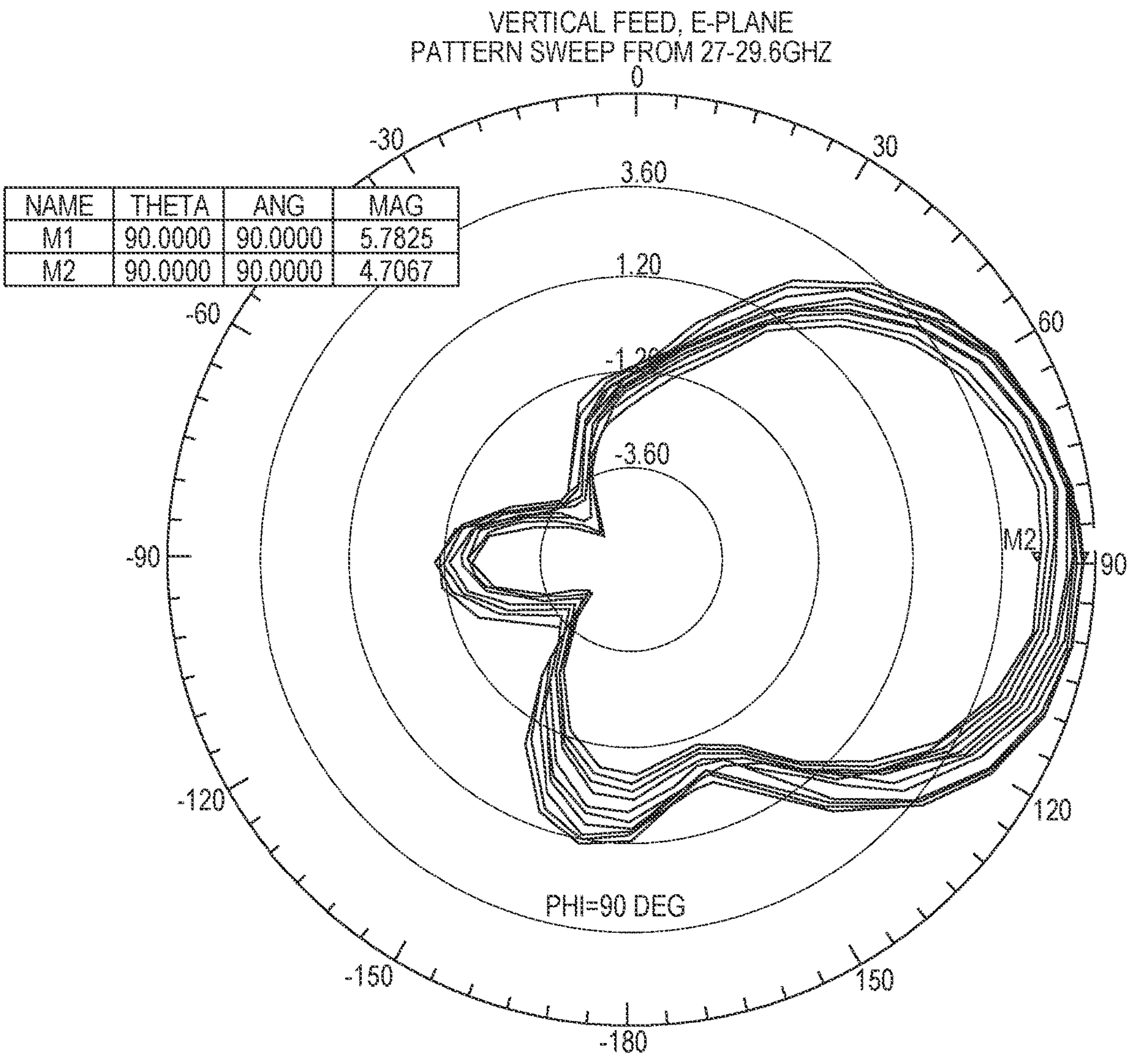

FIG. 157A illustrates vertical polarization feed, E-plane radiation patterns for the antenna illustrated in FIG. 155A, according to an aspect.

Figure 157B:
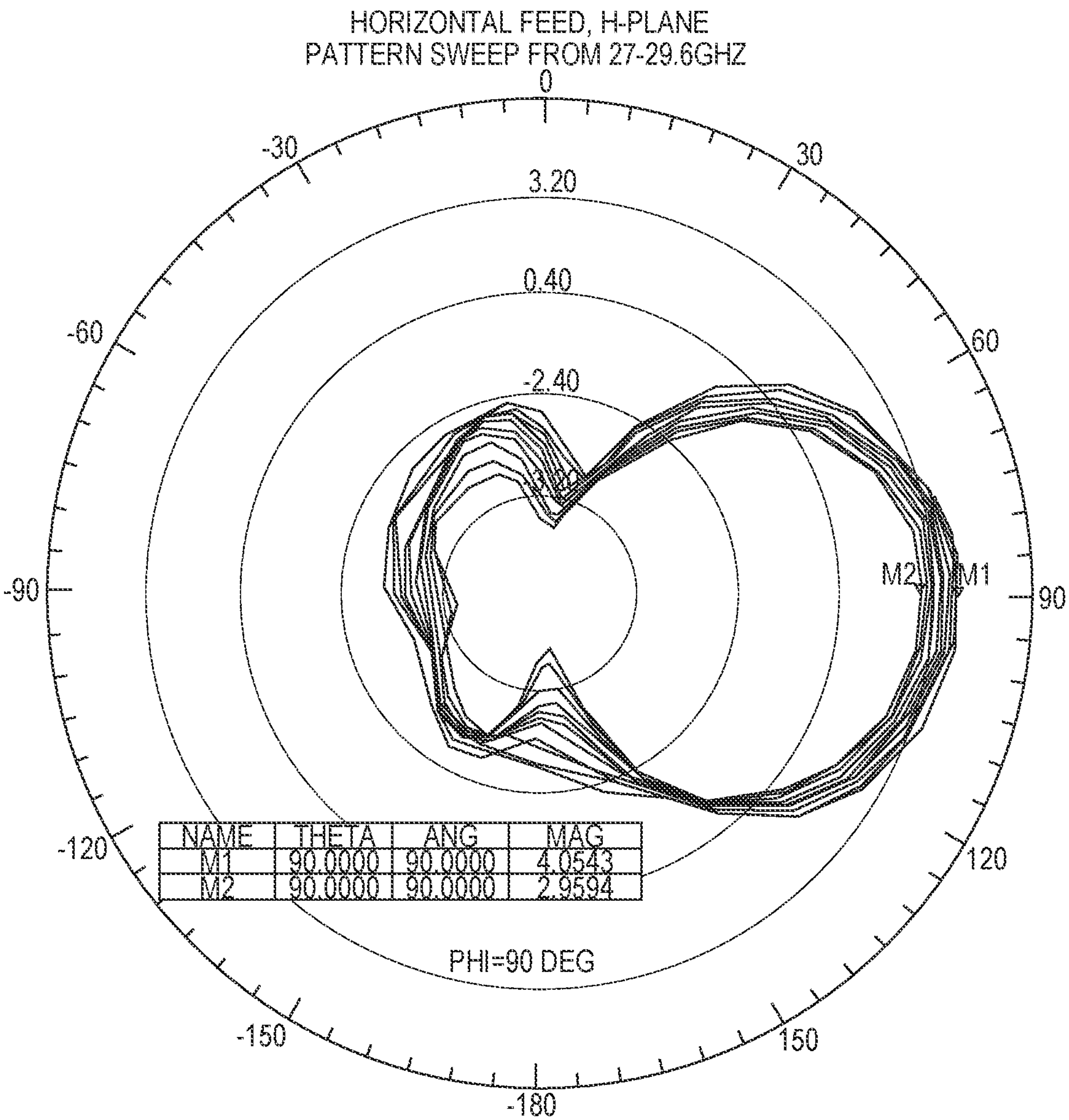

FIG. 157B illustrates horizontal polarization feed, H-plane radiation patterns for the antenna element illustrated in FIG. 155A, according to an aspect.

Figure 158:
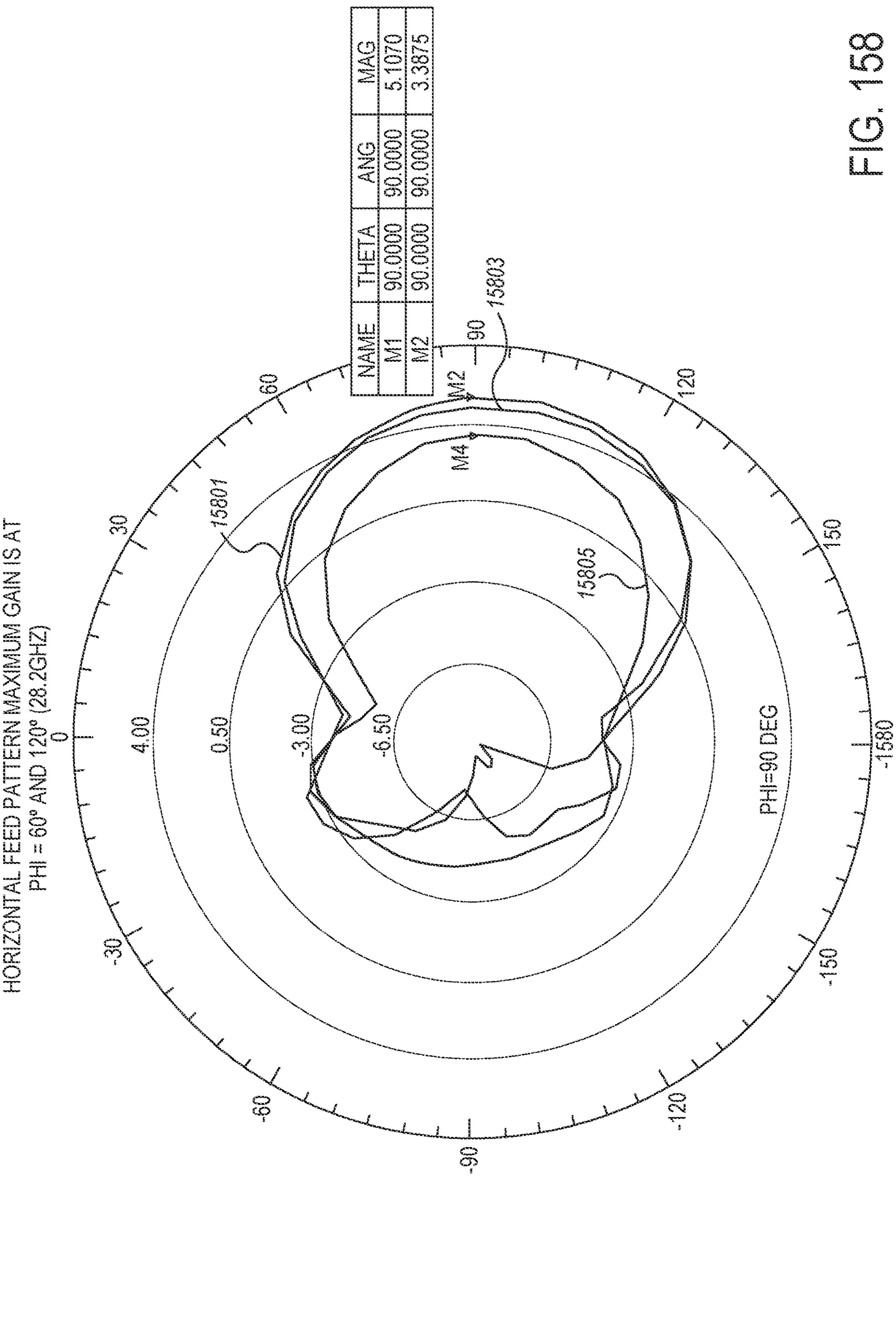

FIG. 158 illustrates exemplary realized gain for horizontal feed E-plane patterns of the antenna of FIG. 155A, according to some aspects.

Figure 159B:
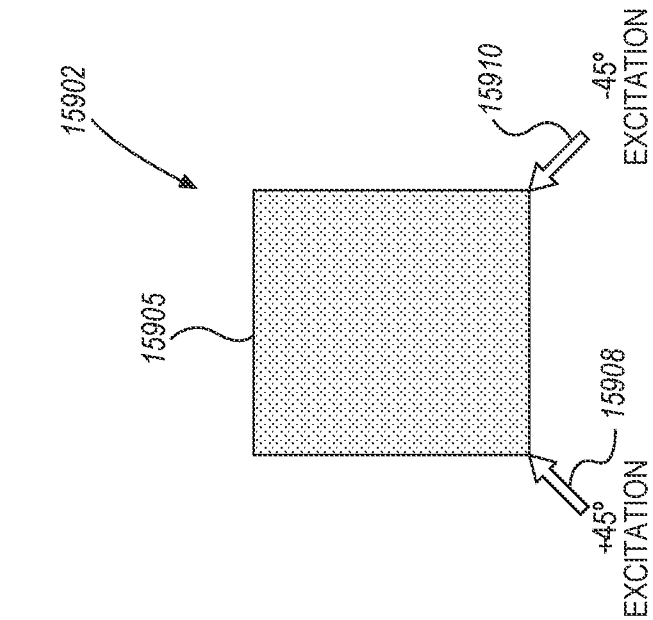
Figure 159A:
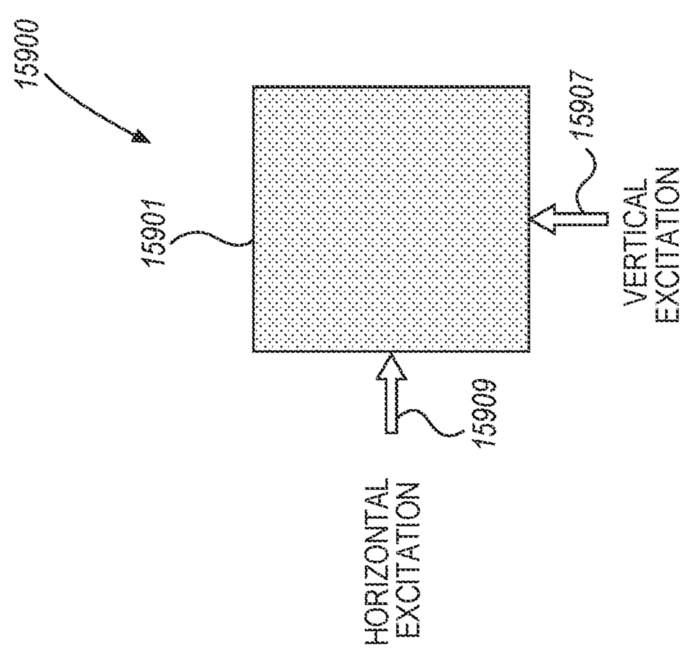

FIG. 159A illustrates an exemplary antenna element with orthogonal vertical and horizontal excitation, according to some aspects.

FIG. 159B illustrates an exemplary antenna element with +45 degree and −45 degree excitation, according to some aspects.

Figure 160A:
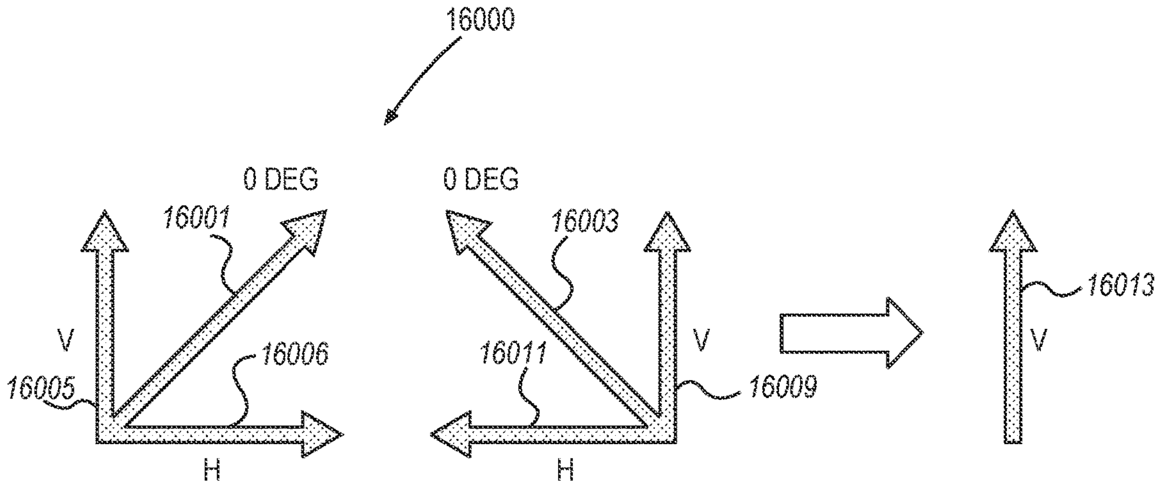

FIG. 160A illustrates obtaining vertical (V) polarization by use of in-phase excitation for both ports of the antenna of FIG. 159B, according to some aspects.

Figure 160B:
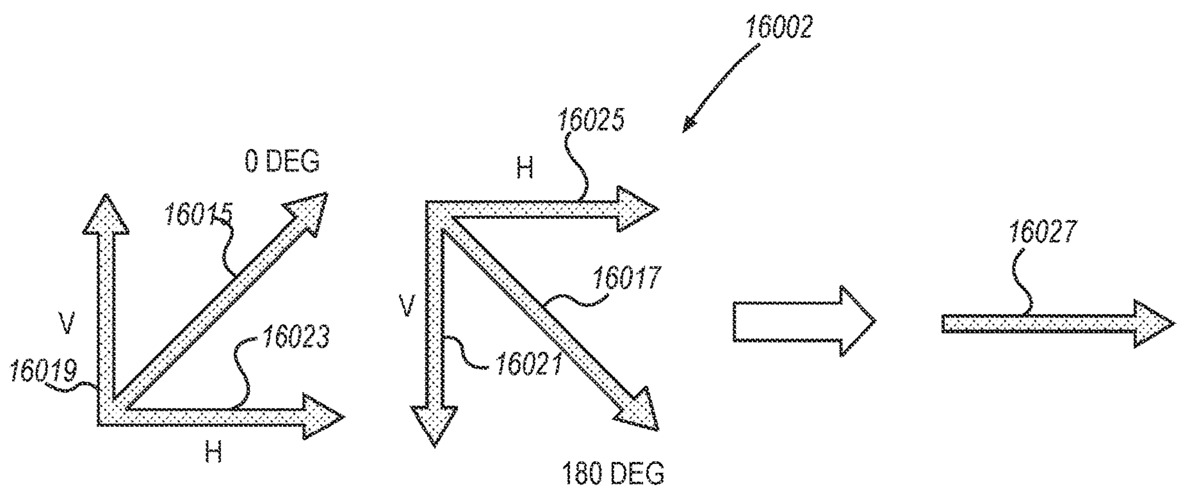

FIG. 160B illustrates obtaining horizontal (H) polarization by use of one hundred eighty degree out-of-phase excitation at the ports of the antenna of FIG. 159B, according to some aspects.

Figure 161A:
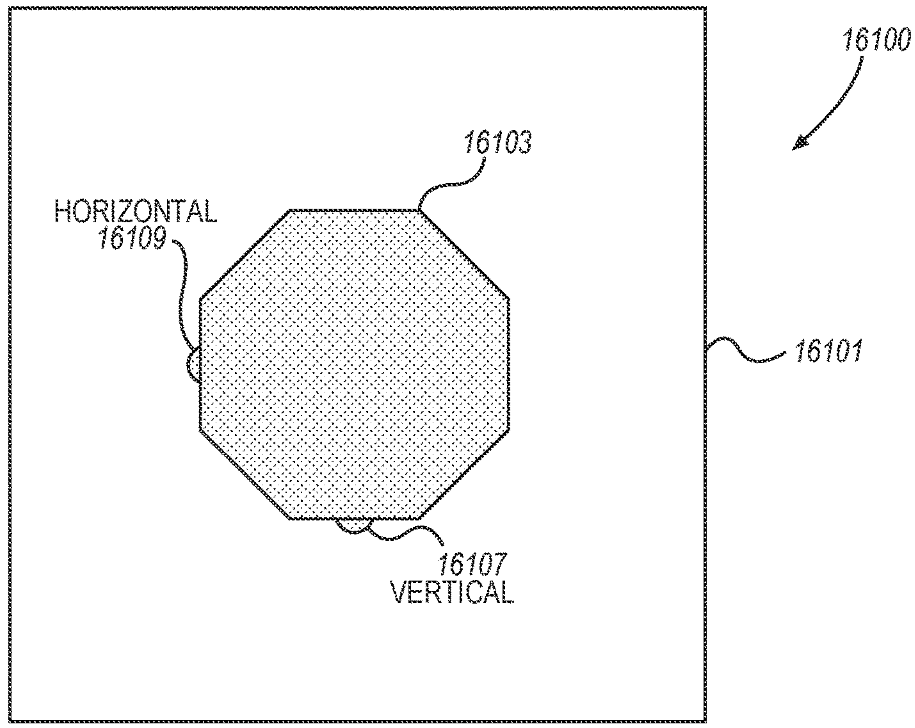

FIG. 161A illustrates the antenna element of FIG. 159A with vertical and horizontal excitation ports, according to some aspects.

Figure 161B:
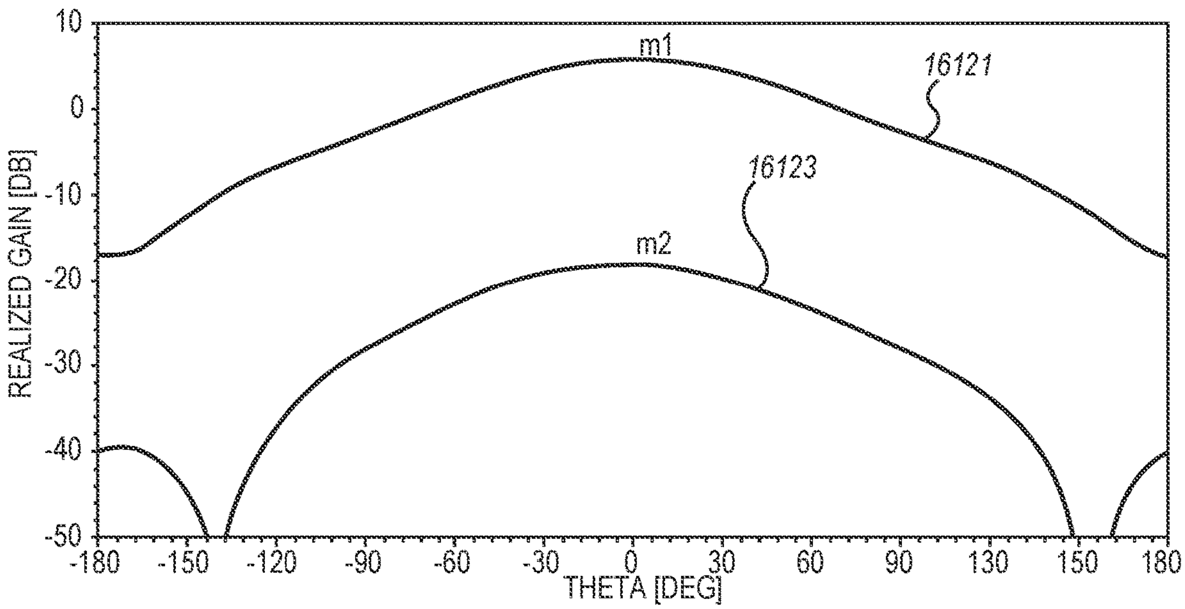

FIG. 161B illustrates exemplary simulated radiation pattern results for the antenna element of FIG. 161A, according to some aspects.

Figure 162A:
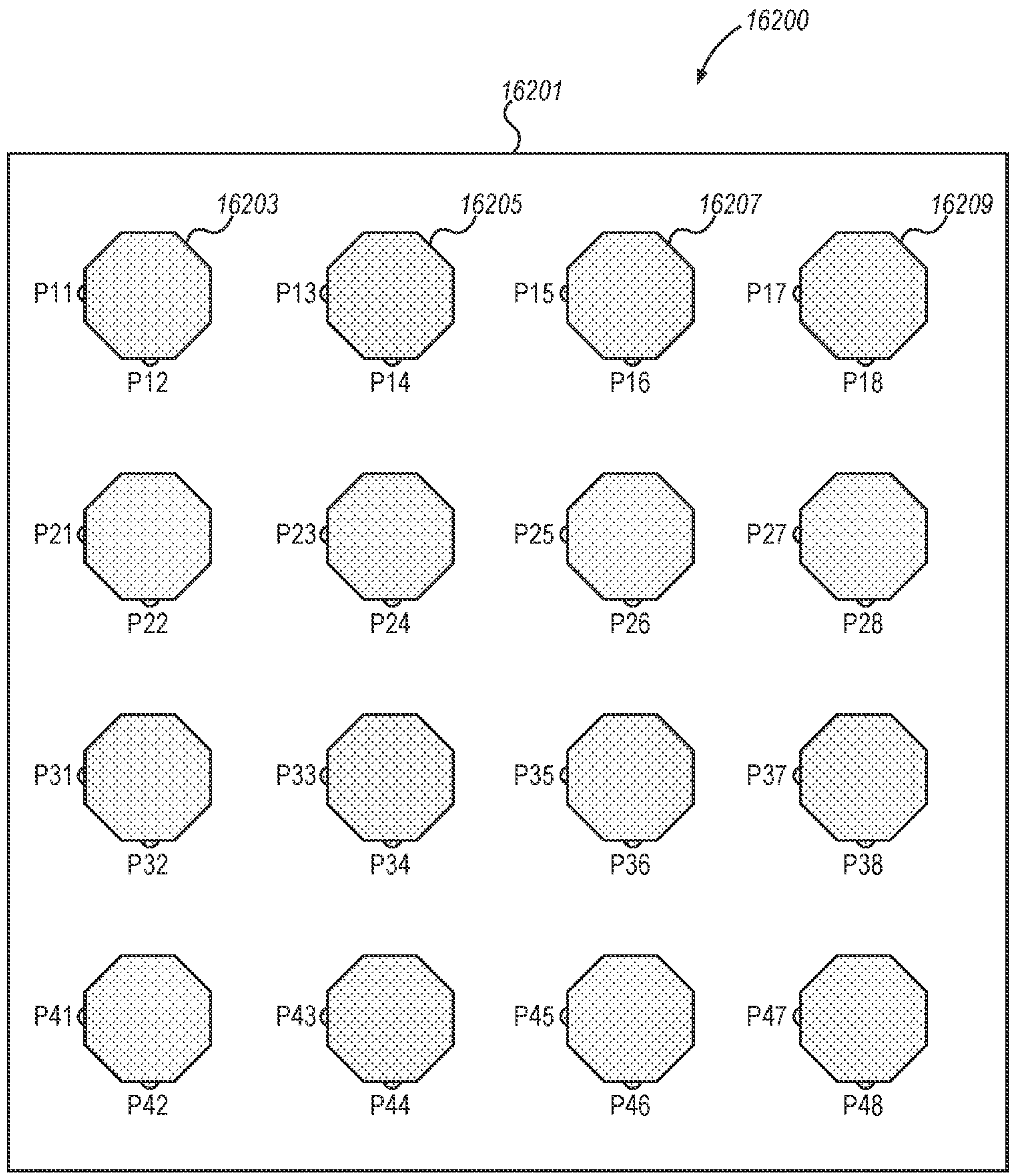

FIG. 162A illustrates an exemplary 4×4 array schematic using orthogonally excited antenna elements, according to some aspects.

Figure 162B:
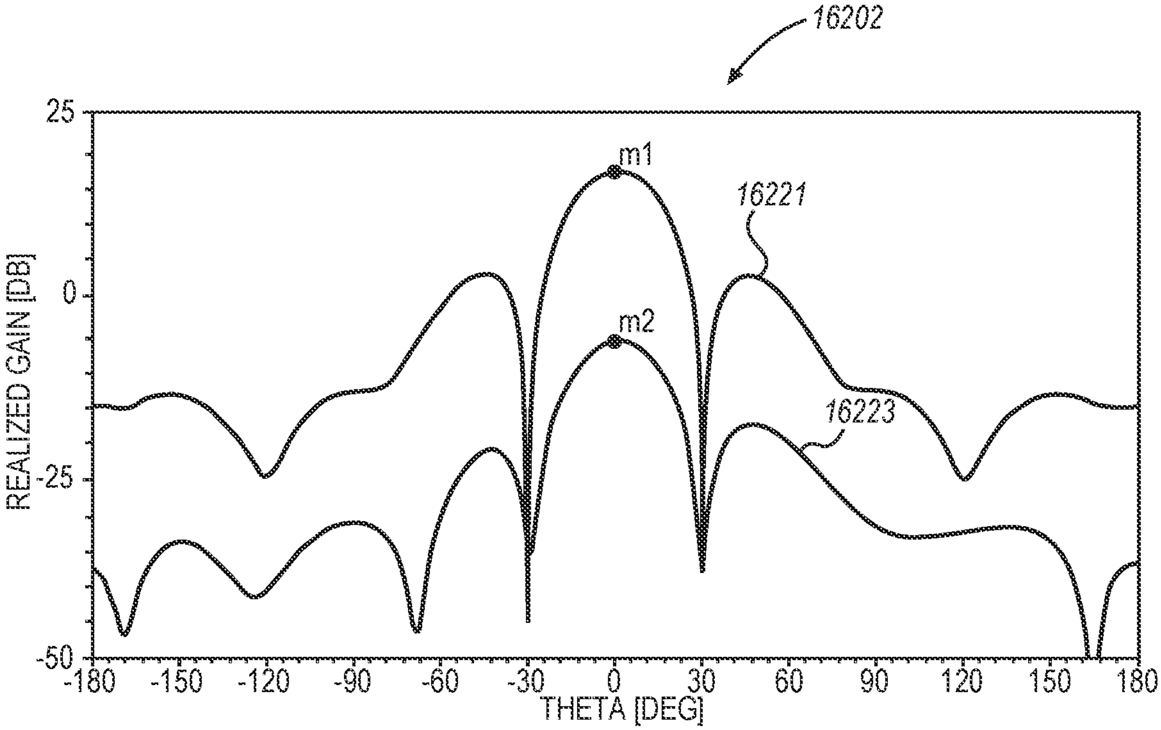

FIG. 162B illustrates exemplary simulated radiation pattern results for the 4×4 array of FIG. 162A with dual-polarized antenna element, according to some aspects.

Figure 162C:
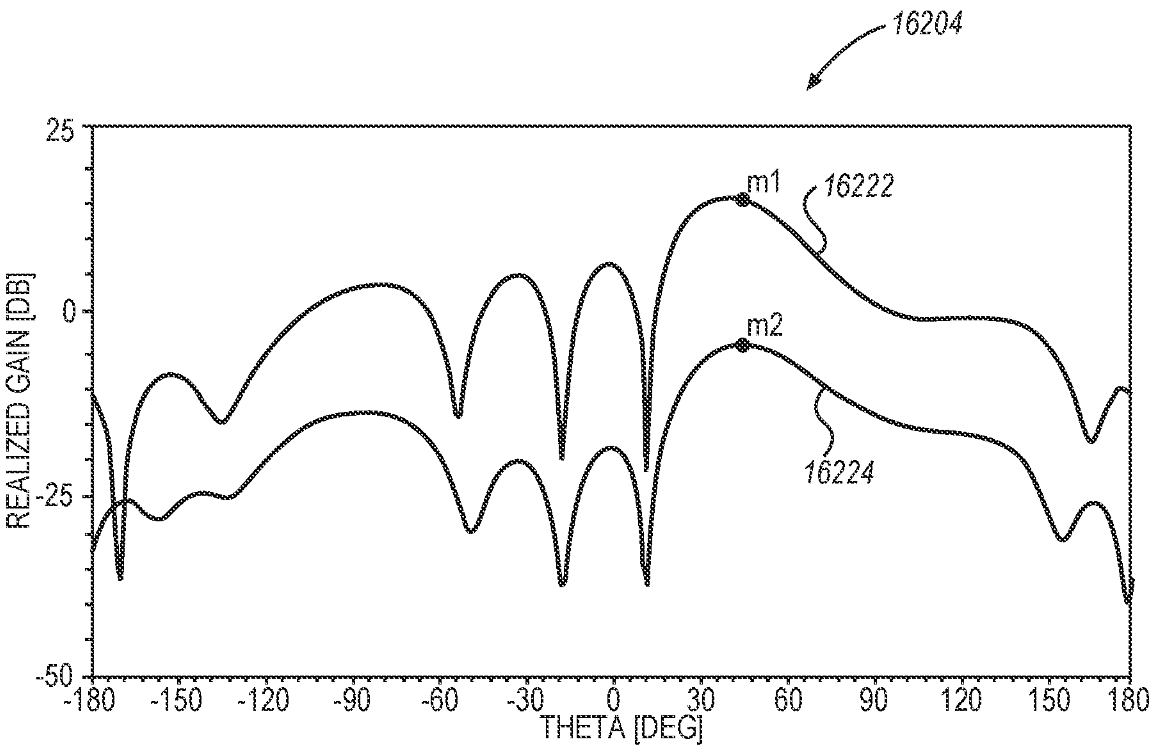

FIG. 162C illustrates exemplary simulated radiation pattern results for at +45 degree scan angle excitation for the array of FIG. 162A, according to some aspects.

Figure 163A:
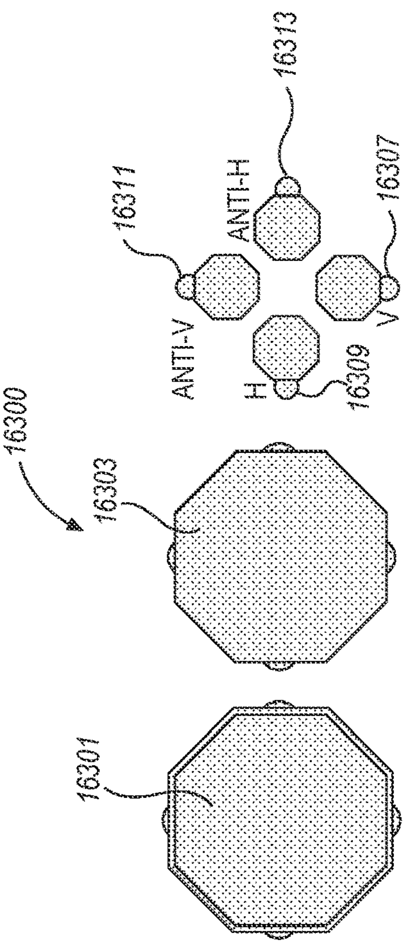

FIG. 163A illustrates an exemplary dual-polarized differential, 4-port patch antenna in an antiphase configuration, according to some aspects.

Figure 163B:
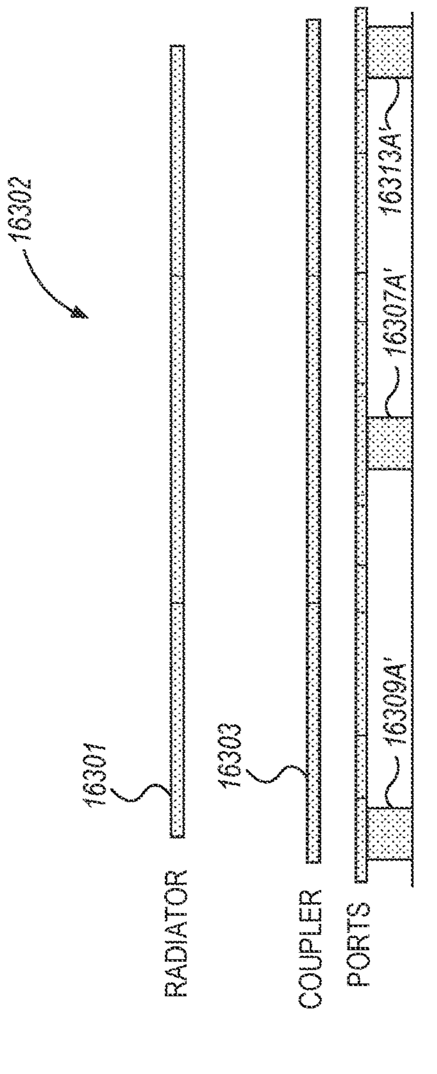

FIG. 163B illustrates the antenna configuration of FIG. 163A in side view according to some aspects.

Figure 163C:
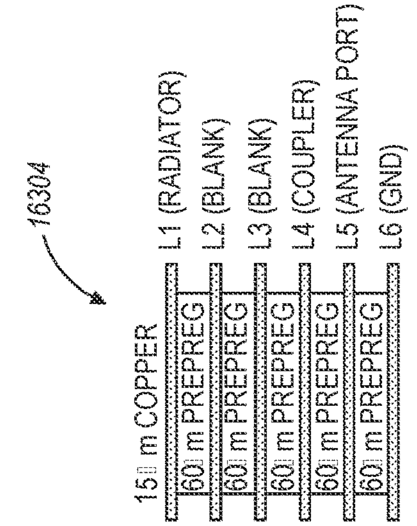

FIG. 163C illustrates an exemplary laminated structure stack-up including levels L1-L6 for the antenna configurations of FIGS. 162A and 162B, according to some aspects.

Figure 163D:
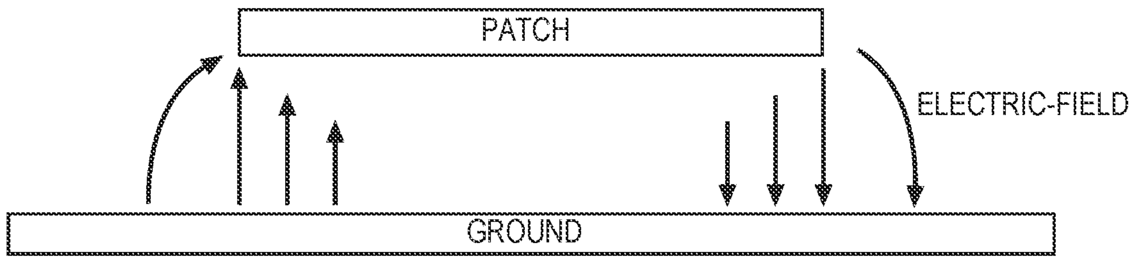

FIG. 163D illustrates exemplary patch antenna polarity in accordance with some aspects.

Figure 163E:
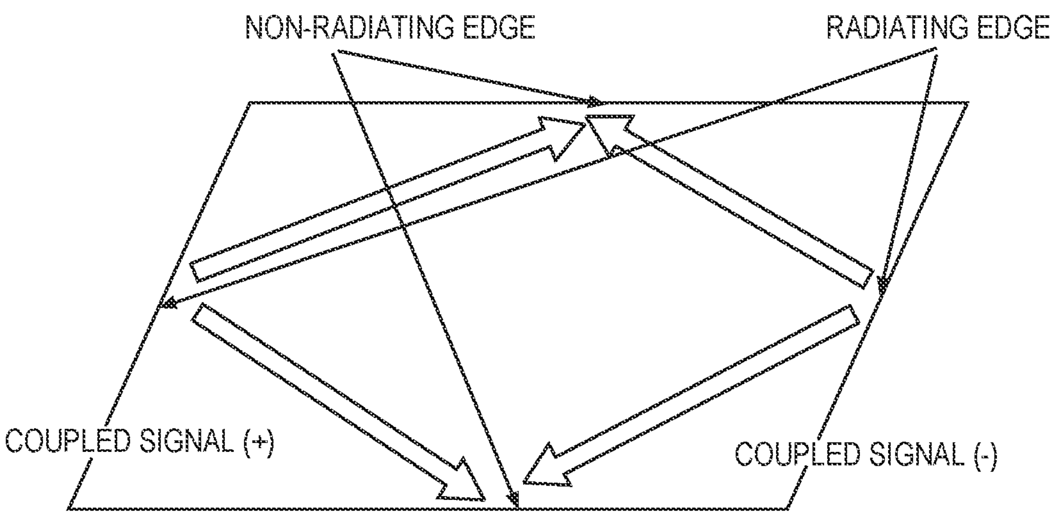

FIG. 163E illustrates exemplary suppression of cross-polarization levels according to some aspects.

Figure 164:
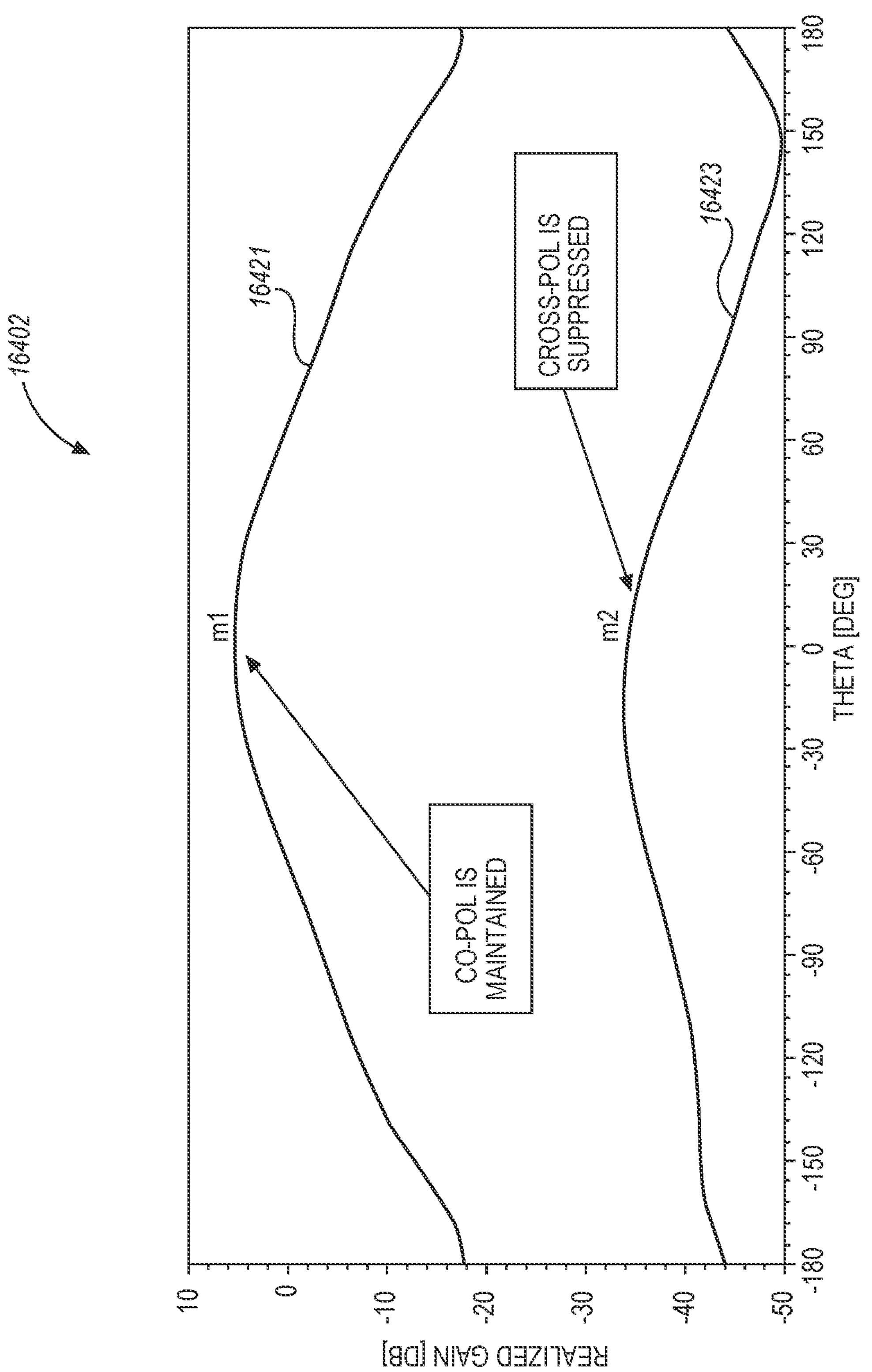

FIG. 164 illustrates exemplary simulated radiation pattern results for the 4-port antenna configuration aspect of FIGS. 163A through 163C, according to some aspects.

Figure 165B:
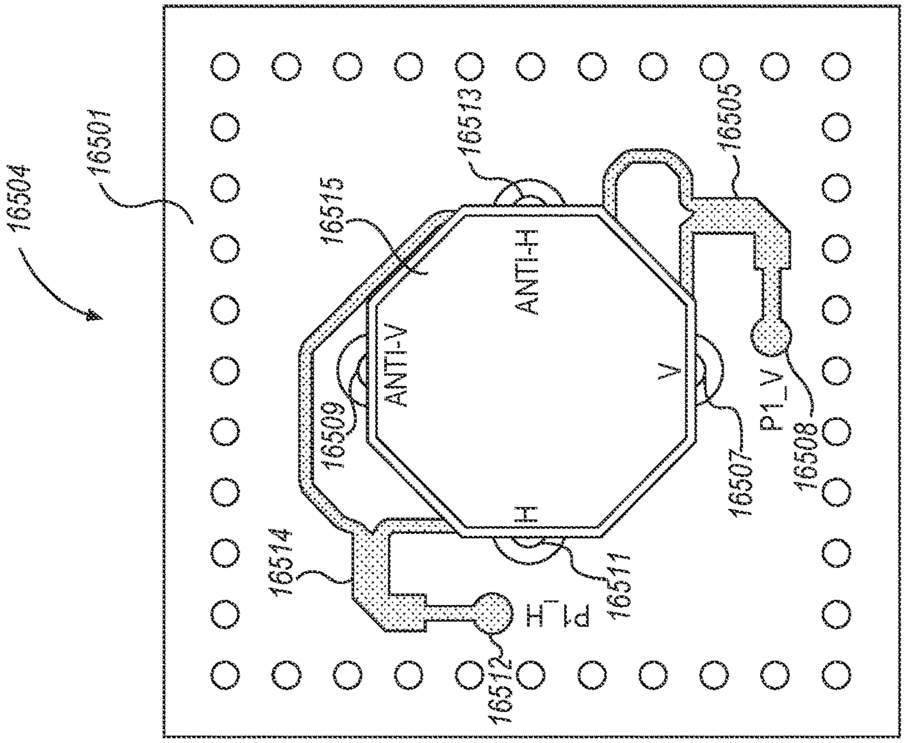
Figure 165A:
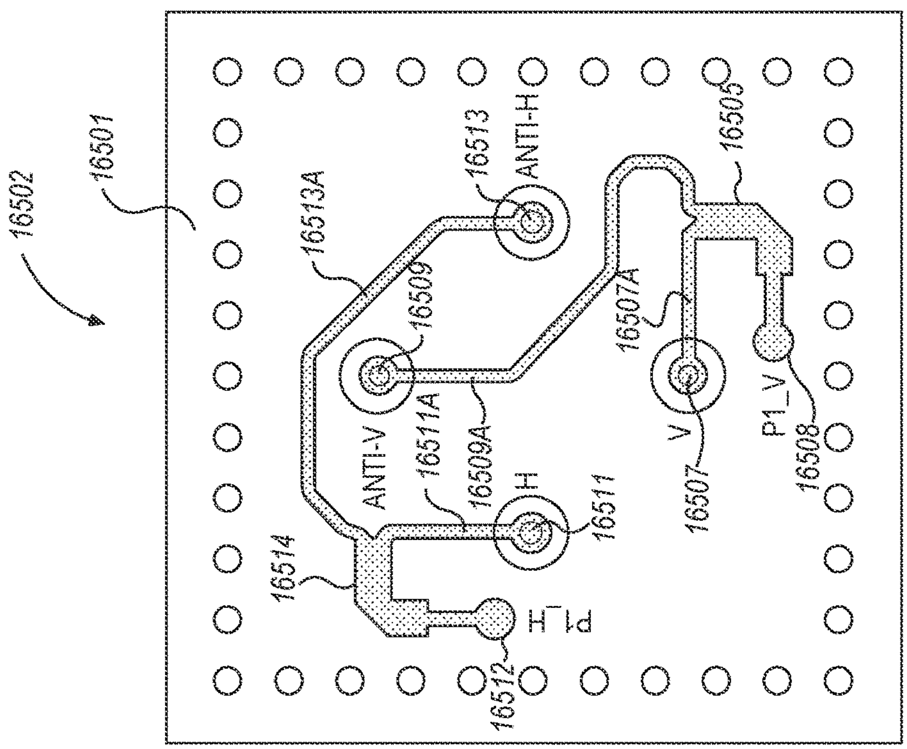

FIG. 165A illustrates an exemplary 4-port excitation antenna topology with feed lines from a feed source to each of the four ports, according to some aspects.

FIG. 165B illustrates the feed lines in the 4-port configuration of FIG. 165A with the driven patch of the stacked patch antenna superimposed on the feed lines, according to some aspects.

Figure 165C:
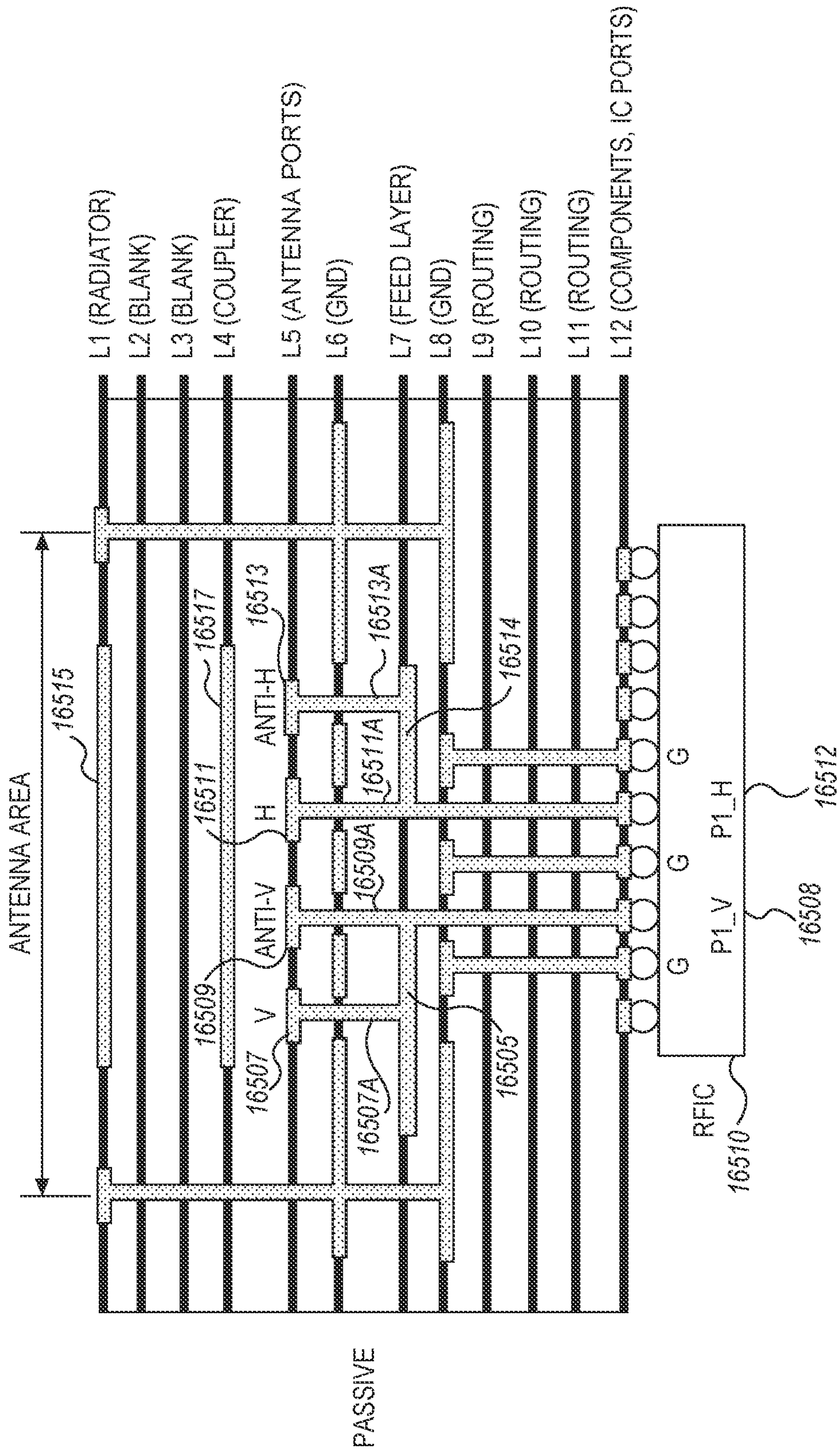

FIG. 165C illustrates an exemplary 12-level stack-up for the aspect of FIG. 165B.

Figure 166A:
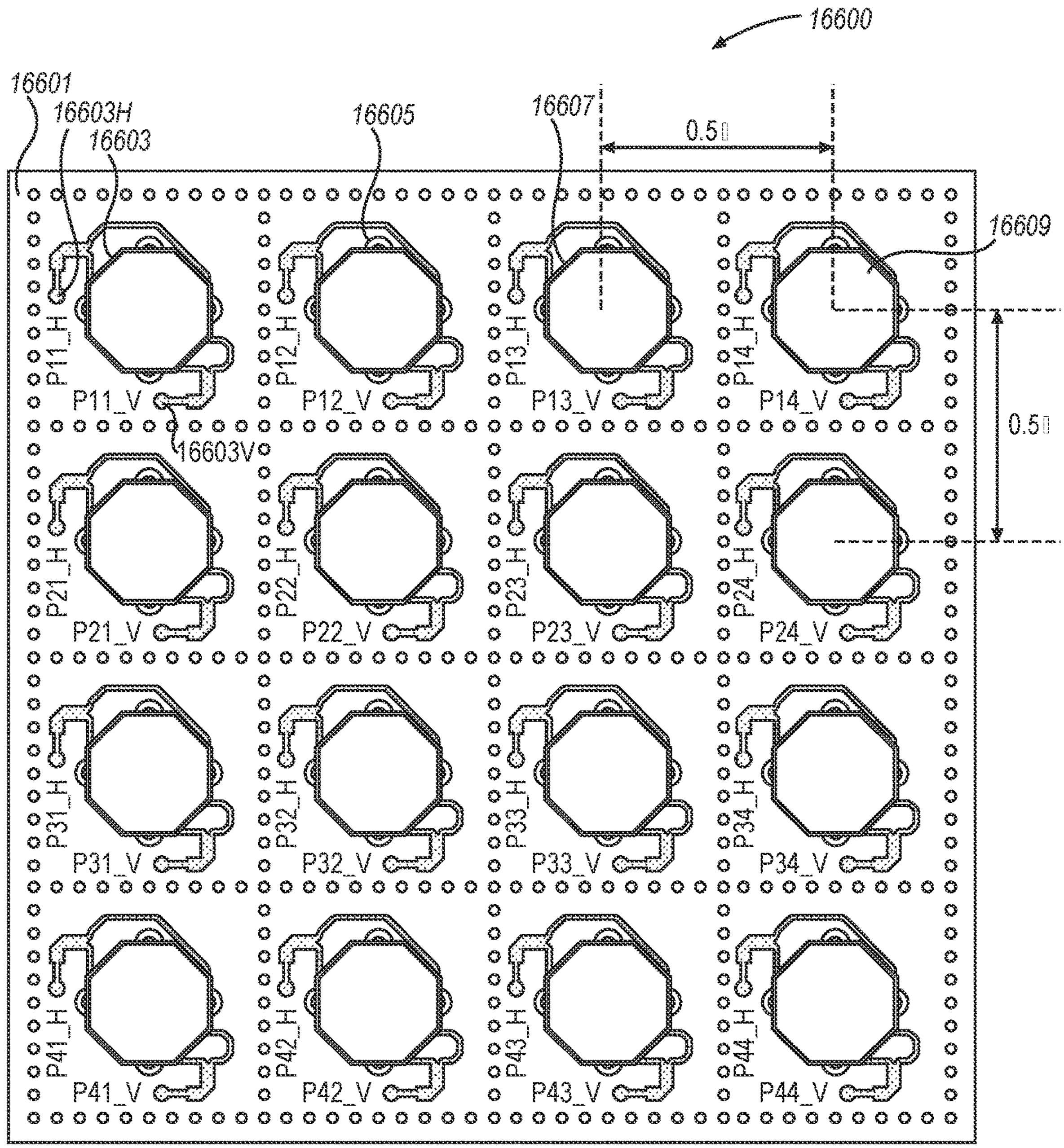

FIG. 166A illustrates an exemplary 4×4 antenna array schematic using 4-port elements integrated with feed networks, according to some aspects.

Figure 166B:
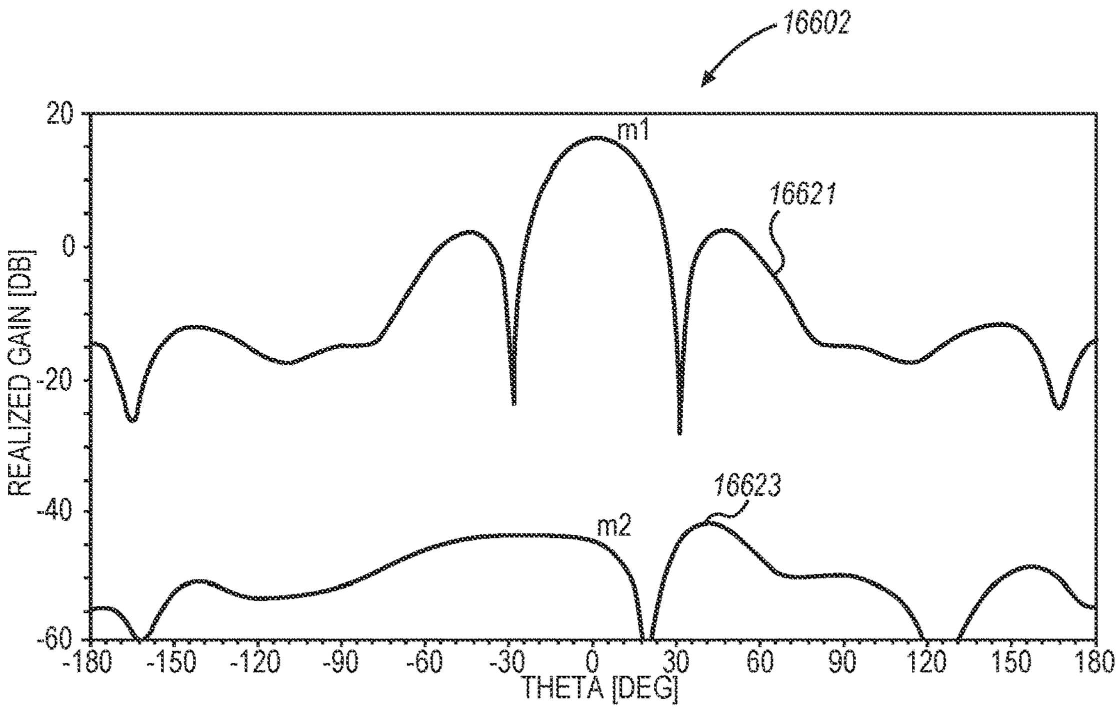
Figure 166C:
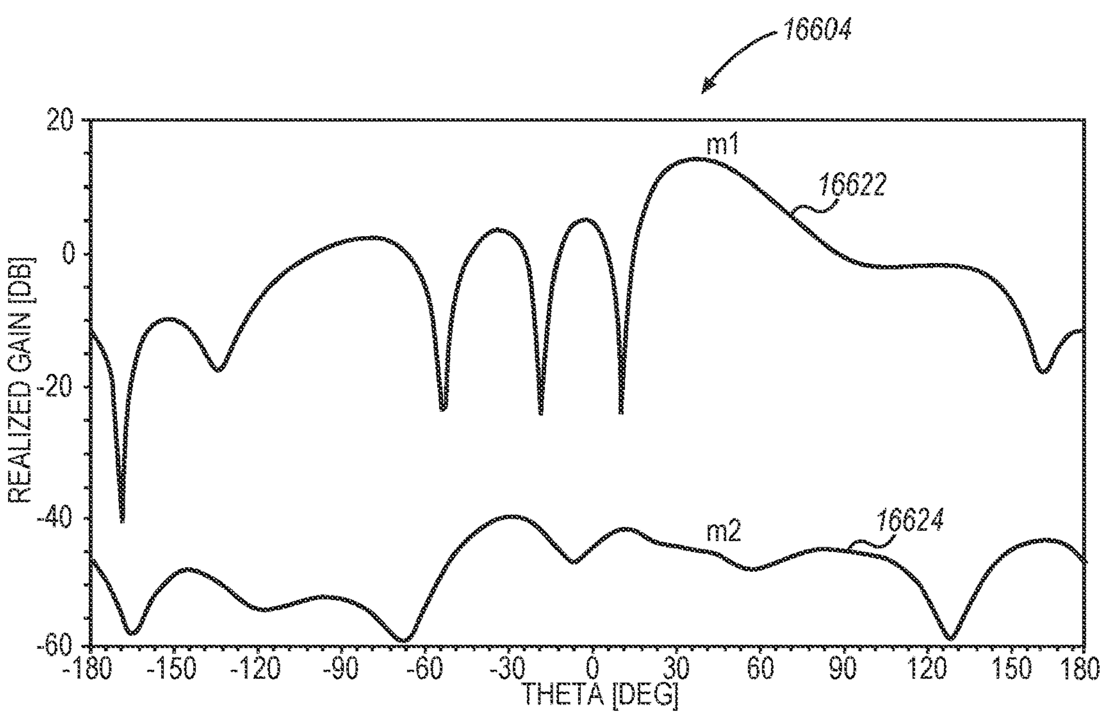

FIG. 166B and FIG. 166C illustrate exemplary simulated radiation pattern results for the 4-port antenna array of FIG. 166A, according to some aspects.

Figure 167A:
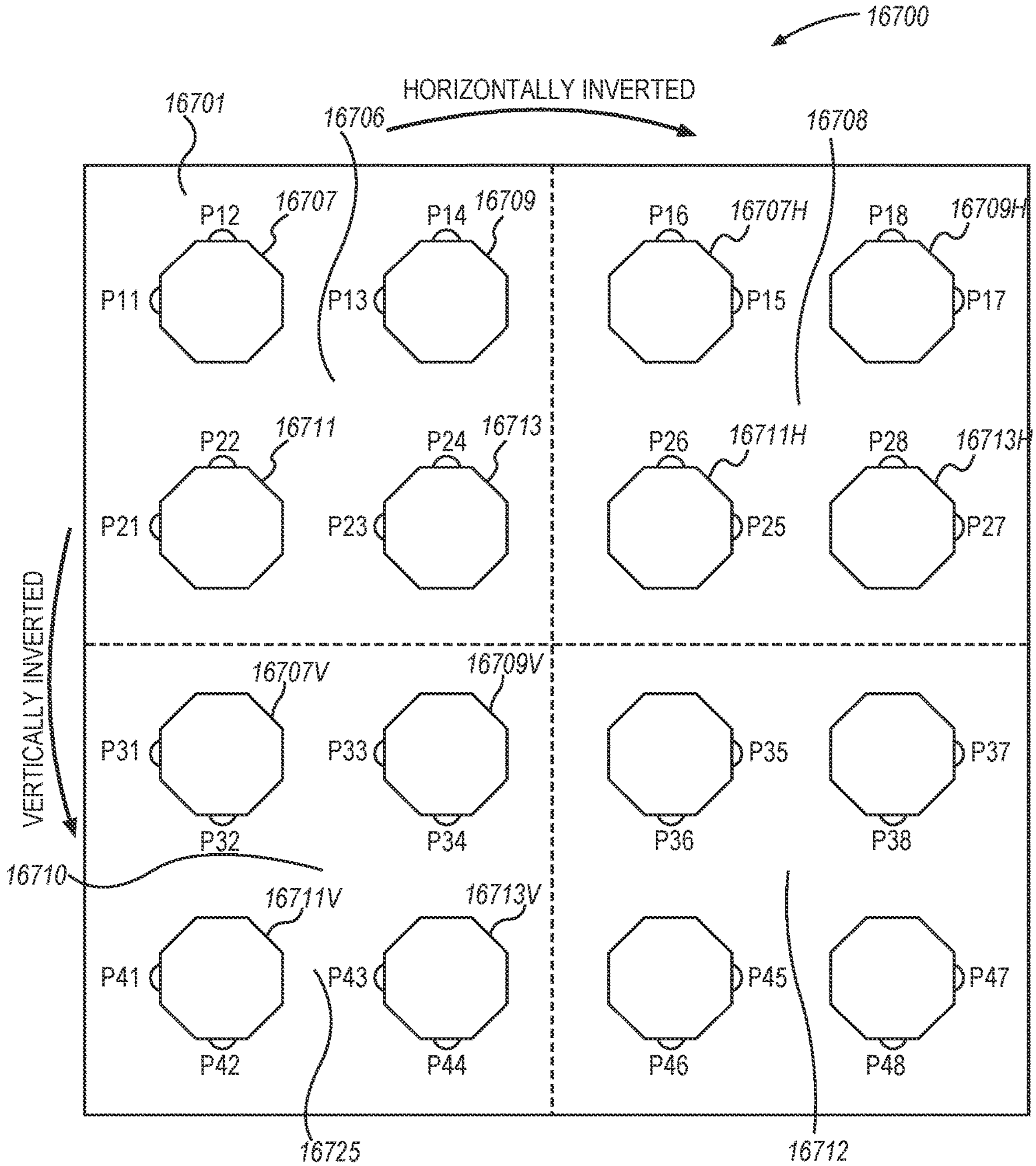

FIG. 167A illustrates an exemplary array configuration using 2-port dual-polarized antenna elements, according to some aspects.

Figure 167B:
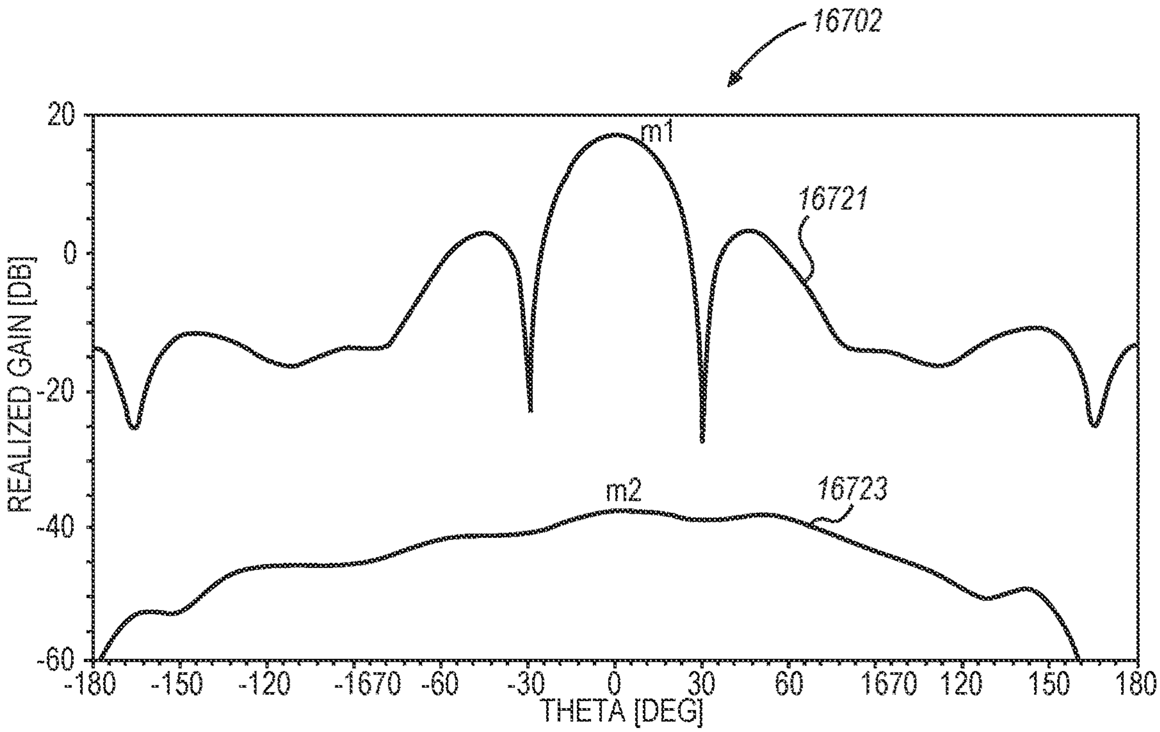
Figure 167C:
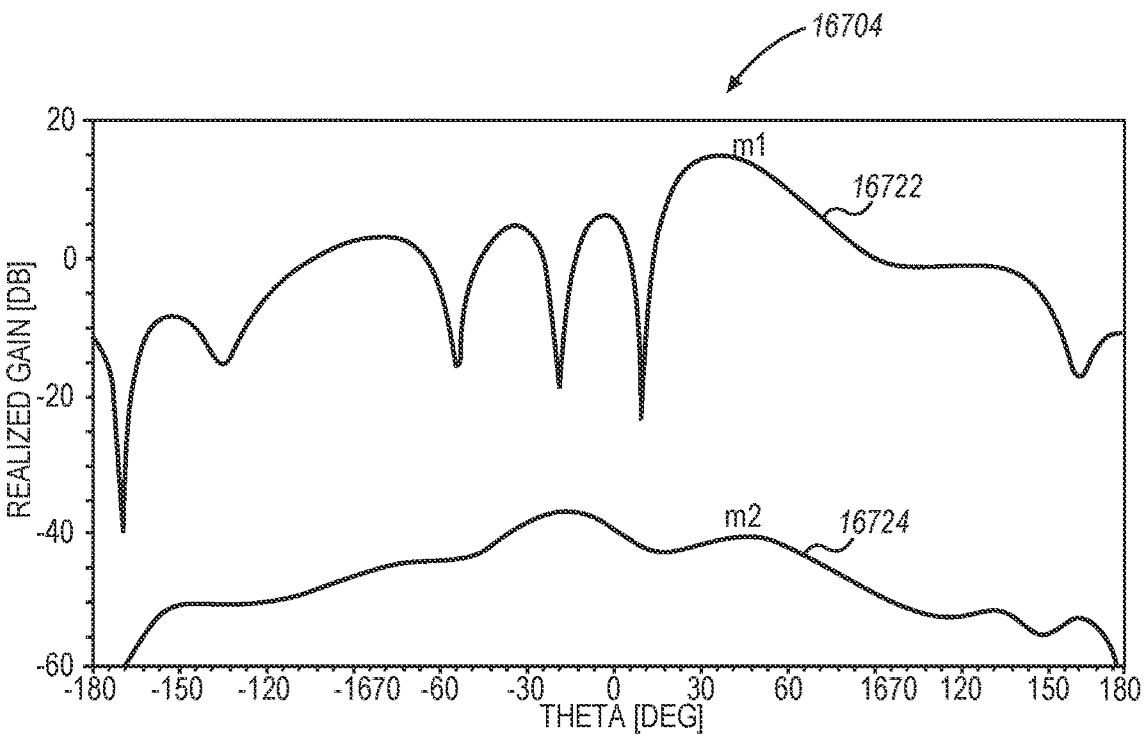

FIG. 167B and FIG. 167C illustrate exemplary simulated radiation pattern results for the antenna array of FIG. 167A, according to some aspects.

Figure 168A:
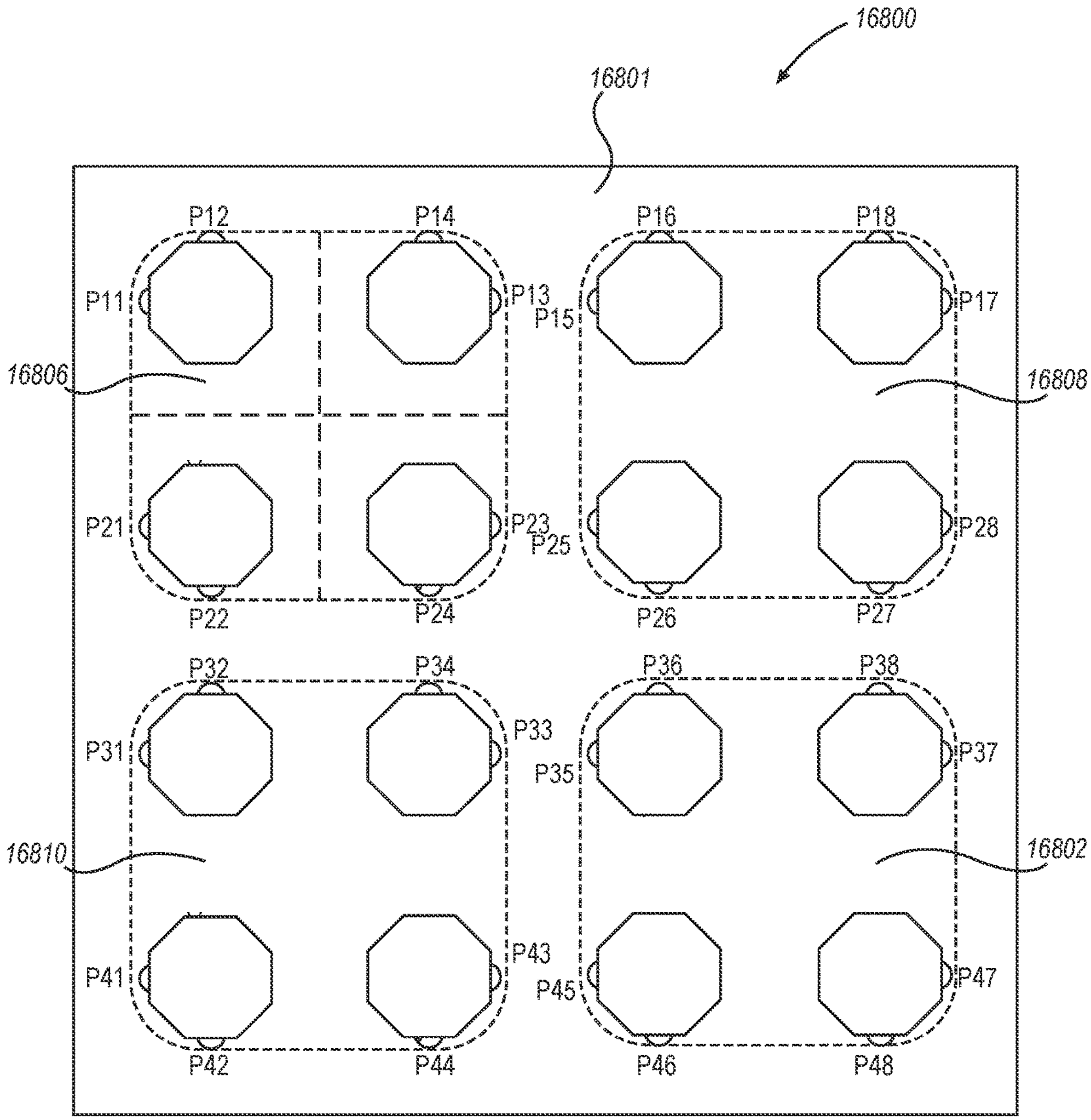

FIG. 168A illustrates another exemplary array configuration using 2-port dual-polarized antenna elements, according to some aspects.

Figure 168B:
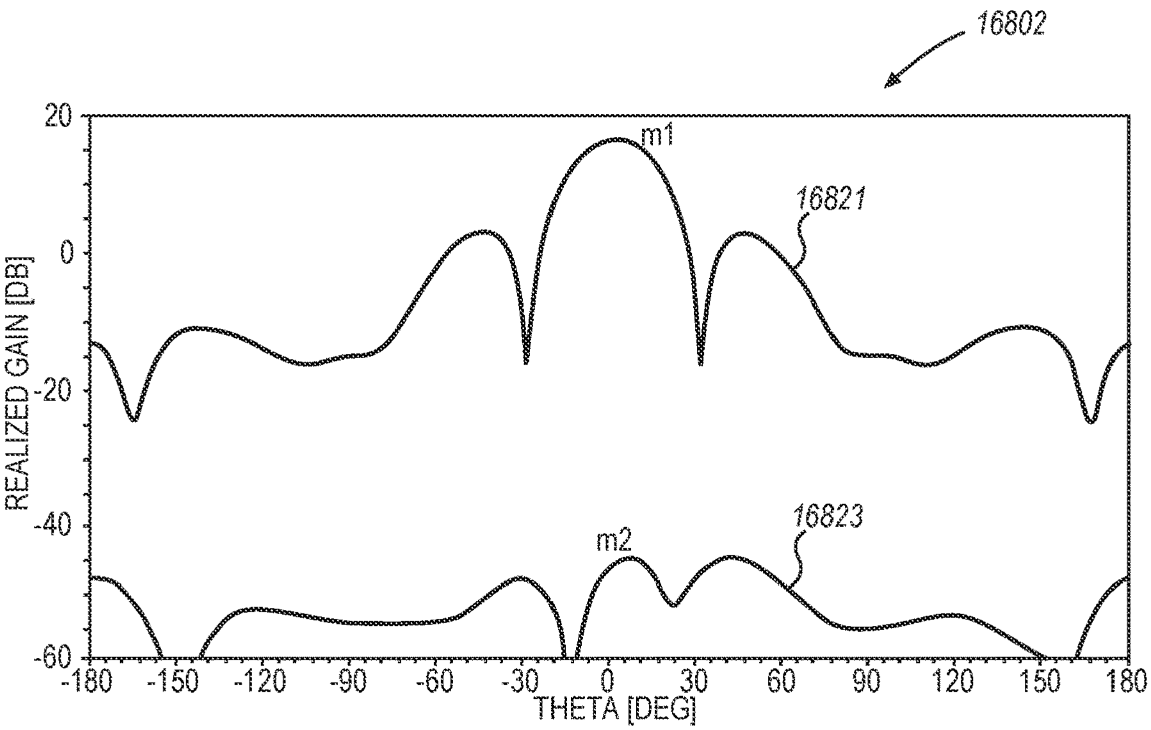
Figure 168C:
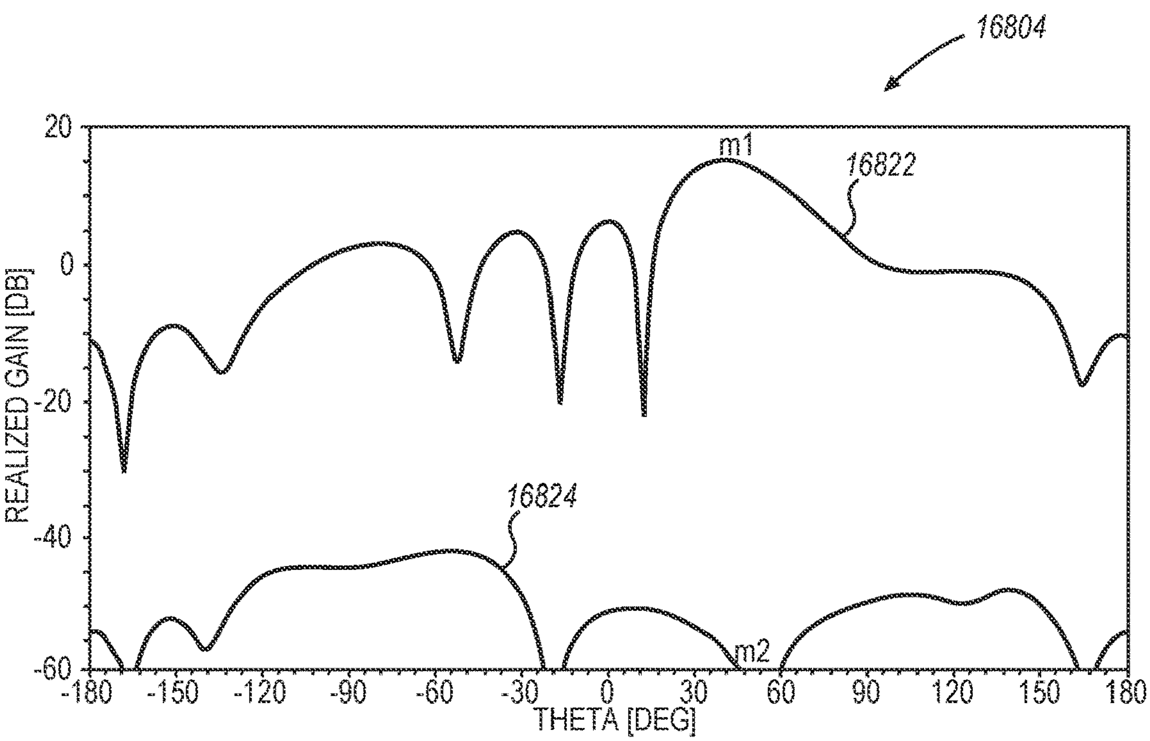

FIG. 168B and FIG. 168C illustrate exemplary simulation results on radiation patterns for FIG. 168A, according to some aspects.

Figure 169:
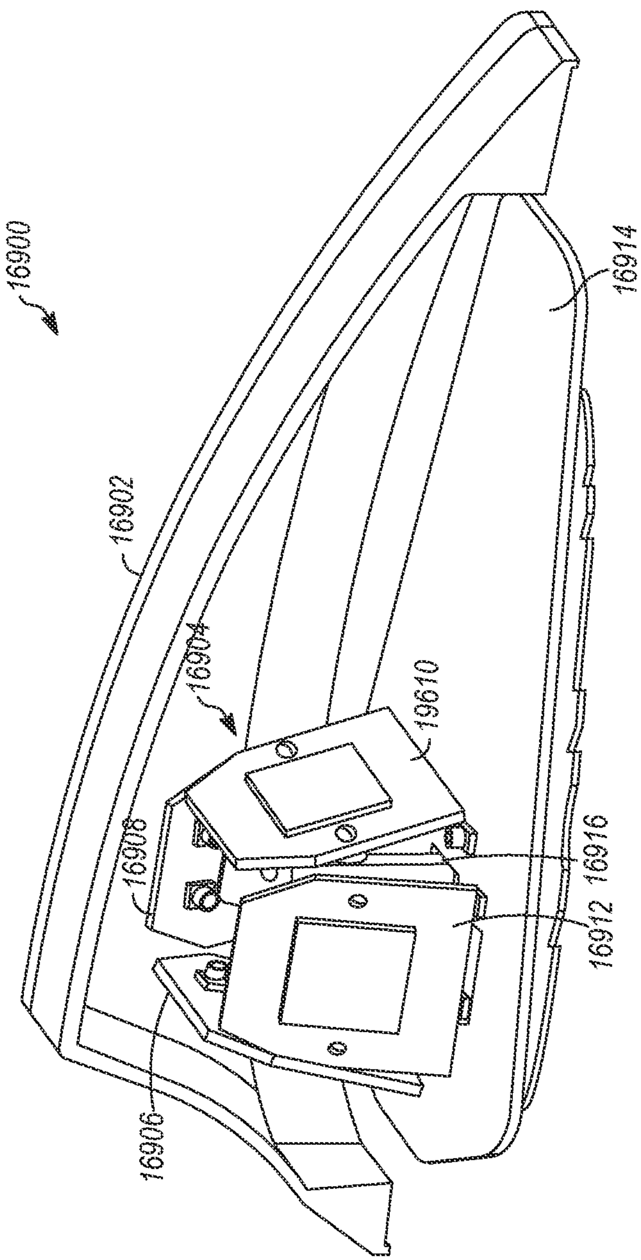

FIG. 169 illustrates an exemplary mast-mounted mmWave antenna block with multiple antenna arrays for vehicle-to-everything (V2X) communications according to some aspects.

Figure 170:
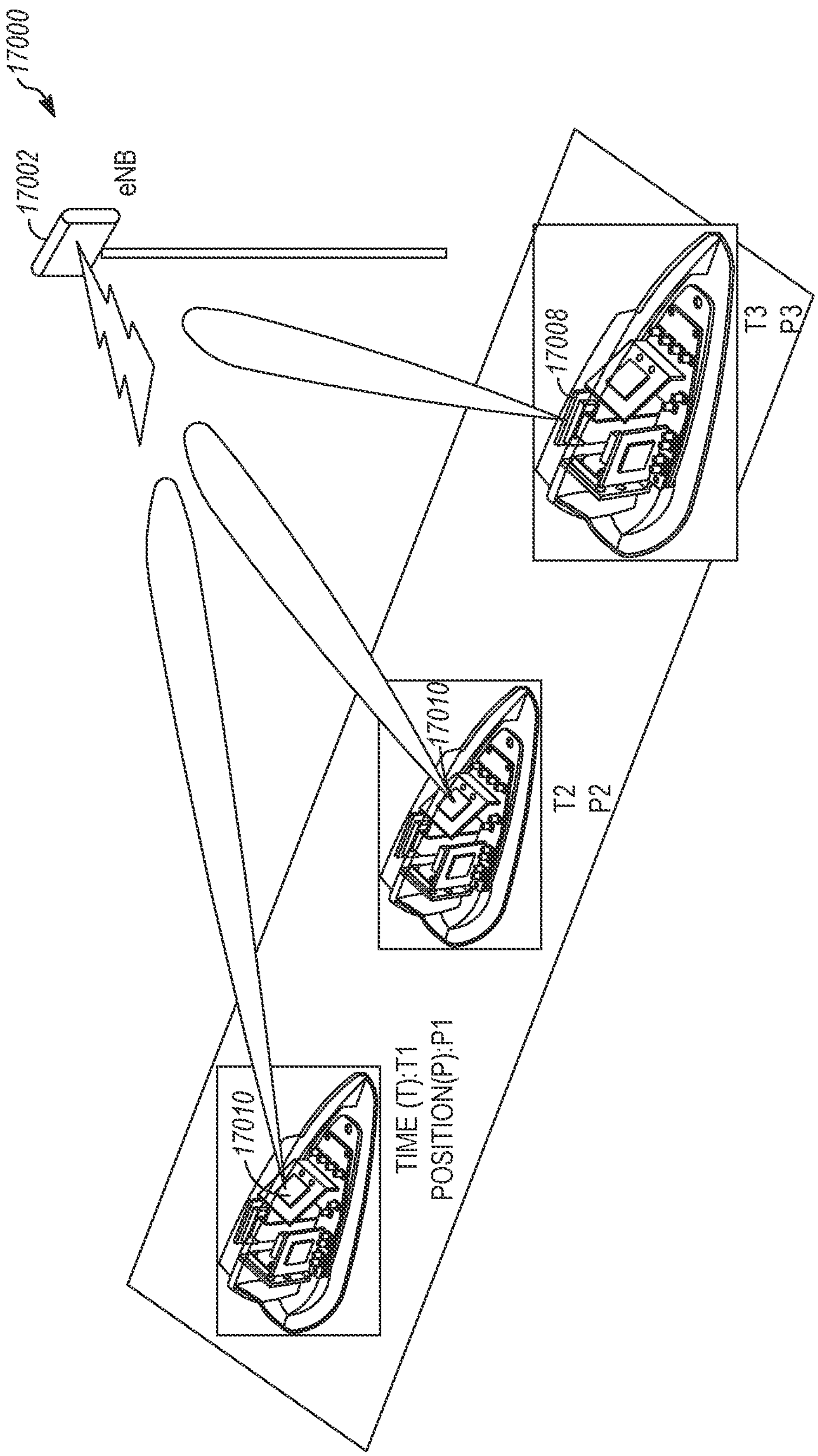

FIG. 170 illustrates exemplary beam steering and antenna switching in a millimeter wave antenna array communicating with a single evolved Node-B (eNB according to some aspects.

Figure 171:
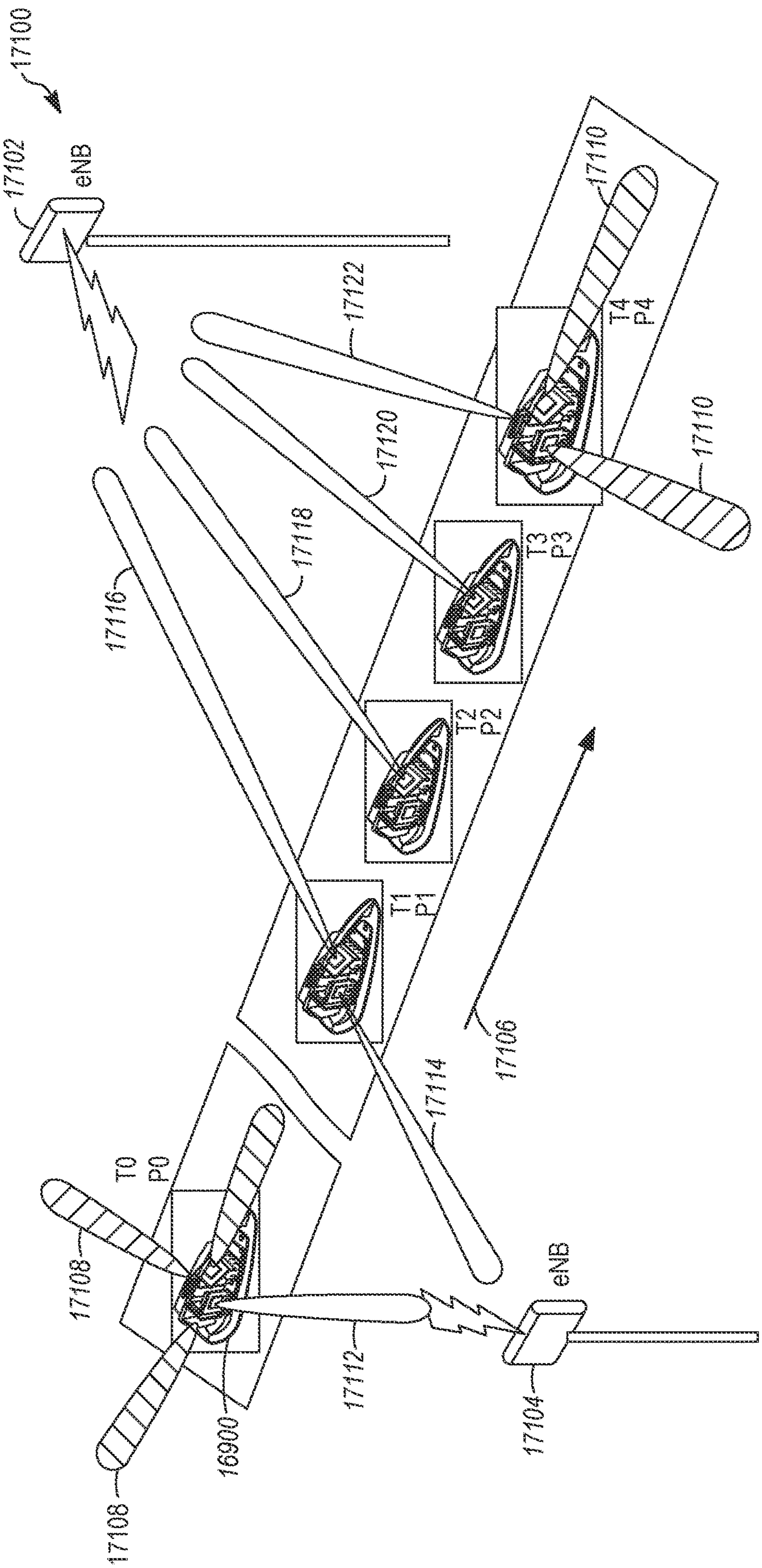

FIG. 171 illustrates exemplary beam steering and antenna switching in a millimeter wave antenna array communicating with multiple eNBs according to some aspects.

Figure 172:
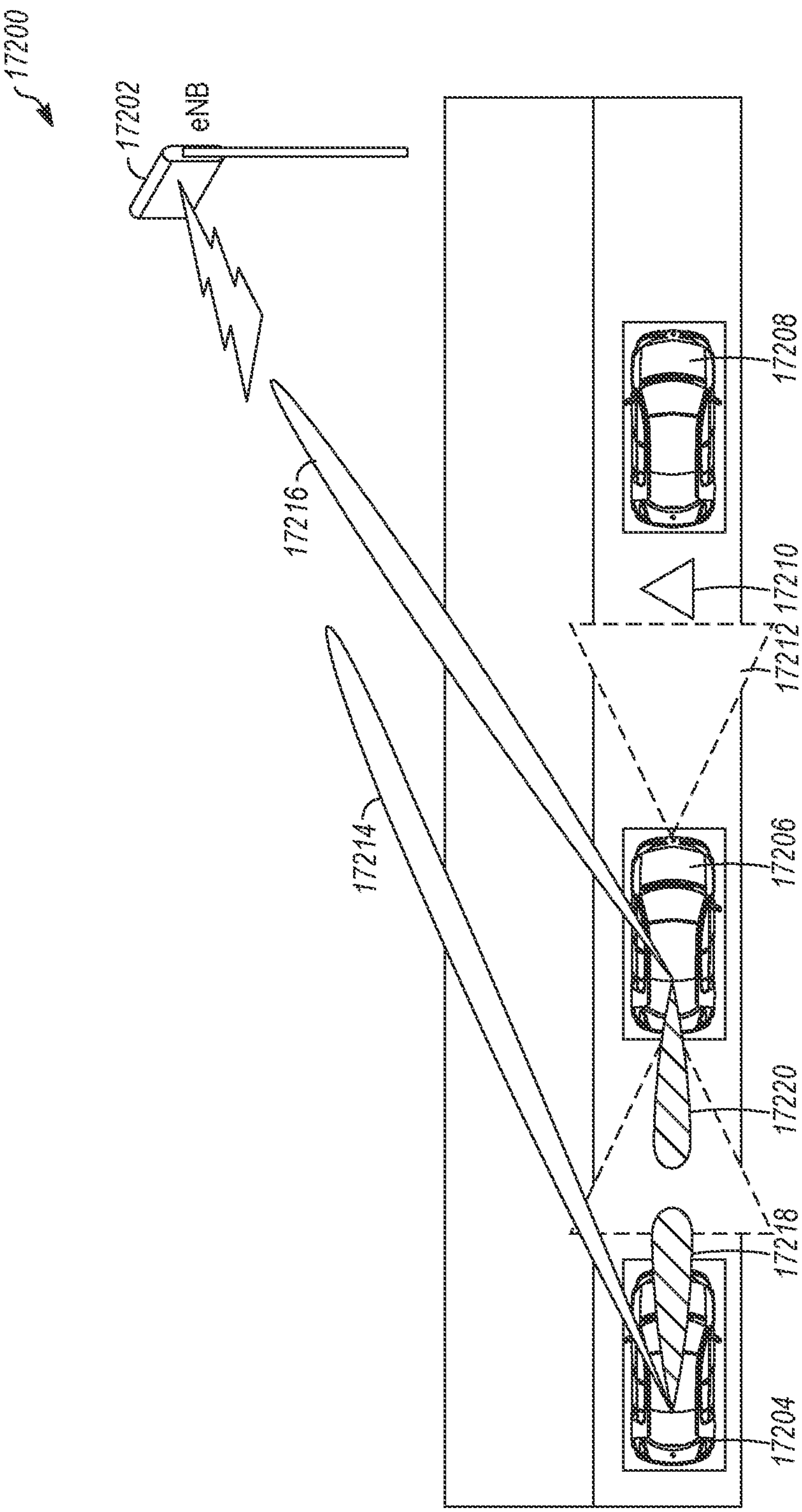

FIG. 172 illustrates exemplary simultaneous millimeter wave communications with multiple devices using an antenna block with multiple antenna arrays according to some aspects.

Figure 173:
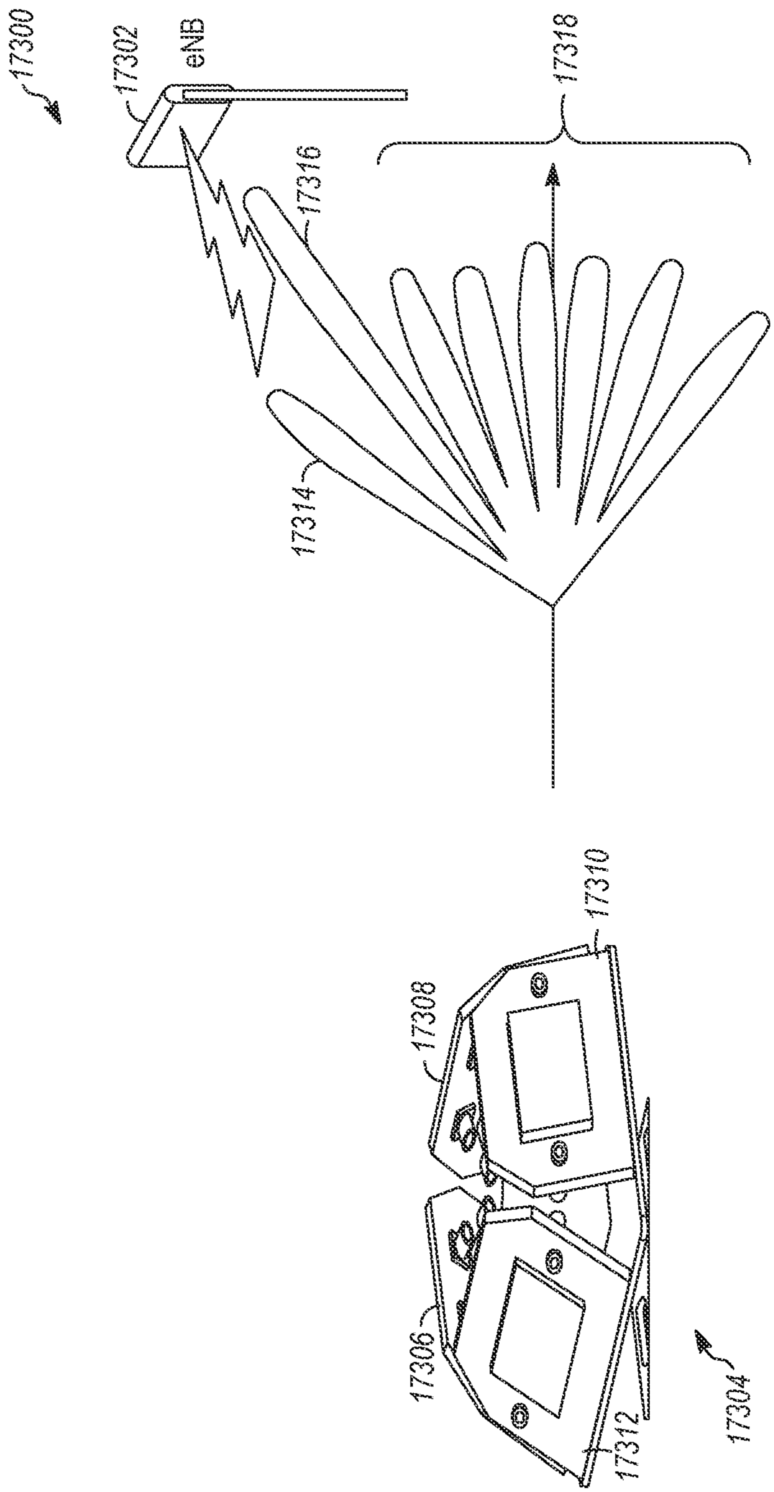

FIG. 173 illustrates multiple exemplary beams, which can be used for millimeter wave communications by an antenna block that includes multiple antenna arrays according to some aspects.

Figure 174:
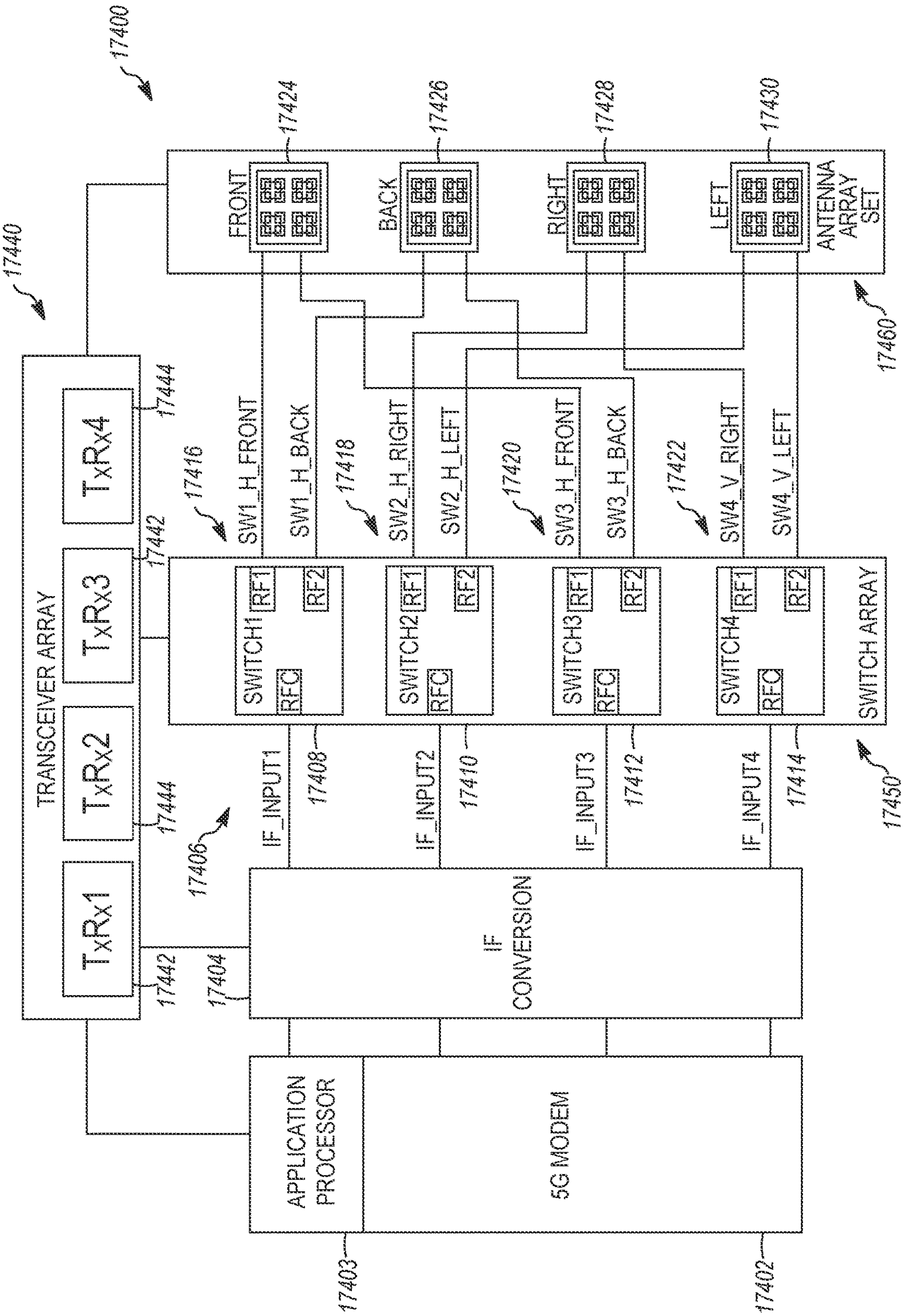

FIG. 174 is a block diagram of an exemplary millimeter wave communication device using the antenna block with multiple antenna arrays of FIG. 169 according to some aspects.

Figure 175C:
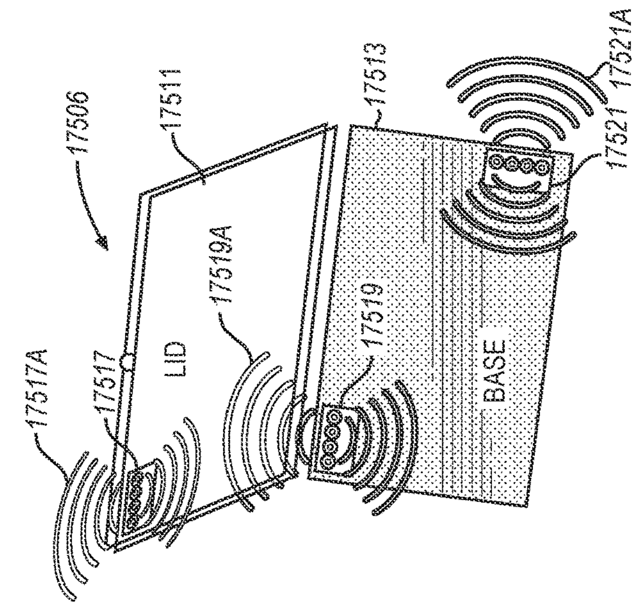
Figure 175B:
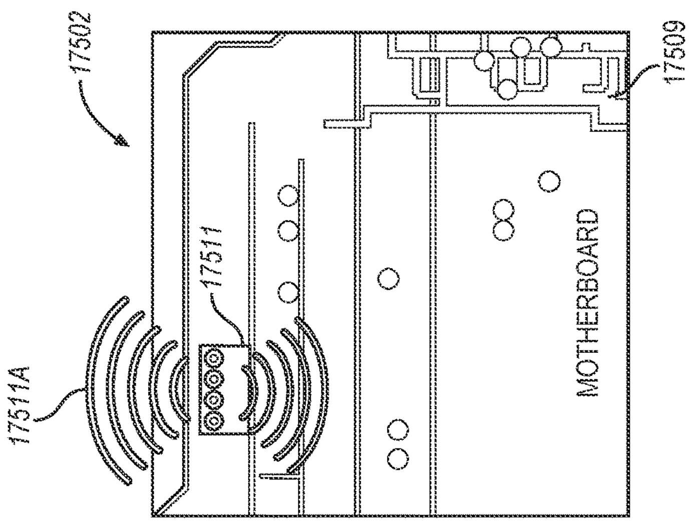
Figure 175A:
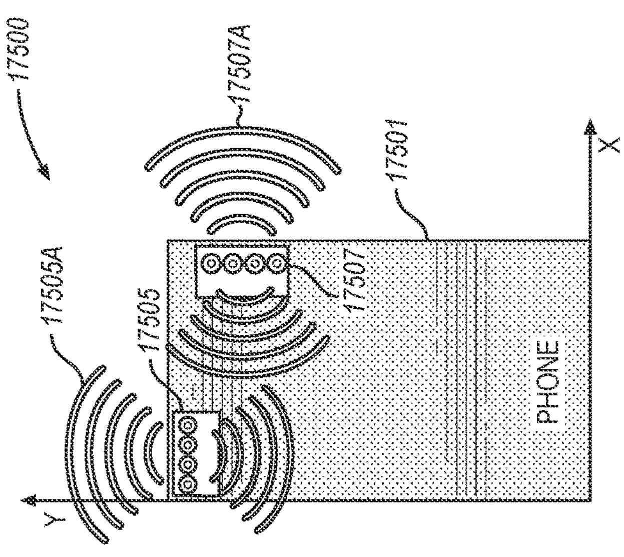

FIG. 175A is an illustration of an exemplary via-antenna array configured in a mobile phone, according to some aspects.

FIG. 175B is an illustration of an exemplary via-antenna array configured in a laptop, according to some aspects.

FIG. 175C is an illustration of an exemplary via-antenna array configured on a motherboard PCB, according to some aspects.

Figure 176A:
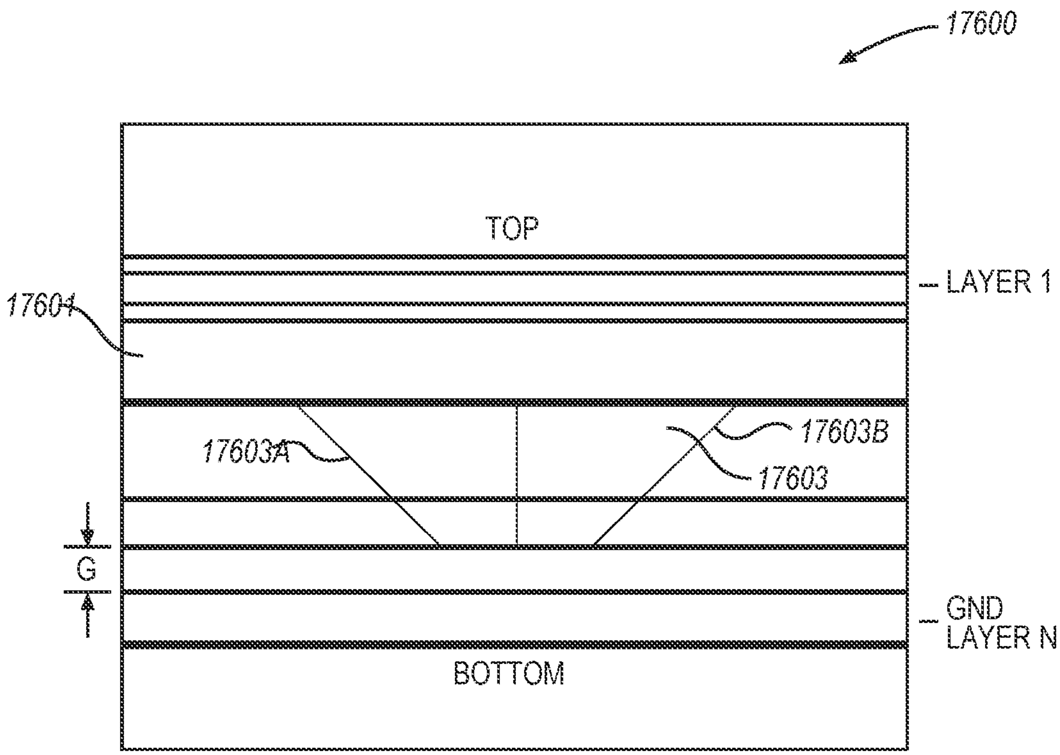

FIG. 176A is a cross section view of an exemplary via-antenna in a multilayer PCB, according to some aspects.

Figure 176B:
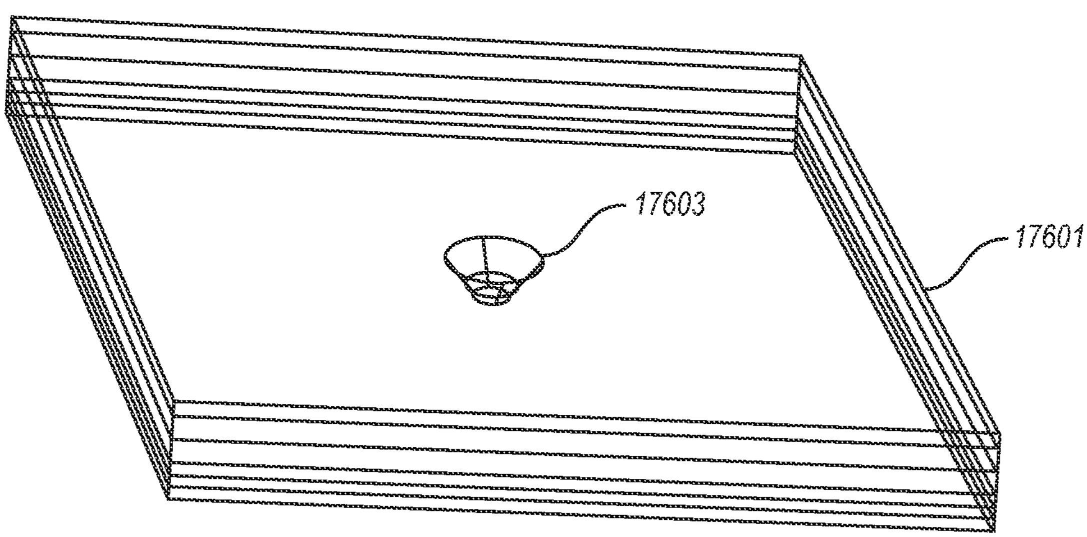

FIG. 176B is a perspective view of an exemplary via-antenna, according to some aspects.

Figure 177A:
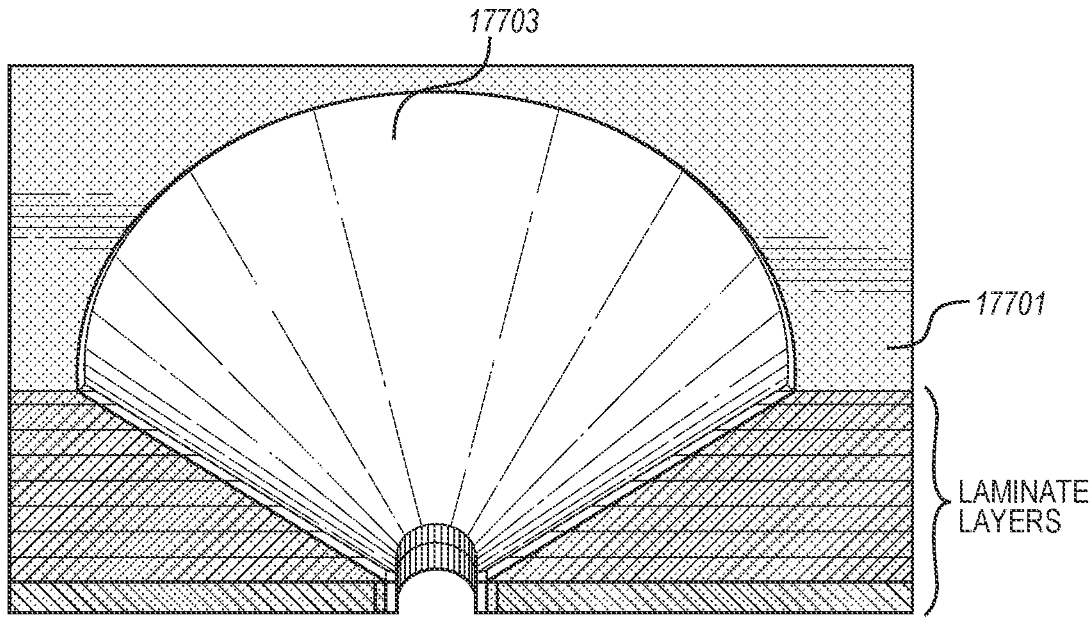

FIG. 177A is an illustration of an exemplary PCB via-antenna internal view from the top of a PCB, according to some aspects.

Figure 177B:
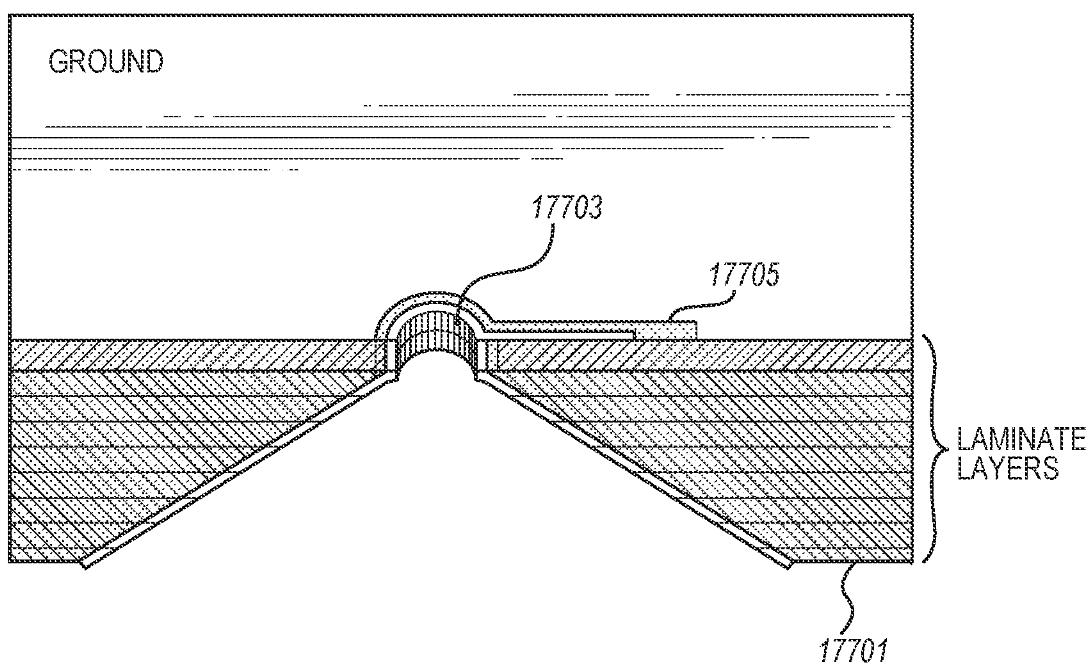

FIG. 177B is an illustration of an exemplary PCB via-antenna viewed from the bottom of a PCB, according to some aspects.

Figure 178A:
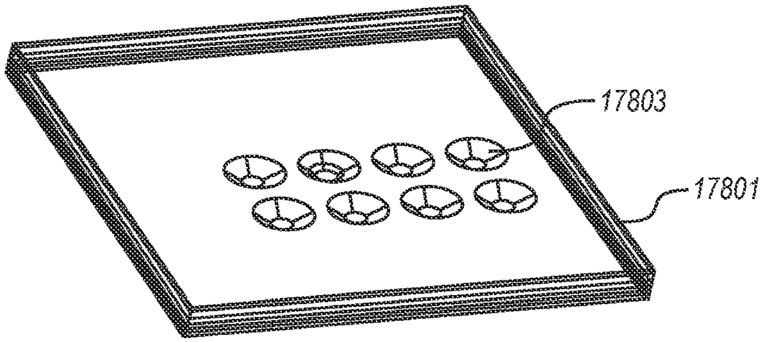

FIG. 178A is a top view of an exemplary via-antenna array, according to some aspects.

Figure 178B:
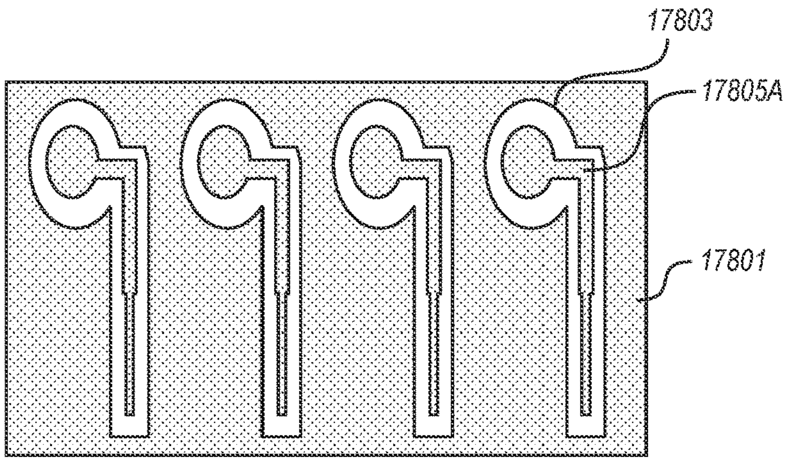

FIG. 178B is an illustration of an exemplary vertical feed for a via-antenna, according to some aspects.

Figure 178C:
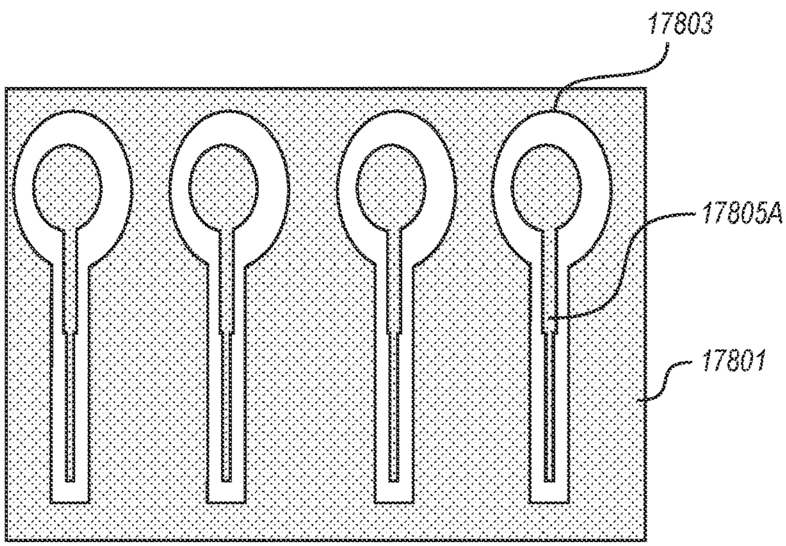

FIG. 178C is an illustration of an exemplary horizontal feed for a via-antenna, according to some aspects.

Figure 179A:
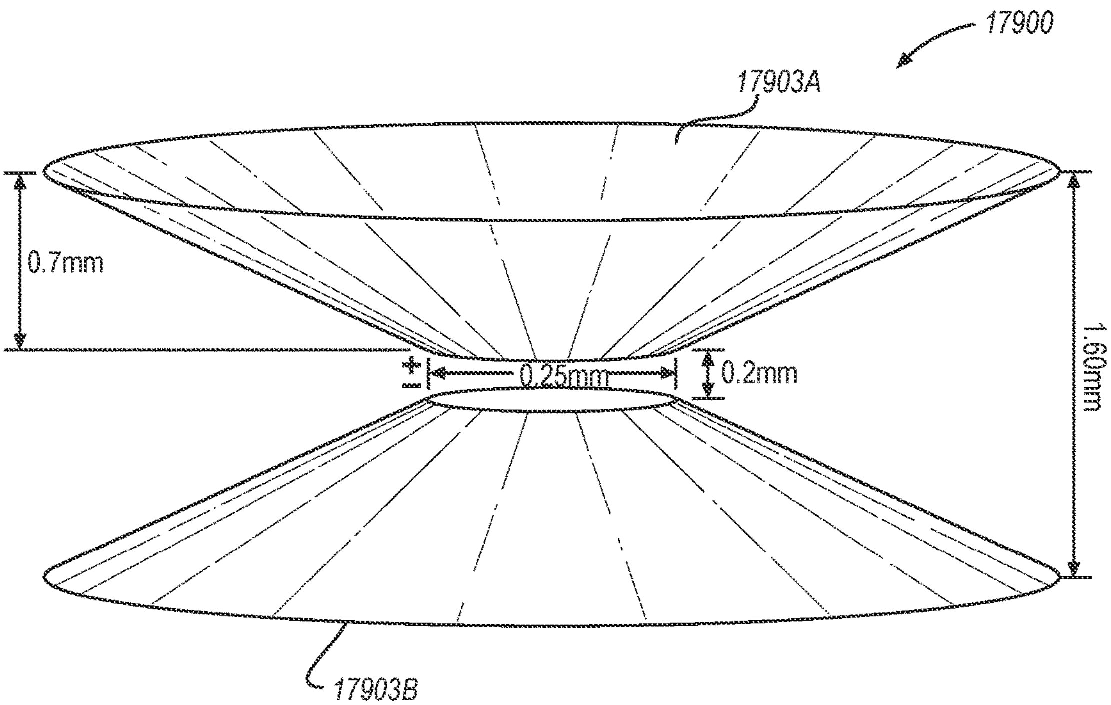

FIG. 179A is a perspective view of exemplary back-to-back vias configured as a dipole via-antenna, according to some aspects.

Figure 179B:
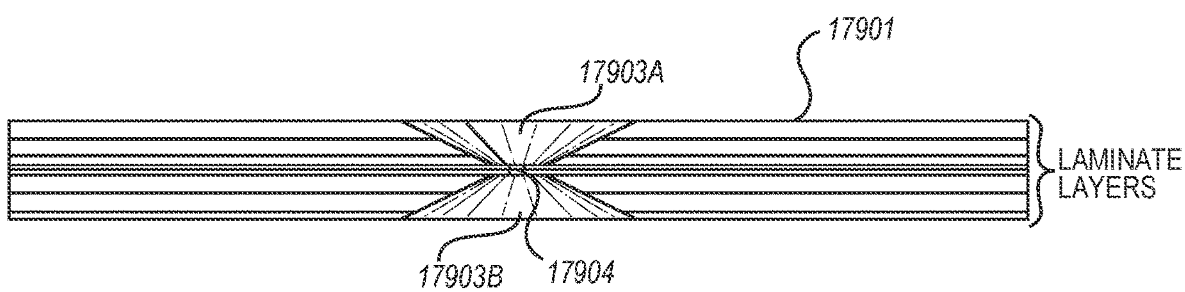

FIG. 179B is a perspective view of an exemplary back-to-back via configured as a dipole via-antenna illustrating PCB laminate layers, according to some aspects.

Figure 180:
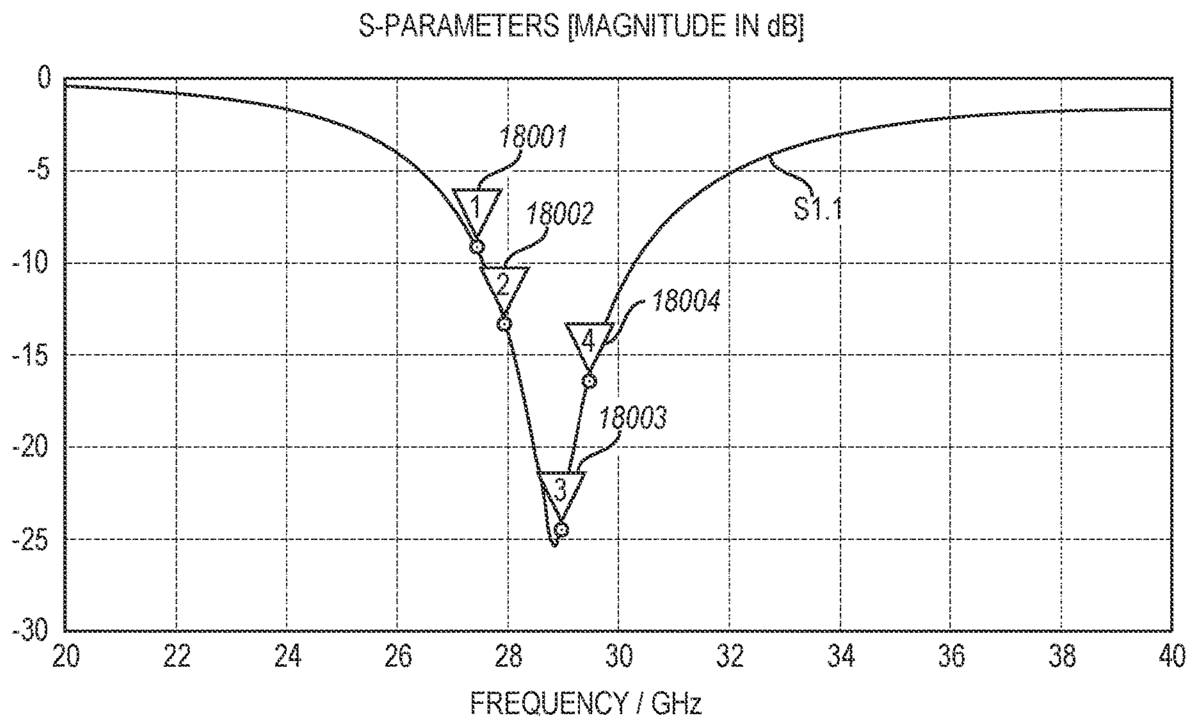

FIG. 180 is a graph of antenna return loss for the dipole via-antenna configuration of FIGS. 179A and 179B, according to some aspects.

Figure 181A:
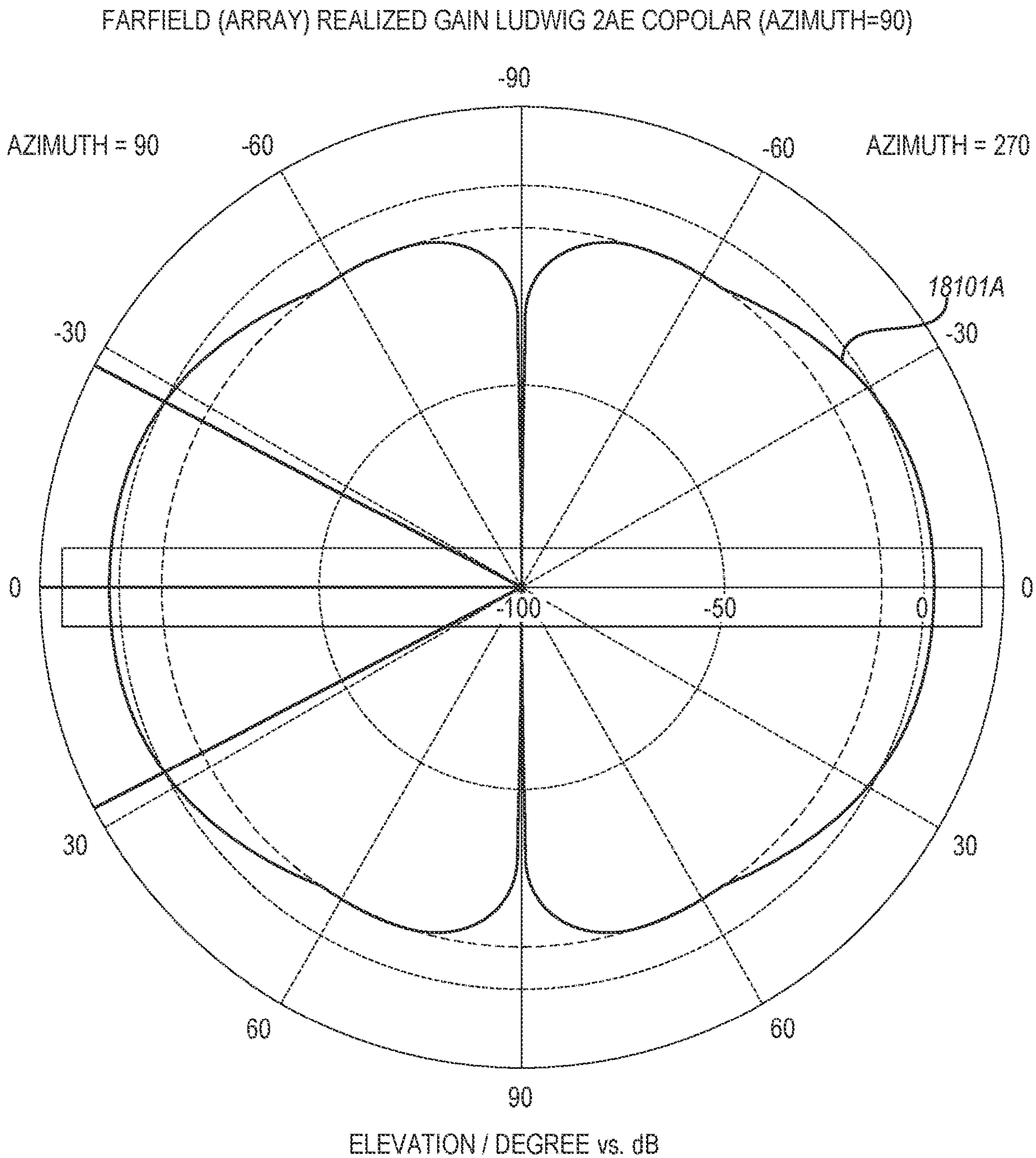

FIG. 181A is a simulated far field coplanar radiation pattern for the dipole via-antenna configuration of FIGS. 179A and 179B at a frequency of 27.5 GHz using the Ludwig definition, according to some aspects.

Figure 181B:
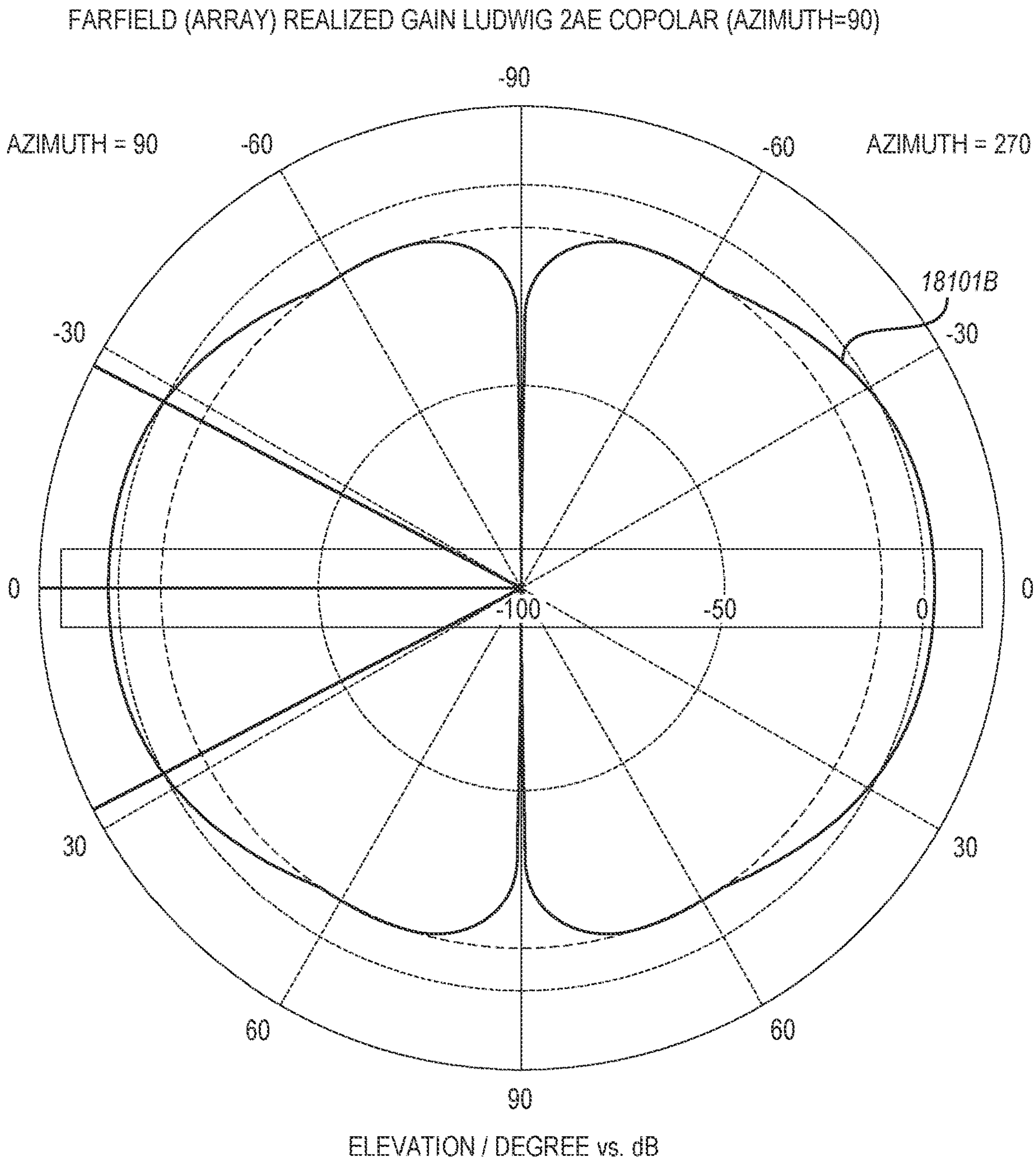

FIG. 181B is an exemplary simulated far field coplanar radiation pattern for the dipole via-antenna configuration of FIGS. 179A and 179B, at a frequency 28 GHz using the Ludwig definition, according to some aspects.

Figure 181C:
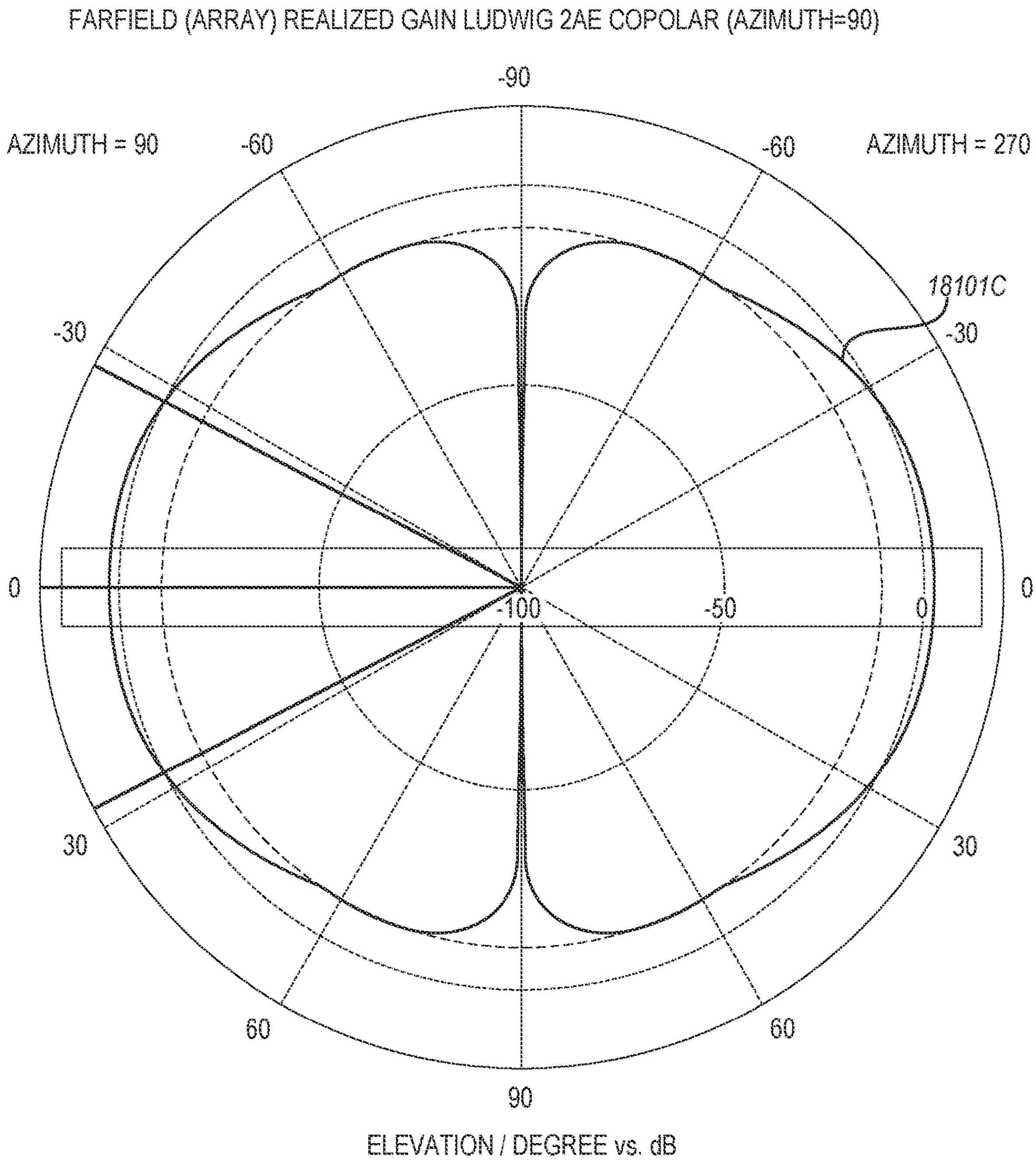

FIG. 181C is an exemplary simulated far field coplanar radiation pattern for the dipole via-antenna configuration of FIGS. 179A and 179B at a frequency 29.5 GHz using the Ludwig definition, according to some aspects.

Figure 182:
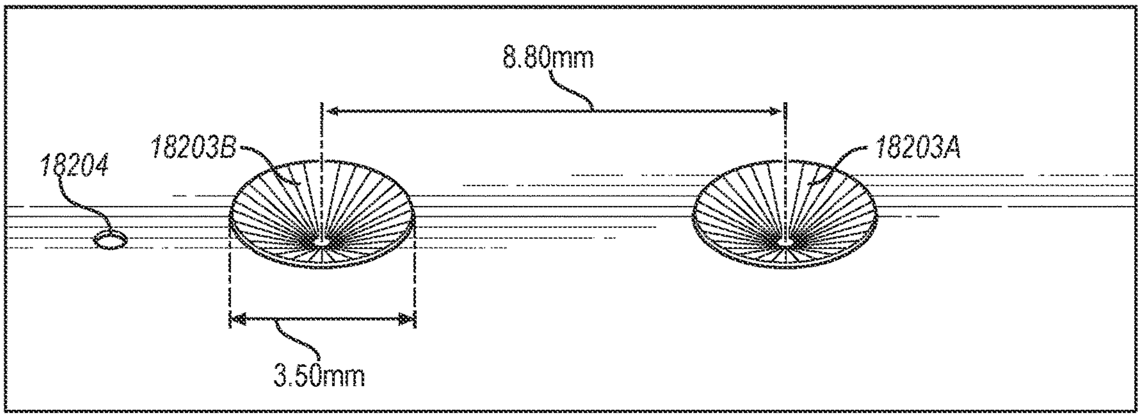

FIG. 182 is an exemplary two-element via-antenna array design for operation at 28 GHZ for 5G technology, according to some aspects.

Figure 183:
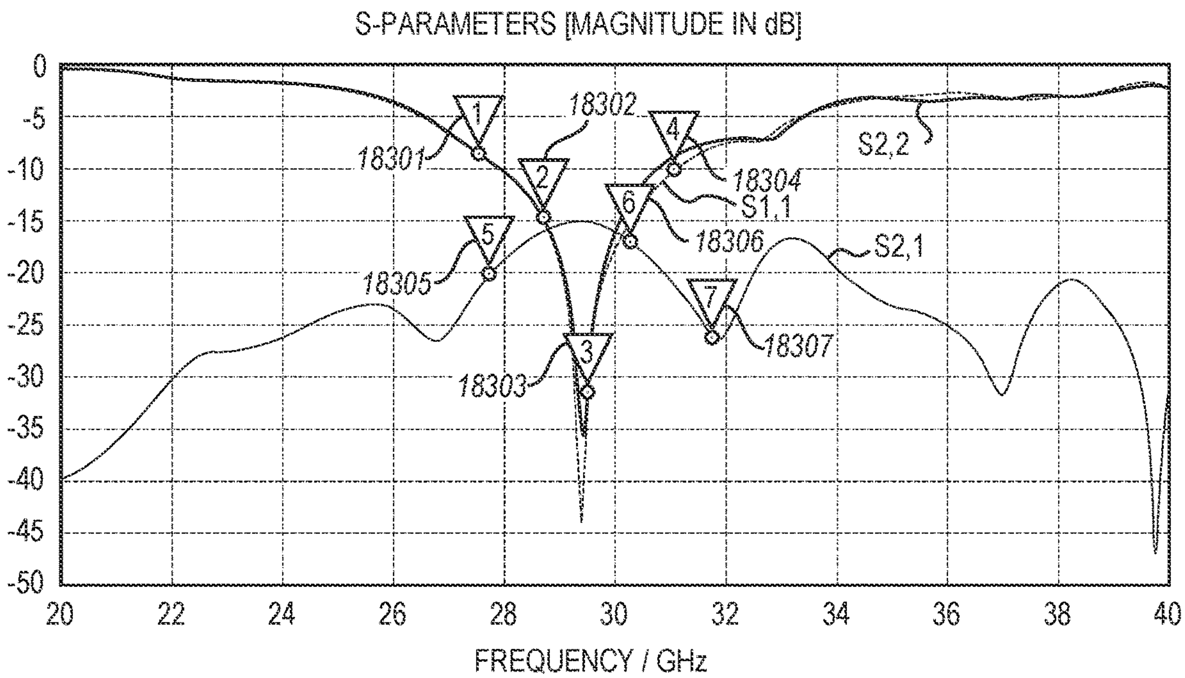

FIG. 183 is a simulated graph of antenna return loss for the two-element via-antenna array design of FIG. 182, according to some aspects.

Figure 184A:
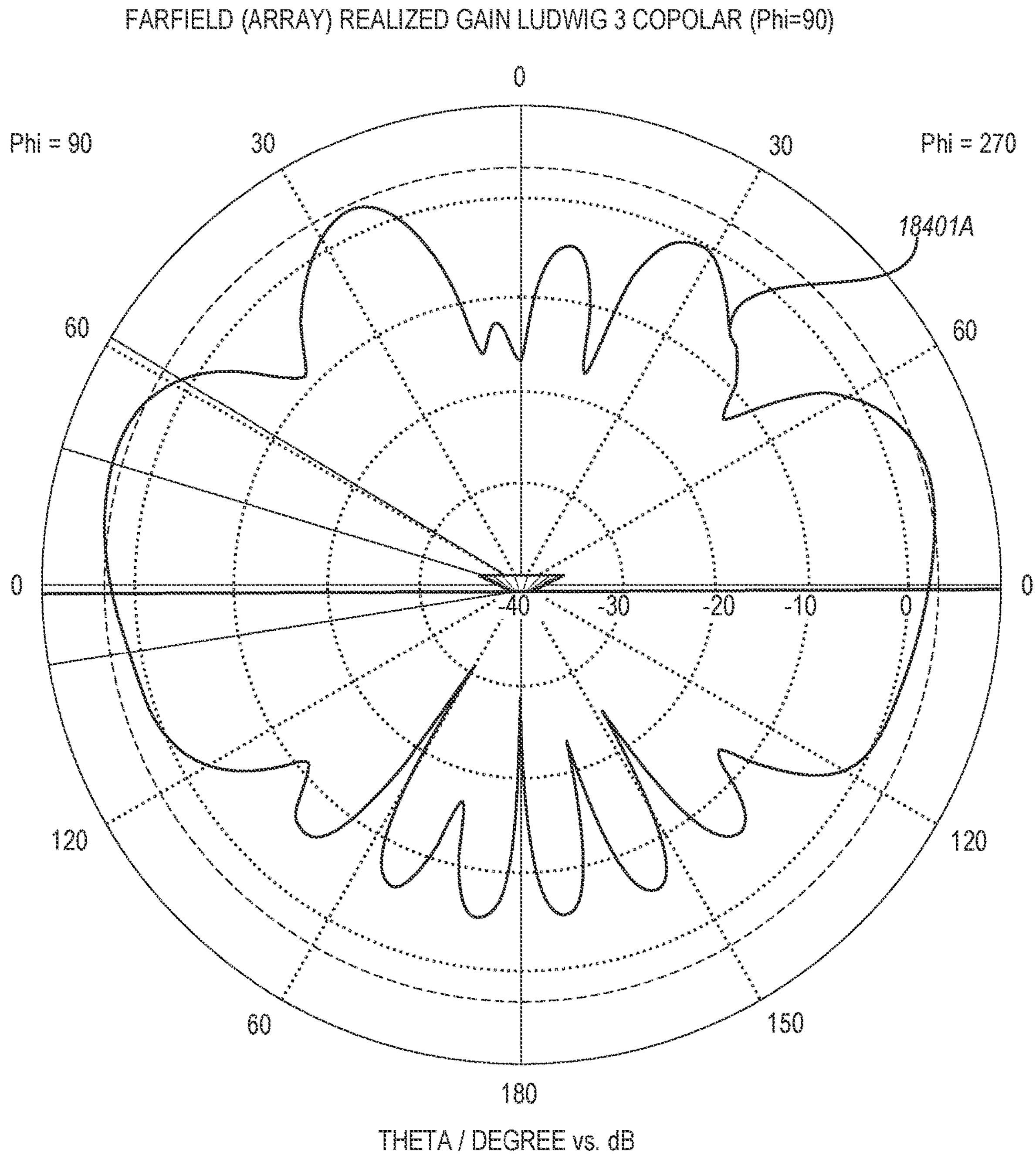

FIG. 184A is a simulated radiation pattern of the two-element via-array of FIG. 182 operating at a frequency of 27.5 GHz, according to some aspects.

Figure 184B:
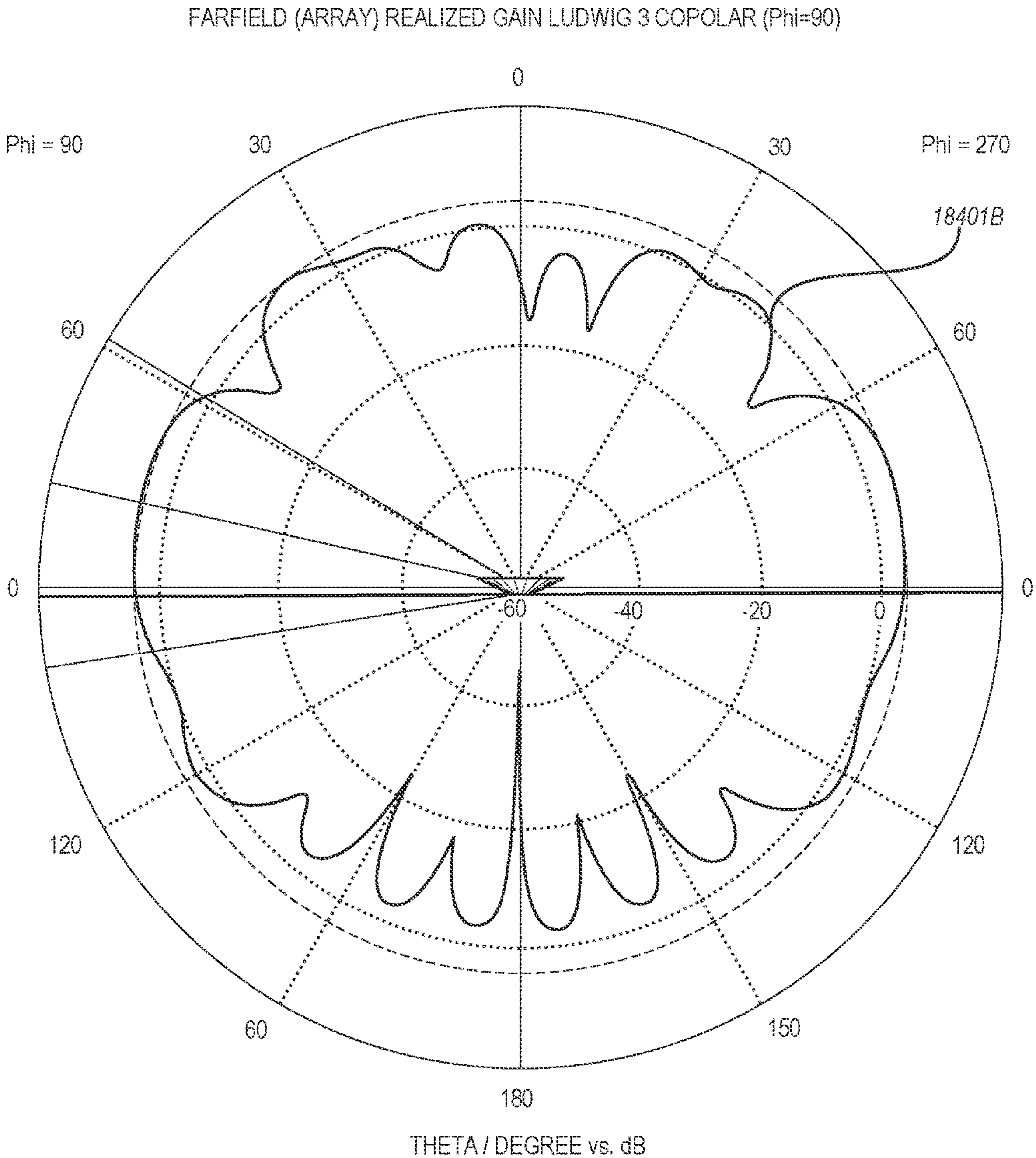

FIG. 184B is a simulated radiation pattern of the two-element via-array of FIG. 182 operating at a frequency of 29.5 GHz, according to some aspects.

Figure 185:
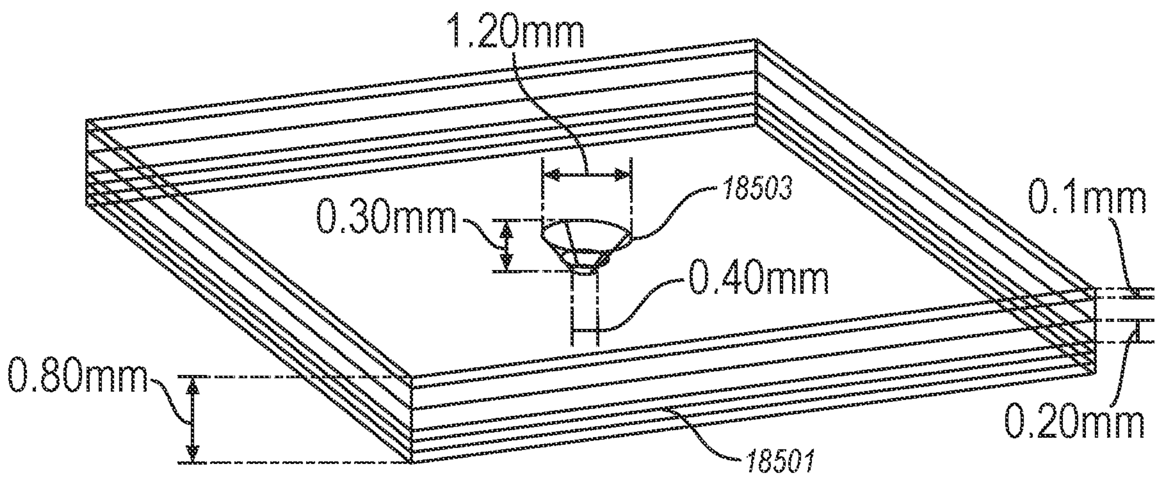

FIG. 185 is a perspective view of an exemplary via-antenna designed in a PCB, according to some aspects.

Figure 186A:
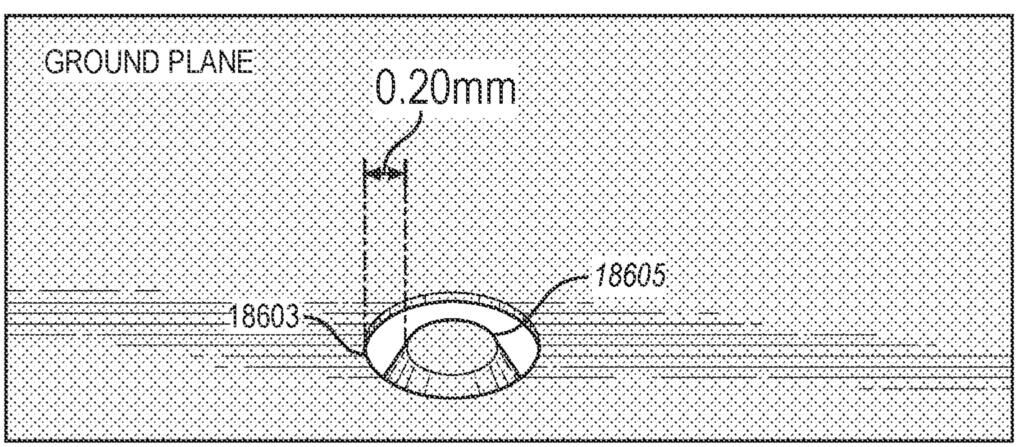

FIG. 186A is a bottom view of the ground plane of the via-antenna of FIG. 185, according to some aspects.

Figure 186B:
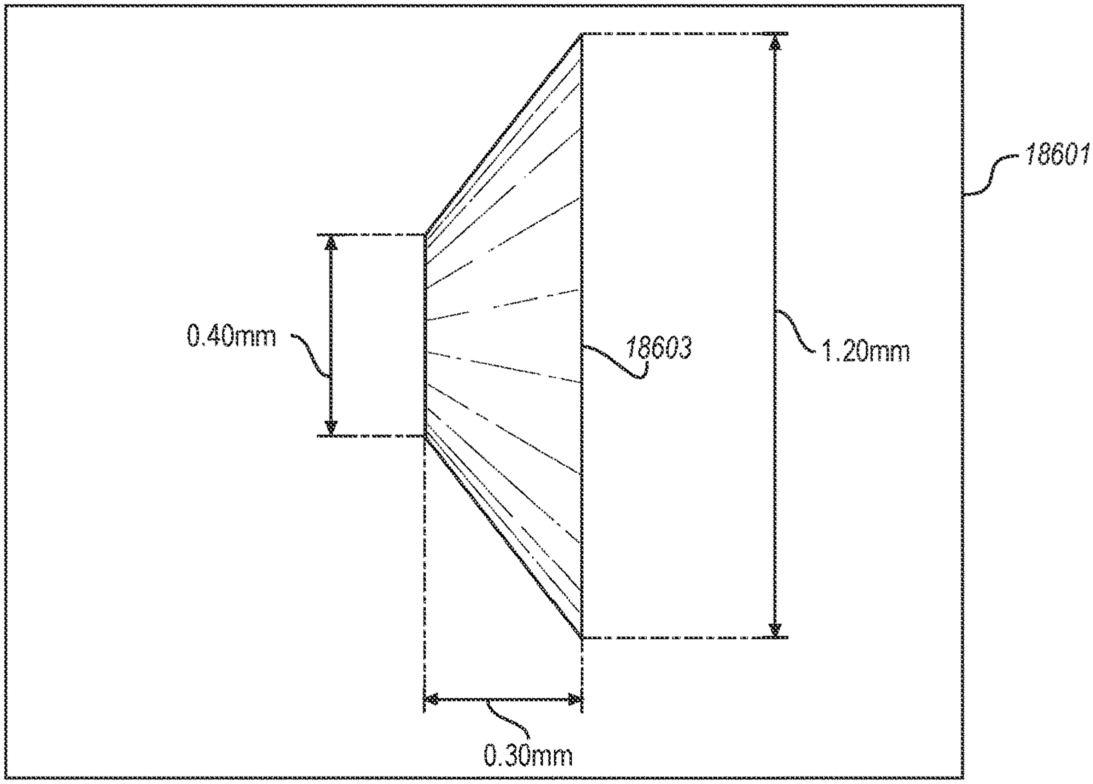

FIG. 186B is a side view of the via-antenna of FIG. 185, according to some aspects.

Figure 186C:
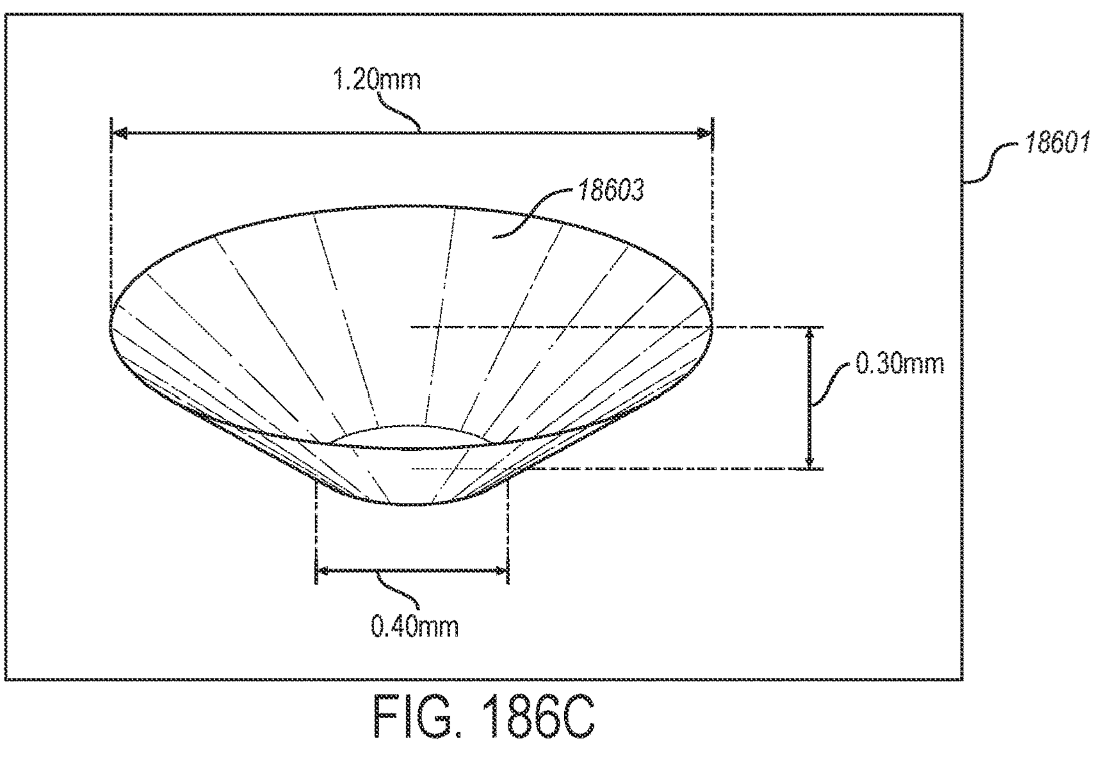

FIG. 186C is a perspective view of the via-antenna of FIG. 185, according to some aspects.

Figure 187:
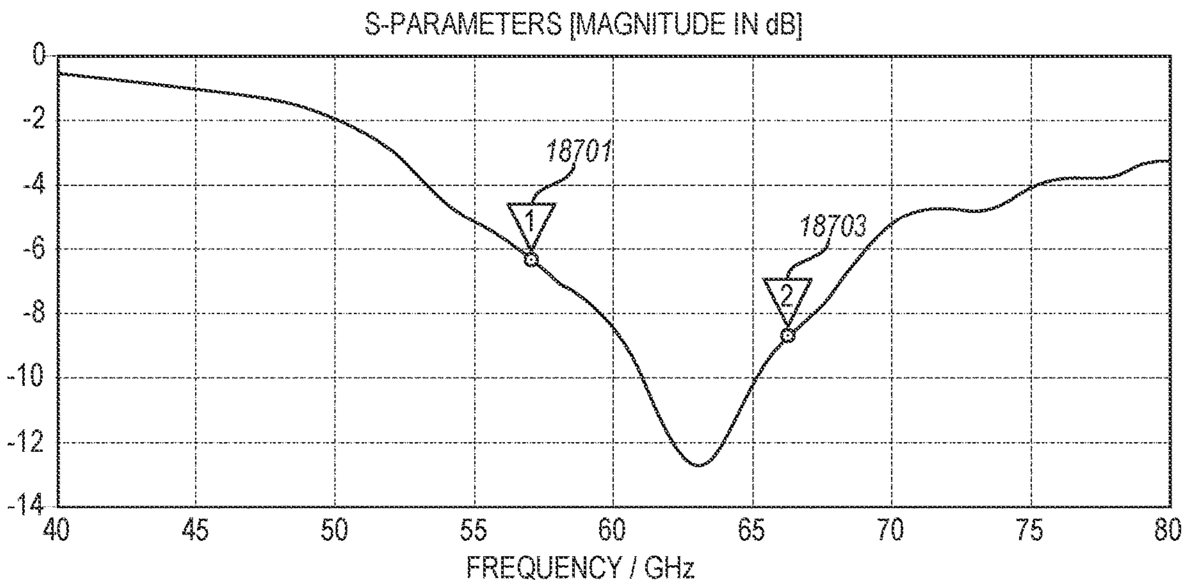

FIG. 187 is a simulated graph of exemplary via-antenna return loss for the via-antenna of FIG. 185, according to some aspects.

Figure 188:
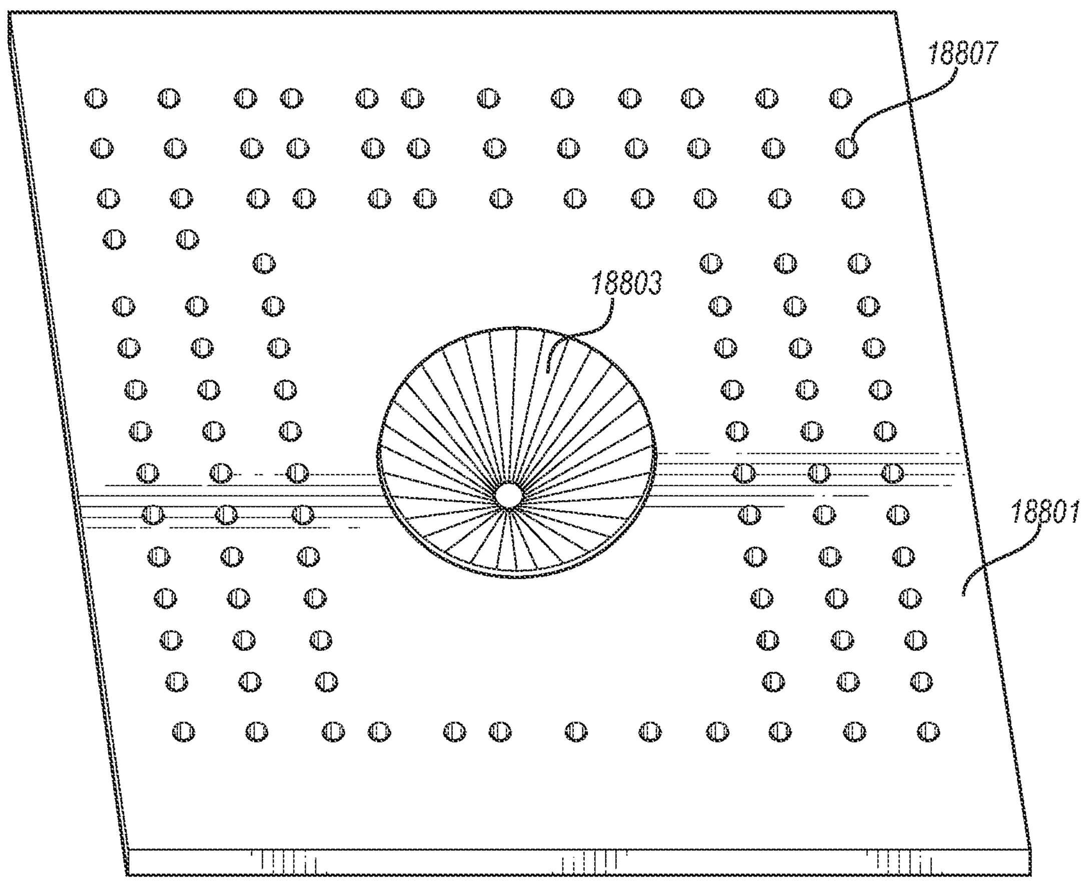

FIG. 188 is an illustration of air holes drilled around an exemplary via-antenna in a PCB to lower surface wave propagation, according to some aspects.

Figure 189A:
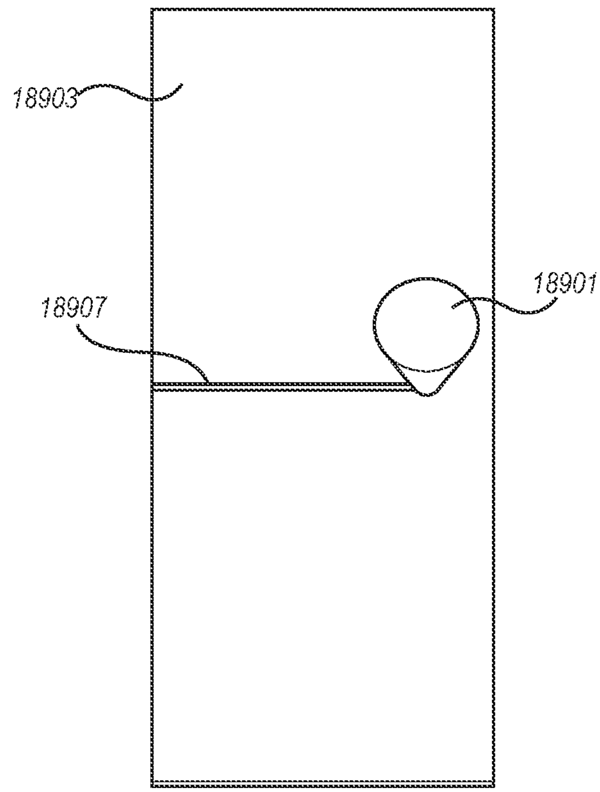
Figure 189B:
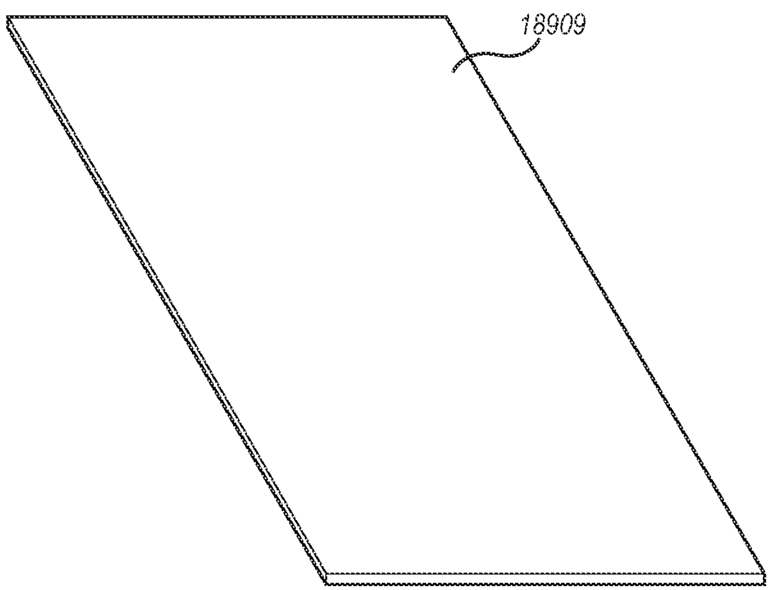
Figure 189C:
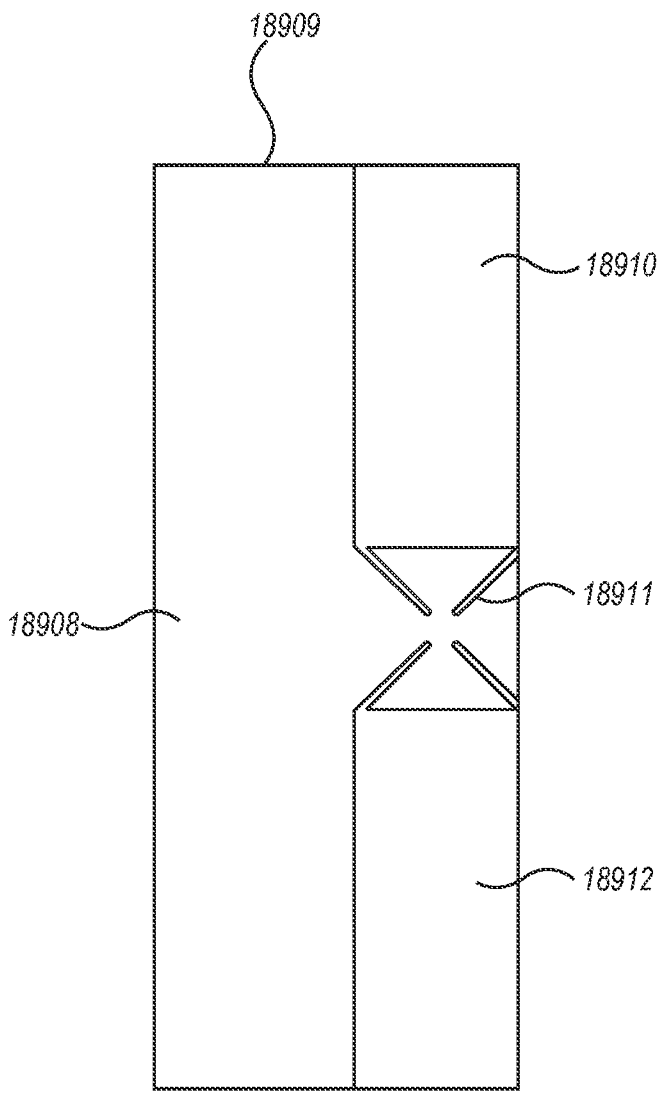

FIGS. 189A through 189C illustrate components of an exemplary modified ground plane for a 3D cone antenna, according to some aspects.

Figure 189D:
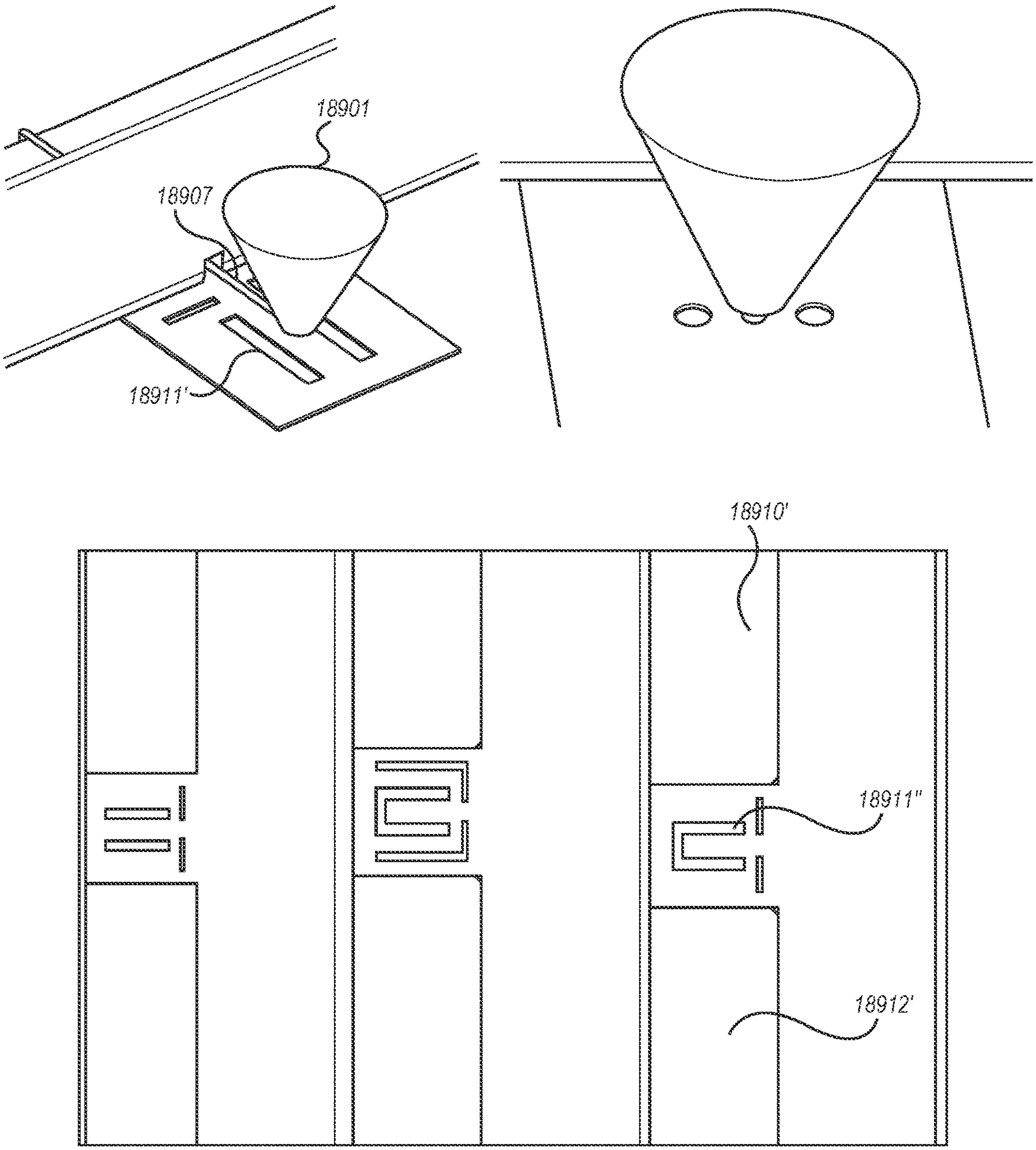

FIG. 189D illustrates exemplary cone antennas with various defected ground planes.

Figure 190A:
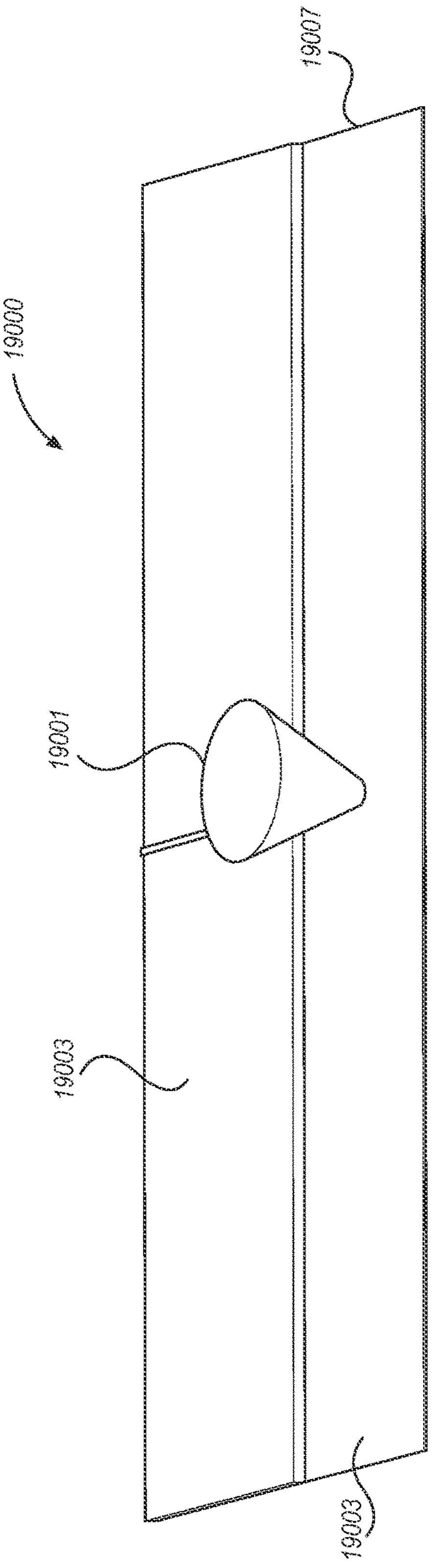
Figure 190B:
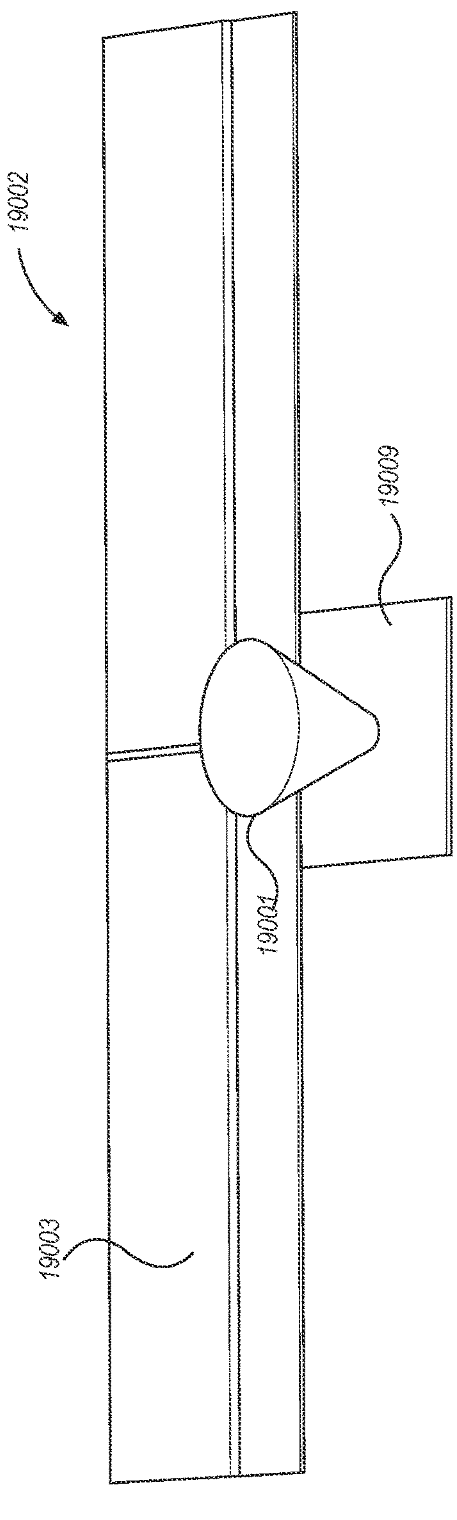
Figure 190C:
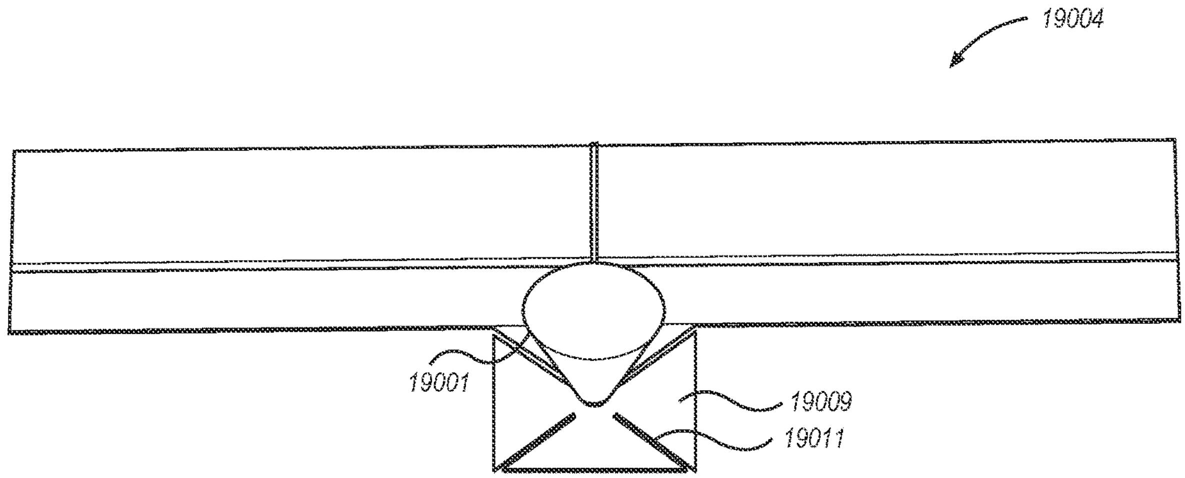

FIGS. 190A through 190C illustrate an exemplary of a cone shaped monopole antenna structure with different types of ground planes, according to some aspects.

Figure 191A:
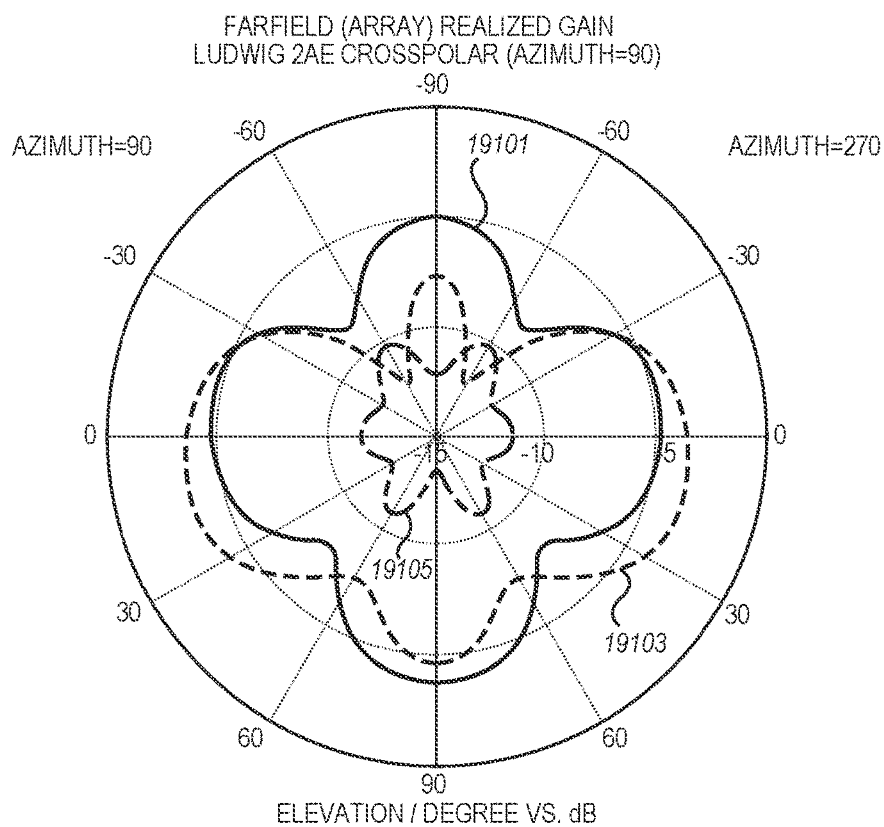
Figure 191B:
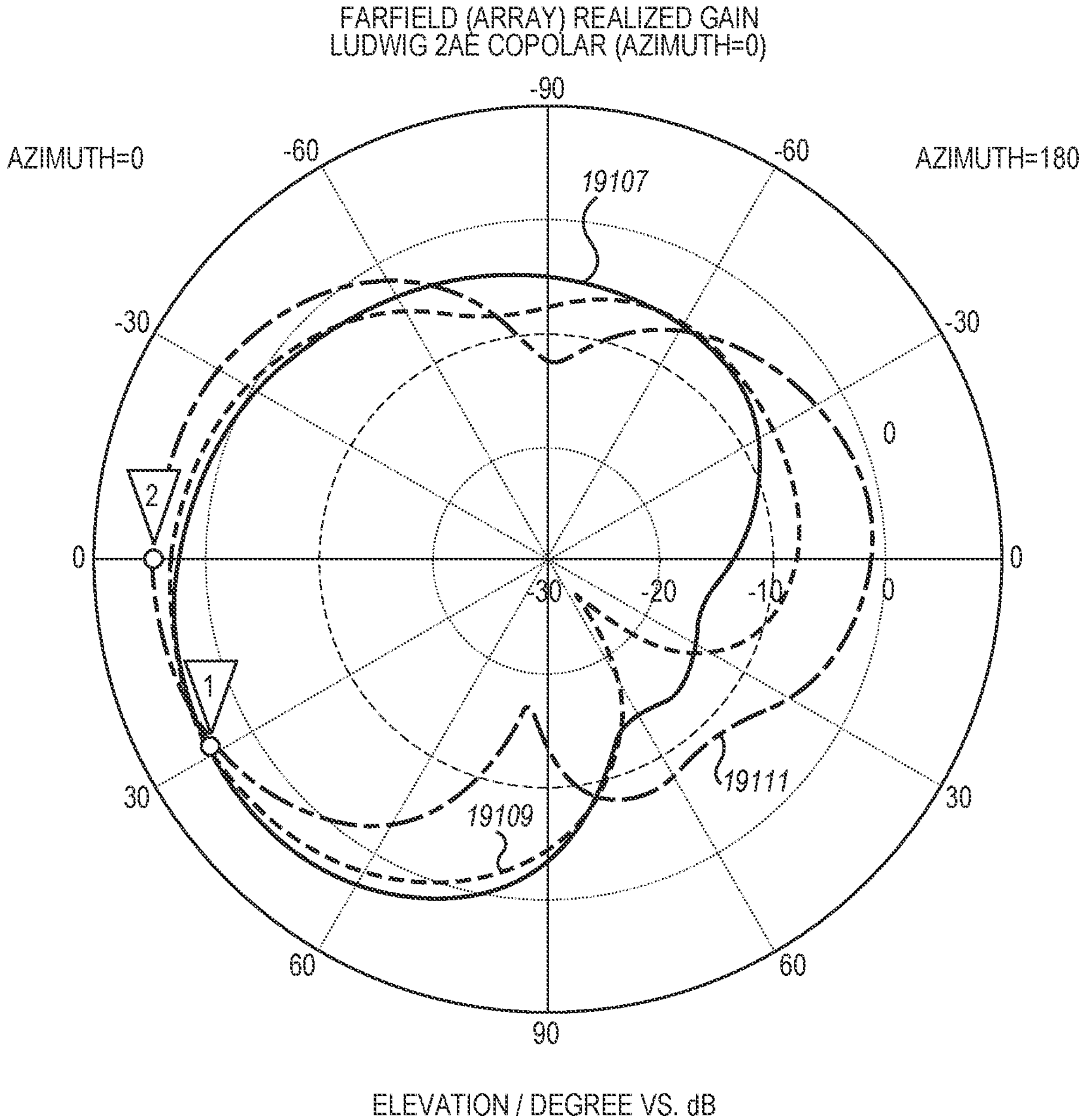

FIGS. 191A and 191B illustrate radiation pattern comparison between the antenna structures of FIG. 190A through 190C, according to some aspects.

Figure 192A:
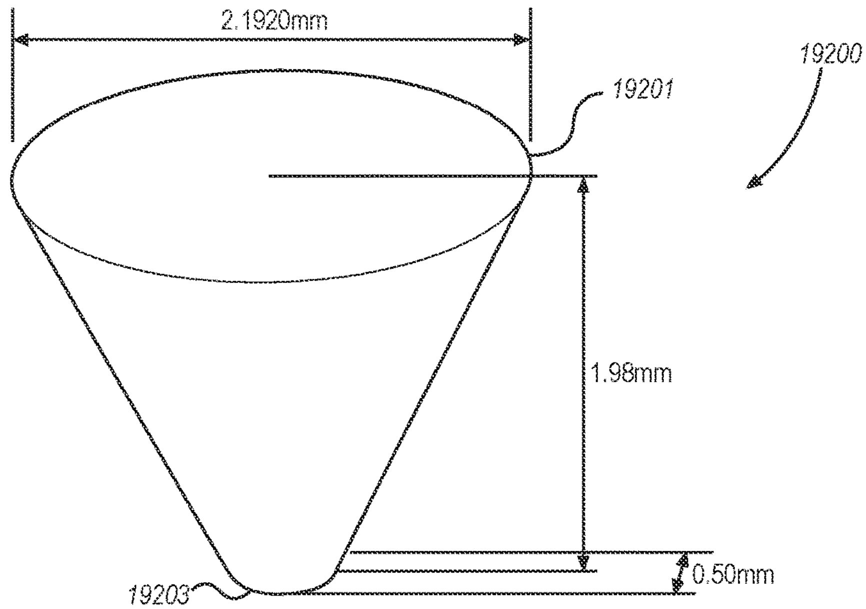
Figure 192B:
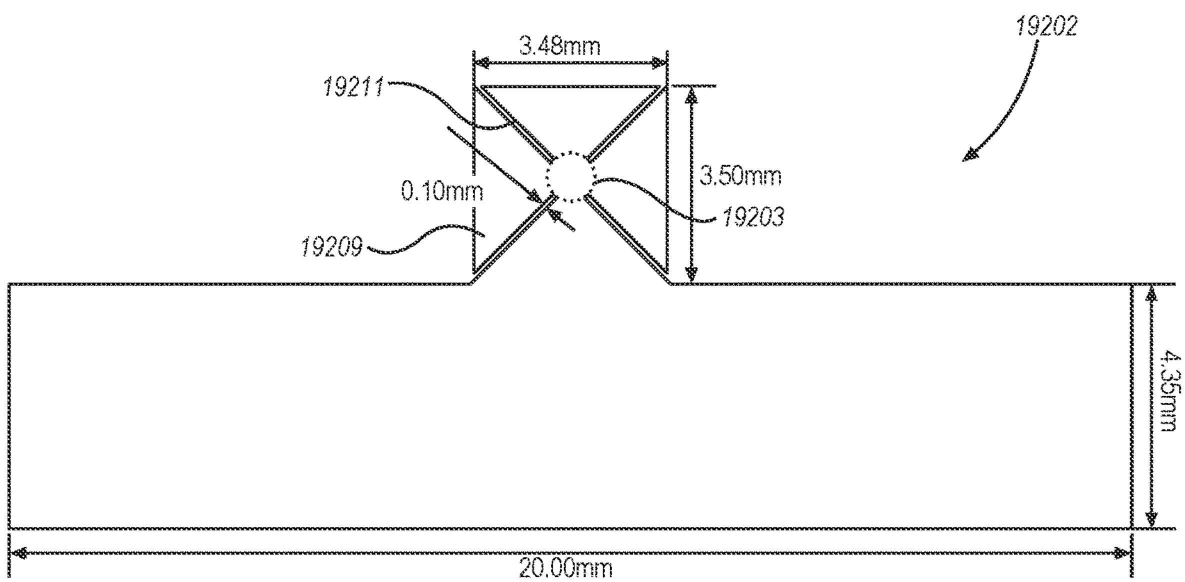

FIGS. 192A and 192B are more detailed illustrations of some of the antenna structures of FIG. 190A through 190C, according to some aspects.

Figure 193A:
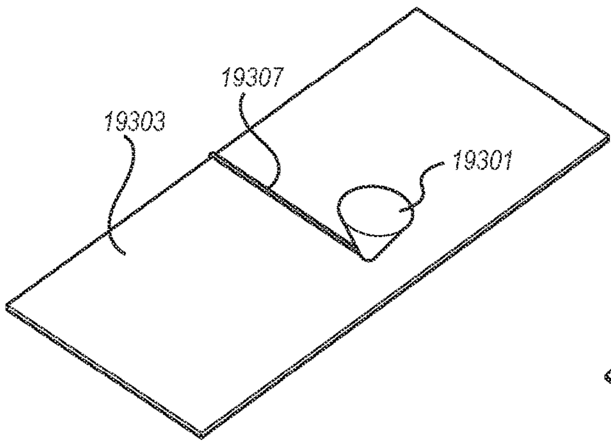
Figure 193B:
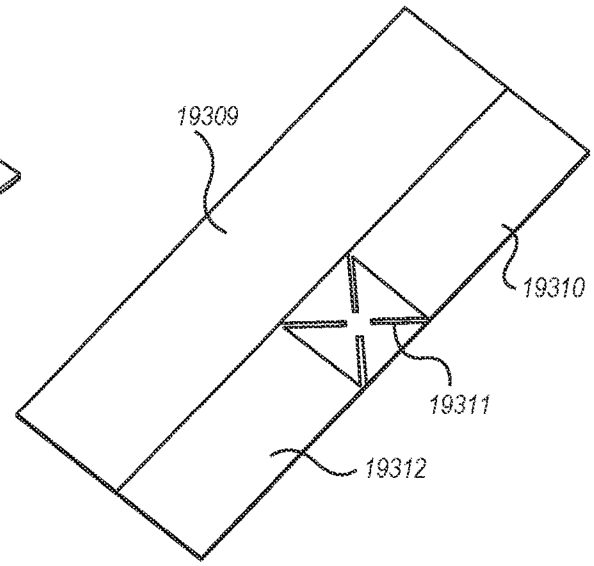

FIGS. 193A and 193B illustrate a top and bottom view of an exemplary 3D antenna structures of FIG. 190A through 190C, according to some aspects.

Figure 194:
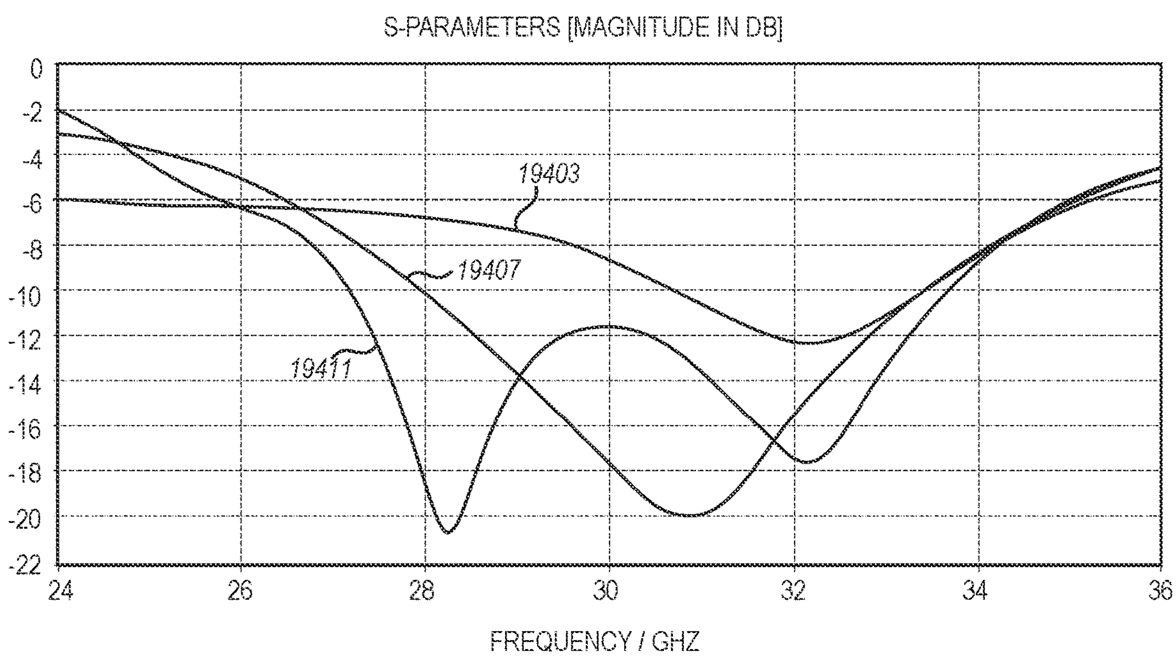

FIG. 194 is a graphical comparison between return loss of the antenna of FIG. 192A and FIG. 192B, according to some aspects.

Figure 195A:
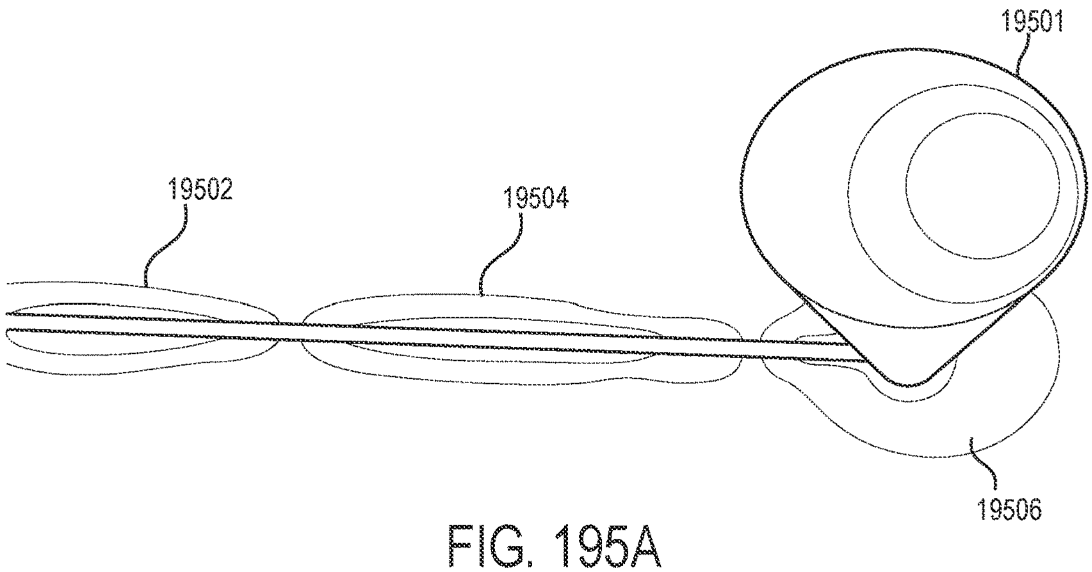
Figure 195B:
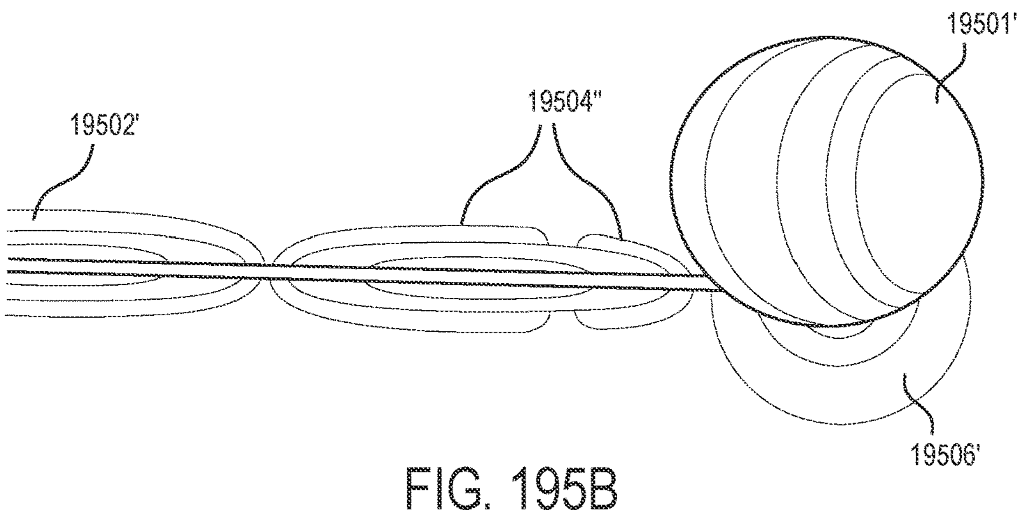
Figure 195C:
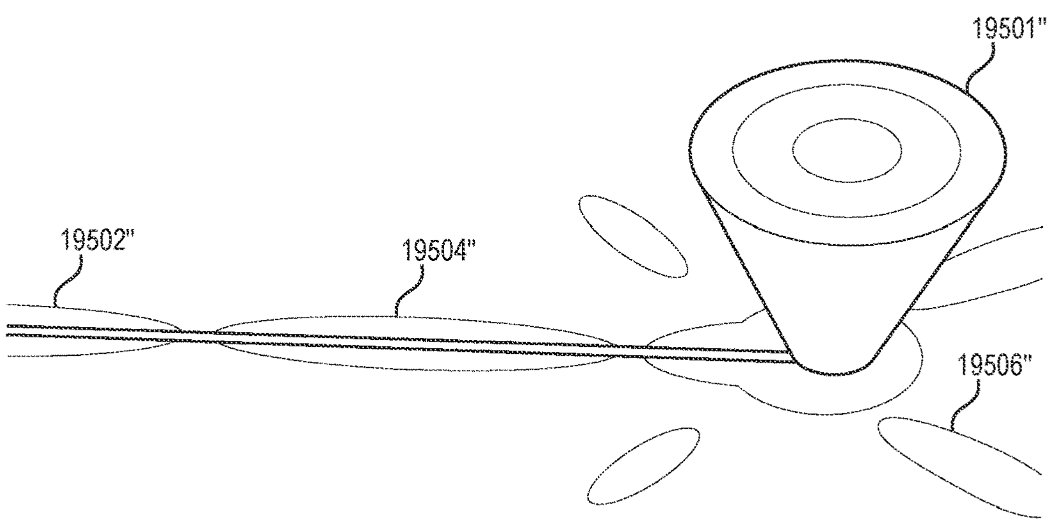

FIGS. 195A through 195C illustrate E-field distribution for the ground structures of 190A through 190C, according to some aspects.

Figure 196A:
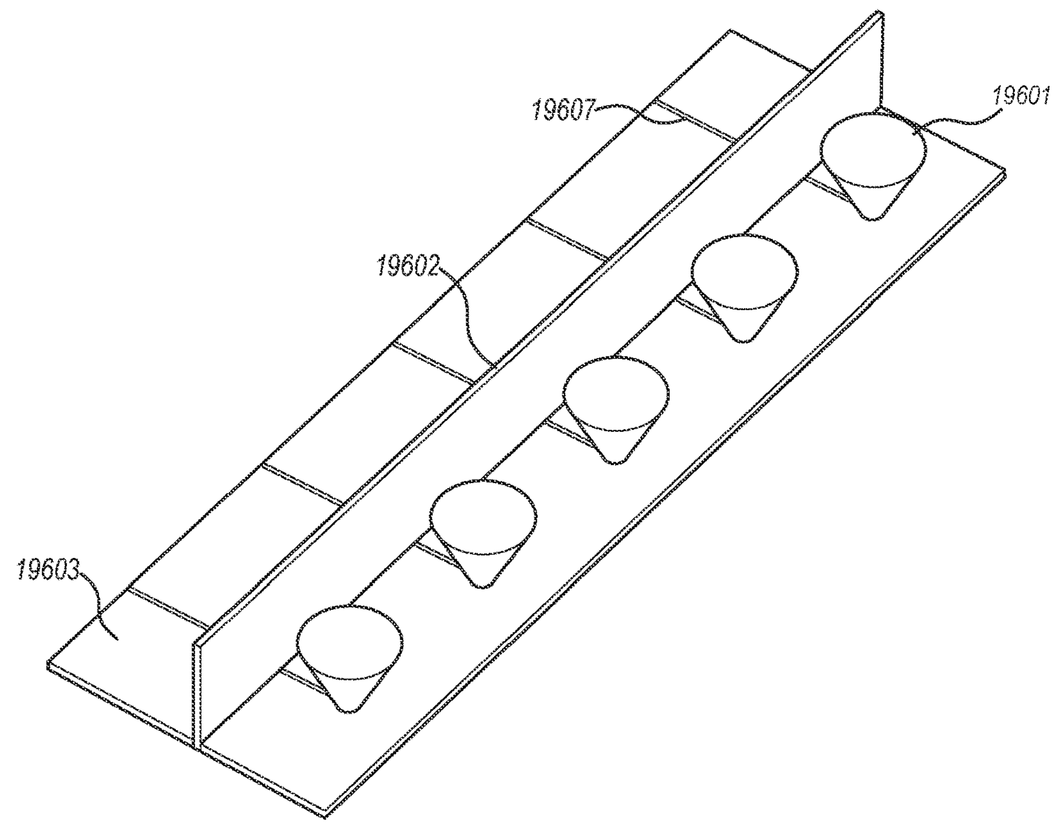
Figure 196B:
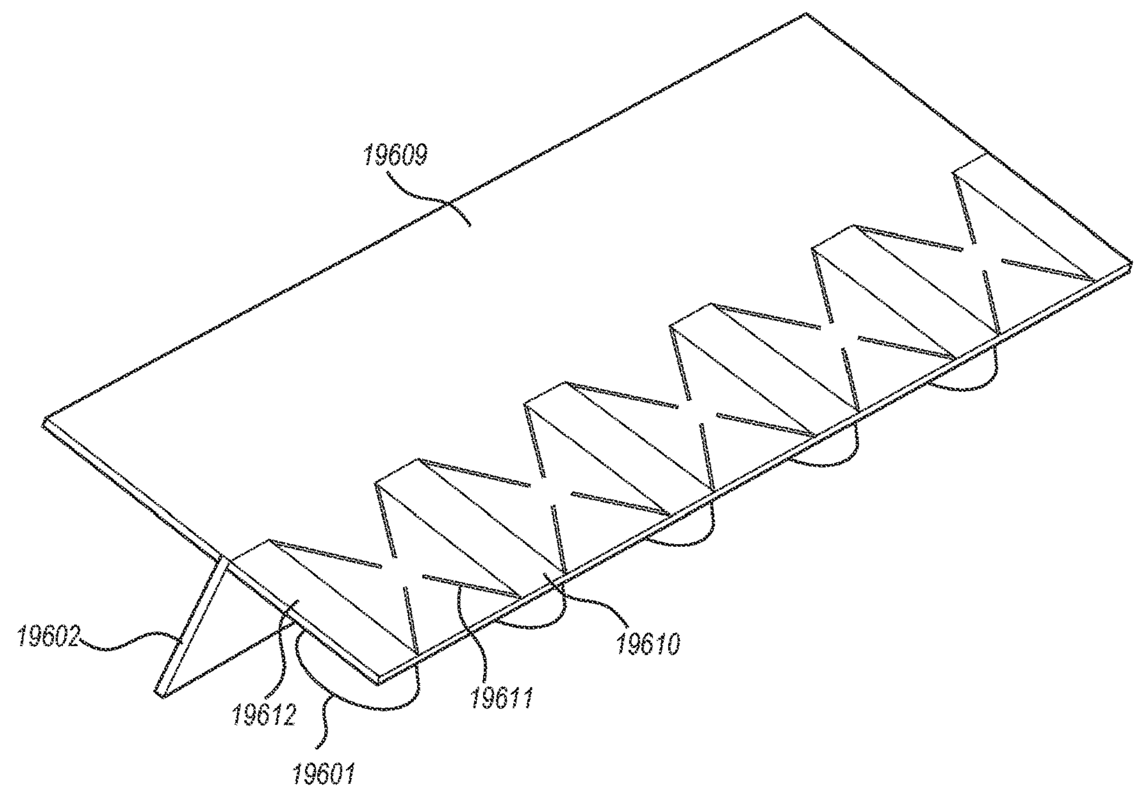
Figure 196C:
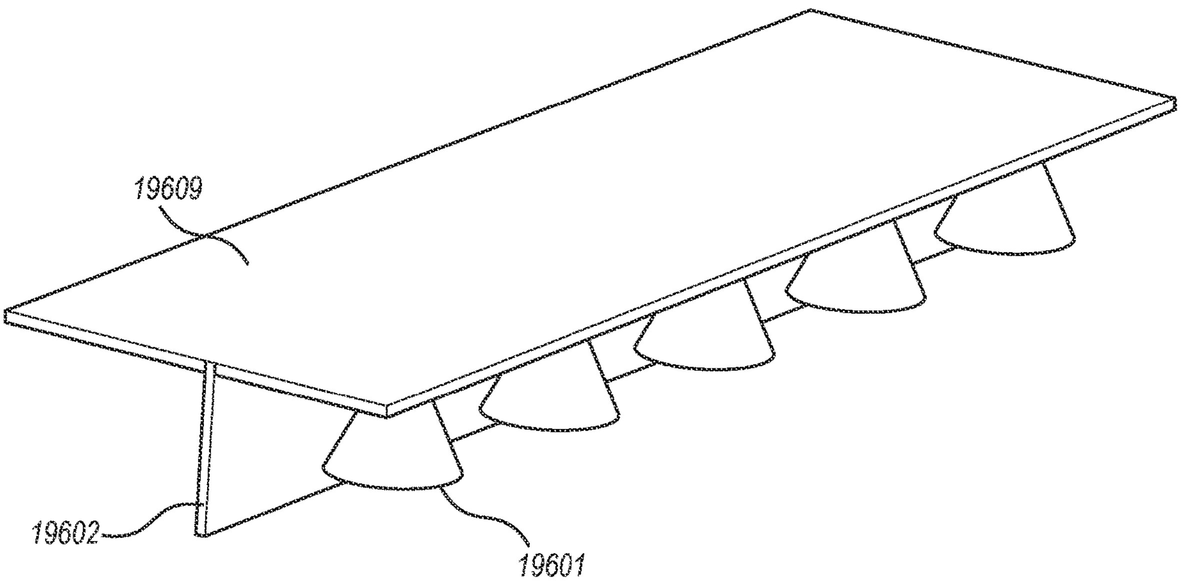

FIGS. 196A through 196C illustrate exemplary five-element cone antenna arrays without and with a modified ground plane, according to some aspects.

Figure 197A:
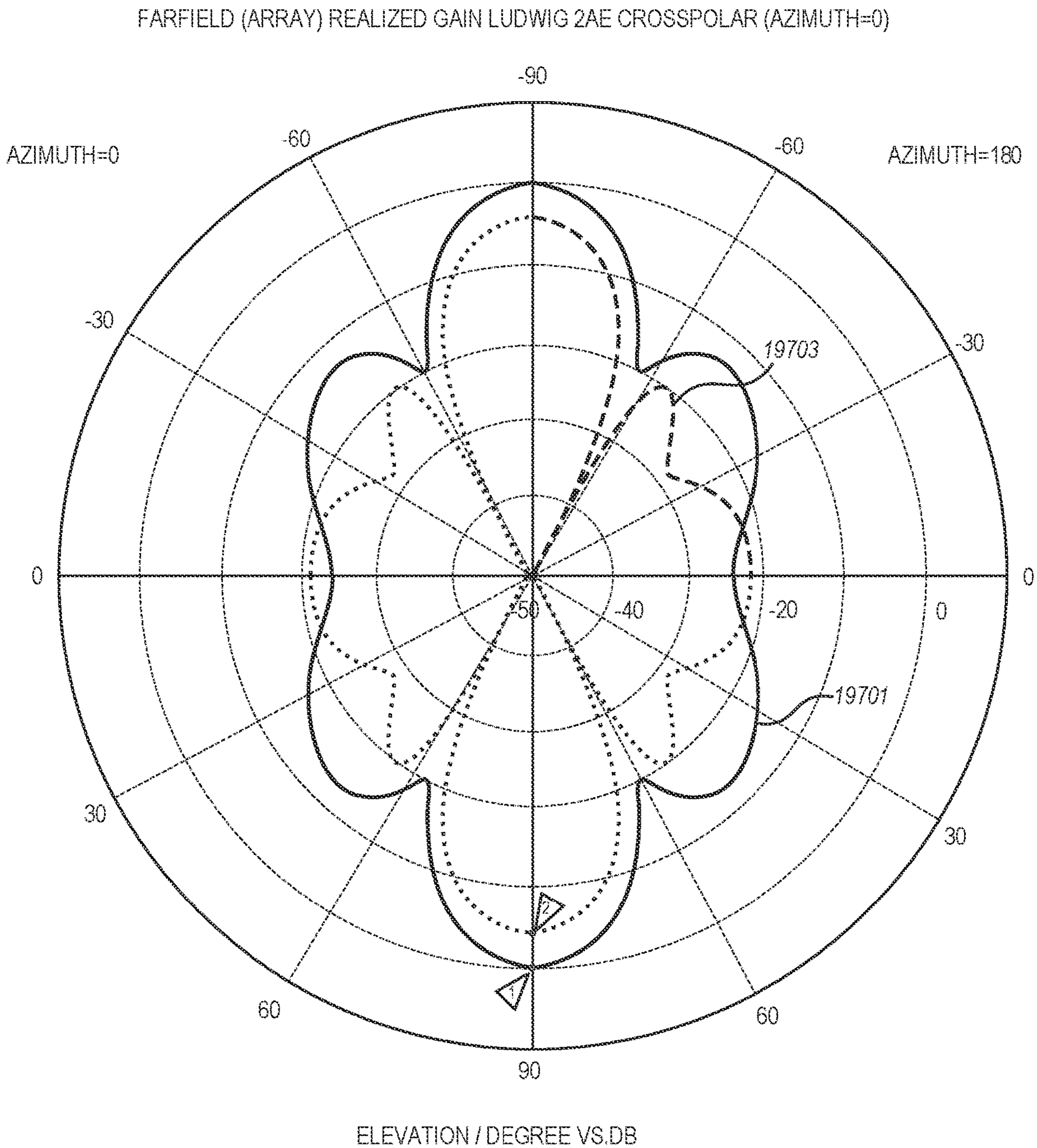
Figure 197B:
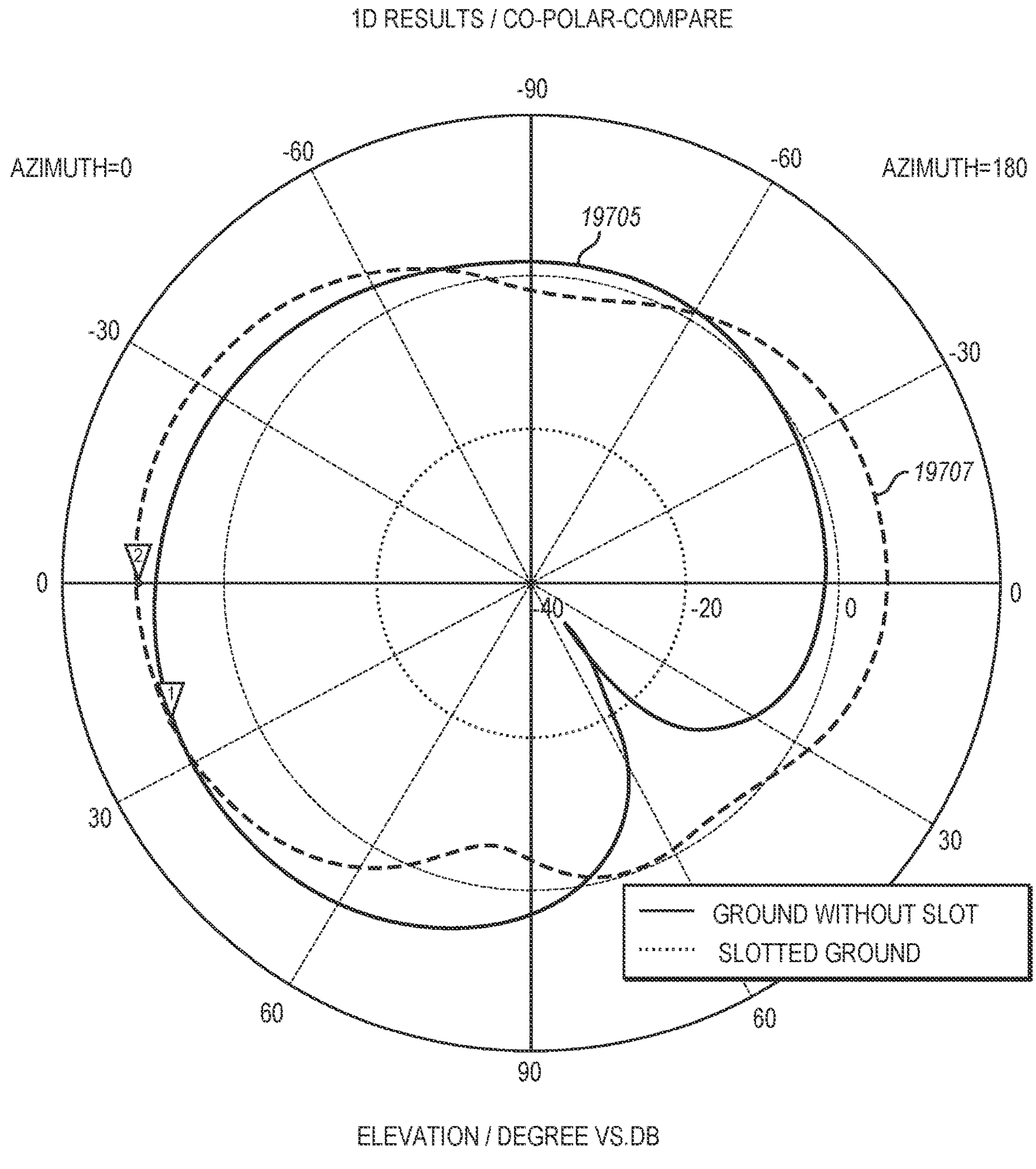

FIGS. 197A and 197B illustrate a cross polarization radiation pattern comparison with and without a modified ground plane, according to some aspects.

Figure 198A:
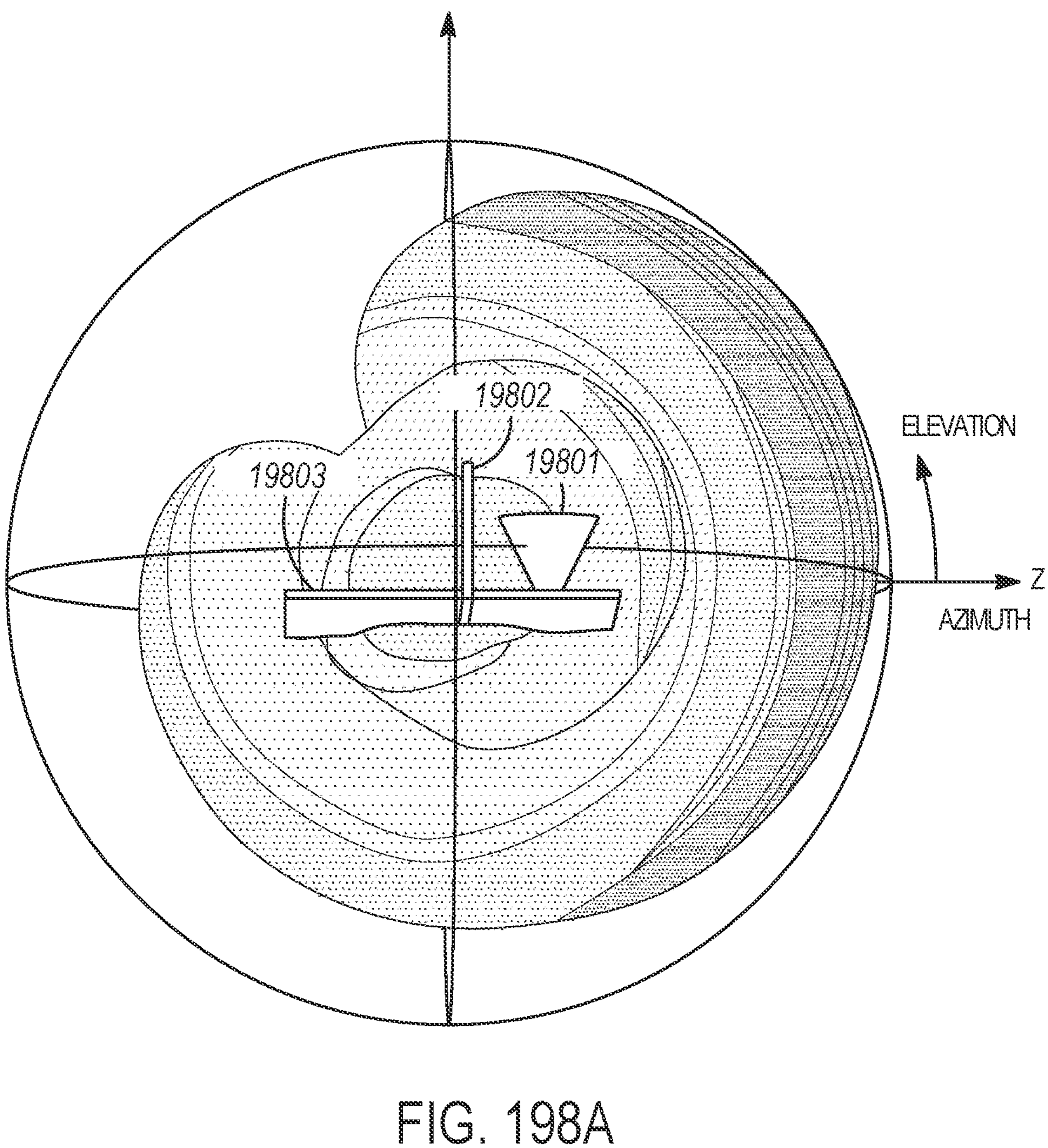
Figure 198B:
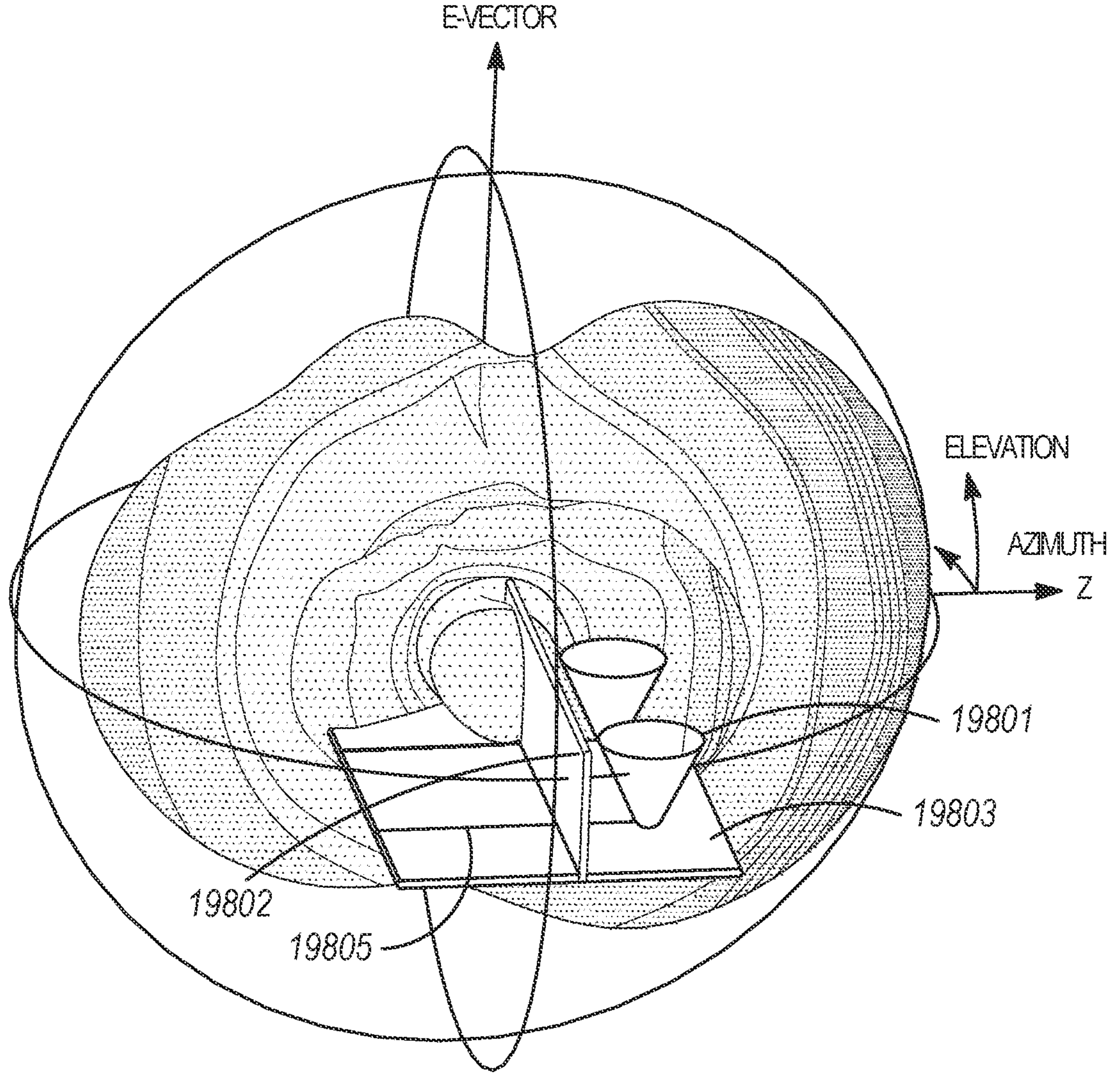

FIGS. 198A and 198B illustrate the effect of a ground plane on antenna radiation, according to some aspects.

Figure 199:
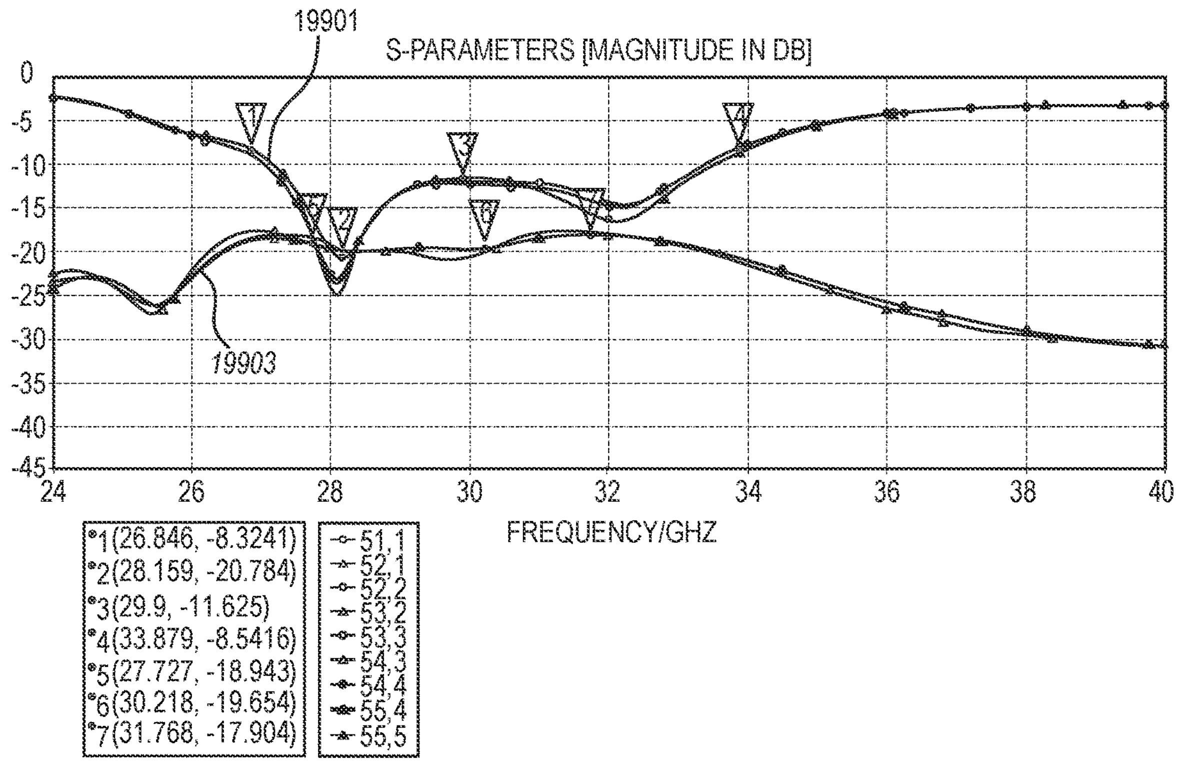

FIG. 199 illustrates a comparison of return loss and isolation comparison for an exemplary antenna array with a modified ground plane, according to some aspects.

Figure 200:
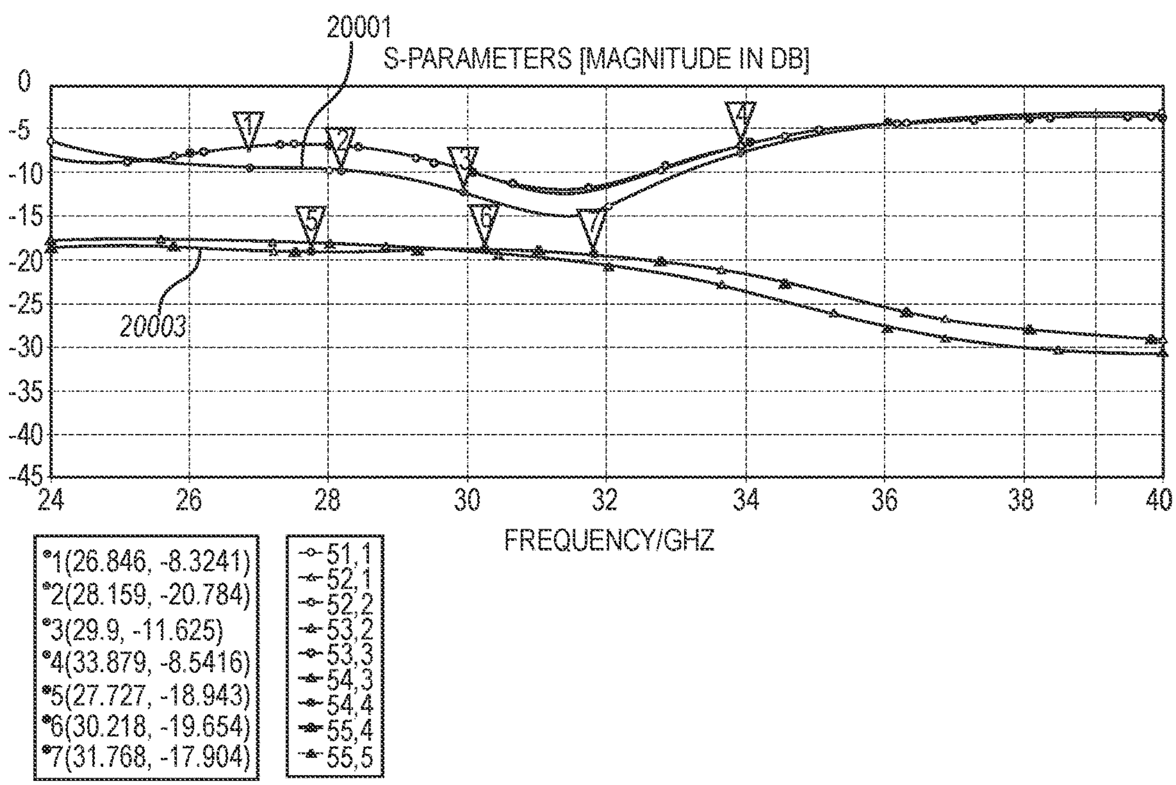

FIG. 200 illustrates a comparison of return loss and isolation between antenna elements for an exemplary unmodified grand antenna array, according to some aspects.

Figure 201A:
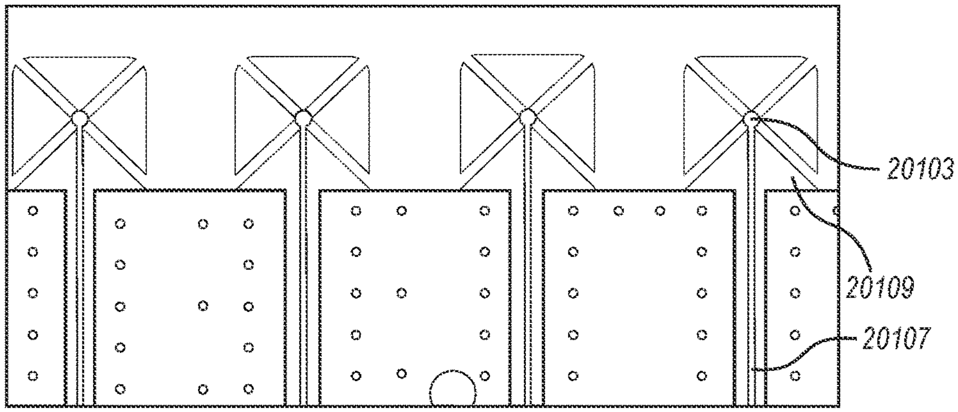
Figure 201B:
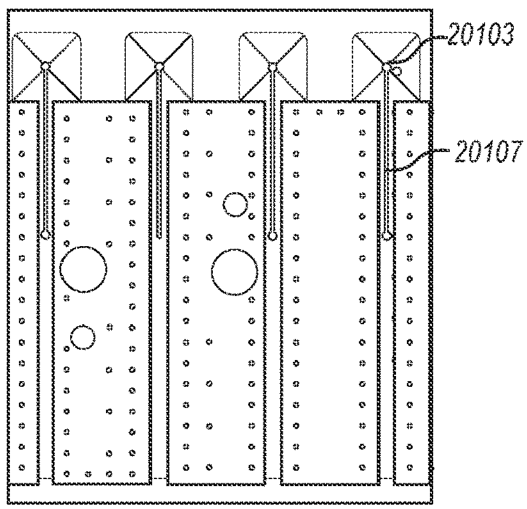
Figure 201C:
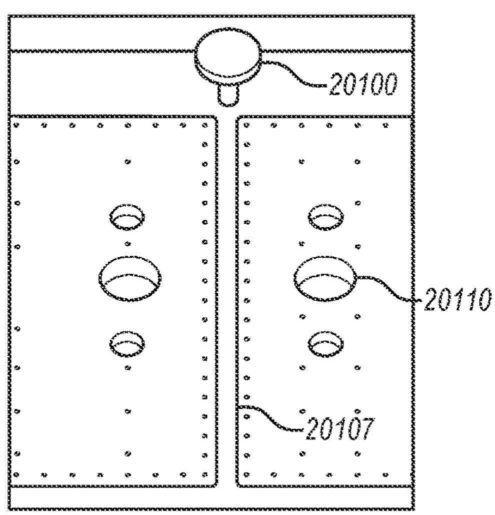

FIGS. 201A through 201C illustrate an exemplary PCB with slotted modified ground planes which may be used with 3D antennas, according to some aspects.

Figure 202:
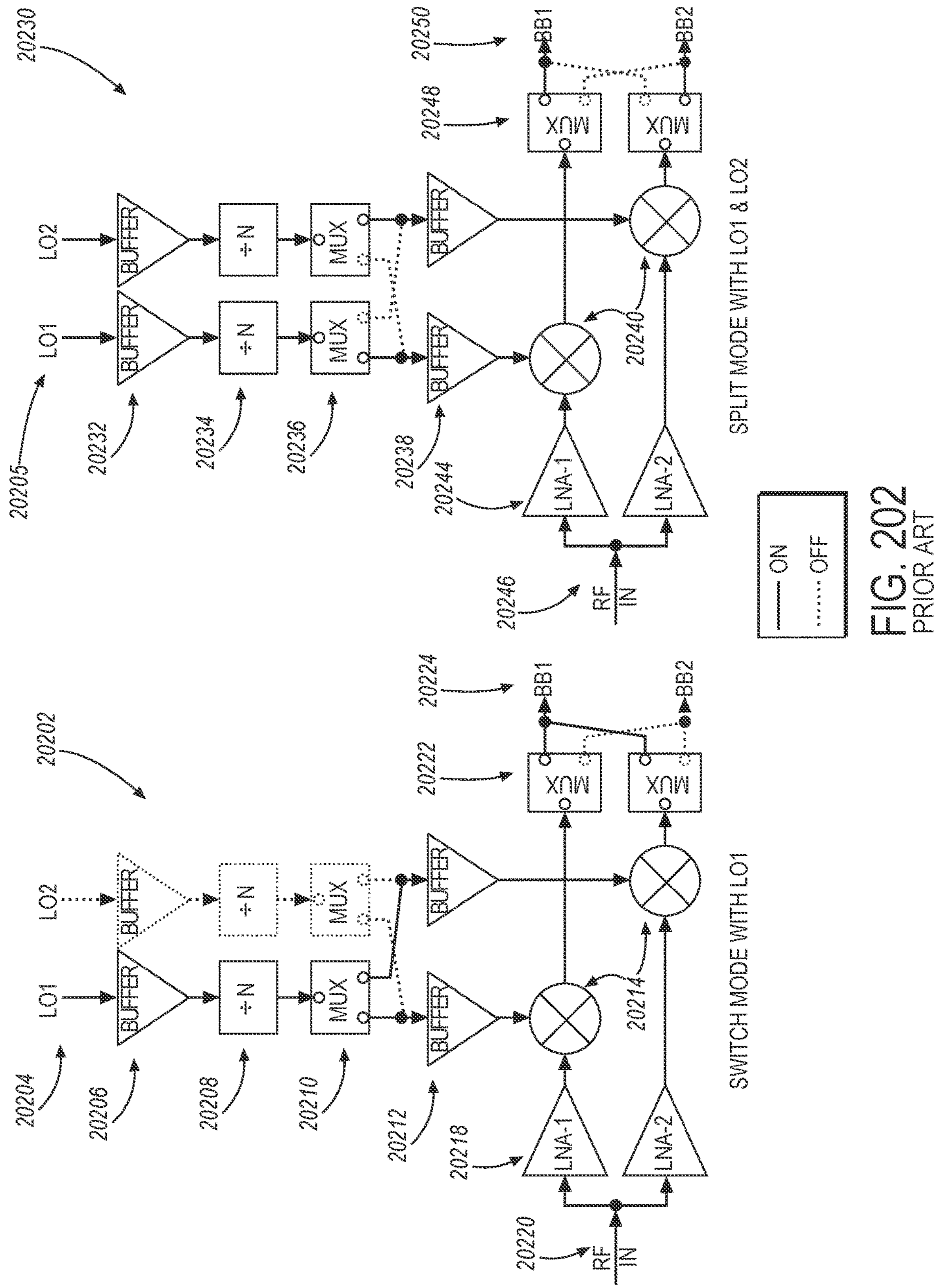

FIG. 202 illustrates a block diagram of an exemplary receiver operating in switch and split modes.

Figure 203:
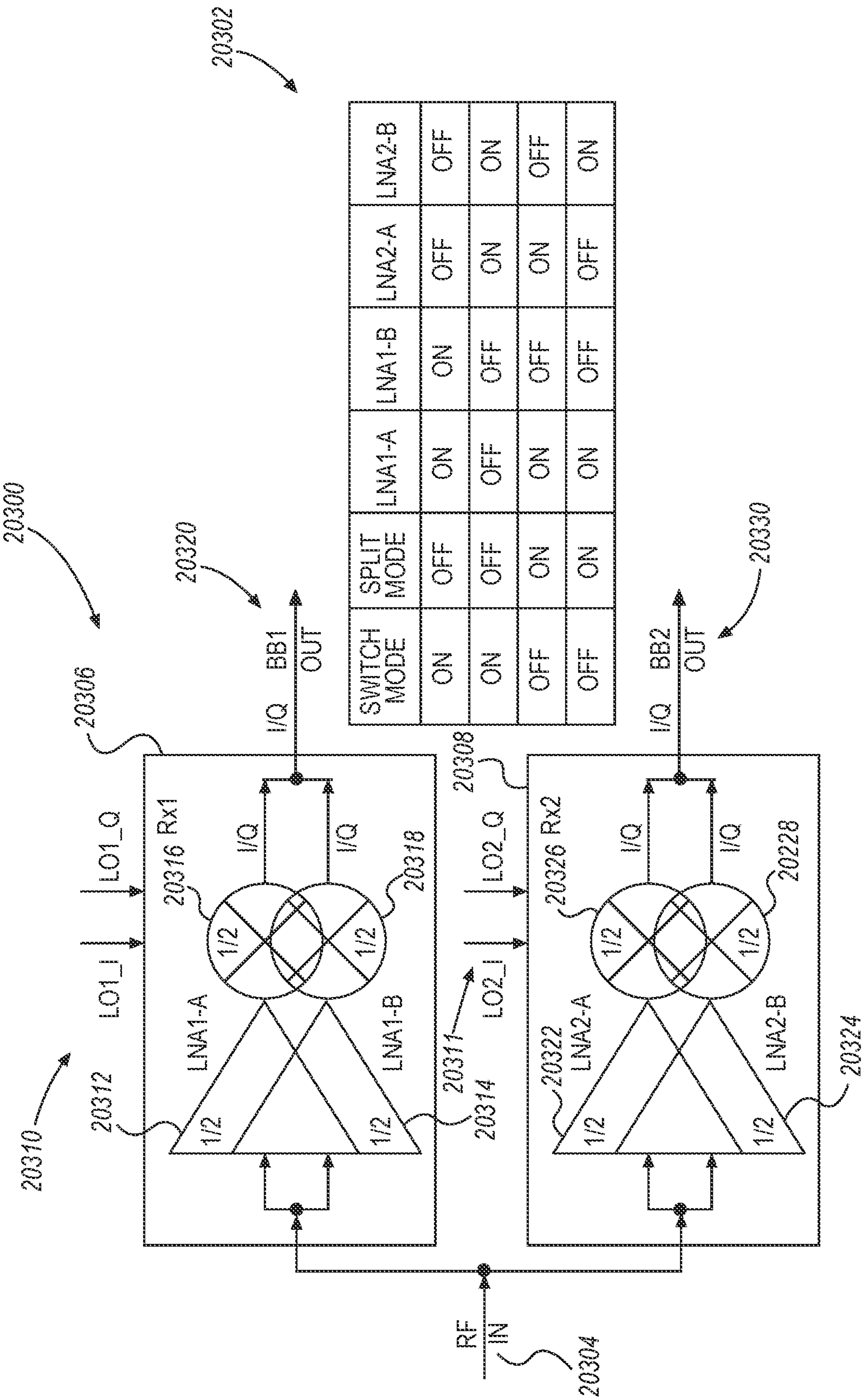

FIG. 203 illustrates a block diagram of an exemplary receiver using segmented low-noise amplifiers (LNAs) and segmented mixers according to some aspects.

Figure 204:
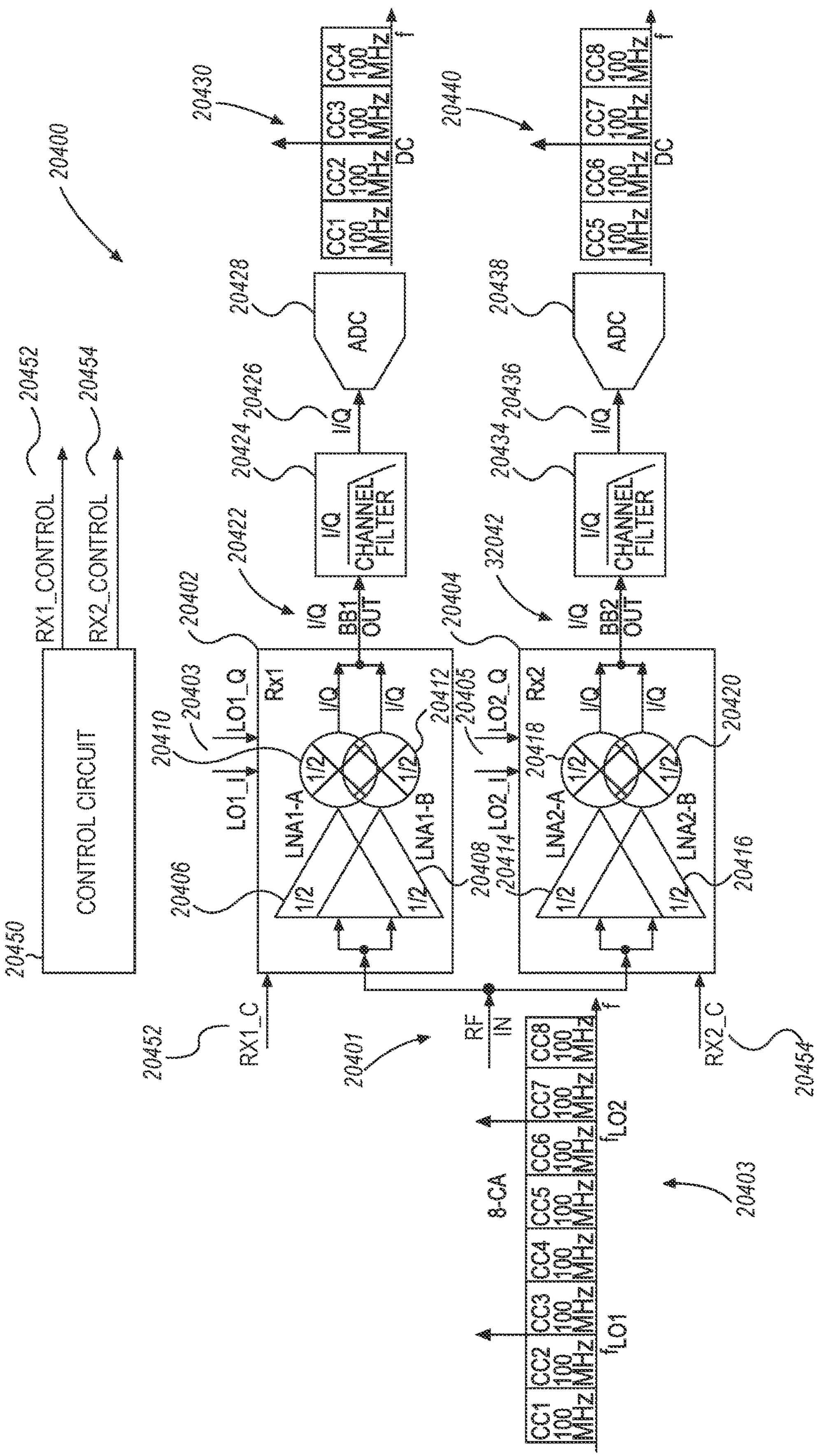

FIG. 204 illustrates a block diagram of an exemplary receiver using segmented low-noise amplifiers (LNAs) and segmented mixers operating in split mode to process a contiguous carrier aggregation signal according to some aspects.

Figure 205:
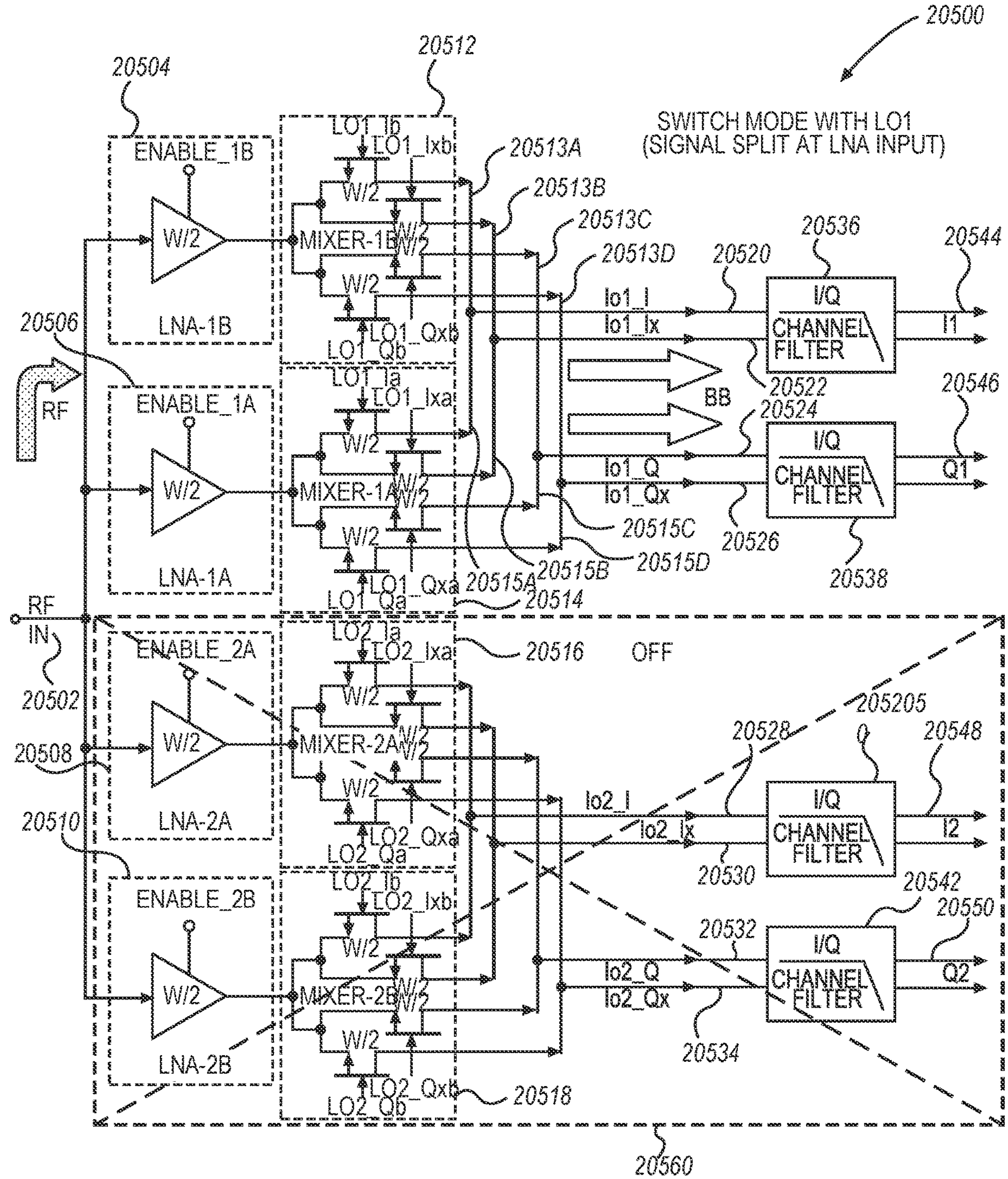

FIG. 205 illustrates a block diagram of an exemplary receiver using segmented LNAs and segmented mixers operating in switch mode with signal splitting at LNA input according to some aspects.

Figure 206:
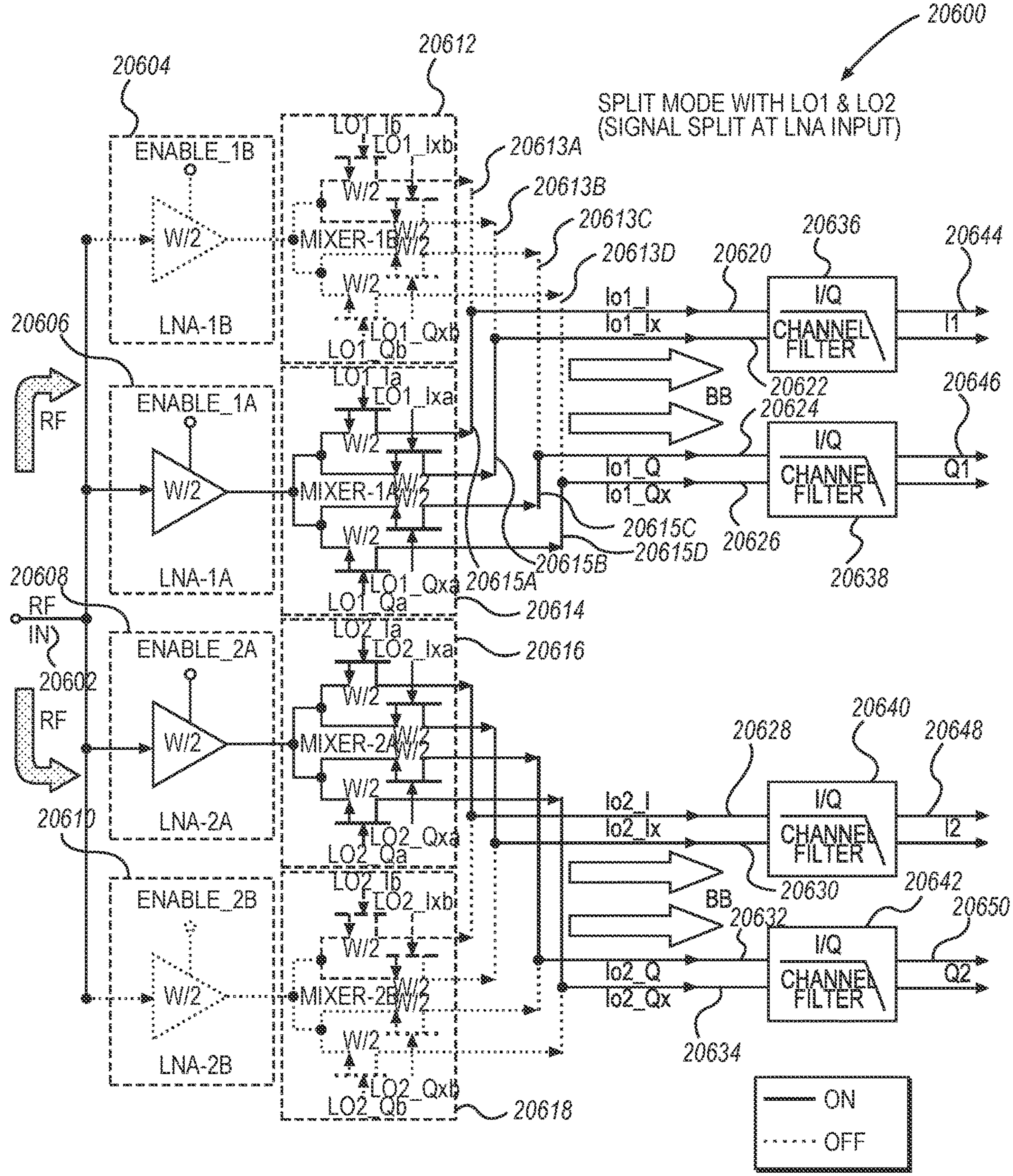

FIG. 206 illustrates a block diagram of an exemplary receiver using segmented LNAs and segmented mixers operating in split mode with signal splitting at LNA input according to some aspects.

Figure 207:
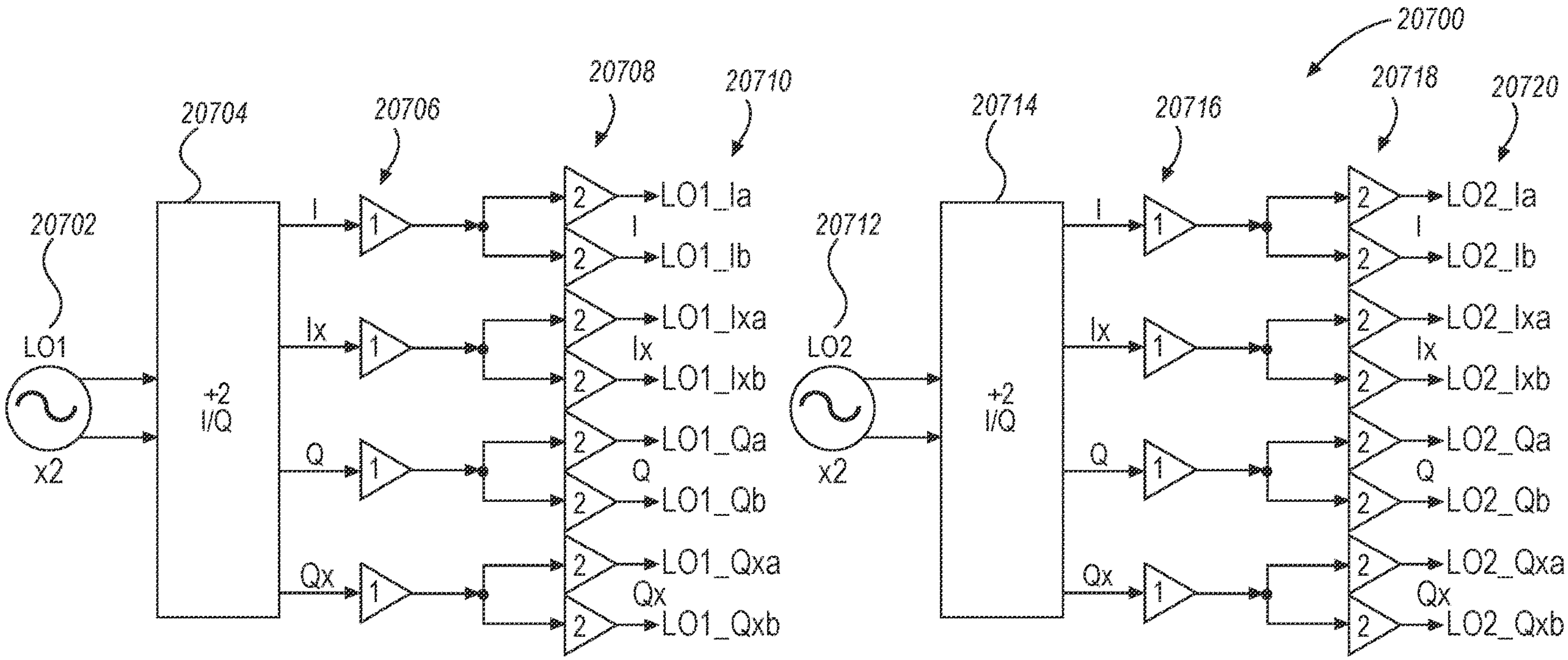

FIG. 207 illustrates a block diagram of an exemplary local oscillator (LO) signal generation circuit according to some aspects.

Figure 208:
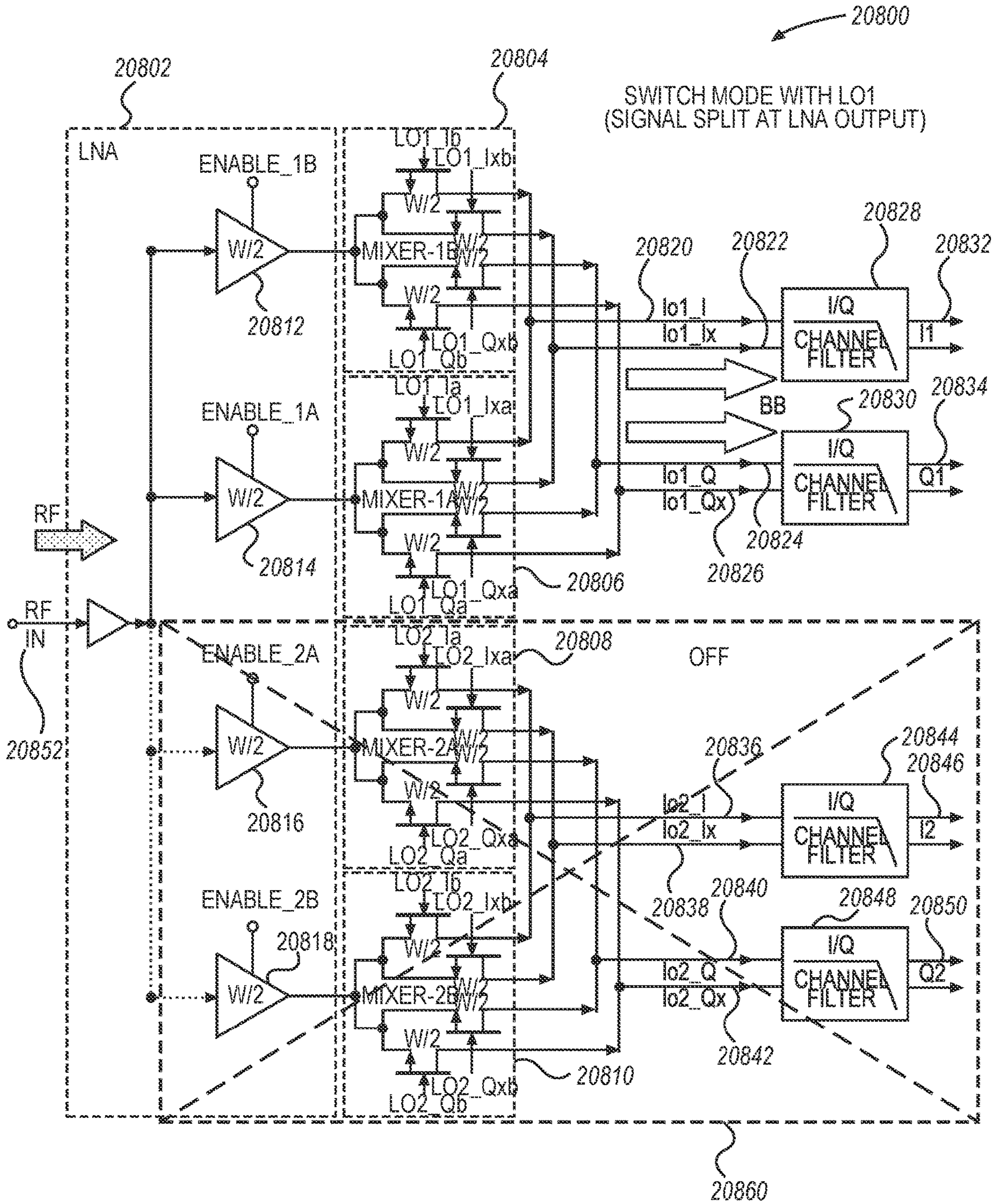

FIG. 208 illustrates a block diagram of an exemplary receiver using a segmented output LNA and segmented mixers operating in switch mode with signal splitting at LNA output according to some aspects.

Figure 209:
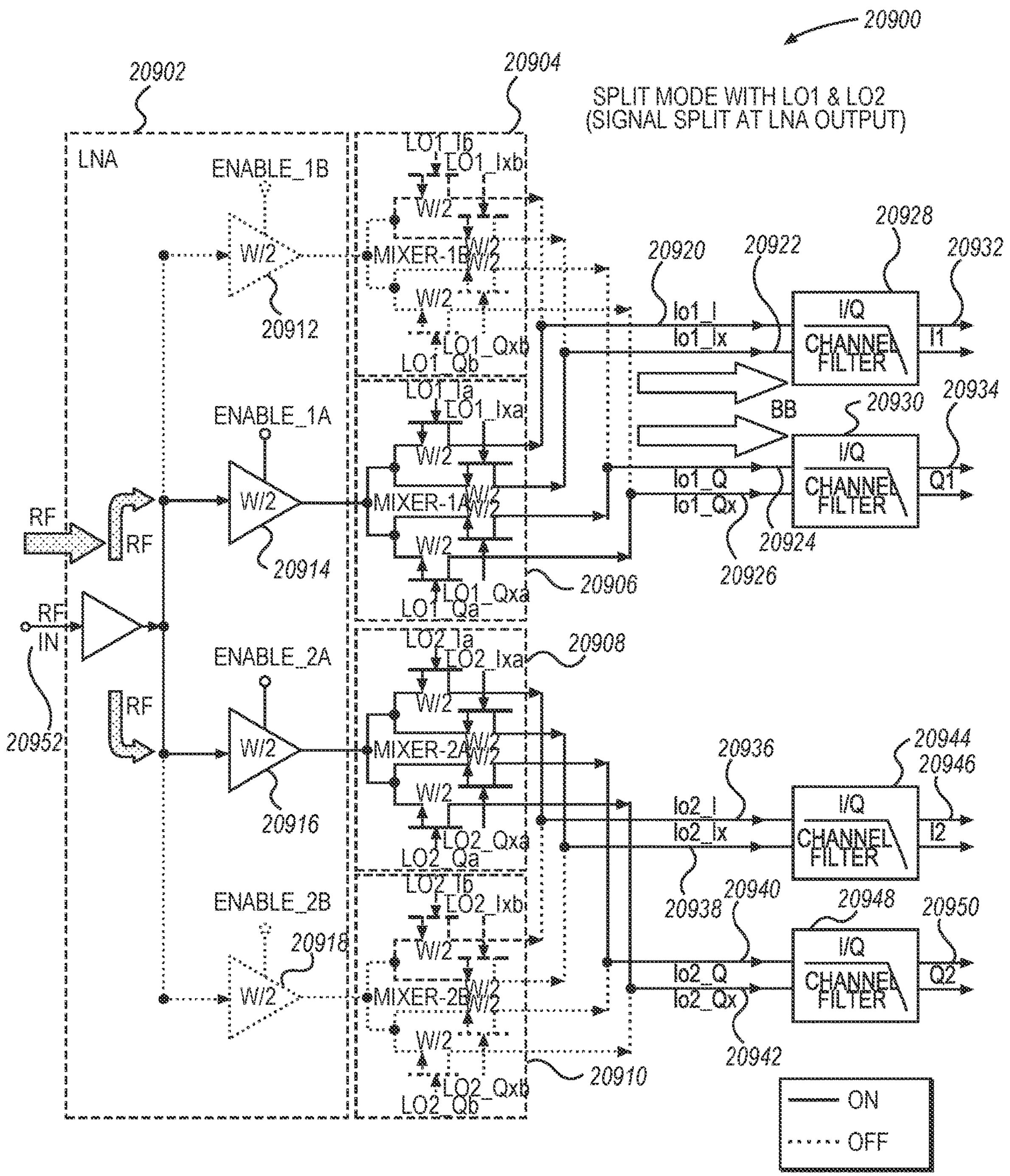

FIG. 209 illustrates a block diagram of an exemplary receiver using a segmented output LNA and segmented mixers operating in split mode with signal splitting at LNA output according to some aspects.

Figure 210:
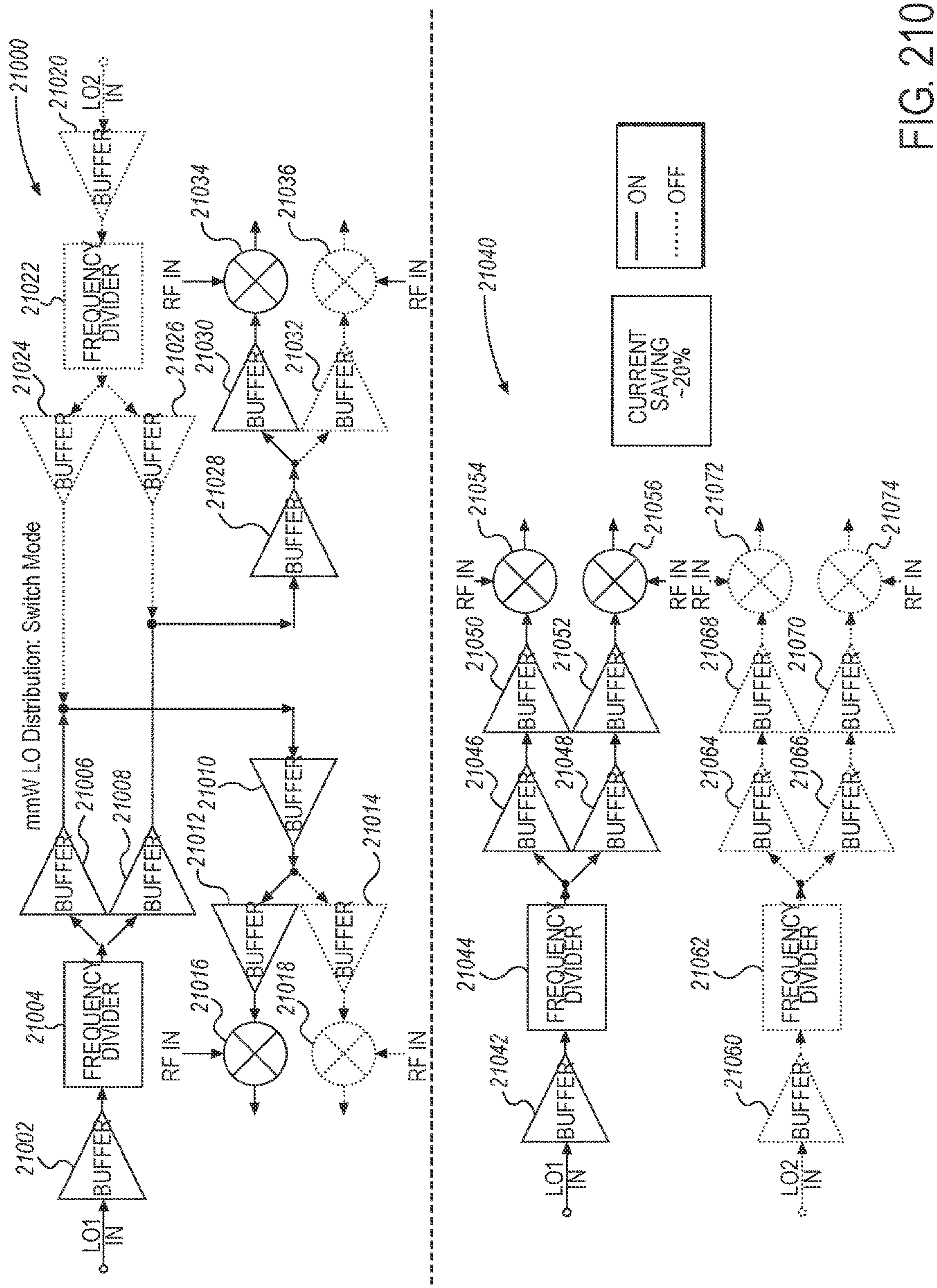

FIG. 210 illustrates exemplary LO distribution schemes for receivers operating in a switch mode according to some aspects.

Figure 211:
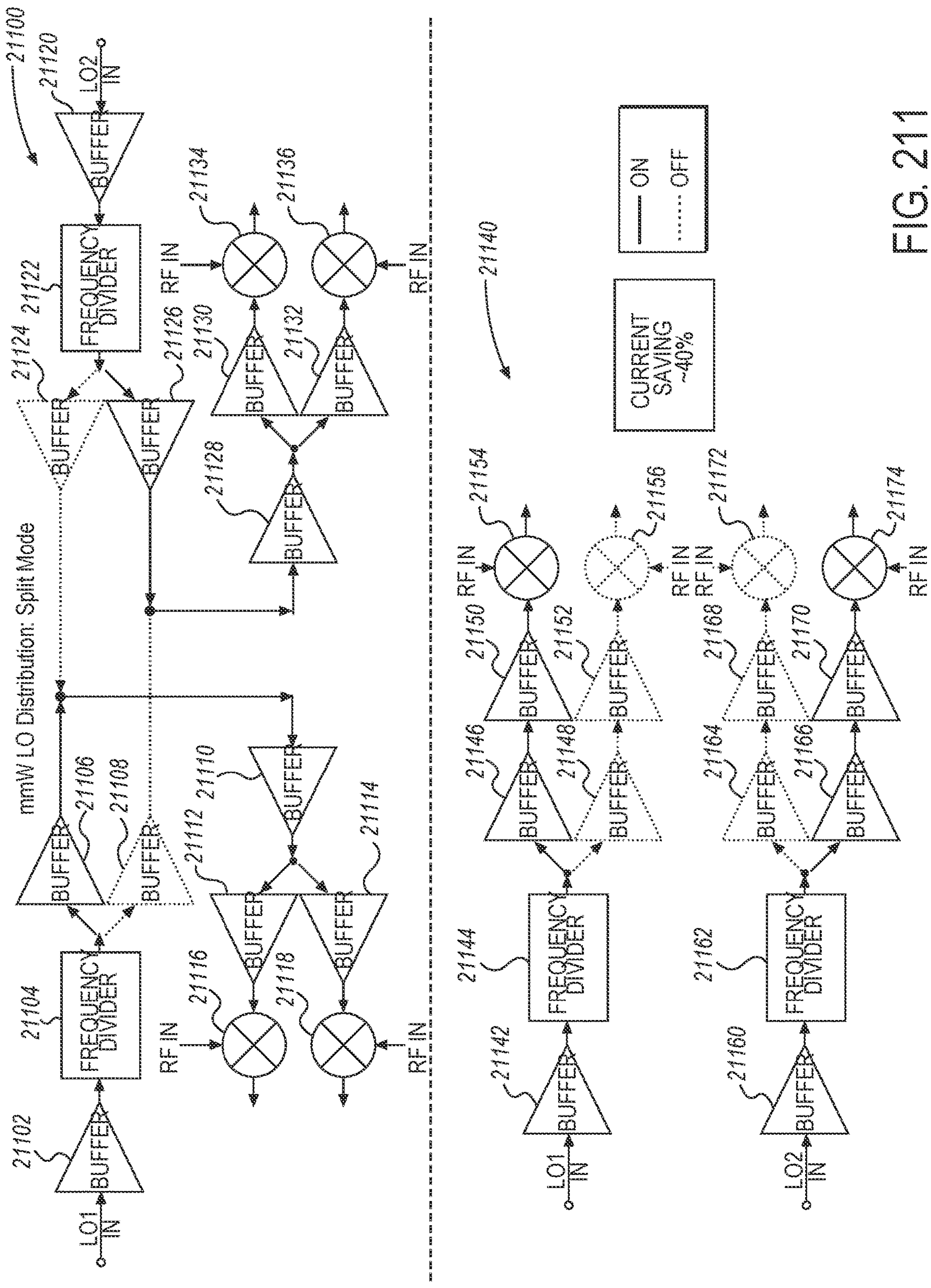

FIG. 211 illustrates exemplary LO distribution schemes for receivers operating in a split mode according to some aspects.

Figure 212:
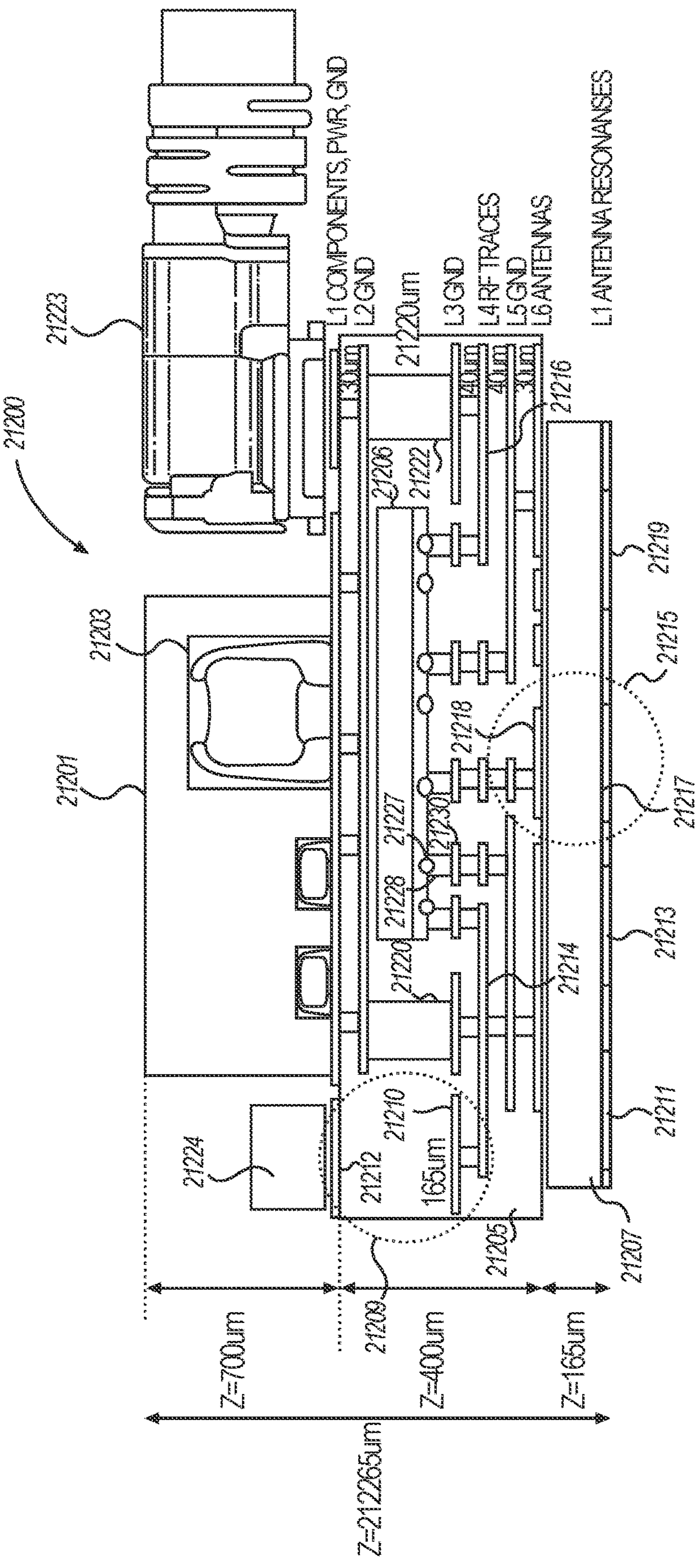

FIG. 212 is a side view of an unmolded stacked package-on-package embedded die radio system using a connector, according to some aspects.

Figure 213:
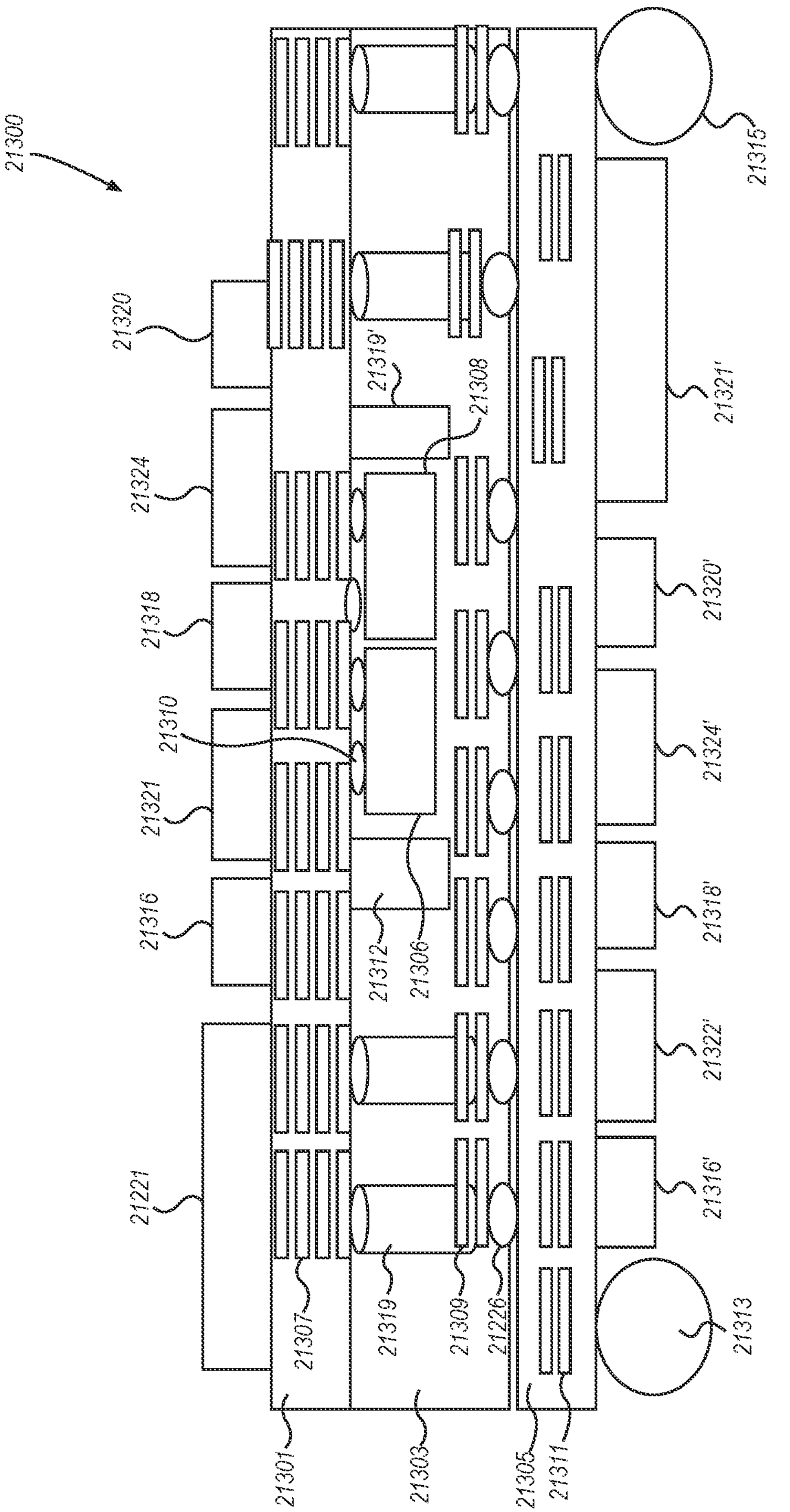

FIG. 213 is a side view of an exemplary molded stacked package-on-package embedded die radio system, according to some aspects.

Figure 214:
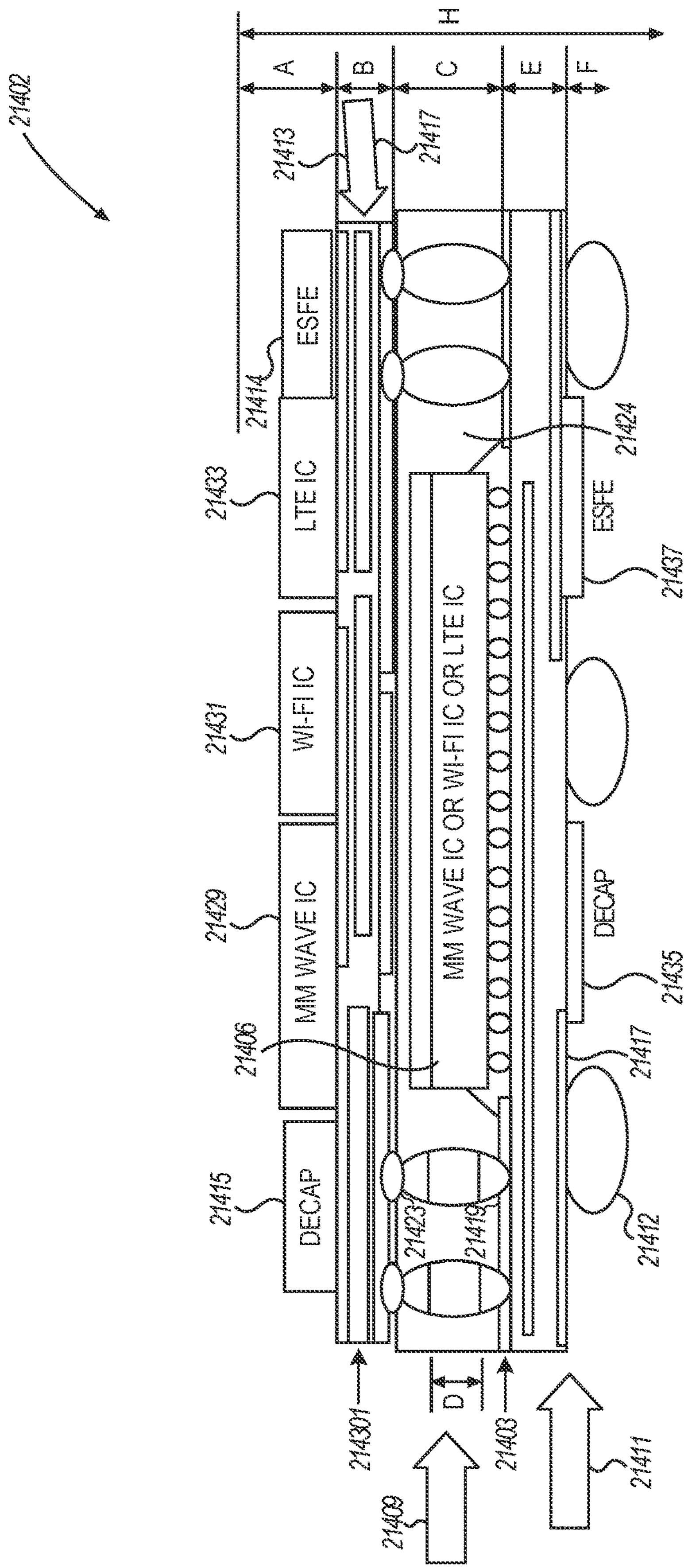

FIG. 214 is a side view of an exemplary molded package-on-package embedded die radio system, according to some aspects.

Figure 215:
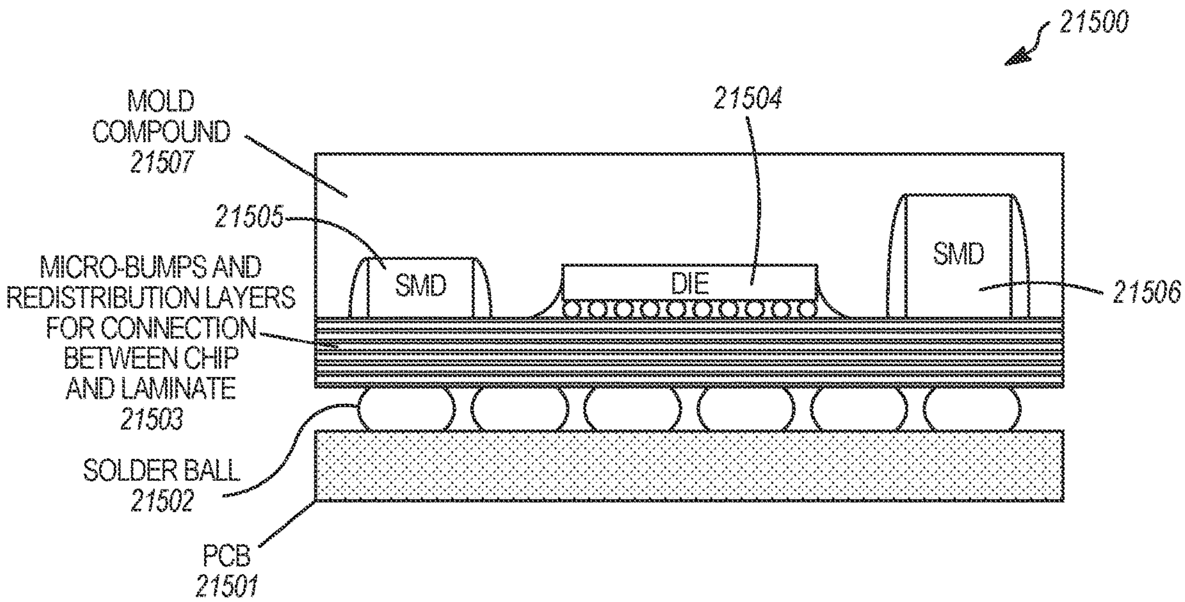

FIG. 215 illustrates cross-section of an exemplary computing platform with standalone components of an RF frontend, according to some aspects.

Figure 216:
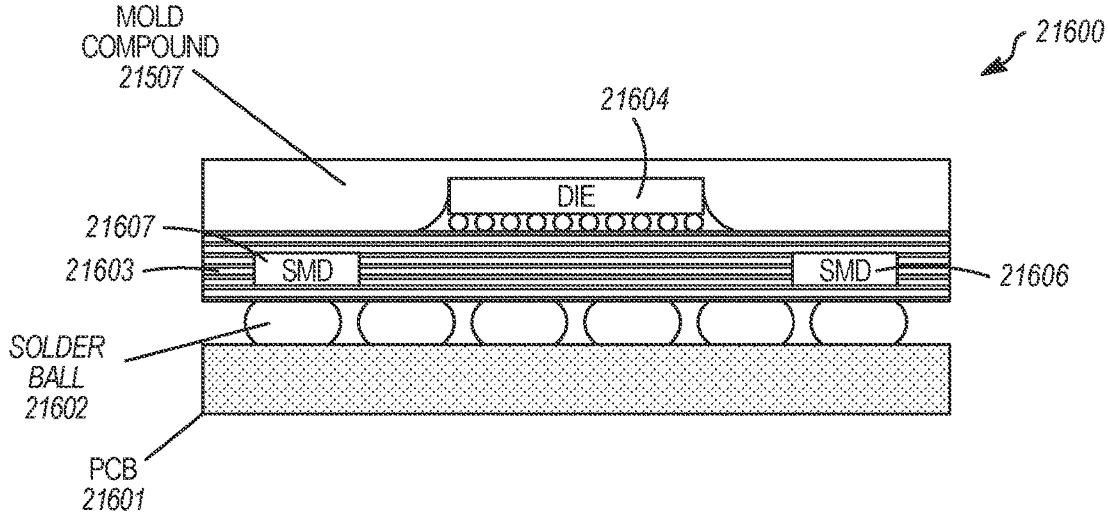

FIG. 216 illustrates cross-section of an exemplary computing platform with integrated components of a RF frontend within a laminate or substrate, according to some aspects.

Figure 217:
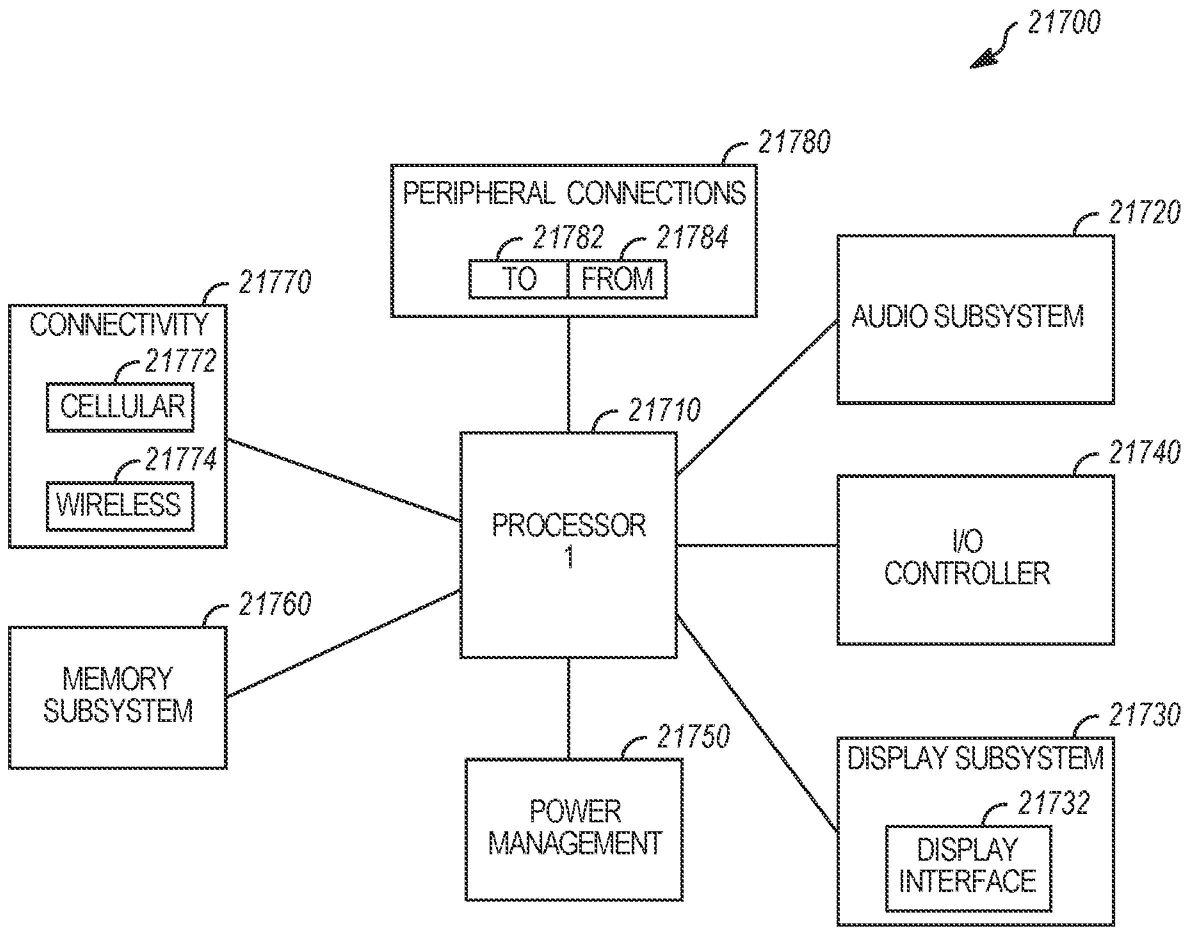

FIG. 217 illustrates an exemplary smart device or an exemplary computer system or a SoC (System-on-Chip) which is partially implemented in the laminate/substrate, according to some aspects.

Figure 218:
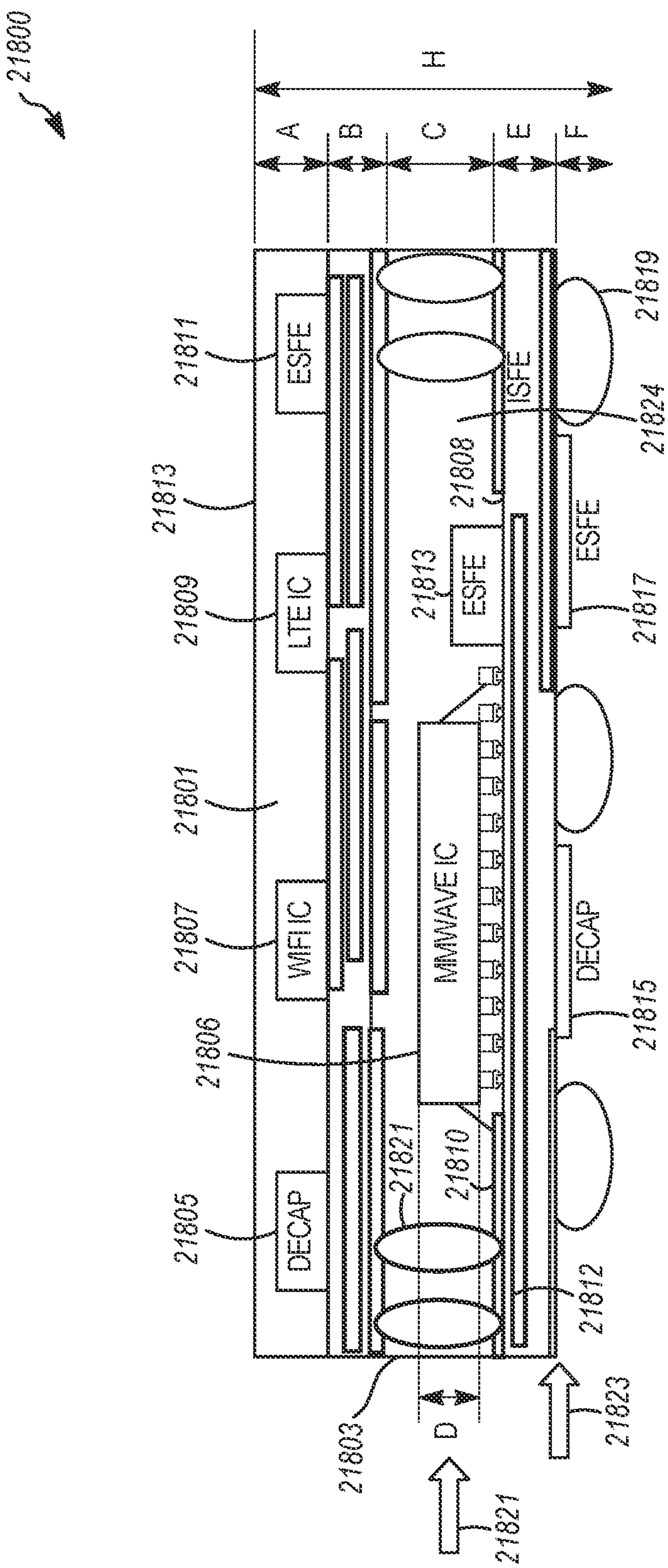

FIG. 218 is a side view of an exemplary molded package-on-package embedded die radio system, using ultra-thin components configured between the die and the antenna(s), according to some aspects.

Figure 219:
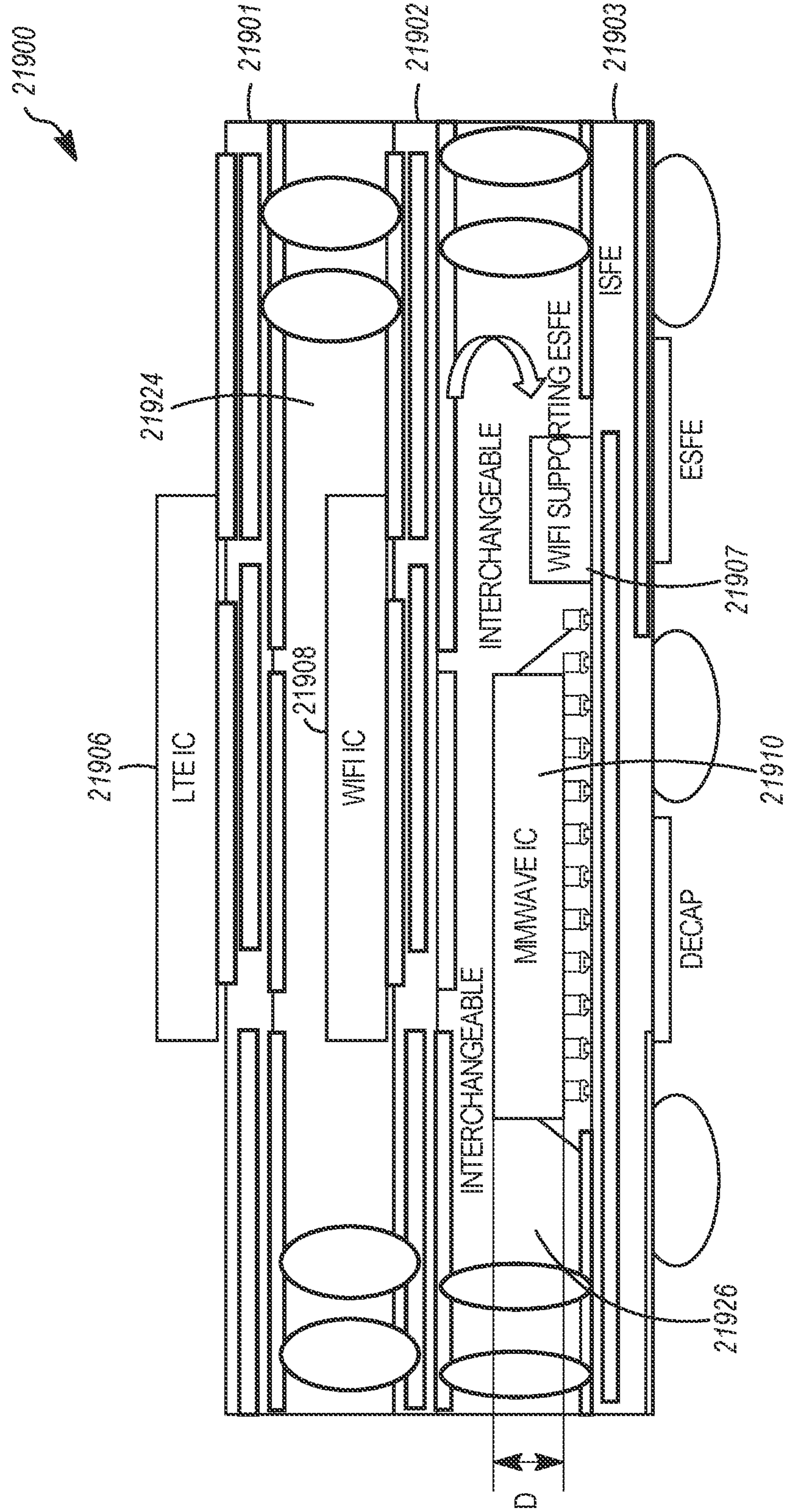

FIG. 219 is a side view of the molded stacked package-on-package embedded die radio system with three packages stacked one upon the other, according to some aspects.

Figure 220:
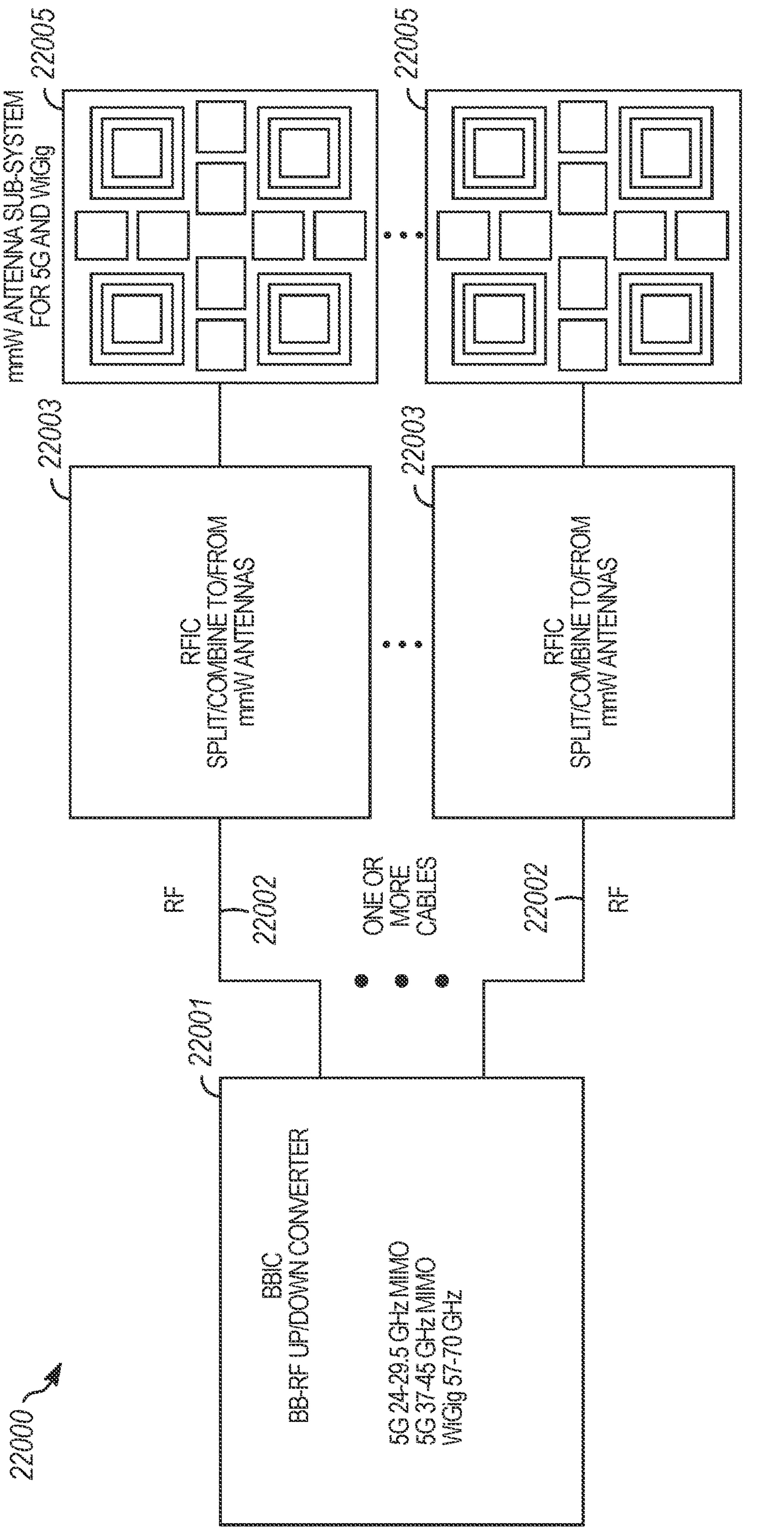

FIG. 220 is a high level block diagram of an exemplary mmWave RF architecture for 5G and WiGig, according to some aspects.

Figure 221:
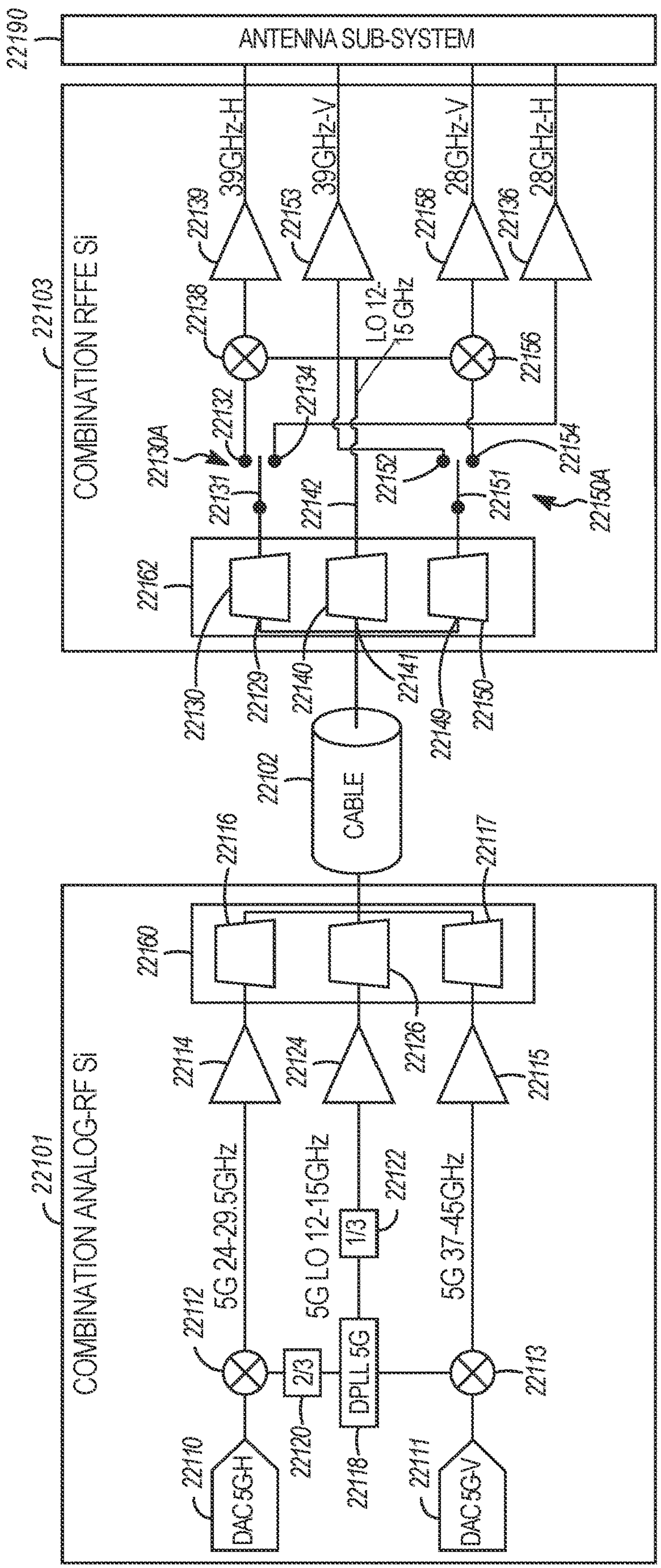

FIG. 221 illustrates a frequency conversion plan for an exemplary mmWave RF architecture for 5G and WiGig, according to some aspects.

Figure 221A:
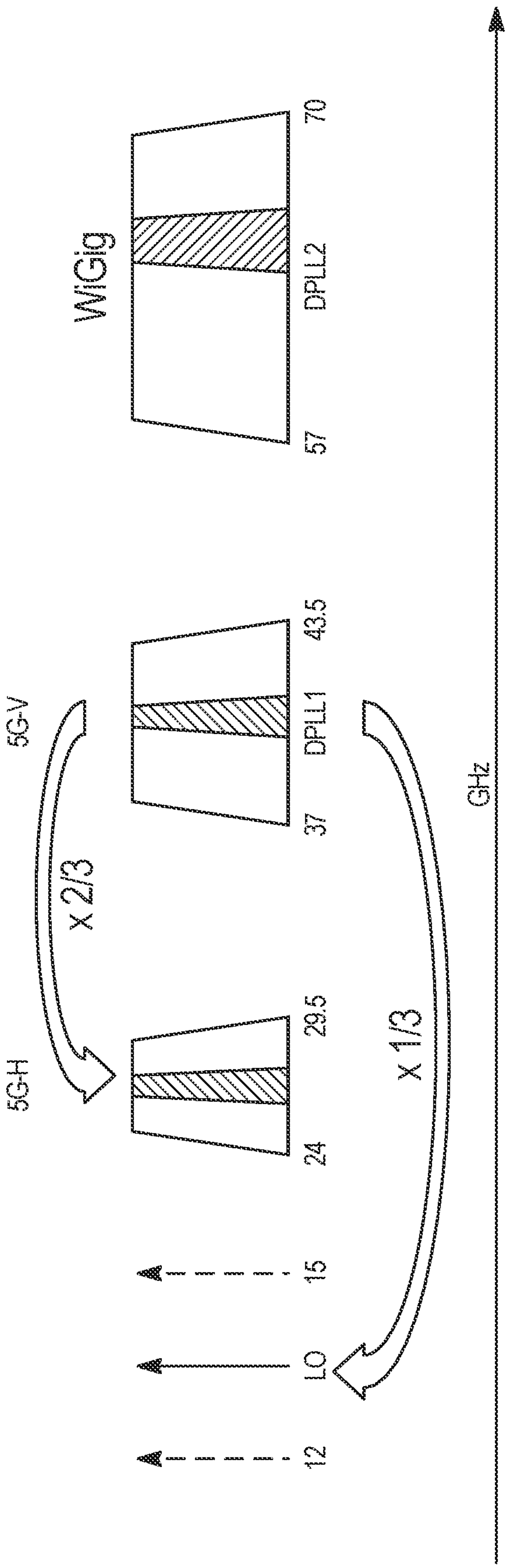

FIG. 221A is a schematic of frequency allocation for 5G 40 GHz frequency band, according to some aspects.

Figure 221B:
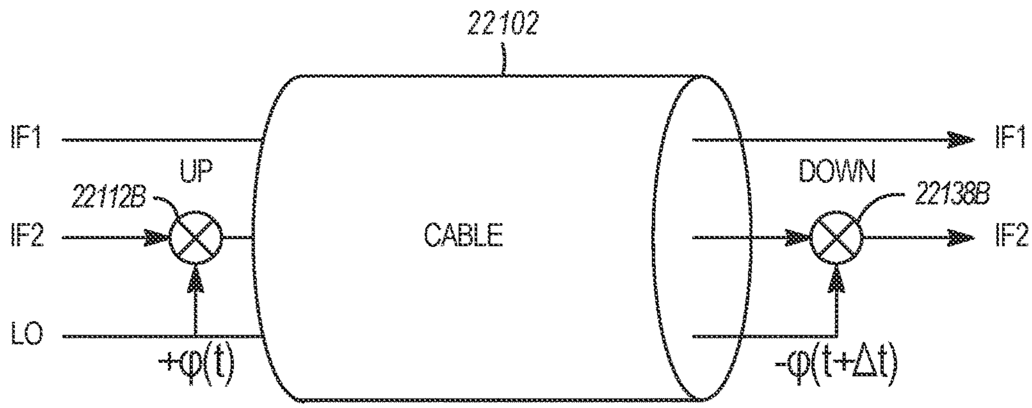

FIG. 221B illustrates an exemplary synthesizer source to shift the second frequency band stream, out of two frequency band streams, across the unused 5G frequency band, according to some aspects.

Figure 221C:
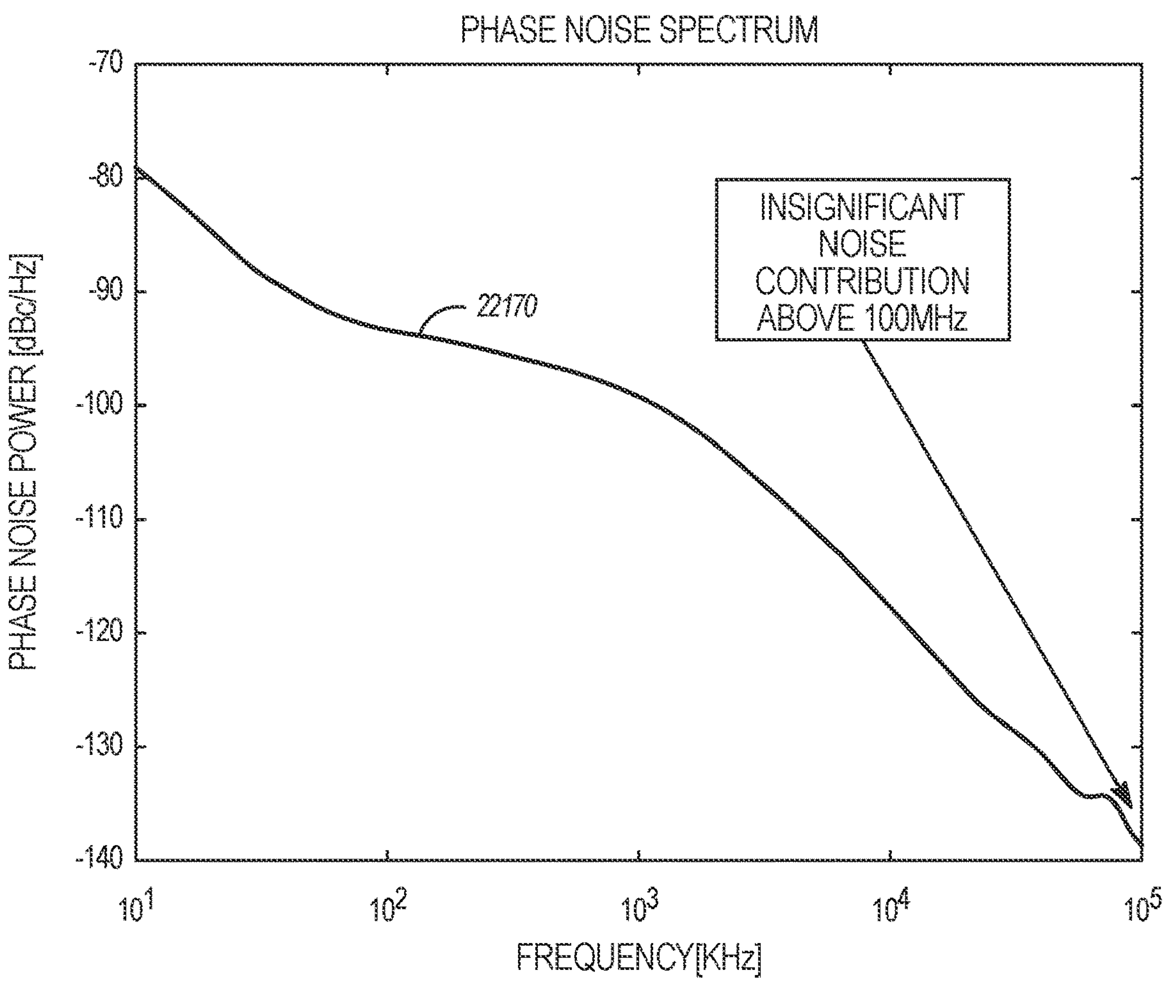

FIG. 221C illustrates phase noise power as a function of frequency, according to some aspects.

Figure 222:
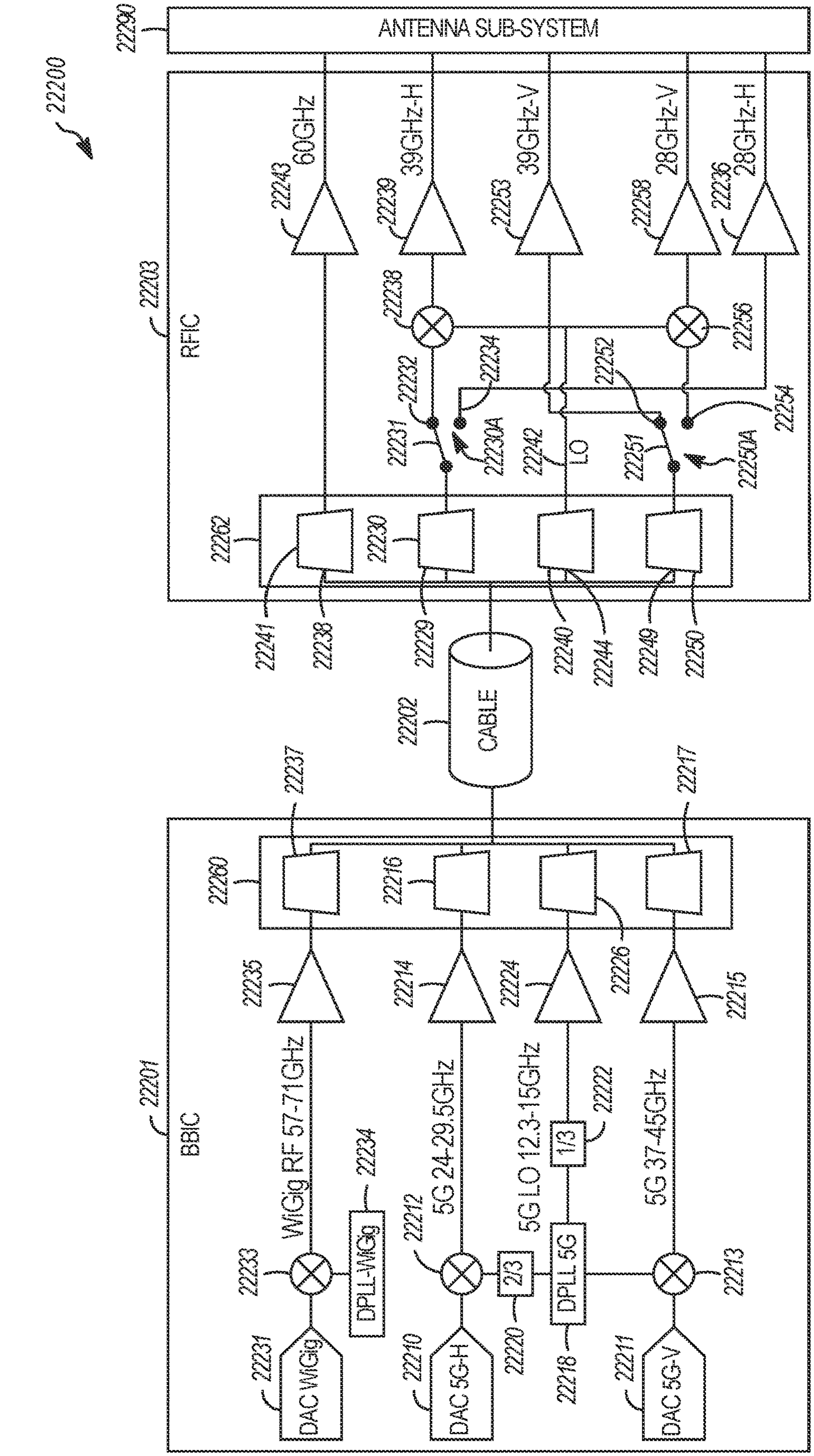

FIG. 222 illustrates an exemplary transmitter up-conversion frequency scheme for 5G in the 40 GHZ frequency band, according to some aspects.

Figure 223:
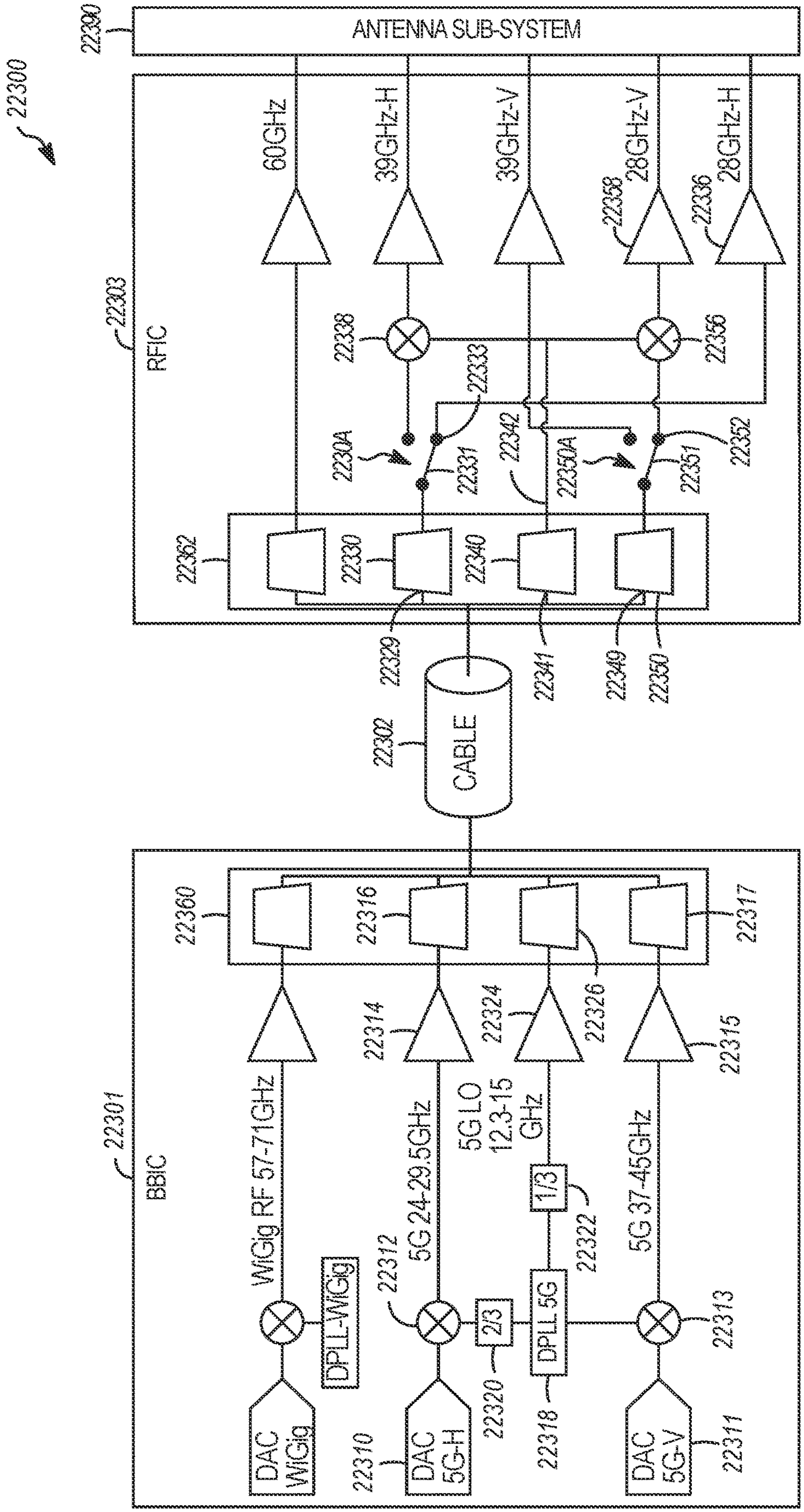

FIG. 223 illustrates an exemplary transmitter up-conversion frequency scheme for 5G in the 30 GHZ frequency band, according to some aspects.

Figure 224A:
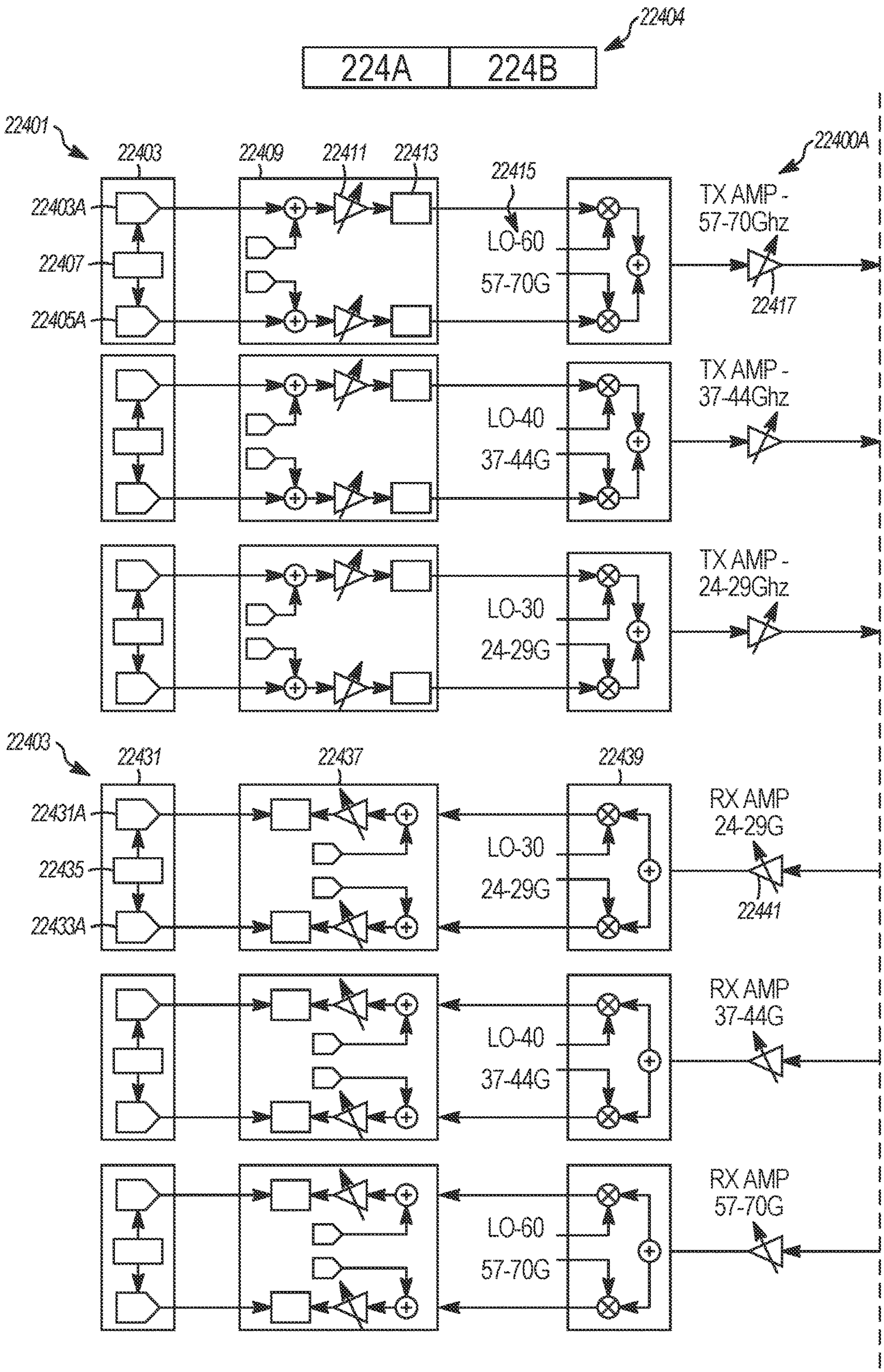

FIG. 224A is a first section of an exemplary baseband integrated circuit (BBIC) block diagram, according to some aspects.

Figure 224B:
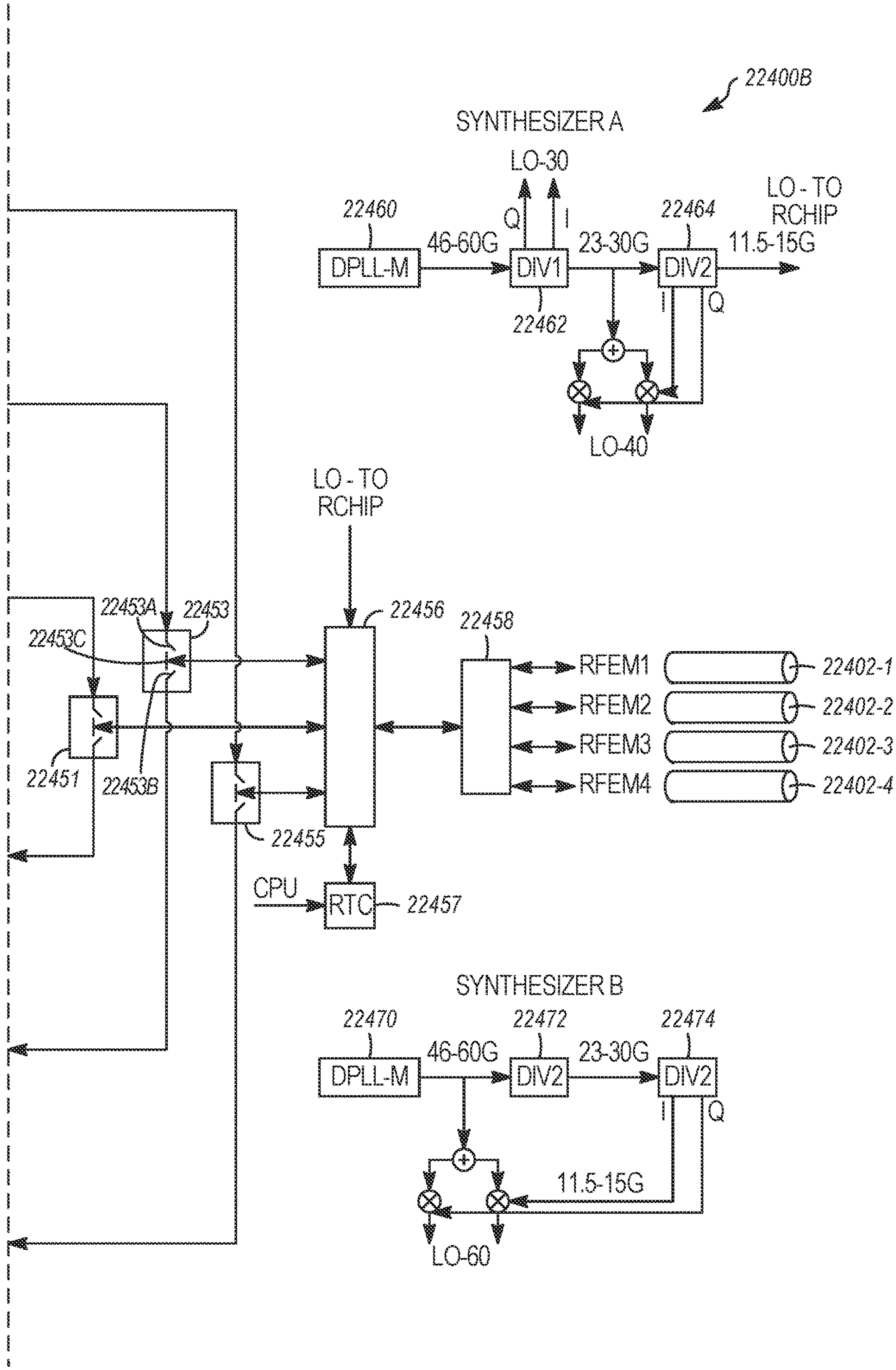

FIG. 224B is a second section of an exemplary baseband integrated circuit (BBIC) block diagram, according to some aspects.

Figure 225:
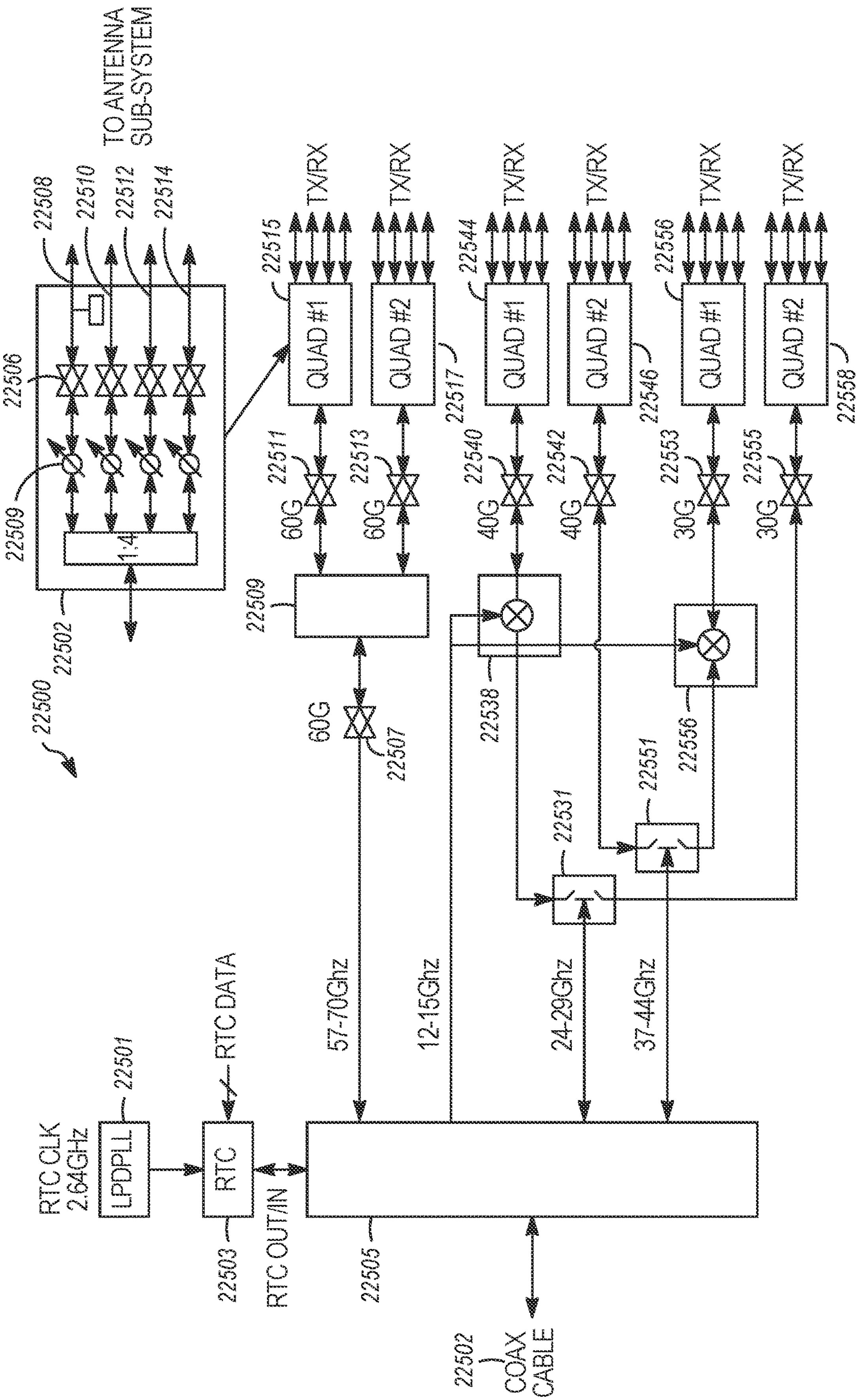

FIG. 225 is an exemplary detailed radio frequency integrated circuit (RFIC) block diagram, according to some aspects.

Figure 226A:
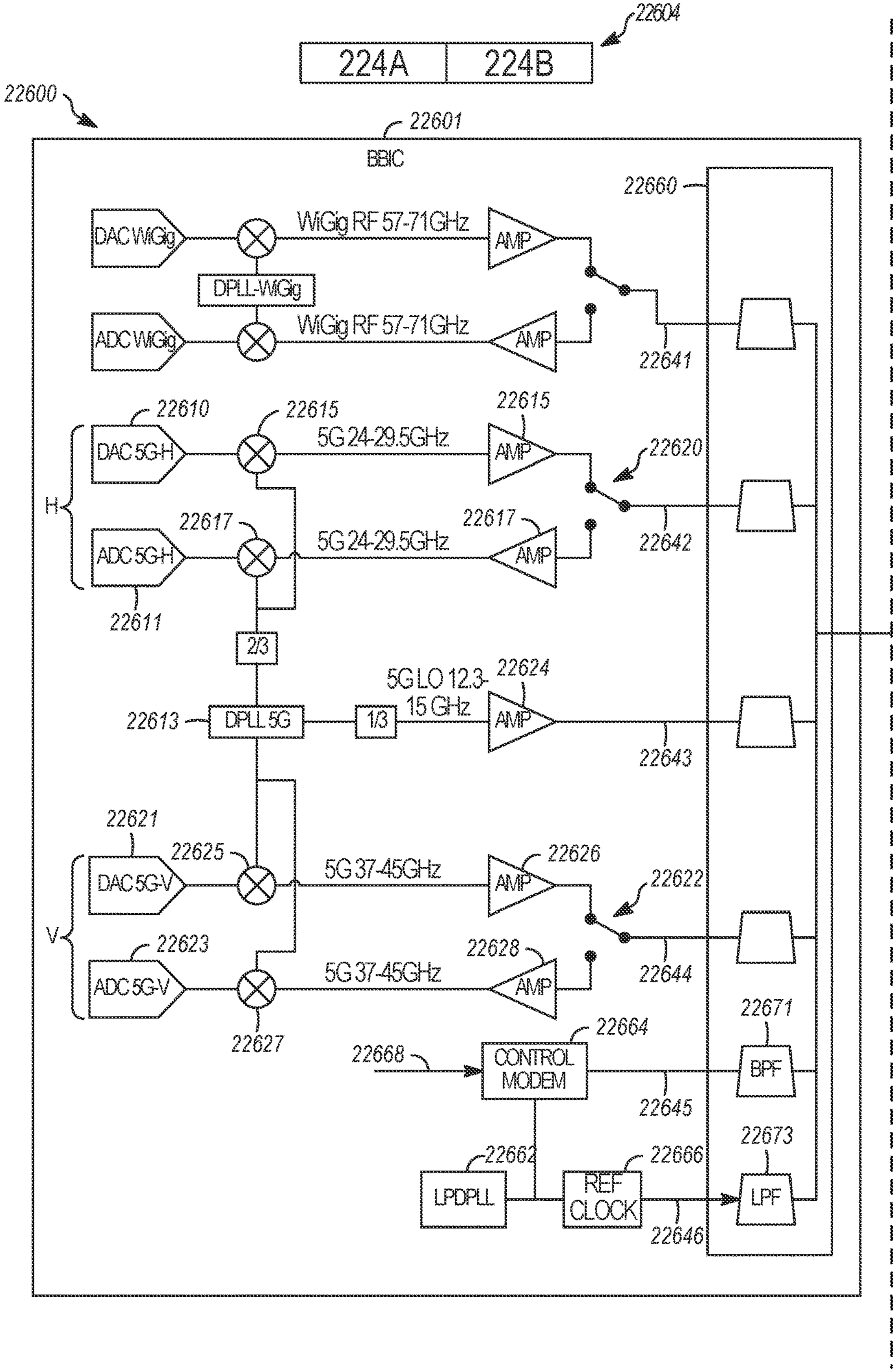
Figure 226B:
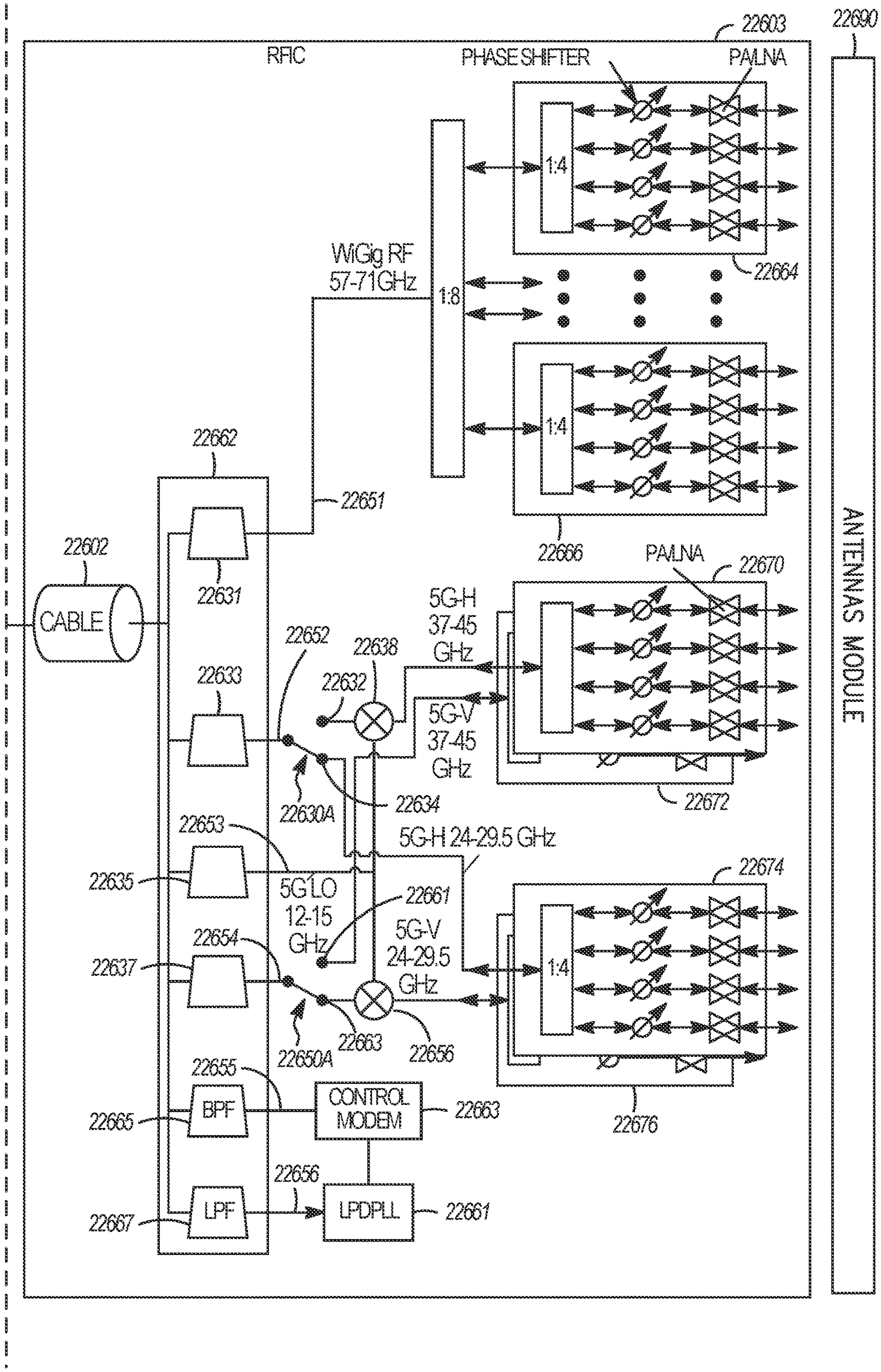

FIG. 226A and FIG. 226B are block diagrams of an exemplary mmWave and 5G communication system, according to some aspects.

Figure 227:
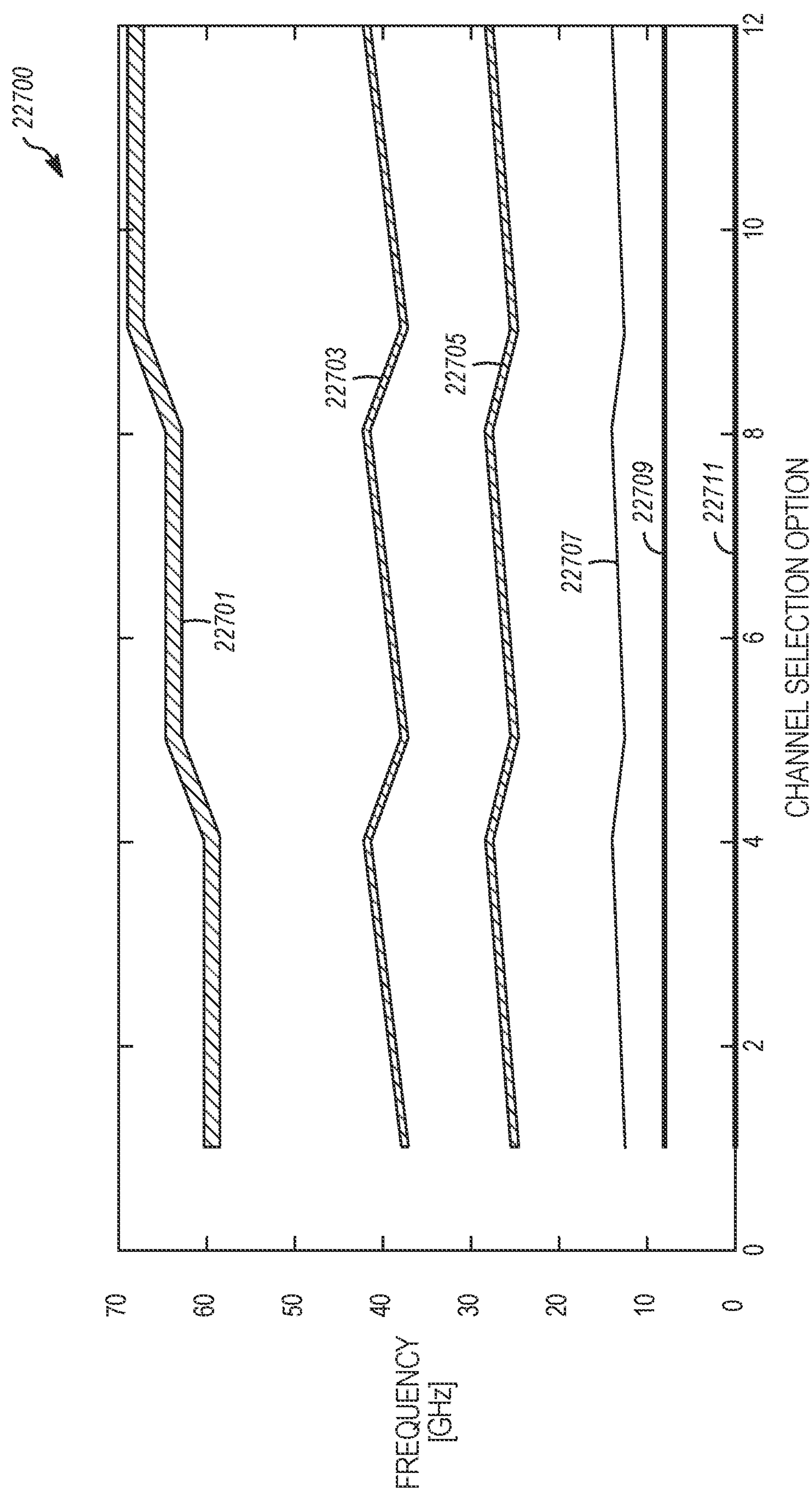

FIG. 227 illustrates a schematic allocation of radio frequency (RF), intermediate frequency (IF), and local oscillator (LO) frequency for a sweep across a variety of channel options, according to some aspects.

Figure 228:
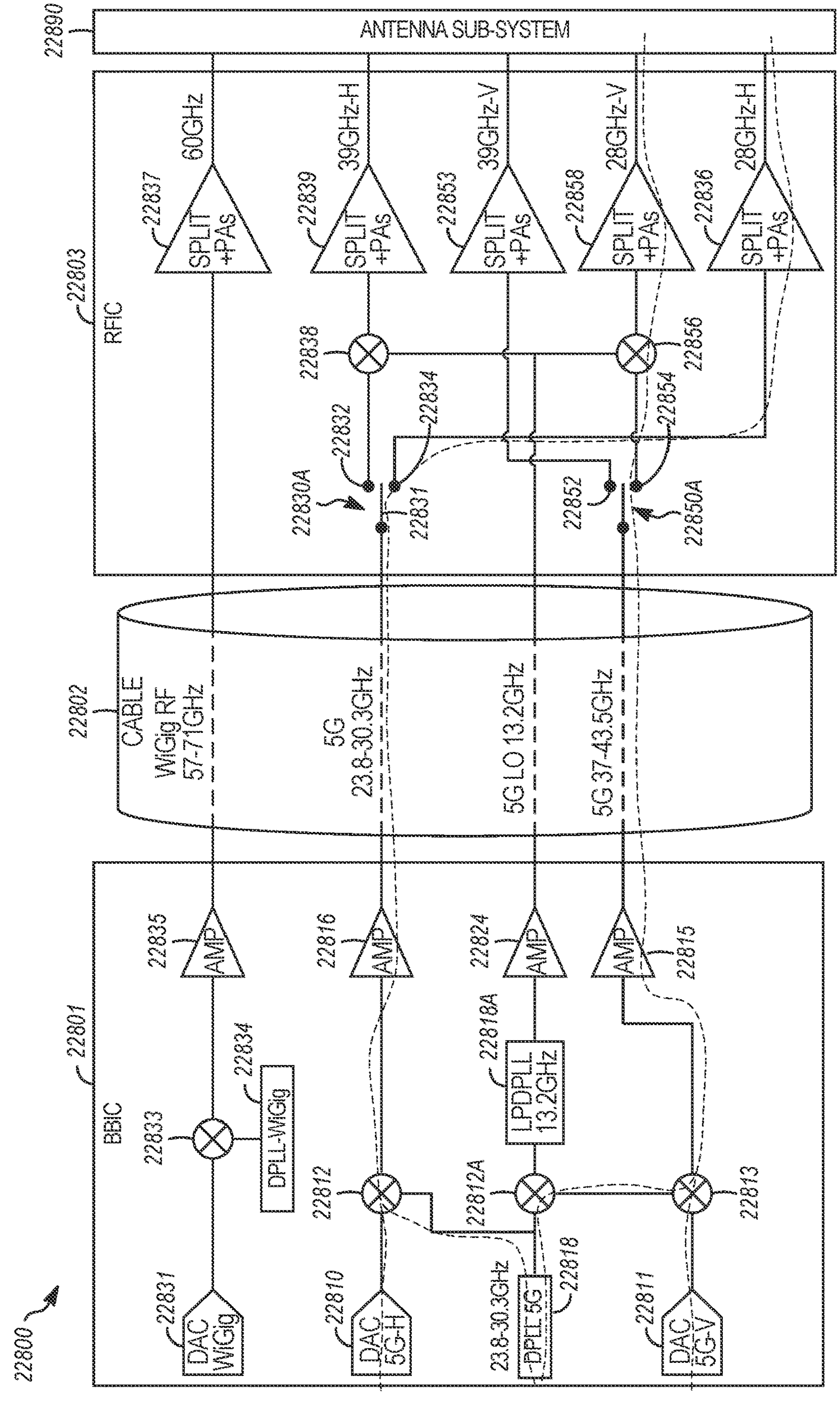

FIG. 228 illustrates an exemplary fixed LO transmitter up-conversion scheme, according to some aspects.

Figure 229:
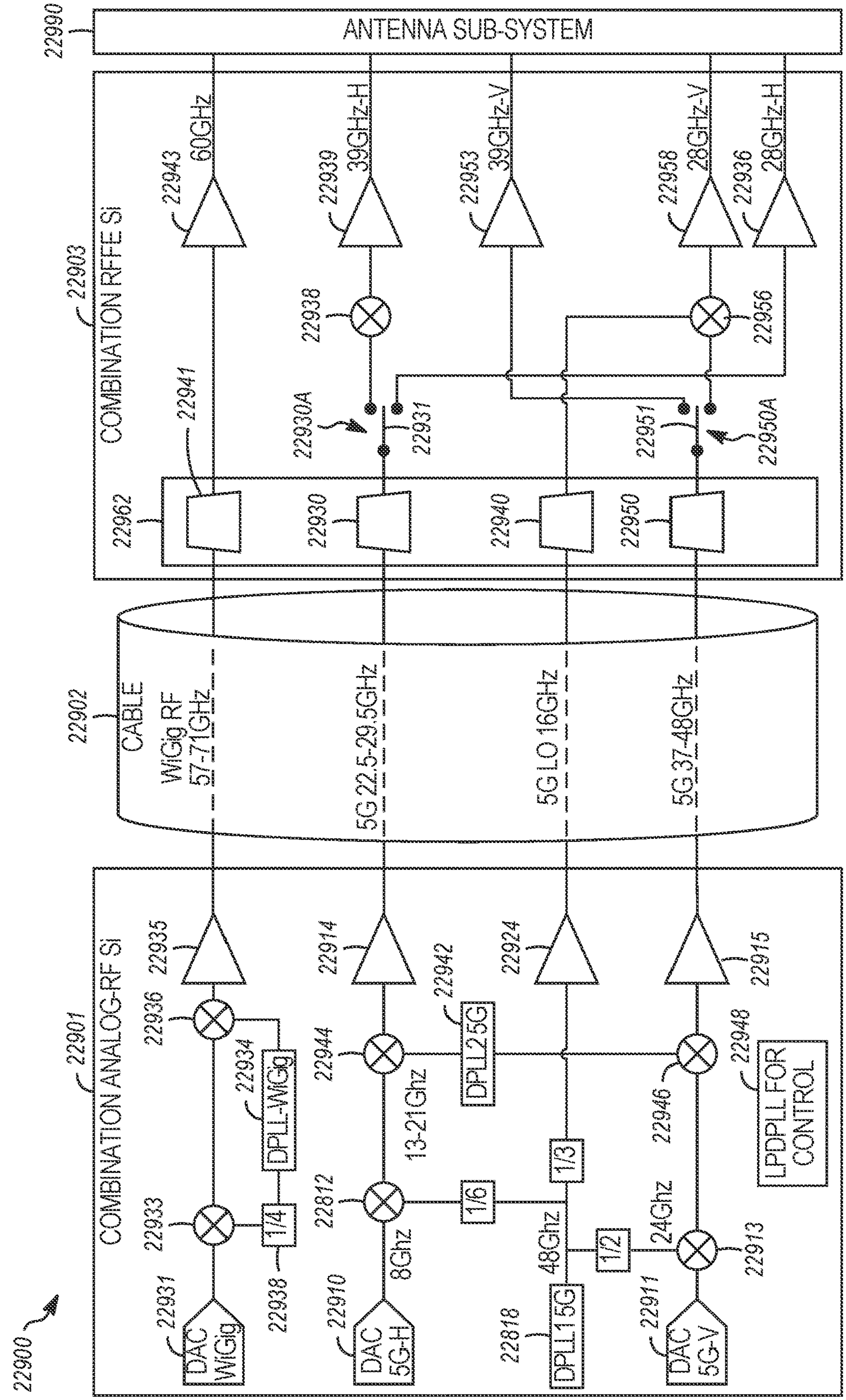

FIG. 229 illustrates dual conversion in an exemplary radio system including a first conversion with a fixed LO, followed by a second conversion with a varying LO, according to some aspects.

Figure 230:
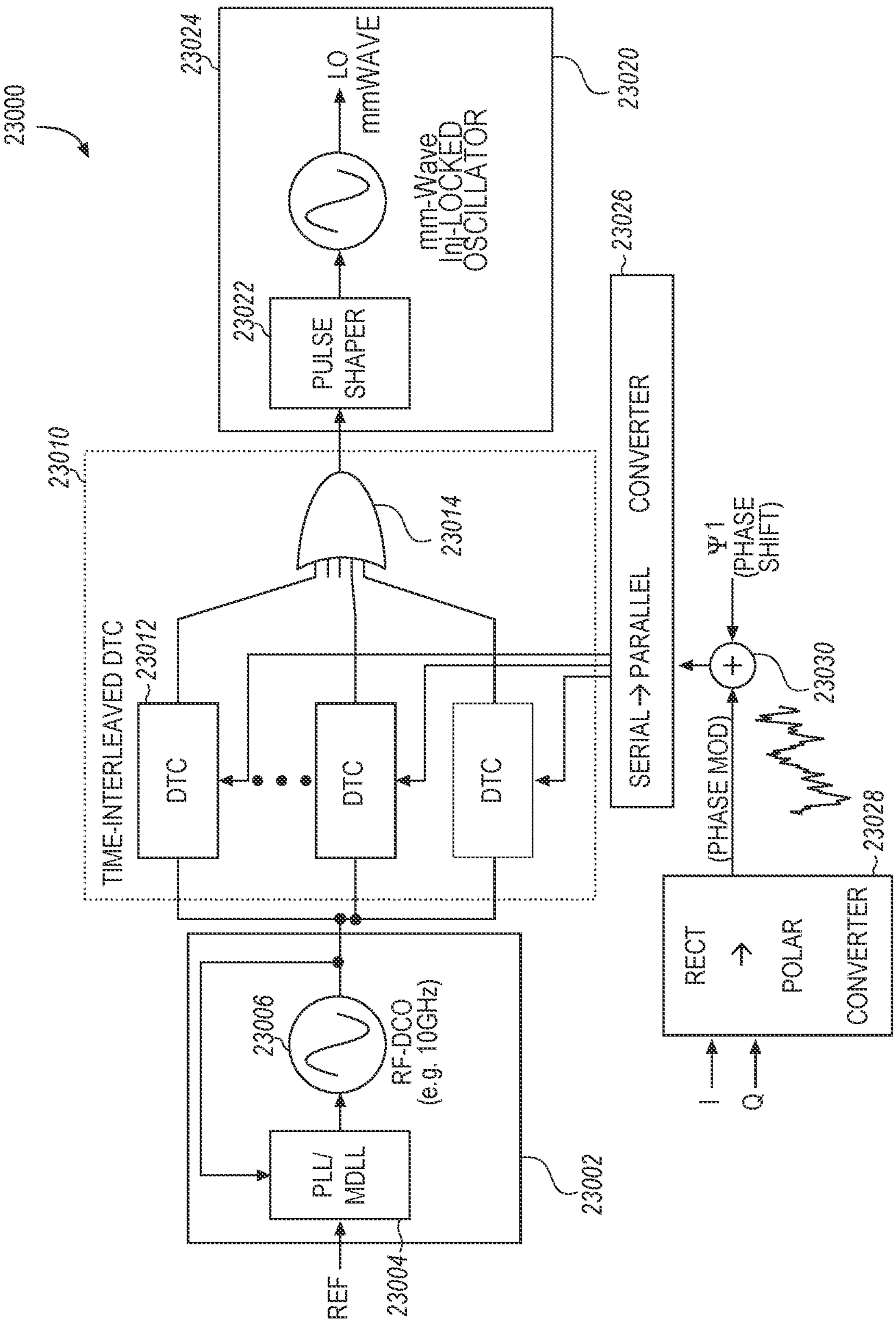

FIG. 230 illustrates a digital-to-time converter (DTC) structure in accordance with some aspects.

Figure 231:
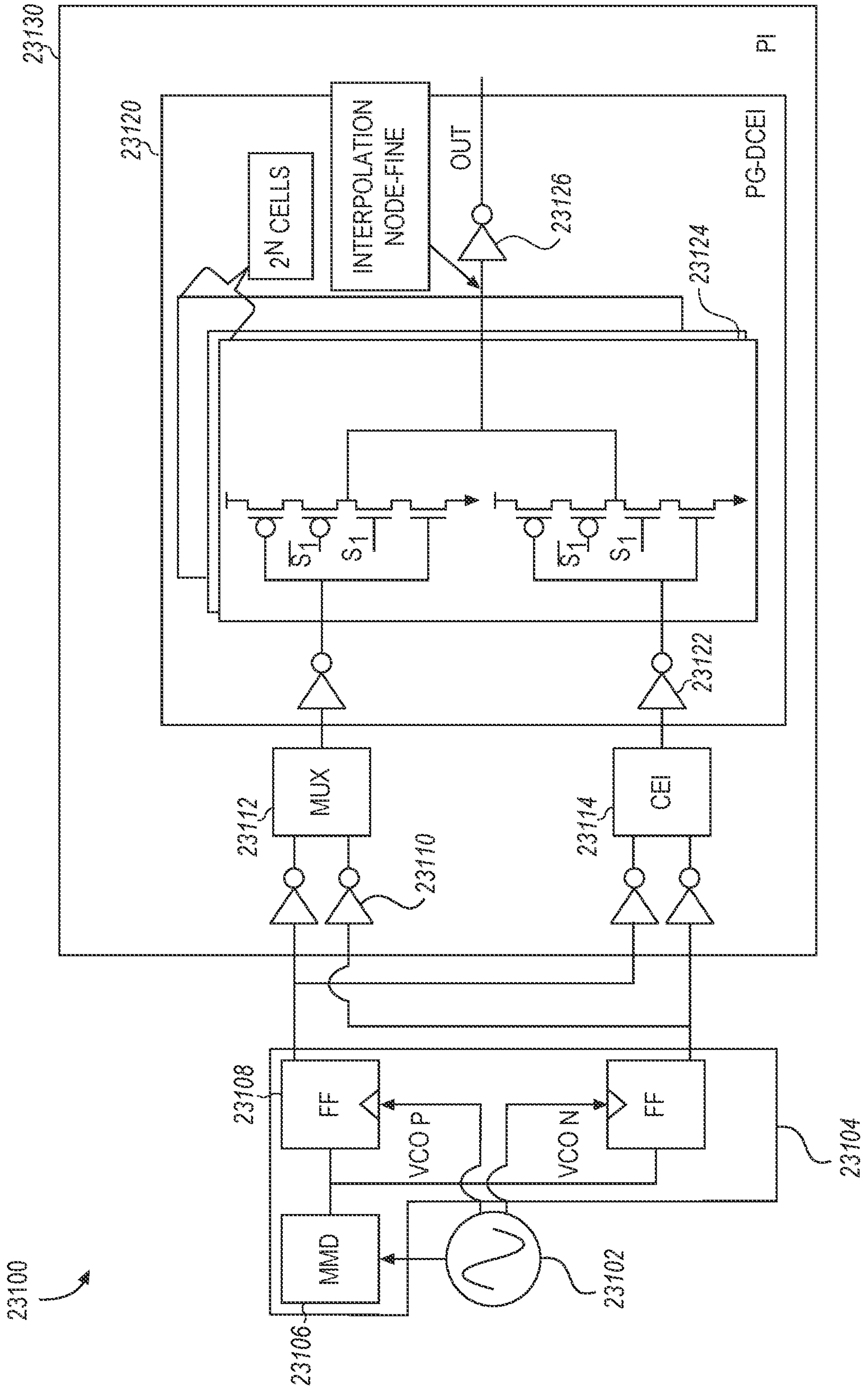

FIG. 231 illustrates an open loop calibrated DTC architecture in accordance with some aspects.

Figure 232A:
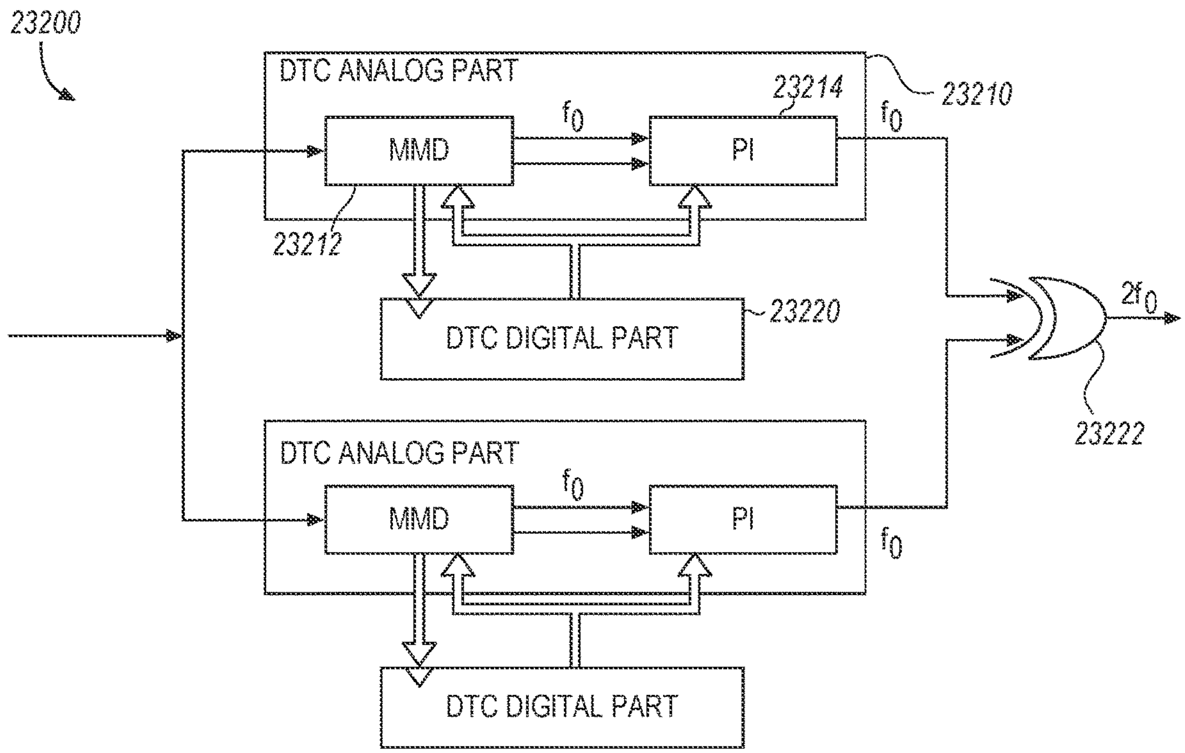
Figure 232B:
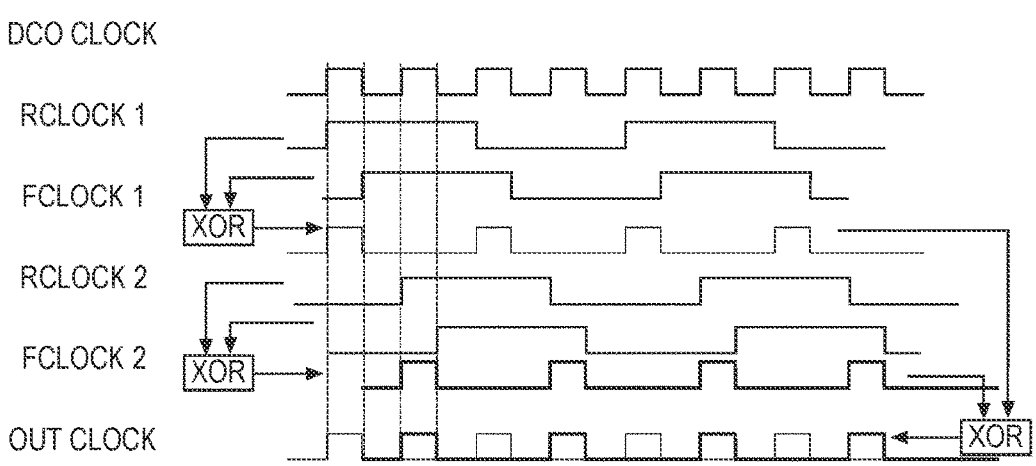

FIG. 232A illustrates time interleaving of DTCs to increase the clock frequency in accordance with some aspects; FIG. 232B illustrates clock signals of FIG. 232A in accordance with some aspects.

Figure 233:
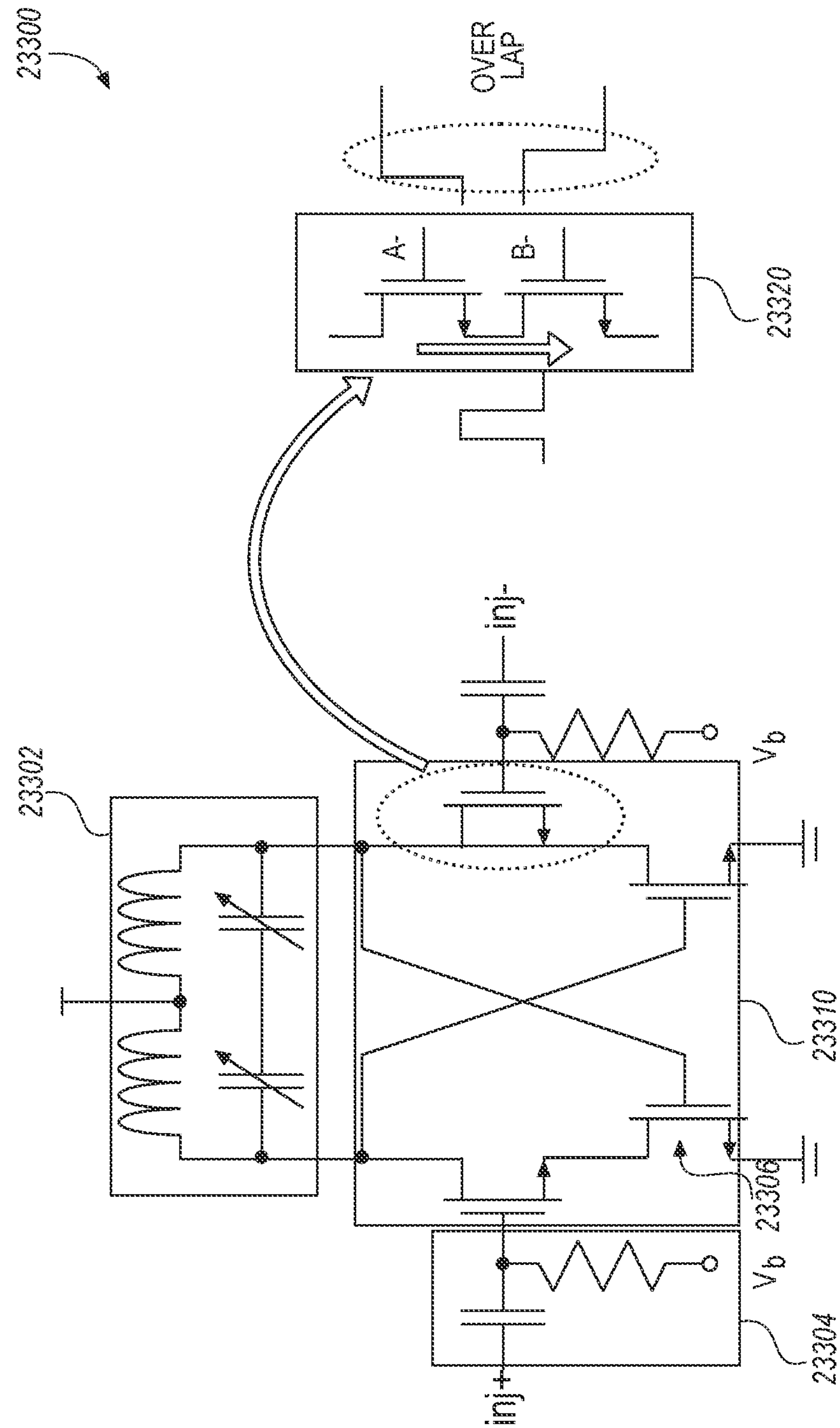

FIG. 233 illustrates a series injection locking oscillator with pulse shaping in accordance with some aspects.

Figure 234:
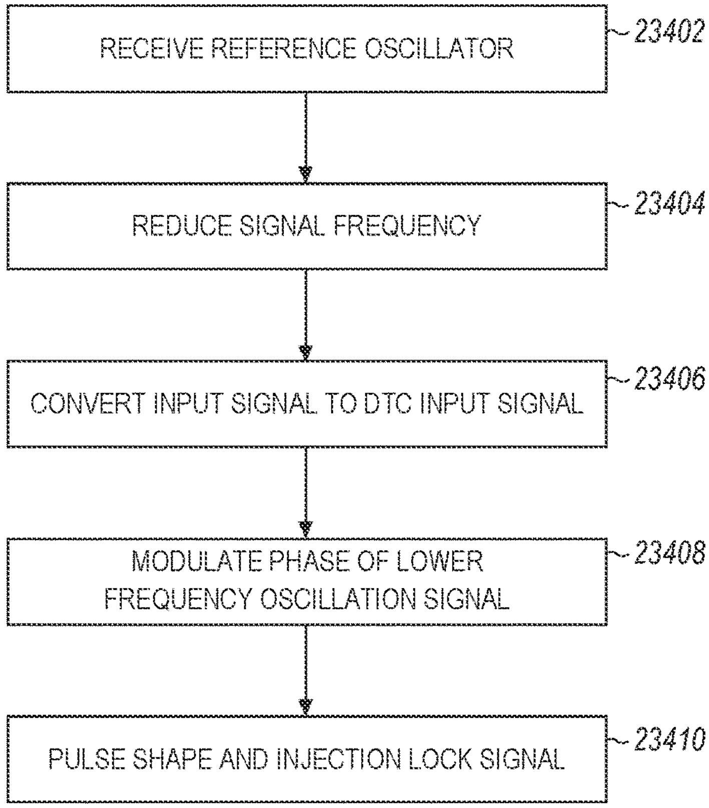

FIG. 234 illustrates a method of providing a mmWave frequency signal in accordance with some aspects.

Figure 235:
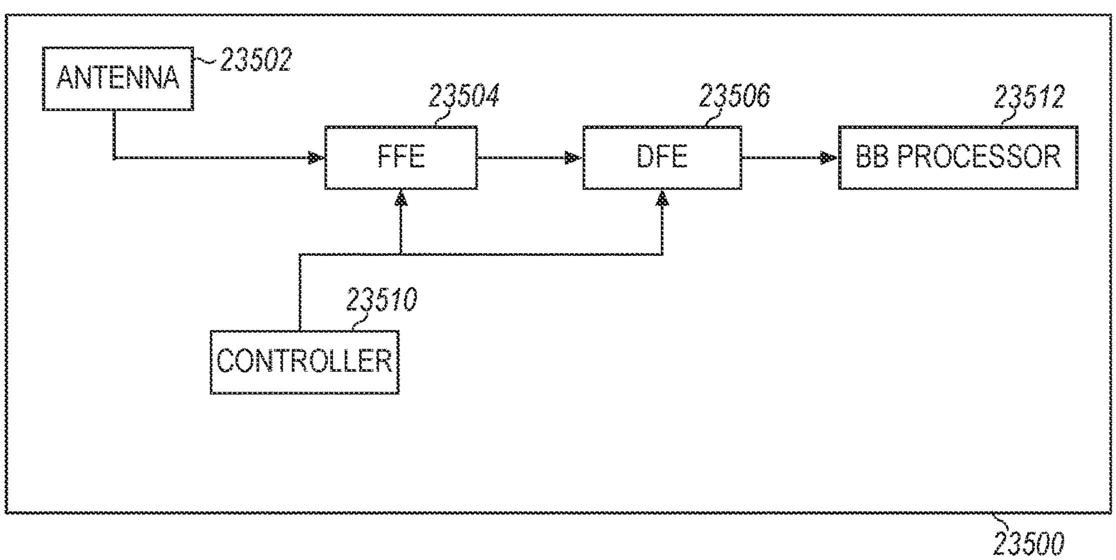

FIG. 235 illustrates a receiver in accordance with some aspects.

Figure 236:
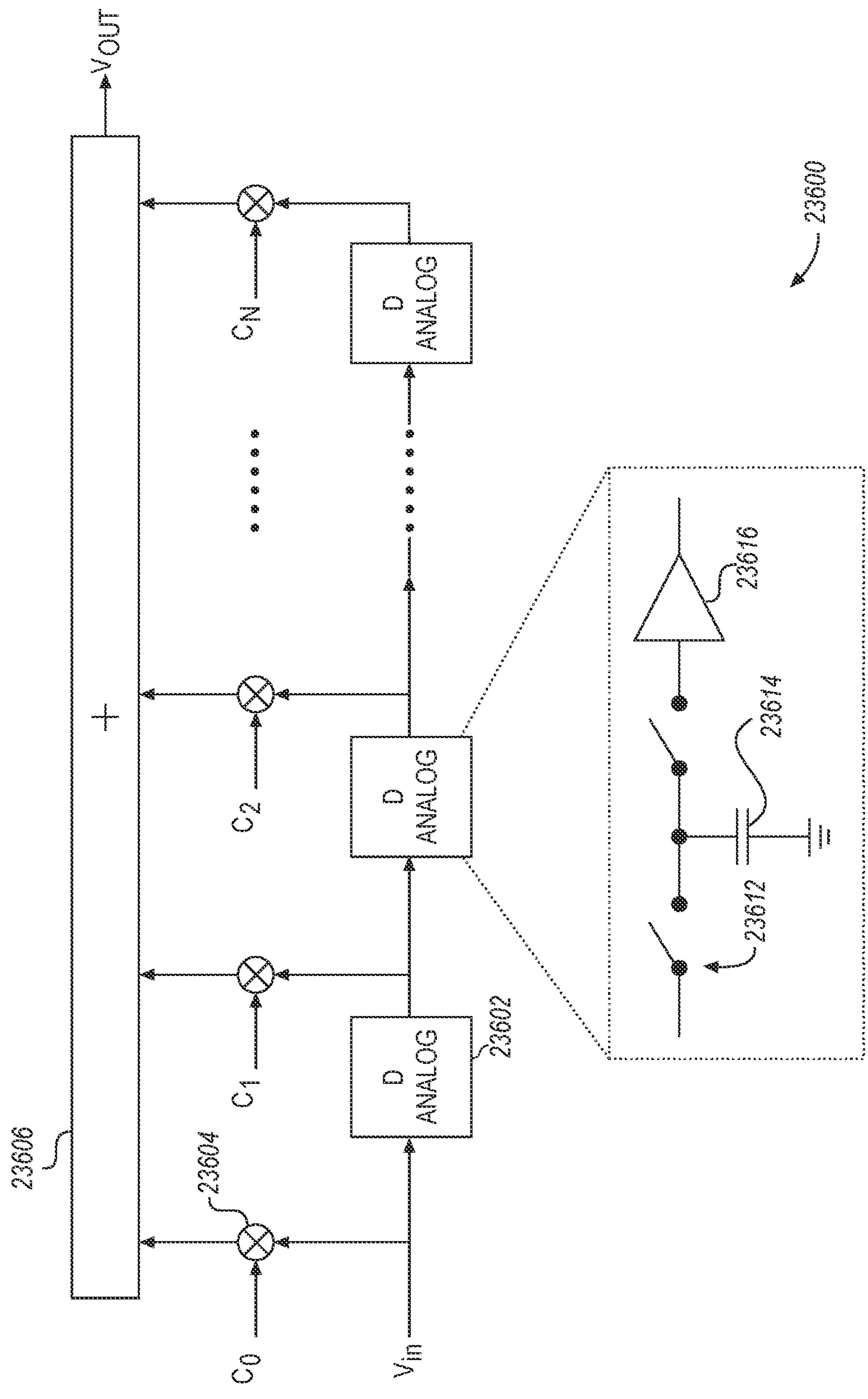

FIG. 236 illustrates a basic implementation of a feedforward equalizer (FFE) in accordance with some aspects.

Figure 237A:
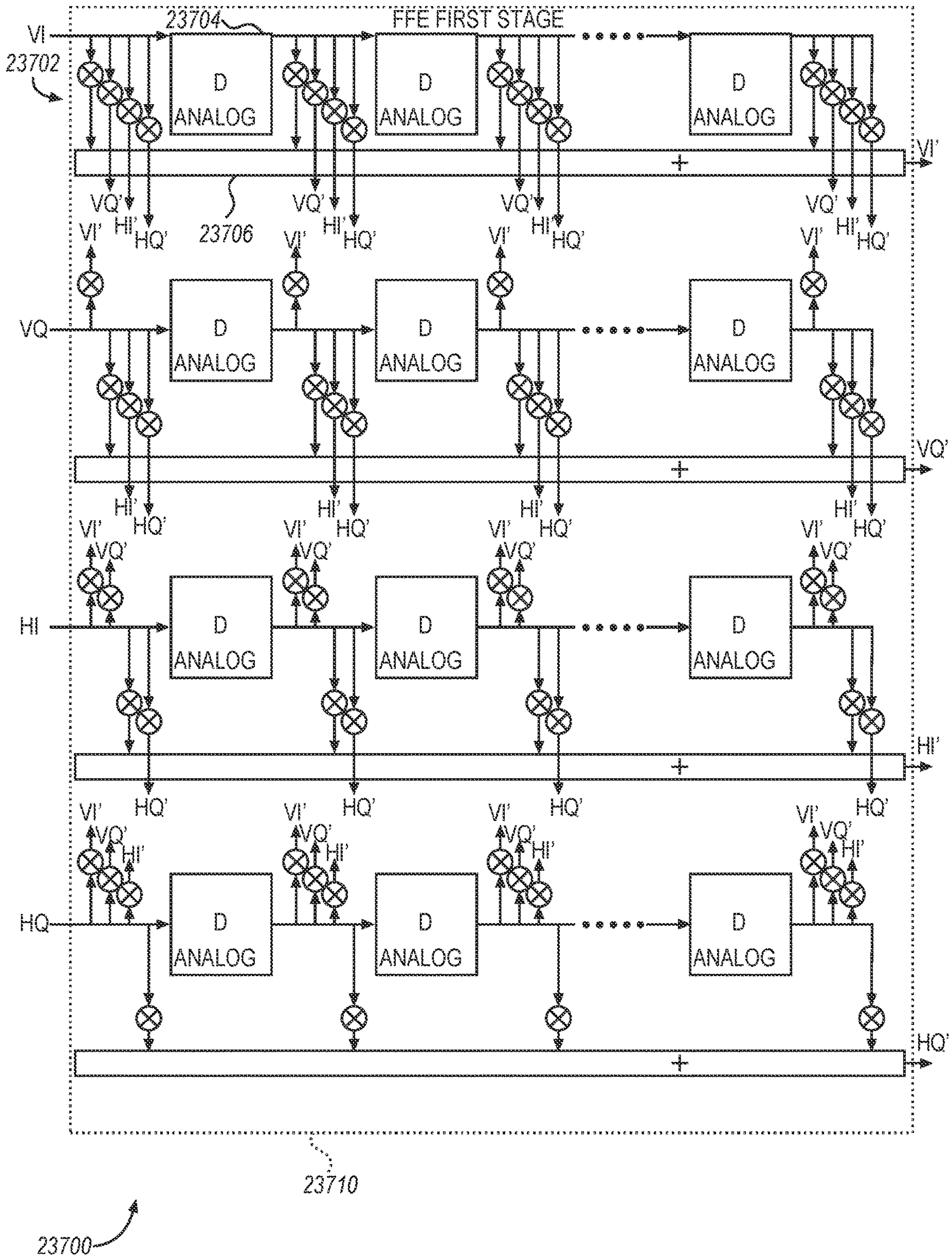
Figure 237B:
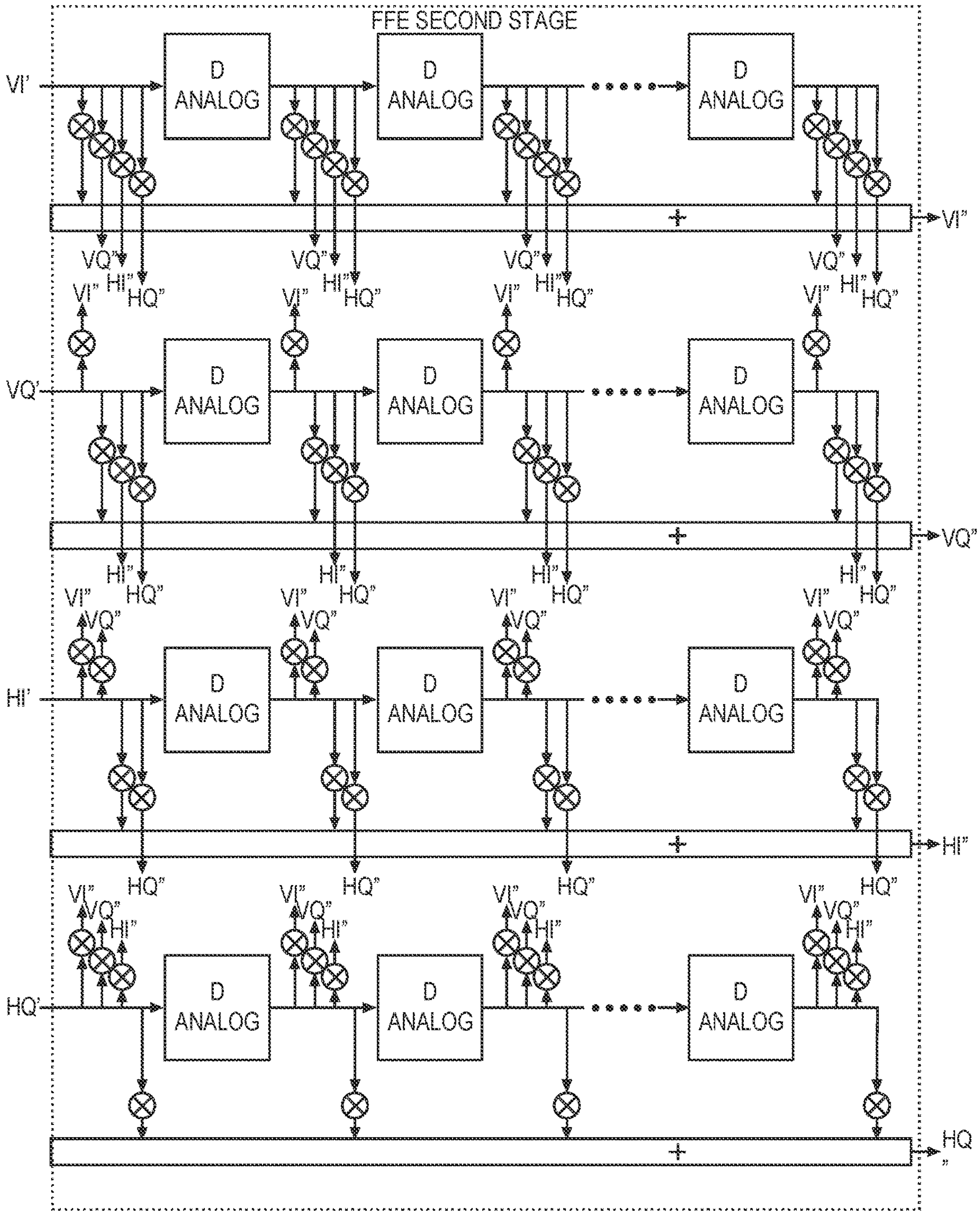

FIG. 237A and FIG. 237B illustrates a FFE in accordance with some aspects.

Figure 238:
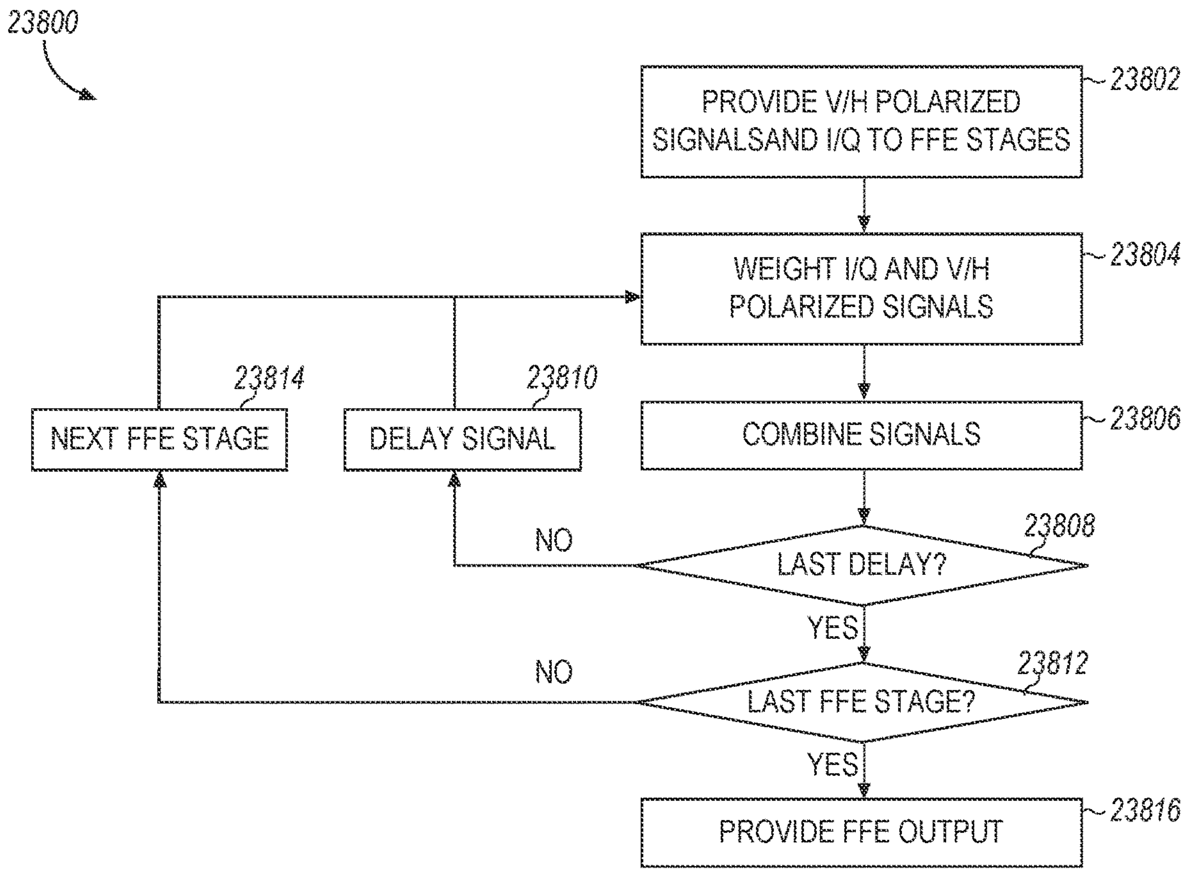

FIG. 238 illustrates a method of providing analog signal equalization according to some aspects.

Figure 239B:
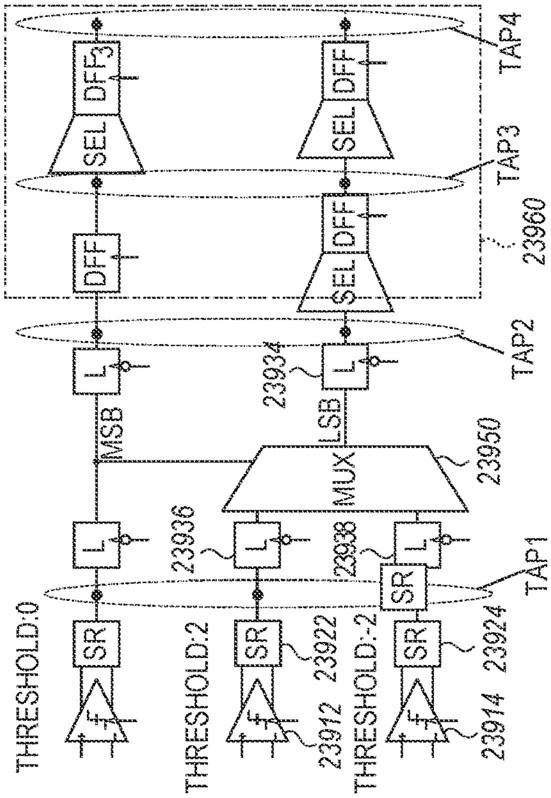
Figure 239A:
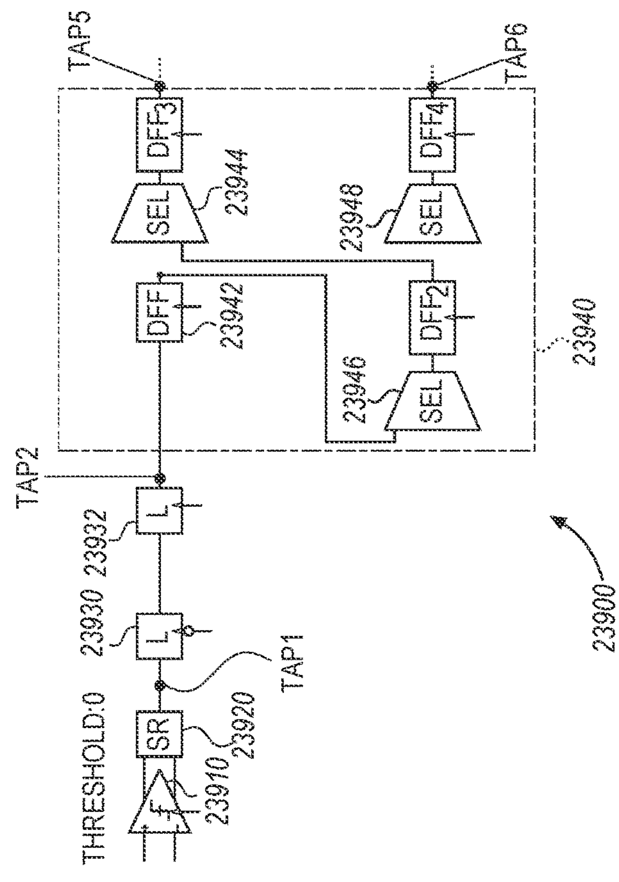

FIGS. 239A and 239B illustrate configurations of a reconfigurable decision feedback equalizer (DFE) in accordance with some aspects.

Figure 240B:
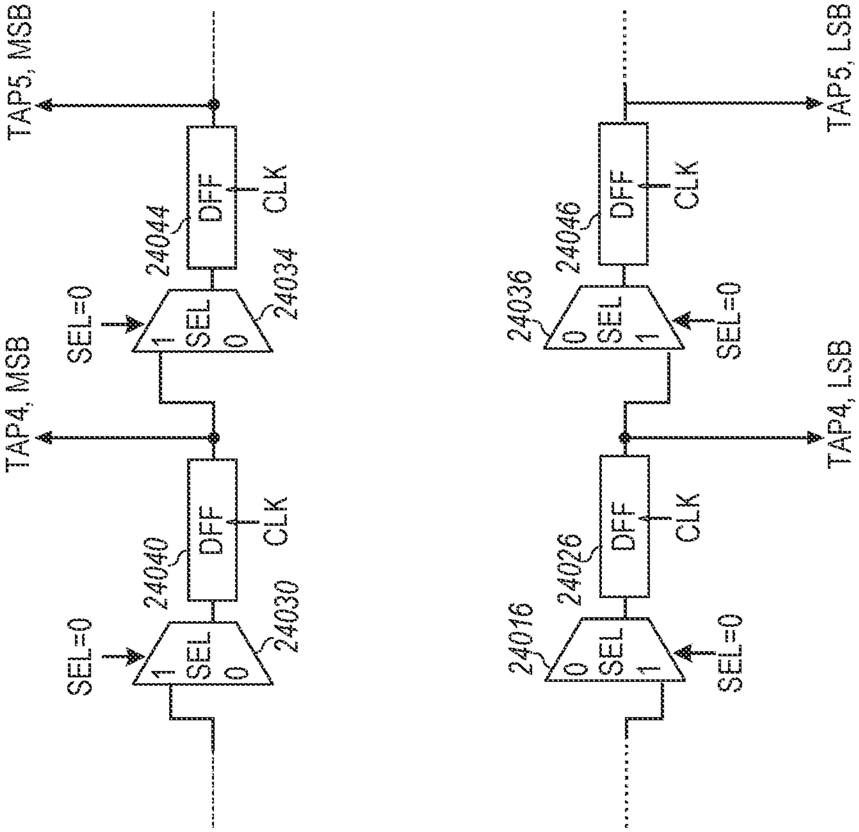
Figure 240A:
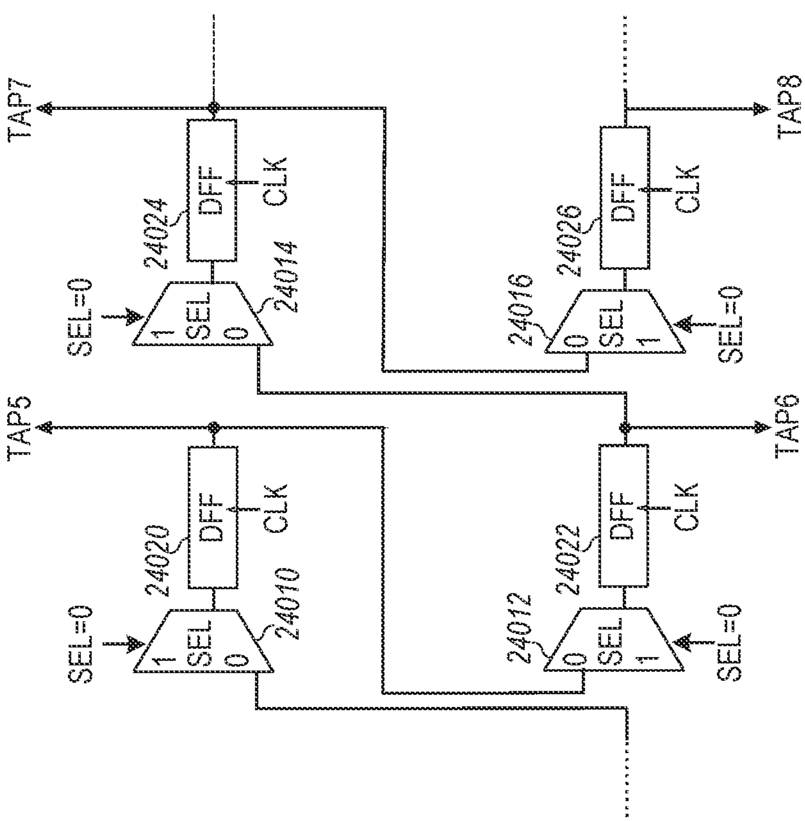

FIGS. 240A and 240B illustrate selector/D Flipflop (DFF) combination configurations of a reconfigurable DFE in accordance with some aspects.

Figure 241:
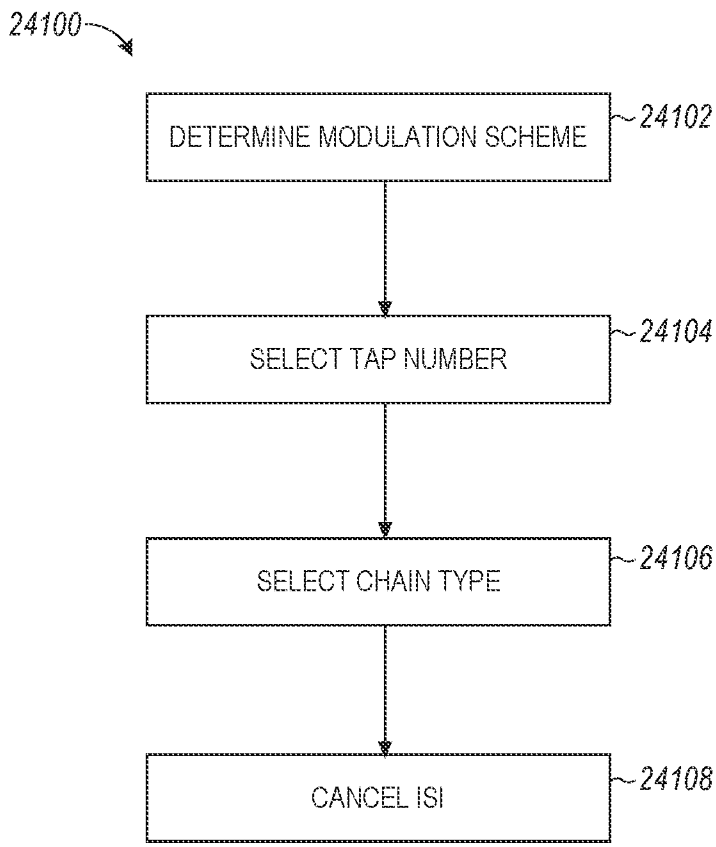

FIG. 241 is a method of configuring a DFE in accordance with some aspects.

Figure 242:
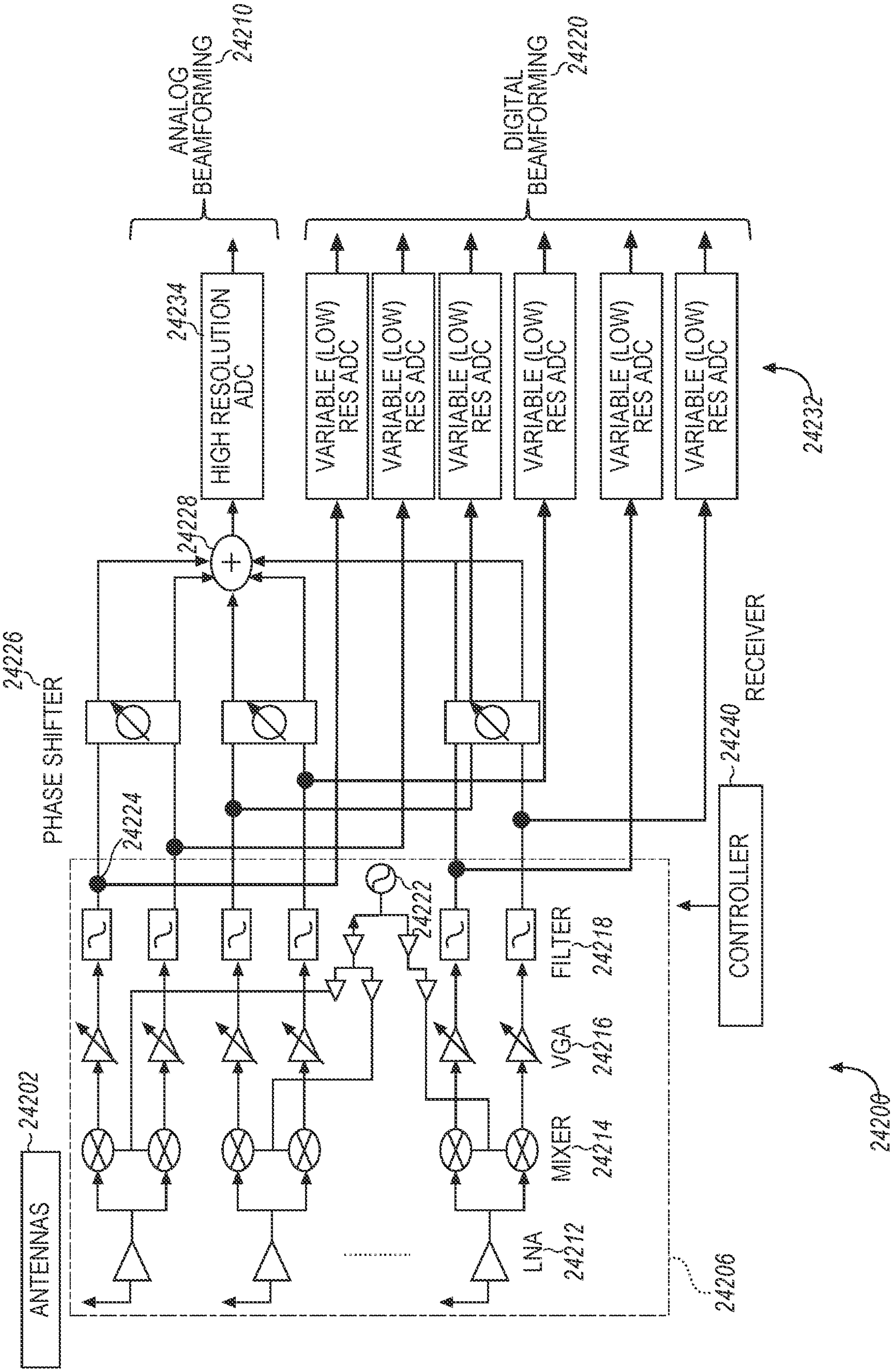

FIG. 242 illustrates a mmWave architecture in accordance with some aspects.

Figure 243:
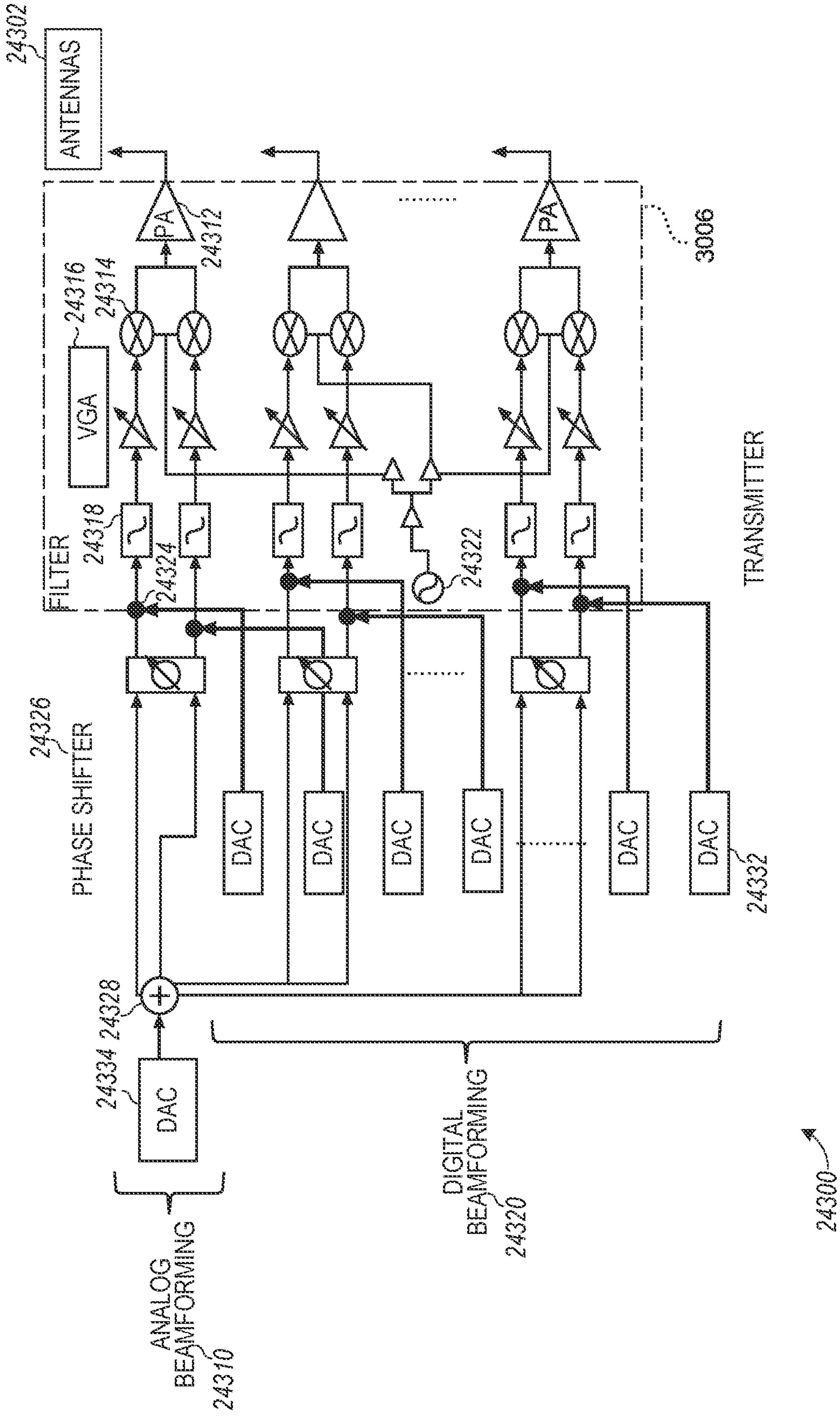

FIG. 243 illustrates a transmitter hybrid beamforming architecture in accordance with some aspects.

Figure 244:
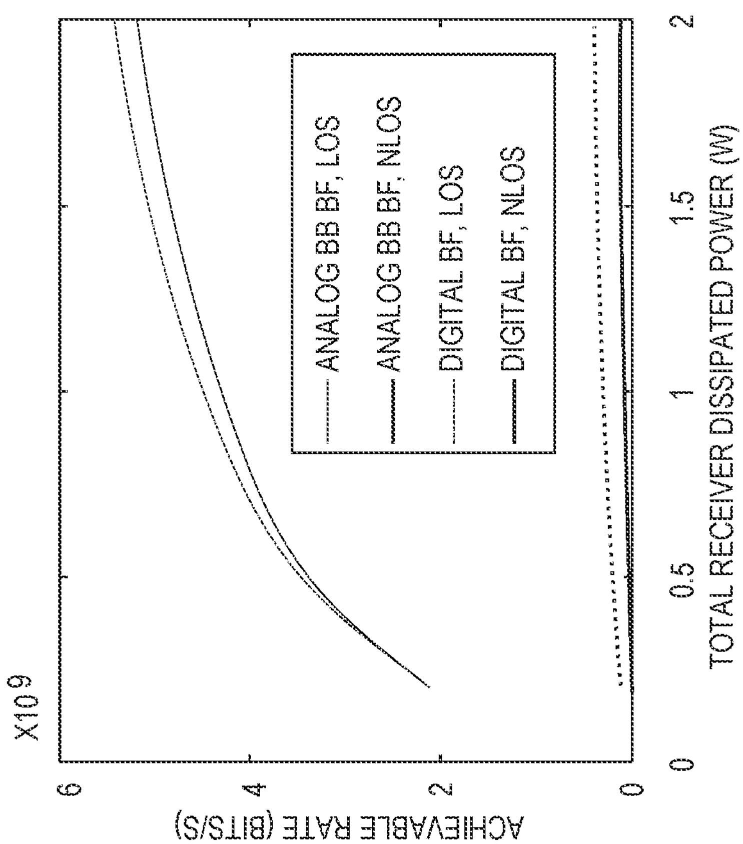

FIG. 244 illustrates a simulation of communication rate in accordance with some aspects.

Figure 245:
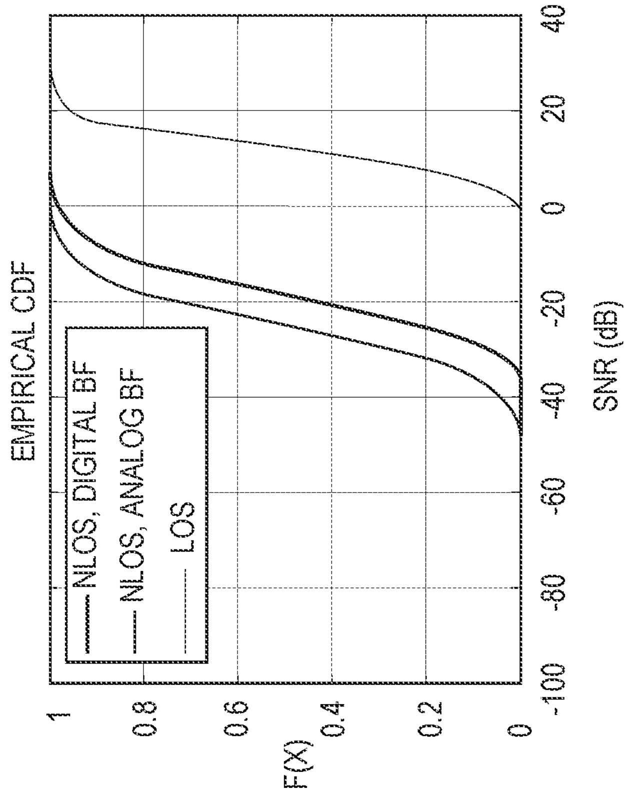

FIG. 245 illustrates a simulation of a signal-to-noise ratio (SNR) in accordance with some aspects.

Figure 246:
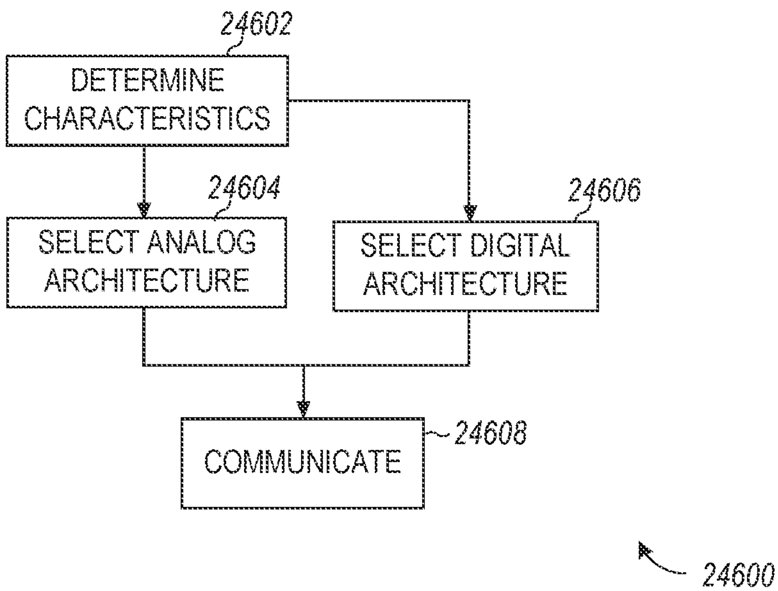

FIG. 246 illustrates a method of communicating beamformed mmWave signals in accordance with some aspects.

Figure 247A:
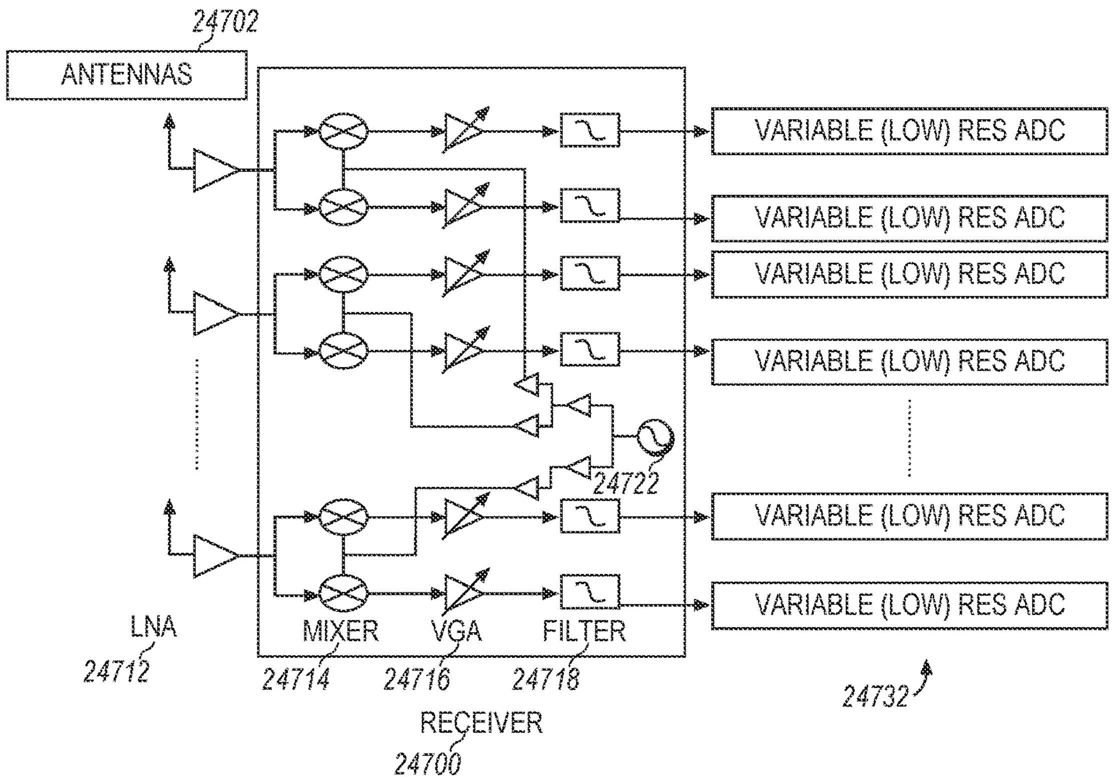
Figure 247B:
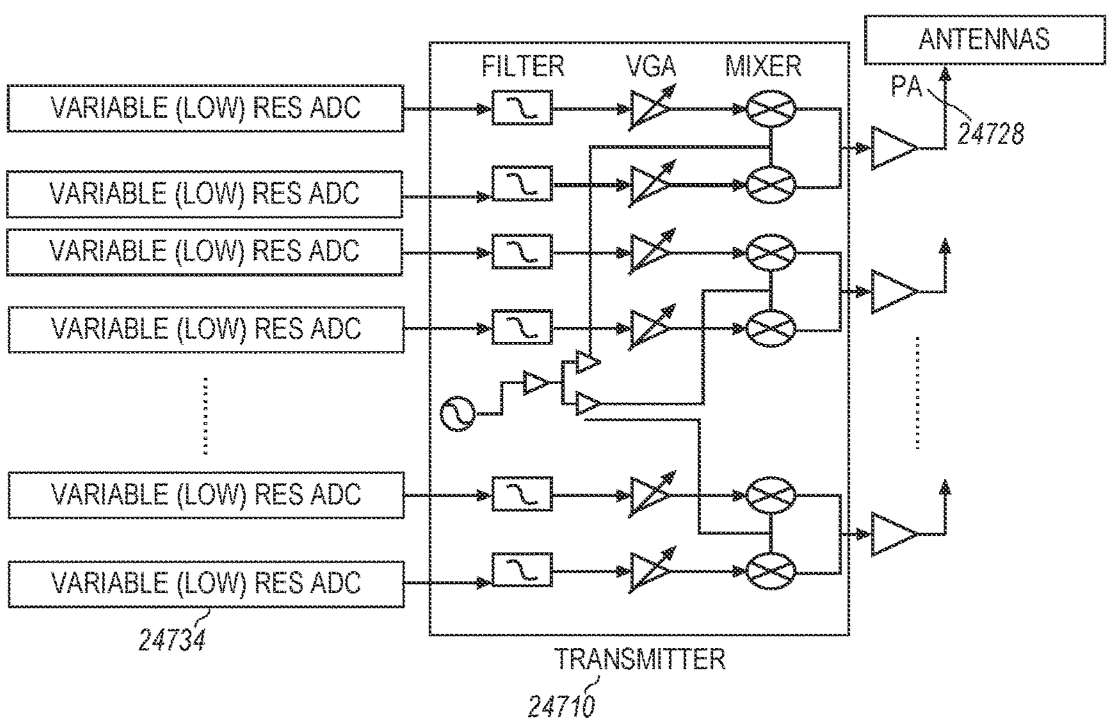

FIGS. 247A and 247B illustrate a transceiver structure in accordance with some aspects.

Figure 248A:
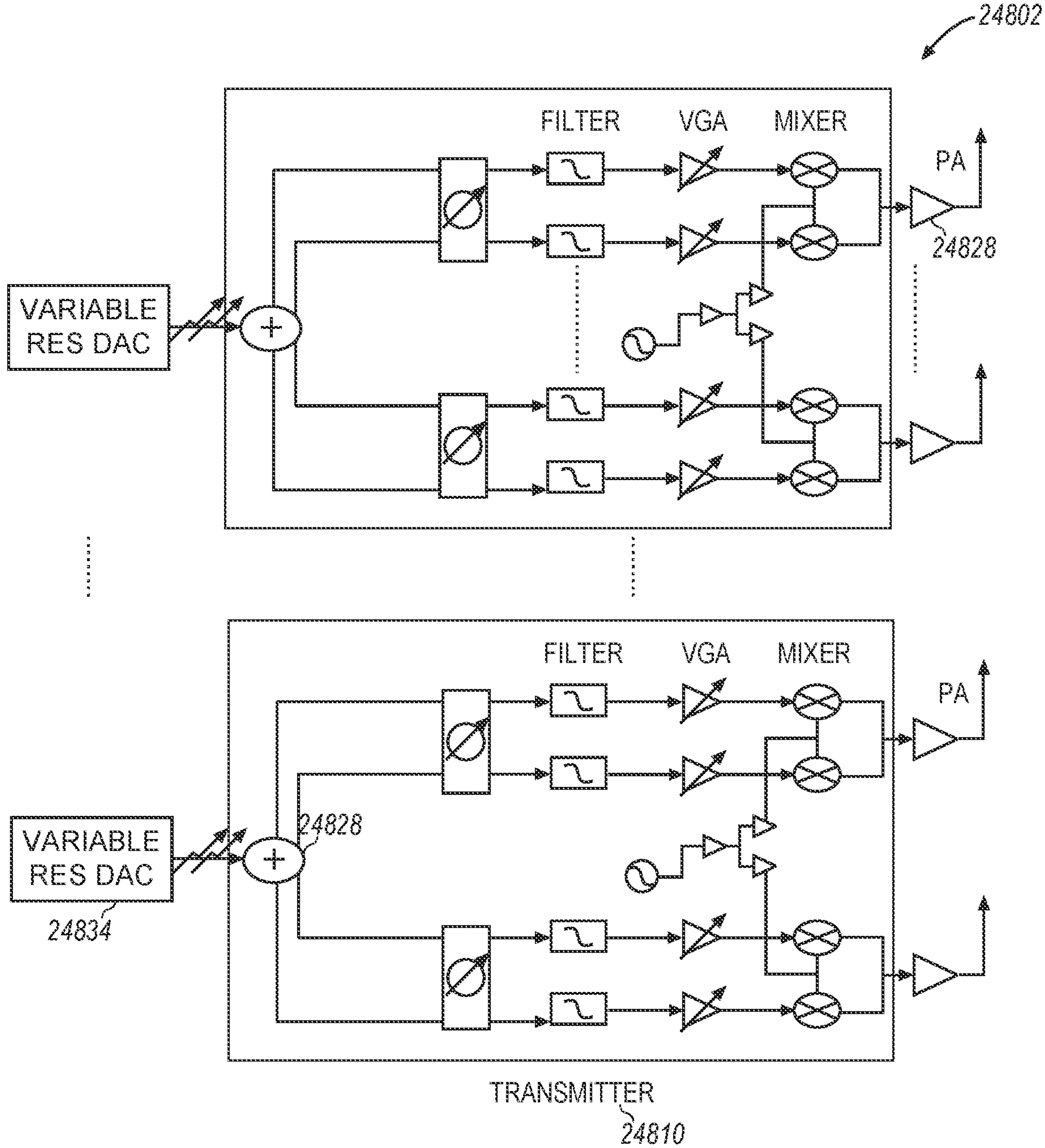
Figure 248B:
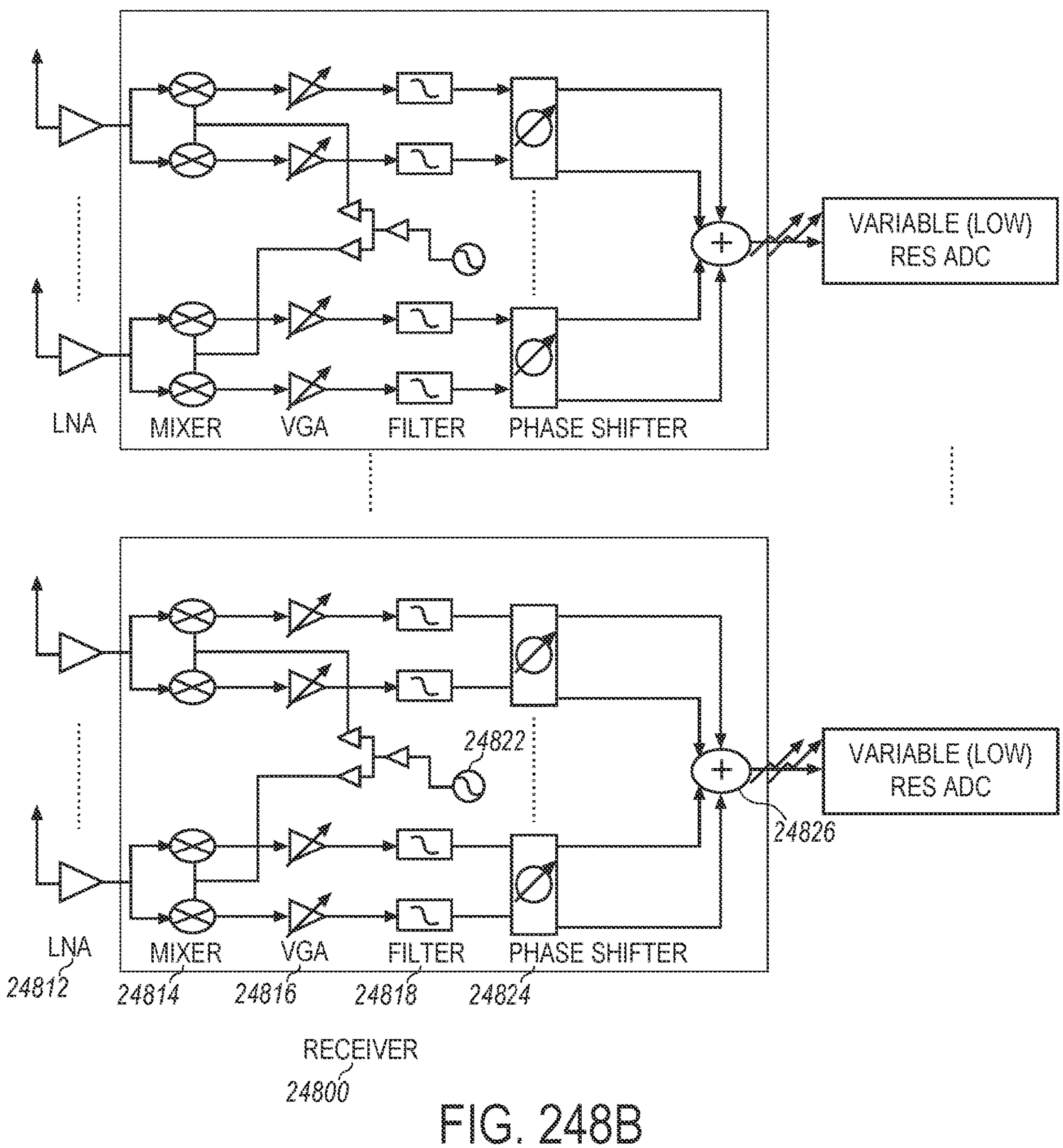

FIGS. 248A and 248B illustrate a transceiver structure in accordance with some aspects.

Figure 249:
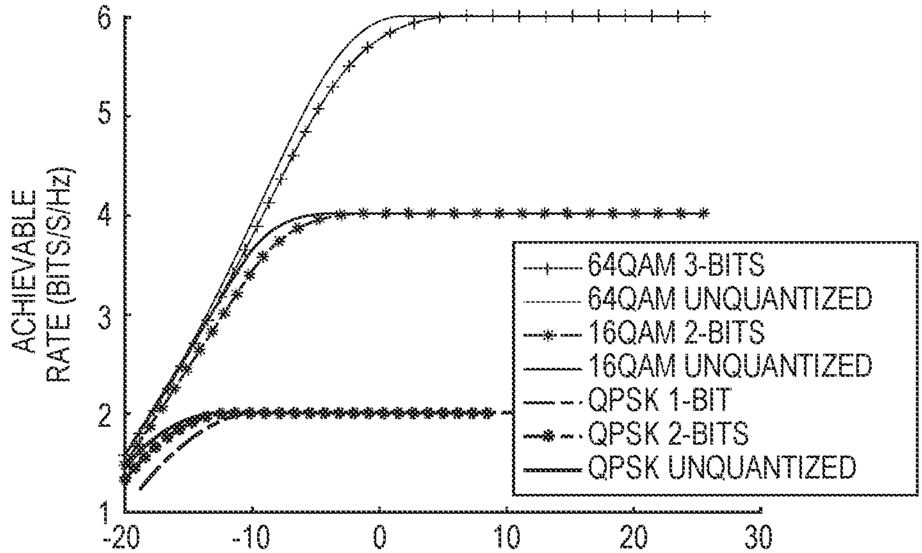

FIG. 249 illustrates an adaptive resolution analog-to-digital converter (ADC) power consumption in accordance with some aspects.

Figure 250:
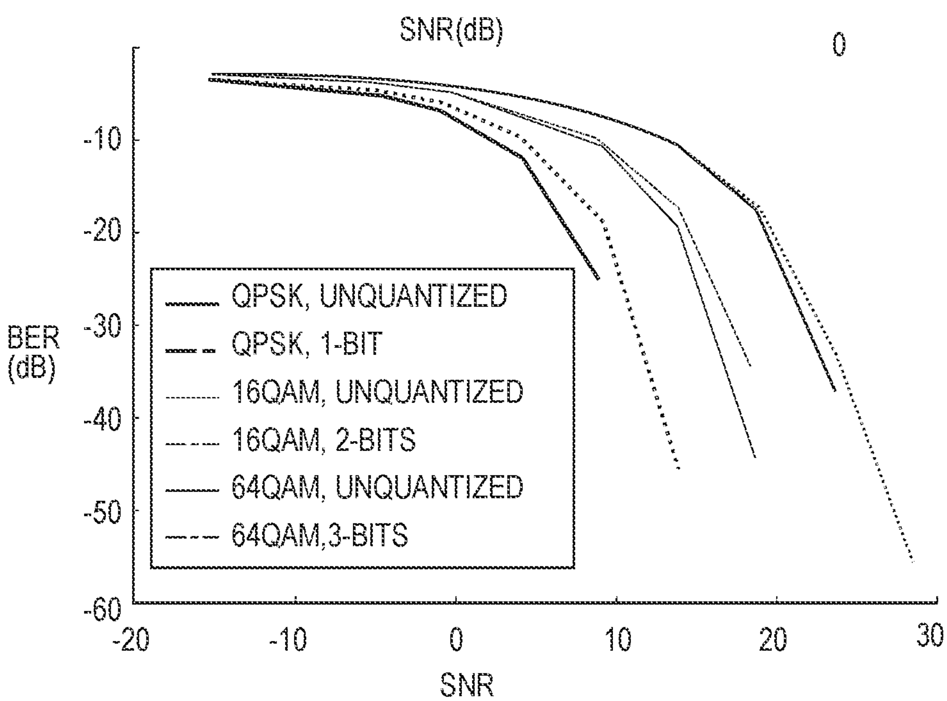

FIG. 250 illustrates bit error rate (BER) performance in accordance with some aspects.

Figure 251:
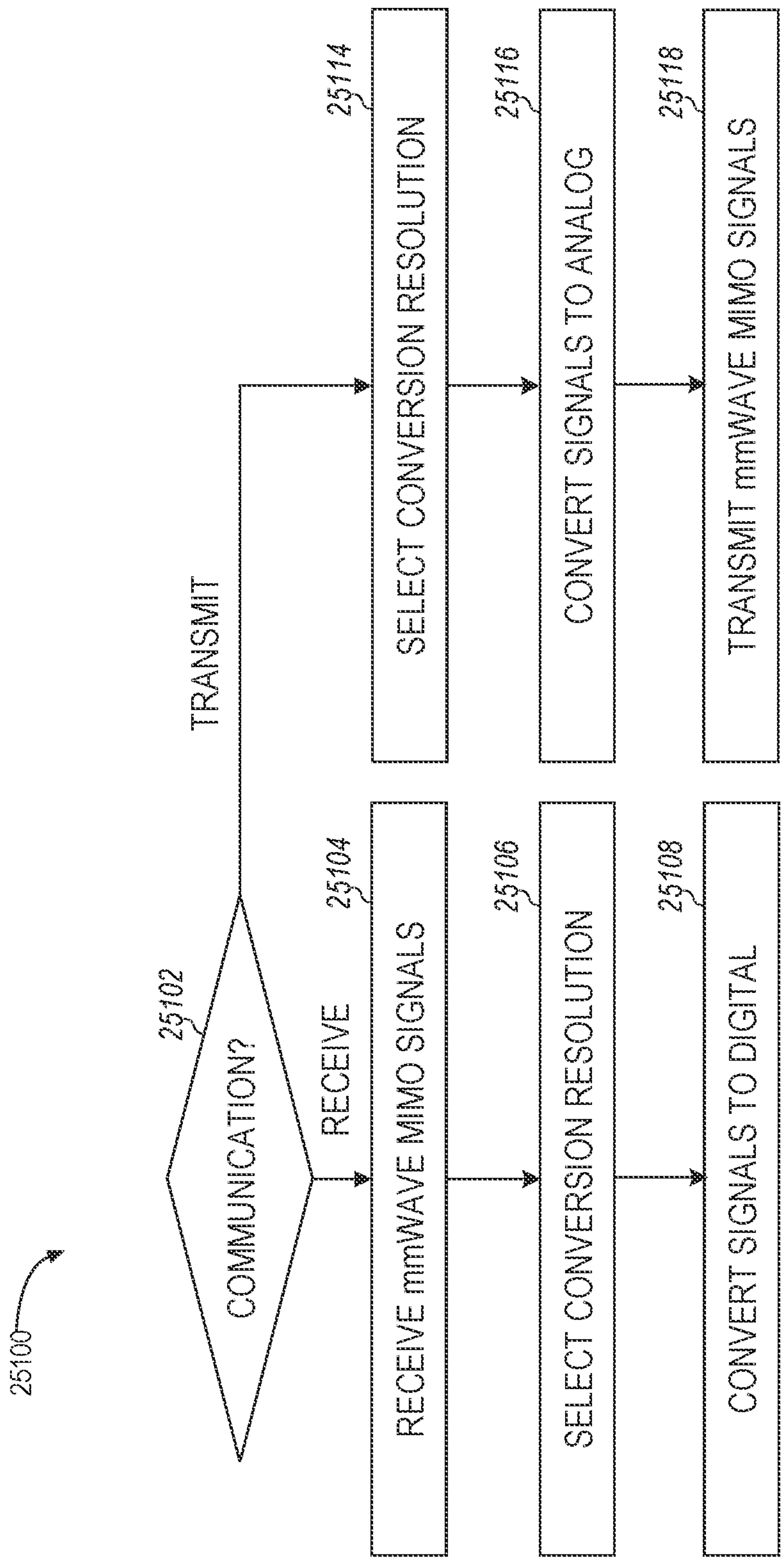

FIG. 251 illustrates a method of communicating beamformed mmWave signals in accordance with some aspects.

Figure 252A:
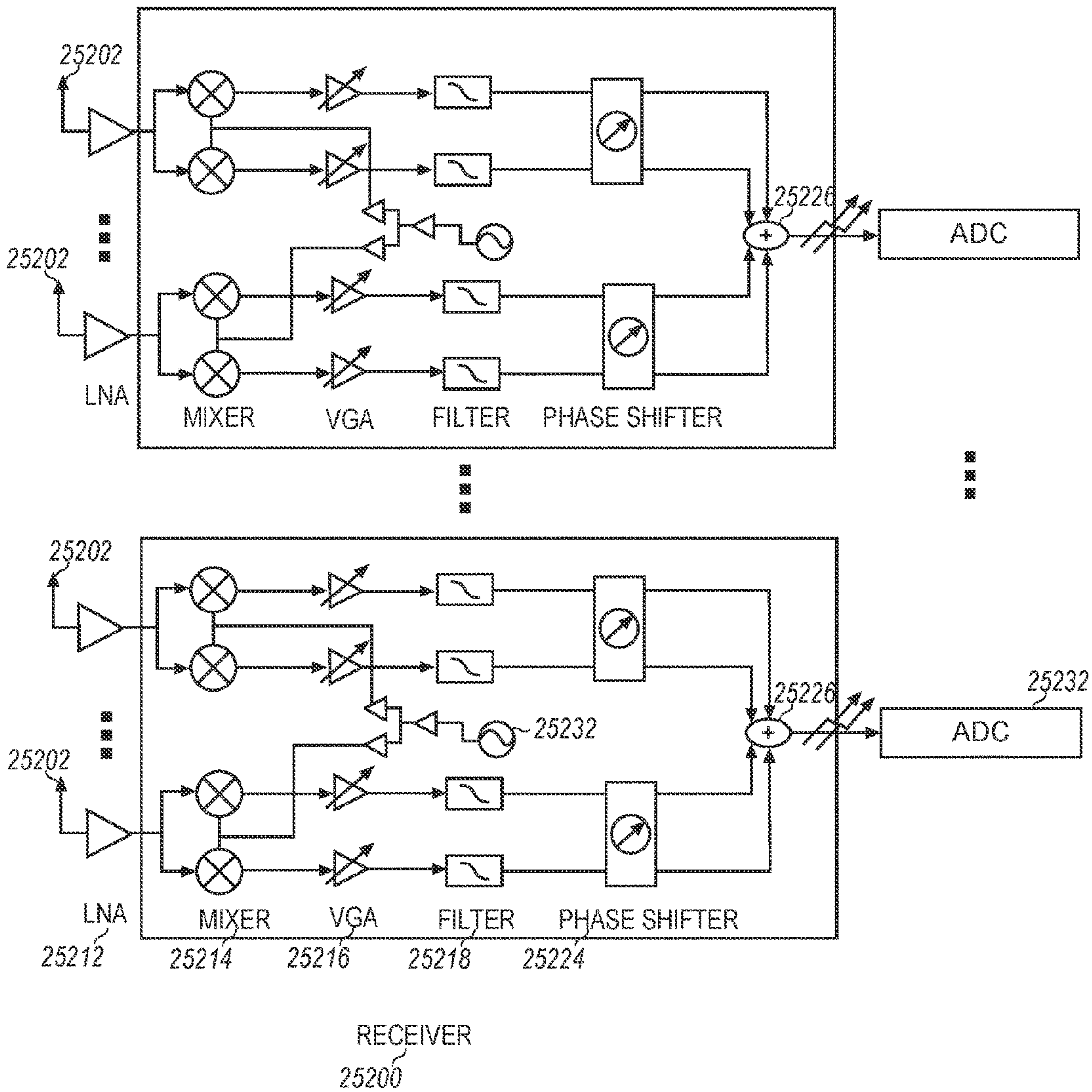
Figure 252B:
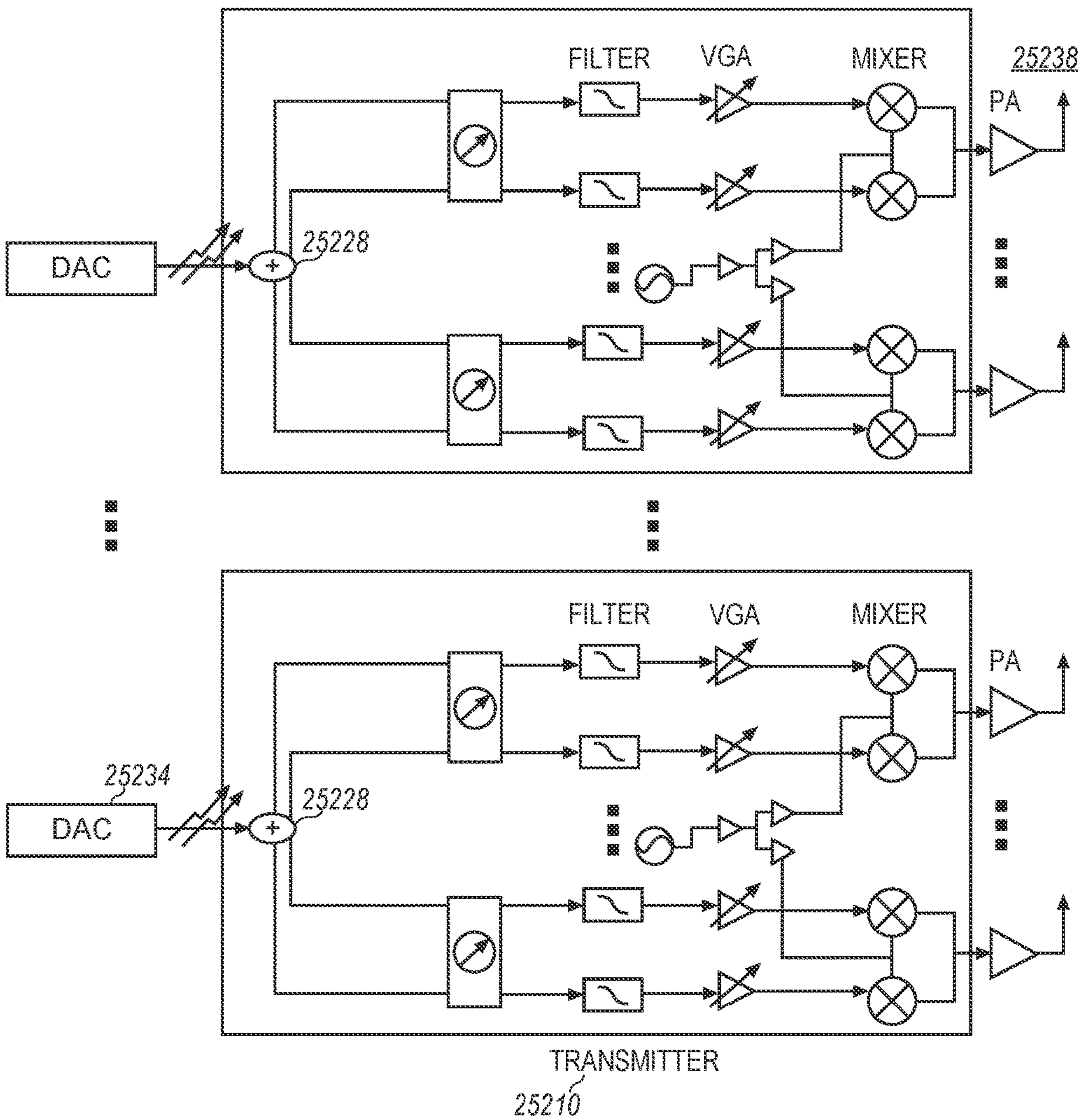

FIGS. 252A and 252B illustrate a transceiver structure in accordance with some aspects.

Figure 253:
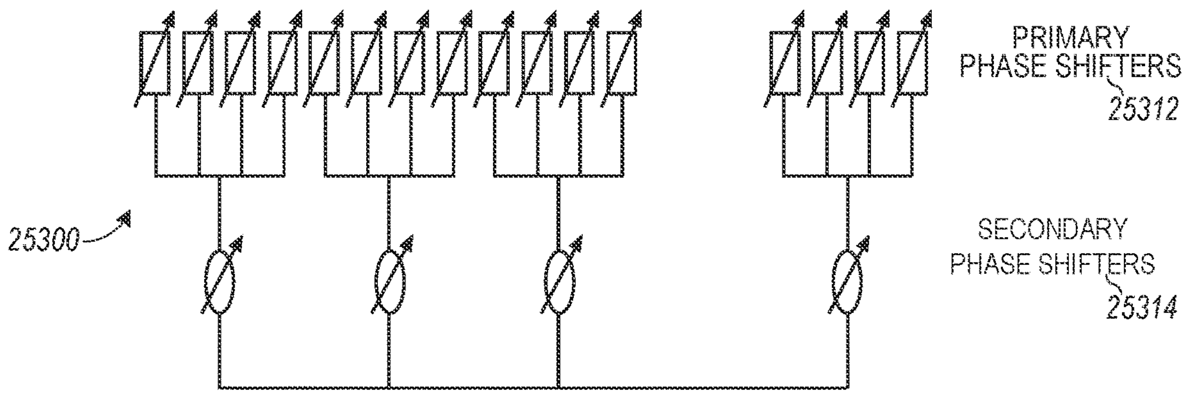

FIG. 253 illustrates an array structure in accordance with some aspects.

Figure 254:
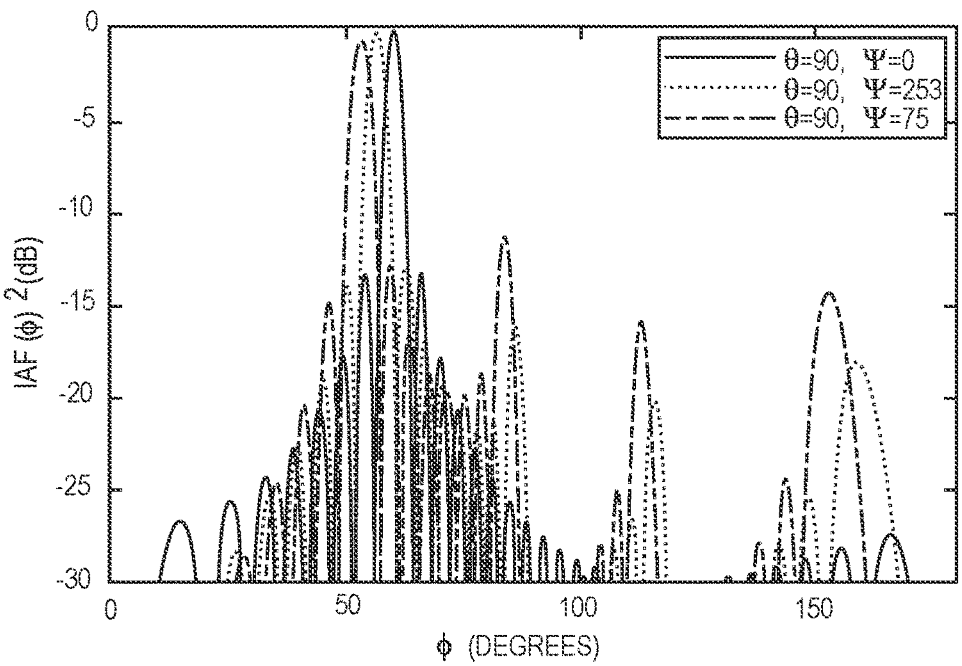

FIG. 254 illustrates a simulation of grating lobes in accordance with some aspects.

Figure 255:
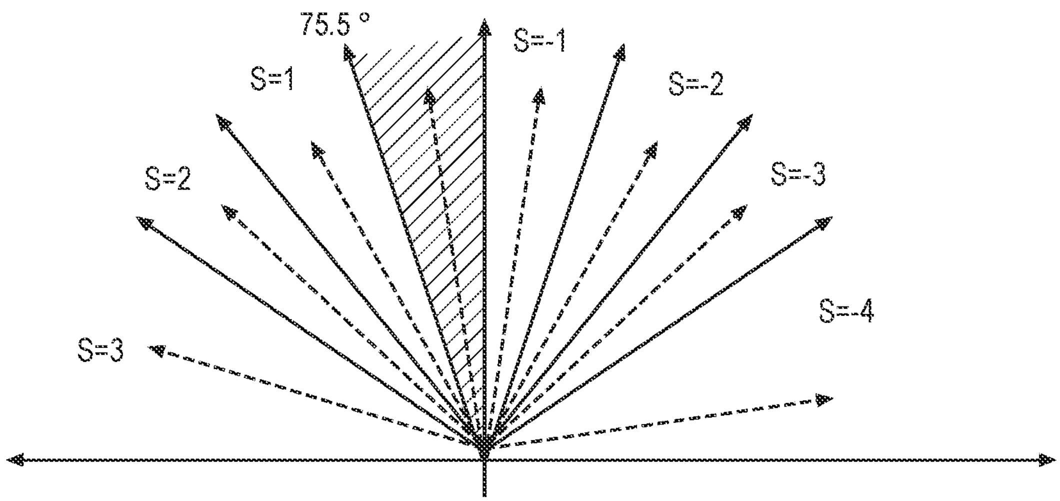

FIG. 255 illustrates a simulation of optimal phase values in accordance with some aspects.

Figure 256:
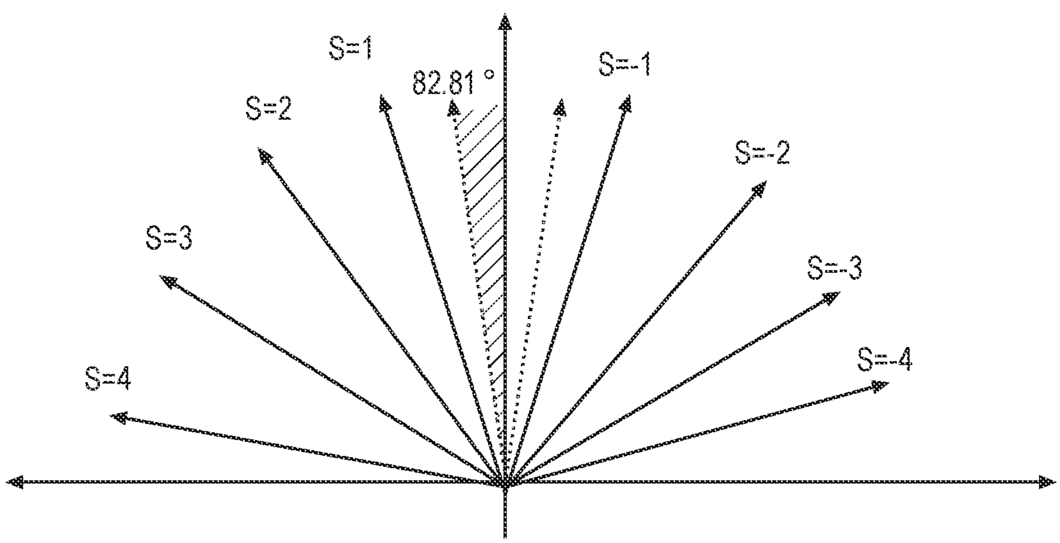

FIG. 256 illustrates another simulation of optimal phase values in accordance with some aspects.

Figure 257:
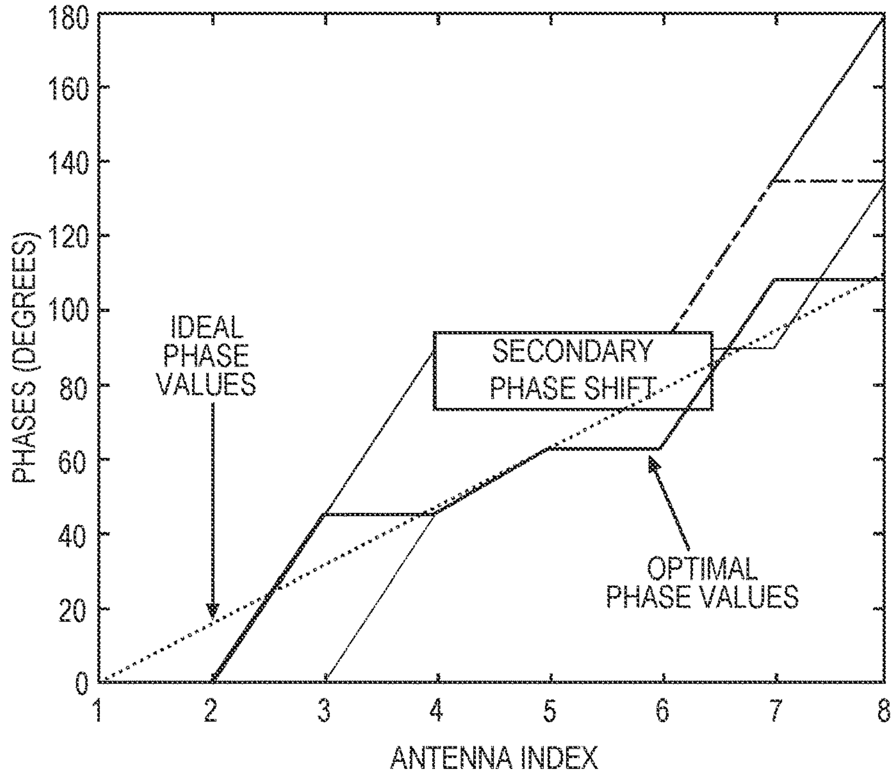

FIG. 257 illustrates a process for a phase shifter in accordance with some aspects.

Figure 258:
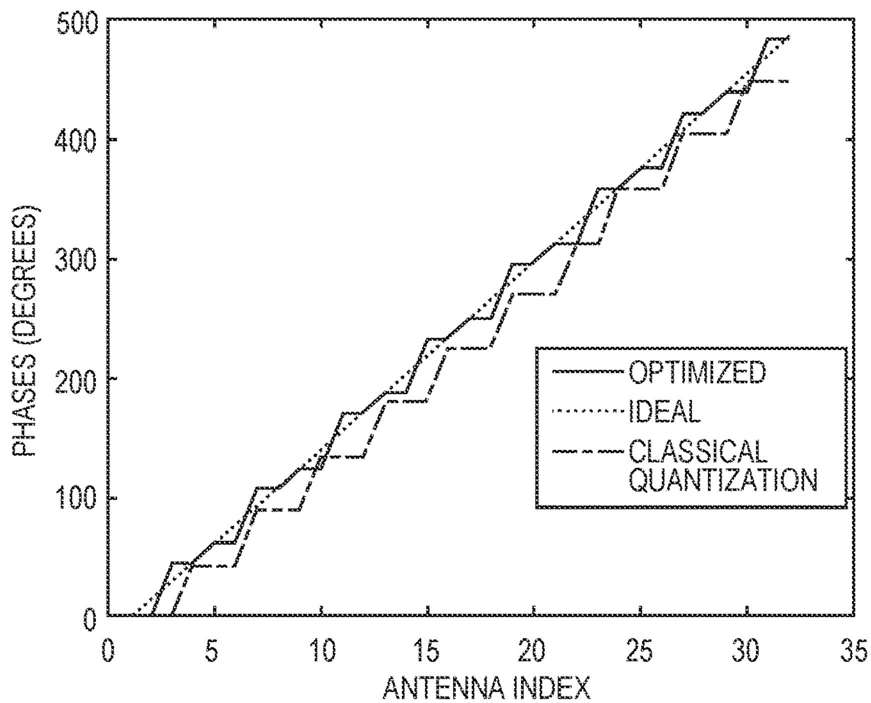

FIG. 258 illustrates a phase value determination in accordance with some aspects.

Figure 259:
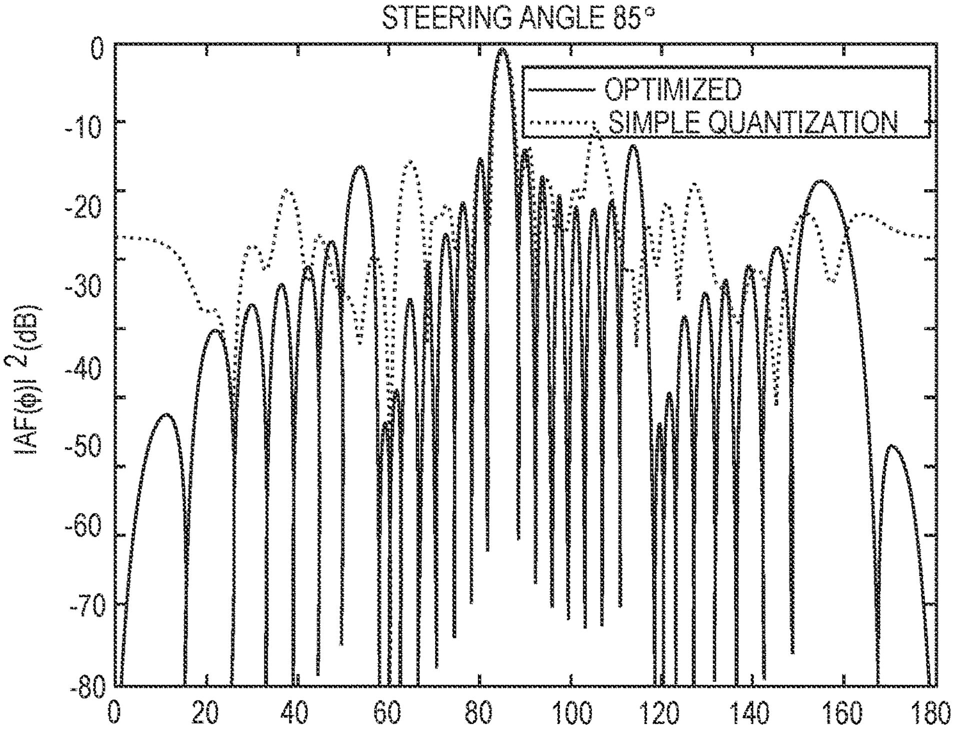

FIG. 259 illustrates a performance comparison in accordance with some aspects.

Figure 260:
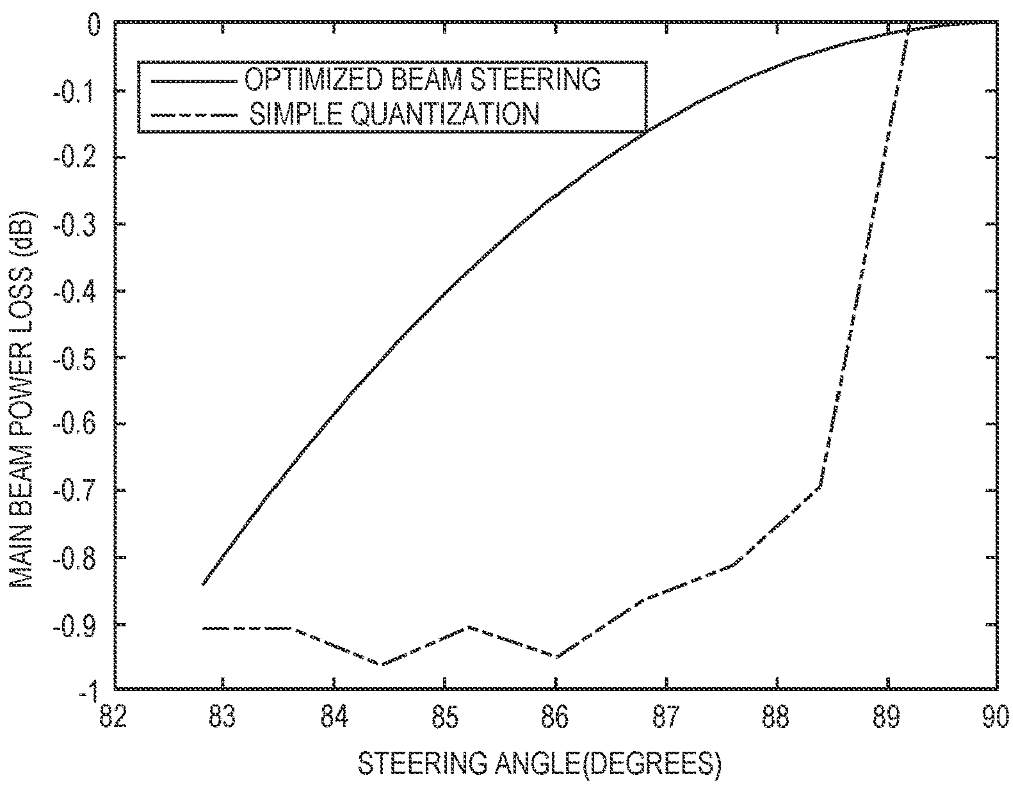

FIG. 260 illustrates another performance comparison in accordance with some aspects.

Figure 261:
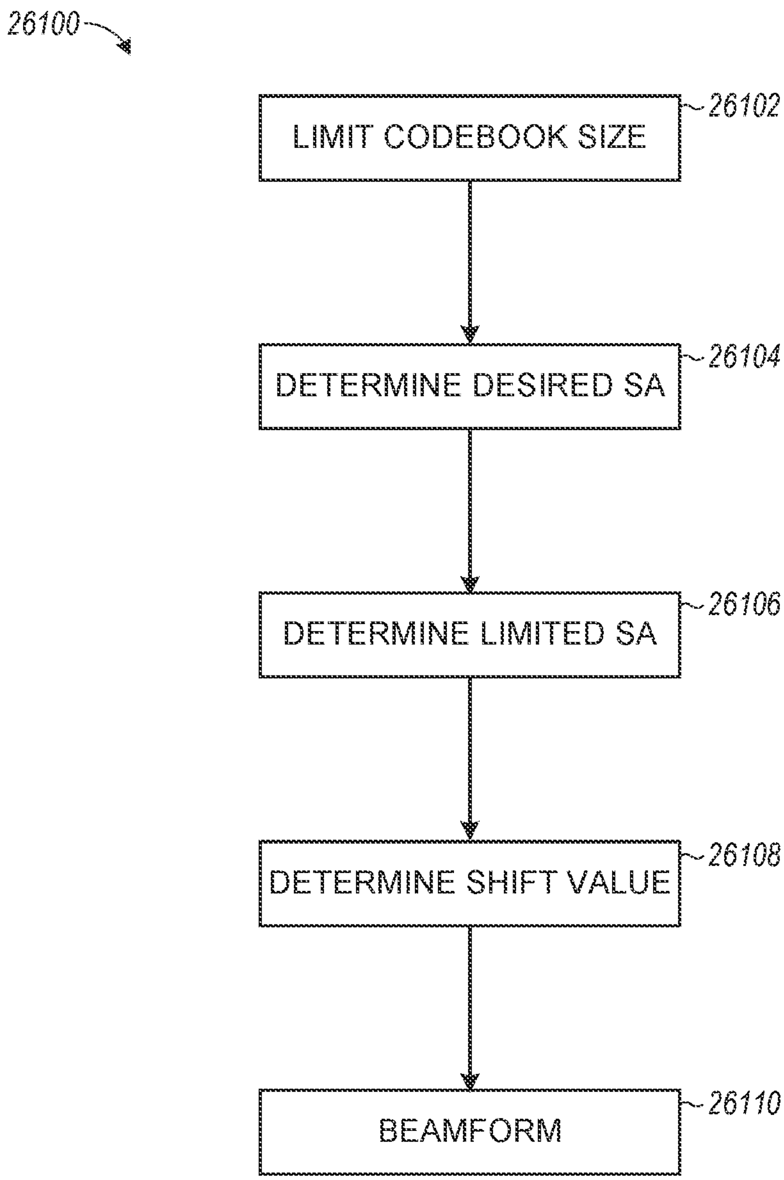

FIG. 261 illustrates a method of providing beam steering in a communication device in accordance with some aspects.

Figure 262B:
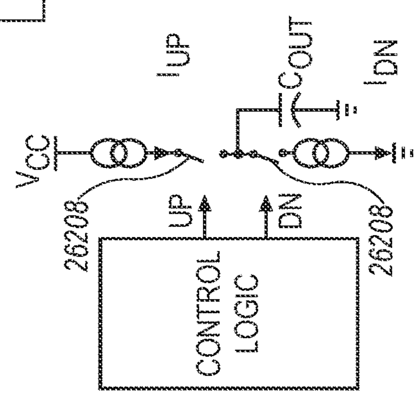
Figure 262A:
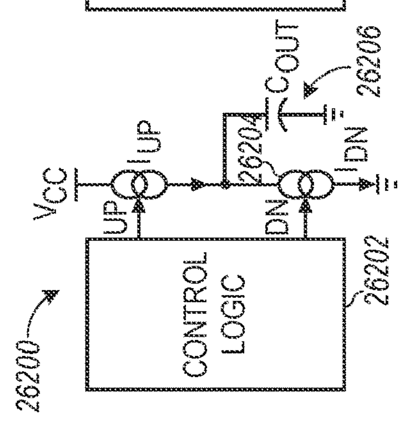

FIGS. 262A and 262B illustrate an aspect of a charge pump in accordance with some aspects.

Figure 263:
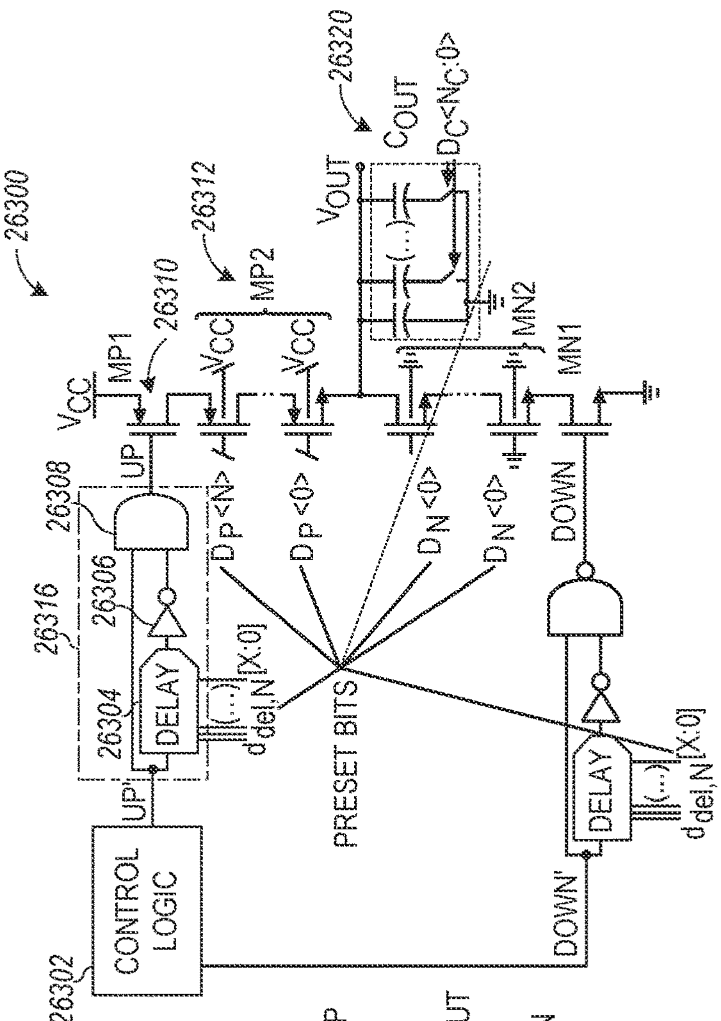

FIG. 263 illustrates an aspect of a charge pump in accordance with some aspects.

Figure 264B:
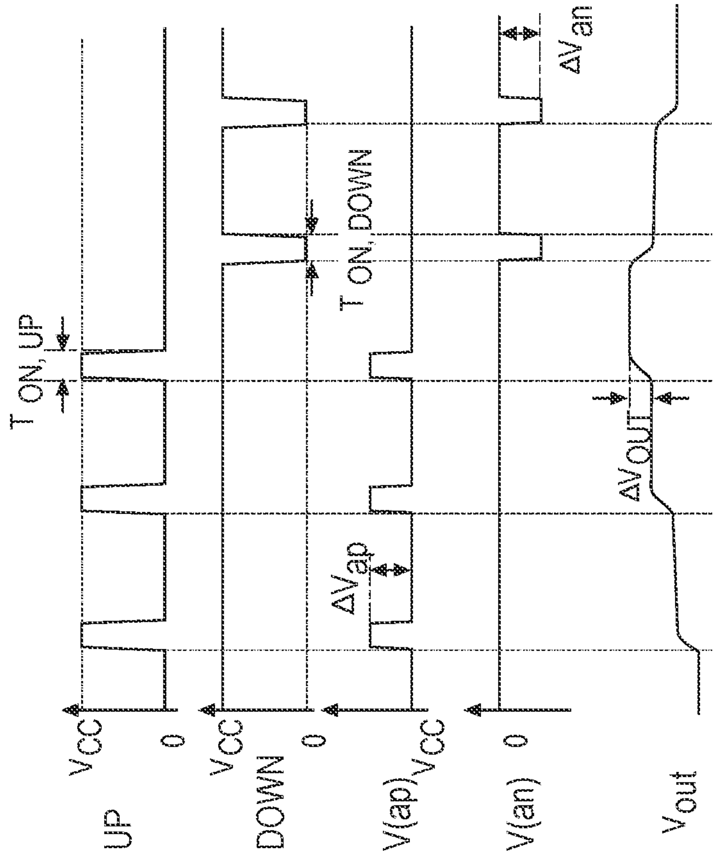
Figure 264A:
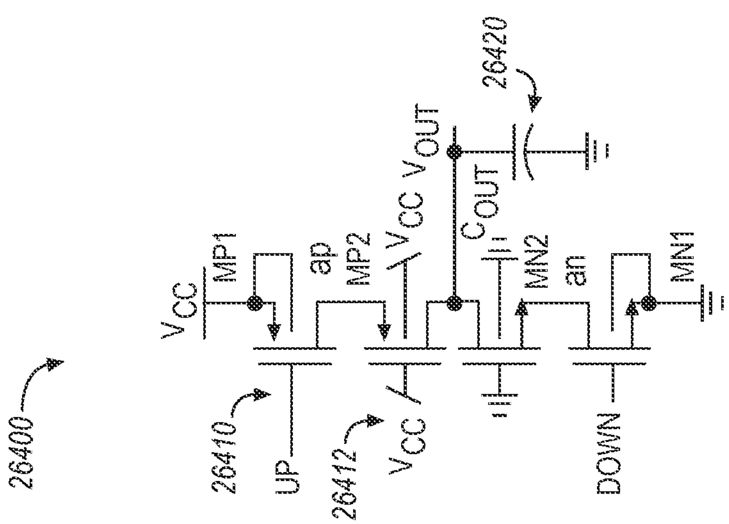

FIG. 264A illustrates a simplified scheme of an output portion of the charge pump in accordance with some aspects. FIG. 264B illustrates a timing diagram of signals of the charge pump in accordance with some aspects.

Figure 265A:
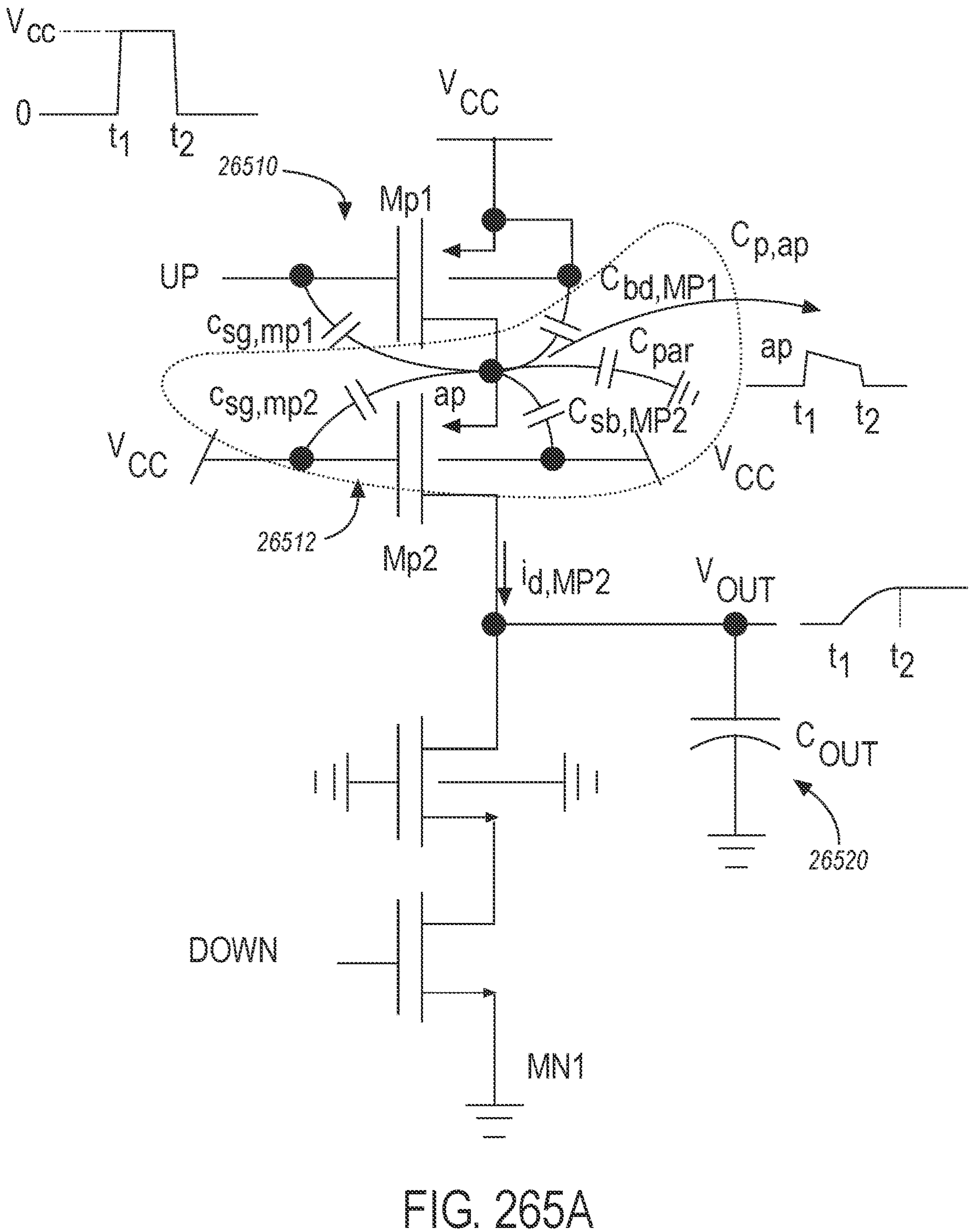
Figure 265B:
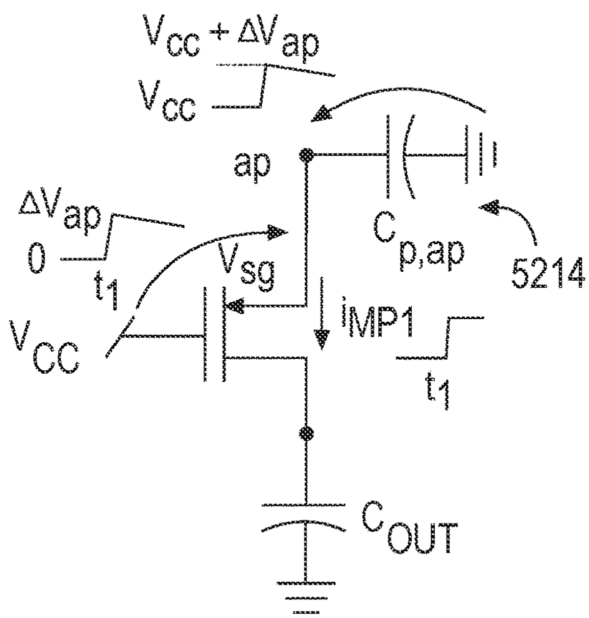
Figure 265C:
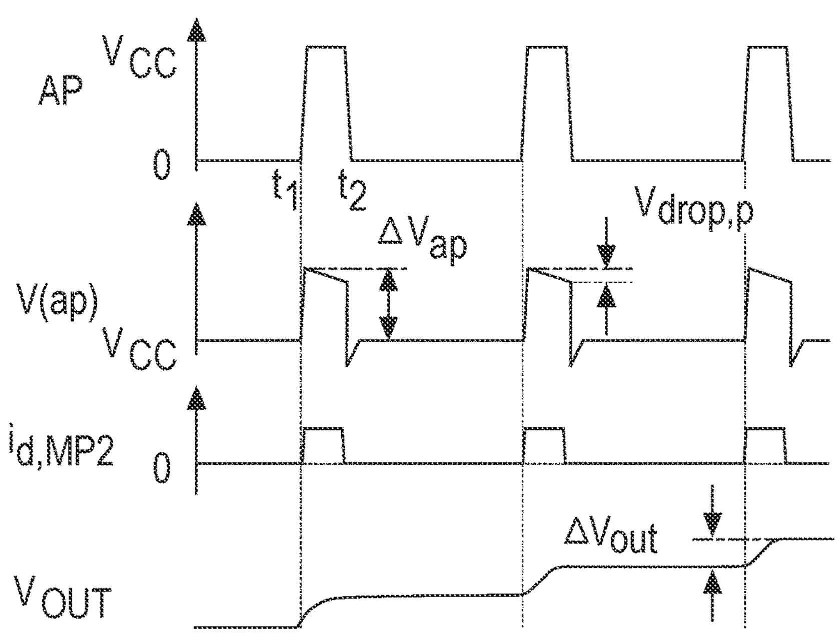

FIGS. 265A to 265C illustrate the operation of the charge pump according to some aspects.

Figure 266A:
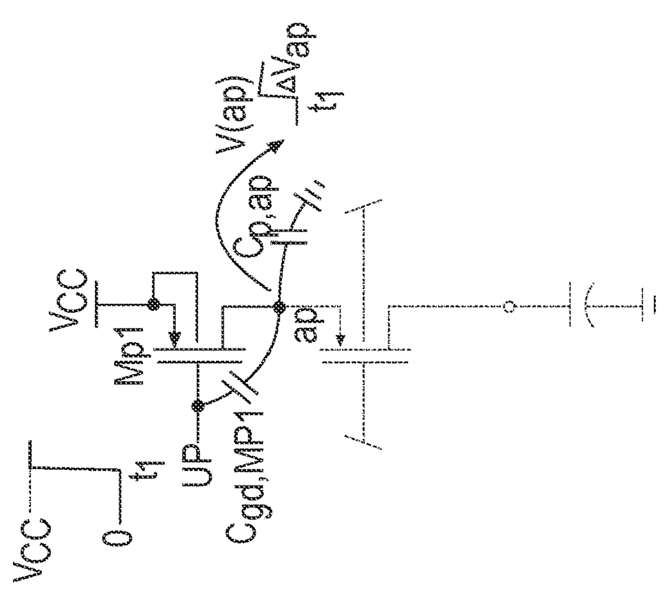
Figure 266B:
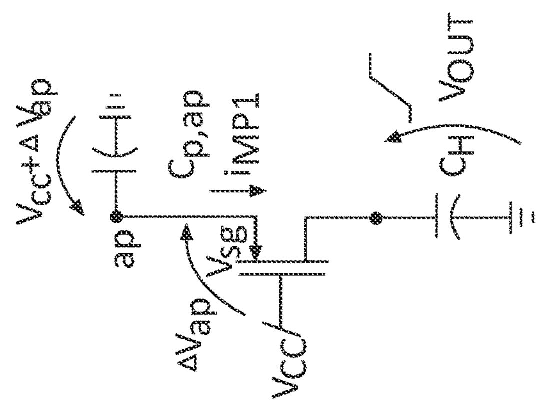
Figure 266C:
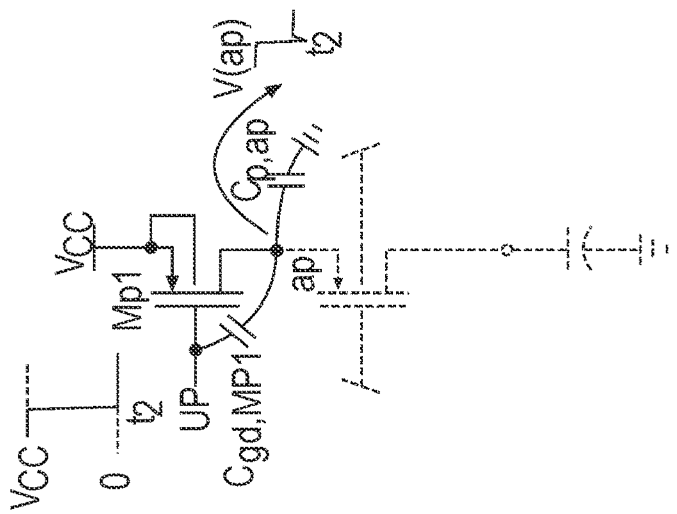

FIGS. 266A to 266C illustrate summarization of operation of the charge pump according to some aspects.

Figure 267:
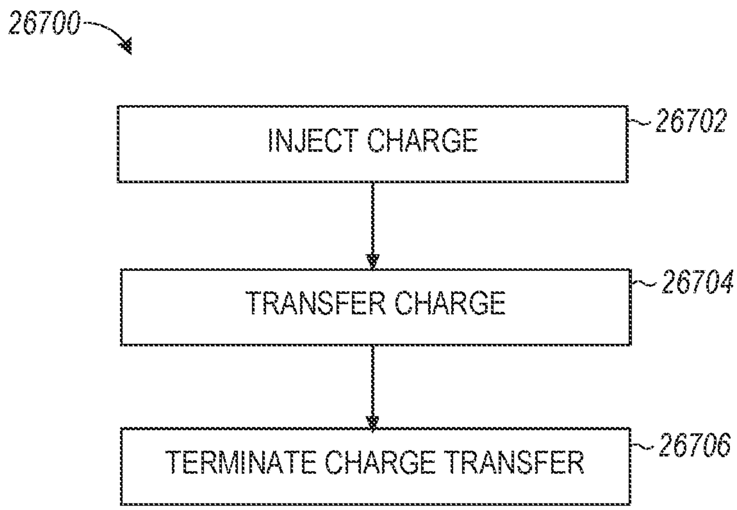

FIG. 267 illustrates a method of injecting charge in a charge pump in accordance with some aspects.

Figure 268:
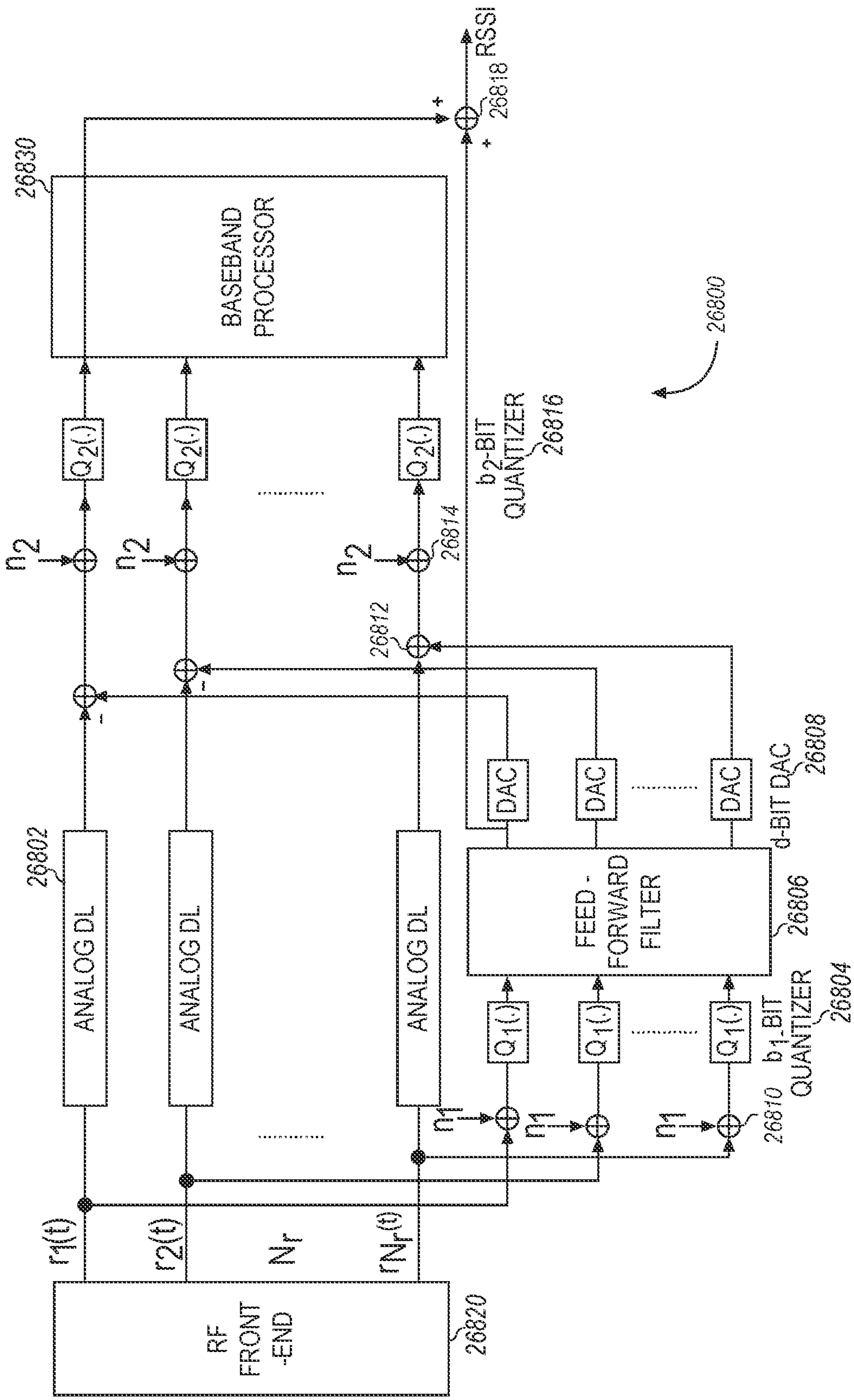

FIG. 268 illustrates a receiver architecture in accordance with some aspects.

Figure 269:
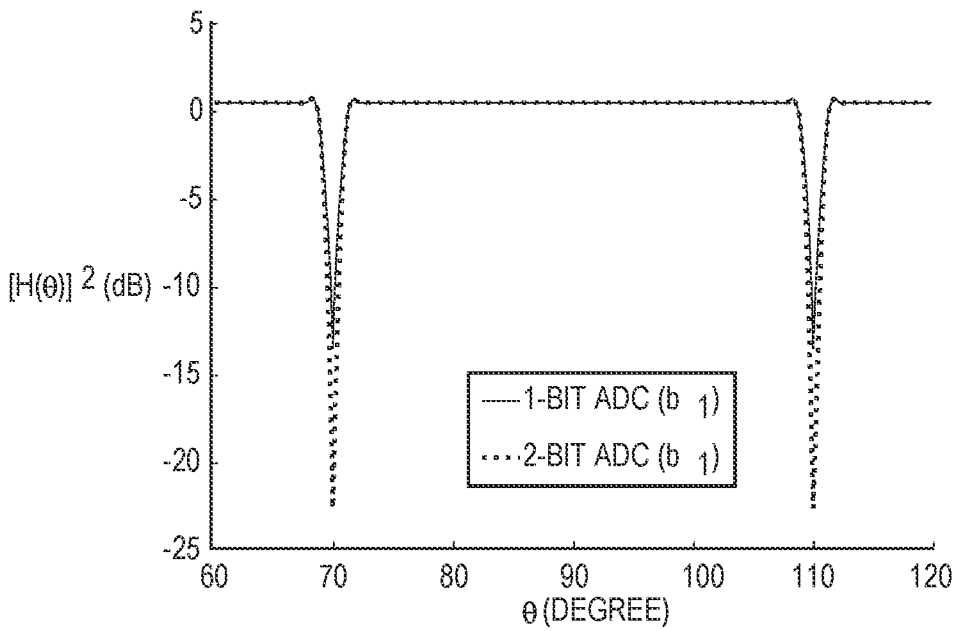

FIG. 269 illustrates the filter characteristic of a receiver according to some aspects.

Figure 270:
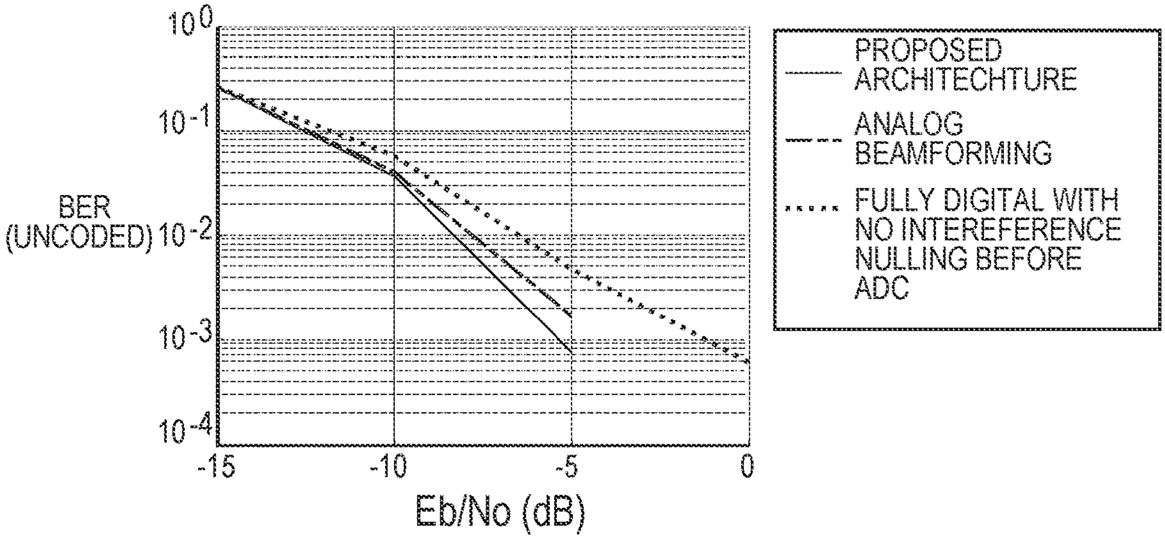

FIG. 270 illustrates the BER performance of a receiver according to some aspects.

Figure 271:
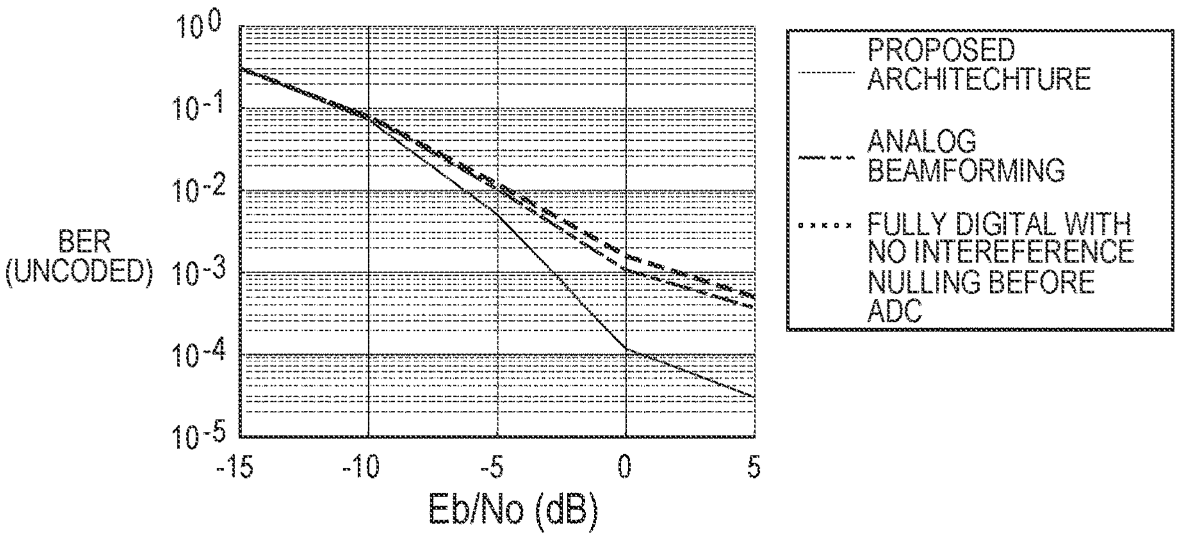

FIG. 271 illustrates different receiver architectures according to some aspects.

Figure 272:
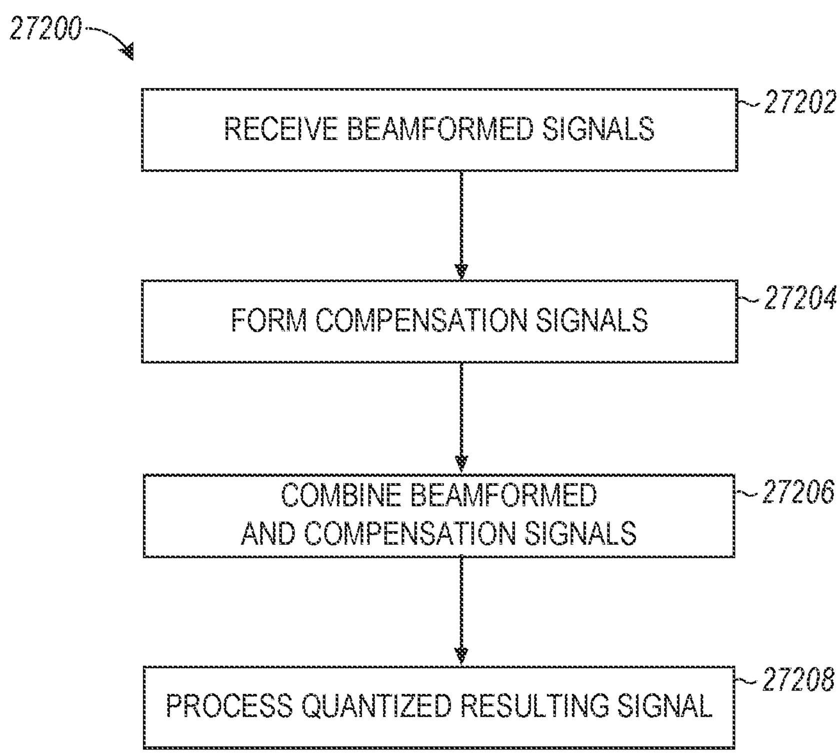

FIG. 272 illustrates a method of compensating for interferers in a receiver in accordance with some aspects.

Figure 273B:
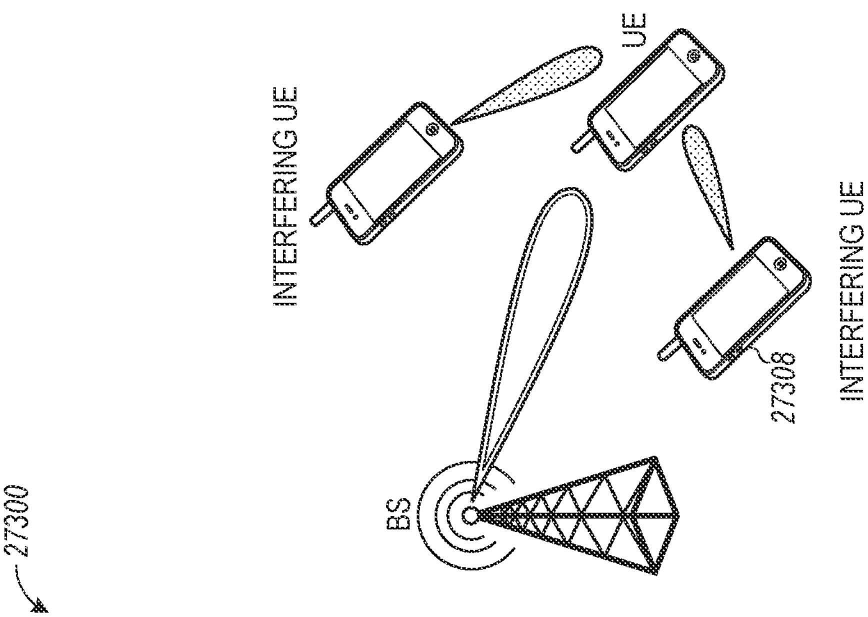
Figure 273A:
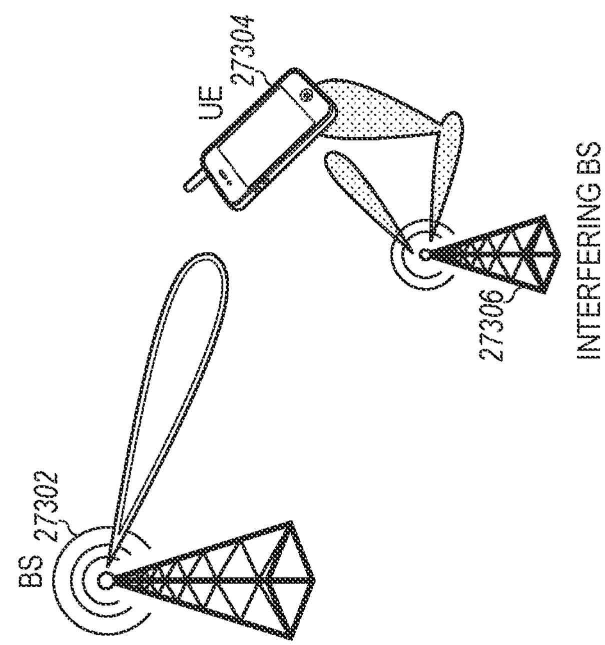

FIGS. 273A and 273B illustrate interference in accordance with some aspects.

Figure 274:
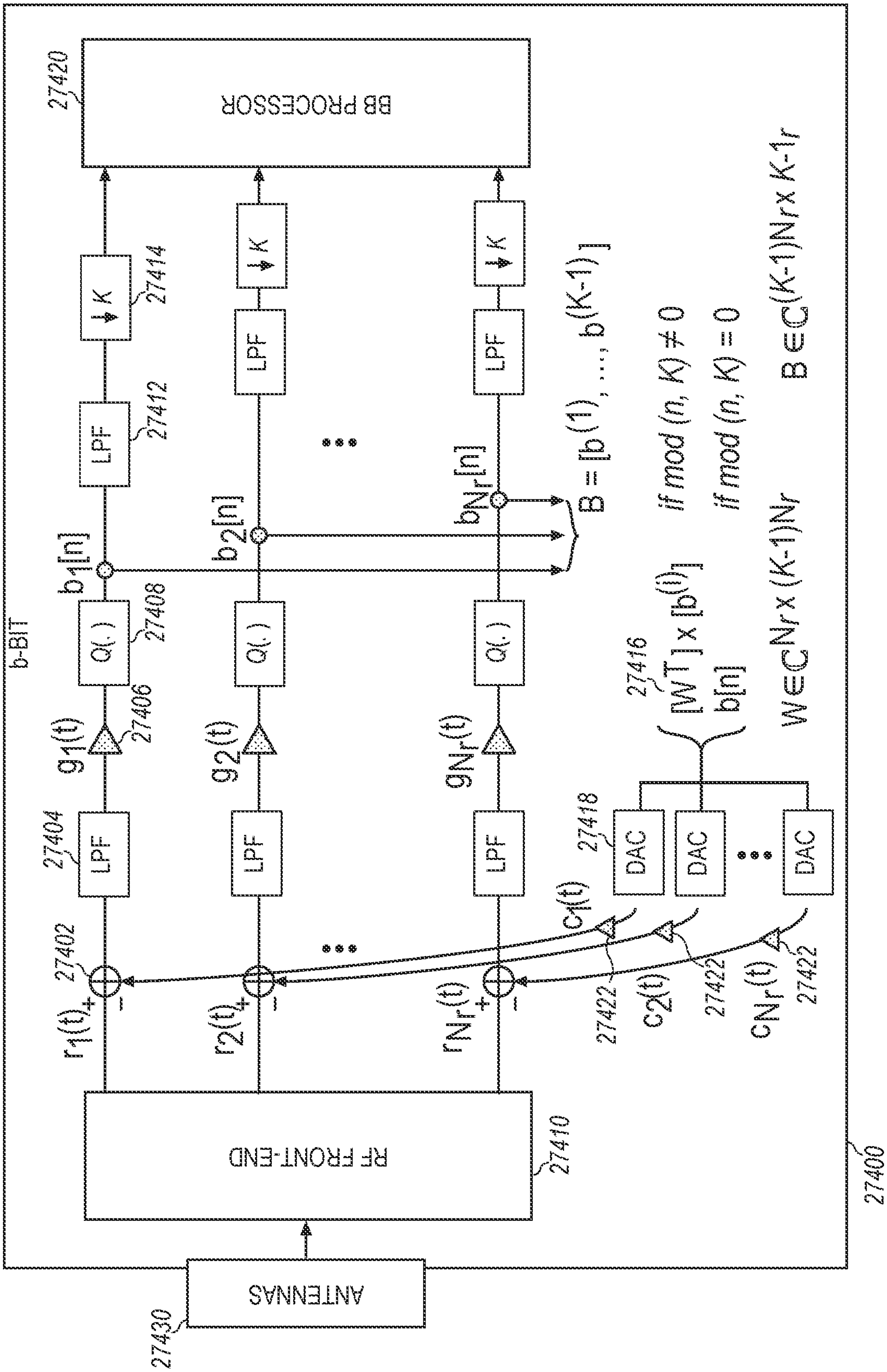

FIG. 274 illustrates a receiver architecture in accordance with some aspects.

Figure 275:
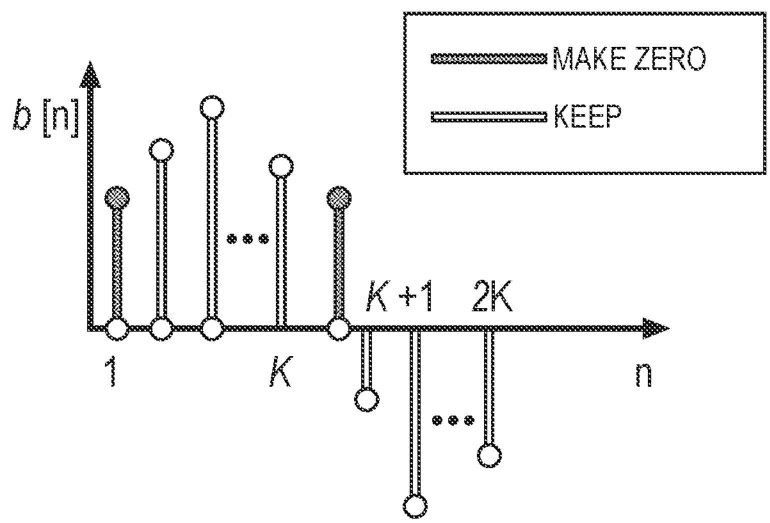

FIG. 275 illustrates an oversampled signal in accordance with some aspects.

Figure 276A:
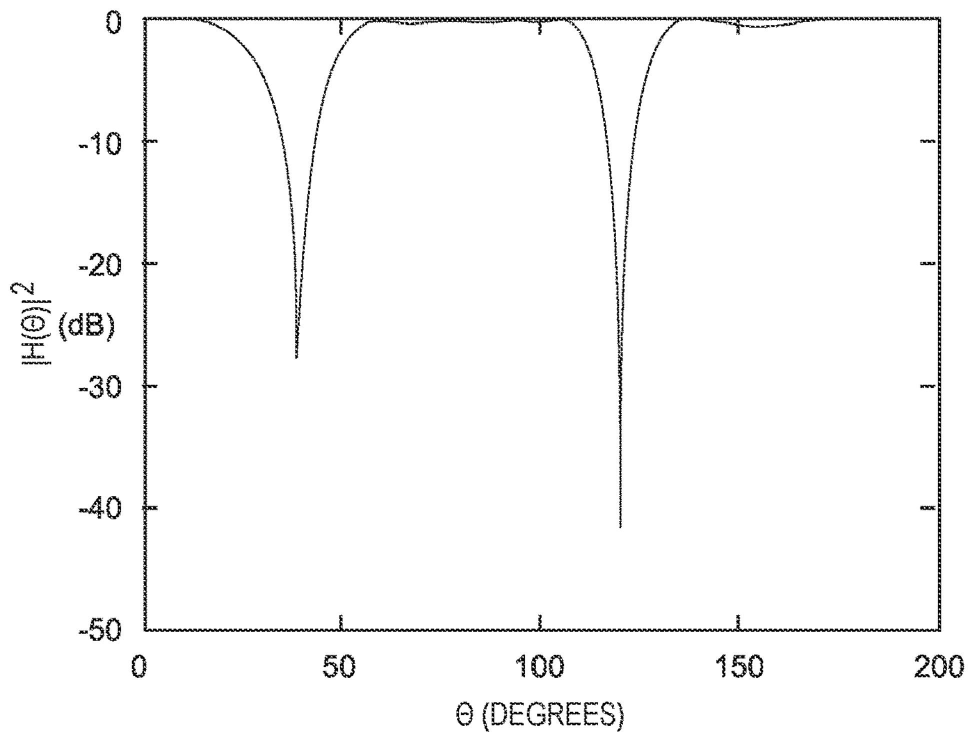
Figure 276B:
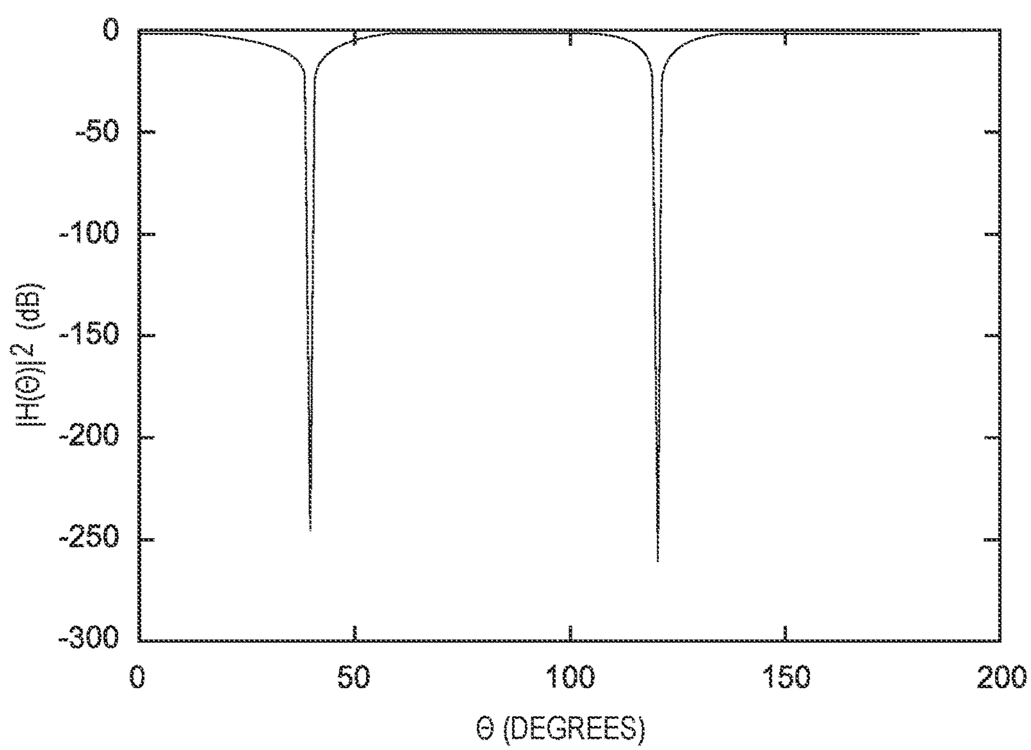

FIGS. 276A and 276B illustrate filter characteristics of the receiver in accordance with some aspects.

Figure 277:
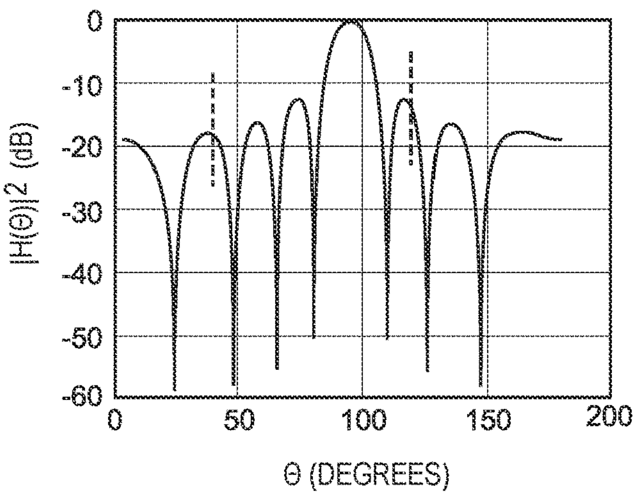

FIG. 277 illustrates a beamforming pattern according to some aspects.

Figure 278:
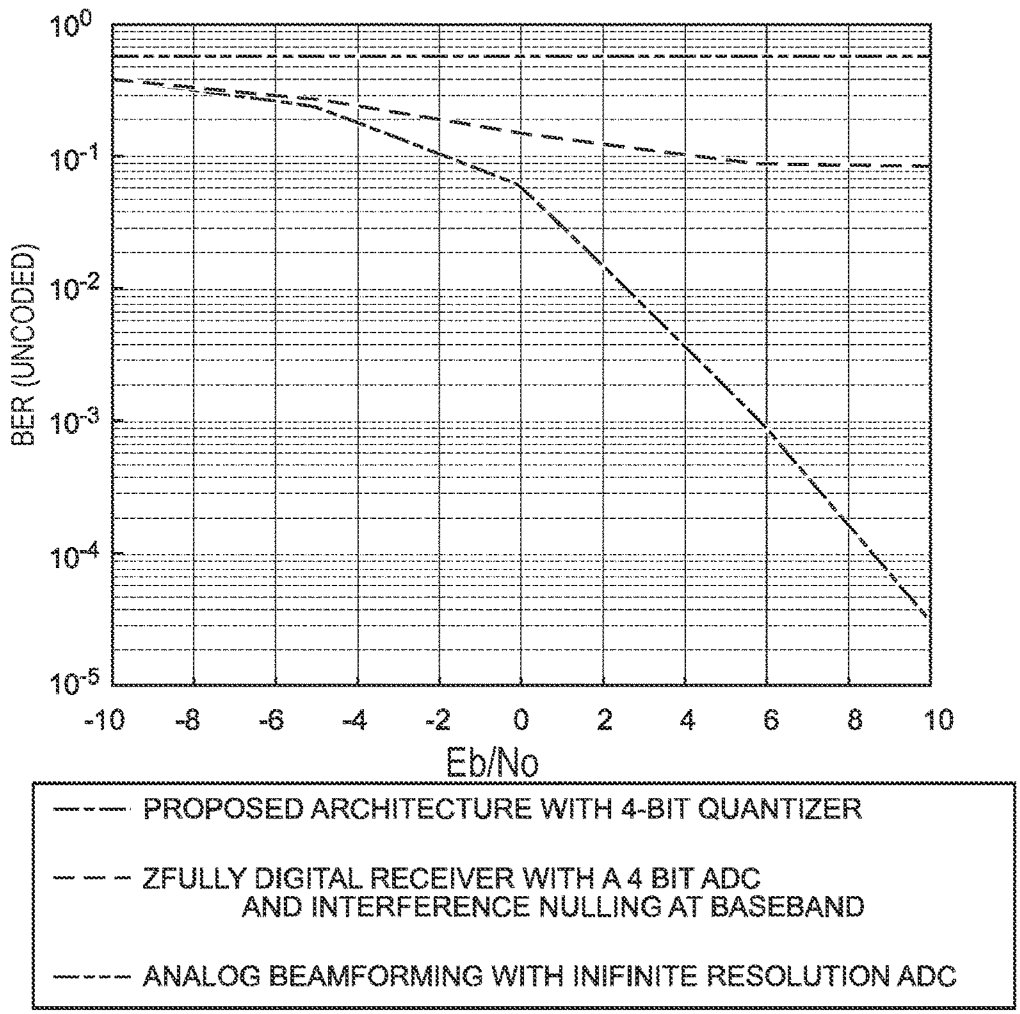

FIG. 278 illustrates a BER performance according to some aspects.

Figure 279:
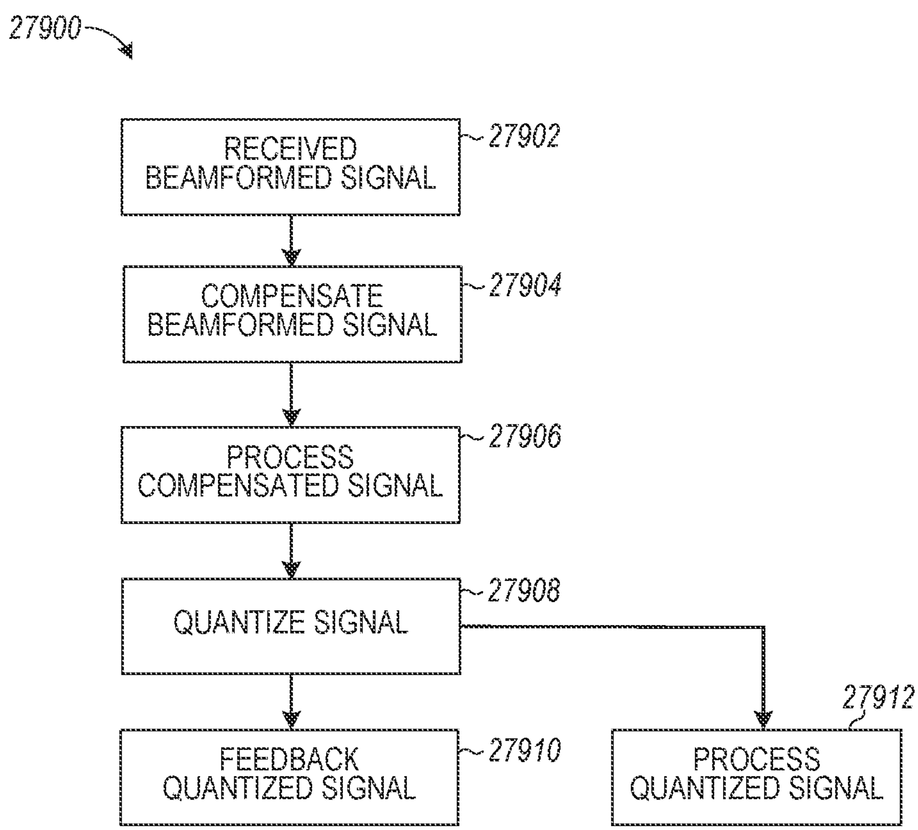

FIG. 279 illustrates a method of reducing quantizer dynamic range in a receiver in accordance with some aspects.

Figure 280:
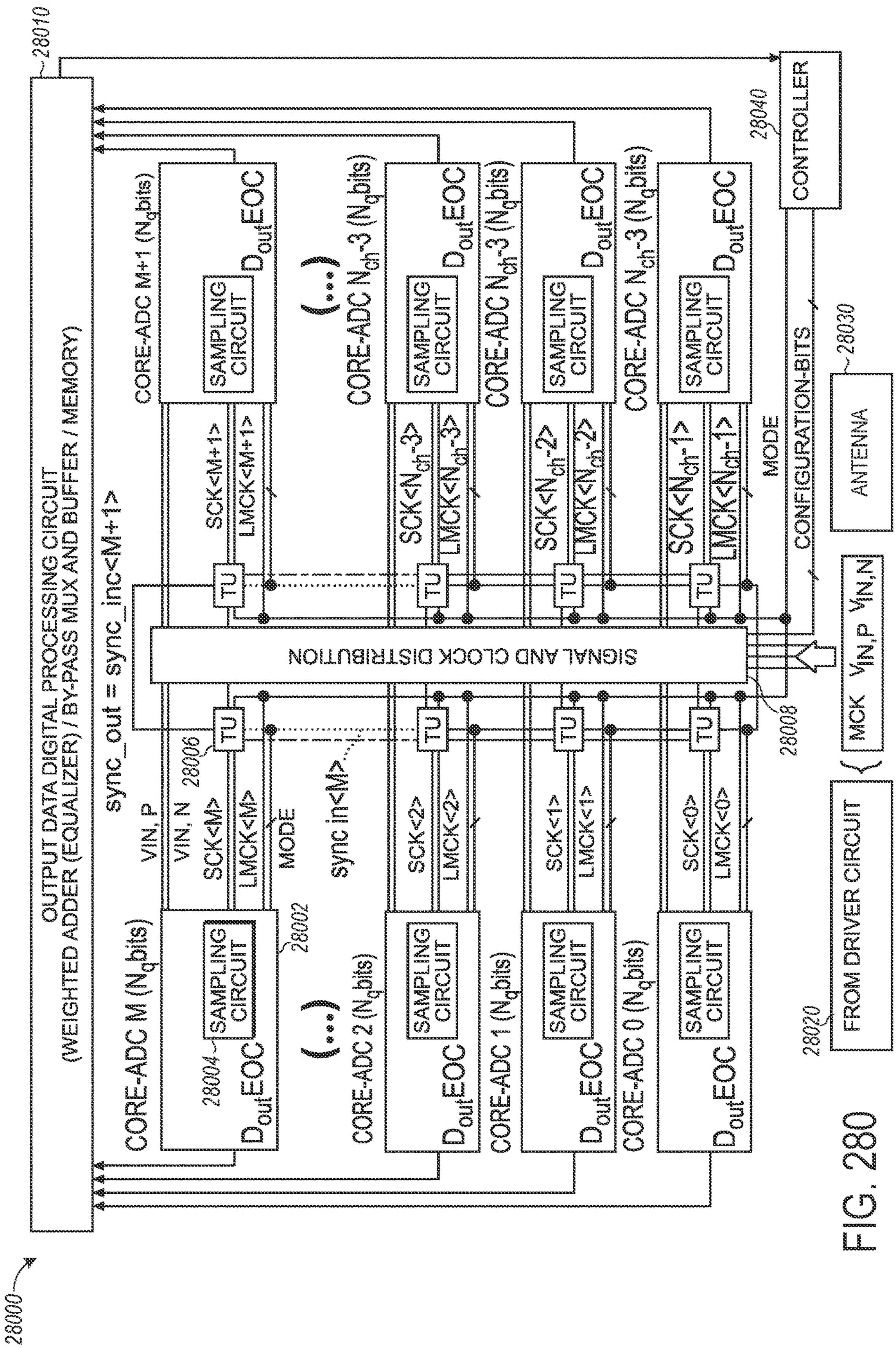

FIG. 280 illustrates an ADC system (ADCS) according to some aspects.

Figure 281A:
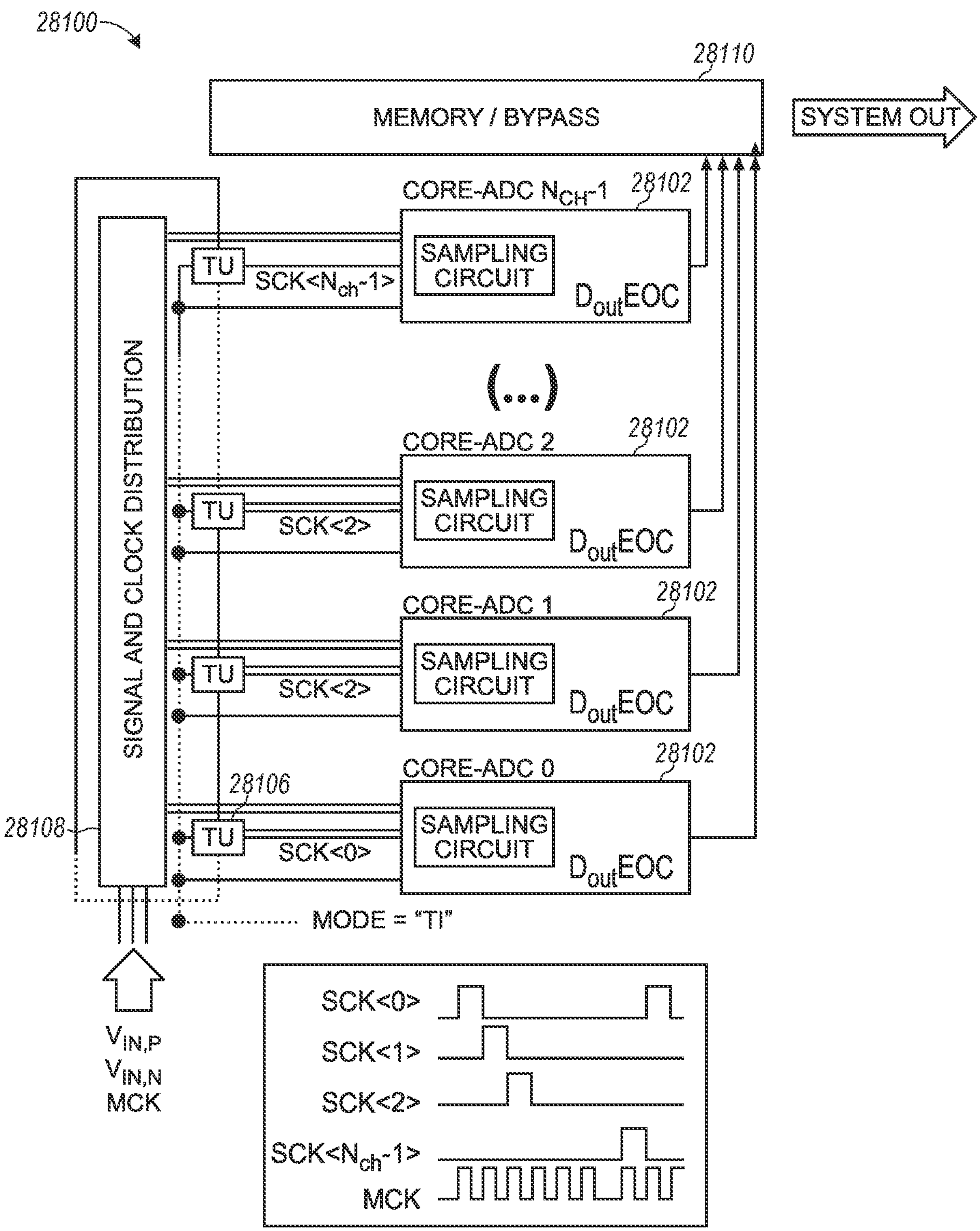
Figure 281B:
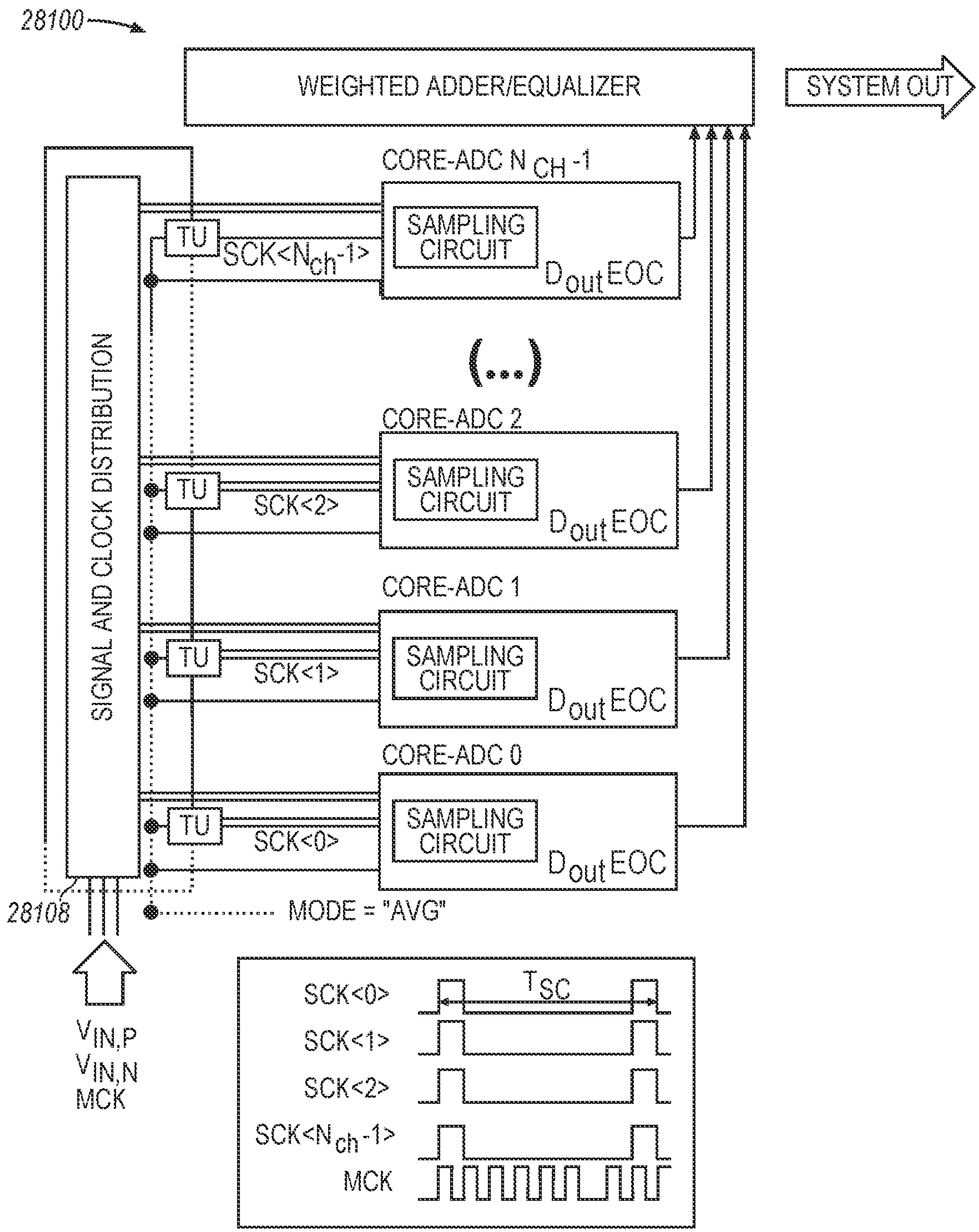

FIGS. 281A and 281B illustrate different operation modes of an ADCS according to some aspects.

Figure 282:
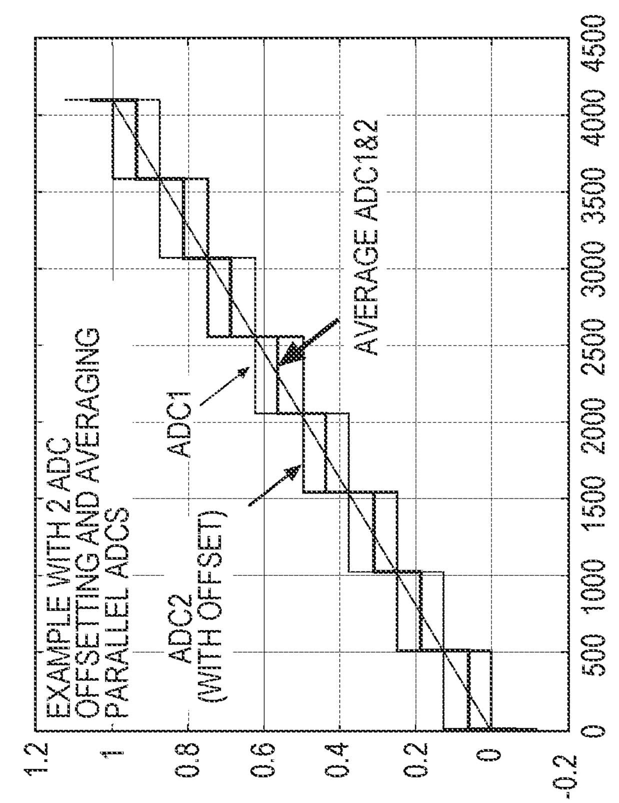

FIG. 282 illustrates core ADC averaging according to some aspects.

Figure 283:
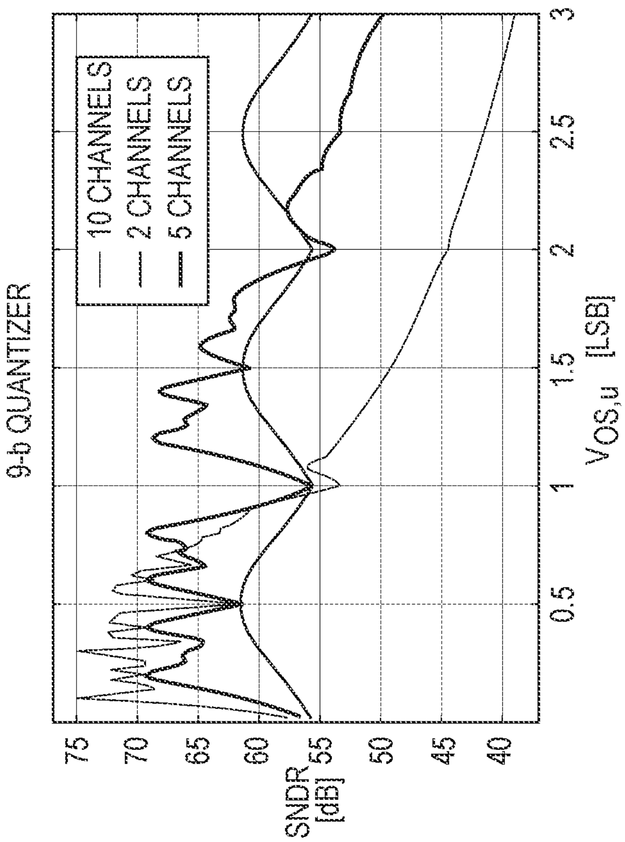

FIG. 283 illustrates resolution improvement of an averaging system in accordance with some aspects.

Figure 284:
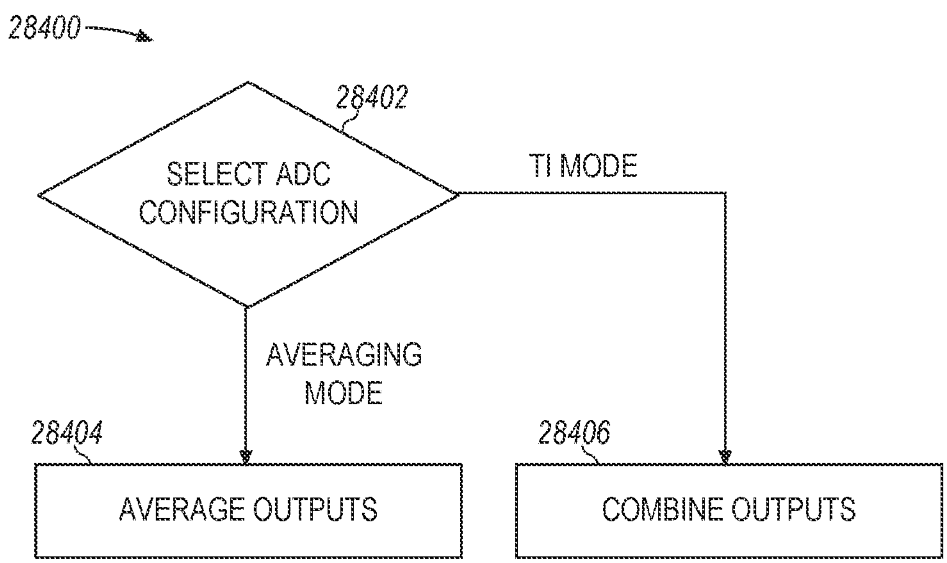

FIG. 284 illustrates a method of providing a flexible ADC architecture in accordance with some aspects.

Figure 285:
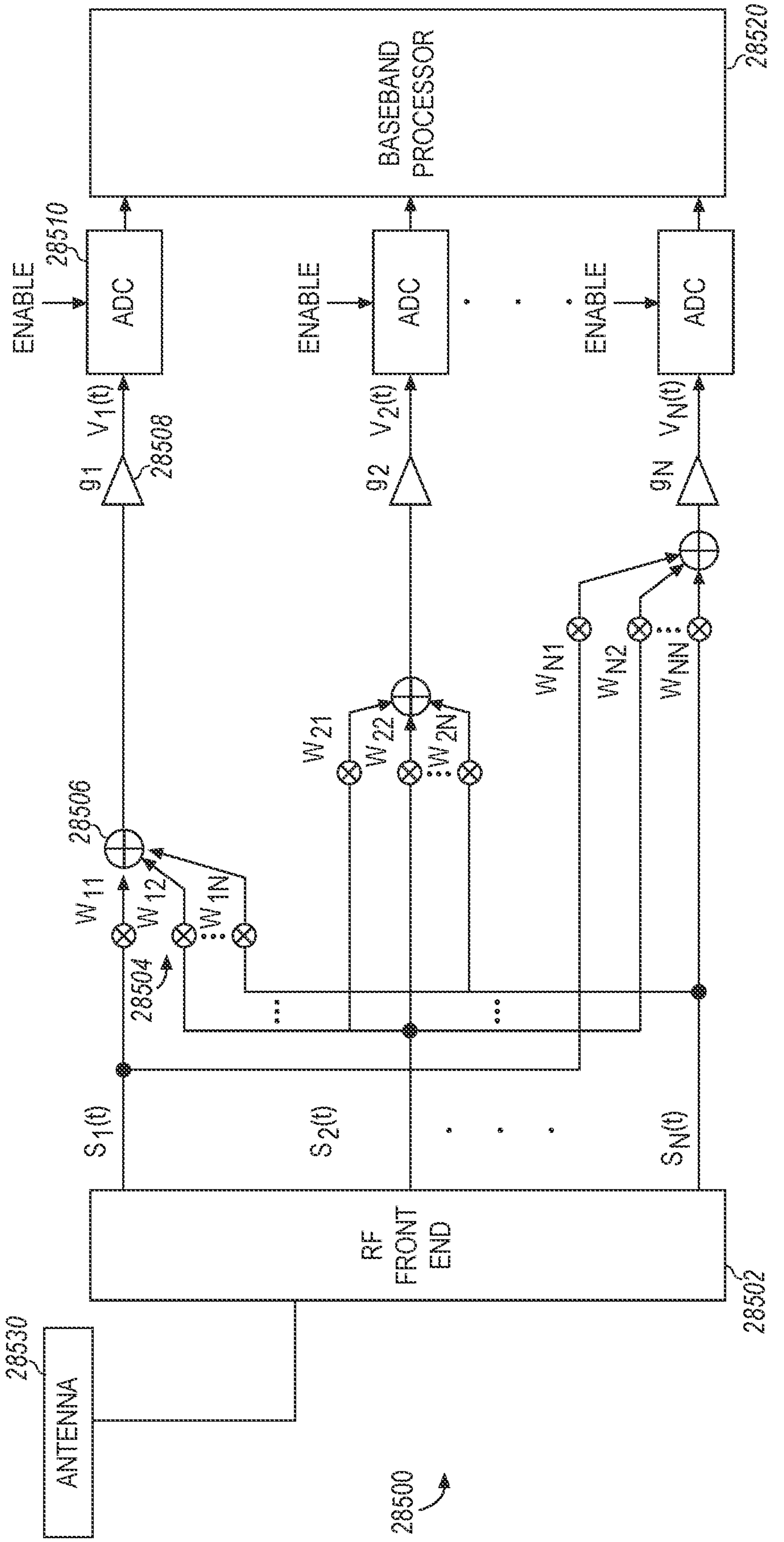

FIG. 285 illustrates a receiver architecture in accordance with some aspects.

Figure 286:
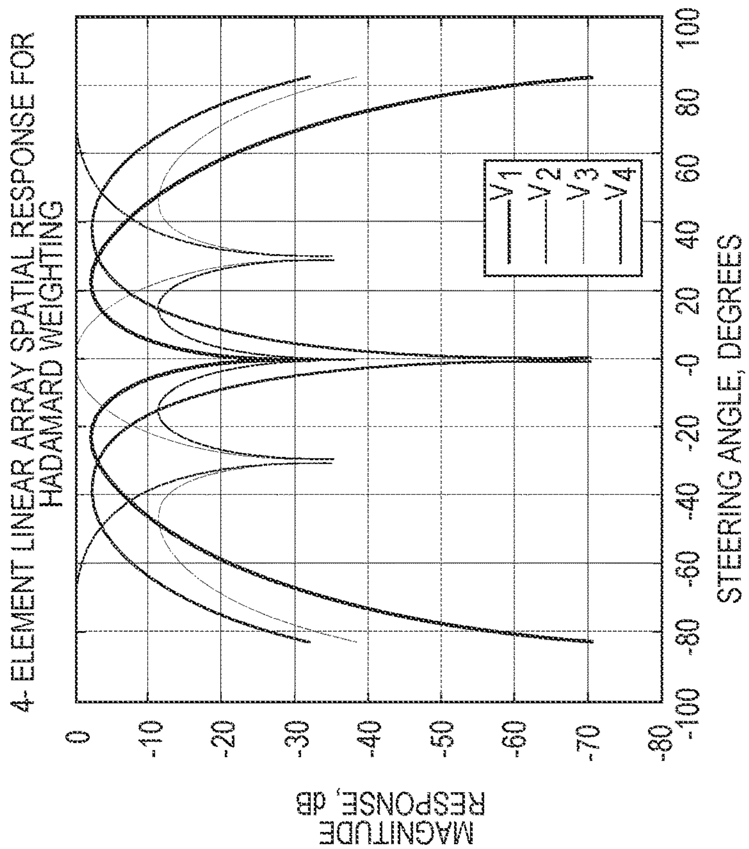

FIG. 286 illustrates a simulation of a spatial response in accordance with some aspects.

Figure 287:
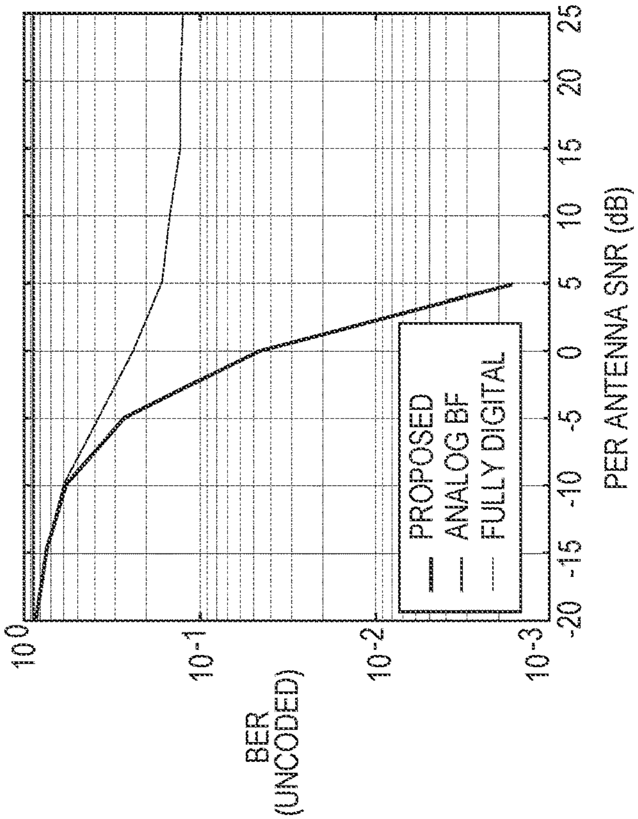

FIG. 287 illustrates a simulation of BER in accordance with some aspects.

Figure 288:
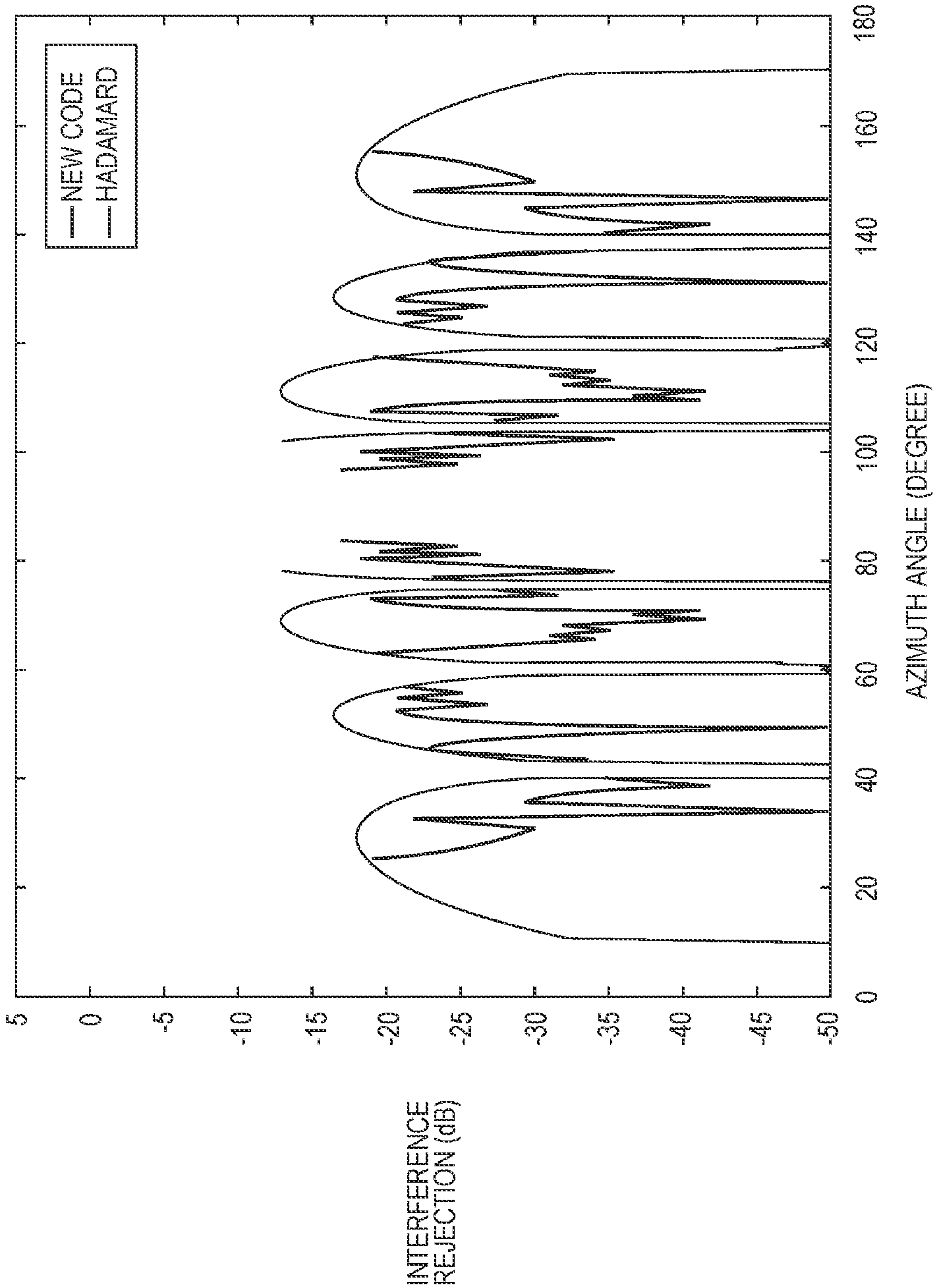

FIG. 288 illustrates a simulation of interference rejection in accordance with some aspects.

Figure 289:
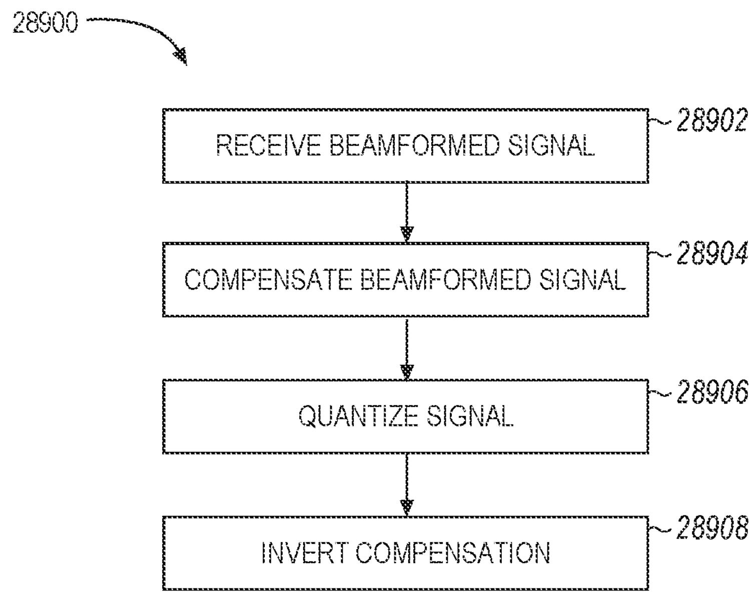

FIG. 289 illustrates a method of reducing quantizer dynamic range in a receiver in accordance with some aspects.

Figure 290:
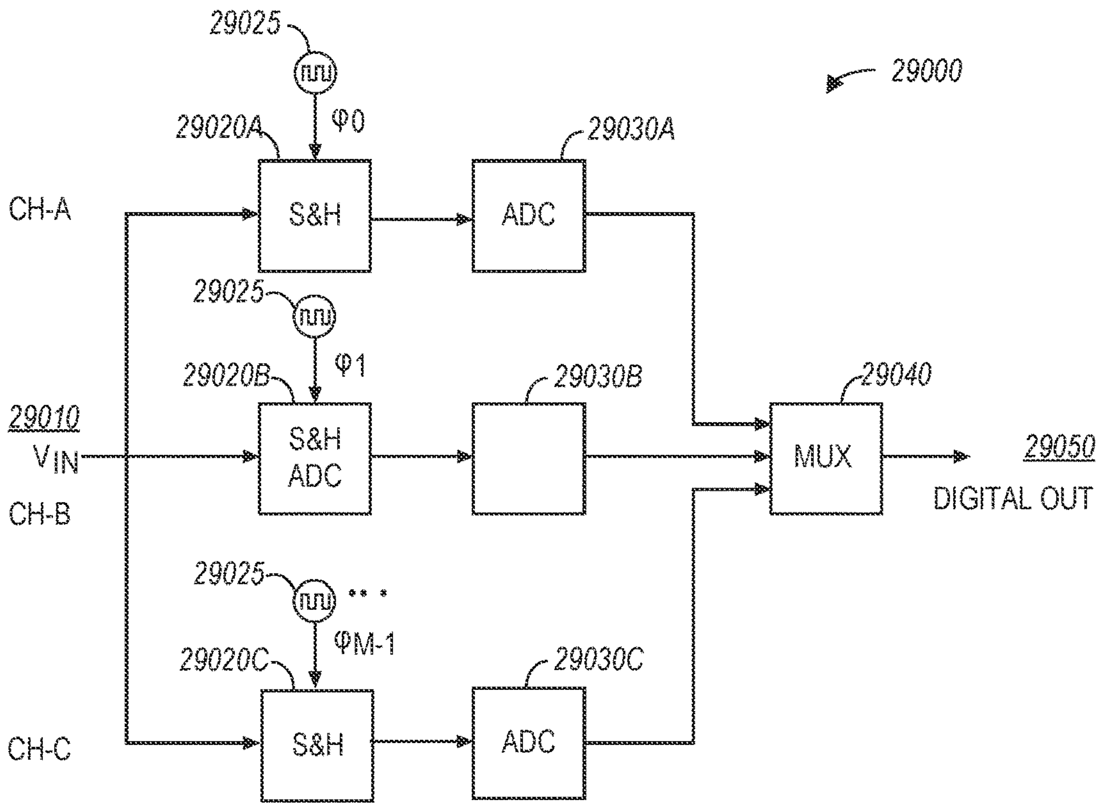

FIG. 290 is a block diagram of an example of a Time-Interleaved Analog to Digital Converter (TI-ADC) architecture in accordance with some aspects that may be utilized herein and that achieves a high-speed conversion using M parallel low speed ADC channels in some aspects.

Figure 291:
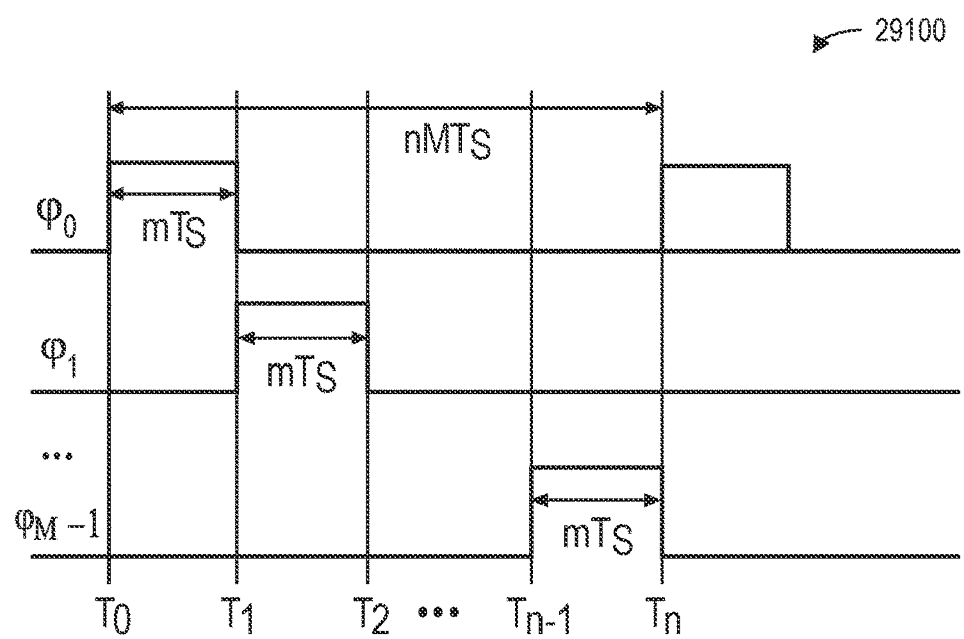

FIG. 291 is a timing diagram 29100 that illustrates how all the channels operate with a same sampling frequency $F_S$ (or its inverse $T_S$, illustrated in FIG. 291) with M uniformly spaced phases according to an example TI-ADC.

Figure 292:
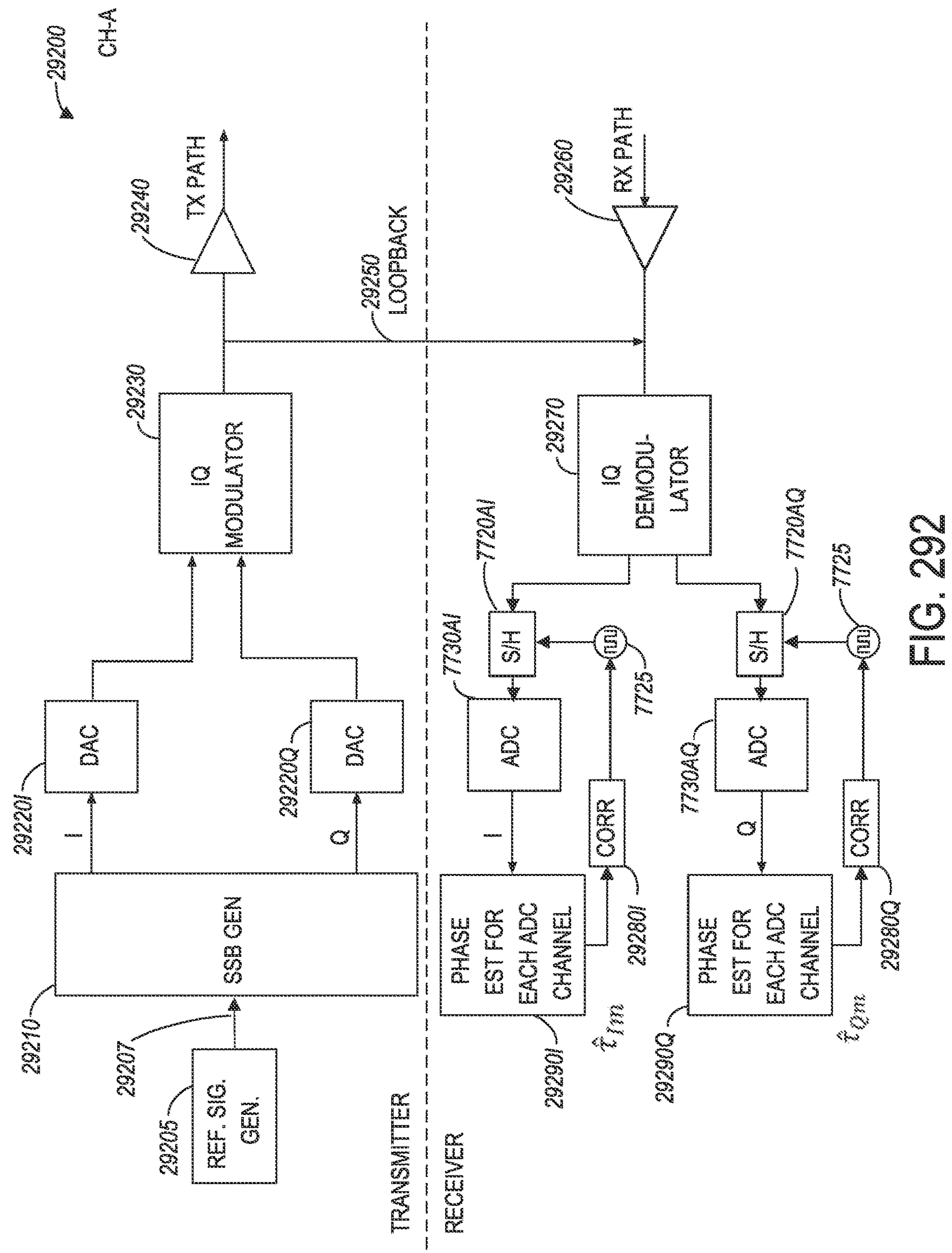

FIG. 292 is a block diagram illustrating an example of a transceiver 29200 having a loopback design according to an example disclosed herein.

Figure 293:
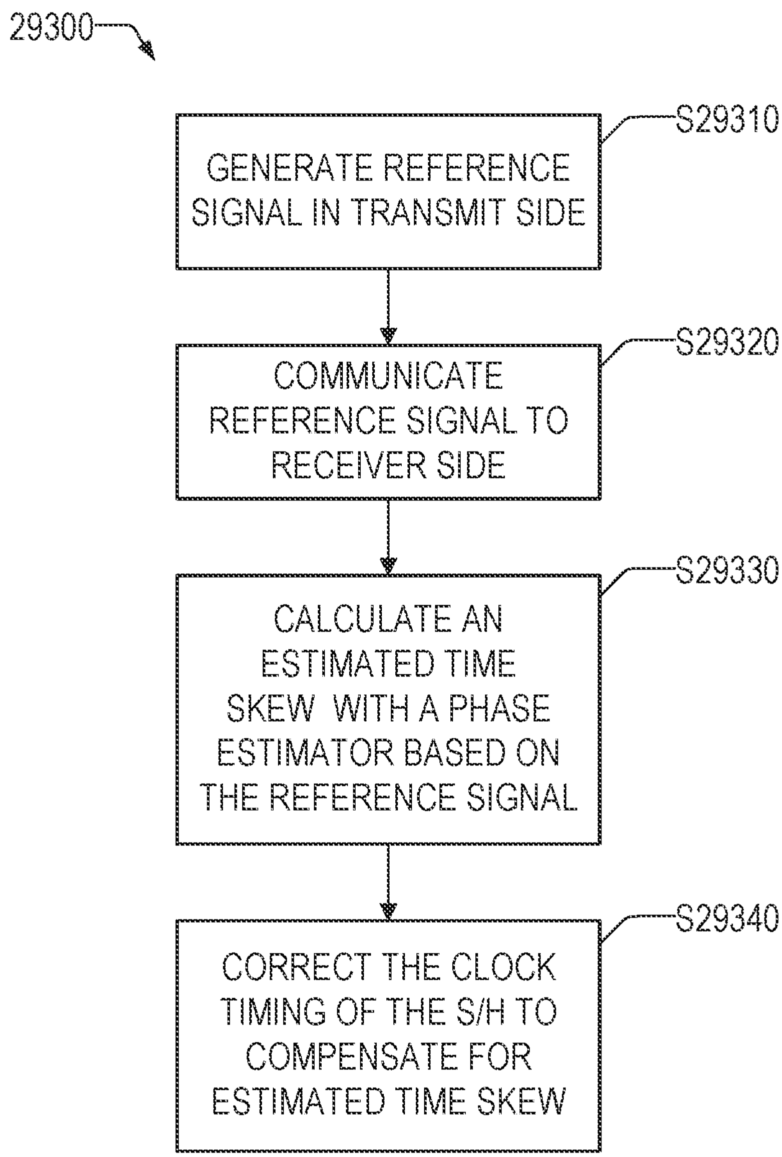

FIG. 293 is a flowchart illustrating a process according to an example disclosed herein.

Figure 294:
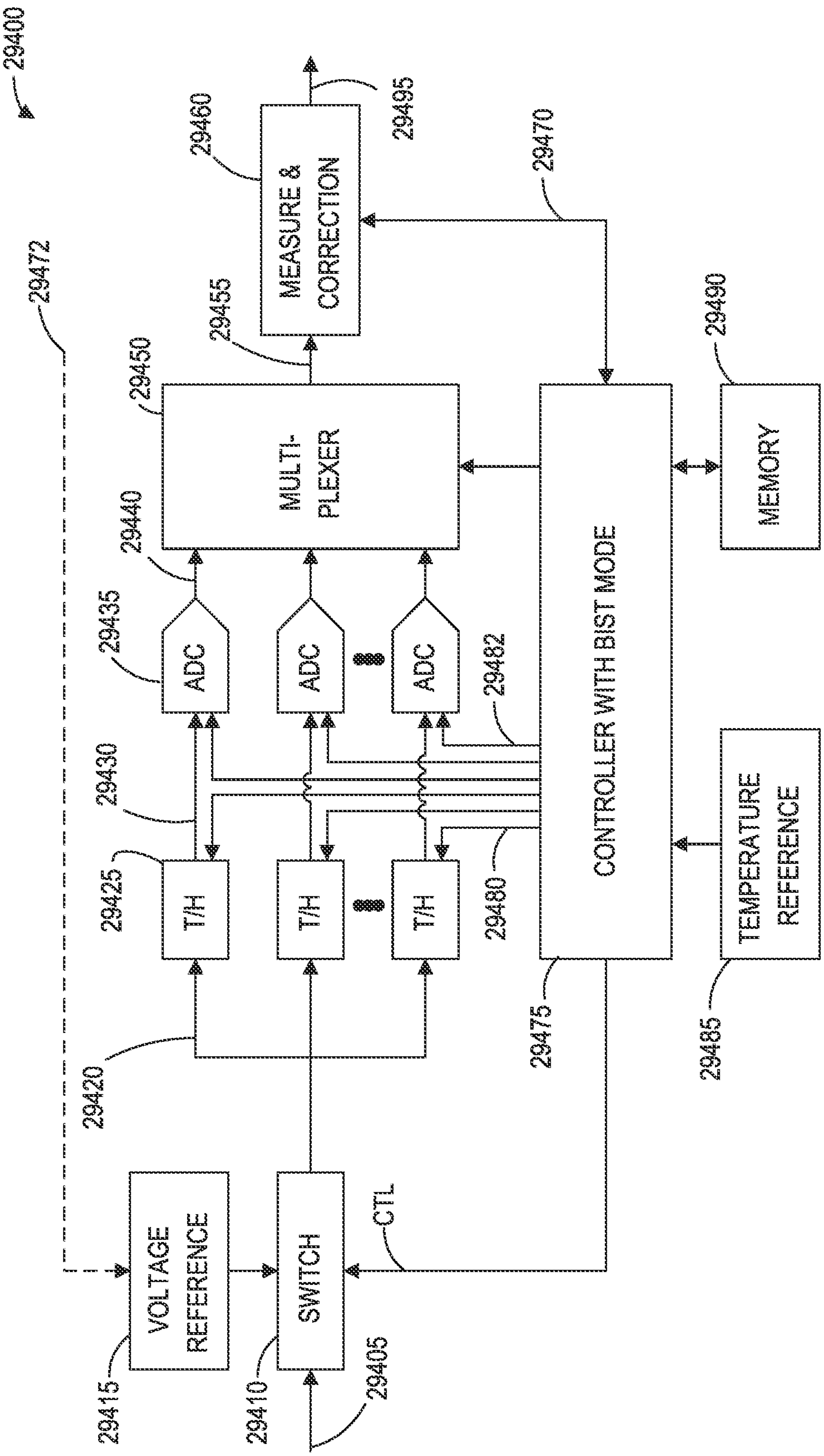

FIG. 294 is a block diagram of an example TI-ADC, according to some aspects.

Figure 295:
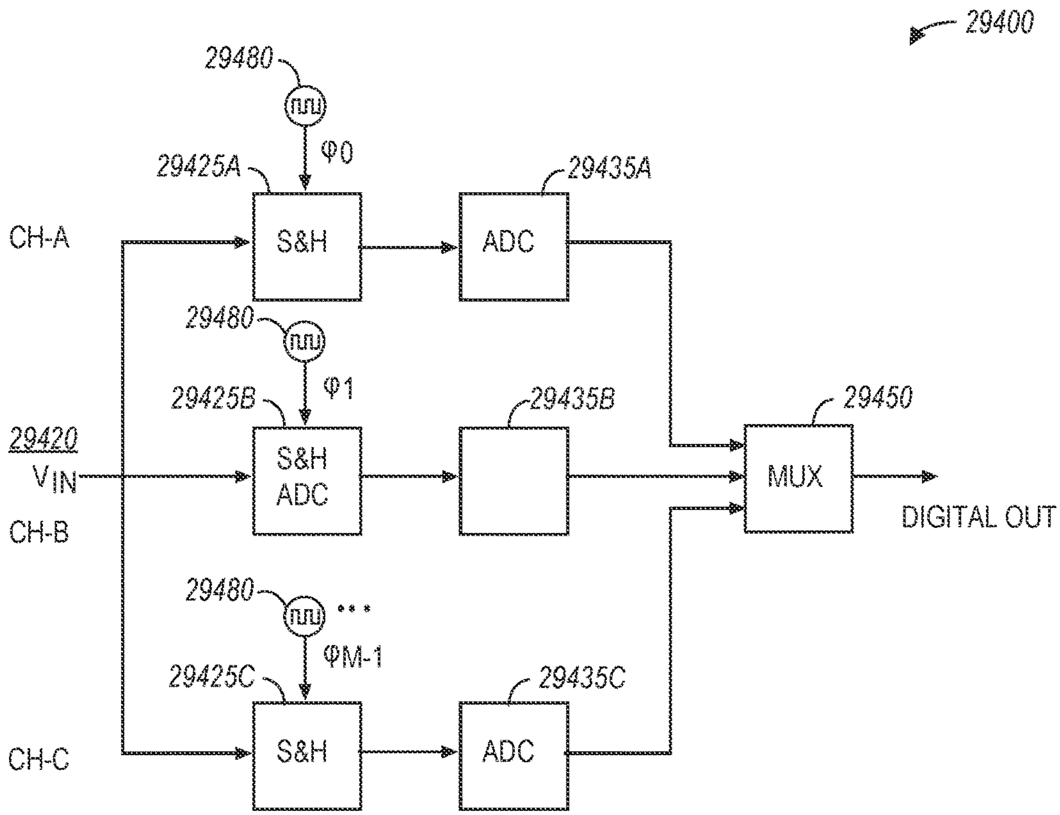

FIG. 295 is a block diagram of an example of a TI-ADC architecture that achieves a high-speed conversion, according to some aspects.

Figure 296:
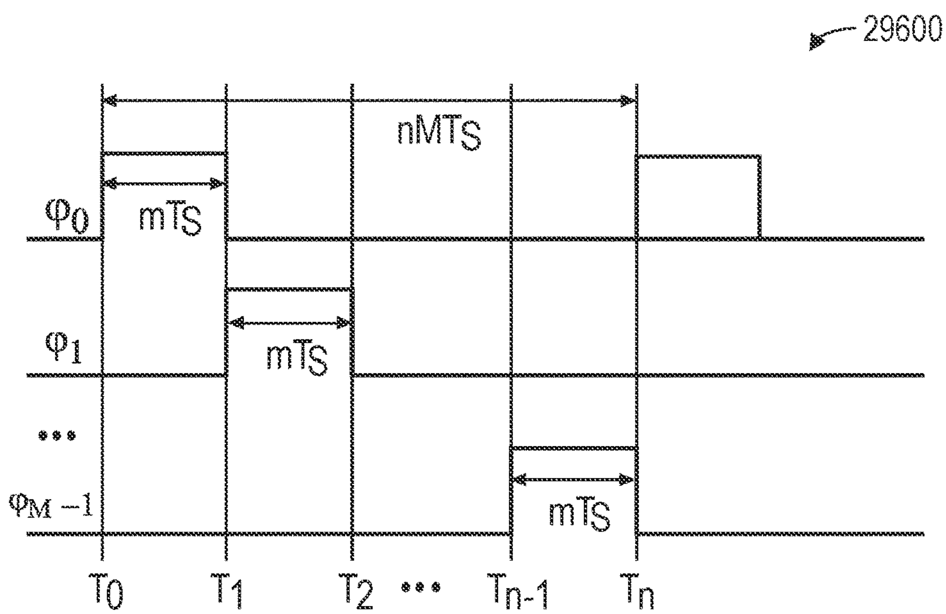

FIG. 296 is a timing diagram that illustrates how all the channels operate with a same sampling frequency $F_S$ (or its inverse $T_S$, illustrated in FIG. 296) with M uniformly spaced phases, according to some aspects.

Figure 297:
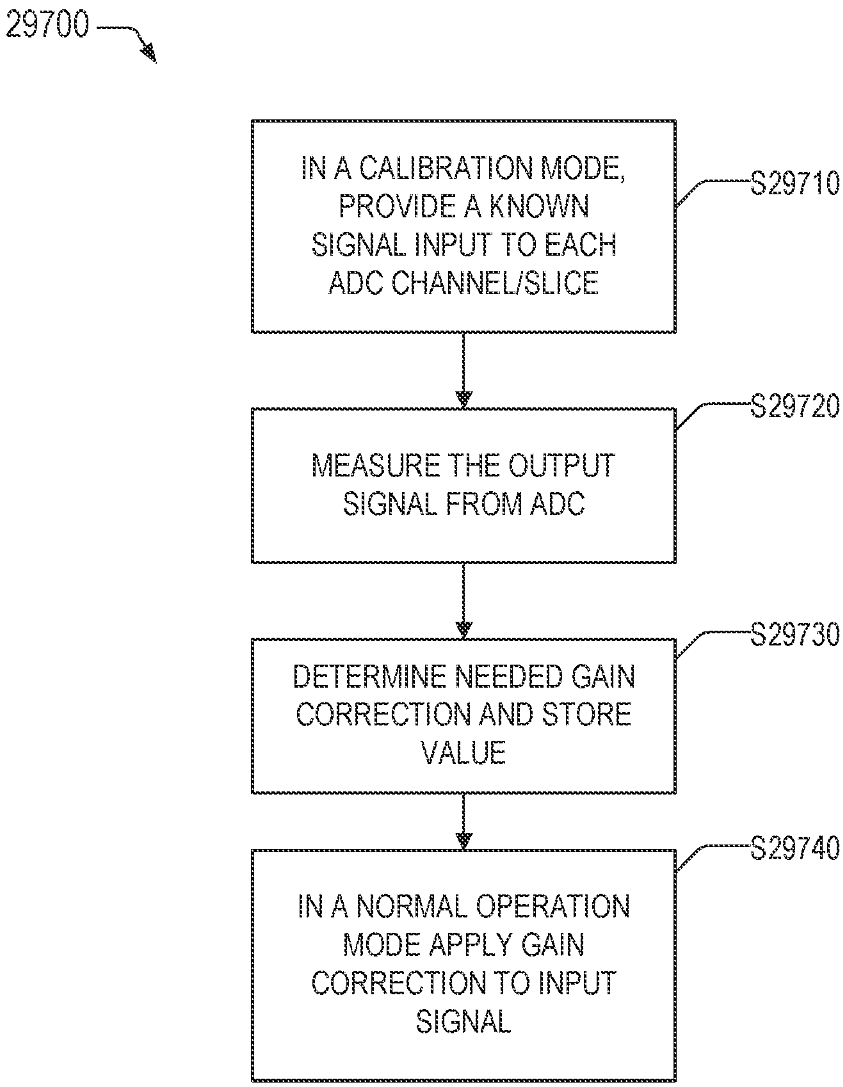

FIG. 297 is a flowchart illustrating an example implementation of a process for applying the gain correction, according to some aspects.

Figure 298:
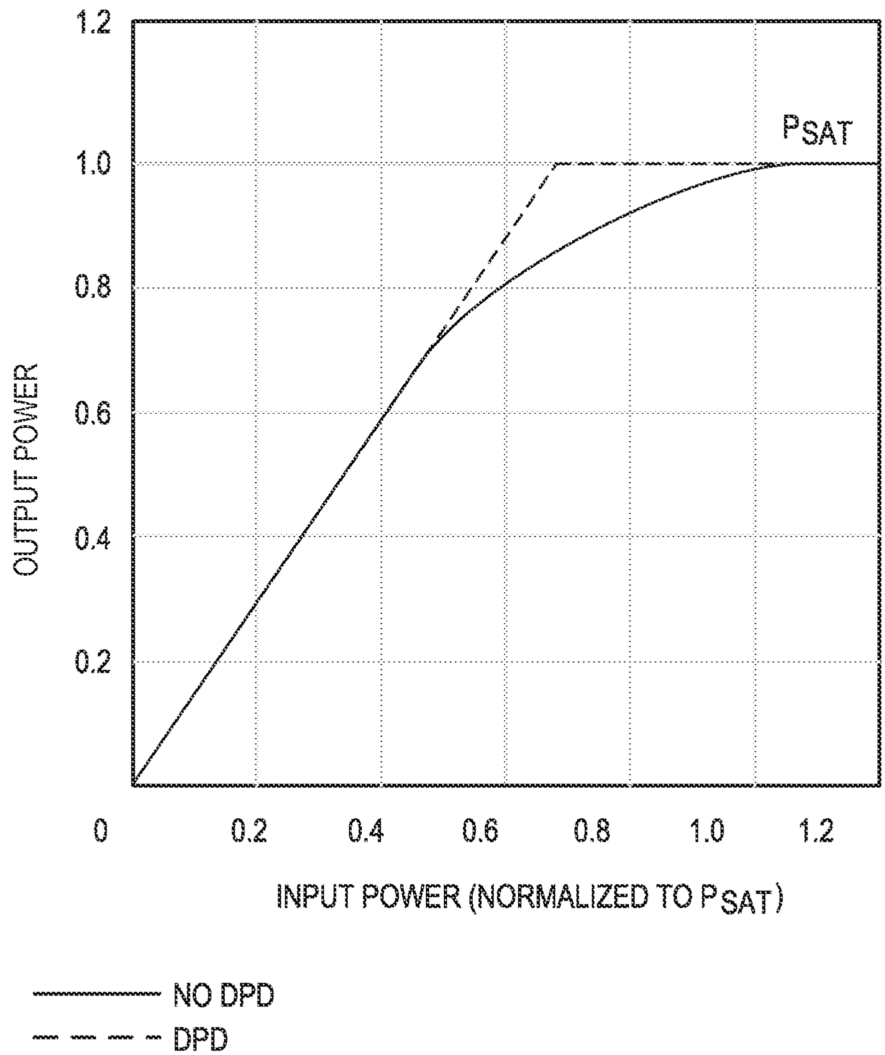

FIG. 298 is a graph illustrating an example of a PA characteristic curve of AM/AM (input amplitude VS. output amplitude), according to some aspects.

Figure 299:
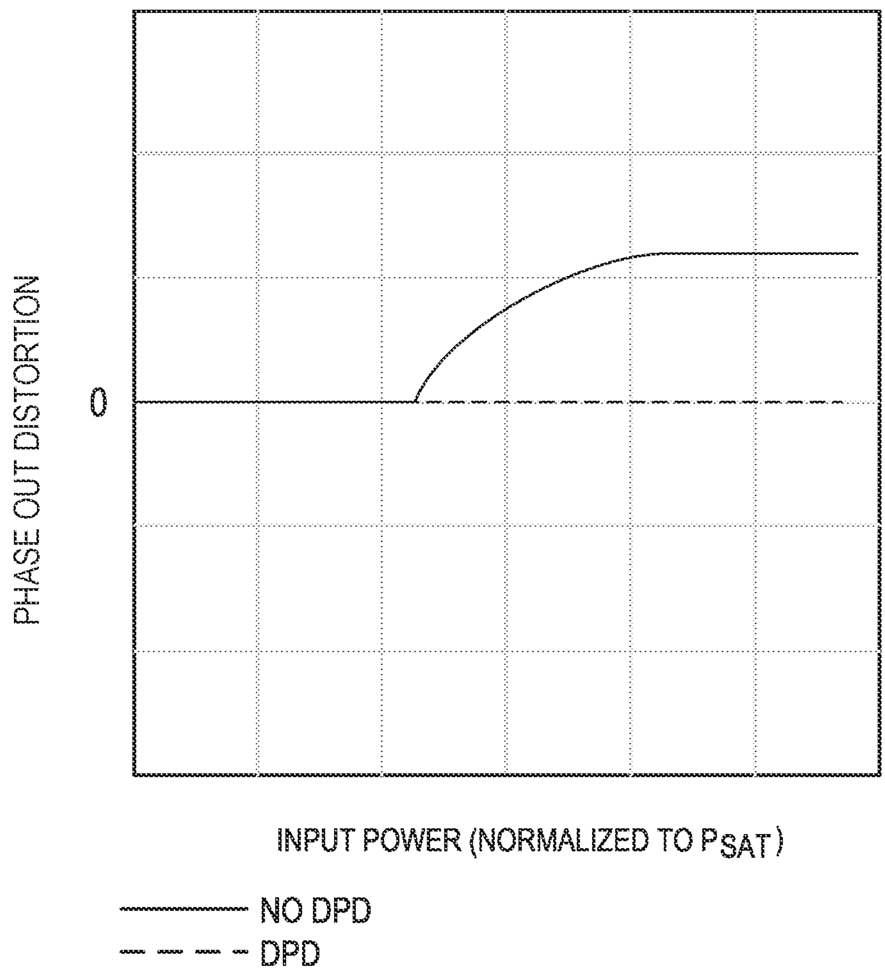

FIG. 299 is a graph illustrating an example of a PA characteristic curve of AM/PM (input amplitude VS. output phase variation), according to some aspects.

Figure 300:
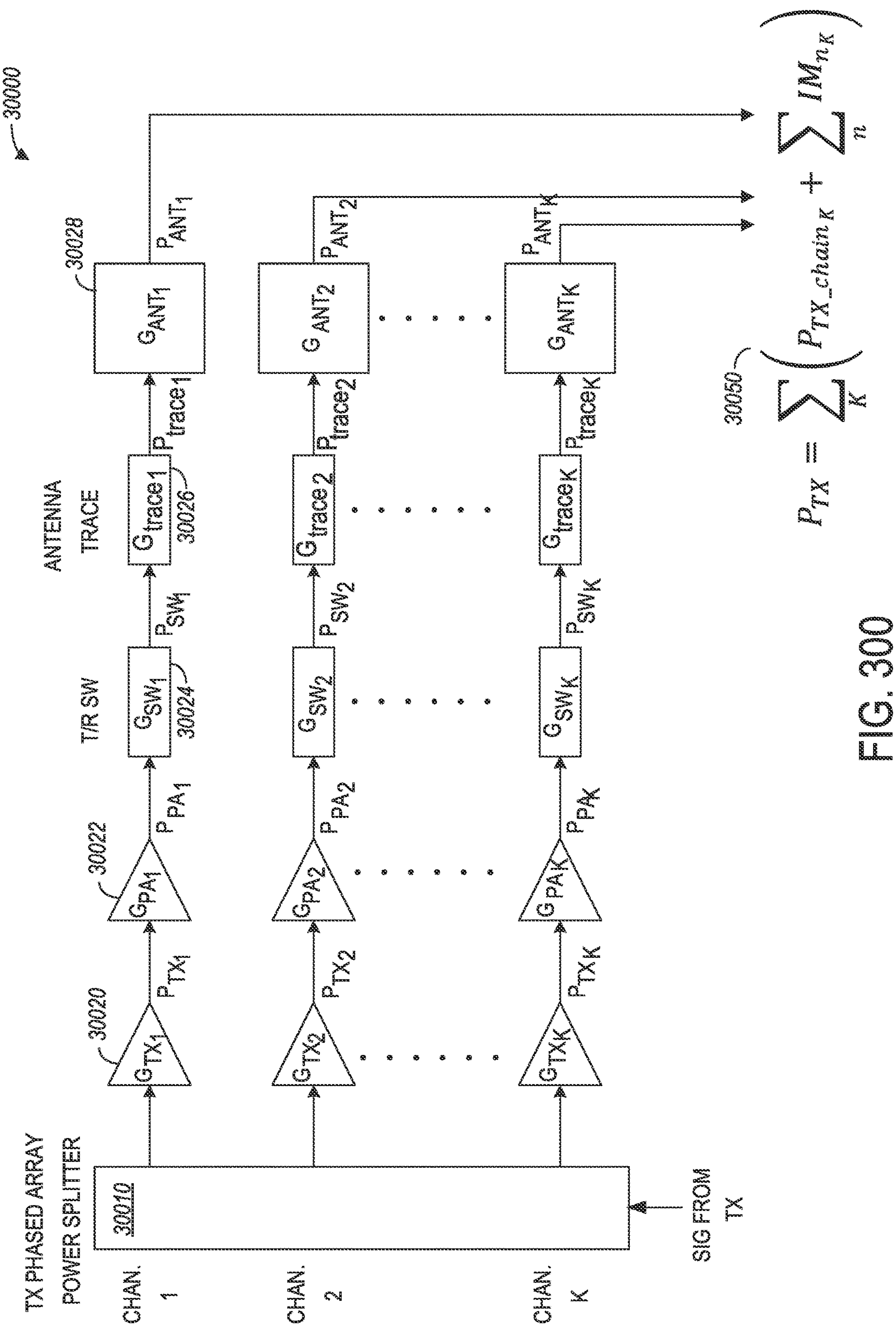

FIG. 300 is a block diagram of an example of a gain model for a portion of a phased array transmitter, according to an exemplary aspect of the present disclosure.

Figure 301:
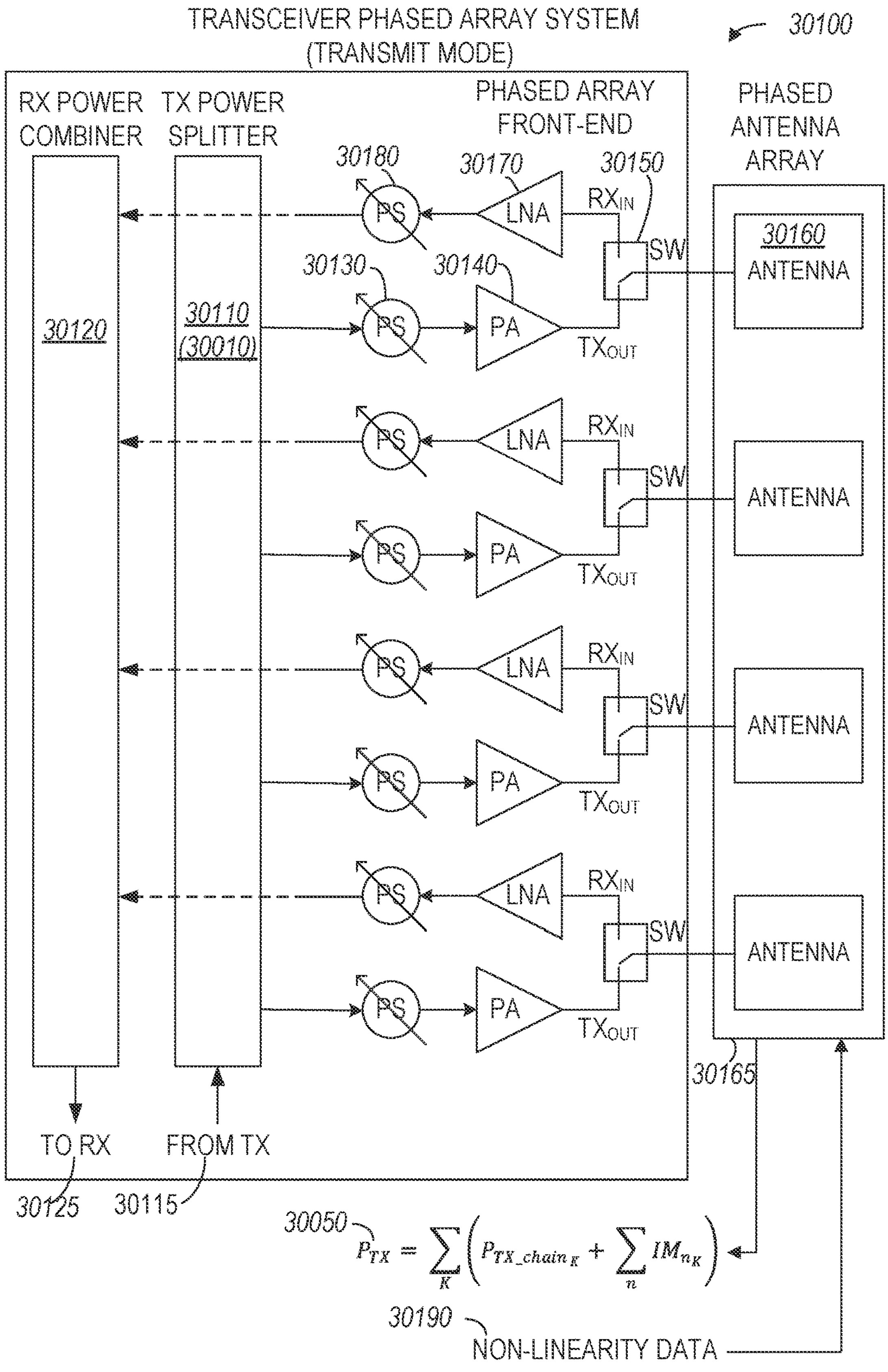

FIG. 301 is a block diagram of an example of a switchable transceiver portion that the transmitter model described above may represent, according to an exemplary aspect of the present disclosure.

Figure 302:
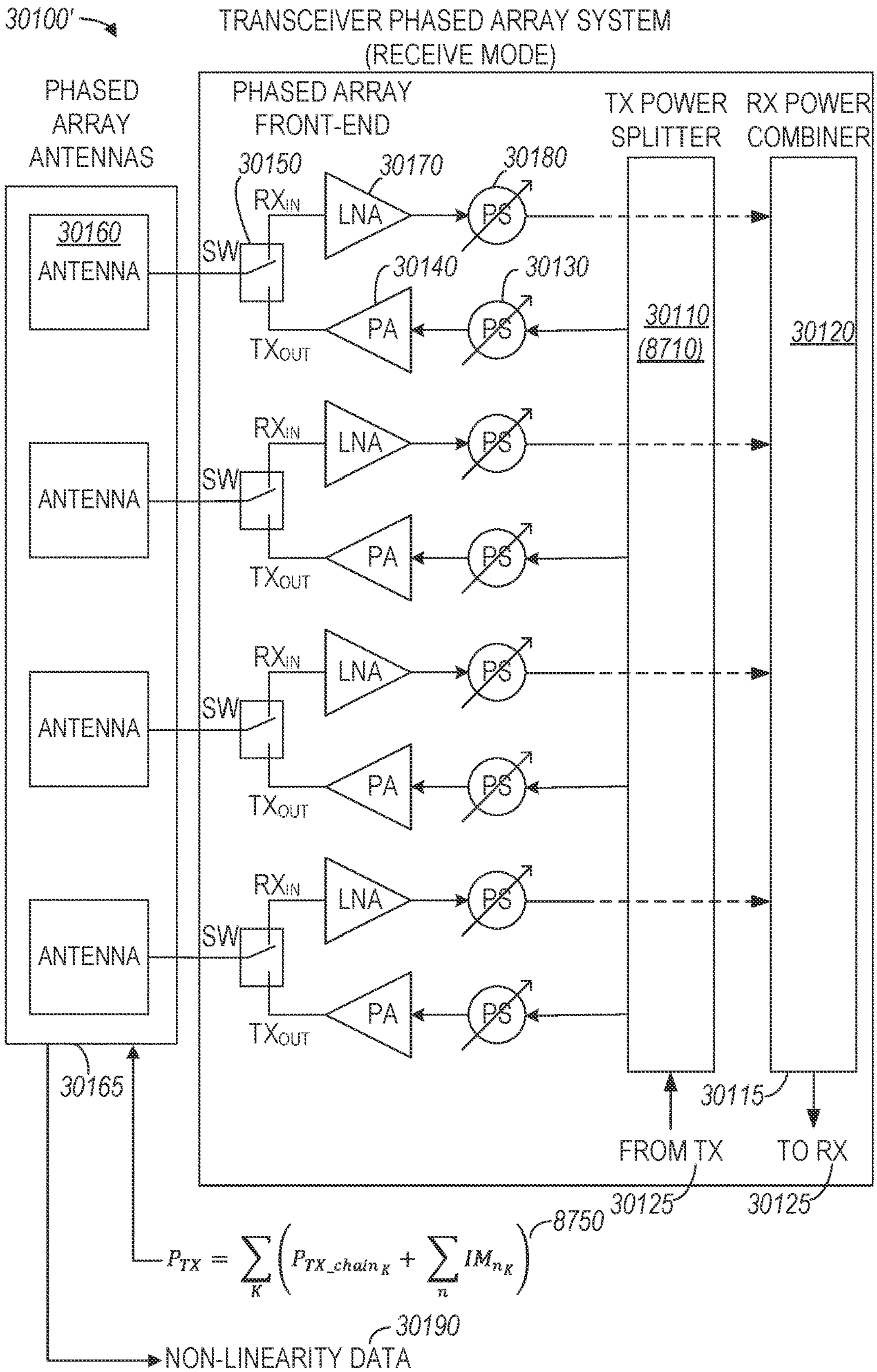

FIG. 302 is essentially a replica transceiver portion of the transceiver portion illustrated in FIG. 301, but with the switches thrown in a receive configuration, according to an exemplary aspect of the present disclosure.

Figure 303A:
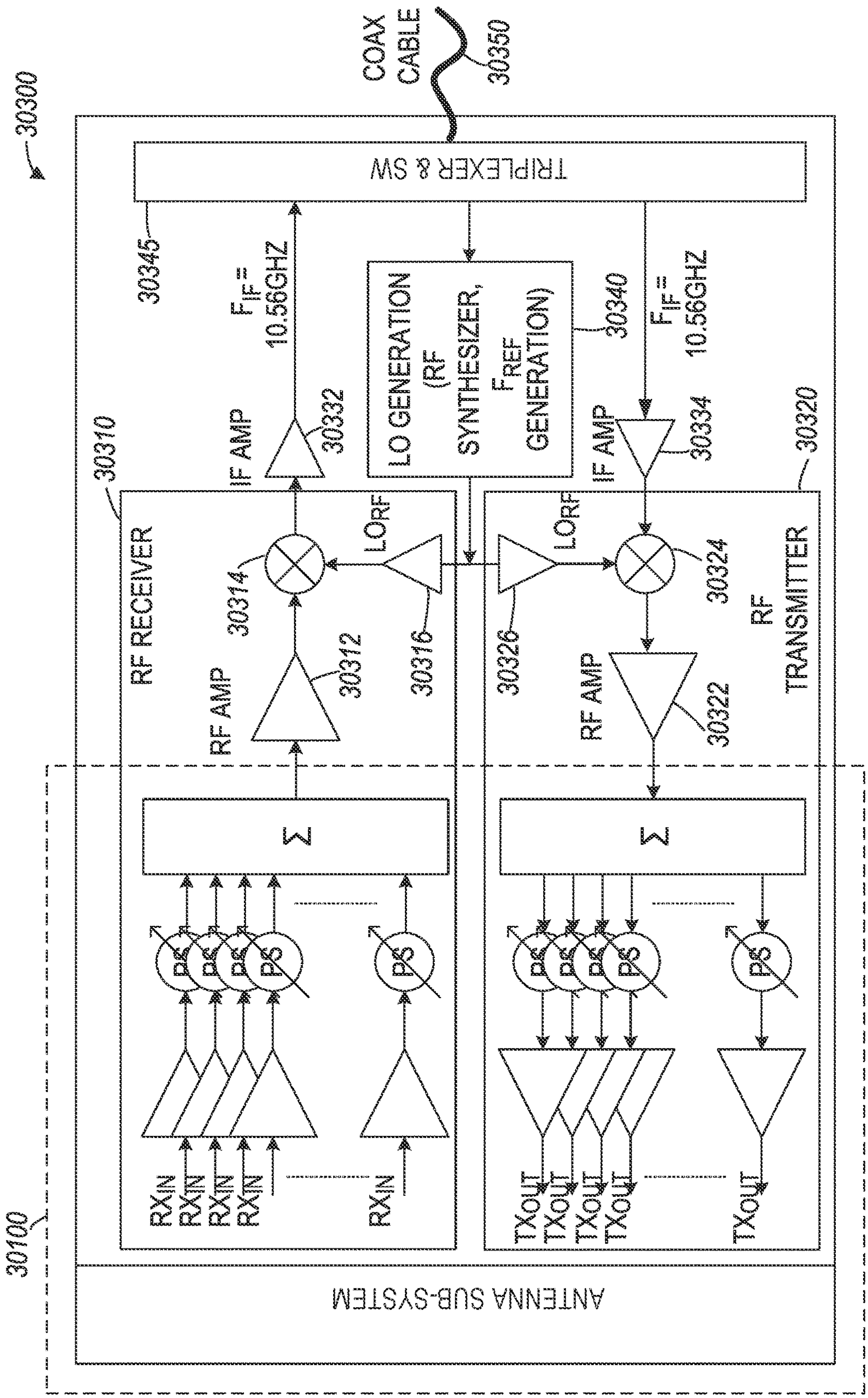
Figure 303B:
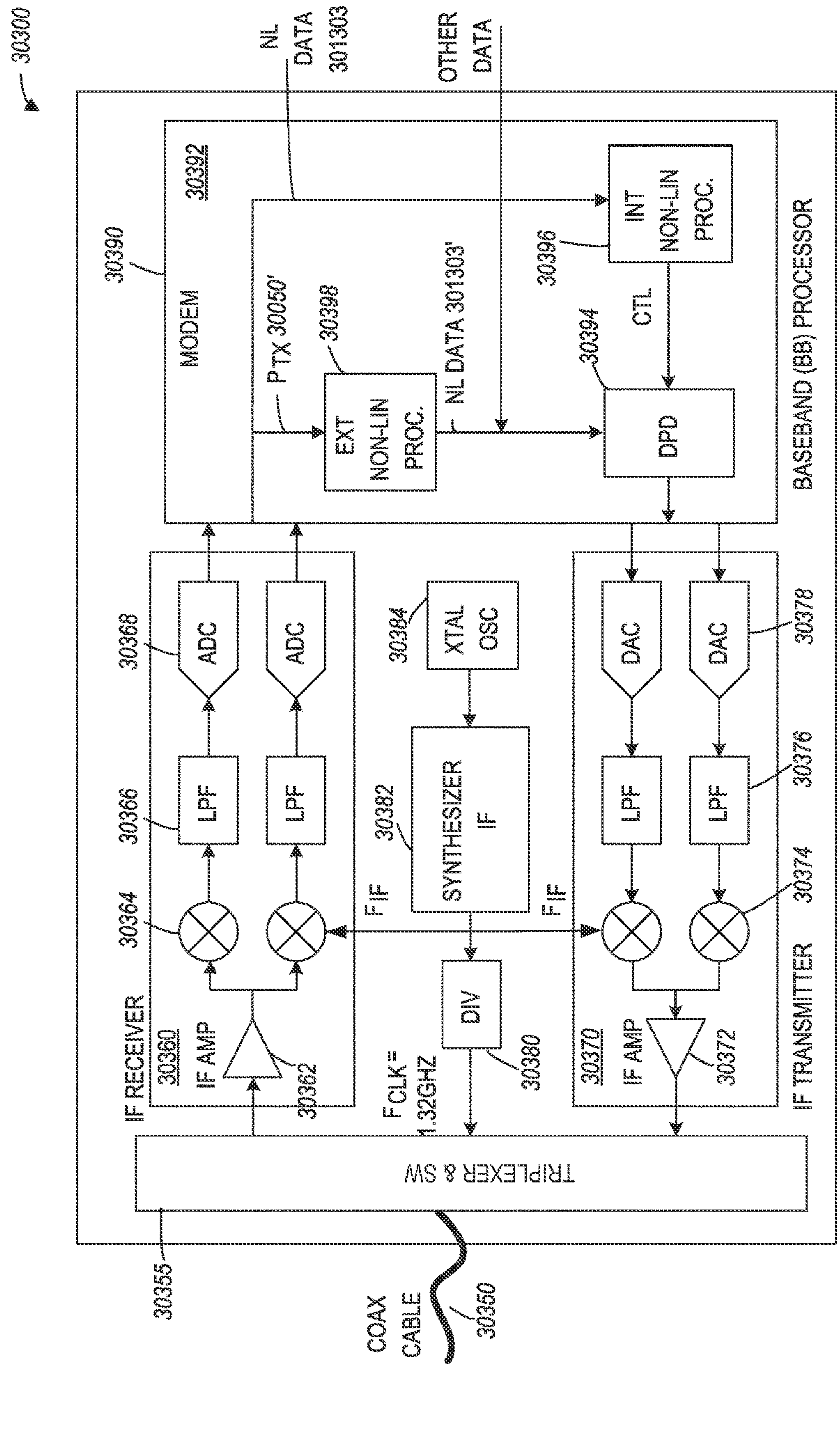

FIGS. 303A and 303B are parts of a block diagram of an overall transceiver example that may contain a transceiver portion, according to an exemplary aspect of the present disclosure.

Figure 304:
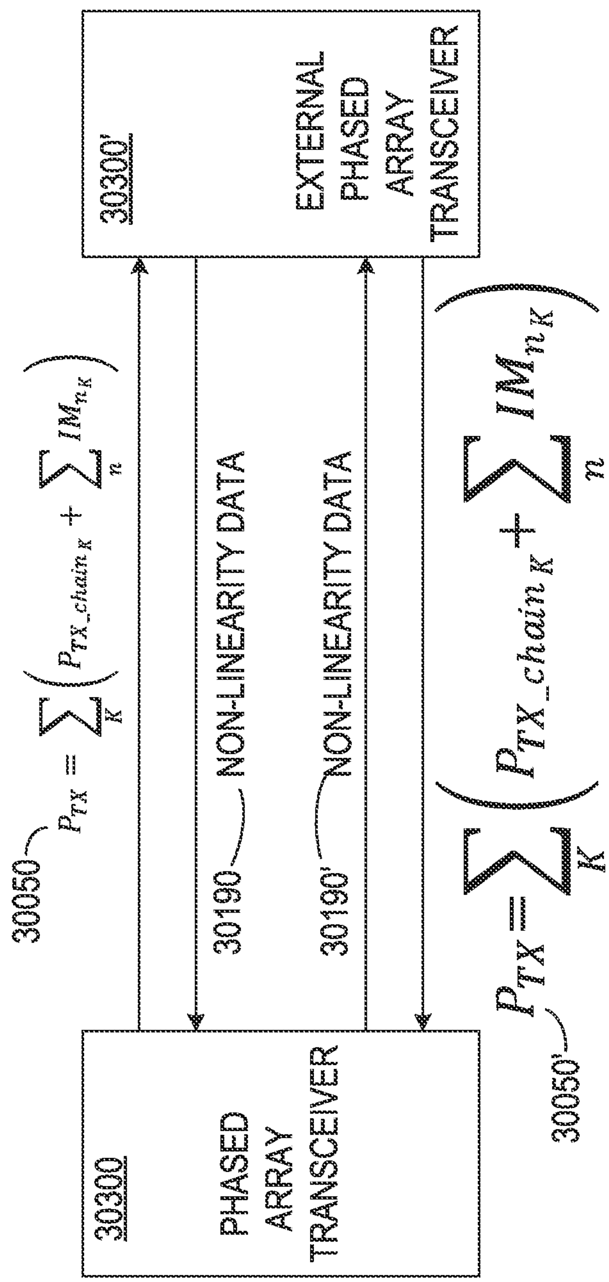

FIG. 304 is a block diagram illustrating the phased array transceiver that is in communication with an external phased array transceiver (EPAT), according to an exemplary aspect of the present disclosure.

Figure 305:
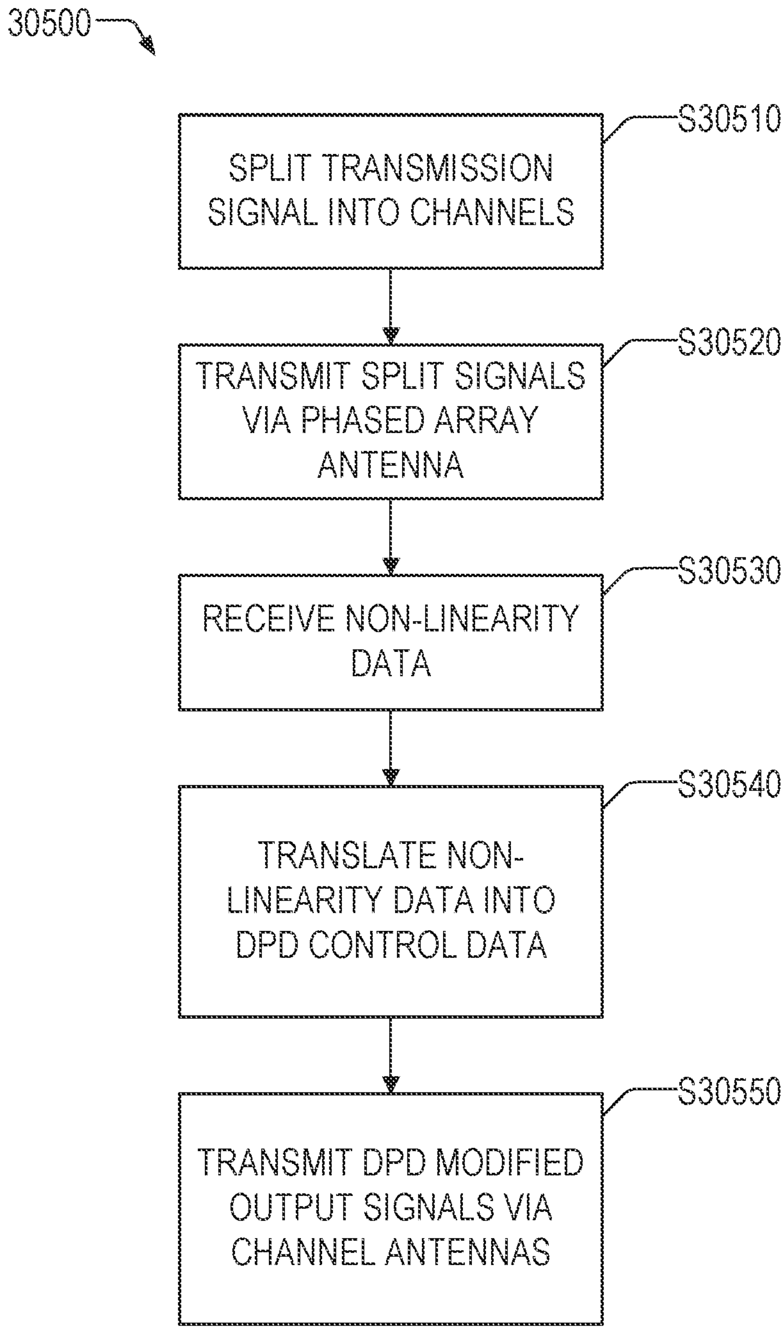

FIG. 305 is a flowchart illustrating an example of a process that may be used by the transceiver, according to an exemplary aspect of the present disclosure.

Figure 306:
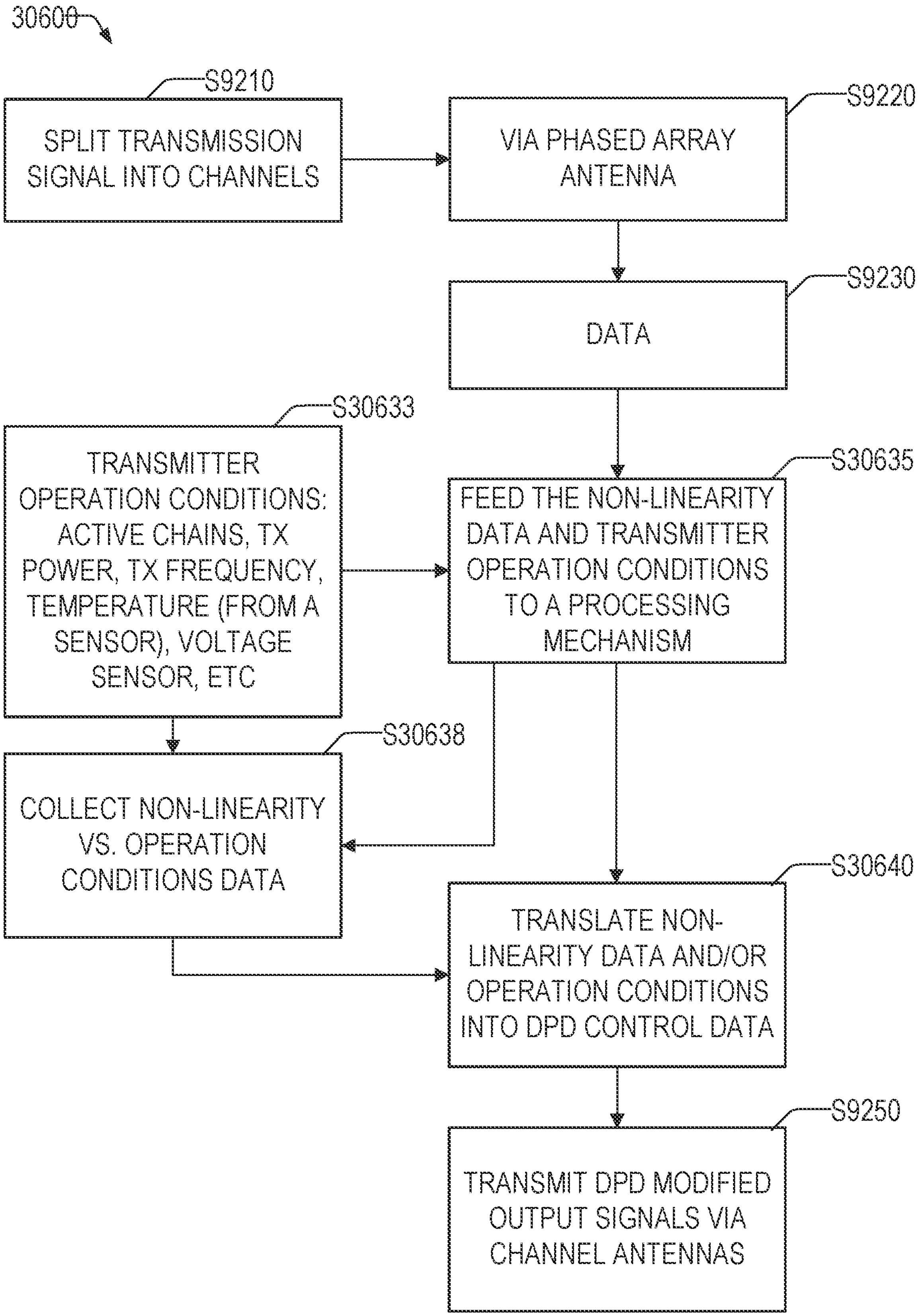

FIG. 306 is a flowchart illustrating another example of a process that may be used by the transceiver, according to an exemplary aspect of the present disclosure.

Figure 307A:
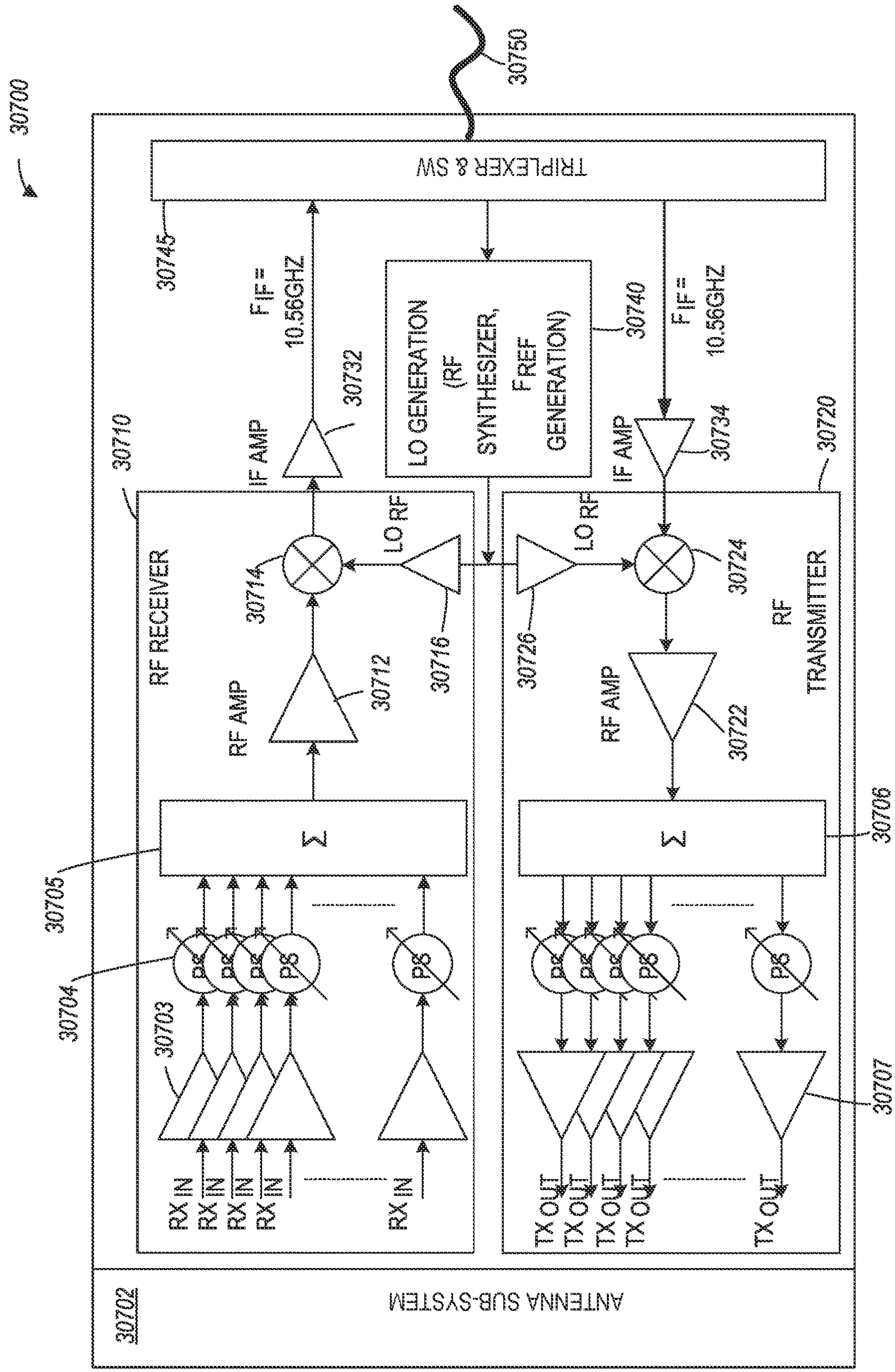
Figure 307B:
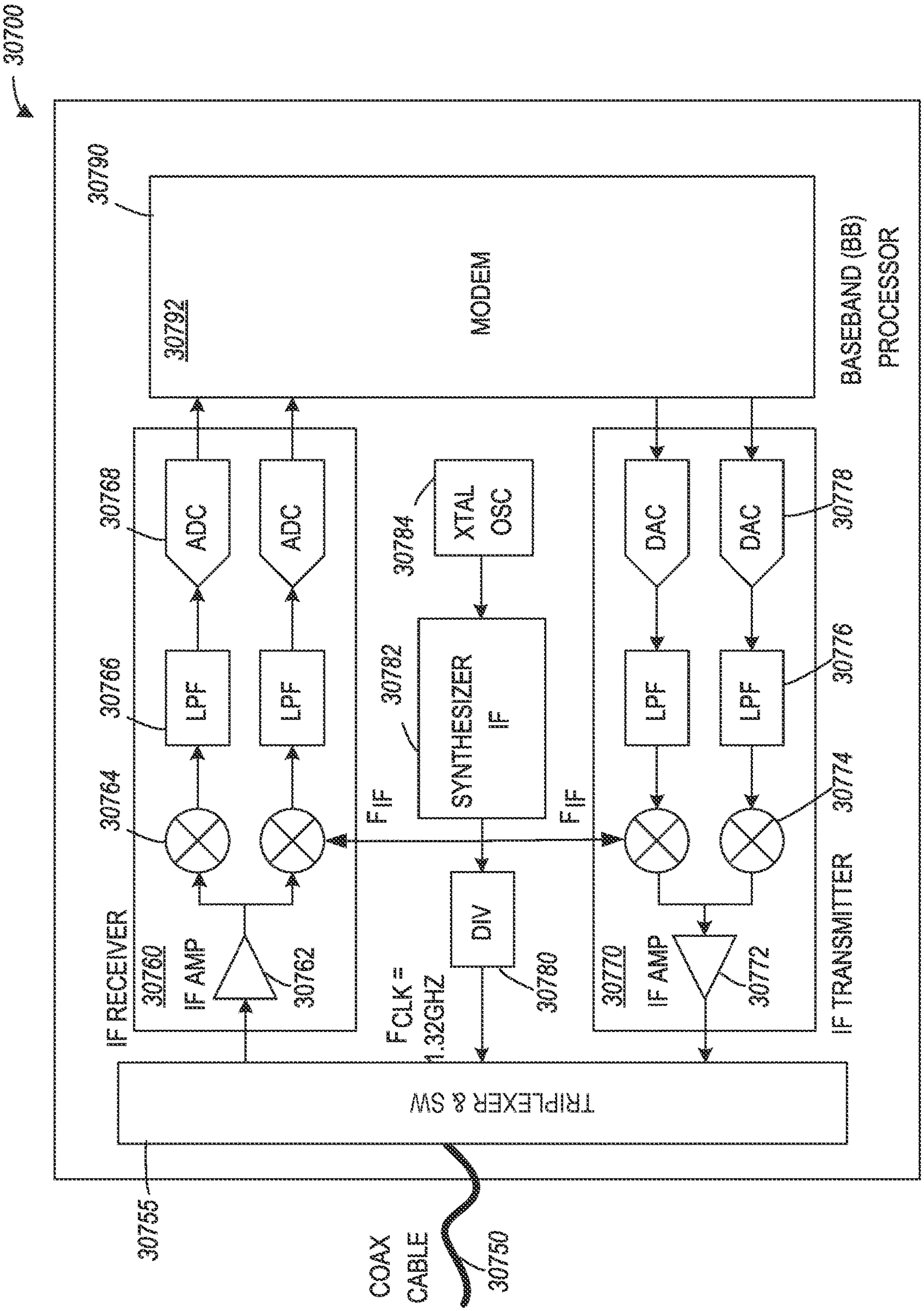

FIGS. 307A and 307B are parts of a block diagram of an example of an overall distributed phased array transceiver system, according to some aspects.

Figure 308:
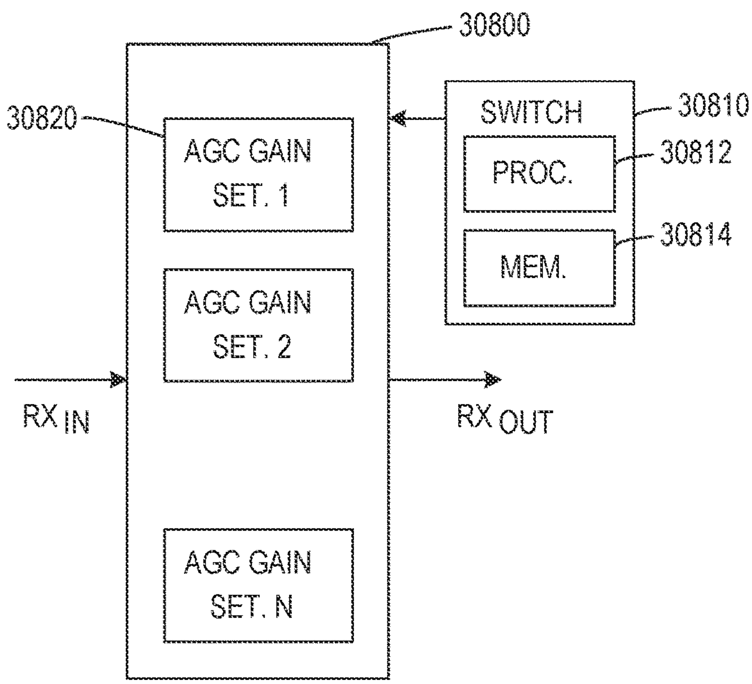

FIG. 308 is a block diagram of a receiver power amplifier according to some aspects.

Figure 309:
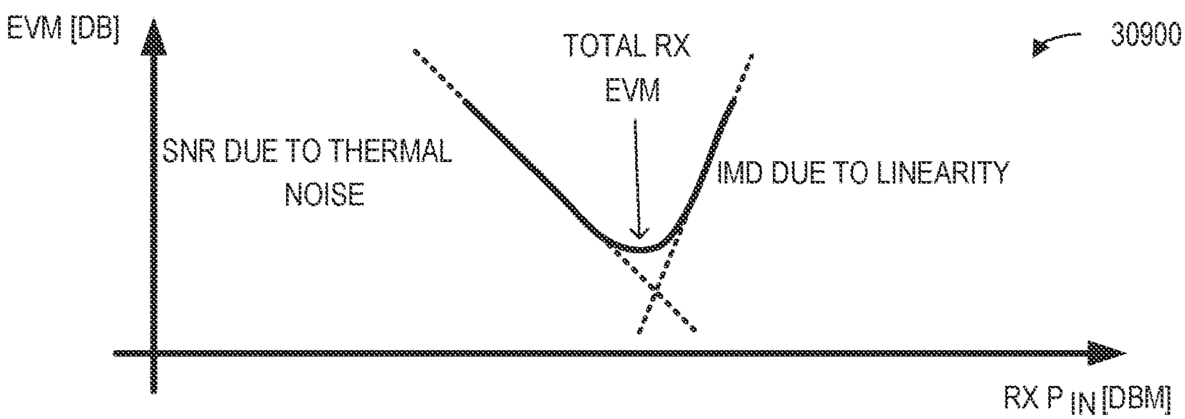

FIG. 309 is a graph that plots, for a given automatic gain control (AGC) gain setting, an EVM versus the received power according to some aspects.

Figure 310:
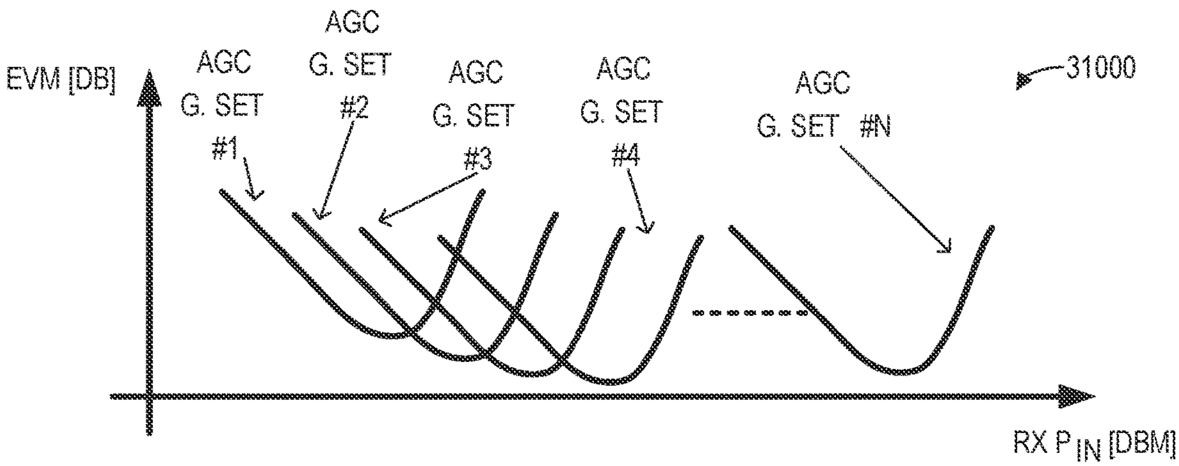

FIG. 310 is a graph that includes the EVM vs. receive power curve for a number of the AGC gain settings, where the AGC gain settings have degree of overlap with each other according to some aspects.

Figure 311:
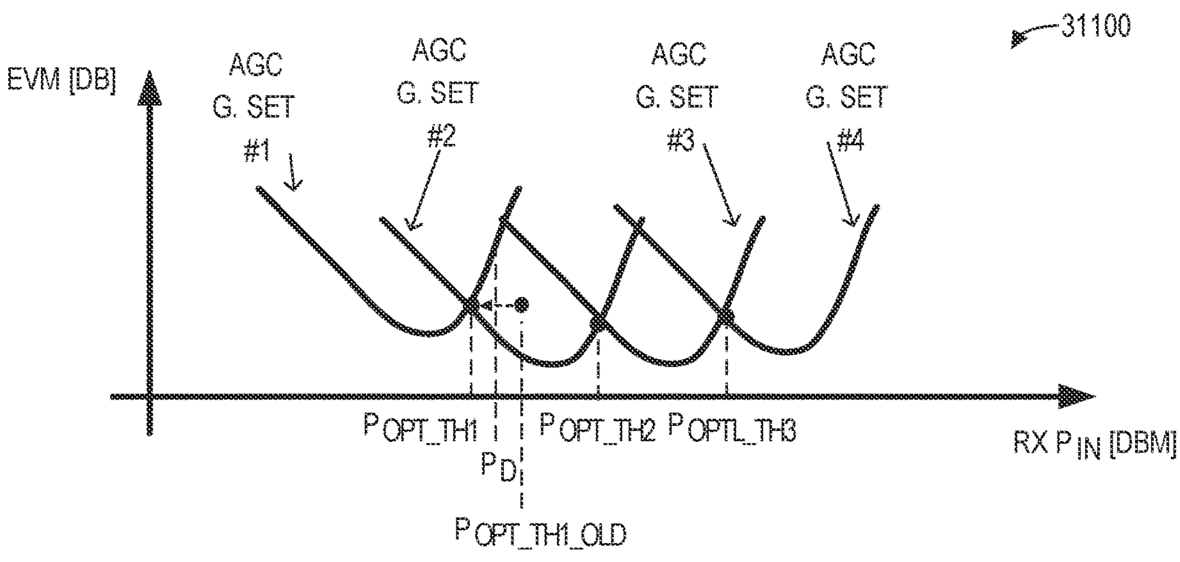

FIG. 311 is a graph illustrating optimal threshold values for activating a particular AGC gain setting according to some aspects.

Figure 312:
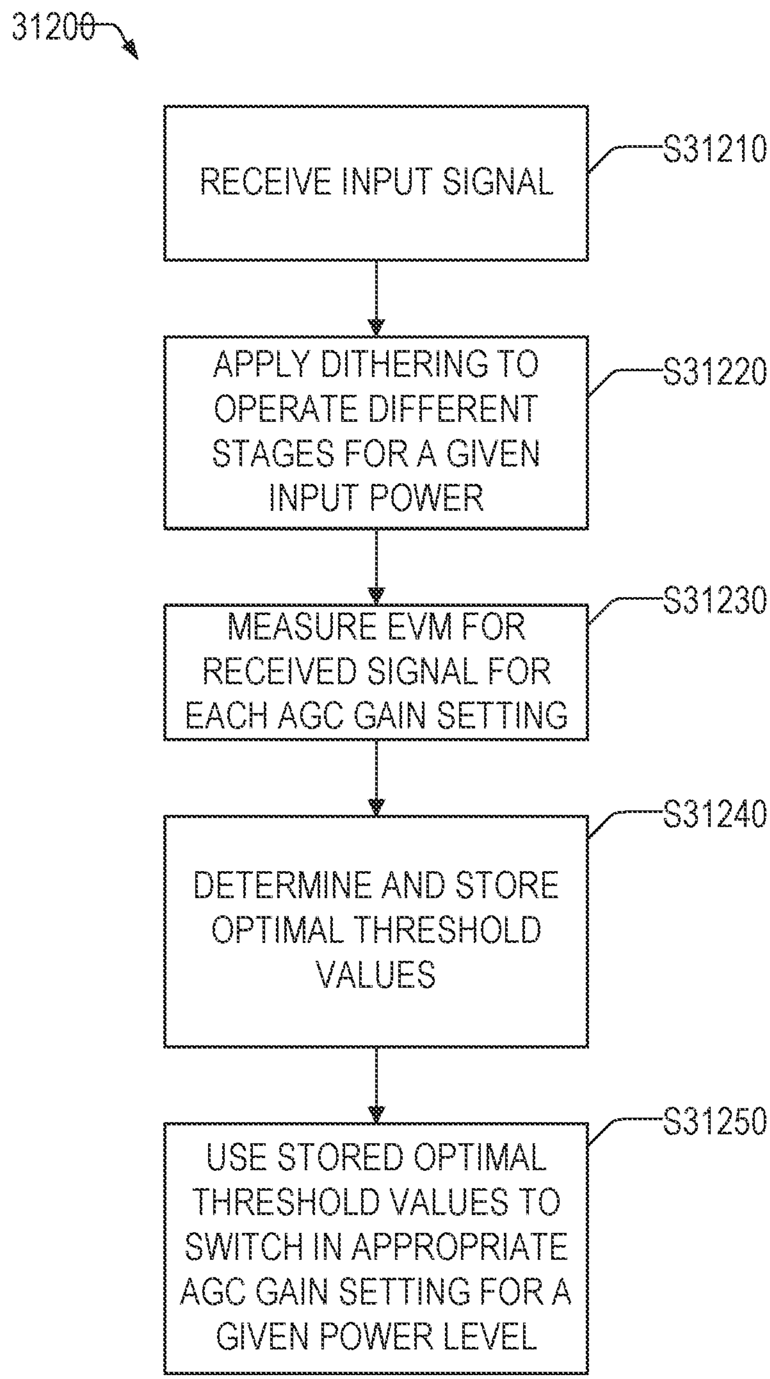

FIG. 312 is a flowchart illustrating an example process that may be utilized to determine the optimal threshold values according to some aspects.

Figure 313:
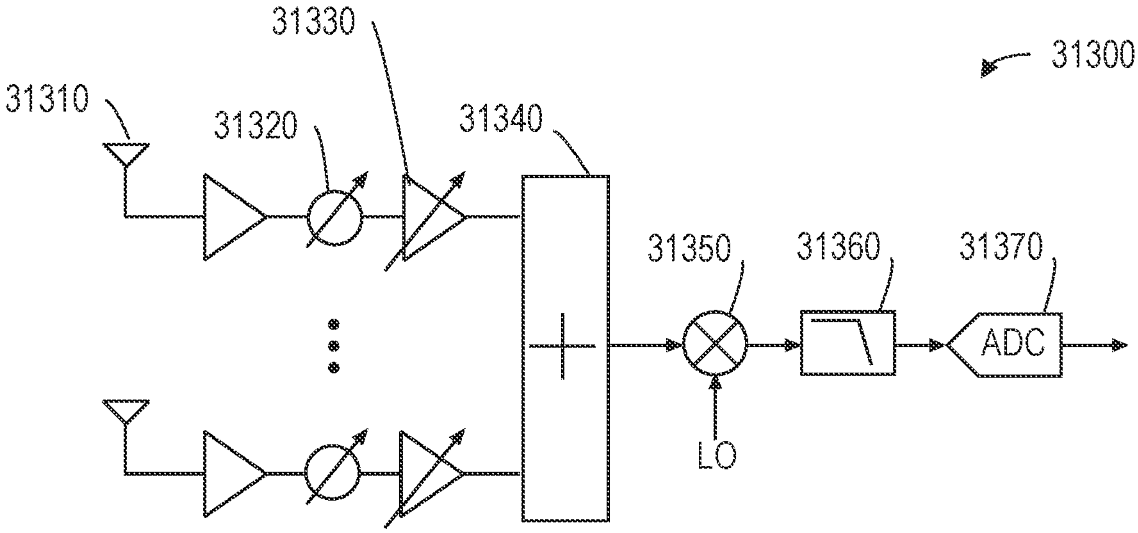

FIG. 313 is a block schematic diagram of a radio frequency (RF) phased array system according to some aspects.

Figure 314:
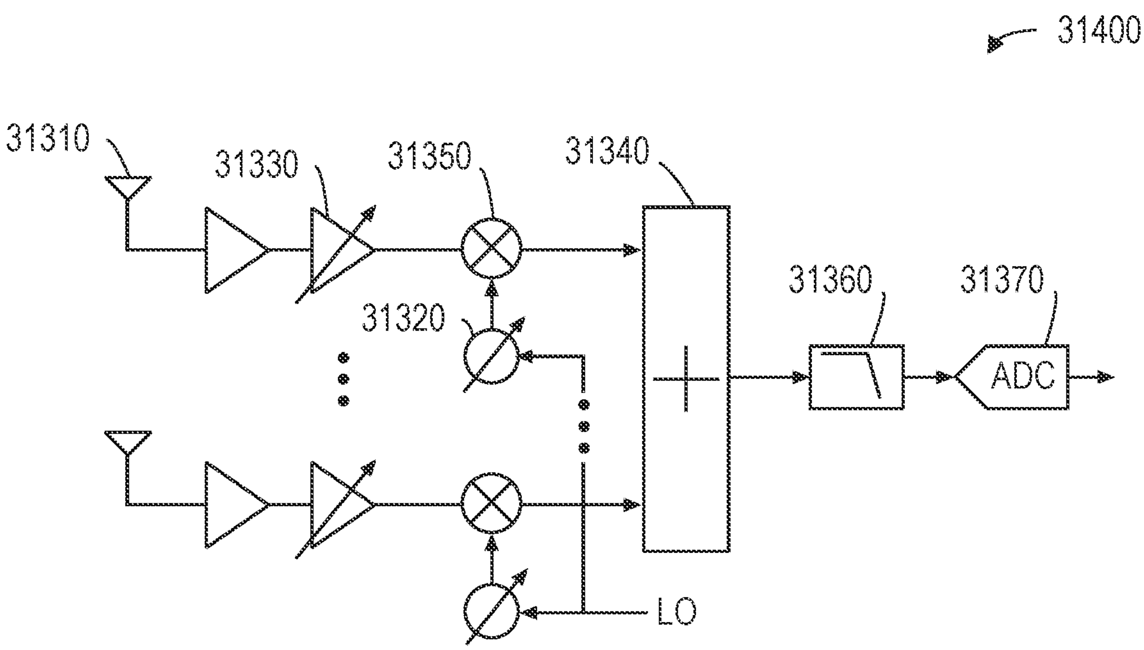

FIG. 314 is a block schematic diagram illustrating another topology of a phased array radio transceiver that is referred to as a local oscillator (LO) phased array system according to some aspects.

Figure 315:
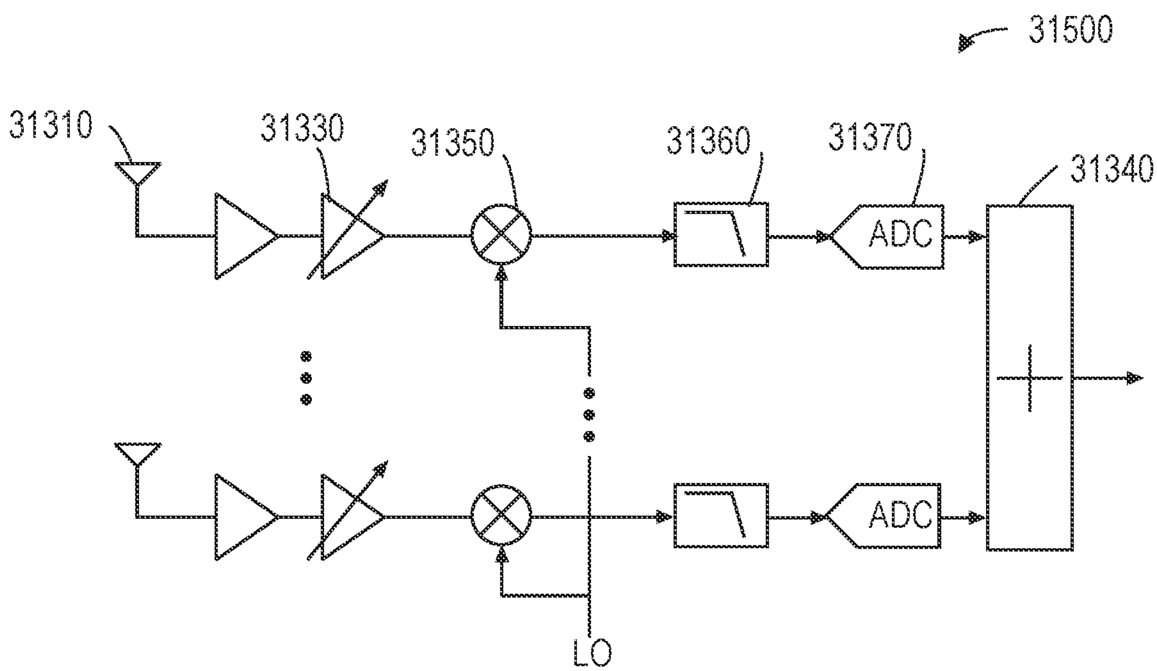

FIG. 315 is a block schematic diagram illustrating a third alternative to phased array radio transceiver design according to some aspects and is referred to as a digital phased array system.

Figure 316:
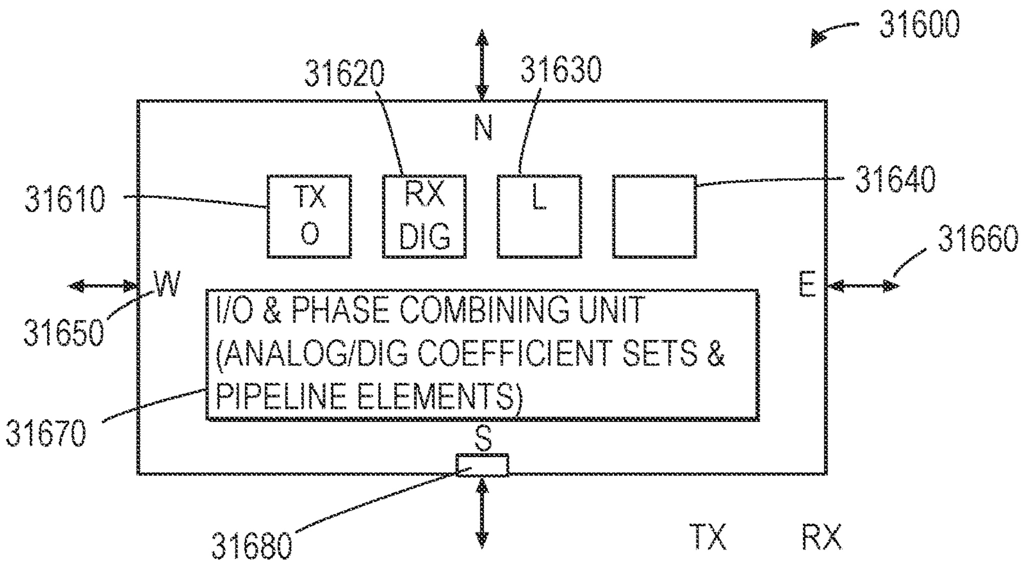

FIG. 316 is a block diagram of an example cell element of the SPARTA array, according to some aspects.

Figure 317:
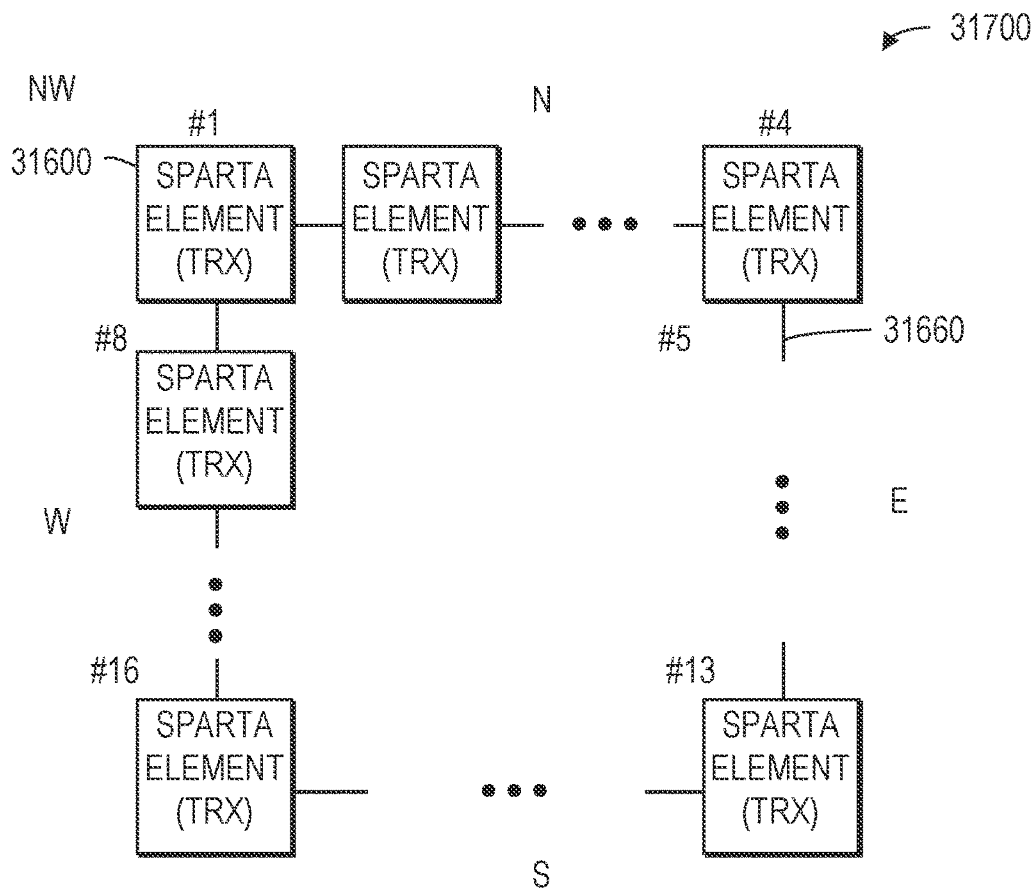

FIG. 317 is a block diagram illustrating tiled SPARTA cells according to some aspects.

Figure 318:
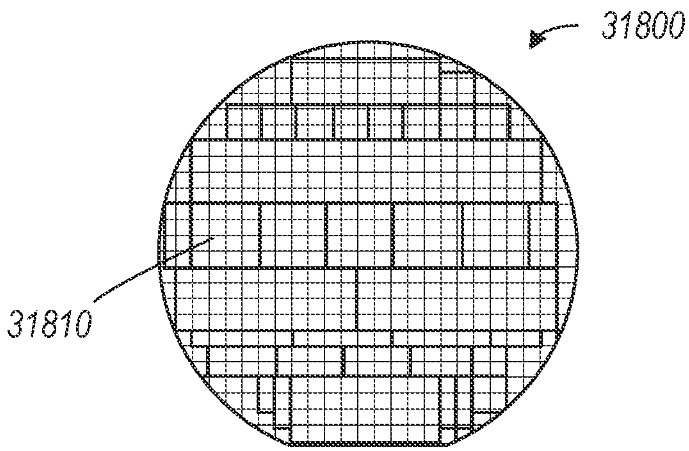
Figure 319:
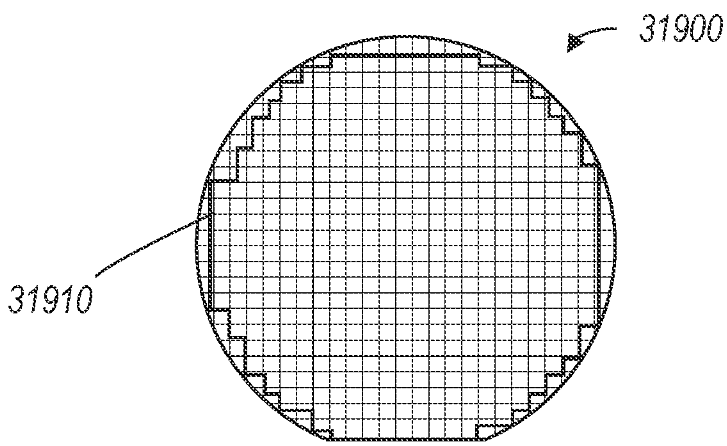

FIGS. 318 and 319 are pictorial diagrams of wafer dicing according to some aspects.

Figure 320:
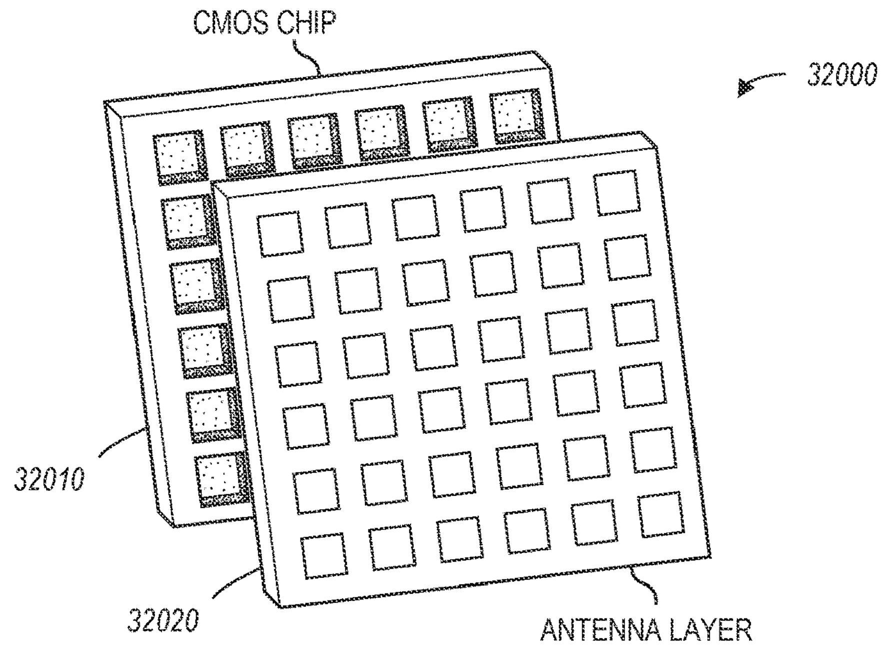

FIG. 320 is a pictorial illustration of a combined SPARTA array that may be wafer processed and combined with an antenna array according to some aspects.

Figure 321:
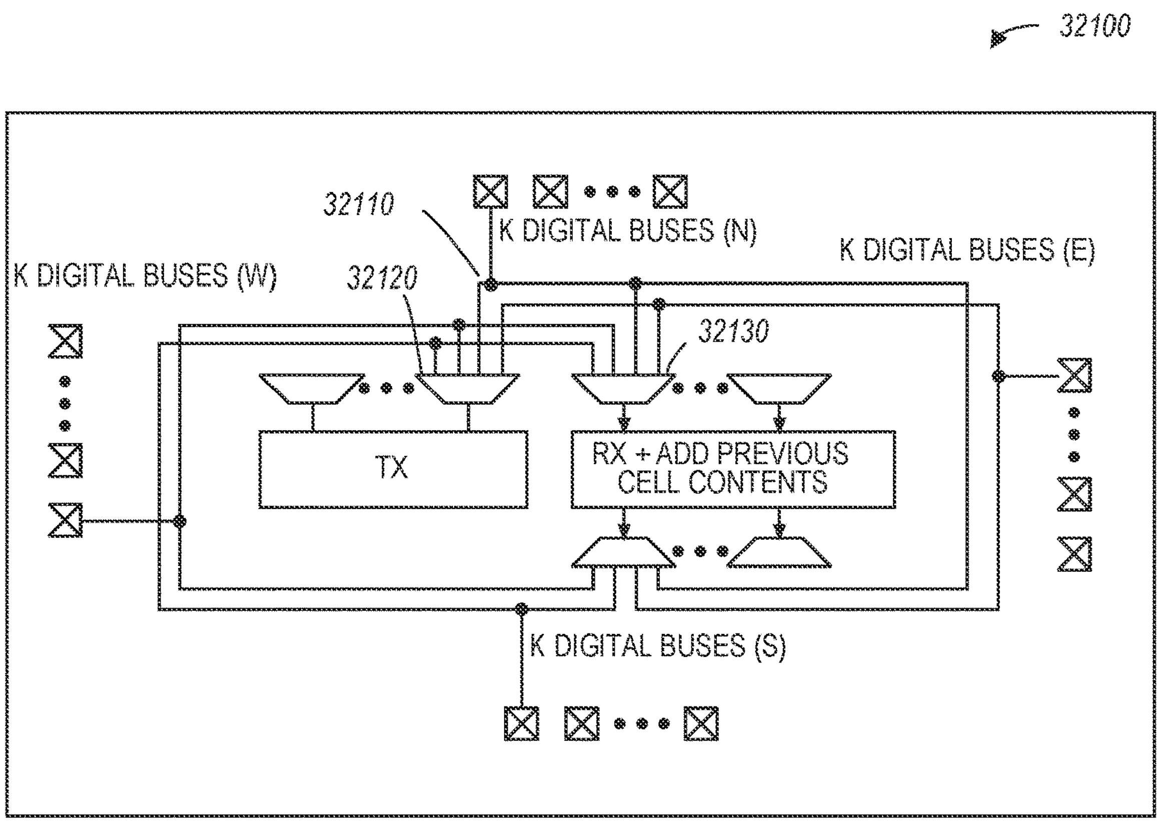

FIG. 321 is a block diagram illustrating A SPARTA cell (which may be an implementation of the SPARTA cell) that may be used for digital phase array tiling according to some aspects.

Figure 322:
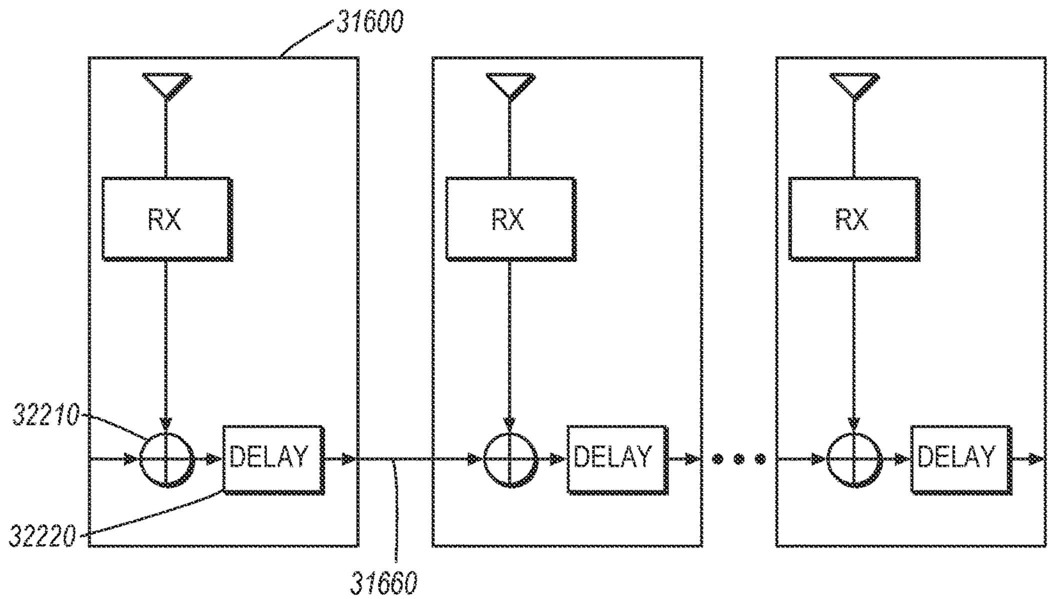

FIG. 322 is a block diagram that illustrates LO phased array pipelining between adjacent cells in the LO phase combining mode according to some aspects.

Figure 323:
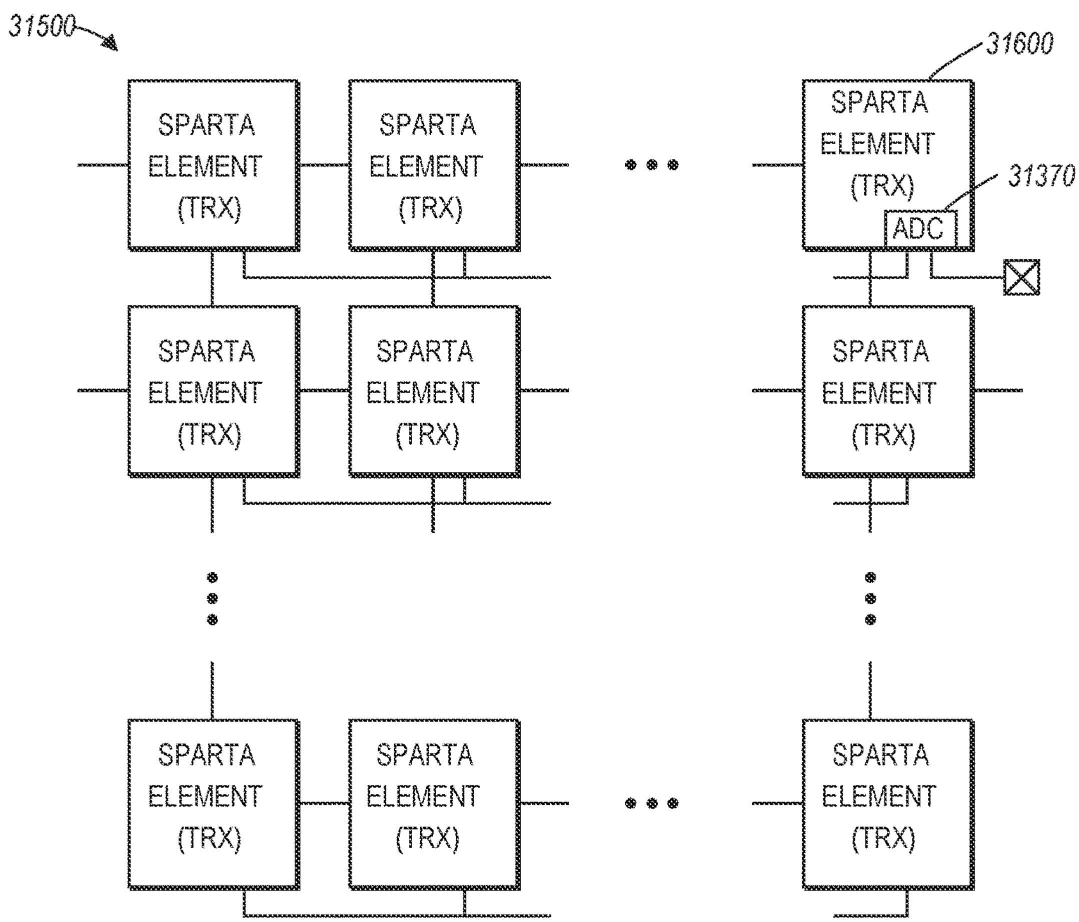

FIG. 323 is a block diagram illustrating the SPARTA cell tiling using an LO phase array and illustrating active data converter ADC according to some aspects.

Figure 324:
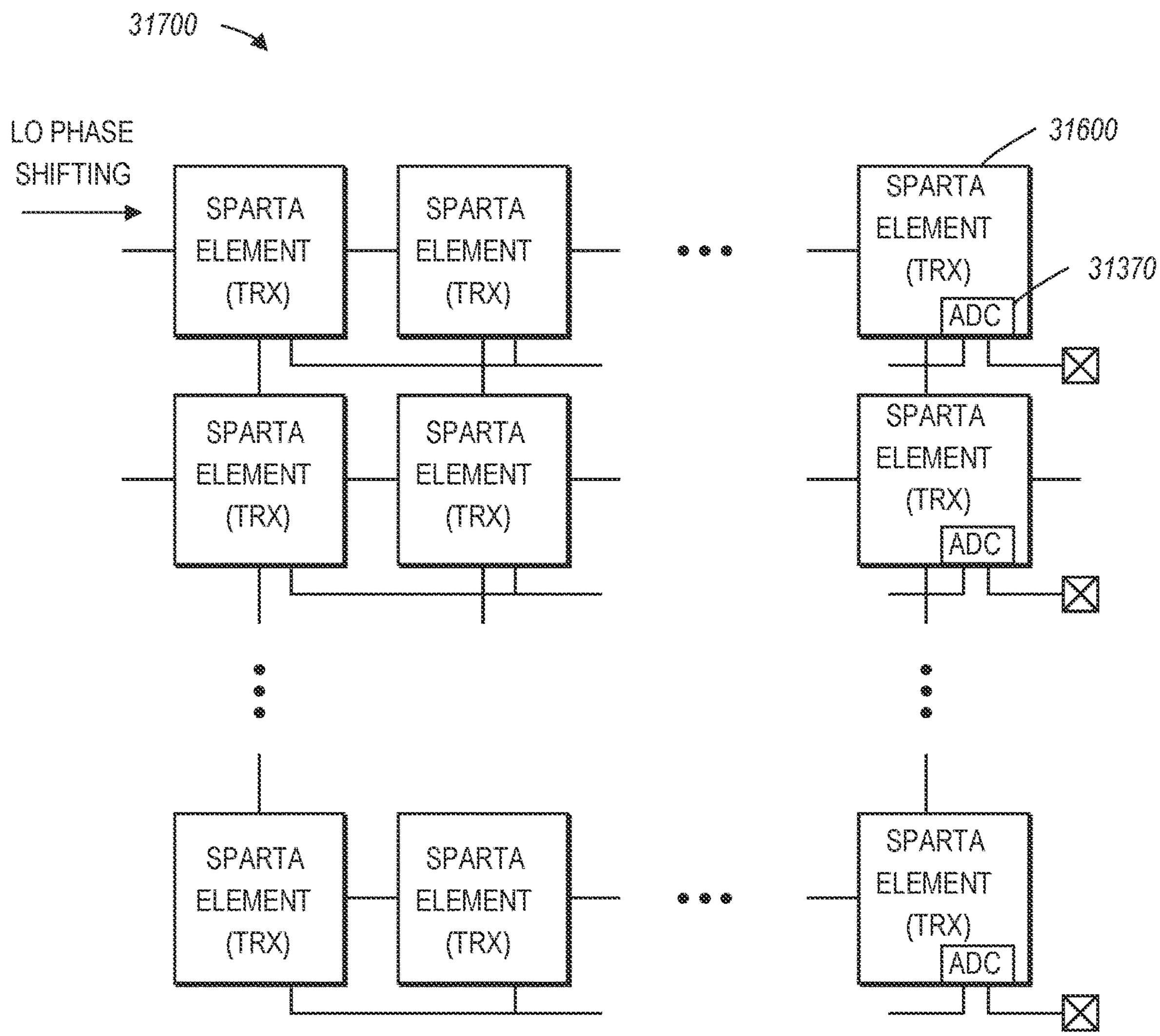

FIG. 324 is a block diagram that illustrates a SPARTA array in hybrid mode, where each row is tiled in an LO phase shifting and sharing a single ADC according to some aspects.

Figure 325:
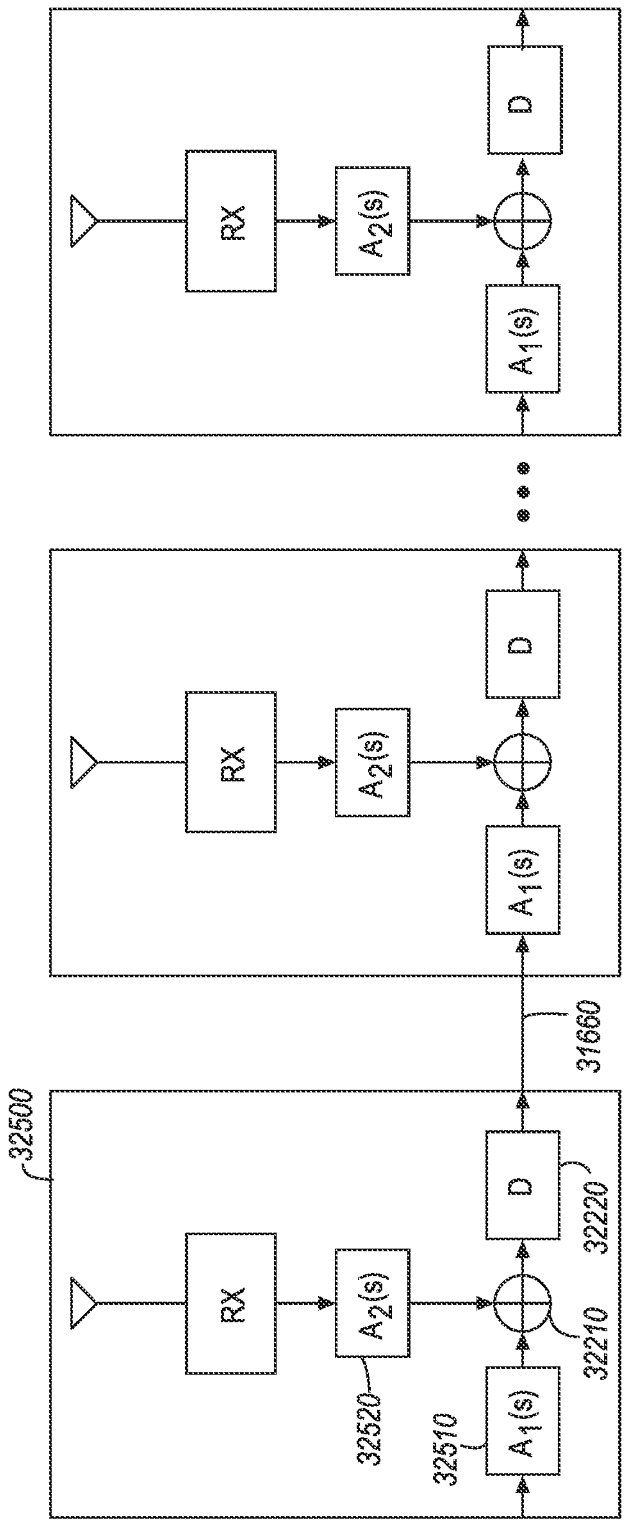

FIG. 325 is a block diagram illustrating pipelining of the analog phased array combining between adjacent cells for the analog phased array combining operation mode according to some aspects.

Figure 326:
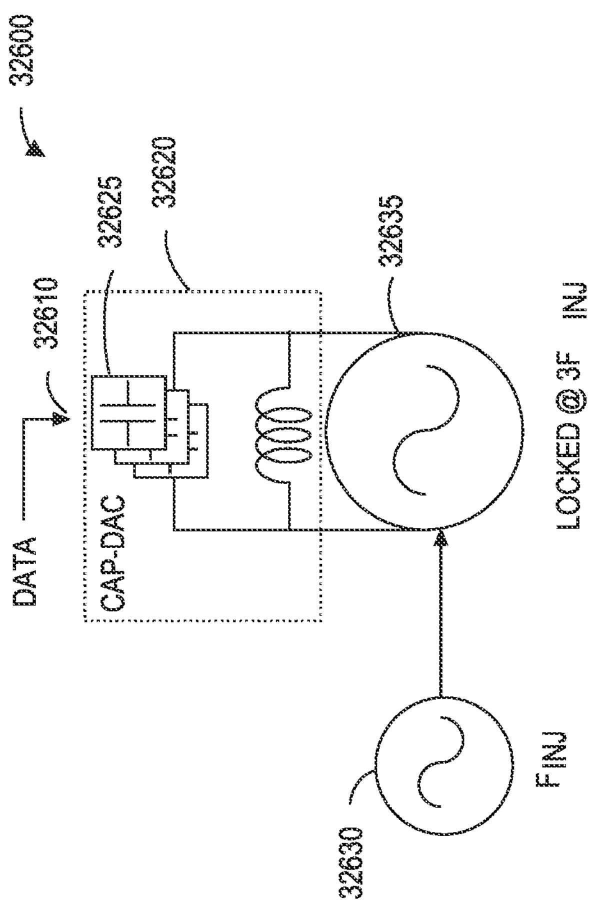

FIG. 326 is a schematic diagram illustrating components for Injection-locked (IL)-based phase modulation circuit, according to some aspects, which exploits phase shift characteristics of a conventional locked oscillator.

Figure 327:
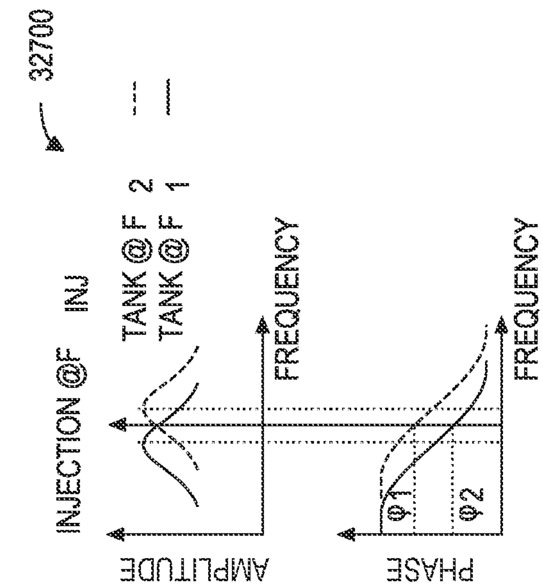

FIG. 327 is a graph that illustrates how, as a center frequency of the oscillator is changed with respect to the locking frequency, the output phase and amplitude change, while still being locked to the injection frequency, according to some aspects.

Figure 328:
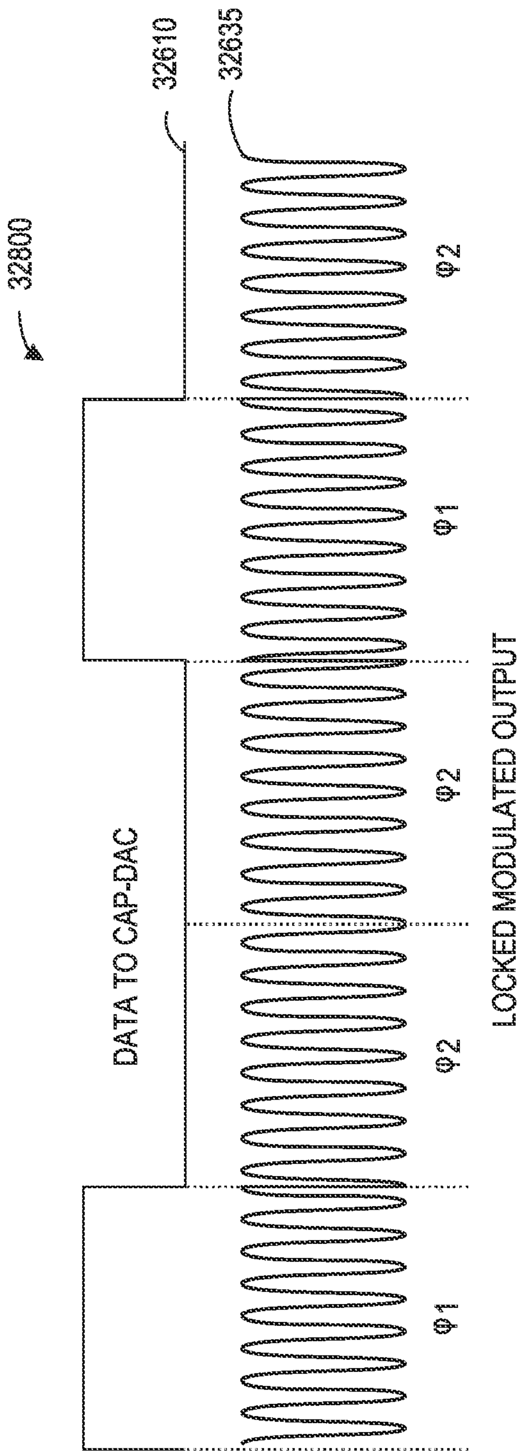

FIG. 328 is a timing graph illustrating two symbols with phases φ1 and φ2 being generated by controlling the cap-DAC with baseband modulation bits as the data input, according to some aspects.

Figure 329:
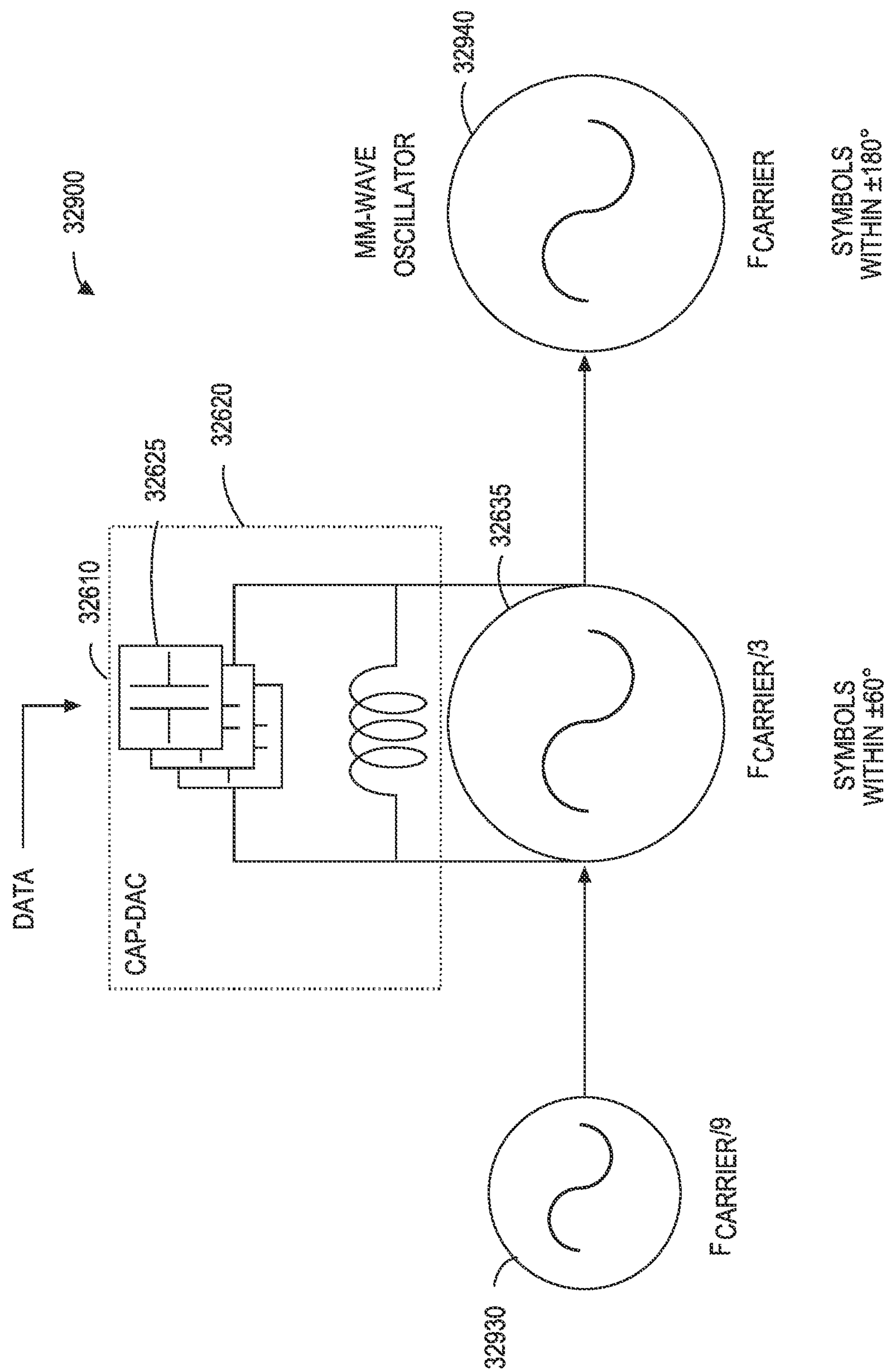

FIG. 329 is a block diagram for an IL-based phase modulation circuit with a full 360° phase modulation using a cascaded sub-harmonic injection-locked architecture with respect to the carrier frequency, according to some aspects.

Figure 330:
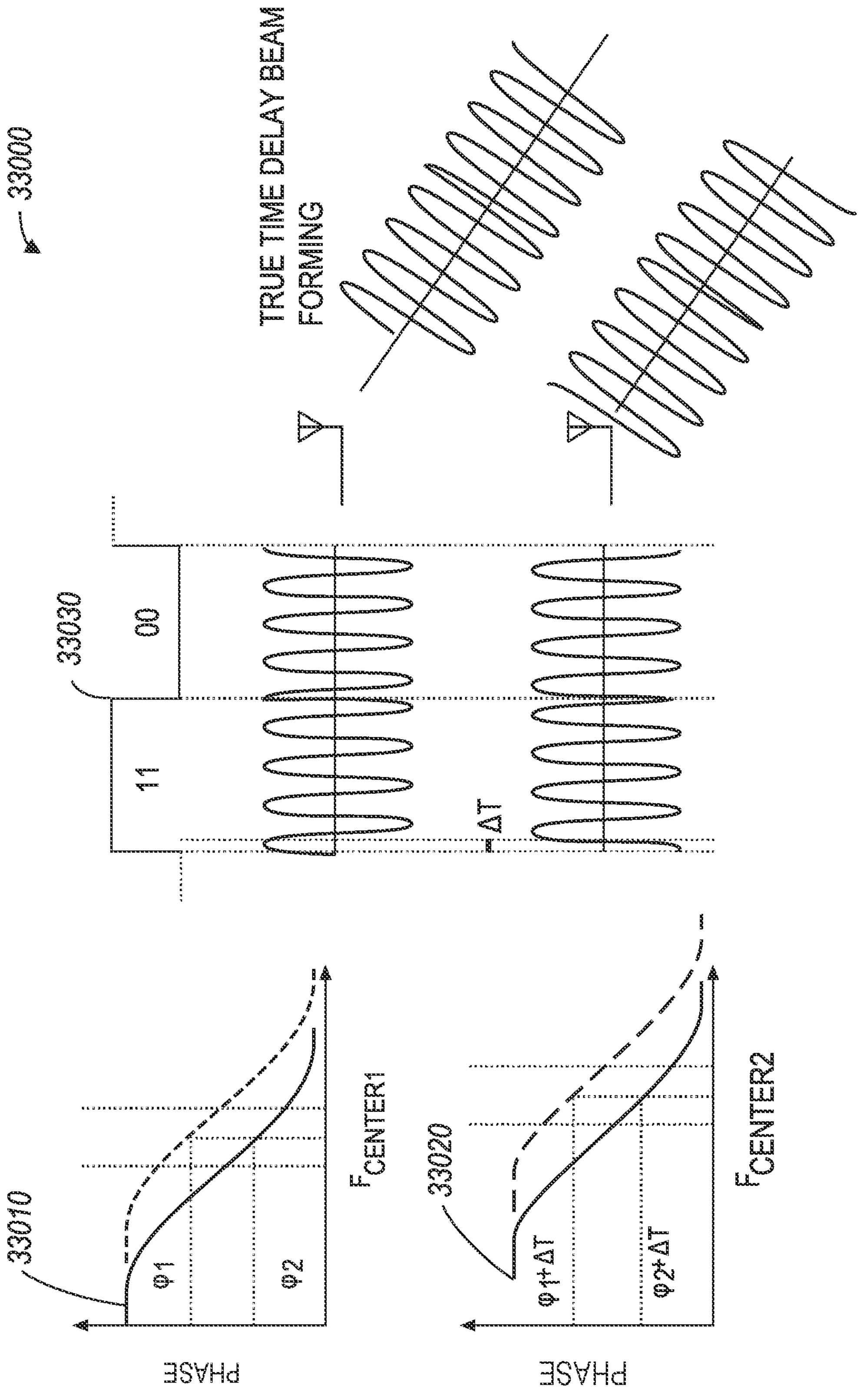

FIG. 330 is a combination graph that illustrates a true time delay-based beam forming in which elements one and two are being fed the same baseband data signals ("11", "00") at two different offsets, according to some aspects.

Figure 331:
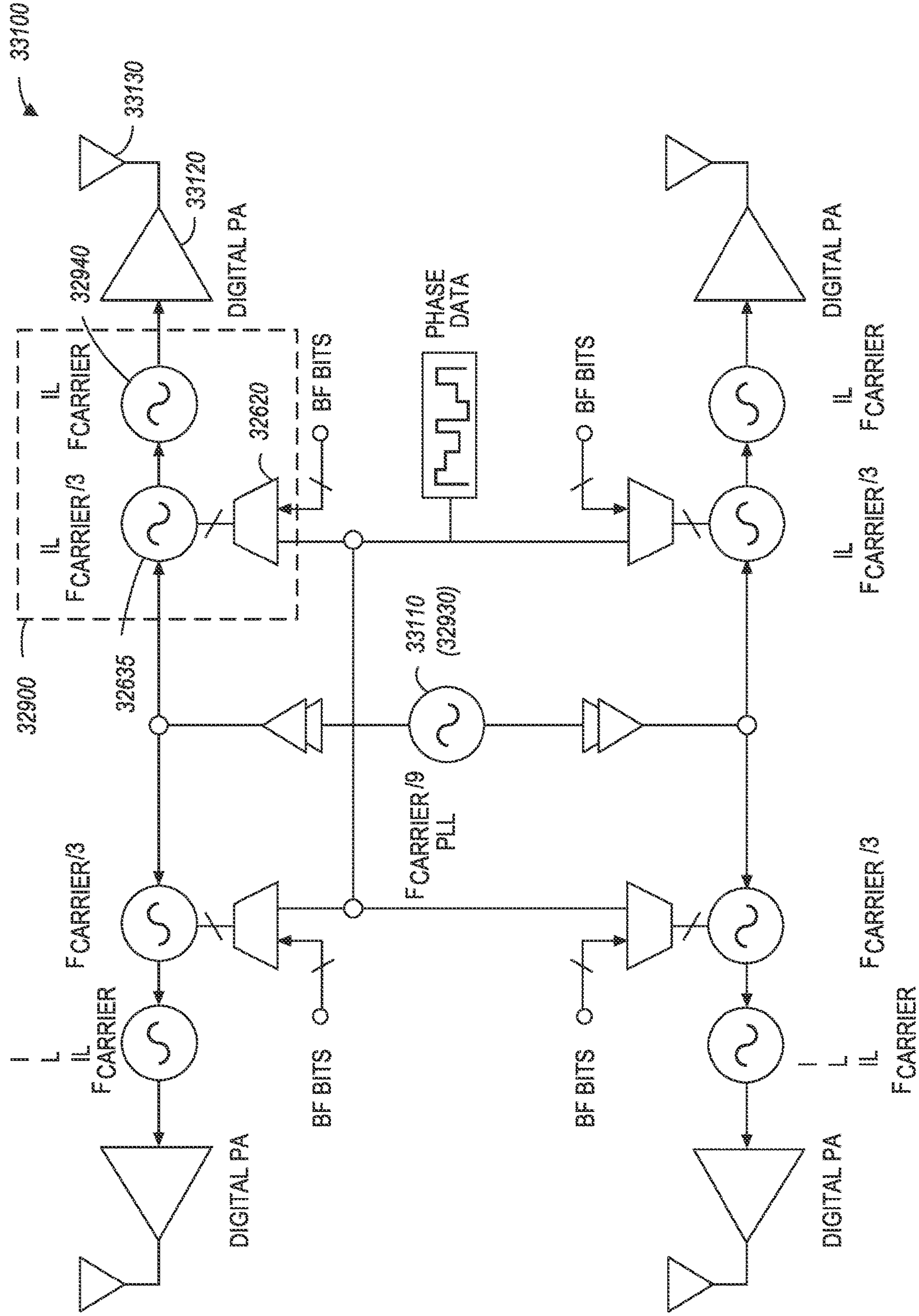

FIG. 331 is a schematic block diagram illustrating an example architecture of a four-element phased array transmitter that implements combining harmonic IL based phase modulation with true time delay beam-forming, according to some aspects.

Figure 332:
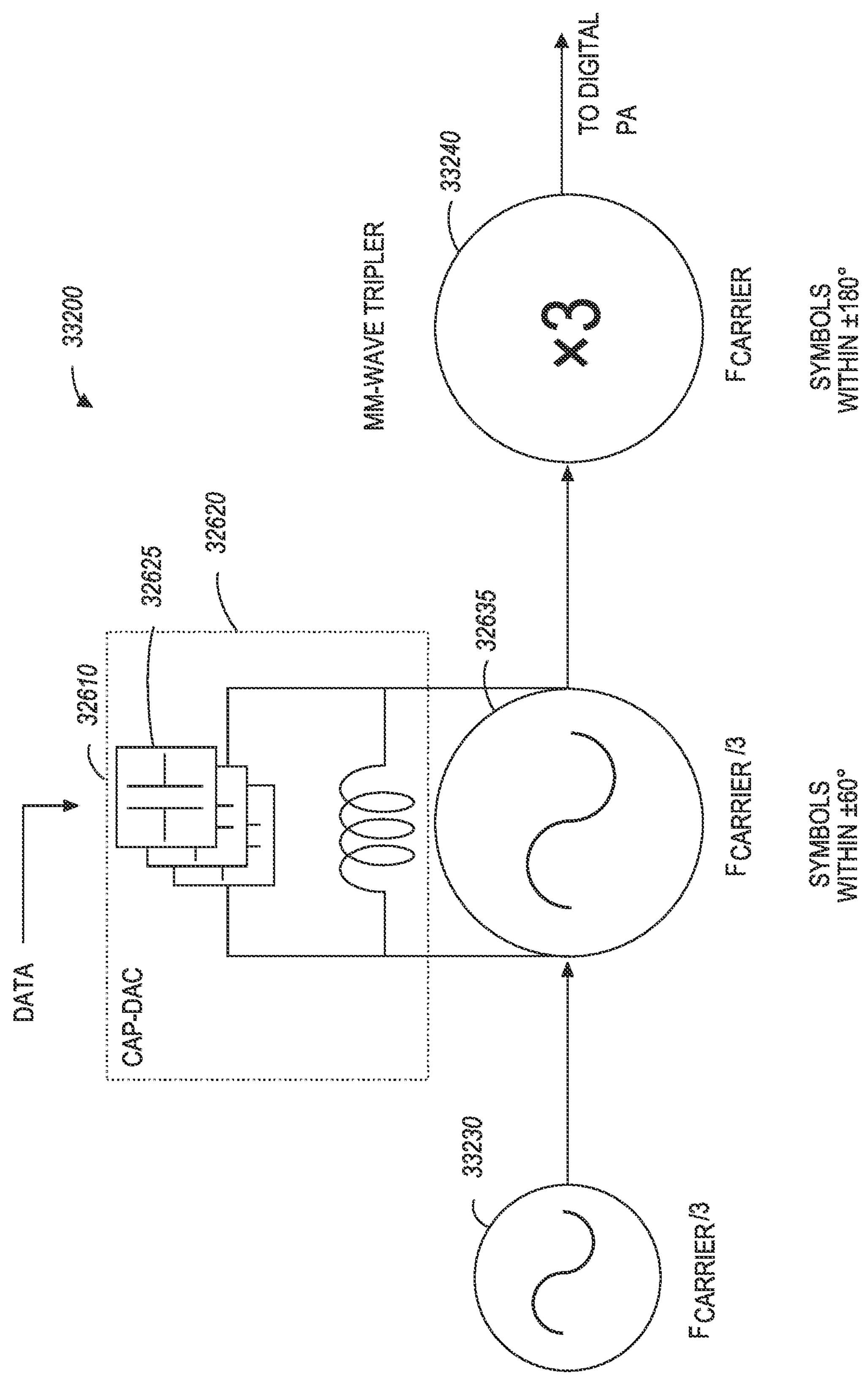

FIG. 332 is a block diagram for an IL-based phase modulation circuit illustrating an example of an injection-locked oscillator at operating at ⅓ of the carrier frequency, according to some aspects.

Figure 333:
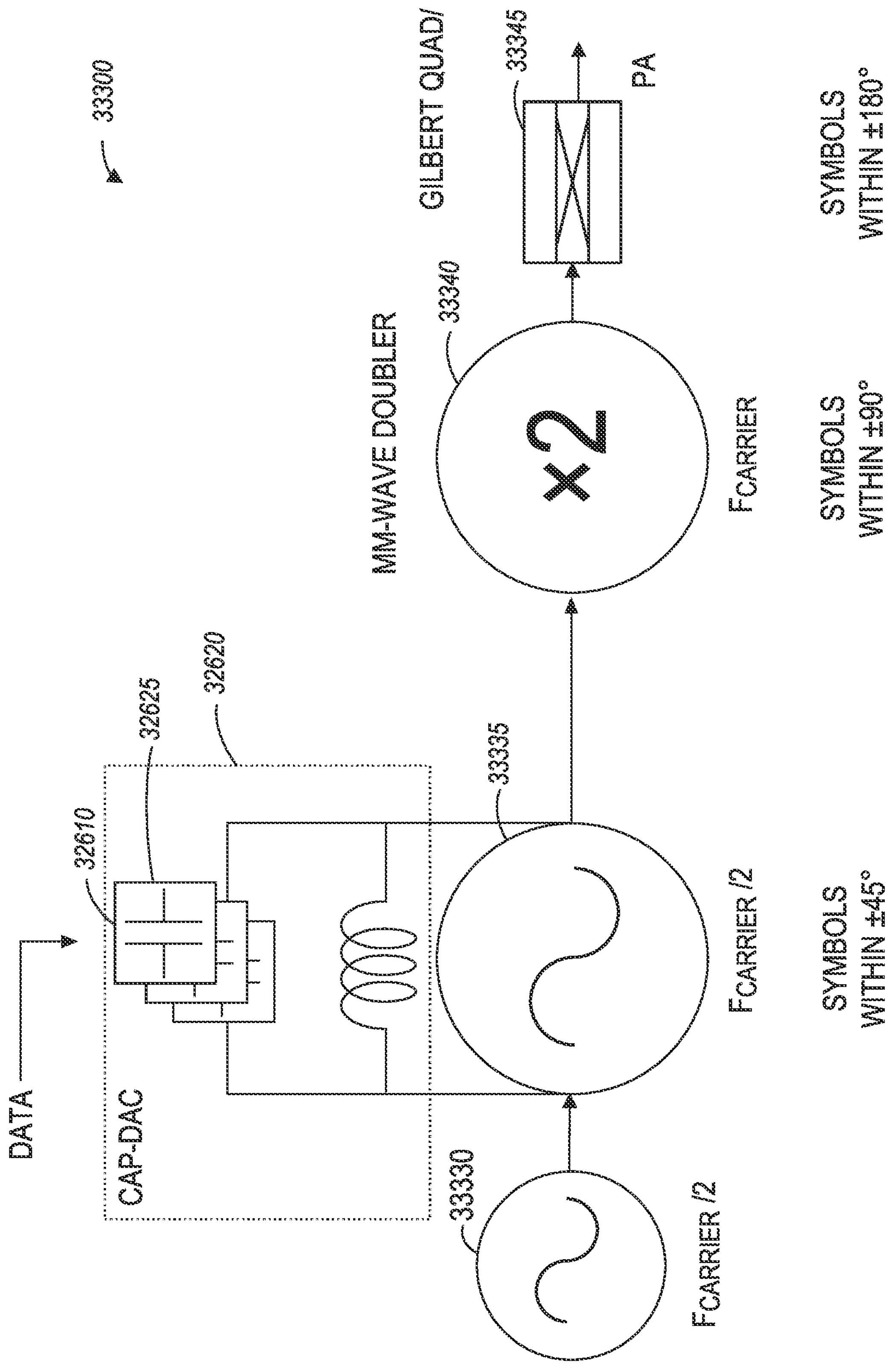

FIG. 333 is a block diagram for an IL-based phase modulation circuit illustrating an example of an injection-locked oscillator at operating at ½ of the carrier frequency, according to some aspects.

Figure 334:
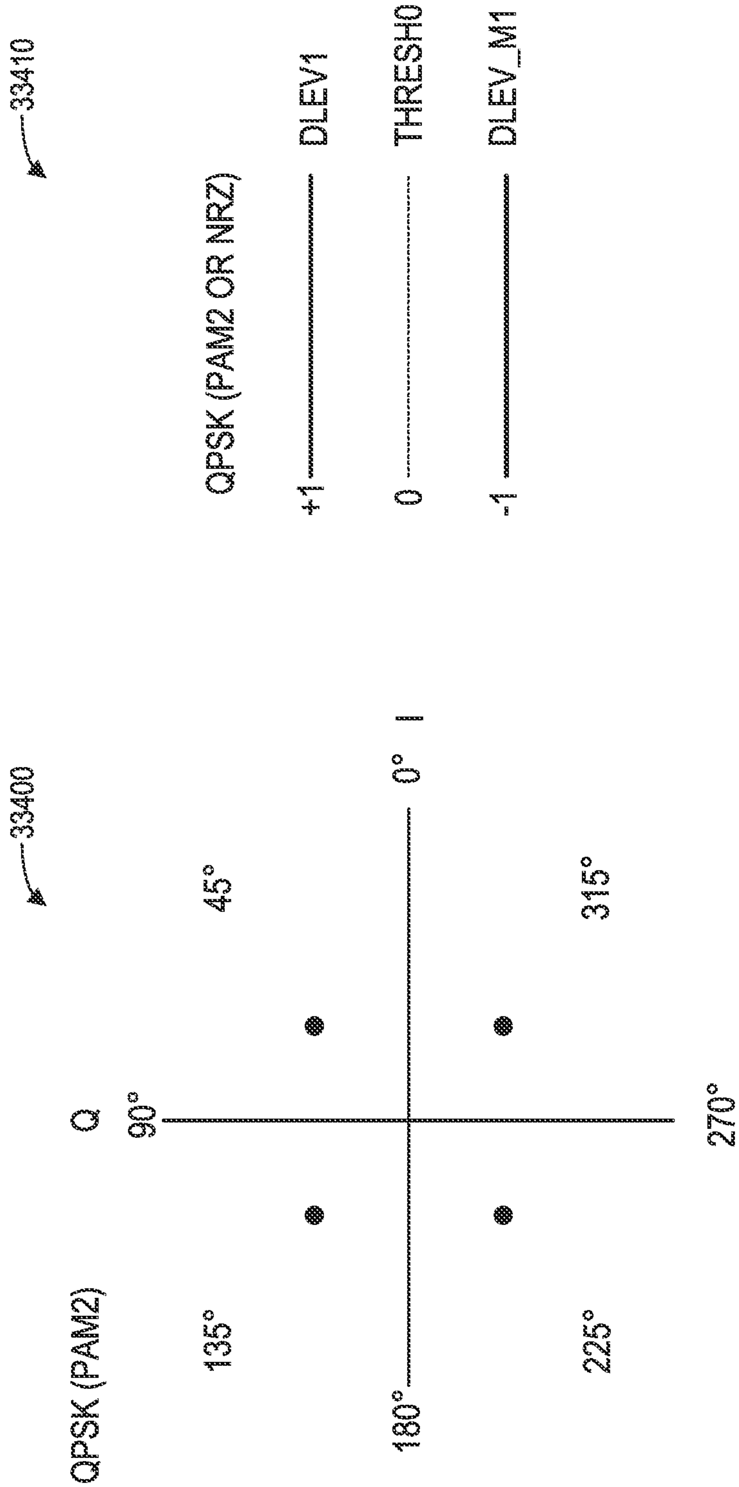

FIG. 334 is a pictorial diagram that illustrates quadrature phase-shift keying (QPSK) (PAM2-wireline-based) modulation (two bits per symbol) with a graph that is a constellation map illustrating the I/Q values that are possible, according to some aspects.

FIG. 335 is a pictorial diagram that illustrates a 16-QAM (PAM4-wireline-based) modulation (four bits per symbol) with a graph that is a constellation map illustrating the I/Q values that are possible, according to some aspects.

Figure 336:
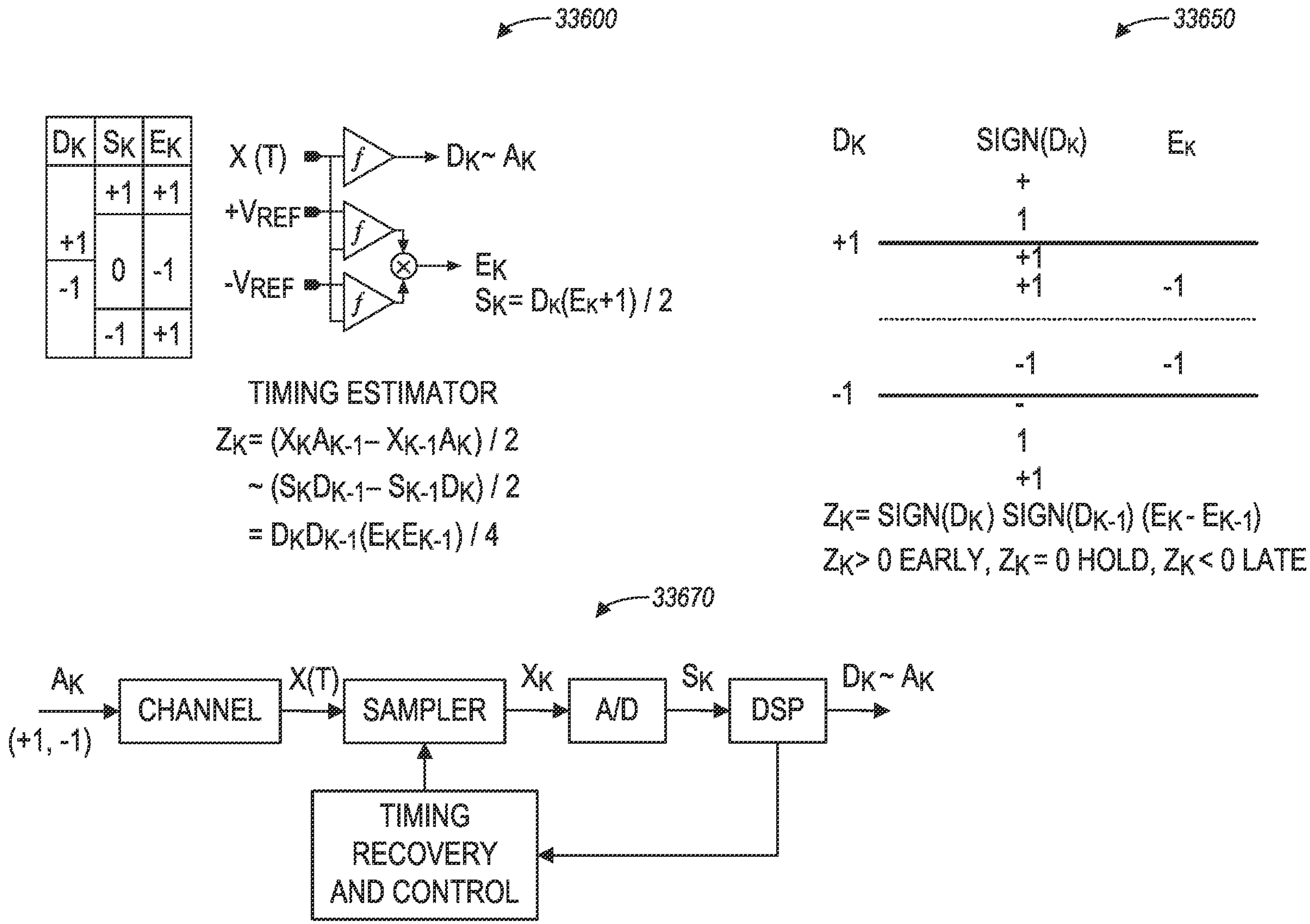

FIG. 336 is a pictorial diagram of a design for PAM2 (QPSK) modulation, according to some aspects.

Figure 337:
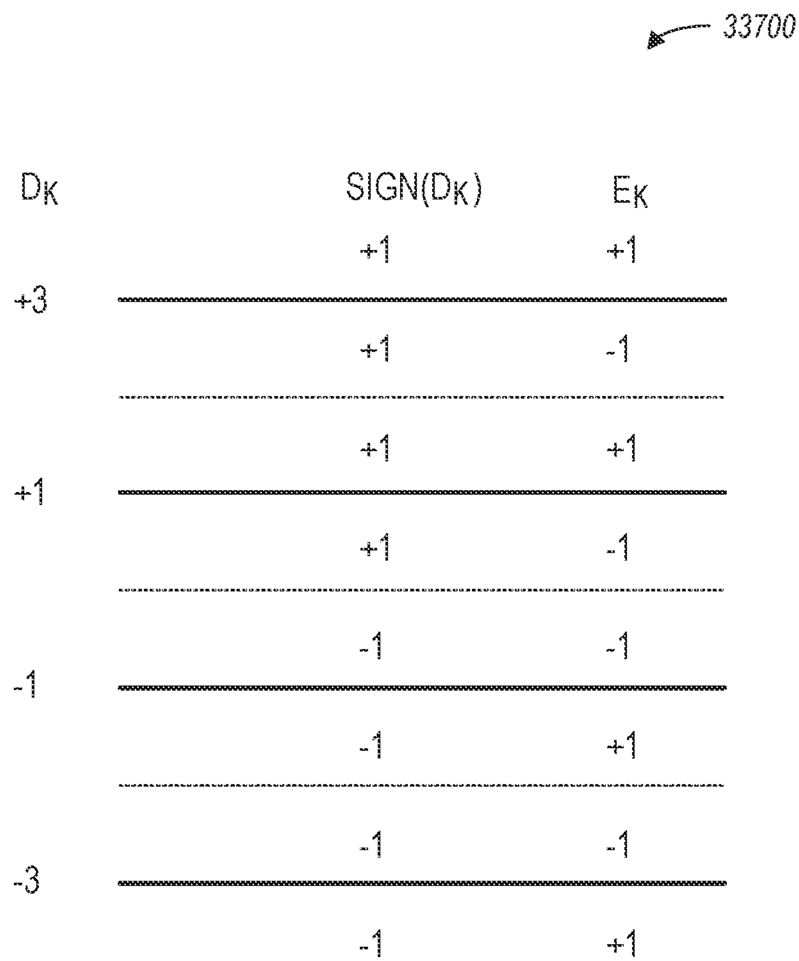

FIG. 337 is a table of data and error values provided according to some aspects.

Figure 338:
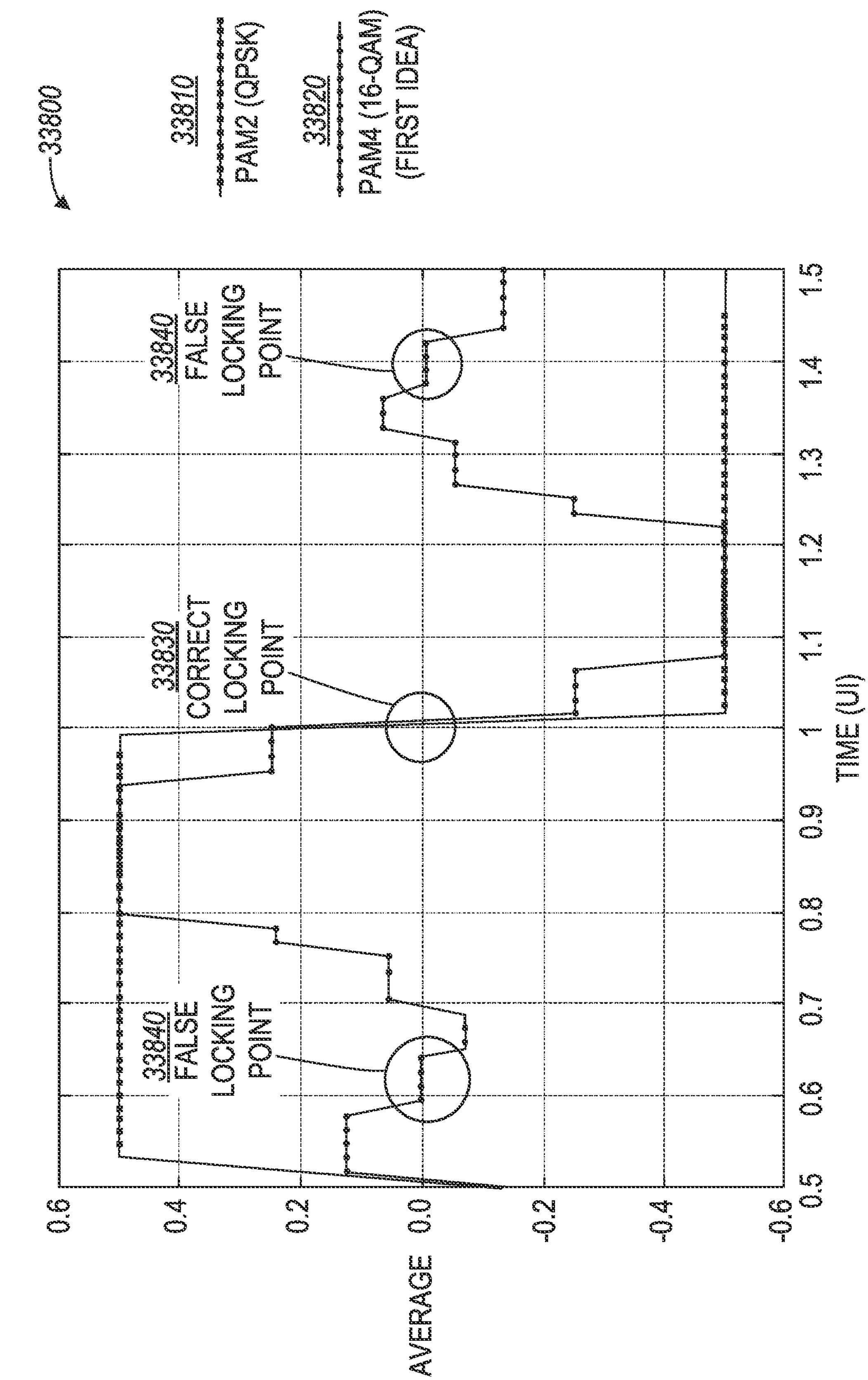

FIG. 338 is a graph illustrating use of the equation for Z and the first table, according to some aspects.

Figure 339:
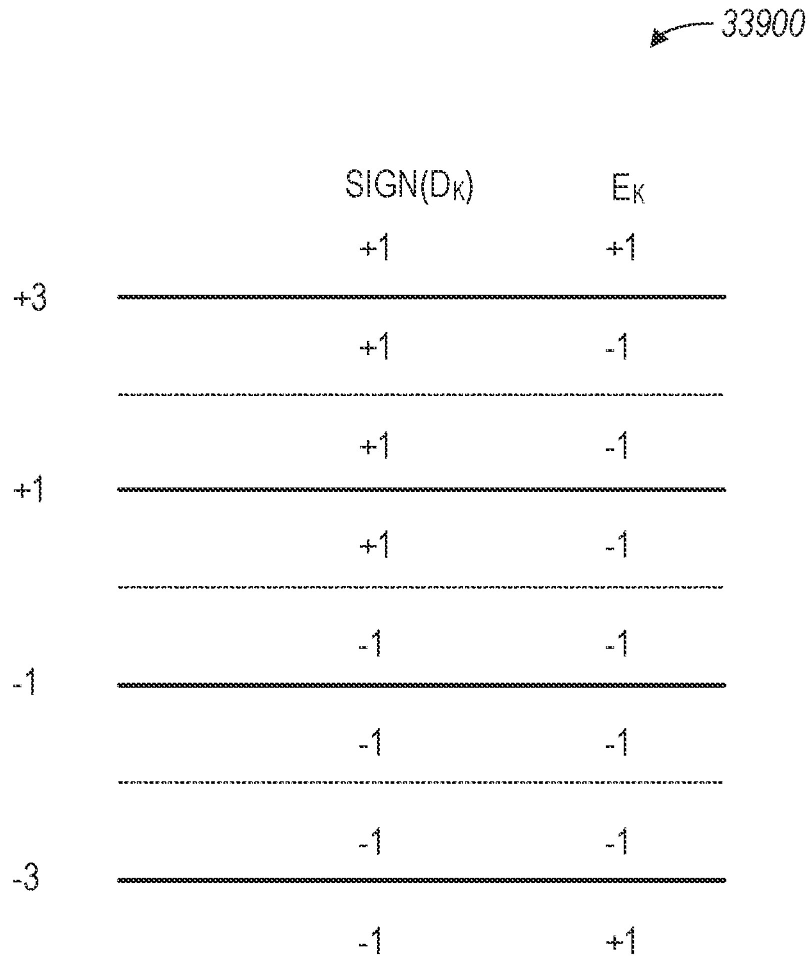

FIG. 339 is a table illustrating a second idea, in which the error values are all minus one, except above the plus three values and below the minus three value, according to some aspects.

Figure 340:
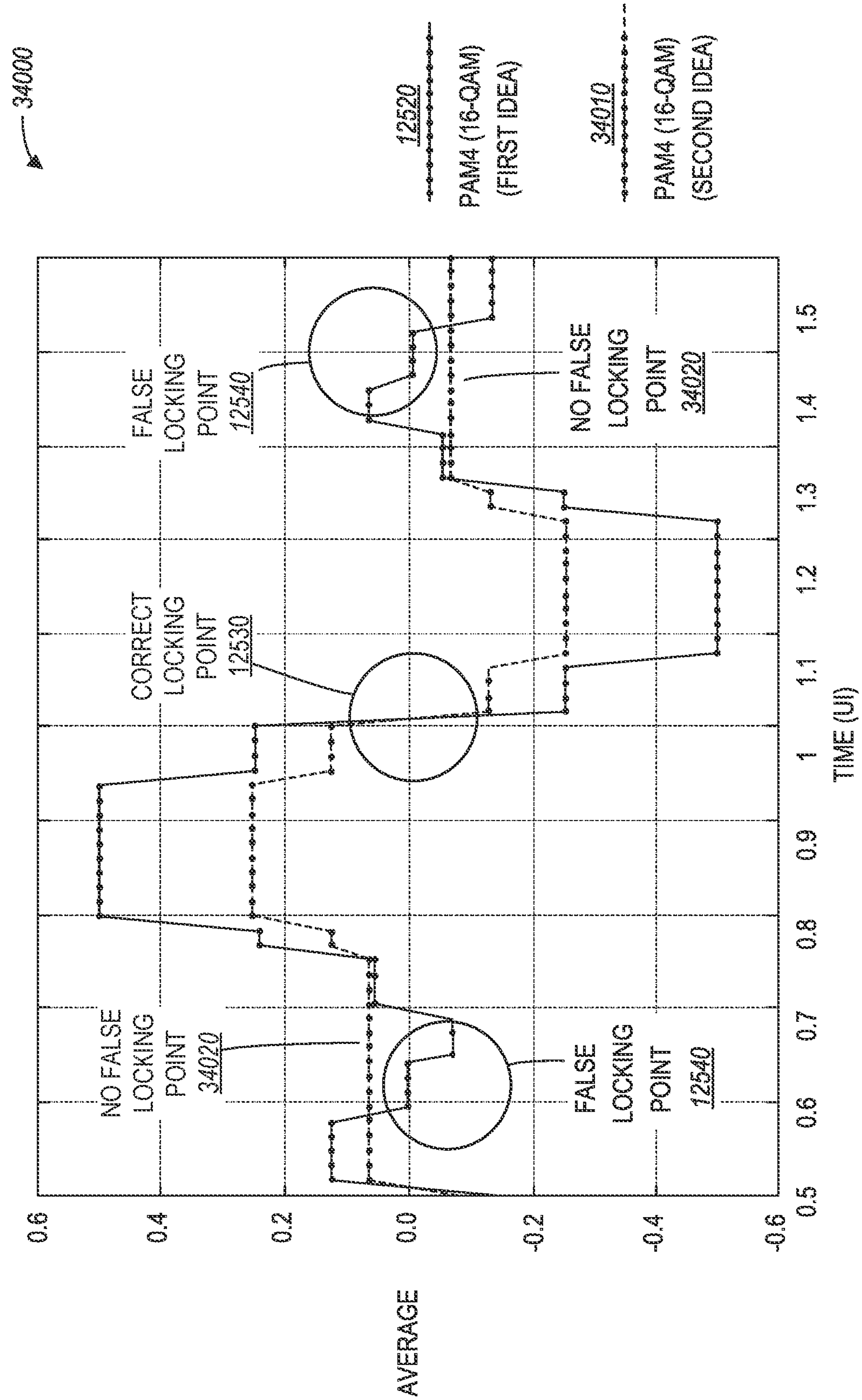

FIG. 340 is a graph of the Z function using the second table, according to some aspects.

Figure 341:
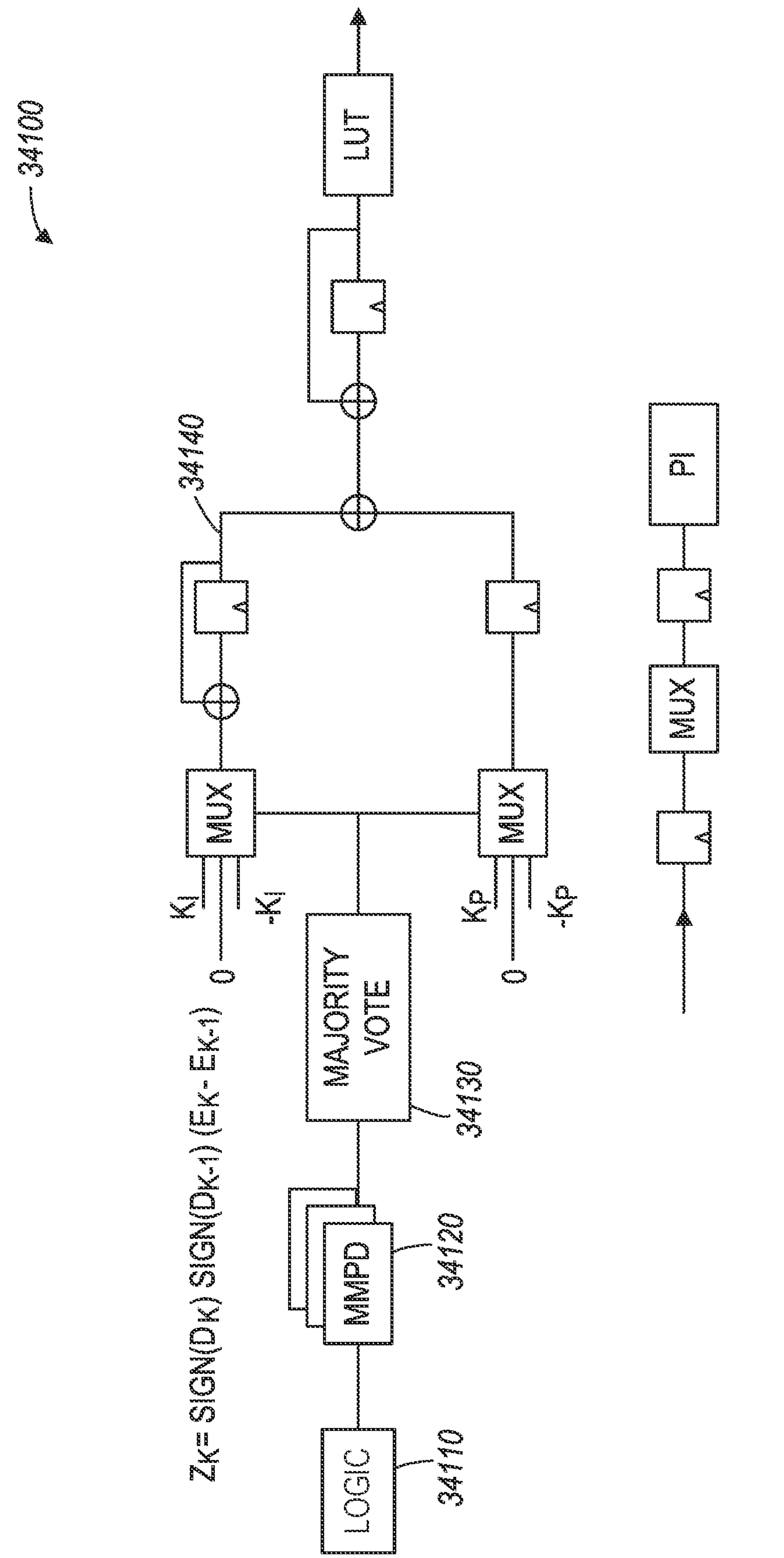

FIG. 341 is a block schematic diagram of a typical baud rate CDR loop for wireline, according to some aspects.

Figure 342:
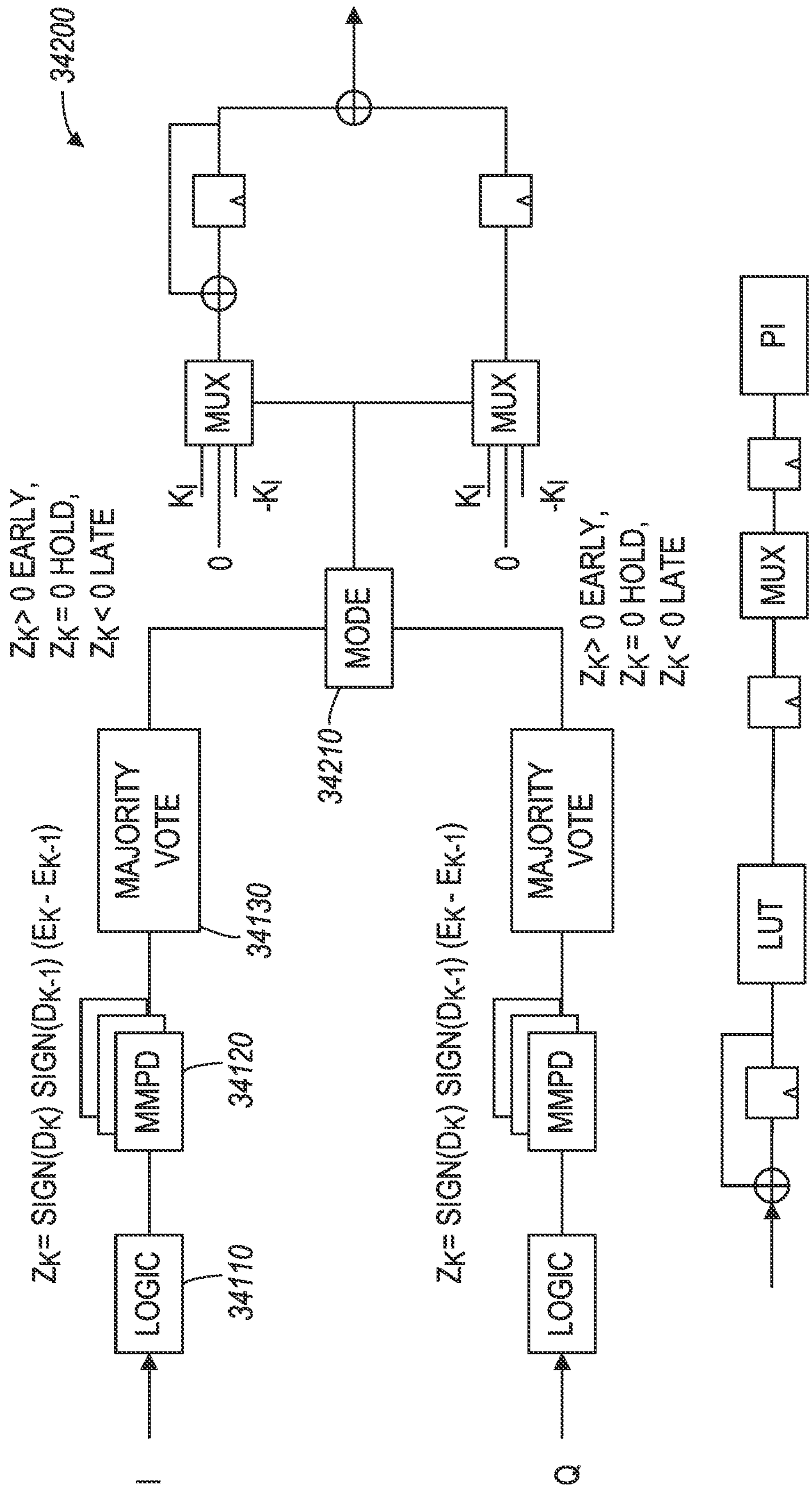

FIG. 342 is a block schematic diagram of a novel wireless CDR loop, having both an in-phase (I) and quadrature (Q) inputs, according to some aspects.

FIG. 343 is a table containing various mode values that may be used for the mode in the design of FIG. 342, according to some aspects.

Figure 344A:
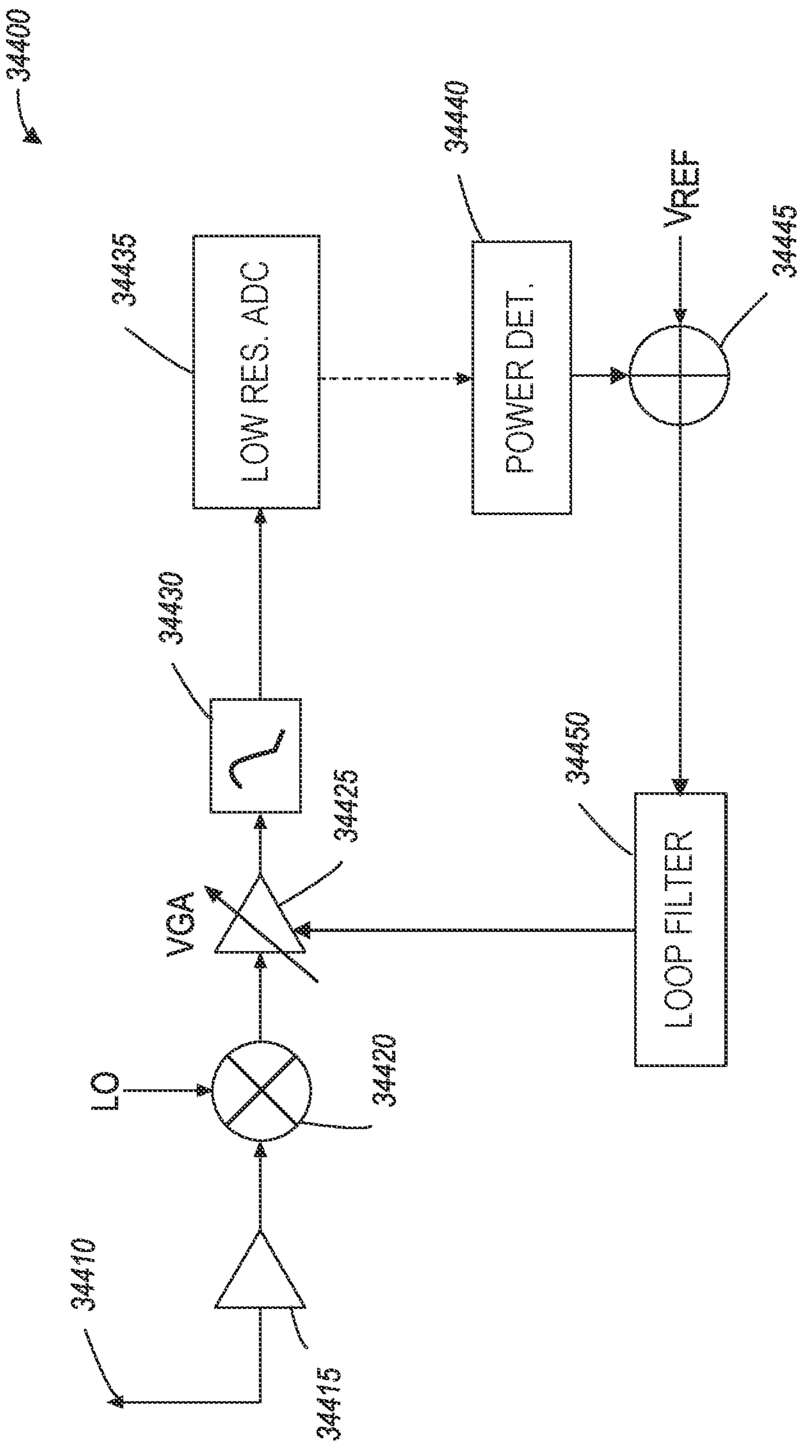

FIG. 344A is a block schematic diagram of an example AGC circuit that may be implemented at a receiver where an amplitude of the received signal varies during the operation of the receiver, according to some aspects.

Figure 344B:
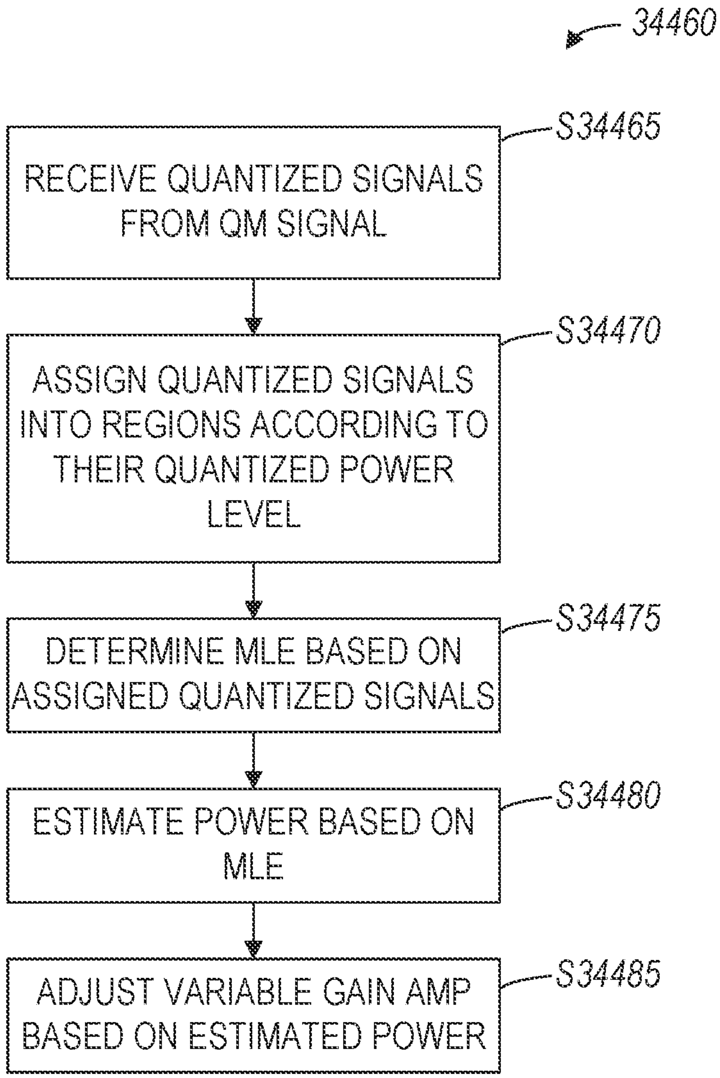

FIG. 344B is a flowchart of an example AGC process that may be implemented at a receiver where an amplitude of the received signal varies during the operation of the receiver, according to some aspects.

Figure 345:
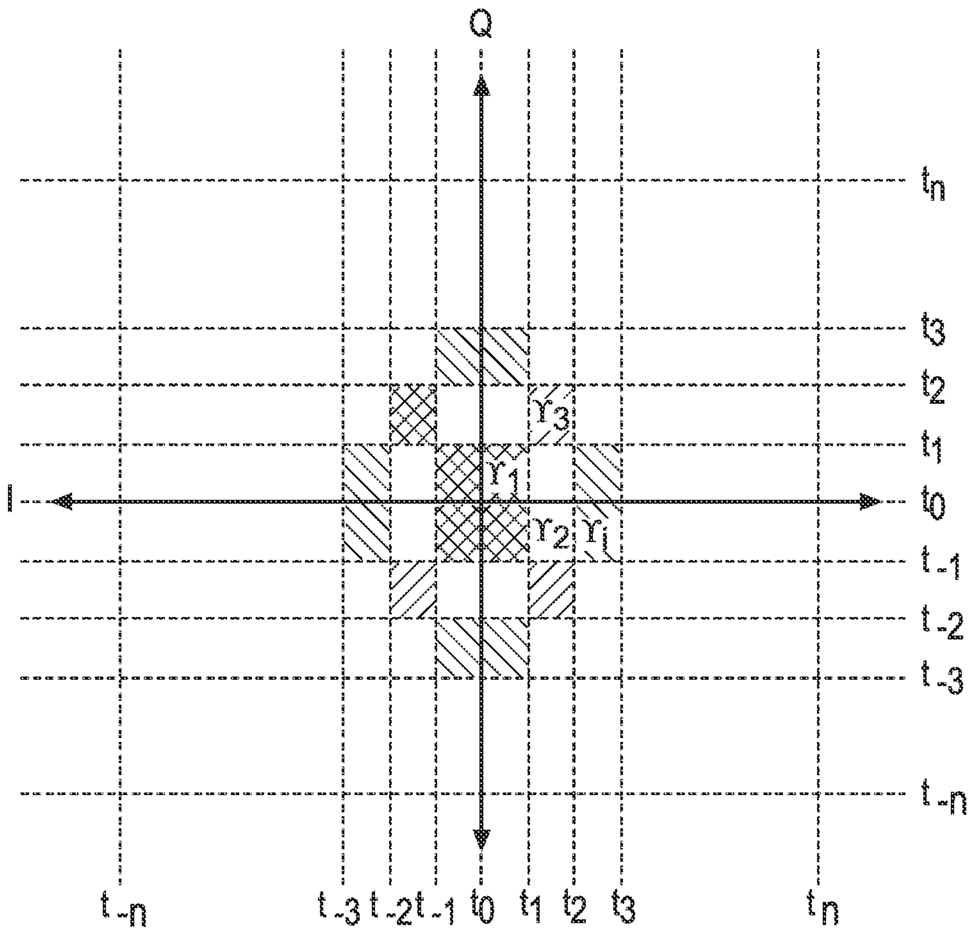

FIG. 345 is a constellation graph for quadrature encoding that illustrates quantization bins for low-resolution ADCs with $b=\log_2(2n)$ bits in each of the I/Q components of a receiver signal in a single antenna receiver system, according to some aspects.

Figure 346:
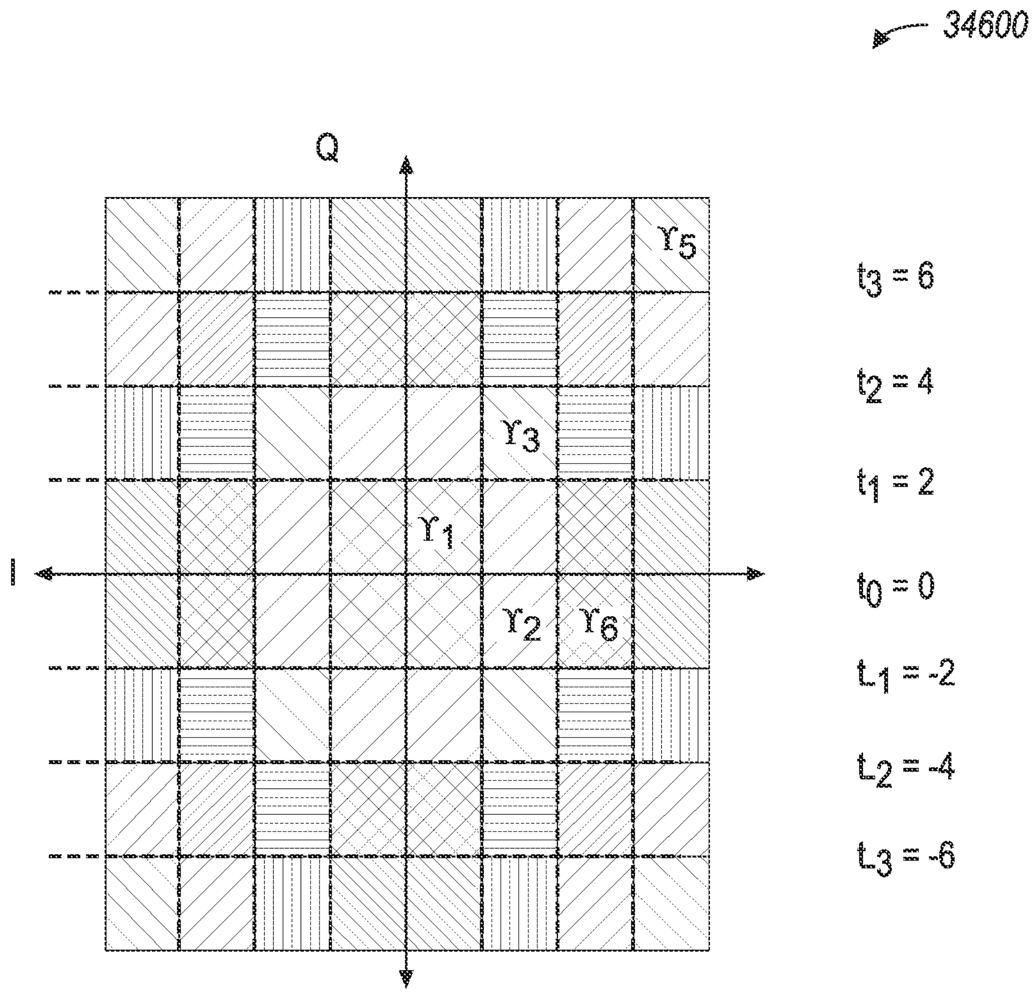

FIG. 346 is a constellation graph for quadrature encoding illustrating quantization regions for a 3-bit ADC, according to some aspects.

Figure 347:
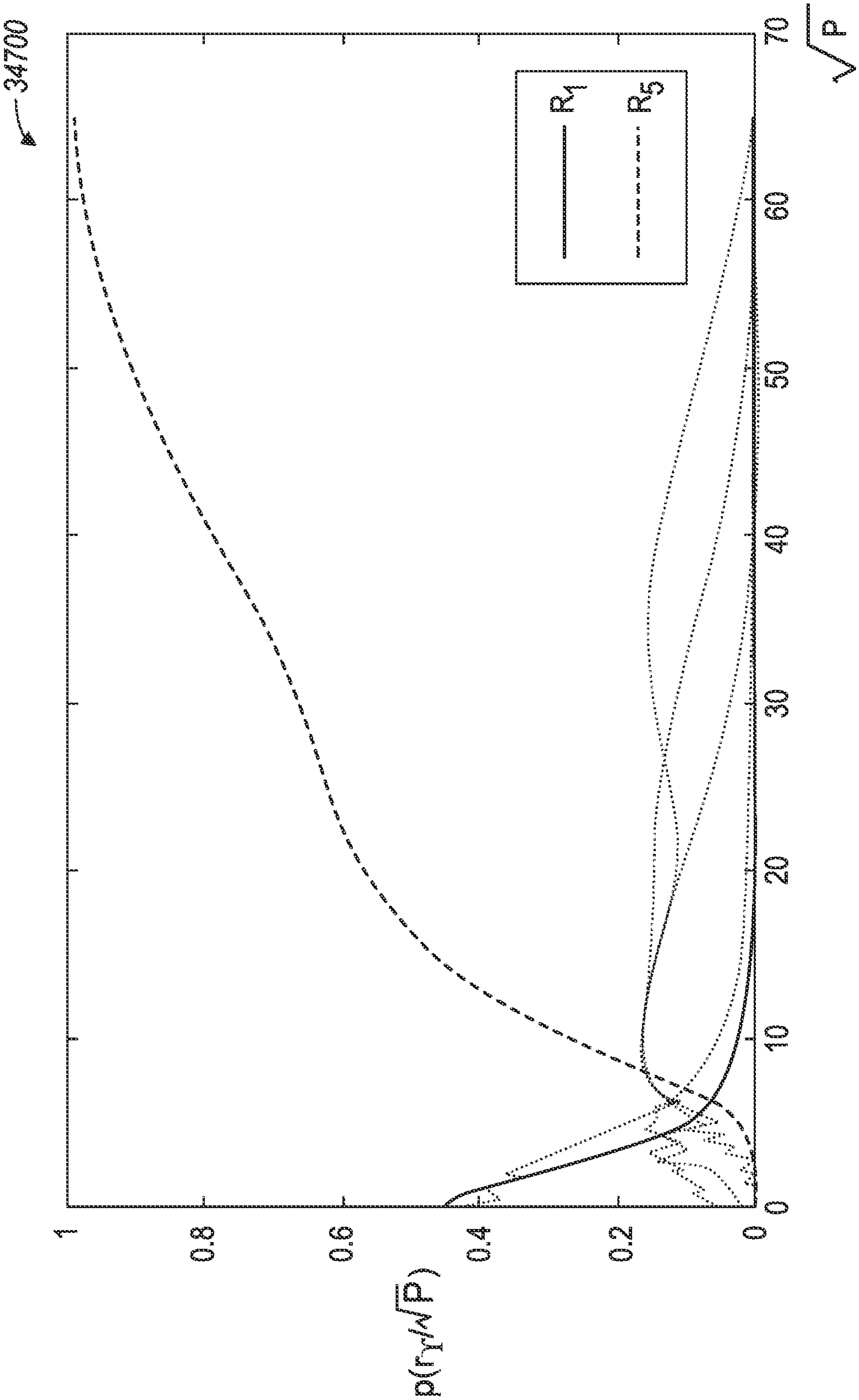

FIG. 347 is a graph illustrating conditional probability distributions, where only $r_1$ and $r_5$ are monotonically increasing and decreasing, according to some aspects.

Figure 348:
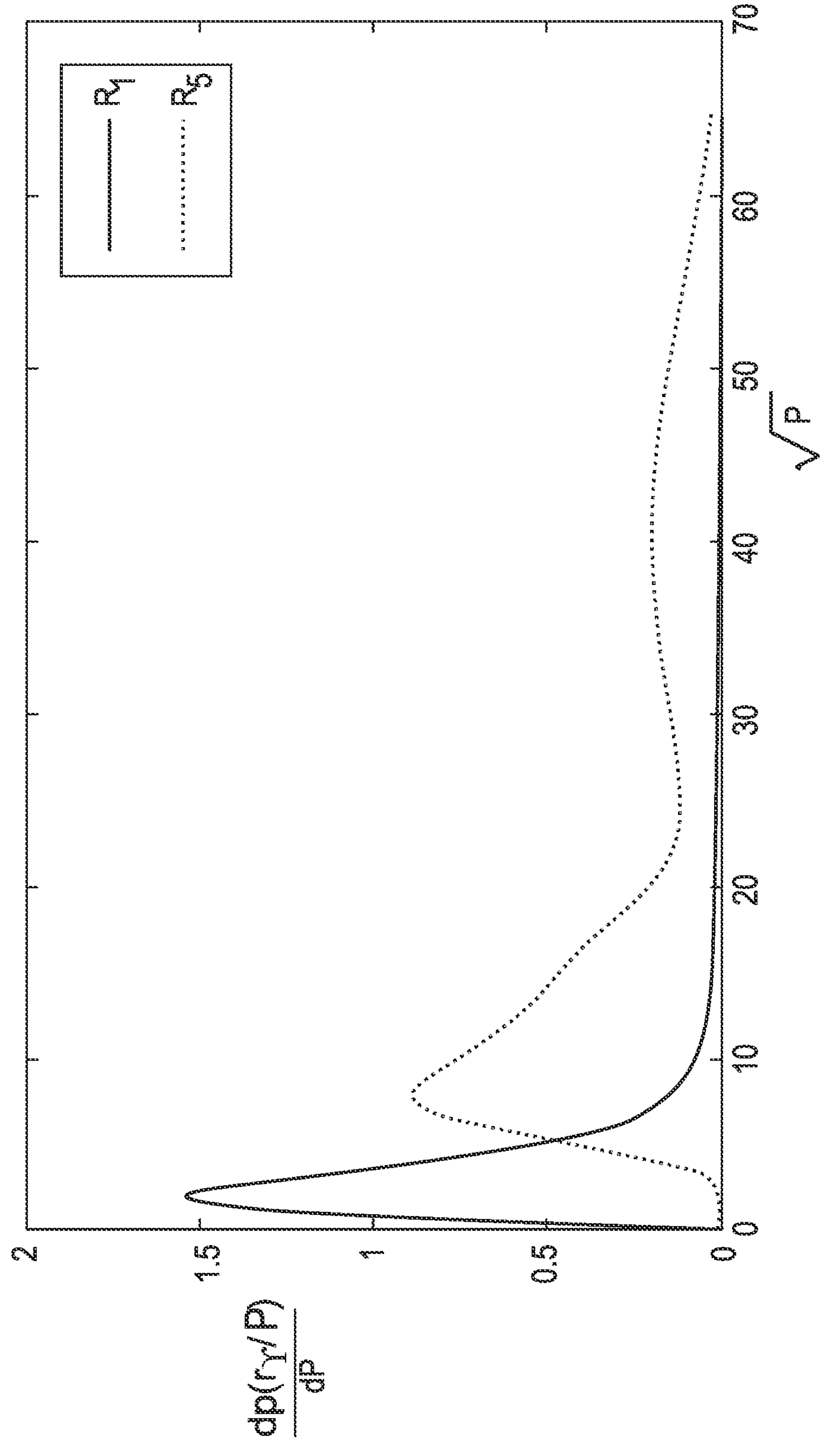

FIG. 348 is a graph illustrating the derivative of conditional probability distributions, according to some aspects.

Figure 349:
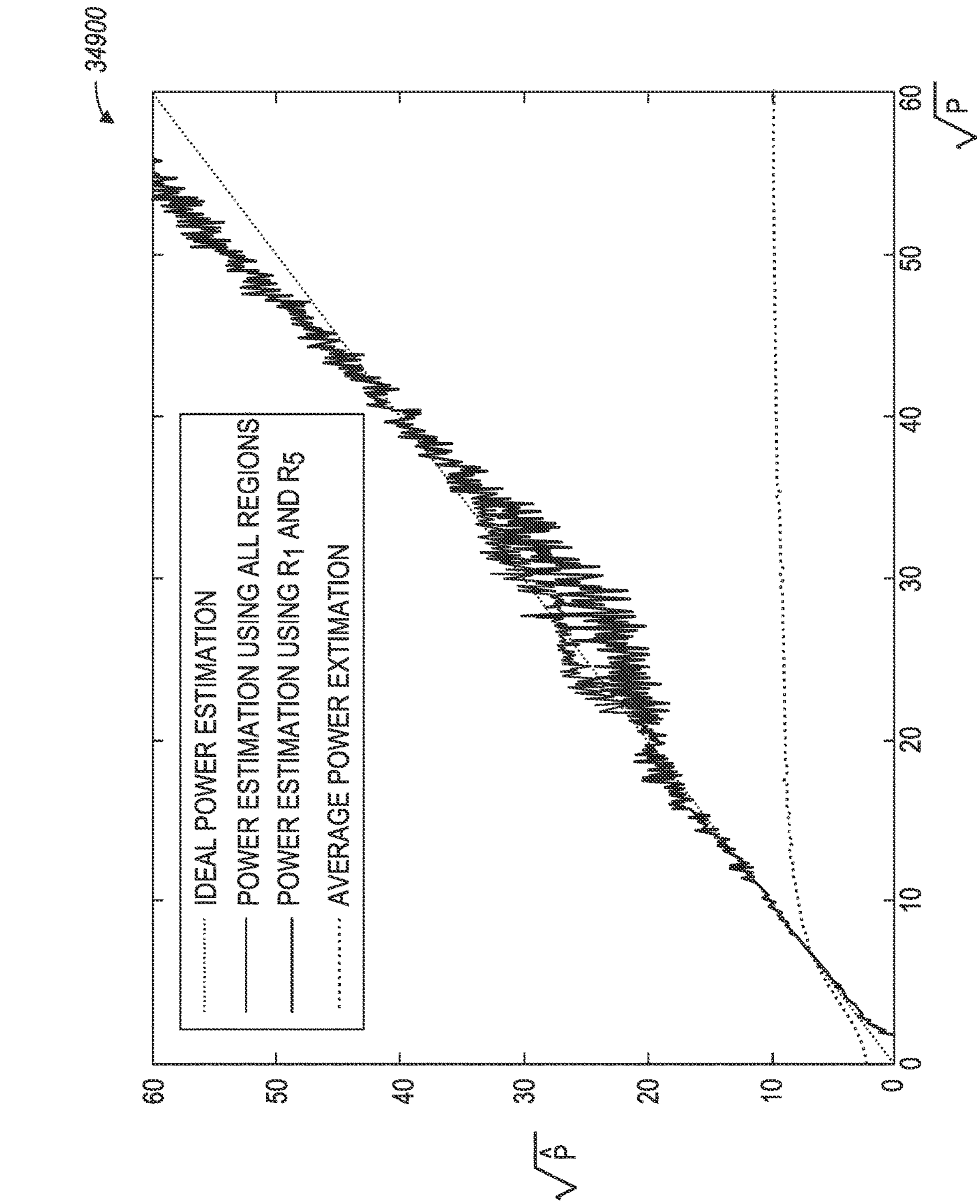

FIG. 349 is a graph illustrating an example of the estimation performance of the proposed power estimation algorithm compared to the classical average power determination, according to some aspects.

Figure 350:
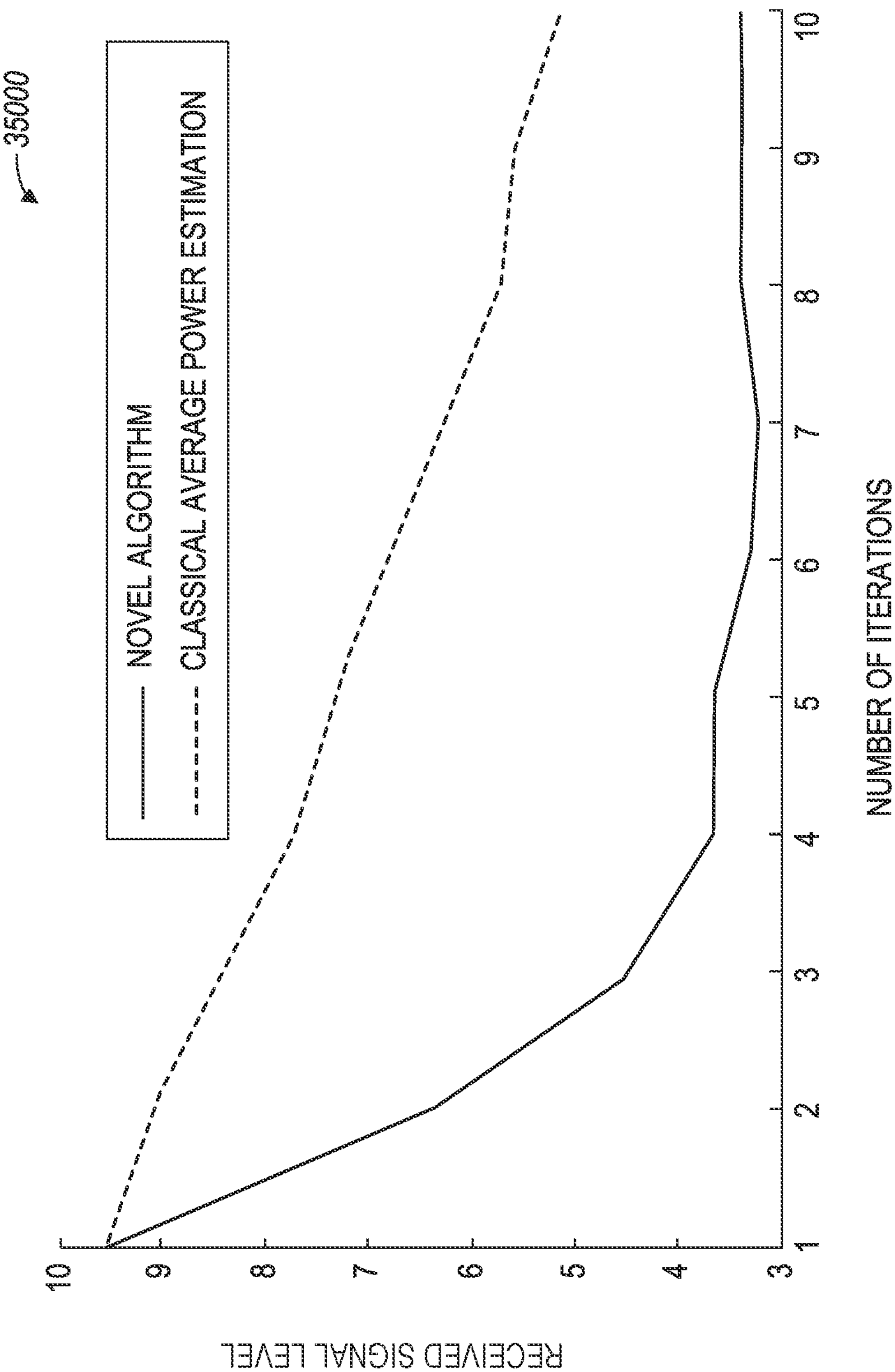

FIG. 350 is a graph illustrating the latency of the novel algorithm, according to some aspects.

Figure 351:
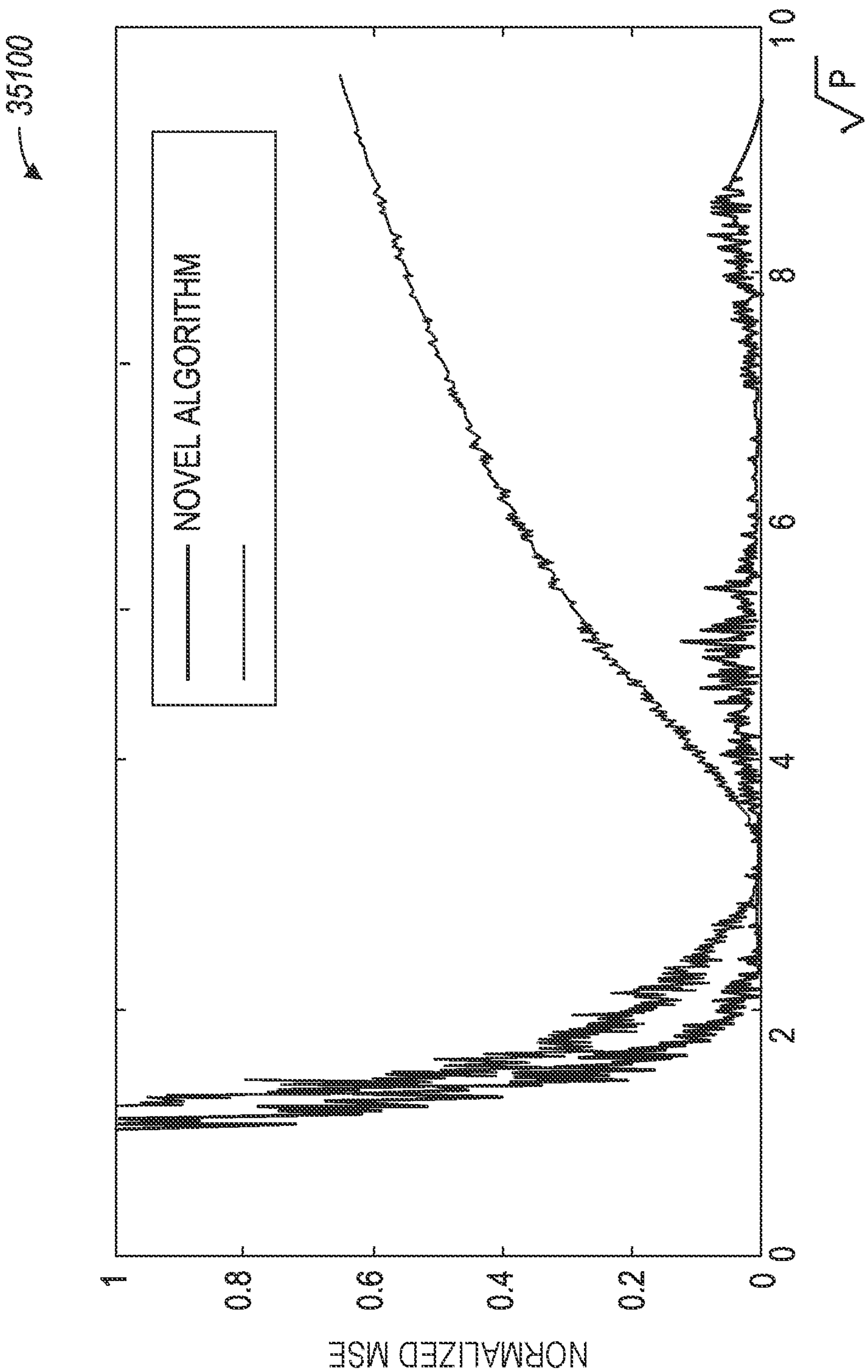

FIG. 351 is a graph that compares the normalized mean square error (MSE), according to some aspects.

Figure 352:
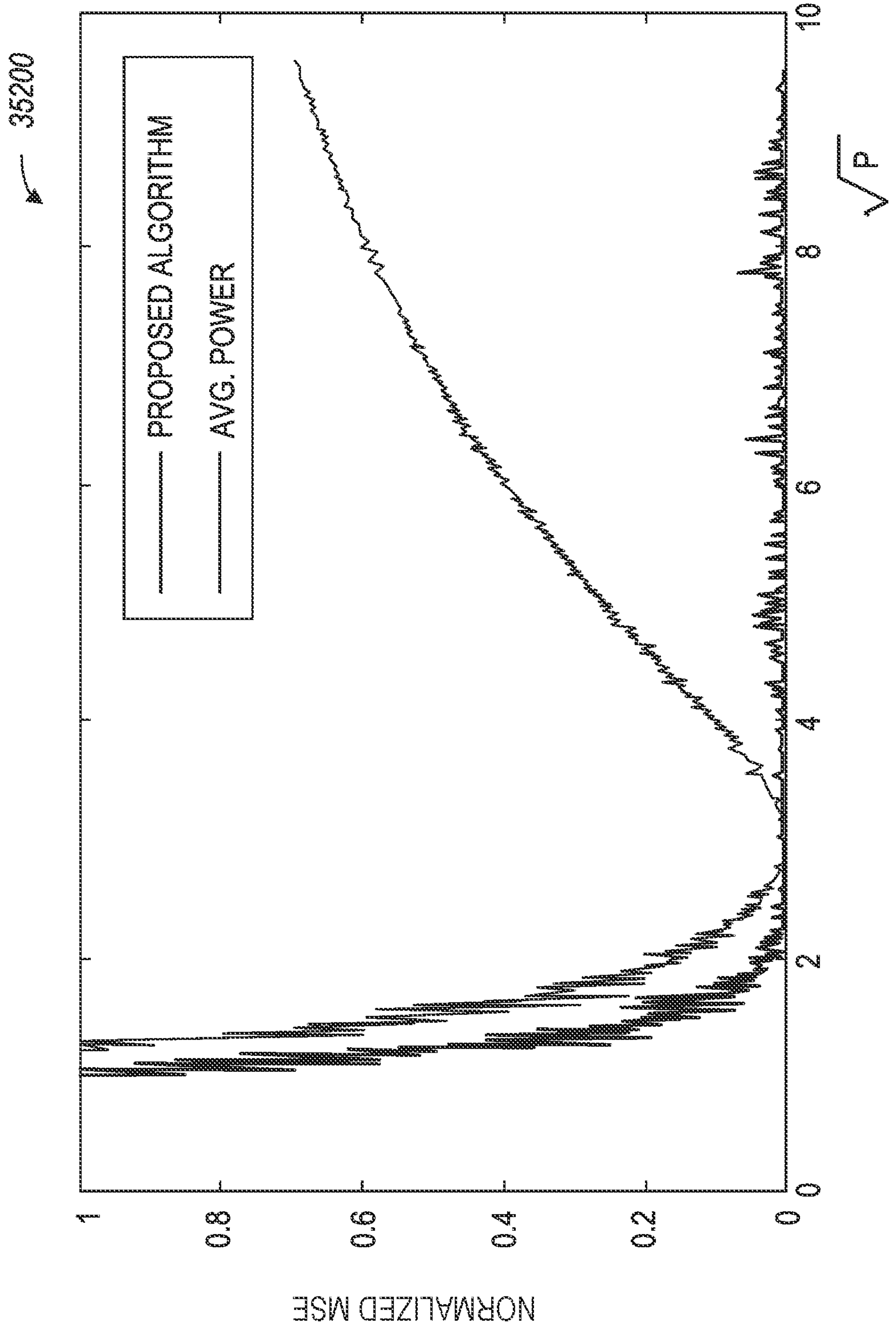

FIG. 352 is a graph illustrating a mean square error (MSE) with a uniform 45° phase noise, according to some aspects.

Figure 353:
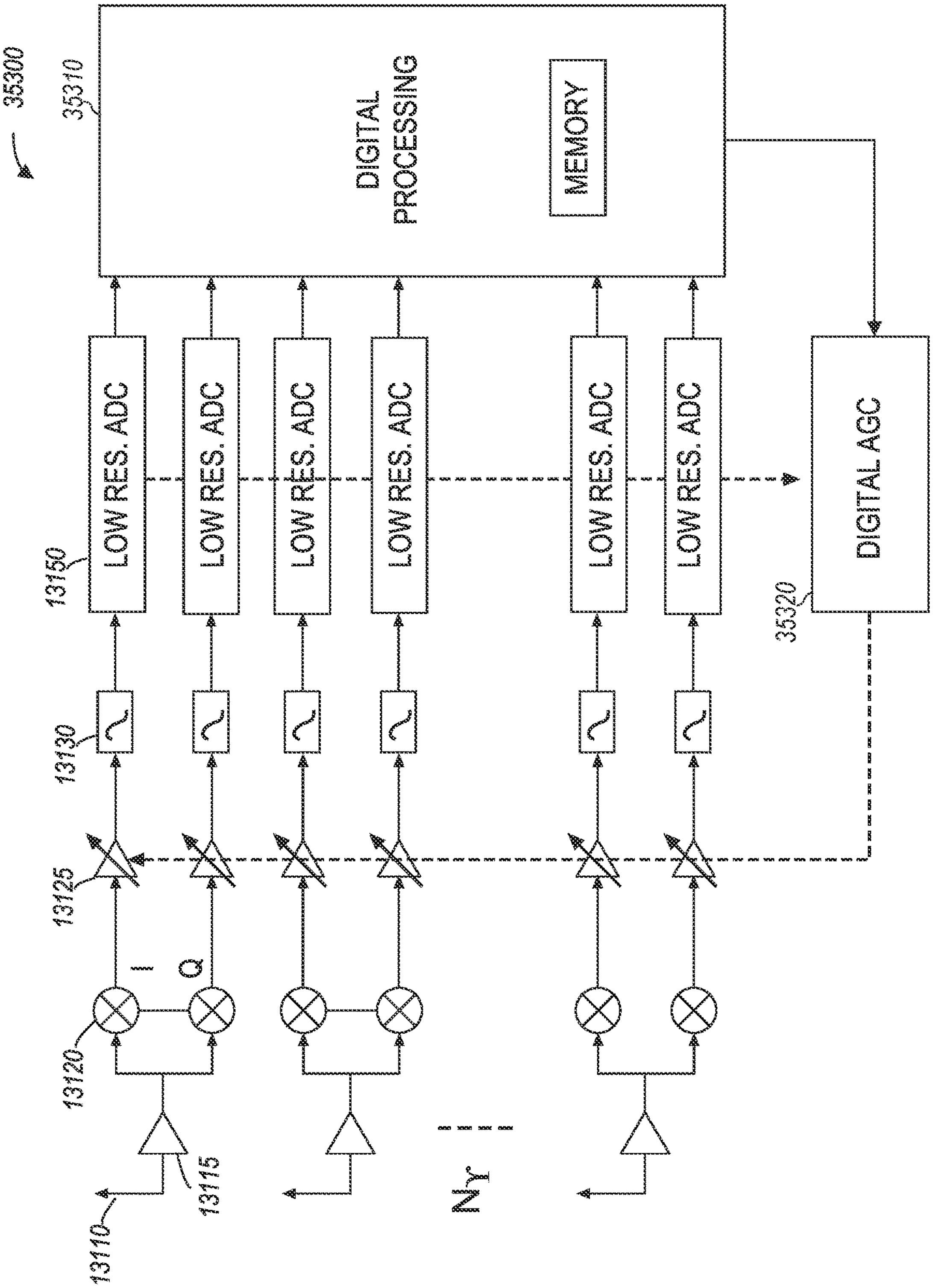

FIG. 353 is a block schematic diagram illustrating an example of a MIMO receiver with a digital processor, according to some aspects.

Figure 354:
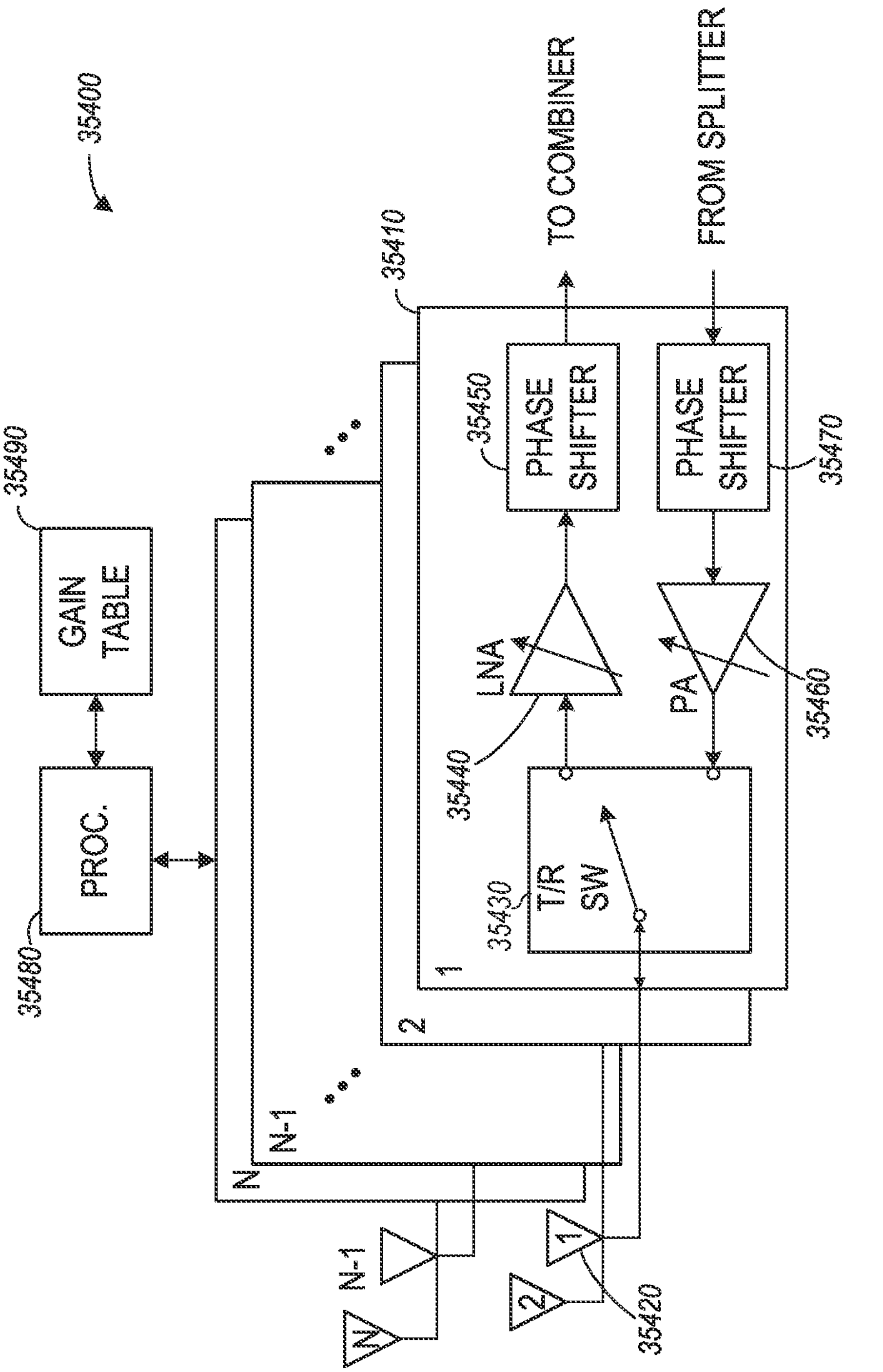

FIG. 354 is a block diagram that illustrates an example of a beam forming circuit with N identical transceiver slices and N antenna elements, according to some aspects.

Figure 355:
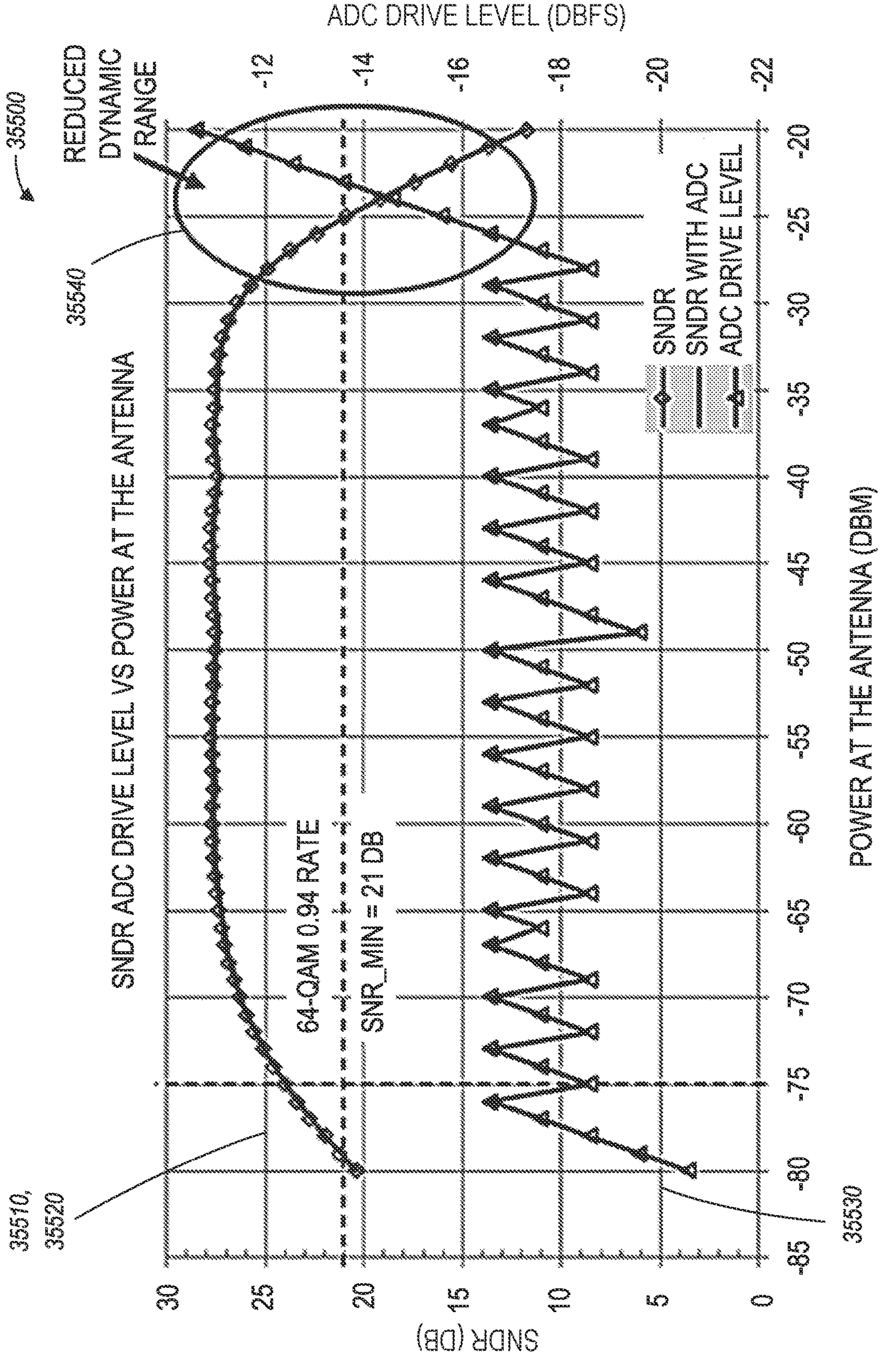

FIG. 355 is a graph that plots SNDR vs. input power at the antenna in the case when the antenna array gain is held constant, according to some aspects.

Figure 356:
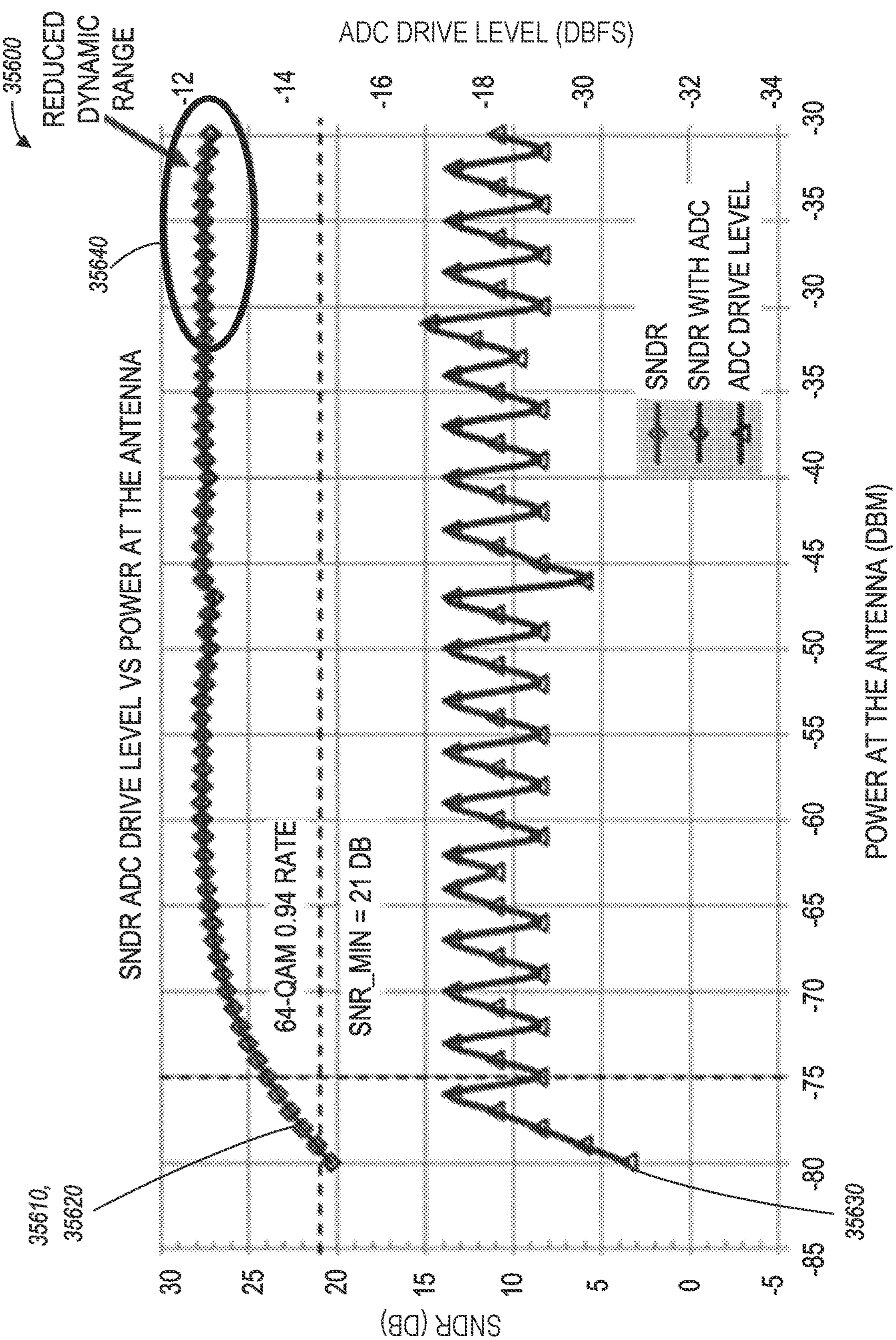

FIG. 356 is a graph that plots SNDR vs. input power at the antenna in the case when the antenna array gain is varied to enable gain control, according to some aspects.

Figure 357:
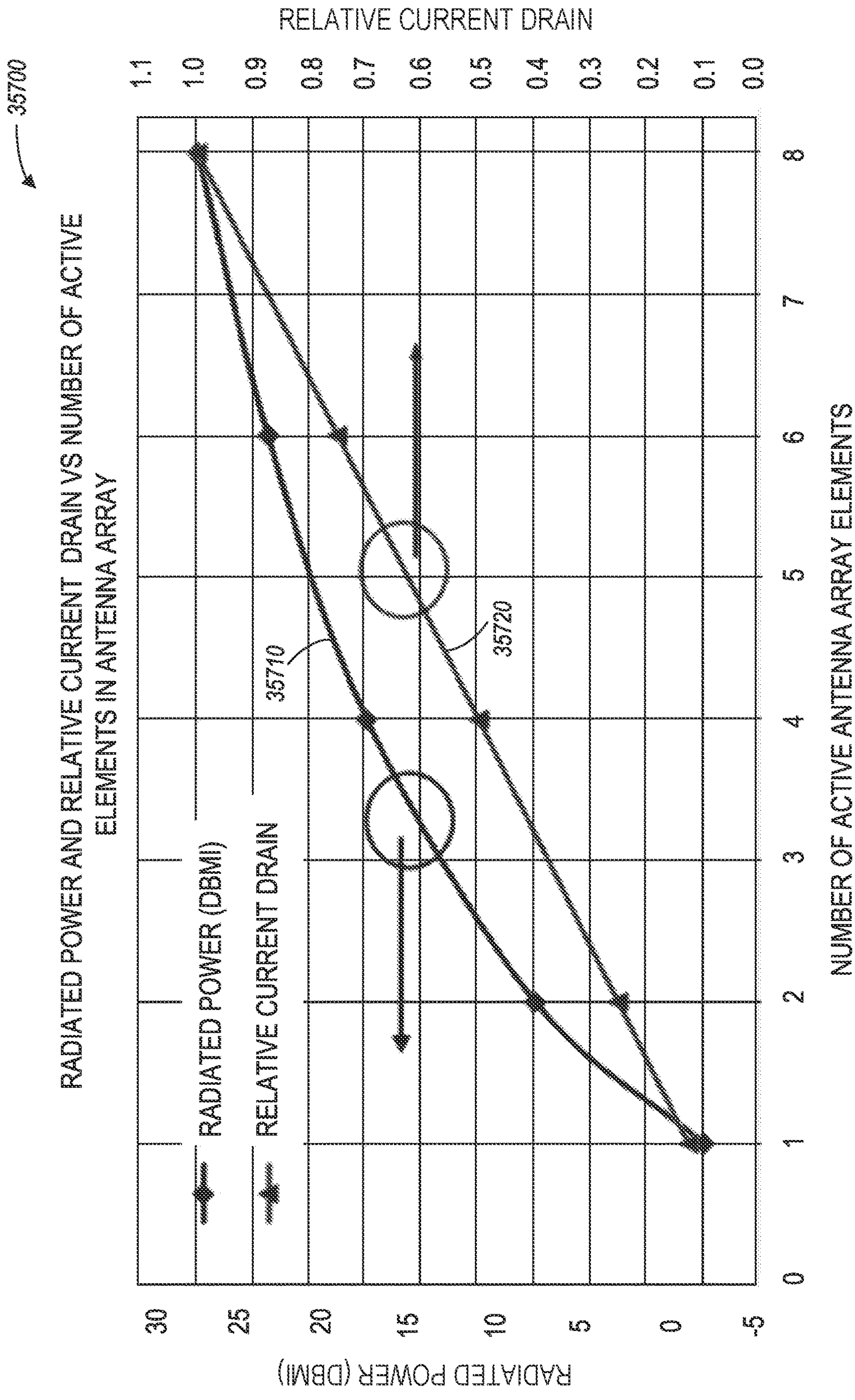

FIG. 357 is a graph that illustrates the radiated power and the relative current drain versus the number of active elements in the antenna array, according to some aspects.

Figure 358:
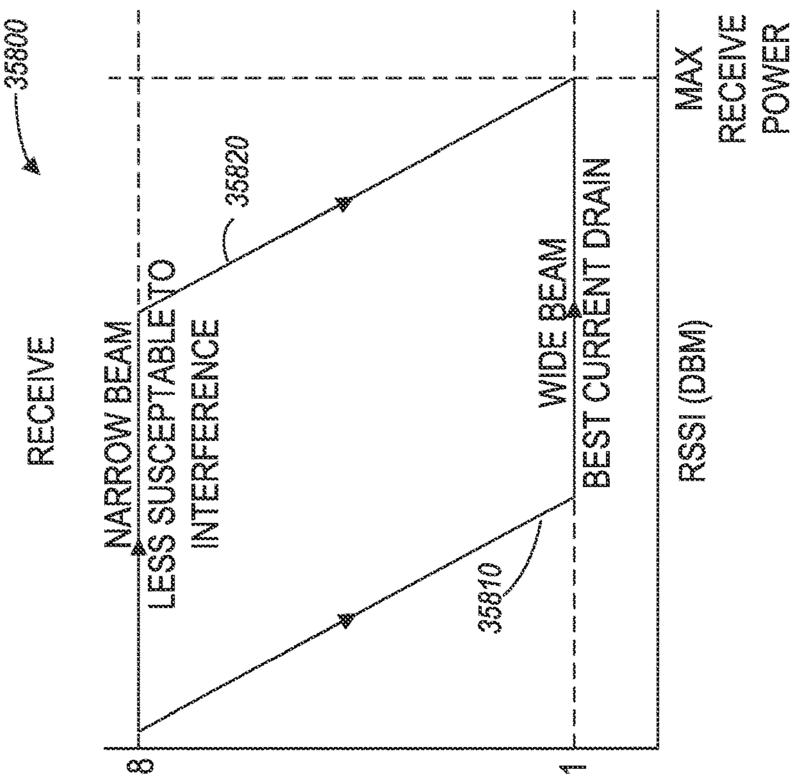

FIG. 358 is a graph that illustrates operating condition tradeoffs for Rx, according to some aspects.

Figure 359:
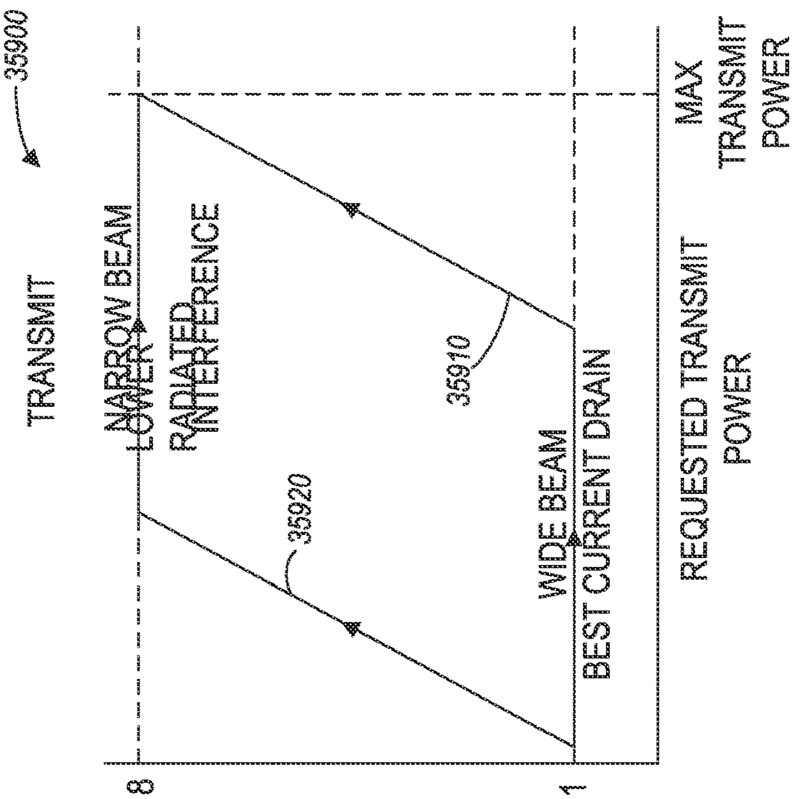

FIG. 359 is a graph that illustrates operating condition tradeoffs for Tx, according to some aspects.

Figure 360:
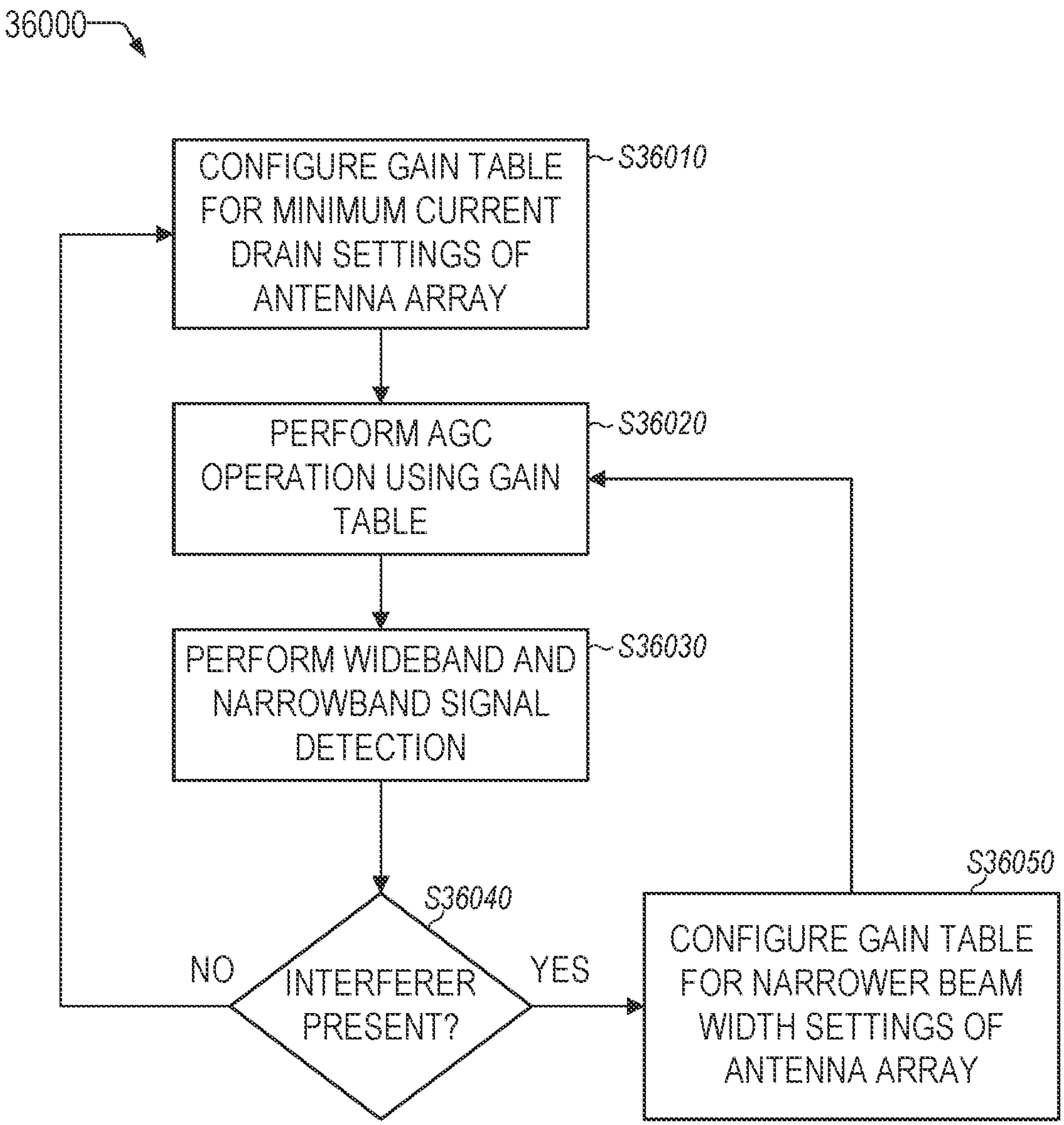

FIG. 360 is a flowchart that illustrates an example of a receive process that may be used, according to some aspects.

Figure 361:
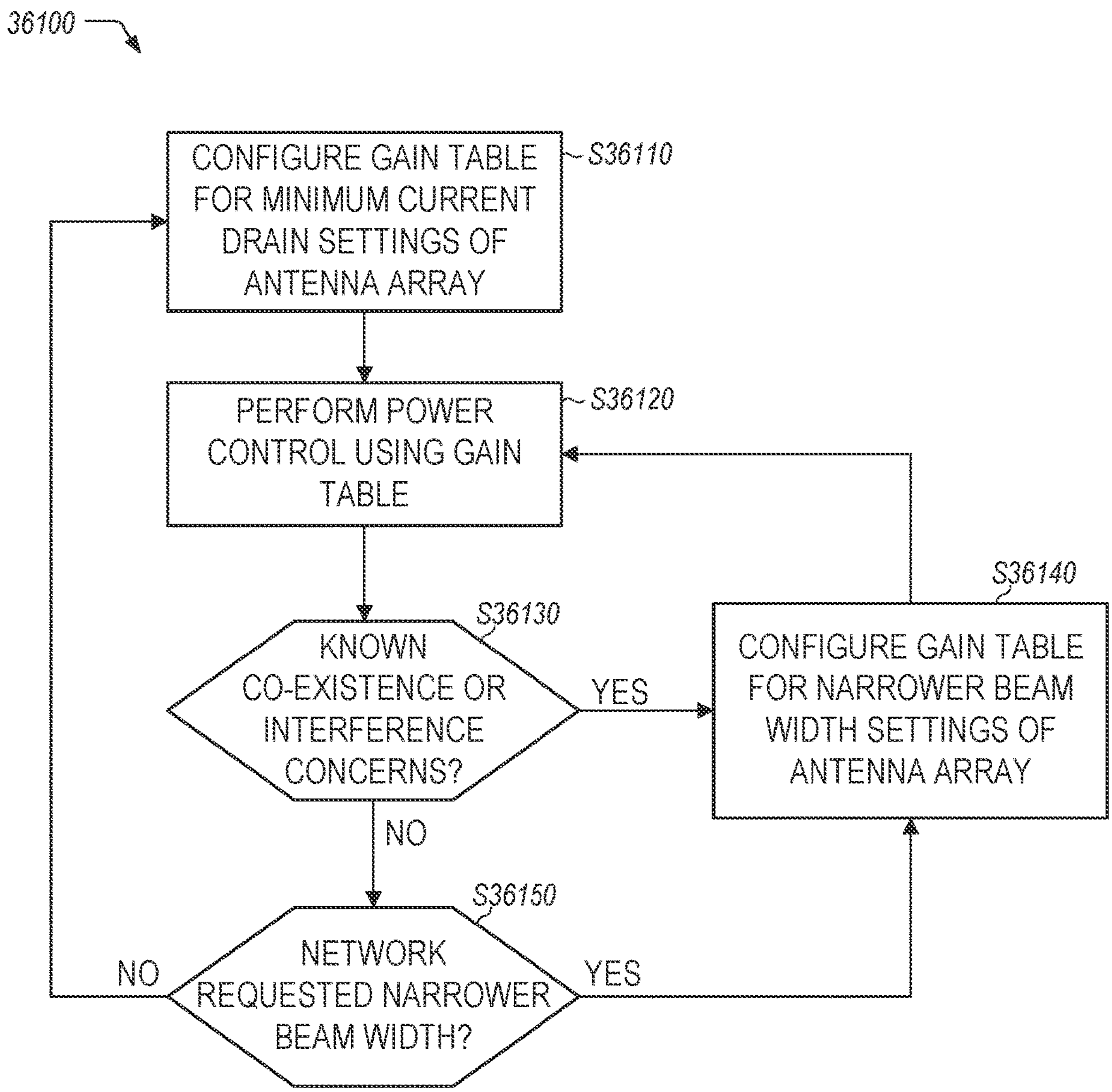

FIG. 361 is a flowchart that illustrates an example of a transmit process that may be used, according to some aspects.

Figure 362:
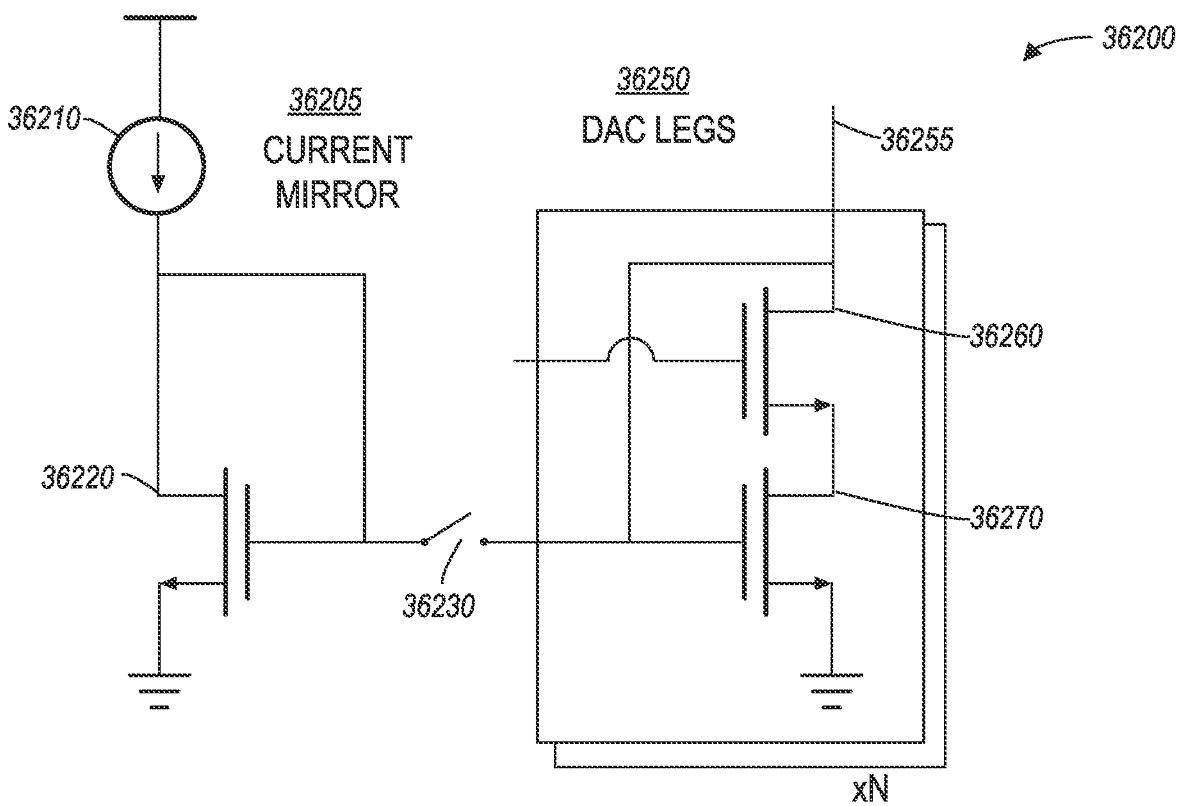

FIG. 362 is a schematic diagram of a DAC architecture, according to some aspects.

Figure 363:
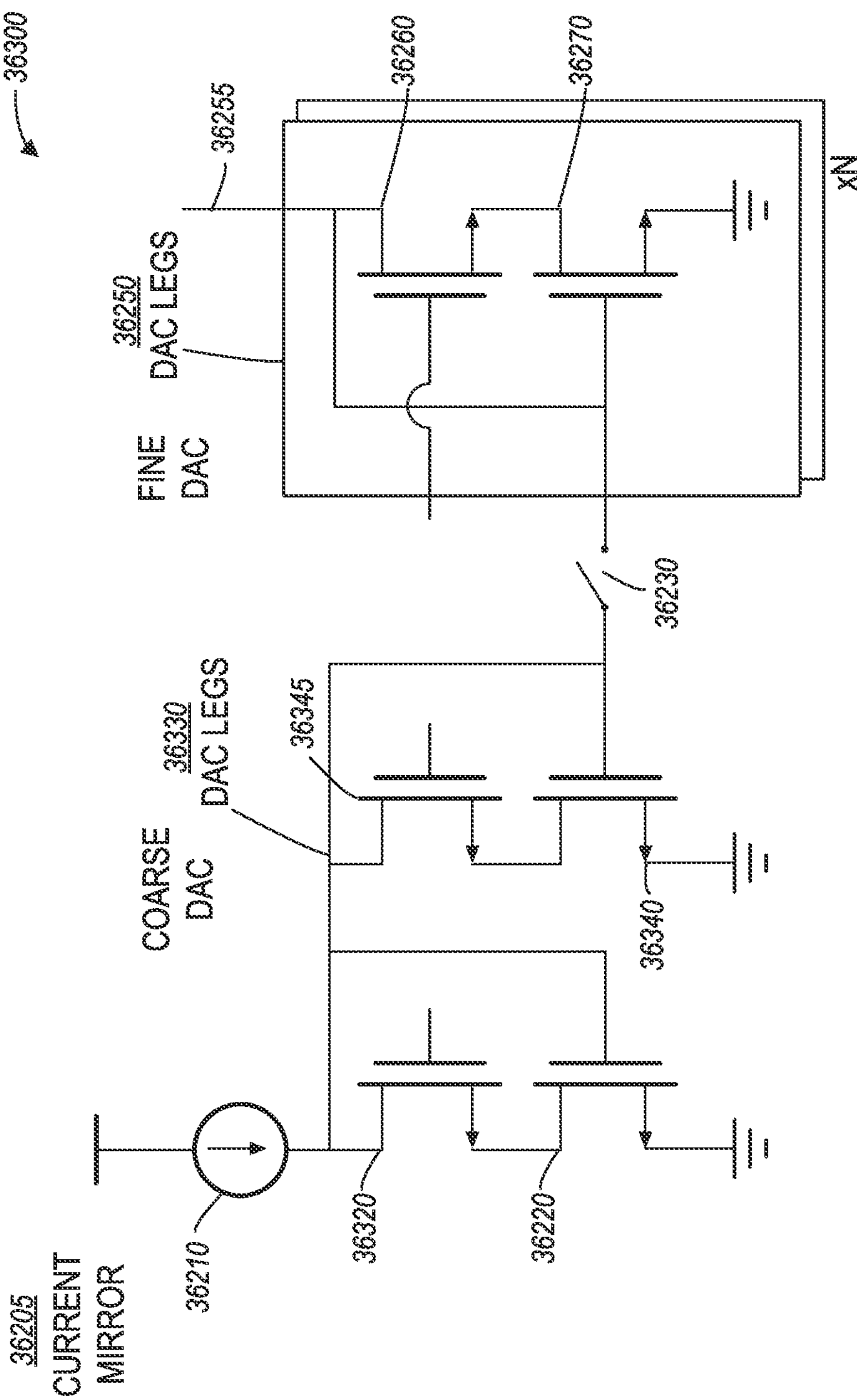

FIG. 363 is a schematic diagram of a hierarchically structured, according to one implementation of a device described herein.

Figure 364:
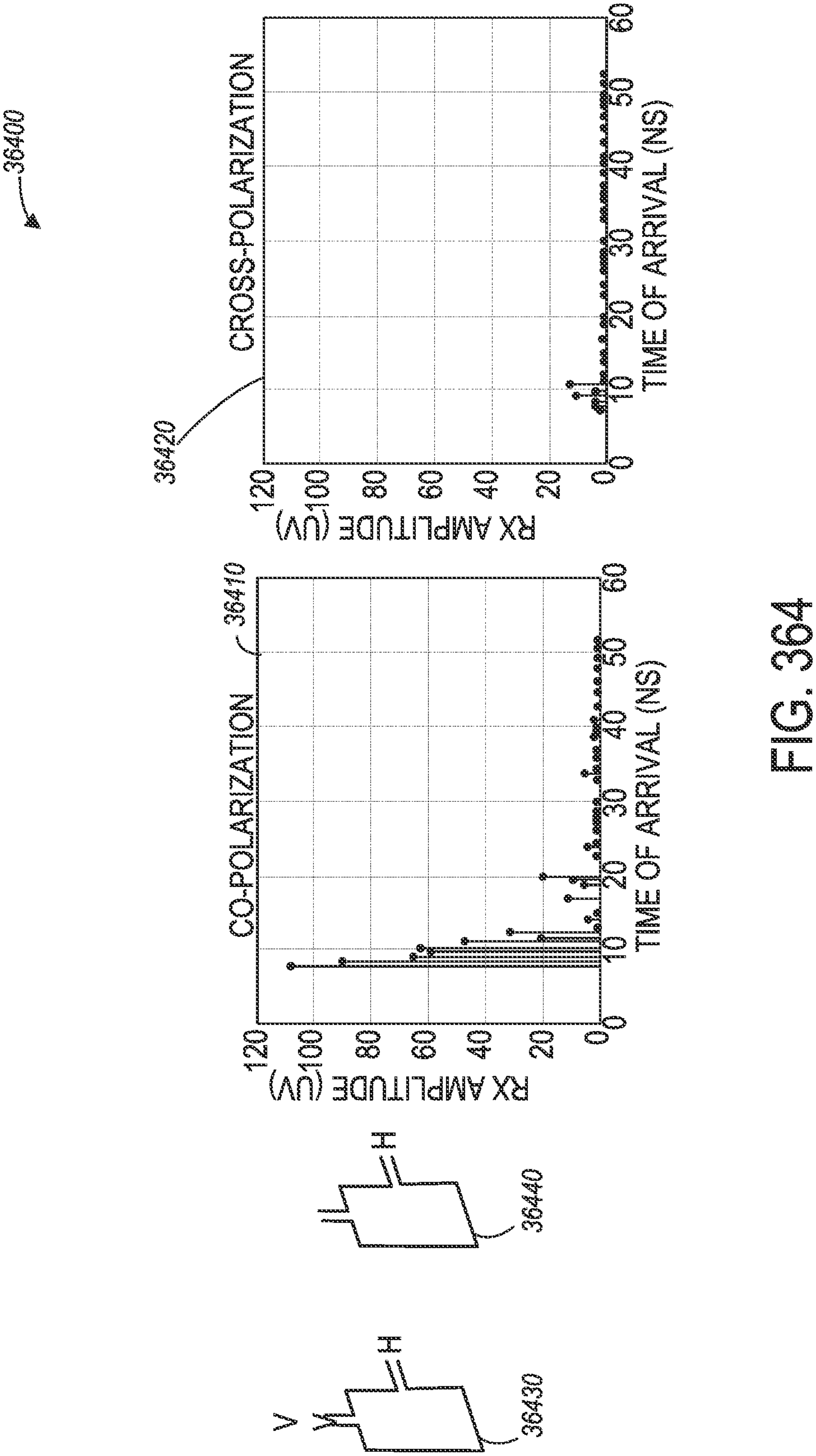

FIG. 364 is a combined pictorial chart diagram, including a pair of graphs illustrating co-polarization and cross-polarization when a transmit antenna and a receive antenna are aligned (i.e., parallel), according to some aspects.

Figure 365:
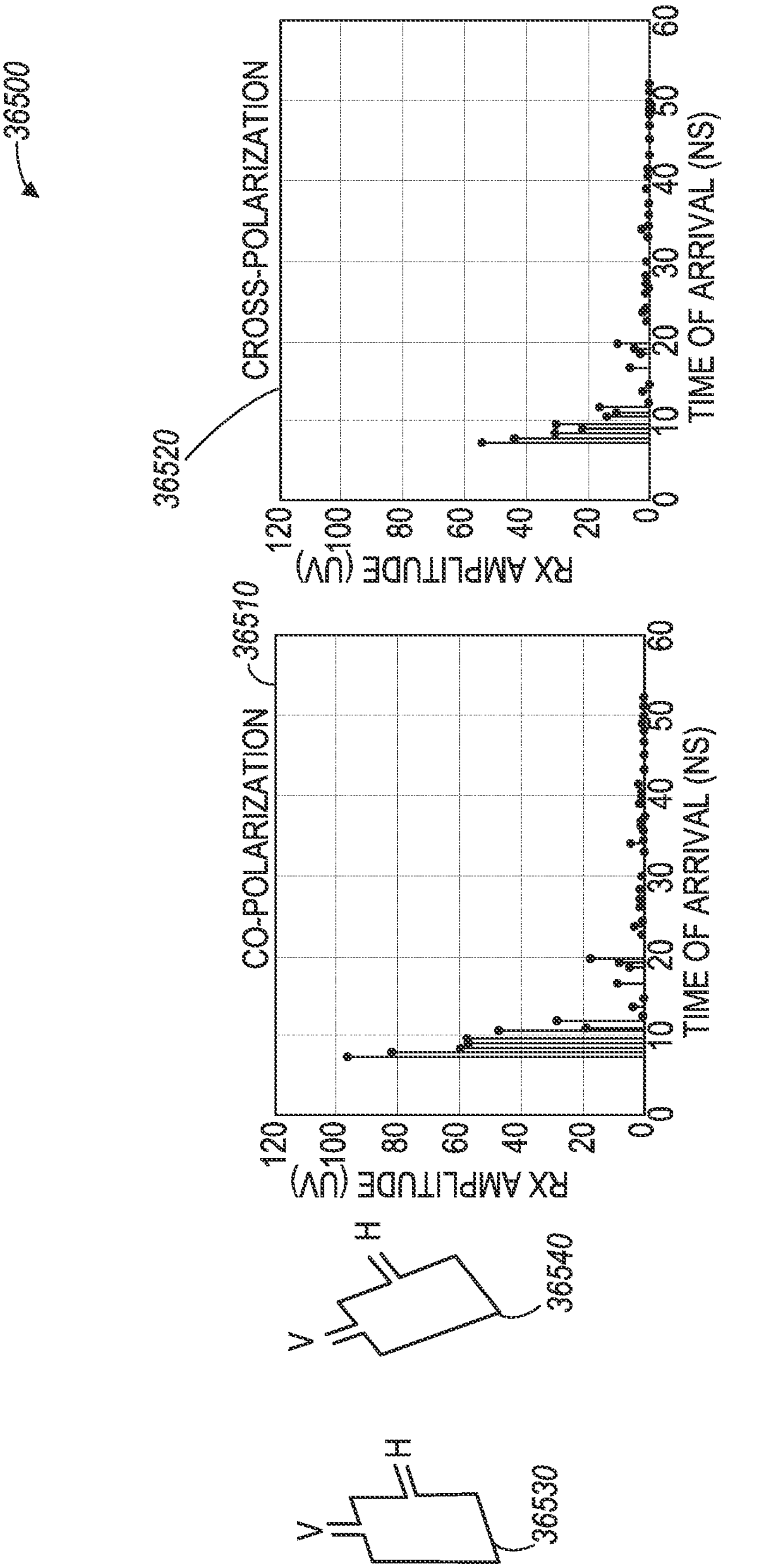

FIG. 365 is a combined pictorial chart diagram, including a pair of graphs illustrating co-polarization and cross-polarization when a transmit antenna and a receive antenna are misaligned (i.e., not parallel), according to some aspects.

Figure 366:
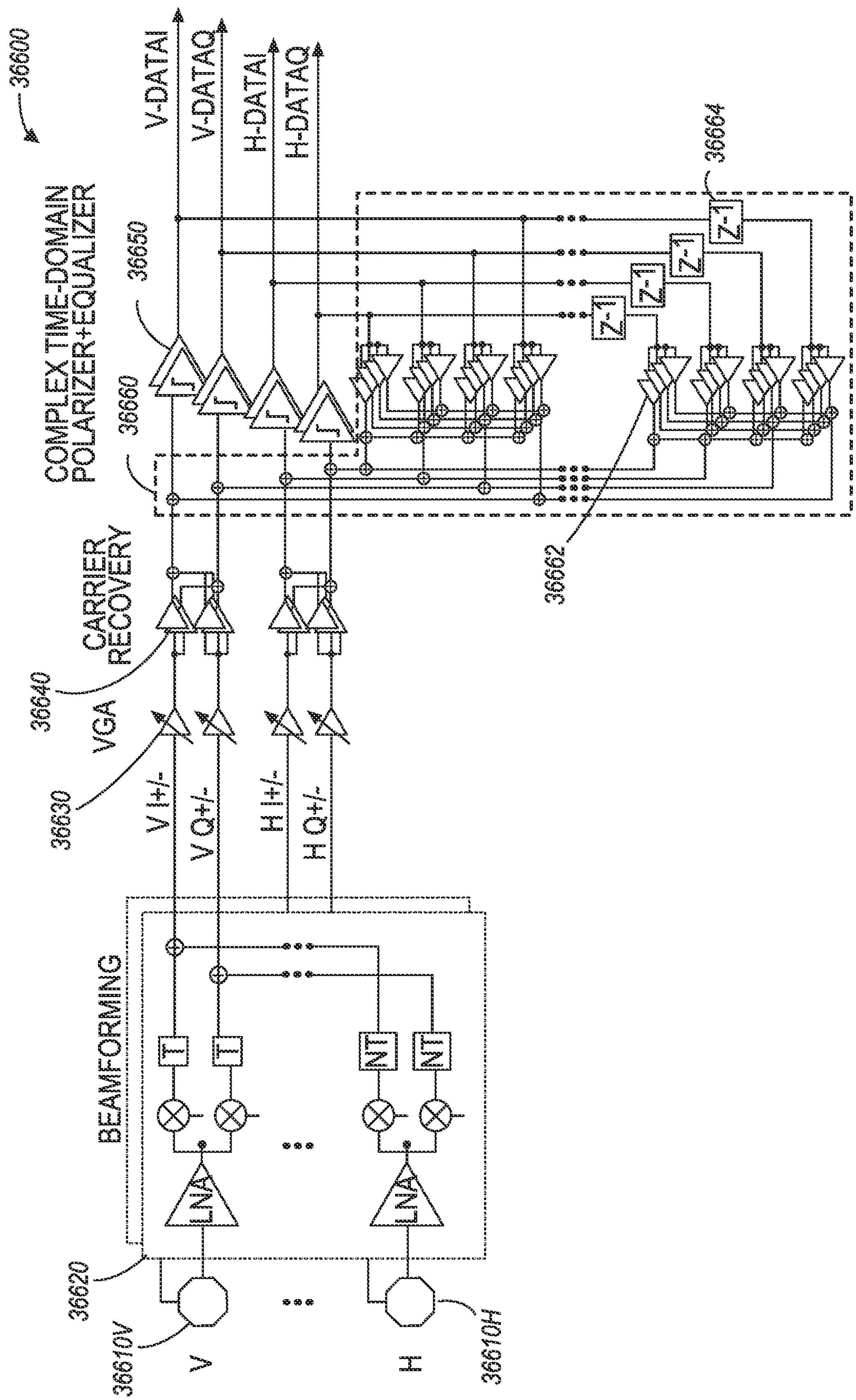

FIG. 366 is an example of a receiver using the MSFFPE design, according to some aspects.

Figure 367:
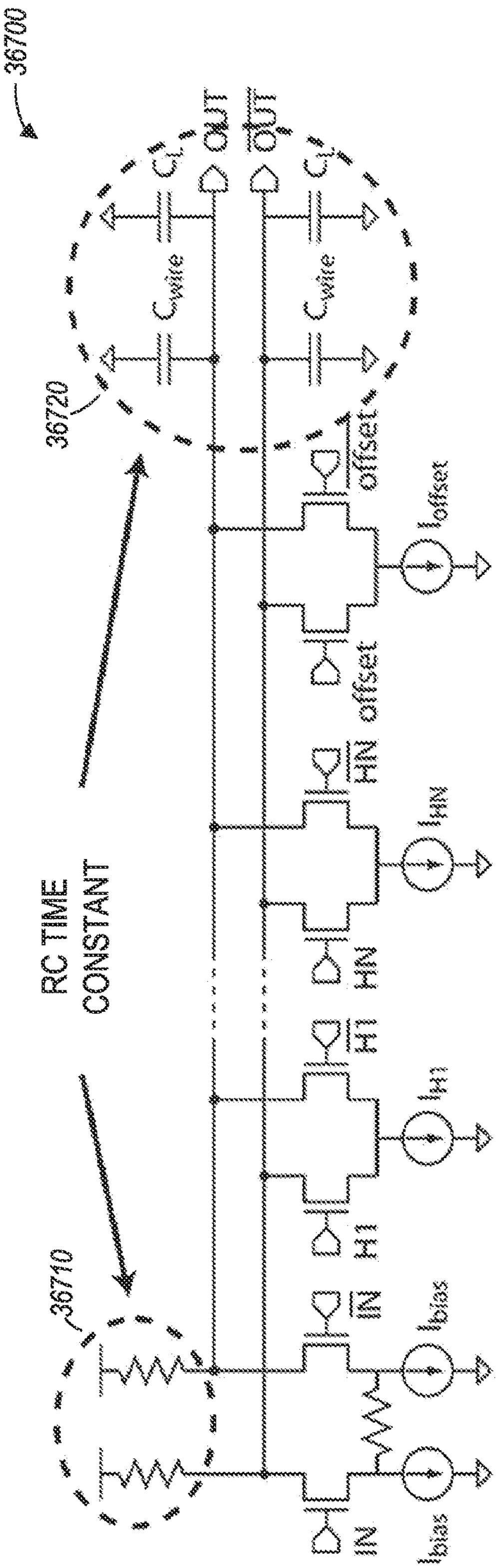

FIG. 367 is a circuit diagram illustrating a conventional summer.

Figure 368:
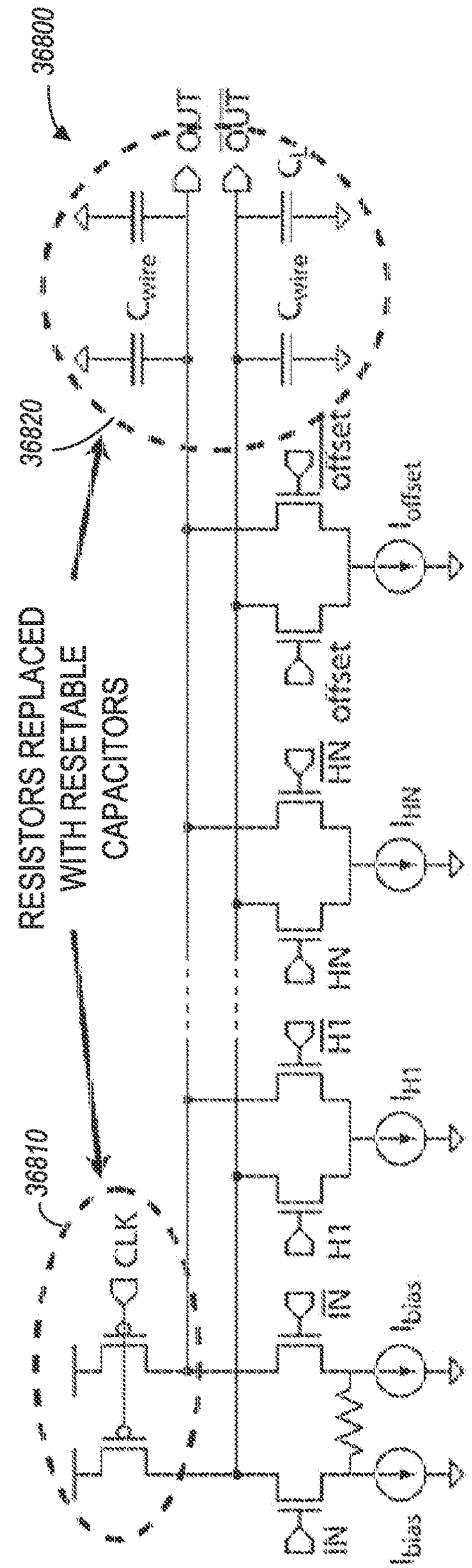

FIG. 368 is a circuit diagram illustrating an integrating a DFE summer, with the relevant differences highlighted, according to some aspects.

Figure 369:
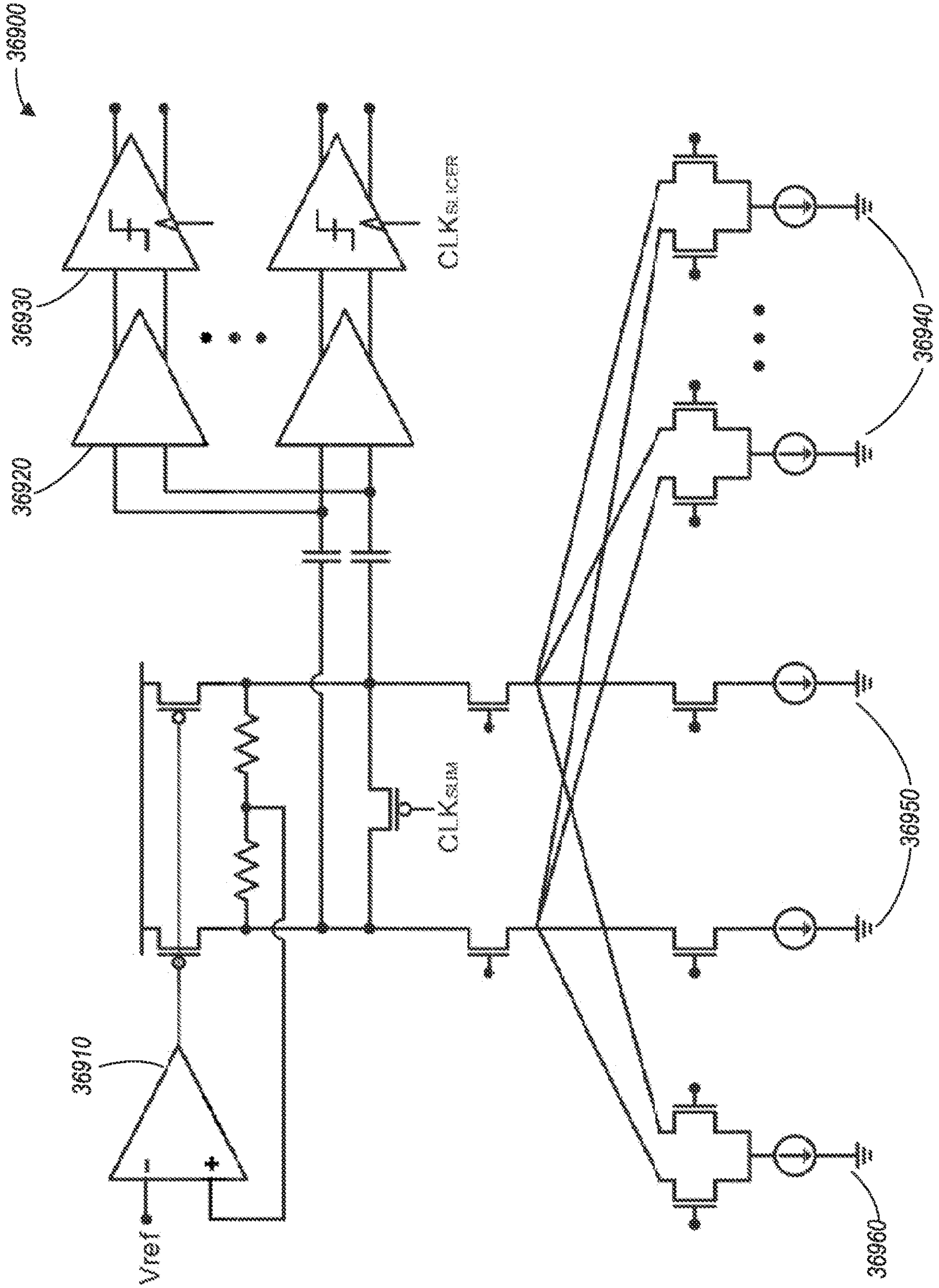

FIG. 369 is a schematic diagram that provides more details about the DFE summer design, according to some aspects.

Figure 370:
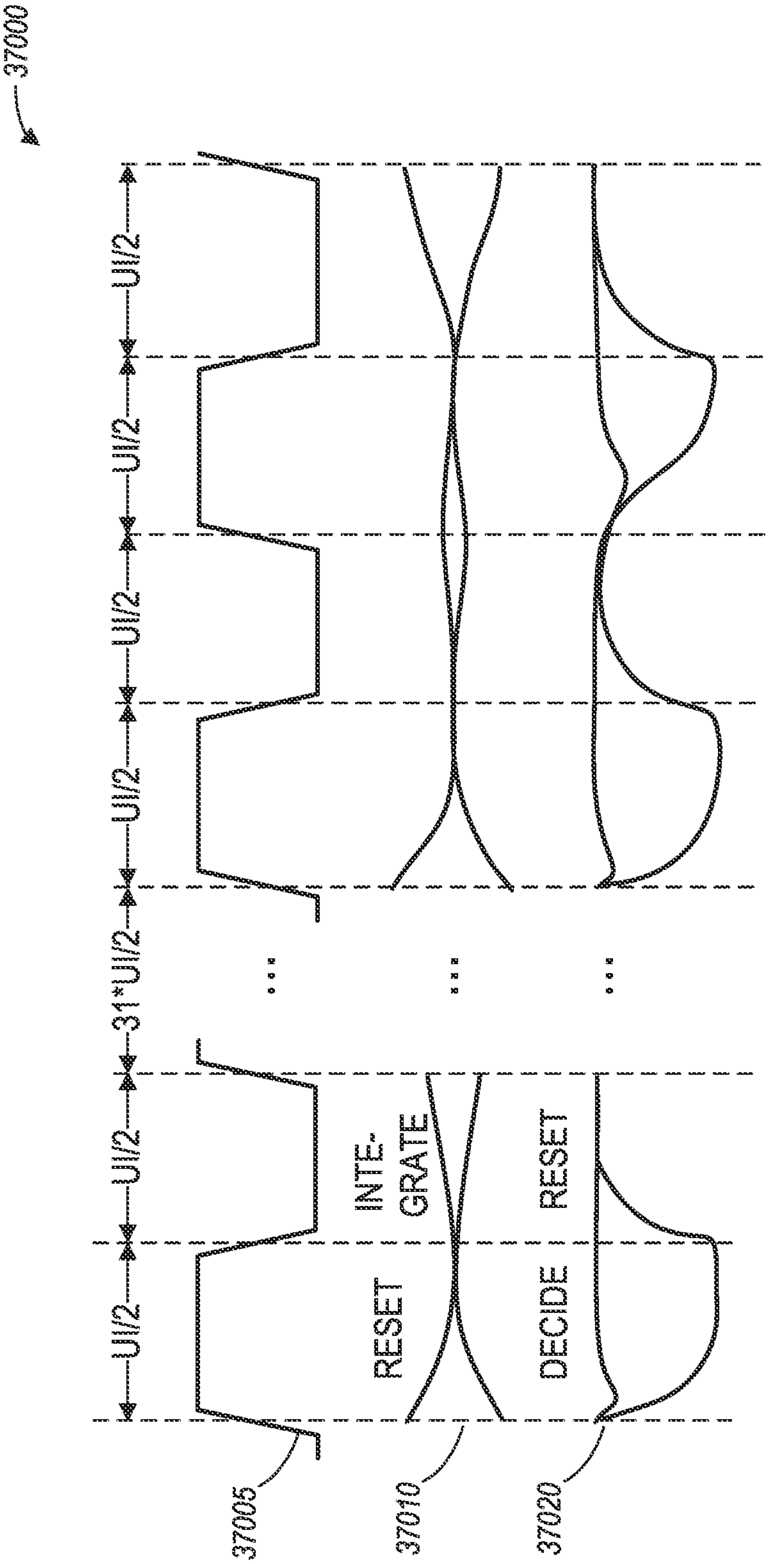

FIG. 370 is a graph related to the DFE summer design illustrating the clock signal with respect to the summing amplifier out signal and the strong-arm-1 signal, according to some aspects.

Figure 371:
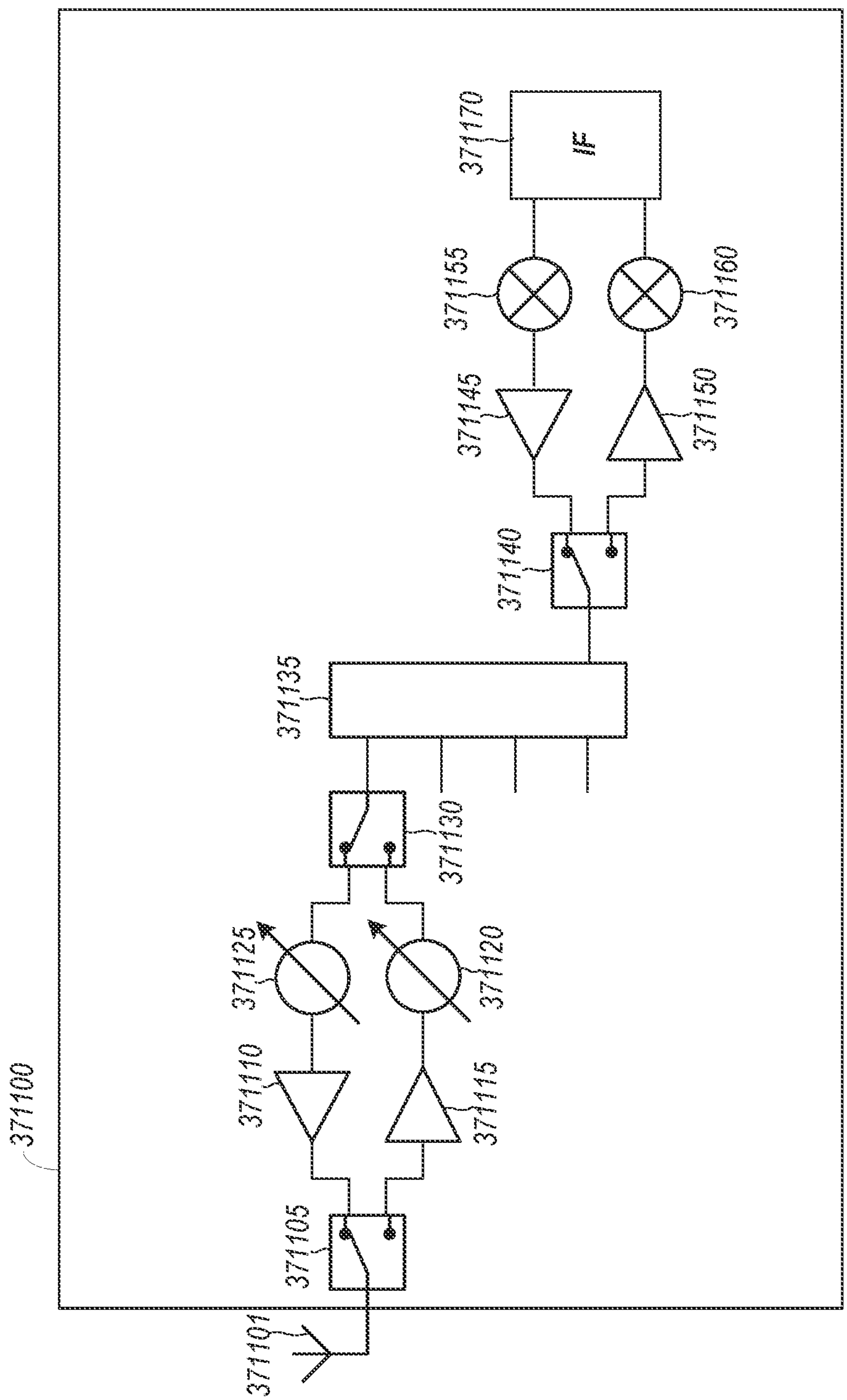

FIG. 371 is a schematic illustration of a block diagram of an RF device, in accordance with some demonstrative aspects.

Figure 372:
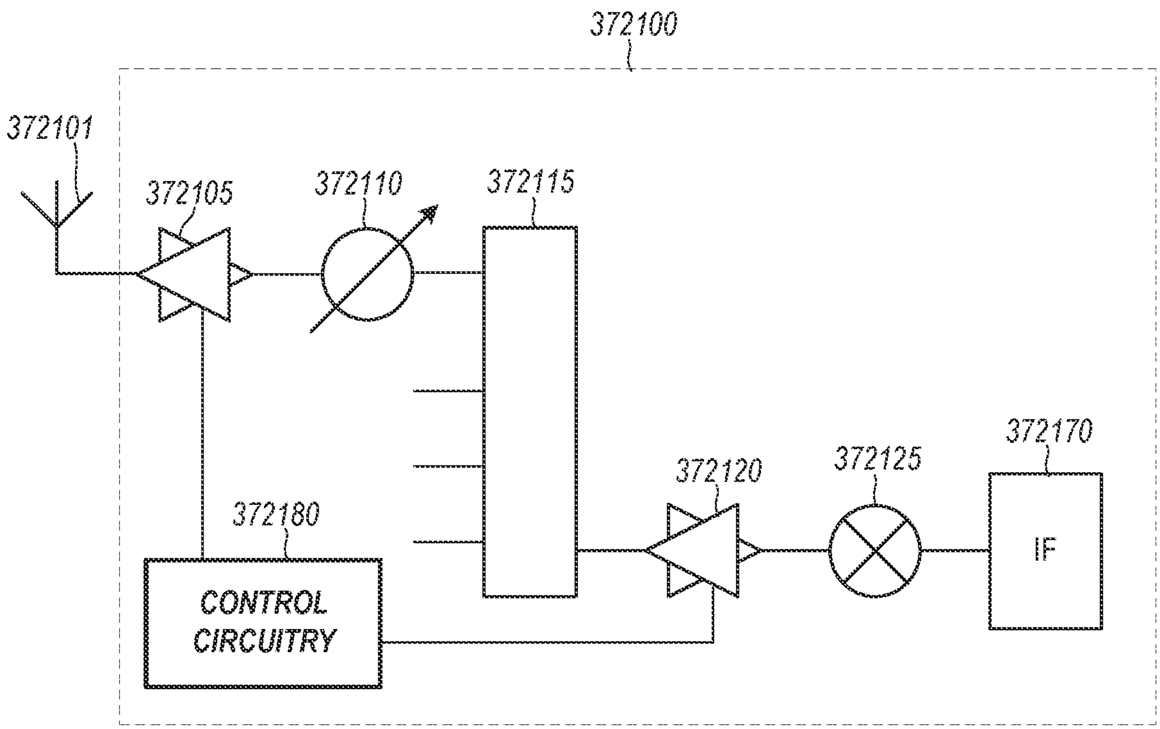

FIG. 372 is a schematic illustration of a block diagram of an RF device, in accordance with some demonstrative aspects.

Figure 373:
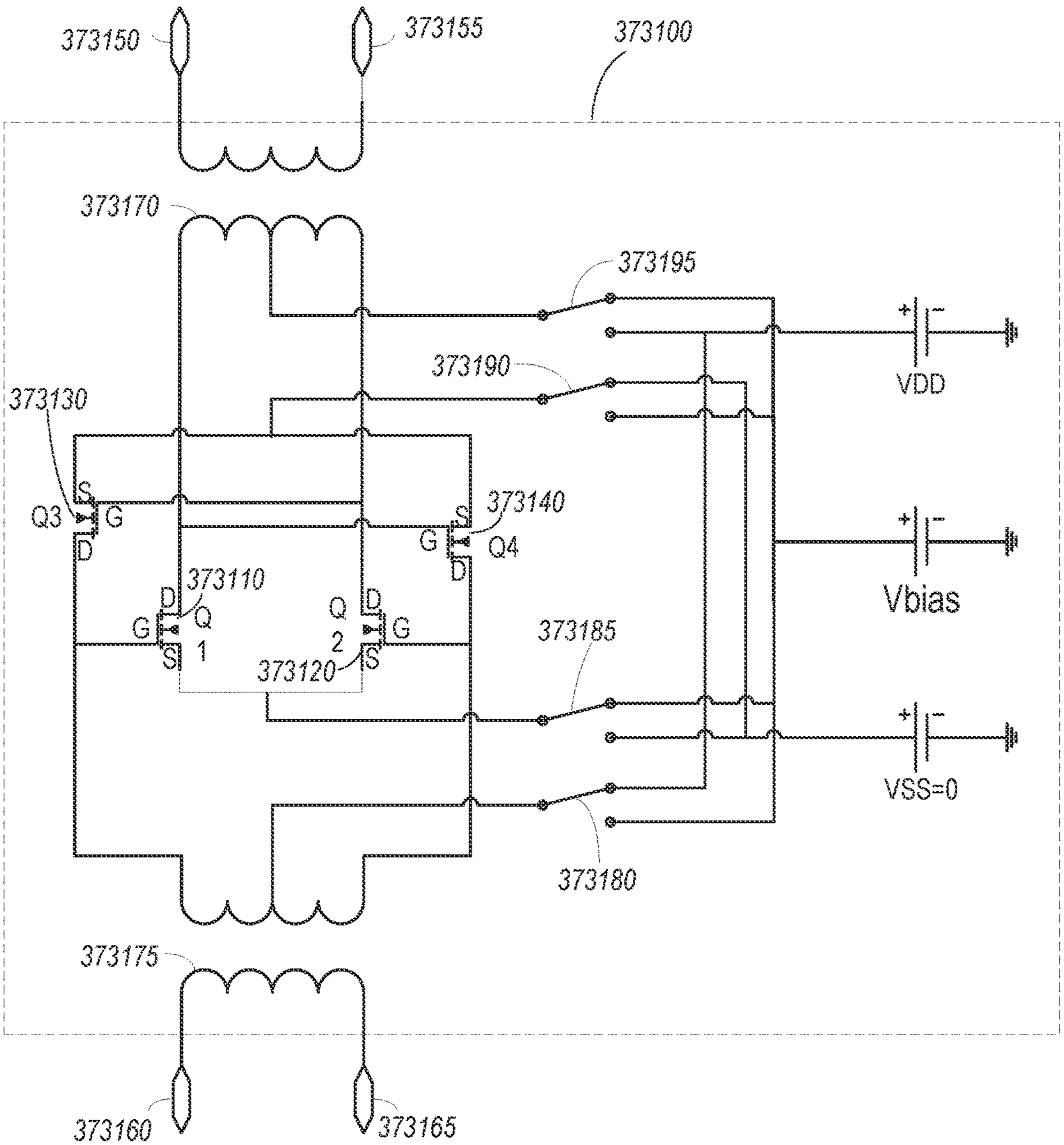

FIG. 373 is a schematic illustration of a bi-directional amplifier circuit, in accordance with some demonstrative aspects.

Figure 374:
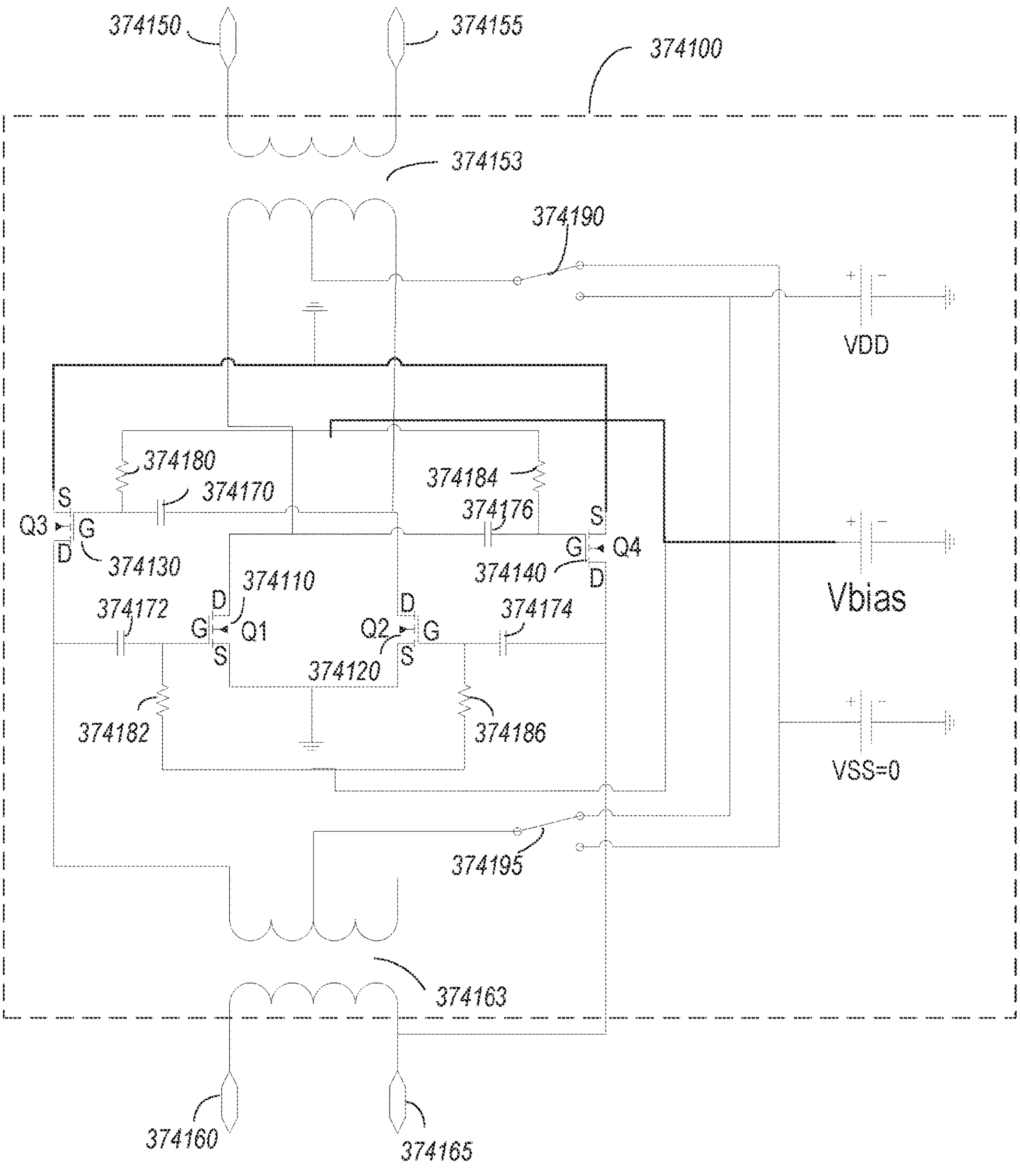

FIG. 374 is a schematic illustration of a bi-directional amplifier circuit, in accordance with some demonstrative aspects.

Figure 375:
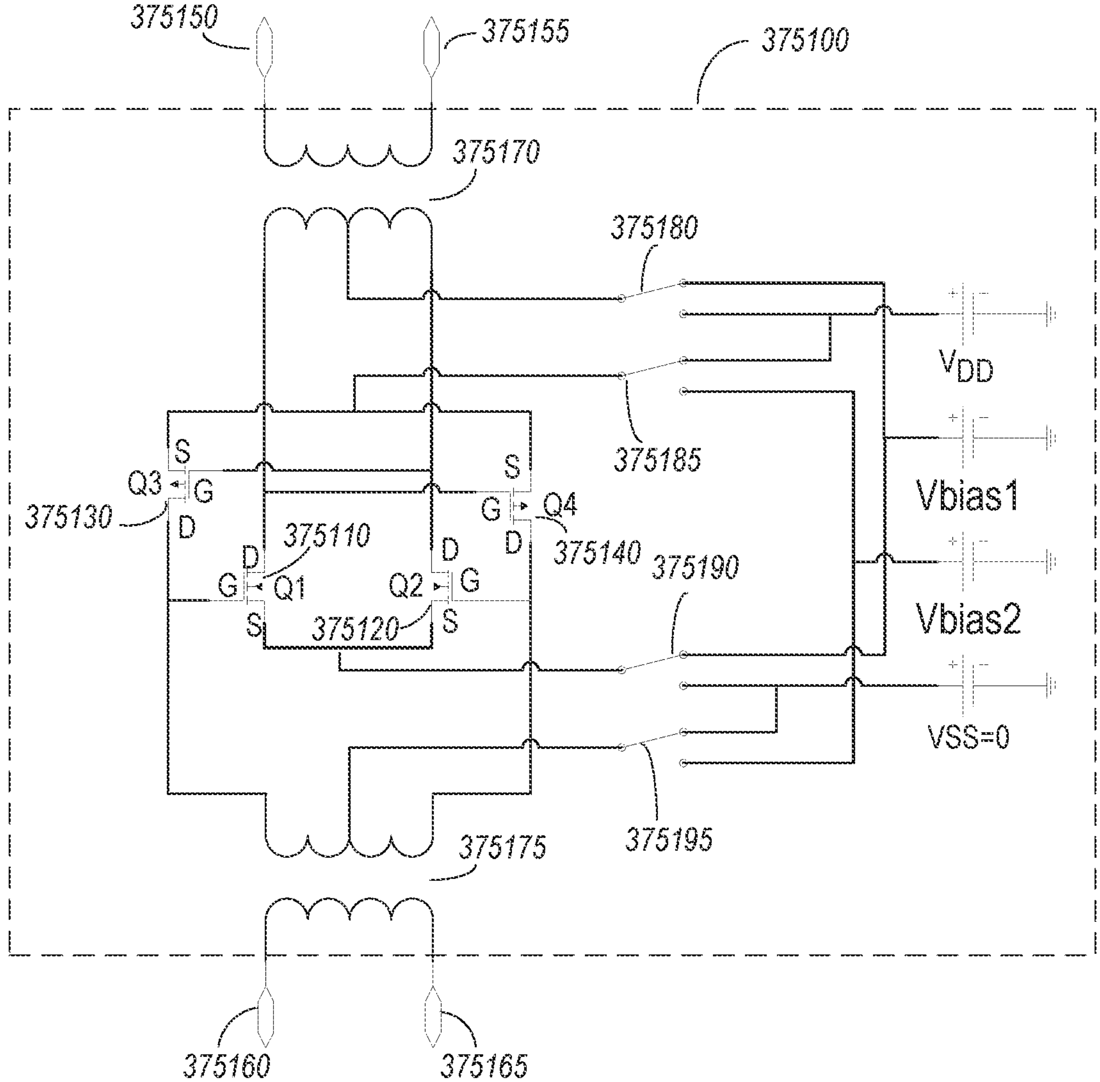

FIG. 375 is a schematic illustration of a bi-directional amplifier circuit, in accordance with some demonstrative aspects.

Figure 376:
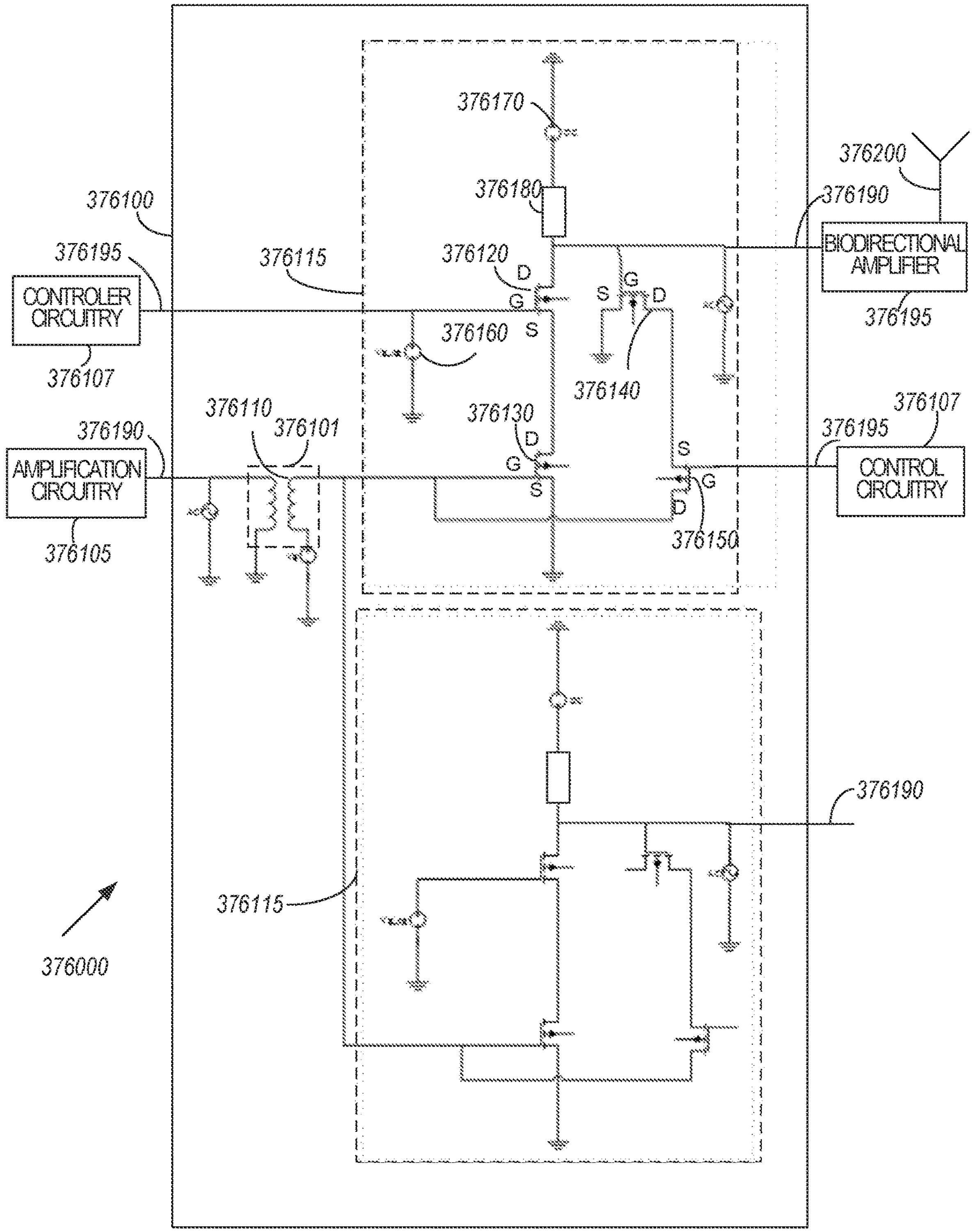

FIG. 376 is schematic illustration of a block diagram of a transceiver including a cascode topology of an active bidirectional splitter and combiner (ABDSC), in accordance with some demonstrative aspects.

Figure 377:
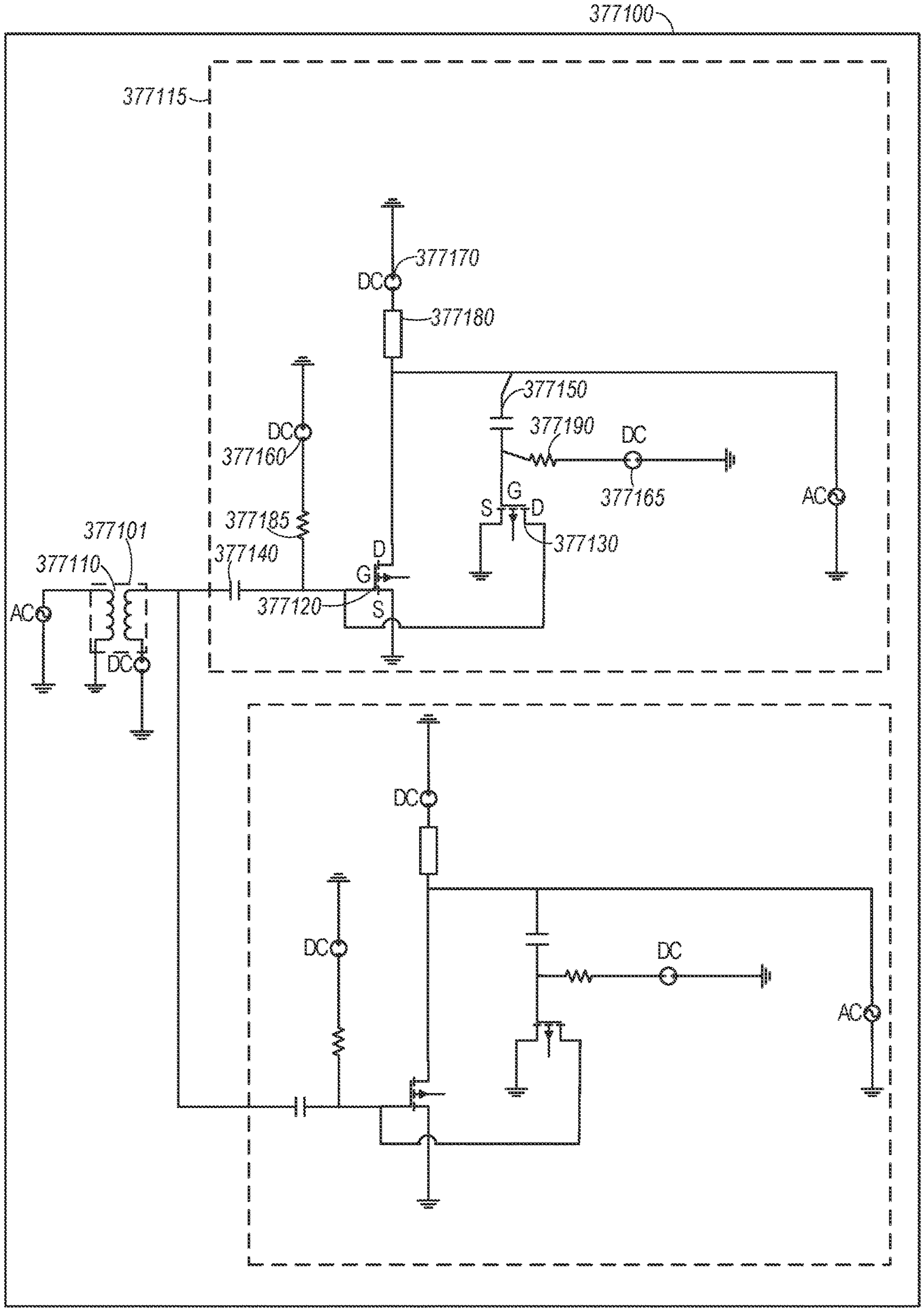

FIG. 377 is a schematic illustration of a circuit diagram of a common source topology of an ABDSC, in accordance with some demonstrative aspects.

Figure 378:
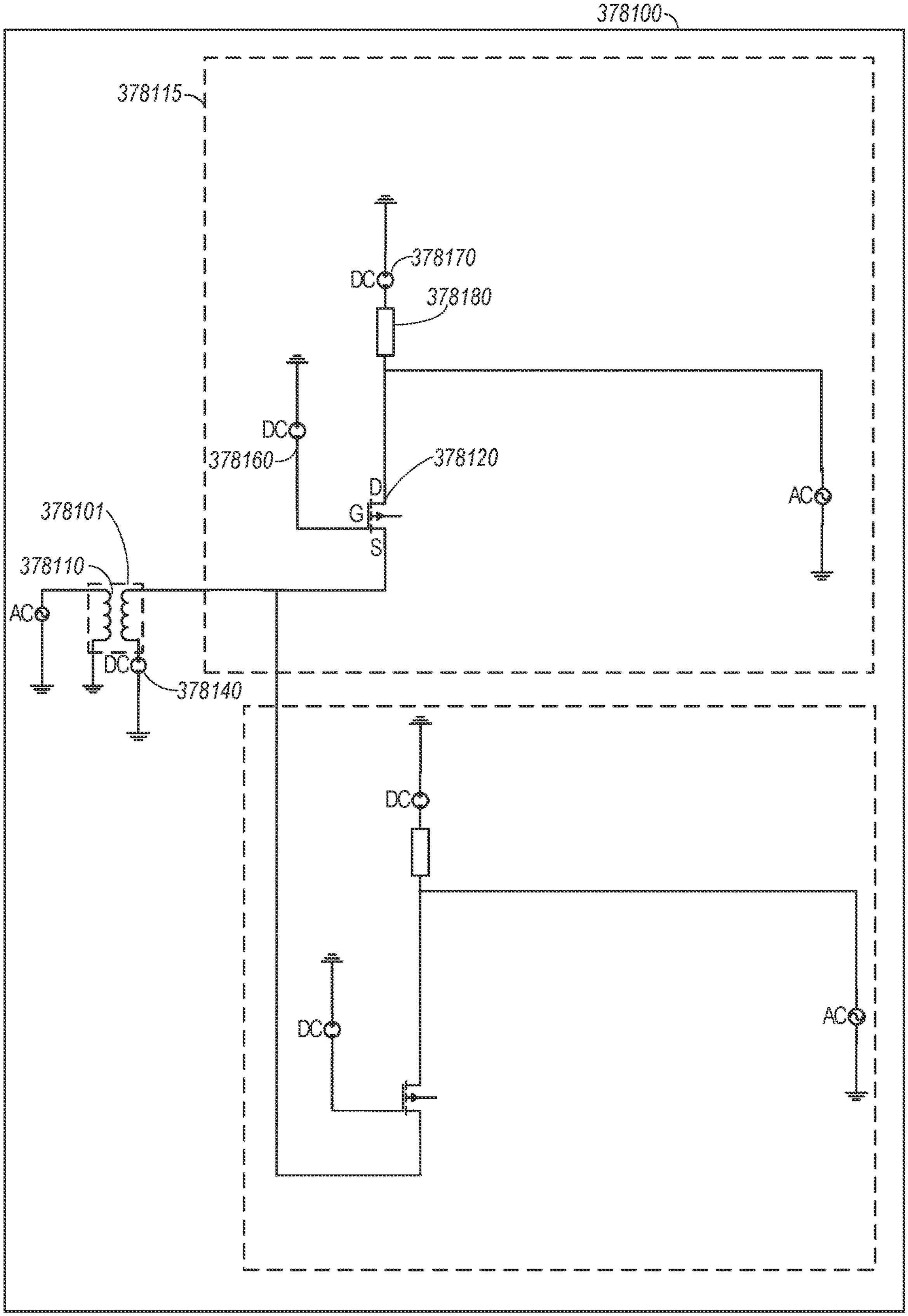

FIG. 378 is a schematic illustration of a common gate topology of an

ABDSC, in accordance with some demonstrative aspects.

Figure 379:
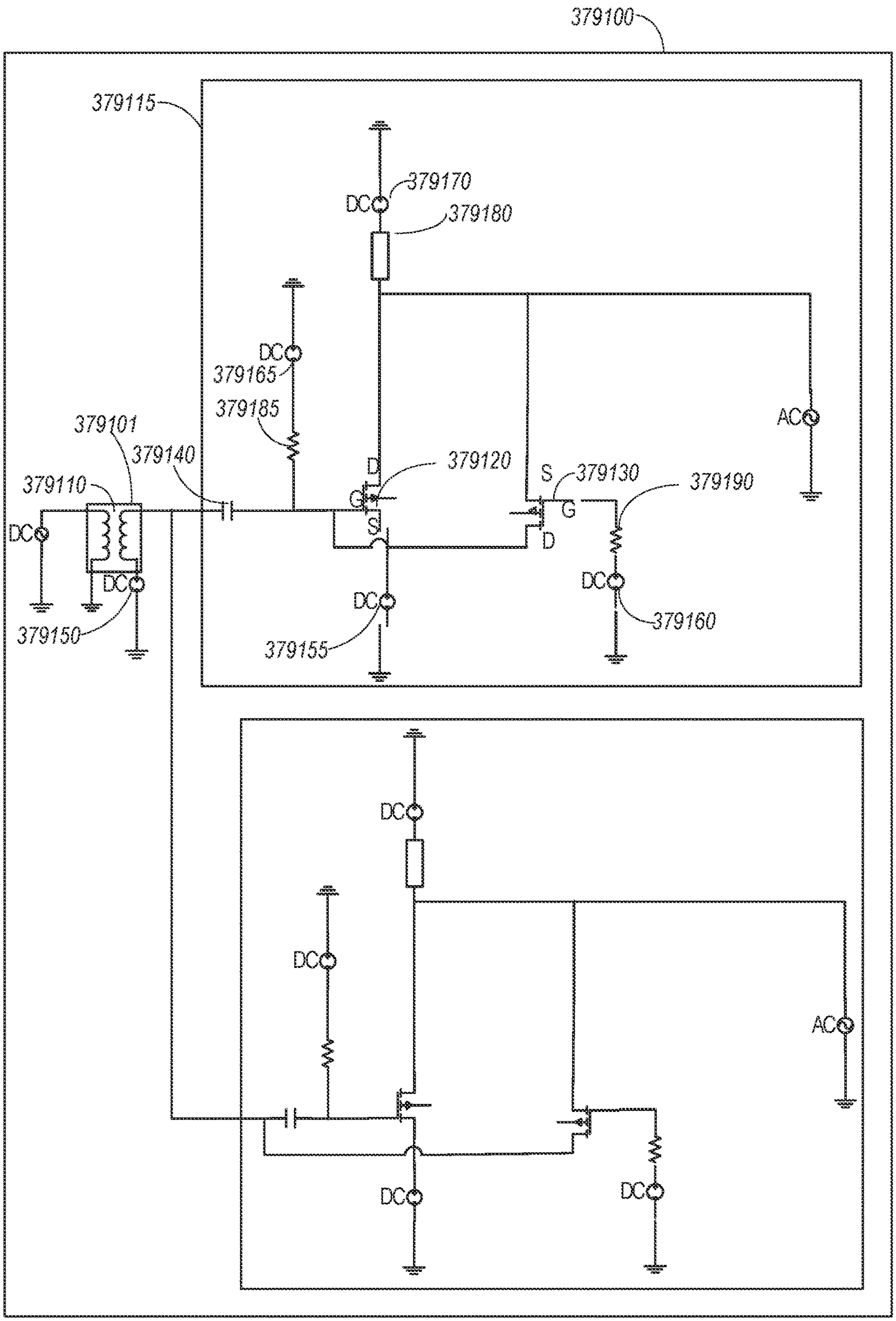

FIG. 379 is a schematic illustration of a common gate/common source (CS/CG) topology of an ABDSC, in accordance with some demonstrative aspects.

Figure 380:
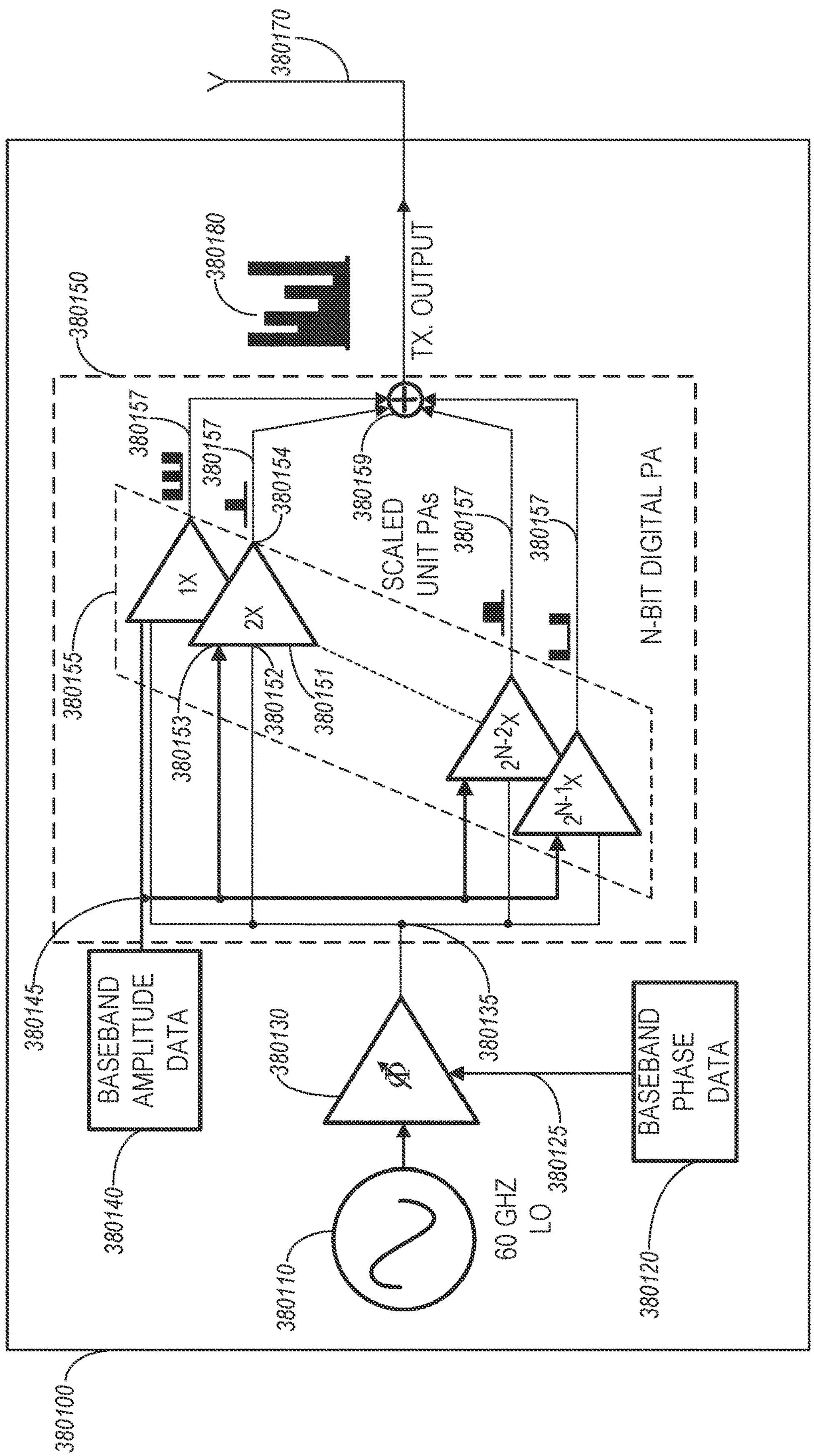

FIG. 380 is a schematic illustration of a block diagram of an architecture of a transmitter, in accordance with some demonstrative aspects.

Figure 381A:
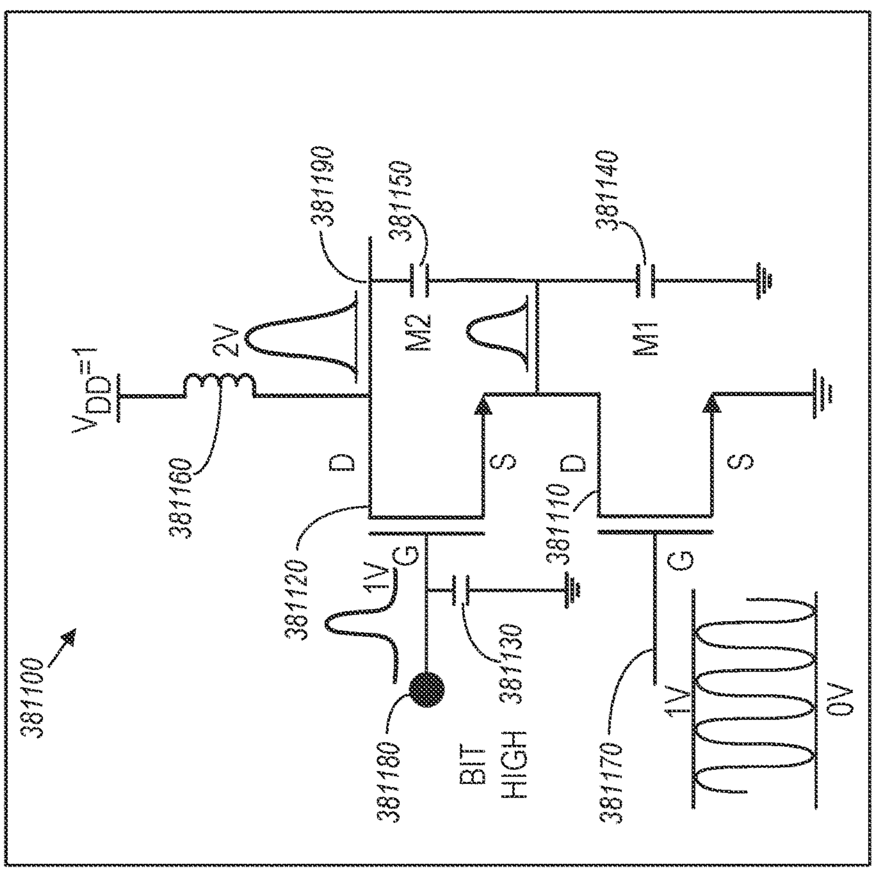

FIG. 381A is a schematic illustration of an electronic circuit of a stacked-gate control amplifier, in accordance with some demonstrative aspects.

Figure 381B:
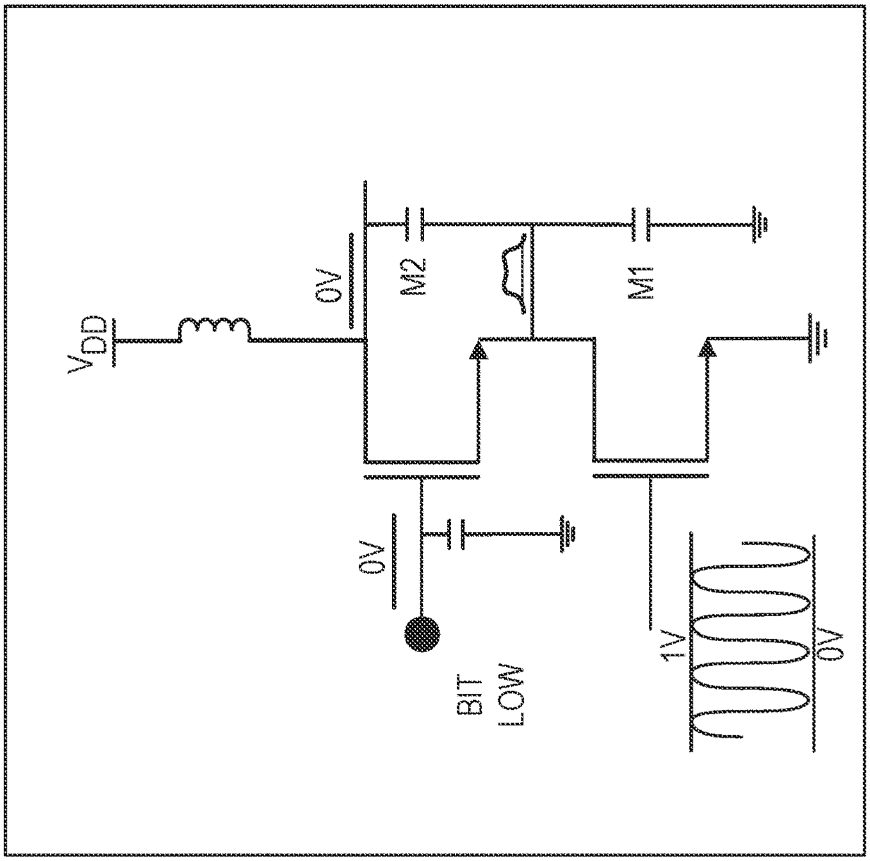

FIG. 381B is a schematic illustration of an electronic circuit of a stacked-gate control amplifier, in accordance with some demonstrative aspects.

Figure 382:
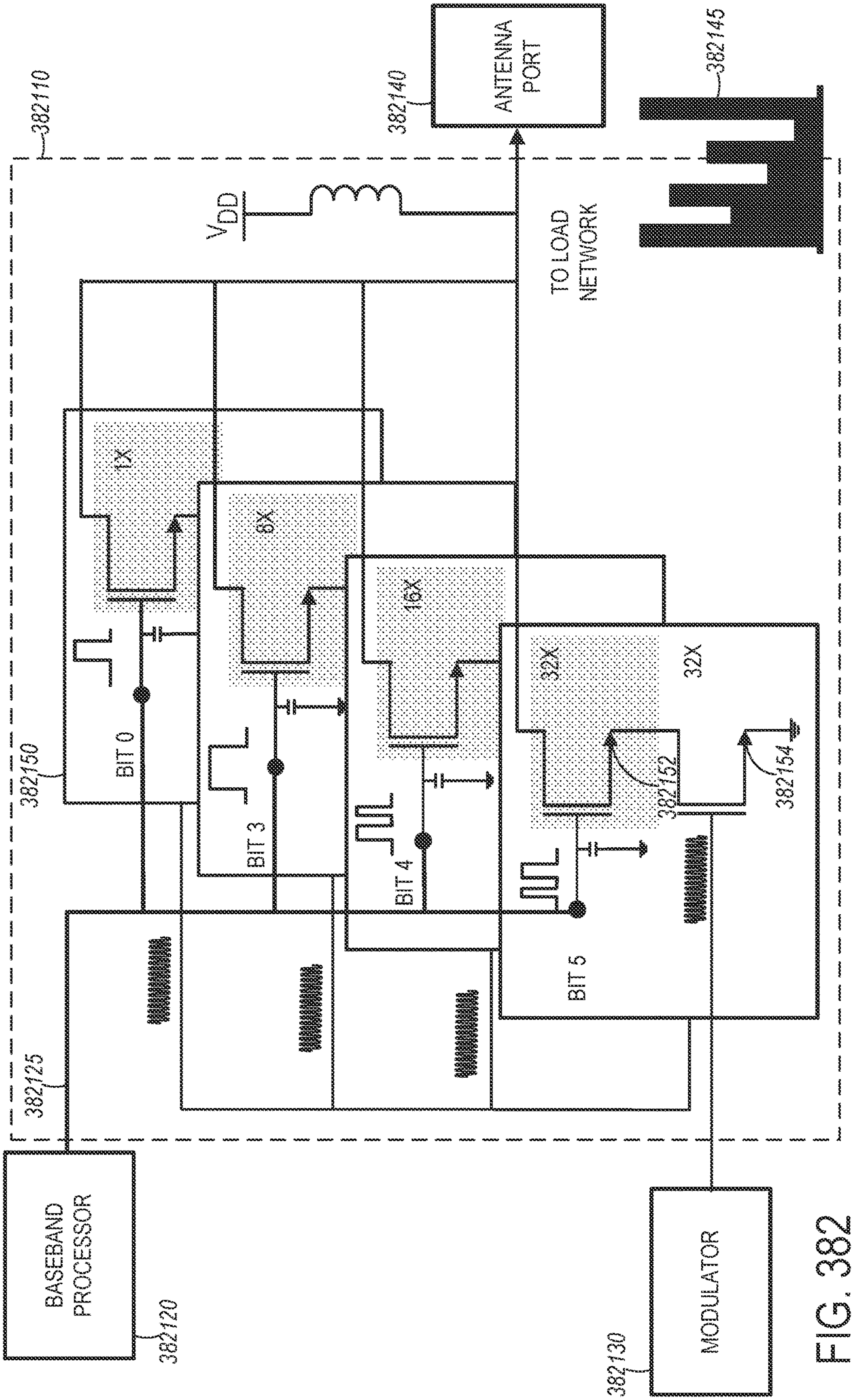

FIG. 382 is a schematic illustration of a block diagram of a transmitter including a stacked-gate modulated digital Power Amplifier (PA), in accordance with some demonstrative aspects.

Figure 383A:
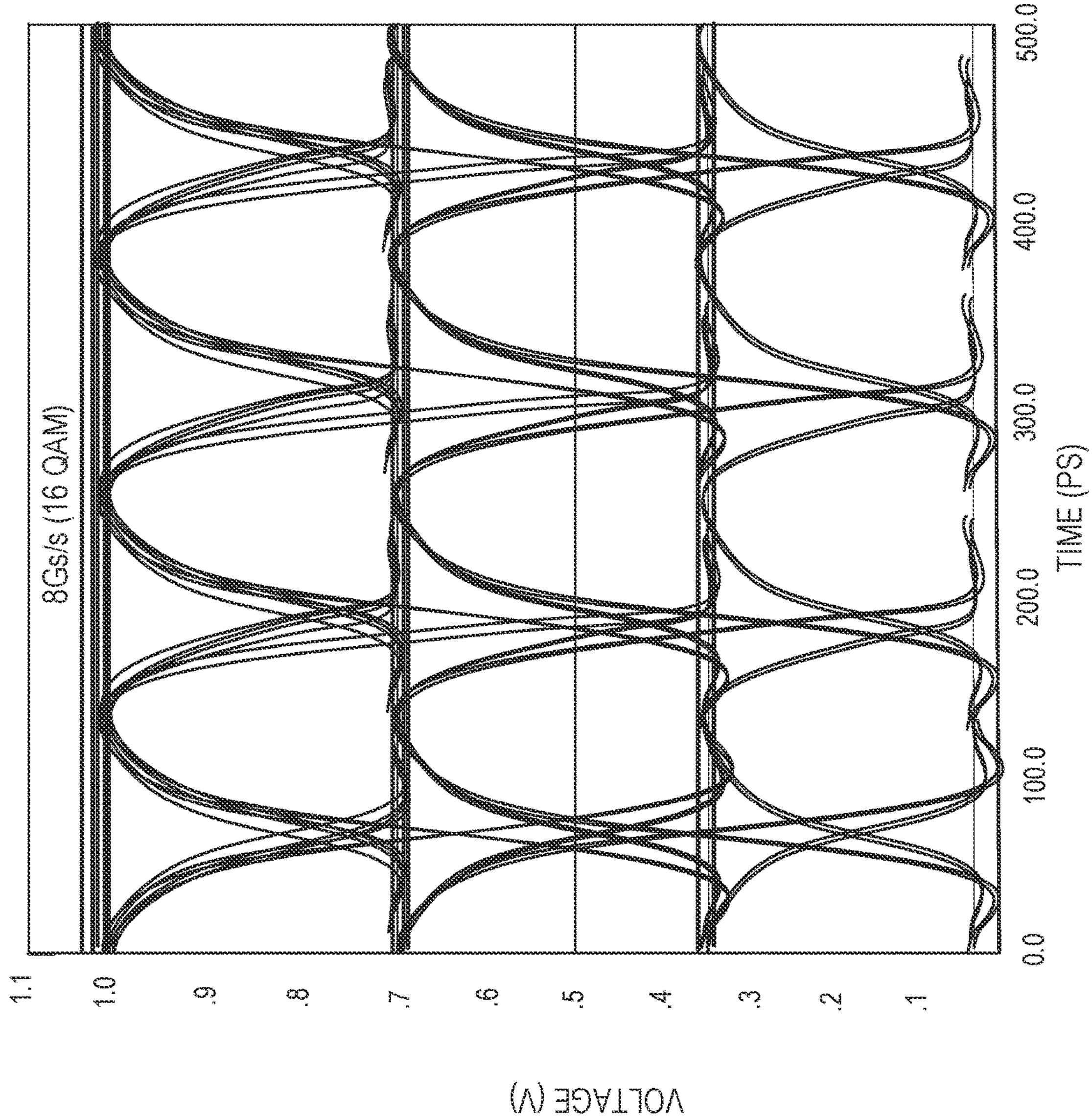
Figure 383B:
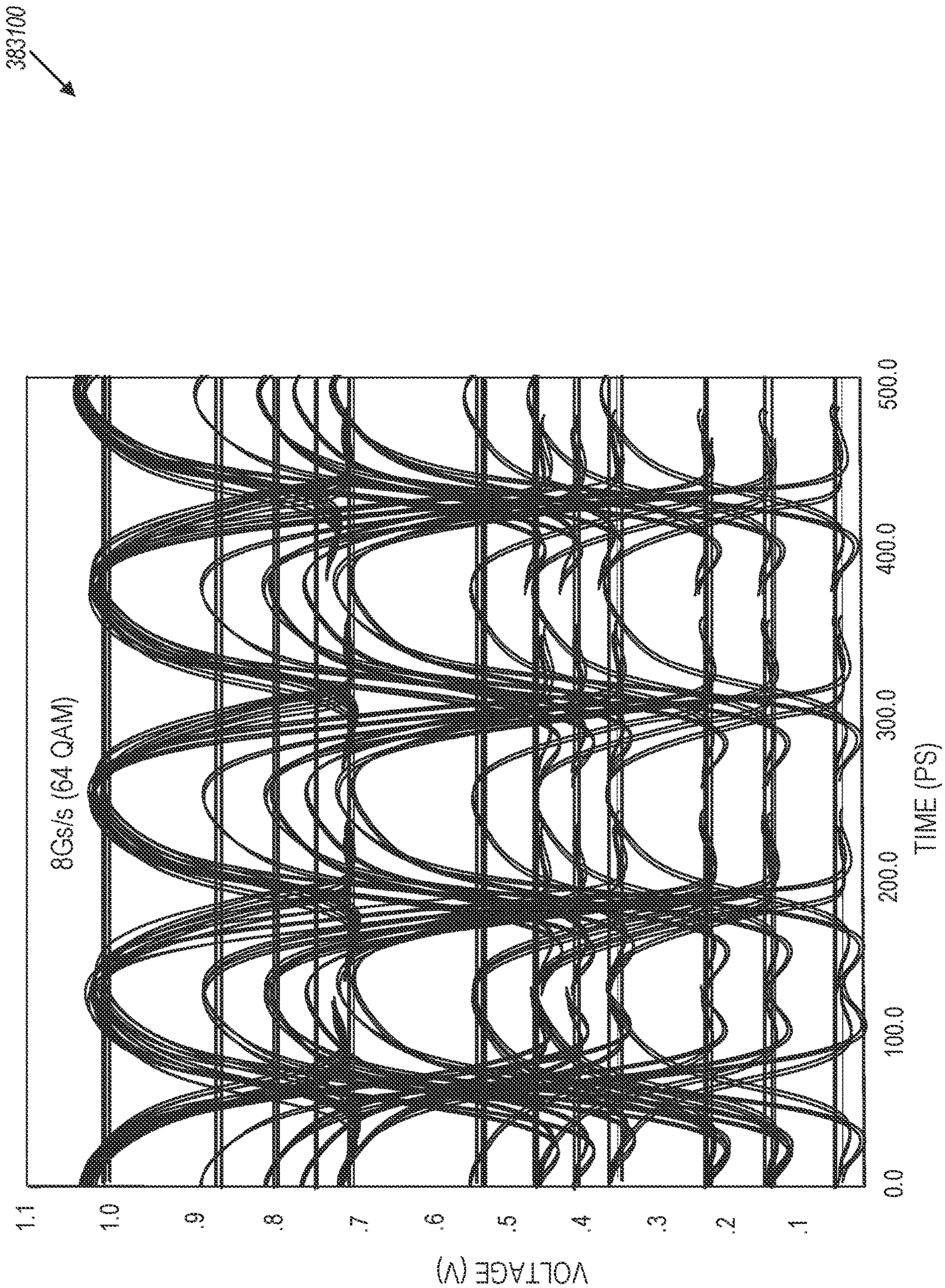

FIGS. 383A and 383B are schematic illustrations of a dynamic realization of a multi-level high speed eye diagram, in accordance with some demonstrative aspects.

Figure 384B:
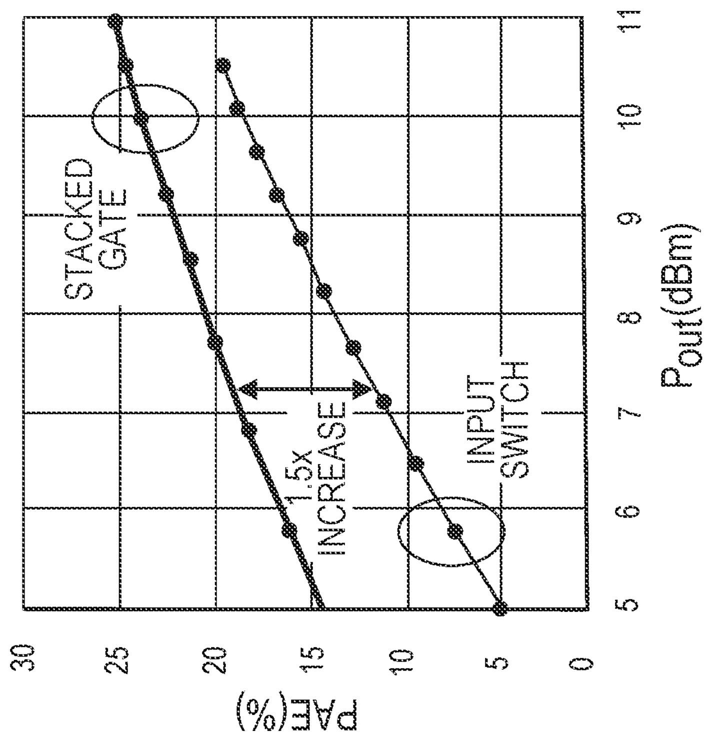
Figure 384A:
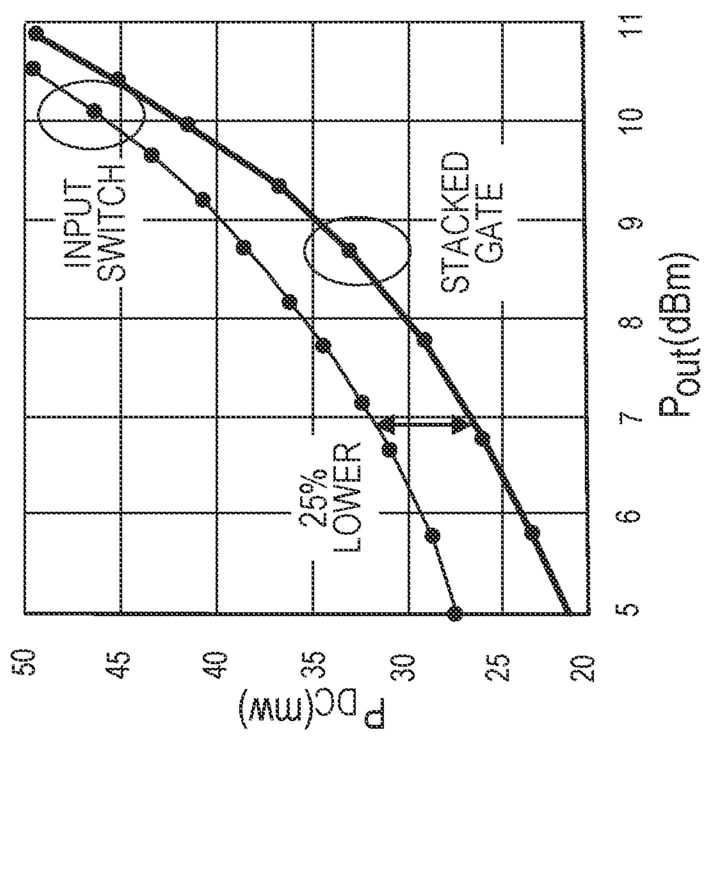

FIGS. 384A and 384B depict a performance improvement graph (FIG. 384A) and a power reduction graph (FIG. 384B) corresponding to an input series switch amplifier, in accordance with some demonstrative aspects.

Figure 385B:
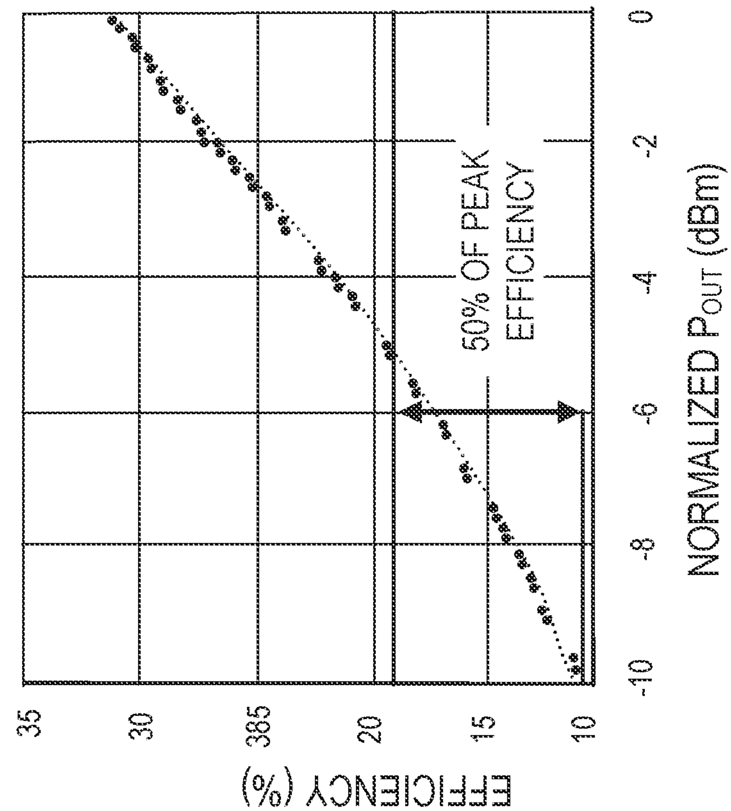
Figure 385A:
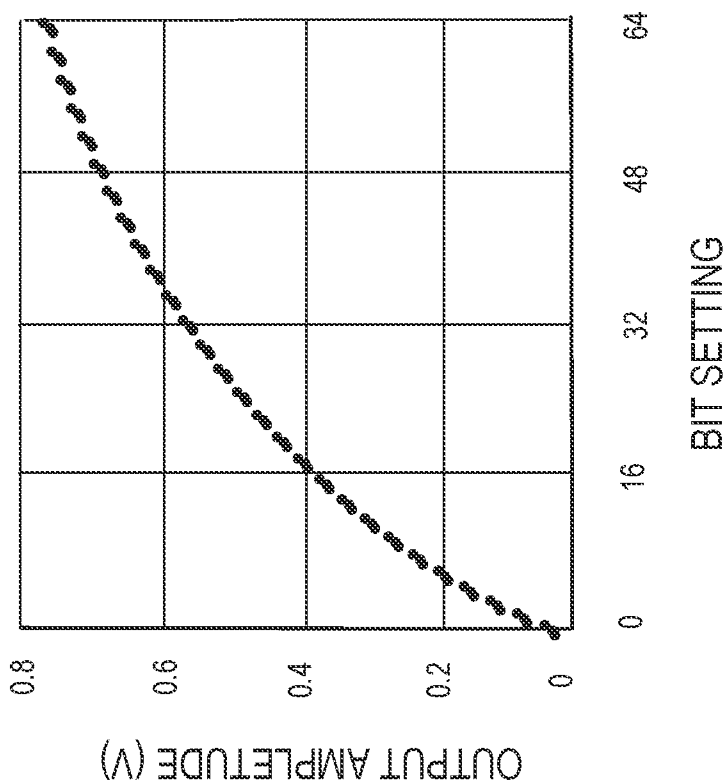

FIG. 385A and FIG. 385B depict an amplitude resolution graph (FIG. 385A) and a power efficiency graph (FIG. 385B), corresponding to an N bit digital PA, in accordance with some demonstrative aspects.

Figure 386:
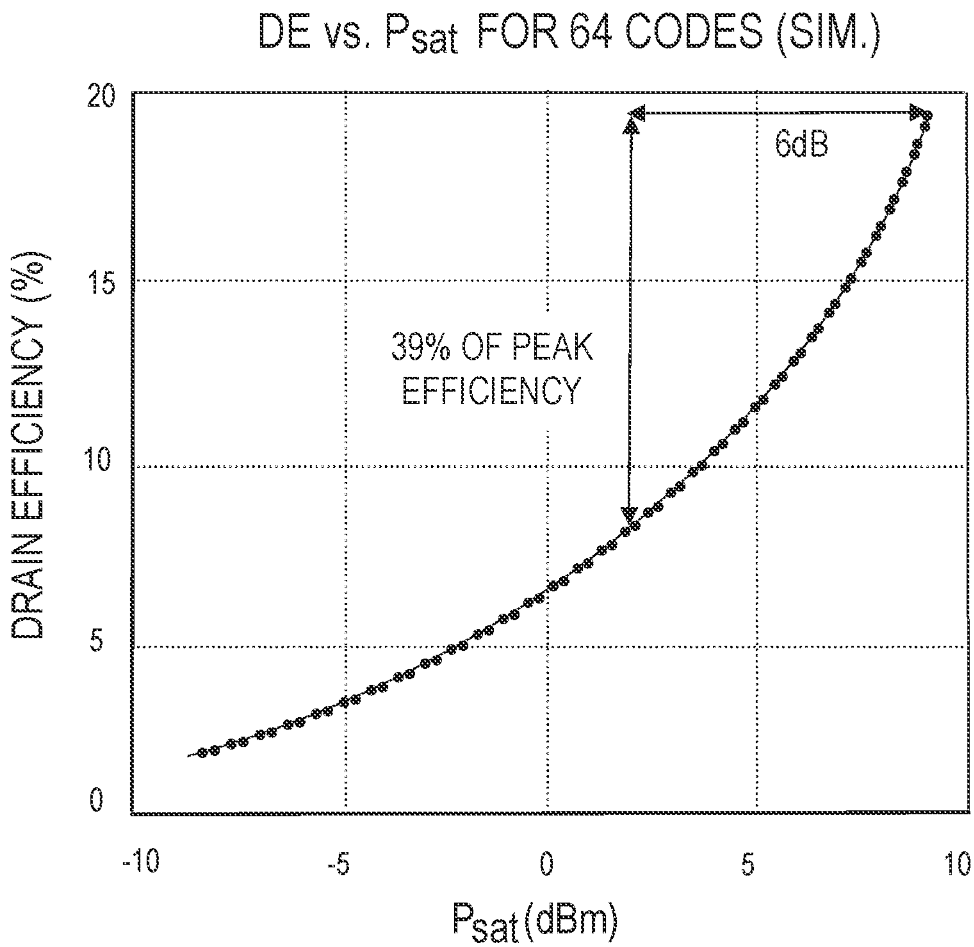

FIG. 386 depicts a drain efficiency versus power saturation of a stacked gate-controlled amplifier with a driver amplifier before it, in accordance with some demonstrative aspects.

Figure 387:
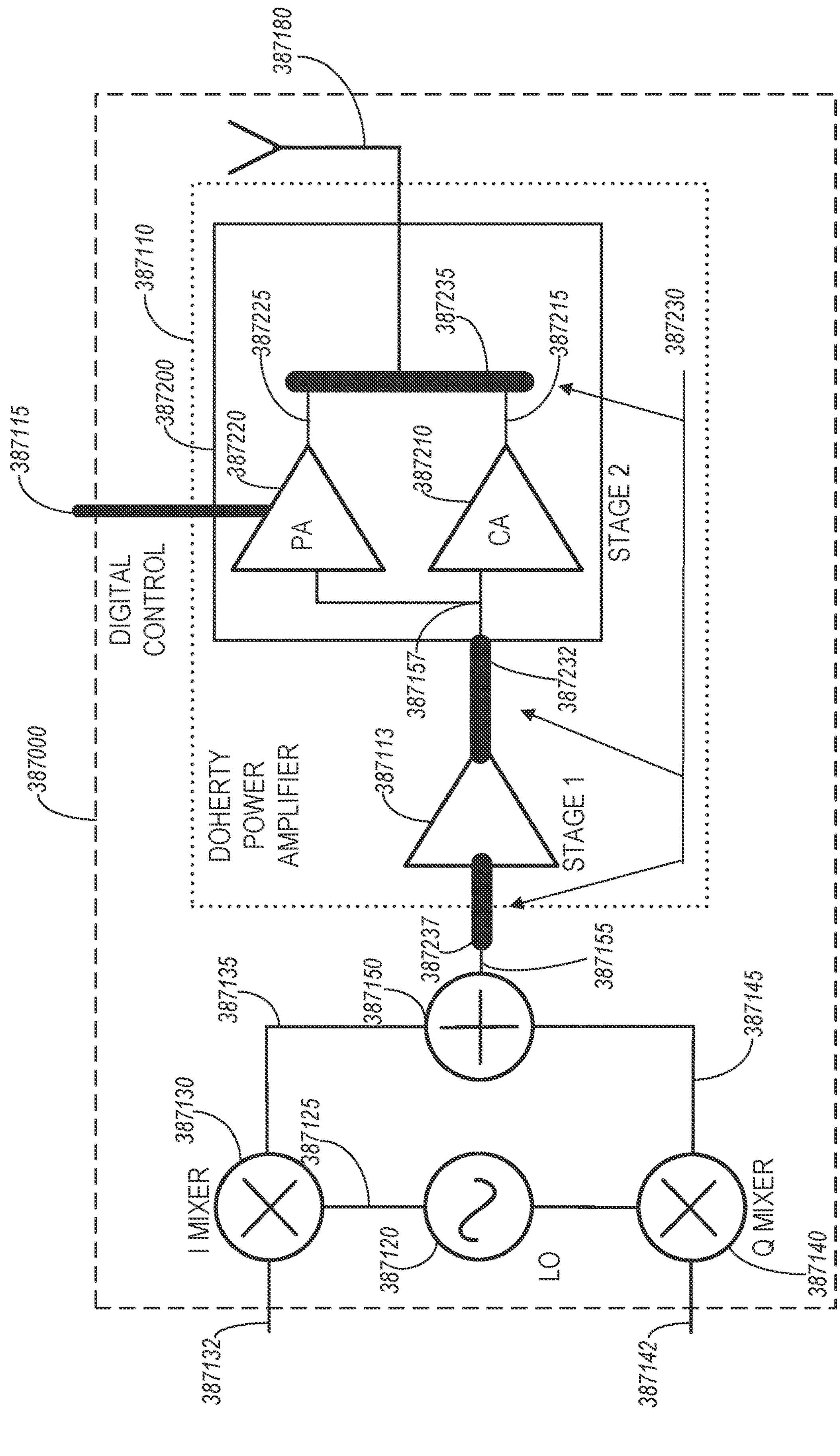

FIG. 387 is a schematic illustration of a block diagram of a transmitter, in accordance with some demonstrative aspects.

Figure 388:
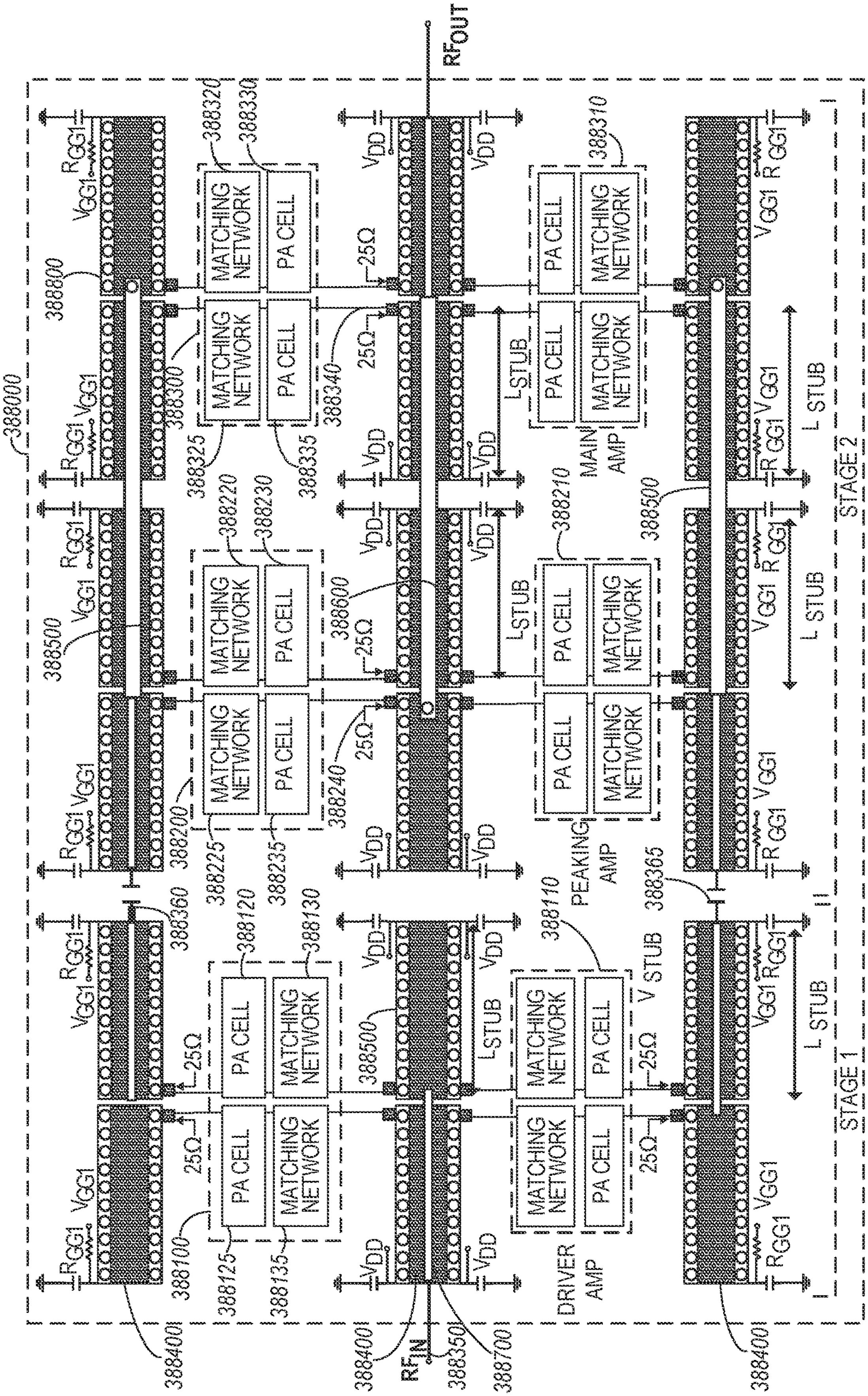

FIG. 388 is a schematic illustration of a block diagram of a two-stage Doherty amplifier, which may employ a Sub-Quarter Wavelength (SQWL) balun, in accordance with some demonstrative aspects.

Figure 389:
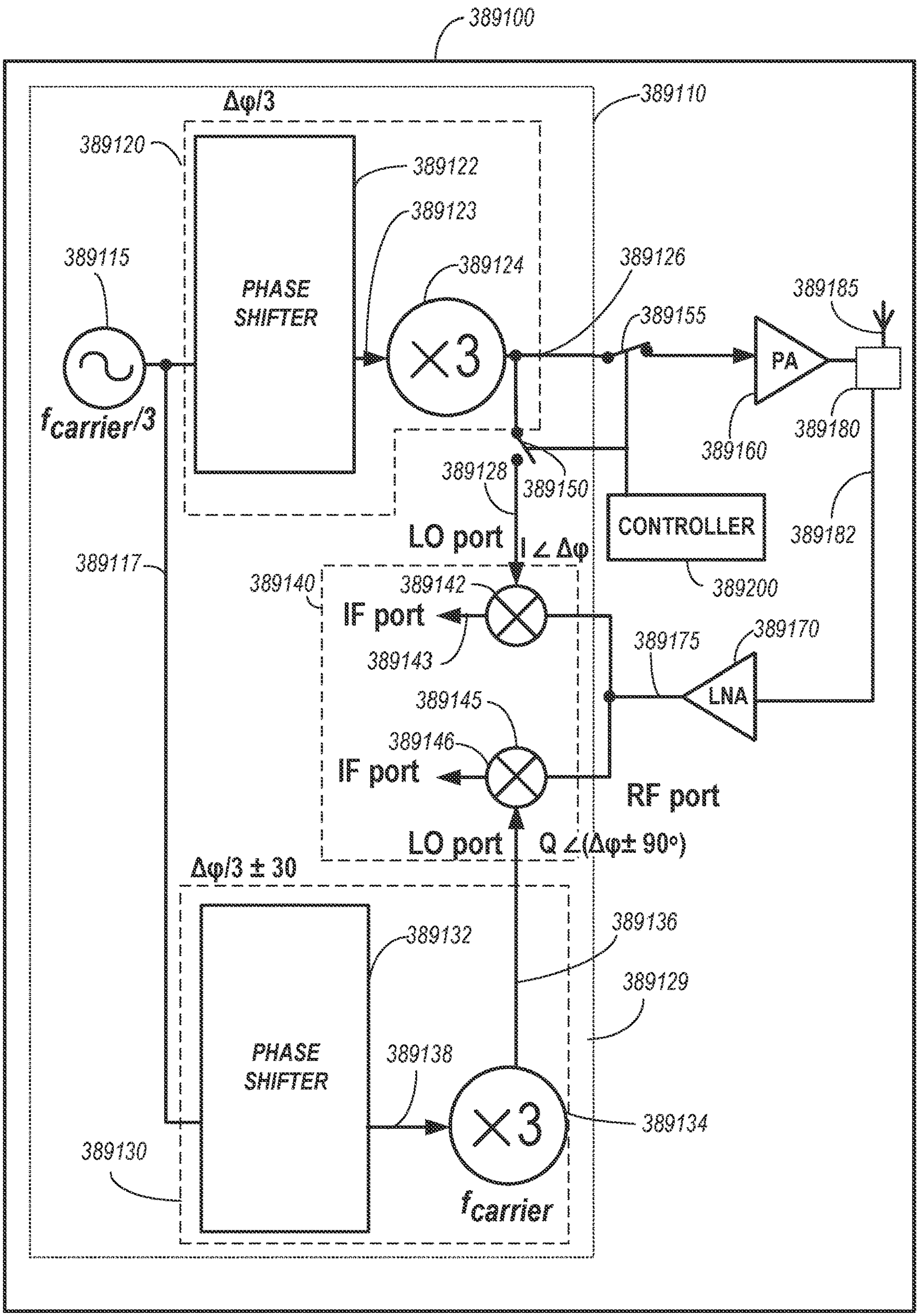

FIG. 389 is a schematic illustration of a block diagram of a transceiver, in accordance with some demonstrative aspects.

Figure 390:
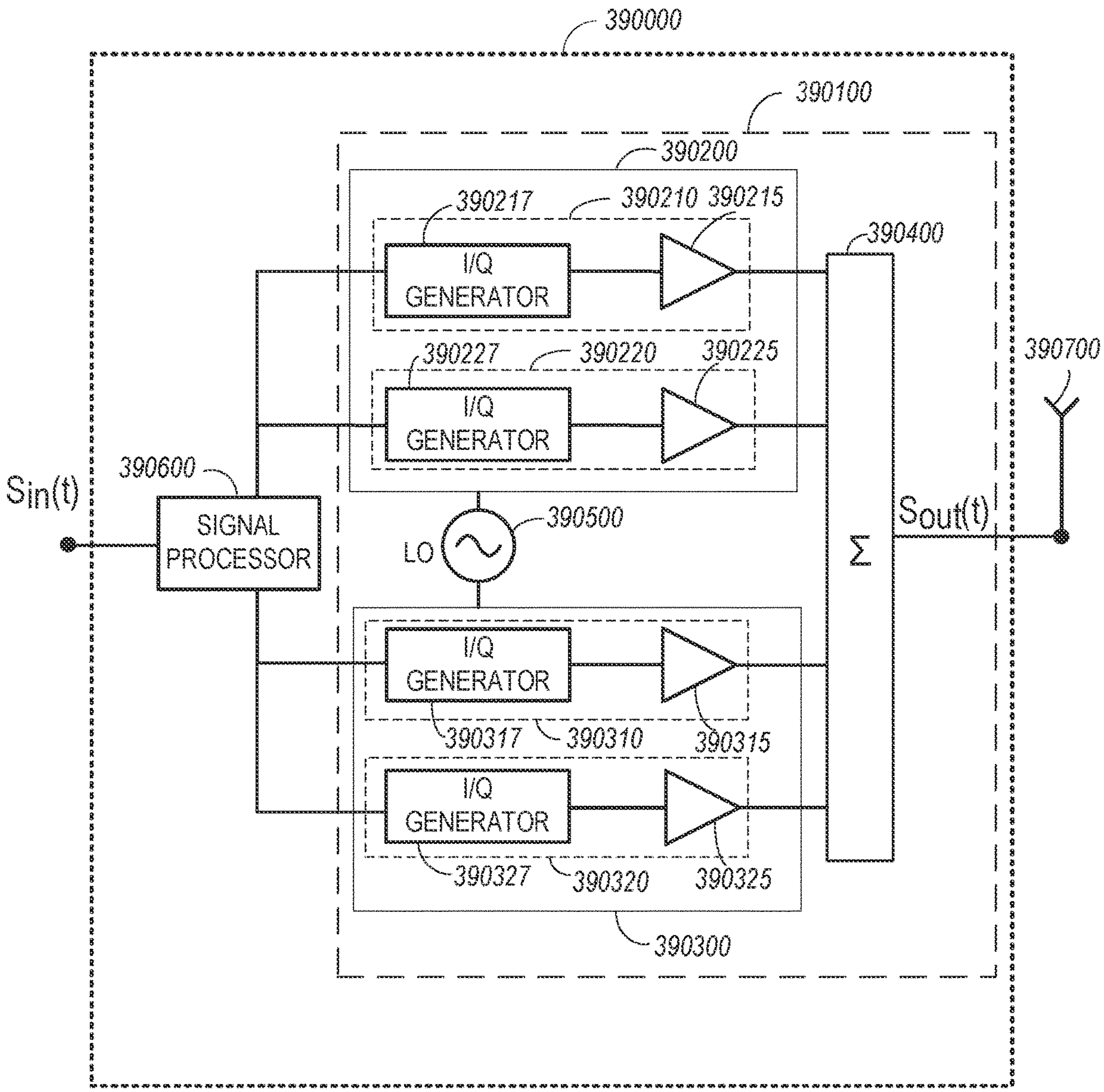

FIG. 390 is a schematic illustration of a block diagram of a transmitter, in accordance with some demonstrative aspects.

Figure 391:
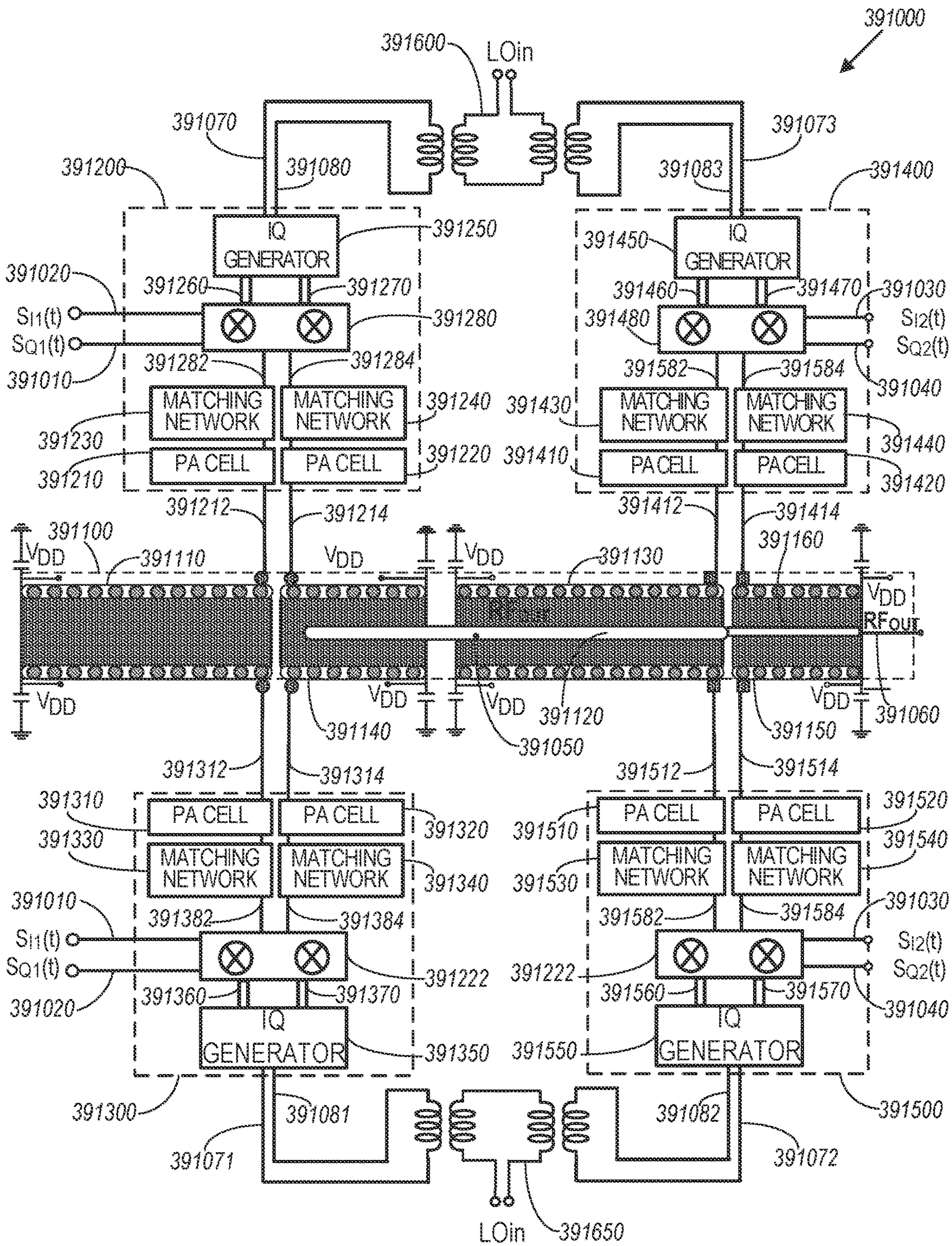

FIG. 391 is a schematic illustration of a block diagram of an outphasing amplifier employing an SQWL balun as a load, in accordance with some demonstrative aspects.

Figure 392:
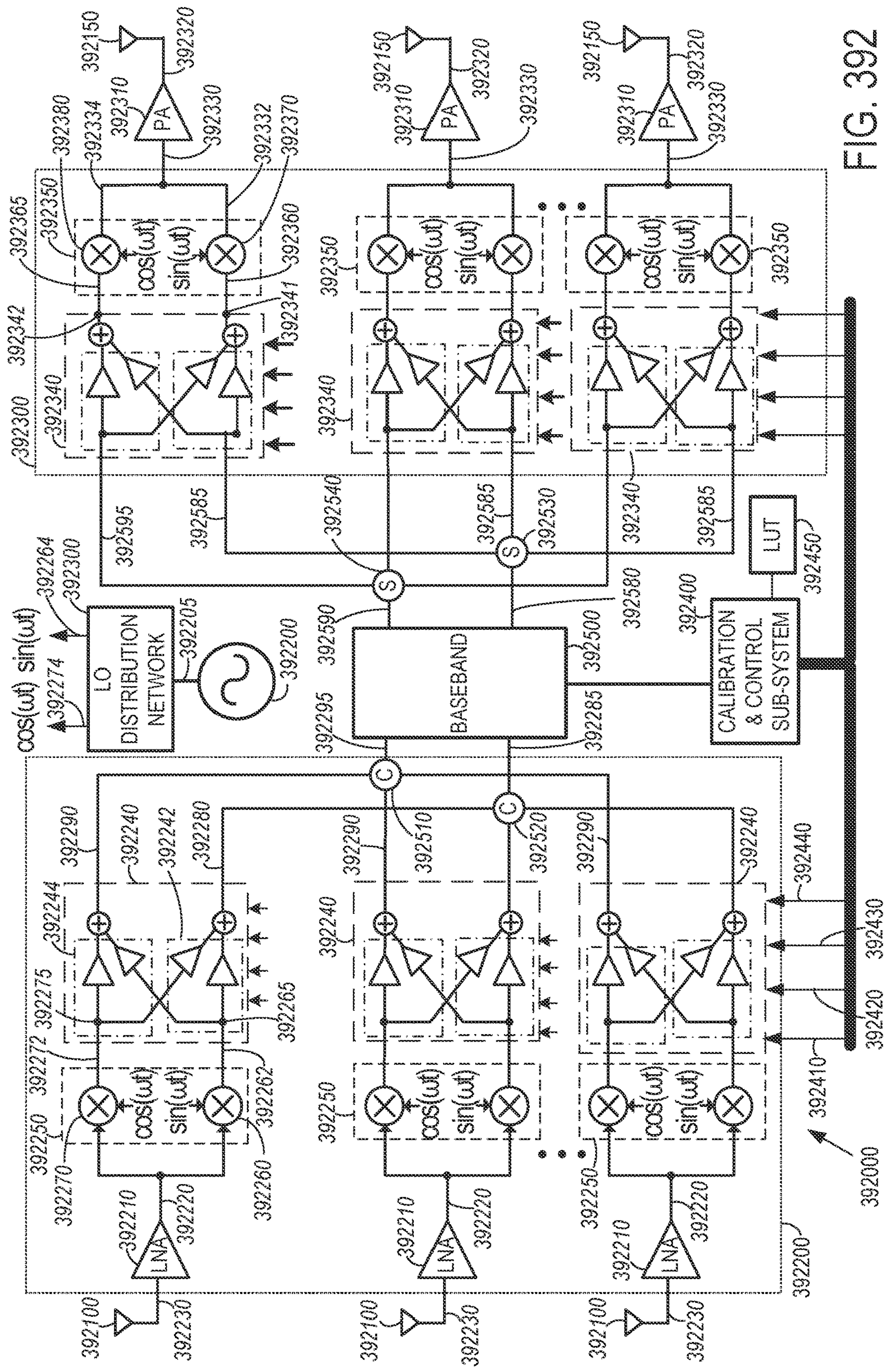

FIG. 392 is a schematic illustration of a block diagram of a transceiver, in accordance with some demonstrative aspects.

Figure 393:
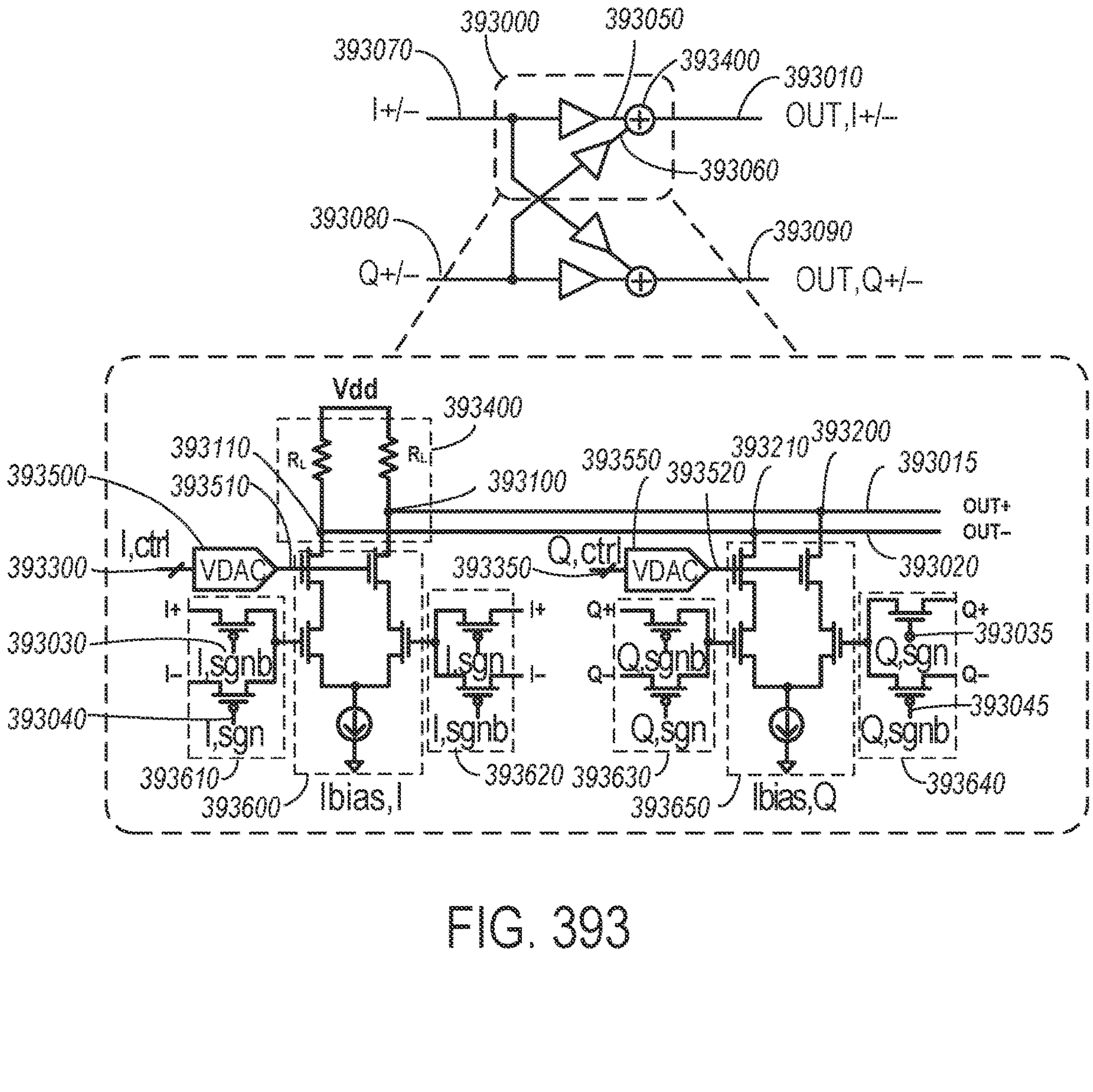

FIG. 393 is a schematic illustration of an electronic circuit plan of phase shifting circuitry, in accordance with some demonstrative aspects.

Figure 394:
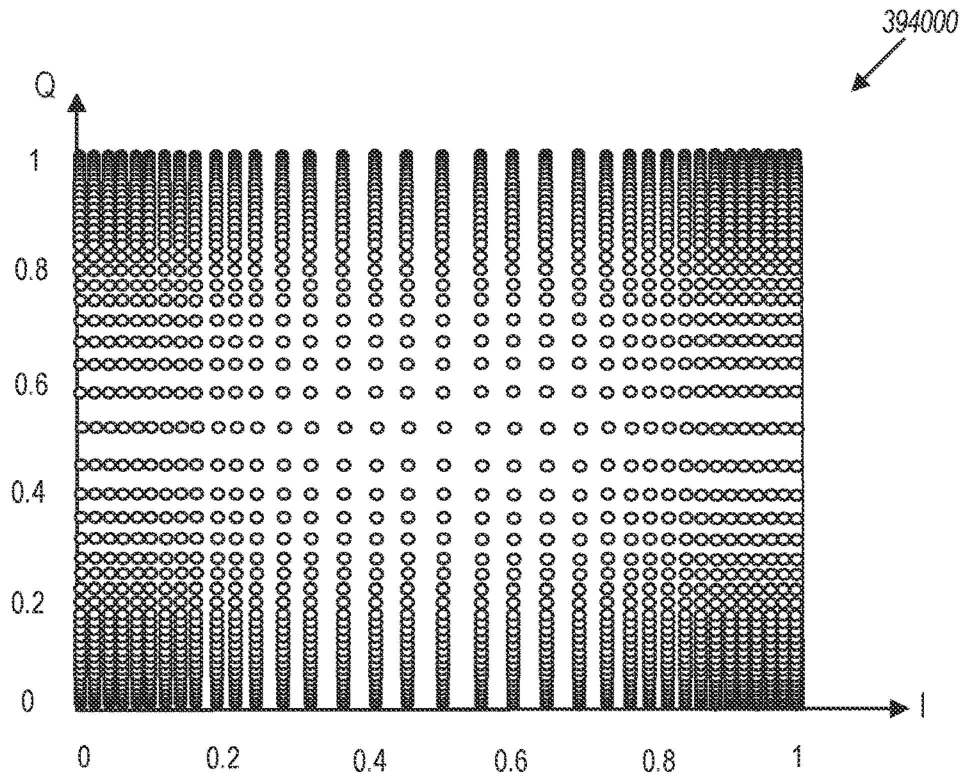

FIG. 394 is a schematic illustration of a first quadrant of a constellation-point map, in accordance with some demonstrative aspects.

Figure 395:
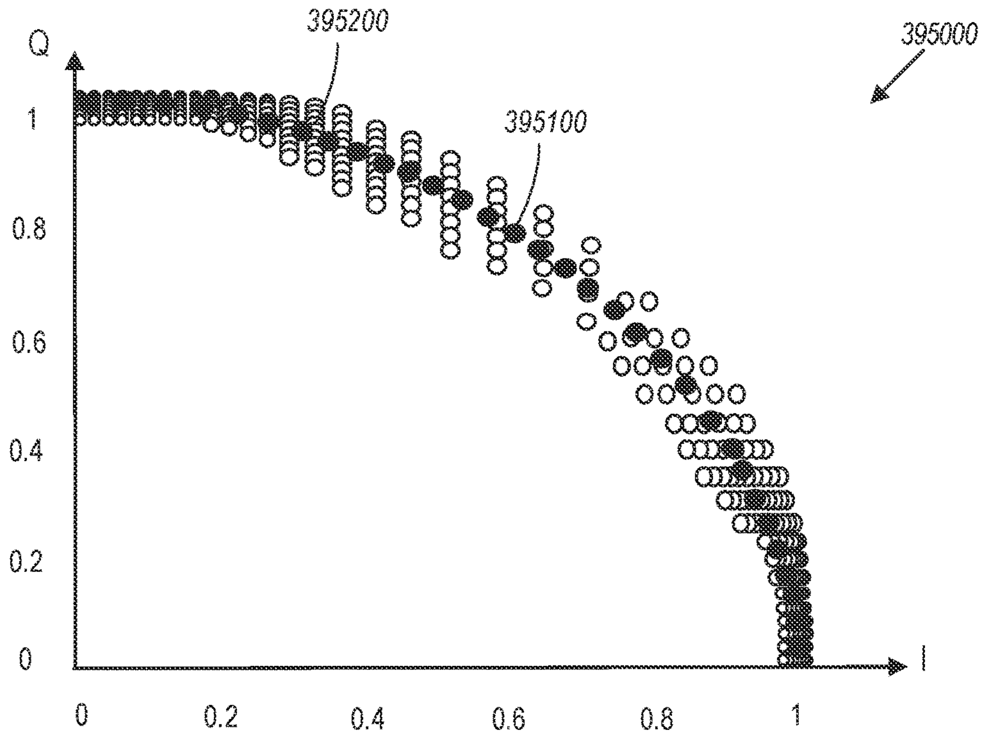

FIG. 395 is a schematic illustration of a graph depicting a gain variation of constellation points verses ideal phase shifted constellation points, in accordance with some demonstrative aspects.

Figure 396:
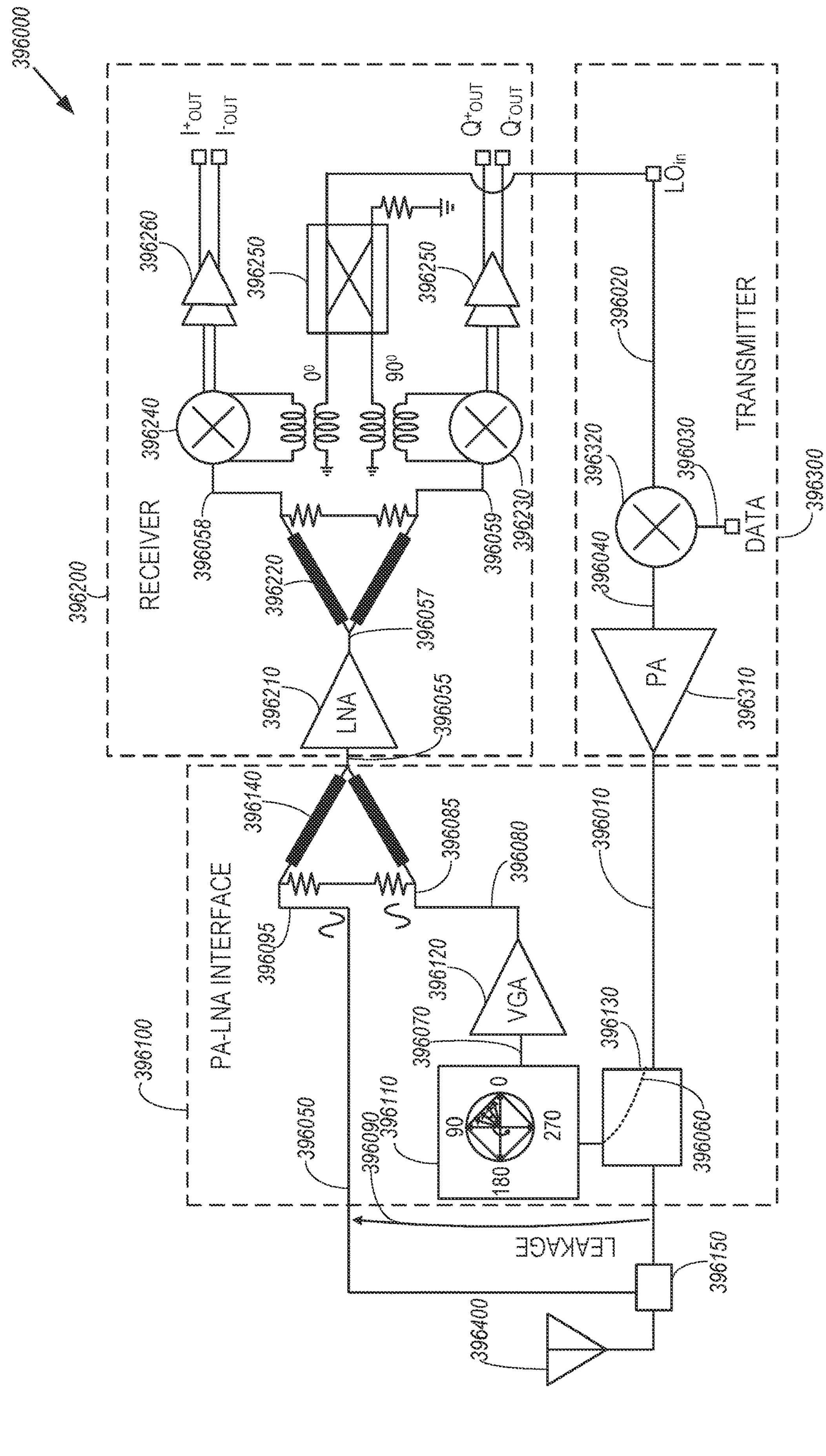

FIG. 396 is a schematic illustration of a block diagram of a transceiver, in accordance with some demonstrative aspects.

Figure 397:
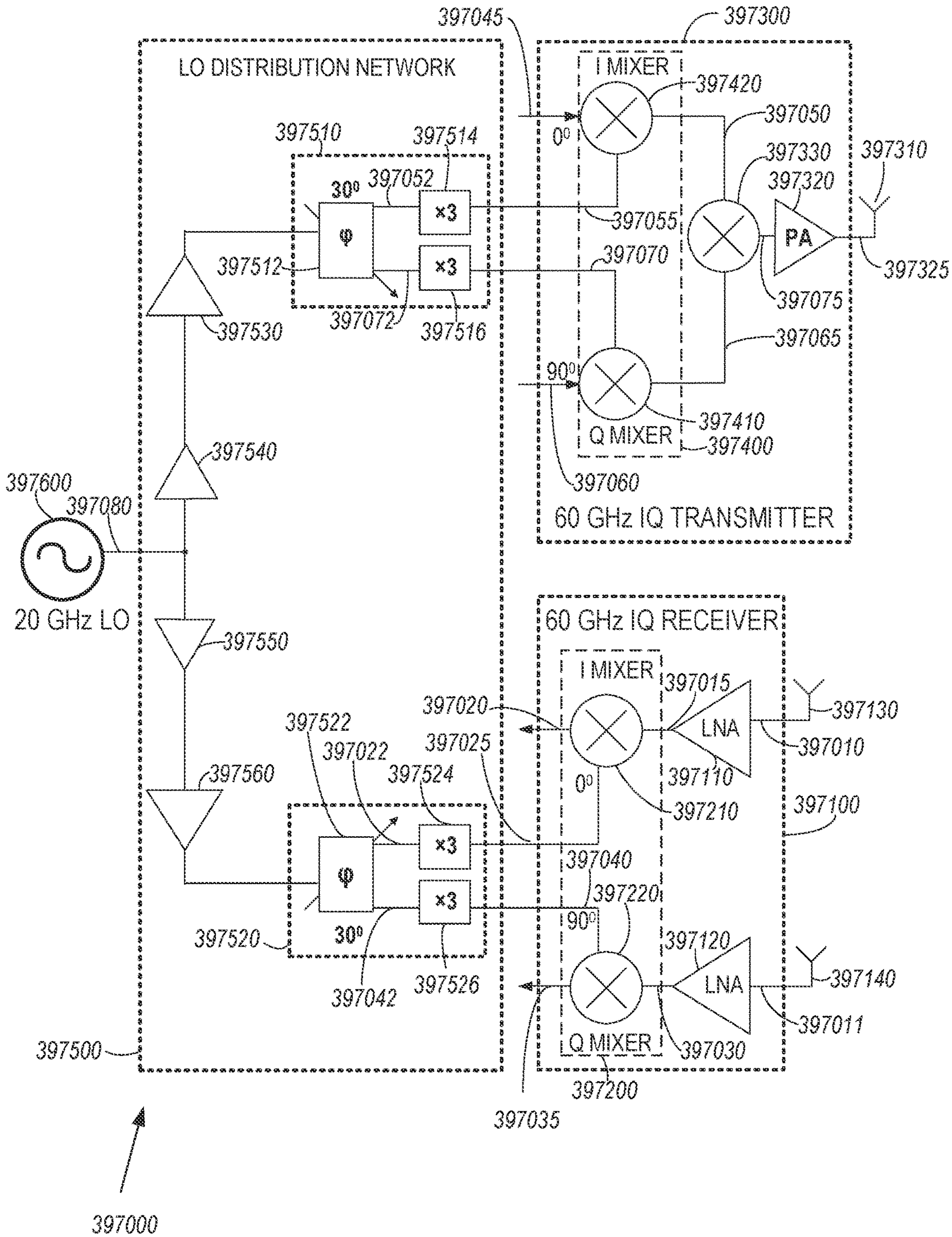

FIG. 397 is a schematic illustration of a block diagram of a transceiver, in accordance with some demonstrative aspects.

Figure 398:
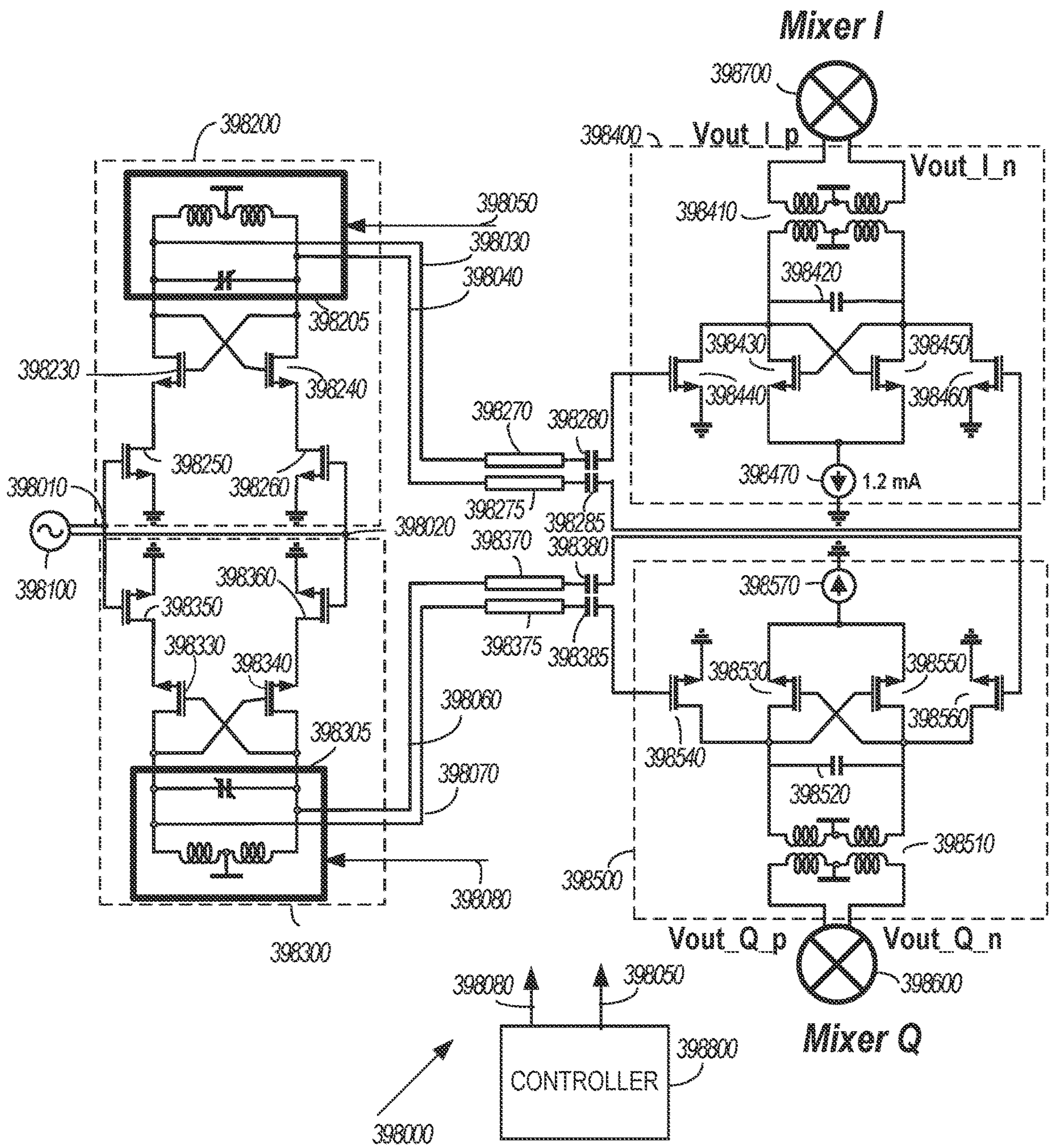

FIG. 398 is a schematic illustration of a quadrature Local Oscillator (LO) generator, in accordance with some demonstrative aspects.

Figure 399:
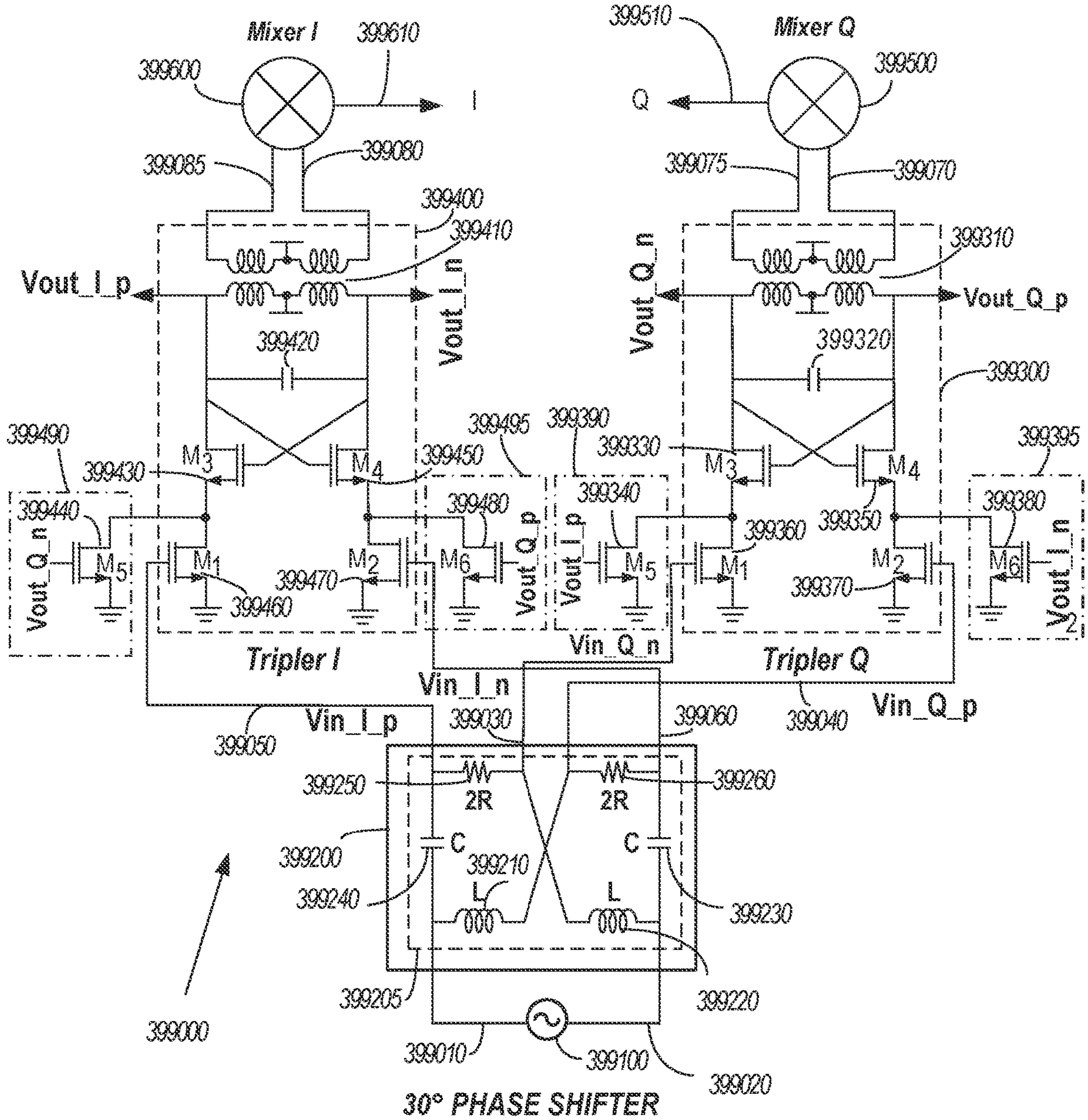

FIG. 399 is a schematic illustration of a passive quadrature LO generator, in accordance with some demonstrative aspects.

Figure 400:
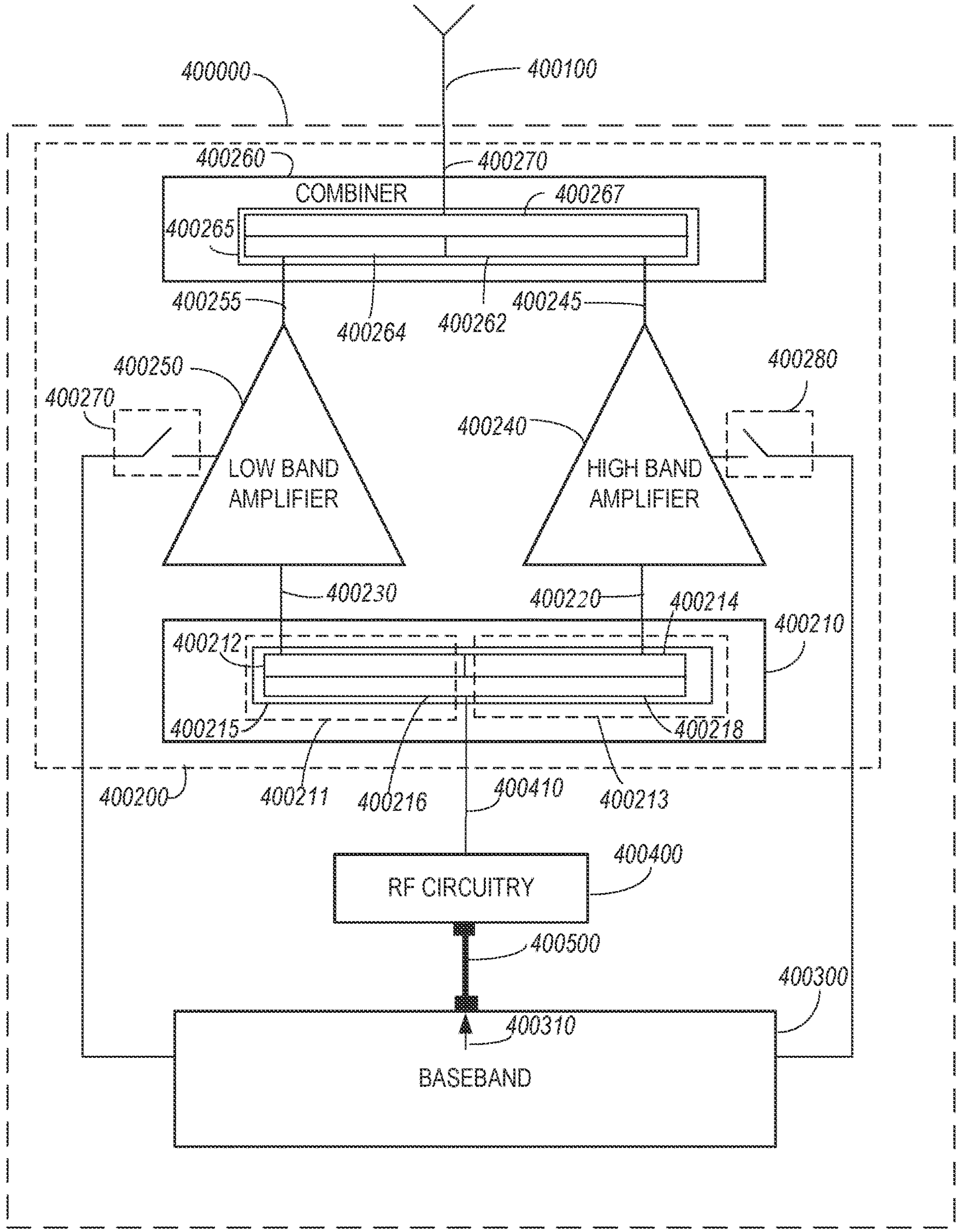

FIG. 400 is a schematic illustration of a block diagram of a transmitter, in accordance with to some demonstrative aspects.

Figure 401:
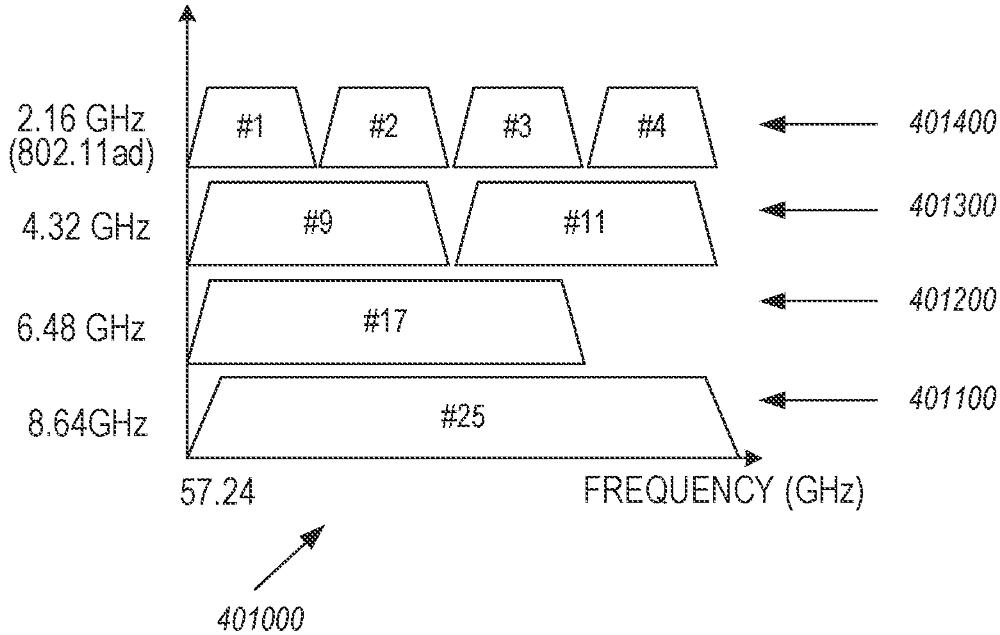

FIG. 401 is a schematic illustration of a band plan of a plurality of channels corresponding to a plurality of channel bandwidths, which may be implemented in accordance with some demonstrative aspects.

Figure 402:
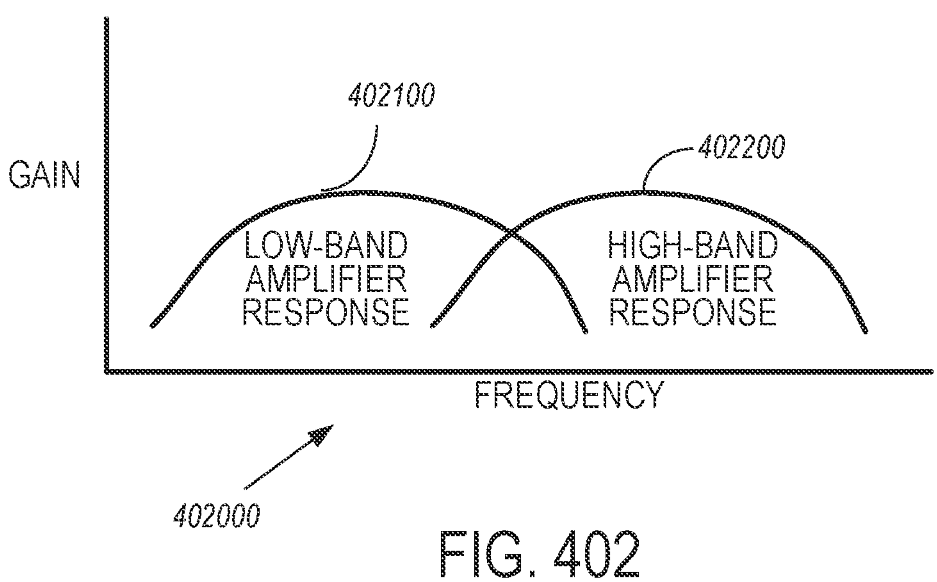

FIG. 402 is a schematic illustration of a graph depicting a gain response of a low band amplifier and a high band amplifier, in accordance with some demonstrative aspects.

Figure 403:
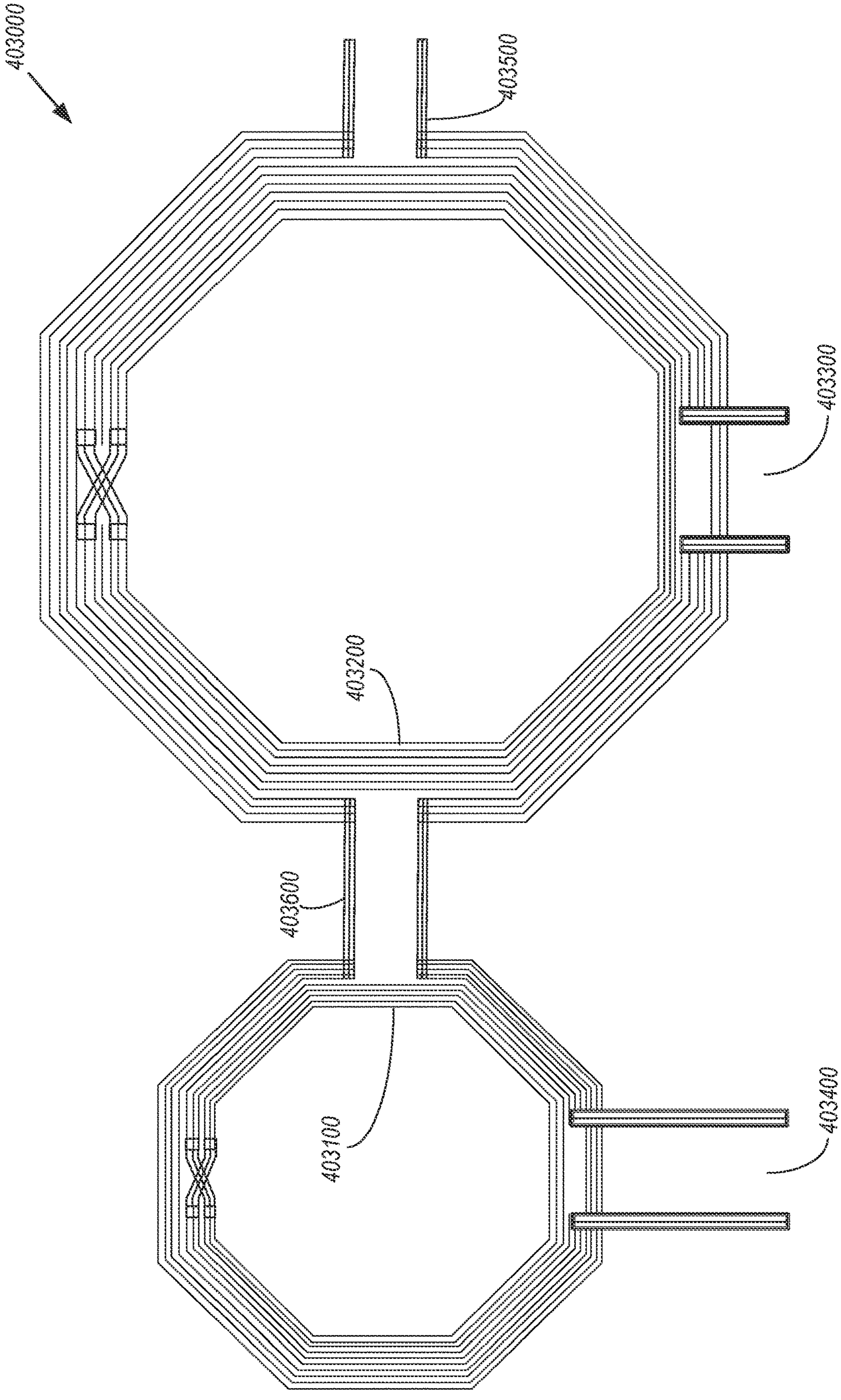

FIG. 403 is a schematic illustration of a transformer, in accordance with some demonstrative aspects.

Figure 404:
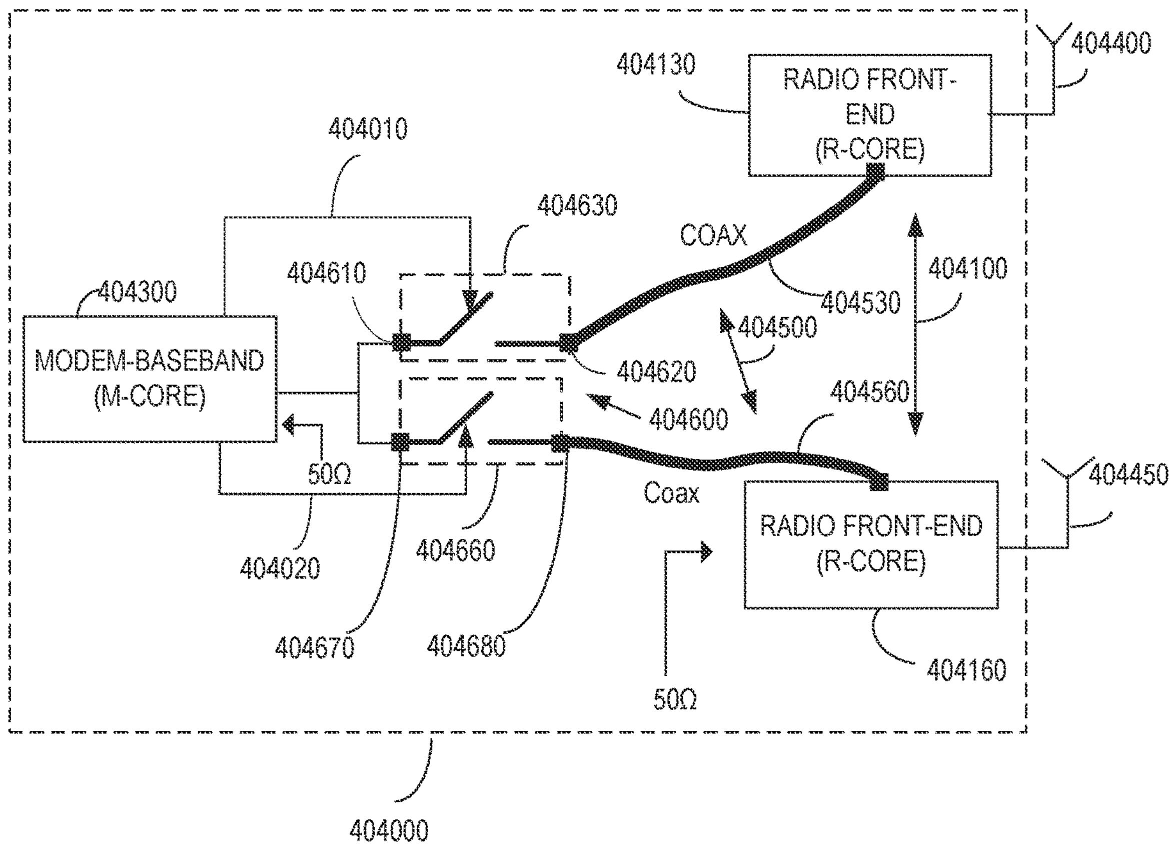

FIG. 404 is a schematic illustration of a block diagram of a wireless communication apparatus, in accordance with some demonstrative aspects.

Figure 405:
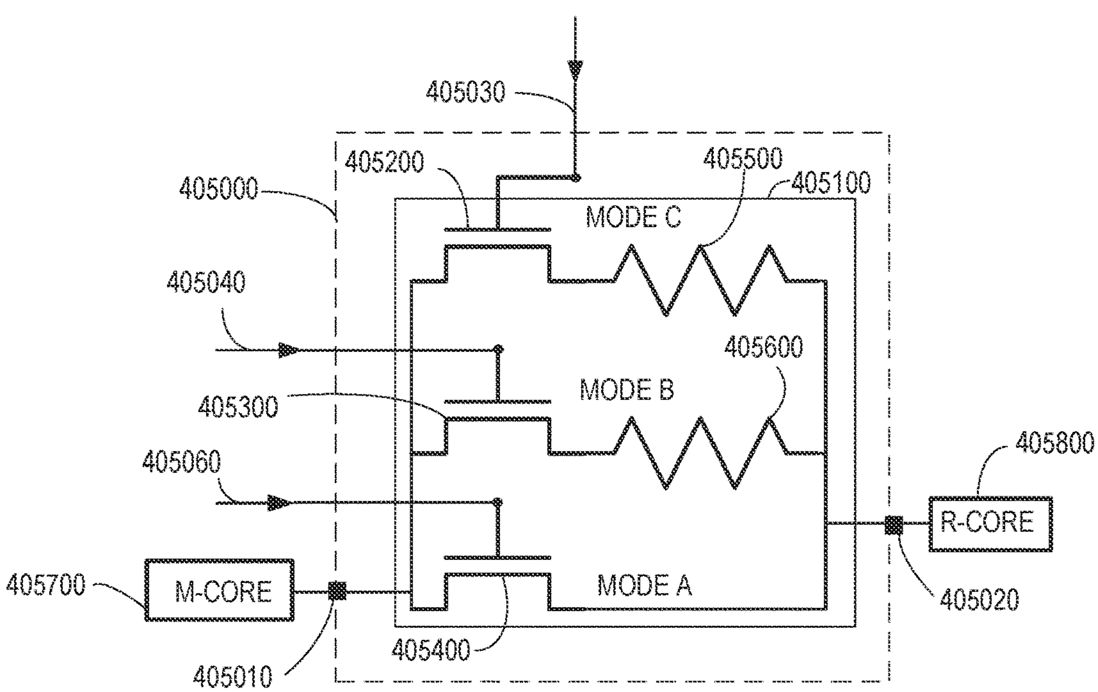

FIG. 405 is a schematic illustration of an impedance matching switch, in accordance to some demonstrative aspects.

Figure 406:
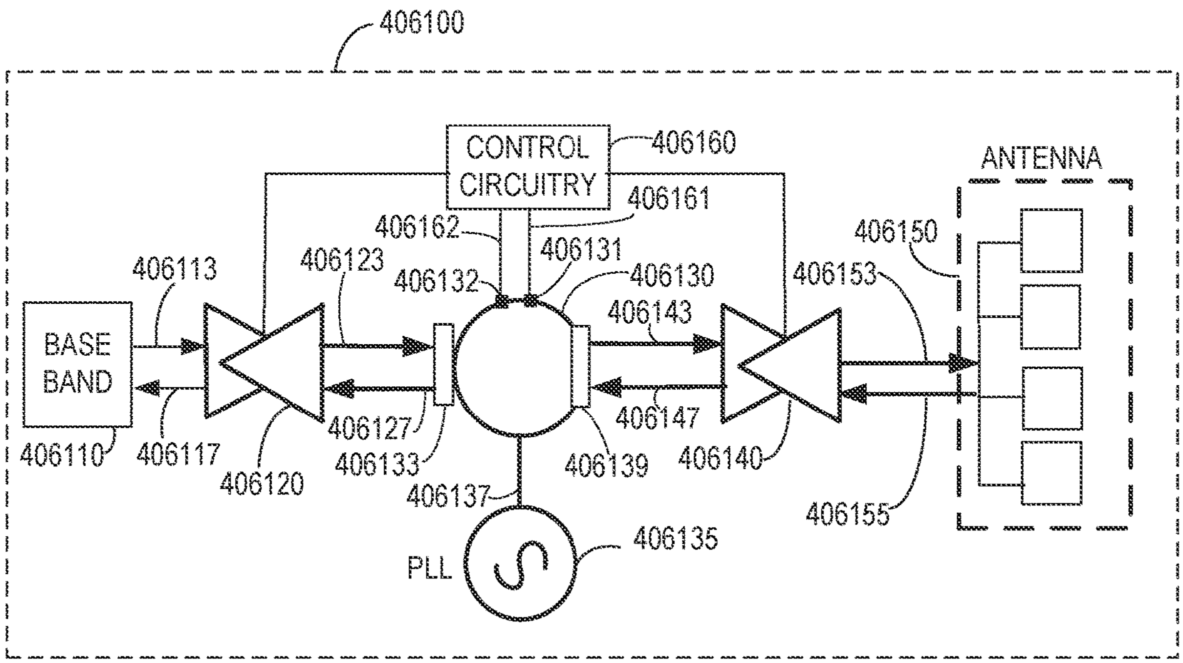

FIG. 406 is a schematic illustration of a block diagram of a transceiver, in accordance with some demonstrative aspects.

Figure 407:
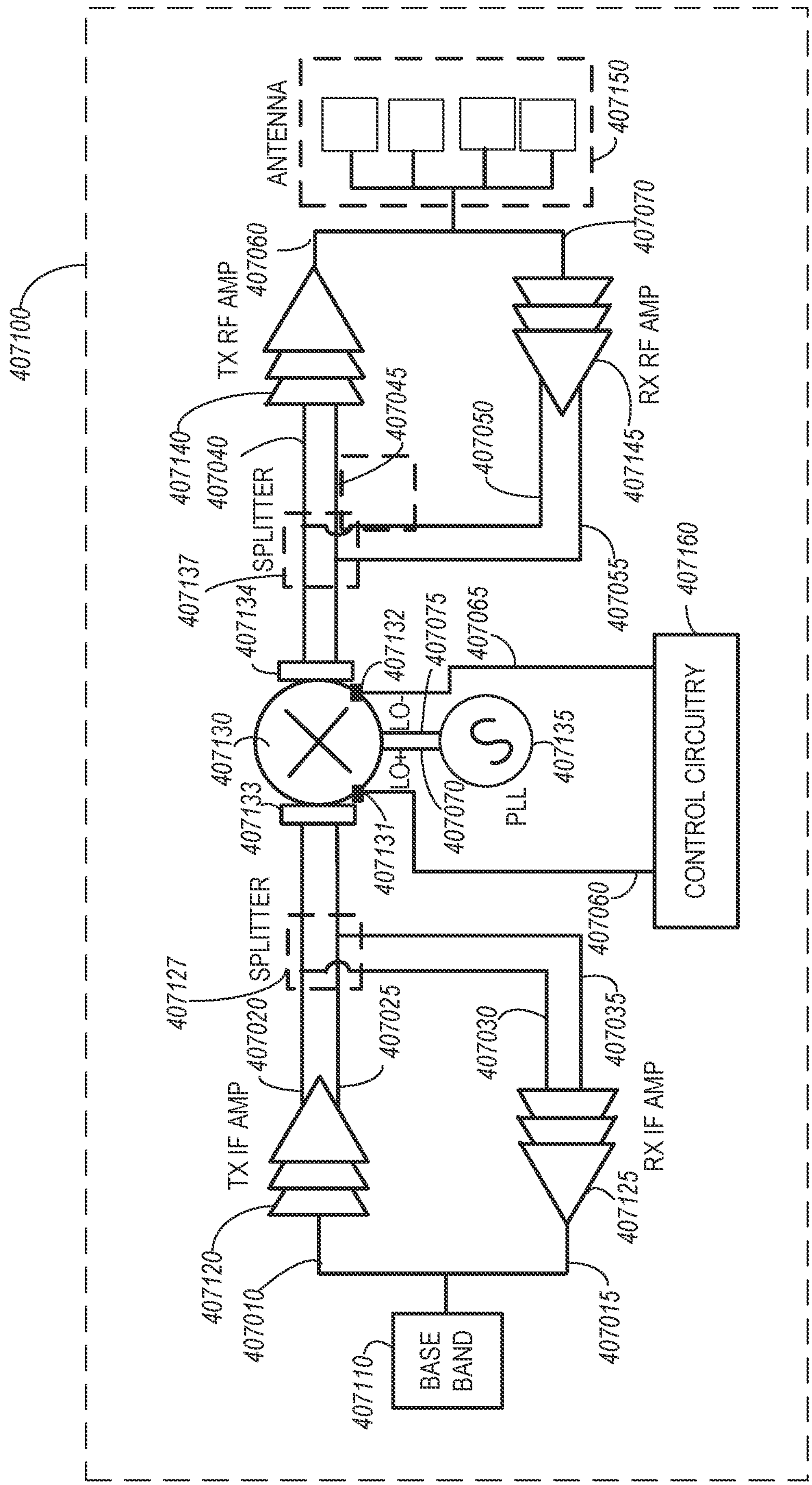

FIG. 407 is a schematic illustration of a block diagram of a half-duplex transceiver, in accordance with some demonstrative aspects.

Figure 408:
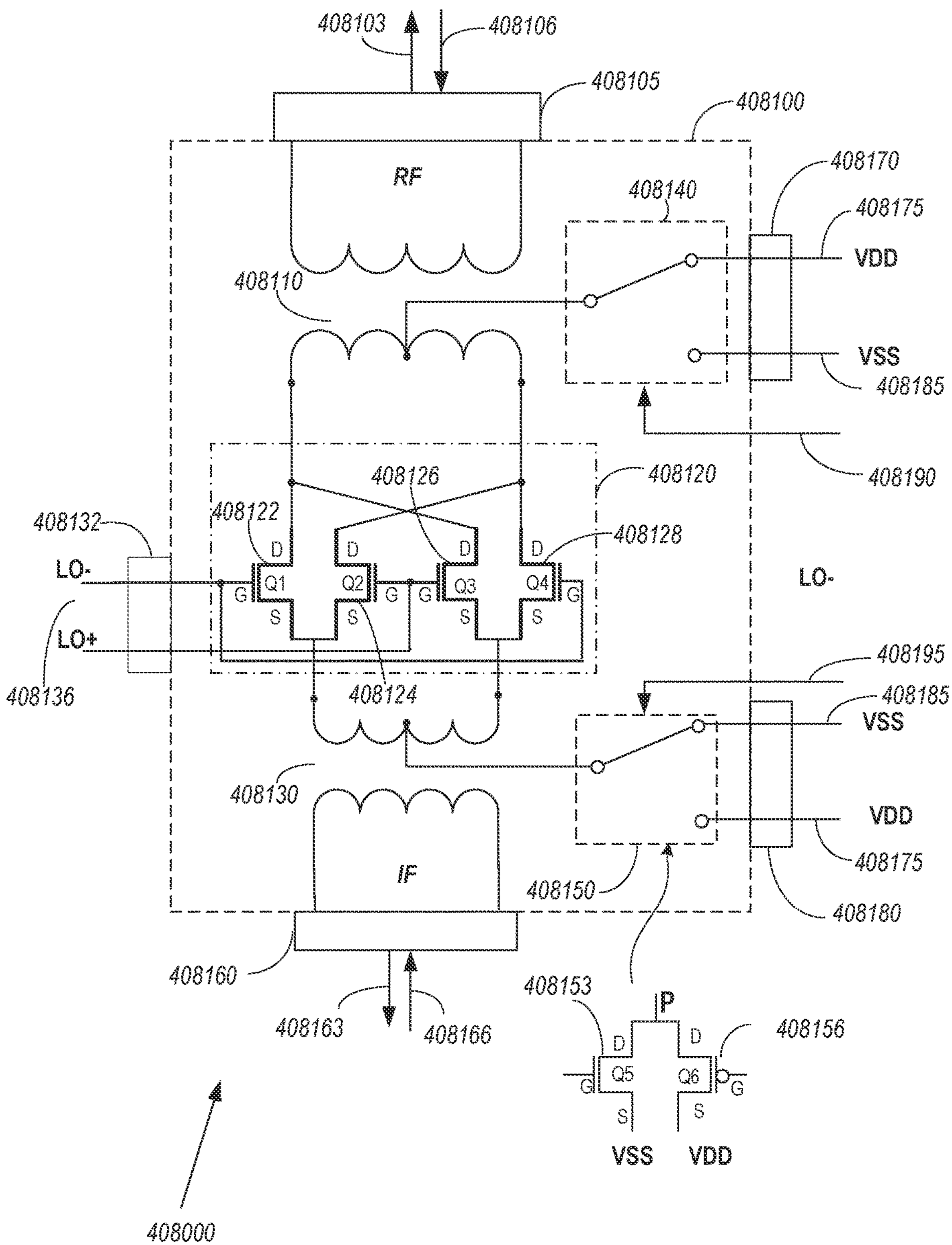

FIG. 408 is a schematic illustration of a bi-directional mixer, in accordance to some demonstrative aspects.

Figure 409A:
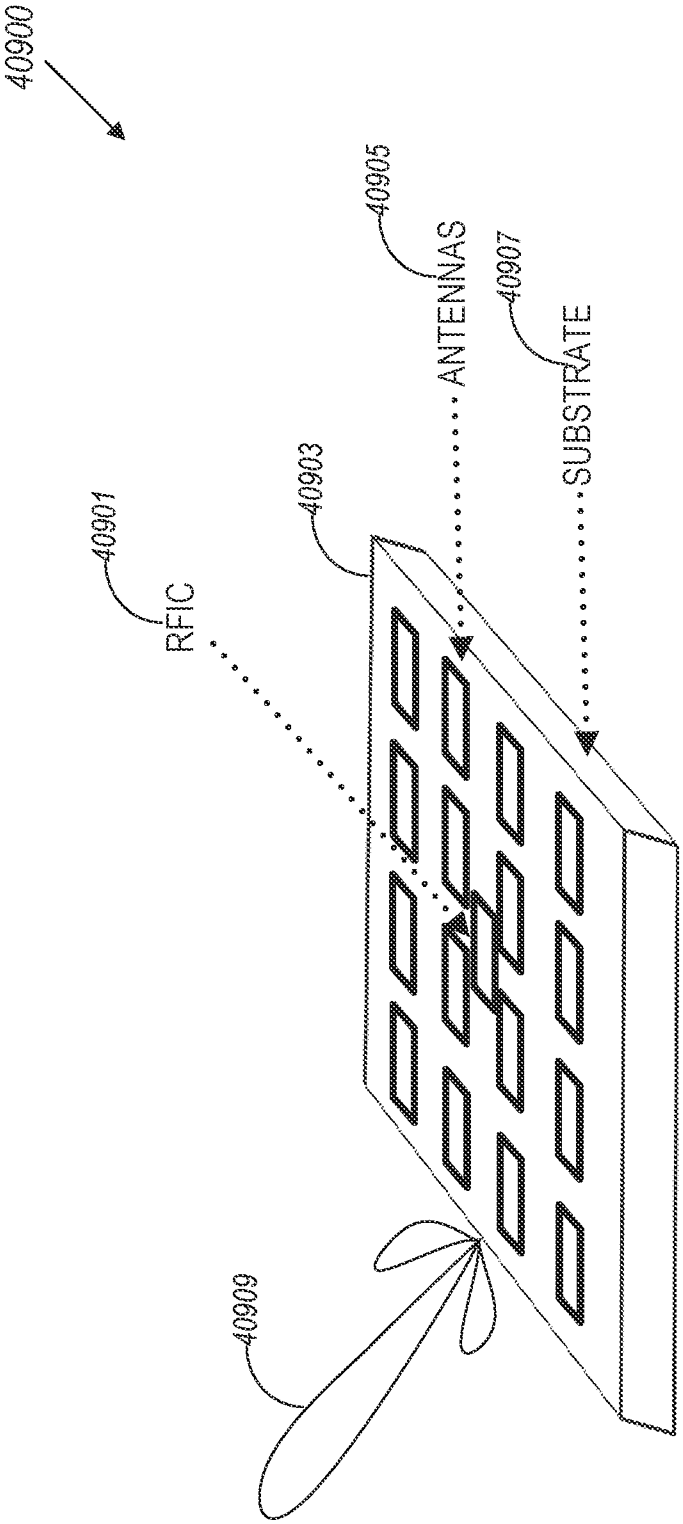

FIG. 409A illustrates a phased-array transceiver, according to some aspects of the present disclosure.

Figure 409C:
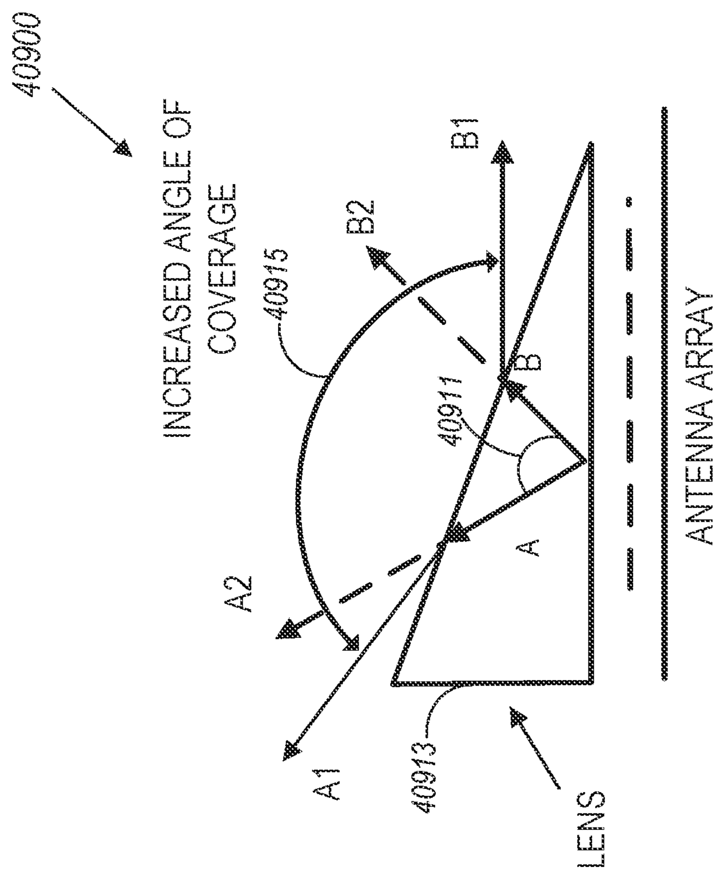
Figure 409B:
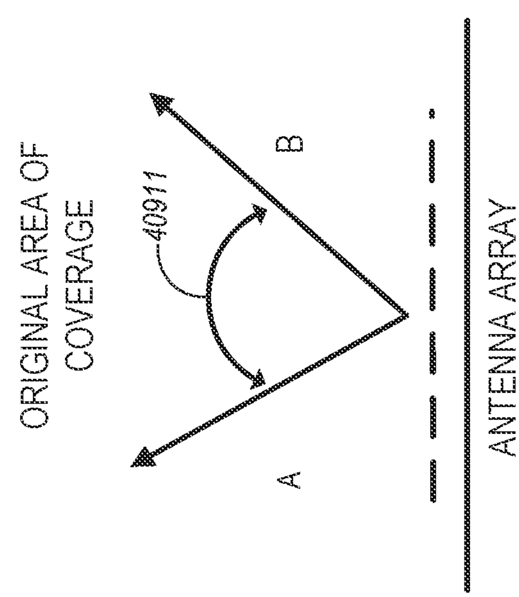

FIG. 409B illustrates an antenna array with an original reduced angle of coverage, according to some aspects of the present disclosure.

FIG. 409C illustrates a lens used in conjunction with a phased-array antenna to deflect the radiated beams and extend the angle of coverage, according to some aspects of the present disclosure.

Figure 409D:
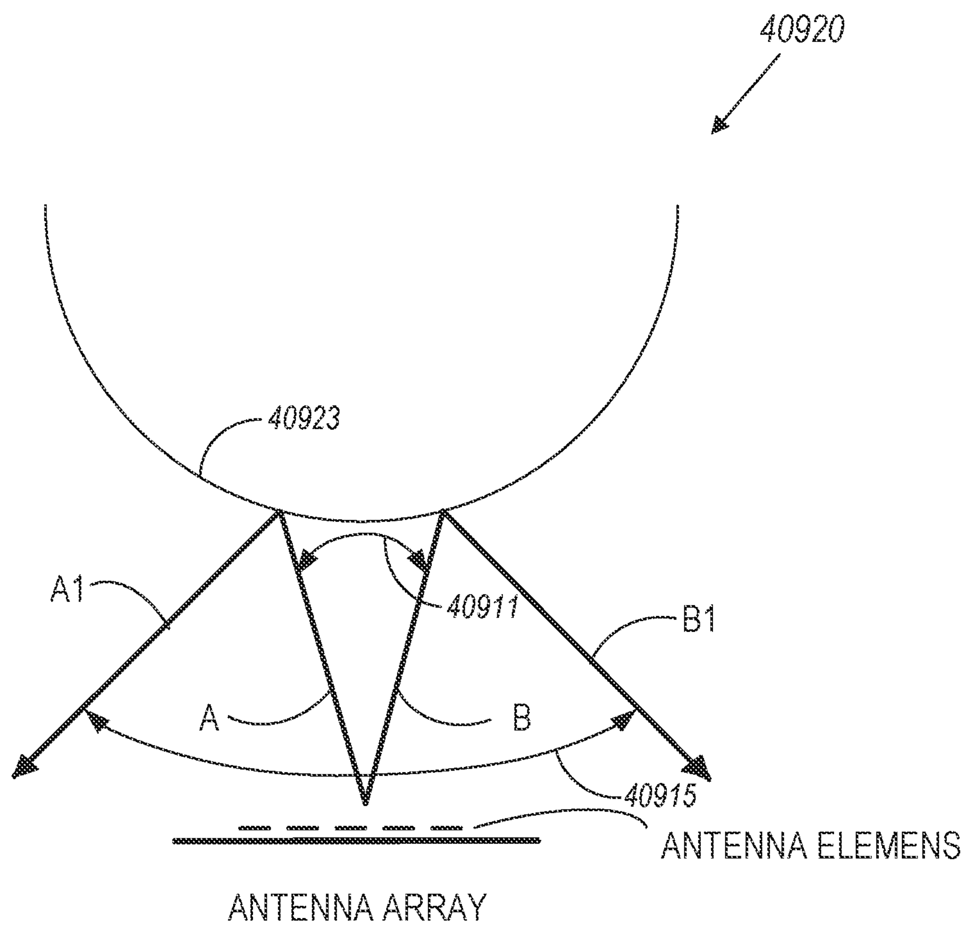

FIG. 409D illustrates a concave reflector used in conjunction with a phased-array to deflect the radiated beams and extend the angle of coverage, according to some aspects of the present disclosure.

Figure 410:
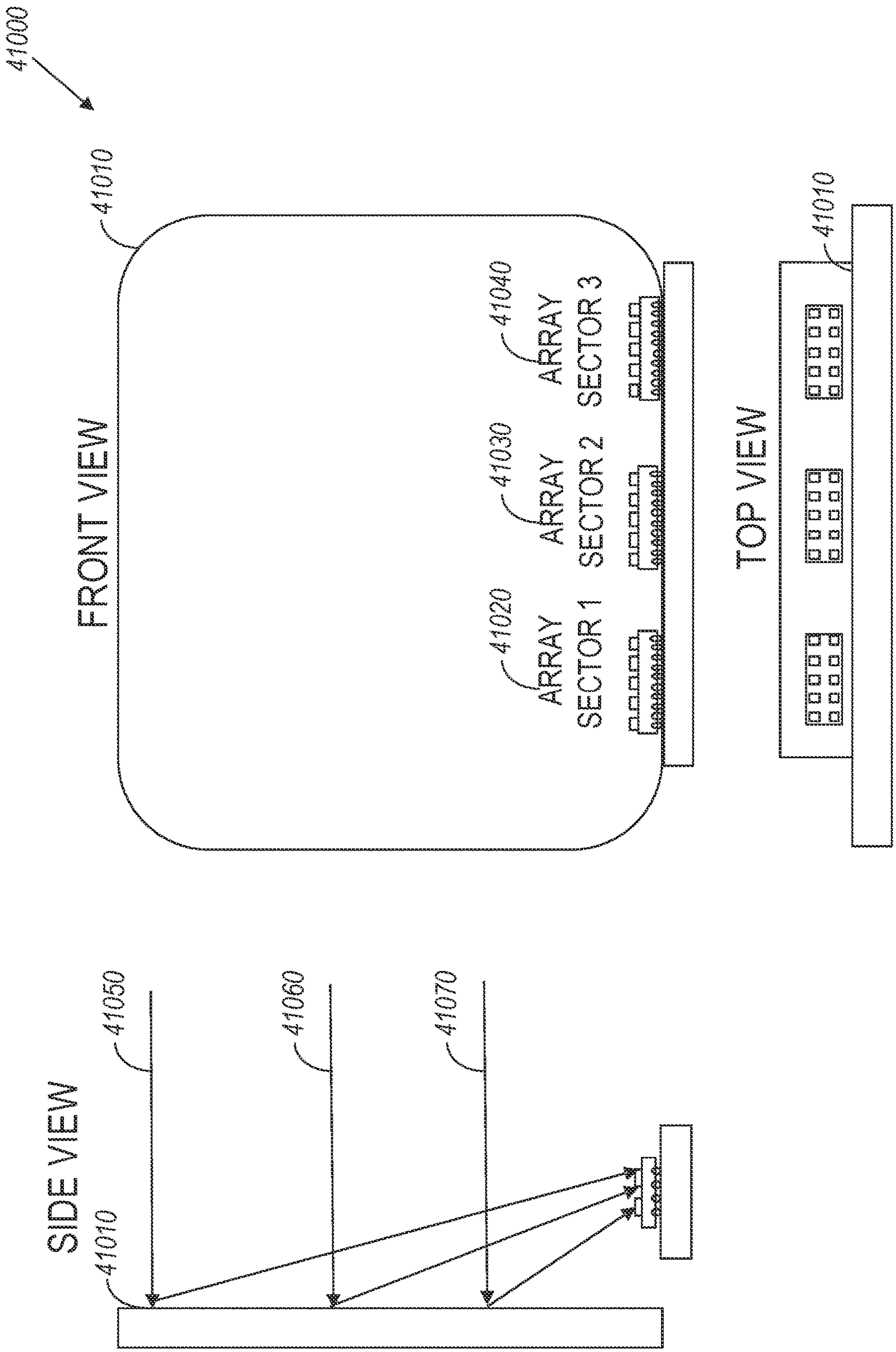

FIG. 410 illustrates a plurality of phased arrays used in conjunction with a printed reflector in a first configuration, according to some aspects of the present disclosure.

Figure 411:
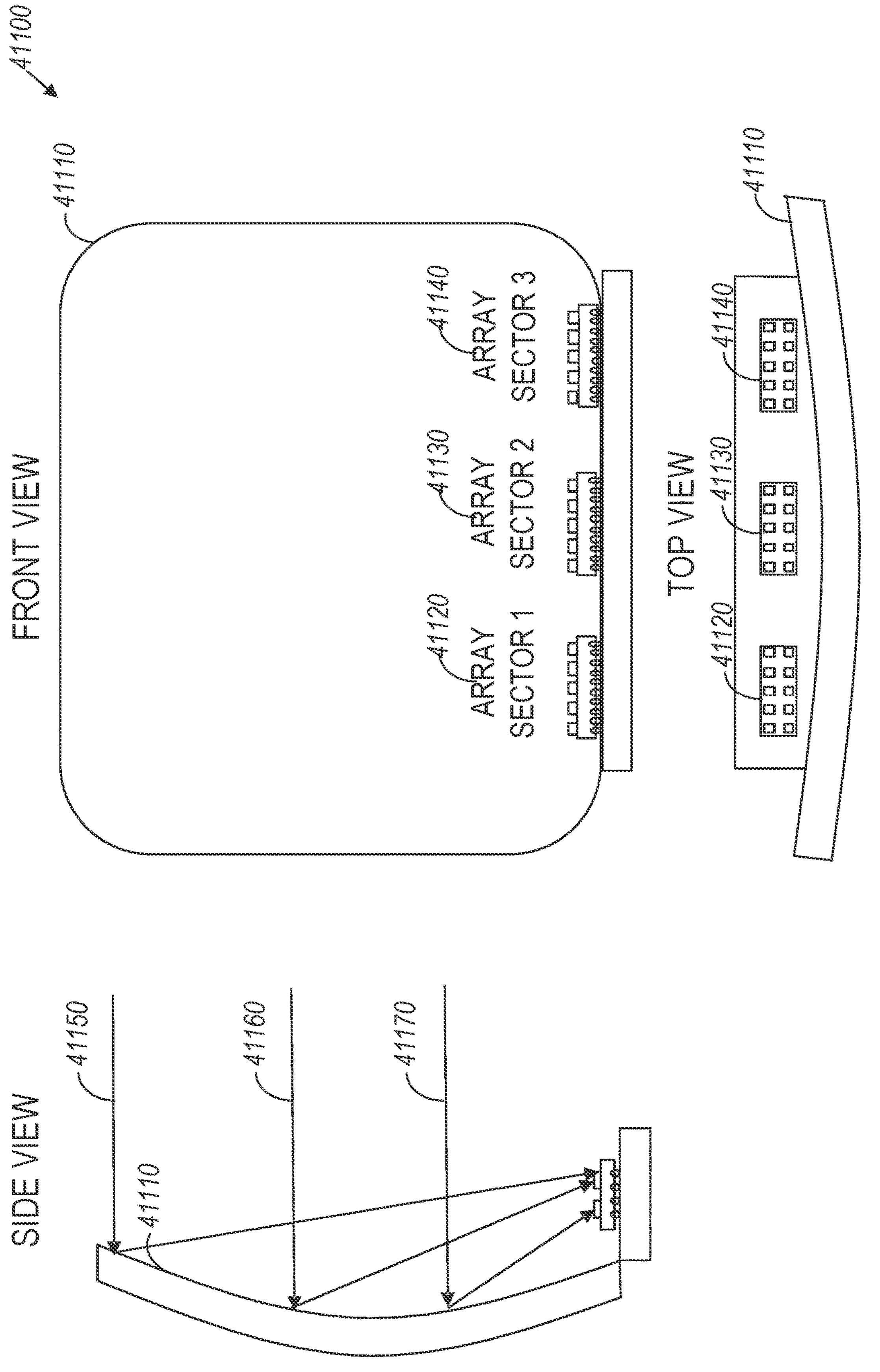

FIG. 411 illustrates a plurality of phased arrays used in conjunction with a Cassegrain antenna in the first configuration, according to some aspects of the present disclosure.

Figure 412:
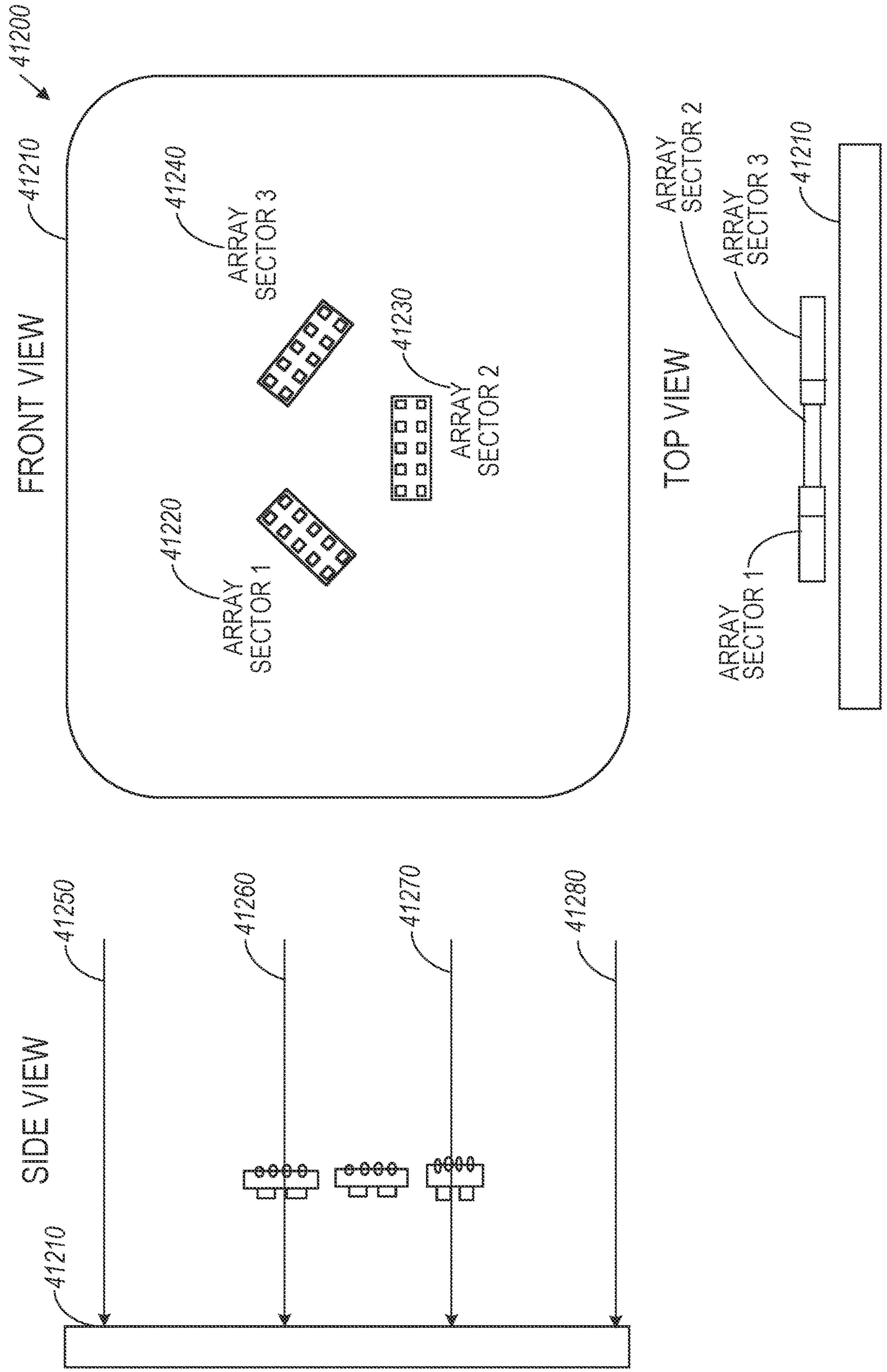

FIG. 412 illustrates a plurality of phased arrays used in conjunction with a printed reflector in a second configuration, according to some aspects of the present disclosure.

Figure 413:
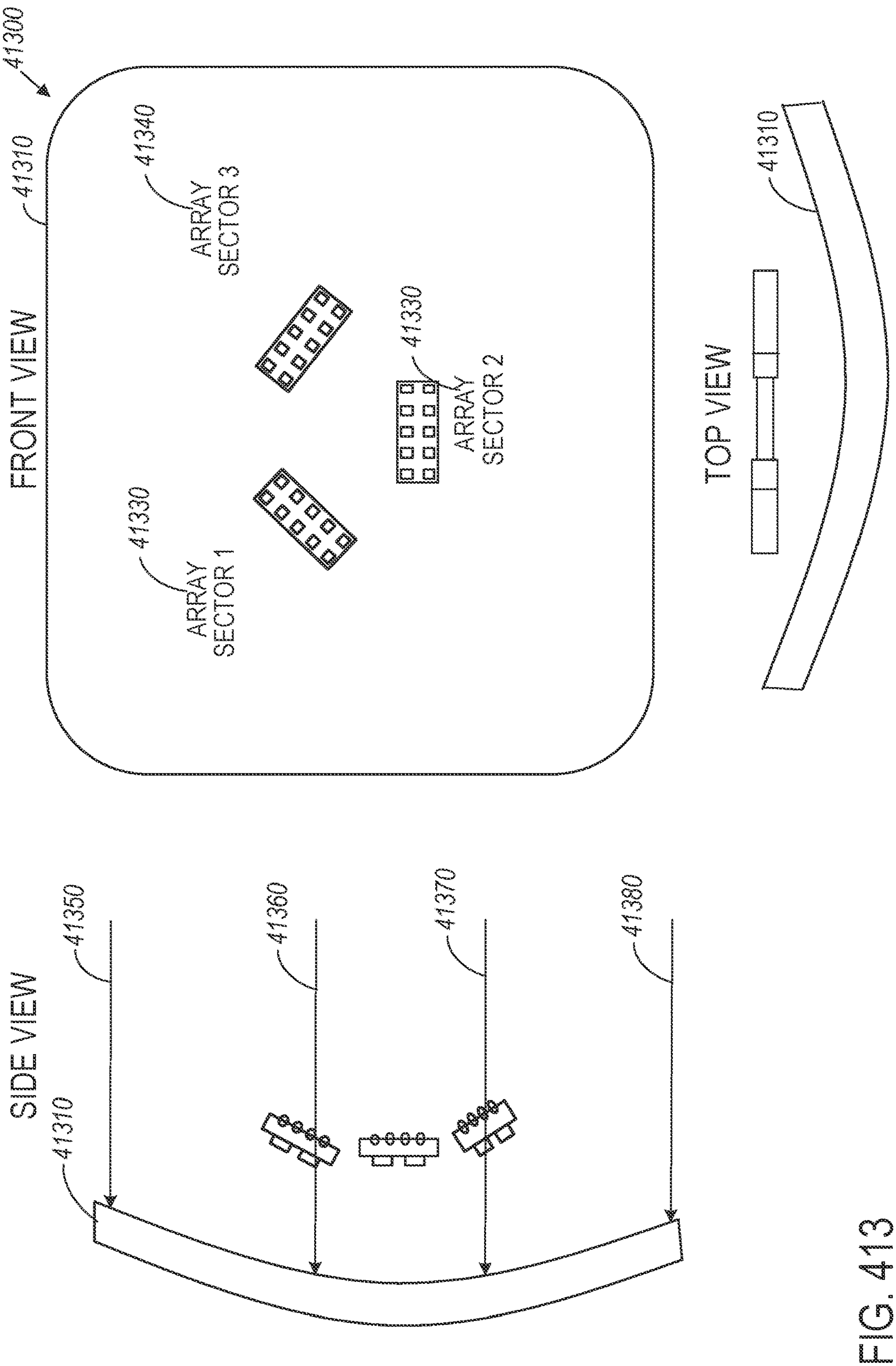

FIG. 413 illustrates a plurality of phased arrays used in conjunction with a Cassegrain antenna in the second configuration, according to some aspects of the present disclosure.

Figure 414:
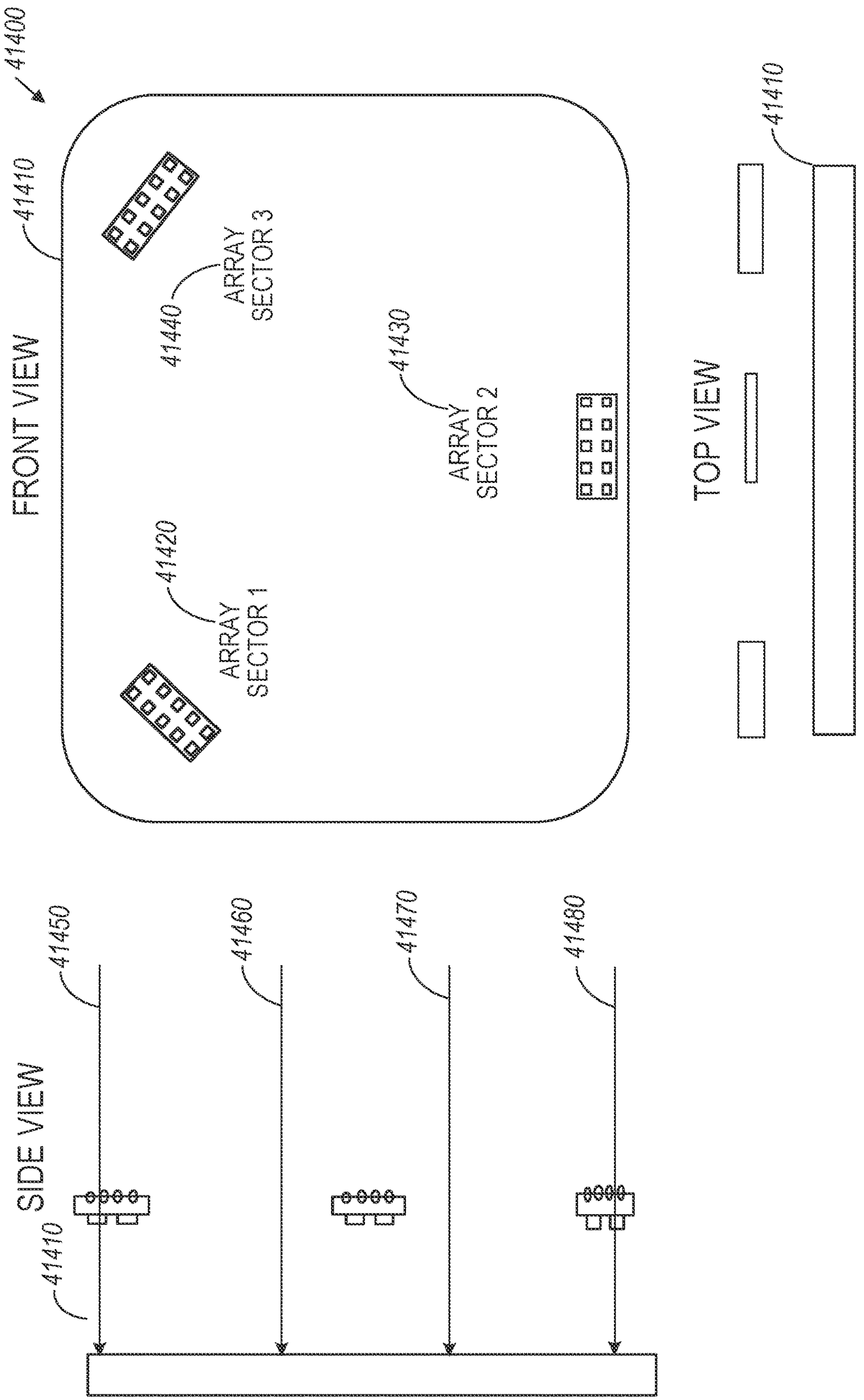

FIG. 414 illustrates a plurality of phased arrays used in conjunction with a printed reflector in a third configuration, according to some aspects of the present disclosure.

Figure 415:
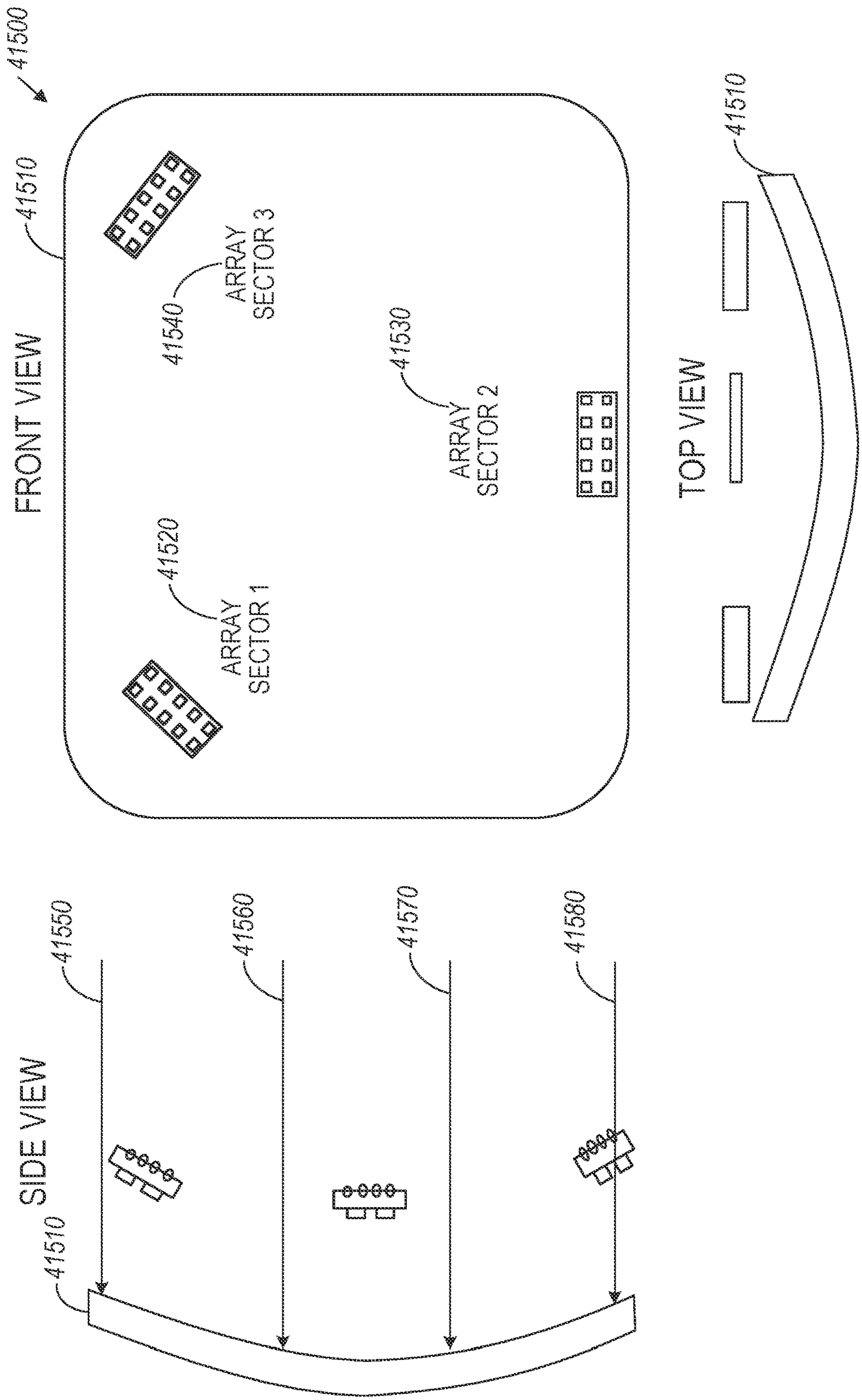

FIG. 415 illustrates a plurality of phased arrays used in conjunction with a Cassegrain antenna in the third configuration, according to some aspects of the present disclosure.

Figure 416:
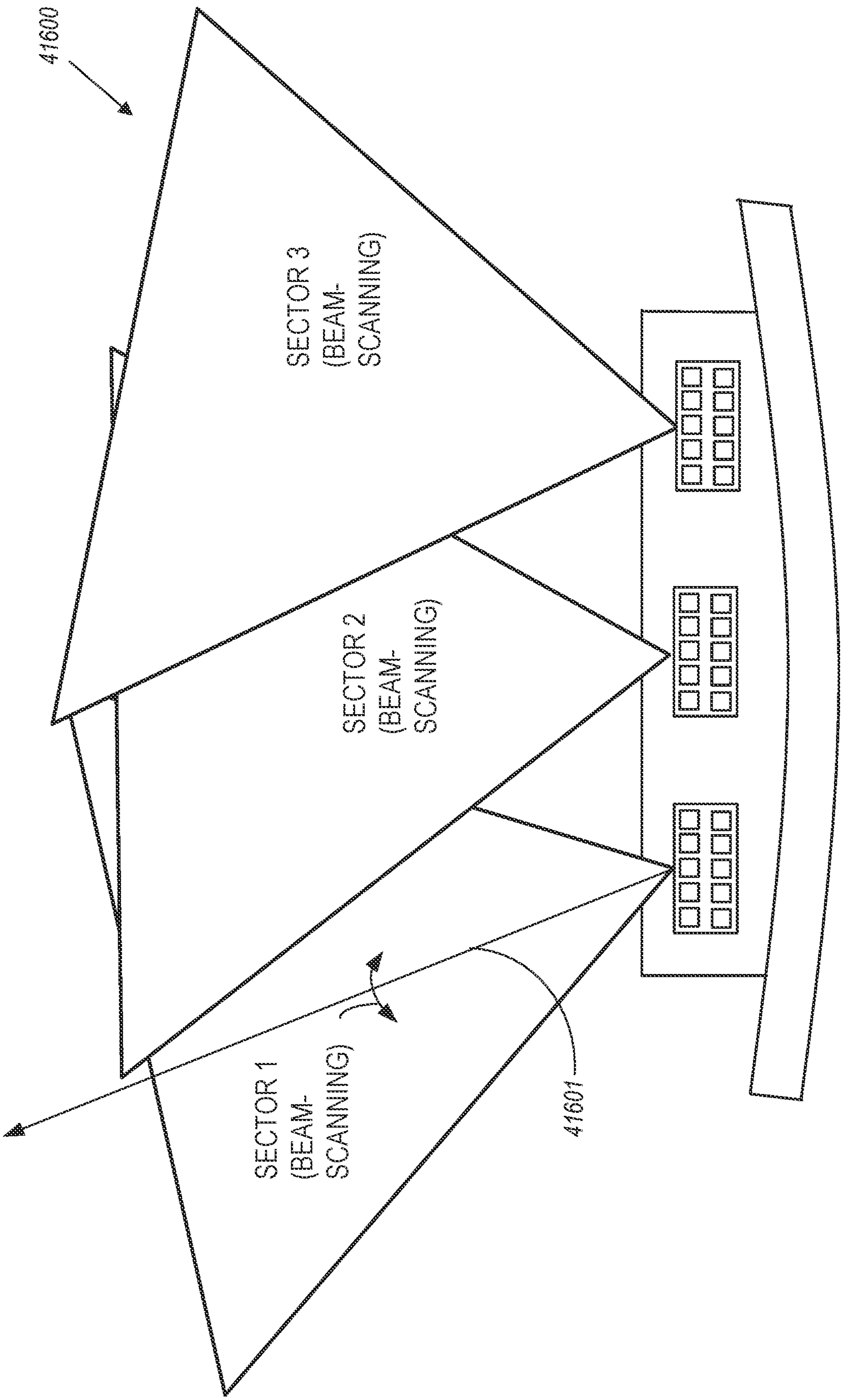

FIG. 416 illustrates a top view of sectorization resulting from a plurality of phased arrays used in conjunction with a reflecting antenna, according to some aspects of the present disclosure.

Figure 417:
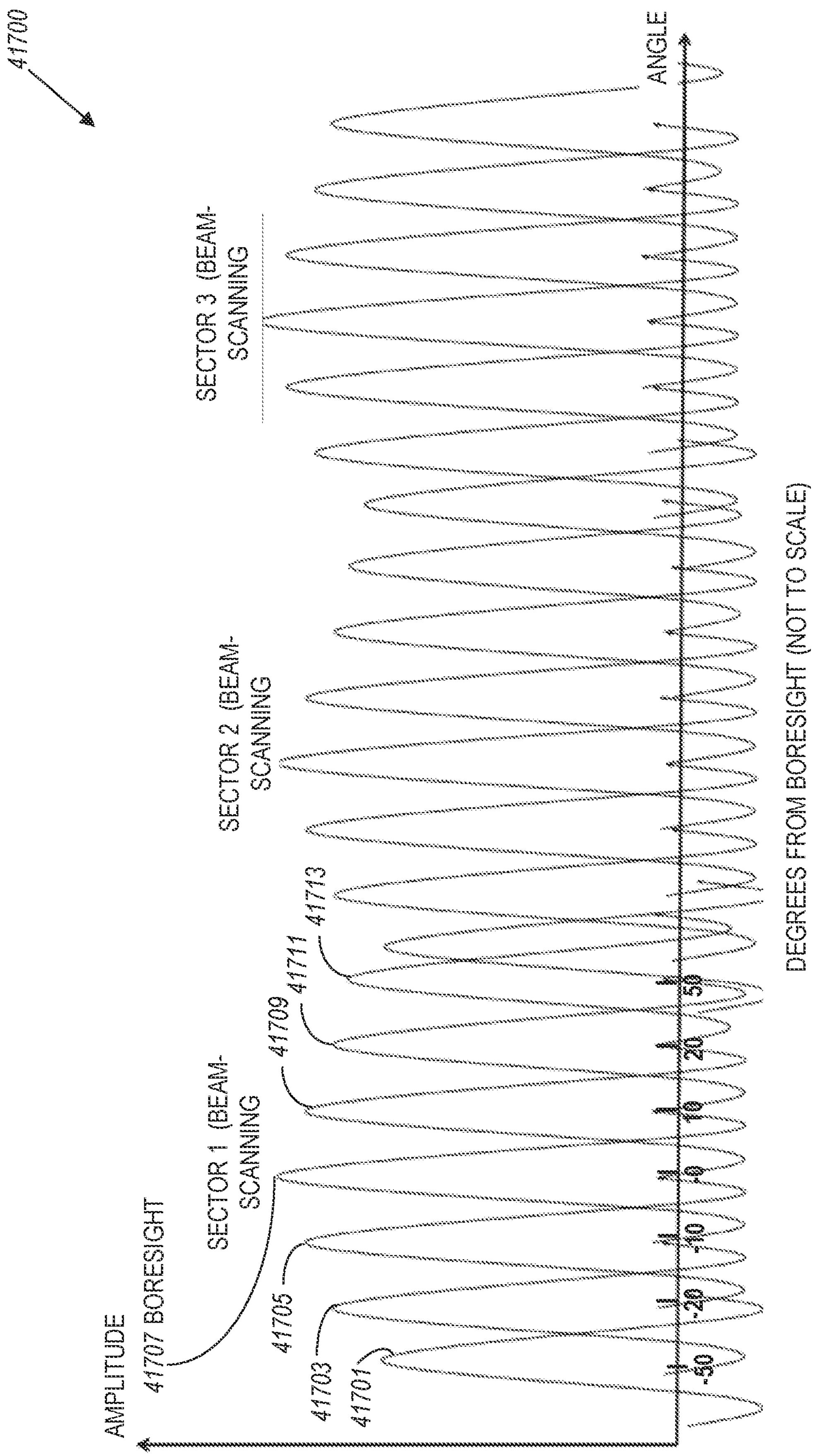

FIG. 417 illustrates scanning in each sector of the sectorized scan regions, according to some aspects of the present disclosure.

Figure 418:
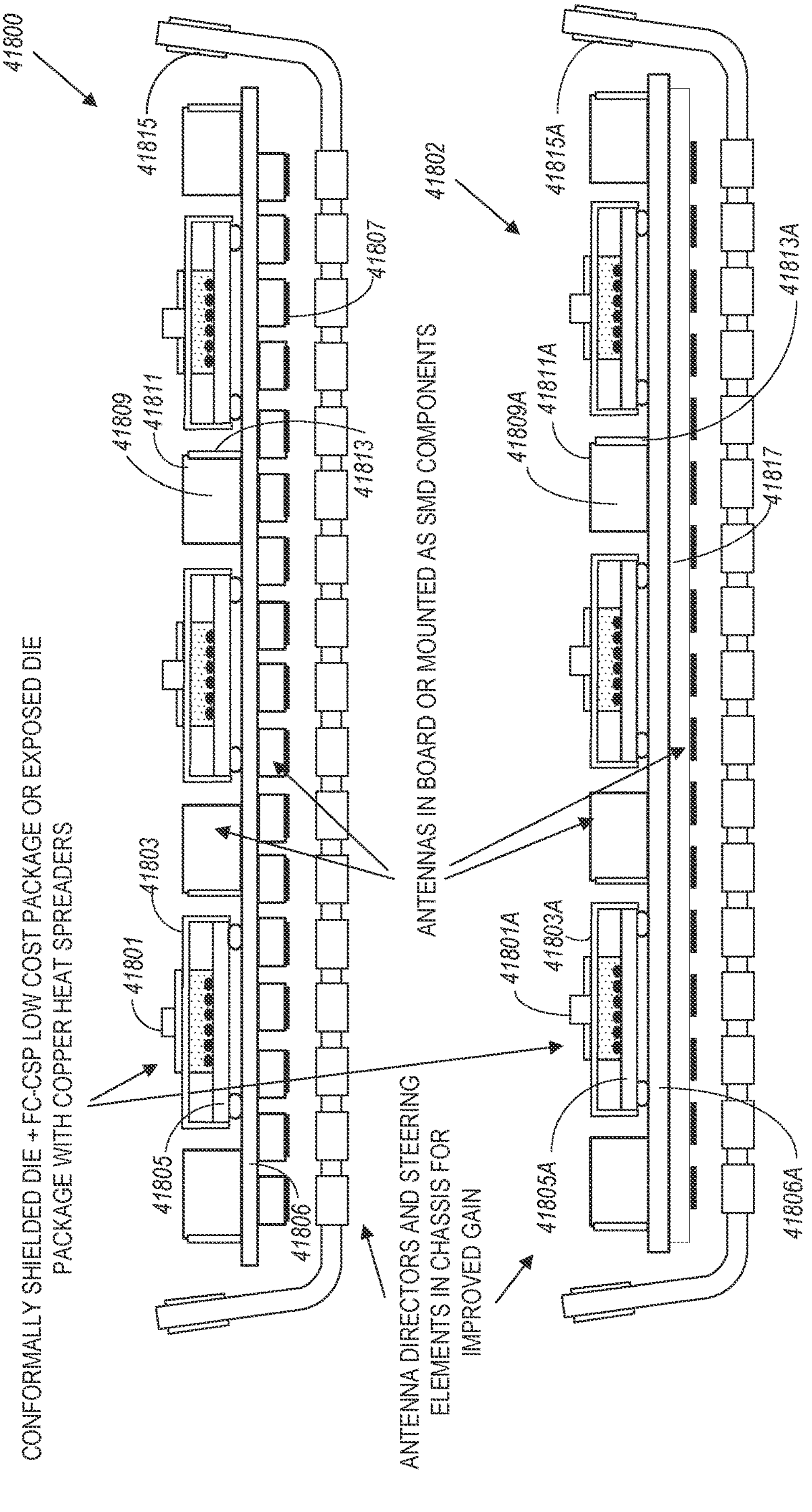

FIG. 418 illustrates a package within which antennas may be embodied within a user device, according to some aspects of the present disclosure.

Figure 419:
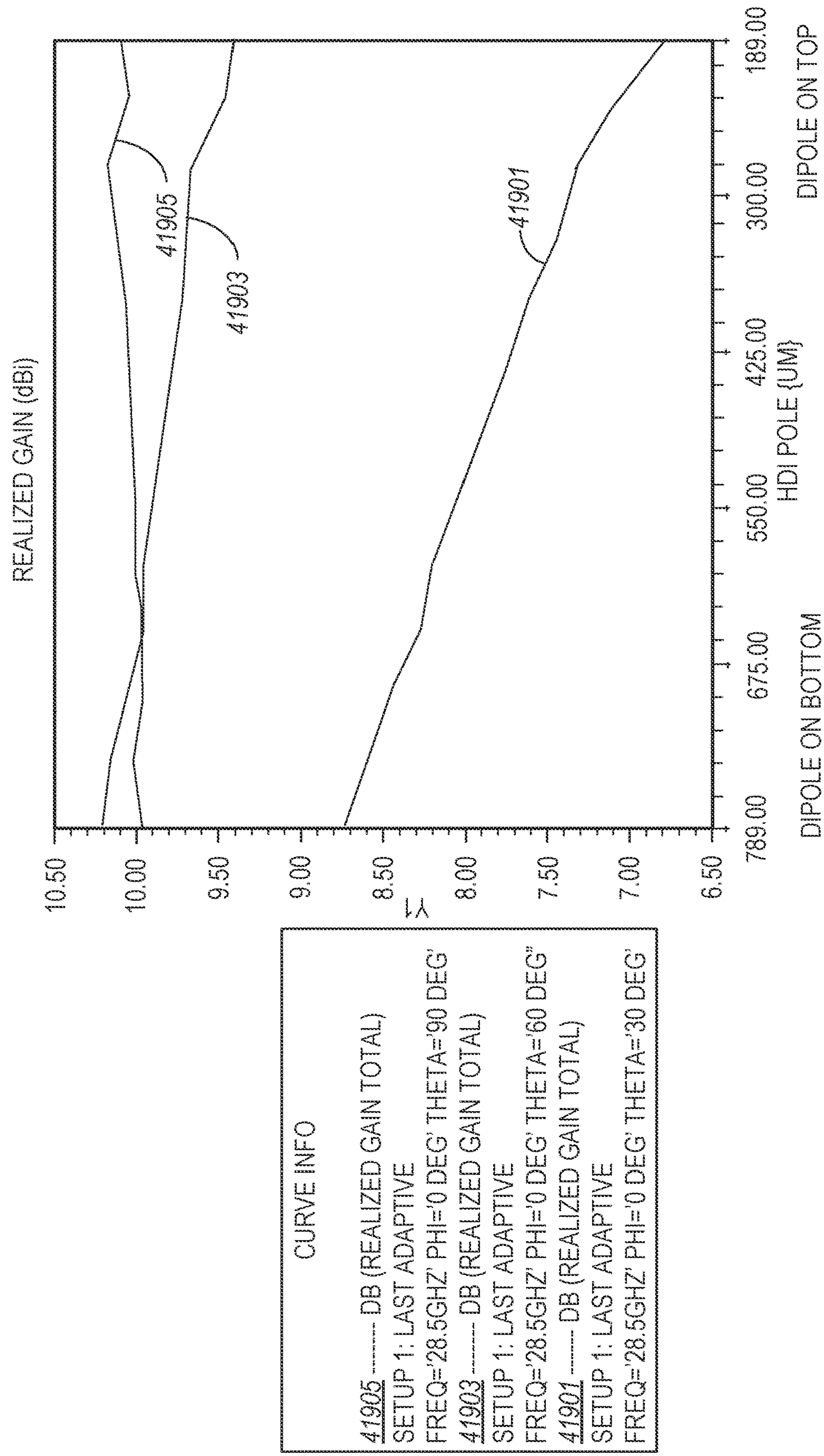

FIG. 419 illustrates a graph of realized gain of a 1×4 dipole array embodied in the package of FIG. 418, according to some aspects of the present disclosure.

Figure 420:
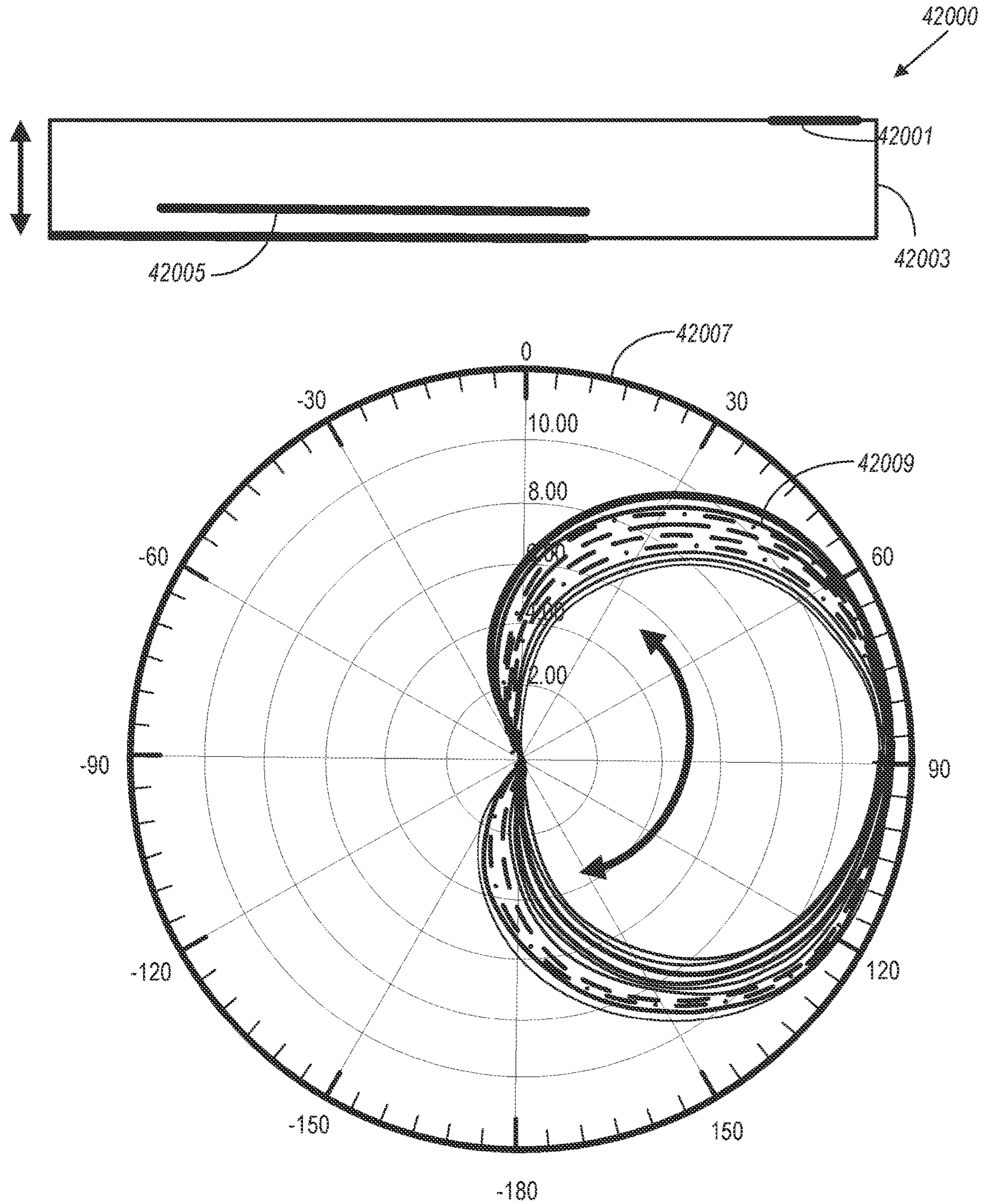

FIG. 420 illustrates radiation patterns associated with the graph of FIG. 419, according to some aspects of the present disclosure.

Figure 421:
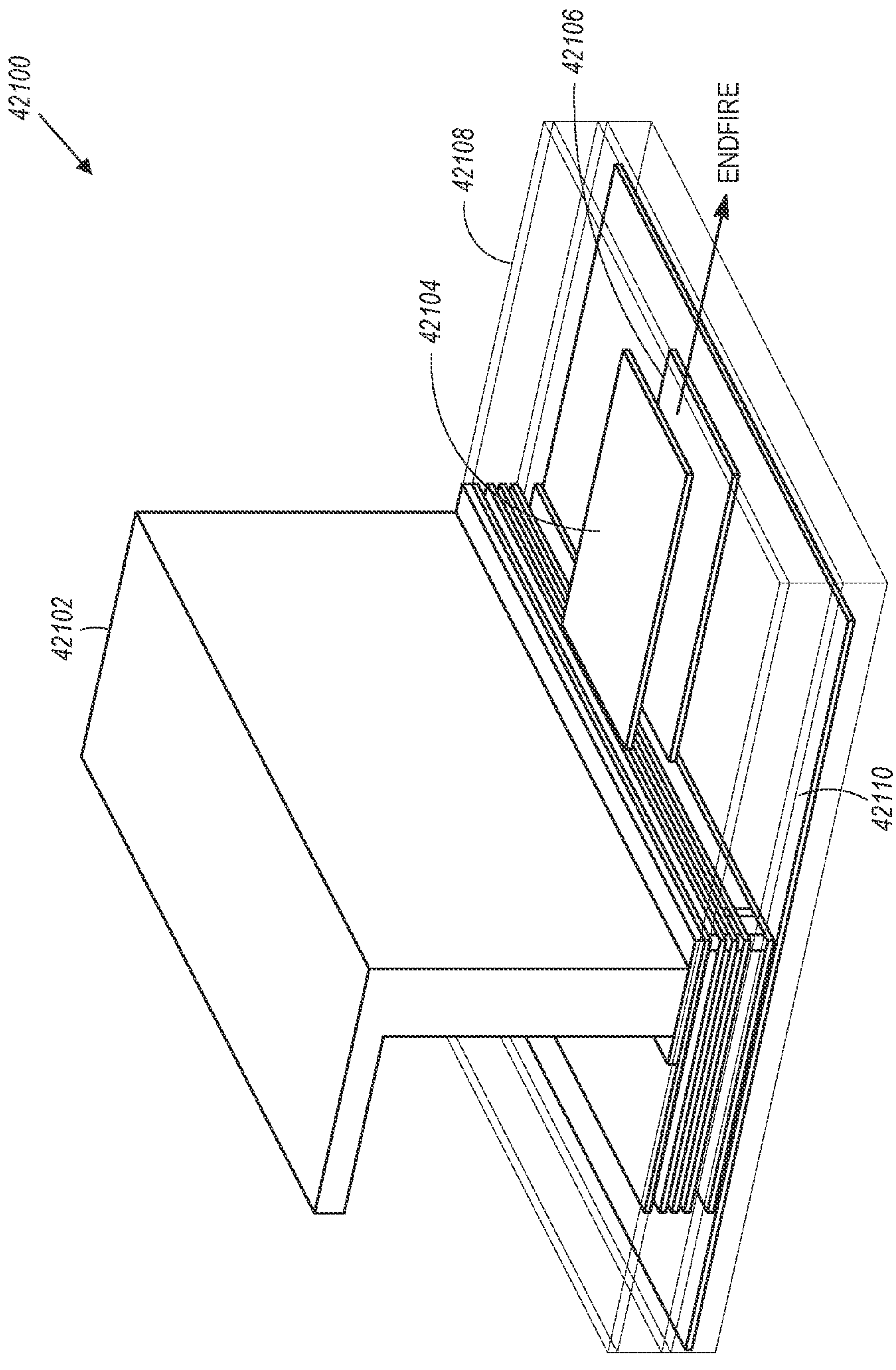

FIG. 421 illustrates the use of an integrated circuit (IC) shield as an antenna ground plane and a reflector for a stacked patch antenna, according to some aspects of the present disclosure.

Figure 422:
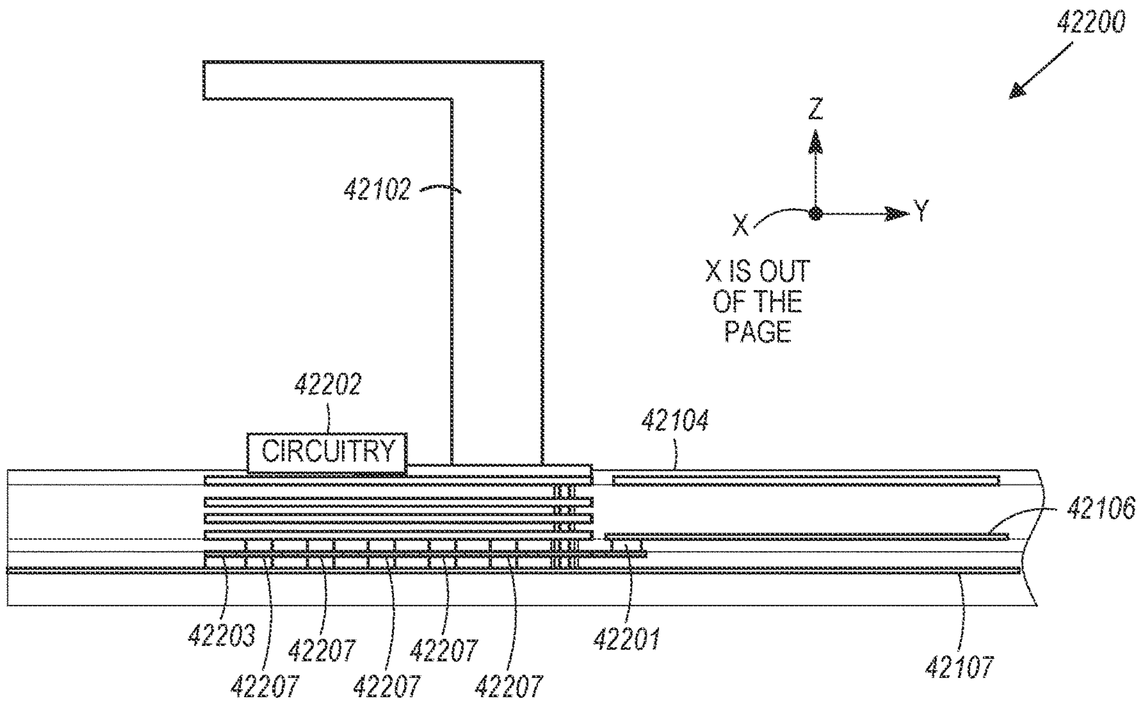

FIG. 422 illustrates a side view of the monopole antenna illustrated in FIG. 421 showing an unsymmetrical via feeding mechanism, according to some aspects of the present disclosure.

Figure 422A:
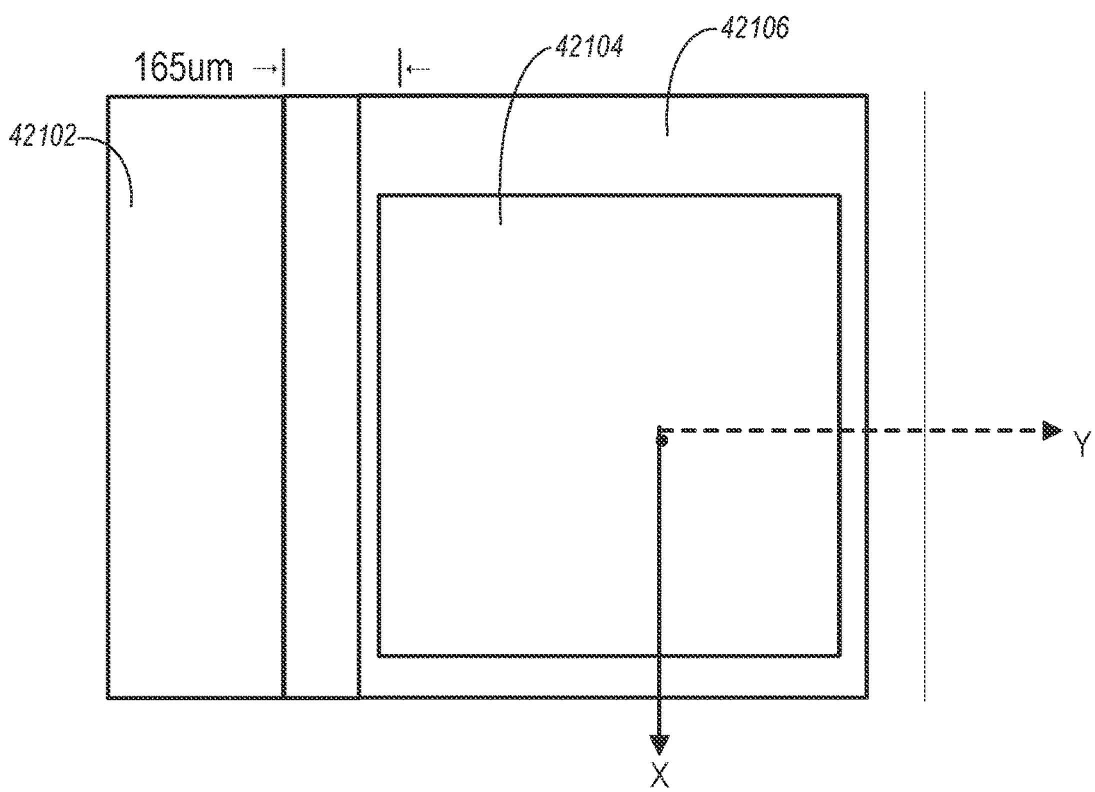
Figure 422B:
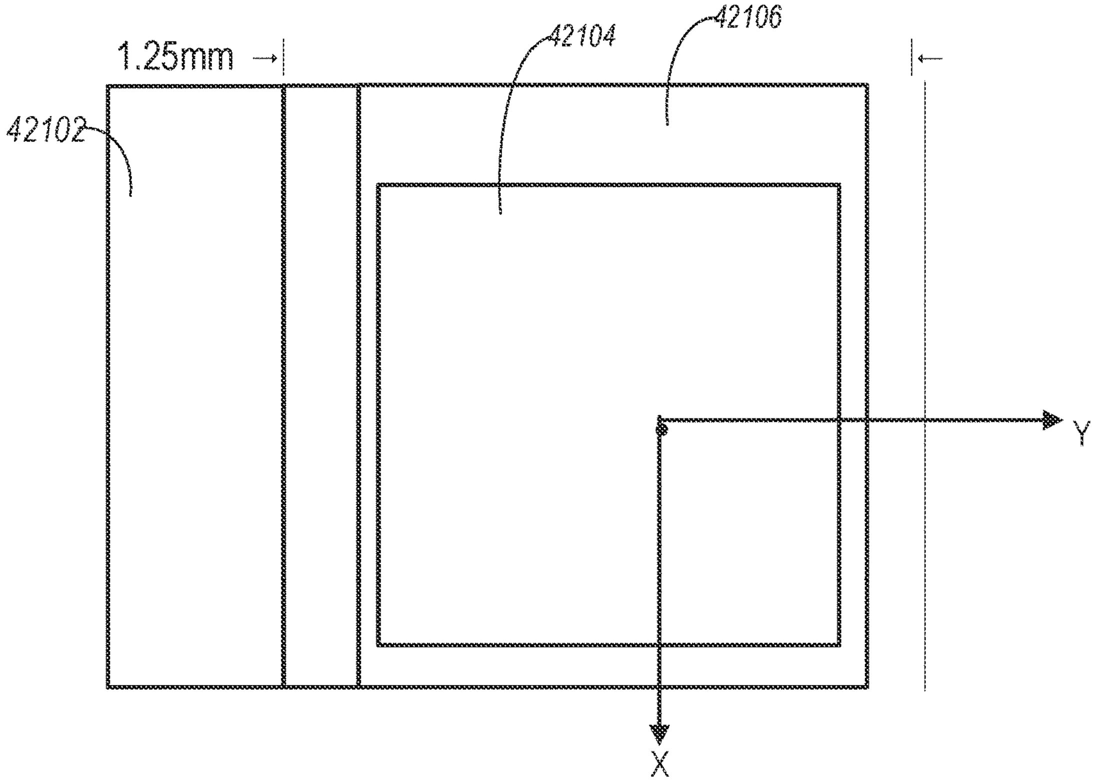
Figure 422C:
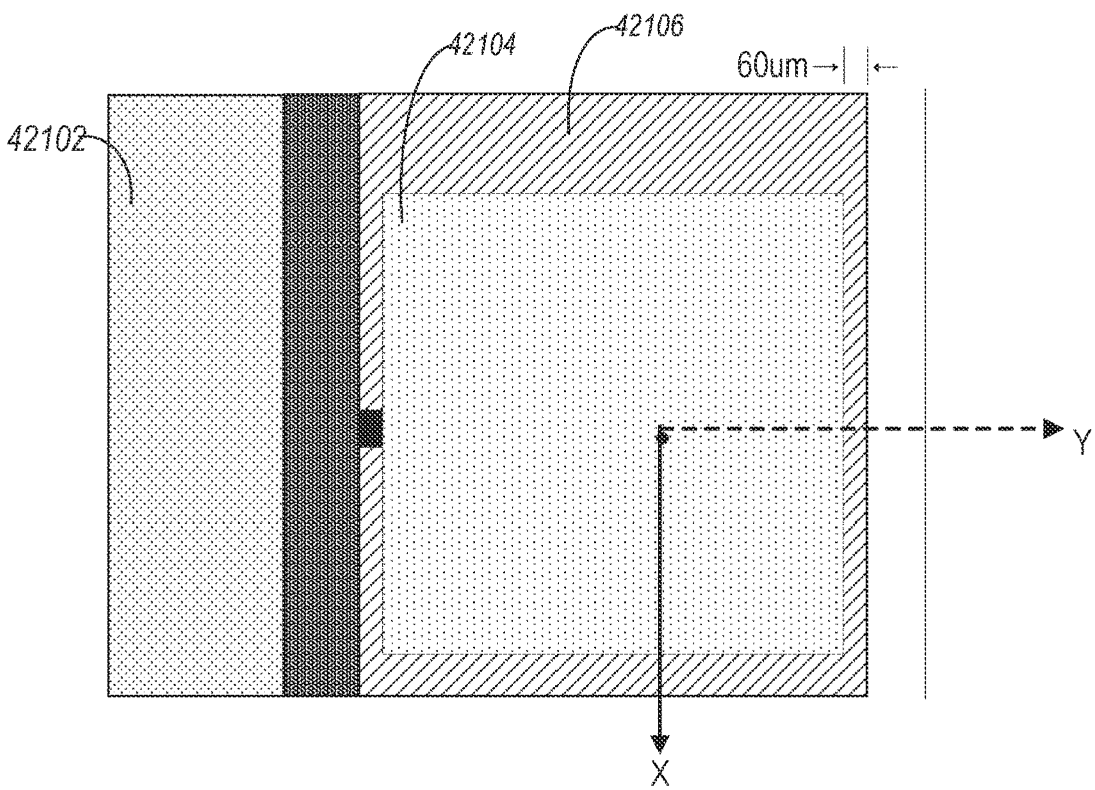

FIGS. 422A-422C illustrate certain dimensions of the monopole antenna illustrated in FIG. 421, according to some aspects of the present disclosure.

Figure 423:
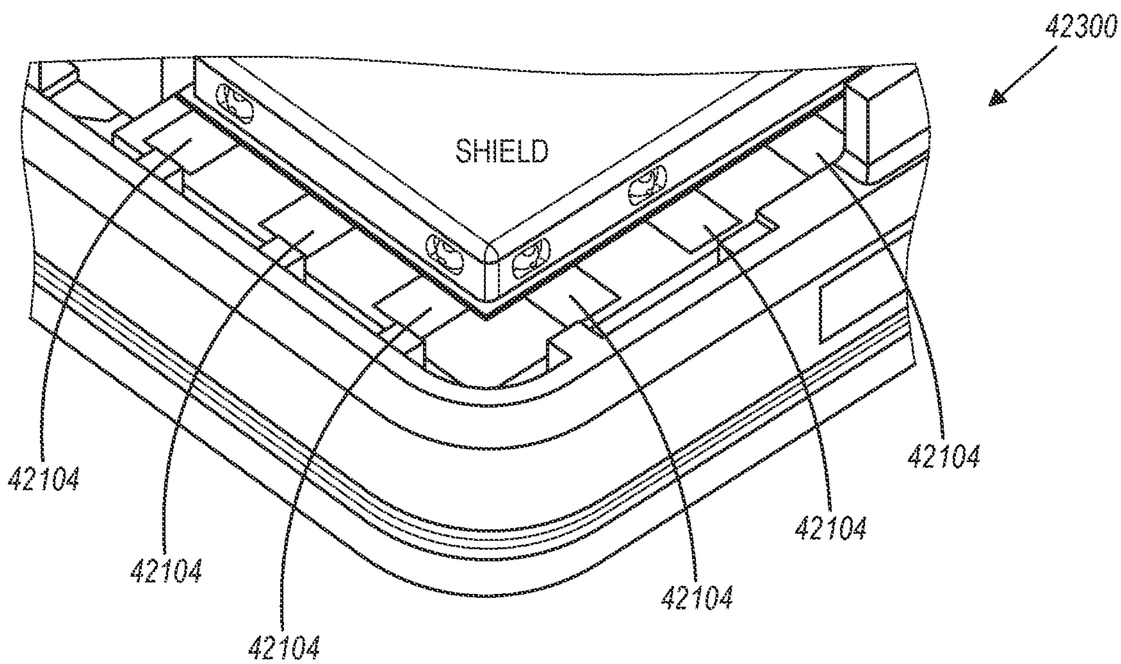

FIG. 423 illustrates patch elements of the monopole antenna of FIGS. 421 and 422 in an antenna array configuration with a mobile platform, according to some aspects of the present disclosure.

Figure 424A:
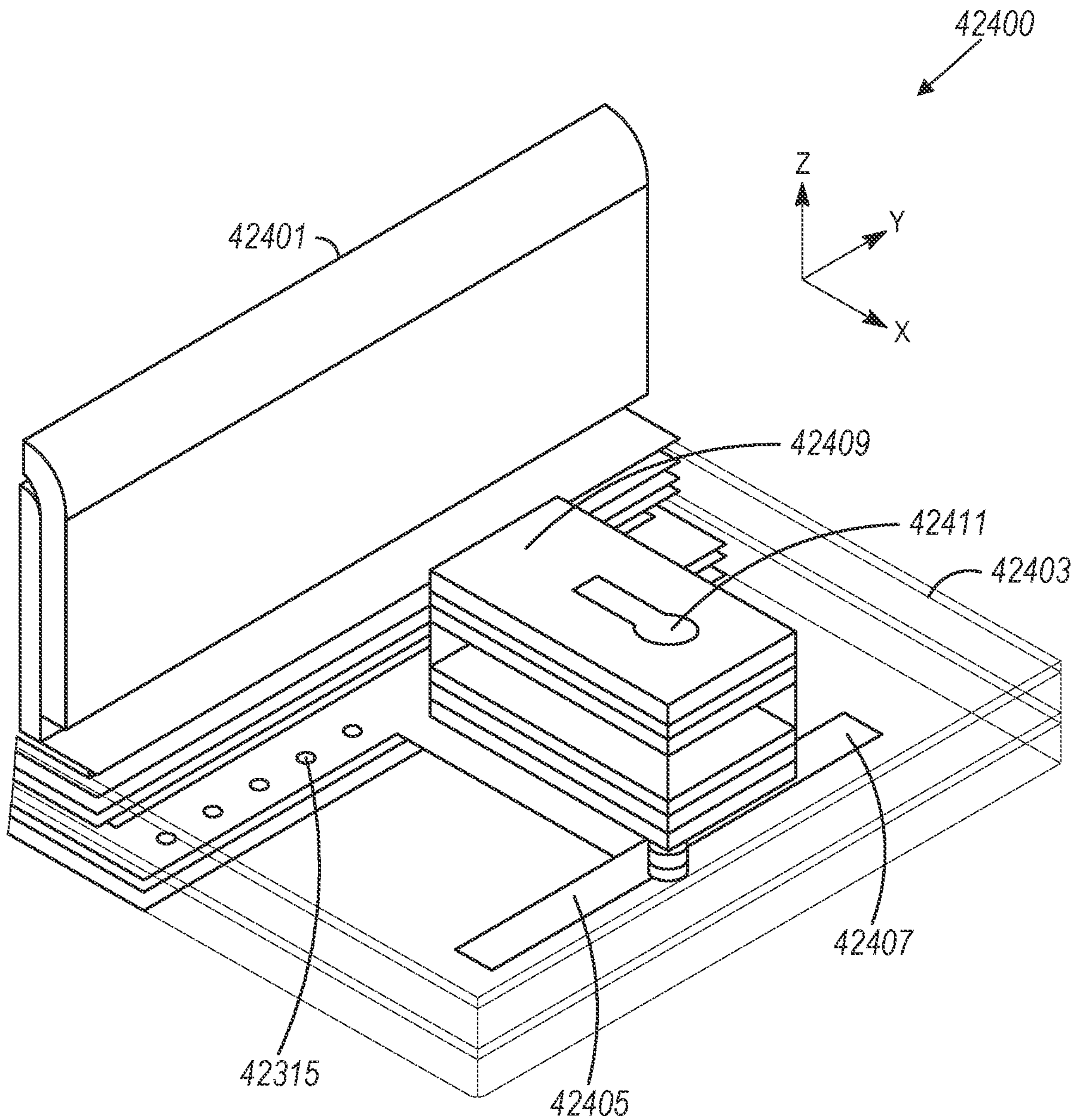

FIG. 424A illustrates a dipole antenna with a surface mounted device (SMD) antenna that transitions the dipole antenna to a dipole with a monopole, according to some aspects of the present disclosure.

Figure 424B:
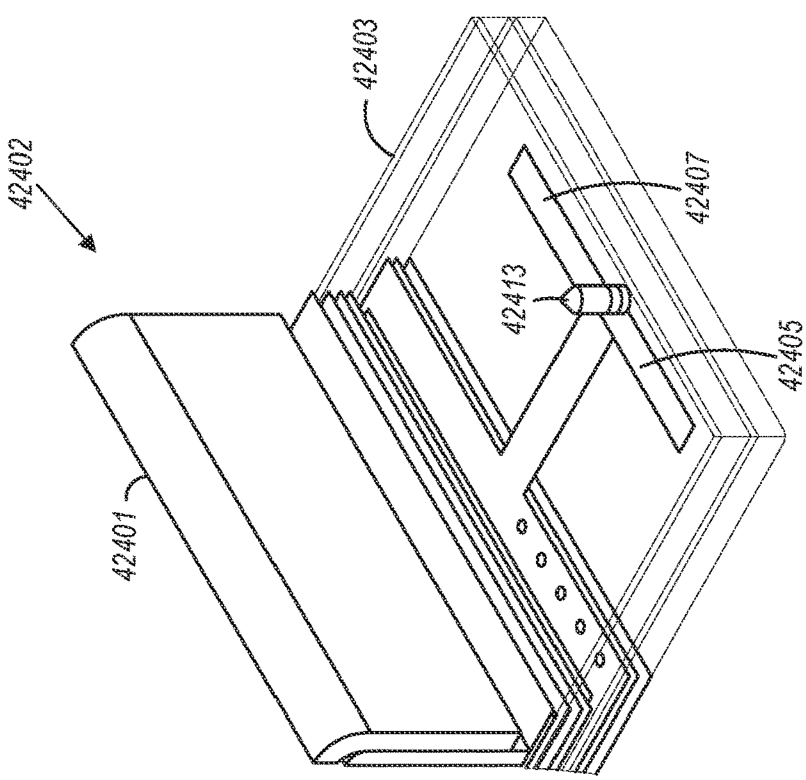

FIG. 424B is a perspective view of the dipole portion of the antenna of FIG. 424A, according to some aspects of the present disclosure.

Figure 424C:
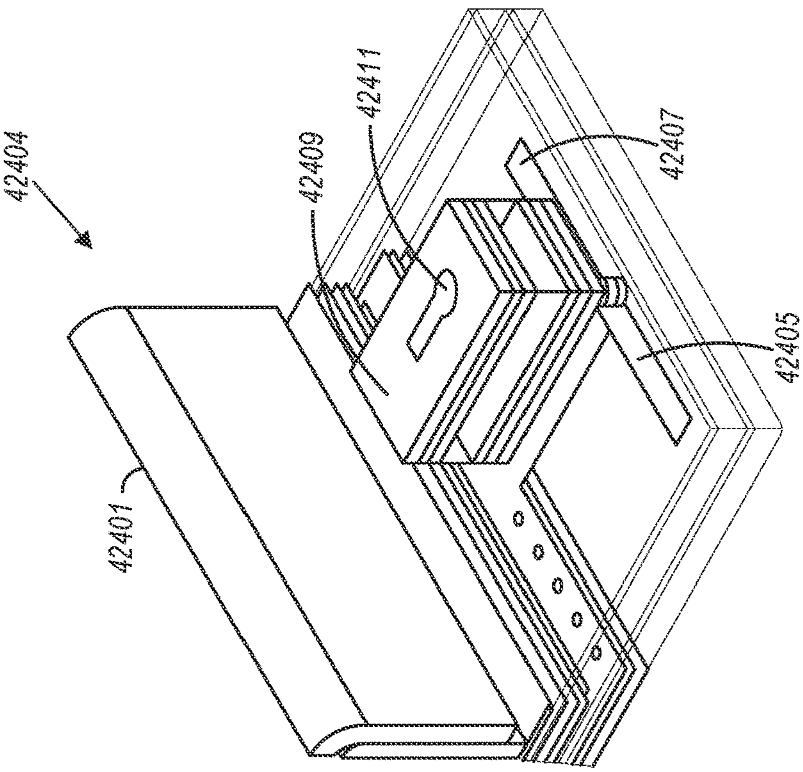

FIG. 424C illustrates a combined dipole and monopole antenna, according to some aspects of the present disclosure.

Figure 424D:
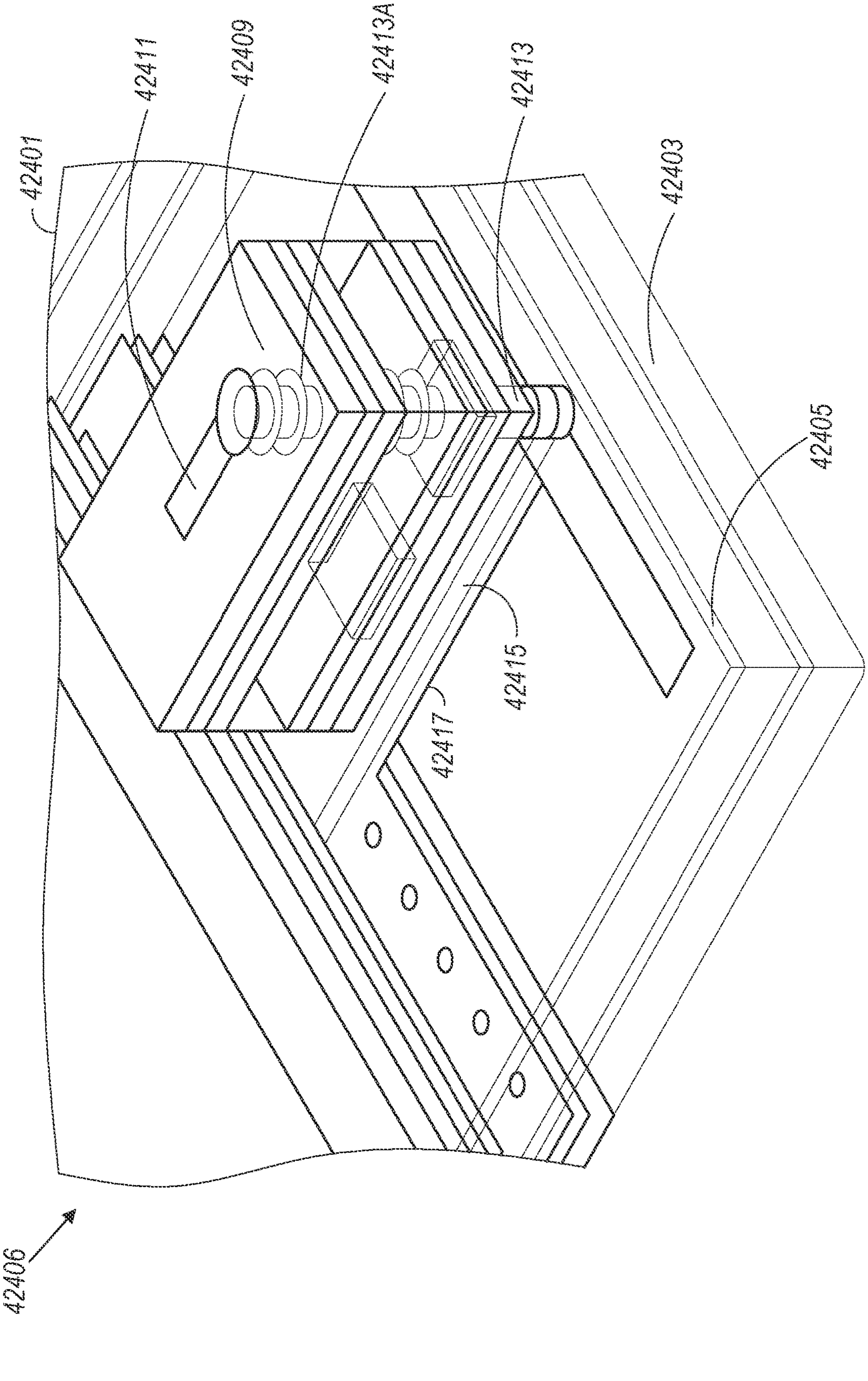

FIG. 424D illustrates a perspective view of the monopole part of the antenna of FIG. 424A, according to some aspects of the present disclosure.

Figure 424E:
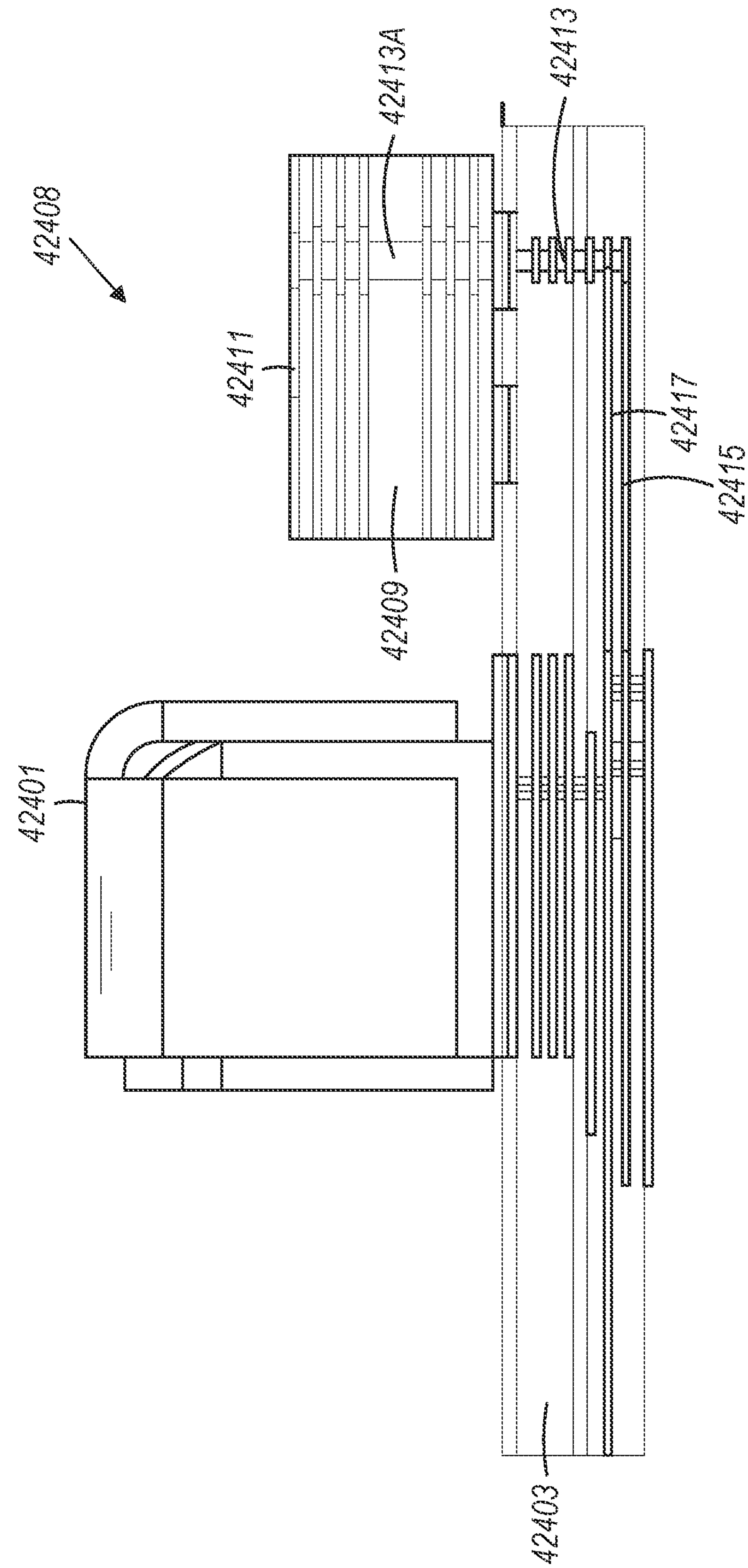

FIG. 424E is a side view of the antenna of FIGS. 424A and 424D, according to some aspects of the present disclosure.

Figure 425:
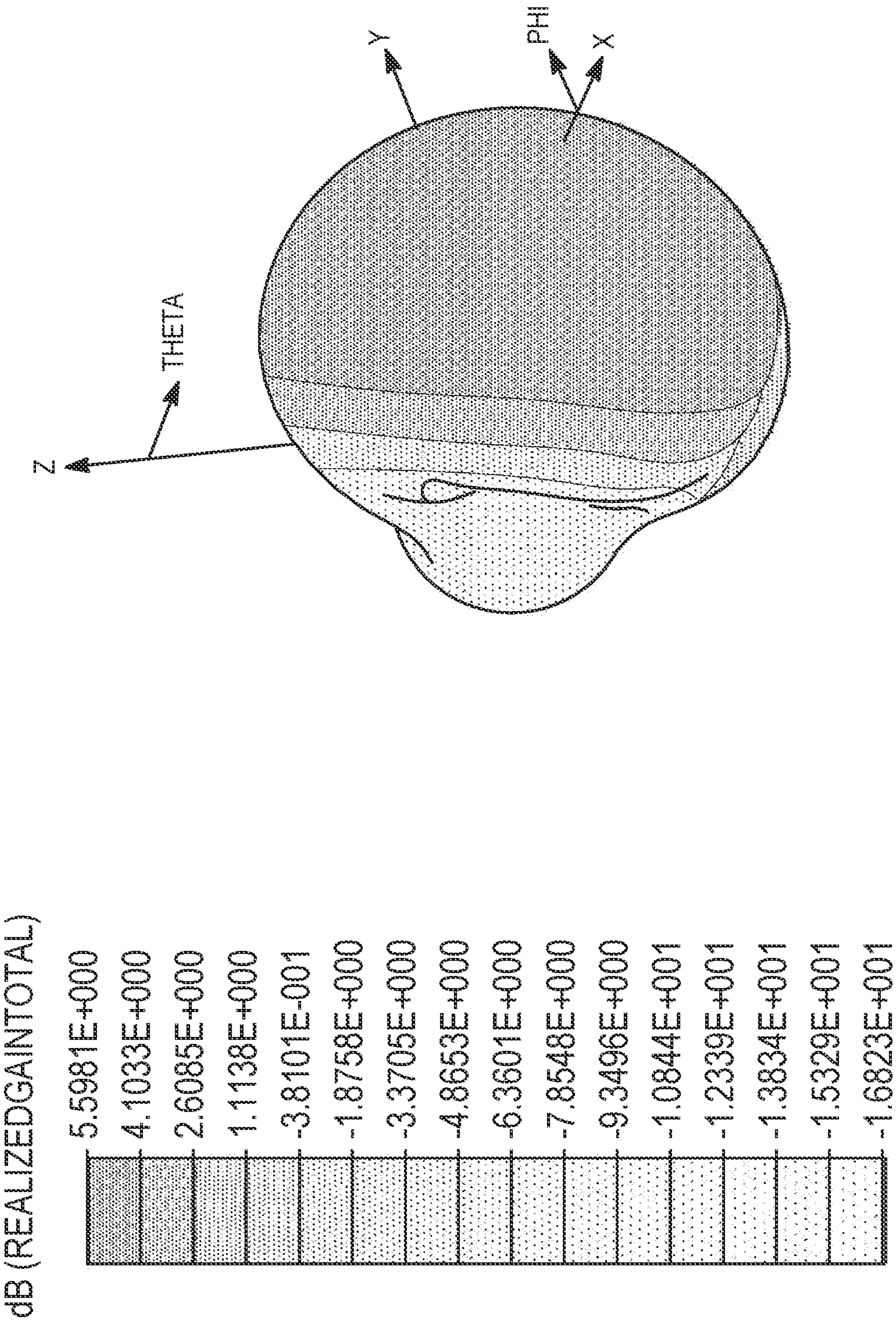

FIG. 425 illustrates a radiation pattern of the antenna of FIG. 424A, according to some aspects of the present disclosure.

Figures 426A, 426B:
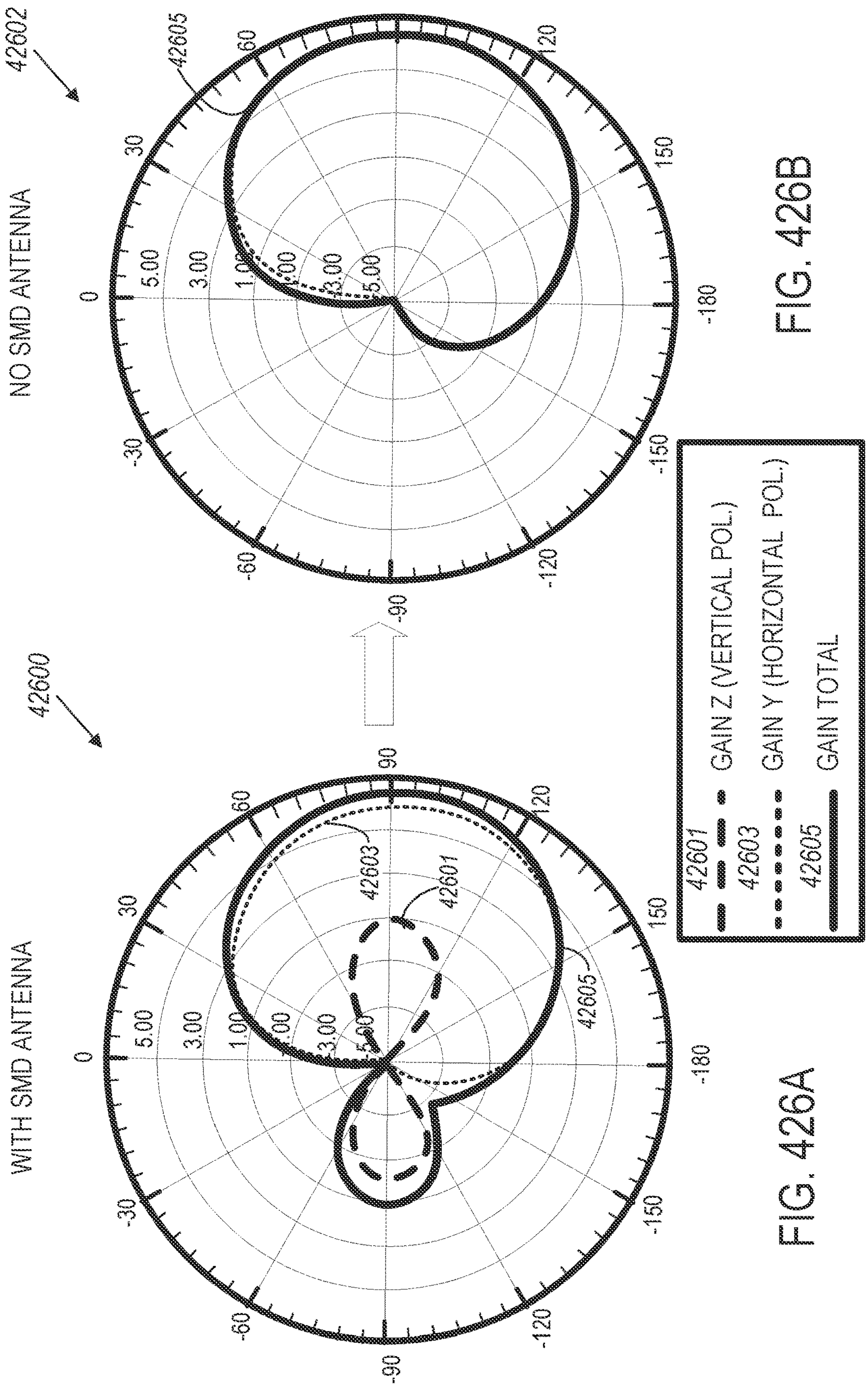

FIG. 426A illustrates an elevation cut of the radiation pattern of the antenna of FIG. 424A, FIG. 426B illustrates a radiation pattern of the antenna of FIG. 424B, according to some aspects of the present disclosure.

Figure 427A:
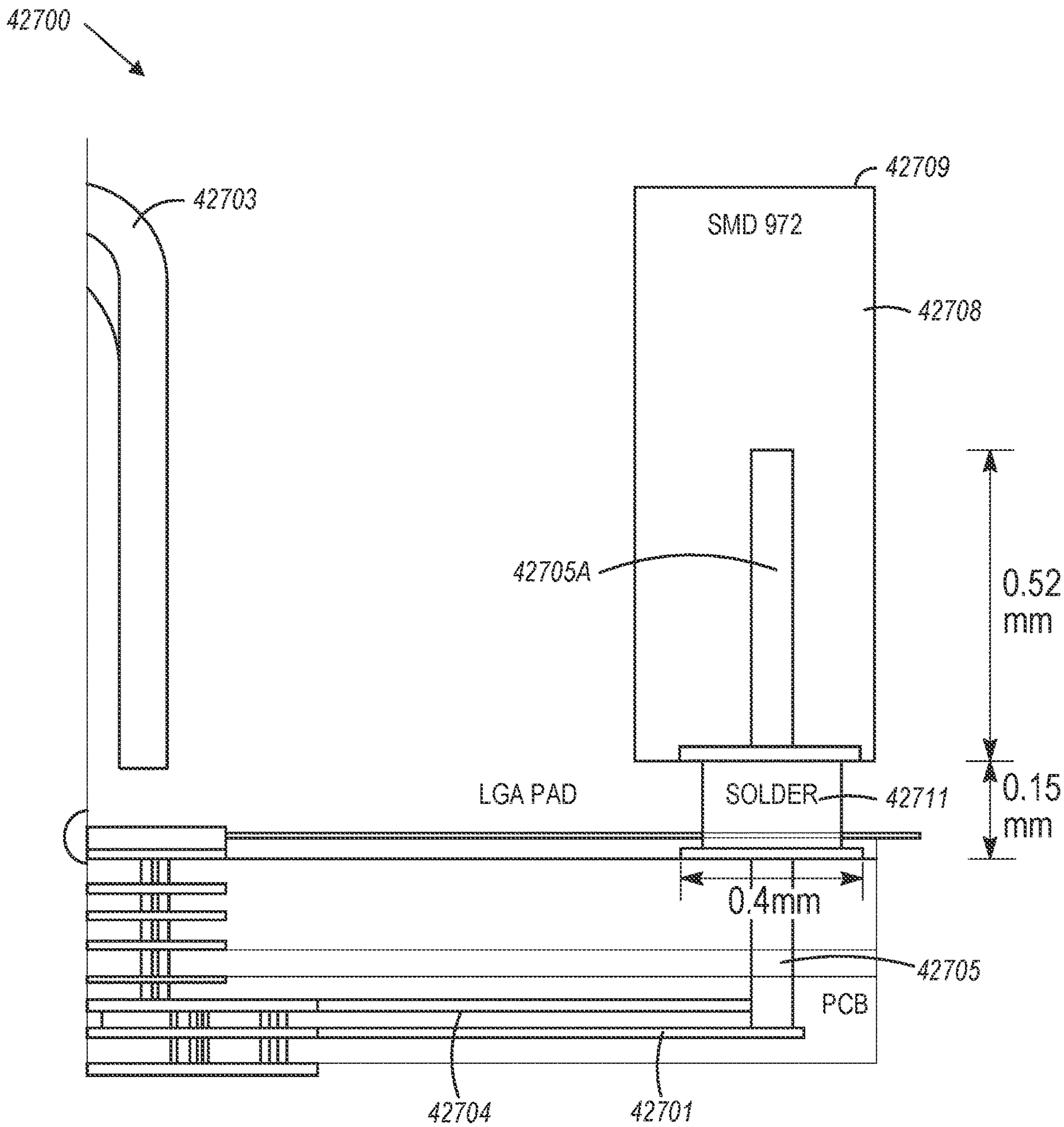

FIG. 427A illustrates a side view of an SMD L-shaped dipole with an IC shield used as a reflector, according to some aspects of the present disclosure.

Figure 427B:
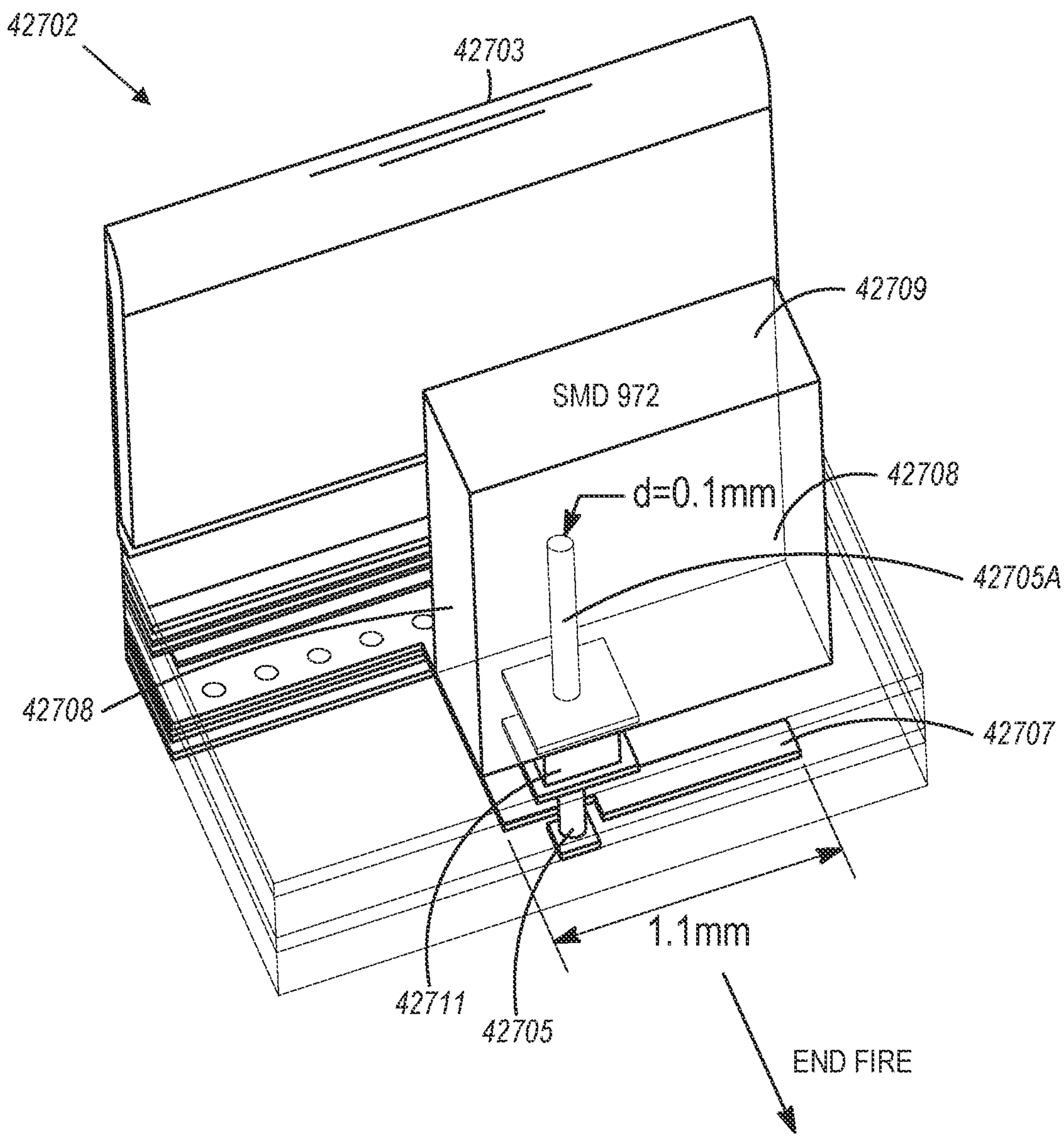

FIG. 427B illustrates a perspective view of the SMD L-shaped dipole with an IC shield used as a reflector that is illustrated in FIG. 427A, according to some aspects of the present disclosure.

Figure 428:
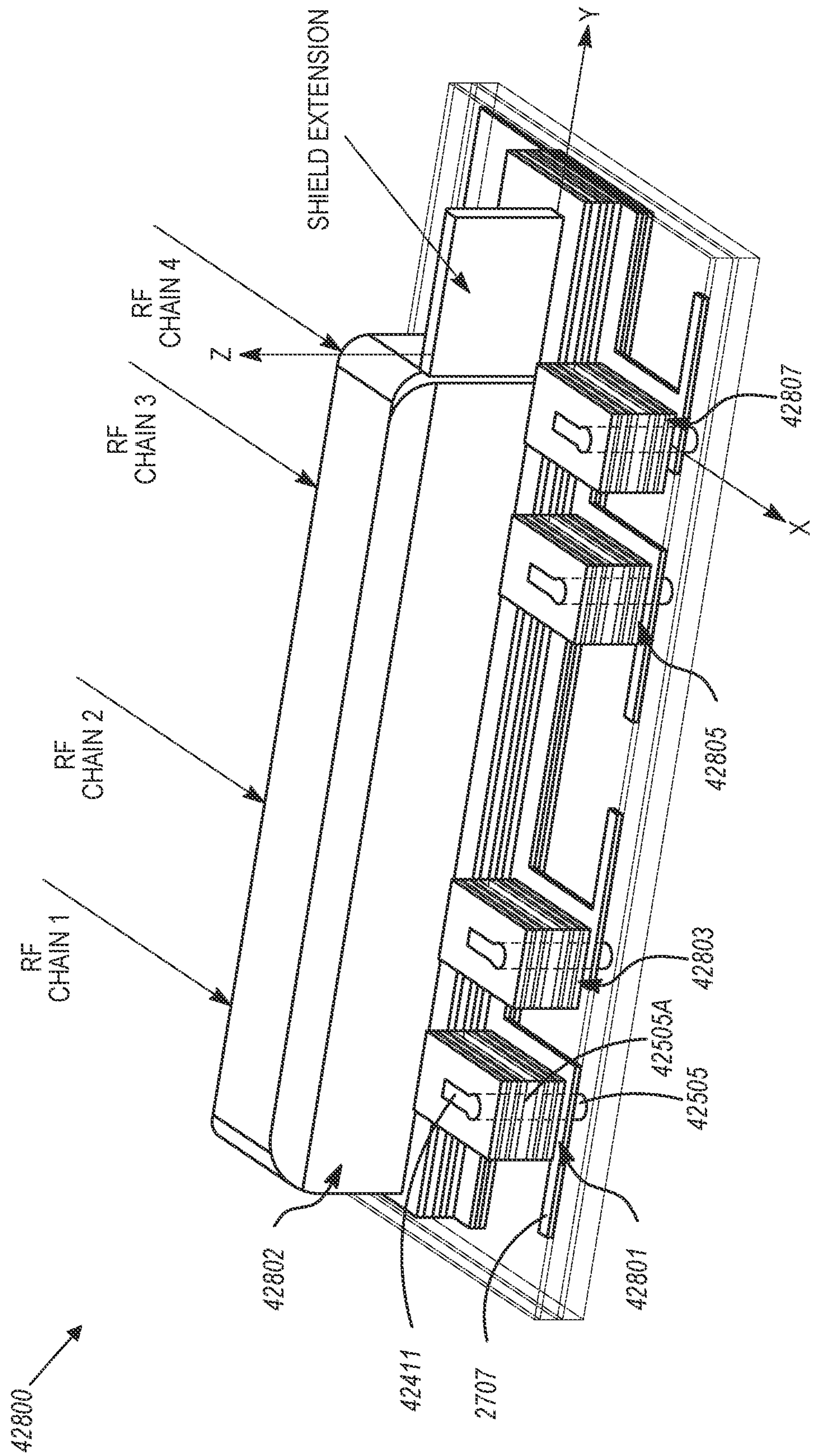

FIG. 428 illustrates a perspective view of an array of four SMD L-shaped dipoles, according to an aspect.

Figure 429A:
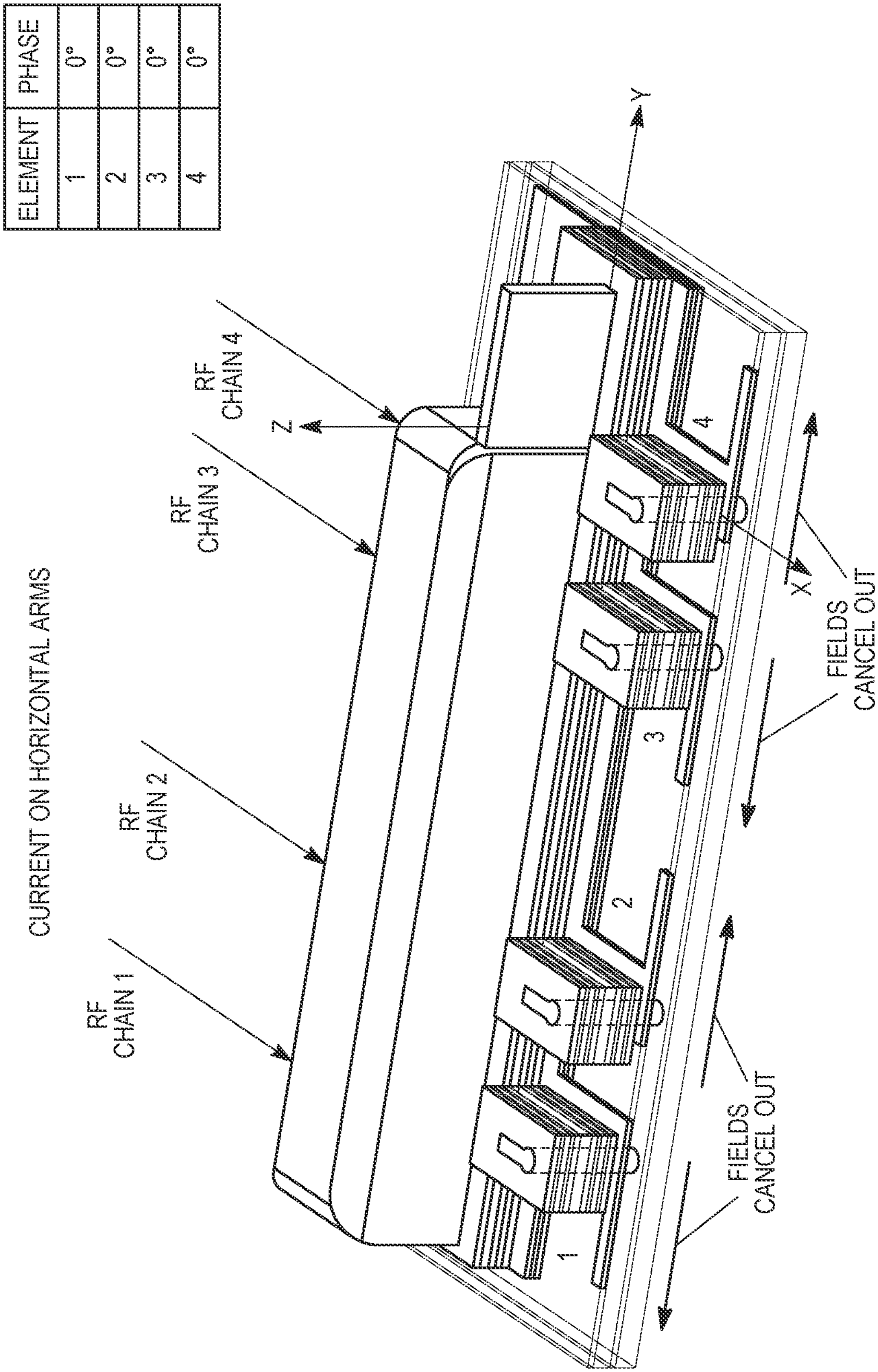

FIG. 429A illustrates the array of FIG. 428 for vertical polarization, with the fields cancelling out, according to some aspects of the present disclosure.

Figure 429B:
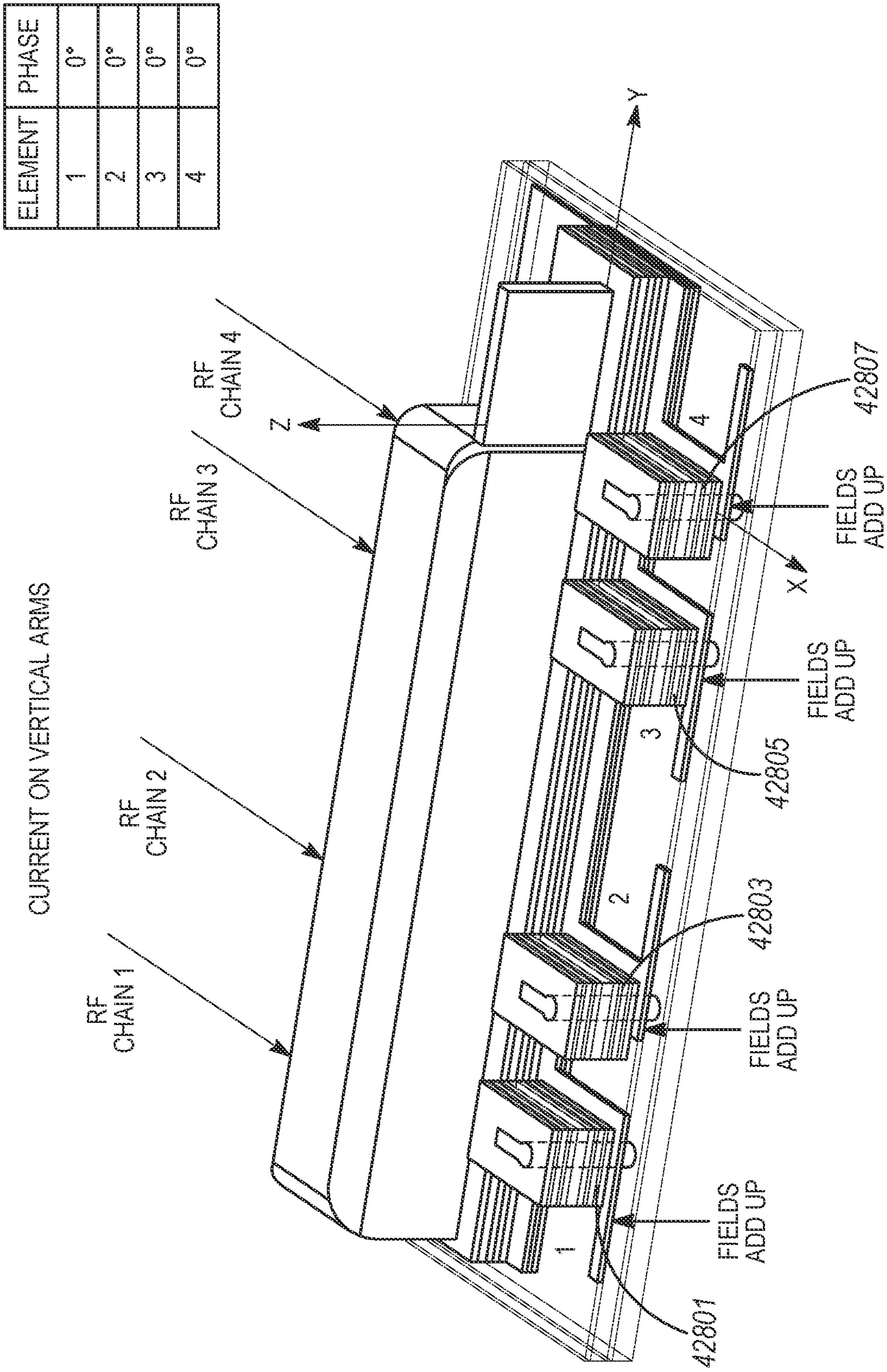

FIG. 429B illustrates the array of FIG. 428 for vertical polarization, with the fields adding up, according to some aspects of the present disclosure.

Figure 430A:
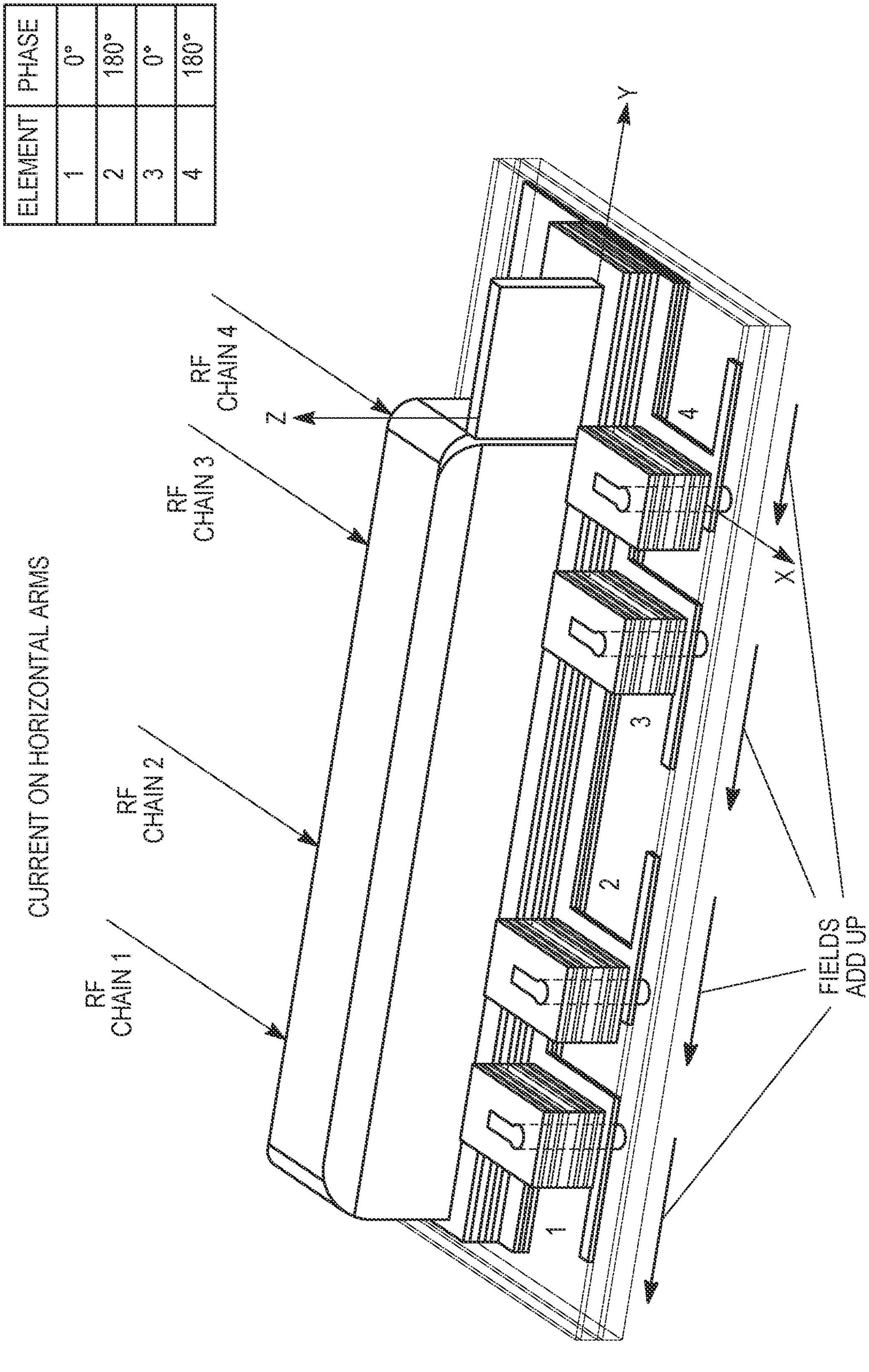

FIG. 430A illustrates the array of FIG. 428 for horizontal polarization, with the fields adding up, according to some aspects of the present disclosure.

Figure 430B:
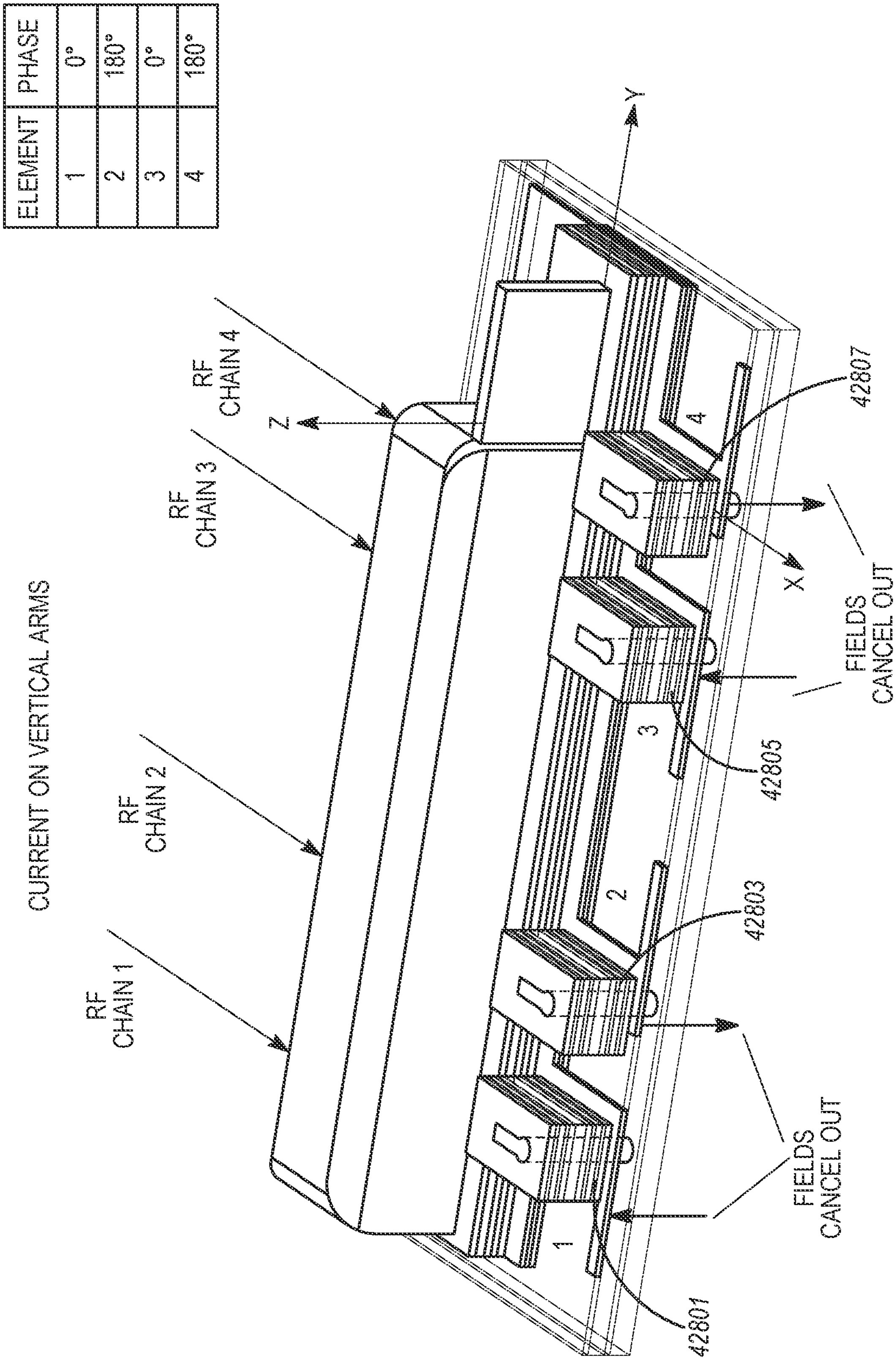

FIG. 430B illustrates the array of FIG. 428 for horizontal polarization, with the fields cancelling out, according to some aspects of the present disclosure.

Figure 431:
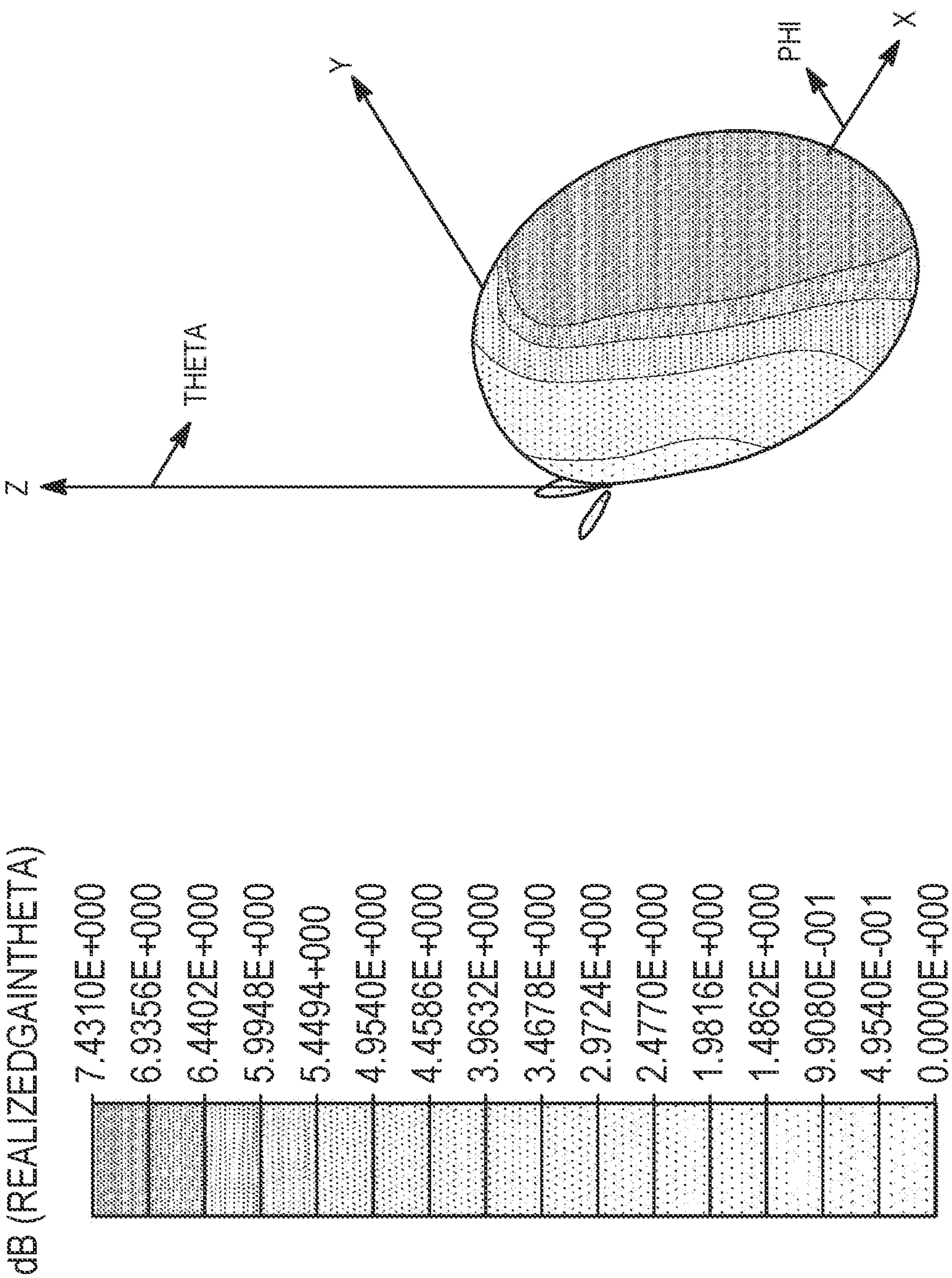

FIG. 431 illustrates a three-dimensional radiation pattern for vertical (theta) polarization, according to some aspects of the present disclosure.

Figure 432:
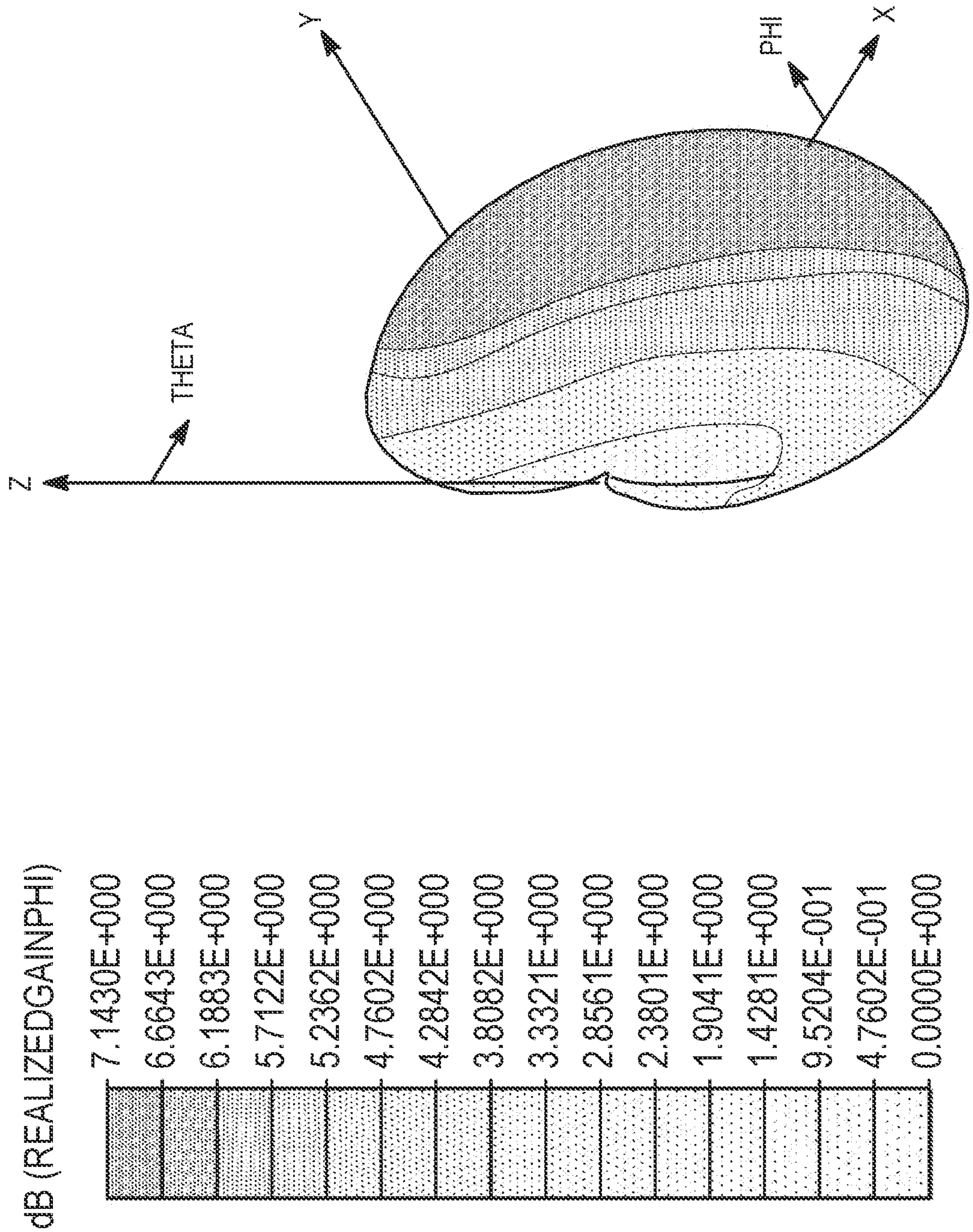

FIG. 432 illustrates a three-dimensional radiation pattern for horizontal (phi) polarization, according to some aspects of the present disclosure.

Figure 433:
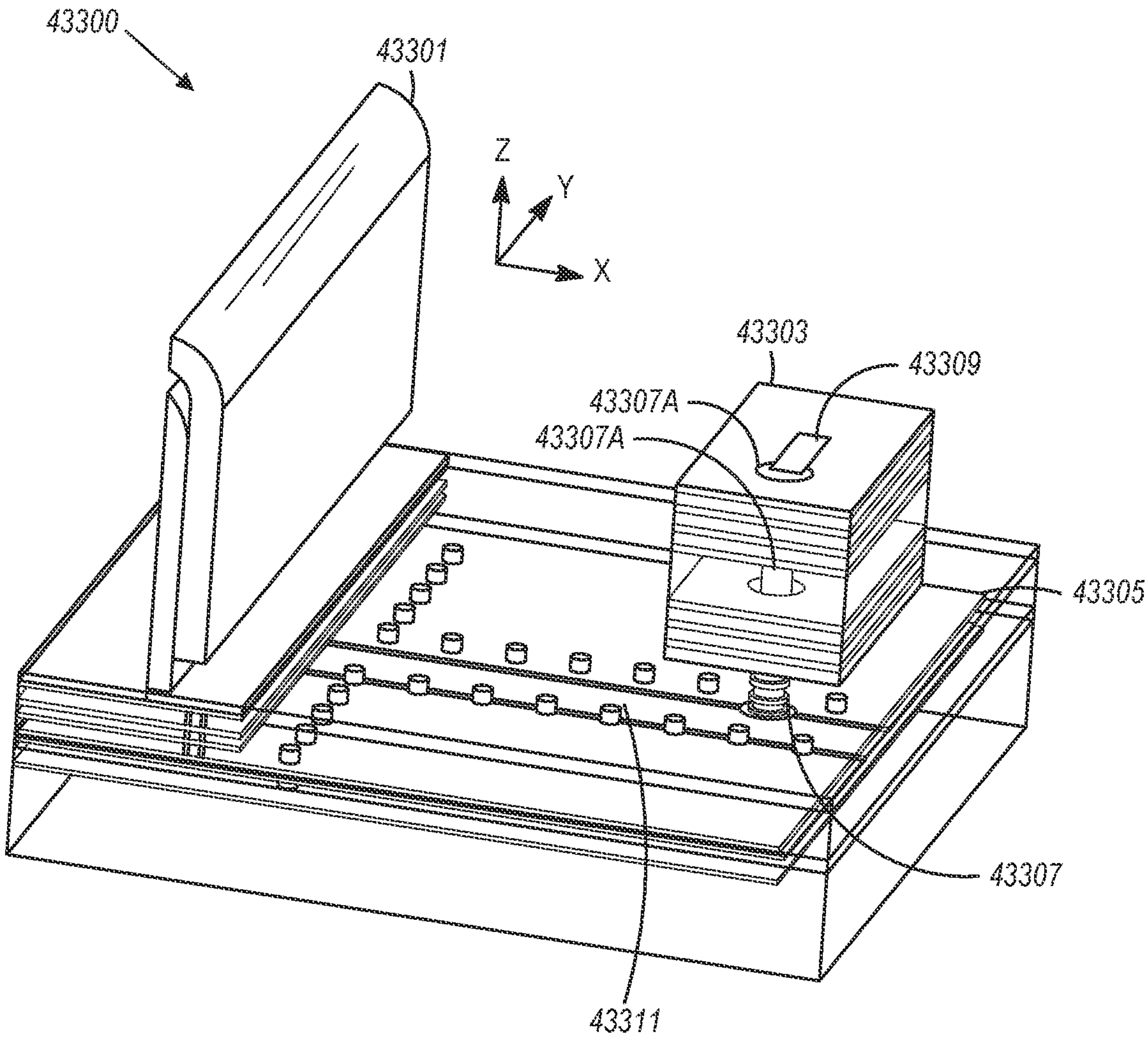

FIG. 433 illustrates a single SMD monopole antenna, according to some aspects of the present disclosure.

Figure 434:
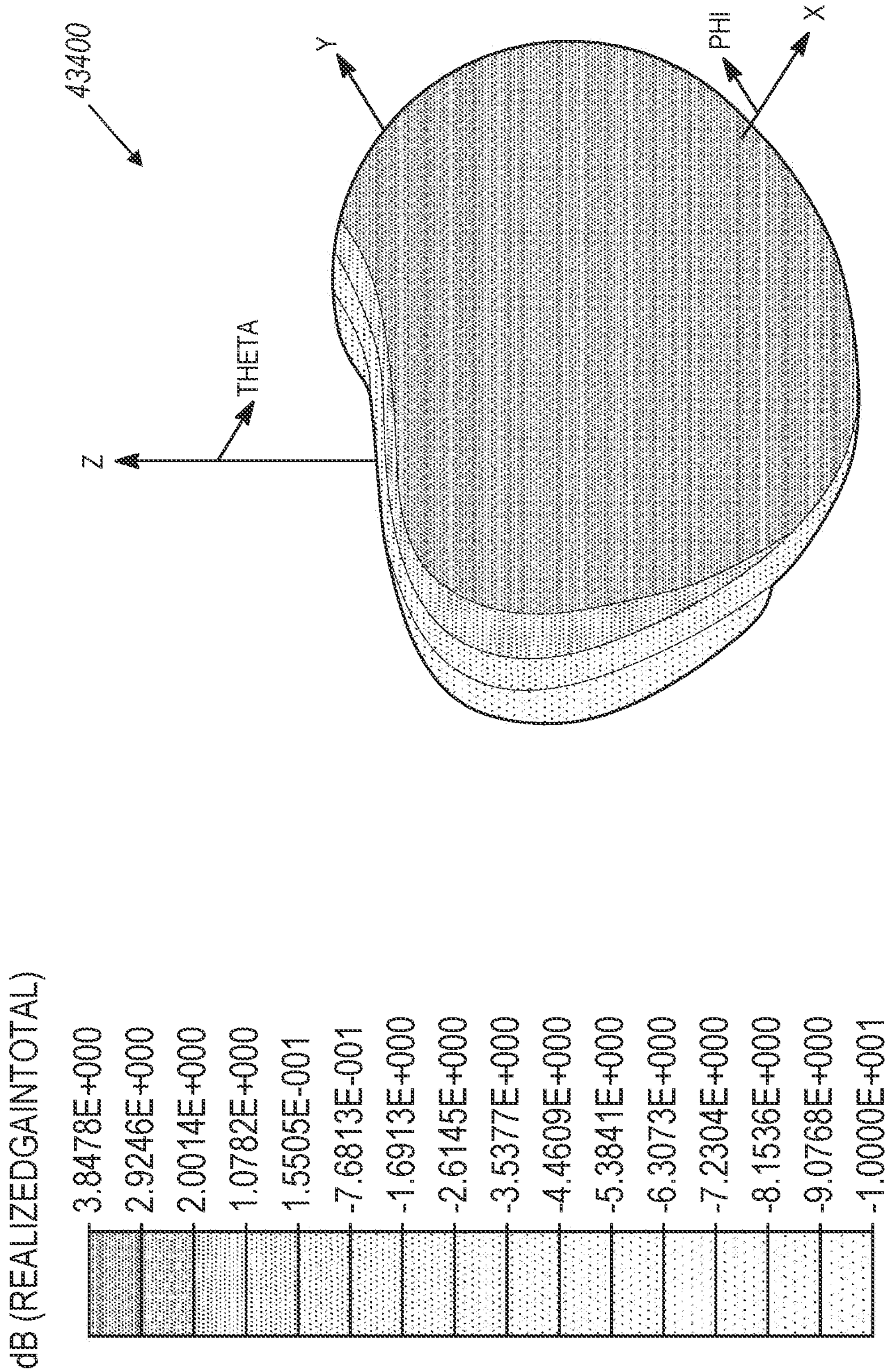

FIG. 434 illustrates a three-dimensional radiation pattern, according to some aspects of the present disclosure.

Figure 435:
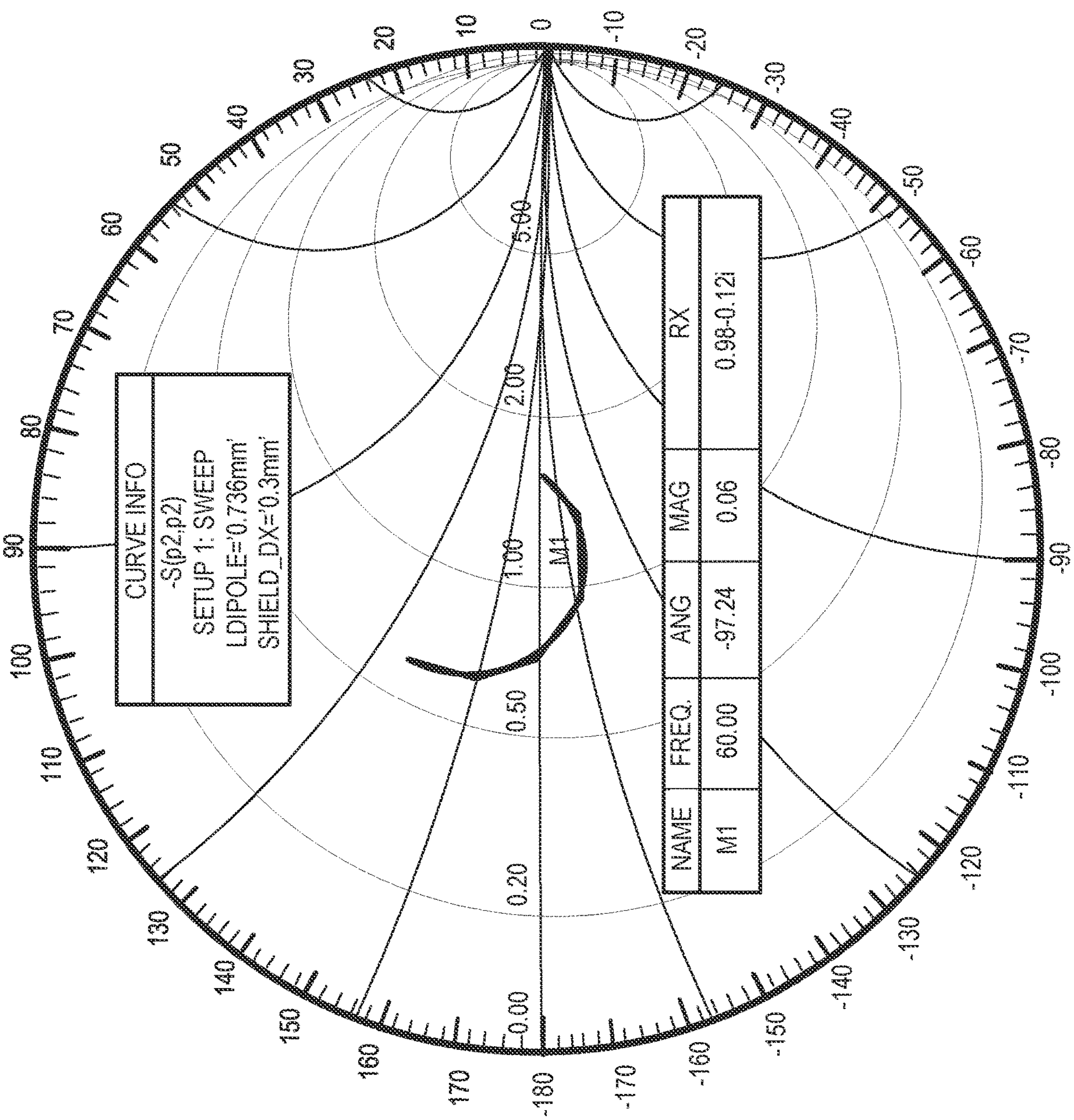

FIG. 435 illustrates an impedance plot of a single monopole, according to some aspects of the present disclosure.

Figure 436:
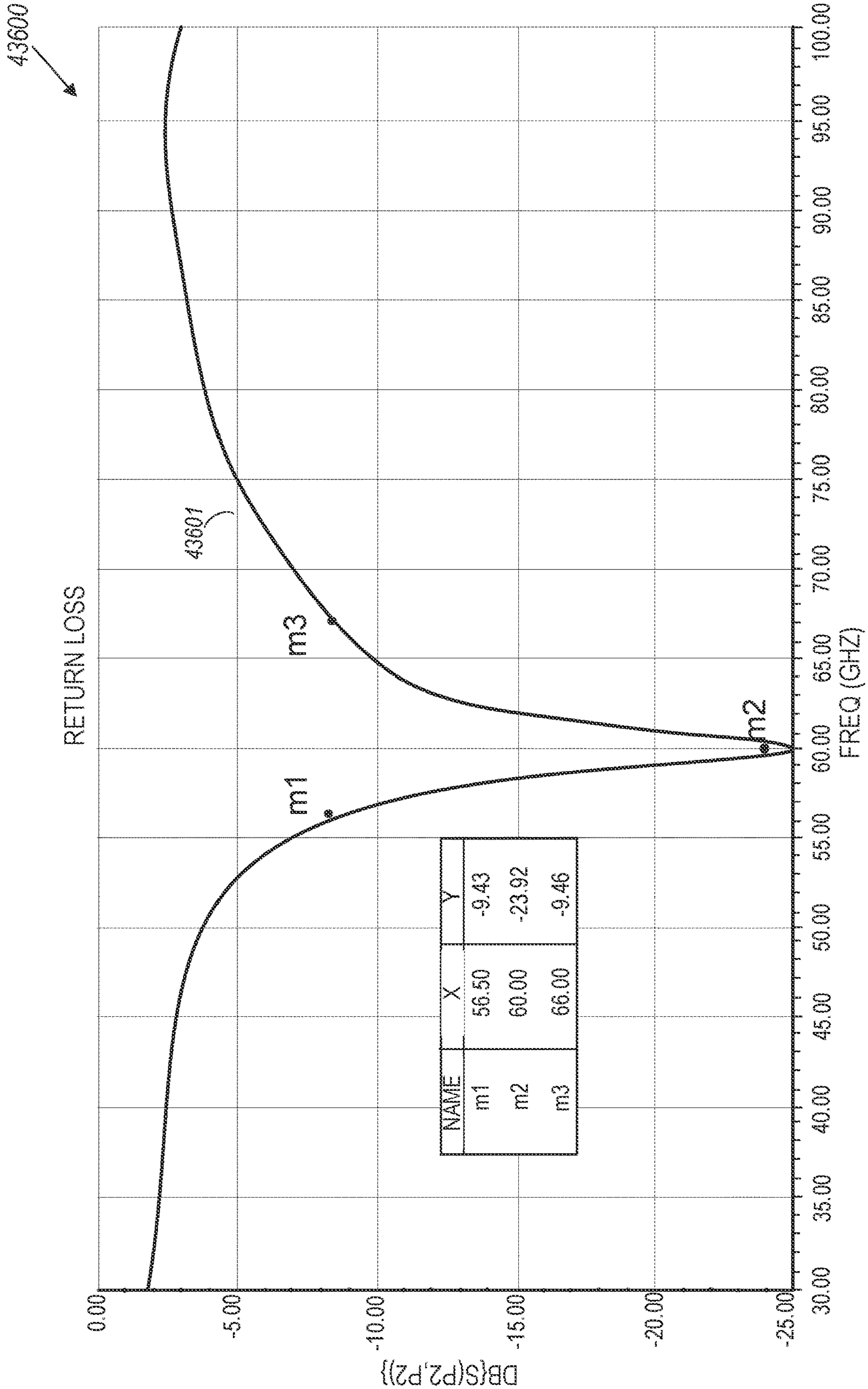

FIG. 436 illustrates the return loss of a single monopole over frequency, according to some aspects of the present disclosure.

Figure 437:
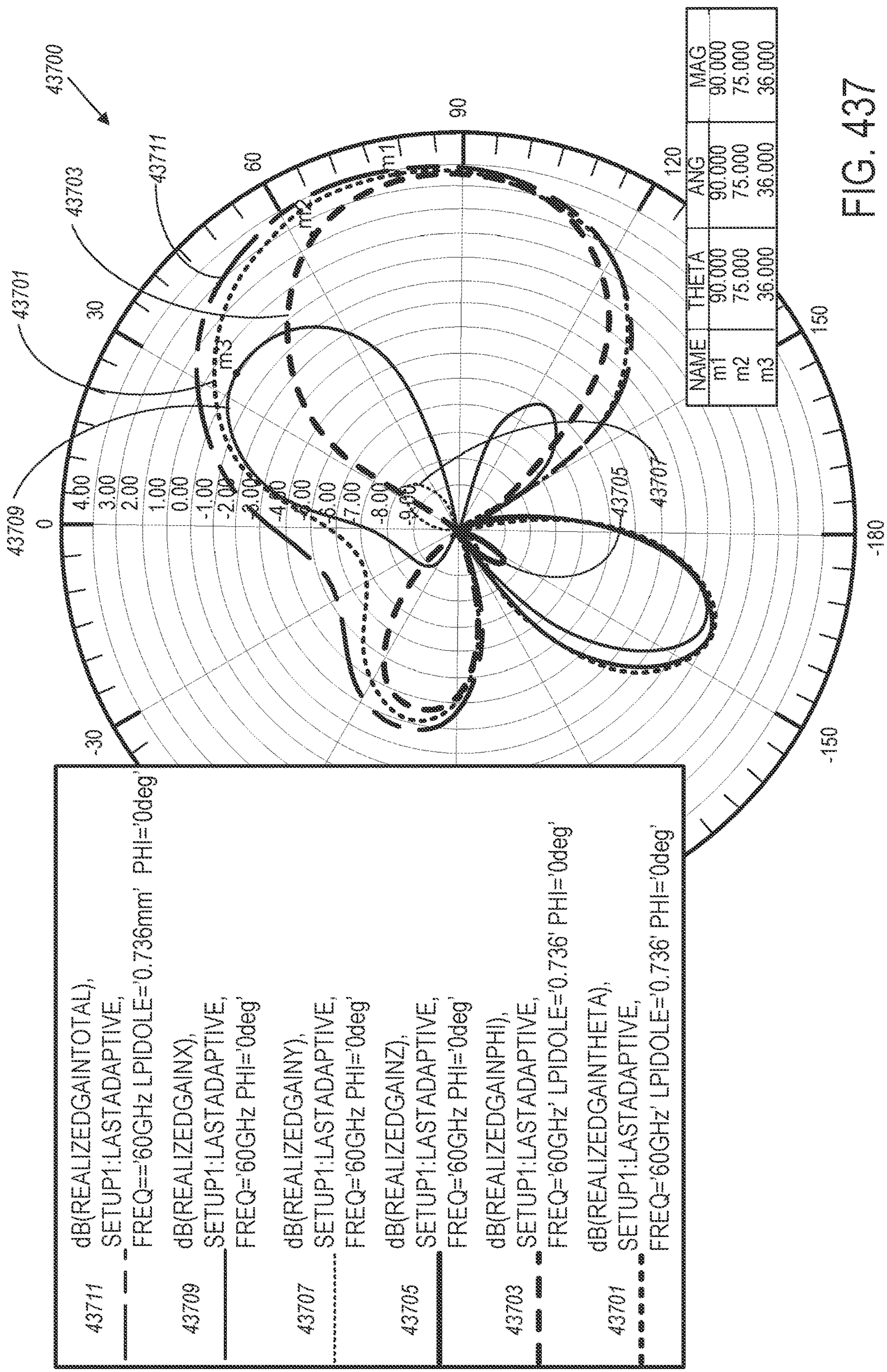

FIG. 437 illustrates realized vertical polarization (θ) gain in the X-Z plane from a single monopole, according to some aspects of the present disclosure.

Figure 438:
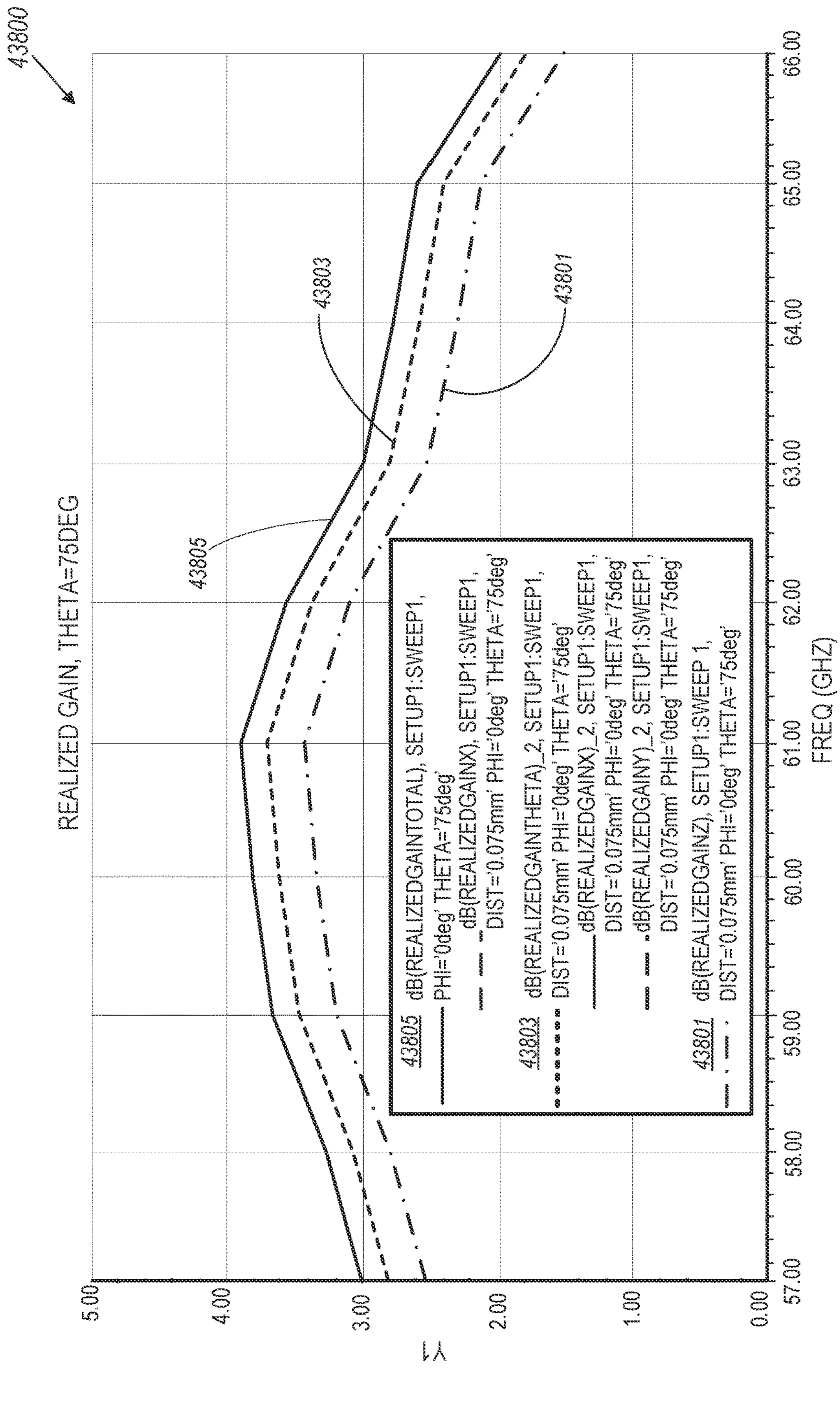

FIG. 438 illustrates realized vertical polarization (θ) gain over frequency, at 15° above endfire, from a single monopole, according to some aspects of the present disclosure.

Figure 439:
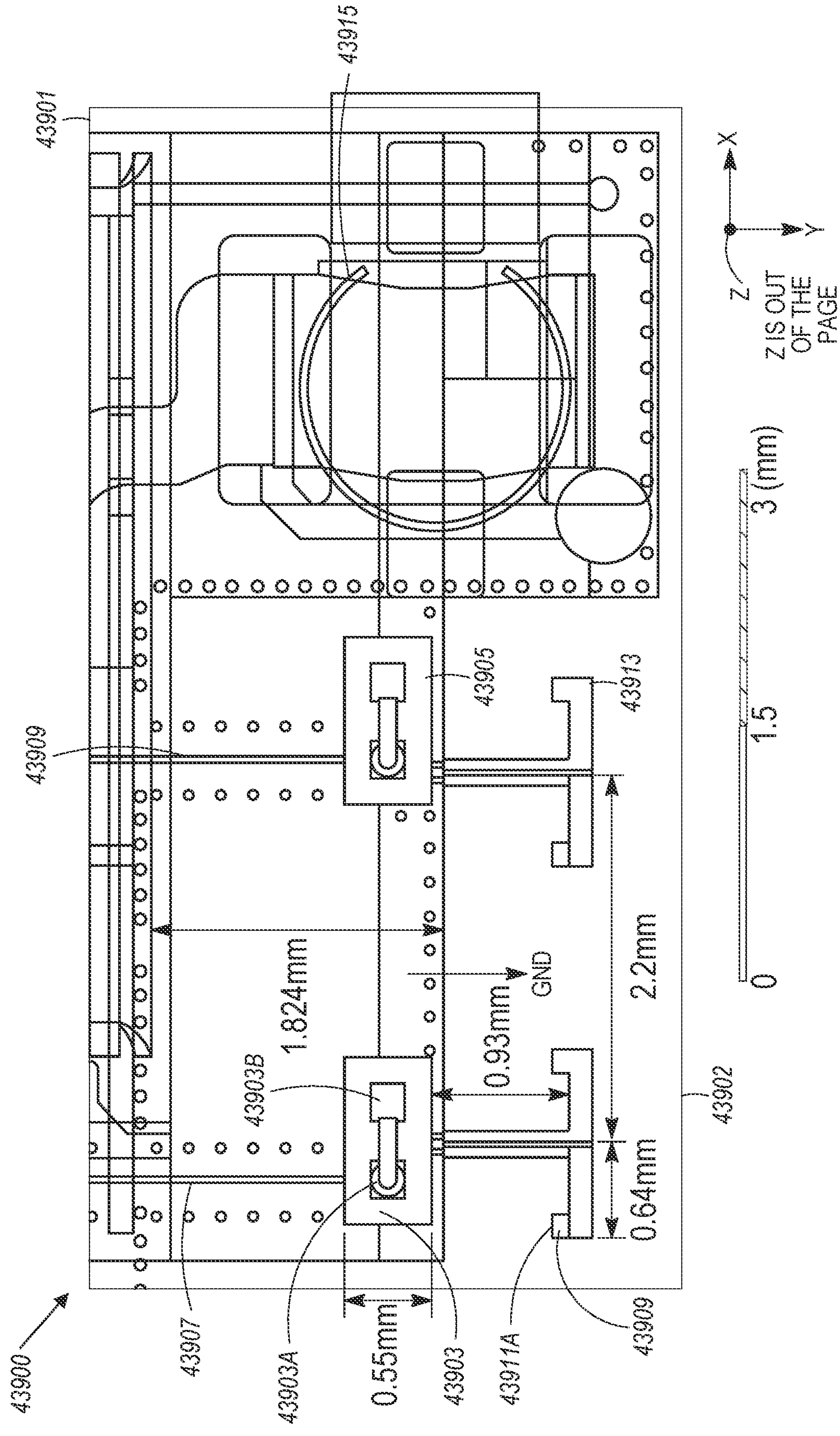

FIG. 439 illustrates a two-element monopole and a two-element dipole array, according to some aspects of the present disclosure.

Figure 440:
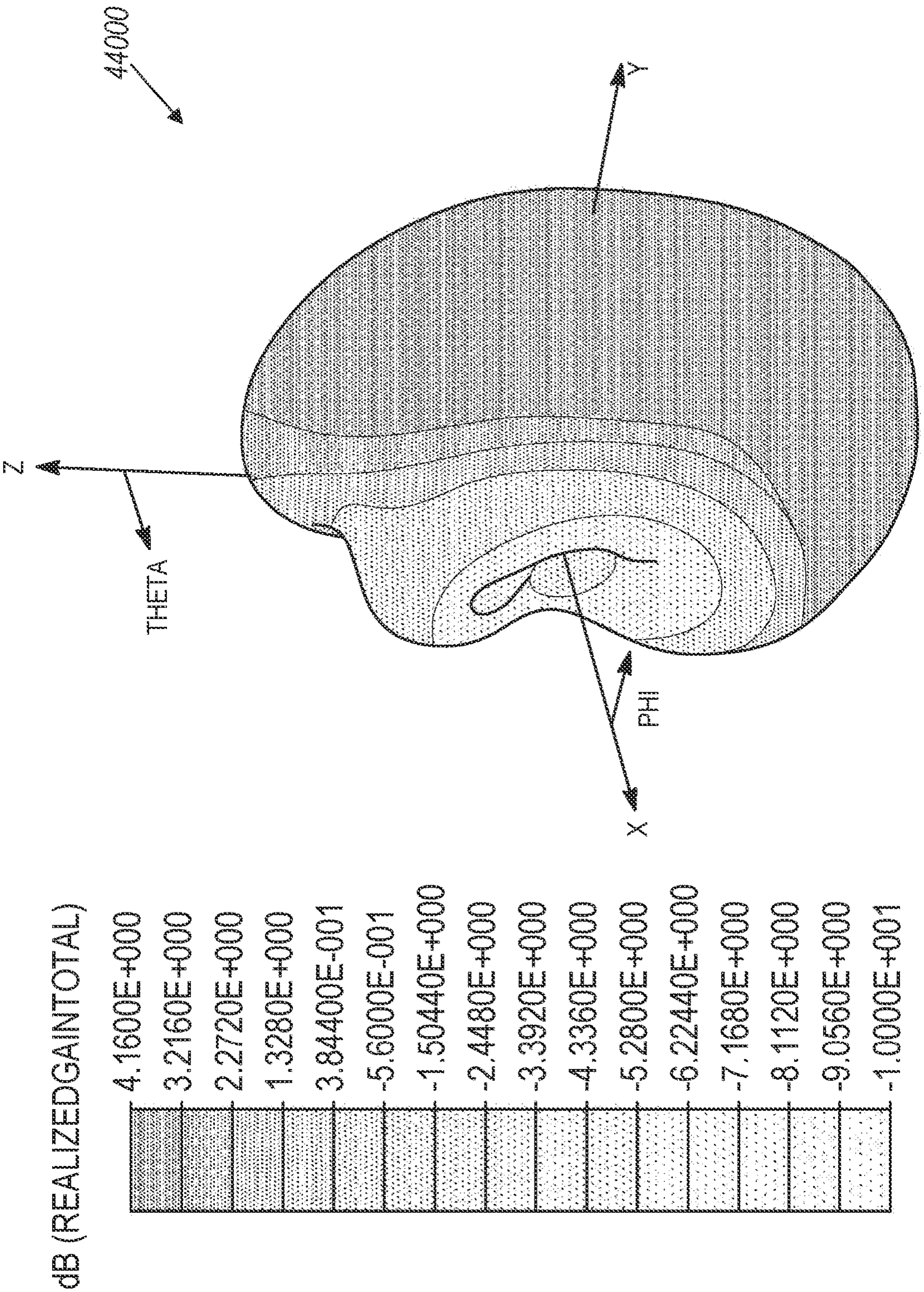

FIG. 440 illustrates a three-dimensional radiation pattern of the two-dipole array of FIG. 439 at 60 GHz, according to some aspects of the present disclosure.

Figure 441:
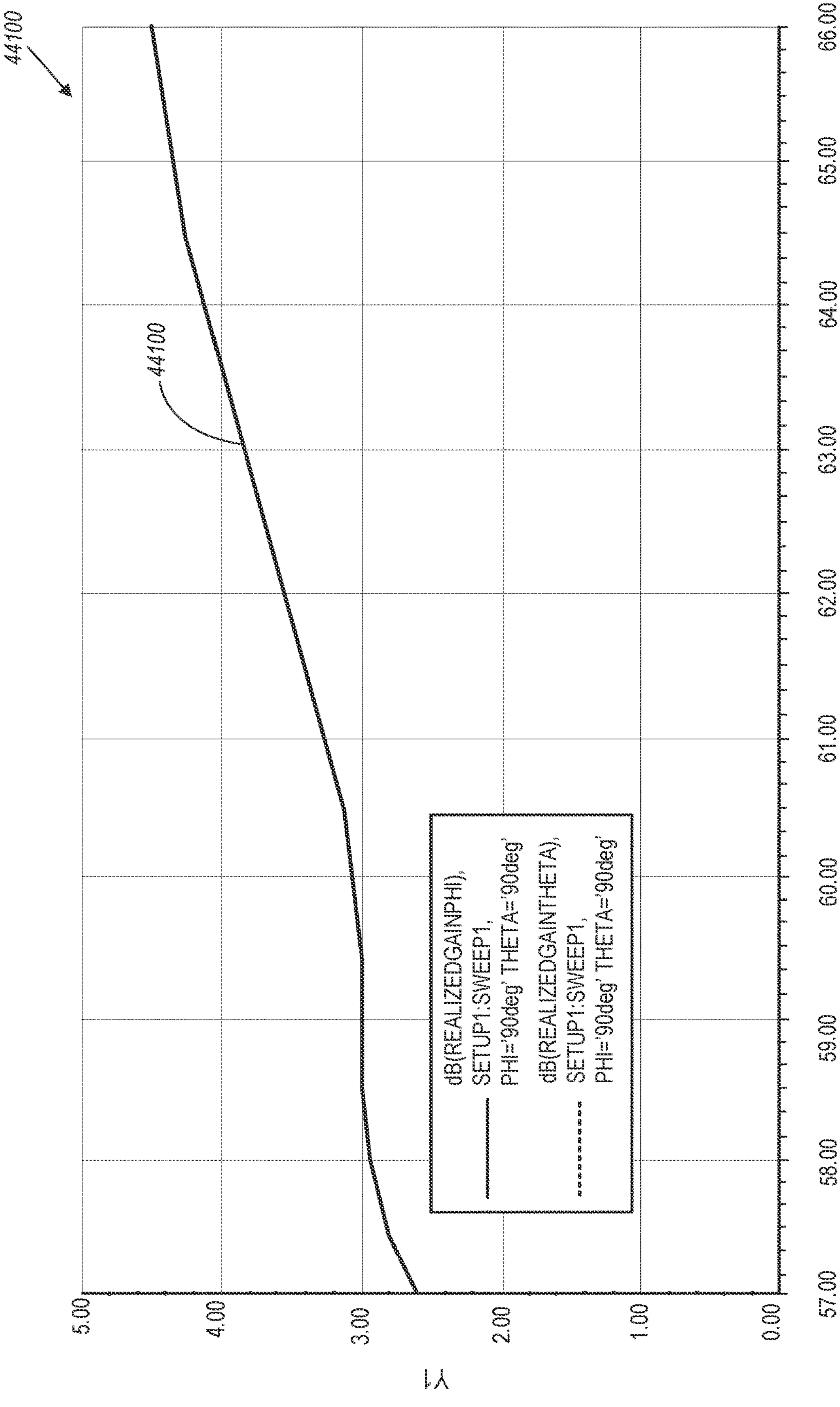

FIG. 441 illustrates realized horizontal polarity (Ø) gain over frequency in the endfire direction from the two-dipole array of FIG. 439, according to some aspects of the present disclosure.

Figure 442:
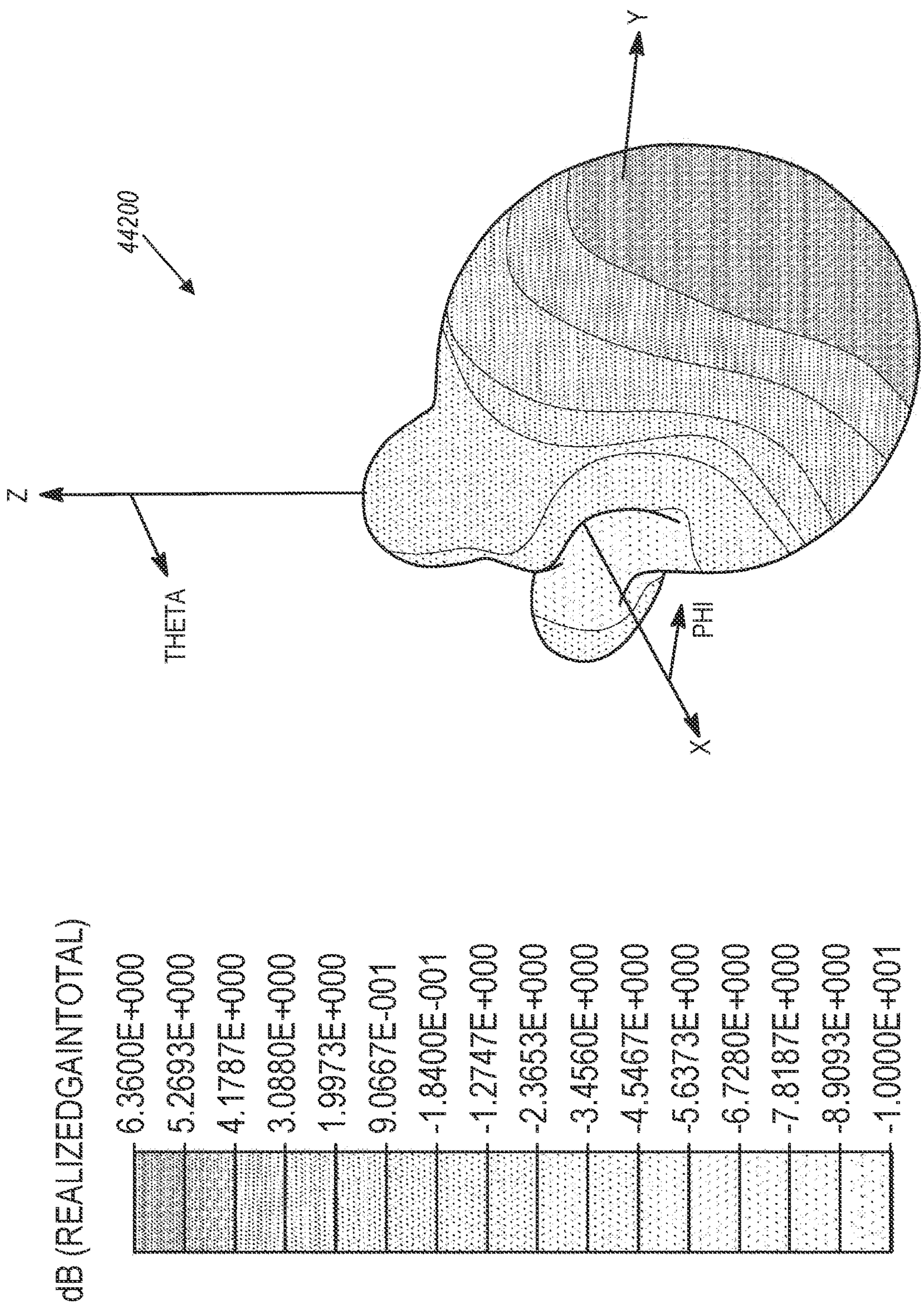

FIG. 442 illustrates a three-dimensional radiation pattern of the two-monopole array of FIG. 439 at 60 GHz, according to some aspects of the present disclosure.

Figure 443:
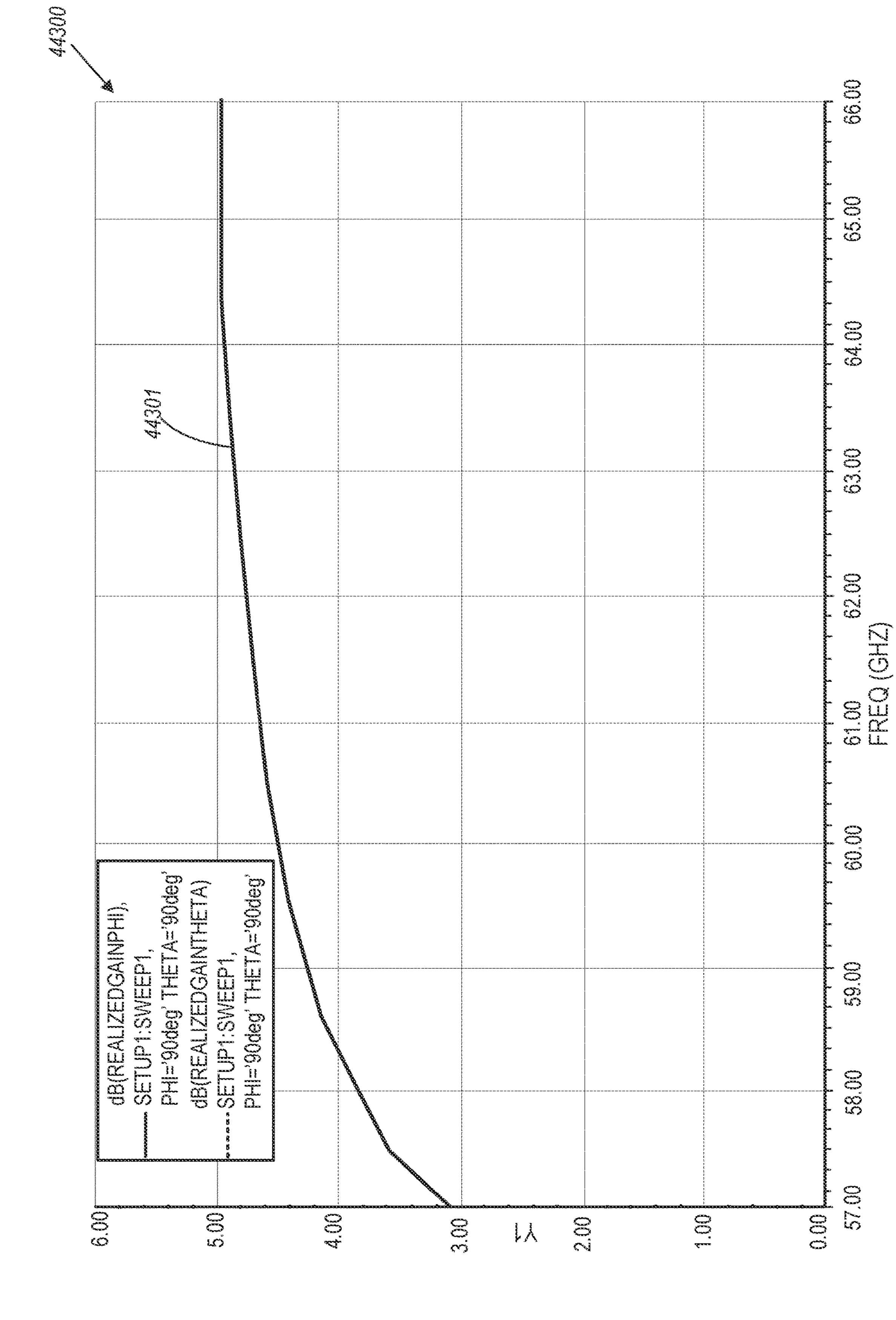

FIG. 443 illustrates the realized vertical polarity (θ), according to some aspects of the present disclosure.

Figure 444:
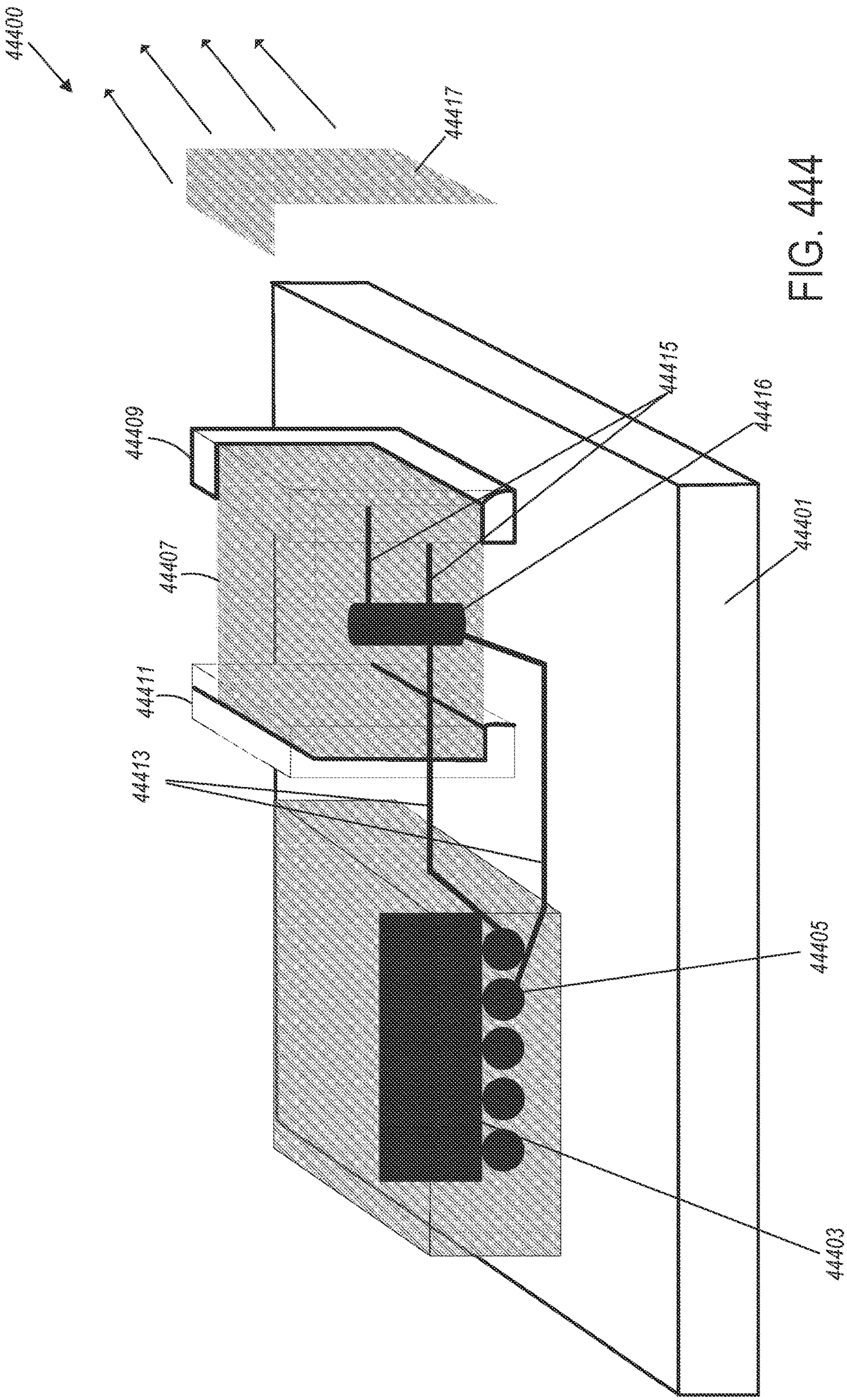

FIG. 444 illustrates a single patch, dual feed, dual polarization vertical SMD patch antenna, according to some aspects of the present disclosure.

Figure 445:
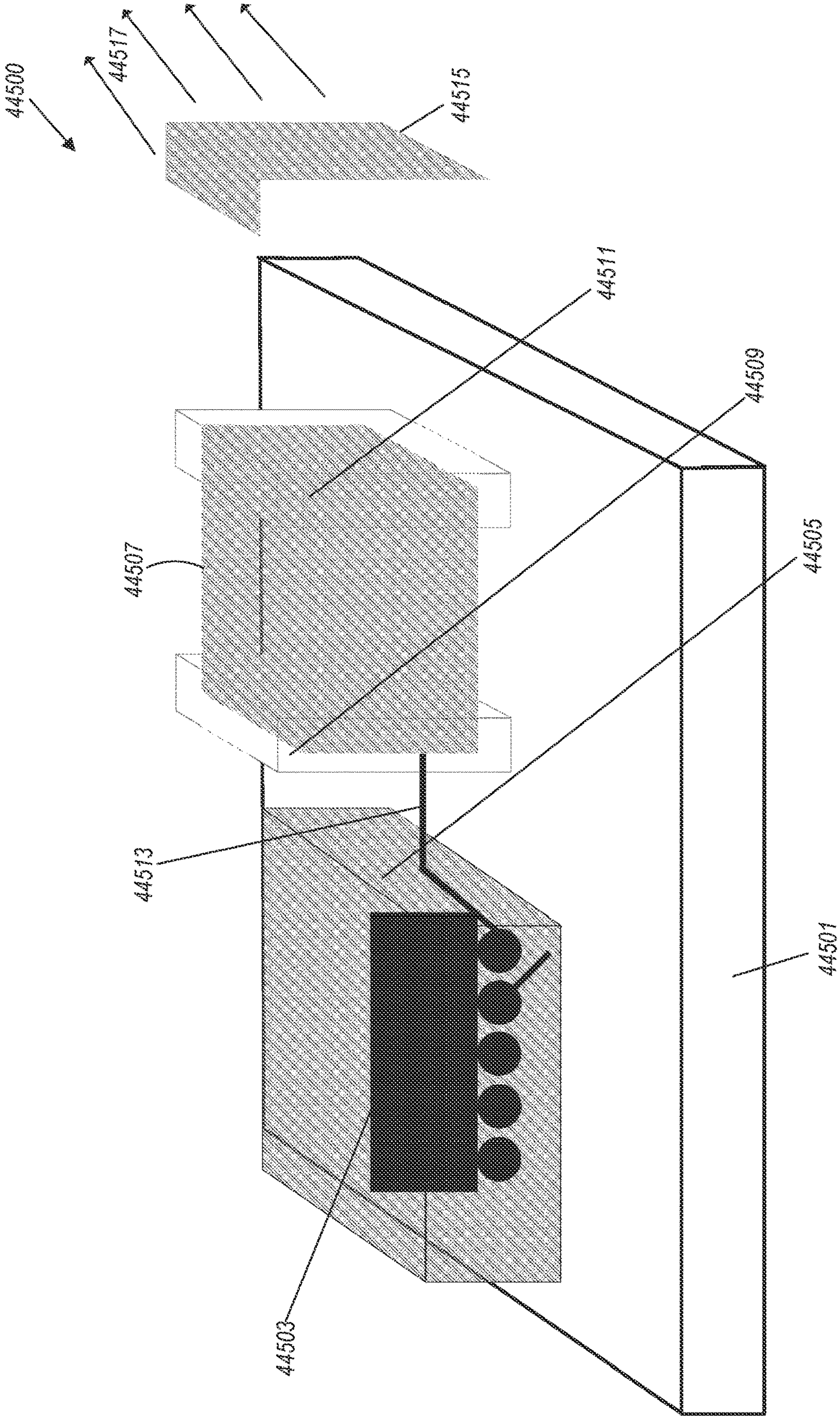

FIG. 445 illustrates a stacked patch, single feed, single polarization vertical SMD patch antenna, according to some aspects of the present disclosure.

Figure 446:
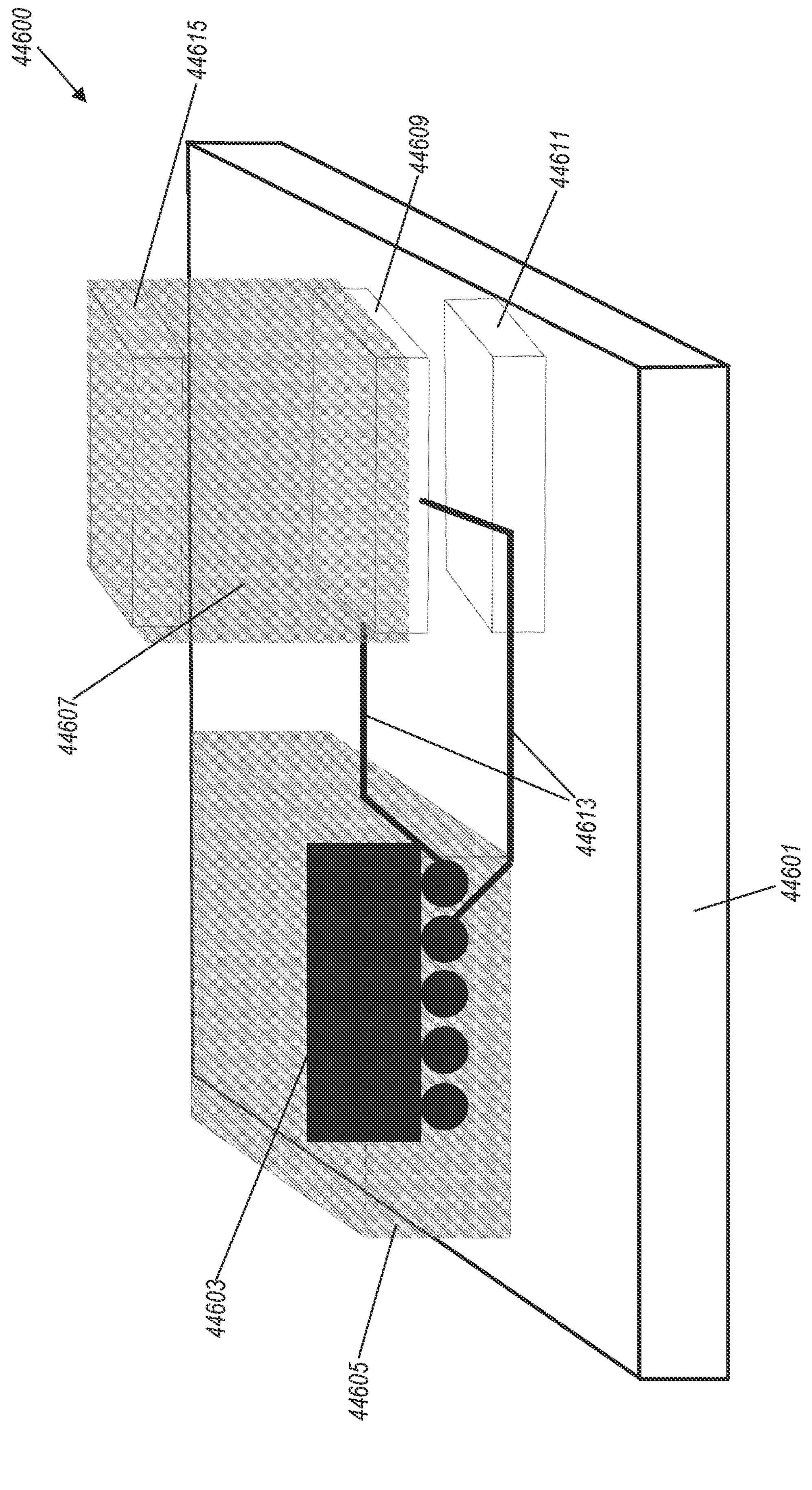

FIG. 446 illustrates a horizontal SMD patch antenna, according to some aspects of the present disclosure.

Figure 447:
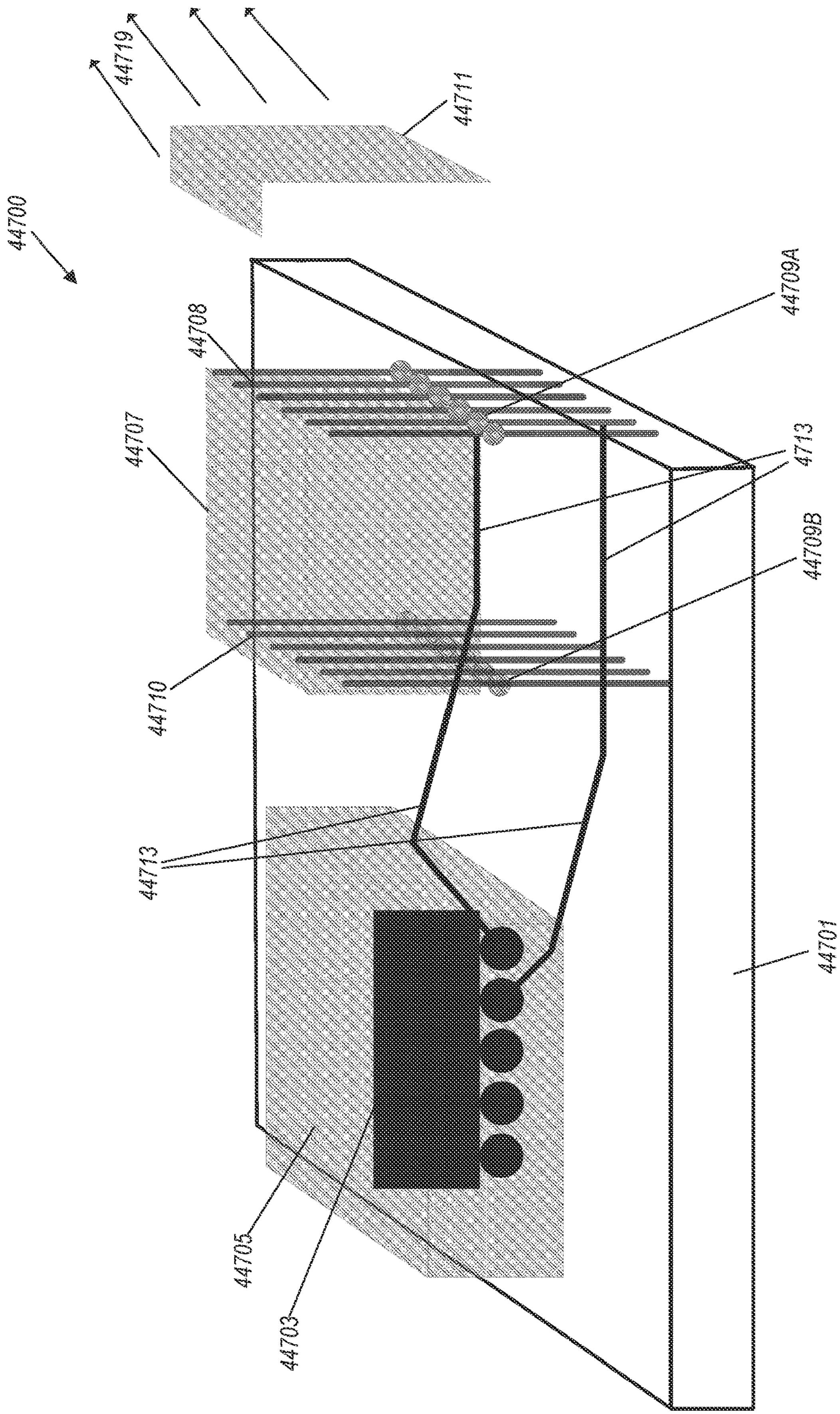

FIG. 447 illustrates a vertical SMD patch antenna using a cross-hatch pattern, according to some aspects of the present disclosure.

Figure 448:
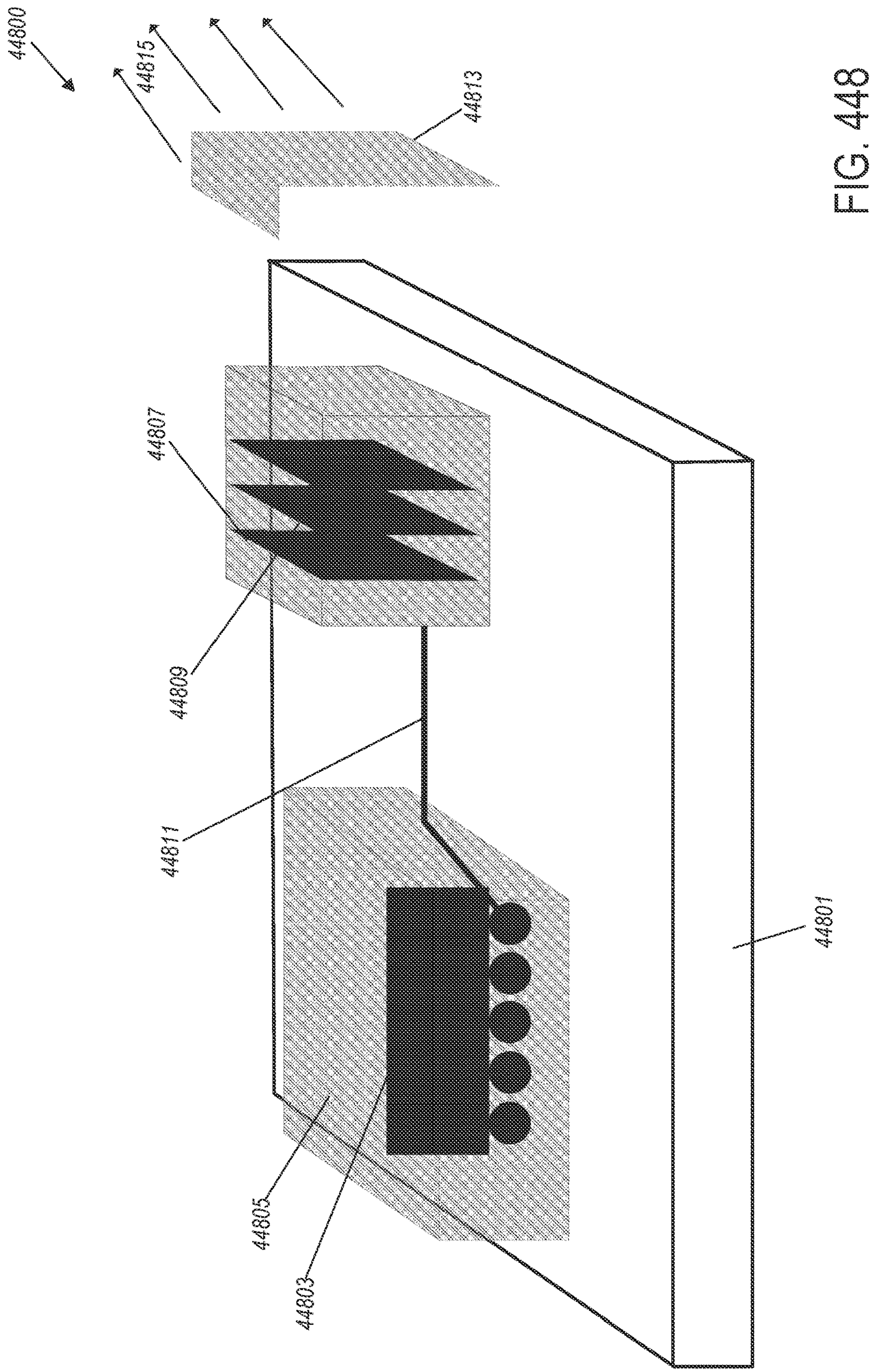

FIG. 448 illustrates an SMD spiral antenna with circular polarization, according to some aspects of the present disclosure.

Figure 449:
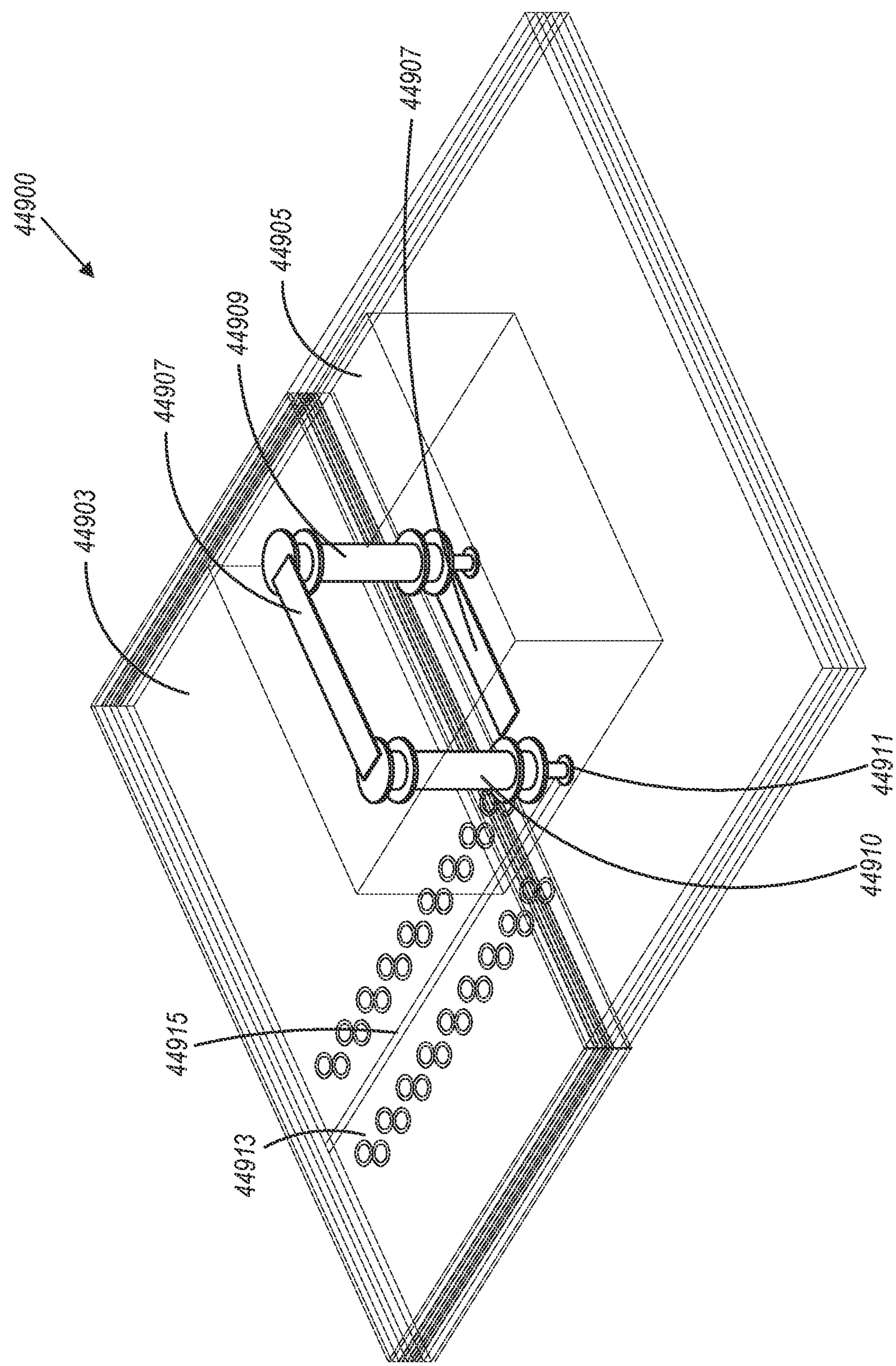

FIG. 449 illustrates the implementation of a spiral antenna within an SMD, according to some aspects of the present disclosure.

Figure 450:
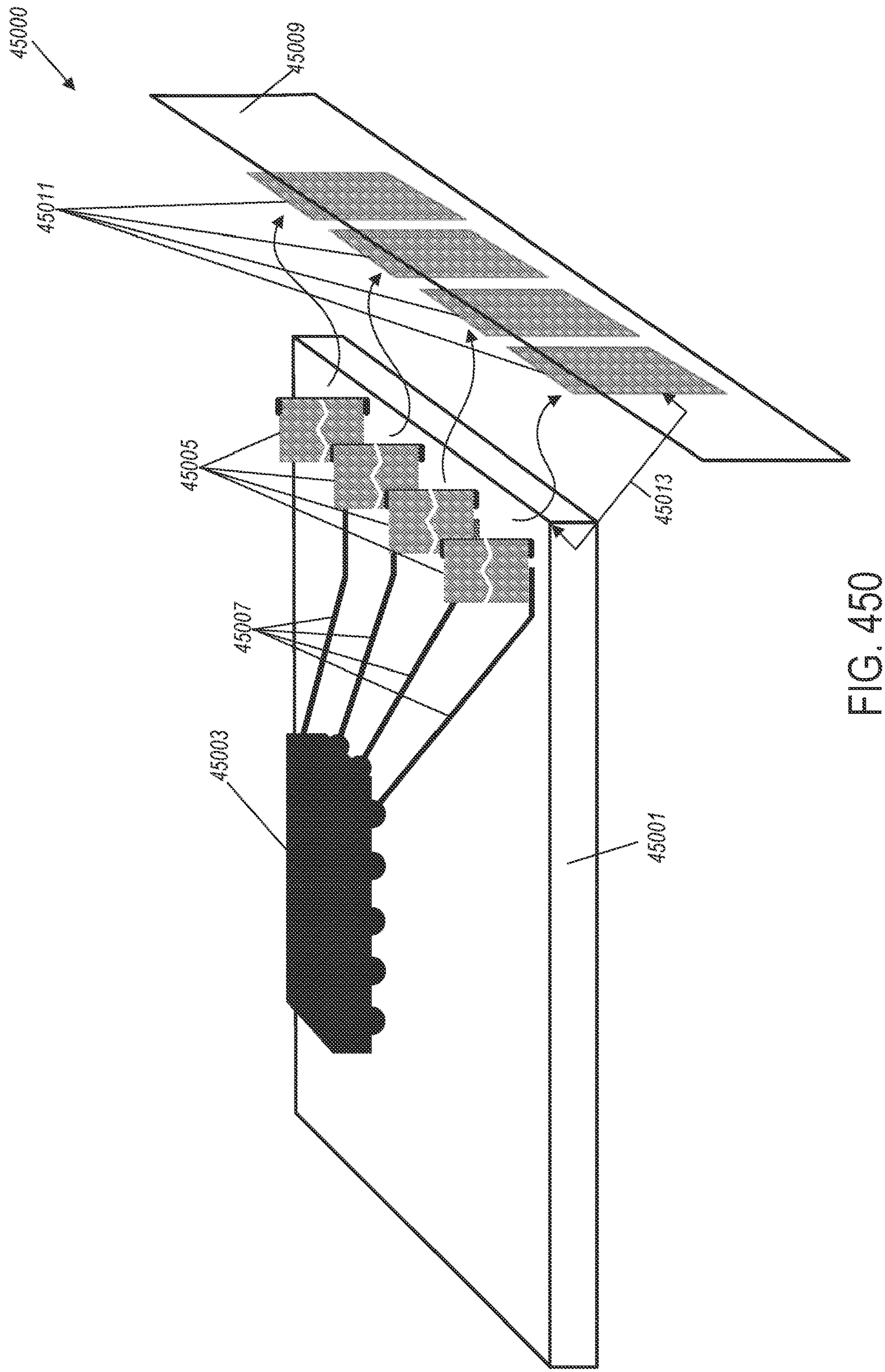

FIG. 450 illustrates coupling radiation to directors on a chassis, according to some aspects of the present disclosure.

Figure 451A:
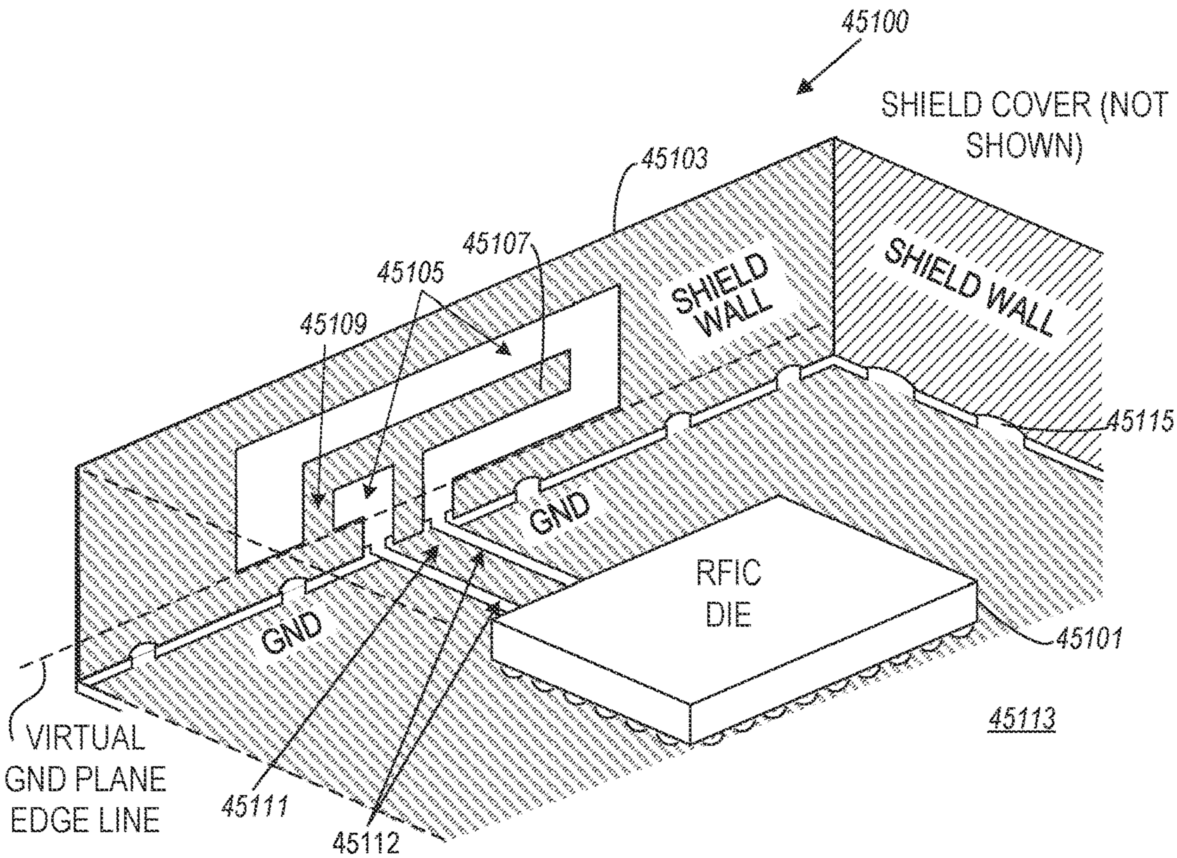

FIG. 451A is a perspective view of an IC shield wall cut-out that forms an antenna, according to some aspects of the present disclosure.

Figure 451B:
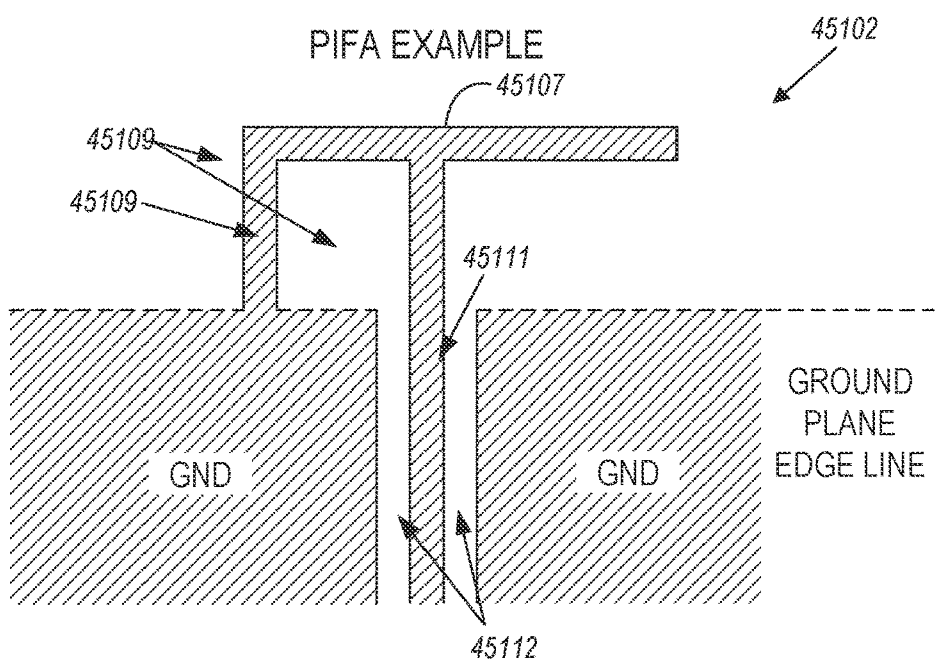

FIG. 451B is a side view of the wall cut-out that comprises the antenna illustrated in FIG. 451A, according to some aspects of the present disclosure.

Figure 451C:
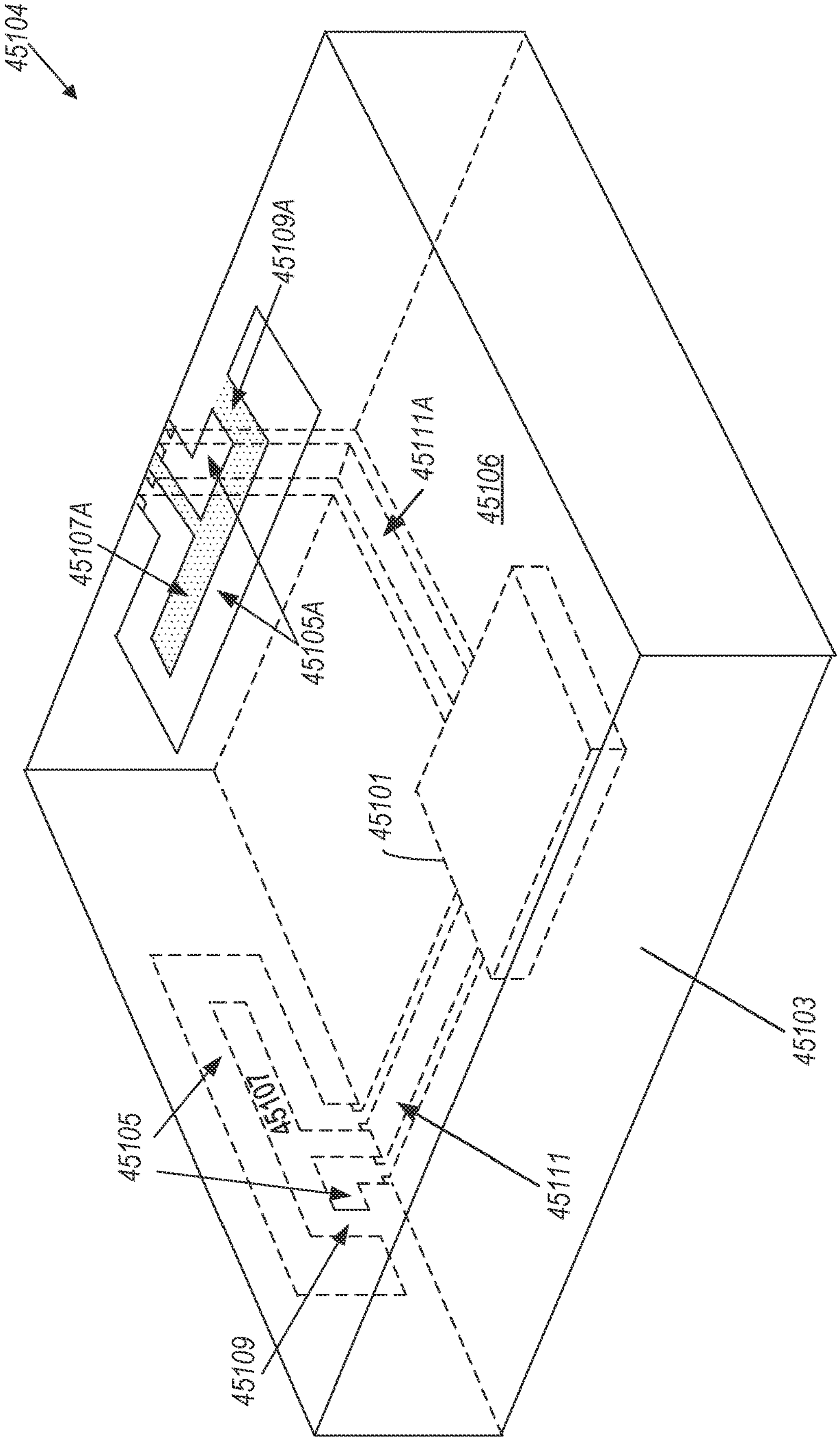

FIG. 451C is a perspective view of an IC shield with a wall cut-out and a top cut-out that comprise antenna elements of an antenna array, according to some aspects of the present disclosure.

Figure 451D:
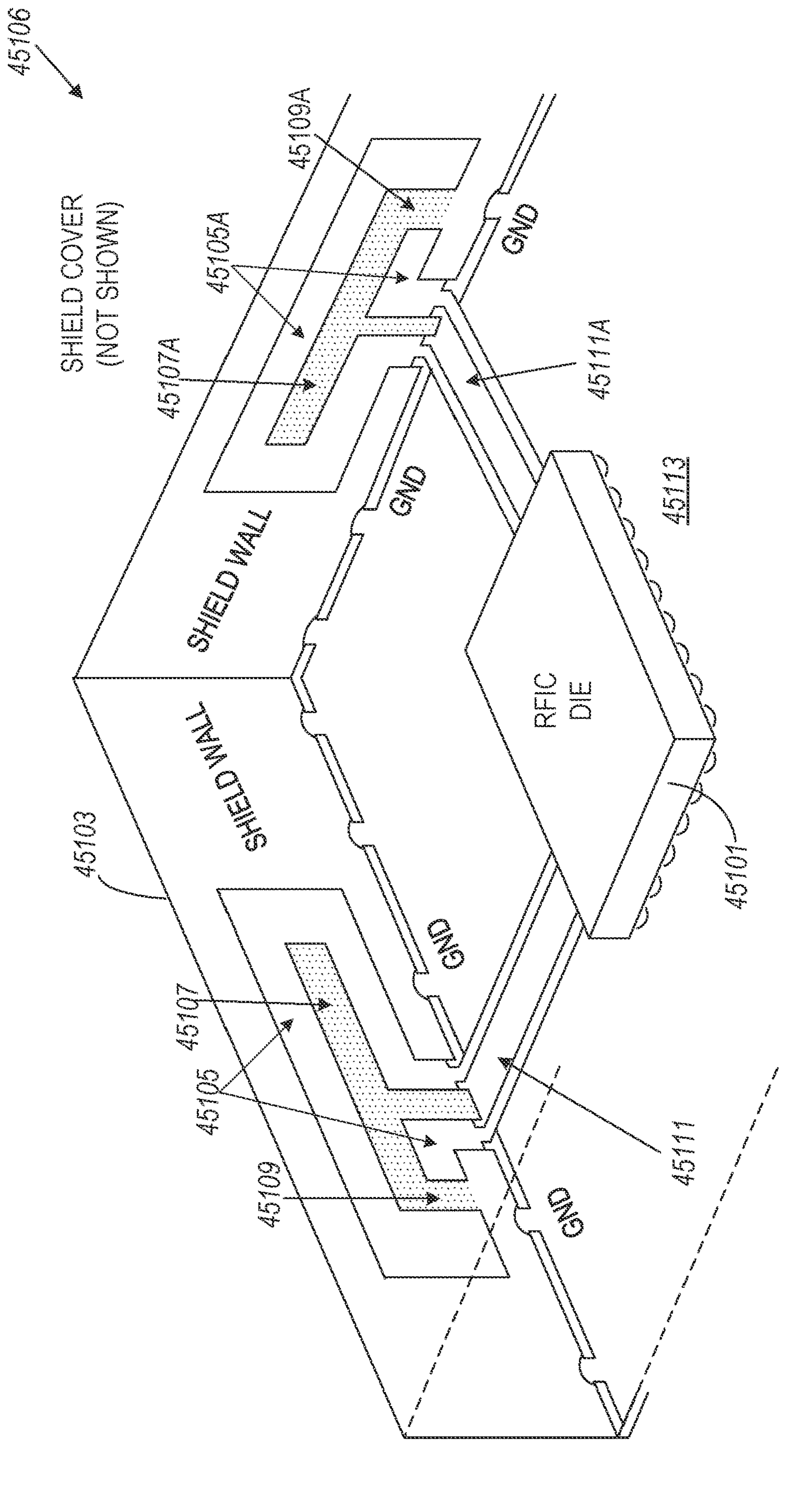

FIG. 451D is a perspective view of an IC shield with a first wall cut-out and a second wall cut-out that comprise antenna elements of an antenna array, according to some aspects of the present disclosure.

Figure 452A:
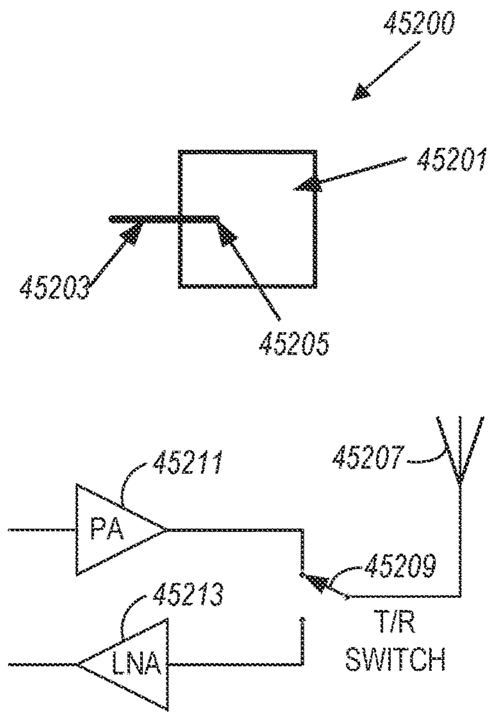

FIG. 452A illustrates a patch antenna and RF feed line connection including a transmit/receive (TR) switch for a single polarization design, according to some aspects of the present disclosure.

Figure 452B:
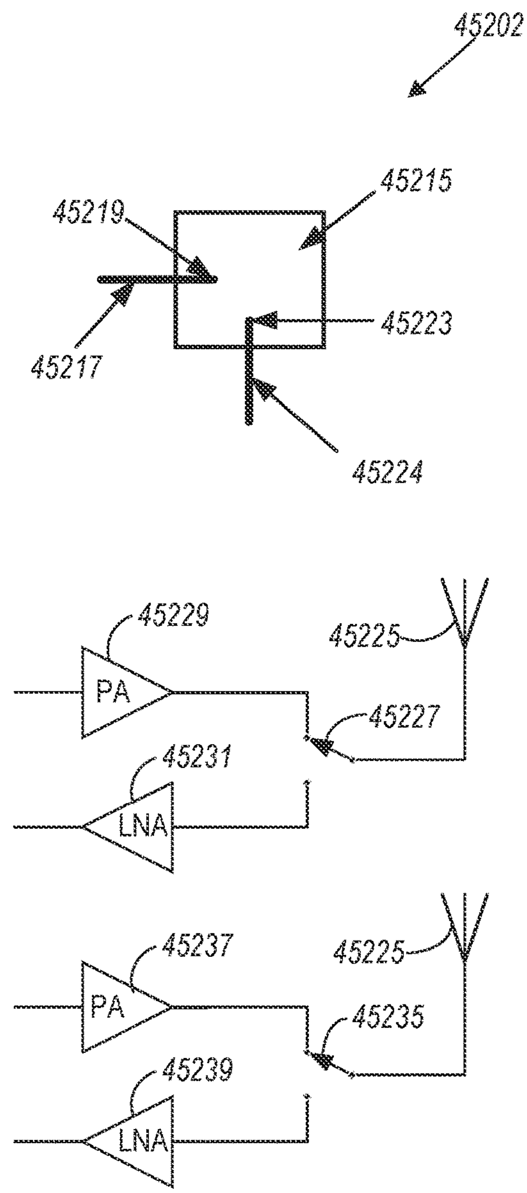

FIG. 452B illustrates a patch antenna and RF feed line connection including a TR switch for a dual polarization design, according to some aspects of the present disclosure.

Figure 452C:
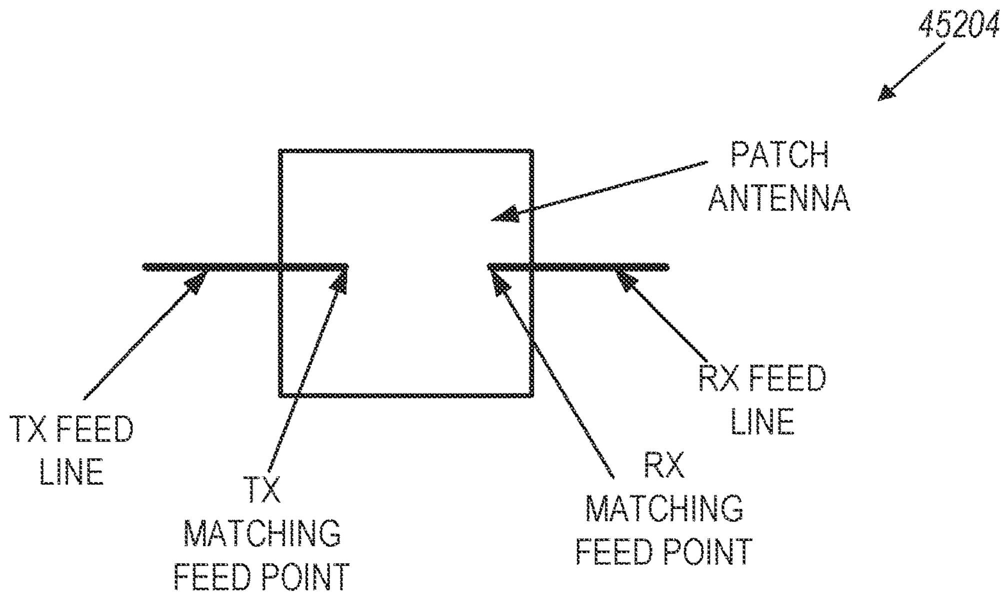

FIG. 452C illustrates a patch antenna in a single polarization design, with the antenna feed line for the RX feed line matching point slightly offset to one side as compared to the TX feed line matching point, according to some aspects of the present disclosure.

Figure 452D:
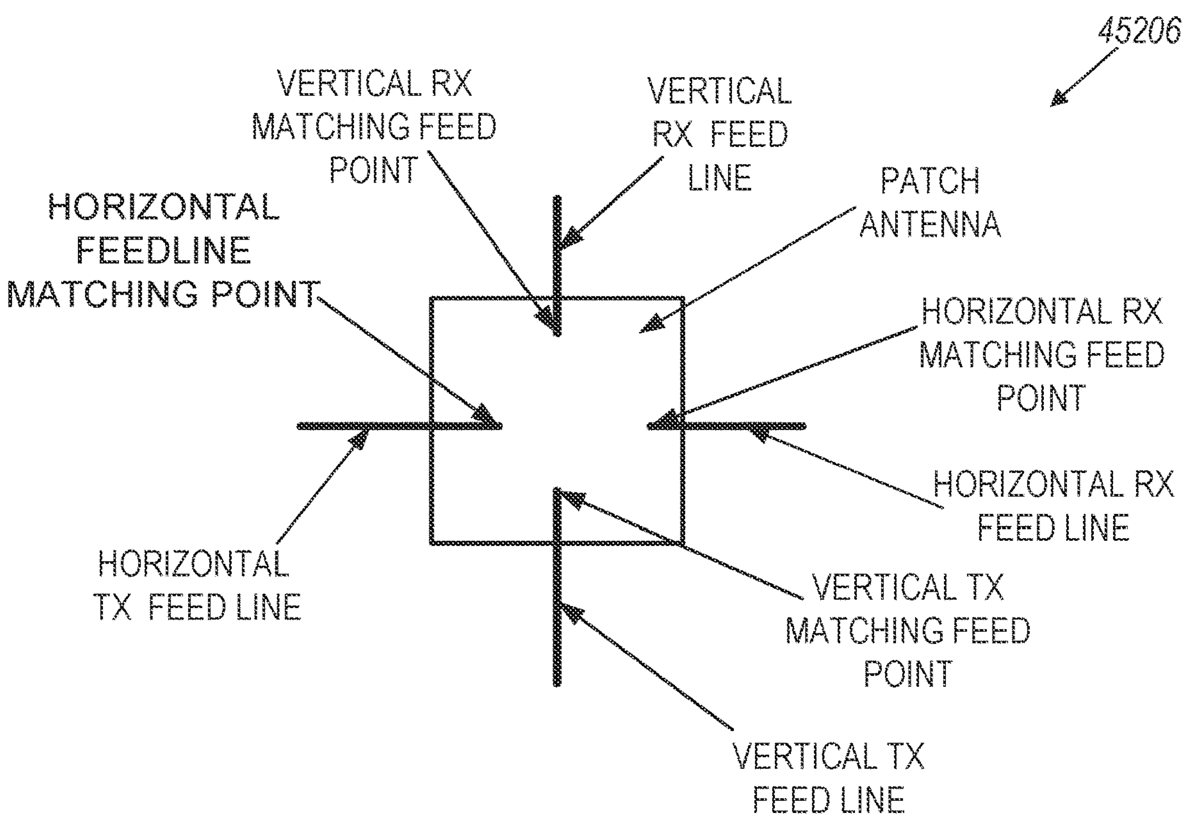

FIG. 452D illustrates a patch antenna in a dual polarization design, with the antenna feed lines for the RX feed line matching point slightly offset to one side as compared to the TX feed line matching point, for both polarizations, according to some aspects of the present disclosure.

Figure 453A:
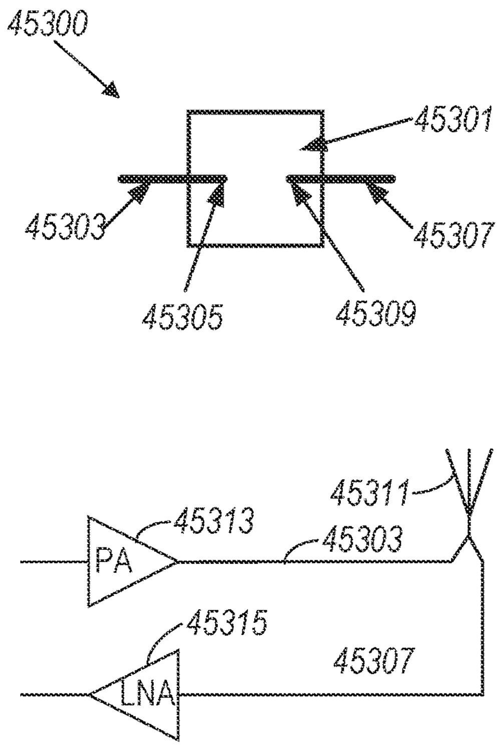

FIG. 453A illustrates a single polarization implementation of a TX feed line and an RX feed line connected directly to antenna feed line matching points, according to some aspects of the present disclosure.

Figure 453B:
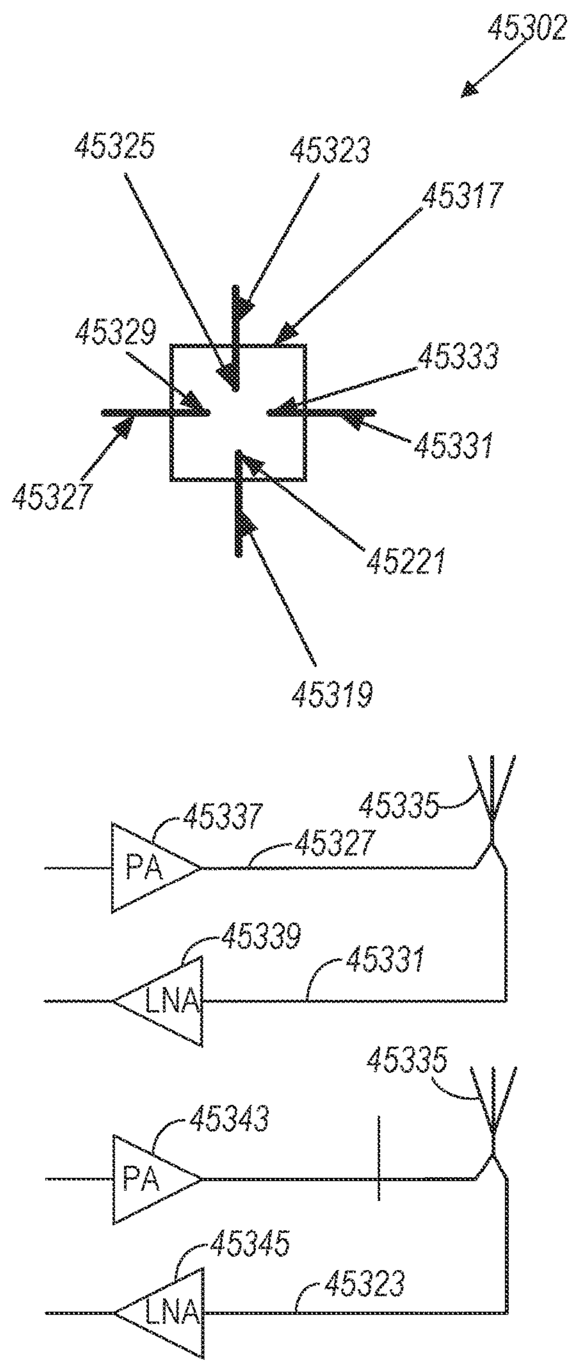

FIG. 453B illustrates a dual polarization implementation of a horizontal polarization TX feed line and RX feed line, and a vertical polarization TX feed line and RX feed line, connected directly to antenna feed line matching points, according to some aspects of the present disclosure.

Figure 454A:
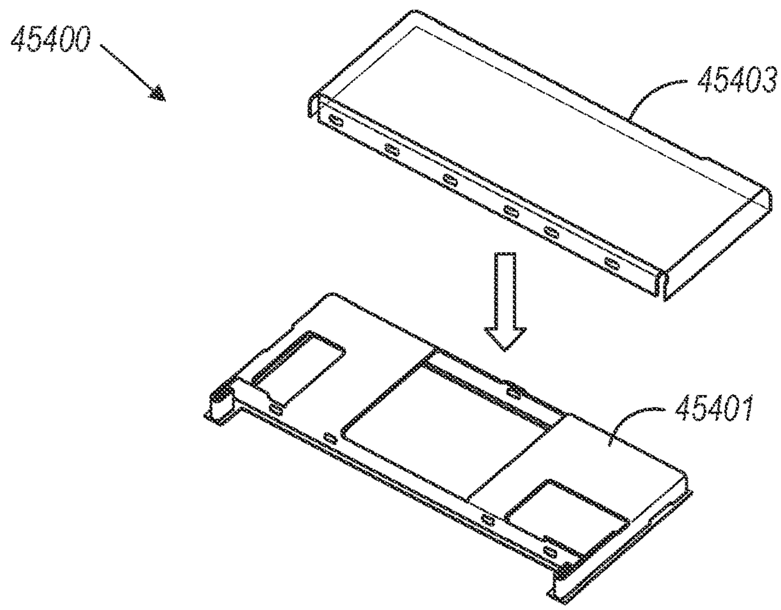

FIG. 454A illustrates an IC shield, according to some aspects of the present disclosure.

Figure 454B:
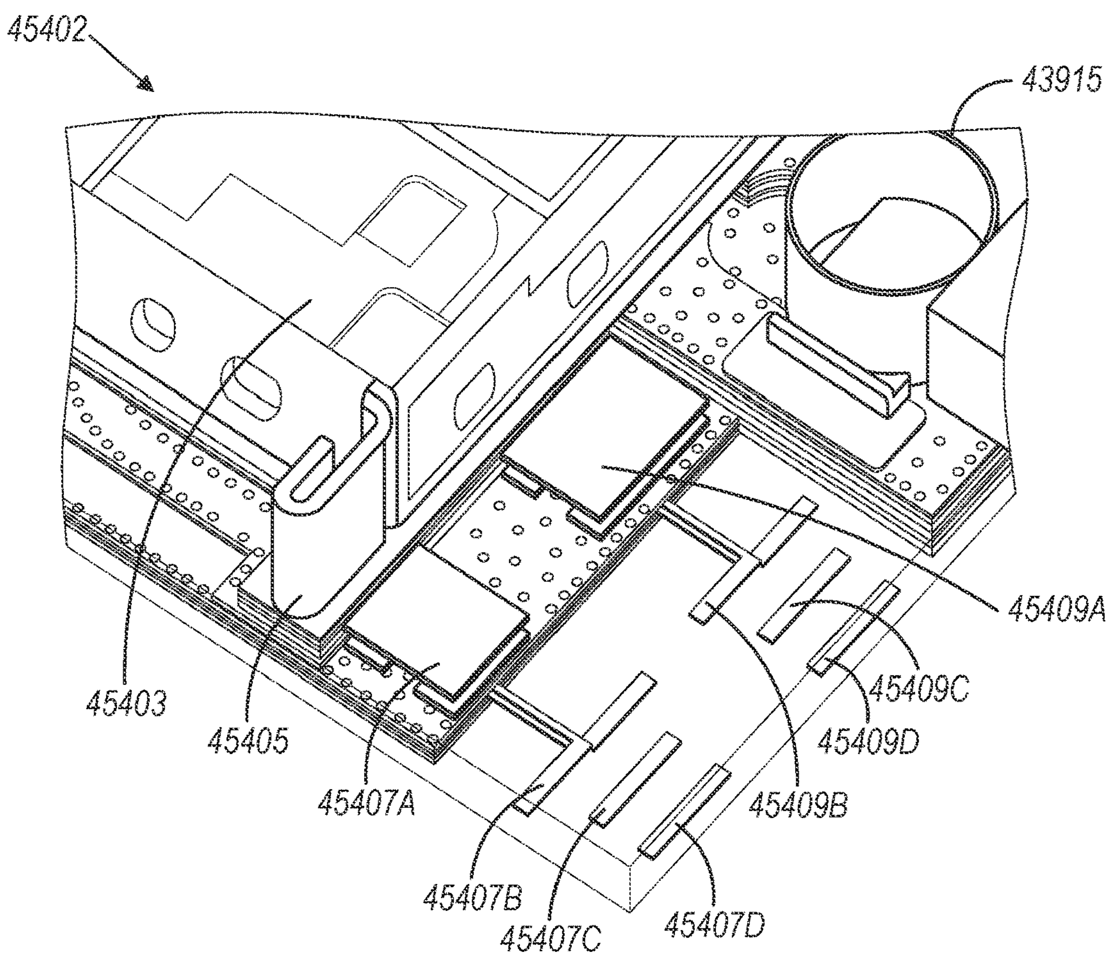

FIG. 454B illustrates an IC shield with a bulge, or extension, to enhance antenna gain and directivity, according to some aspects of the present disclosure.

Figure 454C:
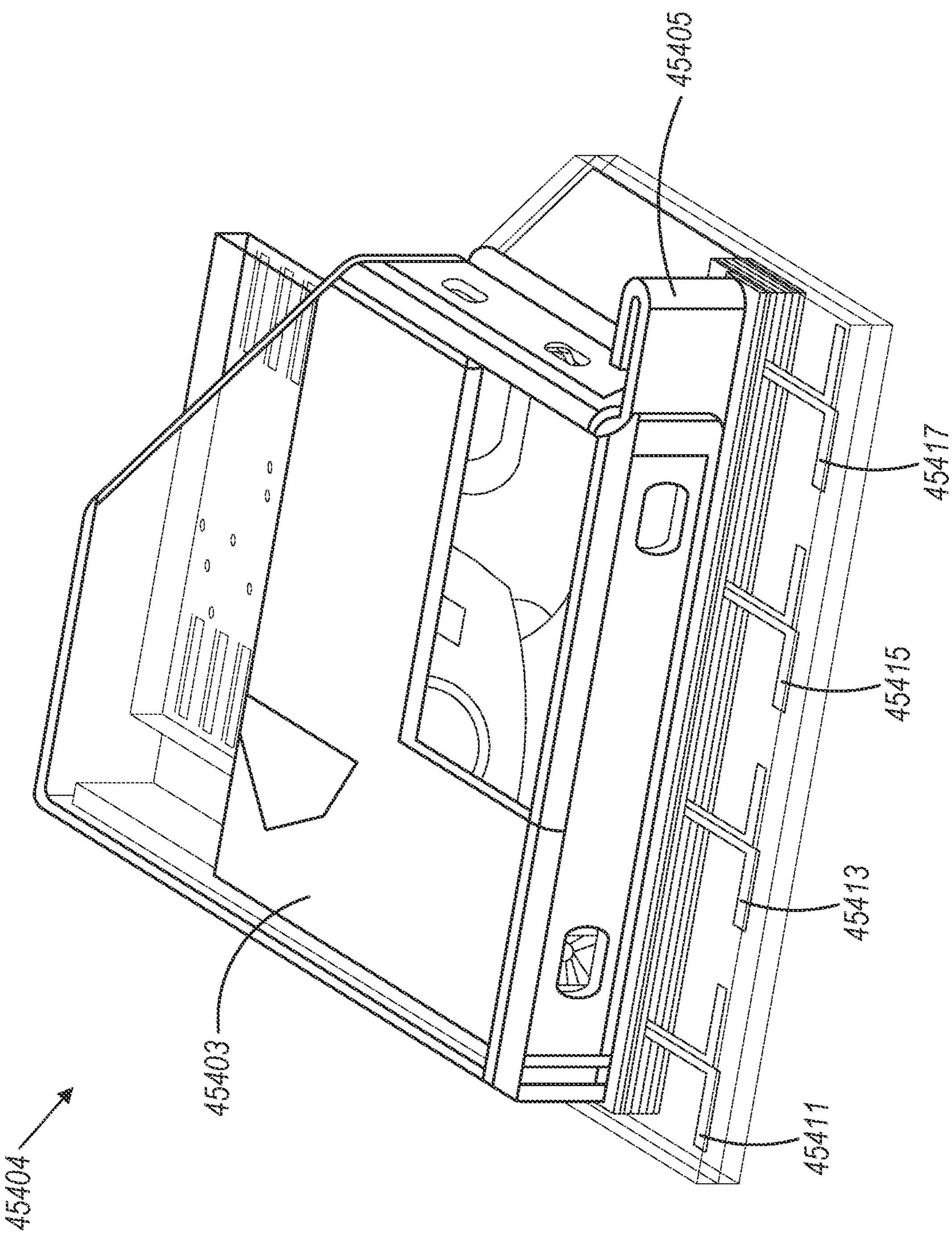

FIG. 454C illustrates the use of a folded extension with an IC shield to improve the gain of an array of dipole antenna elements, according to some aspects of the present disclosure.

Figure 454D:
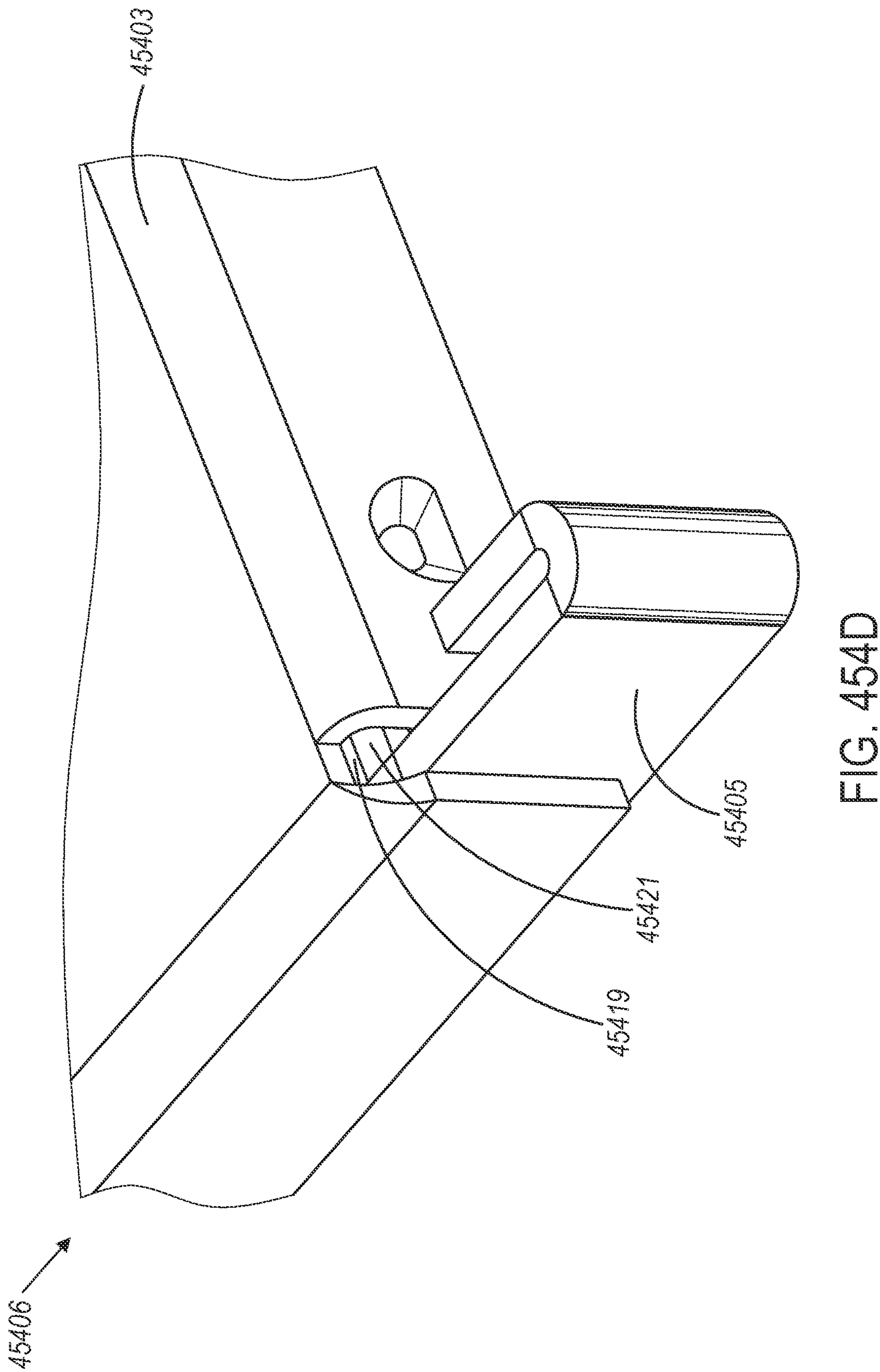

FIG. 454D illustrates a hole that occurs in the shield structure because of the bulge, according to some aspects of the present disclosure.

Figure 454E:
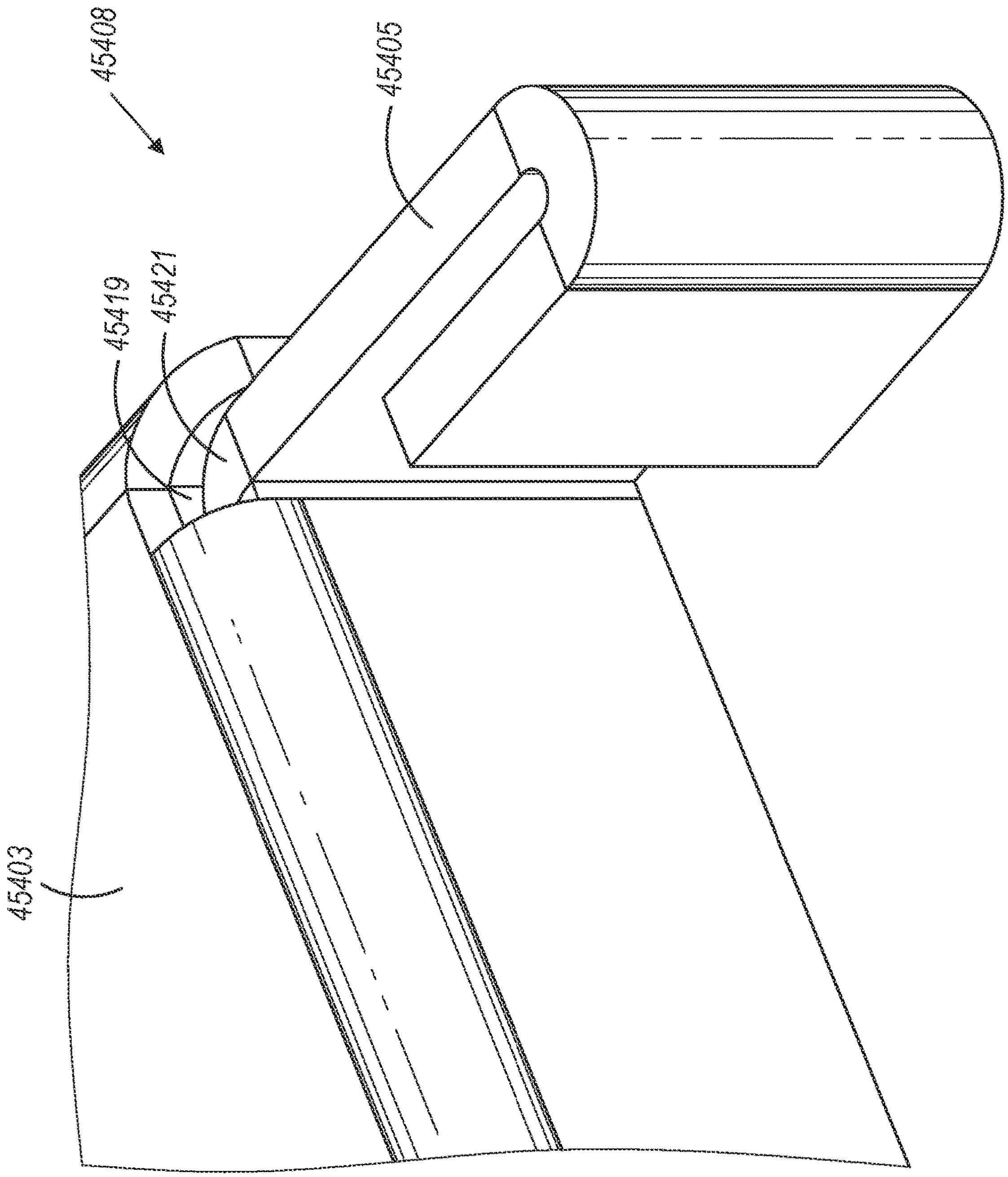

FIG. 454E is a close-up perspective view of the bulge and the hole of FIG. 54D, according to some aspects of the present disclosure.

Figure 455:
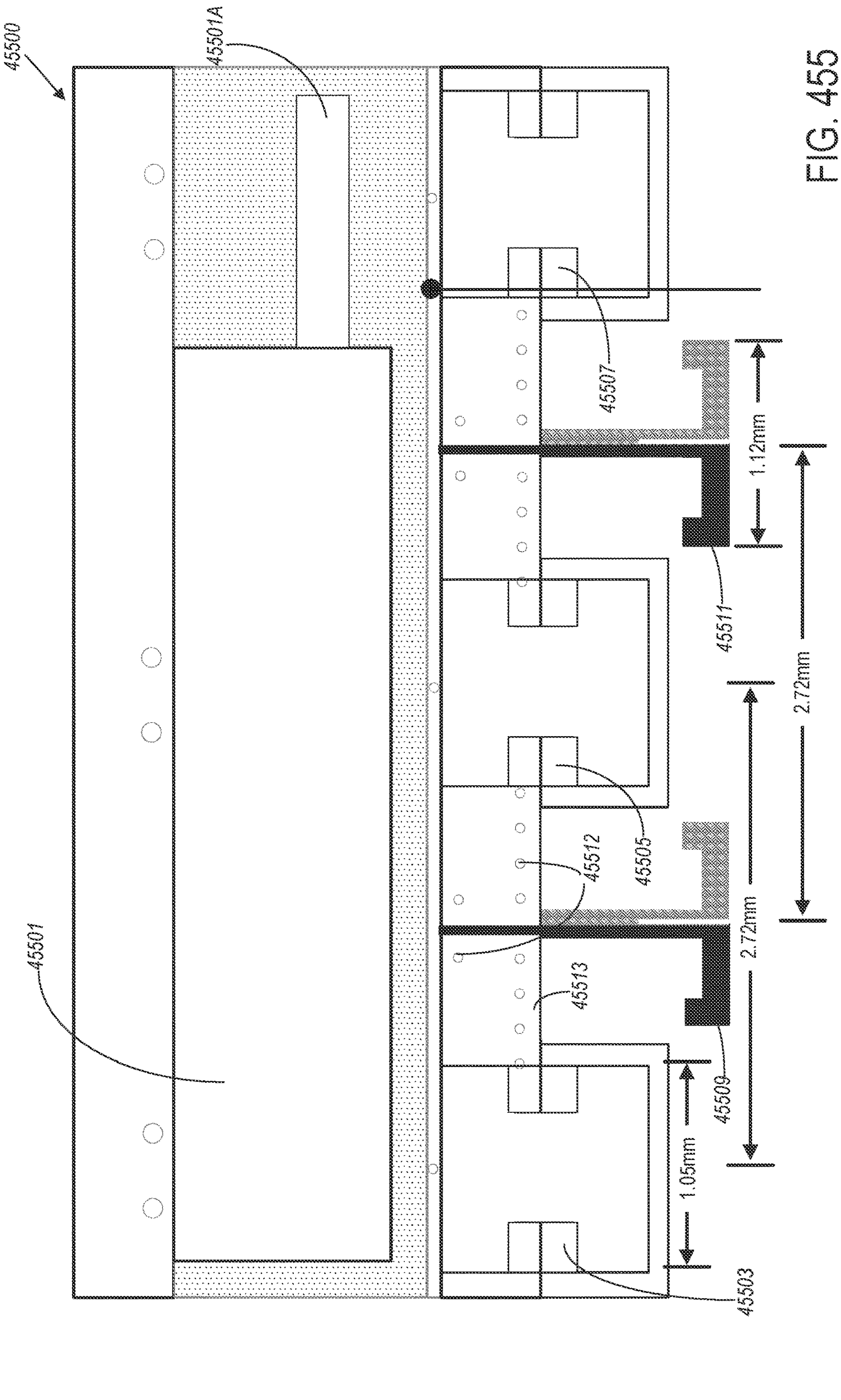

FIG. 455 is top view of a combined patch antenna and dipole antenna array with a shield reflector, according to some aspects of the present disclosure.

Figure 456:
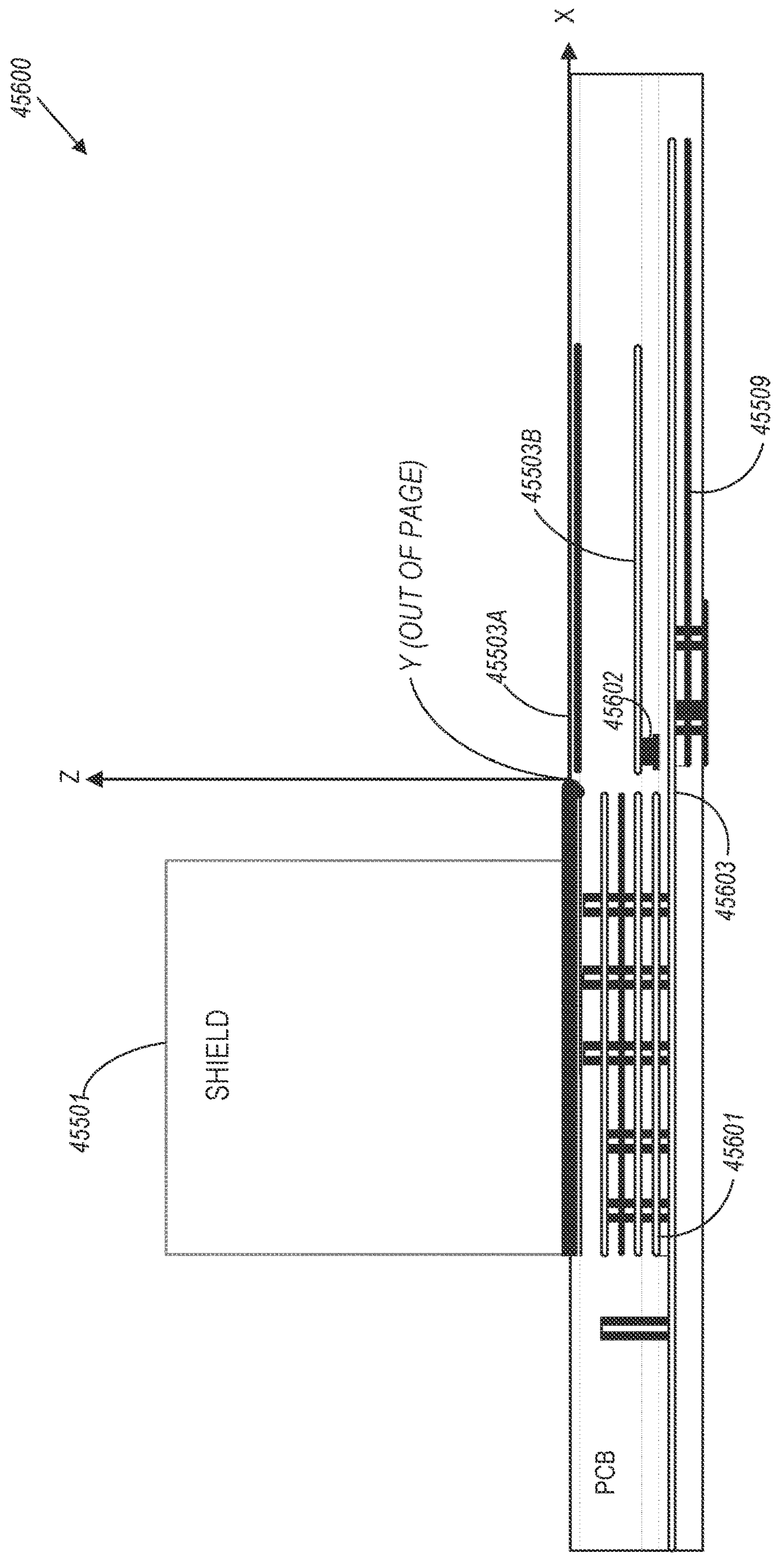

FIG. 456 is a side view of the antenna array of FIG. 455, according to some aspects of the present disclosure.

Figure 457:
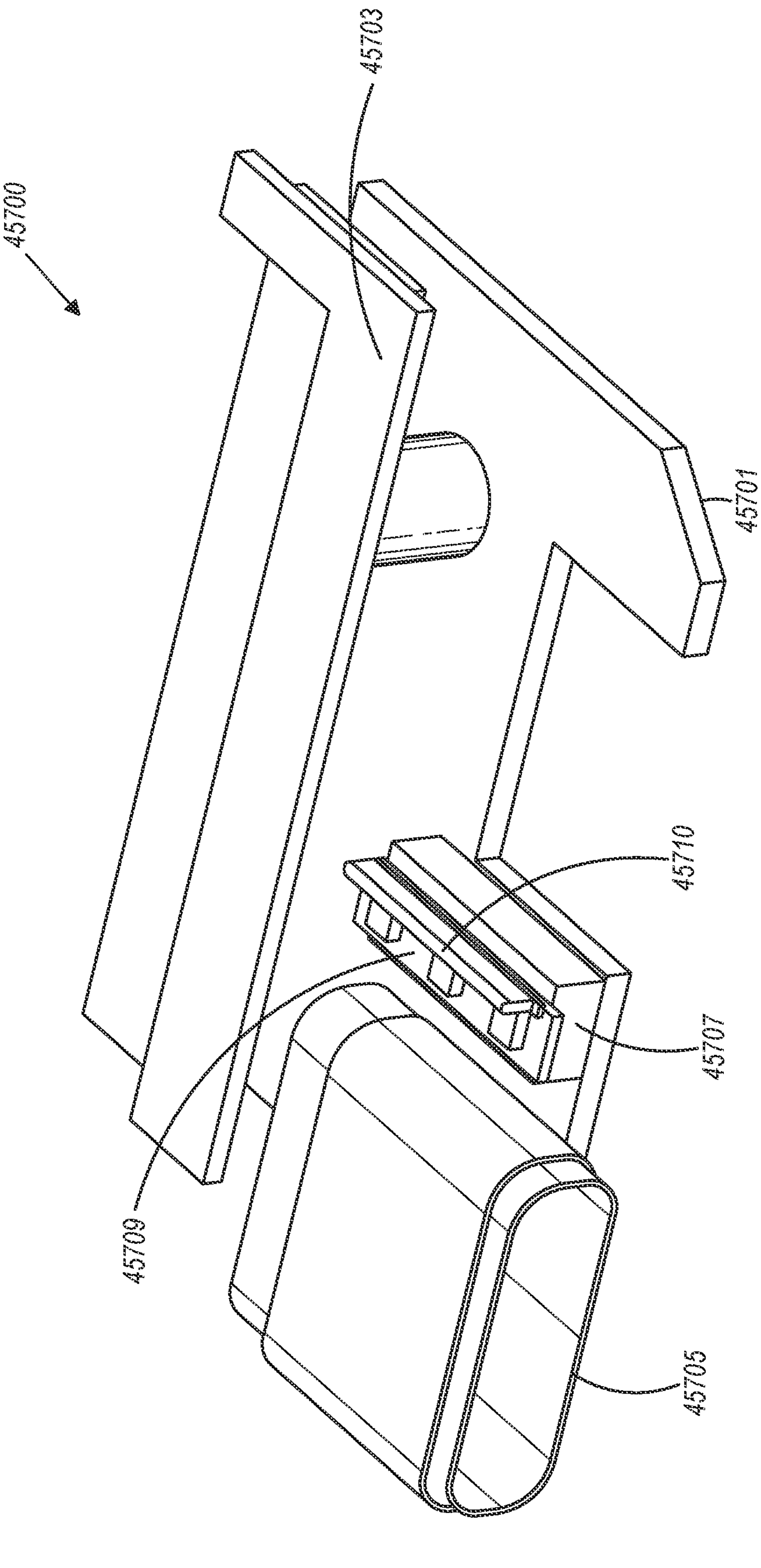

FIG. 457 is a perspective view of an interposer used with a patch array to bypass large obstacles in a user device, according to some aspects of the present disclosure.

Figure 458A:
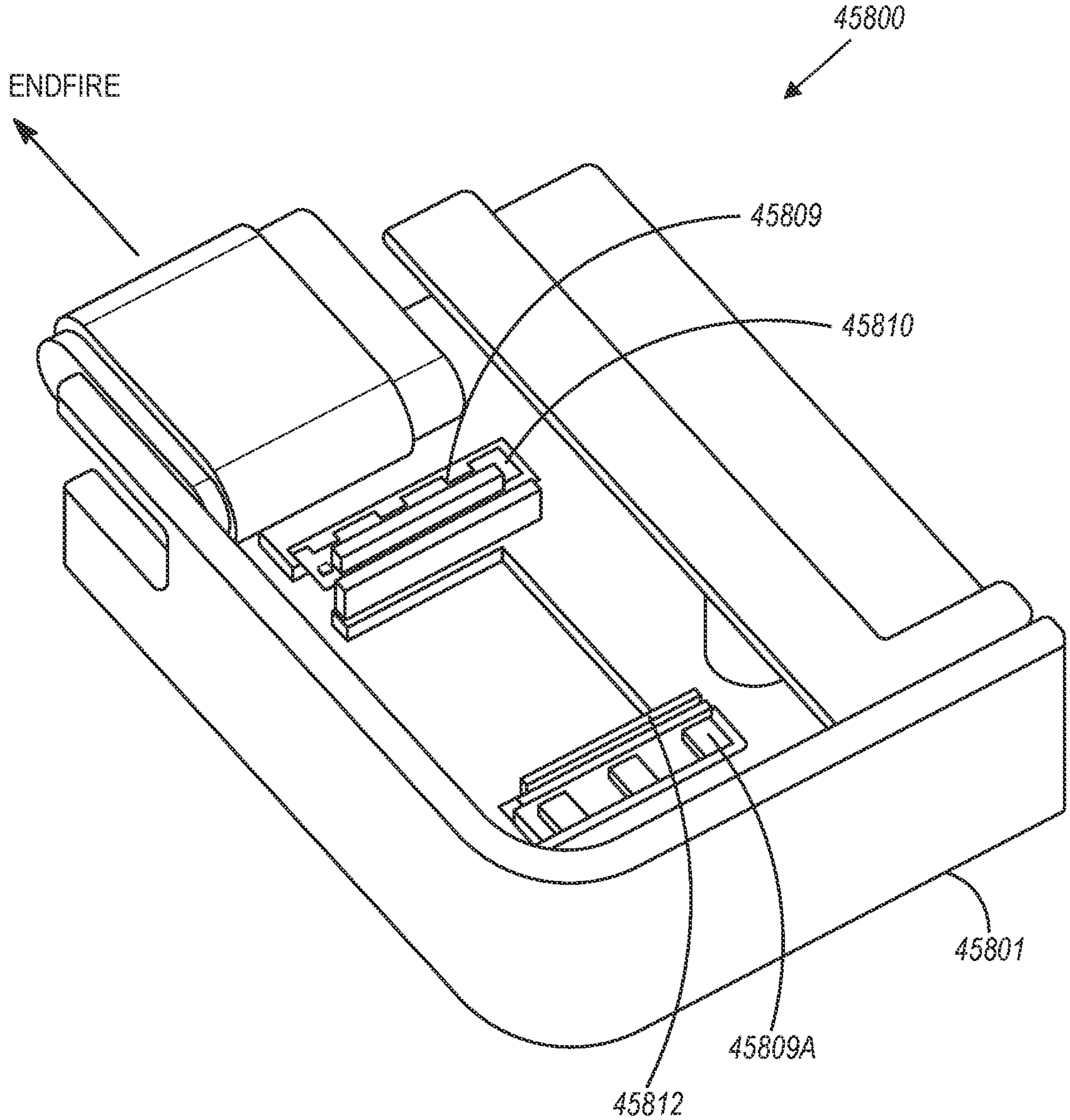

FIG. 458A is a perspective view of the interposer of FIG. 457 illustrating an IC shield lid, according to some aspects of the present disclosure.

Figure 458B:
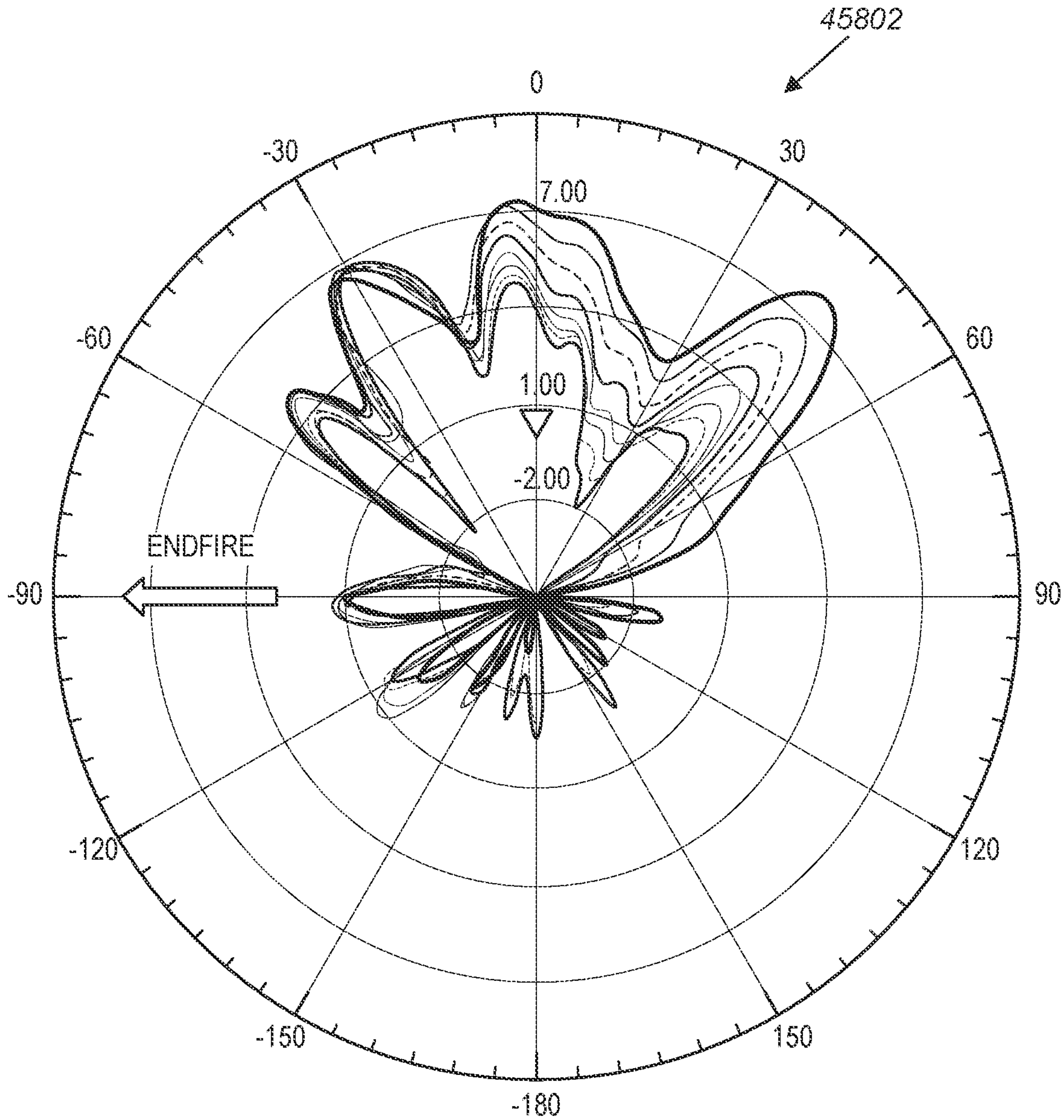

FIG. 458B is a vertical view of the radiation pattern for the dipole antenna array of FIG. 458A, with the endfire direction illustrated at minus ninety (−90) degrees, according to some aspects of the present disclosure.

Figure 459:
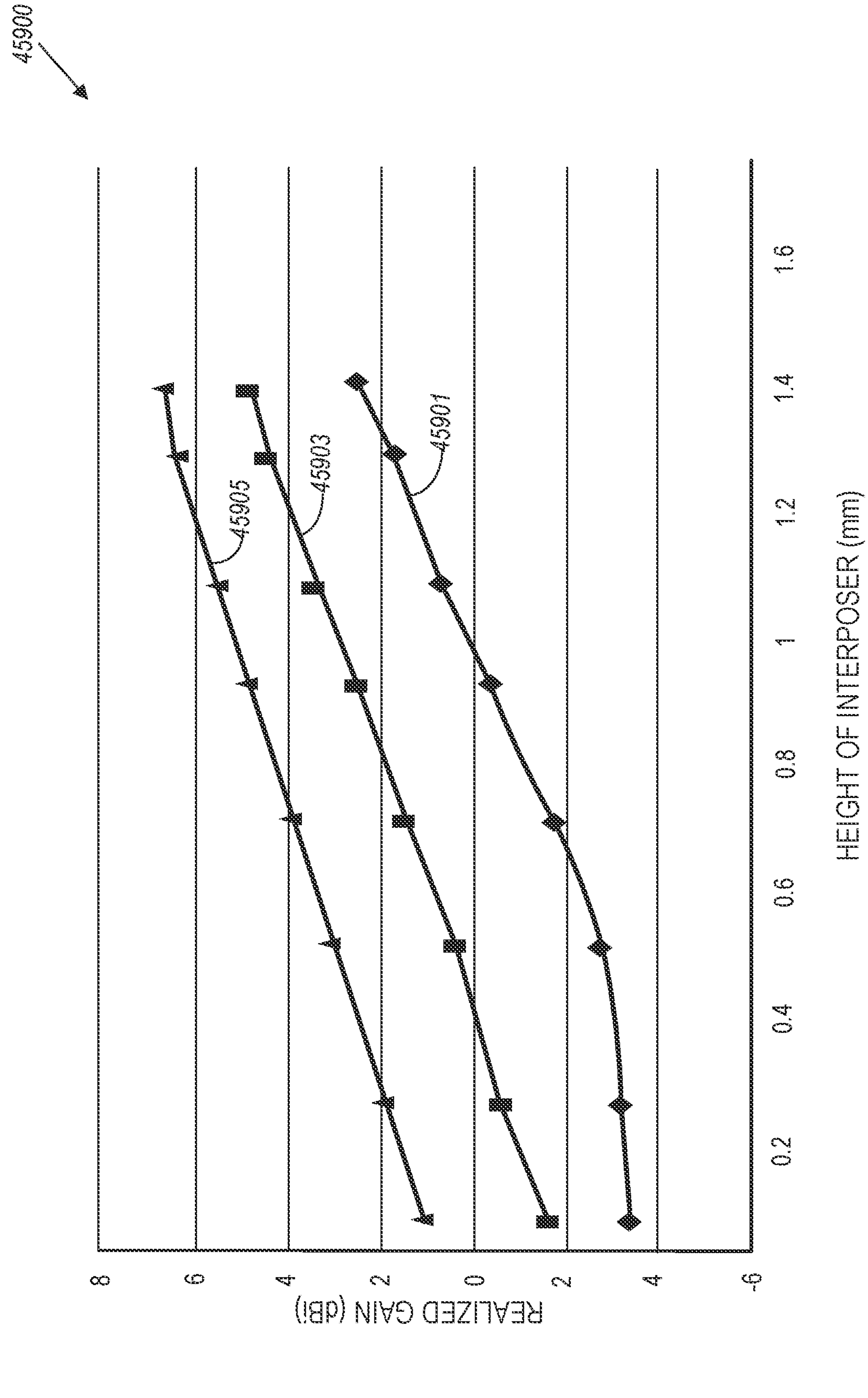

FIG. 459 illustrates realized gain of the patch antenna array of FIGS. 457 and 458A as a function of the height of the interposer, in various directions, according to some aspects of the present disclosure.

Figure 460A:
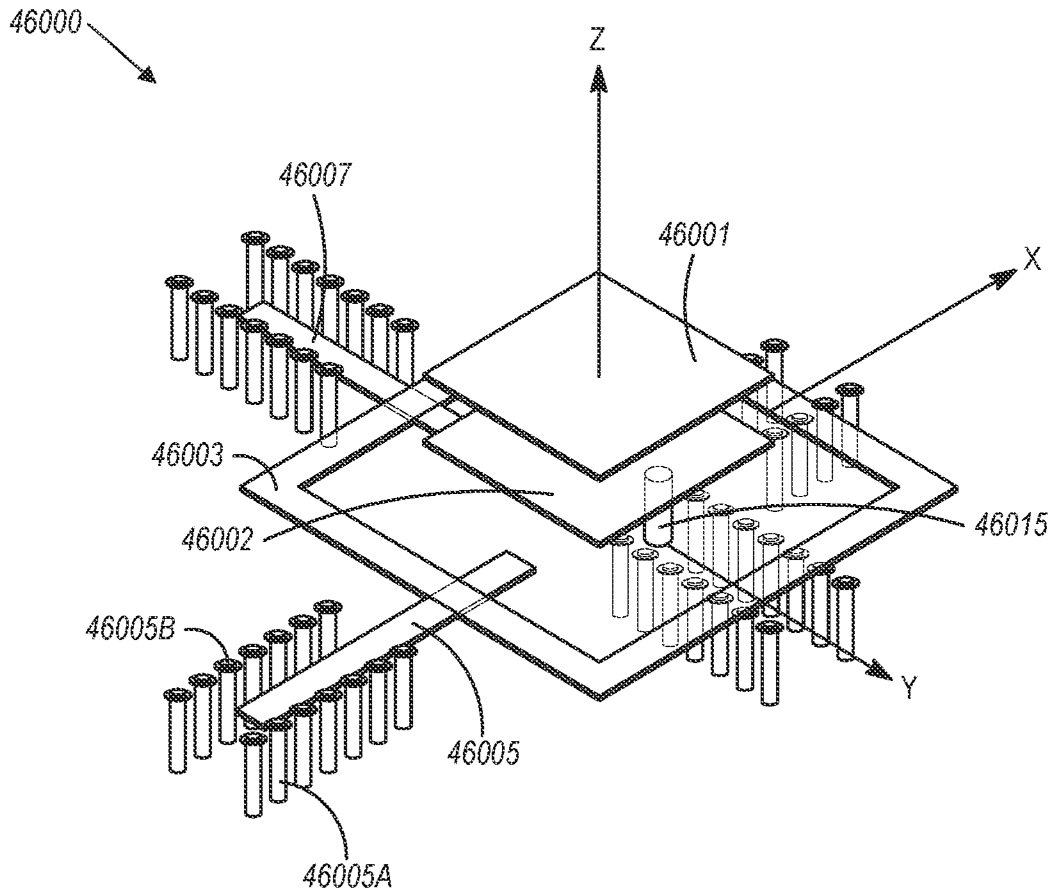

FIG. 460A is a perspective view of a combined patch and slot antenna for dual band, dual polarization operation, according to some aspects of the present disclosure.

Figure 460B:
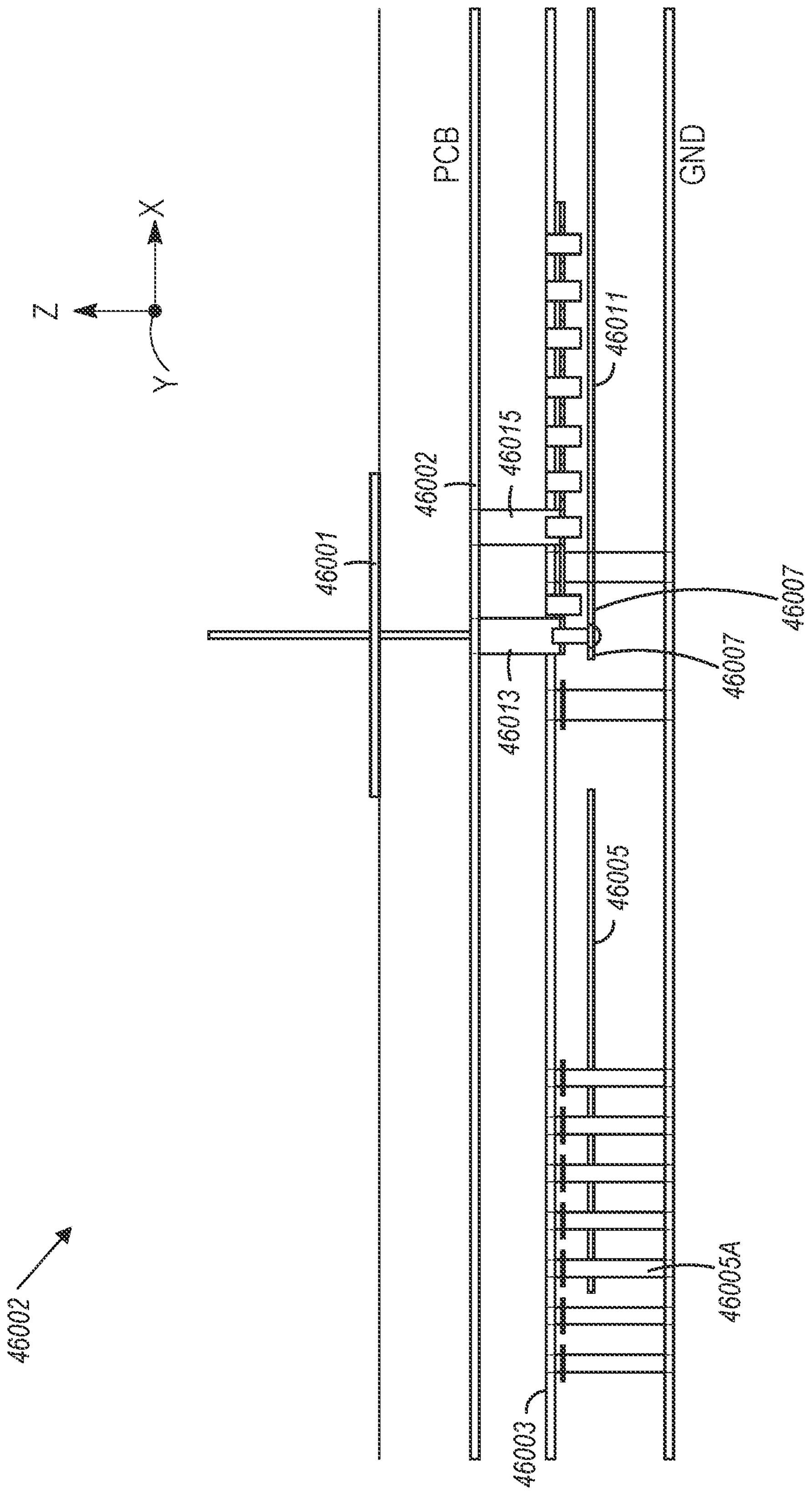

FIG. 460B is a side view of the combined patch and slot antenna of FIG. 460A, according to some aspects of the present disclosure.

Figure 461B:
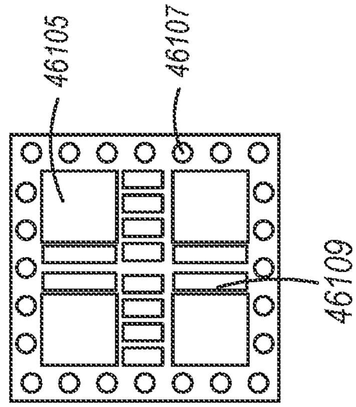
Figure 461A:
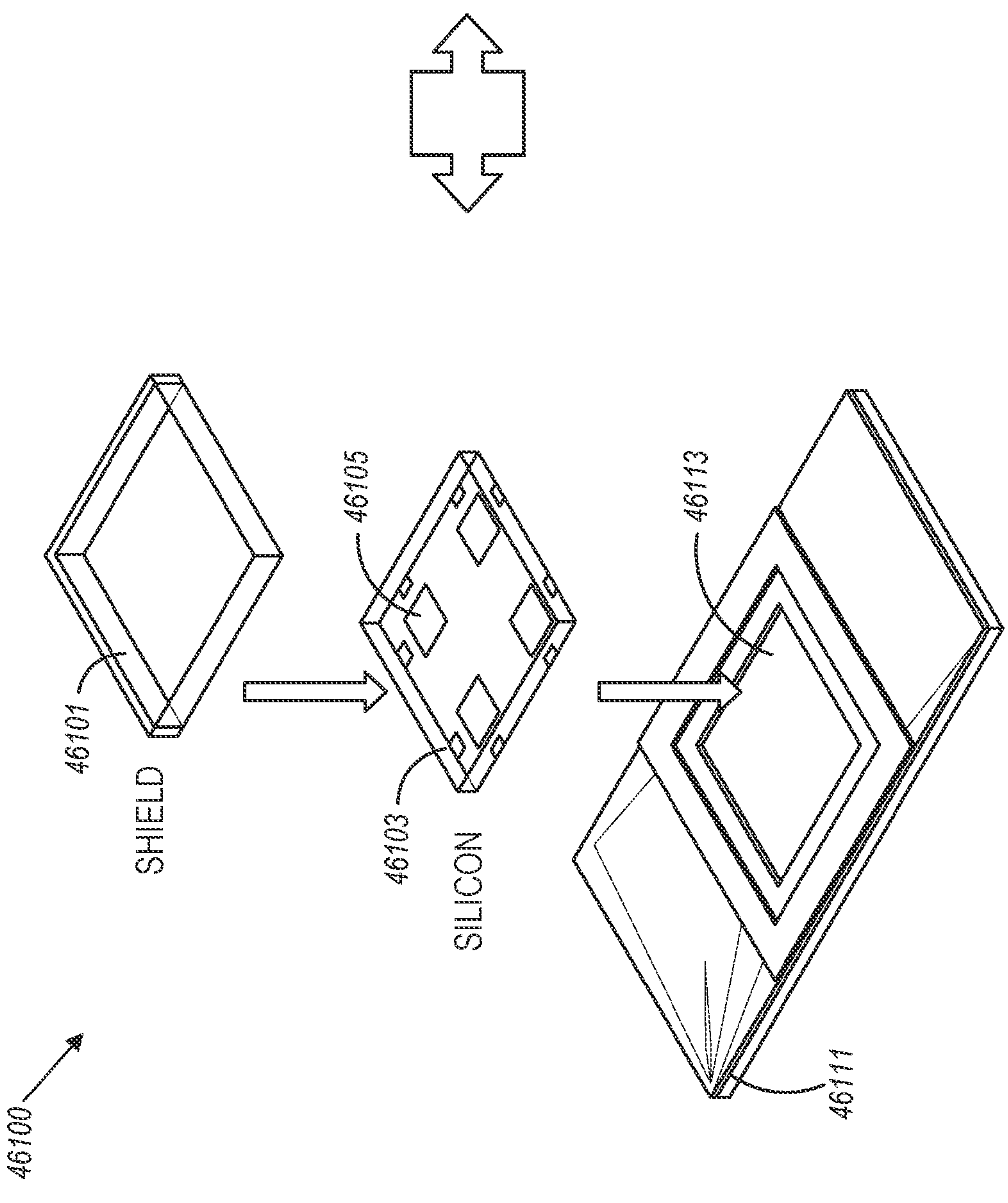

FIG. 461A is an exploded view of an antenna-on-a-chip (AOC), according to some aspects of the present disclosure.

FIG. 461B is a bottom view of the antennas that comprise the AOC of FIG. 461A, according to some aspects of the present disclosure.

Figure 461C:
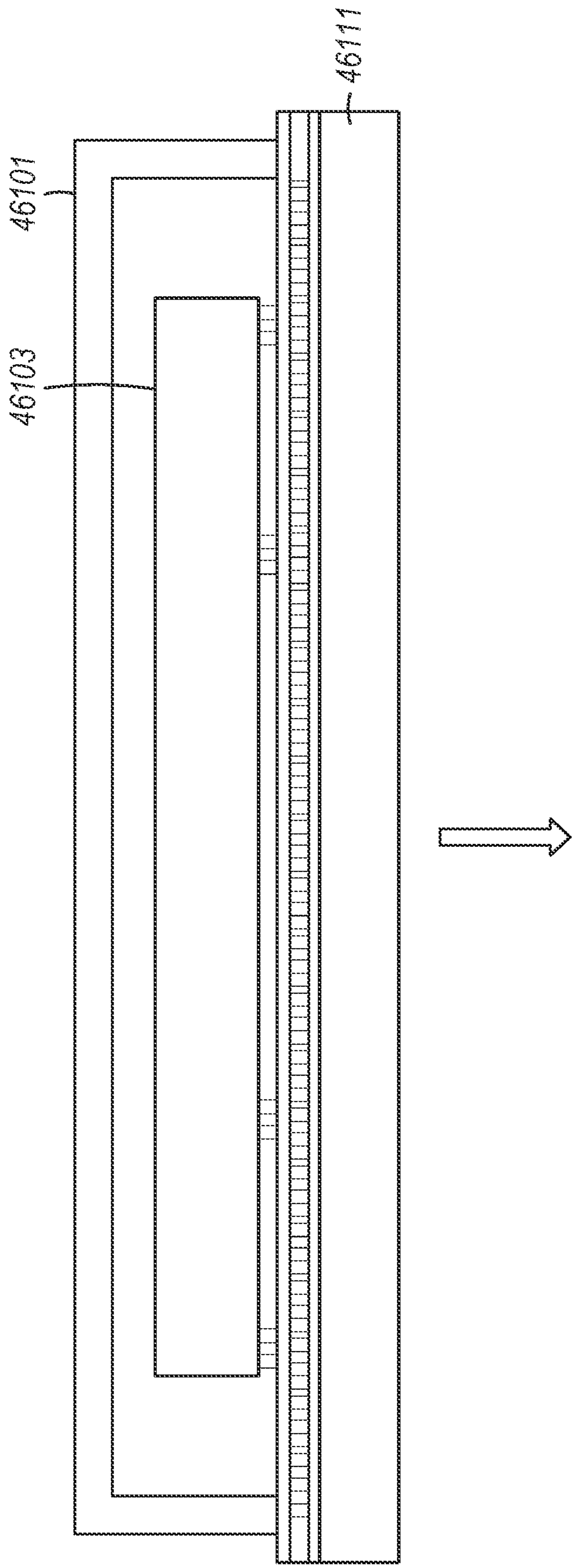

FIG. 461C is a side view of the AOC of FIG. 461A, according to some aspects of the present disclosure.

Figure 462:
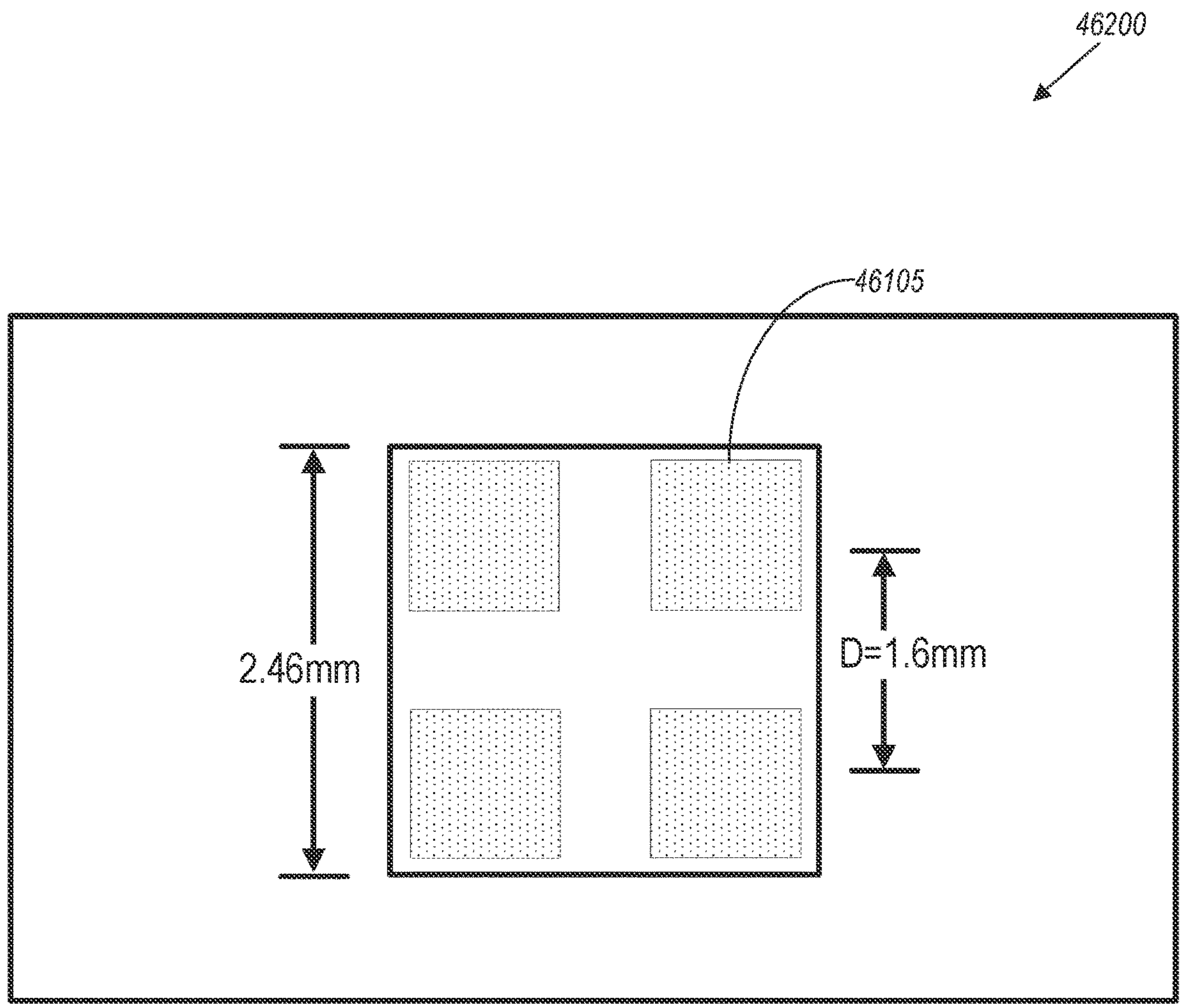

FIG. 462 is another bottom view of the AOC of FIG. 461A, including dimensions for some aspects of the present disclosure.

Figure 463:
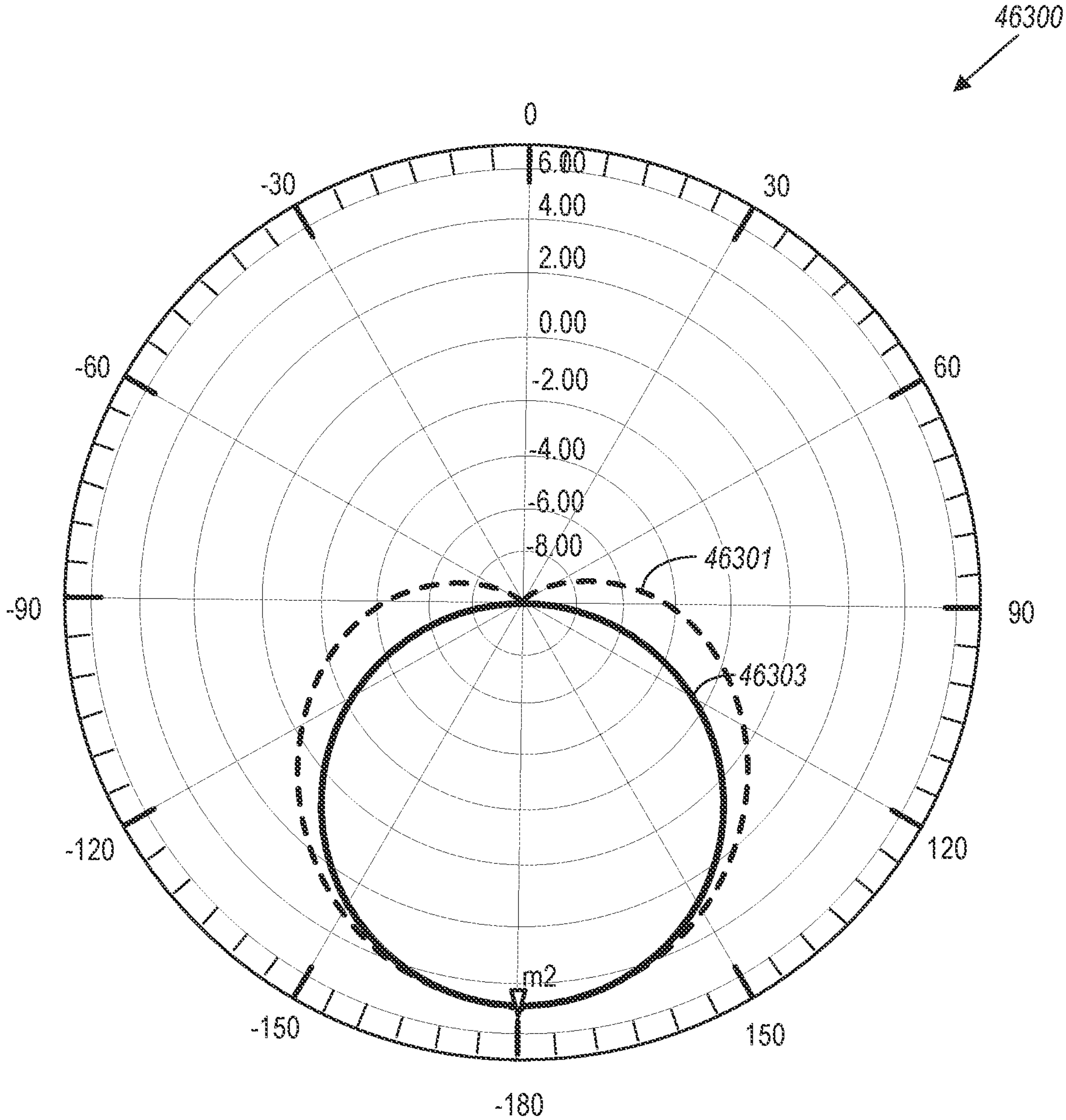

FIG. 463 is a radiation pattern for the antenna on a chip of FIGS. 461A-461C and 462, according to some aspects of the present disclosure.

Figure 464A:
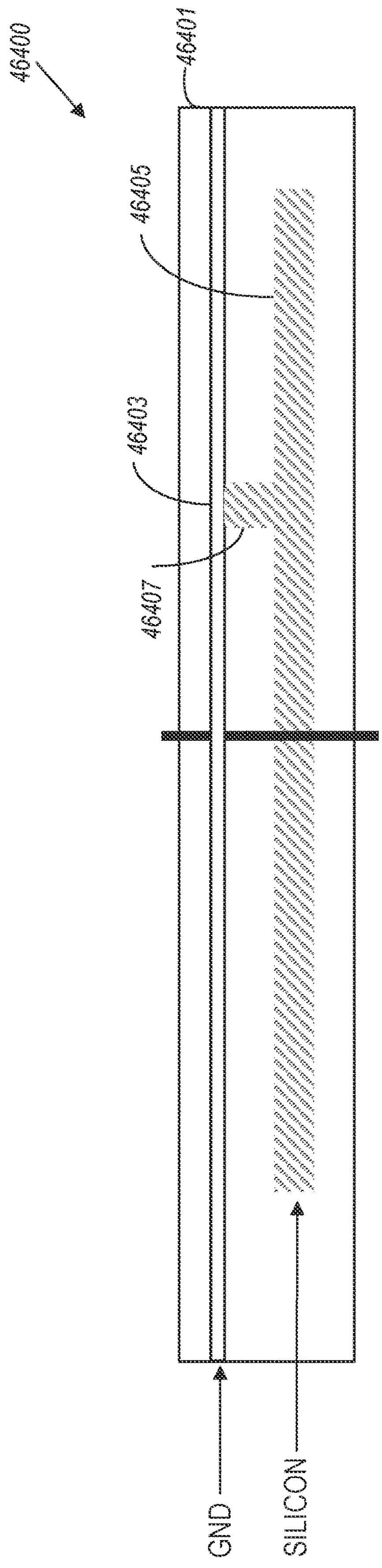

FIG. 464A illustrates another view of an AOC for an embedded die in a package on package implementation, according to some aspects of the present disclosure.

Figure 464B:
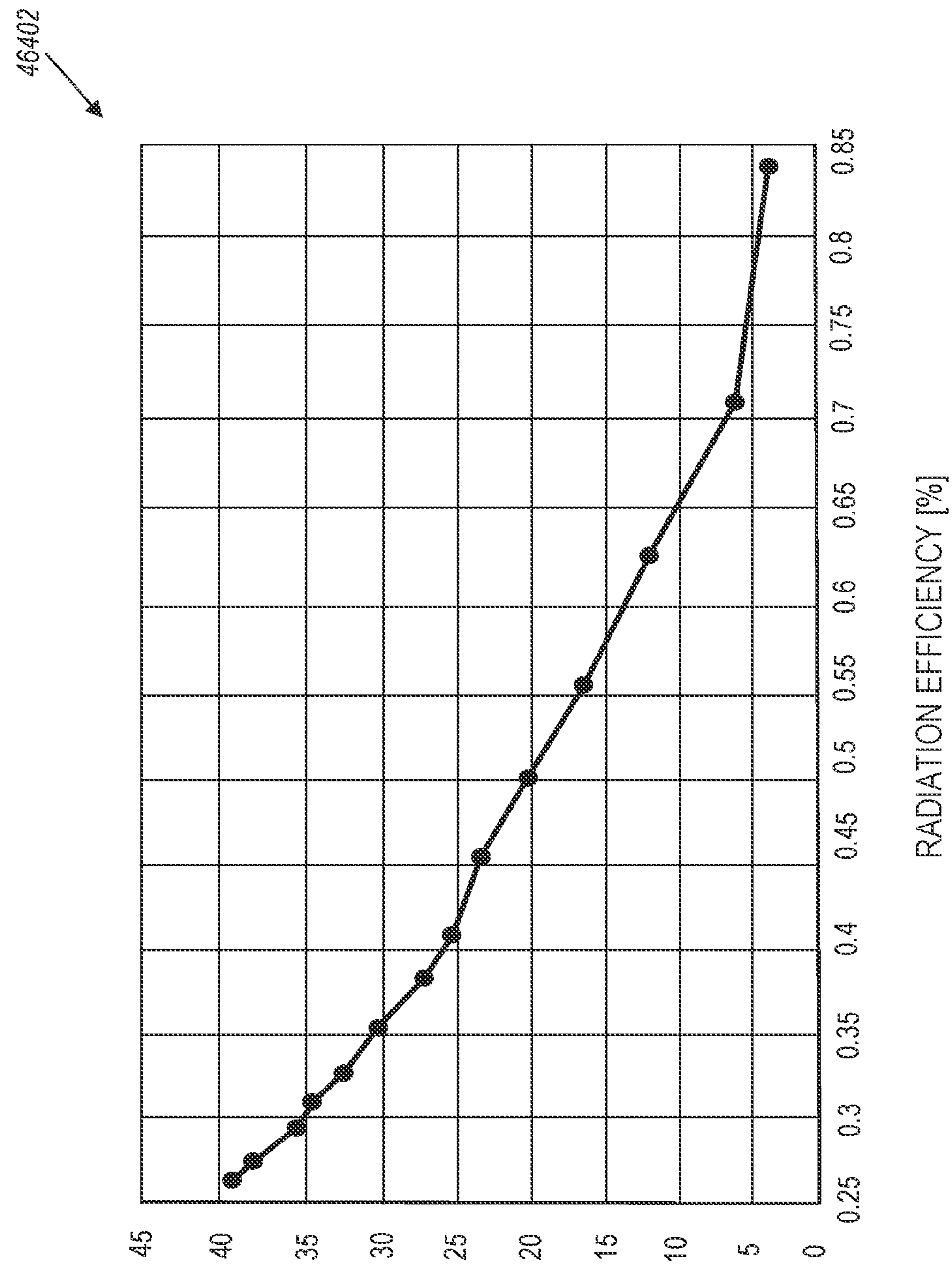

FIG. 464B is an illustration of radiation efficiency as a function of height of the silicon divided by height of the patches, according to some aspects of the present disclosure.

Figure 464C:
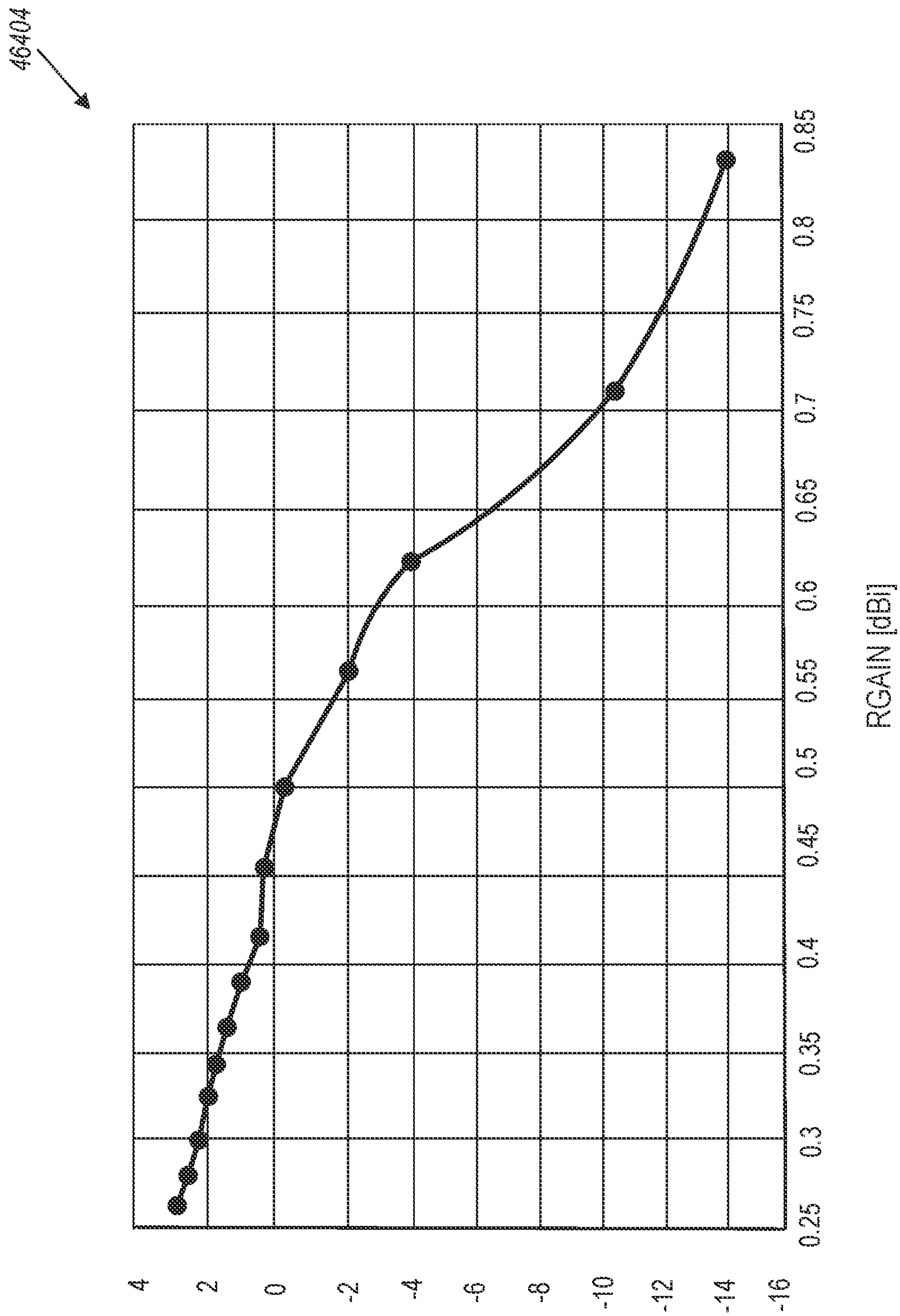

FIG. 464C is an illustration of realized gain in dBi as a function of height of the silicon divided by height of the patches, according to some aspects of the present disclosure.

Figure 465:
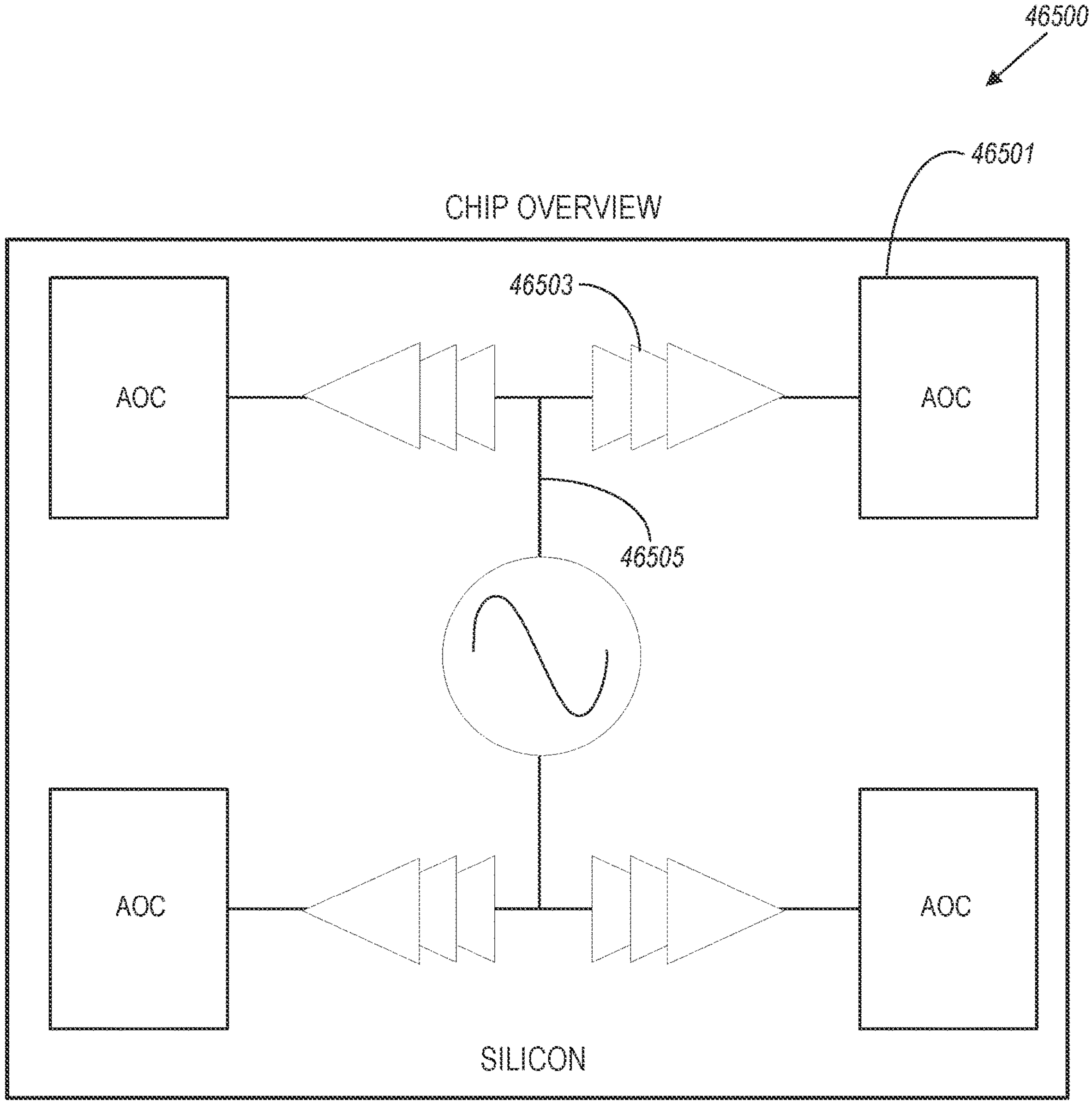

FIG. 465 is another illustration of an AOC symbolically showing a chip overview and including the relationship of the antennas and the circuitry on the chip, according to some aspects of the present disclosure.

Figure 466:
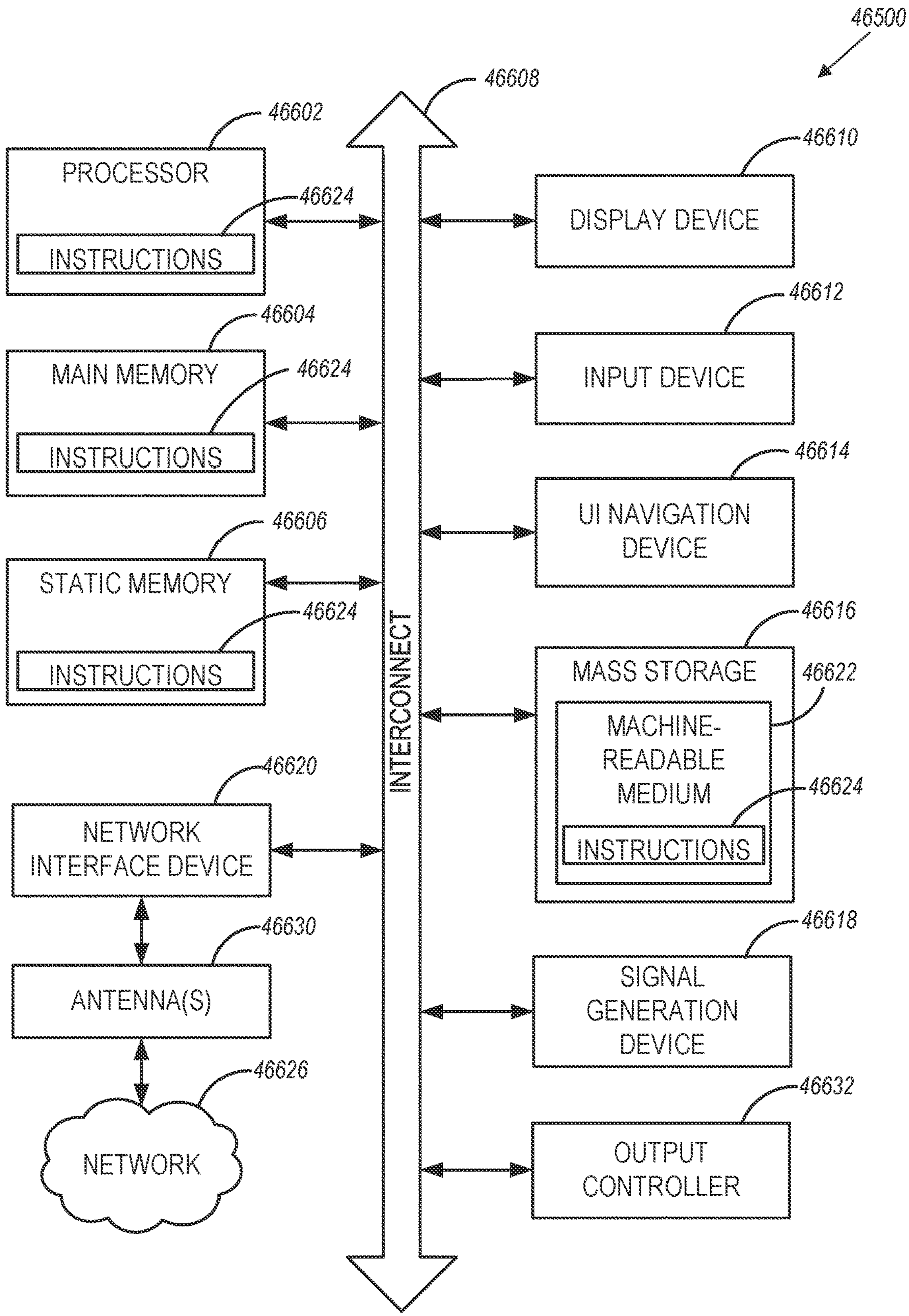

FIG. 466 illustrates a block diagram of an example machine upon which any one or more of the techniques or methodologies discussed herein may be performed, according to some aspects of the present disclosure.

Figure 467:
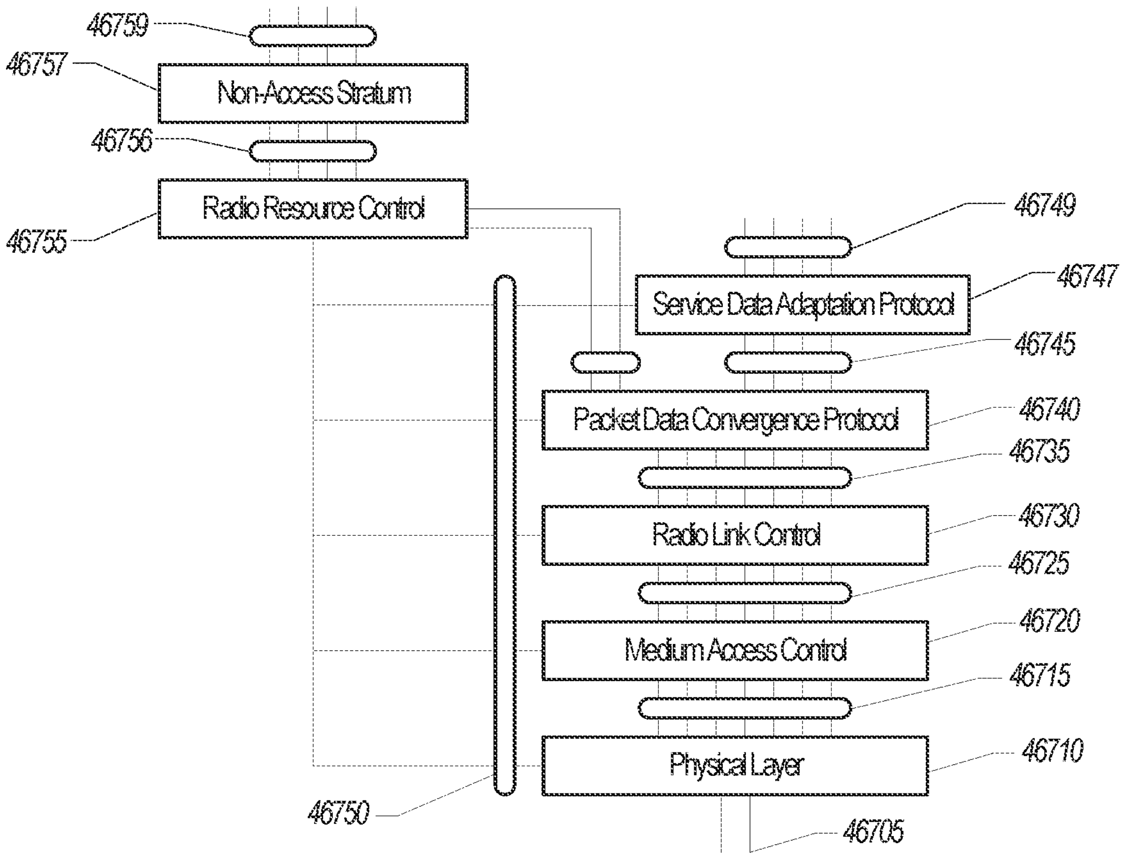

FIG. 467 illustrates protocol functions that may be implemented in a wireless communication device, according to some aspects of the present disclosure.

Figure 468:
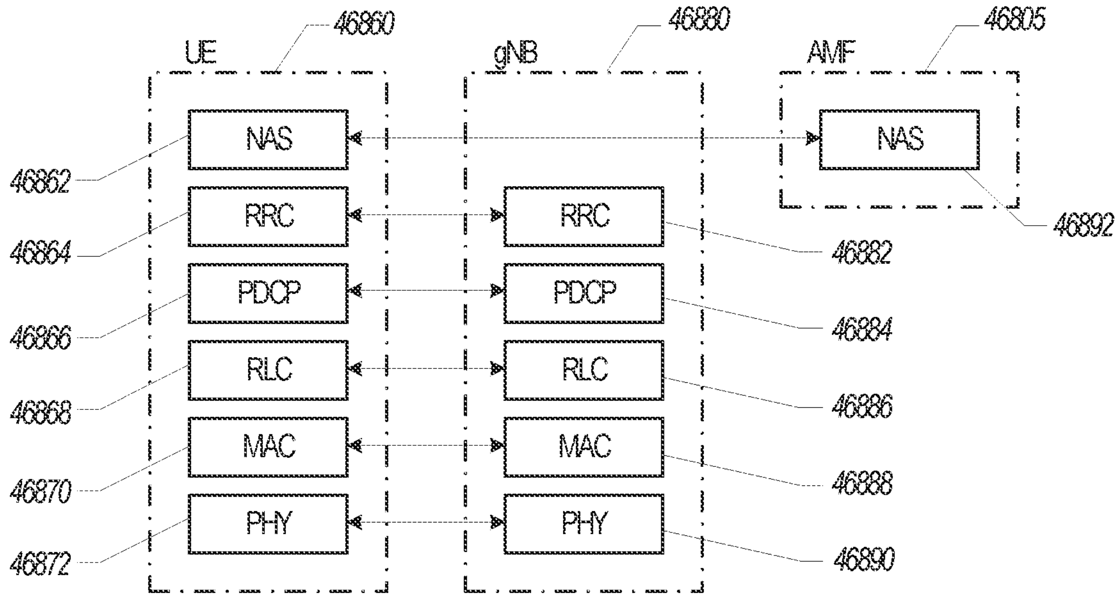

FIG. 468 illustrates various protocol entities that may be implemented in connection with a wireless communication device or a wireless communication system, according to some aspects of the present disclosure.

Figure 469:
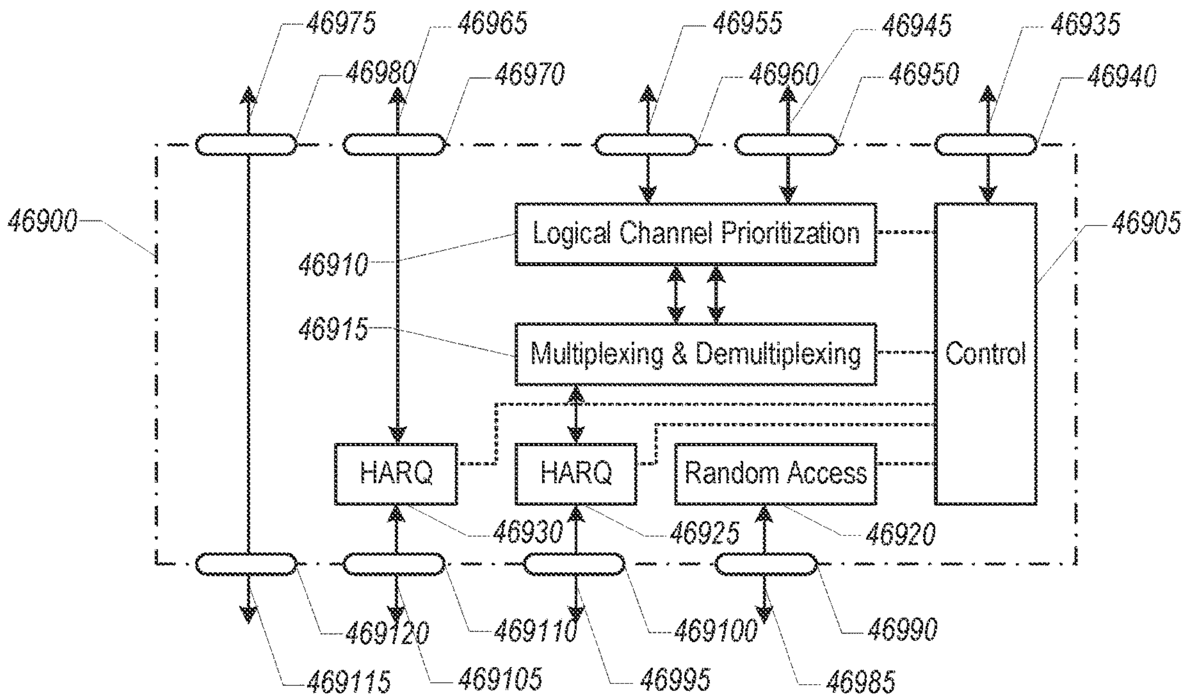

FIG. 469 illustrates a medium access control (MAC) entity that may be used to implement medium access control layer functions according to some aspects of the present disclosure.

Figure 470A:
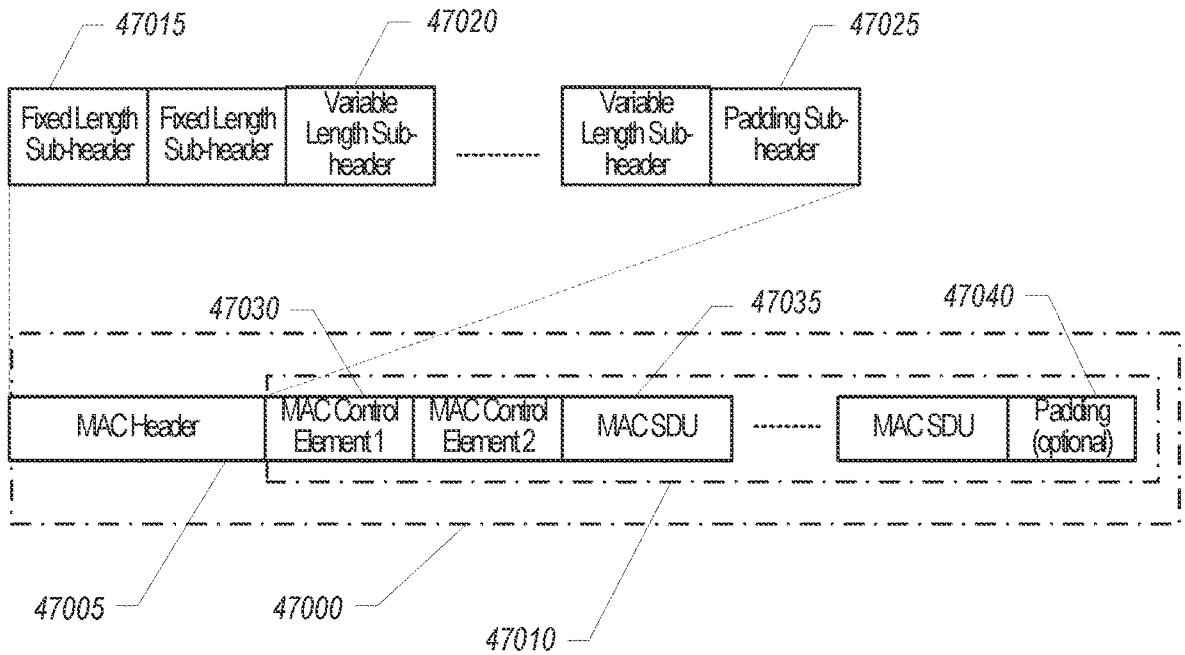
Figure 470B:
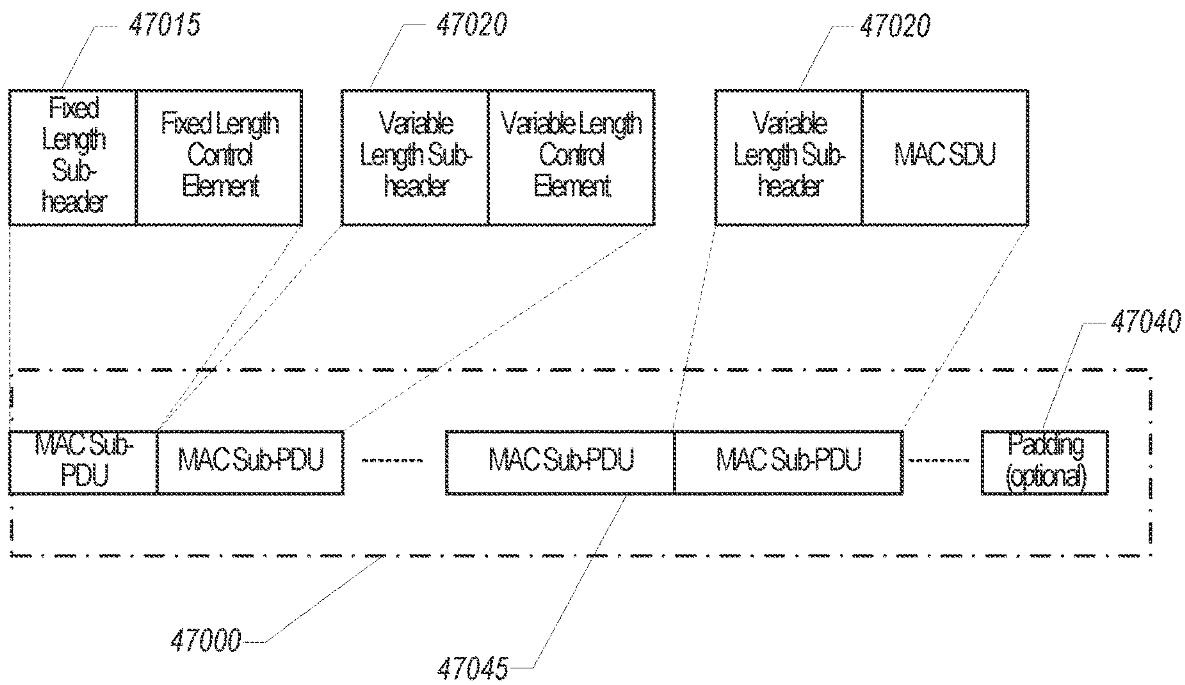

FIG. 470A and FIG. 470B illustrate formats of PDUs that may be encoded and decoded by the MAC entity of FIG. 469 according to some aspects of the present disclosure.

Figure 470C:
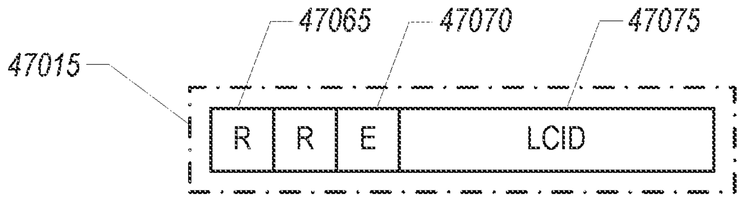
Figure 470D:
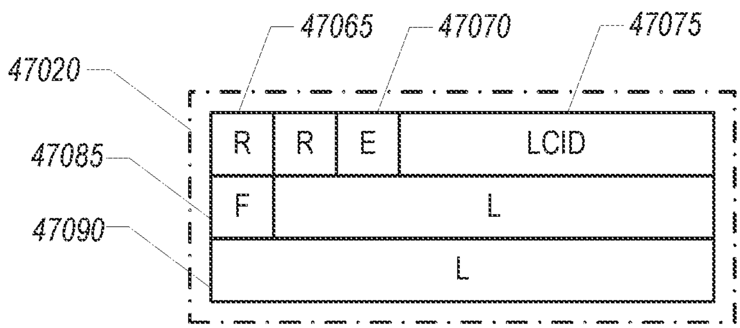
Figure 470E:
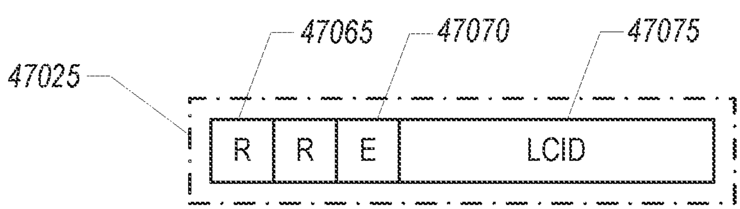

FIG. 470C, FIG. 470D, and FIG. 470E illustrate various sub-headers that may be used in connection with the MAC entity of FIG. 469 according to some aspects of the present disclosure.

Figure 471:
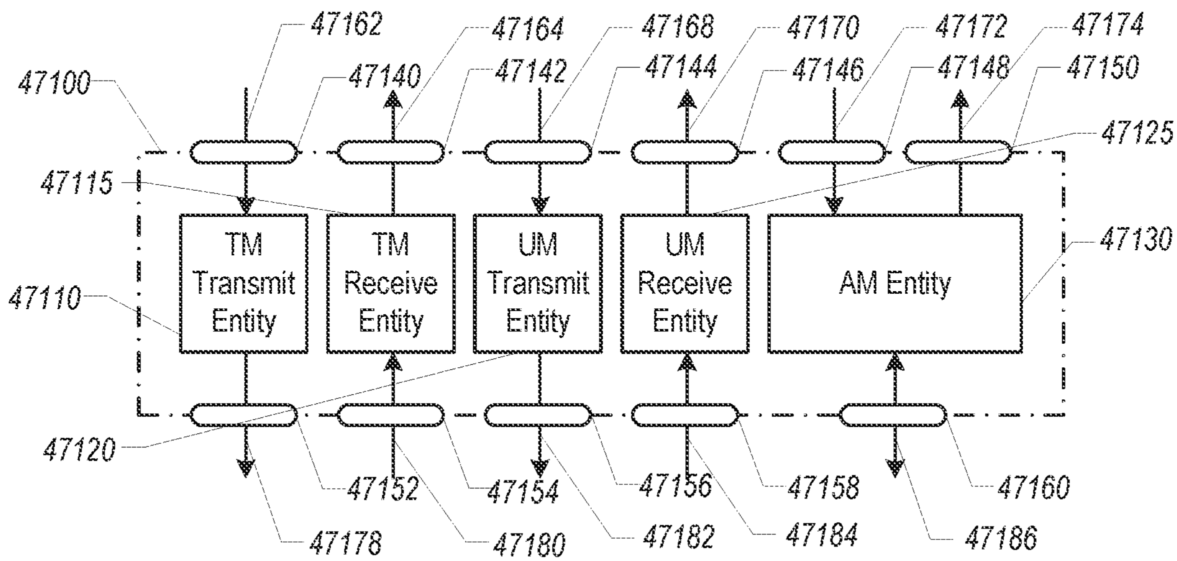

FIG. 471 illustrates functions contained within a radio link control (RLC) layer entity according to some aspects of the present disclosure.

Figure 472A:
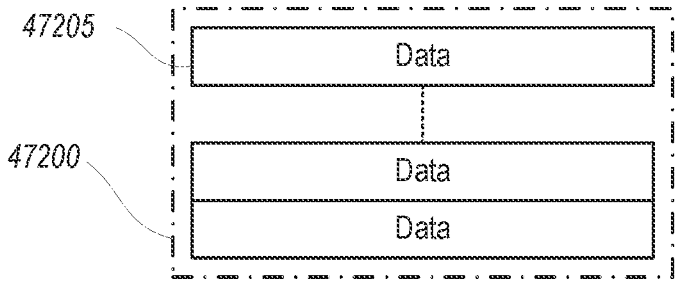

FIG. 472A illustrates a TMD PDU according to some aspects of the present disclosure.

Figure 472B:
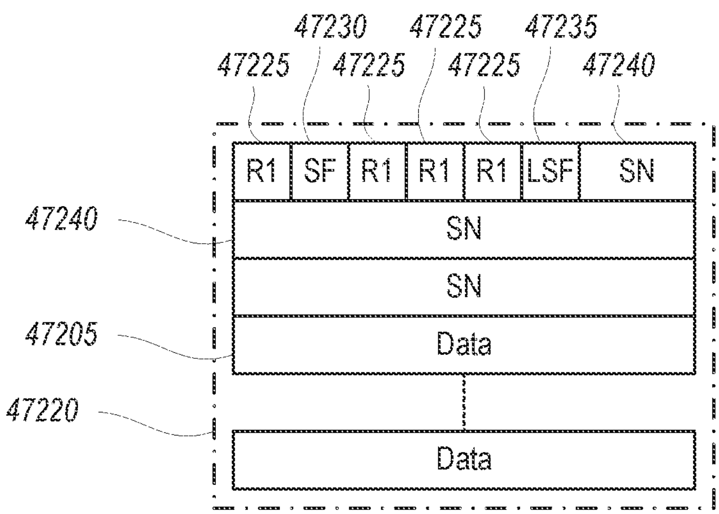
Figure 472C:
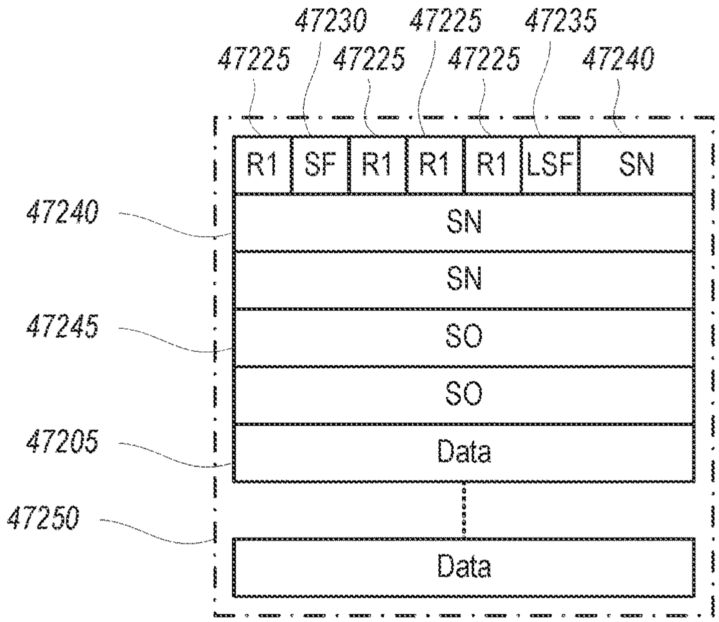

FIG. 472B and FIG. 472C illustrate UMD PDUs according to some aspects of the present disclosure.

Figure 472D:
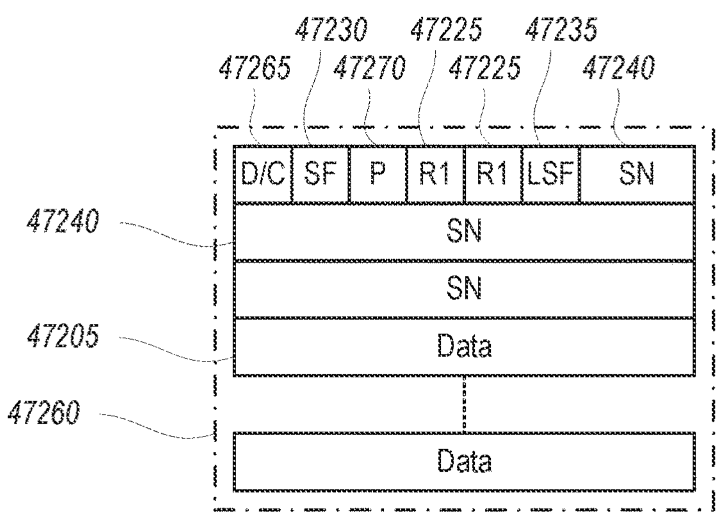
Figure 472E:
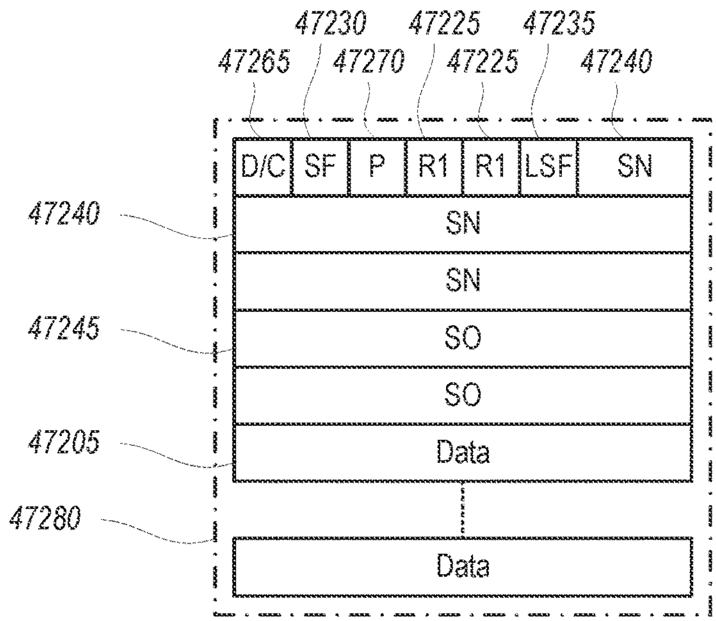

FIG. 472D and FIG. 472E illustrate AMD PDUs according to some aspects of the present disclosure.

Figure 472F:
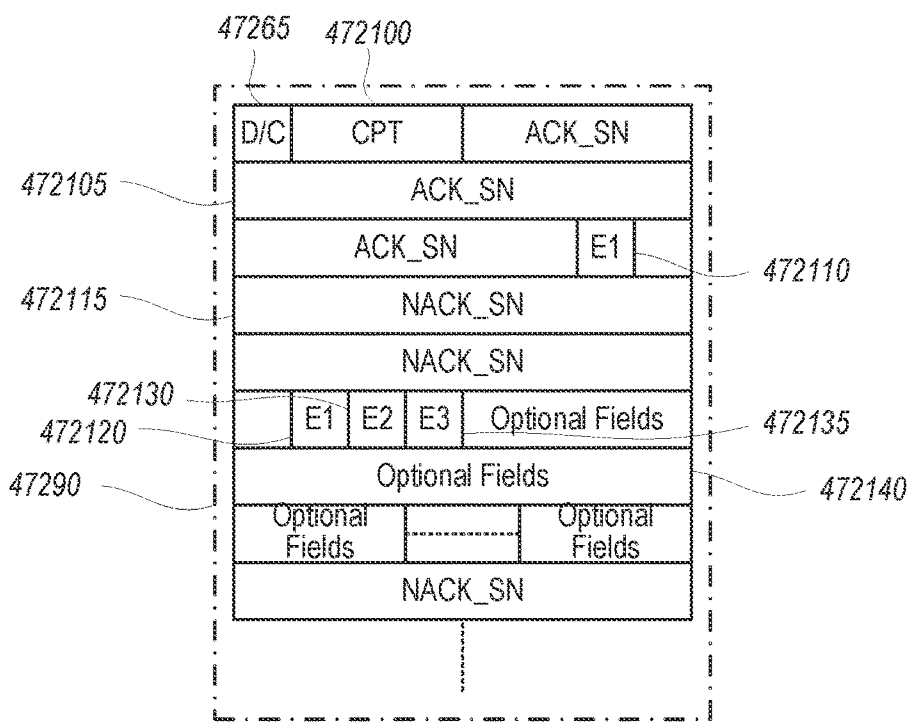

FIG. 472F illustrates a STATUS PDU according to some aspects of the present disclosure.

Figure 473:
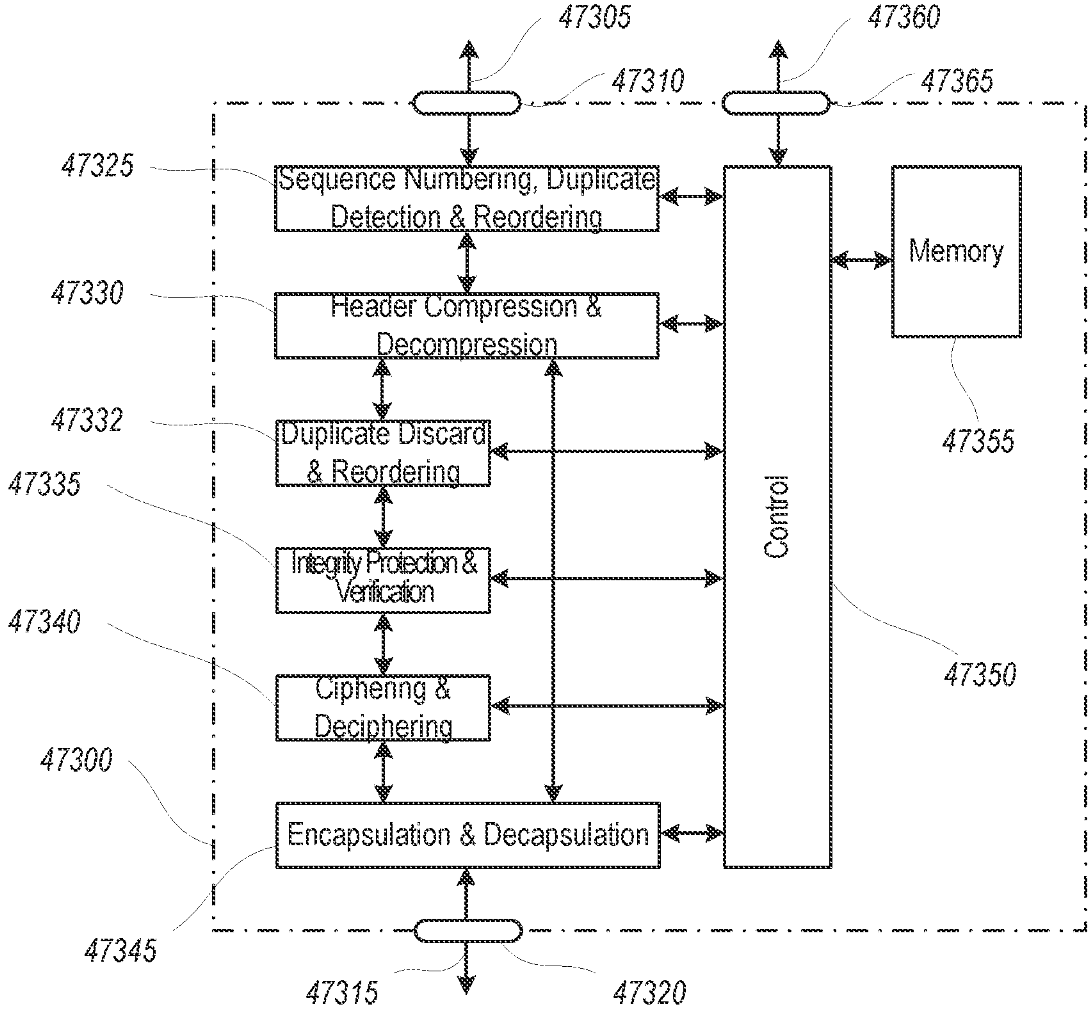

FIG. 473 illustrates aspects of functions, which may be contained within a packet data convergence protocol (PDCP) layer entity according to some aspects of the present disclosure.

Figure 474:
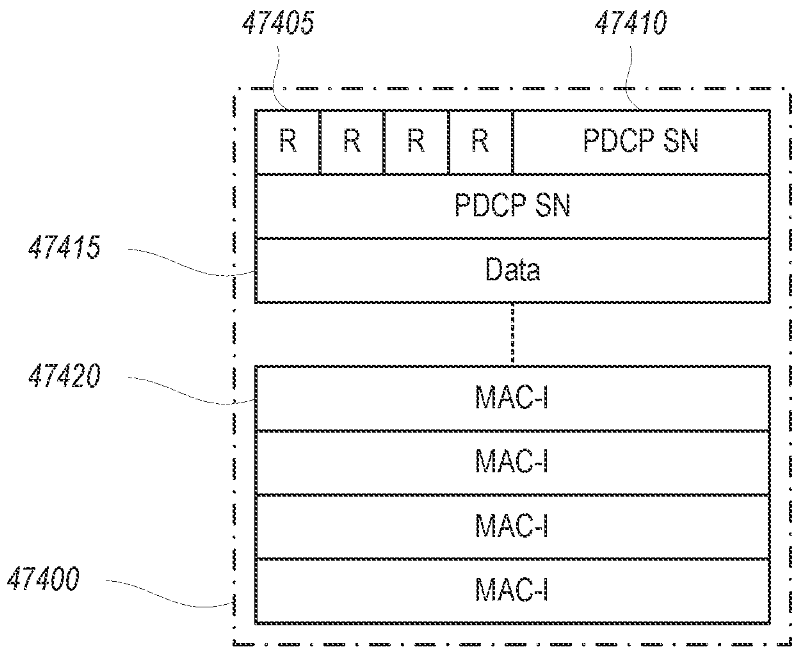

FIG. 474 illustrates a PDCP PDU that may be transmitted and received by a PDCP entity according to some aspects of the present disclosure.

Figure 475:
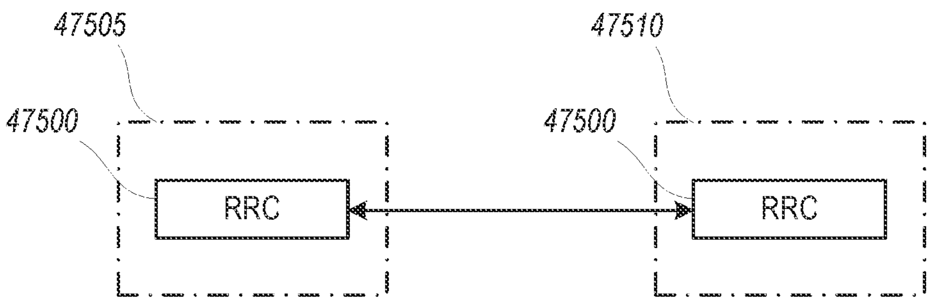

FIG. 475 illustrates aspects of communication between instances of radio resource control (RRC) layer according to some aspects of the present disclosure.

Figure 476:
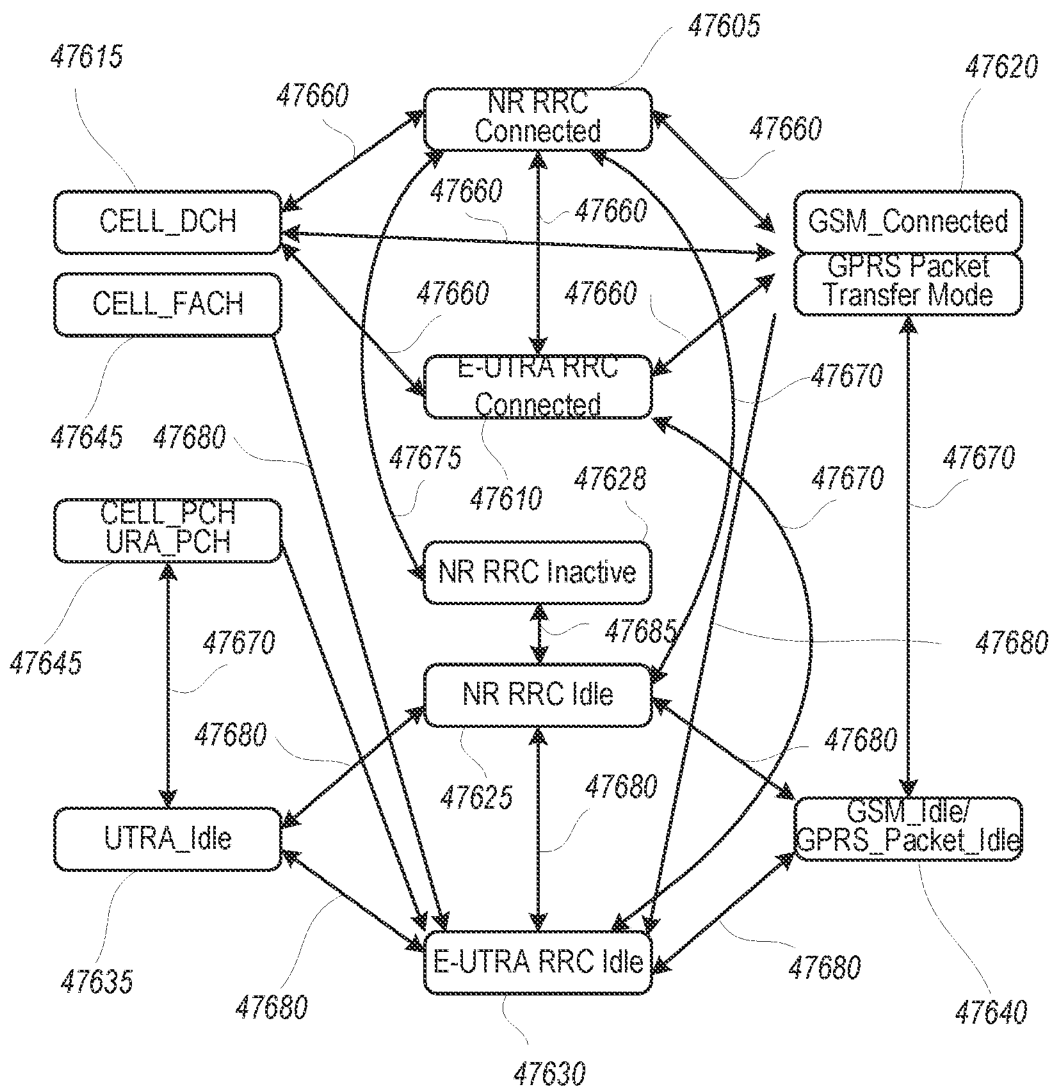

FIG. 476 illustrates states of an RRC that may be implemented in a user equipment (UE) according to some aspects of the present disclosure.

DETAILED DESCRIPTION

With the advancement of 5G mmWave-based communications, several challenges have evolved, such as limited communications range, directionality of the antenna systems, achieving desired directionality and beamforming with large scale antenna arrays, signal attenuation due to atmospheric attenuation loss and high attenuation through solid materials. Techniques described herein can be used in connection with digital baseband circuitry, transmit circuitry, receive circuitry, radio frequency circuitry, protocol processing circuitry and antenna arrays to address the challenges associated with the 5G mmWave-based communications.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computers registers and/or memories into other data similarly represented as physical quantities within the computers registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (AN) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016); IEEE802.11ay (P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN and the like.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (SIG) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

The phrase "peer to peer (PTP) communication", as used herein, may relate to device-to-device communication over a wireless link ("peer-to-peer link") between devices. The PTP communication may include, for example, a WiFi Direct (WFD) communication, e.g., a WFD Peer to Peer (P2P) communication, wireless communication over a direct link within a Quality of Service (QoS) basic service set (BSS), a tunneled direct-link setup (TDLS) link, a STA-to-STA communication in an independent basic service set (IBSS), or the like.

Some demonstrative aspects are described herein with respect to WiFi communication. However, other aspects may be implemented with respect to any other communication scheme, network, standard and/or protocol.

In some demonstrative aspects, a wireless communication device may implement a millimeter wave (mmWave) radio front end module (RFEM), e.g., as described below.

Millimeter wave may be defined as a frequency range spanning about 30 GHz to about 300 GHz, and in practice currently covers several discrete licensed and unlicensed frequency bands.

The unlicensed mmWave frequency band currently available is in the vicinity of 60 GHz. Licensed frequency bands are likely to include 28 GHz, 39 GHz, 73 GHz and 120 GHz. The availability of these bands and the specific frequency range of each varies by regulatory jurisdiction, and in some cases (specifically for licensed band operation) there is still significant uncertainty as to regulations in some countries. Challenges associated with mmWave-based cellular communications include limited range, directionality of antennas of the range, signal loss because of use of regular cables instead of traces, and challenges with integrating multiple antennas for beamforming. These challenges are addressed in this patent as discussed below in accordance with some aspects, and may include use of polarization innovations, trace and other line use to avoid signal loss, and an improved ability for use in beamforming.

Figure 1:
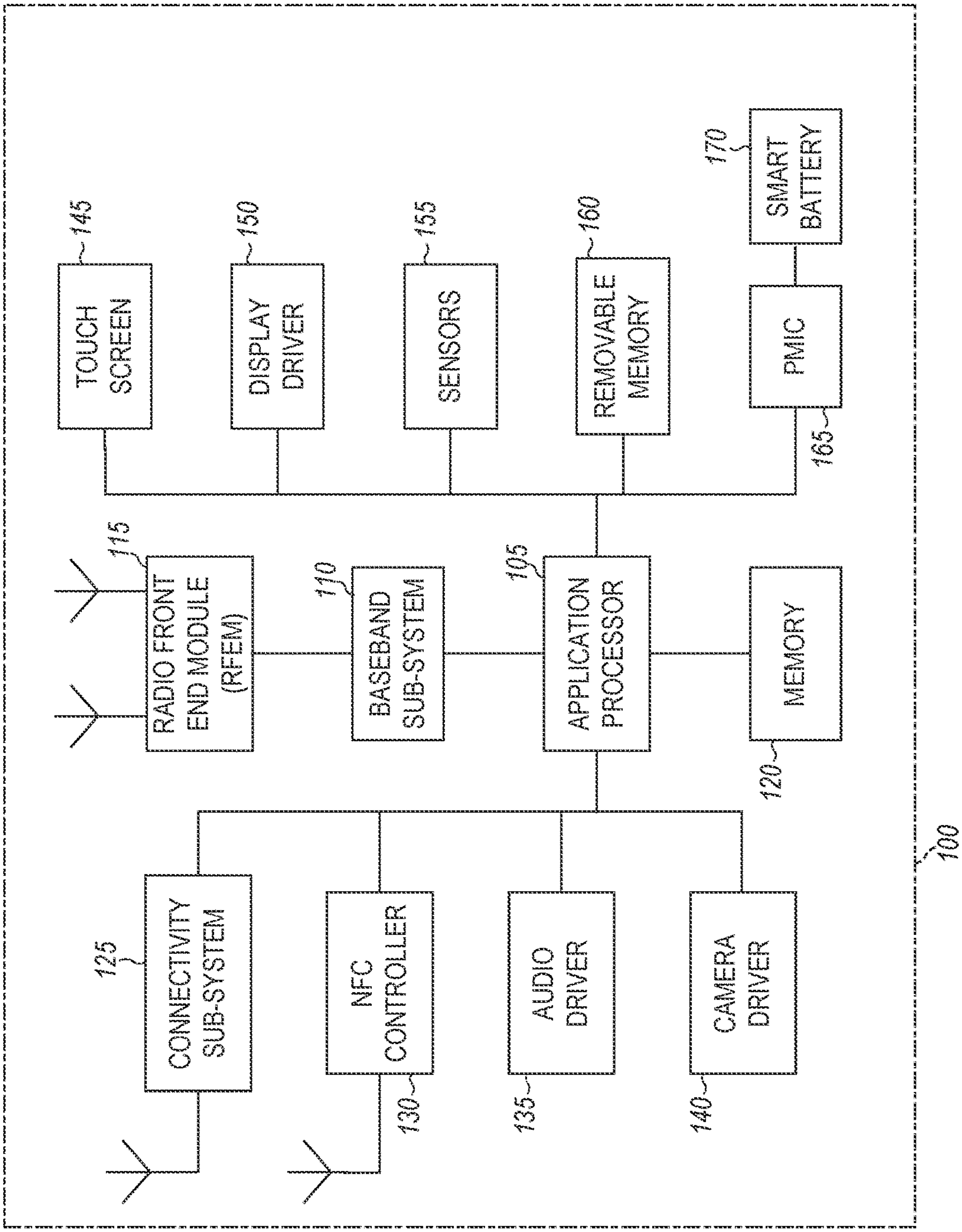
FIG. 1 illustrates an exemplary user device according to some aspects.

FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, 12C or universal programmable serial interface sub-system, real time clock (RTC), timer-counters including interval and watchdog timers, general purpose 10, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
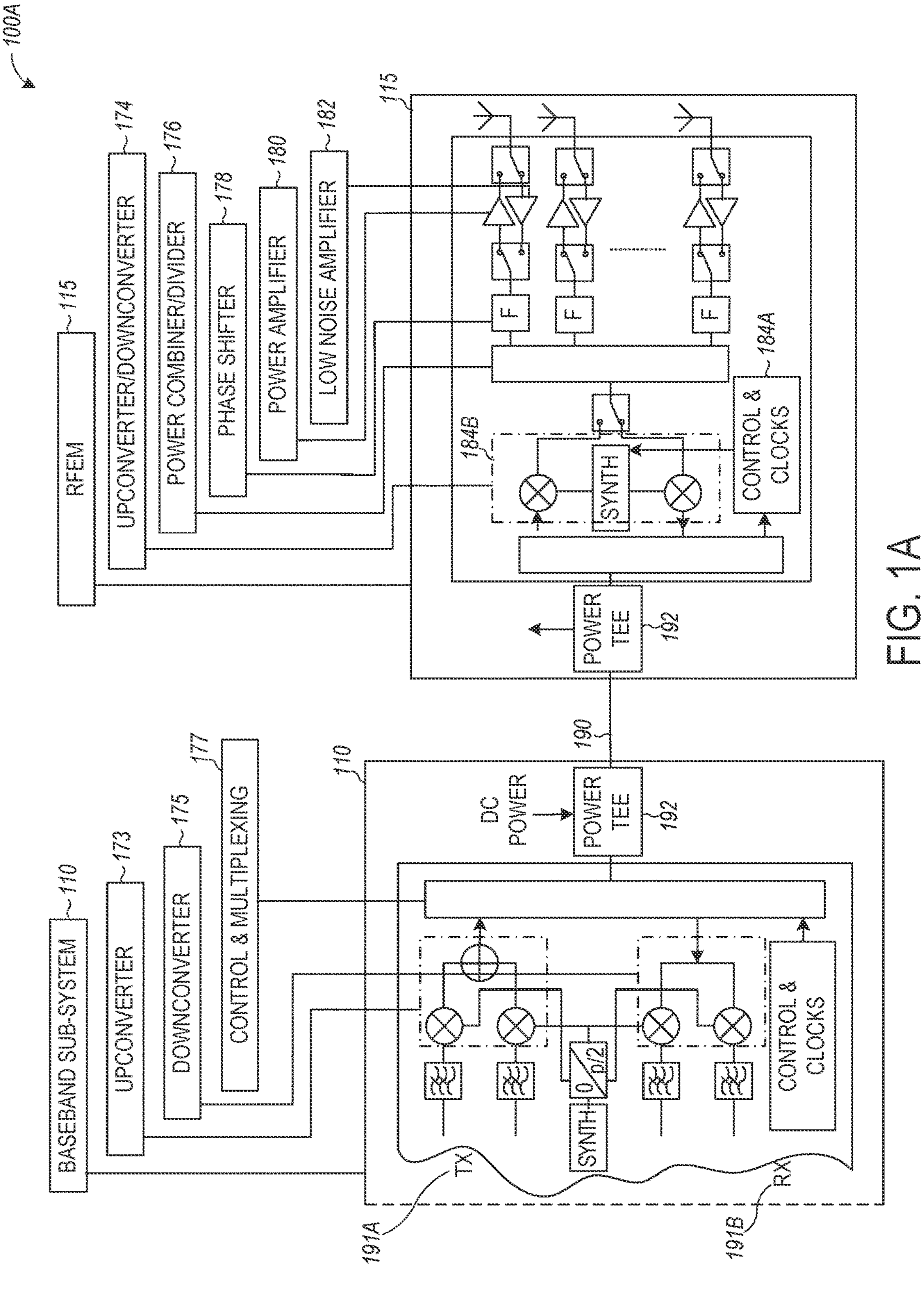
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband sub-system 110 and one or more radio front end modules (RFEMs) 115. The RFEM 115 can be connected to the baseband sub-system 110 by a single coaxial cable 190, which supplies a modulated intermediate frequency (IF) signal, DC power, clocking signals and control signals.

The baseband sub-system 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
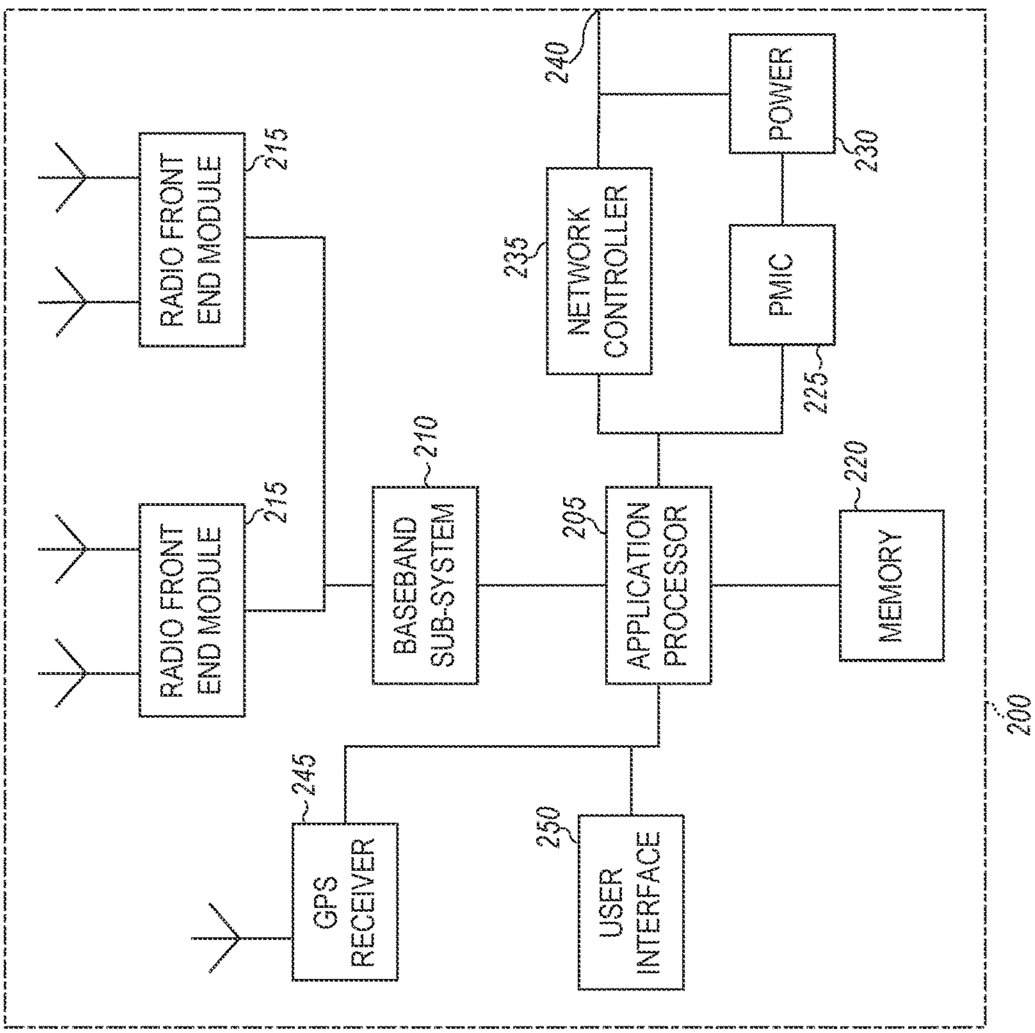
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, $I^2C$ or universal programmable serial interface, real time clock (RTC), timer-counters including interval and watchdog timers, general purpose 10, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
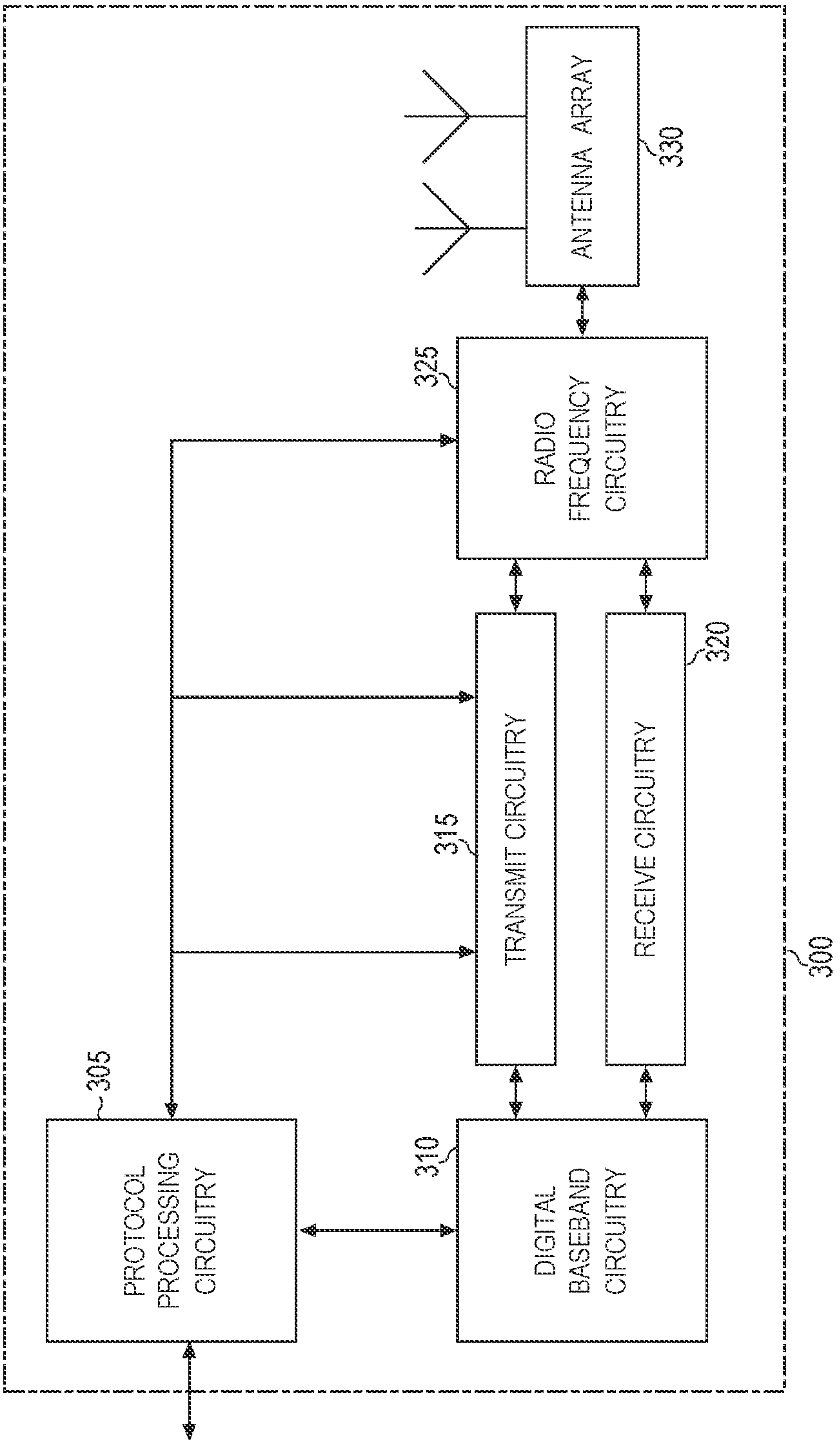
FIG. 3A illustrates exemplary millimeter wave communication circuitry according to some aspects.
Figure 3B:
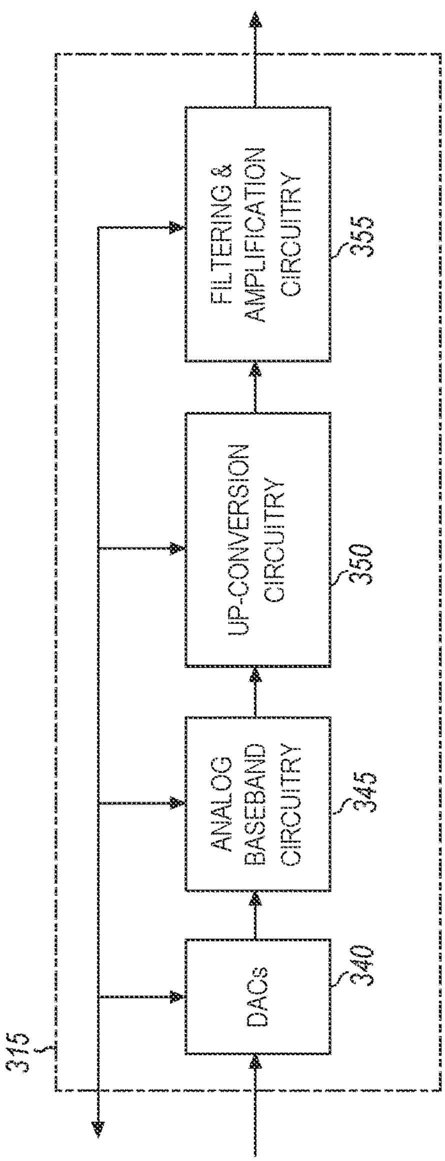
FIG. 3B illustrates aspects of exemplary transmit circuitry illustrated in FIG. 3A according to some aspects.
Figure 3C:
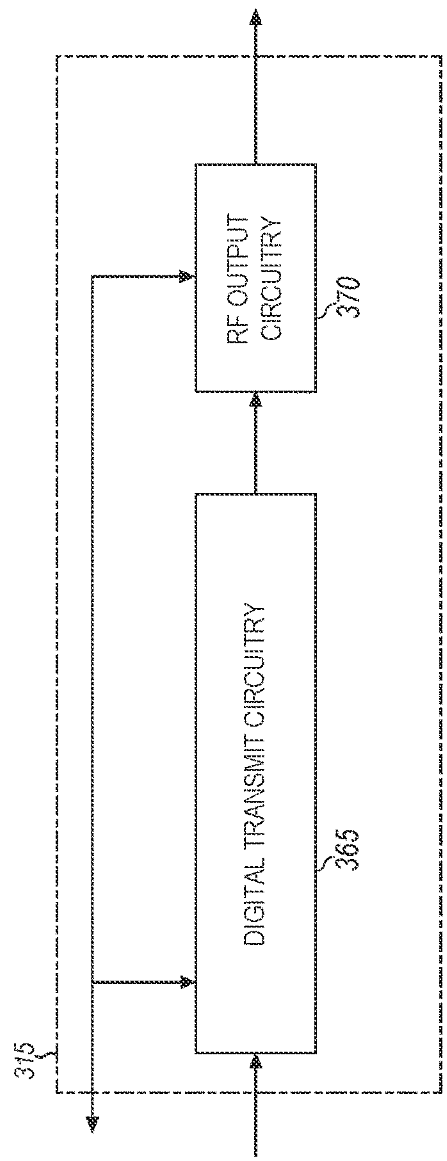
FIG. 3C illustrates aspects of exemplary transmit circuitry illustrated in FIG. 3A according to some aspects.
Figure 3D:
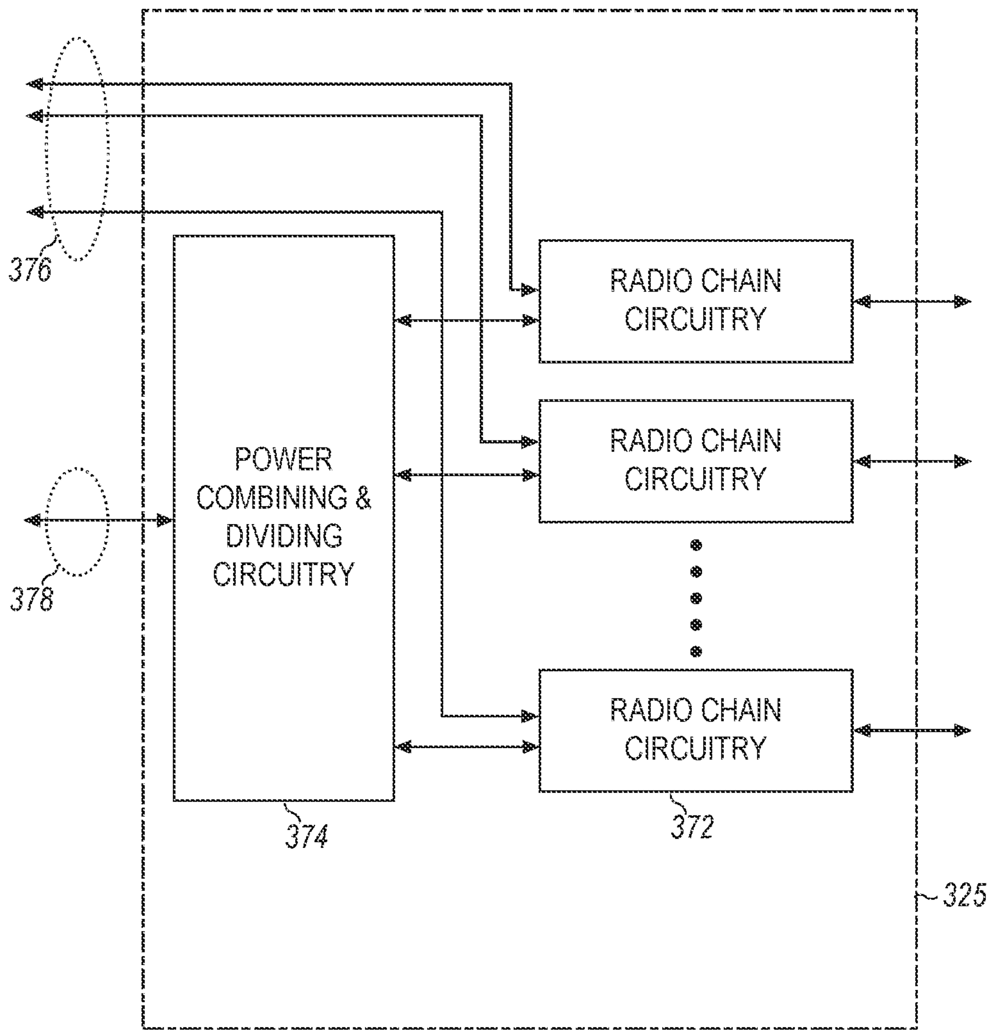
FIG. 3D illustrates aspects of exemplary radio frequency circuitry illustrated in FIG. 3A according to some aspects.
Figure 3E:
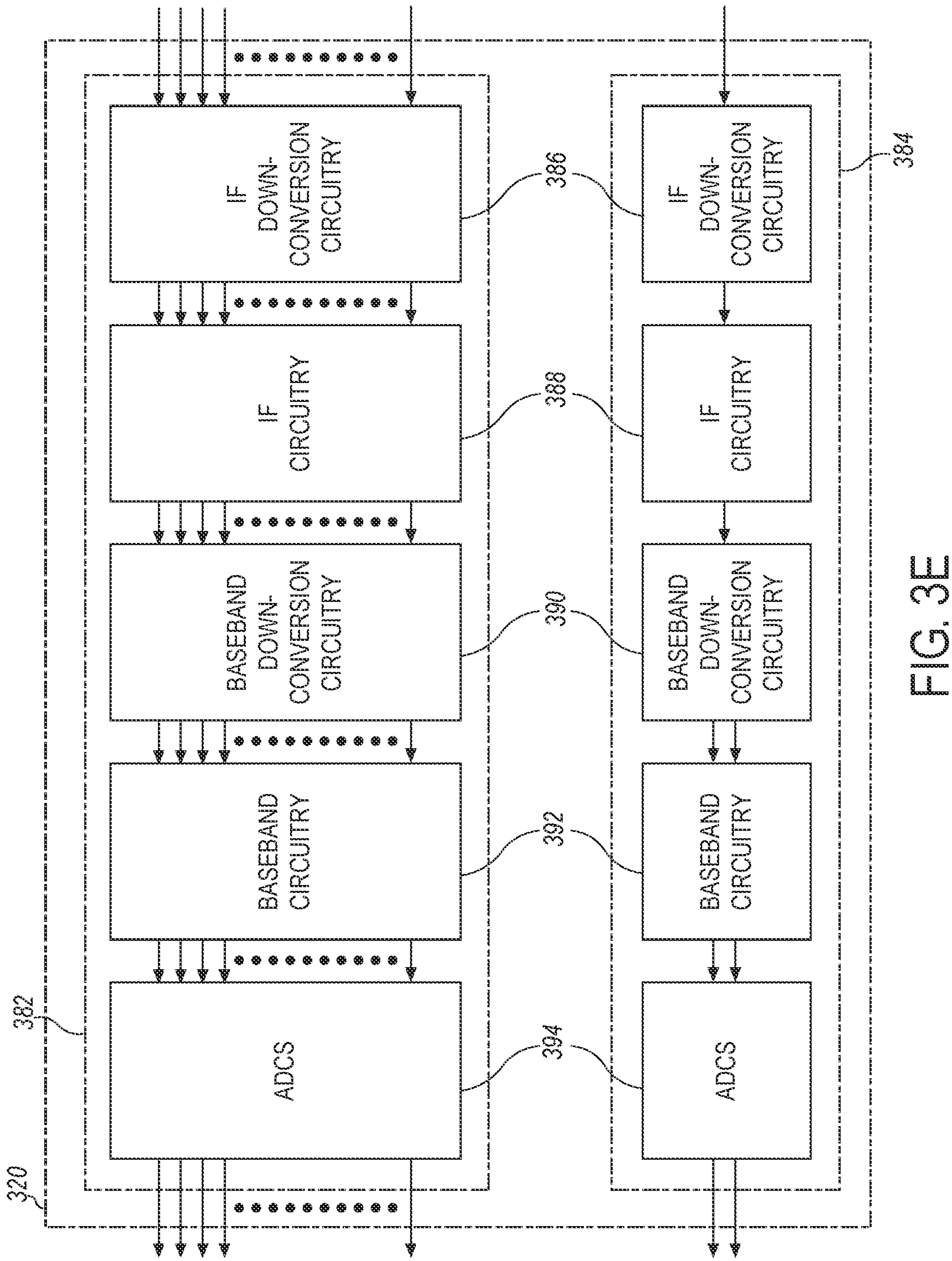
FIG. 3E illustrates aspects of exemplary receive circuitry in FIG. 3A according to some aspects.

FIG. 3A illustrates exemplary mmWave communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Millimeter wave communication circuitry 300 shown in FIG. 3A may be alternatively grouped according to functions. Components illustrated in FIG. 3A are provided here for illustrative purposes and may include other components not shown in FIG. 3A.

Millimeter wave communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Millimeter wave communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 300 may further include transmit circuitry 315, receive circuitry 320 and/or antenna array circuitry 330. Millimeter wave communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

Figure 4:
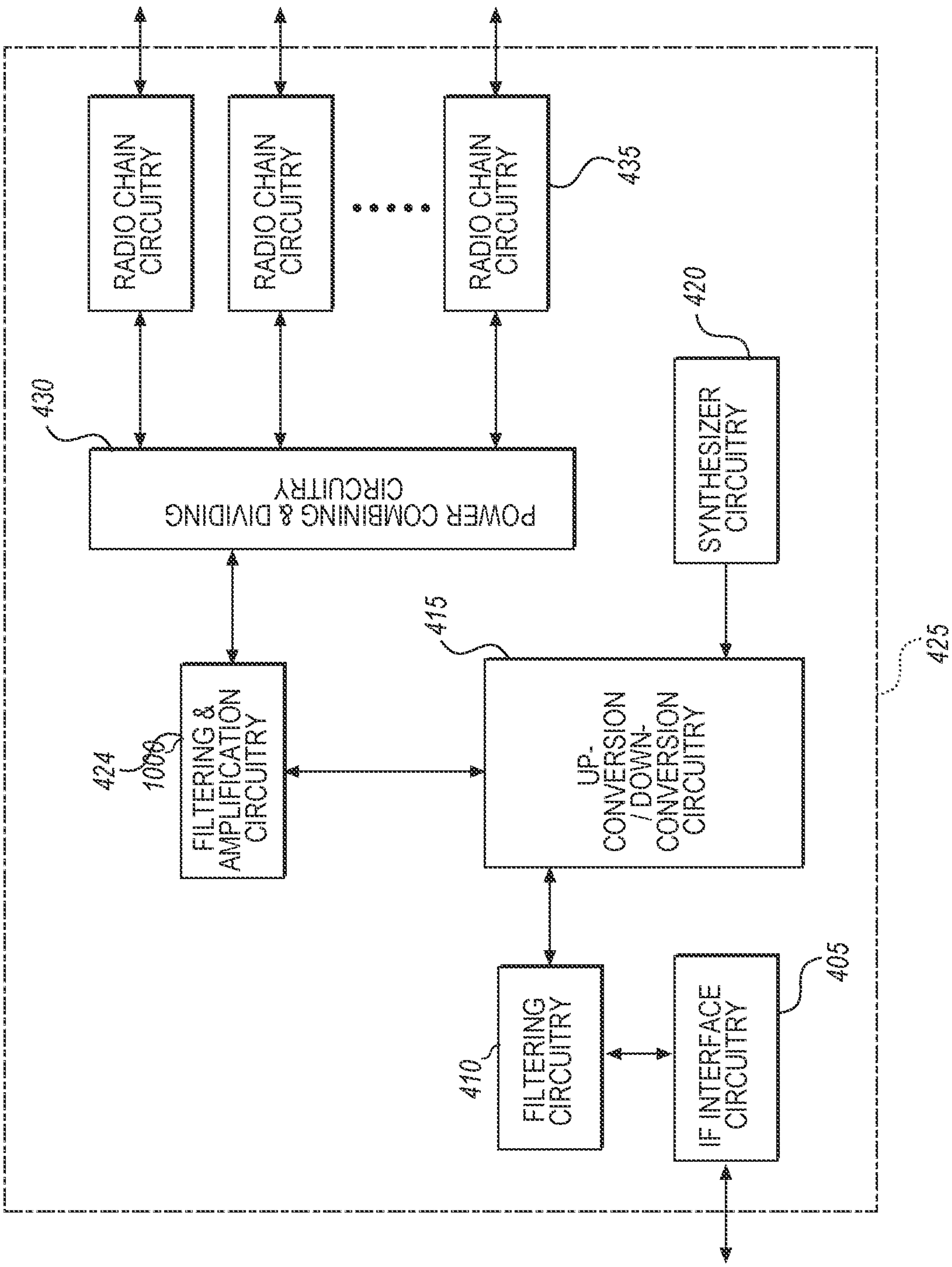
FIG. 4 illustrates exemplary useable RF circuitry in FIG. 3A according to some aspects.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

Figure 5B:
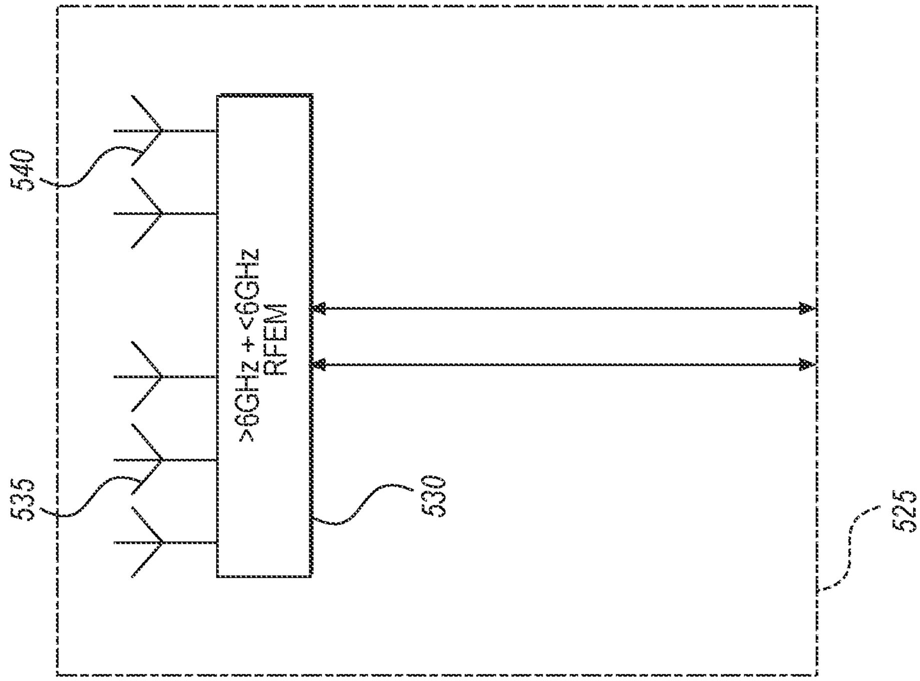
FIG. 5B illustrates an alternate aspect of an exemplary radio front end module, according to some aspects.
Figure 5A:
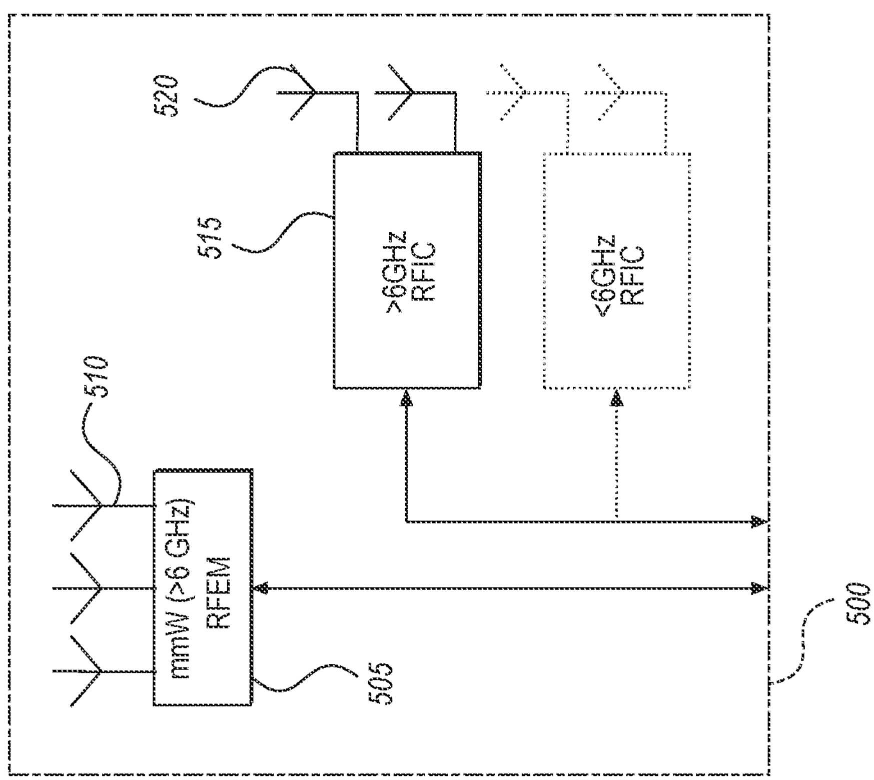
FIG. 5A illustrates an aspect of an exemplary radio front end module (RFEM) according to some aspects.

FIG. 5A and FIG. 5B illustrate aspects of a radio front end module useable in the circuitry shown in FIG. 1 and FIG. 2, according to some aspects. FIG. 5A illustrates an aspect of a radio front end module (RFEM) according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
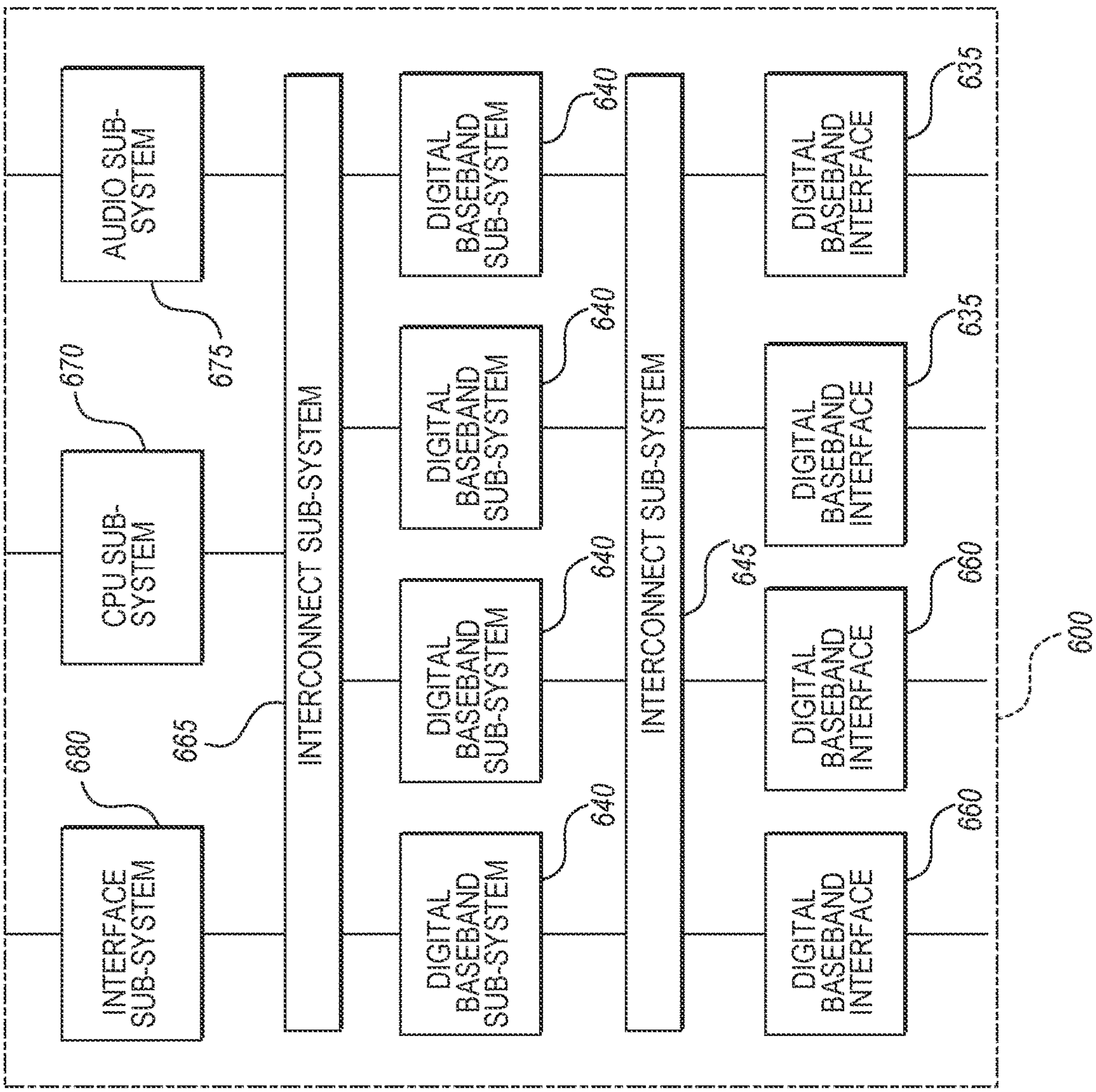
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
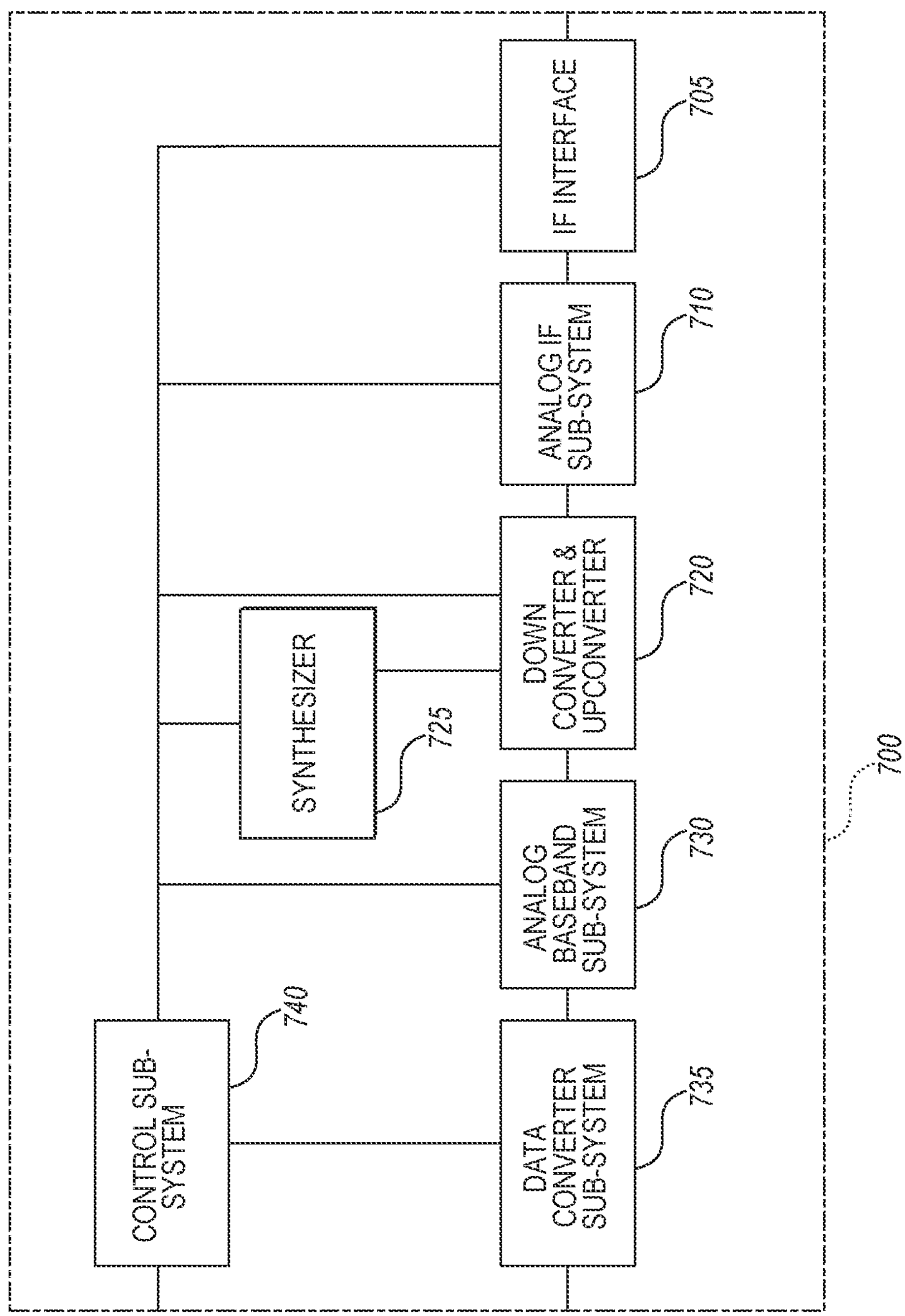
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
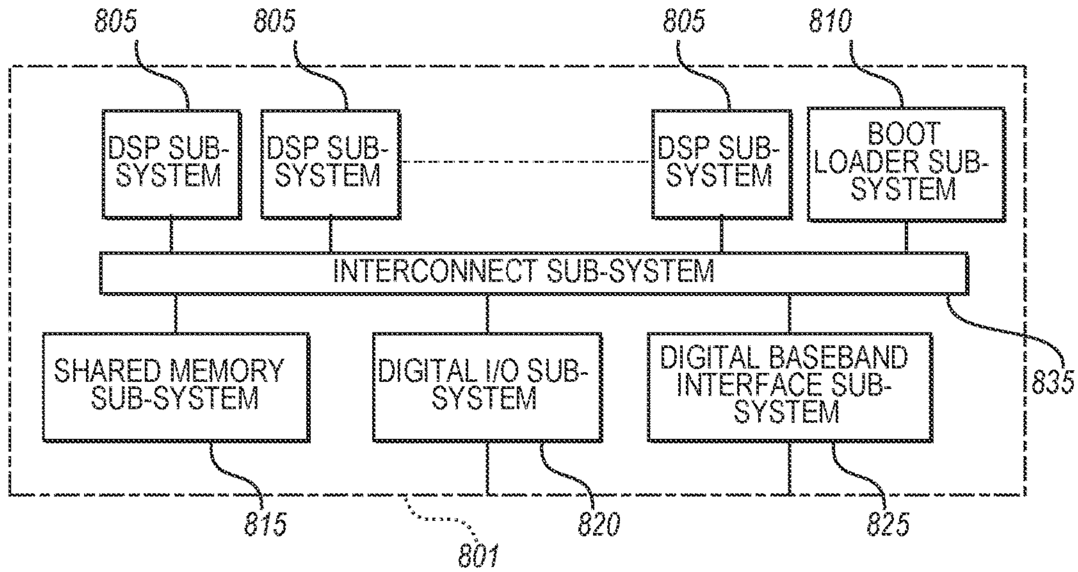
FIG. 8A illustrates an exemplary digital baseband subsystem, according to some aspects.
Figure 8B:
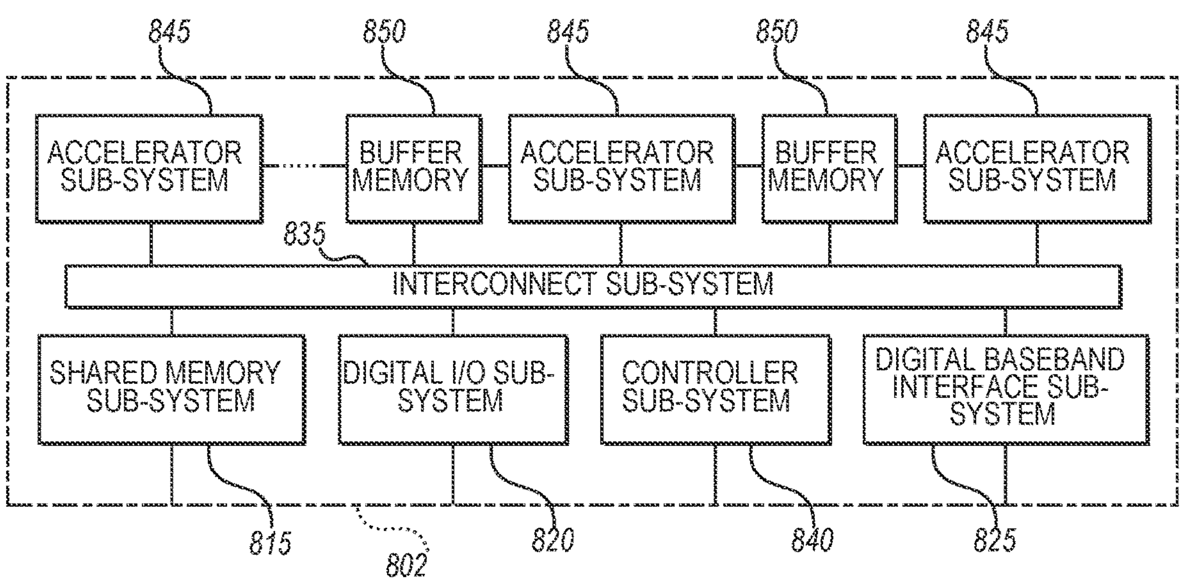
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit ($I^2C$), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
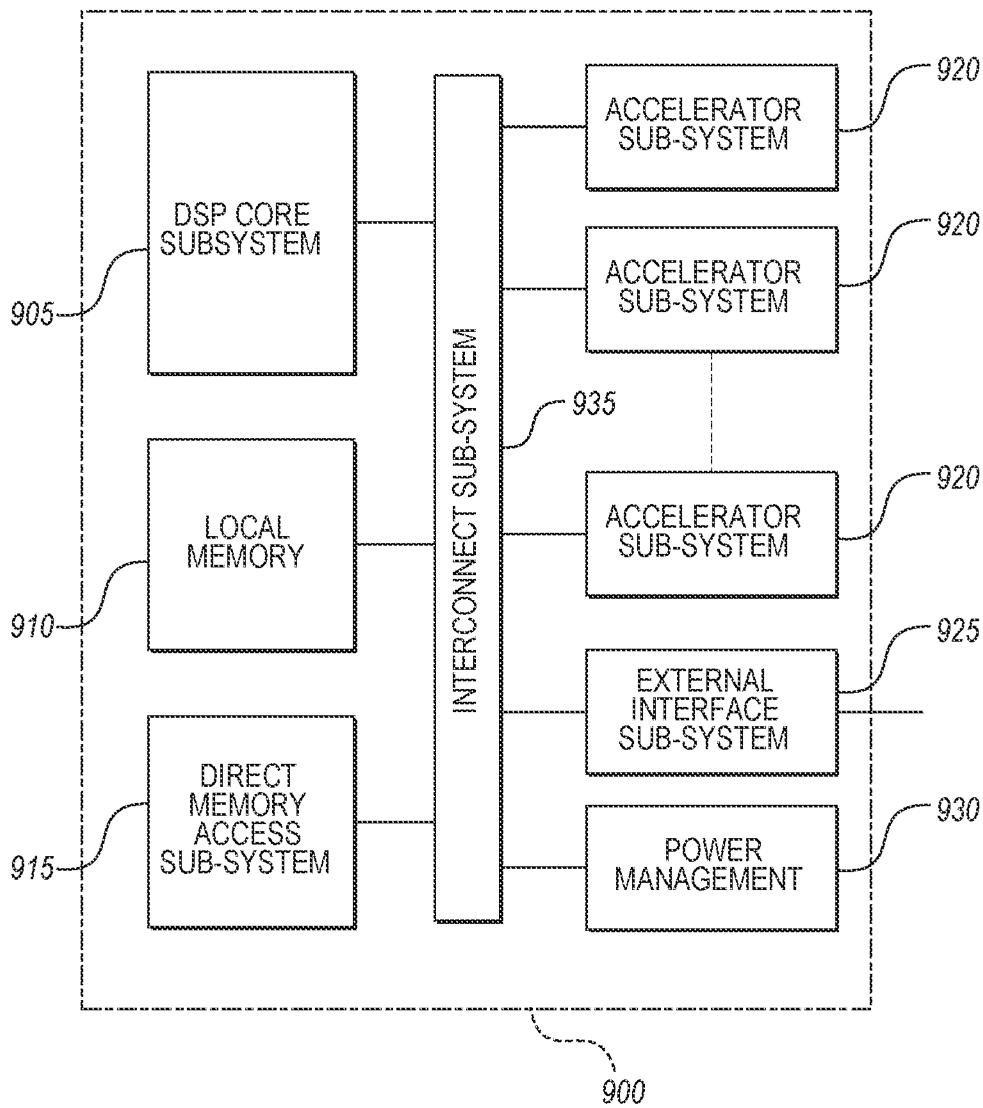
FIG. 9 illustrates an exemplary digital signal processor subsystem, according to some aspects.

FIG. 9 illustrates a digital signal processor (DSP) subsystem 900 according to some aspects.

In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Figure 10A:
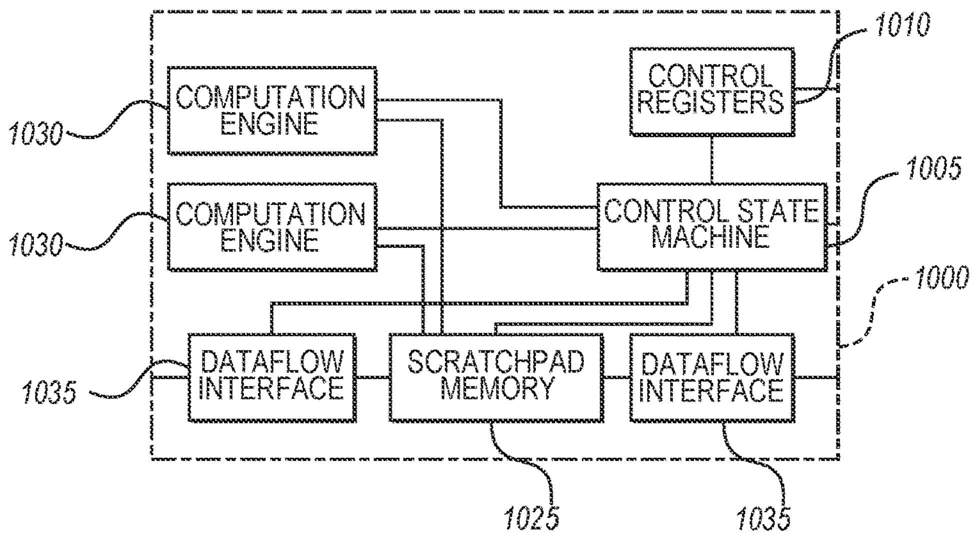
FIG. 10A illustrates an example of an accelerator subsystem, according to some aspects.
Figure 10B:
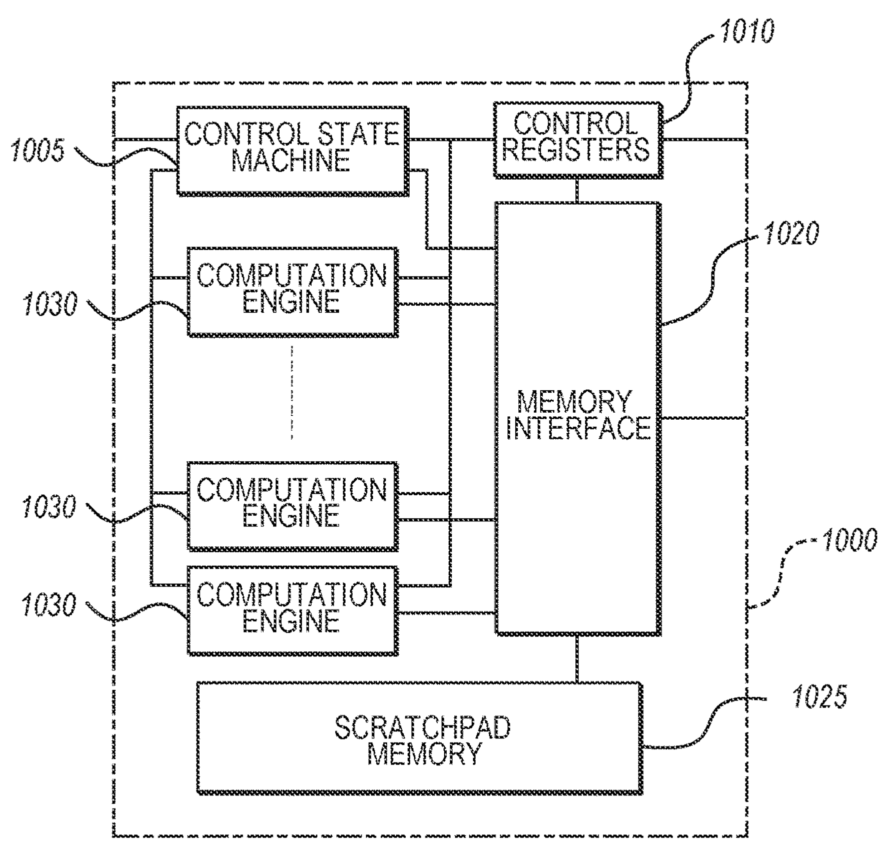
FIG. 10B illustrates an alternate exemplary accelerator subsystem, according to some aspects.

FIG. 10A illustrates an example of an accelerator subsystem 1000 according to some aspects. FIG. 10B illustrates an example of an accelerator subsystem 1000 according to some aspects.

In an aspect, accelerator subsystem 1000 may include one or more of each of control state machine 1005, control registers 1010, memory interface 1020, scratchpad memory 1025, computation engine 1030A . . . 1030N and dataflow interface 1035A, 1035B.

In an aspect, control registers 1010 may configure and control the operation of accelerator subsystem 1000, which may include one or more of: enabling or disabling operation by means of an enable register bit, halting an in-process operation by writing to a halt register bit, providing parameters to configure computation operations, providing memory address information to identify the location of one or more control and data structures, configuring the generation of interrupts, or other control functions.

In an aspect, control state machine 1005 may control the sequence of operation of accelerator subsystem 1000.

FIGS. 11A-11D illustrate frame formats, according to some aspects.

Figure 11A:
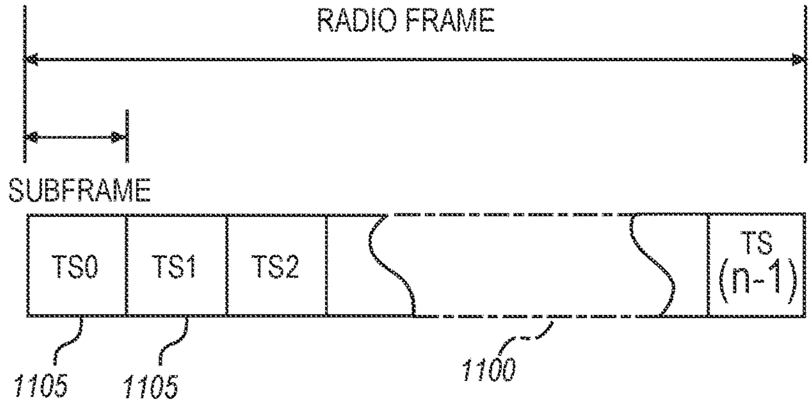
FIGS. 11A to 11E illustrate exemplary periodic radio frame structures, according to some aspects.

FIG. 11A illustrates a periodic radio frame structure 1100, according to some aspects. Radio frame structure 1100 has a predetermined duration and repeats in a periodic manner with a repetition interval equal to the predetermined duration. Radio frame structure 1100 is divided into two or more subframes 1105. In an aspect, subframes 1105 may be of predetermined duration which may be unequal. In an alternative aspect, subframes 1105 may be of a duration which is determined dynamically and varies between subsequent repetitions of radio frame structure 1100.

Figure 11B:
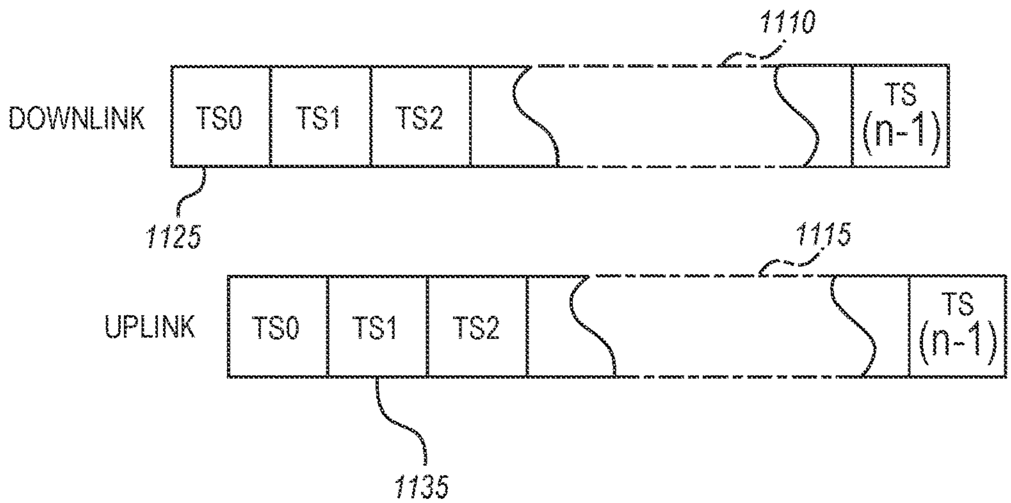
Figure 11C:
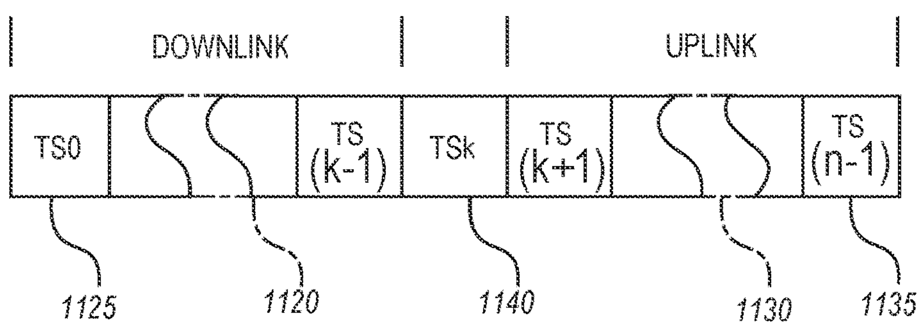

FIG. 11B illustrates a periodic radio frame structure using frequency division duplexing (FDD) according to some aspects. In an aspect of FDD, downlink radio frame structure 1110 is transmitted by a base station or infrastructure equipment to one or more mobile devices, and uplink radio frame structure 1115 is transmitted by a combination of one or more mobile devices to a base station.

Figure 11D:
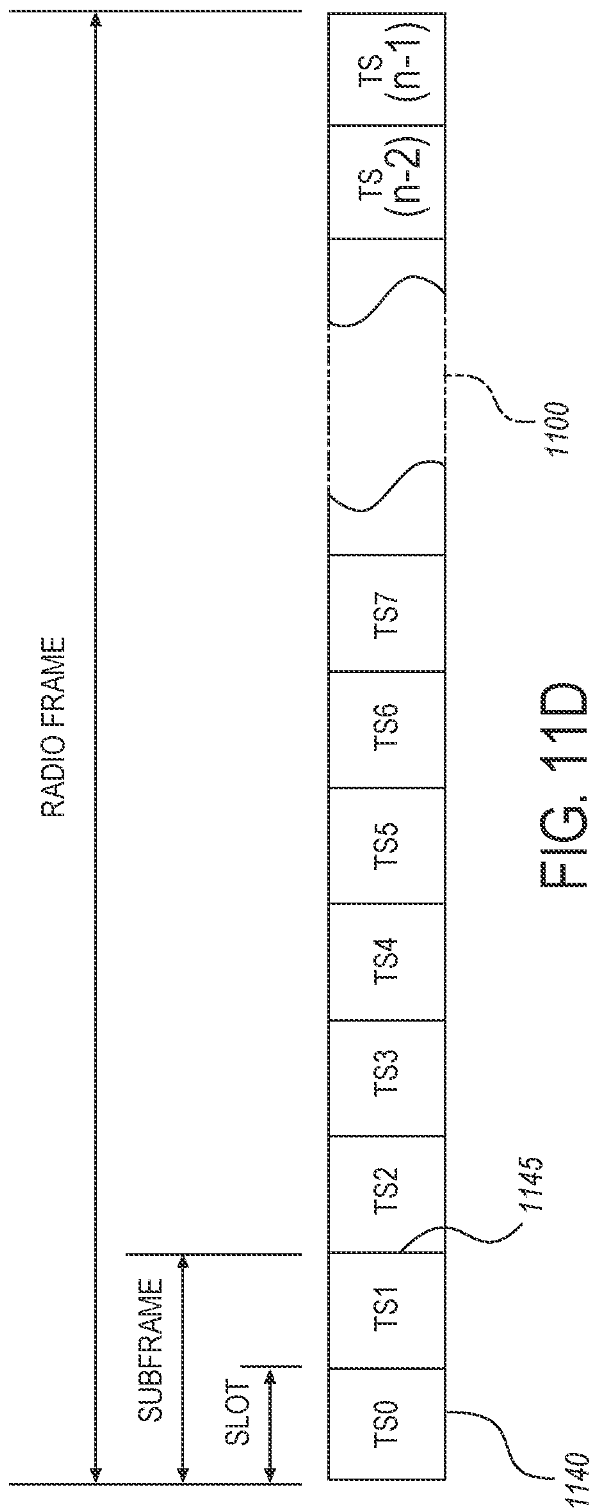

A further example of a radio frame structure that may be used in some aspects is shown in FIG. 11D. In this example, radio frame 1100 has a duration of 10 ms. Radio frame 1100 is divided into slots 1125, 1135 each of duration 0.1 ms, and numbered from 0 to 99. Additionally, each pair of adjacent slots 1125, 1135 numbered 2i and 2i+1, where i is an integer, is referred to as a subframe.

In some aspects, time intervals may be represented in units of $T_S$, where $T_S$ is defined as 1/(75,000×2048) seconds. In FIG. 11D, a radio frame is defined as having duration 1,536,600>$T_S$, and a slot is defined as having duration 15,366×$T_S$.

In some aspects using the radio frame format of FIG. 11D, each subframe may include a combination of one or more of downlink control information, downlink data information, uplink control information and/or uplink data information. The combination of information types and direction may be selected independently for each subframe.

Figure 11E:
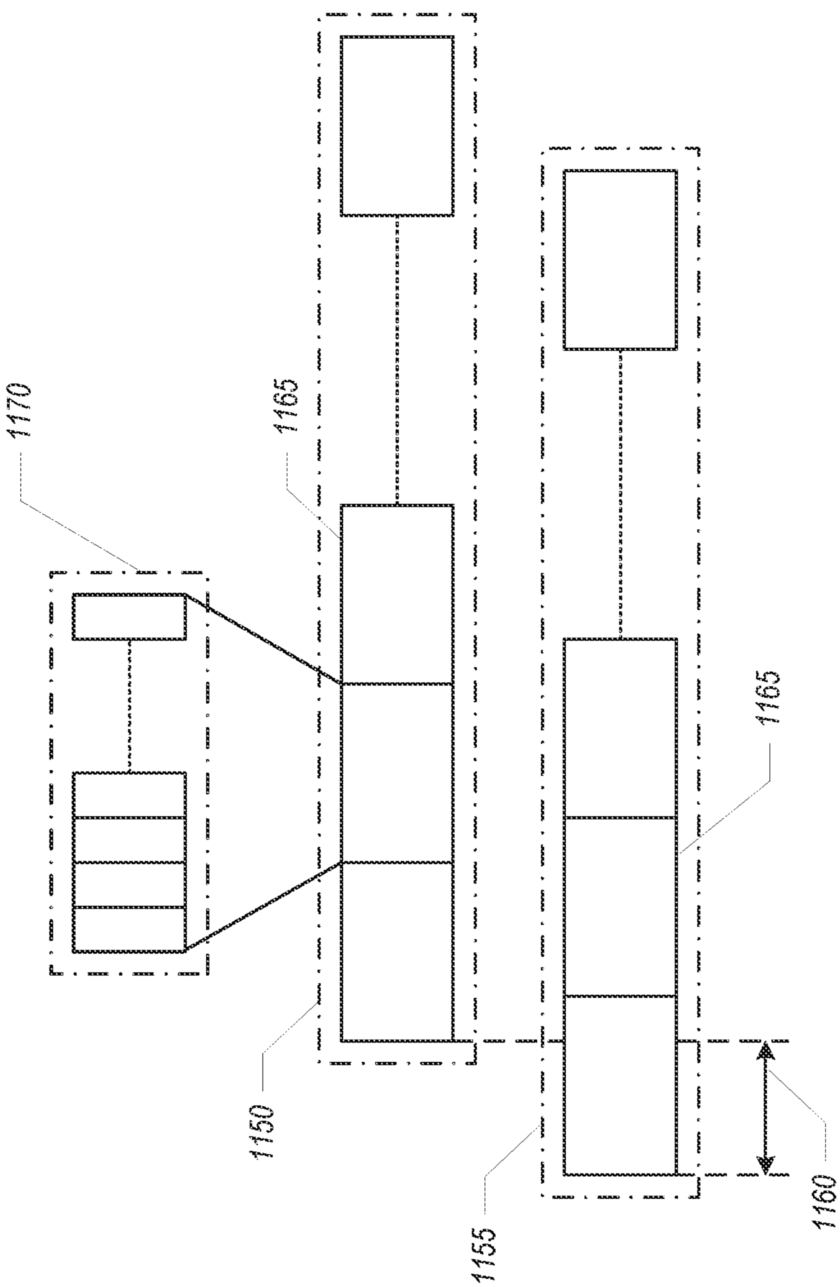

An example of a radio frame structure that may be used in some aspects is shown in FIG. 11E, illustrating downlink frame 1150 and uplink frame 1155. According to some aspects, downlink frame 1150 and uplink frame 1155 may have a duration of 10 ms, and uplink frame 1155 may be transmitted with a timing advance 1160 with respect to downlink frame 1150.

According to some aspects, downlink frame 1150 and uplink frame 1155 may each be divided into two or more subframes 1165, which may be 1 ms in duration. According to some aspects, each subframe 1165 may consist of one or more slots 1170.

In some aspects, according to the examples of FIG. 11D and FIG. 11E, time intervals may be represented in units of $T_S$.

According to some aspects of the example illustrated in FIG. 11D, $T_S$ may be defined as 1/(30,720×1000) seconds. According to some aspects of FIG. 11D, a radio frame may be defined as having duration 30,720.Ts, and a slot may be defined as having duration 15,360.Ts.

According to some aspects of the example illustrated in FIG. 11E, $T_S$ may be defined as Ts=1/(Δfmax. Nf), where □fmax=480×103 and Nf=4,096.

According to some aspects of the example illustrated in FIG. 11E, the number of slots may be determined based on a numerology parameter, which may be related to a frequency spacing between subcarriers of a multicarrier signal used for transmission.

Figure 12A:
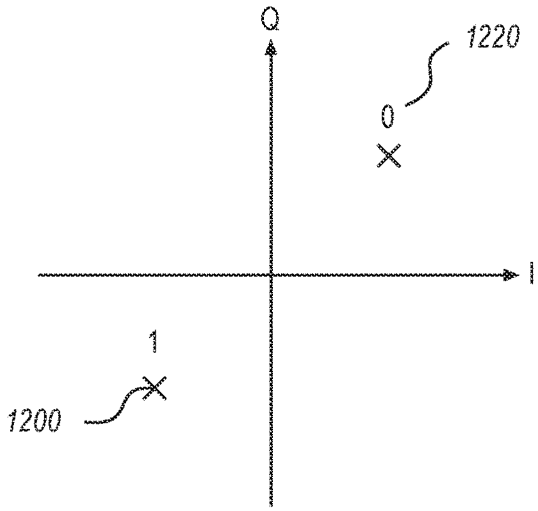
FIGS. 12A to 12C illustrate examples of constellation designs of a single carrier modulation scheme that may be transmitted or received, according to some aspects.
Figure 12B:
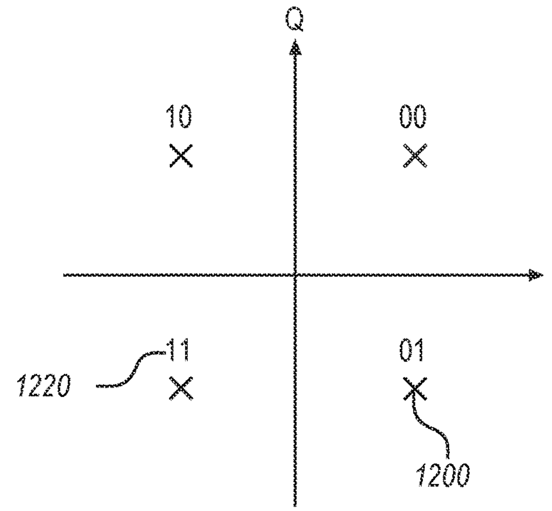
Figure 12C:
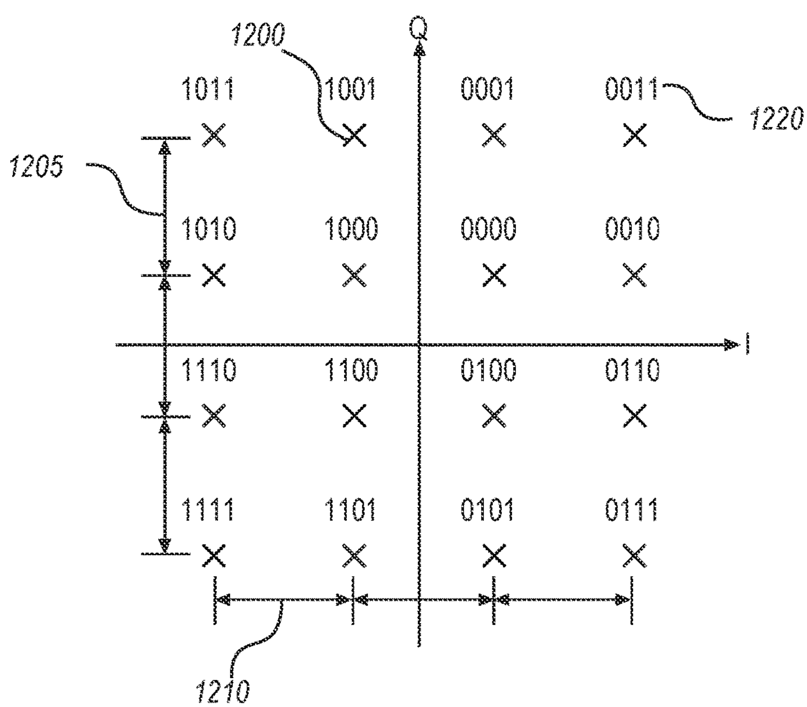

FIGS. 12A to 12C illustrate examples of constellation designs of a single carrier modulation scheme that may be transmitted or received according to some aspects. Constellation points 1200 are shown on orthogonal in-phase and quadrature axes, representing, respectively, amplitudes of sinusoids at the carrier frequency and separated in phase from one another by 90 degrees.

FIG. 12A represents a constellation including two points 1200, known as binary phase shift keying (BPSK). FIG. 12B represents a constellation including four points 1200, known as quadrature phase shift keying (QPSK). FIG. 12C represents a constellation including 16 points 1200, known as quadrature amplitude modulation (QAM) with 16 points (16QAM or QAM16). Higher order modulation constellations, comprising for example 64, 256 or 1024, points may be similarly constructed.

In the constellations depicted in FIGS. 12A-12C, binary codes 1220 are assigned to the points 1200 of the constellation using a scheme such that nearest-neighbor points 1200, that is, pairs of points 1200 separated from each other by the minimum Euclidian distance, have an assigned binary code 1220 differing by only one binary digit. For example, in FIG. 12C the point assigned code 1000 has nearest neighbor points assigned codes 1001, 0000, 1100 and 1010, each of which differs from 1000 by only one bit.

Figure 13A:
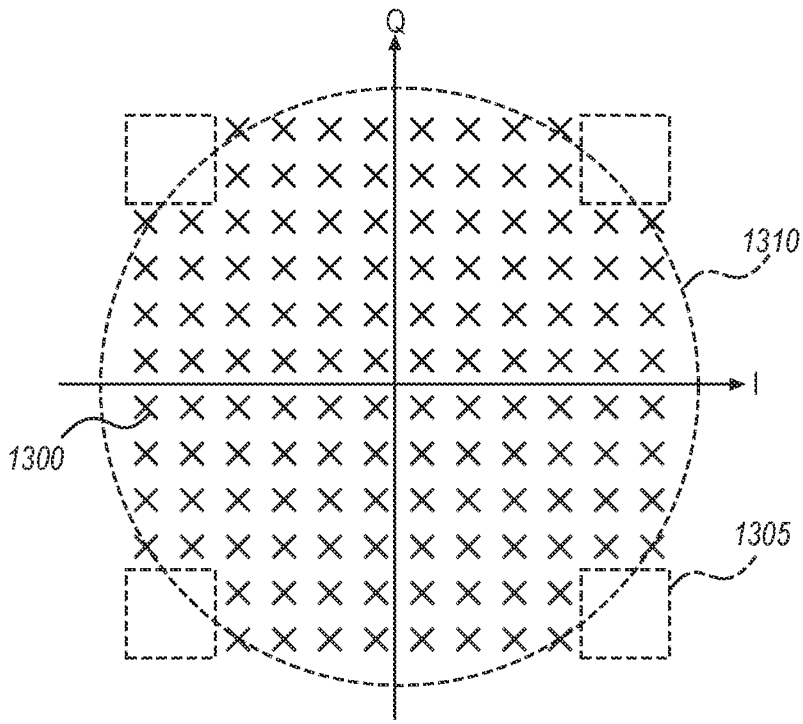
FIGS. 13A and 13B illustrate alternate exemplary constellation designs of a single carrier modulation scheme that may be transmitted and received, according to some aspects.
Figure 13B:
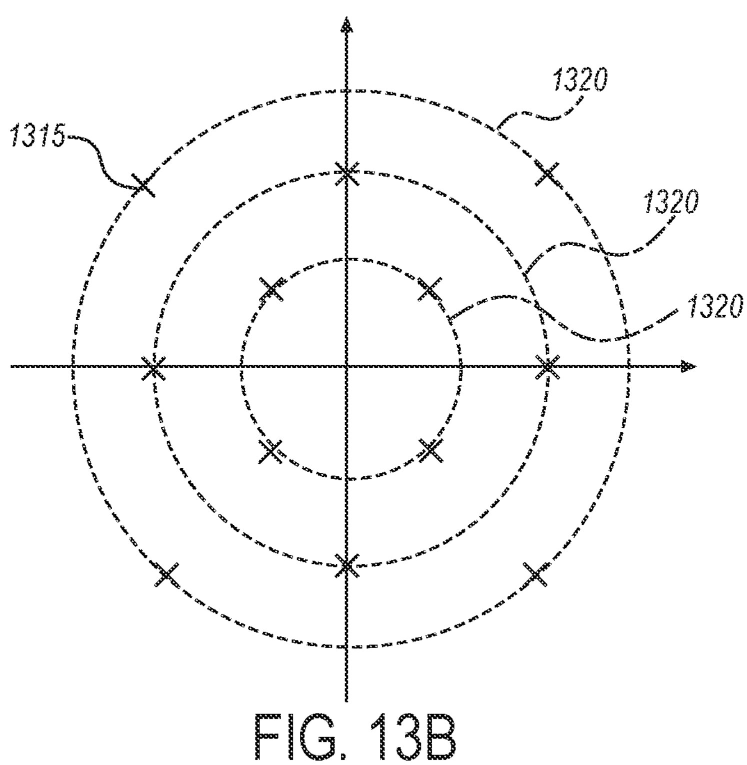

FIGS. 13A and 13B illustrate examples of alternate constellation designs of a single carrier modulation scheme that may be transmitted and received, according to some aspects. Constellation points 1300 and 1315 of FIG. 13A are shown on orthogonal in-phase and quadrature axes, representing, respectively, amplitudes of sinusoids at the carrier frequency and separated in phase from one another by 90 degrees.

In an aspect, the constellation points 1300 of the example illustrated in FIG. 13A may be arranged in a square grid, and may be arranged such that there is an equal distance on the in-phase and quadrature plane between each pair of nearest-neighbor constellation points. In an aspect, the constellation points 1300 may be chosen such that there is a pre-determined maximum distance from the origin of the in-phase and quadrature plane of any of the allowed constellation points, the maximum distance represented by a circle 1310. In an aspect, the set of allowed constellation points may exclude those that would fall within square regions 1305 at the corners of a square grid.

Constellation points 1300 and 1315 of FIG. 13B are shown on orthogonal in-phase and quadrature axes, representing, respectively, amplitudes of sinusoids at the carrier frequency and separated in phase from one another by 90 degrees. In an aspect, constellation points 1315 are grouped into two or more sets of constellation points, the points of each set arranged to have an equal distance to the origin of the in-phase and quadrature plane, and lying on one of a set of circles 1320 centered on the origin.

Figure 14:
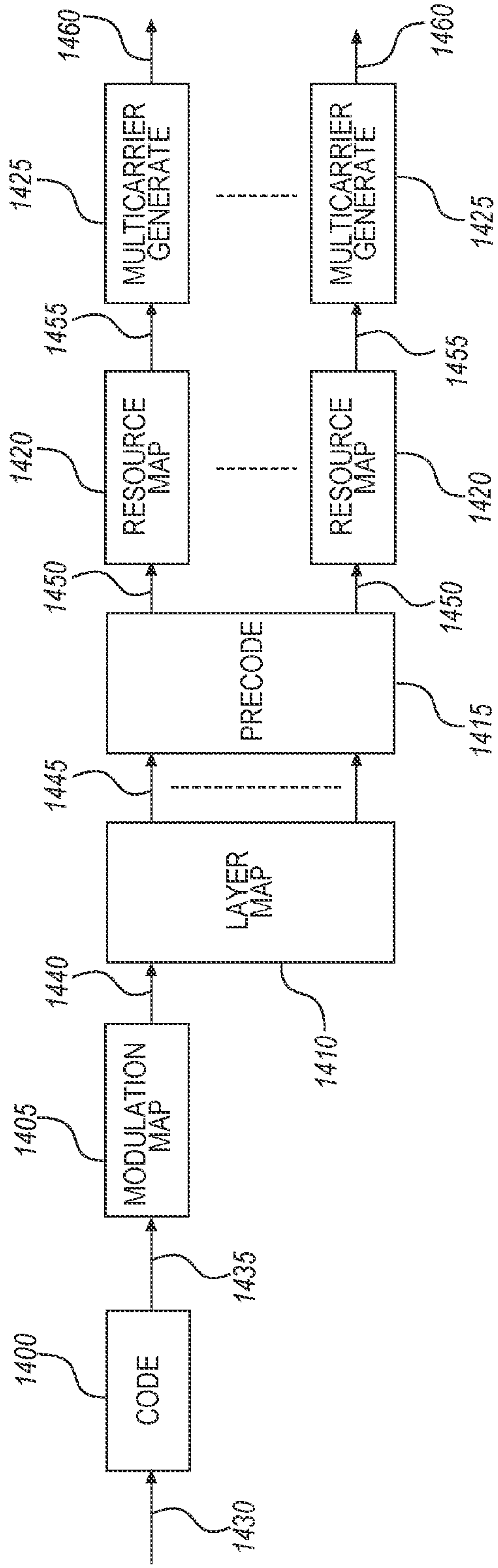
FIG. 14 illustrates an exemplary system for generating multicarrier baseband signals for transmission, according to some aspects.

FIG. 14 illustrates an example of a system for generating multicarrier baseband signals for transmission according to some aspects. In the aspect, data 1430 may be input to an encoder 1400 to generate encoded data 1435. Encoder 1400 may perform a combination of one or more of error detecting, error correcting, rate matching, and interleaving. Encoder 1400 may further perform a step of scrambling.

In an aspect, encoded data 1435 may be input to a modulation mapper 1405 to generate complex-valued modulation symbols 1440. Modulation mapper 1405 may map groups including one or more binary digits, selected from encoded data 1435, to complex valued modulation symbols according to one or more mapping tables.

In an aspect, complex-valued modulation symbols 1440 may be input to layer mapper 1410 to be mapped to one or more layer mapped modulation symbol streams 1445. Representing a stream of complex-valued modulation symbols 1440 as d(i) where i represents a sequence number index, and the one or more streams 1445 of layer mapped symbols as $x^{(k)}(i)$ where k represents a stream number index and i represents a sequence number index, the layer mapping function for a single layer may be expressed as:

$$x^{(0)}(i)=d(i)$$

and the layer mapping for two layers may be expressed as:

$$x^{(0)}(i)=d(2i)$$

$$x^{(1)}(i)=d(2i+1)$$

Layer mapping may be similarly represented for more than two layers.

In an aspect, one or more streams of layer mapped modulation symbol streams 1445 may be input to precoder 1415, which generates one or more streams of precoded symbols 1450. Representing the one or more streams 1445 of layer mapped symbols as a block of vectors:

$$[x^{(0)}(i) \ldots x^{(u-1)}(i)]^T$$

where i represents a sequence number index in the range 0 to $M_{symb}^{layer}-1$ the output is represented as a block of vectors:

$$[Z^{(0)}(i) \ldots z^{(P-1)}(i)]^T$$

where i represents a sequence number index in the range 0 to $M_{symb}^{ap}-1$.

The precoding operation may be configured to include one of direct mapping using a single antenna port, transmit diversity using space-time block coding, or spatial multiplexing.

In an aspect, each stream of precoded symbols 1450 may be input to a resource mapper 1420, which generates a stream of resource mapped symbols 1455.

The resource mapper 1420 may map precoded symbols to frequency domain subcarriers and time domain symbols according to a mapping which may include contiguous block mapping, randomized mapping or sparse mapping according to a mapping code.

In an aspect, resource mapped symbols 1455 may be input to multicarrier generator 1425 which generates time domain baseband symbol 1460. Multicarrier generator 1425 may generate time domain symbols using, for example, an inverse discrete Fourier transform (DFT), commonly implemented as an inverse fast Fourier transform (FFT) or a filter bank including one or more filters. In an aspect, where resource mapped symbols 1455 are represented as $s_k(i)$, where k is a subcarrier index and i is a symbol number index, a time domain complex baseband symbol x(t) may be represented as $x(t)=\Sigma_k S_k(i)p_T(t-T_{Sym})\exp[j2\pi f_k(t-T_{sym}-\tau_k)]$, where $p_T(t)$ is a prototype filter function, $T_{Sym}$ is the start time of the symbol period, $\square_k$ is a subcarrier dependent time offset, and $f_k$ is the frequency of subcarrier k.

Prototype functions $p_T(t)$ may be, for example, rectangular time domain pulses, Gaussian time domain pulses or any other suitable function.

In some aspects, a sub-component of a transmitted signal including a subcarrier in the frequency domain and a symbol interval in the time domain may be termed a resource element.

Figure 15:
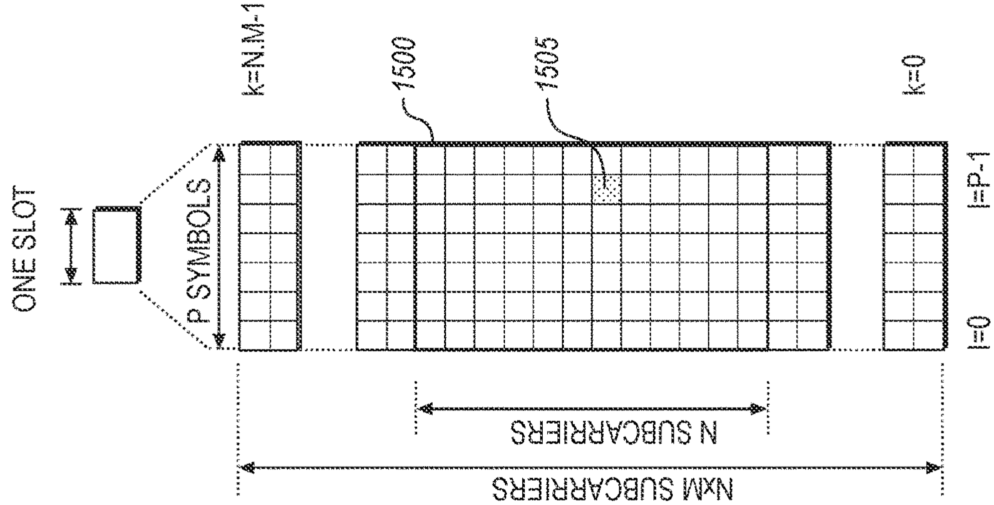
FIG. 15 illustrates exemplary resource elements depicted in a grid form, according to some aspects.

FIG. 15 illustrates resource elements 1505 depicted in a grid form, according to some aspects. In some aspects, resource elements may be grouped into rectangular blocks including a plurality of subcarriers (e.g., 12 subcarriers) in the frequency domain and the number, P, of symbols contained in one slot in the time domain. The number P may be 6, 7, or any other suitable number of symbols. In the depiction of FIG. 15, each resource element 1505 within resource block 1500 can be indexed as (k, I) where k is the index number of subcarrier, in the range 0 to N×M−1, where N is the number of subcarriers in a resource block, and M is the number of resource blocks.

Figure 16A:
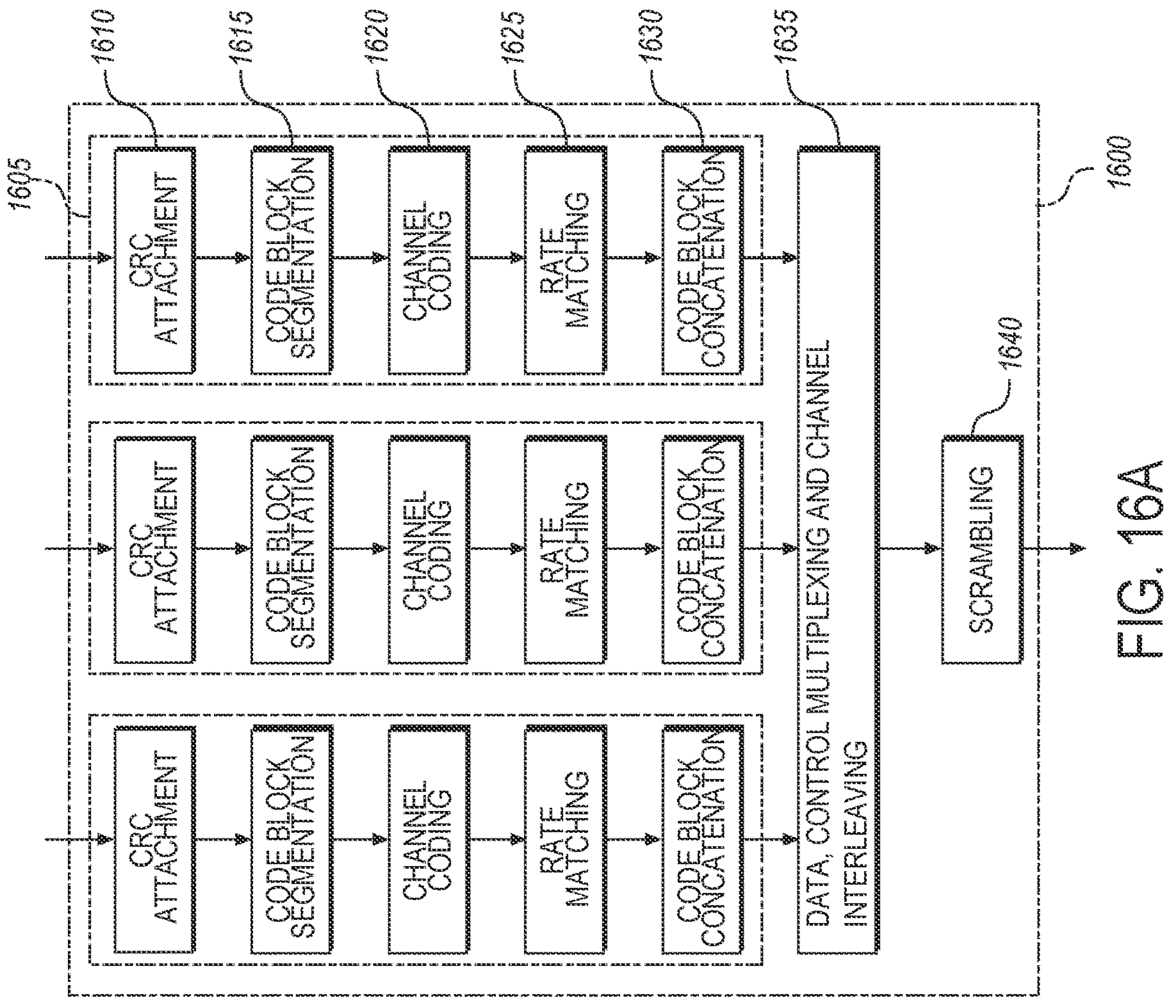
FIG. 16A, FIG. 16B, FIG. 16C, and FIG. 16D illustrate example of coding, according to some aspects.

FIG. 16A, FIG. 16B, FIG. 16C, and FIG. 16D illustrate example of coding, according to some aspects. FIG. 16A illustrates an example of coding process 1600 that may be used in some aspects. Coding process 1600 may include one or more physical coding processes 1605 that may be used to provide coding for a physical channel that may encode data or control information. Coding process 1600 may also include multiplexing and interleaving 1635 that generates combined coded information by combining information from one or more sources, which may include one of more of data information and control information, and which may have been encoded by one or more physical coding processes 1605. Combined coded information may be input to scrambler 1640 which may generate scrambled coded information.

Physical coding process 1605 may include one or more of CRC attachment block 1610, code block segmentation 1615, channel coding 1620, rate matching 1625, and code block concatenation 1630. CRC attachment block 1610 may calculate parity bits denoted $\{p_0,p_1, \ldots, P_{L-1}\}$ from input bits denoted $\{a_0,a_1, \ldots, a_{A-1}\}$ to generate a sequence of output bits $\{b_0,b_1, \ldots, b_{A+L-1}\}$, such that the polynomial over the finite field GF(2) in the variable D using the output sequence bits as coefficients (i.e., polynomial $b_0D^{A+L-1}+b_1 D^{A+L-2}+ \ldots +b_{A+L-2}D^1+b_{A+L-1}$), has a predetermined remainder when divided by a predetermined generator polynomial g(D) of order L. In an aspect, the predetermined remainder may be zero, L may be 24 and the predetermined polynomial g(D) may be $D^{24}+D^{23}+D^{18}+D^{17}+D^{14}+D^{11}+D^{10}+D^7+D^6+D^5+D^4+D^3+D+1$.

In some aspects, the process of code block segmentation 1615 may generate one or more segmented code blocks, each including a portion of the data input to code segmentation 1615. Code block segmentation 1615 may have minimum and maximum block size constraints as parameters, determined according to a selected channel coding scheme. Code block segmentation 1615 may add filler bits to one or more output segmented code blocks, in order to ensure that the minimum block size constraint is met. Code block segmentation 1615 may divide data input to the process into blocks in order to ensure that the maximum block size constraint is met. In some aspects, code block segmentation 1615 may append parity bits to each segmented code block. Such appending of parity bits may be determined based on one or more of the selected coding scheme and whether the number of segmented code blocks to be generated is greater than one.

In some aspects, the process of channel coding 1620 may generate code words from segmented code blocks according to one or more of a number of coding schemes. As an example, channel coding 1620 may make use of one or more of convolutional coding, tail biting convolutional coding, parallel concatenated convolutional coding and polar coding.

Figure 16B:
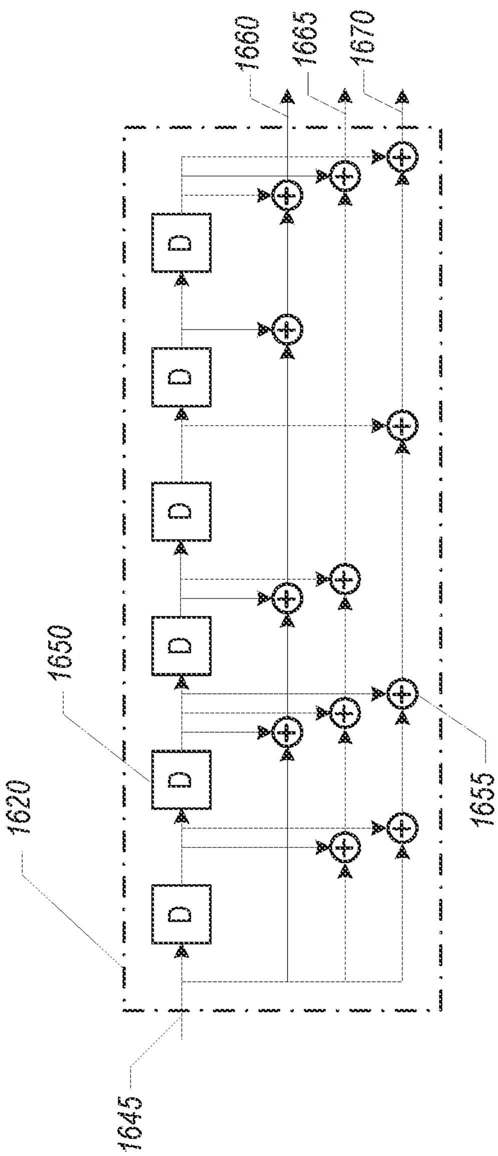

An encoder 1620 that may be used to encode data according to one of a convolutional code and a tail-biting convolutional code according to some aspects is illustrated in FIG. 16B.

According to some aspects, input data 1645 may be successively delayed by each of two or more delay elements 1650, generating a data word consisting of elements that include the current input data and two or more copies of the current input data, each copy delayed respectively by a different number of time units. According to some aspects, encoder 1620 may generate one or more outputs 1660, 1665 and 1670, each generated by calculating a linear combination of the elements of a data word generated by combining input data 1645 and the outputs of two or more delay elements 1650.

According to some aspects, the input data may be binary data and the linear combination may be calculated using one or more exclusive or functions 1655. According to some aspects, encoder 1620 may be implemented using software running on a processor and delay elements 1650 may be implemented by storing input data 1645 in a memory.

According to some aspects, a convolutional code may be generated by using convolutional encoder 1620 and initializing delay elements 1650 to a predetermined value, which may be all zeros or any other suitable value. According to some aspects, a tail-biting convolutional code may be generated by using convolutional encoder 1620 and initializing delay elements 1650 to the last N bits of a block of data, where N is the number of delay elements 1650.

Figure 16C:
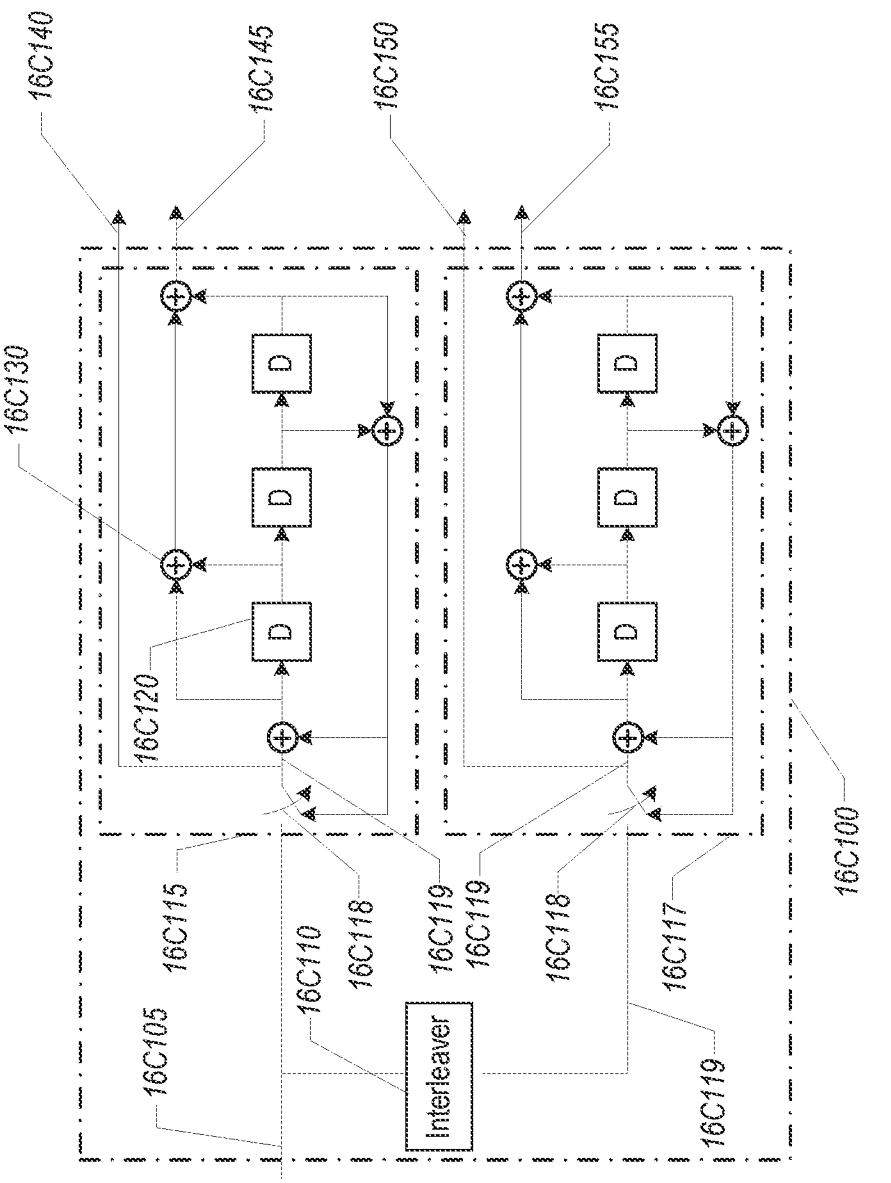

An encoder 16C100 that may be used to encode data according to a parallel concatenated convolutional code (PCCC) that may be referred to as a turbo code, according to some aspects is illustrated in FIG. 16C.

According to some aspects, encoder 16C100 may include an interleaver 16C110, upper constituent encoder 16C115 and lower constituent encoder 16C117. According to some aspects, upper constituent encoder 16C115 may generate one or more encoded data streams 16C140 and 16C145 from input data 16C105. According to some aspects, interleaver 16C110 may generate interleaved input data 16C119 from input data 16C105. According to some aspects, lower constituent encoder 16C117 may generate one or more encoded data streams 16C150 and 16C155 from interleaved input data 16C105.

According to some aspects, interleaver 16C110 may output interleaved output data 16C119 that has a one to one relationship with the data contained in input data 16C105, but with the data arranged in a different time order. According to some aspects, interleaver 16C110 may be a block interleaver, taking as input one or more blocks of input data 16C105, which may be represented as $\{c_0, c_1, \ldots c_{K-1}\}$, where each ci is an input data bit and K is the number of bits in each block, and generating an output corresponding to each of the one or more such input blocks, which may be represented as $\{c_{\Pi(1)}, c_{\Pi(2)}, \ldots, c_{\Pi(K-1)}\}$. $\Pi(i)$ is a permutation function, which may be of a quadratic form and which may be represented by $\Pi(i)=(f_1 i+f_2 i^2) \bmod K$, where f1 and f2 are constants that may be dependent on the value of the block size K.

According to some aspects, each of upper constituent encoder 16C115 and lower constituent encoder 16C117 may include input bit selector 16C118 which may generate a selected input bit stream 16C119 that may be selected from one of an encoder input bit stream during a data encoding phase and a linear combination of stored bits during a trellis termination phase. According to some aspects, each of upper constituent encoder 16C115 and lower constituent encoder 16C117 may store bits in two or more delay elements 16C120 arranged to function as a shift register, the input to the shift register consisting of a linear combination of a bit from a selected input bit stream 16C119 and previously stored bits, the stored bits being initialized to a predetermined value prior to an encoding phase, and having a predetermined value at the end of a trellis termination phase. According to some aspects, each of upper constituent encoder 16C115 and lower constituent encoder 16C117 may generate one or more outputs 16C140 and 16C145, each of which may be one of a selected input bit stream 16C119 and a linear combination of stored bits.

According to some aspects, each of upper constituent encoder 16C115 and lower constituent encoder 16C117 may have a transfer function during an encoding phase that may be represented as $$H(z) = \left[1, \frac{1+z^{-1}+z^{-3}}{1+z^{-2}+z^{-3}}\right].$$

According to some aspects, encoder 16C100 may be implemented as software instructions running on a processor in combination with memory to store data input to interleaver 16C110 and stored bits of each of upper constituent encoder 16C115 and lower constituent encoder 16C117.

Figure 16D:
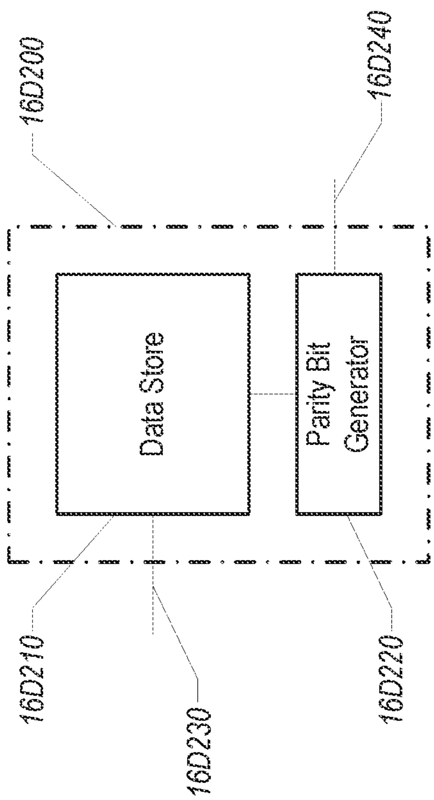

An encoder 16D200 that may be used to encode data bits according to a low density parity check (LDPC) code according to some aspects is illustrated in FIG. 16D.

According to some aspects, data bits 16D230 input to encoder 16D200 may be stored in data store 16D210, stored data bits may be input to parity bit generator 16D220 and encoded bits 16D240 may be output by parity bit generator 16D220.

According to some aspects, data bits input to LDPC encoder 16D200 may be represented as $c=\{c_0, c_1, \ldots, c_{K-1}\}$, encoded data bits 16D240 may be represented as $d=\{c_0, c_1, \ldots, c_{K-1}, p_0, p_1, \ldots, p_{D-K-1}\}$, and parity bits pi may be selected such that H. $d^T=0$, where H is a parity check matrix, K is the number of bits in the block to be encoded, D is the number of encoded bits and D-K is the number of parity check bits.

According to an aspect, parity check matrix H may be represented as:

$$H = \begin{bmatrix} P^{a_{0,0}} & P^{a_{0,1}} & P^{a_{0,2}} & & P^{a_{0,M-2}} & P^{a_{0,M-1}} \\ P^{a_{1,0}} & P^{a_{1,1}} & P^{a_{1,2}} & \ldots & P^{a_{1,M-2}} & P^{a_{1,M-1}} \\ P^{a_{2,0}} & P^{a_{2,1}} & P^{a_{2,2}} & & P^{a_{2,M-1}} & P^{a_{1,M-1}} \\ & \vdots & & \ddots & & \\ P^{a_{N-1,0}} & P^{a_{N-1,1}} & P^{a_{N-1,2}} & & P^{a_{N-1,M-2}} & P^{a_{N-1,M-1}} \end{bmatrix},$$

where $p^{\alpha i,j}$ is one of a zero matrix or a cyclic permutation matrix obtained from the Z×Z identity matrix by cyclically shifting the columns to the right by ai,j, Z is the size of the constituent permutation matrix, the number of encoded bits D is equal to ZM and the number of bits K in the block to be encoded is equal to ZN.

Digital polar transmitters (DTxs), whose inputs may be amplitude and phase, may be a promising architecture for integrated Complementary Metal—Oxide-Semiconductor (CMOS) radios used in devices communicating through the next generation systems as such devices offer, for example, the potential for higher efficiency and system-on-a-chip (SoC) integration. DTxs may use amplitude variation and phase variation of an output signal to provide data. However, DTxs, like other transmitters, have been restricted to lower frequencies (typically <6 GHz) due to challenges of implementing wideband phase modulators at the mmWave frequencies used in the next generation systems as well as implementing DTxs at mmWave speeds. The channel bandwidth for the next generation systems may be in the order of 100 MHz-GHz and employ one or both single carrier (SC) and Orthogonal frequency-division multiplexing (OFDM)-based modulations. This is to say that while a fundamental oscillation may be produced over the various channel frequencies, adjusting the amplitude and phase at the higher frequencies is a consideration.

Additionally, with the use of mmWave frequencies, the power efficiency of the DTxs may be substantially reduced at such frequencies due to the discrepancy in amplitude variation and corresponding peak power efficiency between mmWave frequency signals and lower frequency signals. OFDM may impose additional spectral limitations on the phase modulation signals produced by the DTxs. In order to meet the link budget with the higher propagation losses at the higher mmWave frequencies, such links may rely on phased arrays and multi-user Multiple Input Multiple Output (MIMO) in order to optimize the use of spatial channels across multiple users. In practical terms, the use of phased arrays may mean that multiple transmit and receive chains are used on each device, further increasing the transmission power used in addition to encountering the above power inefficiencies. Therefore, it could be useful to improve the DTx efficiency at mmWave frequencies.

In an aspect, to help ameliorate these issues, a wideband phase modulator architecture is provided that may be suitable for both single-carrier and OFDM based-mmWave DTxs. The wideband phase modulator architecture may contain multiple parallel transmission chains for phased arrays and MIMO/MU-MIMO. Phase modulators can incorporate phase shifts for implementing the phased array.

In an aspect, the DTx may use phase and amplitude extraction that supports low operator-sum representation (OSR) polar decomposition of wide bandwidth RF signals. A digital-to-time converter (DTC)-based phase modulator may be used that is clocked in the low-GHz frequency band for practical considerations (feasibility, timing margins, power dissipation etc.). Time interleaving may be used between multiple DTCs to increase the clock frequency to up to about 10 GHz. In addition, a sub-harmonic series injection into mmWave LC oscillators may be used to up-convert the modulation to RF frequencies.

RF communication systems often times utilize sub-systems (e.g., voltage controlled oscillators (VCOs), power amplifiers) that are formed on a semiconductor die. More specifically, various electronic elements (e.g., capacitors and inductors) of such sub-systems are printed on the semiconductor die. However, the resistance that is inherent with the silicon of the semiconductor die significantly reduces the quality (Q) factor (ratio of inductance divided by resistance) of the inductors printed on the die.

Figure 17:
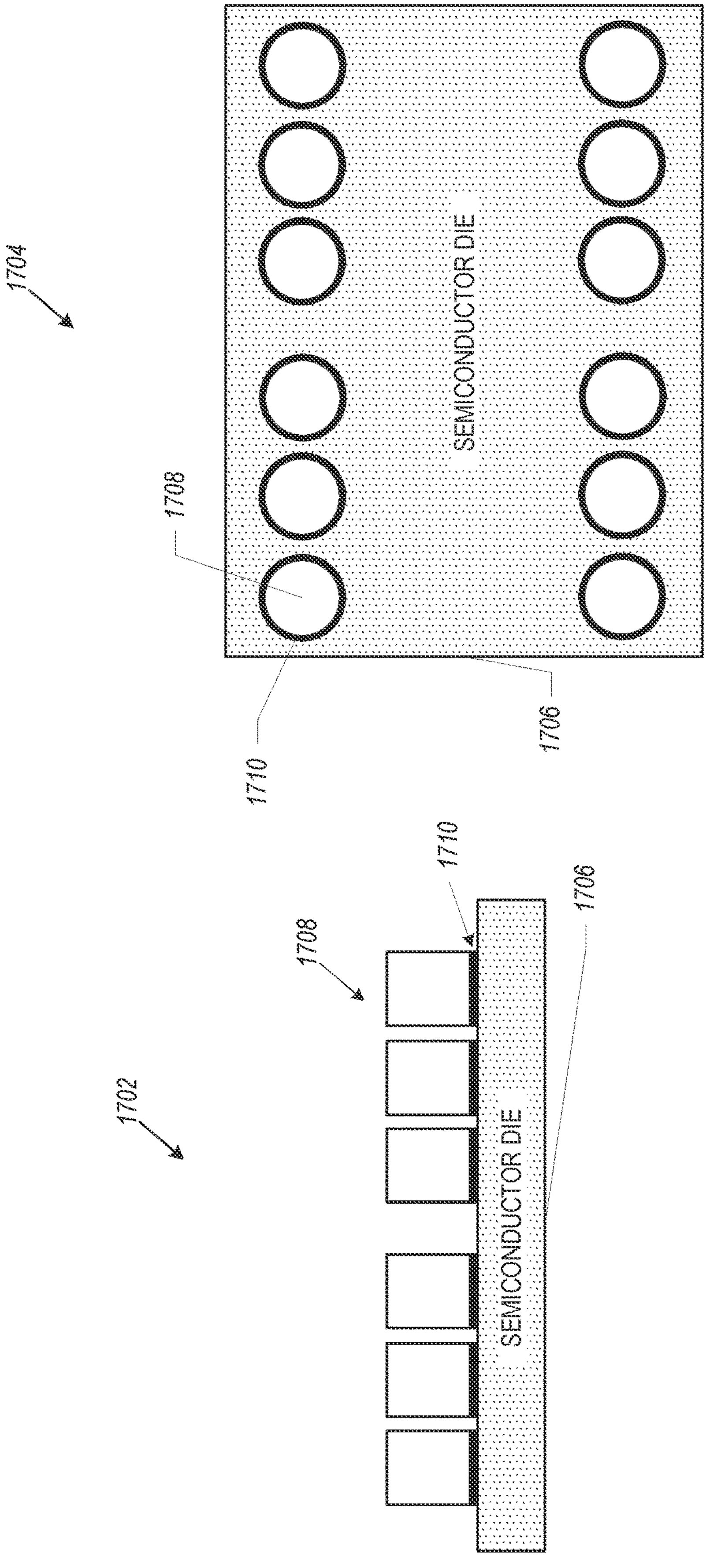
FIG. 17 is a cross-sectional view and a top view of an exemplary semiconductor die with metallic pillars according to some aspects.

FIG. 17 is a cross-sectional view 1702 and a top view 1704 of a semiconductor die with metallic pillars according to some aspects. Referring to FIG. 17, the semiconductor die 1706 includes a plurality of pillars 1708. The semiconductor die 1706 may be incorporated in the RF circuitry 325 of mmWave communication circuitry 300 shown in FIG. 3A, although the semiconductor die 1706 is not limited to such.

In an aspect, the pillars 1708 can be copper pillars, which can be used for RF connections to the die. More specifically, copper pillars can be used as metallic structures to connect semiconductor die 1706 to a semiconductor die packaging (not illustrated). In some aspects, other metallic structures can be used as pillars 1708, such as solder based bumps and balls. The copper pillars 1708 can be attached to the semiconductor die 106 via metalized contact pads (or contacts) 1710. In some aspects, the copper pillars 1708 can be created in one continuous etching process where the unwanted copper is etched away leaving only copper pillars 1708 attached to the die metalized contacts 1710.

Figure 18A:
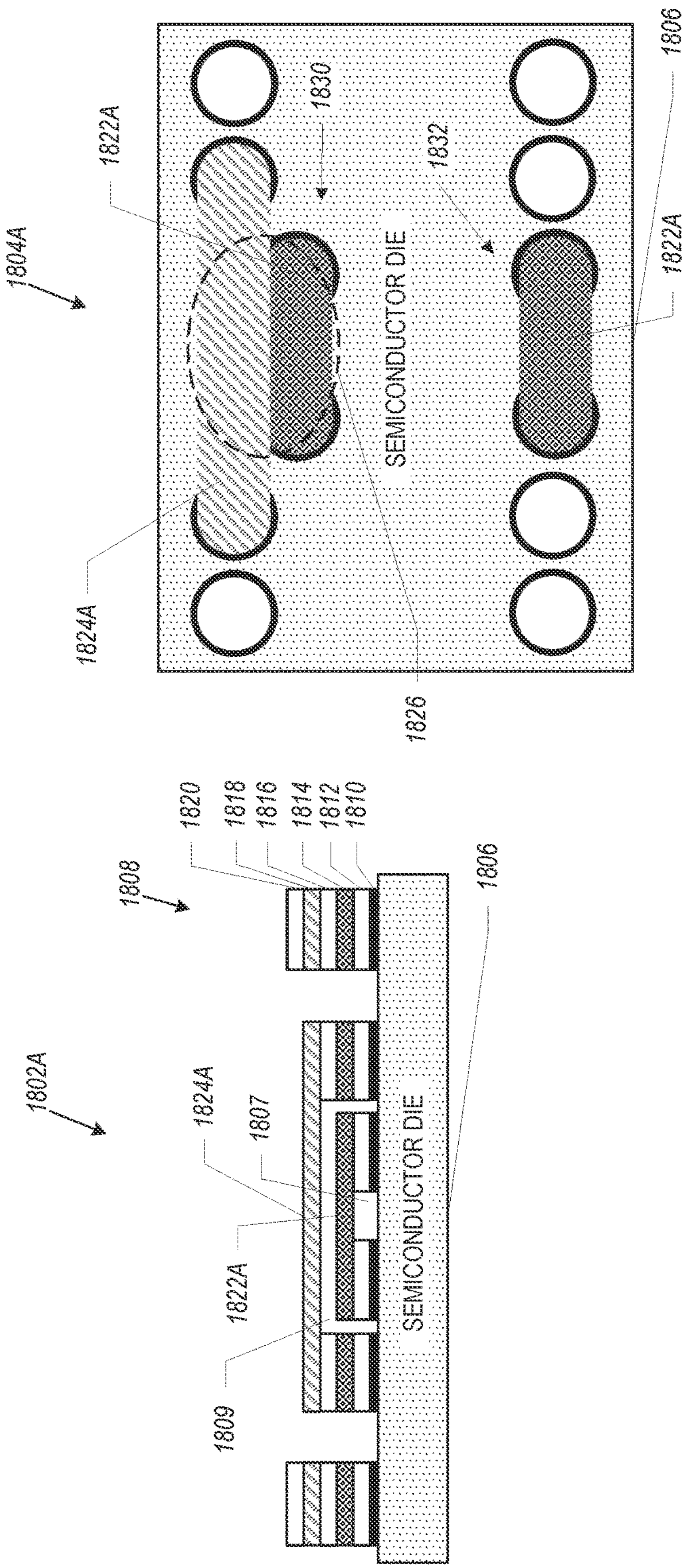
FIG. 18A is a cross-sectional view and a top view of an exemplary semiconductor die with metallic pillars forming a first type of interconnect structures according to some aspects.

FIG. 18A provides a cross-sectional view 1802A and a top view 1804A of a semiconductor die 1806 with metallic pillars 1808 forming a first type of interconnect structures according to some aspects. Referring to the cross-sectional view 1802A, metallic pillars 1808 can be formed in accordance with a multi-stage build up and etching process. More specifically, metallic pillars 1808 can be built up and etched in stages on die metallized contacts 1810, where a separate metallized layer is created during each build up and etching stage. As seen in FIG. 18A, during a first etching stage, a metallized layer 1812 is created. During an additional build up and etching stage, interconnect structures can be created between at least 2 of the pillars. For example, during an etching stage creating metallized layer 1814, an interconnect structure 1822A can be formed by the metallized material used for layer 1814. During such etching stage, the metallized material for layer 1814 is not etched between at least two of the pillars so that an interconnect structure is formed by the layer 1814 connecting the at least two pillars.

During a subsequent build up and etching stage, a metallized layer 1816 is disposed on top of layer 1814 (no metallized interconnect structures are associated with layer 1816). During a subsequent build up and etching stage creating metallized layer 1818, an interconnect structure 1824A can be formed by the metallized material used for layer 1818. During a final etching stage, a metallized layer 1820 is disposed on top of layer 1818, where no metallized interconnect structures are associated with layer 1820.

In some aspects, the interconnect structures 1822A and 1824A can serve as high quality (Q) factor inductive elements that are directly connected to the semiconductor die 1806 contacts and can serve RF circuitry that can benefit from such high-Q inductors. Example RF circuitry can include oscillators, power amplifiers, low noise amplifiers, and other circuitry, which can be partially or fully integrated within the semiconductor die 1806.

In some aspects, the interconnect structure 1822A can be located at position 1832, away and separate from the interconnect structure 1824A. In another example, the interconnect structure 1822A can be located side-by-side and/or partially overlapping, as seen at position 1830. In some aspects, selection of the interconnect structure to be at position 1830 or 1832 can be based on the resulting coupling and mutual inductance associated with interconnect structures 122A and 1824A. In this case, when the two interconnects are located side-by-side and/or partially overlapping, a coupling zone 1826 is created between the interconnect structures. Such coupling zone can be used in designing high-Q inductive elements implemented at least partially by the interconnect structures associated with the metallic pillars 1808.

In some aspects, lateral parallel coupling (e.g., 1826) can be achieved when the interconnect structures (e.g., 1824A and 1822A) are created using the same pillar layer (or etching stage), or the interconnect structures are created using different pillar layers.

In some aspects, more than two interconnect structures can be formed using one or more of the layers 1812 through 1820 associated with pillars 1808. Additionally, interconnect structures can be separated by air gaps as illustrated in FIG. 18A. More specifically, the interconnect structure 1822A is separated by an air gap 1807 from the semiconductor die 1806. The interconnect structure 1822A is also separated from the interconnect structure 1824A by another air gap 1809 formed within layer 1816.

In some aspects, an interconnect structure can be formed using the last layer 1820 of pillars 1808. In this regard, when an interconnect structure is disposed on the last layer 1820, interconnect structure will be in direct contact with the package laminate (which is illustrated as 1902 in FIG. 19) on which the die is attached, or the interconnect structures can be isolated from the laminate and can close a circuit directly on the die.

Figure 18B:
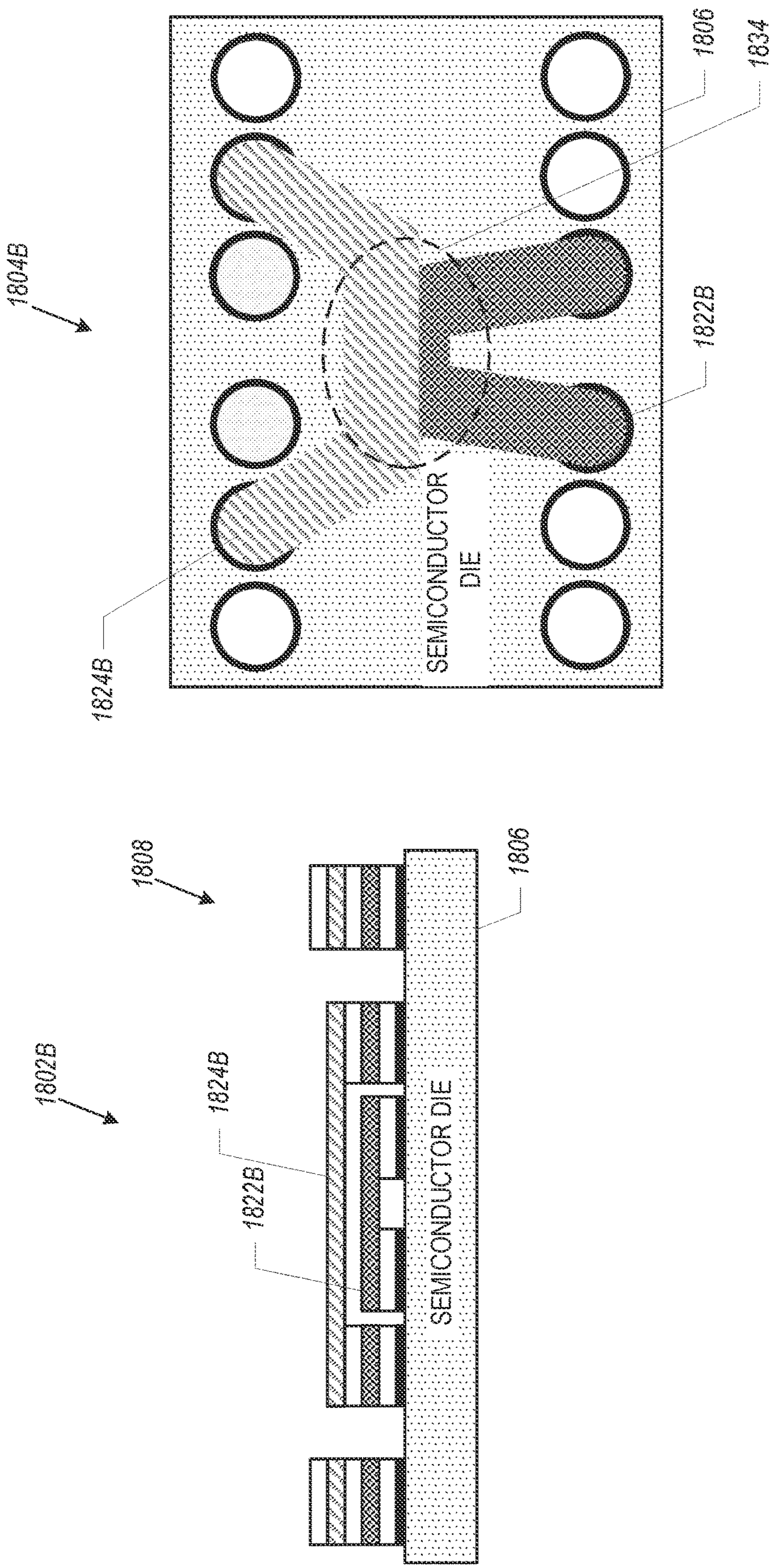
FIG. 18B is a cross-sectional view and a top view of an exemplary semiconductor die with metallic pillars forming a second type of interconnect structures according to some aspects.

FIG. 18B is a cross-sectional view 1802B and a top view 1804B of a semiconductor die 1806 with metallic pillars 1808 forming a second type of interconnect structures according to some aspects. The process of creating the metallized pillars illustrated in FIG. 18B can be the same as described in reference to FIG. 18A except the interconnect structures 1822B and 1824B can have different shapes and locations on the semiconductor die 1806, in comparison with interconnect structures 1822A and 1824A.

Referring to FIG. 18B, the interconnect structures 1822B and 1824B can form winding-like inductive elements, which can be used with various inductive implementations including transformer implementations. In some aspects, interconnect structures 1824B and 1822B can be elements within a primary and/or a secondary winding of a transformer. Additionally, the interconnect structures 1822B and 1824B can partially or completely overlap so that a coupling zone 1834 is created.

Figure 18C:
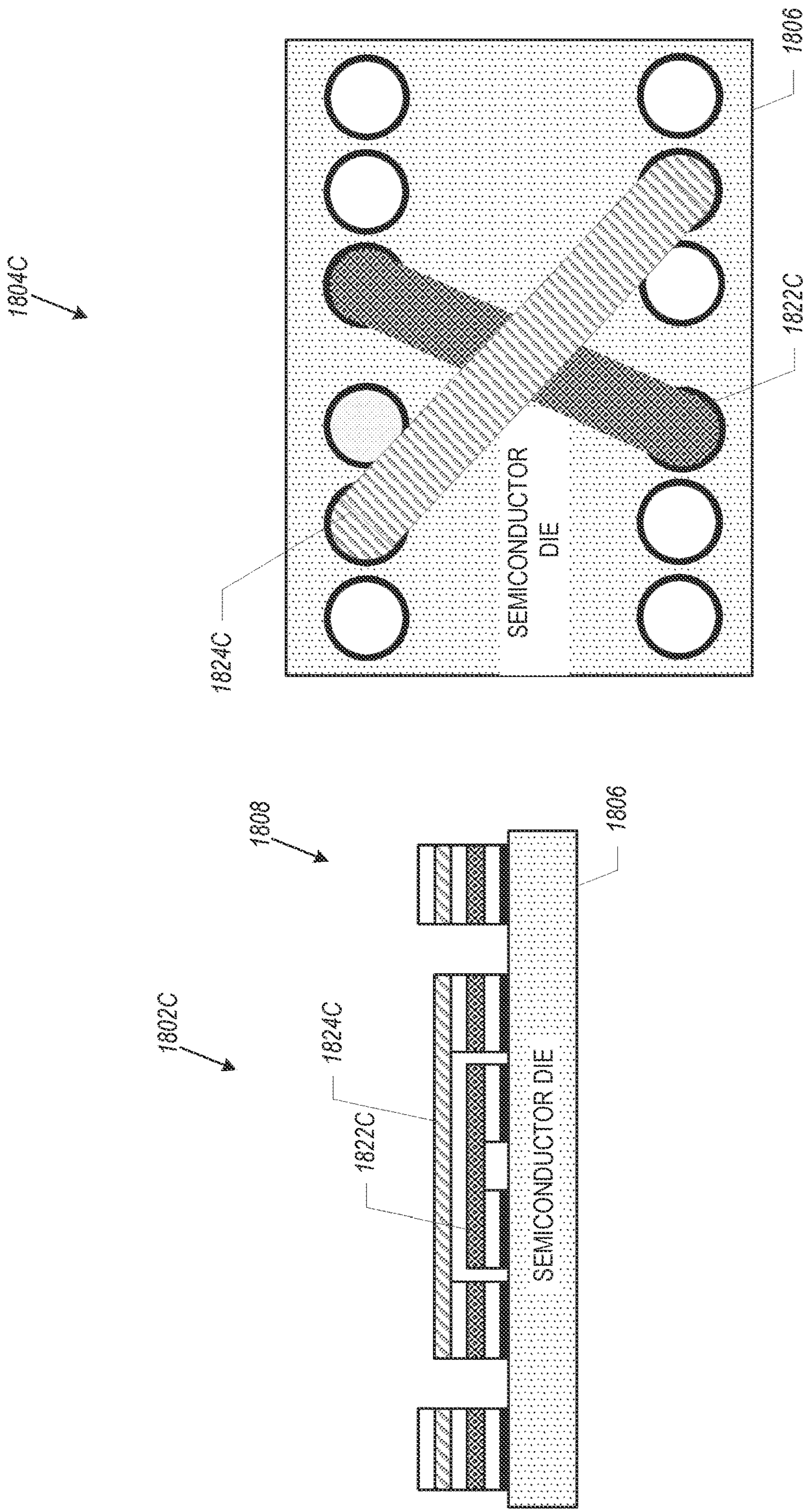
FIG. 18C is a cross-sectional view and a top view of an exemplary semiconductor die with metallic pillars forming a third type of interconnect structures according to some aspects.

FIG. 18C is a cross-sectional view 1802C and a top view 1804C of a semiconductor die 1806 with metallic pillars forming a third type of interconnect structures 1822C and 1824C according to some aspects. More specifically, the interconnect structures 1822C and 1824C can be disposed on the same layers 1814 and 1818 respectively as illustrated in FIG. 18A. However, the interconnect structures 1822C and 1824C can cross over each other.

Figure 19:
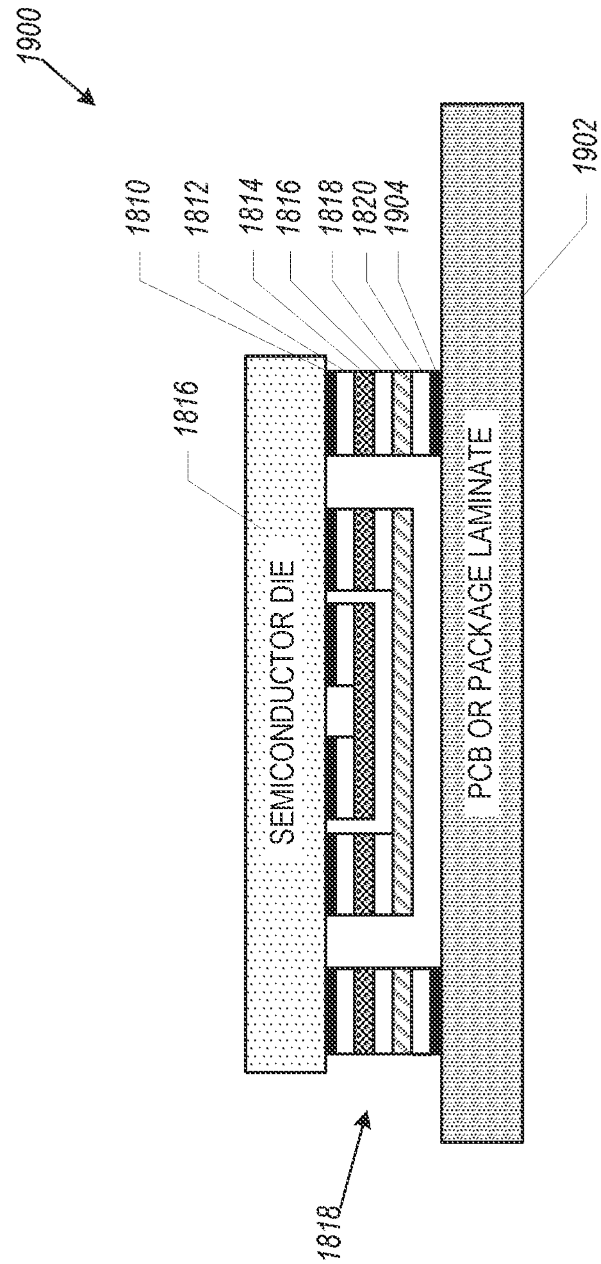
FIG. 19 is a cross-sectional view of an exemplary semiconductor die with metallic pillars forming interconnect structures where the pillars are attached to a package laminate according to some aspects.

FIG. 19 is a cross-sectional view 1900 of a semiconductor die with metallic pillars forming interconnect structures where the pillars are attached to a package laminate according to some aspects. More specifically, the semiconductor die 1906 can include the metallic pillars 1908 formed by layers 1912, 1914, 1916, 1918, and 1920. The semiconductor die 1906 can include the interconnect structures 1822A and 1824A formed as illustrated in FIG. 18A. The metallic pillars 1908 can be attached to the semiconductor die 1906 using connection paths 1910. Additionally, the metallic pillars 1808 can be attached to a package laminate 1902 using connector pads 1904.

Physical space in mobile devices for wireless communication is at a premium because of the amount of functionality that is included within the form factor of such devices. Challenging issues arise, among other reasons, because of need to provide spatial coverage of radiated radio waves, and maintain signal strength as the mobile device is moved to different places, and also because a user may orient the mobile device differently from time to time, leading to the need, in some aspects, for varying polarities and varying spatial diversity of the radiated radio wave at varying times.

When designing packages that include antennas operating at millimeter wave (mmWave) frequencies, efficient use of space can help resolve issues such as the number of antennas needed, their direction of radiation, their polarization, and similar needs. Efficient use of a multi-layer laminate structure, such as a PCB, within the chassis of a wireless communication mobile device can be used effectively by including a cavity inside the laminate structure for placement of the RFIC transceiver die, and perhaps for placement of discrete components of the device. In some aspects, the die may be a flip-chip (FC) die. The laminate structure can include a sub-system where antennas may be embedded in the layer structure and can be implemented on top, on bottom, and on sides of the sub-system for larger spatial coverage.

Figure 20A:
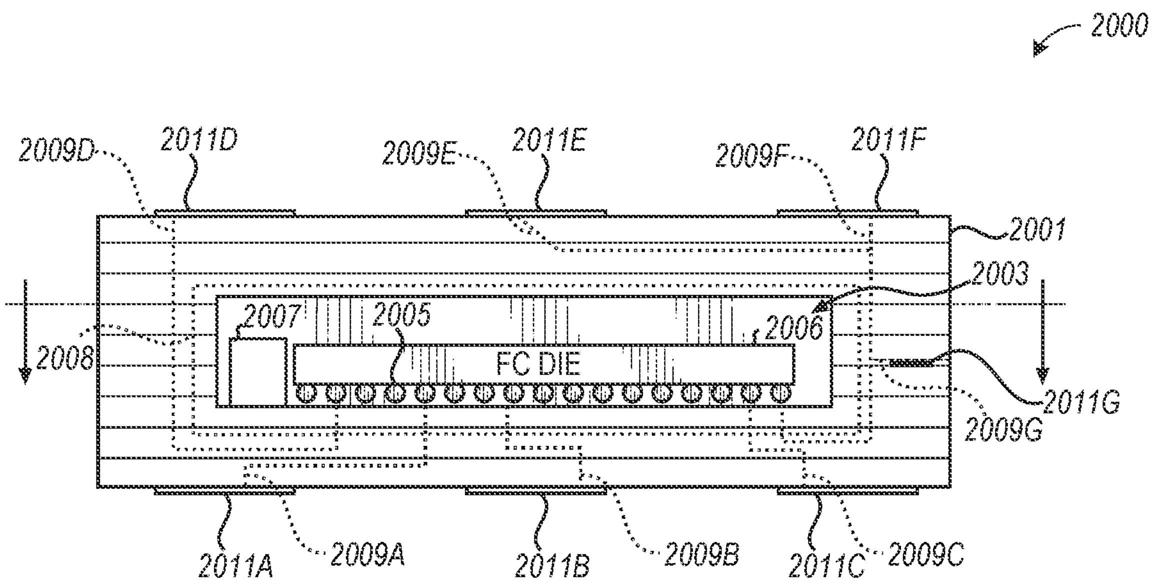
FIG. 20A is a side view, in section illustration, of an exemplary user device sub-system as described in this disclosure, according to some aspects.

FIG. 20A is a cross-sectional, side view of a user device sub-system as described in this disclosure according to some aspects. The user device sub-system is identified as 2000. The user device sub-system 2000 may be incorporated in the RF circuitry 325 and the antenna array circuitry 330 of mmWave communication circuitry 300 shown in FIG. 3A, although the user device sub-system 2000 is not limited to such.

In some aspects, the laminate structure 2001 includes a cavity 2003. The cavity, in which the RFIC and accompanying components can reside, can be formed by stacking layers of laminates with window openings on top of other laminate layers with the FC die and discreet components until the desired height clearance above the FC die and discreet components is reached. Then it may be covered with one or more full layers to close the cavity, giving the cavity a "roof." Directional terms such as "top," "bottom," "sides," and "roof" are used herein relative to the orientation of the drawing. The cavity can be large enough to enable the FC die and any discrete components to fit inside the cavity whilst also accounting for manufacturing design rules (e.g., assembly accuracies). Each assembly house may have different design rules, which may also be a function of the actual materials involved. For example, the rules for a bismaleimide triazine (BT) laminate material might be very different from those of FR4 laminate material.

In some aspects, the RFIC die 2006 is implemented within a cavity 2003 and, in some aspects, secured to the floor of the cavity by solder bumps 2005, which may be reflow solder bumps in some aspects. Other types of bumps may be used such as thermosonic, thermocompression and adhesively bonded bumps. In some aspects, these also serve as the electrical interface of the RFIC die 2006 to the laminate printed circuitry. In some aspects, up-facing wire bonding can also be used to electrically connect the RFIC to the printed circuit in the laminate. Discrete components 2007 may also be included within the cavity if appropriate for the implementation.

In some aspects, surrounding the die and discrete components is ground cage 2008, described in additional detail below, which may be used as a shield to protect the circuitry from radio frequency interference (RFI) and electromagnetic interference (EMI). The RFIC that is placed in the cavity would be encased in the described ground cage with the aid of the metalized ground layers, ground planes and vias running between the layers to protect from RFI/EMI. Typically RF chips and circuitry need to be shielded from an RFI/EMI point of view to meet regulatory requirements. Here the implementation takes advantage of the fact that the RF circuitry is embedded within a cavity that can be encompassed by metallization using layers of the laminate device and vias as appropriate, thus making a Faraday Cage, which is a shield.

With the components embedded within the cavity that is shielded, the antennas can be implemented around the outside of the shielded enclosure as discussed below, and thereby take advantage of the fact these antennas can be embedded/printed or assembled on or within the PCB from multiple sides to enable greater spatial coverage of the antennas. From the antenna point of view, the shield cage in the laminate structure could serve as the antenna ground or as a reflector to increase the antenna gain and create a more directed radiation pattern. In addition, the cavity serves as physical protection of the RFIC itself as well as any other circuitry inside the cavity.

Antenna elements 2011A through 2011G are implemented within the sub-system, according to some aspects. The antennas could be of various types. For instance, patch antennas may be implemented on the top and bottom of the structure, facing up and down, respectively, with dipole antennas on the sides, such as at 2011G. Other antenna types are possible. In some aspects, the side antennas would be implemented on three sides since the exposed electrical contacts could be on one side, as discussed further below.

In some aspects, antenna elements 2011A-2011C are implemented facing "down". Antenna elements 2011D-2011F are placed at the top of the structure facing "up." Each of antennas 2011A-2011G could be a plurality of antenna elements. For example, 2011A1 to 2011AN can be used to designate antenna elements 2011A as N antenna elements, which may be an array, in some aspects. In other words, in some aspects an antenna illustrated as, for example, 2011A, may also be an N element antenna array such as 2011A-1, . . . , 2011AN. Further, there may be arrays 2011D1-2011DN. Further still, the antenna elements in such arrays may be distributed on both the top and bottom surface of laminate structure 2001 in different formations, such as some of antenna elements 2011C1-2011CN and 2011E1-2011EN being in a single array.

In some aspects, antenna element 2011G may be placed sideways and may be configured for edge-fire or end fire radiation. Nomenclature 2011G1-2011GN could be used to indicate there may be N antenna elements 2011G (looking "into" the page or out of the page, hidden by the sectioning) which may be in an array. Transmission lines 2009A-2009G may be traces that provide RF connection from the RFIC die to/from the antennas. If the antenna that is fed is actually an antenna array, for example 2011A1-2011AN, the RF traces feeding the array could be an array of RF traces which may be designated 2009A1, . . . , 2009AN, in some aspects. RF traces from the RFIC can feed the various antenna elements through the layer structure both laterally along a given layer or through vias to reach other layers. The RF traces can be micro strips, strip line, or other suitable conductors. The RF traces to the antennas can come through openings in the shielded cavity 2003 in some aspects. Some sections of these RF feeds can be inside the cavity and some outside in some aspects. While illustrated here as running outside the cavity, alternate aspects can have the RF traces first run inside the cavity 2003, even vertically, and then pierce through an opening (via hole or lateral trace) in the shield cage at the top (or side) to reach an antenna element. This is discussed in additional detail with respect to FIGS. 20B and 21 below.

The layer 2013 of the multi-layer laminate structure indicates a layer at which electrical contacts that connect the RFIC electrically to appropriate parts of the system to outside the cavity may be implemented, according to some aspects. These contacts are discussed below in connection with FIG. 20B. In this instance, the electrical contacts (not shown at 2013 of FIG. 20A) would be into the page or out of the page (for example, hidden behind the section view).

Figure 20B:
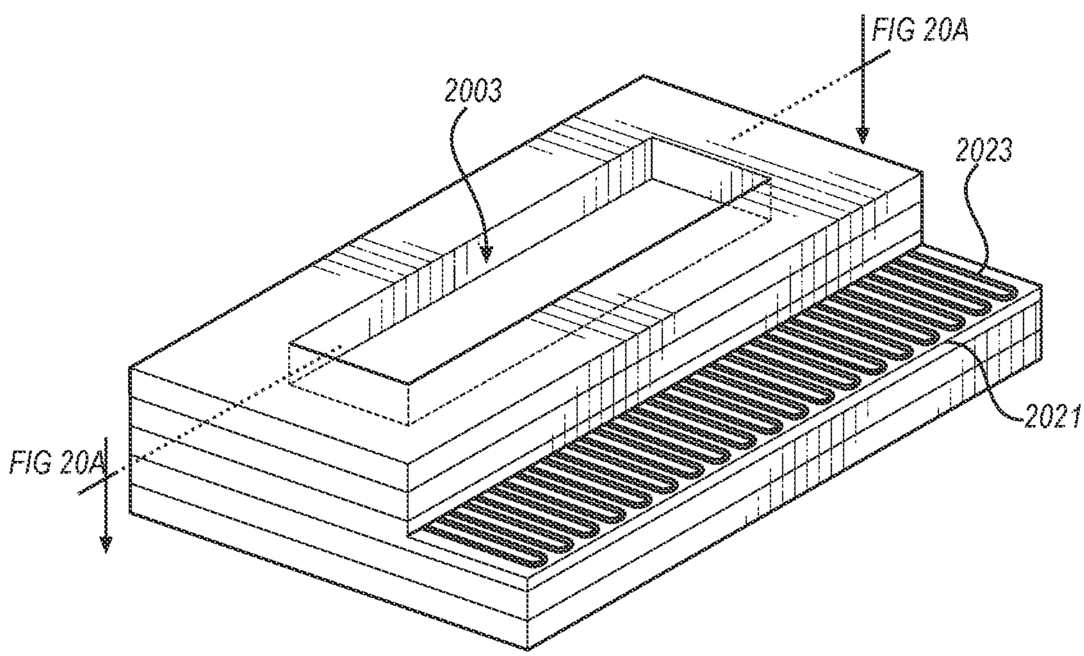
FIG. 20B illustrates an exemplary pedestal part of the laminate structure of FIG. 20A, according to some aspects.

FIG. 20B illustrates a pedestal part of the laminate structure of FIG. 20A, according to some aspects. FIG. 20B illustrates pedestal 2021 discussed briefly above. The section illustration of FIG. 20A is taken with reference to Section 20A-20A illustrated in FIG. 20B. Electrical contacts 2023 seen in FIG. 20B are the same electrical contacts discussed as implemented at layer 2013 in FIG. 20A, in some aspects. Other layers may be used for this implementation.

The cavity 2003 is shown in hidden line as disposed within the laminate structure, illustrated as configured within pedestal 2021. The pedestal can serve as the surface for electrical contacts and be used as the attachment method to a motherboard (MB) to which the laminate structure may be connected. The electrical contacts 2023 may also serve as the thermal conduit from the sub-system to the MB. The MB would have the appropriate complementary contacts, placed as discussed above with respect to layer 2013 (as one example) of FIG. 20A, according to some aspects, so that the sub-system can be easily attached to the MB and make appropriate interfaces to the MB, both electrically and thermally. The electrical contacts that would be plugged into an appropriate socket are, in some aspects, the only mechanical connection from the RFIC die to the MB. Alternatively, these could be directly solder attached to the MB with the appropriate complementary contacts. Generally, heat needs good metal to conduct, and these exposed electrical contacts 2023 can also serve as the heat sinking path pulling heat from the die inside the cavity along the metallization of the routing, in many cases using the ground layers of the multi-layer structure, in some aspects. While there is a certain amount of heat also conducted through the PCB material, this type of heat exchange is not as efficient as the metalized contacts for heat transfer.

Figure 21:
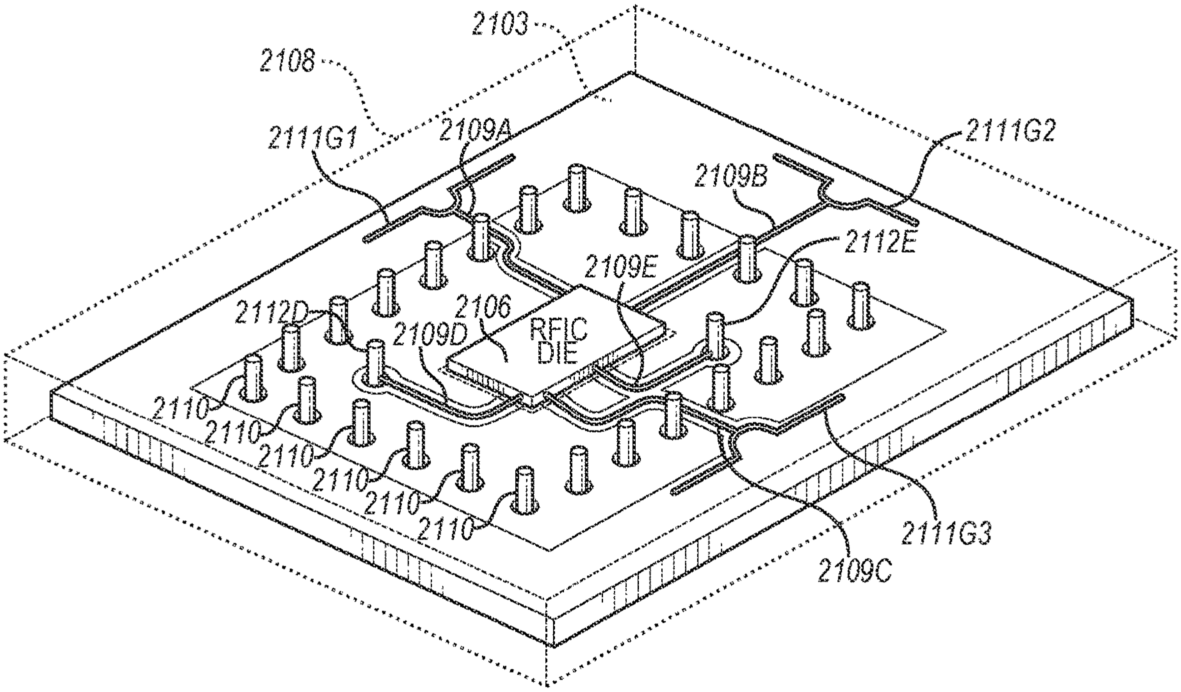
FIG. 21 illustrates exemplary RF feeds inside the cavity of the laminate structure of FIG. 20A, according to some aspects.

As discussed briefly above, the RF traces that feed the antennas can come through openings in the shielded cavity 2003. Some sections of these RF feeds can be inside the cavity and some outside. While illustrated here as running outside the cavity, alternate aspects can have the RF traces first run inside the cavity 2003, even vertically, and then pierce through an opening (via hole or lateral trace) in the shield cage at the top (or side) to reach an antenna element, according to some aspects. This can be seen in FIGS. 21 and 22. FIG. 21 illustrates RF feeds inside the cavity of the laminate structure of FIG. 20A, according to some aspects. Cavity 2103 is similar to cavity 2003 in the laminate structure of FIG. 20A. Ground plane layer 2113 that can ground the shield 2108, is a ground layer on top of the structure illustrated in the drawing, which makes contact with vertical vias, which are not shown for purposes of clarity. Ground layer 2108 is illustrated in dotted line to indicate its presence in the laminate structure illustrated.

In some aspects, vertical ground vias 2110 are situated around the periphery of the cavity 2103 and can be part of the Faraday cage discussed above. RF traces 2109A, 2109B, 2109C, 2109D, and 2109E are configured on electrically connected to RFIC die 2106, which may be beneath the ground plane on another layer inside the cavity 2103. The RF traces include RF feeds for antennas configured on or internal to the laminate structure 2001 of FIG. 20A. The RF traces 2009A, 2009B and 2009C can run internal to cavity 2003 and escape laterally out of the ground cage (described in FIG. 20A) between the vias to feed antenna elements 2011A, 2011B, and 2011C, according to some aspects.

Figure 22:
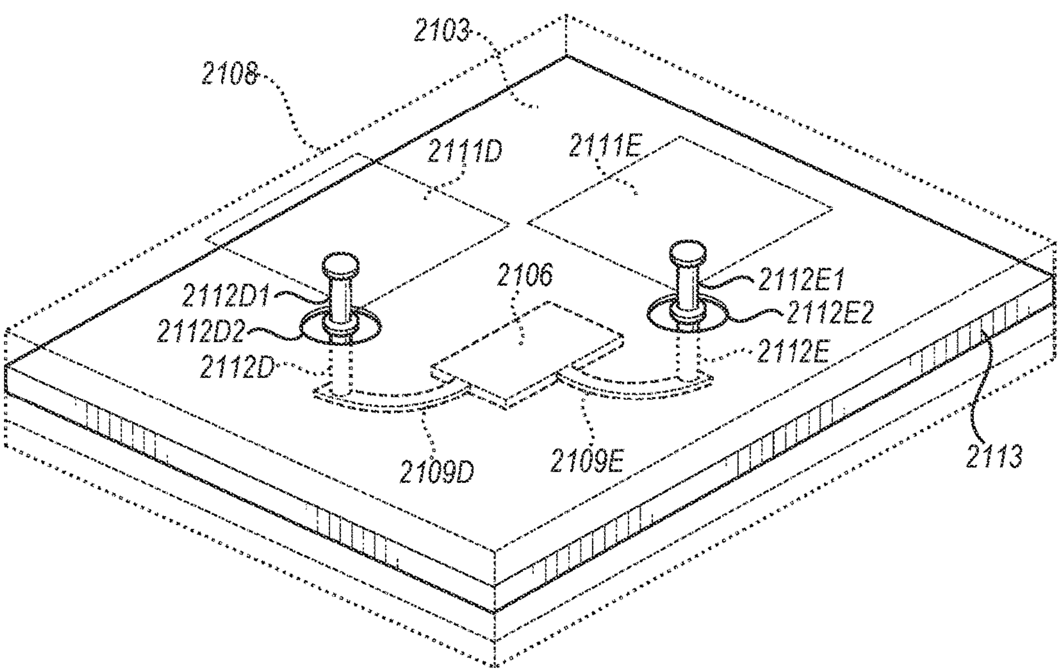
FIG. 22 illustrates exemplary RF feed traces piercing through an opening in a shield cage, according to some aspects.

These antenna elements 2011A, 2011B, and 2011C may be edge-fire antenna elements, illustrated as dipoles in one example. RF traces 2109D and 2109E pierce through the ground shield by use of vias 2112D and 2112E, according to some aspects. This is seen more clearly in FIG. 22. FIG. 22 illustrates RF feed traces transitioning vertically through a ground plane layer, according to some aspects. RF traces 2209D and 2209E pierce through the ground plane layer by way of holes or openings 2212D2, 2212E2 in the metallization to allow the signal via to go through to reach from die 2206 to antennas or antenna elements 2211D and 2211E, respectively (in some aspects by way of vias 2212D1 and 2212E1). Antennas, or antenna elements, 2211D and 2211E are shown in dotted line to indicate they can be at an appropriate level of the laminate structure 2001, according to some aspects. Antennas, or antenna elements, 2211D and 2211E are illustrated as patch antennas but may be any appropriate antenna or antenna element. Vias 2212D1 and 2212E1 are shown as oversize to indicate that each can connect to the appropriate level of the laminate structure 2001 to feed antennas 2211D and 2211E, either directly or, in some aspects, via an additional RF trace connecting the via to the antenna.

RF communication systems oftentimes utilize sub-systems (e.g., voltage controlled oscillators (VCOs), power amplifiers, transceivers, modems, and so forth) that are formed on a semiconductor die. Oftentimes, the packaged chip has limited space to locate antenna elements, especially in instances when multiple types of signal communication systems are implemented on a single chip.

Figure 23:
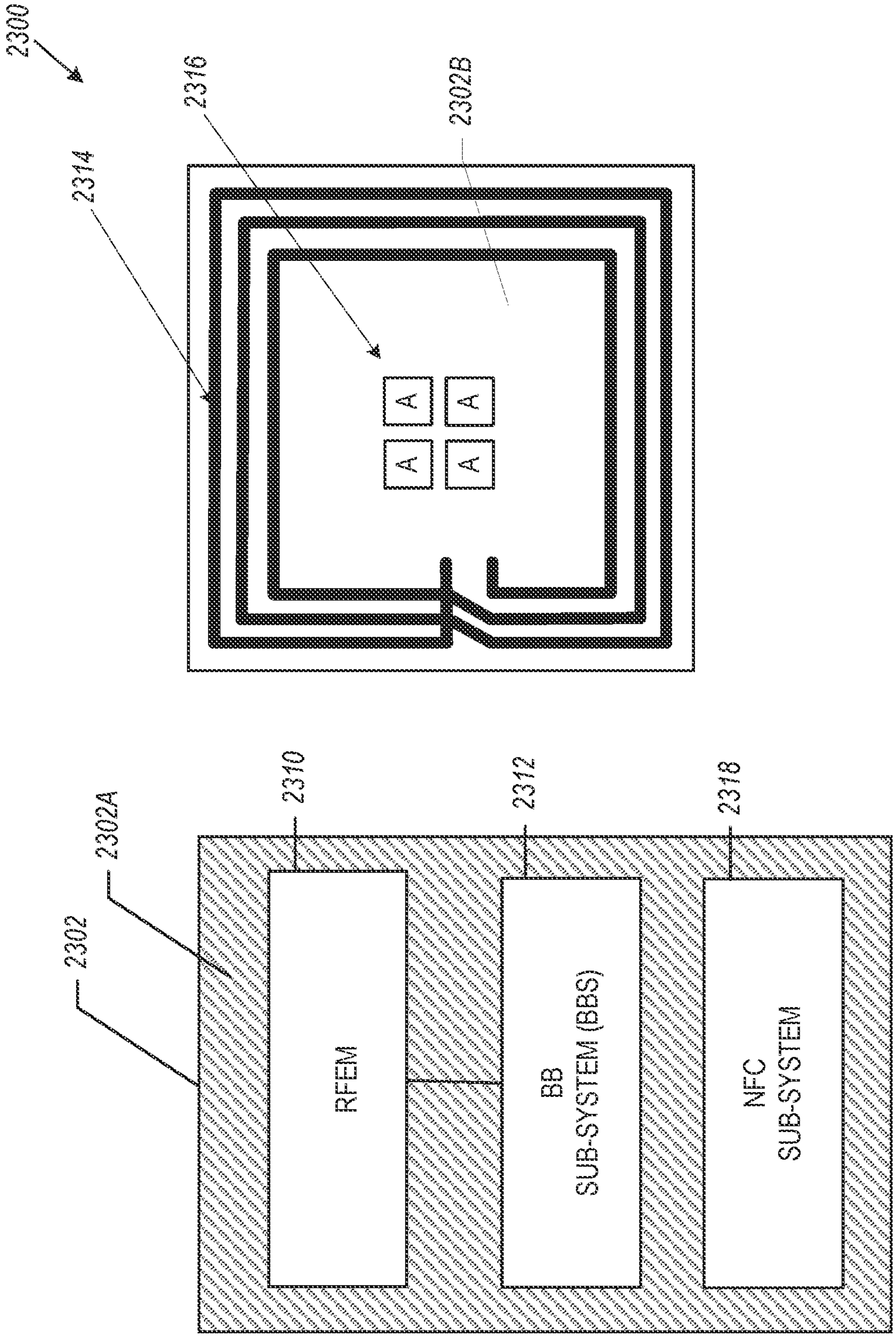
FIG. 23 illustrates multiple views of an exemplary semiconductor package with co-located millimeter wave (mmWave) antennas and a near field communication (NFC) antenna according to some aspects.

FIG. 23 illustrates multiple views of a semi-conductor package 2300 with co-located mmWave antennas and a near field communication (NFC) antenna according to some aspects. The semi-conductor package 2300 may be incorporated in the antenna array circuitry 330 of mmWave communication circuitry 300 shown in FIG. 3A, although the semi-conductor package 2300 is not limited to such.

Referring to FIG. 23, the semi-conductor package 2300 can be implemented on a PCB substrate 2302. The PCB substrate can include a component side 2302A and a printed side 2302B. In some aspects, the component side 2302A can include one or more circuits (or sub-systems) performing signal processing functionalities. For example, the component side 2302A can include an RF front-end module (RFEM) 2310 and a baseband sub-system (BBS) 2312. The RFEM 2310 and the BBS 2312 are illustrated in greater detail in FIG. 26 and FIG. 27, respectively. In some aspects, The PCB substrate can also include near-field communication (NFC) sub-system 2318, which can be configured to receive and transmit NFC signals.

In some aspects, the RFEM 2310 may include suitable circuitry, logic, interfaces and/or code and can be configured to process one or more intermediate frequency (IF) signals generated by the BBS 2312 for transmission using a phased antenna array. The RFEM 2310 can also be configured to receive one or more RF signals via the phased antenna array, and convert the RF signals into IF signals for further processing by the BBS 2312.

In some aspects, the RFEM 2310 can be configured to process mmWave signals in one or more mmWave bands. Additionally, the phased antenna array (or a subset of the phased antenna array) can be implemented as antenna array 2316 on the printed side 2302B of the PCB substrate 2302. Even though four patch antennas are illustrated as the phased antenna array 2316, the disclosure is not limited in this regard, and other types (and a different number) of antennas can be used as the phased antenna array 2316. Additionally, the phased antenna array 2316 can be used to transmit and receive mmWave signals or other types of wireless signals.

In some aspects, the phased antenna array 2316 can be co-located with a Near Field Communication (NFC) antenna 2314. As seen in FIG. 23, the NFC antenna 2314 can be implemented as an inductor element, disposed around the phased antenna array 2316, on the printed side 2302B of the PCB substrate 2302. In some aspects, the NFC antenna 2314 can include multiple inductor elements (e.g., a multi-layer inductor), which can be co-located with the phased antenna array 2316.

In some aspects, the RFEM 2310 and the BBS 2312 can be used for processing wireless signals in connection with one or more wireless standards or protocols in one or more communication networks. Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., networks using Institute of Electrical and Electronics Engineers (IEEE) 802.11 family of standards known as Wi-Fi®, IEEE 802.16 family of standards known as WiMax®, IEEE 802.15.4 family of standards, a Long Term Evolution (LTE) family of standards, 5G wireless communications standards or protocols (including communications in the 28 GHz, 37 GHz, and 39 GHz communication bands), a Universal Mobile Telecommunications System (UMTS) family of standards, peer-to-peer (P2P) networks, among others.

Figure 24:
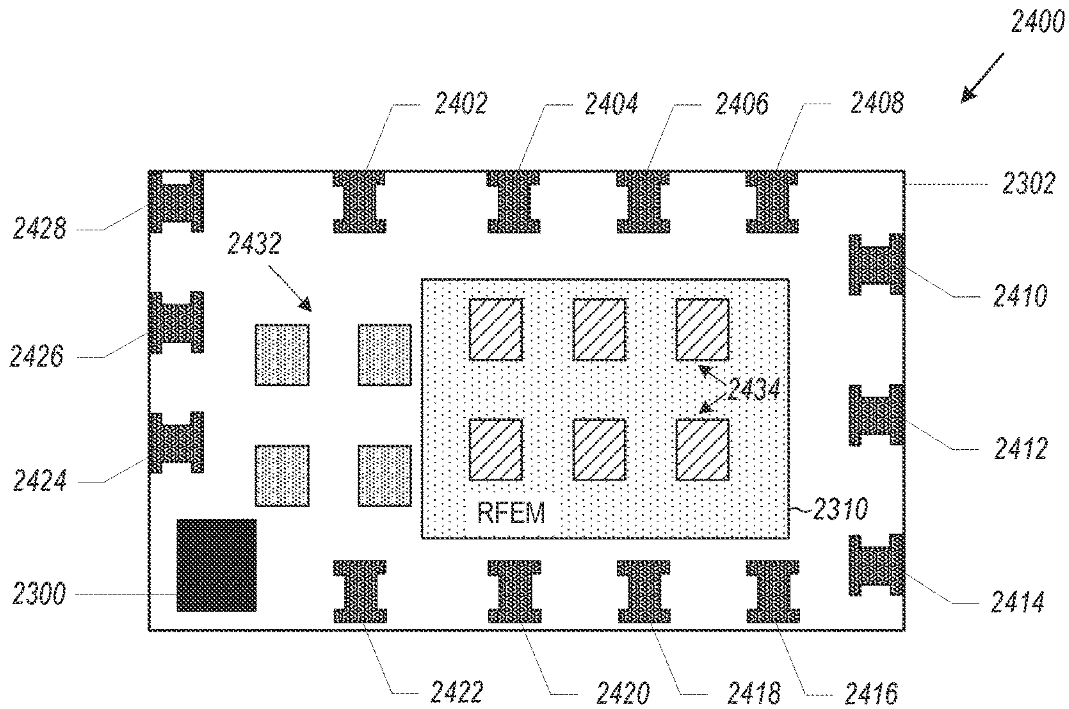
FIG. 24 illustrates an exemplary radio frequency front-end module (RFEM) with a phased antenna array according to some aspects.

FIG. 24 illustrates a radio frequency front-end module (RFEM) with a phased antenna array according to some aspects. Referring to FIG. 24, there is illustrated the RFEM 2310 using an example phased antenna array implemented on both sides of the PCB substrate 2302. More specifically, the phased antenna array 2400 can include a first plurality of antennas 2402-2408, a second plurality of antennas 2410-2414, a third plurality of antennas 2416-2422, a fourth plurality of antennas 2424-2428, a fifth plurality of antennas 2432, and a sixth plurality of antennas 2434.

In some aspects, the antennas 2402 through 2428 and 2432 can be disposed on one side of the PCB substrate 2302. The sixth plurality of antennas 2434 can be disposed on an opposite side of the PCB substrate 2302 (e.g., similarly to antenna array 2316 illustrated in FIG. 23). In some aspects, the first, second, third, and fourth plurality of antennas 2402-2428 can be disposed along the four corresponding edges of the PCB substrate 2302 (as seen in FIG. 24). The fifth plurality of antennas 2432 can be disposed at an area that is remote from the edges of the PCB substrate 2302. The PCB substrate 2302 can also include a connection terminal 2430, which can be used as a feed line for the phased antenna array 2400. In this regard, the phased antenna array that includes antennas 2402-2428, 2432, and 2434 can provide signal coverage in a North, South, West, East, upwards, and downward direction relative to the PCB substrate 2302.

In some aspects, the phased antenna array that includes antennas 2402-2428, 2432, and 2434 can include different types of antennas, such as dipole antennas and patch antennas. In some aspects, the phased antenna array can be implemented using other types of antennas as well. In some aspects, one or more of the antennas of the phased antenna array 2400 can be implemented as part of the RFEM 2310. Additionally, the PCB substrate 2302 can include a NFC antenna (not illustrated in FIG. 24), which can be co-located with one or more of the antennas of the phased antenna array 2400. For example, the NFC antenna can be co-located with antennas 2434 on the same side of the PCB substrate 2302.

Figure 25:
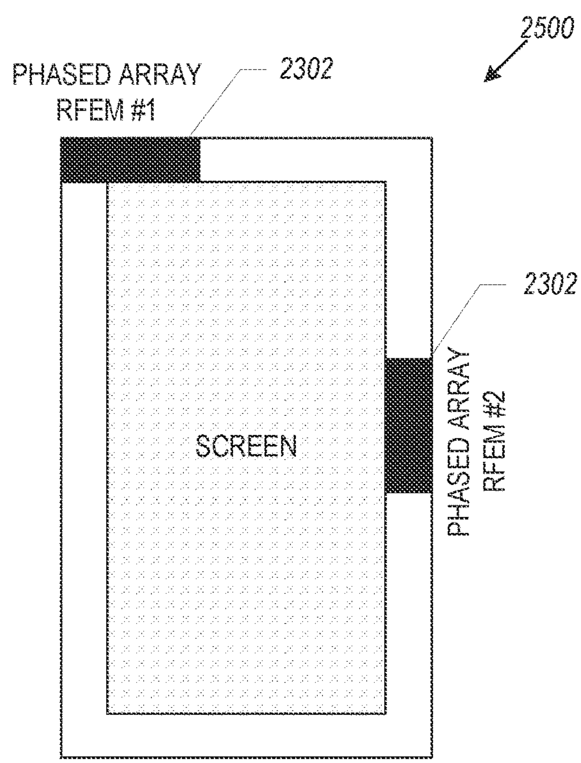
FIG. 25 illustrates example locations of an exemplary RFEM in a mobile device according to some aspects.

FIG. 25 illustrates exemplary locations of a RFEM in a mobile device according to some aspects. Referring to FIG. 25, there is illustrated a mobile device 2500 which includes multiple RFEMs 2502. Each RFEM 2502 can include co-located NFC antenna and mmWave phased array antenna, e.g., as illustrated in FIG. 23. As seen in FIG. 25, each RFEM 2502 can be away from the screen area (e.g., in a bezel area) so that antenna coverage is provided from one RFEM in instances when another RFEM is covered by a human hand.

Figure 26:
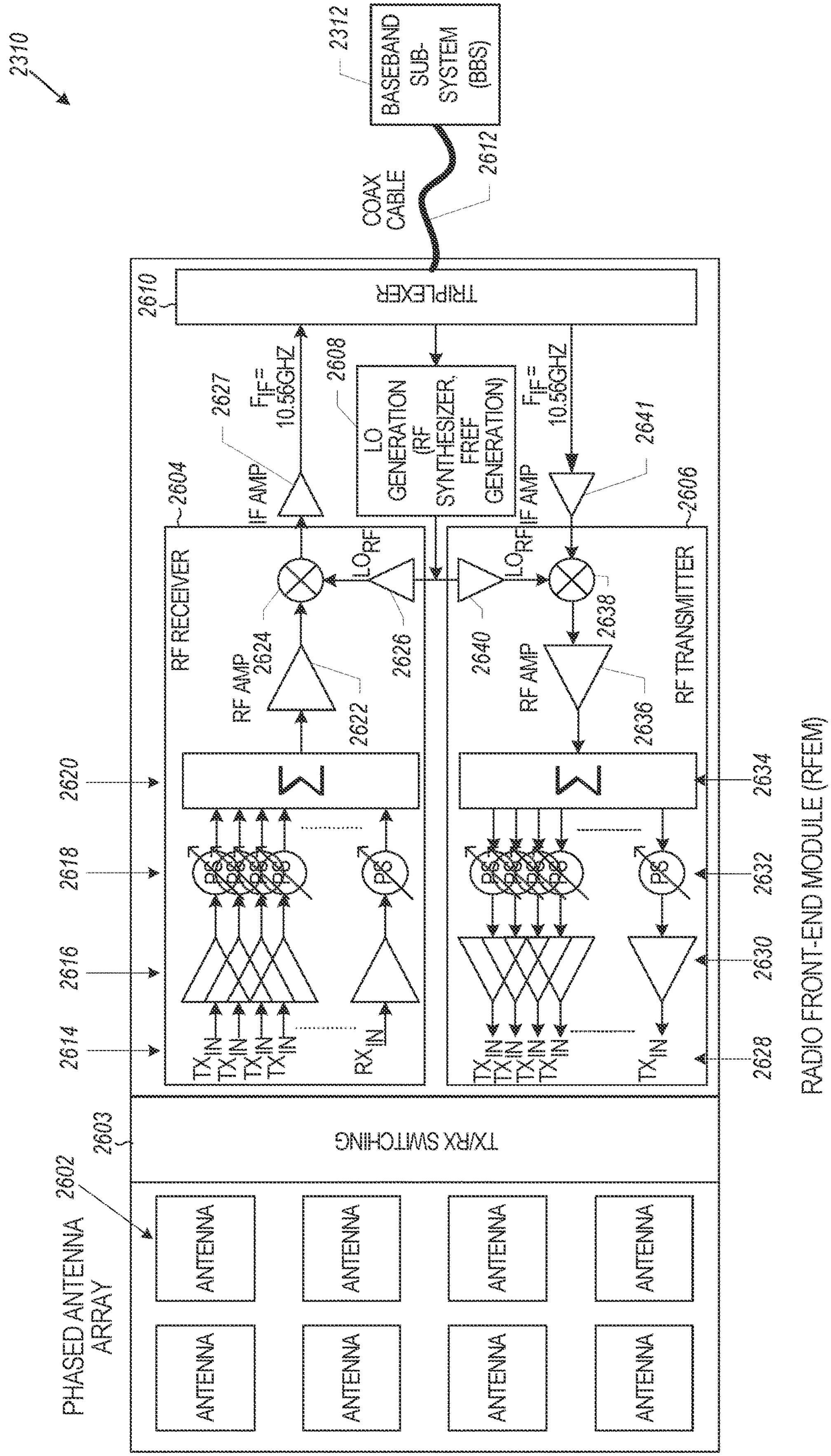
FIG. 26 is a block diagram of an exemplary RFEM according to some aspects.

FIG. 26 is a block diagram of an exemplary RFEM according to some aspects. Referring to FIG. 26, the RFEM 2310 is coupled to the BBS 2612 via a coax cable 2612. The RFEM 2610 can include a phased antenna array 2602, a RF receiver 2604, a RF transmitter 2606, a LO generator 2608, a triplexer 2610, and a switch 2603. The RF receiver 2604 can include a plurality of power amplifiers 2616, a plurality of phase shifters 2618, and adder 2620, and amplifier 2622, and amplifier 2626, and a multiplier 2624. The RF transmitter 2606 can include a multiplier 2638, amplifiers 2636 and 2640, an adder 2634, a plurality of phase shifters 2632, and a plurality of amplifiers 2630. The RFEM 2310 can further include intermediate frequency (IF) amplifiers 2627 and 2641.

In an example receive operation, the switch 2603 can activate receiver chain processing. The phased antenna array 2602 can be used for receiving a plurality of signals 2614. The receive signals 2614 can be amplified by amplifiers 2616 and the phase can be adjusted by corresponding phase shifters 2618. Each of the phase shifters 2618 can receive a separate phase adjustment signal (not illustrated in FIG. 26) from a control circuitry, where the individual phase adjustment signals can be based on desired signal directionality when processing signals received via the phased antenna array 2602. The phase adjusted signals at the output of the phase shifters 2618 can be summed by the adder 2620 and then amplified by the amplifier 2622. The LO generator 2608 can generate a LO signal, which can be amplified by the amplifier 2626 and then multiplied with the output of amplifier 2622 using the multiplier 2624 in order to generate an IF output signal. The IF output signal can be amplified by amplifier 2627 and they communicated to the BBS 2312 via the triplexer 2610 and the coax cable 2612.

In an example transmit operation, the switch 2603 can activate transmitter chain processing. The RFEM 2310 can receive an IAF signal from the BBS 2312 via the coax cable 2612 and the triplexer 2610. The IAF signal can be amplified by amplifier 2641 and then communicated to multiplier 2638. The multiplier 2638 can receive an up-conversion LO signal from the LO generator 2608 and the amplifier 2640. The amplified LO signal is multiplied with the received IF signal by the multiplier 2638. The multiplied signal is then amplified by amplifier 2636 and communicated to adder 2634. The adder 2634 generates multiple copies of the amplified signal and communicates signal copies to the plurality of phase shifters 2632. The plurality of phase shifters 2632 can apply different phase adjustment signals to generate a plurality of phase adjusted signals which can be amplified by the plurality of amplifiers 2630. The plurality of amplifiers 2630 generates a plurality of signals 2628 for transmission by the phased antenna array 2602.

In some aspects, the LO generator 2608 can be shared between processing mmWave wireless signals (or other types of signals) by the RFEM 2310 and processing NFC signals by the NFC sub-system 2318. For example, the NFC sub-system 2318 can use this LO generation signal at the output of the LO generator 2608 (after dividing it) for up-conversion or down-conversion, as needed. In another example, the NFC sub-system 2318 can use the LO generation signal for direct generation of the NFC data by using the LO signal (e.g., by multiplying the LO signal by the NFC data).

In some aspects, other circuits/sub-systems within the RFEM 2310 or the BBS 2312 can be shared with the NFC sub-system 2318. For example, the RFEM 2310 or the BBS 2312 can include a power management unit (PMU) (not illustrated), which can be shared with the NFC sub-system 2318. In some aspects, the PMU can include DC-to-DC sub-systems (e.g., DC regulators), voltage regulators, bandgap voltage reference and current sources, and so forth, which can be shared with the NFC sub-system 2318.

Even though the RF receiver 2604 and the RF transmitter 2606 are illustrated as outputting and receiving, respectively, intermediate frequency (IF) signals, the disclosure is not limited in this regard. More specifically, the RF receiver 2604 and the RF transmitter 2606 can be configured to output and receive, respectively, RF signals (e.g., superheterodyne or direct conversion architecture).

Figure 27:
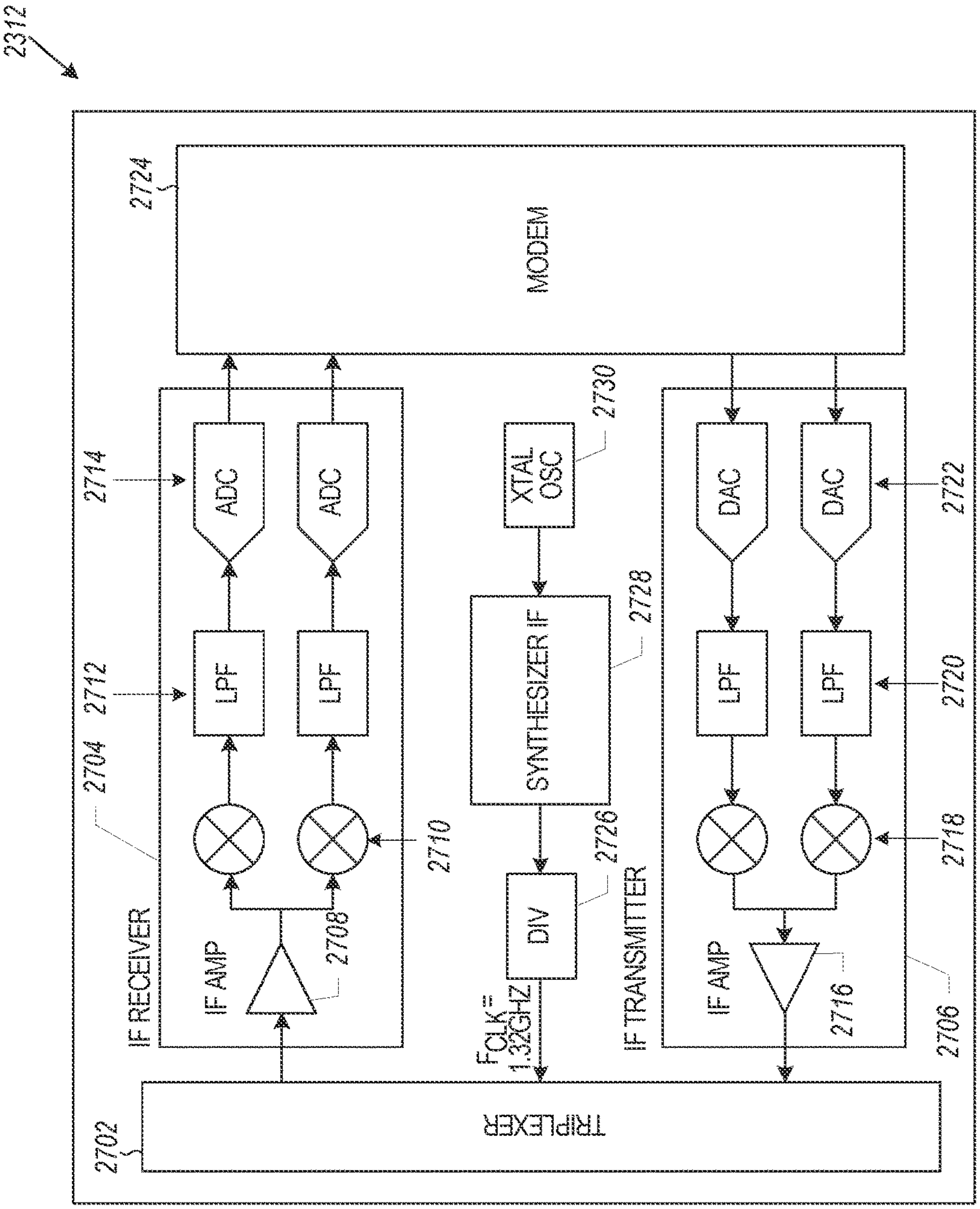
FIG. 27 is a block diagram of an exemplary media access control (MAC)/baseband (BB) sub-system according to some aspects.

FIG. 27 is a block diagram of a media access control (MAC)/baseband (BB) sub-system according to some aspects. Referring to FIG. 27, the BBS 2312 can include a triplexer 2702, an IF receiver 2704, an, a modem 2724, a crystal oscillator 2730, a synthesizer 2728, and a divider 2726. The synthesizer 2728 can use a signal from the crystal oscillator 2730 generate a clock signal which can be divided by divider 2726 to generate an output clock signal for communication to the RFEM 2310. In some aspects, the generated clock signal can have a frequency of 1.32 GHz.

The IF receiver 2704 can include an amplifier 2708, mixers 2710, filters 2712, and ADC blocks 2714. The IF transmitter 2706 can include DAC blocks 2722, low-pass filters 2720, mixers 2718, and IF amplifier 2716.

In an example receive operation, an IF signal is received from the RFEM 2310 via the triplexer 2702 and is amplified by amplifier 2708. The amplified IF signal can be down-converted to baseband signals by the mixers 2710, then filtered by low-pass filters 2712, and converted to a digital signal by the ADC blocks 2714 before being processed by the modem 2724.

In an example transmit operation, a digital signal output by the modem 2724 can be converted to analog signals by the DAC blocks 2722. The analog signals are then filtered by the low-pass filters 2720 and then up convert it to an IF signal by the mixers 2718. The IF signal is then amplified by IF amplifier 2716 and then transmitted to the RFEM 2310 via the triplexer 2702 and the coax cable 2612.

In some aspects, the coax cable may be used to communicate IF signals or RF signals (e.g., RF-over-Coax, or RFoC communications). In this regard, one or more other sub-systems for processing IF or RF signals can be disposed between the RFEM 2310 and the BBS 2312 for additional signal processing.

In some aspects, the RFEM 2310, the BBS 2312, the NFC sub-system 2318, the phased antenna array 2316 and the NFC antenna 2314 can be located within the same package, or a distributed approach may be used where one or more sub-systems can be implemented on a separate package.

Figure 28:
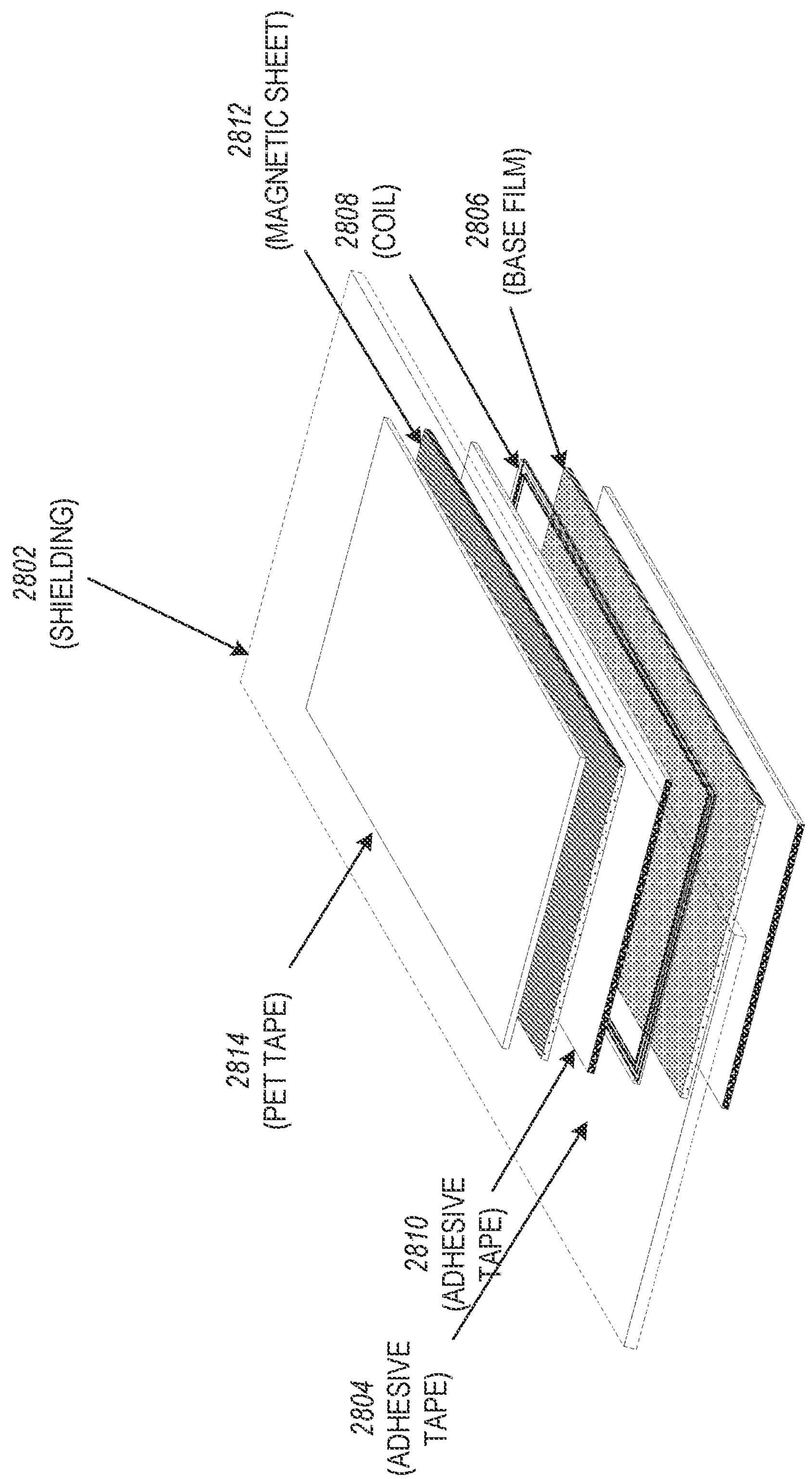
FIG. 28 is a diagram of an exemplary NFC antenna implementation according to some aspects.

FIG. 28 is a diagram of an exemplary NFC antenna implementation according to some aspects. Referring to FIG. 23 and FIG. 28, the RFEM 2310 as implemented with the co-located antenna array 2316 and NFC antenna 2314 can also include a signal shielding cover 2802. In some aspects, the NFC antenna 2314 can be disposed on the signal shielding cover 2802. As seen in FIG. 28, the NFC antenna 2314 can be implemented as an inductive coil 2808. More specifically, the following stack can be applied to the signal shielding cover 2802: a polyester tape 2814, a magnetic sheeting 2812, and adhesive tape 2810, the inductive coil 2808, a base film 2806, and an adhesive tape 2804. Even though FIG. 28 illustrates a specific tape stack including the coil 2808, the disclosure is not limited in this regard and other aspects of a co-located NFC antenna with a millimeter wave phased antenna array are also possible, and other types of layers/sheeting and layer ordering can also be used in lieu of the layers and ordering illustrated in FIG. 28.

Figure 29:
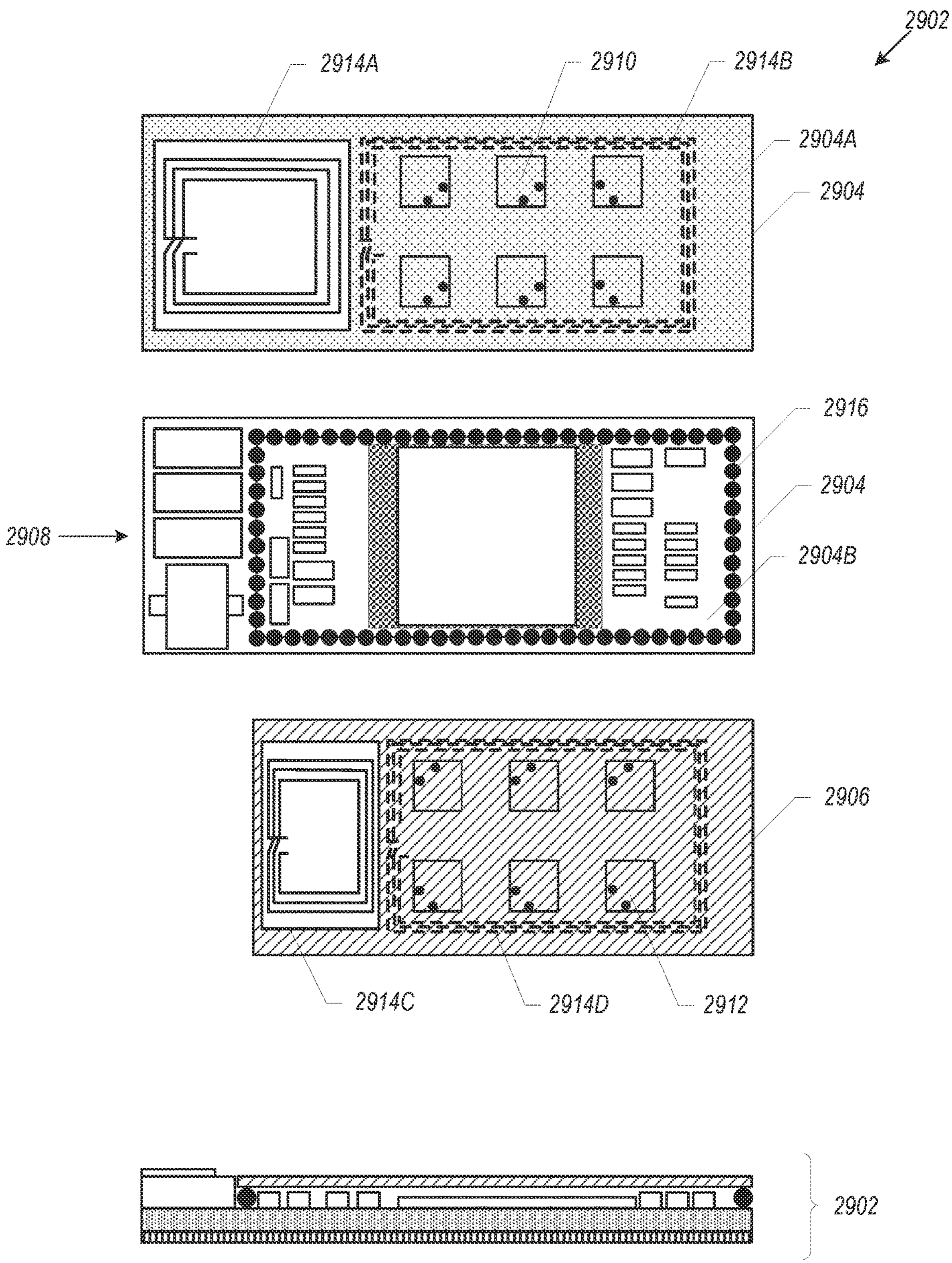
FIG. 29 illustrates multiple views of an exemplary semiconductor package with co-located mmWave antennas and a near field communication (NFC) antenna on multiple printed circuit board (PCB) substrates according to some aspects.

FIG. 29 illustrates multiple views of a semiconductor package with co-located mmWave antennas and a near field communication (NFC) antenna on multiple PCB substrates according to some aspects. Referring to FIG. 29, the semiconductor package 2902 can include multiple PCB substrates. For example, the semiconductor package 2902 can include a first substrate 2904 and a second substrate 2906. The first substrate 2904 can include a first side 2904A (e.g., a printed side) and a second side 2904B (e.g., a component side). The component side 2904B can include one or more components 2908, such as an RFEM (e.g., 2310), a BBS (e.g., 2312), and an NFC sub-system (e.g., 2318). The printed side 2904A can include a phased antenna array 2910. For example, the phased antenna array 2910 can be used by the RFEM implemented on the component side 2904B. In some aspects, the printed side 2904A can include a co-located NFC antenna 2914. The NFC antenna 2914 can be implemented as NFC antenna 2914A (next to the phased antenna array 2910) or as NFC antenna 2914B disposed around the phased antenna array 2910.

In some aspects, a subset of the phased antenna array used by the RFEM implemented on the substrate 2904 can be disposed on the second substrate 2906. For example, as seen in FIG. 29, the substrate 2906 can include a phased antenna array 2912. Both the phased antenna array 2910 and the phase antenna array 2912 can include antennas with horizontal and/or vertical polarization. In some aspects, the second substrate 2906 can include a co-located NFC antenna 2914C, which can be disposed next to the phased antenna array 2912. Alternatively, the NFC antenna can be implemented as antenna 2914D which is an inductor disposed around the phased antenna array 2912.

In some aspects, the first substrate 2904 can include solder balls 2916, which can be used for coupling between the first substrate 2904 and the second substrate 2906.

Phased array radio transceivers can be used in millimeter wave radio communications circuits to increase antenna gain, in order to address the significant path loss associated with smaller antenna aperture at these frequencies. However, phased array radio transceivers utilize a recombination point where the sum of all the phased array receivers (or transmitters) signals are combined together. This combination node is often a bottleneck in phased array receivers in terms of performance and complexity. Additionally, in applications where a different size of phased array is desired, the combination node may need to be redesigned, which significantly increasing the design complexity and is an obstacle to the scalability of phased arrays.

Figure 30:
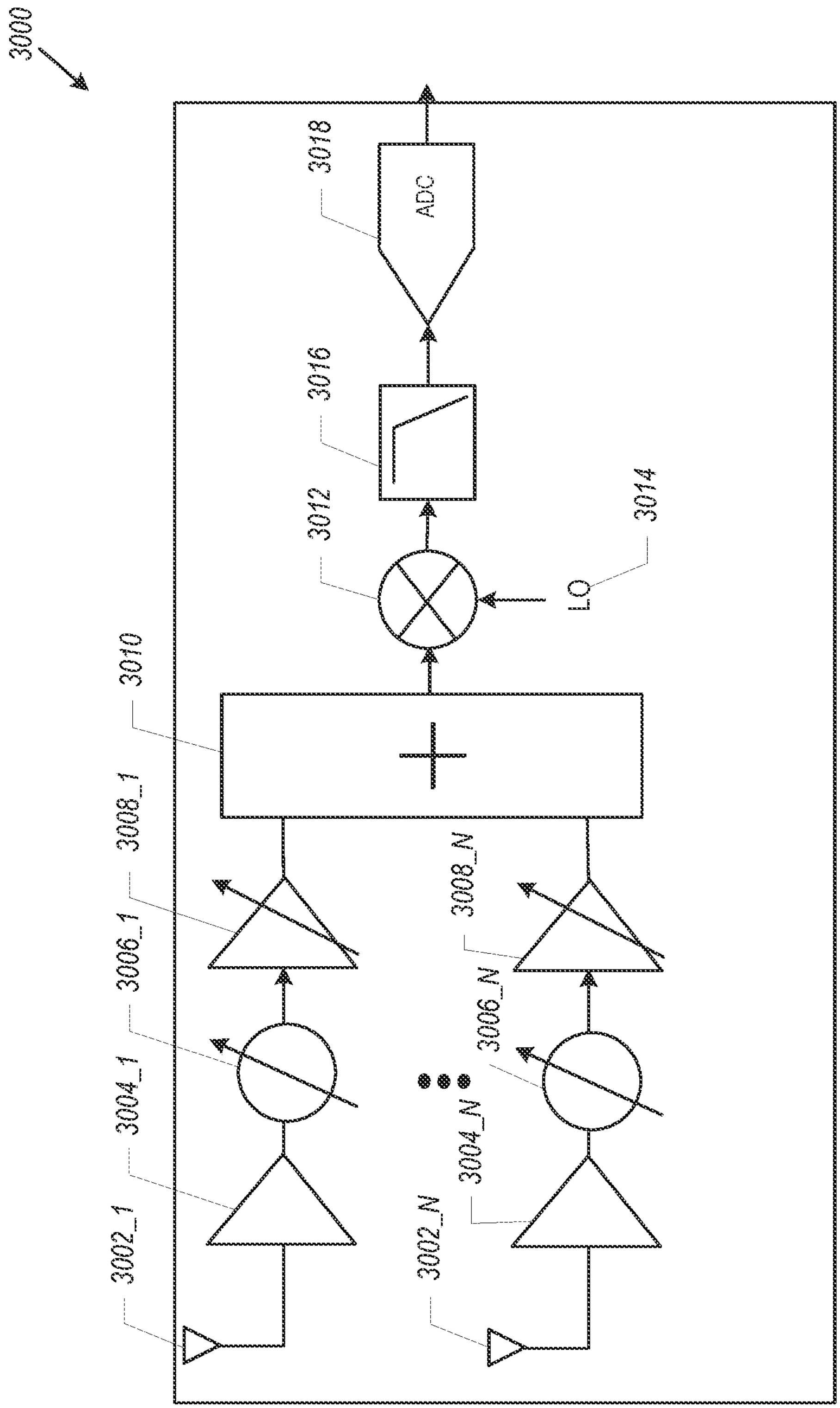
FIG. 30 is a block diagram of an exemplary RF phased array system that implements beamforming by phase-shifting and combining the signals at RF according to some aspects.

FIG. 30 is a block diagram of an RF phased array system that implements beamforming by phase-shifting and combining the signals at RF according to some aspects. The illustrated RF phased array system may be incorporated in the RF circuitry 325 of mmWave communication circuitry 300 shown in FIG. 3A, although the RF phased array system is not limited to such.

Referring to FIG. 30, there is illustrated a phased array radio transceiver 3000. The transceiver operates by modifying the gain and a phase of each received element in such a way that a transmitted (or received) signal is formed from the coherent vector sum of several weaker (in amplitude) signals. The transceiver 3000 operates as an RF phased array system. More specifically, the transceiver 3000 includes N number of receiver/transmitter chains including antennas 3002_1-3002_N, amplifiers 3004_1-3004-N, phase shifters 3006_1-3006_N, variable gain amplifiers 3008_1-3008_N, an adder (or combiner) 3010, a mixer 3012, a filter 3016, and an analog-to-digital converter (ADC) 3018. In instances when signals are processed for transmission, block 3018 can be a digital-to-analog converter.

In operation, the phase shifters 3006_1-3006_N as well as the variable gain amplifiers 3008_1-3008_N are used to adjust each transmitted or received signal. The advantages of the RF phased array system in FIG. 30 are simplicity since only one mixer and baseband chain may be needed. Drawbacks of the RF phased array system in FIG. 30 can include the lack of scalability (adding several paths at RF frequencies forms a bandwidth bottleneck), added noise figure in the receiver (since noisy phased array and variable gain amplifiers are added near to the antennas), and added power consumption (the phase and gain adjustments blocks operate at millimeter wave frequencies and can add extra signal loss).

Figure 31:
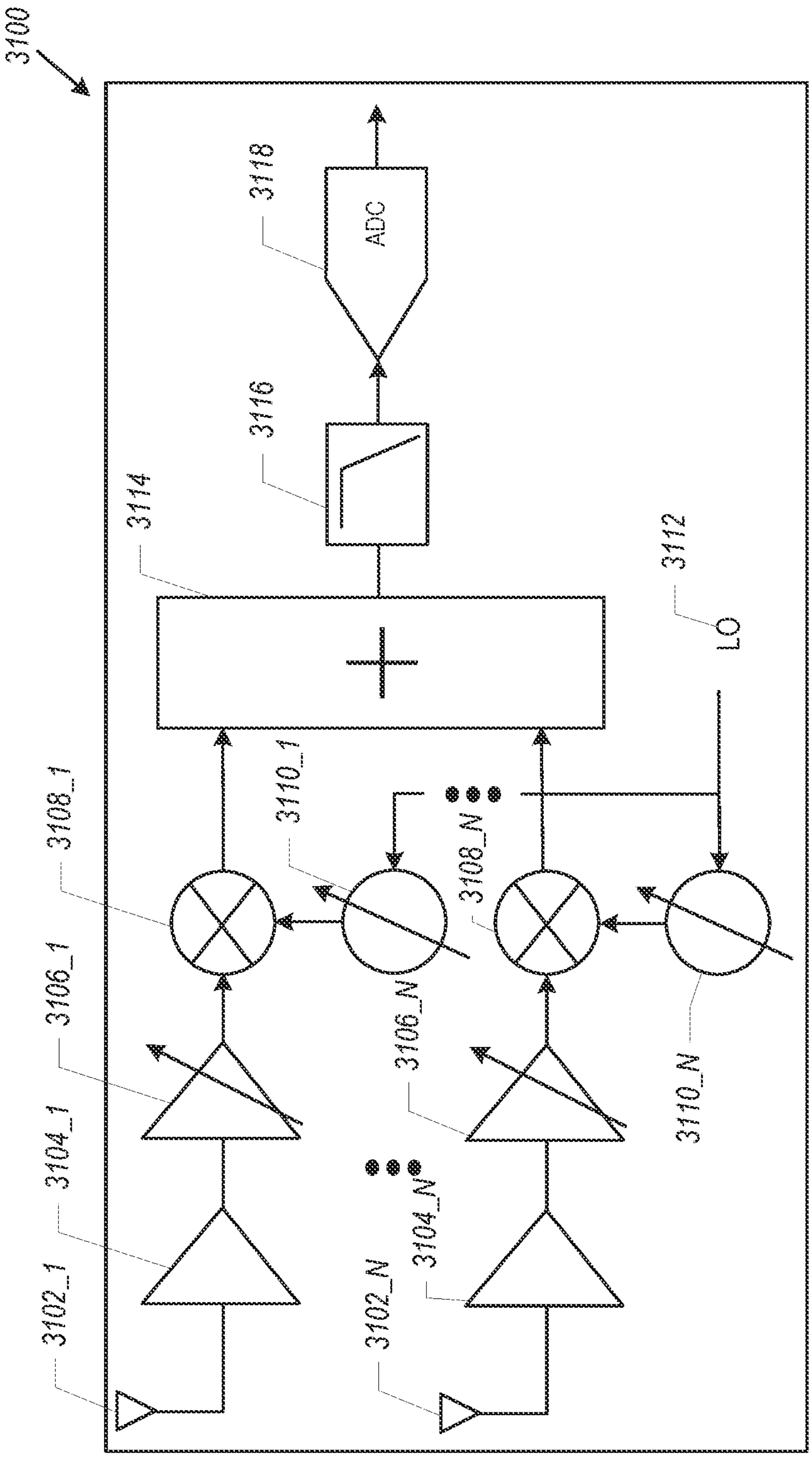
FIG. 31 is a block diagram of an exemplary phased array system that implements beamforming by phase-shifting the local oscillator (LO) and combining the analog signals at IF/baseband according to some aspects.

FIG. 31 is a block diagram of a phased array system that implements beamforming by phase-shifting the local oscillator (LO) and combining the analog signals at IF/baseband according to some aspects. Referring to FIG. 31, there is illustrated a phased array radio transceiver 3100, which is configured as a local oscillator (LO) phase shifting phased array system. The transceiver 3100 can include antennas 3102_1-3102-N, amplifiers 3104-1-3104-N, variable gain amplifiers 3106-1-3106-N, mixers 3108_1-3108_N, phase shifters 3110_1-3110_N, an adder (or combiner) 3114, a filter 3116, and an ADC 3118. As seen in FIG. 31, the LO phased array system 3100 uses variable gain amplifiers in the signal path, however, the phase shifters 3110 are used within the local oscillator path to shift the phase of the LO signal 3112. The advantage of this topology over the RF phased array system of FIG. 30 is a reduced noise profile. However, the LO phased array system 3100 uses more mixers. Additionally, routing LO signals operating at millimeter wave frequencies can be challenging.

In some aspects, the LO phased array system 3100 can be configured to perform the phase shifting using all digital PLLs (ADPLLs) and the phase shifting can be accomplished digitally within the ADPLL loop. This can eliminate the need for RF phase shifters, which are costly in terms of power consumption and introduce distortion and insertion loss in the signal path. Phase shifting within the ADPLL also removes the needs for explicit phase shifter added on the LO signal path.

Figure 32:
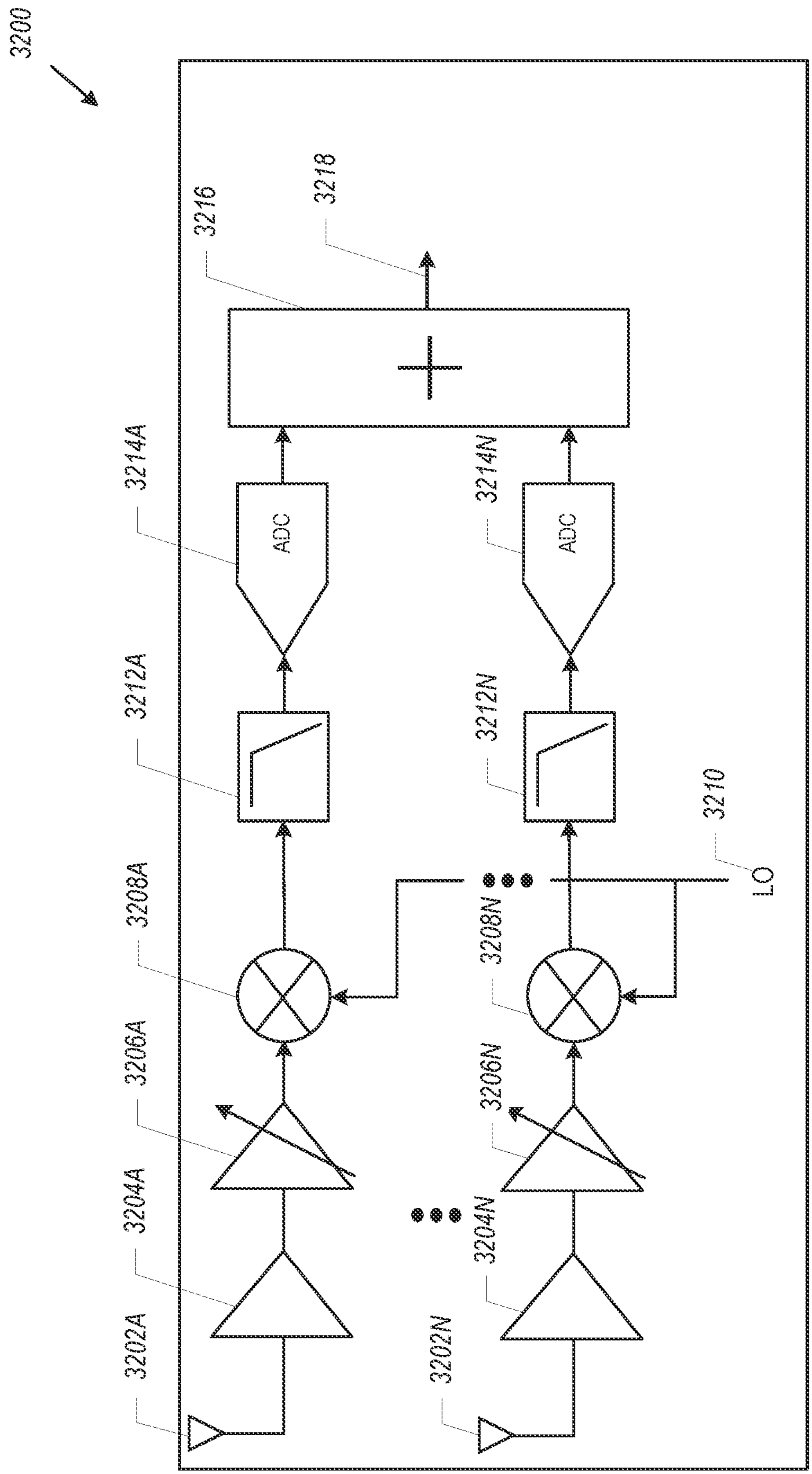
FIG. 32 is a block diagram of an exemplary phased array system with digital phase-shifting and combining according to some aspects.

FIG. 32 is a block diagram of a phased array system with digital phase shifting and combining according to some aspects. Referring to FIG. 32, there is illustrated a digital phased array system 3200. The transceiver 3200 can include antennas 3202A-3202N, amplifiers 3204A-3204N, variable gain amplifiers 3206A-3206N, mixers 3208A-3208N, filters 3212A-3212N, ADCs 3214A-3214N and an adder 3216.

As seen in FIG. 32, the entire transceiver chain is replicated for each antenna, including the data converters 3214A-3214N. The signal phase adjustment and the signal combination can be performed on the digital signal output 3218 after the adder 3216. Performing phased array combination in digital domain, however, can result in increased complexity and power consumption. A benefit of the digital phased array system 3200 is its ability to support multiple user simultaneously, with each user taking advantage of the full antenna array gain, by creating separate digital streams each generated with a different set of beamforming coefficients (both gain and phase).

In the example transceivers illustrated in FIGS. 30-32, a recombination point is used where the sum of all the phased array receivers (or transmitters) signals are combined together with different amplitude weights and/or phase shifts. This combination node can oftentimes be a bottleneck in phased array receivers in terms of performance and complexity. Additionally, if a different size of phased array is desired, the combination node may be redesigned, which can significantly increase the design complexity of the transceiver and substantially limits the array scalability.

In some aspects, a scalable phased array radio transceiver architecture can be used, as discussed herein, which alleviates the scalability and complexity issues associated with the transceivers illustrated in FIGS. 30-32. The scalable phased array radio transceiver architecture can use multiple transceiver tiles (or cells), which aids in the reusability of this architecture for multiple applications and products and reduces time-to-market. Additionally, the proposed scalable phased array radio transceiver architecture is self-configurable, easing the programmability of the transceiver device. The scalable phased array radio transceiver architecture can support multiple modes of operation that enable better phased array gain or low power consumption optimized for the specific use case, as discussed herein below.

Figure 33:
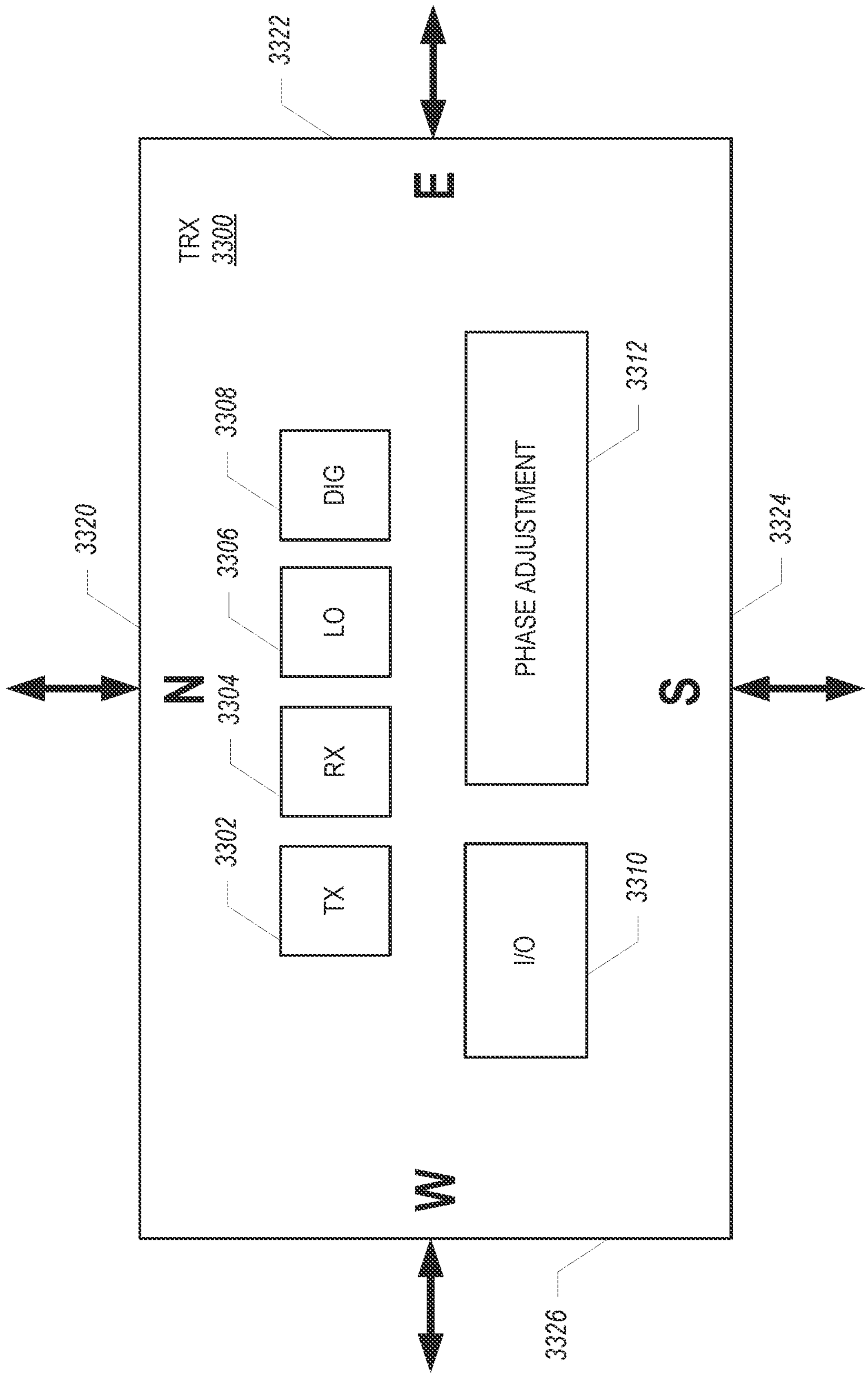
FIG. 33 is a block diagram of an exemplary transceiver cell element which can be used in a scalable phased array radio transceiver architecture according to some aspects.

FIG. 33 is a block diagram of a transceiver cell element which can be used in a scalable phased array radio transceiver architecture according to some aspects. Referring to FIG. 33, the transceiver cell (TRX) 3300 can include transmitter (TX) circuitry 3302, receiver (RX) circuitry 3304, a local oscillator (LO) circuitry 3306, digital circuitry (DIG) 3308, input/output (I/O) circuitry 3310, and phase adjustment circuitry 3312. In some aspects, a set of multiplexers and de-multiplexers can be tiled on the four edges 3320-3326 of the transceiver cell 3300 to allow communication with adjacent cells. The four edges of the transceiver cell 3300 can be designated as a North (N) edge 3320, an East (E) edge 3322, a South (S) edge 3324, and a West (W) edge 3326. The I/O circuitry 3310 can include both analog and digital parallel buses that connect the transceiver cell 3300 to neighboring cells, which allows tiling of the cells into a transceiver array. In some aspects, the TX circuitry 3302 and the RX circuitry 3304 can have either single or multiple transmitters and receivers respectively, allowing multiple receiver and transmitter chains to share a single local oscillator signal in order to save power consumption. In some aspects, a crystal oscillator signal, which can be used to generate the local oscillator signal within each transceiver cell, can be buffered and shared between multiple transceiver cells. In some aspects, a loopback can be used to measure and calibrate out a delay introduced by the crystal oscillator buffers in each transceiver cell. The transceiver cell 3300 can also include control circuitry (not illustrated in FIG. 33), which can be used to process control signals connecting the transceiver cell 3300 to other neighboring cells as well as global control signals that are static. In some aspects, the control circuitry can be included as part of the digital circuitry 3308.

In some aspects, the TX circuitry 3302 and the RX circuitry 3304 can include amplifiers, variable gain amplifiers, mixers, baseband filters, analog-to-digital converters, digital-to-analog converters, and other signal processing circuitry. In some aspects, the digital circuitry 3308 can include circuitry performing digital signal processing, filtering, as well as digital signal combination and phase adjustment. In some aspects, phase adjustment and signal combination can be performed by the phase adjustment circuitry 3312, both in analog or digital domain.

Figure 34:
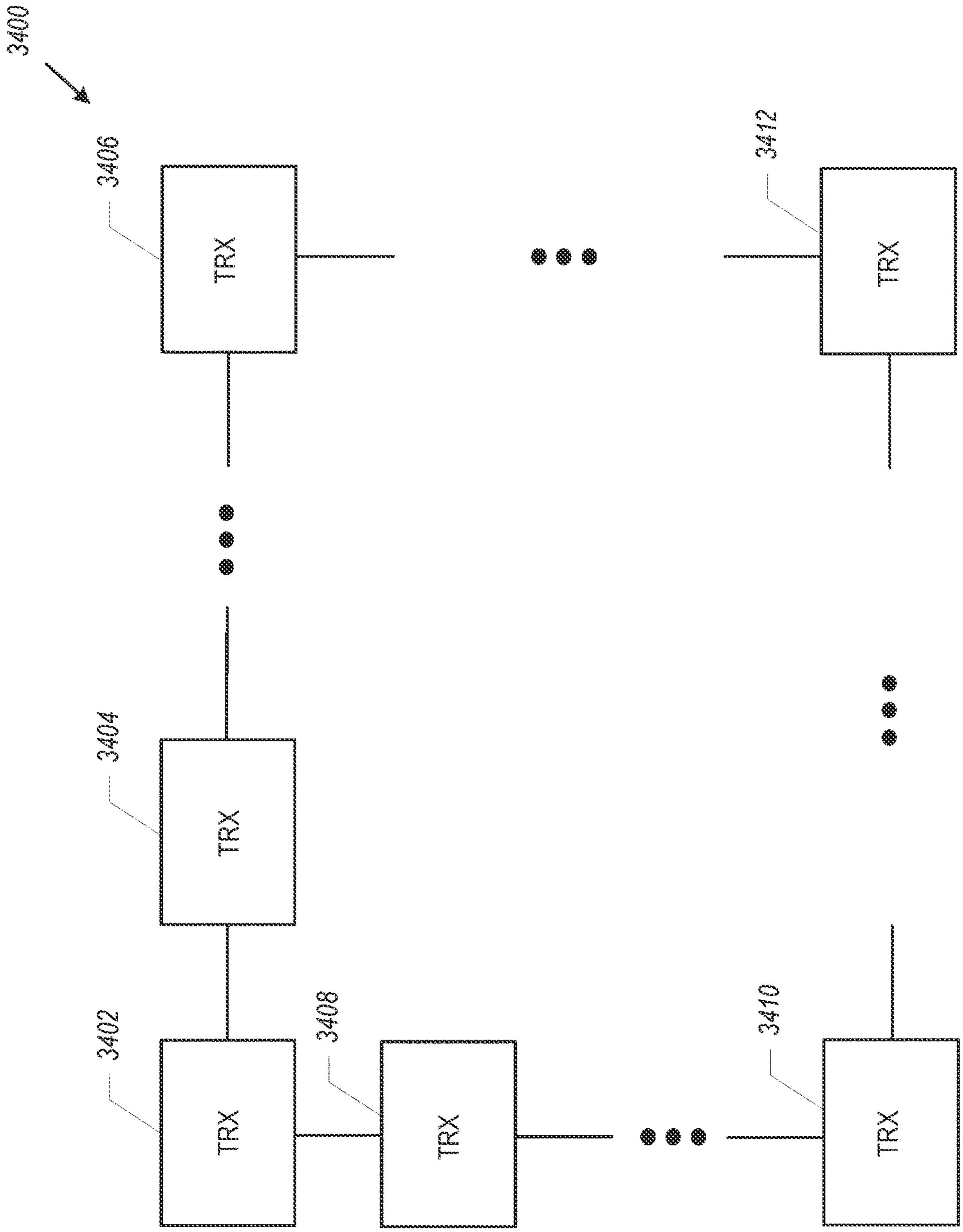
FIG. 34 is a block diagram of an exemplary phased array radio transceiver architecture using multiple transceiver cells according to some aspects.

FIG. 34 is a block diagram of a phased array radio transceiver architecture using multiple transceiver cells according to some aspects. Referring to FIG. 34, the transceiver array 3400 can include multiple transceiver cells tiled together in an array. More specifically, each of the transceiver cells 3402-3412 can be a copy exact of each other, and each of the transceiver cells 3402-3412 can include functional blocks as described in reference to FIG. 33. The communication between the individual transceiver cells 3402-3412 can include analog and digital buses. In some aspects, the width of the buses can be equal to the number of simultaneous users that the phased array system can support, as further explained herein below. As seen in FIG. 34, each transceiver cell can be connected to only adjacent transceiver cells, which ensures the scalability of the transceiver architecture using multiple transceiver tiles.

Figure 35:
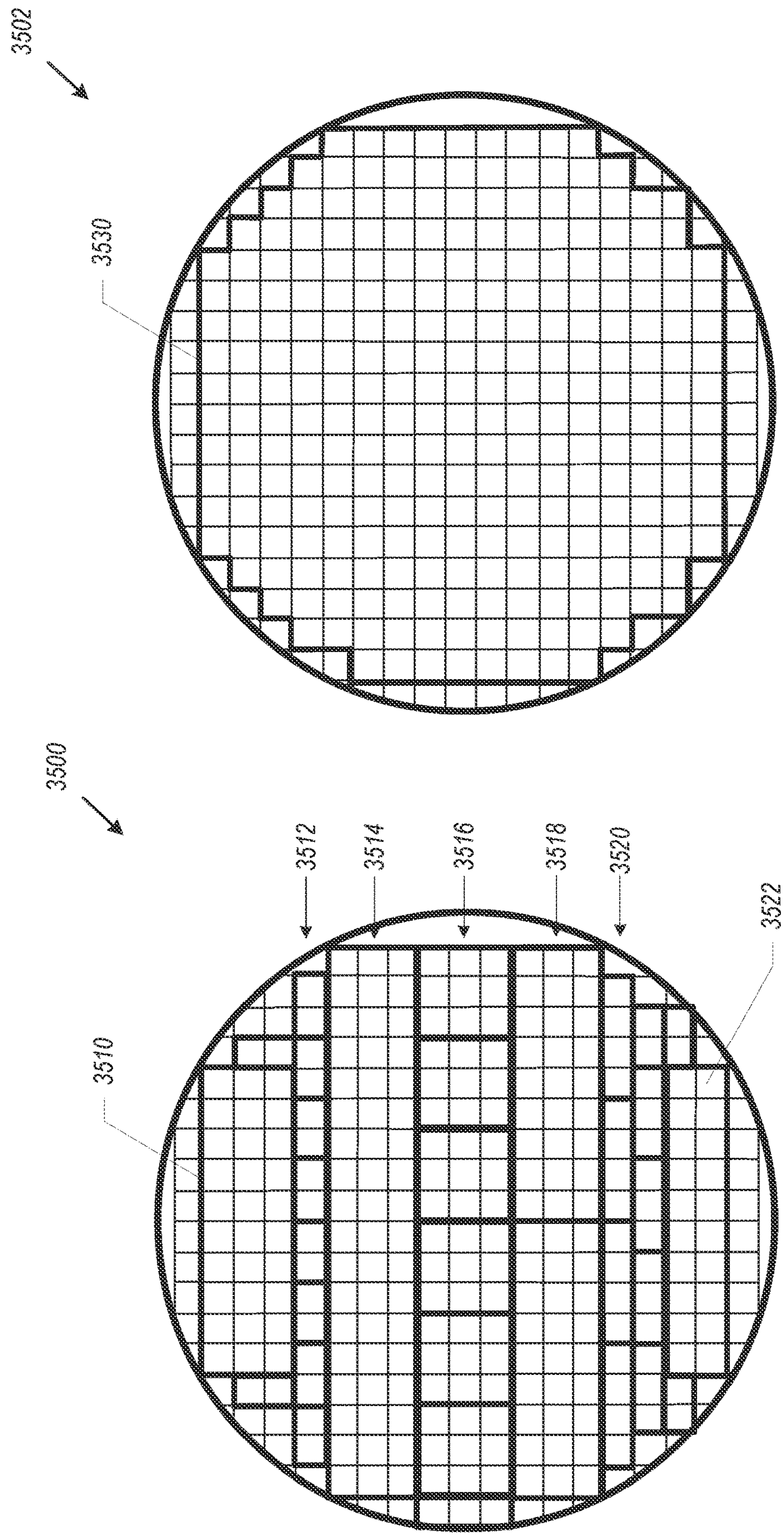
FIG. 35 illustrates exemplary dicing of semiconductor die into individual transceiver cells forming phased array radio transceivers according to some aspects.

In some aspects, the transceiver architecture using multiple transceiver tiles can be implemented on a single semiconductor die, which can enable dicing of the semiconductor wafer into different shapes and array sizes for different applications, as illustrated in FIG. 35.

FIG. 35 illustrates dicing of semiconductor die into individual transceiver cells forming phased array radio transceivers according to some aspects. Referring to FIG. 35, semiconductor wafers 3500 and 3502 are illustrated. The wafers 3500 and 3502 can be fabricated to include multiple transceiver tiles (or cells) connected to each other during the fabrication process. In connection with the wafer 3500, different phased array radio transceivers can be diced out of the wafer 3500 for different applications. For example, a 10×3 array 3510, multiple 1×2 arrays 3512, a single 3×18 array 3514, multiple 3×3 arrays 3516, multiple 3×9 arrays 3518, multiple 1×4 arrays 3520, and a single 2×10 array 3522 can be diced out of the semiconductor wafer 3500 and used for different low-power applications with varying system-level requirements.

In some aspects, in high-performance systems (e.g., base station applications), the single semiconductor die 3502 can be diced so that a single transceiver array 3530 is obtained. In this regard, the same semiconductor wafer can be filled with multiple copies of the same transceiver cell (e.g., 3300) and then the semiconductor wafer can be diced to obtain transceiver arrays with different form factors.

Figure 36:
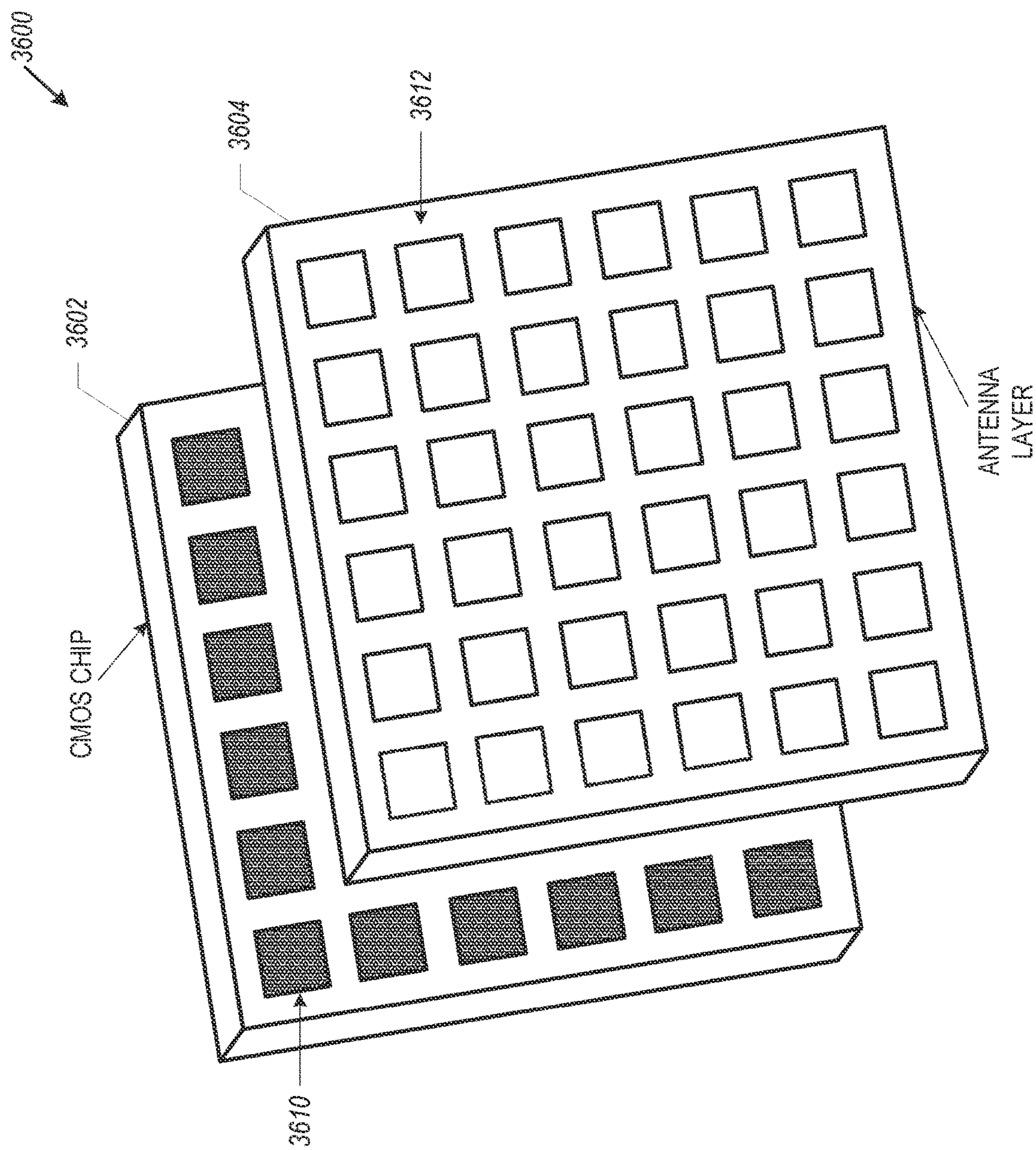
FIG. 36 is a block diagram of an exemplary phased array radio transceiver architecture packaged with a phased array antenna according to some aspects.

FIG. 36 is a block diagram of a phased array radio transceiver architecture packaged with a phased array antenna according to some aspects. Referring to FIG. 36, the phased array radio transceiver architecture package 3600 can include transceiver array 3610 with tiled transceiver cells disposed on a semiconductor die 3602. The transceiver array 3610 can be combined with antenna layer 3604 of antennas in an antenna array 3612, which can be integrated with the transceiver array 3610 to form the phased array radio transceiver architecture package 3600. In some aspects, a pitch of individual transceiver cells within the transceiver array 3610 can equal to a pitch of the individual antennas in the antenna array 3612.

In some aspects, a configurable phased array transceiver system including a plurality of identical transceiver cells (e.g., transceiver array 3400 with multiple transceiver cells such as cell 3300) can include self-aware configurable structures for performing self-configuration. More specifically, a processor circuitry associated with the transceiver array 3400 (or processes circuitry within one or more of the individual transceiver cell 3300) can perform self-configuration upon power up. For example, identification numbers (IDs) for each of the transceiver cells within the transceiver array 3400 can be determined at power up, e.g., by an ID assignment algorithm. By having associated ID numbers for each transceiver cell, the transceiver array 3400 can provide configuration information indicating the number and/or location of individual transceiver cells that are activated within the transceiver array 3400 so that each identical cell can be individually addressed for control and configuration.

The four sides of the transceiver array chip can be referred to as North (N), South (S), West (W), and East (E). Upon power up, ID #1 can be assigned to the NW corner cell, e.g., transceiver cell 3402. The NW corner of the transceiver array 3400 can be determined by location connection ports that can detect whether the port is open or shorted with another port.

For example, the processor circuitry can determine that both the N and W ports of transceiver cell 3402 are open and, therefore, the initial ID #1 is assigned to that cell. The transceiver cell 3402 can then initiate the numbering sequence, where the ID number can be incremented by one and passed to the neighboring transceiver cell to the east. If a current cell has no E port connection (e.g., cell 3406) and it received its ID number from the west cell, then it passes the ID number to the south cell. If the current cell has no E port connection and it received its ID number from the north cell, then it passes the ID number to the west cell (if connected, otherwise it also passes the ID number to the south cell). Similar process can be used for the west boundary of the array. This is continued until a SE or SW corner cell is reached. At that point, the ID numbering is complete. Additionally, when the ID number of a cell is assigned, the cell can undergo a local amplitude and phase calibration of both transmit and receive amplitude and phase values. Once the self-calibration process is complete and each transceiver cell within the transceiver array has an assigned ID number, the ID numbers can be used to further configure the array for processing signals associated with different number of users. In the example array 3400 in FIG. 34, the ID assignment/numbering can start at cell 3402, then continue sequentially to the right until cell 3406, then go down and continue to the left until cell 3408, then go down and continue to the right, and so forth.

In some aspects, a scalable phased array radio transceiver architecture, such as transceiver array 3400, can support multiple modes of operation. Example modes of operation include LO phased array (or beamforming) operation mode, digital phased array (or beamforming) operation mode, analog phased array (or beamforming) operation mode, and hybrid phased array (or beamforming) operation mode. Each of the operation modes can be implemented using the transceiver cell (e.g., 3402 or 3300) discussed above, allowing size scalable operation and configuration of the array 3400.

Figure 37:
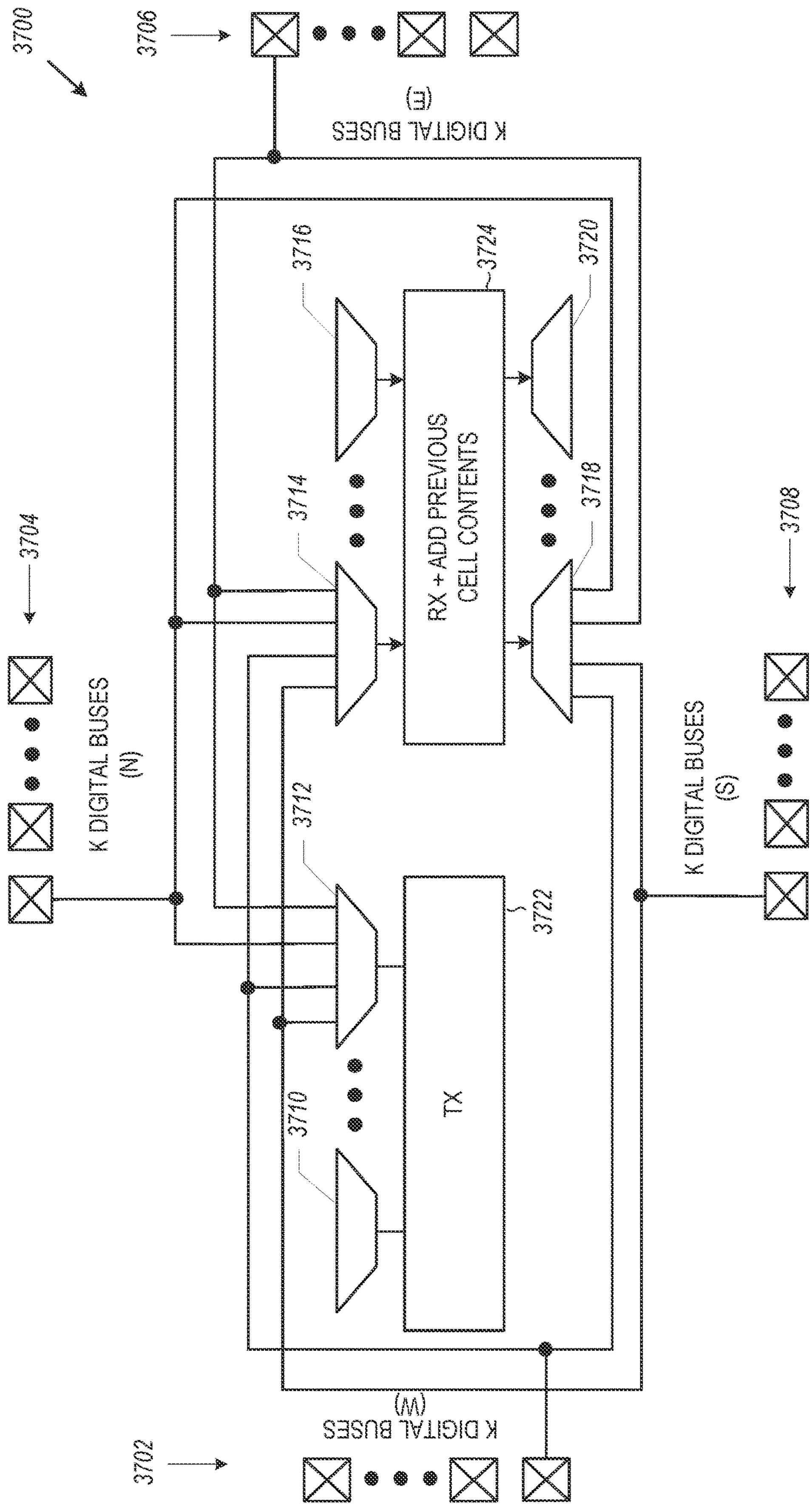
FIG. 37 is a block diagram of an exemplary transceiver cell with communication busses according to some aspects.

FIG. 37 is a block diagram of a transceiver cell with communication busses according to some aspects. Referring to FIG. 37, the transceiver cell 3700 can be the same as transceiver cell 3300 discussed above in reference to FIG. 33.

During an example digital beamforming operation mode, transceiver related elements within the transceiver cell 3700 can be used. For example, in a receive mode, the receive signal can be converted to digital signal, then a vector summed within the transceiver cell 3700 with a digital signal received from a neighboring transceiver cell with the previous ID number. To maintain scalability, the summation between each stage can be pipelined in order to limit the loading on the data bus lines. Additionally, in order to support a total of K users (or equivalently K independent beams for the phased array), K number of bus lines can be used, one for each user.

In some aspects, the number of bus lines can be fixed in hardware, and each transceiver cell can therefore be designed with the hardware to support the maximum number of users (or beams) during digital phased array operation. Since the data lines are pipelined, an internal pipeline register of depth ND may be maintained. The pipelined depth $N_D$ can limit the maximum transceiver array size where the individual transceiver cells are connected for a digital phased array mode of operation. Larger array size (or number of identical transceiver cells) requires larger pipeline register depth $N_D$.

As seen in FIG. 37, the transceiver cell 3700 is configured for digital beamforming operation mode using K digital buses to communicate with neighboring cells. For example, K number of digital buses 3702, 3704, 3706, and 3708 can be used to communicate with transceiver cells located to the west, north, east, and south, respectively. The transceiver cell 3700 can include a transmitter block 3722 and a receiver block 3724. The transmitter block 3722 and receiver block 3724 can be coupled to the K number of digital buses via digital multiplexers 3710-3712, 3714-3716, and 3718-3720, which can be used for selection of digital inputs from a specific neighboring transceiver cell. Receive digital signals from a neighboring cell can be added and then passed on to the subsequent neighboring cell in a pipelined fashion.

Figure 38:
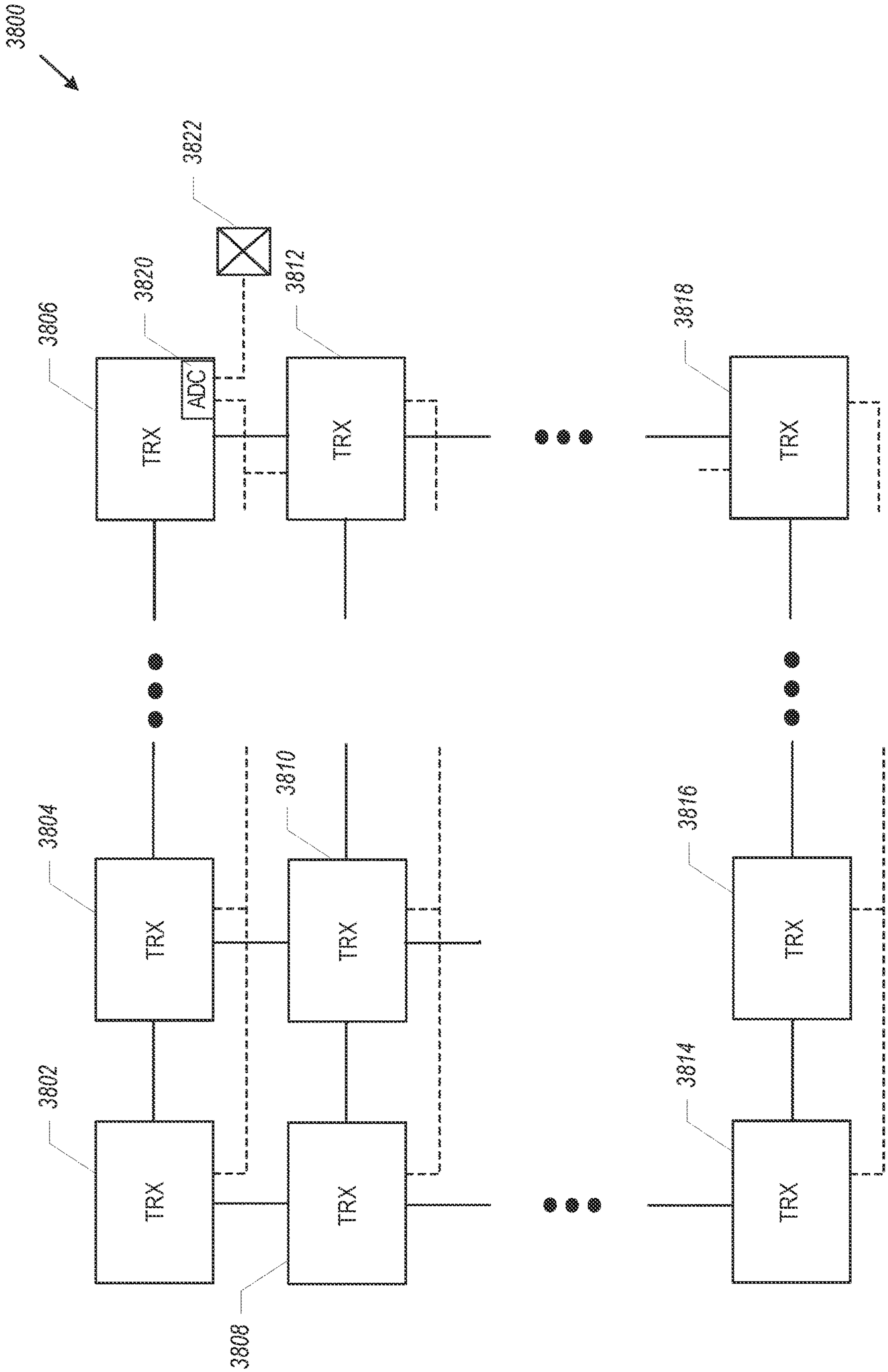
FIG. 38 is a block diagram of an exemplary phased array transceiver architecture with transceiver tiles in LO phase-shifting operating mode using a single analog-to-digital converter (ADC) according to some aspects.

FIG. 38 is a block diagram of a phased array transceiver architecture with transceiver tiles in LO phase shifting operating mode using a single analog-to-digital converter (ADC) according to some aspects. Referring to FIG. 38, the phased array transceiver 3800 can include a plurality of transceiver cells 3802-3818. The transceiver cells 3802-3818 can be the same as the transceiver cell 3300 illustrated in FIG. 33.

In an example LO phased array operation mode, each transceiver cell 3802-3818 can receive a phase shift signal from a central control unit (not illustrated in FIG. 38). The central control unit can be a processor used by the transceiver array 3800 or it can be one or more processors within an individual transceiver cell. In the receive path, the phase shift signals can be applied to a local oscillator signal to generate a phase shifted LO signal. The outputs of all mixer stages can be summed in the analog domain, bypassing any analog-to-digital conversion. More specifically, after a received wireless signal is down-converted using the phase shifted LO signal, the resulting signal can be summed with a signal received from a neighboring cell (e.g., a transceiver cell along the west edge) and then passed to another neighboring transceiver cell (e.g., a transceiver cell along an east edge).

In reference to the transceiver array 3800 in FIG. 38, the analog down-converted signals are summed as they are passed between neighboring cells, and a final summed analog signal is communicated to transceiver cell 3806. An analog-to-digital converter 3820 within transceiver cell 3806 can be used to convert the analog signal to a digital signal, which can then be communicated for processing to the baseband circuit 3822. In this regard, only a single ADC would take the combined analog signal outputs of all transceiver cells 3802-3818 and translate the combined analog signal output into a digital signal. The combination of the multiple analog signals from each of the transceiver cells 3802-3818 can be performed through an analog bus line that interfaces between the adjacent transceiver cells. By using a single ADC within the transceiver array 3800, a significant power reduction can be achieved since the ADC is one of the largest power consuming blocks in a phase shifted array system.

Figure 39:
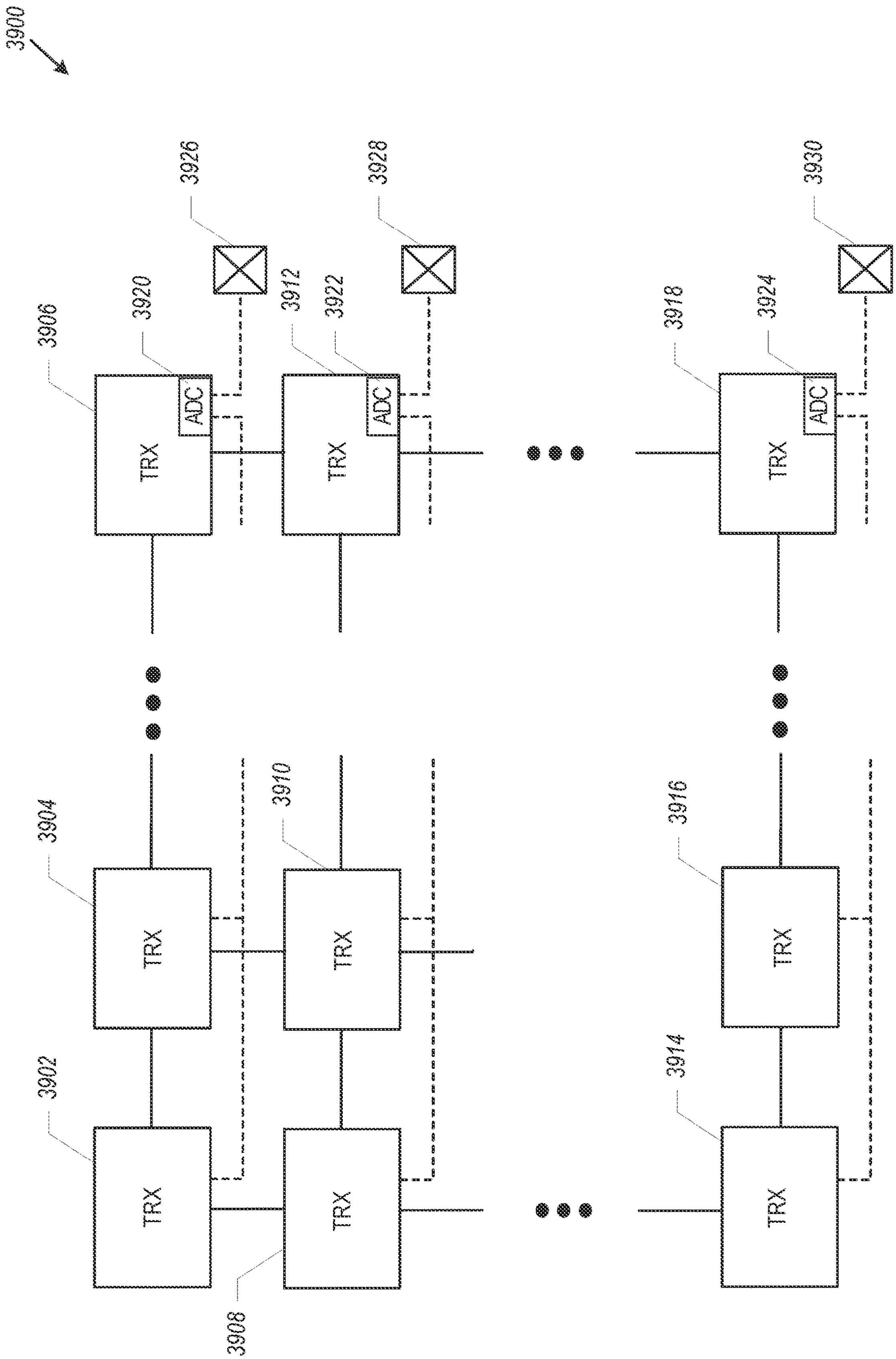
FIG. 39 is a block diagram of an exemplary phased array transceiver architecture with transceiver tiles in LO phase-shifting operating mode using multiple ADCs according to some aspects.

FIG. 39 is a block diagram of a phased array transceiver architecture with transceiver tiles in LO phase shifting operating mode using multiple ADCs according to some aspects. Referring to FIG. 39, the transceiver array 3900 can include a plurality of transceiver cells 3902-3918. The transceiver cells 3902-3918 can be the same as the transceiver cell 3300 illustrated in FIG. 33. In an example LO phased array operation mode with multiple subarrays, each transceiver cell 3902-3918 can receive a phase shift signal from a central control unit (not illustrated in FIG. 39). The central control unit can be a processor used by the transceiver array 3900 or it can be one or more processors within an individual transceiver cell.

As seen in FIG. 39, multiple neighboring transceiver cells within a row of the transceiver array 3900 can form a subarray. For example, transceiver cells 3902-3906 can form a transceiver subarray. Similar subarrays can be formed by transceiver cells 3908-3912 and 3914-3918. In the receive path for each of the subarrays, the phase shift signals can be applied to a local oscillator signal to generate a phase shifted LO signal. The outputs of all mixer stages within a subarray can be summed in the analog domain, bypassing any analog-to-digital conversion and then communicated to a single ADC associated with the subarray. More specifically, after a received wireless signal is down-converted using the phase shifted LO signal, the resulting signal can be summed with a signal received from a neighboring cell (e.g., a transceiver cell along the west edge) within the subarray of cells 3902-3906, and then passed to another neighboring transceiver cell (e.g., a transceiver cell along an east edge) within the subarray.

In reference to the transceiver subarray of cells 3902-3906, the analog down-converted signals are summed as they are passed between neighboring cells, and a final summed analog signal is communicated to transceiver cell 3906. An analog-to-digital converter 3920 within transceiver cell 3906 can be used to convert the analog signal to a digital signal, which can then be communicated for processing to the baseband circuit 3926.

In reference to the transceiver subarray of cells 3908-3912, the analog down-converted signals are summed as they are passed between neighboring cells, and a final summed analog signal is communicated to transceiver cell 3912. An analog-to-digital converter 3922 within transceiver cell 3912 can be used to convert the analog signal to a digital signal, which can then be communicated for processing to the baseband circuit 3928.

In reference to the transceiver subarray of cells 3914-3918, the analog down-converted signals are summed as they are passed between neighboring cells, and a final summed analog signal is communicated to transceiver cell 3918. An analog-to-digital converter 3924 within transceiver cell 3918 can be used to convert the analog signal to a digital signal, which can then be communicated for processing to the baseband circuit 3930.

In comparison to the transceiver array 3800 of FIG. 38 where all transceiver cell elements within the array are used to generate analog signals and a single ADC within the array is used to generate an output digital signal, the transceiver array 3900 in FIG. 39 uses one ADC per subarray, which allows for generation of multiple digital signals serving multiple users (e.g., M users can be served if transceiver array 3900 is divided into M subarrays, each with its own digital signal output). However, each user will be using only a fraction (1/M) of the total array aperture.

Figure 40:
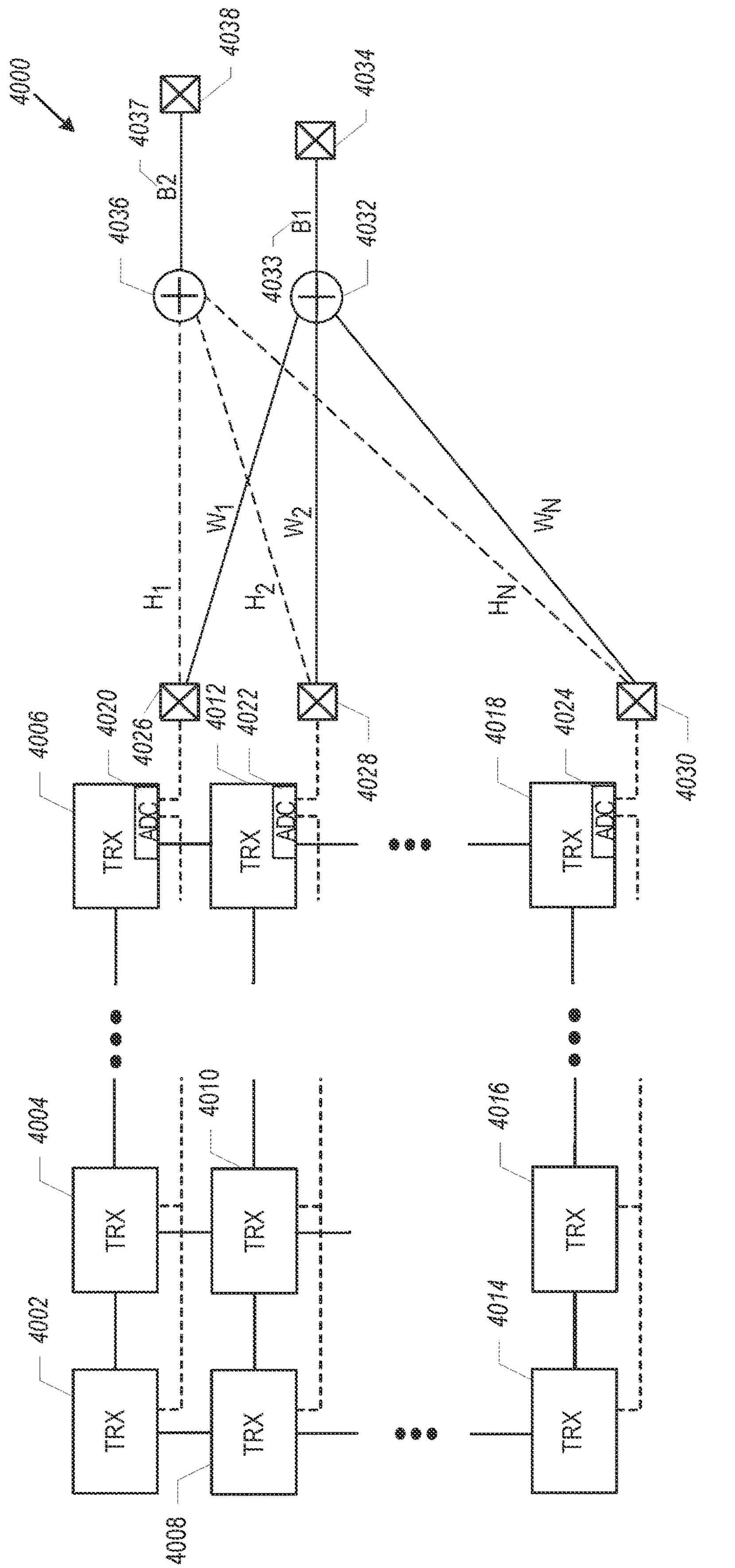
FIG. 40 is a block diagram of an exemplary phased array transceiver architecture with transceiver tiles in hybrid operating mode (LO and digital phase-shifting and combining) using multiple ADCs to generate multiple digital signals according to some aspects.

FIG. 40 is a block diagram of a phased array transceiver architecture with transceiver tiles in hybrid operating mode (LO and digital phase-shifting and combining) using multiple ADCs to generate multiple digital signals according to some aspects. Referring to FIG. 40, the phased array transceiver 4000 can include a plurality of transceiver cells 4002-4018. The transceiver cells 4002-4018 can be the same as the transceiver cell 3300 illustrated in FIG. 33. In an example hybrid operation mode, each of the transceiver cells 4002-4018 can receive a phase shift signal from a central control unit (not illustrated in FIG. 40). The central control unit can be a processor used by the transceiver array 4000 or it can be one or more processors within an individual transceiver cell.

As seen in FIG. 40, multiple neighboring transceiver cells within a row of the array 4000 can form a subarray. For example, transceiver cells 4002-4006 can form a transceiver subarray. Similar subarrays can be formed by transceiver cells 4008-4012 and 4014-4018. In the receive path for each of the subarrays, the phase shift signals can be applied to a local oscillator signal to generate a phase shifted LO signal. The outputs of all mixer stages within a subarray can be summed in the analog domain, bypassing any analog-to-digital conversion and then communicated to a single ADC associated with the subarray. More specifically, after a received wireless signal is down-converted using the phase shifted LO signal, the resulting signal can be summed with a signal received from a neighboring cell (e.g., a transceiver cell along the west edge) within the subarray of cells 4002-1106, and then passed to another neighboring transceiver cell (e.g., a transceiver cell along an east edge) within the subarray. In reference to the transceiver subarray of cells 4002-4006, the analog down-converted signals are summed as they are passed between neighboring cells, and a final summed analog signal is communicated to transceiver cell 4006. An analog-to-digital converter (ADC) circuit 4020 within transceiver cell 4006 can be used to convert the analog signal to a digital signal, which can then be communicated for processing to the baseband circuit 4026.

In reference to the transceiver subarray of cells 4008-4012, the analog down-converted signals are summed as they are passed between neighboring cells, and a final summed analog signal is communicated to transceiver cell 4012. An analog-to-digital converter 4022 within transceiver cell 4012 can be used to convert the analog signal to a digital signal, which can then be communicated for processing to the baseband circuit 4028.

In reference to the transceiver subarray of cells 4014-4018, the analog down-converted signals are summed as they are passed between neighboring cells, and a final summed analog signal is communicated to transceiver cell 4018. An analog-to-digital converter (ADC) circuit 4024 within transceiver cell 4018 can be used to convert the analog signal to a digital signal, which can then be communicated for processing to the baseband circuit 4030.

In an example hybrid operation mode, each of the baseband circuits 4026, 4028, and 4030 can apply one or more weight values (or coefficients) for purposes of generating beamforming signals. More specifically, coefficients $H_1$, $H_2$, . . . , $H_N$ can be associated with a desired beam 4037. Similarly, coefficients $W_1$, $W_2$, . . . , $W_N$ can be associated with a desired beam 4033. Baseband circuits 4026, 4028, and 4030 can apply coefficients $H_1$, $H_2$, . . . , $H_N$ to the digital signals received from ADC circuits 4020, 4022, and 4024. The weighted signals can be summed by adder 4036 to generate the desired beam 4037.

Similarly, baseband circuits 4026, 4028, and 4030 can apply coefficients $W_1$, $W_2$, . . . , $W_N$ to the digital signals received from ADC circuits 4020, 4022, and 4024. The weighted signals can be summed by adder 4032 to generate the desired beam 4033. Beams 4037 and 4032 can be further processed by baseband circuitry 4038 and 4034, respectively.

Even though FIG. 40 illustrates generation of two beams using two adders in digital domain, the disclosure is not limited in this regard. In some aspects, only a single set of weights can be applied to the digital outputs of the ADC circuits and only a single adder can be used to generate a single beam for a single user.

Figure 41:
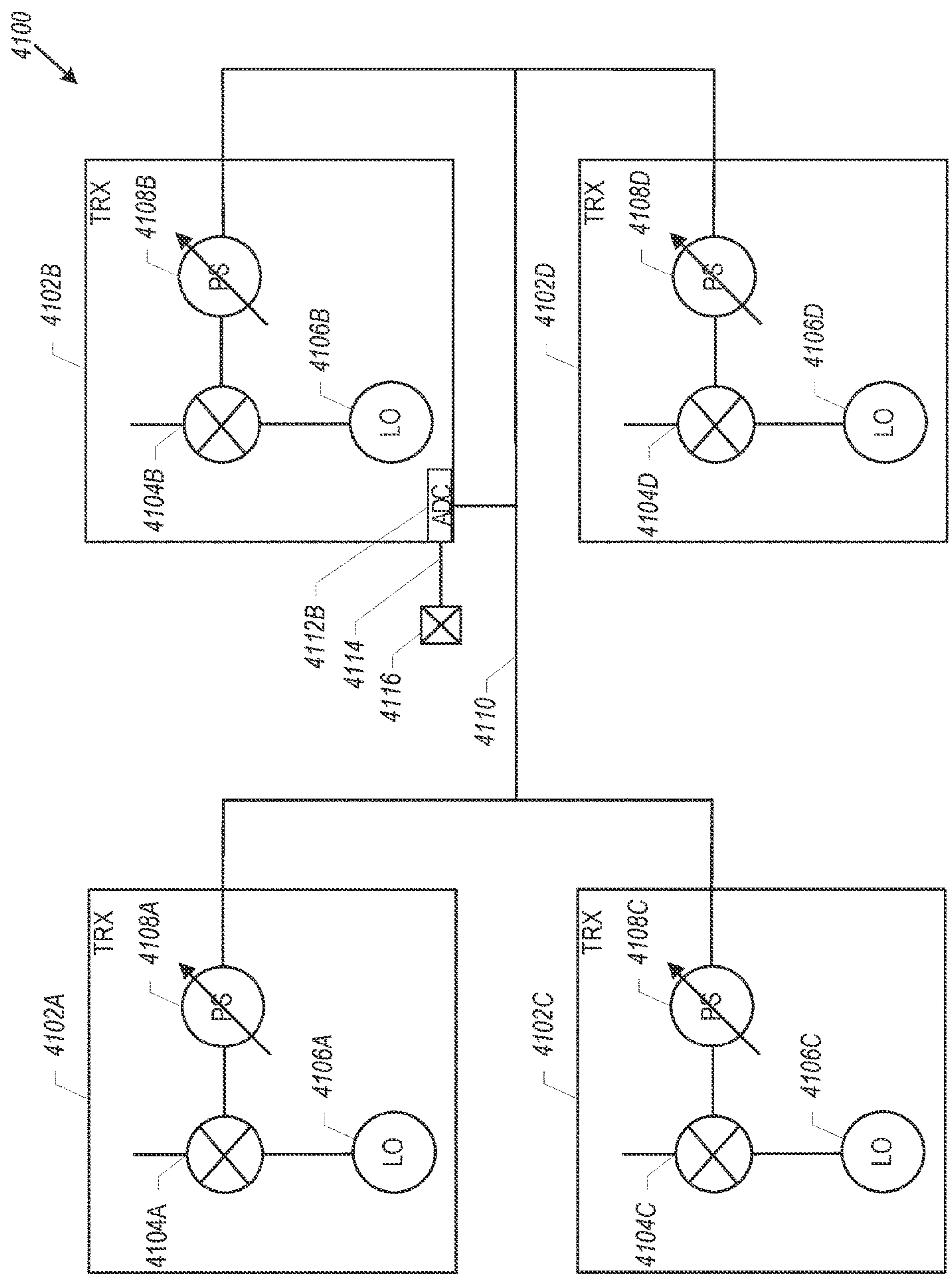
FIG. 41 is a block diagram of an exemplary phased array transceiver architecture with transceiver tiles in analog IF/baseband phase-shifting and combining operating mode using a single ADC according to some aspects.

FIG. 41 is a block diagram of a phased array transceiver architecture with transceiver tiles in analog IF/baseband phase shifting and combining operating mode using a single ADC according to some aspects. Referring to FIG. 41, the transceiver array 4100 can be configured to operate in an analog phase shifting (beamforming) operation mode. As seen in FIG. 41, each of the transceiver cells 4102A, 4102B, 4102C, and 4102D includes local oscillators 4106, mixers 4104, and phase shifters 4108. After a received wireless signal is down-converted by the mixers 4104, the phase shifters 4108 can apply a phase shift, which can be specified by control circuit within the transceiver array 4100. Phase shifted analog signals can be communicated to neighboring transceiver cells where they can be summed, resulting in a final combined signal 4110. The combined phase shifted baseband analog signal can be converted to a digital signal by a single ADC within the transceiver array 4100. For example, the combined signal 4110 can be communicated to ADC 4112B within transceiver cell 4102B, which can generate a digital signal 4114 for further processing by the baseband circuitry 4116.

Figure 42:
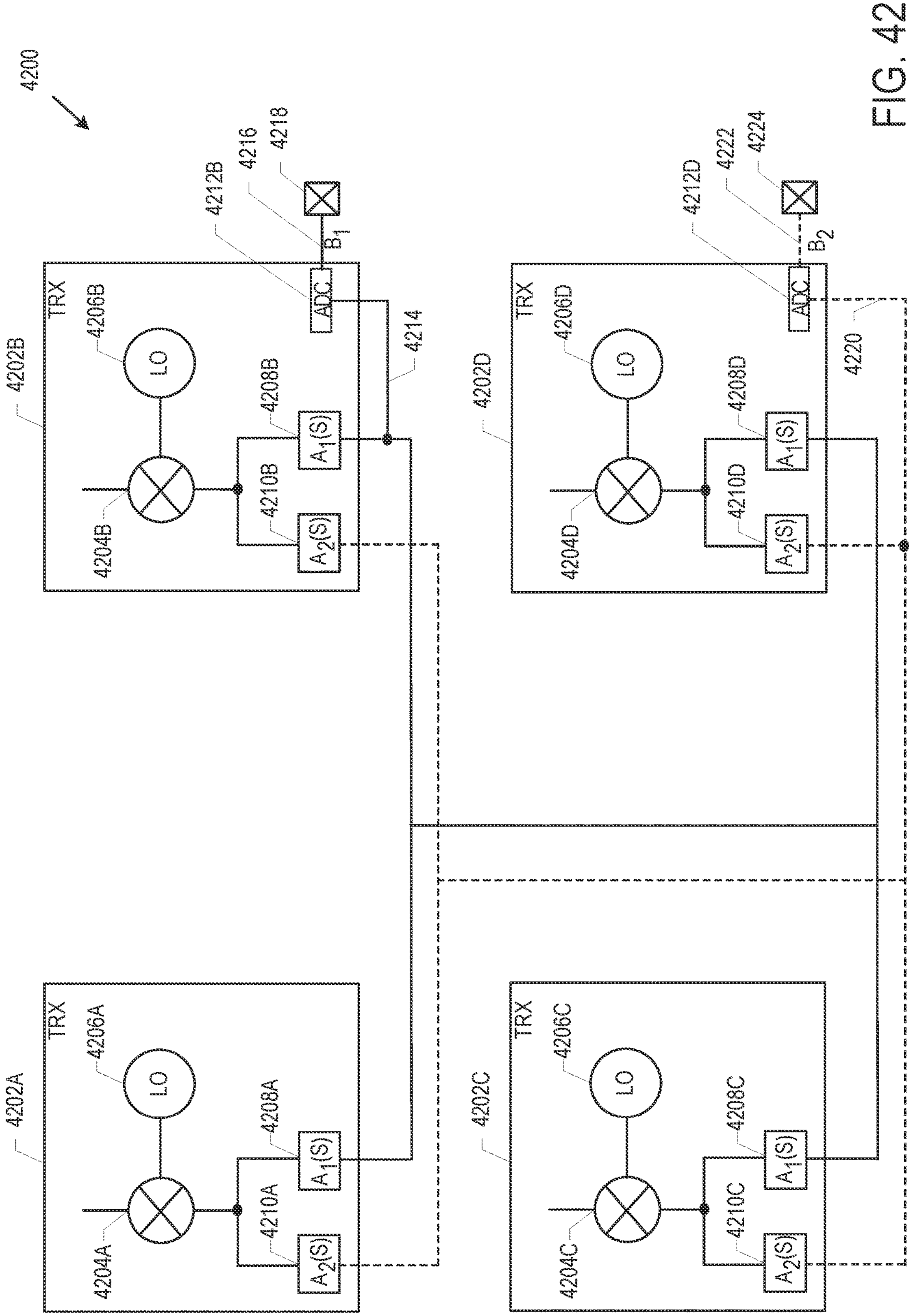
FIG. 42 is a block diagram of an exemplary phased array transceiver architecture with transceiver tiles in analog IF/baseband phase-shifting operating mode using multiple ADCs to generate multiple digital signals according to some aspects.

FIG. 42 is a block diagram of a phased array transceiver architecture with transceiver tiles in analog IF/baseband phase shifting operating mode using multiple ADCs to generate multiple digital signals according to some aspects. Referring to FIG. 42, the transceiver array 4200 can include transceiver cells 4202A, 4202B, 4202C, and 4202D. Each of the transceiver cells 4202 can include corresponding mixers 4204 (4204A-4204D) and local oscillator generators 4206 (4206A-4206D).

In some aspects, the analog baseband signals at the output of the mixers 4204 can be used to generate multiple output signals. More specifically, an analog coefficients set can be applied using an analog multiplier, and the output of each mixer to generate a weighted signal from each transceiver cell, which can be summed and converted to a digital signal by an ADC sub-system. As seen in FIG. 42, a first analog coefficients set A1(S) (4208A-4208D) can be applied at the output of mixers 4204A-4204D, respectively. The weighted signals can be summed to generate a combined signal 4214, which can be communicated to ADC 4212B within the transceiver cell 4202B. The ADC 4212B can generate an output digital signal 4216 for subsequent processing by the digital baseband circuit 4218.

Similarly, a second analog coefficients set A2(S) (4210A-4210D) can be applied at the output of mixers 4204A-4204D, respectively. The weighted signals can be summed to generate a combined signal 4220, which can be communicated to ADC 4212D within the transceiver cell 4202D. The ADC 4212D can generate an output digital signal 4222 for subsequent processing by the digital baseband circuit 4224. In this regard, by applying two separate parallel analog coefficients sets to each output of a transceiver cell mixer, two separate digital output signals corresponding to two separate beams can be used for two separate users. Even though only two output digital signals are illustrated in FIG. 42, the disclosure is not limited in this regard and a different number of parallel analog coefficients sets can be used as well.

FIG. 43 illustrates example operation modes of a phased array transceiver architecture with transceiver tiles according to some aspects. Referring to FIG. 43, table 4300 provides a summary of the number of parallel analog coefficients sets, data convergence, and parallel digital coefficients sets, which can be used for various operation modes of a scalable phased array radio transceiver architecture using multiple transceiver cells as described herein.

Referring to the first row in table 4300, a full aperture (e.g., a full array size) can be used for LO beamforming operation mode in a transceiver array. This mode is seen in FIG. 38, where the entire array is used (full aperture), no analog coefficients sets are used (as phase shifting is implemented with LO phase shifting and not in the analog baseband signal after the mixer), and a single ADC is used to generate a single digital output signal without any parallel digital coefficient sets used for subsequent processing.

Referring to the second row in table 4300, the full transceiver array can be used for digital beamforming operation mode. The analog outputs of each transceiver cell can be summed and N number of digital converters within the array can be used to generate N digital signals without the use of any parallel analog coefficients sets. The N digital outputs of the data converters can be used with M number of parallel digital coefficient sets to generate a final M number of output beams serving M users. The application of digital coefficient sets is illustrated in FIG. 40, where two digital coefficient sets are used for the output of N digital converters, to generate two final output beams serving two users.

Referring to the third row in table 4300, 1/M of the transceiver array aperture is used to serve M users. This example is illustrated in FIG. 39 where subarray processing is used with M number of analog-to-digital converters (assuming the array 3900 has M rows). The M digital outputs from the analog-to-digital converters can be subsequently processed (e.g., as seen in FIG. 40) using up to M number of parallel digital coefficient sets.

Referring to the fourth row in table 4300, a full aperture of the transceiver array can be used with analog phased array operation mode. For example and as seen in FIG. 42, and M number of parallel analog coefficients sets can be used along with M number of digital converters to generate an M number of output signals. In reference to FIG. 42, M equals two so that to parallel analog coefficients sets are used per transceiver cell, with two digital converters, generating to output beam signals. Up to M parallel digital coefficient sets can be subsequently used with the beam signal outputs of the data converters.

Previous wireless user device antenna array designs have raised at least three issues. One issue is that previous designs incorporated a shielded silicon die that feeds antenna arrays, where the shield is a discreet metal shield, and where the arrays may be on one or more levels of, or one or more sides of, a substrate that includes the shielded silicon die. This required a relatively large area substrate for the shielded die, discrete circuitry, and antenna arrays on one or more levels, or on one or more sides, of the substrate. A design that requires a large area substrate implies more expensive substrates. In designs of the above type, it is not unusual for the substrate to approach being twice as expensive as the silicon die from which the antenna arrays are fed. In some aspects, the substrate may be a laminate structure. While laminate structures will be described herein, other substrates may also be used in other aspects.

A second issue encountered in designs of the above type is the routing of long feed lines from the die to some of the antenna elements because of the large areas involved. This leads to power loss, in some instances as much as a 3 dB loss, or a loss of nearly half the power, in feeding some of the antenna elements.

Third, while such designs may provide good phased array radiation in some areas of the substrate, in other areas the radiation from antenna elements or from entire antenna arrays could be blocked because of the shielding that covers the die and the discreet components to protect them from radio frequency interference (RFI) and electromagnetic interference (EMI).

Therefore, it is desirable to find solutions to the above three issues. One solution involves a design using a plurality of packages such as substrates or laminate structures. Described herein is a solution using two packages, as described in FIGS. 44A to 44D, in a package-on-package (POP) implementation, according to some aspects.

Figure 44A:
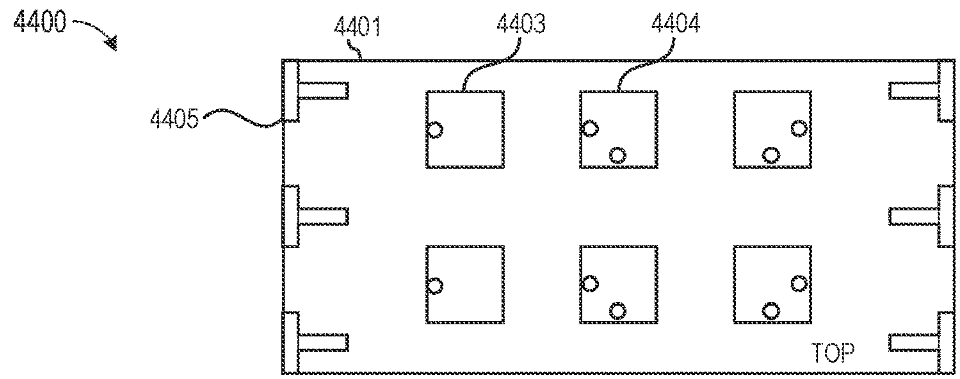
FIG. 44A illustrates a top view of an exemplary substrate of one package of a two-package system, according to some aspects.

FIG. 44A illustrates a top view of one package of a two-package system, according to some aspects. One package indicated generally at 4400 and specifically at 4401, may be a substrate which, in some aspects, has parallel metallized layers with a metallized top layer and a metallized bottom layer. The package 4400 may be incorporated in the RF circuitry 325 and the antenna array circuitry 330 of mmWave communication circuitry 300 shown in FIG. 3A, although the package 4400 is not limited to such. Parts or all of one or more of the metallized layers may be processed to be free of metallization as needed, in some aspects.

In some aspects, substrate 4401 includes an array of six patch antennas 4403, 4404. The designation 4403 represents patch antennas with a single match point, indicated by a single dot, and which may be a single patch antenna. The designation 4404 represents patch elements with two match points, indicated by two dots, and which may be a dual stacked patch antenna element. This design is but one of a number of configurations and types of antenna elements that might be used and is representative of only some aspects. Around the periphery of substrate 4501 are six antenna elements 4505, according to some aspects. These may be printed antenna elements situated for end fire operation according to some aspects. While dipole antenna elements are illustrated at 4505, other types of antenna elements may be used. In the description herein, some or all of the antenna arrays may be called intelligent antenna arrays.

The terms "intelligent antenna" or "intelligent antenna arrays" find meaning in the manner in which the antennas or the antenna arrays are controlled. In some aspects antenna arrays may be implemented with various types of polarities, such as vertical, horizontal and circular polarizations. As an example, when antenna arrays are implemented for vertical polarity and horizontal polarity, the transmitted polarity at a given time, and therefore which antenna or array is firing at a given time, may be algorithmically controlled based on an indication of the polarity of the signal received with greatest strength at the wireless user device, hence intelligent. This information can be continually fed back to a wireless transmitter such as a cell tower transceiver from the user device in some aspects. This operation may then be implemented to achieve transmitted polarization that matches the polarization at the receiver of the user device which may be a mobile phone. The user device antennas are also similarly algorithmically controlled in some aspects. Similar algorithmic control obtains for spatial diversity in some aspects.

Figure 44B:
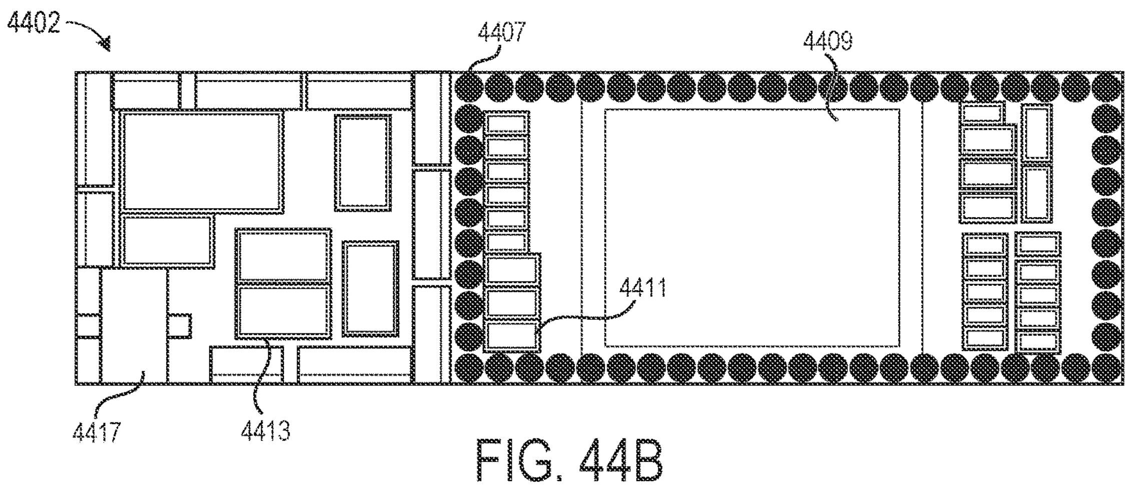
FIG. 44B illustrates a bottom view of the substrate of FIG. 44A, according to some aspects.

FIG. 44B illustrates a bottom view of the substrate 4401 of FIG. 44A, according to some aspects. In FIG. 44B, the structure is illustrated generally at 4402, and includes silicon die 4409 and discrete components, one of which is designated as 4411. The discrete components may be capacitors, resistors and/or inductors in some aspects. Surrounding the die are contacts 4407 which in some aspects may be solder balls.

Figure 44C:
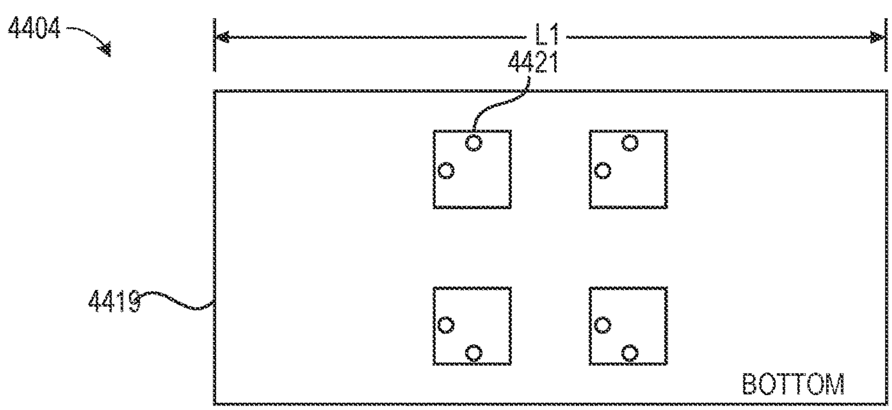
FIG. 44C illustrates a bottom view of an exemplary substrate of a second package of the two package system of FIGS. 44A and 44B, according to some aspects.

FIG. 44B illustrates a bottom view of the substrate of FIG. 44A, according to some aspects. FIG. 44C illustrates a bottom view of a substrate of a second package of the two package system of FIGS. 44A and 44B, according to some aspects. Structure 4419 of FIG. 44C may be a substrate such as a PCB board, as may be substrate 4401 of FIG. 44A, according to some aspects. Structure 4419 is of length L, which is essentially the same length of the line of contacts 4407 of FIG. 44B, in some aspects, which contacts are discussed below. Illustrated on structure 4419 are four antenna elements 4421 shown here as dual stacked patch antennas each with two match points indicated by the two dots on each antenna element. As with the substrate 4401, this design of antennas on or within substrate 4401 is one of a number of configurations and types of antenna elements that might be used and is representative of only some aspects.

Figure 44D:
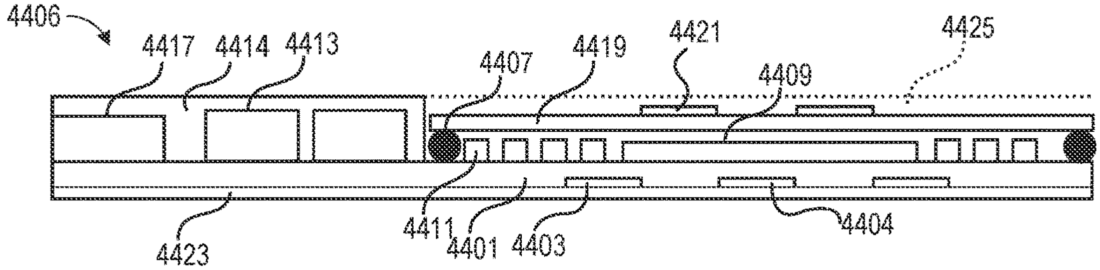
FIG. 44D illustrates the first package and the second package of FIGS. 44A through 44C, stacked in a package-on-package implementation, according to some aspects.

FIG. 44D illustrates the packages of FIGS. 44A and 44C mounted one to the other, according to some aspects. The first package 4401 and the second package 4419 are mounted, or stacked, one upon the other as a package-on-package implementation. The mounting can be done using various mounting processes. As can be seen by the POP aspect 4406, the antenna elements 4421 are on or within substrate 4419 on the "top" substrate, or "top package," of the POP aspect, and are pointing "upward." The antennas 4403, 4404 are on or within the "bottom" of substrate 4401, or "bottom package," of the POP aspect and are pointing "downward," according to some aspects. Connector 4417 and components 4413 may be secured and made robust by mold, or encapsulate, 4414, discussed below. Level 4423 includes metallized layers which in some aspects may be multiple metallized layers used for antennas and for feed lines.

Generally speaking, the concept of POP relates to vertically stacking packages that were not able to be stacked in previous aspects, and encompasses 3-dimensional (3D) stacking of antennas, dies, and components in packages. Some factors to be considered in 3-D stacking include antenna volume and antenna size. Previous designs were planar, which resulted in the shielded die design with the X-dimension and Y-dimension (e.g., width and length) being of dimensions that led to the large substrate area discussed above, with the issues of substrate cost, feed line power loss and loss of available space and blockage of radiation by the shield and other discreet components. Previous designs were based primarily on the assumption that volume of the package is more important than the X-dimension and the Y-dimension of the package, because of the importance of the Z-height dimension of the volume, there being a certain Z-height or "headroom" limitation for user device packages. But this assumption led to larger and larger X-Y area in order to decrease the Z-dimension, leading to the above issues. It has been discovered, however, that stacking package-on-package can lead to resolutions of these issues, resulting in less expensive substrates, a reduction in power loss through the routing of feed lines (very important, for example in 5G mmWave operation), and less radiation blockage. The aspects described herein focus on volume as opposed to focusing on area. In other words, it has been discovered by stacking that decreased X-dimension and the Y-dimension are important, and Z-height is somewhat less critical than previously believed.

Aspects may initially appear to increase Z-height somewhat because the aspects may, in fact, stack more components one on top of the other. But the result is a large reduction in the X-dimension and the Y-dimension, leading to solution of, or reduction of, the negative effects of the above issues of substrate cost, power lost through long feed lines, and radiation blocked by shields and other device obstructions.

Further, it is believed that the Z-height of POP stacking will, in fact, meet the requirements of current and future wireless user devices. Further still, the net area underneath or above the silicon that is used for intelligent antenna arrays, such as antenna elements 4403, 4404, and 4405, seen in top view in FIGS. 44A and 44C, and in side view in FIG. 44D take up significantly less room and require less overall feedline routing than in previous designs, according to some aspects. In other words, in the aspects of FIG. 44D, antennas 4403, 4404 are "under" and in close proximity to die 4409, and antennas 4421 are "above" and in close proximity to the die. The proximity is such that the feed lines that transmit the signals have traversed a very small distance, which means less, and in some aspects significantly less, power loss that was due to the routing of long feed lines in previous designs.

Further, some discreet components, one of which is enumerated 4413, and the connector 4417, that are not needed in the antenna feed process and can be placed laterally to the antennas, which in the aspect of FIGS. 44B and 44D, is out to the left of the antennas and die, so that with the entire POP implementation, the feed lines that connect the die to the antennas on the top and bottom of the package traverse a shorter distance to the antennas. Substrate 4401 is illustrated as coextensive with the length of contacts 4407 of FIG. 44B for purposes of illustrating the antenna elements but, as seen in FIG. 44D, substrate 4401 extends over the entirety of the components and connector.

As mentioned above, in previous designs, the die and the discreet components were placed under a metal shield so that the discrete components would be co-located at the die with the metal shield on top of both. That combination is actually taller than the POP aspects disclosed herein due to the fact that in package-on-package, the larger discreet components such as 4413 can in some aspects be offset from the die, and also because some of the volume of the Z-dimension that was useless in previous designs becomes useable space. This is seen as the usable space 4425 in FIG. 44D which is now available for placement of intelligent antennas or intelligent antenna arrays, such as antennas 4421 and the antenna arrays they form part of.

As mentioned above, surrounding the die are contacts 4407 in FIG. 44B and in FIG. 44D, which in some aspects may be solder balls. These contacts, for example solder balls as mentioned, contact at least one metallized layer of the substrate 4401. This is seen at FIGS. 44B and 44D. In the cut-away of FIG. 44D, the solder balls 4407 are seen to be also contacting both a metallized layer of substrate 4401 and a metallized layer of substrate 4419. Therefore, in some aspects, if the solder balls surrounding the die are spaced at high density, the combination of the solder balls and these two metallized layers, top and bottom, act as a Faraday cage, becoming a shield for die 4409, without the need for the bulk and height of the discreet metal shield used in previous designs. In some aspects, the contacts can be metallized vias and, if spaced at high density, can also act, in contact with an upper and a lower metallized layer, as a Faraday cage.

In some aspects the vias may be normal to the substrates. In some aspects the vias may be in pitched direction with respect to the substrates. In either case, the density of the spacing of the contacts, such as vias, or the density of the pitches between contacts are approximately $\lambda/20$ or less, where A is the wavelength of the frequency of operation. In view of the described Faraday cage, the mechanical shield of previous designs can be absent in the described aspects, making the Z-height smaller still.

In addition, antenna elements 4403, 4404 and antenna elements 4421 of packages 4401 and 4419, respectively, need not be in the same transceiver. An important advantage of stacked packages is to allow multiple radios and multiple systems to be stacked on top of each other or alongside each other. In some aspects, antennas 4403, 4404 may be coupled to a radio in a Wi-Fi system operating within a Wi-Fi frequency band, and antennas 4421 may be coupled to a radio in a mmWave Wireless Gigabit (WiGig) system, with the die 4409 having a Wi-Fi system configuration and a mmWave WiGig system configuration, in some aspects.

In some aspects, die 4409 may actually include a plurality of dies, for example one die configured for Wi-Fi operation connected to one group of antennas such as 4403, 4404 and a second die configured for mmWave WiGig operation connected to another group of antennas, such as 4421. Further, if antenna arrays such as patch elements 4403, 4404 and 4421 are electrically opposite each other because of the overlay of antenna elements such as in the POP configuration of FIG. 44D, and if the antennas are controlled to fire together, the radiation can be sideways in edge-fire operation such as indicated generally at 4420 in FIG. 44D, in some aspects.

Further still, in some aspects, firing of the antenna arrays on opposing sides of the package can be algorithmically controlled to fire in opposing directions, even at a one hundred-eighty degree(180°) angle opposition; and in some aspects, firing of the antenna arrays on opposing sides of the package can be in the same direction.

As seen in FIGS. 45A through 45D and FIGS. 46A through 46D, the number of antennas can vary in different aspects due to stacking, in some aspects. In previous designs antenna placement was limited to only specific places of the package due to the room taken up by the discreet metal shield. However, because of improvements due to stacking technology described herein there is usually no such limitation. Further, as mentioned above, the metal shield of previous designs causes radiation blockage, additionally limiting placement of the antennas. This limitation is largely eliminated in POP designs. Consequently, in some aspects, the number of antennas and the size and the shape of the antenna array can be customized according to the requirements of the device into which as particular package will be incorporated.

Figure 45A:
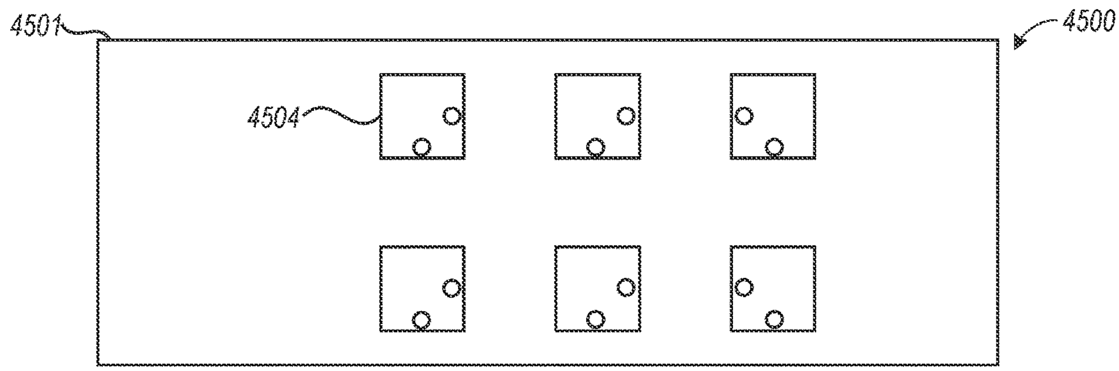
FIG. 45A illustrates a top view of another exemplary substrate of one package of another two-package system, according to some aspects.

The aspect illustrated in FIGS. 45A through 45D illustrates a variation of the aspect of FIG. 44A through 44D, with similar reference numerals referring to similar drawing items in both sets of figures. FIG. 45A illustrates a top view of a substrate of one package of another two-package system, according to some aspects. FIG. 44B illustrates a bottom view of the substrate of FIG. 44A, according to some aspects. FIG. 44C illustrates a bottom view of a substrate of a second package of the two package system of FIGS. 44A and 44B, according to some aspects.

Figure 45B:
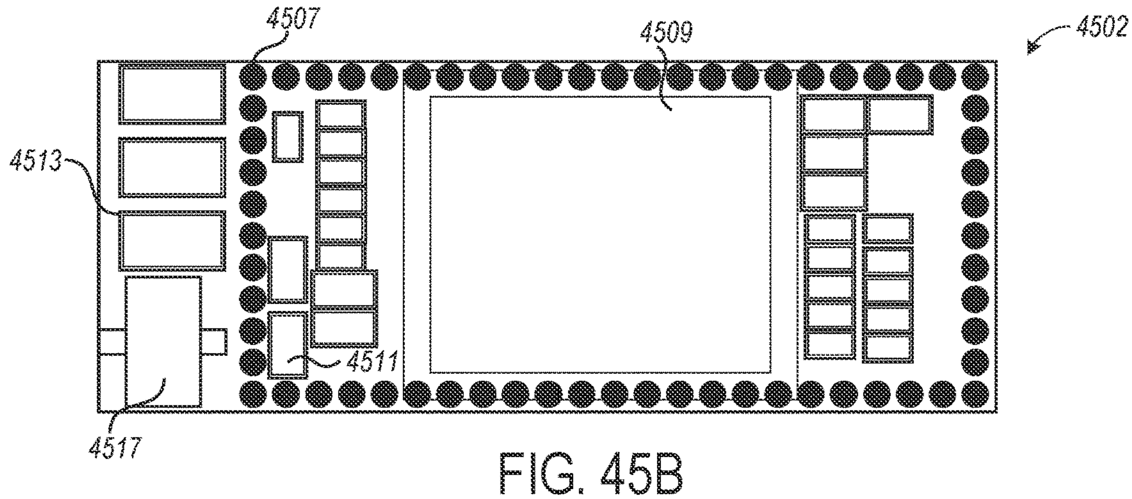
FIG. 45B illustrates a bottom view of the substrate of FIG. 45A, according to some aspects.

FIG. 45A illustrates package 4500 which includes substrate 4501 and antennas, one of which is identified as 4504. The antennas are illustrated as dual patch antennas by the two matching points which are indicated by two dots on each antenna element. Substrate 4501 is illustrated in top view. FIG. 45B is the bottom side of the substrate 4501 illustrated in FIG. 45A. Illustrated in FIG. 45B is RFIC die 4509 and discreet components, one of which is indicated as 4511. Contacts 4507, which in some aspects are solder balls, surround the periphery of the die and discreet components and contact at least one layer of substrate 4501. The horizontal dimension L2 of package 4504 is of substantially the same horizontal length as the contacts 4507 that form a Faraday cage, in some aspects.

In FIGS. 45A through 45D, antennas, such as patch antennas 4504 that may make up an antenna array on substrate 4501 and, patch antennas 4521 that may make up an array antenna on substrate 4519 may be placed symmetrically and vertically opposite each other as may be desired in some aspects. This will enable the antenna elements to be controlled to fire together and provide radiation in one or more desired directions, such as to provide radiation in opposing directions, normal to substrate 4519 by the array including antenna elements 4521, and normal to substrate 4501 by the array including antenna elements 4504. In some cases, depending on firing sequence, radiation of the two afore-mentioned arrays can be sideways in edge-fire operation as illustrated at 4520.

Figure 45C:
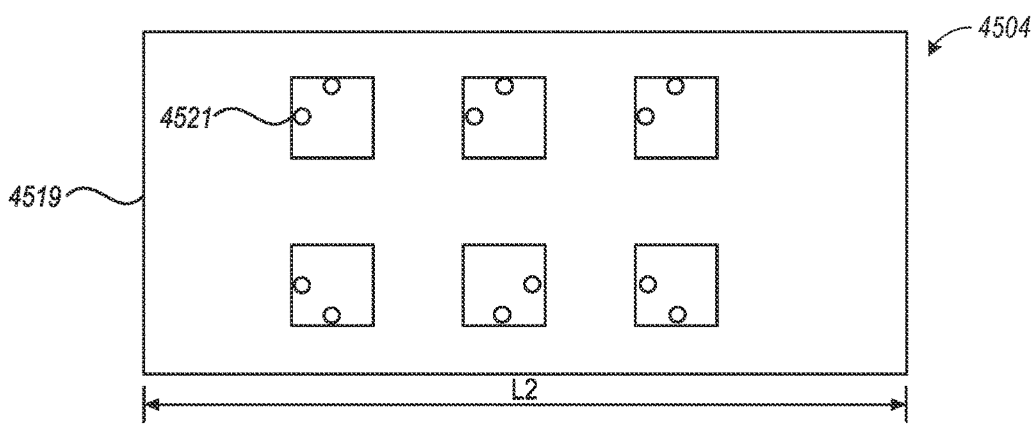
FIG. 45C illustrates a bottom view of an exemplary substrate of a second package of the two package system of FIGS. 45A and 45B, according to some aspects.
Figure 45D:
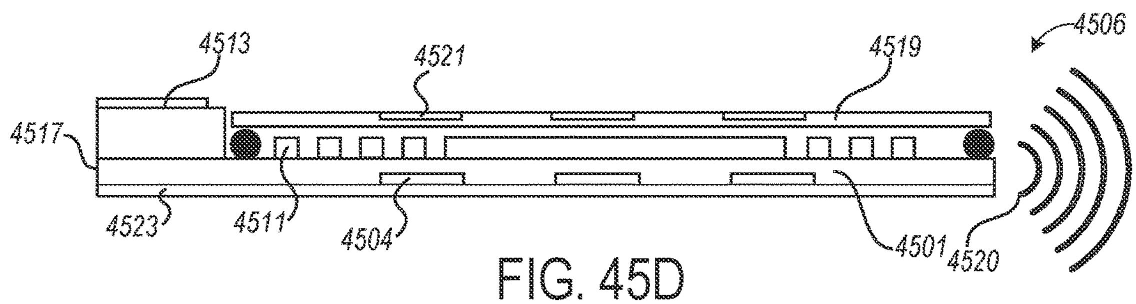
FIG. 45D illustrates the first package and the second package of FIGS. 45A through 45C, stacked in a package-on-package implementation, according to some aspects.

FIG. 45D illustrates the first package and the second package of FIGS. 45A through 45C, stacked in a package-on-package implementation, according to some aspects. The aspect 4506 of FIG. 45D is much the same as that of FIG. 44D. Like in FIG. 44D, stacking is not only advantageous for Z-height improvement, there are advantages in being able to use the X-Y area to provide better antenna radiation. Such advantages were not available in some previous designs as explained above.

Figure 46A:
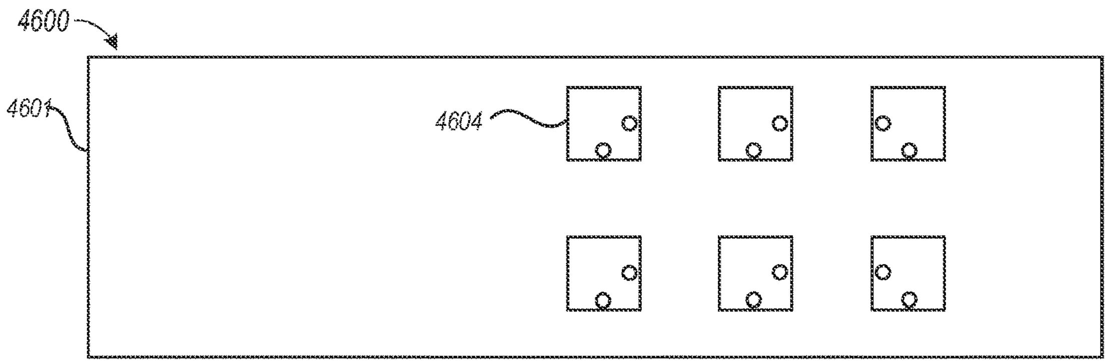
FIG. 46A illustrates a top view of an exemplary substrate of one package of a yet another two-package system, according to some aspects.
Figure 46B:
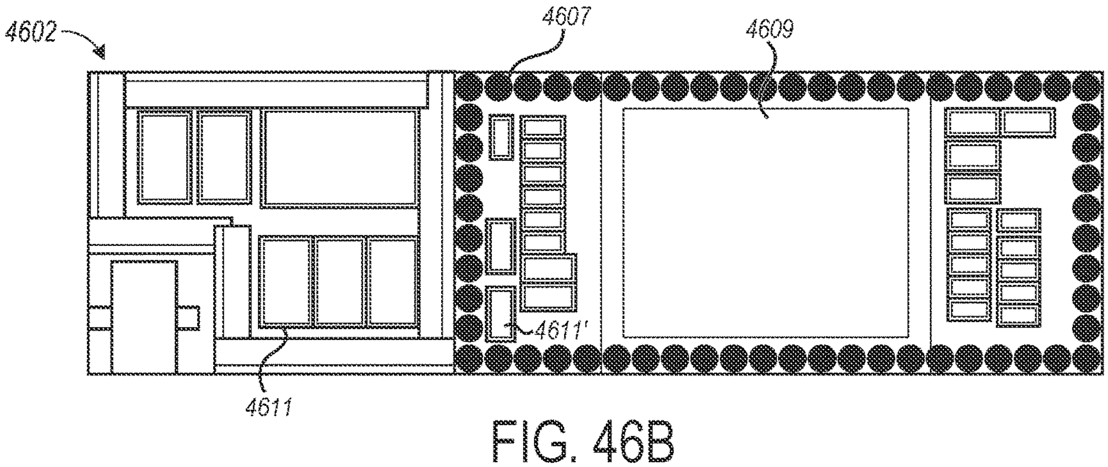
FIG. 46B illustrates a bottom view of the substrate of FIG. 45A, according to some aspects.
Figure 46C:
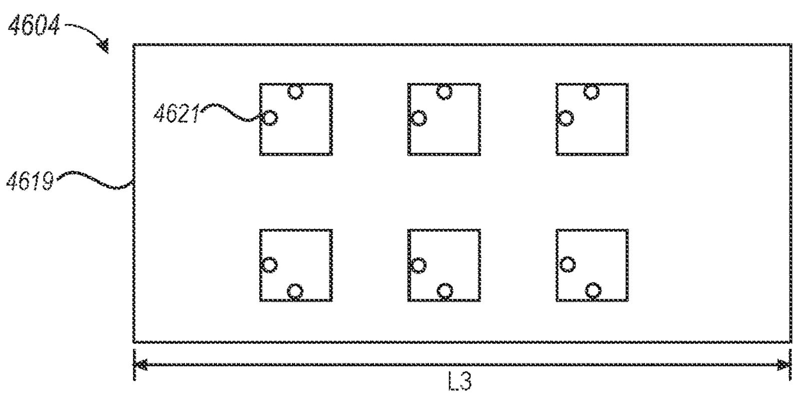
FIG. 46C illustrates a bottom view of an exemplary substrate of a second package of the two package system of FIGS. 45A and 45B, according to some aspects.
Figure 46D:
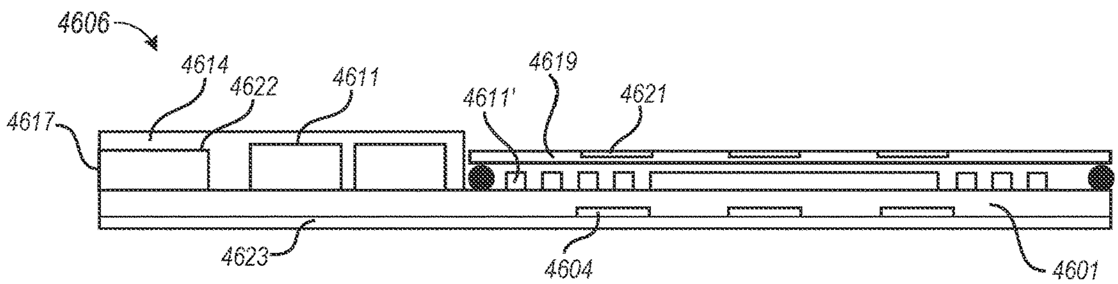
FIG. 46D illustrates the first package and the second package of FIGS. 46A through 46C, stacked in a package-on-package implementation, according to some aspects.

The aspect illustrated in FIGS. 46A through 46D is another variation of the aspect of FIG. 44A through 44D, with similar reference numerals referring to similar drawing items in both sets of figures. The horizontal dimension L3 of package 3604 of FIG. 46C is, as in FIG. 45C, of substantially the same horizontal length as the horizontal length of densely packed contacts 4607 that form part of a Faraday cage to shield die 4609. Discreet components 4611 have been placed laterally separated from die 4609 and are protected by an encapsulate 4614 in the package-on-package configuration of FIG. 46D in some aspects. The use of an encapsulate within packages, or in a package-on-package aspect, are explained in greater detail below with respect to FIG. 47D.

Figure 47A:
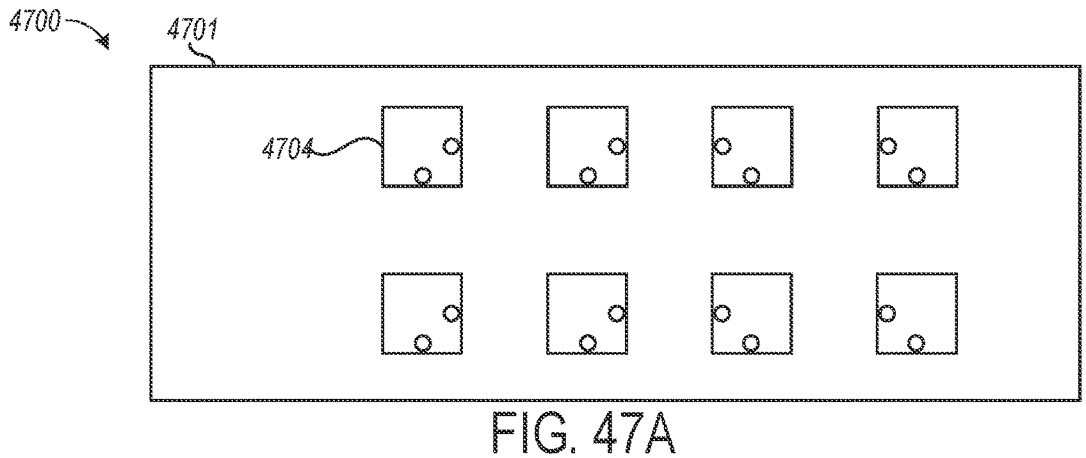
FIG. 47A illustrates a top view of an exemplary substrate of one package of still another two-package system, according to some aspects.
Figure 47B:
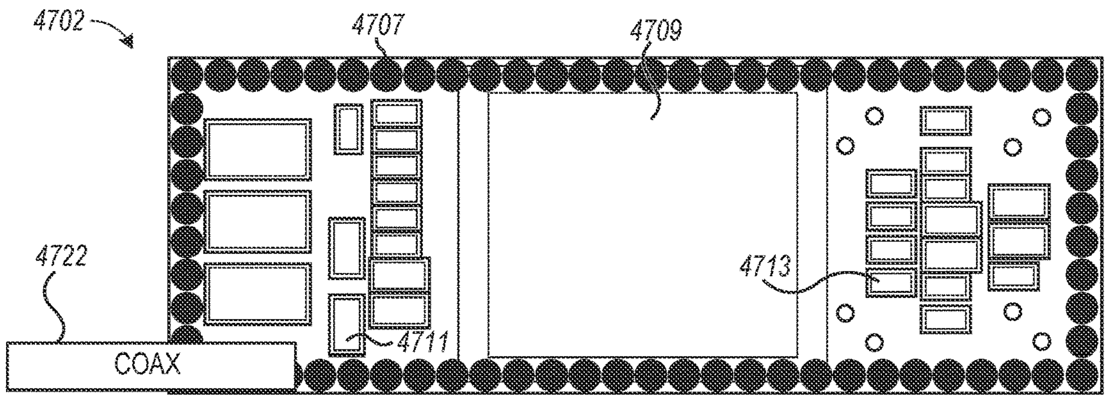
FIG. 47B illustrates a bottom view of the substrate of FIG. 46A, according to some aspects.

FIGS. 47A through 47D illustrate an example of an encapsulated POP implementation, according to some aspects. FIG. 47A illustrates a top view of a substrate of one package of still another two-package system, according to some aspects. FIG. 47B illustrates a bottom view of the substrate of FIG. 46A, according to some aspects. The antenna elements 4704, 4721, which are patch antennas in some aspects, are essentially the same type of antenna elements as in FIGS. 44A through 44D, except that there are eight antenna elements 4704 and four antenna elements 4721. The number and type of antenna elements are not critical, inasmuch as several types and number of antenna elements can be used in accordance with the needs and specification of the package at hand.

Figure 47C:
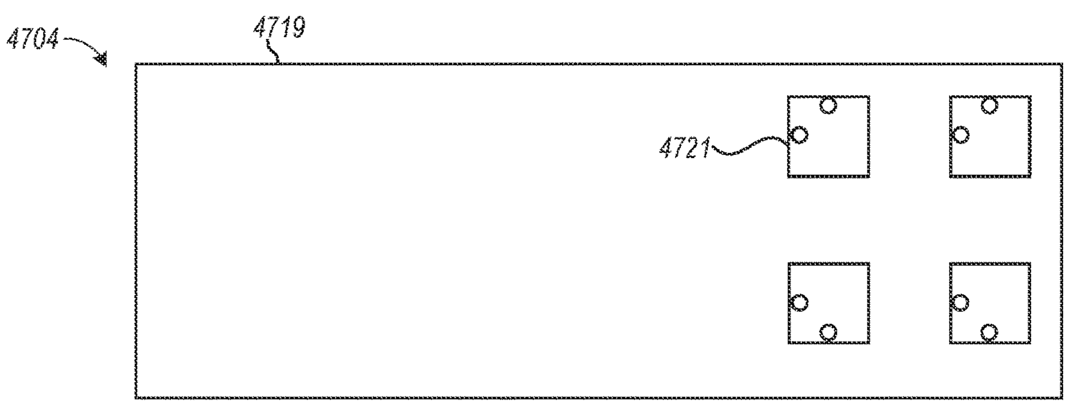
FIG. 47C illustrates a bottom view of an exemplary substrate of a second package of the two package system of FIGS. 47A and 47B, according to some aspects.
Figure 47D:
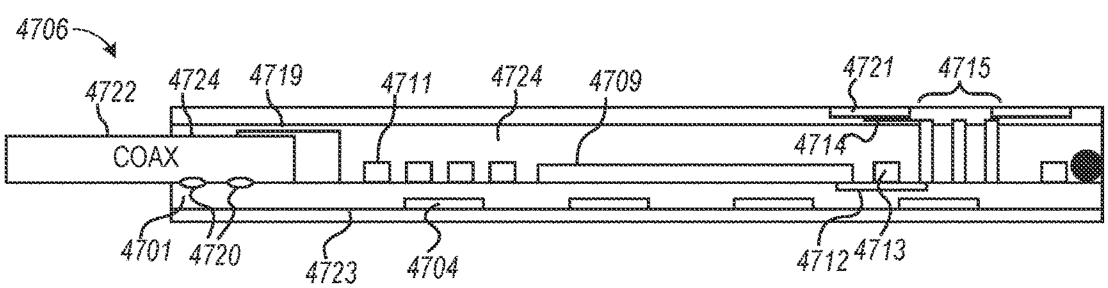
FIG. 47D illustrates the first package and the second package of FIGS. 44A through 44C, stacked in a package-on-package implementation, according to some aspects.

In some aspects, the antenna elements 4704 and 4721 may form two arrays, as indicated in FIGS. 47A and 47C, at different placements on the respective packages, according to some aspects. FIG. 47C illustrates a bottom view of a substrate of a second package of the two package system of FIGS. 47A and 47B, according to some aspects. Noteworthy is the fact that antenna elements 4721 are located laterally from their position in the earlier figures, illustrating again the versatility of antenna placement enabled by the stacked package technology, which versatility was not available in earlier designs with a discreet metal shield that interferes with placement and radiation of the antenna elements. FIG. 47D illustrates the first package and the second package of FIGS. 44A through 44C, stacked in a package-on-package implementation, according to some aspects.

Noteworthy in FIG. 47D is the encapsulation, or mold, 4724 that covers the die 4709 and discreet components 4711. The encapsulation can be mold, resin, adhesive, and the like. Through-mold vias 4715 connect the antenna elements of substrate 4701 and the antenna elements of substrate 4719 to die 4709 and function in some aspects as antenna feeds such as by way of strip lines 4712, 4714. Through-mold vias can be of various types, for example copper studs, solder balls, via holes plated with conductive epoxy, or any other suitable conductor. The encapsulation can be a fully definable material such as epoxy that can be a laser mechanically drillable material. Alternately, the mold can be a fluid material that actually molds around the studs, according to some aspects. As an example, the through-mold vias could be vertical pillar-like posts or studs, and the encapsulation can be so fluid that it can envelop all the posts (or studs). Therefore, the stud type through-mold vias could be placed first and then the encapsulation added after that. Alternately, the encapsulation can be added first and the through-mold vias can be added by way of drilling through the encapsulation and adding the conductive vias after drilling through the encapsulation. An advantage of encapsulation is that while the antenna elements remain close to the die as discussed above, the mold gives significant additional protection to the die, adding increased reliability and robustness without significantly increasing distance from the antenna elements to the die, other than increased distance due to placement of the antennas that might be part of the requirements for the package solution at hand.

An additional significant use of both X and Y space, and also Z-height, in mobile devices is the use of a connector, often a snap-on connector. Therefore maintaining the needed electrical connection from the electronics to the outside world, but at the same time removing the need for a connector, would save substantial and valuable X-Y real estate and Z-height in a package for a mobile device. Some have considered soldering the flexible coaxial cable, or other technology cable, that provides the electrical connection, and thereby avoiding using a connector. In some aspects the flexible cable be soldered in place and then molded into the package, much the same way molding of components by use of an encapsulation as described above. In some aspects coaxial cable 4722 of FIG. 47D may be soldered, such as at 4720, to the appropriate connection points, and is also secured by encapsulation 4724 in some aspects. An encapsulation, such as a mold, epoxy, or other encapsulation allows the coaxial cable to be connected to the substrate as a sealed solution, which can then be sputtered with some type of conductive material to make the overall combination shielded. Coaxial cables soldered and molded in this manner should have sufficient strength to maintain electrical connection without the need for the usual connector, the encapsulation making the coaxial cable connection sufficiently robust in the package to provide a solution for the need for electrical connection from the internal of the package to the outside world without need for an actual connector. In some aspects, the soldering as at 4720 may not be needed, and the encapsulation will be sufficient for needed robustness. This results in substantial XYZ space saving discussed briefly above. In some aspects the flexible cable may provide the needed connection by using a board to board connector.

Figure 48A:
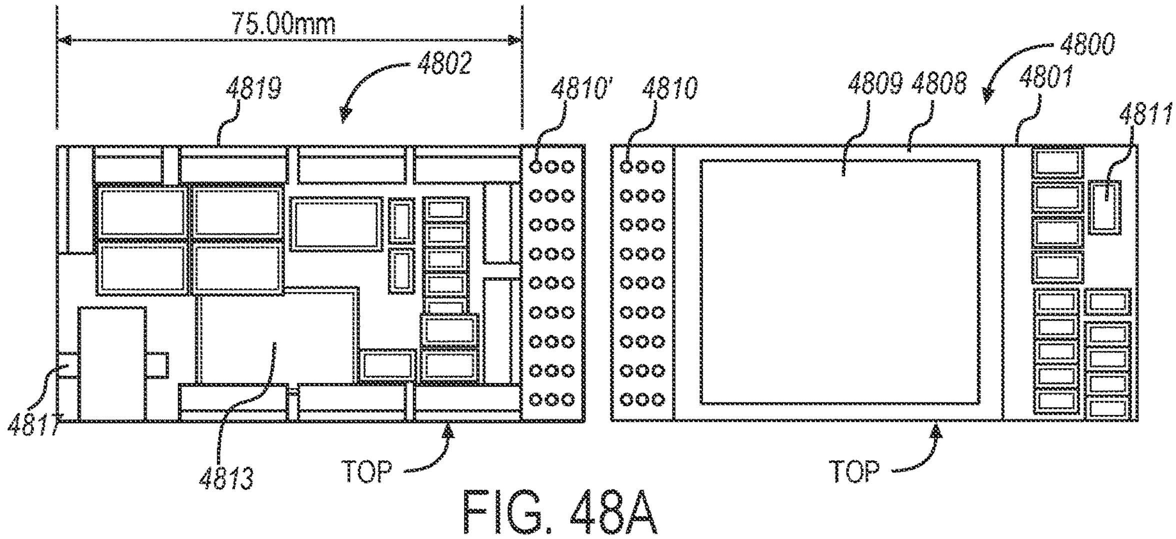
FIG. 48A illustrates a top view of two packages of a two-package, side-by-side package system, according to some aspects.
Figure 48B:
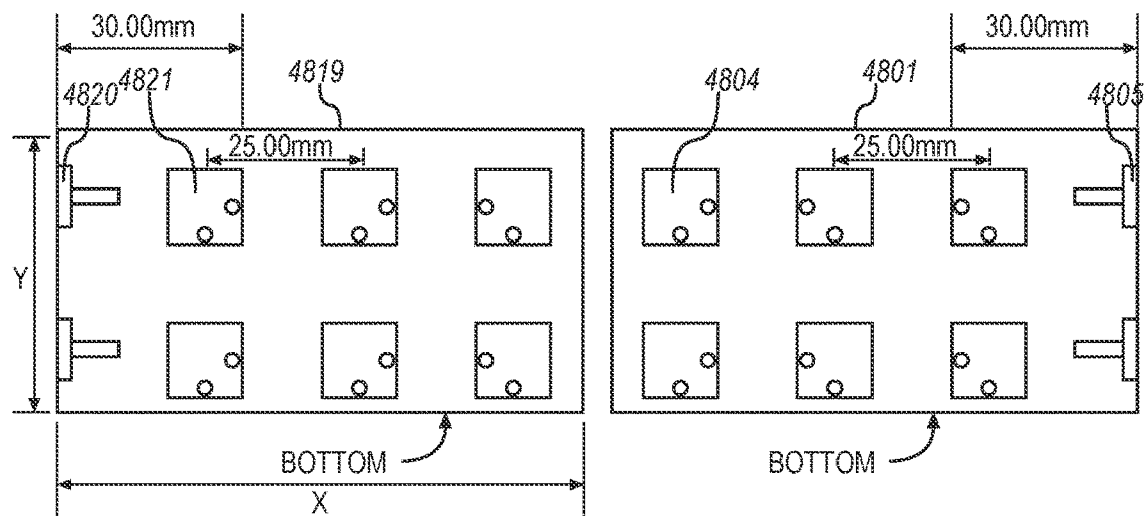
FIG. 48B illustrates a bottom view of the two packages of FIG. 48A, according to some aspects.

In some aspects there is a need to have antennas on both top and bottom of a substrate that includes a die, and also to both reduce the Z-height and reduce the Y-dimension of the package. A solution that provides the above need uses two packages side-by-side. FIG. 48A illustrates a top view of two packages of a two-package, side-by-side package system, according to some aspects. FIG. 48A illustrates two different packages, 4800, 4802, in a side-by-side configuration, according to some aspects. Package 4800 seen generally in FIG. 48A includes substrate 4801. In a top view ("TOP") of package 4801 is seen item 4808 which is a partial top view of metal shield that covers RFIC die 4809 and related components for RFI/EMI protection. Offset to either side of the shield 4808 are discreet components of the type that do not need shielding, one of which is designated at 4811, and contacts, such as solder balls, 4810. FIG. 48B illustrates a bottom view of the two packages of FIG. 48A, according to some aspects. On the bottom side of substrate 4801 of the package 4800 are antenna elements illustrated as dual patch antennas, one of which is designated as 4804. Also illustrated are end fire antennas such as dipoles 4805. While the current aspect illustrates patch antenna and dipole antennas, other aspects may use different antenna types, depending on the solution needed.

A second package is illustrated generally at 4802 of FIG. 48A. Illustrated is a top view ("TOP") of package 4819, according to some aspects. Package 4819 includes contacts 4810' which in some aspects are solder balls, discreet components, one of which is designated as 4813, and soldered, and/or encapsulated, cable 4817, discussed in further detail below. Bottom view ("BOTTOM") of package 4819 illustrated in FIG. 48B includes, according to some aspects, dual patch antenna elements, one of which is designated at 4821, arranged in an array. Printed dipole antennas, one of which is designated as 4820 are configured for end fire operation, according to some aspects.

Figure 48C:
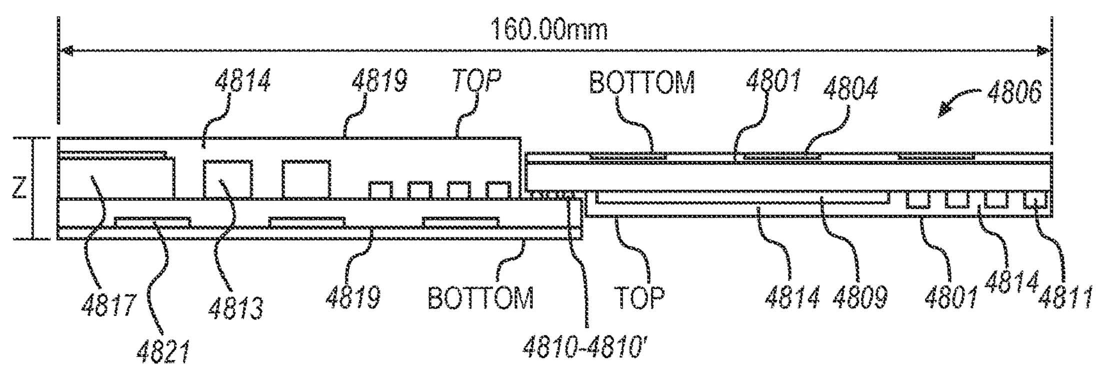
FIG. 48C illustrates a side view of the two packages of FIGS. 48A and 48B in a side-by-side implementation, according to some aspects.

FIG. 48C illustrates packages 4800, 4802 configured side-by-side. The cable 4817 and discreet components 4813 of package 4802 are encapsulated by an encapsulation 4824. The discreet components, one at 4811, and the shield 4808 (not shown in the drawing for space-saving purposes) and die 4809, are also encapsulated by an encapsulation 4814. Noteworthy is the fact that package 4800 has been "flipped." In other words, while package 4802 resides with its top ("TOP") at the top of FIG. 48C and its bottom ("BOTTOM") at the bottom of FIG. 48C, package 4800 is juxtaposed with package 4802, with package 4800 residing with its top ("TOP") at the bottom of FIG. 48C and its bottom ("BOTTOM") at the top of FIG. 48C. The two packages are secured by contacts such as solder balls at 4810-4810' which are bonded together. This results in antennas 4821 (that are on the BOTTOM side of package 4819) facing downwardly and antennas 4804, which are on the BOTTOM side of package 4819, actually facing upwardly, to provide the solution needed, namely to reduce the Z-height and reduce the Y-dimension of the package, as noted above.

Reduction of the Z-height can be seen from the fact that the side-by-side design does not use vertical stacking in the manner of the above POP designs. The reduction of the Y-dimension can be seen from FIGS. 48C and 48D. In both figures, the dimensions of the antennas 4804 and 4821 are extremely small. Further, in FIG. 48A the dimensions of the die are also extremely small. Both these factors lead to a smaller Y-dimension, enabling the design to be placed closes to the edge (the Y-dimension) of the user device, leaving additional X-Y space for the display of a mobile user device to reach nearly to the edge of the mobile device in the Y-dimension, in some aspects. Both sets of antennas 4821, 4804 are fed by die 4809. Antennas 4804 will have the desired extremely short feed lines from die 4809 because of the proximity of those antennas to the die. Antennas 4821 will have somewhat longer feedlines due to the offset, which in the present case is acceptable in order to fit in a specific mechanical design of the mobile device, in this example lowering the Y and Z dimensions in a very narrow space between the display screen and the end of the lid of a mobile device.

At least some of the needs described above, for varying polarities and varying spatial diversity of radiated radio waves at varying times, can be met by repurposing the standard Micro SD form factor card to include an mmWave antenna and transceiver device or other die, for wireless communication user devices such as mobile devices, in some aspects. The advantage of this repurposing is that this form factor may be used in mobile devices. Because the Micro SD format is the right size to incorporate a number from one to a few mmWave antennas, and for an RIFIC to be placed into an already existing form factor, there is no need to design a new form factor. Rather, the recognition that this existing form factor can quickly implement a solution that is accepted in hand-held/phone solutions, offers a tremendous cost savings and probable operational advantage. Further, the fact that the Micro SD form factor card is pluggable into a user device provides a form factor marketing advantage because it can be installed at will, or withheld from installation, as appropriate for an aspect.

The Micro SD form factor card can enable a population/depopulation of antennas and radio technology as needed with interchangeable frequency ranges to support different geographies. For example, different geographies may make different frequency bands available for use from a regulatory point of view. If the Micro SD cards are frequency band defined, then they can be swapped in and swapped out of a user device as needed to operate in the desired frequency band suitable for that particular geography.

Such form factor cards can be easily placed near the mobile platform extremities so the antennas are facing out. The form factor card already has an area that is RF exposed and not covered by socket metallization that is often found on substrates. This exposed area can be used for an antenna or small array to be embedded within the card. Given the ultra-small size of antennas that operate at mmWave frequencies, small antennas and/or small antenna arrays that fit in such areas are very effective.

In some aspects, multiple instances of such a card can be arranged to form a massive antenna array (MAA). Further, multiple sockets (placed outside the RF exposed area of the card) can also enable support of different frequency range sub-systems. Antennas could be end-fire type antennas in some aspects, but the exposed section outside of the socket metal structure could enable other types of antennas that radiate in other directions. Stated another way, and as will be discussed below with respect to FIG. 50, the Micro SD card has an exposed area that is not covered by metallization associated with the socket that the Micro SD card is plugged into. Antennas of different types can be placed in this area to enable radiation in different directions. In some aspects end-fire antennas can be used because the end-fire radiation pattern direction would be lateral with the Micro SD card orientation. But other antenna types with other radiation pattern coverage can also be used.

Figure 49:
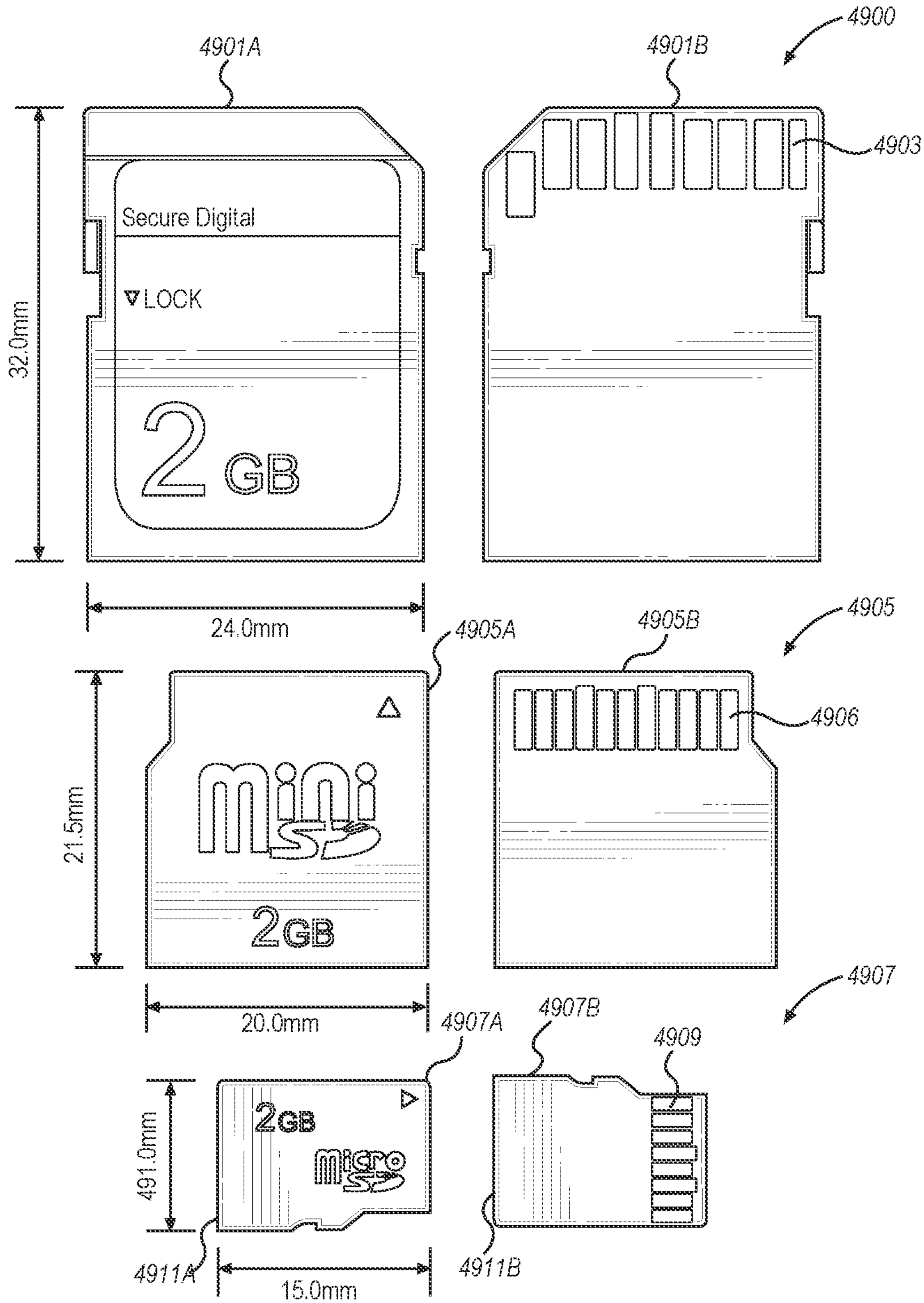
FIG. 49 is an exemplary illustration of the various sizes of SD flash memory cards.

As used in the disclosure, such terms as "front," "back," "up," "down," "side," and the like, are used relative to the orientation of the drawing. FIG. 49 is an illustration of the various sizes of SD flash memory cards. The SD flash memory cards may be incorporated in the transmit circuitry 315, the receive circuitry 320, the RF circuitry 325, and the antenna array circuitry 330 of mmWave communication circuitry 300 shown in FIG. 3A, although the SD flash memory cards are not limited to such. The various sizes of the SD form factor are seen generally at 4900. The Standard SD form factor card is seen in front view 4901A and rear view 4901B. Electrical contacts are seen at 4903. Dimensions of the Standard SD form factor are illustrated in millimeters. The Mini SD form factor is seen at 4905, in front and rear view also with dimensions indicated in millimeters. The Micro SD form factor and its dimensions are seen at 4907, also in front and rear view.

In some aspects, the Micro SD form factor card can be used effectively for mmWave communications with a change in content and functionality to adapt the card for mmWave operation in wireless communication devices. One reason for this is that, as discussed briefly above, the size of the Micro SD card format enables it to be used for mmWave operation, particularly since space in a wireless communication device is at a premium and the size of the Micro SD format provides a space advantage for use in mobile devices where space is scarce. Further, given that the Micro SD card has electronic contacts at a "rear" area 4909, the "front" area 4911A, 4911B is the section of the Micro SD card which is exposed and not covered by metallization of the socket which the Micro SD card is plugged into. This makes it attractive for millimeter wave frequency sub-systems with antennas because the antennas can be in the exposed region while other parts like the transceiver can be covered by metallization acting as a shield. In some aspects, antennas are placed in the internal region of the card at 4911A and 4911B, discussed in greater detail below. Antennas require un-metalized regions where they can radiate out of the wireless sub-system. Being un-metalized, the internal region of 4911A and 4911B are ideal for placement of antennas.

Figure 50:
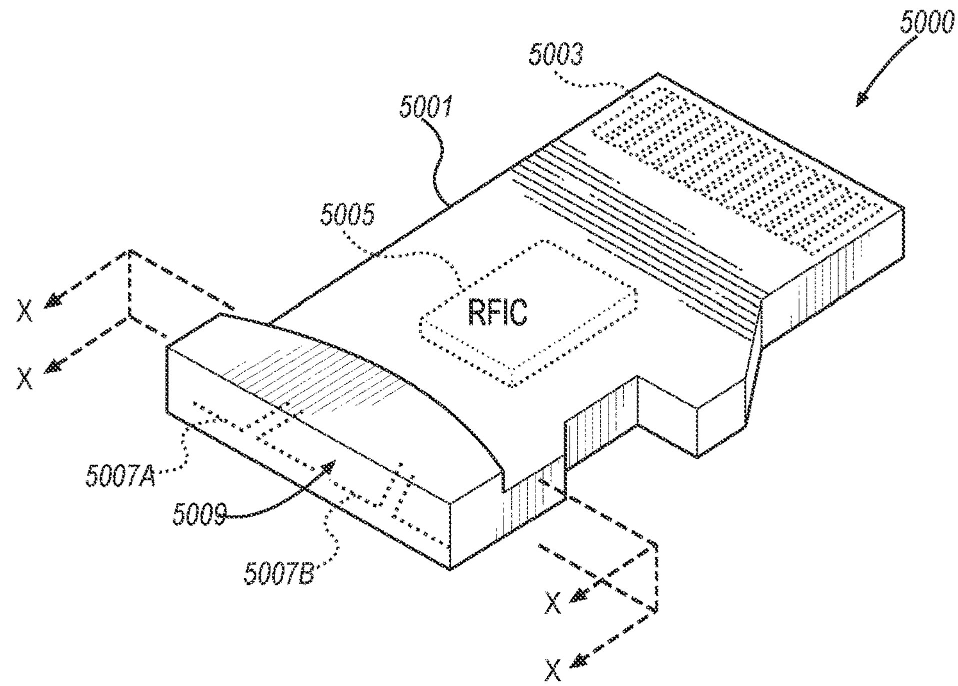
FIG. 50 illustrates a three dimensional view of an exemplary Micro SD card with content and functionality changed to repurpose the card for mmWave wireless communication operation, according to some aspects.

FIG. 50 illustrates a three dimensional view of a Micro SD card with content and functionality changed to repurpose the card for mmWave wireless communication operation, according to some aspects. The Micro SD card form factor card includes card 5001 seen in a three dimensional view with the front 5001 of the card in full view. Electrical contacts 5003 on the back of the card are illustrated in hidden view. As part of the change in content and functionality alluded to above, RFIC 5005 is illustrated within the Micro SD card, therefore also shown in hidden view. The internal part of the card, if viewed along section XX-XX, shows antennas, which are illustrated in the figure as dipole antennas 5107A, 5107B, is also in hidden view inasmuch as they are internal to the front of the card at 5009 according to some aspects. In other words, the antennas need to be exposed to radiate outward from the platform in which they are placed.

The metalized connector for these types of SD cards being at the back 5003, leaves the thick section 5009 of the Micro SD card 5001 without metal covering it so that the thick section is ideal for antenna placement. Being so small, the card is also well-suited for mmWave frequencies since the antennas would be smaller than the available area and thus more than one antenna can be included to form an array, and/or antenna diversity may be included. This fact offers an additional advantage that the antennas can be used for Multiple-In Multiple-Out (MIMO) operation. Stated another way, multiple antennas can be used in different ways in radio systems. They can be simply combined, they can be used to electrically steer a beam, and they can be used to support MIMO whereby different antennas support a separate radio chain that can be used to transmit/receive as separate stream of information independent of the other antennas in the solution, and additional functions can be implemented as well.

As an example of MIMO operation, antenna 5107A may be used to support one MIMO stream and antenna 5107B may be used to support a second MIMO stream according to some aspects. This can also be implemented using antennas of different polarization. The RFIC 5005 would be designed to support these configurations and the number of streams. In this aspect two antennas 5107A and 5107B are illustrated, but this scheme is not limited to only two.

Figure 52:
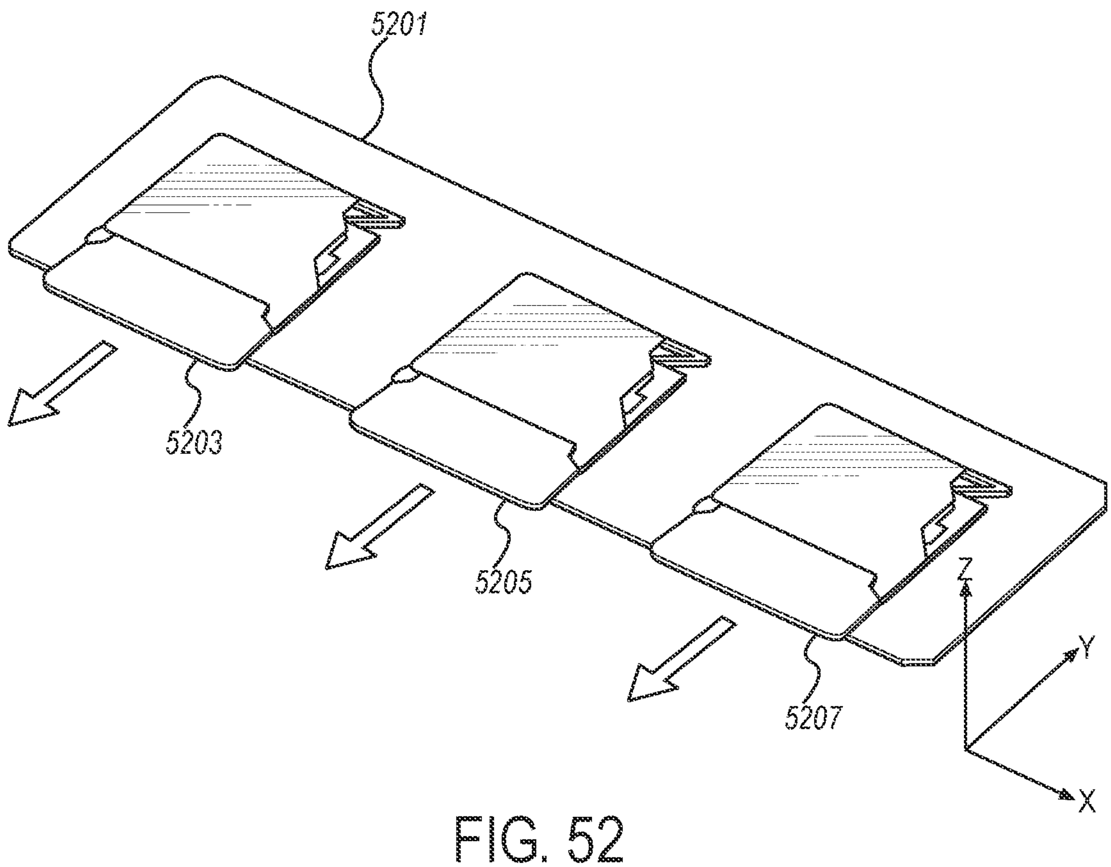
FIG. 52 illustrates three exemplary Micro SD cards modified as discussed above to provide a plurality of cards per motherboard, according to some aspects.

The RFIC 5005 and the antennas 5107A, 5107B, may be etched, printed, or otherwise configured on or within a PCB inside the sub-system at 5009, which may be over-molded into the desired Micro SD card shape, according to some aspects. The thickness of section 5009 can be used in some aspects to also incorporate taller antenna structures like those needed for vertical polarization antennas. The bottom of the PCB would have the edge card contacts at the bottom that make contact to the spring contacts in the Micro SD socket. The antennas illustrated at 5107A, 5107B, as mentioned above, are dipole antennas and could radiate out a hemispherical pattern, while other types of antennas could be more sectorial in pattern. The dipole antennas could be considered edge-fire inasmuch as they also radiate out on the same plane as the PCB and Micro SD card, even though they also radiate up and down. Since the exposed part 5009 of the card 5001 is at the edge, edge-fire antennas are more likely to be used in this form factor, as seen in FIG. 52, discussed below. This form factor also coincides with the type of platform this could be integrated into, such as phones. In other words, Micro SD cards are already the current standard memory module form factor for phones because they are relatively small but have the ability to also support high capacity memory storage.

Further, when arranged in array formation with multiple instances of such Micro SD cards, then more options come into play and different antenna types radiating in different directions may be used. Being a very small card means the card can support antennas of the same order of magnitude of size that equates to frequencies in the mmWave range. Just as an example, there are WiFi wireless solutions in the Mini SD card form factor because this size is larger and can support larger antennas that coincide with the frequency range as that of the WiFi frequency range (centimeter waves). The Micro SD being smaller can support a smaller antenna usable at mmWave frequencies, or a few of such antennas, which means that the antennas can be used to from arrays when placed at appropriate distances one from another, the distances being a function of frequency.

Figure 51A:
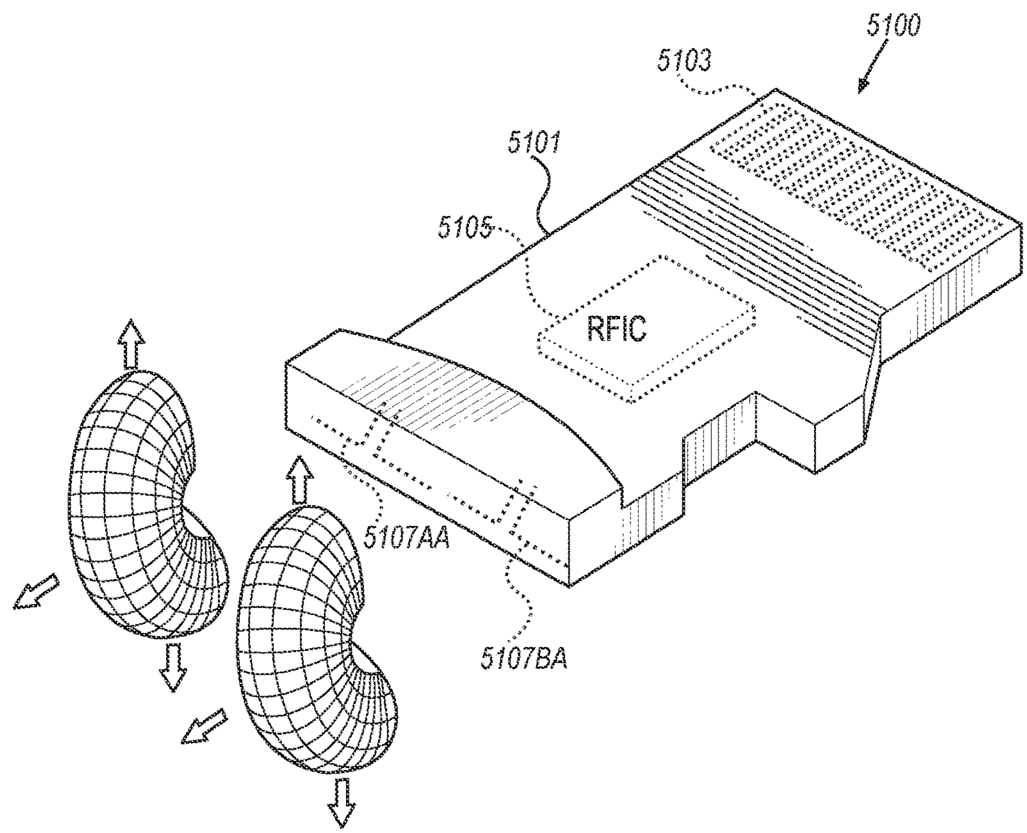
FIG. 51A illustrates an exemplary Micro SD card of FIG. 50 showing the radiation pattern for the dipole antennas of FIG. 2, according to some aspects.
Figure 51B:
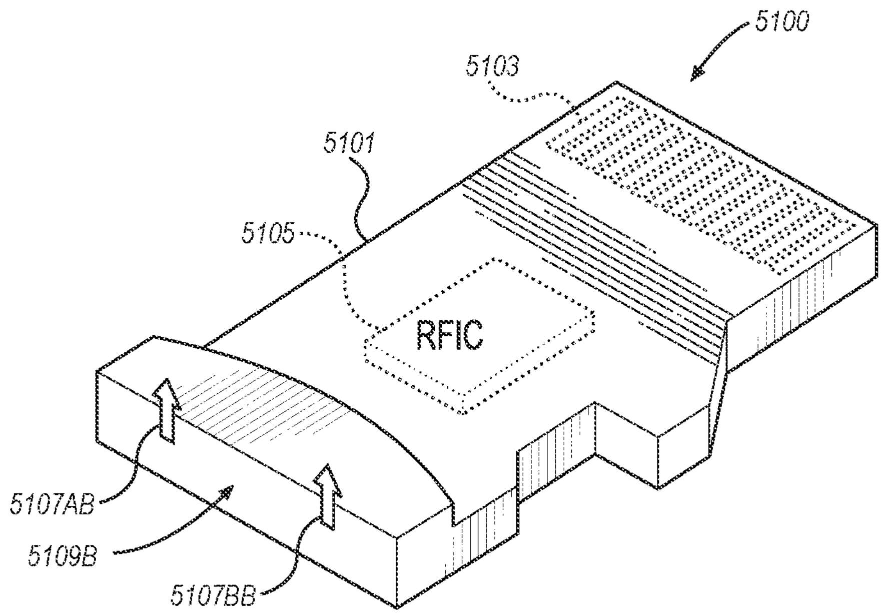
FIG. 51B illustrates the Micro SD card of FIG. 50 with vertically polarized monopole antenna elements standing vertically in the exposed area that is limited in Z-height, according to some aspects.
Figure 51C:
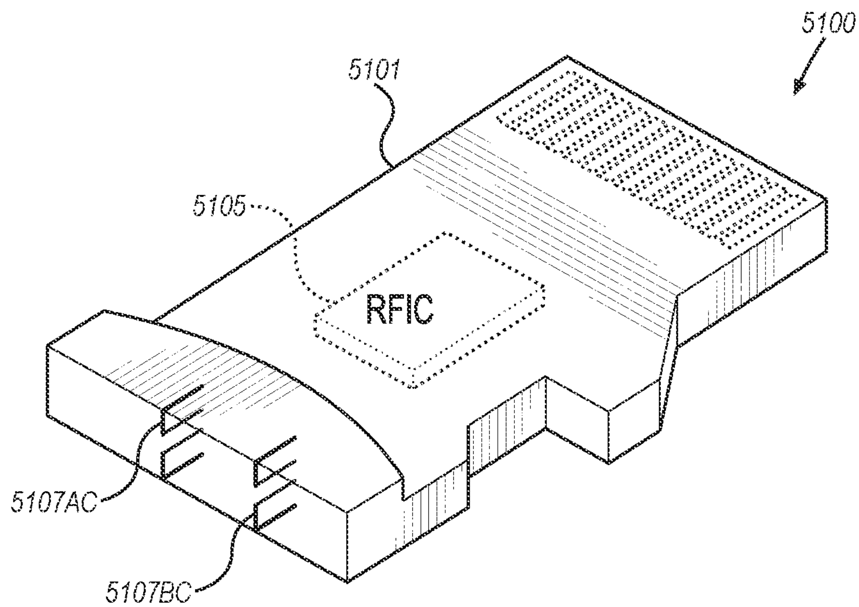
FIG. 51C illustrates the Micro SD card of FIG. 50 with folded back dipole antennas, according to some aspects.

FIG. 51A illustrates a Micro SD card of FIG. 50 showing the radiation pattern for the dipole antennas of FIG. 50, according to some aspects. The radiation out of the dipoles 5107A, 5107B is a sort of half doughnut that radiates laterally but also radiates up and down. The other half of the radiation pattern may be blocked by the phone/hand-held device or the metallization of the Micro SD socket. FIG. 51B illustrates the Micro SD card of FIG. 50 with vertically polarized monopole antenna elements standing vertically in the exposed area 5109B that is limited in Z-height, according to some aspects. Other semi wrapped around vertical polarized elements may also be used. Folded dipoles may also be used. FIG. 51C illustrates the Micro SD card of FIG. 50 with folded back dipole antennas 5107AC, 5107BC, according to some aspects. FIGS. 51A, 51B, and 51C illustrate only some of the various types of antenna elements that may be used in various aspects, both singly and in arrays.

FIG. 52 illustrates three Micro SD cards modified as discussed above to provide multiple instances of such a card, each of which may have a plurality of antennas per card, according to some aspects. Seen generally in FIG. 52 is a combination of a mother board 5201, having attached thereto three Micro SD cards, 5203, 5205, 5207, the cards being modified from the usual flash memory function, as discussed above. The antennas may be dipole antennas 5107A, 5107B, in each card, as discussed above, and radiate in end fire direction as illustrated by the arrows proceeding from each card, in some aspects. As illustrated in, and as discussed with respect to, other figures herein different types of antennas may be used in some aspects to implement antennas that fulfill various needs, according to the solution at hand. While three arrays are illustrated, this can be extended in either direction by adding additional cards along the X-axis to increase the array size. In fact this can also be stacked in the Z direction to expand the array in both the X and Z dimensions, as illustrated by the coordinate system of FIG. 50, depending on available volume. By adding many Micro SD cards next to each other or stacked atop each other, with the proper antenna to antenna distances and available volume, a massive antenna array (MAA) can be configured. The number of antennas on each card can be from one antenna to a plurality of antennas on each card, depending on the frequency of operation, and therefore the wavelength λ.

Space in mobile devices for wireless communication is usually at a premium because of the amount of functionality that is included within the form factor of such devices. Challenging issues arise, among other reasons, because of needs for spatial coverage of radiated radio waves, and of maintaining signal strength as the mobile device is moved to different places, or because a user may orient the mobile device differently from time to time. This can lead to the need, in some aspects, for varying polarities and varying spatial diversity of the radiated radio waves at varying times. When designing packages that include antennas operating at millimeter wave (mmWave) frequencies, efficient use of space can help resolve issues such as the number of antennas needed, their direction of radiation, their polarization, and similar needs. At least some of these needs can be met by a ball grid array (BGA) or land grid array (LGA) PCB with an area that is specially cleared of balls or LGA pads, as the case may be, to enable antenna elements to radiate out from various sides of the PCB that has an attached millimeter wave (mmWave) transceiver in some aspects.

Figure 53A:
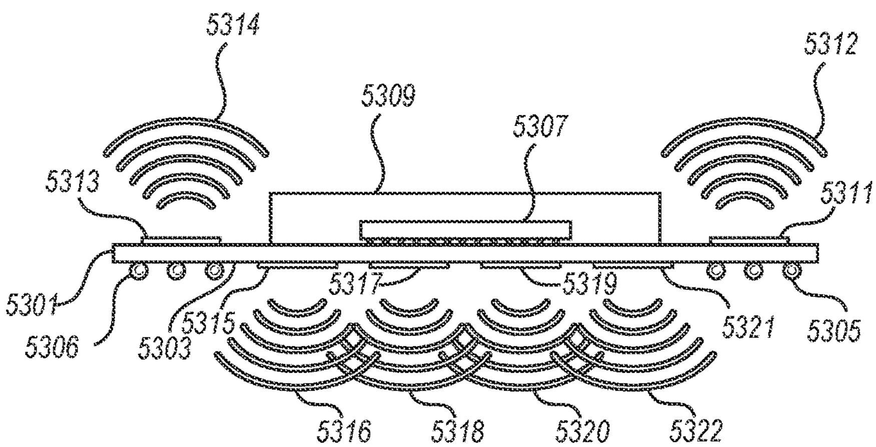
FIG. 53A is a side view of an exemplary separated ball grid array (BGA) or land grid array (LGA) pattern package PCB sub-system with an attached transceiver sub-system, according to some aspects.

FIG. 53A is a side view of a separated BGA or LGA pattern package PCB with an attached transceiver sub-system, according to some aspects. The separated BGA or LGA pattern package PCB may be incorporated in the RF circuitry 325 of mmWave communication circuitry 300 shown in FIG. 3A, although the separated BGA or LGA pattern package PCB is not limited to such. The BGA or LGA PCB has the usual layers that are substantially parallel. Typically, BGA and LGA packages populate the balls and pads in a relatively uniform spreading across the entire sub-system in order to attach the sub-system onto a mother board (MB). BGA balls 5305, 5306 are illustrated. An area 5303, free of balls and/or LGA pads, is intentionally created so that this free area can be used for an antenna section wherein the antenna elements can radiate outward if an appropriate opening is made on the MB to which the PCB 5301 is attached. In other words, area 5303, sometimes referred to as a "gap," should be "contact free," so as to place the antenna elements to enable the antennas to radiate out freely. Stated another way, gap 5303 in the BGA/LGA attach points enables antenna elements to be placed in the gap and radiate out through the gap, or laterally if the antenna elements are edge-fire type As used in this patent, the term "top," "bottom," "upward," "downward," "sideways," are used with reference to the orientation of the drawing and are not meant to restrict the direction of radiation when the package is implemented in a mobile or other device, which may be oriented in any direction. Hence, the radiation described herein is, in practice, in an outward direction, regardless of the orientation of the package in a user device.

In one aspect, downward (outward) facing antenna elements 5315, 5316, 5319 and 5321, here illustrated as patch antennas, which, in some aspects, may be an array of patch antennas or other antennas, radiate downwardly. This is illustrated in the drawing by wave patterns 5316, 5318, 5320 and 5322. An RFIC transceiver 5307 may be affixed to the top of the sub-system, and is protected from radio frequency radiation (RFI) and electromagnetic interference (EMI) by shield 5309 sub sine aspects. Antenna elements 5311, 5313 that are upwardly facing in the drawing may radiate in the upward (outward) direction 5312, 5314, respectively. The ability to radiate out of multiple directions out from a platform provides advantages.

For example, while radiation is illustrated in opposing directions, the illustrated patch antennas could be replaced with other antenna types that radiate sideways, such as end-fire or edge-fire antennas, and can be placed at the edges of the sub-system. Thus the described sub-system can make use of different types of antennas that have different types of advantages including direction of radiation and polarization.

As one example, the patch antennas illustrated have an advantage that each can have two orthogonal feed points to create two polarizations, but their radiation is broadside in nature, so they would work well in the configuration illustrated. Many antenna elements arranged on the module can be used for beam steering in an array in some aspects. Further, this type of sub-system arrangement may find use in multiple-in multiple-out (MIMO) antenna arrays, and arrays configured for spatial diversity. Spatial diversity can be achieved by having antennas that have radiation patterns in different directions. For example patch antennas on the top radiate upward and patches on the bottom radiate downward. Other antenna types can be introduced to radiate sideways like edge-fire antenna types, thus achieving spatial diversity in some aspects.

While illustrated in side view as antenna elements 5311, 5313 in FIG. 53A, FIG. 53C will show that there can be a plurality of such antennas, such as 5330, 5331 and 5332, 5333, as discussed below. While a particular number of antennas is described, the number of antenna elements can vary from aspect to aspect, as would be understood by one of ordinary skill in the art. Frequency of operation and antenna size determine how many antennas can actually fit in the given area/space to be effective in an array. Also, the type (monopole or stacked patch antennas, dipole antennas, and other types) and their arrangement, for example, in arrays, can also vary. Further, in many small form factor devices, because area/space is so precious, a sub-system that can radiate in multiple directions, as discussed above, will have a high effective usage of area/space with great (or perhaps greatest, in some aspects) coverage.

Figure 53B:
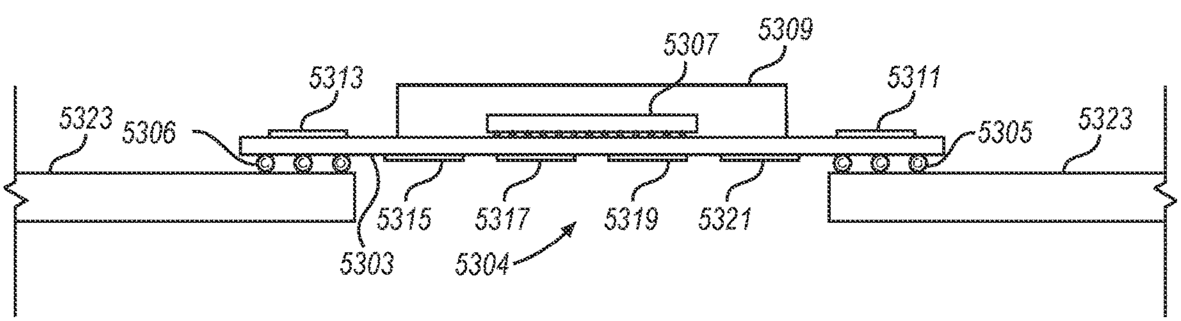
FIG. 53B is a side view cross section of the sub-system of FIG. 53A, according to some aspects.

FIG. 53B is a side view cross section of the sub-system of FIG. 53A, according to some aspects. FIG. 53B illustrates MB 5323, with a cutout 5304 that is implemented to enable the antenna elements 5315, 5317, 5319, 5321 to be exposed outwardly for radiation. In other words, the separated pattern 5303 in the package enables antenna radiation out from the attachment side of a mmWave antenna and transceiver sub-system. Because of the cutout in this area, the antenna elements 5315, 5317, 5319 and 5321 can radiate freely with essentially nothing blocking them, and this enables another direction of radiation in the limited area/volume of the solution. The antenna elements 5315, 5317, 5319 and 5321 are on the same side as the BGA/LGA 5301 attachment side (the side where the BGA/LGA attaches to the MB) in some aspects. In some aspects the cutout is implemented as an outlined, machined cutout made by router that runs along the PCB outline.

Also illustrated are antennas 5311 and 5313 on the top side of the sub-system. In some aspects, discrete electronic components that require Z-height can fit in cutout 5304 in the PCB. In some aspects the shielded RFIC itself, can be placed in the cutout at the contact free area for operation, and save on overall Z-height of the solution. Stated another way, integrated circuit chips such as RFICs are typically accompanied with some discrete components that complement the chips, for example, decoupling capacitors, and other functions as well. These components could be placed in gap 5304, instead of the antenna elements being in the gap, in some aspects. However, if the components are part of the radio transceiver circuitry positioned in the gap, appropriate RFI/EMI shielding should be implemented, as alluded to above.

Figure 53C:
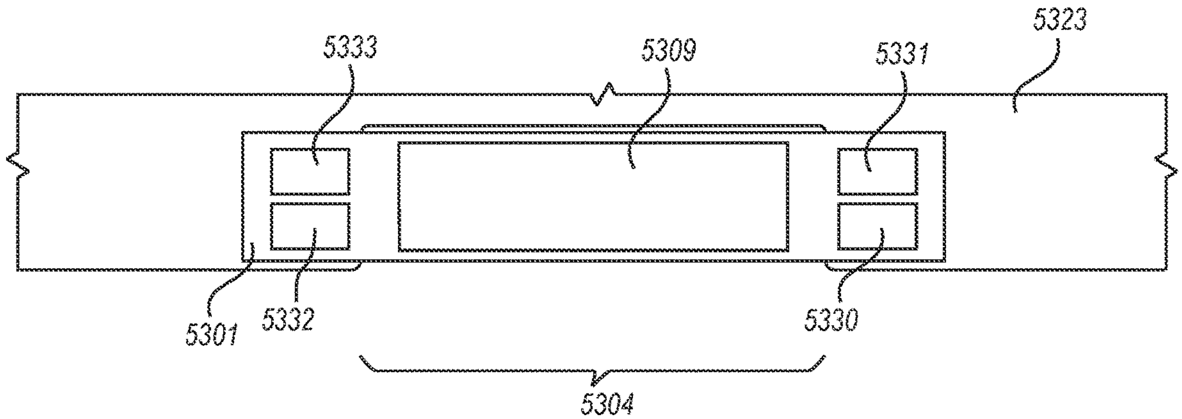
FIG. 53C is a top view of the sub-system of FIG. 53A illustrating a top view of a shield and further illustrating a cutout, according to some aspects.

FIG. 53C is a top view of the sub-system 5301 illustrating a top view of shield 5309 and further illustrating cutout or gap 5304. As can be seen, and as discussed briefly above, the upwardly facing antennas 5330, 5331 and 5332, 5333 are, in some aspects, two arrays of two antenna elements each. Other configurations of antenna elements are possible, in accordance with a given design by one of ordinary skill in the art to implement a solution that is appropriate to the needs of a given situation.

Figure 53D:
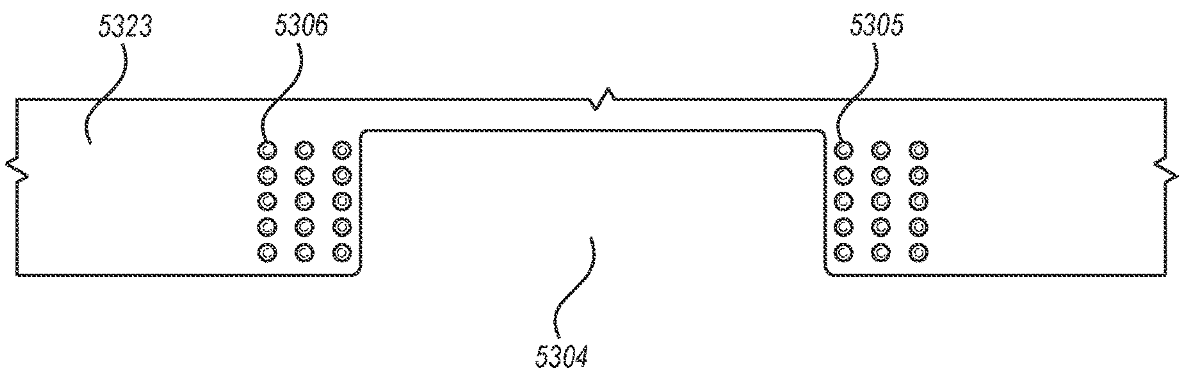
FIG. 53D is a top view of the sub-system of FIG. 53A illustrating the cutout to enable the antennas to radiate out, and illustrating contacts, according to some aspects.
Figure 53E:
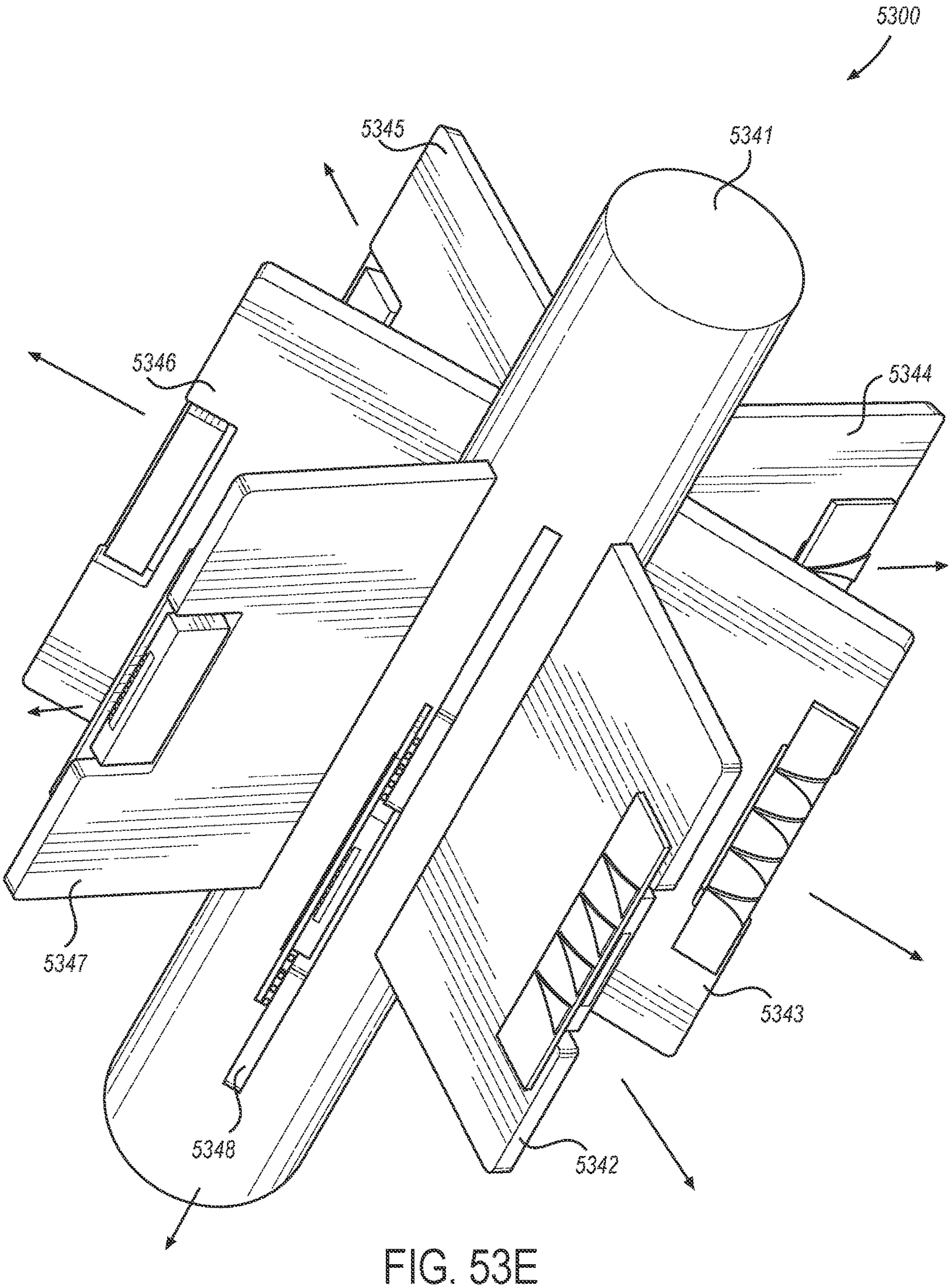
FIG. 53E shows an arrangement of exemplary sub-systems arranged circularly around a pole, for radiation coverage in substantially all directions, according to some aspects.

While the description above discusses use of the sub-system in a mobile device, the sub-system can also be used in a base station, although a base station implementation might not benefit from having radiation in both or multiple directions. While a base station array size may be limited in one axis, modularity can help to arrange the sub-systems in desired directions including arranged circularly around a pole. FIG. 53E shows an arrangement of sub-systems arranged circularly around a pole, for radiation coverage in substantially all directions, according to some aspects. Sub-systems 5341, 5342, 5343, 5344, 5345, 5346, 5347, 5348 are attached to pole 5341. Each sub-system could be as illustrated in FIG. 53A, with the BGA/LGA laminate 5301 attached to the motherboard 5323. Direction of radiation would then be as indicated by the arrows in all, or substantially all, directions.

While a rectangular shaped sub-system is shown, other shapes are possible, such as, for example, a square or corner shape. FIG. 53D shows a U-shaped cutout in the PCB to enable the antennas to radiate out through the cutout, in accordance with some aspects. The array of pads 5324, 5326, which in some aspects are gold pads, are the electrical contacts used for the signaling to the sub-system and also serve as the mechanical attachment when the sub-system is soldered onto them.

Figure 53F:
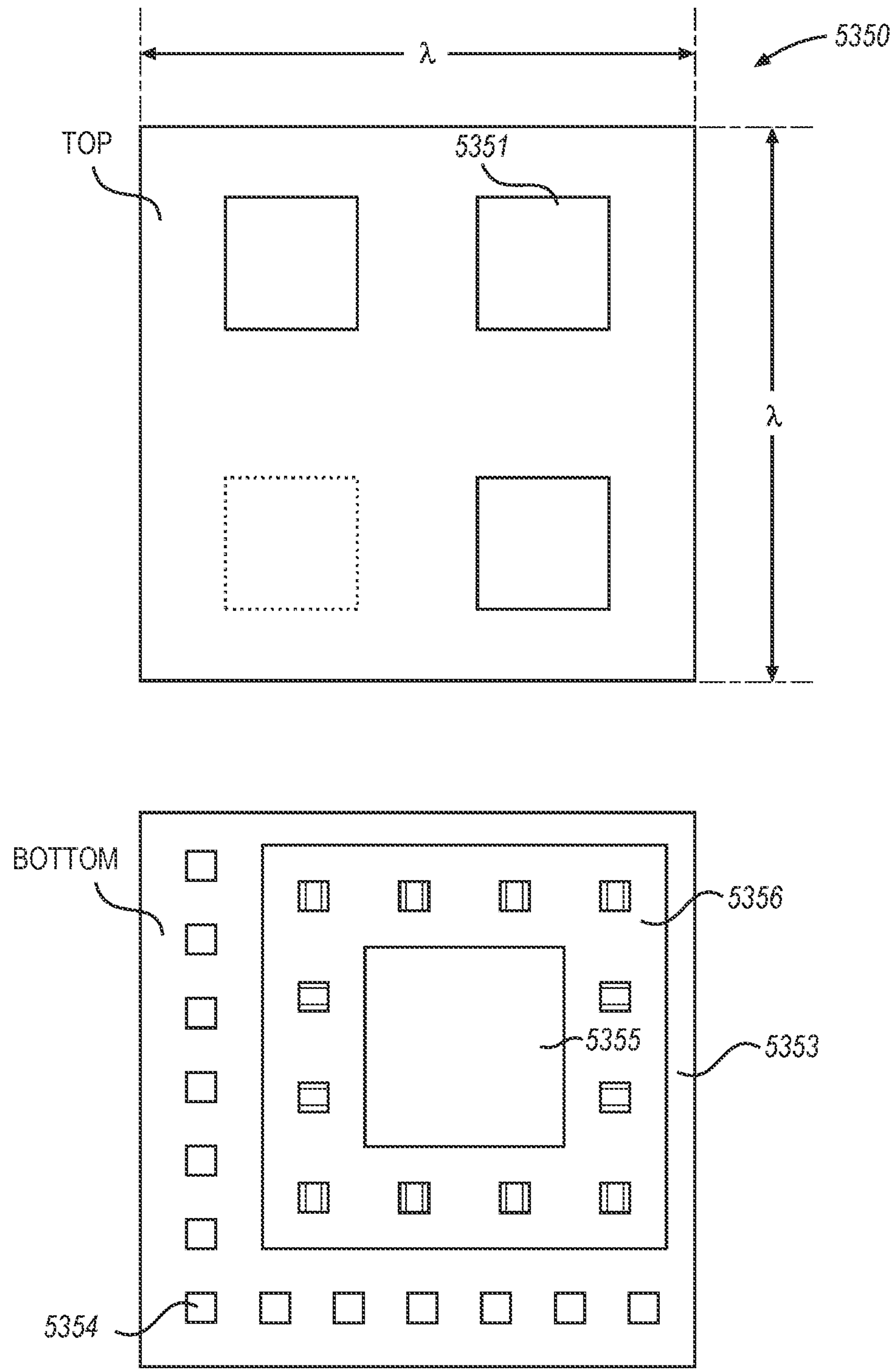
FIG. 53F illustrates an exemplary sub-system in a corner shape, according to some aspects.

FIG. 53F illustrates a sub-system in a corner shape, according to some aspects. Illustrated in the Top view is sub-system 5350 with four antenna elements 5351. One of the four antenna elements is shown in dash line for purposes of illustrating that there could be antenna elements on both sides of the sub-system. Sub-system 5350 is illustrated as being λ×λ in size in the illustrated aspect because if the antenna element itself is λ/2 (as discussed further below), then with overhead and grounding all around the elements, the realistic size of a sub-system with a 2×2 antenna array, as illustrated, would be approximately λ×λ. The Bottom view illustrates the shielded RFIC, with shield 5356 and RFIC 5355 illustrated in full line view for purposes of clarity of illustration, sitting in gap 5304E. BGA balls or LGA balls are illustrated at 5354. Antenna elements 5351 are shown as broadside elements, such as patch antennas, but could be replaced with end fire elements, such as dipoles, for end fire coverage in some aspects.

Figure 53G:
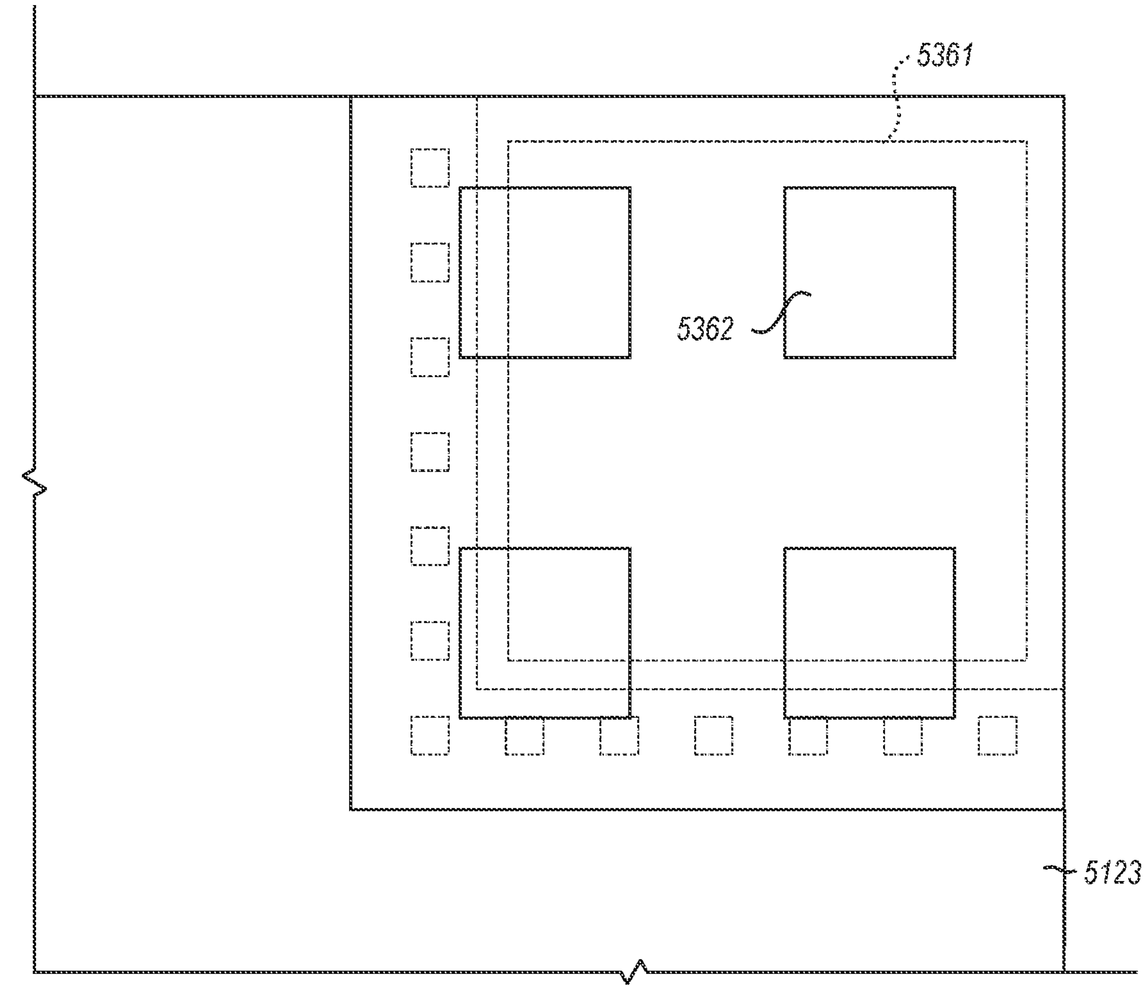
FIG. 53G illustrates the sub-system of FIG. 3A according to some aspects.
Figure 53H:
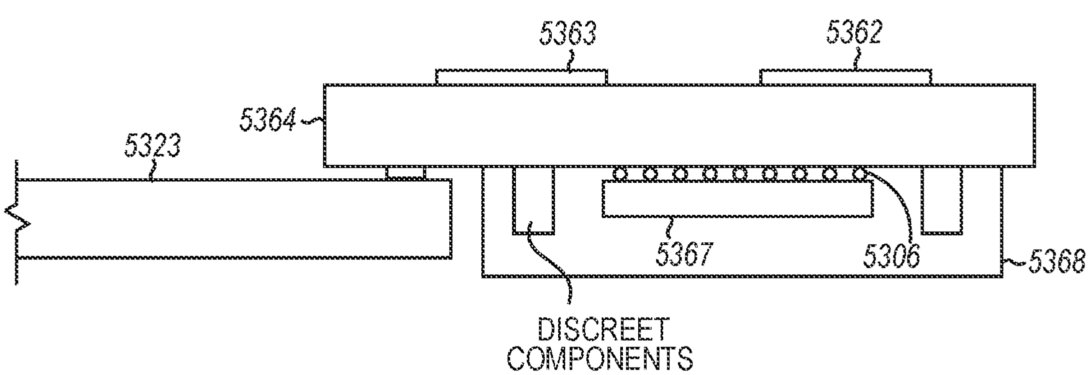
FIG. 53H illustrates a side view of an exemplary antenna sub-system according to some aspects.

FIG. 53G illustrates the sub-system of FIG. 53A placed in a corner of motherboard 5323, with 5361 in hidden view being the RFIC shield and the antenna elements being as 5362, with only one antenna element numbered in the interest of space saving in the drawing. FIG. 53H illustrates a side view of the sub-system 5364 attached to motherboard 5323 by BGA balls 5306, illustrating the antenna elements 5362, 5263 in side view looking into the page, and the shielded RFIC 5367 with discreet components also within the shield 5368.

Figure 53I:
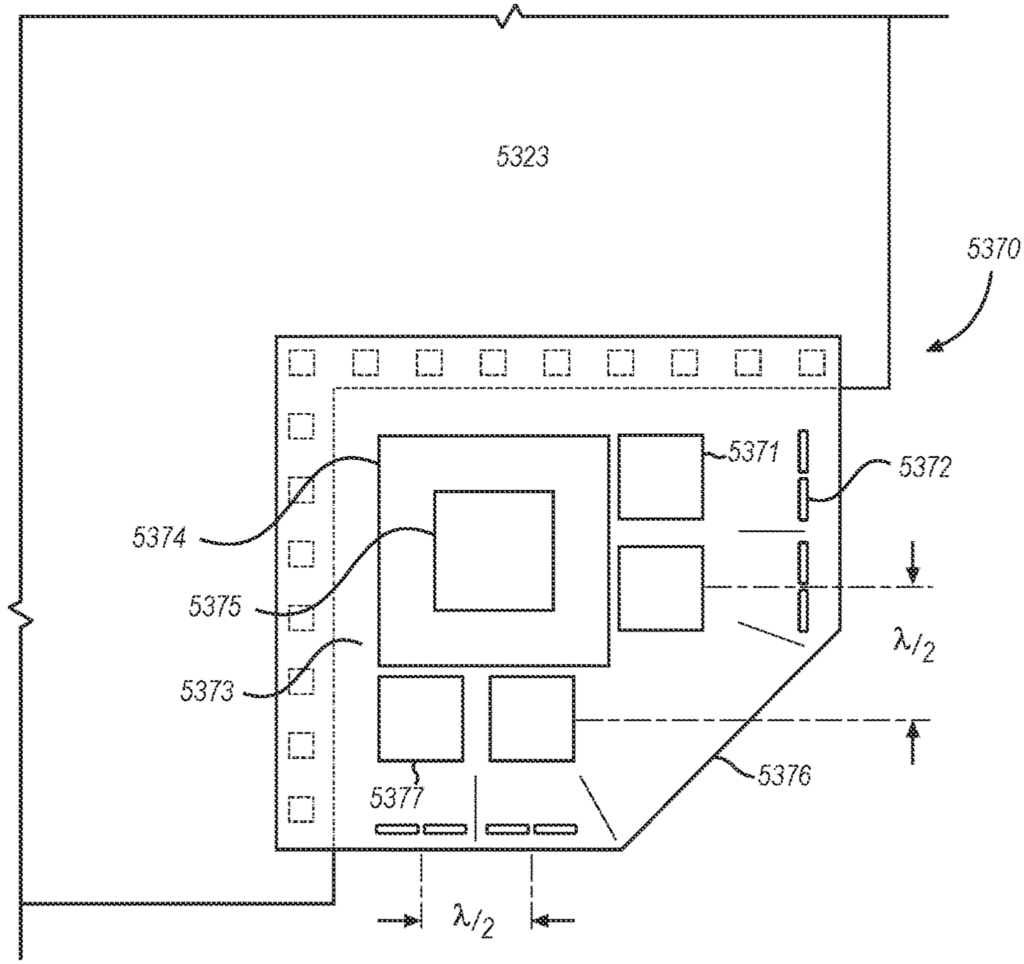
FIG. 53I is a top view of an exemplary configuration of a dual-shield antenna sub-system according to some aspects.
Figure 53J:
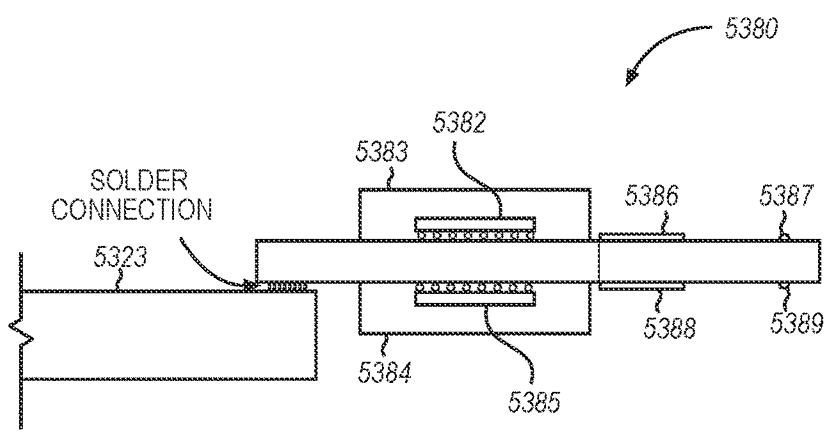
FIG. 53J illustrates a slide view of the antenna sub-system of FIG. 53I, according to some aspects.

FIG. 53I is a top view of a configuration of a dual-shield sub-system 5370 having a shape for use in a corner, according to some aspects. Sub-system 5370 is illustrated with a cutoff corner edge 5376. Four broadside antenna elements 5371 are placed adjacent sides of shield 5374 which shields RFIC or other integrated circuitry 5375, which is shown in solid line for purposes of illustration but in fact is within shield 5374. End fire antenna elements 5372 are placed around the periphery of the sub-system. Dimensions are as illustrated for the antenna elements 5377, similarly to antenna elements 5371, and with reference thereto. FIG. 53J illustrates a slide view of the sub-system of FIG. 531A, according to some aspects. Illustrated is a top shield 5383 with integrated circuitry 5382, and bottom shield 5384 with integrated circuitry 5385. Antenna elements 5386, 5387 and 535388, 5389 appear on opposite sides of the sub-system 5300. The sub-system is attached to MB 5323 by solder or other suitable attachments as illustrated.

The BGA balls (or LGA pads), at the two ends of the arrangement have an additional advantage during assembly because no extra support is needed when the sub-system is soldered to the MB. Observing the case where the sub-system is soldered or otherwise attached at the corner of a PCB, as at FIGS. 3C and 4B, there is nothing to actually hold the sub-system up in space while the balls or LGA pads get soldered along the corner "L". The sub-system would fall from its own weight during the process. However, with a rectangular sub-system with the balls or LGA pads at the far ends, such as at FIGS. 53B, there is no fear that the sub-system would fall anywhere other than to the place it is supposed to be in because of gravity.

In a PCB assembly process the PCB may be placed on a conveyor belt. It may then be solder pasted and then by pick-and-place (or manually), components are placed in their positions over the solder pasted pads. Then the PCB goes through an oven and the solder melts beneath the components soldering them to the PCB. The PCB is then cooled and cleaned yielding an assembled PCB. In some cases, some components are also glued in place prior to the soldering process so they don't move. In the case of a corner, however, that may not help significantly because gravity may pull the sub-system off the PCB before it gets soldered.

In such cases a special mechanism should be added to support the part that is likely to "fall off", and hold it in place.

60 GHz system-in-package SIP production testing is likely to be very expensive or possibly unaffordable for wide deployment of 60 GHz or 5G technology. Signals would be radiated and received at a millimeter wave (mmWave) frequency range such as 60 GHz for some aspects, but 28 GHz, 73 GHz, or other mmWave bands are also available, for other aspects. Generally speaking, testing should include antenna testing due to the complexity of the SIP and any associated assembly. Therefore the test would be a radiative test. On-chip "built in self-test" (BIST) can be used to help with this testing, but BIST will likely not include the antenna element testing.

Typically, the device under test, here a SIP, includes a phased antenna array so multiple antennas and transceiver elements would need to be tested. These requirements render conventional testers unsuitable since their operating frequencies are much lower than mmWave frequencies, and typically such testers do not include radiative tests. Instead, conductive or contact testing, like probing, is typically used. However, 60 GHz systems are extremely sensitive to even very small non-idealities. For example, if a 60 GHz probe is used to test the gain of an amplifier, the repeatability of the landing, and the aging of the probe, can introduce many dBs of gain variation, making probe-based 60 GHz production testing very difficult.

Further, 60 GHz systems typically integrate the 60 GHz antennas on the package of a Radio Frequency Integrated Circuit (RFIC), including the SIP. This eliminates cable losses which would be very high at 60 GHz and allows convenient implementation of phased arrays that achieve desired coverage. Such package configurations would also have to be tested, which is an expensive proposition. In addition, high-volume manufacturing (HVM) testing needs to comprehend antenna and assembly failure modes, e.g., misprocessing of the antenna substrate, or imperfect assembly of the RFIC on the substrate. Experiments have shown that 60 GHz systems are much more sensitive to assembly imperfections compared to 2.5 GHz-6 GHz systems. For these reasons, it is desirable to include the antennas in the 60 GHz HVM testing. Therefore, it is usually thought that nearly prohibitively expensive 60 GHz equipment would need to be added on testers to perform 60 GHz tests.

Disclosed is a practical way to do HVM production self-testing of 60 GHz systems by addressing the issues discussed above by use of a loopback test. A loopback test refers to the routing of electronic signals, digital data streams, or flows of items from their source through the system and back to their source without intentional processing or modification. This is primarily a way of testing the transmission or transportation infrastructure of an SIP.

Various examples exist. As one example, a communication channel with only one communication endpoint may be tested. Any message transmitted by such a channel is immediately and ideally only received by that same channel. In telecommunications, loopback devices perform transmission tests of access lines from the serving switching center, which usually does not require the assistance of personnel at the served terminal. In telecommunications, loopback, or a loop, is a hardware or software method which feeds a received signal or data from the sender back to the sender. It is used as an aid in debugging physical connection issues. As a test, many data communication devices can be configured to send specific patterns (such as all ones) on an interface and can detect the reception of this signal on the same port. This is called a loopback test and can be performed within a modem or transceiver by connecting its output to its own input. A circuit between two points in different locations may be tested by applying a test signal on the circuit in one location, and having the network device at the other location send a signal back through the circuit. If this device receives its own signal back, this indicates that the circuit is functioning.

Using 60 GHz equipment as an alternative to the above 60 GHz system test can either be well characterized/stable using expensive equipment (e.g., vector Network Analyzer (VNA)) or a custom-made sub-system with third party components. Both approaches have limitations in terms of cost, stability of measurements, and/or aging of the custom-made sub-systems. The disclosed, self-contained, self-test solution uses the 60 GHz system to test itself. This obviates the need for expensive/sensitive 60 GHz equipment. It also naturally includes the antennas in the testing, which is key for the 60 GHz System-in-Package, and also addresses inevitable on-chip and on-package crosstalk issues. A reflector on the tester enables baseband-to-baseband loopback that includes the antennas. Loopback self-test schemes are sometimes used to test RFICs at lower frequencies but without testing antennas. The disclosed system extends the loopback to include the antennas, which are components of the 60 GHz system, according to some aspects.

Figure 54A:
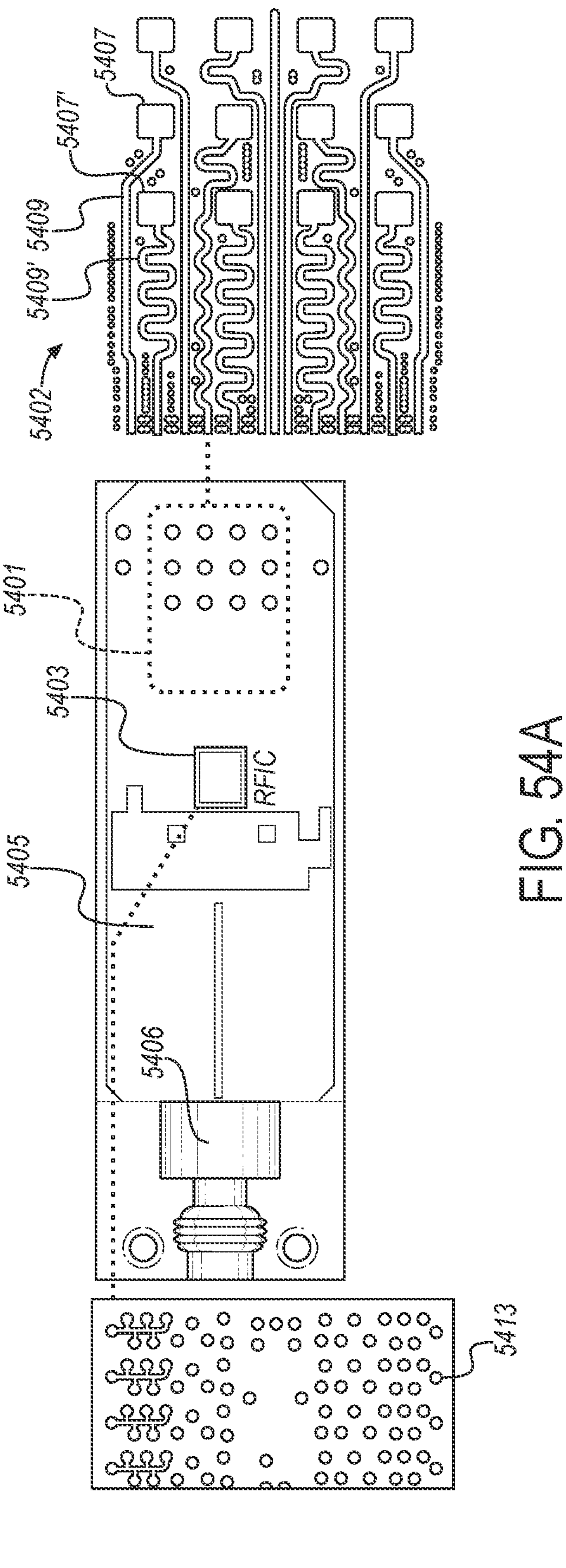
FIG. 54A illustrates an exemplary 60 GHz phased array System-in-Package (SIP), according to some aspects.

FIG. 54A illustrates a top view of a 60 GHz phased array System-in-Package (SIP), according to some aspects. The SIP 5400 may be incorporated in the RF circuitry 325 of mmWave communication circuitry 300 shown in FIG. 3A, although the SIP 5400 is not limited to such. SIP 5400 includes antenna array 5401 and a 60 GHz RFIC 5403 on or within substrate 5405, which may be a low temperature co-fired ceramic (LTCC), according to some aspects. RFIC 5403 receives input signals via connector 5406. Antenna array 5401 includes a 542-element array seen in greater detail at 5402. The array is fed by RFIC 5403 via a series of micro-strip feed lines, according to some aspects. One antenna element of the array, seen at 5407, is fed by feed line 5409, according to some aspects. A second antenna element of the array, seen at 5407', is fed by feed line 5409'. Feed line 5409' is structured in such a way as to slow the RF signal from the RFIC. In other words the feed line lengths are matched so that group RF signal delay to the antennas are matched. This helps with beamforming calibration (e.g., less static mismatch, reduced sensitivity of calibration to channel frequency). The series of balls 5413 are bumps for signal connections to the package when the chip is flipped onto the package, according to some aspects. While a 542-antenna array is illustrated, in some aspects more than 542 antennas or fewer than 542 antennas may be used.

Figure 54B:
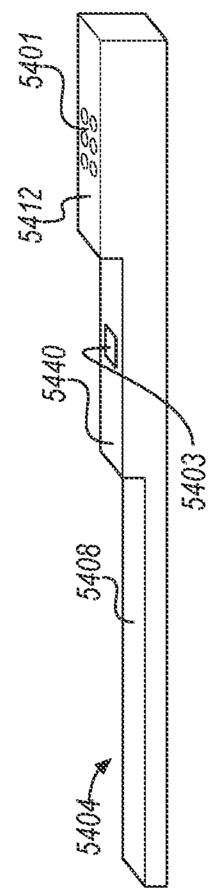
FIG. 54B illustrates a side perspective view of an exemplary 60 GHz phased array SIP, according to some aspects.

FIG. 54B illustrates a side perspective view of the SIP of FIG. 54B, according to some aspects. FIG. 54B illustrates stepped platform 5404 including three step-like levels, 5408, 5410, 5412, according to some aspects. Antennas 5412 are on the highest level because antennas usually require additional substrate layers for proper operation. Level 5410 which includes RFIC 5403 does not include vias, which may not helpful for mmWave signals. So feed lines are routed directly on the top layer 5412, in some aspects. In other aspects, the feed lines go "inside" the dielectric to reach the antennas at level 5410. Level 5408 is thinner to provide room for the connector 5406.

Figure 55:
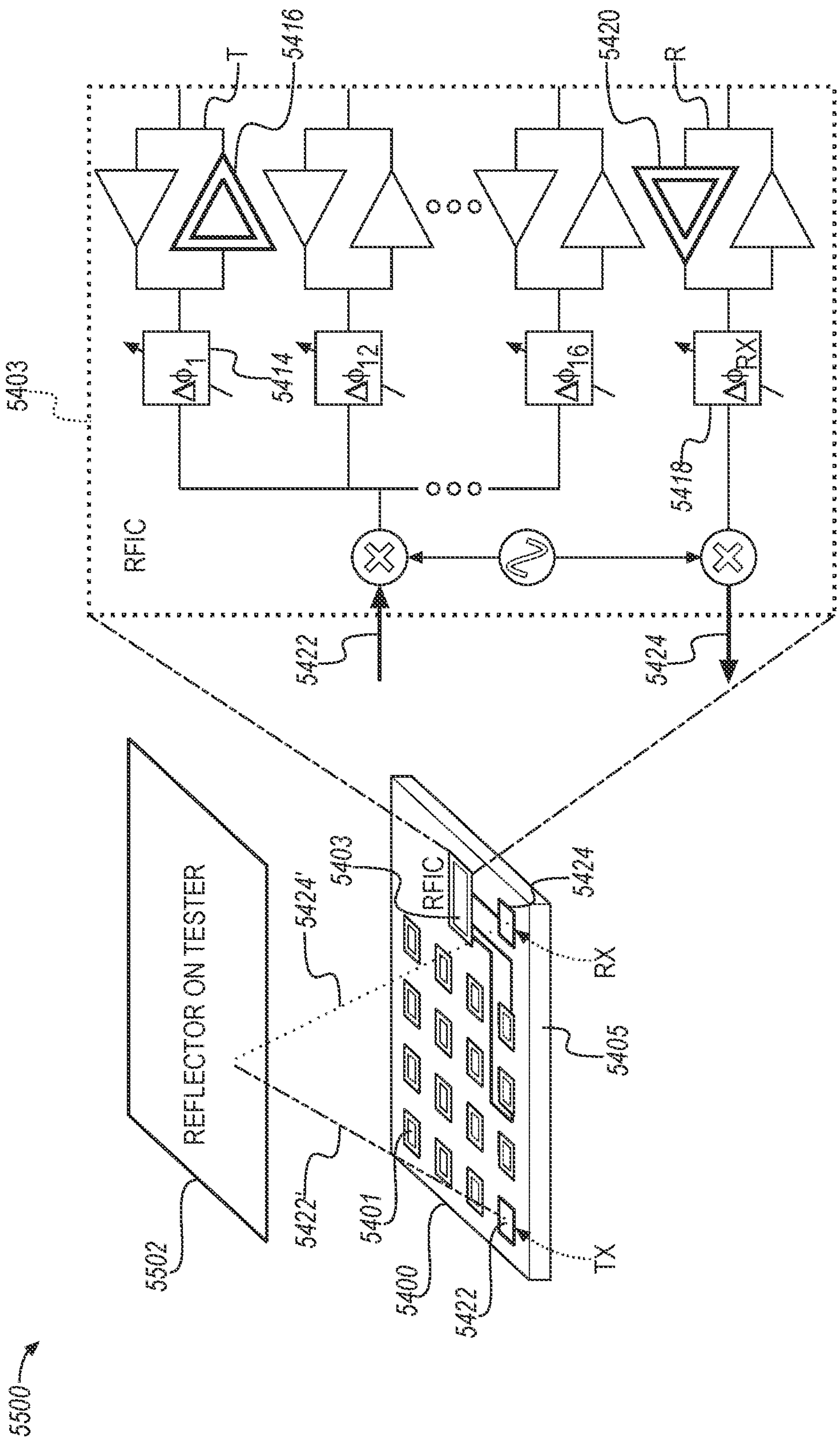
FIG. 55 illustrates a 60 GHz SIP placed on a self-tester, according to some aspects.

FIG. 55 illustrates a 60 GHz SIP placed on a self-tester, according to some aspects. The SIP placed on the tester is seen generally at 5500. A tester useful for the tests such as those described herein, generally includes at least one computer, power, software, computer-readable hardware storage that includes computer instructions which, when executed by the computer, tests a system under test according to predetermined tests, and docking capabilities including a test bed for receiving and securing the systems under test. SIP 5400 may be the type of SIP illustrated at 5400 of FIG. 54A that includes 542 antennas (one of which is enumerated as 5401) and RFIC 5403 on substrate 5405. RFIC 5403 may include power amplifier 5416 configured to drive the antennas of SIP 5400 and low noise amplifier 5420 configured to receive from the antennas of SIP 5400. Phase shifters 5414, 5418 may be included to aid in beamforming as needed. One of the antenna elements T of the phased array is set in transmit mode. The transmit (TX) antenna 5422 transmits a 60 GHz signal. A reflector 5502 is fitted on the tester and reflects the 60 GHz signal back to the SIP, where it is collected by a receive (RX) antenna 5424. The reflector in some aspects would be on top of the IC being tested, hence on top of the tester discussed above, and discussed in further detail below. Some current testers have an arm with a mmWave horn antenna and down-converter/up-converter to receive or transmit the reference signals for calibration. In the disclosed system, the reference radio at the end of the arm of current testers would be replaced by a simple reflector 5502. This should allow an easy fit for today's testers (which typically test circuits designed for less than 60 GHz) to be adapted for mmWave testing.

The signal of the receive-antenna 5424 is amplified and down-converted in the RFIC in some aspects. The arrangement of FIG. 55 establishes a loopback around the entire 60 GHz system which can be used to measure certain key performance metrics (e.g., gain), determine if the part is good or should be discarded, and/or calibrate the part against manufacturing variations such as mismatches discussed in greater detail below. This arrangement solves two important issues of 60 GHz HVM testing:

1. It establishes a baseband-to-baseband loopback on the tester. Therefore, the tester does not need an expensive 60 GHz upgrade. Only an inexpensive reflector (e.g., metal fixture) may be needed to be fitted on the tester in some aspects.

2. The loopback includes the 60 GHz antennas. The loopback test can therefore pinpoint antenna-related issues, (e.g., substrate misprocessing), or assembly imperfections. Because antennas are in the loopback test there is complete system testing, not only RFIC testing.

Figure 56B:
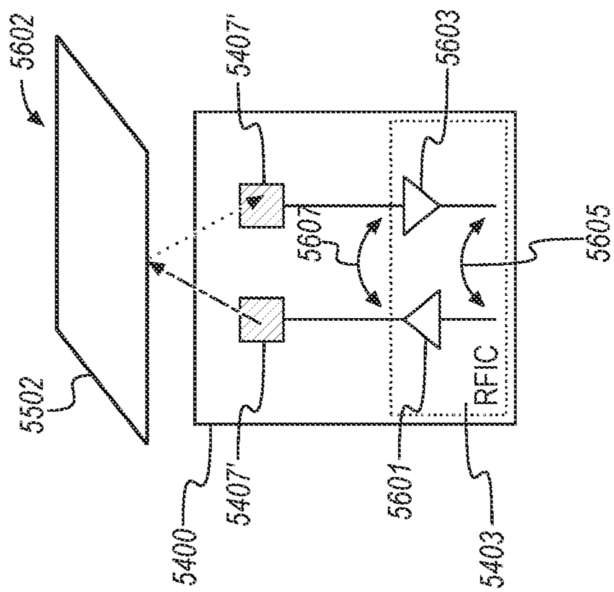
FIG. 56B illustrates an exemplary test setup for a second part of a test to address undesired on-chip or on-package crosstalk in an SIP, according to some aspects.
Figure 56A:
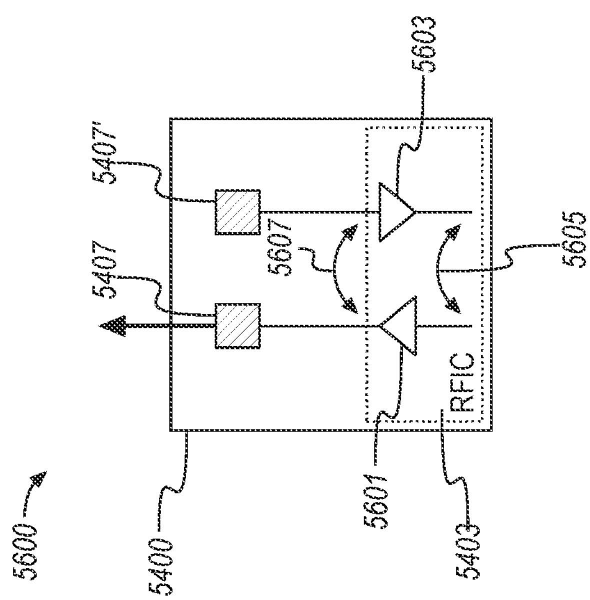
FIG. 56A illustrates a test setup for a first part of a test to address undesired on-chip or on-package crosstalk in an SIP, according to some aspects.

FIG. 56A illustrates a test setup for a first part of a test to address undesired on-chip or on-package crosstalk in an SIP, according to some aspects. In FIG. 56A, 5600 indicates a first setup to address crosstalk. In some aspects the elements are the same elements as those illustrated in FIGS. 54A and 54B, and the same reference numerals will be used for clarity.

RFIC 5403 includes power amplifier 5601 and low noise amplifier 5603, each of which is respectively coupled to antennas 5407, 5407'. Crosstalk is indicated at 5605, 5607. The system under test 5600 is on the tester as illustrated at FIG. 55 but with the reflector removed, which may be done automatically by an electromechanical removal/add mechanism in some aspects. In FIG. 56B, 5602 illustrates a second test setup to address undesired on-chip or on-package crosstalk in an SIP, according to some aspects. In some aspects the elements of FIG. 56B are the same as those illustrated in FIG. 56A except that the reflector 5502 has been added back, which may also be done automatically by an electromechanical removal/add mechanism in some aspects.

Figure 57:
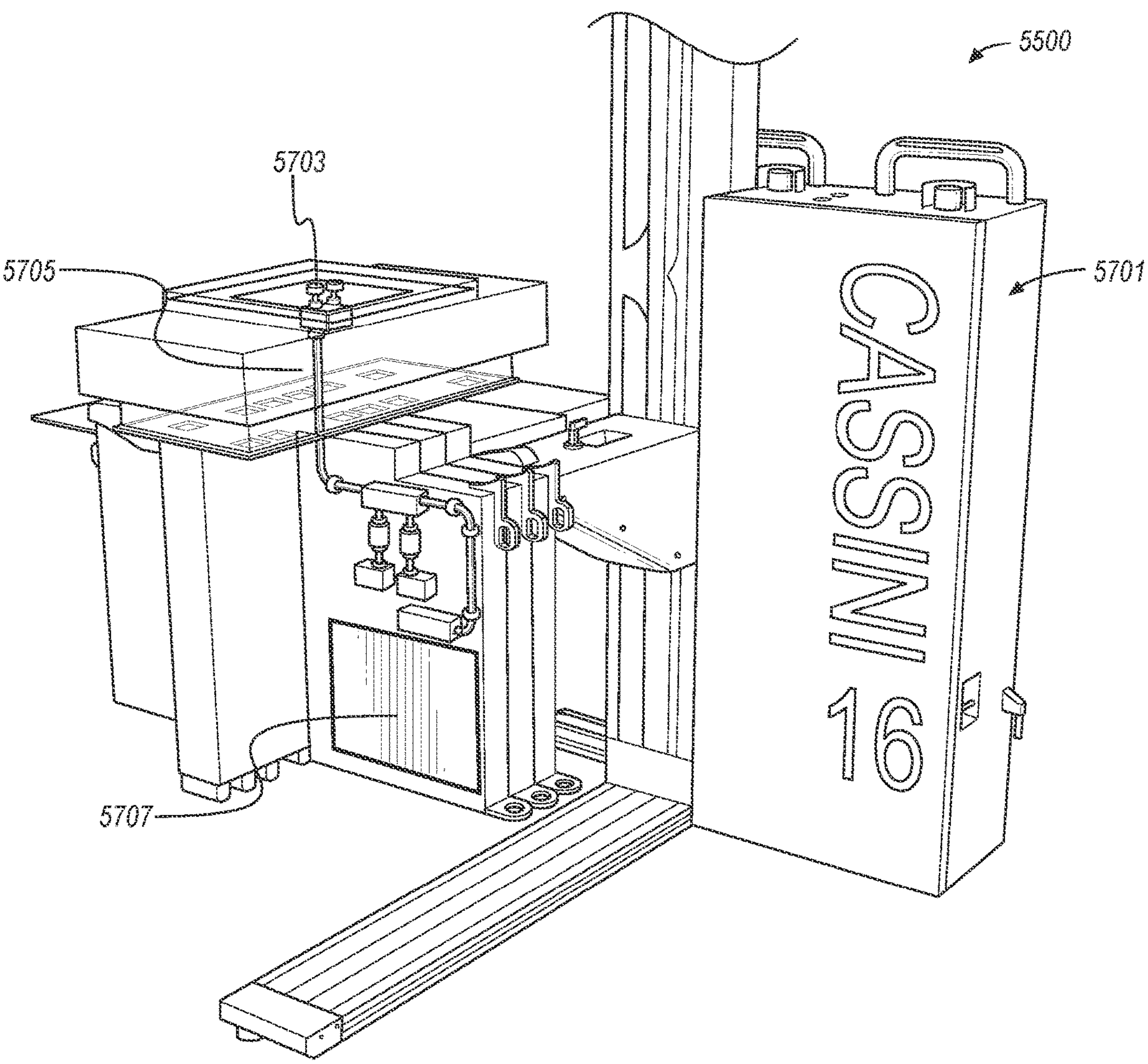
FIG. 57 illustrates exemplary automated test equipment suitable for testing a 60 GHz phased array SIP, according to some aspects.

FIG. 57 illustrates automated test equipment suitable for testing a 60 GHz phased array SIP, according to some aspects. Illustrated at 5700 is automatic test equipment to which the test setups of FIGS. 55 through 56C may be attached. Illustrated is a Cassini™ 16™ automatic tester 5701 which, when modified as described herein, is an example of a system that may be programmed to implement the tests discussed. Those of ordinary skill in the art would recognize that the described tester model is one of a number of testers that may test at less than 60 GHz and that can be modified for 60 GHz tests as described herein. Tester 5701 includes mmWave port architecture 5703, production waveguide interconnect 5705, and mmWave Test Instrument Module 5707, according to some aspects. The tester may be modified by adding the test aspects described above.

Figure 58:
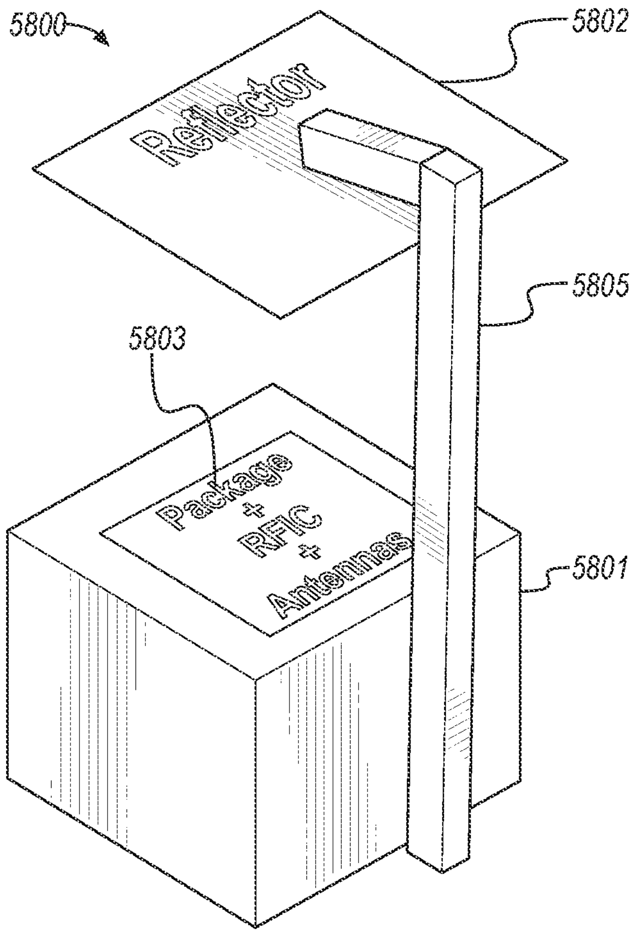
FIG. 58 illustrates an exemplary component to be added to the automated test equipment of FIG. 57, according to some aspects.

FIG. 58 illustrates a reflector that may be added to the automated test equipment of FIG. 57, according to some aspects. Illustrated conceptually at 5800, reflector 5502 is attached above test bed 5801. Test bed 5801, which may be the appropriate system test bed for mounting systems under test 5803 to the tester of FIG. 57 may include or interface with an automatic electromechanical device to place the systems on the test bed for testing, and to remove the systems after test, as is usually done in HVM. Reflector 5502 is connected to the tester, in the aspect under discussion, conceptually by mechanical arm 5805. Those of ordinary skill in the art would recognize that although the attachment is illustrated conceptually by mechanical arm 5805, in practice, attachment may be by electromechanical removal/adding mechanism for use in the crosstalk tests described herein, in some aspects. For example, in some aspects there may be an arm on the side of the tester, to which arm the reflector would be attached. There might also be associated motors to provided tilt for the reflector if appropriate.

Many 60 GHz systems are rather asymmetric, that is, they are meant to primarily source a high-rate signal (e.g., Blue ray player), or sink a high rate signal (e.g., HD TV). Having said this, many 60 GHz systems still include both TX and RX paths. For example, one example product solution has the following parameters:

| | # of 60 GHz | # of 60 GHz |
|---|---|---|
| Source (Blue ray) | 32 | 4 |
| Sink (TV) | 8 | 32 |

In cases like the above, the loopback receiver can be one of the already available receivers of the system under test, resulting in minimum overhead for the scheme of FIG. 55. The RFIC of the system under test is a phased array transceiver in some aspects, so there are multiple RXs and TXs. Therefore, one of these RX may be dedicated as the reference receiver while the TX (one TX, or all TXs with beamforming) is/are being tested. In other words, there is no need for extra mmWave receivers because the ones on the RFIC itself may be used in some aspects. However, a dedicated test-receiver can also be used if desired. 60 GHz circuits are usually small due to the high operating frequency, so even a dedicated receiver would be a small cost overhead.

The loopback test of FIG. 55 can be used to perform a host of important 60 GHz tests, according to some aspects. Tests may include:

1. Turn on the TX elements and transmit a radio signal via a TX antenna, and turn on the RX elements and receive the radio signal via a RX antenna, one by one, where the radio signal is reflected by the reflector to the RX antenna, and measure the received radio signal that is looped back via the reflector to the RX antenna. A baseband signal may be used for the radio signal. If one of the loopback measurements is lower than the rest, this would indicate a bad TX path (e.g., bad assembly). The defective path can be disabled and the part can potentially be sold as a good part (phased arrays have large redundancy, so one element less is likely to be acceptable for link-budget purposes), according to some aspects. Such a test is an attempt to make sure that all TX have same power levels and are well matched. Loopback signals can be known signals to aid measurement of TX impairments, for example, even be a simple continuous wave mmWave signal, like a single tone, with no data on it, according to some aspects.

2. Compare the loopback baseband signal strength against its expected value. If the loopback signal is correct, this indicates that the whole system (TX RFIC)-(TX antenna)-(RX antenna)-(RX RFIC) is acceptable, according to some aspects.

3. Check functionality and measure the characteristic of the phase shifter using the loopback signal. If the phase shifter characteristic is known, any phase shifter imperfections can be corrected with appropriate lookup table (LUT) mappings, according to some aspects. This test allows adjustment of the phase of each antenna element so that the beam (RX or TX) can be steered in the desired direction. As used here, characteristic of the phase shifter means a phase shifter control code versus the actual achieved phase shifting. This test can also be done across different frequencies or RF channels, according to some aspects. As an example, one RX can be selected as the reference RX, and then only one TX can be turned on, and vary the phase of the TX signal with the TX phase-shifter, such as phase-shifter 5414 of FIG. 55, according to some aspects. The resulting TX phase can be measured at the RX by looking at the phase of the baseband signal (the demodulated baseband signal has both I and Q components, so phase can be measured). Phase measurement is always relative, so for example the TX phase shifter can be set to zero, the reference phase at the RX can be measured, and then sweep the TX phase and measure the new phase relative to the reference value. In this way, the characteristic of that TX phase shifter in terms of control versus phase shift can be measured. Once the real control code versus phase shift of the TX is measured, the look-up table referenced above can be used to map essentially every specific phase shift to the control code.

4. Turn on the TX elements one by one and measure the amplitude and phase mismatch between paths (e.g., due to manufacturing variations (RFIC, package, assembly)). For the same setting in the amplitude and phase shifter, all the TX signals should have the same amplitude and phase. However, due to process mismatch, variation of the antennas, or routing on the package, this may not be the case. So by comparing all TX measurements, mismatches between all TX elements can be extracted. By measuring the received baseband signal, in terms of amplitude and phase, one of the TX signals can be used as reference to which the other TX signals are compared.

Accurate mismatch measurements may be needed for accurate beamforming. It may appear that the tolerance of the reflector position in FIG. 55 could distort the mismatch measurements by changing the distance travelled by the waves. However, careful analysis has shown that reflector position tolerance errors are essentially immaterial as far as beamforming is concerned, according to some aspects.

All TX elements can be turned on at the same time and loop-back measurements can be used to estimate the array gain which is key parameter for a 60 GHz array, according to some aspects. If all the TX elements are on with the same power and all phases aligned, the tester should receive 20*log (N) higher power at RX, where N is the number of TX elements. The array gain of 10*log 10 (N) is from beamforming; the additional array gain of 10*log (N) is from the fact that there are N TX elements on at the same time (so N times higher TX power).

Many of the tests above have been described with an emphasis on TX testing. Similar tests can be used for RX testing. For example, one of the TX's of the system or a dedicated TX can be used to transmit the signal for loop-back, according to some aspects. The tests are essentially the same for TX, with the reference RX swapped with reference TX and the TX swapped with RX for each of the antenna elements. It is conceivable that the RX test element in FIG. 55 is defective. Many practical 60 GHz systems already include more than one RX, so measurements over different RX's can be used to eliminate this risk, according to some aspects.

The above tests represent a series of tests that may be used for testing an SIP or other system that operates by transmission and reception of radio signals. Those of ordinary skill in the art would recognize that the numerical sequence in which the series of tests are run is not a prerequisite and that the tests may be run in any of various sequences depending on the needs of the system to be tested. Further, additional tests than those described may be run, again depending on the needs of the system to be tested. In practice the series of tests could be programmed into computer-readable hardware storage as instructions that when executed by a computer cause the computer to control the performance of the series of tests.

Undesired crosstalk between the TX and RX (on-chip and on-package) establishes a parasitic loopback path that does not go through the antennas as indicated by arrows 5605, 5607 in FIG. 56A, according to some aspects. Such parasitic loopback path can distort the loopback measurements. In the proposed scheme of FIG. 55 this can be addressed as follows, according to some aspects:

Step 1—FIG. 56A: Remove the reflector 5502. Take the loopback measurement. This resulting term represents the on-chip and on-package crosstalk.

Step 2—FIG. 56B: Add the reflector 5502. Take the loopback measurement again. Subtract the complex number of Step-1 from the resultant term of this Step 2 to eliminate crosstalk, according to some aspects.

The above crosstalk removal procedure may be incorporated into each of the above tests because each test generally operates a different number of elements.

Distributed phased array systems (e.g., WiGig and 5G cellular systems) are currently used in laptops, tablets, smart phones, docking stations and other applications. Current distributed phased array systems used for WiGig and 5G communications are either super-heterodyne (dual conversion) or sliding-IF systems. In these systems, the MAC-PHY baseband sub-system receives or transmits an intermediate frequency (IF) signal, which necessitates the use of IF amplification stages, RF-IF mixers, high selectivity band-pass filters and other circuitry necessary for communicating IF signals between circuits, as well as up-conversion and down-conversion of the IF signals. The additional circuitry for IF signal processing results in a larger front-end module, higher cost for the distributed phased array system, and lower system performance. Additionally, in instances when a communication system provides MIMO support, additional coax cables (one for each MIMO rank) and signal multiplication may be needed. However, when multiplying signals, phase synchronization between the two MIMO streams is harder to achieve and guarantee, which can degrade MIMO performance.

Figure 59:
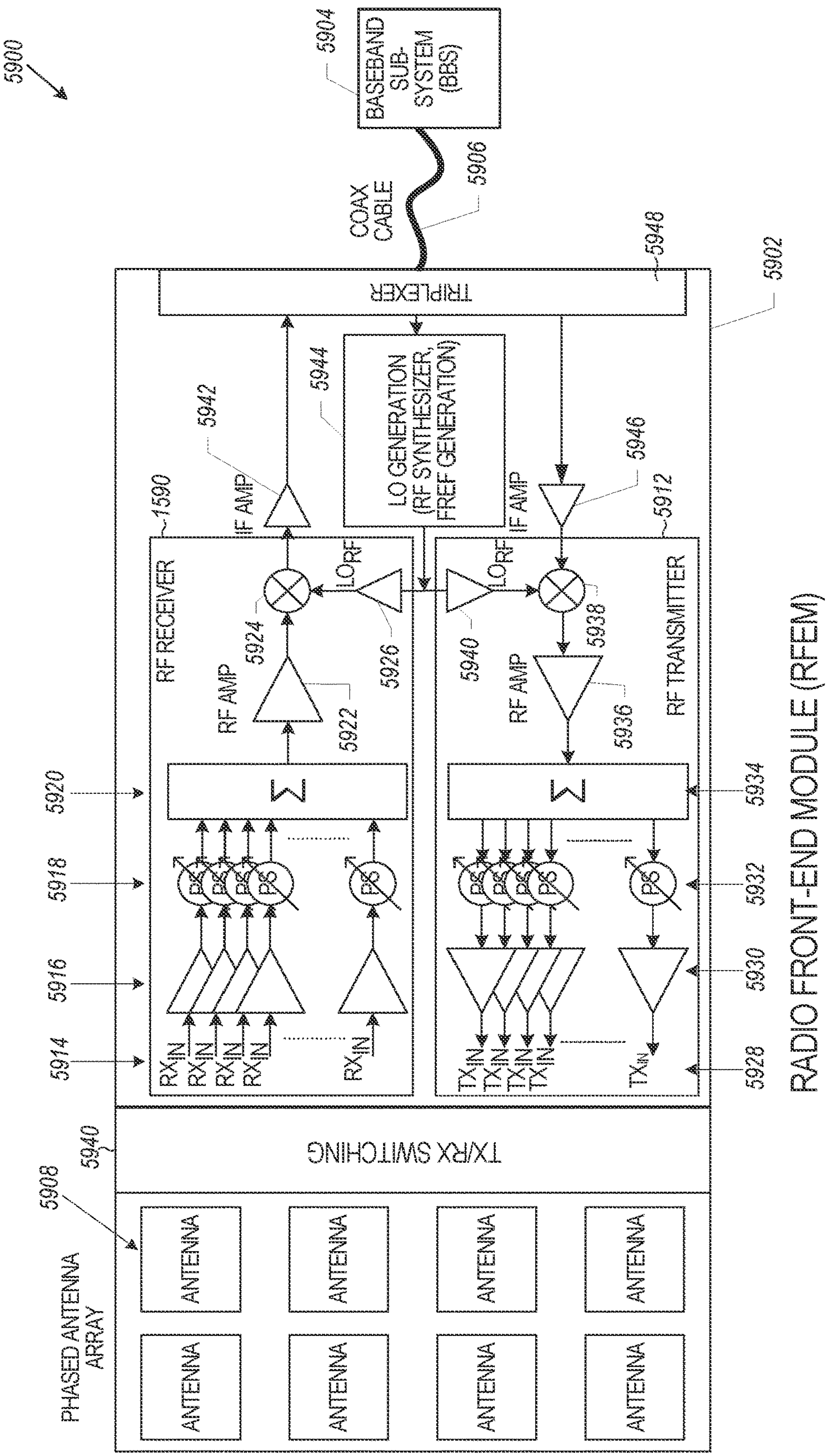
FIG. 59 illustrates an exemplary RF front-end module (RFEM) of a distributed phased array system according to some aspects.

FIG. 59 illustrates an exemplary RF front-end module (RFEM) of a distributed phased array system 5900 according to some aspects. The distributed phased array system 5900 may be incorporated in the digital baseband circuitry 310, the transmit circuitry 315, and the receive circuitry 320 of mmWave communication circuitry 300 shown in FIG. 3A, although the distributed phased array system 5900 is not limited to such.

Referring to FIG. 59, the RFEM 5902 is coupled to a baseband sub-system (BBS) 5904 via a single coax cable 5906. The RFEM 5902 can include a phased antenna array 5908, a RF receiver 5910, a RF transmitter 5912, a local oscillator (LO) generator 5944, a triplexer 5948, and a transmit (TX)/receive (RX) switch 5940. The RF receiver 5910 can include a plurality of power amplifiers 5916, a plurality of phase shifters 5918, a combiner 5920, an RF amplifier 5922, an LO amplifier 5926, and a mixer 5924. The RF receiver 5910 can also include an IF amplifier 5942.

The RF transmitter 5912 can include a mixer 5938, LO amplifier 5940, a RF amplifier 5936, a splitter 5934, a plurality of phase shifters 5932, and a plurality of amplifiers 5930. The RF transmitter 5912 can also include an IF amplifier 5946.

In an example receive operation, the switch 5940 can activate receiver chain processing. The antenna array 5908 can be used for receiving a plurality of signals 5914. The received signals 5914 can be amplified by amplifiers 5916 and their phase can be adjusted by corresponding phase shifters 5918. Each of the phase shifters 5918 can receive a separate phase adjustment signal (not illustrated in FIG. 59) from a control circuitry (e.g., from a modem within the BBS 5904), where the individual phase adjustment signals can be based on desired signal directionality when processing signals received via the phased antenna array 5908. The phase adjusted signals at the output of the phase shifters 5918 can be summed by the combiner 5920 and then amplified by the RF amplifier 5922. The LO generator 5944 can generate a LO signal using a clock frequency signal 5943 received from the BBS 5904 via the coax cable 5906. The LO signal can be amplified by the amplifier 5926 and then multiplied with the output of amplifier 5922 using the mixer 5924 in order to generate an IF input signal 5945. The IF input signal 5945 can be amplified by amplifier 5942 and then communicated to the BBS 5904 via the triplexer 5948 and the coax cable 5906. In some aspects, the IF input signal 5945 can be centered around 10.56 GHz signal.

In an example transmit operation, the switch 5940 can activate transmitter chain processing. The RFEM 5902 can receive an IF signal 5947 from the BBS 5904 via the coax cable 5906 and the triplexer 5948. The IF signal 5947 can be amplified by IF amplifier 5946 and then communicated to the mixer 5938. The mixer 5938 can receive an up-conversion LO signal from the LO generator 5944 and the LO amplifier 5940. The amplified LO signal is multiplied with the amplified received IF signal by the mixer 5938 to generate an RF signal. The RF signal is then amplified by amplifier 5936 and communicated to the splitter 5934. The splitter 5934 generates multiple copies of the amplified signal and communicates signal copies to the plurality of phase shifters 5932. The plurality of phase shifters 5932 can apply different phase adjustment signals to generate a plurality of phase adjusted signals, which can be amplified by the plurality of amplifiers 5930. The plurality of amplifiers 5930 generates a plurality of signals 5928 for transmission by the phased antenna array 5908.

Figure 60:
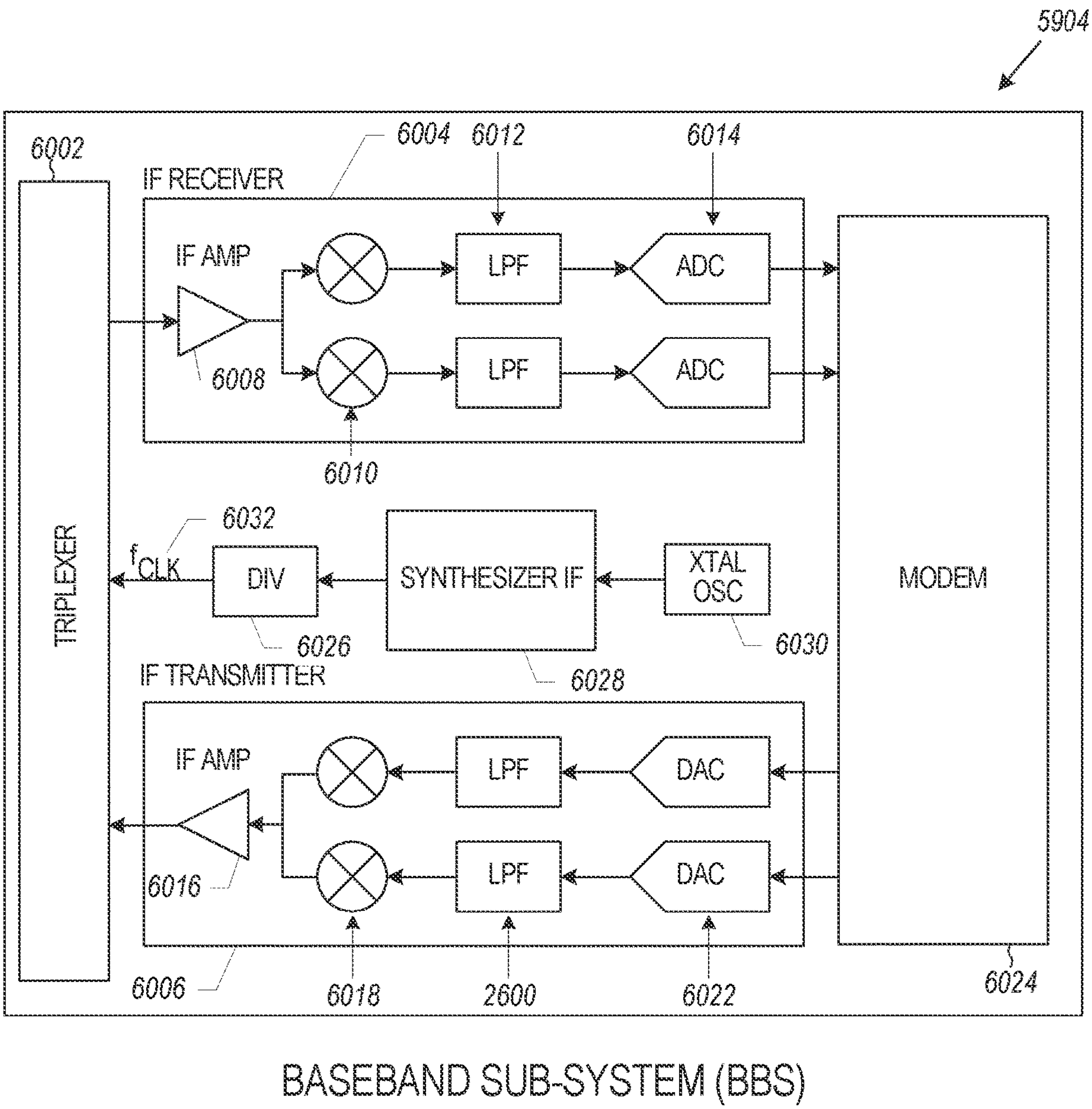
FIG. 60 illustrates an exemplary baseband sub-system (BBS) of a distributed phased array system according to some aspects.

FIG. 60 illustrates a baseband sub-system (BBS) of a distributed phased array system according to some aspects. Referring to FIG. 60, the BBS 5904 can include a triplexer 6002, an IF receiver 6004, an IF transmitter 6006, a modem 6024, a crystal oscillator 6030, a synthesizer 6028, and a divider 6026. The synthesizer 6028 may include suitable circuitry, logic, interfaces and/or code and can use a signal from the crystal oscillator 6030 to generate a clock signal. The generated clock signal can be divided by the divider 6026 to generate an output clock signal for communication to the RFEM 5902. In some aspects, the generated clock signal can have a frequency of 1.32 GHz.

The IF receiver 6304 can include an IF amplifier 6008, mixers 6010, filters 6012, and analog-to-digital conversion (ADC) blocks 6014. The IF transmitter 6006 can include digital-to-analog conversion (DAC) blocks 6022, filters 6020, mixers 6018, and IF amplifier 6016.

In an example receive operation, an IF signal (e.g., 5945) is received from the RFEM 5902 via the triplexer 6002 and is amplified by IF amplifier 6008. The amplified IF signal can be down-converted to baseband signals by the mixers 6010, then filtered by low-pass filters 6012, and converted to a digital signal by the ADC blocks 6014 before being processed by the modem 6024.

In an example transmit operation, a digital signal output by the modem 6024 can be converted to analog signals by the DAC blocks 6022. The analog signals are then filtered by the low-pass filters 6020 and then up-converted to an IF signal by the mixers 6018. The IF signal can be amplified by the IF amplifier 6016, and then communicated to the RFEM 5902 via the triplexer 6302 and the single coax cable 5906.

In some aspects, the phased antenna array 5908 within the distributed phased array system 5900 can include a plurality of antennas, which can be configured for MIMO operation. More specifically, the antennas within the phased antenna array 5908 can be configured for horizontal and vertical polarization transmission or reception. In this regard, at least two separate data streams can be processed by using horizontal and vertical polarization within the phased antenna array 5908 in connection with a MIMO operation scheme. An example distributed phased array system configured to communicate in a MIMO mode is illustrated in reference to FIG. 61 and FIG. 62.

Figure 61:
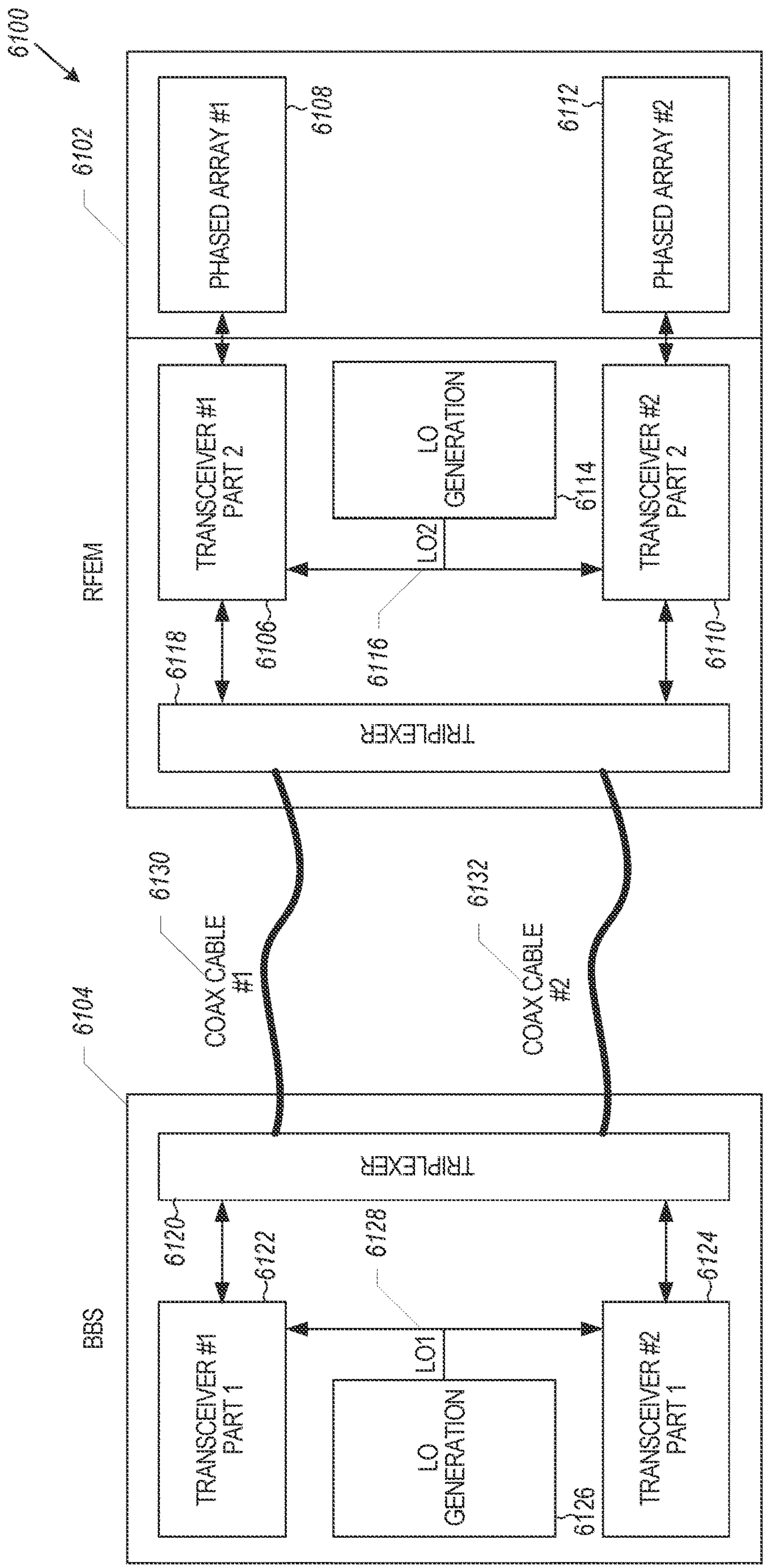
FIG. 61 illustrates an exemplary distributed phased array system with MIMO support and multiple coax cables coupled to a single RFEM according to some aspects.

FIG. 61 illustrates an exemplary distributed phased array system with MIMO support and multiple coax cables coupled to a single RFEM according to some aspects. Referring to FIG. 61, the distributed phased array system 6100 can include an RFEM 6102 and a BBS 6104. The RFEM 6102 can be similar to the RFEM 5902 in FIG. 59. In some aspects, the distributed phased array system 6100 can include two separate transceivers for processing two separate streams for MIMO operation. More specifically, a first transceiver can be used to process a first data stream for transmission or reception via the first phased antenna array 6108 (using a first type of antenna polarization), and a second transceiver can be used to process a second data stream for transmission or reception via the second phased antenna array 6112 (or using a different polarization input of the same antenna array).

The first transceiver can include a first part 6122 within the BBS 6104 and a second part 6106 within the RFEM 6102. Similarly, the second transceiver can include a first part 6124 within the BBS 6104 and a second part 6110 within the RFEM 6102.

The first transceiver parts 6122 and 6124 within the BBS 6104 can include circuitry for digitizing data signals, filtering the digital signals, and up-converting the filtered signals for communication to the RFEM 6102 for further processing and subsequent transmission by the phased antenna arrays 6108 and 6112.

The first transceiver parts 6122 and 6124 within the BBS 6104 can also include circuitry for processing intermediate frequency or radio frequency signals received via the phased antenna arrays 6108 and 6112 and processed by the RFEM, and for converting such signals into baseband and digital signals for processing. In some aspects, the first transceiver parts 6122 and 6124 can include one or more of the circuitry within the receiver block 6004 and the transmitter block 6006 in FIG. 60. The BBS 6104 can further include an LO generator 6126, which can be configured to generate a LO signal 6128. The LO signal 6128 can be used by the first transceiver parts 6122 and 6124 for up-converting a baseband signal for communication to the RFEM 6102 or for down converting an IF or RF signal received from the RFEM 6102 into a baseband signal.

The second transceiver parts 6106 and 6110 within the RFEM 6102 can include circuitry for amplifying IF or RF signals received from the BBS 6104, up-converting the amplified signals, replicating the signals, performing phase and/or amplitude adjustment of the signals prior to transmission via the phased antenna arrays 6108 or 6112. The second transceiver parts 6106 and 6110 within the RFEM 6102 can also include circuitry for processing radio frequency signals received via the phased antenna arrays 6108 and 6112, phase and/or amplitude adjusting the signals, down-converting the signals into IF signals and communicating the IF signals (or RF signals in instances when IF processing is not performed by the distributed phased array system 6100) to the BBS 6104 for processing. In some aspects, the second transceiver parts 6106 and 6110 can include one or more of the circuitry within the receiver block 5910 and the transmitter block 5912 in FIG. 59. The RFEM 6102 can further include an LO generator 6114, which can be configured to generate a LO signal 6116. The LO signal 6116 can be used by the second transceiver parts 6106 and 6110 for down-converting a RF signal for communication to the BBS 6104 or for up-converting a signal received from the BBS 6104 into a RF signal for transmission.

In some aspects, the distributed phased array system 6100 can be configured for MIMO operation so that a first data stream is communicated via the coax cable 6130 and triplexers 6120 and 6118 for transmission or reception via the phased antenna array 6108 that uses a first type of polarization. A second data stream can be communicated via the coax cable 6132 and triplexers 6120 and 6118 for transmission or reception via the second phased antenna array 6112 that uses a second type of polarization. In this regard, the distributed phased array system 6100 uses to coax cables 6130 and 6132 two communicate two independent data streams (e.g., for transmission or reception using vertical and horizontal antenna polarization) between the BBS 6104 and the RFEM 6102.

Figure 62:
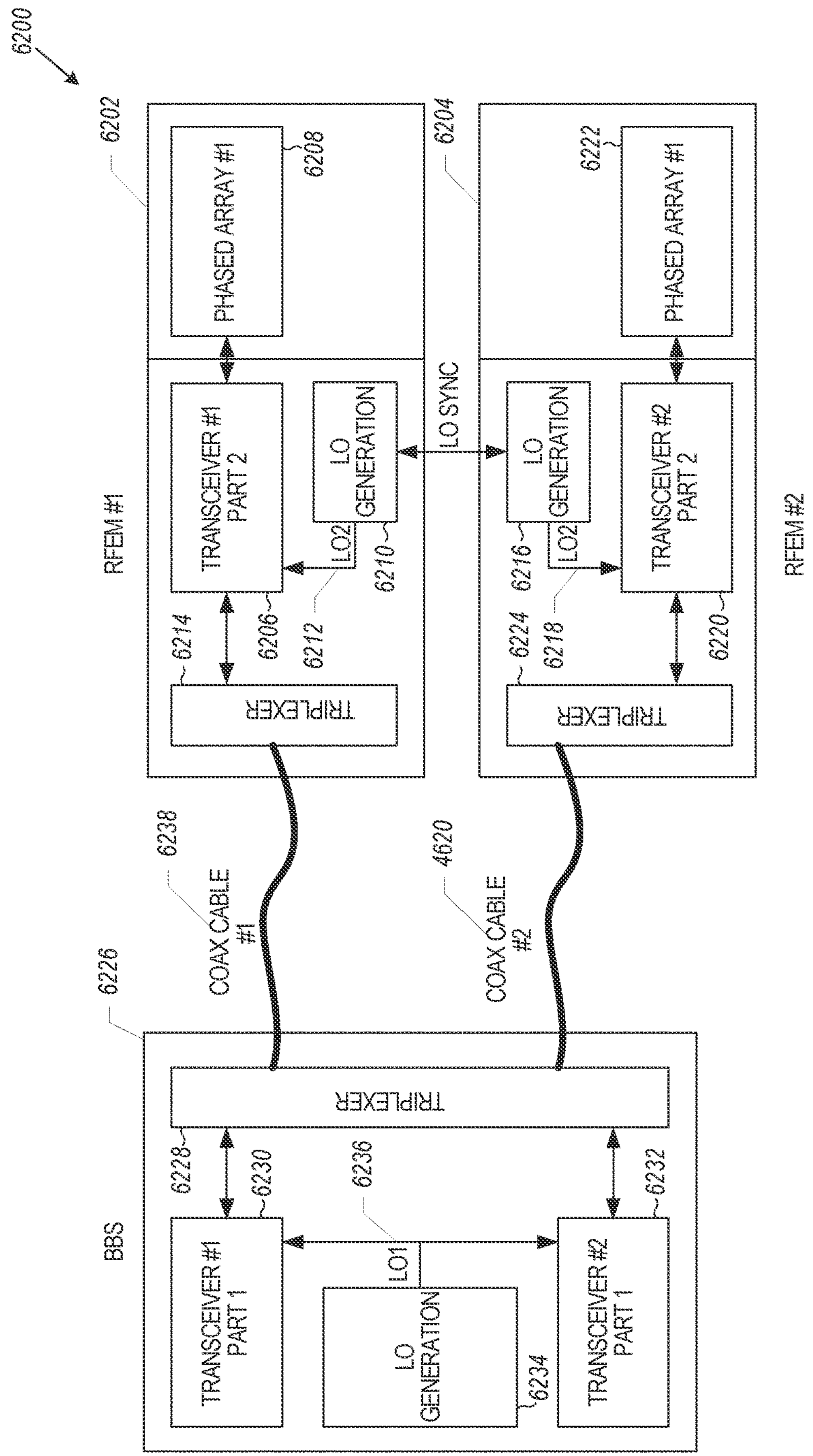
FIG. 62 illustrates an exemplary distributed phased array system with MIMO support where each RFEM transceiver is coupled to a separate coax cable according to some aspects.

FIG. 62 illustrates an exemplary distributed phased array system with MIMO support where each RFEM transceiver is coupled to a separate coax cable according to some aspects. Referring to FIG. 62, the distributed phased array system 6200 is similar to the distributed phased array system 6100 except that the second transceiver parts are each located in a separate RFEM. The separate transceiver part configuration in FIG. 62 can be used in instances when the RFEMs are available as separate modules (e.g., each RFEM is on a single chip).

The distributed phased array system 6200 can include an RFEM 6202, RFEM 6204, and a BBS 6226. The RFEMs 6202 and 6204 can be similar to the RFEM 5902 in FIG. 59. In some aspects, the distributed phased array system 6200 can include two separate transceivers for processing two separate streams for MIMO operation. More specifically, a first transceiver can be used to process a first data stream for transmission or reception via the first phased array 6208 (using a first type of antenna polarization), and a second transceiver can be used to process a second data stream for transmission or reception via the second phased array 6222 (using a second type of antenna polarization).

The first transceiver can include a first part 6230 within the BBS 6226 and a second part 6206 within the RFEM 6202. Similarly, the second transceiver can include a first part 6232 within the BBS 6226 and a second part 6220 within the RFEM 6204. The first transceiver parts 6230 and 6232 can have functionalities similar to the functionalities of the first transceiver parts 6122 and 6124. Additionally the second transceiver parts 6206 and 6220 can have functionalities similar to the functionalities of the second transceiver parts 6106 and 6110.

The BBS 6226 can include an LO generator 6234, which can be configured to generate a LO signal 6236. The LO signal 6236 can be used by the first transceiver parts 6230 and 6232 for up-converting a baseband signal for communication to the RFEMs 6202 and 6204, or for down converting an IF or RF signal received from the RFEMs 6202 and 6204 into a baseband signal.

The RFEM 6202 can include an LO generator 6210, which can be configured to generate a LO signal 6212. The LO signal 6212 can be used by the second transceiver part 6206 for down-converting a RF signal for communication to the BBS 6226 or for up-converting a signal received from the BBS 6226 into a RF signal for transmission via the array 6208.

The RFEM 6204 can include an LO generator 6216, which can be configured to generate a LO signal 6218. The LO signal 6218 can be used by the second transceiver part 6220 for down-converting a RF signal for communication to the BBS 6226 or for up-converting a signal received from the BBS 6226 into a RF signal for transmission via the array 6222.

During an example MIMO operation, a first data stream may be communicated between the BBS 6226 and the RFEM 6202 via the triplexers 6228 and 6214, and the coax cable 6238. The first data stream can be transmitted via the phased antenna array 6208, which can include vertically polarized antennas. A second data stream may be communicated between the BBS 6226 and the RFEM 6204 via the triplexer's 6228 and 6224, and the coax cable 6240. The second data stream can be transmitted via the phased antenna array 6222, which can include horizontally polarized antennas. In some aspects, the phased antenna array 6208 can include horizontally polarized antennas, and the phased antenna array 6222 can include vertically polarized antennas.

As seen in FIG. 61 and FIG. 62, in some distributed phased array communication systems configured for MIMO operation, a separate coax cable is used for each MIMO stream communicated between a BBS and a RFEM. Additionally and as seen in FIG. 62, in order to improve the operation of the MIMO system, phase noise synchronization may be needed (the LO generator's 6210 and 6216 can be synchronized via the LO synchronization signal as seen in FIG. 62). Using multiple coax cables however can be challenging in mobile devices due to limited space and added cost of implementation.

In some aspects, a distributed phased array communication system can be configured for MIMO operation where two independent MIMO data streams can be communicated over a single coax cable coupling a BBS and a RFEM. More specifically, the two separate MIMO data streams can be configured so they are at non-overlapping frequencies. For example, a LO generator within a BBS can generate one or more LO signals, which can be used for up converting two separate data streams into different RF frequencies. The LO generator can also generate an additional LO signal, which can be used for conversion of the two separate data streams into a desired frequency at the RFEM. The two separate data streams can be communicated together (e.g., as RF signals with non-overlapping frequencies) with the additional LO signal via the single coax cable, where the additional LO signal can be used to up convert or down-convert one or more of the MIMO streams to a desired transmit or receive frequency. By using a single LO generator to generate the LO signal's used to process the two MIMO streams as well as the LO signal communicated together with the MIMO streams via the single coax cable, synchronization of the phase noise and phase noise correlation between the MIMO streams is achieved. The phase noise correlation can be when the signals are at the original LO frequencies or at a multiplied or divided value of the LO frequencies.

Figure 63:
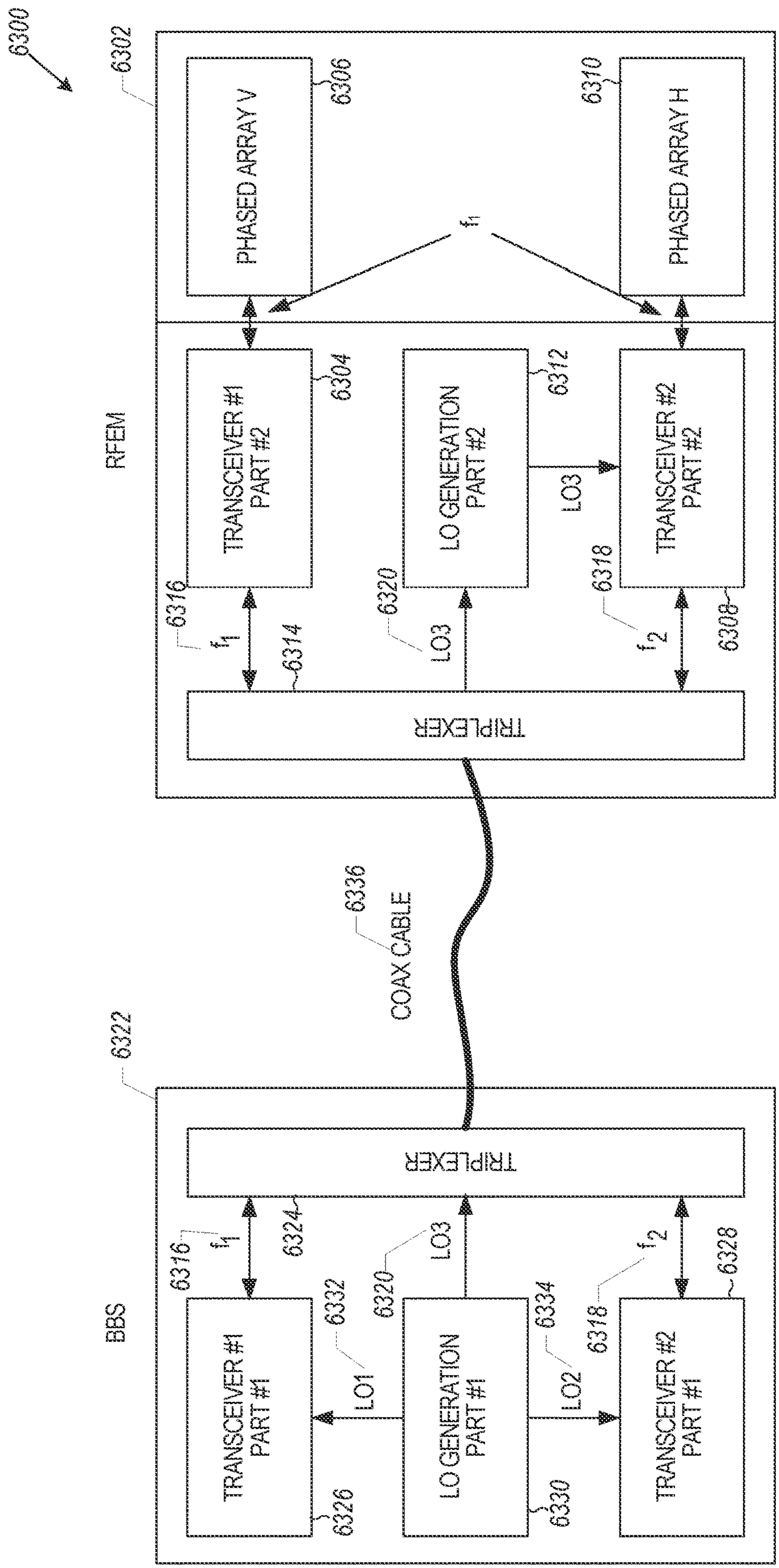
FIG. 63 illustrates an exemplary distributed phased array system with MIMO support and a single coax cable coupled to a single RFEM according to some aspects.

FIG. 63 illustrates an exemplary distributed phased array system with MIMO support and a single coax cable coupled to a single RFEM according to some aspects. Referring to FIG. 63, the distributed phased array system 6300 can include an RFEM 6302 and a BBS 6304. The RFEM 6302 and the BBS 6322 can be similar to the RFEM 5902 and BBS 5904 in FIGS. 59-60.

In some aspects, the distributed phased array system 6300 can include two separate transceivers for processing two separate streams for MIMO operation. More specifically, a first transceiver can be used to process a first data stream for transmission or reception via the first phased antenna array 6306 (using a first type of antenna polarization), and a second transceiver can be used to process a second data stream for transmission or reception via the second phased array 6310 (using a second type of antenna polarization).

The first transceiver can include a first part 6326 within the BBS 6322 and a second part 6304 within the RFEM 6302. Similarly, the second transceiver can include a first part 6328 within the BBS 6322 and a second part 6308 within the RFEM 6302. The first transceiver parts 6326 and 6328 within the BBS 6322 can include circuitry for digitizing data signals, filtering the digital signals, and up converting the filtered signals for communication to the RFEM 6302 for further processing and subsequent transmission by the phased antenna arrays 6306 and 6310. The first transceiver parts 6326 and 6328 within the BBS 6322 can also include circuitry for processing intermediate frequency or radio frequency signals received via the phased antenna arrays 6306 and 6310 and processed by the RFEM 6302, and for converting such signals into baseband and digital signals for processing. In some aspects, the first transceiver parts 6326 and 6328 can include one or more of the circuitry within the receiver block 6004 and the transmitter block 6006 in FIG. 60.

The BBS 6322 can further include an LO generator 6330, which can be configured to generate LO signals 6332, 6334 and 6320. The LO signals 6332 and 6334 can be used by the first transceiver parts 6326 and 6328, respectively, for up-converting a baseband signal (to IF or RF signal) for communication to the RFEM 6302 or for down converting an IF or RF signal received from the RFEM 6302 into a baseband signal.

The second transceiver parts 6304 and 6308 within the RFEM 6302 can include circuitry for amplifying IF or RF signals received from the BBS 6322, up-converting the amplified signals, replicating the signals, performing phase and/or amplitude adjustment of the signals prior to transmission via the phased antenna arrays 6306 and 6310.

The second transceiver parts 6304 and 6308 within the RFEM 6302 can also include circuitry for (1) processing radio frequency signals received via the phased antenna arrays 6306 and 6310, (2) phase and/or amplitude adjusting the signals, and/or (3) down-converting the signals into IF signals and communicating the IF signals (or RF signals in instances when IF processing is not performed by the communication system 6300) to the BBS 6322 for processing. In some aspects, the second transceiver parts 6304 and 6308 can include one or more of the circuitry within the receiver block 5910 and the transmitter block 5912 in FIG. 59.

The RFEM 6302 can further include an LO generator 6312, which can be configured to generate LO signal used by the second transceiver parts 6304 and 6308 for up-converting or down-converting signals. In some aspects, the LO generator 6312 can include frequency manipulation circuitry such as frequency dividers and multipliers, can be configured to generate a LO signal using another LO signal generated by the LO generator 6330 and received from the BBS 6322 via the triplexers 6324, 6314, and the single coax cable 6336.

In some aspects, the distributed phased array communication system 6300 can be configured for MIMO operation with two data streams be communicated simultaneously via the triplexers 6324, 6314, and the coax cable 6336. More specifically, two independent data streams can be generated at baseband frequencies at the BBS 6322. The LO generator 6330 can include a single frequency source within the communication system 6300, and is configured to generate LO frequencies for two distinct up conversion schemes performed by the first transceiver parts 6326 and 6328 respectively. For each of the two schemes, one LO frequency is used for up conversion of the baseband stream to a desired IF frequency within the BBS 6322.

For example, the LO generator 6330 can generate a first LO signal 6332, which can be used by first transceiver part 6326 to up convert a first MIMO stream 6316 to a desired frequency f1 (e.g., a transmission frequency). The LO generator 6330 can generate a second LO signal 6334, which can be used by the first transceiver report 6328 to up convert a second MIMO stream 6318 to a second frequency f2. The LO generator 6330 additionally generates a third LO signal 6320, which can be used (either directly or by simple manipulation) to up convert one or both of the MIMO data streams to a desired RF frequency. In the example illustrated in FIG. 63, the first MIMO stream 6316 is already unconverted, and is at the desired frequency f1 within the BBS 6322. In this regard, the third LO signal 6320 can be communicated to the RFEM 6302 via a single coax cable 6336, and used by the second transceiver part 6308 to up convert the second MIMO stream 6318 to the desired frequency f1 prior to transmission by the phased antenna array 6310.

In some aspects, the two MIMO streams 6316 and 6318 can be generated at IF or RF frequencies, and can be communicated together with the third LO signal 6320 to the RFEM 6302 via the single coax cable 6336. In this regard, RF-over-cable (RFoC) communication techniques can be used to communicate the two MIMO streams together with the LO signal via a single coax cable between the BBS and the RFEM within the communication system 6300. The two up-conversion schemes for generating the MIMO streams 6316 and 6318 can be designed such that the four signal frequencies associated with the two MIMO streams 6316, 6318, and the frequencies of the LO signals 6332 and 6334 will not overlap. In some aspects, one of the two up-conversion schemes (e.g., generating the MIMO stream 6316) can be a direct conversion scheme such that no LO signal is needed to generate the corresponding MIMO stream (e.g., 6316).

As seen in FIG. 63, the first MIMO data stream 6316 is communicated (at the desired frequency f1) via the coax cable 6336 and triplexers 6324 and 6314 for transmission or reception via the phased antenna array 6306 that uses a first type of polarization. A second MIMO data stream 6318 is communicated (at frequency f2) via the coax cable 6336 and triplexers 6324 and 6314 for transmission or reception via the second phased antenna array 6310 that uses a second type of polarization.

Additionally, the LO generator 6312 receives the third LO signal 6320 together with the two MIMO streams via the coax cable 6336, and communicates the LO signal 6320 (or generates another LO signal by frequency manipulation of LO signal 6320) to the second transceiver part 6308. Since the second MIMO stream 6318 is at frequency f2 (which is not the desired frequency f1), the second transceiver part 6308 can use the LO signal received from the LO generator 6312 to up-convert or down-convert the second MIMO stream 6318 so that it is also at the desired frequency f1 prior to transmission by the phased antenna array 6310.

In this regard, the distributed phased array system 6300 uses coax cables 6130 and 6132 to communicate two independent data streams and at least one LO signal (e.g., for transmission or reception using vertical and horizontal antenna polarization) between the BBS 6322 and the RFEM 6302.

In some aspects, the first MIMO stream 6316 and the second MIMO stream 6318 can be generated at frequencies that are not overlapping and are not a desired frequency. In this case, the LO generator 6330 can generate two separate LO signals, which can be communicated together with the MIMO streams 6316 and 6318 via the single coax cable 6336 to the RFEM 6302. The two separate LO signals can be used within the RFEM 6302 for converting the two MIMO streams 6316 and 6318 into a desired transmit frequency.

In some aspects, the first MIMO stream 6316 and the second MIMO stream 6318 can be generated at frequencies that are not overlapping and are not a desired frequency. In this case, the LO generator 6330 can generate one separate LO signal, which can be communicated together with the MIMO streams 6316 and 6318 via the single coax cable 6336 to the RFEM 6302. The one separate LO signal can be used within the RFEM 6302 for converting one of the two MIMO streams into a desired transmit frequency. The LO generator 6312 can use the one separate LO signal to generate another LO signal (e.g., by frequency manipulation), which can be used to convert the remaining MIMO stream into the desired transmit frequency. In this case, the two MIMO streams are communicated with a single LO signal between the BBS 6322 and RFEM 6302 via the single coax cable 6336.

In an example and as seen in FIG. 63, one of the MIMO streams (e.g., 6316) is generated at the desired frequency f1. The second MIMO stream 6318 is generated at a different (not overlapping) frequency f2, which can be higher or lower than f1. The two MIMO streams 6316 and 6318 can be communicated via the single coax cable 6336 together with the third LO signal 6320. The third LO signal 6320 can be at a frequency that is a difference between the frequencies f1 and f2 associated with MIMO streams 6316 and 6318 respectively.

Figure 65:
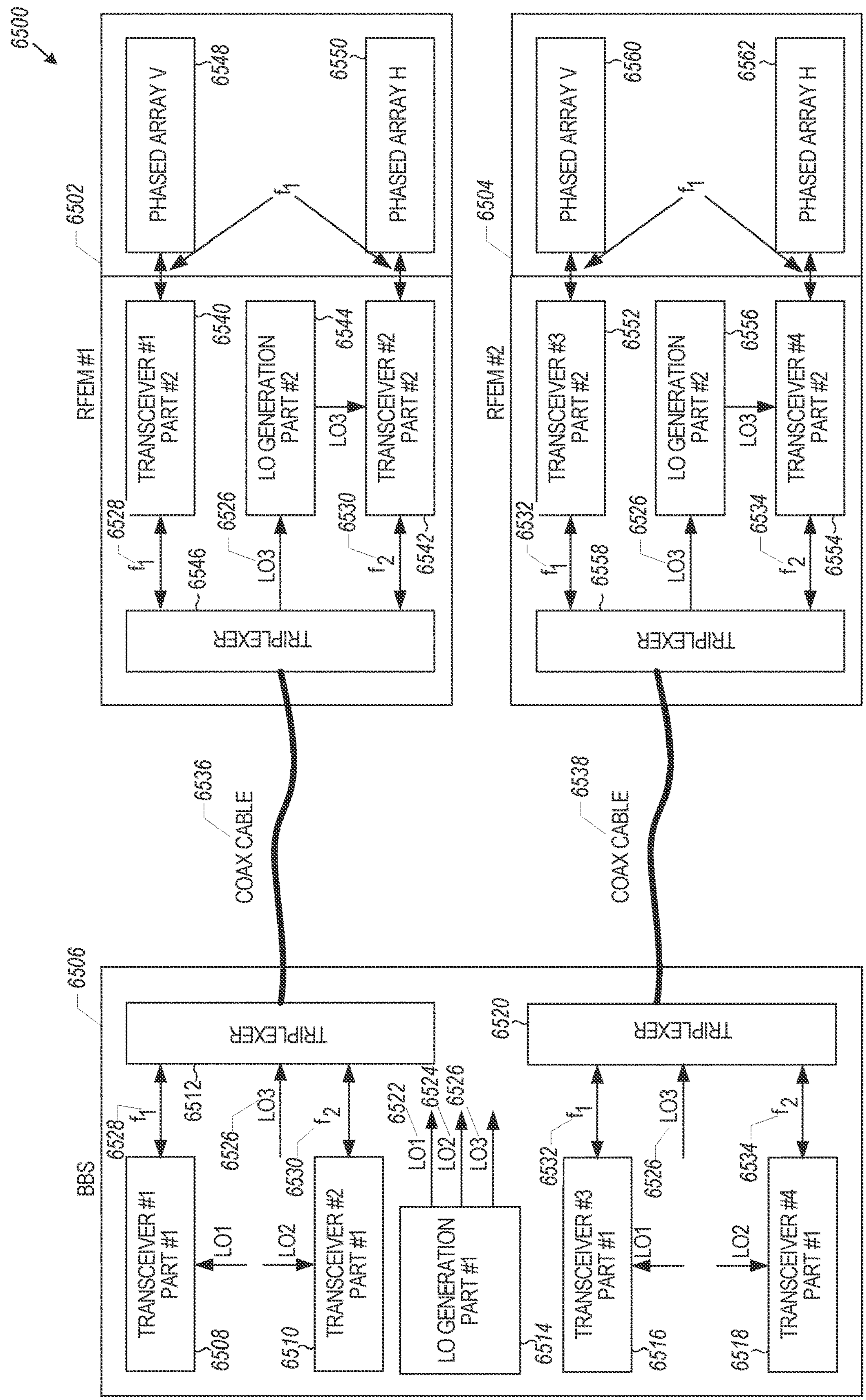
FIG. 65 illustrates an exemplary distributed phased array system with a single BBS and multiple RFEMs with MIMO support and a single coax cable between the BBS and each of the RFEMs according to some aspects.

Since the various frequency signals are generated from a single frequency synthesizer source within the system 6300 (e.g., LO generator 6330), and since only simple frequency manipulation (e.g., division or multiplication) is utilized to manipulate LO signals within the RFEM 6302, phase relationship between the resulting RF streams (e.g., 6316 and 6318) can be maintained regardless of the number of RFEMs used or the RFEM location. Put another way, by using the same two up-conversion schemes to generate IF or RF MIMO streams and transmit them over a single coax with one or more LO signals, a phase relationship between the MIMO streams can be maintained even if the streams are received for processing by remote RFEMs (a multiple RFEM processing scenario is illustrated in FIG. 65).

Even though FIG. 63 illustrates generation of the MIMO streams at the BBS 6322 and then communication for processing and transmission by the RFEM 6302, the disclose techniques can also be used for MIMO streams that are received by the phased antenna arrays 6306 and 6310 and then communicated for processing to the BBS 6322.

Figure 64:
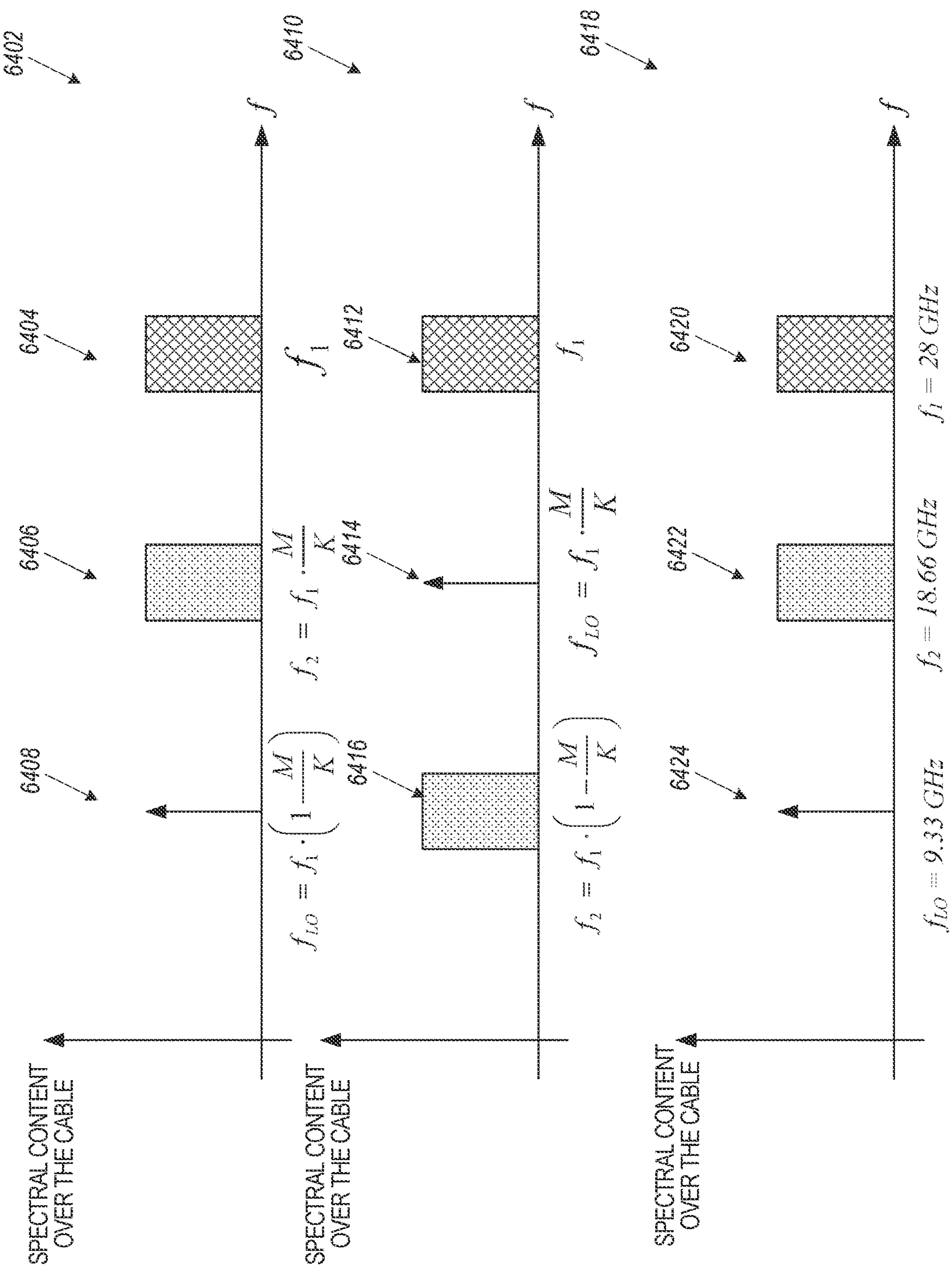
FIG. 64 illustrates exemplary spectral content of various signals communicated on the single coax cable of FIG. 3 according to some aspects.

FIG. 64 illustrates spectral content of various signals communicated on the single coax cable of FIG. 63 according to some aspects. Referring to FIG. 64, signal diagram 6402 illustrates the frequency of the spectral content communicated over the single coax cable 6336. More specifically, signal diagram 6402 illustrates the frequencies of a first MIMO stream 6402, a second MIMO stream 6406, and a LO signal 6408. In some aspects, the first MIMO stream 6404 can be at a desired frequency f1, and the second MIMO stream 6406 can be at a frequency f2, which is a fraction of frequency f1 (e.g., f2 is M/K times frequency f1, where M and K are integers higher than 1). The frequency of the LO signal 6408 can be lower than the frequency of the second MIMO stream 6406, and can be determined based on the same fraction associated with the second MIMO stream 6406. For example, the frequency of the LO signal 6408 can be designated as $f_{LO}$ and can be determined based on the equation $$f_{LO} = f_1 \times \left(1 - \frac{M}{K}\right).$$

In this regard, the second MIMO stream 6406 with frequency f2 can be converted to the desired frequency f1 by mixing it with the LO signal at frequency fro.

Referring to FIG. 64, signal diagram 6410 illustrates the frequencies of a first MIMO stream 6412, a second MIMO stream 6416, and a LO signal 6414. In some aspects, the first MIMO stream 6412 can be at a desired frequency f1, and the LO signal 6414 can be at a frequency f2, which is a fraction of frequency f1 (e.g., f2 is M/K times frequency f1, where M and K are integers higher than 1). The frequency of the second MIMO stream 6416 can be lower than the frequency of the LO signal 6414, and can be determined based on the same fraction associated with the LO signal 6414. For example, the frequency of the LO signal 6414 can be $$f_{LO} = f_1 \times \frac{M}{K}.$$

The frequency of the second MIMO stream 6416 can be designated as f2 and can be determined based on the equation $$f_2 = f_1 \times \left(1 - \frac{M}{K}\right).$$

Referring to FIG. 64, signal diagram 6418 illustrates the frequency of the spectral content communicated over the single coax cable 6336. More specifically, signal diagram 6418 illustrates the frequencies of a first MIMO stream 6420, a second MIMO stream 6422, and a LO signal 6424. In some aspects, the first MIMO stream 6420 can be at a desired frequency of 28 GHz, and the second MIMO stream 6422 can be at a frequency 18.66 GHz, which is a fraction of 28 GHz (e.g., ⅔ of 28 GHz). The frequency of the LO signal 6424 can be lower than the frequency of the second MIMO stream 6422, and can be determined based on the same fraction associated with the second MIMO stream 6406 (e.g., fro can be 9.33 GHz, which is ⅓ of 28 GHz).

FIG. 65 illustrates an exemplary distributed phased array system with a single BBS and multiple RFEMs with MIMO support and a single coax cable between the BBS and each of the RFEMs according to some aspects. Referring to FIG. 65, the distributed phased array system 6500 can include RFEMs 6502, 6504, and a BBS 6506. The RFEMs 6502 and 6504 and the BBS 6506 can be similar to the RFEM 6302 and BBS 6322 in FIG. 63. In some aspects, the distributed phased array system 6500 can include four separate transceivers for processing four separate streams for MIMO operation. More specifically, a first transceiver can be used to process a first data stream for transmission or reception via the first phased array 6548 (using a first type of antenna polarization), and a second transceiver can be used to process a second data stream for transmission or reception via the second phased array 6550 (using a second type of antenna polarization). A third transceiver can be used to process a third data stream for transmission or reception via the third phased array 6560 (using the first type of antenna polarization), and a fourth transceiver can be used to process a fourth data stream for transmission or reception via the fourth phased array 6562 (using the second type of antenna polarization).

The first transceiver can include a first part 6508 within the BBS 6506 and a second part 6540 within the RFEM 6502. The second transceiver can include a first part 6510 within the BBS 6506 and a second part 6542 within the RFEM 6502. The third transceiver can include a first part 6516 within the BBS 6506 and a second part 6552 within the RFEM 6504. The fourth transceiver can include a first part 6518 within the BBS 6506 and a second part 6554 within the RFEM 6504.

The first transceiver parts 6508, 6510, 6516, and 6518 within the BBS 6506 may include circuitry for digitizing data signals, filtering the digital signals, and up converting the filtered signals for communication to the RFEMs 6502 and 6504 for further processing and subsequent transmission by the phased antenna arrays 6548, 6550, 6560, and 6562. The first transceiver parts 6508, 6510, 6516, and 6518 within the BBS 6506 can also include circuitry for processing intermediate frequency (IF) or RF signals received via the phased antenna arrays 6548, 6550, 6560, and 6562, and processed by the RFEMs 6502, 6504, and for converting such signals into baseband and digital signals for processing.

The BBS 6506 can further include an LO generator 6514, which can be configured to generate LO signals 6522, 6524, and 6526. The LO signals 6522 and 6524 can be used by the first transceiver parts 6508, 6510, 6516, and 6518 for up-converting a baseband signal (to IF or RF signal) to generate MIMO streams 6528, 6530, 6532 and 6534 for communication to the RFEMs 6502 and 6504, or for down converting IF or RF signals received from the RFEMs 6502 and 6504 into baseband signals.

The second transceiver parts 6540 and 6542 (within the RFEM 6502) and 6552 and 6554 (within the RFEM 6504) can include circuitry for amplifying IF or RF signals received from the BBS 6506, up-converting the amplified signals, replicating the signals, performing phase and/or amplitude adjustment of the signals prior to transmission via the phased antenna arrays 6548, 6550, 6560, and 6562. The second transceiver parts 6540 and 6542 (within the RFEM 6502) and 6552 and 6554 (within the RFEM 6504) can also include circuitry for processing radio frequency signals received via the phased antenna arrays 6548, 6550, 6560, and 6562, phase and/or amplitude adjusting the signals, down-converting the signals into IF signals and communicating the IF signals (or RF signals in instances when IF processing is not performed by the distributed phased array system 6500) to the BBS 6506 for processing. In some aspects, the second transceiver parts 6540 and 6542 (within the RFEM 6502) and 6552 and 6554 (within the RFEM 6504) can include one or more of the circuitry within the receiver block 5910 and the transmitter block 5912 in FIG. 59.

The RFEM 6502 can include an LO generator 6544, which can be configured to generate LO signals used by the second transceiver parts 6540 and 6542 for up-converting or down-converting signals. In some aspects, the LO generator 6544 can include frequency manipulation circuitry such as frequency dividers, adders and multipliers, and can be configured to generate a LO signal using another LO signal generated by the LO generator 6514 and received from the BBS 6506 via the triplexers 6512, 6546, and the single coax cable 6536.

The RFEM 6504 can include an LO generator 6556, which can be configured to generate LO signals used by the second transceiver parts 6552 and 6554 for up-converting or down-converting signals. In some aspects, the LO generator 6556 can include frequency manipulation circuitry such as frequency dividers, adders and multipliers, and can be configured to generate a LO signal using another LO signal generated by the LO generator 6514 and received from the BBS 6506 via the triplexers 6520, 6558, and the single coax cable 6538.

In some aspects, the distributed phased array system 6500 can be configured for MIMO operation with four data streams communicated simultaneously via the triplexers 6512, 6520, 6546, 6558, and the coax cables 6536 and 6538. More specifically, four independent data streams can be generated at baseband frequencies at the BBS 6506. The LO generator 6514 can include a single frequency source within the distributed phased array system 6500, and is configured to generate LO frequencies (e.g., 6522 and 6524) for two distinct up-conversion schemes performed by the first transceiver parts 6508, 6510, 6516, and 6518. For each of the two schemes, one LO frequency is used for up conversion of the baseband stream to a desired IF (or RF) frequency within the BBS 6506.

As seen in FIG. 65, LO signals 6522 and 6524 can be used to generate MIMO streams 6528 and 6530 (for processing by RFEM 6502), as well as MIMO streams 6532 and 6534 (for processing by RFEM 6504). MIMO streams 6528 and 6532 can be generated at a desired frequency f1 (e.g., a desire to transmit frequency). MIMO streams 6530 and 6534 can be generated at a different frequency f2, which can be higher or lower than f1.

The signal frequencies of the LO signals 6522, 6524, and 6526, as well as the frequencies f1 and f2 of the four generated MIMO streams, can all be non-overlapping frequencies. In this regard, any combination of the LO signals and the MIM O streams can be communicated via a single communication medium (e.g., a single coax cable) without mutual signal interference. The third LO signal 6526 can be communicated together with MIMO streams 6528 and 6530 along the coax cable 6536 for processing by the RFEM 6502. More specifically, the first MIMO stream 6528 is already at the desired frequency f1 so no further up-conversion may be required prior to transmission by the phased antenna array 6548. The LO generator 6544 can receive the third LO signal 6526 and can forward that signal to the second transceiver part 6542 for up-conversion or down-conversion of the second MIMO stream 6530 to the desired frequency f1. In some aspects, the LO signal 6526 can be used as received from the BBS 6506, or the LO generator 6544 may perform frequency manipulation to generate a new LO signal, which can be used for the conversion of the second MIMO stream 6530 to the desired frequency f1 prior to transmission by the phased antenna array 6550.

Similarly, the third LO signal 6526 can be communicated together with MIMO streams 6532 and 6534 along the coax cable 6538 for processing by the RFEM 6504. More specifically, the third MIMO stream 6532 is already at the desired frequency f1 so no further up-conversion may be required prior to transmission by the phased antenna array 6560. The LO generator 6556 can receive the third LO signal 6526 and can forward that signal to the second transceiver part 6554 for up-conversion or down-conversion of the fourth MIMO stream 6534 to the desired frequency f1. In some aspects, the LO signal 6526 can be used as received from the BBS 6506, or the LO generator 6556 may perform frequency manipulation to generate a new LO signal, which can be used for the conversion of the fourth MIMO stream 6534 to the desired frequency f1 prior to transmission by the phased antenna array 6562.

Even though FIG. 63 and FIG. 65 disclose the use of a single coax cable to connect the BBS with the RFEM for transmission and reception of multiple data streams, the disclosure is not limited in this regard and other types of connections can be used as well. For example, another type of a millimeter wave connection or cable can be used instead of the single coax cable. Other types of connections that can be used include semi-rigid cables, flexible cables of a flexible substrate, printed RF transmission lines on PCB, rigid flex board, and so forth.

Distributed phased array systems (e.g., WiGig and 5G cellular systems) are currently used in laptops, tablets, smart phones, docking stations and other applications. Current distributed phased array systems used for WiGig and 5G communications are either super-heterodyne (dual conversion) or sliding-IF systems. In these systems, the MAC-PHY baseband sub-system receives or transmits an intermediate frequency (IF) signal, which necessitates the use of IF amplification stages, RF-IF mixers, high selectivity band-pass filters and other circuitry necessary for communicating IF signals between circuits, as well as up-conversion and down-conversion of the IF signals. The additional circuitry four IF signal processing results in a larger front-end module, higher cost for the distributed phased array system, and lower system performance.

Figure 66:
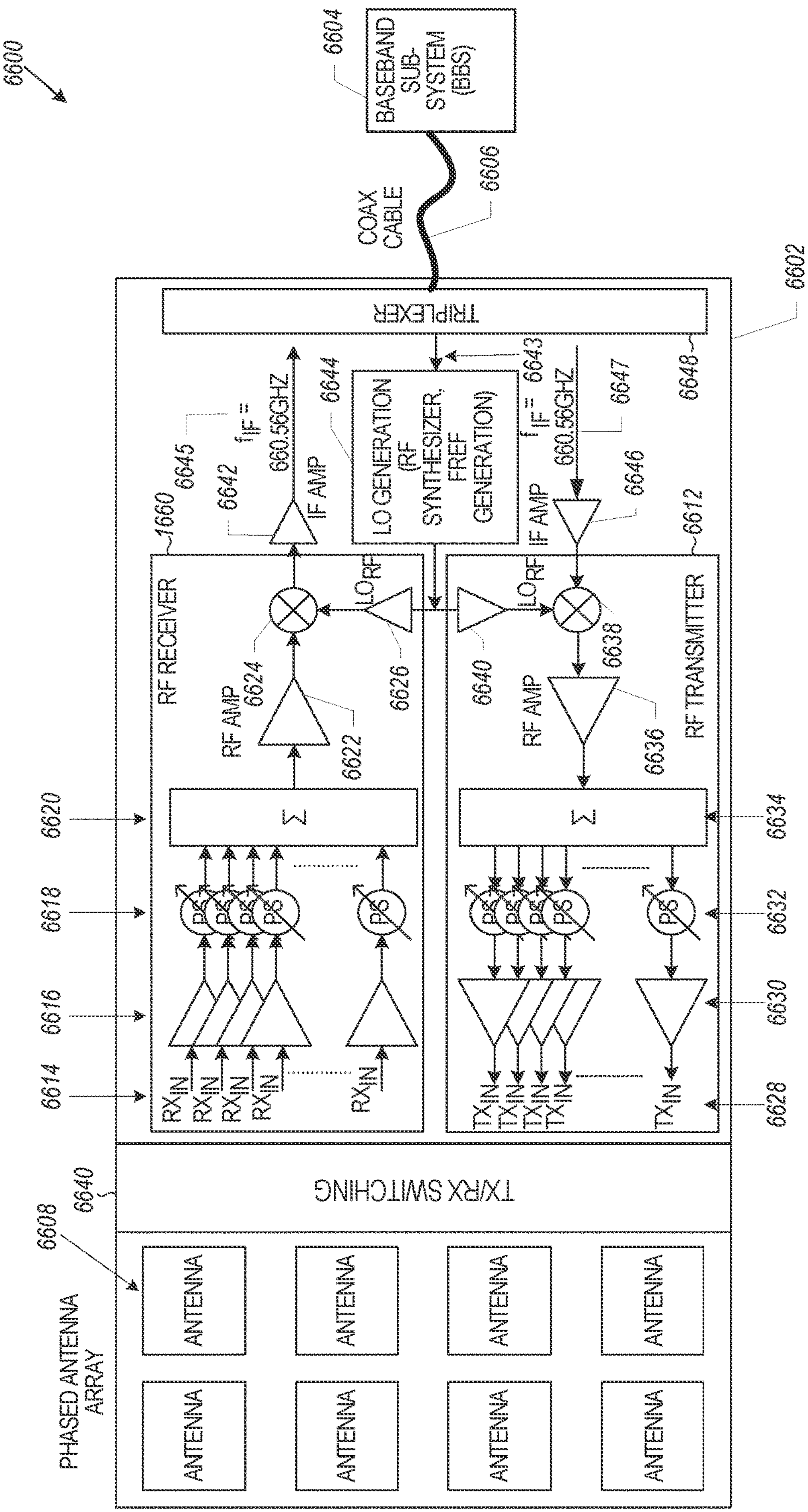
FIG. 66 illustrates an exemplary RF front-end module (RFEM) of a distributed phased array system according to some aspects.

FIG. 66 illustrates an exemplary RF front-end module (RFEM) of a distributed phased array system 6600 according to some aspects. The distributed phased array system 6600 may be incorporated in the digital baseband circuitry 310, the transmit circuitry 315, and the receive circuitry 320 of mmWave communication circuitry 300 shown in FIG. 3A, although the distributed phased array system 6600 is not limited to such.

Referring to FIG. 66, the RFEM 6602 is coupled to a baseband sub-system (BBS) 6604 via a single coax cable 6606. The RFEM 6602 can include a phased antenna array 6608, a RF receiver 6610, a RF transmitter 6612, a local oscillator (LO) generator 6644, a triplexer 6648, and a transmit (TX)/receive (RX) switch 6640. The RF receiver 6610 can include a plurality of power amplifiers 6616, a plurality of phase shifters 6618, and adder 6620, an RF amplifier 6622, an LO amplifier 6626, and a multiplier 6624. The RF receiver 6610 can also include an IF amplifier 6642. In some aspects, the IF amplifier 6642 can be part of the receiver 6610 or it can be implemented outside of the receiver 6610.

The RF transmitter 6612 can include a multiplier 6638, LO amplifier 6640, a RF amplifier 6636, an adder 6634, a plurality of phase shifters 6632, and a plurality of amplifiers 6630. The RF transmitter 6612 can also include an IF amplifier 6646. In some aspects, the IF amplifier 6646 can be part of the transmitter 6612 or it can be implemented outside of the transmitter 6612.

In an example receive operation, the switch 6640 can activate receiver chain processing. The antenna array 6608 can be used for receiving a plurality of signals 6614. The received signals 6614 can be amplified by amplifiers 6616 and their phase can be adjusted by corresponding phase shifters 6618. Each of the phase shifters 6618 can receive a separate phase adjustment signal (not illustrated in FIG. 66) from a control circuitry (e.g., from a modem within the BBS 6604), where the individual phase adjustment signals can be based on desired signal directionality when processing signals received via the phased antenna array 6608. The phase adjusted signals at the output of the phase shifters 6618 can be summed by the adder 6620 and then amplified by the RF amplifier 6622. The LO generator 6644 can generate a LO signal using a clock frequency signal 6643 received from the BBS 6604 via the coax cable 6606. The LO signal can be amplified by the amplifier 6626 and then multiplied with the output of amplifier 6622 using the multiplier 6624 in order to generate an IF input signal 6645. The IF input signal 6645 can be amplified by amplifier 6642 and then communicated to the BBS 6604 via the triplexer 6648 and the coax cable 6606. In some aspects, the IF input signal 6645 can be 10.56 GHz signal.

In an example transmit operation, the switch 6640 can activate transmitter chain processing. The RFEM 6602 can receive an IF signal 6647 from the BBS 6604 via the coax cable 6606 and the triplexer 6648. The IF signal 6647 can be amplified by IF amplifier 6646 and then communicated to multiplier 6638. The multiplier 6638 can receive an up-conversion LO signal from the LO generator 6644 and the LO amplifier 6640. The amplified LO signal is multiplied with the amplified received IF signal by the multiplier 6638 to generate an RF signal. The RF signal is then amplified by amplifier 6636 and communicated to adder 6634. The adder 6634 generates multiple copies of the amplified signal and communicates signal copies to the plurality of phase shifters 6632. The plurality of phase shifters 6632 can apply different phase adjustment signals to generate a plurality of phase adjusted signals, which can be amplified by the plurality of amplifiers 6630. The plurality of amplifiers 6630 generates a plurality of signals 6628 for transmission by the phased antenna array 6608.

Figure 67:
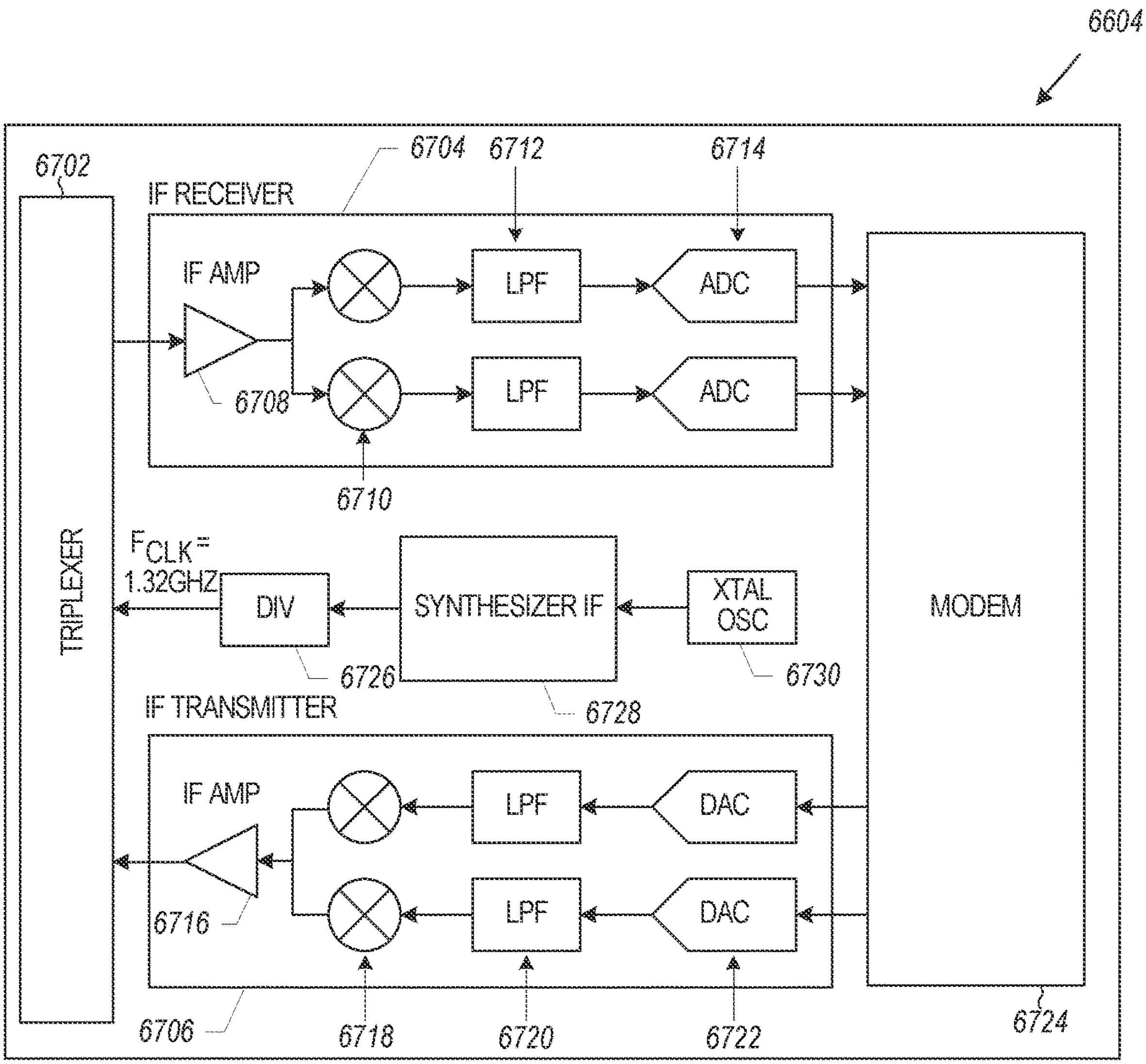
FIG. 67 illustrates an exemplary baseband sub-system (BBS) of a distributed phased array system according to some aspects.

FIG. 67 illustrates a baseband sub-system (BBS) of a distributed phased array system according to some aspects. Referring to FIG. 67, the BBS 6604 can include a triplexer 6702, an IF receiver 6704, an IF transmitter 6706, a modem 6724, a crystal oscillator 6730, a synthesizer 6728, and a divider 6726. The synthesizer 6728 may include suitable circuitry, logic, interfaces and/or code and can use a signal from the crystal oscillator 6730 to generate a clock signal. The generated clock signal can be divided by the divider 6726 to generate an output clock signal for communication to the RFEM 6602. In some aspects, the generated clock signal can have a frequency of 1.32 GHz.

The IF receiver 7004 can include an IF amplifier 6708, mixers 6710, filters 6712, and analog-to-digital conversion (ADC) blocks 6714. The IF transmitter 6706 can include digital-to-analog conversion (DAC) blocks 6722, filters 6720, mixers 6718, and IF amplifier 6716.

In an example receive operation, an IF signal (e.g., 6645) is received from the RFEM 6602 via the triplexer 6702 and is amplified by IF amplifier 6708. The amplified IF signal can be down-converted to baseband signals by the mixers 6710, then filtered by low-pass filters 6712, and converted to a digital signal by the ADC blocks 6714 before being processed by the modem 6724.

In an example transmit operation, a digital signal output by the modem 6724 can be converted to analog signals by the DAC blocks 6722. The analog signals are then filtered by the low-pass filters 6720 and then up-converted to an IF signal by the mixers 6718. The IF signal can be amplified by the IF amplifier 6716, and then communicated to the RFEM 6602 via the triplexer 6702 and the single coax cable 6606.

Figure 68:
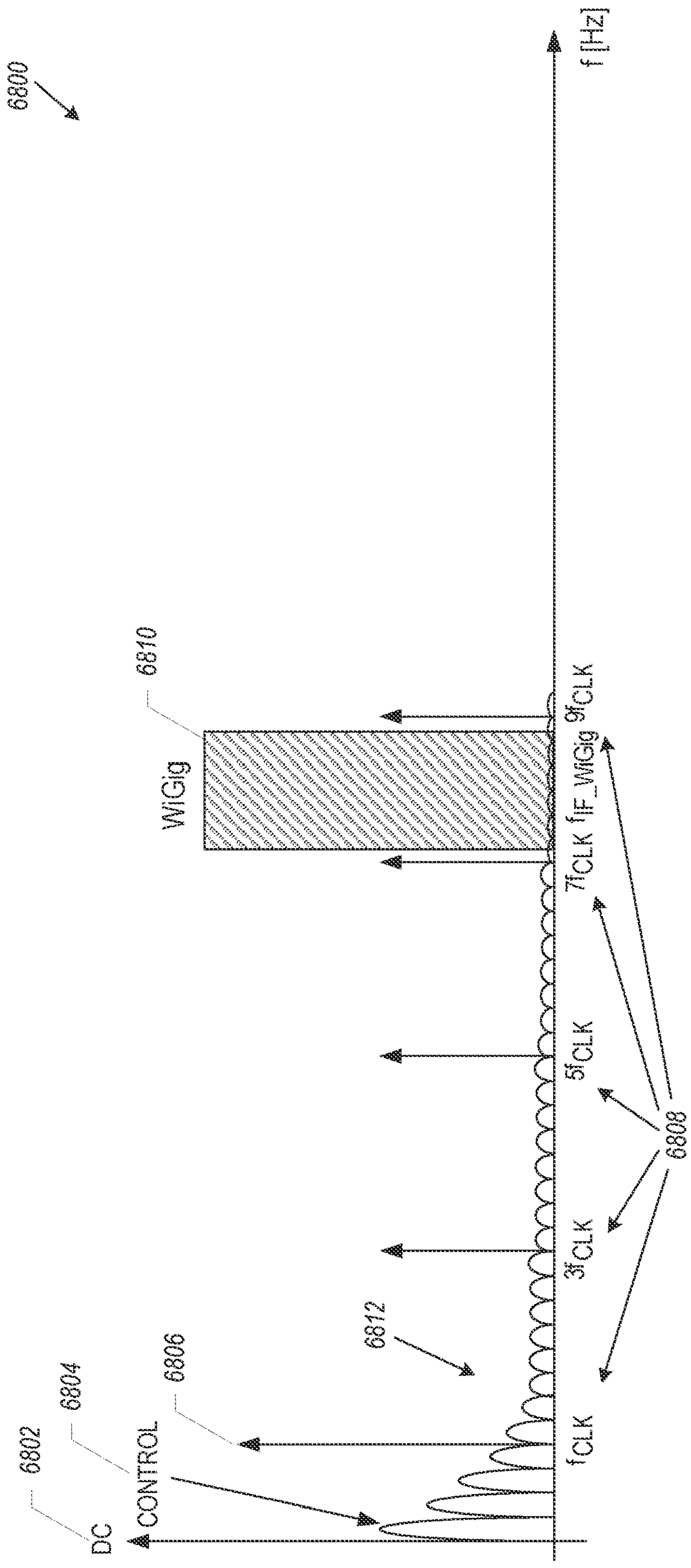
FIG. 68 illustrates an exemplary frequency diagram of signals communicated between a RFEM and a BBS according to some aspects.

FIG. 68 illustrates a frequency diagram of signals communicated between a RFEM and a BBS according to some aspects. Referring to FIG. 68, the frequency diagram 6800 illustrates various signals, which can be communicated between the RFEM 6602 and the BBS 6604 via the single coax cable 6606. For example, the BBS 6604 can communicate a DC power signal 6802, a control signal 6804, and the clock signal 6806. Additionally, data signals 6810 can be communicated between the BBS 6604 and the RFEM 6602. For example, an IF data signal 6645 can be communicated from the RFEM 6602 to the BBS 6604, and an IF data signal 6647 can be communicated from the BBS 6604 to the RFEM 6602. The clock signal 6806 can be the same as the LO generation clock signal 6643 received by the RFEM 6602 from the BBS 6604. In some aspects, the clock signal 6806 can be a 1.32 GHz signal. In some aspects, the control signal 6804 can be communicated from the BBS 6604 to the RFEM 6602 and can indicate phase adjustment values for use by the phase shifters 6618 and the phase shifters 6632. The control signal 6804 can indicate to the RFEM 6602 other control functions, such as power up, power down, increase or decrease transmit power and so forth.

As seen in FIG. 68, the signal spectrum of signals communicated between the RFEM 6602 and the BBS 6604 can include some undesirable signals, such as the clock harmonics 6808 as well as harmonics of the control signal 6804. Additionally, by including IF processing circuitry within the RFEM 6602 and the BBS 6604 other drawbacks within the distributed phased array system 6600 are present, as described herein below.

Signal Frequency Stability Due to Voltage Jumps of RFEM Supply Voltage

The RFEM 6602 includes LO generators (e.g., 6644), which can include frequency synthesizer, frequency multipliers and dividers. The frequency signals generated by these circuits are used for driving the up-conversion mixer 6638 or the down-conversion mixer 6624. However, the LO generator 6644 can be sensitive to supply voltage stability. The RFEM 6602 supply voltage (e.g., 6802) is fed through the coax cable 6606 as well as associated connectors and RF chokes (not illustrated in FIG. 66). Consequently, the supply voltage is affected by the resistance of these components and the current flowing through the coax cable 6606. In this regard, any instantaneous change in the current through the coax 6606 (e.g., RX to TX transitions, changing number of phased array active lanes, digital activity/processing in the RFEM, etc.) would generate an instantaneous change of LO generation circuitry, which would cause an instantaneous frequency change.

RFEM High Power Consumption

The distributed phased array system 6600 uses LO generator 6644 (synthesizer, frequency multiplier, frequency drivers, etc.), up and down conversion mixers (e.g., 6624, 6638), IF amplification stages (e.g., 6642, 6646), and complex triplexers (e.g., 6648). In an aspect of the disclosure, only RF signals can be communicated between the RFEM 6602 and the BBS 6604. In this regard, the IF-related circuitry within the RFEM 6602 can be removed, lowering the power consumption and heat generation of the RFEM 6602.

RFEM Cost

In distributed phased array systems (e.g., 6600), the RFEM cost can be significant (e.g., up to 50% of the entire system cost in some instances). While BBS cost reduction can be achieved by process migration (since much of the BBS-chip processing is digital), such cost reduction can be challenging with the RFEM as mostly analog processing is included in the RFEM. By performing only RF processing and communicating RF signals between the RFEM 6602 and the BBS 6604 via the single coax cable 6606, RFEM implementation cost reduction can be achieved.

RFEM Form Factor (FF)

Since the RFEM 6602 includes an antenna array (108), it is located at the boundary of the communication device to allow good radiations of the phased array antennas. By using only RF processing and removing the IF conversion stage and processing from the RFEM 6602, the RFEM form factor is reduced, which is beneficial for RFEM device placement and implementation.

Co-Running with Other Standards (WiFi, Bluetooth, LTE, etc.)

The IF frequency signals (e.g., 6645 and 6647) communicated over the coax cable 6606 carries the wideband (e.g., WiGig or 5G) signal and is vulnerable to harmonics of other communication systems in the same platform/device. For example, the IF frequency signals (6645) communicated from the RFEM to the BBS or the IF signals (6647) received by the RFEM from the BBS can be 10.56 GHz signals. However, the 10.6 GHz IF signals can be in the same range as one or more harmonics of a Wi-Fi band.

FCC/ETSI Regulation Violation of CLK Signal over the Coax

In a distributed system the signals over the COAX cable (CLK, IF data) leak from the COAX (cable and connectors) and from the PCB interconnections. This leakage would cause FCC/ETSI regulation violation. In order to lower the leakage power we need to use high quality RF shielding, highly isolated COAX and in some cases even lower the level of the signals over the CAOX (this might affect the system performance).

In some aspects, the RFEM 6602 can be configured to process and communicate RF signals via the coax cable 6606 to the BBS 6604 for processing and down-conversion. Similarly, the BBS 6604 can up convert data signals to RF signals and communicate RF signals to the RFEM 6602 via the coax cable 6606. In this regard, by removing IF processing within the RFEM 6602, the above listed drawbacks associated with IF processing within the distributed phased array communication system can be removed.108

Figure 69:
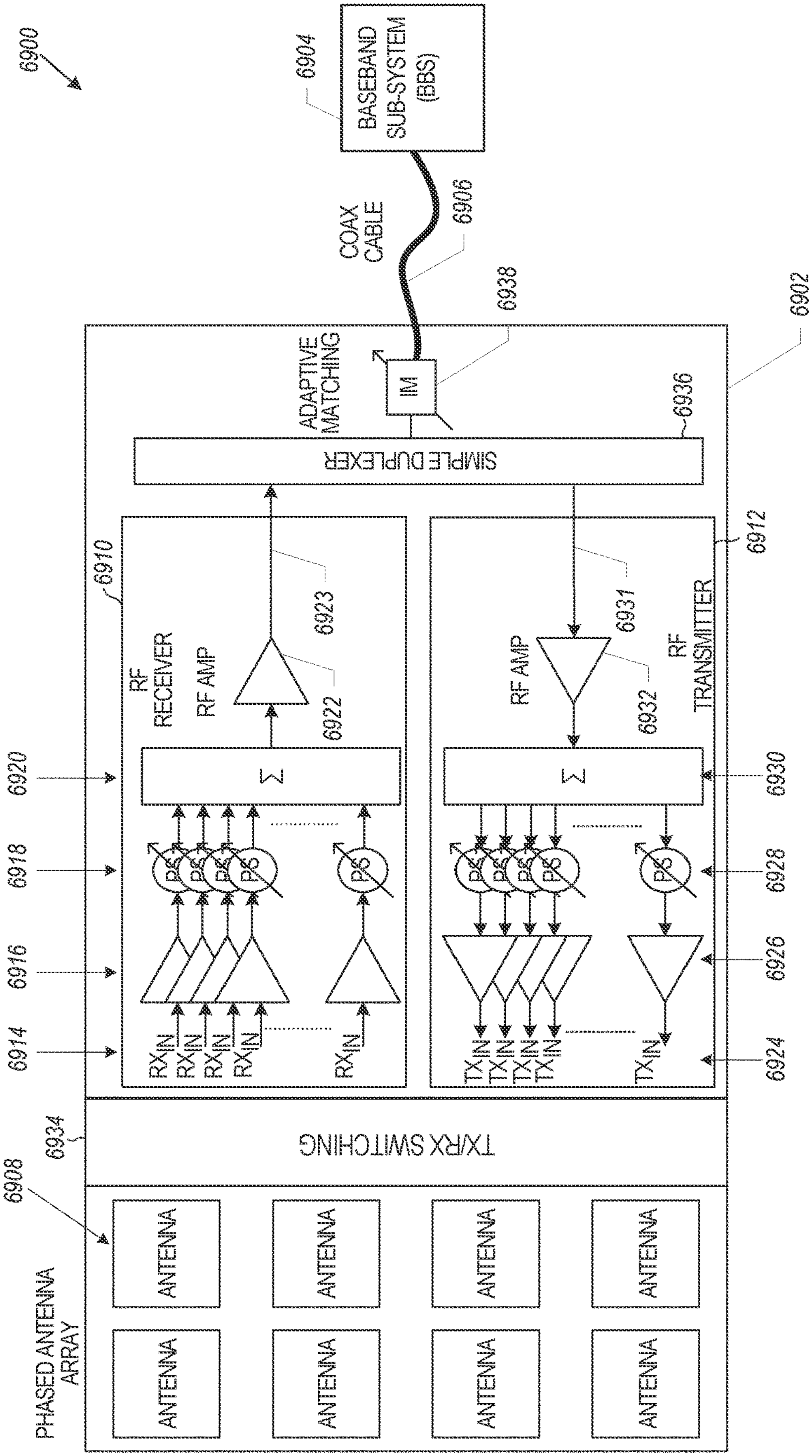
FIG. 69 illustrates an exemplary RFEM coupled to an exemplary BBS via a single coax cable for communicating RF signals according to some aspects.

FIG. 69 illustrates a RFEM coupled to a BBS via a single coax cable for communicating RF signals according to some aspects. Referring to FIG. 69, the distributed phased array communication system 6900 can include RFEM 6902 coupled to a baseband sub-system (BBS) 6904 via a single coax cable 6906. The RFEM 6902 can include a phased antenna array 6908, a RF receiver 6910, a RF transmitter 6912, a duplexer 6936, and a transmit (TX)/receive (RX) switch 6934. The RF receiver 6910 can include a plurality of power amplifiers 6916, a plurality of phase shifters 6918, an adder 6920, and RF amplifier 6922. The RF transmitter 6912 can include a RF amplifier 6932, an adder 6930, a plurality of phase shifters 6928, and a plurality of amplifiers 6926.

In an example receive operation, the switch 6934 can activate receiver chain processing. The phased antenna array 6908 can be used for receiving a plurality of signals 6914. The received signals 6914 can be amplified by amplifiers 6916 and their phase can be adjusted by corresponding phase shifters 6918. Each of the phase shifters 6918 can receive a separate phase adjustment signal (not illustrated in FIG. 69) from a control circuitry (e.g., from a modem within the BBS 6904), where the individual phase adjustment signals can be based on desired signal directionality when processing signals received via the phased antenna array 6908. The phase adjusted signals at the output of the phase shifters 6918 can be summed by the adder 6920 and then amplified by the RF amplifier 6922 to generate an RF input signal 6923. The RF input signal 6923 can be communicated to the BBS 6904 via the duplexer 6936 and the coax cable 6906. In some aspects, the RF input signal 6923 can be a 60 GHz signal or another signal in a millimeter wave band including a 5G communication band.

In an example transmit operation, the switch 6934 can activate transmitter chain processing. The RFEM 6902 can receive a RF output signal 6931 from the BBS 6904 via the coax cable 6906 and the duplexer 6936. The RF signal 6931 can be amplified by RF amplifier 6932 and then communicated to adder 6930. The adder 6930 generates multiple copies of the amplified RF signal and communicates the signal copies to the plurality of phase shifters 6928. The plurality of phase shifters 6928 can apply different phase adjustment signals to generate a plurality of phase adjusted signals, which can be amplified by the plurality of amplifiers 6926. The plurality of amplifiers 6926 generates a plurality of signals 6924 for transmission by the phased antenna array 6908.

Figure 70:
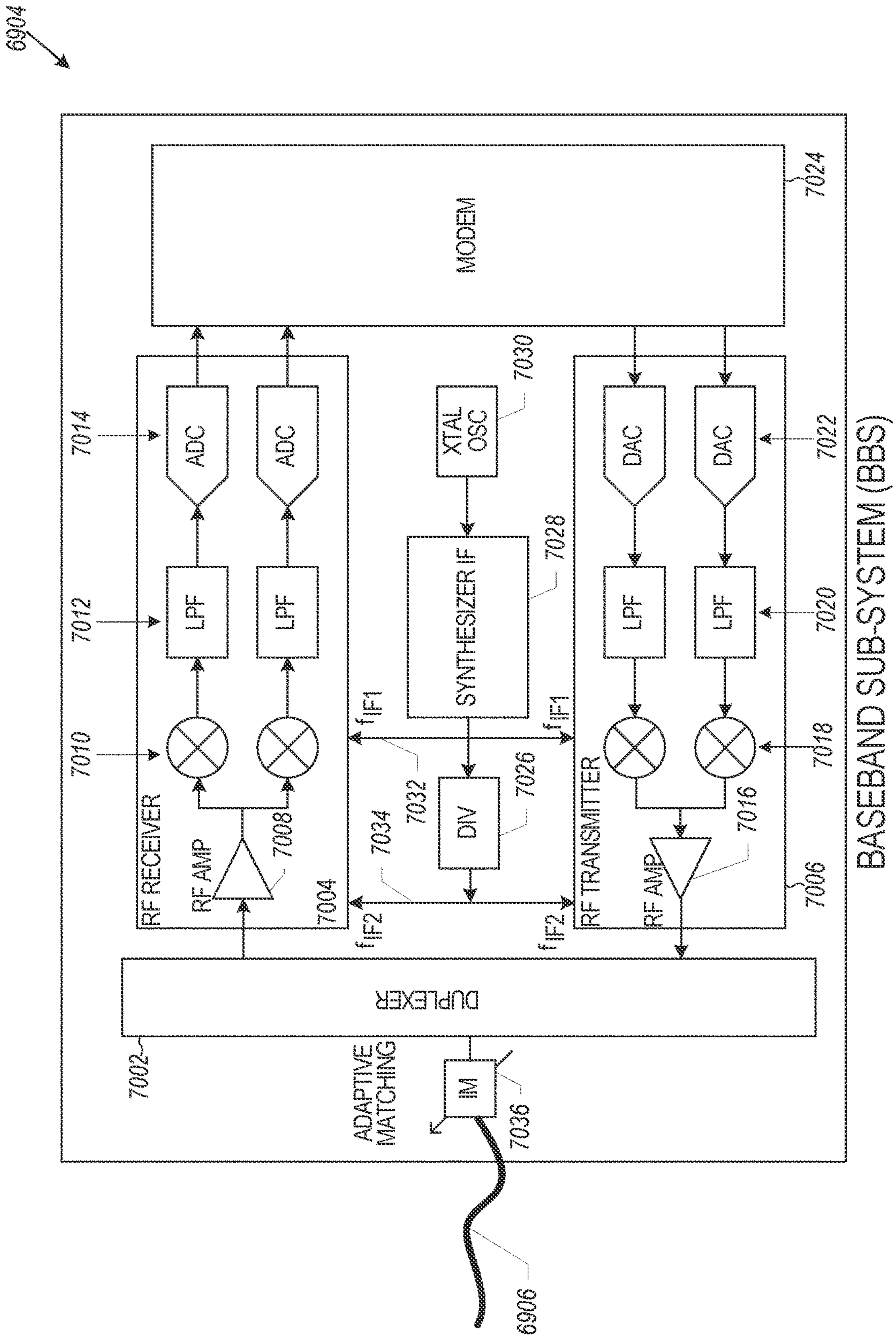
FIG. 70 illustrates a more detailed diagram of the BBS of FIG. 69 according to some aspects.

FIG. 70 illustrates a more detailed diagram of the BBS 6904 of FIG. 69 according to some aspects. Referring to FIG. 69, the BBS 6904 can include a duplexer 7002, a RF receiver 7004, a RF transmitter 7006, a modem 7024, a crystal oscillator 7030, a synthesizer 7028, and a divider 7026. The synthesizer 7028 may include suitable circuitry, logic, interfaces and/or code and can use a signal from the crystal oscillator 7030 to generate a clock signal, such as signal 7032. The generated clock signal 7032 can be used by the RF receiver 7004 to down-convert a received signal using the mixers 7010. The generated clock signal 7032 can also be used by the RF transmitter 7006 to up convert a signal using the mixers 7018. The clock signal 7032 can also be divided by the divider 7026 to generate a second clock signal 7034. The generated second clock signal 7034 can be used by the RF receiver 7004 to down-convert a received signal using the mixers 7010. The generated second clock signal 7034 can also be used by the RF transmitter 7006 to up convert a signal using the mixers 7018. As seen in FIG. 70, two separate clock signals 7034 and 7032 can be generated by the synthesizer 7028 and divider 7026. One or both of the two clock signals 7034 and 7032 can be used for down-conversion of RF signals into baseband using one or more intermediate IF stages or, in some instances, conversion from RF to baseband without an intermediate IF stage conversion. Similarly, one or both of the clock signal's 7034 and 7032 can be used for up conversion of a baseband signal into an RF signal using one or more intermediate IF stages or, in some instances, conversion from baseband to RF without an intermediate IF stage conversion.

The RF receiver 7004 can include an RF amplifier 7008, mixers 7010, filters 7012, and analog-to-digital conversion (ADC) blocks 7014. The RF transmitter 7006 can include digital-to-analog conversion (DAC) blocks 7022, filters 7020, mixers 7018, and RF amplifier 7016.

In an example receive operation, a RF signal (e.g., 6923) is received from the RFEM 6902 via the single coax 6906 and the duplexer 7002, and is amplified by RF amplifier 7008. The amplified RF signal can be down-converted to baseband signals by the mixers 7010, then filtered by low-pass filters 7012, and converted to a digital signal by the ADC blocks 7014 before being processed by the modem 7024.

In an example transmit operation, a digital signal output by the modem 7024 can be converted to analog signals by the DAC blocks 7022. The analog signals are then filtered by the low-pass filters 7020 and then up-converted to a RF signal by the mixers 7018. The RF signal can be amplified by the RF amplifier 7016, and then communicated to the RFEM 6902 via the duplexer 7002 and the single coax cable 6906.

In some aspects, the coax cable 6906 can be used for communication of DC power signals (e.g., from the BBS 6904 to the RFEM 6902), control signals and RF data signals that received or transmitted by the phased antenna array 6908. The control signal can include phase adjustment signals, power up signals, power down signals, and other control signals communicated from the BBS 6904 to the RFEM 6902. In some aspects, control signals can include phase adjustment the request signals or other data request signals communicated from the RFEM 6902 to the BBS 6904. In this regard, a direct conversion scheme can be used in connection with a distributed phased array system, where the RFEM and the BBS are coupled via a single coax cable.

In some aspects, the control signal can be used for controlling the RFEM operation (e.g., controlling output power levels, AGC, ON/OFF, etc.). Additionally, the control link between the RFEM and the BBS can be bi-directional, and can be used for BBS-to-RFEM commands and for RFEM-to-BBS telemetry transfer (e.g., PA power detectors reading, ACK after a control command reception, temperature detector reading, etc.).

In some aspects, different types of coax cables (6906) can be used in connection with a distributed phased array communication system that communicate RF over the coax. For example, high quality coaxial cable, a semi-rigid cable, or a flexible semi-rigid cable can be used as cable 6906, which will allow for high frequency communication of RF signals with reasonable loss.

In another example, a lower cost coax cable can be used as coax 6906, which can result in matching (S11) and high loss (S21) issues with high RF frequency communications. These drawbacks can be improved via system design changes, such as adaptive cable matching improvements, robust RX and TX line-ups, and RX and TX non-linearity distortion cancellation.

Adaptive Cable Matching Improvement

RF signal communication over a cable can be associated with high losses and matching issues. Due to the high frequency of associated with RF cable communication, the variation of the cable matching can be high and unexpected, which affects the power loss between the cable and the load. In an example and in order to overcome these drawbacks, an adaptive impedance matching circuitry (e.g., 6938 and 7036) can be used in the RFEM 6902 and the BBS 6904, as seen in FIGS. 69-5.

Robust RX and TX Line-ups

In some aspects, higher signal loss associated with the coax cable can be addressed by adding additional gain amplification/adjustment stages (not illustrated in the figures) (e.g., before the cable 6906 and the adaptive matching 6938 within the RFEM 6902), which can ensure that a potential high signal loss of a coax cable would not degrade the SNR of the communicated RF signal.

RX and TX Non-Linearity Distortion Cancellation

In some aspects, additional gain stages in the RX and TX line-uϕ may lead to non-linearity distortion. However, these signal distortions can be compensated via digital mechanisms, such as pre-distortion adjustment circuitry in the TX path or post-distortion adjustment circuitry in the RX path (not illustrated in the figures).

Figure 71:
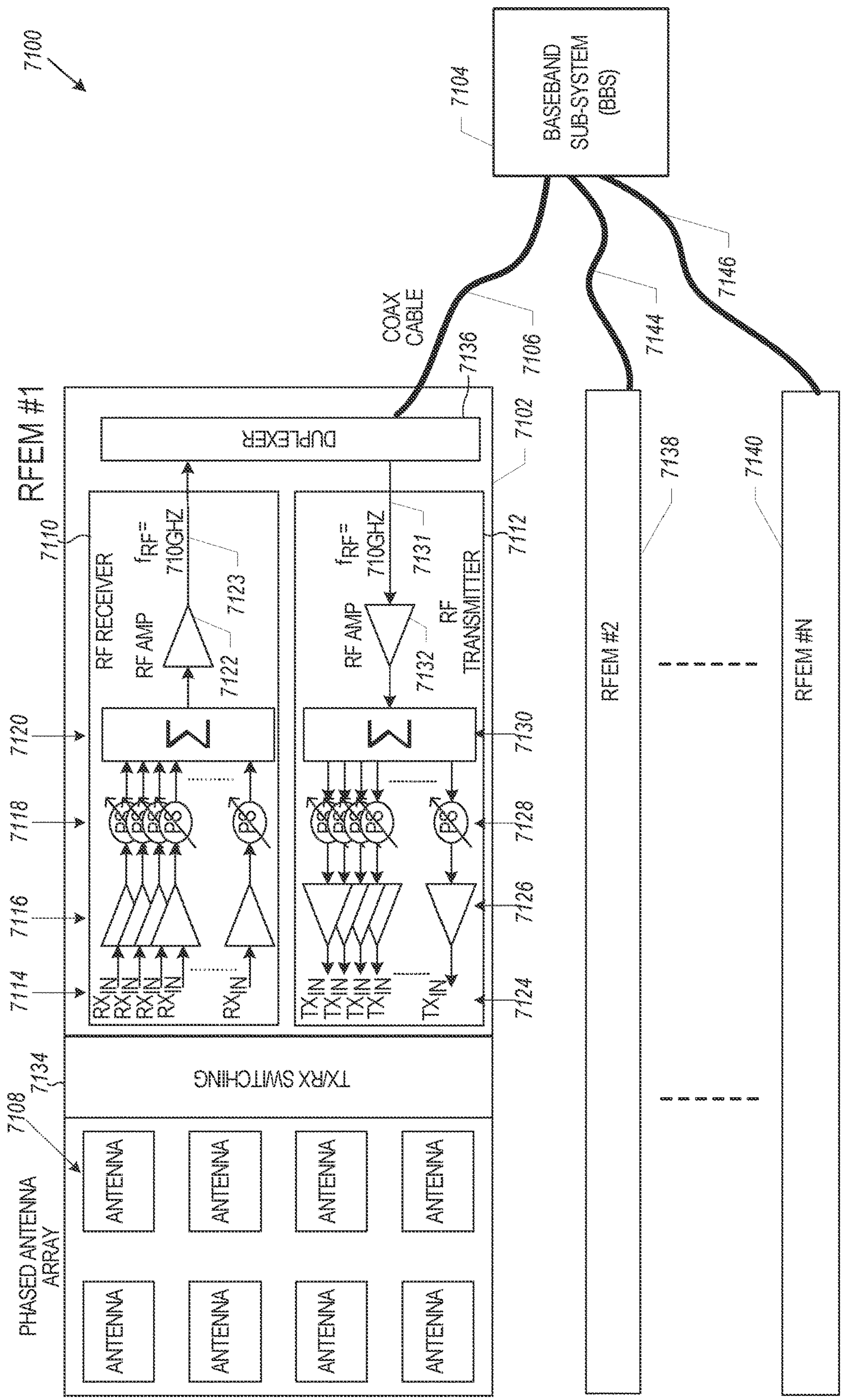
FIG. 71 illustrates an exemplary massive antenna array (MAA) using multiple RFEMs coupled to a single BBS according to some aspects.

FIG. 71 illustrates an exemplary massive antenna array (MAA) using multiple RFEMs coupled to a single BBS according to some aspects. Referring to FIG. 71, the distributed phased array communication system 7100 can be used to implement a massive antenna array. More specifically, multiple RFEMs (7102, 7138, . . . , 7140) can be used with a single BBS (7104), with each RFEM including a phased antenna array. The RFEMs 7102, 7138, . . . , 7140 can be coupled to the BBS 7104 via corresponding single coax cables 7106, 7144, . . . , 7146.

In some aspects, a single LO source (e.g., a millimeter wave synthesizer) can be located within the BBS 7104 and used for TX and RX signals up-conversion and down-conversion, respectively. In this way, common LO signal phase can be ensured (e.g., synchronized phase of the TX or RX signals) in all of the RFEMs used in the MAA 7100. In comparison, an IF-over-coax distributed phased array systems, synthesizers and frequency dividers located in the different RFEMs might have unsynchronized phase each time the RFEM is powered up or the operation frequency is changed. The unsynchronized phase, therefore, can necessitate preforming a new beam-forming procedure, which can be a time-consuming operation that degrades the overall link throughput and quality.

Referring to FIG. 71, the distributed phased array communication system 7100 can include RFEM 7102 coupled to the BBS 7104 via a single coax cable 7106. The RFEM 7102 can include a phased antenna array 7108, a RF receiver 7110, a RF transmitter 7112, a duplexer 7136, and a transmit (TX)/receive (RX) switch 7134. The RF receiver 7110 can include a plurality of power amplifiers 7116, a plurality of phase shifters 7118, an adder 7120, and RF amplifier 7122. The RF transmitter 7112 can include a RF amplifier 7132, an adder 7130, a plurality of phase shifters 7128, and a plurality of amplifiers 7126.

In an example receive operation, the switch 7134 can activate receiver chain processing. The antenna array 7108 can be used for receiving a plurality of signals 7114. The received signals 7114 can be amplified by amplifiers 7116 and their phase can be adjusted by corresponding phase shifters 7118. Each of the phase shifters 7118 can receive a separate phase adjustment signal (not illustrated in FIG. 71) from a control circuitry (e.g., from a modem within the BBS 7104), where the individual phase adjustment signals can be based on desired signal directionality when processing signals received via the phased antenna array 7108. The phase adjusted signals at the output of the phase shifters 7118 can be summed by the adder 7120 and then amplified by the RF amplifier 7122 to generate an RF input signal 7123. The RF input signal 7123 can be communicated to the BBS 7104 via the duplexer 7136 and the coax cable 7106. In some aspects, the RF input signal 7123 can be a 60 GHz signal or another signal in a millimeter wave band including a 5G communication band.

In an example transmit operation, the switch 7134 can activate transmitter chain processing. The RFEM 7102 can receive a RF output signal 7131 from the BBS 7104 via the coax cable 7106 and the duplexer 7136. The RF signal 7131 can be amplified by RF amplifier 7132 and then communicated to adder 7130. The adder 7130 generates multiple copies of the amplified RF signal and communicates the signal copies to the plurality of phase shifters 7128. The plurality of phase shifters 7128 can apply different phase adjustment signals to generate a plurality of phase adjusted signals, which can be amplified by the plurality of amplifiers 7126. The plurality of amplifiers 7126 generates a plurality of signals 7124 for transmission by the phased antenna array 7108. In some aspects, the RFEMs 7138-7140 can be the same as RFEM 7102.

Even though FIG. 71 does not provide details of the BBS 7104, the BBS 7104 can be the same as BBS 6904 and can include the blocks illustrated in FIG. 70. As seen in FIG. 70, a single synthesizer 7028 is used within the BBS 6904. By using a single BBS (e.g., 7104) that includes an LO generator (e.g., synthesizer 7028 which can include a RF synthesizer, an IF synthesizer, etc.) shared between the RFEMs, there is phase correlation between the LO frequencies generated by the LO generator within the single BBS and the outgoing RF signals communicated by the phased antenna arrays of the multiple RFEMs. In this regard, all of the signals transmitted by the phased antenna arrays of RFEMs 7102, 7138, . . . , 7140 will have the same phase.

Even though FIG. 69, FIG. 70, and FIG. 71 discloses the use of a single coax cable to connect the BBS with the RFEM, the disclosure is not limited in this regard and other types of connections can be used as well. For example, another type of a millimeter wave connection or cable can be used instead of the single coax cable. Other types of connections that can be used include semi-rigid cables, flexible cables of a flexible substrate, printed RF transmission lines on PCB, rigid flex board, and so forth. For example and in reference to FIG. 71, a rigid flex board can be used in lieu of coax cable 7106, 7144, and 7146, where the multiple RFEMs can be fed via RF lines that propagate from the main BBS 7104 to the RFEM's in different locations using flexible portion of the connection board (e.g., RF over flex portion of a rigid flex board). In this way, the RFEM can fold over and bend over in different areas in a system based on PC/mobile form factor or in a base station chassis.

Coaxial (coax) cables have been used as transmission lines for transmitting RF signals from the motherboard of a laptop to the hinged lid of the laptop, from whence the signal may be transmitted via the coax to an antenna or a phased antenna array in the laptop lid. The cable would proceed from a transceiver that includes a radio frequency integrated circuit (RFIC) on the motherboard, usually located below the keyboard, through a hole or tube in a hinge to the lid, and then on to an antenna or antenna array within the lid. However, this configuration has suffered from signal loss, especially by cable degradation over time. This signal loss will become exacerbated as frequency of operation increases. In some applications, laptops may have more than one frequency range, for example, Wi-Fi, WiGig, and 5G, at the same time, requiring more than one cable going through the hinge, which is an already dense environment. Consequently a need has arisen to ease the foregoing issues of one or more cables through a hinge, with the power loss occasioned by the cables particularly as frequencies of operation increase significantly.

In some aspects, using one or more waveguides, depending on the number of RF signal frequencies, as a transmission line, is an effective way to pass RF signals from the mother board to the lid through the hinge. In some aspects an optical fiber may be used, which can handle essentially any RF frequency range. In addition an optical fiber can transmit a plurality of frequency ranges at one time. An additional advantage is that optical fiber would suffer less degradation over time compared to coax cable. Using either waveguide or optical fiber as transmission lines will reduce or minimize the foregoing issues. In some aspects the above solutions can also be used to pass RF signals from the mother board of a tablet or a phone to the chassis of the tablet or phone.

In any of the above cases (laptop, tablet, phone), once the RF signal is passed from the RFIC of the dense device, an important second issue to be resolved is how to pass RF signals within the dense lid of the laptop, or the chassis of the tablet or phone. The issue of how to pass RF signals on or within the dense lid or chassis can be addressed, in some aspects, by use of a waveguide implemented in the metallic chassis. In some aspects, the waveguide can be implemented as a standard hollow-tube waveguide, or as a substrate integrated waveguide (SIW) on a PCB. At the same time, there may be loss of signal power by way of the above transmission lines, whether they be coax cable, waveguide or optical fiber.

A Radio Front End Module (RFEM), that includes amplification, can be coupled to the end of the waveguide or optical fiber prior to the one or more antennas to address these losses. The RF signal can then be transmitted to an antenna element or to a phased antenna array that may be within the lid. In some aspects that distribute the signal via a fiber optic line, the RF signal can be converted to an optical signal to enable transmission from the RFIC through the optical fiber line. Conversion from optical signals back to RF signals enables transmission through the RFEM and onto the antenna or antenna array.

Figure 72:
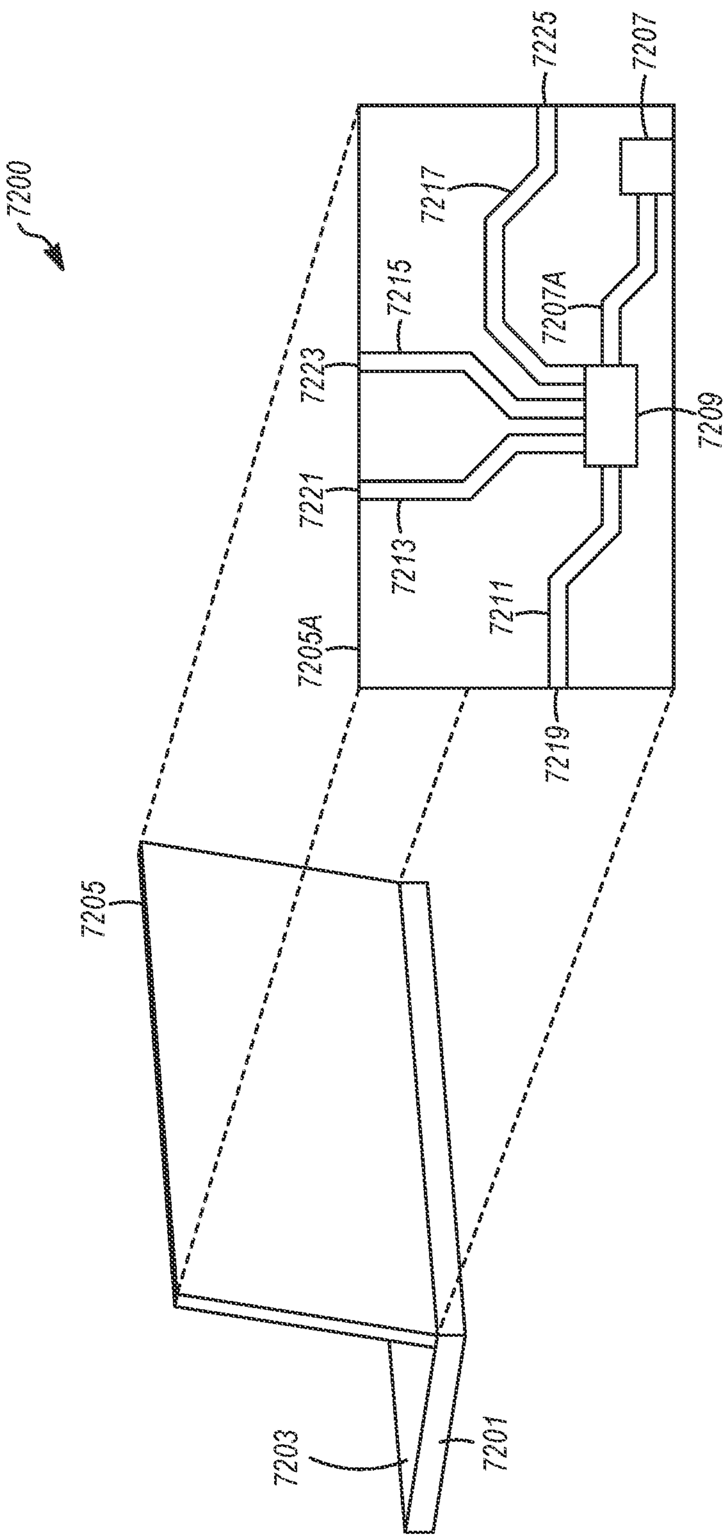
FIG. 72 is an exploded view of a laptop computer illustrating exemplary waveguides for RF signals to reach the lid of the laptop computer, according to some aspects.

FIG. 72 is an exploded view of a laptop computer illustrating waveguides for RF signals to reach the lid of the laptop computer, according to some aspects. The RF signal waveguides may be incorporated in the antenna array circuitry 330 of mmWave communication circuitry 300 shown in FIG. 3A, although the RF signal waveguides are not limited to such. The exploded view 7200 illustrates laptop 7201, with the keyboard illustrated symbolically at 7203 (but not shown) and the lid illustrated symbolically at 7205. The exploded view of the lid 7205A is a schematic of a waveguide transmission line in the laptop lid. An RF signal proceeds from a Medium Access Control (MAC) layer/Baseband (MAC BB) sub-system in an RFIC on the mother board of the laptop. The waveguide proceeds through a hole or tube in hinge 7207, or is made as part of the hinge 7207, where the waveguide 7207A then proceeds inside the lid to a splitter/combiner 7209 to provide RF signals to a plurality of waveguides 7211, 7213, 7215, 7217 to respective antennas or antenna arrays located in the lid outboard from waveguide exits 7219, 7221, 7223, 7225. In practice, there may be only a single frequency band, or there may be multiple frequency bands, generated by the RFIC (e.g., by using one or more LO signals). For example, frequency bands for Wi-Fi, WiGig or 5M mmWave technology may be generated, according to some aspects.

Figure 73:
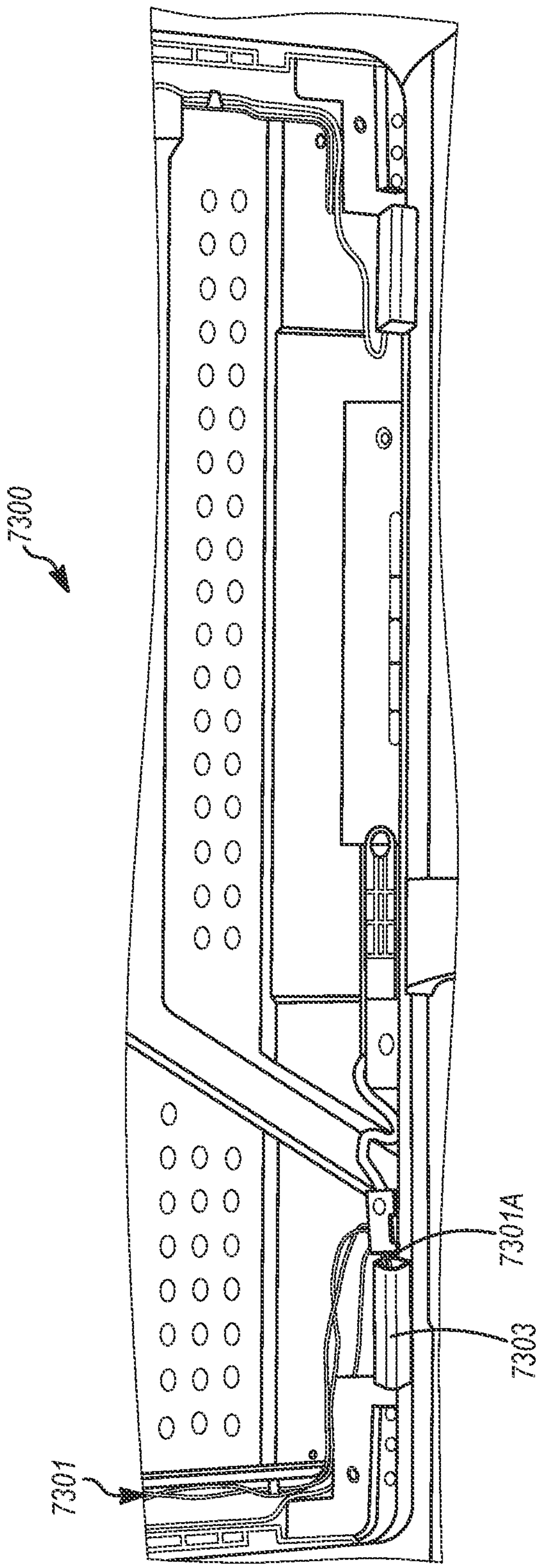
FIG. 73 is an illustration of one or more exemplary coaxial cables proceeding from a radio sub-system of a laptop computer and entering through a hole in a hinge of the laptop, en route to the lid of the laptop, according to some aspects.

FIG. 73 is an illustration of one or more coaxial cables proceeding from an RFIC of a laptop computer and entering through a hole in a hinge of the laptop, en route to the lid of the laptop, according to some aspects. In this illustration the laptop has the lid cover and the keyboard cover is removed. The RFIC can be located on a motherboard outboard from coax cables 7301, in some aspects. Coax cables 7301 proceed from the RFIC to point 7301A where they pass through hinge hole (or tube) 7303 en route to the laptop lid. In the illustration, two cables 7301 are shown for the case where two frequency bands are generated, according to some aspects. In some examples, one coax may be from a Wi-Fi frequency band RFIC, which in some implementations may have up to three coax cables for multiple-input multiple-output (MIMO) antenna mode. A second frequency band in the aspect under discussion may be at WiGig frequencies.

Figure 74:
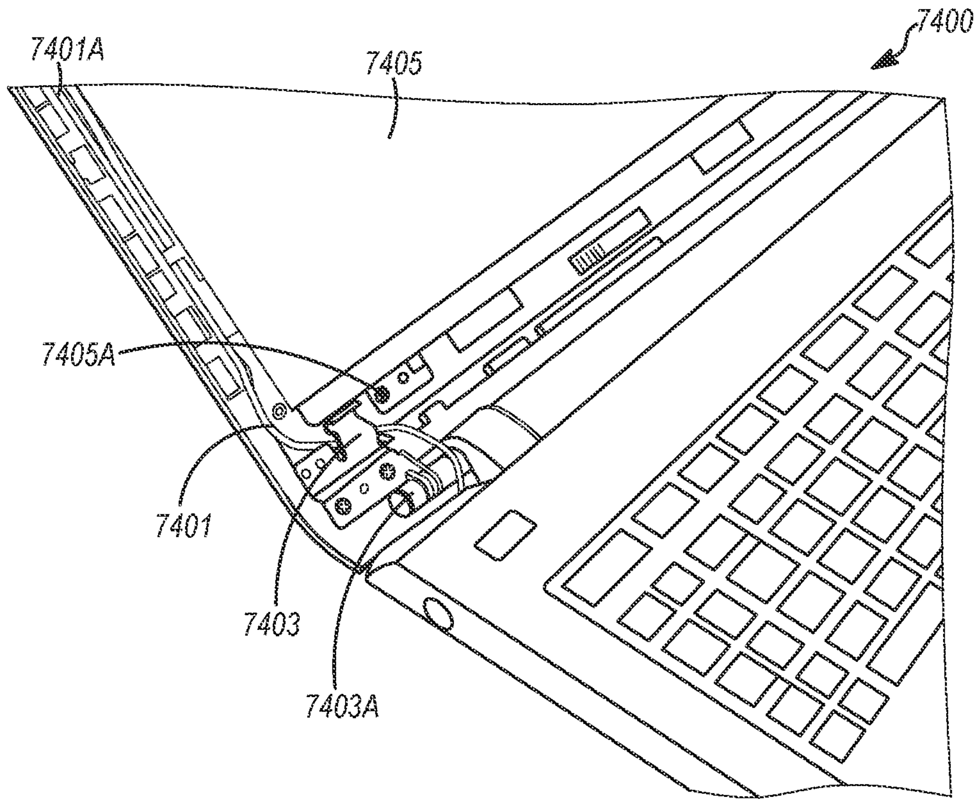
FIG. 74 is an illustration of one or more exemplary coaxial cables from a radio sub-system of a laptop computer, exiting a hole in a hinge of a laptop lid, en route to an antenna or antenna array in the lid, according to some aspects.

FIG. 74 is an illustration of one coaxial cable from a radio sub-system of a laptop computer, exiting a hole in a hinge of a laptop lid, en route to an antenna or antenna array in the lid, according to some aspects. Illustration 7400 shows a laptop lid hinged to the laptop. Coax cable 7401 has proceeded through hole 7403 in hinge 7403A, en route to the antenna or antenna array in the lid of the laptop, which antenna array is outboard of point 7401A, according to some aspects. The back side of the screen is illustrated at 7405, with screw 7405A being at one point at which the back side 7405 may be secured to the chassis of the laptop. The antennas used relate to the frequency band of operation. In the case of Wi-Fi or Long Term Evolution (LTE) the antennas may be passive individual antennas, in some aspects. In the case of WiGig or 5G frequency bands, the coax cables may be coupled to individual RFEM instances which are coupled to one or more antennas in other aspects, as discussed in additional detail below.

Figure 75:
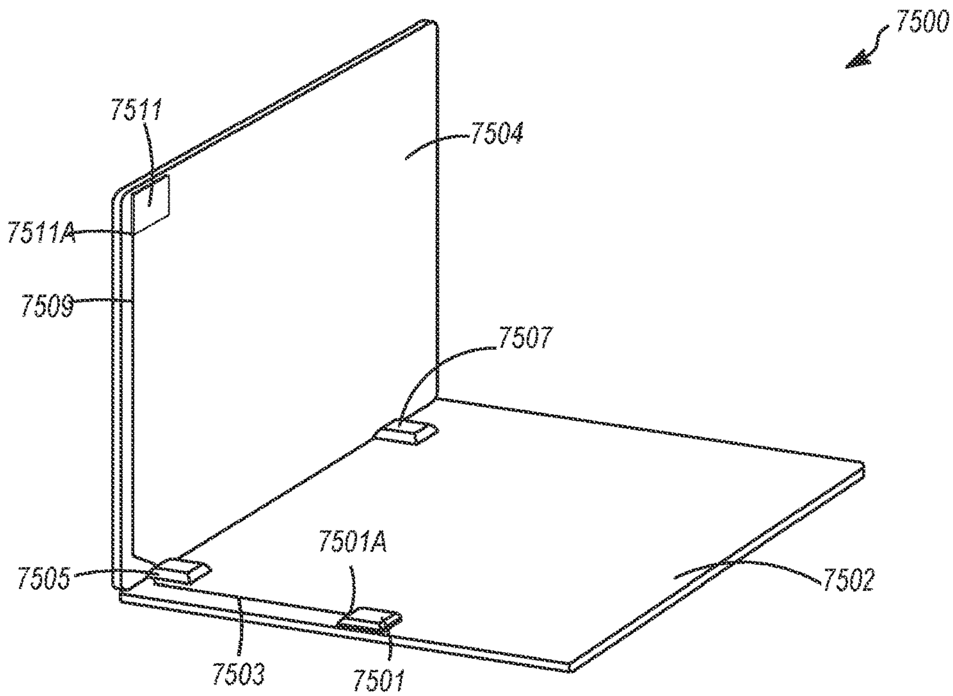
FIG. 75 is a schematic of exemplary transmission lines for signals from a motherboard of a laptop computer to the lid of the laptop, and to a radio front end module (RFEM), according to some aspects.

FIG. 75 is a schematic of transmission lines for signals from a motherboard of a laptop computer to the lid of the laptop, and to a radio front end module (RFEM), according to some aspects. Illustrated at 7500 is a schematic of below-the-keyboard laptop chassis 7502 and lid indicated generally at 7504. The lid 7504 is hinged to chassis 7502 by hinges 7505, 7507. RFIC 7501 is connected to transmission line 7503. Transmission line 7503 may be either a waveguide or optical fiber.

The transmission line 7503 can proceed through hinge 7505, exiting the hinge. In aspects where a waveguide is the transmission line, the waveguide can be part of the hinge. Because the waveguide may be lossy, there will be a certain amount of signal attenuation as the signal proceeds along the waveguide or optical fiber 7509. In cases where the transmission line 7509 is optical fiber, an optical signal to RF signal convertor would be placed at 7511A so that RF signals would be available to RFEM 7511. RFEM 7511 may include a power amplifier, and may be used to amplify the signal to account for the signal attenuation, according to some aspects.

On the RFIC side, if transmission line 7503 is an optical fiber line, then upon exit from RFIC 7501, an RF signal to optical signal converter may be incorporated at 7501A, according to some aspects. A laser may be used for this RF signal to optical signal conversion in some aspects. When the optical signal approaches RFEM 7511A, the optical signal should be converted back to an RF signal at 7310. A PIN diode or an Avalanche PIN diode can be placed at 7511A and used for this optical signal to RF signal conversion in some aspects.

Another implementation for RF signal to optical signal conversion is RF Over Fiber sometimes called Radio over Fiber. Radio over Fiber (RoF) or RF over Fiber (RFoF) refers to a technology whereby light is modulated by a radio frequency signal and transmitted over an optical fiber link. Main technical advantages of using fiber optical links are lower transmission losses and reduced sensitivity to noise and electromagnetic interference compared to all-electrical signal transmission. In some aspects, the optical signal can pass data at essentially all frequencies, including Wi-Fi, LTE, 5G, and WiGig, among others.

In some aspects the conversion from optical signal to RF signal may be implemented by a PIN diode or an Avalanche PIN diode, which may be placed at 7511A of FIG. 75 or at 7610' and 7612 of FIG. 76, as discussed below. If a laser were used for RF signal to optical signal conversion at 7501A of FIG. 75, then the converted output RF signal from the PIN diode or the Avalanche PIN diode at 7511A may be digital bits. Therefore, a very fast optical interface can pass digital bits to an REFM. Consequently, the transceiver of the RFEM can be fed with digital electrical bits and the RFEM will operate to amplify the digital bits for ultimate radiation by the antennas as RF signals.

Alternatively, if RFoF is used for RF signal to optical conversion at 7501A, the RF signal to optical signal conversion results in an optical signal modulated with the RF signal. In this case, the PIN diode or the Avalanche PIN diode conversion at 7511A of FIG. 75 (or at 7610' and 7612 of FIG. 76, as the case may be), can then also generate the original RF signal from the RF modulated optical signal, and can pass the RF signal to the RFEM 7511 for processing.

Figure 76:
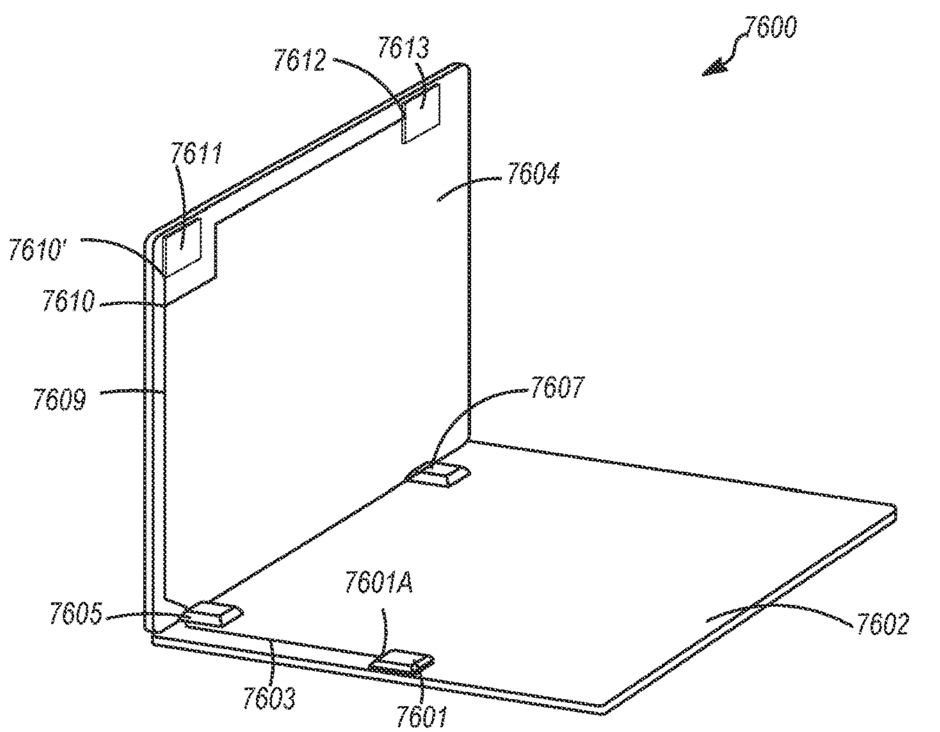
FIG. 76 is a schematic of exemplary transmission lines for signals from a motherboard of a laptop computer to the lid of the laptop, and to a plurality of RFEMs, according to some aspects.

FIG. 76 is a schematic of transmission lines for signals from a motherboard of a laptop computer to the lid of the laptop, and to a plurality of RFEMs 7611 and 7613, according to some aspects. The schematic of FIG. 76 is similar to that of FIG. 75 except that two RFEMs are used. An optical signal to RF signal convertor such as discussed above may be used in two places, 7610' and 7612 where the transmission line is optical fiber, according to some aspects.

If the two RFEMs 7611 and 7613 are working on the same frequency band, but only of them is active at a time, which is relevant both to 5G and to WiGig implementation, there need be only one optical signal to RF signal convertor, which may be placed at 7610', according to some aspects. In this case, the two optical signal to RF signal convertors (at 7610, 7612) would not be needed because of the fact that the two RFEMs 7611, 7613 are working at the same frequency. This is an option that would provide better spatial coverage because the RFEM that provides the better coverage of the two would be active. This may be accomplished by the two RFEMs being algorithmically controlled based on feedback information from a receiving device or system to determine which RFEM provides the better coverage at a given time, according to some aspects.

On the other hand, if the two RFEMs 7611, 7613 are operating in different frequency bands, for example one at 5G and one at WiGig, the two RFEMs would work at the same time. In this case there would be two optical signal to RF signal convertors discussed above, placed at 7610' and 7612 respectively, in some aspects.

Figure 77A:
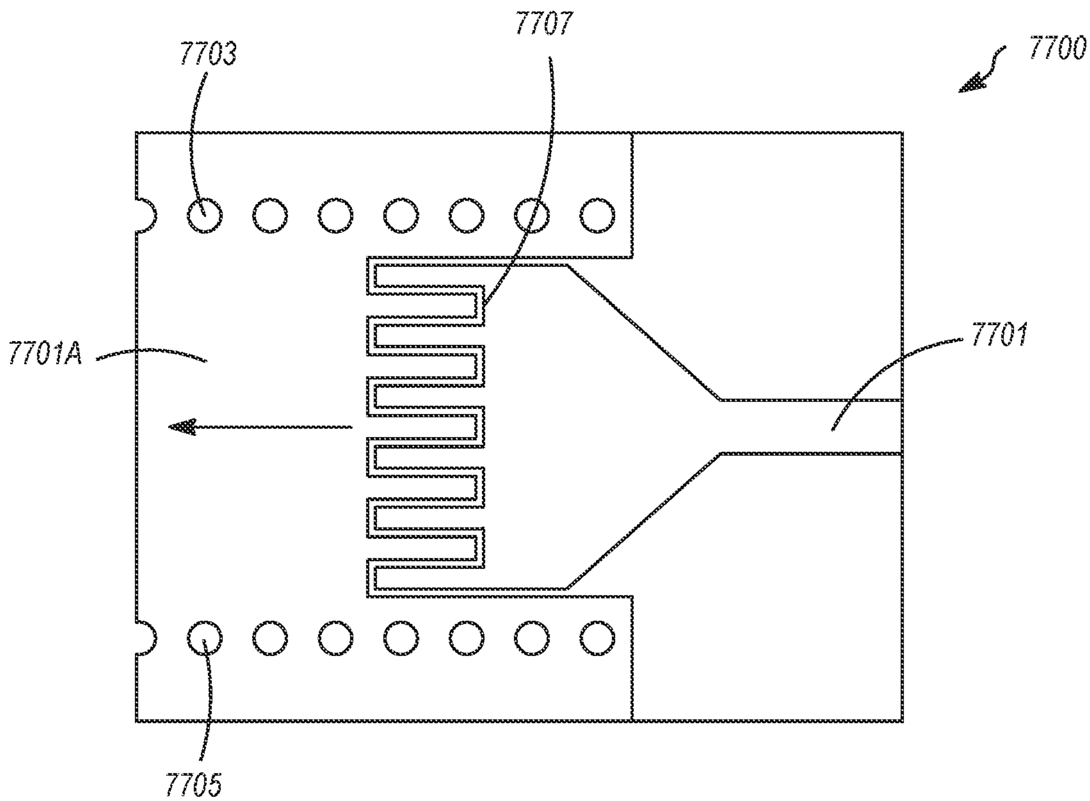
FIGS. 77A and 77B are illustrations of exemplary substrate-integrated waveguides (SIW), according to some aspects.
Figure 77B:
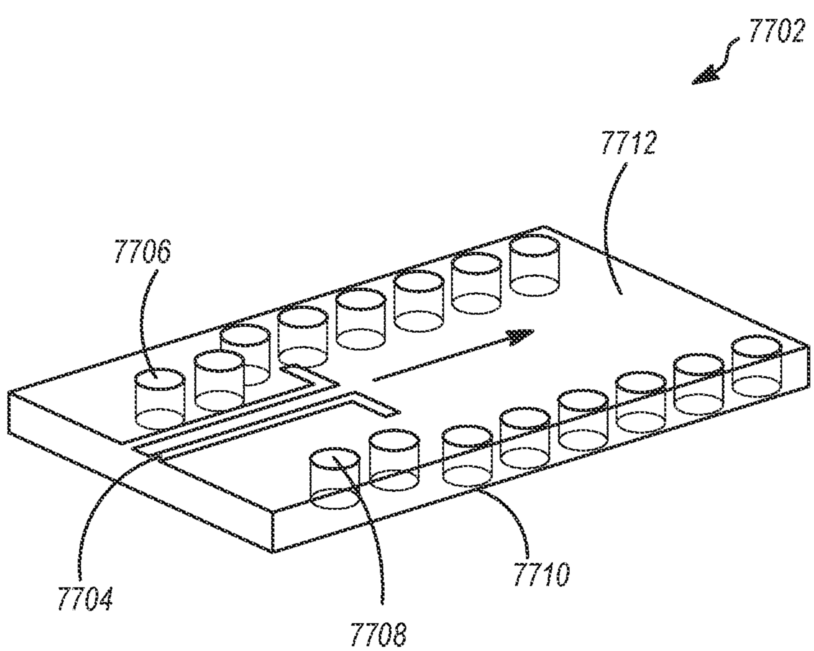

FIGS. 77A and 77B are illustrations of substrate integrated waveguides (SIVV), according to some aspects. In FIG. 77A, 7700 is a perspective view of an SIW with a coplanar transmission line connected to the SIW as an RF signal source, according to some aspects. The SIW itself may be made from a PCB such as FR4 or other suitable PCB. SIW 7700 has top 7701 and bottom 7703 and two lines of vias, one of them beginning with via 7705 and another beginning with via 7707. The lines of vias are dense enough to function effectively as sides of the PCB that guide the RF signal in a desired direction, according to some aspects. Co-planar waveguide 7701A includes a source of RF signals in one aspect, and signal transmission is in the direction of the arrow in the aspect under discussion.

FIG. 77B is an illustration as an SIW with a micro strip feeding the SIW according to some aspects. SIW 7702 has top 7704 and a bottom (not shown) and two lines of vias. One of the lines of vias begins with via 7706 and another begins with via 7708, where the lines of vias are dense enough to function effectively as sides of the PCB that guide the RF signal in a desired direction, according to some aspects. Fingers are implemented at 7708 and a microstrip line 7704 matches the fingers and includes a source of RF signals in some aspects. Signal transmission is in the direction of the arrow in the aspect under discussion. Those of ordinary skill in the art would recognize that the above two figures are examples only, and that other forms of SIWs may be used.

Distributed phased array systems (e.g., WiGig and 5G cellular systems) are currently used in laptops, tablets, smart phones, docking stations and other applications. Current distributed phased array systems used for WiGig and 5G communications are either super-heterodyne (dual conversion) or sliding-IF systems. In these systems, a MAC-PHY baseband sub-system receives or transmits an intermediate frequency (IF) signal, which necessitates the use of IF amplification stages, RF-IF mixers, high selectivity bandpass filters and other circuitry necessary for communicating IF signals between circuits, as well as up-conversion and down-conversion of the IF signals.

Figure 78:
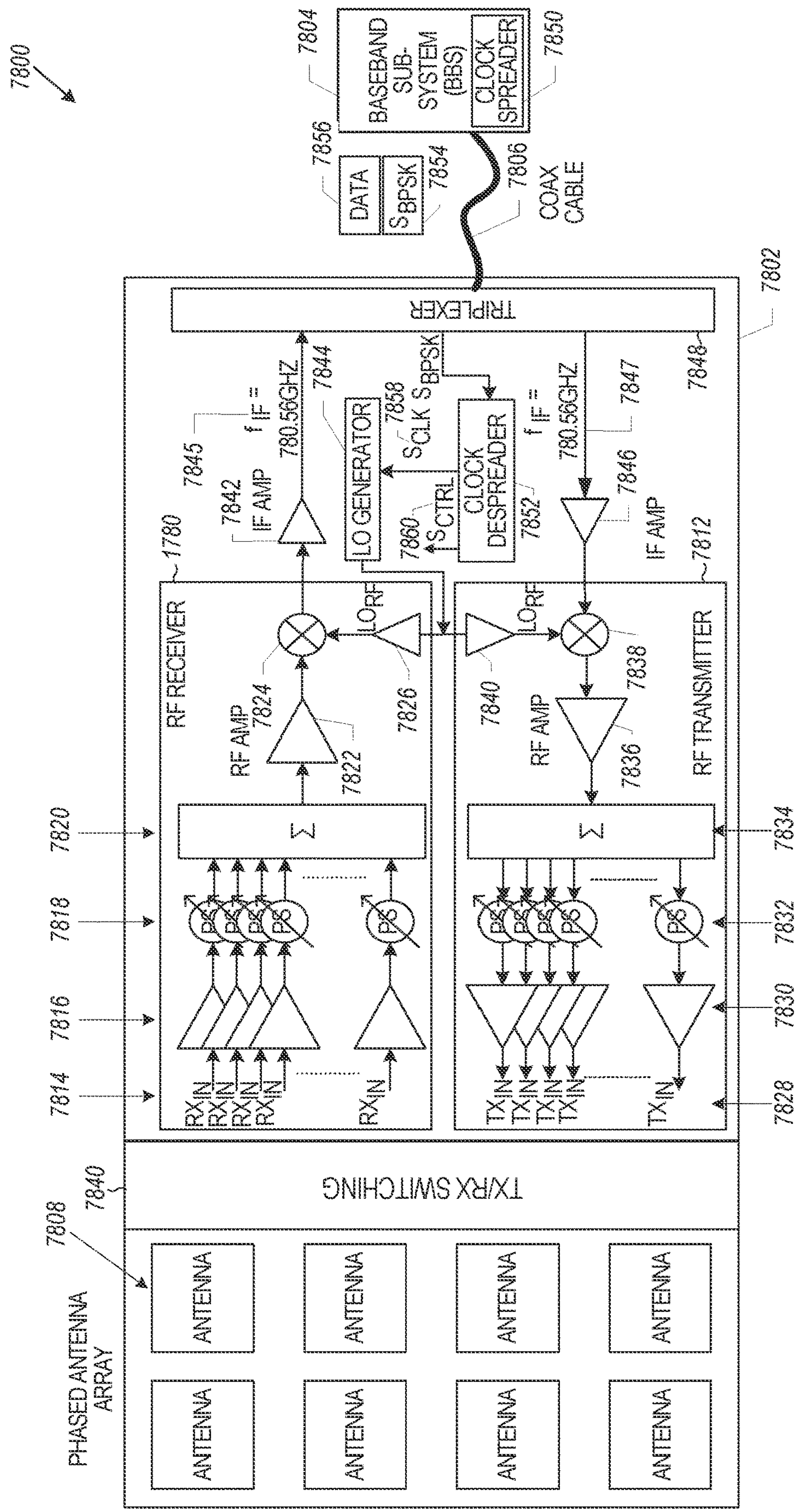
FIG. 78 illustrates an exemplary RF front-end module (RFEM) of a distributed phased array system with clock noise leakage reduction according to some aspects.

Data signals are often times communicated to a front-end module with a direct current (DC) power signal. Some of the data signals can be modulated near baseband and, due to the presence of low-frequency components in the signal, RF choke circuits are used at the front-end circuit to produce a clean DC power signal. The RF choke circuit, however, can be expensive and bulky. Additionally, when clock signals are communicated to the front-end module, clock signal components can leak from the communication medium, which can be a significant noise source in the communication system FIG. 78 illustrates an example RF front-end module (RFEM) of a distributed phased array system 7800 with clock noise leakage reduction according to some aspects. The distributed phased array system 7800 may be incorporated in the digital baseband circuitry 310, the transmit circuitry 315, and the receive circuitry 320 of mmWave communication circuitry 300 shown in FIG. 3A, although the distributed phased array system 7800 is not limited to such.

Referring to FIG. 78, the RFEM 7802 is coupled to a baseband sub-system (BBS) 7804 via a single coax cable 7806. The RFEM 7802 can include a phased antenna array 7808, a RF receiver 7810, a RF transmitter 7812, a local oscillator (LO) generator 7844, a clock despreader 7852, a triplexer 7848, and a transmit (TX)/receive (RX) switch 7840. The RF receiver 7810 can include a plurality of power amplifiers 7816, a plurality of phase shifters 7818, a combiner 7820, an RF amplifier 7822, an LO amplifier 7826, and a multiplier (or mixer) 7824. The RF receiver 7810 can also include an IF amplifier 7842. In some aspects, the IF amplifier 7842 can be part of the receiver 7810 or it can be implemented outside of the receiver 7810.

The RF transmitter 7812 can include a multiplier (or mixer) 7838, LO amplifier 7840, a RF amplifier 7836, a splitter 7834, a plurality of phase shifters 7832, and a plurality of amplifiers 7830. The RF transmitter 7812 can also include an IF amplifier 7846. In some aspects, the IF amplifier 7846 can be part of the transmitter 7812 or it can be implemented outside of the transmitter 7812.

The BBS 7804 can be configured to generate one or more control signals for communication to the RFEM 7802. Example control signals include power ON/OFF signals, transmit (TX) mode activation, receive (RX) mode activation, signal power UP or DOWN, system wake up signal, low-power activation signal, phase or gain adjustment signals, and so forth. Since the control signal is modulated near baseband prior to communication to the RFEM, this can result in a large low-frequency component in the signal. The large low-frequency component, in turn, results in large RF choke component at the RFEM to produce a clean DC power signal (which is communicated together with the control signal). Even though the figures illustrate control signals communicated from the BBS to the RFEM, the disclosure is not limited in this regard, and control signals may be communicated from the RFEM to the BBS. For example, the RFEM can send to the BBS control signals, such as power reading signals, temperature reading signals, command acknowledgement signals, and so forth.

In some aspects, reference clock signal leaks from the coax cable 7806 connecting the BBS 7804 and the RFEM 7802 can be reduced by modulating (e.g., using the clock spreader 7850) a control signal using the clock signal, and then communicating the modulated signal (from the BBS to the RFEM) in place of the clock signal. The RFEM can include a clock despreader 7852, which can be used to recover the control signal and the clock signal. By communicating a modulated signal (in lieu of a separate control signal and a clock signal) the RF choke component requirements can be improved (e.g., a smaller inductor or ferrite bead is used in the RF choke) since the resulting modulated signal is further away from DC and does not include as many low-frequency components as the baseband-modulated control signal.

In an example receive operation, the switch 7840 can activate receiver chain processing. The antenna array 7808 can be used for receiving a plurality of signals 7814. The received signals 7814 can be amplified by amplifiers 7816 and their phase can be adjusted by corresponding phase shifters 7818. Each of the phase shifters 7818 can receive a separate phase adjustment signal (not illustrated in FIG. 78) in the form of a control signal (e.g., control signal 7860 generated by the clock despreader 7852 when dispreading the received modulated signal 7854) originating from a control circuitry (e.g., from a modem within the BBS 7804).

The individual phase adjustment signals can be based on desired signal directionality when processing signals received via the phased antenna array 7808. The phase adjusted signals at the output of the phase shifters 7818 can be combined by combiner 7820 and then amplified by the RF amplifier 7822. The LO generator 7844 can generate an LO signal using a clock reference signal 7858 generated by the clock despreader 7852 using the modulated signal 7854 received from the BBS 7804 via the coax cable 7806. The LO signal can be amplified by the amplifier 7826 and then multiplied with the output of amplifier 7822 using the multiplier 7824 in order to generate an IF input signal 7845. The IF input signal 7845 can be amplified by amplifier 7842 and then communicated to the BBS 7804 via the triplexer 7848 and the coax cable 7806 as a data signal 7856. In some aspects, the IF input signal 7845 can be centered around 10.56 GHz signal.

In an example transmit operation, the switch 7840 can activate transmitter chain processing. The BBS 7804 can modulate the control signal 7860 on the clock reference signal 7858 using the clock spreader 7850, to generate the modulated signal 7854. The modulated signal 7854 and an IF data signal 7856 can be communicated to the RFEM 7802 via the coax cable 7806. The data signal 7856 can include an IF signal 7847 for transmission. The RFEM 7802 can receive the IF signal 7847 via the coax cable 7806 and the triplexer 7848. The IF signal 7847 can be amplified by the IF amplifier 7846 and then communicated to multiplier 7838. The multiplier 7838 can receive an up-conversion LO signal from the LO generator 7844 and the LO amplifier 7840. The amplified LO signal is multiplied with the amplified received IF signal by the multiplier 7838 to generate an RF signal. The RF signal is then amplified by amplifier 7836 and communicated to splitter 7834. The splitter 7834 generates multiple copies of the amplified signal and communicates signal copies to the plurality of phase shifters 7832. The plurality of phase shifters 7832 can apply different phase adjustment signals to generate a plurality of phase adjusted signals, which can be amplified by the plurality of amplifiers 7830. The plurality of amplifiers 7830 generate a plurality of signals 7828 for transmission by the phased antenna array 7808.

In some aspects, triplexers illustrated in the attached figures can also include a transmit/receive switch, which can be used to determine the signals to be multiplexed by the triplexers.

Figure 79:
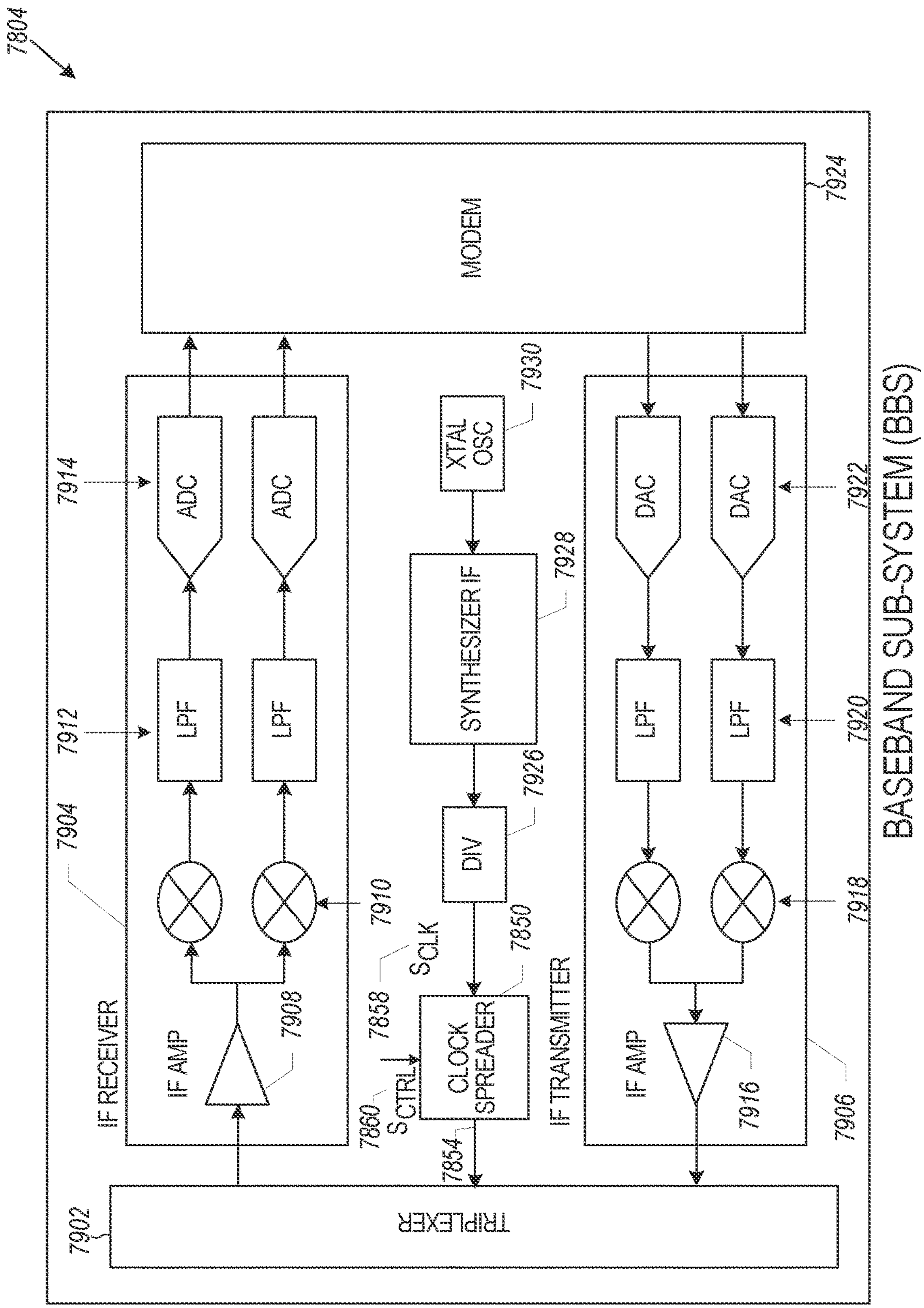
FIG. 79 illustrates an exemplary baseband sub-system (BBS) of a distributed phased array system with clock noise leakage reduction according to some aspects.

FIG. 79 illustrates a baseband sub-system (BBS) of a distributed phased array system with clock noise leakage reduction according to some aspects. Referring to FIG. 79, the BBS 7804 can include a triplexer 7902, an IF receiver 7904, an IF transmitter 7906, a modem 7924, a crystal oscillator 7930, a synthesizer 7928, a divider 7926, and a clock spreader 7850. The synthesizer 7928 may include suitable circuitry, logic, interfaces and/or code and can use a signal from the crystal oscillator 7930 to generate a clock signal. The generated clock signal can be divided by the divider 7926 to generate an output clock reference signal 7858. The output clock reference signal 7858 can be communicated to the clock spreader 7850 together with a control signal 7860. The control signal 7860 can be generated by the modem 7924 and can be used to control one or more functionality of the communication system 7800, such as functionalities of the RFEM 7802.

Example functionalities that can be controlled using the control signal 7860 include activation of the transmission mode, activation of a reception mode, power up, power down, activate low power mode, circuit wake up, beam change signals, phase and/or gain adjustment, and so forth. The clock spreader 7850 may include suitable circuitry, logic, interfaces and/or code and can be configured to modulate the control signal 7860 on the clock reference signal 7858 to generate the modulated signal 7854 for transmission to the RFEM 7802 via the coax cable 7806. In some aspects, the generated clock signal can be centered around a frequency of 1.32 GHz.

The IF receiver 8204 can include an IF amplifier 7908, mixers 7910, filters 7912, and analog-to-digital conversion (ADC) blocks 7914. The IF transmitter 7906 can include digital-to-analog conversion (DAC) blocks 7922, filters 7920, mixers 7918, and IF amplifier 7916.

In an example receive operation, an IF signal (e.g., 7845 received as data signal 7856) is received from the RFEM 7802 via the triplexer 7902 and is amplified by IF amplifier 7908. The amplified IF signal can be down-converted to baseband signals by the mixers 7910, then filtered by low-pass filters 7912, and converted to a digital signal by the ADC blocks 7914 before being processed by the modem 7924.

In an example transmit operation, a digital signal output by the modem 7924 can be converted to analog signals by the DAC blocks 7922. The analog signals are then filtered by the low-pass filters 7920 and then up-converted to an IF signal by the mixers 7918. The IF signal can be amplified by the IF amplifier 7916, and then communicated to the RFEM 7802 via the triplexer 7848 and the single coax cable 7806 as a data signal 7856, together with the modulated signal 7854. In some aspects, the BBS 7804 can also communicate a DC power signal together with the data signal 7856 and the modulated signal 7854 to the RFEM 7802.

Figure 80:
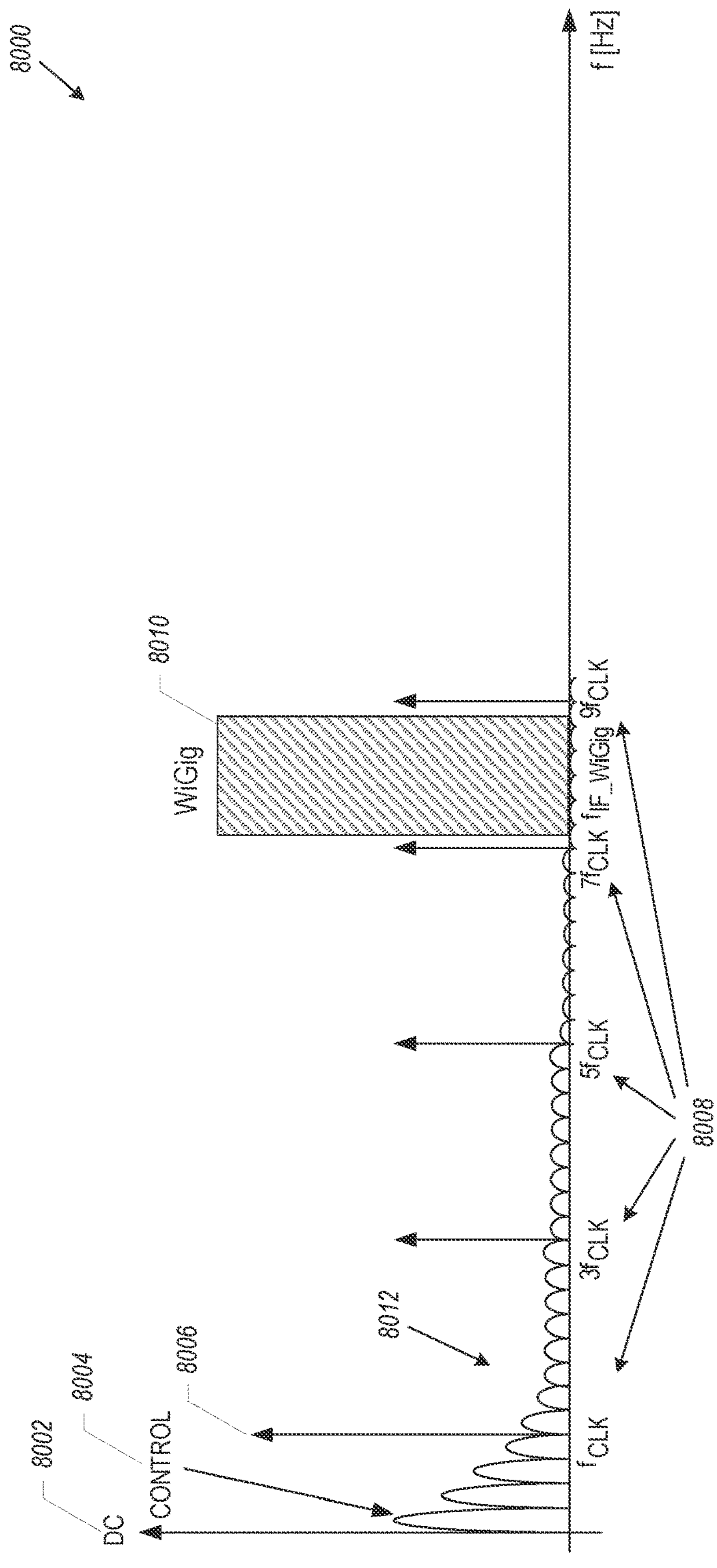
FIG. 80 illustrates an exemplary frequency diagram of signals communicated between an RFEM and a BBS according to some aspects.

FIG. 80 illustrates a frequency diagram of signals communicated between a RFEM and a BBS according to some aspects. Referring to FIG. 80, the frequency diagram 8000 illustrates various signals, which can be communicated between the RFEM 7802 and the BBS 7804 via the single coax cable 7806. For example, the BBS 7804 can communicate a DC power signal 8002, a control signal 8004, and the clock signal 8006. Additionally, data signals 8010 can be communicated between the BBS 7804 and the RFEM 7802.

For example, an IF data signal 7845 can be communicated from the RFEM 7802 to the BBS 7804, and an IF data signal 7847 can be communicated from the BBS 7804 to the RFEM 7802. The clock signal 8006 can be the same as the LO generation clock reference signal 7858 received by the RFEM 7802 from the BBS 7804. In some aspects, the clock signal 8006 can be centered around a 1.32 GHz signal. In some aspects, the control signal 8004 can be communicated from the BBS 7804 to the RFEM 7802 and can indicate phase adjustment values for use by the phase shifters 7818 and the phase shifters 7832. The control signal 8004 can indicate to the RFEM 7802 other control functions, such as power up, power down, increase or decrease transmit power, gain adjustment and other functionalities as mentioned herein above.

As seen in FIG. 80, the signal spectrum of signals communicated between the RFEM 7802 and the BBS 7804 can include some undesirable signals, such as the clock harmonics 8008 as well as harmonics of the control signal 8004. Since the control signal 8004 is modulated near baseband prior to communication to the RFEM, this can result in a large low-frequency component in the signal. The large low-frequency component, in turn, results in large RF choke component at the RFEM to produce a clean DC power signal 8002 (which is communicated together with the control signal). Additionally, the reference clock signal 8006 (as well as associated harmonics 8008) can leak from the coax cable connection 7806, and can be a noise source in the platform. In some aspects, a clock spreader circuit 7850 and a clock despreader circuit 7852 can be used at the BBS 7804 and the RFEM 7802 respectively, to address the above-mentioned drawbacks associated with communication of separate control and clock signals on the coax cable 7806.

Figure 81:
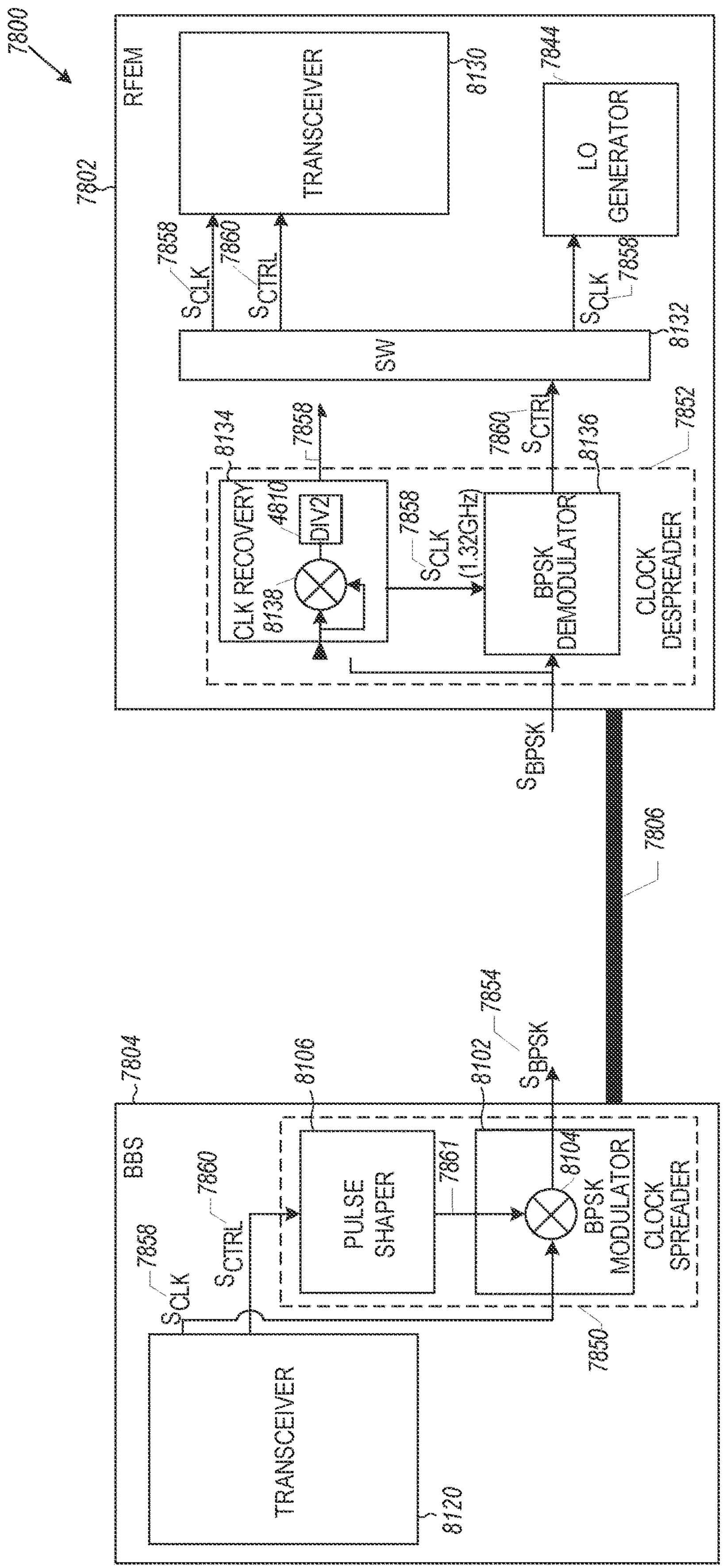
FIG. 81 illustrates clock spreader and despreader circuits, which can be used in connection with clock noise leakage reduction according to some aspects.

FIG. 81 illustrates clock spreader and despreader circuits, which can be used in connection with clock noise leakage reduction according to some aspects. Referring to FIG. 81, there is illustrated another view of the communication system 7800 that includes the BBS 7804 and the RFEM 7802. More specifically, FIG. 81 illustrates a more detailed view of the clock spreader 7850 and the clock despreader 7852.

As seen in FIG. 81, the BBS 7804 can include transceiver 8120 and clock spreader 7850. The transceiver 8120 can include all the blocks illustrated in FIG. 79 except the clock spreader 7850. Similarly, the RFEM 7802 can include the clock despreader 7852, the LO generator 7844, a switch 8132, and transceiver 8130. The transceiver 8130 can include, for example, the receiver 7810, the transmitter 7812, the amplifiers 7842 and 7846, and the triplexer 7848 illustrated in FIG. 78.

The clock spreader 7850 can include a pulse shaper circuit 8106 and a modulator circuit 8102. The pulse shaper circuit 8106 can be configured to receive the control signal 7860 and generate a band-limited control signal 7861. In some aspects, the pulse shaper 8106 can attenuate one or more of the harmonics associated with control signal 7860 to generate the band-limited control signal 7861. The modulator 8102 can include a multiplier 8104, which can be used to receive the band-limited control signal 7861 as well as the clock reference signal 7858, and to multiply them to generate the modulated signal 7854.

In some aspects, the modulator 8102 can be one of a binary phase-shift keying (BPSK) modulator, a differential phase-shift keying (DPSK) modulator, a quadrature phase-shift keying (QPSK) modulator, a Gaussian frequency shift keying (GFSK) modulator, or another type of modulator. In some aspects, the modulator 8102 can be configured to spread the clock reference signal 7858 using a pseudorandom sequence to generate the modulated signal 7854.

The modulated signal 7854 can be communicated (e.g., together with a DC power signal and an IF data signal) to the RFEM 7802 via the coax cable connection 7806. The clock despreader 7852 within the RFEM 7802 can include a clock recovery circuit 8134 and a demodulator 8136. The modulated signal 7854 can be communicated to both the clock recovery circuit 8134 and the demodulator 8136. The clock recovery circuit 8134 can include a multiplier 8138 and a divider 8140. The clock recovery circuit 8134 can use the modulated signal 7854 to recover the clock reference signal 7858. The recovered clock reference signal can be communicated to the switch 8132 as well as to the demodulator 8136. The demodulator 8136 can receive the modulated signal 7854 and use the clock reference signal 7858 to demodulate and recover the control signal 7860. The control signal 7860 can be communicated to the switch 8132. The switch 8132 can be configured to communicate the control signal 7860 and the reference clock signal 7858 to the transceiver 8130, as well as to communicate the clock signal 7858 to the LO generator 7844 for generating up-conversion or down-conversion LO reference signals.

Figure 82:
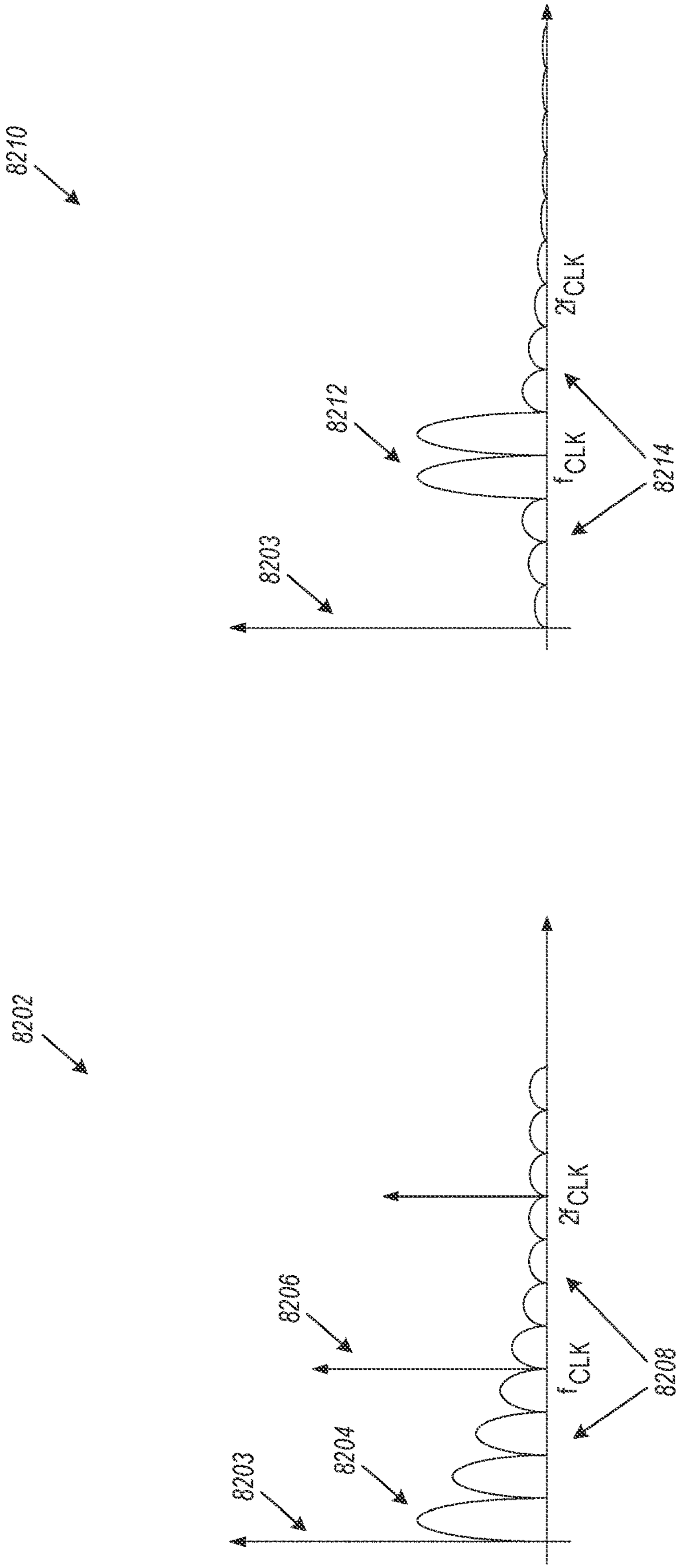

FIG. 82 illustrates a frequency diagram of signals communicated between a RFEM and a BBS using clock noise leakage reduction according to some aspects. Referring to FIG. 82, there are illustrated frequency diagrams 8202 and 8210 illustrating communicated signals when clock noise leakage reduction is deactivated or activated. More specifically, diagram 8202 (which is similar to the signal diagram 8000 of FIG. 80) illustrates signals that can be communicated within communication system 7800 when clock noise leakage reduction is not active. As seen in diagram 8202, a DC power signal 8203, a control signal 8204, a clock signal 8206, as well as harmonics 8208 of the control signal 8204 can be communicated from the BBS to the RFEM when clock noise leakage reduction is not activated (e.g., clock spreader 7850 and clock despreader 7852 are not being used).

In an example when clock noise leakage reduction is activated and clock spreader 7850 and clock despreader 7852 are being used, the communicated signals are illustrated in diagram 8210. More specifically, the control signal 8204 is modulated on the clock signal 8206 to generate the modulated signal 8212, which is communicated (with harmonics 8214) from the BBS to the RFEM in lieu of separate signals 8204 and 8206. As seen in diagram 8210, the modulated signal 8212 is further away from the DC signal 8203, which can be used to alleviate RF choke requirements at the RFEM (e.g., the RF choke can include smaller inductors or ferrite beads). Additional benefit is also achieved since a modulated signal 8212 is communicated instead of a single sine wave clock signal 8206, which reduces noise leakage along the coax cable 7806.

Distributed phased array systems (e.g., WiGig and 5G cellular systems) are currently used in laptops, tablets, smart phones, docking stations and other applications. Current distributed phased array systems used for WiGig and 5G communications are either super-heterodyne (dual conversion) or sliding-IF systems. In these systems, the MAC-PHY baseband sub-system receives or transmits an intermediate frequency (IF) signal, which necessitates the use of IF amplification stages, RF-IF mixers, high selectivity band-pass filters and other circuitry necessary for communicating IF signals between circuits, as well as up-conversion and down-conversion of the IF signals.

The additional circuitry for IF signal processing results in a larger front-end module, higher cost for the distributed phased array system, and lower system performance. Additionally, some mmWave and IF frequency processing performed in the baseband sub-system may not be desired for some system vendors. Furthermore, interactions between the IF circuits (especially the frequency source) and the high-power amplifiers can cause multiple kinds of interference that degrade system performance.

Figure 83:
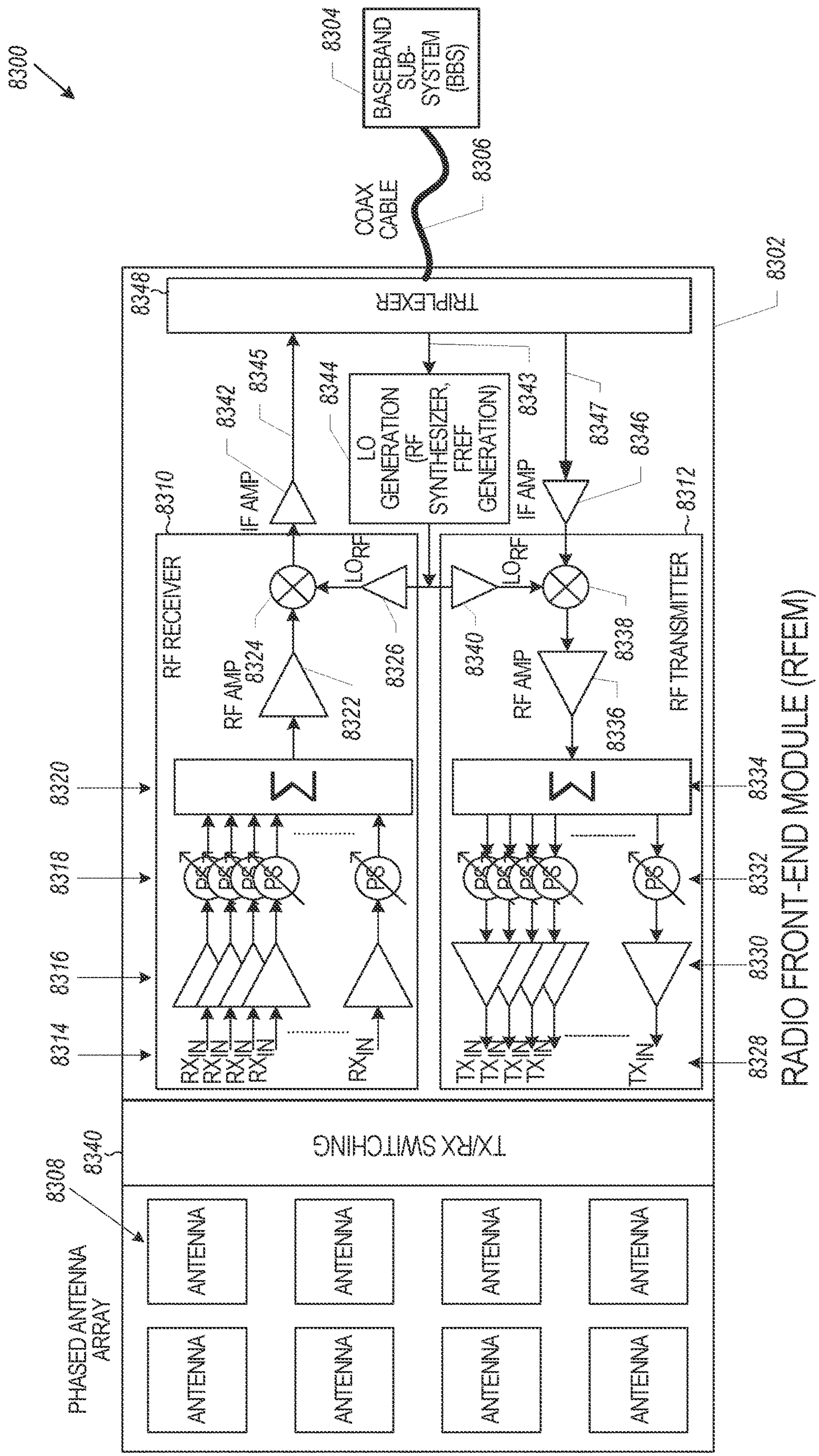

FIG. 83 illustrates an exemplary RF front-end module (RFEM) of a distributed phased array system with IF processing according to some aspects. The distributed phased array system may be incorporated in the digital baseband circuitry 310, the transmit circuitry 315, and the receive circuitry 320 of mmWave communication circuitry 300 shown in FIG. 3A, although the distributed phased array system is not limited to such.

Referring to FIG. 83, the RFEM 8302 is coupled to a baseband sub-system (BBS) 8304 via a single coax cable 8306. The RFEM 8302 can include a phased antenna array 8308, an RF receiver 8310, an RF transmitter 8312, a local oscillator (LO) generator 8344, a triplexer 8348, and a transmit (TX)/receive (RX) switch 8340. The RF receiver 8310 can include a plurality of power amplifiers 8316, a plurality of phase shifters 8318, a combiner 8320, an RF amplifier 8322, an LO amplifier 8326, and a mixer 8324. The RF receiver 8310 can also include an IF amplifier 8342.

The RF transmitter 8312 can include a mixer 8338, LO amplifier 8340, an RF amplifier 8336, a splitter 8334, a plurality of phase shifters 8332, and a plurality of amplifiers 8330. The RF transmitter 8312 can also include an IF amplifier 8346.

In an example receive operation, the switch 8340 can activate receiver chain processing. The antenna array 8308 can be used for receiving a plurality of signals 8314. The received signals 8314 can be amplified by amplifiers 8316 and their phase can be adjusted by corresponding phase shifters 8318. Each of the phase shifters 8318 can receive a separate phase adjustment signal (not illustrated in FIG. 83) from a control circuitry (e.g., from a modem within the BBS 8304), where the individual phase adjustment signals can be based on desired signal directionality when processing signals received via the phased antenna array 8308. The phase adjusted signals at the output of the phase shifters 8318 can be combined by the combiner 8320 and then amplified by the RF amplifier 8322. The LO generator 8344 can generate a LO signal using a clock frequency signal 8343 received from the BBS 8304 via the coax cable 8306. The LO signal can be amplified by the amplifier 8326 and then multiplied with the output of amplifier 8322 using the mixer 8324 in order to generate an IF input signal 8345. The IF input signal 8345 can be amplified by amplifier 8342 and then communicated to the BBS 8304 via the triplexer 8348 and the coax cable 8306. In some aspects, the IF input signal 8345 can be centered around a 10.56 GHz signal.

In an example transmit operation, the switch 8340 can activate transmitter chain processing. The RFEM 8302 can receive an IF signal 8347 from the BBS 8304 via the coax cable 8306 and the triplexer 8348. The IF signal 8347 can be amplified by IF amplifier 8346 and then communicated to the mixer 8338. The mixer 8338 can receive an up-conversion LO signal from the LO generator 8344 and the LO amplifier 8340. The amplified LO signal is multiplied with the amplified received IF signal by the mixer 8338 to generate an RF signal. The RF signal is then amplified by amplifier 8336 and communicated to the splitter 8334. The splitter 8334 generates multiple copies of the amplified signal and communicates signal copies to the plurality of phase shifters 8332. The plurality of phase shifters 8332 can apply different phase adjustment signals to generate a plurality of phase adjusted signals, which can be amplified by the plurality of amplifiers 8330. The plurality of amplifiers 8330 generates a plurality of signals 8328 for transmission by the phased antenna array 8308.

Figure 84:
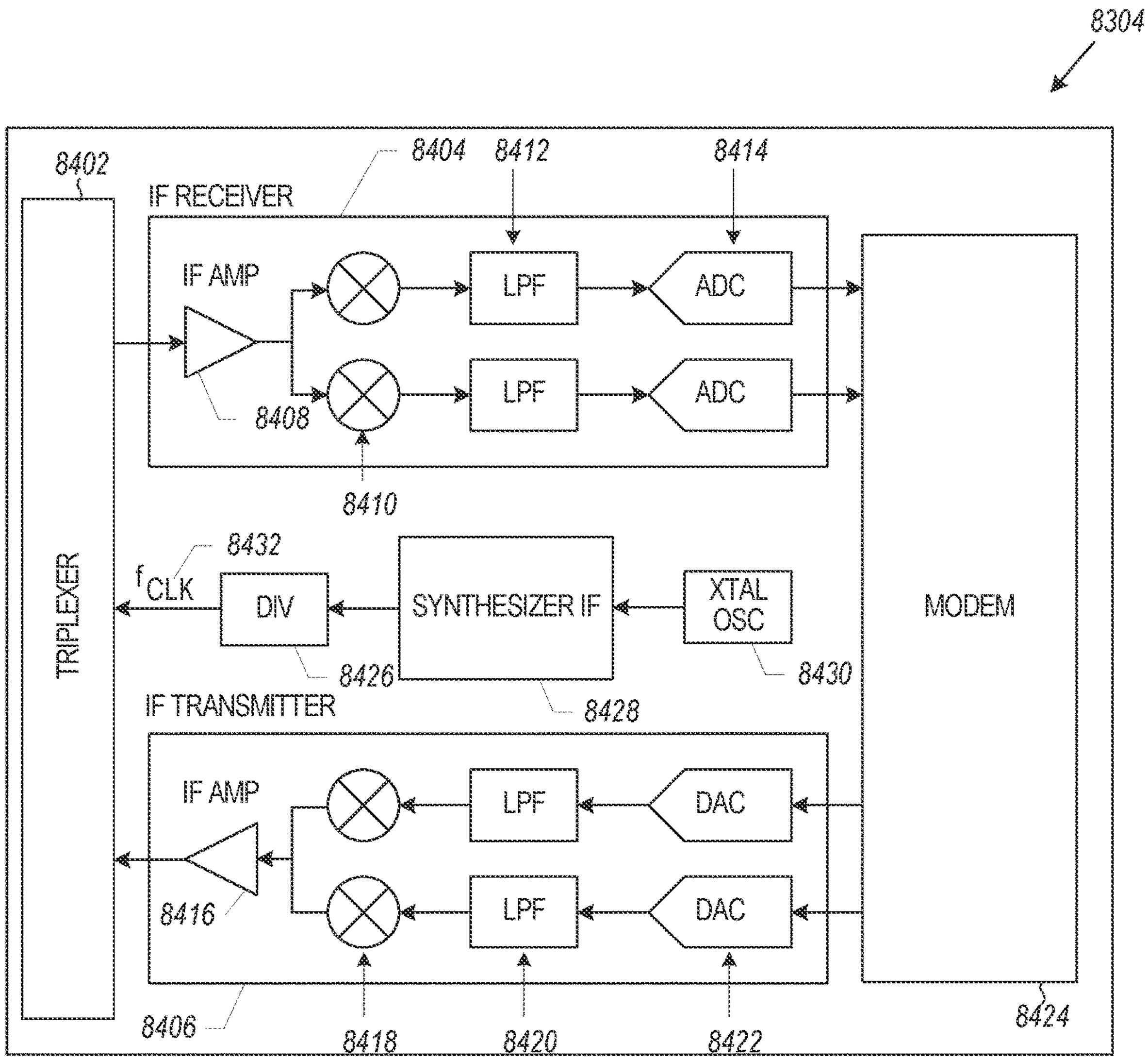

FIG. 84 illustrates a baseband sub-system (BBS) of the distributed phased array system of FIG. 83 according to some aspects. Referring to FIG. 84, the BBS 8304 can include a triplexer 8402, an IF receiver 8404, an IF transmitter 8406, a modem 8424, a crystal oscillator 8430, a synthesizer 8428, and a divider 8426. The synthesizer 8428 may include suitable circuitry, logic, interfaces and/or code and can use a signal from the crystal oscillator 8430 to generate a clock signal. The generated clock signal can be divided by the divider 8426 to generate an output clock reference signal 8432 for communication to the RFEM 8302. In some aspects, the generated clock reference signal 8432 can be centered around a frequency of 1.32 GHz.

The IF receiver 8404 can include an IF amplifier 8408, mixers 8410, filters (e.g., low-pass filters) 8412, and analog-to-digital conversion (ADC) blocks 8414. The IF transmitter 8406 can include digital-to-analog conversion (DAC) blocks 8422, filters 8420, mixers 8418, and IF amplifier 8416.

In an example receive operation, an IF signal (e.g., 8345) is received from the RFEM 8302 via the triplexer 8402 and is amplified by IF amplifier 8408. The amplified IF signal can be down-converted to baseband signals by the mixers 8410, then filtered by low-pass filters 8412, and converted to a digital signal by the ADC blocks 8414 before being processed by the modem 8424.

In an example transmit operation, a digital signal output by the modem 8424 can be converted to analog signals by the DAC blocks 8422. The analog signals are then filtered by the low-pass filters 8420 and then up-converted to an IF signal by the mixers 8418. The IF signal can be amplified by the IF amplifier 8416, and then communicated to the RFEM 8302 via the triplexer 8402 and the single coax cable 8306.

Figure 85:
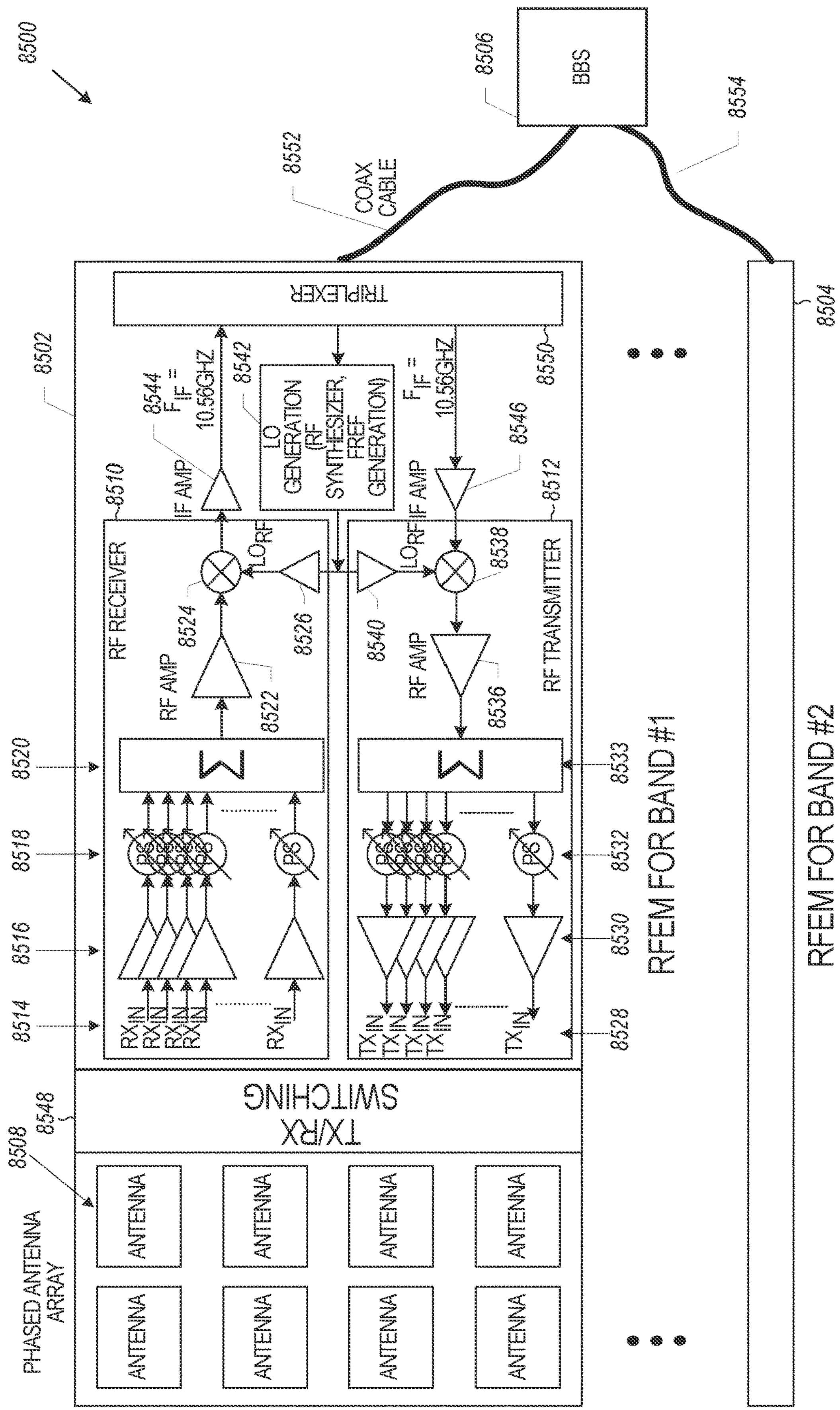

FIG. 85 illustrates a multi-band distributed phased array system with IF processing within the RFEMs according to some aspects. Referring to FIG. 85, the RFEMs 8502, . . . , 8504 are coupled to a baseband sub-system (BBS) 8506 via corresponding connections (e.g., coax cables 8552, . . . , 8554 respectively). In some aspects, each of the RFEMs 8502, . . . , 8504 can be configured for reception and transmission of wireless signals in a specific band (e.g., a 28 GHz band, a 39 GHz band, a 60 GHz ISM band such as WiGig or a 5G communication band). Even though description of the functionalities of RFEM 8502 are provided below, the additional RFEMs (e.g., RFEM 8504) can be configured in a similar fashion.

The RFEM 8502 can include a phased antenna array 8508, an RF receiver 8510, an RF transmitter 8512, a local oscillator (LO) generator 8542, a triplexer 8550, and a transmit (TX)/receive (RX) switch 8548. The RF receiver 8510 can include a plurality of power amplifiers 8516, a plurality of phase shifters 8518, a combiner 8520, an RF amplifier 8522, an LO amplifier 8526, and a mixer 8524. The RF receiver 8510 can also include an IF amplifier 8544.

The RF transmitter 8512 can include a mixer 8538, LO amplifier 8540, an RF amplifier 8536, a splitter 8534, a plurality of phase shifters 8532, and a plurality of amplifiers 8530. The RF transmitter 8312 can also include an IF amplifier 8546.

In an example receive operation, the switch 8548 can activate receiver chain processing. The antenna array 8508 can be used for receiving a plurality of signals 8514. The received signals 8514 can be amplified by amplifiers 8516 and their phase can be adjusted by corresponding phase shifters 8518. Each of the phase shifters 8518 can receive a separate phase adjustment signal (not illustrated in FIG. 85) from a control circuitry (e.g., from a modem within the BBS 8506), where the individual phase adjustment signals can be based on desired signal directionality when processing signals received via the phased antenna array 8508. The phase adjusted signals at the output of the phase shifters 8518 can be combined by the combiner 8520 and then amplified by the RF amplifier 8522. The LO generator 8542 can generate a LO signal using a clock frequency signal received from the BBS 8506 via the coax cable 8552. The LO signal can be amplified by the amplifier 8526 and then multiplied with the output of amplifier 8522 using the mixer 8524 in order to generate an IF input signal. The IF input signal can be amplified by amplifier 8544 and then communicated to the BBS 8506 via the triplexer 8550 and the coax cable 8552. In some aspects, the IF input signal can be a 10.56 GHz signal.

In an example transmit operation, the switch 8548 can activate transmitter chain processing. The RFEM 8502 can receive an IF signal from the BBS 8506 via the coax cable 8552 and the triplexer 8550. The IF signal can be amplified by IF amplifier 8546 and then communicated to the mixer 8538. The mixer 8538 can receive an up-conversion LO signal from the LO generator 8542 and the LO amplifier 8540. The amplified LO signal is multiplied with the amplified received IF signal by the mixer 8538 to generate an RF signal. The RF signal is then amplified by amplifier 8536 and communicated to the splitter 8534. The splitter 8534 generates multiple copies of the amplified signal and communicates signal copies to the plurality of phase shifters 8532. The plurality of phase shifters 8532 can apply different phase adjustment signals to generate a plurality of phase adjusted signals, which can be amplified by the plurality of amplifiers 8530. The plurality of amplifiers 8530 generates a plurality of signals 8528 for transmission by the phased antenna array 8508.

Figure 86:
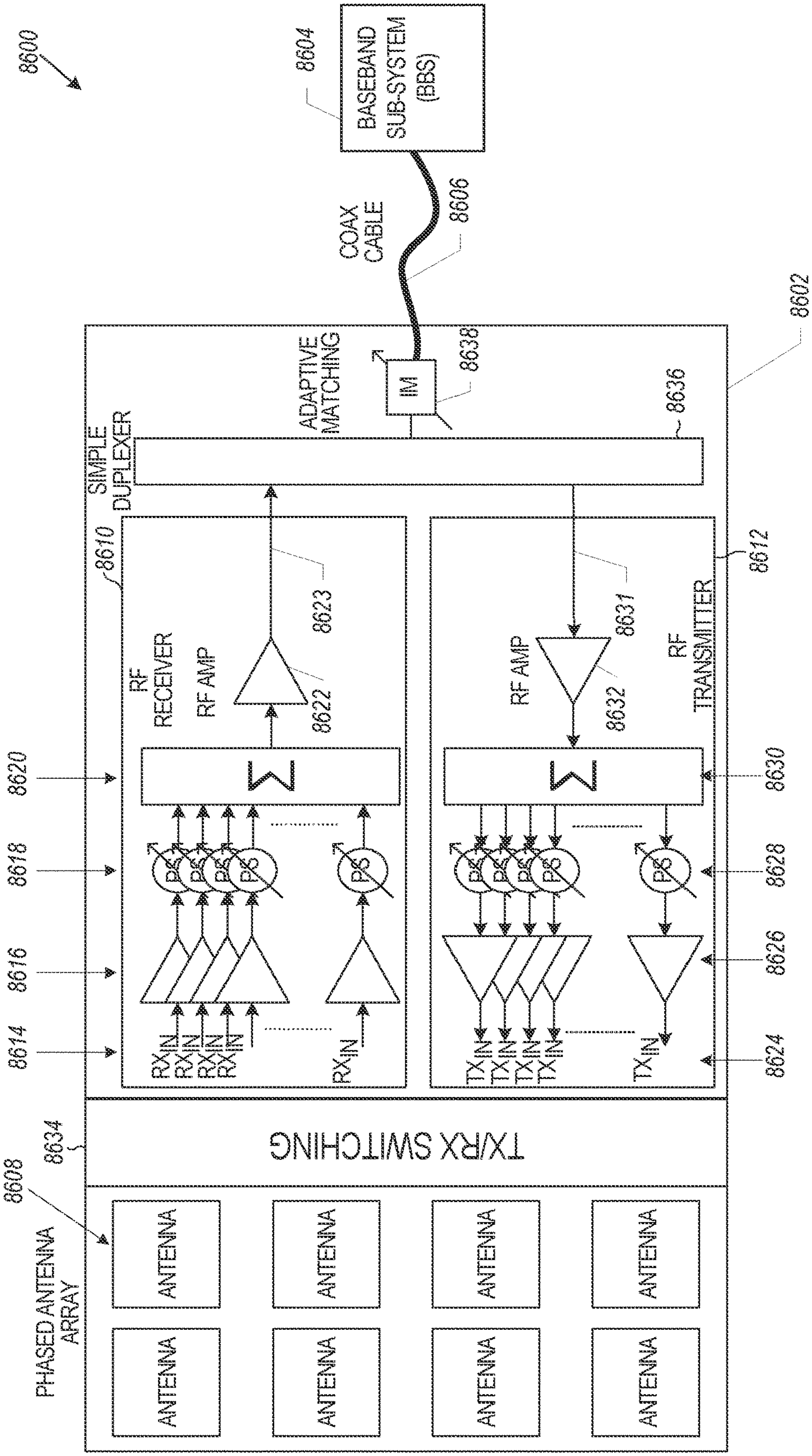

FIG. 86 illustrates a distributed phased array system with an RFEM coupled to a BBS via a single coax cable for communicating RF signals according to some aspects. Referring to FIG. 86, the distributed phased array communication system 8600 can include RFEM 8602 coupled to a baseband sub-system (BBS) 8604 via a single coax cable 8606. The RFEM 8602 can include a phased antenna array 8608, an RF receiver 8610, an RF transmitter 8612, a duplexer 8636, and a transmit (TX)/receive (RX) switch 8634. The RF receiver 8610 can include a plurality of power amplifiers 8616, a plurality of phase shifters 8618, a combiner 8620, and an RF amplifier 8622. The RF transmitter 8612 can include an RF amplifier 8632, a splitter 8630, a plurality of phase shifters 8628, and a plurality of amplifiers 8626.

In an example receive operation, the switch 8634 can activate receiver chain processing. The antenna array 8608 can be used for receiving a plurality of signals 8614. The received signals 8614 can be amplified by amplifiers 8616 and their phase can be adjusted by corresponding phase shifters 8618. Each of the phase shifters 8618 can receive a separate phase adjustment signal (not illustrated in FIG. 86) from a control circuitry (e.g., from a modem within the BBS 8604), where the individual phase adjustment signals can be based on desired signal directionality when processing signals received via the phased antenna array 8608. The phase adjusted signals at the output of the phase shifters 8618 can be combined by the combiner 8620 and then amplified by the RF amplifier 8622 to generate an RF input signal 8623. The RF input signal 8623 can be communicated to the BBS 8604 via the duplexer 8636 and the coax cable 8606. In some aspects, the RF input signal 8623 can be a 60 GHz signal or another signal in a millimeter wave band including a 5G communication band. In some aspects, the RFEM 8602 can include an adaptive matching block 8638 for impedance matching prior to communication of signals via the coax cable 8606, as explained herein below.

In an example transmit operation, the switch 8634 can activate transmitter chain processing. The RFEM 8602 can receive an RF output signal 8631 from the BBS 8604 via the coax cable 8606 and the duplexer 8636. The RF signal 8631 can be amplified by RF amplifier 8632 and then communicated to the splitter 8630. The splitter 8630 can generate multiple copies of the amplified RF signal and communicate the signal copies to the plurality of phase shifters 8628. The plurality of phase shifters 8628 can apply different phase adjustment signals to generate a plurality of phase adjusted signals, which can be amplified by the plurality of amplifiers 8626. The plurality of amplifiers 8626 generates a plurality of signals 8624 for transmission by the phased antenna array 8608.

Figure 87:
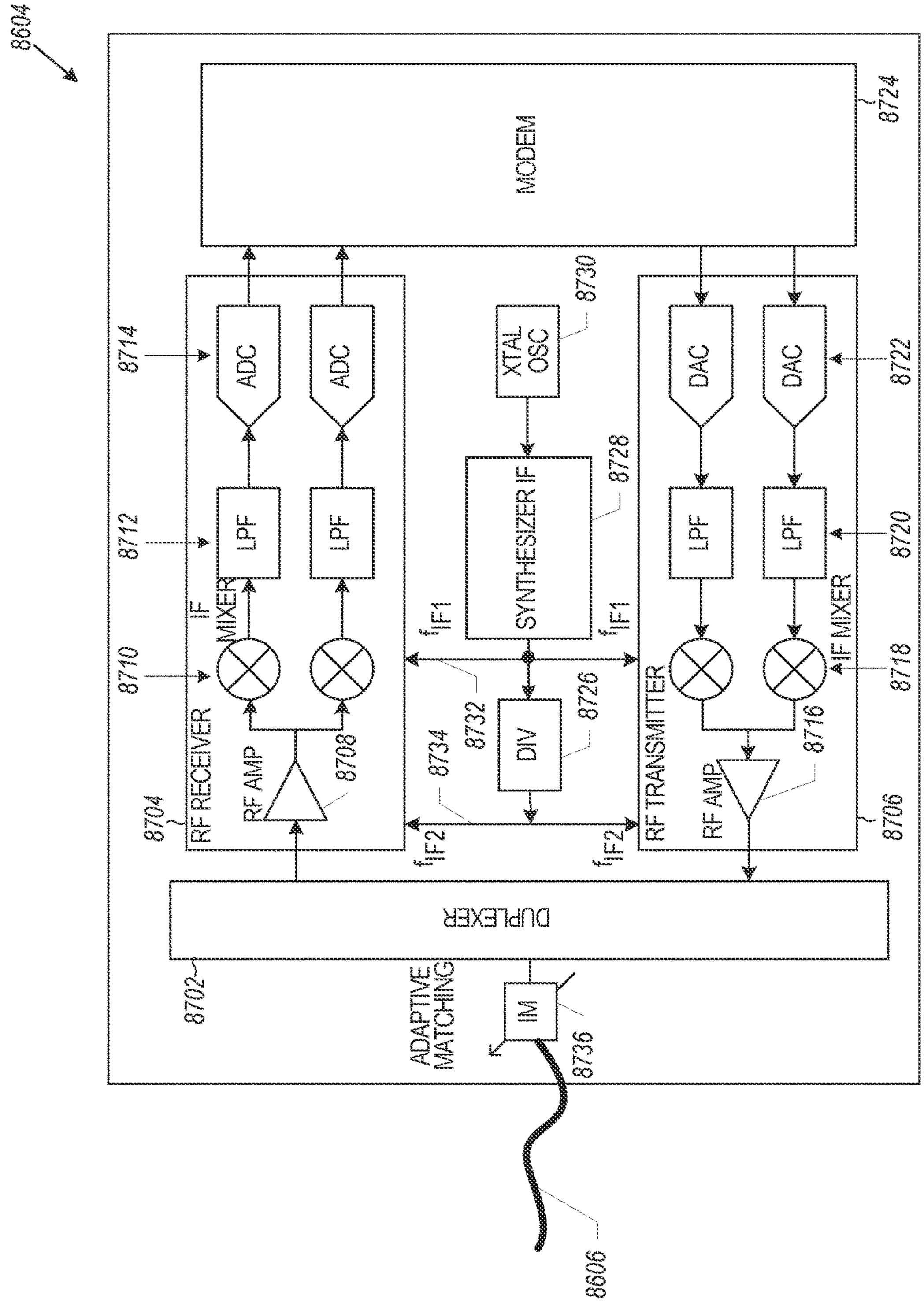

FIG. 87 illustrates a more detailed diagram of the BBS of FIG. 86 according to some aspects. Referring to FIG. 87, the BBS 8604 can include a duplexer 8702, an RF receiver 8704, an RF transmitter 8706, a modem 8724, a crystal oscillator 8730, a synthesizer 8728, and a divider 8726. The synthesizer 8728 may include suitable circuitry, logic, interfaces and/or code and can use a signal from the crystal oscillator 8730 to generate a clock signal, such as signal 8732. The generated clock signal 8732 can be used by the RF receiver 8704 to down-convert a received signal using the mixers 8710. The generated clock signal 8732 can also be used by the RF transmitter 8706 to up-convert a signal using the mixers 8718.

The clock signal 8732 can also be divided by the divider 8726 to generate a second clock signal 8734. The generated second clock signal 8734 can be used by the RF receiver 8704 to down-convert a received signal using the mixers 8710. The generated second clock signal 8734 can also be used by the RF transmitter 8706 to up convert a signal using the mixers 8718. As seen in FIG. 87, two separate clock signals 8734 and 8732 can be generated by the synthesizer 8728 and divider 8726 for purposes of performing multiple down-conversion or up-conversion schemes, if necessary in some aspects.

One or both of the two clock signals 8734 and 8732 can be used for down-conversion of RF signals into baseband using one or more intermediate IF stages or, in some instances, conversion from RF to baseband without an intermediate IF stage conversion. Similarly, one or both of the clock signals 8734 and 8732 can be used for up conversion of a baseband signal into an RF signal using one or more intermediate IF stages or, in some instances, conversion from baseband to RF without an intermediate IF stage conversion.

The RF receiver 8704 can include an RF amplifier 8708, mixers 8710, filters 8712, and analog-to-digital conversion (ADC) blocks 8714. The RF transmitter 8706 can include digital-to-analog conversion (DAC) blocks 8722, filters 8720, mixers 8718, and an RF amplifier 8716.

In an example receive operation, an RF signal (e.g., 8623) is received from the RFEM 8602 via the single coax 8606 and the duplexer 8702, and is amplified by RF amplifier 8708. The amplified RF signal can be down-converted to baseband signals by the mixers 8710, then filtered by low-pass filters 8712, and converted to a digital signal by the ADC blocks 8714 before being processed by the modem 8724.

In an example transmit operation, a digital signal output by the modem 8724 can be converted to analog signals by the DAC blocks 8722. The analog signals are then filtered by the low-pass filters 8720 and then up-converted to an RF signal by the mixers 8718. The RF signal can be amplified by the RF amplifier 8716, and then communicated to the RFEM 8602 (e.g., as signal 8631) via the duplexer 8702 and the single coax cable 8606.

In some aspects, the coax cable 8606 can be used for communication of DC power signals (e.g., from the BBS 8604 to the RFEM 8602), control signals and RF data signals that received or transmitted by the phased array antenna elements 8608. The control signals can include phase adjustment signals, power up signals, power down signals, and other control signals communicated from the BBS 8604 to the RFEM 8602. In some aspects, control signals can include phase adjustment request signals or other data request signals communicated from the RFEM 8602 to the BBS 8604. In this regard, a direct conversion scheme can be used in connection with a distributed phased array system, where the RFEM and the BBS are coupled via a single coax cable.

In some aspects, the control signal can be used for controlling the RFEM operation (e.g., controlling output power levels, AGC, ON/OFF, etc.). Additionally, the control link between the RFEM and the BBS can be bi-directional, and can be used for BBS-to-RFEM commands and for RFEM-to-BBS telemetry transfer (e.g., PA power detectors reading, ACK after a control command reception, temperature detector reading, etc.).

In some aspects, different types of coax cables (e.g., 8606) can be used in connection with a distributed phased array communication system that communicate RF over the coax. For example, high quality coaxial cable, a semi-rigid cable, or a flexible semi-rigid cable can be used as cable 8606, which will allow for high frequency communication of RF signals with reasonable loss.

In another example, a lower cost coax cable can be used as coax 8606, which can result in matching (S11) and high loss (S21) issues with high RF frequency communications. These drawbacks can be improved via system design changes, such as adaptive cable matching improvements, robust RX and TX line-ups, and RX and TX non-linearity distortion cancellation.

RF signal communication over a cable can be associated with high losses and matching issues. Due to the high frequency associated with RF cable communication, the variation of the cable matching can be high and unexpected, which affects the power loss between the cable and the load. In an example and in order to overcome these drawbacks, an adaptive impedance matching circuitry (e.g., 8638 and 8736) can be used in the RFEM 8602 and the BBS 8604, as seen in FIGS. 86-87.

In some aspects, higher signal loss associated with the coax cable can be addressed by adding additional gain amplification/adjustment stages (not illustrated in the figures) (e.g., before the cable 8606 and the adaptive matching 8638 within the RFEM 8602), which can ensure that a potential high signal loss of a coax cable would not degrade the SNR of the communicated RF signal.

In some aspects, additional gain stages in the RX and TX line-uϕ may lead to non-linearity distortion. However, these signal distortions can be compensated via digital mechanisms, such as pre-distortion adjustment circuitry in the TX path or post-distortion adjustment circuitry in the RX path (not illustrated in the figures).

Figure 88:
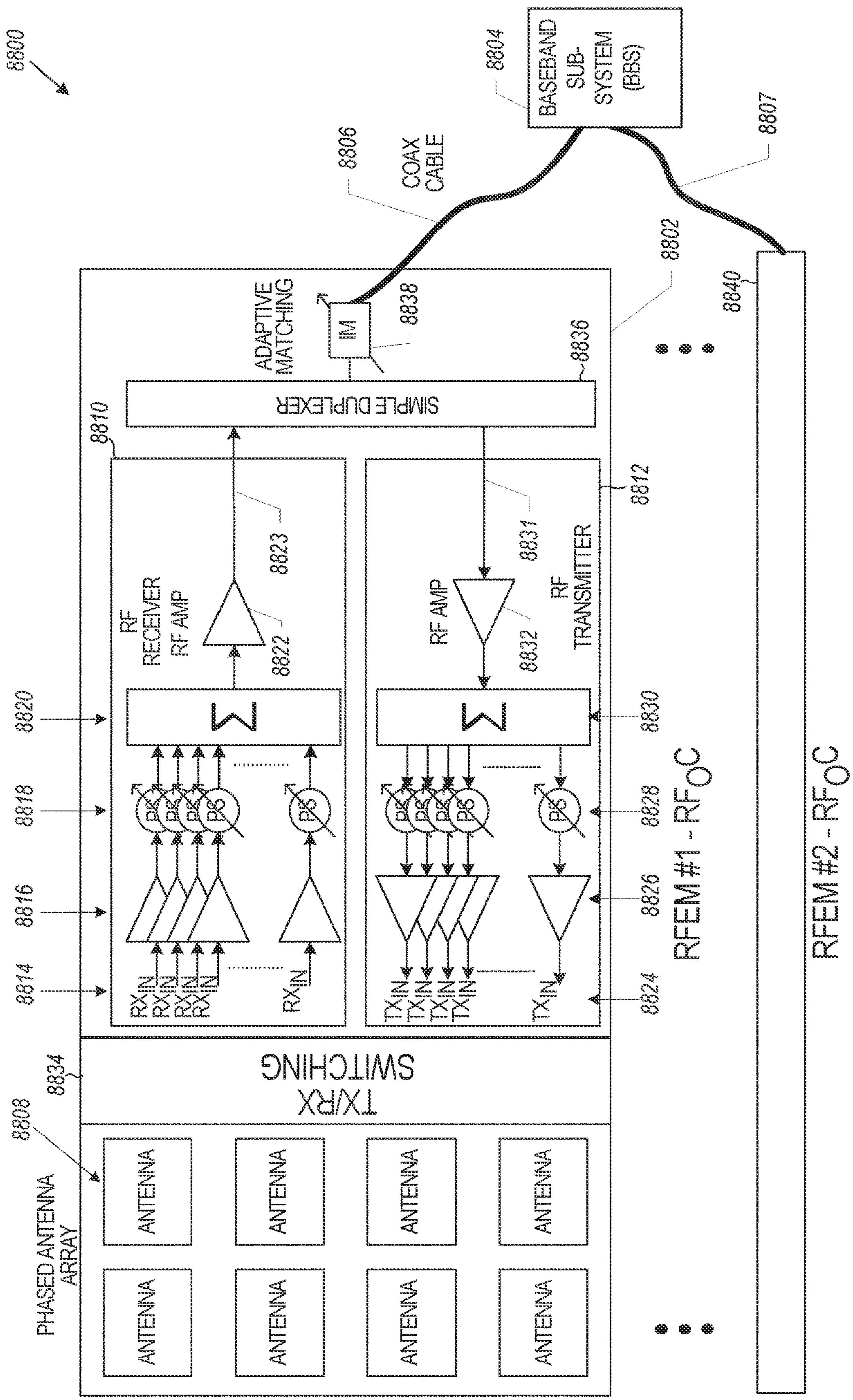

FIG. 88 illustrates an exemplary distributed phased array system supporting multiple communication bands using multiple RFEMs coupled to a single BBS according to some aspects. Referring to FIG. 88, the distributed phased array communication system 8800 can be used to implement a multi-band system. More specifically, multiple RFEMs (8802, . . . , 8840) can be used with a single BBS (8604), with each RFEM including a phased antenna array for processing wireless signals in a specific communication band. The RFEMs 8802, . . . , 8840 can be coupled to the BBS 8804 via corresponding single coax cables 8806, . . . , 8807.

Referring to FIG. 88, the distributed phased array communication system 8800 can include RFEM 8802 coupled to the BBS 8804 via a single coax cable 8806. The RFEM 8802 can include a phased antenna array 8808, an RF receiver 8810, an RF transmitter 8812, a duplexer 8836, and a transmit (TX)/receive (RX) switch 8834. The RF receiver 8810 can include a plurality of power amplifiers 8816, a plurality of phase shifters 8818, a combiner 8820, and an RF amplifier 8822. The RF transmitter 8812 can include an RF amplifier 8832, a splitter 8830, a plurality of phase shifters 8828, and a plurality of amplifiers 8826.

In an example receive operation, the switch 8834 can activate receiver chain processing. The antenna array 8808 can be used for receiving a plurality of signals 8814. The received signals 8814 can be amplified by amplifiers 8816 and their phase can be adjusted by corresponding phase shifters 8818. Each of the phase shifters 8818 can receive a separate phase adjustment signal (not illustrated in FIG. 88) from a control circuitry (e.g., from a modem within the BBS 8804), where the individual phase adjustment signals can be based on desired signal directionality when processing signals received via the phased antenna array 8808. The phase adjusted signals at the output of the phase shifters 8818 can be combined by the combiner 8820 and then amplified by the RF amplifier 8822 to generate an RF input signal 8823. The RF input signal 8823 can be communicated to the BBS 8804 via the duplexer 8836 and the coax cable 8806. In some aspects, the RF input signal 8823 can be a 60 GHz signal or another signal in a millimeter wave band, including a 5G communication band.

In an example transmit operation, the switch 8834 can activate transmitter chain processing. The RFEM 8802 can receive an RF output signal 8831 from the BBS 8804 via the coax cable 8806 and the duplexer 8836. The RF signal 8831 can be amplified by RF amplifier 8832 and then communicated to the splitter 8830. The splitter 8830 can generate multiple copies of the amplified RF signal, and communicate the signal copies to the plurality of phase shifters 8828. The plurality of phase shifters 8828 can apply different phase adjustment signals to generate a plurality of phase adjusted signals, which can be amplified by the plurality of amplifiers 8826. The plurality of amplifiers 8826 can generate a plurality of signals 8824 for transmission by the phased antenna array 8808. In some aspects, the remaining RFEMs within the system 8800 can be the same as RFEM 8802.

Even though FIG. 86, FIG. 87, and FIG. 88 disclose the use of a single coax cable to connect the BBS with the RFEM, the disclosure is not limited in this regard and other types of connections can be used as well. For example, another type of a millimeter wave connection or cable can be used instead of the single coax cable. Other types of connections that can be used include semi-rigid cables, flexible cables of a flexible substrate, printed RF transmission lines on PCB, rigid flex board, and so forth. For example and in reference to FIG. 88, a rigid flex board can be used in lieu of coax cables 8806, . . . , 8807, where the multiple RFEMs can be fed via RF lines that propagate from the main BBS 8804 to the RFEM's in different locations using flexible portion of the connection board (e.g., RF over flex portion of a rigid flex board). In this way, the RFEM can fold over and bend over in different areas in a system based on PC/mobile form factor or in a base station chassis.

Figure 89:
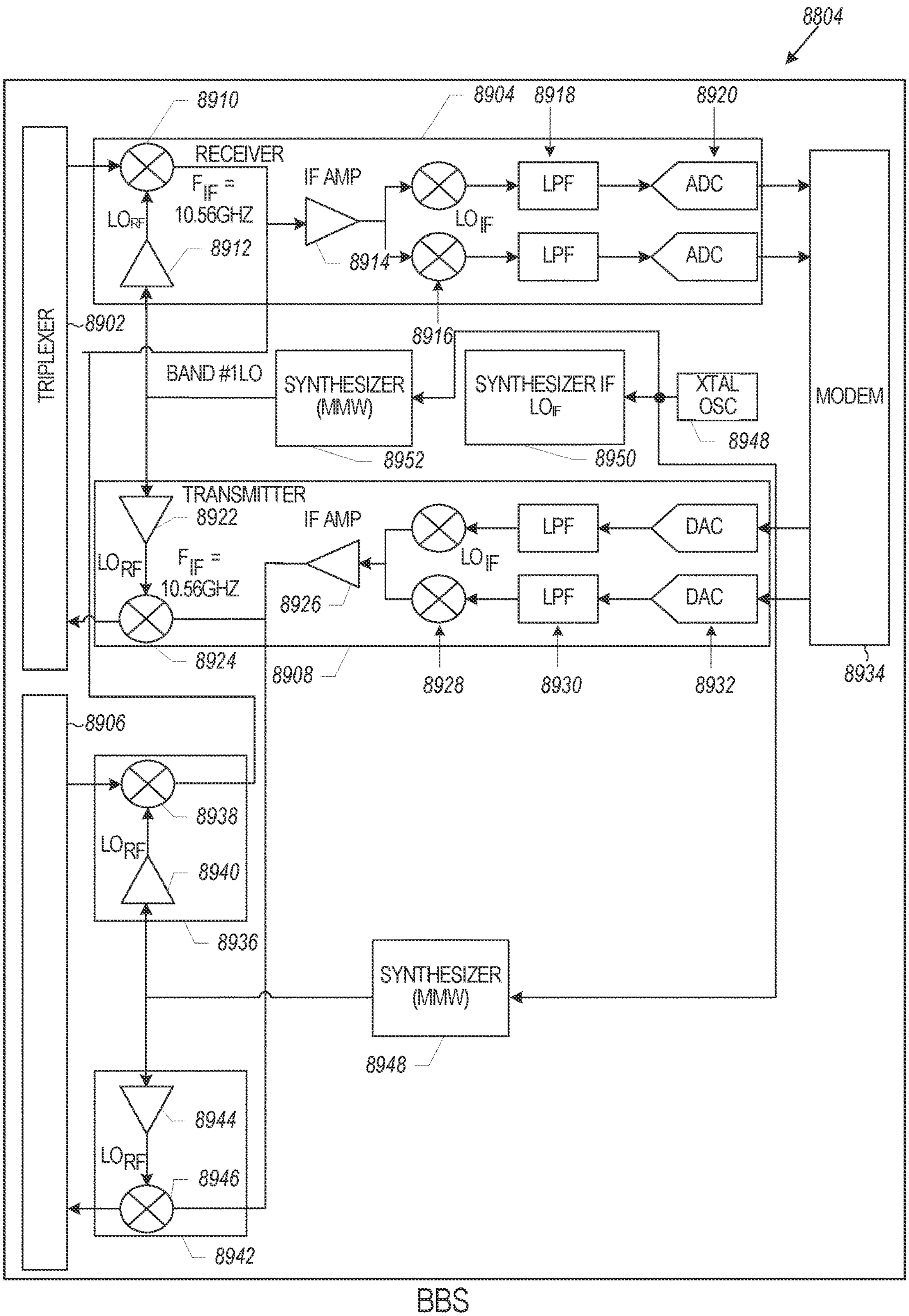

FIG. 89 illustrates a more detailed diagram of the BBS of FIG. 88 according to some aspects. Referring to FIG. 89, the BBS 8804 can include a receiver 8904, a transmitter 8908, triplexers 8902 and 8906, a modem 8934, synthesizers 8948, 8950, and 8952, a down-conversion block 8936, and an up-conversion block 8942. In some aspects, the mixer 8910 and amplifier 8912 can form a down-conversion block (such as 8936), which can be separate from the receiver 8904. In some aspects, the mixer 8924 and amplifier 8922 can form an up-conversion block (such as 8942), which can be separate from the transmitter 8908. The down-conversion block 8936 and the up-conversion block 8942 can be used for processing receive or transmit signals associated with the RFEM 8840. Additional up-conversion or down-conversion blocks can be used within the BBS 8804 in order to process signals associated with additional RFEMs.

The synthesizers 8950, 8952, and 8948 may include suitable circuitry, logic, interfaces and/or code and can use a signal from the crystal oscillator 8948 to generate clock signals. In some aspects, the first synthesizer 8952 can generate an LO signal to down-convert an RF signal in a first frequency band (e.g., an RF signal in the millimeter wave band received from the RFEM 8802) to an IF signal. In some aspects, the second synthesizer 8948 can generate an LO signal to down-convert an RF signal in a second frequency band (e.g., an RF signal in the millimeter wave band received from the RFEM 8840) to an IF signal at the same IF frequency as associated with the synthesizer 8952. In some aspects, the synthesizer 8950 can be configured to generate an LO signal, which can be used by the mixers 8916 to down-convert an IF signal to baseband, or by the mixers 8928 to up convert a baseband signal to an IF signal.

The receiver 8904 can include a mixer 8910, an LO amplifier 8912, an IF amplifier 8914, mixers 8916, filters (e.g., low-pass filters) 8918, and analog-to-digital conversion (ADC) blocks 8920. The transmitter 8908 can include digital-to-analog conversion (DAC) blocks 8932, filters 8930, mixers 8928, an IF amplifier 8926, a mixer 8924, and an LO amplifier 8922. The down-conversion block 8936 for the second RFEM can include a mixer 8938 and an LO amplifier 8940. The up-conversion block 8942 for the second RFEM can include a mixer 8946 and an LO amplifier 8944.

In an example receive operation associated with RFEM 8802, an RF signal is received from the RFEM 8802 via the triplexer 8902. The received RF signal is down-converted to an IF signal by the mixers 8910 using an LO signal generated by synthesizer 8952. The IF signal is amplified by IF amplifier 8914. The amplified IF signal can be down-converted to baseband signals by the mixers 8916 using an LO signal generated by synthesizer 8950. The baseband signal is then filtered by low-pass filters 8918, and converted to a digital signal by the ADC blocks 8920 before being processed by the modem 8934.

In an example transmit operation associated with RFEM 8802, a digital signal output by the modem 8934 can be converted to analog signals by the DAC blocks 8932. The analog signals are then filtered by the low-pass filters 8930 and then up-converted to an IF signal by the mixers 8928 using an LO signal generated by synthesizer 8950. The IF signal can be amplified by the IF amplifier 8926, and then up-converted to an RF signal using the mixers 8924 and an LO signal generated by synthesizer 8952. The RF signal is then communicated to the RFEM 8802 via the triplexer 8902 and the single coax cable 8806.

In an example receive operation associated with RFEM 8840, an RF signal is received from the RFEM 8840 via the triplexer 8906. The received RF signal is down-converted to an IF signal by the mixer 8938 using an LO signal generated by synthesizer 8948. The IF signal is amplified by IF amplifier 8914. The amplified IF signal can be downconverted to baseband signals by the mixers 8916 using an LO signal generated by synthesizer 8950. The baseband signal is then filtered by low-pass filters 8918, and converted to a digital signal by the ADC blocks 8920 before being processed by the modem 8934.

In an example transmit operation associated with RFEM 8840, a digital signal output by the modem 8934 can be converted to analog signals by the DAC blocks 8932. The analog signals are then filtered by the low-pass filters 8930 and then up-converted to an IF signal by the mixers 8928 using an LO signal generated by synthesizer 8950. The IF signal can be amplified by the IF amplifier 8926, and then up-converted to an RF signal using the mixer 8946 and an LO signal generated by synthesizer 8948. The RF signal is then communicated to the RFEM 8840 via the triplexer 8906 and the single coax cable 8807.

Even though BBS 8804 is illustrated in FIG. 89 as having only two triplexers and two separate up-conversion and down-conversion chains associated with RFEMs 8802 and 8840, the disclosure is not limited in this regard. More specifically, the BBS 8804 can include additional up-conversion and down-conversion chains for processing signals in other wireless bands serviced by additional RFEMs.

As explained herein, the communication architecture solution described in connection with FIGS. 83-85 uses IF signals passed over a coaxial cable, which lends itself to modularity, but may need additional circuitry (synthesizer circuits, reference generation and recovery, IF amplifiers, mixers, and a more complicated triplexer due to a tighter frequency plan), as well as a higher number of signals (e.g., reference frequency for the synthesizer and control signals) on the RFEM. Since in small platforms (especially mobile phone platforms), area and volume near the platform edge can be expensive (a lot of competing antennas and protocols for a limited volume, especially when platforms are becoming thinner and thinner), this added content may result in difficulty with implementation and processing efficiency.

The communication architecture solution described in connection with FIGS. 86-89 is an alternative solution for reducing circuit complexity. More specifically and as seen in FIGS. 86-89, IF and synthesizer content is removed from the RFEM, thereby significantly reducing the silicon area and solution volume around the antenna. However, the solution of FIGS. 86-89 may have some drawbacks connected with modularity. For example, for any band that support is needed, a new BBS chip (for specific RF and IF frequencies) may be needed. This can be a drawback because some BBSs can include wireless band processing that is not required by some system vendors, or it does not include a specific band processing functionality required by other vendors.

In some aspects, a companion chip solution can be introduced and implemented within a distributed phased array communication system. The companion chip solution is illustrated herein in reference to FIGS. 90-92. More specifically, the RFEM is based on RFoC processing (similar to the RFEMs in FIGS. 86-89), and the BBS is configured for processing IF signals, which can keep the BBS the same in different distributed phased array communication systems. The companion chip is introduced as a link between the RFEM and the BBS, and can be configured for RF-to-IF signal processing associated with a specific wireless band. In this regard, area and volume at the platform edge are reduced and the BBS can be kept identical for multiple communication systems (with a different companion chip introduced in different communication systems based on the processing band requirements). By using a companion chip, both modularity and minimal volume at the platform edge can be achieved.

As used herein, the term "companion chip" is used interchangeably with the term supplemental intermediate frequency sub-system (SIFS).

Figure 90:
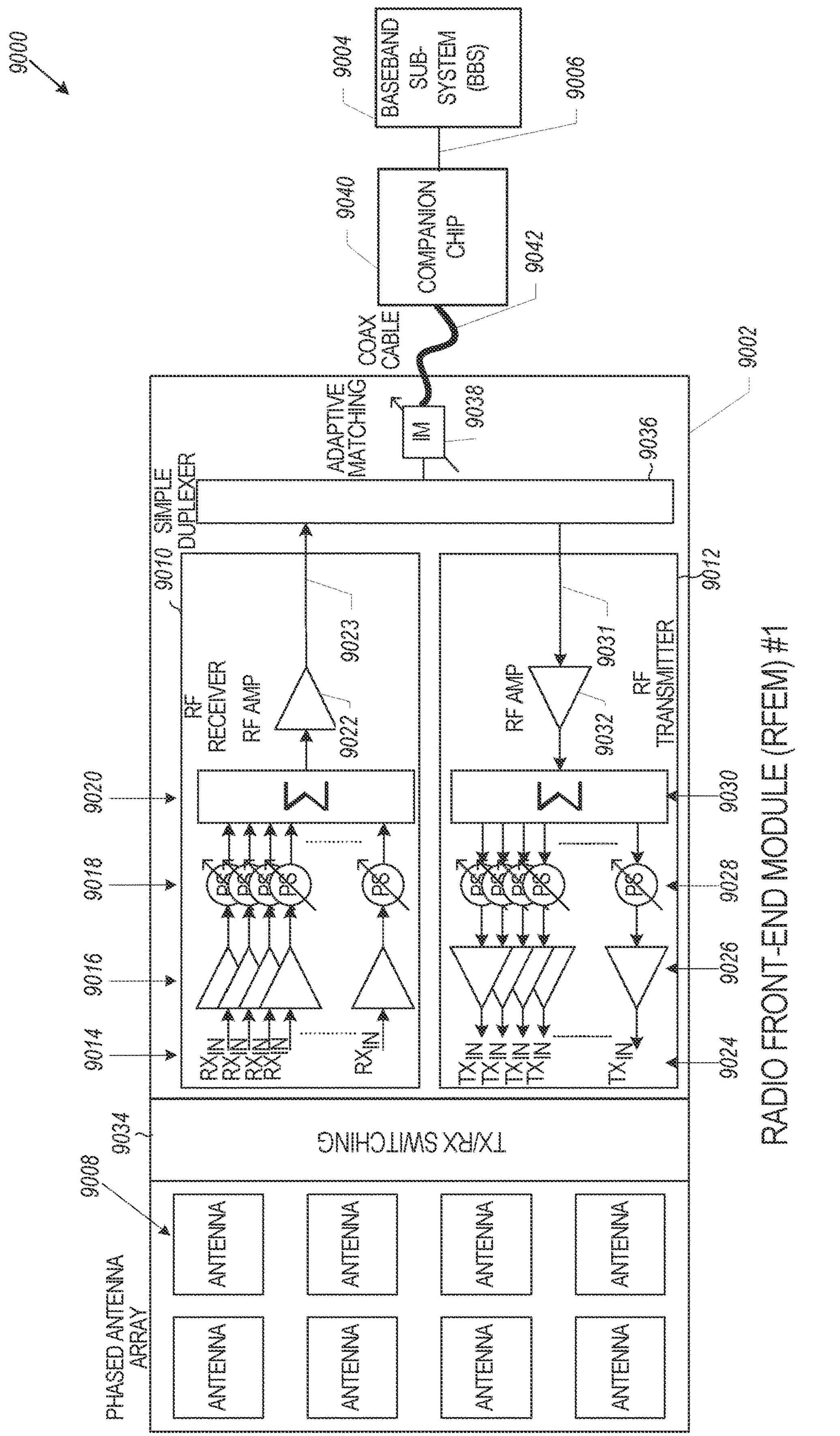

FIG. 90 illustrates an exemplary distributed phased array system including RFEM, a companion chip and a BBS, with IF processing offloaded to the companion chip according to some aspects. Referring to FIG. 90, the distributed phased array communication system 9000 can include RFEM 9002, a companion chip 9040, and a baseband sub-system (BBS) 9004. The RFEM 9002 is coupled to the companion chip 9040 via a single coax cable 9042. The companion chip 9040 is coupled with the BBS 9004 via connection 9006. In some aspects, the connection 9006 can be PCB connection traces (e.g., as indicated with 9122 and 9124 in FIG. 91).

The RFEM 9002 can include a phased antenna array 9008, an RF receiver 9010, an RF transmitter 9012, a duplexer 9036, and a transmit (TX)/receive (RX) switch 9034. The RF receiver 9010 can include a plurality of power amplifiers 9016, a plurality of phase shifters 9018, a combiner 9020, and an RF amplifier 9022. The RF transmitter 9012 can include an RF amplifier 9032, a splitter 9030, a plurality of phase shifters 9028, and a plurality of amplifiers 9026.

In an example receive operation, the switch 9034 can activate receiver chain processing. The antenna array 9008 can be used for receiving a plurality of signals 9014. The received signals 9014 can be amplified by amplifiers 9016 and their phase can be adjusted by corresponding phase shifters 9018. Each of the phase shifters 9018 can receive a separate phase adjustment signal (not illustrated in FIG. 90) from a control circuitry (e.g., from a modem within the BBS 9004), where the individual phase adjustment signals can be based on desired signal directionality when processing signals received via the phased antenna array 9008.

The phase adjusted signals at the output of the phase shifters 9018 can be combined by the combiner 9020 and then amplified by the RF amplifier 9022 to generate an RF input signal 9023. The RF input signal 9023 can be communicated to the companion chip 9040 via the duplexer 9036 and the coax cable 9042. In some aspects, the RF input signal 9023 can be a 60 GHz signal or another signal in a millimeter wave band including a 5G communication band. In some aspects, the RFEM 9002 can include an adaptive matching block 9038 for impedance matching prior to communication of signals via the coax cable 9042, as explained herein below.

In an example transmit operation, the switch 9034 can activate transmitter chain processing. The BBS 9004 can generate a baseband signal, which can be converted to an IF signal within the BBS 9004. The IF signal can be communicated to the companion chip 9040 via connection 9006, where it can be converted to an RF output signal 9031. The RFEM 9002 can receive the RF output signal 9031 from the companion chip 9040 via the coax cable 9042 and the duplexer 9036.

The RF output signal 9031 can be amplified by RF amplifier 9032 and then communicated to the splitter 9030. The splitter 9030 can generate multiple copies of the amplified RF signal and communicate the signal copies to the plurality of phase shifters 9028. The plurality of phase shifters 9028 can apply different phase adjustment signals to generate a plurality of phase adjusted signals, which can be amplified by the plurality of amplifiers 9026. The plurality of amplifiers 9026 generates a plurality of signals 9024 for transmission by the phased antenna array 9008.

Figure 91:
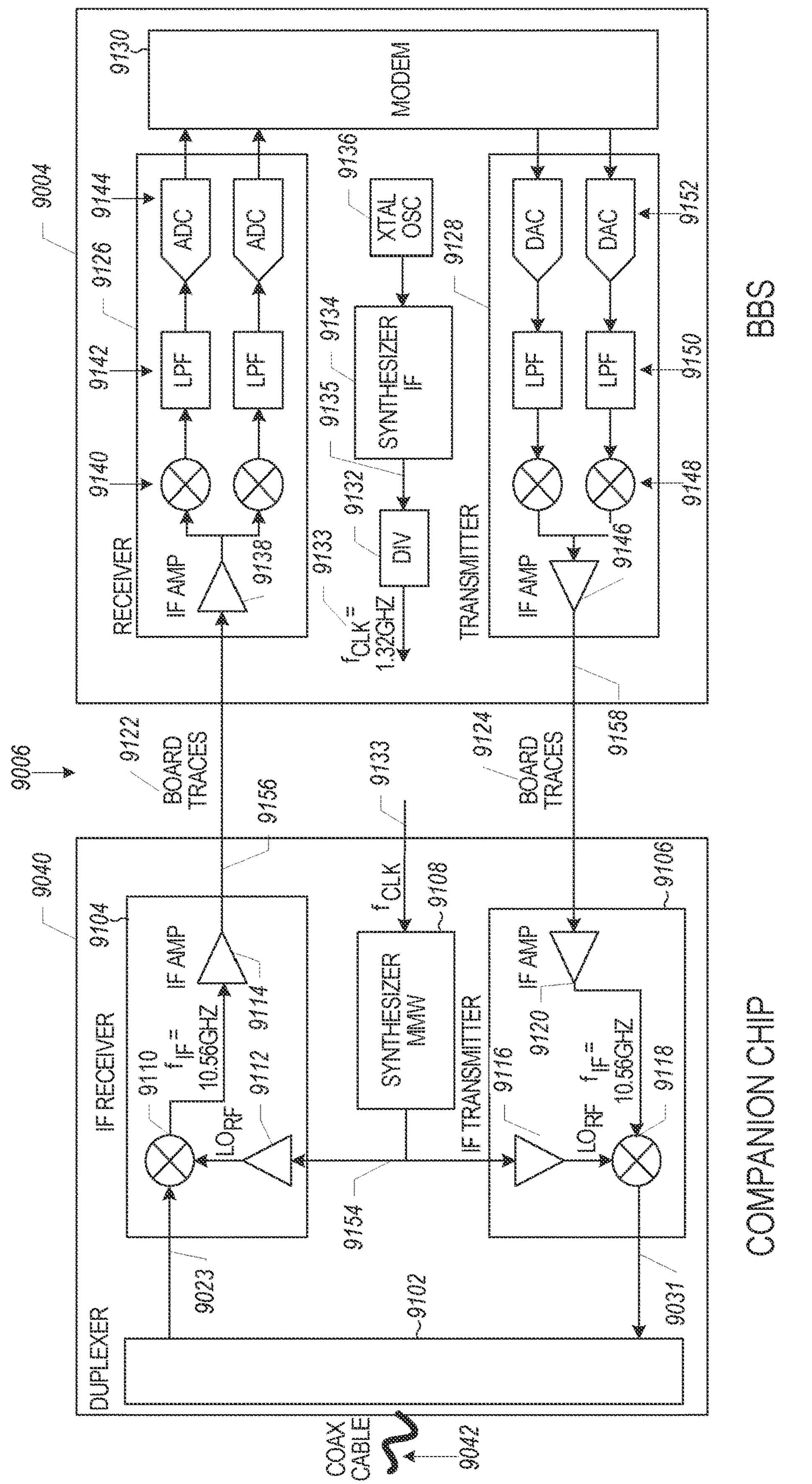

FIG. 91 illustrates a more detailed diagram of the companion chip and the BBS of FIG. 90 according to some aspects. Referring to FIG. 91, the companion chip 9040 can include a duplexer 9102, a receiver 9104, transmitter 9106, and a LO synthesizer 9108. The receiver 9104 can include a mixer 9110, an LO amplifier 9112, and an IF amplifier 9104. The transmitter 9106 can include a mixer 9118, an LO amplifier 9116, and an IF amplifier 9120.

The BBS 9004 can include an RF receiver 9126, an RF transmitter 9128, a modem 9130, a crystal oscillator 9136, a synthesizer 9134, and a divider 9132. The synthesizer 9134 may include suitable circuitry, logic, interfaces and/or code and can use a signal from the crystal oscillator 9136 to generate a clock signal, such as signal 9135. The generated clock signal 9135 can be used by the RF receiver 9126 to down-convert a received IF signal (from the companion chip 9040) using the mixers 9140. The generated clock signal 9135 can also be used by the RF transmitter 9128 to up-convert a baseband signal into an IF signal using the mixers 9148.

In some aspects, the LO signal 9135 can be divided by divider 9132 to generate a clock reference signal 9133. The clock reference signal 9133 can be communicated to the companion chip 9040 and used by the synthesizer 9108 to generate an LO signal 9154 used for down-converting an RF signal (e.g., 9023) into an IF signal, or for up converting an IF signal into an RF signal (e.g., 9031).

The RF receiver 9126 can include an IF amplifier 9138, mixers 9140, filters 9142, and analog-to-digital conversion (ADC) blocks 9144. The RF transmitter 9128 can include digital-to-analog conversion (DAC) blocks 9152, filters 9150, mixers 9148, and an IF amplifier 9146.

In an example receive operation, an RF signal (e.g., 9023) is received by the companion chip 9040 from the RFEM 9002 via the single coax 9042 and the duplexer 9102. The RF signal 9023 is down-converted by the receiver 9104 to generate an IF signal 9156. More specifically, the RF signal 9023 is down-converted by the mixer 9110 using an LO reference signal 9154 amplified by amplifier 9112. The down-converted signal is amplified by amplifier 9114 to generate the IF signal 9156. The IF signal 9156 is communicated to the BBS 9004 via connection 9006 (e.g., board traces 9122) for additional processing by the receiver 9126. Initially, the IF signal 9156 is amplified by the IF amplifier 9138. The amplified IF signal can be down-converted to baseband signals by the mixers 9140, then filtered by low-pass filters 9142, and converted to a digital signal by the ADC blocks 9144 before being processed by the modem 9130. In some aspects, there may be included TX/RX switches at both input/output sides of the companion chip 9040 and the BBS 9004, so that a single signal (e.g., a combined signal) can be communicated between sub-systems 9040 and 9004. In this case, a single set of board traces can be used (e.g., only 9122) instead of multiple sets.

In an example transmit operation, a digital signal output by the modem 9130 can be converted to analog signals by the DAC blocks 9152. The analog signals are then filtered by the low-pass filters 9150 and up-converted to an IF signal by the mixers 9148. The IF signal can be amplified by the IF amplifier 9146 to generate an IF signal 9158. The IF signal 9158 is communicated to the companion chip 9040 via the connection 9006 (e.g., board traces 9124). At the companion chip 9040, the IF signal 9158 is initially amplified by amplifier 9120 within transmitter 9106, and is then up-converted by mixer 9118 using the LO signal 9154 amplified by amplifier 9116. The mixer 9118 generates an RF output signal 9031, which is communicated to the RFEM 9002 via the duplexer 9102 and the coax cable 9042.

In some aspects, the coax cable 9042 can be used for communication of DC power signals (e.g., from the BBS 9004 to the RFEM 9002), control signals and RF data signals that are received or transmitted by the phased array antenna elements 9008. The control signals can include phase adjustment signals, power up signals, power down signals, and other control signals communicated from the BBS 9004 to the RFEM 9002 and/or the companion chip 9040. In some aspects, control signals can include phase adjustment request signals or other data request signals communicated from the RFEM 9002 to the BBS 9004 via the companion chip 9040. In this regard, a direct conversion scheme can be used in connection with a distributed phased array system, where the RFEM and the BBS are coupled via a single coax cable.

In some aspects, the control signal can be used for controlling the RFEM operation (e.g., controlling output power levels, AGC, ON/OFF, etc.). Additionally, the control link between the RFEM and the BBS can be bi-directional, and can be used for BBS-to-RFEM commands and for RFEM-to-BBS telemetry transfer (e.g., PA power detectors reading, ACK after a control command reception, temperature detector reading, etc.).

Figure 92:
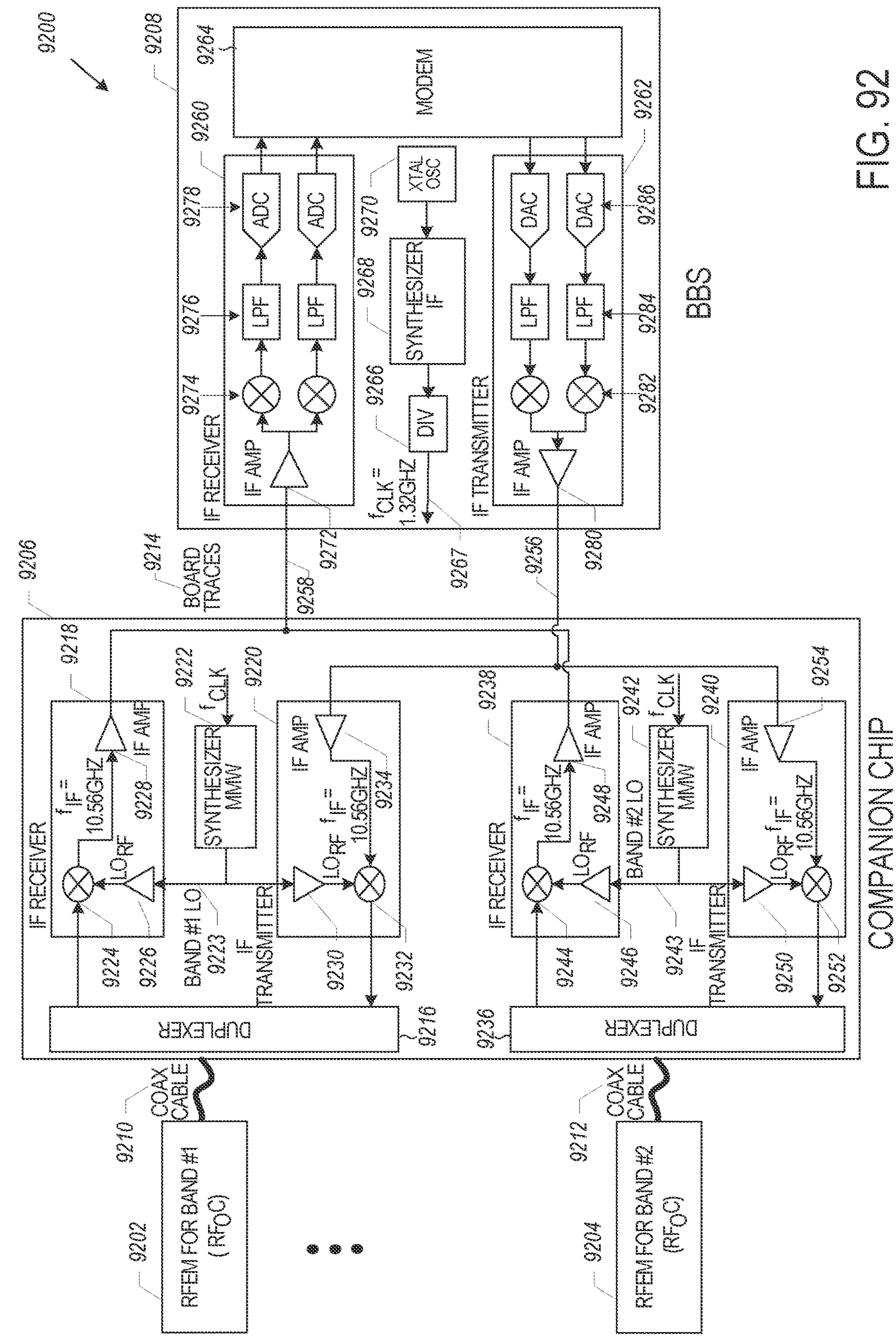

FIG. 92 illustrates a multi-band distributed phased array system with IF processing within the companion chip according to some aspects. Referring to FIG. 92, the distributed phased array communication system 9200 can be used to implement a multi-band system. More specifically, multiple RFEMs (9202, . . . , 9204) can be used with a single companion chip 9206 and a single BBS 9208, with each RFEM including a phased antenna array for processing wireless signals in a specific communication band. The RFEMs 9202, . . . , 9204 can be coupled to the companion chip 9206 via corresponding single coax cables 9210, . . . , 9212.

Referring to FIG. 92, the companion chip 9206 can include multiple processing chains, each chain being associated with a separate RFEM. More specifically, a first processing chain within the companion chip 9206 can be associated with the RFEM 9202 and can include duplexer 9216, IF receiver 9218, LO generator 9222, and IF transmitter 9220. A second processing chain within the companion chip 9206 can be associated with the RFEM 9204 and can include duplexer 9236, IF receiver 9238, LO generator 9242, and IF transmitter 9240.

The BBS 9208 can include a receiver 9260, a transmitter 9262, a modem 9264, an oscillator 9270, a synthesizer 9268, and a divider 9266. The synthesizer 9268 may include suitable circuitry, logic, interfaces and/or code and can use a signal from the crystal oscillator 9270 to generate clock signals. In some aspects, the synthesizer 9268 can generate an LO signal used by the mixers 9274 to down-convert an IF signal 9258, or used by the mixers 9282 to up-convert a baseband signal into an IF signal for amplification by amplifier 9280. In some aspects, the synthesizer 9268 can generate an LO signal, which can be divided by divider 9266 to generate a clock reference signal 9267. The clock reference signal can be communicated via the board traces 9214 to the companion chip 9206 for use by the synthesizer's 9222 and 9242 in generating the corresponding LO signals 9223 and 9243.

The receiver 9260 can include an IF amplifier 9272, mixers 9274, filters (e.g., low-pass filters) 9276, and analog-to-digital conversion (ADC) blocks 9278. The transmitter

9262 can include digital-to-analog conversion (DAC) blocks 9286, filters 9284, mixers 9282, and an IF amplifier 9280.

In an example receive operation associated with RFEM 9202, an RF signal is received at the companion chip 9206 from the RFEM 9202 via the coax cable 9210 and the duplexer 9216. The received RF signal is down-converted to an IF signal by the mixer 9224 using an LO signal 9223 generated by synthesizer 9222. The IF signal is amplified by IF amplifier 9228. The amplified IF signal 9258 is transmitted to the BBS 9208 via the board traces 9214 for further processing by the receiver 9260. At the receiver 9260, the IF signal 9258 is initially amplified by amplifier 9272, and down-converted to baseband signals by the mixers 9274 using an LO signal generated by the synthesizer 9268. The baseband signal is then filtered by low-pass filters 9276, and converted to a digital signal by the ADC blocks 9278 before being processed by the modem 9264.

In an example transmit operation associated with RFEM 9202, a digital signal output by the modem 9264 can be converted to analog signals by the DAC blocks 9286. The analog signals are then filtered by the low-pass filters 9284 and then up-converted to an IF signal by the mixers 9282 using an LO signal generated by the synthesizer 9268. The IF signal can be amplified by the IF amplifier 8926 to generate an amplified IF signal 9256. The IF signal 9256 is communicated to the companion chip 9206 via the board traces 9214, for further processing by the IF transmitter 9220. Within the transmitter 9220, the IF signal 9256 is amplified by amplifier 9234 and up-converted to an RF signal by mixer 9232 using LO signal 9223 amplified by amplifier 9230. The RF signal is communicated to RFEM 9202 via the duplexer 9216 and the coax cable 9210, for further processing and transmission by the RFEM antenna array. In some aspects, TX/RX switches can be used in both the companion chip 9206 and the BBS 9208 so that a single set of board traces can be used to communicate a single signal (which can be a combined signal) at any given time.

In an example receive operation associated with RFEM 9204, an RF signal is received at the companion chip 9206 from the RFEM 9204 via the coax cable 9212 and the duplexer 9236. The received RF signal is down-converted to an IF signal by the mixer 9244 using an LO signal 9243 generated by the synthesizer 9242. The IF signal is amplified by IF amplifier 9248. The amplified IF signal 9258 is transmitted to the BBS 9208 via the board traces 9214 for further processing by the receiver 9260. At the receiver 9260, the IF signal 9258 is initially amplified by amplifier 9272, and down-converted to baseband signals by the mixers 9274 using an LO signal generated by the synthesizer 9268. The baseband signal is then filtered by low-pass filters 9276, and converted to a digital signal by the ADC blocks 9278 before being processed by the modem 9264.

In an example transmit operation associated with RFEM 9202, a digital signal output by the modem 9264 can be converted to analog signals by the DAC blocks 9286. The analog signals are then filtered by the low-pass filters 9284 and then up-converted to an IF signal by the mixers 9282 using an LO signal generated by the synthesizer 9268. The IF signal can be amplified by the IF amplifier 8926 to generate an amplified IF signal 9256. The IF signal 9256 is communicated to the companion chip 9206 via the board traces 9214, for further processing by the IF transmitter 9240. Within the transmitter 9240, the IF signal 9256 is amplified by amplifier 9254 and up-converted to an RF signal by mixer 9252 using LO signal 9243 amplified by amplifier 9250. The RF signal is communicated to RFEM 9204 via the duplexer 9236 and the coax cable 9212, for further processing and transmission by the RFEM antenna array.

Even though the companion chip 9206 is illustrated in FIG. 92 as having only two duplexers and two separate processing chains (with a receiver and a transmitter in each processing chain) associated with RFEMs 9202 and 9204, the disclosure is not limited in this regard. More specifically, the companion chip 9206 can include additional processing chains for processing signals in other wireless bands serviced by additional RFEMs.

Even though FIGS. 91-92 discuss sub-systems 9108, 9134, 9222, 9242, and 9268 as LO generators, these sub-systems can also include other types of frequency sources (e.g., frequency multipliers, etc.).

Even though FIGS. 83-92 illustrate a direct connection between triplexers (or duplexers) and receiver and/or transmitter and/or frequency sources, the disclosure is not limited in this regard and corresponding TX/RX switches may be used so that one only combined signal can be communicated to the triplexres (or duplexers). For example and in reference to FIG. 83, there can be a TX/RX switch between the triplexer 8348 and the LO generator (or frequency source) 8344, allowing for only TX or RX signals to be communicated at any single time via the triplexers 8348. Similar TX/RX switches can be used in connection with triplexres/duplexers 8402, 8550, 8636, 8702, 8836, 8902, 8906, 9036, 9102, 9216, and 9236.

RF communication systems often times utilize sub-systems (e.g., voltage controlled oscillators (VCOs), power amplifiers, transceivers, modems, and so forth) that are formed on a semiconductor die. However, on-chip integrated devices can include metal stacks and metal stacks associated with any process node, especially advanced process nodes, have poor quality factors associated with their passive elements. In this regard, overall power combining efficiency, especially for large-scale power combiners implemented on chip, can be low.

Figure 93:
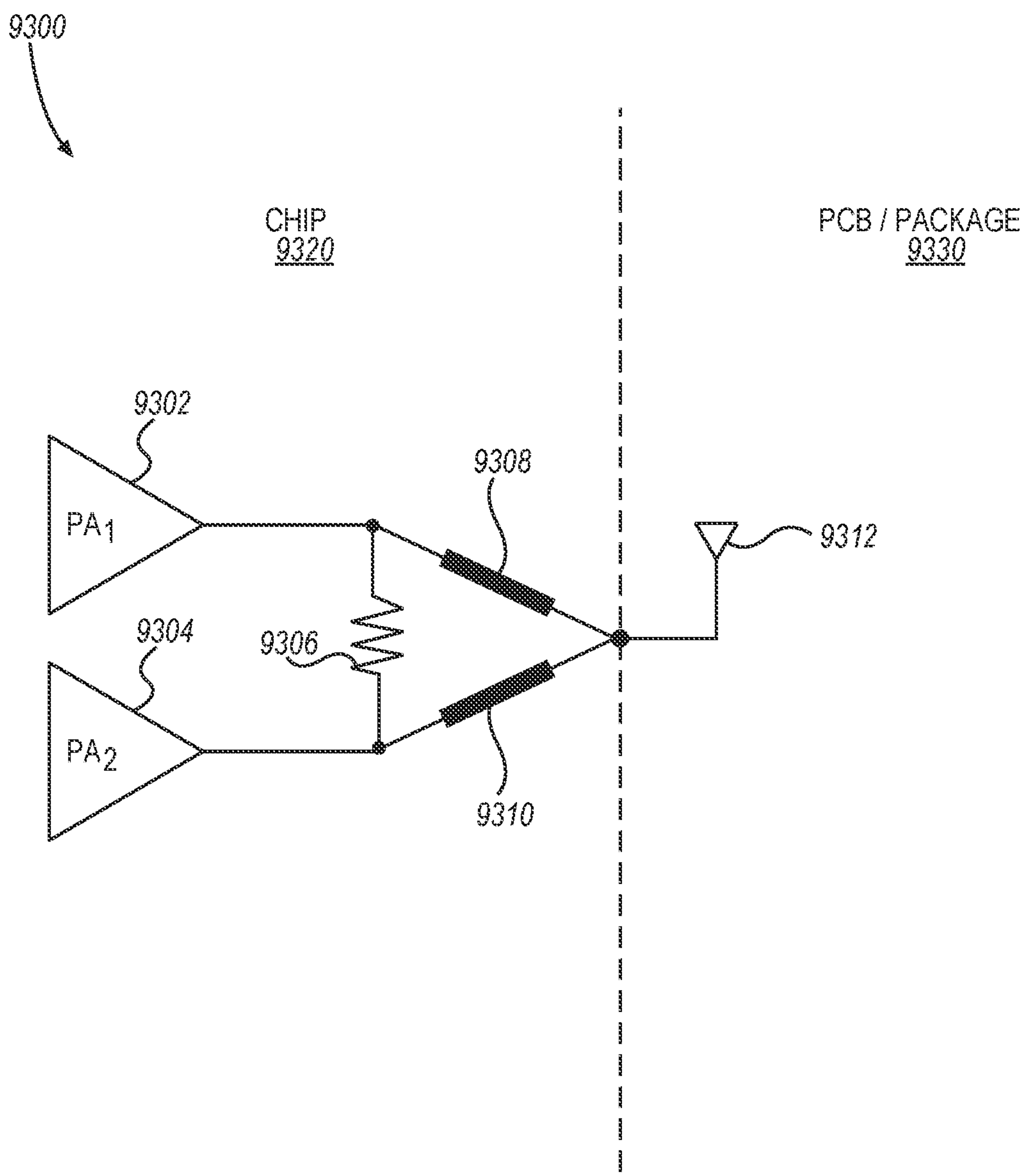

FIG. 93 illustrates an exemplary on-chip implementation of a two-way power combiner according to some aspects. Referring to FIG. 93, there is illustrated a two-way power combiner 9300, which can include power amplifiers 9302 and 9304 coupled to a resistor 9306. The two-way power combiner may be incorporated in the RF circuitry 325 of mmWave communication circuitry 300 shown in FIG. 3A, although the two-way power combiner 9300 is not limited to such. Additionally, power amplifier 9302 is coupled to a transmission line 9308 and power amplifier 9304 is coupled to a transmission line 9310. The transmission lines 9308 and 9310 can be quarter wavelength transmission lines. The outputs of both transmission lines 9308 and 9310 can be combined together and terminate at antenna 9312. As seen in FIG. 93, the two-way power combiner 9300 is entirely implemented within a semiconductor die, or chip 9320. The chip 9320 can be packaged together with a PCB substrate 9330. The antenna 9312 can be implemented on the PCB substrate 9330, and can include a phased antenna array, for example.

FIG. 94 illustrates an exemplary on-chip implementation of a large scale power combiner according to some aspects. Referring to FIG. 94, there is illustrated a power combiner 9412 coupled to a plurality of power amplifiers 9406, 9408, . . . , 9410. The power amplifier outputs can be coupled to inputs of the power combiner 9412. The power combiner 9412 can be coupled to more than two power amplifiers and, therefore, can be referred to as a large-scale power combiner.

The power combiner 9412 can include cascading connections of transmission lines and resistances in a plurality of combining stages, with a decreasing number of outputs (the last combining stage having a single output). For example, power amplifiers 9406 and 9408 can be coupled to transmission lines 9414 and 9416, respectively. The outputs of the power amplifiers 9406 and 9408 can be coupled by resistance 9436. The outputs of the transmission lines 9414 and 9416 are combined into a single output 9422, which is communicated to a subsequent combining stage. Similarly, power amplifier 9410 and a neighboring power amplifier (not illustrated in FIG. 94) are coupled to transmission lines 9418 and 9420, as well as resistance 9438. The outputs of transmission lines 9418 and 9420 are combined into a single output 9424, which is communicated to the subsequent combining stage.

This process of combining outputs of previous stages and generating a decreasing number of inputs to subsequent combining stages continues until the last two transmission lines 9426 and 9428. The inputs to transmission lines 9426 and 9428 are coupled via resistance 9440, and the outputs of transmission lines 9426 and 9428 are combined into a single output 9430 of the power combiner 9412. The output signal 9430 of the power combiner 9412 is communicated to antenna 9434 via a connection terminal 9432. As seen in FIG. 94, the power amplifiers 9406-9410 and the power combiner 9412 are implemented within a semiconductor die, or chip 9402. The chip 9402 can be packaged together with a PCB substrate 9404. In some aspects, the connection terminal 9432 can be one of a plurality of solder balls used to connect the chip 9402 with the PCB substrate 9404.

FIG. 95 illustrates an exemplary on-chip implementation of an impedance transformation network according to some aspects. Referring to FIG. 95, there is illustrated a power amplifier 9506 coupled to an antenna 9512 via an impedance transformation network 9508. The impedance transformation network 9508 may include suitable circuitry, logic, interfaces and/or code and can be configured to match an impedance at the output of the power amplifier 9506 with an impedance at the input of the antenna 9512. The impedance transformation network 9508 can be coupled to the antenna 9512 via a connection terminal 9510.

In some aspects, the connection terminal 9510 can be used for coupling testing or measurement equipment to the power amplifier 9506. Testing or measurement equipment can be associated with a 50 ohm resistance, which may be too high for the power amplifier 9506. The impedance transformation network 9508 can be used to couple the power amplifier 9506 and the testing equipment at connection terminal 9510 and adjust the impedance accordingly. As seen in FIG. 95, the power amplifier 9506 and the impedance transformation network 9508 are implemented within a semiconductor die, or chip 9502. The chip 9502 can be packaged together with a PCB substrate 9504. In some aspects, the connection terminal 9510 can be one of a plurality of solder balls used to connect the chip 9502 with the PCB substrate 9504.

As seen in FIG. 93, FIG. 94, and FIG. 95, power amplifiers, power combiners, and impedance transformation networks are implemented on chip. However, on-chip power combining and impedance transformation can be lossy due to poor quality of passives and lossy silicon substrate, degrading overall transmission efficiency. Such losses can increase quickly with higher levels of combining and/or steep impedance transformations. Lossy power combining and impedance transformation can be further exacerbated for advanced technology nodes with poor silicon metallization. In some aspects, lossy power combining and impedance transformation can be improved by implementing power combining an impedance transformation networks on the PCB substrate associated with the semiconductor die. In this regard, on package losses can be significantly lowered for power combining. This can provide significant efficiency enhancements and can be well-suited for large-scale power combining, especially for architectures using quarter wave transmission lines or multiple transmission lines. Example aspects where impedance transformation networks and power combining are implemented on the PCB substrate are illustrated herein below in reference to FIG. 96, FIG. 97, FIG. 98, and FIG. 99.

FIG. 96 illustrates an exemplary on-package implementation of a two-way power combiner according to some aspects. Referring to FIG. 96, there is illustrated a two-way power combiner 9600, which can include power amplifiers 9602 and 9604 coupled to a resistor 9606. Additionally, power amplifier 9602 is coupled to a transmission line 9608, and power amplifier 9604 is coupled to a transmission line 9610. The transmission lines 9608 and 9610 can be quarter wavelength transmission lines. The outputs of both transmission lines 9608 and 9610 can be combined together and terminate at antenna 9612.

As seen in FIG. 96, the power amplifiers 9602 and 9604 can be implemented within a semiconductor die, or chip 9620. The chip 9620 can be packaged together with a PCB substrate 9630. The resistor 9606, the transmission lines 9608 and 9610, and antenna 9312 can be implemented on the PCB substrate 9630. The transmission lines 9608 and 9610 and the resistor 9606 can be coupled to the power amplifiers 9602 and 9604 via connection terminals 9614 and 9616. In some aspects, the connection terminals 9614 and 9616 can be one of a plurality of solder balls used to connect the chip 9620 with the PCB substrate 9630.

FIG. 97 illustrates an exemplary on-package implementation of a large scale power combiner according to some aspects. Referring to FIG. 97, there is illustrated a power combiner 9712 coupled to a plurality of power amplifiers 9706, 9708, . . . , 9710. The power amplifier outputs can be coupled to inputs of the power combiner 9712. The power combiner 9712 can be coupled to more than two power amplifiers and, therefore, can be referred to as a large-scale power combiner. In some aspects, the power combiner 9712 can be a N:1 RF power combiner.

The power combiner 9712 can include cascading connections of transmission lines and resistances in a plurality of combining stages, with a decreasing number of outputs (the last combining stage having a single output). For example, power amplifiers 9706 and 9708 can be coupled to transmission lines 9714 and 9716, respectively. The outputs of the power amplifiers 9706 and 9708 can be coupled by resistance 9740. The outputs of the transmission lines 9714 and 9716 are combined into a single output 9722, which is communicated to a subsequent combining stage. Similarly, power amplifier 9710 and a neighboring power amplifier (not illustrated in FIG. 97) are coupled to transmission lines 9718 and 9720, as well as resistance 9742. The outputs of transmission lines 9718 and 9720 are combined into a single output 9724, which is communicated to the subsequent combining stage.

This process of combining outputs of previous stages and generating a decreasing number of inputs two subsequent combining stages continues until the last two transmission lines 9726 and 9728. The inputs to transmission lines 9726 and 9728 are coupled via resistance 9744, and the outputs of transmission lines 9726 and 9728 are combined into a single output 9730 of the power combiner 9712. The output signal 9730 of the power combiner 9712 is communicated to antenna 9732.

As seen in FIG. 94, the power amplifiers 9706-9710 are implemented within a semiconductor die, or chip 9702. The chip 9702 can be packaged together with a PCB substrate 9704. The outputs of power amplifiers 9706-9710 can be coupled to corresponding transmission lines of the power combiner 9712 via connection terminal's 9734, 9736, . . . , 9738. In some aspects, the connection terminals 9734-9738 can be a plurality of solder balls used to connect the chip 9702 with the PCB substrate 9704.

In some aspects, the power combiner 9712, the power amplifiers 9706-9710, and/or the antenna 9732 can be part of a wireless transceiver. The wireless transceiver can be used to receive and transmit signals compliant with one or more wireless protocols, such as Wireless Gigabit Alliance (WiGig) protocol or a 5G protocol.

FIG. 98 illustrates an exemplary on-package implementation of an impedance transformation network according to some aspects. Referring to FIG. 98, there is illustrated a power amplifier 9806 coupled to an antenna 9812 via an impedance transformation network 9808. The impedance transformation network 9808 may include suitable circuitry, logic, interfaces and/or code and can be configured to match an impedance at the output of the power amplifier 9806 with an impedance at the input of the antenna 9812. The impedance transformation network 9808 can be coupled to the power amplifier 9806 via a connection terminal 9810. In some aspects, the connection terminal 9810 can be used for coupling testing or measurement equipment to the power amplifier 9806. Testing or measurement equipment can be associated with a 50 ohm resistance, which may be too high for the power amplifier 9806. The impedance transformation network 9808 can be used to couple the power amplifier 9806 and the testing equipment at connection terminal 9810 and adjust the impedance accordingly.

As seen in FIG. 98, the power amplifier 9806 is implemented within a semiconductor die, or chip 9802. The chip 9802 can be packaged together with a PCB substrate 9804. The impedance transformation network 9808 and the antenna 9812 can be implemented within the PCB substrate 9804. In some aspects, the connection terminal 9810 can be one of a plurality of solder balls used to connect the chip 9802 with the PCB substrate 9804.

FIG. 99 illustrates an exemplary on-package implementation of a Doherty power amplifier according to some aspects. Referring to FIG. 99, the Doherty power amplifier 9900 can include a carrier power amplifier 9906 and a peaking power amplifier 9908. A signal input terminal 9922 can be directly coupled to an input of the carrier power amplifier 9906. The signal input terminal 9922 can also be coupled to an input of the peaking power amplifier 9908 via a quarter wavelength transmission line 9910. An output of the carrier power amplifier 9906 can be coupled to the antenna 9920 via offset transmission line 9912 as well as quarter wavelength transmission lines 9916 and 9918. The output of the peaking amplifier 9908 can be coupled to the antenna 9920 via an offset transmission line 9914 and a quarter wavelength transmission line 9918. A combined output signal 9924 at the output of the transmission line 9918 can be communicated to antenna 9920 for transmission.

As seen in FIG. 99, the carrier power amplifier 9906, the peaking power amplifier 9908, and the quarter wavelength transmission line 9910 can be implemented within a semiconductor die, or chip 9902. The chip 9902 can be packaged together with a PCB substrate 9904. Transmission lines 9912, 9914, 9916, and 9918, as well as antenna 9920, can be implemented within the PCB substrate 9904. In this regard, by implementing multiple long transmission lines on the PCB substrate 9904, the efficiency of the Doherty power amplifier 9900 can be improved.

Microwave antenna sub-systems that operate in the mmWave frequency range are extremely small, in the micron range. Consequently it is important to discover ways to reduce the size of antennas and of radio sub-systems, particularly thickness, for use in mobile devices where space is at a premium because of chassis size requirements and because of the dense packaging of components and antennas. At the same time, thermal, electrical and mechanical overlay issues should be addressed and reduced. Cost improvement is also a major consideration. The overlay of components, antennas and antenna sub-systems on top of each other will reduce both size and thickness of the sub-system. Use of overmold with interconnects in overmold is another concept that will allow antennas to be located on the sides of a sub-system, and provide thermal and mechanical improvement over competing technologies.

FIG. 100A is a side view of an unmolded stacked package-on-package embedded die radio system using a connector, according to some aspects. The embedded die radio system may be incorporated in the antenna array circuitry 330 of mmWave communication circuitry 300 shown in FIG. 3A, although the embedded die radio system is not limited to such. The aspect includes unmolded stacked package-on-package embedded die 10000 including unmolded package 10005 and package 10007. Package 10005 may include a laminated structure such as a PCB, within which is embedded RFIC 10006. As used in this context, "unmolded" means that the die 10006 is not enveloped in a mold or encapsulate. The dimensions illustrated for the z-height of the various parts of the packages are for example purposes only, and serve to illustrate the extremely small dimensions that are worked with when volume of a mobile device in which the packages find use is very restricted.

In addition, the first few microns at the top and bottom of PCB 10005 can be pre-impregnation (PrePreg) layers which may be before the core of the PCB within which the RFIC is embedded. PrePreg can be used thanks to its very thin thickness. The PrePreg can be very thin, for example 25 um or 30 um. PrePreg may be an epoxy material, although it can also be a laminate material, for example Copper Clad Laminate (CCL). The technology is not limited to organic polymer based laminates but also ceramic based inorganic layers.

As used in the antenna substrate industry, "core" can mean the internal part of a substrate that is thicker than, and that can be more rigid than, other areas of the substrate, such as PrePreg. Package 10005 is unmolded in that it is a laminar substrate such as a PCB with no encapsulate within the package. Shield 10001 is on top of package 10005 to shield components 10003 from RFI/EMI. Connector 10023 may connect one or more of the packages to the outside world. In some aspects connector 10023 provides intermediate frequency (IF) signals for transmission by the system. Package 10005 includes RFIC die 10006 which provides feeding for the various antennas and antenna arrays, discussed below, by way of traces and vias as appropriate, according to some aspects.

While one RFIC die 10006 is illustrated, those of ordinary skill in the art would recognize that more than one RFIC die can be provided, to operate in one or more frequency bands. In other words there may be at least one RFIC die in aspects.

The packages illustrated can include antennas and antenna arrays of many different configurations, frequencies of operation, and bandwidths, according to some aspects. In FIG. 100A antenna structures 10009, 10011, 10013, 10015, and 10019 are illustrated. These can be single antennas in side view, or antenna arrays, such as 1×N, 2×N, . . . , N×N element arrays looking into the page of the figure. In one example, antenna 10009 can be a dual patch antenna with a distance d2, in this aspect of 10065 microns between patch antenna elements 10010 and 10012, and another dimension dl between patch antenna element 10010 and ground. Depending on the distances d1 and d2, the bandwidth of the antenna will vary because of the varying volume of the patch antenna. The designation d1 and d2 can be seen more clearly in FIG. 100B.

FIG. 100B is a side view of a dual patch antenna, according to some aspects. In the figure, P1 is a first element of a dual patch antenna and P2 is a second, or driven, element of a dual patch antenna. It is seen that d2 is the distance between P1 and P2 and dl is the distance between P1 and ground plane GND. For a given distance dl between P1 and GND, varying the distance d2 between P1 and P2 increases the volume of the antenna.

In some aspects, the bandwidth varies based on the variation of the volume of the antenna which, in this aspect, is a function of the varying distance d2. This is seen in FIG. 100C. FIG. 100C is a simulated graph of return loss of the dual patch antenna of FIG. 100B as the volume of the antenna is increased, according to some aspects, and illustrates the variation of bandwidth as the volume of the antenna varies. The bandwidth is measured by varying d2 in this aspect. Bandwidth, illustrated as the width of the −10 dB return loss graph in the simulation of FIG. 100C, increases as d2 increases, for a given dl dimension between P1 and GND.

As will be discussed below, the PCB 10005 has a laminar structure illustrated in this aspect as levels L1 through L6. Because of the various levels, the antenna elements such as 10010, 10012 can be placed at various distances d2 between dual patch antenna elements, and because of the multiplicity of levels the distance dl between patch antenna element 10010 and GND can also be set at various distances, resulting in a choice of bandwidths as may be needed for a given design. Stated another way, the distance between dual patch antenna elements 10010 and 10012 is not limited to 10065 microns but can be set at any of several distances because of the densely packed laminate levels available. This is the same with the distance between dual patch antenna element 10010 and ground plane 10014, setting up an ability to measure the bandwidth as illustrated in FIG. 100C. However, the levels L1-L6 are only one of many aspects. Other aspects may have many more very densely packed layers, far more than the six layers L1-L6 illustrated, and these very densely packed layers can be used for various functions as needed.

Continuing with the description of FIG. 100A, 10024 can in some aspects be an antenna or an antenna array such as the 1×N, 2×N, . . . , N×N element arrays discussed briefly above. In some aspects, 10024 can be a self-standing antenna configured by means of a surface mounted device (SMD), which is sometimes called surface mounted technology (SMT). In some aspects, if there is not sufficient height for a needed antenna or antenna array within the PCB 10005, the antenna or antenna array 10010, 10012 can be configured with antenna element 10012 placed on the top of the PCB 10005, for example, to provided needed volume, according to some aspects.

In another example, dual patch antenna element 10012 can be placed on top of surface mounted device 10024 instead of on top of PCB 10005, to provide the antenna or antenna array with additional height which, in some aspects, will provide increased volume and improved bandwidth as discussed above.

Another example can be seen at antenna 10015. In this example, antenna (or antenna array, as discussed above) 10015 includes antenna patch 10018 within the substrate 10005, which, as discussed above, can be a complex and very densely packed substrate, and dual patch element 10017 can be on a second antenna board 10007. In some aspects antenna board 10007 can be a dielectric, a ceramic, a PCB, or the like, which can also be a densely packed laminar substrate much like PCB 10005. Consequently, the antenna function can be apportioned between or among more than one antenna board resulting on a package-on-package configuration. Therefore, if there is not enough z-height on one media, then part of the antenna can be implemented on a second media, such as 10007, to provide the desired z-height in order to obtain the volume to provide the desired parameters such as, in some aspects, bandwidth, lower loss, and the like. In other words, given the extremely small dimensions of the thickness of a substrate due, in some instances, to form factor requirements for operation at mmWave frequencies, antenna elements (and discreet components) can be placed on one or more additional media which, in some aspects, can be placed on top and/or bottom of PCB 10005, on the sides of PCB 10005, and in various additional configurations, resulting in additional substrate thickness and increased bandwidth as needed.

Similarly, antenna functions can likewise be split between or among different antenna boards, for example PCB 10005, which can be considered the main media, and antenna board 10007, which can be considered a secondary media. Further, such media above or below, or in the side of, the substrate can be used for various functions, such as grounding, shielding, feeds, and the like.

Further, there can be more than one medium 10024 on top of PCB 10005. There can be a multiplicity of antenna media on top of the PCB 10005, each providing part or all of the antennas or antenna arrays as discussed above. The same is true of placement of antenna media below or on the side of PCB 10005. Further, the secondary media can be used for parasitic elements in order to improve the gain or shape the pattern of the antennas as needed.

Antennas 10011, 10013, 10015, and 10019 can be other antennas or antenna arrays configured on antenna board 10007 and fed from RFIC die 10006. Also illustrated are vias 10020, 10022. There may be many vias in some aspects. Generally, the thicker the substrate 10005, the greater diameter of the via 10020, 10022. In some aspects where ultra-thin substrates are needed, the vias can be of a much smaller diameter, as discussed below for other aspects. Vias such as 10028 may be connected to the RFIC die 10006 by solder connections such as 10027. The vias may be connected by one or more horizontal layers 10030 for connection to components elsewhere within the radio sub-system, where the horizontal layer 10030 is viewed looking into the page.

FIG. 101A is an illustration of the unmolded stacked package-on-package embedded die radio system using a flex interconnect, according to some aspects. FIG. 101B is a side view of the unmolded stacked package-on-package embedded die radio system using a flex interconnect where the flex interconnect is shown in photographic representation, according to some aspects. FIG. 101A is substantially the same as FIG. 100A with a difference being that there is no connector 10023 in FIG. 101A. Instead flex interconnect 10026 is used to connect one PCB to a second PCB, where the second PCB may have a connector to outside the PCBs. Flex connector 10026 may be connected to the RFIC die 10006 by appropriate internal traces of PCB 10005, or by appropriate internal traces and one or more vias. The flex interconnect may be connected to the PCT by solder, by crimping, or by other processes, and may be similarly connected to the second PCB in some aspects.

FIG. 102 is a side view of a molded stacked package-on-package embedded die radio system, according to some aspects. In FIG. 102 package 10200 includes a substrate including level 10201, such as an antenna board such as a PCB, level 10203, which is a mold or encapsulate, and level 10205 which includes an antenna board such as a PCB, according to some aspects. Levels 10201 may include conductive levels 10207 such as traces; level 10203 may include conductive levels such as 10209 and vias such as 10219, 10219A, often called "through-mold vias"; and level 10205 may include conductive levels 10211 connected by solder connection to conductive levels 10209.

The conductive levels and vias of package 10200 are configurable to feed the various antennas and other components from dies 10206, 10208, in some aspects. Although conductive levels 10207 and 10211 are illustrated as short horizontal layers in FIG. 102, in practice they can be longer conductive layers such as 10309, 10311 in FIG. 103 or in various layer configurations such as 10307, 10311A of FIG. 103, or essentially completely across a substrate such as illustrated at 10502 in substrate 10501, or 10511 in substrate 10505 of FIG. 105, according to various aspects.

In some aspects the conductive levels 10207, 10211 may be made using redistribution layers (RDL) discussed below with respect to FIG. 104. Vias (or through-mold vias in molded packages) may be made by copper studs, by lasers piercing the mold or other layers, and conductive ink, or other means.

Through the use of vias, conductive layers, and/or RDLs, the die(s) are able to connect very quickly to antennas and antenna arrays on any side of the package which, in some aspects may be antennas embodied on or within SMDs 10216, 10218, 10220. Because of densely packed vias, and densely packed horizontal layers, the dies may connect to antennas or antenna arrays on substrates 10201, 10205 with little or essentially no fan-out of the feed structure.

Further, the through-mold vias such as 10219, 10219A may be configured in trenches of densely packed vias connected to metallized layers (only layer 10209 illustrated here, but the top of vias such as 10219 or 10219A may be connected to a metallized layer atop the vias (now shown)) around the die or dies to form a Faraday cage to shield the dies and other components from RFI and EMI, in some aspects. The vias can be very small vias such as single posts. When using package on package with high density interconnects between the packages such as 10219, 10219A (through mold vias), one can build the packages separately and use disparate materials tailored for bottom die versus another die on top or below it. It also improves yield since individual dies can be tested in their respective packages before stacking them.

It is also important to understand that the mold may be eliminated completely if needed and one can replace through mold vias with solder balls that are connected to the top package and act as the vertical interconnect. In the aspect of FIG. 102, two or more dies 10206, 10208 may be included within the substrate and affixed by contacts such as solder bumps which may be copper filler, solder contacts such as 10210, or which may be LGA/VGA pads or, in some aspects, even a package.

Also illustrated are discreet elements 10212, 10214, in some aspects. Dies 10206, 10208 may be any type of die such as flip-chip die, wafer level Chip Scale Package (CSP), wire-bondable die, and the like.

Alternatively, a single die may be used. SMD antennas such as 10216, 10218, 10220 may be configured on a first side of the substrate while SMD antennas 10216A, 10218A, 10220A may be configured on the opposite side of the substrate, in some aspects. In other aspects, the antennas may be configured on the substrate instead of on or within SMDs. The foregoing antennas may be the same type of antennas as those described with respect to FIG. 100A and in some aspects may be on or within SMDs. Further, the antennas 10216, 10218, 10220 may be configured as an antenna array. Further, antennas such as any or all of the foregoing antennas may be embodied on or within an SMD such as discussed with respect to antenna (or antenna arrays) 10024 of FIG. 100A, Also configured on one or both sides (such as 10201, 10205 of the package 10200 may be discreet components 10222, 10224, and 10222A, 10224A. Further, systems 10221, 10221A, sometimes called a system in a package (SIP), or a package, bet may be configured on top (such as atop 10201) and/or on bottom (such as at the bottom of 10205) and/or sides of the package 10200, in some aspects, providing a package-on-package configuration. A SIP 10221, 10221A may be a system much like the package that includes levels 10201, 10203, 10205 that SIPs 10221, 10221A are configured upon. SIPs 10221, 10221A may be stacked on and physically connected to the package in several ways.

Further dies 10206, 10208 may be connected to the substrate 10203 by suitable contacts illustrated at 10226, in some aspects. Such suitable contacts may include copper filler, solder bumps, or even a package. Contacts 10226 may be very small connections within the body of the package-on-package aspect. Such system configurations illustrate package-on package configuration.

Further, one or more dies of each package is configured to operate at the same frequency or at different frequencies, such as one die operating at 5G frequencies and a second die operating at WiGig frequencies, because the density within the packages as described is so high.

Further, the antennas/antenna arrays of the package-on-package aspect may radiate in any of a number of directions, or essentially in every direction, as may be needed, for example, because of the orientation of the mobile device. In other words, antennas, and antenna arrays, can be placed all over a package 10200, meaning in essentially every desired direction of the package by stacking and physically connecting packages 10221, 10221A on the top, bottom, and sides of package 10200, or in combinations thereof, as desired, and in antenna and antenna array configurations on or within packages 10221, 10221A as desired, according to some aspects.

In addition to the foregoing, the package 10200 may be soldered onto yet another board (not shown) by solder balls 10213, 10215, which are illustrated as larger than solder ball or contacts 10226 because while solder balls 10226 are within the package-on-package aspect, and can be very small and very tightly spaced, solder balls 10213, 10215 are connections "to the outside world," according to some aspects.

For example, the board that package 10200 is further soldered onto, by way of solder balls 10213, 10215, may be the host board for a phone, tablet, mobile device, or other end user equipment, according to some aspects. A primary difference between FIGS. 100A and 102 is that the dies of FIG. 102 are enveloped by mold which protects and strengthens the configuration of the dies within the substrate.

An advantage of the molded aspect is that embedded dies in the unmolded substrate of FIG. 100A are difficult to manufacture in high volume. A molded substrate configuration is more compatible to high volume manufacture, due, as discussed above, to improved yield since individual dies can be tested in their respective packages before stacking them.

Additionally, in a molded configuration components like 10212, 10214 can easily be configured within the molded substrate. The embodied die of FIG. 100A is often specific to embedding only a single die, according to some aspects.

Further, the molded configuration allows many more dense layers than the unmolded configuration. In the embedded die of FIG. 100A, every component is connected as one system. If one part, such as one via, fails, the entire system within the substrate fails.

In the molded configuration FIG. 102 on the other hand, the substrate itself can be made separately, the layers connecting the dies can be connected separately, and the system is not connected together until the final step, where the final step may be soldering all parts together. In the aspect of FIG. 100A there is no solder internally, the system being included of copper vias most or all of which may be assembled at the same time. Stated another way, the process of building a molded stacked package is very different from building an unmolded package.

Studs are placed or plated onto the bottom layer of the top package and these can be plated to a high aspect ratio and very small diameters. Then the top and bottom packages are connected using solder or thermo-mechanical compression. The overmold may be liquid, is injected and then flows and covers the gaps. This is a higher density and higher yielding process than an unmolded package.

FIG. 103 is a side view of a molded package-on-package embedded die radio system showing additional detail, according to some aspects. The levels A thought G include the individual component technologies indicated in Table 1, in some aspects.

TABLE 1

| Level | Remark |
|---|---|
| A | SIPS/connectors/SMT Antennas/printed antennas/shields/ conformally molded/partially molded/partially shielded |
| B | 2 L~6 L coreless or core based substrates or RDL layers on top of die |
| C | Mold with vias and trenches |
| D | Die and SMT components |
| E | 2 L-6 L coreless substrate or core based or RDL layers |
| F | Solder or Epoxy |
| G | Antenna board and SMT components |
| H | Stacked package and stacked dipoles and monopoles, top, bottom |

In FIG. 103, element 10326 may be a connector a signal source off the package. Also illustrated is antenna element or antenna array 10324, as the case may be, which may be a surface mounted device antenna or array. Antenna elements include via 10322 that is fed by die 10306 by way of appropriate ones of the illustrated horizontal substrate conductive layers such as 10329. The die, and the vias discussed below, may be encapsulated by mold 10332. Trace or horizontal layers 10329 may be connected to die 10306 (connection not shown) for the purpose of feeding antenna or antenna array 10324 also as discussed in additional detail below.

As mentioned previously, the SMD may be part of an array of antenna elements such as 10322, looking into the page of the drawing, according to some aspects. The density of the horizontal conductive levels and vertical vias, discussed below, enables connection of the die to via 10322 effectively making surface mounted device 10324 essentially a vertical patch antenna in some aspects. The via 10322 including the part within SMD 10324 together provide the desired length for resonance purposes. In some aspects, via 10322 may be a fraction of the antenna length needed for the frequency of operations, and the rest of the needed length may be a trace (not shown) configured on top of the SMD 10324. Needed contact can be achieved using solder, in some aspects. Consequently, antennas 10322, and also 10318, 10320, discussed below, illustrate advantageous use of the z-height of the package as part of an antenna or antenna array.

An easy implementation to manufacture is a vertical monopole or dipole on or within the SMD. Another implementation may be a patch antenna that is plated on edges of the SMD and the mold that have been discussed above. The availability of such dense horizontal conductive layers and vias as illustrated in levels B and E (the conductive layers can be both horizontal to the figure, and also into the page of the drawing of the figure) gives the flexibility of a multiplicity of interconnections, both horizontal and vertical (vertical such as by vias in some aspects), and provides the ability to configure a vertical patch antenna, a vertical meandering antenna, a vertical spiral antenna, and similar antennas, according to some aspects.

Antenna elements (or antenna arrays looking into the page of the drawing) 10318, 10320 may be configured on or within an SMD 10324 and include a through mold via 10322, in some aspects. Several such through mold vias are illustrated in the drawing, only one of which is enumerated, here as 10325. In FIG. 103, element 10325 may be a solder ball or other conductive element such as a plated stud that the mold fills around the configuration. Via 10325 may be part of an antenna element such as connected vias 10321, 10323, 10325, 10327, where via 10321 is within SMD 10320 and may, in some aspects, have a trace substantially perpendicular to vias 10321, 10323, 10325, 10327 depending on the need for additional antenna length for resonance purposes.

The antenna(s) may be connected by a horizontal conductive layer 10331 to die 10306 (connection not shown but in practice 10331 may be a connection to die 10306). Discreet elements 10328 may be included and may be shielded from RFI/EMI by shield 10330, in some aspects. Antennas or antenna array 10318 are similar to or the same as shown at 10320, and may be connected to the die in a manner similar to that discussed for 10320. Similarly, items 10318A, 10320A, are SMD antennas similar to 10318, 10320, and may be fed by die 10306 in a similar manner as SMD antennas 10318, 10320. In some aspects, items 10318, 10320, 10324 may be configured on antenna boards (not shown) as antenna arrays, looking into the page of the figure. The same situation can apply to SMDs 10318A, 10320A. Consequently, the combination Levels B, C, and E of FIG. 103, and antenna boards on which 10318, 10320, 10324 are configured, in accordance with the aspect under discussion, include a package-on-package configuration. In some aspects the above antenna elements may proceed through the relevant one of the antenna boards into or through the SMD 10318, 10320, 10324, or 10318', 10320', 10324', as the case may be.

FIG. 104 is a side view of a package-on-package embedded die radio system using redistribution layers, according to some aspects. Substrate 10400 includes alphabetized levels A through F, each of which may include the material and/or components indicated in Table 2 below, some or all of which may be in various aspects, according to the design at hand.

TABLE 2

| Level | Remark |
|---|---|
| A | SIPS/connectors/SMT Antennas/printed antennas/shields/ conformally molded/partially molded/partially shielded |
| B | Levels 2 L~6 L coreless |
| C | Mold with vias and trenches |
| D | Die and SMT components + Redistribution Layer (RDL) on top and RDL on bottom (only RDL on bottom and above shown) |
| E | Solder joints |
| F | Antenna and BGA and SMT components |
| G | Stacked package and stacked dipoles and monopoles |

Substrate 10400 includes at least one embedded die 10406 in level D, which may be wafer level packaging, with very thin conductive layers to redistribute signals from the die to multiple packages in some aspects. Such very thin conductive layers used for redistribution may be called redistribution layers (RDL). Further, for example on top of substrate 10419, one or more antennas may be on or within one or more surface mounted devices such as 10416 and fed from die 10406 through the interconnects 10421, 10423, 10425 and vias (not shown) available in the substrate, as discussed above, as well by the RDLs that in some aspects may connect with such vias.

Die 10406 may be encapsulated by mold 10418, for example, by a flow process as discussed above. Various antennas may be on or within level A as discussed above with respect to other figures. Level A may also be used for SIPs to result in a package-on-package system, according to some aspects. Further, discreet components 10428 may be on or within level A and may be shielded from RFI/EMI by shield 10430 as may be desired, in some aspects. Other components such as 10432 may not require shielding and may be outside of any shield that may be provided in an aspect.

Additionally, redistribution layers (RDL), which make connections available at different layers, are seen in the figure. Two of the RDLs are illustrated at 10407, 10409, but as Table 2 indicates, they can be at top and bottom of layer D, and in numbers as desired, in some aspects. Horizontal layers such as 10415 are seen in the mold Level D with very high density and, as explained above, may provide additional connectivity between layers and connectivity with the die 10406, in some aspects.

Further, the RLDs may provide vertical connectivity between horizontal layers as at 10413-10413' where 10413 is a vertical connection of the RDL. In this regard, the aspect enables placing conductive horizontal layers such as 10413' in the mold at very high density.

The RDLs may be printed directly on the silicon die, shown for example at 10410, in some aspects, which makes them ultra high density for redistribution of signals from the die 10306 to antennas on antenna arrays. In the RDL configuration described there need not be bumps of solder ball vias such as 10325 of FIG. 103. The die 10406 is left as is, and RDLs are used for signal distribution, which provides a major advantage.

Redistribution layers may be made using polymer and material that is spin coated on top of each other and are very thin. This allows very fine pitch vias and very fine via diameters. The RDLs, such as 10407, 10409 may be soldered via solder LGA/VGA pads, or other solder contacts 10440, 10442, . . . , 10440, to antenna board 10412, in some aspects. Antenna board 10412 may be part of another substrate and is stacked upon and physically connected to substrate 10400 in a package-on-package configuration. While no antennas are illustrated on antenna board 10412, such antennas may be similar to the antennas on package 10007 of FIG. 100A and antennas 10216', 10218', 10220' of FIG. 102, and antennas of other figures.

FIG. 105 is a side view of a molded stacked package-on-package embedded die radio system with recesses in the molded layers to gain height in the z-direction, according to some aspects. Substrate 10500 of FIG. 105 is similar to package 10200 of FIG. 102.

In some aspects, materials 10501, 10503, 10505 may be the same or similar to materials 10201, 10203, 10205 in FIG. 102. Antennas 10516, 10516', 10516" and discreet components 10528, 10528' may be configured on or within a first parallel layer of layer 10501, which may be a substrate layer. Similarly antennas and discreet components may be configured on or within a third parallel layer 10505, which may be a substrate layer. In some aspects, SIP 10521 may be in physical contact with and connected to level 10505, the combination of levels 10501, 10503, 10505 and SIP 10521 including a package-on-package configuration.

Densely packed conductive horizontal layers, two of which are enumerated 10510, 10512, may be configured in layers 10501, 10505. However, unlike FIG. 102, there may be no or few conductive horizontal layers in mold layer 10503, according to some aspects. FIG. 105 illustrates connector 10526 which, in some aspects, may be placed in a recess 10527 in material 10501 to adjust z-height as may be needed in some aspects. FIG. 105 illustrates a single die 10506, instead of multiple dies 10206, 10208 of FIG. 102, according to the aspect under discussion. Those of ordinary skill in the art would recognize that some or all of the components of FIG. 102 and FIG. 105 may be present in any given aspect, according to the requirements of the solution desired, and that some aspects may include a plurality of embedded dies. Mold 10524 may encapsulate die 10506 and vias 10514. No, or few, horizontal interconnection layers are in the mold. Interconnection may be by RDLs (not shown in FIG. 105 but as illustrated in FIG. 103 in some aspects.)

FIG. 106 is a side view of the molded stacked package-on-package embedded die radio system. As discussed above, vias such as 10606 may surround the die as a trench and provide Faraday cage shielding. If additional shielding is desired, or if vias may not be available in dense enough form, a mechanical shield 10602 may be include for RFI/EMI shielding and for heat spreading, according to some aspects. Molded substrate 10600 of FIG. 106 includes mold 10624 and materials 10601, 10603, 10605 that are similar to or the same as materials 10501, 10503, 10505 of FIG. 105. Mechanical shield 10602 may be soldered to the package, according to some aspects. The soldered shield illustrates the ability to solder within the core of the substrate that will ultimately be encapsulated in a mold, the solder function being a function that is difficult for mass manufacturing in an unmolded shield. Die 10606 is soldered by solder balls 10608 to the "roof" surface of the volume 10603 that will ultimately be encapsulated by a mold material, according to some aspects.

FIG. 107 is a perspective view of a stacked ultra-thin system in a package radio system with laterally placed antennas or antenna arrays, according to some aspects. Estimated parameters of one aspect of the system of FIG. 107 are seen in Table 3 below, for some aspects.

TABLE 3

| 2 Sided radiation |
|---|
| PCB area = 50 mm$^2$ |
| Z-Height = 1.25 mm |
| Z height breakdown |
| 4 L-6 L BT PCB |
| 300 um SMT Antennas on TOP and BOTTOM |
| Cu-Pillar or soldered bump |
| Reducing Z-height is a function of: |
| BOM selection (Including RF Connector) |
| PCB thickness (200 um → 4 L) |
| Si thickness (100 um -→ Safe for integration) |
| Mechanical Shield (low risk) |
| Use A.FL connector if IR drop is better and no disadvantage |
| Thermal Low |
| # of Antenna elements: |
| Top |
| Bottom |
| Sides |

In FIG. 107, package 10700 includes an ultra-thin application including a shielded die 10706, shielded by mechanical shield 10709 below the substrate 10701, 10703, 10705, sometimes called a coreless substrate. In some aspects, coreless substrates use only PrePregs that are laminate on a sacrificial material during manufacturing. Hence the rigidity is present because of a rigid sacrificial material. In core based substrates, discussed above, the core (which is not sacrificial) provides the rigidity and hence is thicker.

As used in this context "coreless" means a very thin substrate, unlike a core (which includes a much thicker substrate). Material 10701, 10703, 10705 may form layers of a coreless or core based substrate. Material 10704 is thicker because antennas need more volume for performance. In some aspects materials 10701, 10703, 10705 may be ultra-thin PrePregs, according to some aspects.

A Package 10700 further may include connector 10707 and components 10710, which are shielded by mechanical shield 10708 in some aspects. The elements on top and bottom of the substrate take up most of the Z-dimension and the X-dimension such that in the aspect under discussion there is little room for placement of antennas. Consequently, antennas may be located laterally as at 10702, according to some aspects, on both sides of the substrate by use of antenna boards 10704, 10704', which may be surface mounted devices, according to some aspects.

The antennas may be an antenna array including antenna elements 10714-10714', 10716-10716', and 10718-10718' configured on SMD 10704 above the substrate, and antenna an antenna array including antenna elements 10722-10722', 10724-10724', and 10726-10726' configured on SMD 10704' below the substrate. Placing the antennas adjacent an ultra-then substrate provides additional room for X-Y and Z dimensions, which increases volume, leading to better bandwidth and gain and less loss, as discussed above.

While 2×4 arrays are illustrated, those of ordinary skill in the art would understand that an N×M array may be configured on top, bottom or sides of the substrate, according to the desired solution. In some aspects, when antenna arrays are located on top, bottom and along the sides of the SMD, radiation direction may be controlled in any of a number of directions depending on algorithmic control of antenna firing and antenna polarity.

Examples of an ultra-thin application could be antennas needed for very thin regions, like GOOGLE™ GLASS™, a thin head set, a very thin tablet, and the like, where available real estate may be so thin that it may be highly unlikely that the available real estate will be used for antennas. In such an environment, antennas could be placed adjacent the package as discussed above, and could yield an omnidirectional antenna, not only due to antenna type or placement, but also because of the sequence of firing of the antennas.

The antennas and the arrays would be fed by die 10706, and an additional advantage of the ultra-thin coreless substrate is that for thinner materials higher density lines and vias can be used (not shown due to space limitations) as illustrated and discussed above. For example, thick materials usually require a larger via because of the thickness that has to be traversed, as can be seen by vias 10020 and 10022 of FIG. 100A, and vias 10219, 10219' of FIG. 102. On the other hand, nearly hair size diameter vias can be embodied in ultra-thin coreless substrates because of the much shorter distances needed to be traversed by the via.

FIGS. 108A through 108C illustrate an embedded die package, according to some aspects. When working at Wi-Fi frequencies, such as 2.4 GHz, 3.6 GHz, 4.9 GHz, 5 GHz, and 5.9 GHz frequency bands, dimensions of the die, feedlines, and antennas will be much larger than when operating at WiGig or 5G mmWave frequency bands in the sixty GHz or other WiGig ranges discussed above. Power losses sustained by dimensions or feedlines at Wi-Fi frequencies become very substantially greater, and in some aspects essentially intolerable, when operating at WiGig or 5G mmWave frequencies.

Consequently, reducing the size of the die substantially by incorporating into the die primarily only the electronic functions needed for a small group of "dedicated" antenna arrays located very close to the reduced function die can result in very short feed line interconnects and therefore less power loss. In other words, the size and shape of the die would be set primarily by the number, and the electronic signal requirements, of dedicated antennas the die services. In some aspects the electronic signal requirements may include signals at one or more polarities, signals in one or more frequency ranges, signals of one or more amplitudes, or signals of a given power, among other signal parameters.

As mentioned, this reduced function enables reduction in size of the die, which in turn enables the die to be placed very, very close to the dedicated antenna, or group of antennas, that use those electronic signals. This results in shorter feedline routing and commensurately lower power loss. In some aspects a large die is reduced to a series very small dies each of which then feeds a dedicated antenna or dedicated antenna array on top and/or bottom of a substrate, resulting in very close, and therefore very short and low-loss interconnects. In some aspects, this can be done by embedding the die in a substrate at a location of the substrate that is physically very close to the antenna arrays that use the limited electronic function of the die.

One such aspect is seen in FIG. 108A wherein a plurality of dies are embedded in a substrate above and below the antennas that use the respective functions of the particular dies, according to some aspects. In FIG. 108A die 10809 and associated discreet components such as at 10810 are embedded in package 10801, according to some aspects. Antennas 10803 and 10811 are configured at the top and bottom of substrate 10801 inasmuch as the antennas need to transmit in an appropriate direction depending on the orientation of the mobile device in which the package resides.

Because of the proximity of the die and the antennas, very short feed mechanisms (not shown in this figure) interconnect the die and the antennas 10803 and 10811. Further, if space conditions require, one die can be configured to feed antennas (or antenna arrays) on one side of the substrate while a second die can be configured to feed second antennas (or antenna arrays), on the other side of the substrate, and the two sets of antennas or antenna arrays can be algorithmically driven by an appropriate control program.

For example, in FIG. 108A, die 10809 may drive antennas(s) 10803 while die 10809' may drive antenna(s) 10811' in an algorithmically controlled program by which antenna(s) 10803 and 10811' fire in a desired sequence, or polarization, or direction. Stated another way, one large die may be configured into several smaller dies to control antenna(s) that are connected close to the several smaller dies an programmed to fire in any desired sequence to meet the requirements of the design at hand.

Items 10813, 10813' can be contacts such as solder balls, vias, slugs, or other contacts spaced densely and configured to form a Faraday cage for RFI/EMI shielding of dies such as discussed above. Other forms of shielding can also be used such as vias, or even a trench that has been plated with conductive materials to provide shielding all around the die and the associated components.

This combination of shielded die and associated components embedded within substrate 10801, and dedicated antennas 10803, 10819 includes an embedded die-dedicated antenna combination 10801-1. There can be several such embedded die-dedicated antenna combinations 10801-1, 10801-2, 10801-3, . . . , 10801-N.

In FIG. 108A, N is equal to four, but any appropriate number of such combinations can be implemented in the package to form multi-embedded die sub-system 10800 which in some aspects includes but a single package. In other aspects, multiple packages may be stacked as discussed above with respect to package-on-package aspects. Each of the dies would communicate with each other via algorithmic control to determine which antenna or antenna array fires at a given time depending on the orientation of the mobile device, and desired polarization or diversity, as the case may be. In other aspects, the concept of reduced-size, reduced-function, antenna-limited dies (antenna-limited in the sense of servicing a dedicated antenna or antennas located very close to the die) is not limited to an embedded die such as the aspect here discussed, but can also be implemented in aspects using stacked packages of the type discussed above.

FIG. 108B illustrates generally at 10802 a top view of N dedicated antenna arrays 10801'-1, 10801'-2, 10801'-3, 10801'-N, configured on the top of package 10801 of FIG. 108A where N=4, according to some aspects. Antenna array 10803A-19803B includes dedicated antenna array 10802-1, which illustrates an antenna array which may be a part of embedded die-dedicated antenna combination 10801-1 of FIG. 108A. FIG. 108C illustrates generally at 10804 a bottom view of N dedicated 2×4 antenna arrays configured on the bottom of surface 10819 of FIG. 108A, according to some aspects.

While an aspect wherein an embedded die-dedicated antenna combination such as 10801-1 with two antenna or antenna arrays has been illustrated and described, other combinations can be implemented in other aspects. For example, a single die could feed more than two dedicated antenna or antenna arrays, and the die would then be electronically configured accordingly. In such cases the dedicated die would still maintain as close proximity to the dedicated antennas as reasonably possible, in order to enable the antennas to be fed with very short feed lines.

Further, it is important to understand that power loss before the low noise amplifier (LNA) of the receiver of the die, or after the power amplifier (PA) of the transmitter of the die, is a serious loss. To protect against this, the connections to the antenna is generally kept very short. In other words, loss within the die does not have as much negative effect on the system as loss after the RF chain leaves the PA of the transceiver of the die or before the RF chain is amplified by the LNA of the transceiver of the die, because loss in these latter cases (after the PA and before the LNA) can have a serious negative effect on the signal to noise ratio of the entire system. Hence, very short interconnections between die and the antennas is critical, leading to the embedded die-dedicated antenna aspects described herein. Hence, the described aspects provide spatial location of the die in close proximity to the antenna(s).

An important advantage of stacked packages and of stacking components on top of each other is to allow multiple radios and multiple systems to be stacked on top of each other. In some aspects, antennas may be coupled to a radio in a Wi-Fi system operating within a Wi-Fi frequency band, and other antennas in the same or a different package of the stacked package configuration may be coupled to a radio in a mmWave Wireless Gigabit (WiGig) system, with the same die having a Wi-Fi system configuration and a mmWave WiGig system configuration, in some aspects.

In some aspects, the die may actually include a plurality of dies, for example a first die configured for Wi-Fi operation connected to a first group of antennas, and a second die configured for mmWave WiGig operation connected to a second group of antennas. As mentioned above, the dies can be in the same package of a package-on-package configuration, or in different packages in a package-on-package configuration. Further, if antenna arrays such as patch elements are opposite each other because of the overlay of antenna elements in a package-on-package configuration, and if the antennas are controlled to fire together, the radiation can be sideways in edge-fire operation. Further still, in some aspects firing of the antenna arrays on opposing sides of the package can be algorithmically controlled to fire in opposing directions, even at a one hundred-eighty degree (180°) angle opposition; and in some aspects, firing of the antenna arrays on opposing sides of the package can be can be algorithmically controlled to fire in the same direction.

The large bandwidths available in the mmWave frequency band is of particular interest for applications, such as wireless backhauling, requiring gigabits per second data rate. The Federal Communications Commission (FCC) has recently opened up the 64 GHz to 71 GHz spectrum to 5G use cases, thus allowing use of up to six frequency channels with 2.16 GHz bandwidth each. Consequently, the antenna that interfaces the radio front end to the air interface has to operate over a large frequency bandwidth.

To address challenges existing in designing printed antenna arrays having wide bandwidths, thicker substrates can be used in combination with stacked resonators to broaden the bandwidth of certain printed antennas. In some aspects, stacked patch antennas can be used to enhance the antenna bandwidth. More specifically, two vertically stacked patch antennas (or patches) can act as coupled resonators, where the coupling between the two resonators can be controlled to adjust the impedance bandwidth of the antenna.

The coupling can be controlled by using various substrate thicknesses to control the coupling that is of magnetic nature. In particular, an increase in height between the stacked patches (that is equivalent to an increase in substrate thickness) can result in wider bandwidth. Even though a thicker substrate between stacked resonators can generally result in a wider effective bandwidth of an antenna element, an increase in substrate thickness may also give rise to scanning nulls in the field of view of a printed phased array. Aspects described herein address such challenges and include a stacked ring resonator (SRR) antenna with three or more capacitively coupled resonators to increase the antenna bandwidth.

FIG. 109 illustrates a block diagram of a side view of an exemplary stacked ring resonators (SRR) antenna package cell using according to some aspects. The antenna package cell may be incorporated in the antenna array circuitry 330 of mmWave communication circuitry 300 shown in FIG. 3A, although the antenna package cell is not limited to such.

Referring to FIG. 109, there is illustrated an SRR antenna package 10900, which can be implemented on a multilayer PCB. The SRR antenna package 10900 can include a first metalized layer, which can form a ground plane 10902. The SRR antenna package 10900 can further include a second metalized layer, which can form a single ring resonator 10906. A third metallized layer can form additional ring resonators, such as ring resonators 10910 and 10912. Even though FIG. 109 illustrates two ring resonators in the third metallized layer, the disclosure is not limited in this regard and another configuration of ring resonators can be used. For example four ring resonators can be used in the third layer, as illustrated in FIG. 111.

In some aspects, the ground plane layer 10902 is separated from the single resonator 10906 by one or more PCB layers 10904, and the single resonator 10906 is separated from the ring resonators 10910 and 10912 by one or more additional PCB layers 10908. In some aspects, the single ring resonator 10906 is capacitively coupled to ring resonators 10910 and 10912, and the ring resonators 10910 and 10912 can be capacitively coupled to each other. In this regard, the bandwidth of the SRR antenna package 10900 can be controlled changing the capacitive coupling between the resonator rings by adjusting the thickness of the PCB layers 10904 and 10908, as well as by adjusting the distance between the co-planar ring resonators 10910 and 10912.

In some aspects, multiple antenna packages (such as the SRR antenna package 10900) can be used as antenna cells in an antenna array, such as a large-scale millimeter wave phased antenna array as illustrated in FIG. 114.

FIG. 110 illustrates exemplary ring resonators, which can be used in one or more layers of the antenna package cell of FIG. 109 according to some aspects. The ring resonators disclosed herein can be part of an antenna package cell, with the resonators occupying one or more layers of the antenna package, amplifying and/or resonating signals being received or transmitted via the antenna package cell. Referring to FIG. 110, there is illustrated the single ring resonator 10906 of the second metallized layer of the SRR antenna package 10900, and the coplanar, capacitively coupled ring resonators 10910 and 10912 from the third metallized layer of the SRR antenna package 10900. In some aspects, the SRR antenna package 10900 can use a single feed line at antenna port 11000, which can be coupled to the single ring resonator 10906 to generate a single linear polarization.

FIG. 111 illustrates exemplary ring resonators with multiple feed lines using different polarization, which can be used in one or more layers of the antenna package cell of FIG. 109 according to some aspects. Referring to FIG. 111, there is illustrated a single ring resonator 11102, which can be used in the second metallized layer of the SRR antenna package 10900. In some aspects, the third metallized layer of the SRR antenna package 10900 can include a plurality of coplanar coupled ring resonators 11104. More specifically, the plurality of resonators 11104 can include ring resonators 11106, 11108, 11110, and 11112, which can be capacitively coupled to each other as well as to the single ring resonator 11102.

In some aspects, the SRR antenna package 10900 can use a dual feed line feeding antenna ports 11114 and 11116 at the single ring resonator 11102 to generate two linear orthogonal polarizations. As seen in FIG. 111, antenna port 11114 can be used for a horizontal signal polarization and antenna port 11116 can be used for a vertical signal polarization.

FIG. 112 illustrates electric field lines 11200 in the E plane of the SRR antenna of FIG. 109 according to some aspects. Referring to FIG. 112, there is illustrated electric lines 11200 formed between the first, second and third metallized layers of the SRR antenna package 10900. More specifically, the electric field lines 11200 are formed due to capacitive coupling between the ground plane 11202, the single ring resonator 11204 (on the second metallized layer), and the two co-planar ring resonators 11206 and 11208. FIG. 112 also illustrates an antenna feed port 11210 on the single ring resonator 11204.

FIG. 113 is a graphical representation of reflection coefficient and boresight realized gain of the SRR antenna package cell of FIG. 109 according to some aspects. More specifically, FIG. 113 illustrates a reflection coefficient graph 11302 (indicative of return loss) and a boresight realized gain graph 11304 based on a simulated performance of the SRR antenna topology of FIG. 111. As seen in FIG. 113, the 10 dB return loss bandwidth extends from 55 GHz to 74 GHz, or 19 GHz bandwidth.

Additionally, the 3 dB boresight realized gain bandwidth extends from 54 GHz to 69 GHz, or 15 GHz bandwidth. As seen in FIG. 113, above 70 GHz, the boresight gain starts decreasing rapidly, at which point the element no longer has a broadside type radiation behavior. The SRR antenna package (e.g., 10900) may therefore be utilized within an effective bandwidth of 55 GHz to 69 GHz, while radiating at broadside. The broadside pattern can be of interest in phased array applications to generate directional beams in the top hemisphere. Also, the SRR antenna package (e.g., 10900) can be scaled up or down in frequency to cover more specific frequency bands, depending on applications.

FIG. 114 illustrates a block diagram of an exemplary antenna array using the SRR antenna package cell of FIG. 109 according to some aspects. Referring to FIG. 114, the antenna array 11400 is a large-scale millimeter wave phased array antenna, including a plurality of antenna package cells similar to the SRR antenna package 10900 of FIG. 109. In some aspects, the antenna array 11400 includes an arrangement of SRR antenna package cells that are arranged in a tiled configuration, including any number of multiples of SRR antenna package cells (e.g., 4×4, 8×8, and 16×16). Associated with the antenna array 11400 (as well as with each SRR antenna package cell (e.g., SRR antenna package 10900)), is a particular electric field (E-field) vector (illustrated in FIG. 114) and a particular magnetic field (M-field) vector (not illustrated in FIG. 114).

The antenna array 11400 can be formed using multiple SRR antenna packages such as SRR antenna package 10900. FIG. 114 illustrates the second metallized layer 11402 and the third metallized layer 11408 in the antenna array 11400. The second metallized layer 11402 includes a plurality of single ring resonators 11404. Each of the single ring resonator 11404 has a corresponding set of ring resonators 11410 (e.g., four coplanar, capacitively coupled ring resonators) within the third metallized layer 11408.

In some aspects, the inter-element spacing of the ring resonators within layers 11402 and 11408 can be set to 0.5λ but may be changed based on the scanning range requirements of the antenna array 11400.

In some aspects, to equalize the metal densities on the built-up package, non-resonant dipoles (or dummy metal strips) 11406 and 11412 can be added between adjacent resonator elements. In the antenna array 11400, each of the SRR antenna resonators (e.g., 11404) can be fed from a single antenna port, forming one single linear polarization (in some examples, dual polarization can be used instead). As seen in FIG. 114, the non-resonant dipoles 11406 and 11412 are orthogonal to the E-field vector to reduce coupling between the radiating elements and the non-resonant dipoles.

FIG. 116 illustrates a block diagram of a stack up of the SRR antenna package cell of FIG. 109 according to some aspects. The SRR antenna package cell 11600 can be formed using ten substrate layers (M1-M10), referenced as 11604-11622, respectively. The SRR antenna package cell 11600 includes coplanar ring resonators 11636 disposed on the top substrate layer 11622, a single ring resonator 11634 disposed in substrate layer 11618, an antenna ground plane 11632 disposed in substrate layer 11614, an antenna feed 11630 disposed in substrate layer 11612, non-resonant dipoles 11638 disposed on substrate layers 11616, 11618, 11620, and 11622, and an impedance transformer (e.g., coaxial impedance transformer 11640) disposed between substrate layers 11604 and 11614.

The SRR antenna package cell 11600 includes ten substrate layers to provide signal routing, but aspect are not so limited and the antenna package cell 11600 may include a different number of substrate layers. In some aspects, the substrate layers (e.g., 11604-11612) of the antenna package cell 11600 provide stack-up symmetry to mitigate warpage of the antenna package cell 11600. The SRR antenna package cell 11600 may be implemented on a surface such as a PCB.

In some aspects, the SRR antenna package cell 11600 is a subarray element as part of a subarray of an antenna array (e.g., phased antenna array, as seen in FIG. 114)). In certain aspects, the SRR antenna package cell 11600 is coupled to one out of a plurality of ports of an integrated circuit, for example a radio frequency integrated circuit (RFIC) 11602 through the coaxial impedance transformer 11640. However, aspects are not so limited and the SRR antenna package cell 11600 may also be a subarray element of a larger or smaller subarray, and may couple to an RFIC through other methods. Further, each subarray can be arranged, in some aspects, to construct a phased array antenna (e.g., phased array antenna for large-scale mmWave communications).

The antenna feed 11630, in certain aspects, is disposed on substrate layer 11612, adjacent to the ground plane on substrate layer 11614. Further, the antenna feed 11630, in some aspects, is coupled to the impedance transformer 11640. By coupling to the impedance transformer 11640, the antenna feed 11630 can receive RF signals for transmission by the SRR antenna package cell 11600, or transmit RF signals to the antenna feed 11630, for example, RF signals received by the SRR antenna package cell 11600. In some aspects, the impedance transformer includes a plurality of vias, which are disposed within a plurality of substrate layers (e.g., substrate layers 11604-11612). Such vias can couple the RFIC 11602 (e.g., via RFIC bumps 11603) to the antenna feed 11630, through a plurality of substrate layers (e.g., substrate layers 11604-11612). Particularly, the vias of impedance transformer 11640 can include one via that couples RFIC 11602 to the antenna feed 11630.

In some aspects, the antenna feed 11603 of the SRR antenna package cell 11600 can be fed from an equiphase feed distribution network designed in 25Ω stripline. The impedance system can be selected to be 25Ω in order to reduce Ohmic losses into the stripline compared to a traditional 50Ω stripline.

In some aspects, the SRR antenna package cell 11600 further includes a plurality of non-resonant dipoles 11638, disposed on substrate layers (e.g., one or more of layers 11616-11622). In some aspects, the non-resonant dipoles 11638 can increase the metal density of the SRR antenna package cell 11600, which can mitigate warpage. Additionally, the non-resonant dipoles 11638 can be disposed on one or more of the substrate layers 11616-11622 orthogonally to the electric field of the SRR antenna package cell 11600 to ensure non-resonance.

In some aspects, the RFIC 11602 is configured to receive RF signals for the SRR antenna package cell 11600, from the ring resonators 11636 and 11634, the antenna feed 11630, and the impedance transformer 11640. Additionally, in some aspects, the RFIC 11602 is configured to transmit RF signals, from the SRR antenna package cell 11600, through the impedance transformer 11640, the antenna feed 11630, and the ring resonators 11634 and 11636. In some aspects, the RFIC 11602 is attached to the SRR antenna package cell 11600 through flip-chip attachment although aspects are not so limited. The RFIC 11602 may be part of the SRR antenna package cell 11600 (e.g., within a wireless communication device), or may be separate from the SRR antenna package cell 11600 and operably coupled to the SRR antenna package cell 11600. Further, in certain aspects, the RFIC 11602 can be operably coupled to control and baseband circuitry to receive control signals and baseband signals for processing communication signals transmitted from and received by the SRR antenna package cell 11600.

FIG. 115 illustrates a set of layers 11500 that make up an exemplary SRR antenna package cell (e.g., 11600) according to some aspects. More specifically, the illustrated substrate layers 11502-11520 correspond to substrate layers 11604-11622 of FIG. 116. As seen in FIG. 115, coplanar ring resonators 11528 are located in the top substrate layer 11520, while the single ring resonator 11526 is located in substrate layer 11516, forming a set of stacked ring resonators. The single ring resonator 11526 includes an antenna port 11524, which is coupled to the antenna feed 11522 located at substrate layer 11510.

In some aspects, the SRR antenna package cell 11600 further includes a plurality of non-resonant dipoles 11530 disposed on substrate layers 11514-11520. Similar to FIG. 116, the non-resonant dipoles 11530 can be used to mitigate warpage of the SRR antenna package cell 11600 by increasing the metal density between the substrate layers 11514-11520. The non-resonant dipoles 11530 can be disposed orthogonally to the electric field of the SRR antenna package cell 11600 to ensure non-resonance.

FIG. 117 illustrates a block diagram of a plurality of striplines, which can be used as feed lines for the SRR antenna package cell of FIG. 109 according to some aspects. Referring to FIG. 117, there is illustrated another view 11700 of the feed lines of substrate layer M5 (or 11510 in FIG. 115), disposed between ground plane layers. More specifically, layer M5 can include a plurality of striplines (e.g., 11702) disposed between ground plane layers M4 (11508) and M6 (11512). For example, FIG. 117 illustrates the metallized surface 11708 of one of the ground plane layers (e.g., M4 or 11508). The striplines 11702 are located within non-metallized areas 11710, and can be shielded by a plurality of ground vias 11704. In some aspects, each stripline 11702 can be a 25Ω stripline. Even though reference number 11702 is connected to only two striplines in FIG. 117, the remaining striplines illustrated in FIG. 117 are also referred to with reference number 11702 (similarly, 11704 refers to all illustrated ground vias, 11706 refers to all stripline bends, and 11710 refers to all non-metallized areas in FIG. 117).

The feed network of the SRR antenna package cell 11600 can be a source of losses between the RFIC 11602 and the radiating elements (e.g., 11634 and 11636) in the mmWave frequency regime. In some aspects, each 25Ω stripline 11702 for each SRR antenna package cell within an antenna array (e.g., an array as illustrated in FIG. 114, using multiple SRR antenna package cells) can be the same length to ensure the same insertion phase for all antenna elements in the array. Additionally, each 25Ω stripline 11702 for each SRR antenna package cell within an antenna array can be shielded by ground vias 11704 (e.g., to prevent overmoding). Furthermore, each 25Ω stripline 11702 for each SRR antenna package cell within an antenna array can be routed on the PCB package with smooth bends (e.g., bends 11706 do not include any sharp angle bends) to ensure flat insertion phase response with respect to frequency for all feed lines of the antenna array.

RF communication systems often times utilize sub-systems (e.g., voltage controlled oscillators (VCOs), power amplifiers, transceivers, modems, antenna sub-systems, and so forth) that are formed on a semiconductor die. An increasing number of wireless communication standards as applied to portable devices, may cause major design challenges for antennas. Antennas represent a category of components that may fundamentally differ from other components in the portable device. For example, the antenna may be configured to efficiently radiate in free space, whereas the other components can be isolated from their surroundings.

Antennas operating at millimeter wave (mmWave) frequencies (for high data rate short range links) are expected to gain popularity. One example of a communication system operating at may include suitable circuitry, logic, interfaces and/or code-wave frequencies is called Wireless Gigabit Alliance (WiGig), which operates at the 60 GHz frequency band. In addition, utilization of the mmWave radio systems is projected to play a major role for standards such as 5G cellular radio. Typically these short range mm-wave radio systems require an unobstructed line-of-sight (LOS) between a transmitter and a receiving antenna. With the LOS requirement, an orientation of the transmitting and receiving antennas may require their respective main lobe to face each other for maximum radio link. Current antenna designs for mobile devices such as laptop computers, tablets, smart phones, etc. are limited in coverage and incur high losses at mmWave operating frequencies. Additionally, may include suitable circuitry, logic, interfaces and/or code-wave communication systems can often times use waveguides within the antenna systems. The use of waveguides for communicating may include suitable circuitry, logic, interfaces and/or code-wave signals, however, is associated with precise micro-machined components which can be costly.

The waveguide structure described herein can be incorporated in the antenna array circuitry 330 of mmWave communication circuitry 300 shown in FIG. 3A, although the waveguide structure is not limited to such. FIG. 118A illustrates an example mobile device using a plurality of waveguide antennas according to some aspects. Referring to FIG. 118A, the mobile device 11800 can include a radio frequency front-end module (RFEM) 11802, which can be used to wirelessly transmit or receive signals via the waveguides 11808. In some aspects, the waveguides 11808 can be used to communicate wireless signals such as millimeter wave radio signals (e.g., WiGig or 5G cellular signals) inside the device 11800 as well as directionally, outside of the device 11800. As seen in FIG. 118A, four separate waveguides 11808 can be used as antennas, guiding signals in different antenna lobes outside of the device 11800.

FIG. 118B illustrates an exemplary radio frequency front-end module (RFEM) with waveguide transition elements according to some aspects. Referring to FIG. 118B, the RFEM 11802 includes a transceiver sub-system 11804, a transition structure 11806, and waveguides 11808. In some aspects, wireless signals can be communicated between the transceiver 11804 and the waveguides 11808 via the transition structure 11806. The transition structure 11806 can be used for transitioning between striplines communicating wireless signals from/to the transceiver 11804 and the waveguides 11808.

The waveguides 11808 can be made of low-loss plastic material coated with conducting material (e.g., metal-coated Teflon material or other material). The transition structure 11806 may use micro-machined connectors or adapters having feed probes inside grounded connector chassis. Signal feeding techniques that can be used include near field coupling of a microstrip patch antenna placed inside the waveguides. The transition structure 11806, however, can be costly to manufacture due to the micro-machined connectors or adapters.

In some aspects, a different type of waveguide transition structure (as disclosed herein in reference to FIGS. 119A-123) may be used for feeding a wireless signal (e.g., mmWave radio signals) from a transmission line on a PCB (or another substrate) to a waveguide. The transition structure can include a feed probe (e.g., electric or magnetic field feed probe) with a connection to a planar transmission line on a multilayer PCB. Larger parts of the waveguide transition structure can include the ground connection between the PCB and the waveguide as well as mechanical mounting and mechanical support to the waveguide, which can be implemented with a metal adapter mounted to the PCB. The adapter can be either soldered or mounted using screws (as seen in the drawings) to the PCB. Since the smallest parts of the transition structure (e.g., the feed probe) are implemented into the PCB, the proposed waveguide transition structure design may not need to utilize small and tolerance-sensitive parts that would be difficult and expensive to machine.

FIG. 119A and FIG. 119B illustrate perspective views of a waveguide structure for transitioning between a PCB and a waveguide antenna according to some aspects. Referring to FIG. 119A, there is illustrated an exploded view 11900 of the adapter 11904 used for transitioning between the PCB 11902 and the waveguide 11906. The PCB 11902 can include multiple layers 11908 between ground layers 11910A and 11910B. A transmission line 11918 can be disposed on one side of the PCB 11902 (e.g., on layer 11910A), and can be used to convey millimeter wave wireless signals between the waveguide 11906 and a transceiver sub-system (e.g., 11804). The transmission line 11918 can be a planar transmission line, which may include a microstrip line, a strip line, or a co-planar waveguide transmission line. In some aspects, the transmission line 11918 can be ground-backed coplanar waveguide (CPW) transmission line. In some aspects, the transmission line 11918 may be of no-planar type, such as coaxial or another waveguide. Additionally, the transmission line 11918 may include a conducting component that is separated from a ground plane (e.g., layer 11910A) by a DL electric layer of the substrate layers 11908. The transmission line 11918 may include a feed probe (e.g., as illustrated in FIGS. 120A-120B) for communicating signals to and from the waveguide 11906.

The PCB 11902 further includes a cutout 11912, which can be used for receiving the waveguide 11906, when the PCB 11902 and the waveguide 11906 are mounted via the adapter 11904. The adapter 11904 can be mounted to the PCB 11902 via screws 11914 or via other means (e.g., adapter 11904 may be glued or attached via other means to the PCB 11902).

The waveguide 11906 can be made of low-loss material (such as Teflon) and can be covered by a metallized (or metallic) layer 11916. The adapter 11904 can be manufactured from a metal so that the metallized layer 11916 can be coupled to a ground layer (e.g., 11910A and 11910B) of the PCB 11902, when the PCB 11902 and the waveguide 11906 are coupled via the adapter 11904. FIG. 119B illustrates an assembled view 11920 of the PCB 11902, the adapter 11904, and the waveguide 11906.

FIG. 120A, FIG. 120B, and FIG. 120C illustrate various cross-sectional views of the waveguide transitioning structure of FIGS. 119A-119B according to some aspects. Referring to FIG. 120A, there is illustrated a cross-sectional view 12000 of the adapter 11904 as attached to the PCB 11902 and the waveguide 11906. In some aspects, the PCB 11902 can include a plurality of vias forming ground via fences 12010. At least a portion of the ground via fences 12010 can couple the ground plane layers 11910A and 11910B.

FIG. 120B and FIG. 120C illustrate additional views 12002 and 12004 of the waveguide structure including adapter 11904 mounted on the PCB 11902 and the waveguide 11906 using the screws 11914. As seen in view 12002, the adapter 11904 can include an opening 12016 for receiving the transmission line 11918, when the adapter 11904 is mounted on the PCB 11902. In some aspects, the PCB 11902 can further include one or more of vias plated through the PCB 11902 and the transmission line 11918 to form a feed probe 12012. The feed probe 12012 can be used for communicating wireless signals between the feed line 11918 and the waveguide 11906. In this regard, a ground portion of the transmission line 11918 can be coupled to a ground portion of the waveguide (e.g., metallized layer 11916) via the metal adapter 11904 and the ground via fences 12010 (e.g., an electrical contact is formed between the ground plane layers 11910A, 11910B, ground via fences 12010, metal adapter 11904, and metallized layer 11916 of the waveguide 11906).

In some aspects, the PCB transmission line-to-waveguide transition adapter 11904 can further include an air gap 12014 formed between an edge of the PCB 11902 (e.g., an edge of the PCB close to a location of the feed probe 12012) and an edge of the waveguide 11906, when the PCB 11902 and the waveguide 11906 are mounted to the adapter 11904. The air gap 12014 can have configurable dimensions (e.g., width, height, and/or depth) for purposes of impedance matching.

FIG. 121A, FIG. 121B, and FIG. 121C illustrate various perspective views of the waveguide transitioning structure of FIGS. 119A-119B including an impedance matching air cavity according to some aspects. Referring to FIG. 121A, FIG. 121B, and FIG. 121C, there are illustrated additional views 12100, 12102, and 12104 of the waveguide transition structure that includes the PCB 11902, adapter 11904, and waveguide 11906. More specifically, views 12102 and 12104 illustrate the location of the air gap 12014 in relation to the ground via fences 12010 and the feed probe 12012.

FIG. 122 illustrates another view of the air cavity when the PCB and the waveguide are mounted via the waveguide transitioning structure of FIGS. 119A-119B according to some aspects. Referring to FIG. 122, diagram 12200 illustrate the relative dielectric constants (Er) of the PCB 11902, the air gap (or cavity) 12014, and a Teflon waveguide 11906. More specifically, a relative dielectric constant Er=1 is associated with air within the air gap 12014, and relative dielectric constants Er=3 is associated with the PCB 11902 and the waveguide 11906. As seen in FIG. 122, reflected signals 12202 and 12204 at the interface border (e.g., at the border between the PCB 11902 and air gap 12014 and border between the air gap 12014 and the waveguide 11906) can be viewed as an impedance two signal waves propagating between the PCB 11902 and the waveguide 11906. Therefore, by adjusting dimensions of the air gap 12014, impedance may be varied for purposes of impedance matching.

FIG. 123 illustrates a graphical representation of simulation results of reflection coefficient values in relation to air gap width according to some aspects. More specifically, graphical diagram 12300 illustrate example simulation results showing values of the reflection coefficient S11 in relation to width of the air gap 12014. As seen in FIG. 123, the air gap 12014 can be used for optimizing the impedance matching of the transition structure using adapter 11904. In some aspects, air gap dimensions other than width, or the air gap shape, may be varied for purposes of impedance matching.

Polarization multiple-input multiple-output (MIMO) antenna structures, and polarization diversity are planned to be one of the key enablers of extremely high data rate for future 5G mmWave radio systems. This creates a need for dual polarized antennas and antenna arrays appropriate for use in mmWave wireless communication systems.

Previous solutions include various types of planar microstrip and printed dipole antennas having complex, or relatively complex, feed networks or antenna pattern shapes for creating dual polarized radiation response. In order to provide optimal or improved characteristics for 5G and WIGIG polarization MIMO systems, the antenna should exhibit nearly pure dual polarized response with high isolation between signal feed ports. In addition, the antenna should be small in size, easy to integrate into PCB/silicon and usable as a single antenna element in an antenna array. The second issue is preventing excitation of detrimental and lossy substrate waves occurring in PCB/substrate integrated antennas. Previous solutions include various types of planar microstrip and printed dipole antennas having complex, or relatively complex, feed networks or antenna pattern shapes for creating dual polarized radiation response.

One solution to the above need is to use two 90 degree folded dipole antennas having a shared dipole arm, according to some aspects. An antenna structure of such properly positioned dipoles produces an orthogonally polarized antenna pair. There is very weak coupling between the antennas when signal feeds of the dipoles are well balanced. The above-described antenna can be implemented in an aspect where the antenna structure is integrated into a multilayer PCB or substrate. In addition, substrate wave excitation can be prevented or substantially decreased by designing properly positioned PCB holes to the planar dipole arm strips of the described antenna structures and to the PCB dielectric at the antenna area. In some aspects, the simulated design parameters of Table 4 can be achieved.

TABLE 4

| Polarization | Slanted 45 degrees |
|---|---|
| Single ant element 10 dB impedance bandwidth | 2.5 GHz |
| Frequency range | 27.0 GHz-29.5 GHz |
| Center Frequency | fc = 28.25 GHz |
| Reference impedance | 50 Ohms |
| Single ant element realized Gain | 4-5 dBi |
| Gain (+/−60° theta/phi in main direction) | 1-2 dBi |
| Gain (+/−90° theta/phi in main direction | −1-0 dBi |
| Cross polarization ratio (Half Power Bean Width) | >20 dB |
| Total efficiency | >0.8 (>−dB) |
| Array element to element isolation | >20 dB |

The antenna structures described below provide improvements to currently known solutions to the above needs in that the shared antenna arm enables achieving the dual polarized response with a very compact antenna structure, the balanced nature of the dipoles provides low mutual coupling between the antennas without extra effort and complexity, and a dual polarized response is achieved without complex feeding and impedance matching networks. Other improvements of the disclosed antenna structure is that it is very east to integrate to a PCB or other type of multilayer substrate. Further, a simple technique of placing holes to planar parts of the antennas can be used for suppressing detrimental substrate waves. Such holes also reduce dielectric losses within the antenna structure. In addition, the disclosed antenna structures is easy to use as a building block of a compact antenna array. One of ordinary skill in the art will recognize that the foregoing improvements may be achieved in one or more aspects, and various aspects of the antenna structure described herein may provide all or some of the foregoing improvements depending on the design issues at hand.

FIG. 124 illustrates a dual polarized antenna structure, according to some aspects. The antenna structure 12400 includes two 90 degree folded dipole antennas 12401, 12403. The antenna structure 12400 can be incorporated in the antenna array circuitry 330 of mmWave communication circuitry 300 shown in FIG. 3A, although the waveguide structure is not limited to such. Folded dipole 12401 includes planar arm 12402 and vertical arm 12410. Folded dipole 12403 includes planar arm 12406 and vertical arm 12410. Folded dipoles 12401, 12403 are placed side-by-side. The side-by-side placement produces an orthogonally polarized antenna pair.

Each dipole 12401, 12403 has its own "antenna arm" 12410, and individual feeds illustrated symbolically at 12404, 12408. The antenna arm 12410 is common for both dipoles. In other words, arm 12410 is a shared antenna arm of the two folded dipoles, according to some aspects. As illustrated in FIG. 124, each folded dipole will produce linear polarization slanted 45 degrees. Two such dipoles side-by-side will produce orthogonally polarized antenna pair, discussed in additional detail below. Further, if the two antennas are well balanced, there will be very little coupling between antennas.

FIGS. 125A through 125C illustrate the dual polarized antenna structure of FIG. 124 implemented on a multilayer PCB, according to some aspects. In an aspect, the illustrated dipoles are designed to operate at a frequency of approximately 29 GHz. In FIG. 125A through 125C, the PCB 12503 includes a ground plane of approximately 20×10 mm and is the part into which the antenna structure 12511 is integrated. Dipole arms 12502, 12506, enumerated in FIG. 125C but illustrated in each of FIGS. 125A through 125C, are specific for each antennas are implemented with planar PCB copper strips approximately 2 mm in length, according to the aspect under discussion. The vertical dipole arm 12510 shared with both antennas is implemented with an approximately 2.5 long vertical metal bar mounted on the PCB. The holes 12507 in the PCB, on the planar dipole arms 12502, 12506 are used for preventing or reducing excitation of detrimental substrate waves. PCB 12503 and Extension 12509 are physically the same PCB. In other words, the extension 12509 is just a shape of PCB outline.

FIG. 126 illustrates simulated S-parameters of the antenna structure illustrated in FIGS. 125A through 125C, according to some aspects. The antenna structure enumerated as 12511 of FIG. 125A, but is illustrated in each of FIGS. 125A through 125C, was simulated using CST MICROWAVE STUDIO™ (CST™ MWS™) electromagnetic simulation software (SVV). PCB 12503 material in this example is FR4 (Er=4.4) and material of all conductors is copper, for the simulation described for this particular aspect. The simulated S-parameters of are presented in FIG. 126. The results show that both antennas (e.g., symbolically 12401, 12403 of FIG. 124 and diagrammatically 12501, 12503 in FIGS. 125A through 125C) are well impedance matched at 29 GHz band and the coupling between the antennas is low.

FIGS. 127A and 127B illustrate simulated far-field radiation patterns of the antenna structure illustrated in FIGS. 125A through 125C, according to some aspects. Radiation of the dipoles are orthogonally polarized with a cross polarization component 10 to 30 dB lower than the main polarization component, according to some aspects. In this PCB implementation both dipoles 12501, 12503 have maximum directivity of approximately 4 dBi and maximum gain approximately 3 dBi. The simulation results indicates that the antenna structure 12511 works in the intended manner.

Power leakage to undesired and detrimental surface or substrate wave modes can be an issue in mmWave circuits. In practice this means the RF power leaks into the substrate causing additional dielectric losses and ruining the radiation patterns and the polarization of the antennas. In this antenna structure 12511 excitation of surface and substrate waves are prevented or reduced by drilling holes to the PCB on the antenna area. FIG. 128A illustrates a top view of the antenna structure of FIGS. 125A through 125C with surface wave holes drilled in the planner arms of the dipole arms, according to some aspects. FIG. 128B illustrates a top view of the antenna structure of FIGS. 125A through 125C with surface wave holes drilled, in another configuration, according to some aspects. FIG. 128A illustrates a technique where the holes, one of which is enumerated 12807, and which in some aspects are 0.2 mm in diameter, are positioned to the planar dipole arms 12802, 12806 in a manner such that they locate approximately at the area of electric field maxima.

An alternative implementation is illustrated in FIG. 128B where there are additional holes in the PCB off the antenna at areas 12812, 12814, 12816 in order to further suppress the surface and substrate wave excitation. In a dipole structure, electric field maximum locations are typically near the open ends of the dipole arms. In this aspect however, the holes are placed also to other, less critical, regions of the antenna, as it is generally beneficial to remove as much lossy material close to antenna as possible. The lossy material includes the substrate and in some aspects the substrate is Flame Retardant 4 (FR4).

FIG. 129 illustrates an alternative implementation of a dual polarized antenna structure, according to some aspects. FIG. 130A illustrates a top view of the antenna of FIG. 129, according to some aspects, while FIGS. 130B and 130C are perspective views of the antenna of FIG. 129, according to some aspects. In FIG. 129, the common dipole arm 12510 illustrated in FIGS. 125A through 125C is replaced with closely separated individual dipole arms 12906, 12908 respectively for each antenna. As in FIGS. 125A through 125C each antenna includes individual feeds 12903, 12905 and produces linear polarization slanted 45 degrees. The dielectric substrate 13003 may be a dielectric of Er=4.3 an of loss tangent=0.02@29 GHz. The antenna of FIG. 130A includes dual vertical elements 13010, 13011, and planar dipole arms 13002, 13006, according to some aspects. Holes 13015 on both planar arms, in an aspect, help prevent or reduce surface or substrate waves on PCB 13003. Additional holes 13012, 13014, 13016 may be placed as indicated, also to help prevent or reduce rate surface or substrate waves. Feeds 13005, 13007 may be connected to a signal source such as a Radio Frequency Integrated Circuit (RFIC) within substrate 13003. Typically the connection would be made by microstrip or stripline transmission lines. Vias are usually avoided in mmWave circuitry due to possible impedance matching issues they might cause. Sometimes vias may need to be used (e.g., if the RFIC is located on opposite side of the PCB than the feeds). The illustrated dimensions are used for simulation purposes but those of ordinary skill in the art would recognize that other dimensions may be used, according to the design issue at hand.

FIGS. 130B and 130C are perspective views of the antenna of FIG. 129, according to some aspects. The cutaway of FIG. 130B illustrates one of the two vertical arms at 13011 while FIG. 130C illustrates both vertical arms 13010, 13011.

FIG. 131A illustrates a simulation of total radiation efficiency versus frequency for the antenna structures of FIGS. 130A through 130C, according to some aspects. The term "total radiation efficiency" as used here means the ratio (in dB) of power radiated by the antenna to the maximum available power from the source (e.g., 50 ohm signal generator such as a RF transceiver). Total radiation efficiency accounts for both impedance mismatch losses and losses in the antenna structure (dielectric and ohmic losses where RF energy becomes heat). FIG. 131A plots the efficiency of one of the antennas of FIG. 130C (which has two orthogonal antennas which are symmetrical, so the efficiency of both antennas will be the same).

FIG. 131B illustrates a top view of a 4×1 array of antennas of the type illustrated in FIGS. 130A through 130C, according to some aspects. FIG. 131C is a perspective view of the 4×1 array of antennas of the type illustrated in FIG. 131B, according to some aspects. The 4×1 dual polarized antenna array includes four dual polarized antenna elements 13121, 13123, 13125, 13127 each of the type illustrated in FIGS. 130A through 130C, according to some aspects. Each of the antenna elements includes two vertical dipole arms 13110, 13111 and two planar diode arms 13102, 13106. The array is of the indicated dimensions for the purpose of simulation and is attached to main PCB 13103 via structure 13109. The antenna element enables forming compact antenna arrays to the edge of the PCB 13103, which makes it attractive for implementation in mobile radio devices where space is at a premium.

FIGS. 131D and 131E are illustrated simulation radiation patterns 13100D and 13100E of the 4×1 antenna array of FIGS. 131B and 131C, at 0° phasing, according to some aspects. FIGS. 131F and 131G are illustrated simulation radiation patterns 13100F and 13100G of the 4×1 antenna array of FIGS. 131B and 131C, at 120° phasing, according to some aspects. Each simulation pattern indicates a+45° array or a −45° array, as indicated in the simulated pattern figure. The results of these figures are from the structure of FIG. 131C, where "+45" refers to an antenna array formed by +45 degrees slanted dipoles, and −45 degrees respectively to other dipoles. FIGS. 131D and 131E are for the case where all the individual antenna feeds are excited at same phase of the input signal. FIGS. 131F and 131G are for the case when phase of each feed is shifted 120 degrees from the element next to it. This causes the main lobe of the array's pattern to offset from the center. Phasing is used to steer the antenna main lobe into wanted direction.

The plot of FIG. 132 illustrates a simulation of worst case coupling between neighboring antennas of the antenna array of FIG. 132, according to some aspects. The antenna array of FIG. 132 includes antennas on substrate 13203. The antennas begin at 13209 and include neighboring antennas 13202. As an example, the simulation plot indicates the coupling between neighboring antennas such as the two antennas indicated at 13202 of FIG. 132. S44 and S55 are input matching ("return loss") of the two neighboring antennas 13202, and S45 is the coupling between these two antennas. As seen from the patterns, coupling between the antennas is shown to be less than-10 dB at all frequencies of interest, according to some aspects, which is sufficient isolation for MIMO performance.

FIG. 133 illustrates envelope correlation for the 4×1 antenna array of FIGS. 131B and 131C at 0° degree phasing, according to some aspects. FIG. 133 is a simulated envelope correlation between the two antenna arrays of FIG. 131B and FIG. 131C ("+45 array" and "−45 array"). Envelope correlation is used to quantify the correlation between two antennas. If envelope correlation is 1, then both antennas receive exactly the same signal and are thus useless for MIMO or diversity reception. In ideal case envelope correlation would be zero. Generally envelope correlation of less than 0.4 is considered very good for MIMO performance.

FIG. 134 illustrates the coordinate system for the polar simulation radiation patterns described below, according to some aspects.

Currently two implementations for WiGig sub-systems have been suggested, namely embedded die radio sub-systems and package-on-package radio sub-systems. The die may be a silicon transceiver and may be connected to antennas in some aspects. In the embedded die implementation there is a die embedded inside the main substrate of a radio system with, in some aspects, and surface mounted devices above the main substrate with conformal shielding covering both. In some cases there is selective mold beneath the shielding. In addition antennas may be provided on the bottom side of the main substrate and an antenna connector provided near the shield. This has the advantage of a small XY form factor but has the disadvantage that radiation is only from the antennas at the bottom side.

A second implementation includes package-on-package radio sub-systems that have a die and surface mounted devices placed in the top side of a main substrate, which may be covered by another substrate with a cavity for the surface mounted devices and for the die. In some implementations antennas may be placed on the top and bottom sides, under the main substrate and above the package-on-package sub-system. Again there may be a signal connector near the package-on package-module on the main substrate. This implementation has the advantage that there is radiation from both sides of the packages but there is the disadvantage that there is a large XY form factor, which may result in power loss due to long feed lines.

In the aspects disclosed herein, a given number of elements such as antennas or other components may be described. Those of ordinary skill in the art would recognize that the described numbers of antennas and other components are for illustration and that other numbers of antennas and other components may be configure in other aspects as needed for the solution at hand.

FIG. 135 illustrates a radio system package having a die embedded inside a main substrate and shielded surface mounted devices above the main substrate, according to some aspects. The radio system package described herein can be incorporated in the RF circuitry 325 and the antenna array circuitry 330 of mmWave communication circuitry 300 shown in FIG. 3A, although the radio system package is not limited to such.

Radio sub-system 13500 is illustrated in FIG. 135. The main substrate of the sub-system is seen at 13502. Connected to the main substrate is a mechanical shield 13516 to shield against radio frequency interference (RFI) and electromagnetic interference (EMI). In the inside 13518 of the shield are surface mounted devices which may be inductors, resistors, capacitors, and the like. Die 13504 is embedded within the main substrate 13502, while antennas 13506, 13508, 13510, 13512 and antenna connector 13520 is attached to the main substrate and connected to die 13504. In some aspects the antennas are configured with other antennas on the bottom of the main substrate to form an antenna array. Generally, no antennas can radiate through a shield, so no antennas are placed in that area. Consequently while the XY form factor may be small in some implementations, there is radiation only from the bottom of the implementation.

FIG. 136 illustrates a radio sub-system having a die and surface mounted devices placed above the main substrate within a cavity in a secondary substrate, according to some aspects. Radio sub-system 13600 is illustrated in FIG. 136. The sub-system includes main substrate 13602 having at the bottom thereof antennas 13606, 13608, 13610, 13612 which, in some aspects are configured in one or more antenna arrays with other antennas at the bottom of the main substrate. A die and surface mounted devices (not shown) may be configured within a secondary substrate 13604. Antennas 13614, 13616 may be configured with other arrays on the top surface of secondary substrate 13604 as antenna arrays. Connector 13618 is provided and is connected in some aspects to the die to supply radio signals to be radiated. The result of the foregoing is a package-on-package radio sub-system. As discussed above, while there is radiation from both sides, the package-on-package configuration in some cases has the disadvantage of having a large XY form factor, which may take up more space than is available in a mobile device in which this implementation may find use.

FIG. 137 illustrates a radio system package having a die embedded inside a main substrate, and surface mounted devices placed above the main substrate within a cavity in a secondary substrate, according to some aspects. Radio package 13700 is a combined embedded die and package-on-package sub-system, according to some aspects. The package includes a first, or primary, substrate 13702 attached to a second, or secondary substrate 13713, according to some aspects. Die 13704 is embedded within primary substrate 13702 in the aspect under discussion. Cavity 13717 is shown in hidden view. Surface mounted devices such as antenna 13718 and discreet device 13720 (and there may be pluralities of each, the antennas being configured singly or in one or more arrays) are soldered or otherwise connected to the primary substrate, and covered by, or otherwise situated within, the cavity 13717, according to some aspects. Some surface mounted devices, which may include antennas configured singly or in one or mare antenna arrays, are located within cavity 13717 in the secondary substrate, according to some aspects. Antennas 13706, 13708, 13710, 13712 are mounted at the bottom of primary substrate 13702, according to some aspects. As will be seen in additional figures below, the antennas in some aspects may be configured with other antennas as one or more antenna arrays. A connector 13720 may be provided to supply radio signals to die 13704, in some aspects. In other aspects flexible interconnects may connect the first substrate or the second substrate to one or more third substrates, packages, or boards in the overall system. The primary substrate 13702 with the embedded die 13704, and the attached secondary substrate with surface mounted devices including antennas mounted within a cavity of the secondary substrate 13713, include an embedded die plus package-on-package combination, according to some aspects. Further, in some aspects, antennas and/or antenna arrays may be placed on the sides of either the primary substrate or the secondary substrate, or both, in addition to top and bottom, to provide radiation in side directions. Such devices could operate in end-fire mode in some aspects.

FIG. 138A is a perspective cut-away view of a radio system package having a die embedded inside a primary substrate and surface mounted devices placed above the primary substrate within a cavity in the secondary substrate, according to some aspects. The combined embedded die/package-on-package combination 13800 includes die 13804 embedded in primary substrate 13802, and secondary die 13813 with surface mounted devices 13818, which may in some aspects may be antennas and antenna arrays within cavity 13817 in the secondary substrate 13813. Some of the illustrated surface mounted devices within cavity 13817, such as at 13820, may be discreet circuit components as may be needed, according to some aspects. At the bottom of primary substrate 13802 are antennas 13806, 13808, 13810, 13812 in the configurations discussed above. At the top of the secondary substrate 13813 are antennas 13814A, 13814B, 13816A, 13816B mounted either singly or in antenna arrays as discussed above, according to some aspects.

FIG. 138B is a perspective view of the radio system of FIG. 138A illustrating the bottom side of the primary substrate, according to some aspects. The combined embedded die/package-on-package combination 13801 includes a die (not shown) embedded in primary substrate 13802 and secondary substrate 13813 with surface mounted devices 13818, 13820 which may in some aspects include antennas 13818 or antenna arrays, mounted within cavity 13817 in the secondary substrate 13813. Some of the illustrated surface mounted devices within cavity 13817 may be discreet circuit components 13820 as may be needed, according to some aspects. At the bottom of primary substrate 13802 are antennas 13806, 13808, 13810, 13812 in the configurations discussed above. At the top of the secondary substrate 13813 are antennas 13814A, 13814B, 13816A, 13816B mounted either singly or in antenna arrays, according to some aspects.

FIG. 139 is a perspective view of the radio system of FIG. 138A illustrating the inside of the secondary substrate, according to some aspects. Embedded die/package-on-package combination 13900 includes die 13904 embedded in primary substrate 13902, and secondary substrate 13913 with surface mounted devices such as 13918 in some aspects. Die 13904 may be connected to substrate 13902 by solder contacts 13925. Surface mounted devices such as 13918 may include antennas or antenna arrays, mounted within cavity 13917 in the secondary substrate 13913, according to some aspects. Some of the illustrated surface mounted devices within cavity 13917 may be discreet circuit components 13920 as may be needed, according to some aspects. At the bottom of primary substrate 13902 are antennas 13906, 13908, 13910, 13912 in the configurations discussed above. At the top of the secondary substrate 13913 are seen antennas 13914A, 13916A, mounted either singly or in antenna arrays, according to some aspects. Connector 13922 may be provided in some aspects as a source of radio signals for die 13910.

FIG. 140A is a partial perspective top view of the radio system of FIG. 138A illustrating solder contacts for mechanical connection and/or electrical connection, according to some aspects. A die (note shown) may be embedded within primary substrate 14002 in some aspects. Surface mounted devices 14018, 14020 of the type described above are illustrated connected to primary substrate 14002 according to some aspects. In some aspects a secondary substrate having a cavity, as illustrated in some of the above figures, would cover the surface mounted devices. Solder contacts, some of which are enumerated 14022, 14024 and 14026, 14028 are used to connect to the secondary substrate in some aspects, as will be discussed in additional detail below. Connector 14020 may be provided in some aspects.

FIG. 140B is a partial perspective view of the radio system of FIG. 138A illustrating solder contacts configured on a secondary substrate to match the solder contacts of FIG. 140A, according to some aspects. Top secondary substrate 14013, illustrated generally at 14000, includes cavity 14017 of the type discussed above, in some aspects. Solder elements, some of which are enumerated 14022A, 14024A and 14026A, 14028A, are configured on secondary substrate 14013 to match the solder components illustrated in FIG. 140A and, when the two sets of solder connections are reflowed, provide solder connections which may be used for mechanical connection between the two substrates and, in some aspects, electrical connection as well. While 2×2 element arrays and 2×4 element arrays are illustrated herein, those of ordinary skill in the art would understand that an N×M element arrays may be configured on top, bottom or sides of the primary substrate and/or the secondary substrate, according to the desired solution. In some aspects, when antenna arrays are located on top, bottom and along the sides of the primary substrate and/or the secondary substrate, and radiation direction may be controlled in any of a number of directions depending on algorithmic control of antenna firing and antenna polarity.

Because of the need for edge-fire operation of antennas, and also because of the very limited space within mobile devices in which such antennas may find use, it is desirable to find edge-fire antenna options that are very small, that operate at 5G mmWave frequencies, and that take less space than, and cost less to manufacture than higher end multilayer stack-up antennas. One solution is that a small surface component can be soldered or otherwise attached to the edge of the main PCB for use in a user mobile device. The solution can be implemented by cutting a piece of low-cost PCB (as in Table 6, discussed below) commonly seen in mobile devices with a center via, and partially plated side walls which connects to main PCB ground to function like a waveguide. The un-plated part of the surface component is an extended dielectric material which provides an impedance transformation from the waveguide to air. The length of the extended dielectric material can act as a tuning knob for impedance matching and beam shaping to achieve the objective desired in a given design. It has been found that such a surface component can achieve a fairly wide bandwidth, approximately 30% at 28 GHz and with a more directive beam as compared to regular monopole antennas, and can also be used for dual polarization operation. In some aspects, the simulated design parameters of Table 5 can be achieved.

TABLE 5

| Polarization | Vertical (perpendicular to the board) |
|---|---|
| Single ant element 10 dB impedance bandwidth | 2.5 GHz |
| Frequency range | 27.0 GHz-29.5 GHz |
| Center Frequency | fc = 28.25 GHz |
| Reference impedance | 50 Ohms |
| Single ant element realized Gain | 4-5 dBi |
| Gain (+/−60° theta/phi in Main Direction) | 1-2 dBi |
| Gain (+/−90° theta/phi in Main Direction | −1-0 dBi |
| Cross polarization ratio (Half Power Bean Width) | >20 dB |
| Total efficiency | >0.8 (>−1 dB) |
| Array element to element isolation | >20 dB |

FIG. 141A illustrates a single element edge-fire antenna comprising a surface component attached to a PCB, according to an aspect. The single element edge-fire antenna can be incorporated in the antenna array circuitry 330 of mmWave communication circuitry 300 shown in FIG. 3A, although the single element edge-fire antenna is not limited to such.

The surface component 14101 is soldered or otherwise attached to the main PCB 14103 that could be the main PCB of a mobile device. Elements of the surface component are plated as discussed below and are of the indicated dimensions in the figure, and the monopole antenna is within the surface component at 14105. The monopole antenna 14105 may be fed by a 6 mm microstrip feed 14107 from the bottom of the PCB, where it can be attached to a signal source such as a radio frequency integrated circuit (RFIC). The monopole antenna 14105 can be a via within the small PCB 14101, attached to feedline 14107. The surface component functions as a waveguide-like cover and makes the beam radiated from the monopole considerably more directive compared to the beam of a regular monopole. An extended dielectric 14109 can be viewed as extending the surface mounted plated surface element 14101, including the antenna 14105, to air. Extended dielectric 14109 provides a gradual impedance transition from the monopole in the waveguide to free air. The dielectric length can act as a tuning knob, the length being determined for impedance requirements for a desired design, and helps to provide a wide bandwidth compared to a regular waveguide antenna which is open-ended to the air. Further, because the extended dielectric is only a few millimeters in length, this edge-fire antenna can be placed on the edge of a PCB of a mobile device where space is at a premium.

FIG. 141B illustrates plating and material details of the single element antenna structure of FIG. 141A, according to an aspect. For example, the copper plating on 5 sides of the surface component which may be Isola FR408HR material, including the bottom side, can be 30 micron copper and the extended dielectric part may be un-plated. In other words, the antenna element can be realized by a single, small piece of PCB without combining, which lowers the cost for mass production. Example metals and dielectrics are seen in Table 6 where the metal conductivity is measured in Siemens per meter and is copper conductivity in this aspect. The dielectric constant, Er and the loss tangent for the materials used in this aspect are also seen in Table 6. The metal indicated is a regularly used inexpensive PCB, as can be seen from Table 6. Additionally, the extended dielectric material is the un-plated portion of the same surface component. One way to implement the antenna is by cutting a small piece of regular PCB (with a built-in via/monopole) and plating part of the surfaces, rather than making two components (waveguide+extended dielectric) and attaching them together. This is one of the reasons the aspects are low-cost and easy to manufacture.

TABLE 6

| | Surface Component | Main PCB |
|---|---|---|
| Metal | 58*10^6 S/m | 58*10^6 S/m |
| Dielectric | $\varepsilon_r = 3.63$<br>Loss Tangent = 0.01<br>@ 28.25 GHz<br>(Isola FR408HR) | $\varepsilon_r = 4$<br>Loss Tangent = 0.018<br>@ 28.25 GHz<br>(R-1551WN (Prepreg)) |

FIG. 141C illustrates an end view of the single element antenna illustrated in FIGS. 141A and 141B, according to an aspect. The monopole antenna 14105 is seen at the given dimensions, in this aspect, and the PCB top layer is illustrated at a particular thickness, here 32 microns. It will be understood by one of ordinary skill in the art that the recited various dimensions and metals and the various dielectrics are used for some aspects only, and that other such materials can be used depending upon the particular design at hand. Monopole antenna 14105 can be formed by a via attached to feed line 14107 in some aspects.

FIG. 141D illustrates a 4-antenna element array including four antenna elements of the type illustrated in FIGS. 141A and 141B, each with a separation of a half-wavelength (λ/2), according to an aspect. In this aspect each antenna element is the same, as to dimensions, material, and other parameters, as the antenna element of FIGS. 141A through 141C, and the array is configured to fire with the same polarization.

FIG. 142 illustrates the bandwidth of the antenna illustrated in FIGS. 141A and 141B for two different lengths of an extended dielectric, according to an aspect. Curve 14201 illustrates the simulated bandwidth across the indicated frequency range for an extended dielectric of 3.5 mm. Curve 14203 indicates bandwidth across the indicated frequency range for an extended dielectric of 5 mm. Here S11 is used to measuring bandwidth at the minus 10 dB point as is usually done for input impedance matching. The curves of FIG. 142 are simulated with an aspect that has a 6 mm feed line included. The simulation indicates that the shorter extended dielectric of 3.5 mm length has a better bandwidth than the aspect with the longer extended dielectric of 5 mm length. As can be seen the bandwidth for curves 14201 is from approximately 23 GHz to approximately 34 GHz. However the gain illustrated in simulated curves below will indicate that there is a trade off with respect to bandwidth and gain of the two sizes of extended dielectric.

FIG. 143 illustrates the total efficiency over a frequency range of the antenna illustrated in FIGS. 141A and 141B, according to an aspect. This graph measures the efficiency of the antenna structure in radiating power. The best efficiency is generally 0 dB, whereas minus dB measurements indicate loss in the antenna structure and therefore lower efficiency over a frequency range. Simulated results are seen in FIG. 143 at 14301, which is for the extended dielectric of 3.5 mm length and at 14303, which is for an extended dielectric of 5 mm length. As can be seen from the graph, the crossover point for the two lengths of extended dielectric is at approximately 28.2 GHz, such that in this illustrated antenna structure the shorter length extended dielectric of 3.5 mm has a better, although decreasing, efficiency between 27 GHz and 28.2 GHz. Beyond point 14305 the extended dielectric of 5 mm, illustrated by graph 14303 then has a better efficiency between 28.2 GHz and 29.5 GHz. The point of the illustration is that because extended dielectrics of different lengths can provide different efficiencies at different frequencies, tuning the length can be used as one of the parameters for a given desired solution.

FIG. 144 illustrates total efficiency of the antenna illustrated in FIGS. 141A and 141B over a frequency range greater than that of FIG. 143, according to an aspect. The wider frequency range of FIG. 144 is a better indication of overall performance. Graph 14401 is for the extended dielectric of 3.5 mm length and graph 14403 is for the extended dielectric of 5 mm length. The crossover point 14405 for total efficiency at 28.2 GHz is the same as crossover point 14305 on FIG. 143. FIG. 144 illustrates that there is a second crossover point 14407 at a higher frequency of approximately 30.3 GHz at which point graph 14403 begins to lose efficiency very quickly while graph 14401 maintains relatively constant efficiency and, in fact, increases efficiency over part of the frequency range. Consequently, it can be seen that total efficiency for the antenna structure under discussion depends on the particular frequency range one is investigating. FIG. 144 is an even better illustration of the fact that graph 14401, indicating an extended dielectric length of 3.5 mm, has a better bandwidth than the graph 14403 which is for an extended dielectric of 5 mm. This is a confirmation of the conclusion drawn from FIG. 142.

FIG. 145 illustrates maximum realized gain over a frequency range for the antenna illustrated in FIGS. 141A and 141B, according to an aspect. When used in this context, maximum realized gain means simulated gain achieved in the main (maximum) radiating direction not only because of the antenna structure itself, but also simulated gain taking into account impedance mismatches at the input to the antenna. For example, the simulated maximum realized gain takes into account a 6 mm feed line, resulting in not just the theoretical gain, but the actual gain due to theoretical gain and other factors contended with in a real antenna. The other figures that illustrate simulated quantities likewise take into account the 6 mm feedline. Graph 14501 illustrates the maximum realized gain over the frequency range for an extended dielectric of 3.5 mm length and graph 14503 illustrates the maximum realized gain over the indicated frequency for an extended dielectric of 5 mm. As can be seen from the two graphs, the longer extended dielectric, namely 14503, has a better maximum realized gain over the frequency range indicated in FIG. 145 even though the extended dielectric of 3.5 mm length may have a broader bandwidth as seen in FIG. 142.

FIG. 146 illustrates the maximum realized gain over another frequency range for the antenna illustrated in FIGS. 141A and 141B, according to an aspect. The frequency range of FIG. 145 is a subset of the frequency range of FIG. 146. When viewed over the wider frequency range of FIG. 146, from 24 GHz to 34 GHz, it is seen that maximum realized gain of the antenna structure with an extended dielectric of 5 mm length, illustrated by graph 14601, in consistently and increasingly greater than the maximum realized gain of the antenna structure with an extended dielectric of 3.5 mm length, illustrated by graph 14603. Thus, while FIG. 142 illustrates that the antenna structure with the shorter length extended dielectric has a wider −10 dB bandwidth. FIG. 146 illustrates that the antenna structure with the longer length extended dielectric has greater maximum realized gain.

FIG. 147 illustrates isolation between two neighboring antenna elements of the antenna array illustrated in FIG. 141D, according to an aspect. Over the illustrated frequency range, it is seen that graph 14703, which illustrates the isolation between neighboring elements, each of which has an extended dielectric of 5 mm length, is superior to the isolation between two neighboring elements of the array with an extended dielectric of 3.5 mm length, which is seen by graph 14701. More negative dB means lower coupling level between neighboring elements and thus better isolation. When viewing FIGS. 142 through 147 together it is apparent that the designer has a number of tradeoffs to make for the length of extended dielectric, depending upon the desired solution for any particular design. This set of figures illustrates how extended dielectric length tuning can be implemented, in other words whether to use a 3.5 mm length extended dielectric or a 5 mm length extended dielectric, for the aspects illustrated. One of ordinary skill in the art will understand that only two extended dielectric lengths have been simulated in these graphs, namely 3.5 mm and 5 mm, but that extended dielectric lengths of other dimensions can be simulated and used as needed for a given design.

FIG. 148A illustrates a three-dimensional radiation pattern at 28.25 GHz for the antenna element illustrated in FIGS. 141A and 141B, according to an aspect. FIG. 148B illustrates a three-dimensional radiation pattern at 28.25 GHz for the antenna element illustrated in FIGS. 141A and 141B, according to an aspect. The aspect is for a single antenna element, but with a different extended dielectric length. In these two figures the Main Direction of radiation is toward the edge of the PCB inasmuch as the antenna aspect under discussion is implemented for edge-fire operation. As seen in the two figures, the maximum realized gain in dB for each of FIG. 148A and FIG. 148B is respectively 3.93 dB and 5.17 dB. Direction can be seen from the fact that the shading in each of FIGS. 148A and 148B is keyed to the vertical realized gain table adjacent to each radiation pattern. If one takes a cut of the radiation pattern of FIG. 148A or 148B along the Z-X-plane one will view the radiation pattern of the E-plane, and if one takes a cut along the X-Y-plane of FIG. 148A or 148B one will view the radiation pattern for the H-plane, for the antenna element in the aspect under discussion.

FIG. 148C illustrates a three-dimensional radiation pattern at 28.25 GHz for the 4-antenna element array illustrated in FIG. 141D, where each antenna element has a first extended dielectric length, according to an aspect. FIG. 148D illustrates a three-dimensional radiation pattern at 28.25 GHz for the 4-antenna element array illustrated in FIG. 141D, where each antenna element has a second extended dielectric length, according to an aspect. Similar comments can be made with respect to FIGS. 148C and 148D as were made with respect to FIGS. 148A and 148B in respect of E-plane and H-plane cuts, although the gain for each extended dielectric length differs as seen by the antenna patterns that are keyed to the realized gain tables adjacent each radiation pattern. The note for realized gain is 1.05E+01 meaning 1.05×10□1=10.5 dB. 7.65E+00 meaning 7.65×10/\0=7.65 dB Again this shows the array with 5 mm dielectric achieves a higher gain (more focused beam/energy)

FIG. 149 illustrates an E-plane radiation pattern at a given frequency for the antenna element illustrated in FIGS. 141A and 141B, according to an aspect. In FIG. 149 radiation pattern 14901 illustrates the radiation pattern for an extended dielectric of 3.5 mm length, and radiation pattern 14903 illustrates the radiation pattern for an extended dielectric of 5 mm length. As can be seen from FIG. 149, the radiation pattern 14901 for an extended dielectric of 3.5 mm lengths has less gain than the element with an extended dielectric of 5 mm length indicated at 14903.

FIG. 150 illustrates an E-plane cross-polarization radiation pattern at a given frequency for the antenna illustrated at FIG. 141A and FIG. 141B, according to an aspect. Referring back to FIGS. 148A and 148B, if one were to take a cut at the Z-X plane, that cut is equivalent to fixing 0 at zero degrees, yielding a view of the E-Plane, such as in FIG. 149. For a receive antenna with co-polarization with respect to a transmit antenna of the type under discussion (e.g., substantially identical polarization with the transmit antenna), better than 3 dB gain of the transmit antenna would be measured in the Main Direction, which is an edge direction of the mobile device, given that the antenna is configured for edge-fire operation. On the other hand, if the receiving antenna is at cross-polarization with a transmit antenna of the type under discussion (e.g., substantially orthogonal polarization with the transmit antenna), as is the case for the radiation patterns of FIG. 150, very little gain of the transmit antenna would be measured, for example, namely a maximum of about −37 dB in the Main Direction.

FIG. 151 illustrates an H-plane co-polarization radiation pattern for the antenna illustrated in FIGS. 141A and 141B, according to an aspect. Referring back to FIGS. 148A and 148B, if one were to take a cut at the X-Y plane of FIG. 148A or FIG. 148B, that cut is equivalent to fixing e at ninety degrees, yielding a view of the H-Plane. For a receive antenna with co-polarization with respect to a transmit antenna of the type under discussion, as in FIG. 151, better than 3 dB or gain would be measured in the Main Direction of FIG. 151.

FIG. 152 illustrates an H-plane cross-polarization radiation pattern at a given frequency for the antenna illustrated in FIGS. 141A and 141B, according to an aspect. This radiation pattern is for a receiving antenna that is at cross-polarization with a transmit antenna of the type under discussion. Again very little of the transmitted gained is measured because of the cross-polarization, for example, approximately −35 dB in the Main Direction.

FIG. 153A illustrates an alternative idea to implement the antenna element similar to the single polarization antenna illustrated in FIGS. 141A and 141B, according to an aspect. The surface component including plated portion 15301 and unplated portion 15309, which may be the upper part of the antenna, and the lower part of the antenna merges with the main PCB 15303. Reference number 15304 illustrates an extended dielectric part of main PCB 15303 cut to fit the waveguide shape, and reference number 15305 is the monopole formed by a via inside the small surface component PCB, according to this aspect. Merging part of the antenna structure with the main PCB lowers the total height above the surface of main PCB 15303, which might be critical in certain compact applications. The dielectric material of main PCB 15303 is expected to have similar dielectric loss to that of the small surface component PCB, since now part of the electromagnetic wave travels through the main PCB 15303. In other words, part of the antenna is under the surface of the main PCB 15303 to reduce height. The main PCB 15303 has similar dielectric material to that of the surface component. The two combine (soldered, in some aspects) together to form a waveguide structure.

For example, in some aspects, the dielectric material of surface component PCB and main PCB may have an Er of 4.6 at a frequency of 10 GHz, and a loss tangent of TanD=0.004 at a frequency of 10 GHz. A PCB with these parameters is a commonly used PCB. Making the main PCB part of the waveguide component will also enable a horizontal feed, which can provide for dual polarization as discussed below. While a PCB of the foregoing parameters was used for simulation of this particular aspect, PCBs having different parameters than those discussed can be used, depending on the requirements of a particular design.

FIG. 153B illustrates the antenna element illustrated in FIG. 153A with a thicker main PCB 15303 and additional detail illustrating a vertical feed port and a horizontal feed port, and a horizontal monopole 15307, according to an aspect. Each has a feed trace that connects to an RFIC, according to some aspects. If the thickness of the main PCB 15303 is at least half of the waveguide height, given that the horizontal monopole is at the one-half the height of the waveguide, the horizontal microstrip 15312 is able to feed the horizontal monopole 15307 at the midpoint. The vertical monopole 15305 can be fed by a microstrip from the bottom side of the main PCB (not shown). The vertical and horizontal monopoles are orthogonal to each other, to provide dual polarization as discussed in additional detail below. Since part of the waveguide is in the main PCB in this aspect, there should be vertical metal walls inside the main PCB. This can be implemented by dense vertical vias, also discussed below. In FIGS. 141A and 141B, a PCB is cut to a small piece to be the surface component antenna. There is no cutting for the main PCB in that case according to some aspects.

FIG. 154A illustrates the surface component of FIGS. 141A and 141B as a sandwiched structure, according to some aspects. The surface components of the sandwiched structures are seen at 15401 and 15401'. Surface component 15401 is on the top of the main PCB 15403 and surface component 15401' is on the bottom of the main PCB 15403.

FIG. 154B illustrates the antenna element illustrated in FIG. 154A in additional detail, according to an aspect. Feeding stripline 15407 inside the main PCB connects to the monopole 15405 in the surface component 15401. In this case 15407 is no longer able to feed from the bottom of the antenna structure since the main PCB is in the middle of sandwiched waveguide structure. It needs to feed from the end of the waveguide as illustrated, according to some aspects. This may impact gain and matching, as discussed above with respect to realized gain. Extended dielectric 15409 is the un-plated portion of the surface component 15401.

FIG. 155A is a perspective view of the dual polarization antenna of FIG. 153B after soldering the small surface component and main PCB together, according to an aspect. Part of the waveguide 15501 is merged with the main PCB 15503, with the extended dielectric 15509. The dimensions of a particular aspect of the dual polarization antenna are indicated. The horizontal microstrip 15512 on the main PCB extends into the waveguide and acts as the horizontal monopole. Vias 15514 are used to connect the top and second ground metal layer of the main PCB. FIG. 155B illustrates a transparent view of FIG. 155A including inside dimensions of the waveguide and the microstrip feedline 15511 on bottom side of main PCB for the vertical monopole 15505, according to an aspect. In the simulation, part of the vertical ground wall of waveguide below the surface of main PCB is approximated by ideal (solid) metal. In practice it can be implemented by dense ground vias.

FIG. 155C is a front view of the dual polarization antenna of FIGS. 155A and 155B, according to an aspect. The front view is looking into the extended dielectric 15509 of FIG. 155A or 155B. Dimensions are seen with respect to antenna 15505, according to some aspects. 15515 is an extended portion of the horizontal microstrip acting as the horizontal monopole, and 15505 is the vertical monopole in this aspect.

FIG. 155D is a side view of the dual polarization antenna of FIGS. 155A and 155B, according to an aspect. In this view the vertical monopole cannot be seen since it is blocked by the vertical ground wall of the waveguide, and the horizontal monopole is also blocked by the top metal layer of the main PCB. 15516 shows an opening on the waveguide vertical ground wall where the horizontal microstrip feed 15514 enters. 15511 is the microstrip feed for the vertical monopole. In some aspects opening 15516 may be rectangular.

FIG. 156A is a plot of return loss (S11) curves for both the horizontal feed (15603) and the vertical feed (15601) of the antenna of FIG. 155A, according to an aspect. Both vertical and horizontal feeds (polarizations) achieve wideband input impedance match (S11<−10 dB) from 27 GHz to 34 GHz, covering the potential 5G band around 28 GHz. The optimal impedance matching for vertical feed, illustrated by curve 15701, appears at 29.8 GHz, while optimal point for horizontal feed appears at 30.2 to 30.4 GHz.

FIGS. 156B and 156C illustrate a simulated 3D realized gain pattern at 28 GHz for the vertical feed and the horizontal feed of the antenna of FIG. 155A, according to an aspect. The two figures illustrate the maximum realized gain for each feed (polarization) is similar, with a maximum realized gain of 5.2 dB for vertical feed and a maximum realized gain of 4.7 dB for horizontal feed.

FIG. 157A illustrates a simulated vertical feed E-plane pattern sweep for the indicated frequency range, according to an aspect. It shows a gain variation of 1.1 dB across the frequency range (4.7 dB at 27 GHz and 5.8 at 29.6 GHz). FIG. 157B illustrates a simulated horizontal feed H-plane pattern sweep for the indicated frequency range, according to an aspect. It also indicates a gain variation around 1 dB across the frequency range (3 dB at 27 GHz and 4 dB at 29.6 GHz).

FIG. 158 illustrates realized gain for horizontal feed E-plane patterns of the antenna of FIG. 155A, at three phi settings, according to an aspect. Pattern 15801 illustrates gain for phi set at 60 degrees, pattern 15803 illustrates gain for phi set at 90 degrees and pattern 15805 illustrates gain for phi set at 120 degrees. The result shows the horizontal polarization pattern achieves higher gains at around 30 degree left and right from the broadside (90 degree).

Polarization diversity is one of the antenna diversity techniques that helps to improve signal quality and reliability as well as assist in mitigating multipath interference and fading. Polarization diversity generally does not require any extra bandwidth and/or physical separations between antennas and only one dual-polarized antenna can be used for implementation. Unfortunately, dual-polarized antennas suffer from cross-coupling between their two ports. To specify how well such an antenna separates its two polarizations, the terms antenna port-to-port isolation, cross-polarization and polarization isolation are normally used. The diversity gain is dependent on the cross coupling in the antenna, indicating that the cross-polarization is indeed of importance for a well-functioning polarization diversity scheme. For example, two excitation ports on one dual-polarized antenna should be isolated from each other so that the paired complementary polarized antennas can enhance the immunity to the interference caused by any mismatched polarization.

FIG. 159A illustrates an antenna element with orthogonal vertical and horizontal excitation, according to some aspects. The antenna element described herein can be incorporated in the antenna array circuitry 330 of mmWave communication circuitry 300 shown in FIG. 3A, although the antenna element is not limited to such. FIG. 159B illustrates an antenna element with +45 degree and −45 degree excitation, according to some aspects. Two major dual-polarized antenna structures 15900, 15902 using patch elements 15901, 15903 are shown in FIGS. 159A and 159B.

Polarization diversity techniques can utilize the two orthogonal excitation schemes 15907, 15909 of antenna element 15901 as shown in FIGS. 159A and 15908, 15910 of antenna element 15903 as shown in FIG. 159B.

In FIG. 159A, the two ports 15907, 15909 are orthogonally placed so that each port represents vertical polarization (V-polarization) and horizontal polarization (H-polarization), respectively. In FIG. 159B, the two excitation ports 15908, 15910 are placed at ±45-degree tilted excitation. The polarization can be determined by the phase relationship between the excitation signals in both ports in FIG. 159B.

The first method that is shown in FIG. 159A is based on the fact that the two orthogonal polarizations are uncorrelated. Therefore two orthogonally aligned antenna elements can achieve the polarization isolation between each other. Another method, shown in FIG. 159B, utilizes the signal cancelling mechanism by the phase relationship on ±45-degree tilted antenna excitation elements. FIG. 160A illustrates use of a zero degree phase difference process to determine V-polarization, according to some aspects, and FIG. 160B illustrates use of a one hundred eighty degree process to determine H-polarization, according to some aspects. Both figures represent ±45-degree tilted excitation.

FIG. 160A shows that vertical polarization 16013 can be realized with in-phase excitation for both ports. In this case, the horizontal polarization at 16009, 16011 becomes the anti-phase signal. Thus it is cancelled and results in vertically polarized radiation 16013, according to some aspects.

FIG. 160B shows that horizontal polarization can be realized by a 180-degree phase difference between two ports. In this case, the vertical polarization 16019, 16021 is the anti-phase signal and is cancelled. Thus this results in horizontally polarized radiation 16027, according to some aspects.

The above two methods have different issues. For the first method shown in FIG. 159A, this type of antenna achieves the polarization isolation due to the placement of excitation ports or elements 15907, 15909.

FIG. 161A illustrates the antenna element of FIG. 159A with vertical and horizontal excitation ports, according to some aspects. In FIG. 161A, each one of the excitation ports 16107, 16109 are placed orthogonally and represent vertical polarization and horizontal polarization respectively. In FIG. 161A 16100 illustrates antenna 16103 on laminar structure

16101. FIG. 161B illustrates simulated radiation patterns of co-polarization and cross-polarization, according to some aspects.

In FIG. 161B, top trace 16121 illustrates the co-polarization and bottom trace 16123 illustrates the cross-polarization. The difference between co-polarization and cross-polarization is the polarization isolation, and in this simulated case approximately 23.86 dB of isolation is obtained (e.g., the difference in dB between point m1 and point m2 at zero degrees). For the sake of polarization diversity, it is desirable to have higher polarization isolation so that better radiation signal quality can be obtained for each polarization. Since each port 16107, 16109 respectively represents each polarization, the port-to-port isolation is proportional to polarization isolation. Therefore, due to finite port-to-port isolation, the polarization isolation is easily degraded with this type of antenna.

As seen in FIG. 161B, due to finite port-to-port isolation, unwanted coupling signals to the other polarization port results in high cross-polarization level in this antenna structure.

On the other hand, the antenna structure shown in FIG. 159B requires essentially simultaneous excitation for both ports and the polarization depends on the excitation signal's phase as explained above. This type of antenna structure 15905 has immunity to the port-to-port signal coupling and thus results in higher polarization isolation. However, this configuration has its own issue, due to the need for the simultaneous excitation condition.

Because of this, this antenna requires a 180-degree hybrid coupler in some aspects, such as rat-race ring, to isolate the two polarizations for the sake of polarization diversity. Since the size of a rat-race ring and other hybrids is relatively large, it increases the size of the antenna element and the complexity of the signal feed lines, and might increase signal loss as well. That presents challenges in creating a large antenna array with desired element-to-element spacing.

FIG. 162A illustrates a 4×4 array schematic using orthogonally excited antenna elements, according to some aspects. Antenna array 16200 is illustrated as being on substrate 16201. This dual-polarized antenna array aspect also has short comings. Elements 16203, 16205, 16207, 16209 are enumerated as examples of four antenna elements of the 4×4 array. Ports P11 and P12 respectively represent a horizontal polarity excitation port and a vertical excitation port.

Ports P13, P14, ports P15, P16, and ports P17, P18 respectively represent pairwise horizontal polarization and vertical polarization excitation ports. The remainder of the 4×4 array is set up as the above four antenna elements of the array is set up.

FIG. 162B illustrates a simulated radiation pattern for the 4×4 array of FIG. 162A with dual-polarized antenna elements, according to some aspects. Plot 16221 illustrates co-polarization and plot 16223 illustrates cross-polarization, according to some aspects.

FIG. 162C illustrates a simulated radiation pattern at +45 degree scan angle with dual-polarized antenna array, according to some aspects. Based on the simulation results, this array antenna achieves only approximately 23 dB of polarization isolation as shown in FIG. 162B as shown in the difference between point m1 and point m2, which can be further degraded at higher scan angles, as illustrated in FIG. 162C.

162C shows the degradation and, in comparison, it is clear that higher scan angle would have more degradation. Further, the simulation result graph of the figure indicates that only 19.6 dB of polarization isolation can be achieved at a+45-degree scan angle as shown in the difference between point m1 and point m2 in FIG. 162C. As cross-polarization becomes challenging in phased array systems, in ideal beam forming MIMO applications improved or highest possible polarization isolation is desired.

Compared to a conventional orthogonal dual-polarized antenna, the proposed antenna configuration for signal cancellation described below enables higher cross-polarization suppression, according to some aspects. For the single antenna element of such an array, the proposed antenna topology has been simulated and shows more than 11 dB of cross-polarization suppression than its conventional counterpart. For a 4×4 array, the new topologies were simulated and indicated 38 dB of enhanced cross-polarization suppression compared to a 4×4 array using antenna elements.

Simulation has shown that the cross-polarization performance can be further degraded at higher scan angles in conventional phased array systems (e.g., without the disclosed suppression technique). However, the disclosed antenna array schemes maintain high cross-polarization suppression even at higher scan angles, resulting in better quality of signal in wireless communication systems which is especially important for uplink transmission. Also compared to a ±45-degree tilted antenna, these proposed methods can avoid the use of bulky 180-degree hybrid or rat-race couplers, and thus result in reducing the complexity of the signal feed network. Since the cross-polarization suppression is achieved by the proposed 4-port approach illustrated in and discussed below in connection with the antenna element of FIGS. 163A, 163B, and 163C, simple and compact signal splitters can be used to replace the feed networks as will be described in FIGS. 165A-165C. Similar advantages can be achieved for some aspects of antenna arrays, as illustrated in and discussed with respect to FIGS. 166A-166C below.

As a solution for issues on both dual-polarized antenna configurations described above, an antiphase cancellation technique can be applied to the orthogonal excitation antenna structure in order to suppress the cross-polarization level, caused by an unwanted coupling signal to another polarization port, according to some aspects. An extra antiphase port may be provided for each polarization port. Thus the dual-polarized antenna configuration includes four ports (Vertical, Horizontal, anti-Vertical, and anti-Horizontal). The unwanted coupling signal to another polarization port can be cancelled by the coupling signal from an antiphase port, while the co-polarization signals are combined and enhanced. Such an aspect is seen in in the antenna element of FIGS. 163A-163C. FIG. 163A illustrates a dual-polarized differential, 4-port patch antenna in an antiphase configuration, according to some aspects. The 4-port antenna element of FIG. 163A is based on the orthogonal excitation structure shown in FIG. 159A with the vertical and horizontal excitation ports orthogonally placed. Further, two additional (anti-Horizontal (anti-H) and anti-Vertical (anti-H)) ports are introduced to create topologies for enhancing the cross-polarization suppression. In this 4-port configuration, the facing ports can be excited together with a 180-degree phase difference (e.g., H and anti-H for horizontal polarization, and V and anti-V for vertical polarization as shown in FIG. 163A). In the proposed antenna element structure 16300 of FIG. 163A, the radiator is seen at 16301 and a coupler is seen at 16303. The 4-port structure includes antenna ports 16307 (vertical polarization), 16309 (horizontal polarization), 16311 (anti-vertical) and 16313 (anti-horizontal). Since cross-polarization is suppressed in a single element, the array antenna that includes the 4-port antenna elements 16307, 16309, 16311, 16313 can also achieve high polarization isolation.

FIG. 163B illustrates the antenna configuration of FIG. 163A in side view according to some aspects. FIG. 163C illustrates a laminated structure stack-up including levels L1-L6 for the antenna configurations of FIGS. 163A and 163B, according to some aspects, although there can be more than 6 levels. At 16302 of FIG. 163B it can be seen that radiator 16301 is implemented at Level L1 of the 6-level stack-up 16304 illustration of FIG. 163C. Coupler 16303 is implemented at Level L4 of the stack-up in this aspect. The antenna ports are fed by way of T-junction splitters, discussed in additional detail below. The various ports are in level L5 and are fed by vias that connect from the T-junction splitters, which T-junction splitters would be in a layer below GND layer L6, for example in a Layer L7 (not shown), in the aspect under discussion. Vias 16309A' (which feeds the horizontal port), 16307A' (which feeds the vertical port), and 16313A' (which feeds the anti-horizontal port) are seen, and via 16311A' (which feeds the anti-vertical port) is hidden behind via 16307A', and therefore is not seen, in the side view of FIG. 163B. Since the electric-field on each facing edge of a patch antenna has opposite polarity (i.e., 180-degree phase difference) as shown in FIG. 163D, an additional anti-phase signal allows suppression of cross-polarization levels by cancelling the unwanted coupled signals to cross-polarization (non-radiating edges) while combining and maintaining co-polarization in radiating edges as shown in FIG. 163E.

FIG. 164 illustrates a simulated radiation pattern of the 4-port antenna configuration aspect of FIGS. 163A through 163C, according to some aspects. In FIG. 164, top trace 16421 illustrates co-polarization and bottom trace 16423 illustrates cross-polarization. Based on this simulated result, 39.4 dB of polarization isolation is achieved. That is approximately a 16 dB improvement of cross-polarization suppression in comparison with the result shown in FIG. 161B for the orthogonal port case of FIG. 161A.

FIG. 165A illustrates a 4-port excitation antenna topology with feed lines from a feed source to each of the four ports, according to some aspects. The feed source may be a Radio Frequency Integrated Circuit (RFIC), to each of the four ports, according to some aspects. FIG. 165B illustrates the feed lines in the 4-port configuration of FIG. 165A with the driven patch of the stacked patch antenna superimposed on the feed lines according to some aspects. In FIG. 165A the feed lines are illustrated as being on substrate 16501. The vertical feed source P1V at 16508, which is an RFIC port according to some aspects, is connected to T-junction splitter 16505 which is connected to line 16507A which connects to the feed point 16507 of the antenna for vertical polarization. Line 16509A connects from T-junction splitter 16505 to feed point 16509 for the anti-polarization V, according to some aspects. Horizontal feed source P1H, which is an RFIC port according to some aspects, is illustrated at 16512 as connected to T-junction splitter 16514. Line 16511A is connected from the splitter 16514 and proceeds to the horizontal polarization feed point 16511, while line 16513A that is connected to the splitter 16514 proceeds to anti-H feed point 16513. In FIG. 165B the feed line configuration of FIG. 165A is illustrated with the driven element of a stacked patch antenna superimposed at 16515. The rest of the feed sources and feed lines are similar to or the same as those in FIG. 165A. Such configuration helps in reducing size, feed network losses, and cost while maintaining the enhanced isolation and cross-polarization parameters.

FIG. 165C illustrates a 12-level stack-up for the aspect of FIG. 165B. Paths and configurations from RFIC 16510 to the stripline T-junction splitter are implemented in layer L7 of the package stack-up of FIG. 165C, according to some aspects. Layer L7 is above another ground layer of L8 as shown in FIG. 165C, according to some aspects. The proposed 4-port antenna structure can use simple and compact T-junction splitters, seen in FIG. 165A at 16505, 16514 as the signal feed network, as it does not require rat-race ring to isolate the polarization, and thus results in simplification of signal feed network.

In the stack-up of FIG. 165C, the antenna with ground is designed in the first 6 layers (L1-L6) and the signal feedlines are designed in layer L7, in some aspects. In the aspect under discussion T-junction power splitters 16505, 16514 are implemented in signal feed layer in L7. Vertical polarization source 16508 of RFIC 16510 is connected to T-junction splitter 16505. Splitter 16505 connects to line 16507A which connects to vertical port 16507. Line 16509A connects from splitter 16505 to anti-V port 16509. Horizontal polarization source 16512 of RFIC 16510 is connected to T-junction splitter 16514. Splitter 16514 connects to line 16511A to feed H port 16511. Line 16513A connects to splitter 16514 to provide an anti-H signal to anti-H port 16513. The 180-degree phase difference for each polarization port may be created by phase delay that is designed by the physical transmission line length difference or by a phase shifter, in some aspects. Those of ordinary skill in the art would recognize that other stack-up designs are possible.

As explained above, in order to suppress the cross-polarization level, the cancellation ports are introduced to the orthogonal excitation antenna structure. Since the two facing ports have a 180-degree phase difference, the unwanted coupled signal can be cancelled. Thus it results the enhancement of polarization isolation. However, additional methods of cross-polarization suppression in an array configuration may be implemented. One such method is 4-port antenna array excitation discussed below.

Since cross-polarization is suppressed in a single element as discussed above, the array antenna that includes a 4-port excitation antenna can also achieve higher polarization isolation and cross-polarization suppression. FIG. 166A illustrates a 4×4 antenna array schematic using 4-port elements integrated with feed networks, according to some aspects. Illustrated at 16600 is the 4×4 antenna array on PCB 16601, with four of the sixteen antenna elements enumerated at 16603, 16605, 16607, and 16609. Feed network 16603H (horizontal) and 16603V (vertical polarization) for antenna element 16603 is similar to the dual T-splitter feed circuitry of FIG. 165B. Each antenna array includes 4-port excitation antenna elements as shown in FIG. 165B with 0.52λ distance between each antenna element.

FIG. 166B and FIG. 166C illustrate simulated radiation pattern results for the 4-port antenna array of FIG. 166A, according to some aspects. Based on the simulated results, approximately 61 dB of polarization isolation is achieved as seen by the difference between point m1 and point m2 on the simulated patterns 16621 and 16623 of FIG. 166B, where top trace 16621 illustrates the co-polarization and bottom trace 16623 illustrates the cross-polarization. This is approximately 37 dB of improvement in comparison with the dual-polarized array of FIG. 4B.

In addition, the simulated radiation pattern result at a+45-degree scan angle is shown by the difference between point m1 and point m2 on the simulated patterns 16622 and 16624 of FIG. 166C, where top trace 16622 illustrates the co-polarization and bottom trace 16624 illustrates the cross-polarization. Approximately 59 dB of polarization isolation is achieved. That is approximately a 40 dB improvement of cross-polarization suppression in comparison with the result shown in FIG. 162C. Even at a 60-degree scan angle, 57 dB of polarization isolation can be achieved as seen in FIG. 166C. This confirms that the array including the proposed 4-port antenna elements can achieve higher polarization isolation even at higher scan angles.

In addition to the 4-port excitation array antenna, the antiphase cancellation technique can be realized by create arrays using 2-port orthogonal excitation antenna element appropriately in N-by-M array configuration (N and M are even numbers, e.g., 2×2, 2×4, 4×4, and so on). By aligning one array subsection with other adjacent array subsections, inverted in vertical and/or horizontal directions, the disclosed antiphase cancellation technique can be realized in antenna array configurations as discussed below.

A first configuration is shown in FIG. 167A. FIG. 167A illustrates an array configuration using 2-port dual-polarized antenna elements, according to some aspects. An array of 2-port dual-polarized antenna elements, such as described above is which uses 2-port dual-polarized antenna elements shown at 16700 of FIG. 161A as including arrays 16706, 16708, 16710, and 16712. Each antenna element has the 2-ports such as seen at [P11, P12], [P13, P14], [P21, P22], [P23, P24] for array subsection 16706, where the ports are configured to be pairwise fed with V polarization and H polarization signals, according to some aspects. Each 2×2 element subsection is inverted with respect to each of the other subsections in the array to configure the 4×4 array.

For example horizontal inversion between arrays 16706 and 16708 is illustrated by ports P15, P17, P25, P27 being inverted horizontally with respect to ports P11, P13, P21 and P23. Vertical inversion between arrays 16706 and 16710 is illustrated by ports P32, P34, P42 and P44 being vertically inverted with respect to ports P12, P14, P22 and P24. Horizontal and vertical inversion between the ports of the elements of the remaining 2×2 subsections is similarly illustrated. By exciting each 2×2 array subsections with 180-degree phase difference signals, this 4×4 array antenna can further suppress cross-polarization. FIG. 167B and FIG. 167C illustrate simulated radiation pattern results of the antenna array of FIG. 167A, according to some aspects.

In FIG. 167B, top trace 16721 illustrates the co-polarization and bottom trace 16723 illustrates the cross-polarization. Based on the simulation results, approximately 54.8 dB of polarization isolation is achieved, which is approximately 32 dB of improvement in comparison with FIG. 162B. In addition, the simulated radiation pattern at a+45-degree scan angle is shown in FIG. 167C where top trace 16722 illustrates the co-polarization and bottom trace 16724 illustrates the cross-polarization. Approximately 56 dB of polarization isolation is achieved. That is approximately 36 dB of cross-polarization suppression in comparison with the result shown in FIG. 162C. In this case also, higher cross-polarization suppression is maintained even at higher than 60 degree scan angles as seen from comparison of the dB difference between the respective co-polarization and cross-polarization plots of FIGS. 167B and 167C.

FIG. 168A illustrates another array configuration using 2-port dual-polarized antenna elements, according to some aspects. Illustrated are 2×2 array subsections 16806, 16808, 16810 and 16812. The antenna elements of the 2×2 array have each adjacent antenna element within the 2×2 array subsection inverted with respect to each of the other antenna elements within the 2×2 array subsection. For example, port P11 of element 16806A is horizontally inverted with respect to port P13 of element 16806B. Port P12 of element 16806A is vertically inverted with respect to port P22 of element 16806C. Ports P11 and P12 of element 16806A are each inverted with respect to ports P24 and P23 of element 16806D, which is diametrically opposite to element 16806A. In this case Port P11 is horizontally inverted with respect to port P23 and port P12 is vertically inverted with respect to port P24. In general, each element has one port inverted with respect to another element that is situated at right angles to it in the subsection, and has two ports inverted with respect to the element that is situated diametrically opposite to it in the subsection, in the aspect under discussion. Generally, some degradation may be expected in comparison with ideal symmetrical array configurations. Avoiding asymmetricity can be expected to achieve better antenna performance.

By exciting each adjacent antenna element with 180-degree phase difference signals, this array antenna configuration can suppress the cross-polarization level. FIG. 168B and FIG. 168C illustrate simulation results on radiation patterns for the antenna array configuration of FIG. 168A, according to some aspects. In FIG. 168B top trace 16821 illustrates the co-polarization and bottom trace 16823 illustrates the cross-polarization. Based on the simulation results, 63.5 dB of polarization isolation is achieved which is approximately 40 dB improvement in comparison with FIG. 162B. In addition, the simulated radiation pattern at a+45-degree scan angle is shown in FIG. 168C where top trace 16822 illustrates the co-polarization and bottom trace 16824 illustrates the cross-polarization. Approximately 74 dB of polarization isolation is achieved which is approximately 55 dB of cross-polarization suppression improvement in comparison with the result shown in FIG. 162C. In this case also high value of cross-polarization suppression is maintained even at higher than 60 degree scan angles.

The ubiquity of wireless communication has continued to raise a host of challenging issues. In particular, further challenges have evolved with the advent of 5G due to both the wide variety of devices with disparate needs and the spectrum to be used. Challenging issues arise, among other reasons, because of need for spatial coverage of radiated radio waves, and of maintaining signal strength as the mobile device is moved to different places, or because a user may orient the mobile device differently from time to time. This can lead to the use of a large number of antennas, varying polarities, direction of radiation, varying spatial diversity of the radiated radio waves at varying time, and related issues. In particular, the ranges of frequency bands used in communications has increased, most recently due to the incorporation of carrier aggregation of licensed and unlicensed bands and the upcoming use of the mmWave bands.

One issue of increasing concern is the inefficiencies associated with millimeter wave beamforming antennas. More specifically, a millimeter wave beamforming antenna generally provides coverage in one direction and has a narrow beam. In instances where the millimeter wave antenna is mobile (e.g., V2X mmWave communications), it will often need to align to a base station in one direction and after a certain time it may need to align in a different direction. Additionally, a single millimeter wave antenna can be inefficient when communicating in high frequencies as the signal penetration loss through the air can be high (e.g., 60 dB loss for the first meter versus 36-38 dB loss for the first meter for 2G/3G/4G communications).

Aspects relate to systems, devices, apparatus, assemblies, methods, and computer readable media for mmWave beam steering and antenna switching to provide 360° coverage. The mmWave beam steering and antenna switching aspects can be incorporated in the mmWave communication circuitry 300 shown in FIG. 3A, although the mmWave beam steering and antenna switching aspects are not limited to such. An antenna block can include multiple (e.g., at least four) phased antenna arrays, where each antenna array can be dual polarized (e.g., horizontally or vertically polarized) so that beams can be steered horizontally or vertically. Additionally, each of the phased antenna arrays within the antenna block can be associated with a separate transceiver so that one or more of the transceivers can be dedicated to scanning for available eNBs, while remaining one or more transceivers can be used for mmWave signal communication. For example two of the available transceivers can be used for 2×2 MIMO communications with an eNB, while remaining two transceivers can be used for scanning of available eNBs for subsequent handover.

FIG. 169 illustrates a mast-mounted mmWave antenna block with multiple antenna arrays for vehicle-to-everything (V2X) communications according to some aspects. Referring to FIG. 169, the antenna block 16900 can include antenna arrays 16906, 16908, 16910, and 16912, which can be mounted on an antenna mast 16916. The antenna mast 16916 with the antenna arrays 16906-16912 can be mounted on a platform 16914. The platform 16914 can be a printed circuit board and can include one or more other components such as transceivers and/or other components illustrated in FIG. 174. In some aspects, the antenna block 16900 can be used for millimeter wave communications in a mobile unit (e.g., a vehicle). In this regard, the antenna block 16900 can include an aerodynamic cover 16902, such as a "shark fin" cover for mounting on a vehicle roof.

As illustrated in FIG. 169, each of the four antenna arrays 16906-16912 can be mounted on the antenna mast 16916 in a configuration 16904 where each of the arrays is offset by a 90° from a neighboring antenna array. In this regard, if a first antenna array (16906) is facing in a Western direction, the remaining arrays (16908, 16910, and 16912) are facing in a Northern, Eastern, and Southern directions, respectively. Even though the antenna block 16900 is illustrated with four antenna arrays, the disclosure is not limited in this regard and a different number of antenna arrays in a different configuration can be used as well.

FIG. 170 illustrates exemplary beam steering and antenna switching in a millimeter wave antenna array communicating with a single evolved Node-B (eNB) according to some aspects. Referring to FIG. 170, a communication system 17000 can include the antenna block 16900 of FIG. 169 with four antenna arrays 16906-16912 in communication with an eNB 17002. The antenna block 16900 can be located on a moving vehicle and FIG. 170 illustrates three separate positions of the antenna block 16900 as the vehicle moves from position P1 to position P3. As seen in FIG. 170, at time instance T1, the vehicle with antenna block 16900 is at position P1 and is using antenna array 16910 to communicate with the eNB 17002. As the vehicle with antenna block 16900 moves to position P2 at a time instance T2, the antenna block 16900 can continue to use antenna array 16910 (with a different beam than the beam used at position P1) to communicate with the eNB 17002. As the vehicle with antenna block 16900 moves to position P3 at a time instance T3, the antenna block 16900 can switch the antenna arrays and use antenna array 16908 to communicate with the eNB 17002 (since the antenna array 16908 is facing in the direction of the eNB 17002). Received signal strength of signals originating from the eNB 17002 can be used to determine (or estimate) direction of the received signals (e.g., direction of the eNB 17002) and use a corresponding antenna array that is aligned with the determined direction of the eNB.

FIG. 171 illustrates exemplary beam steering and antenna switching in a millimeter wave antenna array communicating with multiple eNBs according to some aspects. Referring to FIG. 171, a communication system 17100 can include the antenna block 16900 of FIG. 169 with four antenna arrays 16906-16912 in communication with eNBs 17102 and 17104. The antenna block 16900 can be located on a vehicle moving in the direction 17106, from position PO to position P4. In some aspects, each of the four antenna arrays 16906-16912 can be associated with a corresponding transceiver, which can operate on one or more millimeter wave bands. As seen in FIG. 171, at time instance TO, the vehicle with antenna block 16900 is at position PO and is using antenna array 16912 to communicate with eNB 17104 via antenna beam 17112.

In some aspects, each of the antenna arrays 16906-16912 can be dual polarized phased antenna arrays, so that one horizontally polarized and one vertically polarized beam can be communicated simultaneously from an antenna array (e.g., 2×2 MIMO configuration) using two transceivers. For example, antenna array 16912 can be communicating in a 2×2 MIMO configuration with eNB 17104 via two transceivers, using a vertically and a horizontally polarized beam represented as beam 17112 (e.g., one transceiver can communicate with a vertically polarized beam and antenna array 16912 and a second transceiver can communicate with a horizontally polarized beam using the same antenna array 16912).

Since two transceivers are used for communication with eNB 17104, the remaining transceivers (e.g., two remaining transceivers in instances where a fourth transceiver communication device is used in the vehicle as illustrated in FIG. 174) can be used to scan the available communication channels for another eNB. For example and as seen in FIG. 171, one or more of the remaining antenna arrays 16906-16910 can use one or more beams 17108 to scan for available eNBs. In some aspects, one or more of the scanning beams 17108 can determine that another eNB 17102 is available for communication. The transceivers associated with the scanning beams 17108 can be used to receive signals from the eNB 17102, and the received signals can be further processed to determine receive signal strength indicator (RSSI) or other signal quality metrics associated with those signals. A decision on whether or not to switch to the new eNB can be made based on the RSSI or the other quality metrics.

At time instance T1, the vehicle with antenna block 16900 is at position P1 and is using antenna arrays 16912 and 16910 to communicate with eNBs 17104 and 17102 simultaneously, using antenna beams 17114 and 17116 respectively. Communication between the vehicle with antenna block 16900 and eNBs 17104 and 17102 can use 2×2 MIMO communication with dual polarized antenna arrays 16912 and 16910, using all four available transceivers. At time instance T1, a processor associated with the antenna block 16900 (e.g., application processor 17403 in FIG. 174) can determine based on signal quality measurements to switch from eNB 17104 to eNB 17102, while the antenna block is connected to both eNBs 17104 and 17102. For example, switching between eNBs can be based on the received signal quality (e.g., received signal strength) falling below a threshold level.

At time instance T2, the vehicle with antenna block 16900 is at position P2 and is using antenna beam 17118 associated with antenna array 16910 to communicate only with eNB 17102. Similarly, at time instance T3, the vehicle with antenna block 16900 is at position P3 and is using antenna beam 17120 associated with antenna array 16910 to communicate with eNB 17102. While at position P3, remaining transceivers, which are not used for transmitting beam 17120, can be used to scan available communication channels to the eNB 17102 using one or more of the remaining antenna arrays. In instances when signal quality from one or more of the remaining arrays is higher At time instance T4, the vehicle is at position P4 and has switched from antenna array 16910 to antenna array 16908 in order to communicate with eNB 17102 using antenna beam 17122. Communication with the eNB 17102 can be performed using a millimeter wave 2×2 MIMO configuration, using two transceivers and dual polarization for the antenna array 16908 (e.g., one vertically polarized from one transceiver and one horizontally polarized beam from a second transceiver can be used for communication with the eNB 17102). While the millimeter wave communication device (e.g., 17400) using antenna block 16900 is communicating with the eNB 17102 via antenna beam 17122 and two of the available transceivers, the remaining transceivers can use one or more of the remaining antenna arrays to scan available communication channels using scanning beams 17110.

In some aspects, one or more of the transceivers within the millimeter wave communication device (e.g., 17400 in FIG. 174) can be dedicated scanning transceivers and use one or more of the antenna arrays 16906-16912 two constantly scan available communication channels for a new eNB or base station. In this regard, the millimeter wave communication device can be connected to a first eNB (e.g., 17104) and after the dedicated scanning transceivers locate a second eNB (e.g., eNB 17102), connection can be established to both eNBs 17104 and 17102 (as seen in FIG. 171 at position P1). At time instance T2, a soft handoff has been achieved as the millimeter wave communication device has interrupted connection to eNB 17104 and is only communicating with eNB 17102 via antenna beam 17118.

In some aspects, one or more of the receivers within the millimeter wave communication device can be dedicated to scanning the available communication channels for a new eNB. Once a new eNB is detected and the signal quality indicators are above a threshold level for the received signals, a heart handoff can be performed by stopping communication with a current eNB and then initiating a connection with the new eNB.

FIG. 172 illustrates simultaneous millimeter wave communications with multiple devices using an antenna block with multiple antenna arrays according to some aspects. Referring to FIG. 172, the communication system 17200 includes multiple vehicles (17204, 17206, and 17208) and an eNB 17202. Each of the vehicles 17204-17208 can be configured with an antenna block (e.g., 16900) and a millimeter wave communication device (e.g., 17400) configured to communicate on one or more millimeter wave frequency bands and or one or more other communication bands.

In some aspects, vehicle 17208 can be immobile due to an accident or other road hazard indicated as 17210. Vehicle 17206 can include onboard vehicle cameras and or proximity sensors, which can detect the road hazard 17210 using scanning signals 17212. Vehicle 17206 can use a first antenna array to communicate via beam 17216 with eNB 17202, and use a second antenna array to communicate via beam 17220 with a neighboring vehicle 17204. In some aspects, vehicle 17206 can use communication via beam for 17002 notify vehicle 17204 of the detected road hazard 17210 while vehicle 17206 is in communication with the eNB 17202 via beam 17216.

In some aspects, the eNB 17202 can be notified of the road hazard 17210 (e.g., by vehicle 17208 or another vehicle), and the eNB 17202 can notify other vehicles that it is in communication with of the road hazard 17210. In instances when vehicle 17204 receives notification of the road hazard 17210 before vehicle 17206 does, vehicle 17204 can use communication via beam 17218 to notify vehicle 17206 of the upcoming road hazard 17210.

In this regard, each of the vehicles 17204-17208 can use multiple transmit and receive communication paths simultaneously. For example, in instances when to transmit/receive paths are communicating with the eNB, remaining paths can be used for communication with a neighboring vehicle using V2V communications (or communications with infrastructure or a person using V2X communications).

In some aspects, an application processor (e.g., 17403) can use 4G/LTE communications with the eNB 17202, 5G communications with another vehicle (V2V communications), and Wi-Fi/802.11 communications for a vehicle-to-person interface.

FIG. 173 illustrates multiple beams, which can be used for millimeter wave communications by an antenna block that includes multiple antenna arrays according to some aspects. Referring to FIG. 173, the communication system 17300 can include an antenna block 17304 (which can be part of a millimeter wave communication device such as device 17400) in communication with an eNB 17302. The antenna block 17304 can include dual polarized antenna arrays 17306-17312.

Since the millimeter wave communication device using antenna block 17304 can be moving, beam acquisition can be performed as a millimeter wave communication link is established with the eNB 17302. For example, the millimeter wave communication device can go through the available beams 17314-17318 and measure RSSI (or another signal quality indicator) for each available beam, and select the beam with a highest measured signal quality indicator (e.g., beam 17316). A table of the measured signal quality indicators can be stored for subsequent reference and use to switch beams or perform handover.

In some aspects, the communication beams can be preselected to cover a given area so directions of each beam can be known (or direction can be calculated based on phase shifters are faced setting used for the beam). In this regard, once a beam is selected for communication with an eNB, the direction of the eNB can be determined. As the vehicle moves, a different beam can be selected based on the direction of travel and the direction of the current eNB.

FIG. 174 is a block diagram of an example millimeter wave communication device using the antenna block with multiple antenna arrays of FIG. 169 according to some aspects. Referring to FIG. 174, the communication device 17400 can include an application processor 17403, a modem 17402, an intermediate frequency (IF) conversion block 17404, a transceiver array 17440, a switch array 17450, and an antenna array set 17460.

The antenna array set 17460 can be similar to the antenna block 16900 of FIG. 169. More specifically, the antenna array set 17460 can include dual polarized antenna arrays 17424, 17426, 17428, and 17430. Each of the antenna arrays 17424-17430 is associated with a corresponding transceiver 17442, 17444, 17446, and 17448 within the transceiver array 17440. As seen in FIG. 174, each of the antenna array 17424-17430 is a dual polarized antenna array (e.g., 4×4 antenna array) and can receive two separate IF data inputs, which can be of different polarization (e.g., horizontal or vertical) and can be transmitted simultaneously by two of the transceivers within the transceiver array 17440.

The switch array 17450 includes signal switches 17408, 17410, 17412, and 17414, which can be coupled to corresponding IF data inputs 17406. Each of the switches 17408-17414 generates corresponding switched output signals 17416, 17418, 17420, and 17422 communicated to the antenna array set 17460.

In operation, data from the modem 17402 can be converted to IF data 17406 via the IF conversion block 17404. The IF data 17406 can be communicated to the switch array 17450. The application processor 17403 can determine, which transceivers and, which antenna arrays can be used for communicating signals with an eNB and/or another vehicle, and, which transceivers and antenna arrays can be used to scan one or more communication channels for available eNBs or base stations. In this regard, the application processor 17403 can fire one or more of the switches 17408-17414 within the switch array 17450, with one or more of the switched output signals 17416-17422 being communicated to corresponding antenna arrays within the antenna array set 17460.

RF sub-systems ((RF-sub-systems) or (RFSs)) need to be integrated into newer mobile wireless devices for WiGig and 5G aspects, due to high data rate requirements. Such kinds RF-sub-systems often use microstrip antennas configured as microstrip arrays, given the small sizes desired for operation at WiGig and 5G frequencies. A microstrip antenna (also known as a printed antenna) usually means an antenna fabricated using microstrip techniques on a printed circuit board (PCB). An individual microstrip antenna usually includes of a patch of metal foil of various shapes (a patch antenna) on the surface of a PCB, with a metal foil ground plane on the other side of the board, or a ground plane at an internal level of the PCB. Microstrip antennas radiate primarily at broadside, which may not suitable for all the use cases of 5G and WiGig operation. WiGig RF sub-systems are often placed at lids in laptops due to the radiating direction constraints of the microstrip antennas used. In addition, broadside radiation may cause Specific Absorption Rate (SAR) issues, if the antenna radiates towards the human body (or towards a display) in a 5G mmWave handheld system. Solutions to these issues may include using multiple RFSs stacked back-to-back to get all-round coverage for 5G. But this increases thickness and cost of the device, requires a wide area on the surface of a PCB making the sub-system larger than may be needed for optimum or improved design. Further, microstrip antennas generally cannot achieve wide bandwidth and, in fact, can sometimes achieve only a narrow bandwidth. An array of such microstrip antennas can in some circumstances be designed to radiate in all the directions, but still there is still a wide scope available to improve the overall performance, such as improving bandwidth and RFS size. Patch antennas generally do not provide wide bandwidth and may not lend themselves to this type of improvement. Therefore, there is a need for antennas and antenna arrays that be used for WiGig and for 5G technology, and for other mmWave antenna designs.

A solution to the above is a via-antennas including substrate vias manufactured by a PCB fabrication process. In various aspects, via-antennas occupy less surface area than other antennas and have bandwidth useable in 5G technology due to the 3D structure of the vias used for via-antennas. Via-antennas provide a manufacturing advantage in that the can be designed in internal layers of the RFS, of the PCB, which includes dielectric layers, or of the motherboard, in some aspects. Further, via-antennas can be made essentially invisible because of being able to be placed at internal, not-visible, layers of a PCB. Via-antennas can be designed as a monopole or as a dipole. For example, a single fed via aspect will function as a monopole via-antenna while a back-to-back via aspect will result in a via-antenna that functions as a dipole. Additionally, via-antennas can be configured as arrays that provides end-fire radiation, highly desirable for 5G technology use cases. The end-fire radiation pattern of a via-antenna can be useful for WiGig RFS placement at the base of a laptop thus reducing cable length and loss. Further, still, in some aspects in-board via-antennas can be designed for 5G and WiGig technology, to provide an option to place either a WiGig RFS or a 5G RFS at the base of a laptop. Via-antennas can also be integrated with a motherboard without losing a desired radiation direction. Other advantages include a reduction of the number of RFSs needed for 5G operation because a via-antenna array can be configured for end-fire radiation with at least two directions of coverage, a result that utilized multiple RFSs in earlier designs.

A design cost savings is also provided because the via-antenna can be an integral part of a PCB. The via-antenna can also be designed in essentially any intermediate layers of a PCB together with the feed network for the via-antenna. As discussed above, in some situations, it is difficult to get full, 360 degree coverage with only one RF. The solution to this may include using multiple RFSs stacked back-to-back to get 360 degree coverage for 5G. But this increases thickness and cost of the device, requires a wide area on the surface of a PCB making the sub-system larger than may be needed for optimum or improved designed. Via-antennas, on the other hand, when placed back-to-back, provide good all round coverage, and can resolve this issue while using only a single RFS.

Available solutions for 5G RFS have patch antennas printed on a PCB. Due to the unidirectional radiation of a patch antenna, a 5G system may require more than one RFS for maximum directional coverage. Adding more RFSs in the system occupies more space and also additional cost. Similarly, existing WiGig RFSs have an active antenna array of microstrip and planar dipole antennas. The array is designed to radiate in all the directions but still there is still a wide scope available to improve the overall performance, such as improving bandwidth and RFS size. Patch antennas generally do not provide wide bandwidth and may not lend themselves to this type of improvement.

The current standard WiGig RFS size is approximately 20×7×1.7 mm (Length × Width × Height). The RFS length can be reduced further by using the proposed via-antenna array, without compromising performance. Current WiGig RFSs can be placed primarily at the LID of the laptops. But using the proposed via-antenna implementation in RFSs will provide the option to place the RFS at the base of the laptop, and other locations in some aspects. Via-antennas can be designed inside the PCB using multiple internal dielectric layers of the PCB. This gives flexibility to design via-antenna arrays and feed networks in essentially any of the layers of the PCB help tune antenna parameters, according to some aspects.

FIG. 175A is an illustration of a via-antenna array configured in a mobile phone, according to some aspects. The via antenna array described herein can be incorporated in the antenna array circuitry 330 of mmWave communication circuitry 300 shown in FIG. 3A, although the via antenna array is not limited to such. FIG. 175A illustrates arrays of via-antennas 17505, 17507 on a mobile phone. Because of the ability of a via-antenna to radiate in two directions, a via-antenna, or here a four element via-antenna array such as at 17505, can be placed substantially parallel to the X axis to radiate in the Y direction of the illustrated mobile phone as at 17505A, 17505B. For the same reason, four element via-antenna 17507 can be placed substantially parallel to the Y axis to radiate in the X-direction of the illustrated mobile phone as at 17507A, 17507B, according to some aspects.

FIG. 175B is an illustration of a via-antenna array configured on a motherboard PCB, according to some aspects. Motherboard 17502 including circuit components and conductive lines at 17509, includes a via-antenna array at 17511. Because of the via-antenna's ability to radiate in two directions, radiation, as in the case of a mobile phone, can also be in two directions, 17511A and 17511B.

FIG. 175C is an illustration of a via-antenna array configured in a laptop, according to some aspects. Because of the two-direction radiation of a via-antenna discussed above, via-antenna array placement is not limited to the lid of a laptop at 17517 with radiation directions 17517A, 17517B, but can also be placed at 17519, with radiation directions 17519A, 17519B, and 17521 on the base of a laptop with radiation directions 17521A, 17521B, according to some aspects.

Generally speaking, a via-antenna arrays can be placed in any location that meets the directional, frequency, and radiation pattern requirements of the use case at hand. One important advantage is that via-antennas can be placed so as to help reduce Specific Absorption Rate (SAR). In other words, as illustrated in FIG. 175A for a mobile phone, via-antenna arrays can be placed such that their strongest radiation is in a direction away from a person's ear when speaking into the mobile phone. As can be seen in FIG. 175A, primary radiation may be in the Y-direction (17505A, 17505B) or X-direction (17507A, 17507B), while the user of the mobile phone would generally be in the Z-direction (where the Z-direction would be into or out of the page), in some aspects.

An additional advantage has to do with providing radiation in a single direction if desired. While radiation of a via-antenna is generally in two opposing directions, if radiation is desired in a single direction a metal reflector can be placed opposite the via-antenna or via-antenna array in the direction of the undesired radiation, in order to reflect the radiation in the desired direction, according to some aspects.

Vias within in PCBs have generally been used for interconnecting metal traces into multiple layers. PCB vias can have different shapes and sizes, such as cylindrical, rectangular, conical, and other geometrical shapes. The via-antenna can be designed hollow or solid in some aspects. Sometimes a via is plated, with the hole of the via not filled by metal, making the via hollow. In other examples, the hole of the via can be fully or partially filled by metal, to make it solid. The difference may depend on the PCB manufacturing process for the via and/or the requirements of the use case. Performance can be simulated in an effort to reach the desired requirements, according to some aspects. The via-antenna can be fed at the edge or center of the bottom of the via, according to some aspects. The ground and bottom of the via-antenna can be designed in the same plane and fed using a coplanar waveguide (CPW) line. A via can be fabricated through any number of layers into the PCB. The described via-antenna can also be designed using the same approach, according to some aspects.

FIG. 176A is a cross section view of a via-antenna in a multilayer PCB, according to some aspects. PCB 17600 is illustrated as a stack-up 17601 having N layers, Layer 1 through Layer N, where N is a whole number, according to some aspects. One or more of the layers may be a dielectric layer. Other layers may be conductive layers. Via 17603 is illustrated as having an internal section which may curved if the via is a conical via. However, the via for a via-antenna is not limited to a conical shape. The via can be conical, cylindrical, or any other shape that meets the requirements of the solution needed. The outer surface of the via is illustrated in cross section at 17603A and at 17603B, and the internal section is between 17603A and 17603B in the figure. Line 17605 may be a feed line, according to some aspects.

FIG. 176B is a perspective view of a via-antenna, according to some aspects. Via 17603 is illustrated in isometric view as being in a plurality of layers within PCB 17601, in some aspects. As discussed above, operation a via-antenna functions as monopole antenna. Consequently a via-antenna has a wider bandwidth than a microstrip antenna, giving the via-antenna an advantage particularly at millimeter wavelengths. Generally, a via-antenna performance is not PCB-dependent. Further, the gap G in FIG. 176A between the via-antenna and ground GND, and the generally conical shape of the via-antenna in this aspect, function to increase the bandwidth as compared to the usual microstrip antenna.

Performance is also affected by the layers, and the number of layers, used for the via. The layers used for the via can be a parameter that can be adjusted to provide the performance characteristics for the application at hand in various aspects, sometimes called "tuning" the antenna. In some aspects performance of a via-antenna in the upper layers of the PCB can be evaluated to determine whether the performance requirements at a given frequency of a design are met. If the requirements are not met, deeper layers of the PCB can be used for the via-antenna in a tuning process in an effort to reach the desired performance.

As one example of an advantage, if the desired performance requires additional height in one aspect of a via, the via can be reconfigured in one or more additional layers to increase the height. As another example of an advantage, the via-antenna 17603 of FIG. 176B appears at the top of the illustrated structure, which may be the lid of a laptop in some aspects. If it is desirable for the antenna not be seen on the lid, the via could be made at internal layers, not at the first layer or bottom layer, and the via-antenna would not be seen, should that be a desirable solution.

FIG. 177A is an illustration of a PCB via-antenna in an internal view from the top side of the via of a PCB, according to some aspects. The via-antenna 17703 is seen in PCB 17701 configured in various laminate layers. FIG. 177B is an illustration of a PCB via-antenna viewed from the bottom of the PCB, according to some aspects. Feeding can be at any desirable layer of the PCB. Feed line 17705 is illustrated, which in this example is a CPW. However, any planar feed mechanism can be used, such as stripline, microstrip line, or any other suitable transmission line. Radiation will be in a direction around the via of the via-antenna instead of vertical to the via, so the direction of radiation depends on where the via-antenna is placed, according to some aspects. The via-antenna can be designed hollow or solid, and fed at the edge or center of the bottom of the via, according to some aspects. The ground and bottom of the via-antenna can be designed in the same plane.

FIG. 178A is a top view of via-antenna array, according to some aspects. FIG. 178A shows a via-antenna array design in PCB 17801, where the number of antenna elements 17803 in an array can be decided on, based on antenna gain and beam width requirements, according to some aspects. The via-antenna would operate at edge-fire radiation which, as discussed above, is characteristic of monopole and dipole antennas. The via-antenna array may be placed in or as part of the RFS, or close to the RFS. In some aspects, a via-antenna array can also be designed in a separate, small PCB and then stuck to, or otherwise connected to, a motherboard or an RFS to avoid surface wave impact on antenna radiation or to provide reduction in other noise, or to provide radiation in difficult-to-reach directions that might be blocked by obstacles within the device in which the array finds use. FIG. 178B is an illustration of vertical feed for a via-antenna, according to some aspects.

FIG. 178C is an illustration of a horizontal feed for a via-antenna, according to some aspects. The via-antenna can be fed by vertical feed or horizontal feed, the selection of vertical or horizontal feed made in order to reduce feed line interference on antenna performance which is determined by design, according to some aspects. Generally, vertical feed is illustrated at 17805A where the via that is being fed is at 17803A as seen in FIG. 178B, according to some aspects. Horizontal feed is illustrated at 17805A' where the via that is being fed is at 17803A', according to some aspects. Both configurations excite the cone vertically so polarization will be the same for each type of feed.

Radiation can occur in two ways. One is radiation from the antenna through the air in a given direction of coverage. Another is radiation that travels through the dielectric material of the PCB itself, and ultimately radiates through the air. Consequently, the choice of dielectric material that is chosen is important in reducing unwanted radiation through the dielectric. Very low loss dielectric, with a lower dielectric constant, is desirable in order to reduce such radiation. An additional way to combat this type of unwanted radiation is to drill holes in the dielectric material near the via, which will tend to reduce if not remove this unwanted radiation. An example of this is seen in FIG. 188, according to some aspects. In the illustrated aspect, holes 18807 are drilled in PCB 18801 adjacent via-antenna 18803. The holes will function to reduce the unwanted radiation and reduce its effect on the array-antenna radiation because the holes prevent there being a continuous plane on which this radiation, sometimes called surface waves, can travel. In other words, the holes are effectively creating a discontinuous PCB so that surface waves, when generated, tend to die down and not affect antenna performance.

FIG. 179A is a perspective view of a back-to-back via configured as a dipole via-antenna, according to some aspects. The dipole via-antenna 17900 includes back-to-back vias 17903A, 17903B and are configured in 1.6 mm thick Flame Retardant 4 (FR4) substrate, according to some aspects. The height of the single cone via is 0.7 mm, the top and bottom diameters are 4 mm and 0.25 mm, respectively, and the gap between bottoms of the dipole is 0.2 mm, according to some aspects. FIG. 179B is a perspective view of the back-to-back vias of FIG. 179A configured as a dipole via-antenna illustrating PCB laminate layers, according to some aspects. The laminate layers of PCB 17901 are illustrated in side view with the back-to-back vias illustrated at 17903A, 17903A', according to some aspects. Feeding is illustrated by a feed line, such as described above, placed between the two vias 17903A, 17903B, according to some aspects. The feedline may be placed around the cylindrical at 17904, where feeding can be + and –, respectively, in some aspects. The design dimensions are obtained by simulation to obtain the performance desired for the use case.

FIG. 180 is a graph of return loss for the dipole via-antenna configurations of FIGS. 179A and 179B, according to some aspects. The dipole via-antenna operation is illustrated at a broad bandwidth from 27.5 GHz to 30.5 GHz. The four data points in triangles provide an indication of simulated results which are set forth in Table 7 for the aspect under discussion.

TABLE 7

| | |
|---|---|
| −9.05 dB | at 27.5 GHz |
| −12.7 dB | at 28 GHz |
| −24.4 dB | at 29 GHz |
| −16.3 dB | at 29.5 GHz |

FIG. 181A is a simulated far field coplanar radiation pattern for the dipole via-antenna configuration of FIGS. 179A and 179B at a frequency of 27.5 GHz using the Ludwig definition, according to some aspects. The main lobe magnitude is 2.08 dB at zero degrees with an angular beam width (3 dB) of 55.1 degrees, and with the side lobe level simulated as −12.7 dB for the aspect under discussion. The design illustrates good end fire gain and illustrates the pattern provides coverage in two opposite directions.

FIG. 181B is a simulated far field coplanar radiation pattern for the dipole via-antenna configuration of FIGS. 179A and 179B, at a frequency 28 GHz using the Ludwig definition, according to some aspects. The main lobe magnitude is 2.38 dB at zero degrees with an angular beam width (3 dB) of 54.9 degrees, with the side lobe level simulated as −12.2 dB. The design again illustrates good end fire gain and illustrates the pattern provides coverage in two opposite directions.

FIG. 181C is a simulated far field coplanar radiation pattern for the dipole via-antenna configuration of FIGS. 179A and 179B at a frequency 29.5 GHz using the Ludwig definition, according to some aspects. The main lobe magnitude is 2.03 dB at zero degrees with an angular beam width (3 dB) of 54.9 degrees, with the side lobe level simulated as −10.0 dB. The design again illustrates good end fire gain and illustrates that the pattern provides coverage in two opposite directions.

FIG. 182 is a two-element via-antenna array design for operation at 28 GHZ for 5G technology, according to some aspects. The two element via-antenna array design is for 28 GHz for 5G technology. The via-antenna is designed to cover the 5G millimeter wave frequency band from 27.5 GHz to 29.5 GHz. The top diameter of the cone is 3.6 mm and the bottom diameter of the cone is 0.4 mm. The height of the cone is 0.6 mm. The cone is designed on 0.8 mm thick FR4 PCB which has a dielectric constant 4.4. The antennas are horizontally placed corresponding to the feed to get end fire radiation, the distance between centers of the vias being 8.80 mm.

FIG. 183 is a simulated graph of antenna return loss for the two-element via-antenna array design of FIG. 182, according to some aspects. The simulation results include the return loss of both the antennas at 18310 and 18315, and the isolation between the antennas at 18320. Minimum return loss is at 29.5 degrees. Isolation at point 5 is −20.2 dB at 27.7 GHz and isolation at point 7 is −26.3 dB at 31.8 GHz.

FIG. 184A is a simulated radiation pattern of the two-element via-array of FIG. 182 operating at a frequency of 27.5 GHz, according to some aspects. The figure shows the antenna array radiation pattern 18401A at 27.5.

FIG. 184B is a simulated radiation pattern of the two-element via-array of FIG. 182 operating at a frequency of 29.5 GHz, according to some aspects. The FIG. shows the antenna array radiation pattern 18401B at 29.5 GHz.

FIG. 185 is a perspective view of a via-antenna designed in a PCB, according to some aspects. The figure shows the PCB has six dielectric layers and 0.8 mm thickness. The electrical permittivity of the dielectric material is 3.3, and the thickness of the fourth and fifth layers are 0.2 mm and the other layers are 0.1 mm. The via-antenna is designed through the third layer to the fourth layer of the PCB. The design dimensions and shape of the via are obtained by simulation to cover the WiGig frequency band which covers 57 GHz to 66 GHz.

FIG. 186A is a bottom view of the ground plane of the via-antenna of FIG. 185, according to some aspects. The antenna is fed at the edge of the smaller diameter of the cone.

FIG. 186B is a side view of the via-antenna of FIG. 185, according to some aspects. The dimensions are consistent with the dimensions of FIG. 185.

FIG. 186C is a perspective view of the via-antenna of FIG. 185, according to some aspects. The dimensions are consistent with the dimensions of FIG. 185 and FIG. 186B.

FIG. 187 is a simulated graph of via-antenna return loss for the via-antenna of FIG. 185, according to some aspects. At point 1 the return loss is −6.4 dB at 57.0 GHz. At point 2 the return loss is −8.7 dB at 66.2 GHz.

The ratio of undesired polarization radiation to the desired polarization radiation of an antenna or antenna array is known as cross polarization. The cross polarization affects antenna radiation efficiency and isolation between different polarized antenna elements of an antenna array. Typically, 3D-antenna elements over a contiguous ground plane exhibit some level of undesired cross polarization and undesired coupling to adjacent elements that degrade the antenna standalone efficiency and antenna array efficiency. At least one published paper describes antenna cross polarization reduction using defected ground structure (DGS) for planar antenna geometries. A review paper titled "Printed Antenna Designs Using Defected Ground Structures—FERMAT www.e-fermat.org/files/articles/1534d5380e9790.pdf" shows various DGS geometries under a microstrip patch antenna element to reduce cross polarization. Some of the DGS structures shown in the following figures are simulated with 3D cone antennas. These structures so not show significant reduction in cross polarization. Such structures may be suitable for planar antenna but not for 3D monopole/cone type of antenna structures.

It has been found that modifying the ground plane under the 3D-antenna which may be perpendicular to ground, will reduce cross polarization and element to element coupling for arrays, thus improving the antenna standalone efficiency and the antenna array efficiency, according to some aspects. FIGS. 189A through 190C illustrate components of a modified, ground structure for a 3D cone antenna, according to some aspects.

FIG. 189A illustrates a top view 18900 of a 3D conical antenna element 18901 on PCB 18903 where the antenna element may be soldered to the top of the PCB. The antenna element is fed by feed line 18905 which in some aspects would be on the top of PCB 18903. FIG. 18902 illustrates at 18902 the ground plane 18907 for the conical 3D antenna of FIG. 189A, which ground plane is within the PCB, according to some aspects.

FIG. 189B illustrates a ground plane under a 3D antenna, according to some aspects. The ground plane 18907 may be copper.

In FIG. 189C a ground plane modification, such as modified ground plane 18908, is shown on PCB layer 18909, according to some aspects, includes selectively slotting and thereby modifying the contiguous ground plane as seen at 18911, under the 3D-antenna 18901, which induces an electromagnetic effect that reduces cross polarization and improves desired radiation gain, in some aspects. Areas 18910, 18912 are areas without metal.

When configured in an array, such aspects break up the contiguous ground plane and will also reduce the element to element coupling in the array and reduce one or more attendant surface waves. Such aspects will improve 5G and WiGig antenna array radiation efficiency, and will be useful for 5G, WiGig, and or other millimeter wave monopoles like antenna types where antennas are designed to work on some sort of PCB. Some aspects employing such modifications have been found to exhibit a significant improvement in cross polarization.

Cross polarization radiation was reduced in some aspects by −7 dB and co-polarization radiation improved by 1 dB in those aspects, thus making the improvements described herein ideal for polarization diversity in Multiple Input-Multiple Output (MIMO) systems.

FIG. 189D illustrates 3D cone antennas such as 18901 with various defected ground planes such as 18911'. At least some of the implementations in this figure were simulated. The results of the simulation showed that these defected ground structures do not show any significant rejection in cross polarization as does the configuration of FIGS. 189A through 189C. Defected ground structures do not appear to be suitable to decrease cross polarization for a 3D monopole/cone type of antenna.

The improvements described herein will, in some aspects, improve the performance and behavior of 3D-monopole antenna elements that reside over a ground plane in a PCB. This is especially applicable to millimeter wave (mmWave) applications where the antenna arrays are typically used. In such antenna arrays, each antenna is designed to ideally radiate in a desired polarization. However, in reality, in addition to the desired radiated polarization, there is leakage into polarization that is essentially perpendicular to the desired polarization. In some aspects the disclosed ground plane modification under the antenna radiator element will decrease leakage to the undesired polarization and improve the radiation in the desired polarization, thus improving the antenna efficiency and making it more suitable to be used as part of an antenna array.

The use of monopole type antennas for 5G and WiGig applications in small form-factor devices has some physical advantage over microstrip patch antennas, in some aspects. However, monopole antennas exhibit higher cross-polarization which affects the antenna radiation efficiency, and isolation between vertical and horizontal polarization. To resolve the cross polarization issue, or in some aspects improve the cross polarization issue, the antenna ground beneath the monopole antenna can be selectively modified to reduce the radiation leakage to the undesired polarization as discussed above, for some aspects.

The antenna structures described herein can be incorporated in the antenna array circuitry 330 of mmWave communication circuitry 300 shown in FIG. 3A, although the antenna structures are not limited to such. FIGS. 190A through 190C illustrate an example of a cone shaped monopole antenna structure with different types of ground planes, according to some aspects. In FIG. 190A, 19000 shows monopole 3D antenna 19001 on a large ground plane 19007. In FIG. 190B, 19002 is an illustration of a 3-D conical monopole antenna 19001 with a finite square shaped ground plane 19009. Although a square shaped ground plane is illustrated, other shapes, such as rectangular or circular, can also be used. At 19004, FIG. 190C shows a diagonally slotted finite ground plane 19009 under the conical shape antenna 19001, where the diagonal slots are seen at 19011, according to some aspects.

In FIGS. 190A through 190B, the antenna 19001 is essentially vertical and the ground plane is horizontal, e.g., the two are perpendicular to each other. The antenna 19001 with different ground planes as illustrated in FIGS. 190A through 190C have been simulated using EM-simulation software, Computer Simulation Technology™ (CST) to illustrate the results of the disclosed aspects. These results are illustrated in FIGS. 191A and 191B. FIGS. 191A and 191B illustrate radiation pattern comparison between the antenna structures of FIG. 190A through 190C, according to some aspects.

FIG. 191A illustrates cross-polarization comparison of the large ground plane case of FIG. 190A, the square ground plane case of FIG. 190B, and the slotted ground plane case of FIG. 191C. FIG. 191A illustrates that the large ground 19003 and the finite square shape ground plane 19009 have very similar cross polarization levels, with peaks of approximately −3 dB, according to some aspects. The modified ground has significantly lower cross-polarization level, with very low peaks of approximately −10 dB for the same conical antenna 19001, according to some aspects.

FIG. 191B illustrates that antenna co-polarization radiation gain for the three different ground structures. It can be seen that the modified ground plane 19011 of FIG. 190C actually has higher gain than with the large ground plane 19003 of FIG. 190A or the square ground plane of FIG. 190B in the desired direction, according to some aspects. Hence, modified ground planes such as the diagonal slot ground planes 19011 can be very useful where cross polarization reduction is desired. FIGS. 192A and 192B are more detailed illustrations of some of the antenna structures of FIG. 190A through 190C, according to some aspects. A conical shape 3-D antenna is seen at 19201 in perspective view in FIG. 192A. Top (or largest) diameter 19201 and bottom (or smallest) diameter 19203 is illustrated. The antenna structure is designed to radiate at 28 GHz for a 5G application. Dimensions of the cone are shown in FIG. 192A and the cone antenna is simulated with the three different ground planes. The ground planes are shown in FIGS. 190A through 190C. FIG. 192B shows the diagonally slotted finite ground plane 19011 dimensions, with the bottom diameter of the conical antenna shown in dotted line at 19203 to indicate the cone placement on the other side of the PCB, according to some aspects. The ground plane 19211 is slotted diagonally to break up the current travelling path under the antenna, according to some aspects.

FIGS. 193A and 193B illustrate a top and bottom view of a 3D antenna structure, according to some aspects. A 3D antenna element is seen at 19301 of FIG. 193A and the diagonally slotted ground plane 19311 is seen in FIG. 193B, with areas 19310, 19312 being unmetallized.

FIG. 194 is a graphical comparison between return loss of the antenna of FIGS. 192A and 192B, according to some aspects. In the figure the large ground plane case is at 19403, the finite square shape ground plane case is at 19407 and the modified, diagonally slotted, ground plane case is at 19411, where the reference numerals correspond to the reference numerals in FIGS. 190A through 190C, in some aspects. The respective return loss figures at 28 GHz of −6.5 dB for plot 19403, −10.0 dB for plot 19407 and −18.0 dB for 19411 illustrates that the modified, or in this configuration, diagonally slotted, ground plane 19411 has a significantly better return loss than either the large ground plane case 19403 or the square ground plane case 19407, according to some aspects.

FIGS. 195A through 195C illustrate E-field distribution for the ground structures of 190A through 190C, according to some aspects. In FIG. 195A the conical antenna can be seen at 19501. The E-field distribution for this case is illustrated at 19502, 19504, and 19508. In FIG. 195B the conical antenna can be seen at 19501' and the E-field distribution for this case is illustrated at 19502', 19504' and 19508'. In FIG. 195C the conical antenna is again seen at 19501" and the E-field distribution is illustrated at 19502", 19504", and 19508". It is very clear from FIG. 195C that the diagonally slotted finite ground plane antenna has a different E-field distribution from that of the other two ground planes, wherein the E-field change with a modified diagonally slotted ground plane, as compared to the E-field of FIGS. 195A and 195B, significantly reduces cross polarization, according to some aspects.

FIGS. 196A through 196C illustrate five-element cone antenna arrays without and with a modified ground plane, according to some aspects. FIG. 196A shows a cone antenna array 19600 with one antenna enumerated as 19601, and with a reflector 19602. FIG. 196B and FIG. 196C show the ground plane with and without ground plane modification, respectively. FIGS. 197A and 197B illustrate a cross polarization radiation pattern comparison with and without a modified ground plane, according to some aspects. FIG. 197A shows cross polarization gain is reduced by approximately 7 dB while FIG. 197B shows co-polarization gain increased by 2.5 dB with the modified ground plane, with a comparison performed at 28.25 GHz. The simulated results show the benefit of a modified ground plane beneath a 3-D antenna.

FIGS. 198A and 198B illustrate the effect of a ground plane on antenna radiation, with only two of the five antenna elements of the array shown in each of the two figures, according to some aspects. FIG. 198A shows the direction towards the edge of the antenna array of FIG. 197B for the ground plane without modification. Where maximum radiation is at right angles to the cone, according to some aspects. FIG. 198B shows that the array with the modified ground plane has balanced the radiation at both sides of the edge indicating very symmetric edge-fire radiation, according to some aspects. In other words, in FIG. 198B the radiation pattern shows that radiation is nearly perfectly at a right angle to the conical array, compared to a ground plane without a slotted ground plane as seen in FIG. 198A.

FIG. 199 illustrates a comparison of return loss and isolation comparison for an antenna array with a modified ground plane, according to some aspects. FIG. 200 illustrates a comparison of return loss and isolation between antenna elements for an antenna array with an unmodified ground plane, according to some aspects. The two figures illustrate an improvement in return loss and in isolation for the modified ground plane. Higher isolation is important for antenna array design, hence another advantage of a modified ground plane beneath a 3-D antenna.

FIGS. 201A through 201C illustrate a PCB with slotted ground planes which was used with 3D antennas for testing, according to some aspects. FIG. 201A shows at 20100 a PCB 20101 with a cross slotted ground plane 20111. The top of the PCB has antenna feed arrays and mounting pads (not shown), while the bottom of the PCB has diagonal slotted finite ground planes. The bottom of the conical antenna elements are illustrated, one of which is enumerated at 20103. The conical antenna elements are fed by feed lines, one of which is enumerated 20107.

FIG. 201B illustrates this set up with feed lines shown, one of which is enumerated as 20107 with the slots not illustrated. FIG. 201C illustrates the top of the PCB with one 3D conical antenna element of the array illustrated at 20100 with feed line 20107 illustrated. The elliptical elements, one of which is enumerated 20109 are connectors to connect the various elements to the test apparatus for this aspect. FR-4 material of 3.5 dielectric constant and 0.15 mm thickness is used between the antenna mounting pads, antenna feed line, and ground. The antenna mounting PADs and the antenna feed line may be made on same plane of the PCB, while the slotted ground plane may be made on the other side of the FR4 substrate, according to some aspects. A few more dielectric layers can be added to strengthen the PCB, if desired.

The results of the test indicated that return loss with an unmodified ground was an unacceptably high 15 dB while the return loss for the modified (here, slotted) ground plane was a more acceptable (approximately) −5 dB with an acceptably wide bandwidth.

Mobile data usage continues growing exponentially at a rate of nearly doubling year-after-year, and this trend is expected to continue. Although recent advances in cellular technology have made improvements in the performance and capacity of mobile networks, it is widely thought that such advances will still fall short of accommodating the anticipated demand for mobile data network service.

One approach to increasing mobile network capacity is utilizing higher-frequency radio bands. Millimeter-wave communications, for example, use radio frequencies in the range of 30-300 GHz to provide colossal bandwidth by today's standards—on the order of 20 Gb/s, for example. The propagation of millimeter-wave radio signals differs considerably from more familiar radio signals in the 2-5 GHz range. For one, their range is significantly limited by comparison due to attenuation in the atmosphere. In addition, millimeter-wave signals experience blockage, reflections, refractions, and scattering due to walls, buildings and other objects to a much greater extent than lower-frequency signals. These physical challenges also present some useful opportunities for communication system designers. For example, the limited range of millimeter-wave transmissions make them suitable for resource-element (time slot and frequency) reuse in high-density deployments in city blocks, office buildings, schools, stadiums, and the like, where there may be a large plurality of user equipment devices. In addition, the potential for precise directionality control provides opportunity to make extensive use of multi-user multiple input/multiple output (MU-MIMO) techniques. Solutions are needed to make practical use of these opportunities in highly-directional wireless networks.

Millimeter-wave or similar high-frequency communication systems typically employ a directional beamforming at the base station and user equipment in order to achieve a suitable signal-to-noise ratio (SNR) for link establishment and to overcome communication channel blockage issues that are common for 5G/new radio (NR) communications. It is expected that 5G communication systems will support operation in at least one millimeter-wave band with as many as eight aggregated component carriers (8-CA). Implementing a 5G receiver circuit, which can handle this type of communications can be challenging due to limitations associated with local oscillator (LO) multiplexing issues at the mixer ports.

As used herein, the term "switch mode" indicates a receiver operation mode where an incoming RF signal can be processed and used for generating a single baseband output. In this regard, switch mode can be used in instances where the RF input signal includes contiguous carrier aggregated signals resulting in a baseband signal with a bandwidth that is smaller than a bandwidth of a channel filter prior to ADC processing.

As used herein, the term "split mode" indicates a receiver operation mode where an incoming RF signal can be split and processed to generate two baseband output signals. In this regard, split mode can be used in instances where the RF input signal includes non-contiguous carrier aggregated signals or contiguous carrier aggregated signals resulting in a baseband signal with a bandwidth that is higher than a bandwidth of a channel filter prior to ADC processing.

The scalable receiver architecture described herein can be incorporated in RF circuitry 325 of mmWave communication circuitry 300 shown in FIG. 3A, although the scalable receiver architecture is not limited to such. FIG. 202 illustrates a block diagram of a receiver operating in switch and split modes. Referring to FIG. 202, there are illustrated receivers 20202 and 20230 operating in a switch mode and in a split mode, respectively. Receiver 20202 can include low nose amplifiers (LNAs) 20218, mixers 20214, buffers 20206 and 20212, dividers 20208, and multiplexers 20210 and 20222.

During operation of the receiver 20202, a differential LO signal 20204 is initially buffered by buffers 20206 and then is communicated to dividers 20208 and multiplexers 20210. The LO signals at the outputs of multiplexers 20210 are buffered by buffers 20212 and then communicated to down-conversion mixers 20214. The incoming RF signal 20220 is split, amplified by LNAs 20218 and then is down-converted by mixers 20214 using the differential LO signals from the output of buffers 20212. The down-converted outputs of mixers 20214 are combined together via the multiplexers 20222, and communicated as a single baseband output signal 20224 (BB1).

Receiver 20230 can include LNAs 20244, mixers 20240, buffers 20232 and 20238, dividers 20234, and multiplexers 20236 and 20248. During operation of the receiver 20230, a differential LO signal 20205 is initially buffered by buffers 20232 and then is communicated to dividers 20234 and multiplexers 20236. The LO signals at the outputs of multiplexers 20236 are buffered by buffers 20238 and then communicated to down-conversion mixers 20240. The incoming RF signal 20246 is split, amplified by LNAs 20244 and then is down-converted by mixers 20240 using the differential LO signals from the output of buffers 20238. The down-converted outputs of mixers 20214 are output separately via the multiplexers 20248, and communicated as separate baseband output signals 20250 (BB1 and BB2).

The receivers 20202 and 20230 can be associated with drawbacks when operated at frequencies above 6 GHz. More specifically, the switches 20210 and 20236 in the LO distribution circuits may create challenges in the LO drive needed to drive the mixers 20214 and 20240, especially when operated at mmWave frequencies. More specifically, when a mixer needs to be driven with a 25% duty cycle LO waveform at mmWave frequencies, the current drain of the LO distribution can become challenging. The current drain may become higher when it becomes necessary to operate in split mode to handle Carrier Aggregation (CA) cases.

In some aspects, the LO distribution in the receiver architecture of FIG. 202 can be simplified by removing the multiplexers 20210 and 20236 in the LO distribution network. Furthermore, by removing the multiplexers 20210 and 20236 in the LO distribution network, the receivers 20202 and 20230 can be further simplified by removing the multiplexers 20222 and 20248 at the output of the down-conversion mixers, which leads to reducing the loading on each of the mixers. A high level diagram of an updated receiver architecture in accordance with some aspects and an associated truth table are shown in FIG. 203.

FIG. 203 illustrates a block diagram of a receiver 20300 using segmented low-noise amplifiers (LNAs) and segmented mixers according to some aspects. The receiver 20300 includes two separate RF processing paths 20306 and 20308. Each processing path can include a segmented LNA and a segmented mixer. For example, RF processing path 20306 includes a segmented LNA included of LNA 1-A 20312 and LNA 1-B 20314, and a segmented mixer included of mixers 20316 and 20318. Similarly, RF processing path 20308 includes a segmented LNA included of LNA 2-A 20322 and LNA 2-B 20324, and a segmented mixer included of mixers 20326 and 20328. The down-conversion mixers 20316 and 20318 can use LO signals 20310, and the down-conversion mixers 20326 and 20328 can use LO signals 20311. The LO signals 20310 and 20311 can be differential LO signals (e.g., LO signals 20310 and 20311 can include one or more in-phase (I) and quadrature (Q) LO signal components).

As seen in FIG. 203, the receiver 20300 uses a segmented implementations of a LNA and a down-converting mixer cascade in such a way as to enable the reception of contiguous and non-contiguous carrier aggregation (CA) transmissions with the same design. The LNA and the mixer are segmented into two equal halves in each RF processing path, which can be enabled or disabled (e.g., via a control signal generated by a control circuit, as seen in FIG. 204) depending on the composition of the downlink signal. By selecting which segments (20312, 20314, 20322, 20324) of the LNA and which segments (20316, 20318, 20326, 20328) of the mixer are enabled, the disclosed solution of receiver 20300 can be configured to receive non-contiguous and contiguous carrier aggregation downlink signals while maintaining an essentially constant input impedance looking into the receiver input that receives input RF signal 20304. In comparison to the receivers 20202 and 20230 of FIG. 20302, the configuration of the receiver 20300 can be executed without multiplexing the LO inputs 20310 and 20311 to the mixers (20316/20318 and 20326/20328). Since multiplexing of the LO inputs into the mixer is not necessary for 5G applications, the example receiver 20300 is simpler and more efficient in comparison to the receivers in FIG. 20302.

Truth table 20302 illustrates, which LNAs can be fired based on the operation mode (e.g., switch operation mode or split operation mode) of the receiver 20300. For example, the receiver 20300 can use a switch operation mode to process contiguous carrier aggregation signals (which result in a baseband signal with a bandwidth that is smaller than a bandwidth of a channel filter prior to ADC processing). During a switch operation mode, the input RF signal 20304 can be communicated only to RF processing path 20306, using LNAs 1-A and 1-B, and mixers 20316 and 20318, to generate a first baseband output signal 20320. LNAs 2-A and 2-B (and mixers 20326 and 20328) can remain inactive or can be powered off. Similarly, during switch mode, the input RF signal 20304 can be communicated only to RF processing path 20308, using LNAs 2-A and 2-B, and mixers 20326 and 20328, to generate a second baseband output signal 20330. LNAs 1-A and 1-B (and mixers 20316 and 20318) can remain inactive or can be powered off.

The receiver 20300 can use a split operation mode to process non-contiguous carrier aggregation signals (or contiguous carrier aggregation signals which result in a baseband signal with a bandwidth that is higher than a bandwidth of a channel filter prior to ADC processing). During a split operation mode, the input RF signal 20304 can be split so that a first signal portion is processed in RF processing path 20306 and a second signal portion is processed in RF processing path 20308. In some aspects, LNA 1-A can be activated while LNA 1-B is turned off, and LNA 2-A can be activated while LNA 2-B is turned off. In another split operation mode example, LNA 1-A can be activated while LNA 1-B is turned off, and LNA 2-B can be activated while LNA 2-A is turned off.

FIG. 204 illustrates a block diagram of a receiver using segmented low-noise amplifiers (LNAs) and segmented mixers operating in split mode to process a contiguous carrier aggregation signal according to some aspects. Referring to FIG. 204, the receiver 20400 includes two separate RF processing paths 20402 and 20404. Each processing path can include a segmented LNA and a segmented mixer. For example, RF processing path 20402 includes a segmented LNA included of LNA 1-A 20406 and LNA 1-B 20408, and a segmented mixer included of mixers 20410 and 20412. Similarly, RF processing path 20404 includes a segmented LNA included of LNA 2-A 20418 and LNA 2-B 20416, and a segmented mixer included of mixers 20418 and 20420. The down-conversion mixers 20410 and 20412 can use LO signals 20403, and the down-conversion mixers 20418 and 20420 can use LO signals 20405. The LO signals 20403 and 20405 can be differential LO signals (e.g., LO signals 20403 and 20405 can include one or more in-phase (I) and quadrature (Q) LO signal components).

In an example split mode operation, the receiver 20400 can receive an RF input signal 20401. The RF input signal 20401 can be a contiguous carrier aggregation signal 20403. As seen in FIG. 204, the contiguous carrier aggregation signal 20403 can include eight component carriers (CC1-CC8, 100 MHz each), with a total signal bandwidth of 800 MHz. During split operation mode the contiguous carrier aggregation signal 20403 can be split so that component carriers CC1-CC4 can be processed by the first processing path 20402, at component carriers CC5-CC8 can be processed by the second RF processing path 20404. In this case, split mode is used because the aggregated signal bandwidth (800 MHz) exceeds the bandwidth of the channel filters (20424 or 20434).

The first RF processing path 20402 can generate a baseband signal 20422, which can be filtered by the channel filter 20424 generating a filtered baseband signal 20426. The filtered baseband signal 20426 can be digitized by the ADC 20428 to generate a digital signal 20430 corresponding to contiguous component carrier signal that includes component carriers CC1 through CC4.

Similarly, the second RF processing path 20404 can generate a baseband signal 20432, which can be filtered by the channel filter 20434 generating a filtered baseband signal 20436. The filtered baseband signal 20436 can be digitized by the ADC 20438 to generate a digital signal 20430 corresponding to the contiguous component carrier signal that includes component carriers CC5 through CC8.

In some aspects, the receiver 20400 can further include control circuit 20450, which may include suitable circuitry, logic, interfaces and/or code and can be configured to generate one or more control signals used for switching between split operation mode and switch operation mode as well as other control functions. For example, the control circuit 20450 can generate RX1 control signal 20452 and RX2 control signal 20454, which can be used to activate (e.g., power on) or deactivate (e.g., power off) one or more circuits within the first RF processing path 20402 and the second RF processing path 20404, respectively.

For example, the control circuit 20450 can receive information (e.g., from a base station) of signal characteristics associated with the input RF signal 20401 example input characteristics can include information indicating whether the input RF signal 20401 is a contiguous or noncontiguous carrier aggregation signal, bandwidth of the signal 20401, and so forth. The control circuitry 20450 can also make such determinations about the input RF signal 20401 without assistance from an outside device. For example, the control circuit 20450 can determine that the incoming RF signal 20401 is a contiguous carrier aggregation signal 20403 that includes eight component carriers, with a total bandwidth of 800 MHz. Control circuit 20450 can then issue control signals 20452 and 20454 to activate split operation mode. More specifically, the control signals 20452 and 20454 can enable LNAs 20406 and 20414 or 20406 and 20416 (and corresponding mixers) to activate both processing paths in order to generate output signals 20430 and 20440. In some aspects, the control circuit 20450 can activate split operation mode when it is determined that a bandwidth of the incoming RF signal 20401 is higher than a bandwidth associated with channel filters 20424 and 20434, or bandwidth associated with ADCs 20428 and 20438. In some aspects, control signals 20452 and 20454 can also be used to deactivate (or power off) one or more of the LNAs, mixers, or other circuitry, which is not used during the split operation mode.

In some aspects, the control circuit 20450 can fire switch operation mode when it is determined that the input RF signal 20401 is a noncontiguous carrier aggregation signal. During switch operation mode, the control circuit can generate control signal 20452, which activates first RF processing path 20402 to process the entire input RF signal 20401. The control circuit 20450 can also generate control signal 20454, which deactivates, or powers off, the entire second RF processing path 20404.

In some aspects, the control signals 20452 and 20454 can be used to activate or deactivate various circuitry within the receiver 20400 by toggling a gate bias, by using an enable/disable pin, or by other methods. Example LNA enable pins are illustrated in FIG. 205, FIG. 206, FIG. 208, and FIG. 209.

The solutions described herein further enable the implementation of a scalable receiver architecture to address bandwidth limitations in the channel filters (e.g., 20424 and 20434) and the analog-to-digital converters (ADCs, 20428 and 20438). 5G communication systems will support operation in at least one millimeter wave band with as many as eight aggregated component carriers. Each component carrier may have a bandwidth of 100 MHz, for a total RF signal bandwidth of 800 MHz (e.g., signal 20403). The filters (20424, 20434) and ADCs (20428, 20438) would have a significant challenge in meeting the performance and linearity goals to handle 800 MHz of RF bandwidth. High order channel filters may be needed to protect the ADCs from strong blockers. Passive R-C filters may not be able provide adequate protection (filtering) ahead of the ADC, hence, active filters may be needed. However, achieving active filters that can handle 800 MHz of RF bandwidth can be challenging to implement with existing CMOS technologies due to the very high gain-bandwidth products that would be necessary in the op-amps used in the active filter.

Receiver architecture implementation techniques discussed herein can include (1) removing of the multiplexing of the local oscillator waveforms used to down-convert the received signal, and (2) powering off (or shutting down) one-half of the RF processing path when it is not used in split operation mode, without affecting the input impedance seen looking into the receiver.

There are several advantages of the proposed architecture over receiver solutions illustrated in FIG. 20302. Firstly, the proposed architecture (e.g., as seen in FIGS. 203-209) overcomes the challenges in implementing a very wide bandwidth active channel filter and a very high performance ADC by splitting the received component carriers into two (or multiple) dedicated paths. A second advantage of the disclosed architecture or techniques stems from the removal of the multiplexing of the LO signals is in the reduction or removal of intermodulation products due to the mixing of the LO signals in a multiplexer circuit. A third advantage of the disclosed architecture or techniques is derived from shutting down (or powering off) one-half of the receiver (e.g., during switch operation mode), which would result in power efficiency and a longer battery life. A fourth advantage of the disclosed architecture or techniques is simplification in the LO distribution, which leads to power savings at frequencies higher than 6 GHz (especially when operating in split operation mode). Lastly, due to the simplification in the overall receiver architecture, the control logic (e.g., control circuit 20450) can also be simplified.

FIG. 205 illustrates a block diagram of a receiver using segmented LNAs and segmented mixers operating in switch mode with signal splitting at LNA input according to some aspects. Referring to FIG. 205, the receiver 20500 can represent a more detailed diagram of the receivers 20300 and 20400 in FIG. 203 and FIG. 204 respectively. The receiver 20500 can include segmented LNAs that include LNA slices 20504, 20506, 20508, and 20510. For example, LNAs 20504 and 20506 can form one segmented LNA, and LNAs 20508 and 20510 can form another segmented LNA. If one segmented LNA has an effective size of W, each of the LNA slices such as LNAs 20504 and 20506 have an effective size of W/2, as seen in FIG. 205. Similarly, the segmented LNA that includes LNA slices 20508 and 20510 can have an effective size of W, with LNA slices 20508 and 20510 having an effective size of W/2.

Each of the LNAs 20504, 20506, 20508, and 20510 are coupled to corresponding down-conversion mixers 20512, 20514, 20516, and 20518, as well as channel filters 20536, 20538, 20540, and 20542. Each of the mixers 20512, 20514, 20516, and 20518 are configured to receive differential LO signals, which are used for down-converting the amplified RF signals received from the corresponding LNA.

In an example switch operating mode, an input RF signal 20502 can be communicated only to LNAs 20504 and 20506. The RF processing path that includes LNA 20504, mixer 20512, and filter 20536 can be used to generate an in-phase (I) component 20544 of a baseband output signal. More specifically, signal outputs 20515A and 20515B from mixer 20514 can be used with signal outputs 20513A and 20513B from mixer 20512 to generate differential baseband signals 20520 and 20522, which are filtered by filter 20536 to generate the I signal component 20544 of a baseband output signal.

Similarly, the RF processing path that includes LNA 20506, mixer 20514, and filter 20538 can be used to generate a quadrature (Q) component 20546 of a baseband output signal. More specifically, signal outputs 20515C and 20515D from mixer 20514 can be used with signal outputs 20513C and 20513D from mixer 20512 to generate differential baseband signals 20524 and 20526, which are filtered by filter 20538 to generate the Q signal component 20546 of the baseband output signal. In the example switch operation mode illustrated in FIG. 205, LNAs 20508 and 20510, and the entire processing path (including differential LO signal distribution) associated with those LNAs, can be deactivated and turned off for efficiency. As seen in FIG. 205, each of the mixers 20512-20516 generates both I and Q signal outputs.

In some aspects, switch operation mode can be performed only by the RF processing chains associated with LNAs 20508 and 20510, while the RF processing chains associated with LNAs 20504 and 20506 can be deactivated and turned off. If the RF input signal 20502 is being processed by LNAs 20508 and 20510, the corresponding amplified signals are communicated to mixers 20516 and 20518 for down-conversion based on differential LO signals. Mixer 20516 generates differential baseband signals 20528 and 20530, which are filtered by filter 20540 to generate the I signal component 20548 of a baseband output signal. Mixer 20518 generates differential baseband signals 20532 and 20534, which are filtered by filter 20542 to generate the Q signal component 20650 of the baseband output signal.

FIG. 206 illustrates a block diagram of a receiver using segmented LNAs and segmented mixers operating in split mode with signal splitting at LNA input according to some aspects. Referring to FIG. 206, the receiver 20600 can represent a more detailed diagram of the receivers 20300 and 20400 in FIG. 203 and FIG. 204 respectively. The receiver 20600 can include segmented LNAs that include LNA slices 20604, 20606, 20608, and 20610. For example, LNAs 20604 and 20606 can form one segmented LNA, and LNAs 20608 and 20610 can form another segmented LNA. If one segmented LNA has an effective size of W, each of the LNA slices, such as LNAs 20604 and 20606, have an effective size of W/2, as seen in FIG. 206. Similarly, the segmented LNA that includes LNA slices 20608 and 20610 can have an effective size of W, with LNA slices 20608 and 20610 having an effective size of W/2.

Each of the LNAs 20604, 20606, 20608, and 20610 are coupled to corresponding down-conversion mixers 20612, 20614, 20616, and 20618, as well as channel filters 20636, 20638, 20640, and 20642, respectively. Each of the mixers 20612, 20614, 20616, and 20618 are configured to receive differential LO signals, which are used for down-converting the amplified RF signals received from the corresponding LNA slice.

In an example split operating mode, an input RF signal 20602 can be split (e.g., as seen in FIG. 204), with a first RF signal portion communicated to LNA 20606 and a second (remaining) RF signal portion communicated to LNA 20608. The RF processing path that includes LNA 20606, mixer 20614, and filters 20636 and 20638 can be used to generate the I component 20644 and Q component 20646 of a first baseband output signal. The RF processing path that includes LNA 20608, mixer 20616, and filters 20640 and 20642 can be used to generate the I component 20648 and Q component 20650 of a second baseband output signal.

More specifically, signal outputs 20615A and 20615B from mixer 20614 can be used to generate differential baseband signals 20620 and 20622, which are filtered by filter 20636 to generate the I signal component 20644 of the first baseband output signal. Signal outputs 20615C and 20615D from mixer 20614 can be used to generate differential baseband signals 20624 and 20626, which are filtered by filter 20638 to generate the Q signal component 20646 of the first baseband output signal.

Similarly, signal outputs from mixer 20616 can be used to generate differential baseband signals 20628 and 20630, which are filtered by filter 20640 to generate the I signal component 20648 of the second baseband output signal. Signal outputs from mixer 20616 are also used to generate differential baseband signals 20632 and 20634, which are filtered by filter 20642 to generate the Q signal component 20650 of the second baseband output signal.

As indicated in FIG. 206, split operation mode can be performed only by the RF processing chains associated with LNAs 20606 and 20608, while the RF processing chains associated with LNAs 20604 and 20610, as well as the corresponding mixers 20612 and 20618 (as well as parts of the LO distribution circuitry providing LO signals to those mixers), can be deactivated and turned off.

FIG. 207 illustrates a block diagram of an example local oscillator (LO) signal generation circuit according to some aspects. Referring to FIG. 207, there is illustrated LO distribution architecture 20700, which can be used in connection with the receivers disclosed herein (e.g., the receivers illustrated in FIG. 203, FIG. 204, FIG. 205, FIG. 206, FIG. 208, and FIG. 209). The LO distribution architecture 20700 includes LO generators 20702 and 20714, which can be used to generate differential LO signals for multiple segmented mixers. The LO signal generated by the LO generator 20702 can be divided by divider block 20704 and then buffered within buffers 20706 of strength one. Each of the buffered LO signals can be split and buffered again by buffers 20708 with strength two. Final differential LO signals 20710 can be output from the buffers as needed. For example, control circuit 20450 can generate an enable signal that can be used to indicate, which LO differential signal 20710 can be communicated to a corresponding mixers slice. The LO signal generated by the LO generator 20712 can be divided by divider block 20714 and then buffered within buffers 20716 of strength one. Each of the buffered LO signals can be split and buffered again by buffers 20718 with strength two. Final differential LO signals 20720 can be output from the buffers as needed. Even though buffers with strength of 2 are illustrated in FIG. 207, the disclosure is not limited in this regard and other types of buffers can be used as well.

Truth table 20722 provides examples of, which differential LO signals can be activated and used for various operational modes of a receiver architecture disclosed herein. For example, during a switch mode using LO1 (e.g., as seen in FIG. 205), the LO1 generator 20702 is on and the LO2 generator 20712 is off. The specific operation modes and specific LO differential signals that are activated can be seen in table 20722.

As seen in table 20722, depending on whether a receiver is operating in a switch or a split operation mode, parts of the LO distribution architecture 20700 can be turned off, which results in efficiency and power savings.

As seen in the bottom row of table 20722, during split mode with LO1 and LO2, the four “a” outputs are ON and the four “b” outputs are OFF. In another aspect, during split mode with LO1 and LO2, the four “b” outputs can be ON and the four “a” outputs can be OFF.

FIG. 208 illustrates a block diagram of a receiver using a segmented output LNA and segmented mixers operating in switch mode with signal splitting at LNA output according to some aspects. Referring to FIG. 208, the receiver 20800 can include a segmented output LNA 20802 that includes LNA slices 20812, 20814, 20816, and 20818. Each of the LNAs 20812, 20814, 20816, and 20818 are coupled to corresponding down-conversion mixers 20804, 20806, 20808, and 20810, as well as channel filters 20828, 20830, 20844, and 20848. Each of the mixers 20804, 20806, 20808, and 20810 are configured to receive differential LO signals, which are used for down-converting the amplified RF signals received from the corresponding LNA slice of LNA 20802.

In an example switch operating mode, an input RF signal 20852 can be communicated to LNA 20802 and then routed for amplification only by LNA slices 20812 and 20814. In this regard, the input RF signal is routed or split at the LNA 20802 output. In the switch operating mode scenario illustrated in FIG. 208, a replica of the RF input signal 20852 is communicated to LNA slices 20812 and 20814 and then outputs to corresponding mixers 20804 and 20806. The RF processing path that includes LNA 20812, mixer 20804, and filter 20828 can be used to generate an in-phase (I) component 20832 of a baseband output signal. More specifically, signal outputs from mixers 20804 and 20806 can be used to generate differential baseband signals 20820 and 20822, which are filtered by filter 20828 to generate the I signal component 20832 of the baseband output signal.

Similarly, the RF processing path that includes LNA 20814, mixer 20806, and filter 20830 can be used to generate a quadrature (Q) component 20834 of the baseband output signal. More specifically, signal outputs from mixer 20804 can be used with signal outputs from mixer 20806 to generate differential baseband signals 20824 and 20826, which are filtered by filter 20830 to generate the Q signal component 20834 of the baseband output signal. In the example switch operation mode illustrated in FIG. 208, LNAs 20816 and 20818, and the entire processing path (including differential LO signal distribution and down-conversion mixers) associated with those LNAs, can be deactivated and turned off for efficiency. As seen in FIG. 208, each of the mixers 20804-20810 generates both I and Q signal outputs.

In some aspects, switch operation mode can be performed only by the RF processing chains associated with LNAs 20816 and 20818, while the RF processing chains associated with LNAs 20812 and 20814 can be deactivated and turned off. If the RF input signal 20852 is being processed by LNAs 20816 and 20818, the corresponding amplified signals are communicated to mixers 20808 and 20810 for down-conversion based on differential LO signals LO2. Mixer 20808 generates differential baseband signals 20836 and 20838, which are filtered by filter 20844 to generate the I signal component 20846 of a baseband output signal. Mixer 20810 generates differential baseband signals 20840 and 20842, which are filtered by filter 20848 to generate the Q signal component 20850 of the baseband output signal.

FIG. 209 illustrates a block diagram of a receiver using a segmented output LNA and segmented mixers operating in split mode with signal splitting at LNA output according to some aspects. Referring to FIG. 209, the receiver 20900 can include a segmented output LNA 20902 that includes LNA slices 20912, 20914, 20916, and 20918. Each of the LNAs 20912, 20914, 20916, and 20918 are coupled to corresponding down-conversion mixers 20904, 20906, 20908, and 20910, as well as channel filters 20928, 20930, 20944, and 20948. Each of the mixers 20904, 20906, 20908, and 20910 are configured to receive differential LO signals, which are used for down-converting the amplified RF signals received from the corresponding LNA slice of LNA 20902.

In an example split operating mode, an input RF signal 20952 can be communicated to LNA 20902 and then split for amplification by LNA slices 20914 and 20916. In this regard, the input RF signal 20952 is split at the LNA 20902 output, as seen in FIG. 209. In the split operating mode scenario illustrated in FIG. 209, two portions of the RF input signal 20952 are communicated to LNA slices 20914 and 20916, respectively, and then to corresponding mixers 20906 and 20908. The RF processing path that includes LNA 20914, mixer 20906, and filters 20928 and 20930 can be used to generate an in-phase (I) component 20932 and a quadrature (Q) component 20934 of a first baseband output signal corresponding to a first portion of the RF input signal 20952 communicated to LNA slice 20914. More specifically, signal outputs from mixer 20906 can be used to generate differential baseband signals 20920 and 20922, which are filtered by filter 20928 to generate the I signal component 20932 of the first baseband output signal. Signal outputs from mixer 20906 can also be used to generate differential baseband signals 20924 and 20926, which are filtered by filter 20930 to generate the Q signal component 20934 of the first baseband output signal.

Similarly, the RF processing path that includes LNA 20916, mixer 20908, and filters 20944 and 20948 can be used to generate an I component 20946 and a Q component 20950 of a second baseband output signal corresponding to a second portion of the RF input signal 20952 communicated to LNA slice 20916. More specifically, signal outputs from mixer 20908 can be used to generate differential baseband signals 20936 and 20938, which are filtered by filter 20944 to generate the I signal component 20946 of the second baseband output signal. Signal outputs from mixer 20908 can also be used to generate differential baseband signals 20940 and 20942, which are filtered by filter 20948 to generate the Q signal component 20950 of the second baseband output signal.

FIG. 210 illustrates example LO distribution schemes for receivers operating in a switch mode according to some aspects. Referring to FIG. 210, a first LO distribution scheme 21000 can be used in connection with a receiver operating in a switch mode, such as receiver 20202 in FIG. 202. A second LO distribution scheme 21040 can be used in connection with another receiver operating in switch mode, such as receiver 20500 in FIG. 205. The first LO distribution scheme 21000 includes frequency dividers 21004 and 21022, as well as buffers 21002, 21006, 21008, 21010, 21012, 21014, 21020, 21024, 21026, 21028, 21030, and 21032. The first LO distribution scheme 21000 also includes down-conversion mixers 21016, 21018, 21034, and 21036 using the generated differential LO signals corresponding to input LO signals LO1 and LO2.

The second LO distribution scheme 21040 includes frequency dividers 21044 and 21062, as well as buffers 21042, 21046, 21048, 21050, 21052, 21060, 21064, 21066, 21068, and 21070. The second LO distribution scheme 21040 also includes down-conversion mixers 21054, 21056, 21072, and 21074 using the generated differential LO signals corresponding to input LO signals LO1 and LO2.

As seen in FIG. 210, the first LO distribution scheme 21000 uses one frequency divider, seven buffers, and two sets of mixers. In comparison, the second LO distribution scheme 21040 uses a frequency divider, five buffers, and a single set of mixers. In this regard, simulation-based estimates of approximately 20% of current savings can be realized with the second LO distribution scheme 21040 due to the simplification of the LO distribution network.

FIG. 211 illustrates example LO distribution schemes for receivers operating in a split mode according to some aspects. Referring to FIG. 211, a first LO distribution scheme 21100 can be used in connection with a receiver operating in a split mode, such as receiver 20230 in FIG. 202. A second LO distribution scheme 21140 can be used in connection with another receiver operating in split mode, such as receiver 20600 in FIG. 206. The first LO distribution scheme 21100 includes frequency dividers 21104 and 21122, as well as buffers 21102, 21106, 21108, 21110, 21112, 21114, 21120, 21124, 21126, 21128, 21130, and 21132. The first LO distribution scheme 21100 also includes down-conversion mixers 21116, 21118, 21134, and 21136 using the generated differential LO signals corresponding to input LO signals LO1 and LO2.

The second LO distribution scheme 21140 includes frequency dividers 21144 and 21162, as well as buffers 21142, 21146, 21148, 21150, 21152, 21160, 21164, 21166, 21168, and 21170. The second LO distribution scheme 21140 also includes down-conversion mixers 21154, 21156, 21172, and 21174 using the generated differential LO signals corresponding to input LO signals LO1 and LO2.

As seen in FIG. 211, the first LO distribution scheme 21100 uses ten buffers and four mixers. In comparison, the second LO distribution scheme 21140 uses six buffers and only two mixers. In this regard, simulation-based estimates of approximately 40% of current savings can be realized with the second LO distribution scheme 21140 due to the simplification of the LO distribution network.

Microwave antenna sub-systems that operate in the mmWave frequency range are extremely small, in the micron range. Consequently it is important to discover ways to reduce the size of antennas and of radio sub-systems, particularly thickness, for use in mmWave mobile devices where space is at a premium because of chassis size requirements and because of the dense packaging of components and antennas. One area where there is a particular need for size reduction is discreet components, which take up more volume than non-discreet components. Thus there is a need to reduce volume of discreet components by making them from an ultra-thin technology. At the same time, thermal, electrical and mechanical overlay issues should be addressed and reduced. Cost improvement is also a major consideration. The overlay of components, antennas and antenna sub-systems on top of, or on the side of, each other will reduce both size and thickness of the sub-system. Use of overmold with interconnects in overmold is another concept that will allow antennas to be located on the sides of a sub-system, and provide thermal and mechanical improvement over competing technologies.

FIG. 212 is a side view of an unmolded stacked package-on-package embedded die radio system using a connector, according to some aspects. The embedded die radio system described herein can be incorporated in the antenna array circuitry 330 of mmWave communication circuitry 300 shown in FIG. 3A, although the embedded die radio system is not limited to such.

The aspect includes unmolded stacked package-on-package embedded die 21200 including unmolded package 21205 and package 21207. Package 21205 may include a laminated substrate such as a PCB, within which is embedded RFIC 21206. As used in this context, "unmolded" means that the die 21206 is not enveloped in a mold or encapsulate. The dimensions illustrated for the z-height of the various parts of the packages are for example purposes only, and serve to illustrate the extremely small dimensions that are worked with when volume of a mobile device in which the packages find use is very restricted. In addition, the first few microns at the top and bottom of PCB 21205 can be pre-impregnation (PrePreg) layers which may be before the core of the PCB within which the RFIC is embedded. PrePreg is used due to its thickness. The thickness of PrePreg can be very thin, for example 25 um or 30 um. PrePreg may be an epoxy material, although it can also be a laminate material, for example Copper Clad Laminate (CCL). The technology is not limited to organic polymer based laminates but can also be ceramic based inorganic layers. As used in the antenna substrate industry, "core" can mean the internal part of a substrate that is thicker than, and that can be more rigid than, other areas of the substrate, such as PrePreg. Package 21205 is unmolded in that it is a laminar substrate such as a PCB with no encapsulate within the package. Shield 21201 is on top of package 21205 to shield components 21203 from RFI/EMI. Connector 21223 may connect one or more of the packages to the outside world. In some aspects connector 21223 provides intermediate frequency (IF) signals for transmission by the system. Package 21205 includes RFIC die 21206 which provides feeding for the various antennas and antenna arrays discussed below by way of traces and vias as appropriate, according to some aspects.

While one RFIC die 21206 is illustrated, those of ordinary skill in the art would recognize that more than one RFIC die can be provided, to operate in one or more than one frequency band. In other words there may be at least one RFIC die in aspects. The packages illustrated can include antennas and antenna arrays of many different configurations, frequencies of operation, and bandwidths, according to some aspects. In FIG. 212 antenna structures 21209, 21211, 21213, 21215, and 21219 are illustrated. These can be single antennas in side view, or antenna arrays, such as 1×N, 2×N, . . . , N×N element arrays, looking into the page of the figure. In one example, antenna 21209 can be a dual patch antenna with a distance d2, in this aspect, of 165 microns between patch antenna elements 21210 and 21212, and another dimension dl between patch antenna element 21210 and ground. Depending on the distances d1 and d2, the bandwidth of the antenna will vary because of the varying volume of the patch antenna.

As will be discussed below, the PCB 21205 has a laminar structure illustrated in this aspect as levels L1 through L6. Because of the various levels, the antenna elements such as 21210, 21212 can be placed at various distances d2 between dual patch antenna elements, and because of the multiplicity of levels the distance dl between patch antenna element 21210 and GND can also be set at various distances, resulting in a choice of bandwidths as may be needed for a given design. Stated another way, the distance between dual patch antenna elements 21210 and 21212 is not limited to 165 microns but can be set at any of several distances because of the densely packed laminate levels available. This is the same with the distance between dual patch antenna element 21210 and ground plane 21214, setting up an ability to measure the bandwidth. However, the levels L1-L6 are only one of many aspects. Other designs may have many more very densely packed layers, far more than the six layers L1-L6 illustrated, and these very densely packed layers can be used for various functions as needed.

Continuing with the description of FIG. 212, 21224 can in some aspects be an antenna or an antenna array such as the 1×N, 2×N, . . . , N×N element arrays discussed briefly above. In some aspects 21224 can be a self-standing antenna configured by means of a surface mounted device (SMD), which is sometimes called surface mounted technology (SMT). In some aspects, if there is not sufficient height for a needed antenna or antenna array within the PCB 21205, the antenna or antenna array 21210, 21212 can be configured with antenna element 21212 placed on the top of the PCB 21205 for example to provided needed volume, according to some aspects. In another example, dual patch element 21212 can be placed on top of surface mounted device 21224 instead of on top of PCB 21205, to provide the antenna or antenna array with additional height which, in some aspects, will provide increased volume and improved bandwidth as discussed above.

Another example can be seen at antenna 21215. In this example, antenna (or antenna array, as discussed above) 21215 includes patch antenna element 21218 within the substrate 21205, which, as discussed above, can be a complex and very densely packed substrate. Dual patch antenna element 21217 can be on a second antenna board 21207. In some aspects antenna board 21207 can be a dielectric, a ceramic, a PCB, and the like, which can also be a densely packed laminar substrate much like PCB 21205. Consequently, the antenna function can be apportioned between or among more than one antenna board resulting in a package-on-package configuration. Therefore, if there is not enough z-height on one media, then part of the antenna can be implemented on a second media, such as 21207, to provide the desired z-height in order to obtain the volume to provide the desired parameters such as, in some aspects, bandwidth, lower loss, and the like. In other words, given the extremely small dimensions of the thickness of a substrate due, in some instances, to form factor requirements for operation at mmWave or other frequencies, antenna elements (and discreet components) can be placed on one or more additional media.

In some aspects, antenna elements can be placed on top and/or bottom of PCB 21205, on the sides of PCB 21205, and in various additional configurations, resulting in additional substrate thickness and increased bandwidth as needed. Similarly, antenna functions can likewise be split between or among different antenna boards, for example PCB 21205, which can be considered the main media, and antenna board 21207, which can be considered a secondary media.

Further, such media above or below, or in the side of, the substrate can be used for various functions, such as grounding, shielding, feeds, and the like. Further, there can be more than one medium 21224 on top of PCB 21205. There can also be a multiplicity of antenna media on top of the PCB 21205, each providing part or all of the antennas or antenna arrays as discussed above. The same is true of placement of antenna media below or on the side of PCB 21205. Further, the secondary media can be used for parasitic elements in order to improve the gain or shape the pattern of the antennas as needed.

Antennas 21211, 21213, 21215, and 21219 can be other antennas or antenna arrays configured on antenna board 21207 and fed from RFIC die 21206. Also illustrated are vias 21220, 21222. There may be many vias, in some aspects. Generally, the thicker the substrate 21205, the greater diameter the via 21220, 21222. In some aspects where ultra-thin substrates are needed, the vias can be of a much smaller diameter, as discussed below for other aspects.

Vias such as 21228 may be connected to the RFIC die 21206 by solder connections such as 21227. The vias may be connected by one or more horizontal layers 21230 for connection to components elsewhere within the radio subsystem, where the horizontal layer 21230 is viewed looking into the page.

FIG. 213 is a side view of a molded stacked package-on-package embedded die radio system, according to some aspects. In FIG. 213 package 21300 includes a substrate including level 21301, for example an antenna board such as a PCB, level 21303, which is a mold or encapsulate (e.g., that can be injected during PCB manufacturing), and level 21305 which may include an antenna board such as a PCB, according to some aspects. Level 21301 may include conductive levels 21307 such as traces, level 21303 may include conductive levels such as 21309 and vias such as 21319, 21319', often called "through-mold vias", and level 21305 may include conductive levels 21311 connected by solder connection 21426 to conductive levels 21309, the conductive levels and vias of package 21300 are configurable to feed the various antennas and other components from dies 21306, 21308, in some aspects. Although conductive levels 21307 and 21311 are illustrated as short horizontal layers, in practice they can be longer conductive layers, according to various aspects.

In some aspects the conductive levels 21307, 21311 may be made using redistribution layers (RDL). Vias (or through-mold vias in molded packages) may be made by copper studs, by lasers piercing the mold or other layers, and conductive ink, or other means. Through the use of vias, conductive layers, and/or RDLs, the die(s) are able to connect very quickly to antennas and antenna arrays on any side of the package which, in some aspects may be antennas embodied on or within SMDs 21316, 21318, 21320. Because of densely packed vias, and densely packed horizontal layers, the dies may connect to antennas or antenna arrays on substrates 21301, 21305 with little or essentially no fan-out of the feed structure. Further, the through-mold vias such as 21319, 21319' may be configured in trenches of densely packed vias connected to metallized layers (only layer 21309 illustrated here, but the top of vias such as 21319 or 21319' may be connected to a metallized layer atop the vias (not shown)) around the die or dies to form a Faraday cage to shield the dies and other components from RFI and EMI, in some aspects. The vias can be very small vias such as single posts.

When using package on package with high density interconnects between the packages such as through-mold vias 21319, 21319' (through mold vias), one can build the packages separately and use disparate materials tailored for bottom die versus another die on top or below it. It also improves yield since individual dies can be tested in their respective packages before stacking them. It is also important to understand that the mold may be eliminated completely if needed and one can replace through mold vias with solder balls that are connected to the top package and act as the vertical interconnect.

In the aspect of FIG. 213, two or more dies 21306, 21308 may be included within the substrate and affixed by contacts such as solder bumps which may be copper filler, solder contacts such as 21310, or which may be LGA/VGA pads or, in some aspects, a package. Dies 21306, 21308 may be any aspect of die such as flip-chip die, wafer level Chip Scale Package (CSP), wire-bondable die, and the like. Alternatively, a single die may be used. Antennas such as 21316, 21318, 21320 and are configured on a first side of the substrate while antennas 21316', 21318', 21320' may be configured on the opposite side of the substrate, in some aspects.

The foregoing antennas may be the same type of antennas as those described with respect to FIG. 213, and in some aspects may be on or within SMDs. Further still, the antennas 21316, 21318, 21320 may be configured as an antenna array. Further, antennas such as any or all of the foregoing antennas may be embodied on or within an SMD such as discussed with respect to antenna (or antenna arrays) 2131224 of FIG. 213.

Also configured on one or both sides (such as 21301, 21305) of the package 21300 may be discreet components 21322, 21324, and 21322', 21324'. Further, systems 21321, 21321', sometimes called a system in a package (SIP), may be configured on top (such as on the top surface of level or PCB 21301) and/or on bottom (such as at the bottom of 21305) and/or sides of the package 21300, in some aspects, providing a package-on-package configuration.

A SIP 21321, 21321' may be a system much like the package that includes levels 21301, 21303, 21305 that SIPs 21321, 21321' are configured upon. SIPs 21321, 21321' may be stacked on and physically connected to the package in several ways. Further dies 21306, 21308 may be connected to the substrate 21303 by suitable contacts illustrated at 21326, in some aspects. Such suitable contacts may include copper filler, solder bumps, or a package. Contacts 21326 may be very small connections within the body of the package-on-package aspect. Such system configurations illustrate package-on package configuration.

Further, one or more dies of each package may be configured to operate at the same frequency or at different frequencies, such as one die operating at 5G frequencies and a second die operating at WiGig frequencies, because the density within the packages as described is so high. Further, the antennas/antenna arrays of the package-on-package aspect may radiate in any of a number of directions, or essentially in every direction, as may be needed, for example, because of the orientation of the mobile device. In other words, antennas, and antenna arrays, can be placed all over a package 21300, meaning in essentially every desired direction of the package by stacking and physically connecting packages 21321, 21321' on the top, bottom, and sides of package 21300, or in combinations thereof, as desired, and in antenna and antenna array configurations on or within packages 21321, 21321' as desired, according to some aspects. In addition to the foregoing, the package 21300 may be soldered onto yet another board (not shown) by solder balls 21313, 21315, which are illustrated as larger than solder ball or contacts 21326 because while solder balls 21326 are within the package-on-package aspect, and can be very small and very tightly spaced, solder balls 21313, 21315 are connections "to the outside world," according to some aspects.

For example, the board that package 21300 is further soldered onto, by way of solder balls 21313, 21315, may be the host board for a phone, tablet, mobile device, or other end user equipment, according to some aspects.

A primary difference between FIGS. 212 and 213 is that the dies of FIG. 213 are enveloped by mold which protects and strengthens the configuration of the dies within the substrate. An advantage of the molded aspect is that embedded dies in the unmolded substrate of FIG. 212 are difficult to manufacture in high volume.

A molded substrate configuration is more compatible to high volume manufacture, due, as discussed above, to improved yield since individual dies can be tested in their respective packages before stacking them. Additionally, in a molded configuration components like 21312, 21314 can easily be configured within the molded substrate. The embodied die of FIG. 212 is often specific to embedding only a single die, according to some aspects. Further, the molded configuration of FIG. 213 allows many more dense layers than the unmolded configuration. In the embedded die of FIG. 212, every component is connected as one system.

If one part, such as one via, fails, the entire system within the substrate fails. In the molded configuration FIG. 213 the substrate itself can be made separately, the layers connecting the dies can be connected separately, and the system is not connected together until the final step, where the final step is soldering all parts together. In the aspect of FIG. 212 there is no solder internally, the system being included of copper vias most or all of which may be assembled at nearly the same time. Stated another way, the process of building a molded stacked package is very different from building an unmolded package.

For example, in FIG. 213, studs may be placed or plated onto the bottom layer of the top package and these can be plated to a high aspect ratio and very small diameters. Then the top and bottom packages are connected using solder or thermo-mechanical compression. The overmold is liquid, is injected and then flows and covers the gaps. This is a higher density and higher yielding process than for an unmolded package.

An advantage of the molded aspect is that embedded dies in the unmolded substrate of FIG. 212 are difficult to manufacture in high volume. A molded substrate configuration is more compatible to high volume manufacture, due, as discussed above, to improved yield since individual dies can be tested in their respective packages before stacking them. Additionally, in a molded configuration components like 21312, 21314 can easily be configured within the molded substrate. The embodied die of FIG. 212 is often specific to embedding only a single die, according to some aspects.

Further, the molded configuration allows many more dense layers than the unmolded configuration. In the embedded die of FIG. 212, every component is connected as one system. If one part, such as one via, fails, the entire system within the substrate fails. In the molded configuration FIG. 213 the substrate itself can be made separately, the layers connecting the dies can be connected separately, and the system is not connected together until the final step, where the final step is soldering all parts together. In the aspect of FIG. 212 there is no solder internally, the system being included of copper vias most or all of which may be assembled at nearly the same time.

FIG. 214 is a side view of a molded stacked package or embedded die sub-system radio system showing additional detail, according to some aspects. The levels the individual component technologies are indicated in Table 8, in some aspects.

TABLE 8

| Item | Option-1 | Option-2 | Remark |
|---|---|---|---|
| A | 0.23-0.27 mm | 0.23-0.27 mm | This height accommodates die and low profile capacitors |
| B | 0.08 mm | 0.1 mm | 3 L coreless ultra-thin interposer |
| C | 0.11 mm | 0.11 mm | Mold thickness |
| D | 0.06 mm | 0.06 mm | Die thickness |
| E | 0.050-0.1 mm | 0.05-0.1 mm | 3 L coreless substrate or 3 L RDL |
| F | 0.11-0.13 mm | 0.11-0.13 mm | Micro BGA height |
| H | 0.65 mm-0.75 mm | 0.67 mm-0.77 mm | package total height including stacking |
| Shield | Conformal | conformal | |

Package 21401 illustrates a first package and package 21403 illustrates a second package. FIG. 214 illustrates dramatic height and volume reduction by use of ultra-thin technology such as integrated substrate frontend (iSFE) or an external substrate front end (eSFE) functions formed by printing the SMDs other components in the packaging substrates (e.g., laminates) or the host PCB of a radio sub-system. For example, in FIG. 214 item 21415 is a decoupling capacitor (DECAP) useful in in reducing noise, and 21414 is a function such as a filter, balun (e.g., a transformer), multiplexer, coupler, harmonic filter, or antennas, or the like, implemented as an iSFE, discussed below. Arrow 21413 indicates RF functions printed in the substrate as iSFE within the substrate. Items 21429, 21431, 21433 are dies that embody mmWave, Wi-Fi, and LTE radio systems, respectively, according to some aspects. Noteworthy is that eSFE 21414 and DECAP 21415 are approximately the height of the dies, which enables drastic height and volume reduction for these functions, as explained in detail below.

Arrow 21409 indicates a PCB level with short coax-type ground-signal-ground (GSG) transitions from top to bottom and to outside as needed. GSGs are launches that allow for highly controlled impedance and reduces emission signals through the mold or through air from top to bottom. Arrow 21411 indicates short and low loss transitions to the outside, the target impedance being 30 to 60 ohms as needed, which may be way of solder balls 21412.

Also illustrated are horizontal connections 21417 which may connect die 21406 to functions implemented by DECAPs such as at 21435, and eSFE 21437. Die 21406 in mold 21424 may also be connected to dies 21429, 21431, 21433 by way of horizontal connections such as 21419 and through-mold vas such as 21421 which may be connected to horizontal connections in level 21401 via solder connections 21423.

FIG. 214 illustrates a package on package implementation wherein one package may implement a radio operating in one or more frequency range such as mmWave, Wi-Fi, or LTE at dies 21429, 21431, 21433 on level 21401 and a second package may implement a radio operating in another frequency range such as mmWave, Wi-Fi or LTE in die 21406. Functions 21414, 21415 in package 21401 and 21435, 21437 in package 21403 need no longer be implemented in discreet functions but instead can be imprinted right on the PCB itself. The dramatically thin dimensions of the components such as DECAPs and inductors used for implementing functions such as a filter, balun, multiplexer, coupler, harmonic filter, or antenna, are seen in Table 8 to be so ultra-thin that these components may be imprinted on the PCB itself. iSFE and eSFE technology offers the ability to imprint these components right on the PCB, in the same plane as the die if desired, as explained below.

FIG. 215 illustrates cross-section of a computing platform with standalone components of an RF frontend, according to some aspects. FIG. 215 illustrates cross-section 21500 of a computing platform (e.g., a circuit board of a handheld phone. Cross-section 21500 includes a PCB 21501, solder balls 21502, laminate or substrate 21503 with micro-bumps and redistribution layers, RF active and passive devices 21504 (e.g., wireless chip), surface mount devices (SMDs) 21505 and 21506, and mold compound 21507.

SMDs 21505 and 21506 may include frontend components such as the previously mentioned baluns, antennas, diplexers, multiplexers, filters (e.g., bandpass and low pass filers), etc. These SMDs perform important functions. For example, baluns are used for eliminating common mode noise, diplexers and multiplexers allow for antenna sharing, and bandpass/low-pass filters reject unwanted signals and blockers. As more frequency bands are added to computing platforms to provide additional services, the number of components grows further. These components, however, can occupy approximately 50% to 70% area of the platform and can cost approximately 30% to 50% of the total Bill of Materials (BOM).

Some aspects describe an integrated substrate frontend (iSFE) or an external substrate front end (eSFE) formed by printing the SMDs and other components in the packaging substrates (e.g., laminates) or host PCB. As such, savings in lateral area and height of the platform are realized. Additionally, a highly integrated computing platform is achieved.

Some aspects describe an apparatus (e.g., a computing platform) which includes a die (e.g., processor die) with a first side and a first set of solder balls coupled to the die along the first side. The apparatus further includes a laminate based substrate adjacent to the first set of solder balls, where the laminate based substrate includes a balanced filter embedded in it, and where the balanced filter is communicatively coupled to the first die via at least one of the solder balls of the first set. Here, the laminate forms the iSFE. In some aspects, depending on the layer count available, the iSFE portion can be directly underneath the die too.

In some aspects, an apparatus is provided which includes: a first transmission path for a first frequency band and a second transmission path for a second frequency band different from the first frequency band. In some aspects, the apparatus further includes a node common to the first and second transmission paths, such that the node is to be coupled to an antenna. In some aspects, the apparatus includes a transmission-zero circuit coupled to the common node.

In some aspects, the transmission-zero circuit provides transmission zeros which are frequencies where signal transmission between input and output is stopped. A filter, for example, uses the transmission zero frequencies together with the passband edge frequencies and passband ripple to form the transfer function between the input and output of the filter, and for shaping the response of the filter. In some aspects, the apparatus with transmission-zero circuit is part of the iSFE.

The iSFE of various aspects may be lower in cost than other integration schemes such as Low Temperature Co-fired Ceramic (LTCC) processes or IPD (Integrated Passive Devices) on SOI (Silicon-on-Insulator) or high resistivity Si or higher cost laminate packages. The iSFE of various aspects can be customized to silicon (Si) as standalone component or integrated in Si package or in PCB on which the Si resides. Cross-section 21500 illustrates laminate 21503 with integrated SMDs 21505 and 21506.

FIG. 216 illustrates cross-section of a computing platform with integrated components of a RF frontend within a laminate or substrate, according to some aspects. FIG. 216 illustrates cross-section 21600 of the computing platform. Those elements of FIG. 216 having the same reference numbers (or names) as the elements of any other figure can operate or function in any manner similar to that described, but are not limited to such. FIG. 216 is used here to illustrate iSFE and eSFE. While FIG. 216 does not illustrate antennas, subsequent figures herein will illustrate how the components and/or technology described in FIG. 216 can be implemented with mmWave and other frequency range antennas to obtain an ultra-thin processor die-antenna component chip.

Cross-section 21600 illustrates laminate 21603 with integrated SMDs 21605 and 21606. Compared to cross-section 21200, here the BOM is reduced because discrete components 21505 and 21506 are no longer needed as standalone components and are fully integrated into laminate 21603 forming fully iSFE components. In some aspects, laminate 21603 uses standard silicon package substrate technology with minimum layer counts (e.g., less than 5 layers) and integrating/printing the functionality of the entire frontend in substrate 21603. Laminate based substrate 21603 of the various aspects is manufactured at low cost using traditional schemes such as core base or coreless substrates. The laminate based substrate 21603 of the various aspects is conducive for silicon package or standalone component with thin core and thin pre-impregnated layers. The laminate based substrate 21603 of the various aspects is also conducive for fan-out and for iSFE. In some aspects, laminate 21603 can have one metal layer as the minimum number of layers or multiple layers depending on the availability of substrate thickness.

In some aspects, when using a single layer or 1.5 layer laminate or low layer count, solder connections can be used instead of vias and the area underneath the device on a main PCB can be used as portions of inductors and capacitors too. Although, FIG. 216 shows solder balls on top side and bottom side of the substrate, it is understood that the solder balls can be replaced with a Land Grid Array (LGA) connection where the solder ball is replaced with regular Surface Mount Technology (SMT) connection. In some aspects, Cu (Copper) pillars on top and bottom or one of the planes can use used. In some aspects, the substrate can have a cavity for the die alongside the integrated passive components.

In some aspects, laminate 21603 can be made using materials used in commonplace packages and PCBs. In some aspects, the material permeability (Er) of laminate 21603 ranges from 2-30. In some aspects, the thickness of laminate 21603 can range from 2 μm to 200 μm depending on density and isolation requirements. In some aspects, laminate 21603 can be made using microvias and through-holes or just one of the interconnects. In some aspects, laminate 21603 can be as minimal as 2 metal layers with one core/prepreg material. In some aspects, the laminate based substrate is independent of microvias.

When using minimal number of metal layers or thin packaging substrates, it is understood that the presence of ground locally can add significant parasitics; while such parasitics are very useful in certain instances they can also degrade the coupling between the mutually coupled inductors. In one such aspect, the main layers of the package may not have locally present ground around in certain areas. Additionally, it is also understood that several of the components in schematics can be implemented using discrete components such as SMT bandpass filters, SMT capacitors and inductors or on Si capacitors and inductors. It is not imperative that all portions are always integrated as printed components on the substrate. Some aspects can also have an odd number of layers in coreless implementation of such substrate. When using minimal number of layers, the techniques of various aspects lend themselves extremely well for flexible/bendable electronics.

By using the right combination of materials, thicknesses, design rules, and architecture, a complete Wi-Fi, BT (Bluetooth), and a global navigation satellite system (GNSS) frontend can be implemented and integrated in substrate 21603. However the aspects are not limited to the above communication standards. In some instances, hardware associated with other standards such as WiGig or 5G signals, which are greater than 10 GHz, can be implemented and integrated in substrate 21603. As such, many if not all the standalone components around silicon chip 21604 can be completely or nearly completely eliminated and the package can be made thinner, less expensive, smaller, and better performing. For example, the thickness of mold compound 21607 is less than the thickness of mold compound 21607, and as such package thickness (e.g., height) is reduced.

In some aspects, laminate 21603 includes an integrated balanced filter for each frequency band which can be connected to other balanced filters in other frequency bands with minimal circuitry. As such, single-ended antenna sharing or dipole antenna sharing across multiple bands is achieved in accordance with some aspects. In some aspects, dominant inductive and dominant parasitic capacitive designs are employed to integrate frontend components in ultra-thin substrate 21603 and PCB 21601 without significant additional processing costs and without the need for non-standard PCB/substrate materials. By using parasitic capacitances, minimal numbers of physical realizable components are used to achieve desired responses in-band and out-of-band. In some aspects, no physical ground is used in the package itself. Instead, in some aspects, the ground of the reference board is used to free up a metal layer of laminate 21603 and/or PCB 21601.

FIG. 217 illustrates a smart device or a computer system or a SoC (System-on-Chip) which is partially implemented in the laminate/substrate, according to some aspects. Connectivity 21770 can include multiple different types of connectivity. To generalize, the computing device 21700 is illustrated with cellular connectivity 21772 and wireless connectivity 21774. Cellular connectivity 21772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 21774 refers to wireless connectivity that is not cellular, and can include personal area networks (such as Bluetooth, Near Field, etc.), local area networks (such as Wi-Fi), and/or wide area networks (such as WiMax), or other wireless communication. In some aspects, various frontend components of the cellular connectivity 21774 such as antennas, baluns, diplexers, triplexers, multiplexers, bandpass filters, low pass filters, etc. are implemented as iSFE.

The above technology will find use in, among other things, mobile device implementations. In past implementations of mobile device IC-antenna applications, the processor IC interfaced directly with the antenna. However, future mmWave and other frequency range applications will require intermediary functions such as multiplexers, baluns, filters, and the like, to be placed in circuitry between the processor die and the antenna. Because space in user devices such as mobile phones is extremely small, these functions, which are today usually implemented by discreet components and surface mounted devices (SMDs), will have to be much thinner than such discreet components and SMDs, and take up much less volume. For example, future stack-up thicknesses are expected to be in the range of less than 100 microns for the die and less than 200 microns for components. Consequently, these components will have to be ultra-thin.

Further, future implementations may also combine mmWave applications with Wi-Fi, WiGig, and LTE applications. Hence there will be need for connection between networks that operate at varying frequency ranges. There will therefore need to be intermediate circuitry between, for example, mmWave antenna solutions and Wi-Fi antenna solutions in package-on-package, or side-by-side implantations. The same can be said for interconnection with LTE and WiGig antenna solutions. In other words, stacked radios at different frequencies with intermediate components may be desirable. It is imperative that SMDs and components between chip and antenna be ultra-thin, ultra-low profile, and PCB-like solutions, because with package-on-package there are more radios, more filtering, and more other wireless components, which are likely to continually increase in density. iSFE and eSFE technology offers a solution to the need for ultra-thin components for these functions and interconnections. Use of iSFE and eSFE technologies enables printing the needed functions like baluns, filters, and the like, right into the substrate itself to make ultra-thin components which are PCB-like components, and eliminate or substantially reduce tall components such as the above discreet components and relatively large SMDs. In other words, using ISFE and eSFE technology, the needed functions can be printed into the substrate itself, not as a component but as printed inductors and capacitors and other functions usually found in discreet components. A multitude of different inductors and capacitors can be printed into the substrate and be used for, among other things, interconnection of different networks implemented in package-on-package configurations, which can be from Wi-Fi frequencies to LTE frequencies to mmWave frequencies. As one example, two-layer structures have been implemented as capacitors where capacitor plates range between 20 to 30 microns. These results make the components as nearly invisible (in terms of thinness) as possible, and so thin as to be in the same plane as the die.

FIG. 218 is a side view of a molded package-on-package embedded die radio system, using the above-discussed ultra-thin components which may be configured between the die and the antenna(s), according to some aspects. The package-on-package implementation of FIG. 218 is very similar to the implementation of FIG. 215, although in FIG. 218 functions such as a baluns, filters, and the like that is implemented by eSFE technology may be imprinted on PCB 21808 itself, according to some aspects. Package 21801 illustrates a first package and package 21803 illustrates a second package. FIG. 218 illustrates dramatic height and volume reduction by use of ultra-thin technology such as integrated substrate frontend (iSFE) or an external substrate front end (eSFE) functions formed by printing the SMDs other components in the packaging substrates (e.g., laminates) or the host PCB of a radio sub-system. For example, in FIG. 218 item 21805 is a decoupling capacitor (DECAP) and 21811 is an iSFE component, both of which may be used in circuitry to implement RF functions such as a filter, balun, multiplexer, coupler, harmonic filter, or antennas, or the like implemented as an iSFE, discussed above. These RF functions may be printed in the substrate as iSFE. Items 21806, 21807, 21809 are dies that embody mmWave, Wi-Fi, and LTE radio systems, respectively, according to some aspects. Noteworthy is that eSFE 21811 and DECAP 21805 are in the range of the height of the dies, which enables drastic height and volume reduction for these functions because they are implemented in iSFE and/or eSFE technology. Arrow 21821 indicates a PCB level with short coax-type ground-signal-ground (GSG) transitions from top to bottom and to outside as needed. Arrow 21823 indicates short and low loss transitions to outside, the target impedance being 30 to 60 ohms as needed, which may be way of solder balls 21819. Die 21806 and eSFE component 21807 may both be imprinted on PCB 21808, where eSFE component 21807 is part of, or forms, circuitry such as described above, coupled between the die 21806 and the antenna (not shown because of space considerations in the drawing). Also illustrated are horizontal connections 21810, 21812 which may connect die 21806 to functions implemented by DECAPs such as at 21815, and eSFE 21817. Die 21806 in mold 21824 may also be connected to DECAP 21815 and iSFE 21817 that may implement functions between the die 21806 and antenna(s) (not shown) by way of horizontal connections such as 21812 and through-mold vias (also not shown).

FIG. 218 illustrates a package on package implementation wherein one package may implement a radios operating in one or more frequency range such as Wi-Fi, or LTE at 21807, 21809 on level 21801 and a second packaged may implement a radio operating in another frequency range such as mmWave in die 21806. Functions 21805, 21811 in package 21801, and functions 21813, 21815, 21817 in or on package 21803 are not implemented as discreet components but instead are imprinted right on the PCB itself. This is an advantage that iSFE and/or eSFE technology provides, with the additional advantage of imprinting functions such as at eSFE 21813 on the same level as the die, here 21806, offering the ability to imprint these components right on the PCB, in the same plane as the die if desired, implemented as explained above. In addition, in the package-on-package aspects described, eSFE and iSFE functions can be interchanged. For example, the iSFE or eSFE supporting a Wi-Fi die 21807 can be placed underneath or at the same level as the mmWave die 21806 and vice versa. In other words, the iSFE/eSFE that supports a particular die at a particular frequency range does not have to be in the same plane as the die it supports. This provides the advantage of locating the iSFE/eSFE circuitry that supports a die in a different plane from the die that is supported, to take advantage of more room that may be available in a different plane, according to some aspects.

FIG. 219 is a side view of the molded stacked package-on-package embedded die radio system with three packages stacked one upon the other, according to some aspects. Illustrated generally at 21900 are three packages at 21901, 21902, and 21903. The packages are illustrated as respectively operating at LTE frequencies by operation of die 21906, at Wi-Fi frequencies by operation of die 21908 and at mmWave frequencies by operation of die 21910 in some aspects. The packages may be molded packages, with molds at 21924, 21926. The components illustrated are essentially the same respective components as described in FIG. 218, according to some aspects, and may function similarity, with eSFE components and iSFE components providing circuitry functions between the dies and antennas, in some aspects. The eSFE and iSFE functions can be interchanged. For example, the iSFE or eSFE supporting Wi-Fi die 21908 can be placed underneath or at the same level as the mmWave die 21910 as may be advantage for use of space in some aspects.

Each of the sub-systems contemplated herein can be implemented using an integrated chip, a system in package, software running on a processor, etc.

Disclosed is a mmWave RF architecture for 5G 30 GHz and 40 GHz bands together with the WiGig 60 GHz band that can be based on two chips, a BBIC and a radio frequency front end (RFFE), also referred to herein as an RFIC. The BBIC and RFIC are connected to each other via a single RF cable, according to some aspects. The disclosed architecture allows simultaneous and autonomous transmission and reception for 5G 2×2 multiple in-multiple out (MIMO) antenna arrays, either in the 24-29.5 GHz spectrum or in the 37-45 GHz spectrum, in parallel with simultaneous and autonomous transmission and reception for WiGig 2×2 MIMO in the 57-70 GHz spectrum. The foregoing two 5G frequency bands are the frequency bands that are generally used for supporting a worldwide stock keeping unit (SKU) product which includes the emerging 5G agreed-upon spectrum, combined with the newest WiGig channel, according to some aspects. In other words, a mobile phone can be configured to operate worldwide, regardless of the 5G frequency band supported in a given geography (i.e., used for transmission and reception in the given geography) where the phone might be. The disclosed system provides this ability with the added advantage of using only one cable between IC sub-systems, and with a very small number of frequency synthesizers, in some aspects a minimal number of synthesizers. A frequency synthesizer generally includes a digital phase lock loop (DPLL) and a voltage controlled oscillator (or a digital controlled oscillator). The term DPLL and synthesizer may be used interchangeably herein. While the disclosed architecture is for the 24-29.5 GHz spectrum and 37-45 GHz spectrum use case, those of ordinary skill in the art will recognize that the disclosed architecture is not limited to this use case. Should other frequency bands ultimately be decided on by various geographies, the disclosed architecture would operate in the spectra of the decided-upon use case.

In some instances herein, the 24-29.5 GHz spectrum may be referred to as 28 GHz, 29.5 GHz, or 30 GHz, the 37-45 GHz spectrum may be referred to as 39 GHz or 40 GHz, and the 57-70 GHz spectrum may be referred to as the 60 GHz or 70 GHz spectrum, merely as a matter of shorthand notation.

The standards group for 5G has currently agreed that for the 5G ecosystem only one of the above two 5G frequency bands will be used at any given time for a device. For example, one of the 5G frequency bands may be supported and used in the United States while another of the 5G frequency bands may be supported and used in Europe. Other country examples can be provided. Or it may be that one internet service provider (ISP) provides service in one of the 5G frequency bands while another ISP in the same country provides service in the second of the 5G frequency bands. Because it is agreed that only one of the above 5G frequency two bands will be used at any given time for a device, one of the two 5G frequency bands will be "unused" or "unsupported" in a given geography (i.e., not used for transmission or reception in the given geography), the particular unused band depending on the country in which the device is used, or the ISP being used.

For a 2×2 MIMO antenna sub-system, there are two information streams (for example, a vertical polarization information stream and a horizontal polarization information stream) transmitted and received in the same frequency band. A concern is how to transmit two information streams that will ultimately be radiated at the same frequency from a MIMO antenna sub-system, across a single RF cable from a BBIC or similar sub-system to an RFIC or similar sub-system, at the same time, without unacceptable distortion or other RF issues. One aspect of the disclosed system is to use the "unused" frequency band out of the above two 5G bands to transmit/receive one of two MIMO streams in the frequency band across the RF cable that connects the BBIC and the RFIC, thereby providing sufficient isolation between the two information streams, because of the separation between the two 5G frequency bands, to decrease distortion caused by the signals to a level that makes transmit and receive commercially acceptable for a wireless user device. In operation, the BBIC performs direct conversion from/to baseband to/from RF and the RFIC performs primarily splitting/combining signals for transmission to/reception from mmWave antenna elements placed in a unified antenna sub-system for 5G and WiGig, according to some aspects. The system is shown in FIG. 220, below, according to some aspects.

Using the alternative ("unused") 5G band for the second MIMO stream requires only a single chain in the BBIC for each band, thus saving in silicon size. A single DPLL for both MIMO streams allows saving more silicon space as well as power consumption. A single DPLL for both MIMO streams provides phase noise coherency between the two streams, contributing to MIMO performance, for example, link budget and reception sensitivity, as opposed to a two synthesizer solution with a common reference clock. Avoiding synthesizers in the RFIC allows saving in silicon size, eliminates or greatly reduces pulling effects and frequency jumps of a synthesizer VCO, thus allowing for much faster transitions from TX to RX and vice versa, eventually leading to better system performance. In addition, having no synthesizers in RFIC, means that the RFIC does not require complex synchronization schemes and calibration between multiple RFICs with independent synthesizers to perform large array beamforming, in some aspects. Direct conversion to RF mmWave frequencies improves resilience to unwanted spurs and emissions usually avoiding large filters and thus saving in silicon size. In addition direct conversion to mmWave frequencies as described here improves coexistence with other communication protocols such as Long Term Evolution (LTE), Wireless Local Area Network (WLAN), Bluetooth (BT), and Global Navigation and Satellite System (GNSS) due to good separation (discussed below) between mmWave frequencies and sub-6 GHz frequencies of these protocols.

FIG. 220 is a high level block diagram of mmWave RF architecture for 5G and WiGig according to some aspects. System 22000 includes BBIC 22001, which is coupled to one or more RFICs 22003 through 22003 by way of RF cables 22002 through 22002. In some aspects, there can be one or more cables, each with its own RFIC, as indicted by the vertical dots in the drawing. In other words, there may be N cables and N RFICs. In some aspects, a value for N might be 8, for example for base stations, and 2, for example for mobile phones. Those of ordinary skill in the art may implement systems with different maximum values for N, depending on design requirements. Each RFIC is coupled to an mmWave antenna sub-system for 5G and WiGig, 22005 through 22005. In some aspects, there can be one or more antenna sub-systems, as indicted by the vertical dots in the drawing. In other words, there may be N antenna sub-systems with example values for N as discussed above. The baseband to RF conversion (and vice versa) performed in the BBIC 22001 is done in some aspects with only two synthesizers: one synthesizer for direct up/down-conversion for WiGig in the 57-70 GHz spectrum, in parallel with another synthesizer for 5G dual MIMO streams, one of the pairs of streams in the 24-29.5 GHz spectrum and one in the pair of streams in 37-45 GHz spectrum, as discussed below. No additional synthesizer is required in the RFICs 22003 through 22003.

FIG. 221 illustrates a frequency conversion plan for a mmWave RF architecture for 5G and WiGig, according to some aspects. The up-conversion scheme in FIG. 221 is for a transmitter (TX). Down-conversion for the receiver (RX) is essentially identical in concept. In general, a 5G MIMO dual stream is split across a single RF cable with sufficient isolation. A first MIMO stream (out of two) is directly up-converted from baseband to RF during transmission and down-converted from RF to baseband during reception, either in the 5G 24-29.5 GHz frequency band or in the 5G 37-45 GHz frequency band. The second MIMO stream uses the alternative RF band not being currently used, either the 37-45 GHz band or the 24-29.5 GHz band. A single synthesizer generates both the RF frequency as well as an intermediate frequency (IF) by multiplying the RF by $3/2$ in the case of the 24-29.5 GHz band or by multiplying the RF by $2/3$ in the case of the 37-45 GHz band. The LO frequency is then generated from subtracting the RF from the IF, according to some aspects. Both IF and LO are driven across a single cable with sufficient isolation from the first MIMO stream in RF. In the RFIC, during transmission, a mixer is used to reproduce the RF frequency for the second MIMO stream by multiplying the IF and LO signals (or during reception to convert the RF signal into IF by multiplying it with the LO signal from the BBIC), in some aspects. Each of the MIMO streams is connected through an RF chain (including PAs, LNAs, phase shifters and combiners/splitters) to a dedicated antenna array, each stream with different polarization (one stream to horizontal polarization and the other stream to vertical polarization) in some aspects. The foregoing multiplying and the foregoing subtraction can be considered frequency conversions by a frequency convertor that includes a multiplier circuit and a frequency convertor that includes a subtraction circuit, or a combination of both circuits, according to some aspects.

System 22100 includes combination analog RF silicon, which includes a BBIC 22101. In this aspect, DAC 22110 is coupled to mixer 22112, which is coupled to amplifier 22114 which is coupled to band pass filter (BPF) 22116 in the bank of BPFs 22160. Digital to Analog Convertor (DAC) 22110 transmits a 5G horizontal polarized broadband signal to mixer 22112. DAC 22111 is coupled to mixer 22113, the output of which is coupled to amplifier 22115, which amplifier is coupled to BPF 22117. A Synthesizer that includes Digital Phase Lock Loop (DPLL) 22118 and that may include a Digital Controlled Oscillator (DCO) (not shown), generates a 5G 37 GHz-45 GHz spectrum signal which up-converts the broadband vertically polarized signal from DAC 22111, via mixer 22113, to the 5G 37 GHz-45 GHz band, which is then amplified and transmitted to RCIF 22103 via cable 22102 by way of BPF 22117. A local oscillator (LO) signal 5G LO 12-15 GHz is generated by multiplying the 5G signal in the 37-45 GHz band by $1/3$ at 22122, which LO signal is then transmitted via amplifier 22124 and BPF 22126 over cable 22102. A second 5G RF signal, which is a 24-29.5 GHz band signal, is generated by multiplying the synthesizer output signal by $2/3$ at 22120. The 5G RF signal in the 24-29.5 GHz band is then mixed with the baseband horizontally polarized signal from DAC 22110 in mixer 22112 to up-convert the baseband horizontally polarized signal to the 24-29.5 GHz band.

In addition, because the vertically polarized stream and the horizontally polarized stream will be in the same 5G frequency band for TX or RX by a 2×2 MIMO antenna sub-system in some aspects, there is a need to transmit the two streams from the BBIC across the same cable to the RFIC without one stream distorting the other stream on the cable. This may be accomplished, in some aspects, by shifting one of the streams to a different (i.e., "unused") frequency band at the BBIC in order to transmit the two streams in two frequency bands separated by a sufficient frequency to provide isolation between the two streams when they are transmitted across the cable. When the two streams are received by the RFIC, the stream that was shifted to a different frequency band can be shifted back to its frequency band for transmission by the antenna sub-system via an RF chain. Stated another way, when transmitted across the cable from the BBIC, the two streams will be separated by frequency band, and after bring received by the RFIC the two streams will be separated by separate RF chains in silicon. As an example, if the two streams are a vertically polarized signal in the 30 GHz band and a horizontally polarized signal in the 30 GHz band, one of the two streams can be up-converted to the 40 GHz band for transmission across the cable, and then downshifted back to the 30 GHz band when it is received at the RFIC. Care can be taken to provide that the two streams are at relatively the same power level (which is a requirement for MIMO anyway) in order to minimize or resolve self-induced noise in one frequency band that may be present and cause noise on the other frequency band, despite up-conversion and down conversion. Two streams at relatively the same power level in some aspects may mean power levels within approximately 10 dB of each other. Further, and as will be described below, the signal in each frequency band should have its own BPF on the BBIC at the input to the cable, and on the RFIC at the output of the cable, in order to separate each signal, which also reduces the above noise. The two streams can then be transmitted, one stream via the 5G frequency band supported and used in the particular geography in which the user device is used, and the other stream via the 5G frequency band that is unused or "unsupported" in in the particular geography.

In the following description, if the geography or the ISP associated with the user device operates in the 28 GHz band, the contact 22131 of switch 22130A will be set to position 22134, the contact of switch 22150A will be set to position 22154 and the "unused" frequency band is the 39 GHz band, according to some aspects. Similarly, if the user device is moved to a geography or ISP area that supports the 39 GHz band, the contact 22131 of switch 22130A will be set to position 22132 and the contact 22151 of switch 22150A will be set to position 22152, and the "unused" frequency band is the 28 GHz band, according to some aspects. While the word "contact" might connote a mechanical connection, as used herein "contact" can also mean an electrical connection wherein an electronic device is biased or otherwise "set" to a particular position. Switches herein may be implemented as appropriate electronic device circuits such as field effect transistor (FET) circuits and other device circuits. The electronic devices may act as the switches described herein and may be configured to be automatically set to the appropriate position when the user device moves from one geography or ISP area to another geography or ISP area such that the "unused" frequency band becomes the "used" frequency band, as discussed above in this paragraph.

RFIC 22103 includes BPFs 22130, 22140 and 22150 illustrated in BPF bank 22162. BPF 22130 is connected to switch 22130A which has contact 22131 settable to positions 22132 and 22134 depending on the geography or the ISF as discussed above. Position 22132 connects to mixer 22138 which then connects to splitter/amplifier 22139, the output of which is coupled to antenna sub-system 22190. BPFs 22130, 22140 and 22150 are connected to cable 22102, according to some aspects. BPF 22130 receives at input 22129 a horizontally polarized RF signal in band 24-29.5 GHz that enters cable 22102 by way of BPF 22116. BPF 22140 receives at input 22141 the LO signal between 12-15 GHz that enters the cable by way of BPF 22126. BPF 22150 receives at 22149 the horizontally polarized signal in the 37-45 GHz band that entered the cable by way of BPF 22117. BPF 22150 is connected to switch 22150A which has contact 22151 settable to positions 22152 and 22154. Position 22154 connects to splitter/power amplifier 22158 thereby providing the vertically polarized signal in the 39 GHz band to antenna sub-system 22190, according to some aspects. LO signal in the 12-15 GHz band received at input 22141 proceeds from BPF 22140 over line 22142 to mixers 22138 and 22156. Mixer 22156 is connected to splitter/power amplifier 22158. When the contact 22131 of switch 22130A is set to position 22132, the horizontally polarized signal in the 24-29.5. GHz band proceeds to mixer 22138 where it is mixed with the LO signal in the 12-15 GHz band to provide the horizontally polarized signal in the 39 GHz band to splitter/power amplifier 22139 and then to antenna sub-system 22190. Hence, the vertically polarized signal in the 39 GHz band proceeds directly from position 22152 through splitter/power amplifier 22153. The horizontally polarized signal in the 39 GHz band is generated when the contact of switch 22130A is connected to mixer 22138 by way of position 22132 and the mixing of the LO signal and the 24-29.5 GHz signal in mixer 22138 generates the horizontally polarized 39 GHz signal is, according to some aspects.

When the contact 22131 of switch 22130 is set to position 22134, the horizontally polarized signal in the 24-29.5 GHz band received at input 22139 of BPF 22130 via BPF 22116 then proceeds directly to splitter/power amplifier 22136 and is transmitted to antenna sub-system 22190. When the contact 22151 of switch 22150A is set to the 22154 position, the vertically polarized signal in the 37-45 GHz band that is received via BPF 22117 at input 22139 of BPF 22130 is mixed in mixer 22156 with the LO signal in the 12-15 GHz band from BPF 22140 to produce the vertically polarized signal in the 28 GHz band. Thus, the vertically polarized signal in the 28 GHz band is generated by mixing, and the horizontally polarized signal in the 28 GHz band is generated directly by way of switch 22130A being set to contact 22134 to transmit the horizontally polarized signal directly to splitter/power amplifier 22136. FIG. 221A is a schematic of frequency allocation for the 5G 40 GHz frequency band as explained with respect to FIG. 221, according to some aspects. The frequency up-conversion scheme of FIG. 221 is for transmit. The down-conversion scheme for Receive is essentially identical in concept to the scheme for transmit. In FIG. 221A DPLL1 is illustrated as providing a signal in the 5G 37-43.5 GHz, frequency band that may be used to up-convert a 5G vertically polarized signal to the 37-43.5 GHz, frequency band, according to some aspects. Multiplying the signal in the 37-43.5 GHz, frequency band by ⅔ yields a signal in the 5G 24-29.5 GHz frequency band that can be used to up-convert a horizontally polarized 5G signal to the 24-29.5 frequency band, according to some aspects. The output signal from DPLL1 can also be multiplied by ⅓ to form an LO signal in the 12-15 GHz frequency band as illustrated, according to some aspects. In FIG. 221A, DPLL2 is illustrated as providing a in the WiGig 57-70 GHz frequency band. This WiGig signal can be used to modulate WiGig horizontally polarized signals and WiGig vertically polarized signals in much the same way as was described for the schematic of frequency allocation for the 5G 40 GHz frequency band, also for up-conversion for transmit, according to some aspects.

Phase noise coherency between the different MIMO streams is preserved by relying on the concept that the synthesizer source being used to shift a stream across the unused 5G frequency band out of one of the two bands (40 GHz or 30 GHz) is also being used to shift the stream back to its appropriate transmit frequency, as seen in FIG. 221B. FIG. 221B illustrates a synthesizer source being used to shift the second frequency band stream, out of two frequency band streams, across the unused 5G frequency band, according to some aspects. In FIG. 221B cable 22102 carries signals IF1, IIF2 and local oscillator signal LO over individual lines in the cable, according to some aspects. Signal IF2 is mixed with the local oscillator LO at 22112B to up-convert the IF2 signal to the appropriate 5G band. The up-converted signal is then input to mixer 22138B where the same LO signal is used to down-convert the signal to the appropriate 5G band. The up-conversion adds phase noise but the down conversion subtracts the same phase noise in accordance with equations (1) and (2) below. The results have been verified by laboratory test.

$$\sin(\omega_{LO}t+\varphi(t)\sin(\omega_{IF2}t)=0.5\cos(\omega_{LO}t+\omega_{IF2}t+\varphi(t))+\text{image} \quad (1)$$

$$\cos(\omega_{LO}t+\omega_{IF2}+\varphi(t)\sin(\omega_{LO}t+\varphi(t))=0.5\sin(\omega_{IF2}t)+\text{image} \quad (2)$$

In some aspects signal IF2 versus signal IF1 has a delay difference of approximately ΔT<1 nsec, equivalent to 1 GHz. FIG. 221C illustrates the phase noise spectrum in terms of phase noise power over a frequency band of 100 MHz. The curve 22170 over that frequency band indicates insignificant noise contribution above 100 MHz.

FIG. 222 illustrates a transmit up-conversion frequency scheme for 5G for a 40 GHz frequency band, according to some aspects. An example for up-converting to the 5G 40 GHz band utilizing the "unused" 5G 30 GHz band is shown: the vertical polarization stream is converted directly to the 30 GHz band while the horizontal polarization stream uses the 30 GHz band and then reconverted back to 40 GHz band by mixing with the LO.

In FIG. 222, the system 22200 includes BBIC 22201 connected to RFIC 22203 by way of cable 22202. FIG. 222 is very similar to FIG. 221 but adds the WiGig signal in parallel with the two 5G signals. In BBIC 22201, DAC 22231 has baseband WiGig as an output. DAC 22231 is connected to mixer 22233. A DPLL 22234 for the appropriate WiGig frequency band, here 57-71 GHz, is connected as a second input to mixer 22233. The mixing function then provides a WiGig RF in the WiGig band 57-71 GHz which proceeds to amplifier 22235 and then to BPF 22237 in BPF bank 22260, according to some aspects. RFIC 22203 includes BPF 22241 in BPF bank 22262 which receives the WiGig RF 57-71 GHz band signal over cable 22202 as an input at 22238, where it is transmitted directly to splitter/power amplifier 22243 and then to antenna sub-system 22290 in the appropriate gigahertz frequency band, noted here as 60 GHz, according to some aspects.

The combination of DAC 22210 and mixer 22212, DPLL 22218, multipliers 22220 and 22222, amplifiers 22214, 22224, and BPFs 22216, 22226 is essentially the same combination, and provides essentially the same function, as combination DAC 22110, mixer 22112 DPLL 22118 and multipliers 22120 and 22122, amplifiers 22114, 22124 and BPFs 22116, 22126 of FIG. 221, respectively. In other words DPLL 22218, like DPLL 22118 of FIG. 221, generates a vertically polarized 5G signal in the 37-45 GHz frequency band. Similarly, as in FIG. 221, the signal in the 37-45 GHz band is multiplied by ⅓ to provide local oscillator signal LO in the 12.3-15 GHz band, which is then amplified in amplifier 22224 and is transmitted over cable 22202 via BPF 22226, according to some aspects. The signal from DPLL 22218 is also multiplied by ⅔ at 22220 to provide a signal in the 24-29.5 GHz frequency band which up-converts the 5G horizontally polarized baseband signal from DAC 22210 to a horizontally polarized signal in the 24-29.5 GHz band by way of mixer 22212, according to some aspects. Likewise, the combination of DAC 22211, mixer 313, amplifier 315, and BPF 317 is essentially the same as, and provides essentially the same function as, the combination of DAC 22111, mixer 22113, amplifier 22115, and BPF 22117 of FIG. 22121. In other words the vertically polarized baseband signal from DAC 22211 is up-converted via mixer 22213 to a vertically polarized signal in the 37-45 GHz band, which is then provided via amplifier 22215 and BPF 22217 to cable 22202, according to some aspects.

RFIC 22203 includes the combination of band pass filter 22230, switch 22230A, contact 22221, mixer 22238 and splitter/power amplifier 22239 which is essentially the same combination as, and provides essentially the same function as, BPF 22130, switch 22130A, contact 22131, and mixer 22138 of FIG. 221. Similarly, BPF 22240 is connected to mixer 22238 and to mixer 22256 via line 22242 which combination is essentially the same as, and provides essentially the same function as, the combination of BPF 22140, line 22142, mixer 22138, and mixer 22156 of FIG. 221. Finally, the combination of BPF 22250 switch 22250A, contact 22251 and splitter/power amplifier 22253 is essentially the same as and provides essentially the same function as, BPF 22150, switch 22150A, contact 22151, mixer 22156 and splitter/power amplifier 22158 of FIG. 221. Consequently, as in FIG. 221, the horizontally polarized signal in the 39 GHz band is provided by contact 22231 set to position 22232 so that the horizontally polarized signal in the 39 GHz band is generated by the horizontally polarized 24-29.5 GHz signal proceeding through cable 22202 via BPF 22216 to BPF 22230. That signal is then down-converted by operation of mixer 22238 with the LO signal in the 12.3-15 GHz band which proceeds over cable 22202 via BPF 22226 to input 22241 of BPF 22240 of RFIC 22203. Similarly to FIG. 221, when switch 22250A of RFIC 22203 has its contact 22251 set to position 22252, the vertically polarized signal in the 39 GHz band proceeds directly from the 37-45 GHz signal via BPH 2217 in BBIC 22201 over cable 22202 to input 22249 of BPF 22250 to splitter/power amplifier 22253. The vertically polarized 39 GHz frequency signal band is therefore generated directly.

FIG. 223 illustrates a transmit up-conversion scheme for a 28 GHz transmit scenario, according to some aspects. In this case, since the 28 GHz band is assumed to be in operation because of geographical or ISP requirements, switch 22330A will have its contact set to position 22333 and switch 22350A will have its contact set to position 22352. In FIG. 223 the combination of BPF 22330, switch 22330A, contact 22331 set to position 22333, and splitter/power amplifier 436 provide essentially the same function as, and is essentially the same combination as, BPF 22130, switch 22130A, contact 22231 set to position 22134, and splitter/power amplifier 22136 in FIG. 221, according to some aspects. Combination BPF 22340, mixer 22356, BPF 22350, switch 22350A, contact 22351 set to position 22352, and splitter/power amplifier 22358 are essentially the same combination as, and provide essentially the same function as, combination BPF 22150, switch 22150A, contact 22151 set to position 22154, mixer 22156, and splitter/power amplifier 22158 of FIG. 221, according to some aspects.

Turning now to the streams including the vertically polarized and horizontally polarized signals in the 28 GHz band, the horizontally polarized signal is up-converted from baseband to the 24-29.5 GHz band in mixer 22312 of BBIC 22301 is transmitted via amplifier 22314 and BPF 22316 to the input of cable 22302, according to some aspects. The horizontally polarized signal in the 24-29.5 GHz band is therefore received at input 22329 of BPF 22330 and transmitted directly to splitter/power amplifier 22336 for transmission to antenna sub-system 22390, according to some aspects.

The vertically polarized signal is up-converted to the 37-45 GHz band in mixer 22313 of BBIC 22301 and is transmitted via amplifier 22315 and BPF 22317 to the input of cable 22302, according to some aspects. This vertically polarized signal is received over the cable 22302 at input 22349 of BPF 22350. The signal is transmitted via switch 22350A contact 22351 that, as discussed above, is set to position 22352. The vertically polarized signal in the 37-45 GHz band is therefore transmitted to mixer 22356. Local oscillator signal LO in the 12.3-15 GHz band is transmitted via amplifier 22324 and BPF 22326 of BBIC 22301 to cable 22302, according to some aspects. That signal is received by the RFIC at input 22341 of BPF 22340 and is transmitted over line 22342 to both mixers 22338 and 22356. The vertically polarized signal in the 37-45 GHz band is down-converted in mixer 22356 with the LO signal to produce the vertically polarized signal, now in the 28 GHz frequency band, which is transmitted to splitter/power amplifier 22358 and then to antenna sub-system 22390, according to some aspects.

The system discussed above operates under the assumption that both 5G frequency bands do not operate (are not supported) at the same time in a given geography. Should that condition change such that in some geographies there is a need for both 5G frequency bands to operate at the same time, this could be accomplished by providing an extra frequency synthesizer in the BBIC so that both 5G frequency bands could be transmitted across the cable simultaneously, according to some aspects. This is much like the WiGig frequency band and the 5G frequency band that are transmitted across the cable, as discussed above. In this case there would still have to be an RF chain for each 5G frequency band in the RFIC but there would be no need for mixers to shift a signal back to its original 5G frequency band.

FIG. 224A is a first section of a BBIC block diagram, according to some aspects. FIG. 224B is a second section of a BBIC block diagram, according to some aspects. FIGS. 224A and 224B are missing the LO signal discussed above. However, FIGS. 224A and 224B are included to illustrate the functions discussed below.

FIG. 224A illustrates additional detail for the system illustrated in FIGS. 222 and 223. In this aspect, the circuitry is described in terms of In-phase and Quadrature (IQ) components. For example, 22401 illustrates a transmit scheme where element 22403A illustrates an In-Phase signal source while 22405A illustrates a quadrature signal source for WiGig. Element 22407 illustrates the appropriate clock generation. At 22403 the Receive scheme is illustrated for the same type of elements. The same elements are illustrated for each of the two 5G frequency bands for both a transmit scheme and a Receive scheme. In FIG. 224B switches 22451, 22452, 22455 operate to place the system in TX mode, RX mode, or, if desired for testing and calibration, in Loopback mode. Loopback refers to the routing of electronic signals, digital data streams, or flows of items from their source through a system and back to their source without intentional processing or modification. This is primarily a way of testing the transmission or transportation infrastructure of a system. Various implementations or aspects exist. As one example, a communication channel with only one communication endpoint may be tested. Any message transmitted by such a channel is immediately and only received by that same channel. In telecommunications, loopback devices perform transmission tests of access lines from the serving switching center, which usually does not require the assistance of personnel at the served terminal. The disclosed system has this capability by the switch disconnecting the RFIC and closing the loop between TX and RX for test and calibration of the system, usually calibration of the BBIC, according to some aspects. In some aspects, the testing and calibration addresses IQ imbalance. The TX, RX and Loopback modes are controlled by radio transceiver control (RTC) 22457 which receives control signals from a processor unit (which may include more than one digital processor), not shown. Switches 22451, 22452, 22455 each have three positions, enumerated for one of the switches as 22453, 22453A (top), 22453B (lower), and 22453C (middle), according to some aspects. When the contact of switch 22453 is switched to 22453A (and contacts of switches 22451 and 22455 are also switched to the top position) the system is in TX mode. When the contact of switch 22453 is switched to 22453B (and contacts of switches 22451 and 22455 are also switched the lower position) the system is in RX mode. When the contact of switch 22453 is switched to 22453C (and contacts of switches 22451 and 22455 are also switched the middle position) the system is in Loopback mode. In some aspects Loopback mode may be used to conduct the testing and calibration discussed above, as needed.

Intermediate Frequency (IF) switch 22458, which operates as a switch/splitter/combiner for the transmission and reception of streams to/from up to four RFICs, each of which has its own cable as discussed above. Here the cables are illustrated as 22402-1, 22402-2, 22402-3, and 22402-4. One or more of the four streams may be switched for Transmit/Receive in this manner.

Example block diagrams of Synthesizer A and Synthesizer B are also illustrated in FIG. 224B. When designing a frequency synthesizer, the exact frequency to the synthesized is generally not the initial frequency of the synthesizer. Generally the initial frequency can be a multiple of 2 or a division of two of the ultimate frequency. Here a synthesizer includes a voltage controlled oscillator (VCO) or a digital controlled oscillator (DCO) (not shown) and a DPLL such as 22460. The DCO generates a specific frequency which is tightly controlled by the DPLL. Ultimately the synthesizer will provide a specific frequency, for example a frequency that is to be transmitted on, according to some aspects. Two dividers 22462, 22464 divide their input frequency, here a signal in the 46-60 GHz band, by 2, and provide the signals noted (in the 23-30 GHz band and the 11.5-15 GHz band). These signals are then respectively added to as indicated in the figure to generate the desired frequency such as, here, a LO frequency in the 37-45 GHz band for 5G (here indicated as 40 GHz as a shorthand notation). Synthesizer B operates similarly, except that the signal in the initial frequency band (46-60 GHz) is added with the signal in the 11.5-15 GHz band to arrive at the signal in the 57-70 GHz band for WiGig, (here indicated as LO-60 GHz as a shorthand notation).

FIG. 225 is a detailed radio frequency integrated circuit (RFIC) block diagram, according to some aspects. FIG. 225 is similar to the RFIC component of FIGS. 222 and 223, but with additional detail. In RFIC 22500, duplex control via duplexer 22505 to and from the RFIC is controlled by Radio Transceiver Control (RTC) 22503. A low power digital phase locked loop (LPDPLL) 22501 provides clocking. LPDPLL 22501 has a degraded frequency performance but very low power consumption. LPDPLL 22501 is used in some aspects as a clock for RTC 22503. The LPDPLL 22501, although intentionally degraded for power conservation, is well suited for clock use. RTC 22503 is used for such functions as placing the system in Transmit mode, placing the system in Receive mode, placing the system in Loopback mode, setting up certain registers for various functions, tuning the amplification of various amplifiers for improved or optimum configuration, and the like, according to some aspects. While radio is very much an analog system, there are functions such as the foregoing which need to be controlled digitally, which can be accomplished by the RTC, which is a digital system which samples dedicated control information, here indicated as RTC Data input to RTC 22503. This RTC Data comes across the cable from the BBIC, which receives such information from a system processor.

In some aspects, all information is transmitted and received through the cable, so in addition to four signals across the cable (5G 28 GHz band signal, 5G 39 GHz band signal, LO, and WiGig band signal) control signals, too, come across the cable. Consequently, within the disclosed 5G mmWave system resides the Radio Transceiver Control system. The RTC has a component on each side of the cable, has a frequency of its own, which does not interfere with the frequencies of the mmWave system within which it resides, and provides for communication between the disclosed mmWave system and the RTC system, according to some aspects. Stated another way, the RFIC illustrated in FIG. 225 is controlled by RTC 22503 which receives its control instructions over the cable from a control processor, according to some aspects. In some aspects, the BBIC may be located on the mother board of the mobile device, whereas the RFIC is generally located in a place that will allow radiation of the signals via the antenna sub-system to the air. In some aspects, the RFIC may be glued to the glass, just below the screen, internal to the mobile device.

FIG. 225 also illustrates pairs of quad antenna control such as 22502, including phase shifters such as 22504 and bidirectional amplifiers 22506, illustrated as two triangles in opposite directions, to denote power amplification for Transmit and low noise amplification for Receive. The amplifiers 22506 may also be individual amplifiers, one for Transmit and one for Receive. If the amplifiers are bidirectional amplifiers for amplification in either direction, they would in some aspects be switched by command from the RTC, discussed below, to power amplifier (PA) for Transmit and low noise amplifier (LNA) for Receive. In FIG. 225, quad pairs 22515, 22517 are for the WiGig 57-70 GHz band, quad pairs 22544, 22546 are for the 5G 24-29 HGz band, and quad pairs 22565, 22568 are for the 5G 37-44 GHz band. Quad pairs 22515, 22517 are connected to splitter/combiner 22509 via bi directional amplifiers 22511, 22513. Switches 22531, 22551 and mixer sub-systems 22538, 22556 are general illustrations of the RFIC switch-mixer circuitry of FIGS. 222 and 223.

FIG. 226 is a block diagram of the full system illustrating control signals on the cable, according to some aspects. BBIC 22601 is connected to RFIC 22603 by way of cable 22602. The horizontally polarized 5G stream H is seen to be generated for transmit to, and also receive from, RFIC 22605, at DAC 22610 and ADC 22611, respectively. DAC 22610, ADC 22611, and DPLL 22613 operate as explained for the corresponding components in FIGS. 222 and 223. The vertically polarized 5G stream V is seen to be generated and shifted for Transmit to, and Receive from, RFIC 22603 at DAC 22621 and ADC 22623, respectively. DAC 22621, ADC 22623, and DPLL 22613 also operate as explained for the corresponding components in FIGS. 222 and 223. The LO signal in the 12.3-15 GHz band is generated as explained in FIGS. 222, 223 and transmitted by cable 22602 via line 22643. Amplifiers 22615, 22617 are amplifiers for the H Transmit and Receive streams, respectively, the active amplifier selected by switch 22620. Similarly, amplifiers 22626, 22628 are amplifiers for the V Transmit and Receive streams, respectively, the active amplifier selected by switch 22622. Generally speaking, the switches can be controlled by a control processor that may be controlling Transmit and Receive of the system. Generally, the switches are all in Transmit mode or all in Receive mode.

On the RFIC side the V stream and the H stream and LO are received for Transmit and Receive. Antenna control quads are illustrated generally at 22664 and 22666, respectively for transmission of the vertically polarized stream and the horizontally polarized stream. Control quads include phase shifters, PAs and LNAs, which in some aspects may be integrated into a bidirectional amplifier switchable to PA and LNA respectively for Transmit/Receive. The horizontally polarized signal in the 24-29.5 GHz band is received via line 22652. When the switch 22630A is in the 22634 position the horizontally polarized signal in the 24-29.5 GHz band is transmitted to quad antenna control 22674. When switch 22630A is in the 22632 position, the horizontally polarized signal in the 24-29.5 GHz band is mixed with the 5G LO signal in the 12-15 GHz band in mixer 22638 and the resulting horizontally polarized signal in the 37-45 GHz band is transmitted from mixer 22638 to antenna control quad 22670. The vertically polarized signal in the 37-45 GHz band is received at line 22654. When the switch 22650A is in the 22661 position, the vertically polarized signal in the 37-45 GHz band is transmitted to antenna control quad 22672. When the contact of switch 22650A is in the 22663 position, the vertically polarized signal in the 37-45 GHz band is transmitted to mixer 22656 where it is mixed with the LO signal in the 12-15 GHz band via line 22653 and the resulting vertically polarized 24-29.5 GHz signal is transmitted from mixer 22656 to antenna control quad 22676. The foregoing was for Transmit mode. In Receive mode the operations are just the opposite and provide the received signal to the BBIC 01.

As discussed above with respect to FIG. 225, the RFIC is controlled by RTC 22503 which receives its control instructions over the cable from a control processor, according to some aspects. This is illustrated in FIG. 226 where control modem 22664, LPDPLL 22662, and reference clock 22666 provide control signals, received from a processor, over line 22668, to RFIC 22603 via lines 22645 and 22646, respectively. Reference clock 22676 provides clocking to RTC 22603 of the RFIC (as discussed in FIG. 225), and also provides clocking to LPDPLL 22662 and control modem 22664. Also, as can be seen from lines 22641, 22642, 22643, 22644, 22645, and 22646; and lines 22651, 22652, 22653, 22654, 22655, and 22656, all information from and to BBIC 22601, and to and from RFIC 22603, is transmitted via only cable 22602. Of interest is that the reference clock 766, that is used for control, is transmitted only in one direction on cable 22602, namely to the RFIC. Control modem 22664 connects to BPF 22671, and LPDPLL 22662 and reference clock 22666 connect to low pass filter 22673 on the BBIC side. Control modem 22663 connects to BPF 765 via line 755 to receive control signals from control modem 22664 in the BBIC. Similarly, on the RFIC side, LPDPLL 22661 connects to LPF 22667 to receive signals from line 22656, according to some aspects.

Of further interest is the fact that because all signals proceed on the foregoing lines, the banks of BPFs (and for some control signals, LPFs) are needed on each side of the cable 22602 in order to split the signals apart on each side of the cable 22602 so that the signals are transmitted to the appropriate components, in both directions. The signals are transmitted from and to the BBIC and to and from the RFIC, for Transmit mode and Receive mode, according to some aspects, FIG. 227 illustrates a schematic allocation of radio frequency (RF), intermediate frequency (IF), and local oscillator (LO) frequency for a sweep across a variety of channel section options, according to some aspects. FIG. 227 illustrates that there are several channel options, here 12 possible channels, which are combinations of WiGig and 5G channels. FIG. 227 illustrates at 22701 the WiGig DPLL signal. The 5G vertically polarized 30 GHz signal and the horizontally polarized 30 GHz IF signal is illustrated at 22703 and 22705. The local oscillator signal is illustrated at 22707. The 5G control signal is illustrated at 22709 and the WiGig control signal is illustrated at 22711.

FIG. 227 illustrates that regardless of the channel selected, there is good frequency separation between and among all of the signals as seen from the vertical axis. This frequency separation enables sufficient isolation of the frequency bands when transmitted across the cable, as discussed above. Generally there is no additional isolation provided on the cable and the frequency band separations provided the desired isolation, the frequency bands being received via BPFs (and in one control case an LPF) as discussed with respect to FIGS. 222, 223 and 226, in some aspects. The information for FIG. 227 was derived from simple simulation. The thickness of the lines is equivalent to bandwidth. For example, the WiGig signal is in the 57-71 GHz band and may be 4 GHz wide, while the 5G signals may be 1 GHz wide. The LO signal is seen to be very narrow bandwidth. The 5G control signal may be 300 MHz in bandwidth. Each line thickness reflects the width of the channel within the band.

FIG. 228 illustrates a fixed frequency LO transmitter up-conversion scheme, according to some aspects. As an initial note, FIG. 228 omits an illustration of the BPLs and LPLs that are illustrated on both the BBIC side and the RFIC side in FIG. 226 and discussed above as being important to the disclosed system. Likewise FIG. 229, to be discussed below, omits the BPLs and the LPL on the BBIC side. The BPLs and LPLs are omitted in both figures merely because of lack of space in the drawing. However, it should be understood that in practice the BPLs and LPLs would be located in, and would function in, both FIG. 228 and FIG. 229 as illustrated and described in FIG. 226.

In FIG. 228, BBIC 901 is connected to RFIC 22803 by a single cable 22802. BBIC 22801 includes DAC 22810 attached to mixer 22812 which is attached to amplifier 22816, in a transmit figuration. The output of amplifier 22816 is a vertically polarized signal in the 5G 23.8-30.3 GHz frequency band as discussed below, and is transmitted over cable 22802 in the same manner as in FIGS. 222, 223, and 226. As mentioned above, because of drawing space considerations, the BPFs on each side of the cable are not shown. DPLL 22818, with a 5G frequency range of 23.8 to 30.3 GHz, is also connected to mixer 22812. DPLL 22818 is also connected to mixer 22812A, according to some aspects. A second, synthesizer 22818A (referred to as a low power digital phase locked loop (LPDPLL)) generates a fixed frequency signal of 13.2 GHz. LPDPLL 22818A is connected to mixer 22812A and to amplifier 22824. The output signal of amplifier 22824 is a signal of 13.2 GHz frequency, and is transmitted as an LO signal over the cable 22802 to RFIC 22803, according to some aspects. DAC 22811 is connected to mixer 22813, which is also connected to mixer 22812A. The output of mixer 22813 is connected to amplifier 22815. The output of amplifier 22815 is a vertically polarized signal in the 37-43.5 GHz frequency band as discussed below, that is transmitted over cable 22802 to RFIC 22803, according to some aspects. RFIC 22803 is in essentially the same configuration as, and provides essentially the same function as, RFIC 22203, 22303 and 22603 in FIGS. 222, 223, and 226, according to some aspects. BBIC 22801 also includes WiGig circuitry 22831, 22833, 22834 and 22835, and its associated circuitry in RFIC 22803. The out signal of amplifier 22835 in the WiGig 5G 57-72 GHz frequency band is transmitted over cable 22802 in the same manner as in FIGS. 222, 223, and 226. Since the operation of this circuitry is as discussed above, it need not be described here.

In operation, a horizontally polarized baseband signal from DAC 22810 is mixed in mixer 22812 with a signal in the 5G 23.8 to 30.3 GHz band from DPLL 22818, according to some aspects. The output of mixer 22812 is a horizontally polarized 5G signal in the 23.8 to 30.3 GHz frequency band which is then transmitted over cable 22802 to RFIC 22803 via amplifier 22816, according to some aspects. The output of LPDPLL 22818A is transmitted over cable 22802 to RFIC 22803 as an LO signal of 13.2 GHz, according to some aspects. The outputs of DPLL 22818 and LPDPLL 22818A are mixed in mixer 22812A to provide a 5G signal in the 5G 37-43.5 GHz frequency band, which is connected to mixer 22813. The baseband output of DAC 22811 and the output of mixer 22812A are mixed in mixer 22813 to provide a vertically polarized 5G signal from DAC 22811 in the 5G 37-43.5 GHz frequency band, which is transmitted over cable 22802 to the RFIC, according to some aspects. The operation of RFIC 903 with respect to the signals transmitted over cable 22802 is essentially the same as explained for FIGS. 222, 223, and 226 and need not be described here.

The fixed LO scheme illustrated in FIG. 228 using, for example, 13.2 GHz as the LO frequency, also allows for MIMO phase noise frequency noise coherence and has the advantage of having a fixed LO reference in the RFIC that can also be used for accurate control timing. This scheme requires an additional synthesizer 22818A in FIG. 228 for generating the fixed LO. In other words, there would be three synthesizers in this aspect of FIG. 228, instead of two synthesizers as in FIGS. 222, 223, and 226. However, since this additional synthesizer 22818A is used for both up and down conversion, its induced phase noise is cancelled out, so it can consume lower power by an order of 10, at least, when compared to the other synthesizers used herein.

FIG. 229 illustrates dual conversion in a radio system with a first conversion with a fixed LO, followed by a second conversion with a varying LO, according to some aspects. Direct conversion as described herein, going from baseband directly to RF, has advantages, but may result in In-phase and Quadrature (IQ) calibration issues. In some aspects, dual conversion can be used to address such issues and simplify IQ calibration. Dual conversion may be implemented using a first conversion to a frequency that is lower than the ultimately desired frequency, and then a second conversion to the ultimately desired frequency. FIG. 229 operates as explained with respect to FIGS. 222 and 223 except that dual conversion is used. In FIG. 229, DAC 22910 outputs a horizontally polarized baseband signal and is connected to a first mixer 22912 which is connected to second mixer 22944. A first DPLL 22918 generates a fixed 5G signal at 48 GHz, which is multiplied by ⅙ to achieve an 8 GHz signal, which signal is connected to mixer 22912, according to some aspects. A second DPLL 22942 generates a 5G signal in the 13-21 GHz band which is transmitted to second mixer 22944. In a first conversion in mixer 22912, the horizontally polarized signal from DAC 22910 is up-converted to a horizontally polarized signal of a fixed 8 GHz frequency. At this point the system may be placed into Loopback mode as discussed above with respect to switches 22451, 22453, and 22455 of FIG. 224B, and calibration issues can be resolved after this first conversion to a fixed frequency that is lower (here 8 GHz) than the ultimately desired frequency. This dual conversion offers the advantage that IQ imbalances are more easily resolved if the first conversion is to a fixed frequency in a relatively low frequency range.

The second conversion in second mixer 22944 up-converts the horizontally polarized 8 GHz signal to a horizontally polarized 5G signal in the desired 22-29.5 GHz frequency range. This horizontally polarized signal in the desired 22-29.5 GHz frequency range is the output of amplifier 22914 which is transmitted over cable 22902, according to some aspects. The vertically polarized signal from DAC 22911 is likewise converted in a dual conversion that operates similarly to the dual conversion for the horizontally polarized signal from DAC 22910, except that the lower frequency is 24 GHz and the second conversion in mixer 22946 therefore up-converts the vertically polarized signal to the desired 37-48 GHz frequency range, which is transmitted over cable 22902 via amplifier 22915, according to some aspects. The 48 GHz output signal of DPLL 22918 is multiplied by ⅓ to become a 5G LO signal of 16 GHz which is transmitted over cable 22902 as the output of amplifier 22924, according to some aspects. RFIC 22903 functions in the same manner as the second RFIC of FIGS. 222, 223, and 226 and need not be described here.

FIG. 230 illustrates a DTC structure 23000 in accordance with some aspects. The DTC structure 23000 may be provided in a DTx transmitter of a communication device. The DTC structure 23000 may be incorporated in digital transmit circuitry 365 of transmit circuitry 315 shown in FIG. 3C, although the structure 23000 is not limited to such. FIG. 230 shows a simplified architecture; the DTC structure 23000 may include more elements than are shown in other aspects. The DTC structure 23000 shown in FIG. 230 may provide a time-interleaved DTC 23010 coupled with sub-harmonic injection locking in a mmWave injection-locked oscillator 23024, as discussed in more detail below. The use of the combination of the time-interleaved DTC 23010 and mmWave injection-locked oscillator 23024 in a DTC-based phase modulator and phase shifter may permit the creation of amplitude and phase modulated signals over the bandwidth used in next generation systems.

The DTC structure 23000 may operate at an RF frequency that is lower than a target mmWave frequency. The clock 23002 for the DTC 23010 may be derived from a reference signal (REF). In particular, the reference signal may be supplied to the clock 23002 either through a phase lock loop (PLL) or a multiplying delay-locked loop (MDLL) 23004. An output of the PLL/MDLL 23004 may be supplied to a digitally controlled oscillator (DCO) 23006. The output of the DCO 23006 may range over the channel bandwidth, e.g., from 1700 MHz to the desired mmWave frequency. The output of the DCO 23006 may be supplied as an input to each of the individual DTCs 23012 of the time-interleaved DTC 23010 as well as being supplied as feedback to the PLL/MDLL 23004. In some aspects, means for receiving a reference oscillation signal and/or means for reducing a frequency of the reference oscillation signal to a lower frequency signal may be implemented by the DCO 23006.

The time-interleaved DTC 23010 may contain individual DTCs 23012 and a logical combiner 23014. The logical combiner 23014 may in some aspects be an OR gate or an exclusive OR (XOR) gate. In some aspects, a single logical combiner 23014 may be used. The use of multiple individual DTCs 23012 in conjunction with the logical combiner 23014 may enable a higher rate of operation than that of the individual DTCs 23012 alone. The time-interleaved DTC 23010 may be restricted to operate at frequencies of up to about 6 GHz, although in some aspects higher frequencies may be obtained. In some aspects, means for modulating, dependent on the input signal, a phase of the lower frequency signal at the DTC to generate a phase-modulated signal at a frequency higher than that of the lower frequency signal and/or means for transmitting the phase-modulated signal from the DTC to an oscillator circuit may be implemented by the time-interleaved DTC 23010.

For QPSK or higher modulation, I/Q data may be supplied to a rectangular to polar converter 23028. In some aspects, means for converting a rectangular input signal into a polar output signal may be implemented by the rectangular to polar converter 23028. The rectangular to polar converter 23028 may convert the complex numbers to a polar form. The result may be an analog phase modulated signal. The phase modulated signal may be combined with a predetermined phase shift (□1) at a combiner 23030 to advance or delay the phase modulated signal by a predetermined amount. The output from the combiner 23030 may be supplied to a serial to parallel converter 23026. The serial to parallel converter 23026 may convert the combiner output into a digital word and provide multiple copies of the digital words simultaneously to all of the individual DTCs 23012 of the time-interleaved DTC 23010. The digital word may indicate the timing of which of the individual DTCs 23012 is to provide a pulse at a particular time. Each individual DTC 23012 may provide a pulse at a lower frequency than the RF-DCO 23006 and whose phase differs, such that the individual DTCs 23012 activate and deactivate at different times.

As in the exemplary aspect above, the individual DTCs 23012 may be combined at the logical combiner 23014 to provide an intermediate frequency signal, which may ben times higher frequency than that of the individual DTCs 23012 alone, where n is the number of individual DTCs 23012 in the time-interleaved DTC 23010. The individual DTCs 23012 may apply the desired phase modulation based on the digital word. The time-interleaved DTC 23010 may in some aspects thus also implement one or more of means for providing a digital word to a plurality of individual DTCs 23012 of the time-interleaved DTC 23010, the digital word dependent on the polar output signal, means for triggering the individual DTCs 23012 based on the digital word, means for generating parallel copies of the digital word, to send to the individual DTCs 23012, based on the polar output signal, means for logically combining outputs from the individual DTCs 23012 to generate the phase-modulated signal, means for dynamically delaying an edge of the reference oscillator signal every period to introduce phase modulation to generate the phase-modulated signal, or means for using edge interpolation to generate self-aligned phase signals based on the lower frequency signal.

The output of the time-interleaved DTC 23010 may be provided to an output clock circuit 23020. The output clock circuit 23020 may contain a pulse shaper 23022 and an mmWave injection-locked oscillator 23024. The output of the DTC 23010 may be conditioned in the pulse shaper 23022 to amplify the relative harmonic content of the output of the DTC 23010 (i.e., m x fDTC). The harmonic content may be at the target mmWave frequency. The conditioned DTC output from the pulse shaper 23022 may be injected into the injection-locked oscillator 23024, which may lock onto the harmonic content and produce an output at the target mmWave frequency. In some aspects, as shown in FIG. 233 below, the pulse shaper 23022 may be incorporated into the injection-locked oscillator 23024. In some aspects, means for generating a phase-modulated signal at a mmWave frequency at the oscillator circuit based on the phase-modulated signal may be implemented by the output clock circuit 23020. The output clock circuit 23020 may in some aspects also implement one or more of means for amplifying a harmonic of the phase-modulated signal and means for locking an oscillator signal of the oscillator circuit to the harmonic to produce the output oscillator signal or means for injecting, via series connected transistors, current into a tank circuit to induce the tank circuit to resonate at the mmWave frequency.

FIG. 231 illustrates an open loop calibrated DTC architecture 23100 in accordance with some aspects. The DTC architecture 23100 may be the same DTC architecture as shown in FIG. 230. The DTC architecture 23100 may contain a PLL/MPLL 23104 and phase injection (PI) circuit 23130. A voltage controlled oscillator (VCO) 23102 may provide an output supplied to the PLL/MPLL 2314. The VCO 23102 and PLL/MPLL 23104 may be the same as that shown in FIG. 230, except illustrating in more detail circuitry in the PLL/MPLL 23104.

The PLL/MPLL 23104 may contain a multi-modulus divider (MMD) 23106 and a pair of flip-flops 23108. The MMD 23106 may reduce the frequency of the signal from the VCO 23102 to a frequency that is manageable by the DTCs (and less power-intensive). The output of the MMD 23106 may be supplied to the input of each of the flip-flops 23108. The positive and negative edges of the clock signal from the VCO 23102 may be used to trigger different flip-flops 23108, also referred to as a positive edge flip-flop and a negative edge flip-flop. The outputs from the positive and negative edge flip-flops 23108 may be supplied to the PI circuit 23130.

The outputs from the positive and negative edge flip-flops 23108 may be supplied to sets of inverters (buffers) 23110 in the PI circuit 23130. The set of inverters 23110 may include, for example, two pairs of inverters. The set of inverters 23108 may include, for example, two pairs of inverters. The outputs from the flip-flops 23108 may be provided as inputs to each pair of the inverters 23110. The outputs from a first pair of the inverters 23110 may be provided to a multiplexer (MUX) 23112, and the outputs from a second pair of the inverters 23110 may be provided to a Course Edge Interpolator (CEI) 23114.

The outputs from the MUX 23112 and CEI 23114 may be supplied to a programmable Digitally Controlled Course Edge Interpolator (PG-DCEI) 23120. The MUX 23112 and CEI 23114 may be used to select one of the signals from the inverters 23110. The PG-DCEI 23120 may contain a pair of inverters 23122 that receive the signals from the MUX 23112 and CEI 23114. The entrance inverter outputs may be fed to a plurality of cells 23124, each comprising a MOSFET chain, each of whose output swings between ground and a supply voltage. The number of cells 23124, in some aspects, may be 2N, where N is a positive integer. The output of each cell 23124 may be provided to an exit inverter 23126 before being supplied as the output of the DTC to the logical combiner.

FIG. 232A illustrates time interleaving of DTCs to increase the clock frequency in accordance with some aspects; FIG. 232B illustrates clock signals of FIG. 232A in accordance with some aspects. The architecture 23200 shown in FIG. 232A may be a version of the DTC shown in FIG. 230. The architecture 23200 may, for example, contain a pair of DTCs, each of which may contain an analog part 23210 and a digital part 23220. This may be considered a simplification, for convenience, of the architecture shown in FIGS. 230 and 231. In practice, the number of analog parts 23210 and digital parts 23220 may be greater than two. A reference oscillator signal may be supplied to the analog part 23210 and may include, as above, the MMD 23212, as well as the PI 23214. The MMD 23212 output may be supplied as a clock signal to the digital part 23220, whose output may, in turn be fed back to the MMD 23212 and provided to the PI 23214. The output signal (f0) from the DTC analog parts 23210 may be supplied to an exclusive OR (XOR) 23222, which may be used to double the DTC frequency to **2*f*0**.

As shown in FIG. 232B, a number of stages are used to create the DCO clock signal. Based on a reference clock signal, each DTC in the time interleaved DTC may provide a forward and reverse clock signal having a frequency less than that of the DCO clock signal from the VCO. The number of DTCs shown in FIG. 232B is two (N=2), although this number may vary, as above. As shown, the reverse and forward clock signals of the first DTC are respectively offset by 0 and ¼ of the cycle and the reverse and forward clock signals of the second DTC are respectively offset by ½ and ¾ of the cycle. The reverse and forward clock signals of each of the DTC may be individually XORed, which produces an XORed clock signal that doubles the frequency of the reference clock signal. The XORed clock signals from the different DTCs are then also XORed, to produce the DCO clock signal at the desired mmWave frequency. The signal produced by the DTC 23010 and injected into the oscillator 23024 may be at the frequency of the RF-DCO 23006, or may be different, depending on the aspect.

FIG. 233 illustrates a series injection locking oscillator 23300 with pulse shaping in accordance with some aspects. As shown in the aspect of FIG. 233, the pulse shaper 23022 and the injection-locked oscillator 23024 may be integrally formed as the injection locking oscillator 23300, instead of being provided in separate circuits or chips. In other aspects, however, the two circuits—the first to amplify the desired harmonic and the second to lock onto the harmonic and produce an output signal—may be provided in different circuits.

The injection locking oscillator 23300 may contain a tank circuit 23302 as well as an injection locking circuit 23320. The injection locking circuit 23300 may rely on adding parallel devices (MOSFETs) 23306 to the cross-coupled pair 23310 to inject the perturbation into the tank circuit 23302. The perturbation is introduced through a RC shunt 23304 to the input of the parallel circuit.

To improve the phase noise, the oscillator 23300 can be tuned to be approximately at the exact harmonic of the injected signal through a process, such as an automatic bank selection (ABS) process. With parallel injection, the tank current 23302 may provide a signal that is the superposition of the free-running oscillator current and the injected signal. This permits the tank voltage and current to experience a phase shift relative to the injected signal. To increase the strength of the injected signal into the tank circuit 23302, the RC shunt 23304 may be sized up. This may create trade-offs between injection strength, phase noise and tuning of the oscillator natural frequency.

Instead of using a single injection device, a series injection locking circuit 23320 may be used as shown. Note that in some aspects the series injection locking circuit 23320 may be provided at both the positive and negative edge inputs. The series injection locking circuit 23320 may include multiple devices 23306 to which different signals are injected. Specifically, the injected signal may comprise individual signals that have different phases, such that both individual signals are only the same value (as shown positive) over a relatively short period compared with the length of the pulse of the individual signals. The tank circuit 23302 may be forced or adjusted to be in phase with the injected signal (current), improving the trade-off indicated above. Additionally, this may provide an increase of injection strength without increasing current consumption or worsening the loaded Q of the oscillator.

A phase modulated local oscillator (LO) may drive a saturated power amplifier to provide a polar transmitter. In some aspects, a class C/D/D-1/E/F/F-1 power amplifier may be used rather than a class A or λ/B amplifier, thereby reducing the amplifier power consumption. Amplitude modulation can be introduced in the power amplifier through various means such as weighted currents, capacitance, or supply modulation.

FIG. 234 illustrates a method of providing a mmWave frequency signal in accordance with some aspects. The method may be performed by the structures shown in FIGS. 230-233. At operation 23402, the reference oscillator may generate an RF oscillation signal. The RF oscillation signal may be generated at a frequency range that leads to increased inefficiency for DTC operation, e.g., higher than about 6 GHz. This RF oscillation signal may be used to generate a phase modulated output signal at a mmWave frequency.

The RF oscillation signal received may be reduced at operation 23404 to a lower frequency signal. The lower frequency signal may be reduced by a multi modulus sub-system and thus be the RF oscillation signal divided by an integer. The reduced frequency signal may be substantially less than about 6 Hz, e.g., hundreds of MHz to a couple of GHz.

At operation 23406, a rectangular (I/Q) input signal may be received. The rectangular input signal may be converted into a polar signal (amplitude/phase). The polar signal may be further converted to a digital word and supplied to a DTC. The DTC may contain multiple individual DTCs whose outputs are combined using a logical OR or XOR gate. The digital word may be simultaneously provided to the individual DTCs.

At operation 23408, the phase of the lower frequency signal may be modulated at the DTC. The phase modulation may be controlled by the converted input signal. The output from the individual DTCs may be combined to generate a phase-modulated signal at a frequency higher than that of the lower frequency signal. In some aspects, the higher frequency is that of the RF oscillation signal.

The phase-modulated signal may be transmitted from the DTC to an oscillator circuit. The oscillator circuit may at operation 23410 generate a phase-modulated signal at the mmWave frequency. The oscillator circuit may amplify a harmonic of the input phase-modulated signal at the mmWave frequency and inject current into a tank circuit at the harmonic to induce the tank circuit to resonate at the mmWave frequency. The current injection may lock the output signal of the oscillator circuit to the harmonic to produce the output oscillator signal at the mmWave frequency. The current injection may be through series connected transistors.

During communication, communication devices may also convert signals between analog and digital signals in the transmitter and receiver chain. In some communication devices, the transmitter and receiver chain may contain, among others, filters and amplifiers. Such circuitry, as well as backplane issues, may cause inhomogeneities in the creation of an output signal and may cause a non-ideal output signal to be produced. Communication device designers continue to determine the causes of deviations from signal ideality and correct the deviations through channel equalization that employ one or both hardware or software solutions.

Channel equalization may be performed through feedback equalization using a decision feedback equalizer (DFE) and/or through feedforward equalization via a feedforward equalizer (FFE) in the receiver. Receiver FFE designs in general, which unlike transmitter FFE may be implemented solely in the analog domain, may be insufficient for some demands. The analog implementation may be challenging to design and implement due to the desire for increased data rate, number of taps, and energy efficiency, as well as the limited circuit area available. With the advent of multi-Gigabit (mmWave) communications and the concomitant high-speed performance of various components, as well as multipath effects, a symbol transmitted from a transmitter and received by a receiver may experience an amount of inter-symbol interference (ISI). Energy appearing before a given symbol is pre-symbol ISI or pre-cursor, while energy appearing after the symbol is post-symbol ISI or post-cursor, both of which may increase with the use of the mmWave band. One consideration of high-speed mmWave communications is that, unlike lower frequency and speed communications, extensive differences may exist in the post- and pre-cursor spread for LOS channels, which may have low to moderate post-cursor ISI spreads (1-4 ns), and NLOS channels, which may have wider ISI spreads of up to about 12 ns.

A multi-tap finite impulse response (FIR) filter may be used to correct for pre-cursor effects. The use of high-speed multi-Gb/s data communications may increase the implementation difficulty due to the functionality involved, which may include delay, multiply, and addition of analog signals in a single UI. Some mmWave wireless channels have long pre-cursor tails. For example, for mmWave channels at 5GS/s a pre-cursor tail may be about 10 ns in length (50 UI).

To correct for this extended tail and at the high data rates, a large number of taps (e.g., 50) may be used in the FFE. FFE implementation using a large number of taps may employ a correspondingly large amount of circuit area and may use more power. Power consumption in the FFE may increase exponentially with the number of taps and the occupied area is proportional to the square of the number of taps in a switching-matrix design. This may be further implicated when Quadrature Phase Shift Keying (QPSK) modulation or higher order modulation is used.

In a dual-polarization wireless receiver, the FFE design may increase complications with respect to cross-talk cancellation. In particular, in communication devices in which I/Q signals are used, I/Q-based coherent modulation such as QPSK, 16QAM, etc., may exhibit cross-talk ISI between the I stream and Q stream. In the dual-polarization transceiver, the vertically polarized (V) stream and the horizontally polarized (H) stream may encounter direct ISI and cross-talk ISI. Aspects described herein may independently cancel multiple different types of ISI, including one or more of: VI-to-VI ISI, VI-to-VQ, VI-to-HI, VI-to-HQ, VQ-to-VI, VQ-to-VQ, VQ-to-HI, VQ-to-HQ, HI-to-VI, HI-to-VQ, HI-to-HI, HI-to-HQ, HQ-to-VI, HQ-to-VQ, HQ-to-HI, and HQ-to-HQ.

FIG. 235 illustrates a receiver in accordance with some aspects. FIG. 235 illustrates basic components of a receiver 23500. Other circuitry such as filters and mixers (to mix the received signal down to baseband) and the like may be present, but are not shown for simplicity. The receiver 23500 may be incorporated in a communication device, such as an eNB, AP or UE, and may include an antenna 23502, a FFE 23504, a DFE 23506, a controller 23510 and a baseband processor 23512. The FFE 23504 may be a cascaded FFE, as discussed in more detail below. The antenna 23502 may be configured to receive signals from one or more transmitters over the same or different radio access technologies and using one or more different standards, such as 24GPP or IEEE 802.11. The signals may be provided by one or more communication devices, such as an eNB, an AP or another UE. The antenna 23502 may receive beamformed signals from the transmitter. In some aspects, the beamformed signals may be dual polarized signals, including V and H polarized signals. In other aspects, the cascaded FFE arrangement may not be limited to a dual-polarization transceiver.

The received signals may be provided to the FFE 23504, which may be used to compensate for the pre-cursor tails in the signal. The pre-cursor compensated signal may then be supplied to the DFE 23506, which may further compensate for the post-cursor tails. The pre- and post-cursor compensated signal may be supplied to the baseband processor 23512. The FFE coefficients, DFE coefficients, comparator thresholds, clock timing, and other circuit settings such as the timing of the output of one or more of the FFE 23504, DFE 23506 may be controlled by the controller 23510. The baseband processor 23512 may in some aspects act as the controller 23510.

FIG. 236 shows a basic implementation of a FFE in accordance with some aspects. The FFE 23600 shown in FIG. 236 may be provided in a receiver and may include a plurality of analog-domain delay circuits (delays) 23602 (such as a track-and-hold circuit), a plurality of multipliers 23604 and a combiner 23606. The input and output of the FFE 23600 may be analog. Each delay circuit 23602 may be formed from analog circuit components such as switches 23612 in series, with a capacitor 23614 to ground disposed between the switches 23612 and a buffer 23616 that buffers the output from the last switch 23612.

The delays 23602 may be disposed in series. An analog voltage may be supplied to each delay 23602. The amount of delay provided by the delay 23602 may be predetermined and may be a single unit interval (UI). The delay may be adjustable by changing the clock frequency, although in other aspects if the UI or symbol rate is fixed, the delay may be unable to be changed. The delay 23602 of the track-and-hold circuit may be determined by the clock frequency/period rather than by capacitance.

The voltage provided to each delay 23602 may also be weighted at a multiplier 23604. Each multiplier 23604 may have an individual coefficient (or weight) c0, c1, cn associated therewith. The coefficient c0, c1, cn of the multipliers 23604 may be the same or at least one may be different from at least one other weight. The coefficients can take any positive or negative value, including 1 or 0. The coefficients may be determined by the channel and may be different, for example, for NLOS and LOS channels.

The weighted signal from the multiplier 23604 may be supplied to a combiner 23606. The combiner 23606 may combine the weighted output before a delay 23602 with the weighted output after the same delay 23602. The combiner 23606 may be disposed such that the output from all of the delays 23602 may be combined as an output of the FFE 23600. The outputs from the multipliers 23604 may be combined together simultaneously. In this case, the input signal may be a continuous analog signal while the output signal may be a discrete analog signal.

Power dissipation may increase based on a number of taps and parasitic capacitance. To help alleviate this, FIG. 237A and FIG. 237B illustrate a FFE 23700 in accordance with some aspects. The FFE 23710 may be used in the receiver shown in FIG. 235. The FFE 23700 may comprise multiple FFE stages 23710, which may operate at baseband. Each FFE stage 23710 may contain one or more delays 23704, multipliers 23702, as well as combiners 23706. In some aspects, the number of delays/FFE stage 23710 may be limited to by design optimization and may be dependent on the process technology. The FFE 23700 may be incorporated in the baseband processing circuitry 392 shown in FIG. 3E, although the FFE 23700 is not limited to such incorporation. In some aspects, means for providing a plurality of types of signals to a plurality of series-connected FFE stages may be implemented by the FFE 23700.

The signal from the antenna (not shown in FIGS. 237A-237B) to each FFE stage 23710 may be split into polarized and quadrature signals. In I/Q-based coherent modulation, the signal may have both I and Q components. In a dual-polarization transceiver, a vertically polarized signal and horizontally polarized signal may be present. Each of V-signal and H-signal may have two (I and Q) data streams.

Thus, as shown in FIGS. 237A-237B, there may be four data streams (VI, VQ, HI, HQ) in total in the dual-polarization transceiver. The two kinds of ISI may be cancelled: direct ISI (e.g., VI-to-VI ISI) and cross-talk ISI (e.g., VQ-to-VI, VQ-to-HI, VQ-to-HQ, etc.).

Thus, the individual signals to each FFE stage 23710 may include either or both vertically and horizontally polarized signals, or I/Q signals. The vertically and horizontally polarized signals may be respectively provided along vertically and horizontally polarized signal lines as inputs to the delays 23704 on the vertically and horizontally polarized signal lines; the I and Q signals similarly may be respectively provided along I and Q signal lines as inputs to the delays 23704 on the I and Q signal lines. As shown, the individual signals may be cross-coupled at the taps before and after each delay 23704 to provide cancellation among the data streams. Each of the individual streams may have its own output from the FFE stage 23710. Thus, for example, before and after each delay 23704, the vertical and horizontal for each of the I/Q input signals may be weighted using weighting coefficients and then combined. In some aspects in which both vertical and horizontal polarized input signals and I/Q input signals are provided, such as that shown in FIGS. 237A-237B, each signal may be combined with each other signal before and after each delay 23704.

Although only two FFE stages 23710 are shown, greater than two FFE stages may be used. The use of multiple FFE stages 23710 may reduce the number of taps per each FFE stage 23710 and thereby reduce power consumption, area, and complexity. In some aspects, the FFE 23700 may thus also implement as shown one or more of means for delaying input VI, VQ, HI and HQ signals through a series of delays to form a plurality of sets of delayed VI, VQ, HI and HQ signals, means for weighting each of the VI, VQ, HI and HQ signals at each tap with each of a plurality of types of weighting coefficients to form VI, VQ, HI and HQ weighted signals at the tap, means for combining the VI weighted signals at each tap to form a VI output signal, the VQ weighted signals at each tap to form a VQ output signal, the HI weighted signals at each tap to form a HI output signal and the HQ weighted signals at each tap to form a HQ output signal, means for providing each of the VI, VQ, HI and HQ output signal one of as a VI, VQ, HI and HQ input signal to another FFE stage or as a VI, VQ, HI and HQ output of the FFE, means for using the VI, VQ, HI and HQ weighted signals at each tap to cancel a different pre-cursor ISI type, means for repeating the delaying, weighting and combining on input signals for successive FFE stages, means for initially setting the VI, VQ, HI and HQ weighting coefficients for each of the VI, VQ, HI and HQ signal, other than at an initial tap, to a pre-defined value and/or means for updating the VI, VQ, HI and HQ weighting coefficients during an adaption process to converge and stabilize the VI, VQ, HI and HQ weighting coefficients during the weighting.

Power consumption of each FFE stage is proportional to the exponential of the number of taps, and the area is proportional to the square of the number of taps. To provide an example of reduced power consumption, if the total number of FFE taps=Ntap, then:

| | # of stages | | |
|---|---|---|---|
| | 1 | 2 | M |
| Power | ∝ exp(Ntap) | ∝ 2*exp(Ntap/2) | ∝ M*exp(Ntap/M) |
| Area | ∝ Ntap^2 | ∝ 2*(Ntap/2)^2 | ∝ M*(Ntap/M)^2 |

As can be seen, both the power and the area may be reduced as the number of stages increases but the number of taps/stage reduces for the given total number of FFE taps. In some aspects, a minimum number of taps, such as two, may be present in each FFE stage. The FFE stages 23710 may be disposed on the same chip or circuit or on different chips or circuits. In some aspects, the number of taps may be the same in each FFE stage 23710 (evenly distributed). In some aspects, the number of taps may be different in at least one of the FFE stages 23710. For example, the number of taps may taper down from a larger number of FFE stages 23710 to a smaller number of taps or may taper up from a smaller number to a larger number to improve the overall performance.

Moreover, the taps in one or more of the FFE stages 23710 may be able to be individually activated or deactivated, or activated or deactivated in groups of more than one tap. If able to be controlled (e.g., by the controller shown in FIG. 235) in groups, the taps may be controlled to have a consistent distribution. For example, every other tap may be active, or every third tap may be active. In such aspects, the deactivated taps may be bypassed.

Similarly, the FFE stages 23710 may be able to be individually activated or deactivated by the controller. The activation and deactivation may be dependent on one or more factors. These factors may include clock rate, modulation scheme, signal type (e.g., standard used, signal frequencies), and channel conditions, and number of taps, among other factors. In such aspects, the deactivated FFE stages 23710 may be bypassed (e.g., using switches) so that active FFE stages 23710 are connected together. This may, for example, allow power consumption to be tailored as desired. Each delay 23704 may be fixed to one UI.

In addition, each multiplier 23702 within a particular FFE stage 23710 may have an individual weight associated therewith. The weights of the multipliers 23702 within the particular FFE stage 23710 may be the same or at least one may be different from at least one other weight. As above, the specifics of the multipliers 23702 within the FFE stage 23710 may be different from those of other FFE stages 23710. This is to say that, for example, although the multipliers 23702 of one FFE stage 23710 may have the same weights between delays 23704 and/or between different individual signals, either or both may not be the same in a different FFE stage 23710.

In some aspects, the weighting coefficients in each FFE stage 23710 may be simultaneously updated due to adaptation to channel conditions and/or signal type, among other factors. In some aspects, the weighting coefficients in each FFE stage 23710 may be updated at different times such that adaptation due to coefficient multiplication in one or more FFE stages 23710 may occur at a particular time while the weighting coefficients in one or more other FFE stages 23710 remains fixed, and coefficient adaptation in the one or more other FFE stages 23710 may be performed at a different time while the weighting coefficients in the one or more FFE stages 23710 remains fixed.

FIG. 238 illustrates a method of providing analog signal equalization according to some aspects. The method 23800 may be performed by the FFE shown in FIG. 237. At operation 23802, input vertically and horizontally polarized signals may be provided to an initial FFE stage of a FFE that contains multiple FFE stages. The FFE stages may be series-connected and the inputs may be in parallel. In some aspects, I/Q signals may be provided to the FFE stages. In some aspects, VI, VQ, HI, HQ signals may be provided to each FFE stage.

At operation 23804, the various signals at the tap may be weighted. The vertically and horizontally polarized signals respectively form weighted vertically and horizontally polarized signals. The I/Q signals may similarly be weighted to respectively form weighted I/Q polarized signals. As above, each of V-signal and H-signal may have two (I and Q) data streams. Each type of signal may be weighted using multiple independent coefficients to form multiple independent weighted signals. Thus, for example, each signal may be weighted with a VI coefficient, a VQ coefficient, a HI coefficient and a HQ coefficient. Moreover, the coefficients for each signal may be independent for the same type of coefficient. Thus, the VI coefficient for the VI signal may be independent of the VI coefficient for the HQ signal.

At operation 23806, each weighted signal at the present tap that is weighted with the same type of coefficient may be combined to form a combined signal. That is, for example, all of the signals at the present tap weighted with VI coefficients may be combined to form a combined weighted VI signal. Each type of signal (VI, HI, VQ, HQ) may form a combined weighted signal. This provides cross-correlation among the signals.

At operation 23808, it is determined whether any more taps are present in the FFE stage. As above, the FFE stage may have multiple delays, and thus taps. The number of taps may be independent among the FFE stages and thus may be the same or may be different for each FFE stage.

If more taps are present, at operation 23810, each signal may be supplied to a delay. Each signal may be delayed by the same amount before returning to operation 23804. Thus, each combined signal may be combined with similar signals from previous taps. That is, for example, all of the signals at the present tap weighted with VI coefficients may be combined with all of the signals at all previous taps weighted with VI coefficients to form the combined weighted VI signal. The combined weighted signals from all taps may also be indicated as VI', VQ', HI', HQ'.

If no more taps are present, it may then be determined, at operation 23808, that the last delay of the present FFE stage has been reached. At operation 23812, it may be determined whether the last FFE stage has been reached. The FFE may comprise at least two FFE stages.

If it is determined at operation 23812 that the last FFE stage has not been reached, the process of operations 23804-23808 (weighting, combining and delaying) may then be repeated for the delays in the next FFE stage. At operation 23814, the output signals from the last FFE stage (VI', VQ', HI', HQ') may be used as input signals for the next FFE stage.

If it is determined at operation 23812 that the last FFE stage has been reached, the process may provide output signals. This is to say that the combined signals of each type may be taken at operation 23816 to be the output signals from the FFE. The FFE may generate output signals depending on the input signals and coefficients. The adaptation process may calculate and update the coefficients for each signal in each stage while the FFE is running. Initially, the coefficients may all be zero (or some pre-defined values) except the main taps. The coefficients may then be updated based on the received data and the adaptation process. Eventually, the coefficients may converge and stabilize by the adaptation. The adaptation may continually follow the process (23804-23814).

As above, equalization may be used to compensate for limited channel bandwidth, reflection and interference. Equalization may also be used to cancel the response of symbols of the long channel response under both LOS and NLOS conditions, which may be an aspect to consider for mmWave signals. An increased amount of inter-symbol interference (ISI) (in the tens of symbols) may exist in the mmWave bands (e.g., 60 GHz band) due to the increased attenuation and multipath issues, among others. Equalization may be used to compensate or cancel out the pre—and post-cursor ISI. Even if a channel is ideal, transmitter and receiver circuits in a communication device may limit overall bandwidth. In some cases, equalization can be used to abrogate bandwidth limitations established by the transmitter and receiver circuits.

A DFE is one of the equalizers that can be used to combat the effects of post-cursor ISI. The DFE may be used in the receiver. While NLOS channels may suffer a greater amount of post-cursor ISI than LOS channels, post-cursor ISI may be significant. LOS channels may have relatively fewer ISI taps and enable more efficient modulations like 16QAM and 64QAM than NLOS channels. It thus may be desirable to increase the number of DFE taps for NLOS channels. The number of taps used in a DFE may be hard-coded. As the number of taps does not change with modulation, this could lead to waste of hardware resources and chip/board area that could be used for other purposes.

In accordance with exemplary aspects, a configurable DFE design is provided. A DFE tap number may be adjusted according to the modulation used. In some aspects, the DFE tap design may select quadrature phase-shift keying (QPSK) or 16 Quadrature amplitude modulation (QAM) for wireless communications by controlling a single signal (note that although this may also be applicable to Pulse-amplitude modulation (PAM2) or PAM4 for wireline communications, QPSK and 16QAM will be referred to herein for convenience). In some aspects, up to 150 post-cursors can be cancelled out and about one half of the post-cursors can be cancelled out in 16QAM mode for LOS channels that have a higher signal-to-noise ratio (SNR) and fewer post-cursor ISIs.

The timing for the first DFE tap may be more stringent than for later DFE taps. FIGS. 239A and 239B illustrate configurations of a reconfigurable DFE in accordance with some aspects. The DFE 23900 may be incorporated in the baseband processing circuitry 392 shown in FIG. 3E, although the DFE 23900 is not limited to such incorporation. FIGS. 240A and 240B illustrate selector/DFF combination configurations of a reconfigurable DFE in accordance with some aspects. As shown in FIGS. 239A and 239B, the DFE 23900 may comprise a comparator 23910, a SR latch 23920, latches 23930 and selector/D flipflop (DFF) combinations 23940. Down-converted signals from an antenna may be received at the DFE 23900 and used to generate an output of the DFE 23900. The components of the DFE 23900 may be provided with the same clock signal (CLK). The comparator 23910 may be supplied with a differential input. The binary output of the comparator 23910 may be supplied to the SR latch 23920. The differential input of the SR latch 23920 may be converted to a single-ended signal at the output. The output of the SR latch 23920 may be supplied to a pair of latches 23930. The first DFE tap may be taken from between the SR latch 23920 and the first latches 23930.

The output from the DFE 23900 may be provided via the second latch 23932. The output of the second latch 23932 may be taken as the second DFE tap. The output of the second latch 23932 may be provided to a first of the selector/DFF combinations 23940. In some aspects, the first selector/DFF combination 23940 may include only a DFF. In other aspects, each of the selector/DFF combinations (also referred to later as latch) 23942, 23944, 23946, 23948 may include both a multiplexer and a DFF. Although a minimal number of taps are shown (after each first selector/DFF combination 23940), in some aspects, up to 74 flip-flops (delays) may be used in each chain in the DFE 23900. The total number of delays, and thus taps, may consequently be 150 (2×74+2). The number of flip-flops, however, may not be limited to a maximum of 74 in other aspects.

The selector of each selector/DFF combination 23940 may in some aspects be a multiplexer. The inputs of the selector may be the output from two different selector/DFF combinations 23940. The selector/DFF combinations 23940 may be arranged to form a path such that the inputs of the selector/DFF combinations 23940 (other than the initial two) are from sequential and parallel selector/DFF combinations 23940, also referred to as chains. This is to say that the inputs may be from a next lower numbered selector/DFF combination 23940 (i.e., immediately lower number) and from an alternating lower numbered selector/DFF combination 23940 (i.e., last even or odd numbered selector/DFF combination 23940, dependent on whether the selector/DFF combination 23940 is even or odd numbered). The selector/DFF combinations 23940 may be arranged such that the adjacent numbers form a sequential chain through each of the selector/DFF combinations 23940 while the alternating numbers form parallel chains through the selector/DFF combinations 23940.

The selector/DFF combinations 23940 may be connected such that the selector may be used to adjust the path to select one of the two chains. In particular, selectors in the selector/DFF combinations 23940 may be connected to the same selection signal (control input) that is used to select the input (data input) of the selector/DFF combination 23940. This may enable selection of the sequential chain shown in FIG. 239A for a first selector input and the parallel chains shown in FIG. 239B for a second selector input. The inputs of each selector may be the outputs of the immediately previous delay/tap in the serial and parallel chain.

The number of taps (and the locations in the selector/DFF combinations 23940) may be dependent on the selector input, and thus chain. For example, as shown in the sequential chain shown in FIG. 239A, which shows a 1 bit output DFE, the output of the first selector/DFF combination 23942 may be taken as the third DFE tap and provided as an input to the third selector/DFF combination 23946. The output of the third selector/DFF combination 23946 is taken as the fourth DFE tap and provided as an input to the second selector/DFF combination 23944. The output of the second selector/DFF combination 23944 is provided as an input the fourth selector/DFF combination 23948. The outputs of the second and fourth selector/DFF combination 23944, 23948 may respectively be taken as the DFE tap 5 and 6.

In some aspects, means for determining a modulation scheme of a signal received at the DFE may be implemented by the DFE 23900. In some aspects, the DFE 23900 may also implement as shown one or more of means for determining, based on the modulation scheme, the tap number of taps to use in the DFE, means for selecting which of a serial chain and parallel chains to use in the DFE based on the tap number, and/or means for compensating for post-cursor ISI of the signal using outputs from the taps. In further aspects, the DFE 23900 may also implement as shown one or more of means for simultaneously triggering a plurality of delays, and/or when the parallel chains are selected, means for selecting a least significant bit (LSB) using a latched output between a first and second of the taps of a most significant bit (MSB) and/or means for avoiding affecting a delay of the first tap by providing: means for taking the first tap from an input of a first latch and the second tap from an output of a second latch and means for connecting an output of the first latch with an input of the second latch in a first of the parallel paths and with a selector input of a multiplexer in a second of the parallel paths. In some aspects, the means for selecting which of a serial chain and parallel chains to use may comprise means for applying a same selector signal to a plurality of multiplexers that are each associated with a different delay and have an output connected with an input of the associated delay and/or means for selecting the serial chain for QPSK and the parallel chains for 16QAM or higher.

The selector/DFF combination 23940 is shown in more detail in FIG. 240A. As shown, the output of each selector (MUX) 24010, 24012, 24014, 24016 may be supplied to the input of a different delay 24020, 24022, 24024, 24026 to form a single delay chain. Each delay 24020, 24022, 24024, 24026 may be formed from a single D-type flipflop. The output of each delay 24020, 24022, 24024, 24026 may be supplied to one of the inputs of the next selector 24010, 24012, 24014, 24016, which is shown as 0 but in other aspects may be 1. The selection of each selector 24010, 24012, 24014, 24016 may be the same—that is, the same selection signal may be applied to each selector 24010, 24012, 24014, 24016.

Although only four DFE taps are shown, in some aspects this may be extended so that up to 150 DFE 1 bit taps may be used to cancel out up to 150 post-cursors, for example. In some aspects, more than 150 taps may be used, and thus more than 150 post-cursors may be cancelled. The number of DFE 1 bit taps, however, may not be limited to a maximum of 150 in other aspects. The arrangement shown in FIG. 239A may be used for the QPSK mode and provide the delays in a single daisy chain as shown.

FIG. 239B shows the arrangement that further includes circuitry for the least significant bit (LSB) as well as the MSB in a 27 bit output DFE. The LSB portion of the DFE 23900 may include LSB comparators 23912, 23914. The output of LSB comparators 23912, 23914 may be respectively coupled with LSB SR latches 23922, 23924. The outputs from the SR latches 23920, 23922, 23924 may be taken in parallel as the first DFE tap. The output from the SR latches 23922, 23924 may be provided respectively as inputs to LSB latches 23936, 23938. The output from the LSB latches 23936, 23938 may be provided as inputs to a LSB multiplexer 23950. The MSB bit may be used as a selector signal for the LSB multiplexer 23950, which in turn may provide the LSB. The LSB may subsequently be provided to a third latch 23934, whose output may be taken as another input to the third selector/DFF combination 23946. The selector/DFF combination 23960 control bits may be different than that of the selector/DFF combination 23940 shown in FIG. 239A, although the hardware may be the same. The cross-coupling between the selector/DFF combinations 23940 may be eliminated as shown in FIG. 239B so that two parallel chains are provided. The second DFE tap may be taken from the parallel output of the second and third latch 23932, 23934. The third DFE tap may be taken from the parallel output of the first and third latch 23942, 23946. The fourth DFE tap may be taken from the parallel output of the second and fourth latch 23942, 23948. The arrangement shown in FIG. 239B may be used for the 16QAM (PAM4) mode and provide the delays in two parallel chains. Although only four DFE taps are shown, this may be extended so that, in some aspects, up to 76 DFE 2 bit taps (other than the tri-bit DFE tap 1) may be used to cancel out up to 76 post-cursors. This can be extended to a 64QAM (PAM6) modulation or higher. As above, in other aspects, a greater number of bits than 76 bits may be used.

In some aspects, output of the selector/DFF combination may be a most significant bit (MSB) and a least significant bit (LSB). In particular, 16QAM may have I and Q PAM4 streams (two orthogonal PAM4 streams). This is to say that two bits may be used to represent four levels: one MSB and one LSB. In some aspects, at Tap1, 1 (the output of SR latch 23920), 1 (the output of SR latch 23922), 1 (the output of SR latch 23924) may represent the highest level, while the other levels may be represented by 1-0-1, 0-0-1, 0-0-0 (the lowest level). As shown, because the threshold of the slicer 23910 is 0, the threshold of the slicer 23912 is +2 and the threshold of the slicer 23914 is −2. Here 0, +2, −2 are relative numbers, not absolute, based on the four signal levels of −3, −1, +1 and +3. The Tap1 design (FIGS. 239A and 239B) may be used to provide an output based on the stringent DFE Tap1 delay constraint. Thus, by separating a flip-flop into two serial latches (23930 and 23932 in FIG. 239A) may enable the MUX 23950 to be placed after the initial latches (23930, 23936, 23938). Thus, delay caused by the MUX 23950 may avoid affecting the DFE Tap1 delay. If the MUX 23950 were to be placed before the latches 23930, 23936, 23938, then the DFE Tap1 delay may not be able to meet the DFE Tap1 delay constraint due to the high delay of the MUX 23950.

The selector/DFF combination 23960 is shown with additional detail in FIG. 240B. The outputs of selectors 24030, 24032, 24034, 24036 may be supplied to the input of a different delay 24040, 24042, 24044, 24046 to form parallel MSB and LSB delay chains of half the length of the chain of FIG. 240A. The outputs of delays 24040, 24042, 24044, 24046 may be supplied to one of the inputs of the next selector 24030, 24032, 24034, 24036, which is shown as 1 but in other aspects be 0. The selection of selectors 24030, 24032, 24034, 24036 may be the same—that is, the same selection signal may be applied to selectors 24030, 24032, 24034, 24036.

FIG. 241 is a method of configuring a DFE in accordance with some aspects. The method 24100 may be performed using the structures of FIGS. 239A-239B and 240A-240B. At operation 24102, the modulation scheme may be determined. The DFE may identify the modulation scheme. The modulation scheme may be dependent on, for example, the channel ISI. Both the transmitter and the receiver may be configured to use the same modulation scheme. The modulation scheme may be, in some aspects, QPSK (PAM2) and 16QAM (PAM4). The modulation scheme may further be dependent on the type of channel (LOS or NLOS) and the parallel chains for a LOS channel when using mmWave frequencies.

Once the modulation scheme has been determined, the DFE may at operation 24104 determine the chain type and tap number to use in the DFE. In some aspects, the tap number may be up to about 150 taps in PAM2 for NLOS channels and about one half (76 taps) in PAM4 mode for LOS channels. The signals from the taps may be used to cancel post-cursors in mmWave frequencies.

At operation 24106, the DFE may select which of a serial chain and parallel chains to use based on the tap number. The serial chain and parallel chains may have different tap numbers, with the serial chain providing a single bit for NLOS channels and the parallel chains providing a MSB and LSB for LOS channels. In some aspects, any two or more of operations 24102, 24104 and 24106 may be combined.

In operation, the DFE may trigger a plurality of DFFs that form the serial chain and parallel chains. The DFE may trigger the plurality of DFFs simultaneously. The taps may be taken from an output of a different DFF. A multiplexer may provide an input to each DFF. Each multiplexer may be associated with a different DFF. Each multiplexer may be provided with the same selector signal to select which of the serial chain or parallel chains to use. When the parallel chains are selected, a LSB multiplexer may be used to select the LSB. The LSB multiplexer output may be selected using a latched output between a first and second of the taps of the MSB. This is to say that the first tap may be taken before the first latch and the second tap may be taken after the second latch. Whether the serial chain or parallel chains are used, at operation 24108, the output from the taps may be used to cancel the ISI of a symbol.

The number of frequency bands used in communications has increased due to the incorporation of carrier aggregation of licensed and unlicensed bands and the upcoming use of the mmWave bands. MmWave UEs may use both high (above 6 GHz) and low frequencies (LTE band). The higher frequencies may provide a large amount of bandwidth for data communications, enabling very high data rates, while the lower frequencies may provide higher reliability. The higher bandwidths, while used to increase the communication data rate, may affect operation aspects including system power consumption.

To communicate, received RF signals may be converted to digital signals for processing at the mobile device or UE, while digital data may be converted to RF signals for transmission from the mobile device or UE. Elements in the receiver chain may include an analog-to-digital converter (ADC) that receives an RF signal from an antenna and converts the RF signal to a digital signal. The digital signal from the ADC may be provided to a front end, which may contain an analog front end and a digital front end. The digital front end may provide channelization and filtering of the RF signal from RF to baseband, digitization, sample rate conversion and perhaps synchronization.

Due to the high path loss caused by atmospheric absorption and high attenuation through solid materials, massive multiple-input-multiple-output (MIMO) systems may be used for transmission in the mmWave bands. The use of beamforming to search for unblocked directed spatial channels may involve additional considerations with respect to mmWave architecture when compared to the architecture used for communication through a WPAN/WLAN. In such MIMO systems, each antenna output may use a pair of ADCs for digital processing such as low latency initial access, spatial multiplexing and multi-user communications. The power consumption of the ADC may increase linearly with sampling rate and exponentially with number of resolution bits per sample. As a result, the total power dissipation at the ADCs can be large due to the large number of antennas and wideband communications when high-resolution ADCs are used. This can create issues for a wide variety of mobile devices with respect to battery life and may be exacerbated in machine type communication (MTC) devices, whose batteries are small and expected to last for an extended amount of time.

FIG. 242 illustrates a mmWave architecture 24200 in accordance with some aspects. The mmWave architecture 24200 may provide hybrid beamforming. The mmWave architecture 24200 may be incorporated in the receive circuitry 320 shown in FIG. 3E, although the mmWave architecture 24200 is not limited to such incorporation. Hybrid beamforming architectures may include both digital and analog beamforming. Digital beamforming may provide flexibility in beam shaping at the cost of a one-to-one correspondence between transmitter RF chain and antenna, increasing the cost, complexity and power consumption due to the large number of antennas operating over the wide bandwidth. Channel estimation between transmitter and receiver antenna pairs may further increase the digital beamforming complexity. Analog beamforming, on the other hand, may shape the output beam with only one RF chain using phase shifters. Analog beamforming may use beam searching to find the optimal beams at the transmitter and the receiver. The beam searching may use codebooks, whose size, as well as the alignment issues, may increase with narrowing beam size. Unlike digital beamforming, analog beamforming may be limited to directivity gain due to the single RF chain used. Analog beamforming alone further may have the highest potential performance loss in the data plane due to a lack of capabilities such as multi-user communication, interference cancellation, and multi-beam formation, and the highest latency in the control plane caused by factors such as slow initial link-layer connection between the UE and eNB and ongoing synchronization. In some aspects, hybrid beamforming may use both digital and analog beamforming to increase the number of antenna elements while limiting the number of RF chains.

The mmWave architecture 24200 shown in FIG. 242, may contain an analog beamforming architecture 24210 (also referred to as an analog phased array architecture) and a digital beamforming architecture 24220. The analog beamforming architecture 24210 and the digital beamforming architecture 24220 may include shared circuitry 24206 that include low noise amplifiers (LNAs) 24212, mixers 24214, variable gain amplifiers (VGAs) 24216, low pass filters 24218 and an oscillator 24222. The digital beamforming architecture 24220 may include multiple variable (or low) resolution ADCs 24232, while the analog beamforming architecture 24210 may include a single high-resolution ADC 24234. The resolution of the low-resolution ADCs 24232 may be 29-3 bits, for example. The mmWave architecture 24200 may have low latency at the control plane and high throughput at the data plane. Although not shown, other elements may be present, such as feedforward or feedback compensation circuitry.

As shown, the mmWave architecture 24200 may receive RF signals from a plurality of antennas 24202. The signals from the antennas 24202 may be supplied to LNAs 24212 of the analog beamforming architecture 24210 and digital beamforming architecture 24220. The output of each LNA 24220 may be supplied to a different pair of mixers 24214. The mixers 24214 may downconvert the complex (I/Q) RF signals to baseband or intermediate frequency (IF) signals using the local oscillator signals from an oscillator 24222. Each of the downconverted signals from the mixers 24214 may be provided to a different VGA 24216. The amplified signal from the VGA 24216 is provided to a low pass filter 24218, which filters the amplified signal to baseband.

As above, phase shifters 24226 in the analog beamforming architecture 24210 may be used to adjust the phase of each pair of signals originating from a corresponding antenna 24202. The phase-shifted signals from the phase shifters 24226 may then be combined at a combiner 24228 and supplied to a single ADC 24234 or single pair of ADCs 24234. In some aspects, the ADC 24234 may be a high-resolution ADC (e.g., 8 bits or more). In the digital beamforming architecture 24220, each filtered signal may be supplied to a different variable or low-resolution ADC 24232 without being phase shifted.

The mmWave architecture 24200 may further include current mirrors or switches 24224 (hereinafter referred to merely as switches for convenience) after the filters 24218. The switches 24224 may enable direction of the received signal to either the phase shifters 24226 or the variable (low) resolution ADCs 24232. The switches 24224 may be controlled by the controller 24240. The controller 24240 may be a baseband or other processor. The controller 24240 may determine the channel type (e.g., LOS or NLOS), signal type (e.g., control or data plane), channel conditions based on one or more measured qualities (e.g., SNR, blockage), UE mobility (e.g., low), and/or modulation schemes, among others. The controller 24240 may determine, based on one or more of these characteristics, whether to switch to use the analog or digital path.

FIG. 243 illustrates a transmitter hybrid beamforming architecture 24300 in accordance with some aspects. The transmitter hybrid beamforming architecture 24300 may be similar to the receiver mmWave architecture 24200 shown in FIG. 242. The transmitter hybrid beamforming architecture 24300 may contain an analog beamforming architecture 24310 (also referred to as an analog phased array architecture) and a digital beamforming architecture 24320. The analog beamforming architecture 24310 and the digital beamforming architecture 3020 may include shared circuitry 24306 that include power amplifiers (PAs) 24312, mixers 24314, variable gain amplifiers (VGAs) 24316, low pass filters 24318 and an oscillator 24322. In an exemplary aspect, the digital beamforming architecture 24320 may include multiple variable (or low) resolution DACs 24332, while the analog beamforming architecture 24310 may include a single high-resolution DAC 24334. The resolution of the low-resolution DACs 24332 may be 1 or 2 bits, for example.

As shown, the transmitter hybrid beamforming architecture 24300 may receive digital signals from the DFE (not shown). The signals from the DFE may be supplied to the DAC 24334, and from the DAC 24334 to a separator 24328. Pairs of analog signals from the analog beamforming architecture 24310 may be provided to phase shifters 24326. The phase shifted signals from the phase shifters 24326, along with signals from DACs 24332 of the digital beamforming architecture 24320, may be provided to the switches 24324. The switches 24324 may enable switching between the pairs of phase shifted signals and the output from the digital (low-resolution) DAC 24332. Each signal from the switches 24324 may be provided a low pass filter 24318, which filters the signal to baseband prior to amplification by the VGA 24316. The amplified signal may then be upconverted to the RF frequency using mixers 24314 supplied with the local oscillator signals from oscillator 24322. The RF signals may then be amplified by PA 24312 before being provided to a plurality of antennas 24302.

In an aspect, the transmitter and receiver architectures in FIGS. 242 and 243 can be designed for modular architectures. For example, an architecture containing M antenna receivers and transmitters can be built, and then multiple copies of the architecture can be used to build a N=k*M antenna system.

In some aspects, means for determining channel and signal characteristics of mmWave signals to be communicated may be implemented by the receiver mmWave architecture 24200 and/or transmitter hybrid beamforming architecture 24300. In some aspects, as shown, the receiver mmWave architecture 24200 and/or transmitter hybrid beamforming architecture 24300 may further implement, based on a determination from the channel and signal characteristics of the mmWave signals that high-resolution quantization in the receiver mmWave architecture 24200 or conversion from digital to analog is to be used in the transmitter hybrid beamforming architecture 24300, means for selecting an analog beamforming architecture, of a hybrid beamforming architecture that comprises the analog beamforming architecture and a digital beamforming architecture, to use in communicating the mmWave signals. In some aspects, as shown, the receiver mmWave architecture 24200 and/or transmitter hybrid beamforming architecture 24300 may further implement, based on a determination from the channel and signal characteristics of the mmWave signals that low-resolution quantization or conversion from digital to analog is to be used, means for selecting the digital beamforming architecture to use in communicating the mmWave signals, e.g., via controller 24240. In some aspects, as shown, the receiver mmWave architecture 24200 and/or transmitter hybrid beamforming architecture 24300 may further implement means for communicating the mmWave signals via beamforming using the analog or digital beamforming architecture selected, e.g., via the antennas 24202, 24302. In some aspects, as shown, the receiver mmWave architecture 24200 and/or transmitter hybrid beamforming architecture 24300 may further implement means for varying a resolution of each of the ADCs and DACs dependent on the channel and signal characteristics of the mmWave signals, e.g., via controller 24240 and the ADCs 24232 and/or DACs 24334. In some aspects, as shown, when the analog beamforming architecture is selected, the receiver mmWave architecture 24200 and/or transmitter hybrid beamforming architecture 24300 may further implement means for phase shifting each of the mmWave signals to produce phase shifted signals, e.g., via phase shifters 24226, 24326, and means for combining the phase shifted signals to form a combined signal to be quantized, e.g., via combiners 24228. In some aspects, as shown, the receiver mmWave architecture 24200 and/or transmitter hybrid beamforming architecture 24300 may further implement means for controlling selection of the analog or digital beamforming architecture based at least on which of a LOS or NLOS channel is to be used to communicate the mmWave signals, which of a control or data signal the mmWave signals are, a signal to noise ratio (SNR), and a modulation scheme to be used to communicate the mmWave signals, e.g., via controller 24240. In some aspects, as shown, the receiver mmWave architecture 24200 and/or transmitter hybrid beamforming architecture 24300 may further implement means for sharing analog components between the analog and digital beamforming architecture.

In some aspects, the analog beamforming portion may be used when there is a LOS channel, very high SNR, low UE mobility, and blockage, as high SNR and high-resolution ADC may lead to the use of high order modulation schemes. Additionally, when there is high spatial, in-band, or adjacent channel interference, the architecture may switch from digital beamforming to analog beamforming by setting phase shifters to compute the optimal phase values digitally for fast operation. On the other hand, the digital beamforming portion may be used when the transceiver containing the receiver and transmitter shown in FIGS. 242 and 243 is operating in the control plane and either receives signals from multiple directions simultaneously (as analog beamforming does sector sweep which has a high delay) and is to have fast synchronization, initial access, UE discovery, and fast recovery from blockage, or is to communicate control plane signaling, as such signaling may use low order modulation (e.g., BPSK, QPSK) that may avoid use of a high-resolution ADC. The digital beamforming portion may be used when the transceiver is operating in the data plane and: communicates over a NLOS channel that has multiple paths as combining multiple paths to increase the effective SNR; when the SNR can be low, which may be achieved by low-resolution ADC with negligible or no loss; Spatial multiplexing; Interference nulling; and Multi-user communications.

One consideration for control plane communications may be latency for initial access and UE discovery. Analog beamforming architectures may rely on highly directional transmissions. To accomplish this, both the UE and the eNB may perform a beam search to determine the optimal beam. The beam search may slow down initial access due to large beam space. When both the UE and eNB use directional beamforming, the access delay may increase. A fully digital architecture, in which multiple directions may be simultaneously determined, may permit a reduction in the initial access.

As noted above, there is a trade-off between number of antennas and resolution of ADC when determining the total receiver dissipated power. FIG. 244 shows an exemplary simulation of communication rate in accordance with some aspects. In particular, FIG. 244 shows an achievable communication rate under total dissipated power consumption when the number of antennas and resolution of ADC is optimized. As shown, digital beamforming may have a higher achievable rate than analog combining as digital beamforming has the benefit of spatial sampling and combining.

A NLOS channel may have a low SNR. This may translate to the use of low order modulations such as BPSK and QPSK, which allows the replacement of high-resolution ADCs with low-resolution ADCs. For a LOS channel, the SNR can be large.

This can support high order modulations that use high-resolution ADCs or a large number of antennas. FIG. 245 shows a simulation of SNR in accordance with some aspects. In particular, FIG. 245 shows a simulation of effective SNR with analog and digital architectures over a mmWave channel. For a deterministic mmWave channel, the SNR loss due to analog beamforming may be determined. In some simulations, analog beamforming may have a 3 dB combining loss, depending on the correlation between paths. In addition, for a statistical mmWave channel simulation with 64 antennas at the transmitter and 16 antennas at the receiver, no SNR loss was observed in a LOS channel due to analog beamforming. In an exemplary simulation, digital beamforming for an NLOS channel resulted in a 5-7 dB SNR benefit.

Power consumption in the hybrid structures shown in FIGS. 242 and 243 may be reasonable as the analog baseband beamforming and digital beamforming share most of the components. A difference may be the use of analog baseband phase shifters and a single pair of high-resolution ADC for analog beamforming, and the use of a variable (or low) resolution ADC for digital beamforming. In some aspects, a single phase rotator (phase shifter) may consume power similar to one pair of low to medium resolution ADCs at 2 Gbps. Therefore, in an aspect, replacing the phase shifters with ADCs, analog baseband and digital beamforming may consume, for example, the same power. As a result, mixed architectures according to aspects disclosed herein may have similar power consumption as analog beamforming, and less when a high-resolution ADC is used, while having a performance gain.

FIG. 246 illustrates a method 24600 of communicating beamformed mmWave signals in accordance with some aspects. The method 24600 may be performed by the hybrid architecture shown in FIGS. 242 and 243. At operation 24602, the method 24600 may determine various characteristics of mmWave signals to be communicated. These characteristics may include both channel and signal characteristics. The former may include, for example, whether the channel is LOS or NLOS, while the latter may include, for example, SNR, RSSI or other measures of signal quality. The determination may be performed on previous beamformed mmWave signals that have been transmitted or received by the hybrid architecture.

At operation 24604, based on a determination from the channel and signal characteristics of the mmWave signals that high-resolution quantization or conversion from digital to analog is to be used, an analog beamforming architecture, of a hybrid beamforming architecture comprising the analog beamforming architecture and a digital beamforming architecture, may be selected to be used in communicating the mmWave signals. The analog beamforming structure comprises either a single ADC or a single DAC, dependent on whether a receiver or transmitter architecture is used. Similarly, the digital beamforming structure comprises either a plurality of ADCs or a plurality of DACs. In the analog beamforming structure, each of the mmWave signals may be phase shifted to produce phase shifted signals. The phase shifted signals may be subsequently combined to form a combined signal to be quantized.

At operation 24606, based on a determination from the channel and signal characteristics of the mmWave signals that low-resolution quantization or conversion from digital to analog is to be used, the digital beamforming architecture may be selected to be used in communicating the mmWave signals. The number of converters in the analog (1 converter) and digital (multiple converters) beamforming architecture may be different. The resolution of the digital beamforming architecture converters may be fixed (low) or variable.

At operation 24608, the mmWave signals may be communicated (received or transmitted) using the analog or digital beamforming architecture selected. Beamforming may be used.

Transceivers may provide analog, digital or hybrid beamforming. Digital beamforming may provide flexibility in beam shaping at the cost of a one-to-one correspondence between transmitter RF chain and antenna, increasing the cost, complexity and power consumption due to the large number of antennas operating over the wide bandwidth. Channel estimation between transmitter and receiver antenna pairs may further increase the digital beamforming complexity. Digital architectures may also suffer performance degradations when there is inband and adjacent channel interference, or when the SNR is very high. Analog beamforming may shape the output beam with only one RF chain using phase shifters. Analog beamforming may use beam searching to find the optimal beams at the transmitter and the receiver. The beam searching may use codebooks, whose size, as well as the alignment issues, may increase with narrowing beam size. Unlike digital beamforming, analog beamforming may be limited to directivity gain due to the single RF chain used. Analog beamforming may also be power hungry due to the use of high-resolution ADCs and DACs. Analog beamforming alone further may have the highest potential performance loss in the data plane due to a lack of capabilities such as multi-user communication, interference cancellation, and multi-beam formation, and the highest latency in the control plane caused by factors such as slow initial link-layer connection between the UE and eNB and ongoing synchronization.

Hybrid beamforming may be used to provide benefits of both analog and digital beamforming, while limiting disadvantages. Moreover, a hybrid architecture may be used in which adaptive ADCs and/or DACs may be incorporated. The hybrid architecture may adapt resolution of the ADCs (DACs) according to the channel, interference, SNRs, and/or number of UEs, among others. Since the power consumption of the ADCs and DACs may decrease exponentially with reduced resolution bits, such an architecture may enable low power millimeter wave systems.

FIGS. 247A and 247B illustrate a transceiver structure in accordance with some aspects. In particular, FIG. 247A illustrates a mmWave receiver architecture (or receiver beamforming architecture) 24700 in accordance with some aspects. The mmWave receiver architecture 24700 may provide digital beamforming. The mmWave receiver architecture 24700 may be incorporated in the parallel receive circuitry 382 shown in FIG. 3E, although the mmWave receiver architecture 24700 is not limited to such incorporation. The mmWave receiver architecture/receiver beamforming architecture 24700 shown in FIG. 247A may include low noise amplifiers (LNAs) 24712, mixers 24714, variable gain amplifiers (VGAs) 24716, low pass filters 24718, ADCs 24732 and an oscillator 24722. The ADCs 24732 may be variable resolution ADCs 24732. The resolution of the variable resolution ADCs 24732 may vary between 34 or 35 bits, for example to a much greater number of bits, as desired. As shown, the receiver beamforming architecture 24700 may receive RF signals from a plurality of antennas 24702. The signals from the antennas 24702 may be supplied to LNAs 24712. The amplified signal from each LNA 24712 may be split into dual amplified signals and then supplied to a pair of mixers 24714. The amplified signal from each LNA 24712 may be supplied to a different, non-overlapping mixer pair of mixers 24714. The mixers 24714 may downconvert the RF signals to baseband or intermediate frequency (IF) signals using the local oscillator signals from an oscillator 24722. Each of the downconverted signals from the mixers 24714 may be provided to a different VGA 24716. The amplified signal from the VGA 24716 is provided to a low pass filter 24718, which filters the amplified signal to baseband. Each antenna 24702 may be connected to a single pair of adaptive resolution ADCs 24732. The total number of ADCs 24732, $2N_r$, may thus be twice the number of receive antennas, $N_r$.

A mmWave transmitter architecture (or transmitter beamforming architecture) 24710 is shown in FIG. 247B. The transmitter beamforming architecture 24710 may provide digital beamforming. The transmitter beamforming architecture 24710 may contain, for example, power amplifiers (PAs) 24728, mixers 24714, variable gain amplifiers (VGAs) 24716, low pass filters 24718, variable resolution DACs 24734 and an oscillator 24722 (numbering shown in FIG. 247A). The resolution of the variable resolution DACs 24734 may vary in a manner similar to the ADCs 24732. As shown, the transmitter beamforming architecture 24710 may receive digital signals from the DFE (not shown). The digital signals from the DFE may be supplied to the DAC 24734, where the signals may be converted to analog signals. The analog signal from each DAC 24734 may be provided a low pass filter 24718, which filters the analog signal to baseband prior to amplification by the VGA 24716. The amplified signal from the VGA 24716 may then be upconverted to the RF frequency (mmWave) using mixers 24714 supplied with the local oscillator signals from oscillator 24722. The RF signals from corresponding pairs of mixers 24714 may then be amplified by a LNA 24712 (or PA) before being provided to a plurality of antennas 24702. Each antenna 24702 may be connected to a single pair of adaptive resolution DACs 24734. The total number of DACs 24734, $2N_t$, may thus be twice the total number of transmit antennas$N_t$.

FIGS. 248A and 248B illustrate a transceiver structure in accordance with some aspects. In particular, an exemplary mmWave transmitter architecture (or transmitter beamforming architecture) 3510 is shown in FIG. 248A. The transmitter beamforming architecture 24810 may provide analog beamforming. The transmitter beamforming architecture 24810 may contain, for example, power amplifiers (PAs) 24828, mixers 24814, variable gain amplifiers (VGAs) 24816, low pass filters 24818 (numbering shown in FIG. 248B), variable resolution DACs 24834, phase shifters 24824, a separator 24828 and an oscillator 24822. As shown, the transmitter beamforming architecture 24810 may receive digital signals from the DFE (not shown). The digital signals from the DFE may be supplied to the DAC 24834, where the signals may be converted to analog signals. The analog signal from the DAC 24834 may be supplied to the separator 24828, which may separate the signal into pairs of analog signals. Each pair of analog signals may then be provided to a phase shifter 24724. The phase shifted signals from each phase shifter 24724 may be provided a pair of low pass filters 24818, which may filter the analog signals to baseband prior to amplification by a pair of VGAs 24816. The amplified signals from the pair of VGAs 24816 may then be upconverted to the RF frequency (mmWave) using a pair of mixers 24814 supplied with the local oscillator signals from oscillator 24822. The RF signals from the pair of mixers 24814 may then be amplified by a PA 24828 before being provided to a plurality of antennas 24802.

FIG. 248B illustrates a mmWave receiver architecture (or receiver beamforming architecture) in accordance with some aspects. The mmWave receiver architecture 24800 may provide analog beamforming. The mmWave receiver architecture/receiver beamforming architecture 24800 shown in FIG. 248A, may include low noise amplifiers (LNAs) 24812, mixers 24814, variable gain amplifiers (VGAs) 24816, low pass filters 24818, phase shifters 24824, a combiner 24826, ADCs 24832 and an oscillator 24822. As in the mmWave receiver architecture 24700, the ADCs 24832 may be variable resolution ADCs. The receiver beamforming architecture 24800 may receive RF signals from a plurality of antennas 24802. The signals from the antennas 24802 may be supplied to LNAs 24812. The amplified signal from each LNA 24812 may be split into dual amplified signals and then supplied to a pair of mixers 24814. The amplified signal from each LNA 24812 may be supplied to different, non-overlapping mixers 24814. The mixers 24814 may downconvert the RF signals to baseband or intermediate frequency (IF) signals using the local oscillator signals from an oscillator 24822. Each of the downconverted signals from the mixers 24814 may be provided to a different VGA 24816. Each amplified signal from the VGA 24816 is provided to a low pass filter 24818, which filters the amplified signal to baseband. Rather than being provided to multiple ADCs as in the mmWave receiver architecture 24700, the signals from the corresponding pairs of filters 24818 may be supplied to phase shifters 24824. The phase shifters 24824 may be used to adjust the phase of each pair of filtered signals originating from a corresponding antenna. The phase-shifted signals from the phase shifters 24824 may then be combined at a combiner 24826 and supplied to a single ADC 24832 or single pair of ADCs 24832.

The digital architecture 24700 and 24710 shown in FIGS. 247A and 247B and analog architecture 24800 and 24810 shown in FIGS. 248A and 248B may be combined in parallel to provide alternate selectable transmitter and receiver architectures. Although not shown, switches may be disposed after the low pass filters to direct the signals between the filters and either the phase shifters of the digital architecture or directly with the variable resolution ADCs or DACs. The hybrid architecture may have $N_{rf}^{t}$ RF-chains and $N_{t}$ antennas at the transmitter, and $N_{rf}^{r}$ RF-chains and $N_{r}$ antennas at the receiver. As above, each RF-chain at the transmitter may be connected to one pair of adaptive resolution DACs, and each RF-chain at the receiver may be connected to one pair of adaptive resolution ADCs.

In some aspects, the architectures may adaptively set the dynamic range of the ADC/DAC for optimal power consumption and a desired signal fidelity (SNR) for a use case. In some aspects, the resolution may be decreased, for example, for control plane communications such as synchronization, initial access and UE discovery. In some aspects, the resolution may be decreased based on channel conditions, such as when the SNR or the modulation order decreases. Conversely, the resolution may be increased when the SNR or the modulation order increases. The resolution may also be increased when a high dynamic range is to be used due to the presence of a substantial amount of interference, either or both in-band or adjacent channel. The resolution may also be decreased when the number of UEs served by the eNB decreases in MU-MIMO, which may correspond to a low Peak to Average Power Ratio (PAPR). On the other hand, the resolution may be increased to reduce the effect of quantization noise on MU-MIMO UEs with a low SNR when the various UEs served by the eNB have diverse SNRs or when the number of multiplexed UE is increased (and have a higher PAPR). The resolution may further be decreased and increased when the measured DC offset, i.e., mean estimate, is respectively less or greater than a predetermined set point. In some aspects, the resolution may be decreased based on timing conditions, such as during the eNB (or access point) search or during communication of the preamble or midamble. In some aspects, the resolution may be decreased for NLOS channels having an increased number of multipaths, and thus higher PAPR.

In some aspects, means for receiving a first set of mmWave beamformed signals at a plurality of antennas may be implemented by the mmWave receiver architecture 24700 and/or mmWave receiver architecture 24800 and means for transmitting a second set of mmWave beamformed signals from the antennas may be implemented by the transmitter architecture 24710 and/or transmitter architecture 24810. In some aspects, as shown, the receiver architecture 24700/24800 and the transmitter architectures 24710/24810 may further respectively implement, as shown, means for setting a resolution of an ADC used in the receiving and DAC used in the transmitting based on a transceiver power dissipation constraint and free from reducing a number of ADCs or DACs. The apparatus may further comprise means for converting the first or second set of mmWave beamformed signals between analog and digital signals based on the resolution of the ADC or DAC.

In some aspects, as shown, the receiver architectures 24700/24800 and the transmitter architectures 24710/24810 may further implement, means for selecting which of an analog beamforming architecture and a digital beamforming architecture of a hybrid beamforming architecture to use to receive or transmit the mmWave beamformed signals, via a controller, for example. In some aspects, as shown, the receiver architecture 24700/24800 and the transmitter architecture 24710/24810 may further implement, means for adjusting the resolution of the ADC and DAC based on which of the analog and digital beamforming architecture is selected, e.g., similarly using a controller and the ADCs/DACs. In some aspects, as shown, the receiver architectures 24700/24800 may further implement, as shown means for combining complex mmWave signals received from the antennas into a combined signal, e.g., via combiner 24826

(FIG. 248A), and means for supplying the combined signal to the single DAC as an input.

FIG. 249 illustrates an adaptive resolution ADC power consumption in accordance with some aspects. In particular, FIG. 249 shows an achievable rate of Eigen beamforming with adaptive resolution ADCs for a MIMO downlink system. In the simulation, $N_t$=64 antennas at the transmitter and $N_r$=16 antennas at the receiver, and Rayleigh fading channel. Considering Walden's figure of merit (FOM) (empirical):

$$FOM = \frac{\text{Power}}{f_s 2^{ENOB}} \tag{3}$$

where $f_s$=sampling frequency, ENOB=effective number of bits that is less than the total number of bits due to offset, gain errors, differential and integral non-linearity, harmonic distortions, jitter noise etc. The performance of a MIMO downlink channel may be:

$$y_q = Q(Hx+n)$$

where H is channel, x is input and n is additive Gaussian noise with unit variance. The achievable rate at the receiver may be determined by computing numerical mutual information, $R=E_H\{I(x,y_q)\}$. The performance of an unquantized ADC may nearly be achieved using a low (1-3) bit ADC. For example, using a 2-bit ADC closely approximates the capacity of 16QAM modulation. As given in Table 9, the total power consumption for a 2-bit ADC for 16 antennas at the receiver may be 25.6 mW. If a fixed ADC resolution of 8 bits is used for 16QAM modulation, the power consumption may increase 50 fold to 1638.4 mW, for example. Thus, in using adaptive ADCs according to some aspects, the power saving can be about 98.4%. As a result, depending on modulation order, the resolution of the ADC may be adapted to reduce power consumption.

TABLE 9

| Resolution: | Total Power Consumption (mW) |
|---|---|
| 8 bits | 1638.4 |
| 2 bits | 25.6 |

$N_r$ = 16, $f_s$ = 2 Gsps, FOM = 100 fJ

FIG. 250 illustrates bit error rate (BER) performance in accordance with some aspects, showing an adaptive resolution ADC uncoded bit error rate (BER) performance in a mmWave channel in accordance with some aspects. As shown in FIG. 250, the performance of a receiver that comprises an unquantized ADC may be almost achieved by using a low bit ADC.

FIG. 251 illustrates an exemplary method 25100 of communicating beamformed mmWave signals in accordance with some aspects. The method 25100 may be performed by the hybrid architecture shown in FIGS. 247 and 248. At operation 25102, the method 25100 may determine whether mmWave signals are to be communicated. The mmWave signals may be beamformed MIMO signals that may be communicated via an LOS or NLOS channel.

The mmWave signals may be received at operation 25104 or transmitted at operation 25118. The mmWave signals may be communicated via a plurality of antennas that connected with a hybrid analog/digital beamforming architecture. The hybrid analog/digital beamforming architecture may be used to receive and/or transmit the mmWave beamformed signals.

After the mmWave signals have been received at operation 25104, the resolution of one or more ADCs used during reception may be set at operation 25106. In the analog domain, the complex (I/Q) output from the antennas may be combined before being provided to a single ADC. In the digital domain, there may be two ADCs for each antenna (one for I and the other for Q).

Similarly, before transmission of the mmWave signals at operation 25118, the resolution of one or more DACs used during transmission may be set at operation 25114. In the analog domain, the complex (I/Q) signals to be provided to the antennas may be separated before being provided to a single DAC. In the digital domain, there may be 35 DACs for each antenna (one for I and the other for Q). Whether the mmWave signals are received or transmitted, the resolution may be based on a transceiver power dissipation constraint. The power reduction may be free from reducing the number of ADCs or DACs provided in the hybrid structure or used during the conversion process.

After the resolution of the ADCs has been set at operation 25106, the mmWave beamformed signals may be converted to digital signals at operation 25108. The converted signals may be processed in a baseband processor, e.g., to compensate for in-band or adjacent channel interference. In some aspects, the resolution may be different dependent on whether the mmWave beamformed signals are being transmitted or received, or based on which of the analog and digital beamforming architecture is selected.

Similarly, after the resolution of the DACs has been set at operation 25114, the mmWave beamformed signals may be converted to analog signals at operation 25116 for transmission via the antennas. The digital signals may be supplied from a baseband processor.

In some aspects, the resolution of the ADC or DAC may be dependent on one or more factors and may be able to implement a single binary change (increase/decrease) or a plurality of changes, dependent on the dynamic range of the ADC/DAC and the factor. Factors may include, for example, signal type (control/data), signal quality (e.g., SNR), modulation (e.g., 16QAM), number of UEs served (for eNBs) or operation associated with the mmWave beamformed signals. In some aspects, the resolution may be decreased for synchronization, initial access, UE discovery or eNB search, with decreasing SNR/modulation order/number of UEs (low PAPR), when a measured DC offset is less than a predetermined set point or during a preamble or midamble of a signal (as opposed to the signal load). On the other hand, the resolution may be augmented as a result of: the SNR or modulation order increasing, a high dynamic range being used due to interference, UEs communicating with the eNB in which the hybrid structure is disposed having diverse SNRs (which may be used to reduce the effect of quantization noise on UEs with low SNR), the measured DC offset being greater than the predetermined set point; and with increasing multiplexed UEs (higher PAPR) or with an increasing number of multipaths (higher PAPR) in an NLOS channel.

As the power consumption of phase shifters in analog and hybrid beamforming structures increases with the resolution of the phase shifters, low-bit phase shifters are attractive for low-power mmWave systems. However, in some cases, low-bit phase shifters may result in high gating lobe, power loss at the main beam, and beam steering angle error due to quantization noise. The memory size may be reduced for a codebook that contains the angles used for beam steering.

The reduced codebook may be used in conjunction with a determination of the optimal phase values for subarray antennas (analog or hybrid beamforming).

FIGS. 252A and 252B illustrate a transceiver structure in accordance with some aspects In particular, FIG. 252A illustrates a mmWave receiver architecture (or receiver beamforming architecture) 25200 in accordance with some aspects. The mmWave receiver architecture/receiver beamforming architecture 25200 may provide analog beamforming. The receiver beamforming architecture 25200 shown in FIG. 252A may include low noise amplifiers (LNAs) 25212, mixers 25214, variable gain amplifiers (VGAs) 25216, low pass filters 25218, phase shifters 25224, a combiner 25226, an ADC 25232 and an oscillator 25222. The receiver beamforming architecture 25200 may receive RF signals from a plurality of antenna elements 25202. The signals from the antenna elements 25202 may be supplied to LNAs 25212. The amplified signal from each LNA 25212 may be split into dual amplified signals and then supplied to a pair of mixers 25214. The amplified signal from each LNA 25212 may be supplied to a different, non-overlapping mixer 25214. The mixers 25214 may downconvert the RF signals to baseband or intermediate frequency (IF) signals using local oscillator signals from an oscillator 25222. Each of the downconverted signals from the mixers 25214 may be provided to a different VGA 25216. Each amplified signal from the VGA 25216 is provided to a low pass filter 25218, which filters the amplified signal to baseband.

Rather than being provided to multiple ADCs as in a digital receiver architecture, the signals from the corresponding pairs of filters 25218 may be supplied to phase shifters 25224. The phase shifters 25224 may be used to adjust the phase of each pair of filtered signals originating from a corresponding antenna. The phase-shifted signals from the phase shifters 25224 may then be combined at a combiner 25226 and supplied to a single ADC 25232 or single pair of ADCs 25232. Although only one set of phase shifters 25224 is shown, multiple sets may be used. These sets may include primary phase shifters, for RF and baseband, and secondary phase shifters, for IF and digital phase shifters.

An exemplary mmWave transmitter architecture (or transmitter beamforming architecture) 25210 is shown in FIG. 252B. The transmitter beamforming architecture 25210 may provide analog beamforming. The transmitter beamforming architecture 25210 may contain, for example, power amplifiers (PAs) 25230, mixers 25214, variable gain amplifiers (VGAs) 25216, low pass filters 25218, variable resolution DACs 25234, phase shifters 25224, a separator 25228 and an oscillator 25222. As shown, the transmitter beamforming architecture 25210 may receive digital signals from the DFE (not shown). The digital signals from the DFE may be supplied to the DAC 25234, where the signals may be converted to analog signals. The analog signal from the DAC 25234 may be supplied to the separator 25228, which may separate the signal into pairs of analog signals. Each pair of analog signals may then be provided to a phase shifter 25224. The phase shifted signals from each phase shifter 25224 may be provided a pair of low pass filters 25218, which may filter the analog signals to baseband prior to amplification by a pair of VGAs 25216. The amplified signals from the pair of VGAs 3916 may then be upconverted to the RF frequency (mmWave) using a pair of mixers 25214 supplied with the local oscillator signals from oscillator 25222. The RF signals from the pair of mixers 25214 may then be amplified by a PA 25230 before being provided to a plurality of antenna elements 25202.

Analog beamforming may shape the output beam with only one RF chain using phase shifters. The antenna elements in the transceiver structures (i.e., architectures 25200, 25210) of FIGS. 252A and 252B may be arranged in a fixed, pre-defined pattern, with the entire antenna array being able to be divided into subarray antennas. As each antenna element may be connected to a single analog phase shifter, a set of unique phase shifting values for each antenna element, known as a codebook entry, may define a unique signal beam direction. The set of all codebook entries supported by the transceiver may be arranged into a codebook, which may be pre-loaded into the transceiver. Analog beamforming may use beam searching to find the optimal beams at the transmitter and the receiver. The size of the codebooks used for beam searching, and thus the memory used, may increase with narrowing beam size.

As the power consumption of the phase shifters increases with the resolution of the phase shifters, to decrease the power consumption of the transceiver shown in FIGS. 252A and 252B, low (1-3) bit phase shifters may be used. However, in some cases, the use of low bit phase shifters may have several detrimental effects, including resulting in the presence of high grating lobes, power loss at the main beam, and beam steering angle error due to quantization noise. To this end, a new codebook may be used for both primary and secondary phase shifters for low power phase array communications systems with low bit phase shifters. Using properties of an optimal beam steering, the memory size used for the codebook may be reduced, and the optimal phase values found for subarray antennas using the reduced codebook. In addition to reduction of the codebook size, the codebook may result in minimal main beam power loss, smaller grating lobe power (and thus less interference) and better beam steering accuracy. The codebook may be may be incorporated in the protocol processing circuitry 305 shown in FIG. 3A and/or radio chain circuitry 372 shown in FIG. 3D, although the codebook is not limited to such incorporation.

FIG. 253 illustrates an array structure 25300 in accordance with some aspects. The array structure 25300 may be used in an analog or hybrid beamforming architecture. The array structure 25300 may contain a uniform linear array with a subarray structure. In other aspects, the arrangement in FIG. 253 may be extended to a tertiary, quaternary, etc., subarray structure. In FIG. 253, if there are M secondary phase shifters (IF phase shifter, digital phase shifter, etc.) 25314 and L primary (low bit, e.g., 39-3 bit) phase shifters 25312 in each contiguous subarray, an array factor for the beam steering angle $\phi$ can be written as:

$$A(\phi)=\Sigma_{m=1}^{M}\Sigma_{i=1}^{L}e^{j(\theta(m-1)L+1+\varphi m-kd(m-1)L+1)cos(\phi))} \tag{4}$$

where $\theta_i$,l=1, . . . , ML, and $\varphi_j$,i=1, . . . , M are primary phase shifter values for antenna element i and secondary phase shifter values for subarray j, respectively. In addition, $$k=\frac{2\pi}{\lambda}$$

is me wave number and $\lambda$ is wavelength, d is the distance between each antenna element. Without loss of generality, $$d=\frac{\lambda}{2}.$$

Note that the calculations described herein may be performed by a processor, such as a baseband processor of the analog or hybrid beamforming architecture, and stored as a codebook to be used to generate the steering angles of the antennas.

In this approach, the phase values of the phase shifters 25312, 25314 (both IF and RF) may be increased progressively based on their relative positions to each other. That is, $\theta_{(m-1)L+l}=((m-1)L+l)\theta$, and $\varphi_m=m_\varphi$, where θ and φ are progressive phase values. However, grating lobes may appear. FIG. 254 shows a simulation of grating lobes in accordance with some aspects. This may be due to fact that the distance between the secondary phase shifters 25314 is $d=2\lambda$. Note that the number of grating lobes is equal to $$\frac{2d}{\lambda}.$$

In some aspects, means for limiting a size of a codebook used for beam steering of antennas to a subset of steering angles over which the antennas are to be steered may be implemented by the receiver architecture 25200 and/or transmitter architecture 25210. In some aspects, as shown, the receiver architecture 25200 and/or transmitter architecture 25210 may further implement means for determining a particular steering angle, outside the subset of steering angles, to which to steer the antennas, means for determining a limited steering angle within the subset of steering angles corresponding to the particular steering angle, means for determining a shift value to shift the limited steering angle to the particular steering angle and means for steering the antennas by applying the limited steering angle and the shift value, e.g., via a controller.

In some aspects, as shown, the receiver architecture 25200 and/or transmitter architecture 25210 may further implement one or more of means for applying a limited steering angle value to a plurality of primary phase shifters to steer the antennas to the limited steering angle and means for applying the shift value to a plurality of secondary phase shifters to shift the limited steering angle to the particular steering angle, and/or means for applying a unitary multiplier that indicates whether the particular steering angle is set directly by the limited steering angle and shift value or whether the particular steering angle is set by a reflection of the limited steering angle and shift value around shift value around 180°.

As shown in FIG. 254, the number of grating lobes is equal to $$\frac{2d}{\lambda}=\frac{4\lambda}{\lambda}=4.$$

As can be seen, the power of the first grating lobe is higher than the first side lobe. This may create high interference to other UEs and reduce the power of the main beam. Optimization may be used to increase the power of the main lobe and reduce grating lobes. Using the array factor, the optimization problem for a steering angle can be written as follows:

$$\max \quad \left|\sum_{m=1}^{M}\sum_{l=1}^{L} e^{j(\theta_{(m-1)L+l}+\varphi_m-kd((m-1)L+l)\cos(\phi))}\right|^2$$

-continued $$\text{Subject to} \quad \theta_i \in \left\{\frac{(j-1)360^\circ}{2^{b_p}},\ j=1,\ \ldots,\ 2^{b_p}-1\right\},\ i=1,\ \ldots,\ ML$$

$$\varphi_i \in \left\{\frac{(j-1)360^\circ}{2^{b_s}},\ j=1,\ \ldots,\ 2^{b_s}-1\right\},\ i=1,\ \ldots,\ M$$

where $b_p$ and $b_s$ are resolution bits of the secondary and primary phase shifters. Note that the optimization problem given above may be a non-deterministic polynomial-time (NP)-hard mixed integer program. In addition, the objective function may not be convex and may have $2^{LM}$ number of possible solutions only for the primary phase shifters.

The maximum of the objective function can be achieved when the term in the objective function $(\theta_{(m-1)L+l}+\varphi_m-\pi((m-1)L+l)\cos(\phi))=C$ is constant for ∀m,l. One special case is $\theta_{(m-1)L+l}+\varphi_m=\pi((m-1)L+l)\cos(\phi)$ without loss of optimality. Then, the optimization problem can be reformulated as follows:

$$\max \quad \sum_{m=1}^{M}\sum_{l=1}^{L}|(\theta_{(m-1)L+l}+\varphi_m-kd((m-1)L+l)\cos(\phi)| \tag{5}$$

$$\text{Subject to} \quad \theta_i \in \left\{\frac{(j-1)360^\circ}{2^{b_p}},\ j=1,\ \ldots,\ 2^{b_p}-1\right\},\ i=1,\ \ldots,\ ML$$

$$\varphi_i \in \left\{\frac{(j-1)360^\circ}{2^{b_s}},\ j=1,\ \ldots,\ 2^{b_s}-1\right\},\ i=1,\ \ldots,\ M$$

Next, the size of search space may be reduced using properties of quantized phase shifters. Returning to the array factor given in (4) and assuming that the optimal primary $\theta^*=[\theta^*_1, \ldots, \theta^*_{ML}]$ and secondary $\varphi^*=[\varphi^*_1, \ldots, \varphi^*_M]$ phase shifter vectors have been obtained for beam angle φ, i.e., $$|A(\phi)|=|\Sigma_{m=1}^{M}\Sigma_{i=1}^{L}e^{j(\theta^*m-1)L+l+\varphi^*M-kd((m-1)L+l)cos(\phi))}|=ML.$$

Then, the above equation may be modified as follows:

$$|A(\phi_s)|=\left|\sum_{m=1}^{M}\sum_{l=1}^{L}e^{j\left(\theta^*_{(m-1)L+l}+\varphi^*_m+((m-1)L+l)\frac{s2\pi}{2^{b_p}}-kd((m-1)L+l)\cos(\phi_s)\right)}\right|=ML$$

where $$\frac{2\pi}{2^{b_p}}$$

is due to $b_p$-bit primary phase shifters. When the exponential terms given in the above equations are compared:

$$kd((m-1)L+l)\cos(\phi)=((m-1)L+l)\frac{s2\pi}{2^{b_p}}+kd((m-1)L+l)\cos(\phi_s)$$

$$\cos(\phi)=\frac{s2\pi}{kd2^{b_p}}+\cos(\phi_s)$$

$$\phi_s=\arccos\left(\frac{s}{2^{b_p-1}}+\cos(\phi)\right)\quad \text{if } d=\frac{\lambda}{2}$$

where arccos $$\left(\frac{1}{2^{b_p-1}}\right) < \phi \leq 90^\circ,$$

and s$\varepsilon\{-2^{bp-1}, \ldots, -1, 0, 1, \ldots, 2^{bp-1}-1\}$. As a result, the optimal primary and secondary phase values may be determined for all steering angles 0<ϕ≤90°, if an optimal codebook for the steering angles between $$\text{arc}\cos\left(\frac{1}{2^{b_p-1}}\right)^\circ < \phi \leq 90^\circ$$

is known.

$$\theta_m^* \leftarrow \theta_m^* + (m-1)\frac{s\pi}{2^{b_p-1}},\ m = 1, \ldots, ML, \text{ and} \tag{6}$$
$$s = -2^{b_p-1}, \ldots, -1, 0, 1, \ldots, 2^{b_p-1} - 1$$

FIG. 255 illustrates a simulation of optimal phase values in accordance with some aspects, providing an example of a determination of optimal primary and secondary phase values for 3-bit primary phase shifters. As shown, if the phased array system has an optimal codebook for steering angles between, for example, 75.5° and 90° (shaded area), then optimal codewords for the eight regions between the arrows may be calculated. In addition, using a backlobe of the array factor, the codebook size may be further reduced to arccos $$\left(\frac{1}{2^{b_p}}\right)^\circ < \phi^* \leq 90^\circ.$$

Then a unitary multiplier may be used. By simply multiplying the optimal primary and secondary phase values by −1, the steering angle 180−ϕ* may be obtained. That is, $$\theta_l^* \rightarrow -\theta_l^*, l = 1, \ldots, ML,$$

$$\varphi_m^* \rightarrow -\varphi_m^*, m = 1, \ldots, M$$

The primary and secondary phase shifters may have the same number of bits or may have different bits in different aspects. The primary phase shifters thus determine the region in which beam steering is to occur and the secondary phase shifters determine where within the selected region the beam steering angle is located.

FIG. 256 illustrates another simulation of optimal phase values in accordance with some aspects, providing an example of determination of optimal primary and secondary phase values for 4-bit primary phase shifters. As shown, if the phased array system has an optimal codebook for steering angles between 82.81° and 90° (shaded area), the optimal codewords may be computed for RHS of the shaded area by multiplying the optimal phase values by −1. The optimal phase values may subsequently be determined for all sixteen regions using Eq. (6). The settings for the primary and secondary phase shifters may be established in an initial training sequence and may be periodically updated, e.g., based on a predetermined amount of time elapsing from the last training session.

As a result, the codebook size may be reduced to determining the steering angles arccos $$\left(\frac{1}{2^{b_p}}\right)^\circ < \phi^* \leq 90^\circ.$$

The main beam may subsequently be steered to any desired angle by using a simple progressive phase change. This property allows storage of only a codebook corresponding to steering angle arccos $$\left(\frac{1}{2^{b_p}}\right)^\circ < \phi^* \leq 90^\circ,$$

and to quickly switch the steering angle.

Turning to the memory size reduction, examples are provided for 41-bit primary phase shifters and 12-bit secondary phase shifters. AssumeM=8,L=4. For a beam resolution of 0.5° in 82.81°<ϕ*≤90°, the memory size may be 2.69 kb instead of the conventional 43 kb, reducing the codebook size by 93.7%. In addition, the codebook may be optimized only for the steering angles arccos $$\left(\frac{1}{2^{b_p}}\right)^\circ < \phi^* \leq 90^\circ.$$

Since ϕ may be limited to arccos $$\left(\frac{1}{2^{b_p}}\right)^\circ < \phi^* \leq 90^\circ,$$

the primary phase shifter values for the first subarray may be limited to between [0,0,0, . . . ,0] and $$[0, 1, 2, \ldots, L-1]\frac{\pi}{2^{b_p}}.$$

For example, for L=4 and $b_p$=3, the primary phase values may be limited to one of the rows of the following matrix.

$$T = \begin{bmatrix} 0 & 0 & 0 & 0 \\ 0 & 0 & 0 & 45 \\ 0 & 0 & 45 & 45 \\ 0 & 0 & 45 & 45 \end{bmatrix}$$

The values of the primary phase shifters for the mth subarray can be one of rows of matrix (T+45 ml), m=0, 1, . . . , M−1, I=1, . . . , L i.e., matrix T is shifted up by 45 ml. Note that the phase offset, i.e., 45 ml, can be performed by a secondary phase shifter. Accordingly, the optimization problem in (5) can be reduced to:

$$\min \sum_{m=1}^{M}\sum_{l=1}^{L} |\theta_{(m-1)L+l} + \varphi_m - kd((m-1)L + l)\cos(\phi)|$$
$$\text{Subject to } [\theta_{(m-1)L+1}, \ldots, \theta_{mL}] \in T,\ m = 1, \ldots, M$$
$$\varphi_i \in \left\{\frac{(j-1)360^\circ}{2^{b_s}},\ j = 1, \ldots, 2^{b_s} - 1\right\},\ i = 1, \ldots, M$$

FIG. 257 illustrates a process for a phase shifter in accordance with some aspects. An illustration of a process for a steering angle of 85° is provided in FIG. 257 for a two subarray, M=2, L=4, 3-bit primary phase shifter. For each subarray, the process may select a row from matrix T, then find an optimal secondary phase shifter value such that the distance between ideal and quantized phases is minimized. As shown, the optimal phase values generally modulate around the ideal phase values.

FIG. 258 illustrates a phase value determination in accordance with some aspects, showing ideal and quantized phase values for a steering angle 85°. Similar to above, FIG. 258 is provided for a two subarray, M=2, L=4, 3-bit primary phase shifter and an infinite resolution secondary phase shifter. As can be seen, the optimized phase values are closer to the ideal value for the antenna indexes.

In some aspects, the process may be:

$$T = \begin{bmatrix} 0 & \dots & 0 \\ \vdots & \vdots & \vdots \\ \vdots & \vdots & \vdots \\ 0 & \dots & (L-1)\frac{\pi}{2^{b_s}} \end{bmatrix}$$

First, find codebook for steering angles arccos $$\left(\frac{1}{2^{b_s}}\right)^{\circ} < \phi \le 90^{\circ}$$

using:

$$\min \sum_{m=1}^{M} \sum_{l=1}^{L} |\theta_{(m-1)L+l} + \varphi_m - kd((m-1)L+l)\cos(\phi)|$$

$$\text{Subject to } [\theta_{(m-1)L+1}, \dots, \theta_{mL}] \in T,\ m = 1, \dots, M$$

$$\varphi_i \in \left\{\frac{(j-1)360^{\circ}}{2^{b_s}},\ j = 1, \dots, 2^{b_s}-1\right\},\ i = 1, \dots, M$$

Then, compute the phase shifter values for angle $\phi_s$ using codebooks of $\phi$ obtained above by:

$$\phi_s = \arccos\left(\frac{S}{2^{b_p-1}} + \cos(\phi)\right)$$

$$\theta_m^* \leftarrow \theta_m^* + (m-1)\frac{s\pi}{2^{b_p-1}},\ m = 1, \dots, ML,$$

$$\text{and } s = -2^{b_p-1}, \dots, -1, 0, 1, \dots, 2^{b_p-1}-1$$

or $$\theta_l^* \leftarrow -\theta_l^*,\ l = 1, \dots, ML,$$

$$\varphi_m^* \leftarrow -\varphi_m^*,\ m = 1, \dots, M$$

An example of the performance for a M=8, L=4 2-bit primary phase shifter resolution and infinite resolution secondary phase shifters is provided below. To compare the process above with the simple quantization:

$$\theta_m = Q(m-1)kd\cos(\phi))$$

where is the steering angle and m is the antenna index, and Q(.) is a b-bit quantizer. FIG. 259 illustrates a performance comparison in accordance with some aspects. Specifically, FIG. 259 illustrates a comparison in performance between the optimized codebook with simple quantization. As shown, the optimized codebook has 0.5 dB more gain and less grating lobe power than the use of simple quantization.

FIG. 260 illustrates another performance comparison in accordance with some aspects. In particular, FIG. 260 illustrates the power loss of the main beam. As can be seen, the main beam power loss increases relatively slowly as the steering angle moves from 90° when the optimized codebook is used, compared with a simple quantization approach. Using the simple quantization approach results in a rapid drop near 90° and then relatively constant power loss. The optimized codebook may also have a better beam steering accuracy.

FIG. 261 illustrates a method 26100 of providing beam steering in a communication device in accordance with some aspects. The method 26100 may be performed by the analog or hybrid architecture such as those shown in FIGS. 252A-252B and 253. At operation 26102, the method 26100 may limit a size of a codebook used for beam steering of antennas to a subset of steering angles over which the antennas are to be steered. The antennas may be used to beam steer mmWave signals. In some aspects, the codebook may be limited to steering angles between arccos $$\left(\frac{1}{2^{b_p}}\right)^{\circ} < \phi \le 90^{\circ},$$

where bp is a number of bits of each primary phase shifter. In some aspects, the codebook may be limited to steering angles between arccos $$\left(\frac{1}{2^{b_p-1}}\right)^{\circ} < \phi \le 90^{\circ}.$$

At operation 26104, the processing circuitry may determine the desired steering angle to which to steer the antennas. The processing circuitry may determine that the desired steering angle is within the subset of steering angles or outside of the subset of steering angles.

After determining the desired steering angle at operation 26104, at operation 26106, the processing circuitry may determine a limited steering angle within the subset of steering angles. The limited steering angle may be used to apply a control signal to each phase shifter for each antenna. The value used to control each antenna may be independent of the values used for the other antennas. The limited steering angle may correspond to the desired steering angle. The primary phase shifter values may be limited to between [0, 0, 0, . . . , 0] and $$[0, 1, 2, \dots, L-1]\frac{\pi}{2^{b_p}},$$

where L is the number of primary phase shifters. In some aspects, the range of values of the limited steering angle may further be limited through the use of a unitary multiplier (+1/−1) that indicates whether the particular steering angle is set directly by the limited steering angle and shift value (+1) or whether the particular steering angle is set by a reflection of the limited steering angle and shift value around 180° (−1).

After determining the limited steering angle at operation 26106, the processing circuitry may determine a shift value at operation 26108. The shift value may be the value used to shift the limited steering angle to the desired steering angle. Each of the secondary phase shifters may apply the shift value. This may shift a region of the limited steering angle to the appropriate region. In some aspects, the shift value may take positive and negative values or may take positive values that correspond to values provided by a total number of bits of the secondary phase shifters. Note that the operations 26104 and 26106 may occur in any order, as desired.

After the limited steering angle and shift values (and perhaps unitary multiplier) are determined, at operation 26110, the processing circuitry may adjust the antennas to the desired steering angle via the primary and secondary phase shifters. The values determined may be applied to the primary and secondary phase shifters.

Charge pumps are DC to DC converters that may be used to generate power at a particular level. One or more capacitors are used to store energy to provide the desired power level, with the capacitors connected with a voltage source in a storage mode when energy is to be stored and to a load circuit in a use mode when energy is to be dissipated.

FIGS. 262A and 262B illustrate an aspect of a charge pump in accordance with some aspects. The charge pump 26200 may be incorporated in the radio chain circuitry shown in FIG. 3D, although the charge pump 26200 is not limited to such incorporation. As shown, the charge pump 26200 may be a circuit that uses one or more digital inputs from control logic 26202 to modulate or control an analog output voltage at an output load capacitor 26206. The control logic 26202 may be applied to current sources 26204 disposed on either side of the capacitor 26206 and respectively connected with a voltage rail and ground as shown in FIG. 262A. The control logic 26202 may be responsible for activation of the current sources 26204 that inject charge into the output capacitor 26206 to produce a desired voltage step. Alternatively, the control logic 26202 may be applied to switches 26208, with the capacitor 26206 connected between the switches 26208 and the switches 26208 connected with a different one of the current sources 26204. The control logic 26202 may provide clock-triggered control signals or otherwise triggered to provide pulsed injections of charge to the capacitor 26206.

The charge pump 26200 can be used for at least two general alternative purposes or class of applications. The first class of applications may be found in power integrated circuits (ICs) to provide a voltage that is higher than the voltage of the power supply and then produce a higher supply voltage internally to a system-on-a-chip (SoC). The second class of applications may be broader and aims to generate a voltage that is within the supply rails. This latter class of applications may be finely controlled at a clock or other digitally controlled rate.

FIG. 263 illustrates an aspect of a charge pump 26300 in accordance with some aspects. The charge pump 26300 may be used for the second class of applications described above. The charge pump 26300 may be provided in basic circuits such as comparators or phase-frequency detectors or bigger systems such as frequency synthesizers or ADCs that represent building blocks in a front end of a communication device. The charge pump 26300 may be incorporated, for example, in high-speed transceivers such as mmWave transceivers and the like for wireless standards.

While the charge pumps in power ICs may be employed at a high frequency and with an adjustable clock to increase their output power within a reasonable size of total capacitance used for charge transfer and the operating frequency, in mixed signal applications such as phase locked loops (PLLs), frequency locked loops (FLLs) or ADCs, the operating frequency may be unable to be adjusted easily since the operating frequency may be set by the circuit operating rate (the reference clock in PLLs and the sampling clock in ADCs). Thus, charge pumps may operate within the frequency range expected for the application. In addition, to be adopted in SoC for wireless standards and portable applications such as those for the Internet of Things (IoT), certain features are desirable. Aspects disclosed herein include charge pumps that may be compact in terms of circuit area to help avoid impact on SoC area and power efficiency. These may be of interest for comparators and ADCs charge pumps since they may serve as ancillary calibration circuits that may not be dominant in terms of area and in terms of power consumption.

Charge pump topologies may use two input signals (UP-DOWN) originating from a finite state machine, in addition to switches, current generators and a capacitor. For high speed applications, designing charge pumps with fine voltage regulation, low power consumption, compact area and high speed may involve a number of considerations. For example, fast and accurate response may be affected by capacitive coupling effects between control signals and an output node. Current generators and references may consume static power and use complex circuitry to help ensure current accuracy. Accurate current mirrors for the current references may use large devices for good matching, and the generation of low (nA range) and accurate currents in highly scaled CMOS processes may be difficult due to leakage phenomena. Fine resolution may use either very low current and/or large output capacitance, e.g., more area, and the high-speed low-resistive switches used are more likely to introduce switching noise. In some cases, it may therefore be appropriate to, among others, avoid the use of a current generator in a charge pump.

The charge pump 26300 of FIG. 263 may be provided in a communication device, such as a UE, eNB or AP. The charge pump 26300 may exploit capacitive coupling effects and subsequent sub-threshold injection instead of using current generators to inject the desired charge on an output capacitor 26320. This permits the amount of injected charge per step to be able to be small without the use of accurate low current generators or a DC biasing circuit, as well as limiting the output noise.

The charge pump 26300 may contain control logic 26302 that may provide two control signals (UP/DOWN). The control logic 26302 may be in a baseband processor in the communication device, or may be logic separate from the baseband processor. The control logic 26302 may be connected with a pair of dynamically driven switches 26310 through digital logic. The dynamically driven switches 26310 may be connected to a set of one or more pMOS (MP) and nMOS (MN) subthreshold switches 26312. The set of switches 26312 may be configured by preset bits to be on or off. The preset bits may be for the equivalent length of the MP2 and MN2 devices (DP and DN), the pulse-width of the control signals (ddel,N, ddel,P) and the output capacitor (Dc) 26320. Any number of switches 26312 may be used, with the eventual resulting change in output voltage being finer as the number of switches 26312 increases. In some aspects, one to five switches 26312 may be used due to power considerations, among others.

In some aspects, the preset bits may be preprogrammed during device testing and stored in a non-volatile memory of the communication device. In some aspects, the calibration (and thus value of the preset bits) of the charge pump 26300 may be determined during a power up sequence of the communication device and/or in the background when the communication device is in operation. The communication device may recalibrate the charge pump 26300 after a certain number of cycles and/or as a function of temperature. As the capacitive coupling and subthreshold current may be temperature dependent, calibration may occur for different temperatures. In some aspects, different values of the preset bits may be stored in memory, with each set of preset bits to be used at a different temperature of the charge pump 26300. The different sets of preset bits may be used either when a particular temperature has been reached, or when the temperature change of the charge pump 26300 meets a predetermined threshold.

Timing circuitry 26316 may connect the control logic 26302 and each of the dynamically driven switches 26310 for both the UP and DOWN control signals. The timing circuitry 26316 may include a delay line 26304 that may receive the control signal from the control logic 26302 (or other processor) as an input and can be programmed to set the pulse width of the control signals using the preset bits. The output of the delay line 26304 may be fed to the input of an inverter 26306. The output of the inverter 26306 may be supplied to an input of an AND gate 26308, whose other input may be supplied with the control signal from the control logic 26302. This may control the pulse width as the inverted output from the inverter 26306 may be delayed by an amount of time configured by the delay line 26304.

The output capacitor 26320 may comprise a plurality of capacitor-switch combinations in parallel. The switches may be activated/deactivated, as above, by the preset bits, thereby adjusting the capacitance of the output capacitor 26320. Each capacitor of the output capacitor 26320 may be between about 0.5 to about 10 fF, for example. Exemplary manners of charging and discharging the output capacitor 26320, thereby providing a controllable output voltage, are described in reference to FIGS. 264A-266B. The aspect depicted in FIG. 263 may not contain and use any analog current sources and may be implemented in any scaled CMOS technology with limited matching and accuracy.

In some aspects, means for injecting charge across a gate-drain capacitance of a dynamic switch may be implemented by the charge pump 26300. In some aspects, as shown, the charge pump 26300 may further implement means for transferring the charge across a subthreshold switch to an output capacitance of the charge pump using subthreshold drain current after injection of the charge and means for terminating the charge transfer and current flow in the output capacitance to stop a voltage change of an output voltage after transfer of the charge, e.g., by the switches 26312 and control logic 26302. In some aspects, as shown, the charge pump 26300 may further implement means for controlling a pulse width of a control signal during the charge injection phase, e.g., via the timing circuitry 26316, which may comprise means for supplying the control signal and a delayed inverted copy of the control signal to an AND gate, and a set of preset bits to control an amount of delay of the delayed inverted copy of the control signal. In some aspects, as shown, the charge pump 26300 may further implement means for transferring the charge to the output capacitance across a number of subthreshold switches equal to a number of preset bits of the set of preset bits and/or means for controlling incorporation of a number of parallel internal capacitors to form the output capacitor, e.g., via the output capacitor 26320.

FIG. 264A illustrates a scheme of an output portion of a charge pump 26400 in accordance with some aspects. FIG. 264B illustrates a timing diagram of signals of the charge pump 26400 in accordance with some aspects. The charge pump 26400 may contain a pair of dynamic switches 26410 to which an UP or DOWN control signal may be supplied. The dynamic UP switch 26410 supplied with the UP control signal may be connected to the supply voltage (or one of the rail voltages/rails) and the dynamic DOWN switch 26410 supplied with the DOWN control signal may be connected to ground (or the other of the rails). The MP and MN switches 26412 may be respectively connected between the dynamic UP switch 26410 and the output capacitor 26420 and between the dynamic DOWN switch 26410 and the output capacitor 26420.

In some aspects, when no control signals are supplied to the output portion shown in FIG. 264A, the MN1 and MP1 switches 26412 may both be on. The charge pump 26400 may tie nets an and ap, e.g., interconnections, shown in FIG. 264A respectively to ground and Vcc through low channel resistances RON,n, and RON,p. In this situation, Vout may still be isolated from the supply rails through the MP2 and MN2 switches 26412 whose state is preset to off, and may offer a very high resistive path between nets an, ap and Vout.

As shown in FIG. 264B, the output voltage of the capacitor 5120 can change under the occurrence of a desired control signal. The p-branch of charge pump 26400, which may be controlled by the control signal UP, devices MP1, MP2 switches 26410, 26412 and the output capacitance Cout of the output capacitor 26420 may be used to increase the output voltage. The output capacitor 26420 may be initially charged to half the dynamic Vcm. The UP control signal may be low in a "sleep" mode. Each time an UP control signal is supplied to MP1 switch 26412, the voltage at net ap may result in a pulse □Vap over the same time period primarily because of charge injection and/or clock feed-through. The pulse □Vap may result in a subthreshold or leakage current through MP2 switch 26412, and eventually a positive step increase of □Vout of the output capacitance Cout of the output capacitor 26420 through the charging of the output capacitor 26420. Similarly, each time a DOWN control signal is supplied to MP2 switch 26412, the voltage at net an may result in a negative pulse □Van over the same time period. The pulse □Vanp may result in a decrease of □Vout of the output capacitance Cout of the output capacitor 26420. The increase and decrease of the output capacitance Cout of the output capacitor 26420 may be symmetric.

FIGS. 265A-265C illustrate exemplary operations of a charge pump according to some aspects. FIG. 265A shows parasitic capacitances of the p-branch of the circuit when the output capacitor is charging. FIG. 265B shows a circuit model of the p-branch when the output capacitor is charging. FIG. 265C shows a timing diagram of the p-branch. As shown in FIG. 265A, on the positive edge of the UP signal, the pMOS switch 26510 is turned off, and the voltage at net ap enters a high impedance state. At the same time, charge may be injected through the gate-drain capacitance of MP1 switch 26510 (Cgd,mp1), which results in a positive voltage step spike on net ap and the MP2 switch 26512 source.

The other leakage capacitors associated with MP1 switch 26510 may be related to the gate, drain and source of the switches 26510, 26512— i.e., Cgd,mp1, Csg,mp2, Csb,mp2, Csd,mp2 (for sake of generality). Cap 26514, shown in FIG. 265B, may group together the parasitic capacitors affecting net ap as a single modeled capacitor. In general, due to indirect capacitive coupling through Csd,mp2 it may be possible that any steep edge of the UP signal at the MP1 gate couples directly to the output. However, since Csd,mp2 may be very small compared to the other device parasitic capacitances (both intrinsic and layout associated), and since the bulk and the gate of MP2 switch 26512 may be low-impedance nets (Vcc) such phenomena can be considered negligible. For example, an amount of direct charge injection associated with the edges of the control signal, which could be significant, may be avoided.

In addition, when UP rises, MP1 switch 26510 may be turned off. In this case, net ap may become a high impedance net that is subject to a charge injection due to the control signal edge. The variation of the voltage of net ap correspondent to the UP positive edge may be (when the pMOS MP1 switch 26510 is OFF) approximately given by:

$$\Delta V_{ap} = \Delta V_{UP} \cdot \frac{C_{gd,MP1}}{C_{gd,MP1} + C_{p,ap} + C_{sd,MP2} \,//\, C_{out}} \cong V_{cc} \cdot \frac{C_{gd,MP1}}{C_{p,ap}}$$

while the output voltage is still stable. After this operation, the net ap voltage may settle at a value that can be a few 10 mVs to 100 mV higher than the power supply level. Due to the consequent increase of $V_{sg,MP2}$, a subthreshold current may flow both through MP2 switch 26512 (and MP1 switch 26510 as well). The subthreshold current may contribute to a discharge of $C_{p,ap}$ and a $\Delta V_{drop,p}$ ap net voltage drop. The portion of current flowing through MP2 switch 26512 may feed to the output capacitor 26520, determining an increase of the output voltage. This charge may cause the positive step at the output voltage and may be basically transferred from $C_{p,ap}$ to $C_{out}$.

When the UP negative edge occurs, pMOS MP1 may again turn on. First, charge may be drawn by net ap through the Cgd,mp1 coupling path. This may determine a step down in the net ap voltage and a Cp,ap discharge to a voltage that is close to the initial value Vcc, minus ΔVap. Meanwhile, with a small delay due to the channel resistance-associated time constant, MP1 switch 26510 may return to the ON state and pull net ap back to Vcc. The charge to pull back net ap to Vcc may be provided entirely by the supply and not drawn back from the output capacitance. Also in this step, no direct charge injection may occur to the output node, and the MP2 subthreshold current may stop flowing into Cout, thereby freezing the output voltage to the last, higher, value.

As a new UP pulse occurs, the described transient may repeat. This may lead to another positive step of the output voltage occurring. To summarize, the operating principle of the p-branch of the charge pump can be synthesized and described in a few steps. FIGS. 266A-5C illustrate an exemplary operation of a charge pump according to some aspects.

FIG. 266A illustrates the charge injection phase. The charge injection phase may occur on the positive edge of the UP control signal. At this edge, MP1 may turn off, and the net ap voltage may increase and induce a positive Vsg,MP2.

FIG. 266B illustrates the charge transfer phase. The charge transfer phase may occur after the charge injection phase. In particular, in the charge transfer phase, the subthreshold drain current of MP2 may transfer charge from Cp,ap to Cout determining an increase in the output voltage Vout.

FIG. 266C illustrates the shutdown phase. The shutdown phase may occur after the charge transfer phase. In particular, the shutdown phase may occur on the negative edge of the UP control signal, whose delay with respect to the positive edge may be controlled by the delay line 26304. At this point in time, MP1 may turn on, and the net ap voltage may return to Vcc. At this point, any current flow in Cout may cease.

A three-operation model and analysis can be extended to the nMOS branch including MN1, MN2, the DOWN control signal and net an. In the nMOS branch instead of charging net ap to Vcc+Cout, the nMOS branch may determine a drop of net an voltage to a negative voltage.

In some aspects, the maximum amount of charge that can be transferred during each operation may be the charge injected into Cp,ap during the charge injection phase:

$$\Delta V_{ap} \cdot C_{p,ap} \approx V_{cc} \cdot C_{gd,MP1}$$

Considering a 1V supply, an output capacitance of 50 pF and a 50fF gate-drain capacitance of MP1, the charge would correspond to a 1 mV output voltage step. While the charge stored initially on Cp,ap may not depend on the Cp,ap size, the corresponding increase in the voltage of net ap may, on the contrary, depend on the Cp,ap size. This may in general affect the amount of current that MP2 is able to inject into the output capacitance during the charge transfer phase.

In the design and sizing phase of this circuit, some solutions can be adopted to determine the step size and thus the sensitivity of the circuit. Since the sub-threshold current of the devices may depend linearly on the length of the transistors, the length of MP2 can be sized as desired. Alternatively, more devices can be placed in series in situations in which the fabrication process does not allow freedom in the sizing of the device length. Since the charge injected at the output capacitor may also depend on the duration of the charge transfer phase, a pulse-width controller with a programmable delay line as shown in FIG. 263 can be introduced to control the waveform of the UP and DOWN signals. This may enable transfer of a large or complete amount of the available charge to the output. In some circumstances, an insufficient pulse-width may result with a charge transfer that is too small. Since the amount of the charge injection during the charge injection phase may depend on the gate-drain capacitance of MP1 (or MN1 in the nMOS branch), the MOS can be sized as desired. Since the output voltage step at a fixed amount of injected charge may depend on the size of the output capacitance, the output capacitance may be programmed using a configurable capacitive array.

Simulations were performed on a charge pump implemented in a 14 nm FinFET 10-bit ADC test-chip for comparators background calibration. The adopted output capacitance was 50fF. To verify this, emphasis has been dedicated to fast corner simulations. The pulse-width of an alternating series of UP and DOWN control signal was set to 50ps, the output capacitance to 50fF and the update rate was 1 GHz. Simulations were performed under nominal, fast, and slow corner at 27° C. The voltage step seen was about 600□V (comparable with the LSB of a >11-bit fully differential, rail-to-rail converter) and stable across corners. The circuit, in general, may be compatible with higher resolution applications.

To prove programmability, even in the presence of unfavorable conditions in terms of leakage currents (fast corner), simulations were performed with a focus on the p-branch, varying the size of the MP1 device, the pulse-width of the control signals and the equivalent length of the MP2 device. Simulations were performed, for a fast corner, 27° C., to determine the output voltage variation during a sequence of UP commands at 1 GHz rate, a constant 50ps UP pulse-width, for the implemented prototype, and for different widths of the MP1 device width. For an MP1 device width of 42 nm, 84 nm, 168 nm, 336 nm, the corresponding voltage steps were determined to be respectively 600 μV, 1 mV, 1.3 mv, 1.5 mV. Simulations were also performed to determine the output voltage variation for UP commands at a 1 GHz rate using different pulse-widths. These latter simulations performed on a device having a 42 nm/28 nm MP1/MP2 aspect ratio for a 20ps to 800ps UP signal pulse-width showed a linear relationship between pulse-width and output voltage. Further simulations were performed to determine the charge pump output voltage during a sequence of UP commands at 1 GHz rate, a constant 50ps UP pulse-width, for different widths of the MP2 device (56 nm, 84 nm, and 112 nm). The charge pump output voltage varied linearly with time and scaled approximately with MP2 width. The power consumption of the charge pump at an update rate of 1GS/s as shown in the simulations is less than 10 μW in nominal corner and 27° C., and thus is negligible if compared to a GHz rate state-of-the art efficiency ADCs and PLLs.

According to some aspects, charge pumps are thus provided that help avoid the use of a current reference or charge accumulation/storage devices other than the output capacitance. The charge pump may be suitable for PLL and ADC comparator offset calibration applications, and in general for all applications where fast rate (>1GS/s), fine resolution (<1 mV) and ultra-low power consumption, for example, are desired. Some aspects may be used in ultra-low power PLLs, reducing the circuit area, and may also be used to perform a high-efficiency comparator calibration for high speed ADCs.

FIG. 267 illustrates a method 26700 of injecting charge in a charge pump in accordance with some aspects. The method 5400 may be performed by any one or more of the structures shown in FIGS. 262A-267. At operation 26702, charge may be injected into the structure(s). The charge may be injected across a gate-drain capacitance of a dynamic switch (MOSFET) during a charge injection phase. The charge injection may occur across a gate-drain capacitance of the dynamic switch on a positive edge of a control signal supplied to the dynamic switch. The charge injection may be controlled by controlling a pulse width of a control signal. In some aspects, the pulse width of the control signal may be controlled by supplying the control signal and a delayed inverted copy of the control signal to an AND gate, and a set of preset bits to control an amount of delay of the delayed inverted copy of the control signal.

At operation 26704, after injection of the charge, the charge may be transferred across a subthreshold switch to an output capacitance of the charge pump. The charge may be transferred using subthreshold drain current during a charge transfer phase. During the charge transfer phase, the charge may be transferred to the output capacitance across a number of subthreshold switches equal to a number of preset bit of the set of preset bits. Each preset bit may control a different subthreshold switch. In addition, the number of parallel internal capacitors may be controlled to form the output capacitor using a different preset bit.

After the charge has been transferred, at operation 26706 the charge transfer and current flow in the output capacitance may be terminated. This may stop the voltage change of the output voltage during a shutdown phase. The termination may occur on a negative edge of the control signal supplied to the dynamic switch. A voltage at a net between the dynamic switch and the subthreshold switch may return to a rail voltage to which the dynamic switch is connected.

As mmWave communication systems rely on multiple directional transmissions over multiple paths, mmWave receivers may experience interference from different directions when the network becomes dense. To help address this, as described above, receivers may use analog, digital or hybrid beamforming. Analog beamforming may in some cases be insufficient to mitigate omni-directional interference due to high side-lobes and wide beam width, and digital domain beamforming is not sufficient to mitigate interference since interference may block the desired signal at low-resolution ADCs (low dynamic range). To mitigate this, aspects disclosed herein provide an architecture to help null out interference before quantizing to reduce the dynamic range and power consumption of ADC at the receiver. For example, a feedforward loop is provided for spatial interference mitigation so that coarsely quantized received signals may be processed to estimate high interference and then subtract the interference in analog domain. The nulling may be enabled for multiple interference angles, without using a long training sequence for iterative filter design at the ADC feedback loop. This may enable a low power fully digital mmWave receiver. FIG. 268 illustrates a receiver architecture 26800 in accordance with some aspects. The receiver architecture 26800 may be incorporated in the parallel receive circuitry 382 shown in FIG. 3E, although the receiver architecture 26800 is not limited to such incorporation.

The receiver architecture 26800 shown in FIG. 268 may contain, for example, an RF front end 26820, delay lines 26802, sets of combiners 26810, 26812, 26814, 26818, sets of quantizers 26804, 26816, a feedforward filter 26806, digital-to-analog converters (DACs) 26808 and a baseband processor 26830. RF signals may be received by an antenna (not shown) and provided to the RF front end 26820. A plurality of antenna outputs $r_i(t)$, i=1, . . . , $N_r$ may be provided by the RF front end 26820 and may be split into two paths, one for determination of the interference and one for nulling. Specifically, each antenna output may be supplied both to one of the delay lines 26802 and to one of the first combiners 26810. The analog delay line 26802 may include a plurality of tapped latches (e.g., D latches) to enable the delay to vary by taking the output from different taps. Alternatively, the delay length may be fixed, with the only output of the analog delay line 26802 being taken from the last latch.

At the first combiner 26810, the dithering noise for interference $n_1$ may be added to the antenna output. The dithering noise $n_1$ may depend on an estimate of the interference, which may be determined prior to providing the interference nulling. The output from the first combiner 26810 may be supplied to a $b_1$-bit quantizer 26804, which may coarsely quantize the analog signal and convert the analog signal to a digital signal. The quantized signal may then be provided to the feedforward filter 26806 prior to being digitized by the DAC 26808. The feedforward filter 26806 may be a multitap filter used to process the received quantized signal and estimate the interference signal.

The interference signal may then be converted back into an analog signal by a d-bit DAC 26808. The resolution of the DAC 26808, like the quantizers 26804, 26816 may be fixed or variable. In the latter case, the resolution of one or more of the DAC 26808 and quantizers 26804, 26816 may be dependent on signal type (e.g., control/data) or channel conditions, among others. The converted interference signal may then be subtracted from the delayed antenna output from the analog delay line 26802 at the second combiner 26812 to produce a corrected signal. Dithering noise $b_2$ may be added at the third combiner 26814 to the corrected signal, prior to quantizing the dithered corrected signal. The dithering noise $n_2$ may be dependent on receiver performance, which may be measured using one or more signal quality characteristics. For example, the dithering noise $n_2$ may be dependent on the BER performance. A $b_2$-bit quantizer 26816 may be used to quantize the dithered corrected signal. In some aspects, a resolution of the $b_1$-bit quantizer 26804 may be less than resolution of the $b_2$-bit quantizer 26816. The use of a coarse resolution to generally determine the interference may permit a reduction in power used by the receiver, as well as reducing the dynamic range of the in-line quantizer after compensation of the beamformed signal.

The quantized signal from the quantizer 26816 may then be supplied to a baseband processor 26830 for further processing. The output from the quantizer 26816 and the interference signal from the feedforward filter 26806 may be combined at the fourth combiner 26818 to generate a Received Signal Strength Indicator (RSSI). The RSSI may be determined based on all of the quantized outputs (from each of the $b_2$-bit quantizers 26816 and from each of the outputs of the filter 26806) or may be based on fewer than all of the outputs. The RSSI may be used, for example, to adjust one or both the quantizer resolutions, the DAC resolution and/or the one or both dithering noise.

The receiver shown in FIG. 268 may thus be able to simultaneously mitigate (or null) from multiple interference sources in multiple beamformed signals without the addition of other components, such as phase shifters to form multiple analog beams. The receiver may also be able to mitigate interference without the use of a filter whose coefficients depend on a desired and interference signals, and thus use of a long training sequence.

In some aspects, means for receiving beamformed signals from a plurality of antennas may be implemented by the receiver architecture 26800. In some aspects, as shown, the receiver architecture 26800 may further implement means for forming compensated signals by feedforward compensating the beamformed signals for the interferer signals, prior to quantizing compensated signals for output, e.g., via the feedforward routing in the receiver architecture 26800, and means for quantizing the compensated signals to form quantized output signals, e.g., via the quantizer 26816.

In some aspects, as shown, the receiver architecture 26800 may further implement one or more of: means for quantizing the beamformed signals along the feedforward path to form quantized feedforward signals, means for compensating for the interferer signals in the quantized feedforward signals to provide digital compensation signals, e.g., via the filter 26806, means for converting the digital compensation signals to analog compensation signals, e.g., via the DAC 26808, and/or means for combining the analog compensation signals with the beamformed signals to form the compensated signals, e.g., via the combiner 26812. In some further aspects, as shown, the receiver architecture 26800 may further implement one or more of: means for adding first dithering noise to the beamformed signals prior to the quantizing the beamformed signals and means for adding second dithering noise to the compensated signals, e.g., via combiners 26810 and 26814; means for combining the digital compensation signals and digital versions of the compensated signals to provide a signal quality and means for controlling, based on the signal quality, at least one of: quantization of the beamformed signals, quantization of the compensated signals, the first dithering noise or the second dithering noise, e.g., via baseband processor 26830 and combiner 26818; means for estimating interference from each direction from: $\hat{\iota}_k[n]=a_r^H(\theta_k)y[n]$, e.g., via baseband processor 26830 and/or means for delaying the beamformed signals sufficiently to permit the beamformed signals to be combined with the analog compensation signals, e.g., via the delay line 26802.

Mathematically, consider uniform linear array with $N_r$ antennas at the receiver. The received signal can be written as follows:

$$r(t)=x(t)+i_1(t)a_r(\theta_1)+ \dots +i_l(t)a_r(\theta l)+n$$

where x(t) is the desired signal vector, n is noise vector, and $i_i(t), i=1, \dots, l$, are the interference signals (I is the number of interferer directions) and array vector $a_r(\theta_i)$, $i=1, \dots l$, is given by:

$$a_r(\theta_i) = \frac{1}{\sqrt{N_r}}\left[1, e^{j\frac{2\pi}{\lambda}d\cos\theta_i}, e^{j\frac{2\pi}{\lambda}d2\cos\theta_i}, \dots, e^{j\frac{2\pi}{\lambda}d(N_r-1)\cos\theta_i}\right]^T,$$

Here, $\theta_i$ is the angle of arrival, d is the inter-antenna distance, and $\lambda$ is wavelength. At the feedforward loop, noise may be added to de-correlate the received signal at the output of antennas and then the signal quantized, e.g., with a low bit (1-3 bit) ADC as follows:

$$y[n]=Q_1(r(t)+n_1)$$

where $n_1$ is the dithering noise vector, $Q_1(\cdot)$ is the $b_1$-bit quantizer. The interference k may be estimated in the feedforward filter using an estimation vector. In some aspects, the estimation vector may use maximum ratio combining (MRC):

$$\hat{\iota}_k[n]=a_r^H(\theta_k)y[n], k=1, \dots, l$$

where $a_r(\theta_k)$ is the estimation vector of interference from direction $\theta_k$. The direction of interference may be determined using a digital process, such as the MUltiple Signal Classification (MUSIC) process. l may be total number of interference directions (interferers). Note that the receiver is considered to have a large antenna array so that $a_r^H(\theta k)a_r(\theta_l)\approx 0$ when $l \neq k$. Then, a vector may be formed according to the angle of arrival as the following:

$$i[n]=\hat{\iota}_1[n]a_r(\theta_1)+ \dots +\hat{\iota}_l[n]a_r(\theta_l)$$

After digital samples are converted to the analog domain using d—bit DAC, the interferences may be subtracted from the received signal and dithering noise $n_2$ added before quantizing at the $b_2$-bit ADC as the following:

$$z[n]=Q_2(r(t)-i(t)+n_2)$$

FIG. 269 illustrates the filter characteristic of a receiver according to some aspects. In the simulated filter, $N_r=64$ antennas and d=5 bits DAC, $b_2=5$ bits ADC, and two interference directions are present at $\theta=70°$ and $\theta=110°$. Two cases are shown: case 1: a 1 bit ADC ($b_1=1$,) $n_1\sim N(0, 0.4\sigma_r^2)$, $n_2\sim N(0,0)$; and case 2: a 2-bit ADC $n_1\sim N(0,0.3\sigma_r^2)$, $n_2\sim N(0,0)$. As shown, the receiver architecture can cancel interference of up to about 13.6 dB when a 1-bit ADC is used, and up to about 23.32 dB when a 2-bit ADC is used.

FIG. 270 illustrates the BER performance of a receiver according to some aspects. The graph shows the BER performance of analog beamforming, digital beamforming and the architecture of FIG. 268. As above, $N_r=64$ antennas at the receiver in the line of sight (LOS) channel with 90° desired signal direction and 70° and 110° interference directions with SIR=−20 dB. A 16QAM modulation is used, and the ADCs used are: $b_1=2$ bits ADC, d=5 bit DAC, $b_2=5$ bit ADC. The variance of Gaussian dithering noise may be chosen by the processing circuitry to randomize the quantization error. The bandwidth is 1 MHz, and interference and desired signal may communicate over the same band. A pulse shaping filter is a square root raised cosine filter with a filter length of eight symbols and a rolloff factor of 0.2. As shown in FIG. 270, a digital receiver without spatial interference cancellation before the ADC has a lower BER performance due to having an insufficient dynamic range. The analog beamforming also performs worse than the architecture of FIG. 268 due to high side-lobes.

FIG. 271 illustrates additional receiver architectures according to some aspects. As above, $N_r$=64 antennas at the receiver in the line of sight (LOS) channel with 90° desired signal direction. A 16QAM modulation is used, and the ADCs used are: $b_1$=2 bits ADC, d=5 bit DAC, $b_2$=5 bit ADC. In this case, a 75° interference direction with SIR=−13 dB was used. When a 1-bit ADC is used at the feedforward loop, the architecture of FIG. 268 performs better than the analog and fully digital beamforming.

FIG. 272 illustrates a method 27200 of compensating for interferers in a receiver in accordance with some aspects. The method 27200 may be performed using the receiver of FIG. 268. At operation 27202, the receiver may receive beamformed signals from a plurality of antennas. The beamformed signals may be scanned over a range of angles. Each of at least some of the beamformed signals at a particular angle may comprise a signal from a transmitter and an interferer signal.

The beamformed signals may be split to different routes before being recombined. In a feedforward route, the beamformed signals may be quantized and the interference estimated using a filter to form digital compensation signals at operation 27204. Prior to quantizing the beamformed signals, dithering noise may be added to de-correlate the signal. The digital compensation signals may then be converted to form analog compensation signals.

In the direct path, the original beamformed signals may be delayed to provide the appropriate timing for combining the signals. At operation 27206, the beamformed and analog compensation signals may be combined. In some aspects, the analog compensation signals which may contain the interference estimation, may be subtracted from the beamformed signals.

Dithering noise may be added to the resulting signals, and these signals may then be quantized. The resolution of quantization of the beamformed signals may be lower than the resolution of quantization of the compensated signals. At operation 27208, the quantized resulting signals may be supplied to a baseband processor for processing. The quantized resulting signals and the digital compensation signals may be combined to determine a signal quality, such as RSSI, SINR or SNR. This quality may be used to control the quantization of the beamformed signals, quantization of the compensated signals, and/or dithering noise.

In addition to beamforming, channel estimation between transmitter and receiver antenna pairs may further increase the digital beamforming complexity. Digital architectures may also suffer performance degradations when there is in-band and adjacent channel interference. FIGS. 273A and 273B illustrate interference in accordance with some aspects. As shown in the system 6000 in both figures, a base station (BS) 27302 may serve a UE 27304, providing data and control signals. Although only LOS communications are shown, the BS 27302 may also communicate with the UE 27304 through NLOS communications. A neighboring BS 27306, which may also be an access point, may generate interfering signals at the UE 27304. The interfering signals, like the serving BS 27302 communications, may be LOS or NLOS and may interfere with the signals from the serving BS 27302. Instead or in addition to interfering signals from the interfering BS 27306, one or more interfering UEs 27308 may generate interfering signals at the UE 27304. The interfering signals from the interfering UE 27308 may be directed to the serving BS 27302, the interfering BS 27306 or the UE 27304.

Unlike digital beamforming, analog beamforming may be limited to directivity gain due to the single RF chain used. Analog beamforming may, however, in some cases be insufficient to mitigate omni-directional interference due to high side-lobes and wide beam width, and digital domain beamforming is not sufficient to mitigate interference since interference may block the desired signal when low-resolution ADCs (low dynamic range) are used. This is to say that interference from one or more directions may be so much larger than the desired signal that the interference may overwhelm the dynamic range of the ADCs, which may be adequate to discriminate the desired signal in other directions, when the antenna elements are set at or near the direction of the interference. This may be particularly prevalent when mmWave frequencies are used due to the rapid interference and signal quality changes for LOS and NLOS channels caused by UE movement. Increasing the dynamic range of the ADCs, however, may be power intensive and difficult to design. To mitigate this, aspects disclosed herein provide an architecture that may help null out interference before quantizing and may subsequently digitally invert the adjustment to permit the original signal to be digitally processed. This may enable a reduction of the ADC dynamic range and power consumption of the ADCs at the receiver when such interference is present. The signal may be sampled at the quantizer, thereby the received signal may be processed in the digital domain and the interference canceled in the analog domain. Parallel delta-sigma ADCs with a feedback loop may be used to enable a low power, fully digital mmWave receiver.

FIG. 274 illustrates a receiver architecture 27400 in accordance with some aspects. The receiver architecture 27400 may be incorporated in the parallel receive circuitry 382 shown in FIG. 3E, although the receiver architecture 27400 is not limited to such incorporation. The receiver architecture 27400 shown in FIG. 274 may contain, for example, an RF front end 27410, combiners 27402, sets of low pass filters (LPFs) 27404, 27412, sets of gains 27406, 27422 quantizers 27408, decimators 27414, a filter 27416, DACs 27418 and a baseband processor 27420. RF signals may be received by antennas 27430 containing multiple antenna elements and provided to the RF front end 27410.

The RF signals $r_i[n]$, i=1, . . . , $N_r$ may be outputs from the antenna 27430. The RF signals may be indicated as a uniform linear array from $N_r$ antennas at the receiver architecture 6100. $N_r$ may be selected dependent on a beamforming gain and power consumption at the receiver architecture 27400. The received signal can be written as follows:

$$r(t)=x(t)+a_1 i_1(t)a_r(\theta_1)+ \ldots +a_l i_l(t)a_r(\theta_l)+n$$

where x(t) is the desired signal vector, n is a noise vector, and $i_i$ (t), i=1, . . . ,l, are the interference signals, where/is total number of interference directions that are to be nulled out. The angular vector $a_r(\theta_i)$=1, . . . ,l, may be given by:

$$a_r(\theta_i) = \frac{1}{\sqrt{N_r}}\left[1, e^{j\frac{2\pi}{\lambda}dcos\theta_i}, e^{j\frac{2\pi}{\lambda}d2cos\theta_i}, \ldots , e^{j\frac{2\pi}{\lambda}d(N_r-1)cos\theta_i}\right]^T,$$

where $\theta_i$ is the angle of arrival and d is the inter-antenna distance between antennas 27430. Each of a plurality of antenna outputs $r_i$(t), i=1, . . . , $N_r$ provided by the RF front end 27410 may be supplied to one of the combiners 27402.

A modified signal from the decimator 27414, described in more detail below, may be combined with the antenna output from the RF front end 27410. This modified signal at least partially mitigates the interference prior to quantization of the received signal, and thereby permits a reduction in the dynamic range of the quantizer 27408.

The combiner 27402 may be formed by an integrator in the analog domain and may form a portion of compensation circuitry. The combined signal may be supplied from the combiner 27402 to the first LPF 27404. The first LPF 27404 may shape the quantization noise in the combined signal to out-of-band. The signal from the antenna 27430 may be mixed to baseband prior to reaching the first LPF 27404, such as in the RF front end 27410.

The low pass filtered signal from the first LPF 27404 may be supplied to a variable gain 27406. The gain output for the different antenna signals may be indicated as $g_i[n]$, $i=1, \ldots, N_r$. The gain 27406 may provide amplification or attenuation to the low pass filtered signal to adjust the input to the quantizer dynamic range. The gain 27406 may be optimized depending on the channel or channel quality (such as SNR or SINR), or in some aspects can be set to fixed gain for a low complexity receiver. The gain 27406, like the desired signal and interference, may vary over time.

The signal from the gain 27406 may subsequently be provided to quantization circuitry comprising a $b_1$-bit quantizer 27408. The quantizer 27408 may provide a b-bit digital version of the signal. b may be selected dependent on a desired BER and filter characteristic. In some aspects, the quantizer resolution may be variable, dependent on, among others, whether high speed or high reliability is desired, such as the type of signal (e.g., control or data) or an operation mode of the quantizer 27408 (such as averaging or time-interleaved mode). The output of the quantizer 27408 with $b_i[n]$, $i=1, \ldots, N_r$, bits may thus be, i.e., $b_i[n]=Q_b(g_i[n])$. The output from each of the quantizers 27408 may form B, a data matrix used for filtering the interference.

In some aspects, the data matrix B may be filtered (or weighted) by a filter 27416 prior to being fed back to mitigate the interference. The filter 27416 used may be, e.g., dependent on the direction of arrival of the interference, as well as time-based. The filtered signal may be supplied to the DAC 27418, which may convert the d—bit digital signal to an analog output. Similar to the above, d may be selected dependent on a desired BER and filter characteristic. In some aspects, the DAC 27418 may use the same number of bits to convert the digital input to an analog signal as the quantizer 27408 uses to convert the analog input to a digital signal. In other aspects, the number of bits used by the quantizer 27408 and the DAC 27418 may be different. In some aspects, the resolution of the conversion may be variable, dependent on similar factors as used for quantization. The relative difference between the quantization resolution and the conversion resolution may change with the above factors. The analog output from the DAC 27418 may be supplied to the second gain 27422 $c_i[n]$, $i=1, \ldots, N_r$. The second gain 27422 may be optimized depending on the channel or SNR, or in some aspects can be set to fixed gain for a low complexity receiver. The second gain 27422, as above, may provide amplification or attenuation, and may vary over time. The modified signal from the DAC 27418 may then be subtracted from the signal from the RF front end 27410, as indicated above.

The signal from the quantizer 27408 $b_i[n]$, $i=1,N_r$ may also be supplied to the second low pass filter 27412. The second low pass filter 27412 may be used to remove harmonics introduced by the quantizer 27408. In some aspects, the quantizer 27408 may oversample the input signal. In these aspects, the signal from the second low pass filter 27412 may subsequently be decimated at the decimator 27414 before being supplied to the baseband processor 27420 for further processing. The decimator 27414 may reduce the sampling of the digital data down to the Nyquist rate. Decimation may process the digital to down sample the signal to have a low pass characteristic. In some aspects, the quantizer 27408 may avoid oversampling, and the decimator 27414 may be eliminated.

In some aspects, the baseband processor 27420 may invert the filter to essentially restore the signal to that of the original signal from the antennas 27430, within errors caused by quantization. This may permit the baseband processor 27420 to digitally process the original signal, such as through digital cross-correlation, without the original signal being supplied to the quantizer 27408. Instead, a compensated signal that compensates for the interference in the analog domain may be provided to the quantizer 27408, thereby reducing amplitude spikes associated with the interference and permitting the dynamic range of the quantizer to be reduced.

In some aspects, means for receiving a plurality of beamformed signals from a plurality of beamforming antennas may be implemented by the receiver architecture 27400. In some aspects, as shown, the receiver architecture 27400 may further implement for each beamformed signal: means for reducing the dynamic range of a quantizer to which the beamformed signal is supplied by compensating the beamformed signal for interference from an interferer prior to the beamformed signal being provided to the quantizer and providing a compensated signal to the quantizer, e.g., by the feedback loop shown; means for quantizing the compensated signal, e.g., by quantizer 27408; means for digitally inverting compensation applied to the beamformed signal to regenerate a digital version of the beamformed signal and means for signal processing the digital version of the beamformed signal, e.g., by BB processor 27420.

In some aspects, as shown, the receiver architecture 27400 may further implement one or more of: means for filtering the quantized output using a filter 27416 whose coefficients are dependent on a direction of the interferer to produce a filtered signal; means for converting the filtered signal to an analog signal, e.g., by the DAC 27418, and/or means for combining the analog signal with the beamformed signal to generate the compensated signal, e.g., by the combiner 27402. In some aspects, as shown, the receiver architecture 27400 may further implement means for shaping quantization noise in the compensated signal to out-of-band using a LPF 27404 to form a LPF signal; means for adjusting a gain of the LPF signal prior to quantizing the LPF signal to reduce the dynamic range of the quantizer 27408, e.g., using gain 27406, and/or means for eliminating harmonics introduced by the quantizer 27408 using a LPF 27416 to generate a LPF signal and means for down sampling the LPF signal to a Nyquist rate, e.g., using the decimator 27414.

Turning to the mathematics of an exemplary architecture, design of the filter W, data matrix B and decimation operation are described below. In some aspects, a process to design the filter W may employ the direction of the interference(s), i.e., $\theta_i=1, \ldots. I$. The direction of interference may be known through a previous calculation, and determined in any of a number of processes, such as by use of a digital process such as the MUSIC process. A lower triangular matrix L and a scaling vector $\alpha$ may be defined as follows:

$$L = \begin{bmatrix} 1 & 0 \\ 1 & 1 \end{bmatrix}$$

$$\alpha = \begin{bmatrix} 2 \\ 3 \end{bmatrix}$$

Then, a filter coefficient matrix $F \in C^{2Nr \times Nr}$ may be determined as follows:

$$F = \begin{bmatrix} F_1 \\ F_2 \end{bmatrix} = \begin{bmatrix} L \otimes a_r^T(\theta_1) \\ \vdots \\ L \otimes a_r^T(\theta_I) \end{bmatrix}^+ \begin{bmatrix} \alpha \otimes a_r^T(\theta_1) \\ \vdots \\ \alpha \otimes a_r^T(\theta_I) \end{bmatrix}$$

where $[\cdot]^+$ is pseudoinverse operator and $\otimes$ represents a kronecker product. When the oversampling rate is denoted by K, where K≥2, $W \in \mathbb{C}^{(K-1)Nr \times Nr}$ may be formed as follows:

$$W = \begin{bmatrix} F_1 \\ F_2 \\ F_2 \\ \vdots \end{bmatrix}$$

Higher K is better for BER, but worse for power consumption. Thus, the number of receiver antennas may be $N_r$, the direction of interferences may be $\theta_i$i=1, . . . , and the oversampling ratio may be K≥2.

The structure of the data matrix $B \in \mathbb{C}^{(K-1)Nr \times K-}1$ is presented next. The initial states of the memories may be set to zero, i.e., b[0]=0. For an oversampling rate K, K−1 samples may be used from each antenna output. The data vector b[i] may be denoted as:

$$b[i]=[b_i[n],b_2[n], \ldots ,b_{N_r}[n]]^T$$

where i is (n modulo K), and $b_m[n]$ is the n'th digital sample at the output of m'th quantizer, m=1, . . . , $N_r$. Then, the data matrix may be the following:

$$B = \left[b^{(1)}, b^{(2)}, \ldots , b^{(K-1)}\right] = \begin{bmatrix} b[1] & b[2] & \ldots & b[K-1] \\ 0 & b[1] & \ldots & b[K-2] \\ 0 & 0 & \ldots & b[K-3] \\ \vdots & \vdots & \ldots & \vdots \\ 0 & 0 & \ldots & b[1] \end{bmatrix}$$

Thus, if mod(n,K)=0, then the DAC input may be b[n], assuming that the interference is larger than the signal such that signal part may be ignored. Otherwise, the DAC input may be $W^T b^{(i)}$, where i=mod(n,K), and $b[i]=[b_i[n], b_2[n], \ldots, b_N[n]]^T$ The decimation operation may be performed to down sample the signal, which may have been oversampled. K−1 samples out of every K samples may be used as the first samples of every K samples may have large interference. FIG. 275 illustrates an oversampled signal in accordance with some aspects. As shown in FIG. 275, samples n at the decimator that satisfy (n modulo K) #1 may be replaced with zero. Then, the remaining signal may be down sampled using a low pass filter, such as a comb filter. In some aspects, the multiplication $W^T b^{(i)}$ may use $O(N_r^2)$ real multiplication and summation bits per sample if b >1 bits quantizer. On the other hand, if a 1-bit quantizer is used, a real summation may be limited to only $O(N_r^2)$.

The gain control parameters of the first and second gains may be determined as:

$$c[i]=[c_i[n],c_2[n], \ldots ,c_{N_r}[n]]^T, i=\mathrm{mod}(n,K)$$

$$g[i]=[g_i[n],g_2[n], \ldots ,g_{N_r}[n]]^T, i=\mathrm{mod}(n,K)$$

In some aspects, the gain control parameters can be chosen by simulation, or can be found while sampling using automatic gain control process. In other aspects, the gain control parameters may be set as above.

FIGS. 276A and 276B illustrate filter characteristics of the receiver in accordance with some aspects. As shown in FIG. 276A, a receiver with $N_r$=8 antennas may be able to mitigate interference at θ=40° and θ=120° by up to −30 to −40 dB when only a 4-bit quantizer with K=4 is used. This increases the mitigation of interference to about −250 dB when an infinite resolution quantizer is used, at the cost of excessive power loss, among others. Note that analog beamforming may not have flexibility to cancel interference for any given direction (i.e., array pattern of analog beamforming is designed to have a fixed pattern irrespective of interference direction). Instead, analog beamforming may only beamform to the desired direction.

FIG. 277 illustrates a beamforming pattern according to some aspects. In particular, FIG. 277 illustrates analog beamforming for θ=95°. As can be seen, the analog beamforming may only be able to cancel interference by −18 dB and −15 dB at θ=40° and θ=120°, respectively. As above, analog beamforming may have an inflexible beam pattern.

FIG. 278 illustrates a BER performance according to some aspects. In particular, FIG. 278 illustrates the BER performance of analog beamforming, digital beamforming and the architecture shown in FIG. 274. The different receiver architectures shown in FIG. 278 may have $N_r$=8 antennas at the receiver in a LOS channel with a 110° desired signal direction and 90° interference direction. For simulation purposes the bandwidth may be 1 MHz, and the interference and desired signal communicate over the same band. A pulse shaping filter may be used. The pulse shaping filter may be a square root raised cosine filter with a filter length of eight symbols and a rolloff factor of 0.2. In the simulation, SIR=−30 dB and QPSK modulation are used. As shown in FIG. 278, the analog beamforming architecture may be completely blocked by the interference as analog beamforming can only reduce interference by −13 dB. A fully digital receiver with a 4-bit ADC may also performs worse than the architecture of FIG. 274 since a 4-bit ADC saturates under high interference. The architecture of FIG. 274, however, may perform the best due to interference nulling before quantization.

FIG. 279 illustrates a method 27900 of reducing quantizer dynamic range in a receiver in accordance with some aspects. The method 27900 may be performed by the structure shown in FIG. 274. At operation 27902, a plurality of beamformed signals may be received from a plurality of beamforming antennas. The beamforming antennas may scan across all angles and produce the beamforming signals at each angle.

For each beamformed signal at each angle, the beamformed signal may be compensated at operation 27904 by a digitized and modified version of the beamformed signal. The modification may be based on the interferers and associated angles. The angle of any interferers may be previously determined and used during the modification. This may reduce the dynamic range of a quantizer to which the beamformed signal is supplied.

The compensated signal may be further processed at operation 27906. The processing may include shaping quantization noise in the compensated signal to out-of-band using a low pass filter (LPF). The gain of the LPF signal may be adjusted prior to quantizing the LPF signal to reduce the dynamic range of the quantizer. The gain may be predetermined or may be variable and set dependent on the channel characteristics.

The adjusted signal may then be quantized at operation 27908. The quantization resolution may be predetermined or may vary, dependent on signal type, channel, or other variables.

The quantized signal may be modified and fed back to the beamformed signal at operation 27910. In the feedback loop, the quantized signal may be filtered using a filter whose coefficients are dependent on a direction of the interferer and the filtered signal converted to an analog signal. The analog signal may be supplied to a gain similar to the gain in the feedforward portion, although the gains may be independent of each other. In some aspects, the gains may be of different types (e.g., fixed or variable). The resolutions in quantizing the compensated signal and converting the filtered signal may be independent of each other, and at least one of the resolutions may be dependent on desired bit error rate (BER) or filter characteristic, for example.

The quantized signal may further be processed at operation 27912. The processing of the quantized signal may include decimation; e.g., if the beamformed signal is oversampled during the quantizing, the quantized signal may be down sampled to the Nyquist rate after eliminating harmonics introduced by the quantizer using another LPF. The resulting signal, whether or not decimated, may be supplied to a baseband processor, where the compensation may be digitally inverted to regenerate a digital version of the beamformed signal. The resulting digital signal may be signal processed by the baseband processor.

In communication systems, received RF signals may be converted to digital signals for processing at the UE, while digital data may be converted to RF signals for transmission from the UE. An ADC in the receiver chain may receive an RF signal from an antenna and convert the RF signal to a digital signal. A DAC in the transmitter chain may receive a digital signal and convert the digital signal to an RF signal for transmission from the antenna. A design tradeoff of ADC may be expressed by a Figure-of-Merit (FoM) that incorporates the ratio between power, ADC resolution and signal bandwidth:

$$FOM = \frac{\text{Power}}{\text{Dynamic range} \cdot \text{Bandwidth}} \tag{7}$$

The upcoming standards that may use mmWave communications may have different requirements from earlier standards. For example, 5G baseband or 802.11ay (WiGig) may use a low-resolution (4*b*-7*b*) and high conversion rate ADC, while 802.11ax WiFi may use a moderate-high (10*b*-12*b*) resolution but low bandwidth baseband converter. Interleaving more channels (ADCs) may improve the FoM because, as the conversion speed of a single channel approaches the limits of the technology, the power-speed tradeoff becomes nonlinear. This may demand a disproportionately higher power for a desired increase in speed of a single ADC at these limits. Time-interleaving ADCs may retain the linearity of the trade-off and lead to high-speed ADCs having a FoM achievable by a lower rate single ADCs.

However, while time-interleaved ADCs may be a desirable choice for low-resolution, high speed ADC architectures, the use of such time-interleaved ADCs may be unsuitable for architectures that are to use higher resolutions and lower bandwidths. Such architectures may use oversampling, noise shaping, and filtering to achieve the design goals. Even though a time-interleaved ADC with much higher sampling rate compared to the Nyquist Signal Bandwidth possesses the oversampling feature, incorporating oversampling and filtering (no noise shaping) may be limited to achieving a modest 3 dB resolution improvement (in theory) for each doubling of the oversampling ratio and thus number of channels Nch. This may limit the adoption of time-interleaved ADC in multi-standard receivers, which may use several different types of dedicated ADCs for each standard, with a corresponding overhead of design time, complexity, and integration resource usage.

Aspects disclosed herein may provide a reconfigurable ADC architecture (or ADC system— ADCS) flexible enough, for example, to meet the demands of receivers that are configured to receive communication signals in multiple standards. The ADCS may be reconfigured as desired from a Nch channel time-interleaved ADC to Nch parallel ADCs with a relative offset. This may permit the ADCS to achieve a higher resolution on a lower bandwidth by averaging the output of the channels instead of time-interleaving the channels. In some aspects, the resolution improvement offered by this architecture may be 6 dB for each doubling of the number of channels Nch.

FIG. 280 illustrates an ADCS 28000 according to some aspects. The ADCS 28000 may be used in a receiver of a communication system, for example in a baseband or RF sub-system. The ADCS 28000 may be incorporated in the ADCs 394 shown in FIG. 3E, although the ADCS 28000 is not limited to such incorporation. The ADCS 28000 may thus be incorporated in a communication device, such as a UE, eNB, AP or another device. The ADCS 28000 may be used in environments in which any number of standard-based communications are employed, including legacy (e.g., 3G, 4G communications) and next generation standards (e.g., 5G communications), and the like. The ADCS 28000 may be configurable between different operating modes, which include a time-interleaved mode and an averaging mode. This may enable the ADCS 28000 to adapt to different standards/specifications with different speed vs. resolution trade-off set points. For example, averaging may increase accuracy at the cost of reducing the ADCS speed, and thus may be appropriate for lower speed signaling, such as control signaling.

The ADCS 28000 may contain multiple Nch ADCs 28002 (also referred to as core ADCs) that each contain a sampling circuit 28004 for oversampling and decimation. The topology of the ADCs 28002 may be generic and can change based on the application (e.g., SAR, pipeline, Delta-sigma). The inputs of each core ADC 28002 may be connected with a signal and clock distribution circuit 28008 and a TU 28006. The output of each core ADC 28002 may be supplied to a processing circuit 28010. Each core ADC 28002 may have an Nq bit resolution, fsc max speed and correspondent Pcore-ADC@fsc power consumption. The core ADCs 28002 may be numbered from ADC 0 to ADC Nch−1. The sampling circuit 28004 of the core ADC 28002 may permit the core ADC 28002 to oversample and decimate the analog input signal Vin,n and Vin,p from the signal and clock distribution circuit 28008.

The signal and clock distribution circuit 28008 may be provided with analog input signals Vin,n and Vin,p from the antenna 28030 (through a front end) to distribute among the core ADCs 28002. The analog input signals Vin,n and Vin,p may be received from a driver circuit 28020, which may be separate from the ADCS 28000. The signal and clock distribution circuit 28008 may also be provided with a master clock signal (MCK) from a local oscillator or other timing circuit (not shown). The MCK may be supplied to the timing circuitry (TU) 28006 associated with the core ADC 28002, which may generate local master clock signal (LMCK) and system clock (SCK) for distribution only to the associated core ADC 28002. The MCK may be frequency divided in the TU 28006 such that the MCK may have a frequency that is an integer multiple of the LMCK. The LMCK signal provided by each of the TUs 28006 may be the same. The TU 28006 may produce a SCK that is dependent on the operating mode of the ADCS 28000. The TUs 28006 may be linked together from the timing unit associated with core ADC 0 to core ADC Nch−1.

The digital outputs from the different core ADCs 28002 may be supplied to a digital processing circuit 28010. The processing circuit 28010 may perform multiple operations, at least some of which may depend on the operating mode of the ADCS 28000. The processing circuit 28010 may individually weight and then add the digital outputs from at least some of the core ADCs 28002 in the time-interleaved mode. In some aspects, the inputs from the core ADCs 28002 may be weighted to have digitally preset weights that may be equal or different, the processing circuit 28010 acting as an equalizer. In some aspects, the processing circuit 28010 may instead provide a multiplexed buffer 28010 for at least some of the core ADCs 28002 in the averaging mode. In some other aspects, the processing circuit 28010 may write to a memory the output of some or all the core ADCs 28002.

The ADCS 28000 may also employ a mode signal from a controller 28040 to determine the operating mode of the ADCS 28000. The mode signal may be supplied to the timing units 28006 as well as the core ADCs 28002. The mode may indicate the timing of the LMCK to be supplied to the core ADC 28002. The timing units 28006 may be connected together serially and, for example, used to trigger the LMCK at the appropriate time for each timing unit 28006. The timing unit 28006 may contain, for example, one or more latches triggered by an adjacent timing unit 28006. Each ADC 28002 may feature a specific offset as well as a sampling timing skew associated with the sampling circuit 28004. The mode signal may be a preset bit that sets the operating configuration. The controller 28040 in some aspects may be the processing circuit 28010 or in other aspects may be another processor.

In some aspects, the mode signal may be a single bit that indicates in which of two modes the ADCS 28000 is to operate, and thus which ADC configuration to use. In some aspects, the mode signal may include one or more additional bits that indicate how many of the core ADCs 28002 to use. In some aspects, if a limited number of core ADCs 28002 are used, the additional bits in the mode signal may indicate which of the core ADCs 28002 to use. For example, the core ADCs 28002 may in some aspects be adjacent, and thus have adjacent ADC numbers. In this case, the mode signal in some aspects may also have an offset bit that indicates the first of the consecutive core ADCs 28002 to use. In some aspects, the mode signal may also have a bit for each of the core ADCs 28002 that indicates whether to use the core ADC 28002. In some aspects, the core ADCs 28002 used in the time-interleaved mode, for example, may be distributed uniformly (e.g., every other core ADC 28002), keeping the timing of the core ADCs 28002 the same so that the timing of the composite time-interleaved signal is uniform. This may be used, for example, in some aspects to reduce the number of core ADCs 28002 used, and thus power consumption.

In some aspects, the core ADCs 28002 may have a fixed bit resolution independent of the mode. The core ADCs 28002 may have an 8-12 bit resolution, for example. In some aspects, the core ADCs 28002 may have a variable resolution that is dependent on the mode. In this case, the resolution for the core ADCs 28002 may have a greater number of bits (e.g., 8-11 bits) for parallel operation (averaging mode) and less for serial operation (time-interleaved mode) (e.g., 1-3 bits).

In some aspects, means for adjusting an ADC configuration between an averaging mode ADC configuration for higher resolution, lower bandwidth operation and a time-interleaved mode ADC configuration for lower resolution, higher speed operation in which the outputs from the core ADCs are averaged may be implemented by the ADCS 28000. In some aspects, as shown, the ADCS 28000 may further implement means for averaging outputs from core ADCs 28002 in the averaging mode ADC configuration to produce an averaged ADC output and means for combining outputs from core ADCs 28002 in the time-interleaved mode ADC configuration to produce a time-interleaved ADC output, e.g., via processing circuit 28010.

In some aspects, as shown, the receiver architecture 27400 may further implement means for providing a system clock signal and a local master clock signal to each core ADC 28002 based on a master clock signal supplied to the timing unit 28006 and means for adjusting the system clock signal dependent on the ADC configuration, e.g., via signal and clock distribution circuit 28008, TU 28006 and controller 28040. In some aspects, as shown, the receiver architecture 27400 may further implement one or more of: means for adjusting a resolution of the core ADCs 28002 dependent on the ADC configuration, e.g., via controller 28040 and ADCs 28002 and/or means for oversampling and decimating an input signal to each of the core ADCs 28002 prior to quantizing the input signal to produce a quantized signal, e.g., via TU 28006, controller 28040, and sampling circuit 28004.

FIGS. 281A and 281B illustrate different operation modes of an ADCS 28100 according to some aspects. As shown in FIG. 281A, the ADCS 28100 may operate in a time-interleaved mode. The time-interleaved mode may be signaled by the mode input to the timing units 28106 and the core ADCs 28102, e.g., by a single bit. The time-interleaved mode may enable the ADCS 28100 achieve a high bandwidth Nch·fsc/2 or conversion speed of Nch·fsc, and Nq (or lower) resolution analog-to-digital conversion.

In the time-interleaved mode, the SCK may be supplied to the core ADCs 28102 in sequential order. For example, the SCK signal for ADC N+1 may occur immediately after the signal for ADC N, eventually repeating such that the SCK signal for core ADC 0 occurs immediately after the signal for core ADC Nch−1. Thus, in the time-interleaved mode, each channel may provide a converted sample at a global clock MCK rate. In the time-interleaved mode, the outputs from the core ADCs 28102 may be provided to the memory/bypass (processing circuit) 28110, which may operate as a buffer, such as a Parallel In Serial Out Shift Register (PISO), a memory or a bypass, and provide the core ADC outputs as an output of the ADCS 28100.

As shown in FIG. 281B, the ADCS 28100 may also operate in an averaging mode. The averaging mode may be signaled by the mode input to the TUs 28106 and the core ADCs 28102 (labeling shown in FIG. 281A). In the averaging mode, each core ADC 28102 may have a specific offset. In the averaging mode, the ADCS 28100 may operate with the core ADCs 28102 in parallel, with the signal and clock distribution circuit 28108 supplying the signals as indicated in FIG. 280, and exploit offset and timing skew between the channels to achieve a higher than Nq resolution (up to Nq +3.32 log 10(Nch)) over a Nyquist bandwidth equal to fsc/2 or conversion speed of fsc.

As shown, the SCK for each core ADC may occur at the same time and with the same frequency. Thus, in the averaging mode, each channel may operate simultaneously at fsc=fMCK/Nch with local clocks (SCK, LMCK). The core ADC output may be provided to the processing circuit 28110, which may operate to weight the signals from the core ADCs 28102 to equalize the outputs and provide the core ADC outputs as an output of the ADCS 28100. In some aspects, the core ADC outputs may be averaged to produce the ADCS output. The processing digital circuit can work as a shift register, such as a Parallel In Serial Out Shift Register (PISO), a memory or a bypass in the TI mode, or as an adder or equalizer in the AVG mode, for example.

The averaging mode of operation of Nch parallel channels with controlled relative offset allowed by the reconfigurability of the ADCS may be able to achieve better resolution than the equivalent oversampling-by-Nch with the time-interleaved architecture. The resolution improvement on a signal whose bandwidth is equal to the ADC Nyquist frequency fsc/2 for a Nch time-interleaved oversampling system may be:

$$\Delta SNDR_{oversampling}=10\ \log_{10}(N_{ch})$$

In some aspects, for a Nch parallel channels averaging system the resolution improvement can be up to:

$$\Delta SNDR_{avg}=20\ \log_{10}(N_{ch})$$

In some aspects, the system power may not change between the two configurations. The system power, when operating at full rate, may at first order be given by:

$$P_{sys}=N_{ch}\times P_{core\text{-}ADC@fsc}$$

Even in the presence of uncalibrated sources of errors such as skew, differential non-linearity (DNL) or integral nonlinearity (INL), the averaging technique may provide a resolution improvement that is similar to that of a calibrated oversampling core ADC with equal number of channels that is operating in time-interleaved mode. Unlike an over-sampled core ADC, however, the ADCS may avoid constraining the input signal, for example, to have at least a minimum amplitude.

Note that uncorrelated noise sources add on a root-sum-square (RSS) basis, while signal voltages add on a linear basis. Thus, averaging multiple core ADCs may increase the SNR. FIG. 282 illustrates core ADC averaging according to some aspects. The LSB of the averaged conversion characteristic of M equal core ADCs with relative offset may be M times smaller than that of a single core ADC LSB. FIG. 282 illustrates a simulation with two quantizers, one with a predetermined amount of offset that clearly shows the resolution has increased in comparison to that of a single channel.

In addition, in some aspects, by averaging the output of multiple parallel core ADCs with relative offsets, it is possible to gain up to 1 bit of resolution every doubling of the number of channels Nch. In some aspects, the maximum resolution improvement that would result from the adoption of a Nch time-interleaved ADC configuration to oversample a signal whose bandwidth is equal to the Nyquist frequency of the core ADC is:

$$\Delta SNDR_{oversampling,mzx}=10\ \log_{10}(OSR)=10\ \log_{10}(N_{ch})(\alpha)$$

This is equivalent to 3 dB (half bit) per each doubling of the oversampling ratio (OSR) and thus of the number of channels. Instead, in some aspects, the maximum resolution improvement that can be obtained by averaging Nch core ADCs with relative offset is:

$$\Delta SNDR_{ave(os),max}=20\ \log_{10}(N_{ch})=2\Delta SNDR_{oversampling,max}(\beta)$$

$$\Delta ENOB_{avg(os),max}\approx 3.32\ \log_{10}(N_{ch})\approx 2\Delta ENoB_{oversampling,max}(\gamma)$$

Compared to equation (α), equation (β) highlights a better resolution improvement, thus showing that the averaging technique with offset between the channels may be a more efficient way to improve the resolution beyond the single quantizer limit and that the reconfigurable architecture may be more beneficial than the fixed (time-interleaved only) one. In fact, since the system power in some aspects may not change between the two configurations and the system power may be at first order:

$$P_{sys}=N_{ch}\times P_{core\text{-}ADC@fsc}$$

Moreover, the averaging architecture may be less sensitive to timing skew and DNL/INL mismatch, with respect to the time-interleaved architecture. In fact, even in the presence of non-calibrated sources of error, such as timing skew and DNL/INL between channels, averaging may still achieve a similar resolution improvement as oversampling. Calibration of the quantizers and system output may be applied. In some aspects, calibration can be applied prior to implementation in a work environment. In some other aspects, calibration may be applied concurrently with the circuit operation and running in the background. Calibration may be performed through a feedback loop involving the controller 28040 that, on the basis of the ADC output from the processing circuit 28010, may calculate the proper configuration bits to tune the ADCS 28000 to approach the desired operating point and performance.

FIG. 283 shows resolution improvement of an averaging system in accordance with some aspects. The simulation of the ADCS used ideal quantizers having a moderate resolution (e.g., 9 bit) in each channel. The core ADCs may have different offsets at 1GS/s and for a 180 MHz input signal (e.g., using IEEE 802.11ax estimated specification). The results show the variation of the SNDR of the LSB for different number of channels Nch=2, 5, 10.

The results of FIG. 283 show that a resolution improvement is present, independent of the number of channels. Moreover, as can be seen in FIG. 283, for offset values that are multiples of LSBcore/Nch, the improvement may be higher than that achievable by a simple oversampling factor equal to the number of averaged channels. As illustrated, the improvement may, for example, be equal to 6 dB every doubling of Nch. Cadence model (using Verilog-A and schematic building blocks) simulation results of the averaging ADC operation (Verilog-A model) with Nch=10 channels featuring relative offsets that are multiple than LSB/Nch show 20 dB resolution improvement: 10 dB better than an equivalent oversampling by Nch would achieve. Other Monte Carlo statistical simulations of a 10 channel/9-bit core-ADC averaged configuration with engineered offsets equal to α·LSB9b/Nch (α integer) and in presence of uncalibrated sources of error (DNL/INL, 2ps skew between channels, gain mismatch), show a DNL/INL standard deviation of 0.1 LSB, a gain mismatch of 1% between channels and a resolution improvement of up to 9/9.5 dB, thus equivalent to that of a calibrated oversampling technique.

FIG. 284 illustrates a method 28400 of providing a flexible ADC architecture in accordance with some aspects. The method 28400 may be performed by the controller 28040 in conjunction with the other circuits shown in FIG. 280. At operation 28402, an ADC configuration may be adjusted (or selected) between an averaging mode ADC configuration and a time-interleaved mode ADC configuration. The averaging mode may, for example, be used for higher resolution, lower bandwidth operation. The time-interleaved mode ADC configuration may, for example, be used for lower resolution, higher speed operation in which the outputs from the core ADCs are averaged. Independent of the mode selected, a system clock signal and a local master clock signal may be provided to each core ADC based on a master clock signal supplied to a timing unit. The system clock signal may be adjusted dependent on the ADC configuration. In some aspects, the system clock signal may be adjusted based on a mode signal that indicates the ADC configuration. The mode signal may, for example, comprise a single bit that indicates the ADC configuration or the single bit and at least one additional bit that indicate how many of the core ADCs to use. The resolution of the core ADCs may be adjusted dependent on the ADC configuration. During quantization, the analog inputs may be oversampled and decimated.

At operation 28404, the outputs from core ADCs in the averaging mode ADC configuration may be averaged to produce an averaged ADC output. The averaged ADC output may then be further processed. The processing may comprise buffering the quantized signals from each of the core ADCs.

At operation 28406, the outputs from core ADCs in the time-interleaved mode ADC configuration may be combined to produce a time-interleaved ADC output. As above, the time-interleaved mode ADC output may then be further processed. The quantized signals may be processed differently dependent on the ADC configuration. The processing may comprise equalizing the quantized signals from each of the core ADCs.

The method used for beamforming and the beamforming location may have broad implications on both receiver and system performance. The choice of analog beamforming (either at RF or at IF) versus digital beamforming may ultimately represent a tradeoff in receiver linearity, blocker rejection, ADC dynamic range, and power consumption.

Digital beamforming may have benefits for control plane latency and effective SNR in NLOS environments. While digital beamforming may provide flexibility in beam shaping, it may do so at the cost of a one-to-one correspondence between transmitter RF chain and antenna. In particular, the power consumption for digital beamforming may be in part due to the large number of ADCs and DACs, one of which may be used for each RF chain. In particular, the power consumption of the ADCs and DACs may increase linearly with sampling rate and exponentially with number of resolution bits per sample. The quantity and resolution of the ADCs may place significant power consumption into the data converters and the associated data links to the baseband processor. Moreover, the ADC dynamic range may be an issue, especially when one or more strong interferers are present. Although it may be desirable for the ADCs to have sufficient dynamic range to handle interferers, the ADC input may be devoid of spatial interference rejection.

Hybrid beamforming, which may incorporate analog beamforming, may reduce or alleviate the issue of power consumption to some extent, but at the cost of masking individual antenna signals from the digital processing, as well as adding to control latency and NLOS deficits. Alternatively, the use of digital beamforming with low-resolution ADCs (such as 1-3 bit ADCs), rather than the high-resolution ADCs typically used, may reduce ADC and digital processing power consumption, but at the cost of throughput in high-SNR scenarios.

In some aspects, ADC specifications used, in particular the dynamic range, may be reduced through analog summation while retaining individual antenna signals for digital processing. In particular, dynamic adjustment of the quantity of operating ADCs may be dependent on the signal conditions and system activity. In some aspects, analog summation may be used across elements for spatial interference rejection, but in a manner that is invertible in the digital domain for fast control plane operation. Thus, in some aspects the control plane performance may match that of digital beamforming and thus the control plane latency may be smaller than that for analog beamforming. Additionally, the use of analog phase shifters and in-phase/quadrature-phase (I/Q) imbalance compensation circuitry present in analog beamforming may be avoided, that is, in some aspects the architecture may avoid I/Q combining and rely only on switching signal polarity. Moreover, the spatial interference rejection and fewer ADCs used for analog beamforming may be achieved, as may the low control latency, high effective SNR, high non-line-of-sight throughput and MU-MIMO capability of digital beamforming.

FIG. 285 illustrates a receiver architecture 28500 in accordance with some aspects. The receiver architecture 28500 may be incorporated in the parallel receive circuitry 382 shown in FIG. 3E, although the receiver architecture 28500 is not limited to such incorporation. The receiver architecture 28500 may be disposed in a UE, an NB, an AP or another communication device. The communication device may have other circuitry, such as transmitter circuitry, not shown for convenience. The architecture 28500 may comprise receiver circuitry that includes an RF front end 28502, multipliers 28504, combiners 28506, variable gain control 28508, ADCs 28510 and a baseband processor 28520. Other elements, such as low pass filters, may be provided but are not shown for convenience. The RF front end 28502 output may provide outputs $s_i[t]$, i=1, . . . ,N from the antenna elements (not shown) of an antenna 28530 connected with the RF front end 28502.

Each ADC 28510 may be associated with a different combiner 28506 and variable gain control 28508, along with a plurality of multipliers 28504. Each multiplier 28504 may be associated with a different output $s_i[t]$, i=1, . . . ,N from the RF front end 28502 and may have an individual signal weight $w_{ii}$, i,j=1, . . . ,N that is used to weight the signal. In some aspects, the signal weights may take values of either −1 or 1. Although limiting the weights to these values may result in an easier computation, in some aspects, the weights may take other integer or non-integer real or complex values. Different weightings may be used as different ADCs 28510 may see different amounts of interference. The weightings may be adaptive, dependent on conditions of the desired and interferer signal (or other variables) to maximize or increase signal-to-interference-plus-noise (SINR) of the desired signal, or may be fixed and thus independent of the signal and channel conditions.

Thus, for each antenna element, the analog output from a particular antenna element may be combined with the weighted analog outputs from each other antenna element at the combiner 28506. The combined output from the combiner 28506 may be supplied to the variable gain control 28508. The variable gain control 28508 may provide a gain $g_i$, i=1, . . . ,N to adjust $v_i$ [t], i=1, . . . ,N, the input to the ADC 28510.

The variable gain control 28508 may permit a reduction in the dynamic range of the ADC 28510 by providing an invertible analog compensation for potential interferers prior to submission to the ADC 28510. The dynamic range of the ADC 28510 may be selected by the baseband processor 28520 (or another processor) according to a desired array interference rejection and angle resolution. To resolve smaller angles, a larger array or greater ADC dynamic range may be used. The output from the ADC 28510 may be supplied to the baseband processor 28520, where the analog compensation provided by the combiner 28506 may be digitally inverted. This inversion may in some aspects be limited to the resolution of the ADC 28510.

In some aspects, the analog summation may be implemented with current mode summation. In other aspects, other signal summation methods may be used. The method of summation used may meet a desired power and performance. As shown, in some aspects, the arrangement of FIG. 285 may reduce or eliminate the use of analog phase shifters and I/Q imbalance compensation circuitry used for analog beamforming.

In some aspects, means for receiving beamformed signals from a plurality of antenna elements of an antenna may be implemented by the receiver architecture 28500. In some aspects, as shown, the receiver architecture 7200 may further implement means for compensating for the interferer signal, prior to providing the beamformed signals to ADCs, e.g., via multipliers 28504 and combiners 28506, means for quantizing the compensated signals, e.g., via ADCs 28510, and means for reversing the compensating prior to processing the quantized signals, e.g., via the baseband processor 28520.

In some aspects, as shown, the receiver architecture 28500 may further implement at least one of: means for determining a direction of at least one of the desired or interfering signal or channel sounding during processing of the quantized signals, e.g., via the baseband processor 28520. In some aspects, as shown, the means for compensating for the interferer signal may further comprise means for combining a weighted copy of each of the beamformed signals e.g., via combiners 28506. In some aspects, as shown, the receiver architecture 28500 may further implement at least one of: means for adjusting a variable gain of each compensated signal to normalize a power level of a signal supplied to a corresponding ADC of the ADCs 28510, e.g., via the variable gain control 28508; means for adjusting a number of the ADCs 28510 to use during a particular operation; and/or means for selecting a dynamic range of each ADC 28510 dependent on a desired array interference rejection and angle resolution, e.g., via the baseband processor 28520.

In some aspects, the number of ADCs 28510 may be limited to a predetermined number or percent of the available ADCs 28510, e.g., not all of the ADCs 28510. The baseband processor 28520 may select the number of ADCs 28510 used. The baseband processor 28520 may, for example, enable all ADCs 28510 for control plane operations, desired and interferer direction finding, or channel sounding, among others. In some aspects, the baseband processor 28520 may limit the number of ADCs 28510 used to a subset of the available ADCs 28510, for example, in an active link.

Mathematically, the operations described above may be described using vectors, shown below. In particular, vectors s (antenna output) and v (ADC input) are composed of elements si, and vi, respectively, W (weightings) is a weighting matrix composed of wij elements, and G is a Toeplitz matrix composed of gi elements (variable gain control). The array size N may be chosen dependent on a desired array gain, interference rejection, and power budget.

$$s = [s_1, s_2, \ldots s_N] \quad W = \begin{bmatrix} w_{11} & w_{21} & \ldots & w_{N1} \\ w_{12} & w_{22} & & w_{N2} \\ \vdots & & \ddots & \vdots \\ w_{1N} & w_{2N} & \ldots & w_{NN} \end{bmatrix} \quad v = [v_1, v_2, v_N] \quad G = \begin{bmatrix} g_1 & 0 & \ldots & 0 \\ 0 & g_2 & & 0 \\ \vdots & & \ddots & \vdots \\ 0 & & \ldots & g_N \end{bmatrix}$$

$$w_{ii} \in \{-1,1\}$$

The ADC input v can be expressed as a matrix transformation of s:

$$v=sWG$$

The original antenna signals can be calculated from v:

$$s'=v\ \mathrm{pinv}(WG)$$

where piny is the pseudo inverse of the matrix. A quantized version of v may be available in the digital domain for use by the baseband processor to essentially invert the analog matrix transformation and permit processing of the original signal. In particular, the direction of the desired signal and the interferers can be found using s'. Various processes may be used to find the directions of the different signals. One example of such a process may be the MUSIC process. The use of analog summation before the ADCs permits the individual antenna element signals to be retained, while still providing spatial interference rejection to the ADCs.

In some aspects, the matrix transformation may remain static. This is to say that the weightings, which may be stored in a memory of the communication device, may remain the same, independent of the interference. In other aspects, the weightings may be dynamic and be dependent on the interference. In this case, sampling of the signal from the RF front end may be performed periodically and used to adjust the matrix coefficients. In some aspects, the baseband processor may determine which ADC has the lowest SNR, push the interferer onto a single ADC if possible, and weight the signals from the antenna elements accordingly.

With knowledge of the directions of the desired signal and the interfering signal(s), the baseband processor may select one or more paths to enable in order to increase or maximize SINR. FIG. 286 shows a simulation of a spatial response in accordance with some aspects. The spatial response may be for a 4-element linear array and use Hadamard weighting. In some aspects, after determination of the maximized SINR path, the baseband processor may disable the ADCs of unused paths to save power. As shown in this simulation, the desired direction is 0°.

FIG. 287 shows a simulation of BER in accordance with some aspects. In particular, FIG. 287 illustrates exemplary BER performance for the design shown in FIG. 285 vs. analog and digital beamforming structures for an 8-element array, 4-bit ADCs, 20 dB signal/interferer ratio, with 16-QAM modulation. The desired direction is 0°, similar to that shown in FIG. 286, and interference direction is 20°. As can be seen, the analog BER remains essentially constant, independent of the SNR per antenna, while the digital BER decreases steadily, eventually plateauing. The exemplary BER performance for the design shown in FIG. 285, however, matches the digital performance at low SNRs, and the BER rapidly decreases as the SNR increases in this example.

In some aspects, a matrix other than the Hadamard matrix may be used. FIG. 288 shows a simulation of interference rejection in accordance with some aspects. The simulations may be for an 8-element array and 4-bit ADCs with adaptive weight matrix W. FIG. 288 shows a simulation of interference rejection vs. azimuth angle for Hadamard weightings and an optimized codebook also constrained to weights in the set {−1, +1}. Both codebooks provide interference rejection greater than 12 dB at all angles. This may enable a reduction in the ADC quantization by two bits, thereby reducing the power consumption.

FIG. 289 illustrates a method 28900 of reducing quantizer dynamic range in a receiver in accordance with some aspects. The method 28900 may be performed by the RF front end 28502, multipliers 28504, combiners 28506, variable gain control 28508, ADCs 28510 and baseband processor 28520 shown in FIG. 285. At operation 28902, a plurality of beamformed signals may be received at the RF front end 28502 from a plurality of antenna elements of an antenna 28530. Each beamformed signal may include a desired signal and an interferer signal. The number of the ADCs 28510 to use may be adjusted dependent on channel conditions or signal type, among others.

At operation 28904, the interferer signal may be compensated for prior to quantizing the beamformed signal. The compensation may comprise combining a weighted copy of each of the beamformed signals at combiners 28506. The weightings may be defined by an invertible analog summation weight matrix whose weightings are fixed or may depend on conditions of the desired and interferer signal to maximize a signal quality such as SINR of the desired signal. In some aspects, the analog summation weight matrix may comprise a Hadamard matrix. In some aspects, each compensated signal may be provided to a different ADC. In some aspects, some or all of the compensated signals may be provided to the same ADC or ADCs 28510.

The compensated signals may then be quantized at the ADCs 28510 to form quantized signals at operation 28906. A variable gain of each compensated signal may be adjusted prior to quantization to normalize a power level of a signal supplied to a corresponding ADC of the ADCs 28510. Quantizing the compensated signals may include determining a direction of at least one of the desired and/or interfering signal or channel sounding.

The quantized signals may be supplied to a baseband processor 28520. The baseband processor 28520 may digitally reverse the compensation at operation 28908. The baseband processor 28520 may subsequently further process digital versions of the beamformed signals.

Some aspects of this disclosure relate generally to a loopback based time skew calibration for time interleaved analog-to-digital converter (ADC, collectively TI-ADC) that does not use external test equipment. The TI-ADC may be used in a radio-frequency transceiver.

The frequencies at which modern telecommunication devices operate may create difficulties with related hardware components. The ADC used to handle signals in such devices may exceed the ability of a single ADC. To address this, it may be possible to utilize a number of ADC circuits in separate channels that may be interleaved and sequentially triggered, being controlled by a common clock.

If the channel elements were all identical, then the components would all behave in the same way. However, real world components have some differences due to manufacturing processes, which in turn creates mismatches between the channels used in the TI-ADC and reduces the performance of the system, such as reducing the signal-to-noise ratio (SNR) and the spurious free dynamic range (SFDR). Different types of mismatches between the channels may appear, such as: 1) DC offset mismatch, 2) gain mismatch, 3) time skew mismatch, and 4) bandwidth mismatch. Some aspects of the present disclosure consider how to calibrate the time skew to deal with the time skew mismatch without using external Test Equipment (TE), for example, by utilizing a loopback scheme.

FIG. 290 is a block diagram of an example of a Time-Interleaved Analog to Digital Converter (TI-ADC) architecture 29000 that achieves a high-speed conversion using M parallel low speed ADC channels (three channels are shown for illustrative purposes, Channel A CH-A, Channel B CH-B, and Channel C CH-C). The TI-ADC may be the ADC circuitry 394 described above or it may comprise different configurations. An analog input 29010 may be provided to M different sample and hold circuits 29020A, 29020B, 29020C that may be sampled at three different phase times φ0, φ1, and φM−1, respectively, utilizing a common clock 29025. The sampled signals may be provided to analog-to-digital converters (ADCs) 29030A, 29030B, 29030C. The digital signals may then be combined with a multiplexer 29040 to produce a digital output signal 29050.

FIG. 291 is a timing diagram 29100 that illustrates how in some aspects all the channels may operate with a same sampling frequency FS (or its inverse TS, shown in the FIG.) with M uniformly spaced phases. Each phase's φ sample and hold lasts for a time TS (or mTS for the mth phase), and the overall sample time for all the phases is nMTS. Thus, the sample for TO begins at time T0, the sample for φ0 begins at time T0, and so on, with the cycle repeating at time Tn. The overall sampling frequency equals to MFS (which is 1/MTS).

FIG. 292 is a block diagram illustrating an example of a transceiver 29200 having a loopback design. A reference signal generator 29205 may produce a reference signal 29207 that may be, for example, a sinusoid or complex exponential signal, and that may be provided to an input of a single-sideband (SSB) generator 29210. The SSB generator 29210 may produce a quadrature output having 1 (in-phase) and Q (quadrature) components or sub-channels. These components may be provided to inputs of respective digital-to-analog converters (DACs) 292201, 29220Q. The DAC 292201, 29220Q outputs may be provided to respective inputs of an IQ modulator 29230 which provides the signal to a transmit path amplifier 29240 and then to a transmit (TX) path. In one aspect, amplifier 29240 may be an intermediate frequency (IF) amplifier.

The signal provided at the input of the transmit path amplifier 29240 may be connected to an output of a corresponding receive path amplifier 29260 via a loopback connection 29250, which directs the transmitted signal, including the reference signal 29207, into the receiver. In an alternate configuration, the loopback connection 29250 may be connected to an output of the transmit path amplifier 29240 and an input of the receive path amplifier 29260. In these configurations, the loopback connection 29250 is immediately adjacent to the amplifiers 29240, 29260. However, other placements for the loopback connection 29250 may be possible. For example, the loopback connection 29250 may be applied prior to the IQ modulator 29230 and the IQ demodulator 29270 and separate loopback lines may be used in this configuration.

The combined receive path and loopback signals may be provided to an IQ demodulator 29270 which breaks the signals down into the respective I and Q components. These signals may be provided to the inputs of respective sample and hold circuitry (example for Channel A shown) 29020A1, 29020AQ controlled by the clock 29025, as discussed with respect to FIG. 1, and then to the respective ADCs 29030A1, 29030AQ, and the resultant analog signals may be provided to phase estimators 292901, 29290Q for each signal to estimate the phase of the reference signal 29207. From this estimated phase, the time skew for the I and Q sub-channels $\tau_{Im}$, $\tau_{Qm}$ may be computed. Using the estimated time skew, the signal can be corrected by respective correction circuitry 292801, 29280Q that adjusts the signals produced by the clock 29025. This may permit calibration without using an extra ADC by using loopback for generating a calibration signal. If the device already has a phase shifter loopback for IQ imbalance calibration, in some aspects, it may not use any additional hardware to implement the calibration.

The following discussion provides, by way of example, an analysis that may be used in making the time skew determinations and corrections.

In the case of one ADC, the reference signal generator 29205 of the digital transmitter may be configured such that its output may be a sinusoid signal (a single DAC 29220 (e.g., one of 292201 or 29220Q may be sufficient)). The output of the mth ADC channel may be:

$$x_m[n]=s(nMT_s+mT_s+\tau_m)$$

where:

m: channel number $nMT_s$: sampling interval of the entire ADC (collective ADC channels)

$mT_s$: sampling interval of one channel $T_m$: time skew of the $m^{th}$ ADC channel s(t): analog signal input to the ADC In this case, s(t) for the reference signal (prior to splitting it into the channels) may be given by:

$$s(t)=A\sin(2\pi ft+\theta)$$

where:

f: sinusoid frequency

θ: phase of the sinusoid

A: unknown amplitude of the sinusoid

After splitting the reference signal 29207 into the channels, s(t) is replaced by s(nMTS+mtS+τm), thus, the output of the mth ADC channel may be:

$$x_m[n]=A\sin(2\pi f(nMT_s+mT_s+\Sigma_m)+\theta)=A\sin(wn+\theta[m])$$

where:

$w \triangleq 2\pi f T_s M$ $\theta[m] \triangleq 2\pi f T_s m+\theta+2\pi f\tau_m$ The phases θ[m] may be estimated (which permits derivation of the timing skews $f_m$) by:

$$\hat{\theta}[m]=\arg\left(\sum_{n=0}^{N-1}x_m[n]e^{-jwn}\right)$$

where N samples per ADC channel are assumed.

Applying linear detrending by subtracting 2πfTSm for the sake of simplicity, and using:

$$\varphi[m] \triangleq \theta[m]-2\pi f T_s m$$

Calculate $\varphi_{av}$ as the average of φ[m];

$$\hat{\varphi}_{av}=\frac{1}{M}\sum_{m=0}^{M-1}\hat{\varphi}[m]$$

Now calculate the time skew estimations:

$$\hat{\tau}_m=\frac{\hat{\varphi}[m]-\hat{\varphi}_{av}}{2\pi f}$$

Time-skew correction may be performed, for example, by digitally controlled delay lines that delay the signal at the input of each of the ADC channels, or by digital correction of the outputs of each of the ADC channels.

In the case of two ADCs (for I and Q channels), a complex exponential reference signal may be used, of the form:

$$s_I(t)=A_I\cos(2\pi ft+\theta), s_Q(t)=A_Q\sin(2\pi ft+\theta)$$

The procedure used may be as follows:

1. For each of the ADC channels, the phase of the received sinusoid/cosine may be estimated using the same approach as in the one ADC case.

2. All of the $\theta_I$ [m] estimation may be located on one line, and the $\theta_Q$ [m] estimation may be located on another line with an offset of π/2 radians to the $\theta_I$ [m] line. To correct for this, subtract π/2 radians from $\theta_I$ [m]. The results are denoted as $\theta_I$[m], $\theta_Q$ [m].

3. Apply linear detrending by subtracting 2πfTSm from $\theta_I$[m], $\theta_Q$ [m]

4. Calculate the average of all the phases.

5. Subtract the average phase from all the phases.

6. Convert the phase difference to skew by dividing by 2πf.

7. Perform the time skew correction.

FIG. 293 is a flowchart that illustrates components of a method 8000 described above. The transceiver 29200 is one example that may constitute a means to perform a method for operating a loopback-based time skew calibration circuit for a time-interleaved analog-to-digital converter (ADC), but the means are not limited thereto. In operation S29310, the reference signal may be generated on the transmit side, and in operation S29320, this reference signal may be communicated to the receiver side. In operation S29330, an estimated skew time may be calculated with the phase estimator based on the reference signal. Finally, in operation S29340, the clock timing of the S/H circuit may be corrected to compensate for the estimated time skew.

The time skew estimation and correction may be done in one shot, or may be done iteratively (depending on accuracy of the correction). With regard to a choice of frequency, in general, the higher the frequency, the better the quality of the estimate (since there may be a division by frequency when converting to skew). Put differently, for a given accuracy of measurement of the phase, dividing by a larger frequency will generally allow the time skew estimate to be more accurate. The measurements may be performed on multiple frequencies to improve accuracy of measurement. This method can, for example, be used during production of the device, at power up, periodically, or according to some predefined schedule or event.

The high frequencies at which modern telecommunication devices operate may create difficulties with related hardware components. The ADC used to handle signals in such devices may exceed the ability of a single ADC. To address this, it may be possible to utilize a number of slower (i.e., longer cycle time) ADC circuits in separate channels that may be interleaved and sequentially triggered, being controlled by a common clock.

If the channel elements were all identical, then the interleaved design would be simple, as the components would all behave in the same way. However, real world components have some differences due to manufacturing processes, which in turn creates mismatches between the channels used in the Time Interleaved (TI)-ADC and reduces the performance of the system, such as reducing the signal to noise ratio (SNR) and the spurious free dynamic range (SFDR). Four different types of mismatches between the channels may appear: 1) DC offset mismatch, 2) gain mismatch, 3) time skew mismatch, and 4) bandwidth mismatch. The present disclosure considers how to calibrate the gain to deal with the gain mismatch without using external Test Equipment (TE).

When using a TI-ADC, it may be desirable to perform calibration across the multiple individual ADCs. Higher modulation orders (such as 64-QAM, 256-QAM, and 1024-QAM) may use an effective number of bits (ENoB) of 9 bits at a 2640 MHz sample rate. In these situations, the desired performance may make calibration of the individual ADCs in the TI-ADC channels (also referred to as "slices") desirable, including gain calibration.

In a general sense, according to various configurations, the TI-ADC may be operated in modes such as: a normal operation, in which gain variances in the ADC channels/slices may be corrected, and a calibration mode, in which a known signal may be provided in the ADC channels/slices and a gain correction value may be computed to apply at a later time. Various reference voltages may be used to determine the gain correction values, and these values may be saved in various ways. The system may utilize a temperature reference that allows for gain correction values that may vary across temperature.

FIG. 294 is a block diagram of an example TI-ADC 29400. The TI-ADC 29400 may be ADC circuitry 394 as described above, but could also comprise different circuitry as well. A switch 29410 may be provided that switches between a device input signal 29405 during normal operation, and a voltage reference 29415 source during a calibration operation. The voltage reference 29415 could be any form of stable voltage reference, such as a band gap reference, a reference derived from on-chip resistors, and external reference, including supply by a battery or the like. The voltage reference 29415 may have a precise or imprecise absolute value, and it may maintain its voltage so that whatever voltage value may be provided to one ADC 29435 during calibration may be accurately provided to the others as well.

In either case, a switched signal (analog input) 29420 from the switch 29410 may be provided to a plurality of track and hold (T/H) circuits 29425 arranged in parallel via a linkage and operated in a cascaded manner. These circuits 29425 may be used to acquire the input signal 29405 at a particular time and hold the value steady for a part of the cycle to provide a stable input to the ADCs 29435. The T/H circuits 29425 could also be configured as sample and hold (S/H) circuits. In some aspects, a value may be collected and maintained at some controlled point in time. The term "track and hold," or "T/H circuit 29425" herein, includes sample and hold or S/H circuitry as well.

In one variation, the switch 29410 may be provided after the T/H circuits 29425. Although this may introduce some complexity in that the switch 29410 switches multiple channels, such a configuration allows an independent switching of each channel, and furthermore allows for calibrating out any kind of gain variations across the T/H circuits 29425.

The timing is illustrated in FIG. 295, which is a block diagram of an example of a TI-ADC 29400 architecture that achieves a high-speed conversion using M parallel low speed ADC channels (three channels may be shown for illustrative purposes, Channel A CH-A, Channel B CH-B, and Channel C CH-C). The analog input 29420 may be provided to M different track or sample and hold circuits 29425A, 29425B, 29425C that may be sampled at three different phase times φ0, φ1, and φM−1, respectively, utilizing a common clock signal 29480. The sampled signals may be provided to analog-to-digital converters (ADCs) 29435A, 29435B, 29435C, which may be, e.g., flash ADCs, sigma-delta ADCs, dual slope converter ADCs, and successive approximation converter ADCs, to name a few. The architecture described herein may be independent of the particular type of ADC device used. Digital output signals 29440 (FIG. 294) from the cascaded ADCs 29435 may then be combined with a multiplexer 29450 to produce a single-stream digital output signal 29455 (FIG. 294).

FIG. 296 is a timing diagram 29600 that illustrates how in an exemplary aspect all the channels operate with a same sampling frequency FS (or its inverse TS, shown in the FIG.) with M uniformly spaced phases. Each phase's φ sample and hold lasts for a time TS (or mTS for the mth phase), and the overall sample time for all the phases is nMTS. Thus, the sample for φ0 begins at time T0, the sample for φ0 begins at time T0, and so on, with the cycle repeating at time Tn. The overall sampling frequency equals to MFS (which is 1/MTS).

In normal operation, a controller 29475 (FIG. 294) sets the switch 29410 to select the normal input signal 29405. The controller 29475 also generates time-interleaved control signals via a linkage 29480 to each of the T/H circuits 29425 that may be connected via a linkage 29430 to corresponding ADCs 29435. The controller 29475 starts ADC cycles, with a subsequent selection of an appropriate ADC digital output signal 29440.

Returning to FIG. 294, following the multiplexer 29450, there may be a digital measure and correction (MC) unit 29460, which may operate in both the normal operation mode and the calibration mode. When operating in the normal operation mode, the MC unit 29460 may be used to apply, or support applying (e.g., by not adjusting when an analog adjustment is made prior to or within the ADC), corrective gain adjustment values to the output signal that may be dependent upon which ADC 29435 may be selected at the current time. It may then forward a gain-adjusted output signal 29495 to subsequent portions of the device.

When operating in the calibration mode, the MC unit 29460 may provide measurement signal related data 29470 to the controller 29475. Conversion of measurement data to gain values may be done by either the MC unit 29460 or the controller 29475. The MC unit 29460 may be viewed as an extension of the controller 29475. This collected data 29470 could, for example, be a gain offset, which would result in a multiplier being applied to the output of the respective ADC 29435. The gain adjustment values could also be provided by a look-up table (LUT) and/or utilize some other piecewise linear correction model, possibly including interpolation. The voltage reference 29415 may be set to different values to permit a multi-point calibration, which may flush out non-linearities. The voltage reference 29415 may provide a series of outputs or waveforms that may then be measured, which permits a construction of a more complex LUT. The gain offset and/or LUT values may be stored in the memory 29490 for subsequent use during the normal operation mode. Linear interpolation may be utilized to estimate gain values for voltages between those actually supplied by the voltage reference 29415. In one configuration, a direct loopback/feedback of the output signal 29472 may be utilized as the voltage reference. This may permit a transmission of a complex exponential function using a DAC (not shown). Therefore, the system could transmit a calibration waveform and then capture it. That could allow a sophisticated calibration, such as the multipoint calibration discussed above.

The controller 29475 thus may apply or support the application of (e.g., when the MC unit 29460 adjusts), a gain correction stored in a memory 29490 whose value depends on which ADC 29435 may be selected by the controller 29475. This correction could be in a simple form or a complex form. The complex form may include a linearity correction using, for example, stored polynomial coefficients. In an alternate implementation, correction for gain and offset could be achieved by directly setting analog or digital control signals 29482 input to the individual ADCs 29435.

Thus, in some aspects, in the calibration (built-in self-test (GIST)) mode, the controller 29475 sets the switch 29410 to input the voltage reference 29415 to the ADCs 29435 and to monitor the resulting output. The controller 29475 may generate a table of correction values stored in the memory 29490 for later adjustment during normal operation. The memory 29490 could be a set of registers or a more sophisticated static RAM device that stores the gain values, LUTs, or other related data. The controller 29475 may also monitor a temperature reference 29485 (e.g., thermometer), and re-run the calibration cycle if the temperature is sensed to have changed by more than a threshold amount. In another configuration, the memory 29490 may store multiple sets of gain values at different temperatures so that subsequent operation at a particular temperature does not employ re-calibration. In one configuration, the system may perform a linear interpolation of values between temperatures to derive a gain value at a temperature that has not been measured. In a further configuration, if an accurate relationship between temperature and gain values may be determined mathematically, then an equation could be applied to a gain value determined for one temperature during calibration when operating the device at a different temperature. In a further configuration, the temperature could be ignored, and a background calibration may be performed continuously when not in a receive mode (which may be a majority of the time).

In some aspects, the use of external test equipment may be avoided, and excess time during manufacturing may not be wasted. The gain calibration may be done at a device wakeup, periodically, or based on some other condition. An ongoing gain calibration may be particularly beneficial if the gain imperfection is time varying (e.g., due to a temperature variation).

In one implementation, an algorithm may be implemented that looks at average values of a waveform over a period of time of the ADC output. This algorithm may presume that an I/Q imbalance has been calibrated, as has a local oscillator (LO) leakage of the transmitter, and a DC offset of the receive path. The transmit path may be used to transmit a complex exponential waveform—this provides a continuous wave (CW) signal (e.g., a single RF frequency) after the I/Q modulator. A loopback may be provided from the transmit side to the receive side, and a signal power output of each ADC slice may be calculated separately. Then, an average power of all of the slices may be computed for both I and Q. The signal power of each slice may be divided by the average, and the square root of this ratio computed, which yields a gain error that should be corrected.

By way of example, if there are ten ADCs 29435, then the output values may be placed into, e.g., ten separate tables where each one is taking every tenth slice (offset in time). Then across each of the tables, an average power calculation is made. This provides an average power of a number of slices for a particular ADC 29435, and this provides a basis for the gain correction.

In order to compute the signal power of each slice, first the process collects N samples from each slice. N may be chosen such that N samples form an integer number of cycles of a sinusoidal signal being measured. For each slice, the values may be squared, summed, and then divided by N. Alternately, for each slice, the signal may be demodulated by multiplying the received signal by e2πjft, where f is the signal frequency and t is a sampling time for the ADC 29435. The demodulated signal may be summed and divided by N, which computes the magnitude squared.

The correction may be done in analog or in digital (after the ADC 29435). If the correction is done in the analog domain, a second round of calibration may be done to verify that the result is good, or to determine that additional modification is to occur. The analog correction could be provided by an analog control signal provided to the ADC 29435, using a closed loop system. This arrangement could be run for some period of time, adjusting the control input to the ADC 29435 until the measured power (the average power of that ADC 29435) is at the desired level. This may be sequentially performed to adjust the level for each ADC 29435.

FIG. 297 is a flowchart illustrating an example implementation of a process 29700 for applying the gain correction to the TI-ADC. The TI-ADC 29400 is one example that may constitute a means for operating a time-interleaved analog-to-digital converter (TI-ADC) with gain correction device, but the means are not limited thereto. In operation S29710, the TI-ADC may be set, e.g., by the controller 29475 to operate in a calibration mode, and a known signal may be applied to each of the ADC slices sequentially. In operation S29720, the output of the ADC slice may be measured by measure and correction unit 29460, and, in operation S29730, a gain correction may be stored in the memory 29490 for that ADC slice along with any other information relevant to the conditions under which it was collected. Once the gains for each ADC slice have been collected, in operation S29740, in a normal mode of operation, the saved gain adjustments may be applied by, e.g., the controller 29475, to the ADC that may be active in a particular slice of operation.

Utilizing various implementations of devices described herein may prevent having to perform calibration at the time of manufacturing or using test equipment to be provided in the field, allowing more frequent calibrations to be performed and ultimately resulting in a more accurate and reliable operation of the device.

Power amplifiers (PA) used for wireless transmissions typically have linear characteristics over a limited range of their transmission power capability. A true linear PA would produce an output signal (amplitude and phase) that is proportional only to the input signal and the gain of the PA (e.g., no amplitude or phase distortion that depends on the level of the input signal). A practical PA produces the wanted output signal (proportional to the input signal and the gain of the PA) and other non-wanted signal that may be produced due to PA non-linearity. These non-wanted signals are called intermodulation products (IM). These IM signals cause intermodulation distortion (IMD) that degrades the quality of the signal at the PA output. The non-linear behavior of the PA can be modeled and presented in few ways: a polynomial PA model, a look up table (LUT) that describes the PA input to output behavior, Volterra series for PA model with memory (in which a current PA output depends on a current PA input and also previous input signals).

FIG. 298 illustrates an example of a PA characteristic curve of AM/AM (input amplitude VS. output amplitude) and FIG. 299 is an example of a PA characteristic curve of AM/PM (input amplitude VS. output phase variation) with the following applicable equations:

$$S_{PA\_IN}(t)=A(t)\cdot\cos(\omega_c\cdot t+\varphi(t))$$

$$S_{PA\_OUT}(t)=f_1\{A(t)\}\cdot\cos(\omega_c\cdot t+\phi(t)+f_2\{A(t)\})$$

$A(t)$–signal envelope $\phi(t)$–signal phase $f_1\{\ \}$–*AM|AM* function $f_2\{\ \}$–*AM/PM* function It may be possible, however, to extend the linear range of the PA, producing linear amplitude and phase, by applying what is known as digital pre-distortion (DPD) prior to transmission. The DPD applies the PA a signal such that the PA output would (ideally) have only the wanted signal at its output with IMD. For example, if the PA is modeled using an AM/AM and AM/PM polynomials, the DPD followed by a PA would produce an equivalent AM/AM and AM/PM which may be close to an ideal PA. As can be seen by the dashed line in FIG. 298, the application of DPD can produce a linear gain right up to the saturation output power PSAT. In order to perform the calculation and correction by the DPD, a model of the PA may be provided. The better the model, the better the DPD correction may be applied. The PA characteristics depend on PVT-f (process, voltage, temperature and operation frequency), and the PA model may be updated in real-time or based on real-time information. In order to do this, a feedback and a sensing of the PA output may be used, as may be a feeding of the data to the digital domain. In a feedback-based design, information related to the amplifier characteristic may be fed back to the DPD so that the DPD can make the proper corrections to the signal.

A phased array system, which may utilize many PAs with many antennas, allows a beam of radio waves to be electronically steered without physically moving the antennas. In these systems, it may be impractical or costly to provide a feedback signal for each amplifier.

FIG. 300 is a block diagram of an example of a gain model 30000 for a portion of a phased array transmitter. A radio frequency (RF) signal may be received at a phased array transmission power splitter 30010 which splits the signal into a plurality of channels CHANx that may each comprise independent components (e.g., amplifier, switch, antenna). These components may be not all identical due to manufacturing variances, and thus their performance varies (over PVT-f). FIG. 300 breaks out a number of sources of variance, which may include a gain GTXn 30020 (which could be an actual gain or an attenuation if the gain factor is less than one) for the circuitry between the splitter 30010 and a PA, a gain GPAn 30022 of the PA itself to the applied signal power PTXn, a gain of the switch GSWn 30024 to the applied signal power PPAn, a gain of the antenna trace Gtracen 30026 to the applied signal power PSWn, and a gain of the antenna GANTn 30028 to the applied signal power Ptracen. Two issues might, for example, affect the IM at the output of each PA. The first is the specific characterization (for example: the AM/AM and AM/PM curves) and the second is the specific input power to each PA (for example: assuming that we have identical PA, but one of them may be handling very high input level at its input (compared to the other PAs)—this PA would produce the dominant IM). A third issue is that the loss after the PAs (lines and antenna gains) might also affect the total power and IM.

Collectively, in each channel, the power may be represented by:

$$P_{chan} = P_{desired} + \sum_n IM_n$$

where:

$P_{desired}$ is the desired output signal,

IM is the intermodulation distortion power for a given source, and n is the number of the source The phased array transmitter generates a single main beam that reaches the other side of the communication link. PTX represents this signal. For all the channels together, the transmitted power is:

$$P_{TX} = \sum_K\left(P_{desired_K} + \sum_n IM_{n_K}\right)$$

or $$P_{TX} = \sum_K P_{chan_K}$$

The value PTX from the transmit power equation 30050 represents the total power output from the phased array antennas of the transmitter device, including the desired component Pdesired from the linear portion of the PA, and the undesired intermodulation components:

$$P_{IM} = \sum_K\sum_n IM_{n_K}$$

where $P_{IM}$ is the total undesired intermodulation component power.

These values may be determined by an external transceiver (ET) that receives a transmitted signal by a transmitter portion of the present transceiver. Conversely, these values may be determined by the present phased array transceiver for a signal received from an external phased array transceiver (EPAT). The external transceiver does not have to be a phased array transceiver. It may be able to receive a signal from the present phased array transceiver and send back the non-linearity data. The external transceiver may be implemented as a phased array transceiver, a multi-sector transceiver, or an Omni directional transceiver, for example.

FIG. 301 is a block diagram of an example of a switchable transceiver portion 30100 that the transmitter model described above may represent. Here it can be seen that an RF transmission signal 30115 from other portions of the transceiver portion 30100 may be fed into the transmission power splitter 30110 (which may be an example of the transmission power splitter B4-110 modeled in FIG. 300) provides a split portion of the signal into a phase shifter 30130 that permits control of the phased array beam. This may be provided as an input to the PA 30140. The signal may be amplified by the PA 30140 and the output signal TXOUT passed through a switch(es) SW 30150, which, in FIG. 301 is in a transmit position, connecting it to one of the antennas 30160 in a phased antenna array 30165. The total transmit power PTX from the equation 8750 above is shown being output from the antenna array 30165.

The receive components in the transceiver portion 30100 may comprise, in each of the channels, a low noise amplifier 30170 that provides a signal to phase shifter 30180 that permits control of the phased array beam. The collective outputs may be combined by a receive power combiner 30120, and the combined RF received signal 30125 may be provided to other receiver components of the transceiver portion 30100. FIG. 301 also shows the loopback signal containing non-linearity data 30190 for the transceiver portion 30100 being provided at an input of the antenna array 30165.

FIG. 302 is essentially a replica transceiver portion 30100' of the transceiver portion 30100 shown in FIG. 301, but with the switches 30150 thrown in a receive configuration. When the switches 30150 are in the RXIN position, the transceiver is operating in a receive mode, and the signal received from the antenna 30160 is directed through the low noise amplifier 30170 to the receive power combiner 30120. When the switches 30150 are in the TXOUT position, the transceiver is operating in a transmit mode, and the signal from the TX power splitter 30110 is directed through the power amplifier 30140 to the antenna 30160. The description and operation of the components is not repeated here.

FIGS. 303A and 303B are parts of a block diagram of an overall transceiver 30300 example that may contain a transceiver portion, such as the transceiver portion 30100 described above. Additionally, other components of the RF receiver 30310 portion are shown, including an RF amplifier 30312 that receives the combined signal from the receive power combiner 30120, for example as described above, and a demodulator 30314 that utilizes a signal produced by a local oscillator generator (e.g., RF synthesizer) 30340 that may be amplified or otherwise conditioned by component 30316. The demodulated signal may then be provided to an intermediate frequency (IF) amplifier 30332 before being provided to a triplexer and switch 30345 where it may be transmitted to other parts of the transceiver 30300 over a connection, for example, a coax cable 30350.

A corresponding transmit portion of the transceiver 30300 may be provided as well. A signal to be transmitted may be provided over the connection 30350 and provided to an IF amplifier 30334 whose output may be provided to an RF transmitter 30320 portion. The RF transmitter 30320 portion may comprise an RF modulation mixer what utilizes a signal produced by the local oscillator generator 30340 and possibly amplified by an amplifier 30326, and the modulated RF signal may ben be provided to an RF amplifier 30322 before being sent to the transmission power splitter 30110, where the signal may ultimately be transmitted as described above, for example.

FIG. 303B is a block diagram illustrating another portion of the transceiver 30300. On the receive side, a received signal that has been demodulated down to the IF may be received via the connection 30350 and a triplexer and switch 30355. In an IF receiver 30360 portion, the IF signal may be provided to an IF amplifier 30362. Although not expressly illustrated in the drawings, the system may be designed to handle quadrature encoded signals, and the two paths shown in the IF receiver 30360 portion and an IF transmitter 30370 portion may represent an in-phase component I and a quadrature component Q of the signal, with separate paths provided for each. An IF demodulator 30364, may be provided to produce analog I/Q components of the baseband signal. This IF demodulator 30364 may receive a signal produced by, for example, a crystal oscillator 30384 and an IF synthesizer 30382. A divider 30380 may be fed by a signal coming from the frequency synthesizer 30382 and produces a reference signal to the RFEM, passed over the COAX cable. For example, if the absolute frequency accuracy is to be +/−20 ppm (part per million), then an external quartz crystal (and internal crystal oscillator) can be used that has frequency accuracy of +/−20 ppm. All frequency generation blocks may be fed by this frequency or a multiplication/division of this frequency. A low-pass filter 30366 and analog-to-digital converter (ADC) 30368 may be provided to supply a baseband (BB) signal to the BB processor 30390 for each of the I/Q components. The BB processor 30390 will be discussed in more detail below.

On the transmit side, a baseband digital signal produced by the BB processor 30390 may be provided to the IF transmitter 30370 portion, which may include I/Q portions having a digital-to-analog converter 30378, a low-pass filter 30376, and IF modulator 30374. The I/Q signal may be provided to an IF amplifier 30372 and the IF signal may be sent over the connection 30350 via the triplexer and switch 30355. Although FIGS. 303A and 303B show the connection 30350 separating units between portions of the IF stage, it may be also possible to separate the units between portions of the RF stage as well (or to not separate the units at all).

In order to better describe the components of the BB processor 30390, FIG. 304 is briefly discussed initially. FIG. 304 is a block diagram showing the phased array transceiver 30300 that is in communication with an external phased array transceiver (EPAT) 30300' (e.g., one combination would be a hand-held device and a 5G base-station or other types of base stations). Each of these transceivers 30300, 30300' may operate similarly and may determine the respective power transmission from the power equation 30050, 30050' characteristic of transmissions from the other respective transceiver (which may, for example, be true in a case in which it may be desirable to optimize the mobile device with DPD while the base station is using DPD or would rely on a different calibration of its DPD), and communicate respective non-linearity data 30190, 30190' based on the received transmission. Although FIG. 304 shows the external phased array transceiver 30300' as being a phased array transceiver, there is no requirement that it be a phased array transceiver, e.g., it could just be a normal external transceiver (ET). The transceiver, e.g., transceiver 30300', may be able to interpret the signal sent from the phased array transceiver 30300 and respond with the relevant non-linearity data 30190.

Returning to FIG. 303B, the BB processor 30390 may comprise a modem 30392 in which the digital pre-distortion (DPD) processor 30394 may reside. The DPD may be used to apply a distortion that may be an inverse of the overall transmitter amplifier characteristic curve so that the overall transmitter amplifier may operate in a more linear manner up to the power saturation PSAT point.

The control of the DPD 30394 may be provided by an internal non-linearity processor 30396, which may receive the non-linearity data 30190 sent by the ET 30300'. In one example configuration, the non-linearity data 30190 may be represented by polynomial coefficients describing the inverse curve of the power transmission characteristic curve PTX 30050. Given the nature of the sources of non-linearity, a polynomial of the fifth order has proven adequate to accurately reflect the power transmission characteristic curve PTX 30050 or its inverse in some aspects. In a further example, the non-linearity data 30190 may be represented by a look-up table (LUT) that maps the inverse characteristic. The internal non-linearity processor 30396 may process the received non-linearity data 30190 and transform it into control parameters that may be used to control the DPD 30394.

The external non-linearity processor 30398 takes the power transmission characteristic curve PTX 30050' of the EPAT 30300' and determines the non-linearity data 30190' that may be to be sent to the EPAT 30300'. Although FIG. 303B shows this non-linearity data 30190' being combined with other data and sent through the DPD 30394, it may not be necessary that this information be transmitted to the EPAT 30300' using the DPD 30394, and the transmission could occur without using the DPD 30394.

The following describes two exemplary aspects. The first is presented in FIG. 305, which is a flowchart illustrating an example of a process 30500 that may be used by the transceiver 30300, and shows a sequence in which the phased array transmitter transmits a signal (possibly using an initial DPD setting (which may be factory predefined)) that includes a level of IM that allows reception at the other side (may be a low constellation, due to low EVM) and that does not violate applicable regulations. After the other side has evaluated and sent back the non-linearity information, the DDP may be operated with close to optimal conditions and transmit higher output power and/or high data throughput (a higher constellation).

In operation S30510, a transmission signal may be split into the transmission channels, such as those described above. Then, in operation S30520, the signals may then be transmitted from the antennas in each of the phased array antennas. In operation S30530, non-linearity data, such as that described above, may be received that contains an inverse of a characteristic curve for the summed outputs of the phased array antennas. In operation S30540, this non-linearity data may be translated into control signals for a digital pre-distortion processor, such as one described above, which modifies the output signal. Finally, in operation S30550, the DPD processor modified data may be transmitted by the transceiver.

The second exemplary way is presented in FIG. 306 showing a sequence, having similarities with that of FIG. 305, to generate a data base (e.g., a look-up table) that may allow setting correct (and close to optimal) DPD settings at the very beginning of a transmission. The similarities with FIG. 305 are not repeated here. The data base can be gathered in operation S30638 over time from each operation (e.g., different receivers may be used—this does not affect the TX side to be linearized) and utilize feedback in operation S30635 received from the other side. This may improve the accuracy and span of use cases of the transmitter DPD.

Operation conditions may include operation S30633: transmission frequency, active TX chains, output power level (from a power detector on the RFEM, or at an output of each chain), temperature sensor (in the RFEM), voltage sensor (in the RFEM), and the like. The operation of the LUT may optionally be combined with real-time feedback from the other side. Also, a predefined "hand shake" (e.g., a preamble or data sequence) may be utilized that would allow fast and accurate extraction of the DPD data. In operation S9340, the system may translate the non-linearity data and/or the operation conditions into DPD control data.

Radio frequency receivers in modern communications devices may typically be configured to handle a significant range of input power levels. For this, a receiving amplifier may comprise a number of AGC gain settings that may amplify incoming signals of varying strength. Choosing a particular amplifying AGC gain setting to improve or maximize performance may be difficult. The large range of input power levels may be handled by the receiver by changing the level of amplification as a function of the input signal level. Low input level signals may use high amplification in order to provide a usable noise figure (NF) while high input signal levels may use a low level of amplification in order to prevent compression of the receiver.

FIGS. 307A and 307B are parts of a block diagram of an example of an overall distributed phased array transceiver system 30700, although the concepts described herein are not limited to this particular type of transceiver. Such a transceiver system may relate to radio chain circuitry 372, as described above, but could also relate to different circuitry as well. Reception signals RXIN coming through the phased array antennas 30702 may be received by amplifiers 30703, and the amplified signal may be sent to a receive power combiner 30705. An RF amplifier 30712 may be provided that receives the combined signal from the receive power combiner 30120, for example as described above, and a demodulator 30714 that utilizes a signal produced by a local oscillator generator (e.g., RF synthesizer) 30740 that may be amplified or otherwise conditioned by component 30716. The demodulated signal may then be provided to an intermediate frequency (IF) amplifier 30732 before being provided to a triplexer and switch 30745 where it may be transmitted to other parts of the transceiver system 30700 over a connection 30750, for example, a coax cable.

A corresponding transmit portion of the transceiver 30700 may be provided as well. A signal to be transmitted may be provided over the connection 30750 and provided to an IF amplifier 30734 whose output may be provided to an RF transmitter 30720 portion. The RF transmitter 30720 portion may comprise an RF modulation mixer what utilizes a signal produced by the local oscillator generator 30740 and possibly amplified by an amplifier 30726, and the modulated RF signal may be provided to an RF amplifier 30722 before being sent to the transmission power splitter 30706. The RF transmission signal may be fed into the transmission power splitter 30706, which provides a split portion of the signal into a 30704. The split portions of the signal may be provided into an input to the PAs 30707, where the signal may be amplified and the output signal TXOUT may be provided to the phased array antennas 30702.

FIG. 307B is a block diagram illustrating another portion of the transceiver system 30700. On the receive side, a received signal that has been demodulated down to the IF may be received via the connection 30750 and a triplexer and switch 30755. In an IF receiver 30760 portion, the IF signal may be provided to an IF amplifier 30762. Although this is not expressly illustrated in the drawings, the system 30700 may be designed to handle quadrature encoded signals, and the two paths shown in the IF receiver 30760 portion and an IF transmitter 30770 portion may represent an in-phase component I and a quadrature component Q of the signal, with separate paths provided for each. An IF demodulator 30764, may be provided to produce analog I/Q components of the baseband signal. This IF demodulator 30764 may receive a signal produced by, for example, a crystal oscillator 30784 and an IF synthesizer 30782. A low-pass filter 30766 and analog-to-digital converter (ADC) 30768 may be provided to supply a baseband (BB) signal to the BB processor 30790 for each of the I/Q components, where the BB processor 30790 may comprise a modem 30792, which may be used to control the RF AGC gain settings.

On the transmit side, a baseband digital signal produced by the BB processor 30790 may be provided to the IF transmitter 30770 portion, which may include I/Q portions having a digital-to-analog converter 30778, a low-pass filter 30776, and IF modulator 30774. The I/Q signal may be provided to an IF amplifier 30772 and the IF signal may be sent over the connection 30750 via the triplexer and switch 30755. Although FIGS. 307A and 307B show the connection 30750 separating units between portions of the IF AGC gain setting, it may also be possible to separate the units between portions of the RF AGC gain setting as well (or to not separate the units at all). A frequency divider DIV 30780 may be provided after the synthesizer 30782.

FIG. 308 is a block diagram of receiver 30800, which may be an example of or include an amplifier 30703 discussed above, or could be a combination of the amplifiers in the system, each having their own gain AGC gain setting(s). The amplifier may comprise or have associated with it a switch 30810 that determines a received signal, for example, an RXIN RF signal strength, and based on that determination, selects an appropriate gain setting using a control from the automatic gain control (AGC) gain setting 30820 in order to provide a relatively constant input signal for processing to the rest of the receiver circuitry.

The switch 30810 may, for example, comprise a processor 30812, memory 30814, and logic (possibly residing as program instructions residing in the memory 30814 and/or hardware logic of the circuit) for determining which AGC gain setting 30820 should operate at a given power input level, and for performing power and EVM measurements and implementing the dithering operation mode described in more detail below. The switch 30810 may include any hardware or software mechanism that implements the AGC algorithm. Also, although for the sake of simplicity, the switch 30810 has been shown as a single element, the switch 30810 need not be a single device or operate on a single part of the signal (received RF signal, IF signal, baseband signal in the modem, etc.), but could be multiple devices that deal with a respective part of the signal.

An improved AGC gain setting 30820 is one that produces a better signal quality measure (SQM) at a given power level. One SQM is the error vector magnitude (EVM), which, in a quadrature encoded signal, is a measure of how far points in a constellation map are from their ideal locations.

The AGC gain settings 30820 illustrated in FIG. 308 represent a logical construction of different levels of gain and not necessarily a physical construction of separate gain amplifiers. For example, physical gain elements may be chained together or activated in series to achieve a next level of gain, such that the AGC gain setting 2 could use elements from the AGC gain setting 1. However, there could also or additionally be separate physical AGC gain setting components to execute one or more of the AGC gain settings.

FIG. 309 is a graph 30900 that plots, for a given AGC gain setting of 30820, an EVM versus the received power RX PIN. As illustrated in FIG. 309, a high EVM may be due to (among other things) two causes of interest. The first cause may be a signal-to-noise ratio (SNR), where the noise is thermal noise generated by the receiver blocks. At low RX Pin, the thermal noise may be dominant and the AGC gain setting sets the RX gain to high levels of gain in order to minimize the RX NF (e.g., minimize the RX thermal noise). At these low level of RX Pin, the thermal noise may be more prominent relative to the signal, resulting in a lower SNR, thus higher EVM.

The second cause may be an intermodulation distortion that results from non-linearities present in the receiver when handling high levels of input signal. As the signal at the input of the receiver is higher, it behaves in a more non-linear manner, creating a higher EVM, in order to lower the level of intermodulation distortion (IMD) in the receiver and improve the linearity to lower the gain of the receiver, thus degrade the NF (higher thermal noise). FIG. 309 illustrates the effect of both the SNR and the IMD on the overall EVM, and shows a "sweet-spot" or operation range that serves to minimize the overall EVM. This curve may vary based on various curve-shifting factors, including a channel or operating frequency, including supply voltage, process variations due to manufacturing variations, and operating temperature of the device.

The received power may be determined by a power level detector in the modem 30792 (FIG. 307B) or it could be determined by other power level detectors located along the receive chain, including anywhere from the antenna itself, the RF processing, the IF processing, and the baseband processing.

FIG. 310 is a graph 31000 similar to that shown in FIG. 309, but that includes the EVM vs. receive power curve for a number of the AGC gain settings, where the AGC gain settings have degree of overlap with each other. Although the EVM curves overlap for each received input power level, there may be an optimal AGC gain setting that minimizes the EVM for a particular received power level. In order for the system to maintain the best possible EVM, the system may switch between gain settings by selecting the appropriate switch at optimal threshold values (POPT_TH) as illustrated in FIG. 311.

FIG. 311 is a graph 31100 illustrating optimal threshold values POPT_TH for activating a particular AGC gain setting. In order to determine the optimum threshold values POPT_TH for a power input, the system may take measurements from the different AGC gain settings of the receiver (which may be tied to different measured temperatures) to provide optimum gain set-points that minimize EVM at all receive power points for the receiver AGC gain settings. As the curve shapes shift during operation, based on the curve-shifting factors described above, the optimal threshold values POPT_TH may shift as well, for example, in the graph 31100, from POPT_TH1_OLD to POPT_TH1. If the optimal threshold value POPT_TH has shifted, but the switchover threshold value has remained the same (e.g., remained at POPT_TH1_OLD), a sub-optimal switching will occur, introducing a higher EVM into the signal with the ultimate result being a degraded signal that may not support a desired throughput.

FIG. 312 is a flowchart illustrating an exemplary method 31200 that may be utilized to determine the optimal threshold values POPT_TH. The transceiver 30700 is one example that may constitute a means for operating a gain control device for a receiver, that may comprise in a dithering operation mode receiving a first input signal at a first signal power level, separately applying, using a switch, a first and second AGC gain setting to the input signal and respectively measuring a first and second signal quality measure (SQM) for the first and second AGC gain settings, and determining and storing an optimal threshold value representing a power level used to switch between using the first AGC gain setting and the second AGC gain setting based on the first and second SQMs, in a normal operation mode determining whether to use the first or second AGC gain setting for a second input signal at the first signal power level based on the optimal threshold value, but the means are not limited thereto. In operation S31210, an input signal may be received and its power may be determined. In operation S31220, a dithering operation may be initiated based on a pre-defined condition, such as the expiration of a time that may be invoked periodically, or according to some form of signal provided. Such a trigger might be a change of operation conditions, such as: frequency change by moving to a new channel, temperature or voltage change. The dithering operation allows different AGC gain settings to be used for a given receive power level, and the EVM may be measured, possibly along with a current operating temperature. The dithering operation may select an AGC gain setting on either side of the indicated AGC gain setting for a given power level, and this selection may, for example, occur randomly or according to some predefined pattern. Thus, the measurement of the EVM and/or the dithering operation does not have to occur with every received frame, but could be done less frequently, or even rarely, to minimize interference with normal operation. In operation S31230, the EVM, and optionally the temperature or other factors that may influence the shape and position of the curve, may be measured, and the value may be stored. EVM may be measured, for example, in the modem 30792, but may be measured at other places in the digital domain as well.

In operation S31240, a determination may be made to determine the optimal threshold values POPT_TH. This may be done by comparing a current EVM value at a particular power level that has been the subject of a dithering operation (e.g., an AGC gain setting adjacent to one normally used at that power level), with a stored EVM value at that power level normally used. If the EVM value from the dithered operation is lower, then the threshold may be adjusted so that, in operation S31250, in subsequent normal (non-dithered) operation, the updated threshold value may be used. The amount of adjustment or the setting of the threshold may be a factor of the difference in EVM values.

By way of example, and referring to FIG. 311, an input power at a power PD may be received. For the sake of the example, an original threshold POPT_TH1_OLD is to the right of PD, meaning that AGC gain setting #1 should be used. However, what may actually be measured in the dithered operation (which dithers to use AGC gain setting #2, even though AGC gain setting #1 would be indicated in normal operation) is what is shown in FIG. 311. As illustrated, the EVM value for the AGC gain setting #2 operation may be lower than that for the AGC gain setting #1 operation. Therefore, the system determines that it should move the threshold point POPT_TH1 to the left so that it occupies the point shown in FIG. 311. Thus, in a subsequent normal mode operation, AGC gain setting #2 will be used at power level PD instead of AGC gain setting #1. The difference in EVM values for the two different AGC gain settings may dictate how far to move the threshold point POPT_TH1. Additionally, some knowledge about the shape of the power vs. EVM or SQM curves may be utilized to more accurately determine the threshold point POPT_TH1.

Measured values of AGC gain setting, gain, EVM, temperature, and other values or parameters associated with the measured values and thresholds may be stored in memory, such as in an LUT, for subsequent use. If the EVM at a current operating temperature or other parameter has been previously determined, then that value may be used in a normal (non-dithering) operation mode. If not, then an interpolation may be performed between two temperatures or other parameters that were previously captured.

FIG. 313 is a block schematic diagram of a radio frequency (RF) phased array system 31300 illustrating a configuration for a first method of operation. The system may incorporate parallel receive circuitry 382 and/or one or more of combined receive circuitry 384, as described above, or may incorporate other forms of receive circuitry. A plurality of antennas 31310 each have their signal processed by an RF phase shifter 31320 as well as a variable gain amplifier (VGA) 31330 that may be used to adjust each transmitted (or received) signal. These transmitted signals may be split by a splitter 31340 (or received signals may be combined by a combiner 31340). This may be a form of phased array systems. One of the system's 31300 benefits may be simplicity, since only one mixer 31350 and baseband chain that include a sample or track and hold device 31360 and an analog to digital converter (ADC) 31370 may be used. The system 31300 may have one or more of the following characteristics: a) lack of scalability (adding several paths at RF frequencies forms a bandwidth bottleneck), b) added noise figure in the receiver (since noisy phase arrays and VGAs may be added nearer to the antenna), and c) added power consumption (two blocks that enable phase array systems operate at millimeter wave frequencies).

FIG. 314 is a block schematic diagram illustrating another topology of a phased array radio transceiver that may be referred to as a local oscillator (LO) phased array system 31400 (refer to FIG. 313 for a description of the individual components). In this topology, the LO phased array system 31400 still relies on a VGA 31330 in the signal path, but the phase shifter 31320 may be transferred to the LO path. The benefit of this topology over an RF phased array system 31300 as shown in FIG. 313 may be reduced noise. Another characteristic may be that several mixers 31350 and LO phase shifters 31320 may be used (one for each antenna 31310). Routing LO signals operating at millimeter wave frequencies may be difficult, which is why this approach may be considered to be non-scalable in some cases. LO phased array systems 31400, however, may be more promising with all-digital PLLs (ADPLLs), since the phase shifting can be accomplished digitally within the ADPLL loop. This eliminates use of RF phase shifters (which may be costly in terms of power consumption and introduce distortion and insertion loss in the signal path). Phase shifting within the ADPLL also mitigates LO distribution for large phased-array systems.

FIG. 315 is a block schematic diagram illustrating a third alternative to phased array radio transceiver design and may be referred to as a digital phased array system 31500. In this topology, the entire transceiver chain may be replicated for each antenna 31310, including the sample or track and hold device 31360 and ADCs 31370. The phased array combination may be performed in the digital domain. Its characteristics may include increased complexity (chip area) and power consumption. Its increased power consumption comes not only from the transceiver block, but also the digital backend where the phased array combination occurs. One main benefit, however, may be its ability to support multiple users simultaneously, with each user taking the advantage of the full antenna array gain. This support, however, may come at a cost of using a dedicated digital combination path for each user.

In all the above phased-arraying strategies (phased array system 31300, LO phased array system 31400, and digital phased array system 31500), there may be a recombination point (combination node/combiner 31340) where the sum of all the phased-array receivers (or transmitters) may be combined with different amplitude weights and/or phase shifts. This combination node 31340 may be often a bottleneck in phased-array receivers in terms of performance and complexity. If a different size of phased-array is desired, this combination node 31340 may be redesigned, significantly increasing the design complexity. This aspect of phased-array design may be a major obstacle to the scalability of phased-arrays.

In some aspects of this disclosure, a scalable phased array radio transceiver architecture (SPARTA) that scales well with size is provided. This may greatly aid in reusability of this architecture for multiple applications and products, reducing time-to-market. The proposed architecture may also be self-configurable, easing the programmability of the device. In addition to supporting conventional modes of operation, the SPARTA may also be capable of supporting new modes of operation that enable better phased array gain or low power consumption, as described below.

FIG. 316 is a block diagram of an example cell element 31600 of the SPARTA array. As this figure shows, the SPARTA array cell element 31600 may comprise a transmitter (TX) 31610, receiver (RX) 31620, local oscillator (LO) 31630, and digital block (DIG) 31640. A set of multiplexers and de-multiplexers 31650 may be tiled on the four edges of the SPARTA array cell element 31600 to allow communication with adjacent cells. This cell element 31600 is one example that may constitute a means for operating a phased array radio transceiver, that may comprise transmitting and receiving a signal with a plurality of tiled and interconnected transceiver cells, but the means are not limited to this process.

There may be both analog and digital parallel buses 31660 that connect the SPARTA array cell 31600 to neighboring cells allowing tiling of the cells. Note that the TX 31610 and RX 31620 can have either single or multiple receivers and transmitters, allowing multiple RX and TX cells to share a single LO 31630 (to save power consumption). A crystal oscillator (XO) signal may be buffered between all cells. A loop back may be used to measure and calibrate out delay introduced by the XO buffers in each cell element 31600. Each cell element 31600 may also have control signals that connect it to neighboring cells as well as global control signals that may be static. The SPARTA array cell element 31600 may further comprise an I/O and phase combining unit 31670 that also includes analog and digital coefficient sets and pipeline elements. Location connection ports 31680, discussed below, may also be provided.

FIG. 317 is a block diagram illustrating a tiled SPARTA array of cells 31700. As the figure shows, the array 31700 of identical cells 10300 are shown. This means that the cells 31600 (die) may be copy exact. The communication between the cell elements 31600 comprises analog and digital buses 31660. The width of the buses 31660 may be equal to the number of simultaneous users that the phased-array system can support (discussed below). Each SPARTA array cell element 31600 may be connected to only adjacent cell elements. This can help provide the scalability of the proposed approach.

In some aspects, this proposed architecture advantageously enables dicing of the wafer into different shapes for different applications. FIGS. 318 and 319 are pictorial diagrams of wafer dicing. FIG. 318 illustrates a wafer 31800 with diced portions 31810 of the SPARTA cell elements 31600 for low-power applications, and FIG. 319 illustrates a wafer 31900 with a diced portion 30910 of the SPARTA elements for high-performance applications.

As FIG. 318 shows, a different number of elements may be diced for varying system level requirements. In some low-power applications, only four SPARTA elements may be used, for example. In high performance systems, such as base stations, the entire wafer may be used, as shown in FIG. 319, for example. In other words, the same wafer can be filled with different form factors and product skews while having copy-exact wafers processed. The level of wafer integration to reduce packaging cost may be balanced with a yield resulting from a larger die area, resulting in a maximum array size for a maximum yield.

FIG. 320 is a pictorial illustration of a combined 32000 SPARTA array 32010 that may be wafer processed and combined 32000 with an antenna array 32020. With this processing step, an antenna array 32020 layer can simply be meshed to provide a full system solution.

The proposed phased array system may also have a self-aware configurable structure, described as follows. Identification numbers (IDs) may be determined at power up by an ID assignment routine. This enables the system to know how many SPARTA array cell elements 31600 are used in the array 31700. The four sides of the chip may be referred to as north (N), south (S), west (W) and east (E). In one example identification scheme, illustrated by FIG. 317, the ID #1 may be assigned to the NW corner cell element 31600. The NW corner may be determined by location connection ports 31680 that can detect whether the port may be open or connected with another port. For example, if both the N and W ports are open, ID #1 may be assigned to that cell element 31600. That cell element 31600 then initiates a sequential numbering sequence, where the ID number may be incremented by one and passed to the east cell element 31600.

If the current cell element 31600 has no E port connection and it received its ID number from the west cell element 31600 (e.g., cell #4), then it passes the ID number to the south cell element 31600 (illustrated by #5). If the current cell element 31600 has no E port connection and it received its ID number from the north cell element 31600, then it passes the ID number to the west cell element 31600 (if connected, otherwise it also passes the ID number to the south cell element 31600). A similar algorithm may be followed for the west boundary of the array 31700. This routine may be continued until a SE or SW corner cell element 31600 is reached. At that point, the ID numbering is complete, with each cell element 31600 having a unique identifier within the array. Also, when an ID number of a cell is assigned, the cell element 31600 may undergoes a local amplitude and phase calibration of both its transmit and receive amplitude and phase values. Other numbering schemes that produce unique identifiers within the cell element 31600 may be possible as well.

The SPARTA array cell elements 31600 may support modes of operation such as: a) LO phased array operation mode, b) digital phased array operation mode, c) analog phased array operation mode, and d) hybrid operation mode. All may be implemented using the SPARTA array cell element 31600 that allows size scalable operation.

FIG. 321 is a block diagram showing a SPARTA array cell element 32100 (which may be an implementation of the SPARTA cell 31600) that may be used for digital phase array tiling. In the digital phased array operation, the entire transceiver element in the SPARTA cell 32100 may be used. In the receive mode, the received signal may be converted to a digital signal, then vector summed with the SPARTA cell element 32100 having the previous ID number. To maintain scalability, the summation between each stage may be pipelined. This may be provided in order to limit the loading on the data bus lines. Also, to support a total of k users, k bus lines may be used, one for each user. Since the number of bus lines may be fixed in hardware, the SPARTA cell element 32100 may be designed with the hardware to support the maximum of number of users that most systems would use to support in digital phased array operation. Also, since the data lines may be pipelined, an internal pipeline register of depth of ND may be maintained. The pipeline depth ND limits the maximum SPARTA array size, where the individual elements may be connected in the digital phased array mode.

As the figure shows, k digital buses 32110 may be present in all directions (N, S, E, W). Digital multiplexers on both the transmitter (TX) 32120 and receiver (RX) 32130 blocks choose which cells 32100 to receive input from and which cells 32100 to output to.

FIG. 322 is a block diagram that illustrates LO phased array pipelining between adjacent cell elements 31600 in the LO phase combining mode. In the LO phased array combining mode of operation, each cell element 31600 receives its phase shift from a central control unit. In the receive path, the outputs of all mixer stages may be summed in the analog domain, bypassing the analog-to-digital converter (ADC). Only one ADC 31370 (FIG. 323) then takes the combined outputs and translate these into digital form. This combination may be performed through an analog bus 31660 that interfaces between the adjacent SPARTA cell elements 31600. This has the benefit of significant power reduction, since the ADC 31370 may be one of the largest power consuming blocks in a phased-array system.

The LO phase shifting mode of operation, as discussed above, may be one way of LO phased array combining. The SPARTA architecture provides a novel scalability of this approach. In order to maintain scalability, the analog bus 31660 line may be "analog pipelined" through a sample and hold vector bus of pipeline depth NA. The pipeline depth NA may limit the maximum SPARTA array size, where the individual elements may be connected in analog phased array mode. The analog values between each cell may be summed by a switched-capacitor analog integrator 32210.

The figure illustrates the integrator summing with the prior cell element 31600 and delay 10920 before being communicated over the bus 31660 connecting the cells. The entire SPARTA array 31700 with the LO phase shifting is illustrated in FIG. 323, which is a block diagram showing the SPARTA cell tiling using an LO phase array and illustrating active data converter ADC.

FIG. 324 is a block diagram that illustrates a SPARTA array 31700 in hybrid mode, where each row may be tiled in an LO phase shifting and sharing a single ADC 31370. Multi-user operation may be supported in the LO phased array mode of operation by using a hybrid mode of operation. In this hybrid mode of operation, the array 31700 may be divided hierarchically, where lower level cells may be combined in LO phased array mode and upper level cells may be combined in digital phased array mode. In some aspects, only one pair of data converters may be used per LO phased array cluster. In some aspects, no pairs of data converters may be used with some or all of the array clusters, and in some aspects, more than one pair of data converters may be used per LO phased array cluster. The configuration illustrated in FIG. 324 offers at least two benefits. First, it provides a trade-off between power consumption and array gain efficiency which may be controlled through software. Second, it offers a method to maximize the array gain per user since the total number of SPARTA cell elements 10300 that may now be used is $N=N_D*NA$.

FIG. 325 is a block diagram illustrating pipelining of the analog phased array combining between adjacent cell elements 31600 for the analog phased array combining operation mode. This mode of operation is similar to the LO phased array combining (and hybrid phased array combining) in that only one data converter per user is active, for example. The analog pipelining may be augmented with a weighted sum combining, as shown in FIG. 325, where a SPARTA cell 31600 is illustrated with analog phased array combining with a novel ability to pipeline the phased array combine in the analog domain. The function A1 (s) 32510 and A2(s) 32520 may be general complex functions that are realizable in the analog domain. Different analog coefficient weights may be realized by digital combining of different analog components (such as resistors, capacitors or current sources). Along with the analog summer 32210 and delay 32220 described above, a pipelined vector summation operation may be realized. In this type of operation, in some aspects, only one data converter per user may be active, eliminating significant power consumption per phased array cell 31600.

The exemplary modes of operation are summarized in Table 10 below. The maximum number of simultaneous users that the array can support in some aspects may be M users (dictated by the parallel analog and digital bus widths). The total maximum number of users may be N array elements (dictated by array size, and digital and analog pipeline depths). The "aperture" refers to the number of elements that may be taken into account when calculating the antenna array gain. Use of all ADCs for digital combining allows for multi-user/multi-beam operation, with digital pipelining for large arrays (for size scalability), but consumes greater power. Use of the entire array aperture per user with only one ADC per user by analog baseband combining with parallel analog pipelining stages (one per user) may save power. Use of LO phase shifting and a single ADC for a single user saves ADC power and uses analog pipelining to scale to large arrays. It provides an increased or maximum level of interference mitigation for the ADC. The hybrid configurations may use sub-sections of the entire array per user with LO combining and one ADC per user.

TABLE 10

Summary of SPARTA modes of operation

| Users | Aperture | Combining/ Beamforming | Parallel Analog Coefficient Sets | Data converters | Parallel Digital Coefficient Sets |
|---|---|---|---|---|---|
| 1 | Full | LO | 1 | 1 | None |
| M | Full | Digital | None | N | M |
| M | 1/M | LO | 1 | M | Up to M |
| M | Full | Analog | M | M | Up to M |

Disclosed herein according to some aspects is a system that utilizes IL at a sub-harmonic frequency to enable high-speed phase modulation at a lower power than equivalent fundamental-frequency modulation. Such a technique may be particularly useful at mmWave frequencies to efficiently implement a large available fractional bandwidth (and therefore high throughput). Direct digital modulation may be achieved through capacitive digital-to-analog converters (DACs) modulating a free-running frequency of an injection-locked oscillator at a subharmonic of the carrier signal. The modulated signal may be then used to further injection-lock a mmWave oscillator operating at the carrier frequency.

As opposed to direct fundamental frequency modulation, such sub-harmonic injection uses lower phase modulation range, thus enabling lesser injection strength and therefore lower power in some aspects. As opposed to a direct VCO modulation-based technique using fast start/stop oscillators, in some aspects the proposed technique: a) obviates VCO frequency mismatch among phased array elements; and b) removes limitations on the carrier frequency of being an integral multiple of the baseband sample-rate.

Classic narrowband phased-array transceivers use RF/LO/baseband phase shifting for beamforming. When such a technique is scaled to higher fractional bandwidths and/or a large number of phased array elements (such as in massive MIMO), this technique results in significant inter-symbol-interference (ISI) and therefore signal-to-noise ratio (SNR) degradation. By using IL-based delay modulation, this architecture enables use of true-time delay-based beamforming. By directly delaying the modulated carrier on each phased array element, this technique eliminates any such degradation.

Classic fundamental frequency LO distribution may be challenging at mmWave frequencies and contributes significantly to overall power consumption, especially when distributed to a multi-element array with a large silicon die size. Instead, by employing two successive sub-harmonic injections (with in-built modulation and beamforming), in some aspects this technique enables low frequency (and hence low-power) LO distribution. As a result, the architecture can scale very efficiently to a large number of array elements.

The following various aspects may be incorporated into the systems described herein. With regard to the locking frequency, a first aspect may be utilizing IL at a sub-harmonic frequency, unlike systems that may utilize IL at the fundamental frequency. With regard to phase shift/modulation range, in one implementation, the phase modulation may be one-third of the output frequency, so only a ±60° range may be used for a full ±180° coverage. This eliminates an additional polarity inversion and saves power. This may be an improvement over a design that generates phase symbols up to ±90°. Generating the full ±180° coverage for phase modulation therefore uses additional signal polarity inversion. Since such a block operates at the carrier frequency, it may be a significant power overhead.

With regard to injection strength, in the present design, according to some aspects, because of the reduced phase range, the injection strength and therefore the LO distribution power can be lower, in contrast to a design where a strong IL may be used to achieve the ±90° phase shift.

With regard to LO distribution, in the present design, according to some aspects, if the output mmWave frequency is f0, by employing a two-stage sub-harmonic IL, the LO distribution may be reduced to f0/9, thereby significantly reducing power consumption and design complexity. This contrasts with a design in which the LO distribution is at the fundamental frequency, which has a significant power overhead for mmWave frequencies and/or a large number of phased array elements.

With regard to beamforming, in the present design, according to some aspects, a capacitive DAC-based IL may be used for beam-forming, which constitutes true time delay beam forming. Such beamforming may be fundamentally free of ISI. This may be an improvement over a design that deploys phase shift in the base-band/LO or RF domain and utilizes narrow-band phase-shift based architectures which create ISI for a wideband and/or a multi-element phased array.

In addition to being a true time delay-based architecture, in the present design, according to some aspects, since the phase-shift may be only a function of the cap-DAC setting, the baseband modulation signal has a significantly relaxed jitter specification. This relaxes the power overhead of distribution to a multi-element phased array. This may be an improvement over a design that uses a technique for rapidly starting and stopping an oscillator to enable true time delay beamforming and in which there may be a very stringent jitter specifications on baseband modulation signal distribution since this jitter directly translates to phase shift using a mmWave carrier, making it challenging to scale to a large number of phased array elements.

The present design, according to some aspects, may be a frequency locked system, scalable to large number of elements and may have no limits on symbol rates. This may be an improvement over an architecture that is not frequency locked, which, in addition to scalability issues (due to frequency mismatch among phased array elements), also limits the baseband symbol rates to very specific values.

FIG. 326 is a schematic diagram illustrating components for an IL-based phase modulation circuit 32600, according to some aspects, which exploits phase shift characteristics of a locked oscillator. The modulation circuit 32600 may incorporate up-conversion circuitry 350, as described above, or may incorporate other forms of up-conversion circuitry. A data signal 32610 (illustrated by way of example in FIG. 328) may be provided to an oscillator tank circuit 32620 comprising a capacitive DAC 32625. This circuit 32600 is one example that may constitute a means for operating an injection-locked modulation circuit for a phased array transceiver, but the means are not limited to this process.

FIG. 327 is a graph 32700 that illustrates how, a center frequency of the oscillator 32620 may be changed with respect to the locking frequency fINJ 32630, the output phase and amplitude change, while the frequency 32635 is still locked to the locking injection frequency fINJ 32630. By utilizing a capacitive DAC 32625 in the oscillator 32620, one can generate multiple phase symbols within the phase shift range in a mostly or purely digital fashion.

FIG. 328 is a timing graph 32800 illustrating two symbols with phases φ1 and φ2 being generated by controlling the cap-DAC 32625 with baseband modulation bits as the data input 32610. In this circuit 32600, the injection frequency 32630 may be the third sub-harmonic of the desired center frequency f. This leads to significantly lower power consumption in the LO distribution network. In older designs, the IL phase shift range may be typically limited to ±90°, which is to be implemented with a strong injection at a high power cost. Furthermore, in the older designs, to ensure a full ±180° coverage of phase symbols, an additional phase inversion block (such as a Gilbert cell current commutator) may be typically used, leading to even higher power consumption.

FIG. 329 is a block diagram for an IL-based phase modulation circuit 32900 with a full 360° phase modulation using a cascaded sub-harmonic injection-locked architecture with respect to the carrier frequency fCARRIER 32940. FIG. 32940 shows how the phase shifting at the third sub-harmonic (fCARRIER/3) frequency 32635 of the carrier frequency fCARRIER 32940 uses only ±60° of phase shift, which, after tripling, translates to the full ±180° coverage at the fundamental frequency fCARRIER 32940. This sub-harmonic modulator may be in turn injection-locked to its third sub-harmonic fCARRIER/9 B9.430 in the cascaded design. This design eliminates a traditional (and typically band-limited) up-conversion mixer and in-phase/quadrature (I/Q)-based transmitter elements, thereby reducing power consumption.

Another aspect of various designs disclosed herein is the ability to incorporate a true time delay based beam forming using the same architecture. For a phased array system, where each antenna may be fed by one of these injection-locked, phase modulated oscillators, the relative delay between the elements can also be tuned by using the same cap-DAC based phase shifting.

FIG. 330 is a combination graph 33000 that illustrates a true time delay based beam forming in which elements one 33010 and two 33020 may be being fed the same baseband data signals ("11", "00") 33030 at two different offsets (θ, ΔT), leading to lagging or leading waveforms which emulate a true time delay based signaling. Conventional RF/LO/baseband phase shifting architectures cannot generate true time delays that may be used for beamforming with wide fractional bandwidths and multi-element phased arrays.

FIG. 331 is a schematic block diagram illustrating an example architecture of a four-element phased array transmitter 33100 that implements combining harmonic IL based phase modulation with true time delay beam-forming. A phase-locked loop (PLL) 33110 (i.e., third sub-harmonic fCARRIER/9 32930) at ⅑th the carrier frequency fCARRIER may be utilized in the central locking network thereby using a much lower power LO distribution network.

Both the modulation and beam forming occur through the IL mechanism in the oscillator 32635 tuned at fCARRIER/3. This enables increasing or maximizing the phase shift range thus ensuring full ±180° phase symbol coverage as well as an extended beamforming range.

Amplitude modulation can then be incorporated into the system by using polar architectures like digital PAs 33120 for power back-off efficiency improvements. The signal may then be output via a phased array antenna 33130. The architecture may be lower power than older architectures and less sensitive to baseband signal distribution jitter (which translates into a higher power for a larger number of elements). As a result, the proposed arrangement scales power-efficiently to an array with, for example, tens of elements.

FIG. 332 is a block diagram for an IL-based phase modulation circuit 11900 similar to the one shown in FIG. 329, showing an example of an injection-locked oscillator at operating at ⅓ of the carrier frequency fCARRIER, and in which the phase modulation and beam forming may be combined into single block without the use of I/Q mixers or phase shifters. A multiplier, illustrated as a tripler 33240 in the FIG., for frequency and phase multiplication may be provided. Although a value of three is used here, another integer N could be used both as fCARRIER/N for 33230 and 32635, and the multiplier ×N for the multiplier 33240. Beneficially, higher N values result in a lower frequency and a lower power distribution, as well as a relaxed injection locking. However, a disadvantage of higher N values may be a lower fractional bandwidth. With lower values of N, there may be a higher speed of modulations and higher fractional bandwidth, and also more efficient multiplication. However, this results in a higher frequency distribution.

FIG. 333 is a block diagram for an IL-based phase modulation circuit 33300 similar to the ones shown in FIGS. 329 and 332, showing an example of an injection-locked oscillator at operating at ½ of the carrier frequency fCARRIER, and in which the phase modulation and beam forming may be combined into single block without the use of I/Q mixers or phase shifters. A doubler 33340 for frequency and phase multiplication may be provided. Additionally, a Gilbert quad/polarity switch 33345 for and polarity flip and frequency and phase multiplication may be provided. By using fCARRIER/2 33335 instead of fCARRIER/3, and the Gilbert quad/polarity switch 33345, a wider fractional bandwidth may be achieved, and only ±60° of phase shift is used. Furthermore, there may be no distribution at fCARRIER, which saves power.

Various systems and methods are disclosed for dealing with wireless baud-rate clock data recovery (CDR) that utilizes the independent I/Q streams, such as 16-QAM.

FIG. 334 is a pictorial diagram illustrating a constellation map 33400 for QPSK pulse-amplitude 2 (PAM2) modulation, and the respective I and Q values 33410 possible.

FIG. 335 is a pictorial diagram illustrating a constellation map 33500 for 16-QAM (PAM4) modulation, and the respective I and Q values 33510 possible.

FIG. 336 is a pictorial diagram of a design for a PAM2 modulation timing estimator 33600 along with a table 33650 that may be used to determine a timing adjustment (based on a calculation of ZK) and a circuit block diagram 33670 for determining the values. These circuits may incorporate baseband processing circuitry 392 as described above, or may incorporate some other form of baseband processing circuitry. In this diagram 33670, for PAM2 there are two data levels, plus one and minus one. From the input stream, a data value DK and an error EK may be determined. If the data is plus one, then the sign is plus one and the error is plus one. If the data is lower than plus one and greater than zero, the data is plus one and the error is minus one. A value ZK may be calculated using current data, previous data, current error, and previous error. If Z is positive, then the sampling phase his early. If Z is negative, then the sampling phase is late. The sampling phase may be adjusted based on the calculated Z values. This is the baud rate CDR for PAM2.

However, extending the concept to PAM4 (16-QAM) represents a novel approach, and a determination of applying baud rate CDR in this modulation context is illustrated in the following discussion. Referring to FIG. 337, which is a first estimator table 33700 of data and error values provided according to a first technique, the first estimator table 33700 shows a possible application to the multi-bit values associated with 16-QAM. Using the error values shown in the table, the CDR works, but in a sub-optimal way.

FIG. 338 is a graph 33800 illustrating use of the equation for Z and the first estimator table 33800. The PAM2 (QPSK) curve 33810 illustrates a correct locking point 33830 of the CDR as it transitions from 0.5 to −0.5, crossing over the 0 value at time 1. However, for the PAM4 (16-QAM) curve 33820, although it also shows a crossing of the correct locking point 33830 at time 1, there are also two false locking points 33840 during which a transition from a positive to a negative value occurs, but which should not serve as a locking point of the CDR. Since the table 33700 produces these false locking points, it may be not an acceptable solution.

FIG. 339 is a second estimator table 33900 illustrating a second exemplary technique, in which the error values are all minus one, except above the plus three values and below the minus three value. FIG. 340 is a graph 34000 of the Z function using the second table 33900. First, for reference, the function for the first technique (PAM4/16-QAM) 33820 is re-plotted on this graph 34000, along with the correct locking point 33830 and the false locking points 33840. Next, the function of the second technique 34010 is plotted and may be based on values calculated with the second table 33900. As may be seen in the graph 34000, the function of the second technique 34010 has no false locking points 34020 at the places where they exist for the curve 33820 based on the first table 33700. Therefore, the second table 33900 values represent an effective CDR.

The graph 34000 shown in FIG. 340 does not include multi-path intersymbol interference (ISI) or noise, and these would have some bearing on the frequency of false locks, even using the second table 33900. Under certain circumstances, the second table values 33900 could be substituted with other values (e.g., EK+1, +1, −1, −1, +1, +1, −1, +1), and some determination could be empirically measured and/or made as to which set of values produces the best outcome under a particular set of circumstances.

FIG. 341 is a block schematic diagram of a typical baud rate CDR loop for wireline 34100, having some logic calculations 34110, a phase detector (MMPD) 34120, majority vote 34130 filtering, and a digital loop filter 34140 (second order filter) with an integration path on the top having an accumulator, and the proportional path on the bottom. An accumulator also follows the digital loop filter 34140, with a lookup table (LUT) and further processing.

FIG. 342 is a block schematic diagram of a wireless CDR loop 34200, having both an in-phase (I) and quadrature (Q) inputs. Additionally, this loop 34200 has a mode unit 34210 that may comprise portions of the CDR circuitry and that that receives the two data (I, Q) outputs from the majority voting blocks.

FIG. 343 is a table 34300 containing various mode values and adjustment indications that may be used by the mode unit 34210 to determine an adjustment of the sampling phase. In mode zero, if early and late are both zero, then there is no decision and the current sampling phase may be maintained. In mode one, if early is one, then the signal is early, and the sampling phase may be moved to a later point. In mode two, if late is one, then the signal is late, and the sampling phase may be moved to an earlier point. In mode three, similar to mode zero, if early and late are both one, then there may be no decision.

In mode four, the Q output may be not used and only the I input may be used. Mode five is the same, except it only uses the Q input. In the case of mode six, if either I or Q is early, then the signal is early, and the sampling phase may be moved to a later point. If either I or Q is late, then the signal is late, and the sampling phase may be moved to an earlier point. Mode seven is similar but it is an "and" function as opposed to an "or" function. So both I and Q are early in order to move the sampling phase to a later point, and vice versa. Using this mode unit 34210 in combination with the mode table 34300, the probability of a false lock can be reduced.

Recalling that the ISI and noise can create a false locking, one aim may be to reduce the probability of a false lock. Because the wireless communications have two independent data streams, a system can utilize both of these streams. Using both I and Q for the baud rate CDR significantly reduces the probability of false locks. More settings could be added to the table to deal with different situations, and there are many logic combinations that could be added to the table. For example, not I and Q, and so on.

The mode may be selected according to various criteria, although modes that utilize both the I and Q channels tend to be more robust, and thus, modes six and seven tend to be favored. In a first example, when operating in QPSK modulation scheme, which may be very robust and not generally subject to false locking, QPSK training signals may be used to find the correct lock point first using any mode. Next, the mode may be set to mode six (I or Q) or mode seven (I and Q). Both of these modes are looking at both the I and Q streams—which may be more robust than looking at a single stream, and can reduce the probability of a false lock. In a second example, if the false lock points of the I and Q signals are different, then mode six or mode seven may be used to remove the false lock point of the combined graph in many cases. In a third example, if either I or Q has two levels, such as when using PAM2 modulation, then it may be possible to set the mode to mode four or five (but modes six and seven may work here too, for example).

As noted above, in general, considering both channels produces better results, but this may be not always the case. In some instances, ignoring one of the channels will produce a better result. In a fourth example, the I channel does not have significant ISI, but the Q channel does, so mode four may be selected as providing the best results.

The mode settings may be changed dynamically. In this instance, the modes may be represented by three bits, and these can be changed in real time, as various conditions may be detected. For example, if a transmitter sends training signals, but these are not received by the receiver, then the mode may be changed to see if the training signals can be received in a different mode. It may be also possible to do some form of dithering. For example, mode four could be chosen for some time period, and then we can switch to mode five for the next time. So mode four and mode five could be dithered, and the conditions may be detected and monitored to determine which mode may be better or best at a particular point in time and in response to changing conditions. This concept may be generalizable to 64-QAM or higher modulation mode for larger data bit values. For the higher modulation modes, a table may be created similar to the table 33900 of FIG. 339, with plus one provided for the error at the extremes, and minus one for other values.

Some aspects of the present disclosure relate to the use of low-resolution ADCs for low power MIMO systems and provide a new near-optimal signal power estimator for AGC design in receivers with low-resolution analog to digital converters (ADCs), targeting low power low latency applications.

The present disclosure provides a near maximum likelihood power estimation algorithm which reduces the effect of quantization noise and increases accuracy of the power estimation significantly when the received signal power is above the dynamic range of ADCs. Accurate power estimation reduces latency of MIMO communication systems and allows use of low-resolution ADCs for low power MIMO systems. This solution does not employ changes to the AGC feedback loop and does not use a high-resolution ADC for single-input-single-output (SISO) and MIMO systems, and it also does not use AGC circuitry at each antenna output of MIMO systems. Therefore, the proposed solution may be power efficient. Using an average power calculation with a low-resolution, ADC has a high estimation error which also increases latency (settling time). Therefore, the proposed solution herein has high accuracy and low latency.

In order to reduce the total power dissipation at the ADCs, the systems and methods described herein may in accordance with some aspects: 1) utilize low-resolution ADCs at each antenna output and a single digital AGC feedback loop; 2) for each of the quantitation bins (in-phase/quadrature signal (I/Q) quantization bins together), calculate or simulate a probability of a received signal for some set of quantization bins and create look-up tables; and 3) count a total number of samples falling into some particular set of quantization bins, and determine the power level from the look-up table with respect to the counted number of samples. Some aspects of the present disclosure provide a power detection algorithm with any type of constellation and channel, and any number of ADC bits resolution by using properties of this optimal detection solution. The functionality of the AGC at the receiver may be to maintain a constant amplitude at the input of an ADC. In this disclosure, in accordance with some aspects, a receiver system with low-resolution ADC and a new power detector algorithm is proposed.

FIG. 344A is a block schematic diagram of an example AGC circuit 34400, which may be implemented at a receiver where an amplitude of the received signal varies during the operation of the receiver. The AGC circuit 34400 may incorporate digital baseband circuitry 310, as described above, or may comprise other forms of digital baseband circuitry. A signal may be received at an antenna 34410 and may be fed into an RF amplifier 34415. The signal may be provided to a mixer 34420 that, using a local oscillator, converts it from an RF to an intermediate frequency (IF) signal. The IF signal may be provided to a variable gain amplifier (VGA) 34425, and the output may be provided to a sample-and-hold (S/H) circuit 34430 where it can be digitized by a low-resolution ADC 34435. A portion of the digital signal may be provided as an input to a power determiner 34440. The output voltage may be combined 34445 with a reference voltage VREF and provided to a loop filter 34450. The loop filter 34450 utilizes an output as a control to the VGA 34425, thereby completing the control loop.

FIG. 344B is a flowchart of an example AGC process 34460 comprising receiving a plurality of quantized signals from a quadrature modulated signal S34465, assigning the quantized signals into regions of a constellation map made up of in-phase (I)/quadrature (Q) quantization bins according to their quantized power level S34470, determining a maximum likelihood estimator (MLE) based on the assigned quantized signals S34475, estimating a power based on the MLE S34480, and adjusting a variable gain amplifier for further received signals based on the estimated power S34485. The AGC circuit 34400 is one example that may constitute a means to perform a method for automatic gain control (AGC) of a radio-frequency (RF) receiver, but the means are not limited thereto.

FIG. 345 is a constellation graph 34500 for quadrature encoding that illustrates quantization bins for low-resolution ADCs with $b=\log_2(2n)$ bits in each of the I/Q components of a receiver signal in a single antenna receiver system. The received signal after quantization can be written as follows: $y_{q,i}=Q(h_i x_i+n)$, i=1, N, where N is the total number of samples. Here, $x_n$ is a channel input signal and may be selected from a constellation of size M such as 16-QAM, 8PSK, 64-QAM, BPSK, etc., $h_n$ is the channel gain, and n is additive white Gaussian noise (AWGN) with a zero mean and unit variance.

In the above equation, Q( )is a quantizer and the threshold levels of the quantizer are denoted as $t_j$, $j=-n, \ldots -1, 0, 1, \ldots, n$, such that $t_{-n}=-\infty$ and $t_n=\infty$, and hence accordingly $$\mathrm{Re}\{y_{q,n}\} = \frac{t_j + t_{j+1}}{2}$$

when $t_j<\mathrm{Re}\{h_n x_n+n\}\le t_{j+1}$, $j=-n-1, \ldots -1, 0, 1, \ldots n-1$.

The above quantization operation may be the same for an imaginary component of the received signal as well.

Regions $r_i$, $i=1, \ldots, 2^{b-2}(2^{b-1}+1)$ may be defined on I/Q quantization bins according to their quantized power levels such that the samples in each region have the same power level as shown in FIG. 345. For example, region $r_1$ corresponds to an area between $t_{-1}$ and $t_1$. The samples falling into region $r_1$ have a power level equal to $$2\left(\frac{t_0+t_1}{2}\right)^2.$$

A maximum likelihood (ML) estimator may then be formulated as follows:

$$\hat{P} = \underset{P}{\operatorname{argmax}} \frac{1}{N} \sum_{i=1}^{2^{b-2}(2^{b-1}+1)} n_{r_i} \log(P(r_i|P)),$$

where $n_{ri}$ is the number of samples out of N quantized in region $r_i$, and P is the average received signal power which may be computed as $$P = E\{|h|^2\} \frac{1}{M} \sum_{m=1}^{M} |x_m|^2.$$

For a given constellation choice, P depends only on the variance of the channel h.

Next, an optimal solution may be determined for the above ML estimator and properties of the conditional distribution, $P(r_i|P)$ are identified as follows:

$$\sum_{i=1}^{2^{b-2}(2^{b-1}+1)} \frac{n_{r_i}}{N} \log\left(\frac{P(r_i|P)}{n_{r_i}/N}\right) \le \sum_{i=1}^{2^{b-2}(2^{b-1}+1)} \frac{n_{r_i}}{N}\left(\frac{P(r_i|P)}{n_{r_i}/N} - 1\right) = \sum_{i=1}^{2^{b-2}(2^{b-1}+1)} P(r_i|P) - \sum_{i=1}^{2^{b-2}(2^{b-1}+1)} \frac{n_{r_i}}{N} = 0$$

In the above equation, the first inequality is due to fact that $\ln x \ge (x-1)$, and the equality may be satisfied when x=1. The following results from this:

$$\sum_{i=1}^{2^{b-2}(2^{b-1}+1)} \frac{n_{r_i}}{N} \log(P(r_i|P)) \le \sum_{i=1}^{2^{b-2}(2^{b-1}+1)} \frac{n_{r_i}}{N} \log\left(\frac{n_{r_i}}{N}\right).$$

Note that the left-hand side (LHS) of the above inequality is bounded and the upper bound may be achieved when $$P(r_i|P) = \frac{n_{r_i}}{N}, \text{ (e.g., } \ln x = (x-1), \text{ when } x = 1).$$

Therefore, using conditional distributions $P(r_i|P)$ and number of quantized samples $n_{ri}$, the power may be estimated. However, the following problems may be present: i) the conditional distribution may have multiple solutions; ii) the number of regions $r_i$, $i=1, \ldots, 2^{b-2}(2^{b-1}+1)$ may be large; and iii) the number of samples N can be small due to latency requirements.

The following discusses properties of the conditional distribution, solves the above problems, and simplifies the estimation algorithm by limiting the number of searches such that acceptable accuracy may be achieved. This may be accomplished by the following steps:

1. Selecting regions $r_i$ which have monotonically increasing or decreasing conditional distributions $P(r_L|P)$.

2. From the selected regions $r_i$ in step 1, choosing a set of regions that $$r_i = \arg\max_{r_i} \left|\frac{dP(r_i|P)}{dP}\right|,$$

over P of interest. This reduces the sensitivity of counted number of samples.

3. Solving the optimization problem:

$$\min_P \sum_{i \in step\ 2} \left|P(r_i|P) - \frac{n_{r_i}}{N}\right|$$

FIG. 346 is a constellation graph 34600 for quadrature encoding illustrating quantization regions for a 3-bit ADC used in the following example. Considering a 64-QAM input signal and 3-bit ADCs in each of the I/Q components for a single antenna receiver and SNR=10 dB, regions are defined as highlighted in FIG. 346. Using the regions, conditional distributions may be computed as shown in as provided by the graph 34700 in FIG. 347, which is a graph showing conditional probability distributions, where only $r_1$ and $r_5$ are monotonically increasing and decreasing. As shown in the figure, only conditional distributions of $r_1$ and $r_5$ are monotonically increasing and decreasing with respect to P (step 1, from above). Then, the derivative of conditional probability distributions of $r_1$ and $r_5$ as given in FIG. 348 (step 2), (which is a graph 34800 showing the derivative of conditional probability distributions) are investigated. As shown in the figure, when $0\sqrt{P}<5.3$, $r_1$ has the largest slope, which means that estimation error may be less susceptible to the variation of counted number samples in region $r_1$. When $5.3<\sqrt{P}<65$, $r_5$ has better estimation accuracy. Then using and $P(r_5\ |P)$, the optimization problem in step 3 may be solved. In some aspects, a look-up table may be created and used to find the solution.

FIG. 349 is a graph 34900 showing an example of the estimation performance of the proposed power estimation algorithm compared to the classical average power determination. Here, classical power estimation may be the average power estimation as follows:

$$\hat{P} = \frac{1}{N}\sum_{i=1}^{N} |y_{q,i}|^2$$

As shown in FIG. 349, the novel algorithm has significantly better performance as compared to the well-known average power estimation. The average power calculation method converges to a finite point due to the limited dynamic range of ADC. In the figure, a power estimation is also provided using all of the regions. Also as shown in the figure, performance degradation due to the use of only $r_1$ and $r_5$ is minimal.

By way of example, consider use of 16-QAM and 2 bits ADCs at 10 dB SNR, and consider first the latency of the novel algorithm with a log feedback loop having a 0.3 step size. To compare the novel algorithm with the average power estimation in FIG. 350 (which is a graph 35000 illustrating the latency of the novel algorithm), an initial $\sqrt{P}=9.48$ is set, and the best convergence value is $\sqrt{P}=3.16$. As shown in FIG. 350, the proposed algorithm converges very fast as compared to the average power calculation, because the novel algorithm has better accuracy.

FIG. 351 is a graph 35100 that compares the normalized mean square error (MSE). As shown in the figure, the novel algorithm may be significantly better than the average power calculation.

FIG. 352 is a graph 35200 showing a mean square error (MSE) with a uniform 45° phase noise that evaluates performance with this 45° phase noise. As shown in the figure, phase noise may be helpful in terms of power detection since it randomizes the received signal. Since conditional probability distributions depend on noise (signal-to-noise ratio (SNR)), performance may vary depending on SNR value. However, using dithering algorithms, the best possible solution for any SNR can be found.

FIG. 353 is a block schematic diagram illustrating an example of a MIMO receiver 35300 with a digital processor 35310 (that may incorporate the power determiner 34440), digital AGC 35320, and low-resolution ADCs 34435 having multiple phased array antennas and I/Q input channels (other components described in FIG. 343 are not repeated here). In this design, all of the samples from each of the ADCs 34435 may be used together. This allows a reduction in latency since each ADC 34435 uses fewer samples.

The new power estimator according to this design enables a very fast adaptation of AGC gain that can be used in a variety of low power receivers.

Disclosed herein in accordance with some aspects are system and methods that use the antenna array as a gain control element for both the receiver operating in a receive mode and the transmitter operating in a transmit mode. In a time-division duplex (TDD) system (and/or a frequency division duplex (FDD) system), since the receiver and transmitter are not operating at the same time, the antenna array may be configured to enable independent gain control for the receiver and transmitter. The gain control in the antenna array may be implemented by selectively turning on (or off) elements of the array such that the gain and directivity of the antenna array can be tailored to the operating conditions.

Selectively turning on (or off) elements of the antenna array during the transmit time slots enables controlling the radiated power, while also leading to battery power savings when elements are turned off. Selectively turning on (or off) elements of the antenna array during receive time slots enables the implementation of gain control ahead of the first amplification stage. When the elements of the array are turned off, the drive level into this stage may be reduced, thereby reducing its linearity requirements.

One challenge in implementing this may be how to determine when the antenna array should be used to perform gain control in either a receive or transmit mode. This involves sensing interferer power (in the receive case), and performing beam-searches such that the link between the user equipment (UE) and base station (BS) is not degraded by maintaining the signal-to-noise distortion ratio (SNDR) suitable for higher or even the highest (under the signal conditions) throughput.

A system and method describe herein may also be used for an increased or optimized control of the antenna array based on current drain reduction versus network conditions. In existing mmWave systems, such as radar or fixed point-to-point systems, the transceiver does not use elaborate gain control to maintain the link quality. In contrast, mobile cellular systems routinely use more complex gain control in both the receiver and transmitter.

FIG. 354 is a block diagram that illustrates an implementation of a beam forming circuit 35400 and shows N identical transceiver slices 35410 and N antenna elements 35420. The system may utilize parallel receive circuitry 382 and/or combined receive circuitry 384, as discussed above, or it may comprise different receive circuitry. An implementation of a TDD transceiver is shown in the first slice 35410. To achieve a particular beam pattern, the antenna elements 35420 may be fed with a signal having a particular amplitude and phase. A switch 35430 may be used to set whether the transceiver is operating in a transmit or receive mode. The transceiver contains gain controls (a variable gain low noise amplifier (LNA) 35440 in the receive path, and a variable gain power amplifier (PA) 35460 in the transmit path) and phase shifters 35450, 35470 to set the amplitude and phase for a given beam pattern. FIG. 354 further comprises a processor 35480 that may be used to control the phased array utilizing a gain table 35490, discussed in more detail below.

An antenna array may have antennas arranged in various configurations, such as a rectangular pattern, for example, a two-by-four pattern for an eight-element antenna. It may also include omni-directional antenna elements as well. In one example configuration, a received signal (a desired signal and an interferer signal) experiences a gain in the antenna array given by 20 log(n), while the thermal noise is amplified with a gain of 10 log(n). In this situation, the effective receive gain of the antenna array is 20 log(n)−10 log(n).

The beam formed may differ, depending on how many elements are activated. When all eight elements in the two-by-four pattern are turned on, the gain is the highest (e.g., 13.2 dB), and the beam is narrowest. Conversely, when only four of the eight elements are turned on, the gain is the lowest (e.g., 10.1 dB) and the beam is the widest. When six of the elements are turned on, the gain is between these extremes (e.g., 11.7 dB), as is the beam width.

Table 11 below summarizes the theoretical receive gain, the simulated receive gain, and the difference in gain (theoretical and simulated) for a given number of array elements that are turned on. From Table 11, it may be seen that the antenna array can provide at least an additional 5.5 dB of gain control range when only two elements out of eight are turned on during the receive time slot. An additional 3 dB (theoretical) of gain reduction may be possible if only one element of the array is turned on.

TABLE 11

Summary of Antenna Array Gain Vs. Number of Elements Turned On, with Theoretical and Simulated Data

| Number of Array Elements On ($N_{on}$) | Effective Receive Gain of Array [$20\log(N_{on}/8) - 10\log(N_{on}/8)$] | Simulated Antenna Array Gain (dB) | ΔGain (dB) [Theoretical] | ΔGain (dB) [Simulated] |
|---|---|---|---|---|
| 8 | [20log(8/8) − 10log(8/8)] = Max Gain | 13.2 | 0 | 0 |
| 6 | [20log(6/8) − 10log(6/8)] = Max Gain − 1.25 dB | 11.7 | −1.25 | −1.5 |
| 4 | [20log(4/8) − 10log(4/8)] = Max Gain − 3.01 dB | 10.1 | −3.01 | −3.1 |
| 2 | [20log(2/8) − 10log(2/8)] = Max Gain − 6.02 dB | 7.7 | −6.02 | −5.5 |

The beamforming may also be based on the positional configuration of the active elements. For example, the beam may be wider or narrower depending on whether an outer four or inner four of the eight antenna elements are activated.

FIGS. 355 and 356 are graphs 35500, 35600 that illustrate the improvement in the receiver dynamic range that can be realized if the antenna array is used as a gain control mechanism. These graphs are a plot of SNDR versus input power at the antenna for two cases. FIG. 355 shows the case when the antenna array gain is held constant. The overlapping SNDR signal 35510 SNDR with analog-to-digital conversion (ADC) 35520, and the ADC drive level 35530 versus power curves are plotted. When the power at the antenna is high enough, it can be seen that the SNDR 35510, 35520 drops off significantly and the ADC drive level 35530 rises significantly in the reduced dynamic range region 35540.

FIG. 356 shows the case when the antenna array gain is varied to enable gain control. The overlapping SNDR signal 35610 and SNDR with analog-to-digital conversion (ADC) 35620 and the ADC drive level 35630 versus power curves are plotted. When the power at the antenna is high, it can be seen that the SNDR 35610, 35620 maintains its level and the ADC drive level 35630 stays roughly the same in the power range occupied by the reduced dynamic range region 35540 in the previous figure.

Comparing FIGS. 355 and 356, it can be seen that utilizing the antenna array as a gain control mechanism increases the dynamic range of the receiver by at least 10 dB for an eight-element antenna array. A larger number of antenna elements would enable a larger increase in the effective dynamic range of the receiver. Furthermore, by shutting off slices in the transceiver, current drain savings may be realized. For example, using only four of the eight array elements would lead to approximately a 50% current drain savings in the front end of the receiver.

Similarly, the transmitted signal experiences gain due to the antenna array. The gain control range obtained for the transmitter may be expressed as 20 log(Non/8) for an 8-element array, where Non is the number of active elements in the array. This relation holds because the input to each of the elements may be correlated. Current drain savings may be also obtained in the transmitter when elements of the array are turned off as part of the gain control mechanism.

FIG. 357 is a graph 35700 that shows the radiated power 35710 and the relative current drain 35720 versus the number of active elements in the antenna array.

As can be seen from the above, the benefits of enabling gain control in the antenna array can be significant. An aspect discussed below is the algorithm and principles of how and when to apply gain control in the antenna array.

The receiver dynamic range may be extended by using received signal strength indicator (RSSI) measurements. Furthermore, gain back-off (operating at a level below the saturation of a power amplifier) for high signal levels may be based on desired signal and/or interferer detection. Gain back-off for low to mid signal levels may be used for a reduction in current drain. Also, an even number of chains may be used to maintain symmetry, whereas an odd number of chains may be used for increased control steps/range. Regarding transmission, the requested/programmed transmit power may determine the number of active chains. Gain back-off for high power levels may be considered for reducing current drain, whereas gain back-off for low power levels may be considered for extending the transmitter gain control range. Also, as with reception, an even number of chains may be used to maintain symmetry, whereas an odd number of chains may be used for increased control steps/range.

FIGS. 358 and 359 are graphs that frame the boundary of the operating window for control of the number of active elements in the antenna array vs signal power level, RSSI for Rx, and requested power for Tx. The operating window also depicts the trade-offs versus current drain.

FIG. 358 is a graph 35800 that illustrates the operating condition tradeoffs for Rx. Here, the number of active elements can be reduced, as illustrated by the left path 35810, at the lowest signal level, which maintains an acceptable signal-to-noise ratio (SNR) to improve the current drain. This can result in a wide range of signal levels where the receiver is operated without beamforming gain. This is an example of an operating mode under low interference conditions. In contrast, the right path 35820 may be well suited for conditions of high interference because the antenna pattern has a narrow beam width focused on the desired signal. The narrow beam width conditions may be well suited for line-of-sight (LOS) operation, and wider beam width conditions may be well suited for non-LOS operation.

FIG. 359 is a graph 35900 that illustrates the operating condition tradeoffs for Tx. Here, the number of active elements can be reduced, as illustrated by the right path 35910, at the highest signal level which maintains an acceptable SNR to improve the current drain. This can result in a wide range of signal levels where the transmitter may be operated without beamforming gain. This may be an operating mode for lowest power consumption. In contrast the left path 35920 may be well suited for radiating a lesser or the least amount of interference since the antenna pattern has a narrow beam width focused on the desired base-station.

FIGS. 360 and 361 are flowcharts for example receive 36000 and transmit 36100 processes for configuring the antenna arrays respectively. These processes 36000 are examples that may constitute a means to perform a method for controlling an antenna array in a phased array transceiver, that may comprise switching a transmit and receive switch that is switchable between a transmit mode™ and a receive mode (RM) of operation, but the means are not limited to this process. The operations defined in these flowcharts may be executed by the processor 35480 (FIG. 354) executing instructions stored in a memory of the device. FIG. 360 shows the receive process 36000, which begins in operation S36010 by configuring the gain table 35490 (FIG. 354) for minimum current drain settings of the antenna array. In operation S36020, AGC operations may be performed using the gain table 35490. These operations may include normal adjustments to the gain by adjusting the variable low noise amplifier 35440 and/or adjusting the number or configuration of active antenna elements 35420. In operation S36030, wideband and narrowband signal detection may be performed. In operation S36040, a determination may be made as to whether an interferer may be present. If so (S36040:Y), then in operation S36050, the gain table 35490 may be configured for narrower beam width settings of the antenna array, and the process may continue at operation S36020. Otherwise (S36040:N), the process may continue at operation S36010.

FIG. 361 shows the transmit process 36100, which begins in operation S36110 by configuring the gain table 35490 for minimum current drain settings of the antenna array. In operation S36120, power control operations may be performed using the gain table 35490. These operations may include normal adjustments to the gain by adjusting the power amplifier 35460 and/or adjusting the number or configuration of active antenna elements 35420. In operation S36130, a determination may be made as to whether there are known co-existence or interference concerns. If so (S36130:Y), then in operation S36140, the gain table 35490 may be configured for narrower beam width settings of the antenna array, and the process continues at operation S36120. Otherwise (S36130:N), in operation S36150, a determination may be made as to whether the network requested a narrower beam width. If so (S36150:Y), the process may continue with operation S36140 as before. Otherwise (S36150:N), the process may continue at operation S36110.

Other factors that may be considered include a traveling speed of a mobile device—for example, a pedestrian walking with their cell phone versus using it in their car. A moving device may be more likely to benefit from a wider beam since the beamforming direction will not have to be made so frequently. A specific absorption rate (SAR), which is a measurement of energy absorbed by the body, may be considered for safety reasons as well. For example, the proximity and direction of a user may play into the beamforming decision. If, given the direction of transmission, creating a narrow beam will direct the beam away from the user, then it might be desirable to activate more elements and do the beamforming, since this will be a safer configuration to the user than operating with a greater bandwidth. Conversely, if the direction of transmission is towards the user, then it might be desirable to activate fewer elements to create a wider (and less powerful, in any direction) beam, since this will be a safer for the user.

Utilizing the systems and methods discussed above may enable enhanced transceiver performance, and enhanced battery life.

In a wireless channel, not all taps are used simultaneously with equal strength. Most (e.g., more than 80%) of the taps during normal use may be set to a low strength (e.g., less than 25% of their maximum values). Later post-cursor taps in a communication signal have lower strength than earlier taps, and this fact can be taken advantage of. By reducing the full-scale of a DAC and trading off range for resolution, a reduction in the quantization noise of low strength taps may be realized.

FIG. 362 is a schematic diagram of a typical DAC architecture 36200. The DAC 36200 may comprise a DAC 340, as described above, or a different architecture. Such DACs make use of a current mirror 14905 that comprises a current source 36210 that provides current through the transistor 36220, establishing a voltage level at the gate of the transistor 36220. The gate further may have a switch 36230 so that it may be disconnected from the right-hand part of the circuit, which comprises a number of DAC legs 36250 that comprise the bits that make up the DAC's resolution. An output 36255 is provided at which a voltage level related to a number of DAC legs activated is presented. Activation may be via the transistor 36260 acting as a switch and allowing current to flow through the transistor 36270, which is the same as that flowing through the current mirror 36205. Such a DAC may be, by way of example, a high-resolution 7-bit DAC, having 128 different levels. These levels could be spread across, for example, five volts, so that each step of the DAC represents a voltage level of approximately 5v/128 steps=0.0391 V/step.

FIG. 363 is a schematic diagram of a hierarchically structured DAC 36300, according to one implementation of a device described herein. Elements in common with the previous FIG. function in a similar manner, and a description of them is not repeated here. This DAC 36300 is an example of a means for performing a method of operating a digital-to-analog circuit device, that may comprise in a first component providing at least two switchable paths, running current from a current source through the at least two switchable paths to establish a reference voltage at a reference voltage point that is dependent upon a number of the paths switched on, and in a second component providing at least two switchable paths, that an output associated with the second component is dependent upon a second number of paths switch on and the voltage reference point, that the voltage reference point connects the first component to the second component, but the means are not limited thereto. An additional feature of this design is a second DAC leg 36330 on the left-hand part of the circuit, the left-hand part being labeled as a "coarse DAC" for the following reason. When this DAC leg 36330 is turned on via the transistor 36345 acting as a switch, current from the current source 36210 flows through it via the transistor 36340. When this leg 36330 and the initial leg 36250 comprising the transistor 36220 (and also operable via its own switch 36320) are on and serving as a current drain for the source, 36210, the current is divided between the two legs, and the voltage at the gates (and at the switch 36230) is reduced to one half of its value when only one leg is active. This reduces the effective range of what can be considered the fine DAC portion on the right.

Using the example provided above, a 7-bit DAC having 128 steps still exists on the right, but due to the current dividing by the two legs on the left-hand side of the circuit, its range is cut in half, e.g., to 2.5 V. Since the resolution remains, this means that each step of the DAC now represents a voltage level of approximately 2.5 V/128 steps=0.1953V/step. Thus, by engaging or disengaging one of the DAC legs 36330, one can switch the DAC's operation from between 0-5V to 0-2.5V, essentially acting as a coarse DAC operative to switch between two levels.

The coarse DAC side is not limited to having two legs. Additional legs could be added and configured to be engageable and disengeagable via an upper switch similar to the transistor 36345. If four DAC legs 36330 are provided on the coarse DAC side, then the DAC could operate at full-range (one leg activated) half-range (two legs activated), one third range (three legs activated), and a quarter range (four legs activated).

At design time, the inclusion of an N-bit coarse DAC may reduce the fine DAC of resolution of up to N-bits (in order to have the same overall resolution of the DAC). But reducing the fine DAC by N bits may reduce its area by a factor of 2N times. Thus, by arranging the DACS in this hierarchical structure, considerable chip space may be saved with little impact on functionality.

Disclosed herein in accordance with some aspects is a system and method that uses polarization in mmWave wireless communications for multiplexing to improve spectrum utilization efficiency by using the multiplexed channel as an additional data stream. Wireless channels have difficulty with ISI and cross-polarization from multi-path reflections at gigabyte/second (GB/s) rates, particularly for massive MIMO configurations having hundreds of taps. Traditionally, handling these issues would have been performed in the digital domain, using an analog-to-digital converter (ADC) and then utilizing a digital signal processor (DSB) to analyze and correct these issues. However, this solution is not practical at the data speeds used for mmWave wireless communications, which may be on the order of multiple gigabits per second. Furthermore, such solutions tend to be complex and expensive. The system disclosed herein according to some aspects is a mixed signal feedforward+feedback polarizer+equalizer (MSFFPE) design that utilizes lower power than the ADC+DSP solution and has enough speed to adequately deal with signals in the mmWave bandwidth.

FIG. 364 is a combined pictorial chart diagram 36400, including a pair of graphs illustrating co-polarization 36410 and cross-polarization 36420 when a transmit antenna 36430 and a receive antenna 36440 are aligned/parallel. The figure shows that the received amplitude of a cross-polarized signal is relatively low.

However, one cannot always rely on antennas being aligned, particularly with regard to mobile devices. FIG. 365 is a combined pictorial chart diagram 36500, including a pair of graphs illustrating co-polarization 36510 and cross-polarization 36520 when a transmit antenna 36530 and a receive antenna 36540 are misaligned/not parallel. The figure shows that the received amplitude of a cross-polarized signal is significantly higher in this situation than in the aligned antenna situation illustrated in FIG. 364.

FIG. 366 is an example of a receiver 36600 using the MSFFPE design, according to some aspects. The receiver 36600 is one example that may constitute a means for a method for operating a MSFFPE, but the means are not limited thereto. The receiver 36600 may comprise a plurality of beamforming antennas having a vertical 36610V and horizontal 36610H component. Each of these may have further processing components (not separately labeled) within the beamforming elements 36620. The receiver 15300 may utilize baseband processing circuitry 392, as described above, or may comprise other circuitry. These may include a low-noise amplifier (LNA), separate I and Q mixers, and summers to combine the signals. The I and Q signals for each of the vertical 36610V and horizontal 36610H components may be provided to a variable gain amplifier (VGA) 36630 and a carrier recovery circuit 36640. ADCs 36650 may be provided for each of the VI, VQ, HI, and HQ signal lines. As can be seen in FIG. 366, a novel MSFFPE 36660 is provided that acquires signals after they have been converted into digital, and these may be subject to a clock delay 36664. The delay signals may be processed by the polarizer and equalizer components 36662 to provide the filtering via equalization and polarization processing, and the output signals may be provided on the analog side of the ADCs 36650. The equalization may be performed by utilizing an integrating decision feedback equalizer (DFE) summer, described in more detail below.

FIG. 367 is a circuit diagram illustrating a conventional summer 36700, and FIG. 368 is a circuit diagram illustrating an integrating DFE summer 36800, with the relevant differences highlighted. In the conventional summer 36700, the bandwidth is limited by an RC time constant created by the resistors 36710 and capacitance 36720. In addition to being bandwidth limited, this design has a high power consumption due to static current and a gain-bandwidth tradeoff.

In contrast, the integrating DFE summer 36800 has a low power design since there is no static current and no settling time requirement. The resistors 36710 of the conventional summer 36700 are replaced with resettable capacitors 36810, and the output capacitor voltage is reset during the reset (of CLK=0). The capacitance 36820 is the same as the capacitance 36720, described above. The charge is then integrated during the integration (of CLK=1), which is then sampled at the end.

FIG. 369 is a schematic diagram that provides more details about the DFE summer 36900 design. An op amp 36910 is provided for common mode feedback related to boost devices 36950 for bandwidth enhancement and offset cancelation. Signals may be provided to a pre-amplifier 36920 and then to a slicer 36930 for output. The circuit also comprises DFE feedback taps 36940 and a DFE input 36960.

FIG. 370 is a graph 37000 related to the DFE summer 36900 design showing the clock signal 37005 with respect to the summing amplifier out signal 37010 and the strong-arm-1 (SA1) signal 37020. The summer utilizes the above-discussed reset switch, with two phases: reset and integrate. It can support a full 5 GHz clock rate for 5G symbols/s, and provides common-mode feedback. The cascode-configured devices provide for bandwidth enhancement, and the boost devices may be provided for bandwidth and offset cancelation. AC-coupling capacitors may be provided to remove offsets, and a use of seven pre-amplifiers and slices may provide for seven different thresholds (offsets). An intentional clock skew may be provided between the CLK SUM and the CLK_SLICER to enable sampling of the summer output at an optimal point.

Reference is made to FIG. 371, which schematically illustrates a block diagram of an RF device 371100, in accordance with some demonstrative aspects. As shown in FIG. 371, in some demonstrative aspects, RF device 371100 may include a transceiver. For example, the transceiver may include a half-duplex transceiver, a full-duplex transceiver or the like. The RF device described herein can be incorporated in one or more circuits within the RF circuitry 325 (FIG. 3D) of mmWave communication circuitry 300 shown in FIG. 3A, although the RF device is not limited to such.

In to some demonstrative aspects, RF device 371100 may be used in conjunction with one or more types of wireless communication signals and/or systems, e.g., as described above.

In some demonstrative aspects, RF device 371100 may include and/or may be operably coupled to an at least one antenna 371101. For example, antenna 371101 may include a phased-array antenna, a multiple element antenna, a set of switched beam antennas, and/or the like.

In some demonstrative aspects, at least one antenna 371101 may implement transmit and receive functionalities using separate transmit and receive antenna elements. In some demonstrative aspects, at least one antenna 371101 may implement transmit and receive functionalities using common and/or integrated transmit/receive elements.

In some demonstrative aspects, RF device 371100 may include, for example, a Tx/Rx switch 371105, which may be configured to switch, for example, the at least one antenna to apply an Rx signal to, for example, an Rx path of RF device 371100, or to switch the at least one antenna 371101 to receive a Tx signal, for example, from a Tx path of RF device 371100, e.g., as described below.

In some demonstrative aspects, RF device 371100 may include, for example, a Power Amplifier (PA) 371110, which may be configured to amplify an Tx RF signal into the Tx signal, e.g., as described below. For example, PA 371110 may include a wideband PA, a low band PA, an analog PA, a digital PA, a combined analog and digital PA, an outphasing PA, a Doherty PA, or the like.

In some demonstrative aspects, RF device 371100 may include, for example, a Low Noise Amplifier (LNA) 371115, which may be configured to amplify the Rx signal into an Rx RF signal, e.g., as described below. For example, LNA 371115 may include a wideband amplifier, a low band amplifier, an analog amplifier, a digital amplifier, a combined digital and analog amplifier, or the like.

In some demonstrative aspects, RF device 371100 may include, for example, a phase shifter 371120, which may be configured to shift a phase of the Tx RF signal, e.g., as described below.

In some demonstrative aspects, RF device 371100 may include, for example, a phase shifter 371125, which may be configured to shift a phase of an Rx signal, e.g., as described below.

In some demonstrative aspects, phase shifter 371120 and/or phase shifter 371120 may include, for example, transistor circuitry.

In some demonstrative aspects, RF device 371100 may include, for example, a Tx/Rx switch 371130, which may be configured to switch, for example, mixer 371125, to receive the Tx signal from the Tx path, or to switch, for example, mixer 371120, to provide the Rx signal to the RF path, e.g., as described below. For example, Tx/Rx switch 371130 may include a plurality of Field Effect Transistors (FETs), switching circuitry, switching logic, switching sub-systems, or the like.

In some demonstrative aspects, RF device 371100 may include, for example, a splitter/combiner 371135, which may be configured to combine, for example, one or more RF signals, and/or to split, for example, one or more RF signals. For example, splitter/combiner 371135 may include a 1:4 splitter/combiner, a 1:6 splitter/combiner, a 2:6 splitter/combiner, a Wilkinson splitter/combiner, an analog splitter/combiner, a digital splitter/combiner and/or any combination of the analog splitter/combiner with the digital splitter/combiner.

In some demonstrative aspects, RF device 371100 may include, for example, a Tx/Rx switch 371140, which may be configured to switch, for example, splitter/combiner 371135, to receive the Tx signal from the Tx path, or to provide the Rx signal to the RF path, e.g., as described below. For example, Tx/Rx switch 371140 may include, for example, a plurality of FETs, switching circuitry, switching logic, switching sub-systems or the like.

In some demonstrative aspects, RF device 371100 may include, for example, an Rx amplifier 371145, which may be configured to amplify, for example, the Rx RF signal.

In some demonstrative aspects, RF device 371100 may include, for example, a Tx amplifier 371150, which may be configured to amplify, for example, the Tx RF signal.

In some demonstrative aspects, Rx amplifier 371145 and/or Tx amplifier 371150 may include, for example, a wideband amplifier, a low band amplifier, an IF amplifier, an analog amplifier, a digital amplifier and/or any other amplifier.

In some demonstrative aspects, RF device 371100 may include, for example, a mixer 371155, which may be configured to upconvert, for example, a Tx IF signal into the Tx RF signal, e.g., as described below.

In some demonstrative aspects, RF device 371100 may include, for example, a mixer 371160, which may be configured to downconvert, for example, the Rx RF signal into an Rx IF signal, e.g., as described below.

In some demonstrative aspects, mixer 371135 and/or mixer 371160 may include, for example, a Gilbert cell mixer, an analog mixer, a digital mixer and/or any other mixer.

In some demonstrative aspects, RF device 371100 may include, an IF unit 371170, which may be configured to generate, for example, Tx IF signals and/or to process, for example, Rx IF signals, e.g., as described below.

In some demonstrative aspects, IF unit 371170 may include, digital circuitry, analog circuitry and/or any other IF circuitry.

In some aspects, for example, RF device 371100 may be configured to operate in a Tx mode or an Rx mode.

In some demonstrative aspects, when RF device 371100 is at the Tx mode, Tx/Rx switches 371140, 371130 and 371105 may be switched to connect the Tx path. In one example, IF unit 371170 may generate the Tx IF Tx and may provide the Tx IF signal to mixer 371155. Mixer 371155 may upconvert the Tx IF into the Tx RF signal, at a desired frequency band, for example, 60 GHz frequency band.

In some demonstrative aspects, at the Tx mode, Tx amplifier 371145 may amplify the Tx RF signal and splitter/combiner 371135, e.g., at a splitter mode, may provide the Tx RF signal via Tx/Rx switch 371130 to phase shifter 371125. Phase shifter 371125 may shift, for example, a phase of the Tx RF signal to a desired phase, for example, according to a consolation point map. PA 371110 may amplify the Tx RF signal into the Tx signal. The Tx signal may be transmitted via the at least one antenna 371101.

In some demonstrative aspects, when RF device is at the Rx mode, Tx/Rx switches 371140, 371130 and 371105 may be set to connect the Rx path to at least one antenna 371101.

In some demonstrative aspects, at the Rx mode, the Rx signal may be received by LNA 371115 from the at least one antenna 371101 via Tx/Rx switch 371105. LNA 371115 may amplify the Rx signal into the Rx RF signal. Phase shifter 371120 may shift a phase of the Rx RF signal to a desired phase, for example, according to a constellation point map.

In some demonstrative aspects, at the Rx mode, combiner/splitter 371130 may operate at a combiner mode. In this mode, combiner/splitter 371130 may provide the Rx RF signal to Rx amplifier 371150. Mixer 371160 may downconvert the Rx RF signal into an Rx IF signal. The Rx IF signal may be provided, for example, to IF circuitry 371170. IF circuitry 371170 may be configured to process the Rx IF signal Referring back to FIG. 4, in some demonstrative aspects, RF circuitry 425 may be configured according to a radio architecture, which may include at least one bidirectional amplifier, which may be configured to amplify RF signals at a Tx direction of RF circuitry 425 and/or at an Rx direction of RF circuitry 425, e.g., as described below.

In some demonstrative aspects, in some use cases and/or scenarios it may be advantageous to implement radio architectures, which may share one or more circuits for transmit and receive paths, e.g., as described below. The receive and/or transmit paths may include, for example, one or more amplifiers, one or more splitters, one or more combiners, one or more mixers, and/or one or more other additional or alternative components, if required.

In some demonstrative aspects, a radio architecture may include a bi-directional amplifier circuit, e.g., as described below. Advantageously, the bi-directional amplifier circuit may provide similar performance as, for example, a circuit that includes a separate circuit, e.g., a PA, for a transmit path, a separate circuit, e.g., a LNA, for a receive path, and one or more switches to switch between the PA and the LNA.

In some demonstrative aspects, the bi-directional amplifier, when implemented in the radio architecture, may provide one or more benefits and/or solve one or more technical problems, for example, by eliminating the need for switches, may improve performance by eliminating insertion losses, and/or may reduce an area size of the radio architecture circuit for example, even by 50%, e.g., as described below.

In some demonstrative aspects, the radio architecture may include, for example, at least one bi-directional amplifier, at least one bi-directional mixer, and at least one bi-directional splitter/combiner, e.g., as described below.

In some demonstrative aspects, the bi-directional amplifier circuitry may be included as part of, and/or may perform one or more operations and/or functionalities of, up-conversion and down conversion circuitry, e.g., as part of sub-system 415 (FIG. 4), filtering and amplification circuitry, e.g., as part of sub-system 424 (FIG. 4), power combining and dividing circuitry, e.g., as part of sub-system 430 (FIG. 4), and/or radio chain circuitry, e.g., as part of sub-system 435 (FIG. 4), and/or any other sub-system and/or element, if desired.

Reference is now made to FIG. 372, which schematically illustrates a block diagram of an RF device 372100, in accordance with some demonstrative aspects. For example, one or more elements and/or components of RF device 372100 may be implemented as part of a transceiver, e.g., as described above with reference to FIG. 1 and/or FIG. 1A. The RF device described herein can also be incorporated in one or more circuits within the RF circuitry 325 (FIG. 3D) of mmWave communication circuitry 300 shown in FIG. 3A, although the RF device is not limited to such.

In some demonstrative aspects, RF device 372100 may include a transceiver configured to transmit a Tx signal, and to receive a Rx signal, e.g., as described below.

In some demonstrative aspects, the transceiver may include a fifth generation (5G) cellular transceiver.

In some demonstrative aspects, the transceiver may include a 60 GHz transceiver configured to transmit the Tx signal and to receive the Rx signal over a 60 GHz frequency band. However, in other aspects the transceiver may include a transceiver configured to transmit the Tx signal and/or receive the Rx signal over any other frequency band, e.g., a frequency band that is above 45 GHz.

In other aspects, the transceiver may include any other type of transceiver configured to transmit and receive over any other additional or alternative frequency band.

In some demonstrative aspects, the transceiver may include a half-duplex transceiver.

In some demonstrative aspects, RF device 372100 may include, and/or may be operably coupled to, at least one antenna 372101, e.g., including one or more phase array antennas and/or any other type of antennas.

In some demonstrative aspects, RF device 372100 may include one or more bi-directional amplifiers, for example, including a bi-directional amplifier 372105, e.g., as described below.

In some demonstrative aspects, bi-directional amplifier 372105 may configured to perform one or more operations and/or functionalities of a PA and/or an LNA, e.g., as described below.

In some demonstrative aspects, RF device 372100 may include a phase shifter 372110 operably coupled to a bi-directional amplifier 372105, e.g., as described below.

In some demonstrative aspects, RF device 372100 may be coupled to a plurality of antennas 372101 (not shown) via a plurality of antenna paths. For example, an antenna path may include a bi-directional amplifier 372105 and a phase shifter 372110.

In some demonstrative aspects, RF device 372100 may include a splitter/combiner 372115 operably coupled to the phase shifter 372110 and the bi-directional amplifier 372120, e.g., as described below. For example, splitter/combiner 372115 may be configured to split a Tx signal to the plurality of antenna paths, and to combine a plurality of Rx signals from the plurality of antenna paths, e.g., as described below.

In some demonstrative aspects, bi-directional amplifier 372120 may be configured to perform one or more operations and/or functionalities of a Tx IF amplifier and/or a Rx IF amplifier, e.g., as described below. The Tx IF amplifier and/or the Rx IF amplifier may be implemented, for example, by a wideband amplifier, a low band amplifier, a digital amplifier, an analog amplifier and/or combined analog-digital amplifier, e.g., as described below.

In some demonstrative aspects, RF device 372100 may include a mixer 372125 operably coupled to bi-directional amplifier 372120, e.g., as described below.

In some demonstrative aspects, RF device 372100 may include IF circuitry 372170 coupled to mixer 372125, e.g., as described below.

In some demonstrative aspects, RF device 372100 may include control circuitry 372180, which may be configured to switch bi-directional amplifiers 372105 and/or 372120 between a Tx mode, for example, to handle a Tx signal, and an Rx mode, for example, to handle an Rx signal, e.g., as described below.

In some demonstrative aspects, at the Tx mode, for example, IF circuitry 372170 may provide a Tx IF signal to mixer 372155, and mixer 372155 may upconvert the Tx IF signal into a Tx RF signal at a desired frequency band, for example, a 60 GHz frequency band and/or any other frequency band.

In some demonstrative aspects, bi-directional amplifier 372120 may amplify the Tx RF signal, and may provide an amplified Tx RF signal to splitter/combiner 372115. For example, splitter/combiner 372215 may provide the amplified Tx RF signal to phase shifter 372110, for example, by splitting the Tx RF signal between the plurality of antenna paths. For example, phase shifter 372110 may shift a phase of the amplified Tx RF signal to a desired phase, e.g., based on a modulation scheme.

In some demonstrative aspects, bi-directional amplifier 372105 may amplify the amplified Tx RF signal from phase shifter 372110, and may provide a Tx signal to antenna 372101.

In some demonstrative aspects, at the RX mode, an Rx signal may be received by one or more antennas 372101. Bi-directional amplifier 372120 may amplify the Rx signal, e.g., from an antenna 372101, and may provide an amplified Rx RF signal to phase shifter 372110. Phase shifter 372110 may shift the phase of the amplified Rx RF signal to a desired phase, for example, based on a modulation scheme, e.g., a Quadrature Amplitude modulation (QAM) scheme, or any other scheme.

Combiner/splitter 372115 may provide the amplified Rx RF signal to bi-directional amplifier 372120, for example, by combining the amplified Rx RF signal from a plurality of antenna paths.

In some demonstrative aspects, bi-directional amplifier 372120 may amplify the amplified Rx RF signal, and may provide the amplified Rx RF signal to mixer 372125. Mixer 372125 may downconvert the amplified Rx RF signal into an Rx IF signal. IF circuitry 372170 may process the Rx IF signal.

In some demonstrative aspects, a bidirectional amplifier, e.g., bidirectional amplifier 372105 and/or bidirectional amplifier 372120, may include a first amplifier to amplify a Tx signal to provide an amplified Tx signal at the Tx mode, and a second amplifier to amplify the Rx signal to provide an amplified Rx signal at the Rx mode, e.g., as described below.

In some demonstrative aspects, the bidirectional amplifier, e.g., bidirectional amplifier 372105 and/or bidirectional amplifier 372120, may include a first transformer to provide the Tx signal from a first input/output to the first amplifier at the Tx mode, and to output the amplified Rx signal from the second amplifier at the first input/output at the Rx mode, e.g., as described below.

In some demonstrative aspects, the bidirectional amplifier, e.g., bidirectional amplifier 372105 and/or bidirectional amplifier 372120, may include a second transformer to provide the Rx signal from a second input/output to the second amplifier at the Rx mode, and to output the amplified Tx signal from the first amplifier at the second input/output at the Tx mode, e.g., as describe below.

In some demonstrative aspects, the bidirectional amplifier, e.g., bidirectional amplifier 372105 and/or bidirectional amplifier 372120, may include a plurality of switches to, at the Tx mode, switch a plurality of activating voltages to the first amplifier and a plurality of deactivating voltages to the second amplifier, e.g., as described below.

In some demonstrative aspects, for example, according to a first implementation scheme, the plurality of switches may be configured to, at the Rx mode, switch the plurality of activating voltages to the second amplifier and the plurality of deactivating voltages to the first amplifier, e.g., as described below.

In some demonstrative aspects, the plurality of activating voltages may include a drain voltage to be applied to at least one drain of the first amplifier at the Tx mode, and to be applied to at least one drain of the second amplifier at the Rx mode, e.g., as described below. In one example, the switches may be configured to apply a drain voltage to at least one drain of the first amplifier at the Tx mode, and to at least one drain of the second amplifier at the Rx mode, e.g., as described below.

In some demonstrative aspects, the plurality of deactivating voltages may include a source voltage to be applied to the at least one drain of the second amplifier at the Tx mode, and to be applied to the at least one drain of the first amplifier at the Rx mode, e.g., as described below. In one example, the switches may be configured to apply a source voltage to the at least one drain of the second amplifier at the Tx mode, and to the at least one drain of the first amplifier at the Rx mode, e.g., as described below.

In some demonstrative aspects, the plurality of switches may include a first switch to switch the at least one drain of the second amplifier between the drain voltage at the Tx mode, and a source voltage at the Rx mode and a second switch to switch the at least one drain of the first amplifier between the source voltage at the Tx mode and the drain voltage at the Rx mode, e.g., as described below.

In some demonstrative aspects, bidirectional amplifier 372105 and/or bidirectional amplifier 372120 may include a first capacitor to provide the Tx signal from the first transformer to a first input of the first amplifier, a second capacitor to provide the Tx signal from the first transformer to a second input of the first amplifier, a third capacitor to provide the Rx signal from the second transformer to a first input of the second amplifier, and a fourth capacitor to provide the Rx signal from the second transformer to a second input of the second amplifier, e.g., as described below.

In some demonstrative aspects, at least one amplifier of the first and second amplifiers of bidirectional amplifier 372105 and/or bidirectional amplifier 372120 may include a common source Negative Metal Oxide Semiconductor (NMOS) FET, e.g., as described below.

In some demonstrative aspects, for example, according to a second implementation scheme, the plurality of activating voltages may include a drain voltage to be applied to at least one drain of the first amplifier at the Tx mode, and to be applied to at least one drain of the second amplifier at the Rx mode, e.g., as described below.

In some demonstrative aspects, the plurality of activating voltages may include a bias voltage to be applied to at least one gate of the first amplifier at the Tx mode, and to be applied to at least one gate of the second amplifier at the Rx mode, e.g., as described below.

In some demonstrative aspects, the plurality of activating voltages may include a source voltage to be applied to at least one source of the first amplifier at the Tx mode, and to be applied to at least one source of the of the second amplifier at the Rx mode, e.g., as described below.

In some demonstrative aspects, the plurality of deactivating voltages may include the drain voltage to be applied to the at least one gate of the second amplifier at the Tx mode, and to be applied to the at least one gate of the first amplifier at the Rx mode; and the bias voltage to be applied to the at least one source of the second amplifier at the Tx mode, and to be applied to the at least one source of the first amplifier at the Rx mode, e.g., as described below.

In some demonstrative aspects, the plurality of switches may include a first switch to switch the at least one drain of the second amplifier and the at least one gate of the first amplifier between the drain voltage at the Tx mode and the bias voltage at the Rx mode; a second switch to switch the at least one source of the first amplifier between the bias voltage at the Tx mode and the source voltage at the Rx mode; a third switch to switch the at least one source of the second amplifier between the source voltage at the Tx mode and the bias voltage at the Rx mode; and/or a fourth switch to switch the at least one drain of the second amplifier and the at least one gate of the first amplifier between the bias voltage at the Tx mode, and the drain voltage at the Rx mode, e.g., as described below.

In some demonstrative aspects, for example, according to a third implementation scheme, the plurality of activating voltages may include a drain voltage to be applied to at least one source of the first amplifier at the Tx mode, and to be applied to at least one drain of the second amplifier at the Rx mode, e.g., as described below.

In some demonstrative aspects, the plurality of activating voltages may include a source voltage to be applied to at least one drain of the first amplifier at the Tx mode, and to be applied to at least one source of the second amplifier at the Rx mode, e.g., as described below.

In some demonstrative aspects, the plurality of activating voltages may include a first bias voltage to be applied to at least one gate of the first amplifier at the Tx mode, and a second bias voltage to be applied to at least one gate of the second amplifier at the Rx mode, e.g., as described below.

In some demonstrative aspects, the plurality of deactivating voltages may include the first bias voltage to be applied to the at least one drain of the second amplifier and to the at least one source of the second amplifier at the Tx mode, and the second bias voltage to be applied to the at least one drain of the first amplifier and to the at least one source of the first amplifier at the Rx mode, e.g., as described below.

In some demonstrative aspects, the plurality of switches may include a first switch to switch the at least one drain of the second amplifier and the at least one gate of the first amplifier between a source voltage, at the Tx mode, and the second bias voltage at the Rx mode; a second switch to switch the at least one source of the first amplifier between the first bias voltage at the Tx mode and the source voltage at the Rx mode; a third switch to switch the at least one source of the second amplifier between the drain voltage at the Tx mode and the second bias voltage at the Rx mode; and/or a fourth switch to switch the at least one drain of the first amplifier and the at least one gate of the second amplifier between the first bias voltage at the Tx mode and the drain voltage at the Rx mode, e.g., as described below.

In some demonstrative aspects, the first amplifier may include one or more Positive Metal Oxide Semiconductor (PMOS) FETs, and/or the second amplifier may include one or more Negative Metal Oxide Semiconductor (NMOS) FETs, e.g., as described below.

In some demonstrative aspects, control circuitry 372180 may be configured to provide a plurality of control signals to controllably switch the plurality of switches between the first amplifier and the second amplifier of the bi-directional amplifier 372105 and/or bi-directional amplifier 372120, for example, according to the Tx mode or the Rx mode, e.g., as described below.

In some demonstrative aspects, the first amplifier of bi-directional amplifier 372105 and/or bi-directional amplifier 372120 may include, for example, a PA, and/or the second amplifier of bi-directional amplifier 372105 and/or bi-directional amplifier 372120 may include an LNA, e.g., as described below.

In some demonstrative aspects, the first amplifier of bi-directional amplifier 372105 and/or bi-directional amplifier 372120 may include, for example, a first common source FET pair; and/or the second amplifier of bi-directional amplifier 12105 and/or bi-directional amplifier 372120 may include a second common source FET pair, e.g., as described below.

Reference is made to FIG. 373, which schematically illustrates a bi-directional amplifier circuit 373100, in accordance with some demonstrative aspects. For example, bi-directional amplifier 372105 (FIG. 372) and/or bi-directional amplifier 372120 (FIG. 372) may implement one or more elements and/or functionalities of bi-directional amplifier circuit 373100. The bi-directional amplifier described herein can be incorporated in one or more circuits (e.g., radio chain circuitry 325) within the RF circuitry 325 (FIG. 3D) of mmWave communication circuitry 300 shown in FIG. 3A, although the amplifier circuitry is not limited to such.

In some demonstrative aspects, bi-directional amplifier 373100 may include a common-source FET differential pair of transistors (Q1) 373110 and (Q2) 373120, a common-source FET differential pair of transistors (Q3) 373130 and (Q3) 373140, an input/output node 13150, an input/output node 373155, an input/output node 373160, an input/output node 373165, a transformer 373170, a transformer 373175, and a plurality of switches, e.g., including switches 373180, 373185, 373190, and/or 13195, e.g., as described below.

In some demonstrative aspects, a first common source transistor pair, for example, transistors (Q1) 373110, (Q2) 373120, and a second common source transistor pair, for example, transistors (Q3) 373130 and (Q4) 373140, may be of the same type and may include an NMOSFET or a PMOSFET, or the like.

In some demonstrative aspects, the FET may include three terminals, a source (S), a drain (D) and a gate (G). The Source (S) may be the terminal at which carriers enter the channel of the transistor. For example, current entering the channel at the source S may be designated by a source current IS. The Drain (D) may be the terminal at which the carriers leave the channel of the transistor. For example, current entering the channel at the drain (D) terminal may be designated by ID, and a drain-to-source voltage may be designated as VDS. The Gate (G) terminal may modulate the channel conductivity, for example, ID may be controlled by applying voltage to the gate (G) terminal.

In some demonstrative aspects, bi-directional amplifier 373100 may be implemented as a LNA in the Rx path and/or as a PA in the Tx path of an RF device e.g., RF device 372100 (FIG. 372).

In some demonstrative aspects, switches 373180, 373185, 373190, and/or 373195 may switch the bi-directional amplifier 373100 between the Tx mode to the Rx mode, e.g., as described below.

In some demonstrative aspects, switches 373180, 373185, 373190, and/or 373195 may activate and/or deactivate the first common source transistor pair (Q1) 373110, (Q2) 373120 and/or the second common source transistor pair (Q3) 373130 and (Q4) 373140, for example, by connecting a plurality of activating voltages and/or deactivating voltages to the common source transistor pair (Q1) 373110, (Q2) 373120 and/or the common source transistor pair (Q3) 373130 and (Q4) 373140, e.g., as described below.

In some demonstrative aspects, the plurality of activating voltages may include, for example, a drain voltage VDD that may be applied at drains (D) of the first common source transistor pair (Q1) 373110, (Q2) 373120, for example, at the Tx mode. For example, the drain voltage VDD may be applied to drains (D) of the second common source transistor pair (Q3) 373130 and (Q4) 373140, for example, at the Rx mode.

In some demonstrative aspects, the plurality of activating voltages may include a bias voltage Vbias that may be applied to gates (G) of the first common source transistor pair (Q1) 373110, (Q2) 373120, for example, at the Tx mode. For example, the bias voltage Vbias may be applied to gates of the second common source transistor pair (Q3) 373130 and (Q4) 373140, for example, at the Rx mode.

In some demonstrative aspects, the plurality of activating voltages may include a source voltage VSS that may be applied to sources (S) of the first common source transistor pair (Q1) 373110, (Q2) 373120, for example, at the Tx mode. For example, the source voltage VSS may be applied sources (S) of the second common source transistor pair (Q3) 373130 and (Q4) 373140, for example, at the Rx mode.

In some demonstrative aspects, the plurality of deactivating voltages may include the drain voltage VDD that may be applied to the gates (G) of the second common source transistor pair (Q3) 373130 and (Q4) 373140, for example, at the Tx mode, and may be applied to the gates (G) of the common first source transistor pair (Q1) 373110, (Q2) 373120, for example, at the Rx mode. For example, the bias voltage Vbias may be applied to the sources (S) of the second common source transistor pair (Q3) 373130 and (Q4) 373140, for example, at the Tx mode, and may be applied to the sources (S) of the first common source transistor pair (Q1) 373110, (Q2) 373120, for example, at the Rx mode.

In some demonstrative aspects, switch 373180 may switch the drains (D) of the second common source transistor pair (Q3) 373130 and (Q4) 373140 and the gates (G) of the first common source transistor pair (Q1) 373110, (Q2) 373120 between the drain voltage VDD, e.g., at the Tx mode, and the bias voltage Vbias, e.g., at the Rx mode.

In some demonstrative aspects, switch 373185 may switch the sources (S) of the first common source transistor pair (Q1) 373110, (Q2) 373120 between the bias voltage Vbias, e.g., at the Tx mode, and the source voltage VSS, e.g., at the Rx mode.

In some demonstrative aspects, switch 373190 may switch the sources (S) of the second common source transistor pair (Q3) 373130 and (Q4) 373140 between the source voltage VSS, e.g., at the Tx mode, and the bias voltage Vbias, e.g., at the Rx mode.

In some demonstrative aspects, switch 373195 may switch the drains (D) of the second common source transistor pair (Q3) 373130 and (Q4) 373140, and the gates (G) of the first common source transistor pair (Q1) 373110, (Q2) 373120 between the bias voltage Vbias, e.g., at the Tx mode, and the drain voltage VDD, e.g., at the RX mode. Although, it should be understood that the Tx mode and the Rx mode are interchangeable and the above example of the Tx mode may be applicable for the Rx mode and vice versa.

Reference is made to FIG. 374, which schematically illustrates a bi-directional amplifier circuit 374100, in accordance with some demonstrative aspects. For example, bi-directional amplifier 372105 (FIG. 372) and/or bi-directional amplifier 372120 (FIG. 372) may implement one or more elements and/or functionalities of bi-directional amplifier circuit 374100. The bi-directional amplifiers described herein can be incorporated in one or more circuits (e.g., radio chain circuitry 325) within the RF circuitry 325 (FIG. 3D) of mmWave communication circuitry 300 shown in FIG. 3A, although the amplifier circuitry is not limited to such.

In some demonstrative aspects, bi-directional amplifier 374100 may include a common-source FET differential pair of transistors 374110 and 374120, a common-source FET differential pair of transistors 374130 and 374140, an input/output node 374150, an input/output node 374155, a transformer 374153, an input/output node 374160, an input/output node 374165, a transformer 374163, a capacitor 374170, a capacitor 374172, a capacitor 374174, a capacitor 374176, a resistor 374180, a resistor 374182, a resistor 374184, a resistor 374180, a switch 374190 and a switch 374195, e.g., as described below In some demonstrative aspects, for example, the value of capacitors 374170, 374172, 374174 and/or a 374176 may vary between about 10 femtofarad (fF) to about 10 picofarad (pF) and the value of resistors 374180, 374182, 374184 and/or 374180 may by vary between about 100 Ohm to about 10 KOhm based on the size of transistors 374110, 374120, 374130 and/or 374140. In some demonstrative aspects, other ranges may be used.

In some demonstrative aspects, a first common source transistor pair, for example, transistors (Q1) 374110, (Q2)

374120, and a second common source transistor pair, for example, transistors (Q3) 374130 and (Q4) 374140, may be of the same type and may include an NMOSFET or a PMOSFET, or the like.

In some demonstrative aspects, bi-directional amplifier 374100 may be implemented as a LNA in the Rx path and/or as a PA in the Tx path of an RF device e.g., RF device 372100 (FIG. 372).

In some demonstrative aspects, switches 374190 and/or 374195 may switch the bi-directional amplifier 374100 between the Tx mode to the Rx mode, e.g., as described below.

In some demonstrative aspects switches 374190 and/or 374195 may activate and/or deactivate the first common-source transistor pair (Q1) 374110 and (Q2) 374120, and/or the second common-source transistor pair (Q3) 374130 and (Q4) 374140, for example, by connecting a plurality of activating voltages and/or deactivating voltages to the common source transistor pair (Q1) 374110, (Q2) 374120, and/or the common source transistor pair (Q3) 374130 and (Q4) 374140, e.g., as described below.

In some demonstrative aspects, the plurality of activating voltages may include, for example, a drain voltage VDD that may be applied to drains (D) of the first common-source transistor pair (Q1) 374110 and (Q2) 374120, for example, at the Tx mode, and/or may be applied to drains (D) of the second common-source FET differential pair transistors (Q3) 374130 and (Q4) 374140, for example, at the Rx mode.

In some demonstrative aspects, the plurality of deactivating voltages may include a source voltage VSS that may be applied to the drains (D) of the second common-source transistor pair (Q3) 374130 and (Q4) 374140, for example, at the Tx mode, and/or may be applied to the drains (D) of the first common-source transistor pair (Q1) 374110 and (Q2) 374120, for example, at the Rx mode.

In some demonstrative aspects, switch 374195 may switch the drains (D) of the common-source transistor pair (Q3) 374130 and (Q4) 374140 between the drain voltage VDD, e.g., at the Tx mode, and the source voltage VSS, e.g., at the Rx mode.

In some demonstrative aspects, switch 374190 may switch the drains of the first common-source transistor pair (Q1) 374110 and (Q2) 374120 between the source voltage VSS, e.g., at the Tx mode, and the drain voltage VDD, e.g., at the Rx mode. Although, it should be understood that the Tx mode and the Rx mode are interchangeable and the above example of the Tx mode may be applicable for the Rx mode and vice versa.

In some demonstrative aspects, for example, capacitor 374170 may provide an input signal from transformer 374153 to the gate (G) of transistor (Q3) 374130, capacitor 374176 may provide the input signal from transformer 374153 to the gate (G) of transistor (Q4) 374140, capacitor 374172 may provide an input signal from transformer 374163 to the gate (G) of transistor (Q1) 374110, and/or capacitor 374174 may provide the input signal from transformer 374163 to the gate (G) of transistor (Q2) 374120.

In some demonstrative aspects, for example, transistors (Q1) 374110, (Q2) 374120, (Q3) 374130 and/or (Q4) 374140 may be of the same type and may include an NMOSFET, or a PMOSFET, or the like.

Reference is made to FIG. 375, which schematically illustrates a bi-directional amplifier circuit 375100, in accordance with some demonstrative aspects. For example, bi-directional amplifier 372105 (FIG. 372) and/or bi-directional amplifier 372120 (FIG. 372) may implement one or more elements and/or functionalities of bi-directional amplifier circuit 375100.

In some demonstrative aspects, bi-directional amplifier 375100 may include a common-source FET differential pair of transistors (Q1) 375110 and (Q2) 375120, a common-source FET differential pair of transistors (Q3) 375130 and (Q4) 375140, an input/output node 375150, an input/output node 375155, an input/output node 375160, an input/output node 375165, a transformer 375170, a transformer 375175, and a plurality of switches (fix also above), for example, including switches 375180, 375185, 375190, and/or 375195, e.g., as described below.

In some demonstrative aspects, a first common source transistor pair, for example, transistors (Q1) 375110, (Q2) 375120, may be of the same type and may include an NMOSFET, and/or a second common source transistor pair, for example, transistors (Q3) 375130 and (Q4) 375140 may be of the same type and may include a PMOSFET.

In some demonstrative aspects, the first common source transistor pair, for example, transistors (Q1) 375110, (Q2) 375120, may be of the same type, and may include a PMOSFET, and/or the second common source transistor pair, for example, transistors (Q3) 375130 and (Q4) 375140, may be of the same type and may include an NMOSFET.

In other aspects, transistors 375110, 375120, 375130 and/or 375140 may include any other type of transistors.

In some demonstrative aspects, bi-directional amplifier 375100 may be implemented as a LNA in the Rx path and/or as a PA in the Tx path of an RF device e.g., RF device 372100 (FIG. 372).

In some demonstrative aspects, switches 375180, 375185, 375190 and/or 375195 may switch bi-directional amplifier 375100 between the Tx mode to the Rx mode, e.g., as described below.

In some demonstrative aspects, switches 375180, 375185, 375190 and/or 375195 may activate and/or deactivate the first common-source transistor pair (Q1) 375110 and (Q2) 375120 and/or the second common-source transistor pair (Q3) 375130 and (Q4) 375140, for example, by connecting a plurality of activating voltages and/or deactivating voltages to the first common source transistor pair (Q1) 375110, (Q2) 375120 and/or the second common source transistor pair (Q3) 375130 and (Q4) 375140, e.g., as described below.

In some demonstrative aspects, the plurality of activating voltages may include, for example, a drain voltage VDD that may be applied to sources (S) of the second common-source transistor pair (Q3) 375130 and (Q4) 375140, for example, at the Tx mode, and/or may be applied to drains (D) of the first common-source transistor pair (Q1) 375110 and (Q2) 375120, for example, at the Rx mode.

In some demonstrative aspects, the plurality of activating voltages may include, for example, a source voltage VSS that may be applied to drains (D) of the second common-source transistor pair (Q3) 375130 and (Q4) 375140, for example, at the Tx mode, and/or may be applied to sources (S) of the first common-source transistor pair (Q1) 375110 and (Q2) 375120, for example, at the Rx mode.

In some demonstrative aspects, the plurality of activating voltages may include, for example, a first bias voltage Vbias1 that may be applied to gates (G) of the second common-source transistor pair (Q3) 375130 and (Q4) 375140, for example, at the Tx mode, and/or a second bias voltage Vbias2 may be applied to gates (G) of the first common-source transistor pair (Q1) 375110 and (Q2) 375120, for example, at the Rx mode.

In some demonstrative aspects, the plurality of deactivating voltages may include the first bias voltage Vbias1 that may be applied to the drains (D) and to the sources (S) of the first common-source transistor pair (Q1) 375110 and (Q2) 375120, for example, at the Tx mode, and/or the second bias voltage Vbias2 may be applied to the drains (D) and to the sources (S) of the second common-source transistors pair (Q3) 375130 and (Q4) 375140, for example, at the Rx mode.

In some demonstrative aspects, switch 375195 may switch the drains (D) of the second common-source transistor pair (Q3) 375130 and (Q4) 375140 and the gates (G) of the first common-source transistor pair (Q1) 375110 and (Q2) 375120 between the source voltage VSS, e.g., at the Tx mode, and the second bias voltage Vbias2, e.g., at the Rx mode.

In some demonstrative aspects, switch 375190 may switch the sources (S) of the first common-source transistor pair (Q1) 375110 and (Q2) 375120 between the first bias voltage Vbias1, e.g., at the Tx mode, and the source voltage VSS, e.g., at the Rx mode.

In some demonstrative aspects, switch 375185 may switch the sources (S) of the second common-source transistor pair (Q3) 375130 between the drain voltage VDD, e.g., at the Tx mode, and the second bias voltage Vbias2, e.g., at the Rx mode.

In some demonstrative aspects, switch 375180 may switch the drains (D) of the first common-source transistor pair (Q1) 375110 and (Q2) 375120 and the gates (G) of the second common-source transistor pair (Q3) 375130 between the first bias voltage Vbias1, e.g., at the Tx mode, and the drain voltage VDD, e.g., at the Rx mode.

Referring back to FIG. 4, in some demonstrative aspects, RF circuitry 425 may be configured according to a radio architecture, which may include at least one bi-directional splitter and combiner circuitry, which may be configured to, at the Tx direction of RF circuitry 425, split RF signals and/or to, at the Rx direction of RF circuitry 425, combine the RF signals from a plurality of antennas, e.g., as described below.

In some demonstrative aspects, mm-wave applications, such as, for example, 5G of cellular systems and/or WLAN with communication frequency of around 60 GHz, for example, WiGig, may include bi-directional splitter and combiner circuitry, e.g., as described below.

In some demonstrative aspects, the bi-directional splitter and combiner circuitry may include a plurality of low current amplifiers. For example, the low current amplifiers may be configured, for example, to a 50 Ohm impedance, or any other impedance, for example, by using, a RF load/source, for example, a transformer which may be operably coupled with a common port to the low current amplifiers, e.g., by a plurality of resistors, e.g., as described below.

In some demonstrative aspects, the RF load/source may be implemented as part of, coupled to, and/or used in, a splitting network as, for example, an RF source, e.g., as described below.

In some demonstrative aspects, the RF load/source may be implemented as part of, coupled to, and/or used in, a combining network as, for example, an RF load, e.g., as described below.

In some demonstrative aspects, the RF load/source, for example, may represent an impedance of a circuit, e.g., amplification circuitry, which may be coupled to the bi-directional splitter and combiner circuitry.

In one example, the transformer and/or the RF load may be implemented as part of, coupled to, and/or used in, a splitting network, e.g., as described below. The splitting network may split a signal from an input port to, for example, six or more output ports, e.g., as described below. In other aspects, any other number of output ports may be used.

In one example, the transformer and/or the RF load/source may be implemented as part of, coupled to, and/or used in, a combining network, e.g., as described below. The combining network may combine signals from, for example, six or more input ports into a signal at an output port. In other aspects, any other number of input ports may be used.

In some demonstrative aspects, an active bidirectional splitter and combiner (ABDSC) may utilize a plurality of transistors, which may be implemented, for example, into a topology of the low current amplifiers. For example, the low current amplifiers may be used to operate as both current switches and/or matching elements, due to their parasitics, e.g., internal capacitance and/or resistance, e.g., as described below.

Advantageously, in some demonstrative aspects, the ABDSC may be implemented, for example, even in a small sized package, e.g., having a low current consumption, a high isolation between the ports, a low insertion loss, a good matching performance on all ports. In some aspects, the ABDSC may be configured provide to some or all of these attributes, technical advantages and/or benefits, and/or to provide one or more additional or alternative attributes and/or technical advantages and/or benefits.

In some demonstrative aspects, the ABDSC may be configured to operate at two modes of operation, for example, a combining mode and/or splitting mode, e.g., as described below.

In some demonstrative aspects, for example, at the combining mode, the low current amplifiers may drive their current through the RF load/source and/or the transformer, resulting in combining of current from one or more, e.g., all, active amplifiers, e.g., as described below.

In some demonstrative aspects, for example, at the splitting mode, the common input may drive multiple amplifiers by the RF load/source, e.g., the RF source, and/or the transformer, e.g., as described below.

In some demonstrative aspects, the ABDSC may be configured, for example, to provide one or more technical benefits and/or advantages, for example, to even allow improved or optimal power combining and/or power splitting, for example, for at least some applications supporting multiple radiating elements, such as, for example, 5G, WiGig, and the like. For example, 5G and/or WiGig devices may include phased array antennas and/or multiple-input-multiple-output (MIMO) architectures. In other aspects, the ABDSC may be implemented with any other technology and/or with respect to any other wireless communication frequency bands and/or devices.

In some demonstrative aspects, the ABDSC may be implemented, for example, according to a cascode topology, e.g., as described below.

In some demonstrative aspects, the ABDSC may be implemented, for example, according to a Common-Source (CS) topology, e.g., as described below.

In some demonstrative aspects, the ABDSC may be implemented, for example, according to a Common-Source/Common-Gate (CG/CS) topology, e.g., as described below.

In some demonstrative aspects, the ABDSC may be implemented, for example, according to a Common-Gate topology (CG) topology, e.g., as described below.

In other aspects, the ABDSC may be implemented based on a combination of the topologies and/or according to any other additional or alternative topology.

In some demonstrative aspects, the ABDSC may be included as part of, and/or may perform one or more operations and/or functionalities of, power combining/dividing circuitry, e.g., as part of sub-system 430 (FIG. 4), if desired.

Reference is now made to FIG. 376, which schematically illustrates a block diagram of a transceiver 376000 including a cascode topology of an ABDSC 376100, in accordance with some demonstrative aspects.

In some demonstrative aspects, transceiver 376000 may be configured to transmit one or more Tx signals, and to receive one or more Rx signals, e.g., as described below.

In some demonstrative aspects, transceiver 376000 may include, for example, a 60 GHz transceiver configured to transmit the Tx signals and to receive the Rx signals over a 60 GHz frequency band.

In some demonstrative aspects, the transceiver may include a half-duplex transceiver.

In some demonstrative aspects, transceiver 376000 may include a 5G cellular transceiver.

In other aspects, transceiver 376000 may include any other type of transceiver and/or may be configured to communicate the Tx and/or Rx signals over any other frequency band.

In some demonstrative aspects, transceiver 376000 may include or may be operably coupled to one or more antennas 376200.

In some demonstrative aspects, antennas 376200 may include one or more phase array antennas and/or any other type of antennas.

In some demonstrative aspects, ABDSC 376100 may be switchable between a combiner mode and a splitter mode, e.g., as described below.

In some demonstrative aspects, ABDSC 376100 may include a plurality of antenna interfaces 376115, which may be configured to receive, at the combiner mode, a plurality of Rx signals from a respective plurality of antenna ports 16190, and to output, at the splitter mode, a plurality of Tx signals to the respective plurality of antenna ports 376190, e.g., as described below.

In some demonstrative aspects, ABDSC 376100 may include, an RF load/source 376101, for example, a transformer 376110 to operably couple ABDSC 376100 to amplification circuitry 376105, e.g., as described below.

In some demonstrative aspects, the impedance of the RF load/source, e.g., the RF load/source 376101, e.g., transformer 376110, may be configured to transfer, at the splitter mode, a Tx signal from amplification circuitry 376105 to the plurality of antenna interfaces 376115, e.g., as described below.

In some demonstrative aspects, RF load/source 376101, e.g., transformer 376110, may be configured to combine, at the combiner mode, the plurality of Rx signals into a combined Rx signal to be provided to amplification circuitry 376105, e.g., as described below.

In some demonstrative aspects, an antenna interface 376115 of antenna interfaces 376115 may include, for example, a first transistor pair in a cascode connection, e.g., transistors 376120 and 376130, which may be, for example, activated at the splitter mode, and deactivated at the combiner mode, for example, by a transistor, e.g., transistor 376130, of the first transistor pair, e.g., as described below.

In some demonstrative aspects, the antenna interface 376115 may include, for example, a second transistor pair in a cascode connection, e.g., transistors 376140 and 376150, which may be, for example, activated at the combiner mode, and deactivated at the splitter mode, for example, by a transistor, e.g., transistor 376150, of the second transistor pair, e.g., as described below.

In some demonstrative aspects, the first transistor pair, e.g., transistors 376120 and 376130, may include a first pair of FETs, and/or the second transistor pair, e.g., transistors 376140 and 376150, may include a second pair of FETs, e.g., as described below. In other aspects, any other types of transistors may be used.

In some demonstrative aspects, the plurality of antenna interfaces 376115 may include at least four antenna interfaces, e.g., as described below.

In some demonstrative aspects, the number of antenna interfaces 376115 may be analogues to the number of antenna ports and/or antennas. For example, for four antennas and/or antenna ports, ABDSC 376100 may include four antenna interfaces 376115. In this example, ABDSC 376100 may be referred as a 1:4 ABDSC.

In some demonstrative aspects, ABDSC 376100 may include six antenna interfaces 376115 to split and/or combine signals from/to, for example, six antennas and/or antenna ports. In this example, ABDSC 376100 may be referred as a 1:6 ABDSC.

In other aspects, ABDSC 376100 may include any other number of antenna interfaces 376115, and/or ABDSC 376100 may include any other 1:X ABDSC, wherein X>1.

In some demonstrative aspects, for example, transistors 376120, 376130, 376140 and/or 376150, may include FETs, metal oxide semiconductor FETs (MOSFET) transistors, bipolar junction transistors (BJTs), and/or any other type of transistor. The MOSFET transistors may include a negative MOSFET (NMOS) and/or a positive MOSFET (PMOS). For example, the BJT may include a Negative-Positive-Negative (NPN) transistors and/or a Positive-Negative-Positive (PNP) transistors.

In some demonstrative aspects, for example, transistors 376120, 376130, 376140 and/or 376150, may include NMOS transistors, PMOS transistors and/or a combination of NMOS and/or PMOS transistors.

Advantageously, the combination of NMOS and PMOS transistors may reduce the number of components in ABDSC 376100 such as, for example, DC block capacitors, reduce parasitics of the transistors under different biasing conditions and/or may improve the overall performance of ABDSC 376100.

In some demonstrative aspects, ABDSC 376100 may include a resistor 376180, e.g., operably coupled to transistor 376120. For example, resistor 376180 may have 150Ω resistance, and/or any other suitable value configured, for example, at least for biasing the drain (D) of transistor (Q1) 376120.

In some demonstrative aspects, ABDSC 376100 may include an active load 376180, e.g., resistor. For example, active load 376180 may include, for example, a transistor configured to be in its triode region.

In some demonstrative aspects, ABDSC 376100 may include a Direct Current (DC) voltage source 376160, for example, operably coupled to provide DC voltage to a gate (G) of transistor 376120.

In some demonstrative aspects, ABDSC 376100 may include a DC voltage source 376170, for example, operably coupled to provide DC voltage, e.g., through resistor 376180, to a drain (D) of transistor 376120.

In some demonstrative aspects, ABDSC 376100 may include and/or may be operably coupled to, controller circuitry 376107, which may be configured to controllably switch ABDSC 376100 between the splitter mode and the combiner mode, e.g., as described below.

In some demonstrative aspects, controller circuitry 376107 may be configured to switch transistor (Q4) 376150 to an OFF state, for example at the splitter mode. For example, at the splitter mode, RF load/source 376101, e.g., transformer 376110 may provide an RF signal, e.g., provided from amplification circuitry 376105, to at least some transistors, e.g., transistor 376130. For example, a signal to be provided to one or more, e.g., each, antenna of the plurality of antennas 376200 may be provided from the drain (D) of transistor 376120.

In some demonstrative aspects, controller circuitry 376105 may be configured to switch transistor 376120 to the OFF state, for example, at the combiner mode. For example, at the combiner mode, an RF signal from one or more, e.g., each, antenna of the plurality of antennas 376200 may be provided to the gate (G) of transistor 376140. For example, at the combiner mode, transistor 376150, e.g., of each antenna interface of the plurality of antenna interfaces 376115, may provide the antenna signal to RF load/source 376101, e.g., transformer 376110. For example, RF load/source 376101, e.g., transformer 376110, may combine the signals from the transistors 376150 of the plurality of antenna interfaces 376115 to provide the combined signal to amplification circuitry 376105.

The following is one example of simulated parameters, which may be achieved, for example, by a 1:4 ABDSC, e.g., a 1:4 ABDSC 376100, at the combiner mode and at the splitter mode in accordance with some demonstrative aspects:

TABLE T1

| | IL @ 65 GHz | Sii | Isolation |
|---|---|---|---|
| CASCODE-Combiner | | | |
| 1:1 | −4.4 @ 2.3 mA<br>−3.2 @ 3 mA | −6.1 | |
| 1:2 | −4.5 @ 2.3 mA | −6.1 | −39 |
| 1:3 | −4.6 @ 2.3 mA | −6 | −39 |
| 1:4 | −4.7 @ 2.3 mA<br>−3.6 @ 3 mA | −6 | −38 |
| | S11(common) <− 10 dB | | |
| CASCODE-Splitter | | | |
| | IL @ 65 GHz | Sii | Isolation |
| 1:1 | −5.5 @ 2.3 mA<br>−4.7 @ 3 mA | −6 | |
| 1:2 | −5.6 @ 2.3 mA | −6 | −40 |
| 1:3 | −5.7 @ 2.3 mA | −6 | −40 |
| 1:4 | −5.8 @ 2.1 mA<br>−5.1 @ 3 mA | −6.1 | −39 |
| | S11(common) <−8 dB | | |

The following is one example of measured parameters, which may be achieved, for example, by a 1:6 ABDSC, e.g., a 1:6 ABDSC 376100, at the combiner mode and at the splitter mode in accordance with some demonstrative aspects:

TABLE T2

| | IL @ 65 GHz | Sii | Isolation |
|---|---|---|---|
| 50 p: 100 p Q = 12, k = 0.7 | | | |
| CASCODE-Combiner | | | |
| 1:1 | −7.7 @ 2.3 mA<br>−6.4 @ 3 mA | −6.1 | −40 |
| 1:2 | −7.8 @ 2.3 mA<br>−6.6 @ 3 mA | −6.1 | −40 |
| 1:3 | −7.7 @ 2.3 mA<br>−6.6 @ 3 mA | −6.1 | −40 |
| 1:4 | −7.9 @ 2.3 mA<br>−6.7 @ 3 mA | −6.1 | −40 |
| 1:6 | −8 @ 2.3 mA<br>−7 @ 3 mA | −6.1 | −40 |
| | S11(common) <− 6.6 dB | | |
| CASCODE-Splitter | | | |
| | IL @ 65 GHz | S22 | Isolation |
| 1:1 | −8.5 @ 2.3 mA<br>−7.8 @ 3 mA | −6 | |
| 1:2 | −8.6 @ 2.3 mA<br>−8 @ 3 mA | −6 | −40 |
| 1:3 | −8.7 @ 2.3 mA<br>−8 @ 3 mA | 6 | −40 |
| 1:4 | −8.8 @ 2.3 mA<br>−8 @ 3 mA | −6 | −40 |
| 1:6 | −9 @ 2.3 mA<br>−8.3 @ 3 mA | −6.1 | −40 |
| | S11(common) <− 6.6 dB | | |

In some demonstrative aspects, amplification circuitry 376105 may include at least one power amplifier (PA), for example, to amplify Tx signals, and/or at least one Low Noise Amplifier (LNA), to amplify Rx signals.

In some demonstrative aspects, ABDSC 376100 may be operably coupled to receive the Tx signal from a bidirectional amplifier in amplification circuitry 376130, and/or to provide the combined Rx signal to a bidirectional amplifier in amplification circuitry 376150. For example, amplification circuitry 376105 may be configured to include one or more elements of and/or to perform one or more functionalities of bidirectional amplifier 372205 (FIG. 372), e.g., as described above.

In other aspects, amplification circuitry 376150 may include one or more separate amplifiers, for example, a Tx amplifier and an Rx amplifier, e.g., instead of the bidirectional amplifier.

In some demonstrative aspects, for example, amplification circuitry 376105 may be configured to amplify the combined Rx signal into an amplified Rx signal, and/or may be configured to generate the Tx signal by amplifying an upconverted Tx signal.

In some demonstrative aspects, transceiver 376000 may include a mixer, for example, mixer 372225 (FIG. 372), which may be configured to upconvert an IF Tx signal into the upconverted Tx signal, and/or to downconvert the amplified Rx signal into an IF Rx signal.

In some demonstrative aspects, transceiver 376000 may include IF circuitry, e.g., including one or more elements of IF sub-system 372170 (FIG. 372), to provide one or more IF signals to the mixer. For example, the IF circuitry may be configured to generate a first digital signal based on the IF Rx signal, and/or to generate the IF Tx signal based on a second digital signal.

Reference is now made to FIG. 377, which schematically illustrates a circuit diagram of a common source topology of an ABDSC 377100, in accordance with some demonstrative aspects.

In some demonstrative aspects, for example, ABDSC 377100 may be implemented as part of a transceiver, for example, as part of transceiver 376000 (FIG. 376), e.g., instead of ABDSC 376100 (FIG. 376). The ABDSCs described herein can be incorporated in one or more circuits (e.g., power combining and dividing circuitry 374) within the RF circuitry 325 (FIG. 3D) of mmWave communication circuitry 300 shown in FIG. 3A, although the ABDSCs are not limited to such.

In some demonstrative aspects, ABDSC 377100 may be switchable between a combiner mode and a splitter mode, e.g., as described below.

In some demonstrative aspects, ABDSC 377100 may include, for example, an RF load/source 377101, a transformer 377110 and a plurality of antenna interfaces 377115, e.g., as described below.

In some exemplary aspects, the number of antenna interfaces 377115 may be, for example, analogues to the number of antenna ports and/or antennas. For example, for four antennas and/or antenna ports ABDSC 377100 may include four antenna interfaces 377115. For example, ABDSC 377100 may be referred as 1:4 ABDSC. For six antennas and/or antenna ports, ABDSC 377100 may include six antenna interfaces 377115. For example, ABDSC 377100 may be referred as 1:6 ABDSC. In other aspects, ABDSC 377100 may include any other number of antenna interfaces 377115, and/or ABDSC 377100 may include any other 1:X ABDSC, wherein X>1.

In some demonstrative aspects, antenna interface 377115 of the plurality antenna interfaces 377115 may include, for example, a first transistor 377120 having a common source connection. For example, transistor 377120 may be activated at the splitter mode, and may be deactivated at the combiner mode, e.g., as described below.

In some demonstrative aspects, antenna interface 377115 may include a second transistor 377130 having a common source connection. For example, transistor 377130 may be activated at the combiner mode, and may be deactivated at the splitter mode, e.g., as described below.

In some demonstrative aspects, for example, transistors 377120 and 377130 may include FETs, MOSFET transistors, BJTs or the like. For example, the MOSFETs may include NMOS and/or PMOS transistors. For example, the BJT may include an NPN and/or a PNP transistors.

In one example, transistors 377120 and 377130 may include NMOS transistors, PMOS transistors and/or a combination of NMOS and PMOS transistors.

Advantageously, the combination of NMOS and PMOS transistors may reduce the number of components in ABDSC 377100 such as, for example, DC block capacitors, reduce parasitics of the transistors under different biasing conditions and may improve the overall performance of ABDSC 377100.

In other aspects, transistors 377120 and/or 377130 may include any other types of transistors.

In some demonstrative aspects, antenna interface 377115 may include a resistor 377180, which may be operably coupled to the drain (D) of transistor 377120. For example, resistor 377180 may have a 150Ω resistance, and/or any other suitable value, e.g., for biasing the drain (D) of transistor 377120. In some other aspects, antenna interface 377115 may include a load 377180, e.g., resistor 377180. For example, load 377180 may include an active load, e.g., a transistor configured to be in a triode region of the transistor.

In some demonstrative aspects, antenna interface 377115 may include a high resistance component, such as, for example a resistor 377185, which may be operably coupled to the gate (G) of transistor 377120. For example, resistor 377185 may have a 2KΩ resistance, and/or any other suitable value, e.g., for biasing the gate (G) of transistor 377120. In some other aspects, resistor 377185 may be replaced by an active load, e.g., a transistor configured to be in its triode region, and/or any other active load.

In some demonstrative aspects, antenna interface 377115 may include a resistor 377190, which may be operably coupled to the gate (G) of transistor 377130. For example, resistor 377190 may have a 2KΩ resistance, and/or any other suitable value, e.g., for biasing the gate (G) of transistor (Q1) 377130. In some other aspects, resistor 377190 may be replaced by an active load, e.g., a transistor configured to be in its triode region, and/or any other active load.

In some demonstrative aspects, antenna interface 377115 may include a capacitor 377140, which may be operably coupled to the gate (G) of transistor 377120. For example, capacitor 377140 may include a low/moderate Q capacitor, such as, for example, a 100 femto Farad (fF) for the 60 GHz bands with a Q factor of 15, which may be configured, for example, to decouple transformer 377110 from a gate biasing voltage of transistor 377120. In other aspects, any other capacitance values and Q factors may be used. In other aspects, the capacitor may be redundant, when, for example, PMOS and/or NMOS transistors may be used together.

In some demonstrative aspects, antenna interface 377115 may include a capacitor 377150, which may be operably coupled to the gate (G) of transistor 377130. For example, capacitor 377150 may include a low/moderate Q capacitor such as, for example, a 100 fF for the 60 GHz bands with a Q factor of 15, which may be configured, for example, to decouple the Drain bias of transistor 377120 from a gate biasing voltage of transistor 377130. In other aspects, any other capacitance values and Q factors may be used. In other aspects, the capacitor may be redundant, when, for example, PMOS and/or NMOS transistors may be used together.

In some demonstrative aspects, transistors 377120 and/or 377130 may be configured to operate with double functionality. For example, at a first functionality mode, transistors 377120 and/or 377130 may function as an amplifier, and/or a second functionality mode, transistors 377120 and/or 377130 may function as a switch. For example, transistors 377120 and/or 377130 may be configured to switch a directionality of ABDSC 377100, for example, between a splitter direction and/or a combiner direction, e.g., as described below.

In some demonstrative aspects, a DC voltage source 377160 may supply DC voltage to a gate (G) of transistor 377120. For example, DC voltage source 377170 may supply DC voltage, e.g., through resistor 377180, to the drain (D) of transistor 377120.

In some demonstrative aspects, ABDSC 377100 may include and/or may be operably coupled to, controller circuitry 376107 (FIG. 376), which may be configured to controllably switch ABDSC 377100 between the splitter mode and the combiner mode, e.g., as described below.

In some demonstrative aspects, controller circuitry 376107 (FIG. 376) may be configured to switch transistor 377130 to an Off state, for example, at the splitter mode. For example, at the splitter mode, RF load/source 377101, e.g., transformer 377110, may provide an RF signal, e.g., provided from amplification circuitry 376105, to at least some transistors, e.g., transistor 377120, of antenna interface 377115. For example, a signal to be provided to one or more, e.g., each, antenna of the plurality of antennas, e.g., antenna 376200 (FIG. 376), may be provided from the drain (D) of transistor 377120 of one or more, e.g., each, antenna interface of the plurality of antenna interfaces 377115.

In some demonstrative aspects, controller circuitry 376107 (FIG. 376) may be configured to switch transistor 377120 to an Off state, for example, at the combiner mode. For example, at the combiner mode, an RF signal from one or more antennas, e.g., each antenna, of the plurality of antennas e.g., antennas 376200 (FIG. 376), may be provided to the gate (G) of transistor 377130, e.g., of one or more, e.g., each, antenna interface of the plurality of antenna interfaces 377115. For example, at the combiner mode, transistor 377130 of one or more antenna interfaces, e.g., each antenna interface, of the plurality of antenna interfaces 377115, may provide the antenna signal to RF load/source 377101, e.g., transformer 377110. For example, RF load/source 377101, e.g., transformer 377110, may combine the signals from the transistors 377130 of the one or more antenna interfaces 377115, and may provide the combined signal to amplification circuitry 376105 (FIG. 376).

The following is one example of simulated parameters, which may be achieved, for example, by a 1:4 ABDSC, e.g., a 1:4 ABDSC 377100, at the combiner mode, and at the splitter mode in accordance with some demonstrative aspects:

TABLE T3

| | IL @ 65 GHz | Sii | Isolation |
|---|---|---|---|
| CS-Combiner | | | |
| 1:1 | −3.1 @ 2.3 mA<br>−2.4 @ 3 mA | −5.9 | |
| 1:2 | −3.5 @ 2.3 mA | −5.9 | −22 |
| 1:3 | −5.9 @ 2.3 mA | −6 | −24 |
| 1:4 | −7 @ 2.3 mA<br>−6.6 @ 3 mA | −6 | −25 |
| S11(common) <− 10 dB | | | |
| CS-Splitter | | | |
| 1:1 | −3.7 @ 2.1 mA<br>−2.9 @ 3 mA | −8.3 | |
| 1:2 | −4.3 @ 2.1 mA | −8.1 | −23 |
| 1:3 | −4.9 @ 2.1 mA | −8.4 | −23 |
| 1:4 | −5.5 @ 2.1 mA<br>−5 @ 3 mA | −8.5 | −24 |
| S11(common) <− 7.5 dB | | | |

The following is one example of simulated parameters, which may be achieved, for example, by a 1:6 ABDSC, e.g., a 1:6 ABDSC 377100, at the combiner mode, and at the splitter mode in accordance with some demonstrative aspects:

TABLE T4

| Q = 12, 80 p: 160 p k = 0.7 | | | |
|---|---|---|---|
| CS-Combiner | | | |
| | IL @ 65 GHz | Sii | isolation |
| 1:1 | −3.7 @ 3 mA | | |
| 1:2 | −4.3 @ 3 mA | −6 | −34 |
| 1:3 | −6.9 @ 3 mA | −6 | −25 |
| 1:4 | −7.1 @ 3 mA | −6 | −26 |
| 1:6 | −8.8 @ 3 mA | −6 | −28 |
| S11(common) <− 11 dB | | | |
| CS-Splitter | | | |
| | IL @ 65 GHz | Sii | isolation |
| 1:1 | −4.5 @ 3 mA | −8.5 | |
| 1:2 | −5 @ 3 mA | −8.7 | −24 |

TABLE T4-continued

| Q = 12, 80 p: 160 p k = 0.7 | | | |
|---|---|---|---|
| 1:3 | −5.7 @ 3 mA | −8.7 | −24 |
| 1:4 | −5.6 @ 3 mA | −8.6 | −24 |
| 1:6 | −7.1 @ 3 mA | −8.8 | −22 |
| S11(common ) <− 8.9 dB | | | |

Reference is now made to FIG. 378, which schematically illustrates a common gate topology of an ABDSC 378100, in accordance with some demonstrative aspects.

In some demonstrative aspects, for example, ABDSC 378100 may be implemented as part of a transceiver, for example, as part of transceiver 376000 (FIG. 376), e.g., instead of ABDSC 376100 (FIG. 376).

In some demonstrative aspects, ABDSC 378100 may be switchable between a combiner mode and a splitter mode, e.g., as described below.

In some demonstrative aspects, ABDSC 378100 may include an RF load/source 378101, e.g., a transformer 378110, and a plurality of antenna interfaces 378115, e.g., as described below.

In some demonstrative aspects, the number of antenna interfaces 378115 may be, for example, analogues to the number of antenna ports and/or antennas. For example, for four antennas and/or antenna ports ABDSC 378100 may include four antenna interfaces 378115. For example, ABDSC 378100 may be referred as a 1:4 ABDSC. For six antennas and/or antenna ports, a ABDSC 378100 may include six antenna interfaces 378115. For example, ABDSC 378100 may be referred as 1:6 ABDSC. In other aspects, ABDSC 378100 may include any other number of antenna interfaces 17115, and/or ABDSC 377100 may include any other 1:X ABDSC, wherein X>1.

In some demonstrative aspects, an antenna interface 378115 of the plurality of antenna interfaces 378115 may include, for example, a transistor 378120 having a common gate connection. For example, transistor 378120 may receive, at the combiner mode, a drain voltage (Vd) at a drain of transistor 378120, a source voltage (Vs) at a source of transistor 378120, and a gate voltage (Vg) at a gate of transistor 378120, e.g., as described below.

In some demonstrative aspects, transistor 378120 may receive, at the splitter mode, the source voltage (Vs) at the drain, the drain voltage (Vd) at the source, and the gate voltage (Vg) at the gate, e.g., as described below.

In some demonstrative aspects, for example, transistor 378120 may include FET, MOSFET transistor, BJT and the like. For example, the MOSFET may include NMOS and/or PMOS transistor.

Advantageously, the combination of NMOS and/or PMOS transistors may reduce the number of components in ABDSC 378100, reduce parasitics of the transistors under different biasing conditions and may improve the overall performance of ABDSC 378100.

In some demonstrative aspects, an antenna interface 378115, e.g., each antenna interface 378115, of the plurality of antenna interfaces 378115 may include a resistor 378180, which may be operably coupled to transistor 378120. For example, resistor 378180 may have a 150Ω resistance, and/or any other suitable value, e.g., for biasing the drain (D) of transistor Q1 378120. In some other aspects, antenna interface 378115 may include an active load as a substituted for resistor 378120, for example, a transistor configured to be in a triode region.

In some demonstrative aspects, at the combiner mode, an RF signal from one or more antennas, e.g., each antenna, of the plurality of antennas, e.g., antenna 376200, may be provided to the drain (D) of transistor 378120.

In some demonstrative aspects, a source voltage (Vs) may be provided to the drain (D) of transistor 378120. For example, transistor 378120 may be configured to provide the RF signal to RF load/source 378101, e.g., transformer 378110. RF load/source 378101, e.g., transformer 378110 may combine the signals from one or more antennas, e.g., each antenna, of the plurality of antennas, e.g., antenna 376200 (FIG. 376), and may provide the combined signal to the amplification circuitry, e.g., amplification circuitry 376105 (FIG. 376).

Reference is now made to FIG. 379, which schematically illustrates a common gate/common source (CS/CG) topology of an ABDSC 379100, in accordance with some demonstrative aspects.

In some demonstrative aspects, for example, ABDSC 379100 may be implemented as part of a transceiver, for example, as part of transceiver 376000 (FIG. 376), e.g., instead of ABDSC 376100 (FIG. 376).

In some exemplary aspects, the number of antenna interfaces 379115 may be, for example, analogues to the number of antenna ports and/or antennas. For example, for four antennas and/or antenna ports ABDSC 379100 may include four antenna interfaces 379115. For example, ABDSC 379100 may be referred as 1:4 ABDSC. For six antennas and/or antenna ports, ABDSC 379100 may include six antenna interfaces 379115. For example, ABDSC 379100 may be referred as 1:6 ABDSC.

In some demonstrative aspect, for example, ABDSC 379100 may include two transformers and/or RF load/sources and six antenna interfaces 19115. In this example, ABDSC 379100 may be referred as a 2:6 ABDSC.

In other aspects, ABDSC 379100 may include any other number of antenna interfaces 379115, and/or ABDSC 379100 may include any other 1:X ABDSC, wherein X>1.

In some demonstrative aspects, one or more antenna interfaces 379115, e.g., each antenna interface 379115, of the plurality of antenna interfaces 379115 may include a first transistor 379130 having the common gate connection to be activated at the combiner mode, configured to be deactivated at the splitter mode; and a second transistor 379120 having a common source connection, and configured to be activated at the splitter mode, and to be deactivated at the combiner mode, e.g., as described below.

In some demonstrative aspect, for example, transistors 379120 and/or 379130 may include FETs, MOSFETs transistors, BJTs and the like. The MOSFETs may include NMOS and/or PMOS transistors. For example, the BJT may include NPN and/or PNP transistors.

In one example, transistors 379120 and/or 379130 may include NMOS transistors, PMOS transistors and/or a combination of NMOS and PMOS transistors.

Advantageously, the combination of NMOS and PMOS transistors may reduce the number of components in ABDSC 379100, reduce parasitics of the transistors under different biasing conditions and may improve the overall performance of antenna interface ABDSC 379100.

In other aspects, transistors 379120 and/or 379130 may include any other types of transistors.

In some demonstrative aspect, antenna interface 379115 may include a resistor 379180, which may be operably coupled to the drain (D) of transistor 379120. For example, resistor 379180 may have a 150Ω resistance, and/or any other suitable value, e.g., configured to bias the drain (D) of transistor (Q1) 379120. In some other aspects, antenna interface 379115 may include an active load as a substituted for resistor 379180, for example, a transistor configured to be in a triode region.

In some demonstrative aspect, antenna interface 379115 may include a resistor 379185, which may be operably coupled to the gate (G) of transistor 379120. For example, resistor 379185 may have a 2KΩ resistance, and/or any other suitable value, e.g., configured to bias the gate (G) of transistor 379120. In some other aspects, antenna interface 379115 may include an active load as a substituted for resistor 379185, for example, a transistor configured to be in a triode region.

In some demonstrative aspect, antenna interface 379115 may include a resistor 19190, which may be operably coupled to the gate (G) of transistor 379190. For example, resistor 19190 may include a 2KΩ resistance, and/or any other suitable value, which may be configured to bias the gate (D) of transistor 379130. In some other aspects, antenna interface 379115 may include an active load as a substituted for resistor 377180, for example, a transistor configured to be in a triode region.

In some demonstrative aspect, antenna interface 379115 may include a capacitor 379140, which may be operably coupled to the gate (G) of transistor 379120. For example, capacitor 379140 may include a low/moderate Q capacitor of about 100 fF for the 60 GHz bands with a Q factor of 15, which may be configured, for example, to decouple transformer 379110 from a gate biasing voltage of transistor 379120. In some demonstrative aspect, for example, transistor 379120 may be implemented with a common source topology, and/or transistor 379130 may be implemented with a common gate topology. For example, a DC voltage source 379150 may supply DC voltage to a drain (D) of transistor 379130. For example, a DC voltage source 379155 may supply DC voltage to a source (S) of transistor 379120, if required. For example, a DC voltage source 379160 may supply DC voltage, e.g., through resistor 379190, to gate (G) of transistor 379130. For example, a DC voltage source 379165 may supply DC voltage, e.g., through resistor 379185, to gate (G) of transistor 379120. For example, a DC voltage source 379170 may supply DC voltage to the drain (D) of transistor (Q1) 379120, e.g., through resistor 379180. In some other aspects, resistors 379190 and 379185 may be substitute by an active load as a resistor 377180 and/or a current mirror. Resistor 379180 may be substitute by a transistor configured to be in a triode region of the transistor.

In some demonstrative aspects, ABDSC 379100 may include and/or may be operably coupled to, controller circuitry 376107 (FIG. 376), which may be configured to controllably switch ABDSC 379100 between the splitter mode and the combiner mode, e.g., as described below.

In some demonstrative aspects, controller circuitry, e.g., controller circuitry 376107 (FIG. 376), may be configured to switch transistor 379130 to an Off state, for example, at the splitter mode. For example, at the splitter mode, transformer 379110 may provide an RF signal, e.g., provided from amplification circuitry 376105 (FIG. 16), to at least some transistors, e.g., to transistor 379120, of the plurality of antenna interfaces 379115. For example, a signal to be provided to one or more, e.g., each, antenna of the plurality of antennas, e.g., antenna 376200 (FIG. 376), may be provided from the drain (D) of transistor 379120 of one or more, e.g., each, antenna interface of the plurality of antenna interfaces 379115.

In some demonstrative aspects, controller circuitry 376107 (FIG. 376) may be configured to switch transistor 379120 to an Off state, for example, at the combiner mode. For example, an RF signal from each antenna of the plurality of antennas, e.g., antenna 376200 (FIG. 376), for example, may be provided to the source (S) of transistor 379130 of one or more antenna interfaces, e.g., each, antenna interface, of the plurality of antenna interfaces 379115. For example, transistor 379130 of one or more, e.g., each, antenna interface of the plurality of antenna interfaces 379115 may provide the antenna signal to transformer 379110. For example, transformer 379110 may combine the signals from transistor 379130 of the one or more antenna interfaces 379115, and may provide the combined signal to amplification circuitry 376105 (FIG. 376).

The following is one example of measured parameters, which may be achieved, for example, by a 1:4 ABDSC, e.g., a 1:4 ABDSC 379100, at the combiner mode, and at the splitter mode in accordance with some demonstrative aspects:

TABLE T5

| CG/CS-Combiner | | | |
|---|---|---|---|
| | IL @ 65 GHz | Sii | Isolation |
| 1:1 | −3.7 @ 2.8 mA<br>−4.8 @ 1.6 mA | −18 | |
| 1:2 | −4.6 @ 2.8 mA<br>−5.6 @ 1.6 mA | −18 | −20 |
| 1:3 | −5.1 @ 2.8 mA<br>−6 @ 1.6 mA | −19 | −24 |
| 1:4 | −5.6 @ 2.8 mA<br>−6.5 @ 1.6 mA | −20 | −24 |
| | S11(common) <− 8.3 dB | | |
| **CG/CS-Splitter** | | | |
| | IL @ 65 GHz | Sii | Isolation |
| 1:1 | −2.6 @ 2.5 mA | −10 | |
| 1:2 | −3.4 @ 2.5 mA | −10 | −22 |
| 1:3 | −4.2 @ 2.5 mA | −10 | −23 |
| 1:4 | −5 @ 2.5 mA | −10 | −23 |
| | S11(common) <− 7 dB | | |

The following is one example of measured parameters, which may be achieved, for example, by a 1:6 ABDSC, e.g., a 1:6 ABDSC 379100, at the combiner mode, and at the splitter mode in accordance with some demonstrative aspects:

TABLE T6

| Q = 12, 90 p: 140 p k = 0.7 | | | |
|---|---|---|---|
| **CG/CS-Combiner** | | | |
| | IL @ 65 GHz | Sii | Isolation |
| 1:1 | −4.5 @ 2.6 mA | −17 | |
| 1:2 | −5 @ 2.6 mA | −17 | −23 |
| 1:3 | −5.6 @ 2.6 mA | −17 | −23 |
| 1:4 | −6 @ 2.6 mA | −17 | −24 |
| 1:6 | −7 @ 2.6 mA | −17 | −25 |
| | S11(common) <− .8 dB | | |
| **CG/CS-Splitter** | | | |
| | IL @ 65 GHz | Sii | isolation |
| 1:1 | −5.5 @ 1.5 mA | −7.7 | |
| 1:2 | −6 @ 1.5 mA | −7.8 | −26 |
| 1:3 | −6.4 @ 1.5 mA | −7.9 | −27 |

TABLE T6-continued

| Q = 12, 90 p: 140 p k = 0.7 | | | |
|---|---|---|---|
| 1:4 | −6.8 @ 1.5 mA | −7.9 | −27 |
| 1:6 | −7.7 @ 1.5 mA | −8 | −28 |
| | S11(common) <− 7.1 dB | | |

Referring back to FIG. 4, in some demonstrative aspects, RF circuitry 425 may be configured according to a radio architecture, which may include at least one digital class E stack PA, which may be configured to amplify RF signals, e.g., as described below.

In some demonstrative aspects, in some use cases, scenarios, and/or implementations, for example, to support high data-rates for millimeter wave (mm-Wave) 5G applications and/or any other implementations, there may be a technical need for realizing spectrally efficient polar constellations, e.g., Multi-level Amplitude-Phase Shift Keying (M-APSK), and/or Cartesian constellations e.g., Multi-Level Quadrature Amplitude Modulation (m-QAM), for example, with high speed, high amplitude, and/or phase resolution.

In some demonstrative aspects, in order to realize high amplitude resolution, for example, in a mm-wave transmitter front-end, a mm-wave PA in a transmitter may be segmented into a plurality of segments, for example, binary scaled segments, e.g., as described below.

In some demonstrative aspects, one or more of the amplifier segments, e.g., even each amplifier segment, may be digitally controlled, for example, to realize a desired amplitude resolution, e.g., as described below.

In some demonstrative aspects, a switching power amplifier architecture, for example, Class-E/Class-F PA, or the like, having two transistors stacked in series, e.g., one transistor connected above the other transistor, may be used to mitigate a loss of series modulation control switches. For example, a stacked top transistor may be configured to also operate as a modulation control switch. For example, a gate voltage of the top transistor may be digitally controlled by a control signal, for example, such that a current of the top transistor may starve the bottom transistor to shut down, for example, to force a modulated output amplitude, e.g., a mm-wave modulated output amplitude, to be high or low, for example, according to digital control bits of the control signal.

In some demonstrative aspects, an N-bit resolution digital power amplifier may be implemented, for example, by replicating and binary scaling N identical stacked transistor segments, e.g., as described below.

In some demonstrative aspects, the N-bit resolution digital power amplifier may be configured, for example, to obviate a need for lossy series switches at the input of each of the amplifier segments.

In some demonstrative aspects, the top stacked transistor may play a dual role of a power amplification stage as well as a modulation control switch, e.g., as described below. For example, by incorporating modulation switch parasitics into, for example, an mm-wave PA design network, larger switch sizes, for example, 25 μm to 250 μm, may be used to reduce switch ON resistance loss, for example, even without paying the penalty of large switch parasitic capacitances, for example, 20-200 femtoFarad (fF).

In some demonstrative aspects, the N-bit digital PA may be included in radio chain circuitry 435 (FIG. 4), if desired.

Reference is now made to FIG. 380, which schematically illustrates a block diagram of an architecture of a transmitter 380100, in accordance with some demonstrative aspects.

In some demonstrative aspects, transmitter 380100 may be embedded for example, as part of an integrated circuit (IC).

In to some demonstrative aspects, transmitter 380100 may include a millimeter wave transmitter to transmit a signal over a mmWave frequency band, e.g., as described below. In other aspects, transmitter 380100 may include any other type of transmitter to transmit a signal over any other frequency band.

In some demonstrative aspects, transmitter 380100 may include an analog transmitter, a wideband transmitter, a digital transmitter, a digitally controlled transmitter, or the like. For example, one or more elements of transmitter 20100 may be implemented as part of transmitter 371110 (FIG. 371).

In some demonstrative aspects, transmitter 380100 may include a LO 380110, for example, a 60 GHz LO, or any other LO.

In some demonstrative aspects, transmitter 380100 may include a baseband 380120 to generate phase data 380125. For example, baseband 380120 may be included as part of a phase data sub-system (not shown) that may generate phase data 380125. Phase data 380125 may include, for example, analog phase data and/or a digital phase data.

In some demonstrative aspects, transmitter 380100 may include a phase modulator 380130 configured to generate an input signal 380135, for example, by modulating phase data 380125 according to an LO signal from LO generator 380110. In one example, input signal 380135 may include a 60 GHz RF signal, or any other signal of any other frequency band.

In some demonstrative aspects, transmitter 380100 may include an amplitude data signal source 380140, for example, to generate a digital control signal 380145 representing amplitude data.

In some demonstrative aspects, transmitter 380100 may include an N-bit digital PA 380150, which may be configured to amplify the input signal 380135, for example, based on control signal 380145, e.g., as described below.

In some demonstrative aspects, transmitter 380100 may include or may be operably coupled to at least one antenna 380170, e.g., coupled to digital PA 380150 to transmit at least one signal based on the input signal 380135, e.g., as described below.

In to some demonstrative aspects, transmitter 382100 may include one or more phase array antennas 380170, e.g., coupled to digital PA 382150, e.g., as described below.

In some demonstrative aspects, N-bit digital PA 380150 may include a plurality of stacked gate controlled amplifiers 380155 operably coupled to a combiner 380159, e.g., as described below.

In some demonstrative aspects, N-bit digital PA 380150 may include a combiner 380159, e.g., as described below.

In some demonstrative aspects, digital PA 380150 may be configured to controllably amplify and modulate input signal 380135, for example, based on digital control signal 380145, e.g., as described below.

In some demonstrative aspects, the plurality of stacked gate controlled amplifiers 380155 may be controllable by digital control signal 380145, for example, to provide a plurality of amplified modulated signals 380157, e.g., as described below.

In some demonstrative aspects, a stacked gate control amplifier 380151 of the plurality of stacked gate controlled amplifiers 380155 may include a first input 380152 to receive input signal 380135, a second input 20153 to receive digital control signal 380145, and an output 380154 to provide an amplified modulated signal 380157, e.g., as described below.

In some demonstrative aspects, combiner 380159 may be configured to combine the plurality of amplified modulated signals 380157 into a combiner output signal 380180, for example, having an output power level and a modulation, which are based on the digital control signal 380145, e.g., as described below.

In some demonstrative aspects, stacked gate controlled amplifier 380152 may include a first transistor and a second transistor, e.g., as described below.

In some demonstrative aspects, the first transistor of stacked gate controlled amplifier 380152 may be configured to provide the amplified modulated signal 380157, for example, by amplifying and modulating input signal 380135 at a gate of the second transistor of stacked gate controlled amplifier 380152, for example, based on the digital control signal 380145, e.g., as described below.

In some demonstrative aspects, the first transistor of stacked gate controlled amplifier 380152 may be configured to digitally control an amplification of the second transistor of stacked gate controlled amplifier 380152, for example, based on the digital control signal 380145, e.g., as described below.

In some demonstrative aspects, the second transistor of stacked gate controlled amplifier 380152 may be configured, for example, to switch stacked gate controlled amplifier 380152 between an On state and an Off state, for example, based on a bit value of the digital control signal 380145, e.g., as described below.

In some demonstrative aspects, the first transistor of stacked gate controlled amplifier 380152 may include, for example, a first FET, and/or the second transistor of stacked gate controlled amplifier 380152 may include, for example, a second FET. In other aspects, the first and/or second transistors may include any other type of transistors.

In some demonstrative aspects, the first transistor of stacked gate controlled amplifier 380152 may be configured to amplify the input signal 380135, for example, by a factor of two, for example, based on a bit of digital control signal 380145, e.g., as described below.

In some demonstrative aspects, digital PA 380150 may be configured to modulate input signal 380135 based on digital control signal 20145, for example, according to a modulation scheme, for example, the modulation scheme described above with reference to FIGS. 12A, 12B, 12C, 13A and/or 13B, and/or any other modulation scheme.

In some demonstrative aspects, the modulation scheme may include a QAM scheme, e.g., as described above with reference to FIGS. 12A, 12B, 12C, 13A and/or 13B.

In some demonstrative aspects, the QAM scheme may include a 64 QAM scheme, e.g., as described below. In other aspects, the QAM scheme may include any other QAM scheme, for example, a 256 QAM scheme, or any other higher or lower degree of QAM.

In one example, N-bit digital PA 20150 may include six segments, supporting high modulation speed of 64 QAM, or 128QAM. In other aspects, any other number of segments may be implemented.

In some demonstrative aspects, digital control signal 380145 may include 6 bits, e.g., as described below. In other aspects, digital control signal 380145 may include any other number of bits, e.g., less than or greater than 6 bits.

In some demonstrative aspects, the plurality of stacked gate controlled amplifiers 380155 may include six stacked gate controlled amplifiers, e.g., as describe below. In other aspects, the plurality of stacked gate controlled amplifiers 380155 may include any other count of stacked gate controlled amplifiers.

In to some demonstrative aspects, phase modulator 380130 may provide input signal 380135 to digital PA 380155, for example, based on phase data 380125. Baseband 380120 may provide digital control signal 380145 to digital PA 380150, for example, based on phase data 380125, e.g., as described below.

In some demonstrative aspects, baseband 380120 may provide N-bit digital signal 380125 to N-bit digital PA 380150. Baseband 380120 may provide phase data 380125 related digital signal to phase modulator 380130. Phase modulator 380130 may receive LO signal from LO 380110. LO 380110 may provide for example, a 60 GHz modulate signal to phase modulator 380130. Phase modulator 380130 may modulate phase data 380125 with the LO signal and may provide input signal 380135 to N-bit digital PA 380150.

In some demonstrative aspects, the first inputs 380152 of the plurality of stacked gate controlled amplifiers 380155 may be connected to phase modulator 380130, second inputs 380153 of the plurality of stacked gate controlled amplifiers 380155 may be connected to amplitude data signal source 380140, and/or outputs 380154 of plurality of stacked gate controlled amplifiers 380155 may be connected to combiner 380159. Combiner 380159 may provide output signal 380180, for example, including a modulated RF signal, to one or more antennas 380170.

In some example aspects, digital control signal 380135, e.g., the N-bit digital signal at the second inputs 380153 of the plurality of stacked gate controlled amplifiers 380155 may control an output power level and/or a modulation of output signal 380180 of combiner 380159, e.g., as described below.

Reference is made to FIGS. 381A and 381B, which schematically illustrate an electronic circuit of a stacked-gate control amplifier 381100, in accordance with some demonstrative aspects. For example, stacked-gate control amplifier 380150 (FIG. 380) may include one or more elements of stacked-gate control amplifier 381100.

In some demonstrative aspects, stacked gate control amplifier 381100 may include a transistor (M1) 381110 to receive an input signal 381170. In one example, input signal may have an amplitude of about 1 volt, e.g., at a frequency of about 60 GHz. In other aspects, any other amplitude and/or frequency may be implemented.

In some demonstrative aspects, stacked gate control amplifier 381100 may include a transistor (M2) 381120 to receive a digital control signal 381180. For example, digital control signal may sway between 1 Volt and 0 volt, or between any other range of voltages.

In some demonstrative aspects, stacked gate control amplifier 381100 may include a capacitor 381130. For example, capacitor 381130 at the gate of transistor 381120 may introduce an optimum swing in order that amplify signals at transistors (M1) 381110 and (M2) 381120 in-phase.

In some demonstrative aspects, stacked gate control amplifier 381100 may include a capacitor 381140 and/or a capacitor 381150, for example, configured as a capacitor divider network.

In some demonstrative aspects, stacked gate control amplifier 381100 may include an inductor 381160, which may be configured by the control signal to clamp a current drawn from a supply voltage VDD, to shut transistor (M1) 381110, and/or to make an output amplitude at output 381190 low, e.g., 0 volts.

In some demonstrative aspects, stacked gate controlled amplifier 381100 may include a transistor 381120 to provide an amplified modulated signal by amplifying and modulating input signal 381170 at a gate of transistor 381170, for example, based on digital control signal 381180, and/or a transistor 381120 to digitally control the amplification of transistor 381170, for example, based on the digital control signal 381180, as shown in FIG. 381B.

In some demonstrative aspects, for example, as shown in FIG. 381A, transistor 381180 may be configured to switch stacked gate controlled amplifier 381100 between an On state and an Off state, for example, based on a bit value of the digital control signal 381170. For example, transistor 381180 may be configured to switch stacked gate controlled amplifier 381100 to the On state, for example, when a bit at the gate of transistor 381120 has a "high" value, and to switch stacked gate controlled amplifier 381100 to the Off state, for example, when the bit at the gate of transistor 381120 is "low".

In some demonstrative aspects, transistor (M1) 381110 and a transistor (M2) 381120 may include, for example, FETs, which may be connected to each other according to a cascode connection.

In some demonstrative aspects, when a gate voltage of transistor (M2) 381120 may be at a digital high, e.g., 1 Volt, the 2-series stacked transistors, e.g., transistor (M1) 381110 and transistor (M2) 381120, may operate as a switching PA. For example, a capacitor divider network, e.g., formed by capacitors 381140 and 381150, may be configured to introduce an optimum swing in order that amplify signals at transistors (M1) 381110 and (M2) 381120 in-phase.

In one example, a logic "one" bit level of digital control signal 381180 may cause an amplification by two of input signal 381170, e.g., by transistor (M2) 38120. A logic zero signal level of digital control signal 381180 may cause a zero-level signal at the output signal 381190. A 1 Volt amplitude of input signal 381170 may cause to 2 Volt amplitude at output signal 381190.

Referring to FIG. 381B, in some demonstrative aspects, during modulation, the gate (G) voltage of transistor (M2) 381120 may be digitally low, e.g., 0 volts, for example, to in turn stacked gate control amplifier 381100 to the OFF state. This may cause transistor (M2) 381120 to turn OFF, for example, irrespective of the signal swing at the gate (G) of transistor (M1) 381110. As transistor (M2) 381120 may shut down, it may clamp a current drawn from a supply voltage VDD through inductor 381160, which may result in shutting transistor (M1) 381110 and making the output amplitude at output 381190 low, e.g., 0 Volts.

In some demonstrative aspects, a baseband processor, e.g., baseband sub-system 380145 (FIG. 380) may generate digital control signal 381180, e.g., in the form of an N-bit digital signal, for example, to control the output power level and/or modulation of the output signal of stacked gate control amplifier 381100.

Reference is made to FIG. 382, which schematically illustrates a block diagram of a transmitter 382100 including a stacked-gate modulated digital PA 382110, in accordance with some demonstrative aspects. For example, stacked-gate modulated digital PA 382110 may include one or more elements of N-bit digital PA 380150 (FIG. 380). The power amplifiers described herein can be incorporated in one or more circuits (e.g., radio chain circuitry 372) within the RF circuitry 325 (FIG. 3D) of mmWave communication circuitry 300 shown in FIG. 3A, although the power amplifiers are not limited to such.

In some demonstrative aspects, transmitter 382100 may include a processor 382120, which may include a baseband processor configured to provide a digital control signal 382125. For example, baseband processor 382120 may perform one or more operations and/or functionalities of amplitude data signal source 380140 (FIG. 380).

In some demonstrative aspects, transmitter 382100 may include a modulator 382130. For example, modulator 382130 may perform one or more operations and/or functionalities of phase modulator 380130 (FIG. 380).

In some demonstrative aspects, stacked-gate modulated digital PA 382110 may include a plurality of stacked-gate controlled amplifiers 382150 to generate an output signal 382145.

In some demonstrative aspects, transmitter 382100 may include an antenna port 382140 to provide output signal 382145 to at least one antenna, e.g., a phased-array antenna or any other type of antenna.

In some demonstrative aspects, processor 382120 may provide, for example, an N-bit digital signal to gates of transistors 382152 of the plurality of stacked-gate controlled amplifiers 382150, e.g., as described above.

In some demonstrative aspects, for example, a bit if the N-bit digital signal 382125 may be provided to a gate of a transistor of a respective stacked-gate controlled amplifier of the plurality of stacked-gate controlled amplifiers 382150.

In one example, the N-bit digital signal 382125 may include 6 bits. According to this example, a first bit, e.g., Bit 0, of the N-bit digital signal may be provided to a first stacked-gate controlled amplifier of the plurality of stacked-gate controlled amplifiers 382150; a second bit, e.g., Bit 1, of the N-bit digital signal may be provided to a second stacked-gate controlled amplifier of plurality of stacked-gate controlled amplifiers 382150; a third bit, e.g., Bit 2, of the N-bit digital signal may be provided to a third stacked-gate controlled amplifier of plurality of stacked-gate controlled amplifiers 382150; a fourth bit, e.g., Bit 3 of the N-bit digital signal may be provided to a fourth stacked-gate controlled amplifier of plurality of stacked-gate controlled amplifiers 382150; a fifth bit, e.g., Bit 4, of the N-bit digital signal may be provided to a fifth stacked-gate controlled amplifier of plurality of stacked-gate controlled amplifiers 382150; and/or a sixth bit, e.g., Bit 5, of the N-bit digital signal may be provided to a sixth stacked-gate controlled amplifier of plurality of stacked-gate controlled amplifiers 382150.

In some demonstrative aspects, modulator 382130 may provide an RF modulated signal to transistors 382154 of the plurality of stacked-gate controlled amplifiers 382150. The plurality of stacked-gate controlled amplifiers 382150 may amplify the RF modulated signal according to a bit sequence of the N-bit digital signal. Stacked-gate modulated digital PA 382110 may output a Tx RF signal from plurality of stacked-gate control amplifiers 382150, for example, output signal 382145 e.g., the Tx RF signal, to antenna port 382140.

Reference is made to FIGS. 383A and 383B, which schematically illustrate a dynamic realization of a multi-level high speed eye diagram 383100, in accordance with some demonstrative aspects.

In some demonstrative aspects, for example, modulator 382130 may modulate an IF signal according to a QAM scheme, for example, 16 QAM, 32 QAM, 64 QAM, and the like. For example, combined output signal 382145 may be shaped by the N-bit digital signal to match desired constellations points of the QAM modulation scheme as shown in FIG. 383, e.g., for 16 QAM, and in FIG. 383, e.g., for 64 QAM.

Reference is made to FIGS. 384A and 384B, which depict a performance improvement graph (FIG. 384A) and a power reduction graph (FIG. 384B) corresponding to an input series switch amplifier, in accordance with some demonstrative aspects.

In some demonstrative aspects, as shown in FIG. 384A and FIG. 384B, a stacked gate-controlled amplifier, e.g., stacked gate-controlled amplifier 382150 (FIG. 382), may achieve a 25% improvement in power reduction, and at least a 150% increase of a power-added efficiency (PAE), e.g., compared to a modulation control switch amplifier.

Reference is made to FIGS. 385A and 385B, which depict an amplitude resolution graph (FIG. 385A) and a power efficiency graph (FIG. 385B), corresponding to an N bit digital PA, e.g., digital PA 382150 (FIG. 382), in accordance with some demonstrative aspects.

In one example, 6-bit amplitude resolution is close to linearity based on the bit setting (FIG. 385A).

In one example, 50% of peak efficiency under 6 dB power back off may be achieved by the stacked gate digital amplifier, e.g., as shown in FIG. 385B.

Reference is made to FIG. 386, which depicts a graph of a drain efficiency versus power saturation of a stacked gate-controlled amplifier and a driver amplifier before it, in accordance with some demonstrative aspects.

In some demonstrative aspects, for example, the N bit digital PA with the driver amplifier before the stacked gate-controlled amplifier may have a reduced efficiency at 6-dB backoff (e.g., 39%) in comparison to FIG. 385 where the efficiency may be, for example, 50%. In one example, the driver amplifier power may remain substantially the same, for example, even when segments of the digital PA are switched off, thus allowing the whole system to maintain 50% of its peak efficiency at 6-dB backoff.

In some demonstrative aspects, a plurality of driver amplifiers may be added before the stacked gate-controlled amplifier in order to receive, for example, 50% efficiency at the output stage of the stacked gate-controlled amplifier.

In some demonstrative aspects, advantageously, the stacked gate-controlled amplifier architecture, e.g., stacked gate-controlled amplifier 381100 (FIG. 381) or stacked gate-controlled amplifier 380151 (FIG. 380), may provide a power gain of, for example, from −2 dBm to 8 dBm, of a PA chain, and/or a transmitter efficiency of, for example, up to 39% at a mm-waves bandwidth e.g., a 60 GHz bandwidth.

Referring back to FIG. 4, in some demonstrative aspects, RF circuitry 425 may be configured according to a radio architecture, which may include at least one series Doherty combiner with sub-quarter wavelength balun, which may be configured to combine a plurality of RF signals into an RF signal, and to transmit the RF signal via one or more antennas, e.g., as described below.

In some demonstrative aspects, the stacked gate-controlled amplifier, e.g., stacked gate-controlled amplifier 381100 (FIG. 381) and/or stacked gate-controlled amplifier 380151 (FIG. 380), may reuse the stacked top transistor, e.g., transistor 381120 (FIG. 381), for example, a stacked mm-wave switching amplifier, in design as a modulation control switch, thus improving the drain efficiency for example, up to 39% or more at power saturation 2.5 dBm to 8 dBm, of the N-bit digital PA.

In some demonstrative aspects, in some use cases and/or scenarios it may be advantageous to implement radio architectures, which may share one or more circuits for transmit and receive paths, e.g., as described below. The receive and/or transmit paths may include, for example, one or more amplifiers, one or more splitters, one or more combiners, one or more mixers, and/or one or more other additional or alternative components, if desired.

In some demonstrative aspects, a radio architecture may include at least one Doherty power amplifier, e.g., as described below.

In some demonstrative aspects, implementing the Doherty power amplifier in the radio architecture may provide one or more benefits and/or solve one or more technical problems, for example, at least by increasing the efficiency of the power amplifier while occupying less die area. For example, the efficiency of the output power may increase by 9 dB, or any other level.

In some demonstrative aspects, the Doherty power amplifier may be configured to provide a high efficiency amplification of a RF signal, e.g., as described below. For example, the ability to provide a high efficiency amplification of the RF signal may allow, for example, at least a technical benefit of reduced power consumption.

In some demonstrative aspects, the Doherty power amplifier may be configured to employ a sub-quarter-wavelength balun concept, for example, to provide efficient power combining, for example, even in a compact die-area, e.g., as described below.

In some demonstrative aspects, the radio architecture may include, for example, at least one Doherty power amplifier circuit operably coupled to at least one mixer, e.g., as described below.

In some demonstrative aspects, the Doherty power amplifier may be included as part of, and/or may perform one or more operations and/or functionalities of, radio chain circuitry, e.g., as part of sub-system 435 (FIG. 4), and/or any other sub-system and/or element, if desired.

In some aspects, Doherty amplifiers and/or Doherty combiners described herein can be incorporated in one or more circuits (e.g., radio chain circuitry 372) within the RF circuitry 325 (FIG. 3D) of mmWave communication circuitry 300 shown in FIG. 3A, although the amplifiers and combiners are not limited to such.

Reference is made to FIG. 387, which schematically illustrates a block diagram of a transmitter 27000, in accordance with some demonstrative aspects. For example, one or more elements and/or components of transmitter 387100 may be implemented as part of a transceiver, e.g., as described above with reference to FIGS. 1, 1A, and/or 371.

In some demonstrative aspects, transmitter 387000 may be configured to transmit a Tx signal, e.g., as describe below. For example, transmitter 387000 may include an I/Q transmitter, e.g., as described below.

In some demonstrative aspects, transmitter 387000 may include and/or may be coupled to at least one antenna 387180. For example, the at least one antenna 387180 may include a phased-array antenna, a dipole antenna, an array of antennas, or the like, e.g., as described below.

In some demonstrative aspects, transmitter 387000 may include a Doherty power amplifier 387110, e.g., as described below.

In some demonstrative aspects, Doherty power amplifier 387110 may include, for example, a two-stage Doherty power amplifier of a shunt-connected-load type, a two-stage Doherty power amplifier of a series-connected-load type, or any other type of a Doherty power amplifier, e.g., as described below.

In some demonstrative aspects, Doherty power amplifier 387110 may include a two-stage Doherty power amplifier, which may include, at least one first stage amplifier 387113, and at least one second stage amplifier 387200, e.g., as described below.

In some demonstrative aspects, for example, first stage amplifier 387113 may include a driver amplifier, which may be configured to provide a driver RF signal to the second stage of Doherty power amplifier 387110, e.g., as described below.

In some demonstrative aspects, for example, second stage amplifier 387200 may include at least one main amplifier 387210 (also referred to as "carrier amplifier (CA)"), and at least one controllable peaking amplifier (PA) 387220, e.g., as described below. For example, main amplifier 387210 and controllable PA 387220 may be configured to amplify the driver RF signal, e.g., as described below.

In some demonstrative aspects, Doherty power amplifier 387110 may include a Sub-Quarter-Wavelength (SQWL) balun 387230, e.g., including the first and second stages, e.g., as described below. For example, SQWL balun 387230 may be configured to combine signals of the first stage to the second stage, for example, to be used as a series load at outputs of main amplifier 387210 and controllable PA, at the second stage, e.g., as described below.

In some demonstrative aspects, for example, Doherty power amplifier 387110 may be configured to operate at a shunt-connected-load configuration. For example, at the shunt-connected-load configuration, an amplifier load, denoted ZLP, may be applied to amplifier 387210 and/or controllable PA 387220.

In some demonstrative aspects, for example, Doherty power amplifier 387110 may be configured to operate at a series-connected-load configuration. For example, at the series-connected-load configuration, an amplifier load, denoted ZLS, may be applied to amplifier 387210 and/or controllable PA 387220.

In some demonstrative aspects, the following relation may be retained, e.g., for the shunt-connected-load type configuration:

$$Z_{CL} = Z_T^2\left(\frac{1}{Z_{Lp}} - \frac{1}{Z_{PL}}\right) \tag{6}$$

wherein $Z_{CL}$ denotes the CA load, $Z_{AP}$ denotes the amplifier load, $Z_{PL}$ denotes the PA load, and $Z_T$ denotes the total load.

In some demonstrative aspects, the CA load $Z_{CL}$ may be expressed, for example, as a series-connected-load type configuration, e.g., as follows:

$$Z_{CL} = Z_{LS} - \frac{Z_T^2}{Z_{PL}}. \tag{7}$$

In some demonstrative aspects, the following equation may be retained, e.g., for both the series-connected-load type configuration and the shunt-connected-load type configuration:

$$Z_{CL} = 2Z_o - \frac{Z_o^2}{Z_{PL}}. \tag{8}$$

For example, in a case of:

$$Z_T = Z_o \quad Z_{LP} = \frac{Z_o}{2} \quad Z_{LS} = 2Z_o \tag{9}$$

wherein $Z_0$ denotes a load impedance

In some demonstrative aspects, for example, the load impedance $Z_0$ may include, may represent, and/or may be based on, an antenna impedance, for example, an impedance of 50 Ohm. In other aspects, the load impedance $Z_0$ may include, may represent, and/or may be based on, any other additional or alternative impedance.

In some demonstrative aspects, ZPL may be infinite, for example, when controllable PA 387220 is in an off-state, for example, at low RF input levels corresponding to output power levels of, e.g., 6 dB below Power saturation (Psat), e.g., 6 dB back-off. For example, in such a case, the carrier (Main) amplifier load, e.g., $Z_{CL}$, may become 2Z0, e.g., considering a quarter-wave impedance transformer.

In some demonstrative aspects, controllable PA 387220 may become active and the value of ZPL may decrease, for example, at high RF input levels corresponding to maximum output power (Psat). For example, at the power level at which ZPL is equal to Z0, ZCL may become Z0. Therefore, the carrier (Main) amplifier load, e.g., $Z_{CL}$, may modulate, for example, between Z0 and 2Z0, for example, depending on the status of the controllable PA 387220, e.g., depending on whether the controllable PA 387220 is off and/or how long the controllable PA 387220 may be turned on.

In some other demonstrative aspects, the status of the controllable PA 387220 may be controlled, for example, by the amount of input power levels.

In some demonstrative aspects, SQWL balun 387230 may be configured to operate as a series connection load to controllable PA 387220 and main amplifier 387210, e.g., as described below.

In some demonstrative aspects, two-stage Doherty amplifier 387110 may include a series load which may be implemented, for example, by SQWL balun 387230, e.g., as described below. In other aspects, two-stage Doherty amplifier 387110 may include any other additional or alternative load, which may be implemented by any other additional or alternative other baluns.

In some demonstrative aspects, second stage amplifier 387200 may be controlled by a digital signal 387115, e.g., as described below.

In some demonstrative aspects, transmitter 387000 may include a LO 387120 to generate a LO signal 387125, e.g., as described below. For example, LO signal 387125 may be a 60 GHz signal. In other aspects, the LO signal 387125 may include any other frequency. For example, LO 387120 may include a crystal oscillator, a variable frequency oscillator, a frequency synthesizer, or the like.

In some demonstrative aspects, transmitter 387000 may include an In-phase (I) mixer 387130, which may be configured to generate an I signal 387135 based on LO signal 387125, and a Quadrature-phase (Q) mixer 387140, which may be configured to generate a Q signal 387125 based on LO signal 387125, e.g., as described below.

In some demonstrative aspects, transmitter 387000 may include combiner circuitry 387150, which may be configured to combine I signal 387135 with Q signal 387125, for example, to provide driver amplified input signal 387155, e.g., as described below.

In some demonstrative aspects, I mixer circuitry 387130 may be configured to generate the I signal 387135, for example, by mixing LO signal 387125 with an RF signal, e.g., an I RF signal 387132, which may be received, for example, from a phase modulator. In other aspects, I signal 387135 may be generated and/or provided to Doherty amplifier 387110 by any other circuitry and/or based on any other signal.

In some demonstrative aspects, Q mixer circuitry 387140 may be configured to generate Q signal 387145, for example, by mixing the LO signal 387125 with an RF signal, e.g., a Q RF signal 387142, which may be, for example, received from the phase modulator. In other aspects, the Q signal may be generated and/or provided to Doherty amplifier 387110 by any other circuitry and/or based on any other signal.

In some demonstrative aspects, combiner circuitry 387150 may be configured to combine I signal 387135 and Q signal 387145 into the driver amplified input signal 387155 For example, combiner 387150 may include a Wilkinson combiner, a 2 to 1 combiner, a 4 to 2 combiner, or the like. In other aspects, any other type of combiner may be used.

In some demonstrative aspects, the one or more antennas 381780 may be operably coupled to two-stage Doherty amplifier 387110.

In some demonstrative aspects, the at least one first stage amplifier 387113 may be configured to amplify the driver amplified input signal 387155, and may provide a driver RF signal 387157 at the first stage, e.g., as described below.

In some demonstrative aspects, the at least one main amplifier of the second stage, e.g., CA 387210, may be configured to amplify driver RF signal 387157, and to provide a main amplifier signal 387215 at the second stage, e.g., as described below.

In some demonstrative aspects, the at least one controllable PA 387220 may be configured to be turned to an On state, for example, based on a level of driver RF signal 387157. For example, at the On state, two-stage Doherty amplifier 387110 may amplify driver RF signal 387157, for example, to provide a peaking amplifier signal 387225, e.g., as described below.

In some demonstrative aspects, SQWL balun 387230 may be configured to combine the main amplifier signal 387125 with peaking amplifier signal 387225, e.g., as described below.

In some demonstrative aspects, SQWL balun 387230 may include, for example, a first transmission line 387232 to match an impedance between at least one output of the at least one driver amplifier, e.g., first stage amplifier 387113, at least one input of the at least one main amplifier 387210, and at least one input of the at least one controllable PA 387220, e.g., as described below.

In some demonstrative aspects, SQWL balun 387230 may include, for example, a second transmission line 387235 to match an impedance between at least one output of the at least one main amplifier 387210 and at least one output of the at least one controllable PA 387220, e.g., as described below.

In some demonstrative aspects, SQWL balun 387230 may include, for example, a third transmission line 387237, and a plurality of stubs. For example, third transmission line 387237 may have a first impedance, and a stub, e.g., each stub, of the plurality of stubs may have a second impedance, e.g., as described below.

In some demonstrative aspects, a stub (also referred to as a "resonant stub") may include, for example, a length of an element, for example, a transmission line or waveguide, which may be connected at one end.

In some demonstrative aspects, the first impedance may be double the second impedance. For example, the third transmission line 387237 may have an impedance of 50 Ohm and/or a stub of the plurality of stubs may have an impedance of 25 Ohm, e.g., as described below. In other aspects, any other impedances may be used.

In some demonstrative aspects, the plurality of stubs may, for example, operably couple at least one input of the at least one driver amplifier, e.g., first stage amplifier 387113, to third transmission line 387237, may operably couple the at least one output of the at least one driver amplifier, e.g., first stage amplifier 387113, to first transmission line 387232, may operably couple the at least one input of at least one main amplifier 387210 to first transmission line 387232, may operably couple at least one input of at least one controllable PA 387220 to first transmission line 387232, may to operably couple at least one output of at least one main amplifier 387210 to second transmission line 387235, and/or may operably couple at least one output of at least one controllable PA 387220 to second transmission line 387235, e.g., as described below.

In some demonstrative aspects, a length of the stub may be based on, for example, one eighth of a wavelength of driver RF signal 387257, e.g., as described below.

In some demonstrative aspects, second transmission line 387235 and the plurality of stubs may be configured to provide, for example, a serial load at the at least one output of main amplifier 387210, and at the at least one output of controllable PA 387220, e.g., as described below.

In some demonstrative aspects, the at least one driver amplifier e.g., first stage amplifier 387113, may include a first matching network, which may include a first input operably coupled to a first stub of the plurality of stubs, and a second matching network having a second input operably coupled to a second stub of the plurality of stubs, e.g., as described below.

In some demonstrative aspects, the first and second matching networks may be configured to match impedances of the first and second stubs with an impedance of the third transmission line, 387237 e.g., as described below.

In some demonstrative aspects, the at least one driver amplifier e.g., first stage amplifier 387113, may include a first power amplifier, which may include a first input which may be operably coupled to a first output of the first matching network, and a first output which may be operably coupled to a third stub of the plurality of stubs, e.g., as described below.

In some demonstrative aspects, the at least one driver amplifier, e.g., first stage amplifier 387113, may include a second power amplifier, which may include a second input, which may be operably coupled to a second output of the second matching network, and a second output which may be operably coupled to a fourth stub of the plurality of stubs, e.g., as described below.

In some demonstrative aspects, the third and fourth stubs may be configured to match an impedance between the first and second of the first and second power amplifiers and the first transmission line, e.g., as described below.

In some demonstrative aspects, the at least one main amplifier 387210 may include a first matching network and a second matching network, e.g., as described below. For example, the first matching network of main amplifier 387210 may include, for example, a first input operably coupled to a first stub of the plurality of stubs, and the second matching network of main amplifier 387210 may include a second input which may be operably coupled to a second stub of the plurality of stubs. For example, the first matching network and/or the second matching network of main amplifier 387210 may be configured to match impedances of the first and second stubs with an impedance of first transmission line 387232, e.g., as described below.

In some demonstrative aspects, the at least one main amplifier 387210 may include a first power amplifier and/or a second power amplifier, e.g., as described below. For example, the first power amplifier of main amplifier 387210 may include a first input, which may be operably coupled to a first output of the first matching network of main amplifier 387210, and a first output, which may be operably coupled to a third stub of the plurality of stubs. For example, the second power amplifier of main amplifier 387210 may include a second input, which may be operably coupled to a second output of the second matching network, and a second output, which may be operably coupled to a fourth stub of the plurality of stubs. For example, the third and fourth stubs may be configured to match an impedance between the first and second outputs of the first and second power amplifiers of main amplifier 387210 and second transmission line 387235, e.g., as described below.

In some demonstrative aspects, the at least one controllable PA 387220 may include a first matching network and a second matching network. For example, the first matching network of controllable PA 387220 may include a first input, which may be operably coupled to a first stub of the plurality of stubs, and the second matching network of controllable PA 387220 may include a second input, which may be operably coupled to a second stub of the plurality of stubs. For example, the first matching network of controllable PA 387220 may be configured to match impedances of the first and second stubs with an impedance of first transmission line 387232, e.g., as described below.

In some demonstrative aspects, the at least one controllable PA 387220 may include a first power amplifier and a second power amplifier. For example, the first power amplifier of controllable PA 387220 may include a first input, which may be operably coupled to a first output the first matching network of controllable PA 387220, and a first output, which may be operably coupled to a third stub of the plurality of stubs. The first power amplifier of controllable PA 387220 may include a second input which may be operably coupled to a second output of the second matching network of controllable PA 387220, and a second output which may be operably coupled to a fourth stub of the plurality of stubs. In one example, the third and fourth stubs may be configured, for example, to match an impedance between the first and second outputs of the first and second power amplifiers of controllable PA 387220 and second transmission line 387235, e.g., as described below.

Reference is made to FIG. 388, which schematically illustrates a block diagram of a two-stage Doherty amplifier, which may employ an SQWL balun 388000, in accordance with some demonstrative aspects. For example, two-stage Doherty amplifier with SQWL balun 388000 may be implemented to perform one or more operations and/or functionalities of two-stage Doherty amplifier 387100 (FIG. 387).

In some demonstrative aspects, two-stage Doherty amplifier 388000 may include, for example, a first driver amplifier 388100 and a second driver amplifier 388110. For example, first driver amplifier 388100 and/or second driver amplifier 388110 may be configured to amplify an RF input signal 388350, and may provide a first driver RF signal 388360 and a second driver RF signal 388365 at a first stage.

In some demonstrative aspects, two-stage Doherty amplifier 388000 may include, for example, a first main amplifier 388300 and a second main amplifier 3883100, which may be configured to amplify driver RF signal 388360, and to provide a main amplifier signal 388340 at a second stage.

In some demonstrative aspects, two-stage Doherty amplifier 388000 may include, for example, a first controllable PA 388200 and a second controllable PA 388210. For example, first controllable PA 388200 and/or second controllable PA 388210 may be configured to be turned to an On state, for example, based on a level of driver RF signal 388360. For example, at the On state, two-stage Doherty amplifier 388000 may amplify driver RF signal 388360 to provide a PA signal 388240.

In some demonstrative aspects, two-stage Doherty amplifier 388000 may include, for example, an SQWL balun 388400 which may be configured to combine main amplifier signal 388340 with PA signal 388240.

In some demonstrative aspects, SQWL balun 388400 may include, for example, a first transmission line 388500 to match an impedance between the output of first driver amplifier 388100 to the input of first main amplifier 28300, the output of second driver amplifier 388110 to the input of second main amplifier 388310, and/or the input of first controllable PA 388200 to the input of second controllable PA 388210.

In some demonstrative aspects, SQWL balun 388400 may include, for example, a second transmission line 388600 configured to match an impedance between an output of first main amplifier 388300 and an output of second main amplifier 388310. Second transmission line 388600 may configured to match an impedance between an output of first controllable PA 388200 and an output of a second controllable PA 388210.

In some demonstrative aspects, SQWL balun 388400 may include, for example, a third transmission line 388700 having, for example, an impedance of 50 Ohm, and a plurality of stubs 388800. For example, at least one stub, e.g., each stub 388800, of the plurality of stubs 388800 may have, for example, an impedance of 25 Ohm.

In some demonstrative aspects, the plurality of stubs 388800 may operably couple, for example, the input of first driver amplifier 388100 and the input of second driver amplifier 388110 to third transmission line 388700.

In some demonstrative aspects, the plurality of stubs 388800 may operably couple, for example, the output of first driver amplifier 388100 and the output of the second driver amplifier 388100 to transmission line 388500.

In some demonstrative aspects, the plurality of stubs 388800 may operably couple, for example, the input of first main amplifier 388300 and/or the input of the second main amplifier 388310 to first transmission line 388500.

In some demonstrative aspects, the plurality of stubs 388800 may operably couple, for example, the input of first controllable PA 388200 and/or the input of second controllable PA 388210 to first transmission line 388500.

In some demonstrative aspects, the plurality of stubs 388800 may operably couple, for example, the output of first main amplifier 388300 and/or the output of second main amplifier 388310 to second transmission line 388600.

In some demonstrative aspects, the plurality of stubs 388800 may operably couple, for example, the output of the first controllable PA 388200 and/or the output of the second PA 388210 to second transmission line 388600.

In some demonstrative aspects, a length of a stub 388800 may be based, for example, on one eighth of a wavelength of the driver RF signal 388360 and/or the RF driver signal 388365.

In some demonstrative aspects, second transmission line 388600 and the plurality of stubs 388800 may be configured to provide, for example, a serial load at the first output of the first main amplifier 388300, at the output of the second main amplifier 388310, at the output first controllable PA 388200, and/or at the output of second controllable PA 388210.

In some demonstrative aspects, first driver amplifier 388100 and/or second driver amplifier 388110 may include, for example, a first matching network 388130 and a second matching network 388135. For example, an input of the first matching network 388130 may be coupled to a first stub of the plurality of stubs 388800, and an input of second matching network 388135 may be coupled to a second stub of the plurality of stubs 388800.

In some demonstrative aspects, the first and/or second matching networks, e.g., matching networks 388130 and/or 388135, may be configured to match impedances of the first and second stubs with an impedance of third transmission line 388700.

In some demonstrative aspects, for example, first driver amplifier 388100 may include a first power amplifier 388120 having an input, which may be operably coupled to a first output of first matching network 388130. First driver amplifier 38100 may include a first output, which may be operably coupled to a stub of the plurality of stubs 388800.

In some demonstrative aspects, first driver amplifier 388100 may include a second power amplifier 388125 having an input, which may be operably coupled to a second output of second matching network 388135. For example, first driver amplifier 388100 may include a second output, which may be operably coupled to a stub of the plurality of stubs 388800.

In some demonstrative aspects, for example, second driver amplifier 388110 may include a first power amplifier having an input, which may be operably coupled to a first output of a first matching network of second driver amplifier 388110. Second driver amplifier 388110 may include a first output, which may be operably coupled to a stub of the plurality of stubs 388800.

In some demonstrative aspects, second driver amplifier 388110 may include a second power amplifier, which may have an input operably coupled to a second output of a second matching network of second driver amplifier 388110. For example, second driver amplifier 388110 may have a second output, which may be operably coupled to a stub of the plurality of stubs 388800.

In some demonstrative aspects, one or more of the stubs 388800 may be used as a 2-to-1 combiner to combine the outputs of the first and the second power amplifiers into a driver RF signal 388360 and/or a driver RF signal 388365.

In some demonstrative aspects, first main amplifier 388300 may include a first matching network 388320 and a second matching network 388325. For example, first matching network 388320 may include, for example, a first input operably coupled to a stub of the plurality of stubs 388800, and second matching network 388325 may include a second input, which may be operably coupled to another stub of the plurality of stubs 388800. For example, first matching network 388320 and/or second matching network 388325 may be configured to match impedances of the stubs 388800 with an impedance of the first transmission line 388600.

In some demonstrative aspects, first main amplifier 388300 may include a first power amplifier 388330 and/or a second power amplifier 388335. For example, first power amplifier 388330 may include a first input, which may be operably coupled to a first output of first matching network 388320, and a first output, which may be operably coupled to a stub of the plurality of stubs 388800. Second power amplifier 388335 may include a second input, which may be operably coupled to a second output of second matching network 388325, and a second output, which may be operably coupled to another stub of the plurality of stubs. For example, the stubs, which are operably coupled to transmission line 388600 and transmission line 388600, may be configured as a 4-to-1 combiner.

In some demonstrative aspects, second main amplifier 388310 may include, for example, first and second matching networks, and first and second power amplifiers, which may be configured to operate, for example, as the first and second matching networks, and the first and second power amplifiers of first main amplifier 388300, e.g., as described above.

In some demonstrative aspects, first controllable PA 388200 may include a first matching network 388220 and a second matching network 388225. For example, first matching network 388220 may include a first input, which may be operably coupled to a stub of the plurality of stubs 388800, and second matching network 388225 may include a second input, which may be operably coupled to another stub of the plurality of stubs 388800. For example, first matching network 388220 may be configured to match impedances of the stubs with an impedance of first transmission line 388500.

In some demonstrative aspects, first controllable PA 388200 may include a first power amplifier 388230 and a second power amplifier 388235. For example, first power amplifier 388230 may include a first input, which may be operably coupled to a first output first matching network 388220, and a first output which may be operably coupled to a stub of the plurality of stubs 388800. Second power amplifier 388235 may include a second input, which may be operably coupled to a second output of second matching network 388225, and a second output which may be operably coupled to another stub of the plurality of stubs 388800. In one example, the stubs 388800 may be configured to match an impedance between the first output of first power amplifier 388230 and the second output of second power amplifier 388235, and the second transmission line 388600.

In some demonstrative aspects, RF input signal 388350 may be split 4-ways, and may be fed to first driver amplifier 388130 and second driver amplifier 388110. For example, first driver amplifier 388130 and second driver amplifier 388310 may amplify the RF input signal 388350 and may provide four output RF signals.

In one example, each pair of the four RF output signals may be combined at the top and bottom halves of the first stage, for example, by SQWL balun 388400, which may include, for example, first and/or second 2-to-1 power combiners, whose output impedances may be, for example, 50 a The first and second 2-to-1 power combiners may amplify driver RF signal 388360 and/or may amplify driver RF signal 388365. For example, amplify driver RF signal 388360 and/or amplify driver RF signal 388365 may be split between the first main amplifier 388300, the second main amplifier 388310, the first controllable amplifier 388200 and/or the second controllable amplifier 388210 at the top and bottom halves of the second stage. For example, SQWL balun 388400 may include at least two 4-to-1 splitters whose input impedances may be configured to be, for example, 50Ω, which may be used to split driver RF signal 388360 and/or amplify driver RF signal 388365 between the first main amplifier 388300, the second main amplifier 388310, the first controllable amplifier 388200 and/or the second controllable amplifier 388210.

In one example, SQWL balun 388400 may include an 8-way power combiner, which may behave as a two-way parallel combiner between top and bottom halves of SQWL balun 388400.

In some demonstrative aspects, SQWL balun 388400 may include a four-way series combiner, which may be configured to combine the output of the first PA 388200 and/or the output of second PA 388210 with the output of first main amplifier 388300 and/or the output of second main amplifier 388310. For example, the four-way series combiner may include second transmission line 388600 and plurality of stubs 388800.

Referring back to FIG. 4, in some demonstrative aspects, RF circuitry 425 may be configured according to a radio architecture, which may be configured to operate in a TDD mode. In some demonstrative aspects, RF circuitry 425 may include a Tx chain, which some components and/or functionalities of the Tx chain may be configured to be reused in the Rx chain, e.g., as described below.

In some demonstrative aspects, a radio architecture may include at least one I/Q generator, which may be configured, for example, to reuse one or more elements of a Tx chain during a Rx mode of the radio, e.g., as described below.

In some demonstrative aspects, the I/Q generator may be configured, for example, to reuse one or more elements of a phase modulating chain of a polar transmitter, for example, during the Rx mode, e.g., as described below.

In some demonstrative aspects, implementing the I/Q generator, which reuses elements of the Tx chain at the Rx mode, may provide one or more benefits and/or solve one or more technical problems. For example, reusing one or more elements of the phase modulating chain of the polar transmitter during the Rx mode may allow to reduce die area. For example, an injection locking based oscillator modulator, which may be used at a Tx mode, may be reused as an I or Q LO during the Rx mode, e.g., as described below.

In some demonstrative aspects, mmWave transmitters and/or receivers, and/or any other type of transmitters and/or receivers, may operate in a time division duplex (TDD) mode. For example, in the TDD mode, a same frequency band and/or at least partially overlapping frequency bands may be used for both Tx and Rx. For example, the frequency band may be shared between the Tx mode and the Rx mode by assigning alternating time slots to transmit and receive operations, e.g., as described below.

In some demonstrative aspects, a transceiver chip, e.g., a half-duplex transceiver, may be configured to operate at a TDD mode. For example, the transceiver chip may include large passive elements, which may require a large chip area. For example, a large chip area with a parasitic coupling between the passive elements may cause unwanted effects.

In some demonstrative aspects, one or more of the large passive elements may be reused, for example, when the transceiver may operate at the Tx mode and/or the Rx mode. For example, one or more elements of a phase modulating chain of a polar Tx may be reused during the Rx mode of operation, e.g., as described below.

In some demonstrative aspect, a phase modulating chain of a polar Tx may include, for example, one or more elements, which may be used as an injection locking based oscillator modulator, e.g., at the Tx mode, and may be reused, for example, as an I LO and/or a Q LO, e.g., at the Rx mode. For example, a single LO may be used in both Rx mode and Tx mode to perform LO phase shifting, which may be implemented, for example, at least for phased array applications.

In some demonstrative aspects, the I/Q generator may be included as part of, and/or may perform one or more operations and/or functionalities of, an upconverter and/or a downconverter, e.g., as part of sub-system 415 (FIG. 4), and/or a radio chain, e.g., as part of sub-system 435 (FIG. 4), and/or any other sub-system and/or element, if desired.

Reference is now made to FIG. 389, which schematically illustrates a block diagram of a transceiver 389100, in accordance with some demonstrative aspects. In one example, one or more elements of transceiver 389100 may be implemented as part of, and/or perform one or more functionalities of, transceiver 371100 (FIG. 371).

As shown in FIG. 389, in some demonstrative aspects, transceiver 389100 may include a half-duplex transceiver. For example, transceiver 389100 may include a half-duplex transceiver, which may operate in a TDD mode.

In some demonstrative aspects, transceiver 389100 may be configured to communicate over a 2.4 GHz band, a 5 GHz band, an mmWave band, a Sub-1 GHz (SIG) band, and/or any other band.

In other aspects, transceiver 389100 may include any other type of transceiver to communicate over any other additional or alternative frequency band.

In some demonstrative aspects, transceiver 389100 may include at least one antenna port 389180 to couple one or more antennas 389185, e.g., as described below.

In some demonstrative aspects, transceiver 389100 may include and/or may be operably coupled through at least one antenna port 389180 to one or more of antennas 389185.

In some demonstrative aspects, one or more of antennas 389185 may include an internal antenna, a dipole antenna, a phased-array antenna, a Yagi antenna, an antenna array, or the like.

In some demonstrative aspects, transceiver 389100 may include a LNA 389170 which may be configured to generate a Rx signal 389175, for example, based on a signal 389182 received from one or more antenna ports 389180, e.g., as described below.

In some demonstrative aspects, transceiver 389100 may include a PA 389160, which may be configured, for example, to amplify a Tx signal 389126 and to provide an amplified signal to one or more antennas 389185 through one or more antenna ports 389180.

In some demonstrative aspects, transceiver 389100 may include an I/Q signal generator 389110 to generate one or more I and/or Q signals, e.g., as describe below.

In some demonstrative aspects, I/Q generator 389110 may include a LO 389115 to generate a LO signal 389117, e.g., as described below.

In some demonstrative aspects, I/Q generator 389110 may include a controllable phase modulation chain 389120, which may be configured to modulate a phase of LO signal 389117, for example, at the Tx mode and/or at the Rx mode, e.g., as described below.

In some demonstrative aspects, I/Q generator 389110 may include a controllable phase modulation chain 389130, which may be configured to generate a Q-phase shifted signal 389136 based on LO signal 389117, for example, at the Rx mode, e.g., as described below.

In some demonstrative aspects, I/Q generator 389110 may include mixer circuitry 389140, which may be configured to mix Rx signal 389175, e.g., from one or more antenna ports 389180, with one or more LO signals, for example, at the Rx mode, e.g., as described below.

In some demonstrative aspects, LO 389115 may be configured to generate LO signal 389117 having a frequency, which may be a third of a carrier frequency, denoted fcarrier, e.g., (fcarrier/3). In one example, LO signal 389117 may have a frequency of 20 GHz, for example, when transceiver 389100 is configured for operating in a 60 GHz frequency band, e.g., as described below.

In some demonstrative aspects, LO 389115 may include, for example, a crystal oscillator, a variable frequency oscillator, a frequency synthesizer, or the like.

In some demonstrative aspects, controllable phase modulation chain 389120 may include a phase shifter 389122, which may be configured to generate, for example, a phase shifted signal 389123, e.g., as described below.

In some demonstrative aspects, controllable phase modulation chain 389120 may include a tripler 389124, which may be configured to generate Tx signal 389126 by tripling phase shifted signal 389123, e.g., at the Tx mode, and to generate a phase shifted I signal 389128 by tripling phase shifted signal 389123, for example, at the Rx mode, e.g., as described below.

In some demonstrative aspects, controllable phase modulation chain 389120 may be configured to generate, for example, Tx signal 389126 based on LO signal 389117, e.g., at the Tx mode, and to generate, for example, a phase shifted I signal 389128 based on LO signal 389117, for example, at the Rx mode, e.g., as described below.

In some demonstrative aspects, phase shifter 389122 and/or tripler 389124 may be configured to generate Tx signal 389126, e.g., at the Tx mode, and may be reused to generate phased shifted I signal 389128, e.g., at the Rx mode, e.g., as described below.

In some demonstrative aspects, phase shifter 389122 may be configured to shift a phase of LO signal 389117, for example, by a first phase shift, e.g., $\Delta\varphi/3$, wherein $\Delta\varphi$ denotes a phase shift from a phase of LO signal 389117 wherein $\Delta\varphi$ denotes a phase shift of an output of controllable phase modulation chain 29120, e.g., Tx signal 389126 and/or phase shifted I signal 389128, relative to a phase of LO signal 389117.

In some demonstrative aspects, phase shifter 389122 may be configured to generate the phase shifted signal 389123, for example, based on LO signal 389117.

In some demonstrative aspects, tripler 389124 may be configured to generate Tx signal 389126, e.g., at the Tx mode, for example, by tripling a phase and a frequency of phase modulated signal 389123.

In some demonstrative aspects, tripler 389124 may be configured to generate phase shifted I signal 389128, e.g., at the Rx mode, for example, by tripling a phase and a frequency of phase shifted signal 389123.

In some demonstrative aspects, I/Q generator 389110 may include a switch 389155, which may be configured to selectively connect controllable phase modulation chain 389120 to PA 389160 or disconnect controllable phase modulation chain 389120 from PA 389160. For example, switch 389155 may be controlled to connect controllable phase modulation chain 389120 to PA 389160, e.g., at the Tx mode, and/or to disconnect controllable phase modulation chain 389120 from PA 389160, e.g., at the Rx mode.

For example, at the Tx mode, switch 389155 may apply Tx signal 389126 to PA 389160, and PA 389160 may amplify Tx signal 389126 to provide an amplified Tx signal to the one or more antennas 389185, e.g., to an element of a phase array antenna 389185, through antenna port 389180.

In some demonstrative aspects, I/Q generator 389110 may include a switch 389150, which may be configured to selectively connect controllable phase modulation chain 389120 to mixer circuitry 389140 or disconnect controllable phase modulation chain 389120 from mixer circuitry 389140. For example, switch 389150 may be controlled to connect controllable phase modulation chain 389120 to mixer circuitry 389140, e.g., at the Rx mode, and/or to disconnect controllable phase modulation chain 389120 from mixer circuitry 389140, e.g., at the Tx mode.

For example, at the Rx mode, switch 389150 may apply phase shifted I signal 389128 to mixer circuitry 389140, and mixer circuitry 389140 may downconvert Rx I signal 389175 into an IF signal, e.g., based on phase shifted I signal 389128.

In some demonstrative aspects, for example, switch 389150 and/or switch 389155 may include a FET, a metal—oxide—semiconductor field-effect transistor (MOSFET), and/or any other switch.

In some demonstrative aspects, switch 389155 and/or switch 389150 may be controlled, for example, by a controller 389200, for example, based on a mode of operation of transceiver 389100. For example, controller 389200 may include, or may be implemented as part of a baseband controller or any other control circuitry, sub-system and/or logic.

For example, at the Tx mode, controller 389200 may control switch 389155 to operably connect between an output of tripler 389124 and an input of PA 380160, and/or the controller 389200 may control switch 389150 to operably disconnect the output of tripler 389124 from mixer circuitry 389140.

For example, at the Rx mode, controller 389200 may control switch 389155 to operably disconnect the output of tripler 389124 from the input of PA 380160, and/or controller 389200 may control switch 389150 to operably connect the output of tripler 389124 to mixer circuitry 389140.

In other aspects, any other switching configuration may be implemented to switchably connect between controllable phase modulation chain 389120 and PA 389160 and/or mixer 389140. In one example, one switch or more than two switches may be implemented to switchably provide signal 389126 to PA 380160 or to mixer 389140.

In some demonstrative aspects, controllable phase modulation chain 389130 may include a phase shifter 389132, which may be configured to generate, for example, a phase shifted signal 389138, e.g., as described below.

In some demonstrative aspects, controllable phase modulation chain 389130 may include a tripler 389134, which may be configured to triple phase shifted signal 389138 into a phase shifted Q signal 389136, e.g., as described below.

In some demonstrative aspects, controllable phase modulation chain 389130 may be configured to generate, for example, at the Rx mode, phase shifted signal 389138 based on LO signal 389117, e.g., as described below.

In some demonstrative aspects, for example, phase shifter 389132 and/or tripler 389134, may be configured to generate a phase shifted Q signal 389136, e.g., at the Rx mode, e.g., as described below.

In some demonstrative aspects, phase shifter 389132 may be configured to shift a phase of LO signal 389117, for example, by a second phase shift, e.g., Δφ/3±300. In other demonstrative aspects, e.g., aspects which may not include tripler 389134 and/or tripler 389134, phase shifter 389132 may be configured to shift a phase of LO signal 389117, for example, by a second phase shift, e.g., Δφ±900.

In some demonstrative aspects, phase shifter 389132 may be configured to generate phase shifted signal 389138, for example, based on LO signal 389117.

In some demonstrative aspects, tripler 389124 may be configured to generate phase shifted Q signal 389136, e.g., at the Rx mode, for example, by tripling a phase and a frequency of phase shifted signal 389138.

In some demonstrative aspects, phase shifter 389132 may be configured to shift the phase of the LO signal 389117, for example, by a second phase shift, e.g., at the Rx mode. For example, the second phase shift may include a 90-degree rotation of the first phase shift, for example, ΔφL/3.

For example, phase shifted Q signal 389136 may include, for example, the carrier frequency fcarrier with a phase shift of a 90-degree rotation, e.g., Δφ±90o, e.g., as described below.

In some demonstrative aspects, for example, phase shifted I signal 389128 and/or phase shifted Q signal 389136 may include, for example, the carrier frequency fcarrier with a phase shift, e.g., the phase shift Δφ.

In some demonstrative aspects, tripler 389134 may provide phase shifted Q signal 29136 to mixer circuitry 389140, e.g., as described below.

In some demonstrative aspects, at the Rx mode, mixer circuitry 389140 may receive Rx signal 389175, for example, from LNA 389170, and may mix Rx signal 389175 with phase shifted I signal 389128, for example, into an I-phase signal 389143, e.g., as described below.

In some demonstrative aspects, at the Rx mode, mixer circuitry 389140 may mix Rx signal 389175 with phase shifted Q signal 389136 into a Q-phase signal 389146, e.g., as described below.

In some demonstrative aspects, mixer circuitry 389140 may include a mixer 389142 and/or a mixer 389145. For example, at the Rx mode, mixer 389142 may mix the Rx signal 389175 with phase shifted I signal 389128 into I-phase signal 389143, and/or mixer 29145 may mix the Rx signal 389175 with phase shifted Q signal 389136 into the Q-phase signal 389146

In some demonstrative aspects, I-phase signal 389143 and/or Q-phase signal 389146 may include, for example, baseband signals.

In some demonstrative aspects, I-phase signal 389143 may be used as I-IF signal and/or Q-phase signal 389146 may be used as Q-IF signal, for example, to be provided to a baseband, e.g., IF and baseband processing circuitry within the transmit circuitry 315 and/or the receive circuitry 320 (FIG. 3A).

Referring back to FIG. 4, in some demonstrative aspects, RF circuitry 425, which may be configured according to a radio architecture, which may include at least one outphasing power amplifier, which configured to amplify RF signals. In some demonstrative aspects, the at least one outphasing power amplifier may be implemented, for example, by Chireix sub-quarter wavelength balun, e.g., as described below.

In some demonstrative aspects, implementing the outphasing power amplifier in the radio architecture may provide one or more benefits and/or solve one or more technical problems, for example, by increasing the efficiency of the power amplifier while occupying less die area and/or providing high-power levels, and/or providing any other additional or alternative technical benefits and/or advantages.

In some demonstrative aspects, the outphasing power amplifier may be configured to provide a high efficiency amplification of a RF signal, e.g., as described below. For example, the ability to efficiently combine outputs of a plurality of power amplifiers may allow, for example, at least a technical benefit of achieving a high power level signal.

In some demonstrative aspects, the outphasing power amplifier may be operably coupled to a sub-quarter-wavelength (SQWL) balun. For example, the SQWL balun may be configured to employ a Chireix combiner scheme, e.g., to allow at least efficient power combining and/or a high-power level, e.g., as described below.

In some demonstrative aspects, the SQWL balun may be configured to employ a selective inductance bank, which may be digitally controlled and, for example, may consequently allow to increase the bandwidth of the Chireix combiner.

In some demonstrative aspects, the outphasing power amplifier may be included as part of, and/or may perform one or more operations and/or functionalities of, radio chain circuitry, e.g., as part of sub-system 435 (FIG. 4), and/or any other sub-system and/or element, if desired.

Reference is now made to FIG. 390, which schematically illustrates a block diagram of a transmitter 390000, in accordance with some demonstrative aspects. For example, one or more elements and/or components of transmitter 390000 may be implemented as part of a transceiver 371100, e.g., as described above with reference to FIG. 371.

In some demonstrative aspects, transmitter 390000 may include a RF amplifier 390100. For example, RF amplifier 390100 may include a plurality of outphasing amplifiers, e.g., including a first outphasing amplifier 390200 and/or a second outphasing amplifier 390300, e.g., as described below.

In some demonstrative aspects, outphasing amplifier 390200 and/or outphasing amplifier 390300 may be configured, for example, as constant envelope amplifiers, e.g., as described below.

In some demonstrative aspects, for example, the first constant envelop amplifier, e.g., outphasing amplifier 390110, may be configured to operate with a different phase than the second constant envelop amplifier, e.g., outphasing amplifier 390120, e.g., as described below.

In other aspects, outphasing amplifier 390200 and/or outphasing amplifier 390300 may have any other configuration and/or may operate according to any other parameters.

In some demonstrative aspects, for example, an amplitude modulated signal Sin (t)=A(t)cos (wt) may be re-written as a sum of two "constant amplitude" signals S1(t) and S2(t), e.g., wherein:

$$S_1(t)=\cos(wt+\cos^{-1}(A(t)))$$

$$S_1(t)=\cos(wt-\cos^{-1}(A(t)))$$

In one example, the angle θ=cos-1(A(t)) may represent an outphasing angle, which may be employed, for example, in a metric which shows the phase shift between first outphasing amplifier 390200 and second outphasing amplifier 390300. For example, if the first outphasing amplifier 390200 and the second outphasing amplifier 390300 have a gain of G, then the combined output may be determined, e.g., as follows:

$$\begin{aligned} S_{out}(t) &= G\cdot(S_1(t)+S_2(t)) \\ &= 2\cdot G\cdot A(t)\cdot\cos\,(wt) \end{aligned} \tag{11}$$

In some demonstrative aspects, a modulated signal may be amplified through two constant envelope amplifiers with different phases, e.g., first outphasing amplifier 390200 and second outphasing amplifier 390300, e.g., as described below.

Advantageously, having constant amplitude for any given input amplitude level in the constant envelope amplifiers may provide high efficiency, e.g., even for all the input power levels.

In some demonstrative aspects, RF amplifier 390100 may include an SQWL for-way combiner balun 390400, e.g., as described below.

In some demonstrative aspects, SQWL four-way combiner balun 390400 may include, for example, a Chireix combiner.

In some demonstrative aspects, the SQWL four-way combiner balun 390400 may include, for example, a non-isolating combiner.

In other aspects, the SQWL four-way combiner balun 390400 may include any other combiner.

In some demonstrative aspects, SQWL for-way combiner balun 390400, may be configured as non-isolating combiner, for example, a Chireix combiner, to provide load pulling and to consequently increase the efficiency, e.g., as describe below. For example, in case of a non-isolating combiner, an impedance of first outphasing amplifier 390200 and second outphasing amplifier 390300 may be determined by Z1=RL/2+r tan(θ)/2 and Z2=RL/2−r tan(θ)/2.

In some demonstrative aspects, a Chireix combiner may provide a technique to optimize the efficiency of a non-isolating combiner by adding a capacitance and an inductance at the output of each amplifier, e.g., first outphasing amplifier 390200 and second outphasing amplifier 390300, and resonating the re-active element r tan(θ)/2 seen by each amplifier. In this example, each amplifier may see a pure real impedance of RL/2, e.g., as described below.

In some demonstrative aspects, first outphasing amplifier 390200 may include first outphasing amplifier circuitry 390210, which may be configured to provide a first I signal, for example, based on a first input signal, and/or a first Q signal, for example, based on a second input signal, e.g., as described below.

In some demonstrative aspects, second outphasing amplifier circuitry 390220 may be configured to provide a second I signal, for example, based on the first input signal, and/or a second Q signal, for example, based on the second input signal, e.g., as described below.

In some demonstrative aspects, second outphasing amplifier 390300 may include third outphasing amplifier circuitry 390310, which may be configured to provide a third I signal, for example, based on a third input signal, and/or a third Q signal, for example, based on a fourth input signal, e.g., as described below.

In some demonstrative aspects, second outphasing amplifier 390300 may include fourth outphasing amplifier circuitry 390320, which may be configured to provide a fourth I signal, for example, based on the third input signal, and a fourth Q signal, for example, based on the fourth input signal, e.g., as described below.

In some demonstrative aspects, SQWL four-way combiner balun 390400 may include a first inductive stub to couple the first I signal and the second I signal to a first transmission line, a second inductive stub to couple the third I signal and the fourth I signal to the first transmission line, a first capacitive stub to couple the first Q signal and the second Q signal to the first transmission line, and/or a second capacitive stub to couple the third Q signal and the fourth Q signal to a second transmission line, e.g., as described below.

In some demonstrative aspects, the first transmission line may be configured to provide a first RF signal, for example, based on a combination of the first I signal, the second I signal, the first Q signal, and/or the second Q signal, e.g., as described below.

In some demonstrative aspects, the second transmission line may be configured to provide a second RF signal, for example, based on a combination of the third I signal, the fourth I signal, the third Q signal, and/or the fourth Q signal, e.g., as described below.

In some demonstrative aspects, first outphasing amplifier circuitry 390210 may include a first amplifier which may be operably coupled to the first inductive stub, and/or a second amplifier, which may be operably coupled to the first capacitive stub, e.g., as described below.

In some demonstrative aspects, the second outphasing amplifier circuitry 390220 may include a first amplifier, which may be operably coupled to the first inductive stub, and/or a second amplifier which may be coupled to the first capacitive stub, e.g., as described below.

In some demonstrative aspects, the third outphasing amplifier circuitry 390310 may include a first amplifier, which may be operably coupled to the second inductive stub, and/or a second amplifier which may be operably coupled to the second capacitive stub, e.g., as described below.

In some demonstrative aspects, the fourth outphasing amplifier 390320 circuitry may include a first amplifier 390325, which may be operably coupled to the second inductive stub and/or a second amplifier which may be operably coupled to the second capacitive stub, e.g., as described below.

In some demonstrative aspects, for example, an outphasing amplifier, e.g., each outphasing amplifier, of the first outphasing amplifier 390215, the second outphasing amplifier 390225, the third outphasing amplifier 390315, and/or the fourth outphasing amplifier 390325, may include an I/Q generator to generate an initial I signal based on a LO I signal, and to generate an initial Q signal based on a LO Q signal, e.g., as describe below.

For example, first outphasing amplifier 390215 may include an I/O generator 390127, second outphasing amplifier 390225 may include an I/O generator 390227, third outphasing amplifier 390315 may include an I/O generator 390317, and/or fourth outphasing amplifier 390325 may include an I/O generator 390337, e.g., as described below.

In some demonstrative aspects, for example, an outphasing amplifier, e.g., each outphasing amplifier, of the first outphasing amplifier 390215, the second outphasing amplifier 390225, the third outphasing amplifier 390315, and/or the fourth outphasing amplifier 390325, may include phase modulator circuitry to generate a phase-modulated I signal by modulating the initial I signal based on a first input of the outphasing amplifier, and to generate a phase-modulated Q signal by modulating the initial Q signal based on a second input of the outphasing amplifier, e.g., as described below.

In some demonstrative aspects, for example, an outphasing amplifier, e.g., each outphasing amplifier, of the first outphasing amplifier 390215, the second outphasing amplifier 390225, the third outphasing amplifier 390315, and/or the fourth outphasing amplifier 390325, may include a first amplifier to output an amplified I signal by amplifying the phase-modulated I signal, and a second amplifier to output an amplified Q signal by amplifying the phase-modulated Q signal, e.g., as described below.

In some demonstrative aspects, for example, the first inductive stub of SQWL four-way combiner balun 390400) may be configured to apply a predefined impedance, for example, a 25 Ohm impedance or any other impedance, to outputs of the first amplifiers of outphasing amplifiers 390215, 390225, 290315, and/or 390325, e.g., as described below.

Some demonstrative aspects, for example, the first inductive stub of SQWL four-way combiner balun 390400 may be configured to apply a predefined impedance, for example, a 25 Ohm impedance or any other impedance, to outputs of the second amplifiers of outphasing amplifiers 390215, 390225, 390315, and/or 390325, e.g., as described below.

In some demonstrative aspects, for example, the second inductive stub may be configured to apply, for example, a 25 Ohm impedance or any other impedance, to an output of the first amplifier of the outphasing amplifiers 390215, 390225, 390315, and/or 390325, e.g., as described below.

In some demonstrative aspects, for example, the second capacitive stub may apply, for example, a 25 Ohm impedance or any other impedance, to an output of the second amplifier of the outphasing amplifiers 390215, 390225, 390315, and/or 390325, e.g., as described below.

In some demonstrative aspects, RF amplifier 390100 may include a LO 390500 to generate the LO I signal and the LO Q signal.

In some demonstrative aspects, transmitter 390000 may include or may be operably coupled to one or more antennas 390700, e.g., operably coupled to RF amplifier 390100. For example, the one or more antennas 390700 may include a phased-array antenna, a dipole antenna, an internal antenna, an array of antennas, or the like.

In some demonstrative aspects, transmitter 390000 may include a signal processor 390600. For example, signal processor 390600 may be configured to generate the I and Q input signals. For example, the I and Q input signals may be applied to inputs of outphasing amplifiers 390215, 390225, 390315, and/or 390325.

Reference is made to FIG. 391, which schematically illustrates a block diagram of a outphasing amplifier 391000, which employs an SQWL balun 391100 as a load, in accordance with some demonstrative aspects. For example, outphasing amplifier 391000 with SQWL balun 391100 may perform one or more operations and/or functionalities of RF amplifier 390100 (FIG. 390).

In some demonstrative aspects, outphasing amplifier 391000 may include a first outphasing amplifier 391200, a second outphasing amplifier 391300, a third outphasing amplifier 391400, and/or a fourth outphasing amplifier 391500, e.g., as describe below. For example, outphasing amplifiers 391200, 391300, 391400 and/or 391500 may be configured to perform one or more operations of an RF power amplifier.

In some demonstrative aspects, first outphasing amplifier circuitry 391200 may be configured to provide a first I signal 391212 based on a first input signal 391020, e.g., an input I signal, and to provide a first Q signal 391214 based on a second input signal 391010 e.g., an input Q signal.

In some demonstrative aspects, second outphasing amplifier circuitry 391300 may be configured to provide a second I signal 391312, for example, based on the first input signal 391020, and to provide a second Q signal 391314, for example, based on the second input signal 391010.

In some demonstrative aspects, third outphasing amplifier circuitry 391400 may provide a third I signal 391412, for example, based on a third input signal 391030, and to provide a third Q signal 391414, for example, based on a fourth input signal 391040.

In some demonstrative aspects, fourth outphasing amplifier circuitry 391500 may provide a fourth I signal 391512, for example, based on the third input signal 391030, and to provide a fourth Q signal 391514, for example based on the fourth input signal 391040.

In some demonstrative aspects, SQWL four-way combiner balun 391100 may include a first inductive stub 391110, which may couple first I signal 391212 and second I signal 391312 to a first transmission line 391120.

In some demonstrative aspects, SQWL four-way combiner balun 391100 may include a second inductive stub 391130, which may couple the third I signal 391412 and the fourth I signal 391512 to first transmission line 391120.

In some demonstrative aspects, SQWL four-way combiner balun 391100 may include a first capacitive stub 391140, which may couple first Q signal 391214 and second Q signal 391314 to first transmission line 391120.

In some demonstrative aspects, SQWL four-way combiner balun 391100 may include a second capacitive stub 391150 to couple third Q signal 391414 and fourth Q signal 391514 to a second transmission line 391160.

In some demonstrative aspects, first transmission line 391120 may provide a first RF signal 391050, for example, based on a combination of first I signal 391212, second I signal 391312, first Q signal 391214, and/or second Q signal 391314.

In some demonstrative aspects, second transmission line 391160 may provide a second RF signal 391060, for example, based on a combination of third I signal 391412, fourth I signal 391512, third Q signal 391414, and/or fourth Q signal 391514.

In some demonstrative aspects, first outphasing amplifier circuitry 391200 may include a first amplifier 391210, which may be operably coupled to first inductive stub 391110, and a second amplifier 391220, which may be operably coupled to first capacitive stub 391140.

In some demonstrative aspects, second outphasing amplifier circuitry 391300 may include a first amplifier 391310, which may be operably coupled to first inductive stub 391110, and a second amplifier 391320, which may be operably coupled to first capacitive stub 391140.

In some demonstrative aspects, the third outphasing amplifier circuitry 391400 may include a first amplifier 391410, which may be operably coupled to second inductive stub 391130, and a second amplifier 391420 which may be operably coupled to second capacitive stub 391150.

In some demonstrative aspects, the fourth outphasing amplifier circuitry 391500 may include a first amplifier 391510, which may be operably coupled to second inductive stub 391130, and a second amplifier 391520, which may be operably coupled to the second capacitive stub 391150.

In some demonstrative aspects, first outphasing amplifier 391200 may include a first matching network 391230, which may be configured to match impedance of the first amplifier 391210 to, for example, 50 Ohm; and a second matching network 391240, which may be configured to match impedance of the second amplifier 391220 to, for example, 50 Ohm. In other aspects, any other matching impedance may be used.

In some demonstrative aspects, second outphasing amplifier 391300 may include a first matching network 391330, which may be configured to match impedance with the first amplifier 391310 to, for example, 50 Ohm; and a second matching network 391340, which may be configured to match impedance with the second amplifier 391320 to, for example, 50 Ohm. In other aspects, any other matching impedance may be used.

In some demonstrative aspects, third outphasing amplifier 391400 may include a first matching network 391430, which may be configured to match impedance with the first amplifier 391410 to, for example, 50 Ohm; and a second matching network 391440, which may be configured to match impedance with the second amplifier 391420 to, for example, 50 Ohm. In other aspects, any other matching impedance may be used.

In some demonstrative aspects, fourth outphasing amplifier 391500 may include a first matching network 391530, which may be configured to match impedance with the first amplifier 391510 to, for example, 50 Ohm; and a second matching network 391540 which may be configured to match impedance with the second amplifier 391520 to, for example, 50 Ohm. In other aspects, any other matching impedance may be used.

In some demonstrative aspects, for example, an outphasing amplifier, e.g., each outphasing amplifier, of outphasing amplifiers 391200, 391300, 391400 and/or 391500, may include an I/Q generator. For example, outphasing amplifier 391200 may include an I/Q generator 391250, outphasing amplifier 391300 may include I/Q generator 391350, outphasing amplifier 391400 may include I/Q generator 391450 and/or outphasing amplifier 391500 nay include IQ generator 391550.

In some demonstrative aspects, I/Q generator 391250 may be configured to generate an initial I signal e.g., initial I signal 391260, based on a LO I signal, e.g., LO I signal 31070, and to generate an initial Q signal, e.g., initial Q signal 391270, based on a LO Q signal e.g., LO Q signal 391080.

In some demonstrative aspects, I/Q generator 391250 may be configured to generate an initial I signal e.g., initial I signal 391360, based on a LO I signal, e.g., LO I signal 391071, and to generate an initial Q signal, e.g., initial Q signal 391370, based on a LO Q signal e.g., LO Q signal 391081.

In some demonstrative aspects, I/Q generator 391450 may be configured to generate an initial I signal e.g., initial I signal 391460, based on a LO I signal, e.g., LO I signal 391072, and to generate an initial Q signal, e.g., initial Q signal 391470, based on a LO Q signal e.g., LO Q signal 31082.

In some demonstrative aspects, I/Q generator 391550 may be configured to generate an initial I signal e.g., initial I signal 391560, based on a LO I signal, e.g., LO I signal 391073, and to generate an initial Q signal, e.g., initial Q signal 391570, based on a LO Q signal e.g., LO Q signal 391083.

In some demonstrative aspects, for example, an outphasing amplifier, e.g., each outphasing amplifier, of outphasing amplifiers 391200, 391300, 391400 and/or 391500, may include phase modulator circuitry to generate a phase-modulated I signal by modulating the initial I signal based on a first input of the outphasing amplifier, and/or to generate a phase-modulated Q signal by modulating the initial Q signal based on a second input of the outphasing amplifier, e.g., as described below.

In some demonstrative aspects, for example, first outphasing amplifier 391200 may include first amplifier 391210, which may be configured to output I signal 391212 by amplifying a phase-modulated I signal 391282, and/or second amplifier 391220, which may be configured to output Q signal 391214 by amplifying a phase-modulated Q signal 391284.

In some demonstrative aspects, for example, second outphasing amplifier 391300 may include first amplifier 391310, which may be configured to output I signal 391312 by amplifying a phase-modulated I signal 391382, and/or second amplifier 391320, which may be configured to output Q signal 391314 by amplifying a phase-modulated Q signal 391384.

In some demonstrative aspects, for example, third outphasing amplifier 391400 may include first amplifier 391410, which may be configured to output I signal 391412 by amplifying a phase-modulated I signal 391482, and/or second amplifier 391420, which may be configured to output Q signal 391414 by amplifying a phase-modulated Q signal 391484.

In some demonstrative aspects, for example, fourth outphasing amplifier 391400 may include first amplifier 391410, which may be configured to output I signal 391412 by amplifying a phase-modulated I signal 391482, and/or second amplifier 391420, which may be configured to output Q signal 391414 by amplifying a phase-modulated Q signal 391484.

In some demonstrative aspects, for example, first outphasing amplifier 391200 may include a phase modulator 391280, which may be configured to generate a phase-modulated I signal 391282 and/or a phase-modulated Q signal 391284, for example, by modulating internal I signal 391260 and/or internal Q signal 391270, e.g., with input I signal 391020 and/or input Q signal 391020.

In some demonstrative aspects, for example, second outphasing amplifier 391300 may include a phase modulator 391380, which may be configured to generate a phase-modulated I signal 391382 and/or a phase-modulated Q signal 391384, for example, by modulating internal I signal 391360 and/or internal Q signal 391370, e.g., with input I signal 391020 and/or input Q signal 391020.

In some demonstrative aspects, for example, third outphasing amplifier 391400 may include a phase modulator 391480, which may be configured to generate a phase-modulated I signal 391482 and/or a phase-modulated Q signal 391484, for example, by modulating internal I signal 391460 and/or internal Q signal 391470, e.g., with input I signal 391020 and/or input Q signal 391020.

In some demonstrative aspects, for example, fourth outphasing amplifier 391500 may include a phase modulator 391580, which may be configured to generate a phase-modulated I signal 391582 and/or a phase-modulated Q signal 391584, for example, by modulating internal I signal 391560 and/or internal Q signal 391570, e.g., with input I signal 391020 and/or input Q signal 391020.

In some demonstrative aspects, for example, an inductive stub, e.g., first inductive stub 391110 and/or second inductive stub 391130, may be configured to apply a 25 Ohm impedance to an output, e.g., each output, of the first amplifier of outphasing amplifiers 391200, 391300, 391400 and/or 391500.

In some demonstrative aspects, a capacitive stub, e.g., first capacitive stub 391140 and/or second capacitive stub 391150, may be configured to apply a 25 Ohm impedance to an output, e.g., each output, of the second amplifier of outphasing amplifiers 391200, 391300, 391400 and/or 391500.

In other aspects, first inductive stub 391110, second indicative stub 391130, first capacitive stub 391140, and/or second capacitive stub 391160 may be configured to provide any other impedance to one or more of the outputs of the first amplifier and/or second amplifier of one or more of outphasing amplifiers 391200, 391300, 391400 and/or 391500.

In some demonstrative aspects, outphasing amplifier 391000 may include a LO splitter 391600 and/or a LO splitter 391650. For example, LO splitter 391600 and/or LO splitter 31650 may be configured to receive an LO signal from a LO, e.g., LO 390500 (FIG. 390). For example, LO splitter 391600 may split the LO signal into, for example, LO I signals 391070 and/or 391073, and/or into LO Q signals 391080 and/or 391083. For example, LO splitter 391650 may split the LO signal into, for example, LO I signals 391071 and/or 391072, and/or into LO Q signals 391081 and/or 391082.

Referring back to FIG. 4, in some demonstrative aspects, RF circuitry 425 may be configured according to a radio architecture, which may include at least one phase shifter (also referred to as a "phase rotator"), which may be configured to shift and/or rotate a phase of a signal to a desired phase, for example, based on one or more predefined phase values, e.g., as described below.

In some demonstrative aspects, the phase shifter may be implemented as a controllable phase shifter, e.g., a voltage controlled phase shifter, which may be configured to provide, for example, a low power and/or a high resolution, e.g., as described below.

In some demonstrative aspects, the controllable phase shifter may be included as part of, and/or may perform one or more operations and/or functionalities of, radio chain circuitry, e.g., as part of sub-system 435 (FIG. 4), and/or any other sub-system and/or element, if desired.

In some demonstrative aspects, the controllable phase shifter may be configured to shift, for example a phase of an In-phase (I) signal and/or a phase of a Quadrature-phase (Q) signal, e.g., as described below.

In some demonstrative aspects, the controllable phase shifter may be calibrated, for example, according to a constellation map, for example, to provide a high level of accuracy and/or high regulation, for example, at a maximum gain of the controllable phase shifter, e.g., as described below.

In some demonstrative aspects, the controllable phase shifter may be calibrated to correct an I/Q gain and/or a phase imbalance, for example, with high precision.

In some demonstrative aspects, the controllable phase shifter may include, for example, I phase shifting circuitry, which may be configured to provide a phase shifted I signal, for example, based on the I signal and the Q signal, e.g., as described below.

In some demonstrative aspects, the I phase shifting circuitry may be configured to provide a first shifted I signal by shifting a phase of the I signal, for example, according to a first control signal, e.g., as described below.

In some demonstrative aspects, the I phase shifting circuitry may be configured to provide a first shifted Q signal by shifting a phase of the Q signal, for example, according to a second control signal, e.g., as described below.

In some demonstrative aspects, the I phase shifting circuitry may be configured to provide the phase shifted I signal, for example, by combining the first shifted I signal with the first shifted Q signal, e.g., as described below.

In some demonstrative aspects, the controllable phase shifter may include, for example, Q phase shifting circuitry, which may be configured to provide a phase shifted Q signal, for example, based on the Q signal and the I signal, e.g., as described below.

In some demonstrative aspects, the Q phase shifting circuitry may be configured to provide a second shifted I signal by shifting the phase of the I signal, for example, according to a third control signal, e.g., as described below.

In some demonstrative aspects, the Q phase shifting circuitry may be configured to provide a second shifted Q signal by shifting the phase of the Q signal, for example, according to a fourth control signal, e.g., as described below.

In some demonstrative aspects, the Q phase shifting circuitry may be configured to provide, the phase shifted Q signal, for example, by combining the second shifted I signal with the second shifted Q signal, e.g., as described below.

In some demonstrative aspects, the I phase shifting circuitry and/or the Q phase shifting circuitry may include, for example, voltage controlled phase shifting circuitry, e.g., as described below.

In some demonstrative aspects, the I phase shifting circuitry may include, for example, a first Voltage Digital to Analog Convertor (VDAC), which may be configured to convert the first control signal into an I control voltage, e.g., as described below.

In some demonstrative aspects, the I phase shifting circuitry may be configured to shift the phase of the I signal, for example, according to the I control voltage, e.g., as described below.

In some demonstrative aspects, the I phase shifting circuitry may include, for example, a second VDAC, which may be configured to convert the second control signal into a Q control voltage, e.g., as described below.

In some demonstrative aspects, the I phase shifting circuitry may be configured to shift the phase of the Q signal, for example, according to the Q control voltage, e.g., as describe below.

In some demonstrative aspects, the Q phase shifting circuitry may include, for example, a first VDAC to convert the third control signal into an I control voltage, e.g., as described below.

In some demonstrative aspects, the Q phase shifting circuitry may be configured to shift, the phase of the I signal, for example, according to the I control voltage, e.g., as described below.

In some demonstrative aspects, the Q phase shifting circuitry may include, for example, a second VDAC, which may be configured to convert the fourth control signal into a Q control voltage, e.g., as described below.

In some demonstrative aspects, the Q phase shifting circuitry may be configured to shift the phase of the Q signal, for example, according to the Q control voltage, e.g., as described below.

In some demonstrative aspects, the controllable phase shifter may be configured to provide, for example, the phased shifted I signal and/or the phase shifted Q signal to one or more Power Amplifiers (PAs) at a Transmit (Tx) path, and/or from one or more Low Noise Amplifiers (LNAs) at a Receive (Rx) path, e.g., as described below.

In some demonstrative aspects, implementing the controllable phase shifter, e.g., as described herein, may provide one or more benefits and/or solve one or more technical problems, for example, by providing a highly linear phase shifter with power consumption, e.g., independent of resolution, and/or providing any other additional or alternative technical benefits and/or advantages.

In some demonstrative aspects, the controllable phase shifter, may be configured to provide a high resolution, for example, even near low and/or high gain settings, e.g., as described below.

Reference is made to FIG. 392, which schematically illustrates a block diagram of a transceiver 392000, in accordance with some demonstrative aspects. For example, one or more elements and/or components of transceiver 392000 may be implemented as part of a transceiver 371100, e.g., as described above with reference to FIG. 371.

In some demonstrative aspects, transceiver 392000 may include, for example, a half-duplex transceiver, and/or a full-duplex transceiver, e.g., as described below.

In some demonstrative aspects, transceiver 392000 may include a millimeter wave transceiver, which may be configured to operate over a 60 GHz frequency band. In other aspects, transceiver 392000 may include any other type of transceiver configured to operate on any other additional or alternative frequency band.

In some demonstrative aspects, transceiver 392000 may be operably coupled to a plurality of Rx antennas 392100, and/or to a plurality of Tx antennas 392150, e.g., as described below. For example, Rx antennas 392100 and/or Tx antennas 392150 may include, for example, one or more antenna elements, one or more phased-array antennas, one or more dipole antennas, one or more internal antennas, and/or any other type of antenna.

In some demonstrative aspects, transceiver 392000 may include, for example a local oscillator (LO) 392200, which may be configured, for example, to generate an LO signal 392205, e.g., as described below.

In some demonstrative aspects, LO 392200 may include, for example a crystal oscillator, a Phase Lock Loop (PLL), an injection LO (ILO), and/or any other type of LO.

In some demonstrative aspects, transceiver 392000 may include, for example, LO distribution network circuitry 392300, which may be configured to distribute phase-shifted LO signals, for example, to one or more transmitters and/or receiver components, circuits and/or sub-systems, e.g., as described below.

In some demonstrative aspects, the phase-shifted LO signals may include, for example, a sine signal 392264 and/or a cosine signal 392274, e.g., as described below. In other aspects, any other additional or alternative LO signals may be used.

In some demonstrative aspects, transceiver 392000 may include, for example, a receiver 392200, which may be configured to receive, for example, one or more Rx Radio Frequency (RF) signals, for example, from Rx antennas 392100, e.g., as described below.

In some demonstrative aspects, receiver 392200 may include, for example, a plurality of LNAs 392210, which may be operably coupled to the plurality of Rx antennas 392100, e.g., respectively. For example, an LNA 392210, which may be operably coupled to an Rx antenna 392100, may be configured to provide an Rx signal 392220, for example, by amplifying an RF signal 392230 from the Rx antenna 392100, e.g., as described below.

In some demonstrative aspects, receiver 392200 may include, for example, a plurality of mixers 392250, which may be operably coupled to the plurality of LNAs 392210, e.g., respectively. For example, a mixer 392250 coupled to an LNA 392210 may be configured to generate an I signal 392262 and/or a Q signal 392272, for example, according to the RF signal 392220 from the LNA 392210, e.g., as described below.

In some demonstrative aspects, receiver 392200 may include, for example, a plurality of controllable phase shifters 392240, which may be operably coupled to the plurality of mixers 392250, e.g., respectively. For example, a controllable phase shifter 392240, which may be operably coupled to mixer 32250 may be configured to shift a phase of I signal 392262 and/or a phase of Q signal 392272 from the mixer 392250, e.g., as described below.

In some demonstrative aspects, mixer 392250 may include, for example, a first mixer 392260, which may be operably coupled to a first input 392265 of the controllable phase-shifter 392240, e.g., as described below.

In some demonstrative aspects, first mixer 392260 may be configured to generate I signal 392262 by mixing Rx signal 392220, for example, according to sine signal 392264, e.g., as described below.

In some demonstrative aspects, mixer 392250 may include, for example, a second mixer 392270, which may be operably coupled to a second input 392275 of the controllable phase shifter 392240, e.g., as described below.

In some demonstrative aspects, second mixer 392270 may be configured to generate Q signal 392272 by mixing Rx signal 39220, for example, according to cosine signal 392274, e.g., as described below.

In some demonstrative aspects, the plurality of controllable phase shifters 392240 may be configured to controllably apply a plurality of respective phase shifts to the plurality of Rx antennas 392100, e.g., as described below. For example, phase shifters 392240 may be controlled to apply to the Rx antennas 392100 a respective plurality of phase shifts, which may be configured, for example, to generate and/or steer a beam, for example, according to an Rx beamforming scheme, e.g., as described below.

In some demonstrative aspects, controllable phase shifter 392240 may be configured to shift a phase of I signal 392262, for example, according to a first control signal 392410, and to provide a phase shifted I signal 392280, e.g., as described below.

In some demonstrative aspects, the controllable phase shifter 392240 may be configured to shift a phase of Q signal 392272, for example, according to a second control signal 392420, and to provide a phase shifted Q signal 392290, e.g., as described below.

In some demonstrative aspects, transceiver 392000 may include a Q Rx combiner 392510, which may be operably coupled to the plurality of controllable phase shifters 392240. For example, Q Rx combiner 392510 may be configured to combine a plurality of phase shifted Q signals 392290 from the plurality of controllable phase shifters 392240, for example, into a Q Intermediate Frequency (IF) Rx signal 392295.

In some demonstrative aspects, transceiver 392000 may include, for example, an I Rx combiner 392520, which may be operably coupled to the plurality of controllable phase shifters 392240. For example, I Rx combiner 392520 may be configured to combine a plurality of phase shifted I signals 392280 from the plurality of controllable phase shifters 392240, for example, into an I IF Rx signal 392285.

In some demonstrative aspects, transceiver 392000 may include, for example, a baseband 392500, which may be operably coupled to I Rx combiner 392520 and Q Rx combiner 392510. For example, baseband 392500 may be configured to process IF signals, e.g., I IF Rx signal 392285 and/or Q IF Rx signal 392295, e.g., as described below.

In some demonstrative aspects, transceiver 392000 may include, for example, a transmitter 392300, which may be operably coupled to baseband 392500, for example, to transmit one or more Tx signals via Tx antennas 392150, e.g., as described below.

In some demonstrative aspects, baseband 392500 may be configured to generate one or more IF Tx signals, for example, an I IF Tx signal 392580 and/or a Q IF Tx signal 392590, which may be transmitted by transmitter 392300, e.g., as described below.

In some demonstrative aspects, transmitter 392300 may be configured to transmit a plurality of Tx RF signals 392320 via the plurality of Tx antennas 392150, e.g., as described below.

In some demonstrative aspects, transceiver 392000 may include, for example, an I Tx splitter 392530, which may be operably coupled to baseband 392500. For example, I Tx splitter 392530 may be configured to split I IF Tx signal 392580 into a plurality of Tx I signals 392285, for example, to be transmitted via the plurality of Tx antennas 392150, e.g., respectively.

In some demonstrative aspects, transceiver 392000 may include, for example, a Q Tx splitter 392540, which may be operably coupled to baseband 392500. For example, Q Tx splitter 392540 may be configured to split Q IF Tx signal 392590, into a plurality of Tx Q signals 392295, for example, to be transmitted via the plurality of Tx antennas 392150, e.g., respectively.

In some demonstrative aspects, transmitter 392300 may include, for example, a plurality of controllable phase shifters 392340, which may be operably coupled to Q Tx splitter 392540 and I Tx splitter 392530. For example, a controllable phase shifter 392340 may be configured to shift, for example, a phase of a Tx I signal 392285 from I Tx splitter 392530, and/or a phase of a Tx Q signal 392295 from Q Tx splitter 392540, e.g., as described below.

In some demonstrative aspects, the plurality of controllable phase shifters 392240 may be configured to controllably apply a plurality of respective phase shifts to the plurality of Tx antennas 392150, e.g., as described below. For example, phase shifters 392340 may be controlled to apply to the Tx antennas 392150 a respective plurality of phase shifts, which may be configured, for example, to generate and/or steer a beam, for example, according to a Tx beamforming scheme, e.g., as described below.

In some demonstrative aspects, transmitter 392300 may include, for example, a plurality of mixers 392350, which may be operably coupled to the plurality of controllable phase shifters 392340, e.g., respectively. For example, a mixer 392350 coupled to a controllable phase shifter 392340 may be configured to generate an RF signal 392330, for example, according to an I shifted signal 392360 and/or a Q shifted signal 32365 from the controllable phase shifter 392340, e.g., as described below.

In some demonstrative aspects, the plurality of mixers 392350 may include, for example, a first mixer 392370, which may be operably coupled to a first output 392341 of controllable phase-shifter 392340, e.g., as described below.

In some demonstrative aspects, first mixer 392370 may be configured to generate a first RF signal 392332 by mixing I shifted signal 392360, for example, according to sine signal 392264, e.g., as described below.

In some demonstrative aspects, the plurality of mixers 392250 may include, for example, a second mixer 392380, which may be operably coupled to a second output 392342 of controllable phase shifter 392340, e.g., as described below.

In some demonstrative aspect, second mixer 392380 may be configured to generate a second RF signal 392334 by mixing Q shifted signal 392365, for example, according to cosine signal 392274, e.g., as described below.

In some demonstrative aspects, the first RF signal 392332 and the second RF signal 392334 from the controllable phase shifter 392340 may be combined, for example, into an RF signal 392330 to be transmitted via a respective Tx antenna 392150, e.g., as described below.

In some demonstrative aspects, transmitter 392300 may include, for example, a plurality of PAs 392310, which may be operably coupled to the plurality of mixers 392380, e.g., respectively. For example, a PA 392310, which may be operably coupled to a mixer 392350, may be configured to amplify, for example, RF signal 392330 from the mixer 392350, into a Tx RF signal 392320, e.g., as describe below.

In some demonstrative aspects, PA 392310 may be configured to provide the Tx RF signal 392320 to a Tx antenna 392150, e.g., as described below.

In some demonstrative aspects, controllable phase-shifter 392240 and/or controllable phase-shifter 392340 may include, for example, I phase shifting circuitry 392242, which may be configured to provide phase shifted I signal 392280, for example, based on I signal 392262 and a Q signal 392272, e.g., as described below.

In some demonstrative aspects, I phase shifting circuitry 392242 may be configured to provide a first shifted I signal, by shifting a phase of I signal 392262, for example, according to a first control signal, e.g., control signal 392410 e.g., as described below.

In some demonstrative aspects, I phase shifting circuitry 392242 may be configured to provide a first shifted Q signal, by shifting a phase of Q signal 392272, for example, according to a second control signal, e.g., control signal 392420, e.g., as described below.

In some demonstrative aspects, I phase shifting circuitry 392242 may be configured to provide phase shifted signal 392280, for example, by combining the first shifted I signal with the first shifted Q signal, e.g., as described below.

In some demonstrative aspects, controllable phase-shifter 392240 and/or controllable phase-shifter 392340 may include, for example, Q phase shifting circuitry 392244, which may be configured to provide phase shifted Q signal 392290, for example, based on Q signal 392272, and I signal 392362, e.g., as described below.

In some demonstrative aspects, Q phase shifting circuitry 392244 may be configured to provide a second shifted I signal by shifting the phase of I signal 392262, for example, according to a third control signal, e.g., a control signal 392430, e.g., as described below.

In some demonstrative aspects, Q phase shifting circuitry 392244 may be configured to provide a second shifted Q signal, by shifting the phase of Q signal 392272, for example, according to a fourth control signal, e.g., a control signal 392440, e.g., as described below.

In some demonstrative aspects, Q phase shifting circuitry 392244 may be configured to provide phase shifted Q signal 392290, by combining the second shifted I signal with the second shifted Q signal, e.g., as described below.

In some demonstrative aspects, I phase shifting circuitry 392242 may include, for example, a first VDAC (not shown in FIG. 392), which may be configured to convert the first control signal into an I control voltage, e.g., as described below.

In some demonstrative aspects, I phase shifting circuitry 392242 may be configured to shift the phase of I signal 392262, for example, according to the I control voltage, e.g., as described below.

In some demonstrative aspects, I phase shifting circuitry 392242 may include, for example, a second VDAC (not shown in FIG. 392), which may be configured to convert control signal 392420 into a Q control voltage, e.g., as described below.

In some demonstrative aspects, I phase shifting circuitry 392242 may be configured to shift the phase of Q signal 392272, for example, according to the Q control voltage, e.g., as described below.

In some demonstrative aspects, I phase shifting circuitry 392242 may include, for example, a first plurality of transistors in a cascode gate arrangement (not shown in FIG. 392), which may be configured to generate the first shifted I signal, for example, according to the I control voltage, e.g., as described below.

In some demonstrative aspects, I phase shifting circuitry 392242 may include, for example, a second plurality of transistors in a cascode gate arrangement (not shown in FIG. 392), which may be configured to generate the first shifted Q signal, for example, according to the Q control voltage, e.g., as described below.

In some demonstrative aspects, Q phase shifting circuitry 392244 may include, for example, a first VDAC (not shown in FIG. 392), which may be configured to convert control signal 392430 into an I control voltage, e.g., as described below.

In some demonstrative aspects, Q phase shifting circuitry 392244 may be configured to shift the phase of I signal 392262, for example, according to the I control voltage, e.g., as described below.

In some demonstrative aspects, Q phase shifting circuitry 392244 may include, for example, a second VDAC (not shown in FIG. 392), which may be configured to convert control signal 392440 into a Q control voltage, e.g., as described below.

In some demonstrative aspects, Q phase shifting circuitry 392244 may be configured to shift the phase of Q signal 392272, for example, according to the Q control voltage, e.g., as described below.

In some demonstrative aspects, Q phase shifting circuitry 392244 may include, for example, a first plurality of transistors in a cascode gate arrangement (not shown in FIG. 392), which may be configured to generate the second shifted I signal, for example, according to the I control voltage, e.g., as described below.

In some demonstrative aspects, Q phase shifting circuitry 392244 may include, for example, a second plurality of transistors in a cascode gate arrangement (not shown in FIG. 392), which may be configured to generate the second shifted Q signal, for example, according to the Q control voltage, e.g., as described below.

In some demonstrative aspects, the first control signal, e.g., control signal 392410, may include, for example, a first digital signal, to apply first data to I phase shifting circuitry 392242, for example, based on a predefined constellation-point map, e.g., as described below.

In some demonstrative aspects, the second control signal, e.g., control signal 392420, may include, for example, a second digital signal, to apply second data to I phase shifting circuitry 392242, for example, based on the predefined constellation-point map, e.g., as described below.

In some demonstrative aspects, the third control signal, e.g., control signal 392430, may include, for example, a third digital signal, to apply third data to Q phase shifting circuitry 392244, for example, based on, the predefined constellation-point map, e.g., as described below.

In some demonstrative aspects, the fourth control signal, e.g., control signal 392440 may include, for example, a fourth digital signal, to apply fourth data to the Q phase shifting circuitry 392244, for example, based on the predefined constellation-point map, e.g., as described below.

In some demonstrative aspects, transceiver 392000 may include, for example, a calibration and control sub-system 392400, which may be operably coupled to one or more elements of transceiver 392000, for example, including baseband 392500, controllable phase shifters 392240, and/or controllable phase shifters 392340. For example, calibration and control sub-system 392400 may be configured, for example, to control and/or calibrate controllable phase-shifters 392240 and/or controllable phase-shifters 392340, for example, using one or more control signals, for example, control signal 392410, control signal 392420, control signal 392430, and/or control signal 392440, e.g., as described below.

In some demonstrative aspects, calibration and control sub-system 392400 may be configured, for example, to calibrate one or more parameters of controllable phase-shifters 392240 and/or controllable phase-shifters 392340, e.g., as described below.

In some demonstrative aspects, calibration and control sub-system 392400 may be configured to calibrate linearity and/or resolution of the plurality of controllable phase-shifters 392240 and/or the plurality of controllable phase-shifters 392340, for example, according to a predefined constellation-point map, e.g., as described below.

In some demonstrative aspects, calibration and control sub-system 392400 may be configured to control and/or calibrate the plurality of controllable phase-shifters 392240 and/or the plurality of controllable phase-shifters 392340, for example, according to a Look Up Table (LUT) 392450, e.g., as described below.

In some demonstrative aspects, LUT 392450 may be generated and/or updated by calibration and control sub-system 392400. In other aspects, LUT 392450 may not be generated by calibration and control sub-system 392400. For example, LUT 392450 may include, for example, a predefined LUT, which may be, for example, preconfigured at transceiver 392000, e.g., as described below.

In some demonstrative aspects, LUT 392450 may include, for example, a plurality of pairs of voltage values corresponding to a respective plurality of constellation points, for example, according to the predetermined constellation-point map, e.g., as described below.

In some demonstrative aspects, for example, a pair of voltage values of the plurality of pairs of voltage values may include, for example, a first I voltage value to be applied to a first control signal, e.g., control signal 392410, a first Q voltage value to be applied to a second control signal, e.g., control signal 392420, a second I voltage value to be applied to a third control signal, e.g., control signal 392430, and a second Q voltage value to be applied to a fourth control signal, e.g., control voltage 392440, e.g., as described below.

Reference is made to FIG. 393, which schematically illustrates an electronic circuit plan of phase shifting circuitry 393000, in accordance with some demonstrative aspects. For example, one or more elements and/or components of phase shifting circuitry 393000 may be implemented as part of a controllable phase-shifter 392240 and/or as part of controllable phase-shifter 392340, e.g., as described above with reference to FIG. 392. The phase shifting circuitry described herein can be incorporated in one or more circuits (e.g., radio chain circuitry 372) within the RF circuitry 325 (FIG. 3D) of mmWave communication circuitry 300 shown in FIG. 3A, although the phase shifting circuitry is not limited to such.

In one example, one or more elements and/or components of phase shifting circuitry 33000 may be implemented as part of Q phase shifting circuitry 392244 and/or as part of I phase shifting circuitry 392242, e.g., as described above with reference to FIG. 392.

In some demonstrative aspects, phase shifting circuitry 393000 may be configured, for example, to provide a phase shifted signal, for example, a differential phase shifted signal 393010 including a positive phase shifted signal 393015 and a negative phase shifted signal 393020, for example, based on an I signal 393070, e.g., a differential I signal, and a Q signal 393080, e.g., a differential Q signal, e.g., as described below. For example, the phase shifted signal 393010 may include a phase shifted I signal, e.g., phase shifted I signal 392280 (FIG. 392).

In some demonstrative aspects, phase shifting circuitry 393000 may be configured, for example, to provide a phase shifted signal, for example, a differential phase shifted signal 393090 including a positive phase shifted signal (not shown in FIG. 393) and a negative phase shifted signal (not shown in FIG. 393), for example, based on I signal 393070, e.g., a differential I signal, and Q signal 393080, e.g., a differential Q signal, e.g., as described below. For example, the phase shifted signal 393090 may include a phase shifted Q signal, e.g., phase shifted Q signal 392290 (FIG. 392).

In some demonstrative aspects, as show in FIG. 393, phase shifting circuitry 393000 may include, for example, a first plurality of transistors 393600, e.g., in a cascode gate arrangement, which may be configured to generate a shifted I signal 393050, for example, according to an I control voltage 393510, e.g., as described below.

In some demonstrative aspects, the first plurality of transistors 393600 may include, for example, one or more Field Effect Transistors (FETs), one or more bipolar-junction-transistor (BJT), and/or any other type of transistors.

In some demonstrative aspects, phase shifting circuitry 393000 may include, for example, a first VDAC 393500, which may be coupled to the first plurality of transistors 393600. For example, first VDAC 393500 may be configured to convert a first control signal 393300, e.g., an I control signal, into I control voltage 393510, and to provide I control voltage 393510 to the first plurality of transistors 393600, e.g., as described below.

In some demonstrative aspects, first control signal 393300 may include, for example, a first digital signal, e.g., control signal 392410 (FIG. 392), which may be configured to apply first data to phase shifting circuitry 393000, for example, based on, the predefined constellation-point map, e.g., as described below.

In some demonstrative aspects, first VDAC 393500 may include, for example, a 5-bit VDAC, a 6-bit VDAC, and/or a VDAC of any other resolution.

In some demonstrative aspects, phase shifting circuitry 393000 may include, for example, a first I sign switch 393610 and/or a second I sign switch 393620, which may be operably coupled to the first plurality of transistors 33600. For example, first I sign switch 393610 and/or second I sign switch 33620 may be configured to apply a positive I signal or a negative I signal to the first plurality of transistors 393600. For example, first I sign switch 393610 and/or second I sign switch 393620 may be configured to switch between applying the positive I signal to the first plurality of transistors 393600, for example, when a first I sign control signal 393030 is applied to first I sign switch 393610 and/or second I sign switch 393620, and applying a negative I signal to the first plurality of transistors 393600, for example, when a second I sign control signal 393040 is applied to the first I sign switch 393610 and/or to the second I sign switch 393620.

In some demonstrative aspects, first I sign switch 393610 and/or second I sign switch 393610 may include, for example, one or more FETs, one or more BJTs, and/or any other type of transistors and/or switch circuitry.

In some demonstrative aspects, as show in FIG. 393, phase shifting circuitry 393000 may include, for example, a second plurality of transistors 393650, e.g., in a cascode gate arrangement, which may be configured to generate a shifted Q signal 393060, for example, according to a Q control voltage 393520, e.g., as described below.

In some demonstrative aspects, the second plurality of transistors 393650 may include, for example, one or more FETs, one or more BJTs, and/or any other type of transistors.

In some demonstrative aspects, phase shifting circuitry 393000 may include, for example, a second VDAC 393550, which may be coupled to the second plurality of transistors 393650. For example, second VDAC 393550 may be configured to convert a second control signal 393350, e.g., a Q control signal, into Q control voltage 393520, and to provide Q control voltage 393520 to the second plurality of transistors 393650, e.g., as described below.

In some demonstrative aspects, second control signal 393350 may include, for example, a second digital signal, e.g., control signal 392420 (FIG. 392), which may be configured to apply second data to phase shifting circuitry 393000, for example, based on the predefined constellation-point map, e.g., as described below.

In some demonstrative aspects, second VDAC 393550 may include, for example, a 5-bit VDAC, a 6-bit VDAC and/or a VDAC of any other resolution.

In some demonstrative aspects, phase shifting circuitry 393000 may include, for example, a first Q sign switch 393630 and/or a second Q sign switch 393640, which may be operably coupled to second plurality of transistors 393650. For example, first Q sign switch 393630 and/or second Q sign switch 393640 may be configured to switch between applying a positive Q signal or a negative Q signal to, for example, second plurality of transistors 393650. For example, first Q sign switch 393630 and/or second Q sign switch 393640 may be configured to apply a positive Q signal or a negative Q signal to the second plurality of transistors 393650. For example, first Q sign switch 393630 and/or second Q sign switch 393640 may be configured to switch between applying the positive Q signal to the second plurality of transistors 393650, for example, when a first Q sign control signal 393035 is applied to first Q sign switch 393630 and/or second Q sign switch 393640, and applying a negative Q signal to the second plurality of transistors 393650, for example, when a second Q sign control signal 393045 is applied to the first Q sign switch 393630 and/or to the second Q sign switch 393640.

In some demonstrative aspects, first Q sign switch 393650 and/or a second Q sign switch 393640 may include, for example, one or more FETs, one or more BJTs, and/or any other type of transistors and/or a switch circuit.

In some demonstrative aspects, phase shifting circuitry 393000 may include, for example, a combiner 393400, which may be operably coupled to the first plurality of transistors 393600 and the second plurality of transistors 393650. For example, combiner 393400 may be configured to combine, for example, shifted I signal 393050 and shifted Q signal 393060, e.g., as described below. For example, combiner 393400 may combine, for example, a positive shifted I signal 393100 with a positive shifted Q signal 393200, and may combine, for example, a negative shifted I signal 393110 with a negative shifted Q signal 393210.

In some demonstrative aspects, phase shifting circuitry 393000 may be configured to provide the shifted I signal, e.g., positive shifted I signal 393100 and negative shifted I signal 393110, by shifting a phase of I signal 393070, for example, according to the first control signal 393300, e.g., as described below.

In some demonstrative aspects, phase shifting circuitry 393000 may be configured to provide the shifted Q signal, e.g., positive shifted Q signal 393200 and negative shifted Q signal 393210, by shifting a phase of Q signal 393040, for example, according to a second control signal 393350, e.g., as described below.

In some demonstrative aspects, phase shifting circuitry 393000 may be configured to provide the phase shifted signal 393010, for example, by combining shifted I signal 393050 with the shifted Q signal 393060.

Reference is made to FIG. 394, which schematically illustrates a first quadrant 394000 of a constellation-point map, in accordance with some demonstrative aspects.

In some demonstrative aspects, a controllable phase shifter, e.g., controllable phase shifter 392240 (FIG. 392) and/or controllable phase shifter 392340 (FIG. 392), may be configured to shift the phase of an I signal and/or the phase of a Q signal according to points in the consolation-point map of FIG. 394.

In some demonstrative aspects, as shown in FIG. 394, the first quadrant 394000 of the constellation point map may include, for example, a plurality of constellation points defined by a plurality of I values, e.g., along a first axis ("I axis"), and a plurality of Q values, e.g., along a second axis ("Q axis"). For example, as shown in FIG. 394, the I axis and the Q axis may include values in the range between 0 and 1, which may represent a first quadrant of a constellation-point map.

In some demonstrative aspects, for example, in a second quadrant of the constellation-point map, the I axis may include values in the range between 0 and −1, and the Q axis may include values in the range between 0 and 1; in a third quadrant of the constellation-point map, the I axis may include values in the range between 0 and −1 and the Q axis may include values in the range between 0 and −1; and in a fourth quadrant of the constellation-point map, the I axis may include values in the range between 0 and 1 and the Q axis may include values in the range between 0 and −1.

Reference is made to FIG. 395, which schematically illustrates a graph 395000 depicting a gain variation of constellation points verses ideal phase shifted constellation points, in accordance with some demonstrative aspects.

In some demonstrative aspects, a controllable phase shifter, e.g., controllable phase shifter 392240 (FIG. 392) and/or controllable phase shifter 392340 (FIG. 392), may be calibrated to correct an I/Q gain and/or phase imbalance, for example, with high precision, for example, according to a constellation—point map, e.g., the constellation point map of FIG. 394.

In some demonstrative aspects, graph 395000 depicts calibrated phase shifted consolation points 395200 of a calibrated controllable phase shifter, e.g., controllable phase shifter 392240 (FIG. 392) and/or controllable phase shifter 392340, for example, relative to ideal points 395100 of an ideal constellation map.

In some demonstrative aspects, as shown in FIG. 395, the calibrated phase shifted consolation points 395200 of the calibrated controllable phase shifter may be within +/−0.5 dB, and/or a similar mismatch from the ideal points 395100 of the ideal constellation map.

Referring back to FIG. 4, in some demonstrative aspects, RF circuitry 425 may be configured according to a radio architecture, which may include at least one PA-LNA Interface, which may be configured to interface between a signal antenna to a PA or LNA, for example, by canceling a leakage if a Tx signal from a PA, e.g., as described below.

In some demonstrative aspects, a radio architecture may include a PA-LNA interface, e.g., as described below.

In some demonstrative aspects, the PA-LNA interface may interface signals between at least one antenna and a PA and LNA, for example, Rx signals from the antenna to the LNA and/or Tx signals from the PA to the antenna, e.g., as described below.

In some demonstrative aspects, the PA-LNA interface may be included as part of, and/or may perform one or more operations and/or functionalities of, radio chain circuitry, e.g., as part of sub-system 435 (FIG. 4), and/or any other sub-system and/or element, if desired.

In some demonstrative aspects, implementing the PA-LNA interface in the radio architecture may provide one or more benefits and/or solve one or more technical problems, for example, by mitigating, reducing, and/or canceling a leakage of the Tx signal from the PA to LNA, and/or providing any other additional or alternative technical benefits and/or advantages.

The term "cancel" as used herein with respect to leakage may include partially or entirely cancelling, reducing, lessening, attenuating, and/or mitigating the leakage and/or an impact of the leakage on one or more signals, inputs, outputs, elements and/or components.

In some demonstrative aspects, the PA-LNA interface may be configured to provide a desired level of isolation, e.g., a high isolation, between a Tx path and an Rx path, for example, to ensure LNA reliability in a Tx mode, e.g., as described below.

In some demonstrative aspects, the PA-LNA interface may be configured to maintain a reduced level of insertion loss, e.g., a low insertion loss, for example, to allow reducing, e.g., minimizing, degradation in Noise Figure (NF) power, e.g., at an Rx mode, and/or reducing, e.g., minimizing, degradation in output power, e.g., at a Tx mode, e.g., as described below.

In some demonstrative aspects, the PA-LNA interface may be configured to cancel the leakage of the Tx signal by summing the leakage of the Tx signal with a cancelation signal at an input of the LNA, e.g., as described below.

Reference is now made to FIG. 396, which schematically illustrates a block diagram of a transceiver 396000, in accordance with some demonstrative aspects. For example, one or more elements and/or components of transceiver 396000 may be implemented as part of a transceiver 371100, e.g., as described above with reference to FIG. 371.

In some demonstrative aspects, transceiver 396000 may include, or may be operably coupled to, one or more antennas 396400, which may be, for example, operably coupled to an antenna terminal 396150, e.g., as described below.

In some demonstrative aspects, the one or more antennas 396400 may include, for example, a phased-array antenna, a dipole antenna, an internal antenna, and/or any other additional or alternative type of antenna.

In some demonstrative aspects, transceiver 396000 may include a PA-LNA interface 396100 configured to interface antenna terminal 396150 with a PA 396310 and an LNA 36310, e.g., as described below.

In some demonstrative aspects, transceiver 396000 may include, for example, a receiver 396100, e.g., including Rx circuitry, including LNA 396210, and/or a transmitter 396300, e.g., including Tx circuitry, including PA 396310, e.g., as described below.

In some demonstrative aspects, PA-LNA interface 396100 may be configured to provide a Tx signal 36010 from PA 396310 to antenna terminal 396150, for example, at a Tx mode, and to provide an Rx signal 396050 from antenna terminal 396150 to LNA 396140, for example, at an Rx mode, e.g., as described below.

In some demonstrative aspects, transceiver 396000 may include a half-duplex transceiver, which may be configured to handle reception of Rx signal 396050 and transmission of Tx signal 398010 separately and/or during non-overlapping time periods, e.g., as described below.

In some demonstrative aspects, transceiver 396000 may include a full-duplex transceiver, which may be configured to handle reception of Rx signal 396050 and transmission of Tx signal 396010 simultaneously and/or during overlapping time periods, e.g., as described below.

In some demonstrative aspects, transmitter 396300 may include, for example, one or more elements and/or components of, and/or may perform one or more functionalities of, an outphasing transmitter, a Doherty transmitter, a digital transmitter, a digital transmitter, or the like.

In some demonstrative aspects, transmitter 396300 may include, for example, a mixer 396320 to mix a LO signal 396020 with a data signal 396030, for example, a data of a required phase, to generate a phase modulated signal 396040.

In some demonstrative aspects, transmitter 396300 may include PA 396310, which may be configured to amplify phase modulated signal 396040 to generate Tx signal 396010, e.g., as described below.

In some demonstrative aspects, transmitter 396300 may include some or all the elements shown in FIG. 396 and/or may include one or more additional or alternative elements to perform one or more additional or alternative functionalities. For example, transmitter 396300 may include one or more elements of, and/or perform one or more functionalities of, transmitter 380100 (FIG. 38).

In some demonstrative aspects, receiver 396100 may be configured to downconvert an LNA input signal 396055, which may be provided by PA-LNA interface 396100 based Rx signal 396050 received at antenna port 396150, for example, at the Rx mode, e.g., as described below.

In some demonstrative aspects, receiver 396200 may include LNA 396210, which may be configured, for example, to amplify LNA input signal 396055 and to provide an amplified Rx signal 396057 to a splitter 396220. For example, splitter 396220 may split amplified Rx signal 396057 into an I Rx signal 396058 and a Q Rx signal 396059.

In some demonstrative aspects, splitter 396220 may include a Wilkinson splitter, a 1-to-2 splitter and/or any other type of splitter.

In some demonstrative aspects, receiver 396200 may include for example, an I signal balanced mixer 396240 and/or a Q signal balanced mixer 396230, which may be, for example, operably coupled to quadrature hybrid circuitry 396250. For example, I signal balanced mixer 396240 may receive I Rx signal 396058 from splitter 396220, and an LO signal with a first phase, e.g., a phase of 0 degrees or any other phase, from quadrature hybrid circuitry 396250, and may generate a positive I signal and a negative I signal.

In some demonstrative aspects, for example, Q signal balanced mixer 396230 may receive Q Rx signal 396059 from splitter 396220 and the LO signal with a second phase, e.g., a phase of 90 degrees or any other phase, from quadrature hybrid circuitry 396250, and may generate a positive Q signal and a negative Q signal.

In some demonstrative aspects, receiver 396200 may include, for example, a driver amplifier 396260 and/or a driver amplifier 36250. For example, driver amplifier 396250 may be configured to output the negative Q signal and the positive Q signal to, for example, a baseband. For example, driver amplifier 396260 may be configured to output the negative I signal and the positive I signal to, for example, the baseband.

In some demonstrative aspects, receiver 396200 may include some or all the elements shown in FIG. 396 and/or may include one or more additional or alternative elements to perform one or more additional or alternative functionalities.

In some demonstrative aspects, PA-LNA interface 396100 may be configured to apply, for example, a high impedance to an input of LNA 396310, for example, at the Tx mode, e.g., as described below.

In some demonstrative aspects, PA-LNA interface 396100 may be configured to apply, for example, a high impedance at an output of PA 396310, for example, at the Rx mode.

In some demonstrative aspects, PA-LNA interface 396100 may be configured to cancel, mitigate, attenuate, and/or reduce an impact of Tx signal 396010 on LNA 396210, for example, by cancelling, mitigating, attenuating, and/or reducing a leakage of Tx signal 396010 to LNA 396210, e.g., as described below.

In some demonstrative aspects, PA-LNA interface 396100 may include a sensor 396130, which may be configured, for example, to provide a sensed signal 396060, which may be based on Tx signal 396010 from PA 396319, e.g., as described below. For example, sensor 396130 may include a capacitive sensor. In other aspects sensor 396130 may include an inductive sensor and/or any other type of sensor.

In some demonstrative aspects, PA-LNA interface 396100 may include a phase rotator 396110 to provide a phase rotated signal 396070, for example, by rotating a phase of sensed signal 396060.

In some demonstrative aspects, phase rotator 396110 may be configured to rotate the phase of sensed signal 396060, for example, by 180 degrees. In other aspects, any other phase rotation may be used.

In some demonstrative aspects, PA-LNA interface 396100 may include a variable gain amplifier (VGA) 396120 configured to provide a Tx leakage cancelation signal 396080, for example, by amplifying phase rotated signal 396070, for example, based on an amplitude of Tx signal 396010.

In some demonstrative aspects, PA-LNA interface 396100 may include a combiner 396140, which may be configured to combine, for example, a first combiner input signal 36085 with a second combiner input signal 396095, e.g., as described below.

In some demonstrative aspects, the first combiner input signal 396085 may include Tx leakage cancellation signal 396080 and the second combiner input signal may include, for example a Tx leakage 396090 from Tx signal 396010 to the LNA 396210, e.g., as described below.

In some demonstrative aspects, combiner 396140 may include a Wilkinson combiner. In other aspects, combiner 396140 may include any other type of 2-to-1 combiner.

In some demonstrative aspects, phase rotator 396110 and/or VGA 396210 may be configured to provide Tx leakage cancelation signal 396080 having a phase and an amplitude, which may be configured to cancel, mitigate, attenuate, and/or reduce an impact of Tx leakage 396090.

In some demonstrative aspects, phase rotator 396110 may be configured to provide phase rotated signal 396070, for example, by rotating the phase of sensed signal 396060, e.g., by 180 degrees, for example, such that a resulting phase of Tx leakage cancelation signal 396080 may be substantially opposite to a phase of the Tx leakage 396090.

In some demonstrative aspects, VGA 396120 may be configured to provide Tx leakage cancelation signal 396080 by amplifying phase rotated signal 396070, for example, such that a resulting amplitude of Tx leakage cancelation signal 396080 may be substantially equal to an amplitude of the Tx leakage 396090.

In some demonstrative aspects, a relationship between amplitudes of Tx leakage 396090 and amplitude and/or frequency levels of Tx signal 396010 may be determined and/or known apriority, for example, based on simulation. For example, Tx leakage 396090 may be characterized through simulation by observing second combiner input signal 396095 for various amplitude and/or frequency levels of Tx signal 396010.

In some demonstrative aspects, a gain of VGA 396120 may be set to cancel Tx leakage 396090. For example, the gain of VGA 396120 may be set by a baseband controller (not shown in FIG. 396), for example, a baseband subsystem 110 (FIG. 1), for example, based on the amplitude and/or frequency level of Tx signal 396010. In one example, a plurality of gain values corresponding to a plurality of amplitude and/or frequency levels of Tx signal 396010 may be stored, for example, in a memory or a Look Up Table (LUT), and the gain of VGA 396120 may be set, for example, by the baseband controller, for example, based on a gain corresponding to an amplitude and/or frequency of Tx signal 396010.

In other aspects, the gain of VGA 396120 may be set and/or controlled according to any additional or alternative parameter, e.g., corresponding to Tx signal 396010.

In some demonstrative aspects, combiner 396140 may combine Rx signal 396050 with Tx leakage cancellation signal 396080, for example, in a case where Rx signal 396050 is to be received during a time period, which at least partially overlaps a time period for transmission of Tx signal 396010.

In some demonstrative aspects, at the Rx mode, for example second combiner input signal 396095 may include a combination of Rx signal 396050 from the antenna terminal 396150 and the Tx leakage 396090 from Tx signal 396010 to the LNA 396130.

In some demonstrative aspects, at the Rx mode, for example, combiner 396140 may be configured to provide to LNA 396210 the LNA input signal 396055, for example, based on a sum of first combiner input signal 396085 and second combiner input signal 396095.

Referring back to FIG. 4, in some demonstrative aspects, RF circuitry 425 may be configured according to a radio architecture, which may include at least one Quadrature LO distribution network circuitry, which may be configured to distribute LO I and Q signals to components and/or subsystems of RF circuitry 1000, for example, based on a LO signal, e.g., as described below.

In some demonstrative aspects, a radio architecture may include a quadrature LO generator, which may be configured to generate, for example, I signals and/or Q signals based on a LO signal, e.g., as described below.

In some demonstrative aspects, the quadrature LO generator may be configured to distribute the I signals and/or the Q signals to one or more elements, sub-systems, circuits and/or components of a transmitter and/or a receiver, e.g., as described below.

In some demonstrative aspects, the quadrature LO generator may include a LO distribution network, which may be configured to generate and distribute the I and/or Q signals, for example, based on the LO signal, e.g., as described below.

In some demonstrative aspects, the LO distribution network may be configured to generate the I and/or Q signals based on a multiplication factor, denoted X, which may be based, for example, on a ratio between a carrier frequency and a frequency of the LO signal, e.g., as described below.

In some demonstrative aspects, for example, the carrier frequency may include a frequency of a carrier signal to carry one or more signals to be transmitted and/or received.

In some demonstrative aspects, the LO distribution network may be configured to generate the I and/or Q signals based on a multiplication factor X=3, for example, if the LO signal has a frequency, which is a third of the carrier frequency, e.g., as described below.

In some demonstrative aspects, for example, the carrier frequency may include, for example, a 60 GHz frequency, and the LO signal may have a 20 GHz frequency. According to these aspects, for example, the LO distribution network may be configured to generate the I and/or Q signals based on a multiplication factor X=3. In other aspects, the LO distribution network may be configured to generate the I and/or Q signals based on any other multiplication factor, any other carrier frequency, any other LO signal frequency, and/or any other combination thereof.

In some demonstrative aspects, the LO distribution network may be configured to generate the I and/or Q signals, for example, by shifting a phase of the LO signal to provide phase shifted signals, and multiplying the phase and frequency of the phase shifted signals according to the multiplication factor X, e.g., as described below.

In some demonstrative aspects, the LO distribution network may be configured to apply to the LO signal a phase shift, denoted φ, which may be configured, for example, in accordance with the multiplication factor X. e.g., as described below.

In some demonstrative aspects, for example, the multiplication factor X and/or the phase shift φ may be configured, for example, such that X*φ=90 degrees, for example, to generate the I and Q signals with a phase shift of 90 degrees (o), e.g., as described below.

In some demonstrative aspects, for example, the LO distribution network may be configured to apply to the LO signal a phase shift of φ=300 to generate first and second shifted signals with a phase shift of 300, and to triple the frequency and phase of the first and second shifted signals, for example, using frequency triplers, e.g., as described below. In other aspects, any other phase shift and/or multipliers may be used.

In some demonstrative aspects, implementing the quadrature LO generator in the radio architecture may provide one or more benefits and/or solve one or more technical problems, for example, by achieving a reduced phase variation, e.g., even less than a 2 degree phase variation over the frequency band of 48-72 GHz, delivering almost equal amplitudes for I and Q signals at outputs of frequency triplers, consuming low power, and/or providing one or more other additional or alternative technical benefits and/or advantages.

In some demonstrative aspects, the quadrature LO generator may be included as part of, and/or may perform one or more operations and/or functionalities of, up-conversion and/or down-conversion circuitry, sub-systems, and/or elements, e.g., as part of sub-system 415 (FIG. 4), synthesizer circuitry, e.g., as part of sub-system 420 (FIG. 4), and/or any other sub-system and/or element, if desired.

Reference is now made to FIG. 397, which schematically illustrates a block diagram of a transceiver 397000, in accordance with some demonstrative aspects. For example, one or more elements and/or components of transceiver 397000 may be implemented as part of transceiver 371100 (FIG. 371).

In some demonstrative aspects, transceiver 397000 may include, for example, a half-duplex transceiver, e.g., as described below.

In some demonstrative aspects, transceiver 397000 may include a millimeter wave transceiver, which may be configured to operate over a 60 GHz frequency band. In other aspects, transceiver 397000 may include any other type of transceiver configured to operate on any other additional or alternative frequency band.

In some demonstrative aspects, transceiver 397000 may include, for example a LO 397600 to generate a LO signal 397080, e.g., as described below.

In some demonstrative aspects, LO 397600 may include, for example a crystal oscillator, a Phase Lock Loop (PLL), an injection LO (ILO), and/or any other type of LO.

In some demonstrative aspects, LO 397600 may be configured, for example, to generate LO signal 397080 having a frequency, which is based on, e.g., a fraction of, a carrier frequency to be implemented by transceiver 397000, e.g., as described below.

In some demonstrative aspects, LO 397600 may be configured to generate LO signal 397080 having a frequency, which is a third of the carrier frequency, e.g., as described below.

In some demonstrative aspects, LO 397600 may include, for example, a 20 GHz LO, for example, to generate LO signal 397080 having a frequency in a 20 GHz frequency band, for example, a third of a 60 GHz carrier frequency band, e.g., as described below. In other aspects, LO 397600 may be configured to generate LO signal 397080 having any other frequency, which may be based on any other carrier frequency.

In some demonstrative aspects, transceiver 397000 may include, for example, LO distribution network circuitry 397500, which may be configured to distribute, for example, phase-shifted LO signals, for example, to one or more transmitter and/or receiver components, circuits and/or subsystems, e.g., as described below.

In some demonstrative aspects, LO distribution network circuitry 397500 may be configured, for example, to distribute one or more Tx signals, e.g., a Tx I signal 397055 and/or a Tx Q signal 397070, for example, to an IQ transmitter 397300; and/or one or more Rx signals, e.g., an Rx I signal 397025 and/or an Rx Q signal 397040, for example, to an IQ receiver 397100, e.g., as described below.

In some demonstrative aspects, LO distribution network circuitry 397500 may include at least one IQ generator to generate at least one respective pair of an I signal and a Q signal based on LO signal 397080 from LO 397600, e.g., as described below.

In some demonstrative aspects, the at least one IQ generator may include, may be implemented as part of, and/or may perform one or more functionalities of, a quadrature LO generator, e.g., as described below.

In some demonstrative aspects, LO distribution network circuitry 397500 may include, for example, a plurality of driver amplifiers, for example, driver amplifier 397530, a driver amplifier 397540, a driver amplifier 397550 and/or a driver amplifier 397560, which may be configured, for example, to drive LO signal 397080 to the at least one IQ generator. In other aspects, any other number and/or configuration of driver amplifiers and/or any other additional or alternative circuits or components may be implemented to distribute LO signal 397080 to the at least one IQ generator.

In some demonstrative aspects, LO distribution network circuitry 397500 may include a first IQ generator, e.g., a Tx IQ generator 397510, which may be configured to generate a first I signal, e.g., a Tx I signal 397055, and a first Q signal, e.g., a Tx Q signal 397070, for example, based on LO signal 397080; and/or a second IQ generator, e.g., an Rx IQ generator 397520, which may be configured to generate a second I signal, e.g., an Rx I signal 397025, and a second Q signal, e.g., an Rx Q signal 397040, for example, based on LO signal 397080, e.g., as described below.

In some demonstrative aspects, Tx IQ generator 397510 and/or Rx IQ generator 397520, may be implemented as part of, and/or may perform one or more functionalities of, a quadrature LO generator, e.g., as described below.

In some demonstrative aspects, LO distribution network circuitry 397500 may include two IQ generators, for example, Tx IQ generator 397510 and Rx IQ generator 397520, e.g., as shown in FIG. 397. In other aspects, LO distribution network circuitry 397500 may include any other number of IQ generators, e.g., one IQ generator, e.g., a Tx IQ generator or an Rx IQ generator, or more than two IQ generators.

In some demonstrative aspects, Tx IQ generator 397510 may be configured as a Tx IQ generator to generate Tx I signal 397055 and Tx Q signal 397070 to be upconverted into a Tx signal, which may be transmitted via one or more antennas 397325, e.g., as described below.

In some demonstrative aspects, Rx IQ generator 397520 may be configured as a Rx IQ generator to generate Rx I signal 397025 and Rx Q signal 397040 to be downconverted into one or more IF signals, for example, based on an Rx signal, which may be received by one or more antennas, e.g., as described below.

In some demonstrative aspects, an IQ generator of LO distribution network 397500, e.g., IQ generator 397510 and/or Rx IQ generator 397520, may include, for example, phase shifting circuitry to generate a first phase shifted signal and a second phase shifted signal based on LO signal 397080, e.g., which may have a first frequency, for example, such that a phase of the second phase shifted signal may be shifted by a phase shift, e.g., 300 or by any other phase shift, from a phase of the first phase shifted signal, e.g., as described below.

In some demonstrative aspects, Tx IQ generator 397510 may include, for example, phase shifting circuitry 397512 to generate a first phase shifted signal 397052 and a second phase shifted signal 397072, for example, based on LO signal 397080, which may have a first frequency, e.g., a 20 GHz frequency. For example, a phase of the second phase shifted signal 397072 may be shifted by 30*o* from a phase of first phase shifted signal 397052, e.g., as described below. For example, first phase shifted signal 397052 and/or second phase shifted signal 397072 may have a frequency of 20 GHz, e.g., when LO signal 397080 has a frequency of 20 GHz.

In some demonstrative aspects, first phase shifted signal 397052 may include, for example, a differential signal including a plurality of signals (not shown in FIG. 397). For example, the differential signal may include, for example, a first I phase shifted signal and a second I phase shifted signal, e.g., as described below.

In some demonstrative aspects, second phase shifted signal 397072 may include, for example, a differential signal including a plurality of signals (not shown in FIG. 397). For example, the differential signal may include, for example, a first Q phase shifted signal and a second Q phase shifted signal, e.g., as described below.

In some demonstrative aspects, Rx IQ generator 397520 may include, for example, phase shifting circuitry 397522 to generate a third phase shifted signal 397022 and a fourth phase shifted signal 397042, for example, based on LO signal 397080, which may have the first frequency. For example, a phase of the fourth phase shifted signal 397042 may be shifted by a phase shift, e.g., 300 or any other phase shift, from a phase of third phase shifted signal 397022, e.g., as described below. For example, third phase shifted signal 397022 and/or fourth phase shifted signal 397042 may have a frequency of 20 GHz, e.g., when LO signal 397080 has a frequency of 20 GHz.

In some demonstrative aspects, the first frequency may be a third of a carrier frequency. For example, LO signal 397080, first phase shifted signal 397052, second phase shifted signal 397072, third phase shifted signal 397022, and/or fourth phase shifted signal 397042 may have a frequency of 20 GHz, for example, when the carrier frequency includes a 60 GHz frequency. In other aspects, LO signal 397080, first phase shifted signal 397052, second phase shifted signal 397072, third phase shifted signal 397022, and/or fourth phase shifted signal 397042 may have any other frequency, and/or any other fraction of the carrier frequency.

In some demonstrative aspects, third phase shifted signal 397022 may include, for example, a differential signal including a plurality of signals (not shown in FIG. 397). For example, the differential signal may include, for example, a first I phase shifted signal and a second I phase shifted signal, e.g., as described below.

In some demonstrative aspects, fourth phase shifted signal 397042 may include, for example, a differential signal including a plurality of signals (not shown in FIG. 397). For example, the differential signal may include, for example, a first Q phase shifted signal and a second Q phase shifted signal, e.g., as described below.

In some demonstrative aspects, the IQ generator of LO distribution network 397500, e.g., Tx IQ generator 397510 and/or Rx IQ generator 397520, may include, for example, first tripler circuitry to generate an I signal having a second frequency, by tripling the phase of the first phase shifted signal generated by the IQ generator, and by tripling a frequency of the first phase shifted signal generated by the IQ generator, e.g., as described below.

In some demonstrative aspects, Tx IQ generator 397510 may include, for example, first tripler circuitry 397514 to generate Tx I signal 397055 having a second frequency, for example, by tripling the phase of first phase shifted signal 397052 and tripling a frequency of first phase shifted signal 397052, e.g., as described below.

In some demonstrative aspects, Tx IQ generator 397510 may be configured to generate Tx I signal 397055, which may have a frequency equal to the carrier frequency, for example, 60 GHz. For example, Tx I signal 397055 may have a frequency of 60 GHz, when first phase shifted signal 397052 has a frequency of 20 GHz. In other aspects, Tx I signal 397055 may have any other carrier frequency, for example, based on a multiple of a frequency of first phase shifted signal 397052, which in turn may be a fraction of any other carrier frequency.

In some demonstrative aspects, Rx IQ generator 397520 may include, for example, first tripler circuitry 397524 to generate Rx I signal 397025 having a second frequency, for example, by tripling the phase of third phase shifted signal 397022 and tripling a frequency of third phase shifted signal 397022, e.g., as described below. For example, Rx I signal 397025 may have a frequency of 60 GHz, when first phase shifted signal 397052 has a frequency of 20 GHz. In other aspects, Rx I signal 397025 may have any other carrier frequency, for example, based on a multiple of a frequency of third phase shifted signal 397022, which in turn may be a fraction of any other carrier frequency.

In some demonstrative aspects, the IQ generator of LO distribution network circuitry 397500, e.g., Tx IQ generator 397510 and/or Rx IQ generator 397520, may include, for example, second tripler circuitry to generate a Q signal having the second frequency, for example, by tripling the phase of the second phase shifted signal and tripling a frequency of the second phase shifted signal, e.g., as described below.

In some demonstrative aspects, Tx IQ generator 397510 may include, for example, second tripler circuitry 397516 to generate Tx Q signal 397070 having a second frequency, for example, by tripling the phase of second phase shifted signal 397072 and tripling a frequency of second phase shifted signal 397072, e.g., as described below. For example, Tx Q signal 397070 may have a frequency of 60 GHz, when second phase shifted signal 397072 has a frequency of 20 GHz. In other aspects, Tx Q signal 397070 may have any other carrier frequency, for example, based on a multiple of a frequency of second phase shifted signal 397072, which in turn may be a fraction of any other carrier frequency.

In some demonstrative aspects, Rx IQ generator 397520 may include, for example, second tripler circuitry 397526 to generate Rx Q signal 397040 having a second frequency, for example, by tripling the phase of fourth phase shifted signal 397042 and tripling a frequency of fourth phase shifted signal 397042, e.g., as described below. For example, Rx Q signal 397040 may have a frequency of 60 GHz, when fourth phase shifted signal 397042 has a frequency of 20 GHz. In other aspects, Rx Q signal 397040 may have any other carrier frequency, for example, based on a multiple of a frequency of fourth phase shifted signal 397042, which in turn may be a fraction of any other carrier frequency.

In some demonstrative aspects, the first tripler circuitry of the IQ generator, e.g., first tripler circuitry 397514 of Tx IQ generator 397510 and/or first tripler circuitry 397524 of Rx IQ generator 397520, may include first imbalance and amplitude circuitry (not shown in FIG. 397) to balance an amplitude of a first I phase shifted signal generated by the phase shifting circuitry of the IQ generator, e.g., a positive I phase shifted signal, for example, according to a second Q phase shifted signal, of the IQ generator, e.g., a negative Q phase shifted signal; and/or to balance an amplitude of a second I phase shifted signal, e.g., a negative I phase shifted signal, for example, according to a first Q phase shifted signal, e.g., a positive Q phase shifted signal, e.g., as described below.

In some demonstrative aspects, the second tripler circuitry of the IQ generator, e.g., second tripler circuitry 397516 of Tx IQ generator 397510 and/or second tripler circuitry 397526 of Rx IQ generator 397520, may include second imbalance and amplitude circuitry (not shown in FIG. 397) to balance an amplitude of the first Q phase shifted signal generated by the phase shifting circuitry of the IQ generator, e.g., the positive Q phase shifted signal, for example, according to the second I phase shifted signal, e.g., the negative I phase shifted signal; and/or to balance an amplitude of the second Q phase shifted signal e.g., the negative Q phase shifted signal, for example, according to the first I phase shifted signal, e.g., the negative I phase shifted signal, e.g., as described below.

In some demonstrative aspects, phase shifting circuitry 397512 and/or phase shifting circuitry 397522 may include passive phase shifting circuitry (not shown in FIG. 397), e.g., as described below.

In some demonstrative aspects, the phase shifting circuitry of the IQ generator, e.g., phase shifting circuitry 397512 of Tx IQ generator 397510, and/or phase shifting circuitry 397522 of Rx IQ generator 3957520, may include first injection LO (ILO) circuitry (not shown in FIG. 397) to generate the first phase shifted signal of the IQ generator, and/or second ILO circuitry (not shown in FIG. 397) to generate the second phase shifted signal of the IQ generator, e.g., as described below.

In some demonstrative aspects, IQ receiver 397100 may be configured to utilize Rx I signal 397025 and/or an Rx Q signal 397040, for example, to generate an I IF signal and/or a Q IF signal, for example, based on one or more Rx signals from one or more antennas, e.g., as described below. For example, IQ generator 397100 may include and/or may be operably coupled to, for example, one or more antennas, e.g., including antennas 397130 and/or 397140.

In some demonstrative aspects, antennas 397130 and/or 397140 may include, for example, at least one phased-array antenna, dipole antenna, and/or any other type of antenna.

In some demonstrative aspects, IQ receiver 397100 may include one or more Low Noise Amplifiers (LNAs), e.g., including an LNA 397110 and/or an LNA 397120, which may be configured to generate at least one amplified Rx signal, e.g., an amplified Rx signal 397015 and/or an amplified Rx signal 397030, for example, based on an Rx signal, e.g., an Rx signal 397010 and/or an Rx signal 397011.

In some demonstrative aspects, IQ receiver 397100 may include an RF mixer 397200, which may be configured to downconvert amplified Rx signal 397015 into a downconverted I signal 397020, for example, based on Rx I signal 397025; and/or to downconvert amplified Rx signal 397030 into a downconverted Q signal 397035, for example, based on Rx Q signal 397040, e.g., as described below.

In some demonstrative aspects, Rx mixer 397200 may include, for example, a first mixer, e.g., an I mixer 397210, which may be configured to downconvert amplified Rx signal 397015 into downconverted I signal 397020, for example, based on Rx I signal 397025.

In some demonstrative aspects, Rx mixer 397200 may include, for example, a second mixer, e.g., a Q mixer 397220, which may be configured to downconvert amplified Rx signal 397030 into downconverted Q signal 397035, for example, based on Rx Q signal 397040.

In some demonstrative aspects, IQ transmitter 397300 may be configured to generate an amplified Tx signal 397325 to be transmitted, for example, via one or more antennas 397310, e.g., as described below.

In some demonstrative aspects, IQ transmitter 397300 may include and/or may be coupled to the one or more antennas 397310.

In some demonstrative aspects, antennas 397310 may include, for example, at least one phased array antenna, dipole antenna and/or any other type of antenna.

In some demonstrative aspects, IQ transmitter 397300 may include a Tx mixer 397400, which may be configured to upconvert an IF I signal 397045 into an upconverted I signal 397050, for example, based on the Tx I signal 397055, e.g., as described below.

In some demonstrative aspects, Tx mixer 397400 may be configured to upconvert an IF Q signal 397060 into an upconverted Q signal 397065, for example, based on Tx Q signal 397070, e.g., as described below.

In some demonstrative aspects, Tx mixer 397400 may include, for example, a first mixer, e.g., an I mixer 397420, which may be configured to upconvert the IF I signal 397045 into upconverted I signal 397050, for example, based on Tx I signal 397055

In some demonstrative aspects, Tx mixer 397400 may include, for example, a second mixer, e.g., a Q mixer 397410, which may be configured to upconvert IF Q signal 397060 into upconverted Q signal 397065, for example, based on a Tx Q signal 397070.

In some demonstrative aspects, IQ transmitter 397300 may include, for example, a combiner 397330, which may be configured to combine upconverted I signal 397050 and upconverted Q signal 397065 into a Tx signal 397075.

In some demonstrative aspects, IQ transmitter 397300 may include a PA 397320, which may be configured to amplify Tx signal 397075 into amplified Tx signal 397325. For example, amplified Tx signal 397325 may be transmitted via one or more antennas 397310.

Reference is made to FIG. 398, which schematically illustrates a quadrature LO generator 398000, in accordance with some demonstrative aspects.

In some demonstrative aspects, one or more components of quadrature LO generator 398000 may be implemented, for example, as part of a LO distribution network, e.g., LO distribution network 397500 (FIG. 397), for example, to provide I and Q signals, for example, to a transmitter, e.g., IQ transmitter 397300 (FIG. 397), and/or a receiver, e.g., IQ receiver 397100 (FIG. 397).

In some aspects, the quadrature LO generators described herein can be incorporated in one or more circuits (e.g., up-conversion circuitry 350) within the transmit circuitry 315 (FIG. 3B) of mmWave communication circuitry 300 shown in FIG. 3A, although the LO generators are not limited to such.

In some demonstrative aspects, one or more components, sub-systems, and/or circuits of quadrature LO generator 398000 may be implemented, for example, as part of a Tx IQ generator, e.g., Tx IQ generator 397510 (FIG. 397), and/or as part of an Rx IQ generator, e.g., Rx IQ generator 397520 (FIG. 397).

In some demonstrative aspects, quadrature LO generator 398000 may be configured to generate the I and Q signals, for example, based on a LO signal 398010 and/or LO signal 398020, which may be provided by a LO 398100, e.g., as described below.

In some demonstrative aspects, quadrature LO generator 398000 may include an ILO 398200, which may be configured to generate, for example, a first I shifted signal 398030 and/or a second I shifted signal 398040, for example, based on a LO signal 398010 and/or LO signal 398020, e.g., as described below.

In some demonstrative aspects, ILO 398200 may include, for example, a controllable resonance sub-system 398205, e.g., in the form of an Indicator (L)-Capacitor (LC) block, and a plurality of transistors, e.g., including transistors 398230, 398240, 398250 and/or 398260. For example, LO 398100 may provide first LO signal 398010 to transistor 398250, and/or second LO signal 398020 to transistor 398260.

In some demonstrative aspects, transistors 398230, 398240, 398250 and/or 398260 may include FETs, BJTs, and/or any other type of transistors.

In some demonstrative aspects, LO signal 398020 may be out phased from LO signal 398010. For example, LO signal 398010 may have a 20 GHz frequency and a phase of +300, and/or LO signal 398020 may have a frequency of 20 GHz and a phase of −300. In other aspects, other frequencies and/or other phase shifts may be used.

In some demonstrative aspects, transistor 398230 and transistor 398240 may be configured to cause controllable resonance sub-system 398205 to be in resonance at a deigned frequency, for example, 20 GHz. For example, controllable resonance sub-system 398205 may generate first I shifted signal 398030 and/or second I shifted signal 398040 based on LO signal 398010 and/or LO signal 398020, respectively. For example, second I shifted signal 398040 may be out of phase from first I shifted signal 398030.

In some demonstrative aspects, controllable resonance sub-system 398205 may controllably generate first I shifted signal 398030 and/or second I shifted signal 398040, for example, according to a control signal 398050, e.g., as described below.

In some demonstrative aspects, control signal 398050 may be provided, for example, by a controller 398800, for example, a baseband controller and/or any other controller.

In some demonstrative aspects, control signal 398050 may, for example, control controllable resonance sub-system 398205 to shift the phase of first I shifted signal 398030 and/or second I shifted signal 398040. For example, control signal 398050 may have, for example, 7 bit Capacitors-Digital-to-Analog-Convertor (CAPDAC) control and/or any other control data.

In some demonstrative aspects, quadrature LO generator 398000 may include an ILO 398300, which may be configured to generate, for example, a first Q shifted signal 398060 and/or a second Q shifted signal 398070, for example, based on LO signal 398010 and/or LO signal 398020, e.g., as described below.

In some demonstrative aspects, ILO 398300 may include, for example, a controllable resonance sub-system 398305, e.g., in the form of a LC block, and a plurality of transistors, e.g., including transistors 398330, 398340, 398350 and/or 398360. For example, LO 398100 may provide first LO signal 398010 to transistor 398350, and/or second LO signal 398020 to transistor 398360.

In some demonstrative aspects, transistors 398330, 398340, 398350 and/or 398360 may include FETs, BJTs, and/or any other type of transistors.

In some demonstrative aspects, transistor 398330 and transistor 398340 may be configured to cause controllable resonance sub-system 398305 to be in resonance at a deigned frequency, for example, 20 GHz. For example, controllable resonance sub-system 398305 may generate first Q shifted signal 398060 and/or second Q shifted signal 398070 based on LO signal 398010 and/or LO signal 398020, respectively. For example, second Q shifted signal 398070 may be out of phase from first Q shifted signal 398060.

In some demonstrative aspects, controllable resonance sub-system 398305 may controllably generate first Q shifted signal 398060 and/or second Q shifted signal 398070, for example, according to a control signal 398080, e.g., as described below.

In some demonstrative aspects, control signal 38080 may be provided, for example, by controller 398800, for example, a baseband controller and/or any other controller.

In some demonstrative aspects, control signal 398080 may, for example, control controllable resonance sub-system 398305 to shift the phase of first Q shifted signal 38060 and/or second Q shifted signal 398070. For example, control signal 398080 may have, for example, 7 bit CAPDAC control and/or any other control data.

In some demonstrative aspects, implementing a 20 GHz ILO with a controllable resonance sub-system, e.g., resonance sub-system 398205 and/or resonance sub-system 398305, e.g., the LC block, which may be controlled, for example, according to 7-bit CAPDAC control and/or any other control scheme, may provide additional and/or improved control on phase shift tuning, for example, compared to a passive phase shifter. Additionally or alternatively, the active nature of the ILOs 398200 and/or 398300 may guarantee more gain, for example, compared to the passive phase shifter.

In some demonstrative aspects, quadrature LO generator 398000 may include a tripler 398400, which may be configured to triple a phase and/or frequency of first I shifted signal 398030 and/or second I shifted signal 398040, e.g., as described below. For example, tripler 398400 may receive first I shifted signal 398030, for example, through a series load 398270 and capacitor 398280, and may triple the phase and/or the frequency of first I shifted signal 398030. For example, tripler 398400 may receive second I shifted signal 398040, for example, through a series load 398275 and capacitor 398285, and may triple a phase and/or frequency of second I shifted signal 398040.

In some demonstrative aspects, tripler 398400 may include, for example, a transistor 398430 and a transistor 398450, which may be coupled to a current source 398470, e.g., in a common source arrangement. For example, current source 398470 may provide a predefined current, for example, 1.2 milliampere (mA), or any other current, to sources of transistors 398430 and 398450, if desired.

In some demonstrative aspects, a transistor 398440 may be configured to provide first I shifted signal 398030 at a drain of transistor 398430.

In some demonstrative aspects, a transistor 398460 may be configured to provide second I shifted signal 398040 at a drain of transistor 398450.

In some demonstrative aspects, tripler 398400 may include, for example, a capacitor 398420 and/or a transformer 398410. For example, capacitor 398420 may be configured to be in resonance with transformer 398410, for example, when tripler 398400 may, e.g., in combination with transistor 398430 and transistor 398450, triple the phases and amplitudes of first I shifted signal 398030 and/or second I shifted signal 398040.

In some demonstrative aspects, transistors 398430, 398440, 398450 and 398460 may include FETs, BJTs, and/or any other type of transistors.

In some demonstrative aspects, tripler 398400 may provide a tripled positive I signal and a tripled negative I signal to a mixer 398700.

In some demonstrative aspects, quadrature LO generator 398000 may include a tripler 398500, which may be configured to triple a phase and/or frequency of first Q shifted signal 398060 and/or second I shifted signal 398070, e.g., as described below. For example, tripler 398500 may receive first Q shifted signal 398060, for example, through a series load 398375 and capacitor 398385, and may triple the phase and/or the frequency of first Q signal shifted 398060. For example, tripler 398500 may receive second Q shifted signal 398070, for example, through a series load 398375 and capacitor 398385, and may triple a phase and/or frequency of second Q shifted signal 398070.

In some demonstrative aspects, tripler 398500 may include, for example, a transistor 398530 and a transistor 398550 in a common source arrangement, which may be coupled to a current source 398570. For example, current source 398470 may provide a predetermined current, for example, 1.2 mA, or any other current, to sources of transistors 398430 and 398450, if desired.

In some demonstrative aspects, transistor 398540 may be configured to provide first Q shifted signal 398060 to a drain of transistor 398530

In some demonstrative aspects, a transistor 398560 may be configured to provide second Q shifted signal 398070 to a drain of transistor 398550.

In some demonstrative aspects, tripler 398500 may include, for example, a capacitor 398520 and/or a transformer 398510. For example, capacitor 398520 may be configured to be in resonance with transformer 398510. For example, tripler 398400 may, e.g., in combination with transistor 398430 and transistor 398450, triple the phases and amplitudes of first Q shifted signal 398060 and/or second Q shifted signal 398070.

In some demonstrative aspects, transistors 398530, 398540, 398550 and 398560 may include FETs, BJTs, and/or any other type of transistors.

In some demonstrative aspects, tripler 398500 may provide a tripled positive Q signal and a tripled negative Q signal to a mixer 398600.

In some demonstrative aspects, a quadrature LO generator, e.g., quadrature LO generator 398000, implementing a parallel connection of frequency triplers, e.g., tripler 398400 and tripler 398500, may provide, for example, a wider locking range, e.g., compared to a series of frequency triplers.

In some demonstrative aspects, a quadrature LO generator, e.g., quadrature LO generator 398000, which implements ILO 398200 and ILO 398300, may provide more control on phase tuning, may have less amplitude imbalance, and/or may have a wider locking range around 60 GHz, for example, compared to a passive LO generator.

Reference is made to FIG. 399, which schematically illustrates a passive quadrature LO generator 399000, in accordance with some demonstrative aspects.

In some demonstrative aspects, passive quadrature LO generator 399000 may be configured to shift a phase of a first LO signal 399010 and a second LO signal 399020, by a predefined phase shift, for example, a 90o phase shift or any other phase shift, e.g., as described below.

In some demonstrative aspects, one or more components of passive quadrature LO generator 399000 may be implemented, for example, as part of LO distribution network, e.g., LO distribution network 397500 (FIG. 397), for example, to provide I and Q signals, for example, to a transmitter, e.g., transmitter 397300 and/or a receiver, e.g., receiver 397100 (FIG. 397).

In some demonstrative aspects, one or more components, sub-systems, and/or circuits of passive quadrature LO generator 399000 may be implemented, for example, as part of a Tx IQ generator, e.g., Tx IQ generator 397510 (FIG. 397), and/or as part of an Rx IQ generator, e.g., Rx IQ generator 397520 (FIG. 397).

In some demonstrative aspects, passive quadrature LO generator 399000 may be configured to generate the I and Q signals, for example, based on an LO signal 399010 and/or an LO signal 399020, which may be provided by an LO 399100, e.g., as described below.

In some demonstrative aspects, LO 399100 may be configured to generate LO signal 399010 and/or LO signal 399020, e.g., as described below.

In some demonstrative aspects, LO signal 399020 may be out phased from LO signal 399010. For example, LO signal 399010 may have a 20 GHz frequency and a phase of +0o, and/or LO signal 399020 may have a frequency of 20 GHz and a phase of 900. In other aspects, other frequencies and/or other phase shifts may be used.

In some demonstrative aspects, passive quadrature LO generator 399000 may include a phase shifter 399200, which may be configured to shift a phase of LO signal 399010 and/or a phase of LO signal 399020, for example, by 300. In other aspects, phase shifter 39200 may be configured to shift the phase of LO signal 399010 and/or LO signal 399020 to any other phases, if desired.

In some demonstrative aspects, phase shifter 399200 may be configured to generate, for example, a first I shifted signal 399050, e.g., a positive I shifted signal, and/or a second I shifted signal 399060, e.g., a negative I shifted signal, for example, based on first LO signal 399010.

In some demonstrative aspects, phase shifter 399200 may be configured to generate, for example, a first Q shifted signal 399040, e.g., a positive Q shifted signal, and/or a second Q shifted signal 399030, e.g., negative Q shifted signal, for example, based on second LO signal 399020, e.g., as described below.

In some demonstrative aspects, phase shifter 399200 may include passive indicator-resistor-capacitor (LRC) circuitry 399205, which may be configured to generate, for example, first I shifted signal 399050, second I shifted signal 398040, first Q shifted signal 399040, and/or second Q shifted signal 399030, e.g., as described below.

In some demonstrative aspects, LRC circuitry 399205, may include an arrangement of an inductor 399210, e.g., with an inductance of L, an inductor 399220, e.g., with an inductance of L, a capacitor 399230, e.g., with a capacitance of C, a capacitor 399240, e.g., with a capacitance of C, a resistor 399250, e.g., with a resistance of 2R, and/or a resistor 399260, e.g., with a resistance of 2R. For example, the arrangement of LRC circuitry 399205 may be configured to, for example, generate first I shifted signal 399050, second I shifted signal 398040, first Q shifted signal 399040, and/or second Q shifted signal 399030, for example, with a predefined phase shift, e.g., a 30o phase shift or any other phase shift, e.g., as described below.

In some demonstrative aspects, inductor 399210, capacitor 399240, and/or resistor 399250 may be configured to provide, for example, first I shifted signal 399050 and/or second Q shifted signal 399030, for example, based on LO signal 399010.

In some demonstrative aspects, inductor 399220, capacitor 399230, and/or resistor 399260 may be configured to provide, for example, first Q shifted signal 399040 and/or second I shifted signal 399060, for example, based on LO signal 399020.

In some demonstrative aspects, a phase shift applied by phase shifter 399200 may be based, for example, on a quality (Q) factor, denoted Q, which may be related to the maximum or peak energy of, for example, LRC circuitry 399025. For example, for a Q factor Q=1 a phase shift of 90*o* may be applied, and/or for a Q factor Q=0.25 a phase shift of 30*o* may be applied. For example, the phase of LO signal 399010 and/or LO signal 399020 may be configured, for example, based on the Q factor, which may be determined, for example, as follows:

$$Q=\sqrt{L/C}/R \quad (8)$$

$$\omega 0=1/\sqrt{LC} \quad (9)$$

$$Q=\sqrt{\sqrt{L/C}/2R}=0.25 \quad (10)$$

where Q denotes a quality factor, L denotes an inductance, C denotes capacitance, R denotes resistance, and $\omega_o$ denotes an angular frequency.

In some demonstrative aspects, an input impedance of quadrature LO generator 399000 may be configured, for example, to a 50 Ohm impedance or any other impedance, by setting the resistance R, for example, to a 50 Ohm impedance. For example, an input impedance of phase shifter 399200 may be designed for a 50 Ohm impedance or higher impedances.

In some demonstrative aspects, phase shifter 399200 may include, for example, a 30° phase shifter for a 60 GHz quadrature generator with a 50 Ohm input impedance. In one example, the 30° phase shifter may achieve less than 2° phase variation over the frequency band of 48-72 GHz. For example, an amplitude imbalance between I and Q signals of phase shifter 399200 may be, for example, 0.3 dB at the input of the triplers, e.g., as described below.

In some demonstrative aspects, passive quadrature LO generator 399000 may include a tripler 399300, which may be configured to triple the phase and/or frequency of second Q shifted signal 399030 and first Q shifted signal 399040, e.g., as described below. For example, tripler 399300 may receive first Q shifted signal 399040 at a gate of transistor 399370, and second Q shifted signal 399040 to a gate of transistor 399360.

In some demonstrative aspects, transistor 399360 may be configured to oscillate, for example, according to second Q shifted signal 399030.

In some demonstrative aspects, transistor 399370 may be configured to oscillate, for example, according to first Q shifted signal 399040.

In some demonstrative aspects, tripler 399300 may include a transistor 399330, which may be configured to receive second Q shifted signal 399030 from transistor 399360, and to triple the phase and the frequency of second Q shifted signal 399030.

In some demonstrative aspects, tripler 399300 may include a transistor 399350, which may be configured to receive first Q shifted signal 399040, and to triple the phase and the frequency of first Q shifted signal 399040.

In some demonstrative aspects, tripler 399300 may include a transformer 399310, which may be configured to be in resonance with a capacitor 399320 at a frequency of, for example, 60 GHz, and a phase of, for example, 900. In other aspects, the resonance frequency may be set to any other frequency. For example, transistor 399370 and/or transistor 399350 may triple the phase and frequency of first Q shifted signal 399040; and/or transistor 399360 and/or transistor 399330 may triple the phase and frequency second Q shifted signal 399030, according to the resonance frequency.

In some demonstrative aspects, tripler 399300 may include imbalance and amplitude circuitry 399390, which may be configured to balance between amplitudes of second Q shifted signal 399030 and first I shifted signal 399050, e.g., as described below.

In some demonstrative aspects, imbalance and amplitude circuitry 399390 may include a transistor 399340, e.g., a coupling transistor M5 or any other transistor, which may be configured to balance the phase and amplitude imbalance between second Q shifted signal 399030 and first I shifted signal 399050.

In some demonstrative aspects, tripler circuitry 399300 may include imbalance and amplitude circuitry 399395, which may be configured to balance between amplitudes of first Q shifted signal 399040 and second I shifted signal 399060, e.g., as described below.

In some demonstrative aspects, imbalance and amplitude circuitry 399395 may include a transistor 399380, e.g., coupling transistor M6 or any other transistor, which may be configured to balance the phase and amplitude imbalance between first Q shifted signal 399040 and second I shifted signal 399060

In some demonstrative aspects, transistors 399330, 399340, 399350, 399360, 399380 and/or 399390 may include FETs, BJTs, and/or any other type of transistor.

In some demonstrative aspects, IQ generator 399000 may include a mixer 399500, which may be configured to mix a first tripled Q signal 399070, e.g., a positive tripled Q signal, with a second tripled Q signal 399075, e.g., negative tripled Q signal, to provide, for example, a Q shifted signal 399510.

In some demonstrative aspects, passive quadrature LO generator 399000 may include a tripler 399400, which may be configured to triple phase and/or frequency of first I shifted signal 399050 and second I shifted signal 399060, e.g., as described below. For example, tripler 399400 may receive first I shifted signal 399050 at a gate of transistor 399460, and second I shifted signal 399060 to a gate of transistor 399470.

In some demonstrative aspects, transistor 399460 may be configured to oscillate, for example, according to first I shifted signal 399050.

In some demonstrative aspects, transistor 399470 may be configured to oscillate, for example, according to second I shifted signal 399060.

In some demonstrative aspects, tripler 399400 may include a transistor 399430, which may be configured to receive first I shifted signal 399050 from transistor 399460, and to triple the phase and the frequency of first I shifted signal 399050.

In some demonstrative aspects, tripler 399400 may include a transistor 399450, which may be configured to receive second I shifted signal 399060, and to triple the phase and the frequency of second I shifted signal 399060.

In some demonstrative aspects, tripler 399400 may include a transformer 399410, which may be configured to be in resonance with a capacitor 399420 at a frequency of, for example, 60 GHz, and a phase of, for example, 900, e.g., as described below. In some other aspects, the resonance frequency may be set to any other frequency. For example, transistor 399460 and/or transistor 399470 may triple the phase and frequency of first I shifted signal 399050 and/or second I shifted signal 399060, according to the resonance frequency.

In some demonstrative aspects, tripler 399400 may include imbalance and amplitude circuitry 399490, which may be configured to balance between amplitudes of second Q shifted signal 399030 and first I shifted signal 399050, e.g., as described below.

In some demonstrative aspects, imbalance and amplitude circuitry 399490 may include a transistor 399440, e.g., coupling transistor M5 or any other transistor, which may be configured to balance the phase and amplitude imbalance between second Q shifted signal 399030 and first I shifted signal 399050.

In some demonstrative aspects, tripler circuitry 399400 may include imbalance and amplitude circuitry 399495, which may be configured to balance between amplitudes of first Q shifted signal 399040 and second I shifted signal 399060, e.g., as described below.

In some demonstrative aspects, imbalance and amplitude circuitry 399495 may include a transistor 399480, e.g., coupling transistor M6 or any other transistor, which may be configured to balance the phase and amplitude imbalance between first Q shifted signal 399040 with second I shifted signal 399060

In some demonstrative aspects, transistors 399430, 399440, 399450, 399460, 399480 and 399490 may include FETs, BJTs, and/or any other type of transistor.

In some demonstrative aspects, IQ generator 399000 may include a mixer 399600, which may be configured to mix a first tripled I signal 399085, e.g., a positive tripled I signal, with a second tripled I signal 399080, e.g., negative tripled I signal to provide, for example, an I shifted signal 399610.

Advantageously, triplers 399300 and 399400 may provide substantially equal amplitudes for I and Q signals at the output of triplers 399300 and 399400.

Referring back to FIG. 4, in some demonstrative aspects, RF circuitry 425 may be configured according to a radio architecture, which may include at least one dual channel wideband amplifier, which may be configured to an RF signal from a first channel with an RF signal from a second channel into a wideband RF signal, e.g., as described below.

In some demonstrative aspects, a radio architecture may include, for example, a wideband transceiver, which may be configured to support multiple channels, for example, to support simultaneous communication over two or more channels, for example, according to one or more channel bonding and/or channel aggregation techniques, e.g., as described below.

In some demonstrative aspects, a wideband transceiver may be configured to transmit RF signals over one or more wireless channels. For example, a wireless medium may be defined with respect to a frequency band, for example, a 60 GHz band, a 2.4 GHz band, a 5 GHz band, or the like.

In some demonstrative aspects, the frequency band may be divided into one or more channels having a predefined channel bandwidth, for example, 20 Mega Hertz (MHz) or 40 MHz, e.g., in a 2.4 GHz or 5 GHz band, 2.16 GHz, 4.32 GHz, 6.48 GHz or 8.64 GHz, e.g., in a 60 GHz band, and/or any other bandwidth, e.g., as described below.

In some demonstrative aspects, one or more channel bonding and/or channel aggregation techniques may be used, for example, to provide a wider channel bandwidth.

In some demonstrative aspects, for example, in a 2.4 GHz or 5 GHz frequency band, channel bonding may increase data transportation by bonding and/or combining, for example, two 20 MHz channels into a 40 MHz channel, two 40 MHz channels into an 80 MHz channel, two 80 MHz channels into a 160 MHz channel, and/or any other number of channels of any other channel bandwidth.

In some demonstrative aspects, for example, in a Directional Multi Gigabit (DMG) frequency band above a channel frequency of 45 GHz, e.g., a 60 GHz frequency band, one or more mechanisms may be implemented, for example, to support communication over a channel band width (BW) (also referred to as a “wide channel”, an “EDMG channel”, or a “bonded channel”) including two or more channels, e.g., two or more 2.16 GHz channels.

In some demonstrative aspects, the channel bonding mechanisms may include, for example, a mechanism and/or an operation whereby two or more channels, e.g., 2.16 GHz channels, can be combined, e.g., for a higher bandwidth of packet transmission, for example, to enable achieving higher data rates, e.g., when compared to transmissions over a single channel.

Some demonstrative aspects are described herein with respect to communication over a channel BW including two or more 2.16 GHz channels, however other aspects may be implemented with respect to communications over a channel bandwidth, e.g., a “wide” channel, including or formed by any other number of two or more channels, for example, an aggregated channel including an aggregation of two or more channels.

In some demonstrative aspects, one or more channel bonding mechanisms may be implemented, for example, to support an increased channel bandwidth, for example, a channel BW of 4.32 GHz, a channel BW of 6.48 GHz, a channel BW of 8.64 GHz, and/or any other additional or alternative channel BW.

In some demonstrative aspects, a wideband transceiver may be configured to support communication over two or more different channels, for example, with two or more different networks.

In one example, some wireless networks may be configured to occupy a first channel bandwidth, for example, a 20 MHz channel bandwidth, and/or some other wireless networks may be configured to occupy a second channel bandwidth, for example, a 40 MHz channel bandwidth, or another wider channel bandwidth.

In another example, some wireless networks may be configured to occupy a first channel bandwidth, for example, a 2.16 GHz channel bandwidth, and/or some other wireless networks may be configured to occupy a second channel bandwidth, for example, a 4.32 GHz channel bandwidth, or another wider channel bandwidth.

In some demonstrative aspects, it may not be efficient to implement a wideband transmitter including one or more amplifiers, e.g., with low-Q matching networks, which may be configured, for example, to achieve a flat frequency response, and thus may draw more power to compensate for power losses. For example, when working in a single channel, the amplifiers may be power inefficient, for example, since a portion of the bandwidth may not be used.

In some demonstrative aspects, a wideband transmitter, which may be configured for transmission over a wideband bandwidth, may include a wideband PA, which may be configured to amplify signals to be transmitted over two or more different bandwidths in a wideband bandwidth, e.g., as described below.

In some demonstrative aspects, the wideband PA may include two or more PAs, which may be configured to amplify signals to be transmitted in two or more respective different bandwidths within the wideband bandwidth, e.g., as described below.

In some demonstrative aspects, the wideband PA may be configured to utilize the two or more PAs, e.g., in combination, to amplify wideband signals to be transmitted over the wideband bandwidth including the two or more bandwidths, e.g., as described below. For example, the two or more PAs may be configured to generate a flat high gain wideband response, e.g., when transmitting a wideband RF signal.

In some demonstrative aspects, the wideband PA may be configured to selectively utilize only some of the two or more PAs to amplify signals to be transmitted over a bandwidth, which is narrower than the wideband bandwidth, e.g., as described below.

In some demonstrative aspects, implementing a wideband PA including two or more PAs, e.g., as described herein, may allow, for example, reducing an overall power consumption of the wideband PA, for example, when at least one PA of the PAs is switched off, and at least one other PA is used to transmit RF signals over a portion of the wideband frequency channel.

In some demonstrative aspects, the wideband PA may include a selective network power combiner to selectively couple input RF signals to one or more of the PAs, and/or a selective network power splitter to selectively couple output RF signals from one or more of the PAs, e.g., as described below.

In some demonstrative aspects, the selective network combiner may include, or may be implemented by, a transformer ("combiner transformer"), and/or the selective network splitter may include, or may be implemented by, a transformer ("splitter transformer"), e.g., as described below. In other aspects, the selective network combiner may be implemented by any other combiner, and/or the selective network splitter may be implemented by any other splitter.

In some demonstrative aspects, the splitter transformer may include two or more sections to selectively couple the input RF signals to the two or more PAs, respectively; and/or the combiner transformer may include two or more sections to selectively couple the output RF signals from the two or more PAs, respectively, e.g., as described below.

In some demonstrative aspects, a section of the combiner transformer may be configured to have a physical structure and/or size, which may be based on an operating frequency and/or a bandwidth of a respective PA to be coupled to the section, e.g., as described below.

In some demonstrative aspects, a section of the splitter transformer may be configured to have a physical structure and/or size, which may be based on an operating frequency and/or a bandwidth of a respective PA to be coupled by the section, e.g., as described below.

In some demonstrative aspects, for example, a size of a section of a transformer, e.g., the section of the combiner transformer and/or the section of the splitter transformer, may be configured to be proportional to a frequency of the PA to be coupled by the section. For example, a first section of the transformer, e.g., a first section of the combiner transformer and/or a first section of the splitter transformer, may have a first size configured for a first frequency of a first PA; and/or a second section of the transformer, e.g., a second section of the combiner transformer and/or a second section of the splitter transformer, may have a second size configured for a second frequency of a second PA. For example, the second size may be larger than the first size, e.g., when the second frequency is higher than the first frequency.

In some demonstrative aspects, implementing different sizes for the different sections of the splitter transformer and/or the combiner transformer, may allow for example, reducing a chip area of the wideband PA, e.g., as described below.

In some demonstrative aspects, implementing the wideband PA with the plurality of PAs, e.g., as described herein, may provide one or more benefits and/or solve one or more technical problems, for example, by achieving a reduced power consumption, increasing a linearity, and/or increasing efficiency, for example, by allowing selective switching of one or more PAs of the plurality of PAs, for example, based on a bandwidth to be utilized, e.g., as described below.

In some demonstrative aspects, the wideband PA may be included as part of, and/or may perform one or more operations and/or functionalities of, radio chain circuitry, e.g., as part of sub-system 1035 (FIG. 10), and/or any other sub-system and/or element, if desired.

Reference is made to FIG. 400, which schematically illustrates a block diagram of a transmitter 400000, in accordance with to some demonstrative aspects.

In some demonstrative aspects, transmitter 400000 may be configured to transmit wideband RF signals and/or high frequency RF signals, for example, in a 60 GHz frequency band and/or any other frequency band, e.g., as described below.

In some demonstrative aspects, transmitter 400000 may be operably coupled to, and/or may include, for example, one or more antennas 400100. For example, one or more antennas 400100 may include a phased-array antenna, a dipole antenna, an internal antenna, or the like. In other aspects, other different types of antennas may be used.

In some demonstrative aspects, transmitter 400000 may include a wideband amplifier 400200, which may be configured to amplify wideband RF signals, which may be transmitted, for example, via one or more of antennas 400100, e.g., as described below.

In some demonstrative aspects, transmitter 400000 may include baseband circuitry 400300, which may be configured to generate an IF input signal 400310.

In some demonstrative aspects, transmitter 400000 may include RF circuitry 400400, which may be configured to generate, for example, an RF input signal 400410, for example, by upconverting IF input signal 400310 into RF input signal 400410. For example, RF input signal 400410 may be configured according to a frequency bandwidth of a channel to be used for transmission.

In some demonstrative aspects, baseband circuitry 400300 may be operably coupled to RF circuitry 400400, for example, by an RF cable 400500. For example, RF cable 400500 may include a coax cable or the like. In other aspects, other types of RF cable, connectors and/or interfaces may be used. In other aspects, any other additional or alternative elements and/or sub-systems may be implemented to couple between baseband circuitry 400300 and RF circuitry 400400.

In some demonstrative aspects, for example, transmitter 400000 may include one or more switches to operably couple between baseband 400300 and a plurality of RF circuitry elements 400400, e.g., as described below with reference to FIG. 404.

In some demonstrative aspects, wideband amplifier 400200 may be configured to amplify RF input signal 400410, e.g., as described below.

In some demonstrative aspects, wideband amplifier 400200 may include, for example, a 60 GHz amplifier configured to amplify RF signals 400410 in a 60 GHz frequency band, e.g., as described below. In other aspects, wideband amplifier 400200 may be configured for any other additional or alternative frequency bands.

In some demonstrative aspects, wideband amplifier 400200 may be configured, for example, to amplify RF input signal 400410 over a wideband frequency, for example, by splitting the RF input signal 400410 into a high band frequency and a low band frequency, amplifying the high band frequency by a high band amplifier, amplifying the low band frequency by a low band amplifier, and combining a high band amplified signal with a low band amplified signal into a wideband amplified signal, e.g., as described below.

In some demonstrative aspects, wideband amplifier circuitry 400200 may include a splitter 400210, which may be configured to split RF input signal 400410 into a plurality of signals over a respective plurality of frequency bands. For example, the plurality of signals may include at least first and second signals over first and second respective frequency bands, e.g., as described below. For example, splitter 400210 may be configured to split RF input signal 400410 into, for example, a high frequency band signal 400220 over a high frequency band, and/or a low frequency band signal 400230 over a low frequency band, e.g., as described below.

In some demonstrative aspects, the high frequency band may include, for example, a frequency band including one or more first channels of a 5G frequency band, and/or the low frequency band may include, for example, a frequency band including one or more second channels of the 5G frequency band. In one example, the one or more first channels and/or the one or more second channels may include one or more 500 MHz channels and/or any other additional or alternative channels. In one example, the 5G frequency band may include, for example, a frequency band of 37-43.5 GHz, a frequency band of 24.5-39.5 GHz or any other frequency band. In other aspects, any other additional or alternative frequency bands may be implemented.

Some demonstrative aspects are described herein with respect to a wideband amplifier implementing two frequency bands, e.g., the high frequency band and/or the low frequency band. In other aspects, the wideband amplifier may implement any other number of frequency bands, e.g., at least three frequency bands.

In some demonstrative aspects, splitter 400210 may include, for example, a resistive splitter, a hybrid splitter, a transistor implemented splitter, a Wilkinson splitter and/or any other type of splitter.

In some demonstrative aspects, splitter 400210 may include, for example, a transformer 400215, which may be configured to receive, for example, RF input signal 400410, at a first section 400218 of transformer 400215, to provide, by a second section 400212 of transformer 400215, for example, low frequency band signal 400230 to a low band amplifier 400250, and to match an impedance between, for example, second section 400212 of transformer 400215 and low band amplifier 400250, e.g., as described below. For example, transformer 400215 may be configured to match, for example, a 50 Ohm impedance, between second section 400212 and low band amplifier 400250. In other aspects, the impedance between second section 400212 and low band amplifier 400250 may include any other impedance value.

In some demonstrative aspects, transformer 400215 may be configured to provide, for example, by a third section 400214 of transformer 400215, high frequency band signal 400220 to a high band amplifier 40240, and to match impedance between, for example, third section 400214 of transformer 400215 and high band amplifier 400240. For example, transformer 400215 may be configured to match, for example, a 50 Ohm impedance, between third section 400214 and high band amplifier 400240. In other aspects, the impedance between third section 400214 and high band amplifier 400240 may include any other impedance value.

In some demonstrative aspects, splitter 400210 may include, for example, first circuitry 400211 to filter low frequency band signal 400230 from RF input signal 400410, and, for example, second circuitry 400213 to filter high frequency band signal 400220 from RF input signal 400410, e.g., as described below.

In some demonstrative aspects, first circuitry 400211 may be implemented by, for example, second section 400212 of transformer 400215 and at least part of first section 400218 of transformer 400215, and/or second circuitry 400213 may be implemented, for example, by third section 400214 of transformer 400214 and at least part of first section 400218 of transformer 400215. In other aspects, first circuitry 400211 and/or second circuitry 400213 may be implemented by any other additional or alternative elements. For example, first circuitry 400211 and/or second circuitry 400213 may be implemented, for example, by a plurality of transistors, an integrated circuit, hybrid circuitry, and/or any other components.

In some demonstrative aspects, high band amplifier 400240 may be configured to amplify, for example, high frequency band signal 400220, and may provide a first amplified signal, e.g., a high band amplified signal 400245, e.g., as described below.

In some demonstrative aspects, high band amplifier 400240 may include an outphasing amplifier, e.g., as described above with reference to FIG. 390, a Doherty power amplifier, e.g., as described above with reference to FIG. 387, a digital power amplifier, e.g., as described above with reference to FIG. 380, and/or any other amplifier.

In some demonstrative aspects, low band amplifier 400250 may be configured to amplify, for example, low frequency band signal 400230, and may provide a second amplified signal, e.g., a low band amplified signal 400255, e.g., as described below.

In some demonstrative aspects, low band amplifier 400250 may include an outphasing amplifier, e.g., as described above with reference to FIG. 390, a Doherty power amplifier, e.g., as described above with reference to FIG. 387, a digital power amplifier, e.g., as described above with reference to FIG. 380, and/or any other amplifier.

In some demonstrative aspects, wideband amplifier 400200 may include a combiner 400260, which may be configured to combine, for example, a first amplified signal, e.g., a high band amplified signal 400245, and a second amplified signal, e.g., a low band amplified signal 400255, into, for example, an amplified RF signal 400270, e.g., as described below.

In some demonstrative aspects, combiner 400260 may include a resistive combiner, a hybrid combiner, a transistor implemented combiner, a Wilkinson combiner, and/or any other type of combiner.

In some demonstrative aspects, combiner 400260 may include, for example, a transformer 400265, which may be configured to receive first ("high band") amplified signal 400245 from high band amplifier 400240, at a first section 400262 of transformer 400265, and to match an impedance, for example, a 50 Ohm impedance, between first section 400262 of transformer 400265 and high band amplifier 400240, e.g., as described below. In other aspects, the impedance between, for example, first section 400245 and high band amplifier 400240 may include any other impedance value.

In some demonstrative aspects, transformer 400265 may be configured to receive second ("Low band") amplified signal 400255 from low band amplifier 400250, at a second section 400264 of transformer 400265, and to match an impedance, for example, a 50 Ohm impedance, between second section 400264 of transformer 400265 and low band amplifier 400250, e.g., as described below. In other aspects, the impedance between second section 400264 and low band amplifier 400250 may include any other impedance value.

In some demonstrative aspects, transformer 400265 may include, for example, a third section 400267 to combine first amplified signal 400245 from the first section 400262 of transformer 400265 with second amplified signal 400255 from second section 400264 of transformer 400265 into amplified RF signal 400270.

In some demonstrative aspects, third section 400267 may be configured to match, for example, a 50 Ohm impedance, between low band amplifier 400250 and, for example, one or more antennas 400100, and between high band amplifier 400240 and one or more antennas 400100. In other aspects, the impedance between third section 400267 and one or more antennas 400100 may include any other impedance value.

In some demonstrative aspects, first section 400262 and second section 400264 may have, for example, different physical sizes, e.g., as described below. In some demonstrative aspects, a section of transformer 400265 may be configured to have a physical structure and/or size, which may be based on an operating frequency and/or a bandwidth of a respective PA to be coupled by the section. For example, a physical size of first section 400262 of the transformer 400265 may be larger than a physical size of second section 400264 of transformer 400265.

In some demonstrative aspects, wideband amplifier circuitry 400200 may include a first switch 400270, which may be configured to activate low band amplifier 400250, for example, when RF input signal 400410 is at least over a first frequency band, e.g., including the low frequency band to be amplified by low band amplifier 400250, e.g., as described below.

In some demonstrative aspects, wideband amplifier circuitry 400200 may include a second switch 400280, which may be configured to activate high band amplifier 400240, for example, when RF input signal 400410 is at least over a second frequency band, e.g., including the high frequency band to be amplified by high band amplifier 400240, e.g., as described below.

In some demonstrative aspects, switch 400270 may be configured to deactivate low band amplifier 400250, for example, when RF input signal 400410 is not at least partially over the first frequency band, and/or switch 400270 may be configured to deactivate low band amplifier 400250, for example, when RF input signal 400410 at least partially outside of the second frequency band, e.g., as described below.

In some demonstrative aspects, switch 400270 and/or switch 400280 may be controllably activated and/or deactivated, for example, by baseband circuitry 40310, for example, based on a frequency bands of RF signal 400410.

Reference is made to FIG. 401, which schematically illustrates a band plan 401000 of a plurality of channels corresponding to a plurality of channel bandwidths, which may be implemented, in accordance with some demonstrative aspects.

In some demonstrative aspects, a wideband amplifier, e.g., wideband amplifier 400200 (FIG. 400), may be configured to transmit RF signals over one or more channel bandwidths of the plurality of channel bandwidths according to the band plan of

FIG. 401.

In some demonstrative aspects, band plan 401000 may include, for example, a plurality of 2.16 GHz channels 401400, for example, at a frequency range from 57.24 GHz to 65.88 GHz, e.g., according to an IEEE 802.11-2016 Specification. For example, as shown in FIG. 401, band plan 401000 may include four 2.16 GHz channels, denoted as #1, #2, #3, and #4.

In some demonstrative aspects, a wideband amplifier, e.g., wideband amplifier 400200 (FIG. 400), may be configured to transmit RF signals over one or more wide channel bandwidths, which may be formed, for example, by two or more of channels 401400, e.g., as described below.

In some demonstrative aspects, a channel bandwidth 401100, for example, at a frequency range from 57.24 GHz to 65.88 GHz, may include, for example, an 8.64 GHz frequency bandwidth. For example, channel bandwidth 401100 may be split, for example, between low band amplifier 400250 (FIG. 400) and high band amplifier 400240 (FIG. 400), e.g., as described above. For example, low band amplifier 400250 (FIG. 400) may be configured, for example, for a first 4.32 GHz channel, e.g., channel #9 in FIG. 401, and high band amplifier 400250 (FIG. 400) may be configured, for example, for a second 4.32 GHz channel, e.g., channel #11 in FIG. 401.

In some demonstrative aspects, wideband amplifier 400200 (FIG. 400) may include four amplifiers, and, for example, each channel of the four channels 401400 forming channel bandwidth 401100 may be provided to another respective amplifier of the four amplifiers, according to the frequency band of the channel and the frequency band of the amplifier.

In some demonstrative aspects, for example, at a frequency range from 57.24 GHz to 63.72 GHz, a channel bandwidth 401200 may include, for example, a bandwidth 6.48 GHz. For example, channel bandwidth 401200 may be split, for example, between low band amplifier 400250 (FIG. 400) and high band amplifier 400240 (FIG. 400), e.g., as described above. In one example, low band amplifier 400250 (FIG. 400) may be configured, for example, for a first 2.16 GHz channel, e.g., channel #1 in FIG. 401, and high band amplifier 400240 (FIG. 400) may be configured, for example, for a 4.32 GHz bandwidth including channel #2 and channel #3 in FIG. 401. In another example, low band amplifier 400250 (FIG. 400) may be configured, for example, for a 4.32 GHz channel, e.g., channel #9 in FIG. 401, and high band amplifier 400240 (FIG. 400) may be configured, for example, for a 2.16 GHz channel, e.g., channel #4 in FIG. 401.

In some demonstrative aspects, for example, at a frequency range from 57.24 GHz to 65.88 GHz, a channel bandwidth 401300 may include, for example, 4.32 GHz bandwidth, and may include, for example, two channels, e.g., a low channel band from 57.24 GHz to 61.56 GHz, and a high channel band from, e.g., 61.56 GHz to 65.88 GHz. For example, the low channel band may be provided to low band amplifier 400250 (FIG. 400), and the high channel band may be provided to high band amplifier 400240 (FIG. 400), e.g., as described above. In one example, low band amplifier 400250 (FIG. 400) may be configured, for example, for a first 2.16 GHz channel, e.g., channel #1 in FIG. 401, and high band amplifier 400250 (FIG. 400) may be configured, for example, for a second 2.16 GHz channel, e.g., channel #2 in FIG. 401. In another example, low band amplifier 400250 (FIG. 400) may be configured, for example, for a third 2.16 GHz channel, e.g., channel #3 in FIG. 401, and high band amplifier 400250 (FIG. 400) may be configured, for example, for a fourth 2.16 GHz channel, e.g., channel #4 in FIG. 401.

Reference is made to FIG. 402, which schematically illustrates a graph 402000 depicting a gain response of a low band amplifier and a high band amplifier, in accordance with some demonstrative aspects. In some aspects, the amplifier circuitry described herein can be incorporated in one or more circuits (e.g., radio chain circuitry 372) within the RF circuitry 325 (FIG. 3D) of mmWave communication circuitry 300 shown in FIG. 3A, although the amplifier circuitry is not limited to such.

In some demonstrative aspects, wideband amplifier 400200 (FIG. 400) may include low band amplifier 400250 (FIG. 400) having a gain response 402100, and/or high band amplifier 400240 (FIG. 400) having a gain response 402200. For example, a combination of low band amplifier 400250 (FIG. 400) having gain response 402100 with high band amplifier 400240 (FIG. 400) having gain response 402200, may result, for example, in a wideband amplifier, e.g., wideband amplifier 400200 (FIG. 400), having a flat gain response.

Reference is made to FIG. 403, which schematically illustrates a transformer 403000, in accordance with some demonstrative aspects.

In some demonstrative aspects, transformer 403000 may be included as part of, and/or may perform one or more operations and/or functionalities of, a combiner, e.g., as part of transformer 400265 (FIG. 400), and/or a splitter, e.g., as part of transformer 400215 (FIG. 400), and/or any other sub-system and/or element, if desired. In some aspects, the transformers described herein can be incorporated in one or more circuits (e.g., radio chain circuitry 372) within the RF circuitry 325 (FIG. 3D) of mmWave communication circuitry 300 shown in FIG. 3A, although the transformers are not limited to such.

In some demonstrative aspects, transformer 403000 may include, for example, a low band section 403100, which may be configured to receive and/or output low band frequencies by input/output ports 403400, e.g., as described below.

In some demonstrative aspects, transformer 403000 may include, for example, a high band section 403200, which may be configured to receive and/or output high band frequencies by input/output ports 403300, e.g., as described below.

In some demonstrative aspects, transformer 403000 may include, for example, a common section 403600, which may be configured to receive an RF signal and to output a combined RF signal at input/output ports 403500, e.g., as described below.

In some demonstrative aspects, transformer 403000 may be configured to operate as, for example, a combiner and/or as a splitter, e.g., as described below.

In some demonstrative aspects, for example, when operating as a combiner, transformer 403000 may receive a low band frequency signal at input port 403400 of low band section 403100, may receive, for example, a high band frequency signal at input port 403300 of high band section 403200, and may output, for example, a combined signal at output port 403500 of common section 403600.

In some demonstrative aspects, for example, when operating as a splitter, transformer 403000 may receive, for example, an input RF signal at input port 403500 of common section 403600, may output, for example, a low band frequency signal at output port 403400 of low band section 403100, and may output, for example, a high band frequency signal at output port 403300 of high band section 403200.

In some demonstrative aspects, the physical size of low band section 403100 may be, for example, smaller that the physical size of high band section 403200.

Referring back to FIG. 1A, in some demonstrative aspects, baseband sub-system 110 and/or RFEMs 115 may be configured according to a radio architecture, which may include a plurality of impedance matching switches, which may be configured to match impedance between a modem core, e.g., a baseband sub-system, e.g., a baseband processor, 110, to a plurality of radio cores, e.g., RFEMs 115, for example, based on a count of the plurality of radio cores, e.g., as described below. In some demonstrative aspects, a modem core may include a baseband processor and/or one or more additional or alternative processing components to generate and/or process signals for wireless communication, e.g., via one or more radio cores.

In some demonstrative aspects, a transceiver may include a plurality of radio cores and an at least one modem core, e.g., as described below.

In some demonstrative aspects, a 5G transceiver may include at least two main cores connected, for example, by a coax, and/or any other RF compatible connection elements and/or sub-systems, e.g., as described below. For example, the at least two main cores may include a Modem-Baseband (M-Core) and two or more Radio Front-End (R-Core).

In some demonstrative aspects, the R-core may be included as part of, and/or may perform one or more operations and/or functionalities of, one or more radio chain circuitry and/or sub-systems, e.g., as part of sub-system 435 (FIG. 4), and/or any other sub-system and/or element, if desired.

In some demonstrative aspects, a plurality of switches may be configured to connect the M-Core to the plurality of R-Cores. For example, the plurality of switches may be switched according to wireless device requirements, e.g., as described below. For example, the M-Core may be connected to one R-Core at a time and/or, for example, to multiple R-Cores working simultaneously, e.g., as described below.

In some demonstrative aspects, at least one switch of the plurality of switches, e.g., only some of the switches or each one of the switches, may be configured to match an impedance between an R-Core of a plurality of R-Cores and the M-core, for example, based on the number of R-Cores which may be connected to the M-core, e.g., as described below.

In some demonstrative aspects, matching the impedance between the R-Core of the plurality of R-Cores and the M-core, for example, based on the number of R-Cores, which may be connected to the M-core, may provide one or more benefits and/or solve one or more technical problems. For example, matching the impedance between the R-Core and the M-core based on the number of R-cores to be connected to the M-core may allow, for example, to maintain a substantially constant impedance, for example, an impedance of 50 Ohm or any other impedance, between the M-core and the R-Core, e.g., between the M-core and each of the R-cores connected to the M-core.

Reference is now made to FIG. 404, which schematically illustrates a block diagram of a wireless communication apparatus 404000, in accordance with some demonstrative aspects. In some aspects, wireless communication apparatuses (e.g., transmitters, receivers, transceivers, and so forth) described herein can be incorporated in (or implemented as) one or more circuits within the mmWave communication circuitry 300 shown in FIG. 3A, although the communication apparatuses are not limited to such.

In some demonstrative aspects, wireless communication apparatus 404000 may be configured to transmit and/or receive wireless RF signals, for example, over a 2.4 GHz frequency band, a 5 GHz frequency band, a 60 GHz frequency band, a frequency band of a 5G communication network, and/or on any other frequency band, e.g., as described below.

In some demonstrative aspects, wireless communication apparatus 404000 may include an M-core 404300, which may be implemented, for example, as part of a baseband, e.g., as part of baseband circuitry and/or logic, and/or as part of any other additional or alternative element, sub-system and/or circuit.

In some demonstrative aspects, wireless communication apparatus 404000 may include a plurality of R-Cores 404100 to be selectively coupled to M-core 404300. For example, as shown in FIG. 404, the plurality of R-Cores 404100 may include at least two R-cores, for example, an R-Core 404130 and a R-Core 404160, to be selectively coupled to M-core 404300, e.g., as described below. For example, R-Core 404130 and/or R-Core 404160 may include a radio front end. For example, the radio front end may include one or more circuits, components, and/or sub-systems to receive and/or transmit RF signals, such as, for example, a power amplifier (PA), a low noise amplifier (LNA), an antenna interface, and/or the like. In one example, R-Core 404130 and/or R-Core 404160 may include one or more elements of, and/or perform one or more functionalities of, radio front end module 115 (FIG. 1).

In some demonstrative aspects, R-Core 404130 and/or R-Core 404160 may include a half-duplex radio front end, a half-duplex transceiver, or the like, e.g., as described below. In some other demonstrative aspects, R-Core 404130 and/or R-Core 404160 may include a full duplex radio.

In some demonstrative aspects, wireless communication apparatus 404000 may include and/or may be operably coupled to one or more antennas, e.g., including antenna 404400 and/or antenna 404450. For example, R-Core 404130 may be operably coupled to at least one antenna 404400, and/or radio core 404160 may be operably coupled to at least one antenna 404450.

In some demonstrative aspects, antennas 404400 and/or 404450 may include, for example, one or more phased-array antennas, one or more dipole antennas, and/or any other type of antenna.

In some demonstrative aspects, the plurality of R-Cores 404100 may be coupled to M-core 404300 via a plurality of RF cables 404500, e.g., such that M-core 404300 may be connected to an R-Core via at least one RF cable. For example, R-Core 404130 may be coupled to M-Core 404300 via an RF cable 404530, and/or R-Core 404160 may be coupled to M-Core 404300 via an RF cable 404560, e.g., as described below.

In some demonstrative aspects, RF cable 404530 and/or RF cable 404560 may include a coaxial cable. In other aspects, RF cable 404530 and/or RF cable 404560 may include any other RF computable cable.

Some demonstrative aspects are described herein with respect to an architecture implementing one or more RF cables to couple an M-core to a plurality of RF cores. However, in other aspects any other additional or alternative connectors, cables, and/or elements may be implemented to couple the M-core to the plurality of RF cores.

In some demonstrative aspects, wireless communication apparatus 404000 may include a plurality of impedance matching switches 404600 to switchably couple M-core 404300 to one or more R-Cores of the plurality of R-Cores 404100, e.g., as described below. For example, as shown in FIG. 404, the plurality of impedance matching switches 404600 may include an impedance matching switch 404630 to switchably couple M-core 404300 to R-core 404130; and/or an impedance matching switch 404630 to switchably couple M-Core 404300 to R-Core 404160, e.g., as described below.

In some demonstrative aspects, as shown in FIG. 404, the plurality of impedance matching switches 404600 may include two switches, e.g., switches 404630 and 404660, to switchably couple M-core 404300 to two respective R-Cores, e.g., R-Core 404130 and R-Core 404160. In other aspects, the plurality of impedance matching switches 404600 may include any other number of switches, e.g., three or more switches, to switchably couple M-core 404300 to any other number of R-Cores, e.g., three or more respective R-Cores.

In some demonstrative aspects, an impedance matching switch of the plurality of impedance matching switches 404600, e.g., impedance matching switch 404630 and/or impedance matching switch 404660, may include a first terminal to be operably coupled the M-core 404300, and a second terminal to be operably coupled to a respective R-Core of the plurality of R-Cores 404100, e.g., as described below.

In some demonstrative aspects, impedance matching switch 404630 may include a first terminal 404610 to be operably coupled the M-core 404300, and a second terminal 404620 to be operably coupled to R-Core 404130, e.g., as described below.

In some demonstrative aspects, impedance matching switch 404660 may include a first terminal 404670 to be operably coupled the M-core 404300, and a second terminal 404680 to be operably coupled to R-Core 404160, e.g., as described below.

In some demonstrative aspects, as shown in FIG. 404, an impedance matching switch of the plurality of impedance matching switches 404600, e.g., impedance matching switch 404630 and/or impedance matching switch 404660, may include impedance matching circuitry to controllably match an impedance between an R-Core of the plurality of R-Cores 404100 and M-Core 404300, for example, based on a count of the one or more R-Cores of the plurality of R-Cores, which may be coupled to M-core 404300 by the plurality of impedance matching switches 404600, e.g., as described below.

In some demonstrative aspects, impedance matching switch 404630 may include impedance matching circuitry, which may be configured to controllably match an impedance between R-Core 404130 and M-core 404300, for example, based on a count of the one or more R-Cores of the plurality of R-Cores 404100, which may be coupled to M-core 404300, by the plurality of impedance matching switches 404600, e.g., as described below.

In some demonstrative aspects, impedance matching switch 404660 may include impedance matching circuitry, which may be configured to controllably match an impedance between R-Core 404160 and M-core 404300, for example, based on a count of the one or more R-Cores of the plurality of R-Cores 404100, which may be coupled to M-core 404300, by the plurality of impedance matching switches 404600, e.g., as described below.

In some demonstrative aspects, the impedance matching circuitry of the impedance matching switch, e.g., the impedance matching circuitry of impedance matching switch 404660 and/or the impedance matching circuitry of impedance matching switch 404630, may be switchable between a plurality of impedance matching modes according to a control signal, which may be provided, for example, by M-core 404300, e.g., as described below.

In some demonstrative aspects, the impedance matching circuitry of impedance matching switch 404630 may be switchable between a plurality of impedance matching modes, for example, according to a first control signal 404010, which may be provided by M-core 404300, e.g., as described below.

In some demonstrative aspects, the impedance matching circuitry of impedance matching switch 404660 may be switchable between the plurality of impedance matching modes, for example, according to a second control signal 404020 from M-core 404300, e.g., as described below.

In some demonstrative aspects, the impedance matching circuitry of the impedance matching switch, e.g., the impedance matching circuitry of impedance matching switch 404660 and/or the impedance matching circuitry of impedance matching switch 404630, may be configured to, for example, at an impedance matching mode of the plurality of impedance matching modes, match an impedance between M-core 404300 and an R-Core of the plurality of R-cores 404100 corresponding to the impedance matching switch, for example, based on a R-Core count corresponding to the impedance matching mode, e.g., as described below.

In some demonstrative aspects, the impedance matching circuitry of impedance matching switch 404630 may be configured to, for example, at an impedance matching mode of the plurality of impedance matching modes, match an impedance between M-core 404300 and R-Core 404130, for example, based on a R-Core count corresponding to the impedance matching mode, e.g., as described below.

In some demonstrative aspects, the impedance matching circuitry of impedance matching switch 404660 may be configured to, for example, at an impedance matching mode of the plurality of impedance matching modes, match an impedance between M-core 404300 and R-Core 404160, for example, based on a R-Core count corresponding to the impedance matching mode, e.g., as described below.

In some demonstrative aspects, the plurality of impedance matching modes may include, for example, at least a first impedance matching mode, in which the impedance matching circuitry may be configured to match the impedance between the M-core 404300 and one R-Core of R-Cores 404100, e.g., R-Core 404130 or R-Core 44160; a second impedance matching mode, in which the impedance matching circuitry may be configured to match the impedance between the M-core 404300 and two R-Cores of R-Cores 404100, e.g., both R-Cores 404130 and 404160; and/or a third impedance matching mode, in which the impedance matching circuitry may be configured to match the impedance between the M-core 404300 and three R-Cores, e.g., including R-Core 404130, R-Core 404160 and another R-Core of the plurality of R-Cores 404100 (not shown in FIG. 404), e.g., as described below. In other aspects, the plurality of impedance matching modes may include one or more additional or alternative impedance matching modes to match the impedance between M-core 404300 and any other number of R-cores 404100

In some demonstrative aspects, the impedance matching circuitry of the impedance matching switch, e.g., as described above, may include a plurality of transistors, which may be configured to couple, for example, M-core 404300 to an R-Core corresponding to the impedance matching switch, e.g., as describe below.

In some demonstrative aspects, an impedance matching switch of the plurality of impedance matching switches 404600, e.g., impedance matching switch 404630 and/or impedance matching switch 404660, may be configured to maintain substantially constant impedance, for example, a 50 Ohm impedance or any other impedance, between M-core 404300 and an R-Core corresponding to the impedance matching switch, for example, regardless of and/or independent of the count of the one or more R-Cores 404100 to be connected to M-core 404300.

In some demonstrative aspects, impedance matching switch 404630 may be configured to maintain substantially constant impedance, for example, a 50 Ohm impedance or any other impedance, between M-core 404300 and R-Core 404130, for example, regardless of and/or independent of the count of the one or more R-Cores 404100 to be connected to M-core 404300.

In some demonstrative aspects, impedance matching switch 404660 may be configured to maintain substantially constant impedance, for example, a 50 Ohm impedance or any other impedance, between M-core 404300 and R-Core 404160, for example, regardless of and/or independent of the count of the one or more R-Cores 404100 to be connected to M-core 404300.

Reference is made to FIG. 405, which schematically illustrates an impedance matching switch 405000, in accordance to some demonstrative aspects. In some aspects, the switches described herein can be incorporated in one or more circuits (e.g., radio chain circuitry 372) within the RF circuitry 325 (FIG. 3D) of mmWave communication circuitry 300 shown in FIG. 3A, although the switches are not limited to such.

In some demonstrative aspects, impedance matching switch 405000 may be configured to match impedance between an M-core, e.g., M-core 404300 (FIG. 404), and an R-Core of a plurality of R-cores, e.g., the plurality of R-Cores 404100 (FIG. 404), for example, based on a count of the R-Cores to be connected to the M-core, e.g., as described below.

In some demonstrative aspects, impedance matching switch 405000 may be included as part of, and/or may perform one or more operations and/or functionalities of, impedance matching switch 404630 and/or impedance matching switch 404660 (FIG. 404), and/or any other subsystem and/or element, if desired.

In some demonstrative aspects, impedance matching switch 405000 may include impedance matching circuitry 405100 having a first terminal 405010 to couple a M-Core 405700, e.g., M-core 404300 (FIG. 404), to impedance matching circuitry 405100, and a second terminal 405020 to couple an R-Core 405800, e.g., R-Core 404130 or R-Core 404160 (FIG. 404), to impedance matching circuitry 405100.

In some demonstrative aspects, impedance matching circuitry 405100 may be configured to controllably match an impedance, for example, an impedance of 50 Ohm or any other impedance, between, M-core 405700 and R-core 405800, for example, based on a count of one or more R-Cores, e.g., R-cores 404100 (FIG. 404), which may be coupled to M-core 405700.

In some demonstrative aspects, impedance matching circuitry 405100 may be switchable between a plurality of impedance matching modes, for example, including a first mode (mode A), a second mode (mode B) and a third mode (mode C), e.g., according to a control signal 405030. For example, control signal 405030 may be provided by M-Core 405700. In other aspects, impedance matching circuitry 405100 may be configured to be switched between any other number of impedance matching modes, for example, based on the number of R-Cores 404100 (FIG. 404).

In some demonstrative aspects, at the impedance matching mode A, for example, the M-core 405700 may be coupled to a single R-core, e.g., R-core 405800, of the plurality of R-cores, e.g., the plurality of R-cores 404110 (FIG. 404). For example, at the impedance matching mode A, the impedance matching circuitry 405100 may be configured to, for example, match an impedance, e.g., an impedance of 50 Ohm and/or any other desired impedance, between R-Core 405800 and M-core 405700, for example, when M-core 45700 is coupled only to R-core 405800.

In some demonstrative aspects, at the impedance matching mode B, for example, the M-core 405700 may be coupled to two R-cores, e.g., R-core 405800 and one other R-core of the plurality of R-cores, e.g., the plurality of R-cores 404110 (FIG. 404). For example, at the impedance matching mode B, the impedance matching circuitry 405100 may be configured to, for example, match an impedance, e.g., an impedance of 50 Ohm and/or any other desired impedance, between R-Core 405800 and M-core 405700, for example, when M-core 405700 is coupled to R-core 405800 and the one other R-core.

In some demonstrative aspects, at the impedance matching mode C, for example, the M-core 405700 may be coupled to four R-cores, e.g., R-core 405800 and three other R-cores of the plurality of R-cores, e.g., the plurality of R-cores 404110 (FIG. 404). For example, at the impedance matching mode C, the impedance matching circuitry 405100 may be configured to, for example, match an impedance, e.g., an impedance of 50 Ohm and/or any other desired impedance, between R-Core 405800 and M-core 405700, for example, when M-core 405700 is coupled to R-core 405800 and the two other R-cores.

In some demonstrative aspects, impedance matching circuitry 405100 may include a plurality of transistors, e.g., including transistors 405200, 405300 and/or 405400, which may selectively couple M-core 405700 to R-Core 405800 via a load, e.g., an RF load, of a plurality of loads, for example, according to the impedance matching mode, e.g., as described below.

In some demonstrative aspects, a first load level, e.g., a zero load, may be applied between M-core 405700 to R-Core 405800, for example, at the impedance matching mode A; a second load level, e.g., higher than the first load level, may be applied between M-core 45700 to R-Core 405800, for example, at the impedance matching mode B; and/or a third load level, e.g., higher than the second load level, may be applied between M-core 45700 to R-Core 405800, for example, at the impedance matching mode C, e.g., as described below.

In some demonstrative aspects, at the impedance matching mode A, for example, transistor 45400 may be controlled, e.g., by control signal 405060, to selectively couple M-Core 405700 to R-Core 405800, e.g., without any load.

In some demonstrative aspects, at the impedance matching mode B, for example, transistor 405300 may be controlled, e.g., by control signal 405040, to selectively couple M-Core 405700 to R-Core 405800, for example, via a load 405600.

In some demonstrative aspects, at the impedance matching mode C, for example, transistor 405200 may be controlled, e.g., by control signal 405030, to selectively couple M-Core 405700 to R-Core 405800, for example, via a load 405500.

In some demonstrative aspects, load 405500 may be, for example, higher than load 405600.

In some demonstrative aspects, load 405600 may include, for example, a load of 50 Ohm, and load 405500, may include, for example, a load of 100 Ohm. In other aspects, any other load values may be used.

In some demonstrative aspects, load 405500 and/or load 405600 may include, for example, a resistor-inductor-capacitor (RLC) network. In other aspects, load 405500 and/or load 405600 may include an active load, a resistance load, a capacitive load, an inductive load, or the like.

In some demonstrative aspects, the RLC network may be configured to maintain a predefined impedance, for example, a 50 Ohm impedance or any other impedance, between M-core 405700 and the R-Core 405800, for example, based on a count of the R-Cores to be connected to the M-core 405700.

Referring back to FIG. 4, in some demonstrative aspects, RF circuitry 425 may be configured according to a radio architecture, which may include at least one bi-directional mixer, which may be configured to upconvert an IF signal into an RF signal, at an upconversion mode of the bi-directional mixer, and to downconvert an RF signal in an IF signal, at a downconversion mode of the bi-directional mixer, e.g., as described below.

In some demonstrative aspects, a transceiver architecture, which may be implemented in mm-wave applications, such as, for example, 5G of cellular systems and/or WLAN with a communication frequency of about 60 GHz, for example, WiGig, may include a first mixer, which may be configured to upconvert a Tx IF signal into a RF signal, e.g., to be transmitted at a Tx mode of the transceiver; and/or a second mixer, which may be configured to downconvert a Rx RF signal into an Rx IF signal, e.g., at an Rx mode of the transceiver.

In some demonstrative aspects, it may not be advantageous in some use cases, implementations and/or scenarios to implement a transceiver architecture including separate mixers, e.g., two separate mixers, for the Tx mode and the Rx mode.

In some demonstrative aspects, a transceiver architecture may implement at least one bi-directional mixer, which may be configured for both the Rx mode and the Tx mode, e.g., as described below.

In some demonstrative aspects, implementing a bi-directional mixer in a transceiver architecture may provide one or more benefits and/or solve one or more technical problems. For example, the bi-directional mixer may enable to reduce transceiver chip area, for example, by implementing one or more bi-directional elements, for example, one or more bi-directional amplifiers, e.g., a bi-directional RF amplifier and/or a bi-directional IF amplifier, and/or any other additional or alternative bi-directional elements, in the transceiver chip.

In some demonstrative aspects, the bi-directional mixer may include a semi-passive mixer architecture, which may be well suited, for example, even for a low supply voltage and/or a low power consumption, for example, while providing sufficient conversion gain (C.G). For example, some bi-directional mixers may include an RF stage to process RF signals. Eliminating the RF stage of the bi-directional mixer may enable to reduce temperature dependence and current consumption, which may be required, for example, in order to achieve high linearity.

In some demonstrative aspects, the bi-directional mixer may be included as part of, and/or may perform one or more operations and/or functionalities of, upconversion and downconversion circuitry, e.g., as part of sub-system 415 (FIG. 4), and/or any other sub-system and/or element, if desired.

In some demonstrative aspects, the bi-directional mixer may be configured to operate at an upconversion mode and/or at a downconversion mode, e.g., as described below. For example, at the upconversion mode, the bi-directional mixer may upconvert an IF signal into an RF signal, and/or at the downconversion mode, the bi-directional mixer may downconvert an RF signal into an IF signal, e.g., as described below.

In some demonstrative aspect, the bi-directional mixer may include one or more switches to switch a direction of signals to be processed by the bi-directional mixer, for example, from processing signals in a first direction to processing signals in a second direction, e.g., when switching from the upconversion mode to the downconversion mode; and/or from processing signals in the second direction to processing signals in the first direction, e.g., when switching from the downconversion mode to the upconversion mode, e.g., as described below.

In some demonstrative aspects, the one or more switches of the bi-directional mixer may include, for example, one or more metal-oxide-semiconductor field effect transistors (MOSFET) having a Parameterize Cell (PCell), which may include a drain channel and a source channel, e.g., as described below.

In some demonstrative aspects, the drain channel and the source channel of the MOSFET may be symmetrical. For example, roles of the drain channel and the source channel may be switched, for example, such that the drain channel may be used as the source channel and/or the source channel may be used as the drain channel, e.g., as described below.

In some demonstrative aspects, the bi-directional mixer may include a Gilbert cell mixer, for example, a semi-passive Gilbert cell mixer e.g., as described below.

In some demonstrative aspects, the Gilbert cell mixer may be configured to, e.g., at the upconversion mode, upconvert an IF signal into an RF signal, for example, by mixing the IF signal with a LO signal, e.g., as described below.

In some demonstrative aspects, the Gilbert cell mixer may be configured to, e.g., at the downconversion mode, downconvert an RF signal into an IF signal, for example, by mixing the RF signal with an LO signal, e.g., as described below.

Reference is made to FIG. 406, which schematically illustrates a block diagram of a transceiver 406100, in accordance with some demonstrative aspects.

In some demonstrative aspects, transceiver 406100 may be configured as a half-duplex transceiver, e.g., as described below.

In some demonstrative aspects, the half-duplex transceiver, e.g., transceiver 406100, may be switched between, a Tx mode, for example, to transmit Tx signals, and, an Rx mode, for example, to receive Rx signals, e.g., as described below.

In some demonstrative aspects, transceiver 406100 may include, for example, a 60 GHz transceiver, which may be configured to transmit Tx signals and to receive Rx signals, for example, at least over a 60 GHz frequency band.

In some demonstrative aspects, transceiver 406100 may include a 5G cellular transceiver.

In other aspects, transceiver 406100 may include any other type of transceiver and/or may be configured to communicate Tx signals and/or Rx signals over any other additional or alternative frequency band.

In some demonstrative aspects, transceiver 406100 may include, or may be operably coupled to, one or more antennas 406150. For example, antennas 406150 may be configured to transmit and/or receive one or more RF signals.

In some demonstrative aspects, antennas 406150 may include one or more phased-array antennas, an in-chip antenna, and/or any other type of antennas.

In some demonstrative aspects, transceiver 406100 may include a baseband 406110, which may be configured to generate and/or process baseband signals, for example, a Tx baseband signal 406113 and/or an Rx baseband signal 406117, e.g., as described below. For example, Tx baseband signal 406113 and/or Rx baseband signal 406117 may include a differential baseband signal and/or any other type of baseband signals.

In some demonstrative aspects, baseband 406110 may include a digital baseband to process digital data and/or an analog baseband to, for example, convert the digital data into analog signals.

In some demonstrative aspects, transceiver 406100 may include a bi-directional mixer 406130, which may be configured to upconvert an IF signal, e.g., a Tx IF signal 406123 into a Tx RF signal, e.g., a Tx RF signal 406143, for example, at the Tx mode; and/or to downconvert an Rx RF signal, e.g., an Rx RF signal 406147, into an Rx IF signal, e.g., an Rx IF signal 406127, for example, at the Rx mode, e.g., as described below.

In some demonstrative aspects, bi-directional mixer 406130 may include a differential bi-directional mixer, which may be configured to upconvert a differential IF signal into a differential RF signal, and/or to downconvert a differential RF signal into a differential IF signal, e.g., as described below.

In some demonstrative aspects, bi-directional mixer 406130 may include an IF terminal 406133 to input Tx IF signal 406123, e.g., at an upconversion mode, and to output Rx IF signal 406127, e.g., at a downconversion mode, e.g., as described below.

In some demonstrative aspects, bi-directional mixer 406130 may include an RF terminal 406139 to output Tx RF signal 406143, e.g., at the upconversion mode, and to input Rx RF signal 406147, e.g., at the downconversion mode, e.g., as described below.

In some demonstrative aspects, transceiver 406100 may include, or may be operably coupled to, an LO 406135 to generate an LO signal 406137, e.g., as described below. For example, LO signal 406137 may have a frequency of 60 GHz, and/or any other required signal, which may be applied to bi-directional mixer 406130. For example, LO signal 406137 may be used, at the upconversion mode, to upconvert one or more IF signals, and/or, at the downconversion mode, to downconvert one or more RF signals, e.g., as described below. In one example, LO signal 406137 may include a differential signal.

In some demonstrative aspects, transceiver 406100 may include one or more amplifiers to amplify Tx baseband signal 406113, Tx RF signal 406143, Rx signal 406155, and/or Rx IF signal 406127, e.g., as described below.

In some demonstrative aspects, transceiver 406100 may include one or more bi-directional amplifiers to amplify Tx baseband signal 406113, Rx IF signal 406127, Tx RF signal 406143, and/or Rx signal 406155, e.g., as described below. In other aspects, at least one of the bi-directional amplifiers may be replaced by a plurality of single-direction amplifiers.

In some demonstrative aspects, transceiver 406100 may include a bi-directional IF amplifier 406120, which may be configured to amplify Rx signals from baseband 406110 at the Rx mode, and/or to amplify Tx signals from bi-directional mixer 406130 at the Tx mode. For example, bi-directional IF amplifier 406120 may be configured to amplify Rx IF signal 406127, e.g., at the Rx mode, and/or to amplify Tx baseband signal 406113, e.g., at the Tx mode, e.g., as described below.

In some demonstrative aspects, bi-directional IF amplifier 406120 may be configured to, e.g., at the Tx mode, amplify Tx baseband signal 406113 into Tx IF signal 406123, and/or to, e.g., at the Rx mode, amplify Rx IF signal 406127, for example, from IF terminal 406133 of bi-directional mixer 406130, into Rx baseband signal 406117.

In some demonstrative aspects, bi-directional IF amplifier 406120 may include a first IF amplifier (not shown in FIG. 406) to amplify signals at the Tx mode, and a second IF amplifier (not shown in FIG. 406) to amplify signals at the Rx mode, e.g., as described below.

In one example, bi-directional IF amplifier 406120 may include a Tx IF amplifier, which may be configured to, at the Tx mode, amplify Tx baseband signal 406113, from baseband 406110, into Tx IF signal 406123; and an Rx IF amplifier, which may be configured to, at the Rx mode, amplify Rx IF signal 406127 into Rx baseband signal 46117 to be provided to baseband 406110.

In some demonstrative aspects, bi-directional IF amplifier 406120 may include, for example, a differential bi-directional IF amplifier. For example, the differential bi-directional IF amplifier may amplify differential IF signals. For example, Rx IF signal 406127 and/or Tx baseband signal 406113 may include a differential IF signal.

In some demonstrative aspects, transceiver 46100 may include a bi-directional RF amplifier 406140, which may be configured to amplify Rx signals from antennas 406150, at the Rx mode, and/or to amplify Tx signals from bi-directional mixer 406130, at the Tx mode. For example, bi-directional RF amplifier 406140 may be configured to amplify an Rx signal 406155 from antennas 406150, e.g., at the Rx mode, and/or to amplify Tx RF signal 406143, e.g., at the Tx mode, e.g., as described below.

In some demonstrative aspects, bi-directional RF amplifier 406140 may be configured to, e.g., at the Tx mode, amplify Tx RF signal 406143 into Tx signal 406153, and/or to, e.g., at the Rx mode, amplify Rx RF signal 406155, for example, from one or more antennas 406150 into Rx RF signal 406147.

In some demonstrative aspects, bi-directional RF amplifier 406140 may include a first RF amplifier (not shown in FIG. 406) to amplify signals at the Tx mode, and a second RF amplifier (not shown in FIG. 406) to amplify signals at the Rx mode, e.g., as described below.

In one example, bi-directional RF amplifier 406140 may include the first RF amplifier (not shown in FIG. 406), e.g., a Power Amplifier (PA), which may be configured to, at the Tx mode, amplify Tx RF signal 406143, from bi-directional mixer 406130, into a Tx signal 406153; and the second RF amplifier (not shown in FIG. 406), e.g., a Low Noise Amplifier (LNA), which may be configured to, at the Rx mode, amplify Rx signal 406155 into the first RF signal, e.g., Rx RF signal 406147 to be provided to bi-directional mixer 406130.

In one example, bi-directional IF amplifier 406140 may include a differential bi-directional RF amplifier to amplify a differential RF signal, e.g., differential RF signal 406155, and/or a differential Tx RF signal, e.g., a differential Tx RF signal 406143, e.g., as described below.

In some demonstrative aspects, bi-directional mixer 406130 may include a first voltage terminal 406131, and a second voltage terminal 406132, which may be configured to apply one or more bias voltages to bi-directional mixer 406130, e.g., as described below.

In some demonstrative aspects, bi-directional mixer 406130 may include mixing circuitry (not shown in FIG. 406), which may be configured to operate at the upconversion mode, for example, when a first bias voltage is to be applied to the first voltage terminal 406131 and a second bias voltage is to be applied to the second voltage terminal 406132, e.g., as described below.

In some demonstrative aspects, the mixing circuitry of bi-directional mixer 406130 may be configured to operate at the downconversion mode, for example, when the second bias voltage is to be applied to the first voltage terminal 406131 and the first bias voltage is to be applied to the second voltage terminal 406132, e.g., as described below.

In some demonstrative aspects, the second bias voltage may be lower than the first bias voltage.

In some demonstrative aspects, the first bias voltage may be a positive voltage for example, a voltage in the range of 1-5 Volts or any other voltage, and/or the second bias voltage may be a zero voltage and/or a voltage close to zero.

In some demonstrative aspects, the mixing circuitry of bi-directional mixer 406130 may be configured, for example, to, e.g., at the downconversion mode, downconvert a first RF signal at the RF terminal 406139, e.g., Rx RF signal 406147, into a first IF signal at the IF terminal 406133, e.g., Rx IF signal 406127, e.g., as described below.

In some demonstrative aspects, the mixing circuitry of bi-directional mixer 406130 may be configured, for example, to, e.g., at the upconversion mode, upconvert a second IF signal at the IF terminal 406133, e.g., Tx IF signal 406123, into a second RF signal at the RF terminal 406139, e.g., Tx RF signal 406143, e.g., as described below.

In some demonstrative aspects, the mixing circuitry of bi-directional mixer 406130 may include, for example, a Gilbert-cell (not shown in FIG. 406), which may include, for example, a plurality of transistors, which may be configured to upconvert Tx IF signal 406123 into Tx RF signal 406143, for example, at the upconversion mode, and/or to downconvert Rx RF signal 406147 into Rx IF signal 406127, for example, at the downconversion mode, e.g., as described below.

In some demonstrative aspects, for example, the plurality of transistors of the Gilbert cell may include one or more field effect transistors (FETs).

In some demonstrative aspects, the mixing circuitry of bi-directional mixer 406130 may include, for example, a first transformer (not shown in FIG. 406), which may be configured to couple drains of the plurality of transistors to RF terminal 406139, and to voltage terminal 406131, e.g., as described below.

In some demonstrative aspects, the mixing circuitry of bi-directional mixer 406130 may include, for example, a second transformer (not shown in FIG. 406), which may be configured to couple sources of the plurality of transistors to IF terminal 406133, and to voltage terminal 406132, e.g., as described below.

In some demonstrative aspects, the mixing circuitry of bi-directional mixer 406130 may include, for example, an LO terminal (not shown in FIG. 406), which may be configured to couple LO signal 406137 from LO 406135 to gates of the plurality of transistors of the Gilbert cell, e.g., as described below.

In some demonstrative aspects, for example, at the upconversion mode, the second transformer may provide Tx IF signal 406123 and the second bias voltage to the sources of the plurality of transistors of the Gilbert cell. For example, the Gilbert cell may be configured to mix Tx IF signal 406123 with LO signal 406137, for example, to provide a mixed RF signal to the drains of the plurality of transistors of the Gilbert cell, e.g., as described below.

In some demonstrative aspects, for example, at the upconversion mode, the first transformer may combine the mixed RF signal at the drains of the plurality of transistors into Tx RF signal 406143, e.g., as described below.

In some demonstrative aspects, at the downconversion mode, the first transformer may be configured to provide Rx RF signal 406147 and the second bias voltage to the drains of the plurality of transistors. For example, the Gilbert cell may be configured to mix Rx RF signal 406147 with LO signal 406137 to provide, for example, a mixed IF signal to the sources of the plurality of transistors, e.g., as described below.

In some demonstrative aspects, for example, at the downconversion mode, the second transformer may combine the mixed IF signal at the sources of the plurality of transistors into Rx IF signal 406127, e.g., as described below.

In some demonstrative aspects, the mixing circuitry of bi-directional mixer 406130 may include, for example, a first switch (not shown in FIG. 406), which may be configured to, e.g., at the upconversion mode, couple the first bias voltage to voltage terminal 406131, e.g., to couple the first bias voltage to the drains of the plurality of transistors of the Gilbert cell; and to, e.g., at the downconversion mode, couple the second bias voltage to voltage terminal 406131, e.g., to couple the second bias voltage to the drains of the plurality of transistors of the Gilbert cell, e.g., as described below.

In some demonstrative aspects, the mixing circuitry of bi-directional mixer 406130 may include, for example, a second switch (not shown in FIG. 406), which may be configured to, e.g., at the upconversion mode, couple the second bias voltage to voltage terminal 406132, e.g., to couple the second bias voltage to the sources of the plurality of transistors of the Gilbert cell; and to, e.g., at the downconversion mode, couple the first bias voltage to voltage terminal 406132, e.g., to couple the first bias voltage to the sources of the plurality of transistors of the Gilbert cell, e.g., as described below.

In some demonstrative aspects, transceiver 406100 may include a controller, e.g., controller circuitry 406160, which may be configured to switch, for example, a direction of operation of bi-directional IF amplifier 406120, bi-directional mixer 406130 and/or bi-directional RF amplifier 406140, for example, based on the Tx mode and/or the Rx mode of transceiver 406100, e.g., as described below.

In some demonstrative aspects, controller circuitry 406160 may be operably coupled to a control line 406161, which may be configured to apply the first bias voltage to voltage terminal 406131, for example, at the upconversion mode, and, to apply the second bias voltage to voltage terminal 406131, for example, at the downconversion mode, e.g., as described below.

In some demonstrative aspects, controller circuitry 406160 may be operably coupled to a control line 406162, which may be configured to apply, for example, at upconversion mode, the second bias voltage to voltage terminal 406132, and, at the downconversion mode, for example, the first bias voltage to voltage terminal 406132, as described below.

In some demonstrative aspects, controller circuitry 406160 may be configured to switch the direction of bi-directional mixer 406130, for example, by switching between applying the first bias voltage to voltage terminal 406131 and applying the second bias voltage to voltage terminal 406131, e.g., through control line 406161; and switching between applying the second bias voltage to voltage terminal 406132 and applying the first bias voltage to voltage terminal 406132, e.g., through a control line 406162, e.g., as described below.

In some demonstrative aspects, controller circuitry 406160 may be configured to switch bi-directional mixer 406130 to the upconversion mode, for example, by applying the first bias voltage, for example, through voltage terminal 406131, to drains of the plurality of transistors of bi-directional mixer 406130, and by applying the second bias voltage for example, through voltage terminal 406132, to sources of the plurality of transistors of bi-directional mixer 406130, e.g., as described below.

In some demonstrative aspects, controller circuitry 406160 may be configured to switch bi-directional mixer 406130 to the downconversion mode, for example, by applying the first bias voltage, for example, through voltage terminal 406132, to the sources of the plurality of transistors of bi-directional mixer 406130, and by applying the second bias voltage, for example, through voltage terminal 406131, to the drains of the plurality of transistors of bi-directional mixer 406130, e.g., as described below.

In some demonstrative aspects, at the Tx mode, baseband 406100 may provide a baseband signal, e.g., baseband signal 406113, to the bi-directional IF amplifier, e.g., bi-directional IF amplifier 406120. For example, bi-directional IF amplifier 406120 may amplify baseband signal 406113 into Tx IF signal 406123.

In some demonstrative aspects, at the Tx mode, bi-directional mixer 406130 may receive Tx IF signal 406123 at IF terminal 406133, and may upconvert Tx IF signal 406123 into Tx RF signal 406143.

In some demonstrative aspects, at the Tx mode, bi-directional RF amplifier 406140 may receive Tx RF signal 406143 from RF terminal 406139 of bi-directional mixer 406130, and may amplify Tx RF signal 406143 into a Tx signal 406153, which may be transmitted, for example, by one or more antennas 406150.

In some demonstrative aspects, at the Rx mode, bi-directional RF amplifier 406140 may receive Rx signal 406155 from one or more antennas 406150, and may amplify, for example, Rx signal 406155 into Rx RF signal 406147.

In some demonstrative aspects, at the Rx mode, bi-directional mixer 406130 may downconvert Rx RF signal 406147 into IF signal 406127.

In some demonstrative aspects, at the RX mode, bi-directional IF amplifier 406120 may amplify Rx IF signal 406127 from IF terminal 406133 of bi-directional mixer 406130 into Rx baseband signal 406117.

Reference is now made to FIG. 407, which schematically illustrates a block diagram of a half-duplex transceiver 407100, in accordance with some demonstrative aspects.

In some demonstrative aspects, half-duplex transceiver 407100 may be configured to operate at the Tx mode and/or at the Rx mode, e.g., as described below.

In some demonstrative aspects, half-duplex transceiver 407100 may include, for example, a 60 GHz transceiver configured to transmit the Tx signals and to receive the Rx signals, for example, over a 60 GHz frequency band. In other aspects, other frequency bands may be used.

In some demonstrative aspects, half-duplex transceiver 407100 may include a 5G cellular transceiver. In other aspects, transceiver 407100 may include any other type of transceiver and/or may be configured to communicate the Tx and/or Rx signals over any other frequency band.

In some demonstrative aspects, half-duplex transceiver 407100 may include or may be operably coupled to one or more antennas 407150. For example, one or more antennas 407150 may be configured to transmit and/or receive one or more RF signals. For example, antennas 407150 may include one or more phased-array antennas, an in-chip antenna, and/or any other type of antennas.

In some demonstrative aspects, half-duplex transceiver 407100 may include a baseband 407110, which may be configured to generate and/or process baseband signals 407010 and 407015, e.g., as described below. For example, baseband 407110 may include a digital baseband to process digital data and/or an analog baseband to, for example, process analog signals. For example, baseband 407110 may include a differential baseband, which may be configured to process a differential baseband signal.

In some demonstrative aspects, half-duplex transceiver 407100 may include a Tx IF amplifier 407120, which may be configured to amplify, for example, a Tx baseband signal 407010 into a first Tx IF signal 407020 and/or a second Tx IF signal 407025.

In some demonstrative aspects, Tx IF amplifier 407120 may include, for example, a differential IF amplifier having a differential output and a differential input. In other aspects, any other differential and/or non-differential IF amplifier may be used.

In some demonstrative aspects, half-duplex transceiver 407100 may include an Rx IF amplifier 407125, which may be configured to amplify, for example, a first Rx IF signal 407030 and/or a second Rx IF signal 407035 into an Rx baseband signal 407015. For example, Rx IF amplifier 407125 may include, for example, a differential IF amplifier having a differential input and a differential output. In other aspects, any other differential and/or non-differential IF amplifier may be used.

In some demonstrative aspects, half-duplex transceiver 407100 may include a splitter 407127, which may be configured to distribute, for example, first Tx IF signal 407020 and/or second Tx IF signal 407025, from Tx IF amplifier 407120 to a bi-directional mixer 407130, and to distribute, for example, first Rx IF signal 407030 and/or second Rx IF signal 407035, from bi-directional mixer 407130 to Rx IF amplifier 407125. For example, the use of splitter 407127 may be optional, and in other aspects, splitter 407127 may not be included.

In some demonstrative aspects, bi-directional mixer 407130 may be configured to upconvert first Tx IF signal 407020 and/or second Tx IF signal 407025 into a first Tx RF signal 407040 and/or a second Tx RF signal 407045; and/or, for example, to downconvert a first Rx RF signal 407050 and/or a second Rx RF signal 407055 into first Rx IF signal 407030 and/or second Rx IF signal 407035, e.g., as described below.

In some demonstrative aspects, bi-directional mixer 407130 may include a differential bi-directional mixer.

In some demonstrative aspects, bi-directional mixer 407130 may include, for example, an IF terminal 407133 to input and/or output IF signals, e.g., to input first Tx IF signal 407020 and/or second Tx IF signal 407025, and/or to output first Rx IF signal 407030 and/or second Rx IF signal 407035.

In some demonstrative aspects, bi-directional mixer 407130 may include, for example, an RF terminal 407134 to input and/or output RF signals, e.g., to output first Tx RF signal 407040, and/or second Tx RF signal 407045, and/or to input first Rx RF signal 407050 and/or second Rx RF signal 407055.

In some demonstrative aspects, bi-directional mixer 407130 may include, for example, a first voltage terminal 407131 to receive a first bias voltage and/or a second bias voltage via a first control line 407060, and a second voltage terminal 407132 to receive the first bias voltage and/or the second bias voltage via a second control line 407065, e.g., as described below.

In some demonstrative aspects, half-duplex transceiver 407100 may include, or may be operably coupled to, an LO 407135 to generate a first LO signal 407070 and/or a second LO signal 407075, e.g., as described below. For example, first LO signal 407070 and/or second LO signal 407075 may have a frequency of 60 GHz, and/or any other frequency.

In some demonstrative aspects, first LO signal 407070 and/or second LO signal 407075 may be applied to bi-directional mixer 407130 to upconvert, for example, first Tx IF signal 407020 and second Tx IF signal 407025; and/or to downconvert, for example, first Rx RF signal 407050 and second Rx RF signal 407055, e.g., as described below. In one example, first LO signal 407070 and/or second LO signal 407075 may be implemented as a differential signal.

In some demonstrative aspects, transceiver 407100 may include a controller, e.g., control circuitry 407160, which may be configured to switch, for example, a direction of operation of bi-directional mixer 407130, e.g., as described below.

In some demonstrative aspects, control circuitry 407160 may be configured to apply, for example, via the first control line 407060, the first bias voltage to voltage terminal 407131, e.g., at the upconversion mode, and to apply the second bias voltage to voltage terminal 407131, e.g., at the downconversion mode, as described below.

In some demonstrative aspects, controller circuitry 407160 may be configured to apply, for example, via the second control line 407065, the second bias voltage to voltage terminal 407132, e.g., at upconversion mode, and to apply the first bias voltage to voltage terminal 407132, e.g., at the downconversion mode, as described below.

In some demonstrative aspects, controller circuitry 407160 may be configured to switch the direction of bi-directional mixer 406130, for example, by switching between applying the first bias voltage and applying the second bias voltage to voltage terminal 407131, e.g., through a first control line 407060, and/or by switching between applying the second bias voltage and applying the first bias voltage to voltage terminal 406132, e.g., through a second control line 407065, e.g., as described below.

In some demonstrative aspects, bi-directional mixer 407130, may include a plurality of transistors, for example, in a Gilbert cell arrangement, which may be configured to upconvert first Tx IF signal 407020 and second Tx IF signal 407025 into first Tx RF signal 407040 and second Tx RF signal 407045, for example, at the upconversion mode, and/or to downconvert first Rx RF signal 407055 and second Rx RF signal 407050 into first Rx IF signal 407030 and second Rx IF signal 407035, for example, at the downconversion mode, e.g., as described below.

In some demonstrative aspects, controller circuitry 407160 may be configured to switch bi-directional mixer 407130 to the upconversion mode, for example, by applying the first bias voltage, for example, through voltage terminal 407131, to drains of the plurality of transistors of bi-directional mixer 407130, and/or by applying the second bias voltage, for example, through voltage terminal 407132, to sources of the plurality of transistors of bi-directional mixer 407130, e.g., as described below.

In some demonstrative aspects, controller circuitry 407160 may be configured to switch bi-directional mixer 407130 to the downconversion mode, for example, by applying the first bias voltage, for example, through voltage terminal 407132, to the sources of the plurality of transistors of bi-directional mixer 407130, and/or by applying the second bias voltage, for example, through voltage terminal 407131, to the drains of the plurality of transistors of bi-directional mixer 407130, e.g., as described below.

In some demonstrative aspects, half-duplex transceiver 407100 may include a splitter 407137, which may be configured to distribute, for example, first Rx RF signal 407050 and/or second Rx RF signal 407055 from an Rx Tx amplifier 407145 to bi-directional mixer 407130, and to distribute, for example, first Tx RF signal 407040 and/or second Tx RF signal 407045, from bi-directional mixer 407130 to a Tx RF amplifier 407140. For example, the use of splitter 407130 may be optional, and in other aspects, splitter 407130 may not be included.

In some demonstrative aspects, Tx RF amplifier 407140 may be configured to amplify, for example, first Tx RF signal 407040 and/or second Tx RF signal 407045 into an RF signal 407060, and to provide RF signal 407060 to one or more of antennas 407150. For example, Tx RF amplifier 407140 may include a differential PA having a differential input and a differential output.

In some demonstrative aspects, Tx RF amplifier 407140 may include an outphasing amplifier, e.g., as described above with reference to FIG. 390, a Doherty power amplifier, e.g., as described above with reference to FIG. 387, a digital power amplifier, e.g., as described above with reference to FIG. 380, and/or any other amplifier.

In some aspects, Rx RF amplifier 407145 may be configured to amplify an RF signal 407070 from one or more of antennas 407150 into first Rx RF signal 407050 and/or second Rx RF signal 407055. In some demonstrative aspects, Rx RF amplifier 407145 may include a differential LNA having an input and a differential output. In other aspects, Rx RF amplifier 407145 may include a non-differential LNA, a wideband LNA and/or any other type of LNA.

Reference is now made to FIG. 408, which schematically illustrates a bi-directional mixer 408000, in accordance to some demonstrative aspects. For example, one or more elements and/or components of bi-directional mixer 408000 may be implemented as part of a bi-directional mixer 406130, e.g., as described above with reference to FIG. 406, and/or bi-directional mixer 407130, e.g., as described above with reference to FIG. 407.

In some demonstrative aspects, bi-directional mixer 408000 may include, for example, an RF terminal 408105, which may be configured to receive a first RF signal 408106, for example, from an Rx RF amplifier, e.g., Rx RF amplifier 407145 (FIG. 407), and/or to provide a second RF signal 408103, for example, to a Tx RF amplifier, e.g., Tx RF amplifier 407140 (FIG. 407), e.g., as described below.

In some demonstrative aspects, bi-directional mixer 408000 may include, for example, an IF terminal 408160, which may be configured to receive a first IF signal 408166, for example, from a Tx IF amplifier, e.g., Tx IF amplifier 407120 (FIG. 407), and/or to provide a second IF signal 408163, for example, to an Rx IF amplifier, e.g., Rx IF amplifier 407125 (FIG. 407), e.g., as described below.

In some demonstrative aspects, bi-directional mixer 408000 may include, for example, a first voltage terminal 408170, which may be configured to apply, for example, a first bias voltage 408175, e.g., VDD, and/or a second bias voltage 408185, e.g., VSS, for example, based on whether bi-directional mixer 408000 is to be operated at an upconversion mode or a downconversion mode, e.g., as described below.

In some demonstrative aspects, bi-directional mixer 408000 may include, for example, a second voltage terminal 408180, which may be configured to apply, for example, the first bias voltage 408175, e.g., VDD, and/or the second bias voltage 408185, e.g., VSS, for example, based on whether bi-directional mixer 408000 is to be operated at an upconversion mode or a downconversion mode, e.g., as described below.

In some demonstrative aspects, first bias voltage 408175 may be a positive voltage, for example, a voltage in the range of 1-5 Volts or any other voltage, and/or the second bias voltage 408185 may be a zero voltage and/or a voltage close to zero In some demonstrative aspects, bi-directional mixer 408000 may include, for example, mixing circuitry 408100, which may be configured, for example, to operate at the upconversion mode, for example, when first bias voltage 408175, e.g., VDD, is applied to first voltage terminal

408170, and second bias voltage 408185, e.g., VSS, is applied to second voltage terminal 408180, e.g., as described below.

In some demonstrative aspects, mixing circuitry 408100 may be configured to operate, for example, at the downconversion mode, when second bias voltage 408185, e.g., VSS, may be applied to first voltage terminal 408170 and first bias voltage 408175, e.g., VDD, may be applied to second voltage terminal 408180, e.g., as described below.

In some demonstrative aspects, mixing circuitry 408100 may be configured to, for example, at the downconversion mode, downconvert first RF signal 408106 at RF terminal 408106 into, for example, first IF signal 408163 at IF terminal 408160, e.g., as described below.

In some demonstrative aspects, mixing circuitry 408100 may be configured to, for example, at the upconversion mode, upconvert, for example, a second IF signal 408166, at IF terminal 408160 into, for example, a second RF signal 408103, at RF terminal 408105, e.g., as described below.

In some demonstrative aspects, mixing circuitry 408100 may include, for example, a Gilbert-cell 408120, including a plurality of transistors, for example, including transistors 408122, 408124, 408126 and/or 408128, e.g., as described below.

In some demonstrative aspects, the plurality of transistors of Gilbert cell 408120, e.g., transistors 408122, 408124, 408126 and/or 408128 may include one or more FETs.

In some demonstrative aspects, the plurality of transistors of Gilbert cell 408120, e.g., transistors 408122, 408124, 408126 and/or 408128, may be configured to upconvert, for example, second IF signal 408166 into second RF signal 408103, e.g., at the upconversion mode; and/or to downconvert, for example, first RF signal 408106 into first IF signal 408163, e.g., at the downconversion mode.

In some demonstrative aspects mixing circuitry 408100 may include, for example, a first transformer 408110, which may be configured, for example, to couple drains of the plurality of transistors of Gilbert cell 408120, e.g., drains of transistors 408122, 408124, 408126 and/or 408128, to RF terminal 408160 and to first voltage terminal 408170, e.g., as described below.

In some demonstrative aspects, mixing circuitry 408100 may include, for example, a second transformer 408130, which may be configured, for example, to couple sources of the plurality of transistors of Gilbert cell 408120, e.g., sources of transistors 408122, 408124, 408126 and/or 408128, to IF terminal 408160 and to second voltage terminal 408180, e.g., as described below.

In some demonstrative aspects, mixing circuitry 408100 may include, for example, an LO terminal 408132, which may be configured to couple, for example, an LO signal 408136 to gates of the plurality of transistors of Gilbert cell 408120, e.g., gates of transistors 408122, 408124, 408126 and/or 408128, e.g., as described below.

In some demonstrative aspects, LO terminal 408132 may be configured to apply to Gilbert cell 408120 a positive LO signal (LO+) component and/or a negative LO signal (LO−) component of LO signal 408136.

In some demonstrative aspects, first transformer 408110 may be configured to, e.g., at the downconversion mode, provide, for example, first RF signal 408106 and second bias voltage 408185, e.g., VSS, to the drains of the plurality of transistors of Gilbert cell 408120, e.g., the drains of transistors 408122, 408124, 408126 and/or 408128.

In some demonstrative aspects, for example, Gilbert cell 408120 may be configured to, e.g., at the downconversion mode, mix first RF signal 408106 with LO signal 408136, for example, to provide a mixed RF signal to the sources of the plurality of transistors of Gilbert cell 408120, e.g., the sources of transistors 408122, 408124, 408126 and/or 408128, e.g., as described below.

In some demonstrative aspects, second transformer 408130 may be configured to, e.g., at the downconversion mode, combine, for example, the mixed RF signal at the sources of the plurality of transistors of Gilbert cell 408120, e.g., transistors 408122, 408124, 408126 and/or 408128, into second IF signal 408163.

In some demonstrative aspects, second transformer 408130 may be configured to, e.g., at the upconversion mode, provide, for example, second IF signal 408166 and second bias voltage 408185, e.g., VDD, to the sources of the plurality of transistors of Gilbert cell 408120, e.g., transistors 408122, 408124, 408126 and/or 408128, e.g., as described below.

In some demonstrative aspects, for example, Gilbert cell 408120 may be configured to, e.g., at the upconversion mode, mix second IF signal 408166 with LO signal 408136, for example, to provide a mixed RF signal to the drains of the plurality of transistors of Gilbert cell 408120, e.g., transistors 408122, 408124, 408126 and/or 408128, e.g., as described below.

In some demonstrative aspects, first transformer 408110 may be configured to e.g., at the upconversion mode, combine, for example, the mixed IF signal at the drains of the plurality of transistors of Gilbert cell 408120, e.g., transistors 408122, 408124, 408126 and/or 408128, into first RF signal 408103.

In some demonstrative aspects, mixing circuitry 408100 may include, for example, a first switch 408140, which may be operably coupled to, for example, first voltage terminal 408170. For example, at the upconversion mode, first switch 408140 may couple first bias voltage 408175, e.g., VDD, to the drains of the plurality of transistors of Gilbert cell 408120, e.g., the drains of transistors 408122, 408124, 408126 and/or 408128. For example, at the downconversion mode, first switch 408140 may couple second bias voltage 408185, e.g., VSS, to the drains of the plurality of transistors of Gilbert cell 408120, e.g., transistors 408122, 408124, 408126 and/or 408128, e.g., as described below.

In some demonstrative aspects, a control signal 408190 may be configured to control first switch 408140 to selectively apply first bias voltage 408175 e.g., VDD, or second bias voltage 48185, e.g., VSS, to Gilbert cell 408120 via first transformer 408110.

In some demonstrative aspects, first switch 408140 may include a plurality of transistors, which may be configured to, for example, at the upconversion mode, couple first bias voltage 408175, e.g., VDD, for example, from first voltage terminal 408170, to the drains of the plurality of transistors of Gilbert cell 408120, e.g., the drains of transistors 408122, 408124, 408126 and/or 408128.

In some demonstrative aspects, first switch 408140 may include a plurality of transistors, which may be configured to, for example, at the downconversion mode, couple second bias voltage 408175, e.g., VSS, for example, from first voltage terminal 408170, to the drains of the plurality of transistors of Gilbert cell 408120, e.g., the drains of transistors 408122, 408124, 408126 and/or 408128.

In some demonstrative aspects, mixing circuitry 408100 may include, for example, a second switch 408150, which may be operably coupled to, for example, second voltage terminal 408180. For example, at the upconversion mode, second switch 408150 may couple second bias voltage 408185, e.g., VSS, to the sources of the plurality of transistors of Gilbert cell 408120, e.g., transistors 408122, 408124, 408126 and/or 408128.

In some demonstrative aspects, at the downconversion mode, second switch 408150 may couple first bias voltage 408175, e.g., VDD, to the sources of the plurality of transistors of Gilbert cell 408120, e.g., transistors 408122, 408124, 408126 and/or 408128.

In some demonstrative aspects, a control signal 408195 may be configured to control second switch 408150 to apply, for example, first bias voltage 408175, e.g., VDD, or second bias voltage 408185, e.g., VSS, to Gilbert cell 408120 via second transformer 408130.

In some demonstrative aspects, second switch 408150 may include a plurality of transistors, which may be configured to, for example, at the downconversion mode, couple first bias voltage 408175, e.g., VDD, for example, from second voltage terminal 408180, to the sources of the plurality of transistors of Gilbert cell 408120, e.g., the sources of transistors 408122, 408124, 408126 and/or 408128.

In some demonstrative aspects, second switch 408150 may include a plurality of transistors, which may be configured to, for example, at the upconversion mode, couple second bias voltage 408175, e.g., VSS, for example, from second voltage terminal 408180, to the sources of the plurality of transistors of Gilbert cell 408120, e.g., the sources of transistors 408122, 408124, 408126 and/or 408128.

In some demonstrative aspects, first switch 408140 and/or second switch 480150 may include, for example, a plurality of transistors, which may be configured to switch between the first and second bias voltages to be applied to, for example, the plurality of transistors of Gilbert cell 408120, e.g., as described below.

For example, as shown in FIG. 408, the plurality of transistors of switch 408150 may include a transistor 408156 and a transistor 408153. For example, transistor 408156 may be configured to apply first bias voltage 408175, e.g., VDD to, for example, the plurality of transistors of Gilbert cell 408120, e.g., as described below. For example, transistor 408153 may be configured to apply second bias voltage 408175, e.g., VSS, to, for example, the plurality of transistors of Gilbert cell 408120, e.g., as described below.

For example, transistor 408156 may be configured to, for example, apply first bias voltage 408175, e.g., VDD, to the plurality of transistors of Gilbert cell 408120, e.g., transistors 408122, 408124, 408126 and/or 408128, when a voltage level of control signal 408195 at a gate of transistor 408156 may be, for example, in a range of 1 to 5 Volts. For example, transistor 408153 may be configured to apply, for example, second bias voltage 408185, e.g., VSS, to, for example, the plurality of transistors of Gilbert cell 408120, e.g., transistors 408122, 408124, 408126 and/or 408128, when a voltage level of control signal 408195 at a gate of transistor 408153 may be, for example, in a range of 1 to 5 Volts.

In some demonstrative aspects, transistors 408153 and/or 408156 may include a FET. In other aspects, transistors 408153 and/or 408156 may include any other type of transistors.

A challenge for mmWave RFEMs is providing complete or near-complete directional coverage with high antenna gain. Usually this is achieved by phased array antennas that provide beam steering. However, the use of phased array antennas (such as an array of planar patch antennas) by themselves only provides limited angular coverage. Although beam steering can help to direct energy towards the intended receiver, a simple array limits the coverage of steering angles of beam steering. In addition, polarization of RF signals is also a challenge for mmWave RFEMs, at least for the reason that when transmitting to a mobile device, the position or orientation of the mobile device cannot be guaranteed, leading to less than optimum signal reception because the polarization of the transmitted signal may not be a suitable match for the position or orientation of the mobile device.

These challenges are addressed in aspects described herein. In some aspects of the present disclosure, patch antennas are used. A patch antenna includes a narrowband, wide-beam antenna fabricated by etching the antenna element pattern in a metal trace bonded to an insulating dielectric substrate, such as a printed circuit board (PCB). In some cases, the ground plane of the antenna can be formed using a continuous, or nearly continuous, metal layer bonded to the opposite side of the substrate, which may form a ground plane. In other cases, the ground plane of the antenna can be formed using a continuous, or nearly continuous, metal layer bonded to the same side as the antenna element pattern.

In some aspects of the present disclosure, one or more integrated circuit (IC) shield covering, which may be grounded, may be used as the antenna ground plane. Use of such a shield covering as a ground plane is not limited to patch antennas, but can apply as well to monopole antennas, dipole antennas, and combinations of all or some of the foregoing.

Continuing with the discussion of patch antennas, patch antennas may by implemented by use of a microstrip which can be a printed metal strip on a circuit board for RF transmission. Common microstrip antenna shapes are square, rectangular, circular and elliptical, but any continuous shape is possible. In some aspects of the present disclosure, a patch antenna does not use a dielectric substrate and instead is made of a metal patch mounted above a ground plane using dielectric spacers. The metal patch can be mounted as close as possible (commensurate with other system requirements) to the shield, which, in turn, functions as the ground plane. Structures may be implemented to provide a wider bandwidth than the narrowband alluded to above. Because such antennas have a very low profile, are mechanically rugged and can be shaped to conform to system needs, they can be incorporated into mobile radio communications devices.

In some aspects of the present disclosure, antennas can be subject to stringent space limitations. For example, when antennas are used as a part of a mobile device, such as UE, antennas can be subject to space limitations, such as limitations on the floorplan real estate of the electrical board and/or limitations on the thickness of the mobile device that can lead to height limitations.

To address the space limitations, in some aspects of the present disclosure, antennas can use IC shields as a ground plane to meet some requirements of antennas. For example, IC shields, which may be a system requirement in any event, can be used to provide a radiation pattern that directs radiation primarily outward from the mobile device with low or minimal radiation power lost by reflection back into the mobile device. This allows the antennas to provide desired radiation while at the same time working within the confines of the limited space due, in some cases, to the requirements for Globalnaya Navigatsionnaya Sputnikovaya Sistema (GLONASS).

In some aspects of the present disclosure, antennas can be integrated as one or more SMDs. In many cases, SMD antennas can have a small thickness, which is helpful for complying with the thickness requirement of mobile devices. The SMD itself, in the context of this patent, may comprise material suitable for printing or otherwise affixing an antenna or a feed line onto or within the SMD. The SMD may be a high frequency material similar to that of the main package hosting the radio frequency integrated circuit (RFIC). Depending on the specific solution, the material can be chosen to be the same as the main package or with different dielectric constant; for example, to optimize or improve the stacked patch solution of FIG. 46, the dielectric constant can be chosen to be lower than that of the main package. Typically, for good antenna performance, low dielectric constant and low loss tangent are desired. In some aspects of the present disclosure, an SMD antenna that has less height than the thickness of the mobile device can take advantage of on-board available height which is not being used. For example, an antenna may be implemented on and/or within an SMD within the mobile device where there would otherwise not be sufficient floor space for the antenna. In some aspects of the present disclosure, the SMD antenna can be soldered to the printed circuit board (PCB).

Further, in some aspects of the present disclosure, the placement of the feeding of the desired transmit or receive signal can be used advantageously for the foregoing and other purposes. For example, the feed can be used for impedance matching as described below with respect to FIGS. 52B and 52C.

In some aspects of the present disclosure, antenna types may offer single polarization. In some aspects of the present disclosure, antenna types may offer dual polarization. Generally, some polarization directions have been challenging to achieve. This problem may be solved, or at least ameliorated, by the antenna structures and combinations disclosed below.

In some aspects of the present disclosure, antennas may offer single, dual or multiple polarization capability. In some aspects of the present disclosure, multiple antennas of different types are used to provide angular coverage and polarization coverage. In some aspects of the present disclosure, multiple different antenna types operate alone or in conjunction with each other, such as in a combination of phased arrays of antennas.

In some aspects of the present disclosure, when multiple different antenna types that are implemented in a phased antenna array operating in conjunction with each other, they may be controlled by a controller and/or by codebook to enable the controlled arrays to provide vertical, horizontal, and/or diverse polarization as needed, depending on strength of the received polarized signal at the mobile device.

In some aspects of the present disclosure, the strength of received polarized signal at the mobile device is fed back to the antenna or antenna array controller to fire, or feed, the antenna arrays in a sequence that will provide the appropriate polarization at the receiver, which in some aspects of the present disclosure may be a UE, and thereby improve overall angular coverage. Thus, in some aspects of the present disclosure, multiple different antenna types may be operated together to provide polarization coverage in one or more directions. These advantages will be made clearer below in this written description.

Using a low-cost planar array might result in reduced coverage and degraded service because of scanning limitations. The coverage can be restored by adding additional antenna arrays at extra cost. The additional antenna arrays at millimeter wave frequencies can extend coverage at small extra cost and enable low cost systems for very high data rate communications.

In some aspects, the antenna (or antenna-related) circuitry described herein can be incorporated in the antenna array 330 of the mmWave communication circuitry 300 shown in FIG. 3A, although the antenna circuitry is not limited to such.

FIG. 409A illustrates at 40900 a transceiver, which may be within RFIC 40901 coupled to a phased-array 40903 comprising antennas 40905, according to some aspects of the present disclosure. The transceiver comprises RFIC 40901 which may operate, in some aspects of the present disclosure, in 60 GHz radios. The phased-array arrangement is used to overcome propagation loss at 60 GHz and allow multi-Gb/s communication over large distances. The RFIC 40901 may be coupled to phased array 40903 comprising antennas 40905 which may be patch or other type antennas located on substrate 40907. However, such phased-array transceivers can suffer from limited angle of coverage, which includes the angle over which the beam 40909 can be scanned without grating lobe performance degradation beyond required system specifications.

FIG. 409B illustrates an antenna array with an original angle of coverage, according to some aspects of the present disclosure. The original angle of coverage can include the angle 40911 between beams A and B. Generally, the angle of coverage of an antenna array is smaller than the ideal 180 degrees (half space.) This limited angle of coverage tends to degrade the service of the communications system that uses the antenna array.

In some aspects of the present disclosure, a microwave element disposed in a communication path from the antenna array can improve the angle of coverage. FIG. 409C illustrates a microwave element used in conjunction with a phased-array antenna, according to some aspects of the present disclosure. The microwave element (e.g., a lens 40913) is configured to deflect the beams and extend the angle of coverage of the antenna array from the angle 40911 (between beams A and B) to the angle 40915 (between the deflected beams A1 and B1). This results in better spatial coverage for the communications system with the same number of antenna arrays.

In FIG. 409C, a simple lens 40913 (e.g., a prism) is placed on top of the antenna array. Because the €r (permittivity) of the lens 40913 is higher than air, beam A is deflected closer to the lens and becomes beam A1, rather than continue straight (A2). Similarly, for beam B at the other end of the angle of coverage of the array. It is seen that the angle of coverage with the lens (angle 40915 between A1 and B1) is larger than the original angle of coverage (40911 angle between A2 and B2, which is also the angle between beams A and B of FIGS. 409B and 409C). This increased angle translates to increased coverage for the wireless system and smaller probability of outage.

In some aspects of the present disclosure, the microwave element can include any lens assembly or lens system that allows the focusing of the electromagnetic radiation in the desired direction. The lens can be inexpensive. In some aspects of the present disclosure, anomalies of the lens will be taken care of by the beamforming training present in most directional millimeter wave systems. Beamforming training in this instance can mean an algorithm and/or procedure that allows creation of an optimal beam pointed in the desired direction. As an example, a reference receiver can be used to calibrate the beam of the device under test (DUT) when the DUT is configured as a transmitter (TX). The DUT TX beam can be adjusted by adjusting the weights (phase and possible amplitude) of the TX signal at each DUT antenna element so that signal at the reference receiver is maximized or highly improved. This would compensate for TX non-idealities in the RFIC as well as in the antennas and lens. A planar phased-array has been assumed in the discussion since this would result in the lowest cost solution, although those of ordinary skill in the art will recognize that other types of phased arrays may be used.

In some aspects of the present disclosure, the microwave element can include a reflector. FIG. 409D illustrates a convex reflector 40923 used in conjunction with a phased-array to deflect the radiated beams and extend the angle of coverage, according to some aspects of the present disclosure. As in FIGS. 409B and 409C, the antenna phased array has an original reduced angle of coverage, comprising angle 40911 between beams A and B. The angle 40911 represents limited angle of coverage covered by scanning. Beams A and B reflect off convex reflector 40923 resulting in a wider angle of coverage (e.g., angle 40915 between beams A1 and B1) than the original angle of coverage (angle 40911 between beams A and B).

In some aspects of the present disclosure, the microwave element can include a combination of a lens 40913 and a reflector 40923. Relatively small beam steering that can result from a non-reflector array combination (e.g., an array with no reflector, corresponds to a larger angle of coverage after the reflection by reflector 40923. For example, the angle 40915 that results after reflection from reflector 40923 in the aspects of FIG. 409D is greater than the angle 40911 before reflection from the reflector. So if the phased array is limited to approximately plus or minus 45 degrees of steering, the reflector can increase this degree range to as much as plus or minus 90 degrees, in some aspects of the present disclosure.

In some aspects of the present disclosure, the convex reflector 40923 includes a spherical reflector. The convex reflector 40923 can be designed to comply with system requirements. In some cases, the convex reflector 40923 can use reflector curvatures of varying types and can be placed at varying distances from the phased array to satisfy system requirements.

In some aspects of the present disclosure, the convex reflector 40923 can be configured to provide non-linear beam expansion without undue experimentation, where the angle of coverage after reflection increases with increased beam steering. As one example, if an initial increased reflection coverage of 1.5 times compared to the non-reflected case is achieved, beam steering that approaches the limit of the phased array beam steering range may achieve increased reflection coverage of 2 times or more, thus exhibiting increased coverage due to an increase in the beam steering. This improved coverage is a benefit without sacrificing an inordinate amount of steering angle resolution at smaller steering angles. This non-linear beam coverage expansion can be plotted as a function of amount of beam steering, for different types of reflector curvatures, again at varying distances of the phased array from the reflector.

When using mmWave frequencies like 60 GHz or 28 GHz for communication, a relatively high antenna gain is used. While high antenna gain may be obtained by a single beam dish antenna, such an antenna is costly and requires substantial power to operate.

To address this issue, the RFEM can be configured to use a phased array of antennas (e.g., 16 elements), or a plurality of such phased arrays, substantially at the focus of a Cassegrain or other type of reflector antenna, such as, in one aspect, a printed reflector antenna. One effect is that on the focus, the transmitted signal is amplified using the reflector itself, resulting in a more focused beam with higher gain. Further, if more than one phased array of, in one aspect, patch antennas were placed at or near the focus of the reflector antenna, a sectorized plurality of scan regions result from the same antenna or reflector, as discussed in additional detail below. As to placement, when the implementation is for mmWave frequencies, the RFEMs may, in some aspects of the present disclosure, be mounted through an arm-like fixture similar to, but, much smaller than, those of larger antennas in current use where the objective is to irradiate the focus, to allow the location of multiple RFEMs in the center feed. An alternative placement in some aspects of the present disclosure would be by way of a small number (perhaps two) of small and shorter arms that surround the Cassegrain dish or the printed reflector. Tolerance should be considered in the placement of the PAFs.

In some aspects, tolerance is considered to be about 5% to 10% of the distance from the accurate center (or bottom in some aspects of the present disclosure) to obtain desired performance. Even if the location is not within the aforementioned tolerance, the system will still operate as described here but there may be linear degradation in performance. Whether a Cassegrain antenna or a printed reflector antenna is used can be a tradeoff. While a Cassegrain antenna can provide higher gain (and range) than a printed reflector antenna, a Cassegrain antenna is much bulkier, heavy and expensive than a printed reflector. So much depends on the system requirements. In some aspects of the present disclosure only medium range may be required and, for those aspects, printed reflectors may be the better choice.

Phased array communication systems such as 5G mmWave and WiGig Access points and base stations implemented in these technologies have as an objective to provide multi-sector and multi-user coverage. Aspects discussed herein allow low-cost, high Equivalent Isotropic Radiated Power (ERIP) for mmWave phased array antenna implementations for multi-sector and multi-user coverage. A sector includes the range of angles in azimuth in which the beam scanning of an mmWave array is effective (typically plus or minus sixty (60) degrees). Additionally, implementations disclosed aimed to provide multi-frequency capability in a single array (located per sector). This can be achieved by physically mounting three (or more) separate mmWave phased antenna arrays in the feed region of a reflector based antenna, such as those seen in FIGS. 410 through 415. These phased-arrays may be hereafter referred as "Phased-Array-Feeders" ("PAF"). Since each antenna-array may be located in a different position versus the optimum feed location of the antenna array, the beam-scanning pattern of each antenna array will be tilted differently as seen in the sectorization of FIG. 416 discussed below.

However, if the antenna array is placed at the center of either a Cassegrain or reflector array, a problem arises because, at mmWave frequencies, the mmWave antenna array itself, as well as the mechanism holding of that mmWave antenna array will detract from the emission of the reflector. This may occur because at the high frequency of mmWave as opposed to lower frequency arrays with frequencies at, for example, approximately 5 GHz essentially any obstacle, even non-metallic objects such as wood or plastic, actually blocks or otherwise interferes with the communication. So installing a relatively large mechanical holder for a small antenna array that fits right in the center of a dish, for example, may result in detraction of emission. One solution is to put the antenna array substantially on the focus. Another way to ameliorate this problem is to put the phased array on the side or the bottom of the reflector at an angle so that the beam will hit at the focus of the reflector and the irradiation or will emulate a beam placed at the focus of the reflector.

FIG. 410 illustrates an operation of a phased array/reflector combination when the antenna array is placed at the bottom of a Cassegrain array or reflector array, where FIG. 410 indicates that by using a small phased antenna array, the beam can be directed so that it hits essentially the focus of the reflector or Cassegrain antenna.

In some aspects of the present disclosure, the multi-sector antenna array with high antenna gain can be implemented using Massive-Antenna-Arrays. Massive-Antenna-Arrays include a coherent combination of one array that has antenna elements numbering much higher than the 8, 16, 32 or 64 element arrays sometimes used, or include multiple arrays, in both cases to create a high gain beam. The number of such elements, in some aspects of the present disclosure, could range into the hundreds. Then allocation of such multi-array per direction aspects (e.g. three multi-antenna arrays located physically 60 degrees from each other) can be implemented, much like the arrangements of three PAFs illustrated in FIGS. 410-415.

Additional advantages of a plurality of phased array feeders placed at or near the focus of a reflector include, for example:

a. Adding sectors in an easy form factor without enlarging the dimension of the antenna of each sector, merely be adding additional PAFs;

b. Adding users with no degradation of throughput or effective isotropically radiated power (EIRP) (example: in different sectors two different Phased Array Feeders (PAF) would be active. In other schemes such as Massive Antenna Array, each user would get half of the array elements);

c. Higher EIRP by changing the reflector; and d. Adding Phased Array Feeders (PAF) to create more sectors does not cause heating problems, since each PAF is "standalone"

In case an antenna array is located in the feed of reflector based antenna, then some of its beam scanning capability is still preserved. In some aspects of the present disclosure, if an antenna array is used in the open air (without being mounted at the feed of the reflector array), then its typical scan range of plus or minus 3 dB is about plus or minus 60 degrees. Once such an array is mounted in a feed of the reflector based antenna, the scanning range is reduced to plus or minus 30 degrees (approximately). The scan range versus the zero-degree reference point changes depending on the physical location of the arrays in the reflector antenna.

As the array is mounted closer to the ideal focus of the reflector, its scan range becomes more symmetrical and can range from −30 to +30 degrees (around the zero azimuth). Once the antenna array is located far from the ideal focus, its scan range will be centered at different angles (proportional to the distance of the antenna array from the focus). Each Phased Array-Feeder can operate in one frequency or in multiple frequency (e.g. 60 GHz and 28 GHz, inasmuch as they are a multiple of 2).

The multi-feeds can be mounted in a printed reflector antenna-array as illustrated in FIGS. 410, 412, and 414 or a Cassegrain antenna with parabolic shape as illustrated in FIGS. 411, 413, and 415, according to some aspects of the present disclosure.

FIG. 410 illustrates a plurality of phased arrays used in conjunction with a printed reflector in a first configuration, according to some aspects of the present disclosure. In FIG. 410, reference 41000 illustrates a printed reflector 41010 wherein three phased arrays 41020, 41030, 41040 are located at the bottom of the antenna 41010. Since aspects described herein may be used in point-to point communication, such as communication between two nodes or end points, the phased arrays may be used in transmit mode or in receive mode, the timing controlled in accordance with system operation. The phased arrays 41020, 41030, and 41040 may be transmitting toward the reflector 41000 in transmission mode. In side view is illustrated incoming beams 41050, 41060, 41070 when receive mode is active. Reflector 41010 is seen in Front View (looking into the reflector), Side View (looking from the side of the reflector), and Top View (looking downwardly from the top of the reflector). These views are the traditionally named Front View, Side View, and Top View, in the engineering drawing sense for ease of description. However, if the combination were within a mobile device the views may be differently named, for example with what is called Front View in FIG. 410 corresponding to looking downwardly into the mobile device, and what is called Top View in FIG. 410 being looking at what may be termed the bottom area of the reflector. The views illustrated in FIG. 410 are typical for FIGS. 411 through 415.

FIG. 411 illustrates a plurality of phased arrays used in conjunction with a Cassegrain antenna in the first configuration 41100, namely at the bottom of the Cassegrain antenna, according to some aspects of the present disclosure.

FIG. 412 illustrates a plurality of phased arrays used in conjunction with a printed reflector in a second configuration 41200, namely in the center region, according to some aspects of the present disclosure. The TOP view illustrates a view looking down from the top of the reflector. Array, Sector 1, and Array, Sector 3, are drawn essentially to size, whereas Array Sector 2 is drawn smaller for distinguishing Array, Sector 2 from the other two arrays in that view. FIGS. 413, 414, and 415 are typical (or similarly drawn) with respect to Array, Sector 1, Array, Sector 2, and Array, Sector 3, in the TOP view FIG. 413 illustrates a plurality of phased arrays used in conjunction with a Cassegrain antenna in the second configuration 41300, namely in the center region, according to some aspects of the present disclosure.

FIG. 414 illustrates a plurality of phased arrays used in conjunction with a printed reflector in a third configuration, 41400, namely around the reflector, according to some aspects of the present disclosure.

FIG. 415 illustrates a plurality of phased arrays used in conjunction with a Cassegrain antenna in the third configuration 41500, namely around the reflector, according to some aspects of the present disclosure.

The three arrays, Array, Sector 1, Array, Sector 2, and Array, Sector 3 in some aspects of the present disclosure will include or be part of an RFEM. The RFEMs are not, in practice, located at the bottom of the reflector as illustrated in FIGS. 410-415. Instead they are held in or near the middle of the reflector of with a mechanical arm which is not shown in the drawing.

The different physical position of each phased array feeder will create a sectored scan-pattern which is shifted by a certain angle from each antenna array, creating a high gain sectorized-like deployment. Ideally, such a bias between the center of each scan-pattern of the array should be in the order of 60 to 90 degrees as illustrated in FIG. 416. FIG. 416 illustrates a top view of sectorization 41600 resulting from a plurality of phased arrays used in conjunction with a reflecting antenna, according to some aspects of the present disclosure. At mmWave frequencies, a beam from an antenna array is very narrow, conceptually like a laser beam, and can be scanned across the sector. The narrow beam is indicated at 41601 and beam scanning across sectors is indicated by the double-ended arrow.

FIG. 417 illustrates scanning in each sector of the sectorized scan regions, according to some aspects of the present disclosure. The X axis is the angle of scan of the beam from an antenna array focused at the reflector antenna. The Y axis is the amplitude of the beam. Discussion here is with respect of Sector 1, but operation for Sector 2 and Sector 3 (and additional sectors, depending on the number of phased array feeders) is similar. For Sector 1 there is a variation of the amplitude of the scanned beam. Numbers given in this discussion are as examples only and do not represent actual tested numerical values.

Beam amplitude 41701 occurs when the beam is being tuned, for example, to minus 50 degrees compared to boresight. Beam amplitude 41703 occurs when the beam is tuned closer to boresight, for example minus 20 degrees compared to boresight. Beam amplitude 41705 occurs when the beam is being tuned, for example, to minus 10 degrees compared to boresight. Beam amplitude 41707 occurs when the beam is tuned to boresight of Sector 1. The reason for amplitude variation each beam tuning angle is that as the beam is scanned there tends to be amplitude degradation because of various physical characteristics of the patches that comprise the phased array feeder.

The PAF design discussed here also offers a link advantage. Consider the example in which only one sector is used (e.g., in an aspect that has only one phased array feeder, with many antenna elements in the array). If the PAF is scanned the entire plus or minus 90 degrees range, or scanned an abbreviated range of plus minus 80 degrees, a certain amount of attenuation of the array beam occurs at large angles, sometimes referred to as "at the sides," (or "very large angles from boresight"). Even a high gain antenna at boresight can provide very poor gain (or exhibit high degradation) at the sides. However, with a PAF described here, the degradation at the sides might be of the order of minus 3 dB, which for many purposes is an acceptable degradation. Consequently, there is also a link budget advantage with the described PAF approach compared to phased arrays that are not used as feeders to a reflector antenna.

In other words, it is sometimes beneficial to place the phased array in the center at the bottom. Then, by beam feeding, the beam will hit the focus because at 60 GHz the propagation is very similar to a laser beam and is so well focused that using beam feeding will shift the angle of the beam so that the above-described phenomenon occurs. Further, multiple arrays can be used as in FIGS. 410-415, described below, to create different scanning sectors.

In summary, phased antenna arrays can be placed at the focus of a dish or reflector antenna, which will create high gain. Not only can the phased array be placed at the focus, but it can also be placed at the bottom of the reflector to interfere less with the signal created by the dish or by the reflector. Furthermore, multiple phased arrays can be placed at the center of the dish and when the beam is aimed at the focus sectorized emissions are created for each phased array at a certain area in front of the reflector and that in turn will create a sectorized emission to a target. The same phenomenon occurs when the phased array is placed at the bottom of, or around, the reflector as discussed above.

In some aspects of the present disclosure, the PAF design can support multi-users. If the system is to be designed to support a plurality of users, instead of lowering the transmission to each user (resulting in lower overall quality of the signal), additional feeders can be added to the same reflector to increase the capacity of the system and the number of users the system can support without facing problems like inordinate heat dissipation at one location. While three PAFs have been illustrated in FIGS. 410-416, additional PAFs can be added as additional users are added for receiving the signal from the transmitter that is transmitting via the PAFs. For example, where three PAFs are used in an equilateral triangular arrangement about a point such as a focus, as in FIG. 415, four PAFs may be used in a square arrangement about the point. Five PAFs may be arranged similarly, (in a pentagram-like arrangement about the point).

One application of this type of reflector/phased array would be that such a system would be implemented in an access point. One access point can support many users by dividing the coverage to different sectors or within each sector, to have a separate feeder to increase the capacity of each sector.

As to polarization, in point-to-point systems, it is quite common for a reflector/phased array to have a vertical polarization feeder (V feeder) and a horizontal polarization feeder (H feeder). In some aspects of the present disclosure, the above reflector with a V feeder and an H feeder can cover both vertical polarization and horizontal polarization. The system can transmit with vertical polarization or horizontal polarization or, with both vertical polarization and horizontal polarization that is orthogonal to the vertical polarization. As discussed in further detail below, there are generally two feeds for each patch inside a phased array, so one of them can be for vertical polarization and one for horizontal polarization. When connecting to a user via a base station or an access point, then either of the two feeds (vertical polarization or horizontal polarization) can be called by a control program and used for scanning or "sector sweeping." For example, if there are 63 sectors only with the vertical polarization, there can be 128 sectors with horizontal polarization. A sector is actually a combination of the phased array(s), phase shifter and polarization, which can mitigate polarization issues.

For some aspects of the present disclosure in a WiGig implementation, the polarization techniques include just scanning. A test transmission packet in one set of phase shifter and one set of, for example, vertical polarization is transmitted to the receiver, and the receiver measures received signal strength. Another set with horizontal polarization is sent to the receiver and the receiver measures the received signal strength. Subsequently, the receiver transmits the polarization with the better signal strength and the transmitter then transmits in that polarization.

In some aspects of the present disclosure, this process is continuous in order to transmit the better polarization continuously. This can be accomplished using a control message that has a very low fire rate, so that it has a very high processing rate and does not need the gain of the antenna. Instead of using another combination of phase shifter, a feed of another polarization is used. The system itself is not limited because there is good isolation between vertical polarization and horizontal polarization at the feeder. The patch antenna elements of a phased array have good isolation and the reflector does not degrade it significantly. Essentially, each patch antenna is double-feeding one vertical polarization signal and one horizontal polarization signal, each with the same information, and the appropriate polarization is used at the appropriate time.

In other aspects, this process can be performed when certain criteria are met.

The aspects disclosed herein are relatively inexpensive because, although several small arrays are used, only a single reflector is used, in some aspects of the present disclosure. Further, a relatively large area is not used, as it would be if the usual solution of three reflectors were used. The described solution is also power efficient because only a single reflector is used. The described solution provides a highly compact solution at low cost as well as low-volume.

A brief discussion of the receiver is in order. In point to point communication, in FIG. 416, transmission may be in three different sectors. Each sector will be generally seen by a corresponding sector at a receiver, either another reflector or another multiple sector, multiple phased array system. The transmitting sectors are separate. In one aspect, Sector 1 transmits to a matching Sector 1 at a first receiver, Sector 2 transmits to a matching Sector 2 at a second receiver, and Sector 3 transits to a matching Sector 3 at a third receiver. As mentioned above, the beams are quite narrow and the sectors are really well isolated. In other words, the beam is really very narrow, perhaps 3 degrees, but it is scanned, where each triangle of FIG. 416 represents a scan.

Each sector scan is typically plus or minus 30 degrees.

There may be transmission from Cassegrain reflector to Cassegrain reflector, from printed reflector to Cassegrain reflector, from printed reflector to printed reflector or even Cassegrain reflector or printed reflector to multi-antenna array. At the receiver, instead of using a Cassegrain or printed reflector, 4 or 8 smaller arrays can be combined together to create high gain in a multi-antenna array. Any option that has radiated emission holds. Instead of point to point communication (for example base station to base station), the receiver can be a smart phone.

The foregoing component/device can be placed in a base station or in a mobile device, such as a smart phone. When placed in a base station, the component/device can be configured with a high gain. When the component/device is placed in a mobile device, the component/device can be configured with a lower gain than that of the base station. The system can be very easily upscaled. To accommodate more sectors or more users, the system can use the same reflector with added feeders, resulting in lower heat dissipation than for solutions without a reflector. Further, each feeder can operate at a different frequency from other feeders.

Further, the type of transmission depends on whether or not there is line-of-sight between the transmitter and the receiver. If there is line-of-sight, then transmission is by scanning to the location of the receiver. If there is no line-of-sight to the receiver, then transmission is based on reflection.

The disclosed techniques can also be advantageous when the component/device is deployed outdoors. For example, the disclosed component/device can be deployed on a street, e.g., as a base station installed on traffic lights that are subject to vibrations or other environmental factors. In such applications, the system can provide very good tracking to ameliorate the vibration effect of the base station itself, and the base station can then more effectively track a walking user that holds a smart phone. The tracking can include shifting between sectors, particularly when many sectors are supported by the reflector. The effect of the vibration can be ameliorated simply due to the fact that the reflective component/device employs a phased array and the phased array can tune the beam. Therefore, if the vibration is significantly large, or if the smart phone is detected to be in between two sectors, as an example, switching between sectors can aid in alleviating the effects of vibration. Further, even without ameliorating vibration, the scanned beam can follow a walking person who is holding a smart phone and, if signal strength shows a need to switch to different sectors, the system can switch to a different sector.

FIG. 418 illustrates a package within which antennas may be embodied within a user device, according to some aspects of the present disclosure. Individual packages 41800 and 41802 are illustrated. Items 41801, 41801A include a heat conducting mechanism from the die package onto an external surface.

In some aspects of the present disclosure, items 41803, 41803A include a flip-chip chip-scale package (FC-CSP) that has an exposed die with a conformal shielding around it. In other aspects, items 41803, 41803A include a die with a mold and a copper heat spreader.

Items 41805, 41805A include a laminate substrate that takes signals from the die onto another board. The laminate substrate can include, for example, a plastic pin grid array (PPGA), a plastic ball grid array (PBGA), and/or any other substrate that is capable of providing communication between the board and the die. In some aspects of the present disclosure, there may be no overmold at all with the die exposed. Item 41807 can include a patch antenna that is fed or excited. Items 41809, 41809A are SMD elements that include antennas printed on any side, such as antennas 41811, 41811A and 41813, 41813A. In some aspects of the present disclosure, there is no electrical connection to the chassis. The signals can be carried from the die to the substrate 41805, 41805A to the board. The board 41806, 41806A has various forms of antennas printed or SMD-mounted as discussed in more detail below. Alternatively, various forms of antennas may be configured within the SMD. The printed antennas and SMD antennas couple to directors like 41815, 41815A in the chassis. Item 41817 can be a ground plane in some aspects of the present disclosure. In some aspects of the present disclosure, either or both of the substrate and the PCB can include heat slugs or heat carrying elements.

FIG. 419 illustrates a graph of realized gain of a 1×4 dipole array embodied in either package 41800 or 41802 of FIG. 418, according to some aspects of the present disclosure. The realized gain graph 41901 shows the realized gain of antennas at thirty (30) degrees angle with the directors in the chassis fixed in location, but the dipole in the PCB at various heights away from the director, with the heights given in microns on the X-axis of the graph, where "hdpole [um]" indicates the placement height of the dipole in microns. The realized gain graph 1903 shows the realized gain of antennas at sixty (60) degrees angle with the directors in the chassis fixed in location, but the dipole in the PCB at various heights away from, the chassis. The realized gain graph 41905 shows the realized gain of antennas at ninety (90) degrees angle with the directors in the chassis fixed in location, but the dipole in the PCB at various heights away. The graph shows that the ideal location is to place the dipole reasonably far away from the director in the chassis, where the realized gains of 41901, 41903, 41905 are generally higher at the left side of the graph (i.e., greater heights along the X-axis) and most of the realized gain graphs (i.e., 41901, 41903) decreasing as the position moves to the right of the graph (i.e., lesser heights along the X-axis).

FIG. 420 illustrates radiation patterns associated with the graph of FIG. 419, according to some aspects of the present disclosure. In FIG. 420, a dipole is implemented in PCB 42003 or, alternately, implemented as an SMD component.

Director 42001 is in or on the chassis, and can be implemented at different heights and depths in the chassis.

The grounds and feeding structures in the PCB 42003 are illustrated at 42005. The antenna pattern chart 42007 illustrates at 42009 the antenna pattern as a function of the angle of radiation (along the circumference of the antenna pattern chart 42007) and as a function of the location of the director. If the director is implemented as shown at 42001, then the radiation pattern rotates and one can radiate more in the upwards direction with respect to the orientation of the PCB 42003.

The endfire gain of some WiGig products with vertical polarization is very low compared to broadside direction, due to their very small form factor. The endfire gain with vertical polarization has a major importance in coverage for laptop user, for tablet user and for smartphone user scenarios. In some cases, slot elements that have small gain to the endfire direction and larger form factor were used. Monopolar patches which have a good form factor but weak gain to the endfire direction (9 dB lower than broadside) have also been used.

The aspect disclosed herein can improve endfire radiation while maintaining a good form factor. The aspect takes advantage of an IC shield structure that is used in the product for shielding integrated and discrete circuitry. The shield is incorporated into a combination of a monopolar stacked patch radiating element and parasitic element, as part of an antenna array. By doing so, the gain of the antenna has been shown to be improved to the endfire direction by 2 dB to 3 dB. The size of elements is also reduced up to 40% while keeping the same bandwidth. While a single parasitic element is described, those of ordinary skill in the art will recognize that in some aspects of the present disclosure it may be appropriate to use a plurality of parasitic elements.

The benefit of this combination derives at least in part from the fact that vertical polarization is widely used in modern communications. This is because propagation with vertical polarization suffers smaller attenuation loss than horizontal polarization when propagating along the ground plane of the earth. The receiver and transmitter of a product using the disclosed combination may be aligned to vertical polarization when transmitting to the endfire direction. Such a monopole antenna is a good solution because it has a simple structure while providing the desired vertical polarization. Some monopole antennas use a high profile of quarter wavelengths which is unacceptable in the form factor system limitations often found in wireless communication products. Endfire gain of conventional monopolar patch antennas is small when compared to the 2 dB to 3 dB endfire gain imparted by the described monopolar patch antenna combined with an IC shield structure.

FIG. 421 illustrates the use of an IC shield as an antenna ground plane and a reflector for a stacked patch antenna, according to some aspects of the present disclosure. In the illustrated aspect, a PCB board 42108 is illustrated as transparent to show the internal structure of the board, which comprises a plurality of parallel layers, some or all of which can be metallized layers.

A monopole antenna 42100 including metallized stacked patch antenna elements 42104, 42106 is combined with an IC shield structure 42102, thereby using the IC shield structure as a reflector and as a ground plane. The combination takes advantage of the IC shield, which is in user devices independent of antenna needs. For example, RFEMs such as those illustrated in FIGS. 5A and 5B include a grounded shield, such as 42102 of FIG. 421, covering the IC and discrete components of the RFEM for shielding purposes. The presence of this shield affects radiation patterns and impedance of antennas. Rather than avoid this region of the RFEM and thereby waste space that could otherwise be used for antennas, the shield may be used as a reflector and ground plane as alluded to above to make antennas that are smaller and correctly matched, and to direct radiation patterns in favorable directions.

Specifically, a quarter-wave monopole antenna can be printed onto the board in close proximity to the shield. While a quarter-wave monopole is described, those of ordinary skill in the art will recognize that other wavelength monopoles may be used as may be appropriate for a given aspect. The feed point into the monopole can be used to tune impedance similarly to the method discussed below with respect to FIGS. 452B and 452C. Parasitically stacked dual patches 42104, 42106 are used, in some aspects of the present disclosure, to achieve broad bandwidth to meet the bandwidth requirements, such as the WiGig four channels bandwidth requirements. In one aspect, the bottom patch 42106 is the driven element and is excited via a feed line much like that shown in FIGS. 424B and 424C, discussed below. In some aspects of the present disclosure the patch 42104 is a parasitic element. Dimensions are determined by simulation. In the aspect under discussion, the space, in the Z direction in FIG. 422, between driven element 42106 and the parasitic element 42104 is 186 um. In this aspect, the dimension between the patch antenna and the shield 42102 is 165 um as illustrated in FIG. 422A. Simulation has shown that the dimension between the patch antenna and the shield 42102 affects the matching and gain characteristics of the patch antenna. FIG. 422B illustrates that in the aspect under discussion the length of the PCB used by the patch antenna is 1.25 mm. FIG. 422C illustrates that in the aspect under discussion, the patch element 42104 is slightly smaller than the patch element 42106 by 60 um. In another aspect, the antenna elements 42104, 42016 are the same size and the dimension between the patch antenna and the shield is 40 um. The shield 42102, acting as a ground layer and also as a reflector for the excited patch 42106 in FIGS. 421 and 422, imparts approximately 2 dB gain to the patch antenna in the endfire direction. Consequently, the patch antenna when operating in endfire direction acts like a monopole antenna.

Given the closeness of real estate space in a mobile device, it may be difficult to position the patch antenna close to the shield, but the objective is to place the patch antenna as close to the shield as possible in order to increase the gain in the endfire direction, the distance between the shield and the patch antenna being determinable by simulation.

In some aspects of the present disclosure, in endfire operation, polarization can be vertical. In some aspects of the present disclosure, in broadside operation, polarization can be horizontal. Since the vertical polarization in endfire operation is approximately 7 dB to 8 dB below the horizontal polarization in broadside operation of the antenna, the approximately 2 dB to 3 dB gain imparted by the described combination can be an important aspect of improving endfire gain. The proximity of the shield to the patch affects the matching of the antenna and to tune the patch to 50 ohms over bandwidth and narrows the width of the patch which contributes to reducing the antenna size.

FIG. 422 illustrates a side view of the monopole antenna illustrated in FIG. 421 showing an asymmetrical via feeding mechanism, according to some aspects of the present disclosure. Components of FIG. 422 which are the same as those in FIG. 421 will be given the same reference numerals as in FIG. 421 for clarity.

The IC circuitry 42202 is indicated as being incorporated below the shield 42102, which is similar to or the same as the shields illustrated in FIGS. 424A-424E, and in other figures that illustrate an IC shield, discussed in detail below. The drawing of FIG. 422 is not to scale and the shield 42102 is drawn in partial view. But the shield in the aspects described cover the IC and shield it from RF interference and electromagnetic interference. A more complete illustration of an RF shield is illustrated in FIGS. 454A and 461A. The driven element 42106 is fed by via feeding including via 42201 and feed strip 42203. Vias 42207 in the PCB 42108 are very close to the radiating element 42106. The distance between the vias and the patch can be optimized or improved to maximize the endfire gain as discussed in additional detail below.

FIG. 423 illustrates shield patch elements in an antenna array configuration with a mobile platform, which may be rectilinear, according to some aspects of the present disclosure. FIG. 423 more clearly indicates the relationship of the shield and the monopole patch antenna in an array of such monopole patch antennas along the sides of the shield, as indicated generally a 42300. Only the parasitic patch elements 42104 of the array are shown.

Dipole Antenna with a Surface Mounted Device that Transitions to a Dipole Antenna with a Monopole Antenna FIG. 424A illustrates a dipole antenna with an SMD antenna that transitions the dipole to a dipole with a monopole, according to some aspects of the present disclosure. In general, and as alluded to in connection with FIG. 421, creating an endfire antenna radiation pattern with both vertical and horizontal polarization has proven difficult. Dipole antennas produce the required endfire radiation pattern, but cannot produce both polarizations. Vertical polarization is preferred for wall reflection characteristics and to match the installed base of docking stations, but the physical orientation of a handheld device cannot be guaranteed. Therefore, it is desirable to provide both polarizations.

In some aspects of the present disclosure, to provide both polarizations, the antenna is printed onto an SMD. A surface mounted device is sometimes referred to as surface mounted technology (SMT). The SMD can have standard component dimensions for ease of assembly. The antenna combined here includes a modified dipole 42400 that has both horizontal and vertical polarization radiation.

In some aspects of the present disclosure, as will be seen in the next several paragraphs, the antenna begins with a full dipole with both horizontal arms printed on a circuit board. Consequently, the antenna, a dipole at this point, has mostly horizontal polarization. In some aspects of the present disclosure, a vertical arm is added by an SMD, which adds vertical polarization, without reducing the horizontal polarization significantly.

Referring to FIG. 424A, a dipole with an SMD configured to transform to a dipole with a monopole is shown generally at 42400. This may be embodied within a mobile device or other device where space is at a premium, for example, by having to meet space requirements for GLONASS. This limited space makes it difficult to design a properly functioning antenna. A PCB board, or other circuit board is seen at 42403 drawn as transparent in order to illustrate components internal to the circuit board.

In some aspects of the present disclosure, the antenna includes a dipole 42405, 42407. Also shown is the SMD 42409, to be illustrated in more detail below with respect to FIGS. 424D and 424E. Metal trace 42411 includes a part of the monopole, also discussed below. Because of space requirements, SMD size "0402" may be used. Generally, the described SMD provides a certain amount of vertical polarization.

FIG. 424B is a perspective view of the dipole portion of the antenna of FIG. 424A, according to some aspects of the present disclosure. FIG. 424B illustrates at 42402 the dipole arms 42405 and 42407 from FIG. 424A, and the beginning portion 42413 of the via 42413, 42413A of FIG. 424A, without the SMD element yet added. Via 42413, 42413A can be seen more clearly in FIGS. 424D and 424E described in detail below. FIG. 424C illustrates a combined dipole and monopole antenna, according to some aspects of the present disclosure. In the antenna seen generally at 42404 of FIG. 424C, SMD 42409 has added the monopole, which in some aspects of the present disclosure include the upper trace 42411 if the length of via 42413, 42413A is of insufficient height due, for example, to height limitations in the user device in which the antenna is used. In other words, if simulation shows the antenna arm should be a certain height, which cannot be accommodated by the thickness of the user device, then the trace 42411, in some aspects of the present disclosure, can be added to via 42413, 42413A and "folded" onto the top of the SMD 42409.

FIG. 424D illustrates a perspective view of the monopole part of the antenna of FIG. 424A, according to some aspects of the present disclosure. The antenna is indicated generally at 42406. The shield is seen, again, at 42401. Metallized via 42413, 42413A is illustrated as an antenna arm, and metal trace 42411 functions to extend the arm 42413, 42413A if needed. One horizontal arm 42405 of the dipole is illustrated. Also shown is feed line 42415, which may be a strip line, internal to circuit board 42403. The shield, 42401 seen originally in FIG. 424A, is used as part of a smartphone or other user device, in any event, to shield integrated circuitry, and use is made of the shield both as a reflector for the antenna and also as a way to improve impedance matching. In one aspect the transitioning antenna was located about 1.2 millimeters from the edge of the shield to the center of the via that forms the monopole, and about 0.38 millimeter from the edge of the shield to the edge of the SMD. In practice, the distance is given primarily by how much space is available in the board for the user device, with the objective of trying to maximize the distance.

FIG. 424E is a side view of the antenna of FIGS. 424A and 424D, according to some aspects of the present disclosure. FIG. 424E illustrates the entire package and illustrates the same components as FIG. 424B with additional detail. For example, the feedline 42415 can be seen as being inside the circuit board 42403 where it would be attached to an RFIC (not shown due to space limitations) that would be covered by shield 42401 shown in partial view (also due to space limitations). Feedline 42415 feeds vertical arm 42413, 42413A, which proceeds to the top of SMD 42409 where it is illustrated as including metal trace 42411. 42417 indicates the ground plane for the antenna.

Simulated radiation patterns have shown that when placing the SMD component on the dipole element, the combination gives rise to vertical polarization without any significant negative impact to the performance of the horizontal polarization component of the antenna. FIG. 425 illustrates a radiation pattern of the antenna of FIG. 424A, according to some aspects of the present disclosure. The x, y, and z coordinates correspond to those illustrated in FIG. 424A. FIG. 426A illustrates an elevation cut 42600 of the radiation pattern of the antenna of FIG. 424A, according to some aspects of the present disclosure. Radiation pattern 42601 illustrates gain in vertical polarity, radiation pattern 42603 illustrates gain in horizontal polarity. Radiation pattern 42605 illustrates total gain. FIG. 426B illustrates a radiation pattern 42602 of the antenna of FIG. 424B, according to some aspects of the present disclosure. The antenna of FIG. 424B is without the SMD part of the monopole and the radiation pattern is essentially that of the dipole 42405, 42407 of FIG. 424B, seen at 42605 of FIG. 426B.

SMD L-Shaped Dipole with Shield Reflector

An L-shaped dipole with backed shield is described below. FIG. 427A illustrates a side view of an SMD L-shaped dipole with an IC shield used as a reflector, according to some aspects of the present disclosure. The dipole is seen generally at 42700. A single ended feed line 42701 from IC circuitry (not shown) that is shielded by the IC shield 42703 feeds the vertical section 42705 of the dipole. Vertical section 42705 continues as vertical section 42705A (that is within SMD 42708), vertical sections 42705, 42705A being connected by solder joint 42711, and the vertical sections 42707, 42705A, and the solder joint forming a vertical arm of the dipole. Ground 42704 of FIG. 427A is extended to act as the second arm of the dipole 42707, thus forming an L-shaped dipole (seen more clearly in FIG. 427B as will be discussed in greater detail below). The IC shield is a conformal cover over IC that is on the board of a mobile device. The shield is usually grounded to the board as a shield from electromagnetic interference. An L-shaped dipole such as that described, combined with a backed shield, can radiate with a larger gain to the endfire direction (seen diagrammatically in FIG. 427B) than the standard patch element.

In some aspects of the present disclosure, the L-shaped element 42705, 42705A, 42707 (where 42505A is seen in cutaway side view in FIG. 427A as being internal to the SMD 42708) takes advantage of the area near the shield and the board height. The usual dipole has two horizontal arms. However, the dipole illustrated in FIG. 427B has one horizontal arm 42707 and one vertical arm 42705, 42705A. Part of the vertical arm 42705 of the dipole is in the board (where the excitation is located) and part 42705A is in the SMD 42708 to enable lower board height as may be needed. The metalized via 42705A in the SMD 42708 acts as a second dipole arm being folded up into the SMD 42708 to form a folded dipole. In other words, the two arms of the dipole are each in different planes.

For example, the two arms of the dipole are each in orthogonal planes. This gives rise to two different polarizations, vertical from the vertical arm and horizontal from the horizontal arm. In some aspects of the present disclosure, the vertical arm 42705, 42705A may go entirely through the SMD 42708 and extend to the top 42709 of the SMD 42708. If, as it may happen, the height of the SMD 42708 is not electrically sufficient for the needed length of arm 42705A, for a given aspect, a horizontal metal trace, such as copper, may be added to 42705A (now extending to the top layer 42709 of the SMD 42708) as a horizontally folded extension of arm 42705A. This horizontally folded extension, or trace, extends from the via, at the top 42709 of the SMD 42708, much like metal trace illustrated at 42411 in FIG. 424A. This metal trace can be used to extend the vertical arm 42705, 42705A.

In some aspects of the present disclosure, the SMD may be mounted onto the PCB using a land grid array pad (LGA Pad) seen in FIG. 427A, where the SMD 42709 is seen as attached via solder 42711. In other words, the dipole comprises two arms, one, a horizontal trace, such as copper, that forms horizontal arm 42707, being in the PCB and one, a vertical arm 42705A, being in the SMD 42709. As illustrated, one metallized horizontal arm of the dipole is from the ground 42704 and one metallized vertical arm, or metalized via in this instance, is in the SMD.

In some aspects of the present disclosure, the width/diameter of the metallized via 42705A, which may function as a metal trace, has substantially the same width as the width of the horizontal trace 42707 that forms the horizontal arm of the dipole. Consequently, the vertical metallized via looks electrically as if it is the other arm of the dipole. In summary, the shield is seen as 42703 in FIG. 427A and in FIG. 427B. The shield serves as a reflector for the dipole that comprises metallized horizontal arm 42707 from ground seen in FIG. 427B and metalized vertical (or folded) arm seen as via 42705, 42705A in FIG. 427A. The vertical arm is fed by feed line 42701 of FIG. 427A. In other words, the horizontal arm is ground and the vertical arm is signal-fed by the feedline from the IC.

The PCB generally includes a plurality of layers. In some aspects of the present disclosure, the horizontal arm 42707 can be formed by removing metal from all layers in the area around the dipole except for the metal that forms the horizontal arm 42707, leaving horizontal arm 42707 as one arm of the dipole, the vertical arm 42705, 42705A forming a second arm of the dipole. SMD 42709 can be affixed to the PCB by solder 42711. While solder 42711 represents a discontinuity in the vertical arm, it has been seen that the solder does not hinder intended operation in any substantial way.

FIG. 427B illustrates a perspective view of the SMD L-shaped dipole 42702, and illustrates more clearly that arm 42705, 42705A is partly within the SMD 42709 and that the arm 42705, 42705A is folded upward with respect to horizontal arm 42707.

SMD L-Shaped Dipoles Symmetrical Array

In some aspects of the present disclosure, an L-shaped dipole array can be configured to provide high gain to the endfire direction, with polarization diversity. FIG. 428 illustrates a perspective view of an array of four of these SMD L-shaped dipoles, according to an aspect. While the array is described as comprising four L-shaped dipoles, such an array is not limited to four L-shaped dipoles but could be any appropriate number of L-shaped dipoles. The array is seen generally at 42800. Each individual L-shaped dipole element 42801, 42803, 42805 and 42807 may be of the type discussed with respect to FIGS. 427A and 427B, above. Each such L-shaped dipole has a horizontal arm 42707 and a vertical arm 42705, 42705A internal to the SMD as discussed with respect to FIGS. 427A and 427B. Each is situated with respect to shield wall 42802, also as discussed with respect to FIGS. 427A and 427B.

The X, Y, Z coordinate system for the array is as illustrated in FIG. 428. The shield 42802 has a shield extension which is discussed later in this patent. Each dipole element of the array, in some aspects of the present disclosure, has an RF chain input, dipole 42801 having RF chain 1 as an input, dipole 42803 having RF chain 2 as an input, dipole 42805 having RF chain 3 as an input and dipole 42807 having RF chain 4 as an input. The shield 42802, as the other shields illustrated in various figures herein, is only partly illustrated due to drawing space considerations. In practice the shield would extend to cover an IC, in this case an IC that provides RF chain 1, RF chain 2, RF chain 3 and RF chain 4. The four L-shaped dipole elements form a linear array in the described aspect.

In some aspects of the present disclosure, the direction of the horizontal arm of the L-shaped dipoles is purposely arranged to be opposite in adjacent pairs of the L-shaped dipole antenna elements in order to achieve a certain field cancellation/addition between the elements for a given input phase of the respective RF chains. In the figures that follow in the description of this aspect, dipole array elements under discussion will be dipole elements 42801, 42803, 42805 and 42807 of FIG. 428 and their respective horizontal arms will be referred to as horizontal arms 1, 2, 3 and 4, respectively, of FIGS. 429A and 429B.

FIG. 429A illustrates the array of FIG. 428 for vertical polarization, with the horizontally polarized fields cancelling out, according to some aspects of the present disclosure. In FIG. 429A for the horizontal arms 1, 2, 3 and 4, the fields that arise from RF chains 1, 2, 3 and 4, respectively, cancel out. This is because for the horizontal arms 1, 2, 3 and 4, since they are arranged in respectively opposite (left/right) directions, as indicated by the arrows, the current flows in opposite directions, and thus the generated radiated fields cancel each other out.

FIG. 429B illustrates the array of FIG. 428 for vertical polarization, with the vertically polarized fields adding up, according to some aspects of the present disclosure. In FIG. 429B, for the vertical arms of dipole antenna elements 42801, 42803, 42805 and 42807 (illustrated in vertical hidden line), since they are arranged in the same directions (up, as indicated by the vertical arrows) the current flows in the same direction, and thus the generated radiated fields, add up. Consequently, vertical polarization is achieved. Stated another way, to obtain vertical polarization, vertical mode (0°, 0°, 0°, 0°) is being used in which the fields radiated by the horizontal arms cancel each other and the fields radiated by the vertical arms add up.

FIG. 430A illustrates the array of FIG. 428 for horizontal polarization, with the horizontally polarized fields adding up, according to some aspects of the present disclosure. For horizontal arms 1, 2, 3, and 4, even though they are arranged in opposite directions (left/right) the opposite phases of signals from the respective RF chains 1, 2, 3 and 4 make the currents flow in the same direction, and thus the radiated fields add up.

FIG. 430B illustrates the array of FIG. 428 for horizontal polarization, with the horizontally polarized fields cancelling out, according to some aspects of the present disclosure. For the vertical arms of dipole antenna elements 42801, 42803, 42805 and 42807, even though they are arranged in the same direction (up, as indicated by the vertical arrows), the opposite phases of signals from the respective RF chains 1, 2, 3 and 4 make the currents flow in the opposite direction, and thus the vertically polarized radiated fields cancel out. Consequently, horizontal polarization is achieved. Stated another way, for horizontal polarization horizontal mode (0°, 180°, 0°, 180°) is being used, where the radiated fields from the vertical arms cancel and the radiated fields from the horizontal arms add up.

FIG. 431 illustrates a three-dimensional radiation pattern for vertical (theta) polarization, according to some aspects of the present disclosure. The illustrated three-dimensional radiation pattern of energy radiated by the L-shaped dipole array when vertical polarization mode (phases are 0o, 0o, 0o, and 0*o*). The realized gain for the vertical component of the electric field (E-theta) has been simulated, with a maximum of 7.43 dB.

FIG. 432 illustrates a radiation pattern for horizontal (phi) polarization, according to some aspects of the present disclosure. The illustrated three-dimensional pattern of energy radiated by the L-shaped dipole array when in horizontal polarization mode (phases are 0o, 180o, 0o, and 180*o*). The realized gain for the horizontal component of the electric field (E-phi) has been simulated, with a maximum of 7.14 dB.

The aspect of the disclosure in FIG. 428 not only takes advantage of limited space in a mobile device, but it also expands the uses of available RF chains. For example, if there are only four RF chains available (as illustrated) and ideally the system would use eight available RF chains so that the system could transmit four vertical polarization RF chains and four horizontal RF chains, a resolution is desirable. By using the described L-shaped dipole, one RF chain is effectively converted to two RF chains. Consequently, if limited space allows only a four antenna array and also the available chains from the circuitry are only four RF chains, the array of four L-shaped dipole antenna elements provides four vertically polarized radiating elements and four horizontally polarized radiating elements, thus yielding the desired eight elements. A four antenna array is used as an example, and those of ordinary skill in the art will recognize that additional numbers of antenna elements can be used in antenna arrays as may be appropriate for a given aspect.

Furthermore, if a multiple of four RF chains is available from the circuitry that is covered by the IC shield, double the number of total effective RF chains could be achieved. For example, if the multiple of four RF chains were available in a rectangular or square sub-system, a number of L-shaped dipole arrays could be placed around the circuit sub-system, on top of the sub-system and, if desired, on the bottom of the sub-system, for feeding the individual RF chains to respective antennas. Thus double the multiple of four radiating elements could be achieved.

In some aspects of the present disclosure, an SMD monopole can be used as an antenna by itself, thus achieving fully (or substantially fully) vertical (θ) polarization with a single element. Some conditions that allow an SMD monopole antenna to achieve fully vertical polarization are that the monopole has vertical polarization because of its orthogonal position in relation to the surface of an RFEM when used in a user device with an RFEM (or a feature that is equivalent to an RFEM). Furthermore, the placement of the feed of a monopole with respect to an IC shield, which acts as a reflector, is important. The shield's function is to reflect the radiated energy in the desired direction, in this case, endfire. The shield is not intended to have an impact on the polarization of the radiated fields.

FIG. 433 illustrates a single SMD monopole Antenna 43303 and IC shield 43301, according to some aspects of the present disclosure. The IC itself is not illustrated due to space considerations but would be to the left of, and covered by, IC shield 43301, which is illustrated in partial view. The SMD monopole 43300 may include two parts: (1) a via element 43307 built on the edge of the RFEM package 43305, and (2) a via element 43307A, which may be a copper via, built within the SMD component 43303. Via 43307 realizes the bottom part of the monopole and via element 43307A realizes the top part of the monopole. The SMD may be soldered on the RFEM package using two pads: one, at the location of via 43307 for the signal and one, a dummy pad (not shown) for mechanical stability. Copper (or other metal) trace 43309 may be printed on the top layer of the SMD to extend the total length of the monopole as needed. The foregoing description of using two pads, and the other details recited are used merely as an example and those of ordinary skill in the art will recognize that these details may be changed as may be appropriate for a particular aspect.

For example, trace 43309 may be used for tuning purposes if the via 43307, 43307A is not long enough because, among other things, of height limitation in the user device in which the monopole is situated. Stated another way, if the height of via 43307, 43307A is not sufficient to meet the requirements of tuning the antenna to a desired transmit frequency, the trace 43309 would be of appropriate length to add the required height to via 43307, 43307A, even though the trace is folded horizontally onto the top of SMD 43303. In some aspects of the present disclosure where via 43307, 43307A is of sufficient height, the trace 43309 may not be needed. In some aspects of the present disclosure, the SMD monopole 43300 may be fed with a stripline or other transmission line 43311 from the RFEM package.

FIG. 434 illustrates a three-dimensional radiation pattern, according to some aspects of the present disclosure. FIG. 434 illustrates the radiation pattern of the single monopole at 60 GHz. FIG. 435 illustrates an impedance plot of a single monopole, according to some aspects of the present disclosure. The impedance plot is represented on a Smith Chart and at 60 GHz the plot 43501 is near the center point, meaning the antenna is well matched.

After calculating the length of the monopole based on the wavelength in the dielectric material at the frequency of interest, and similarly calculating the dimensions of the stripline or other transmission line feedline; iterative 3D simulations taking into account manufacturing constraints as well as the limited space available and distance of the shield, are performed to achieve the antenna impedance matching.

FIG. 436 illustrates the return loss of a single monopole over frequency, according to some aspects of the present disclosure. The plot shows that the antenna is well matched at 60 GHz and that it has an impedance bandwidth from 56.56 GHz to 66 GHz. FIG. 437 illustrates realized vertical polarization gain (θ) in the X-Z plane from a single monopole, according to some aspects of the present disclosure.

FIG. 437 is a two-dimensional plot at 60 GHz and shows the vertical component of the electric field (E-theta) is dominant. The realized gain in the endfire direction is 3.33 dB. The traces represent the realized gain on the X-Z plane for a different polarization of the E-field. The endfire direction is ninety (90) degrees on this plot (which represents the positive x axis of the coordinate system on FIG. 433).

FIG. 438 illustrates realized vertical polarized (θ) gain over frequency, at 15o above endfire, from a single monopole, according to some aspects of the present disclosure. The realized gain for the E-theta component of the electric field is seen at 43803.

Given that antenna polarization of a transmitting system and a receiving device may substantially match for good connection, the purpose of having dual polarization is to be able to maximize the transmission from a transmitter to another device (e.g., a dock, peripheral, or smartphone, and the like).

The user device, such as a smartphone, with an RFEM similar to that described above, may be moving and changing its orientation with relation to the transmitter. Thus, the option for either polarization is used in an effort to provide good connection regardless of the relative position of the transmitter and receiver.

In some aspects of the present disclosure, transmitted polarity, and therefore which type of antenna is firing at a given time, may be algorithmically controlled based on an indication of the polarity of the signal received with greatest strength. This indication can be continually being fed back to the transmitter from the user device. This operation is implemented to achieve transmitted polarization that matches the polarization at the receiver.

In some aspects of the present disclosure, different array combinations can be implemented depending on the area available in a user device. In some aspects of the present disclosure, polarization diversity can be achieved in the endfire direction using an array of two monopoles for vertical (θ) polarization and an array of two dipoles for horizontal (Φ) polarization, with a total of 4 feed lines such as from four RF chains such as seen in FIG. 428, discussed above. Each array can be configured to operate at a given time. Parameters described in FIG. 439 below, such as two monopoles for vertical polarization and two dipoles for horizontal polarization, are given by way of example only, and those of ordinary skill in the art will recognize that a different number or plurality of such antennas may be used as may be appropriate for a particular implementation.

FIG. 439 illustrates a two-element monopole and a two-element dipole array, according to some aspects of the present disclosure. FIG. 439 illustrates a top view, 43900, of the two arrays. As discussed above, IC shield 43901, of which part of the top is illustrated in top view, is used as a reflector to provide additional gain in the desired direction. The IC itself would be covered by the shield and would be located toward the top of the drawing of FIG. 439 beyond and cover by the shield but is not illustrated due to space considerations in the drawing. A first array comprises monopole 43903 and monopole 43905. Monopoles 43903 and 43905 can be the same type of monopole discussed with respect to FIG. 433.

Because the arrays are illustrated in top view, the signal connection for monopole vertical arm 43307, 43307A of FIG. 433 can be seen at 43903A of FIG. 439 and the dummy pad discussed above with respect to FIG. 433 is seen at 43903B of FIG. 439 for support purposes. Those of ordinary skill in the art will recognize that support can be provided other than by a dummy pad placed as illustrated. The two monopoles are fed, respectively, by feed line 43907 and feed line 43909.

In some aspects of the present disclosure, dipoles 43911 and 43913 are printed on the RFEM package layers. The corners of the dipole arms are folded up in some aspects of the present disclosure in order to increase their length but to avoid interference with other metals around them, including coaxial connector 43915 which causes very limited space for the antenna arrays. Only one of the four folded upward dipole arms is enumerated, as 43911A, but the upward fold is typical for all four dipole arms in the aspect under discussion. In one aspect, the array has the dimensions illustrated on FIG. 439. The ground plane (GND) is on one of the layers of substrate 43902. The substrate 43902 is illustrated in partial view but in practice would be extended beyond the borders of 43902 illustrated in FIG. 439. The monopoles are at a certain distance from the shield, and the dipoles need to be at a certain distance from the GND plane for improved operation. Also, the distance between the elements of the array (dipole to dipole and monopole to monopole) is designed for improved performance given the limited area available. The dimensions discussed above may be determined using a simulation application and inputting into the application the dimensions that are available in the user device, and judging from simulation results the appropriate dimensions to obtain desirable results, which may be desired radiation directivity and other parameters.

FIG. 440 illustrates a three-dimensional radiation pattern of a two-dipole array at 60 GHz, according to some aspects of the present disclosure. In this aspect the total realized gain is measured with a maximum gain of approximately 4.16 dB. The direction+Z for the pattern is toward the bottom of the board as illustrated in FIG. 439.

FIG. 441 illustrates realized horizontal polarity (Ø) gain over frequency in the endfire direction from the two-dipole array of FIG. 439, according to some aspects of the present disclosure. The realized gain for the E-phi component of the electric field is shown at 44101.

FIG. 442 illustrates a three-dimensional radiation pattern of the two-monopole array of FIG. 439 at 60 GHz, according to some aspects of the present disclosure. As with FIG. 440, the Z+direction is toward the bottom of the board. FIG. 443 illustrates the realized vertical polarity (Ø), according to some aspects of the present disclosure. The realized gain for the E-theta component of the electric field is shown at 44301.

Multiple SMD Antenna Aspects

Some general information applies to FIGS. 444-447, which are discussed below in greater detail. The length of the patch antennas discussed is typically λg/2 where Ag is the wavelength in the dielectric. For a 60 GHz antenna on the dielectric materials that we're using (for example, with dielectric constant of approximately (~) 3) that length is approximately 1.2 mm. The width of the patch antenna is slightly larger than the length; however, for a dual feed/dual polarized antenna, the width and length should be both the same (~1.2 mm).

Another important dimension for the patch antennas is the thickness of the dielectric between the patch and the reference ground, and the thickness of the dielectric between the main and the parasitic patch (if a parasitic patch is present). The following are relevant factors. The thickness of the dielectric (in combination with the material properties) is directly related to the impedance bandwidth of the antenna. For example, as a reference point for WiGig (60 GHz), a bandwidth of ~8 GHz is desirable. For a solution with a single patch (for example, a main patch), the thickness of the dielectric should be ~λg/10. If a wide bandwidth is desirable, such as in WiGig, the thickness should be ~300 um. For a solution with a parasitic patch (for a single+parasitic), the total thickness should be ~λg/10 (in other words, adding the thickness of the dielectric between ground and main patch, plus dielectric between main and parasitic patches. Which one is thicker depends on the dielectric constant of each dielectric material. The concept is that the main patch is more tightly coupled to the ground. In the case of FIG. 445, discussed generally in additional below, since the shield acts as ground reference, the dielectric between ground and main patch is just air.

The following are relevant factors for the distance of the shield from the SMD in FIGS. 444-447, also discussed generally in additional detail below. For the aspects of the disclosure in FIGS. 444 and 447, the distance of the shield from the SMD can be as close as manufacturing allows. For the aspect in FIG. 445, the distance of the shield from the SMD should follow the rule described above for thickness of the dielectric between ground reference and the main patch. For the aspect in FIG. 446, that distance depends on the intended direction of the radiation. The distance should be as far as possible for broadside radiation, and as close as possible for endfire radiation. Generally, the distance will be somewhere in between those two extremes. For the aspect in FIG. 448, the distance should be as far as possible, given the available space (space available being a limiting factor for essentially all the aspects described herein). This applies for both single and dual polarization.

FIG. 444 illustrates a single patch, dual feed, dual polarization vertical SMD patch antenna, according to some aspects of the present disclosure. In FIG. 444, a PCB is seen at 44401. RFIC shield 44405, which covers the RFIC 44403, can be configured to operate as a reflector for patch antenna 44409.

In some aspects of the present disclosure, patch antenna 44409 is etched or otherwise configured on the face of the SMD 44407 adjacent director 44417 as illustrated. The patch antenna 44409 may be folded or non-folded. In other words, a patch antenna, such as at 44409, can wrap-around from the side of the DMC to the bottom, providing extra length if needed, as explained for above aspects. Ground that is etched or otherwise situated on the SMD is illustrated at 44411. Stated another way, ground 44411 in some aspects of the present disclosure can be on the side, as illustrated, and can, as needed, wrap-around as illustrated.

In some aspects of the present disclosure, patch antenna 44409 is fed by dual feed lines 44413 on the board and 44415 within the SMD multilayer component, to connect the appropriate feed from the board to the appropriate SMD layer. Microvia 44416 extends from at or near the bottom of the SMD 44407 to an intermediate height within the SMD component, and is followed by a line in the device (i.e., upper line 44415) which feeds, and connects to, a location in the patch antenna and which (in combination with lower line 44415) makes the antenna function as a dual polarized antenna.

In some aspects of the present disclosure, director 44417 is etched or formed on the chassis of the user device, such as a phone, laptop, and the like, to direct the radiation in direction 44419 to a receiver. FIG. 418, discussed above, illustrates chasses with placement of directors. Because the antenna is dual and orthogonally fed, it provides dual polarization in two orthogonal directions, the direction depending on which of the dual feeds is selected.

In some aspects of the present disclosure, selection of which feed to use at a given time may be controlled by a controller to enable the antenna to provide one or the other polarization as needed, depending on the strength of the received polarized signal at the receiver. In some aspects of the present disclosure, the strength of received polarized signal at the user device is fed back for feed selection by the controller. This allows the controller to select the feed that provides the polarization capable of providing a stronger received signal, thereby improving overall performance.

FIG. 445 illustrates a stacked patch, single feed, single polarization vertical SMD patch antenna, according to some aspects of the present disclosure. In FIG. 445, a PCB is seen at 44501. RFIC shield 44505, which covers the RFIC 44503, acts as a reflector and ground reference for patch antenna 44509. Patch antenna 44509 is etched or otherwise configured on the illustrated face of SMD 44507. The patch antenna may be folded or non-folded. The patch antenna illustrated at 44511 is a parasitic element. Additional parasitic elements may be used for FIG. 445, and for the additional SMD illustration figures described below, as may be appropriate for other aspects. Patch antenna 44509 is fed by a single feed line 44513 on the board. Director 44515 is etched or formed on the chassis of the user device to direct the radiation in direction 44517. Because there is only a single feed, there is only a single polarization.

FIG. 446 illustrates a horizontal SMD patch antenna, according to some aspects of the present disclosure. In FIG. 446, a PCB is seen at 44601. RFIC shield 44605, which covers the RFIC 44603, acts as a reflector for patch antenna comprising driven capacitive patch antenna 44609 and parasitic patch antenna 44615. There is also ground layer 44611 within the PCB that acts as a ground reference for the primary capacitive patch 44609. Ground 44611 is not drawn to scale. The ground is much larger than the patch itself. In some aspects of the present disclosure the ground may be the entire area of the PCB.

In some aspects of the present disclosure, capacitive patch antenna 44609 is etched or otherwise configured on the illustrated face of SMD 44607. The patch antenna may be folded or non-folded. Patch antenna 44609 is fed by dual feed lines 44613 on the board. Because there are dual feeds, there may be dual polarization, both vertical and horizontal polarization which may be algorithmically controlled as discussed above.

FIG. 447 illustrates a vertical SMD patch antenna 44708 using a cross-hatch pattern, according to some aspects of the present disclosure. In FIG. 447, a PCB is seen at 4701. RFIC shield 44705, which covers the RFIC 44703, acts as a reflector for patch antenna 44708. The ground reference, in some aspects of the present disclosure, is the cross-hatch pattern 44710 on the opposite side of SMD 44707, and extends down to the bottom layer of the PCB. Patch antenna 44708 may be a capacitive patch made using high density cross-hatch copper traces and microvias. Such a pattern can be implemented within the body of the SMD 44707 component and within the main host PCB 44701. The cross-hatch SMD component can be connected using multiple solder points 44709A and 44709B. The patch antenna 44708 may be folded or non-folded. Patch antenna 44708 is fed by dual feed lines 44713 on the board which should be two, orthogonal feeds for dual polarization. Director 44711 is etched or formed on the chassis to direct the radiation in direction 44719.

FIG. 448 illustrates an SMD spiral antenna with circular polarization, according to some aspects of the present disclosure. In FIG. 448, an RFIC 44803 is connected to PCB 44801. RFIC shield 44805 covers the RFIC 44803, acts as a reflector and ground reference for the spiral antenna 44809. Spiral antenna 44809 may be made using vias and traces on the top and bottom layers of the SMD 44807. If SMD 44807 is multilayer, then the spiral antenna could be implemented using vias and traces in the inner layers of the SMD 44807. Spiral antenna 44809 is fed by a single feedline 44813 on the board. Director 44813 is etched or formed on the chassis to direct the radiation in direction 44815.

FIG. 449 illustrates the implementation of a spiral antenna within an SMD, according to some aspects of the present disclosure. An RFIC is seen at 44903, or in some aspects of the present disclosure 44903 may designate a PCB that holds the RFIC. Traces 44907 may be printed on top and bottom of SMD 44905. Also, vias 44909 may be placed between top and bottom of the SMD to connect the traces as illustrated. While not circular, as spirals are often illustrated, the illustrated trace-via combination may act as one circular or oval loop of a spiral. A plurality of such loops may be connected together to function as circular loops. Note that the bottom trace 44907 is left open (not connected to via 44910) and may be connected to a second loop which may similarly be connected to a third, and so on, to form a spiral. For example, if the SMD component is multilayer, then trace loops and connecting vias may be constructed on inner layers, allowing more turns of the spiral. Via 44911 is connected to single strip line feed 44915 within the RFIC 44903. Vias 44909 are ground vias to stitch the GND layers that reference the strip line feed 44915.

FIG. 450 illustrates coupling radiation from an RFIC to a plurality of directors on a chassis, according to some aspects of the present disclosure. Illustrated is PCB 45001 with attached RFIC 45003. Four SMD components 45005 each include an antenna element such as those illustrated in FIGS. 444-447, are spaced at an adequate distance from each other for gain versus size, and are fed by feed mechanisms 45007 from RFIC 45003. Feed mechanism 45007 may be a single feed, single polarization feed mechanism, or a dual feed, dual polarization feed mechanism, each as respectively discussed above. As also discussed above in this patent, distance and other parameters are a function of space available in the device in which the antenna finds use. Distances and other parameters may then be determined, in many cases, by simulation, inputting the available distances or distance ranges, angles, and other parameters, into simulation software and determine which set of distances, angles, gain, radiation pattern, and other parameters provide desirable results, also illustrated are four target features 45011, such as directors, on the device chassis 45009. The SMD components 45005 may represent a 28 GHz antenna array, each antenna element fed by RF signals of the same polarization. Illustrated by wavy lines at 45013 is an indication of the radiation between the SMD components and the target features. Spacing between the SMD components and the chassis features would be in the order of 0.5 mm to 1.0 mm. at 28 GHz. In this aspect, the antenna elements are SMD components, however they could also be realized on the PCB.

As discussed above, RF sub-systems such as RFEMs, RFICs and the like use a shielding to protect from radio frequency interference (RFI) and electromagnetic interference (EMI). The shieldings are metallized and usually form a box to cover the active die placed within it. Described below are cutouts from the shielding, in various forms and patterns, that create antenna structures either as slot lines or as active metal line antennas that would be connected to the RFIC inside the shielding either through a metalized trace or through another suitable type of coupling mechanism.

FIG. 451A is a perspective view of an IC shield wall cut-out that forms an antenna, according to some aspects of the present disclosure. The IC shield 45100 is illustrated in a perspective view with a shield cover that is not shown. The top of the PCB to which the IC Shield is affixed indicated at 45113. In FIG. 451A, item 45113 appears away from the top of the PCB. However, this is merely because of lack of drawing space. Item 45113 is the top of the PCB on which the RFIC die is located. The shield may be affixed to the PCB by solder. Point 45115 illustrates a gap or opening. There are typical around the four corners of the top of the PCB, in some aspects of the present disclosure. RFIC die 45101 is also affixed to the PCB 45113, which in some aspects of the present disclosure may be by solder as indicated by solder balls at the bottom of RFIC die 45101. Two of the shield walls are visible, each marked “SHIELD WALL” and a third shield wall is visible in dash line. Consequently, the inside of the IC shield is visible. A cutout in shield wall 45103 is visible at 45105 and continues to the bottom of the shield wall at the PCB and functions as an antenna. This cutout forms wall element 45107 as an antenna which, in this aspect, is a planar inverted F antenna (PIFA). As indicated below, a PIFA is merely one example of the antennas that can be cut out of the shield and the aspects are not limited to using a PIFA. In the aspect under discussion the PIFA antenna is the cross-hatched section 45107 in FIG. 451A. It is metalized. The cutout is around PIFA 45107 is 45105, in two sections, which is not cross-hatched. So the metallization that forms the PIFA 45107 is shown in a diagonal lined section in the drawing.

In FIG. 451B there is no surrounding metal illustrated around the PIFA antenna 45107 above the GND plane edge line, for clarity of illustration. But in FIG. 451A the PIFA 45107 is illustrated as it appears, within the side of shield within a cutout 45105. In some aspects of the present disclosure, wall element 45107 may terminate at the PCB at feed transmission line 45111 that connects to appropriate transceiver circuitry of RFIC die 45101 and feeds the antenna that is formed by the cut-out 45105. Various types of feed mechanisms may be used, such as the coplanar waveguide shown, or micro strips, and the like. Transmission line 45111 may be formed on the floor 45113 of the PCB by removing metal to expose segments 45112 that isolate transmission line 45111 from, ground GND. As illustrated in FIG. 451A, the feed line 45111 is partially on the PCB and partially on the shield wall 45103 metallization leading to the PIFA 45107.

In FIG. 451A the vast majority of the transmission line 45111 is on the PCB on which the RFIC die is located, in some aspects of the present disclosure. The cross-hatch line filled area 45111 is metallized transmission line on the PCB, while only a small section of the transmission line is located on the shield wall. In other words, the cross-hatch lined filled areas 45107 and the rest of the shield wall 45103 (other than 45105) are metallization on the shield metal. The PIFA antenna 45107 is formed within a metallization free cutout 45105 in the shield wall in this example. On either side of the transmission line 45111, the areas 45112 are areas in which the PCB metallization was removed (delaminated) on either side 45112 of the feed line 45111 to make 45111 into a transmission line feeding the PIFA. This delamination is usually done by etching on PCB. Scraping instead of etching is possible but not considered accurate. The delamination may also be accomplished by machining or other mechanical cutout mechanisms on the shield metal. The feed line can be implemented using multiple technologies and not limited to one technology (e.g., on a PCB).

An element 45109 of the wall that is adjacent to the cut-out 45105 connects to ground GND of the PCB and functions as a shorting line to ground for the cut-out antenna 45107. In some aspects of the present disclosure GND functions as a ground plane for the antenna formed by the cut-outs. FIG. 451B is a side view of the wall cut-out that comprises the antenna illustrated in FIG. 451A, according to some aspects of the present disclosure. FIG. 451B shows a planar inverted F antenna (PIFA) with elements 45105, as well as wall elements 45107, 45109 and feed transmission line 45111 being the same as the like-numbered elements in FIG. 451A. A PIFA is used in this aspect primarily because it presents a relatively simple way to connect an antenna to ground GND by way of wall element 45109, and also because of its known resonance at a quarter-wavelength, which reduces required space needed in the user device, and also because it has good signal absorption rate properties. In operation, feed transmission line 45111 is configured to feed the antenna element residing in cut-out 45105 which functions as an antenna, radiating RF energy outward from shield wall 45103. In some aspects of the present disclosure, such as the PIFA illustrated at 45107, the radiation may be substantially omnidirectional. The cut-out and antenna element may be in the form of other configurations, such as a notch or slot, or a patch with appropriate grounding.

FIG. 451C is a perspective view of an IC shield with a wall cut-out and a top cut-out that comprise antenna elements of an antenna array, according to some aspects of the present disclosure. In FIG. 451C the walls are seen typically at 45103 and the top is seen at 45106. Consequently, the perspective view of FIG. 451C illustrates the IC shield covering RFIC 45101 that is shown in hidden view as being under the cover 45106 of the IC shield. The cut-out on top 45106 is seen at 45105A with wall element 45109A proving a path to ground by way of the PCB. Cut-out 45105A in FIG. 451C functions as an antenna and is substantially the same type of antenna as cut-out 45105 of FIG. 451A, that is shown in hidden view in FIG. 451C. Feed transmission line 45111A shown in hidden line feeds antenna 45109A from RFIC 45101 is the same as or simpler to feed transmission line 45111 in hidden view.

In some aspects of the present disclosure, two or more antennas can be oriented orthogonal to one another. For example, two antennas 45105 and 45105A being substantially physically orientated orthogonal to each other support two different polarizations and/or spatial coverages. Each antenna can be fed with either the same signal to create a new vector summation or with two different signals or spatial streams to enable Multiple in Multiple Out (MIMO) modes of operation. When fed at different times, radiation can be caused at two different polarizations at different times, depending on the control configuration, as discussed above.

In some aspects of the present disclosure, selection of which feed to use at a given time may be controlled by a controller to enable the antenna to provide one or the other polarization as needed, depending on the strength of the received polarized signal at a receiver to which the signal is transmitted. In some aspects of the present disclosure the strength of received polarized signal at the receiver is fed back for feed selection by the controller to select the feed that provides the polarization, vertical or horizontal, that provides the stronger received signal at a given time. The feedback can be provided continuously, thereby continuously providing the appropriate polarization and improving overall performance. In some aspects of the present disclosure, both feeds are used to decipher MIMO signals having spatial orthogonality.

FIG. 451D is a perspective view of an IC shield with a first wall cut-out and a second wall cut-out that comprise antenna elements of an antenna array, according to some aspects of the present disclosure. The IC shield 45106 in FIG. 451D is the same as that illustrated at 45100 in FIG. 451A. However, the shield has a second cutout 45105A including feed transmission line 45111A situated with respect to the die in the same manner as cutout 45105, and feed transmission line 45111. Because the shield is rectangular the two cut-outs 45105 and 45105A are orthogonal to each other and operate in the same manner as discussed with respect to FIG. 451C. Other implementations such as two orthogonal cut-out antennas on the top of the shield with similar feed mechanisms as those described, and other implementations, are possible.

In a RF system, the antenna is connected to a transmit/receive (T/R) switch and then connected to the power amplifier (PA) and low noise amplifier (LNA) in the TX and RX chains, respectively. At mmWave frequencies, the loss associated with such a T/R switch is high and painful from the RF performance point of view. RF lineup and antenna feeding network (for both single and dual polarization) are shown for square patch antenna in FIGS. 452A and 452B. However, this can be applicable to other types and shapes of antenna implementations.

FIG. 452A illustrates a patch antenna and RF feed line connection including a transmit/receive (TR) switch for a single polarization design, according to some aspects of the present disclosure. In FIG. 452A, patch antenna 45201 has feed line 45203 connected at a match point 45205, discussed in additional detail below. Antenna 45207 is the same as patch antenna 45201, feed line 45203, in a transceiver is attached to T/R switch 45209. PA 45211 and LNA 45213 are each connected to T/R switch 45209 as illustrated and the T/R switch is switched for transmit and receive modes.

FIG. 452B illustrates a patch antenna and RF feed line connection including a transmit/receive (TR) switch for a dual polarization design, according to some aspects of the present disclosure. In FIG. 452B, patch antenna 45215 has horizontal polarization feed line feed line 45217 connected at a match point 45219. Vertical polarization feed line 45224 is connected at match point 45223. Antenna 45225 is the same as patch antenna 45215. For horizontal polarization, horizontal polarization feed line 45217, in a transceiver, is attached to T/R switch 45227. PA 45229 and LNA 45231 are each connected to T/R switch 45227 as illustrated and the T/R switch is switched for transmit and receive modes for horizontally polarized signals. For vertical polarization, vertical polarization feed line 45224, in a transceiver, is attached to T/R switch 45235. PA 45237 and LNA 45239 are each connected to T/R switch 45235 as illustrated and the T/R switch is switched for transmit and receive modes for vertically polarized signals.

However, the T/R switch can be removed in some aspects of the present disclosure because of the feed line characteristics of patch antennas.

With patch antennas, there can be one antenna feed line matching point that is slightly offset to one side when compared to a second antenna feed line matching point. This is seen in FIG. 452C. FIG. 452C illustrates a patch antenna 45204 in a single polarization design, with the antenna feed line for the RX feed line matching point slightly offset to one side as compared to the TX feed line matching point, according to some aspects of the present disclosure. In other words, in FIG. 452C, the RX matched feed point is closer to the edge of the antenna than is the TX feed point. The reason for this is that the impedance of a connection point of a feed line is determined by the point on the patch antenna where the connection is made, with lower connection impedance being closer to the center of the patch antenna and higher connection impedance being closer to the edge of the patch antenna. For transmit and receive operation, both a TX feed line and an RX feed line are attached to the patch antenna.

In some aspects of the present disclosure, a PA is attached to the transmitter side of the TX feed line. A PA operates at a very low impedance so the TX feed line matching point will be relatively close to the center of the patch antenna, as seen in FIG. 452C, to meet the low impedance matching requirements of the PA. An LNA is attached to the RX side of the RX feed line. An LNA operates at a high impedance so the TX feed line matching point will be relatively close to the edge of the patch antenna, also as seen in FIG. 452C. These two matching points, one near the center of the patch antenna and one near the edge of the patch antenna, results in the offset between the two matching points.

This offset in matching points is also exhibited for a dual polarization design as seen in FIG. 452D. FIG. 452D illustrates a patch antenna 45206 in a dual polarization design, with the antenna feed lines for the RX feed line matching point slightly offset to one side as compared to the TX feed line matching point, for both polarizations, according to some aspects of the present disclosure. In other words, in FIG. 452D there are two sets of offset matching points, one for horizontal polarization operation and one for vertical polarization operation.

The above feed line matching point characteristic for a patch antenna enables the TX chain to be directly connected to the TX feed line matching point of the patch antenna and the RX chain to be directly connected to the RX feed line matching point of the patch antenna. Thus, the benefit for a T/R switch and the associated insertion loss to be included in the RF lineup is reduced. This in turn can significantly improve the RF performance from the TX output power/efficiency and RX noise figure (NF) points of view. The foregoing can be seen in FIGS. 453A and 453B. The 180-degree phase inversion between TX and RX associated with the feed lines coming from opposite directions, can be overcome at the system level.

FIG. 453A illustrates a single polarization implementation of a TX feed line and an RX feed line connected directly to a patch antenna feed line matching points, according to some aspects of the present disclosure. In FIG. 453A, patch antenna 45301 has RX feed line 45307 connected to RX feed line matching point 45309 and TX feed line 45303 connected directly to TX feed line matching point 45305. Patch antenna 45311, which is the same or similar to patch antenna 45301 is connected directly to PA 45313 via TX feed line 45303 and directly to LNA 45315 via RX feed line 45307, without the need for a T/R switch.

FIG. 453B illustrates a dual polarization implementation by way of a horizontal polarization TX feed line and horizontal RX feed line, and a vertical polarization TX feed line and vertical RX feed line, connected directly to a patch antenna feed line matching points without a T/R switch, according to some aspects of the present disclosure. FIG. 453B is similar to FIG. 453A except that there are both a horizontal polarization TX feed line 45327 and horizontal polarization RX feed line 45331, and a vertical polarization TX feed line 45319 and vertical polarization RX feed line 45323 connected to their respective feed line matching points 45329, 45333 and 45321, 45325. In this aspect, patch antenna 45335 is directly connected to PA 45337 by way of horizontal polarization TX feed line 45327 and directly connected to LNA 45339 by way of horizontal polarization RX feed line 45331, without a T/R switch. Similarly, patch antenna 45335 can be directly connected to PA 45343 by way of vertical polarization TX feed line 45319 and directly connected to LNA 45345 by way of vertical polarization RX feed line 45323, without a T/R switch.

The direct connections illustrated in FIGS. 453A and 453B allow operation in a half-duplex mode, without T/R switches, where the TX and RX are operating at different times.

FIG. 454A illustrates an IC shield, according to some aspects of the present disclosure. IC Shield 45400 comprises two metal parts, the so-called "fence" 45401 which is soldered or otherwise affixed to a PCB and within which integrated and discrete circuitry may be situated, for example within the illustrated cut-outs in fence 45401; and the lid 45403 which is attached to the fence, in some aspects of the present disclosure by pressing it on top of the fence 45401. The two-piece IC shield technique allows the option to improve antenna gain by serving as a reflector to an antenna, or array of antennas, situated adjacent to the shield as discussed below.

In some aspects of the present disclosure, the gain can be further improved by allowing part of the fence 45401 to bulge out, or extend, through a space in the lid 45403. FIG. 454B illustrates an IC shield with a bulge, or extension, of the fence at 45405, through the illustrated space in the lid 45403 to enhance antenna gain and directivity, according to some aspects of the present disclosure. In some aspects of the present disclosure, the lid itself might be made into an extension, although if a non-soldered lid is used it might deform, for example by the aspect falling and hitting the floor, or when handled by hand.

Returning to the discussion of FIG. 454B, the bulge may be folded or unfolded. The fold in the bulge, or extension, is primarily to provide mechanical stability. FIG. 454B shows a part of the floor plan of a user device, including coaxial connector 43915, originally seen in FIG. 439, which takes up much of the limited space for antenna arrays as discussed above. Adjacent to, and very close to, the shield in FIG. 454B is an antenna array which includes stacked patch antennas 45407A and 45409A, and dipole antenna elements 45407B and 45409B, and may include directors 45407C, 45409C and 45407D, 45409D.

In some aspects of the present disclosure the distance between dipole 45407B and director 45407C is 340 microns. The distance from dipole 45409B to the edge of the copper layers 45410 may be 780 microns. The distance from dipole to lid 45403 may be 2 millimeters. In some aspects of the present disclosure the distance between directors 45407C and 45407D is similarly 340 microns. The array may be fed as discussed above for patch and dipole aspects. Gain in the endfire direction (normal to the directors) that is attributed to the bulge has been measured at approximately 1 dBi.

FIG. 454C illustrates the use of a folded extension 45405 of the fence through the IC shield cover 45403 to improve the gain of an array of dipole antenna elements, 45411, 45413, 45415, 45417, according to some aspects of the present disclosure. The illustrated array is a 1×4 dipole array constructed within the PCB as discussed above. In some aspects of the present disclosure, the PCB may be made of Bismaleimide-Triazine (BT) epoxy. In the aspect of FIG. 454C, gain in the endfire direction (normal to the dipole arms) due to the bulge has been measured at approximately 0.5 dBi.

FIG. 454D illustrates a hole 45419 that is formed in the shield structure because of the bulge, according to some aspects of the present disclosure. Also seen is a part of the fence 45421 internal to the lid 45403. In some aspects of the present disclosure, the bulge is not hermetically closed. Therefore, a hole such as that at 45419 can be formed in the structure 45406 and there can therefore be RF leakage.

Consequently, care may be taken when implementing the bulge 45405 to fold or otherwise situate the metal in such a way as to make hole 45419 as small as possible to minimize such leakage.

FIG. 454E is a close-up perspective view of the bulge and the hole of FIG. 454D, according to some aspects of the present disclosure. The combination 45408 of lid 45403 and fence 45421 illustrates the bulge 5405 and the hole 45419 more clearly.

FIG. 455 is a top view of a combined patch antenna and dipole antenna array with a shield reflector, according to some aspects of the present disclosure. Illustrated at 45500 is an array including patch antennas 45503, 45505, 45507, and dipole antennas 45509 and 45511 that supports dual polarization diversity to the endfire direction (normal to the dipole arms).

In some aspects of the present disclosure, the patch antennas 45503, 45505, 45507 can be dual patches as discussed below with respect to FIG. 456. IC shield lid 45501 and IC shield fence bulge 45501A provide a reflector and ground for the antenna array. A plurality of holes illustrated at 45513 in FIG. 455 are placed between the patches and are typical on each side of both dipole antennas of the array.

In some aspects of the present disclosure, the holes clear the coupling between the ground provided by shield 45501 and the dipoles 45509, 45511, inasmuch as if ground is very close to the dipole the impedance matching will be degraded and will negatively impact effectiveness of the dipole. The dipole radiation efficiency can be degraded and not reflect the radiation appropriately if a metal is close to the antenna. To achieve reflection without substantially degraded antenna performance, the metal should be away from the radiator, in some aspects of the present disclosure by approximately a quarter wave length. The patch modes are between the patch and ground below the patch and may not require a large ground to be effective. Since the ground is finite there is diffraction, but the losses are minor. Ground clearance for the dipoles to the ground 45513 is such that the holes allow the dipole to be closer to the patches, thereby making the structure more compact. When looking in the endfire direction, the dipole has horizontal polarization and the patch antennas have vertical polarization, each patch antenna functioning as a monopolar element.

FIG. 456 is a side view of the antenna array of FIG. 455, according to some aspects of the present disclosure. The coordinate system for the array is seen adjacent shield 45501 with the Y coordinate actually proceeding out of the page. The patches and dipoles are in the PCB as indicated. One of the three patch antennas 45503, 45503A is illustrated in side view, the others being typical, and comprises a dual patch antenna wherein patch 45503A is a parasitic antenna and patch 45503B is a driven patch energized via feed line 45601 by use, in one aspect, of a via hole. Dipole antenna 45509 is seen in side view, being fed by feed line 45603, which may be a ground layer and also part of the dipole. The dipole is constructed from two layers, one arm is part of the ground 45603, and the second is from layer 45509 which excited from that layer. Those of ordinary skill in the art will recognize that the number of each type of antenna has been described for example only, and that differing numbers, or pluralities, of such antennas may be appropriate for additional aspects. Similarly, other dimensions than the described dimensions may find use in other aspects, depending on space available in the device in which the antenna arrays find use, as may be shown by simulation or other methods.

FIG. 457 is a perspective view of an interposer used with a patch array to bypass large obstacles in a user device, according to some aspects of the present disclosure. The material that comprises the interposer may be PCB laminate or other insulating material. Inasmuch as the patches already have ground in the RF sub-system, the interposer material does not have a large effect on the antenna. The interposer may be secured to the PCB by solder with pads, such as LGA pads. In some aspects of the present disclosure, the IF would be routed from the mother board to the RF sub-system for processing and ultimate feeding to the patch antenna array for transmission.

In FIG. 457, a partial floorplan 54700 of a user device can include a PCB mother board which may be a low temperature co-fired ceramic (LTCC) in some aspects of the present disclosure. Item 45703 may be part of a laptop or other device chassis and may be made of magnesium in some aspects of the present disclosure. USB connector is seen at 45705, and obstructs effective antenna operation.

In order to bypass the obstruction, an interposer 45707 with a patch antenna array 45709 with a reflector shield 45710, situated on top of the interposer may be used. The reflector shield may be part of an IC shield such as those described above in this patent. The entire IC shield and the IC itself is not shown due to space considerations but would be situated as discussed above, or as discussed below with respect to FIG. 461A. The interposer 45707 is intended to provide height and raise the entire RFEM so it contains GND vias and also IF signal vias for connection to ground and for feeding the antenna array, as needed.

FIG. 458A is a perspective view of an interposer illustrating an IC shield lid 45801, according to some aspects of the present disclosure. In FIG. 458A, an array of dipole antennas 45809 and a reflector 45810 are situated on an interposer, similar to the patch antenna array 45709 and reflector 45710 in FIG. 457. Item 45809A may be a patch antenna array with reflectors 45812, in some aspects of the present disclosure.

Endfire direction of the array and reflector is illustrated.

FIG. 458B is a vertical view of the radiation pattern for the dipole antenna array of FIG. 458A, with the endfire direction illustrated at minus ninety (−90) degrees, according to some aspects of the present disclosure. The Broadside direction is indicated at zero (θ) degrees. As can be seen, coverage is strong in the broadside direction in FIG. 458B. However, the interposer has enabled a certain amount of dipole array radiation in the endfire direction illustrated in FIG. 458B. There are several patterns illustrated in FIG. 458B, each pattern for a different height of the interposer. As can be seen from FIG. 458B, when a dipole array is placed on the interposer the radiation to the endfire is degraded, with low gain and small beamwidth at all illustrated interposer heights. For this the reason, placing a patch array on the interposer would be preferable FIG. 459 illustrates realized gain of the patch antenna array of FIG. 458A as a function of the height of the interposer, in various directions, according to some aspects of the present disclosure. The three curves 45901, 45903, and 45905 illustrate realized gain as a functioning of height of the interposer in the endfire direction, 5 degrees above endfire and 10 degrees above endfire, respectively.

FIG. 460A illustrates a combined patch and slot antenna for dual band, dual polarization operation, according to some aspects of the present disclosure. In FIG. 460A, antenna 46000 illustrates dual patch antennas 46001, 46002 that form a first antenna, and rectangular slot antenna 46003 that forms a second antenna. Each antenna is fed by two feed mechanisms, each of which is orthogonal to the other for dual polarization.

For example, slot antenna 46003 is fed by feed lines 46005 and 46007, each orthogonal to the other. Items 46005A and 46005B are ground vias to reference the feed line 46005, with similar ground vias to reference feed line 46007. Patch antennas 46001, 46002 include a parasitic antenna element 46001 and a driven antenna element 46002. The driven antenna 46002 is fed, in the aspect illustrated, by via, such as at 46013, 46015 of FIG. 460B. The via 46013 may be coupled to a feed line such as 46011 also shown in FIG. 460B. Line 46011 may be fed by an integrated circuit (IC) of a user device (the IC not shown). Via 46015 may similarly be coupled to a feed line which may be orthogonal to feed line 46011 and likewise fed by the IC. Slot antenna 46003 may be fed, in the aspect illustrated, by proximity coupling or by any appropriate feed mechanism, such as by micro strip lines.

Proximity coupling is illustrated in FIG. 460B and described below. FIG. 460B is a side view of the combined patch antenna and slot antenna of FIG. 460A, according to some aspects of the present disclosure. From a side view, FIG. 460B illustrates slot antenna 46003 and one of the two feed mechanisms of slot antenna 46003, such as feed line 46007 which, in some aspects of the present disclosure, may be a micro strip feed line, metal traces, or other types of transmission lines. Micro strip feed line 46007 is illustrated as being within PCB and at a certain distance from the bottom of slot antenna 46003, and drives slot antenna 46003 by proximity coupling, enabling energy to be coupled from feed lines 46005, 46007 to slot antenna 46003. Lines 46005, 46007 may be coupled for feed signal purposes to the integrated circuitry of the user device (not shown) to slot antenna 46003. Micro strip feed line 46005 is situated orthogonal to feed line 46007. While the feed line has been described as a micro strip, it could be any suitable transmission line such as stripline, traces, and the like.

In some aspects of the present disclosure, the feed lines include dual band feed lines, such as feed line 46005 in a band that includes 30 GHz and feed line 46007 in a band that includes 60 GHz. The feed lines may also be at the 39 GHz band or the 73 GHz band, or other appropriate band, with feed line 46005 being at a frequency within the band and feedline 46007 being at twice that frequency.

In some aspects of the present disclosure, the patch antenna 46001, 46002 operates at one frequency and the slot antenna 46003 operates at a second frequency, the frequency of each antenna being dependent on the size of the antenna. In other words, the patch antenna and the slot antenna can be made to operate at different frequencies by designing the antenna dimensions to operate at the desired frequency. In some aspects of the present disclosure, each antenna operates at a different time, so that signals of the appropriate polarization can be transmitted at the appropriate time, depending on feedback from the receiving device that indicates which polarization is the better polarization at a given time.

As mentioned above, in some aspects of the present disclosure, patch antenna 46001 is a parasitic antenna element and 46002 is a driven antenna element. As seen in FIG. 460B, the ground of driven antenna 46002 is "floating" in that it is fed by way of via holes 46013 and 46015 (only via 46015 being visible in FIG. 460A), each via being in a given band discussed above and each associated with feed line 46007 and 46005, respectively, for proximity coupling for feeding the driven element 46002. Such feed line may include a via connected to the driven element. The inner part of the slot element is rectangular metal which may acts as ground GND for the patch element, given that it may be made large enough for that purpose and the antennas operate at different times.

The feed of the patch antennas and of the slot antennas being orthogonal supports polarization with spatial diversity. For example, for radiation in the X direction, excitation would be by way of a first feed line and for radiation in the Y direction, excitation would be by way of a second feed line that is orthogonal to the first feed line. For broadside radiation, each antenna can operate with dual polarization in the broadside (Z in FIG. 460B) direction. Each antenna can be algorithmically controlled to operate at a given time and at a given polarization, the polarization dependent on which feed line is activated at that given time, and that activation is dependent on the orientation of the receiving device, which is feeding back to the transmitter information that designates which polarization provides the better reception at that given time. For end-fire radiation, each antenna may operate with only one polarization, the polarization dependent on whether excitation is from the X-direction (46013 in FIG. 460B) or the Y direction (46015 in FIG. 460B), generally with lower gain than for broadside radiation. Additionally, for end-fire radiation each antenna may also operate with dual polarization if each antenna element is excited with two orthogonal feeds, but with much lower gain than for single polarization operation. While a single parasitic element has been described, those of ordinary skill in the art will recognize that a plurality of such parasitic elements, or in some aspects of the present disclosure, one or more directors, may be used as appropriate for a given aspect. Similarly, while a square slot antenna has been described, other configurations of slot antennas may also be used in various aspects.

An antenna, or an array of antennas, may be extracted in the silicon circuitry, or chip, in a layer of a circuit board which in some aspects of the present disclosure is an ultra-thick metal (UTM). UTM is known to have one of the lowest losses for circuit board material. FIG. 461A is an exploded view of an antenna-on-a-chip (AOC), according to some aspects of the present disclosure. AOC 46100 comprises PCB 46111 which may also be BT laminate board, and silicon circuitry 46103 which may include a transceiver for providing radio frequency (RF) signals. The AOC includes antennas 46105 which can comprise a 2×2 patch antenna array in some aspects of the present disclosure (one of the patch antennas being designated as 46105, but the other three are typical as illustrated), and may include IC metal shield 46101. While the aspect under discussion includes an array that comprises four patch antenna elements, aspects are not limited to patch antennas. Those of ordinary skill in the art will recognize that other antenna elements such as slot antennas or notch antenna, the frequency of operation of the antenna array may be in the mmWave bands and in frequency ranges that would support some or all of the WiGig frequency bands. The PCB board 46111 has metal clearance 46113 below the antenna array. Clearance 46113 prevents shorting out of the antenna array. Because the antenna radiation is through or via the circuit boards the clearance 46113 and also functions to enable antenna array radiation to be transmitted outside the board.

FIG. 461B is a bottom view of the antennas 46105 that comprise the AOC of FIG. 461A, according to some aspects of the present disclosure. Transformers 46107 comprise transformers used in the silicon circuitry, such as for conjugate matching, and other electronic functions. Traces may be placed at 46109 and may be used for routing between and among the patches 46105, including feeds for the patches, the feeds may be coupled to a transceiver within the silicon circuitry and may include small microstrip lines coupled to a power amplifier (PA) and a low noise amplifier (LNA) switch.

FIG. 461C is a side view of the AOC of FIG. 461A and illustrates the IC shield 46101, silicon circuitry 46103, and PCB board 46111. The patches can be implemented at the bottom of the silicon 46103, and the IC shield 46101 can be used as ground. FIG. 462 illustrates dimensions of the patch array that comprises four patch antennas one of which one is delineated as 46105 in FIG. 462. The patches themselves may be 1 millimeter square. FIG. 463 is a simulated radiation pattern for the AOC of FIGS. 461A-461C and 462, according to some aspects of the present disclosure. Pattern 46301 illustrates the E-plane and pattern 46303 represents the H-plane.

FIG. 464A illustrates another side view of an AOC for an embedded die in a package-on-package implementation, according to some aspects of the present disclosure. PCB 46401 includes silicon 46405 and ground 46403. When ground 46403 is provided, there is no need for an IC shield such as 46103 in FIG. 461C to be used as ground. Connection between the antennas in the silicon 46405 and ground 46403 is made by 50-ohm connection 46407, sometimes referred to as a bump. Connection 46407 may comprise a via that goes from silicon to GND and it is being used here as part of the feed mechanism. In practice there may be many vias that connect the IC to the GND.

FIG. 464B is an illustration of radiation efficiency as a function of height of the silicon divided by height of the patches, according to some aspects of the present disclosure. Stated another way, the height of IC is the silicon thickness and the patch height is the antenna size thickness from GND to the radiated patch. For an aspect where the ground is 60 microns above the die in FIG. 464A, the realized gain was 0.46 dBi. FIG. 464C is an illustration of realized gain in dBi as a function of height of the silicon divided by height of the patches, according to some aspects of the present disclosure.

FIG. 465 is another illustration of AOC symbolically showing a chip overview and including the relationship of the antennas and the circuitry on the chip, according to some aspects of the present disclosure. Chip overview 46500 illustrates a silicon chip with four AOC elements, one of which is indicated at 46501. On chip circuitry is indicated by a series of triangles, one of which is indicated at 46503. This circuitry may include an RFEM (or RFIC), comprising usual radio circuitry that comprises a transceiver, including but not limited to power amplifiers and low noise amplifiers. On-chip connectors are illustrated by straight lines, such as 46505 and may including usual circuitry connections and connections to the AOC.

AOC provides substantial cost savings because a simple board can be used for implementation. In one aspect, the product that includes the AOC can be sold as the shielded silicon circuitry including the AOC, without a board, and an OEM that purchases the product can solder the product directly to the mother board. Alternatively, the AOC can be installed with its own PCB together with an IF or RF cable such that it could be placed anywhere in the platform. In that case the benefit of the AOC is that it will simplify the PCB compared with the regular antenna on board. Alternatively, the AOC product can be marketed already installed on the motherboard. This is cost effective because there is no need for a package inasmuch as the location of the AOC is limited to the motherboard area. In other words, there would be no package, which would be a substantial savings.

The AOC provides an improved conducted power and noise figure inasmuch as there is no requirement for board routing and solder ball transition degradation. Generally, the patch size can be reduced by fifty percent (50%) compared to board patches. AOC supports wide band matching, perhaps as much as a 304 GHz bandwidth, which can enable supporting more than four channels. The described AOC can be implemented with embedded die/package-on-package (POP) solutions. POP is a technique that combines two PCB's. A main PCB which contains the die (sometimes referred to as a "simple PCB") and another PCB with a cavity filled with metal which behaves as shield and also allows signals and the antenna array to be placed on top of the shield. Further, because the AOC does not require traces to an external antenna, the antennas will have no, or very few, losses due to such traces.

FIG. 466 illustrates a block diagram of an example machine 46600 upon which any one or more of the techniques or methodologies discussed herein may be performed, according to some aspects of the present disclosure. In alternative aspects, the machine 46600 may operate as a standalone device or may be connected (e.g., networked) to other machines. In a networked deployment, the machine 46600 may operate in the capacity of a server machine, a client machine, or both in server-client network environments. In an example, the machine 46600 may act as a peer machine in peer-to-peer (P2P) (or other distributed) network environment. The machine 46600 may be a UE, eNodeB, AP, STA, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, sub-systems, or mechanisms. Sub-systems are tangible entities (e.g., hardware) capable of performing specified operations and may be configured or arranged in a certain manner. In an example, circuits may be arranged (e.g., internally or with respect to external entities such as other circuits) in a specified manner as a sub-system. In an example, the whole or part of one or more computer systems (e.g., a standalone, client or server computer system) or one or more hardware processors may be configured by firmware or software (e.g., instructions, an application portion, or an application) as a sub-system that operates to perform specified operations. In an example, the software may reside on a machine readable medium. In an example, the software, when executed by the underlying hardware of the sub-system, causes the hardware to perform the specified operations.

Accordingly, the term "sub-system" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which sub-systems are temporarily configured, each of the sub-systems need not be instantiated at any one moment in time. For example, where the sub-systems comprise a general-purpose hardware processor configured using software, the general-purpose hardware processor may be configured as respective different sub-systems at different times. Software may accordingly configure a hardware processor, for example, to constitute a particular sub-system at one instance of time and to constitute a different sub-system at a different instance of time.

Machine (e.g., computer system) may include a hardware processor 46602 (e.g., a central processing unit (CPU), a graphics processing unit (GPU), a hardware processor core, or any combination thereof), a main memory 46604 and a static memory 46606, some or all of which may communicate with each other via an interlink (e.g., bus) 46608. The machine 46600 may further include a display unit 46610, an alphanumeric input device 46612 (e.g., a keyboard), and a user interface (UI) navigation device 46614 (e.g., a mouse). In an example, the display unit 46610, input device 46612 and UI navigation device 46614 may be a touch screen display. The machine 46600 may additionally include a storage device (e.g., drive unit) 46616, a signal generation device 46618 (e.g., a speaker), a network interface device 46620, and one or more sensors, such as a global positioning system (GPS) sensor, compass, accelerometer, or other sensor. The machine 46600 may include an output controller 46628, such as a serial (e.g., universal serial bus (USB), parallel, or other wired or wireless (e.g., infrared (IR), near field communication (NFC), and the like.) connection to communicate or control one or more peripheral devices (e.g., a printer, card reader, and the like).

The storage device 46616 may include a machine readable medium 46622 on which is stored one or more sets of data structures or instructions 46624 (e.g., software) embodying or utilized by any one or more of the techniques or functions described herein. The instructions 46624 may also reside, completely or at least partially, within the main memory 46604, within static memory 46606, or within the hardware processor 46602 during execution thereof by the machine. In an example, one or any combination of the hardware processor 46602, the main memory 46604, the static memory 46606, or the storage device 46616 may constitute machine readable media.

While the machine readable medium 46622 is illustrated as a single medium, the term "machine readable medium" may include a single medium or multiple media (e.g., a centralized or distributed database, and/or associated caches and servers) configured to store the one or more instructions 46624.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 46624 may further be transmitted or received over a communications network 46626 using a transmission medium via the network interface device 46620 utilizing any one of a number of transfer protocols (e.g., frame relay, internet protocol (IP), transmission control protocol (TCP), user datagram protocol (UDP), hypertext transfer protocol (HTTP), and the like). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 46620 may include one or more physical jacks (e.g., Ethernet, coaxial, or phone jacks) or one or more antennas to connect to the communications network 46626. In an example, the network interface device 46620 may include a plurality of antennas to wirelessly communicate using at least one of single-input multiple-output (SIMO), multiple-input multiple-output (MIMO), or multiple-input single-output (MISO) techniques. In some examples, the network interface device 46620 may wirelessly communicate using Multiple User MIMO techniques. The term "transmission medium" shall be taken to include any intangible medium that is capable of storing, encoding or carrying instructions for execution by the machine, and includes digital or analog communications signals or other intangible medium to facilitate communication of such software.

FIG. 467 illustrates protocol functions that may be implemented in a wireless communication device, according to some aspects of the present disclosure. In some aspects, protocol layers may include one or more of physical layer (PHY) 46710, medium access control layer (MAC) 46720, radio link control layer (RLC) 46730, packet data convergence protocol layer (PDCP) 46740, service data adaptation protocol (SDAP) layer 46747, radio resource control layer (RRC) 46755, and non-access stratum (NAS) layer 46757, in addition to other higher layer functions not illustrated.

According to some aspects, protocol layers may include one or more service access points that may provide communication between two or more protocol layers.

According to some aspects, PHY 46710 may transmit and receive physical layer signals 46705 that may be received or transmitted respectively by one or more other communication devices. According to some aspects, physical layer signals 46705 may comprise one or more physical channels.

According to some aspects, an instance of PHY 46710 may process requests from and provide indications to an instance of MAC 46720 via one or more physical layer service access points (PHY-SAP) 46715. According to some aspects, requests and indications communicated via PHY-SAP 46715 may comprise one or more transport channels.

According to some aspects, an instance of MAC 46710 may process requests from and provide indications to an instance of RLC 46730 via one or more medium access control service access points (MAC-SAP) 46725. According to some aspects, requests and indications communicated via MAC-SAP 46725 may comprise one or more logical channels.

According to some aspects, an instance of RLC 46730 may process requests from and provide indications to an instance of PDCP 46740 via one or more radio link control service access points (RLC-SAP) 46735. According to some aspects, requests and indications communicated via RLC-SAP 46735 may comprise one or more RLC channels.

According to some aspects, an instance of PDCP 46740 may process requests from and provide indications to one or more of an instance of RRC 46755 and one or more instances of SDAP 46747 via one or more packet data convergence protocol service access points (PDCP-SAP) 46745. According to some aspects, requests and indications communicated via PDCP-SAP 46745 may comprise one or more radio bearers.

According to some aspects, an instance of SDAP 46747 may process requests from and provide indications to one or more higher layer protocol entities via one or more service data adaptation protocol service access points (SDAP-SAP) 46749. According to some aspects, requests and indications communicated via SDAP-SAP 46749 may comprise one or more quality of service (QoS) flows.

According to some aspects, RRC entity 46755 may configure, via one or more management service access points (M-SAP), aspects of one or more protocol layers, which may include one or more instances of PHY 46710, MAC 46720, RLC 46730, PDCP 46740 and SDAP 46747. According to some aspects, an instance of RRC 46755 may process requests from and provide indications to one or more NAS entities via one or more RRC service access points (RRC-SAP) 46756.

FIG. 468 illustrates various protocol entities that may be implemented in connection with a wireless communication device or a wireless communication system, according to some aspects of the present disclosure. More specifically, FIG. 468 is an illustration of protocol entities that may be implemented in wireless communication devices, including one or more of a user equipment (UE) 46860, a base station, which may be termed an evolved node B (eNB), or new radio node B (gNB) 46880, and a network function, which may be termed a mobility management entity (MME), or an access and mobility management function (AMF) 46894, according to some aspects.

According to some aspects, gNB 46880 may be implemented as one or more of a dedicated physical device such as a macro-cell, a femto-cell or other suitable device, or in an alternative aspect, may be implemented as one or more software entities running on server computers as part of a virtual network termed a cloud radio access network (CRAN).

According to some aspects, one or more protocol entities that may be implemented in one or more of UE 46860, gNB 46880 and AMF 46894, may be described as implementing all or part of a protocol stack in which the layers are considered to be ordered from lowest to highest in the order PHY, MAC, RLC, PDCP, RRC and NAS. According to some aspects, one or more protocol entities that may be implemented in one or more of UE 46860, gNB 46880 and AMF 46894, may communicate with a respective peer protocol entity that may be implemented on another device, using the services of respective lower layer protocol entities to perform such communication.

According to some aspects, UE PHY 46872 and peer entity gNB PHY 46890 may communicate using signals transmitted and received via a wireless medium. According to some aspects, UE MAC 46870 and peer entity gNB MAC 46888 may communicate using the services provided respectively by UE PHY 46872 and gNB PHY 46890. According to some aspects, UE RLC 46868 and peer entity gNB RLC 46886 may communicate using the services provided respectively by UE MAC 46870 and gNB MAC 46888. According to some aspects, UE PDCP 46866 and peer entity gNB PDCP 46884 may communicate using the services provided respectively by UE RLC 46868 and 5GNB RLC 46886. According to some aspects, UE RRC 46864 and gNB RRC 46882 may communicate using the services provided respectively by UE PDCP 46866 and gNB PDCP 46884. According to some aspects, UE NAS 46862 and AMF NAS 46892 may communicate using the services provided respectively by UE RRC 46864 and gNB RRC 46882.

A MAC entity 46900 that may be used to implement medium access control layer functions according to an aspect is illustrated in FIG. 469.

According to some aspects, MAC entity 46900 may include one or more of a controller 46905, a logical channel prioritizing unit 46910, a channel multiplexer and de-multiplexer 46915, a PDU filter unit 46915, random access protocol entity 46920, data hybrid automatic repeat request protocol (HARQ) entity 46925 and broadcast HARQ entity 46930.

According to some aspects, a higher layer may exchange control and status messages 46935 with controller 46905 via management service access point 46940. According to some aspects, MAC service data units (SDU) corresponding to one or more logical channels 46945, 46955, 46965 and 46975 may be exchanged with MAC entity 46900 via one or more service access points (SAP) 46950, 46960, 46970 and 46980. According to some aspects, PHY service data units (SDU) corresponding to one or more transport channels 46985, 46995, 469105 and 469115 may be exchanged with a physical layer entity via one or more service access points (SAP) 46990, 469100, 469110 and 469120.

According to some aspects, logical channel prioritization unit 46910 may perform prioritization amongst one or more logical channels 46945 and 46955, which may include storing parameters and state information corresponding to each of the one or more logical channels that may be initialized when a logical channel is established. According to some aspects, logical channel prioritization unit 46910 may be configured with a set of parameters for each of one or more logical channels 46945 and 46955, the each set including parameters which may include one or more of a prioritized bit rate (PBR) and a bucket size duration (BSD).

According to some aspects, multiplexer and de-multiplexer 46915 may generate MAC PDUs, which may include one or more of MAC-SDUs or partial MAC-SDUs corresponding to one or more logical channels, a MAC header which may include one or more MAC sub-headers, one or more MAC control elements, and padding data. According to some aspects, multiplexer and de-multiplexer 46915 may separate one or more MAC-SDUs or partial MAC-SDUs contained in a received MAC PDU, corresponding to one or more logical channels 46945 and 46955, and may indicate the one or more MAC-SDUs or partial MAC-SDUs to a higher layer via one or more service access points 46950 and 46960.

According to some aspects, HARQ entity 46925 and broadcast HARQ entity 46930 may include one or more parallel HARQ processes, each of which may be associated with a HARQ identifier, and which may be one of a receive or transmit HARQ process.

According to some aspects, a transmit HARQ process may generate a transport block (TB) to be encoded by the PHY according to a specified redundancy version (RV), by selecting a MAC-PDU for transmission. According to some aspects, a transmit HARQ process that is included in a broadcast HARQ entity 46930 may retransmit a same TB in successive transmit intervals a predetermined number of times. According to some aspects, a transmit HARQ process included in a HARQ entity 46925 may determine whether to retransmit a previously transmitted TB or to transmit a new TB at a transmit time based on whether a positive acknowledgement or a negative acknowledgement was received for a previous transmission.

According to some aspects, a receive HARQ process may be provided with encoded data corresponding to one or more received TBs and which may be associated with one or more of a new data indication (NDI) and a redundancy version (RV), and the receive HARQ process may determine whether each such received encoded data block corresponds to a retransmission of a previously received TB or a not previously received TB. According to some aspects, a receive HARQ process may include a buffer, which may be implemented as a memory or other suitable storage device, and may be used to store data based on previously received data for a TB. According to some aspects, a receive HARQ process may attempt to decode a TB, the decoding based on received data for the TB, and which may be additionally be based on the stored data based on previously received data for the TB.

The formats of PDUs that may be encoded and decoded by MAC entity 46900 according to some aspects are illustrated in FIG. 470A.

According to some aspects, a MAC PDU 47000 may consist of a MAC header 47005 and a MAC payload 47010, the MAC payload consisting of zero or more MAC control elements 47030, zero or more MAC SDU portions 47035 and zero or one padding portion 47040. According to some aspects, MAC header 47005 may consist of one or more MAC sub-headers, each of which may correspond to a MAC payload portion and appear in corresponding order. According to some aspects, each of the zero or more MAC control elements 47030 contained in MAC payload 47010 may correspond to a fixed length sub-header 47015 contained in MAC header 47005. According to some aspects, each of the zero or more MAC SDU portions 47035 contained in MAC payload 47010 may correspond to a variable length sub-header 47020 contained in MAC header 47005. According to some aspects, padding portion 47040 contained in MAC payload 47010 may correspond to a padding sub-header 47025 contained in MAC header 47005.

The formats of PDUs that may be encoded and decoded by MAC entity 469100 according to some alternative aspects are illustrated in FIG. 470B.

According to some aspects, a MAC PDU 47000 may consist of one or more concatenated MAC Sub-PDUs 47045 which may be followed by padding 47040. According to some aspects, each MAC Sub-PDU 47045 may contain a sub-header and one of a fixed length control element, a variable length control element and a MAC SDU. According to some aspects, a MAC Sub-PDU 47045 containing a fixed length control element may also contain a fixed length sub-header 47015. According to some aspects, a MAC Sub-PDU 47045 containing a variable length control element may also contain a variable length sub-header 47020. According to some aspects, a MAC Sub-PDU 47045 containing a MAC SDU may also contain a variable length sub-header 47020.

Aspects of a fixed length MAC sub-header 47015 that may be contained in MAC header 47005 are illustrated in FIG. 470C.

Aspects of a variable length MAC sub-header 47020 that may be contained in MAC header 47005 are illustrated in FIG. 470D.

Aspects of a padding sub-header 47025 that may be contained in MAC header 47005 are illustrated in FIG. 470E.

According to some aspects, a fixed length sub-header 47015 may contain one or more of reserved bits 47065, an extension bit 47070 and a logical channel identifier (LCID) field 47075.

According to some aspects, a variable length sub-header 47020 may contain one or more of reserved bits 47065, an extension bit 47070, an LCID field 47075, a format field 47085 and a length field 47090.

According to some aspects, padding sub-header 47025 may contain one or more of reserved bits 47065, an extension bit 47070 and a logical channel identifier (LCID) field 47075.

According to some aspects, reserved bits 47065 may be set to zero. According to some aspects, extension bit 47070 may be set to a value that indicates whether the MAC sub-header is followed by one or more additional MAC sub-headers. According to some aspects, LCID 47075 may contain a value which indicates one of a type of a corresponding MAC control element 47030, a logical channel identifier of a corresponding MAC SDU portion 47035, or a padding type. According to some aspects, a format field 47085 may indicate a number of bits of a length field 47090.

According to some aspects, length field 47090 may contain a value which indicates a length of a corresponding MAC SDU portion 47035.

Aspects of functions contained within a radio link control (RLC) layer entity 47100 are illustrated in FIG. 471.

According to some aspects, RLC layer entity 47100 may contain zero or more of each of a transparent mode (TM) transmit entity 47110, a TM receive entity 47115, an unacknowledged mode (UM) transmit entity 47120, a UM receive entity 47125 and an acknowledged mode (AM) entity 47130.

According to some aspects, a higher layer entity may exchange control, status and data messages 47162, 47164, 47168, 47172 and 47174 with RLC layer entity 47100 via one or more service access points 47140, 47142, 47144, 47146, 47148 and 47150. According to some aspects, RLC layer entity 47100 may exchange control, status and data messages 47178, 47180, 47182, 47184 and 47186 with a lower layer protocol entity via service access points 47152, 47154, 47156, 47158 and 47160.

Transparent Mode

According to some aspects, zero or more of each of (TM) transmit entity 47110 and TM receive entity 47115 may each correspond to a distinct logical channel identifier (LCID), and may be created, configured, and disposed of dynamically, according to requests from a higher layer control entity, which may be a radio resource control (RRC) entity.

According to some aspects, TM transmit entity 47110 may generate transparent mode data (TMD) PDUs from RLC SDUs received via (TM) SAP 47140, without segmenting or concatenating the SDUs or including any header data, and may pass the TMD PDUs to a lower layer via SAP 47152.

According to some aspects, TM receive entity may accept TMD PDUs from a lower layer via SAP 47154, and may deliver the TMD PDUs as RLC SDUs to a higher layer, without any modification, via SAP 47142.

Unacknowledged Mode

According to some aspects, zero or more of each of UM transmit entity 47120 and UM receive entity 47125 may each correspond to a distinct logical channel identifier (LCID), and may be created, configured, and disposed of dynamically, according to requests from a higher layer control entity, which may be a radio resource control (RRC) entity.

According to some aspects, UM transmit entity 47120 may generate unacknowledged mode data (UMD) PDUs from RLC SDUs by adding an RLC header to each RLC SDU, and may generate UMD PDU segments by dividing an RLC SDU into segments and adding an RLC header to each segment. According to some aspects, UM transmit entity 47120 may pass UMD PDUs and UMD PDU segments to a lower layer via SAP 47156.

According to some aspects, UM receive entity 47125 may process UMD PDUs received via SAP 47158. According to some aspects, processing of received UMD PDUs by UM receive entity 47125 may include one or more of the steps of: detecting and discarding UMD PDUs that have been received in duplication, reordering received UMD PDUs and UMD PDU segments according to serial numbers contained in UMD PDU and UMD PDU segments, reassembling RLC SDUs from received UMD PDU segments, and delivering RLC SDUs to higher layers via SAP 47146 in ascending numerical order.

Acknowledged Mode

According to some aspects, zero or more of each of AM entity 47130 may each correspond to a distinct logical channel identifier (LCID), and may be created, configured, and disposed of dynamically, according to requests from a higher layer control entity, which may be a radio resource control (RRC) entity.

According to some aspects, AM entity 47130 may generate acknowledged mode data (AMD) PDUs from RLC SDUs by adding an RLC header to each RLC SDU, and may generate AMD PDU segments by dividing an RLC SDU into segments and adding an RLC header to each segment. According to some aspects, AM entity 47130 may pass AMD PDUs and AMD PDU segments to a lower layer via SAP 47160.

According to some aspects, AM entity 47130 may include in a header of an AMD PDU a polling bit, indicating that the peer AM entity receiving the PDU is requested to respond with an AM STATUS PDU, which may include information about which AMD PDUs and AMD PDU segments have been received correctly.

According to some aspects, AM entity 47130 may store one or more transmitted AMD PDUs and AMD PDU segments in a retransmission buffer, and may retransmit one or more such PDUs if they are determined not to have been received correctly by the peer receiving AM entity.

According to some aspects, on retransmission of an AMD PDU or AMD

PDU segment, the AM entity may re-segment the PDU into two or more smaller segments if it is determined that a number of bytes of capacity available for transmission in a time interval is insufficient to retransmit the whole PDU.

A TMD PDU 47200 that may be transmitted by a TM transmit entity 47110 and received by a TM receive entity 47115 according to some aspects is illustrated in FIG. 472A.

According to some aspects, a TMD PDU 47200 may contain one or more octets of a data field 47205.

A UMD PDU 47220 that may be transmitted by a UM transmit entity 47120 and received by a UM receive entity 47125 according to some aspects is illustrated in FIG. 472B.

According to some aspects, a UMD PDU 47220 may consist of a UMD PDU header and a data field 47205.

According to some aspects, a UMD PDU 47220 may contain one or more of each of reserved 1 (R1) bits 47225, segmentation flag (SF) bit 47230, last segment flag (LSF) bit 47235, sequence number (SN) field 47240, and one or more octets of data 47205.

A UMD PDU segment 47250 that may be transmitted by a UM transmit entity 47120 and received by a UM receive entity 47125 according to some aspects if illustrated in FIG. 472C.

According to some aspects, a UMD PDU segment 47250 may contain one or more of each of reserved 1 (R1) bits 47225, segmentation flag (SF) bit 47230, last segment flag (LSF) bit 47235, sequence number (SN) field 47240, segment offset (SO) field 47245, and one or more octets of data 47205.

An AMD PDU 47260 that may be transmitted and received by an AM entity 47130 according to some aspects is illustrated in FIG. 472D.

According to some aspects, an AMD PDU 47260 may consist of an AMD PDU header and a data field 47205.

According to some aspects, an AMD PDU 47260 may contain one or more of each of a data/control (D/C) bit 47265, segmentation flag (SF) bit 47230, parity (P) bit 47270, reserved 1 (R1) bits 47225, last segment flag (LSF) bit 47235, sequence number (SN) field 47240, and one or more octets of data 47205.

An AMD PDU segment 47280 that may be transmitted and received by an AM entity 47130 according to some aspects is illustrated in FIG. 472E.

According to some aspects, an AMD PDU segment 47280 may contain one or more of each of a data/control (D/C) bit 47265, segmentation flag (SF) bit 47230, polling (P) bit 47270, reserved 1 (R1) bits 47225, last segment flag (LSF) bit 47235, sequence number (SN) field 47240, segment offset (SO) field 47245, and one or more octets of data 47205.

According to some aspects, the value of an SF bit 47230 contained in a UMD PDU 47220, UMD PDU segment 47250, AMD PDU 47260 or AMD PDU segment 47280 may indicate whether the PDU is a one of a UMD PDU or AMD PDU, or one of a UMD PDU segment or AMD PDU segment, where a value of 0 may indicate that the PDU is one of a UMD PDU or AMD PDU and a value of 1 may indicate that the PDU is one of a UMD PDU segment or AMD PDU segment.

According to some aspects, the P bit contained in an AMD PDU 47260 or AMD PDU segment 47280 may be set to a value that indicates whether a transmitting AMD PDU entity 47230 is requesting that a peer receiving AMD PDU entity 47230 respond by sending a STATUS PDU 47290.

According to some aspects, the value of an LSF bit 47235 contained in a UMD PDU segment 47250 or AMD PDU segment 47280 may be set to indicate whether the UMD PDU segment or AMD PDU segment respectively contains the last segment of a UMD PDU or AMD PDU respectively.

According to some aspects, the value of a SN field 47240 contained in a UMD PDU 47220 or AMD PDU 47260 may indicate a sequence number of the PDU. According to some aspects, the value of a SN field contained in a UMD PDU segment 47250 or AMD PDU segment 47280 may indicate a sequence number of a UMD PDU, of which the UMD PDU segment or AMD PDU segment is a segment.

A STATUS PDU 47290 that may be transmitted and received by an AM entity 47130 according to some aspects is illustrated in FIG. 472F.

According to some aspects, a STATUS PDU 47290 may contain one of each of a D/C bit 47265 and a control protocol type (CPT) field. According to some aspects, a CPT field contained in a STATUS PDU 47290 may be set to a value which indicates that the PDU is a STATUS PDU.

According to some aspects, a STATUS PDU 47290 may contain an acknowledgement field group and zero or more negative acknowledgement field groups.

According to some aspects, an acknowledgement field group may include an acknowledgement sequence number (ACK_SN) field, which may be 18 bits long, and an extension 1 (E1) bit which may be set to a value indicating whether the acknowledgement field group is followed by one or more negative acknowledgement field groups.

According to some aspects, a negative acknowledgement field group may include a negative acknowledgement sequence number (NACK_SN) field, which may be 18 bits long, followed by an E1 bit, an extension 2 (E2) bit, an extension 3 (E3) bit and zero, one or two optional fields, the E1 bit set to a value which indicates whether the negative acknowledgement field group is followed by an additional negative acknowledgement field group, the E2 bit set to a value which indicates whether the optional fields include a segment offset start (SOstart) field and the E3 bit set to a value which indicates whether the optional fields include a segment offset end (SOend) field.

Aspects of functions which may be contained within a packet data convergence protocol (PDCP) layer entity 47300 are illustrated in FIG. 473.

According to some aspects, PDCP layer entity 47300 may contain one or more of sequence numbering, duplicate detection and reordering circuitry 47325, header compression and decompression circuitry 47330, integrity protection and verification circuitry 47335, ciphering and deciphering circuitry 47340, and encapsulation and de-capsulation circuitry 47345.

According to some aspects, a higher layer entity may exchange PDCP service data units (SDU) 47305 with PDCP layer entity 47300 via SAP 47310. According to some aspects, PDCP layer entity 47300 may exchange PDCP protocol data units (PDU) 47315 with a lower layer protocol entity via SAP 47320.

According to some aspects, PDCP layer entity 47300 may include a control unit 47350, which may provide configuration and control inputs to, and receive status information from, one or more of sequence numbering, duplicate detection and reordering circuitry 47325, header compression and decompression circuitry 47330, integrity protection and verification circuitry 47335, ciphering and deciphering circuitry 47340 and encapsulation and de-capsulation circuitry 47345. According to some aspects, PDCP layer entity 47300 may include memory 47355, which may be used to store one or more of configuration parameters and state information.

According to some aspects, a higher layer entity may exchange control and status messages 47360 with control unit 47350 via an interface 47365.

A PDCP PDU 47400 that may be transmitted and received by a PDCP entity 47300 according to some aspects is illustrated in FIG. 474.

According to some aspects, a PDCP PDU 47400 may contain one or more of each of a reserved (R) bit 47405, a PDCP sequence number (SN) field 47410, one or more octets of data 47420 and a four octet message authentication code for data integrity (MAC-I) field 47420.

Aspects of communication between instances of radio resource control (RRC) layer 47500 are illustrated in FIG. 475. According to an aspect, an instance of RRC 47500 contained in a user equipment (UE) 47505 may encode and decode messages, transmitted to and received from respectively, a peer RRC instance 47500 contained in a base station 47510, which may be an evolved node B (eNodeB), gNodeB or other base station instance.

According to an aspect, an RRC 47500 instance may encode or decode broadcast messages, which may include one or more of system information, cell selection and reselection parameters, neighboring cell information, common channel configuration parameters, and other broadcast management information.

According to an aspect, an RRC 47500 instance may encode or decode RRC connection control messages, which may include one or more of paging information, messages to establish, modify, suspend, resume or release RRC connection, messages to assign or modify UE identity, which may include a cell radio network temporary identifier (C-RNTI), messages to establish, modify or release a signaling radio bearer (SRB), data radio bearer (DRB) or QoS flow, messages to establish, modify or release security associations including integrity protection and ciphering information, messages to control inter-frequency, intra-frequency and inter-radio access technology (RAT) handover, messages to recover from radio link failure, messages to configure and report measurement information, and other management control and information functions.

States of an RRC 47500 that may be implemented in a user equipment (UE) in some aspects are illustrated in FIG. 476.

According to some aspects, an RRC entity 47500 may be in one of the states NR RRC Connected 47605, NR RRC Inactive 47628 or NR RRC Idle 47625 when connected to or camped on a cell belonging to a 5G new radio (NR) network.

According to some aspects, an RRC entity 47500 may be in one of the states E-UTRA RRC Connected 47610 or E-UTRA RRC Idle 47630 when connected to or camped on a cell belonging to a long term evolution (LTE) network.

According to some aspects, an RRC entity 47500 may be in one of the states CELL_DCH 47615, CELL_FACH 47645, CELL_PCH/URA_PCH 47645 or UTRA_Idle 47635 when connected to or camped on a cell belonging to a universal mobile telecommunication system (UMTS) network.

According to some aspects, an RRC entity 47500 may be in one of the states GSM_Connected/GPRS_Packet_Transfer_Mode 47620 or GSM_Idle/GPRS_Packet_Idle 47640 when connected to or camped on a cell belonging to a global system for mobile telecommunication (GSM) network.

According to some aspects, an RRC entity 47500 may transition from one of the states in the set consisting of NR RRC Connected 47605, E-UTRA RRC Connected 47610, CELL_DCH 47615, CELL_FACH 47645, and GSM_Connected/GPRS_Packet_Transfer_Mode 47640, which may be termed connected states, to another state in the same set via a handover transition 47660.

According to some aspects, an RRC Entity 47500 may transition from one of the states in the set consisting of NR RRC Idle 47625, E-UTRA RRC Idle 47630, UTRA_Idle 47635, and GSM_Idle/GPRS_Packet_Idle 47640, which may be termed idle states, to another state in the same set via a cell reselection transition 47680.

According to some aspects, an RRC entity 47500 may transition between states NR RRC Connected 47605 and NR RRC Idle 47625, via an RRC connect/disconnect transition 47670. According to some aspects, an RRC entity 47500 may transition between states E-UTRA RRC Connected 47610 and E-UTRA RRC Idle 47630, via an RRC connect/disconnect transition 47670. According to some aspects, an RRC entity 47500 may transition between states CELL_PCH/URA_PCH 47645 and UTRA_Idle 47635, via an RRC connect/disconnect transition 47670. According to some aspects, an RRC entity 47500 may transition between states GSM_Connected/GPRS_Packet_Transfer_Mode 47620 and GSM_Idle/GPRS_Packet_Idle 47640, via an RRC connect/disconnect transition 47670.

The above detailed description includes references to the accompanying drawings, which form a part of the detailed description. The drawings show, by way of illustration, specific aspects in which the aspects of the disclosure can be practiced. These aspects are also referred to herein as "examples." In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect. The scope of various aspects of the disclosure can be determined with reference to the appended claims, along with the full scope of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate aspect.

EXAMPLES

Example 1 is an apparatus, including: a printed circuit board (PCB) substrate; a semiconductor die, the semiconductor die including a plurality of metallic pillars attached to a surface of the die and coupling the die to the PCB substrate, wherein each of the plurality of metallic pillars includes a plurality of overlaid metallic layers; and an inductive structure, the inductive structure including a metallic interconnect between at least two of the plurality of metallic pillars, wherein the metallic interconnect is one of the plurality of metallic layers.

In Example 2, the subject matter of Example 1 optionally includes wherein the metallic pillars are copper pillars, and wherein the plurality of overlaid metallic layers include a plurality of overlaid copper layers.

In Example 3, the subject matter of any one or more of Examples 1-2 optionally include a first plurality of metal pad contacts disposed between the plurality of metallic pillars and the semiconductor die; and a second plurality of metal pads disposed between the PCB substrate and the plurality of metallic pillars.

In Example 4, the subject matter of any one or more of Examples 1-3 optionally include wherein the inductive structure comprises an inherent self-inductance and on-die inductive components to achieve a desired inductance.

As used herein, the term "inherent self-inductance" of a circuit can be expressed as the ratio of an electromotive force produced in the circuit by self-induction to the rate of change of current producing the electromotive force. The self-inductance can be expressed in Henry (H) units.

In Example 5, the subject matter of any one or more of Examples 1-4 optionally include wherein the inductive structure comprises a high quality (Q) factor, the Q factor being a ratio of the inductive structure's inductance to the inductive structure's resistance.

In Example 6, the subject matter of any one or more of Examples 1-5 optionally include wherein the metallic interconnect is part of a top layer of the plurality of metallic layers, the top layer being in contact with the PCB substrate.

In Example 7, the subject matter of any one or more of Examples 1-6 optionally include wherein the inductive structure is independent of the PCB substrate.

In Example 8, the subject matter of any one or more of Examples 1-7 optionally include a second inductive structure, the second inductive structure formed by a second metallic interconnect between at least another two of the plurality of metallic pillars, wherein the second metallic interconnect is part of a second one of the plurality of metallic layers and is galvanically separated from the metallic interconnect.

In Example 9, the subject matter of Example 8 optionally includes wherein the second metallic interconnect is at least partially overlapping with the metallic interconnect, to form a coupling zone between the second metallic interconnect and the metallic interconnect.

In Example 10, the subject matter of Example 9 optionally includes wherein the second metallic interconnect and the metallic interconnect are arranged in a cross-over configuration.

In Example 11, the subject matter of any one or more of Examples 9-10 optionally include wherein the second metallic interconnect and the metallic interconnect are arranged in a parallel configuration.

In Example 12, the subject matter of any one or more of Examples 8-11 optionally include wherein the inductive structure and the second inductive structure form a transformer.

In Example 13, the subject matter of Example 12 optionally includes wherein the inductive structure form a primary winding of the transformer and the second inductive structure form a secondary winding of the transformer.

In Example 14, the subject matter of any one or more of Examples 1-13 optionally include wherein the plurality of metallic layers are associated with a corresponding plurality of etching processes.

Example 15 is a wireless communication device, including: a wireless transceiver; a PCB substrate; a semiconductor die, the semiconductor die coupled to the PCB substrate via a plurality of metallic pillars, wherein each of the plurality of metallic pillars includes a plurality of overlaid metallic layers; and a metallic interconnect formed between at least two of the plurality of metallic pillars, wherein the metallic interconnect is part of one of the plurality of metallic layers and comprises an inherent self-inductance.

In Example 16, the subject matter of Example 15 optionally includes a voltage controlled oscillator (VCO) formed on the PCB substrate configured to generate local oscillator signals using the metallic interconnect, the VCO coupled to the wireless transceiver.

In Example 17, the subject matter of Example 16 optionally includes wherein the metallic interconnect is a component of the voltage controlled oscillator.

Example 18 is a wireless communication device, including: a wireless transceiver configured to wirelessly transmit or receive data communicated via a bus; and a semiconductor package associated with the wireless transceiver, the semiconductor package including: a PCB substrate; a voltage controlled oscillator (VCO) formed on the PCB substrate; a semiconductor die, the semiconductor die coupled to the PCB substrate via a plurality of metallic pillars, wherein each of the plurality of metallic pillars includes a same plurality of overlaid metallic layers; and a metallic interconnect formed between at least two of the plurality of metallic pillars, wherein the metallic interconnect is part of one of the plurality of metallic layers associated with the at least two pillars and comprises an inherent self-inductance.

In Example 19, the subject matter of Example 18 optionally includes wherein the metallic interconnect is a component of the VCO.

In Example 20, the subject matter of any one or more of Examples 18-19 optionally include wherein the semiconductor package further includes: a second metallic interconnect between at least another two of the plurality of metallic pillars, wherein the second metallic interconnect is part of a second one of the plurality of metallic layers and is galvanically separated from the metallic interconnect.

Example 21 is an antenna structure including: a laminate circuit board including a plurality of parallel layers; a cavity within the laminate circuit board; a radio frequency integrated circuit (RFIC) disposed within the cavity; a shield for the RFIC, the shield including at least one metallized layer of the cavity; and a plurality of antenna elements arranged in at least one layer of the circuit board outside the cavity and coupled to the RFIC to radiate of RF signals from the RFIC.

In Example 22, the subject matter of Example 21 optionally includes wherein the cavity includes a floor on which the RFIC is disposed, and wherein the shield includes metallized layers of the laminate circuit board and vias that connect the floor to at least some of the metallized layers.

In Example 23, the subject matter of any one or more of Examples 21-22 optionally include wherein the shield includes a Faraday cage.

In Example 24, the subject matter of any one or more of Examples 21-23 optionally include wherein a first group of the plurality of antenna elements is disposed on a first layer of the circuit board outside of the shield and wherein a second group of the plurality of antenna elements is disposed on a second layer of the circuit board outside of the shield.

In Example 25, the subject matter of any one or more of Examples 23-24 optionally include wherein at least some of the first group and at least some of the second group radiate RF signals in opposite directions at substantially 180 degree angle to each other.

In Example 26, the subject matter of any one or more of Examples 23-25 optionally include wherein a third group of the plurality of antenna elements is disposed at an edge of the circuit board outside of the shield for edge-fire operation or end-fire operation.

In Example 27, the subject matter of any one or more of Examples 24-26 optionally include wherein at least some of the first group of antenna elements, at least some of the second group of antenna elements, and at least some of the third group of antenna elements include phased arrays of antenna elements.

In Example 28, the subject matter of any one or more of Examples 21-27 optionally include wherein at least some of the plurality of antenna elements are fed by feed lines that run laterally through one or more layers of the circuit board, from the RFIC within the shield.

In Example 29, the subject matter of any one or more of Examples 21-28 optionally include wherein at least some of the antenna elements are fed by feed lines that run laterally, or normal to laterally, from the RFIC within the shield, and thereafter transitioning through an opening in a ground layer or in the shield to reach the at least one of the antenna elements.

In Example 30, the subject matter of any one or more of Examples 21-29 optionally include wherein layers of the laminate circuit board above the cavity floor are smaller in size and area than layers below the cavity floor, wherein a pedestal is created with respect to the cavity.

In Example 31, the subject matter of any one or more of Examples 28-30 optionally include wherein the pedestal includes a surface having electrical contacts that connect to a socket of an electrical device, and wherein the electrical contacts further include a thermal conductive path to transfer heat from the laminate circuit board to the electrical device.

Example 32 is a mobile device including: a laminate circuit board including a plurality of parallel layers; a cavity within the laminate circuit board; a radio frequency integrated circuit (RFIC) disposed within the cavity; a shield for the RFIC, the shield including at least one metallized layer of the cavity; and a plurality of antenna elements arranged in at least one layer of the circuit board outside the cavity and coupled to the RFIC to radiate RF signals from the RFIC.

In Example 33, the subject matter of Example 32 optionally includes wherein the cavity includes a floor on which the RFIC is arranged, and the shield includes at least one metallized layer of the laminate circuit board and vias that connect the floor to the at least one metallized layer.

In Example 34, the subject matter of any one or more of Examples 32-33 optionally include wherein the shield includes a Faraday cage.

In Example 35, the subject matter of any one or more of Examples 32-34 optionally include wherein a first group of the plurality of antenna elements is disposed on a first layer of the circuit board outside of the shield and wherein a second group of the plurality of antenna elements is disposed on a second layer of the circuit board outside of the shield.

In Example 36, the subject matter of any one or more of Examples 33-35 optionally include where at least some of the first group and at least some of the second group radiate RF signals in opposite directions at substantially 180 degree angle to each other.

In Example 37, the subject matter of any one or more of Examples 33-36 optionally include wherein a third group of the plurality of antenna elements is arranged at an edge of the circuit board outside of the shield for edge-fire operation or end-fire operation.

In Example 38, the subject matter of any one or more of Examples 35-37 optionally include wherein at least some of the first group of antenna elements, at least some of the second group of antenna elements, and at least some of the third group of antenna elements include phased arrays of antenna elements.

In Example 39, the subject matter of any one or more of Examples 32-38 optionally include wherein at least some of the plurality of antenna elements are fed by feed lines that run laterally through one or more layers of the circuit board, from the RFIC within the shield.

In Example 40, the subject matter of any one or more of Examples 32-39 optionally include wherein at least some of the antenna elements are fed by feed lines that run laterally, or normal to laterally, from the RFIC within the shield, and thereafter pierce through an opening in the shield to reach the at least some of the antenna elements.

In Example 41, the subject matter of any one or more of Examples 32-40 optionally include wherein layers of the laminate circuit board above the cavity floor are smaller in size and area than layers below the cavity floor, wherein a pedestal is created.

In Example 42, the subject matter of Example 41 optionally includes wherein the pedestal includes a surface having electrical contacts that connect to a socket of an electrical device, and wherein the electrical contacts further include a thermal conductive path to transfer heat from the laminate circuit board to the electrical device.

In Example 43, the subject matter can include, or can optionally be combined with any portion or combination of, any portions of any one or more of Examples 21 through 42 to include, subject matter that can include means for performing any one or more of the functions of Examples 21 through 42, or a machine-readable medium including instructions that, when performed by a machine, cause the machine to perform any one or more of the functions of Examples 21 through 42.

Example 44 is an RF front-end module (RFEM), including: a phased antenna array including a plurality of antennas; a RF receiver sub-system arranged to process RF signals received via the phased antenna array; and a RF transmitter sub-system arranged to generate RF signals using intermediate frequency (IF) signals, the generated RF signals for transmission via the phased antenna array, wherein a first antenna subset of the plurality of antennas is disposed on a printed side of a PCB substrate and a second antenna subset of the plurality of antennas is disposed on a component side of the PCB substrate, and wherein the first antenna subset is co-located with a near-field communication (NFC) antenna on the printed side of the PCB substrate.

In Example 45, the subject matter of Example 44 optionally includes wherein the RF receiver sub-system and the RF transmitter sub-system are co-located with the second antenna subset on the component side of the PCB substrate. In another example, the second antenna subset is co-located with the NFC antenna on the component side of the PCB substrate.

In Example 46, the subject matter of any one or more of Examples 44-45 optionally include wherein the phased antenna array is arranged to receive and transmit signals in one or more mmWave bands.

In Example 47, the subject matter of any one or more of Examples 44-46 optionally include wherein the plurality of antennas include patch antennas.

In Example 48, the subject matter of any one or more of Examples 44-47 optionally include wherein the plurality of antennas include dipole antennas.

In Example 49, the subject matter of any one or more of Examples 44-48 optionally include wherein the plurality of antennas in the second antenna subset are disposed around a perimeter of the PCB substrate.

In Example 50, the subject matter of any one or more of Examples 44-49 optionally include wherein the plurality of antennas in the phased array are arranged for vertical polarization and horizontal polarization.

In Example 51, the subject matter of any one or more of Examples 44-50 optionally include wherein the NFC antenna includes an inductor disposed around the first antenna subset.

In Example 52, the subject matter of any one or more of Examples 44-51 optionally include wherein the NFC antenna includes a multi-layer inductor, wherein each layer of the multi-layer inductor is disposed around the first antenna subset.

In Example 53, the subject matter of any one or more of Examples 44-52 optionally include a ground layer of the phased array antenna, wherein the NFC antenna is part of the ground layer.

In Example 54, the subject matter of any one or more of Examples 44-53 optionally include a shielding structure, wherein the NFC antenna is part of the shielding structure.

In Example 55, the subject matter of any one or more of Examples 44-54 optionally include wherein the NFC antenna is coupled to a NFC processing sub-system, arranged to process NFC signals received via the NFC antenna.

In Example 56, the subject matter of any one or more of Examples 53-55 optionally include a local oscillator (LO) generator arranged to generate: a RF LO signal for down-converting the received RF signals or up-converting the IF signals; and a NFC LO signal for the NFC processing sub-system, the NFC LO signal for down-converting a signal received by the NFC processing sub-system via the NFC antenna, or for up-converting a signal generated by the NFC processing sub-system to transmit via the NFC antenna.

Example 57 is a wireless communication device, including: a memory; a processor coupled to the memory via a communication bus; an RF front-end module (RFEM) arranged to wirelessly transmit or receive RF data communicated via the bus; a near-field communication (NFC) sub-system (NFCS) arranged to wirelessly transmit or receive NFC data communicated via the bus and using an NFC antenna; and a semiconductor package associated with the RFEM and the NFCS, the semiconductor package including: a PCB substrate; a semiconductor die connected to the substrate; an on-substrate, off-die phased antenna array coupled to the RFEM and arranged to wirelessly transmit or receive the RF data; and a NFC antenna coupled to the NFC sub-system, the NFC antenna including an inductor formed around the phased antenna array.

In Example 58, the subject matter of Example 57 optionally includes a local oscillator (LO) generator arranged to generate a RF LO signal for down-converting the RF data, the LO generator shared between the NFCS and the RFEM.

In Example 59, the subject matter of Example 58 optionally includes wherein the LO generator is further arranged to: generate a NFC LO signal for the NFCS, the NFC LO signal for down-converting or up-converting the NFC data.

In Example 60, the subject matter of any one or more of Examples 57-59 optionally include wherein the processor is arranged to generate one or more control signals shared between the NFCS and the RFEM, the control signals for controlling the wireless transmission or reception of the RF data or the NFC data.

In Example 61, the subject matter of any one or more of Examples 57-60 optionally include a power management unit (PMU), the PMU shared between the NFCS and the RFEM.

In Example 62, the subject matter of any one or more of Examples 57-61 optionally include wherein the phased antenna array includes a plurality of mmWave patch antennas co-located with the NFC antenna on the PCB substrate.

Example 63 is a wireless communication device, including: a phased antenna array; an RF front-end module (RFEM), the RFEM including: a RF receiver sub-system arranged to process RF signals received via the phased antenna array; and a RF transmitter sub-system arranged to generate RF signals using intermediate frequency (IF) signals, the generated RF signals for transmission via the phased antenna array; a baseband sub-system (BBS), the BBS arranged to generate the IF signals or a baseband signal using the received RF signals; and a near-field communication (NFC) sub-system (NFCS) arranged to wirelessly transmit or receive NFC data communicated via the bus and using an NFC antenna, wherein the NFC antenna and a plurality of antennas including a subset of the phased antenna array are co-located on a same surface of a PCB substrate.

Example 64 is a wireless communication device, including: a PCB substrate including a phased antenna array; and a semiconductor die coupled to the PCB substrate, the semiconductor die including a plurality of identical transceiver cells arranged into a transceiver array, wherein a transceiver cell of the plurality of transceiver cells includes: receiver circuitry arranged to receive a wireless signal via the phased antenna array; local oscillator circuitry arranged to generate a local oscillator (LO) signal; transmitter circuitry arranged to up-convert a baseband signal using the LO signal, and wirelessly transmit the up-converted signal via the phased antenna array; and phase adjustment circuitry arranged to adjust phase of the received wireless signal or the up-converted signal using a phase adjustment signal, the phase adjustment signal associated with a desired antenna gain of the phased antenna array.

In Example 65, the subject matter of Example 64 optionally includes wherein the transceiver array includes a single uncut portion of the semiconductor die.

In Example 66, the subject matter of any one or more of Examples 64-65 optionally include wherein the transceiver array further includes a communication bus coupling the plurality of transceiver cells, the communication bus including at least an analog bus parallel with a digital bus.

In Example 67, the subject matter of Example 66 optionally includes wherein the transceiver cell further includes: buffering circuitry arranged to buffer a crystal oscillator signal for generating the LO signal, the crystal oscillator signal supplied to the plurality of transceiver cells and received via the communication bus.

In Example 68, the subject matter of any one or more of Examples 64-67 optionally include wherein the transceiver cell further includes digital circuitry arranged to generate the baseband signal using an input digital signal, and perform baseband processing of the received wireless signal to generate an output digital signal.

In Example 69, the subject matter of any one or more of Examples 64-68 optionally include wherein a pitch of a plurality of antennas within the phased antenna array is equal to a pitch of the plurality of transceiver cells within the transceiver array.

In Example 70, the subject matter of any one or more of Examples 64-69 optionally include wherein the transceiver cell of the plurality of transceiver cells further includes a processor, wherein the processor is arranged to: receive a power ON signal for activating one or both of the receiver circuitry or the transmitter circuitry; and detect one or more other transceiver cells of the plurality of transceiver cells, wherein the one or more other transceiver cells are neighboring cells along one or more of a north edge, a south edge, a west edge and an east edge of the transceiver cell within the transceiver array.

In Example 71, the subject matter of Example 70 optionally includes wherein the processor is arranged to: assign a cell identification number to the transceiver cell based on a location of the one or more other transceiver cells in relation to the north edge, the south edge, the west edge and the east edge of the transceiver cell.

In Example 72, the subject matter of Example 71 optionally includes wherein the processor is arranged to receive a control signal based on the assigned cell identification number, the control signal to fire the receiver circuitry or the transmitter circuitry.

In Example 73, the subject matter of any one or more of Examples 71-72 optionally include wherein the processor is arranged to assign an initial cell identification number to the transceiver cell when no neighboring transceiver cells are detected along the north edge and the west edge of the transceiver cell; and communicate the initial cell identification number to a neighboring transceiver cell along the east edge of the transceiver for assigning a cell identification number within the neighboring transceiver cell along the east edge.

In Example 74, the subject matter of any one or more of Examples 70-73 optionally include wherein the processor is arranged to detect the one or more other transceiver cells are along the west edge and the east edge of the transceiver cell; and receive a cell identification number from a transceiver cell of the one or more transceiver cells that is a neighboring transceiver cell along the west edge of the transceiver.

In Example 75, the subject matter of Example 74 optionally includes wherein the processor is arranged to increment the cell identification number of the neighboring transceiver cell along the west edge; and assign the incremented cell identification number as a cell identification number to the transceiver cell.

In Example 76, the subject matter of Example 75 optionally includes wherein the processor is arranged to communicate the assigned cell identification number to a transceiver cell of the one or more transceiver cells that is a neighboring transceiver cell along the east edge of the transceiver, for assigning a cell identification number within the neighboring transceiver cell along the east edge.

Example 77 is a phased array radio transceiver apparatus, the apparatus including: a plurality of transceiver cells arranged in a tiled configuration on a single semiconductor die, each transceiver cell including: receiver circuitry arranged to receive a wireless signal via a phased antenna array; local oscillator circuitry arranged to generate a local oscillator (LO) signal; phase adjustment circuitry; and digital circuitry arranged to perform baseband processing of the received wireless signal to generate an output digital signal; a communication bus coupling the plurality of transceiver cells; and control circuitry arranged to generate a phase adjustment signal for each of the plurality of transceiver cells, wherein during a LO beamforming operation mode, the phase adjustment circuitry in the plurality of transceiver cells adjusts a phase of the LO signal using the phase adjustment signal, and wherein the receiver circuitry of the plurality of transceiver cells down-converts the received wireless signal using the phase adjusted LO signal to generate a plurality of down-converted signals corresponding to the plurality of transceiver cells.

In Example 78, the subject matter of Example 77 optionally includes wherein the communication bus includes an analog bus line interfacing between the plurality of transceiver cells to combine the plurality of down-converted signals into a combined down-converted signal, as each of the plurality of down-converted signals is passed between neighboring transceiver cells.

In Example 79, the subject matter of Example 78 optionally includes wherein the analog bus includes a sample and hold vector pipelined bus line.

In Example 80, the subject matter of any one or more of Examples 78-79 optionally include wherein the analog bus includes a switched capacitor analog integrator arranged to sum down-converted signals of the plurality of down-converted signals communicated between neighboring transceiver cells.

In Example 81, the subject matter of any one or more of Examples 78-80 optionally include wherein one of the plurality of transceiver cells is arranged to receive the combined down-converted signal, and convert the combined down-converted signal to a digital signal.

In Example 82, the subject matter of any one or more of Examples 77-81 optionally include wherein the plurality of transceiver cells include a plurality of non-overlapping subsets of transceiver cells arranged to generate a corresponding plurality of digital signals.

In Example 83, the subject matter of Example 82 optionally includes wherein a subset of the plurality of non-overlapping subsets of transceiver cells is arranged to generate a combined down-converted signal based on a portion of the plurality of down-converted signals corresponding to the subset of transceiver cells.

In Example 84, the subject matter of Example 83 optionally includes wherein a single transceiver cell within the subset is arranged to convert the combined down-converted signal into a first digital signal of the plurality of digital signals.

In Example 85, the subject matter of any one or more of Examples 82-86 optionally include wherein during a hybrid beamforming operation mode, the control circuitry is further arranged to: generate a plurality of beamforming weight values for each of the plurality of digital signals, the plurality of weight values associated with a desired output signal beam corresponding to the received wireless signal; and apply the plurality of beamforming values to each of the plurality of digital signals to generate a plurality of weighted signals.

In Example 86, the subject matter of Example 85 optionally includes an adder arranged to add the plurality of weighted signals to generate the desired output signal beam.

In Example 87, the subject matter of any one or more of Examples 82-86 optionally include wherein each subset of the plurality of non-overlapping subsets of transceiver cells is arranged in a row of the tiled configuration.

Example 88 is a phased array radio transceiver apparatus, the apparatus including: a plurality of transceiver cells arranged in a tiled configuration on a single semiconductor die, each transceiver cell including: receiver circuitry arranged to receive a wireless signal via a phased antenna array; local oscillator circuitry arranged to generate a local oscillator (LO) signal; and phase adjustment circuitry; a communication bus coupling the plurality of transceiver cells; and control circuitry arranged to generate a phase adjustment signal for each of the plurality of transceiver cells, wherein during an analog beamforming operation mode, the phase adjustment circuitry in the plurality of transceiver cells adjusts a phase of the received wireless signal using the phase adjustment signal, and wherein the receiver circuitry of the plurality of transceiver cells down-converts the phase-adjusted received wireless signal to generate a plurality of down-converted signals corresponding to the plurality of transceiver cells.

In Example 89, the subject matter of Example 88 optionally includes wherein the communication bus includes an analog bus line interfacing between the plurality of transceiver cells to combine the plurality of down-converted signals into a combined down-converted signal, as each of the plurality of down-converted signals is passed between neighboring transceiver cells.

In Example 90, the subject matter of Example 89 optionally includes wherein one of the plurality of transceiver cells is arranged to receive the combined down-converted signal, and convert the combined down-converted signal to a digital signal using an analog-to-digital converter.

Example 91 is a semiconductor wafer, including: a plurality of identical transceiver cells arranged in a tiled configuration, each cell including: receiver circuitry arranged to receive a wireless signal via a phased antenna array; transmitter circuitry arranged to transmit a second wireless signal via the phased antenna array; and a communication bus coupling the receiver circuitry and the transmitter circuitry, wherein each transceiver cell is coupled to a plurality of neighboring transceiver cell via the communication bus to form the tiled configuration.

In Example 92, the subject matter of Example 91 optionally includes wherein a size of the tiled configuration of transceiver cells is selectable by cutting the wafer according to a pre-determined pattern.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

Example 93 is multi-package antenna arrays including: a first electronic package including a first substrate that includes a plurality parallel layers, a first layer including a first side of the first substrate and a second layer including a second side of the first substrate; a first plurality of antennas arranged on the first side of the first substrate; a second electronic package physically stacked on and physically connected to the first electronic package, the second electronic package including a second substrate that includes a plurality of layers, a first layer including a first side of the second substrate and a second layer including a second side of the second substrate; a second plurality of antennas arranged on the first side of the second substrate; at least one semiconductor die arranged on the second side of the first substrate or on the second side of the second substrate and coupled to the first plurality of antennas and to the second plurality of antennas; and a plurality of densely packed contacts in electrical contact with the second side of the first substrate and the second side of the second substrate, the plurality of densely packed contacts arranged to function as a radio frequency interference and electromagnetic interference (RFI/EMI) shield for the at least one semiconductor die.

In Example 94, the subject matter of Example 93 optionally includes wherein at least one semiconductor die includes a transceiver arranged to operate in a first frequency band.

In Example 95, the subject matter of any one or more of Examples 93-94 optionally include wherein the at least one semiconductor die includes a first transceiver arranged to operate in a first frequency band and a second transceiver arranged to operate in a second frequency band.

In Example 96, the subject matter of any one or more of Examples 93-95 optionally include wherein the first electronic package further includes a plurality discreet components offset laterally from the plurality of first antennas.

In Example 97, the subject matter of Example 96 optionally includes wherein the discreet components are secured to the first electronic package by a mold.

In Example 98, the subject matter of any one or more of Examples 93-97 optionally include wherein the first electronic package further includes a plurality discreet components offset laterally from the at least one silicon die.

In Example 99, the subject matter of Example 6 optionally includes wherein the discreet components are secured to the first electronic package by a mold.

In Example 100, the subject matter of any one or more of Examples 93-99 optionally include wherein the first plurality of antennas are arranged in a first array and the second plurality of antennas are arranged in a second array, and the arrays are controlled to radiate in different directions.

In Example 101, the subject matter of any one or more of Examples 93-100 optionally include wherein the first plurality of antennas further includes antennas arranged at the edges of the first substrate to operate in edge-fire radiation relative to the first electronic package and the second electronic package.

Example 102 is multi-package antenna arrays including: a first electronic package including an first antenna array; a second electronic package including a second antenna array, wherein the second electronic package is in stacked physical contact with and connected to the first electronic package; and at least one semiconductor die physically associated with and coupled to the first electronic package and the second electronic package, the at least one semiconductor die coupled to the first antenna array and the second antenna array, the at least one semiconductor die including at least one radio transceiver that is arranged to operate in a first frequency band and in a second frequency band.

In Example 103, the subject matter of Example 102 optionally includes wherein the first electronic package includes a first substrate on which the first antenna array is disposed and a second substrate on which the second antenna array is disposed, and the at least one semiconductor die is physically associated with the first substrate and the second substrate.

In Example 104, the subject matter of any one or more of Examples 102-103 optionally include a plurality of densely packed contacts between and in electrical contact with the first substrate the second substrate, the plurality of densely packed contacts arranged to function as an RFI/EMI shield for the at least one semiconductor die.

In Example 105, the subject matter of any one or more of Examples 102-104 optionally include wherein at least one semiconductor die includes a transceiver arranged to operate at WiGig frequencies.

In Example 106, the subject matter of any one or more of Examples 102-105 optionally include wherein the first frequency band is a WiGig frequency band and the second frequency band is a mmWave frequency band.

In Example 107, the subject matter of any one or more of Examples 102-106 optionally include wherein the first array and the second array are controlled to radiate in different directions.

In Example 108, the subject matter of Example 107 optionally includes wherein the different directions are opposite directions normal to the first electronic package and normal to the second electronic package.

In Example 109, the subject matter of any one or more of Examples 102-108 optionally include wherein first antenna array and the second antenna array are controlled to radiate in the same direction parallel to the first electronic package and the second electronic package.

In Example 110, the subject matter of any one or more of Examples 102-109 optionally include wherein the first electronic package further includes a plurality discreet components, and the at least one die and the plurality of discrete components are secured by an encapsulate.

In Example 111, the subject matter of any one or more of Examples 102-110 optionally include wherein the second antenna array is offset laterally from the second antenna array.

In Example 112, the subject matter of any one or more of Examples 102-111 optionally include wherein the first electronic package further includes plurality of antennas arranged at the edges of the first substrate to operate in edge-fire radiation relative to the first electronic package and the second electronic package.

In Example 113, the subject matter of any one or more of Examples 102-112 optionally include a flexible cable that provides an electrical connection to the at least one semiconductor die, wherein the flexible cable is secured to the second electronic package by an encapsulate.

In Example 114, the subject matter of Example 113 optionally includes wherein the flexible cable is soldered to the second electronic package.

In Example 115, the subject matter of any one or more of Examples 102-114 optionally include a flexible cable that provides an electrical connection to the at least one semiconductor die, wherein the flexible cable is secured to the first electronic package by an encapsulate.

In Example 116, the subject matter of Example 115 optionally includes wherein the flexible cable is soldered to the first electronic package.

In Example 117, the subject matter of any one or more of Examples 102-116 optionally include a Third electronic package that includes a third antenna array and a fourth antenna array, wherein the third electronic package is in stacked physical contact and connected to the first electronic package or the second electronic package, or with both the first electronic package and the second electronic package; and at least one second semiconductor die physically associated with and physically connected to the third electronic package, the at least one second semiconductor die coupled to the third antenna array and the fourth antenna array, the at least one second semiconductor die including at least one radio transceiver arranged to operate in a first frequency band and in a second frequency band.

In Example 118, the multi-package antenna arrays of Example 117 wherein the first antenna array, the second antenna array, the third antenna, and the fourth antenna array are controlled to radiate in different directions or in the same direction.

In Example 119, the subject matter of Example 117 optionally includes a third electronic package that includes a third antenna array and a fourth antenna array, wherein the third electronic package is in stacked physical contact with and connected to the first electronic package or the second electronic package, or with both the first electronic package and the second electronic package, the third antenna array and the fourth antenna array electrically coupled to the at least one semiconductor die.

In Example 120, the subject matter of Example 119 optionally includes wherein the first antenna array, the second antenna array, the third antenna array and the fourth antenna array are controlled to radiate in different directions or in the same direction, or in different directions and in the same direction.

In Example 121, the subject matter of Example 102 optionally includes wherein a mold covers the at least one semiconductor die and an antenna array is fed by a through-mold via coupled to the at least one semiconductor die.

In Example 122, the subject matter can include, or can optionally be combined with any portion or combination of, any portions of any one or more of Examples 93 through 121 to include, subject matter that can include means for performing any one or more of the functions of Examples 93 through 121, or a machine-readable medium including instructions that, when performed by a machine, cause the machine to perform any one or more of the functions of Examples 93 through 121.

Example 123 is an antenna card including: a plug-in card having an internal portion, wherein a first part of the internal portion is unmetallized and a second part of the internal portion includes a metallized electrical connection; an integrated circuit on a substrate secured in the internal portion; and at least one antenna arranged in the first part and coupled to the integrated circuit for radiation of RF waves.

In Example 124, the subject matter of Example 123 optionally includes wherein the at least one antenna includes an antenna array.

In Example 125, the subject matter of any one or more of Examples 123-124 optionally include wherein the at least one antenna is arranged for end-fire operation.

In Example 126, the subject matter of any one or more of Examples 124-125 optionally include wherein the antenna array includes a plurality of vertically polarized monopole antenna elements.

In Example 127, the subject matter of any one or more of Examples 124-126 optionally include wherein the antenna array includes a plurality of folded-back dipole antennas.

In Example 128, the subject matter of any one or more of Examples 123-127 optionally include wherein the at least one antenna includes at least two antennas, wherein one of the least two antennas is arranged to transmit and receive a first RF stream of information and another of the at least two antennas is arranged to transmit and receive a second RF stream of information independent from the first RF stream of information, to provide multiple-in multiple-out (MIMO) operation.

In Example 129, the subject matter of any one or more of Examples 123-128 optionally include wherein the at least one antenna includes at least two antennas, wherein one of the least two antennas is arranged to transmit and receive a first RF stream of information in a first polarization and another of the at last two antennas is arranged to transmit and receive a second RF stream of information in a second polarization.

In Example 130, the subject matter of any one or more of Examples 123-129 optionally include wherein the first part and the second part are located opposite each other.

Example 131 is an antenna array including; a first plug-in card disposed on a mother board and at least one second plug-in card disposed on the mother board spaced apart from the first plug-in card, wherein at least one of the plug-in cards includes a plug-in card having an internal portion, wherein a first part of the internal portion is unmetallized and a second part of the internal portion includes a metallized electrical connection; an integrated circuit on a substrate secured in the internal portion; and at least one antenna arranged in the first part and coupled to the integrated circuit for radiation of RF waves.

In Example 132, the subject matter of Example 131 optionally includes at least one third plug-in card arranged substantially normally to the first plug-in card and the at least one second plug-in card.

Example 133 is a mobile device including: at least one plug-in card having an internal portion, wherein a first part of the internal portion is unmetallized and a second part of the internal portion includes a metallized electrical connection; an integrated circuit on a substrate secured in the internal portion; and at least one antenna arranged in the first part and coupled to the integrated circuit for radiation of RF waves.

In Example 134, the subject matter of Example 133 optionally includes wherein the at least one antenna includes an antenna array.

In Example 135, the subject matter of any one or more of Examples 133-134 optionally include wherein the at least one antenna is arranged for end-fire operation.

In Example 136, the subject matter of any one or more of Examples 134-135 optionally include wherein the antenna array includes a plurality of vertically polarized monopole antenna elements.

In Example 137, the subject matter of any one or more of Examples 134-136 optionally include wherein the antenna array includes a plurality of folded-back dipole antennas.

In Example 138, the subject matter of any one or more of Examples 133-137 optionally include wherein the at least one antenna includes at least two antennas, wherein one of the least two antennas is arranged to transmit and receive a first RF stream of information and another of the at least two antennas is arranged to transmit and receive a second RF stream of information independent from the first RF stream of information, to provide multiple-in multiple-out (MIMO) operation.

In Example 139, the subject matter of any one or more of Examples 133-138 optionally include wherein the at least one antenna includes at least two antennas, wherein one of the least two antennas is arranged to transmit and receive a first RF stream of information in a first polarization and another of the at last two antennas is arranged to transmit and receive a second RF stream of information in a second polarization.

In Example 140, the subject matter of any one or more of Examples 133-139 optionally include wherein the first part and the second part are located opposite each other.

In Example 141, the subject matter of any one or more of Examples 133-140 optionally include wherein the at least one plug-in card includes: a first plug-in card disposed on a mother board and at least one second plug-in card disposed on the mother board spaced apart from the first plug-in card.

In Example 142, the subject matter of any one or more of Examples 131-141 optionally include at least one third plug-in card arranged substantially normally to the first plug-in card and the at least one second plug-in card.

In Example 143, the subject matter can include, or can optionally be combined with any portion or combination of, any portions of any one or more of Examples 123 through 142 to include, subject matter that can include means for performing any one or more of the functions of Examples 123 through 142, or a machine-readable medium including instructions that, when performed by a machine, cause the machine to perform any one or more of the functions of Examples 123 through 142.

Example 144 is an antenna structure including: a PCB including a first side and a second side, the second side including a grid of contacts with a specially created area of the grid without contacts; a shielded radio frequency integrated circuit (RFIC) attached to the first side of the PCB; at least one first antenna element disposed on the second side in the area of the grid without contacts and coupled to the RFIC for radiation of RF waves; and a motherboard connected to the PCB via individual contacts of the grid of contacts, and having a cutout substantially over the area of the grid without contacts, wherein the at least one first antenna is enabled to radiate out through the cutout.

In Example 145, the subject matter of Example 144 optionally includes at least one second antenna element disposed on the first side and coupled to the RFIC for radiation of RF waves.

In Example 146, the subject matter of Example 145 optionally includes wherein the at least one first antenna element disposed on the first side and the at least one second antenna element disposed on the second side each radiate RF signals in a different direction from each other.

In Example 147, the subject matter of Example 146 optionally includes wherein the different directions are at substantially a 180 degree angle to each other.

In Example 148, the subject matter of any one or more of Examples 144-147 optionally include wherein the cutout is a U-shaped cutout.

In Example 149, the subject matter of any one or more of Examples 144-148 optionally include wherein the motherboard and the printed circuit board are connected in a corner configuration.

In Example 150, the subject matter of any one or more of Examples 145-149 optionally include wherein one of the at least one first antenna element or the at least one of the second antenna element is arranged for broadside operation.

In Example 151, the subject matter of any one or more of Examples 145-150 optionally include wherein one of the at least one first antenna element or the at least one of the second antenna element is arranged for end-fire or edge-fire operation.

In Example 152, the subject matter of Examples 145-151 optionally include wherein the PCB includes a ball grid array (BGA) or a land grid array (LGA) and the grid of contacts respectively includes a grid of solder balls or a grid of LGA pads.

Example 153 is a base station including: a PCB including a first side and a second side, the second side including a grid of contacts with a specially created area of the grid without contacts; a shielded radio frequency integrated circuit (RFIC) attached to the first side of the PCB; at least one antenna element disposed on the second side in the area of the grid without contacts and coupled to the RFIC for radiation of RF waves; and a motherboard connected to the PCB via individual contacts of the grid of contacts, and having a cutout substantially over the area of the grid without contacts, wherein the at least one antenna is enabled to radiate out through the cutout, wherein the PCB, the shielded RFIC, the at least one antenna element and the motherboard include an antenna sub-system.

In Example 154, the subject matter of Example 153 optionally includes wherein the at least one antenna element includes a plurality of antenna elements arranged for broadside operation.

In Example 155, the subject matter of Example 154 optionally includes wherein the base station includes a plurality of the antenna sub-systems arranged circularly around a pole for radiation in substantially all directions.

Example 156 is a mobile device including: a PCB including a first side and a second side, the second side including a grid of contacts with a specially created area of the grid without contacts; a shielded radio frequency integrated circuit (RFIC) attached to the first side of the PCB; at least one first antenna element disposed on the second side in the area of the grid without contacts and coupled to the RFIC for radiation of RF waves; and a motherboard connected to the PCB via individual contacts of the grid of contacts, and having a cutout substantially over the area of the grid without contacts, wherein the at least one first antenna is enabled to radiate out through the cutout.

In Example 157, the subject matter of Example 156 optionally includes at least one second antenna element disposed on the first side and coupled to the RFIC for radiation of RF waves.

In Example 158, the subject matter of Example 157 optionally includes wherein the at least one first antenna element disposed on the first side and the at least one second antenna element disposed on the second side each radiate RF signals in a different direction from each other.

In Example 159, the subject matter of Example 158 optionally includes wherein the different directions are at substantially 180 degree angle to each other.

In Example 160, the subject matter of any one or more of Examples 156-159 optionally include wherein the cutout is a U-shaped cutout.

In Example 161, the subject matter of any one or more of Examples 156-160 optionally include wherein the motherboard and the printed circuit board are connected in a corner configuration.

In Example 162, the subject matter of any one or more of Examples 157-161 optionally include wherein one of the at least one first antenna element or the at least one of the second antenna element is arranged for broadside operation.

In Example 163, the subject matter of any one or more of Examples 156-162 optionally include wherein one of the at least one first antenna element or the at least one of the second antenna element is arranged for end-fire or edge-fire operation.

In Example 164, the subject matter of Examples 157-162 optionally includes wherein the PCB includes a ball grid array (BGA) of a land grid array (LGA) and the grid of contacts respectively include a grid of solder balls or a grid of LGA pads.

Example 165 is an antenna structure including: a PCB including a first side and a second side, the second side including a grid of contacts with a specially created area of the grid without contacts; a motherboard connected to the PCB via individual contacts of the grid of contacts, and having a cutout substantially over the area of the grid without contacts; and a radio frequency integrated circuit attached on the area of the grid without contacts and within the cutout.

In Example 166, the subject matter of Example 165 optionally includes wherein at least one discreet electronic component is attached on the area of the grid without contacts and within the cutout.

In Example 167, the subject matter can include, or can optionally be combined with any portion or combination of, any portions of any one or more of Examples 144 through 166 to include, subject matter that can include means for performing any one or more of the functions of Examples 144 through 166, or a machine-readable medium including instructions that, when performed by a machine, cause the machine to perform any one or more of the functions of Examples 144 through 166.

Example 168 is a self-testing system including: a test bed, the test bed arranged to mount a system under test, the system under test including a plurality of electronic components that include a transmitter, a receiver, a plurality of transmit (TX) antennas arranged to be coupled to the transmitter, and a plurality of receive (RX) antennas arranged to be coupled to the receiver; a reflector mounted on the tester and arranged to receive RF signals from the transmitter via a TX antenna and reflect the RF signals to the receiver via a RX antenna; and computer-readable hardware storage that store computer instructions which, when executed by the computer, tests the system under test according to predetermined tests, the tests including a loopback test of the system under test, the loopback test including transmission of a RF signal from TX elements including the transmitter and a TX antenna to RX elements including the receiver and a RX antenna, the RF signal received via reflection by the reflector, and determines a characteristic of the system under test from results of the loopback test.

In Example 169, the subject matter of Example 1 optionally includes wherein the TX elements and the RX elements are fired one-by one and the RF signal is transmitted via respective TX elements and received by respective RX elements.

In Example 170, the subject matter of Example 169 optionally includes wherein the RF signal is a millimeter wave (mmWave) signal.

In Example 171, the subject matter of any one or more of Examples 169-170 optionally include wherein the characteristic is a defective TX path that is determined by measurement of received RF signals one by one and detection of one measurement lower than each of the other measurements.

In Example 172, the subject matter of any one or more of Examples 169-171 optionally include wherein the characteristic is acceptability of the system under test, that is determined by comparison of the received RF signal against an expected value of the received RF signal.

In Example 173, the subject matter of any one or more of Examples 169-172 optionally include wherein the TX elements further include a TX phase shifter and the RX elements further include a RX phase shifter, and wherein the characteristic is functionality of the TX phase shifter that is determined by variation of the phase of the TX signal with the TX phase-shifter and measurement of the received phase of the RF signal.

In Example 174, the subject matter of any one or more of Examples 169-173 optionally include wherein each of the TX elements that are fired one by one includes a TX path, and wherein the characteristic is amplitude and phase mismatch between each of the TX paths that is determined by detection of a difference in amplitude or phase of one TX path versus amplitude or phase of each of the TX paths other than the one TX path.

In Example 175, the subject matter of any one or more of Examples 173-174 optionally include wherein the transmitted RF signal is a baseband signal, and wherein the characteristic is amplitude and phase of the base band signal that is determined by use of a first received baseband signal as a reference against which other received baseband signals are compared.

In Example 176, the subject matter of any one or more of Examples 168-175 optionally include wherein the characteristic is estimated antenna array gain that is determined by firing of all TX elements at the same time and measurement of the received baseband signal.

In Example 177, the subject matter of any one or more of Examples 167-176 optionally include wherein the tester has the reflector dismounted from the tester, and the computer instructions include instructions that, when executed by the computer, cause the tester to perform a loopback test on one of the plurality of electronic components, the loopback test resulting in first results.

In Example 178, the subject matter of any one or more of Examples 176-177 optionally include wherein the tester has the reflector remounted on the tester, and the computer instructions include instructions that, when executed by the computer, cause the tester to perform the loopback test on the one of the plurality of electronic components, the loopback test resulting in second results, and wherein the characteristic is crosstalk determined by subtraction of the first results from the second results.

Example 179 is a method of testing a system under test including: mounting the system under test on an electronic tester, the system under test including a plurality of electronic components that include a transmitter, a receiver, a plurality of transmit (TX) antennas coupled to the transmitter, and a plurality of receive (RX) antennas coupled to the receiver; mounting a reflector on the tester, the reflector arranged to receive RF signals from the transmitter via a TX antenna and reflect the RF signals to the receiver via a RX antenna; performing a loopback test of the system under test, the loopback test including transmitting a RF signal from TX elements including the transmitter and a TX antenna, to the reflector, and receiving the RF signal by RX elements including the receiver and a RX antenna, via reflection from the reflector; and determining a characteristic of the system under test from the results of the loopback test.

In Example 180, the subject matter of Example 179 optionally includes wherein the TX elements and the RX elements are fired one-by one and the RF signal is transmitted via respective TX elements and received by respective RX elements.

In Example 181, the subject matter of Example 180 optionally includes wherein the RF signal is a millimeter wave (mmWave) signal.

In Example 182, the subject matter of any one or more of Examples 180-181 optionally include wherein the characteristic is a defective TX path that is determined by measurement of received RF signals one by one and detection of one measurement lower than each of the other measurements.

In Example 183, the subject matter of any one or more of Examples 180-182 optionally include wherein the characteristic is acceptability of the system under test, that is determined by comparison of the received RF signal against an expected value of the received RF signal.

In Example 184, the subject matter of any one or more of Examples 180-183 optionally include wherein the TX elements further include a TX phase shifter and the RX elements further include a RX phase shifter, and wherein the characteristic is functionality of the TX phase shifter that is determined by variation of the phase of the TX signal with the TX phase-shifter and measurement of the received phase of the RF signal.

In Example 185, the subject matter of any one or more of Examples 180-184 optionally include wherein each of the TX elements that are fired one by one includes a TX path, and wherein the characteristic is amplitude and phase mismatch between each of the TX paths that is determined by detection of a difference in amplitude or phase of one TX path versus amplitude or phase of each of the TX paths other than the one TX path.

In Example 186, the subject matter of Example 185 optionally includes wherein the transmitted RF signal is a baseband signal, and wherein the characteristic is amplitude and phase of each received baseband signal that is determined by use of a first received baseband signal as a reference against which the received baseband signals other than the first baseband signal are compared.

In Example 187, the subject matter of any one or more of Examples 178-186 optionally include wherein all TX elements are fired at the same time, and wherein the characteristic is estimation of array gain that is determined by measurement of the received baseband signal.

In Example 188, the subject matter of any one or more of Examples 178-186 optionally include wherein the tester has the reflector dismounted from the tester, and the computer instructions include instructions that, when executed by the computer, cause the tester to perform a loopback test on one of the plurality of electronic components, the loopback test resulting in first results.

In Example 189, the subject matter of Example 188 optionally includes wherein the tester has the reflector remounted on the tester, and the computer instructions include instructions that, when executed by the computer, cause tester to perform the loopback test on the one of the plurality of electronic components, the loopback test resulting in second results, and wherein the characteristic is crosstalk that is determined by subtracting the first results from the second results.

In Example 190, the subject matter can include, or can optionally be combined with any portion or combination of, any portions of any one or more of Examples 168 through 189 to include, subject matter that can include means for performing any one or more of the functions of Examples 168 through 189, or a machine-readable medium including instructions that, when performed by a machine, cause the machine to perform any one or more of the functions of Examples 168 through 189.

Example 191 is a wireless communication device, including: a baseband sub-system (BBS), the BBS including: a first transceiver circuitry arranged to generate a first data signal at a first frequency and a second data signal at a second frequency that is non-overlapping with the first frequency; and a local oscillator (LO) generator arranged to generate a LO signal at a third frequency, the first, second and third frequencies being non-overlapping frequencies; and an RF front-end module (RFEM) coupled with the BBS via a single coax cable, the RFEM including: a phased antenna array including a plurality of antennas; and a second transceiver circuitry arranged to convert the first data signal and the second data signal to a desired frequency based on the LO signal, and transmit the converted first and second data signals via the phased antenna array, wherein the converted first data signal is transmitted via a first sub-array of the phased antenna array using a first type of antenna polarization, and the second converted data signal is transmitted via a second sub-array of the phased antenna array using a second type of antenna polarization.

In Example 192, the subject matter of Example 191 optionally includes wherein the antenna polarization is one of vertical antenna polarization or horizontal antenna polarization.

In Example 193, the subject matter of any one or more of Examples 191-192 optionally include wherein the third frequency is a difference of the first frequency and the second frequency.

In Example 194, the subject matter of any one or more of Examples 191-193 optionally include wherein the LO generator is arranged to: generate a second LO signal and a third LO signal, the second and third LO signals being non-overlapping signals with the LO signal.

In Example 195, the subject matter of Example 194 optionally includes wherein the first transceiver circuitry is arranged to: generate the first data signal based on the second LO signal; and generate the second data signal based on the third LO signal.

In Example 196, the subject matter of Example 195 optionally includes wherein the first LO signal, the second LO signal and the third LO signal are generated from the same frequency source and have correlated phase noise.

In Example 197, the subject matter of any one or more of Examples 191-966 optionally include a first triplexer within the BBS, the first triplexer arranged to multiplex the first data signal, the second data signal and the LO signal onto the single coax cable; and a second triplexer within the RFEM, the second triplexer arranged to receive the first data signal, the second data signal and the LO signal via the single coax cable.

In Example 198, the subject matter of any one or more of Examples 191-197 optionally include wherein the second transceiver circuitry includes: a vertical polarization processing chain coupled to the first sub-array of the phased antenna array, the first sub-array using vertical polarization; and a horizontal polarization processing chain coupled to the second sub-array of the phased antenna array, the second sub-array using horizontal polarization.

In Example 199, the subject matter of Example 198 optionally includes a second LO generator within the RFEM, the second LO generator arranged to receive the LO signal via the single coax cable, and perform one or more frequency manipulations on the LO signal to generate at least a second LO signal for converting the first data signal and the second data signal to the desired frequency.

In Example 200, the subject matter of Example 199 optionally includes wherein the second LO generator further includes: a frequency divider and a frequency multiplier to perform the one or more frequency manipulations.

Example 201 is a wireless communication device, including: a baseband sub-system (BBS), the BBS including: a first transceiver circuitry arranged to generate a first data signal at a first frequency using a first local oscillator (LO) signal, the first frequency including a desired transmit frequency; a second transceiver circuitry arranged to generate a second data signal at a second frequency using a second LO signal; and a LO generator arranged to generate the first LO signal, the second LO signal, and a third LO signal; and an RF front-end module (RFEM) coupled with the BBS via a single coax cable, the RFEM including: a phased antenna array including a plurality of antennas; a third transceiver circuitry arranged to transmit the first data signal at the desired transmit frequency via a vertically polarized antenna subset of the plurality of antennas; and a fourth transceiver circuitry arranged to convert the second data signal to the desired transmit frequency and transmit the converted second data signals via a horizontally polarized antenna subset of the plurality of antennas.

In Example 202, the subject matter of Example 201 optionally includes wherein the third LO signal includes a frequency that is a difference between the desired transmit frequency and the second frequency.

In Example 203, the subject matter of any one or more of Examples 201-202 optionally include wherein the third LO signal includes a frequency that is non-overlapping with the first and second frequencies.

In Example 204, the subject matter of any one or more of Examples 201-203 optionally include wherein: the third transceiver circuitry is arranged to transmit the first data signal at the desired transmit frequency via the horizontally polarized antenna subset of the plurality of antennas; and the fourth transceiver circuitry is arranged to transmit the converted second data signals via the vertically polarized antenna subset of the plurality of antennas.

In Example 205, the subject matter of any one or more of Examples 201-204 optionally include a first triplexer within the BBS, the first triplexer arranged to multiplex the first data signal, the second data signal and the third LO signal onto the single coax cable; and a second triplexer within the RFEM, the second triplexer arranged to receive the first data signal, the second data signal and the third LO signal via single coax cable.

In Example 206, the subject matter of any one or more of Examples 201-205 optionally include wherein the fourth transceiver circuitry further includes: an up-conversion mixer to up-convert the second data signal to the desired transmit frequency using the third LO signal.

In Example 207, the subject matter of any one or more of Examples 201-206 optionally include wherein: the third transceiver circuitry is arranged to receive a third data signal via the vertically polarized antenna subset of the plurality of antennas; the fourth transceiver circuitry is arranged to receive a fourth data signal via the horizontally polarized antenna subset of the plurality of antennas; and the third and fourth data signal being at a desired receive frequency.

In Example 208, the subject matter of Example 207 optionally includes wherein the RFEM further includes: a second LO generator arranged to generate a fourth LO signal for down-converting the fourth data signal to an intermediate frequency (IF) signal.

In Example 209, the subject matter of Example 208 optionally includes wherein the RFEM is arranged to: communicate the third data signal at the desired receive frequency, the fourth data signal at the intermediate frequency, and the fourth LO signal to the BBS via the single coax cable.

Example 210 is a wireless communication device, including: a baseband sub-system (BBS), the BBS including: a first transceiver circuitry arranged to generate a first data signal at a first radio frequency; a second transceiver circuitry arranged to generate a second data signal at a second radio frequency, wherein the first radio frequency is different than the second radio frequency; and an RF front-end module (RFEM) coupled with the BBS via a single coax cable, the RFEM including: a phased antenna array including a plurality of antennas; and a local oscillator (LO) generator arranged to generate a first LO signal and a second LO signal based on a desired transmit frequency; a third transceiver circuitry arranged to convert the first data signal to the desired transmit frequency using the first LO signal, and transmit the converted first data signal via a vertically polarized antenna subset of the plurality of antennas; and a fourth transceiver circuitry arranged to convert the second data signal to the desired transmit frequency using the second LO signal, and transmit the converted second data signal via a vertically polarized antenna subset of the plurality of antennas.

In Example 211, the subject matter of Example 210 optionally includes a first triplexer within the BBS, the first triplexer arranged to multiplex the first data signal and the second data signal onto the single coax cable for communication to the RFEM; and a second triplexer within the RFEM, the second triplexer arranged to receive the first data signal and the second data signal via single coax cable.

In Example 212, the subject matter of any one or more of Examples 210-211 optionally include wherein the LO generator includes a synthesizer that synthesizes the first LO signal and the second LO signal.

Example 213 is a wireless communication device, including: a phased antenna array including a plurality of antennas; an RF receiver sub-system arranged to process a plurality of RF signals received via the phased antenna array to generate a single RF signal; and a baseband sub-system (BBS) coupled to the RF receiver sub-system via a single coaxial (coax) cable, the BBS arranged to: generate a down-converted signal based on the single RF signal; and convert the down-converted signal to a digital data signal for processing by a wireless modem, wherein the BBS receives the RF signal from the RF receiver sub-system via the coax cable and the RF receiver sub-system receives a DC power signal from the BBS via the coax cable.

In Example 214, the subject matter of Example 213 optionally includes wherein the RF receiver sub-system includes: a plurality of amplifiers to amplify the plurality of received RF signals to generate a plurality of amplified signals.

In Example 215, the subject matter of Example 214 optionally includes wherein the RF receiver sub-system includes: a plurality of phase shifters to shift a phase associated with the plurality of amplified signals to generate a plurality of phase shifted signals; an adder arranged to add the plurality of phase shifted signals to generate a combined RF signal; and an amplifier arranged to amplify the combined RF signal to generate the single RF signal.

In Example 216, the subject matter of Example 215 optionally includes wherein the RF receiver sub-system is arranged to receive a control signal from the BBS via the single coax cable, the control signal specifying signal phase for phase adjustments performed by the plurality of phase shifters.

In Example 217, the subject matter of any one or more of Examples 213-216 optionally include wherein the BBS includes: an amplifier arranged to amplify the RF signal received from the RF receiver sub-system via the single coax cable to generate an amplified RF signal; at least one down-conversion mixer for down-converting the amplified RF signal to generate the down-converted signal; and at least one analog-to-digital converter (ADC) for converting the down-converted signal into the digital data signal for processing by the wireless modem.

In Example 218, the subject matter of any one or more of Examples 213-217 optionally include a RF transmitter sub-system arranged to generate a plurality of RF output signals based on a single RF output signal, the generated plurality of RF output signals for transmission via the phased antenna array.

In Example 219, the subject matter of Example 218 optionally includes wherein the RF transmitter sub-system further includes: an amplifier arranged to amplify the single RF output signal to generate an amplified output signal; an adder arranged to generate a plurality of signal replicas of the single RF output signal; a plurality of phase shifters arranged to shift a phase associated with the signal replicas to generate a plurality of phase shifted output signals; and a plurality of amplifiers to amplify the plurality of phase shifted output signals to generate the plurality of RF output signals for transmission via the phased antenna array.

In Example 220, the subject matter of Example 219 optionally includes wherein the RF receiver sub-system is arranged to receive a control signal from the BBS via the single coax cable, the control signal specifying signal phase for phase adjustments performed by the plurality of phase shifters.

In Example 221, the subject matter of any one or more of Examples 218-220 optionally include wherein the RF transmitter sub-system receives the single RF output signal from the BBS via the single coax cable.

In Example 222, the subject matter of Example 221 optionally includes wherein the BBS includes the wireless modem, and wherein the wireless modem is arranged to generate an output data signal.

In Example 223, the subject matter of Example 222 optionally includes wherein the BBS further includes: a digital-to-analog converter (DAC) for converting the data signal into a digital output signal; a filter for filtering the digital output signal to generate a filtered output signal; and an up-conversion mixer for up-converting the filtered output signal into the single RF output signal.

In Example 224, the subject matter of any one or more of Examples 213-223 optionally include wherein the RF receiver sub-system includes a first adaptive impedance matching circuitry and the BBS includes a second impedance matching circuitry, the first impedance matching circuitry and the second impedance matching circuitry for matching impedance associated with the single coax cable.

Example 225 is a wireless communication device, including: a first PCB substrate, the first PCB substrate including: a phased antenna array of a plurality of antennas; an RF receiver sub-system arranged to process a plurality of RF signals received via the phased antenna array to generate an RF input signal; and a RF transmitter sub-system arranged to generate a plurality of RF output signals based on an RF output signal, the generated plurality of RF output signals for transmission via the phased antenna array; and a second PCB substrate coupled to the first PCB substrate via a single coax cable, the second PCB substrate including a baseband sub-system (BBS), the BBS arranged to: generate a digital data signal using the RF input signal, the digital data signal for processing by a wireless modem; and generate the RF output signal based on at least another digital data signal generated by the wireless modem, wherein the BBS receives the RF input signal from the RF receiver sub-system via the single coax cable.

In Example 226, the subject matter of Example 225 optionally includes wherein the RF receiver sub-system and the RF transmitter sub-system are arranged to receive a DC power signal from the BBS via the single coax cable.

In Example 227, the subject matter of any one or more of Examples 225-226 optionally include wherein the RF receiver sub-system and the RF transmitter sub-system are arranged to receive a DC power signal from the BBS via the single coax cable.

In Example 228, the subject matter of any one or more of Examples 225-227 optionally include wherein the RF receiver sub-system includes: a plurality of amplifiers to amplify the plurality of received RF signals to generate a plurality of amplified signals; a plurality of phase shifters to perform phase adjustments and shift a phase associated with the plurality of amplified signals to generate a plurality of phase shifted signals; an adder arranged to add the plurality of phase shifted signals to generate a combined RF signal; and an amplifier arranged to amplify the combined RF signal to generate the single RF input signal for transmission to the BBS.

In Example 229, the subject matter of Example 228 optionally includes wherein the RF receiver sub-system is arranged to receive a control signal from the BBS via the single coax cable, the control signal specifying signal phase for the phase adjustments performed by the plurality of phase shifters.

In Example 230, the subject matter of any one or more of Examples 225-229 optionally include wherein the RF input signal and the RF output signal include signals within a millimeter wave band frequency.

In Example 231, the subject matter of any one or more of Examples 225-230 optionally include G wireless specification.

Example 232 is a wireless communication device, including: a first radio frequency front end module (RFEM) and a second RFEM, each of the first and second RFEM includes: a phased antenna array of a plurality of antennas; an RF receiver sub-system arranged to process a plurality of RF signals received via the phased antenna array to generate an RF input signal; and a RF transmitter sub-system arranged to generate a plurality of RF output signals based on an RF output signal, the generated plurality of RF output signals for transmission via the phased antenna array; and a baseband sub-system (BBS), the BBS arranged to: generate a digital data signal using the RF input signal from each of the first and second RFEMs, the digital data signal for processing by a wireless modem; and generate the RF output signal based on a local oscillator signal and at least another digital data signal generated by the wireless modem, wherein the BBS receives the RF input signal from the first RFEM and the second RFEM via a first coax cable and a second coax cable, respectively.

In Example 233, the subject matter of Example 232 optionally includes wherein the BBS includes a local oscillator generator arranged to generate the local oscillator signal, and wherein the local oscillator generator is shared between the first RFEM and the second RFEM.

Example 234 is a transmission line circuit including: at least one radio frequency integrated circuit (RFIC) affixed to a mother board in a user device, wherein the user device has a hinged lid; a transmission line including at least one waveguide, or an optical fiber, the transmission line having a first end coupled to the at least one RFIC, a length in the lid, and a second end coupled to one or more antennas in the lid.

In Example 235, the subject matter of Example 234 optionally includes wherein the one or more antennas include a plurality of antennas arranged to be controlled by a set of computer instructions executed by a central processing unit based on feedback information from a receiving device.

In Example 236, the subject matter of any one or more of Examples 234-235 optionally include wherein the transmission line includes at least one waveguide including a hollow conductive tube in the lid, the conductive tube arranged to transmit RF signals to the one or more antennas via a respective radio front end module (RFEM) disposed in the lid to amplify the RF signals.

In Example 237, the subject matter of Example 236 optionally includes wherein the at least one RFIC is arranged to generate RF signals in a plurality of frequency bands, the at least one waveguide includes a separate waveguide for each frequency band, and each waveguide is connected to a respective RFEM.

In Example 238, the subject matter of any one or more of Examples 236-237 optionally include wherein one RFIC is arranged to generate RF signals in a single frequency band, and the at least one waveguide includes a separate waveguide from the RFIC to each of a plurality of antennas that are arranged to be controlled by set of computer instructions executed by a central processing unit based on feedback information from a receiving device, and each waveguide is connected to a respective RFEM.

In Example 239, the subject matter of any one or more of Examples 236-238 optionally include wherein the first end of the at least one waveguide passes through the hinge, or is part of the hinge, and the second end of the at least one waveguide is coupled to the one or more antennas via a respective RFEM.

In Example 240, the subject matter of any one or more of Examples 234-239 optionally include wherein the transmission line includes a semiconductor integrated waveguide (SIW) arranged to transmit RF signals to the one or more antennas.

In Example 241, the subject matter of Example 240 optionally includes wherein the SIW is fed by a strip line or by a coplanar transmission line, and the SIW is implemented within a rigid PCB or a flexible PCB.

In Example 242, the subject matter of any one or more of Examples 240-241 optionally include wherein the user device is a laptop computer and the SIW includes part of a PCB that includes electronic circuitry associated with a keyboard of the laptop computer.

In Example 243, the subject matter of any one or more of Examples 240-241 optionally include wherein the user device is a laptop computer and the SIW includes part of a PCB dedicated for implementation of the SIW.

In Example 244, the subject matter of Example 243 optionally includes wherein the dedicated PCB is glued to the lid chassis.

In Example 245, the subject matter of any one or more of Examples 243-244 optionally include wherein the dedicated PCB is glued in a trench implemented in the lid chassis.

In Example 246, the subject matter of any one or more of Examples 243-245 optionally include wherein the SIW is affixed to the side of the screen in the chassis of the laptop computer.

In Example 247, the subject matter of any one or more of Examples 234-246 optionally include wherein the transmission line includes an optical fiber.

In Example 248, the subject matter of Example 247 optionally includes wherein first end of the optical fiber is coupled to the RFIC via an RF signal to optical signal converter.

In Example 249, the subject matter of Example 248 optionally includes wherein the RF signal to optical signal converter includes a pin diode, an avalanche pin diode, or an RF over fiber interface.

In Example 250, the subject matter of Example 249 optionally includes wherein the pin diode or avalanche pin diode is arranged to transmit RF signals as digital bits to the RFEM for radiation by the one or more antennas.

In Example 251, the subject matter of any one or more of Examples 249-250 optionally include wherein an RF over fiber convertor is arranged to modulate the optical signals with the RF signals of the RFIC.

In Example 252, the subject matter of Example 251 optionally includes wherein a conversion device is arranged to convert the modulated optical signals to RF signals that are transmitted to the RFEM for radiation by the one or more antennas.

In Example 253, the subject matter of any one or more of Examples 251-252 optionally include wherein the RFIC is arranged to generate RF signals in a plurality of frequency bands and the optical fiber is arranged to transmit optical signals modulated with the RF signals in each of the frequency bands.

In Example 254, the subject matter of any one or more of Examples 251-253 optionally include wherein the RFIC is arranged to generate RF signals in a single frequency band, and the optical fiber is coupled from the RFIC via a respective RFEM to each of a plurality of antennas, the antennas arranged to be controlled by a set of computer instructions executed by a central processing unit based on feedback information from a receiving device.

In Example 255, the subject matter can include, or can optionally be combined with any portion or combination of, any portions of any one or more of Examples 234 through 254 to include, subject matter that can include means for performing any one or more of the functions of Examples 234 through 254, or a machine-readable medium including instructions that, when performed by a machine, cause the machine to perform any one or more of the functions of Examples 234 through 254.

Example 256 is a wireless communication device, including: a baseband sub-system (BBS), the BBS including: a local oscillator (LO) generator arranged to generate an LO signal; and a clock spreading circuit arranged to modulate a control signal using the LO signal, to generate a modulated signal; and an RF front-end module (RFEM) coupled with the BBS via a single connection to receive the modulated signal and a data signal, the RFEM including: a clock dispreading circuit arranged to demodulate the modulated signal to recover the LO signal and the control signal; a phased antenna array including a plurality of antennas; and a transceiver circuitry arranged to up-convert the data signal to a desired RF based on the recovered LO signal to generate an RF signal, and fire a transmit mode based on the control signal, to transmit the RF signal via the phased antenna array.

In Example 257, the subject matter of Example 256 optionally includes wherein the clock spreading circuit includes: a pulse shaper arranged to receive control signal and generate a band-limited control signal.

In Example 258, the subject matter of Example 257 optionally includes wherein the clock spreading circuit includes: a modulator circuit arranged to receive the band-limited control signal and the LO signal to generate the modulated signal.

In Example 259, the subject matter of Example 258 optionally includes wherein the modulator circuit is one of: a binary phase-shift keying (BPSK) modulator; a differential phase-shift keying (DPSK) modulator; a quadrature phase-shift keying (QPSK) modulator; and a Gaussian frequency shift keying (GFSK) modulator.

In Example 260, the subject matter of any one or more of Examples 256-259 optionally include wherein the clock dispreading circuit includes: a clock recovery circuit including a multiplier circuit and a divider circuit, the clock recover circuit arranged to receive the modulated signal and recover the LO signal based on the modulated signal.

In Example 261, the subject matter of Example 260 optionally includes wherein the clock dispreading circuit includes: a demodulator circuit arranged to receive the modulated signal and the LO signal, and recover the control signal based on the modulated signal and the LO signal.

In Example 262, the subject matter of any one or more of Examples 256-261 optionally include wherein the transceiver circuitry includes: a plurality of amplifiers to amplify the plurality of received RF signals to generate a plurality of amplified signals.

In Example 263, the subject matter of Example 262 optionally includes wherein the transceiver circuitry includes: a plurality of phase shifters to shift a phase associated with the plurality of amplified signals to generate a plurality of phase shifted signals; and a combiner arranged to combine the plurality of phase shifted signals to generate a combined RF signal.

In Example 264, the subject matter of Example 263 optionally includes wherein the control signal specifies signal phase for phase adjustments performed by the plurality of phase shifters, or sets different gain adjustments for the plurality of amplifiers.

In Example 265, the subject matter of any one or more of Examples 263-264 optionally include wherein the RFEM includes: a frequency source arranged to receive the LO signal as a reference clock signal, and generate a second LO signal for down-conversion of the combined RF signal.

In Example 266, the subject matter of Example 265 optionally includes wherein the RFEM includes: a down-conversion mixer for down-converting the combined RF signal to generate an intermediate frequency (IF) signal based on the second LO signal; and an amplifier arranged to amplify the IF signal to generate an amplified IF signal.

In Example 267, the subject matter of Example 266 optionally includes wherein the BBS includes: a down-conversion mixer for down-converting the amplified IF signal based on the LO signal, to generate a down-converted signal; and an analog-to-digital converter (ADC) for converting the down-converted signal into a digital data signal for processing by a wireless modem.

Example 268 is a wireless communication device, including: a first PCB substrate, the first PCB substrate including a baseband sub-system (BBS), the BBS arranged to modulate a front-end control signal on a local oscillator (LO) reference signal to generate a modulated signal; and a second PCB substrate including an RF front-end module (RFEM) coupled with the first PCB via a single connection to receive the modulated signal and an intermediate frequency (IF) data signal, the RFEM including: a clock dispreading circuit arranged to demodulate the modulated signal to recover the LO reference signal and the front-end control signal; a phased antenna array including a plurality of antennas; and a transceiver circuitry arranged to up-convert the IF data signal to a desired RF based on the recovered LO reference signal to generate an RF signal, and fire a transmit mode based on the front-end control signal, to transmit the RF signal via the phased antenna array.

In Example 269, the subject matter of Example 268 optionally includes wherein the BBS includes: an LO generator arranged to generate the LO reference signal; and a clock spreading circuit arranged to modulate the front-end control signal using the LO reference signal, to generate the modulated signal.

In Example 270, the subject matter of Example 269 optionally includes wherein the clock spreading circuit includes: a pulse shaper arranged to receive the front-end control signal and generate a band-limited control signal; and a modulator circuit arranged to receive the band-limited control signal and the LO reference signal to generate the modulated signal.

In Example 271, the subject matter of any one or more of Examples 269-270 optionally include wherein the clock spreading circuit is arranged to: spread the LO reference signal using a pseudorandom sequence to obtain the modulated signal.

In Example 272, the subject matter of any one or more of Examples 270-271 optionally include wherein the modulator circuit is one of: a binary phase-shift keying (BPSK) modulator; a differential phase-shift keying (DPSK) modulator; a quadrature phase-shift keying (QPSK) modulator; and a Gaussian frequency shift keying (GFSK) modulator.

In Example 273, the subject matter of any one or more of Examples 269-272 optionally include wherein the clock dispreading circuit includes: a clock recovery circuit including a multiplier circuit and a divider circuit, the clock recover circuit arranged to receive the modulated signal and recover the LO reference signal based on the modulated signal.

In Example 274, the subject matter of Example 273 optionally includes wherein the clock dispreading circuit includes: a demodulator circuit arranged to receive the modulated signal and the recovered LO reference signal, and recover the front-end control signal based on the modulated signal and the LO reference signal.

In Example 275, the subject matter of any one or more of Examples 269-274 optionally include wherein the transceiver circuitry in the RFEM includes: a plurality of amplifiers to amplify a plurality of RF signals received via the phased antenna array to generate a plurality of amplified signals; a plurality of phase shifters to shift a phase associated with the plurality of amplified signals to generate a plurality of phase shifted signals; and a combiner arranged to combine the plurality of phase shifted signals to generate a combined RF signal.

In Example 276, the subject matter of Example 275 optionally includes wherein the control signal specifies signal phase for phase adjustments performed by the plurality of phase shifters, or sets different gain adjustments for the plurality of amplifiers.

In Example 277, the subject matter of any one or more of Examples 275-276 optionally include wherein the RFEM is arranged to fire a receive mode of the transceiver circuitry based on the front-end control signal, the receive mode for receiving the plurality of RF signals.

Example 278 is a wireless communication device, including: a phased antenna array including a plurality of antennas; an RF receiver sub-system arranged to process a plurality of RF signals received via the phased antenna array to generate a single RF signal; and a supplemental intermediate frequency sub-system (SIFS) coupled to the RF receiver sub-system via a first connection, the SIFS arranged to generate an IF signal based on the single RF signal; and a baseband sub-system (BBS) coupled to the SIFS via a second connection, the BBS arranged to: generate a down-converted signal based on the IF signal; and convert the down-converted signal to a digital data signal for processing by a wireless modem, wherein the SIFS receives the single RF signal from the RF receiver sub-system via the first connection, and the SIFS communicates the single RF signal to the BBS via the second connection.

In Example 279, the subject matter of Example 278 optionally includes wherein the first connection is a coax cable, and the second connection is a PCB traces connection.

In Example 280, the subject matter of any one or more of Examples 278-279 optionally include wherein the SIFS and the BBS are packaged together in a multi-chip module (MCM) or a System-in-Package module (SiPM), and the second connection is via signals in a package substrate of the MCM or the SiPM.

In Example 281, the subject matter of any one or more of Examples 278-280 optionally include wherein the RF receiver sub-system includes: a plurality of amplifiers to amplify the plurality of received RF signals to generate a plurality of amplified signals.

In Example 282, the subject matter of Example 281 optionally includes wherein the RF receiver sub-system includes: a plurality of phase shifters to shift a phase associated with the plurality of amplified signals to generate a plurality of phase shifted signals; and a combiner arranged to combine the plurality of phase shifted signals to generate a combined RF signal.

In Example 283, the subject matter of Example 282 optionally includes wherein the RF receiver sub-system is arranged to receive a control signal from the wireless modem via the first connection and the second connection, and wherein the control signal specifies signal phase for phase adjustments performed by the plurality of phase shifters, or sets different gain adjustments for the plurality of amplifiers.

In Example 284, the subject matter of any one or more of Examples 278-283 optionally include wherein the SIFS includes: a local oscillator (LO) signal generator arranged to receive a reference clock signal from the BBS, and generate a LO signal for down-conversion of the single RF signal.

In Example 285, the subject matter of Example 284 optionally includes wherein the SIFS includes: a down-conversion mixer for down-converting the single RF signal to generate the IF signal based on the LO signal; and an amplifier arranged to amplify the RF signal to generate an amplified RF signal.

In Example 286, the subject matter of Example 285 optionally includes wherein the BBS includes: an LO generator to generate a BBS LO signal; a down-conversion mixer for down-converting the amplified RF signal using the BBS LO signal, to generate the down-converted signal; and an analog-to-digital converter (ADC) for converting the down-converted signal into the digital data signal for processing by the wireless modem.

In Example 287, the subject matter of any one or more of Examples 278-286 optionally include an RF transmitter sub-system arranged to generate a plurality of RF output signals based on a single RF output signal, the generated plurality of RF output signals for transmission via the phased antenna array.

In Example 288, the subject matter of Example 287 optionally includes wherein the RF transmitter sub-system further includes: an amplifier arranged to amplify the single RF output signal to generate an amplified output signal; a splitter arranged to generate a plurality of signal replicas of the single RF output signal; a plurality of phase shifters arranged to shift a phase associated with the signal replicas to generate a plurality of phase shifted output signals; and a plurality of amplifiers to amplify the plurality of phase shifted output signals to generate the plurality of RF output signals for transmission via the phased antenna array.

In Example 289, the subject matter of Example 288 optionally includes wherein the RF transmitter sub-system is arranged to receive a control signal from the BBS via the SIFS, the control signal specifying signal phase for phase adjustments performed by the plurality of phase shifters.

In Example 290, the subject matter of any one or more of Examples 287-289 optionally include wherein the RF transmitter sub-system receives the single RF output signal from the SIFS via the first connection.

In Example 291, the subject matter of Example 290 optionally includes wherein the BBS includes the wireless modem, and wherein the wireless modem is arranged to generate an output data signal.

In Example 292, the subject matter of Example 291 optionally includes wherein the BBS further includes: a digital-to-analog converter (DAC) for converting the data signal into an output signal; a filter for filtering the output signal to generate a filtered output signal; and an up-conversion mixer for up-converting the filtered output signal into an intermediate frequency (IF) output signal.

In Example 293, the subject matter of Example 292 optionally includes wherein the SIFS further includes: an up-conversion mixer for up-converting the IF output signal to generate the single RF output signal.

In Example 294, the subject matter of any one or more of Examples 287-293 optionally include wherein the RF receiver sub-system and the RF transmitter sub-system include a first adaptive impedance matching circuitry and the SIFS includes a second impedance matching circuitry, the first impedance matching circuitry and the second impedance matching circuitry for matching impedance associated with the first connection.

Example 295 is a wireless communication device, including: a first PCB substrate, the first PCB substrate including: a phased antenna array of a plurality of antennas; an RF receiver sub-system arranged to process a plurality of RF signals received via the phased antenna array to generate an RF input signal; and an RF transmitter sub-system arranged to generate a plurality of RF output signals based on an RF output signal, the generated plurality of RF output signals for transmission via the phased antenna array; a second PCB substrate coupled to the first PCB substrate via a first connection, the second PCB substrate including a supplemental intermediate frequency module (SIFS), the SIFS arranged to: generate the RF output signal using an IF output signal; and generate an IF input signal using the RF input signal; and a third PCB substrate coupled to the second PCB substrate via a second connection, the third PCB substrate including a baseband sub-system (BBS), the BBS arranged to: generate a digital data signal using the IF input signal, the digital data signal for processing by a wireless modem; and generate the IF output signal based on at least another digital data signal generated by the wireless modem, wherein the SIFS receives the RF input signal from the RF receiver sub-system via the first connection.

In Example 296, the subject matter of Example 295 optionally includes wherein the SIFS is arranged to receive the IF output signal from the BBS via the second connection.

In Example 297, the subject matter of any one or more of Examples 295-296 optionally include wherein the first connection is a single coax cable, and wherein the second connection is PCB traces connection.

In Example 298, the subject matter of any one or more of Examples 295-297 optionally include wherein the SIFS includes: a local oscillator (LO) signal generator arranged to receive a reference clock signal from the BBS, and generate a LO signal for down-conversion of the RF input signal and up-conversion of the IF output signal.

In Example 299, the subject matter of Example 298 optionally includes wherein the SIFS includes: a down-conversion mixer for down-converting the RF input signal to generate the IF input signal based on the LO signal; and an up-conversion mixer for up-converting the IF output signal from the BBS to generate the RF output signal based on the LO signal.

In Example 300, the subject matter of any one or more of Examples 295-299 optionally include wherein the RF receiver sub-system includes: a plurality of amplifiers to amplify the plurality of received RF signals to generate a plurality of amplified signals; a plurality of phase shifters to perform phase adjustments and shift a phase associated with the plurality of amplified signals to generate a plurality of phase shifted signals; a combiner arranged to combine the plurality of phase shifted signals to generate the RF input signal for transmission to the SIFS.

In Example 301, the subject matter of Example 300 optionally includes wherein the RF receiver sub-system is arranged to receive a control signal from the BBS via the SIFS and the first connection, the control signal specifying signal phase for the phase adjustments performed by the plurality of phase shifters or sets different gain adjustments for the plurality of amplifiers.

In Example 302, the subject matter of any one or more of Examples 18-24 optionally include G wireless specification.

Example 303 is a wireless communication device, including: at least a first radio frequency front end module (RFEM) and at least a second RFEM, each of the at least first and second RFEMs includes: a phased antenna array of a plurality of antennas; an RF receiver sub-system arranged to process a plurality of RF signals received via the phased antenna array to generate an RF input signal; and an RF transmitter sub-system arranged to generate a plurality of RF output signals based on an RF output signal, the generated plurality of RF output signals for transmission via the phased antenna array; a supplemental intermediate frequency sub-system (SIFS), the SIFS arranged to: generate the RF output signal using an IF output signal; and generate an IF input signal using the RF input signal; and a baseband sub-system (BBS), the BBS arranged to: generate a digital data signal using the IF input signal, the digital data signal for processing by a wireless modem; and generate the IF output signal based on at least another digital data signal generated by the wireless modem and a local oscillator (LO) signal.

In Example 304, the subject matter of Example 303 optionally includes wherein the BBS includes a frequency source arranged to generate the LO signal, and wherein the local oscillator generator is shared between the BBS and the SIFS.

In Example 305, the subject matter of Example 304 optionally includes wherein the SIFS includes a second frequency source arranged to generate a second LO signal for generating the RF output signal and the IF input signal.

In Example 306, the subject matter of Example 305 optionally includes wherein the second frequency source is arranged to receive a LO reference signal from the LO generator within the BBS.

In Example 307, the subject matter of any one or more of Examples 303-306 optionally include wherein the at least first RFEM and the at least second RFEM operate at different frequency bands.

In Example 308, the subject matter of Example 307 optionally includes wherein the SIFS is arranged to generate different RF signals using different up-conversion and down-conversion frequencies corresponding to the different frequency bands of the at least first and second RFEMs.

Example 309 is an apparatus, including: a semiconductor die, the semiconductor die including a plurality of power amplifiers arranged to receive a plurality of signals via a corresponding plurality of signal lines, and generate a plurality of amplified signals based on the received signals; and a PCB substrate coupled to the semiconductor die, the PCB substrate including an RF power combiner coupled to the plurality of power amplifiers and arranged to combine the plurality of amplified signals to generate a single combined signal for transmission.

In Example 310, the subject matter of Example 309 optionally includes transceiver circuitry; and an antenna within the PCB substrate, wherein the transceiver circuitry is arranged to transmit the single combined signal via the antenna.

In Example 311, the subject matter of any one or more of Examples 309-310 optionally include wherein the semiconductor die includes a plurality of solder balls coupling the plurality of power amplifiers to a corresponding plurality of signal inputs of the power combiner.

In Example 312, the subject matter of any one or more of Examples 309-311 optionally include wherein the power combiner is a Wilkinson two-way power combiner.

In Example 313, the subject matter of any one or more of Examples 309-312 optionally include power combiner.

In Example 314, the subject matter of any one or more of Examples 309-313 optionally include wherein the power combiner includes a plurality of transmission lines arranged to receive the plurality of amplified signals.

In Example 315, the subject matter of Example 314 optionally includes wherein each of the plurality of transmission lines includes a quarter-wave length transmission line.

Example 316 is a wireless communication device, including: a wireless transceiver; a semiconductor die including a plurality of power amplifiers associated with the wireless transceiver, wherein the plurality of power amplifiers are arranged to: receive a plurality of output signals via a corresponding plurality of signal lines; and amplify the plurality of output signals to generate a plurality of amplified signals; a PCB substrate coupled to the semiconductor die, the PCB substrate including an RF power combiner coupled to the plurality of power amplifiers and arranged to combine the plurality of amplified signals to generate a single combined signal; and an antenna, wherein the wireless transceiver is arranged to wirelessly transmit the single combined signal via the antenna array.

In Example 317, the subject matter of Example 316 optionally includes wherein one or more of the plurality of power amplifiers are components of the wireless transceiver.

In Example 318, the subject matter of any one or more of Examples 316-317 optionally include wherein the antenna is a phased antenna array arranged on the PCB substrate.

In Example 319, the subject matter of any one or more of Examples 316-318 optionally include an impedance transformation device arranged to match an impedance of one or more of the plurality of power amplifiers and a termination point of the wireless transceiver.

In Example 320, the subject matter of Example 319 optionally includes wherein the termination point is the antenna.

In Example 321, the subject matter of any one or more of Examples 319-320 optionally include wherein the termination point is a terminal on the PCB substrate for coupling test equipment to measure one or more signal characteristics of the wireless transceiver.

In Example 322, the subject matter of any one or more of Examples 319-320 optionally include wherein the impedance transformation device is arranged on the PCB substrate.

In Example 323, the subject matter of Example 322 optionally includes wherein the impedance transformation device is coupled to the one or more of the plurality of power amplifiers via at least one of a plurality of solder balls, wherein the plurality of solder balls couple the semiconductor die with the PCB substrate to form a semiconductor package.

In Example 324, the subject matter of any one or more of Examples 319-323 optionally include wherein the impedance transformation device is a component of the RF power combiner.

In Example 325, the subject matter of any one or more of Examples 316-324 optionally include 5G communication protocol.

Example 326 is an apparatus, including: a semiconductor die, the semiconductor die including a first power amplifier and a second power amplifier, the first and second amplifiers arranged to receive an input signal, and generate a first amplified signal and a second amplified signal; and a PCB substrate coupled to the semiconductor die, the PCB substrate including an RF combiner network coupled to the plurality of power amplifiers and arranged to combine the first amplified signal and the second amplified signal to generate a single combined signal for transmission, wherein the semiconductor die includes a plurality of solder balls coupling the first power amplifier and the second power amplifier to a first transmission line and a second transmission line, respectively, to generate the single combined signal.

In Example 327, the subject matter of Example 326 optionally includes wherein the first power amplifier, the second power amplifier and the RF combiner network include a Doherty amplifier.

In Example 328, the subject matter of any one or more of Examples 326-327 optionally include wherein the first power amplifier is a carrier power amplifier, and the second power amplifier is a peaking power amplifier.

In Example 329, the subject matter of Example 328 optionally includes wherein the RF combiner network includes: a first offset transmission line coupled to the carrier power amplifier; a second offset transmission line coupled to the peaking power amplifier; and at least one quarter-wave length transmission line coupled to an antenna on the PCB, the at least one quarter wave transmission line arranged to receive the single combined signal for transmission by the antenna.

Example 330 is a low loss radio sub-system including: at least one silicon die arranged to include electronic circuits operable to generate primarily only electronic signals solely for operation of a predetermined number of antennas; a laminar substrate including a plurality of parallel layers, wherein the at least one silicon die is embedded within the laminar substrate; the predetermined number of antennas, that are arranged to operate solely with the electronic signals, arranged on or within a first layer of the laminar substrate or on or within both the first layer and a second layer of the laminar substrate; and a conductive signal feed structure connected between the at least one silicon die and the predetermined number of antennas and arranged to feed the electronic signals to the predetermined number of antennas.

In Example 331, the subject matter of Example 330 optionally includes wherein the at least one embedded silicon die includes a plurality of embedded silicon dies and the predetermined number of antennas includes a plurality of respective predetermined numbers of antennas, and wherein the conductive signal feed structure includes a plurality of signal feed traces connected to respective ones of the plurality of embedded silicon dies and to respective ones of the plurality of respective predetermined numbers of antennas.

In Example 332, the subject matter of any one or more of Examples 330-331 optionally include wherein the laminar structure includes a plurality of densely packed contacts respectively surrounding the at least one embedded silicon die and arranged to provide a radio frequency interference (RFI) and electromagnetic interference (EMI) shield for the at least one embedded silicon die.

In Example 333, the subject matter of Example 332 optionally includes wherein the at least one embedded silicon die includes a plurality of embedded silicon dies and the laminar structure includes pluralities of densely packed contacts each of the pluralities surrounding a respective one of the plurality of embedded silicon dies and arranged to provide respective RFI and EMI shields for the respective ones of the plurality of embedded silicon dies.

In Example 334, the subject matter of any one or more of Examples 331-333 optionally include wherein the plurality of embedded silicon dies are coupled with each other and arranged to be controlled by a plurality of software instructions executed by a central processing unit.

In Example 335, the subject matter of any one or more of Examples 331-334 optionally include wherein the laminar substrate is stacked upon and physically connected to a second laminar substrate that includes a second plurality of second respective predetermined numbers of second antennas, wherein the second laminar substrate includes a second plurality of embedded silicon dies each arranged to include electronic circuits operable to generate primarily only electronic signals for operation of ones of the second plurality of second respective predetermined numbers of antennas, and a plurality of feed traces connected to respective ones of the second plurality of second respective predetermined numbers of second antennas.

In Example 336, the subject matter of Example 335 optionally includes wherein the laminar substrate is parallel to the second laminar substrate or perpendicular to the second laminar substrate.

In Example 337, the subject matter of any one or more of Examples 335-336 optionally include wherein a first of the plurality of embedded silicon dies generates signals in a first frequency range and a second of the plurality of embedded silicon dies generates signals in a second frequency range.

Example 338 is an unmolded radio sub-system including: a laminar substrate including a plurality of parallel layers; a silicon die embedded within the laminar substrate; a dual patch antenna including a first patch and a second patch, wherein the first patch is arranged on or within a first layer of the plurality of layers of the laminar substrate or on or within a surface mounted device (SMD) connected to the first layer, and the second patch is arranged on or within a second layer of the plurality of layers of the laminar substrate and coupled to the silicon die; and a ground plane arranged on a third layer of the plurality of parallel layers, wherein the distance between the first patch and the second patch, and the distance between the second patch and the ground plane, are selected to provide a desired bandwidth.

In Example 339, the subject matter of Example 338 optionally includes wherein the laminar substrate is stacked upon and physically connected to a second laminar substrate that includes a second plurality of parallel layers, wherein the second laminar substrate includes a plurality of antennas coupled to the embedded silicon die by one or more vias and the second plurality of antennas is arranged as an antenna array.

In Example 340, the subject matter of Example 339 optionally includes wherein the laminar substrate is parallel to the second laminar substrate or perpendicular to the second laminar substrate.

In Example 341, the subject matter of any one or more of Examples 339-340 optionally include wherein an antenna includes a first antenna element and a second antenna element, and the first antenna element is arranged on or within the laminar substrate and the second antenna element is arranged on or within the second laminar substrate.

In Example 342, the subject matter of any one or more of Examples 338-341 optionally include wherein a flex interconnect connects the laminar substrate to a third laminar substrate that includes a plurality of antennas.

In Example 343, the subject matter of Example 342 optionally includes wherein the flex interconnect is connected to the laminar substrate by solder or by crimping.

Example 344 is a radio sub-system including: a first substrate that includes a first PCB; a second substrate that includes a mold; and a third substrate that includes a second PCB, wherein the second substrate includes one or more embedded silicon die coupled to a plurality of antenna arrays by through-mold-vias and by conductive redistribution layers (RDLs), component parts of the second substrate are constructed separately and soldered together, and the mold is applied by a flow process after the component parts of the second substrate are soldered together.

In Example 345, the subject matter of Example 344 optionally includes wherein the RDLs are also within the first substrate or the third substrate, or within the first substrate and the third substrate.

In Example 346, the subject matter of any one or more of Examples 344-345 optionally include wherein the RDLs are solely within the second substrate.

In Example 347, the subject matter of any one or more of Examples 344-346 optionally include wherein the RDLs include solder balls, Land Grid Array (LGA) pads or ball grid array (BGA) pads.

In Example 348, the subject matter of any one or more of Examples 344-347 optionally include wherein the component parts of the second substrate include through-mold vias and RDLs.

In Example 349, the subject matter of any one or more of Examples 344-348 optionally include wherein the through-mold vias include single posts.

In Example 350, the subject matter of any one or more of Examples 344-349 optionally include wherein the one or more embedded silicon die is tested in the second substrate before the first substrate, the second substrate and the third substrate are stacked upon and physically connected to one another.

In Example 351, the subject matter of any one or more of Examples 344-350 optionally include wherein the first substrate or the third substrate is soldered onto a mother board of a user device by solder balls, and the user device includes a phone, a tablet or other mobile device.

Example 352 is a radio sub-system including: a first substrate; a second substrate including at least one embedded silicon die; a third substrate; an SMD electrically connected to the first substrate; and an antenna element having a section arranged partially within the first substrate and partially within the SMD and fed by a conductive layer coupled to the at least one embedded die.

In Example 353, the subject matter of Example 352 optionally includes wherein the antenna element is further arranged partially within the second substrate and the third substrate, and the antenna element is fed by a second conductive layer coupled to the at least one embedded die.

In Example 354, the subject matter of any one or more of Examples 352-353 optionally include wherein the antenna element includes a through-mold via.

In Example 355, the subject matter of any one or more of Examples 352-354 optionally include wherein the SMD has two parallel sides and a section of the antenna element is disposed on one of the parallel sides.

In Example 356, the subject matter of any one or more of Examples 352-355 optionally include where the section of the antenna element arranged within the SMD is shorter than the section of the antenna element arranged within the first substrate, the second substrate and the third substrate.

In Example 357, the subject matter of any one or more of Examples 352-356 optionally include wherein the section of the antenna element that is disposed on one of the parallel sides of the SMD is shorter than either the section of the antenna element that is arranged within the SMD or the section of the antenna element that is arranged within the first substrate.

In Example 358, the subject matter of any one or more of Examples 352-357 optionally include wherein the at least one SMD is disposed on or within an antenna board that is stacked upon and physically connected to the first substrate and the antenna board includes a section of the antenna element.

Example 359 is a package-on package radio sub-system including: a first substrate including at least one embedded die; a first plurality of antennas disposed on the first substrate; a plurality of conductive redistribution layers (RDLs) coupling the at least one embedded die with the first plurality of antennas; and an antenna board including a second plurality of antennas, the antenna board stacked upon and physically connected to the first substrate, the RDLs coupling the at least one embedded die with the second plurality of antennas by solder contacts.

In Example 360, the subject matter of Example 359 optionally includes wherein the RDLs include conductive horizontal layers.

In Example 361, the subject matter of any one or more of Examples 359-360 optionally include wherein at least some of the RDLs are printed on the at least one embedded die.

In Example 362, the subject matter of any one or more of Examples 359-361 optionally include wherein the at least one embedded die is encapsulated by a mold.

Example 363 is a molded package-on package radio sub-system including: a first layer of parallel conductors; a first plurality of antenna elements disposed on the first layer; and a second layer including a mold encapsulate, a plurality of through-mold vias, at least one embedded die, and a plurality of conductive redistribution layers, the at least one embedded die connected to at least one of the first plurality of antennas by one or more of the plurality of conductive redistribution layers and one or more of the parallel conductors.

In Example 364, the subject matter of Example 363 optionally includes a connector for transmitting radio frequency signals to the package-on-package configuration, the connector placed in a recess in the first layer.

In Example 365, the subject matter of any one or more of Examples 363-364 optionally include wherein the at least one embedded die is shielded by a metallic shield arranged within the mold encapsulate, and wherein the metallic shield is soldered within the second layer prior to introducing the mold encapsulate into the second layer.

Example 366 is an ultra-thin radio sub-system including: A coreless substrate including parallel conductive layers; at least one semiconductor die disposed on the coreless substrate; and a plurality on antennas located laterally from the coreless substrate, wherein the volume of the plurality of antennas is greater than the volume of the coreless substrate.

In Example 367, the subject matter of Example 366 optionally includes wherein the plurality of antennas includes an antenna array fed by one of the parallel conductive layers.

In Example 368, the subject matter can include, or can optionally be combined with any portion or combination of, any portions of any one or more of Examples 330 through 367 to include, subject matter that can include means for performing any one or more of the functions of Examples 330 through 367, or a machine-readable medium including instructions that, when performed by a machine, cause the machine to perform any one or more of the functions of Examples 330 through 367.

Example 369 is a multilayer stacked ring resonator (SRR) antenna device, including: a plurality of ring resonators disposed on a first substrate layer of a multilayered PCB substrate; at least another ring resonator disposed on a second substrate layer of the PCB substrate; and an antenna feed disposed on a third substrate layer of the PCB substrate, wherein the antenna feed is galvanically coupled to the at least another ring resonator, and the plurality of ring resonators are capacitively coupled to each other and to the at least another ring resonator.

In Example 370, the subject matter of Example 369 optionally includes an antenna ground plane disposed on a fourth substrate layer of the PCB substrate, the fourth substrate layer adjacent to the third substrate layer, wherein the antenna ground plane is capacitively coupled to the plurality of ring resonators and the at least another ring resonator.

In Example 371, the subject matter of Example 370 optionally includes wherein the first substrate layer and the second substrate layer are separated by a first insulating substrate layer, and wherein the third and fourth substrate layers are separated from the second substrate layer by a second insulating substrate layer.

In Example 372, the subject matter of any one or more of Examples 369-371 optionally include a plurality of dipoles disposed on the first substrate layer and the second substrate layer.

In Example 373, the subject matter of Example 372 optionally includes wherein the plurality of dipoles includes non-resonant dipoles disposed orthogonally to an electric field of the SRR antenna device.

In Example 374, the subject matter of any one or more of Examples 372-376 optionally include wherein the plurality of dipoles increase a metal density of the SRR antenna device to reduce a substrate warpage of the multilayered PCB substrate.

In Example 375, the subject matter of any one or more of Examples 369-374 optionally include an impedance transformer disposed within one or more additional substrate layers of the PCB substrate, the impedance transformer coupled to an integrated circuit and the antenna feed through the one or more additional substrate layers.

In Example 376, the subject matter of Example 375 optionally includes wherein the impedance transformer is a coaxial impedance transformer including a plurality of vias, and wherein at least one of the plurality of vias couples the integrated circuit to the antenna feed through the one or more additional substrates.

In Example 377, the subject matter of any one or more of Examples 375-376 optionally include wherein the impedance transformer is arranged to match an impedance of a signal path, between the integrated circuit and the antenna feed, to one or more resonant frequencies.

In Example 378, the subject matter of any one or more of Examples 375-377 optionally include wherein the integrated circuit is disposed on an outer surface of at least one additional substrate layer opposite the plurality of ring resonators.

In Example 379, the subject matter of any one or more of Examples 369-378 optionally include wherein the antenna feed includes a plurality of feed lines coupled to one or more antenna ports of the at least another ring resonator on the second substrate layer.

In Example 380, the subject matter of Example 379 optionally includes wherein the at least another ring resonator is arranged to receive one or both of a vertically polarized signal and a horizontally polarized signal via the plurality of feed lines.

In Example 381, the subject matter of any one or more of Examples 379-380 optionally include S2 stripline.

In Example 382, the subject matter of any one or more of Examples 379-381 optionally include wherein each of the plurality of feed lines further includes a plurality of vias forming a shielding.

In Example 383, the subject matter of any one or more of Examples 379-382 optionally include S2 stripline shielded by a plurality of ground vias.

Example 384 is a wireless communication device to communicate and/or process high frequency signals, the device including: a stacked ring resonator (SRR) antenna on a multilayered PCB substrate; and a wireless transceiver integrated circuit arranged to transmit or receive wireless signals via the SRR antenna, wherein the SRR antenna includes: a plurality of ring resonators disposed on a first substrate layer of the PCB substrate; at least another ring resonator disposed on a second substrate layer of the PCB substrate; an antenna ground plane disposed on a third substrate layer of the PCB substrate; and an antenna feed disposed on a fourth substrate layer of the PCB substrate, the fourth substrate layer adjacent to the third substrate layer, wherein the antenna ground plane is capacitively coupled to the plurality of ring resonators and the at least another ring resonator, and wherein the antenna feed is a 25Ω stripline galvanically coupled to the at least another ring resonator at one or more antenna feed ports.

In Example 385, the subject matter of Example 384 optionally includes wherein the plurality of ring resonators include two ring resonators that are capacitively coupled to each other and to the at least another ring resonator.

In Example 386, the subject matter of any one or more of Examples 384-385 optionally include wherein the plurality of ring resonators include four ring resonators that are capacitively coupled to each other and to the at least another ring resonator.

In Example 387, the subject matter of any one or more of Examples 384-386 optionally include wherein the SRR antenna further includes: an impedance transformer disposed within one or more additional substrate layers of the PCB substrate, the impedance transformer coupled to an integrated circuit and the antenna feed through the one or more additional substrate layers.

In Example 388, the subject matter of Example 387 optionally includes wherein the impedance transformer is a coaxial impedance transformer including a plurality of vias, and wherein at least one of the plurality of vias couples the integrated circuit to the antenna feed through the one or more additional substrates.

In Example 389, the subject matter of any one or more of Examples 387-388 optionally include wherein the impedance transformer is arranged to match an impedance of a signal path, between the integrated circuit and the antenna feed, to one or more resonant frequencies.

In Example 390, the subject matter of any one or more of Examples 387-389 optionally include wherein the integrated circuit is disposed on an outer surface of at least one additional substrate layer opposite the plurality of ring resonators.

Example 391 is a device, including: a waveguide; a PCB substrate, the PCB substrate including: a transmission line arranged to transmit or receive wireless signals using the waveguide; and a feed probe coupled to the transmission line and arranged to manipulate the transmission or reception of the wireless signals; and a waveguide adapter that couples the PCB to the waveguide, wherein the waveguide includes an open end that acts as an antenna to transmit or receive the wireless signals, and wherein the feed probe includes at least one via plated through the PCB substrate and the transmission line.

In Example 392, the subject matter of Example 391 optionally includes wherein the transmission line is arranged to communicate the wireless signals between an RF subsystem on the PCB substrate and the waveguide.

In Example 393, the subject matter of Example 392 optionally includes wherein the transmission line is disposed on one or more layers of the PCB substrate.

In Example 394, the subject matter of any one or more of Examples 392-393 optionally include wherein the transmission line is a ground-backed coplanar waveguide (CPW) transmission line.

In Example 395, the subject matter of any one or more of Examples 391-394 optionally include wherein the waveguide adapter includes an impedance matching air cavity formed between the waveguide and the PCB substrate, when the waveguide adapter is mounted to the PCB substrate and the waveguide.

In Example 396, the subject matter of any one or more of Examples 391-395 optionally include wherein the PCB substrate includes a top ground layer and a bottom ground layer, wherein the top ground layer and the bottom ground layer are coupled to a ground layer of the transmission line.

In Example 397, the subject matter of Example 396 optionally includes a plurality of ground vias forming ground via fences, the ground via fences coupling the top ground layer and the bottom ground layer.

In Example 398, the subject matter of Example 397 optionally includes wherein the waveguide includes an insulator with a metal coating, the metal coating electrically connected with the waveguide adapter and the ground via fences, when the waveguide adapter is mounted to the waveguide and the PCB.

In Example 399, the subject matter of any one or more of Examples 391-398 optionally include wherein the PCB substrate includes a cut-out for receiving the waveguide, when the waveguide adapter is mounted to the PCB substrate and the waveguide.

In Example 400, the subject matter of any one or more of Examples 392-399 optionally include wherein the waveguide adapter further includes an opening to receive the transmission line, when the waveguide adapter is mounted to the PCB substrate and the waveguide.

In Example 401, the subject matter of any one or more of Examples 391-400 optionally include wherein the waveguide includes a metal-coated dielectric material with a dielectric constant that is different from a dielectric constant associated with the PCB.

In Example 402, the subject matter of any one or more of Examples 391-401 optionally include wherein the PCB further including at least one opening for receiving mounting means, the mounting means to attach the waveguide adapter to the PCB.

In Example 403, the subject matter of any one or more of Examples 392-402 optionally include wherein a width of the impedance matching air cavity is adjustable to configure a degree of signal reflection between the transmission line and the waveguide.

Example 404 is an antenna system, including: a waveguide; a transmission line on a PCB substrate, the transmission line arranged to communicate wireless signals between an RF sub-system and the waveguide; and an adapter that couples the PCB substrate to the waveguide; and a feed probe coupled to the transmission line and arranged to manipulate transmission or reception of the wireless signals via the waveguide, wherein the transmission line is coupled to a ground plane layer of the PCB substrate via a plurality of ground via fences plated through the PCB substrate and the ground plane layer.

In Example 405, the subject matter of Example 404 optionally includes wherein the adapter includes: an impedance matching air cavity formed between the waveguide and the PCB substrate, when the adapter is mounted to the PCB substrate and the waveguide.

In Example 406, the subject matter of any one or more of Examples 404-405 optionally include wherein the transmission line is a ground-backed coplanar waveguide (CPW) transmission line.

In Example 407, the subject matter of any one or more of Examples 404-406 optionally include wherein the feed probe includes one or more PCB vias plated through the PCB substrate and the transmission line.

In Example 408, the subject matter of any one or more of Examples 404-407 optionally include wherein the PCB substrate includes a top ground layer and a bottom ground layer, wherein the top ground layer and the bottom ground layer are coupled to the transmission line using the ground via fences.

In Example 409, the subject matter of Example 408 optionally includes wherein the waveguide includes an insulator with a metal coating, the metal coating electrically connected with the waveguide adapter and the ground via fences, when the adapter is mounted to the waveguide and the PCB substrate.

In Example 410, the subject matter of any one or more of Examples 404-409 optionally include wherein the PCB substrate includes a cut-out for receiving the waveguide, when the adapter is mounted to the PCB substrate and the waveguide.

In Example 411, the subject matter of any one or more of Examples 404-410 optionally include wherein the adapter further includes an opening to receive the transmission line, when the adapter is mounted to the PCB substrate and the waveguide.

Example 412 is a dual polarized antenna including: a first dipole antenna; a second dipole antenna, wherein the first dipole antenna and the second dipole antenna each has a respective planar arm, and wherein the first and the second dipole each has an arm that is substantially perpendicular to each respective planar arm, and wherein each dipole is arranged to produce linear polarization slanted at 45 degrees to the respective planar arms.

In Example 413, the subject matter of Example 412 optionally includes wherein the arm of each of the first dipole and the second dipole is a common arm shared by the first dipole and the second dipole.

In Example 414, the subject matter of any one or more of Examples 412-413 optionally include wherein the first dipole antenna and the second dipole antenna are implemented on a multilayer substrate and holes are in the planar arms, the holes extending at least part way into the multilayer substrate, to reduce substrate waves.

In Example 415, the subject matter of any one or more of Examples 412-414 optionally include wherein the first dipole antenna and the second dipole antenna are implemented on a multilayer substrate and holes are in the PCB contiguous to, but not through, the planar arms of the first dipole and the second dipole, the holes extending at least part way into the multilayer substrate, to reduce substrate waves.

In Example 416, the subject matter of any one or more of Examples 412-415 optionally include wherein the first dipole and the second dipole are folded dipoles placed side-by-side.

In Example 417, the subject matter of Example 416 optionally includes wherein the first dipole and the second dipole include an orthogonally polarized antenna pair.

In Example 418, the subject matter of Example 417 optionally includes wherein the polarization is perpendicular to the PCB.

Example 419 is a dual polarized antenna array including a plurality of orthogonally polarized antenna elements wherein each of the plurality of orthogonally polarized antenna elements includes: a first dipole antenna; a second dipole antenna, wherein the first dipole antenna and the second dipole antenna each has a respective planar arm, and wherein the first and the second dipole each has an arm that is substantially perpendicular to each respective planar arm, and wherein each dipole is arranged to produce linear polarization slanted at 45 degrees to the respective planar arms.

In Example 420, the subject matter of Example 419 optionally includes wherein the arm of each of the first dipole and the second dipole is a common arm shared by the first dipole and the second dipole.

In Example 421, the subject matter of any one or more of Examples 419-420 optionally include wherein the first dipole antenna and the second dipole antenna are implemented on a multilayer substrate and holes are in the planar arms, the holes extending at least part way into the multilayer substrate, to reduce substrate waves.

In Example 422, the subject matter of any one or more of Examples 419-421 optionally include wherein the first dipole antenna and the second dipole antenna are implemented on a multilayer substrate and holes are in the PCB contiguous to, but not through, the planar arms of the first dipole and the second dipole, the holes extending at least part way into the multilayer substrate, to reduce substrate waves.

In Example 423, the subject matter of any one or more of Examples 419-422 optionally include wherein the first dipole and the second dipole are folded dipoles placed side-by-side.

In Example 424, the subject matter of Example 423 optionally includes wherein the first dipole and the second dipole include an orthogonally polarized antenna pair.

In Example 425, the subject matter of any one or more of Examples 423-424 optionally include wherein the polarization is perpendicular.

In Example 426, the subject matter can include, or can optionally be combined with any portion or combination of, any portions of any one or more of Examples 412 through 425 to include, subject matter that can include means for performing any one or more of the functions of Examples 412 through 425, or a machine-readable medium including instructions that, when performed by a machine, cause the machine to perform any one or more of the functions of Examples 412 through 425.

Example 427 is a radio sub-system including: a die embedded within a first substrate; at least one first antenna disposed on the first substrate and coupled to the die; surface mounted devices connected to the first substrate wherein the surface mounted devices include at least one second antenna; and a second substrate that includes a cavity, the second substrate connected to the first substrate such that the surface mounted devices are covered by the cavity.

In Example 428, the subject matter of Example 427 optionally includes wherein the at least one first antenna includes a plurality of antennas arranged as a first antenna array.

In Example 429, the subject matter of any one or more of Examples 427-428 optionally include wherein the at least one second antenna includes a plurality of second antennas arranged as a second antenna array.

In Example 430, the subject matter of any one or more of Examples 427-429 optionally include wherein the at least one first antenna includes a plurality of antennas arranged as a first antenna array and the at least one second antenna includes a plurality of second antennas arranged as a second antenna array, and wherein the first antenna array is arranged to operate in a first frequency band and the second antenna array is arranged to operate in a second frequency band.

In Example 431, the subject matter of Example 430 optionally includes wherein the first frequency band is at millimeter wave frequencies and the second frequency band is at WiGig frequencies.

In Example 432, the subject matter of any one or more of Examples 427-431 optionally include wherein the surface mounted devices are connected to the first substrate by solder connections that are mechanical connections or electrical connections.

In Example 433, the subject matter of any one or more of Examples 427-432 optionally include wherein the first substrate is connected to the second substrate by solder connections that are mechanical connections or electrical connections.

In Example 434, the subject matter of any one or more of Examples 427-433 optionally include wherein the first substrate or the second substrate is connected to a third substrate by way of a flexible interconnect, wherein the third substrate includes a second die coupled to plurality of third antennas arranged as an antenna array.

In Example 435, the subject matter of Example 434 optionally includes wherein the plurality of third antennas includes a third antenna array arranged to operate at millimeter wave frequencies.

In Example 436, the subject matter of any one or more of Examples 434-435 optionally include wherein the third substrate is connected to a connector that is arranged to receive radio signals to be transmitted or received by the third antenna array.

Example 437 is a mobile device including: a die arranged as a transceiver, wherein the die is embedded within a first substrate including a first antenna array soldered to a first layer of the first substrate; a second antenna array soldered to a second layer of the first substrate, wherein the second layer is parallel to the first layer; and a second substrate that includes a cavity, wherein the second substrate connected to the first substrate such that the second antenna array is covered by the cavity.

In Example 438, the subject matter of Example 437 optionally includes wherein the first antenna array is arranged to operate in a first frequency band and the second antenna array is arranged to operate in a second frequency band.

In Example 439, the subject matter of Example 438 optionally includes wherein the first frequency band is at millimeter wave frequencies and the second frequency band is at WiGig frequencies.

In Example 440, the subject matter of any one or more of Examples 437-439 optionally include wherein the first substrate is connected to the second substrate by solder connections that are mechanical connections or electrical connections.

In Example 441, the subject matter of any one or more of Examples 437-440 optionally include wherein the first substrate or the second substrate is connected to a third substrate by way of a flexible interconnect, wherein the third substrate includes a second die arranged as a transceiver and coupled to a third antenna array.

In Example 442, the subject matter of Example 441 optionally includes wherein the third substrate is connected to a connector that is arranged to receive radio signals to be transmitted or received by the third antenna array.

In Example 443, the subject matter of any one or more of Examples 437-442 optionally include wherein the second substrate is connected to a fourth substrate that includes a third die arranged as a transceiver coupled to a fourth antenna array, wherein the second substrate and the fourth substrate are connected in a configuration such that the second substrate and the forth substrate are parallel to each.

In Example 444, the subject matter can include, or can optionally be combined with any portion or combination of, any portions of any one or more of Examples 427 through 443 to include, subject matter that can include means for performing any one or more of the functions of Examples 427 through 443, or a machine-readable medium including instructions that, when performed by a machine, cause the machine to perform any one or more of the functions of Examples 427 through 443.

Example 445 is an antenna element including: a PCB including a plurality of parallel layers; and a waveguide including a plated surface component including a dielectric attached to a first conductive layer of the PCB, a monopole antenna within the plated surface component, the monopole antenna vertical to the first conductive layer of the PCB, and an un-plated dielectric component attached to or forming part of the plated surface component, the plated surface component and the un-plated dielectric component having a predetermined shape, the un-plated dielectric component providing an impedance match from the waveguide to air.

In Example 446, the subject matter of Example 445 optionally includes wherein the monopole antenna includes a via attached to a second layer of the PCB.

In Example 447, the subject matter of any one or more of Examples 445-446 optionally include wherein the monopole antenna is fed by a conductive trace from a radio frequency integrated circuit (RFIC).

In Example 448, the subject matter of any one or more of Examples 445-447 optionally include wherein the PCB has an edge surface and the un-plated dielectric component extends beyond the edge surface.

In Example 449, the subject matter of any one or more of Examples 445-448 optionally include wherein the monopole antenna is arranged to radiate in an edge-fire manner.

In Example 450, the subject matter of any one or more of Examples 445-449 optionally include wherein the un-plated element functions as a tuning element to provide the impedance match from the waveguide to air.

In Example 451, the subject matter of any one or more of Examples 445-450 optionally include wherein the plated surface component is soldered to the first conductive layer of the PCB.

In Example 452, the subject matter of any one or more of Examples 445-451 optionally include wherein the PCB is cut to fit the predetermined shape, the PCB is cut at least partly through the first conductive layer to fit the predetermined shape, the plated surface component and the un-plated dielectric are attached to an edge of the first conductive layer that is formed by the cut to enable fitment to the predetermined shape, and the monopole antenna is a first monopole antenna that extends partly within the plated surface component; and a second monopole antenna that is at least partly within the plated surface element and perpendicular to the first monopole antenna, wherein the first monopole antenna radiates in a first polarization and the second monopole antenna radiates in a second polarization perpendicular to the first polarization.

In Example 453, the subject matter of any one or more of Examples 445-452 optionally include wherein the plated surface component includes a sandwiched structure having two parallel elements, the PCB is arranged between the two parallel elements, and the monopole antenna is fed by a transmission line arranged from the end of the waveguide.

Example 454 is an antenna array including; a PCB that includes a plurality of layers; and a plurality of antenna elements that each include a waveguide that includes a plated surface component attached to a first conductive layer of the PCB, a monopole antenna within the plated surface component, the monopole antenna vertical to a layer parallel to the first layer of the PCB, and an un-plated dielectric component attached to or forming part of the plated surface component, the plated surface component and the un-plated dielectric component having a predetermined shape, the un-plated dielectric component providing an impedance match from the waveguide to air.

In Example 455, the subject matter of Example 454 optionally includes wherein the PCB is cut to fit the predetermined shape, the PCB is cut at least partly through the first conductive layer to fit the predetermined shape, the plated surface component and the un-plated dielectric are attached to an edge of the first conductive layer that is formed by the cut to enable fitment to the predetermined shape, and the monopole antenna is a first monopole antenna that extends partly within the plated surface component; and a second monopole antenna that is at least partly within the plated surface element and perpendicular to the first monopole antenna, wherein the first monopole antenna radiates in a first polarization and the second monopole antenna radiates in a second polarization perpendicular to the first polarization.

In Example 456, the subject matter of any one or more of Examples 454-455 optionally include wherein the plated surface component includes a sandwiched structure having two parallel elements, the PCB is arranged between the two parallel elements, and the monopole antenna is fed by a transmission line arranged from the end of the waveguide.

Example 457 is a radio sub-system including: a transceiver arranged on or within a PCB that includes a plurality of parallel layers; and an antenna array coupled to the transceiver, wherein the antenna array includes a plurality of antenna elements wherein each antenna element includes a waveguide that includes a plated surface component attached to a first conductive layer of the PCB, a monopole antenna within the plated surface component, the monopole antenna vertical to a layer parallel to the first layer of the PCB, and an un-plated dielectric component attached to or forming part of the plated surface component, the plated surface component and the un-plated dielectric component having a predetermined shape, the un-plated dielectric component providing an impedance match from the waveguide to air.

In Example 458, the subject matter of Example 457 optionally includes wherein the PCB is cut to fit the predetermined shape, the PCB is cut at least partly through the first conductive layer to fit the predetermined shape, the plated surface component and the un-plated dielectric are attached to an edge of the first conductive layer that is formed by the cut to enable fitment to the predetermined shape, and the monopole antenna is a first monopole antenna that extends partly within the plated surface component; and a second monopole antenna element that is at least partly within the plated surface component and perpendicular to the first monopole antenna, wherein the first monopole antenna radiates in a first polarization and the second monopole antenna radiates in a second polarization perpendicular to the first polarization.

In Example 459, the subject matter of any one or more of Examples 457-458 optionally include wherein the plated surface component includes a sandwiched structure having two parallel elements, the PCB is arranged between the two parallel elements, and the monopole antenna is fed by a transmission line arranged from the end of the waveguide.

In Example 460, the subject matter can include, or can optionally be combined with any portion or combination of, any portions of any one or more of Examples 445 through 459 to include, subject matter that can include means for performing any one or more of the functions of Examples 445 through 459, or a machine-readable medium including instructions that, when performed by a machine, cause the machine to perform any one or more of the functions of Examples 445 through 459.

Example 461 is a dual-polarized differential antenna including: an antenna element; and four antenna ports each arranged for excitation of the antenna element, wherein a first and a second of the four ports facing opposite each other, the first and the second of the four ports arranged to be driven respectively by a signal of a first polarity and by an antiphase signal of the first polarity, and a third and a fourth of the four ports facing opposite each other and situated orthogonal to the first and the second of the four ports, the third and the fourth of the four ports arranged to be driven respectively by a signal of a second polarity and by an antiphase signal of the second polarity.

In Example 462, the subject matter of Example 461 optionally includes wherein the first and second of the four ports and the third and fourth of the four ports each forms a part of the antenna element.

In Example 463, the subject matter of any one or more of Examples 461-462 optionally include wherein the first and the second of the four ports and the third and the fourth of the four ports are each coupled to the antenna element.

In Example 464, the subject matter of any one or more of Examples 461-463 optionally include wherein at least one of the first and the second of the four ports forms a part of the antenna element.

In Example 465, the subject matter of any one or more of Examples 461-464 optionally include wherein at least one of the third and the fourth of the four ports is coupled to the antenna element.

Example 466 is a dual-polarized differential antenna array including: a plurality of antenna elements; a first port and a second port facing opposite each other, the first port and the second port arranged to be driven respectively by a signal of a first polarity and by an antiphase signal of the first polarity; and a third port and a fourth port facing opposite each other and situated orthogonal to the first port and the second port, the third port and the fourth port arranged to be driven respectively by a signal of a second polarity and by an antiphase signal of the second polarity.

In Example 467, the subject matter of Example 466 optionally includes wherein the first port and the second port and the third port and fourth port each forms a part of the antenna element.

In Example 468 the subject matter of any one or more of Examples 466-467 optionally include wherein the first port and the second port and the third port and the fourth port are each coupled to the antenna element.

In Example 469, the subject matter of any one or more of Examples 466-468 optionally include wherein at least one of the first port and the second port forms a part of the antenna element.

In Example 470, the subject matter of any one or more of Examples 466-469 optionally include wherein at least one of the third port and the fourth port is coupled to the antenna element.

Example 471 is an antenna card including: a laminate structure; an antenna element on or within the laminate structure; and four antenna ports each arranged on or within the laminate structure for excitation of the antenna element, wherein a first and a second of the four ports face opposite each other, the first and the second of the four ports arranged to be driven respectively by a signal of a first polarity and by an antiphase signal of the first polarity, and a third and a fourth of the four ports face opposite each other and are situated orthogonal to the first and the second of the four ports, the third and the fourth of the four ports arranged to be driven respectively by a signal of a second polarity and by an antiphase signal of the second polarity.

In Example 472, the subject matter of Example 471 optionally includes wherein the first and second of the four ports and the third and fourth of the four ports each forms a part of the antenna element.

In Example 473, the subject matter of any one or more of Examples 471-472 optionally include wherein the first and the second of the four ports and the third and the fourth of the four ports are each coupled to the antenna element.

In Example 474, the subject matter of any one or more of Examples 471-473 optionally include wherein at least one of the first and the second of the four ports forms a part of the antenna element.

In Example 475, the subject matter of any one or more of Examples 471-474 optionally include wherein at least one of the third and the fourth of the four ports is coupled to the antenna element.

Example 476 is an antenna card including: a laminate structure; a plurality of antenna elements arranged in a dual-polarized differential antenna array, each of the antenna elements arranged on or within the laminate structure and including: a first port and a second port facing opposite each other, the first port and the second port arranged to be driven respectively by a signal of a first polarity and by an antiphase signal of the first polarity; and a third port and a fourth port facing opposite each other and situated orthogonal to the first port and the second port, the third port and the fourth port arranged to be driven respectively by a signal of a second polarity and by an antiphase signal of the second polarity.

In Example 477, the subject matter of Example 476 optionally includes wherein the first port and second port and the third port and the fourth port each forms a part of the antenna element.

In Example 478, the subject matter of any one or more of Examples 476-477 optionally include wherein the first port and the second port and the third port and the fourth port are each coupled to the antenna element.

In Example 479, the subject matter of any one or more of Examples 476-478 optionally include wherein at least one of the first port and the second port forms a part of the antenna element.

In Example 480, the subject matter of any one or more of Examples 476-479 optionally include wherein at least one of the third port and the fourth port is coupled to the antenna element.

Example 481 is a dual-polarized differential antenna including: an antenna element arranged to be driven by a first signal of a first polarization and a second signal of a second polarization; a first port associated with the antenna element and a second port associated with the antenna element, wherein the first port and the second port are situated orthogonally to each other; a first feedline arranged to receive the first signal of the first polarization, the first feedline coupled the first port; a second feedline arranged to receive the second signal of the second polarization, the second feedline coupled to the second port; a third port associated with the antenna element and situated opposite the first port; a fourth port associated with the antenna element and situated opposite the second port; a third feedline arranged to receive a signal antiphase to the first signal, the third feedline coupled the third port; and a fourth feedline arranged to receive a signal antiphase to the second signal, the fourth feedline connected to the fourth port.

In Example 482, the subject matter of Example 481 optionally includes wherein at least one of the first port, the second port, the third port or the fourth port forms a part of the antenna.

Example 483 is a dual-polarized differential antenna array including: a plurality of antenna elements arranged in a phased array, each of the plurality of antenna elements arranged to be driven by a first signal of a first polarization, a signal antiphase to the first signal, a second signal of a second polarization and a signal antiphase to the second signal; a first port associated with a first antenna element of the plurality of antenna elements and a second port associated with the first antenna element, wherein the first port and the second port are situated orthogonally to each other; a first feedline arranged to receive the first signal of the first polarization, the first feedline coupled the first port; a second feedline arranged to receive the second signal of the second polarization, the second feedline coupled to the second port; a third port associated with the first antenna element and situated opposite the first port; a fourth port associated with the first antenna element and situated opposite the second port; a third feedline arranged to receive the signal antiphase to the first signal, the third feedline coupled the third port; and a fourth feedline arranged to receive the signal antiphase to the second signal, the fourth feedline connected to the fourth port.

In Example 484, the subject matter of Example 483 optionally includes wherein at least one of the first port, the second port, the third port or the fourth port is coupled to the first antenna element.

In Example 485, the subject matter can include, or can optionally be combined with any portion or combination of, any portions of any one or more of Examples 461 through 484 to include, subject matter that can include means for performing any one or more of the functions of Examples 461 through 484, or a machine-readable medium including instructions that, when performed by a machine, cause the machine to perform any one or more of the functions of Examples 461 through 484.

Example 486 is an apparatus of a millimeter wave (mmWave) communication device, the apparatus including: a plurality of phased antenna arrays; a receiver architecture including a plurality of receivers, the receiver architecture arranged to receive mmWave beamformed signals via a first phased antenna array of the plurality of phased antenna arrays; and a transmitter architecture including a plurality of transmitters, the transmitter architecture arranged to transmit mmWave beamformed signals via the first phased antenna array, wherein a first receiver of the plurality of receivers is receiving the mmWave beamformed signals from a first base station, while at least a second receiver of the plurality of receivers is scanning for mmWave beamformed signals from a second base station.

In Example 487, the subject matter of Example 486 optionally includes wherein each of the plurality of phased antenna arrays is associated with a corresponding one of a plurality of overlapping three-dimensional regions for transmitting and receiving electromagnetic signals.

In Example 488, the subject matter of Example 487 optionally includes degrees in a vertical plane.

In Example 489, the subject matter of any one or more of Examples 486-488 optionally include wherein each of the plurality of phased antenna arrays is a dual polarized antenna array arranged to transmit one or both of a vertically polarized (V) signal and a horizontally polarized (H) signal.

In Example 490, the subject matter of any one or more of Examples 486-489 optionally include wherein the transmitter architecture is arranged to: transmit the mmWave beamformed signals as vertically polarized (V) signals and horizontally polarized (H) signals to the first base station via the first phased antenna array.

In Example 491, the subject matter of Example 490 optionally includes multiple-input-multiple-output (MIMO) configuration using the first phased antenna array.

In Example 492, the subject matter of any one or more of Examples 490-491 optionally include wherein a first transmitter of the plurality of transmitters is arranged to transmit the V signals via the first antenna array, while a second transmitter of the plurality of transmitters is transmitting the H signals via the first antenna array.

In Example 493, the subject matter of any one or more of Examples 491-492 optionally include wherein the at least second receiver of the plurality of receivers is scanning for the mmWave beamformed signals from the second base station using a second phased antenna array of the plurality of phased antenna arrays.

In Example 494, the subject matter of any one or more of Examples 486-493 optionally include wherein the receiver architecture is arranged to: detect the mmWave beamformed signals from the second base station; and determine one or more signal characteristics of the detected mmWave beamformed signals.

In Example 495, the subject matter of Example 494 optionally includes wherein the one or more signal characteristics include a received signal strength indicator (RSSI).

In Example 496, the subject matter of any one or more of Examples 494-495 optionally include wherein the receiver architecture is arranged to: perform soft handoff from the first base station to the second base station, based on the one or more signal characteristics.

In Example 497, the subject matter of Example 496 optionally includes wherein during the soft handoff, the receiver architecture is arranged to: receive the mmWave signals from the first base station via the first antenna array and from the second base station via the second antenna array.

Example 498 is an apparatus of a millimeter wave (mmWave) communication device, the apparatus including: a plurality of phased antenna arrays, the plurality of phased antenna arrays arranged to receive or transmit signals in a plurality of three-dimensional regions providing 360 degree coverage; a transceiver architecture, including: a first transceiver arranged to receive mmWave beamformed signals of a first base station via a first phased antenna array of the plurality of phased antenna arrays; a second transceiver arranged to scan one or more mmWave frequencies for mmWave beamformed signals from a second base station, using at least a second phased antenna array of the plurality of phased antenna arrays; and a third transceiver arranged to receive or transmit mmWave beamformed signals using at least a third phased antenna array of the plurality of phased antenna arrays; and an application processor arranged to: upon detecting availability of the mmWave beamformed signals from the second base station, defer reception of the mmWave beamformed signals from the first base station and initiate reception of the mmWave beamformed signals from the second base station using the third transceiver to perform handoff.

In Example 499, the subject matter of Example 498 optionally includes wherein the second transceiver is arranged to continue scanning the one or more mmWave frequencies for mmWave beamformed signals, during the handoff.

In Example 500, the subject matter of any one or more of Examples 498-499 optionally include wherein each of the plurality of phased antenna arrays is a dual polarized antenna array arranged to transmit one or both of a vertically polarized (V) signal and a horizontally polarized (H) signal.

In Example 501, the subject matter of any one or more of Examples 498-500 optionally include wherein the first transceiver is arranged to: transmit mmWave beamformed signals to the first base station as vertically polarized (V) signals via the first phased antenna array.

In Example 502, the subject matter of Example 501 optionally includes wherein the transceiver architecture further includes a fourth transceiver, the fourth transceiver is arranged to: transmit mmWave beamformed signals to the first base station as horizontally polarized (H) signals via the first phased antenna array, while the first transceiver is transmitting the V signals.

In Example 503, the subject matter of Example 502 optionally includes wherein the second transceiver is arranged to scan the one or more mmWave frequencies at least the second phased antenna array of the plurality of phased antenna arrays, while the first transceiver and the fourth transceiver are transmitting the mmWave beamformed signals to the first base station via first phased antenna array.

In Example 504, the subject matter of any one or more of Examples 502-503 optionally include multiple-input-multiple-output (MIMO) configuration using the first phased antenna array.

Example 505 is an apparatus of a vehicle-mounted millimeter wave (mmWave) communication device, the apparatus including: a plurality of phased antenna arrays, each of the plurality of phased antenna arrays is associated with a corresponding one of a plurality of overlapping three-dimensional regions for transmitting and receiving electromagnetic signals; a receiver architecture including a plurality of receivers, the receiver architecture arranged to receive mmWave beamformed signals via a first phased antenna array of the plurality of phased antenna arrays; and a transmitter architecture including a plurality of transmitters, the transmitter architecture arranged to transmit mmWave beamformed signals via the first phased antenna array, wherein a first receiver of the plurality of receivers is receiving the mmWave beamformed signals from a first base station, while at least a second receiver of the plurality of receivers is receiving vehicle-to-vehicle (V2V) mmWave signals from at least a second vehicle using a second phased antenna array of the plurality of phased antenna arrays.

In Example 506, the subject matter of Example 505 optionally includes V mmWave signals.

In Example 507, the subject matter of any one or more of Examples 505-506 optionally include an application processor arranged to detect one or more road hazards associated with the vehicle using at least one sensor.

In Example 508, the subject matter of Example 507 optionally includes wherein a first transmitter of the plurality of transmitters is arranged to: upon detection of the one or more road hazards, transmit V2V mmWave signals indicative of the detected one or more road hazards to at least a third vehicle using a third phased antenna array of the plurality of phased antenna arrays.

The above description is intended to be illustrative, and not restrictive. For example, the above-described examples (or one or more aspects thereof) may be used in combination with others. Other aspects may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as aspects may feature a subset of said features. Further, aspects may include fewer features than those disclosed in a particular example. Thus, the following claims are hereby incorporated into the Detailed Description, with a claim standing on its own as a separate aspect. The scope of the aspects disclosed herein is to be determined with reference to the appended claims, along with the full scope of equivalents to which such claims are entitled.

Example 509 is an antenna including; a laminar substrate that includes a plurality of dielectric layers; a via within the substrate; and a feed mechanism coupled to the via, the feed mechanism arranged to supply the via with RF signals for transmission by the via.

In Example 510, the subject matter of Example 509 optionally includes wherein the via is cone shaped.

In Example 511, the subject matter of any one or more of Examples 509-510 optionally include wherein the via is a cylindrical shape or a parallelepiped shape.

In Example 5 12, the subject matter of any one or more of Examples 509-5 11 optionally include wherein the via is filled with metal or partially filled with metal, or are plated and not filled with metal.

In Example 513, the subject matter of any one or more of Examples 509-512 optionally include wherein the via has a first diameter and a second diameter and the first diameter is arranged at a boundary of a first of the plurality of dielectric layers and a portion of the via between the first diameter and the second diameter is disposed within a second of the plurality of dielectric layers.

In Example 514, the subject matter of Example 513 optionally includes wherein the first diameter is greater than the second diameter.

In Example 515, the subject matter of any one or more of Examples 509-14 optionally include wherein the via has a first diameter and a second diameter and the plurality of dielectric layers includes N dielectric layers where N is a whole number, and wherein the first diameter and the second diameter are disposed within a plurality of the N dielectric layers.

In Example 516, the subject matter of any one or more of Examples 509-515 optionally include wherein the via is fed by a horizontal feed or a vertical feed.

In Example 517, the subject matter of any one or more of Examples 509-516 optionally include wherein the transmission is end-fire transmission.

Example 518 is an antenna array including; a laminar substrate that includes a plurality of dielectric layers; a plurality of antenna elements each including at least one via disposed within the laminar substrate; and a feed mechanism coupled to the at least one via, the feed mechanism arranged to supply the plurality of antenna elements with RF signals for transmission by the plurality of antenna elements.

In Example 519, the subject matter of Example 518 optionally includes wherein at least some of the plurality of antenna elements are a cone shaped.

In Example 520, the subject matter of any one or more of Examples 518-519 optionally include wherein at least some of the plurality of antenna elements are a cylindrical shape or a parallelepiped shape.

In Example 521, the subject matter of any one or more of Examples 518-520 optionally include wherein at least some of the plurality of antenna elements are filled with metal or partially filled with metal, or are plated and not filled with metal.

In Example 522, the subject matter of any one or more of Examples 518-521 optionally include wherein the plurality of antenna elements includes part of a Radio Frequency Sub-system (RFS).

In Example 523, the subject matter of any one or more of Examples 518-522 optionally include wherein the plurality of antenna elements is made separate from the RFS and affixed to the RFS.

In Example 524, the subject matter of any one or more of Examples 518-523 optionally include wherein each of the plurality of antenna elements has a first diameter and a second diameter, and the first diameter is arranged at a boundary of a first of the plurality of dielectric layers and a portion of the each of the plurality of antenna elements between the first diameter and the second diameter is disposed within a second of the plurality of dielectric layers.

In Example 525, the subject matter of Example 524 optionally includes wherein the first diameter is greater than the second diameter.

In Example 526, the subject matter of any one or more of Examples 518-525 optionally include wherein each of the plurality of antenna elements is fed by a horizontal feed or a vertical feed.

In Example 527, the subject matter of any one or more of Examples 518-526 optionally include wherein each of the antenna elements includes two vias arranged in a back-to-back relationship.

Example 528 is a Radio Frequency Sub-system (RFS) including: a transceiver; and an antenna array coupled to the transceiver, the antenna array including a laminar substrate that includes a plurality of dielectric layers; a plurality of antenna elements each including at least one via disposed within the laminar substrate; and a feed mechanism coupled to the plurality of antenna elements, the feed mechanism arranged to supply the plurality of antenna elements with RF signals for transmission by the plurality of antenna elements.

In Example 529, the subject matter of Example 528 optionally includes wherein at least some of the plurality of antenna elements are vias have a conical shape.

In Example 530, the subject matter of any one or more of Examples 528-529 optionally include wherein at least some of the plurality of antenna elements are vias have a cylindrical shape.

In Example 531, the subject matter of any one or more of Examples 528-530 optionally include wherein at least some of the plurality of antenna elements are vias filled with metal or plated and not filled with metal.

In Example 532, the subject matter of any one or more of Examples 528-531 optionally include wherein the plurality of antenna elements is made separate from the RFS and are affixed to the RFS.

In Example 533, the subject matter of any one or more of Examples 528-532 optionally include wherein the plurality of antenna elements are vias each of which has a first diameter and a second diameter and the first diameter and the second diameter are disposed within layers of the laminar substrate.

In Example 534, the subject matter of Example 533 optionally includes wherein the first diameter is greater than the second diameter.

In Example 535, the subject matter of any one or more of Examples 528-534 optionally include wherein each of the plurality of antenna elements is fed by a horizontal feed or a vertical feed.

In Example 536, the subject matter of any one or more of Examples 528-535 optionally include wherein each of the plurality of antenna elements includes two vias arranged in a back-to-back relationship.

In Example 537, the subject matter can include, or can optionally be combined with any portion or combination of, any portions of any one or more of Examples 509 through 536 to include, subject matter that can include means for performing any one or more of the functions of Examples 509 through 536, or a machine-readable medium including instructions that, when performed by a machine, cause the machine to perform any one or more of the functions of Examples 509 through 536.

Example 538 is a three-dimensional (3D) antenna element including: a laminar substrate that includes a plurality of layers; a 3D antenna on one the plurality of layers; and a ground plane that is a modified ground plane, arranged below the 3D antenna.

In Example 539, the subject matter of Example 538 optionally includes D antenna having a largest diameter and a smallest diameter and the modified ground plane is below the smallest diameter.

In Example 540, the subject matter of Example 539 optionally includes D antenna element is fed by a strip transmission line at or adjacent to the smallest diameter.

In Example 541, the subject matter of any one or more of Examples 538-540 optionally include wherein the modified ground plane includes a diagonally slotted ground plane.

In Example 542, the subject matter of any one or more of Examples 538-541 optionally include D antenna element is a cylindrical shape or a parallelepiped shape.

In Example 543, the subject matter of any one or more of Examples 538-542 optionally include D antenna element is filled with metal or partially filled with metal, or is plated and not filled with metal.

In Example 544, the subject matter of any one or more of Examples 538-543 optionally include D antenna element is arranged to operate at millimeter wave frequencies with edge-fire operation.

Example 545 is an antenna array including; a laminar substrate that includes a plurality of layers; a plurality of 3D antenna elements affixed to one the plurality of layers; and a ground plane that is a modification of a smooth planar metallized layer, arranged below each of the 3D antenna elements.

In Example 546, the subject matter of Example 545 optionally includes wherein the at least some of the plurality of antenna elements are each affixed to the one the plurality of layers by solder.

In Example 547, the subject matter of any one or more of Examples 545-546 optionally include D antenna elements.

In Example 548, the subject matter of Example 547 optionally includes D antenna elements are fed by a strip line at or adjacent to the smallest diameter.

In Example 549, the subject matter of any one or more of Examples 545-548 optionally include wherein the modified ground plane includes a diagonally slotted ground plane.

In Example 550, the subject matter of any one or more of Examples 545-549 optionally include D antenna elements is a cylindrical shape or a parallelepiped shape.

In Example 551, the subject matter of any one or more of Examples 545-550 optionally include D antenna elements includes part of a Radio Frequency Sub-system (RFS).

In Example 552, the subject matter of any one or more of Examples 545-551 optionally include D antenna elements is made separate from the RFS and affixed to the RFS.

In Example 553, the subject matter of any one or more of Examples 545-552 optionally include D antenna elements is adjacent to a reflector that is arranged to reflect the radiation of the antenna array in a desired direction.

In Example 554, the subject matter of any one or more of Examples 545-553 optionally include D antenna elements is fed by a horizontal feed or a vertical feed.

Example 555 is a Radio Frequency Sub-system (RFS) including: a transceiver arranged on or within a laminar substrate that includes a plurality of parallel layers; an antenna array including a plurality of 3D antenna elements each affixed to a metallized layer of the laminar substrate; a ground plane that is a modified smooth planar metallized layer, the ground plane arranged below each of the 3D antenna elements; and a feed mechanism coupled from the transceiver to each of the 3D antenna elements, the feed mechanism arranged to supply the plurality of 3D antenna elements with RF signals for transmission by the plurality of 3D antenna elements.

In Example 556, the subject matter of Example 555 optionally includes D antenna elements have a conical shape or a parallelepiped shape.

In Example 557, the subject matter of any one or more of Examples 555-556 optionally include D antenna elements have a cylindrical shape.

In Example 558, the subject matter of any one or more of Examples 555-557 optionally include D antenna elements is filled with metal or plated and not filled with metal.

In Example 559, the subject matter of any one or more of Examples 555-558 optionally include D antenna elements is made separate from the RFS and are affixed to the RFS.

In Example 560, the subject matter of any one or more of Examples 555-559 optionally include D antenna elements.

In Example 561, the subject matter of any one or more of Examples 555-560 optionally include D antenna elements is fed by a horizontal feed or a vertical feed.

In Example 562, the subject matter can include, or can optionally be combined with any portion or combination of, any portions of any one or more of Examples 538 through 561 to include, subject matter that can include means for performing any one or more of the functions of Examples 538 through 561, or a machine-readable medium including instructions that, when performed by a machine, cause the machine to perform any one or more of the functions of Examples 538 through 561.

Example 563 is a receiver apparatus, including: a plurality of segmented low-noise amplifiers (LNAs), each segmented LNA including a plurality of LNA slices arranged to amplify an input RF signal to generate an amplified RF signal; a plurality of segmented down-conversion mixers, each down-conversion mixer including a plurality of down-conversion mixer slices arranged to down-convert the amplified RF signal to a baseband signal based on a dedicated local oscillator (LO) signal; and control circuitry arranged to: receive an indication of at least one signal characteristic of the input RF signal; and fire at least one LNA slice of the plurality of LNA slices and at least one mixer slice of the plurality of mixer slices based on the received indication.

In Example 564, the subject matter of Example 563 optionally includes wherein the at least one signal characteristic indicates: a bandwidth of the input RF signal; the input RF signal is a contiguous carrier aggregation signal; or the input RF signal is a non-contiguous carrier aggregation signal.

In Example 565, the subject matter of any one or more of Examples 563-564 optionally include wherein the control circuitry is arranged to: select one of a split operation mode and a switch operation mode for the receiver apparatus based on the at least one signal characteristic of the input RF signal; and fire the at least one LNA slice and the at least one mixer slice during the selected split operation mode or switch operation mode.

In Example 566, the subject matter of Example 565 optionally includes wherein input impedance at a signal input of the plurality of segmented LNAs receiving the RF signal remains constant during the split operation mode and the switch operation mode.

In Example 567, the subject matter of any one or more of Examples 565-566 optionally include wherein the control circuitry is arranged to: select the split operation mode when the at least one signal characteristic indicates the input RF signal is a non-contiguous carrier aggregation signal or a contiguous carrier aggregation signal with a bandwidth that exceeds a bandwidth of a channel filter.

In Example 568, the subject matter of any one or more of Examples 565-567 optionally include wherein the control circuitry is arranged to: select the switch operation mode when the at least one signal characteristic indicates the input RF signal is a contiguous carrier aggregation signal with a bandwidth that does not exceed a bandwidth of a channel filter.

In Example 569, the subject matter of any one or more of Examples 565-568 optionally include wherein the control circuitry is arranged to, during the switch operation mode: fire one of the plurality of segmented LNAs to amplify the input RF signal and generate the amplified RF signal; and fire one of the plurality of segmented down-conversion mixers to down-convert the amplified RF signal using the LO signal to generate the baseband signal.

In Example 570, the subject matter of Example 569 optionally includes wherein the control circuitry is arranged to, during the switch operation mode: power OFF inactive LNAs of the plurality of segmented LNAs and inactive mixers of the plurality of segmented down-conversion mixers.

In Example 571, the subject matter of any one or more of Examples 565-570 optionally include wherein the control circuitry is arranged to, during the split operation mode: fire at least two of the plurality of segmented LNAs, each of the fired segmented LNAs receiving a portion of the input RF signal and generating at least two amplified RF signals; and fire at least two of the plurality of segmented down-conversion mixers corresponding to the at least two fired segmented LNAs, to down-convert the at least two amplified RF signals to generate at least two baseband signals.

In Example 572, the subject matter of Example 571 optionally includes wherein the control circuitry is arranged to, during the split operation mode: power OFF inactive LNAs of the plurality of segmented LNAs and inactive mixers of the plurality of segmented down-conversion mixers.

In Example 573, the subject matter of any one or more of Examples 565-572 optionally include a LO generator arranged to generate the LO signal; and a divider coupled to a plurality of fan-out buffers, the divider arranged to generate a plurality of differential LO signals corresponding to the LO signal.

In Example 574, the subject matter of Example 573 optionally includes wherein the control circuitry is arranged to: select at least one of the plurality of differential LO signals for the fired at least one mixer during the split operation mode or the switch operation mode.

In Example 575, the subject matter of any one or more of Examples 565-574 optionally include wherein the control circuitry is arranged to: dynamically switch between the split operation mode and the switch operation mode based on the at least one signal characteristic of the input RF signal.

Example 576 is a receiver apparatus, including: a first RF processing chain including: a first segmented low-noise amplifier (LNA) arranged to receive a first signal portion of an input RF signal to generate a first amplified RF signal; a first segmented down-conversion mixer arranged to down-convert the first amplified RF signal using a first differential local oscillator (LO) signal to generate a first baseband signal; and a first channel filter arranged to filter the first baseband signal to generate a first filtered baseband signal; and a second RF processing chain including: a second segmented low-noise amplifier (LNA) arranged to receive a second signal portion of the input RF signal to generate a second amplified RF signal; a second segmented down-conversion mixer arranged to down-convert the second amplified RF signal using a second differential LO signal to generate a second baseband signal; and a second channel filter arranged to filter the second baseband signal to generate a first filtered baseband signal.

In Example 577, the subject matter of Example 576 optionally includes control circuitry arranged to: receive an indication of a signal characteristic of the input RF signal; and fire one of a split operation mode and a switch operation mode for the receiver apparatus based on the signal characteristic.

In Example 578, the subject matter of Example 577 optionally includes wherein the control circuitry is arranged to fire the split operation mode when the signal characteristic indicates the input RF signal is a contiguous carrier aggregation signal with a bandwidth that exceeds a bandwidth of a channel filter.

In Example 579, the subject matter of any one or more of Examples 577-578 optionally include wherein the control circuitry is arranged to fire the split operation mode when the signal characteristic indicates a bandwidth of the input RF signal is higher than a bandwidth associated with the first channel filter or the second channel filter.

In Example 580, the subject matter of any one or more of Examples 577-579 optionally include wherein the control circuitry is arranged to fire the switch operation mode when the signal characteristic indicates the input RF signal is a contiguous carrier aggregation signal with a bandwidth that does not exceed a bandwidth of a channel filter.

In Example 581, the subject matter of any one or more of Examples 577-580 optionally include wherein during the split operation mode, the control circuitry is arranged to: fire an LNA slice within each of the first segmented LNA and the second segmented LNA to generate the first amplified RF signal and the second amplified RF signal, respectively; and fire a mixer slice within each of the first segmented down-conversion mixer and the second segmented down-conversion mixer to generate the first baseband signal and the second baseband signal, respectively, wherein the input RF signal includes the first signal portion and the second signal portion.

In Example 582, the subject matter of Example 581 optionally includes wherein during the split operation mode, the control circuitry is arranged to: power OFF a plurality of remaining LNA slices within the first segmented LNA and the second segmented LNA; and power OFF a plurality of remaining mixer slices within the first segmented down-conversion mixer and the second segmented down-conversion mixer.

In Example 583, the subject matter of any one or more of Examples 577-582 optionally include wherein during the switch operation mode, the control circuitry is arranged to: fire the first segmented LNA to generate the first amplified RF signal; and fire the first segmented down-conversion mixer to generate the first baseband signal, wherein the first segmented LNA receives the input RF signal so that the first signal portion includes the input RF signal.

In Example 584, the subject matter of Example 583 optionally includes wherein during the switch operation mode, the control circuitry is arranged to: power OFF the second segmented LNA and the second segmented down-conversion mixer.

Example 585 is a wireless device, including: a phased antenna array arranged to receive an RF signal; an amplification and down-conversion block, including: a local oscillator (LO) generator arranged to generate a plurality of differential LO signals; a low noise amplifier (LNA) including a plurality of amplification stages, the LNA arranged to amplify the RF signal to generate an amplified RF signal; a plurality of segmented down-conversion mixers within a corresponding plurality of RF processing paths, each down-conversion mixer including a plurality of down-conversion mixer slices and is arranged to down-convert at least a portion of the amplified RF signal to a baseband signal based on one of the plurality of differential LO signals; and control circuitry arranged to fire at least one mixer slice within the plurality of segmented down-conversion mixers based on at least one signal characteristic of the received RF signal.

In Example 586, the subject matter of Example 585 optionally includes wherein the LNA is a two-stage LNA with a segmented output.

In Example 587, the subject matter of Example 586 optionally includes wherein the received RF signal is split at the segmented output of the LNA for communication to the at least one fired mixer slice.

In Example 588, the subject matter of any one or more of Examples 585-587 optionally include wherein each of the plurality of segmented down-conversion mixers uses a dedicated LO drive using at least one of the plurality of differential LO signals.

Example 589 is a multi-package antenna array including: a first electronic package including a first laminar substrate; a second electronic package including a second laminar substrate, the second electronic package stacked upon and in physical contact with the first electronic package; a first antenna array arranged on the first laminar substrate; a second antenna array arranged on the second laminar substrate; and at least one processor die embedded within one of the first electronic package or the second electronic package, the at least one die electrically coupled to the first antenna array and the second antenna array, the at least one semiconductor die including at least one radio transceiver arranged to operate in a first frequency range and in a second frequency range.

In Example 590, the subject matter of Example 589 optionally includes wherein the at least one die is coupled to the first antenna array and the second antenna via electronic circuitry that is printed on or within the first laminar substrate or on or within the second laminar substrate, and that provides an electrical function between the at least one die and the first or the second antenna arrays.

In Example 591, the subject matter of Example 590 optionally includes wherein the electronic circuitry is implemented by an external substrate front end (eSFE) or an integrated substrate frontend (iSFE).

In Example 592, the subject matter of Example 591 optionally includes wherein the electronic circuitry includes a surface mounted device.

In Example 593, the subject matter of any one or more of Examples 591-592 optionally include wherein the electronic circuitry is printed within the first electronic package or the second electronic package in the same plane as the at least one die.

In Example 594, the subject matter of any one or more of Examples 591-593 optionally include wherein the electronic circuitry includes one of a filter, a balun, a multiplexer, a coupler, or an antenna.

In Example 595, the subject matter of any one or more of Examples 591-594 optionally include wherein at least one antenna array is within one of the first electronic package or the second electronic package.

In Example 596, the subject matter of any one or more of Examples 591-595 optionally include wherein at least one antenna array is external to one of the first electronic package or the second electronic package.

In Example 597, the subject matter of any one or more of Examples 589-596 optionally include wherein the at least one die includes a first transceiver that operates in the first frequency range and a second transceiver that operates in the second frequency range.

In Example 598, the subject matter of any one or more of Examples 591-597 optionally include wherein the at least one die includes a first die embedded on or within the first electronic package and operates in the first frequency range, and a second die embedded within the second electronic package and operates in the second frequency range, and the printed electronic circuitry supports the first die and is located on or within the first electronic package.

In Example 599, the subject matter of any one or more of Examples 591-598 optionally include wherein the at least one die includes a first die embedded on or within the first electronic package and operates in the first frequency range and a second die embedded within the second electronic package and operates in the second frequency range, and the printed electronic circuitry supports the first die and is located on or within the second electronic package.

In Example 600, the subject matter of any one or more of Examples 591-599 optionally include a third electronic package stacked upon and in physical contact with the second electronic package, wherein the at least one die includes a first die located on or embedded within the first electronic package and operates in the first frequency range, and a second die embedded within the second electronic package and operates in the second frequency range, and a third die embedded within the third electronic package and operates in a third frequency range, and the printed electronic circuitry supports the first die and is located on or within the first electronic package, the second electronic package, or the third electronic package.

In Example 601, the subject matter of any one or more of Examples 591-600 optionally include a third electronic package stacked upon and in physical contact with the second electronic package, wherein the at least one die includes a first die located on or embedded within the first electronic package and operates in the first frequency range, and a second die embedded within the second electronic package and operates in the second frequency range, and a third die embedded within the third electronic package and operates in a third frequency range, and the printed electronic circuitry supports the second die and is located on or within the first electronic package, the second electronic package, or the third electronic package.

In Example 602, the subject matter of any one or more of Examples 591-601 optionally include a third electronic package stacked upon and in physical contact with the second electronic package, wherein the at least one die includes a first die located on or embedded within the first electronic package and operates in the first frequency range, and a second die embedded within the second electronic package and operates in the second frequency range, and a third die embedded within the third electronic package and operates in a third frequency range, and the printed electronic circuitry supports the third die and is located on or within the first electronic package, the second electronic package, or the third electronic package.

Example 603 is a first electronic package including: a first laminar substrate; a first antenna array arranged on the first laminar substrate; and at least one processor die embedded within the first laminar substrate, the at least one die coupled to the first antenna array or the second antenna via electronic circuitry that is printed on or within the first laminar substrate and that provides an electrical function between the at least one die and the first antenna array or the second antenna array.

In Example 604, the subject matter of Example 603 optionally includes wherein the electronic circuitry is implemented with an external substrate front end (eSFE) or an integrated substrate frontend (iSFE).

In Example 605, the subject matter of Example 604 optionally includes wherein the printed electronic circuitry includes a surface mounted device.

In Example 606, the subject matter of any one or more of Examples 604-605 optionally include wherein the printed electronic circuitry includes one of a filter, a balun, a multiplexer, a coupler, or an antenna.

In Example 607, the subject matter of any one or more of Examples 604-606 optionally include wherein the antenna array is within the first electronic package.

In Example 608, the subject matter of any one or more of Examples 604-607 optionally include wherein the antenna array is external to the first electronic package.

In Example 609, the subject matter of any one or more of Examples 604-608 optionally include a second electronic package stacked upon and physically connected to the first electronic package, the second electronic package including a second laminar substrate and a second antenna array arranged on the second laminar substrate, wherein the at least one die includes a first die embedded on or within the first electronic package and operates in a first frequency range, and a second die embedded within the second electronic package and operates in a second frequency range, and the electronic circuitry supports the first die and is located on or within the first electronic package.

In Example 610, the subject matter of any one or more of Examples 604-609 optionally include wherein the at least one die includes a first die embedded on or within the first electronic package and operates in a first frequency range and a second die embedded within the second electronic package and operates in a second frequency range, and the electronic circuitry supports the first die and is located on or within the second electronic package.

In Example 611, the subject matter can include, or can optionally be combined with any portion or combination of, any portions of any one or more of Examples 1 through 610 to include, subject matter that can include means for performing any one or more of the functions of Examples 1 through 610, or a machine-readable medium including instructions that, when performed by a machine, cause the machine to perform any one or more of the functions of Examples 1 through 610.

Example 612 is a dual transceiver system, including: a first transceiver arranged to receive a plurality of baseband signals, to up-convert the plurality of baseband signals to a horizontally polarized radio frequency (RF) signal in a first 5G frequency band and a vertically polarized RF signal in a 5G second frequency band, and to transmit the up-converted RF signals over a transmission line; and a second transceiver arranged to receive the up-converted RF signals over the transmission line, to up-convert the horizontally polarized RF signal in the first 5G frequency band to a horizontally polarized RF signal in the second frequency band, and to transmit the horizontally polarized RF signal in the second frequency band and the vertically polarized 5G RF signal in the second frequency band to an antenna sub-system, wherein the transmission line is connected between the first transceiver and the second transceiver and arranged to be the sole conductor of the up-converted RF signals between the first transceiver and the second transceiver, and wherein the second 5G frequency band is a 5G ecosystem frequency band that is supported in a geography in which a using system that is associated with the dual transceiver system is located, and the first 5G frequency band is a 5G ecosystem frequency band that is not supported in the geography.

In Example 613, the subject matter of Example 612 optionally includes wherein the first transceiver is further arranged to transmit at least one RF signal in a WiGig frequency band over the transmission line and the second transceiver is further arranged to receive the transmitted RF signal in the WiGig frequency band over the transmission line and to transmit the received at least one RF signal in the WiGig frequency band to the antenna sub-system.

In Example 614, the subject matter of any one or more of Examples 612-613 optionally include wherein the second transceiver includes a plurality switches in a first configuration that enables conversion of the horizontally polarized RF signal in the first frequency band to the horizontally polarized RF signal in the second frequency band, transmission of the converted horizontally polarized RF signal in the second frequency band, and transmission of the vertically polarized RF signal in the second frequency band, wherein the horizontally polarized RF signal in the second frequency band and the vertically polarized RF signal in the second frequency band are transmitted to the antenna sub-system.

In Example 615, the subject matter of Example 614 optionally includes wherein the second transceiver further includes a mixer connected to a first of the switches and to a conductor that transmits a local oscillator RF signal from the first transceiver, the mixer arranged to convert the horizontally polarized RF signal in the first frequency band to the horizontally polarized RF signal in the second frequency band.

In Example 616, the subject matter of any one or more of Examples 612-615 optionally include G frequency band are transmitted to the antenna sub-system.

In Example 617, the subject matter of Example 616 optionally includes G frequency band.

In Example 618, the subject matter of any one or more of Examples 612-617 optionally include wherein the antenna sub-system includes at least one antenna array that is arranged for multiple input-multiple output (MIMO) operation.

In Example 619, the subject matter of Example 618 optionally includes wherein the at least one antenna array that is arranged for MIMO operation includes an antenna array that is arranged to radiate a vertically polarized information stream and a horizontally polarized information stream.

In Example 620, the subject matter of any one or more of Examples 618-619 optionally include G frequency band.

In Example 621, the subject matter of Examples 618-620 optionally include wherein the at least one antenna array arranged for MIMO operation includes two antenna arrays each arranged to operate in the second 5G band.

In Example 622, the subject matter of any one or more of Examples 612-621 optionally include wherein the at least one antenna array includes an antenna array arranged to operate in a WiGig frequency band.

In Example 623, the subject matter of any one or more of Examples 612-622 optionally include G frequency band.

In Example 624, the subject matter of any one or more of Examples 612-623 optionally include G frequency band.

In Example 625, the subject matter of any one or more of Examples 612-624 optionally include G frequency band.

In Example 626, the subject matter of any one or more of Examples 615-625 optionally include G frequency band.

In Example 627, the subject matter of any one or more of Examples 612-626 optionally include wherein the first transceiver includes a third DAC arranged to supply a third broadband signal, a third DPLL arranged to supply an RF signal in a WiGig frequency band, and a third mixer connected to the third DAC and to the third DPLL, the third mixer arranged to convert the third broadband signal to an RF signal in the WiGig frequency band.

In Example 628, the subject matter of any one or more of Examples 615-627 optionally include the first transceiver further including a first plurality of bandpass filters wherein the horizontally polarized RF signal in the first 5G frequency band is transmitted to the transmission line via a first of the first bandpass filters arranged to filter the first 5G frequency band, the vertically polarized RF signal in the second 5G frequency band is transmitted to the transmission line via a second of the first bandpass filters arranged to filter the second 5G frequency band, the RF signal in the WiGig frequency band is transmitted to the transmission line via a third of the first bandpass filters arranged to filter the WiGig frequency band, and the local oscillator RF signal is transmitted to the transmission line via a fourth of the first bandpass filters arranged to filter the local oscillator frequency.

In Example 629, the subject matter of Example 628 optionally includes the second transceiver further including a second plurality of band pass filters wherein the horizontally polarized RF signal in the first 5G frequency band is received from the transmission line via a first of the second bandpass filters arranged to filter the first 5G frequency band, the vertically polarized RF signal in the second 5G frequency band is received from the transmission line via a second of the second bandpass filters arranged to filter the second 5G frequency band, the RF signal in the WiGig frequency band is received from the transmission line via a third of the second bandpass filters arranged to filter the WiGig frequency band, and the local oscillator RF signal is received from the transmission line via a fourth of the second bandpass filters arranged to filter the local oscillator frequency.

In Example 630, the subject matter of any one or more of Examples 612-629 optionally include a radio transceiver control system located in the second transceiver and arranged to control the second transceiver, wherein the radio transceiver control system is arranged to receive clock information transmitted by the first transceiver over the transmission line via a low pass filter in the first transceiver, and received by the second transceiver over the transmission line via a low pass filter in the second transceiver.

In Example 631, the subject matter of Example 630 optionally includes wherein clock information is generated in the first transceiver by a reference clock coupled to a third DPLL.

In Example 632, the subject matter of any one or more of Examples 630-631 optionally include wherein radio transceiver control system is arranged to receive control information transmitted by a control modem coupled to the third DPLL in the first transceiver, wherein the control modem receives the control information from a processor and clocking information from the third DPLL, and transmits the control information over the transmission line via a fifth of the first bandpass filters arranged to filter a frequency of the third DPLL.

In Example 633, the subject matter of Example 632 optionally includes wherein the control information is received by the second transceiver over the transmission line via a fifth of the second bandpass filters arranged to filter the frequency of the third DPLL.

In Example 634, the subject matter of any one or more of Examples 612-633 optionally include G frequency band.

In Example 635, the subject matter of Example 634 optionally includes G frequency band.

In Example 636, the subject matter of any one or more of Examples 634-635 optionally include G frequency band.

In Example 637, the subject matter of any one or more of Examples 634-636 optionally include wherein a loopback test is performed after the first conversion to resolve In-phase and quadrature (IQ) imbalance that exists after the first conversion.

Example 638 is a dual conversion radio frequency (RF) system including: a digital to analog convertor (DAC) arranged to supply broadband signals; a first digital phase locked loop (DPLL) arranged to supply an RF signal in a first 5G frequency band; a frequency convertor to down-convert the RF signal in the first 5G frequency band to an RF signal in a second 5G frequency band that is lower than the first 5G frequency band; a first mixer connected to the DAC and to the frequency convertor; at least one switch arranged to set the RF dual transceiver system to a test mode, wherein the at least one switch enables testing for and correction of RF signal errors at the second 5G frequency band; a second DPLL arranged to supply an RF signal at a third 5G frequency band; a second mixer connected to an output of the first mixer and to the second DPLL and arranged to convert the RF signal in the second 5G frequency band to an RF signal in a fourth 5G frequency band that is higher than the second 5G frequency band, after correction of RF signal errors at the second 5G frequency band.

In Example 639, the subject matter of Example 638 optionally includes wherein the RF signal errors include In-phase and Quadrature (IQ) imbalance.

In Example 640, the subject matter of any one or more of Examples 638-639 optionally include G frequency band.

In Example 641, the subject matter of any one or more of Examples 617-640 optionally include G frequency band.

In Example 642, the subject matter of any one or more of Examples 617-641 optionally include the first transceiver further including a first plurality of bandpass filters wherein the horizontally polarized RF signal in the first 5G frequency band is transmitted to the transmission line via a first of the first bandpass filters arranged to filter the first 5G frequency band, the vertically polarized RF signal in the second 5G frequency band is transmitted to the transmission line via a second of the first bandpass filters arranged to filter the second 5G frequency band, the RF signal in the WiGig frequency band is transmitted to the transmission line via a third of the first bandpass filters arranged to filter the WiGig frequency band, and the local oscillator RF signal is transmitted to the transmission line via a fourth of the first bandpass filters arranged to filter the local oscillator frequency.

In Example 643, the subject matter of Example 642 optionally includes the second transceiver further including a second plurality of band pass filters wherein the horizontally polarized RF signal in the first 5G frequency band is received from the transmission line via a first of the second bandpass filters arranged to filter the first 5G frequency band, the vertically polarized RF signal in the second 5G frequency band is received from the transmission line via a second of the second bandpass filters arranged to filter the second 5G frequency band, the RF signal in the WiGig frequency band is received from the transmission line via a third of the second bandpass filters arranged to filter the WiGig frequency band, and the local oscillator RF signal is received from, the transmission line via a fourth of the second bandpass filters arranged to filter the local oscillator frequency.

Example 644 is a dual transceiver system, including: a first transceiver arranged to receive a plurality of baseband signals, to up-convert the plurality of baseband signals to a horizontally polarized radio frequency (RF) signal in a first 5G frequency band and a vertically polarized RF signal in a second 5G frequency band, and to transmit the up-converted RF signals over a transmission line; and a second transceiver including: a plurality switches in a first configuration that enables conversion of the horizontally polarized RF signal in the first frequency band to a horizontally polarized RF signal in the second frequency band, transmission of the converted horizontally polarized RF signal in the second frequency band, and transmission of the vertically polarized RF signal in the second frequency band, wherein the horizontally polarized RF signal in the second frequency band and the vertically polarized RF signal in the second frequency band are transmitted to the antenna sub-system; or a plurality of switches in a second configuration that enables conversion of the vertically polarized RF signal in the second 5G frequency band to a horizontally polarized RF signal in the first 5G frequency band, transmission of the converted horizontally polarized RF signal in the first 5G frequency band, and transmission of a the vertically polarized RF signal in the first 5G frequency band, wherein the horizontally polarized RF signal in the first 5G frequency band and the vertically polarized RF signal in the first 5G frequency band are transmitted to the antenna sub-system, wherein the transmission line is connected between the first transceiver and the second transceiver and arranged to be the sole conductor of the up-converted RF signals between the first transceiver and the second transceiver, wherein the second 5G frequency band is a 5G ecosystem frequency band that is supported in a geography in which a using system that is associated with the dual transceiver system is located, and the first 5G frequency band is a 5G ecosystem frequency band that is not supported in the geography, wherein the first transceiver, the second transceiver and the transmission line include part of a mobile device; and wherein the plurality of switches in the first configuration and the plurality of switches in the second configuration are the same plurality of switches, and the plurality of switches are further arranged to be automatically set to the first configuration or to the second configuration based on the location of the mobile device or based on an Internet service provider that provides services for access to and use of the Internet to the mobile device.

Example 645 is a method of transmitting RF signals to an antenna sub-system in a plurality of frequency bands, including: configuring a first transceiver to receive a plurality of baseband signals, to up-convert the plurality of baseband signals to a horizontally polarized first radio frequency (RF) signal in a first 5G frequency band and a vertically polarized RF signal in a second 5G frequency band, and to transmit the up-converted RF signals over a transmission line; configuring a second transceiver to receive the up-converted RF signals over the transmission line, to down-convert the horizontally polarized RF signal in the first 5G frequency band to a horizontally polarized RF signal in the second 5G frequency band, and to transmit the horizontally polarized RF signal in the second frequency band and the vertically polarized 5G RF signal in the second frequency band to an antenna sub-system; and configuring the transmission line to be the sole conductor of the up-converted RF signals from the first transceiver to the second transceiver.

In Example 646, the subject matter of Example 645 optionally includes configuring the first transceiver to transmit an RF signal in a WiGig frequency band over the transmission line and configuring the second transceiver to receive the transmitted RF signal in the WiGig frequency band over the transmission line and to transmit the received RF signal in the WiGig frequency band to the antenna sub-system.

In Example 647, the subject matter of any one or more of Examples 645-646 optionally include configuring a plurality of switches in the second transceiver to enable conversion of the horizontally polarized RF signal in the first 5G frequency band to the horizontally polarized RF signal in the second 5G frequency band, to transmit the converted horizontally polarized RF signal in the second 5G frequency band, and to transmit the vertically polarized second RF signal in the second 5G frequency band, wherein the horizontally polarized RF signal in the second 5G frequency band and the vertically polarized RF signal in the second 5G frequency band are transmitted to the antenna sub-system.

In Example 648, the subject matter of Example 647 optionally includes G frequency band.

In Example 649, the subject matter of any one or more of Examples 645-648 optionally include configuring a plurality of switches in the second transceiver to enable conversion of the vertically polarized RF signal in the second 5G frequency band to the vertically polarized RF signal in the first 5G frequency band, to transmit the converted vertically polarized RF signal in the first 5G frequency band, and to transmit the horizontally polarized RF signal in the first 5G frequency band, wherein the horizontally polarized RF signal in the first 5G frequency band and the vertically polarized RF signal in the first 5G frequency band are transmitted to the antenna sub-system.

In Example 650, the subject matter of Example 649 optionally includes G frequency band.

In Example 651, the subject matter of any one or more of Examples 645-650 optionally include wherein the antenna sub-system includes at least one antenna array, the method further including configuring the at least one antenna array for multiple input-multiple output (MIMO) operation.

In Example 652, the subject matter of Example 651 optionally includes configuring the at least one antenna array that is arranged for MIMO operation to radiate a vertically polarized information stream and a horizontally polarized information stream.

In Example 653, the subject matter of any one or more of Examples 651-652 optionally include G frequency band.

In Example 654, the subject matter of any one or more of Examples 651-653 optionally include wherein the at least one antenna array includes an dual antenna array, the method further including configuring the dual antenna array to operate in a WiGig frequency band.

In Example 655, the subject matter of any one or more of Examples 645-654 optionally include G frequency band.

In Example 656, the subject matter of any one or more of Examples 645-655 optionally include configuring a radio transceiver control system located in the second transceiver to control the second transceiver, by receiving clock information transmitted by the first transceiver over the transmission line via a low pass filter in the first transceiver, the clock information received by the second transceiver over the transmission line via a low pass filter in the second transceiver.

In Example 657, the subject matter of Example 656 optionally includes wherein clock information is generated in the first transceiver by a reference clock coupled to a third DPLL.

In Example 658, the subject matter of Example 657 optionally includes configuring the radio transceiver control system to control the second transceiver by receiving control information transmitted by a control modem coupled to the third DPLL in the first transceiver, wherein the control modem receives the control information from a processor and receives clocking information from the third DPLL and transmits the control information over the transmission line via a bandpass filter, that is arranged to filter a frequency of the third DPLL.

In Example 659, the subject matter of Example 658 optionally includes wherein the control information is received by the second transceiver over the transmission line via a bandpass filter in the second transceiver, the bandpass filter arranged to filter the frequency of the third DPLL.

In Example 660, the subject matter of any one or more of Examples 645-659 optionally include G frequency band.

In Example 661, the subject matter of Example 660 optionally includes G frequency band.

Example 662 is a method of dual conversion in a radio frequency (RF) system, the method including: configuring a digital to analog convertor (DAC) to supply broadband signals; configuring a first digital phase locked loop (DPLL) to supply an RF signal in a first 5G frequency band; configuring a frequency convertor to down-convert the RF signal in the first 5G frequency band to an RF signal in a second 5G frequency band that is lower than the first 5G frequency band; connecting a first mixer to the DAC and to the frequency convertor; configuring the RF system to a loopback mode to enable testing for and correction of RF signal errors at the second 5G frequency band; configuring a second DPLL to supply an RF signal at a third frequency; connecting a second mixer to an output of the first mixer and to the second DPLL; and configuring the second mixer to convert the RF signal in the second 5G frequency band to an RF signal in a fourth 5G frequency band that is higher than the second 5G frequency band, after correction of RF signal errors at the second 5G frequency band.

In Example 663, the subject matter of any one or more of Examples 661-662 optionally include wherein the RF signal errors include an In-phase and Quadrature (IQ) imbalance.

In Example 664, the subject matter of any one or more of Examples 661-663 optionally include G frequency band.

Example 665 is an apparatus of a communication device. The apparatus may comprise a digital polar transmitter. The digital polar transmitter may comprise: a rectangular-to-polar converter, a digital-to-time converter (DTC) and an output oscillator. The rectangular-to-polar converter may be configured to provide a polar output signal based on a rectangular input signal supplied thereto. The DTC may be configured to receive a radio frequency (RF) oscillator signal and in response provide a DTC output signal based on the polar output signal. The output oscillator may be configured to receive the DTC output signal and an output oscillator signal at a mmWave frequency.

In example 666, the subject matter of example 665 optionally includes that the output oscillator may comprise a pulse shaper and an injection oscillator. The pulse shaper may be configured to receive the DTC output signal and provide harmonics of the DTC output signal at the mmWave frequency. The injection oscillator may be configured to receive the harmonic from the pulse shaper and lock the output oscillator signal to the harmonics to produce the output oscillator signal at the mmWave frequency.

In example 667, the subject matter of example 666 optionally includes that the pulse shaper and injection oscillator form an integral circuit.

In example 668, the subject matter of example 667 optionally includes that the integral circuit may comprise a tank circuit and an injection locking circuit. The tank circuit may comprise an inductor-capacitor combination configured to resonate at the mmWave frequency. The injection locking circuit may be configured to receive the harmonics of the DTC output signal and induce the tank circuit to resonate at the mmWave frequency. The injection locking circuit may comprise series-connected transistors to which the harmonics of the DTC output signal are supplied as gate voltages to inject current into the tank circuit.

In example 669, the subject matter of any one or more of examples 665-668 optionally include that the DTC may comprise a time-interleaved DTC that comprises a plurality of individual DTCs configured to be triggered at different times.

In example 670, the subject matter of example 669 optionally includes that the digital polar transmitter may further comprise a serial-to-parallel converter to convert the polar output signal from the rectangular-to-polar converter to a digital word, and supply the digital word to the plurality of individual DTCs to generate the DTC output signal.

In example 671, the subject matter of example 670 optionally includes that the time-interleaved DTC may further comprise a logical combiner configured to combine outputs from the individual DTCs to generate the DTC output signal.

In example 672, the subject matter of any one or more of examples 665-671 optionally include that the DTC may be configured to dynamically delay an edge of the RF oscillator signal every period to introduce phase modulation in generation of the DTC output signal.

In example 673, the subject matter of example 672 optionally includes that the digital polar transmitter may further comprise a multi-modulus divider configured to reduce a frequency of the RF oscillator signal to an intermediate frequency and a digitally-controlled edge interpolator configured to receive the intermediate frequency and in response generate self-aligned phase signals based thereon at a higher frequency.

In example 674, the subject matter of any one or more of examples 665-673 optionally include an antenna that may be configured to transmit a signal dependent on the output oscillator signal.

Example 675 is a method of providing a mmWave frequency signal. The method may comprise receiving a reference oscillation signal and employing a multi-stage process to generate a phase modulated output signal at a mmWave frequency based on the reference oscillation signal. The multi-stage process may comprise reducing a frequency of the reference oscillation signal to a lower frequency signal; modulating, dependent on an input signal, a phase of the lower frequency signal at a digital-to-time converter (DTC) to generate a phase-modulated signal at a frequency higher than that of the lower frequency signal; transmitting the phase-modulated signal from the DTC to an oscillator circuit; and generating a phase-modulated signal at the mmWave frequency at the oscillator circuit based on the phase-modulated signal.

In example 676, the subject matter of example 675 optionally includes that generating the phase-modulated signal at the mmWave frequency may comprise amplifying a harmonic of the phase-modulated signal and locking an oscillator signal of the oscillator circuit to the harmonic to generate the output oscillator signal.

In example 677, the subject matter of example 676 optionally includes that locking the oscillator signal of the oscillator circuit to the harmonic may comprise injecting, via series connected transistors, current into a tank circuit to induce the tank circuit to resonate at the mmWave frequency.

In example 678, the subject matter of any one or more of examples 675-677 optionally include that modulating the phase of the lower frequency signal may comprise providing a digital word to a plurality of individual DTCs of the DTC. The digital word may be dependent on the input signal. The modulating may further comprise triggering the individual DTCs based on the digital word.

In example 679, the subject matter of example 678 optionally includes that modulating the phase of the lower frequency signal may comprise converting a rectangular input signal into a polar output signal and generating parallel copies of the digital word, to send the copies of the digital word to the individual DRCs, based on the polar output signal.

In example 680, the subject matter of example 679 optionally includes that modulating the phase of the lower frequency signal may comprise logically combining outputs from the individual DTCs to generate the phase-modulated signal.

In example 681, the subject matter of any one or more of examples 675-680 optionally include wherein modulating the phase of the lower frequency signal may comprise dynamically delaying an edge of the reference oscillator signal every period to introduce phase modulation to generate the phase-modulated signal.

In example 682, the subject matter of example 681 optionally includes using edge interpolation to generate self-aligned phase signals based on the lower frequency signal.

Example 683 is an apparatus of a digital polar transmitter. The apparatus may comprise means for converting a rectangular input signal into a polar output signal for a digital-to-time converter (DTC); means for receiving a reference oscillation signal; means for reducing a frequency of the reference oscillation signal to a lower frequency signal; means for modulating, depending on the input signal, a phase of the lower frequency signal at the DTC to generate a phase-modulated signal at a frequency higher than the lower frequency signal; means for transmitting the phase-modulated signal from the DTC to an oscillator circuit; and means for generating a phase-modulated signal at a mmWave frequency at the oscillator circuit based on the phase-modulated signal.

In example 684, the subject matter of example 683 optionally includes means for amplifying a harmonic of the phase-modulated signal and means for locking an oscillator signal of the oscillator circuit to the harmonic to generate the output oscillator signal.

In example 685, the subject matter of example 684 optionally includes means for injecting, via series connected transistors, current into a tank circuit to induce the tank circuit to resonate at the mmWave frequency.

In example 686, the subject matter of any one or more of examples 683-685 optionally include means for providing a digital word to a plurality of individual DTCs of the DTC, the digital word dependent on the polar output signal; and means for triggering the individual DTCs based on the digital word.

In example 687, the subject matter of example 686 optionally includes means for generating parallel copies of the digital word, to send to the individual DRCs, based on the polar output signal.

In example 688, the subject matter of example 687 optionally includes means for logically combining outputs from the individual DTCs to generate the phase-modulated signal.

In example 689, the subject matter of any one or more of examples 683-688 optionally include means for dynamically delaying an edge of the reference oscillator signal every period to introduce phase modulation to generate the phase-modulated signal.

In example 690, the subject matter of example 689 optionally includes means for using edge interpolation to generate self-aligned phase signals based on the lower frequency signal.

Example 691 is a computer-readable storage medium that stores instructions for execution by one or more processors of a communication device. The one or more processors may configure the communication device to reduce a frequency of a reference oscillation signal to a lower frequency signal. The one or more processors may further configure the communication device to modulate, at a digital-to-time converter (DTC), a phase of the lower frequency signal to generate a phase-modulated signal at the frequency of the reference oscillation signal. The one or more processors may further configure the communication device to transmit the phase-modulated signal from the DTC to an oscillator circuit. The one or more processors may further configure the communication device to generate a phase-modulated signal at a mmWave frequency at the oscillator circuit based on the phase-modulated signal.

In example 692, the subject matter of example 691 optionally includes that the one or more processors may further configure the communication device to amplify a harmonic of the phase-modulated signal and lock an oscillator signal of the oscillator circuit to the harmonic to produce the output oscillator signal.

In example 693, the subject matter of example 692 optionally includes that the one or more processors may further configure the communication device to inject, via series connected transistors, current into a tank circuit to induce the tank circuit to resonate at the mmWave frequency.

In example 694, the subject matter of any one or more of examples 691-693 optionally include that the one or more processors may further configure the communication device to convert a rectangular input signal into a polar output signal. The one or more processors may further configure the communication device to provide a digital word to a plurality of individual DTCs of the DTC. The digital word may be dependent on the polar output signal. The one or more processors may further configure the communication device to trigger the individual DTCs based on the digital word.

In example 695, the subject matter of example 694 optionally includes that the one or more processors may further configure the communication device to generate parallel copies of the digital word, to send to the individual DRCs, based on the polar output signal.

In example 696, the subject matter of example 695 optionally includes that the one or more processors may further configure the communication device to logically combine outputs from the individual DTCs to generate the phase-modulated signal.

Example 697 is an apparatus of a receiver. The apparatus may comprise a feedforward equalizer (FFE). The FFE may comprise a plurality of FFE stages connected in series and to which vertically and horizontally polarized in-phase (I) and quadrature-phase (Q) signals are provided in parallel. Each FFE stage may comprise a plurality of delays. The vertically and horizontally polarized I and Q signals may be cross-coupled at a tap adjacent to each delay. The cross-coupling may be configured to provide cross-coupled vertically and horizontally polarized I and Q signals.

In example 698, the subject matter of example 697 optionally includes that the delays may comprise: horizontal I delays on a horizontally polarized I signal line on which a horizontally polarized I input signal is provided, horizontal Q delays on a horizontally polarized Q signal line on which a horizontally polarized Q input signal is provided, vertically polarized I delays on a vertically polarized I signal line on which a vertically polarized I input signal is provided, and vertically polarized Q delays on a vertically polarized Q signal line on which a vertically polarized Q input signal is provided.

In example 699, the subject matter of any one or more of examples 697-698 optionally include that each cross-coupling may comprise: a first set of multipliers each configured to weight the vertically polarized I signal supplied to the cross-coupling to produce a weighted vertically polarized I signal, a second set of multipliers each configured to weight the horizontally polarized I signal supplied to the cross-coupling to produce a weighted horizontally polarized I signal, a third set of multipliers each configured to weight the vertically polarized Q signal supplied to the cross-coupling to produce a weighted vertically polarized Q signal, a fourth set of multipliers each configured to weight the horizontally polarized Q signal supplied to the cross-coupling to produce a weighted horizontally polarized Q signal.

In example 700, the subject matter of example 699 optionally includes that weighting coefficients of at least some of the first, second, third and fourth set of multipliers are independent of each other.

In example 701, the subject matter of example 700 optionally includes that the weighting coefficients of at least one of the first, second, third and fourth set of multipliers are independent of the weighting coefficients of at least another of the first, second, third and fourth set of multipliers.

In example 702, the subject matter of any one or more of examples 700-701 optionally include that each weighting coefficient within one of the first, second, third and fourth set of multipliers is independent of other weighting coefficients within the one of the first, second, third and fourth set of multipliers.

In example 703, the subject matter of any one or more of examples 699-702 optionally include that each cross-coupling may comprise a first of the weighted vertically polarized I signals combined with a first of the weighted horizontally polarized I signals, a first of the weighted vertically polarized Q signals and a first of the weighted horizontally polarized Q signals to provide a combined I horizontal polarized signal, a second of the weighted horizontally polarized I signals combined with a second of the weighted vertically polarized I signals, a second of the weighted vertically polarized Q signals and a second of the weighted horizontally polarized Q signals to provide a combined vertically polarized I signal, a third of the weighted vertically polarized Q signals combined with a third of the weighted horizontally polarized I signals, a third of the weighted vertically polarized I signals and a third of the weighted horizontally polarized Q signals to provide a combined Q horizontal polarized signal, and a fourth of the weighted horizontally polarized Q signals combined with a fourth of the weighted vertically polarized I signals, a fourth of the weighted vertically polarized Q signals and a fourth of the weighted horizontally polarized I signals to provide a combined vertically polarized Q signal.

In example 704, the subject matter of any one or more of examples 699-703 optionally include that in one of the FFE stages: the combined I horizontal polarized signal of each cross-coupling may be combined to form an output horizontally polarized I signal from the one of the FFE stages and the output horizontally polarized I signal may be provided one of as an input horizontally polarized I signal to another FFE stage or as an output horizontally polarized I signal of the FFE. In the FFE stage, the combined vertically polarized I signal of each cross-coupling may be combined to form an output vertically polarized I signal from the one of the FFE stages and the output vertically polarized I signal may be provided one of as an input vertically polarized I signal to the other FFE stage or as an output vertically polarized I signal of the FFE. In the FFE stage, the combined Q horizontal polarized signal of each cross-coupling may be combined to form an output horizontally polarized Q signal from the one of the FFE stages and the output horizontally polarized Q signal is provided one of as an input horizontally polarized Q signal to the other FFE stage or as an output horizontally polarized Q signal of the FFE; and the combined vertically polarized Q signal of each cross-coupling is combined to form an output vertically polarized Q signal from the one of the FFE stages and the output vertically polarized Q signal is provided one of as an input vertically polarized Q signal to the other FFE stage or as an output vertically polarized Q signal of the FFE.

In example 705, the subject matter of any one or more of examples 697-704 optionally include that a number of taps is the same in each FFE stage.

In example 706, the subject matter of any one or more of examples 697-705 optionally include that a number of taps in at least one FFE stage is different from a number of taps in at least one other FFE stage.

In example 707, the subject matter of example 706 optionally includes that a number of taps tapers across the FFE stages.

In example 708, the subject matter of any one or more of examples 699-707 optionally include that a number of taps corresponds to a number of pre-cursor inter-symbol interference (ISI) to be cancelled, each tap configured to cancel a different pre-cursor ISI type.

In example 709, the subject matter of example 708 optionally includes that each FFE stage comprises vertically polarized I (VI) signals, horizontally polarized I (HI) signals, vertically polarized Q (VQ) signals and horizontally polarized Q (HQ) signals, and the FFE is configured to cancel direct ISI that include VI-to-VI, VQ-to-VQ, HI-to-HI, HQ-to-HQ ISI and crosstalk ISI that include VI-to-VQ, VI-to-HI, VI-to-HQ, VQ-to-VI, VQ-to-HI, VQ-to-HQ, HI-to-VI, HI-to-VQ, HI-to-HQ, HQ-to-VI, HQ-to-VQ, HQ-to-HI ISI.

In example 710, the subject matter of any one or more of examples 697-709 optionally include that each weighting coefficients for the vertically and horizontally I and Q polarized signals in each FFE stage is adjusted while the FFE is in operation.

In example 711, the subject matter of example 710 optionally includes that the weighting coefficients, other than at an initial tap, are each initially set to a pre-defined value prior to convergence and stabilization.

In example 712, the subject matter of any one or more of examples 697-711 optionally include an antenna that provides input signals to the FFE.

Example 713 is a method of providing analog signal equalization. The method may comprise providing a plurality of types of signals to a plurality of series-connected feedforward equalizer (FFE) stages of a FFE. The plurality of types of signals may comprise vertically and horizontally polarized in-phase (I) and quadrature-phase (Q) signals (VI, VQ, HI and HQ signals). The method may further comprise at a first of the FFE stages, delaying input VI, VQ, HI and HQ signals through a series of delays to form a plurality of sets of delayed VI, VQ, HI and HQ signals. Each set of delayed VI, VQ, HI and HQ signals may be associated with a different tap of a plurality of taps. The method may further comprise at the first of the FFE stages weighting each of the VI, VQ, HI and HQ signals at each tap with each of a plurality of types of weighting coefficients to form VI, VQ, HI and HQ weighted signals at the tap. The plurality of types of weighting coefficients may comprise VI, VQ, HI and HQ weighting coefficients. The method may further comprise at the first of the FFE stages combining the VI weighted signals at each tap to form a VI output signal, the VQ weighted signals at each tap to form a VQ output signal, the HI weighted signals at each tap to form a HI output signal and the HQ weighted signals at each tap to form a HQ output signal. The method may further comprise at the first of the FFE stages providing each of the VI, VQ, HI and HQ output signal one of as a VI, VQ, HI and HQ input signal to another FFE stage or as a VI, VQ, HI and HQ output of the FFE.

In example 714, the subject matter of example 713 optionally includes using the VI, VQ, HI and HQ weighted signals at each tap to cancel a different pre-cursor inter-symbol interference (ISI) type.

In example 715, the subject matter of any one or more of examples 713-714 optionally include that at least some of the VI, VQ, HI and HQ weighting coefficients are independent of each other.

In example 716, the subject matter of any one or more of examples 713-715 optionally include that each type of weighting coefficient of one type of signal is independent of each other type of weighting coefficient of the one type of signal.

In example 717, the subject matter of any one or more of examples 713-716 optionally include that one type of weighting coefficient of each type of signal is independent of the one type of weighting coefficient of each other type of signal.

In example 718, the subject matter of any one or more of examples 713-717 optionally include repeating the delaying, weighting and combining on input signals for successive FFE stages.

In example 719, the subject matter of any one or more of examples 713-718 optionally include that a number of taps is the same in each FFE stage.

In example 720, the subject matter of any one or more of examples 713-719 optionally include that a number of taps tapers across the FFE stages.

In example 721, the subject matter of any one or more of examples 713-720 optionally include initially setting the VI, VQ, HI and HQ weighting coefficients for each of the VI, VQ, HI and HQ signal, other than at an initial tap, to a pre-defined value and updating the VI, VQ, HI and HQ weighting coefficients during an adaption process to converge and stabilize the VI, VQ, HI and HQ weighting coefficients during the weighting.

Example 722 is an apparatus of a communication device. The apparatus may comprise means for providing a plurality of types of signals to a plurality of series-connected feed-forward equalizer (FFE) stages of a FFE. The plurality of types of signals may comprise vertically and horizontally polarized in-phase (I) and quadrature-phase (Q) signals (VI, VQ, HI and HQ signals); at a first of the FFE stages. The apparatus may further comprise means for delaying input VI, VQ, HI and HQ signals through a series of delays to form a plurality of sets of delayed VI, VQ, HI and HQ signals. Each set of delayed VI, VQ, HI and HQ signals may be associated with a different tap of a plurality of taps. The apparatus may further comprise means for weighting each of the VI, VQ, HI and HQ signals at each tap with each of a plurality of types of weighting coefficients to form VI, VQ, HI and HQ weighted signals at the tap. The plurality of types of weighting coefficients may comprise VI, VQ, HI and HQ weighting coefficients. The apparatus may further comprise means for combining the VI weighted signals at each tap to form a VI output signal, the VQ weighted signals at each tap to form a VQ output signal, the HI weighted signals at each tap to form a HI output signal and the HQ weighted signals at each tap to form a HQ output signal. The apparatus may further comprise means for providing each of the VI, VQ, HI and HQ output signal one of as a VI, VQ, HI and HQ input signal to another FFE stage or as a VI, VQ, HI and HQ output of the FFE.

In example 723, the subject matter of example 722 optionally includes means for using the VI, VQ, HI and HQ weighted signals at each tap to cancel a different pre-cursor inter-symbol interference (ISI) type.

In example 724, the subject matter of any one or more of examples 722-723 optionally include that at least some of the VI, VQ, HI and HQ weighting coefficients are independent of each other.

In example 725, the subject matter of any one or more of examples 722-724 optionally include that each type of weighting coefficient of one type of signal is independent of each other type of weighting coefficient of the one type of signal.

In example 726, the subject matter of any one or more of examples 722-725 optionally include that one type of weighting coefficient of each type of signal is independent of the one type of weighting coefficient of each other type of signal.

In example 727, the subject matter of any one or more of examples 722-726 optionally include means for repeating the delaying, weighting and combining on input signals for successive FFE stages.

In example 728, the subject matter of any one or more of examples 722-727 optionally include that a number of taps is the same in each FFE stage.

In example 729, the subject matter of any one or more of examples 722-728 optionally include that a number of taps tapers across the FFE stages.

In example 730, the subject matter of any one or more of examples 722-729 optionally include means for initially setting the VI, VQ, HI and HQ weighting coefficients for each of the VI, VQ, HI and HQ signal, other than at an initial tap, to a pre-defined value; and means for updating the VI, VQ, HI and HQ weighting coefficients during an adaption process to converge and stabilize the VI, VQ, HI and HQ weighting coefficients during the weighting.

Example 731 is a computer-readable storage medium that stores instructions for execution by one or more processors of a communication device. The instructions may be configured to instruct the one or more processors to provide a plurality of types of signals to a plurality of series-connected feedforward equalizer (FFE) stages of a FFE. The plurality of types of signals may comprise vertically and horizontally polarized in-phase (I) and quadrature-phase (Q) signals (VI, VQ, HI and HQ signals). The instructions may further be configured to instruct the one or more processors to, at a first of the FFE stages, delay input VI, VQ, HI and HQ signals through a series of delays to form a plurality of sets of delayed VI, VQ, HI and HQ signals. Each set of delayed VI, VQ, HI and HQ signals may be associated with a different tap of a plurality of taps. The instructions may further be configured to instruct the one or more processors to, at the first of the FFE stages, weight each of the VI, VQ, HI and HQ signals at each tap with each of a plurality of types of weighting coefficients to form VI, VQ, HI and HQ weighted signals at the tap. The plurality of types of weighting coefficients may comprise VI, VQ, HI and HQ weighting coefficients. The instructions may further be configured to instruct the one or more processors to, at the first of the FFE stages, combine the VI weighted signals at each tap to form a VI output signal, the VQ weighted signals at each tap to form a VQ output signal, the HI weighted signals at each tap to form a HI output signal and the HQ weighted signals at each tap to form a HQ output signal. The instructions may further be configured to instruct the one or more processors to, at the first of the FFE stages, provide each of the VI, VQ, HI and HQ output signal one of as a VI, VQ, HI and HQ input signal to another FFE stage or as a VI, VQ, HI and HQ output of the FFE.

In example 732, the subject matter of example 731 optionally includes wherein the instructions further instruct the one or more processors to use the VI, VQ, HI and HQ weighted signals at each tap to cancel a different pre-cursor inter-symbol interference (ISI) type.

In example 733, the subject matter of any one or more of examples 731-732 optionally include that at least some of the VI, VQ, HI and HQ weighting coefficients are independent of each other.

In example 734, the subject matter of any one or more of examples 731-733 optionally include that each type of weighting coefficient of one type of signal is independent of each other type of weighting coefficient of the one type of signal.

In example 735, the subject matter of any one or more of examples 731-734 optionally include that one type of weighting coefficient of each type of signal is independent of the one type of weighting coefficient of each other type of signal.

In example 736, the subject matter of any one or more of examples 731-735 optionally include that the instructions further instruct the one or more processors to repeating the delaying, weighting and combining on input signals for successive FFE stages.

In example 737, the subject matter of any one or more of examples 731-736 optionally include that a number of taps is the same in each FFE stage.

In example 738, the subject matter of any one or more of examples 731-737 optionally include that a number of taps tapers across the FFE stages.

In example 739, the subject matter of any one or more of examples 731-738 optionally include that the instructions further instruct the one or more processors to initially set the VI, VQ, HI and HQ weighting coefficients for each of the VI, VQ, HI and HQ signal, other than at an initial tap, to a pre-defined value; and update the VI, VQ, HI and HQ weighting coefficients during an adaption process to converge and stabilize the VI, VQ, HI and HQ weighting coefficients during the weighting.

Example 740 is an apparatus of a receiver. The apparatus may comprise a Decision Feedback Equalizer (DFE). The DFE may comprise a path having a serial chain and parallel chains. The serial chain may be configured to provide a 1 bit output, and a 2 bit, most significant bit (MSB) and least significant bit (LSB), output. The apparatus may further comprise a selector configured to select between the serial and parallel chains and a plurality of taps disposed along the path. A number of taps may be dependent on which of the serial chain and parallel chains is selected by the selector. Outputs from the taps may be configured to compensate for post-cursor inter-symbol interference (ISI).

In example 741, the subject matter of example 740 optionally includes a plurality of delays each triggered by a clock signal. Each tap may be taken from an output of a different delay.

In example 742, the subject matter of example 741 optionally includes that each delay comprises a D flipflop.

In example 743, the subject matter of example 742 optionally include that the selector comprises a plurality of multiplexers. Each multiplexer may be associated with a different delay and having an output connected with an input of the associated delay.

In example 744, the subject matter of example 743 optionally includes that each multiplexer is connected with a same selector signal. The selector signal may be configured to control selection of which of the serial chain and parallel chains is used by the DFE.

In example 745, the subject matter of example 744 optionally includes that inputs of each selector comprise an output from a previous delay in the serial chain and an output from a previous delay in the parallel chains.

In example 746, the subject matter of any one or more of examples 740-745 optionally include that the selector is configured to select a chain type based on a modulation scheme. The chain type may comprise the serial chain and the parallel chains.

In example 747, the subject matter of example 746 optionally includes that the serial chain is selected for Quadrature Phase-Shift Keying (QPSK) and the parallel chains are selected for 16 Quadrature Amplitude Modulation (16QAM) or higher.

In example 748, the subject matter of any one or more of examples 740-747 optionally include that the taps comprise first and second taps and remaining taps after the first and second taps. The apparatus may further comprise a first and second latch disposed prior to the remaining taps. The first tap may be taken from an input of the first latch and the second tap may be taken from an output of the second latch. An output of the first latch may be connected with an input of the second latch.

In example 749, the subject matter of example 748 optionally includes that in the serial chain. The output of the second latch may be connected with an input of a first of delays that form the serial chain.

In example 750, the subject matter of any one or more of examples 748-749 optionally include that in the parallel chains: the MSB is taken from between the first and second latches; the LSB is taken from an output of a third latch; an output of the first latch is further connected with a selector input of a multiplexer; an output of the multiplexer is connected with an input of the third latch; and the second tap is taken from an output of the second and third latches.

In example 751, the subject matter of any one or more of examples 740-750 optionally include that the taps comprise first and second taps and remaining taps after the first and second taps. The first tap may have a stringent delay constraint. Each of the remaining taps may be taken from an output of a different D flipflop. The first tap may be taken from an input of a first latch and the second tap taken from an output of a second latch. An output of the first latch and an input of the second latch may be connected together and connected with a selector input of a multiplexer in one of the parallel paths to avoid affecting a delay of the first tap when the multiplexer is present and the parallel paths are selected.

In example 752, the subject matter of any one or more of examples 740-751 optionally include an antenna configured to receive radio frequency (RF) signals compensated by the DFE.

Example 753 is a method of compensating for post-cursor inter-symbol interference (ISI) in a receiver. The method may comprise determining a modulation scheme of a signal received at a Decision Feedback Equalizer (DFE) in the receiver. The method may further comprise based on the modulation scheme, determining a tap number of taps to use in the DFE. The method may further comprise selecting which of a serial chain and parallel chains to use in the DFE based on the tap number. The serial chain and parallel chains may have different tap numbers. The method may further comprise compensating for post-cursor ISI of the signal using outputs from the taps.

In example 754, the subject matter of example 753 optionally includes simultaneously trigging a plurality of delays. Each tap may be taken from an output of a different delay.

In example 755, the subject matter of any one or more of examples 753-754 optionally include that the selecting which of a serial chain and parallel chains to use may comprise applying a same selector signal to a plurality of multiplexers that are each associated with a different delay and have an output connected with an input of the associated delay.

In example 756, the subject matter of any one or more of examples 753-755 optionally include that the selecting which of a serial chain and parallel chains to may comprise selecting the serial chain for Quadrature Phase-Shift Keying (QPSK) and the parallel chains for 16 Quadrature Amplitude Modulation (16QAM) or higher.

In example 757, the subject matter of any one or more of examples 753-756 optionally include that when the parallel chains are selected, the method may further comprise selecting a least significant bit (LSB) using a latched output between a first and second of the taps of a most significant bit (MSB).

In example 758, the subject matter of any one or more of examples 753-757 optionally include that the taps comprise first and second taps and remaining taps after the first and second taps. The first tap may have a stringent delay constraint. The method may further comprise avoiding affecting a delay of the first tap when the parallel paths are selected by: taking the first tap from an input of a first latch and the second tap from an output of a second latch; and connecting an output of the first latch with an input of the second latch in a first of the parallel paths and with a selector input of a multiplexer in a second of the parallel paths.

Example 759 is an apparatus of a Decision Feedback Equalizer (DFE).

The apparatus may comprise means for determining a modulation scheme of a signal received at the DFE. The apparatus may further comprise means for determining, based on the modulation scheme, the tap number of taps to use in the DFE. The apparatus may further comprise means for selecting which of a serial chain and parallel chains to use in the DFE based on the tap number. The serial chain and parallel chains may have different tap numbers. The apparatus may further comprise means for compensating for post-cursor inter-symbol interference (ISI) of the signal using outputs from the taps.

In example 760, the subject matter of example 759 optionally includes means for simultaneously trigging a plurality of delays. Each tap may be taken from an output of a different delay.

In example 761, the subject matter of any one or more of examples 759-760 optionally include that the means for selecting which of a serial chain and parallel chains to use comprises means for applying a same selector signal to a plurality of multiplexers that are each associated with a different delay and have an output connected with an input of the associated delay.

In example 762, the subject matter of any one or more of examples 759-761 optionally include that the means for selecting which of a serial chain and parallel chains to use comprises means for selecting the serial chain for Quadrature Phase-Shift Keying (QPSK) and the parallel chains for 16 Quadrature Amplitude Modulation (16QAM) or higher.

In example 763, the subject matter of any one or more of examples 759-762 optionally include that when the parallel chains are selected, the apparatus may further comprise means for selecting a least significant bit (LSB) using a latched output between a first and second of the taps of a most significant bit (MSB).

In example 764, the subject matter of any one or more of examples 759-763 optionally include that the taps comprise first and second taps and remaining taps after the first and second taps. The first tap may have a stringent delay constraint. The apparatus may further comprise means for avoiding affecting a delay of the first tap when the parallel paths are selected by providing: means for taking the first tap from an input of a first latch and the second tap from an output of a second latch; and means for connecting an output of the first latch with an input of the second latch in a first of the parallel paths and with a selector input of a multiplexer in a second of the parallel paths.

Example 765 is a computer-readable storage medium that stores instructions for execution by one or more processors of a communication device. The instructions may be configured to instruct the one or more processors to determine a modulation scheme of a signal received at a Decision Feedback Equalizer (DFE). The instructions may further be configured to instruct the one or more processors to, based on the modulation scheme, determine the tap number of taps to use in the DFE. The instructions may further be configured to instruct the one or more processors to select which of a serial chain and parallel chains to use in the DFE based on the tap number. The serial chain and parallel chains may have different tap numbers. The instructions may further be configured to instruct the one or more processors to compensate for post-cursor inter-symbol interference (ISI) of the signal using outputs from the taps.

In example 766, the subject matter of example 765 optionally includes that the instructions are further configured to instruct the one or more processors to simultaneously trigger a plurality of delays. Each tap may be taken from an output of a different delay.

In example 767, the subject matter of any one or more of examples 765-766 optionally include that the instructions are further configured to instruct the one or more processors to apply a same selector signal to a plurality of multiplexers that are each associated with a different delay and have an output connected with an input of the associated delay.

In example 768, the subject matter of any one or more of examples 765-767 optionally include that the instructions are further configured to instruct the one or more processors to select the serial chain for Quadrature Phase-Shift Keying (QPSK) and the parallel chains for 16 Quadrature Amplitude Modulation (16QAM) or higher.

In example 769, the subject matter of any one or more of examples 765-768 optionally include that the instructions are further configured to instruct the one or more processors to select a least significant bit (LSB) using a latched output between a first and second of the taps of a most significant bit (MSB).

In example 770, the subject matter of any one or more of examples 765-769 optionally include that the taps comprise first and second taps and remaining taps after the first and second taps. The first tap may have a stringent delay constraint. The instructions may be further configured to instruct the one or more processors to avoid affecting a delay of the first tap when the parallel paths are selected by: taking the first tap from an input of a first latch and the second tap from an output of a second latch; and connecting an output of the first latch with an input of the second latch in a first of the parallel paths and with a selector input of a multiplexer in a second of the parallel paths.

Example 771 is an apparatus of a mmWave communication device. The apparatus may comprise at least one of: a receiver hybrid beamforming architecture configured to receive mmWave beamformed signals or a transmitter hybrid beamforming architecture configured to transmit mmWave beamformed signals. The receiver hybrid beamforming architecture may be configured to receive mmWave beamformed signals and the transmitter hybrid beamforming architecture may be configured to transmit mmWave beamformed signals. The receiver hybrid beamforming architecture may comprise an analog receiver beamforming structure and a digital receiver beamforming structure that comprise different numbers of analog-to-digital converters (ADCs) that have different resolutions. The transmitter hybrid beamforming architecture may comprise an analog transmitter beamforming structure and a digital transmitter beamforming structure that comprise different numbers of digital-to-analog converters (DACs) that have different resolutions.

In example 772, the subject matter of example 771 optionally includes that the analog receiver beamforming structure comprises an ADC and the analog transmitter beamforming structure comprises a DAC, and the digital receiver beamforming structure comprises a plurality of ADCs and the digital transmitter beamforming structure comprises a plurality of DACs.

In example 773, the subject matter of example 772 optionally includes that the resolution of the ADC is higher than the resolution of each of the plurality of ADCs, and the resolution of the DAC is higher than the resolution of each of the plurality of DACs.

In example 774, the subject matter of example 773 optionally includes that the resolution of each of the plurality of ADCs is variable.

In example 775, the subject matter of any one or more of examples 772-774 optionally include that each of the analog receiver and transmitter beamforming structure may further comprise a phase shifter associated each of the antennas and a combiner connected with each phase shifter.

In example 776, the subject matter of any one or more of examples 772-775 optionally include that the receiver hybrid beamforming architecture may further comprise a receiver switch associated with each antenna, the receiver switch controlling which of the analog and digital receiver beamforming structure is selected. The transmitter hybrid beamforming architecture may further comprise a transmitter switch associated with each antenna. The transmitter switch may control which of the analog and digital transmitter beamforming structure is selected. At least one of the receiver or transmitter switch may be controlled based on a channel type of a channel on which radio frequency (RF) signals are communicated by the antennas, a signal type of the RF signals, channel conditions, mobility of a user equipment (UE), or modulation scheme.

In example 777, the subject matter of example 776 optionally includes that the at least one of the receiver or transmitter switch selects analog beamforming in response to the channel type being line of sight (LOS), a high order modulation scheme is used, and a high signal to noise ratio (SNR) and low mobility are present.

In example 778, the subject matter of any one or more of examples 776-777 optionally include that the at least one of the receiver or transmitter switch selects digital beamforming in response to at least one of: the signal type being a control signal and a low order modulation scheme is used; or the signal type being a data signal, the channel type being non-line of sight (NLOS), and a low SNR is present.

In example 779, the subject matter of any one or more of examples 771-778 optionally include that the receiver hybrid beamforming architecture comprises shared analog receiver components that comprise for each antenna: a low noise amplifier configured to amplify a complex radio frequency (RF) signal from the antenna, mixers configured to downconvert in-phase and quadrature-phase components of the RF signal to baseband, a variable gain connected to each mixer and a low pass filter configured to provide low pass filtering of an output from each variable gain.

In example 780, the subject matter of any one or more of examples 771-779 optionally include a plurality of antennas configured to communicate mmWave signals.

Example 781 is a method of communicating beamformed mmWave signals. The method may comprise determining channel and signal characteristics of mmWave signals to be communicated. The method may further comprise, based on a determination from the channel and signal characteristics of the mmWave signals that high-resolution quantization or conversion from digital to analog is to be used, selecting an analog beamforming architecture, of a hybrid beamforming architecture that comprises the analog beamforming architecture and a digital beamforming architecture, to use in communicating the mmWave signals. The method may further comprise based on a determination from the channel and signal characteristics of the mmWave signals that low-resolution quantization or conversion from digital to analog is to be used, selecting the digital beamforming architecture to use in communicating the mmWave signals. The method may further comprise communicating the mmWave signals via beamforming using the analog or digital beamforming architecture selected. A number of converters in the analog and digital beamforming architecture may be different.

In example 782, the subject matter of example 781 optionally includes that the analog beamforming structure comprises either an analog-to-digital converter (ADC) or a digital-to-analog converter (DAC), and the digital beamforming structure comprises either a plurality of ADCs or a plurality of DACs.

In example 783, the subject matter of example 782 optionally includes that a resolution of each of the ADCs and DACs is fixed.

In example 784, the subject matter of any one or more of examples 782-783 optionally include varying a resolution of each of the ADCs and DACs dependent on the channel and signal characteristics of the mmWave signals.

In example 785, the subject matter of any one or more of examples 782-784 optionally include when the analog beamforming architecture is selected, the method further comprises phase shifting each of the mmWave signals to produce phase shifted signals and combining the phase shifted signals to form a combined signal to be quantized.

In example 786, the subject matter of any one or more of examples 782-785 optionally include controlling selection of the analog or digital beamforming architecture based at least on which of a line of sight (LOS) or non-LOS (NLOS) channel is to be used to communicate the mmWave signals, which of a control or data signal the mmWave signals are, a signal to noise ratio (SNR), and a modulation scheme to be used to communicate the mmWave signals.

In example 787, the subject matter of example 786 optionally includes that the analog beamforming architecture is selected in response to the channel type being LOS, a high order modulation scheme being used, and a high SNR and low mobility.

In example 788, the subject matter of any one or more of examples 786-787 optionally include that the digital beamforming architecture is selected in response to at least one of: the signal type being a control signal and a low order modulation scheme being used; or the signal type being a data signal, the channel type is NLOS, and a low SNR is present.

In example 789, the subject matter of any one or more of examples 781-788 optionally include sharing analog components between the analog and digital beamforming architecture. The shared analog components may comprise a low noise amplifier configured to amplify the mmWave signals, mixers configured to downconvert in-phase and quadrature-phase components of the mmWave signals to baseband, a variable gain connected to each mixer and a low pass filter configured to provide low pass filtering of an output from each variable gain.

Example 790 is an apparatus of a communication device. The apparatus may comprise means for determining channel and signal characteristics of mmWave signals to be communicated. The apparatus may further comprise, based on a determination from the channel and signal characteristics of the mmWave signals that high-resolution quantization or conversion from digital to analog is to be used, means for selecting an analog beamforming architecture, of a hybrid beamforming architecture that comprises the analog beamforming architecture and a digital beamforming architecture, to use in communicating the mmWave signals. The apparatus may further comprise, based on a determination from the channel and signal characteristics of the mmWave signals that low-resolution quantization or conversion from digital to analog is to be used, means for selecting the digital beamforming architecture to use in communicating the mmWave signals. The apparatus may further comprise, means for communicating the mmWave signals via beamforming using the analog or digital beamforming architecture selected. A number of converters in the analog and digital beamforming architecture may be different.

In example 791, the subject matter of example 790 optionally includes that the analog beamforming structure comprises either an analog-to-digital converter (ADC) or a digital-to-analog converter (DAC), and the digital beamforming structure comprises either a plurality of ADCs or a plurality of DACs.

In example 792, the subject matter of example 791 optionally includes that a resolution of each of the ADCs and DACs is fixed.

In example 793, the subject matter of any one or more of examples 791-792 optionally include means for varying a resolution of each of the ADCs and DACs dependent on the channel and signal characteristics of the mmWave signals.

In example 794, the subject matter of any one or more of examples 790-793 optionally include when the analog beamforming architecture is selected, the apparatus further comprises means for phase shifting each of the mmWave signals to generate phase shifted signals and means for combining the phase shifted signals to form a combined signal to be quantized.

In example 795, the subject matter of any one or more of examples 790-794 optionally include means for controlling selection of the analog or digital beamforming architecture based at least on which of a line of sight (LOS) or non-LOS (NLOS) channel is to be used to communicate the mmWave signals, which of a control or data signal the mmWave signals are, a signal to noise ratio (SNR), and a modulation scheme to be used to communicate the mmWave signals.

In example 796, the subject matter of example 795 optionally includes that the analog beamforming architecture is selected in response to the channel type being LOS, a high order modulation scheme being used, and a high SNR and low mobility.

In example 797, the subject matter of any one or more of examples 795-796 optionally include that the digital beamforming architecture is selected in response to at least one of: the signal type being a control signal and a low order modulation scheme being used; or the signal type being a data signal, the channel type is NLOS, and a low SNR is present.

In example 798, the subject matter of any one or more of examples 790-797 optionally include means for sharing analog components between the analog and digital beamforming architecture. The shared analog components may comprise a low noise amplifier configured to amplify the mmWave signals, mixers configured to downconvert in-phase and quadrature-phase components of the mmWave signals to baseband, a variable gain connected to each mixer and a low pass filter configured to provide low pass filtering of an output from each variable gain.

Example 799 is a computer-readable storage medium that stores instructions for execution by one or more processors of a communication device. The instructions may be configured to instruct the one or more processors to determine channel and signal characteristics of mmWave signals to be communicated. The instructions may be further configured to instruct the one or more processors to, based on a determination from the channel and signal characteristics of the mmWave signals that high-resolution quantization or conversion from digital to analog is to be used, select an analog beamforming architecture, of a hybrid beamforming architecture that comprises the analog beamforming architecture and a digital beamforming architecture, to use in communicating the mmWave signals. The instructions may be further configured to instruct the one or more processors to, based on a determination from the channel and signal characteristics of the mmWave signals that low-resolution quantization or conversion from digital to analog is to be used, select the digital beamforming architecture to use in communicating the mmWave signals. The instructions may be further configured to instruct the one or more processors to, communicate the mmWave signals via beamforming using the analog or digital beamforming architecture selected. A number of converters in the analog and digital beamforming architecture may be different.

In example 800, the subject matter of example 799 optionally includes that the analog beamforming structure comprises either a single analog-to-digital converter (ADC) or a single digital-to-analog converter (DAC), and the digital beamforming structure comprises either a plurality of ADCs or a plurality of DACs.

In example 801, the subject matter of example 800 optionally includes that a resolution of each of the ADCs and DACs is fixed.

In example 802, the subject matter of any one or more of examples 800-801 optionally include wherein the instructions further instruct the one or more processors to vary a resolution of each of the ADCs and DACs dependent on the channel and signal characteristics of the mmWave signals.

In example 803, the subject matter of any one or more of examples 799-802 optionally include when the analog beamforming architecture is selected, the instructions further instruct the one or more processors to phase shift each of the mmWave signals to produce phase shifted signals and combine the phase shifted signals to form a combined signal to be quantized.

In example 804, the subject matter of any one or more of examples 799-803 optionally include that the instructions further instruct the one or more processors to control selection of the analog or digital beamforming architecture based at least on which of a line of sight (LOS) or non-LOS (NLOS) channel is to be used to communicate the mmWave signals, which of a control or data signal the mmWave signals are, a signal to noise ratio (SNR), and a modulation scheme to be used to communicate the mmWave signals.

In example 805, the subject matter of example 804 optionally includes that the analog beamforming architecture is selected in response to the channel type being LOS, a high order modulation scheme being used, and a high SNR and low mobility.

In example 806, the subject matter of any one or more of examples 804-805 optionally include that the digital beamforming architecture is selected in response to at least one of: the signal type being a control signal and a low order modulation scheme being used; or the signal type being a data signal, the channel type is NLOS, and a low SNR is present.

In example 807, the subject matter of any one or more of examples 799-806 optionally include wherein the instructions further instruct the one or more processors to share analog components between the analog and digital beamforming architecture. The shared analog components may comprise a low noise amplifier configured to amplify the mmWave signals, mixers configured to downconvert in-phase and quadrature-phase components of the mmWave signals to baseband, a variable gain connected to each mixer and a low pass filter configured to provide low pass filtering of an output from each variable gain.

Example 808 is an apparatus of a mmWave communication device. The apparatus may comprise a receiver beamforming architecture configured to receive mmWave beamformed signals and a transmitter beamforming architecture configured to transmitter mmWave beamformed signals. The receiver beamforming architecture may comprise a variable resolution analog-to-digital converter (ADC). The transmitter beamforming architecture may comprise a variable resolution digital-to-analog converter (DAC). A resolution of the ADC or DAC may be adapted to limit power consumption to a predetermined transceiver power dissipation constraint free from reducing a number of ADCs or DACs used in the receiver or transmitter beamforming architecture.

In example 809, the subject matter of example 808 optionally includes that the receiver beamforming architecture comprises a hybrid receiver beamforming architecture that comprises an analog receiver beamforming architecture and a digital receiver beamforming architecture. The transmitter beamforming architecture may comprise a hybrid transmitter beamforming architecture that comprises an analog transmitter beamforming architecture and a digital transmitter beamforming architecture.

In example 810, the subject matter of example 809 optionally includes that the analog receiver and transmitter beamforming architecture comprises an ADC and an DAC, respectively. The digital receiver and transmitter beamforming architecture may comprise a plurality of ADCs and DACs, respectively.

In example 811, the subject matter of example 810 optionally includes that the analog receiver beamforming architecture comprises a combiner configured to combine complex mmWave signals from a plurality of antennas into a combined signal. The combined signal may be supplied to the single ADC as an input.

In example 812, the subject matter of any one or more of examples 808-811 optionally include that a resolution of the ADC or DAC is dependent on at least one of: a channel used for communication, interference in the channel, signal to noise ratio (SNR), or a number of users in communication with the mmWave communication device.

In example 813, the subject matter of any one or more of examples 809-812 optionally include that a resolution of the ADC or DAC is dependent on at least one of: signal type of the mmWave beamformed signals, signal quality of the mmWave beamformed signals, modulation used by the mmWave beamformed signals or apparatus operation associated with the mmWave beamformed signals.

In example 814, the subject matter of example 813 optionally includes that the resolution of the ADC or DAC is decreased when the mmWave beamformed signals comprise control plane signaling.

In example 815, the subject matter of any one or more of examples 813-814 optionally include that the resolution of the ADC or DAC decreases with increasing signal to noise ratio (SNR).

In example 816, the subject matter of any one or more of examples 813-815 optionally include that the resolution of the ADC or DAC decreases with increasing modulation order.

In example 817, the subject matter of any one or more of examples 813-816 optionally include that the resolution of the ADC or DAC decreases with increasing modulation order.

In example 818, the subject matter of any one or more of examples 813-8 17 optionally include that the resolution of the ADC or DAC decreases with decreasing numbers of user equipment (UEs) being serviced by the communication device and decreasing Peak-to-Average Power Ratio (PAPR).

In example 8 19, the subject matter of any one or more of examples 813-818 optionally include that the resolution of the ADC or DAC decreases when a measured DC offset falls below a predetermined set point.

In example 820, the subject matter of any one or more of examples 813-819 optionally include that the resolution of the ADC or DAC decreases when the mmWave beamformed signals are part of an evolved NodeB (eNB) search.

In example 821, the subject matter of any one or more of examples 813-820 optionally include that the resolution of the ADC or DAC decreases when the mmWave beamformed signals are a preamble or mid-amble.

In example 822, the subject matter of any one or more of examples 813-821 optionally include that the resolution of the ADC or DAC increases when at least one of in-band or adjacent channel interference is strong enough to increase a dynamic range of the ADC or DAC.

In example 823, the subject matter of any one or more of examples 813-822 optionally include that the resolution of the ADC or DAC increases when the channel is a non-line-of-sight (NLOS) channel and a number of multipath increases.

In example 824, the subject matter of any one or more of examples 808-823 optionally include a plurality of antennas configured to communicate the mmWave beamformed signals.

Example 825 is a method of communicating beamformed mmWave signals. The method may comprise at least one of receiving a first set of mmWave beamformed signals at a plurality of antennas or transmitting a second set of mmWave beamformed signals from the antennas. The method may further comprise setting a resolution of an analog-to-digital converter (ADC) used in the receiving and digital-to-analog converter (DAC) used in the transmitting based on a transceiver power dissipation constraint and free from reducing a number of ADCs or DACs. The method may further comprise converting the first or second set of mmWave beamformed signals between analog and digital signals based on the resolution of the ADC or DAC.

In example 826, the subject matter of example 825 optionally includes selecting which of an analog beamforming architecture and a digital beamforming architecture of a hybrid beamforming architecture to use to receive or transmit the mmWave beamformed signals.

In example 827, the subject matter of example 826 optionally includes adjusting the resolution of the ADC and DAC based on which of the analog and digital beamforming architecture is selected.

In example 828, the subject matter of any one or more of examples 826-827 optionally include that the analog beamforming architecture comprises a single ADC for reception and a single DAC for transmission. The digital beamforming architecture may further comprise a plurality of ADCs for reception and a plurality of DACs for transmission.

In example 829, the subject matter of any one or more of examples 826-828 optionally include combining complex mmWave signals received from the antennas into a combined signal and supplying the combined signal to the single ADC as an input.

In example 830, the subject matter of any one or more of examples 825-829 optionally include that a resolution of the ADC or DAC is dependent on at least one of: a channel used for communication, interference in the channel, signal to noise ratio (SNR), or a number of users in communication with the mmWave communication device.

In example 831, the subject matter of any one or more of examples 825-830 optionally include that a resolution of the ADC or DAC is dependent on at least one of: signal type of the mmWave beamformed signals, signal quality of the mmWave beamformed signals, modulation used by the mmWave beamformed signals or operation associated with the mmWave beamformed signals.

Example 832 is an apparatus of a communication device. The apparatus may comprise means for receiving a first set of mmWave beamformed signals at a plurality of antennas and means for transmitting a second set of mmWave beamformed signals from the antennas. The apparatus may further comprise means for setting a resolution of an analog-to-digital converter (ADC) used in the receiving and digital-to-analog converter (DAC) used in the transmitting based on a transceiver power dissipation constraint and free from reducing a number of ADCs or DACs. The apparatus may further comprise means for converting the first or second set of mmWave beamformed signals between analog and digital signals based on the resolution of the ADC or DAC.

In example 833, the subject matter of example 832 optionally includes means for selecting which of an analog beamforming architecture and a digital beamforming architecture of a hybrid beamforming architecture to use to receive or transmit the mmWave beamformed signals.

In example 834, the subject matter of example 833 optionally includes means for adjusting the resolution of the ADC and DAC based on which of the analog and digital beamforming architecture is selected.

In example 835, the subject matter of any one or more of examples 833-834 optionally include that the analog beamforming architecture comprises a single ADC for reception and a single DAC for transmission. The digital beamforming architecture may comprise a plurality of ADCs for reception and a plurality of DACs for transmission.

In example 836, the subject matter of any one or more of examples 833-835 optionally include means for combining complex mmWave signals received from the antennas into a combined signal and means for supplying the combined signal to the single DAC as an input.

In example 837, the subject matter of any one or more of examples 832-836 optionally include that a resolution of the ADC or DAC is dependent on at least one of: a channel used for communication, interference in the channel, signal to noise ratio (SNR), or a number of users in communication with the mmWave communication device.

In example 838, the subject matter of any one or more of examples 825-837 optionally include that a resolution of the ADC or DAC is dependent on at least one of: signal type of the mmWave beamformed signals, signal quality of the mmWave beamformed signals, modulation used by the mmWave beamformed signals or operation associated with the mmWave beamformed signals.

Example 839 is a computer-readable storage medium that stores instructions for execution by one or more processors of a communication device. The instructions may be configured to instruct the one or more processors to receive a first set of mmWave beamformed signals at a plurality of antennas and transmit a second set of mmWave beamformed signals from the antennas. The instructions may be further configured to set a resolution of an analog-to-digital converter (ADC) used in the receiving and digital-to-analog converter (DAC) used in the transmitting based on a transceiver power dissipation constraint and free from reducing a number of ADCs or DACs. The instructions may be further configured to convert the first or second set of mmWave beamformed signals between analog and digital signals based on the resolution of the ADC or DAC.

In example 840, the subject matter of example 839 optionally includes wherein the instructions further instruct the one or more processors to select which of an analog beamforming architecture and a digital beamforming architecture of a hybrid beamforming architecture to use to receive or transmit the mmWave beamformed signals.

In example 841, the subject matter of example 840 optionally includes wherein the instructions further instruct the one or more processors to adjust the resolution of the ADC and DAC based on which of the analog and digital beamforming architecture is selected.

In example 842, the subject matter of any one or more of examples 840-841 optionally include that the analog beamforming architecture comprises a single ADC for reception and a single DAC for transmission. The digital beamforming architecture may comprise a plurality of ADCs for reception and a plurality of DACs for transmission.

In example 843, the subject matter of any one or more of examples 840-842 optionally include that the instructions further instruct the one or more processors to combine complex mmWave signals received from the antennas into a combined signal and supply the combined signal to the single ADC as an input.

In example 844, the subject matter of any one or more of examples 839-843 optionally include that a resolution of the ADC or DAC is dependent on at least one of: a channel used for communication, interference in the channel, signal to noise ratio (SNR), or a number of users in communication with the mmWave communication device.

Example 845 is an apparatus of a communication device. The apparatus may comprise an analog or hybrid beamforming architecture that comprises a plurality of phase shifters configured to set a steering angle for antennas configured to communicate beamformed signals. The apparatus may further comprise a processor configured to determine a codebook to provide beam steering for the antennas. The codebook may be limited to a subset of steering angles of the antennas. The processor may further provide inputs to the phase shifters to set a particular steering angle outside the subset of steering angles through a determination of a limited steering angle within the subset of steering angles and an integer shift value to shift the limited steering angle to the particular steering angle.

In example 846, the subject matter of example 845 optionally includes that the analog or hybrid beamforming architecture comprises a plurality of primary phase shifters and a plurality of secondary phase shifters. Each secondary phase shifter may be associated with a set of the primary phase shifters. The codebook may be configured to control values of the primary and secondary phase shifters.

In example 847, the subject matter of example 846 optionally includes that the primary and secondary phase shifters are low bit phase shifters.

In example 848, the subject matter of any one or more of examples 846-847 optionally include that the codebook further comprises a unitary multiplier to indicate whether the particular steering angle is set directly by the limited steering angle and shift value or whether the particular steering angle is set by a reflection of the limited steering angle and shift value around shift value about 180°.

In example 849, the subject matter of example 848 optionally includes that the codebook is limited to steering angles between arccos $$\left(\frac{1}{2^{b_p}}\right)^{\circ} < \phi \leq 90^{\circ},$$

where bp is a number of bits of each primary phase shifter.

In example 850, the subject matter of example 849 optionally includes that primary phase shifter values are limited to between [0, 0, 0, . . . , 0] and $$[0, 1, 2, \ldots, L-1]\frac{\pi}{2^{b_p}},$$

where L is a number of primary phase shifters.

In example 851, the subject matter of any one or more of examples 845-850 optionally include that the codebook is limited to steering angles between $$\arccos\left(\frac{1}{2^{b_p-1}}\right)^{\circ} < \phi \leq 90^{\circ},$$

where up is a number of bits of each primary phase shifter.

In example 852, the subject matter of any one or more of examples 846-851 optionally include that the secondary phase shifters are radio frequency or baseband phase shifters and the primary phase shifters are intermediate frequency or digital phase shifters.

In example 853, the subject matter of any one or more of examples 845-852 optionally include that a plurality of antennas configured to be steered by the phase shifters to communicate the beamformed signals.

Example 854 is a method of providing beam steering in a communication device. The method may comprise limiting a size of a codebook used for beam steering of antennas to a subset of steering angles over which the antennas are to be steered. The method may further comprise determining a particular steering angle, outside the subset of steering angles, to which to steer the antennas. The method may further comprise determining a limited steering angle within the subset of steering angles corresponding to the particular steering angle. The method may further comprise determining a shift value to shift the limited steering angle to the particular steering angle. The method may further comprise steering the antennas by applying the limited steering angle and the shift value.

In example 855, the subject matter of example 854 optionally includes that steering the antennas comprises applying a limited steering angle value to a plurality of primary phase shifters to steer the antennas to the limited steering angle. Steering the antennas may further comprise applying the shift value to a plurality of secondary phase shifters to shift the limited steering angle to the particular steering angle. Each secondary phase shifter may be connected with a set of the primary phase shifters.

In example 856, the subject matter of example 855 optionally includes that steering the antennas further comprises applying a unitary multiplier that indicates whether the particular steering angle is set directly by the limited steering angle and shift value or whether the particular steering angle is set by a reflection of the limited steering angle and shift value around shift value about 180°.

In example 857, the subject matter of example 856 optionally includes that the codebook is limited to steering angles between arccos $$\left(\frac{1}{2^{b_p}}\right)^{\circ} < \phi \leq 90^{\circ},$$

where bp is a number of bits of each primary phase shifter.

In example 858, the subject matter of example 857 optionally includes that primary phase shifter values are limited to between [0, 0, 0, . . . , 0] and $$[0, 1, 2, \ldots, L-1]\frac{\pi}{2^{b_p}},$$

where L is a number of primary phase shifters.

In example 859, the subject matter of any one or more of examples 854-858 optionally include that the codebook is limited to steering angles between $$\arccos\left(\frac{1}{2^{b_p-1}}\right)^{\circ} < \phi \leq 90^{\circ},$$

where bp is a number of bits of each primary phase shifter.

Example 860 is an apparatus of a communication device. The apparatus may comprise means for limiting a size of a codebook used for beam steering of antennas to a subset of steering angles over which the antennas are to be steered. The apparatus may further comprise means for determining a particular steering angle, outside the subset of steering angles, to which to steer the antennas. The apparatus may further comprise means for determining a limited steering angle within the subset of steering angles corresponding to the particular steering angle. The apparatus may further comprise means for determining a shift value to shift the limited steering angle to the particular steering angle. The apparatus may further comprise means for steering the antennas by applying the limited steering angle and the shift value.

In example 861, the subject matter of example 860 optionally includes that the apparatus further comprises means for applying a limited steering angle value to a plurality of primary phase shifters to steer the antennas to the limited steering angle. The apparatus may further comprise means for applying the shift value to a plurality of secondary phase shifters to shift the limited steering angle to the particular steering angle. Each secondary phase shifter may be connected with a set of the primary phase shifters.

In example 862, the subject matter of example 861 optionally includes wherein the apparatus further comprises means for applying a unitary multiplier that indicates whether the particular steering angle is set directly by the limited steering angle and shift value or whether the particular steering angle is set by a reflection of the limited steering angle and shift value around shift value about 180°.

In example 863, the subject matter of example 862 optionally includes that the codebook is limited to steering angles between $$\arccos\left(\frac{1}{2^{b_p}}\right)^{\circ} < \phi \leq 90^{\circ},$$

where bp is a number of bits of each primary phase shifter.

In example 864, the subject matter of example 863 optionally includes that primary phase shifter values are limited to between [0, 0, 0, . . . , 0] and $$[0, 1, 2, \ldots, L-1]\frac{\pi}{2^{b_p}},$$

where L is a number of primary phase shifters.

In example 865, the subject matter of any one or more of examples 860-864 optionally include that the codebook is limited to steering angles between $$\arccos\left(\frac{1}{2^{b_p-1}}\right)^{\circ} < \phi \leq 90^{\circ},$$

where bp is a number of bits of each primary phase shifter.

In example 866, the subject matter of any one or more of examples 861-865 optionally include that the secondary phase shifters are radio frequency or baseband phase shifters and the primary phase shifters are intermediate frequency or digital phase shifters.

In example 867, the subject matter of any one or more of examples 861-866 optionally include that the primary and secondary phase shifters are low bit phase shifters.

Example 868 is a computer-readable storage medium that stores instructions for execution by one or more processors of a communication device. The instructions may be configured to instruct the one or more processors to determine a particular steering angle, outside a subset of steering angles, to which to steer antennas. The instructions may be further configured to instruct the one or more processors to determine a limited steering angle within the subset of steering angles corresponding to the particular steering angle. The instructions may be further configured to instruct the one or more processors to determine a shift value to shift the limited steering angle to the particular steering angle. The instructions may be further configured to instruct the one or more processors to steer the antennas by applying the limited steering angle and the shift value.

In example 869, the subject matter of example 868 optionally includes that the instructions further instruct the one or more processors to apply a limited steering angle value to a plurality of primary phase shifters to steer the antennas to the limited steering angle. The instructions may be further configured to instruct the one or more processors to apply the shift value to a plurality of secondary phase shifters to shift the limited steering angle to the particular steering angle. Each secondary phase shifter connected with a set of the primary phase shifters.

In example 870, the subject matter of example 869 optionally includes that the instructions further instruct the one or more processors to apply a unitary multiplier that indicates whether the particular steering angle is set directly by the limited steering angle and shift value or whether the particular steering angle is set by a reflection of the limited steering angle and shift value around shift value about 180°.

In example 871, the subject matter of example 870 optionally includes that the instructions further instruct the one or more processors to limit a codebook that contains values to steer the antennas to steering angles between $$\arccos\left(\frac{1}{2^{b_p}}\right)^{\circ} < \phi \leq 90^{\circ},$$

where bp is a number of bits of each primary phase shifter.

In example 872, the subject matter of example 871 optionally includes that primary phase shifter values are limited to between [0, 0, 0, . . . , 0] and $$[0, 1, 2, \ldots, L-1]\frac{\pi}{2^{b_p}},$$

where L is a number of primary phase shifters.

In example 873, the subject matter of any one or more of examples 868-872 optionally include wherein the instructions further instruct the one or more processors to: limit a codebook that contains values to steer the antennas to steering angles between $$\arccos\left(\frac{1}{2^{b_p-1}}\right)^{\circ} < \phi \leq 90^{\circ},$$

where bp is a number of bits of each primary phase shifter.

Example 874 is an apparatus of a charge pump. The apparatus may comprise a plurality of switches controlled by a plurality of different control signals and an output capacitor to which the switches are connected. A voltage on the output capacitor may be controlled by leakage capacitances and subthreshold injection of the switches such that an output voltage of the charge pump is free from use of a current reference or charge accumulation device.

In example 875, the subject matter of example 874 optionally includes that the switches comprise a first switch group configured to step up the voltage on the output capacitor by a predetermined amount and a second switch group configured to step down the voltage on the output capacitor by the predetermined amount.

In example 876, the subject matter of example 875 optionally includes that each of the first and second switch groups comprises a dynamic switch connected to a different rail voltage and a subthreshold switch connected between the dynamic switch and the output capacitor.

In example 877, the subject matter of example 876 optionally includes that the leakage capacitances of the dynamic switch control subthreshold injection of the subthreshold switch.

In example 878, the subject matter of any one or more of examples 876-877 optionally include timing circuitry connected with the dynamic switch of each of the first and second switch groups. The timing circuitry may be configured to provide a first and second control signal of the plurality of different control signals respectively to the first and second switch groups. The first and second control signal may have a pulse width defined by a set of preset bits of the control signals.

In example 879, the subject matter of example 878 optionally includes that each preset bit of the set of preset bits controls a different subthreshold switch.

In example 880, the subject matter of any one or more of examples 878-879 optionally include that the output capacitor comprises an internal capacitor in parallel with a set of series-connected capacitor-switch combinations. Each switch of the set of series-connected capacitor-switch combinations may be controlled by a different preset bit of the set of preset bits.

In example 881, the subject matter of any one or more of examples 876-880 optionally include that charge is injected through a gate-drain capacitance of each dynamic switch.

In example 882, the subject matter of any one or more of examples 874-881 optionally include control logic connected with a pair of the switches and configured to trigger a voltage change of the output capacitor.

Example 883 is an apparatus of a charge pump. The apparatus may comprise a first and second dynamic switch configured to be controlled by an UP and DOWN control signal, respectively. The first and second dynamic switch may be connected to different rail voltages. The apparatus may further comprise a first and second series of switches. The first and second series of switches may be respectively connected to the first and second dynamic switch. Each switch of the first and second series of switches may be configured to be controlled by a different bit of a plurality of bits. The apparatus may further comprise an output capacitor to which the first and second series of switches are connected and configured to provide an output voltage of the charge pump.

In example 884, the subject matter of example 883 optionally includes that leakage capacitances of the first and second dynamic switch control subthreshold injection of the series of switches.

In example 885, the subject matter of any one or more of examples 883-884 optionally include that the series of switches comprises between 1 and 5 switches.

In example 886, the subject matter of any one or more of examples 883-885 optionally include first and second timing circuitry respectively connected with the first and second dynamic switch. The first and second timing circuitry may be configured to control a pulse width of the UP and DOWN control signal, respectively, and thereby control a voltage step of the output voltage.

In example 887, the subject matter of example 886 optionally includes that each of the first and second timing circuitry comprises an AND gate to which the UP or DOWN control signal and a delayed inverted copy of the UP or DOWN control signal are provided as inputs. The delayed inverted copy of the UP or DOWN control signal may be formed by the UP or DOWN control signal being delayed by a delay line connected to an inverter that is connected to the AND gate.

In example 888, the subject matter of example 887 optionally includes that the pulse width is defined by a set of preset bits supplied to the delay line.

In example 889, the subject matter of example 888 optionally includes that each preset bit of the set of preset bits controls a different switch of the first and second series of switches.

In example 890, the subject matter of any one or more of examples 888-889 optionally include that the output capacitor comprises an internal capacitor in parallel with a set of series-connected capacitor-switch combinations. Each switch of the set of series-connected capacitor-switch combinations controlled by a different preset bit of the set of preset bits.

Example 891 is a method of injecting charge in a charge pump. The method may comprise injecting charge across a gate-drain capacitance of a dynamic switch during a charge injection phase. The method may further comprise after injection of the charge, transferring the charge across a subthreshold switch to an output capacitance of the charge pump using subthreshold drain current during a charge transfer phase. The method may further comprise after transfer of the charge, terminating the charge transfer and current flow in the output capacitance to stop a voltage change of an output voltage during a shutdown phase.

In example 892, the subject matter of example 891 optionally includes that the charge injection occurs across a gate-drain capacitance of the dynamic switch on a positive edge of a control signal supplied to the dynamic switch. The dynamic switch may be configured to turn off at the positive edge.

In example 893, the subject matter of any one or more of examples 891-892 optionally include that the termination occurs on a negative edge of the control signal supplied to the dynamic switch. The dynamic switch may be configured to turn on at the negative edge.

In example 894, the subject matter of example 893 optionally includes that during the termination phase, a voltage at a net between the dynamic switch and the subthreshold switch returns to a rail voltage to which the dynamic switch is connected.

In example 895, the subject matter of any one or more of examples 891-894 optionally include controlling a pulse width of a control signal during the charge injection phase, and consequently controlling the voltage change.

In example 896, the subject matter of example 895 optionally includes that controlling the pulse width of the control signal comprises supplying the control signal and a delayed inverted copy of the control signal to an AND gate, and a set of preset bits to control an amount of delay of the delayed inverted copy of the control signal.

In example 897, the subject matter of example 896 optionally includes that during the charge transfer phase, the charge is transferred to the output capacitance across a number of subthreshold switches equal to a number of preset bit of the set of preset bits, each preset bit controlling a different subthreshold switch.

In example 898, the subject matter of any one or more of examples 896-897 optionally include controlling incorporation of a number of parallel internal capacitors to form the output capacitor. The number of parallel internal capacitors may be equal to a number of preset bit of the set of preset bits. Each internal capacitor may be incorporated by a different preset bit.

Example 899 is an apparatus of a charge pump. The apparatus may comprise means for injecting charge across a gate-drain capacitance of a dynamic switch. The apparatus may further comprise means for transferring the charge across a subthreshold switch to an output capacitance of the charge pump using subthreshold drain current after injection of the charge. The apparatus may further comprise means for terminating the charge transfer and current flow in the output capacitance to stop a voltage change of an output voltage after transfer of the charge.

In example 900, the subject matter of example 899 optionally includes means for controlling a pulse width of a control signal during the charge injection phase, and consequently controlling the voltage change.

In example 901, the subject matter of any one or more of examples 899-900 optionally include means for controlling the pulse width of the control signal comprises means for supplying the control signal and a delayed inverted copy of the control signal to an AND gate, and a set of preset bits to control an amount of delay of the delayed inverted copy of the control signal.

In example 902, the subject matter of example 901 optionally includes means for transferring the charge to the output capacitance across a number of subthreshold switches equal to a number of preset bit of the set of preset bits. Each preset bit may control a different subthreshold switch.

In example 903, the subject matter of any one or more of examples 901-902 optionally include means for controlling incorporation of a number of parallel internal capacitors to form the output capacitor. The number of parallel internal capacitors may be equal to a number of preset bit of the set of preset bits. Each internal capacitor may be incorporated by a different preset bit.

Example 904 is a computer-readable storage medium that stores instructions for execution by one or more processors of a communication device. The instructions may be configured to instruct the one or more processors to control a first and second dynamic switch by an UP and DOWN control signal, respectively. The first and second dynamic switch may be connected to different rail voltages. The instructions may be further configured to instruct the one or more processors to control each switch of a first and second series of switches by a different bit of a plurality of bits. The first and second series of switches may be respectively connected to the first and second dynamic switch. The instructions may be further configured to instruct the one or more processors to adjust an output voltage of an output capacitor of the charge pump to which the first and second series of switches are connected.

In example 905, the subject matter of example 904 optionally includes wherein the instructions configured to instruct the one or more processors to control a pulse width of the UP and DOWN control signal via first and second timing circuitry respectively connected with the first and second dynamic switch.

In example 906, the subject matter of example 905 optionally includes that each of the first and second timing circuitry comprises an AND gate to which the UP or DOWN control signal and a delayed inverted copy of the UP or DOWN control signal are provided as inputs. The instructions may be further configured to instruct the one or more processors to control a delay of a delay line connected to an inverter that is connected to the AND gate. The UP or DOWN control signal may be delayed by the delay line to form the delayed inverted copy of the UP or DOWN control signal.

In example 907, the subject matter of example 906 optionally includes that the pulse width is defined by a set of preset bits supplied to the delay line.

In example 908, the subject matter of example 907 optionally includes wherein the instructions configured to instruct the one or more processors to control a different switch of the first and second series of switches using a different preset bit.

In example 909, the subject matter of any one or more of examples 907-908 optionally include that the output capacitor comprises an internal capacitor in parallel with a set of series-connected capacitor-switch combinations. The instructions may be further configured to instruct the one or more processors to control each switch of the set of series-connected capacitor-switch combinations by a different preset bit.

Example 910 is an apparatus of a communication device. The apparatus may comprise receiver circuitry. The receiver circuitry may comprise a plurality of first quantizers configured to receive beamformed signals. The receiver circuitry may further comprise a feedforward loop configured to provide analog compensation signals to the beamformed signals, prior to the beamformed signals being supplied to the quantizers, to form compensated beamformed signals. The beamformed signals may comprise a signal from a transmitter and an interferer signal. The analog compensation signals may be configured to compensate for the interferer signal.

In example 911, the subject matter of example 910 optionally includes that the feedforward loop comprises a plurality of second quantizers configured to convert the beamformed signals to coarsely quantized signals. The feedforward loop may further comprise a plurality of digital to analog converters (DACs) configured to convert to the analog compensation signals.

In example 912, the subject matter of example 911 optionally includes that a resolution of the second quantizers is less than resolution of the first quantizers.

In example 913, the subject matter of any one or more of examples 911-912 optionally include that the feedforward loop further comprises a digital filter disposed between the second quantizers and the DACs. The digital filter may be configured to provide cross-correlated interference compensation for the coarsely quantized signals and produce digital versions of the analog compensation signals.

In example 914, the subject matter of example 913 optionally includes a plurality of combiners configured to combine the digital versions of the analog compensation signals and digital versions of the compensated beamformed signals to provide signal quality used to adjust the receiver circuitry.

In example 915, the subject matter of any one or more of examples 913-914 optionally include that the digital filter is configured to estimate interference from each direction from $\hat{i}_k[n]=a_r^H(\theta_k)y[n]$, where y[n] is a coarsely quantized signal at a particular second quantizer, and $a_r(\theta_k)$ is an estimation vector of interference from direction $\theta_k$, and subsequently determine an interference vector as: $i[n]=\hat{i}_1[n]a_r(\theta_1)+ \ldots +\hat{i}_l[n]a_r(\theta_1)$.

In example 916, the subject matter of any one or more of examples 911-915 optionally include that the feedforward loop further comprise: a plurality of combiners configured to add dithering noise to the beamformed signals prior to the beamformed signals being provided to the second quantizers. The dithering noise may be dependent on an estimate of the interference.

In example 917, the subject matter of any one or more of examples 911-916 optionally include a plurality of analog delay lines configured to add sufficient delay to the beamformed signals to permit the beamformed signals to be combined with the analog compensation signals supplied through the feedforward circuitry.

In example 918, the subject matter of any one or more of examples 911-917 optionally include a plurality of combiners configured to add dithering noise to the compensated beamformed signals. The dithering noise may be dependent on a measure of receiver performance.

In example 919, the subject matter of any one or more of examples 911-918 optionally include a plurality of first combiners configured to add first dithering noise to the beamformed signals prior to the beamformed signals being provided to the second quantizers. A plurality of second combiners may be configured to add second dithering noise to the compensated beamformed signals. The first and second dithering noise may be dependent on different qualities of the beamformed signal.

In example 920, the subject matter of any one or more of examples 910-919 optionally include a plurality of antennas configured to provide the beamformed signals.

Example 921 is a method of compensating for interferers in a receiver. The method may comprise receiving beamformed signals from a plurality of antennas. Each beamformed signal may comprise a signal from a transmitter and an interferer signal. The method may further comprise forming compensated signals by feedforward compensating the beamformed signals for the interferer signals, prior to quantizing compensated signals for output. The compensated signals may be dependent on the beamformed signals. The method may further comprise quantizing the compensated signals to form quantized output signals. The method may further comprise supplying the quantized output signals to a baseband processor for processing.

In example 921a, the subject matter of example 921 optionally includes quantizing the beamformed signals along a feedforward path to form quantized feedforward signals. The method may further comprise compensating for the interferer signals in the quantized feedforward signals to provide digital compensation signals. The method may further comprise converting the digital compensation signals to analog compensation signals. The method may further comprise combining the analog compensation signals with the beamformed signals to form the compensated signals.

In example 922, the subject matter of example 921a optionally includes that resolution of quantization of the beamformed signals is lower than resolution of quantization of the compensated signals.

In example 923, the subject matter of example 922 optionally includes adding first dithering noise to the beamformed signals prior to the quantizing the beamformed signals. The method may further comprise adding second dithering noise to the compensated signals.

In example 924, the subject matter of example 923 optionally includes combining the digital compensation signals and digital versions of the compensated signals to provide a signal quality. The method may further comprise controlling, based on the signal quality, at least one of: quantization of the beamformed signals, quantization of the compensated signals, the first dithering noise or the second dithering noise.

In example 925, the subject matter of any one or more of examples 921-924 (including 921a) optionally include that compensating for the interferer signals comprises estimating interference from each direction from: $\hat{i}_k[n]=a_r^H(\theta_k)y[n]$, where y[n] is a coarsely quantized signal at a particular second quantizer, and $a_r(\theta_k)$ is an estimation vector of interference from direction $\theta_k$, and subsequently determine an interference vector as: $i[n]=\hat{i}_1[n]a_r(\theta_1)+ \ldots +\hat{i}_l[n]a_r(\theta_1)$.

In example 926, the subject matter of any one or more of examples 921-926 (including 921a) optionally include delaying the beamformed signals sufficiently to permit the beamformed signals to be combined with the analog compensation signals.

Example 927 is an apparatus of a receiver. The apparatus may comprise means for receiving beamformed signals from a plurality of antennas. Each beamformed signal may comprise a signal from a transmitter and an interferer signal. The apparatus may further comprise means for forming compensated signals by feedforward compensating the beamformed signals for the interferer signals, prior to quantizing compensated signals for output. The compensated signals may be dependent on the beamformed signals. The apparatus may further comprise means for quantizing the compensated signals to form quantized output signals.

In example 928, the subject matter of example 927 optionally includes means for quantizing the beamformed signals along a feedforward path to form quantized feedforward signals; means for compensating for the interferer signals in the quantized feedforward signals to provide digital compensation signals. The apparatus may further comprise means for converting the digital compensation signals to analog compensation signals. The apparatus may further comprise means for combining the analog compensation signals with the beamformed signals to form the compensated signals.

In example 929, the subject matter of example 928 optionally includes that resolution of quantization of the beamformed signals is lower than resolution of quantization of the compensated signals.

In example 930, the subject matter of example 929 optionally includes means for adding first dithering noise to the beamformed signals prior to the quantizing the beamformed signals; and means for adding second dithering noise to the compensated signals.

In example 931, the subject matter of example 930 optionally includes means for combining the digital compensation signals and digital versions of the compensated signals to provide a signal quality. The apparatus may further comprise means for controlling, based on the signal quality, at least one of: quantization of the beamformed signals, quantization of the compensated signals, the first dithering noise or the second dithering noise.

In example 932, the subject matter of any one or more of examples 928-931 optionally include means for estimating interference from each direction from: $\hat{\iota}_k[n]=a_r^H(\theta_k)y[n]$, where y[n] is a coarsely quantized signal at a particular second quantizer, and $a_r(\theta_k)$ is an estimation vector of interference from direction $\theta_k$, and subsequently determine an interference vector as: $i[n]=\hat{\iota}_1[n]a_r(\theta_1)+\ldots+\hat{\iota}_l[n]a_r(\theta_1)$.

In example 933, the subject matter of any one or more of examples 931-932 optionally include means for delaying the beamformed signals sufficiently to permit the beamformed signals to be combined with the analog compensation signals.

Example 934 is a computer-readable storage medium that stores instructions for execution by one or more processors of a communication device. The instructions may be configured to instruct the one or more processors to receive beamformed signals from a plurality of antennas. Each beamformed signal may comprise a signal from a transmitter and an interferer signal. The instructions may be further configured to instruct the one or more processors to form compensated signals by feedforward compensating the beamformed signals for the interferer signals, prior to quantizing compensated signals for output. The compensated signals may be dependent on the beamformed signals. The instructions may be further configured to instruct the one or more processors to quantize the compensated signals to form quantized output signals.

In example 935, the subject matter of example 934 optionally includes that the instructions further configure the one or more processors to quantize the beamformed signals along a feedforward path to form quantized feedforward signals. The instructions may be further configured to instruct the one or more processors to compensate for interference in the quantized feedforward signals to provide digital compensation signals. The instructions may be further configured to instruct the one or more processors to convert the digital compensation signals to analog compensation signals. The instructions may be further configured to instruct the one or more processors to combine the analog compensation signals with the beamformed signals to form the compensated signals.

In example 936, the subject matter of example 935 optionally includes that resolution of quantization of the beamformed signals is lower than resolution of quantization of the compensated signals.

In example 937, the subject matter of example 936 optionally includes that the instructions further configure the one or more processors to add first dithering noise to the beamformed signals prior to the quantizing the beamformed signals. The instructions may be further configured to instruct the one or more processors to add second dithering noise to the compensated signals.

In example 938, the subject matter of example 937 optionally includes that the instructions further configure the one or more processors to combine the digital compensation signals and digital versions of the compensated signals to provide a signal quality. The instructions may be further configured to instruct the one or more processors to control, based on the signal quality, at least one of: quantization of the beamformed signals, quantization of the compensated signals, the first dithering noise or the second dithering noise.

In example 939, the subject matter of any one or more of examples 934-938 optionally include that the instructions further configure the one or more processors to: estimate interference from each direction from: $\hat{\iota}_k[n]=a_r^H(\theta_k)y[n]$, where y[n] is a coarsely quantized signal at a particular second quantizer, and $a_r(\theta_k)$ is an estimation vector of interference from direction $\theta_k$, and subsequently determine an interference vector as: $i[n]=\hat{\iota}_1[n]a_r(\theta_1)+\ldots+\hat{\iota}_l[n]a_r(\theta_1)$.

In example 940, the subject matter of any one or more of examples 934-939 optionally include that the instructions further configure the one or more processors to delay the beamformed signals sufficiently to permit the beamformed signals to be combined with the analog compensation signals.

Example 941 is an apparatus of a communication device. The apparatus may comprise a receiver that comprises compensation circuitry, a quantizer; and a baseband processor. The compensation circuitry may be configured to compensate, in an analog domain of the receiver, for interference in a radio frequency (RF) signal received at each of a plurality of beamforming antennas and produce an analog compensated signal. The quantizer may be configured to transform, to a quantized output, an analog input signal that is dependent on the compensation circuitry. The baseband processor may be configured to receive a baseband input signal that is dependent on the quantized output, apply an inversion of the compensation to the baseband input signal to reconstitute a digital version of the RF signal, and perform signal processing on the digital version of the RF signal.

In example 942, the subject matter of example 941 optionally includes that the compensation circuitry comprises a feedback loop configured to provide the quantized output from the quantizer to the analog domain. The feedback loop may comprise a filter configured to filter the quantized output dependent on a direction of the interference and produce a filtered signal. The feedback loop may further comprise a digital to analog converter (DAC) configured to convert the filtered signal to an analog signal. The feedback loop may further comprise a combiner configured to combine the analog signal with a signal from the antenna used to generate the analog input signal to the quantizer and form a combined signal.

In example 943, the subject matter of example 942 optionally includes that the quantizer and the digital to analog converter have different resolutions.

In example 944, the subject matter of example 943 optionally includes that at least one of the resolutions is dependent on at least one of a desired bit error rate (BER) or filter characteristic.

In example 945, the subject matter of any one or more of examples 942-944 optionally include a low pass filter (LPF) disposed between the combiner and the quantizer and configured to shape quantization noise in the combined signal to out-of-band.

In example 946, the subject matter of example 945 optionally includes a gain disposed between the LPF and the quantizer and configured to adjust a gain input to a dynamic range of the quantizer and provide the analog input signal.

In example 947, the subject matter of any one or more of examples 942-946 optionally include a low pass filter (LPF) disposed between the quantizer and the baseband processor and configured to eliminate harmonics introduced by the quantizer.

In example 948, the subject matter of any one or more of examples 942-947 optionally include a gain disposed between the DAC and the combiner and configured to adjust the analog signal one of dependent on a channel quality or set to a fixed gain.

In example 949, the subject matter of any one or more of examples 942-948 optionally include that the quantizer is configured to oversample the analog input signal. The receiver may further comprise a decimator disposed between the quantizer and the baseband processor and configured to down sample a decimator input signal to a Nyquist rate.

In example 950, the subject matter of any one or more of examples 942-949 optionally include that coefficients of the filter are dependent on directionality of the interference.

In example 951, the subject matter of example 950 optionally includes that the filter is defined as $W \in \mathbb{C}^{(K-1)}{}_{Nr\times Nr}$, where K is an oversampling rate and Nr is a number of the antennas.

In example 952, the subject matter of example 951 optionally includes that $$a_r(\theta_i) = \frac{1}{\sqrt{N_r}}\left[1, e^{j\frac{2\pi}{\lambda}dcos\theta_i}, e^{j\frac{2\pi}{\lambda}d2cos\theta_i}, \dots, e^{j\frac{2\pi}{\lambda}d(N_r-1)cos\theta_i}\right]^T,$$

$$W = \begin{bmatrix} F_1 \\ F_2 \\ \vdots \end{bmatrix}, L = \begin{bmatrix} 1 & 0 \\ 1 & 1 \end{bmatrix}, \text{ and } \alpha = \begin{bmatrix} 2 \\ 3 \end{bmatrix}$$

wherein d is an inter-antenna distance, and a filter coefficient matrix F E $\mathbb{C}^{2Nr\times Nr}$ is $$F = \begin{bmatrix} F_1 \\ F_2 \end{bmatrix} = \begin{bmatrix} L \otimes a_r^T(\theta_1) \\ \vdots \\ L \otimes a_r^T(\theta_I) \end{bmatrix}^+ \begin{bmatrix} \alpha \otimes a_r^T(\theta_1) \\ \vdots \\ \alpha \otimes a_r^T(\theta_I) \end{bmatrix}$$

wherein $[\cdot]^+$ is a pseudoinverse operator, I is a total number of interference directions, and ⊗ represents a Kronecker product.

In example 953, the subject matter of any one or more of examples 941-952 optionally include an antenna configured to transmit a signal dependent on the output oscillator signal.

Example 954 is a method of using a reduced quantizer dynamic range in a receiver. The method may comprise receiving a plurality of beamformed signals from a plurality of beamforming antennas. The method may further comprise for each beamformed signal: reducing the dynamic range of a quantizer to which the beamformed signal is supplied by compensating the beamformed signal for interference from an interferer prior to the beamformed signal being provided to the quantizer and providing a compensated signal to the quantizer; quantizing the compensated signal; digitally inverting compensation applied to the beamformed signal to regenerate a digital version of the beamformed signal, and signal processing the digital version of the beamformed signal.

In example 955, the subject matter of example 954 optionally includes filtering the quantized output using a filter whose coefficients are dependent on a direction of the interferer to produce a filtered signal. The method may further comprise converting the filtered signal to an analog signal. The method may further comprise combining the analog signal with the beamformed signal to generate the compensated signal.

In example 956, the subject matter of example 955 optionally includes at least one of: using different resolutions in quantizing the compensated signal and converting the filtered signal, or at least one of the different resolutions is dependent on at least one of a desired bit error rate (BER) or a filter characteristic.

In example 957, the subject matter of any one or more of examples 953-955 optionally include shaping quantization noise in the compensated signal to out-of-band using a low pass filter (LPF) to form a LPF signal.

In example 958, the subject matter of example 957 optionally includes adjusting a gain of the LPF signal prior to quantizing the LPF signal to reduce the dynamic range of the quantizer.

In example 959, the subject matter of any one or more of examples 954-958 optionally include that the compensated signal is oversampled during the quantizing. The method may further comprise eliminating harmonics introduced by the quantizer using a low pass filter (LPF) to generate a LPF signal and down sampling the LPF signal to a Nyquist rate.

In example 960, the subject matter of any one or more of examples 953-959 optionally include that the filter is defined as $W \in \mathbb{C}^{(K-1)Nr\times Nr}$, where K is an oversampling rate and Nr is a number of the antennas $$a_r(\theta_i) = \frac{1}{\sqrt{N_r}}\left[1, e^{j\frac{2\pi}{\lambda}dcos\theta_i}, e^{j\frac{2\pi}{\lambda}d2cos\theta_i}, \dots, e^{j\frac{2\pi}{\lambda}d(N_r-1)cos\theta_i}\right]^T,$$

$$W = \begin{bmatrix} F_1 \\ F_2 \\ \vdots \end{bmatrix}, L = \begin{bmatrix} 1 & 0 \\ 1 & 1 \end{bmatrix}, \text{ and } \alpha = \begin{bmatrix} 2 \\ 3 \end{bmatrix}$$

wherein d is an inter-antenna distance, and a filter coefficient matrix $F \in \mathbb{C}^{2Nr \times Nr}$ is:

$$F = \begin{bmatrix} F_1 \\ F_2 \end{bmatrix} = \begin{bmatrix} L \otimes a_r^T(\theta_1) \\ \vdots \\ L \otimes a_r^T(\theta_I) \end{bmatrix}^+ \begin{bmatrix} \alpha \otimes a_r^T(\theta_1) \\ \vdots \\ \alpha \otimes a_r^T(\theta_I) \end{bmatrix}$$

wherein $[\cdot]^+$ is a pseudoinverse operator, I is a total number of interference directions, and $\otimes$ represents a Kronecker product.

Example 961 is an apparatus of a digital polar transmitter. The apparatus may comprise means for receiving a plurality of beamformed signals from a plurality of beamforming antennas. The apparatus may further comprise for each beamformed signal: means for reducing the dynamic range of a quantizer to which the beamformed signal is supplied by compensating the beamformed signal for interference from an interferer prior to the beamformed signal being provided to the quantizer and providing a compensated signal to the quantizer; means for quantizing the compensated signal; means for digitally inverting compensation applied to the beamformed signal to regenerate a digital version of the beamformed signal, and means for signal processing the digital version of the beamformed signal.

In example 962, the subject matter of example 961 optionally includes means for filtering the quantized output using a filter whose coefficients are dependent on a direction of the interferer to produce a filtered signal. The apparatus may further comprise means for converting the filtered signal to an analog signal. The apparatus may further comprise means for combining the analog signal with the beamformed signal to generate the compensated signal.

In example 963, the subject matter of example 962 optionally includes that at least one of: different resolutions are used in quantizing the compensated signal and convert the filtered signal, or at least one of the different resolutions is dependent on at least one of a desired bit error rate (BER) or a filter characteristic.

In example 964, the subject matter of any one or more of examples 961-963 optionally include means for shaping quantization noise in the compensated signal to out-of-band using a low pass filter (LPF) to form a LPF signal.

In example 965, the subject matter of example 964 optionally includes means for adjusting a gain of the LPF signal prior to quantizing the LPF signal to reduce the dynamic range of the quantizer.

In example 966, the subject matter of any one or more of examples 961-965 optionally include that the compensated signal is oversampled during the quantizing. The apparatus may further comprise means for eliminating harmonics introduced by the quantizer using a low pass filter (LPF) to generate a LPF signal. The apparatus may further comprise means for down sampling the LPF signal to a Nyquist rate.

In example 967, the subject matter of any one or more of examples 961-966 optionally include that the filter is defined as $W \in \mathbb{C}^{(K-1)Nr \times Nr}$, where K is an oversampling rate and Nr is a number of the antennas, $$a_r(\theta_i) = \frac{1}{\sqrt{N_r}}\left[1, e^{j\frac{2\pi}{\lambda}dcos\theta_i}, e^{j\frac{2\pi}{\lambda}d2cos\theta_i}, \ldots, e^{j\frac{2\pi}{\lambda}d(N_r-1)cos\theta_i}\right]^T,$$

$$W = \begin{bmatrix} F_1 \\ F_2 \\ \vdots \end{bmatrix}, L = \begin{bmatrix} 1 & 0 \\ 1 & 1 \end{bmatrix}, \text{and } \alpha = \begin{bmatrix} 2 \\ 3 \end{bmatrix}$$

wherein d is an inter-antenna distance, and a filter coefficient matrix $F \in \mathbb{C}^{2Nr \times Nr}$ is:

$$F = \begin{bmatrix} F_1 \\ F_2 \end{bmatrix} = \begin{bmatrix} L \otimes a_r^T(\theta_1) \\ \vdots \\ L \otimes a_r^T(\theta_I) \end{bmatrix}^+ \begin{bmatrix} \alpha \otimes a_r^T(\theta_1) \\ \vdots \\ \alpha \otimes a_r^T(\theta_I) \end{bmatrix}$$

wherein $[\cdot]^+$ is a pseudoinverse operator, I is a total number of interference directions, and $\otimes$ represents a kronecker product.

Example 968 is a computer-readable storage medium that stores instructions for execution by one or more processors of a communication device to configure the communication device to receive a plurality of beamformed signals from a plurality of beamforming antennas. The instructions may further configure the communication device to, for each beamformed signal: reduce the dynamic range of a quantizer to which the beamformed signal is supplied by compensating the beamformed signal for interference from an interferer prior to the beamformed signal being provided to the quantizer and provide a compensated signal to the quantizer; independently adjust an amplitude of each of the compensation and the compensated signal; quantize the compensated signal; digitally invert compensation applied to the beamformed signal to regenerate a digital version of the beamformed signal, and signal process the digital version of the beamformed signal.

In example 969, the subject matter of example 968 optionally includes that the one or more processors further configure the communication device to filter the quantized output using a filter whose coefficients are dependent on a direction of the interferer to produce a filtered signal. The instructions may further configure the communication device to convert the filtered signal to an analog signal. The instructions may further configure the communication device to combine the analog signal with the beamformed signal to generate the compensated signal.

In example 970, the subject matter of example 969 optionally includes that at least one of: different resolutions are used in quantizing the compensated signal and convert the filtered signal, or at least one of the different resolutions is dependent on at least one of a desired bit error rate (BER) or a filter characteristic.

In example 971, the subject matter of any one or more of examples 968-970 optionally include that the one or more processors further configure the communication device to: shape quantization noise in the compensated signal to out-of-band using a low pass filter (LPF) to form a LPF signal.

In example 972, the subject matter of any one or more of examples 968-971 optionally include that the compensated signal is oversampled during the quantizing. The instructions may further configure the communication device to eliminate harmonics introduced by the quantizer using a low pass filter (LPF) to generate a LPF signal and down sample the LPF signal to a Nyquist rate.

In example 973, the subject matter of any one or more of examples 968-972 optionally include that the filter is defined as $W \in \mathbb{C}^{(K-1)Nr \times Nr}$, where K is an oversampling rate and Nr is a number of the antennas, $$a_r(\theta_i) = \frac{1}{\sqrt{N_r}}\left[1, e^{j\frac{2\pi}{\lambda}d\cos\theta_i}, e^{j\frac{2\pi}{\lambda}d2\cos\theta_i}, \ldots, e^{j\frac{2\pi}{\lambda}d(N_r-1)\cos\theta_i}\right]^T,$$

-continued $$W = \begin{bmatrix} F_1 \\ F_2 \\ \vdots \end{bmatrix}, L = \begin{bmatrix} 1 & 0 \\ 1 & 1 \end{bmatrix}, \text{and } \alpha = \begin{bmatrix} 2 \\ 3 \end{bmatrix}$$

wherein d is an inter-antenna distance, and a filter coefficient matrix $F \in \mathbb{C}^{2Nr \times Nr}$ is:

$$F = \begin{bmatrix} F_1 \\ F_2 \end{bmatrix} = \begin{bmatrix} L \otimes a_r^T(\theta_1) \\ \vdots \\ L \otimes a_r^T(\theta_I) \end{bmatrix}^+ \begin{bmatrix} \alpha \otimes a_r^T(\theta_1) \\ \vdots \\ \alpha \otimes a_r^T(\theta_I) \end{bmatrix}$$

wherein $[\cdot]^+$ is a pseudoinverse operator, I is a total number of interference directions, and $\otimes$ represents a kronecker product.

Example 974 is an apparatus of a communication device. The apparatus may comprise an analog to digital converter system (ADCS) comprising an adjustable ADC configuration. The ADC configuration may comprise a plurality of core ADCs that are adjustable between parallel operation in an averaging mode and serial operation in a time-interleaved mode. The ADCS may be configured in the averaging mode for higher resolution, lower bandwidth operation of the communication device and configured in the time-interleaved mode for lower resolution, higher speed operation of the communication device.

In example 975, the subject matter of example 974 optionally includes that the ADCS further comprises a plurality of timing units. Each timing unit may be connected with a different core ADC of the plurality of core ADCs. Each timing unit may be configured to provide a system clock signal to an associated core ADC based on a master clock signal supplied to the timing unit. The system clock signal may be dependent on which of the averaging or time-interleaved mode the ADCS is in.

In example 976, the subject matter of example 975 optionally includes that each timing unit and core ADC is configured to receive a mode signal from a controller that indicates which of the averaging or time-interleaved mode the ADCS is in and a set of configuration bits to tune the timing unit and core ADC to a desired setup in at least one of the averaging or time-interleaved mode.

In example 977, the subject matter of example 976 optionally includes that the mode signal comprises a single bit that indicates which of the averaging or time-interleaved mode the ADCS is in and at least one additional bit that indicate how many of the core ADCs to use.

In example 978, the subject matter of example 977 optionally includes that the at least one additional bit specifies which of the core ADCs to use.

In example 979, the subject matter of any one or more of examples 976-978 optionally include that the mode signal consists of a single bit that indicates which of the averaging or time-interleaved mode the ADCS is in.

In example 980, the subject matter of any one or more of examples 974-979 optionally include that the core ADCs are variable bit ADCs whose resolution changes dependent on which of the averaging or time-interleaved mode the ADCS is in.

In example 981, the subject matter of any one or more of examples 974-980 optionally include that each core ADC comprises a sampling circuit to oversample and decimate an input signal to be quantized.

In example 982, the subject matter of any one or more of examples 974-981 optionally include that the ADCS further comprises a processing circuit configured to receive quantized signals from the core ADCs and process the quantized signals differently dependent on which of the averaging or time-interleaved mode the ADCS is in.

In example 983, the subject matter of example 982 optionally includes that the processing circuit is configured to operate as a buffer when the ADCS is in the averaging mode and as an equalizer when the ADCS is in the time-interleaved mode.

In example 984, the subject matter of any one or more of examples 974-983 optionally include an antenna comprising antenna elements that provide input signals to the ADCS.

Example 985 is a method of providing a flexible analog to digital converter (ADC) architecture. The method may comprise adjusting an ADC configuration between an averaging mode ADC configuration for higher resolution, lower bandwidth operation and a time-interleaved mode ADC configuration for lower resolution, higher speed operation in which the outputs from the core ADCs are averaged. The method may further comprise averaging outputs from core ADCs in the averaging mode ADC configuration to produce an averaged ADC output. The method may further comprise combining outputs from core ADCs in the time-interleaved mode ADC configuration to produce a time-interleaved ADC output.

In example 986, the subject matter of example 985 optionally includes providing a system clock signal and a local master clock signal to each core ADC based on a master clock signal supplied to the timing unit. The method may further comprise adjusting the system clock signal dependent on the ADC configuration.

In example 987, the subject matter of example 986 optionally includes that the system clock signal is adjusted based on a mode signal that indicates the ADC configuration. The mode signal may comprise a single bit that indicates the ADC configuration and at least one additional bit that indicate how many of the core ADCs to use.

In example 988, the subject matter of any one or more of examples 986-987 optionally include that the system clock signal is adjusted based on a mode signal that indicates the ADC configuration. The mode signal may consist of a single bit that indicates the ADC configuration.

In example 989, the subject matter of any one or more of examples 986-988 optionally include that the system clock signal is adjusted based on a mode signal that indicates the ADC configuration. The method may further comprise tuning the ADC configuration to a desired setup based on a set of configuration bits.

In example 990, the subject matter of any one or more of examples 985-989 optionally include adjusting a resolution of the core ADCs dependent on the ADC configuration.

In example 991, the subject matter of any one or more of examples 985-990 optionally include oversampling and decimating an input signal to each of the core ADCs prior to quantizing the input signal to produce a quantized signal.

In example 992, the subject matter of any one or more of examples 985-991 optionally include processing the quantized signals differently dependent on the ADC configuration. The processing may comprise buffering the quantized signals from each of the core ADCs in the averaging mode ADC configuration and equalizing the quantized signals from each of the core ADCs in the time-interleaved mode ADC configuration.

Example 993 is an apparatus of a communication device. The apparatus may comprise means for adjusting an analog to digital converter (ADC) configuration between an averaging mode ADC configuration for higher resolution, lower bandwidth operation and a time-interleaved mode ADC configuration for lower resolution, higher speed operation in which the outputs from the core ADCs are averaged. The apparatus may further comprise means for averaging outputs from core ADCs in the averaging mode ADC configuration to produce an averaged ADC output. The apparatus may further comprise means for combining outputs from core ADCs in the time-interleaved mode ADC configuration to produce a time-interleaved ADC output.

In example 994, the subject matter of example 993 optionally includes means for providing a system clock signal and a local master clock signal to each core ADC based on a master clock signal supplied to the timing unit. The apparatus may further comprise means for adjusting the system clock signal dependent on the ADC configuration.

In example 995, the subject matter of example 994 optionally includes that the system clock signal is adjusted based on a mode signal that indicates the ADC configuration. The mode signal may comprise a single bit that indicates the ADC configuration and at least one additional bit that indicate how many of the core ADCs to use.

In example 996, the subject matter of any one or more of examples 994-995 optionally include that the system clock signal is adjusted based on a mode signal that indicates the ADC configuration. The mode signal may consist of a single bit that indicates the ADC configuration.

In example 997, the subject matter of any one or more of examples 994-996 optionally include that the system clock signal is adjusted based on a mode signal that indicates the ADC configuration. The mode signal may comprise a single bit that indicates which of the averaging or time-interleaved mode the ADCS is in and at least one additional bit that indicate how many of the core ADCs to use.

In example 998, the subject matter of any one or more of examples 994-997 optionally include means for adjusting a resolution of the core ADCs dependent on the ADC configuration.

In example 999, the subject matter of any one or more of examples 994-998 optionally include means for oversampling and decimating an input signal to each of the core ADCs prior to quantizing the input signal to produce a quantized signal.

Example 1000 is a computer-readable storage medium that stores instructions for execution by one or more processors of a communication device. The instructions may be configured to instruct the one or more processors to adjust an analog to digital converter (ADC) configuration of a plurality of core ADCs between an averaging mode and a time-interleaved mode. The averaging mode may be configured for higher resolution, lower bandwidth operation and the time-interleaved mode may be configured for lower resolution, higher speed operation. The instructions may be configured to instruct the one or more processors to process quantized signals from the core ADCs differently dependent on the ADC configuration. The processing may comprise buffering the quantized signals from each of the core ADCs in the averaging mode ADC configuration and equalizing the quantized signals from each of the core ADCs in the time-interleaved mode ADC configuration.

In example 1001, the subject matter of example 1000 optionally includes that the instructions further instruct the one or more processors to configure each of a plurality of timing units to provide a system clock signal to a different core ADC based on a master clock signal supplied to the timing unit. The system clock signal may be dependent on the ADC configuration.

In example 1002, the subject matter of example 1001 optionally includes that each timing unit and core ADC is configured to receive a mode signal that indicates which of the ADC configuration. The mode signal may comprise mode signal comprises a single bit that indicates the ADC configuration and at least one additional bit that indicate how many of the core ADCs to use.

In example 1003, the subject matter of example 1002 optionally includes that the at least one additional bit specifies which of the core ADCs to use.

In example 1004, the subject matter of example 1003 optionally includes that each timing unit and core ADC is configured to receive a mode signal that indicates which of the ADC configuration. The mode signal may comprise consist of a single bit that indicates the ADC configuration.

In example 1005, the subject matter of any one or more of examples 1000-1004 optionally include that the core ADCs are variable bit ADCs whose resolution changes dependent on which of the averaging or time-interleaved mode the ADCS is in.

In example 1006, the subject matter of any one or more of examples 1000-1005 optionally include that each core ADC comprises a sampling circuit to oversample and decimate an input signal to be quantized.

Example 1007 is an apparatus of a communication device. The apparatus may comprise receiver circuitry comprising a plurality of analog to digital converters (ADCs) configured to receive beamformed signals. The receiver circuitry may be configured to provide analog compensation to the beamformed signals prior to the beamformed signals being supplied to the ADCs. The beamformed signals may comprise a desired signal and an interferer signal. The compensation may be configured to compensate for the interferer signal and reduce dynamic gains of the ADCs.

In example 1008, the subject matter of example 1007 optionally includes that the receiver circuitry further comprises a baseband processor configured to receive digital signals from the ADCs. The baseband processor may be further configured to provide an inverse of the analog compensation prior to a determination of a direction of the desired signal.

In example 1009, the subject matter of any one or more of examples 1007-1008 optionally include a radio frequency (RF) front end configured to output the beamformed signals as a plurality of analog outputs. The receiver circuitry may further comprise a combiner for each analog output. The combiner may be configured to combine a weighted copy of each of the analog outputs.

In example 1010, the subject matter of example 1009 optionally includes that an analog summation weight matrix that describes weightings of the analog outputs is an invertible matrix, the weightings being fixed.

In example 1011, the subject matter of any one or more of examples 1009-1010 optionally include that an analog summation weight matrix that describes weightings of the analog outputs is an invertible matrix. The weightings may be adaptively dependent on conditions of the desired and interferer signal to maximize signal-to-interference-plus-noise (SINR) of the desired signal.

In example 1012, the subject matter of example 1011 optionally includes that the analog summation weight matrix comprises a Hadamard matrix.

In example 1013, the subject matter of any one or more of examples 1009-1012 optionally include that the receiver circuitry further comprises, for each combiner, a variable gain comprising an input to which an output of the combiner is supplied and an output connected with an input of a corresponding ADC. A gain of the variable gain may be set to normalize a power level of a beamformed signal supplied to the corresponding ADC.

In example 1014, the subject matter of any one or more of examples 1009-1013 optionally include that the combiner is implemented with current mode summation.

In example 1015, the subject matter of any one or more of examples 1008-1014 optionally include that the baseband processor is further configured to enable a number of the ADCs for use during a particular operation.

In example 1016, the subject matter of any one or more of examples 1008-1015 optionally include that the baseband processor is further configured to select a dynamic range of each ADC dependent on a desired array interference rejection and angle resolution.

In example 1017, the subject matter of any one or more of examples 1007-1016 optionally include an antenna comprising antenna elements that provide the beamformed signals.

Example 1018 is a method of reducing dynamic gain of analog to digital converters (ADCs) in a receiver. The method may comprise receiving beamformed signals from a plurality of antenna elements of an antenna. Each beamformed signal may comprise a desired signal and an interferer signal. The method may further comprise compensating for the interferer signal, prior to providing the beamformed signals to the ADCs, to form compensated signals. Each compensated signal may be provided to a different ADC; quantizing the compensated signals at the ADCs to form quantized signals. The method may further comprise reversing the compensating prior to processing the quantized signals.

In example 1019, the subject matter of example 1018 optionally includes that the processing of the quantized signals comprises at least one of determining a direction of at least one of the desired or interfering signal or channel sounding.

In example 1020, the subject matter of any one or more of examples 1018-1019 optionally include that the compensating for the interferer signal comprises, for each compensated signal, combining a weighted copy of each of the beamformed signals.

In example 1021, the subject matter of example 1020 optionally includes that an analog summation weight matrix that describes weightings of the beamformed signals is an invertible matrix. The weightings may be fixed.

In example 1022, the subject matter of any one or more of examples 1020-1021 optionally include that an analog summation weight matrix that describes weightings of the beamformed signals is an invertible matrix. The weightings may be dependent on conditions of the desired and interferer signal to maximize signal-to-interference-plus-noise (SINR) of the desired signal.

In example 1023, the subject matter of example 1022 optionally includes that the analog summation weight matrix comprises a Hadamard matrix.

In example 1024, the subject matter of any one or more of examples 1018-1023 optionally include adjusting a variable gain of each compensated signal to normalize a power level of a signal supplied to a corresponding ADC of the ADCs.

In example 1025, the subject matter of any one or more of examples 1018-1024 optionally include adjusting a number of the ADCs to use during a particular operation.

In example 1026, the subject matter of any one or more of examples 1018-1025 optionally include selecting a dynamic range of each ADC dependent on a desired array interference rejection and angle resolution.

Example 1027 is an apparatus of a communication device. The apparatus may comprise means for receiving beamformed signals from a plurality of antenna elements of an antenna. Each beamformed signal may comprise a desired signal and an interferer signal. The apparatus may further comprise means for compensating for the interferer signal, prior to providing the beamformed signals to analog-to-digital converters (ADCs), to form compensated signals. Each compensated signal may be provided to a different ADC. The apparatus may further comprise means for quantizing the compensated signals at the ADCs to form quantized signals. The apparatus may further comprise means for reversing the compensating prior to processing the quantized signals.

In example 1028, the subject matter of example 1027 optionally includes at least one of means for determining a direction of at least one of the desired or interfering signal or channel sounding during processing of the quantized signals.

In example 1029, the subject matter of any one or more of examples 1027-1028 optionally include that the means for compensating for the interferer signal comprises, for each compensated signal, means for combining a weighted copy of each of the beamformed signals.

In example 1030, the subject matter of example 1029 optionally includes that an analog summation weight matrix that describes weightings of the beamformed signals is an invertible matrix. The weightings may be fixed.

In example 1031, the subject matter of any one or more of examples 1029-1030 optionally include that an analog summation weight matrix that describes weightings of the beamformed signals is an invertible matrix. The weightings may be dependent on conditions of the desired and interferer signal to maximize signal-to-interference-plus-noise (SINR) of the desired signal.

In example 1032, the subject matter of example 1031 optionally includes that the analog summation weight matrix comprises a Hadamard matrix.

In example 1033, the subject matter of any one or more of examples 1027-1032 optionally include means for adjusting a variable gain of each compensated signal to normalize a power level of a signal supplied to a corresponding ADC of the ADCs.

In example 1034, the subject matter of any one or more of examples 1027-1033 optionally include means for adjusting a number of the ADCs to use during a particular operation.

In example 1035, the subject matter of any one or more of examples 1027-1034 optionally include means for selecting a dynamic range of each ADC dependent on a desired array interference rejection and angle resolution.

Example 1036 is a computer-readable storage medium that stores instructions for execution by one or more processors of a communication device. The instructions may be configured to instruct the one or more processors to invert analog compensation of beamformed signals that have been quantized to form quantized signals prior to inversion of the analog compensation. Each beamformed signal may comprise a desired signal and an interferer signal. Each quantized signal may be provided on a different signal path. The instructions may further be configured to process the quantized signals after the inversion of the analog compensation to at least one of: determine a direction of at least one of the desired or interfering signal, or perform channel sounding.

In example 1037, the subject matter of example 1036 optionally includes that the analog compensation comprises, for each signal path, combining a weighted copy of each of the beamformed signals.

In example 1038, the subject matter of example 1037 optionally includes that an analog summation weight matrix that describes weightings of the beamformed signals is an invertible matrix. The weightings may be fixed.

In example 1039, the subject matter of any one or more of examples 1037-1038 optionally include that an analog summation weight matrix that describes weightings of the beamformed signals is an invertible matrix. The instructions may be configured to instruct the one or more processors to adjust the weightings dependent on conditions of the desired and interferer signal to maximize signal-to-interference-plus-noise (SINR) of the desired signal.

In example 1040, the subject matter of example 1039 optionally includes that the analog summation weight matrix comprises a Hadamard matrix.

In example 1041, the subject matter of any one or more of examples 1036-1040 optionally include that the instructions configured to instruct the one or more processors to adjust a variable gain of each analog compensated beamformed signal to normalize a power level of the analog compensated beamformed signal prior to quantization of the analog compensated beamformed signal to form the quantized signal.

In example 1042, the subject matter of any one or more of examples 1036-1041 optionally include that the instructions configured to instruct the one or more processors to adjust a number of simultaneous quantizations active during a particular operation.

In example 1043, the subject matter of any one or more of examples 1036-1042 optionally include wherein the instructions configured to instruct the one or more processors to select a dynamic range of each quantization dependent on a desired array interference rejection and angle resolution of the beamformed signals.

Example 1044 is a loopback-based time skew calibration circuit for a time-interleaved analog-to-digital converter (ADC) that may comprise a plurality of signal channels, each channel comprising a digital-to-analog converter (DAC) in a transmit path of a radio-frequency transceiver and an ADC driven by a clock in a receive path of the transceiver, a reference signal generator to generate a reference signal in the transmit path of at least one signal channel, a loopback connection to transmit the reference signal to the receive path corresponding to the transmit path of the at least one signal channel, a phase estimator to determine an estimated time skew associated with the reference signal, and a delay correction circuit to control the clock timing to compensate for the estimated time skew and that comprises an input at which the estimated time skew is provided.

In example 1045, the subject matter of example 1044 optionally includes that the reference signal generator generates the reference signal in the transmit path of all signal channels.

In example 1046, the subject matter of any one or more of examples 1044-1045 optionally include a transmit path intermediate-frequency (IF) amplifier, and a receive path IF amplifier, and the loopback connection is connected adjacent to both the transmit path IF amplifier and the receive path IF amplifier.

In example 1047, the subject matter of any one or more of examples 1044-1046 optionally include that the at least one signal channel comprises an in-phase (I) sub-channel and a quadrature (Q) sub-channel, the reference signal is provided in an I transmit sub-path and a Q transmit sub-path, the phase estimator comprises an I phase estimator and a Q phase estimator, and the delay correction circuit comprises an I delay correction circuit and a Q delay correction circuit.

In example 1048, the subject matter of any one or more of examples 1044-1047 optionally include that the reference signal is a sinusoidal signal of a predefined frequency.

In example 1049, the subject matter of example 1048 optionally includes that the reference signal has a form $s(t)=A\sin(2\pi ft+\theta)$, where f predefined sinusoid frequency, 0 phase of the sinusoid, and A amplitude of the sinusoid.

In example 1050, the subject matter of any one or more of examples 1044-1049 optionally include that the reference signal is a complex exponential signal.

In example 1051, the subject matter of example 1050 optionally includes that the reference signal has a form $sI(t)=AI\cos(2\pi ft+\theta)$, $sQ(t)=AQ\sin(2\pi ft+\theta)$, where f predefined sinusoid frequency, 0 phase of the sinusoid, A1 amplitude of the in-phase sinusoid, and AQ amplitude of the quadrature sinusoid.

In example 1052, the subject matter of any one or more of examples 1044-1051 optionally include that the ADCs are combined to form a time-interleaved analog-to-digital converter (TI-ADC).

In example 1053, the subject matter of example 1052 optionally includes that the ADCs operate with a common sampling frequency.

In example 1054, the subject matter of any one or more of examples 1044-1053 optionally include that the circuit is integrated with modem circuitry for the radio-frequency transceiver.

In example 1055, the subject matter of example 1054 optionally includes that the modem circuitry is integrated with the radio-frequency transceiver.

Example 1056 is a method for operating a loopback-based time skew calibration circuit for a time-interleaved analog-to-digital converter (ADC), that may comprise generating, by a reference signal generator, a reference signal that is provided to at least one of a plurality of signal channels, each signal channel comprising a digital-to-analog converter (DAC) in a transmit path of the transceiver and an analog-to-digital converter (ADC) driven by a clock in a receive path of the transceiver, communicating the reference signal from the transmit path to the receive path corresponding to the transmit path of the at least one signal channel, calculating, with a phase estimator, an estimated time skew based on the reference signal, and correcting clock timing with a delay correction circuit to control the clock timing to compensate for the estimated time skew.

Example 1057 is a computer program product comprising one or more computer readable storage media comprising computer-executable instructions operable to, when executed by processing circuitry of a device, configure the device to generate, by a reference signal generator, a reference signal that is provided to at least one of a plurality of signal channels, each signal channel comprising a digital-to-analog converter (DAC) in a transmit path of the transceiver and an analog-to-digital converter (ADC) driven by a clock in a receive path of the transceiver, communicate the reference signal from the transmit path to the receive path corresponding to the transmit path of the at least one signal channel, calculate, with a phase estimator, an estimated time skew based on the reference signal, and correct clock timing with a delay correction circuit to control the clock timing to compensate for the estimated time skew.

In example 1058, the subject matter of example 1057 optionally includes that the reference signal generator generates the reference signal in the transmit path of all signal channels.

Example 1059 is a system comprising means to perform method Example 1056.

Example 1060 is an apparatus for operating a loopback-based time skew calibration circuit for a time-interleaved analog-to-digital converter (ADC), that may comprise means for generating, by a reference signal generator, a reference signal that is provided to at least one of a plurality of signal channels, each signal channel comprising a digital-to-analog converter (DAC) in a transmit path of the transceiver and an analog-to-digital converter (ADC) driven by a clock in a receive path of the transceiver, means for communicating the reference signal from the transmit path to the receive path corresponding to the transmit path of the at least one signal channel, means for calculating, with a phase estimator, an estimated time skew based on the reference signal, and means for correcting clock timing with a delay correction circuit to control the clock timing to compensate for the estimated time skew.

In example 1061, the subject matter of example 1060 optionally includes that the reference signal generator generates the reference signal in the transmit path of all signal channels.

In example 1062, the subject matter of any one or more of examples 1060-1061 optionally include means for amplifying an intermediate-frequency signal in a transmit path, and means for amplifying an IF signal in a receive path, that the loopback connection is connected adjacent to both the transmit path amplifier and the receive path amplifier.

In example 1063, the subject matter of any one or more of examples 1060-1062 optionally include that the reference signal is a sinusoidal signal of a predefined frequency.

In example 1064, the subject matter of example 1063 optionally includes that the reference signal has a form $s(t)=A \sin(2\pi ft+\theta)$, where f predefined sinusoid frequency, 0 phase of the sinusoid, and A amplitude of the sinusoid.

In example 1065, the subject matter of any one or more of examples 1060-1064 optionally include that the reference signal is a complex exponential signal.

In example 1066, the subject matter of example 1065 optionally includes that the reference signal has a form $sl(t)=Alcos(2\pi ft+\theta)$, $sQ(t)=AQsin(2\pi ft+\theta)$, where f predefined sinusoid frequency, 0 phase of the sinusoid, A1 amplitude of the in-phase sinusoid, and AQ amplitude of the quadrature sinusoid.

In example 1067, the subject matter of any one or more of examples 1060-1066 optionally include that the ADCs are combined to form a time-interleaved analog-to-digital converter (TI-ADC).

In example 1068, the subject matter of example 1067 optionally includes that the ADCs operate with a common sampling frequency.

In example 1069, the subject matter of any one or more of examples 1060-1068 optionally include that the apparatus is integrated with modem circuitry for the radio-frequency transceiver.

In example 1070, the subject matter of example 1069 optionally includes that the modem circuitry is integrated with the radio-frequency transceiver.

Example 1071 is a time-interleaved analog-to-digital converter (TI-ADC) with a gain correction device, that may comprise a switch to switch between a device input in a normal operation mode and a reference voltage input in a calibration mode, and to output a switched signal, a plurality of signal channels, each comprising an analog-to-digital converter (ADC) to receive a slice of the switched signal and provide a digital output signal, a multiplexer to produce a combined output signal from the digital output signals of the ADCs, a measure and correction unit to adjust, or support the adjustment of, a signal when operating in the normal mode to produce a gain adjusted output signal and to provide a measurement signal when operating in the calibration mode, and a controller to control the switch and the measure and correction unit to operate in the normal operation mode or the calibration mode, store measurement signal related data in a memory for the adjustment of the combined output signal, and control an interleave timing of the signal channels.

In example 1072, the subject matter of example 1071 optionally includes that the plurality of signal channels each further comprise a track or sample and hold circuit before the ADC that are collectively controlled by the controller to provide interleave timing and operation of the ADCs in a cascaded manner.

In example 1073, the subject matter of example 1072 optionally includes that the switch is provided between the channel track or sample and hold circuits and respective ADCs.

In example 1074, the subject matter of any one or more of examples 1071-1073 optionally include that the measurement signal related data are gain values that are used for the adjustment in respective channels.

In example 1075, the subject matter of example 1074 optionally includes that the gain values are gain offsets.

In example 1076, the subject matter of any one or more of examples 1074-1075 optionally include that the gain values are based on multiple reference voltage values provided by the reference voltage input.

In example 1077, the subject matter of example 1076 optionally includes that the multiple reference voltage values are waveform signal values.

In example 1078, the subject matter of example 1077 optionally includes that the waveform signal values are provided from a feedback signal derived from the gain adjusted output signal.

In example 1079, the subject matter of any one or more of examples 1077-1078 optionally include that the waveform signal values are based on a complex exponential signal.

In example 1080, the subject matter of any one or more of examples 1076-1079 optionally include that the gain values are stored in a look-up table (LUT) in the memory.

In example 1081, the subject matter of any one or more of examples 1076-1080 optionally include that a gain value calculator utilizes linear interpolation for values between calibration values.

In example 1082, the subject matter of any one or more of examples 1071-1081 optionally include that the controller is to make an analog adjustment within the signal channels based on the measurement signal related data.

In example 1083, the subject matter of example 1082 optionally includes that the analog adjustment is made by a control of the ADCs.

In example 1084, the subject matter of any one or more of examples 1071-1083 optionally include a temperature reference to provide temperature-related information to associate and store with the measurement signal related data.

Example 1085 is a method for operating a time-interleaved analog-to-digital converter (TI-ADC) with gain correction device, that may comprise switching between a device input in a normal operation mode and a reference voltage input in a calibration mode, and outputting a switched signal, receiving, with a plurality of signal channels, each comprising an analog-to-digital converter (ADC), a slice of the switched signal and provide a digital output signal, producing, with a multiplexer, a combined output signal from the digital output signals of the ADCs, adjusting or supporting the adjustment of a signal when operating in the normal mode to produce a gain adjusted output signal and to provide a measurement signal when operating in the calibration mode, and controlling the switch and the measure and correction unit to operate in the normal operation mode or the calibration mode, store measurement signal related data in a memory for the adjustment of the combined output signal, and control an interleave timing of the signal channels.

Example 1086 is a computer program product comprising one or more computer readable storage media comprising computer-executable instructions operable to, when executed by processing circuitry of a device, configure the device to switch between a device input in a normal operation mode and a reference voltage input in a calibration mode, and outputting a switched signal, receive, with a plurality of signal channels, each comprising an analog-to-digital converter (ADC), a slice of the switched signal and provide a digital output signal, produce, with a multiplexer, a combined output signal from the digital output signals of the ADCs, adjust or support the adjustment of a signal when operating in the normal mode to produce a gain adjusted output signal and to provide a measurement signal when operating in the calibration mode, and control the switch and the measure and correction unit to operate in the normal operation mode or the calibration mode, store measurement signal related data in a memory for the adjustment of the combined output signal, and control an interleave timing of the signal channels.

In example 1087, the subject matter of example 1086 optionally includes that the plurality of signal channels each further comprise a track or sample and hold circuit before the ADC that are collectively controlled by the controller to provide interleave timing and operation of the ADCs in a cascaded manner.

Example 1088 is a system comprising means to perform the method of example 1087.

Example 1089 is a device for operating a time-interleaved analog-to-digital converter (TI-ADC) with a gain correction device, that may comprise means for switching between a device input in a normal operation mode and a reference voltage input in a calibration mode, and outputting a switched signal, means for receiving, with a plurality of signal channels, each comprising an analog-to-digital converter (ADC), a slice of the switched signal and provide a digital output signal, means for producing, with a multiplexer, a combined output signal from the digital output signals of the ADCs, means for adjusting or supporting the adjustment of a signal when operating in the normal mode to produce a gain adjusted output signal and to provide a measurement signal when operating in the calibration mode, and means for controlling the switch and the measure and correction unit to operate in the normal operation mode or the calibration mode, store measurement signal related data in a memory for the adjustment of the combined output signal, and control an interleave timing of the signal channels.

In example 1090, the subject matter of example 1089 optionally includes that the plurality of signal channels each further comprise a track or sample and hold circuit before the ADC that are collectively controlled by the means for controlling to provide interleave timing and operation of the ADCs in a cascaded manner.

In example 1091, the subject matter of example 1090 optionally includes that the means for switching is provided between the channel track or sample and hold circuits and respective ADCs.

In example 1092, the subject matter of example 1091 optionally includes, that the measurement signal related data are gain values that are used for the means for adjusting in respective channels.

In example 1093, the subject matter of example 1092 optionally includes that the gain values are gain offsets.

In example 1094, the subject matter of any one or more of examples 1092-1094 optionally include that the gain values are based on multiple reference voltage values provided by the reference voltage input.

In example 1095, the subject matter of example 1094 optionally includes that the multiple reference voltage values are waveform signal values.

In example 1096, the subject matter of example 1095 optionally includes that the waveform signal values are provided from a feedback signal derived from the gain adjusted output signal.

In example 1097, the subject matter of any one or more of examples 1095-1096 optionally include that the waveform signal values are based on a complex exponential signal.

In example 1098, the subject matter of any one or more of examples 1094-1097 optionally include that the gain values are stored in a look-up table (LUT) in the memory.

In example 1099, the subject matter of any one or more of examples 1094-1098 optionally include that a gain value calculator utilizes linear interpolation for values between calibration values.

In example 1100, the subject matter of example 1099 optionally includes that the means for controlling makes an analog adjustment within the signal channels based on the measurement signal related data.

In example 1101, the subject matter of example 1100 optionally includes that the analog adjustment is made by a control of the ADCs.

In example 1102, the subject matter of example 1101 optionally includes, further comprising a means to provide temperature-related information to associate and store with the measurement signal related data.

Example 1103 is a phased array transmitter, that may comprise a plurality of transmission channels, each comprising an antenna and a transmit amplifier connected to the antenna, a transmission power splitter to split an output signal into a plurality of output channel signals that are provided to the transmit amplifiers in the transmission channels, baseband to RF transmission circuitry to convert digital transmission data into the output signal, an external non-linear data processor to determine non-linearity characteristics of a signal regarding a power transmission signal characteristic of an external phased array transceiver (EPAT) and to provide non-linearity data usable for correcting non-linearities in the EPAT to the IF transmitter stage for transmission to the EPAT.

In example 1104, the subject matter of example 1103 optionally includes a radio frequency (RF) modulation stage to provide the output signal to the transmission power splitter, and an intermediate frequency (IF) modulation stage comprising a digital-to-analog converter (DAC) to convert a digital baseband output signal into an IF output signal.

In example 1105, the subject matter of example 1104 optionally includes that the non-linearity data comprises polynomial coefficients of a curve that compensates the non-linearity of a characteristic curve of an input power versus and output power for the EPAT.

In example 1106, the subject matter of example 1105 optionally includes that the polynomial coefficients of the curve are of a fifth order or less.

In example 1107, the subject matter of any one or more of examples 1104-1106 optionally include that the non-linearity data comprises look-up table (LUT) values that correspond to compensate the non-linearity of a characteristic curve of an input power versus and output power for the EPAT.

In example 1108, the subject matter of any one or more of examples 1104-1107 optionally include that the transmitter is a transceiver, further that may comprise a phased array receiver, that may comprise a plurality of reception channels, each comprising an antenna and a receiver amplifier connected to the antenna, a reception power combiner to combine a plurality of input channel signals provided by the receive amplifiers in the reception channels into an input signal, a radio frequency (RF) demodulation stage to convert the RF signal into an intermediate frequency (IF) signal, and an intermediate frequency (IF) demodulation stage comprising an analog-to-digital converter (ADC) to convert the IF signal into a digital baseband input signal, an internal non-linear data processor to process non-linearity data contained within the digital baseband input signal, a digital pre-distortion (DPD) processor that may comprise a control input for receiving control signals based on the processed non-linearity data, and a data input comprising a baseband digital data signal for transmission, and a data output to provide an output signal that has been modified by the DPD to output a signal that will extend a collective linear output of the transmit amplifiers within the transmission channels based on the non-linearity data.

Example 1109 is a method for calibrating a phased array transceiver, that may comprise splitting a transmission signal into signals provided to a plurality of transmission channels, each comprising an antenna and a transmit amplifier connected to the antenna, transmitting an output signal via the antennas of the channels to an external phased array transceiver (EPAT), the output signal having a combined power output that is a sum of power outputs of the channels of the phased antenna array, receiving, at an input of the transceiver, non-linearity data that is inversely related to an antenna characteristic curve of the sum of the power outputs of the individual channels of the phased antenna array, translating the non-linearity data into control data of a digital pre-distortion (DPD) processor such that the DPD processor modifies the output signal to extend a collective linear output of the transmit amplifiers within the transmission channels based on the non-linearity data, and transmitting the DPD processor modified output signals via the antennas of the channels.

Example 1110 is a computer program product comprising one or more computer readable storage media comprising computer-executable instructions operable to, when executed by processing circuitry of a device, configure the device to split a transmission signal into signals provided to a plurality of transmission channels, each comprising an antenna and a transmit amplifier connected to the antenna, transmit an output signal via the antennas of the channels to an external phased array transceiver (EPAT), the output signal having a combined power output that is a sum of power outputs of the channels of the phased antenna array, receive, at an input of the transceiver, non-linearity data that is inversely related to an antenna characteristic curve of the sum of the power outputs of the individual channels of the phased antenna array, translate the non-linearity data into control data of a digital pre-distortion (DPD) processor such that the DPD processor modifies the output signal to extend a collective linear output of the transmit amplifiers within the transmission channels based on the non-linearity data, and transmit the DPD processor modified output signals via the antennas of the channels.

In example 1111, the subject matter of example 1110 optionally includes that the instructions are further operable to provide the output signal to the transmission power splitter, and convert a digital baseband output signal into an IF output signal.

Example 1112 is a means for transmitting a radio frequency signal, that may comprise means for splitting a transmission signal into signals provided to a plurality of transmission channels, each comprising an antenna and a transmit amplifier connected to the antenna, means for transmitting an output signal via the antennas of the channels to an external phased array transceiver (EPAT), the output signal having a combined power output that is a sum of power outputs of the channels of the phased antenna array, means for receiving, at an input of the transceiver, non-linearity data that is inversely related to an antenna characteristic curve of the sum of the power outputs of the individual channels of the phased antenna array, means for translating the non-linearity data into control data of a digital pre-distortion (DPD) processor such that the DPD processor modifies the output signal to extend a collective linear output of the transmit amplifiers within the transmission channels based on the non-linearity data, and means for transmitting the DPD processor modified output signals via the antennas of the channels.

In example 1113, the subject matter of example 1112 optionally includes that the non-linearity data comprises polynomial coefficients of a curve that compensates the non-linearity of a characteristic curve of an input power versus and output power for the EPAT.

In example 1114, the subject matter of example 1113 optionally includes that the polynomial coefficients of the curve are of a fifth order or less.

In example 1115, the subject matter of any one or more of examples 1112-1114 optionally include that the non-linearity data comprises look-up table (LUT) values that correspond to compensate the non-linearity of a characteristic curve of an input power versus and output power for the EPAT.

In example 1116, the subject matter of any one or more of examples 1112-1115 optionally include that the transmitter is a transceiver, further that may comprise a phased array receiver, that may comprise a plurality of reception channels, each comprising an antenna and a receiver amplifier connected to the antenna, a reception power combiner to combine a plurality of input channel signals provided by the receive amplifiers in the reception channels into an input signal, a radio frequency (RF) demodulation stage to convert the RF signal into an intermediate frequency (IF) signal, and an intermediate frequency (IF) demodulation stage comprising an analog-to-digital converter (ADC) to convert the IF signal into a digital baseband input signal, an internal non-linear data processor to process non-linearity data contained within the digital baseband input signal, a digital pre-distortion (DPD) processor that may comprise a control input for receiving control signals based on the processed non-linearity data, and a data input comprising a baseband digital data signal for transmission, and a data output to provide an output signal that has been modified by the DPD to output a signal that will extend a collective linear output of the transmit amplifiers within the transmission channels based on the non-linearity data.

In example 1117, the subject matter of any one or more of examples 1112-1116 optionally include a radio frequency (RF) modulation stage to provide the output signal to the transmission power splitter, and an intermediate frequency (IF) modulation stage comprising a digital-to-analog converter (DAC) to convert a digital baseband output signal into an IF output signal.

Example 1118 is a gain control device for a receiver, comprising a processor and a memory, the processor configured to in a dithering operation mode receive a first input signal at a first signal power level, separately apply, using a switch, a first and second AGC gain setting to the input signal and respectively measure a first and second signal quality measure (SQM) for the first and second AGC gain settings, and determine and store an optimal threshold value representing a power level used to switch between using the first AGC gain setting and the second AGC gain setting based on the first and second SQMs, in a normal operation mode determine whether to use the first or second AGC gain setting for a second input signal at the first signal power level based on the optimal threshold value.

In example 1119, the subject matter of example 1118 optionally includes that the first input signal is at least one of a radio frequency input signal, an intermediate frequency input signal, or a baseband signal.

In example 1120, the subject matter of any one or more of examples 1118-1119 optionally include that the switch is to operate on a plurality of input signals for a given input frame.

In example 1121, the subject matter of any one or more of examples 1118-1120 optionally include that the SQM is an error vector magnitude (EVM).

In example 1122, the subject matter of any one or more of examples 1118-1121 optionally include that the optimal threshold value is stored in a look-up table (LUT).

In example 1123, the subject matter of any one or more of examples 1118-1122 optionally include that the processor is further configured to in the dithering operation mode, determine and store a further condition value associated with the optimum threshold value, and in the normal operation mode, determine whether to use the first or second AGC gain setting additionally based on the further condition value.

In example 1124, the subject matter of example 1123 optionally includes that the further condition value is at least one of a temperature, a channel, an operating frequency, or a voltage.

In example 1125, the subject matter of any one or more of examples 1118-1124 optionally include a power level detector located in a modem of the receiver that is utilized to determine the power level of the input signal.

In example 1126, the subject matter of any one or more of examples 1118-1125 optionally include that the processor is further configured to place the device in the dithering operation mode based on a pre-defined condition.

In example 1127 the subject matter of example 1126 optionally includes that the pre-defined condition is the expiration of a timer.

In example 1128, the subject matter of example 1127 optionally includes that the determination of the optimal threshold value utilizes a difference between the first and second SQM for the determined value.

In example 1129, the subject matter of example 1128 optionally includes that the determination of the optimal threshold value further utilizes stored power vs. SQM curve shapes for the determined value.

In example 1130, the subject matter of any one or more of examples 1 118-1 129 optionally include that the receiver is a phased array receiver.

Example 1 131 is a method for operating a gain control device for a receiver, that may comprise in a dithering operation mode receiving a first input signal at a first signal power level, separately applying, using a switch, a first and second AGC gain setting to the input signal and respectively measuring a first and second signal quality measure (SQM) for the first and second AGC gain settings, and determining and storing an optimal threshold value representing a power level used to switch between using the first AGC gain setting and the second AGC gain setting based on the first and second SQMs, in a normal operation mode determining whether to use the first or second AGC gain setting for a second input signal at the first signal power level based on the optimal threshold value.

In example 1132, the subject matter of example 1131 optionally includes that the first input signal is at least one of a radio frequency input signal, an intermediate frequency input signal, or a baseband signal.

In example 1133, the subject matter of any one or more of examples 1131-1132 optionally include that the switch operates on a plurality of input signals for a given input frame.

In example 1134, the subject matter of any one or more of examples 1131-1133 optionally include that the SQM is an error vector magnitude (EVM).

In example 1135, the subject matter of any one or more of examples 1131-1134 optionally include that the optimal threshold value is stored in a look-up table (LUT).

In example 1136, the subject matter of any one or more of examples 1131-1135 optionally include in the dithering operation mode, determining and storing a further condition value associated with the optimum threshold value, and in the normal operation mode, determining whether to use the first or second AGC gain setting additionally based on the further condition value.

In example 1137, the subject matter of example 1136 optionally includes that the further condition value is at least one of a temperature, a channel, an operating frequency, or a voltage.

In example 1138, the subject matter of any one or more of examples 1131-1137 optionally include determining, with a power level detector located in a modem of the receiver, the power level of the input signal.

In example 1139, the subject matter of any one or more of examples 1131-1138 optionally include placing the device in the dithering operation mode based on a pre-defined condition.

In example 1140, the subject matter of example 1139 optionally includes that the pre-defined condition is the expiration of a timer.

In example 1141, the subject matter of example 1140 optionally includes that the determining of the optimal threshold value utilizes a difference between the first and second SQM for the determined value.

In example 1142, the subject matter of example 1141 optionally includes that the determining of the optimal threshold value further utilizes stored power vs. SQM curve shapes for the determined value.

In example 1143, the subject matter of any one or more of examples 1131-1142 optionally include that the receiver is a phased array receiver.

Example 1144 is a computer program product comprising one or more computer readable storage media comprising computer-executable instructions operable to, when executed by processing circuitry of a device, configure the device to in a dithering operation mode receive a first input signal at a first signal power level, separately apply, using a switch, a first and second AGC gain setting to the input signal and respectively measuring a first and second signal quality measure (SQM) for the first and second AGC gain settings, and determine and store an optimal threshold value representing a power level used to switch between using the first AGC gain setting and the second AGC gain setting based on the first and second SQMs, in a normal operation mode determine whether to use the first or second AGC gain setting for a second input signal at the first signal power level based on the optimal threshold value.

In example 1145, the subject matter of example 1144 optionally includes that the first input signal is at least one of a radio frequency input signal, an intermediate frequency input signal, or a baseband signal.

Example 1146 is a computer program product comprising one or more computer readable storage media comprising computer-executable instructions operable to, when executed by processing circuitry of a device, configure the device to perform any of the methods of the above method Examples.

Example 1147 is a system comprising means to perform any of the methods of examples 1131-1143.

Example 1148 is a gain control device for a receiver, that may comprise means for, in a dithering operation mode receiving a first input signal at a first signal power level, separately applying, using a switch, a first and second AGC gain setting to the input signal and respectively measuring a first and second signal quality measure (SQM) for the first and second AGC gain settings, and determining and storing an optimal threshold value representing a power level used to switch between using the first AGC gain setting and the second AGC gain setting based on the first and second SQMs, and means for, in a normal operation mode determining whether to use the first or second AGC gain setting for a second input signal at the first signal power level based on the optimal threshold value.

In example 1149, the subject matter of example 1148 optionally includes that the first input signal is at least one of a radio frequency input signal, an intermediate frequency input signal, or a baseband signal.

In example 1150, the subject matter of any one or more of examples 1148-1149 optionally include that the switch operates on a plurality of input signals for a given input frame.

In example 1151, the subject matter of any one or more of examples 1148-1150 optionally include that the SQM is an error vector magnitude (EVM).

In example 1152, the subject matter of any one or more of examples 1148-1151 optionally include that the optimal threshold value is stored in a look-up table (LUT).

In example 1153, the subject matter of any one or more of examples 1148-1152 optionally include means for, in the dithering operation mode, determining and storing a further condition value associated with the optimum threshold value, and means for, in the normal operation mode, determining whether to use the first or second AGC gain setting additionally based on the further condition value.

In example 1154, the subject matter of example 1153 optionally includes that the further condition value is at least one of a temperature, a channel, an operating frequency, or a voltage.

In example 1155, the subject matter of any one or more of examples 1148-1154 optionally include means for determining, with a power level detector located in a modem of the receiver, the power level of the input signal.

In example 1156, the subject matter of any one or more of examples 1148-1155 optionally include means for placing the device in the dithering operation mode based on a pre-defined condition.

In example 1157, the subject matter of example 1156 optionally includes that the pre-defined condition is the expiration of a timer.

In example 1158, the subject matter of example 1157 optionally includes that the means for determining of the optimal threshold value utilizes a difference between the first and second SQM for the determined value.

In example 1159, the subject matter of example 1158 optionally includes that the means for determining of the optimal threshold value further utilizes stored power vs. SQM curve shapes for the determined value.

In example 1160, the subject matter of any one or more of examples 1148-1159 optionally include that the receiver is a phased array receiver.

Example 1161 is a phased array radio transceiver, that may comprise a plurality of tiled and interconnected transceiver cells, each that may comprise a transmitter, a receiver, a digital processing block, an input-output and phase-combining unit, and a multiplexer and demultiplexer on each of four cell edges to communication with adjacent similar cells, a bus that interconnects the cells and that carries an oscillator signal and control signals between the cells.

In example 1162, the subject matter of example 1161 optionally includes that at least one of the transmitter comprises multiple transmitters or the receiver comprises multiple receivers is true.

In example 1163, the subject matter of any one or more of examples 1161-1162 optionally include that the bus is an analog and digital bus.

In example 1164, the subject matter of any one or more of examples 1161-1163 optionally include that a width of the bus is equal to a number of simultaneously supportable users.

In example 1165, the subject matter of any one or more of examples 1161-1164 optionally include that each cell is only directly connectable to an adjacent cell element on each side of its cell edges.

In example 1166, the subject matter of any one or more of examples 1161-1165 optionally include an antenna array that is combined with a wafer comprising the plurality of tiled transceiver cells.

In example 1167, the subject matter of any one or more of examples 1161-1166 optionally include that each cell further comprises a self-configurable element that allow the cell to generate a unique, within the interconnected transceiver cells, identifier for itself.

In example 1168, the subject matter of example 1167 optionally includes that a first cell self-identifies itself with a first identifier when a predefined criteria is met.

In example 1169, the subject matter of example 1168 optionally includes that the predefined criteria is that the cell is a corner cell.

In example 1170, the subject matter of example 1169 optionally includes that non-first cells identify themselves by receiving identifier-related information from an adjacent cell, and then send further identifier related information to another adjacent cell.

In example 1171, the subject matter of any one or more of examples 1161-1170 optionally include that each cell further comprises a loopback to measure and calibrate out delay introduced by the cell.

In example 1172, the subject matter of any one or more of examples 1161-1171 optionally include that each cell is operable in a digital phase array mode and further comprises a combining element to vector sum a digitized received signal with a received signal from a cell having an immediate predecessor cell, when present.

In example 1 173, the subject matter of example 1172 optionally includes that the vector sum between each cell is pipelined.

In example 1174, the subject matter of any one or more of examples 1172-1173 optionally include that each cell contains k busses to support k users.

In example 1175, the subject matter of any one or more of examples 1161-1174 optionally include that each cell is operable in a local oscillator (LO) phase combine mode, each cell receives its phase shift from a central control point, mixer outputs are summed in an analog domain, and only one analog-to-digital converter (ADC) converts the summed mixer outputs into a digital signal.

In example 1176, the subject matter of any one or more of examples 1161-1175 optionally include that each cell is operable in a hybrid operation mode in which each row is tiled in a local oscillator phase shifting and shares a single analog-to-digital converter.

In example 1177, the subject matter of any one or more of examples 1161-1176 optionally include that each cell is operable in an analog phased array combine operation mode in which a first complex function is applied to a received input signal by the cell and a result is combined with a further result of a second complex function applied to a received input from another cell.

Example 1178 is a method for operating a phased array radio transceiver, that may comprise transmitting and receiving a signal with a plurality of tiled and interconnected transceiver cells, each that may comprise a transmitter, a receiver, a digital processing block, an input-output and phase-combining unit, and a multiplexer and demultiplexer on each of four cell edges to communication with adjacent similar cells, and communicating between the cells using a bus that interconnects the cells and that carries an oscillator signal and control signals between the cells.

In example 1179, the subject matter of example 1178 optionally includes that at least one of the transmitter comprises multiple transmitters or the receiver comprises multiple receivers is true.

In example 1180, the subject matter of any one or more of examples 1178-1179 optionally include that the bus is an analog and digital bus.

In example 1181, the subject matter of any one or more of examples 1178-1180 optionally include that a width of the bus is equal to a number of simultaneously supportable users.

In example 1182, the subject matter of any one or more of examples 1178-1181 optionally include that each cell is only directly connectable to an adjacent cell element on each side of its cell edges.

In example 1183, the subject matter of any one or more of examples 1178-1182 optionally include an antenna array that is combined with a wafer comprising the plurality of tiled transceiver cells.

In example 1184, the subject matter of any one or more of examples 1178-1183 optionally include generating, for each cell, a unique, within the interconnected transceiver cells, identifier for itself.

In example 1185, the subject matter of example 1184 optionally includes that a first cell self-identifies itself with a first identifier when a predefined criteria is met.

In example 1186, the subject matter of example 1185 optionally includes that the predefined criteria is that the cell is a corner cell.

In example 1187, the subject matter of example 1186 optionally includes identifying, by non-first cells, themselves by receiving identifier-related information from an adjacent cell, and then sending further identifier related information to another adjacent cell.

In example 1188, the subject matter of any one or more of examples 1178-1187 optionally include that each cell further comprises a loopback to measure and calibrate out delay introduced by the cell.

In example 1189, the subject matter of any one or more of examples 1178-1188 optionally include vector summing, in a digital phase array mode, a digitized received signal from a cell having an immediate predecessor cell, when present.

In example 1190, the subject matter of example 1189 optionally includes that the vector sum between each cell is pipelined.

In example 1191, the subject matter of any one or more of examples 1189-1190 optionally include that each cell contains k busses to support k users.

In example 1192, the subject matter of any one or more of examples 1178-1191 optionally include that each cell is operable in a local oscillator (LO) phase combine mode, each cell receives its phase shift from a central control point, mixer outputs are summed in an analog domain, and only one analog-to-digital converter (ADC) converts the summed mixer outputs into a digital signal.

In example 1193, the subject matter of any one or more of examples 1178-1192 optionally include that each cell is operable in a hybrid operation mode in which each row is tiled in a local oscillator phase shifting and shares a single analog-to-digital converter.

In example 1194, the subject matter of any one or more of examples 1178-1193 optionally include that each cell is operable in an analog phased array combine operation mode in which a first complex function is applied to a received input signal by the cell and a result is combined with a further result of a second complex function applied to a received input from another cell.

Example 1195 is a computer program product comprising one or more computer readable storage media comprising computer-executable instructions operable to, when executed by processing circuitry of a device, configure the device to transmit and receive a signal with a plurality of tiled and interconnected transceiver cells, each that may comprise a transmitter, a receiver, a digital processing block, an input-output and phase-combining unit, and a multiplexer and demultiplexer on each of four cell edges to communication with adjacent similar cells, and communicate between the cells using a bus that interconnects the cells and that carries an oscillator signal and control signals between the cells.

In example 1196, the subject matter of example 1195 optionally includes that each cell is only directly connectable to an adjacent cell element on each side of its cell edges.

Example 1197 is a computer program product comprising one or more computer readable storage media comprising computer-executable instructions operable to, when executed by processing circuitry of a device, configure the device to perform any of the methods of examples 1178-1194.

Example 1198 is a system comprising means to perform any of the methods of examples 1178-1194.

Example 1199 is a phased array radio transceiver, that may comprise means for transmitting and receiving a signal with a plurality of tiled and interconnected transceiver cells, each that may comprise a transmitter, a receiver, a digital processing block, an input-output and phase-combining unit, and a multiplexer and demultiplexer on each of four cell edges to communication with adjacent similar cells, and means for communicating between the cells using a bus that interconnects the cells and that carries an oscillator signal and control signals between the cells.

In example 1200, the subject matter of example 1199 optionally includes, that at least one of the transmitter comprises multiple transmitters or the receiver comprises multiple receivers is true.

In example 1201, the subject matter of examples 1199-1200 optionally includes, that the bus is an analog and digital bus.

In example 1202, the subject matter of examples 1199-1201 optionally includes, that a width of the bus is equal to a number of simultaneously supportable users.

In example 1203, the subject matter of examples 1199-1202 optionally includes, that each cell is only directly connectable to an adjacent cell element on each side of its cell edges.

In example 1204, the subject matter of examples 1199-1203 optionally includes, further comprising an antenna array that is combined with a wafer comprising the plurality of tiled transceiver cells.

In example 1205, the subject matter of examples 1199-1204 optionally includes, generating, for each cell, a unique, within the interconnected transceiver cells, identifier for itself.

In example 1206, the subject matter of example 1205 optionally includes that a first cell self-identifies itself with a first identifier when a predefined criteria is met.

In example 1207, the subject matter of example 1206 optionally includes that the predefined criteria is that the cell is a corner cell.

In example 1208, the subject matter of example 1207 optionally includes identifying, by non-first cells, themselves by receiving identifier-related information from an adjacent cell, and then sending further identifier related information to another adjacent cell.

In example 1209, the subject matter of example 1208 optionally includes, that each cell further comprises a loop-back to measure and calibrate out delay introduced by the cell.

In example 1210, the subject matter of example 1209 optionally includes, vector summing, in a digital phase array mode, a digitized received signal from a cell having an immediate predecessor cell, when present.

In example 1211, the subject matter of example 1210 optionally includes that the vector sum between each cell is pipelined.

In example 1212, the subject matter of any one or more of examples 1210-1211 optionally include that each cell contains k busses to support k users.

In example 1213, the subject matter of example 1212 optionally includes, that each cell is operable in a local oscillator (LO) phase combine mode, each cell receives its phase shift from a central control point, mixer outputs are summed in an analog domain, and only one analog-to-digital converter (ADC) converts the summed mixer outputs into a digital signal.

In example 1214, the subject matter of example 1213 optionally includes, that each cell is operable in a hybrid operation mode in which each row is tiled in a local oscillator phase shifting and shares a single analog-to-digital converter.

In example 1215, the subject matter of example 1214 optionally includes, that each cell is operable in an analog phased array combine operation mode in which a first complex function is applied to a received input signal by the cell and a result is combined with a further result of a second complex function applied to a received input from another cell.

Example 1216 is an injection-locked modulation circuit for a phased array transceiver, that may comprise a tank circuit comprising an inductor connected to a capacitive digital-to-analog converter (CAP-DAC), a tank circuit frequency being modifiable by a data input signal, an injection circuit that provides a locking injection frequency to lock an output frequency of the tank circuit at an integer subharmonic N of an output carrier frequency, that data values of the data input signal modify a phase of the locked tank circuit output frequency by an amount of ±180°/N, and a frequency multiplier that produces a carrier frequency by multiplying the locked tank circuit output frequency by N.

In example 1217, the subject matter of example 1216 optionally includes that the injection circuit is a phase-locked loop (PLL).

In example 1218, the subject matter of any one or more of examples 1216-1217 optionally include that the locking injection frequency is a second integer subharmonic M of the tank circuit frequency.

In example 1219, the subject matter of example 1218 optionally includes that M=3.

In example 1220, the subject matter of any one or more of examples 1216-1219 optionally include that N=3.

In example 1221, the subject matter of any one or more of examples 1216-1220 optionally include that N=2, and the circuit further comprises a Gilbert quad/polarity switch connected between the frequency multiplier and an antenna.

In example 1222, the subject matter of any one or more of examples 1216-1221 optionally include a digital power amplifier connected to the frequency multiplier, and an antenna connected to the power amplifier to transmit a wireless signal.

Example 1223 is a method for operating an injection-locked modulation circuit for a phased array transceiver, that may comprise modifying a tank circuit frequency of a tank circuit comprising an inductor connected to a capacitive digital-to-analog converter (CAP-DAC) by a data input signal, providing a locking injection frequency by an injection circuit to lock an output frequency of the tank circuit at an integer subharmonic N of an output carrier frequency, that data values of the data input signal modify a phase of the locked tank circuit output frequency by an amount of ±180°/N, and producing, with a frequency multiplier, a carrier frequency by multiplying the locked tank circuit output frequency by N.

In example 1224, the subject matter of example 1223 optionally includes that the injection circuit is a phase-locked loop (PLL).

In example 1225, the subject matter of any one or more of examples 1223-1224 optionally include that the locking injection frequency is a second integer subharmonic M of the tank circuit frequency.

In example 1226, the subject matter of example 1225 optionally includes that M=3.

In example 1227, the subject matter of any one or more of examples 1223-1226 optionally include that N=3.

In example 1228, the subject matter of any one or more of examples 1223-1227 optionally include that N=2 and the method further comprises operating a Gilbert quad/polarity switch connected between the frequency multiplier and an antenna.

In example 1229, the subject matter of any one or more of examples 1223-1228 optionally include transmitting a wireless signal with an antenna connected to a power amplifier.

Example 1230 is a computer program product comprising one or more computer readable storage media comprising computer-executable instructions operable to, when executed by processing circuitry of a device, configure the device to modify a tank circuit frequency of a tank circuit comprising an inductor connected to a capacitive digital-to-analog converter (CAP-DAC) by a data input signal, provide a locking injection frequency by an injection circuit to lock an output frequency of the tank circuit at an integer subharmonic N of an output carrier frequency, that data values of the data input signal modify a phase of the locked tank circuit output frequency by an amount of ±180°/N, and produce, with a frequency multiplier, a carrier frequency by multiplying the locked tank circuit output frequency by N.

In example 1231, the subject matter of example 1230 optionally includes that the injection circuit is a phase-locked loop (PLL).

Example 1232 is a computer program product comprising one or more computer readable storage media comprising computer-executable instructions operable to, when executed by processing circuitry of a device, configure the device to perform any of the methods of examples 1223-1229.

Example 1233 is a system comprising means to perform any of the methods of examples 1223-1229.

Example 1234 is an injection-locked modulation circuit for a phased array transceiver, that may comprise means for modifying a tank circuit frequency of a tank circuit comprising an inductor connected to a capacitive digital-to-analog converter (CAP-DAC) by a data input signal, means for providing a locking injection frequency by an injection circuit to lock an output frequency of the tank circuit at an integer subharmonic N of an output carrier frequency, that data values of the data input signal modify a phase of the locked tank circuit output frequency by an amount of ±180°/N, and means for producing, with a frequency multiplier, a carrier frequency by multiplying the locked tank circuit output frequency by N.

In example 1235, the subject matter of example 1234 optionally includes that the injection circuit is a phase-locked loop (PLL).

In example 1236, the subject matter of any one or more of examples 1234-1235 optionally include that the locking injection frequency is a second integer subharmonic M of the tank circuit frequency.

In example 1237, the subject matter of example 1236 optionally includes that M=3.

In example 1238, the subject matter of any one or more of examples 1234-1237 optionally include that N=3.

In example 1239, the subject matter of any one or more of examples 1234-1238 optionally include that N=2 and the method further comprises means for operating a Gilbert quad/polarity switch connected between the frequency multiplier and an antenna.

In example 1240, the subject matter of any one or more of examples 1234-1239 optionally include means for transmitting a wireless signal with an antenna connected to a power amplifier.

Example 1241 is an apparatus for performing clock and data recover (CDR) for a wireless quadrature amplitude modulation (QAM) signal in a wireless receiver, that may comprise in-phase (I) and quadrature (Q) channels to process QAM signals received by the receiver, a mode table in a memory of the apparatus that stores a plurality of mode values with adjustment indications, a mode unit comprising a processor to receive data from the I and Q channels, read a current mode from the mode table, and dependent on the current mode, adjust a current sampling phase of the signal consistent with the adjustment indication for the current mode.

In example 1242, the subject matter of example 1241 optionally includes that the QAM supports at least four values.

In example 1243, the subject matter of example 1242 optionally includes 16-QAM.

In example 1244, the subject matter of any one or more of examples 1241-1243 optionally include that the current mode is dynamically adjusted during operation.

In example 1245, the subject matter of any one or more of examples 1241-1244 optionally include that the mode table has modes that consider only the I channel or only the Q channel.

In example 1246, the subject matter of example 1245 optionally includes that the processor is further configured to detect a communication problem in either the I channel or the Q channel and utilize a mode for a channel that the communication problem is not detected in.

In example 1247, the subject matter of any one or more of examples 1241-1246 optionally include that the mode table has modes that consider both the I channel and the Q channel.

In example 1248, the subject matter of any one or more of examples 1241-1247 optionally include that the mode table comprises at least eight modes defined as follows:

| Mode | Early Out | Late Out | Sample Phase Decision |
|---|---|---|---|
| 0 | 0 | 0 | No Decision |
| 1 | 1 | 0 | Early |
| 2 | 0 | 1 | Late |
| 3 | 1 | 1 | No Decision |
| 4 | Early I | Late I | Bypass I |
| 5 | Early Q | Late Q | Bypass Q |
| 6 | Early I or Early Q | Late I or Late Q | I or Q |
| 7 | Early I and Early Q | Late I and Late Q | I and Q |

In example 1249, the subject matter of example 1248 optionally includes that the timing estimator determination is a function of a sign of a received data symbol and an error value.

In example 1250, the subject matter of example 1249 optionally includes that the timing estimator determination is based on the following formula ZK=SIGN(DK) SIGN (DK-1) (EK-EK-1), ZK>0 EARLY, ZK=0 HOLD, ZK<0 LATE.

In example 1251, the subject matter of example 1250 optionally includes an estimator table used by the timing estimator comprising at least four data values, each having an associated sign and error value above and below the data value.

In example 1252, the subject matter of example 1251 optionally includes that the error values above the highest data value and below the lowest data value are plus one, and all other error values are minus one.

In example 1253, the subject matter of example 1252 optionally includes 16-QAM.

In example 1254, the subject matter of example 1253 optionally includes that the estimator table comprises

| $D_K$ | Sign ($D_K$) | $E_K$ |
|---|---|---|
| +3 | +1 | +1 |
| | +1 | −1 |
| +1 | +1 | −1 |
| | −1 | −1 |
| −1 | −1 | −1 |
| | −1 | −1 |
| −3 | −1 | −1 |
| | −1 | +1 |

that ZK is a timing estimator value, DK is a current data value, DK-1 is a previous data value, EK is a current error value, and EK-1 is a previous error value.

In example 1255, the subject matter of any one or more of examples 1240-1254 optionally include a timing estimator that determines whether to adjust the sampling phase to an earlier point, hold it at its current point, or adjust it to a later point.

Example 1256 is a method apparatus for performing clock and data recover (CDR) for a wireless quadrature amplitude modulation (QAM) signal in a wireless receiver, that may comprise processing in-phase (I) and quadrature (Q) channels of QAM signals received by the receiver, storing a plurality of mode values in a mode table memory of the apparatus with adjustment indications, receiving data from the I and Q channels, reading a current mode from the mode table, and dependent on the current mode, adjusting a current sampling phase of the signal consistent with the adjustment indication for the current mode.

In example 1257, the subject matter of example 1256 optionally includes that the QAM supports at least four values.

In example 1258, the subject matter of example 1257 optionally includes 16-QAM.

In example 1259, the subject matter of any one or more of examples 1256-1258 optionally include dynamically adjusting the current mode during operation.

In example 1260, the subject matter of any one or more of examples 1256-1259 optionally include that the mode table has modes that consider only the I channel or only the Q channel.

In example 1261, the subject matter of example 1260 optionally includes detecting a communication problem in either the I channel or the Q channel and utilizing a mode for a channel that the communication problem is not detected in.

In example 1262, the subject matter of any one or more of examples 1256-1261 optionally include that the mode table has modes that consider both the I channel and the Q channel.

In example 1263, the subject matter of any one or more of examples 1256-1262 optionally include that the mode table comprises at least eight modes defined as follows:

| Mode | Early Out | Late Out | Sample Phase Decision |
|---|---|---|---|
| 0 | 0 | 0 | No Decision |
| 1 | 1 | 0 | Early |
| 2 | 0 | 1 | Late |
| 3 | 1 | 1 | No Decision |
| 4 | Early I | Late I | Bypass I |
| 5 | Early Q | Late Q | Bypass Q |
| 6 | Early I or Early Q | Late I or Late Q | I or Q |
| 7 | Early I and Early Q | Late I and Late Q | I and Q |

In example 1264, the subject matter of example 1263 optionally includes that the timing estimator determination is a function of a sign of a received data symbol and an error value.

In example 1265, the subject matter of example 1264 optionally includes that the timing estimator determination is based on the following formula ZK=SIGN(DK) SIGN (DK-1) (EK-EK-1), ZK>0 EARLY, ZK=0 HOLD, ZK<0 LATE.

In example 1266, the subject matter of example 1265 optionally includes an estimator table used by the timing estimator comprising at least four data values, each having an associated sign and error value above and below the data value.

In example 1267, the subject matter of example 1266 optionally includes that the error values above the highest data value and below the lowest data value are plus one, and all other error values are minus one.

In example 1268, the subject matter of example 1267 optionally includes 16-QAM.

In example 1269, the subject matter of example 1268 optionally includes that the estimator table comprises

| $D_K$ | Sign ($D_K$) | $E_K$ |
|---|---|---|
| +3 | +1 | +1 |
| | +1 | −1 |
| +1 | +1 | −1 |
| | −1 | −1 |
| −1 | −1 | −1 |
| | −1 | −1 |
| −3 | −1 | −1 |
| | −1 | +1 |

that ZK is a timing estimator value, DK is a current data value, DK-1 is a previous data value, EK is a current error value, and EK-1 is a previous error value.

In example 1270, the subject matter of any one or more of examples 1256-1269 optionally include determining, with a timing estimator, whether to adjust the sampling phase to an earlier point, hold it at its current point, or adjust it to a later point.

Example 1271 is a computer program product comprising one or more computer readable storage media comprising computer-executable instructions operable to, when executed by processing circuitry of a device, configure the device to process in-phase (I) and quadrature (Q) channels of QAM signals received by the receiver, store a plurality of mode values in a mode table memory of the apparatus with adjustment indications, receive data from the I and Q channels, read a current mode from the mode table, and dependent on the current mode, adjust a current sampling phase of the signal consistent with the adjustment indication for the current mode.

In example 1272, the subject matter of example 1271 optionally includes that the QAM supports at least four values.

Example 1273 is a computer program product comprising one or more computer readable storage media comprising computer-executable instructions operable to, when executed by processing circuitry of a device, configure the device to perform any of the methods of the above method examples.

Example 1274 is an apparatus for performing clock and data recover (CDR) for a wireless quadrature amplitude modulation (QAM) signal in a wireless receiver, that may comprise processing in-phase (I) and quadrature (Q) channels of QAM signals received by the receiver, storing a plurality of mode values in a mode table memory of the apparatus with adjustment indications, receiving data from the I and Q channels, reading a current mode from the mode table, and dependent on the current mode, adjusting a current sampling phase of the signal consistent with the adjustment indication for the current mode.

In example 1275, the subject matter of example 1274 optionally includes that the QAM supports at least four values.

In example 1276, the subject matter of example 1275 optionally includes 16-QAM.

In example 1277, the subject matter of any one or more of examples 1274-1276 optionally include dynamically adjusting the current mode during operation.

In example 1278, the subject matter of any one or more of examples 1274-1277 optionally include that the mode table has modes that consider only the I channel or only the Q channel.

In example 1279, the subject matter of example 1278 optionally includes detecting a communication problem in either the I channel or the Q channel and utilizing a mode for a channel that the communication problem is not detected in.

In example 1280, the subject matter of any one or more of examples 1274-1279 optionally include that the mode table has modes that consider both the I channel and the Q channel.

In example 1281, the subject matter of any one or more of examples 1274-1280 optionally include that the mode table comprises at least eight modes defined as follows:

| Mode | Early Out | Late Out | Sample Phase Decision |
|---|---|---|---|
| 0 | 0 | 0 | No Decision |
| 1 | 1 | 0 | Early |
| 2 | 0 | 1 | Late |
| 3 | 1 | 1 | No Decision |
| 4 | Early I | Late I | Bypass I |
| 5 | Early Q | Late Q | Bypass Q |
| 6 | Early I or Early Q | Late I or Late Q | I or Q |
| 7 | Early I and Early Q | Late I and Late Q | I and Q |

In example 1282, the subject matter of example 1281 optionally includes that the timing estimator determination is a function of a sign of a received data symbol and an error value.

In example 1283, the subject matter of example 1282 optionally includes that the timing estimator determination is based on the following formula ZK=SIGN(DK) SIGN (DK-1) (EK-EK-1), ZK>0 EARLY, ZK=0 HOLD, ZK<0 LATE.

In example 1284, the subject matter of example 1283 optionally includes an estimator table used by the timing estimator comprising at least four data values, each having an associated sign and error value above and below the data value.

In example 1285, the subject matter of example 1284 optionally includes that the error values above the highest data value and below the lowest data value are plus one, and all other error values are minus one.

In example 1286, the subject matter of example 1285 optionally includes-QAM.

In example 1287, the subject matter of example 1286 optionally includes that the estimator table comprises

| $D_K$ | Sign ($D_K$) | $E_K$ |
|---|---|---|
| +3 | +1 | +1 |
| | +1 | −1 |
| +1 | +1 | −1 |
| | −1 | −1 |
| −1 | −1 | −1 |
| | −1 | −1 |
| −3 | −1 | −1 |
| | −1 | +1 |

that ZK is a timing estimator value, DK is a current data value, DK-1 is a previous data value, EK is a current error value, and EK-1 is a previous error value.

In example 1288, the subject matter of any one or more of examples 1274-1287 optionally include determining, with a timing estimator, whether to adjust the sampling phase to an earlier point, hold it at its current point, or adjust it to a later point.

Example 1289 is an automatic gain control (AGC) circuit for a radio-frequency (RF) receiver, comprising a processor and a memory, the processor to receive a plurality of quantized signals from a quadrature modulated signal, assign the quantized signals into regions of a constellation map made up of in-phase (I)/quadrature (Q) quantization bins according to their quantized power level, determine a maximum likelihood estimator (MLE) based on the assigned quantized signals, estimate a power based on the MLE, and adjust a variable gain amplifier for further received signals based on the estimated power.

In example 1290, the subject matter of example 1289 optionally includes that the MLE is computed with the equation $$\hat{P} = \operatorname*{argmax}_P \frac{1}{N} \sum_{i=1}^{2^{b-2}(2^{b-1}+1)} n_{r_i} \log(P(r_i|P))$$

where $n_{ri}$ is the number of samples out of N quantized in region $r_i$, $b=\log_2(2n)$ bits in each of the I/Q components of a received signal, and P is the average received signal power which is computed as $$P = E\{|h|^2\} \frac{1}{M} \sum_{m=1}^{M} |x_m|^2$$

In example 1291, the subject matter of example 1290 optionally includes that the power is estimated by solving the equation $$\sum_{i=1}^{2^{b-2}(2^{b-1}+1)} \frac{n_{r_i}}{N}\log(P(r_i|P)) \leq \sum_{i=1}^{2^{b-2}(2^{b-1}+1)} \frac{n_{r_i}}{N}\log\left(\frac{n_{r_i}}{N}\right)$$

In example 1292, the subject matter of any one or more of examples 1289-1291 optionally include that the quantized signals are signals from a low-resolution analog-to-digital converter (ADC).

In example 1293, the subject matter of example 1292 optionally includes that the low-resolution ADC produces three or fewer bits.

In example 1294, the subject matter of any one or more of examples 1289-1293 optionally include that the processor is further to utilize all samples from all ADCs together to allow a latency reduction.

In example 1295, the subject matter of any one or more of examples 1289-1294 optionally include that the processor is further to select regions having a monotonically increasing or decreasing conditional distributions P ($r_i$ I P), chose a set of regions from the selected regions such that $$r_i = \arg\max_{r_i}\left|\frac{dP(r_i|P)}{dP}\right|,$$

over P or interest, and solve an optimization problem $$\min_{P}\sum_{i\in step\,2}\left|P(r_i|P)-\frac{n_{r_i}}{N}\right|$$

In example 1296, the subject matter of any one or more of examples 1289-1295 optionally include that the processor is further to construct a look-up table (LUT) for estimated power to use for subsequent power estimates.

In example 1297, the subject matter of any one or more of examples 1289-1296 optionally include that the processor is further to utilize a dithering algorithm to determine a best power estimate solution for a specified signal-to-noise ratio (SNR) value.

Example 1298 is a radio receiver device that receives quadrature modulated radio frequency (RF) signals, that may comprise a plurality of channels, each channel that may comprise an antenna that receives the quadrature modulated RF signals, a mixer that converts the quadrature modulated RF signals into an intermediate frequency (IF) signal, a variable gain amplifier (VGA) that receives the IF signal, a sample and hold circuit that samples an output of the VGA and provides a sampled output signal, and an analog-to-digital converter (ADC) that receives the sampled output signal and quantizes it into a digital signal, a processor and a memory, the processor to receive a plurality of quantized signals from a quadrature modulated signal, assign the quantized signals into regions of a constellation map made up of in-phase (I)/quadrature (Q) quantization bins according to their quantized power level, determine a maximum likelihood estimator (MLE) based on the assigned quantized signals, estimate a power based on the MLE, and adjust a variable gain amplifier for further received signals based on the estimated power.

In example 1299, the subject matter of example 1298 optionally includes that the ADCs are low-resolution ADCs producing three or fewer bits.

Example 1300 is a method for automatic gain control (AGC) of a radio-frequency (RF) receiver, that may comprise receiving a plurality of quantized signals from a quadrature modulated signal, assigning the quantized signals into regions of a constellation map made up of in-phase (I)/quadrature (Q) quantization bins according to their quantized power level, determining a maximum likelihood estimator (MLE) based on the assigned quantized signals, estimating a power based on the MLE, and adjusting a variable gain amplifier for further received signals based on the estimated power.

In example 1301, the subject matter of example 1300 optionally includes that the MLE is computed with the equation $$\hat{P} = \underset{P}{\operatorname{argmax}}\frac{1}{N}\sum_{i=1}^{2^{b-2}(2^{b-1}+1)} n_{r_i}\log(P(r_i|P))$$

where $n_{ri}$ is the number of samples out of N quantized in region $r_i$, $b=\log_2(2n)$ bits in each of the I/Q components of a received signal, and P is the average received signal power which is computed as $$P = E\{|h|^2\}\frac{1}{M}\sum_{m=1}^{M}|x_m|^2$$

In example 1302, the subject matter of example 1301 optionally includes that the power is estimated by solving the equation $$\sum_{i=1}^{2^{b-2}(2^{b-1}+1)} \frac{n_{r_i}}{N}\log(P(r_i|P)) \leq \sum_{i=1}^{2^{b-2}(2^{b-1}+1)} \frac{n_{r_i}}{N}\log\left(\frac{n_{r_i}}{N}\right)$$

In example 1303, the subject matter of any one or more of examples 1330-1302 optionally include that the quantized signals are signals from a low-resolution analog-to-digital converter (ADC).

In example 1304, the subject matter of example 1303 optionally includes that the low-resolution ADC produces three or fewer bits.

In example 1305, the subject matter of any one or more of examples 1300-1304 optionally include utilizing all samples from all ADCs together to allow a latency reduction.

In example 1306, the subject matter of any one or more of examples 1300-1305 optionally include selecting regions having a monotonically increasing or decreasing conditional distributions $P(r_i|P)$, choosing a set of regions from the selected regions such that $$r_i = \arg\max_{r_i}\left|\frac{dP(r_i|P)}{dP}\right|,$$

over p of interest, and solving an optimization problem $$\min_{P}\sum_{i\in step\,2}\left|P(r_i|P)-\frac{n_{r_i}}{N}\right|$$

In example 1307, the subject matter of any one or more of examples 1300-1306 optionally include constructing a look-up table (LUT) for estimated power to use for subsequent power estimates.

In example 1308, the subject matter of any one or more of examples 1300-1307 optionally include utilizing a dithering algorithm to determine a best power estimate solution for a specified signal-to-noise ratio (SNR) value.

Example 1309 is a computer program product comprising one or more computer readable storage media comprising computer-executable instructions operable to, when executed by processing circuitry of a device, configure the device to receive a plurality of quantized signals from a quadrature modulated signal, assign the quantized signals into regions of a constellation map made up of in-phase (I)/quadrature (Q) quantization bins according to their quantized power level, determine a maximum likelihood estimator (MLE) based on the assigned quantized signals, estimate a power based on the MLE, and adjust a variable gain amplifier for further received signals based on the estimated power.

In example 1310, the subject matter of example 1309 optionally includes that the MLE is computed with the equation $$\hat{P} = \underset{P}{\operatorname{argmax}} \frac{1}{N} \sum_{i=1}^{2^{b-2}(2^{b-1}+1)} n_{r_i} \log(P(r_i|P))$$

where $n_{ri}$ is the number of samples out of N quantized in region $r_i$ b=$\log_2(2n)$ bits in each of the I/Q components of a received signal, and P is the average received signal power which is computed as $$P = E\{|h|^2\} \frac{1}{M} \sum_{m=1}^{M} |x_m|^2$$

Another example is a computer program product comprising one or more computer readable storage media comprising computer-executable instructions operable to, when executed by processing circuitry of a device, configure the device to perform any of the methods of examples 1300-1308.

Example 1311 is a system comprising means to perform any of the methods of examples 1300-1308.

Example 1312 is an automatic gain control (AGC) circuit of a radio-frequency (RF) receiver, that may comprise means for receiving a plurality of quantized signals from a quadrature modulated signal, means for assigning the quantized signals into regions of a constellation map made up of in-phase (I)/quadrature (Q) quantization bins according to their quantized power level, means for determining a maximum likelihood estimator (MLE) based on the assigned quantized signals, means for estimating a power based on the MLE, and means for adjusting a variable gain amplifier for further received signals based on the estimated power.

In example 1313, the subject matter of example 1312 optionally includes means for computing the MLE with the equation $$\hat{P} = \underset{P}{\operatorname{argmax}} \frac{1}{N} \sum_{i=1}^{2^{b-2}(2^{b-1}+1)} n_{r_i} \log(P(r_i|P))$$

where $n_{ri}$ is the number of samples out of N quantized in region $r_i$, b=$\log_2(2n)$ bits in each of the I/Q components of a received signal, and P is the average received signal power which is computed as $$P = E\{|h|^2\} \frac{1}{M} \sum_{m=1}^{M} |x_m|^2$$

In example 1314, the subject matter of example 1313 optionally includes means for solving the power estimation equation $$\sum_{i=1}^{2^{b-2}(2^{b-1}+1)} \frac{n_{r_i}}{N} \log(P(r_i|P)) \le \sum_{i=1}^{2^{b-2}(2^{b-1}+1)} \frac{n_{r_i}}{N} \log\left(\frac{n_{r_i}}{N}\right).$$

In example 1315, the subject matter of any one or more of examples 1312-1314 optionally include that the quantized signals are signals from a low-resolution analog-to-digital converter (ADC).

In example 1316, the subject matter of example 1315 optionally includes that the low-resolution ADC produces three or fewer bits.

In example 1317, the subject matter of any one or more of examples 1312-1316 optionally include means for utilizing all samples from all ADCs together to allow a latency reduction.

In example 1318, the subject matter of any one or more of examples 1312-1317 optionally include means for selecting regions having a monotonically increasing or decreasing conditional distributions $P(r_i|P)$, means for choosing a set of regions from the selected regions such that $$r_i = \arg\max_{r_i} \left|\frac{dP(r_i|P)}{dP}\right|,$$

over P of interest, and means for solving an optimization problem $$\min_P \sum_{i \in step\ 2} \left|P(r_i|P) - \frac{n_{r_i}}{N}\right|.$$

In example 1319, the subject matter of any one or more of examples 1312-1318 optionally include means for constructing a look-up table (LUT) for estimated power to use for subsequent power estimates.

In example 1320, the subject matter of any one or more of examples 1312-1319 optionally include means for utilizing a dithering algorithm to determine a best power estimate solution for a specified signal-to-noise ratio (SNR) value.

Example 1321 is a device for controlling an antenna array in a phased array transceiver, that may comprise a plurality of transceiver slices, each that may comprise an antenna element forming a part of an antenna array of the device, a transmit and receive switch that is switchable between a transmit mode (TM) and a receive mode (RM) of operation, a receive path comprising a variable low noise amplifier and phase shifter, the receive path connectable to the antenna element in the RM, and, a transmit path comprising a variable power amplifier and phase shifter, the transmit path connectable to the antenna in the TM, a gain table that contains gain adjustment values that map to a number of or configuration of active antenna elements, a processor to configure the gain table for minimum current drain settings of the antenna array, and, in the RM perform automatic gain control using the gain table, and determine when an interferer is present, and when present, configure the gain table for a narrower beam width setting of the antenna array and return to perform the automatic gain control, when not present, return to configure the gain table for minimum current drain settings of the antenna array.

In example 1322, the subject matter of example 1321 optionally includes that the processor is further to, in the TM perform a power control using the gain table, determine if co-existence with other signals or interference from other signals is present, when co-existence or interference is present, the processor is further to configure the gain table for narrower beam width settings of the antenna array, and return to perform the power control, when co-existence and interference are not present, the processor is further to determine when there is a network request for a narrower beam width, when the network request is true, the processor is further to return to the configure the gain table for narrower beam width settings of the antenna array, and when the network request is not true, the processor is further to return to the configure the gain table for minimum current drain settings of the antenna array.

In example 1323, the subject matter of any one or more of examples 1321-1322 optionally include that the receive path is connectable to a combiner and the transmit path is connectable to a splitter.

In example 1324, the subject matter of any one or more of examples 1321-1323 optionally include that the processor is further to determine if a received signal value exceeds a predefined value, when true, the processor is further to return to the configure the gain table for minimum current drain settings of the antenna array.

In example 1325, the subject matter of example 1324 optionally includes that the received signal value is a received signal strength indicator (RSSI).

In example 1326, the subject matter of any one or more of examples 1321-1325 optionally include that the determination of when an interference is present is made by the processor to perform a wideband and narrowband detection and compare respective results.

In example 1327, the subject matter of any one or more of examples 1322-1326 optionally include that the processor is further configured to determine if a user proximity condition is satisfied, and when the condition is satisfied, return to configure the gain table for a narrower beam width setting of the antenna array.

In example 1328, the subject matter of example 1327 optionally includes that the proximity condition is that the direction of communications is away from the user.

In example 1329, the subject matter of example 1328 optionally includes that the proximity condition further includes a distance of the user from the device.

In example 1330, the subject matter of any one or more of examples 1321-1329 optionally include that the processor is further configured to determine a speed of the device relative to another device it is communicating with, and when the speed is below a predefined threshold, return to configure the gain table for a narrower beam width setting of the antenna array.

In example 1331, the subject matter of any one or more of examples 1321-1330 optionally include that the device is a base station in a cellular telephone network.

In example 1332, the subject matter of any one or more of examples 1321-1331 optionally include an omni-directional antenna forming a part of the antenna array.

In example 1333, the subject matter of any one or more of examples 1321-1332 optionally include that the antenna elements are arranged in a rectangular configuration.

Example 1334 is a method for controlling an antenna array in a phased array transceiver, that may comprise switching a transmit and receive switch that is switchable between a transmit mode (TM) and a receive mode (RM) of operation, amplifying and phase shifting a signal in a receive path with a variable low noise amplifier and phase shifter, the receive path connectable to the antenna element in the RM, and, amplifying and phase shifting a signal in a transmit path comprising a variable power amplifier and phase shifter, the transmit path connectable to the antenna in the TM, storing gain adjustment values in a gain table that map to a number of or configuration of active antenna elements, configuring the gain table for minimum current drain settings of the antenna array, and, in the RM performing automatic gain control using the gain table, and determining when an interferer is present, and when present, configuring the gain table for a narrower beam width setting of the antenna array and returning to perform the automatic gain control, when not present, returning to configure the gain table for minimum current drain settings of the antenna array.

In example 1335, the subject matter of example 1334 optionally includes that the processor is further to, in the TM performing a power control using the gain table, determining if co-existence with other signals or interference from other signals is present, when co-existence or interference is present configuring the gain table for narrower beam width settings of the antenna array, and returning to perform the power control, when co-existence and interference are not present determining when there is a network request for a narrower beam width, when the network request is true, returning to the configuring of the gain table for narrower beam width settings of the antenna array, and when the network request is not true, returning to the configuring the gain table for minimum current drain settings of the antenna array.

In example 1336, the subject matter of any one or more of examples 1334-1335 optionally include that the receive path is connectable to a combiner and the transmit path is connectable to a splitter.

In example 1337, the subject matter of any one or more of examples 1334-1336 optionally include determining if a received signal value exceeds a predefined value, when true, returning to the configure the gain table for minimum current drain settings of the antenna array.

In example 1338, the subject matter of example 1337 optionally includes that the received signal value is a received signal strength indicator (RSSI).

In example 1339, the subject matter of any one or more of examples 1334-1338 optionally include that the determination of when an interference is present is made by the processor to perform a wideband and narrowband detection and compare respective results.

In example 1340, the subject matter of any one or more of examples 1335-1339 optionally include determining if a user proximity condition is satisfied, and when the condition is satisfied, returning to configure the gain table for a narrower beam width setting of the antenna array.

In example 1341, the subject matter of example 1340 optionally includes that the proximity condition is that the direction of communications is away from the user.

In example 1342, the subject matter of example 1341 optionally includes that the proximity condition further includes a distance of the user from the device.

In example 1343, the subject matter of any one or more of examples 1334-1342 optionally include determining a speed of the device relative to another device it is communicating with, and when the speed is below a predefined threshold, returning to configure the gain table for a narrower beam width setting of the antenna array.

In example 1344, the subject matter of any one or more of examples 1334-1343 optionally include that the device is a base station in a cellular telephone network.

In example 1345, the subject matter of any one or more of examples 1334-1344 optionally include an omni-directional antenna forming a part of the antenna array.

In example 1346, the subject matter of any one or more of examples 1334-1345 optionally include that the antenna elements are arranged in a rectangular configuration.

Example 1347 is a computer program product comprising one or more computer readable storage media comprising computer-executable instructions operable to, when executed by processing circuitry of a device, configure the device to switch a transmit and receive switch that is switchable between a transmit mode (TM) and a receive mode (RM) of operation, amplify and phase shifting a signal in a receive path with a variable low noise amplifier and phase shifter, the receive path connectable to the antenna element in the RM, and, amplify and phase shifting a signal in a transmit path comprising a variable power amplifier and phase shifter, the transmit path connectable to the antenna in the TM, store gain adjustment values in a gain table that map to a number of or configuration of active antenna elements, configure the gain table for minimum current drain settings of the antenna array, and, in the RM perform automatic gain control using the gain table, and determine when an interferer is present, and when present, configure the gain table for a narrower beam width setting of the antenna array and return to perform the automatic gain control, when not present, return to configure the gain table for minimum current drain settings of the antenna array.

In example 1348, the subject matter of example 1347 optionally includes that the instructions are further operable to, in the TM perform a power control using the gain table, determine if co-existence with other signals or interference from other signals is present, when co-existence or interference is present configure the gain table for narrower beam width settings of the antenna array, and return to perform the power control, when co-existence and interference are not present determine when there is a network request for a narrower beam width, when the network request is true, return to the configuring of the gain table for narrower beam width settings of the antenna array, and when the network request is not true, return to the configuring the gain table for minimum current drain settings of the antenna array.

Example 1349 is a computer program product comprising one or more computer readable storage media comprising computer-executable instructions operable to, when executed by processing circuitry of a device, configure the device to perform any of the methods of examples 1334-1346.

Example 1350 is a system comprising means to perform any of the methods of examples 1334-1346.

Example 1351 is a digital-to-analog circuit device, that may comprise a first component comprising a current source and at least two switchable paths for the current source to drain, that a voltage reference at a voltage reference point associated with the paths is dependent upon a number of the paths switched on, and a second component comprising at least two switchable paths, that an output associated with the second component is dependent upon a second number of paths switch on and the voltage reference point, that the voltage reference point connects the first component to the second component.

In example 1352, the subject matter of example 1351 optionally includes that the first component paths each comprise a transistor having their gates connected to the voltage reference point.

In example 1353, the subject matter of example 1352 optionally includes that the first component paths each have a second transistor as a switch connected in series with the transistor between the current source and the transistor.

In example 1354, the subject matter of any one or more of examples 1351-1353 optionally include that the voltage reference point comprises a switch that switchably connects the first component to the second component.

In example 1355, the subject matter of any one or more of examples 1351-1354 optionally include that each path of the second component comprises a transistor having a gate connected to the voltage reference point.

In example 1356, the subject matter of example 1355 optionally includes that each path of the second component further comprises a second transistor in series between the output and the transistor that acts as a switch to engage the path.

In example 1357, the subject matter of any one or more of examples 1351-1356 optionally include that a voltage at the voltage reference point is V/N, where N is the number of paths in the first component and V is a voltage at the reference point when only one path is active.

Example 1358 is a method of operating a digital-to-analog circuit device, that may comprise in a first component providing at least two switchable paths, running current from a current source through the at least two switchable paths to establish a reference voltage at a reference voltage point that is dependent upon a number of the paths switched on, and in a second component providing at least two switchable paths, that an output associated with the second component is dependent upon a second number of paths switch on and the voltage reference point, that the voltage reference point connects the first component to the second component.

In example 1359, the subject matter of example 1358 optionally includes that the first component paths each comprise a transistor having their gates connected to the voltage reference point.

In example 1360, the subject matter of example 1359 optionally includes that the first component paths each have a second transistor as a switch connected in series with the transistor between the current source and the transistor.

In example 1361, the subject matter of any one or more of examples 1358-1360 optionally include that the voltage reference point comprises a switch that switchably connects the first component to the second component.

In example 1362, the subject matter of any one or more of examples 1358-1361 optionally include that each path of the second component comprises a transistor having a gate connected to the voltage reference point.

In example 1363, the subject matter of example 1362 optionally includes that each path of the second component further comprises a second transistor in series between the output and the transistor that acts as a switch to engage the path.

In example 1364, the subject matter of any one or more of examples 1358-1363 optionally include that a voltage at the voltage reference point is V/N, where N is the number of paths in the first component and V is a voltage at the reference point when only one path is active.

Example 1365 is a system comprising means to perform any of the methods of examples 1358-1364.

Example 1366 is a method of operating a digital-to-analog circuit device, that may comprise in a first component providing at least two switchable paths, means for running current from a current source through the at least two switchable paths to establish a reference voltage at a reference voltage point that is dependent upon a number of the paths switched on, and in a second component providing at least two switchable paths, that an output associated with the second component is dependent upon a second number of paths switch on and the voltage reference point, that the voltage reference point connects the first component to the second component.

In example 1367, the subject matter of example 1366 optionally includes that the first component paths each comprise a transistor having their gates connected to the voltage reference point.

In example 1368, the subject matter of example 1367 optionally includes that the first component paths each have a second transistor as a switch connected in series with the transistor between the current source and the transistor.

In example 1369, the subject matter of any one or more of examples 1366-1368 optionally include that the voltage reference point comprises a means that switchably connects the first component to the second component.

In example 1370, the subject matter of any one or more of examples 1366-1369 optionally include that each path of the second component comprises a transistor having a gate connected to the voltage reference point.

In example 1371, the subject matter of example 1370 optionally includes that each path of the second component further comprises a second transistor in series between the output and the transistor that acts as a means to engage the path.

In example 1372, the subject matter of any one or more of examples 1366-1371 optionally include that a voltage at the voltage reference point is V/N, where N is the number of paths in the first component and V is a voltage at the reference point when only one path is active.

Example 1373 is a mixed signal feedforward feedback polarizer equalizer (MSFFPE) device for a radio frequency receiver device, that may comprise inputs connectable to an in-phase (I) signal line and a quadrature (Q) signal line on a digital side of the receiver, filter and processing elements that operate on input signals at the inputs, and outputs connectable to an I signal line and a Q signal line on an analog side of the receiver.

In example 1374, the subject matter of example 1373 optionally includes that the I and Q signal lines on the digital side and analog side of the receiver each comprise a vertical component VI and VQ, and a horizontal component. HI and HQ.

In example 1375, the subject matter of example 1374 optionally includes that the filtering and processing elements comprise circuitry to reduce crosstalk between the VI and HI signal lines, between the VI and HQ signal lines, between the VQ and HI signal lines, and between the VQ and HQ signal lines.

In example 1376, the subject matter of any one or more of examples 1373-1375 optionally include that the filtering and processing elements comprise circuitry to reduce crosstalk between the I and Q signal lines.

In example 1377, the subject matter of any one or more of examples 1373-1376 optionally include that the filter and processing elements comprise a digital delay and summer circuitry.

In example 1378, the subject matter of any one or more of examples 1373-1377 optionally include that the filter and processing elements comprise resettable capacitors having an output capacitor voltage is resettable by a reset clock signal.

In example 1379, the subject matter of example 1378 optionally includes that the capacitors integrate charge during an integration clock period.

In example 1380, the subject matter of any one or more of examples 1373-1379 optionally include that the filter and processing elements further comprise an op amp that provides common mode feedback related to boost device for bandwidth enhancement and offset cancelation.

In example 1381, the subject matter of example 1380 optionally includes feedback taps and a decision feedback equalizer (DFE) input.

Example 1382 is a method for operating a mixed signal feedforward feedback polarizer equalizer (MSFFPE) device for a radio frequency receiver device, that may comprise receiving digital signals to inputs connectable to an in-phase (I) signal line and a quadrature (Q) signal line on a digital side of the receiver, filtering and processing the received digital signals with filter and processing elements, and outputting analog signals at outputs connectable to an I signal line and a Q signal line on an analog side of the receiver.

In example 1383, the subject matter of example 1382 optionally includes that the I and Q signal lines on the digital side and analog side of the receiver each comprise a vertical component VI and VQ, and a horizontal component. HI and HQ.

In example 1384, the subject matter of example 1383 optionally includes utilizing the filtering and processing elements to reduce crosstalk between the VI and HI signal lines, between the VI and HQ signal lines, between the VQ and HI signal lines, and between the VQ and HQ signal lines.

In example 1385, the subject matter of any one or more of examples 1382-1384 optionally include utilizing the filtering and processing elements to reduce crosstalk between the I and Q signal lines.

In example 1386, the subject matter of any one or more of examples 1382-1385 optionally include that the filter and processing elements comprise a digital delay and summer circuitry.

In example 1387, the subject matter of any one or more of examples 1382-1386 optionally include that the filter and processing elements comprise resettable capacitors having an output capacitor voltage is resettable by a reset clock signal.

In example 1388, the subject matter of example 1387 optionally includes that the capacitors integrate charge during an integration clock period.

In example 1389, the subject matter of any one or more of examples 1382-1388 optionally include that the filter and processing elements further comprise an op amp that provides common mode feedback related to boost device for bandwidth enhancement and offset cancelation.

In example 1390, the subject matter of example 1389 optionally includes feedback taps and a decision feedback equalizer (DFE) input.

Example 1391 is a system comprising means to perform any of the methods of examples 1382-1390.

Example 1392 is a device for operating a mixed signal feedforward feedback polarizer equalizer (MSFFPE) device for a radio frequency receiver device, that may comprise means for receiving digital signals to inputs connectable to an in-phase (I) signal line and a quadrature (Q) signal line on a digital side of the receiver, means for filtering and processing the received digital signals with filter and processing elements, and means for outputting analog signals at outputs connectable to an I signal line and a Q signal line on an analog side of the receiver.

In example 1393, the subject matter of example 1392 optionally includes that the I and Q signal lines on the digital side and analog side of the receiver each comprise a vertical component VI and VQ, and a horizontal component. HI and HQ.

In example 1394, the subject matter of example 1393 optionally includes utilizing the filtering and processing elements to reduce crosstalk between the VI and HI signal lines, between the VI and HQ signal lines, between the VQ and HI signal lines, and between the VQ and HQ signal lines.

In example 1395, the subject matter of any one or more of examples 1392-1394 optionally include utilizing the filtering and processing elements to reduce crosstalk between the I and Q signal lines.

In example 1396, the subject matter of any one or more of examples 1392-1395 optionally include that the filter and processing elements comprise a digital delay and summer circuitry.

In example 1397, the subject matter of any one or more of examples 1392-1396 optionally include that the filter and processing elements comprise resettable capacitors having an output capacitor voltage is resettable by a reset clock signal.

In example 1398, the subject matter of example 1397 optionally includes that the capacitors integrate charge during an integration clock period.

In example 1399, the subject matter of any one or more of examples 1392-1398 optionally include that the filter and processing elements further comprise means for common mode feedback related to boost device for bandwidth enhancement and offset cancelation.

In example 1400, the subject matter of example 1399 optionally includes feedback taps and a decision feedback equalizer (DFE) input.

Example 1401 includes an apparatus comprising a bidirectional amplifier, the bidirectional amplifier comprising a first amplifier to amplify a Transmit (Tx) signal to provide an amplified Tx signal at a Tx mode; a second amplifier to amplify a Receive (Rx) signal to provide an amplified Rx signal at an Rx mode; a first transformer to provide the Tx signal from a first input/output to the first amplifier at the Tx mode, and to output the amplified Rx signal from the second amplifier at the first input/output at the Rx mode; a second transformer to provide the Rx signal from a second input/output to the second amplifier at the Rx mode, and to output the amplified Tx signal from the first amplifier at the second input/output at the Tx mode; and a plurality of switches to, at the Tx mode, switch a plurality of activating voltages to the first amplifier and a plurality of deactivating voltages to the second amplifier, the plurality of switches to, at the Rx mode, switch the plurality of activating voltages to the second amplifier and the plurality of deactivating voltages to the first amplifier.

In one example, the apparatus of Example 1401 may include, for example, one or more additional elements, for example, a bi-directional splitter/combiner, a bi-directional mixer, PA, an LNA, one or more switches, one or more mixers, an I/Q generator, and/or one or more phase shifters, e.g., as described below with respect to Examples 1422, 1440, 1454, 1465, 1476, 1487, 1500, 1513, 1526, 1538, and/or 1551.

Example 1402 includes the subject matter of Example 1401, and optionally, wherein the plurality of activating voltages comprises a drain voltage to be applied to at least one drain of the first amplifier at the Tx mode, and to be applied to at least one drain of the second amplifier at the Rx mode.

Example 1403 includes the subject matter of Example 1402, and optionally, wherein the plurality of deactivating voltages comprises a source voltage to be applied to the at least one drain of the second amplifier at the Tx mode, and to be applied to the at least one drain of the first amplifier at the Rx mode.

Example 1404 includes the subject matter of Example 1402 or 1403, and optionally, wherein the plurality of switches comprises a first switch to switch the at least one drain of the second amplifier between the drain voltage at the Tx mode, and a source voltage at the Rx mode; and a second switch to switch the at least one drain of the first amplifier between the source voltage at the Tx mode and the drain voltage at the Rx mode.

Example 1405 includes the subject matter of any one of Examples Example 1402-1404, and optionally, wherein the bidirectional amplifier comprises a first capacitor to provide the Tx signal from the first transformer to a first input of the first amplifier; a second capacitor to provide the Tx signal from the first transformer to a second input of the first amplifier; a third capacitor to provide the Rx signal from the second transformer to a first input of the second amplifier; and a fourth capacitor to provide the Rx signal from the second transformer to a second input of the second amplifier Example 1406 includes the subject matter of any one of Examples 1402-1405, and optionally, wherein at least one amplifier of the first and second amplifiers comprises a common source Negative Metal Oxide Semiconductor (NMOS) Field Effect Transistor (FET).

Example 1407 includes the subject matter of Example 1401, and optionally, wherein the plurality of activating voltages comprises a drain voltage to be applied to at least one drain of the first amplifier at the Tx mode, and to be applied to at least one drain of the second amplifier at the Rx mode; a bias voltage to be applied to at least one gate of the first amplifier at the Tx mode, and to be applied to at least one gate of the second amplifier at the Rx mode; and a source voltage to be applied to at least one source of the of the first amplifier at the Tx mode, and to be applied to at least one source of the of the second amplifier at the Rx mode.

Example 1408 includes the subject matter of Example 1407, and optionally, wherein the plurality of deactivating voltages comprises the drain voltage to be applied to the at least one gate of the second amplifier at the Tx mode, and to be applied to the at least one gate of the first amplifier at the Rx mode; and the bias voltage to be applied to the at least one source of the second amplifier at the Tx mode, and to be applied to the at least one source of the first amplifier at the Rx mode.

Example 1409 includes the subject matter of Example 1407 or 1408, and optionally, wherein the plurality of switches comprises a first switch to switch the at least one drain of the second amplifier and the at least one gate of the first amplifier between the drain voltage at the Tx mode and the bias voltage at the Rx mode; a second switch to switch the at least one source of the first amplifier between the bias voltage at the Tx mode and the source voltage at the Rx mode; a third switch to switch the at least one source of the second amplifier between the source voltage at the Tx mode and the bias voltage at the Rx mode; and a fourth switch to switch the at least one drain of the second amplifier and the at least one gate of the first amplifier between the bias voltage at the Tx mode, and the drain voltage at the RX mode.

Example 1410 includes the subject matter of Example 1401, and optionally, wherein the plurality of activating voltages comprises a drain voltage to be applied to at least one source of the first amplifier at the Tx mode, and to be applied to at least one drain of the second amplifier at the Rx mode; a source voltage to be applied to at least one drain of the first amplifier at the Tx mode, and to be applied to at least one source of the second amplifier at the Rx mode; a first bias voltage to be applied to at least one gate of the first amplifier at the Tx mode; and a second bias voltage to be applied to at least one gate of the second amplifier at the Rx mode.

Example 1411 includes the subject matter of Example 1410, and optionally, wherein the plurality of deactivating voltages comprises the first bias voltage to be applied to the at least one drain of the second amplifier and to the at least one source of the second amplifier at the Tx mode; and the second bias voltage to be applied to the at least one drain of the first amplifier at the Tx mode, and to the at least one source of the first amplifier at the Rx mode.

Example 1412 includes the subject matter of any one of Example 1410 or 1411, and optionally, wherein the plurality of switches comprises a first switch to switch the at least one drain of the second amplifier and the at least one gate of the first amplifier between a source voltage at the Tx mode and the second bias voltage at the Rx mode; a second switch to switch the at least one source of the first amplifier between the first bias voltage at the Tx mode and the source voltage at the Rx mode; a third switch to switch the at least one source of the second amplifier between the drain voltage at the Tx mode and the second bias voltage at the Rx mode; and a fourth switch to switch the at least one drain of the first amplifier and the at least one gate of the second amplifier between the first bias voltage at the Tx mode and the drain voltage at the Rx mode.

Example 1413 includes the subject matter of any one of Examples 1410-1412, and optionally, wherein the first amplifier comprises one or more Positive Metal Oxide Semiconductor (PMOS) FETs, and the second amplifier comprises one or more Negative Metal Oxide Semiconductor (NMOS) FET.

Example 1414 includes the subject matter of any one of Examples 1401-1413 comprising control circuitry to provide a plurality of control signals to controllably switch the plurality of switches between the first amplifier and the second amplifier based on the Tx mode or the Rx mode.

Example 1415 includes the subject matter of any one of Examples 1401-1414, and optionally, wherein the first amplifier comprises a Power Amplifier (PA), and the second amplifier comprises a Low Noise Amplifier (LNA).

Example 1416 includes the subject matter of any one of Examples 1401-1415, and optionally, wherein the first amplifier comprises a first common source Filed Effect Transistor (FET) pair, and the second amplifier comprises a second common source Filed Effect Transistor (FET) pair.

Example 1417 includes the subject matter of any one of Examples 1401-1416 comprising a transceiver configured to transmit the Tx signal and to receive the Rx signal.

Example 1418 includes the subject matter of Example 1417, and optionally, wherein the transceiver comprises a fifth generation (5G) cellular transceiver.

Example 1419 includes the subject matter of Example 1417, and optionally, wherein the transceiver comprises a 60 Gigahertz (GHz) transceiver configured to transmit the Tx signal and to receive the Rx signal over a 60 GHz frequency band.

Example 1420 includes the subject matter of any one of Examples 1417-1419, and optionally, wherein the transceiver comprises a half-duplex transceiver.

Example 1421 includes the subject matter of any one of Examples 1401-1420 comprising one or more phase array antennas.

Example 1422 includes an apparatus comprising an active bi-directional splitter/combiner (ABDSC) switchable between a combiner mode and a splitter mode, the ABDSC comprising a plurality of antenna interfaces to receive, at the combiner mode, a plurality of Receive (Rx) signals from a respective plurality of antenna ports, and to output, at the splitter mode, a plurality of Transmit (Tx) signals to the respective plurality of antenna ports; and a transformer to operably couple the ABDSC to amplification circuitry, the transformer configured to transfer, at the splitter mode, a Tx signal from the amplification circuitry to the plurality of antenna interfaces, and to combine, at the combiner mode, the plurality of Rx signals into a combined Rx signal and provide the combined Rx signal to the amplification circuitry.

In one example, the apparatus of Example 1422 may include, for example, one or more additional elements, for example, a bi-directional amplifier, a bi-directional mixer, PA, an LNA, one or more switches, one or more mixers, an I/Q generator, and/or one or more phase shifters, e.g., as described with respect to Examples 1401, 1440, 1454, 1465, 1476, 1487, 1501, 1513, 1526, 1538, and/or 1551.

Example 1423 includes the subject matter of Example 1422 comprising controller circuitry to controllably switch the ABDSC between the splitter mode and the combiner mode.

Example 1424 includes the subject matter of Example 1422 or 1423, and optionally, wherein an antenna interface of the plurality of antenna interfaces comprises a first transistor pair in a cascode connection to be activated at the splitter mode and deactivated at the combiner mode, by a transistor of the first transistor pair; and a second transistor pair in a cascode connection to be activated at the combiner mode and deactivated at the splitter mode, by a transistor of the second transistor pair.

Example 1425 includes the subject matter of Example 1424, and optionally, wherein the first transistor pair comprises a first pair of Field Effect Transistors (FETs), and the second transistor pair comprises a second pair of FETs.

Example 1426 includes the subject matter of Example 1422 or 1423, and optionally, wherein an antenna interface of the plurality of antenna interfaces comprises a first transistor having a common source connection to be activated at the combiner mode and to be deactivated at the splitter mode; and a second transistor having a common source connection to be activated at the splitter mode and to be deactivated at the combiner mode.

Example 1427 includes the subject matter of Example 1426, and optionally, wherein the first transistor and the second transistor comprise Field Effect Transistors (FETs).

Example 1428 includes the subject matter of Example 1422 or 1423, and optionally, wherein an antenna interface of the plurality of antenna interfaces comprises a transistor having a common gate connection to receive, at the splitter mode, a source voltage (Vs) at a source of the transistor and a gate voltage (Vg) at a gate of the transistor, and to receive, at the combiner mode, a drain voltage (Vd) at the source of the transistor and the source voltage Vs at the gate of the transistor.

Example 1429 includes the subject matter of Example 1428, and optionally, wherein the transistor comprises a Field Effect Transistor (FET).

Example 1430 includes the subject matter of Example 1422 or 1423, and optionally, wherein an antenna interface of the plurality of antenna interfaces comprises a first transistor having a common gate connection to be activated at the combiner mode and to be deactivated at the splitter mode; and a second transistor having a common source connection to be activated at the splitter mode and to be deactivated at the combiner mode.

Example 1431 includes the subject matter of Example 1430, and optionally, wherein the first transistor and the second transistor comprise Field Effect Transistors (FETs).

Example 1432 includes the subject matter of any one of Examples 1422-1431, and optionally, wherein the plurality of antenna interfaces comprises at least four antenna interfaces.

Example 1433 includes the subject matter of any one of Examples 1422-1432 comprising the amplification circuitry, the amplification circuitry comprising a bidirectional amplifier to amplify the combined Rx signal into an amplified Rx signal, and to generate the Tx signal by amplifying an upconverted Tx signal; a mixer to upconvert an Intermediate Frequency (IF) Tx signal into the upconverted Tx signal, and to downconvert the amplified Rx signal into an IF Rx signal; and an IF sub-system to generate a first digital signal based on the IF Rx signal, and to generate the IF Tx signal based on a second digital signal.

Example 1434 includes the subject matter of Example 1433 comprising controller circuitry to controllably switch the ABDSC between the splitter mode and the combiner mode, the controller circuitry to control, cause and/or trigger the bidirectional amplifier to amplify the upconverted Tx signal, when the ABDSC is at the splitter mode, and to control, cause and/or trigger the bidirectional amplifier to amplify the combined Rx signal, when the ABDSC is at the combiner mode.

Example 1435 includes the subject matter of any one of Examples 1422-1434 comprising a transceiver configured to transmit the Tx signals and to receive the Rx signals.

Example 1436 includes the subject matter of Example 35, and optionally, wherein the transceiver comprises a 60 Gigahertz (GHz) transceiver configured to transmit the Tx signals and to receive the Rx signals over a 60 GHz frequency band.

Example 1437 includes the subject matter of Example 1435 or 1436, and optionally, wherein the transceiver comprises a half-duplex transceiver.

Example 1438 includes the subject matter of any one of Examples 1435-1437 comprising a fifth generation (5G) cellular transceiver.

Example 1439 includes the subject matter of any one of Examples 1422-1438 comprising one or more phase array antennas.

Example 1440 includes an apparatus comprising a digital power amplifier (PA) to controllably amplify and modulate an input signal based on a digital control signal, the digital PA comprising a plurality of stacked gate controlled amplifiers, controllable by the digital control signal, to provide a plurality of amplified modulated signals, a stacked gate control amplifier of the plurality of stacked gate controlled amplifiers comprising a first input to receive the input signal, a second input to receive the digital control signal, and an output to provide an amplified modulated signal of the plurality of amplified modulated signals; and a combiner to combine the plurality of amplified modulated signals into a combiner output signal having an output power level and a modulation, which are based on the digital control signal.

In one example, the apparatus of Example 1440 may include, for example, one or more additional elements, for example, a bi-directional amplifier, a bi-directional mixer, a bi-directional splitter/combiner, a PA, an LNA, one or more switches, one or more mixers, an I/Q generator, and/or one or more phase shifters, e.g., as described with respect to Examples 1401, 1422, 1454, 1465, 1476, 1487, 1500, 1513, 1526, 1538, and/or 1551.

Example 1441 includes the subject matter of one Example 1440, and optionally, wherein the stacked gate controlled amplifier comprises a first transistor to provide the amplified modulated signal by amplifying and modulating the input signal based on the digital control signal; and a second transistor to digitally control a gate of the first transistor based on the digital control signal.

Example 1442 includes the subject matter of Example 1440 or 1441, and optionally, wherein the second transistor is configured to switch the stacked gate controlled amplifier between an On state and an Off state based on a bit value of the digital control signal.

Example 1443 includes the subject matter of any one of Examples 1440-1442, and optionally, wherein the first transistor comprises a first filed effect transistor (FET), and the second transistor comprises a second FET.

Example 1444 includes the subject matter of any one of Examples 1440-1443, and optionally, wherein the first transistor is configured to amplify the input signal by a factor of two based on a bit of the digital control signal.

Example 1445 includes the subject matter of any one of Examples 1440-1444, and optionally, wherein the digital PA is to modulate the input signal based on the digital control signal according to a modulation scheme.

Example 1446 includes the subject matter of any one of Examples 1440-1445, and optionally, wherein the modulation scheme comprises a Quadrature amplitude modulation (QAM) scheme.

Example 1447 includes the subject matter of Example 1446, and optionally, wherein the QAM scheme comprises a 64 QAM scheme.

Example 1448 includes the subject matter of any one of Examples 1440-1447, and optionally, wherein the digital signal comprises 6 bits.

Example 1449 includes the subject matter of any one of Examples 1440-1448, and optionally, wherein the plurality of stacked gate controlled amplifiers comprises six stacked gate controlled amplifiers.

Example 1450 includes the subject matter of any one of Examples 1440-1449 comprising a phase modulator to provide the input signal to the digital PA based on phase data; and a baseband to provide the digital control signal to the digital PA based on the phase data.

Example 1451 includes the subject matter of any one of Examples 1440-1450 comprising a millimeter wave transmitter to transmit the combiner output signal.

Example 1452 includes the subject matter of any one of Examples 1440-1451 comprising one or more phase array antennas operably coupled to the digital PA.

Example 1453 includes the subject matter of any one of Examples 1440-1452 comprising one or more antennas operably coupled to the digital PA.

Example 1454 includes an apparatus comprising a two-stage Doherty amplifier, the two-stage Doherty amplifier comprising at least one driver amplifier to amplify a driver amplified input signal to provide a driver radio frequency (RF) signal at a first stage; at least one main amplifier to amplify the driver RF signal to provide a main amplifier signal at a second stage; at least one controllable peaking amplifier to be turned to an On state based on a level of the driver RF signal and, at the On state, to amplify the driver RF signal to provide a peaking amplifier signal; and a sub-quarter wavelength (SQWL) balun to combine the main amplifier signal with the peaking amplifier signal, the SQWL balun comprising a first transmission line to match an impedance between at least one output of the at least one driver amplifier, at least one input of the at least one main amplifier, and at least one input of the at least one controllable peaking amplifier, the SQWL balun comprising a second transmission line to match an impedance between at least one output of the at least one main amplifier and at least one output of the at least one controllable peaking amplifier.

In one example, the apparatus of Example 1454 may include, for example, one or more additional elements, for example, a bi-directional amplifier, a bi-directional mixer, a bi-directional splitter/combiner, a PA, an LNA, one or more switches, one or more mixers, an I/Q generator, and/or one or more phase shifters, e.g., as described with respect to Examples 1401, 1422, 1440, 1465, 1476, 1487, 1500, 1513, 1526, 1538, and/or 1551.

Example 1455 includes the subject matter of Example 1454, and optionally, wherein the SQWL balun comprises a third transmission line having a first impedance, and a plurality of stubs, each stub of the plurality of stubs having a second impedance, the plurality of stubs to operably couple at least one input of the at least one driver amplifier to the third transmission line, to operably couple the at least one output of the at least one driver amplifier to the first transmission line, to operably couple the at least one input of the at least one main amplifier to the first transmission line, to operably couple at least one input of the at least one controllable peaking amplifier to the first transmission line, to operably couple at least one output of the at least one main amplifier to the second transmission line, and to operably couple at least one output of the at least one controllable peaking amplifier to the second transmission line.

Example 1456 includes the subject matter of Example 1455, and optionally, wherein the first impedance is about 50 Ohm and the second impedance is about 25 Ohm.

Example 1457 includes the subject matter of Example 1455 or 1456, and optionally, wherein a length of the stub is based on about one eighth of a wavelength of the driver RF signal.

Example 1458 includes the subject matter of any one of Examples 1455-1457, and optionally, wherein the second transmission line and the plurality of stubs are configured to provide a serial load at the at least one output of the at least one main amplifier, and at the at least one output of the at least one controllable peaking amplifier.

Example 1459 includes the subject matter of any one of Examples 1455-1458, and optionally, wherein the at least one driver amplifier comprises a first matching network comprising a first input operably coupled to a first stub of the plurality of stubs; a second matching network comprising a second input operably coupled to a second stub of the plurality of stubs, the first matching network and the second matching network to match impedances of the first stub and second stubs with an impedance of the third transmission line; a first power amplifier comprising a first input operably coupled to a first output of the first matching network and a first output operably coupled to a third stub of the plurality of stubs; and a second power amplifier comprising a second input operably coupled to a second output of the second matching network, and a second output operably coupled to a fourth stub of the plurality of stubs, the third and fourth stubs to match an impedance between the first and second outputs of the first and second power amplifiers and the first transmission line.

Example 1460 includes the subject matter of any one of Examples 1455-1459, and optionally, wherein the at least one main amplifier comprises a first matching network comprising a first input operably coupled to a first stub of the plurality of stubs; a second matching network comprising a second input operably coupled to a second stub of the plurality of stubs, the first matching network and the second matching network to match impedances of the first and second stubs with an impedance of the first transmission line; and a first power amplifier comprising a first input operably coupled to a first output of the first matching network and a first output operably coupled to a third stub of the plurality of stubs; and a second power amplifier comprising a second input operably coupled to a second output of the second matching network, and a second output operably coupled to a fourth stub of the plurality of stubs, the third and fourth stubs to match an impedance between the first and second outputs of the first and second power amplifiers and the second transmission line.

Example 1461 includes the subject matter of any one of Examples 1455-1460, and optionally, wherein the at least one controllable peaking amplifier comprises a first matching network comprising a first input operably coupled to a first stub of the plurality of stubs; a second matching network comprising a second input operably coupled to a second stub of the plurality of stubs, the first and second matching networks to match impedances of the first and second stubs with an impedance of the first transmission line; a first power amplifier comprising a first input operably coupled to a first output the first matching network and a first output operably coupled to a third stub of the plurality of stubs; and a second power amplifier comprising a second input operably coupled to a second output of the second matching network, and a second output operably coupled to a fourth stub of the plurality of stubs, the third and fourth stubs to match an impedance between the first and second outputs of the first and second power amplifiers and the second transmission line.

Example 1462 includes the subject matter of any one of Examples 1454-1461 comprising a local oscillator (LO) to generate a LO signal; In-phase (I) mixer circuitry to generate an I signal based on the LO signal; Quadrature-phase mixer circuitry to generate a Q signal based on the LO signal; and combiner circuitry to combine the I signal and the Q signal into the driver amplified input signal Example 1463 includes the subject matter of any one of Examples 1454-1462 comprising one or more phase array antennas operably coupled to the two-stage Doherty amplifier.

Example 1464 includes the subject matter of any one of Examples 1454-1463 comprising one or more antennas operably coupled to the two-stage Doherty amplifier.

Example 1465 includes an apparatus comprising an in phase (I) quadrature phase (Q) (I/Q) generator, the I/Q generator comprising a local oscillator (LO) to generate a LO signal; a first controllable phase modulation chain to, at a Transmit (Tx) mode, generate a phase modulated Tx signal based on the LO signal, and to, at a Receive (Rx) mode, generate a phase modulated I signal based on the LO signal; a second controllable phase modulation chain to generate, at the Rx mode, a phase modulated Q signal based on the LO signal; and mixer circuitry to, at the Rx mode, downconvert a Rx signal from one or more antenna ports into an I-phase modulated downconverted signal based on the phase modulated I signal, and into a Q-phase modulated downconverted signal based on the phase modulated Q signal.

In one example, the apparatus of Example 1465 may include, for example, one or more additional elements, for example, a bi-directional amplifier, a bi-directional mixer, a bi-directional splitter/combiner, a PA, an LNA, one or more switches, one or more mixers, and/or one or more phase shifters, e.g., as described with respect to Examples 1401, 1422, 1440, 1454, 1476, 1487, 1500, 1513, 1526, 1538, and/or 1551.

Example 1466 includes the subject matter of Example 1465, and optionally, wherein the mixer circuitry comprises a first mixer to downconvert the received signal at the Rx mode into the I-phase modulated downconverted signal based on the phase modulated I signal; and a second mixer to downconvert the received signal at the Rx mode into the Q-phase modulated downconverted signal based on the phase modulated Q signal.

Example 1467 includes the subject matter of Example 1466, and optionally, wherein the I/Q generator comprises a first switch to connect the first controllable phase modulation chain to the first mixer at the Rx mode; and a second switch to connect the first controllable phase modulation chain to a power amplifier at the Tx mode.

Example 1468 includes the subject matter of Example 1465 comprising a Low Noise Amplifier (LNA) to generate the received signal based on a signal received from one or more phase array antennas.

Example 1469 includes the subject matter of Example 1465, and optionally, wherein the I-phase modulated downconverted signal and the Q-phase modulated downconverted signal comprise baseband signals.

Example 1470 includes the subject matter of Example 1465, and optionally, wherein the I/Q generator comprises a first phase modulator to shift a phase of the local oscillator signal by a first phase shift to be applied to an element of a phase array antenna; and a second phase modulator to shift a phase of the local oscillator signal by a second phase shift, which comprises a 90 degree rotation of the first phase shift.

Example 1471 includes the subject matter of Example 1470, and optionally, wherein the first controllable phase modulation chain comprises the first phase modulator; and a tripler to triple a phase and a frequency of the phase modulated Tx signal at the Tx mode, and to triple a phase and a frequency of the phase modulated Q signal at the Rx mode.

Example 1472 includes the subject matter of Example 1470, and optionally, wherein the second controllable phase modulation chain comprises the second phase modulator; and a tripler to triple a phase and a frequency of the phase modulated Q signal at the Rx mode.

Example 1473 includes the subject matter of Example 1465, and optionally, wherein a frequency of the local oscillator signal is a third of a carrier frequency (fcarier/3).

Example 1474 includes the subject matter of Example 1465 comprising one or more of phase array antennas.

Example 1475 includes the subject matter of Example 1465 comprising a half-duplex transceiver.

Example 1476 includes an apparatus comprising a Radio Frequency (RF) amplifier, the RF amplifier comprising first outphasing amplifier circuitry to provide a first in-phase (I) signal based on a first input signal, and a first Quadrature phase (Q) signal based on a second input signal; second outphasing amplifier circuitry to provide a second I signal based on the first input signal, and a second Q signal based on the second input signal; third outphasing amplifier circuitry to provide a third I signal based on a third input signal, and a third Q signal based on a fourth input signal; fourth outphasing amplifier circuitry to provide a fourth I signal based on the third input signal, and a fourth Q signal based on the fourth input signal; and a sub-quarter wavelength (SQWL) four-way combiner balun comprising a first inductive stub to couple the first I signal and the second I signal to a first transmission line, a second inductive stub to couple the third I signal and the fourth I signal to a second transmission line, a first capacitive stub to couple the first Q signal and the second Q signal to the first transmission line, and a second capacitive stub to couple the third Q signal and the fourth Q signal to the second transmission line, the first transmission line to provide a first RF signal based on a combination of the first I signal, the second I signal, the first Q signal, and the second Q signal, the second transmission line to provide a second RF signal based on a combination of the third I signal, the fourth I signal, the third Q signal, and the fourth Q signal.

In one example, the apparatus of Example 1476 may include, for example, one or more additional elements, for example, a bi-directional amplifier, a bi-directional mixer, a bi-directional splitter/combiner, a PA, an LNA, one or more switches, one or more mixers, an I/Q generator, and/or one or more phase shifters, e.g., as described with respect to Examples 1401, 1422, 1440, 1454, 1465, 1487, 1500, 1513, 1526, 1538, and/or 1551.

Example 1477 includes the subject matter of Example 1476, and optionally, wherein the first outphasing amplifier circuitry comprises a first outphasing amplifier operably coupled to the first inductive stub and the first capacitive stub, the second outphasing amplifier circuitry comprises a second outphasing amplifier operably coupled to the first inductive stub and the first capacitive stub, the third outphasing amplifier circuitry comprises a third outphasing amplifier operably coupled to the second inductive stub and the second capacitive stub, and the fourth outphasing amplifier circuitry comprises a fourth outphasing amplifier operably coupled to the second inductive stub and the second capacitive stub.

Example 1478 includes the subject matter of Example 1477, and optionally, wherein each outphasing amplifier of the first, second, third, and fourth outphasing amplifiers comprises an I/Q generator to generate an initial I signal based on a local oscillator (LO) I signal, and to generate an initial Q signal based on a LO Q signal; phase modulator circuitry to generate a phase-modulated I signal by modulating the initial I signal based on a first input of the outphasing amplifier, and to generate a phase-modulated Q signal by modulating the initial Q signal based on a second input of the outphasing amplifier; a first amplifier to output an amplified I signal by amplifying the phase-modulated I signal; and a second amplifier to output an amplified Q signal by amplifying the phase-modulated Q signal.

Example 1479 includes the subject matter of Example 1478, and optionally, wherein the first inductive stub is to apply a 25 Ohm impedance to an output of the first amplifier of the outphasing amplifier, and the first capacitive stub is to apply a Ohm impedance to an output of the second amplifier of the outphasing amplifier.

Example 1480 includes the subject matter of Example 1478 or 1479, and optionally, wherein the second inductive stub is to apply a 25 Ohm impedance to an output of the first amplifier of the outphasing amplifier, and the second capacitive stub to apply a 25 Ohm impedance to an output of the second amplifier of the outphasing amplifier.

Example 1481 includes the subject matter of any one of Examples 1478-1480 comprising a LO to generate the LO I signal and the LO Q signal.

Example 1482 includes the subject matter of any one of Examples 1476-1481, and optionally, wherein the SQWL four-way combiner balun comprises a Chireix combiner.

Example 1483 includes the subject matter of any one of Examples 1476-1481, and optionally, wherein the SQWL four-way combiner balun comprises a non-isolating combiner.

Example 1484 includes the subject matter of any one of Examples 1476-1483 comprising a half-duplex transceiver.

Example 1485 includes the subject matter of any one of Examples 1476-1484 comprising one or more antennas operably coupled to the RF amplifier.

Example 1486 includes the subject matter of any one of Examples 1476-1485 comprising one or more phased-array antennas operably coupled to the RF amplifier.

Example 1487 includes an apparatus comprising a controllable phase-shifter, the controllable phase-shifter comprising In-phase (I) phase shifting circuitry to provide a phase shifted I signal based on an I signal and a Quadrature-phase (Q) signal, the I phase shifting circuitry configured to provide a first shifted I signal by shifting a phase of the I signal according to a first control signal, to provide a first shifted Q signal by shifting a phase of the Q signal according to a second control signal, and to provide the phase shifted I signal by combining the first shifted I signal with the first shifted Q signal; and Q phase shifting circuitry to provide a phase shifted Q signal based on the Q signal and the I signal, the Q phase shifting circuitry configured to provide a second shifted I signal by shifting the phase of the I signal according to a third control signal, to provide a second shifted Q signal by shifting the phase of the Q signal according to a fourth control signal, and to provide the phase shifted Q signal by combining the second shifted I signal with the second shifted Q signal.

In one example, the apparatus of Example 1487 may include, for example, one or more additional elements, for example, a bi-directional amplifier, a bi-directional mixer, a bi-directional splitter/combiner, a PA, an LNA, one or more switches, one or more mixers, and/or an I/Q generator, e.g., as described with respect to Examples 1401, 1422, 1440, 1454, 1465, 1476, 1500, 1513, 1526, 1538, and/or 1551.

Example 1488 includes the subject matter of Example 1487, and optionally, wherein the I phase shifting circuitry comprises a first voltage digital to analog convertor (VDAC) to convert the first control signal into an I control voltage, the I phase shifting circuitry to shift the phase of the I signal according to the I control voltage; and a second VDAC to convert the second control signal into a Q control voltage, the I phase shifting circuitry to shift the phase of the Q signal according to the Q control voltage.

Example 1489 includes the subject matter of Example 1488, and optionally, wherein the I phase-shifting circuitry comprises a first plurality of transistors in a cascode gate arrangement to generate the first shifted I signal according to the I control voltage; and a second plurality of transistors in a cascode gate arrangement to generate the first shifted Q signal according to the Q control voltage.

Example 1490 includes the subject matter of any one of Examples 1487-1489, and optionally, wherein the Q phase shifting circuitry comprises a first voltage digital to analog convertor (VDAC) to convert the third control signal into an I control voltage, the Q phase shifting circuitry to shift the phase of the I signal according to the I control voltage; and a second VDAC to convert the fourth control signal into a Q control voltage, the Q phase shifting circuitry to shift the phase of the Q signal according to the Q control voltage.

Example 1491 includes the subject matter of Example 1490, and optionally, wherein the Q phase-shifting circuitry comprises a first plurality of transistors in a cascode gate arrangement to generate the second shifted I signal according to the I control voltage; and a second plurality of transistors in a cascode gate arrangement to generate the second shifted Q signal according to the Q control voltage.

Example 1492 includes the subject matter of any one of Examples 1487-1491 comprising a Low Noise Amplifier (LNA) to provide a Receive (Rx) signal by amplifying a Radio Frequency (RF) signal from one or more antennas; a first mixer operably coupled to the first input of the controllable phase-shifter, the first mixer to generate the I signal by mixing the Rx signal according to a sine signal; and a second mixer operably coupled to the second input of the voltage-controlled phase shifter, the second mixer to generate the Q signal by mixing the Rx signal according to a cosine signal.

Example 1493 includes the subject matter of any one of Examples 1487-1492 comprising a first mixer operably coupled to a first output of the controllable phase-shifter, the first mixer to generate a first Radio Frequency (RF) signal by mixing the phase shifted I signal according to a sine signal; a second mixer operably coupled to a second output of the controllable phase shifter, the second mixer to generate a second RF signal by mixing the phase shifted Q signal according to a cosine signal; and a Power Amplifier (PA) to provide a Transmit (Tx) signal to one or more antennas by amplifying the first RF signal and the second RF signal.

Example 1494 includes the subject matter of Example 1487 comprising a calibration sub-system configured to calibrate linearity and resolution of the controllable phase-shifter based on a predefined constellation-point map.

Example 1495 includes the subject matter of Example 1494, and optionally, wherein the calibration sub-system is to generate a Look Up Table (LTU) comprising a plurality of pairs of voltage values corresponding to a respective plurality of constellation points according to the predetermined constellation-point map, a pair of voltage values comprising a first I voltage value to be applied to the first control signal, a first Q voltage value to be applied to the second control signal, a second I voltage value to be applied to the third control signal and a second Q voltage value to be applied to the fourth control signal.

Example 1496 includes the subject matter of Example 1494 or 1495, and optionally, wherein the first control signal comprises a first digital signal to apply first data to the I phase shifting circuitry based on the predefined constellation-point map, the second control signal comprises a second digital signal to apply second data to the I phase shifting circuitry based on the predefined constellation-point map, the third control signal comprises a third digital signal to apply third data to the Q phase shifting circuitry based on the predefined constellation-point map, and the fourth control signal comprises a fourth digital signal to apply fourth data to the Q phase shifting circuitry based on the predefined constellation-point map.

Example 1497 includes the subject matter of one of Examples 1487-1495 comprising a transceiver to be operably coupled to one or more phased-array antennas.

Example 1498 includes the subject matter of Example 1497, and optionally, wherein the transceiver comprises a half-duplex transceiver.

Example 1499 includes the subject matter of Example 1497, and optionally, wherein the transceiver comprises a full-duplex transceiver Example 1500 includes an apparatus comprising a power amplifier (PA) Low Noise Amplifier (LNA) (PA-LNA) interface to interface an antenna terminal with a PA and an LNA, the PA-LNA interface comprising a sensor to provide a sensed signal based on a transmit (Tx) signal from the PA; a phase rotator to provide a phase rotated signal by rotating a phase of the sensed signal; a variable gain amplifier (VGA) to provide a Tx leakage cancelation signal by amplifying the phase rotated signal based on an amplitude of the Tx signal; and a combiner to combine a first combiner input signal with a second combiner input signal, the first combiner input signal comprising the Tx leakage cancellation signal, the second combiner input signal comprising a Tx leakage from the Tx signal to the LNA.

In one example, the apparatus of Example 1500 may include, for example, one or more additional elements, for example, a bi-directional amplifier, a bi-directional mixer, a bi-directional splitter/combiner, a PA, an LNA, one or more switches, one or more mixers, an I/Q generator, and/or one or more phase shifters, e.g., as described with respect to Examples 1401, 1422, 1440, 1454, 1465, 1476, 1487, 1513, 1526, 1538, and/or 1551.

Example 1501 includes the subject matter of Example 1500, and optionally, wherein, at a Receive (Rx) mode, the second combiner input signal comprises a combination of a Receive (Rx) signal from the antenna terminal, and the Tx leakage from the Tx signal to the LNA.

Example 1502 includes the subject matter of Example 1501, and optionally, wherein, at the Rx mode, the combiner is to provide to the LNA a sum of the first combiner input signal and the second combiner input signal.

Example 1503 includes the subject matter of any one of Example 1500-1502, and optionally, wherein the phase rotator is configured to rotate the phase of the sensed signal by 180 degrees.

Example 1504 includes the subject matter of any one of Examples 1500-1503, and optionally, wherein the combiner comprises a Wilkinson combiner.

Example 1505 includes the subject matter of any one of Examples 1500-1504, and optionally, wherein the sensor comprises a capacitive sensor.

Example 1506 includes the subject matter of any one of Examples 1500-1505, and optionally, wherein the PA-LNA interface is configured to provide the Tx signal from the PA to the antenna terminal at a Tx mode, and to provide a receive (Rx) signal from the antenna terminal to the LNA at an Rx mode.

Example 1507 includes the subject matter of Example 1506, and optionally, wherein the PA-LNA interface is to apply a high impedance to an input of the LNA at the Tx mode.

Example 1508 includes the subject matter of Example 1506 or 1507, and optionally, wherein the PA-LNA interface is to apply a high impedance at an output of the PA at the Rx mode.

Example 1509 includes the subject matter of any one of Examples 1500-1508 comprising a half-duplex transceiver.

Example 1510 includes the subject matter of any one of Examples 1500-1509 comprising a full-duplex transceiver.

Example 1511 includes the subject matter of any one of Examples 1500-1510 comprising one or more antennas operably coupled to the antenna terminal.

Example 1512 includes the subject matter of any one of Examples 1500-1511 comprising transmitter circuitry to transmit the Tx signal at a Tx mode, and receiver circuitry to receive the Rx signal at a Receive (Rx) mode.

Example 1513 includes an apparatus comprising local oscillator (LO) distribution network circuitry comprising at least one In-phase (I) Quadrature phase (Q) (IQ) generator, the I/Q generator comprising phase shifting circuitry to generate a first phase shifted signal and a second phase shifted signal based on a LO signal having a first frequency, a phase of the second phase shifted signal is shifted by 30 degrees from a phase of the first phase shifted signal; first tripler circuitry to generate an I signal having a second frequency, by tripling the phase of the first phase shifted signal and tripling a frequency of the first phase shifted signal; and second tripler circuitry to generate a Q signal having the second frequency, by tripling the phase of the second phase shifted signal and tripling a frequency of the second phase shifted signal.

In one example, the apparatus of Example 1513 may include, for example, one or more additional elements, for example, a bi-directional amplifier, a bi-directional mixer, a bi-directional splitter/combiner, a PA, an LNA, one or more switches, one or more mixers, and/or one or more phase shifters, e.g., as described with respect to Examples 1401, 1422, 1440, 1454, 1465, 1476, 1487, 1500, 1526, 1538, and/or 1551.

Example 1514 includes the subject matter of Example 1513 or 1514, and optionally, wherein the first phase shifted signal comprises a first I phase shifted signal and a second I phase shifted signal, and the second phase shifted signal comprises a first Q phase shifted signal and a second Q phase shifted signal.

Example 1515 includes the subject matter of Example 1514, and optionally, wherein the first tripler circuitry comprises imbalance and amplitude circuitry to balance an amplitude of the first I phase shifted signal according to the second Q phase shifted signal, and to balance an amplitude of the second I phase shifted signal according to the first Q phase shifted signal.

Example 1516 includes the subject matter of Example 1514 or 1515, and optionally, wherein the second tripler circuitry comprises imbalance and amplitude circuitry to balance an amplitude of the first Q phase shifted signal according to the second I phase shifted signal, and to balance an amplitude of the second Q phase shifted signal according to the first I phase shifted signal.

Example 1517 includes the subject matter of any one of Examples 1513-1515, and optionally, wherein the phase shifting circuitry comprises passive phase shifting circuitry.

Example 1518 includes the subject matter of any one of Examples 1513-1517, and optionally, wherein the phase shifting circuitry comprises first injection LO (ILO) circuitry to generate the first phase shifted signal; and second ILO circuitry to generate the second phase shifted signal.

Example 1519 includes the subject matter of any one of Examples 1513-1518, and optionally, wherein the at least one IQ generator comprises a Receive (Rx) IQ generator, the apparatus comprising one or more low noise amplifiers (LNAs) to generate an amplified Rx signal based on an Rx signal; and Rx mixer circuitry to downconvert the amplified Rx signal into a downconverted I signal based on the I signal and the amplified Rx signal, and to downconvert the amplified Rx signal into a downconverted Q signal based on the Q signal and the amplified Rx signal.

Example 1520 includes the subject matter of Example 1519, and optionally, wherein the Rx mixer circuitry comprises a first mixer to downconvert the Rx signal into the downconverted I signal; and a second mixer to downconvert the Rx signal into the downconverted Q signal.

Example 1521 includes the subject matter of any one of Examples 1513-1520, and optionally, wherein the at least one IQ generator comprises a Transmit (Tx) IQ generator, the apparatus comprising Tx mixer circuitry to upconvert an intermediate frequency (IF) I signal into an upconverted I signal based on the I signal, and to upconvert an IF Q signal into an upconverted Q signal based on the Q signal; a combiner to combine the upconverted I signal and the upconverted Q signal into a Tx signal; and a power amplifier (PA) to amplify the Tx signal.

Example 1522 includes the subject matter of Example 1521, and optionally, wherein the Tx mixer circuitry comprises a first mixer to upconvert the IF I signal into the upconverted I signal; and a second mixer to upconvert the IF Q signal into the upconverted Q signal.

Example 1523 includes the subject matter of any one of Examples 113-122, and optionally, wherein the at least one IQ generator comprises a first IQ generator to generate a first I signal and a first Q signal, and a second IQ generator to generate a second I signal and a second Q signal.

Example 1524 includes the subject matter of any one of Examples 1513-1523 comprising a transceiver operably coupled to one or more antennas.

Example 1525 includes the subject matter of Example 1524, and optionally, wherein the transceiver comprises a half-duplex transceiver.

Example 1526 includes an apparatus comprising wideband amplifier circuitry, the wideband amplifier circuitry comprising a splitter to split a radio frequency (RF) input signal into a high frequency band signal and a low frequency band signal, the splitter comprising first circuitry to filter the low frequency band signal from the RF input signal, and second circuitry to filter the high frequency band signal from the RF input signal; a high band amplifier to amplify the high frequency band signal to provide a first amplified signal; a low band amplifier to amplify the low frequency band signal to provide a second amplified signal; and a combiner to combine the first amplified signal and the second amplified signal into an amplified RF signal.

In one example, the apparatus of Example 1526 may include, for example, one or more additional elements, for example, a bi-directional amplifier, a bi-directional mixer, a bi-directional splitter/combiner, a PA, an LNA, one or more switches, one or more mixers, an I/Q generator, and/or one or more phase shifters, e.g., as described with respect to Examples 1401, 1422, 1440, 1454, 1465, 1476, 1487, 1500, 1513, 1538, and/or 1551.

Example 1527 includes the subject matter of Example 1526, and optionally, wherein the wideband amplifier circuitry comprises a first switch to activate the low band amplifier when the RF input signal is at least over a first frequency band; and a second switch to activate the high band amplifier when the RF input signal is at least over a second frequency band, higher than the first frequency band.

Example 1528 includes the subject matter of Example 1526 or Example 1527 comprising baseband circuitry to controllably activate the first switch and the second switch based on one or more frequency bands of the RF input signal.

Example 1529 includes the subject matter of any one of Examples 1526-1528, and optionally, wherein the combiner comprises a transformer to receive the first amplified signal from the high band amplifier at a first section of the transformer and to match an impedance between the first section of the transformer and the high band amplifier and the transformer to receive the second amplified signal from the low band amplifier at a second section of the transformer, and to match an impedance between the second section of the transformer and the low band amplifier, the transformer comprising a third section to combine the first amplified signal from the first section of the transformer with the second amplified signal from the second section of the transformer into the amplified RF signal.

Example 1530 includes the subject matter of Example 1529, and optionally, wherein a physical size of the first section of the transformer is larger than a physical size of the second section of the transformer.

Example 1531 includes the subject matter of any one of Examples 1526-1530, and optionally, wherein the splitter comprises a transformer to receive the RF input signal, at a first section of the transformer, to provide, by a second section of the transformer, the low frequency band signal to the low band amplifier and to match an impedance between the second section of the transformer and the low band amplifier, and to provide, by a third section of the transformer, the high frequency band to the high band amplifier and to match impedance between the third section of the transformer and the high band amplifier.

Example 1532 includes the subject matter of Example 1531, and optionally, wherein the first circuitry comprises the second section of the transformer and at least part of the first section of the transformer, and the second circuitry comprises the third section of the transformer and at least part of the first section of the transformer.

Example 1533 includes the subject matter of any one of Examples 1526-1532 comprising baseband circuitry to generate an intermediate frequency (IF) input signal; and RF circuitry to generate the RF input signal by upconverting the IF input signal.

Example 1534 includes the subject matter of Example 1533, and optionally, wherein the baseband circuitry and the RF circuitry are operably coupled by an RF cable.

Example 1535 includes the subject matter of Example of any one of Examples 1526-1534 comprising a transmitter to be operably coupled to one or more phased-array antennas.

Example 1536 includes the subject matter of any one of Examples 1526-1535 comprising one or more phased-array antennas operably coupled to the wideband amplifier.

Example 1537 includes the subject matter of any one of Examples 1526-1536, and optionally, wherein the wideband amplifier comprises a 60 GHZ band amplifier.

Example 1538 includes an apparatus comprising a plurality of impedance matching switches to switchably couple a modem core to one or more radio cores of a plurality of radio cores, an impedance matching switch of the plurality of impedance matching switches comprising a first terminal to be operably coupled to the modem core; a second terminal to be operably coupled to a respective radio core of the plurality of radio cores; and impedance matching circuitry to controllably match an impedance between the radio core and the modem core, based on a count of the one or more radio cores to be coupled to the modem core by the plurality of impedance matching switches.

In one example, the apparatus of Example 1538 may include, for example, one or more additional elements, for example, a bi-directional amplifier, a bi-directional mixer, a bi-directional splitter/combiner, a PA, an LNA, one or more mixers, an I/Q generator, and/or one or more phase shifters, e.g., as described with respect to Examples 1401, 1422, 1440, 1454, 1465, 1476, 1487, 1500, 1513, 1526, and/or 1551.

Example 1539 includes the subject matter of Example 1538, and optionally, wherein the impedance matching circuitry is switchable between a plurality of impedance matching modes according to a control signal from the modem core, the plurality of impedance matching modes corresponding to a respective plurality of different radio core counts to be coupled to the modem core.

Example 1540 includes the subject matter of Example 1539, and optionally, wherein the impedance matching circuitry is configured to, at an impedance matching mode of the plurality of impedance matching modes, match an impedance between the radio core and the modem core based on a radio core count corresponding to the impedance matching mode.

Example 1541 includes the subject matter of Example 1539 or 1540, and optionally, wherein the plurality of impedance matching modes comprises a first impedance matching mode, in which the impedance matching circuitry is to match the impedance between the modem core and one radio core; a second impedance matching mode, in which the impedance matching circuitry is to match the impedance between the modem core and two radio cores; and a third impedance matching mode, in which the impedance matching circuitry is to match the impedance between the modem core and three radio cores.

Example 1542 includes the subject matter of any one of Examples 1538-1541, and optionally, wherein the impedance matching circuitry comprises a plurality of transistors to couple the modem core to the one or more radio cores.

Example 1543 includes the subject matter of any one of Examples 1538-1542 comprising a plurality of Radio Frequency (RF) cables, an RF cable of the plurality of RF cables to connect a respective impedance matching switch of the plurality of impedance matching switches to a respective radio core of the plurality of radio cores.

Example 1544 includes the subject matter of Example 1543, and optionally, wherein at least one RF cable of the plurality of RF cables comprises a coax cable.

Example 1545 includes the subject matter of any one of Examples 1538-1544, and optionally, wherein the impedance matching switch is to maintain about 50 Ohm impedance between the radio core and the one or more radio cores.

Example 1546 includes the subject matter of any one of Examples 1538-1545 comprising the plurality of radio cores.

Example 1547 includes the subject matter of Example 146, and optionally, wherein at least one radio core of the plurality of radio cores comprises a half-duplex transceiver.

Example 1548 includes the subject matter of any one of Examples 1538-1547 comprising baseband circuitry comprising the modem core.

Example 1549 includes the subject matter of any one of Examples 1538-1548 comprising one or more antennas.

Example 1550 includes the subject matter of any one of Examples 1538-1549 comprising one or more phase-array antennas.

Example 1551 includes an apparatus comprising bi-directional mixer, the bi-directional mixer comprising a radio frequency (RF) terminal; an intermediate frequency (IF) terminal; a first voltage terminal; a second voltage terminal; and mixing circuitry configured to operate at an upconversion mode when a first bias voltage is to be applied to the first voltage terminal and a second bias voltage is to be applied to the second voltage terminal, and to operate at a downconversion mode when the second bias voltage is to be applied to the first voltage terminal and the first bias voltage is to be applied to the second voltage terminal, the mixing circuitry to, at the downconversion mode, downconvert a first RF signal at the RF terminal into a first IF signal at the IF terminal, and, at the upconversion mode, upconvert a second IF signal at the IF terminal into a second RF signal at the RF terminal.

In one example, the apparatus of Example 1551 may include, for example, one or more additional elements, for example, a bi-directional amplifier, a bi-directional splitter/combiner, a PA, an LNA, one or more switches, one or more mixers, an I/Q generator, and/or one or more phase shifters, e.g., as described with respect to Examples 1401, 1422, 1440, 1454, 1465, 1476, 1487, 1500, 1513, 1526, and/or 1538.

Example 1552 includes the subject matter of Example 1551, and optionally, wherein the mixing circuitry comprises a Gilbert-cell comprising a plurality of transistors, the plurality of transistors to upconvert the second IF signal into the second RF signal at the upconversion mode, and to downconvert the first RF signal into the first IF signal at the downconversion mode.

Example 1553 includes the subject matter of Example 1552, and optionally, wherein the mixing circuitry comprises a first transformer to couple drains of the plurality of transistors to the RF terminal and to the first voltage terminal; a second transformer to couple sources of the plurality of transistors to the IF terminal and to the second voltage terminal; and a local oscillator (LO) terminal to couple a LO signal to gates of the plurality of transistors.

Example 1554 includes the subject matter of Example 1553, and optionally, wherein, at the upconversion mode, the second transformer is to provide the second IF signal and the second bias voltage to the sources of the plurality of transistors, and the Gilbert cell is to mix the second IF signal with the LO signal to provide a mixed RF signal to the drains of the plurality of transistors.

Example 1555 includes the subject matter of Example 1554, and optionally, wherein the first transformer is to combine the mixed IF signal at the drains of the plurality of transistors into the first RF signal.

Example 1556 includes the subject matter of any one of Examples 1553-1555, and optionally, wherein, at the downconversion mode, the first transformer is to provide the first RF signal and the second bias voltage to the drains of the plurality of transistors, and the Gilbert cell is to mix the first RF signal with the LO signal to provide a mixed IF signal to the sources of the plurality of transistors.

Example 1557 includes the subject matter of Example 1556, and optionally, wherein the second transformer is to combine the mixed RF signal at the sources of the plurality of transistors into the second IF signal.

Example 1558 includes the subject matter of any one of Examples 1552-1557, and optionally, wherein the mixing circuitry comprises a first switch operably coupled to the first voltage terminal to, at the upconversion mode, couple the first bias voltage to the drains of the plurality of transistors, and to, at the downconversion mode, couple the second bias voltage to the drains of the plurality of transistors; and a second switch operably coupled to the second voltage terminal to, at the upconversion mode, couple the second bias voltage to the sources of the plurality of transistors, and to, at the downconversion mode, couple the first bias voltage to the sources of the plurality of transistors.

Example 1559 includes the subject matter of any one of Examples 1552-1558 comprising a controller to switch the bi-directional mixer to the upconversion mode by applying the first bias voltage to drains of the plurality of transistors, and by applying the second bias voltage to sources of the plurality of transistors.

Example 1560 includes the subject matter of Example 1559, and optionally, wherein the controller is to switch the bi-directional mixer to the downconversion mode by applying the first bias voltage to the sources of the plurality of transistors, and by applying the second bias voltage to the drains of the plurality of transistors.

Example 1561 includes the subject matter of any one of Examples 1552-1560, and optionally, wherein the plurality of transistors comprises one or more field effect transistors (FETs).

Example 1562 includes the subject matter of any one of Examples 1551-1561 comprising a bi-directional RF amplifier to, at a Transmit (Tx) mode, amplify the second RF signal from the bi-directional mixer into a Tx RF signal, and to, at a Receive (Rx) mode, amplify an Rx RF signal to provide the first RF signal to the first terminal; and a bi-directional IF amplifier to, at the Tx mode, amplify a first baseband signal into the second IF signal, and to, at the Rx mode, amplify the first IF signal from the second terminal of the bi-directional mixer into a second baseband signal.

Example 1563 includes the subject matter of any one of Examples 1551-1561 comprising a first RF amplifier to, at a Transmit (Tx) mode, amplify the second RF signal from the bi-directional mixer into a Tx RF signal; a second RF amplifier to, at a Receive (Rx) mode, amplify an Rx RF signal into the first RF signal to be provided to the bi-directional mixer; a first IF amplifier to, at the Tx mode, amplify a first baseband signal into the second IF signal to be provided to the bi-directional mixer; and a second IF amplifier to, at the Rx mode, amplify the first IF signal from the bi-directional mixer into a second baseband signal. Example 1564 includes the subject matter of Example 1563, and optionally, wherein the first RF amplifier comprises a power amplifier, and the second RF amplifier comprises a Low Noise Amplifier (LNA).

Example 1565 includes the subject matter of Example 1563 or 1564, and optionally, wherein the first IF amplifier comprises a Tx IF amplifier and the second IF amplifier comprises an Rx IF amplifier.

Example 1566 includes the subject matter of any one of Examples 1551-1565 comprising a half-duplex transceiver.

Example 1567 includes the subject matter of Example 1566 comprising one or more antennas operably coupled to the transceiver.

Example 1568 includes the subject matter of Example 1567, and optionally, wherein the one or more antennas comprise one or more phased-array antennas.

In Example 1569, the subject matter of Example 1 optionally includes an apparatus for a mobile device, the apparatus comprising: a circuit board comprising a plurality of parallel layers that include a top layer and a bottom layer; a radio front end module attached to the circuit board and comprising an integrated circuit (IC); a grounded shield attached to the circuit board, the grounded shield configured to shield the IC from interference; a stacked patch directional antenna that comprises a radiating element and a parasitic element, at least the parasitic element situated adjacent the grounded shield, and the radiating element situated on one of the layers of the circuit board other than the top layer and the bottom layer, and fed by a feed mechanism comprising a feed strip coupled to the IC; wherein the grounded shield is configured as a reflector and as a ground plane for the stacked patch directional antenna, and wherein the stacked patch directional antenna is configured to propagate signals of a first polarization in an endfire direction and signals of a second polarization a broadside direction, and wherein the first and second polarizations are orthogonal polarizations 2. The apparatus of claim 1 wherein the first polarization comprises signals having an electric field that is parallel to the layers of circuit board and the second polarization comprises signals that are perpendicular to the layers of circuit board.

In Example 1570, the subject matter of Example 1569 optionally includes wherein the first polarization is a horizontal polarization and the second polarization is vertical polarization.

In Example 1571, the subject matter of any one or more of Examples 1569-1570 optionally include wherein the feed mechanism further comprises a via that couples the feed line and the radiating element.

In Example 1572, the subject matter of any one or more of Examples 1569-1571 optionally include wherein when transmission is in endfire direction the stacked patch directional antenna is configured to operate as a monopole antenna.

In Example 1573, the subject matter of any one or more of Examples 1569-1572 optionally include wherein the grounded shield is rectilinear and has a plurality of first sides, and a second side orthogonal to the plurality of first sides, wherein a plurality of the stacked directional patch antennas comprises an antenna array situated at one of the first sides of the shield within the apparatus.

In Example 1574, the subject matter of any one or more of Examples 1569-1573 optionally include wherein the grounded shield is rectilinear and has a plurality of first sides, and a second side orthogonal to the plurality of first sides, and a plurality of the stacked patch antennas comprises a plurality of antenna arrays, at least a first of the plurality of antenna arrays is situated at a first one of the first sides of the grounded shield within the apparatus, and at least a second of the plurality of antenna arrays is situated at a second one of the first sides of the grounded shield within the apparatus.

In Example 1575, the subject matter of any one or more of Examples 1569-1574 optionally include wherein the feed mechanism includes a feed point into the stacked directional patch antenna and the feed point is configured to impedance match the stacked directional patch antenna.

Example 1576 is an apparatus of a mobile device, the apparatus comprising: a printed circuit board comprising a top side and a bottom side; a radio front end module attached to the top side of the circuit board and comprising an integrated circuit (IC); a conductive shield that covers the IC and is attached to the top side of the circuit board, wherein the conductive shield comprises four sides and a top, and is configured to protect the IC from radio frequency interference; and at least one directional antenna formed by at least one cut out section of the shield, wherein the at least one directional antenna is fed by at least one feed mechanism that is part of the circuit board and is coupled to the IC, wherein the circuit board comprises a ground plane for the at least one directional antenna, and wherein the at least one directional antenna is configured to radiate in a direction outward from the IC.

In Example 1577, the subject matter of Example 1576 optionally includes wherein the at least one directional antenna comprises a planar inverted F antenna (PIFA) that terminates at the feed mechanism, and is configured to resonate at a quarter wavelength.

In Example 1578, the subject matter of any one or more of Examples 1576-1577 optionally include wherein the at least one antenna comprises a notch antenna, a slot antenna or a patch antenna.

In Example 1579, the subject matter of any one or more of Examples 1576-1578 optionally include wherein the at least one antenna comprises an array of two antennas, wherein each antenna of the array is situated on the shield orthogonal to each other, and the at least one feed mechanism comprises two feed mechanisms that each respectively feeds one of the two antennas and wherein the antenna array is configured to support two different polarizations.

In Example 1580, the subject matter of Example 1579 optionally includes wherein each of the two antennas of the array is configured on different sides of the shield or wherein one of the two antennas is configured on one of the four sides of the shield and a second of the two antennas is configured on the top of the shield.

In Example 1581, the subject matter of any one or more of Examples 1576-1580 optionally include wherein the at least one antenna comprises an array of two antennas, wherein each antenna of the array is situated on the shield orthogonal to each other, wherein the at least one feed mechanism comprises two feed mechanisms that each respectively feeds one of the two antennas, and wherein the radio front-end module is configured to provide each of the feed mechanisms with a same signal to create a new vector summation, or to provide each of the feed mechanisms with different signals for Multiple In Multiple Out (MIMO) modes of operation.

In Example 1582, the subject matter of any one or more of Examples 1579-1581 optionally include wherein each of the two feed mechanisms is configured to activate the two antennas at different times to provide a first of the two different polarizations for a first of the two antennas and a second of the two different polarizations for a second of the two antennas.

In Example 1583, the subject matter of Example 1582 optionally includes wherein the radio front end module is configured to be activated by algorithmic control, the activation is dependent on the orientation of a receiving device, the apparatus receives, from the receiving device, feedback information that designates whether the first polarization or the second polarization provides better reception at a given one of the different times, and the feedback information comprises the algorithmic control of the activation of the feedlines.

Example 1584 is apparatus of a mobile device, the apparatus comprising: a transceiver situated on a substrate within the apparatus; a phased array of antenna elements coupled to the transceiver and configured to transmit radio waves within a first angle of coverage when the phased array is scanned; and a lens placed adjacent the phased array and configured to deflect the transmitted radio waves to a second angle of coverage that is larger than the first angle of coverage.

In Example 1585, the subject matter of Example 1584 optionally includes wherein the lens comprises a prism.

Example 1586 is an antenna system comprising: a radio front end module configured to generate radio waves; a reflector; and a plurality of phased arrays of antenna elements each array located at different positions adjacent the reflector and configured to transmit the generated radio waves toward the reflector to irradiate a focus of the reflector with the radio waves, wherein the location of each array at different positions causes radio frequency radiation from the reflector in a plurality of narrow beams, each beam tilted in a different direction for scanning a different beam-scanning sector, and wherein adding an additional phased array to the plurality of phased arrays causes formation of an additional beam-scanning sector.

In Example 1587, the subject matter of Example 1586 optionally includes wherein each phased array is located at one of a side of, or at the bottom of, the reflector.

In Example 1588, the subject matter of any one or more of Examples 1586-1587 optionally include wherein each phased array antenna element has two feed mechanisms, a first of the two feed mechanisms configured to provide generated radio waves to the antenna element at a first polarization and a second of the two feed mechanisms configured to provide generated radio waves to the antenna element at a second polarization that is orthogonal to the first polarization.

Example 1589 is apparatus of a mobile device, the apparatus comprising: a chassis; a substrate within the chassis; a conformably shielded integrated circuit (IC) die comprising a transceiver configured to generate radio frequency (RF) signals, the IC die connected to the substrate within the chassis; one or more antenna directors on or within the chassis external to the substrate; and an antenna array coupled to the transceiver and configured to transmit the RF signals to interact with the one or more antenna directors, wherein the antenna array is within a first side of the substrate, on a surface mounted device (SMD) that is mounted on a second side of the substrate, or within the SMD that is mounted on the second side of the substrate, and wherein the one or more antenna directors is configured to direct the RF signals.

In Example 1590, the subject matter of Example 1589 optionally includes wherein the conformable shield comprises a ground plane for the antenna array.

In Example 1591, the subject matter of any one or more of Examples 1589-1590 optionally include further comprising a heat conducting mechanism configured to conduct heat from the IC die onto a surface external to the die.

In Example 1592, the subject matter of any one or more of Examples 1589-1591 optionally include wherein the heat conducting mechanism is a heat spreader coupled to the IC die.

Example 1593 is an apparatus of a mobile device, the apparatus comprising: a substrate; an integrated circuit (IC) that comprises a transceiver configured to generate radio frequency (RF) signals, the IC being connected to the substrate; a dipole antenna that has two horizontal arms and is configured within the substrate; and a surface mounted device (SMD) that comprises a vertical metallic via, wherein the SMD is mounted on the substrate adjacent the dipole antenna, wherein the vertical metallic via contacts one of the two horizontal arms of the dipole antenna, wherein the vertical metallic via comprises a vertical arm of a monopole antenna, and wherein when fed with the RF signals, the dipole antenna is configured to exhibit a first polarization and when fed with the RF signals the vertical arm of the monopole antenna is configured to exhibit a second polarization.

In Example 1594, the subject matter of Example 1593 optionally includes wherein the vertical metallic via comprises a metal trace.

In Example 1595, the subject matter of any one or more of Examples 1593-1594 optionally include wherein the vertical metallic via extends to the top of the SMD and the monopole antenna further comprises a horizontal metal trace configured on the top of the SMD, wherein the horizontal metal trace contacts, and is perpendicular to, the vertical metallic via and comprises part of the vertical arm of the monopole antenna.

Example 1596 is an L-shaped dipole antenna comprising: a substrate that comprises a horizontal arm of a dipole antenna; an integrated circuit (IC) shield that covers an IC die and is connected to the substrate; and a surface mounted device (SMD) that is mounted on the substrate adjacent the IC shield, wherein the SMD comprises a vertical arm of the dipole antenna, wherein the vertical arm is at least partly internal to the SMD, wherein the IC shield functions as a reflector for the dipole antenna, wherein the dipole antenna is fed by a feed line from the IC die, and wherein the configuration of the horizontal arm of the dipole antenna and the vertical arm of the dipole antenna comprises an L-shape.

In Example 1597, the subject matter of Example 1596 optionally includes wherein at least part of the vertical arm is internal to the substrate.

In Example 1598, the subject matter of Example 1597 optionally includes wherein the at least part of the vertical arm that is internal to the substrate comprises a metallized via.

In Example 1599, the subject matter of Example 1598 optionally includes wherein the metalized via comprises a metal trace.

In Example 1600, the subject matter of any one or more of Examples 1596-1599 optionally include wherein the at least part of the vertical arm that is internal to the SMD extends through the SMD, wherein a horizontal metal trace is configured on the top of the SMD, and wherein the horizontal metal trace contacts, and is perpendicular to, the vertical arm and is a part of the vertical arm.

Example 1601 is an apparatus of a mobile device, the apparatus comprising: a substrate; an integrated circuit (IC) shield that covers an IC that is configured to generate radio frequency (RF) chains, both the shield and the IC being connected to the substrate; and an antenna array comprising a plurality of L-shaped dipole antennas, each dipole antenna situated adjacent the IC shield, wherein each dipole antenna is configured to be fed by an RF chain from the IC, wherein each dipole antenna comprises a horizontal arm and a vertical arm, and wherein the dipole antennas of the plurality are arranged in adjacent pairs with the horizontal arms of each adjacent pair oriented in opposite directions.

In Example 1602, the subject matter of Example 1601 optionally includes wherein when each dipole antenna is fed by an RF chain from the IC, the array provides a plurality of RF chains, each provided RF chain having both a first polarization and a second polarization that is orthogonal to the first polarization.

Example 1603 is an apparatus for a mobile device, the apparatus comprising: a printed circuit board (PCB) that comprises a top layer and a bottom layer; an integrated circuit (IC) chip that comprises a top level and a bottom level, wherein the IC chip comprises a transceiver and the IC chip is connected to the top layer of the PCB; an antenna array that comprises a plurality of antenna elements configured within the bottom level of the IC chip adjacent the PCB and fed by feed transmission lines coupled to the transceiver; and an IC shield that covers the IC to shield the IC from interference, and is connected to the PCB, wherein one of the IC shield or a ground layer within the PCB comprises a ground for the antenna array.

In Example 1604, the subject matter of Example 1603 optionally includes further comprising a clearance volume between the PCB and the antenna array to prevent at least one antenna element from contacting the PCB.

In Example 1605, the subject matter of any one or more of Examples 1603-1604 optionally include wherein the transmission feed lines comprise metal traces.

In Example 1606, the subject matter of any one or more of Examples 1603-1605 optionally include wherein the PCB comprises a mother board.

Example 1607 is apparatus of a mobile device, the apparatus comprising: a transceiver configured on an integrated circuit (IC) that is connected to a printed circuit board (PCB), the transceiver configured to generate radio frequency (RF) signals in a first frequency band and in a second frequency band; a first antenna configured within the PCB, and a second antenna configured within the PCB in coaxial relationship to the first antenna; a first feed mechanism coupled to the transceiver and to the first antenna, wherein the first feed mechanism feeds the first antenna with RF signals in the first frequency band; a second feed mechanism situated orthogonal to the first feed mechanism, the second feed mechanism coupled to the transceiver and to the second antenna, wherein the second feed mechanism feeds the second antenna with RF signals in the second frequency band, wherein the processing circuitry is configured to operate each feed mechanism at different times to activate each of the first antenna and the second antenna at different times, and wherein when activated at a first time the first antenna transmits RF signals in the first frequency band in a first polarization, and when activated at a second time the second antenna transmits the RF signals in the second frequency band in a second polarization that is orthogonal to the first polarization.

In Example 1608, the subject matter of Example 1607 optionally includes wherein the first antenna is a patch antenna that is configured as a driven antenna element and a parasitic antenna element, and the second antenna is a slot antenna.

In Example 1609, the subject matter of Example 1608 optionally includes wherein the slot antenna is configured as a rectilinear slot antenna.

In Example 1610, the subject matter of any one or more of Examples 1607-1609 optionally include wherein the first feed mechanism is configured within the PCB and comprises a first set of two orthogonal feed lines coupled to the transceiver and to the driven element of the first antenna.

In Example 1611, the subject matter of any one or more of Examples 1607-1610 optionally include wherein second feed mechanism is configured within the PCB and comprises a second set of two orthogonal feed lines coupled to the transceiver and to the second antenna wherein the second antenna is fed from the two orthogonal feed lines by proximity coupling.

In Example 1612, the subject matter of any one or more of Examples 1607-1611 optionally include wherein the second antenna comprises a ground for the first antenna.

Example 1613 is apparatus of a mobile device, the apparatus comprising: a substrate; an integrated circuit (IC) connected to the substrate; a transceiver configured within the IC to generate radio frequency (RF) signals; a conductive shield connected to the substrate, covering the IC, and configured to protect the IC from interference; an antenna director configured on or within a chassis external to the substrate; an antenna configured on or within a surface mounted device (SMD); and dual orthogonal feed mechanisms coupled to the transceiver and to the antenna wherein the antenna is configured to transmit the RF signals in two orthogonal polarizations to interact with the antenna director, and wherein the antenna director is configured to direct the RF signals.

In Example 1614, the subject matter of Example 1613 optionally includes wherein the conductive shield is configured to serve as a ground plane for the antenna.

In Example 1615, the subject matter of any one or more of Examples 1613-1614 optionally include wherein the antenna comprises a dual element patch antenna wherein a first of the dual elements is a driven capacitive patch antenna element and a second of the dual elements is a parasitic patch antenna element.

In Example 1616, the subject matter of Example 1615 optionally includes further comprising a ground plane for the antenna, the ground plane configured within the substrate.

In Example 1617, the subject matter of any one or more of Examples 1613-1616 optionally include further comprising a cross-hatched patterned capacitive patch antenna and a cross-hatched patterned ground plane for the cross-hatched patterned capacitive patch antenna, the cross-hatched patterned capacitive patch antenna and the cross-hatched patterned ground plane being configured on or within the SMD.

Example 1618 is apparatus of a mobile device, the apparatus comprising: a substrate; an integrated circuit (IC) connected to the substrate; a transceiver configured within the IC to generate radio frequency (RF) signals; a conductive shield connected to the substrate, covering the IC, and configured to protect the IC from interference; an antenna director configured on or within a chassis external to the substrate; an antenna configured on or within a surface mounted device (SMD); and a single feed mechanism coupled to the transceiver and to the antenna wherein the antenna is configured to transmit the RF signals in a single polarization to interact with the antenna director, and wherein the antenna director is configured to direct the RF signals.

In Example 1619, the subject matter of Example 1618 optionally includes wherein the antenna comprises a spiral antenna configured within the SMD, the spiral antenna comprising connected traces and vias on or within the SMD, and wherein the shield is configured as a reflector and as a ground plane for the spiral antenna.

In Example 1620, the subject matter of any one or more of Examples 1618-1619 optionally include wherein the antenna comprises a patch antenna configured on or within the SMD, and the shield is configured as a reflector and as a ground plane for the patch antenna.

Example 1621 is apparatus of a mobile device, the apparatus comprising: a substrate; an integrated circuit (IC) connected to the substrate; a transceiver configured within the IC to generate radio frequency (RF) signals; a conductive shield connected to the substrate, covering the IC, and configured to protect the IC from interference; a plurality of antenna directors configured on or within a chassis external to the substrate; a plurality of antenna elements that comprise an antenna array configured on or within a respective surface mounted device (SMD), or configured on or within the substrate; and a feed mechanism coupled to the transceiver and to each of the plurality of antenna elements of the antenna array, wherein each of the plurality of antenna elements of the antenna array is configured to transmit the RF signals to interact with the plurality of antenna directors, and wherein the plurality of antenna directors is configured to direct the RF signals.

In Example 1622, the subject matter of Example 1621 optionally includes wherein the feed mechanism comprises a plurality of feed elements configured to feed the plurality of antenna elements with the RF signals in a single polarity wherein the antenna array transmits the RF signals in the single polarity.

In Example 1623, the subject matter of any one or more of Examples 1621-1622 optionally include wherein the feed mechanism comprises a plurality of dual orthogonal feed elements configured to feed the plurality of antenna elements with the RF signals in a first polarity and a second polarity that is orthogonal to the first polarity, wherein the antenna array transmits the RF signals in the first polarity and in the second polarity.

Example 1624 is apparatus of a mobile device, the apparatus comprising: a substrate comprising a first layer and a second layer; a radio front end module (RFEM) attached to the first layer of the substrate and comprising an integrated circuit (IC) that is configured to generate radio frequency (RF) signals; a conductive shield that covers the IC, is attached to the first layer of the substrate, and is configured to protect the IC from interference; a surface mounted device (SMD) coupled to the substrate adjacent the conductive shield; and at least one directional monopole antenna that includes a first arm that comprises a metalized via connected to the RFEM and extending into the SMD perpendicularly to the substrate, wherein the directional monopole antenna is fed by at least one feed mechanism that is part of the substrate and is coupled to the IC, wherein the directional monopole antenna is configured to transmit the RF signals in a first polarity in a direction outward from the RFEM, and wherein the conductive shield is a reflector for the directional monopole antenna.

In Example 1625, the subject matter of Example 1624 optionally includes wherein the via extends through the SMD to the top of the SMD.

In Example 1626, the subject matter of Example 1625 optionally includes wherein the first arm further comprises a metal trace configured on the top layer of the SMD, perpendicular to and connected to the via that extends through the SMD to the top of the SMD.

Example 1627 is apparatus of a mobile device, the apparatus comprising: a substrate comprising a first layer and a second layer; an integrated circuit (IC) attached to the first layer of the substrate and configured to generate radio frequency (RF) signals; a conductive shield that covers the IC, is attached to the first layer of the substrate, and is configured to protect the IC from interference; a plurality of antenna arrays each comprising a plurality of directional monopole antenna elements adjacent the conductive shield that is a reflector for the directional monopole antennas; and a plurality of second arrays each comprising a plurality of directional dipole antenna elements parallel to the second layer that is a ground plane for the plurality of directional dipole antennas, wherein the plurality of monopole antenna elements and the plurality of dipole antenna elements are respectively located adjacent each other, and wherein each of the plurality of monopole antennas is configured to transmit the RF signals in a first polarization and each of the plurality of dipole antennas is configured to transmit the RF signals in a second polarization that is orthogonal to the first polarization.

In Example 1628, the subject matter of Example 1627 optionally includes wherein each of the plurality of monopole antenna elements includes a first arm that comprises a metalized via that extends into a respective surface mounted device (SMD) perpendicular to the substrate, wherein each of the plurality of monopole antennas is fed by a feed mechanism that is configured as part of the substrate and is coupled to the IC to feed RF signals to the plurality of monopole antennas, and wherein the directional dipole antennas are fed by a feed mechanism that is configured as part of the substrate and is coupled to the IC to feed RF signals to the plurality of dipole antennas.

In Example 1629, the subject matter of Example 1628 optionally includes wherein the vertical arm of at least one of the plurality of monopole antennas extends to the top of the respective SMD of the at least one of the plurality of monopole antennas, and the vertical arm of the at least one of the plurality of monopole antennas further comprises a metal trace configured on the top of the respective SMD, perpendicular to and connected to the metalized via.

Example 1630 is apparatus for a mobile device, the apparatus comprising: a substrate; an integrated circuit (IC) connected to the substrate, the IC comprising a transceiver that includes a transmitter (TX) configured to generate first radio frequency (RF) signals and a receiver (RX) configured to process received second RF signals, wherein the TX and RX operate at different times, wherein the TX comprises a power amplifier (PA) that is coupled to a first feed mechanism and the RX comprises a low noise amplifier (LNA) that is coupled to a second feed mechanism; and a dual feed antenna configured on the substrate, wherein the dual feed antenna includes a TX feedline matching point and an RX feedline matching point, wherein the first feed mechanism is directly connected to the TX feedline matching point of the dual feed antenna and the second feed mechanism is directly connected to the RX feedline matching point of the dual feed antenna, wherein the first RF signals are transmitted by the dual feed antenna and the second RF signals are received by the dual feed antenna.

In Example 1631, the subject matter of Example 1630 optionally includes wherein the dual feed antenna is a patch antenna, the first feed mechanism is a first single polarization feed line configured to transmit the first RF signals in a single polarization, and the second feed mechanism is a second single polarization feed line configured to receive the second RF signals in a single polarization.

In Example 1632, the subject matter of any one or more of Examples 1630-1631 optionally include wherein the dual feed antenna is a patch antenna, the first feed mechanism comprises a first dual orthogonal feed mechanism configured to transmit the first RF signals in dual orthogonal polarizations, and the second feed mechanism comprises a second dual orthogonal feed mechanism configured to receive the second RF signals in dual orthogonal polarizations.

Example 1633 is apparatus of a mobile device, the apparatus comprising: a substrate; a plurality of antenna arrays configured on the substrate; an integrated circuit (IC) shield comprising a first section affixed to the substrate and a cover connected to the first section; and an IC connected to the substrate and situated within the first section, wherein an area of the cover is configured to be a reflector of the antenna array to improve the gain of the antenna, wherein a part of the first section extends through a space in the cover to extend the cover area that is configured to be a reflector of the antenna array, and wherein the extended area is configured to be a reflector for at least one of the plurality of antenna arrays.

In Example 1634, the subject matter of Example 1633 optionally includes wherein the plurality of antenna arrays comprises a plurality of patch antenna elements and a plurality of dipole antenna elements.

Example 1635 is apparatus of a mobile device, the apparatus comprising: a substrate; a radio front end module (RFEM) connected to the substrate and comprising an integrated circuit (IC) configured to generate radio frequency (RF) signals; an antenna array fed by a feeding mechanism coupled to the IC wherein the antenna array is configured to transmit the RF signals; a conductive IC shield that covers the IC; an obstruction adjacent the antenna array that interferes with antenna array transmission; and an interposer coupled to the substrate, wherein the antenna array and the conductive IC shield are mounted on the interposer and wherein the interposer provides height to improve antenna array transmission.

In Example 1636, the subject matter of Example 1635 optionally includes wherein the conductive shield is configured as a reflector for the antenna array.

In Example 1637, the subject matter of any one or more of Examples 1635-1636 optionally include wherein the antenna array comprises a plurality of patch antennas.

In Example 1638, the subject matter of Example 1635 optionally includes wherein the antenna array comprises a plurality of patch antennas.

Example 1639 can include, or can optionally be combined with any portion or combination of any portions of any one or more of Examples 1569 through 1639 to include, subject matter that can include means for performing any one or more of the functions of Examples 1569 through 1639, or a machine-readable medium including instructions that, when performed by a machine, cause the machine to perform any one or more of the functions of Examples 1569 through 1639.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

The above description is intended to be illustrative, and not restrictive. For example, the above-described examples (or one or more aspects thereof) may be used in combination with others. Other aspects may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as aspects may feature a subset of said features. Further, aspects may include fewer features than those disclosed in a particular example. Thus, the following claims are hereby incorporated into the Detailed Description, with a claim standing on its own as a separate aspect. The scope of the aspects disclosed herein is to be determined with reference to the appended claims, along with the full scope of equivalents to which such claims are entitled.

The invention claimed is:

1. A transceiver comprising:

a plurality of patch antennas, the plurality of patch antennas disposed on a first surface of a substrate;

a radio frequency integrated circuit (RFIC) coupled to the plurality of patch antennas, the RFIC disposed on a second surface of the substrate and configured to process RF signals received via the plurality of patch antennas; and a shield, the shield disposed on the second surface and insulating the RFIC from radio frequency interference (RFI) and electromagnetic interference (EMI).

2. The transceiver of claim 1, further comprising:

a plurality of redistribution layers within the substrate, the plurality of redistribution layers coupling the RFIC to the plurality of patch antennas.

3. The transceiver of claim 2, further comprising:

a plurality of solder balls, the plurality of solder balls disposed between the plurality of redistribution layers and the plurality of patch antennas.

4. The transceiver of claim 1, further comprising:

a plurality of surface-mount devices (SMDs), the plurality of SMDs disposed on the second surface of the substrate.

5. The transceiver of claim 4, wherein the RFIC is configured to process the RF signals based on one or more of the plurality of SMDs.

6. The transceiver of claim 4, further comprising:

mold compound, the mold compound disposed within a cavity formed between the shield and the substrate.

7. The transceiver of claim 1, wherein each patch antenna of the plurality of patch antennas is configured as a dual-polarized antenna structure with ±45° tilted excitation.

8. The transceiver of claim 1, wherein each patch antenna of the plurality of patch antennas is configured as parasitically stacked dual patches.

9. The transceiver of claim 8, wherein the parasitically stacked dual patches comprise:

a driven element coupled to a feedline; and a parasitic element.

10. The transceiver of claim 1, further comprising:

a horizontal surface-mount device (SMD) element.

11. The transceiver of claim 10, wherein the horizontal SMD element comprises at least one patch antenna of the plurality of patch antennas.

12. The transceiver of claim 11, wherein the at least one patch antenna comprises:

a parasitic patch element; and a driven capacitive patch antenna element coupled to dual feed lines.

13. The transceiver of claim 1, further comprising:

baseband circuitry, the baseband circuitry configured to generate baseband signals based on digital output signals, wherein the RFIC is configured to generate output signals for transmission via the plurality of patch antennas, the output signals based on the baseband signals.

14. The transceiver of claim 13, further comprising:

a touchscreen display; and a signal processor, the signal processor coupled to the touchscreen display via an interconnect, the signal processor configured to:

detect signal input received from the touchscreen display via the interconnect; and generate the digital output signals based on the signal input.

15. A method for processing radio frequency (RF) signals, the method comprising:

receiving RF signals via a plurality of patch antennas disposed on a first surface of a substrate;

downconverting the RF signals to baseband signals using a radio frequency integrated circuit (RFIC), the RFIC disposed on a second surface of the substrate, and the RFIC coupled to the plurality of patch antennas via a plurality of redistribution layers within the substrate; and during the downconverting, insulating the RFIC from radio frequency interference (RFI) and electromagnetic interference (EMI) using a shield, the shield being separate from the plurality of patch antennas and the shield being disposed on the second surface of the substrate.

16. The method of claim 15, further comprising:

disposing a plurality of solder balls between the plurality of redistribution layers and the plurality of patch antennas; and coupling the RFIC to the plurality of patch antennas via the plurality of redistribution layers and the plurality of solder balls.

17. The method of claim 15, further comprising:

processing the RF signals based on one or more of a plurality of surface-mount devices (SMDs), the plurality of SMDs disposed on the substrate.

18. The method of claim 15, further comprising:

generating using baseband circuitry, baseband signals based on digital output signals; and generating output signals based on the baseband signals; and causing transmission of the output signals via the plurality of patch antennas.

19. The method of claim 18, further comprising:

detecting signal input received from a touchscreen display via an interconnect; and generating the digital output signals based on the signal input.

20. A system for processing radio frequency (RF) signals, the system comprising:

means for receiving RF signals, the means for receiving comprising a plurality of patch antennas disposed on a first surface of a substrate;

means for downconverting the RF signals to baseband signals, the means for downconverting comprising a radio frequency integrated circuit (RFIC) disposed on a second surface of the substrate, the RFIC coupled to the plurality of patch antennas via a plurality of redistribution layers within the substrate; and means for insulating the RFIC from radio frequency interference (RFI) and electromagnetic interference (EMI) during the receiving, the means for insulating being separate from the plurality of patch antennas and the means for insulating being disposed on the second surface of the substrate.

21. The system of claim 20, further comprising:

means for processing the RF signals based on one or more of a plurality of surface-mount devices (SMDs), the plurality of SMDs disposed on the substrate.

22. The system of claim 20, further comprising:

means for generating baseband signals based on digital output signals; and means for generating output signals based on the baseband signals; and means for transmitting the output signals via the plurality of patch antennas.

23. The system of claim 22, further comprising:
means for detecting signal input; and
means for generating the digital output signals based on the signal input.

* * * * *